US012297214B2

(12) United States Patent
Sotoyama et al.

(10) Patent No.: US 12,297,214 B2
(45) Date of Patent: May 13, 2025

(54) CONDENSED CYCLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Wataru Sotoyama, Kanagawa (JP); Soonok Jeon, Suwon-si (KR); Rie Sakurai, Kanagawa (JP); Katsunori Shibata, Kanagawa (JP); Atsushi Imamura, Kanagawa (JP); Juhyun Kim, Seoul (KR); Mitsunori Ito, Kanagawa (JP); Eigo Miyazaki, Kanagawa (JP); Joonghyuk Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 655 days.

(21) Appl. No.: 17/400,727

(22) Filed: Aug. 12, 2021

(65) Prior Publication Data

US 2023/0075211 A1 Mar. 9, 2023

(30) Foreign Application Priority Data

Aug. 13, 2020 (JP) ................................ 2020-136804
Mar. 29, 2021 (JP) ................................ 2021-055622
Jul. 7, 2021 (KR) ........................ 10-2021-0089141

(51) Int. Cl.

| | |
|---|---|
| ***C07F 5/02*** | (2006.01) |
| ***H10K 85/60*** | (2023.01) |
| *H10K 50/12* | (2023.01) |
| *H10K 101/30* | (2023.01) |

(52) U.S. Cl.

CPC .......... *C07F 5/027* (2013.01); *H10K 85/636* (2023.02); *H10K 85/6572* (2023.02); *H10K 50/121* (2023.02); *H10K 2101/30* (2023.02)

(58) Field of Classification Search

None

See application file for complete search history.

(56) References Cited

U.S. PATENT DOCUMENTS

| | | | | |
|---|---|---|---|---|
| 10,374,166 | B2 | 8/2019 | Hatakeyama et al. | |
| 2016/0315259 | A1 | 10/2016 | Fennimore et al. | |
| 2020/0052212 | A1 | 2/2020 | Tasaki et al. | |
| 2023/0069900 | A1 | 3/2023 | Maruyama et al. | |
| 2023/0097695 | A1 | 3/2023 | Jeon et al. | |
| 2023/0110346 | A1* | 4/2023 | Shin | H10K 85/657 568/6 |
| 2023/0124902 | A1* | 4/2023 | Fleetham | C07F 5/027 257/256 |
| 2023/0189646 | A1* | 6/2023 | Shin | C07F 5/062 257/40 |
| 2023/0287010 | A1* | 9/2023 | Yang | H10K 85/322 |
| 2023/0413669 | A1* | 12/2023 | Moon | H10K 85/658 |
| 2024/0018164 | A1* | 1/2024 | Shin | H10K 30/00 |

FOREIGN PATENT DOCUMENTS

| | | | |
|---|---|---|---|
| CN | 107501311 | A | 12/2017 |
| CN | 110790782 | A | 2/2020 |
| WO | 2011159872 | A1 | 12/2011 |
| WO | 2015102118 | A1 | 7/2015 |

(Continued)

OTHER PUBLICATIONS

David Hall, et al., Improving Processability and Efficiency of Resonant TADFEmitters: A Design Strategy, Advanced Optical Materials, vol. 8, Issue 2,Jan. 17, 2020, 1901627, 10 pp.

English Abstract of CN 107501311.

English Abstract of CN 110790782.

In Seob Park, et al., High-Performance Dibenzoheteraborin-Based ThermallyActivated Delayed Fluorescence Emitters: MolecularArchitectonics for Concurrently Achieving NarrowbandEmission and Efficient Triplet-Singlet Spin Conversion, Advanced Functional Materials 2018, 28, 1802031, 12 pp.

(Continued)

*Primary Examiner* — Robert S Loewe

(74) *Attorney, Agent, or Firm* — CANTOR COLBURN LLP

(57) ABSTRACT

Provided are a condensed cyclic compound represented by Formula 1-1 or 1-2, an organic light-emitting device including the condensed cyclic compound, and an electronic apparatus including the organic light-emitting device:

Formula 1-1

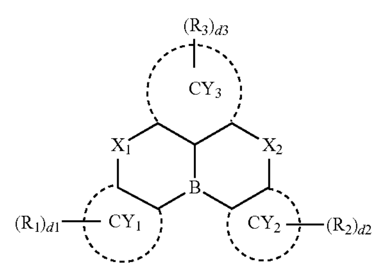

Formula 1-2

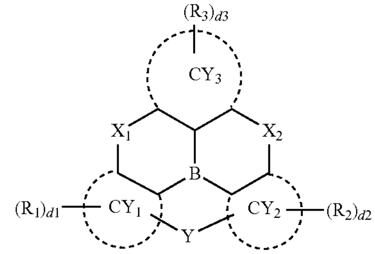

wherein Formulae 1-1 and 1-2 are the same as described in the present specification.

22 Claims, 5 Drawing Sheets

(56) References Cited

FOREIGN PATENT DOCUMENTS

| | | | |
|---|---|---|---|
| WO | 2017142310 | A1 | 8/2017 |
| WO | 2018186404 | A1 | 10/2018 |

OTHER PUBLICATIONS

Soo-Ghang Ihn, et al., An Alternative Host Material for Long-Lifespan BlueOrganic Light-Emitting Diodes Using Thermally ActivatedDelayed Fluorescence, Advanced Science News 2017, 4, 1600502, 7 pp.

Takuji Hatakeyama, et al., Ultrapure Blue Thermally Activated Delayed FluorescenceMolecules: Efficient HOMO-LUMO Separation by theMultiple Resonance Effect, Advanced Materials 2016, 28, 2777-2781.

Xing Li, et al., Thermally Activated Delayed Fluorescence Carbonyl Derivatives forOrganic Light-Emitting Diodes with Extremely Narrow Full Width atHalf-Maximum, ACS Applied Materials and Interfaces 2019, 11, 13472-13480.

Yi Yuan, et al., The Design of Fused Amine/Carbonyl System for EfficientThermally Activated Delayed Fluorescence: Novel MultipleResonance Core and Electron Acceptor, Advanced Optical Materials 2019, 7, 1801536, 6 pp.

* cited by examiner

CONDENSED CYCLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATIONS

This application claims priority to Japanese Patent Application Nos. 2020-136804, filed on Aug. 13, 2020 and No. 2021-055622, filed on Mar. 29, 2021, in the Japanese Patent Office and Korean Patent Application No. 10-2021-0089141, filed on Jul. 7, 2021, in the Korean Intellectual Property Office, the contents of which are incorporated herein in their entireties by reference.

BACKGROUND

1. Field

The present disclosure relates to condensed cyclic compounds, organic light-emitting devices including the condensed cyclic compounds, and electronic apparatuses including the organic light-emitting devices.

2. Description of Related Art

Organic light-emitting devices are self-emission devices that have wide viewing angles, high contrast ratios, and short response times, exhibit excellent characteristics in terms of luminance, driving voltage, and response speed, and produce full-color images.

In an example, an organic light-emitting device includes an anode, a cathode, and an organic layer that is arranged between the anode and the cathode and includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transition from an excited state to a ground state to thereby generate light.

SUMMARY

Provided are condensed cyclic compounds, organic light-emitting devices including the condensed cyclic compounds, and electronic apparatuses including the organic light-emitting devices.

Additional aspects will be set forth in part in the description, which follows and, in part, will be apparent from the description, or may be learned by practice of the presented embodiments of the disclosure.

According to an aspect of an embodiment, provided is a condensed cyclic compound represented by Formula 1-1 or 1-2:

Formula 1-1

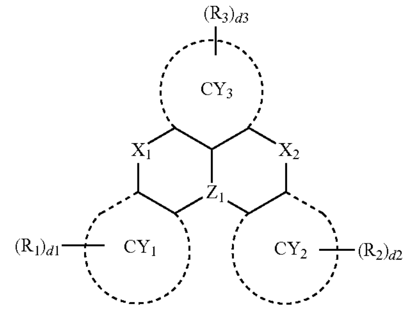

Formula 1-2

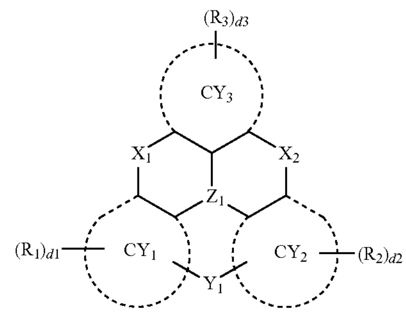

Formula 2-1

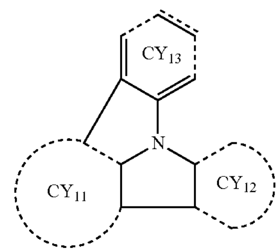

Formula 2-2

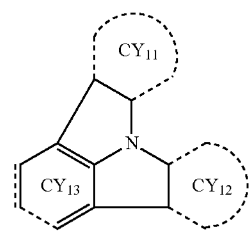

Formula 3

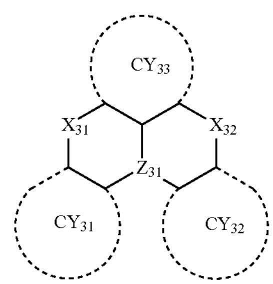

wherein, in Formulae 1-1 and 1-2, $CY_1$ to $CY_3$ are each independently a $C_5$-$C_{60}$ carbocyclic group or a $C_1$-$C_{60}$ heterocyclic group, at least one of $CY_1$ and $CY_2$ is a group represented by Formula 2-1 or 2-2, $X_1$ is O, S, Se, Te, $N(R_{1a})$, or $C(R_{1a})(R_{1b})$, $X_2$ is O, S, Se, Te, $N(R_{2a})$, or $C(R_{2a})(R_{2b})$, $Y_1$ is O, S, Se, Te, $N(R_{3a})$, or $C(R_{3a})(R_{3b})$, $Z_1$ is B, Al, $Si(R_{4a})$, $Ge(R_{4a})$, P, P(=O), or P(=S), $R_1$ to $R_3$, $R_{1a}$ to $R_{4a}$, and $R_{1b}$ to $R_{3b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), $R_1$ to $R_3$, $R_{1a}$ to $R_{4a}$, and $R_{1b}$ to $R_{3b}$ are optionally linked to each other or via a single bond to form a $C_8$-$C_{60}$ polycyclic group that is unsubstituted or substituted with at least one $R_{10a}$, d1 to d3 are each independently an integer from 0 to 20, in Formulae 2-1 and 2-2, $CY_{11}$ and $CY_{12}$ are each independently a $C_5$-$C_{60}$ carbocyclic group, a $C_1$-$C_{60}$ heterocyclic group, or a group represented by Formula 3, $CY_{13}$ is condensed with $CY_1$, $CY_2$, or each of $CY_1$ and $CY_2$, one of the bonds marked with a dotted line in $CY_{13}$ indicates a binding site to a bond marked with a solid line in $CY_1$ or $CY_2$, in Formula 3, $CY_{31}$ to $CY_{33}$ are each independently a $C_5$-$C_{60}$ carbocyclic group or a $C_1$-$C_{60}$ heterocyclic group, $X_{31}$ is O, S, Se, Te, N($R_{5a}$), or C($R_{5a}$)($R_{5b}$), $X_{32}$ is O, S, Se, Te, N($R_{6a}$), or C($R_{6a}$)($R_{6b}$), $Z_{31}$ is B, Al, Si($R_{7a}$), Ge($R_{7a}$), P, P(═O), or P(═S), $R_{5a}$ to $R_{7a}$, $R_{5b}$, and $R_{6b}$ are each independently the same as described in connection with $R_{1a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$ ($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$ ($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium, —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to an aspect of another embodiment, provided is a light-emitting device including: a first electrode; a second electrode facing the first electrode; an interlayer arranged between the first electrode and the second electrode and including an emission layer; and at least one of the condensed cyclic compound.

According to an aspect of another embodiment, provided is an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
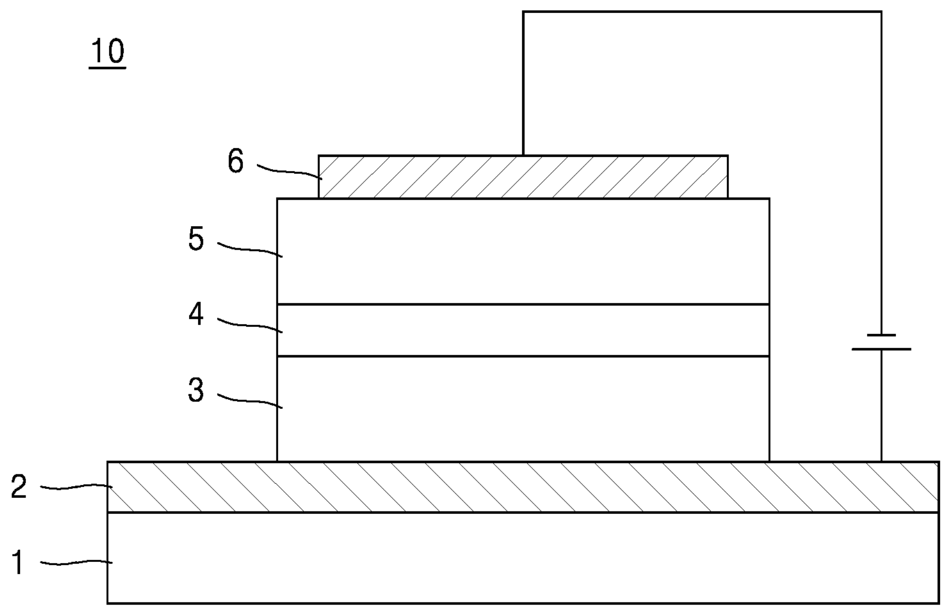
FIG. 1 is a schematic view of an organic light-emitting apparatus according to an exemplary embodiment of the present disclosure.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides a condensed cyclic compound represented by Formulae 1-1 or 1-2:

Formula 1-1

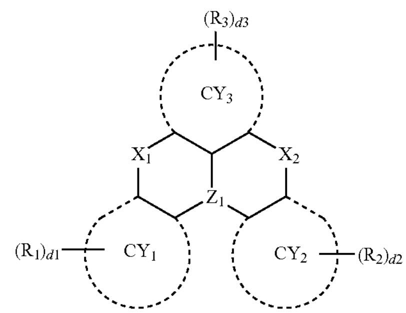

Formula 1-2

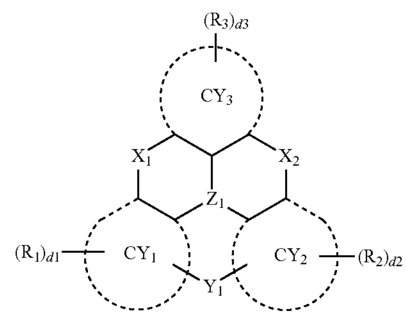

Formula 2-1

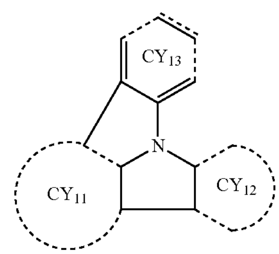

Formula 2-2

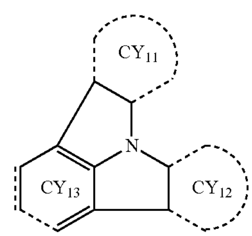

Formula 3

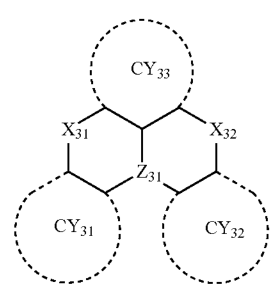

wherein, in Formulae 1-1 and 1-2, $CY_1$ to $CY_3$ may each independently be a $C_5$-$C_{60}$ carbocyclic group or a $C_1$-$C_{60}$ heterocyclic group.

In an embodiment, at least one of $CY_1$ and $CY_2$ may be a group represented by Formula 2-1 or 2-2.

In an embodiment, $CY_1$ to $CY_3$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, an indolocarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or a group represented by Formula 2-1 or 2-2.

In an embodiment, the condensed cyclic compound represented by Formula 1-1 or 1-2 may satisfy at least one of Conditions 1 to 3:

Condition 1

$CY_1$ is a group represented by Formula 2-1 or 2-2;

Condition 2

$CY_2$ is a group represented by Formula 2-1 or 2-2; and

Condition 3

$CY_1$ and $CY_2$ are each independently a group represented by Formula 2-1 or 2-2.

In an embodiment, any two groups among $CY_1$ to $CY_3$ may be identical to each other.

In an embodiment, $CY_3$ may be a benzene group, a naphthalene group, a dibenzosilole group, a carbazole group, a dibenzothiophene group, or a dibenzofuran group.

$X_1$ may be O, S, Se, Te, $N(R_{1a})$, or $C(R_{1a})(R_{1b})$.

$X_2$ may be O, S, Se, Te, $N(R_{2a})$, or $C(R_{2a})(R_{2b})$.

$Y_1$ may be O, S, Se, Te, $N(R_{3a})$, or $C(R_{3a})(R_{3b})$.

$Z_1$ may be B, Al, $Si(R_{4a})$, $Ge(R_{4a})$, P, P(=O), or P(=S).

In an embodiment, $X_1$ may be O, and $X_2$ may be O;

$X_1$ may be S, and $X_2$ may be S;

$X_1$ may be Se, and $X_2$ may be Se;

$X_1$ may be Te, and $X_2$ may be Te;

$X_1$ may be $N(R_{1a})$, and $X_2$ may be $N(R_{2a})$; or $X_1$ may be $C(R_{1a})(R_{1b})$, and $X_2$ may be $C(R_{2a})(R_{2b})$.

In an embodiment, $X_1$ and $X_2$ may be identical to each other.

$R_1$ to $R_3$, $R_{1a}$ to $R_{4a}$, and $R_{1b}$ to $R_{3b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

$R_1$ to $R_3$, $R_{1a}$ to $R_{4a}$, and $R_{1b}$ to $R_{3b}$ may optionally be linked to each other or via a single bond to form a $C_8$-$C_{60}$ polycyclic group that is unsubstituted or substituted with at least one $R_{10a}$.

d1 to d3 may each independently be an integer from 0 to 20.

In Formulae 2-1 and 2-2, $CY_{11}$ and $CY_{12}$ may each independently be a $C_5$-$C_{60}$ carbocyclic group, a $C_1$-$C_{60}$ heterocyclic group, or a group represented by Formula 3.

One of the bonds marked with a dotted line in $CY_{13}$ indicates a binding site to the bond marked with a solid line in $CY_1$ or $CY_2$.

In an embodiment, $CY_{11}$ and $CY_{12}$ may each independently be a benzene group or a group represented by Formula 3.

In Formula 3, $CY_{31}$ to $CY_{33}$ may each independently be a $C_5$-$C_{60}$ carbocyclic group or a $C_1$-$C_{60}$ heterocyclic group.

$X_{31}$ may be O, S, Se, Te, $N(R_{5a})$, or $C(R_{5a})(R_{5b})$.

$X_{32}$ may be O, S, Se, Te, $N(R_{6a})$, or $C(R_{6a})(R_{6b})$.

$Z_{31}$ may be B, Al, $Si(R_{7a})$, $Ge(R_{7a})$, P, P(=O), or P(=S).

$R_{5a}$ to $R_{7a}$, $R_{5b}$, and $R_{6b}$ may each independently be the same as described in connection with $R_{1a}$.

In an embodiment, a group represented by Formula 2-1 or 2-2 may be represented by one of Formulae 2-11 to 2-22:

2-11

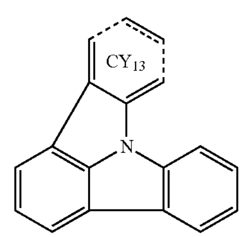

2-12

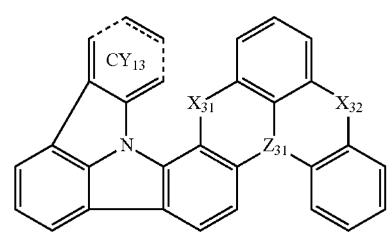

-continued 2-13

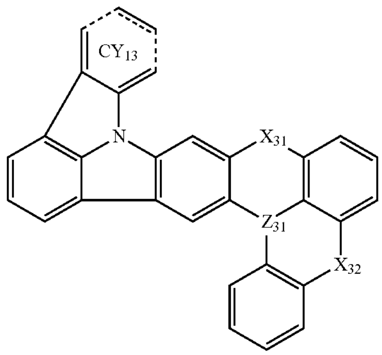

2-14

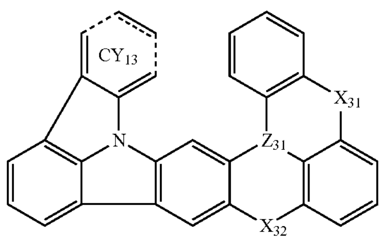

2-15

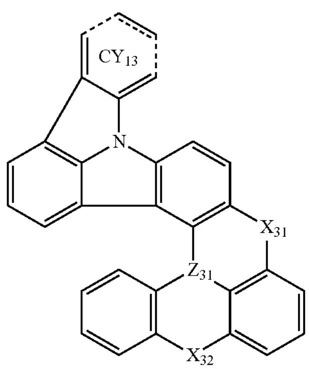

2-16

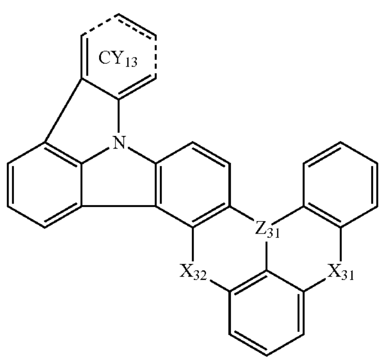

wherein, in Formulae 2-11 to 2-22, $X_{31}$, $X_{32}$, and $Z_{31}$ may each be the same as described herein, and one of the bonds marked with a dotted line in $CY_{13}$ indicates a binding site to the bond marked with a solid line in $CY_1$ or $CY_2$.

In an embodiment, a moiety represented by

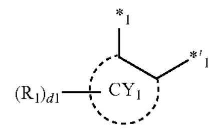

in Formula 1-1 may be represented by one of Formulae 3-1 to 3-8, and a moiety represented by

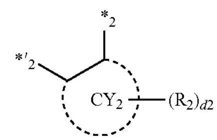

in Formula 1-1 may be represented by one of Formulae 4-1 to 4-8, provided that when the moiety represented by

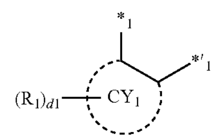

is represented by Formula 3-8 then the moiety represented by

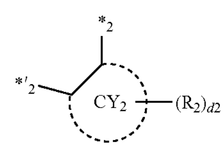

is not represented by Formula 4-8:

3-1

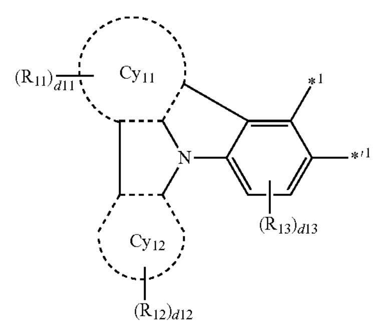

-continued
3-2
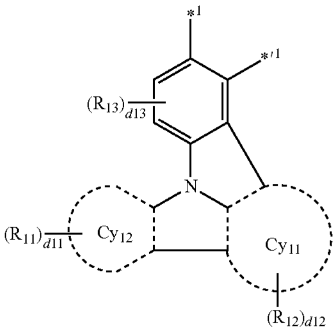
3-3
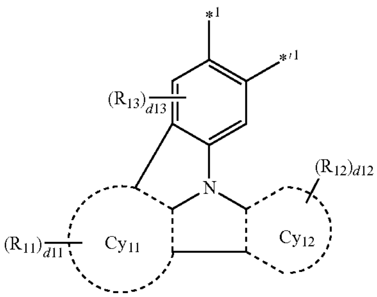
3-4
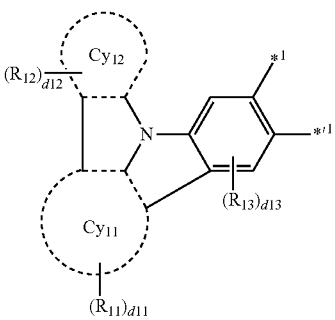
3-5
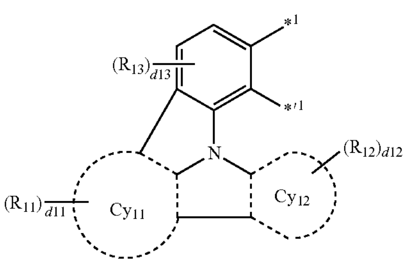
3-6
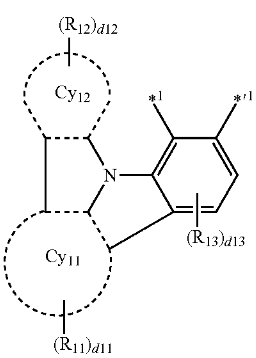
-continued
3-7
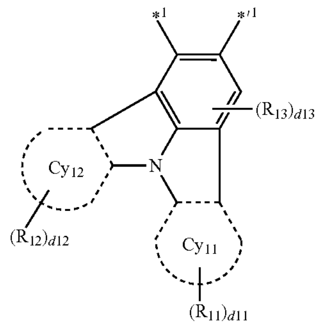
3-8
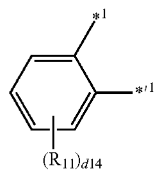
4-1
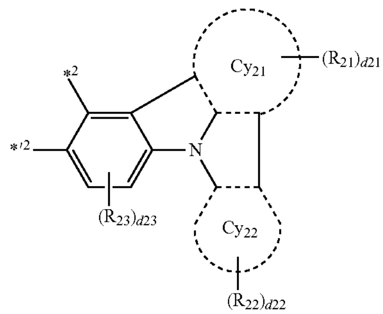
4-2
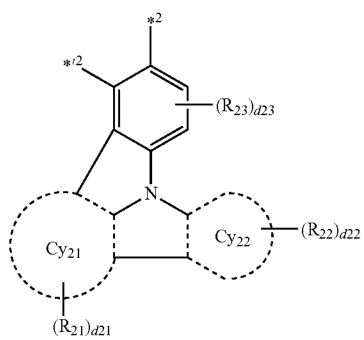
4-3
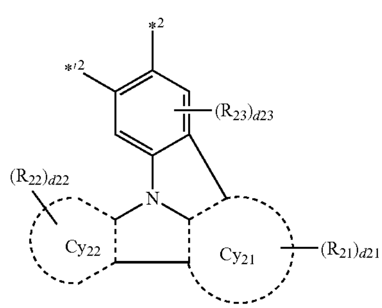

-continued 4-4

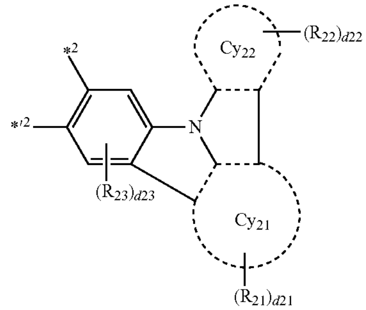

4-5

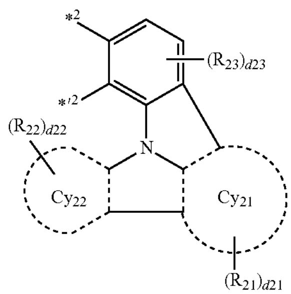

4-6

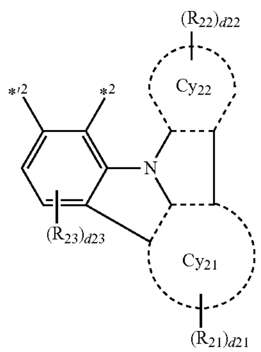

4-7

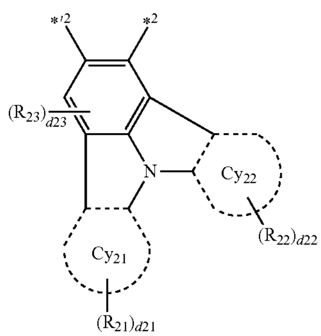

4-8

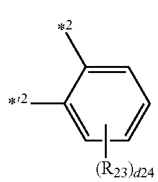

wherein, in Formulae 3-1 to 3-8 and 4-1 to 4-8, $CY_{11}$ and $CY_{12}$ may each be the same as described herein, $CY_{21}$ and $CY_{22}$ may each be the same as described in connection with $CY_{11}$, $R_{11}$ to $R_{13}$ may each be the same as described in connection with $R_1$, $R_{21}$ to $R_{23}$ may each be the same as described in connection with $R_2$, d11, d12, d21, and d22 may each independently be an integer from 0 to 10, d13 and d23 may each independently be an integer from 0 to 2, d14 and d24 are each independently an integer from 0 to 4, $*^1$ indicates a binding site to $X_1$ in Formula 1-1, $*'^1$ indicates a binding site to $Z_1$ in Formula 1-1, $*^2$ indicates a binding site to $X_2$ in Formula 1-1, and $*'^2$ indicates a binding site to $Z_1$ in Formula 1-1.

In an embodiment, a moiety represented by

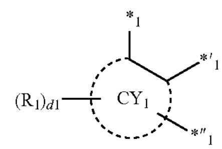

in Formula 1-2 may be represented by one of Formulae 3-11 to 3-16, and a moiety represented by

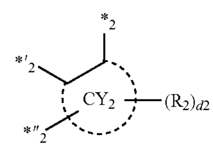

in Formula 1-2 may be represented by one of Formulae 4-11 to 4-16, provided that when the moiety represented by

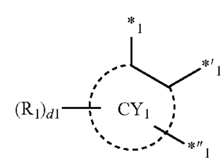

is represented by Formula 3-16, then the moiety represented by

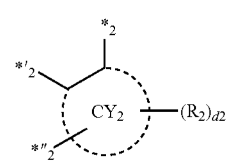

is not represented by Formula 4-16:
3-11
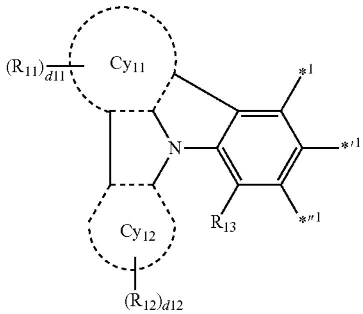
3-12
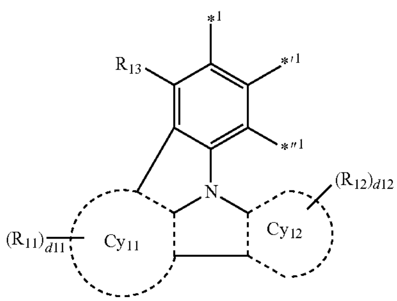
3-13
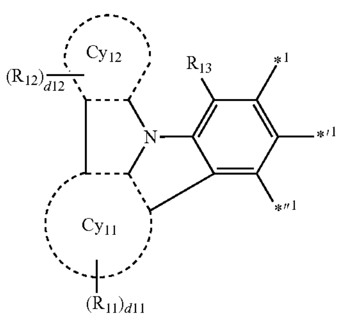
3-14
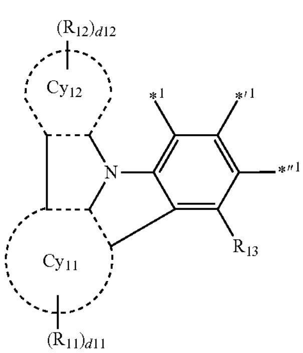
-continued
3-15
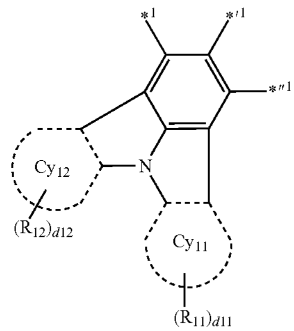
3-16
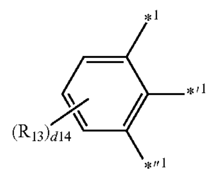
4-11
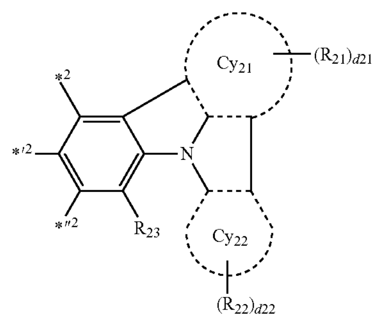
4-12
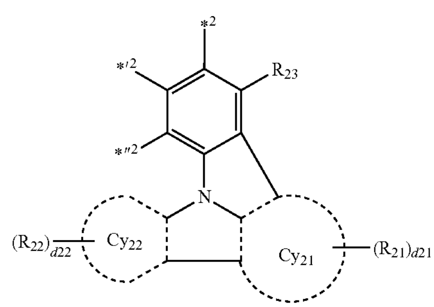
4-13
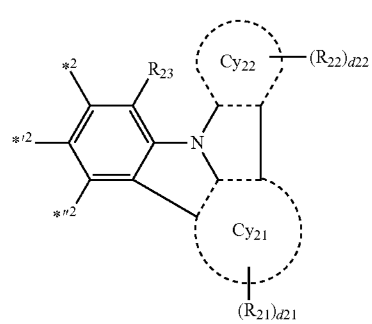

-continued 4-14

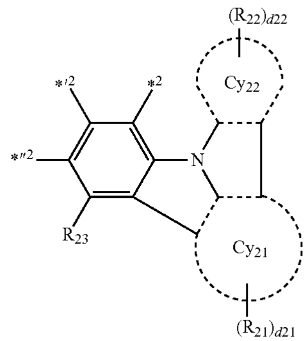

4-15

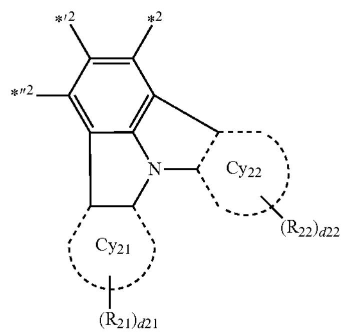

4-16

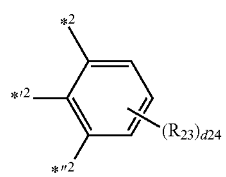

wherein, in Formulae 3-11 to 3-16 and 4-11 to 4-16, $CY_{11}$ and $CY_{12}$ may each be the same as described herein, $CY_{21}$ and $CY_{22}$ may each be the same as described in connection with $CY_{11}$, $R_{11}$ to $R_{13}$ may each be the same as described in connection with $R_1$, $R_{21}$ to $R_{23}$ may each be the same as described in connection with $R_2$, d11, d12, d21, and d22 may each independently be an integer from 0 to 10, d14 and d24 are each independently an integer from 0 to 3, $*^1$ indicates a binding site to $X_1$ in Formula 1-2, $*'^1$ indicates a binding site to $Z_1$ in Formula 1-2, $*''^1$ indicates a binding site to $Y_1$ in Formula 1-2, $*^2$ indicates a binding site to $X_2$ in Formula 1-2, $*'^2$ indicates a binding site to $Z_1$ in Formula 1-2, and $*''^2$ indicates a binding site to $Y_1$ in Formula 1-2.

In an embodiment, the condensed cyclic compound represented by Formula 1-1 or 1-2 may be represented by one of Formulae 5-1 to 5-12 and 6-1 to 6-12:

5-1

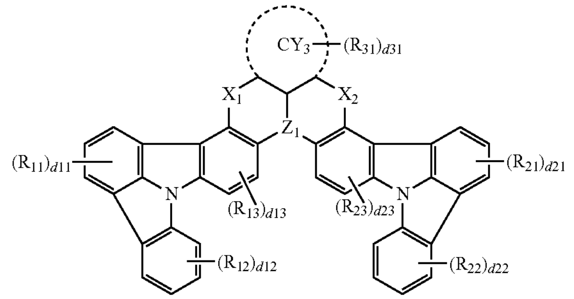

5-2

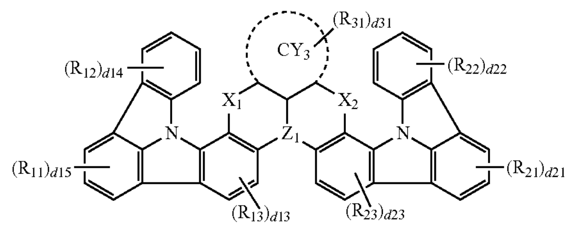

5-3

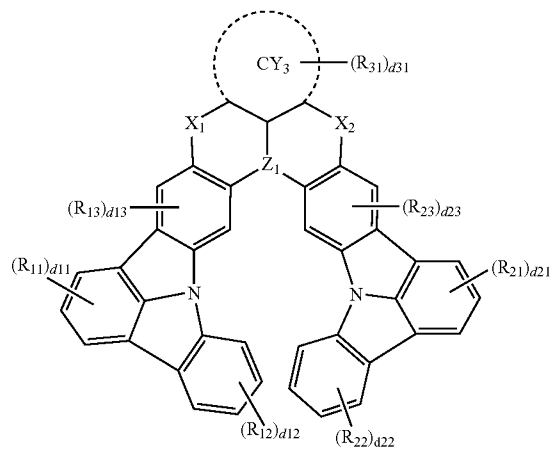

5-4

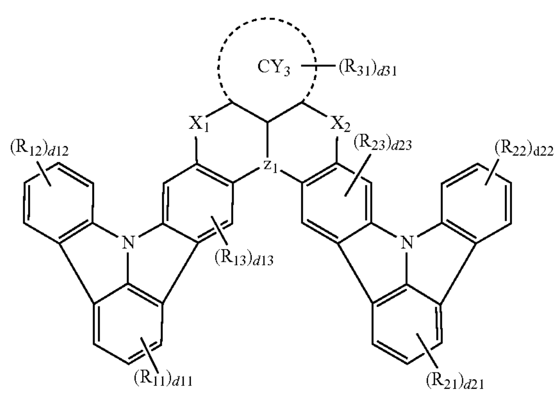

-continued
5-5
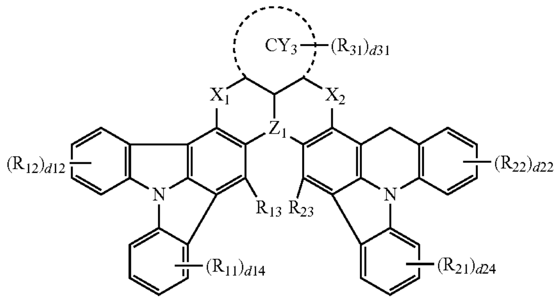
5-6
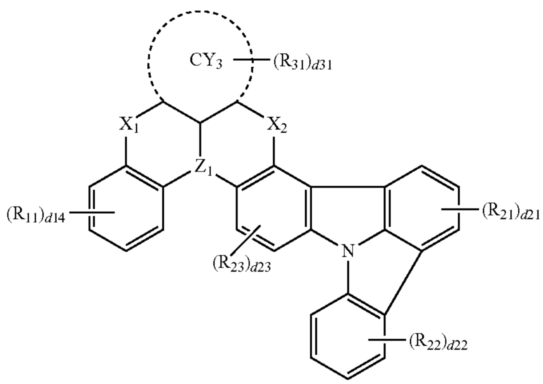
5-7
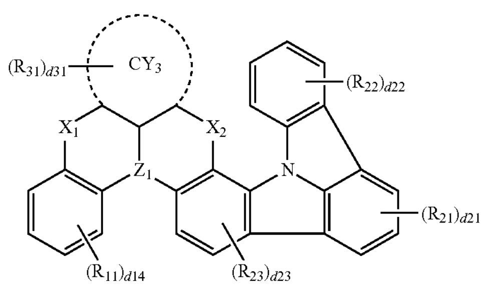
5-8
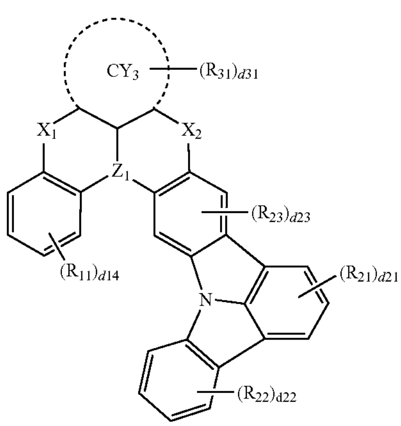
-continued
5-9
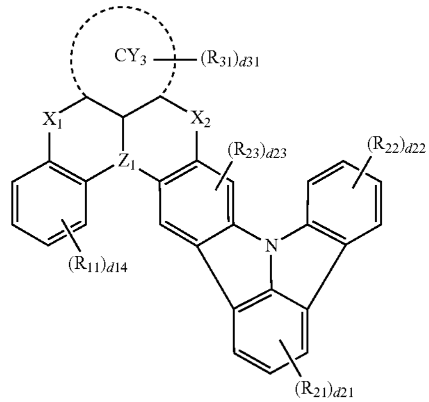
5-10
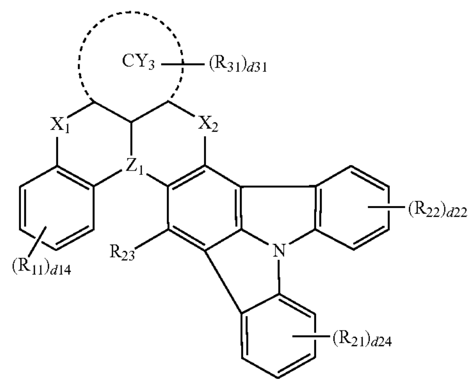
5-11
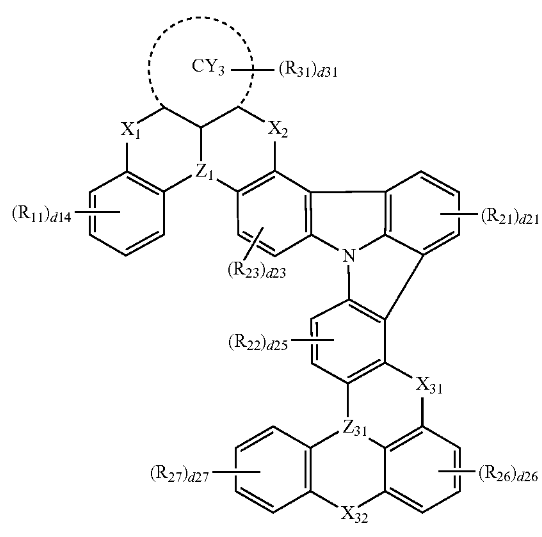

-continued
5-12
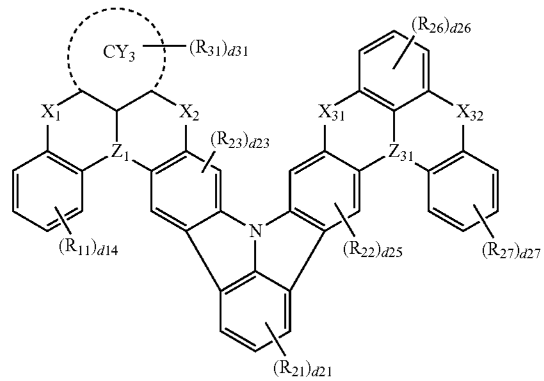
6-1
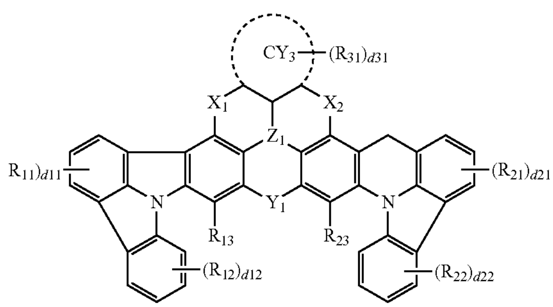
6-2
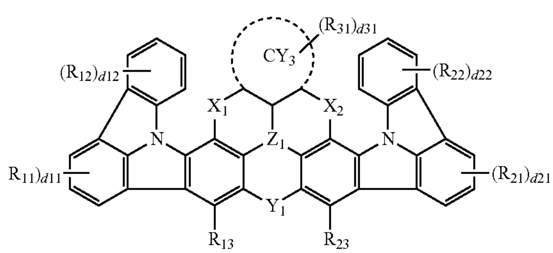
6-3
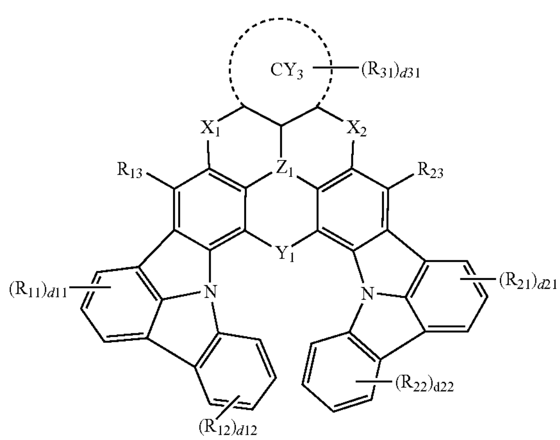
-continued
6-4
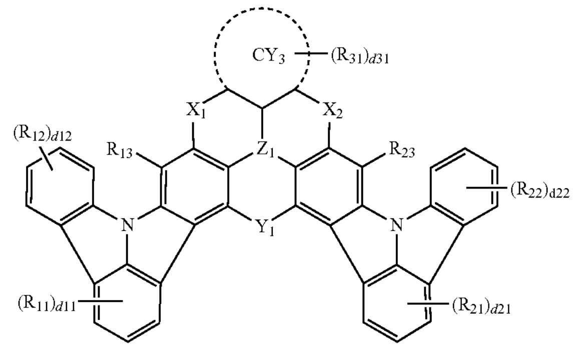
6-5
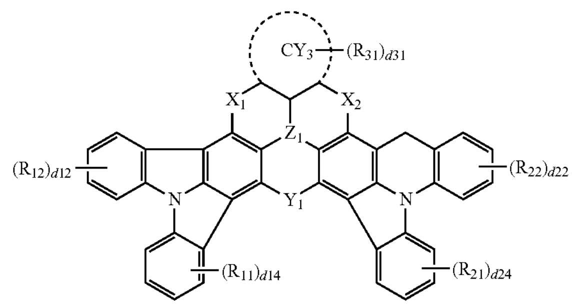
6-6
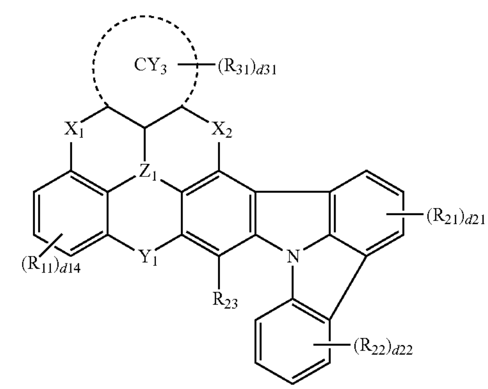
6-7
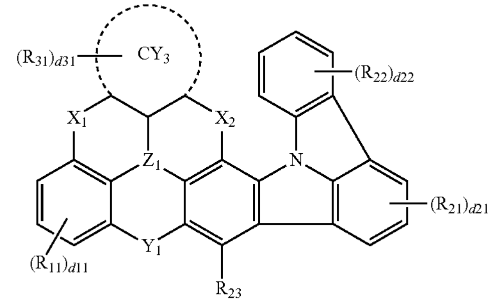

-continued 6-8

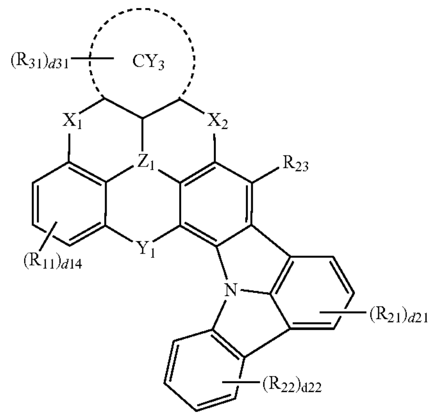

6-9

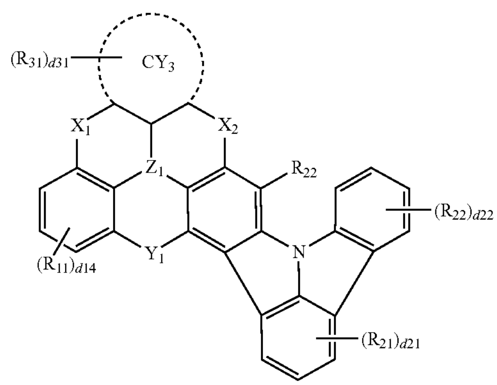

6-10

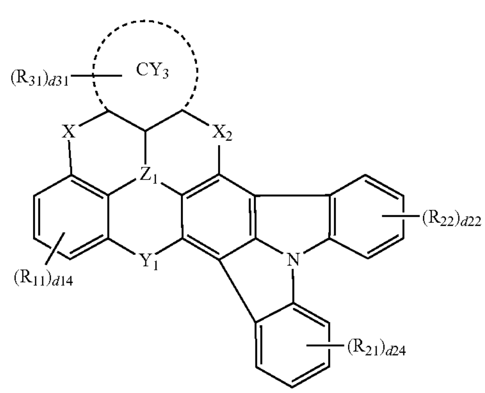

-continued 6-11

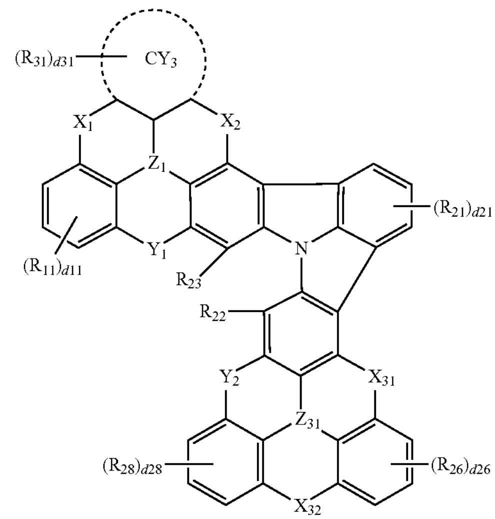

6-12

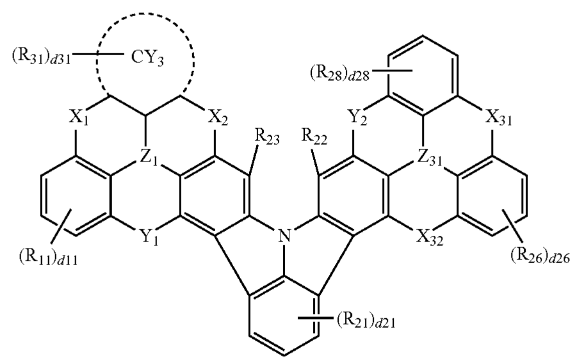

wherein, in Formulae 5-1 to 5-12 and 6-1 to 6-12, $R_{11}$ to $R_{13}$ may each be the same as described in connection with $R_1$, $R_{21}$ to $R_{23}$ and $R_{26}$ to $R_{28}$ may each be the same as described in connection with $R_2$, $R_{31}$ may be the same as described in connection with $R_3$, d11, d15, d21, d26, and d28 may each independently be an integer from 0 to 3, d12, d14, d22, d24, and d27 may each independently be an integer from 0 to 4, d13, d23, and d25 may each independently be an integer from 0 to 2, d31 may be an integer from 0 to 20, $Y_2$ may be the same as described in connection with $Y_1$, and $CY_3$, $X_1$, $X_2$, $Y_1$, $Z_1$, $X_{31}$, $X_{32}$, and $Z_{31}$ may each be the same as described herein.

In an embodiment, a moiety represented by

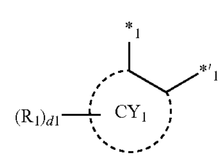

in Formula 1-1 may be represented by one of Formulae 3-1(1) to 3-10(1), and a moiety represented by

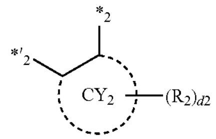
in Formula 1-1 may be represented by one of Formulae 4-1(1) to 4-10(1), provided that when the moiety represented by
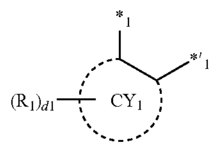
is represented by Formula 3-10(1), then the moiety represented by
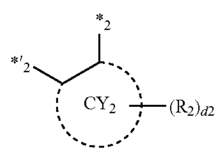
is not represented by Formula 4-10(1):
3-1(1)
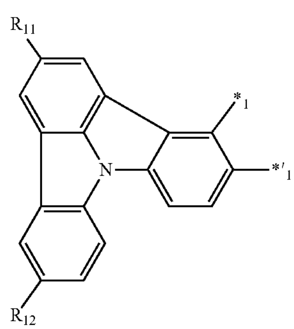
3-2(1)
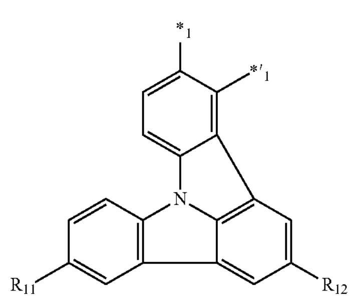
-continued
3-3(1)
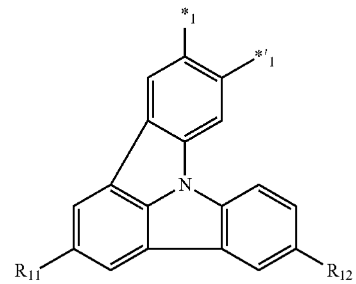
3-4(1)
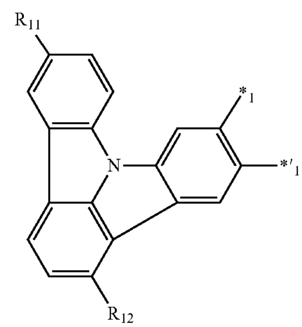
3-5(1)
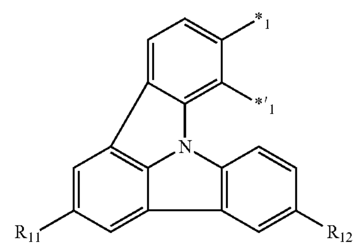
3-6(1)
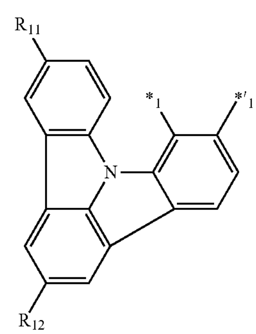
3-7(1)
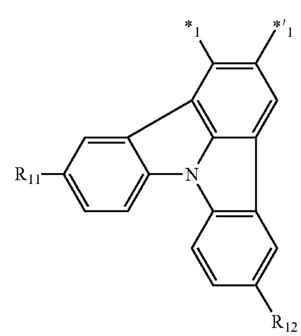

-continued
3-8(1)
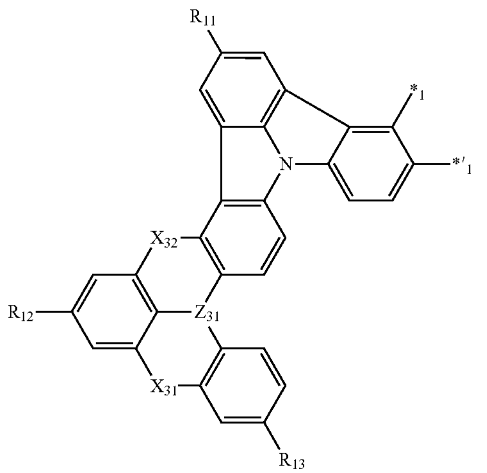
3-9(1)
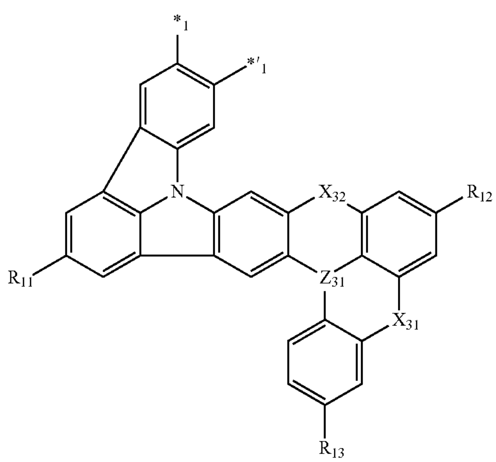
3-10(1)
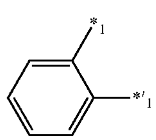
4-1(1)
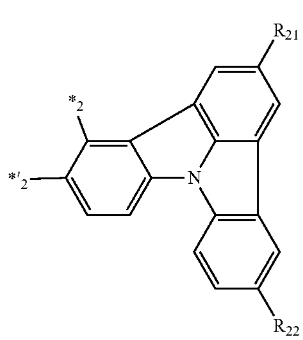
-continued
4-2(1)
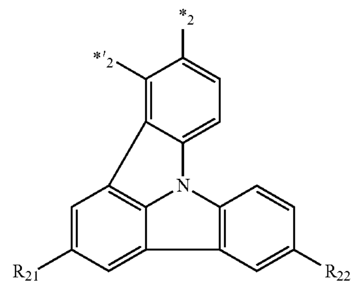
4-3(1)
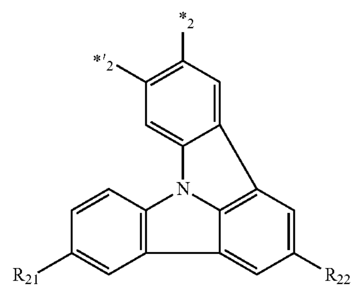
4-4(1)
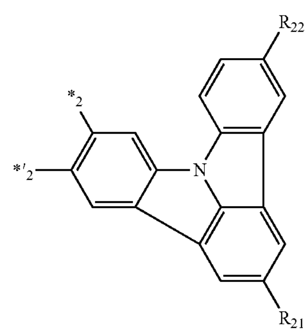
4-5(1)
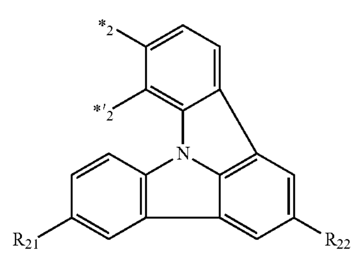
4-6(1)
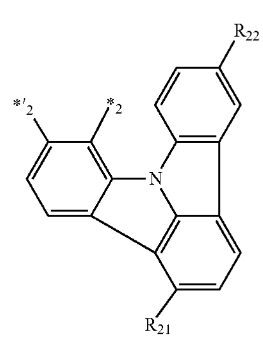

-continued 4-7(1)

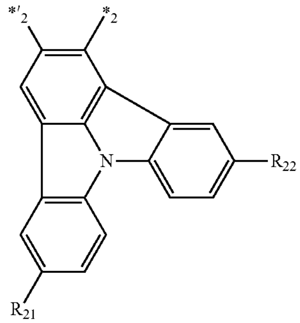

4-8(1)

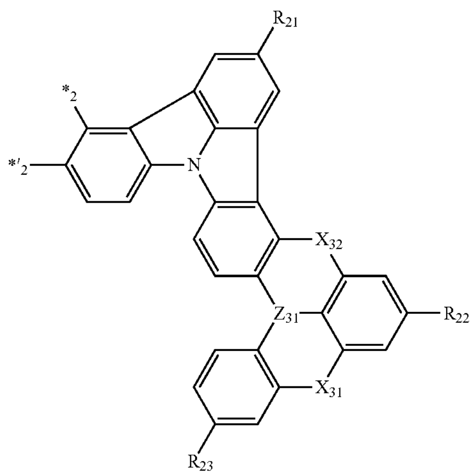

4-9(1)

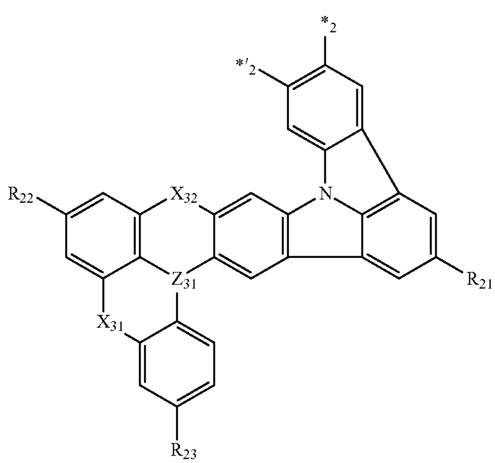

4-10(1)

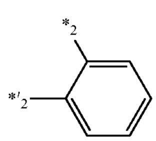

In Formulae 3-1(1) to 3-10(1) and 4-1(1) to 4-10(1), $R_{11}$ to $R_{13}$ may each be the same as described in connection with $R_1$, $R_{21}$ to $R_{23}$ may each be the same as described in connection with $R_2$, $*^1$ indicates a binding site to $X_1$ in Formula 1-1, $*'^1$ indicates a binding site to $Z_1$ in Formula 1-1, $*^2$ indicates a binding site to $X_2$ in Formula 1-1, and $*'^2$ indicates a binding site to $Z_1$ in Formula 1-1.

In an embodiment, a moiety represented by

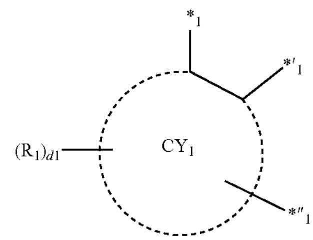

in Formula 1-2 may be represented by one of Formulae 3-11(1) to 3-16(1), and a moiety represented by

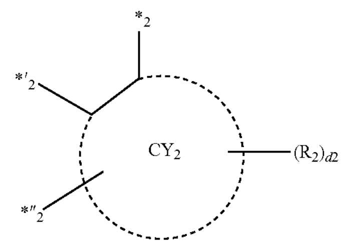

in Formula 1-2 may be represented by one of Formulae 4-11(1) to 4-16(1), provided that when the moiety represented by

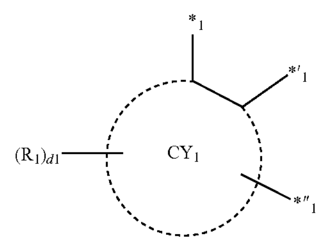

is represented by Formula 3-16(1), then the moiety represented by

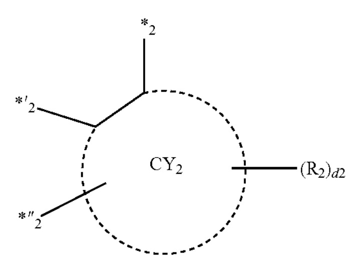

is not represented by Formula 4-16(1):
3-11(1)
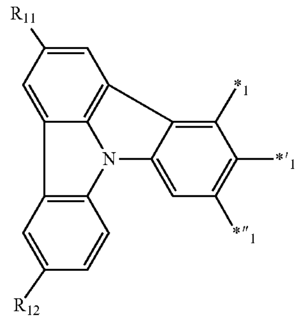
3-12(1)
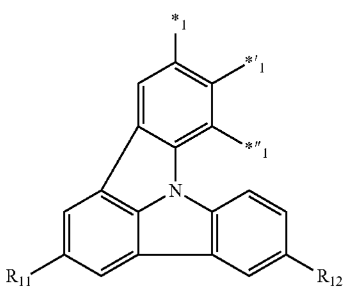
3-13(1)
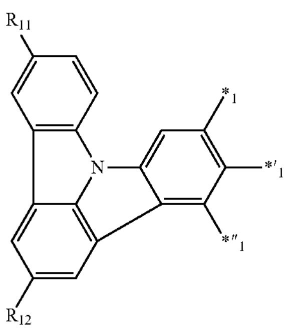
3-14(1)
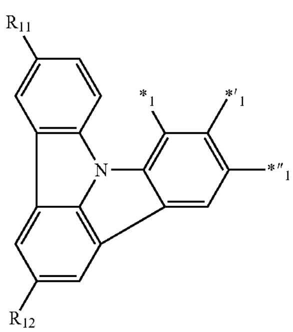
3-15(1)
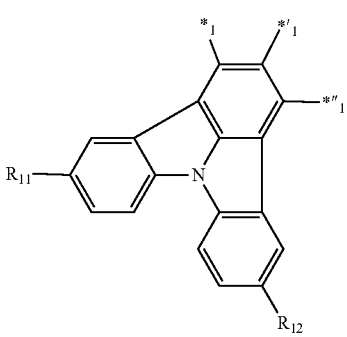
-continued
3-16(1)
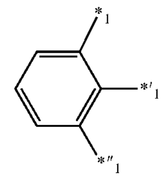
4-11(1)
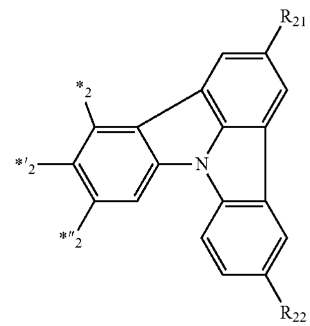
4-12(1)
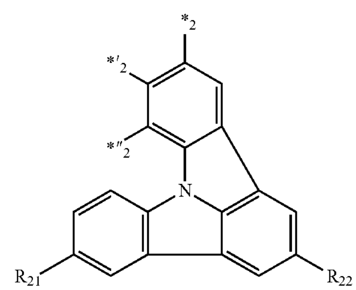
4-13(1)
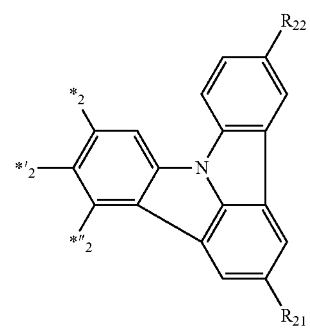
4-14(1)
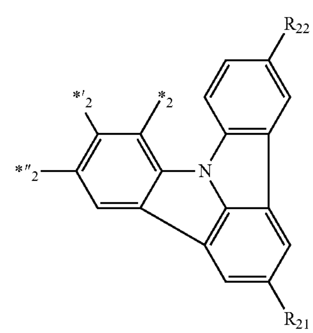

-continued 4-15(1)

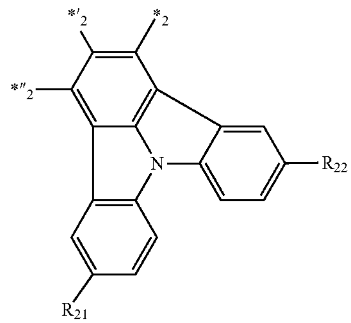

4-16(1)

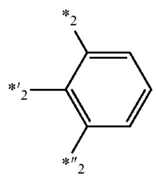

In Formulae 3-11(1) to 3-16(1) and 4-11(1) to 4-16(1), $R_{11}$ and $R_{12}$ may each be the same as described in connection with $R_1$, $R_{21}$ and $R_{22}$ may each be the same as described in connection with $R_2$, $*^{1}$ indicates a binding site to $X_1$ in Formula 1-2, $*'^{1}$ indicates a binding site to $Z_1$ in Formula 1-2, $*''^{1}$ indicates a binding site to Y, in Formula 1-2, $*^{2}$ indicates a binding site to $X_2$ in Formula 1-2, $*'^{2}$ indicates a binding site to $Z_1$ in Formula 1-2, and $*''^{2}$ indicates a binding site to Y, in Formula 1-2.

In an embodiment, a group represented by

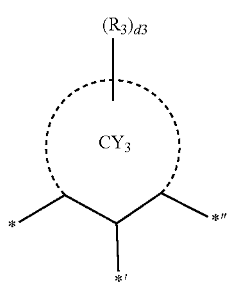

in Formulae 1-1 and 1-2 may be represented by one of Formulae 7-1 to 7-3:

7-1

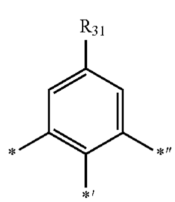

-continued 7-2

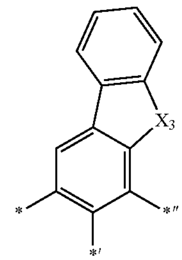

7-3

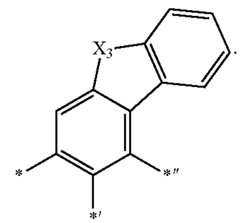

In Formulae 7-1 to 7-3,

* indicates a binding site to $X_1$ in Formula 1,

*' indicates a binding site to $Z_1$ in Formula 1,

*" indicates a binding site to $X_2$ in Formula 1, $X_3$ may be O, S, Se, Te, $N(R_{31})$, or $C(R_{31})(R_{32})$, and $R_{31}$ and $R_{32}$ may each be the same as described in connection with $R_3$.

In an embodiment, $R_1$ to $R_3$, $R_{1a}$ to $R_{4a}$, and $R_{1b}$ to $R_{3b}$ may each independently be: hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$; and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a carbazole group, a dibenzofuranyl group, or a dibenzothiophenyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, the condensed cyclic compound represented by Formula 1-1 or 1-2 may satisfy Equation 1:

$$E_R=[E(S_0@S_1)]-[E(S_0@S_0)]\leq 0.1\text{ eV} \quad \text{Equation 1}$$

wherein, in Equation 1, $E_R$ indicates the reorganization energy of the condensed cyclic compound, $[E(S_0@S_1)]$ indicates the ground state energy of the condensed cyclic compound having a stable structure in an excited singlet state ($S_1$), and $[E(S_0@S_0)]$ indicates the ground state energy of the condensed cyclic compound having a stable structure in a ground state ($S_0$).

Here, the stable structure and the energy are calculated using Gaussian 16 (Gaussian Inc.), and detailed calculation methods thereof are described below. In an embodiment, the condensed cyclic compound represented by Formula 1-1 or 1-2 may be one of Compounds 1 to 102, 201 to 203, 301 to 369, 401 to 413, and 501 to 532, but is not limited thereto:

1

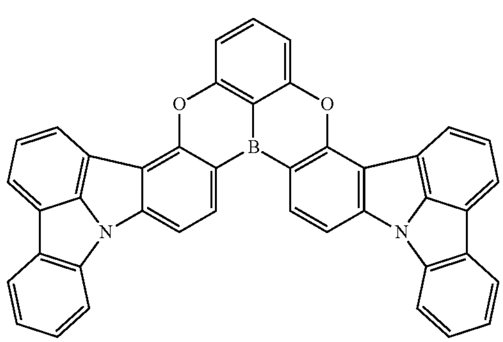

2

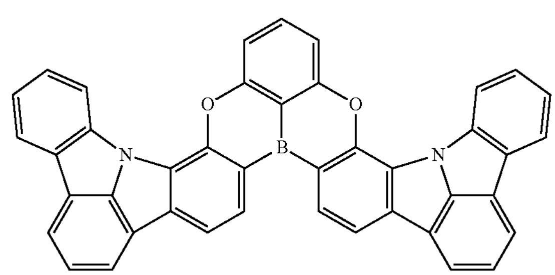

-continued
3
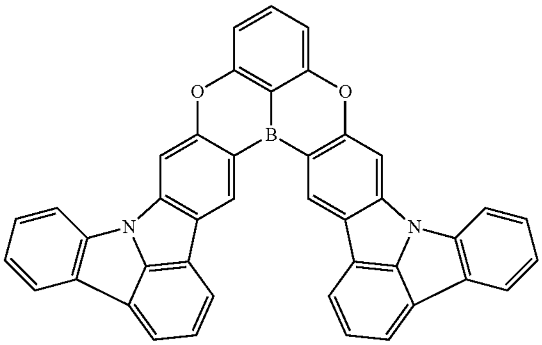
4
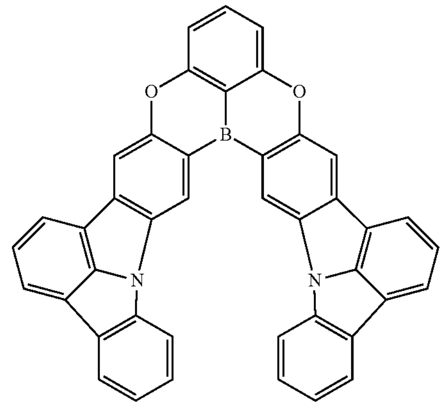
5
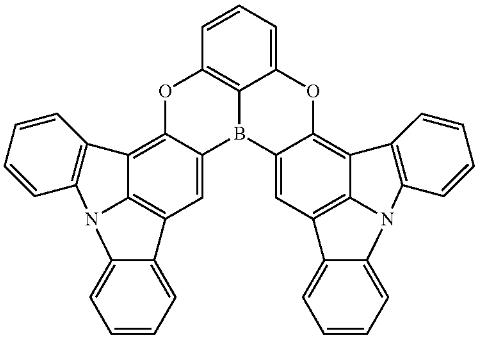
6
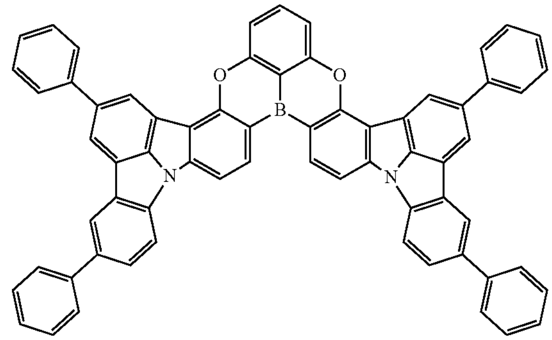
7
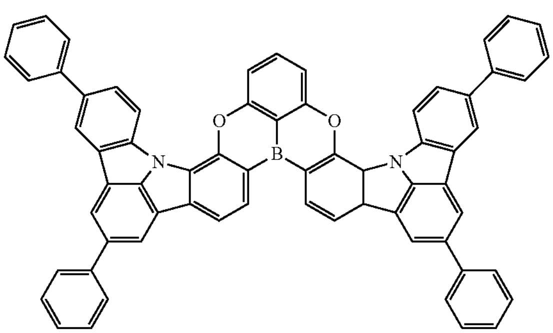
8
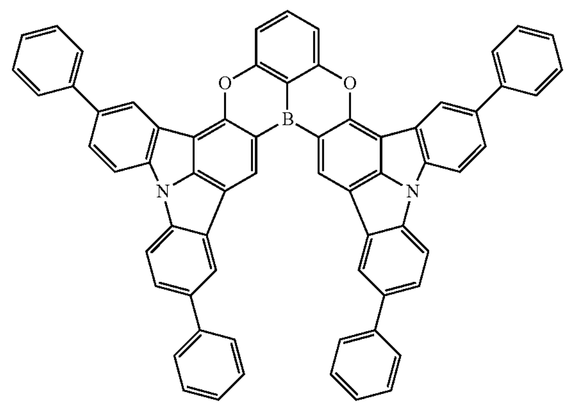
9
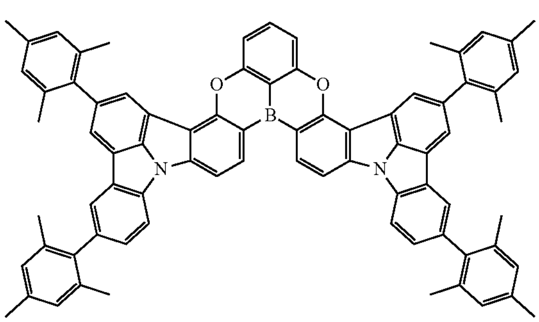
10
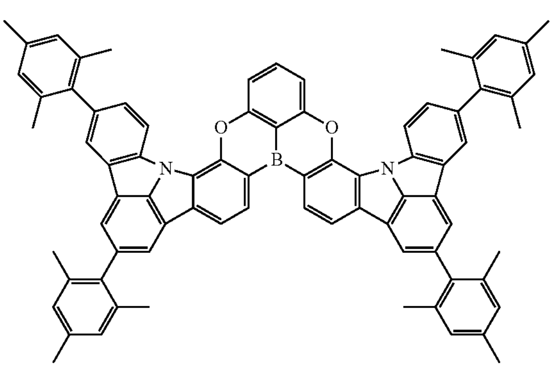

-continued
11
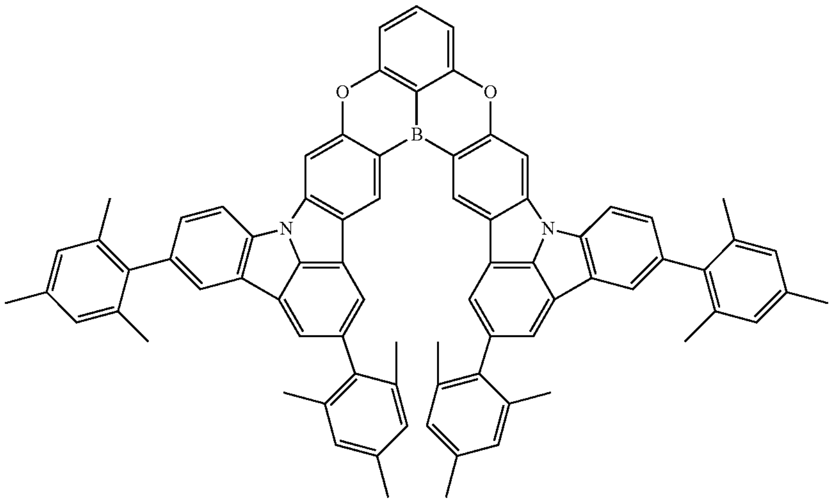
12
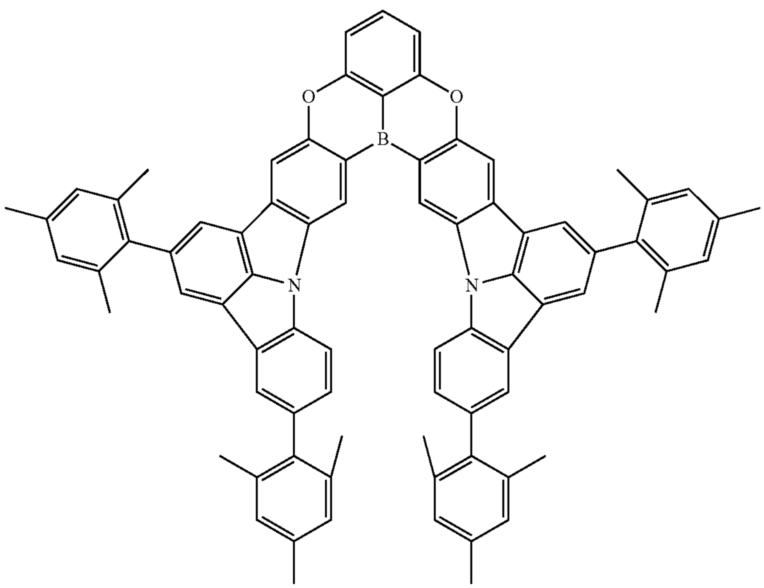
13
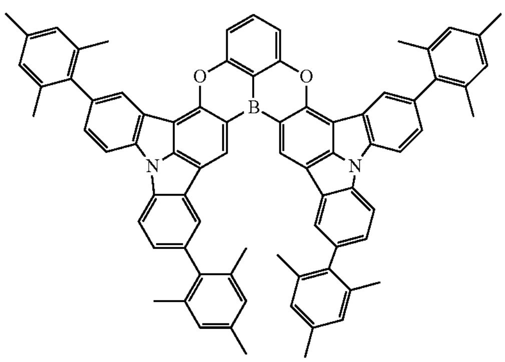
14
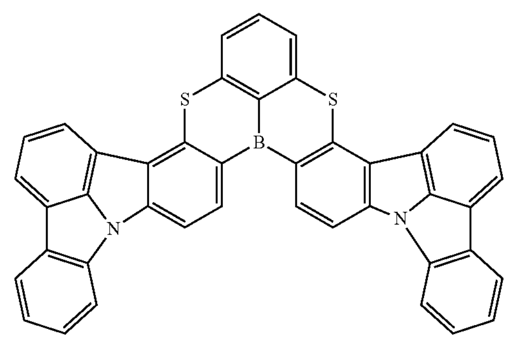

-continued
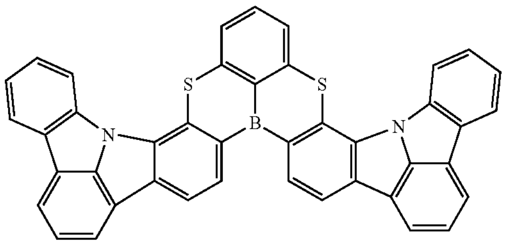
15
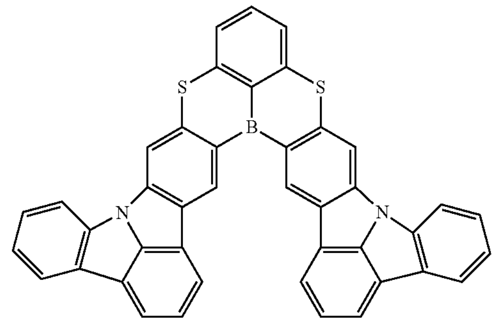
16
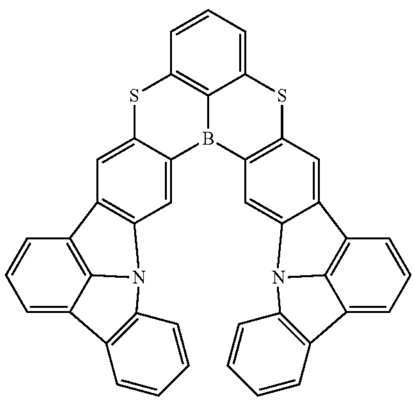
17
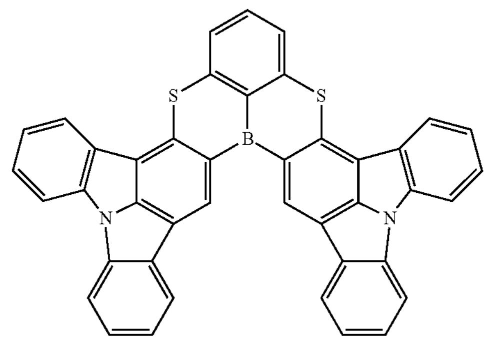
18
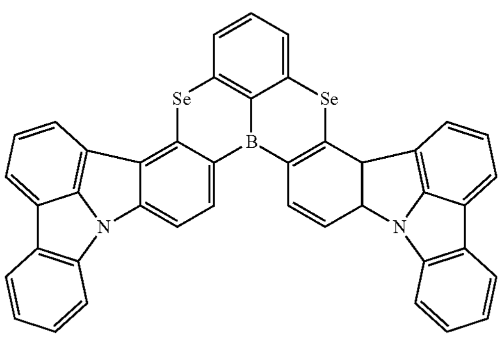
19
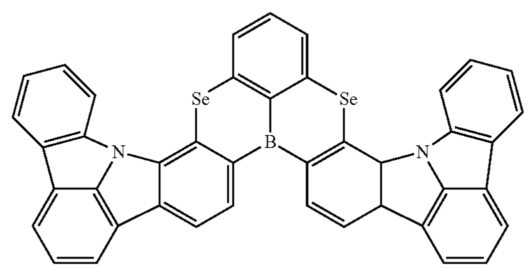
20
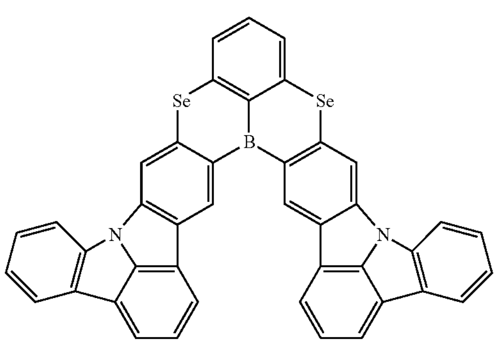
21
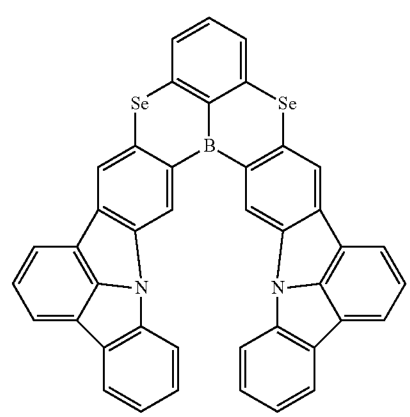
22

-continued
23
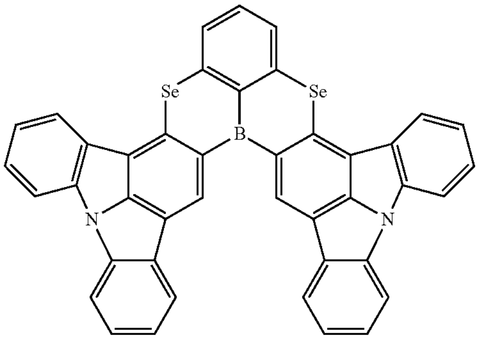
24
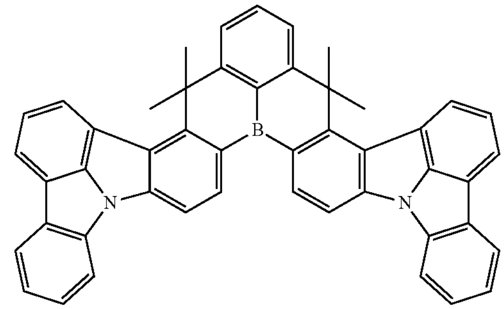
25
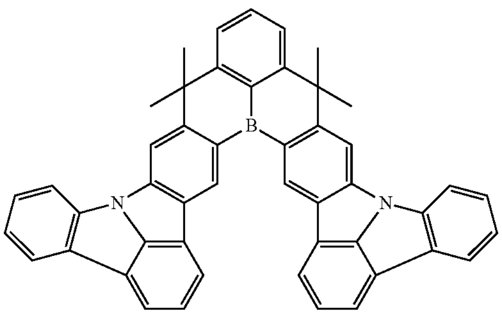
26
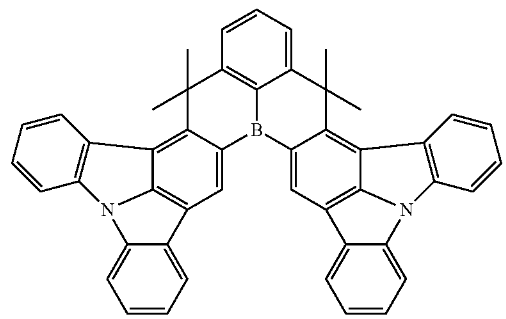
27
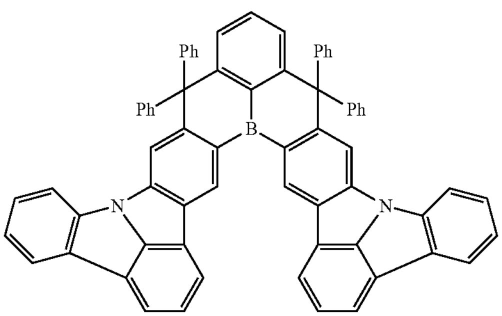
28
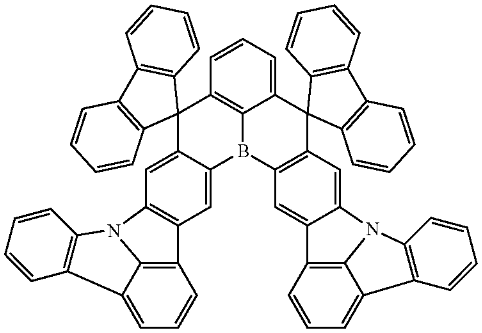
29
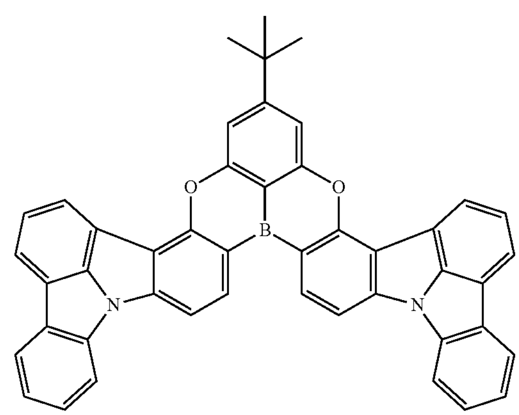

-continued
30
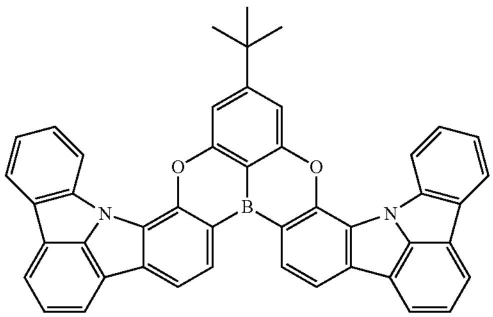
31
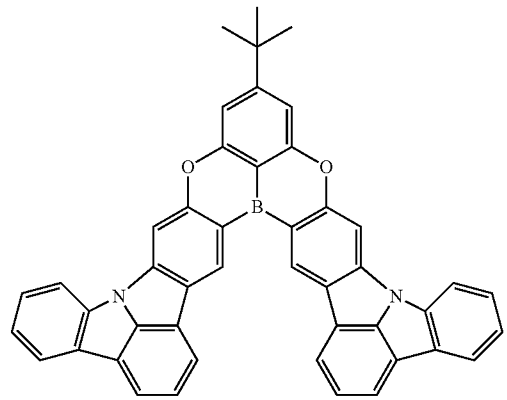
32
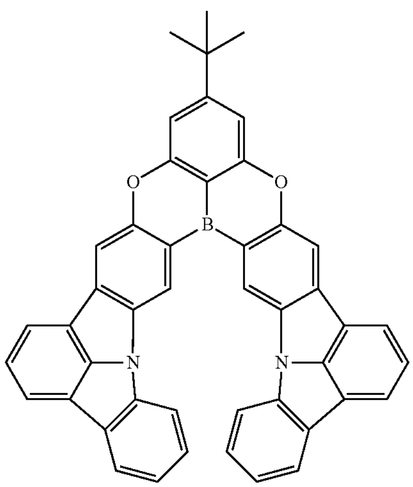
33
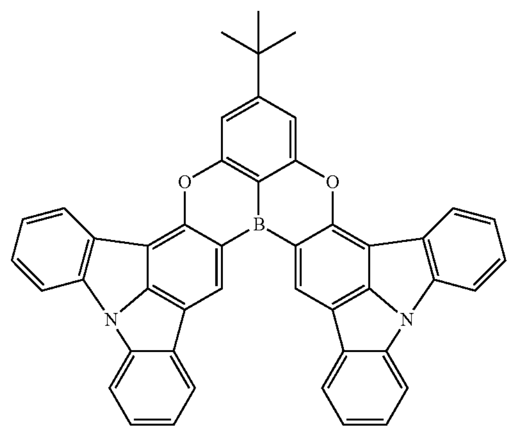
34
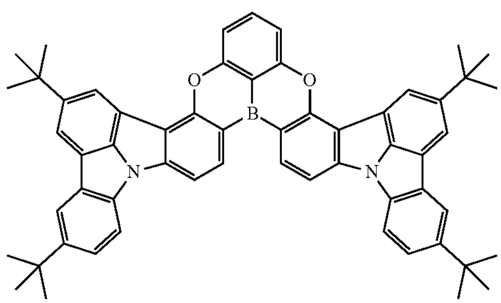
35
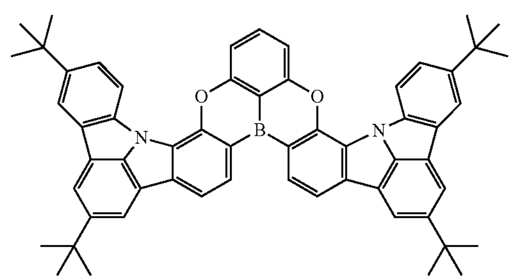
36
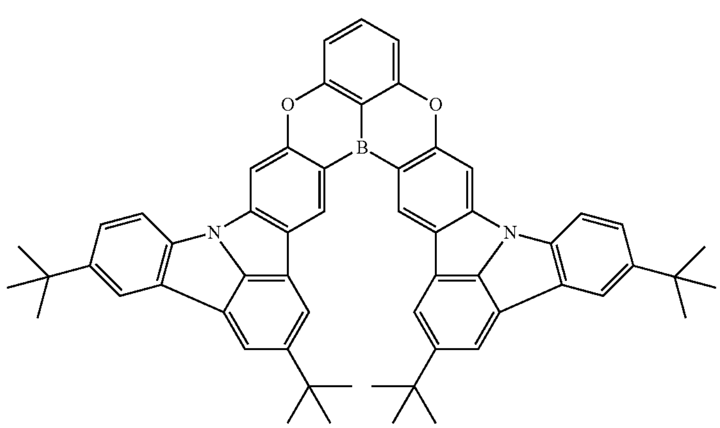

-continued
37
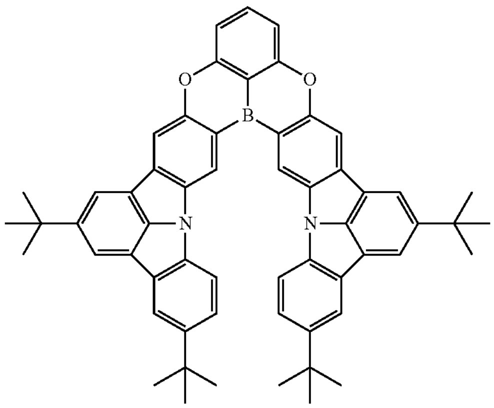
38
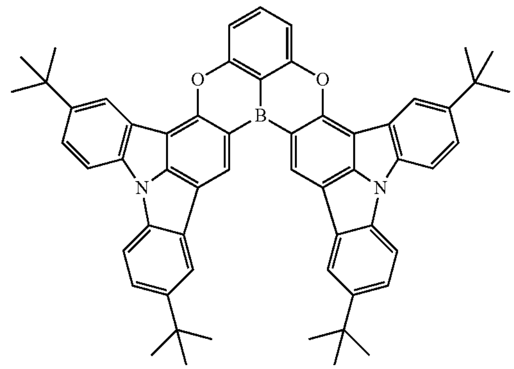
39
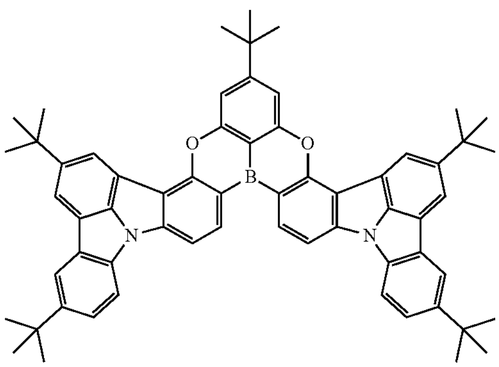
40
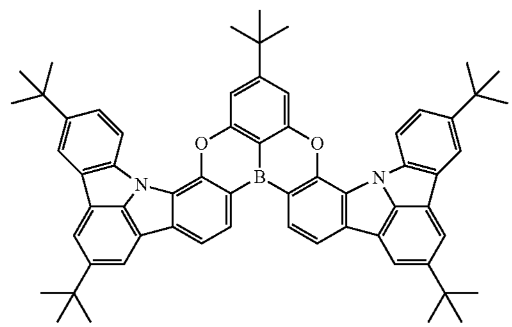
41
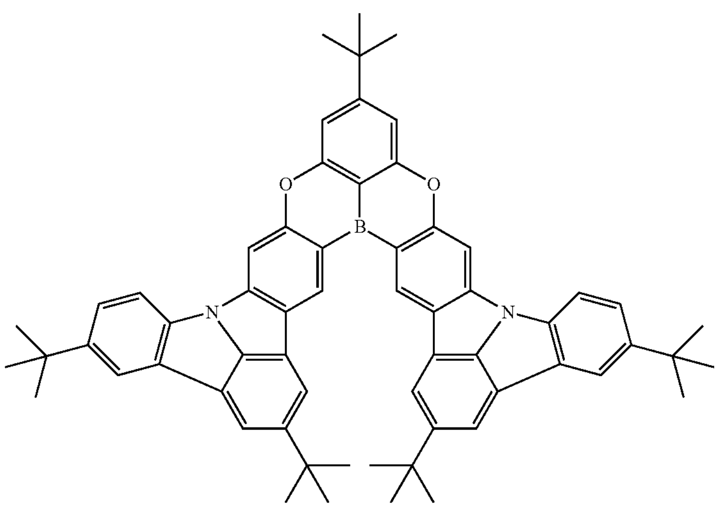

-continued
42
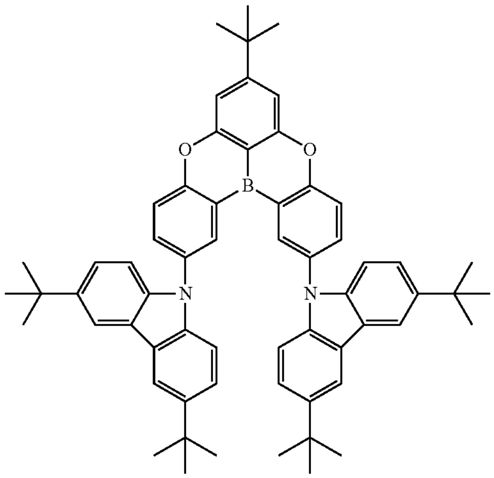
43
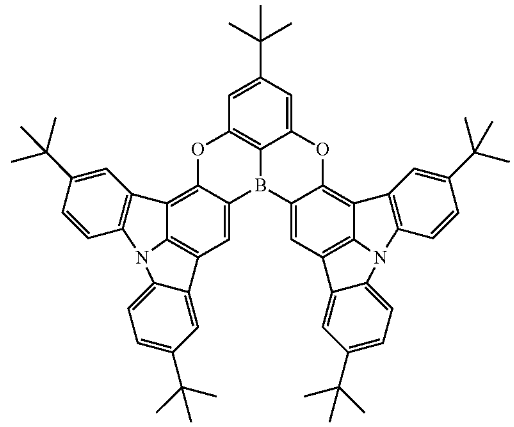
44
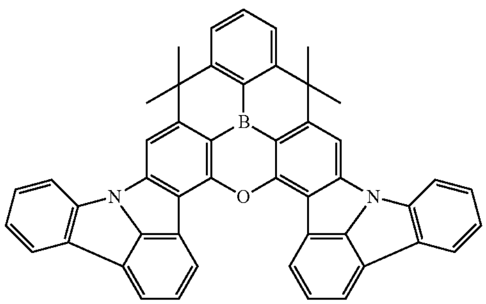
45
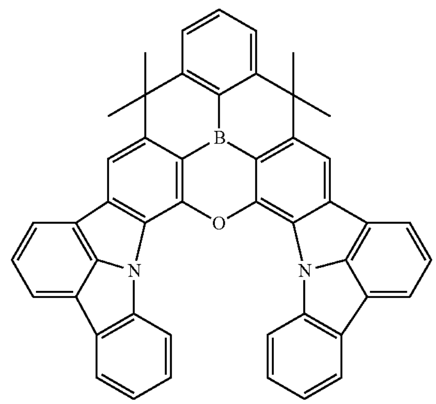
46
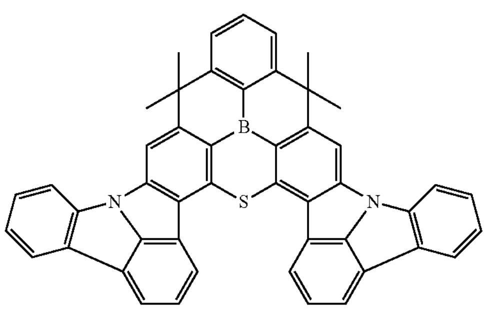
47
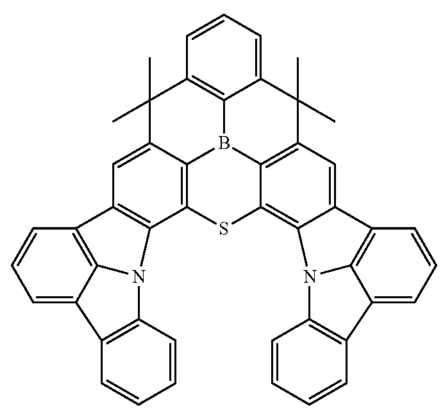

-continued
48
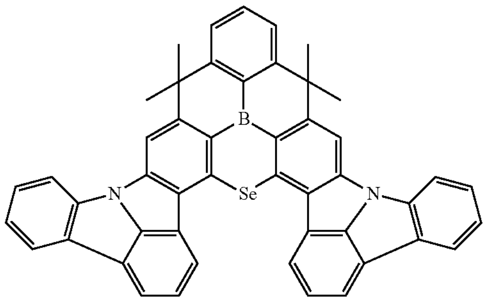
49
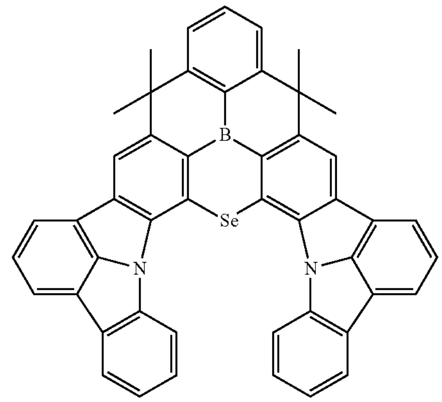
50
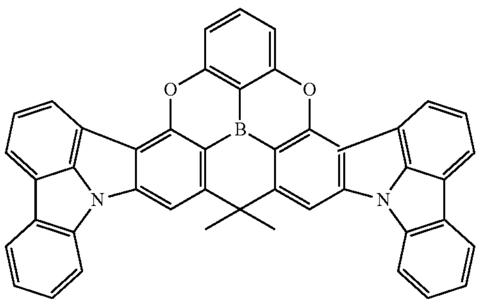
51
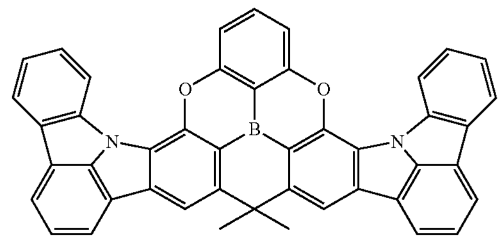
52
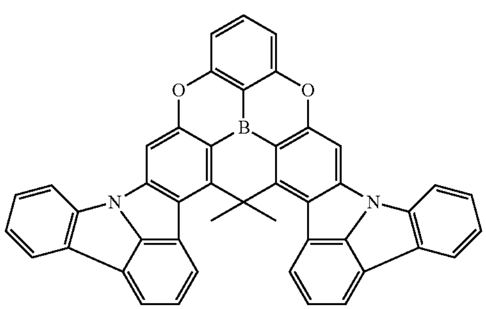
53
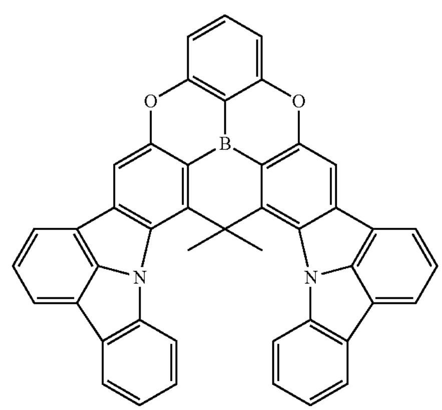
54
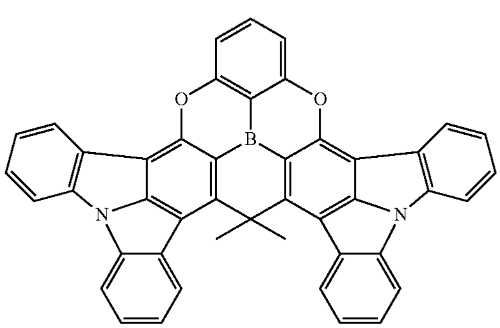
55
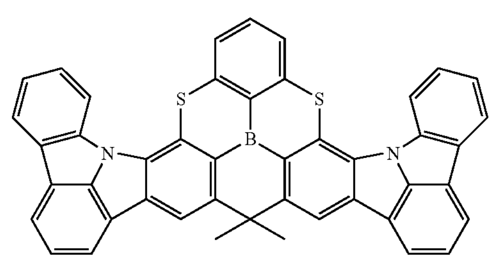

-continued
56
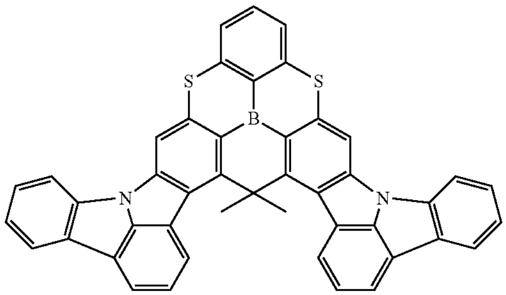
57
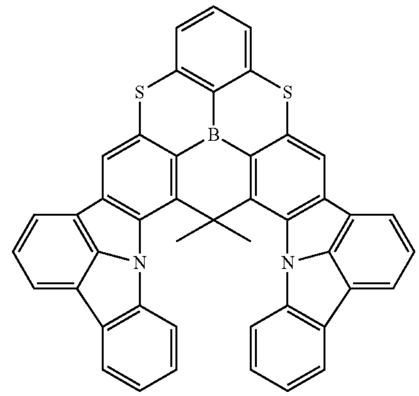
58
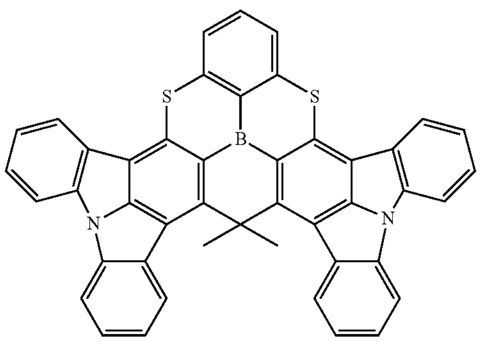
59
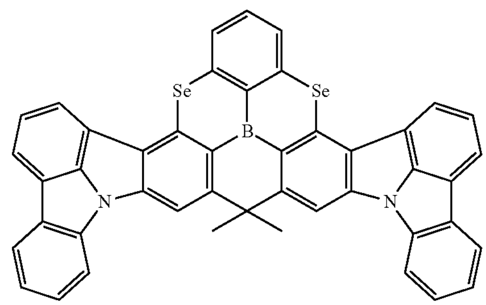
60
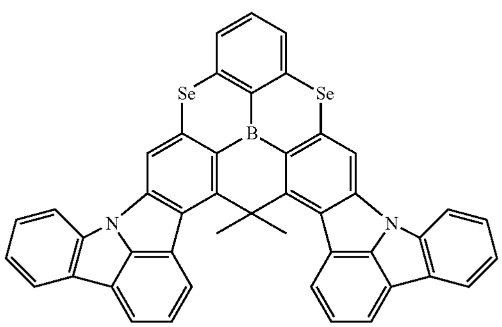
61
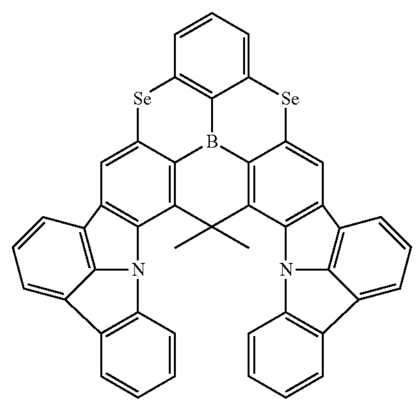
62
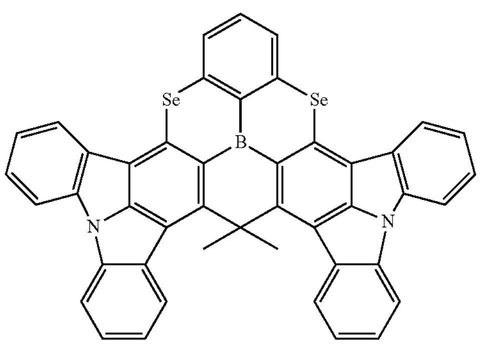
63
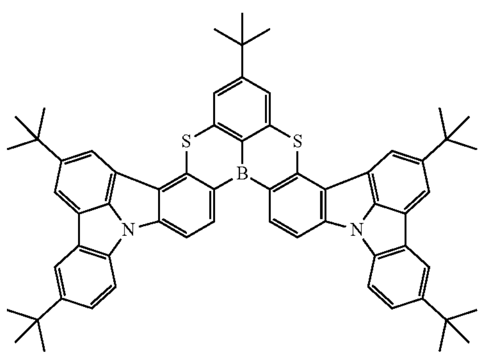

-continued
64
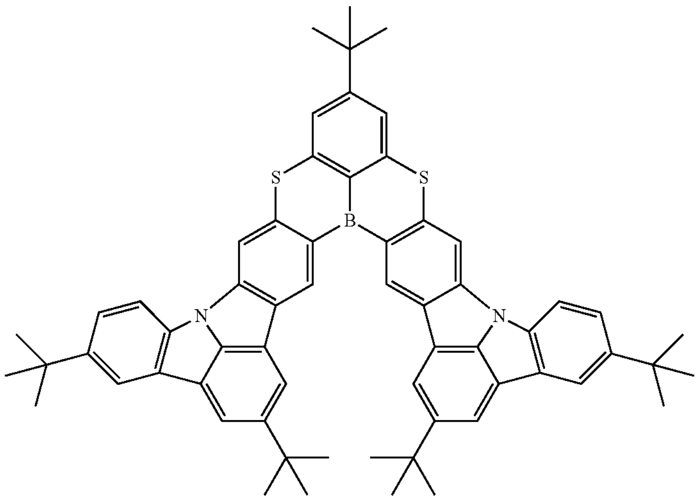
65
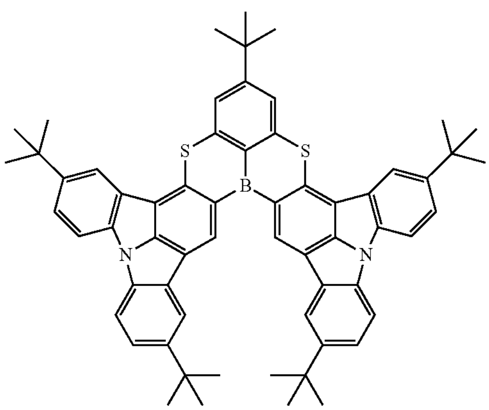
66
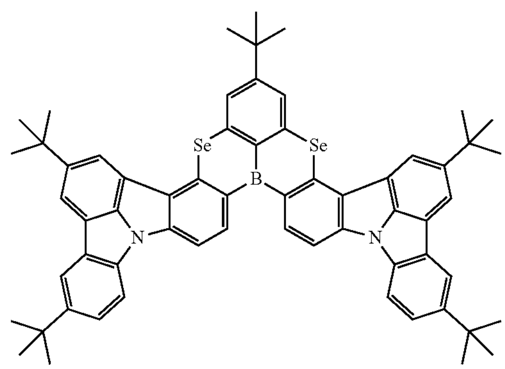
67
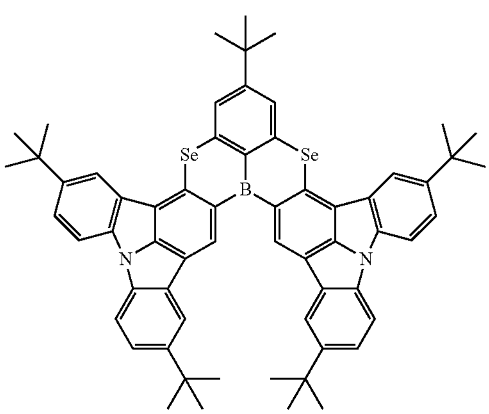
68
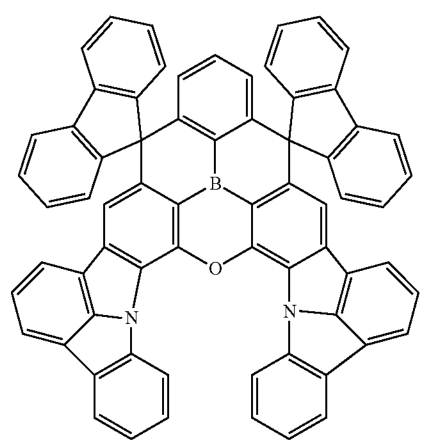

-continued
69
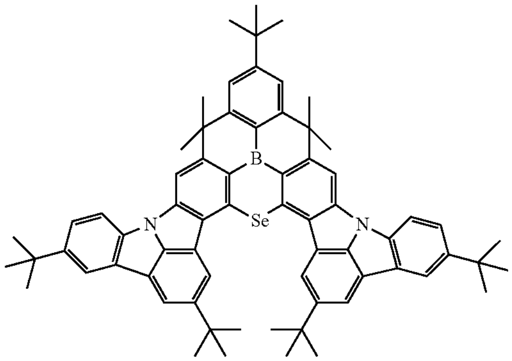
70
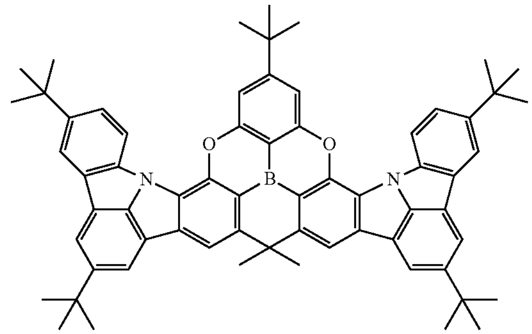
71
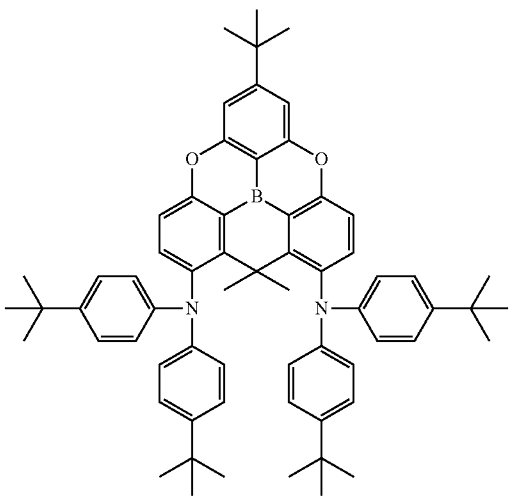
72
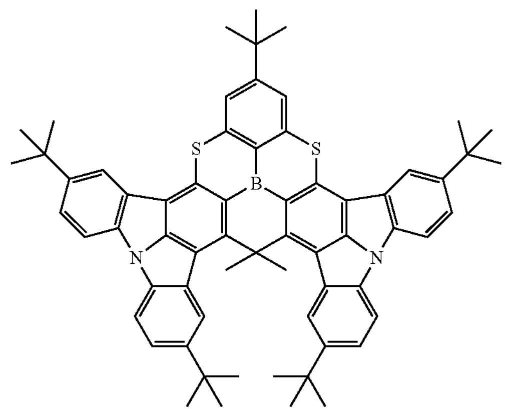
73
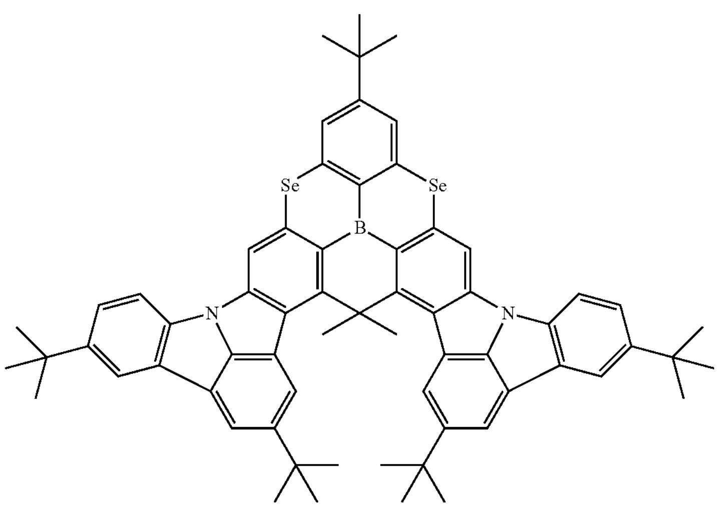

-continued
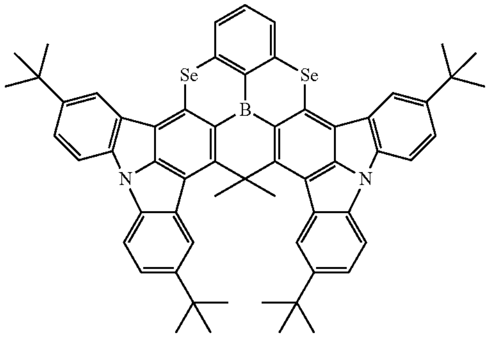
74
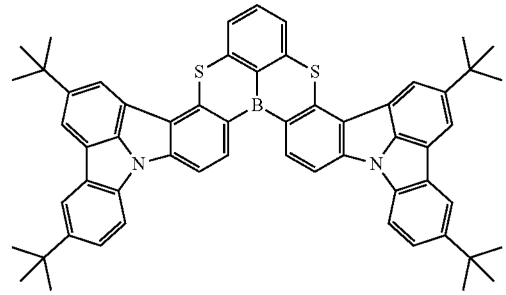
75
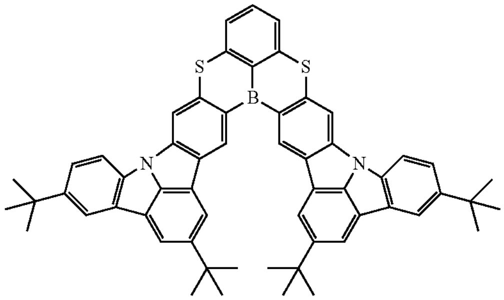
76
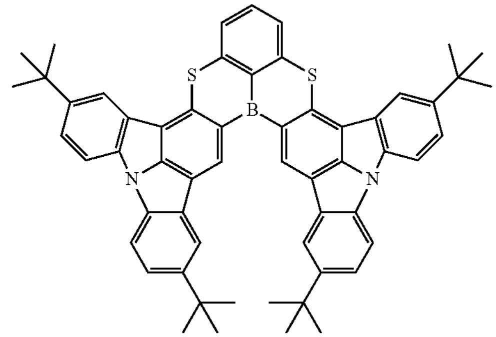
77
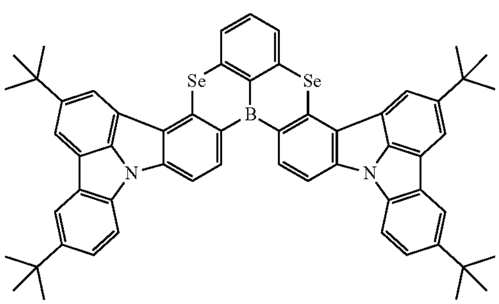
78
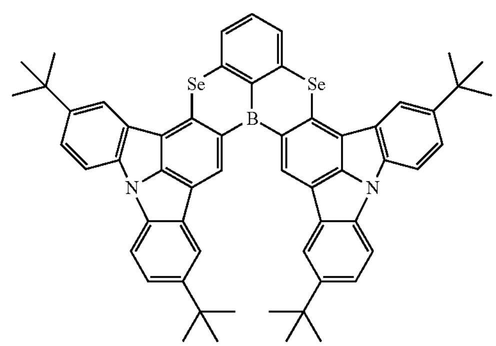
79
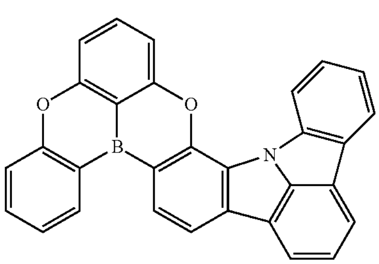
80
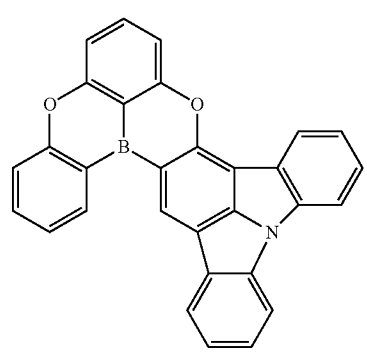
81

-continued
82
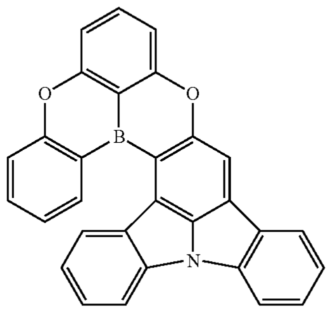
83
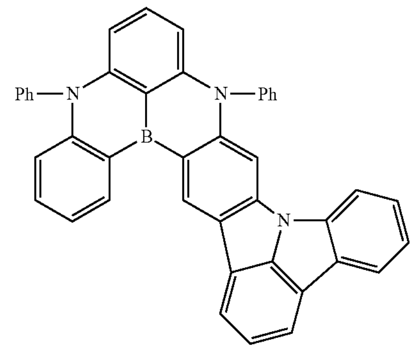
84
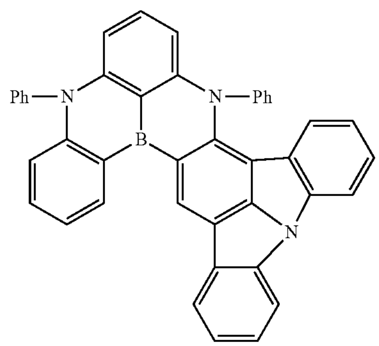
85
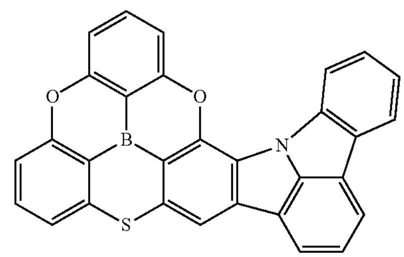
86
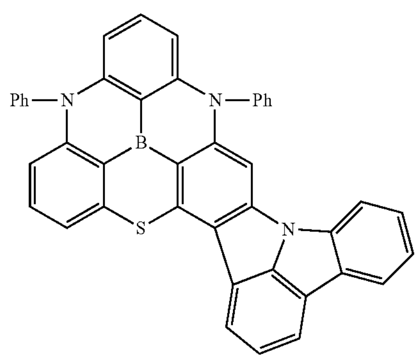
87
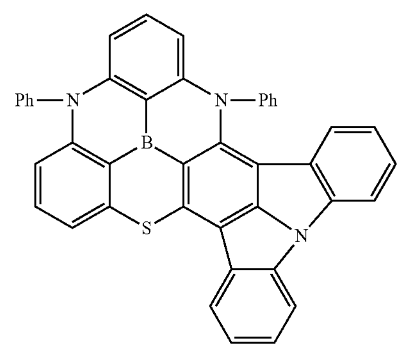
88
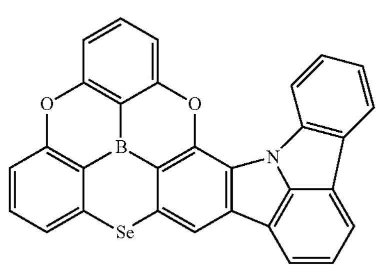
89
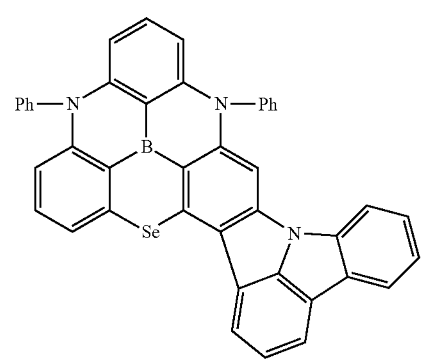

-continued
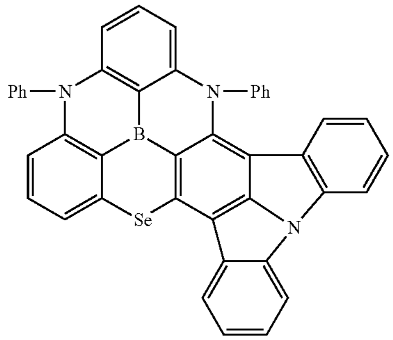
90
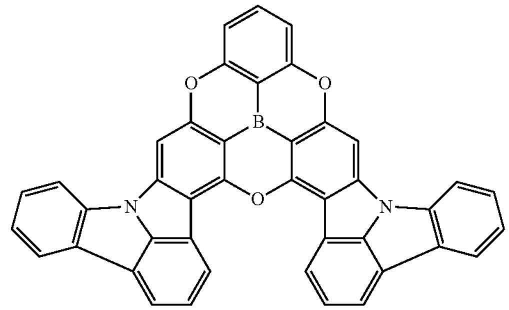
91
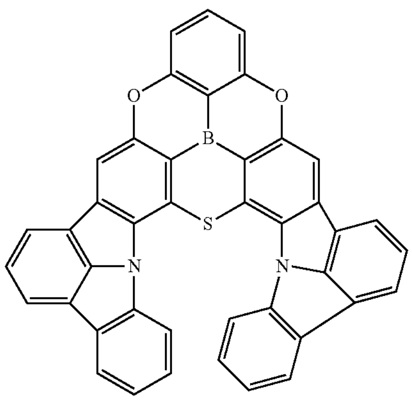
92
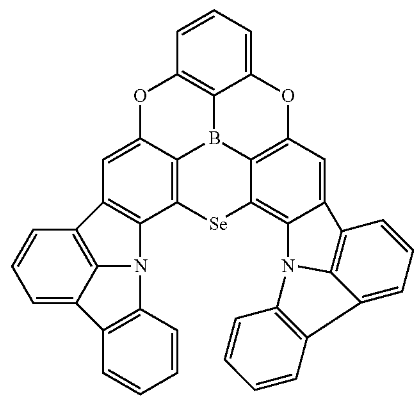
93
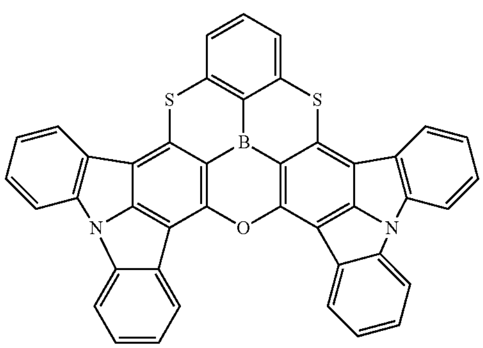
94
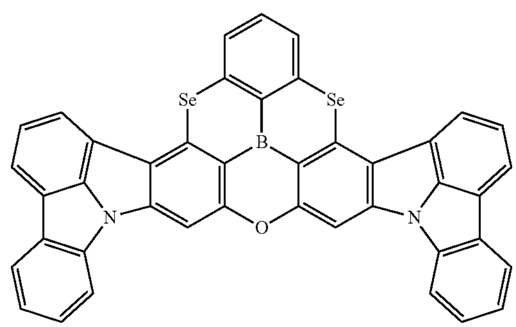
95
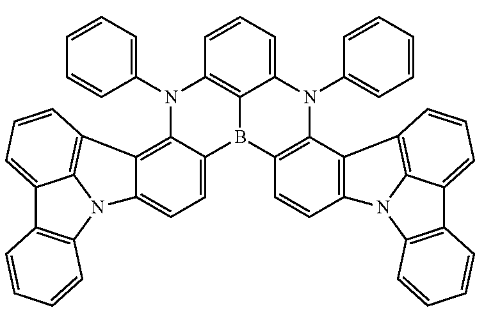
96
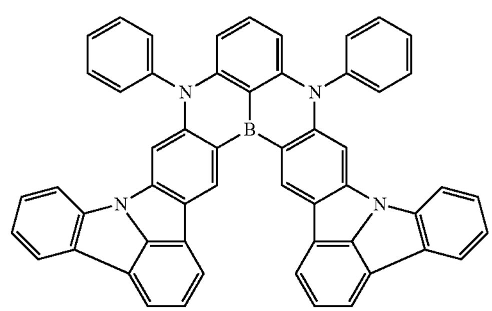
97

-continued
98
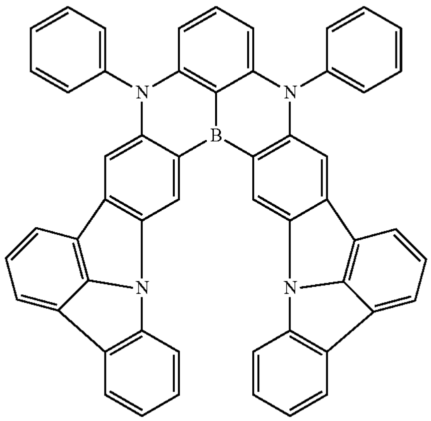
99
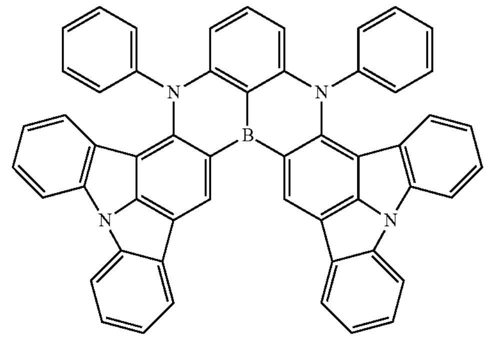
100
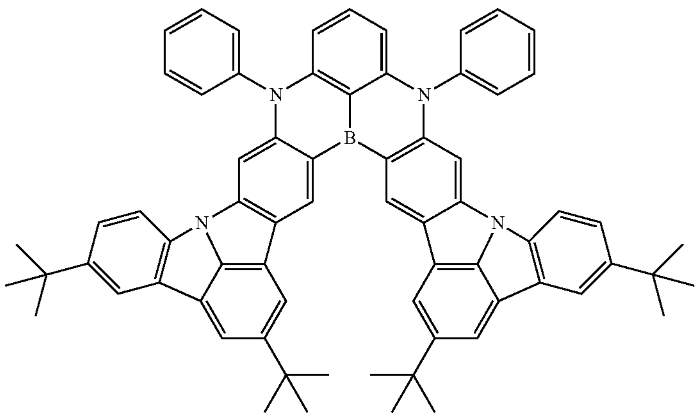
101
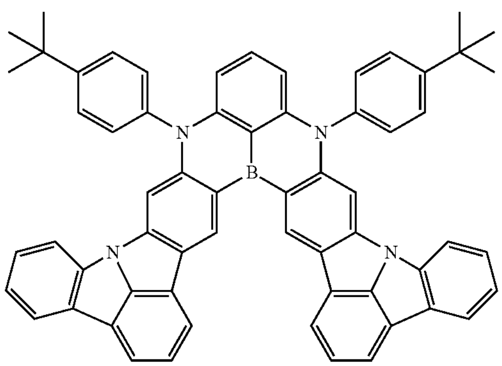
102
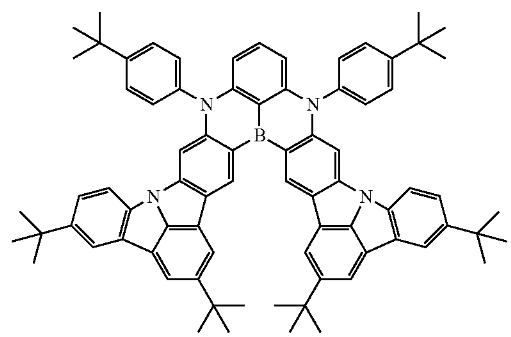
201
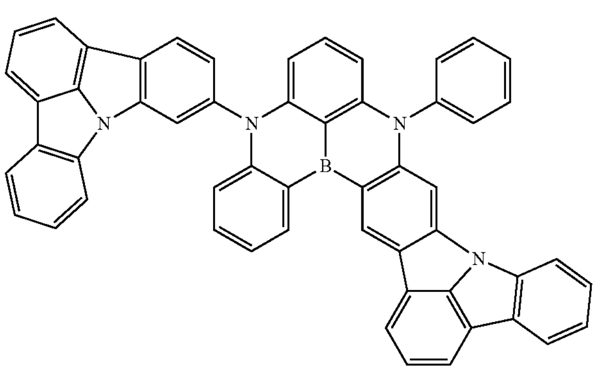

-continued
202
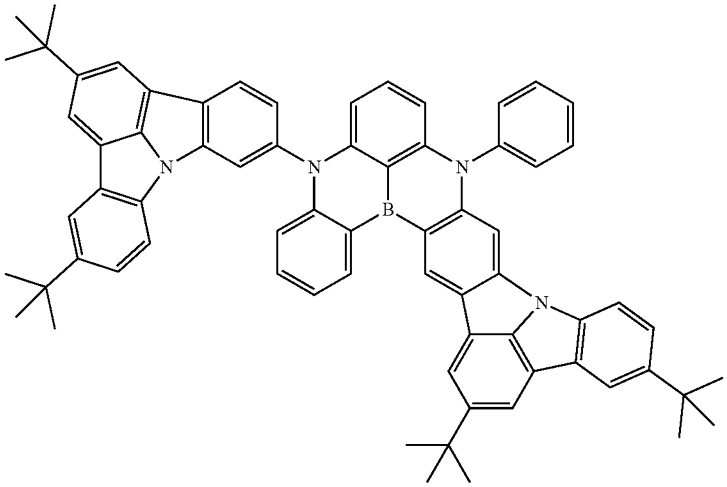
203
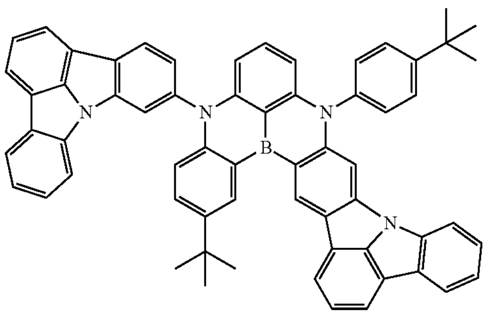
301
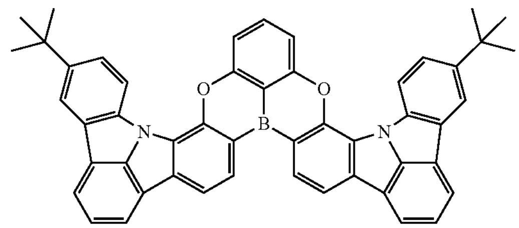
302
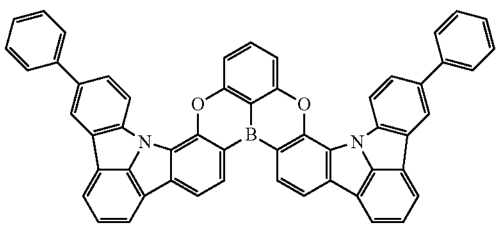
303
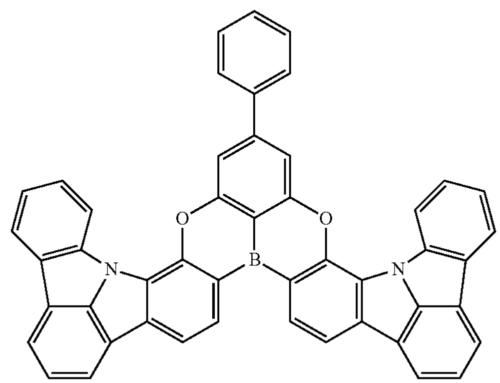
304
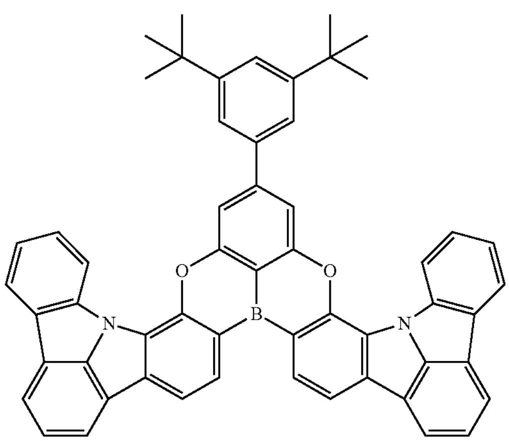
305
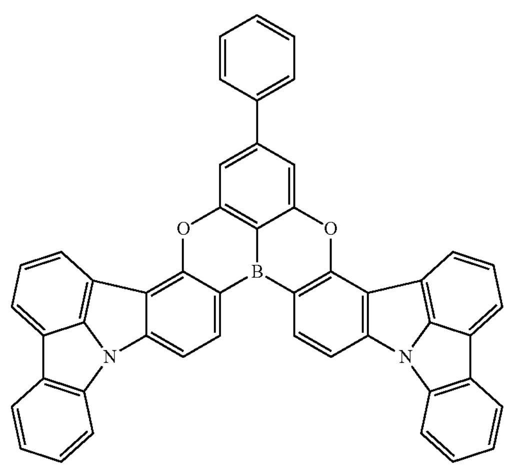

-continued
306
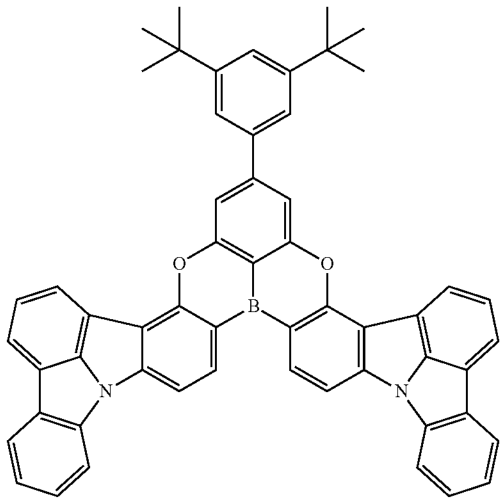
307
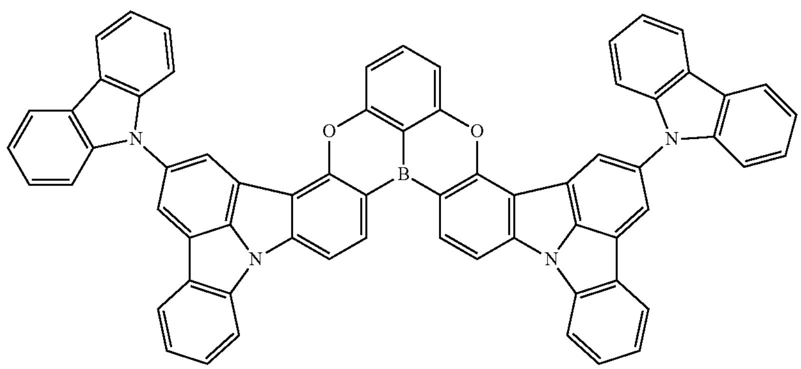
308
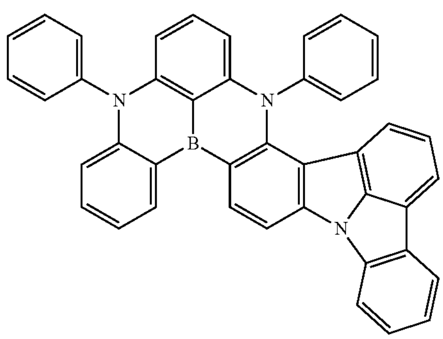
309
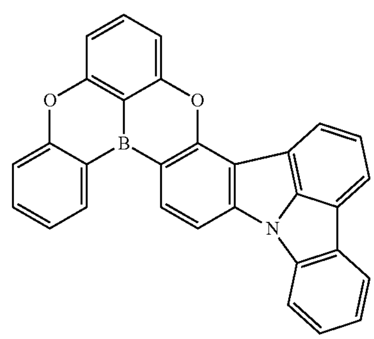
310
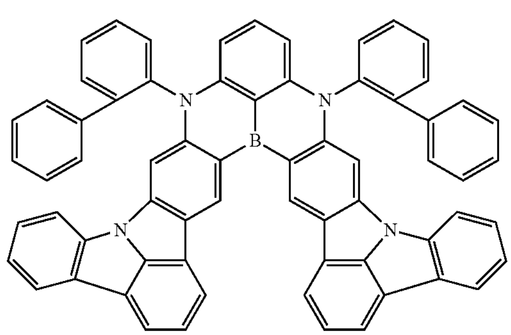
311
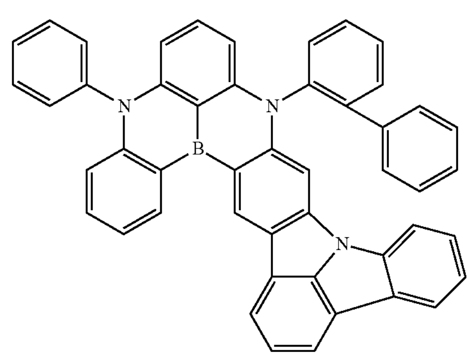

-continued
312
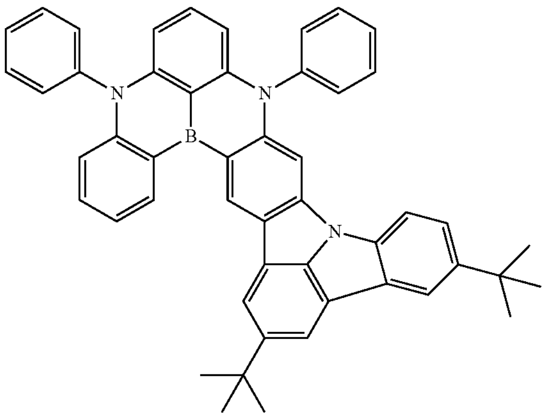
313
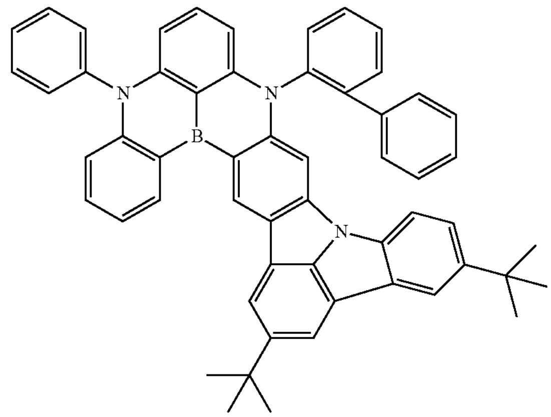
314
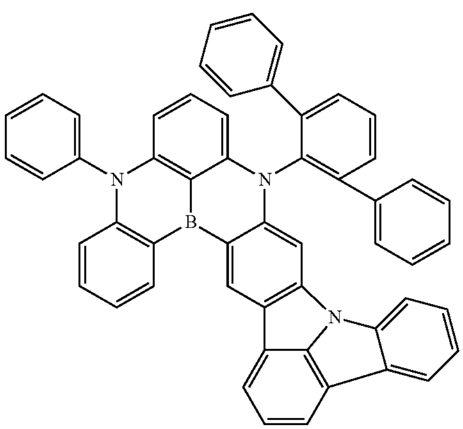
315
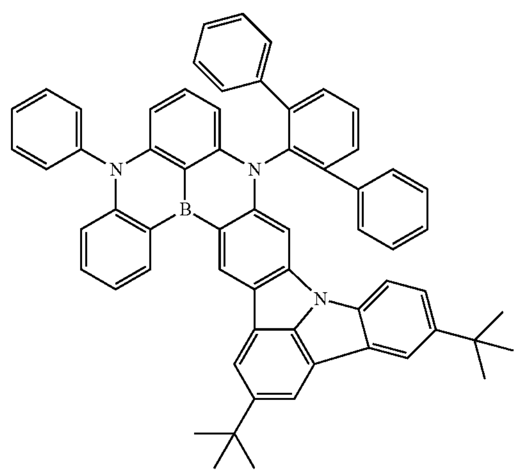
316
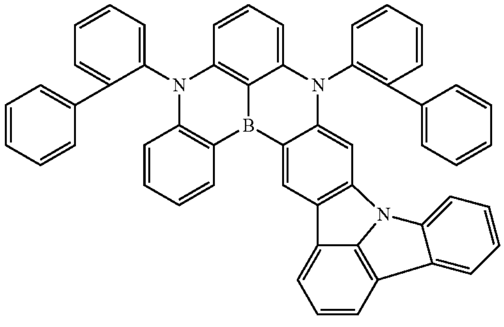
317
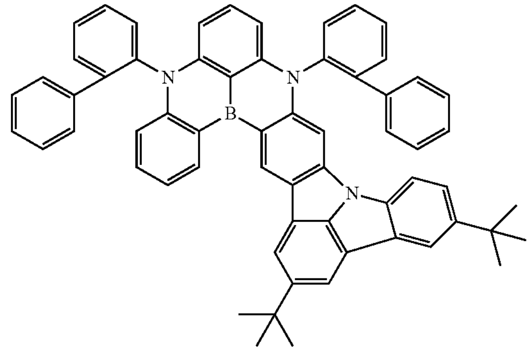

-continued
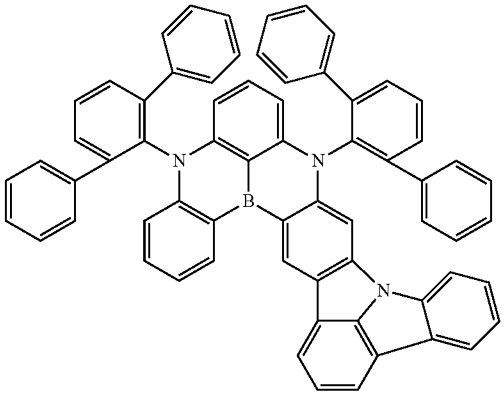
318
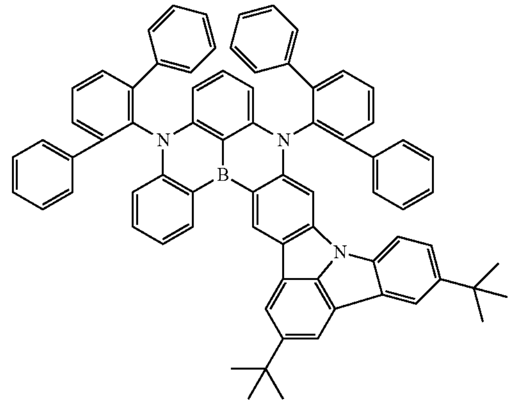
319
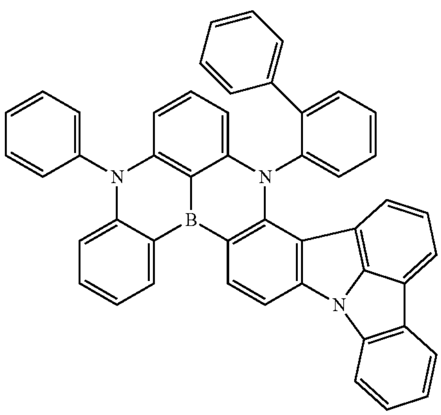
320
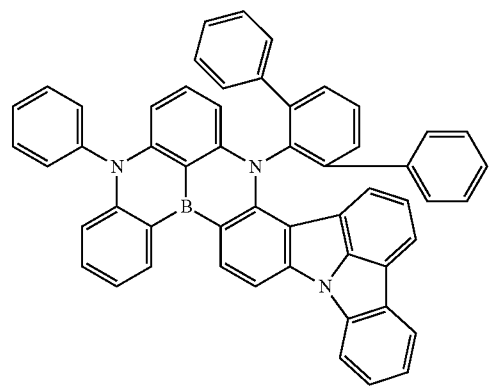
321
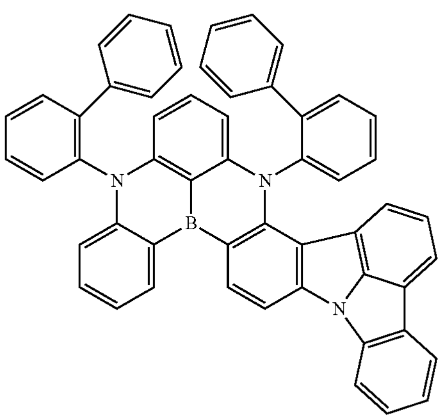
322
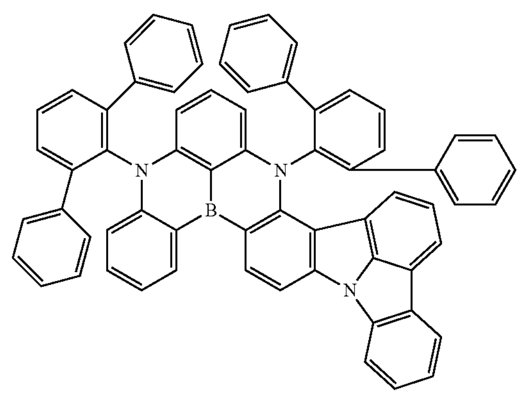
323
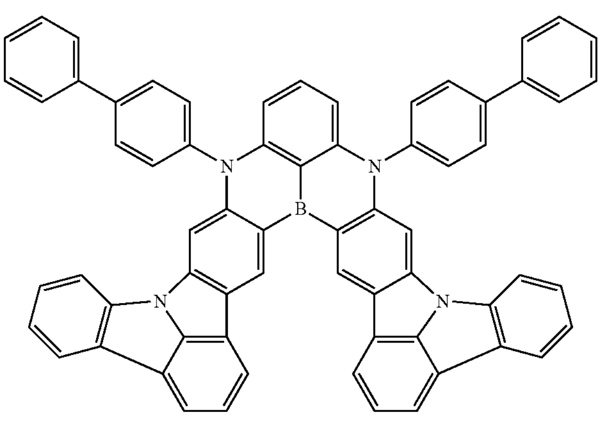
324

-continued
325
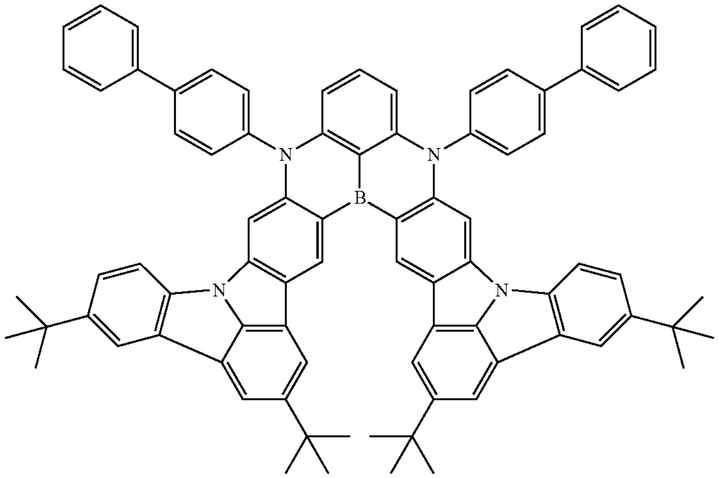
326
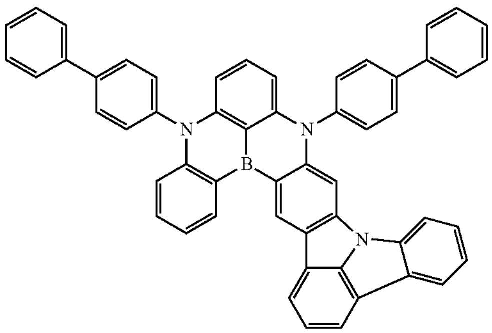
327
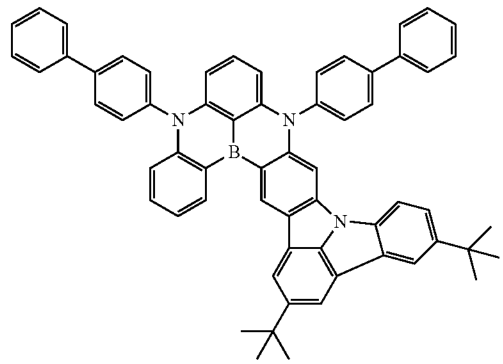
328
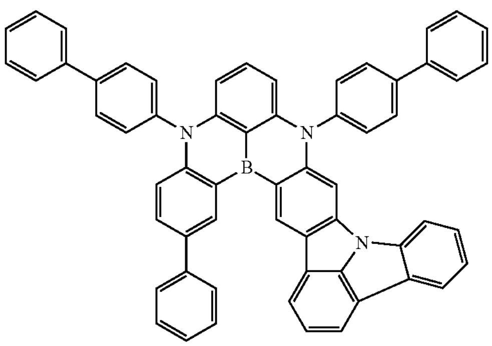
329
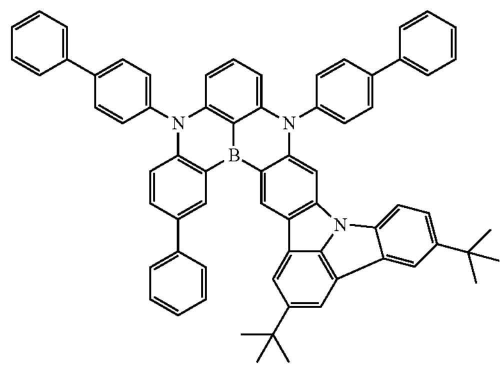
330
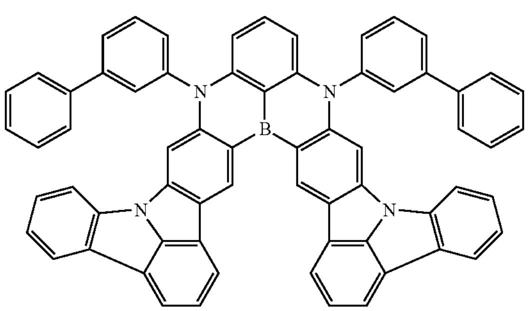
331
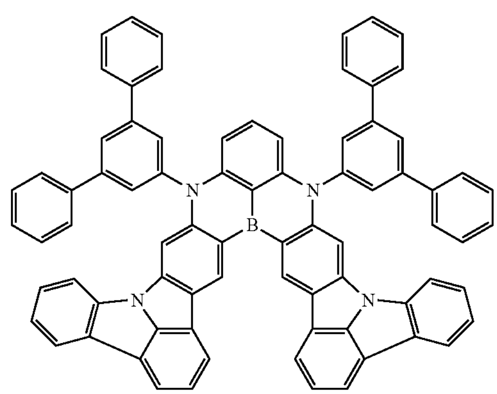

-continued
332
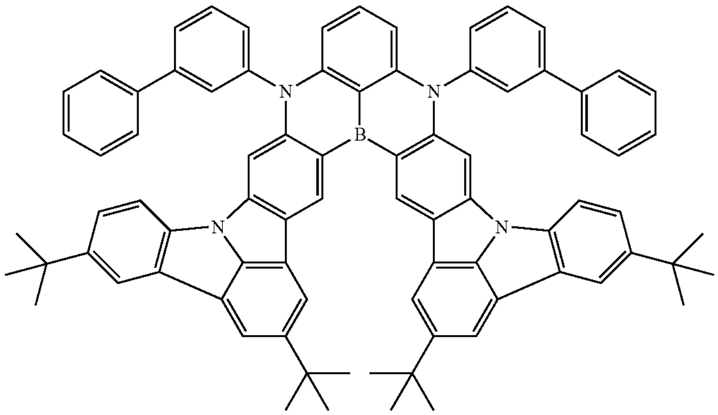
333
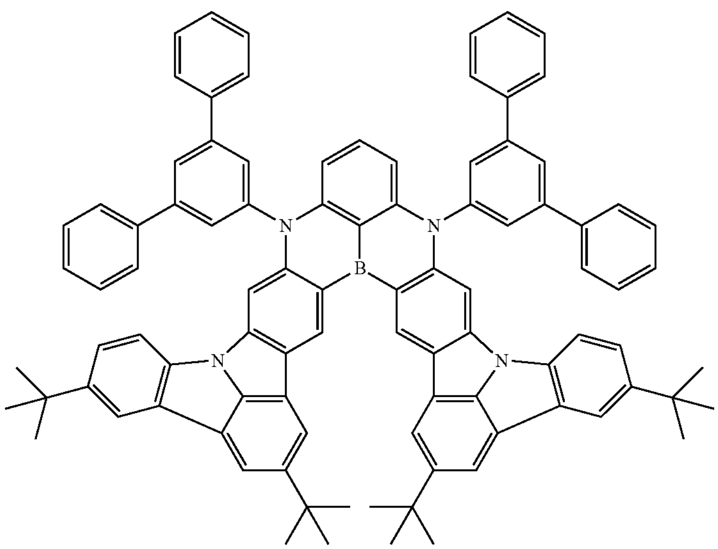
334
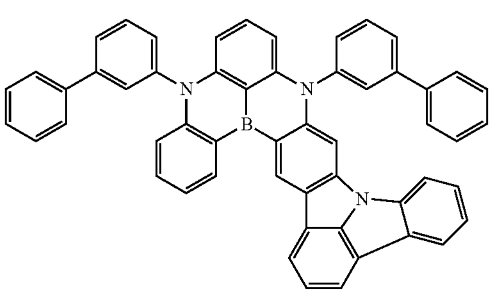
335
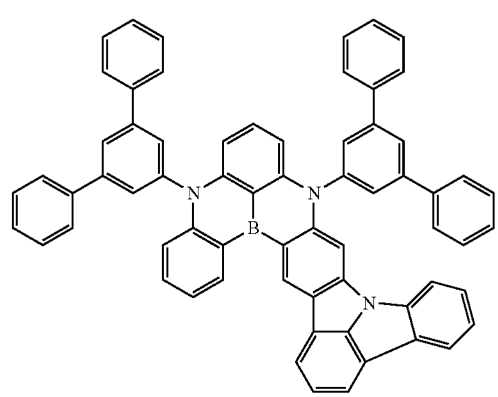

-continued
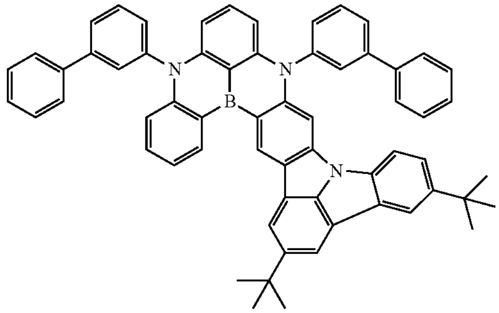
336
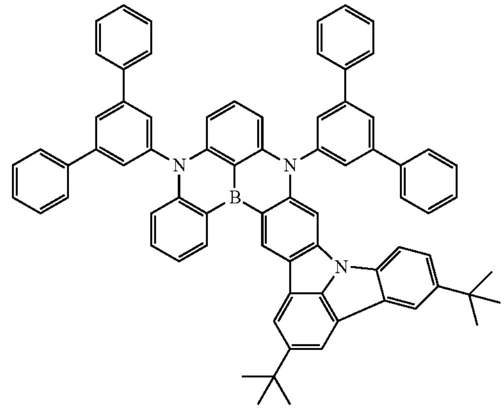
337
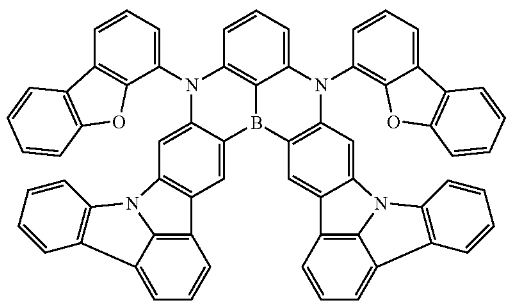
338
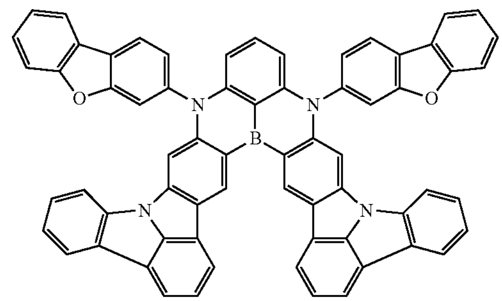
339
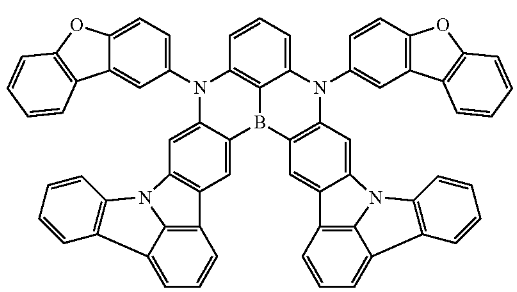
340
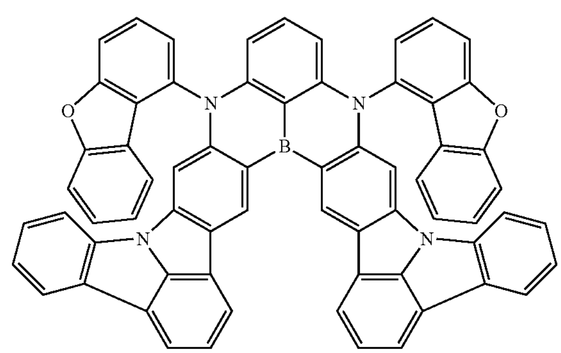
341
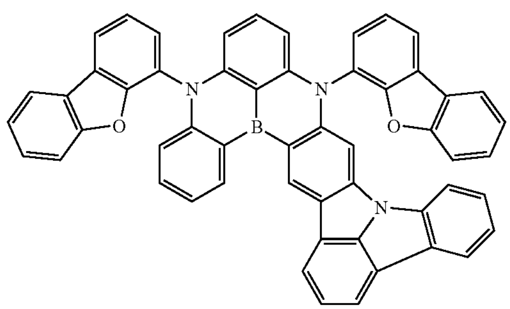
342
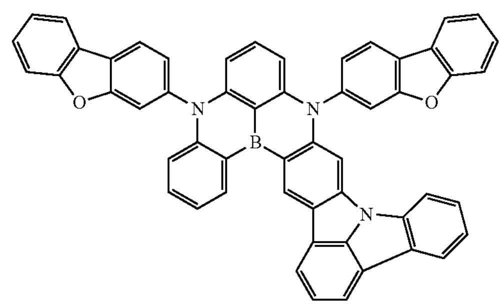
343

-continued
344
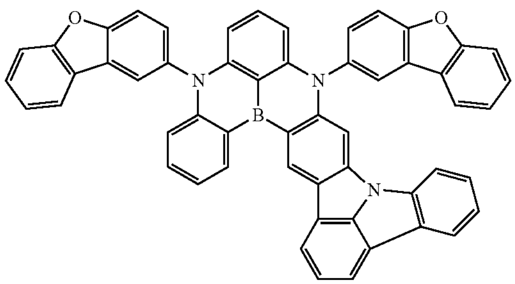
345
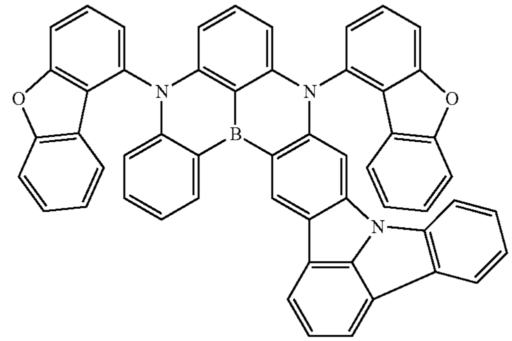
346
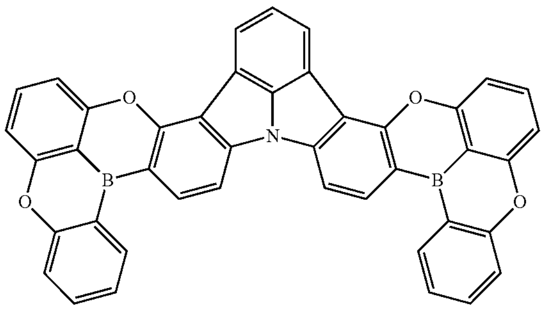
347
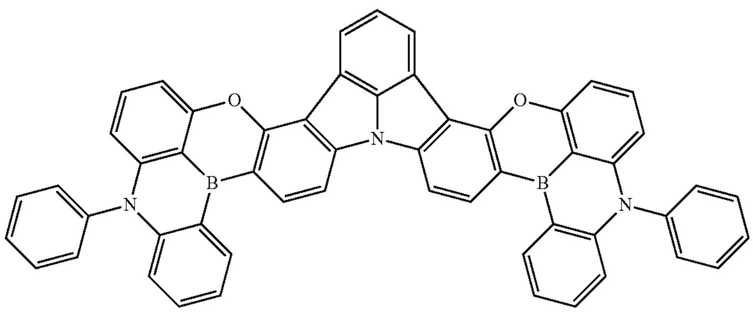
348
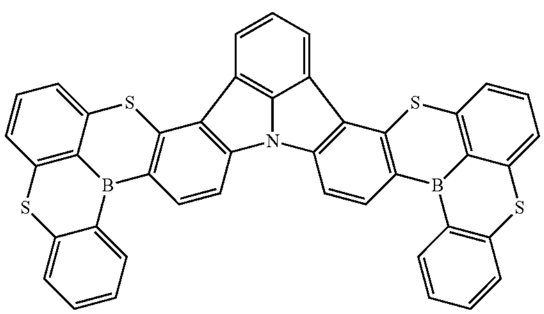
349
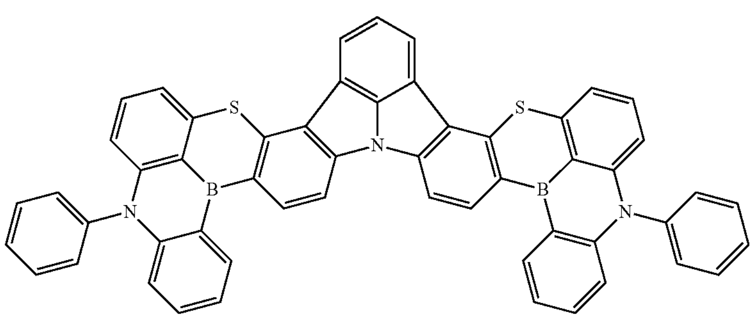

-continued
350
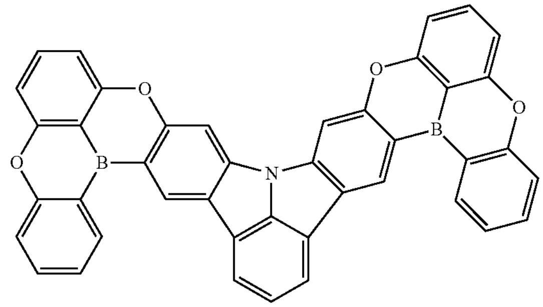
351
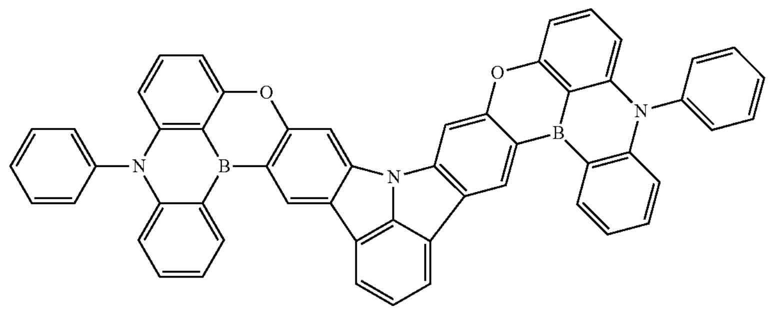
352
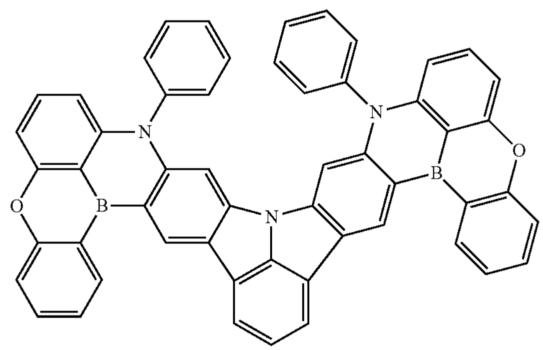
353
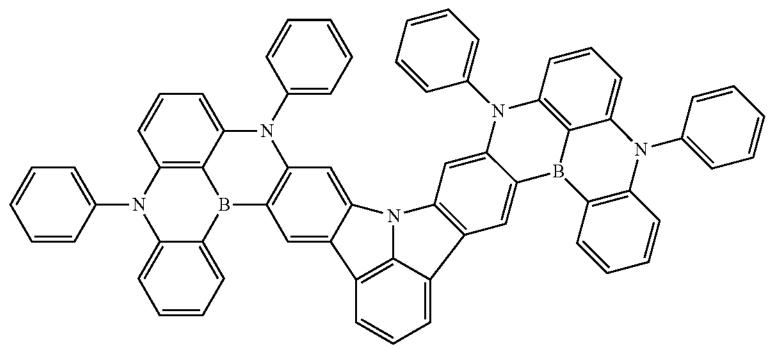
354
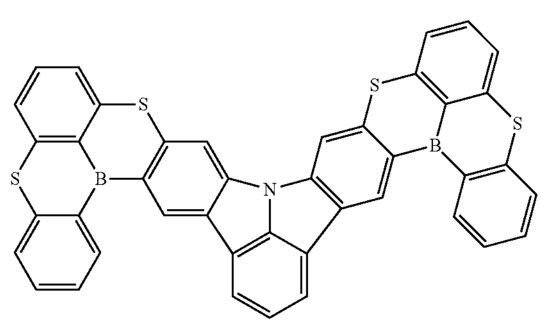

-continued
355
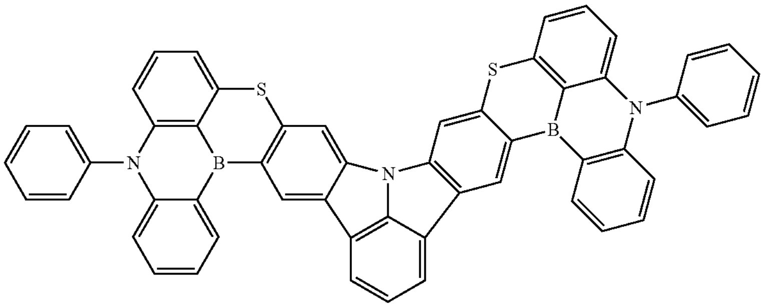
356
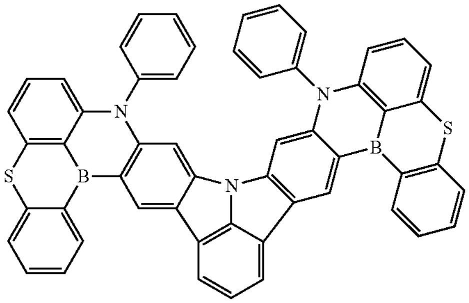
357
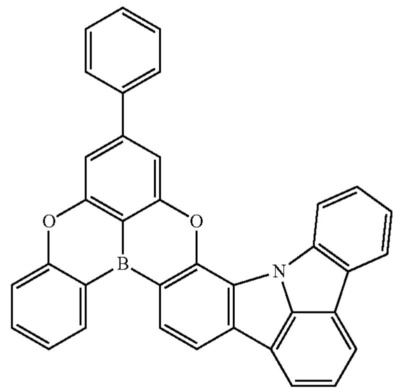
358
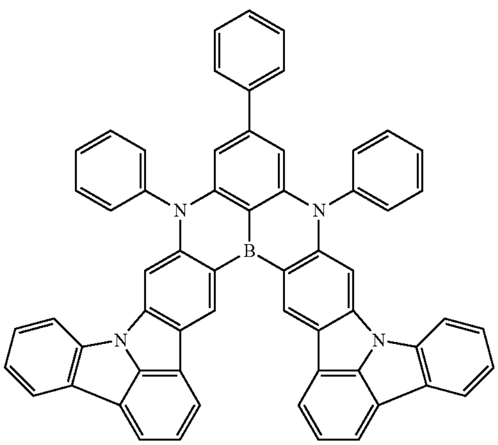
359
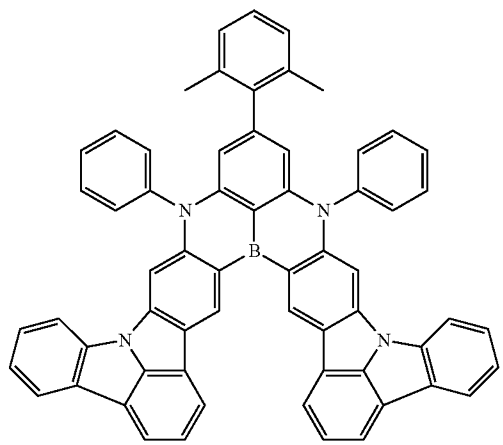
360
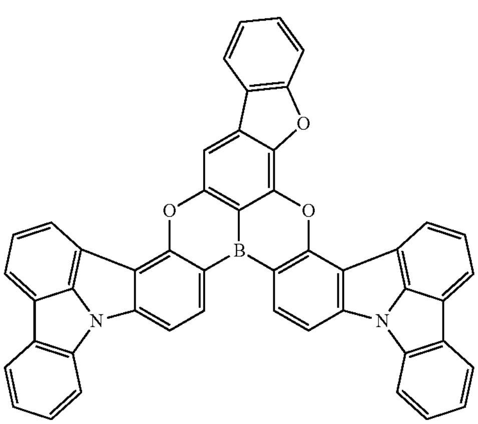
361
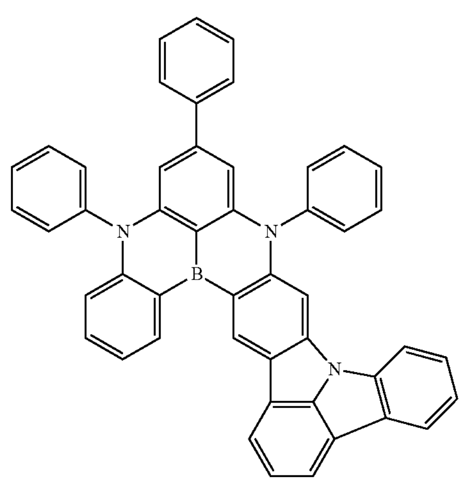

-continued
362
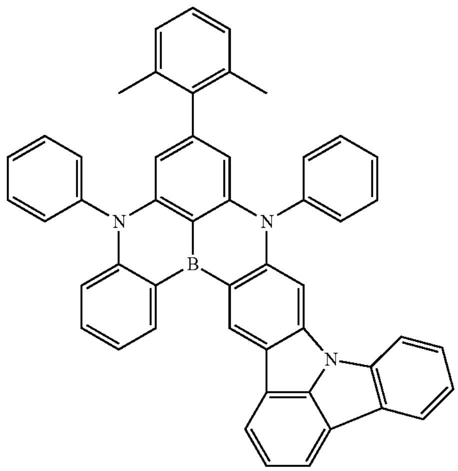
363
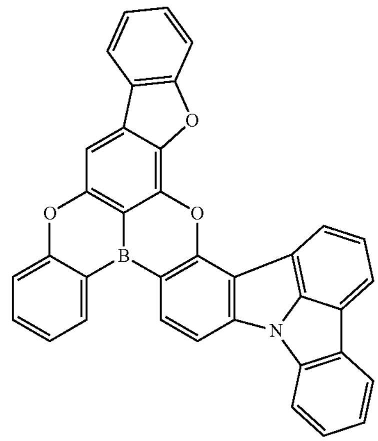
364
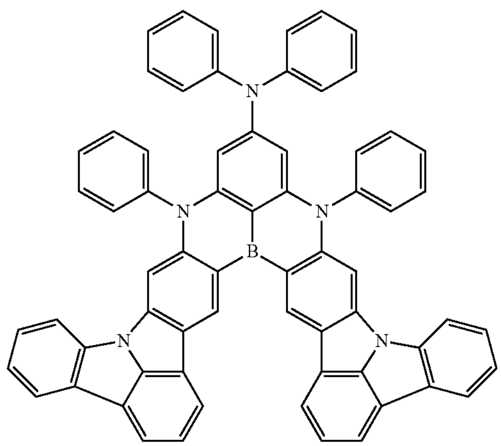
365
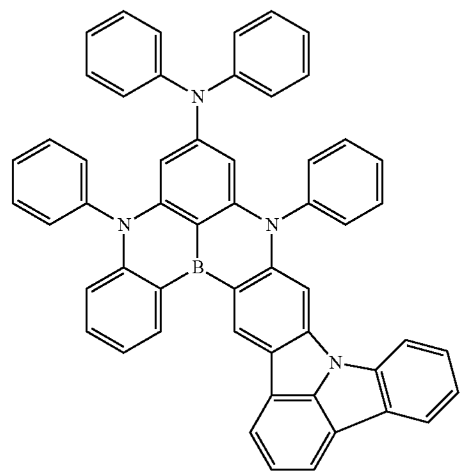
366
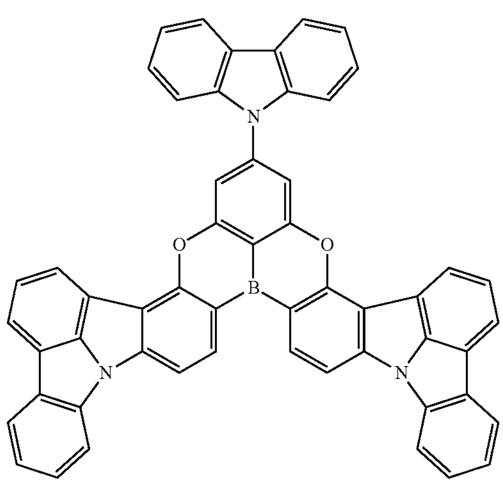
367
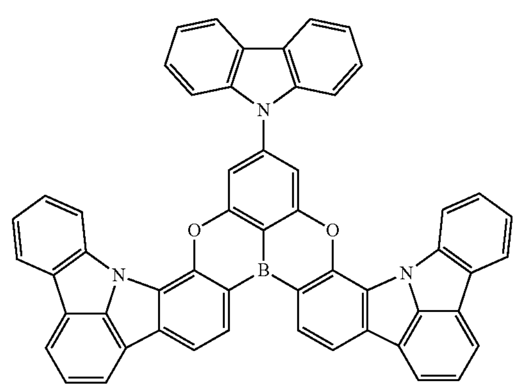

-continued
368
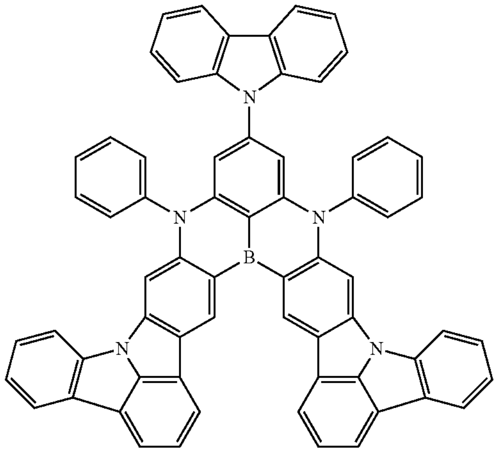
369
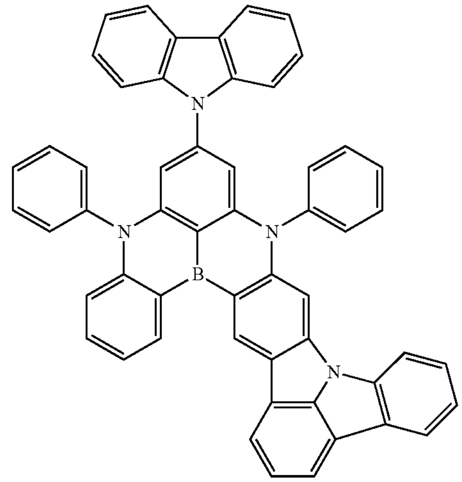
401
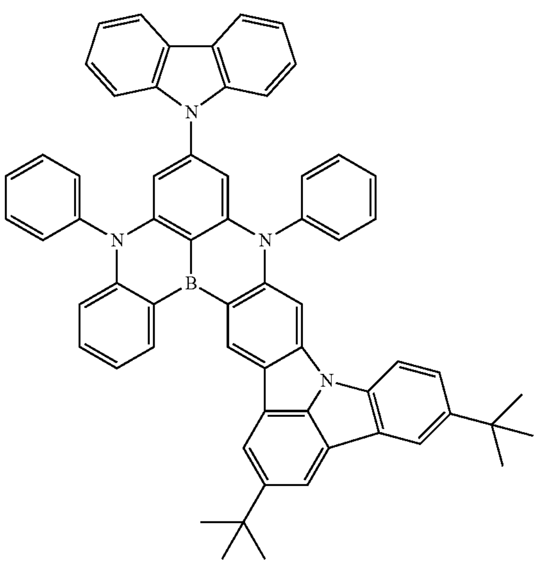
402
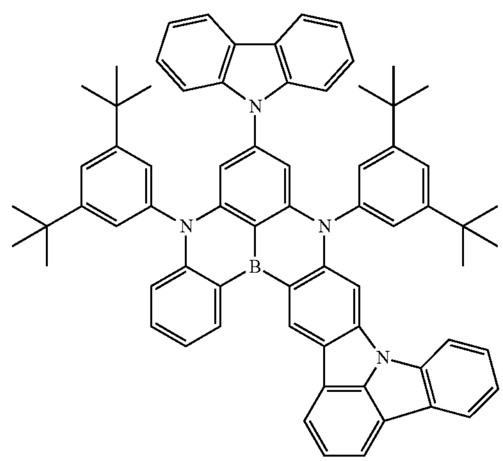
403
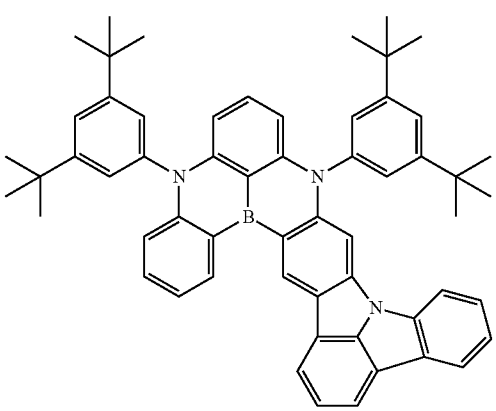
404
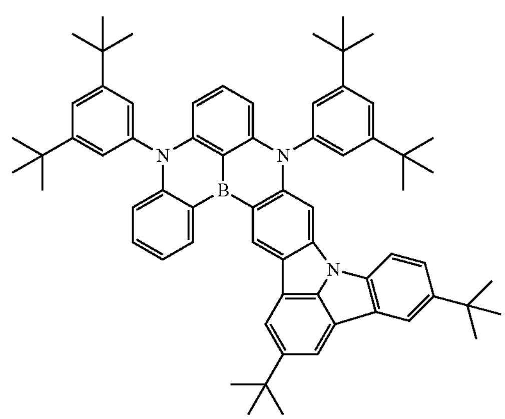

-continued
405
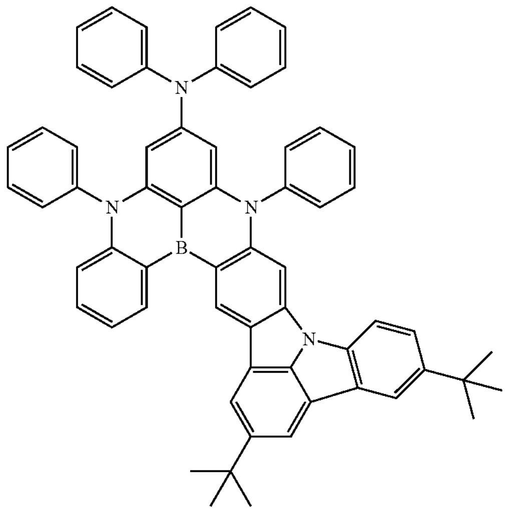
406
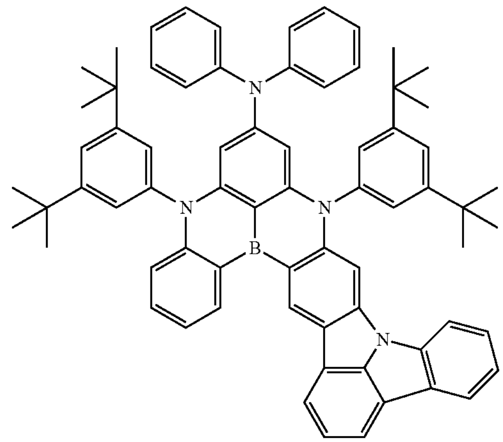
407
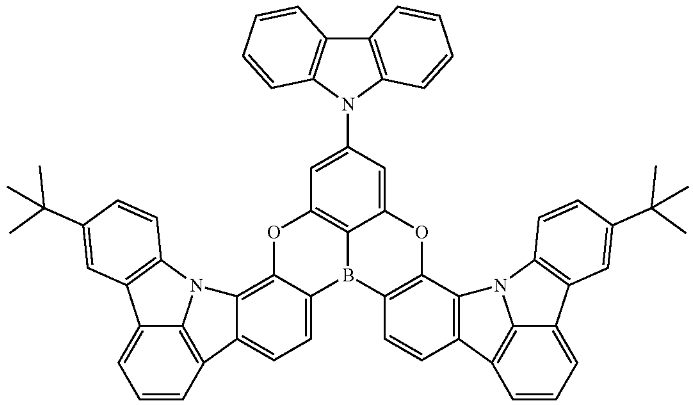
408
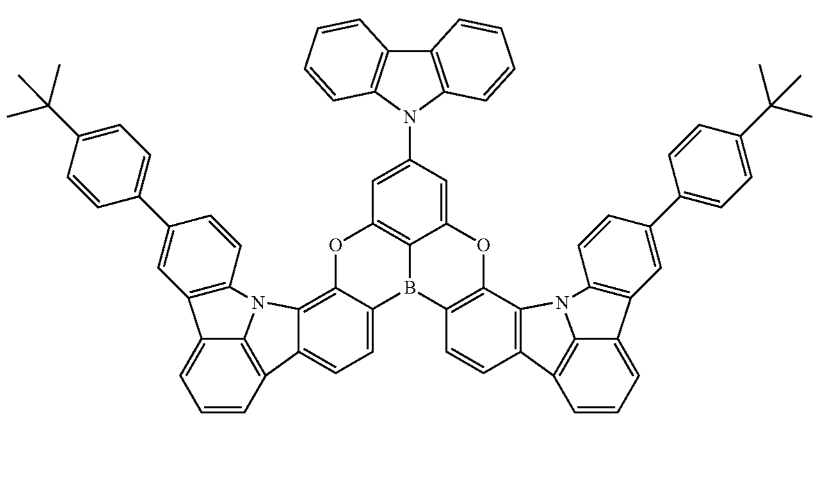

-continued
409
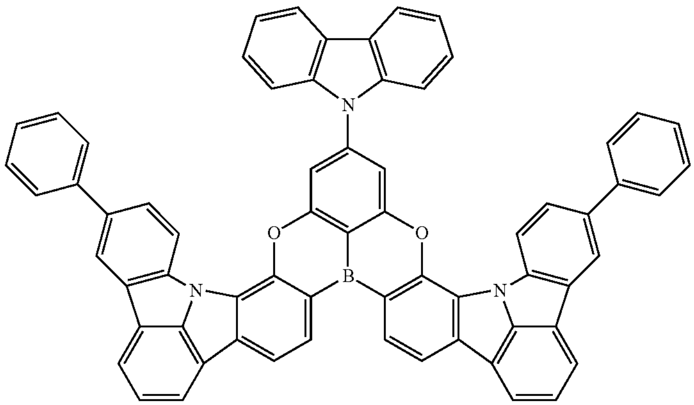
410
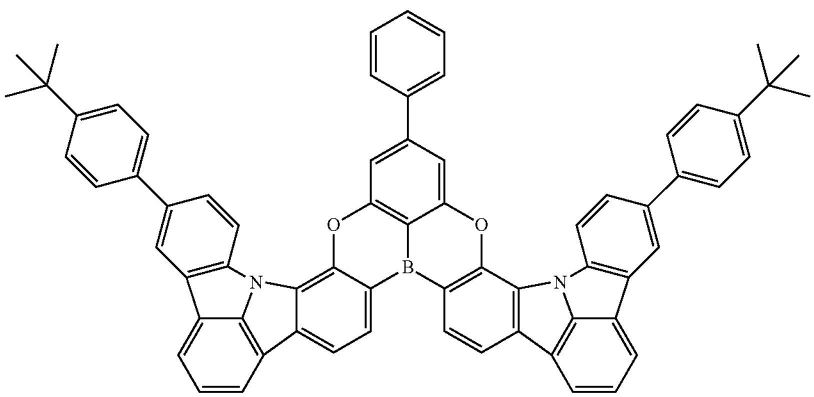
411
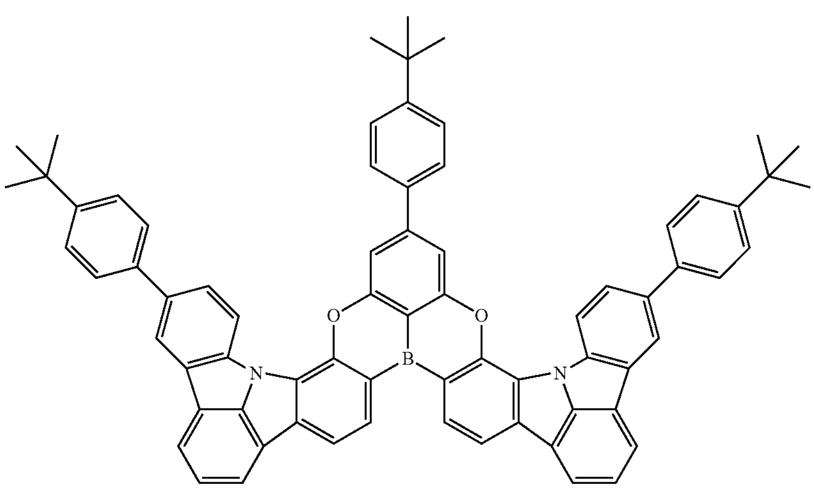

-continued
412
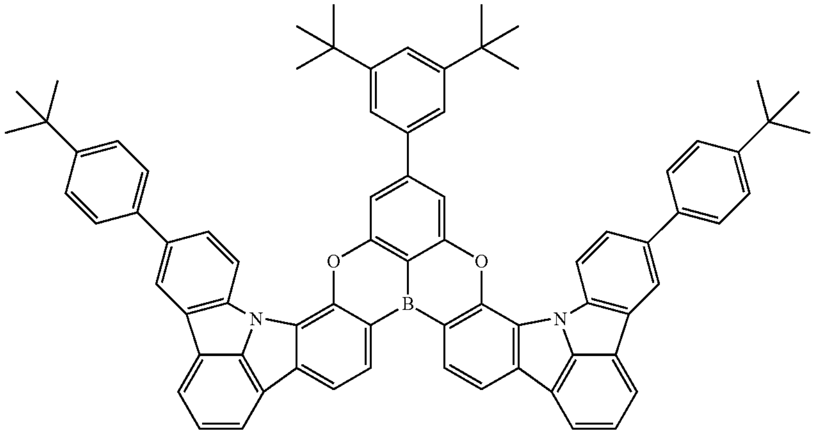
413
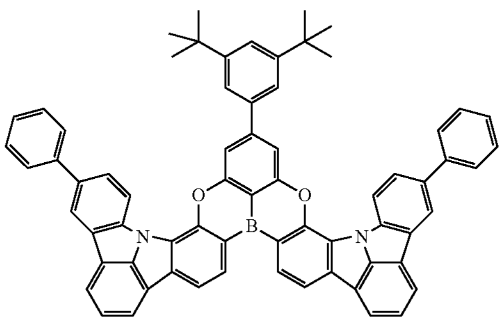
501
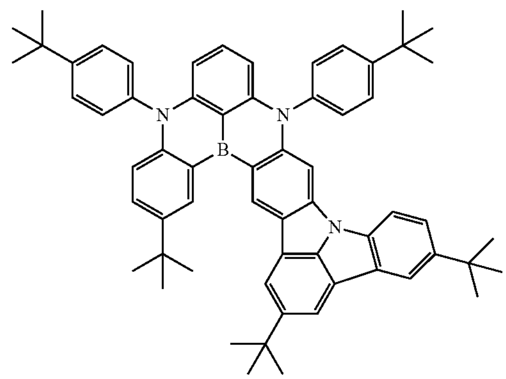
502
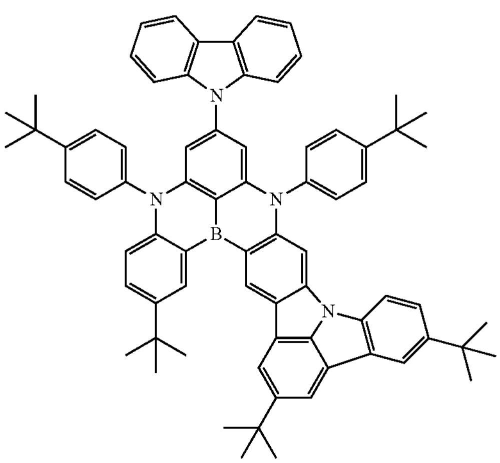
503
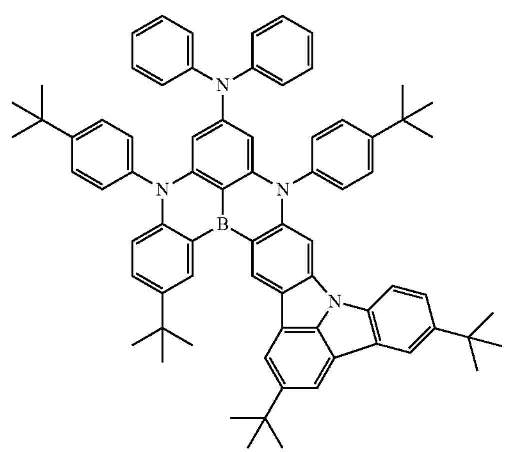

-continued
504
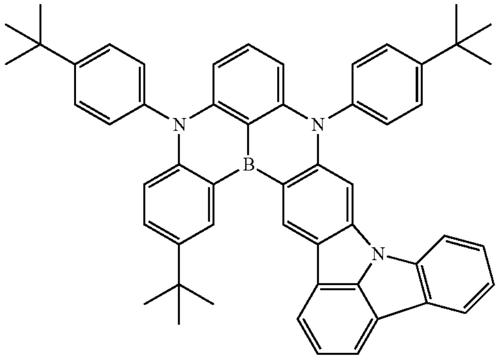
505
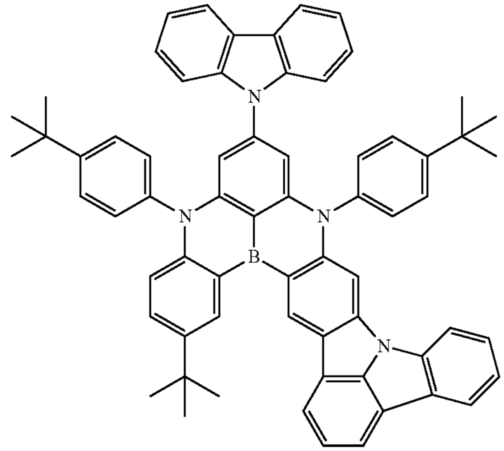
506
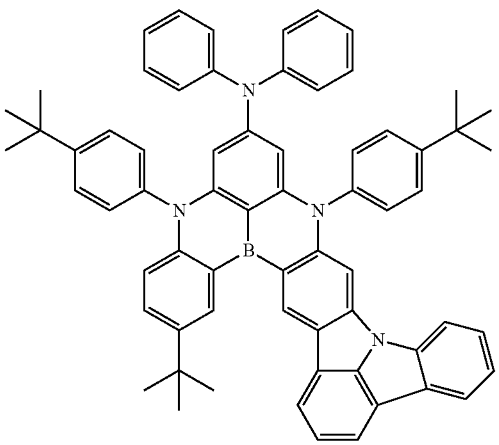
507
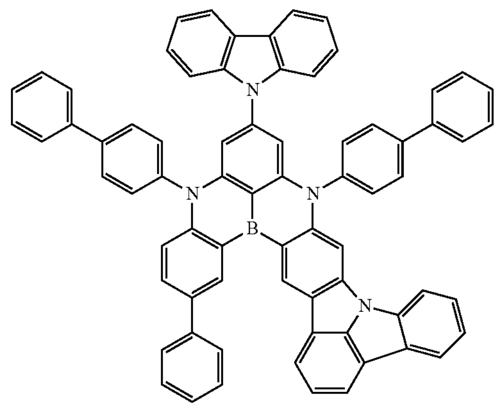
508
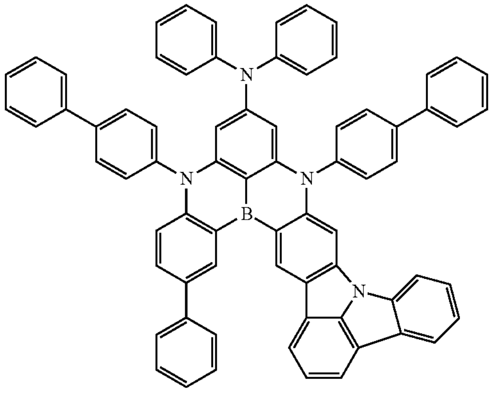
509
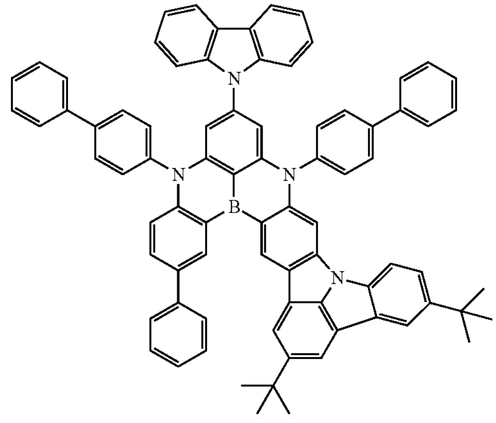

-continued
510
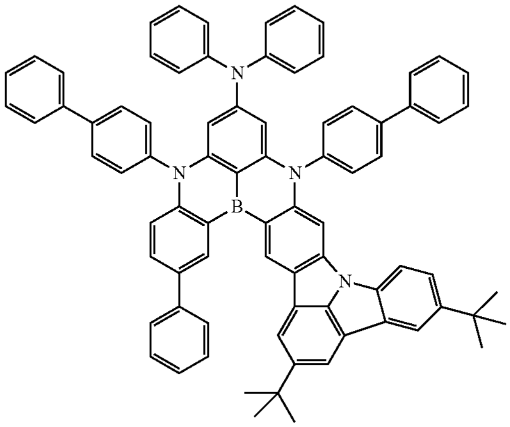
511
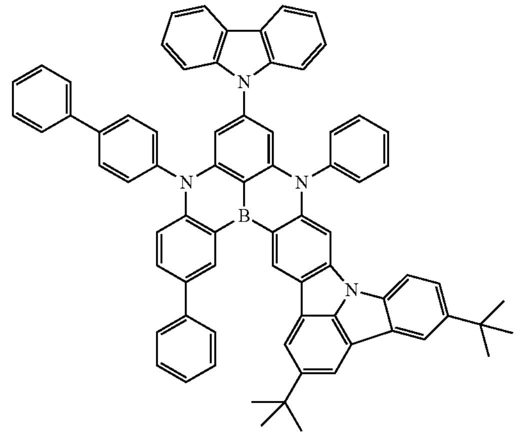
512
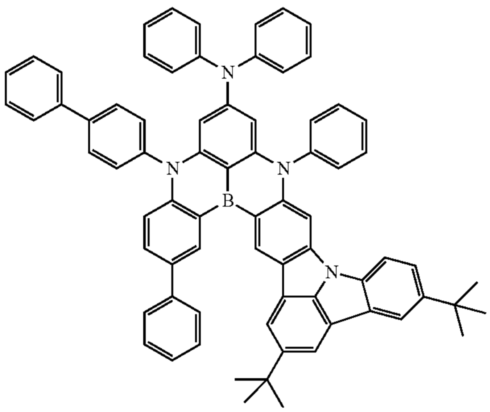
513
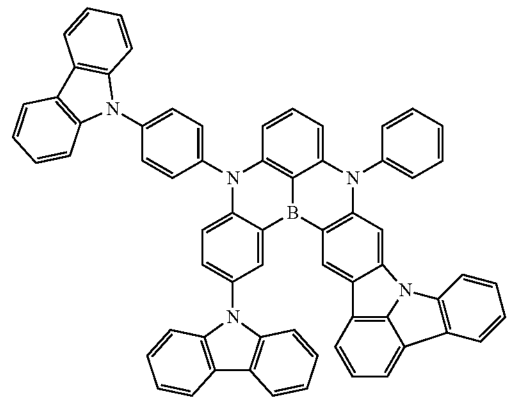
514
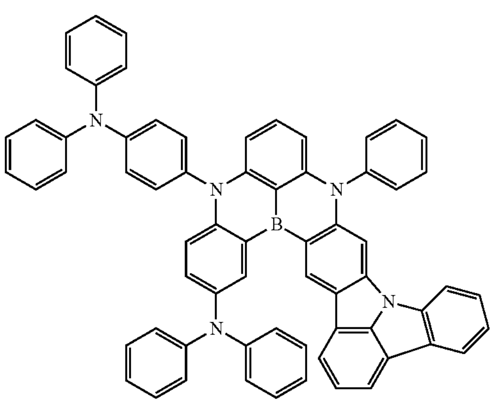
515
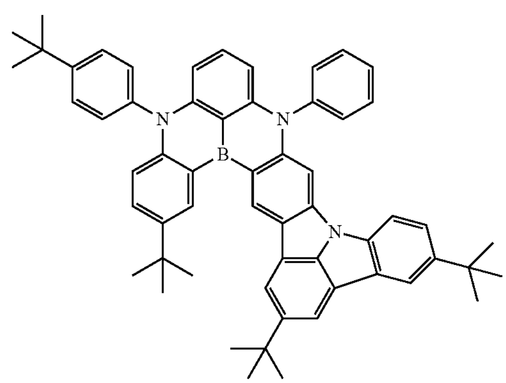

-continued
516
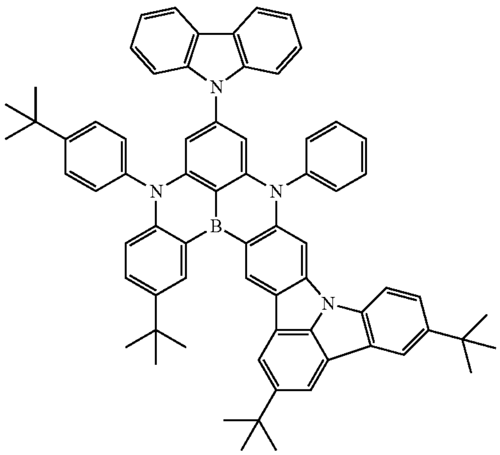
517
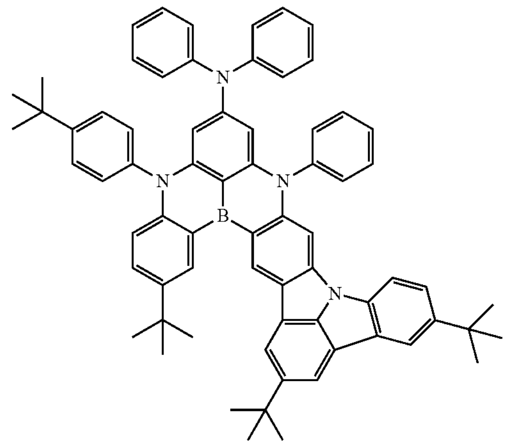
518
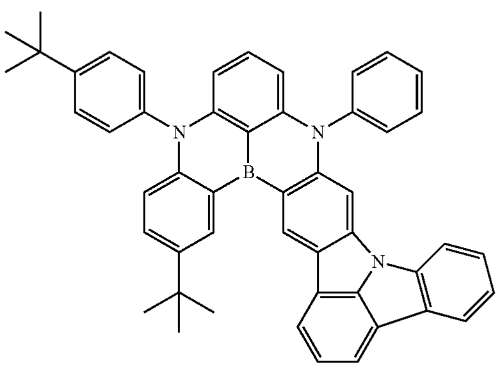
519
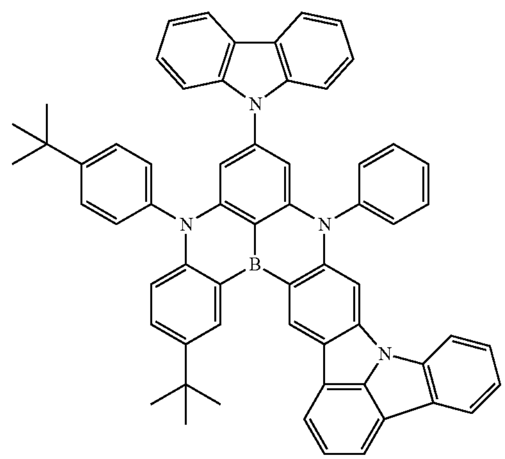
520
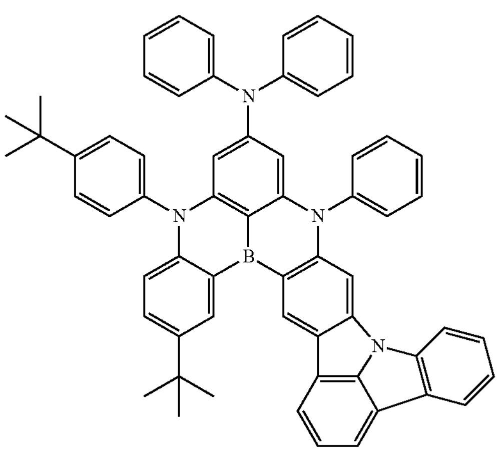
521
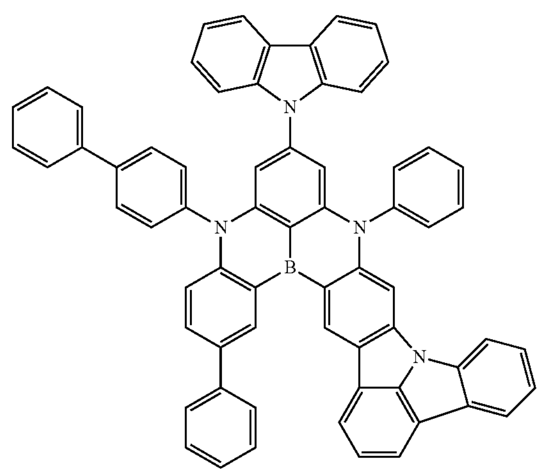

-continued
522
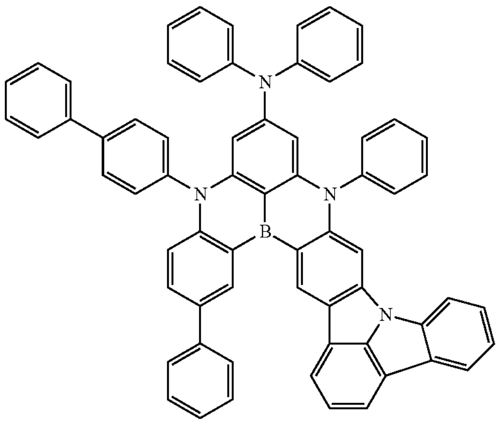
523
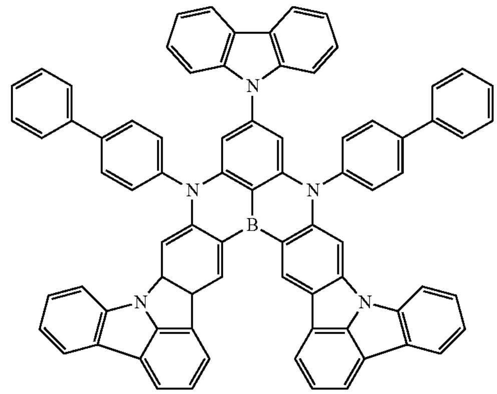
524
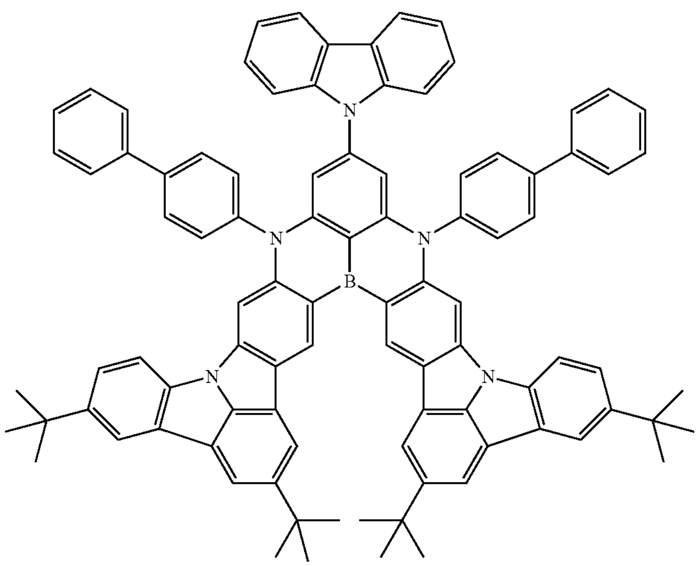
525
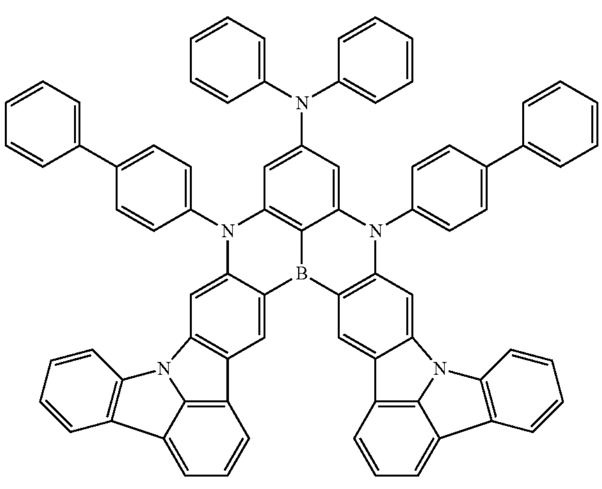

-continued
526
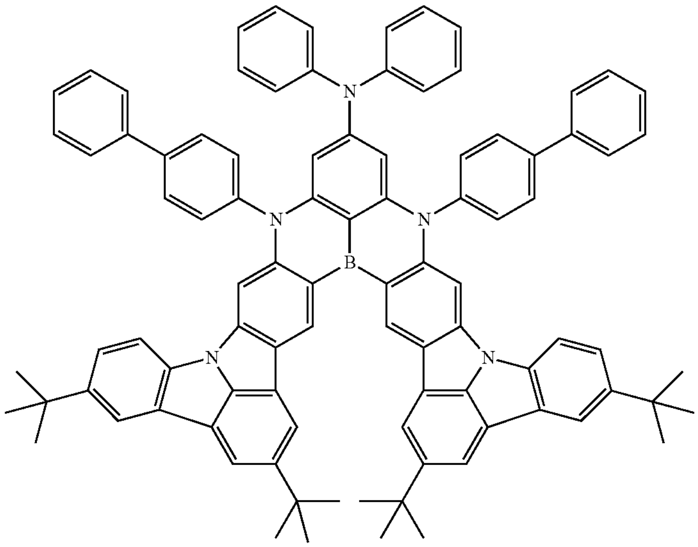
527
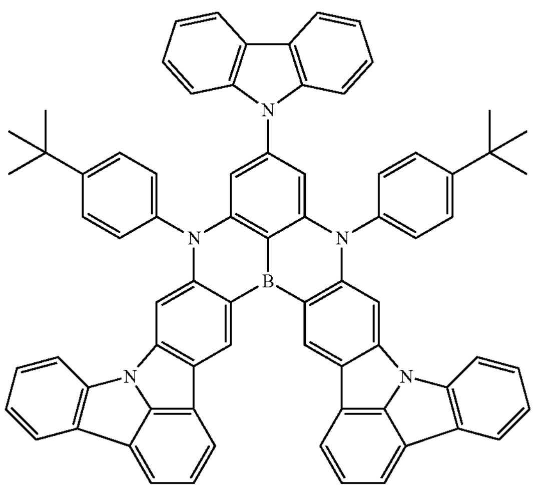
528
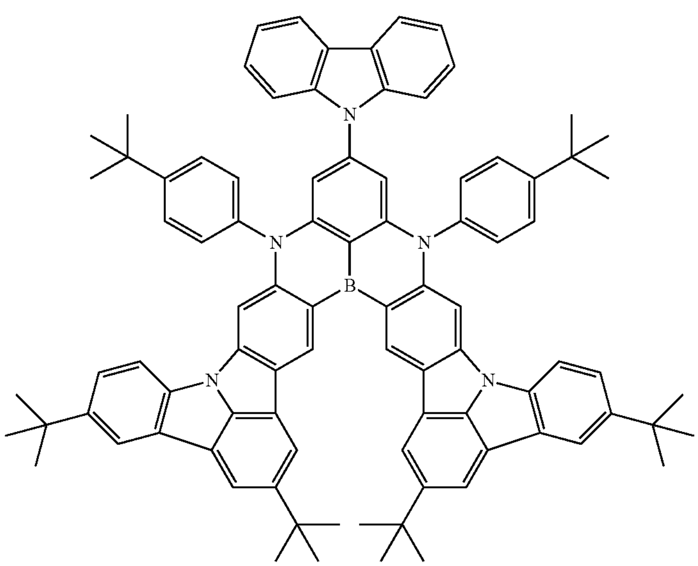

-continued
529
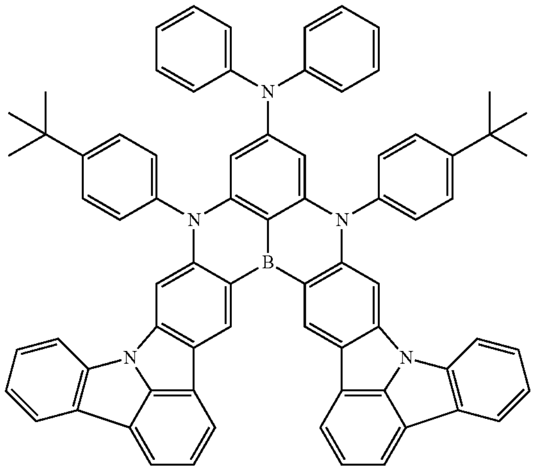
530
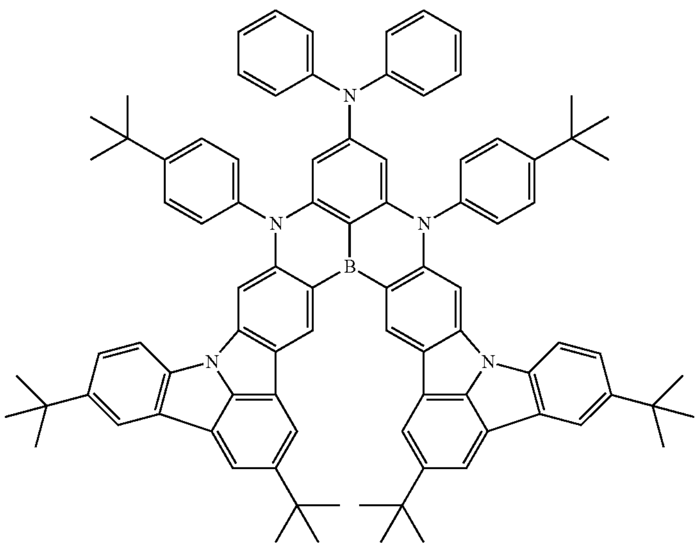
531
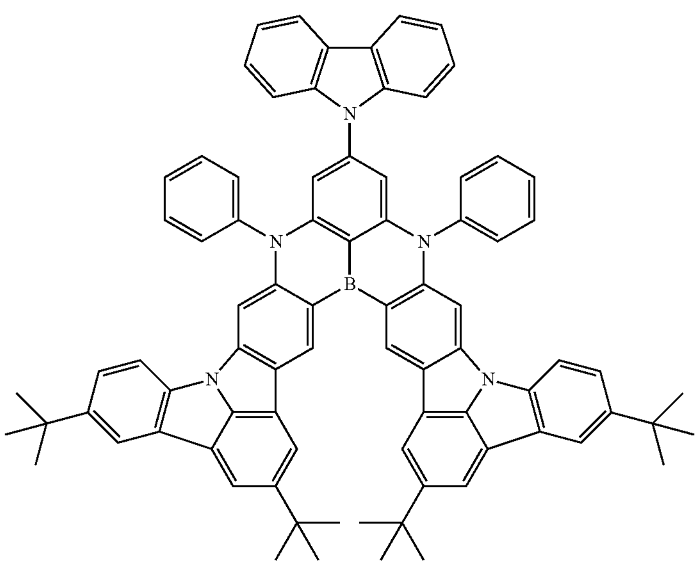

-continued

532

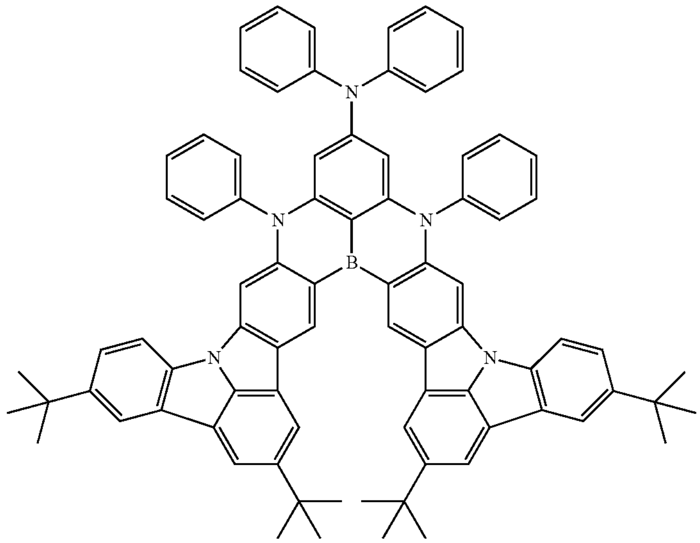

In Compounds 1 to 102, 201 to 203, 301 to 369, 401 to 413, and 501 to 532, Ph indicates a phenyl group.

In the present specification, the term "$R_{10a}$" may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S$(=O)_2$ $(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O) 2 $(Q_{21})$, —P(=O)$(Q_{21})(Q_{22})$, or any combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S$(=O)_2$ $(Q_{31})$, or —P(=O)$(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The condensed cyclic compound represented by Formula 1-1 or 1-2 of the present disclosure has a nitrogen atom (N) having an electron-donating property and a boron atom (B) having an electron-accepting property. In this regard, the multiple resonance between the atoms may be further activated so that the compound may have a structure in which the delocalization of electrons in the molecule is expanded. Also, in addition to such an electronic effect by the arrangement, the compound is also structurally stable so that the molecular structure change between the ground state ($S_0$) and the first excited singlet state ($S_1$), which causes broadening of the emission spectrum, may be suppressed. As a result, the condensed cyclic compound may emit light having high color purity with a narrow spectrum, in particular, blue light emission having high purity with a narrow spectrum.

In addition, the condensed cyclic compound may include at least one partial structure represented by Formula 2-1 or 2-2. Accordingly, the electronic effect by the arrangement also contributes to further increasing the oscillator strength (f) (hereinafter, also referred to as "oscillator strength f") of the stable structure in the first excited singlet state ($S_1$), which is an index of fluorescence strength, thereby realizing sufficient luminescence efficiency along with high color purity.

Therefore, a light-emitting device, e.g., an organic light-emitting device, using the condensed cyclic compound represented by Formula 1-1 or 1-2 may have a low driving voltage, high maximum quantum efficiency, high efficiency, and a long lifespan.

Synthesis methods of the condensed cyclic compound represented by Formula 1-1 or 1-2 may be recognized by one of ordinary skill in the art by referring to Examples provided below.

At least one organometallic compound represented by Formula 1-1 or 1-2 may be used in a light-emitting device (for example, an organic light-emitting device).

An aspect of the present disclosure provides a composition including at least one condensed cyclic compound.

In an embodiment, the composition may further include a solvent.

In an embodiment, the solvent may have a boiling point of 100° C. or more and 350° C. or less at atmospheric pressure (101.3 kPa, 1 atm).

In an embodiment, the boiling point of the solvent at atmospheric pressure may be 150° C. or more and 320° C. or less, for example, 180° C. or more and 300° C. or less.

When the boiling point of the solvent at atmospheric pressure is within these ranges, a wet film-forming method, particularly in terms of film formability or processability in the inkjet method, may be improved.

The solvent having a boiling point of 100° C. or more and 350° C. or less is not particularly limited, and any well-known solvent may be used suitably. A list of solvents having a boiling point of 100° C. or more and 350° C. or less at atmospheric pressure is provided below, but embodiments of the present disclosure are not limited thereto.

Examples of a hydrocarbon-based solvent are octane, nonane, decane, undecane, dodecane, and the like. Examples of an aromatic hydrocarbon-based solvent are toluene, xylene, ethylbenzene, n-propylbenzene, iso-propylbenzene (1-butylbenzoate), and the like. Examples of a nitrile-based solvent are benzonitrile, 3-methylbenzonitrile, and the like. Examples of an amide-based solvent are dimethylformamide, dimethylacetamide, N-methylpyrrolidone, and the like. These solvents may be used alone or in combination of two or more types.

Another aspect of the present disclosure provides a light-emitting device including: a first electrode; a second electrode facing the first electrode; an interlayer arranged between the first electrode and the second electrode and including an emission layer; and at least one condensed cyclic compound.

In an embodiment, the first electrode may be an anode, the second electrode may be a cathode, and the interlayer may further include a hole transport region between the first electrode and the emission layer and an electron transport region between the emission layer and the second electrode, wherein the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the emission layer may include the at least one condensed cyclic compound.

In an embodiment, the emission layer may include a host and a dopant, wherein the host and the dopant may be different from each other, an amount of the host may be greater than that of the dopant, and the dopant may include the at least one condensed cyclic compound.

In an embodiment, the emission layer may further include a sensitizer.

In an embodiment, the sensitizer may be an organometallic compound. For example, the sensitizer may be an organometallic compound including Pt as a central metal, but is not limited thereto. More details for the sensitizer are the same as described herein.

In an embodiment, the emission layer may further include a host and a light-emitting dopant, and the at least one condensed cyclic compound may be a sensitizer. Here, the amount of the host in the emission layer may be greater than the total amount of the light-emitting dopant and the sensitizer. The host will be described in detail. When the condensed cyclic compound is used as a sensitizer, the energy transferred to the triplet may cross inversely to the singlet, and then the singlet energy of the condensed cyclic compound may be transferred to the dopant through the Förster energy transfer. Accordingly, the efficiency and lifespan of an organic light-emitting device may be improved at the same time.

In an embodiment, the emission layer may emit blue light or blue-green light.

In an embodiment, the emission layer may emit light having a maximum emission wavelength in a range of about 400 nm to about 500 nm.

The expression "(an interlayer) includes at least one condensed-cyclic compound" as used herein may include a case in which "(an interlayer) includes identical condensed cyclic compounds represented by Formula 1-1 or 1-2 or a case in which "(an interlayer) includes two or more different condensed cyclic compounds represented by Formula 1-1 or 1-2".

For example, the interlayer may include, as the condensed cyclic compound, only Compound 1. In this embodiment, Compound 1 may be included in the emission layer of the organic light-emitting device. In one or more embodiments, the interlayer may include, as the condensed cyclic compound, Compound 1 and Compound 2. In this regard, Compound 1 and Compound 2 may exist in an identical layer (for example, Compound 1 and Compound 2 may all exist in the emission layer), or may exist in different layers (for example, Compound 1 may exist in the emission layer and Compound 2 may exist in the electron transport region).

The term "interlayer" as used herein refers to a single layer and/or all of a plurality of layers arranged between the first electrode and the second electrode of the light-emitting device.

The term "sensitizer" as used herein refers to a compound that is included in an interlayer (for example, an emission layer) and delivers excitation energy to a light-emitting dopant compound.

Another aspect of the present disclosure provides an electronic apparatus including the organic light-emitting device.

More details for the electronic apparatus are the same as described herein.

Description of FIG. 1

FIG. 1 is a schematic cross-sectional view of an organic light-emitting device 10 according to an exemplary embodiment. Hereinafter, a structure and a manufacturing method of an organic light-emitting device according to an embodiment of the present disclosure will be described in connection with FIG. 1.

The organic light-emitting device 10 of FIG. 1 includes a substrate 1, a first electrode 2, a second electrode 6 facing the first electrode 2, and an emission layer 4 between the first electrode 2 and the second electrode 6.

In the organic light-emitting device 10, a hole transport region 3 is arranged between the first electrode 2 and the emission layer 4, and an electron transport region 5 is arranged between the emission layer 4 and the second electrode 6.

Also, the substrate 1 may be additionally arranged under the first electrode 2 or above the second electrode 6. For use as the substrate 1, any substrate that is used in organic light-emitting devices available in the art may be used, and for example, a glass substrate or a transparent plastic substrate, each having excellent mechanical strength, thermal stability, transparency, surface smoothness, ease of handling, and water resistance, may be used.

First Electrode 2

The first electrode 2 may be formed by, for example, depositing or sputtering a material for forming the first electrode 2 on the substrate 1. The first electrode 2 may be an anode. The material for forming the first electrode 2 may be materials with a high work function to facilitate hole injection.

The first electrode 2 may be a reflective electrode, a semi-transmissive electrode, or a transmissive electrode. When the first electrode 2 is a transmissive electrode, the material for forming the first electrode 2 may be indium tin oxide (ITO), indium zinc oxide (IZO), tin oxide ($SnO_2$), zinc oxide (ZnO), or any combination thereof, but embodiments of the present disclosure are not limited thereto. When the first electrode 2 is a semi-transmissive electrode or a reflective electrode, the material for forming the first electrode 2 may be magnesium (Mg), silver (Ag), aluminum (Al), aluminum-lithium (Al—Li), calcium (Ca), magnesium-indium (Mg—In), magnesium-silver (Mg—Ag), or any combination thereof, but embodiments of the present disclosure are not limited thereto.

The first electrode 2 may have a single-layered structure or a multi-layered structure including two or more layers.

Emission Layer 4

The emission layer 4 may be a single layer consisting of a single material or a single layer consisting of a plurality of different materials. In addition, the emission layer 4 may have a multi-layered structure including a plurality of layers including different materials.

The emission layer 4 may include the condensed cyclic compound represented by Formula 1-1 or 1-2.

A thickness of the emission layer 4 may be in a range of about 10 Å to about 1,000 Å, for example, about 100 Å to about 300 Å. When the thickness of the emission layer 4 is within these ranges, excellent luminescence characteristics may be obtained without a substantial increase in driving voltage.

In an embodiment, the emission layer 4 of the organic light-emitting device 10 may include, in addition to the condensed cyclic compound represented by Formula 1-1 or 1-2, an anthracene derivative, a pyrene derivative, a fluoranthene derivative, a chrysene derivative, a dihydrobenzoanthracene derivative, a triphenylene derivative, or any combination thereof.

In an embodiment, the emission layer 4 of the organic light-emitting device 10 may include a host and a dopant.

In an embodiment, the host may include one kind of host. When the host includes one kind of host, the one kind of host may be a bipolar host, an electron-transporting host, a hole-transporting host, or any combination thereof, each of which will be described later.

In an embodiment, the host may have a highest occupied molecular orbital (HOMO) energy level of equal to or less than-5.2 eV and a lowest unoccupied molecular orbital (LUMO) energy level of equal to or less than-1.4 eV. By using a host material having low HOMO and LUMO energy levels and high electron transport properties, an organic light-emitting device, particularly a blue organic light-emitting device, may have advantages such as improved driving durability.

In one or more embodiments, the host may include a mixture of two types of materials different from each other. For example, the host may be a mixture of an electron-transporting host and a hole-transporting host, a mixture of two types of electron-transporting hosts different from each other, or a mixture of two types of hole-transporting hosts different from each other. The electron-transporting host and the hole-transporting host will be described in detail below.

In one or more embodiments, the host may include an electron-transporting host including at least one electron-transporting moiety and a hole-transporting host that is free of an electron-transporting moiety.

The electron-transporting moiety used herein may be a cyano group, a π electron-deficient nitrogen-containing cyclic group, or a group represented by one of the following formulae:

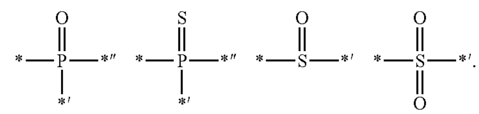

In the formulae above, *, *', and *" each indicate a binding site to a neighboring atom.

In one or more embodiments, the electron-transporting host of the emission layer 4 may include at least one of a cyano group, a π electron-deficient nitrogen-containing cyclic group, or any combination thereof.

In one or more embodiments, the electron-transporting host in the emission layer 4 may include at least one cyano group.

In one or more embodiments, the electron-transporting host in the emission layer 4 may include at least one cyano group, at least one π electron deficient nitrogen-containing cyclic group, or any combination thereof.

In one or more embodiments, the host may include an electron-transporting host and a hole-transporting host, wherein the electron-transporting host may include at least one π electron-deficient nitrogen-free cyclic group, at least one electron-transporting moiety, or any combination thereof, and the hole-transporting host may include at least one π electron-deficient nitrogen-free cyclic group, and may not include an electron-transporting moiety.

The term "π electron-deficient nitrogen-containing cyclic group" as used herein refers to a cyclic group having at least one *—N=*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group; or a condensed cyclic group in which two or more π electron-efficient nitrogen-containing cyclic groups are condensed with each other.

The π electron-deficient nitrogen-free cyclic group may be: a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a triindolobenzene group; or a condensed cyclic group of two or more π electron-deficient nitrogen-free cyclic groups, but embodiments of the present disclosure are not limited thereto.

In one or more embodiments, the electron-transporting host may be a compound represented by Formula E-1, and the hole-transporting host may be a compound represented by Formula H-1, but embodiments of the present disclosure are not limited thereto:

$$[Ar_{301}]_{xb11}\text{-}[(L_{301})_{xb1}\text{-}R_{301}]_{xb21} \quad \text{Formula E-1}$$

wherein, in Formula E-1, $Ar_{301}$ may be a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be a single bond, a group represented by one of the following formulae, a substituted or unsubstituted $C_5$-$C_{60}$ carbocyclic group, or a substituted or unsubstituted $C_1$-$C_{60}$ heterocyclic group, wherein *, *', and *" in the formulae each indicate a binding site to a neighboring atom,

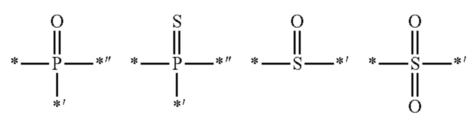

wherein, in the formulae above, xb1 may be an integer from 1 to 5, $R_{301}$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$ ($Q_{301}$), —S(=O)($Q_{301}$), —P(=O)($Q_{301}$)($Q_{302}$), or —P(=S)($Q_{301}$)($Q_{302}$), xb21 may be an integer from 1 to 5, $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, and at least one of Conditions H-1 to H-3 may be satisfied:

Condition H-1

$Ar_{301}$, $L_{301}$, and $R_{301}$ in Formula E-1 may each independently include a π electron-deficient nitrogen-containing cyclic group;

Condition H-2

$L_{301}$ in Formula E-1 is a group represented by one of the following formulae; and

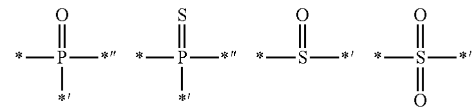

Condition H-3

$R_{301}$ in Formula E-1 may be a cyano group, —S(=O)$_2$($Q_{301}$), —S(=O)($Q_{301}$), —P(=O)($Q_{301}$)($Q_{302}$), and —P(=S)($Q_{301}$)($Q_{302}$), $$Ar_{401}\text{-}(L_{401})_{xd1}\text{-}(Ar_{402})_{xd11} \quad \text{Formula H-1}$$

Formula 11

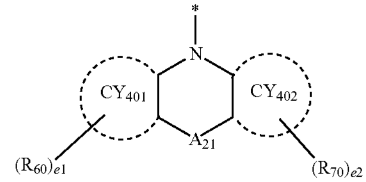

Formula 12

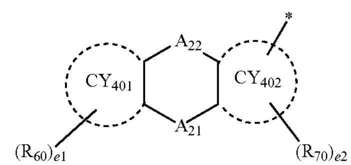

wherein, in Formulae H-1, 11, and 12, $L_{401}$ may be:

a single bond; or a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with at least one of deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si($Q_{401}$)($Q_{402}$)($Q_{403}$), xd1 may be an integer from 1 to 10, wherein, when xd1 is 2 or more, two or more of $L_{401}$(s) may be identical to or different from each other, $Ar_{401}$ may be a group represented by Formulae 11 or 12, $Ar_{402}$ may be:

a group represented by Formulae 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each substituted with at least one deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, a triphenylenyl group, or any combination thereof, $CY_{401}$ and $CY_{402}$ may each independently be a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ may be a single bond, O, S, $N(R_{51})$, $C(R_{51})(R_{52})$, or $Si(R_{51})(R_{52})$, $A_{22}$ may be a single bond, O, S, $N(R_{53})$, $C(R_{53})(R_{54})$, or $Si(R_{53})(R_{54})$, at least one of $A_{21}$, $A_{22}$, or any combination thereof in Formula 12 may not be a single bond, $R_{51}$ to $R_{54}$, $R_{60}$, and $R_{70}$ may each independently be:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, or any combination thereof;

a π electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group);

a π electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group), each substituted with at least one deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, or any combination thereof; or $Si(Q_{404})(Q_{405})(Q_{406})$, e1 and e2 may each independently be an integer from 0 to 10, $Q_{401}$ to $Q_{406}$ may each independently be hydrogen, deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to a neighboring atom.

In an embodiment, $Ar_{301}$ and $L_{301}$ in Formula E-1 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, at least one of the $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl) pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, $R_{301}$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano-containing phenyl group, a cyano-containing biphenyl group, a cyano-containing terphenyl group, a cyano-containing tetraphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the present disclosure are not limited thereto.

In one or more embodiments, $Ar_{301}$ may be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$). or any combination thereof; or a group represented by one of Formulae 5-1 to 5-3 and 6-1 to 6-33, and $L_{301}$ may be a group represented by one of Formulae 5-1 to 5-3 and 6-1 to 6-33:

5-1

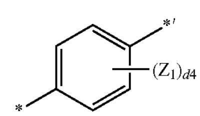

5-2

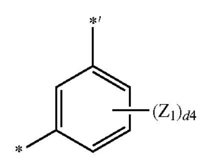

5-3

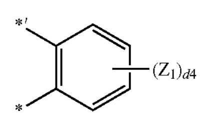

6-1

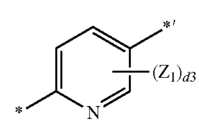

6-2

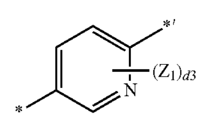

6-3

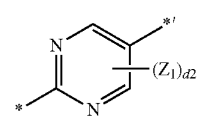

6-4

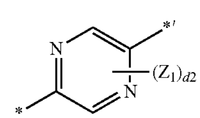

-continued
6-5
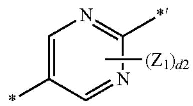
6-6
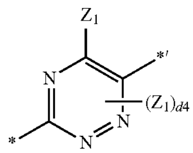
6-7
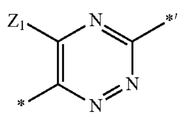
6-8
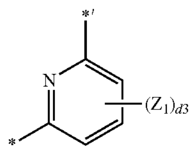
6-9
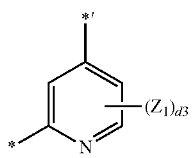
6-10
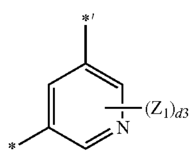
6-11
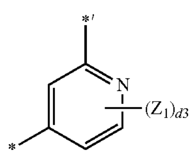
6-12
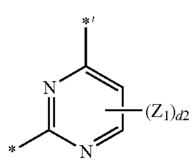
6-13
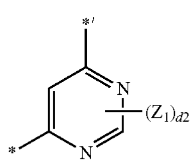
6-14
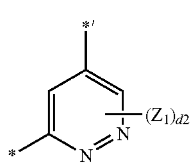
-continued
6-15
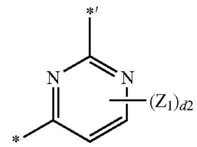
6-16
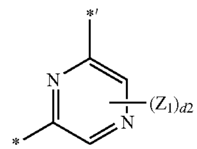
6-17
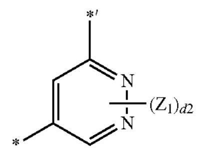
6-18
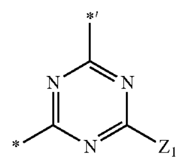
6-19
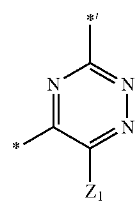
6-20
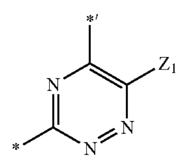
6-21
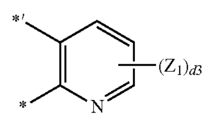
6-22
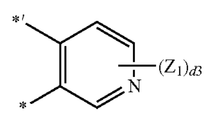
6-23
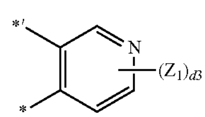
6-24
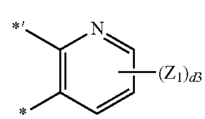
6-25
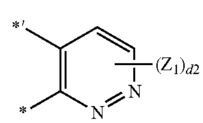

-continued 6-26

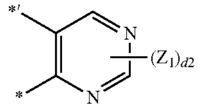

6-27

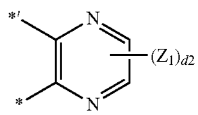

6-28

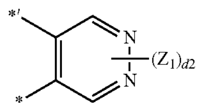

6-29

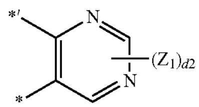

6-30

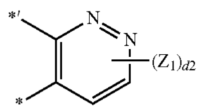

6-31

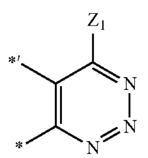

6-32

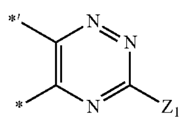

6-33

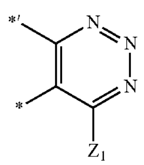

wherein, in Formulae 5-1 to 5-3 and 6-1 to 6-33, $Z_1$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, d4 may be 0, 1, 2, 3, or 4, d3 may be 0, 1, 2, or 3, d2 may be 0, 1, or 2,

* and *' each indicate a binding site to a neighboring atom, and $Q_{31}$ to $Q_{33}$ may each be the same as described above.

In one or more embodiments, $L_{301}$ may be a group represented by one of Formulae 5-2, 5-3, and 6-8 to 6-33.

In one or more embodiments, $R_{301}$ may be a cyano group or a group represented by one of Formula 7-1 to 7-18, and at least one of the $Ar_{402}$(s) in the number of xd11 may be a group represented by one of Formulae 7-1 to 7-18, but embodiments of the present disclosure are not limited thereto:

7-1

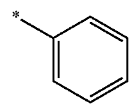

7-2

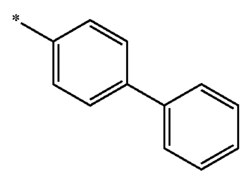

7-3

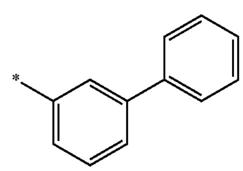

7-4

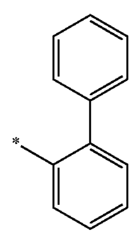

7-5

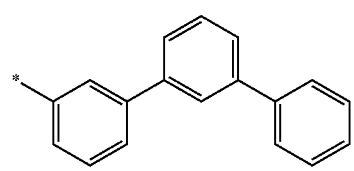

7-6

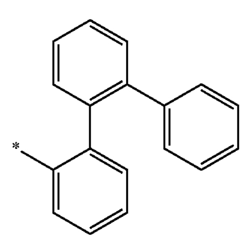

-continued 7-7

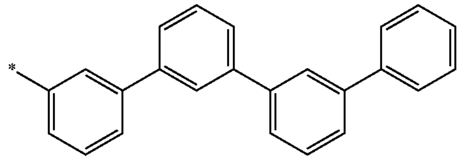

7-8

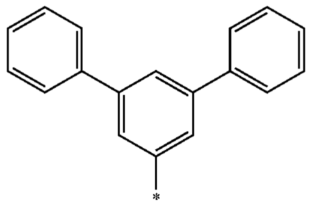

7-9

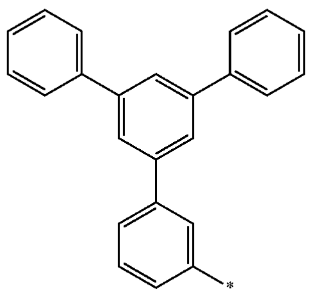

7-10

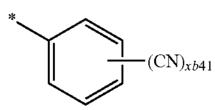

7-11

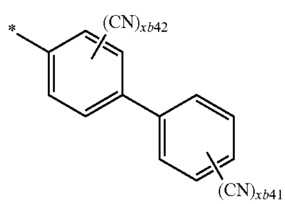

7-12

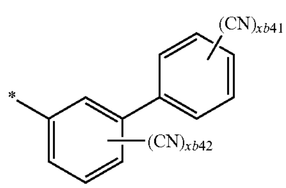

7-13

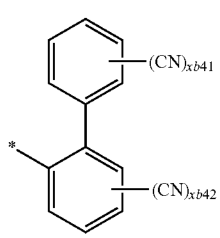

7-14

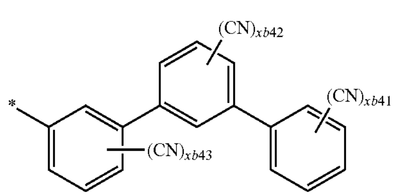

-continued 7-15

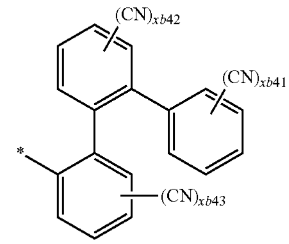

7-16

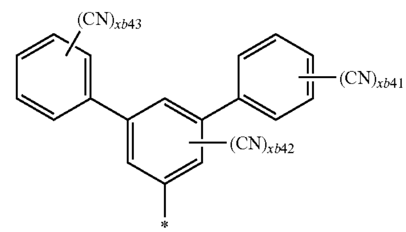

7-17

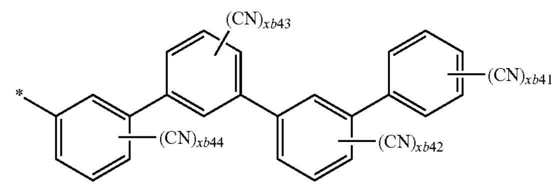

7-18

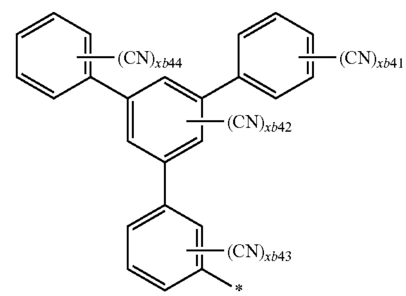

wherein, in Formulae 7-1 to 7-18, xb41 to xb44 may each be 0, 1, or 2, wherein xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, the sum of xb41, xb42, xb43, and xb44 in Formulae 7-17 and 7-18 is not 0, and * indicates a binding site to a neighboring atom.

Two or more $Ar_{301}$(s) in Formula E-1 may be identical to or different from each other, two or more $L_{301}$(s) may be identical to or different from each other, two or more $L_{401}$(s) in Formula H-1 may be identical to or different from each other, and two or more $Ar_{402}$(s) in Formula H-1 may be identical to or different from each other.

In an embodiment, the electron-transporting host may include i) at least one of a cyano group, a pyrimidine group, a pyrazine group, a triazine group, or any combination thereof, or ii) a triphenylene group, and the hole-transporting host may include a carbazole group.

In one or more embodiments, the electron-transporting host may include at least one cyano group.

The electron-transporting host may be, for example, a compound of Groups HE1 to HE7, but embodiments of the present disclosure are not limited thereto:

Group HE1
H-E1
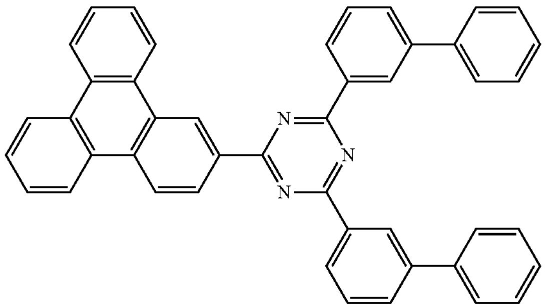
H-E2
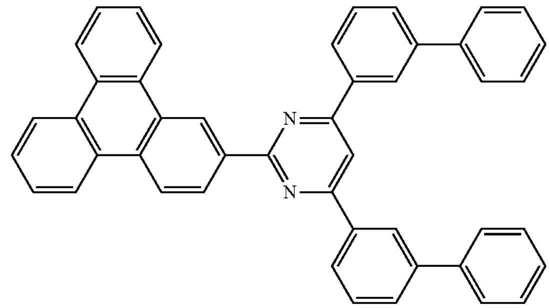
H-E3
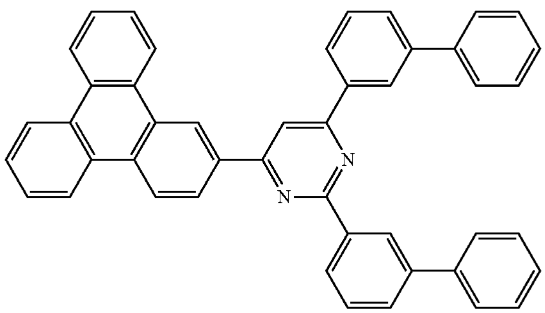
H-E4
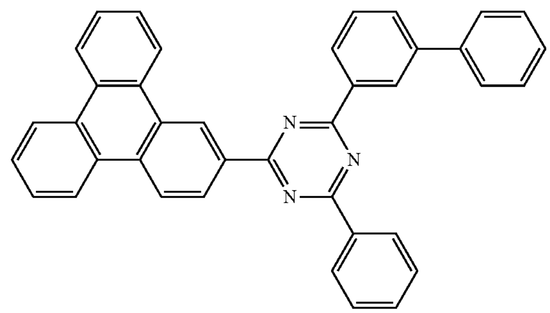
H-E5
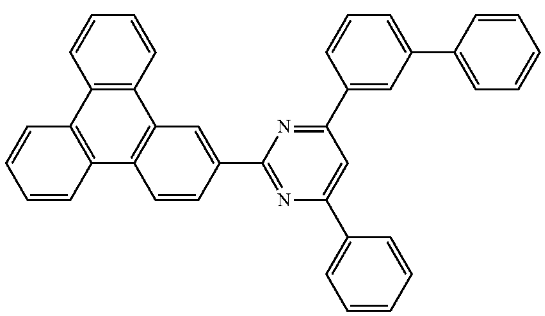
H-E6
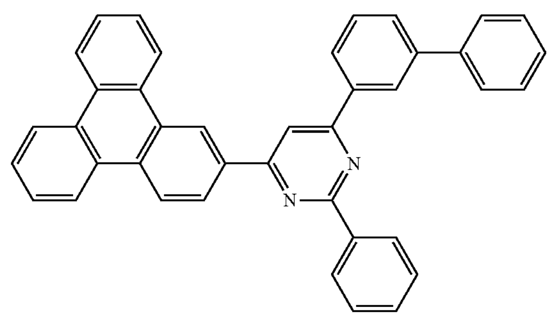
H-E7
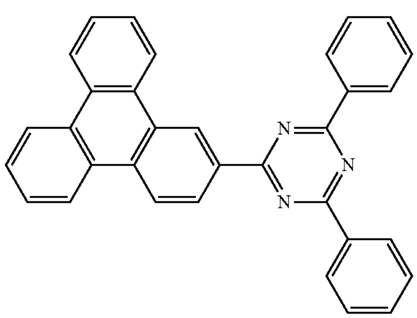
H-E8
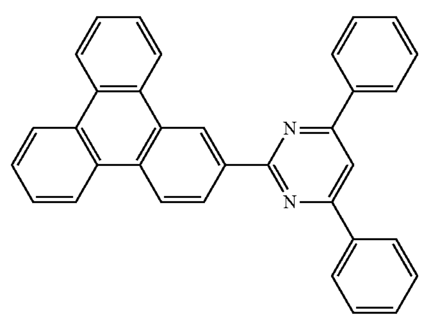

-continued
H-E9
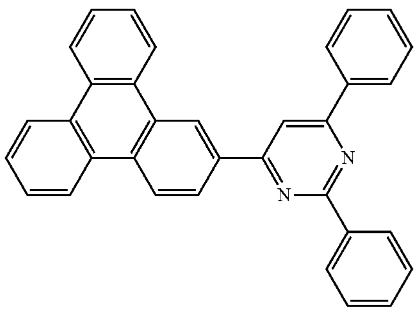
H-E10
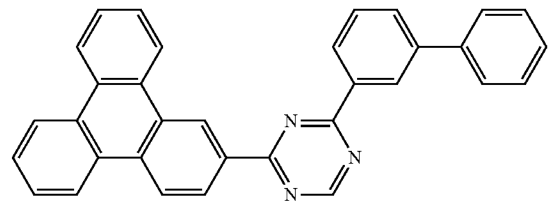
H-E11
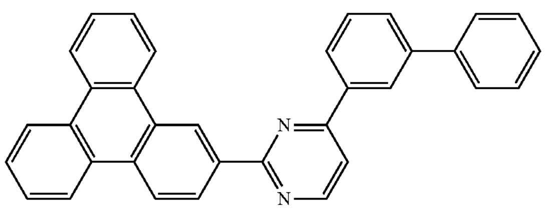
H-E12
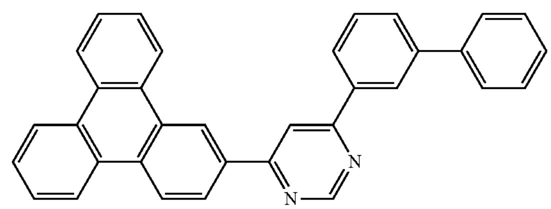
H-E13
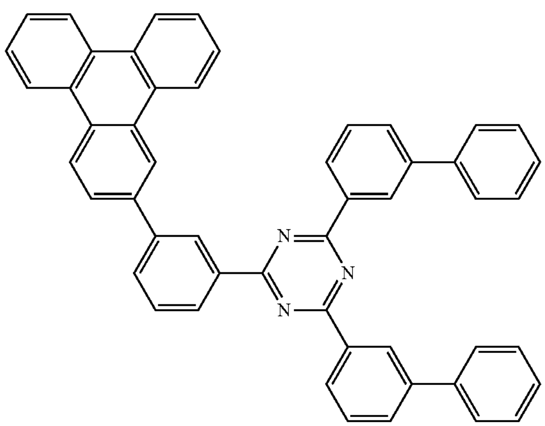
H-E14
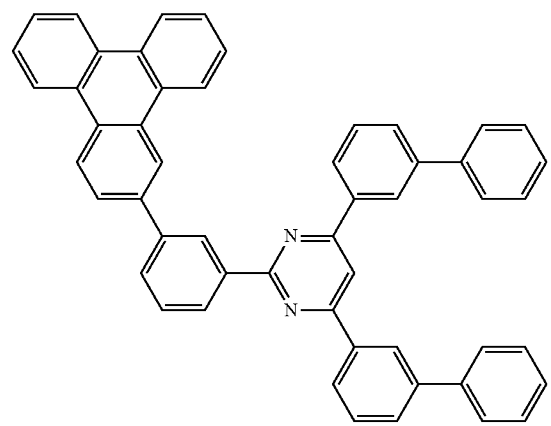
H-E15
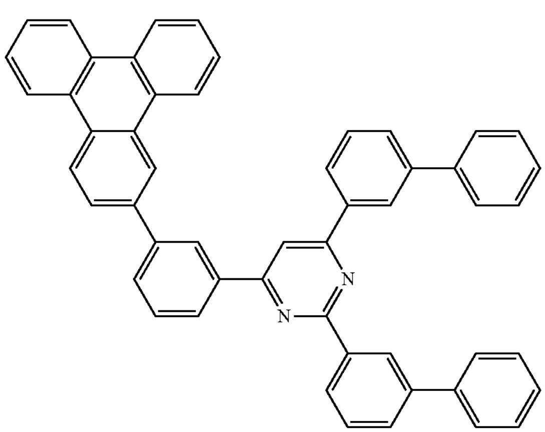
H-E16
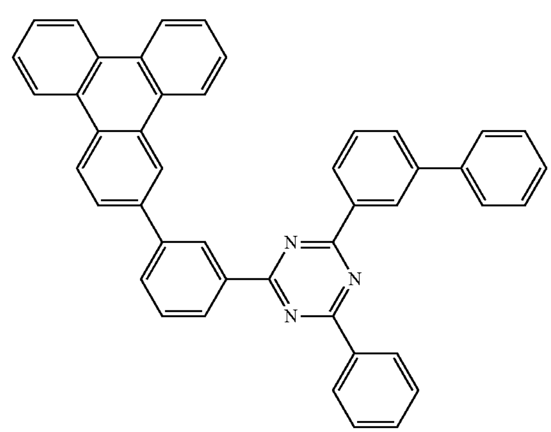

-continued
H-E17
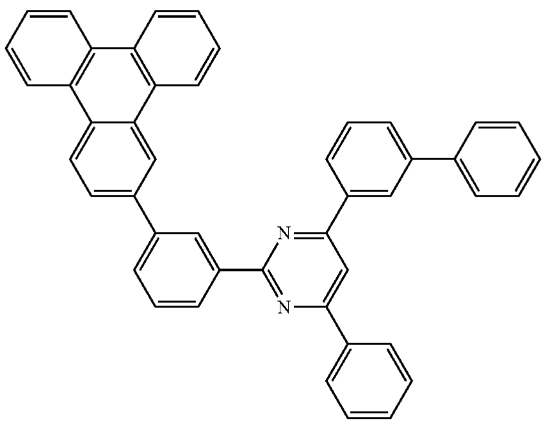
H-E18
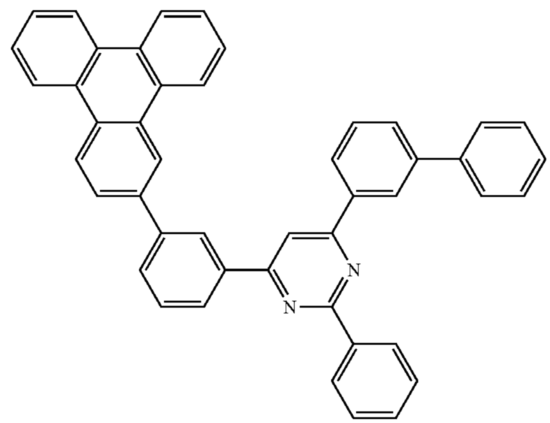
H-E19
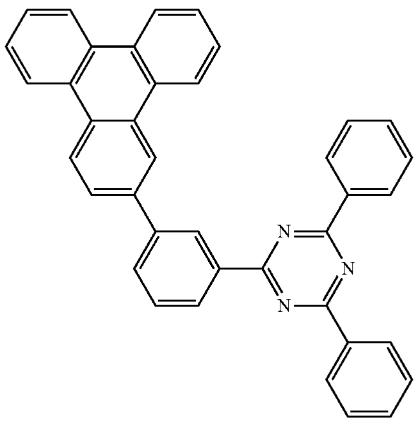
H-E20
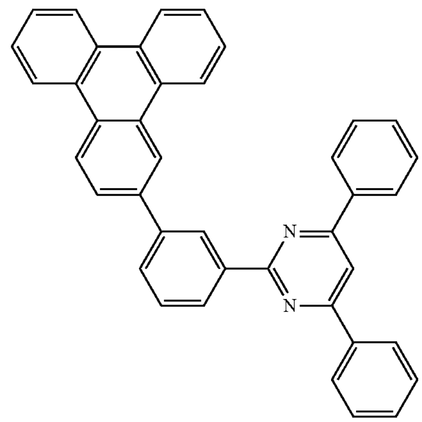
H-E21
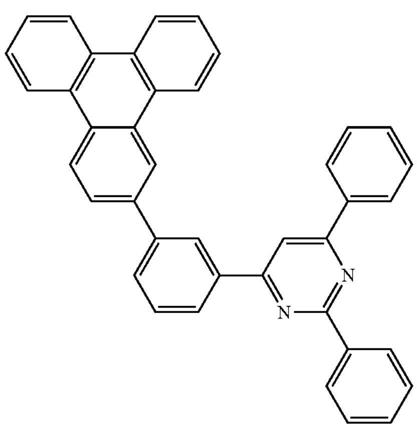
H-E22
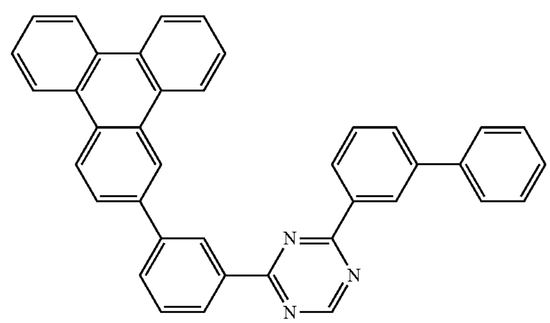
H-E23
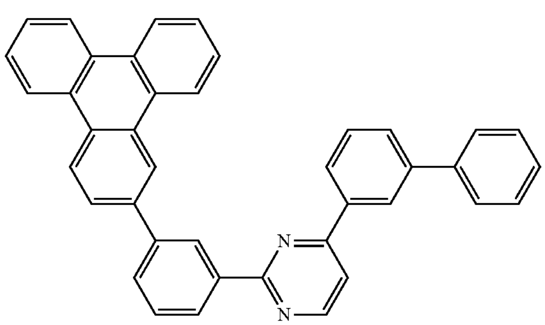
H-E24
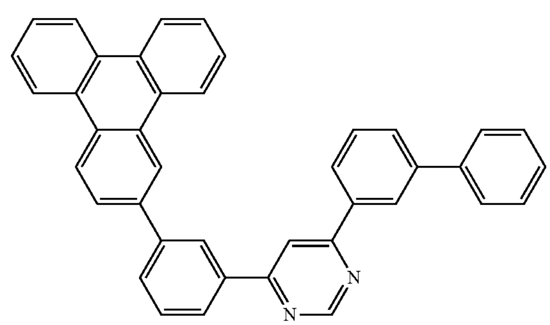

-continued
H-E25
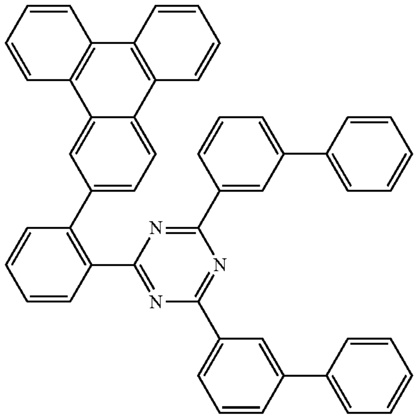
H-E26
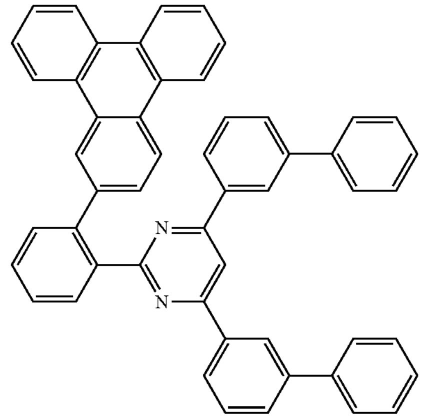
H-E27
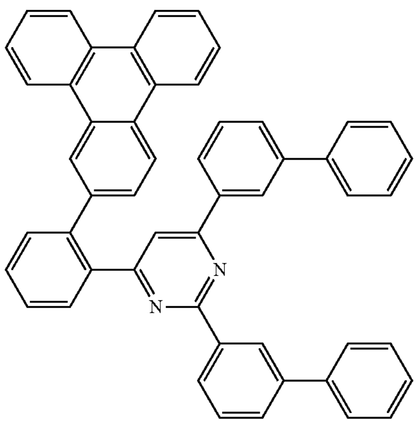
H-E28
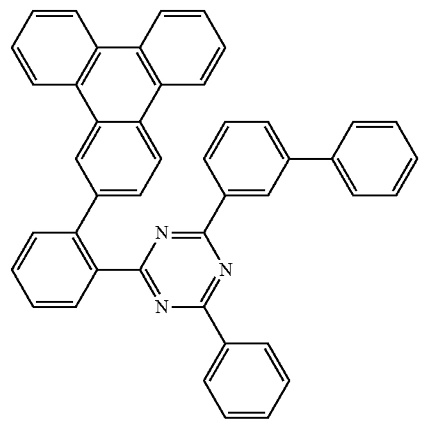
H-E29
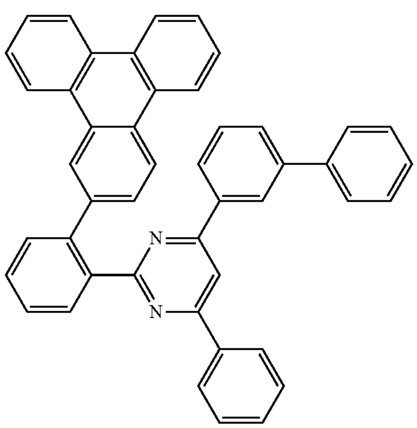
H-E30
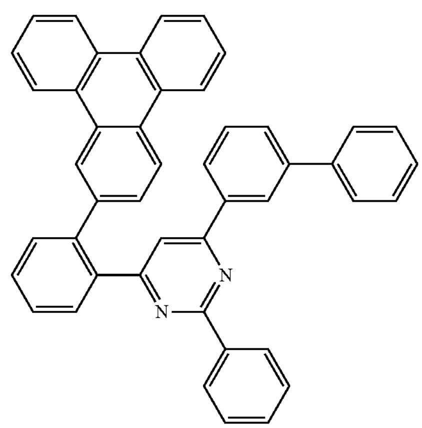

-continued
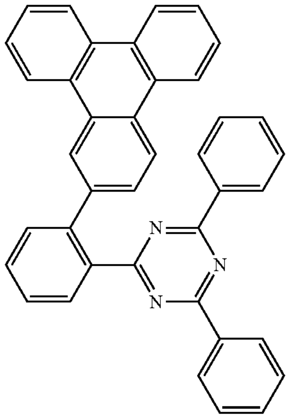
H-E31
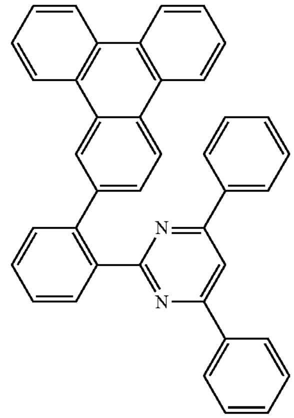
H-E32
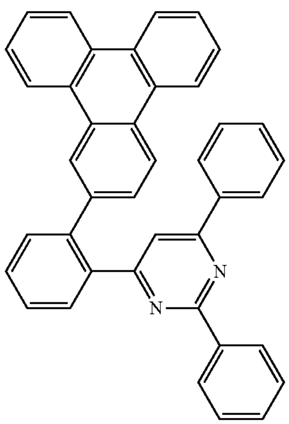
H-E33
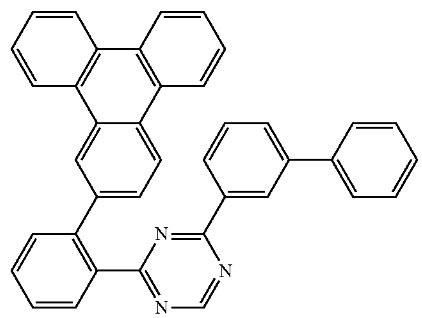
H-E34
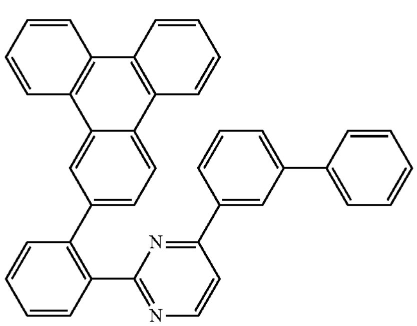
H-E35
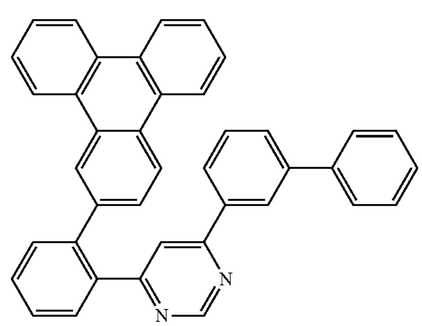
H-E36

-continued
H-E37
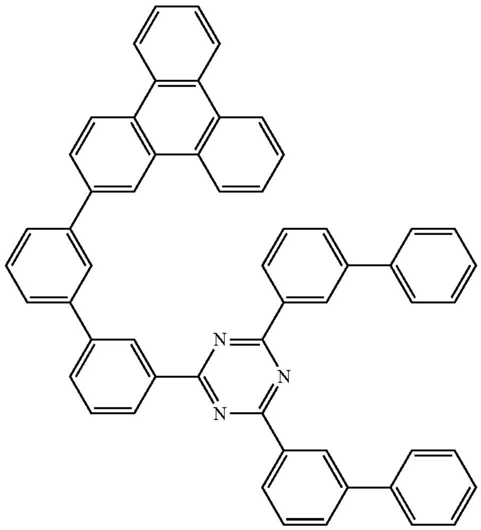
H-E38
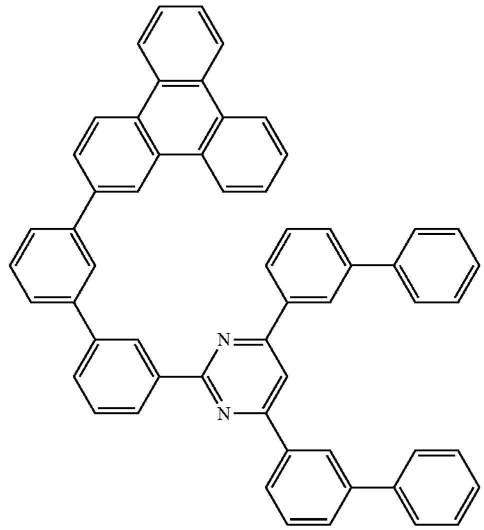
H-E39
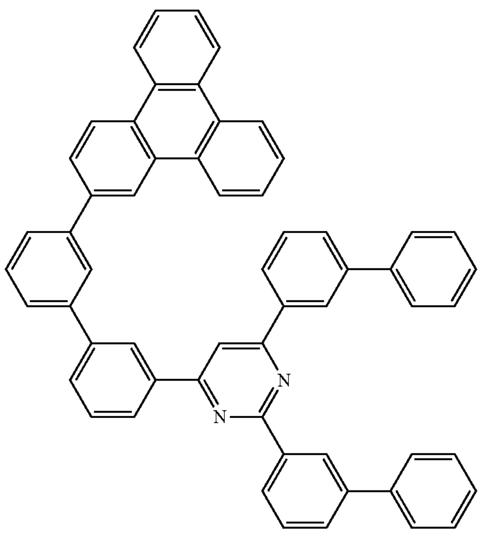
H-E40
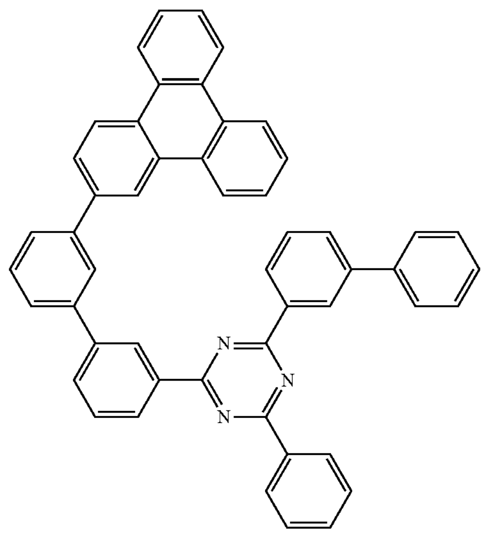
H-E41
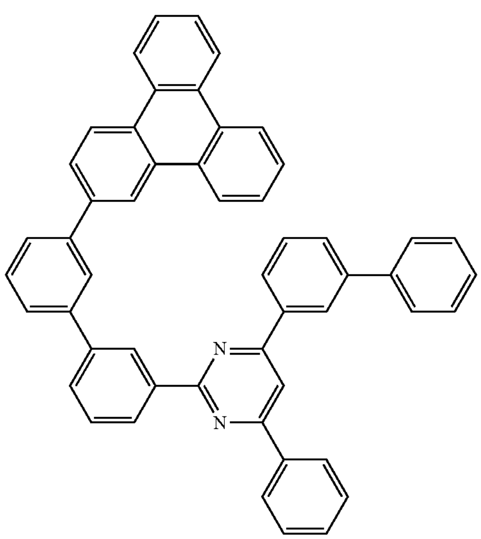
H-E42
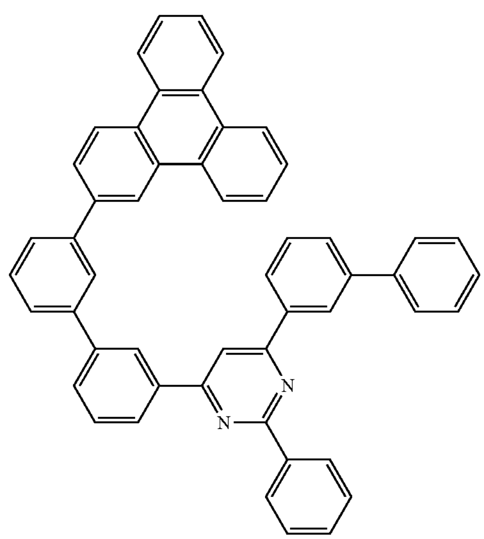

-continued
H-E43
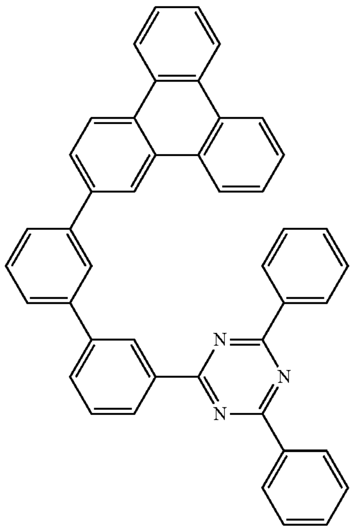
H-E44
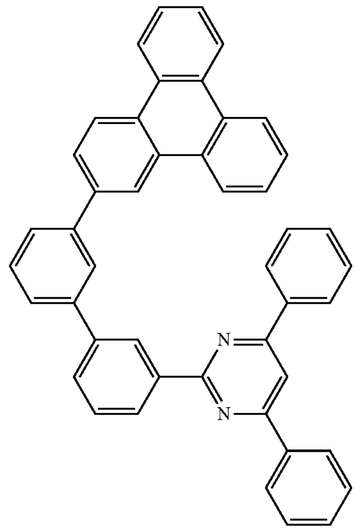
H-E45
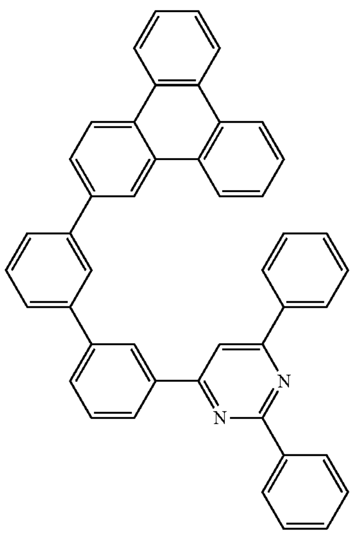
H-E46
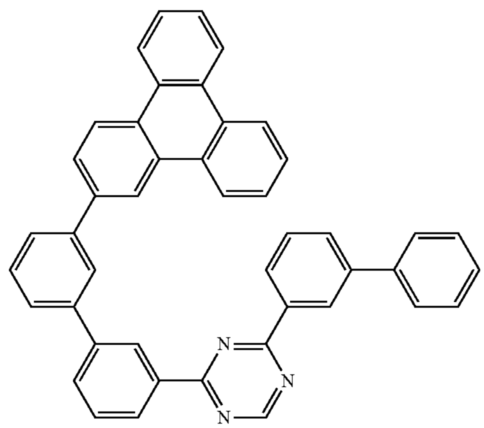
H-E47
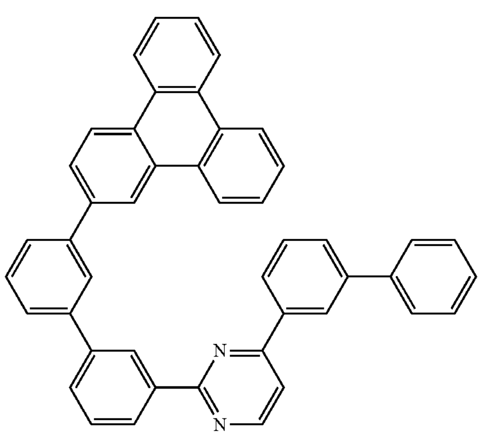
H-E48
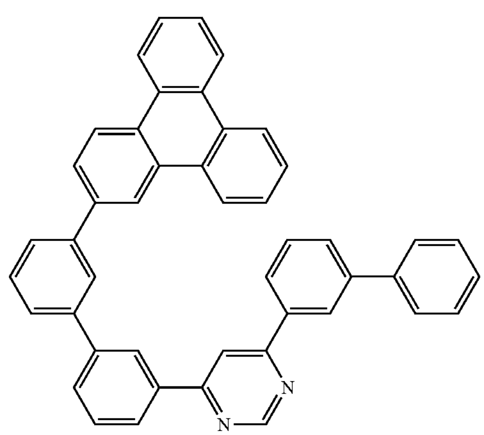

-continued
H-E49
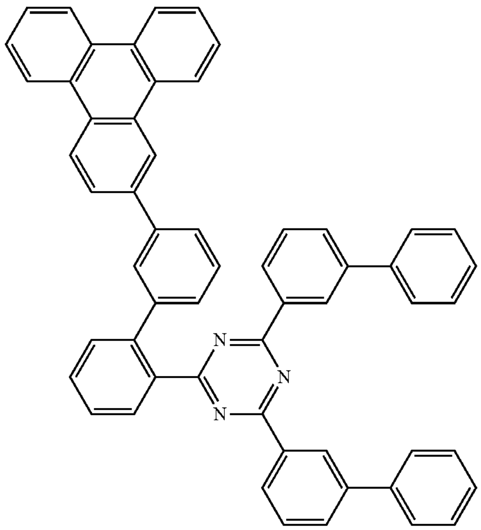
H-E50
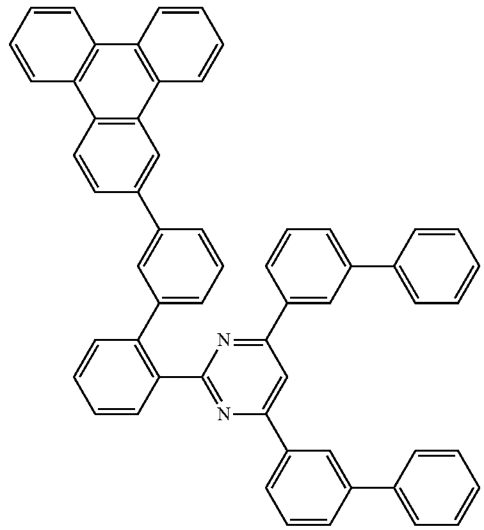
H-E51
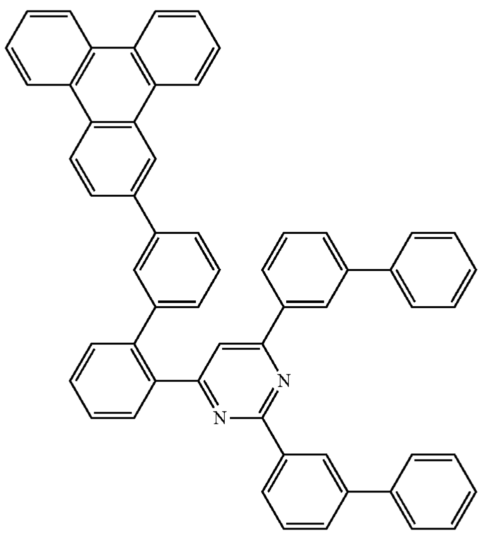
H-E52
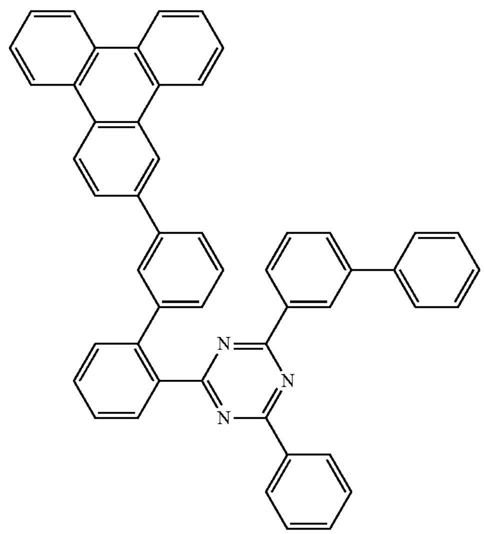
H-E53
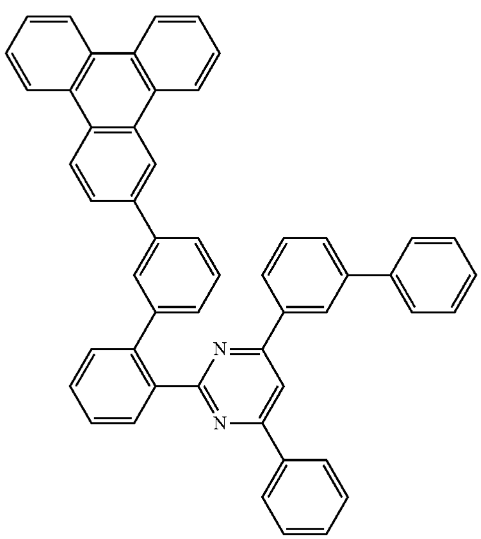
H-E54
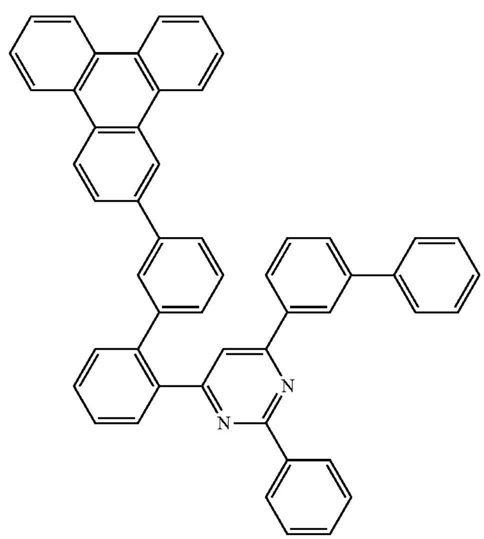

-continued
H-E55
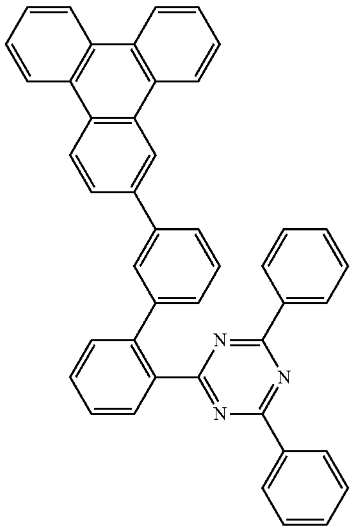
H-E56
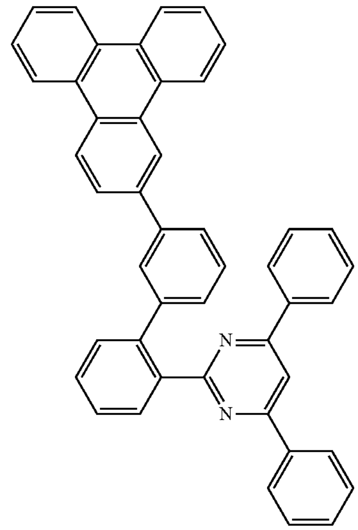
H-E57
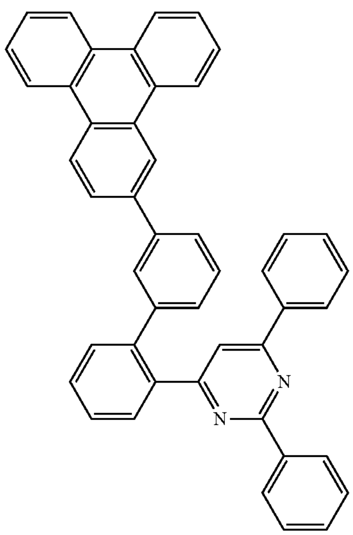
H-E58
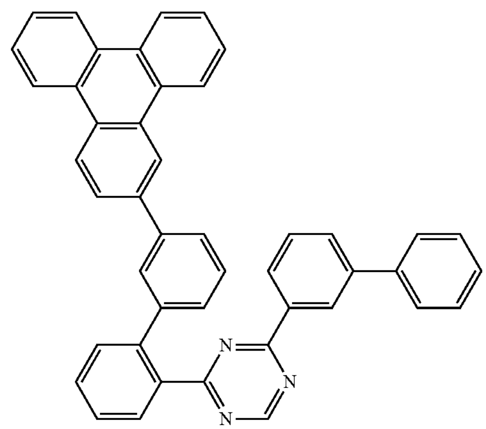
H-E59
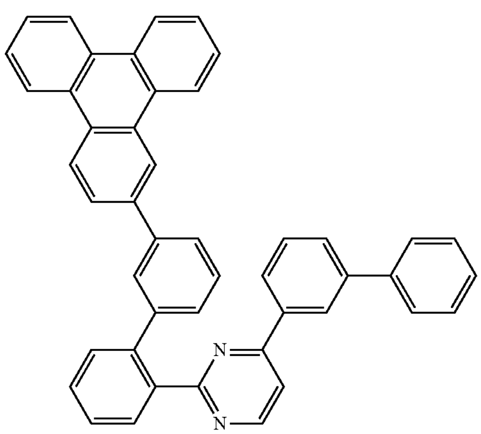
H-E60
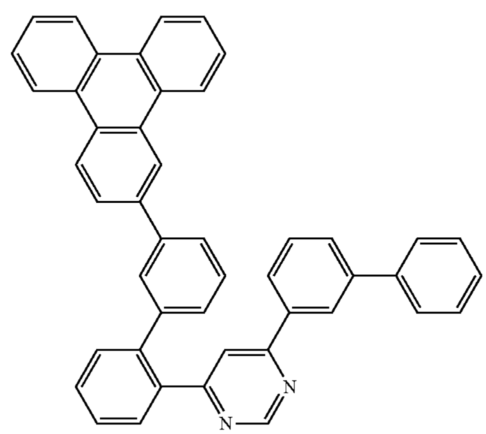

-continued
H-E61
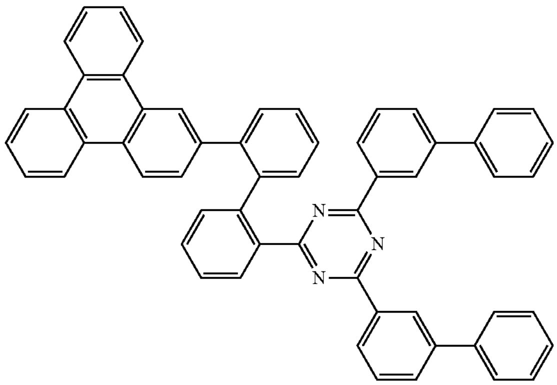
H-E62
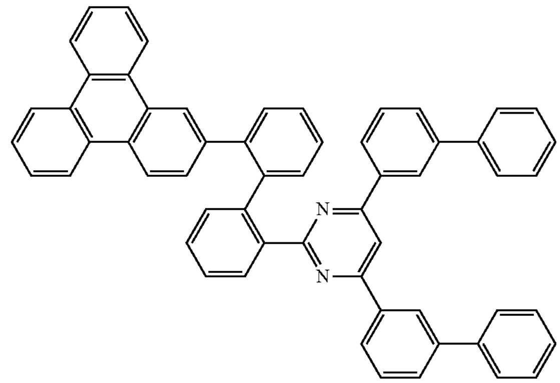
H-E63
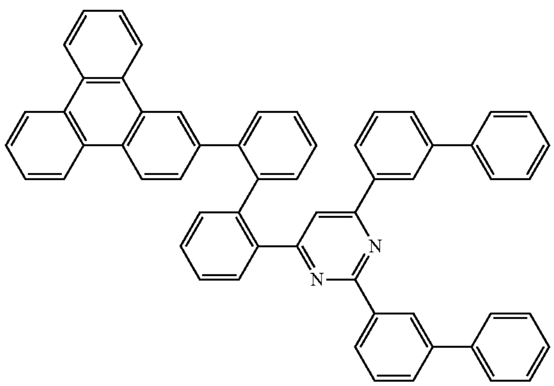
H-E64
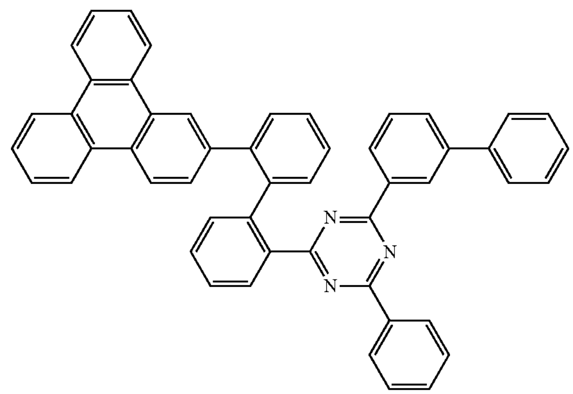
H-E65
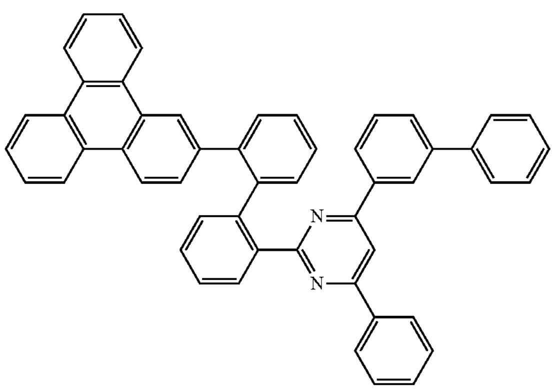
H-E66
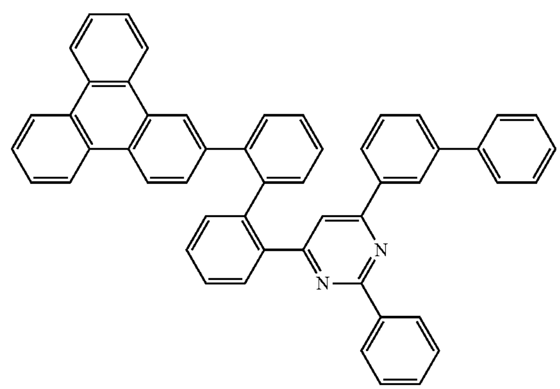
H-E67
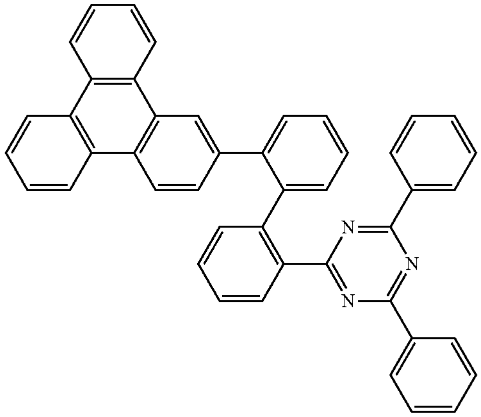
H-E68
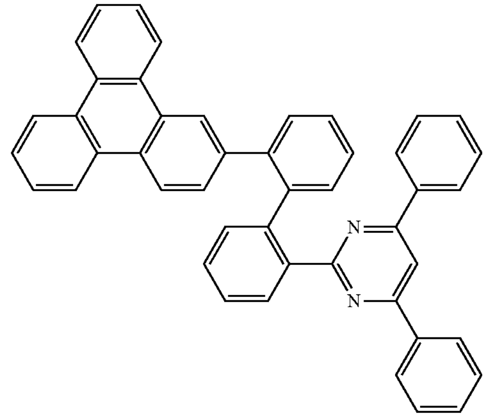

-continued
H-E69
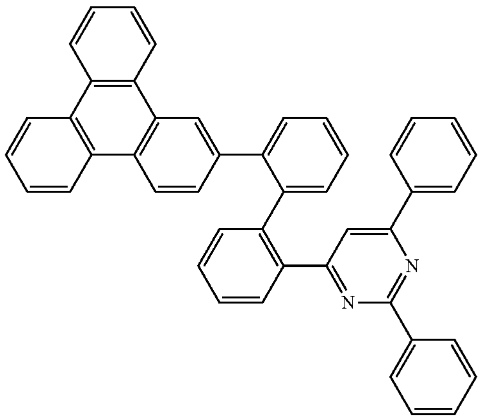
H-E70
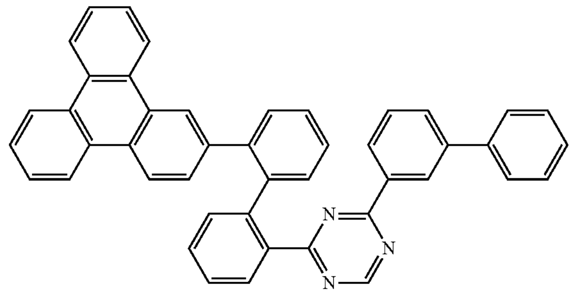
H-E71
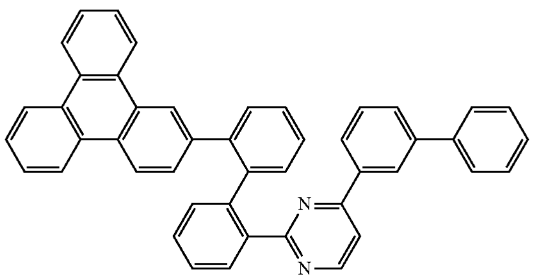
H-E72
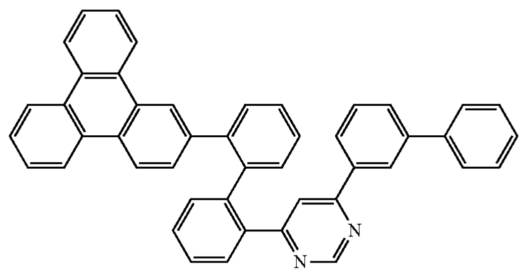
H-E73
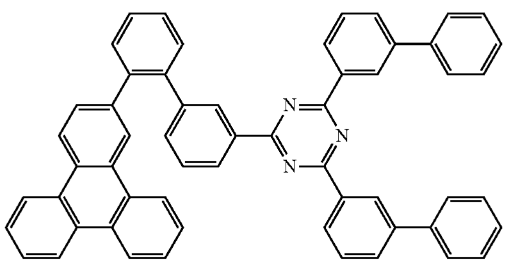
H-E74
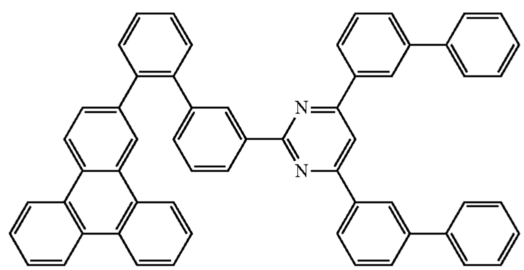
H-E75
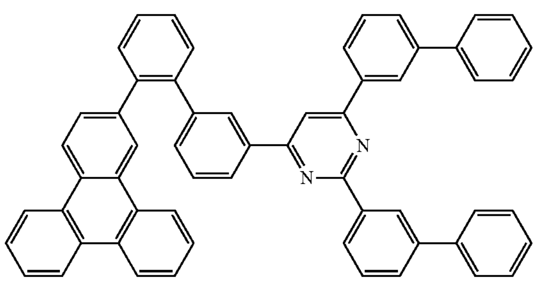
H-E76
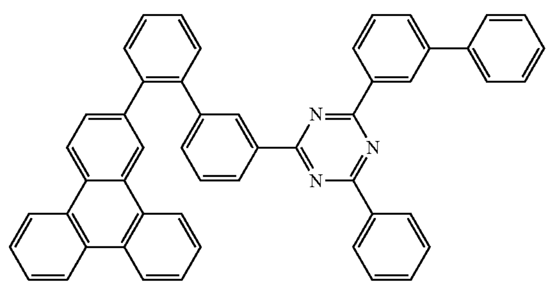
H-E77
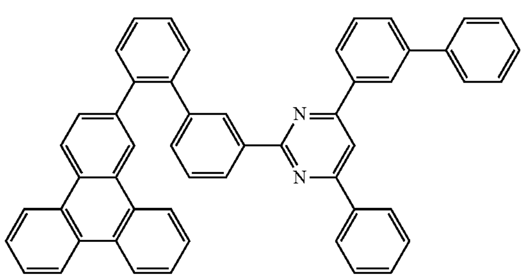
H-E78
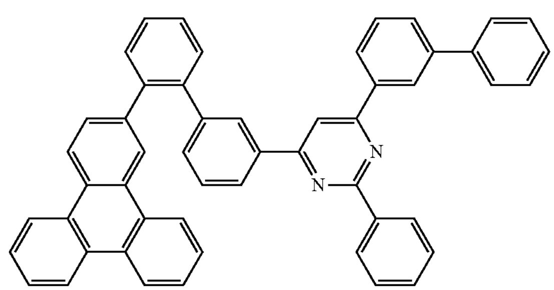

-continued
H-E79
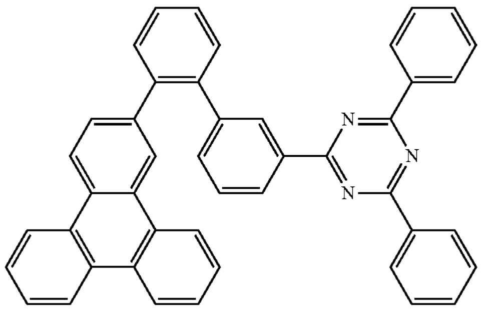
H-E80
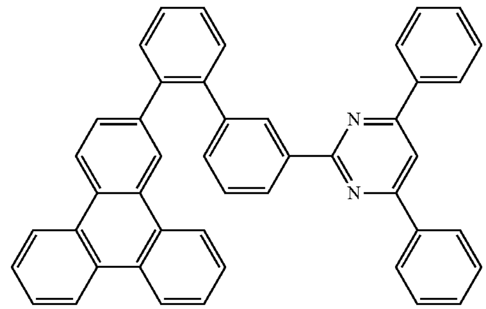
H-E81
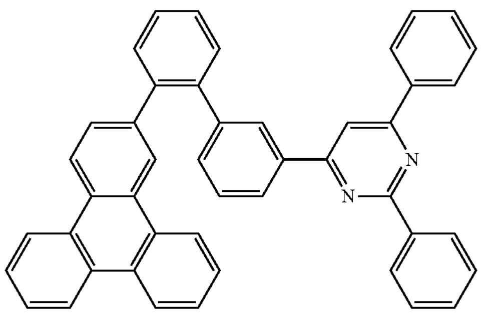
H-E82
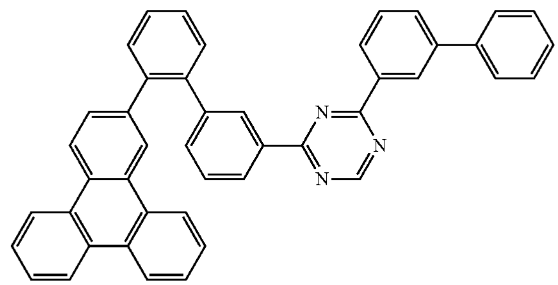
H-E83
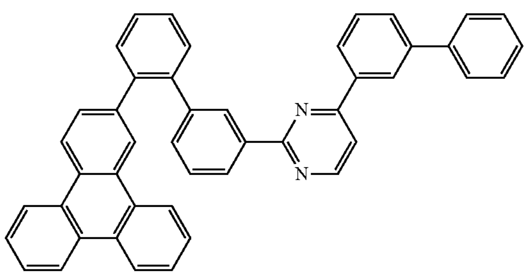
H-E84
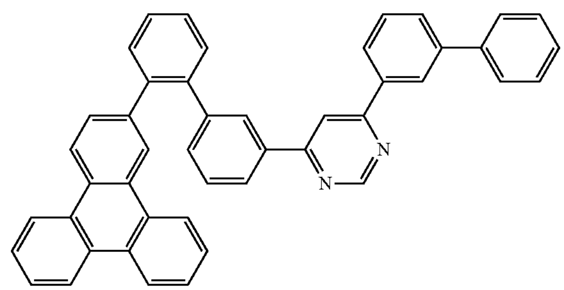
H-E(1)
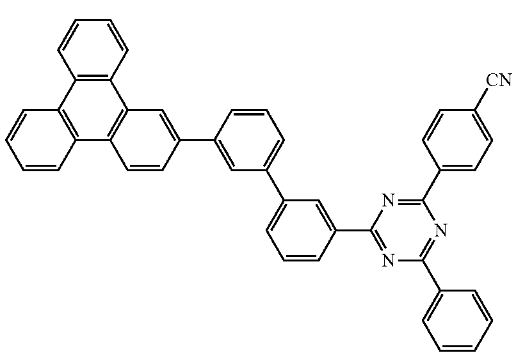
H-E(2)
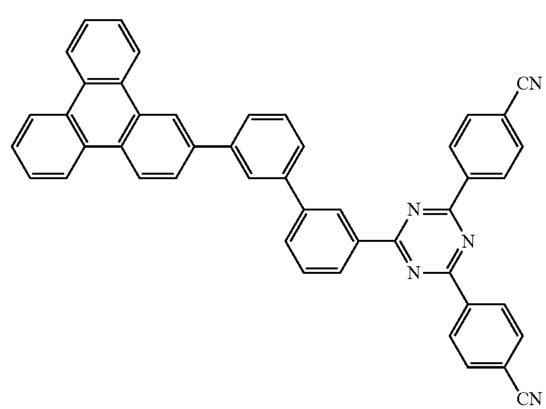

-continued
H-E(3)
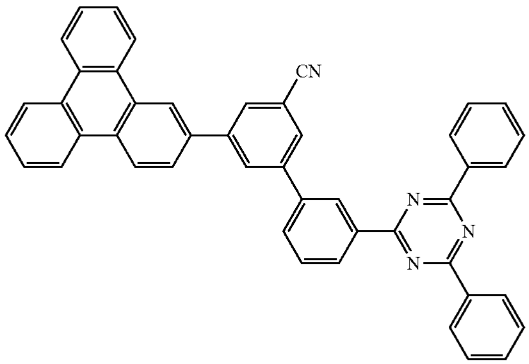
H-E(4)
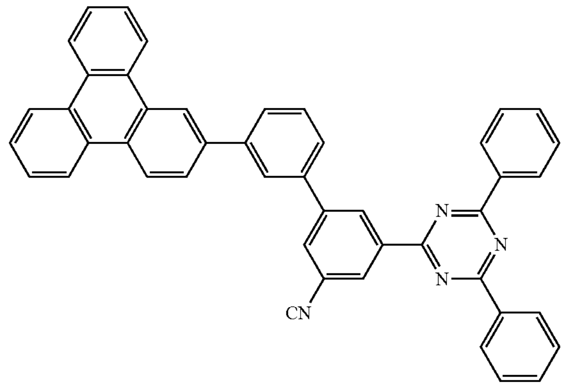
A-1
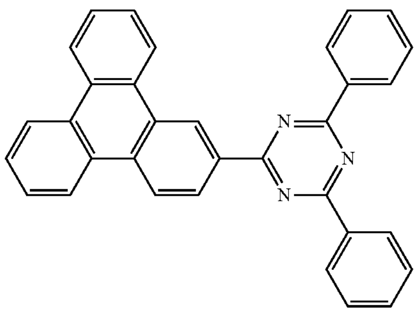
A-2
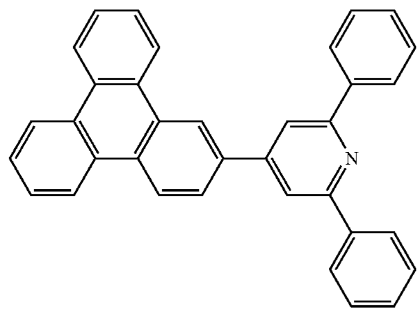
A-3
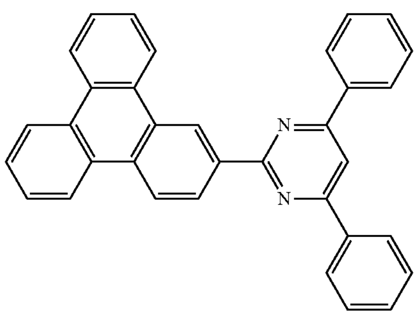
A-4
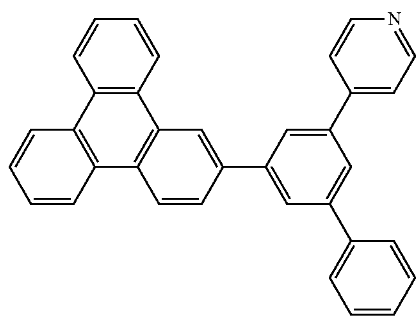
A-5
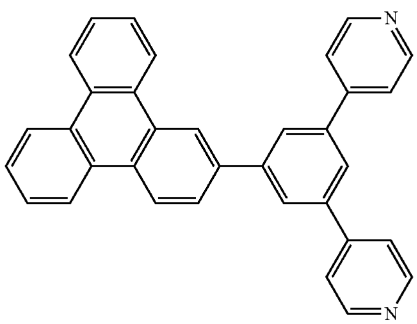
A-6
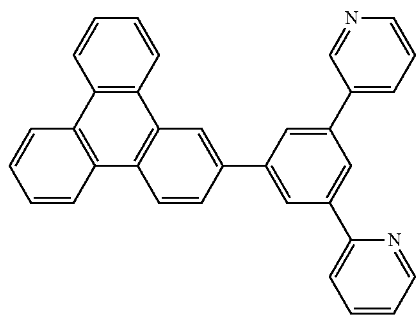

-continued
A-7
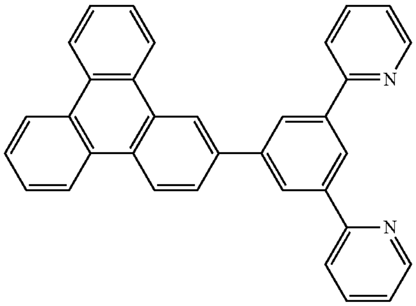
A-8
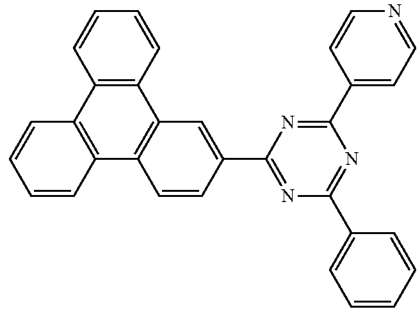
A-9
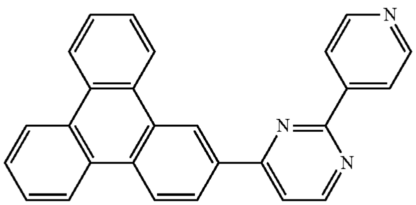
A-10
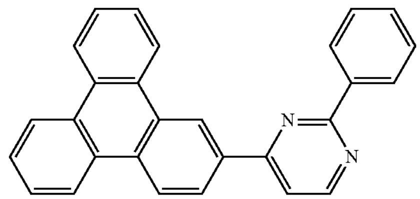
A-11
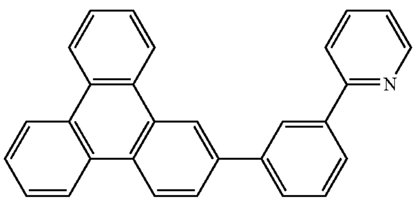
A-12
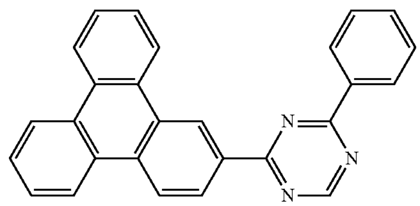
A-13
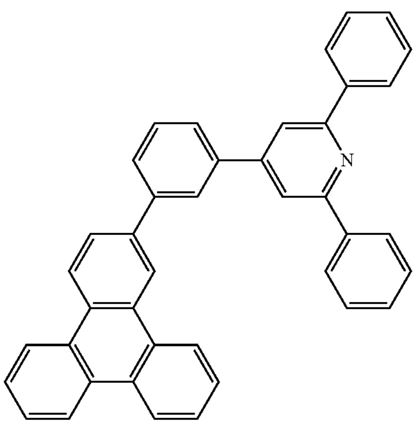
A-14
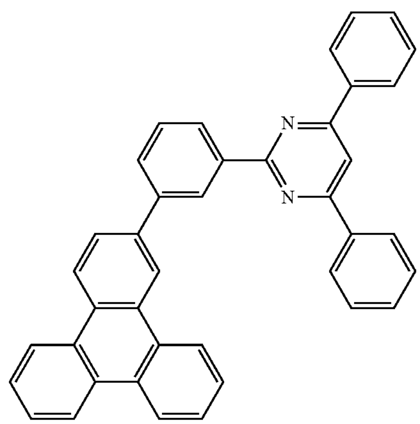
A-15
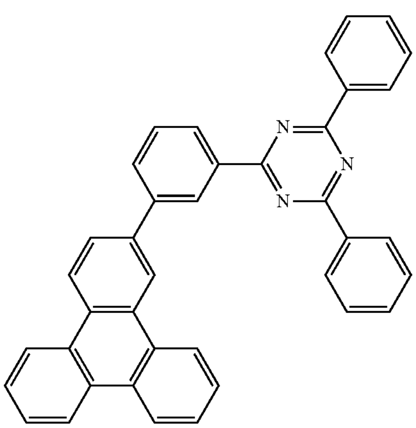
A-16
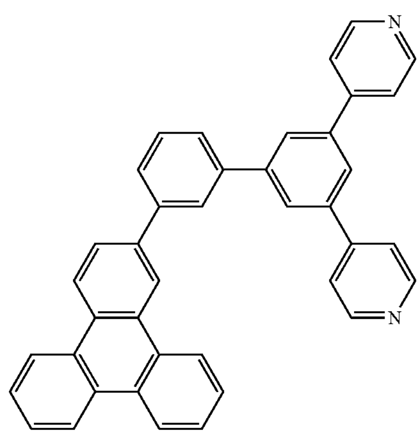

-continued
A-17
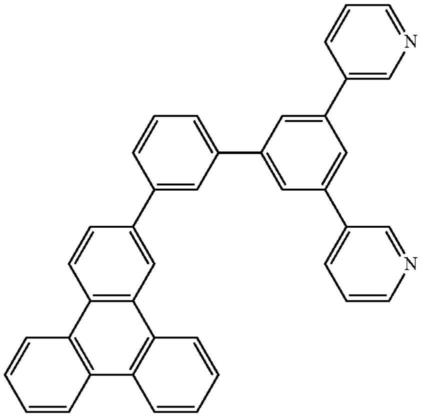
A-18
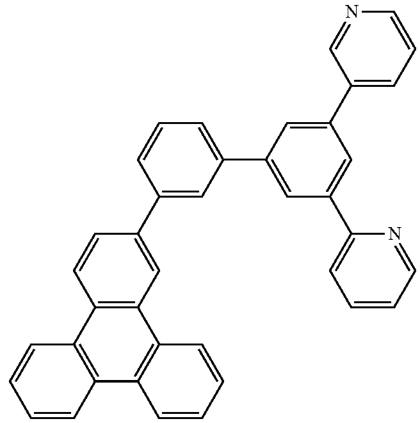
A-19
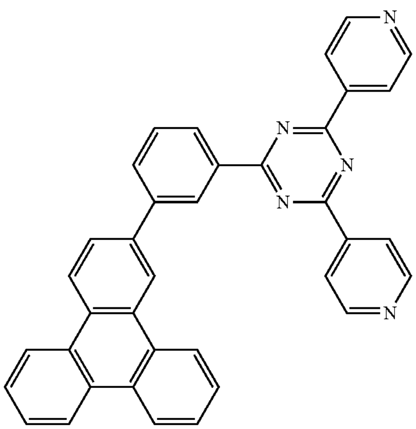
A-20
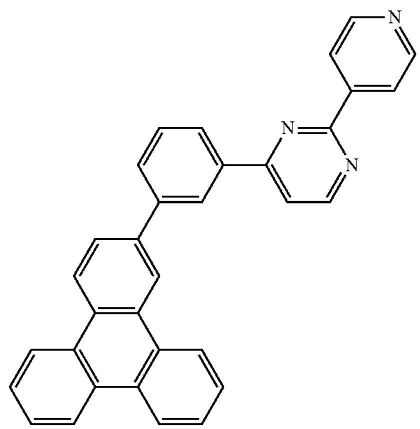
A-21
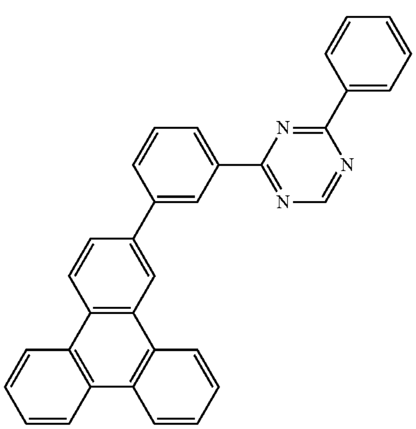
A-22
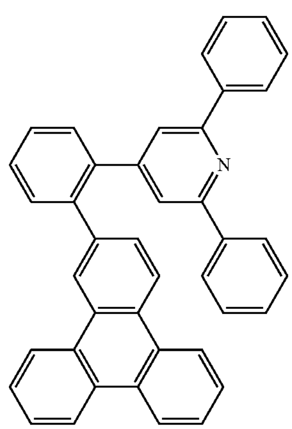

-continued
A-23
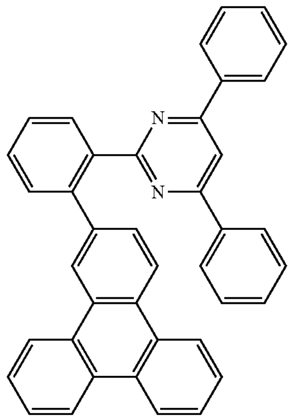
A-24
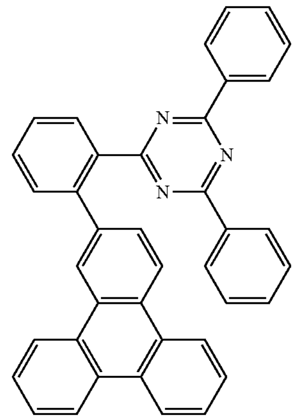
A-25
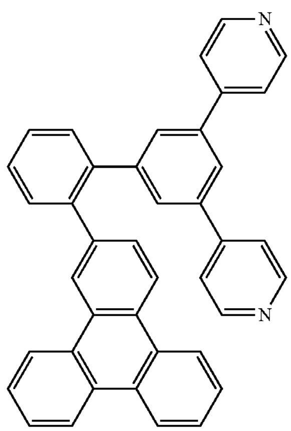
A-26
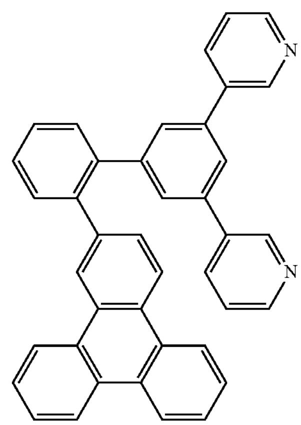
A-27
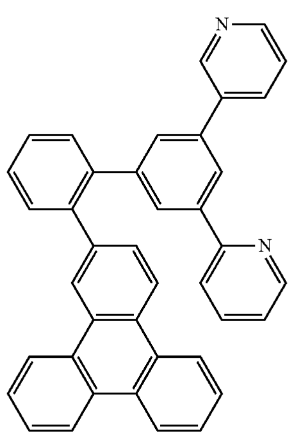
A-28
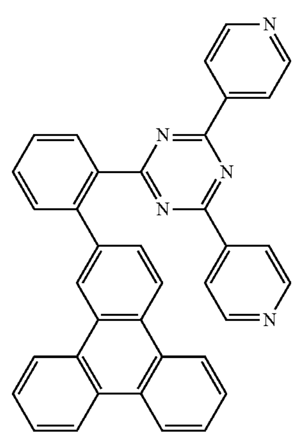

-continued
A-29
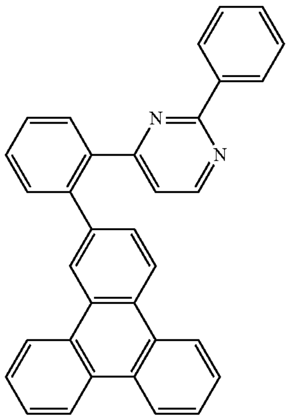
A-30
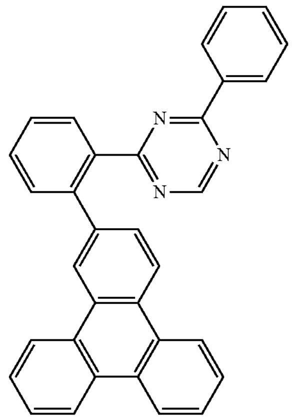
A-31
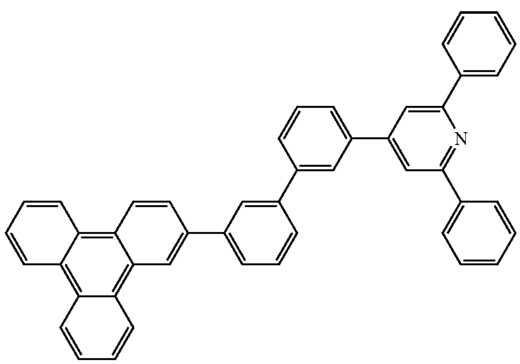
A-32
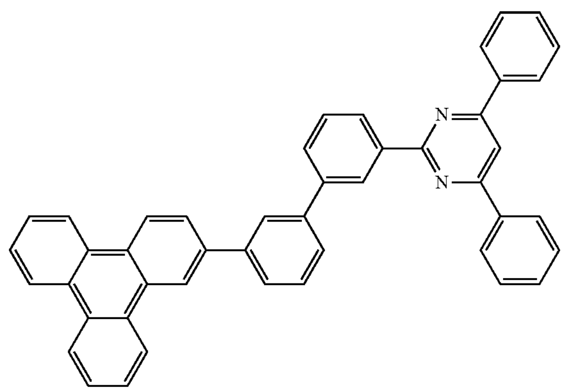
A-33
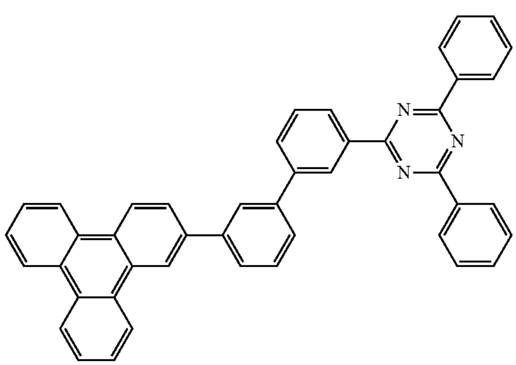
A-34
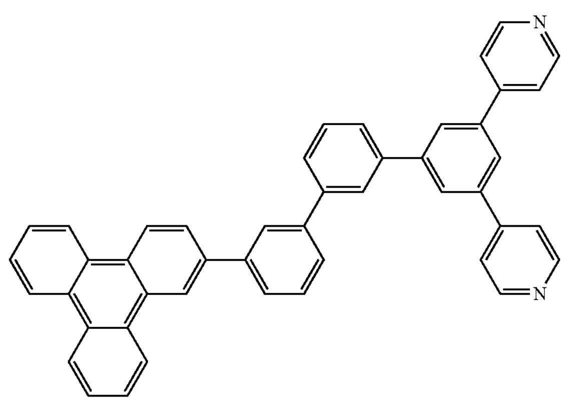
A-35
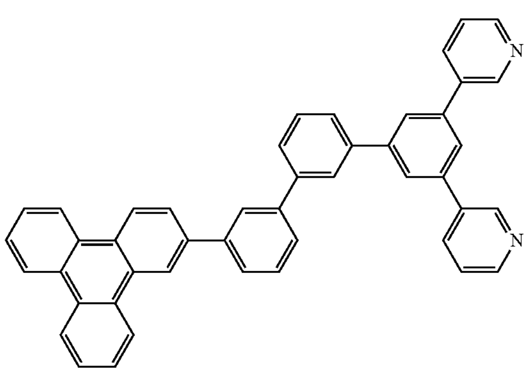
A-36
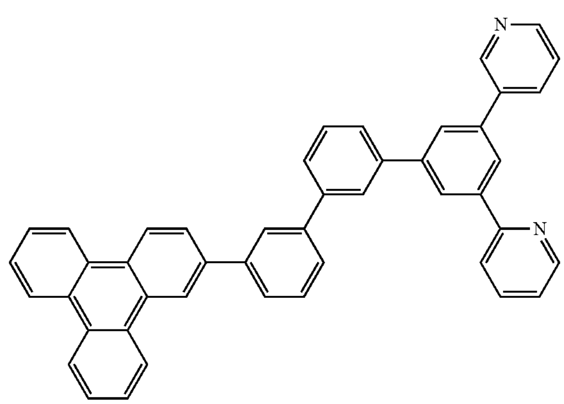

-continued
A-37
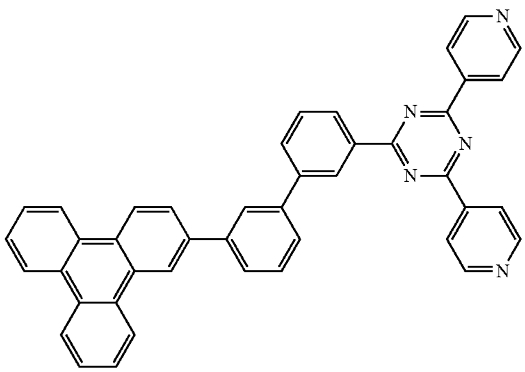
A-38
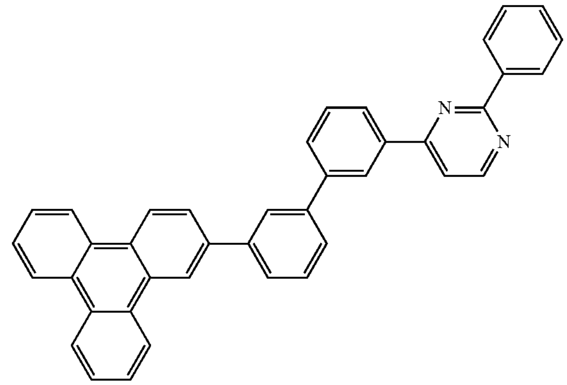
A-39
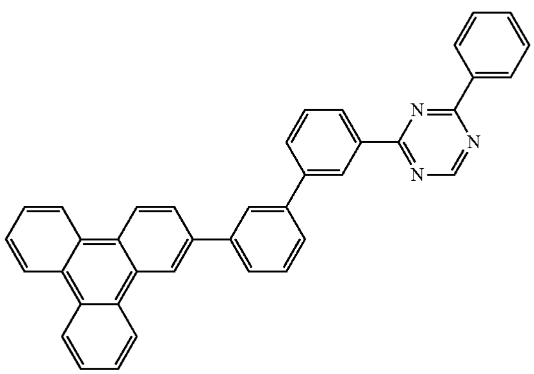
A-40
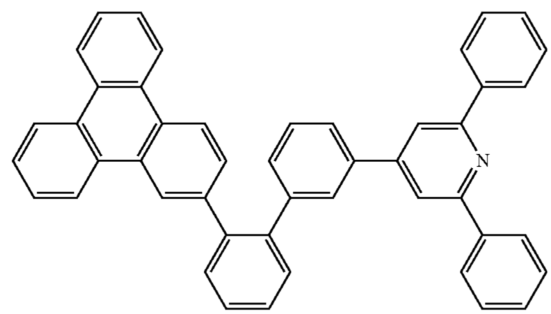
A-41
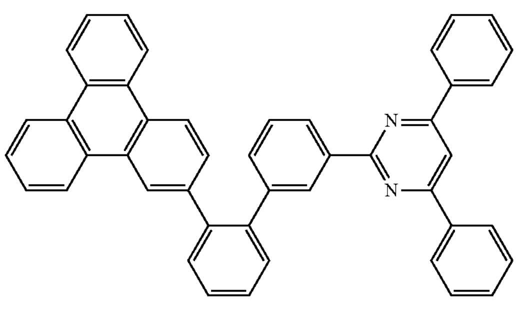
A-42
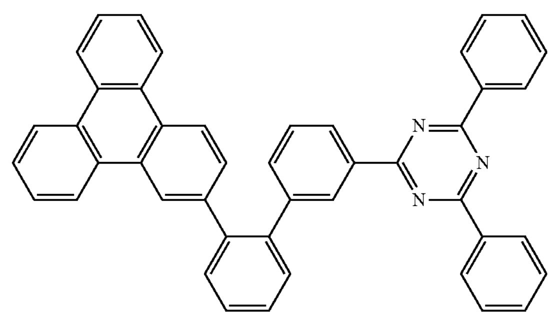
A-43
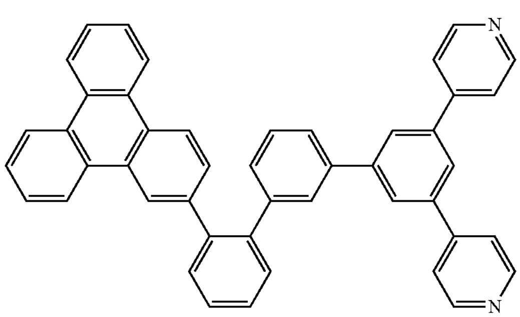
A-44
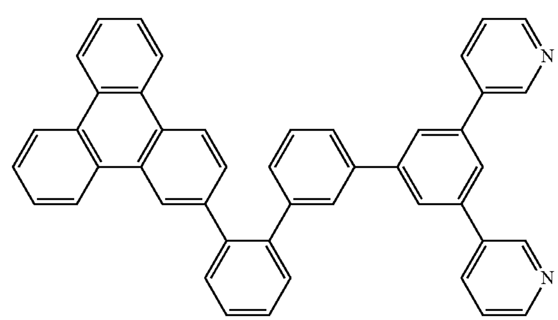

-continued
A-45
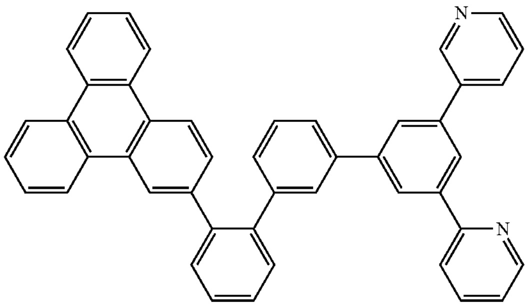
A-46
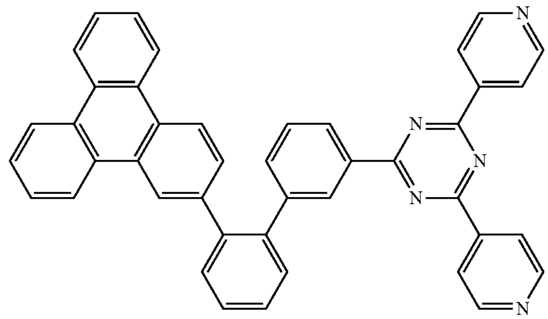
A-47
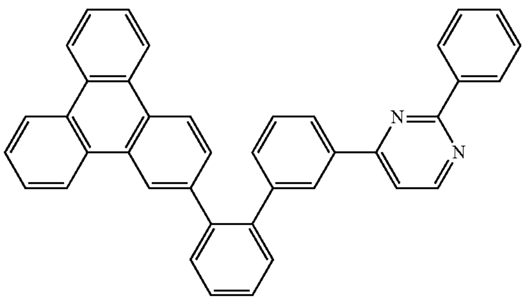
A-48
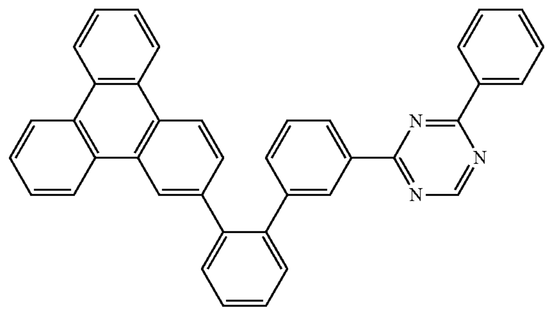
A-49
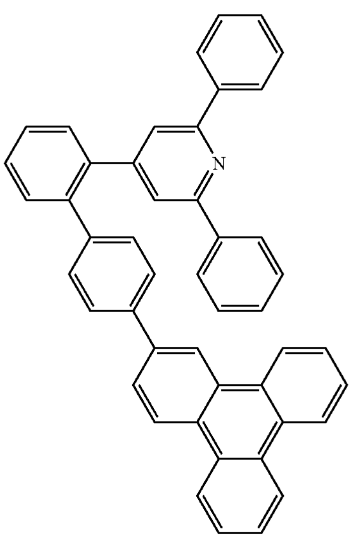
A-50
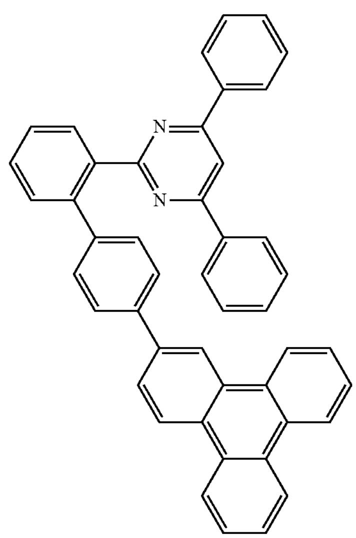

-continued
A-51
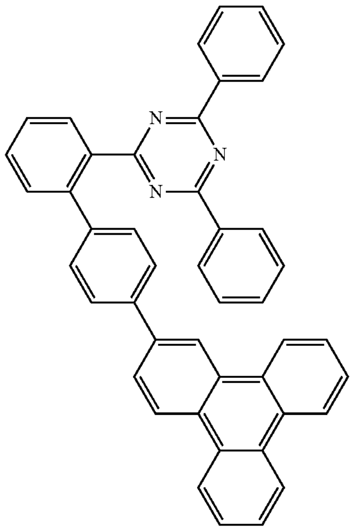
A-52
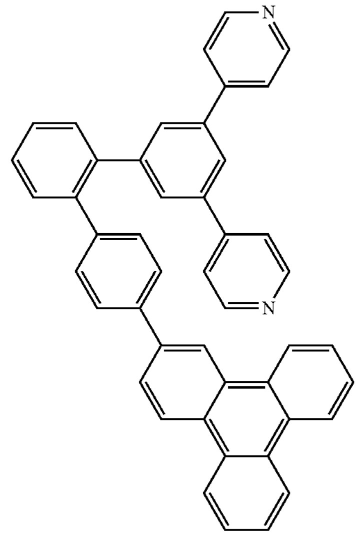
A-53
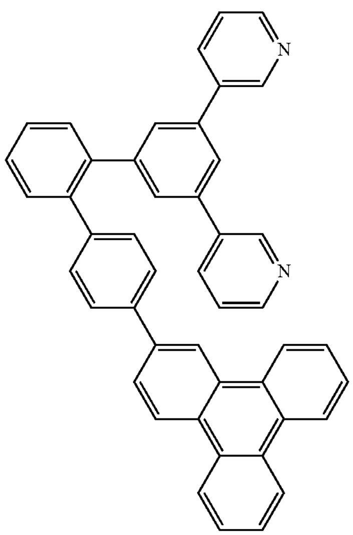
A-54
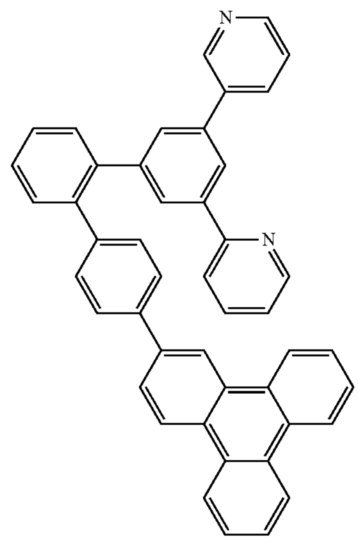
A-55
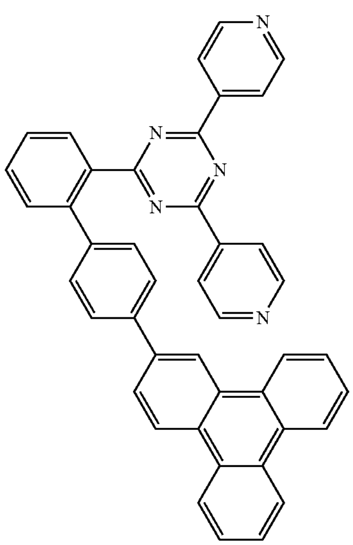
A-56
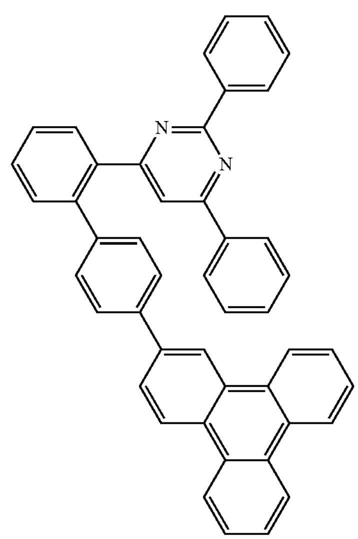

-continued
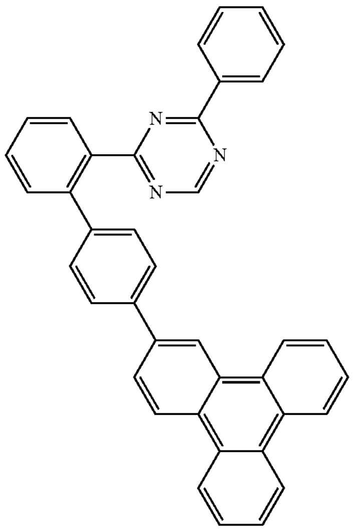
A-57
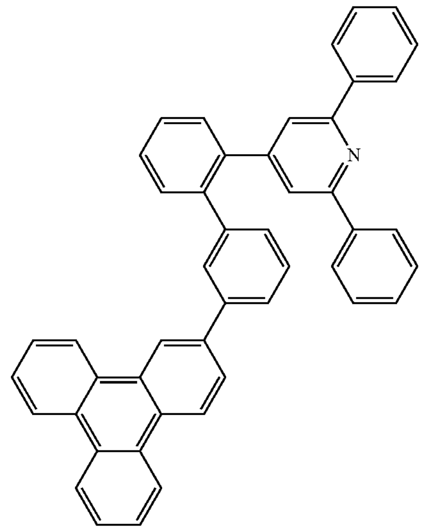
A-58
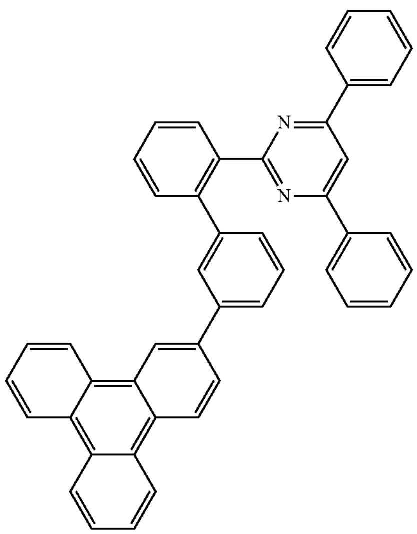
A-59
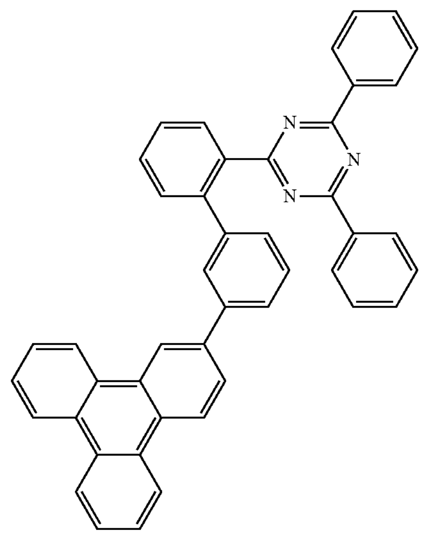
A-60
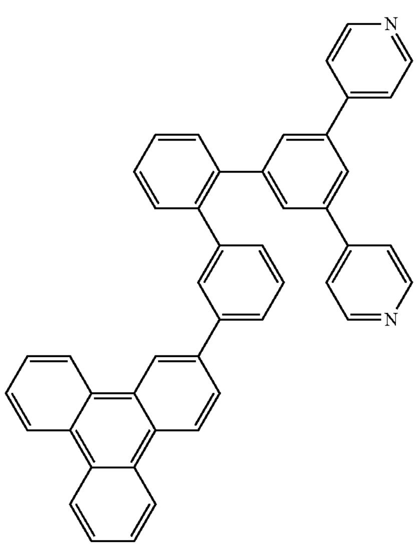
A-61
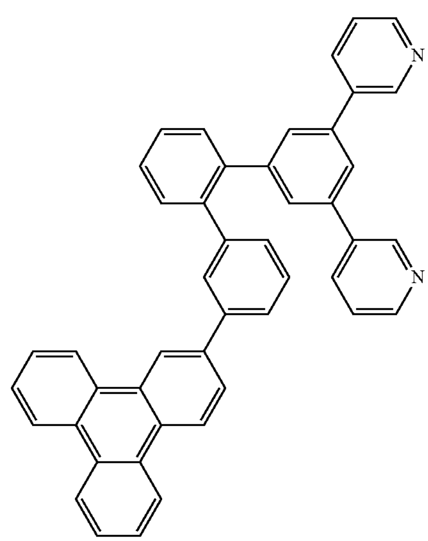
A-62

-continued
A-63
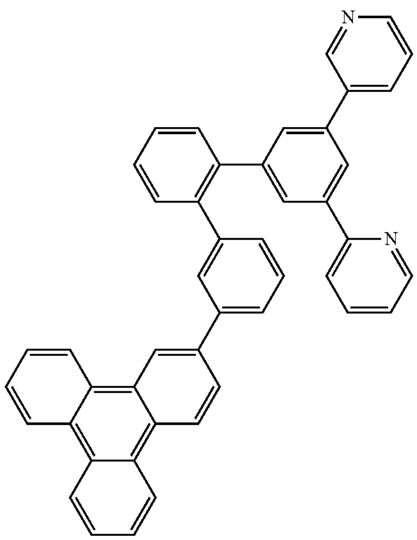
A-64
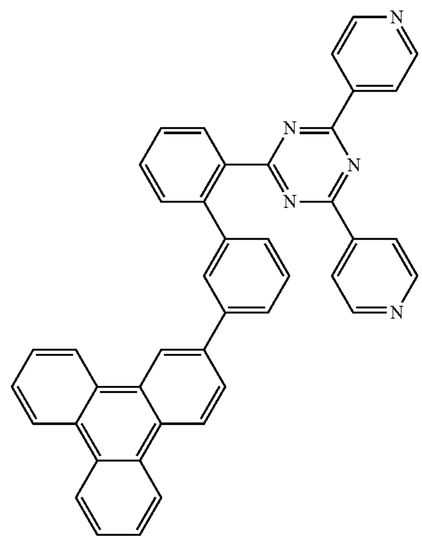
A-65
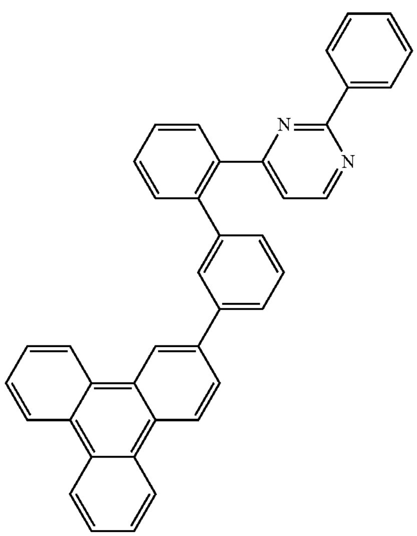
A-66
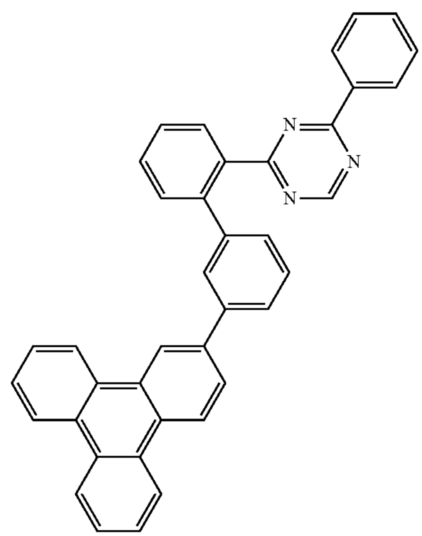
A-67
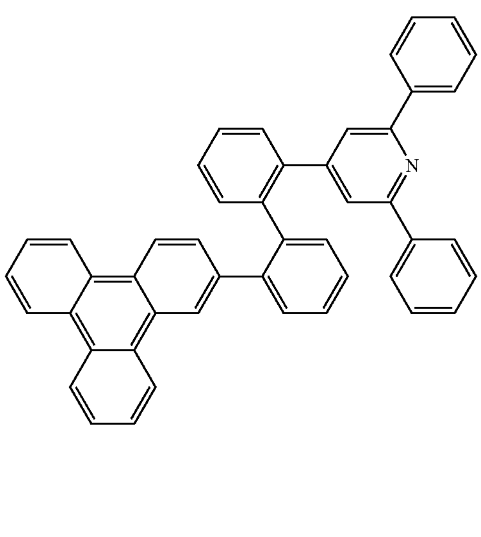
A-68
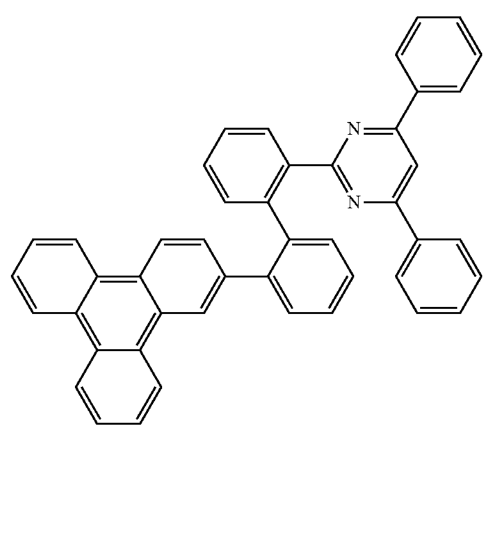

-continued
A-69
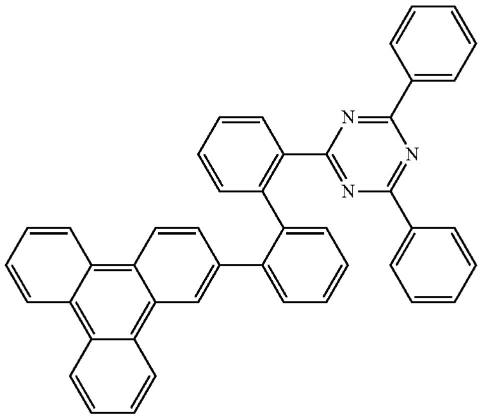
A-70
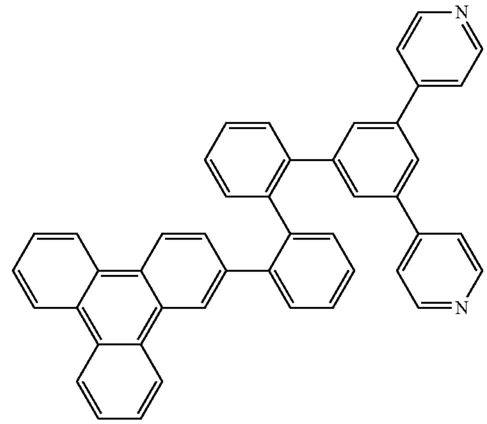
A-71
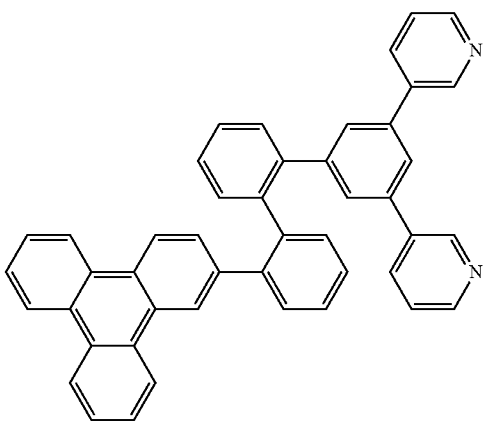
A-72
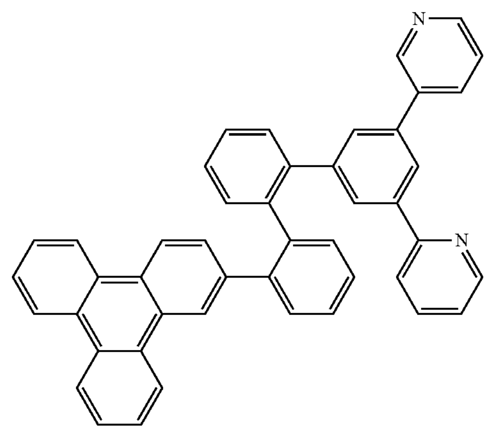
A-73
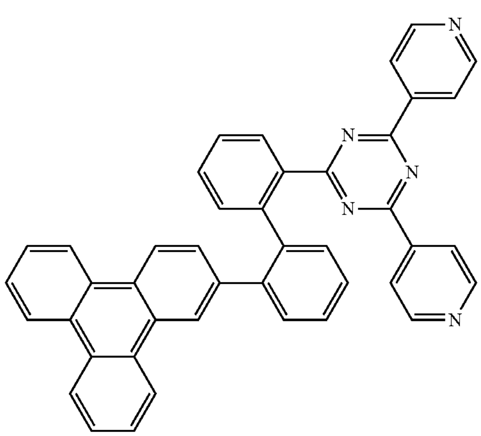
A-74
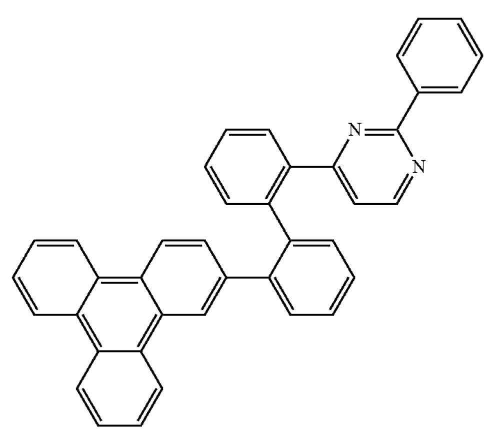

-continued
A-75
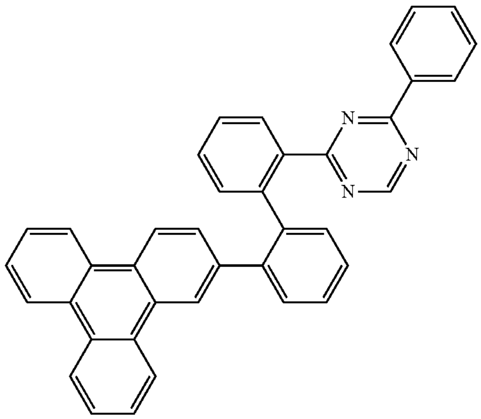
A-76
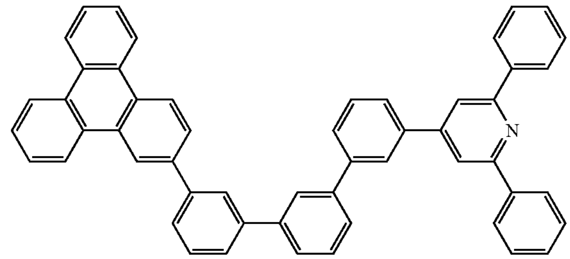
A-77
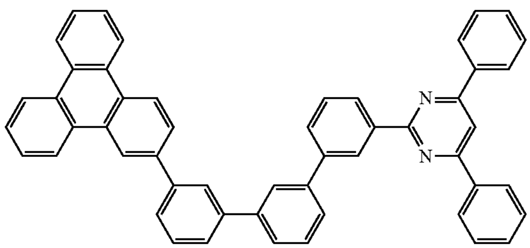
A-78
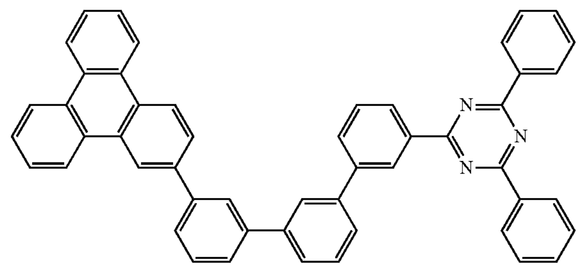
A-79
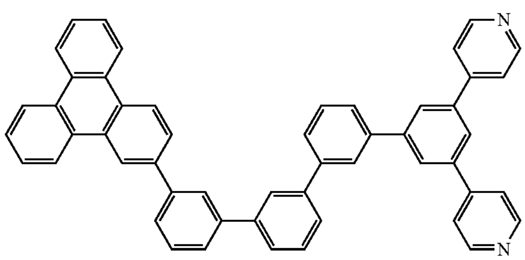
A-80
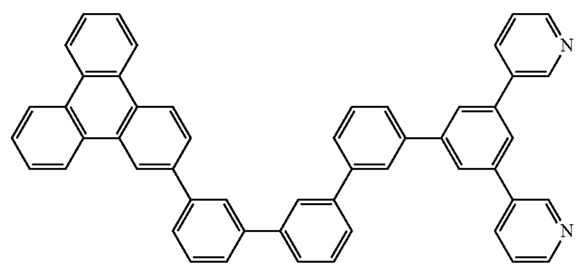
A-81
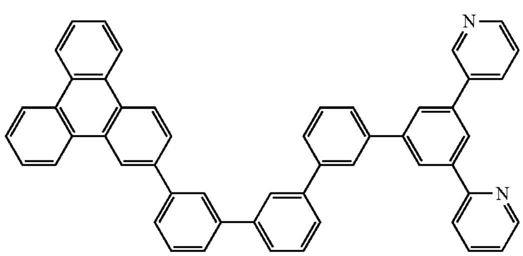
A-82
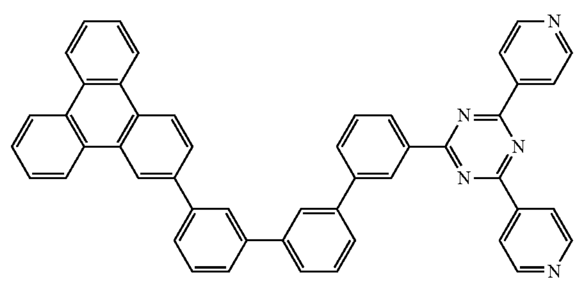
A-83
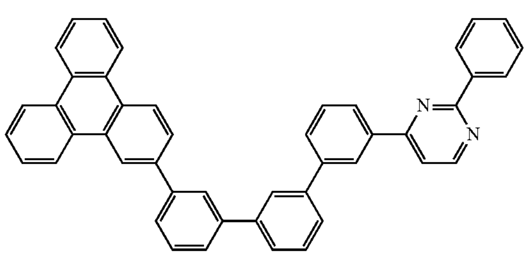
A-84
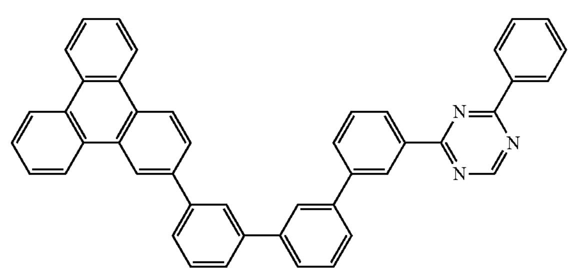

-continued
A-85
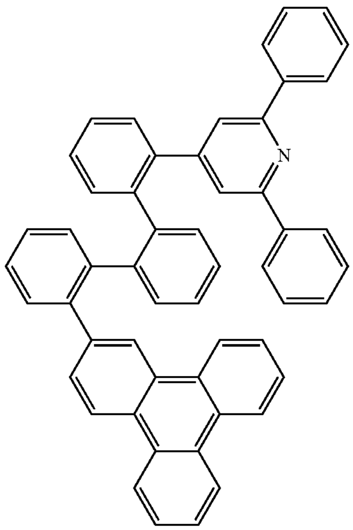
A-86
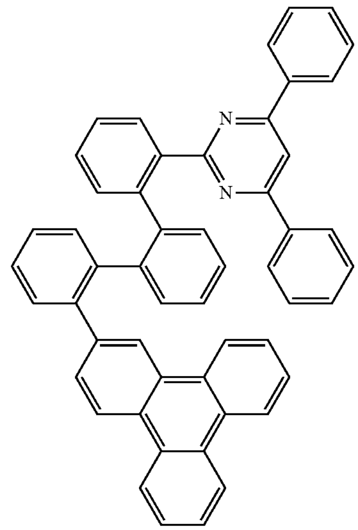
A-87
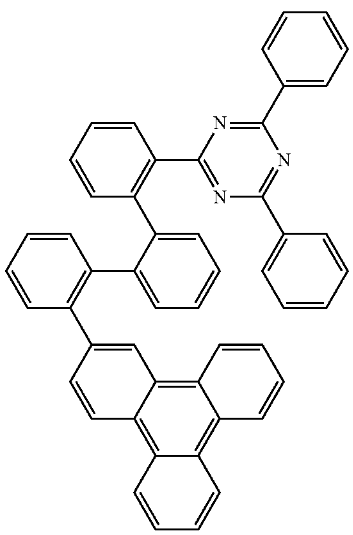
A-88
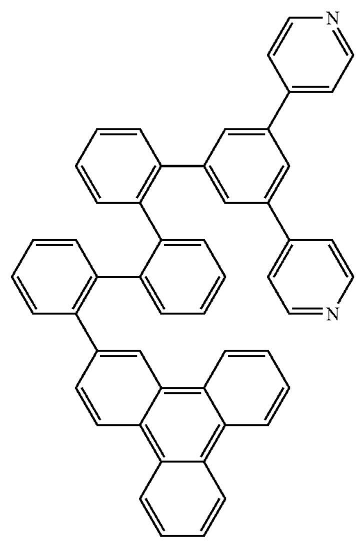
A-89
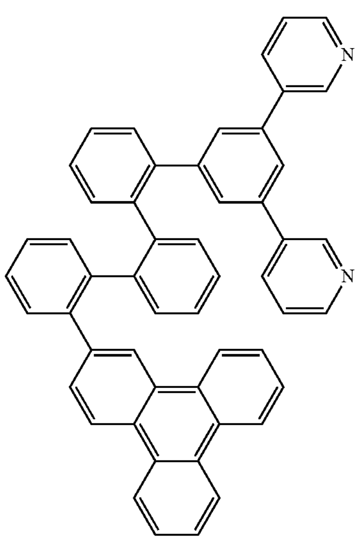
A-90
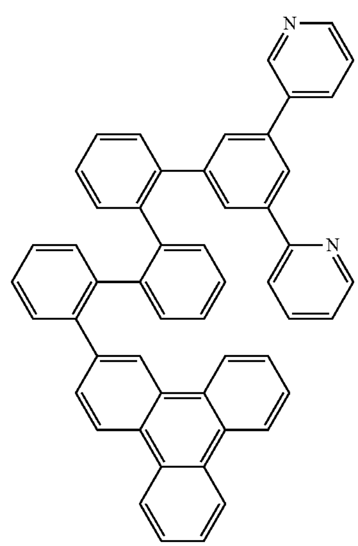

-continued
A-91
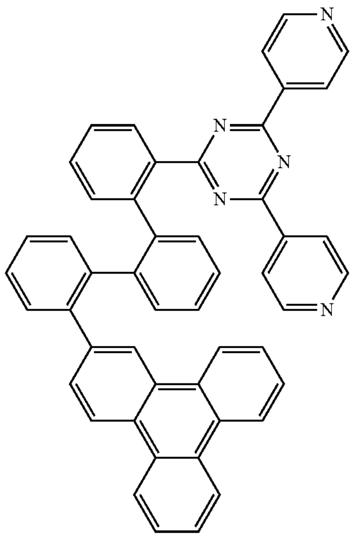
A-92
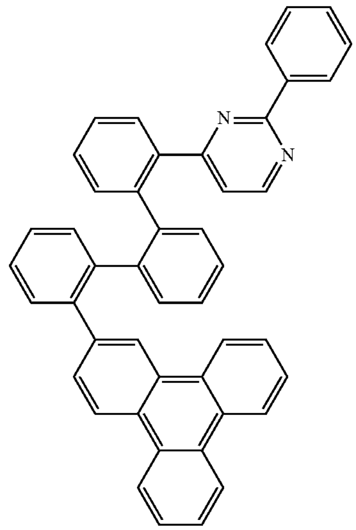
A-93
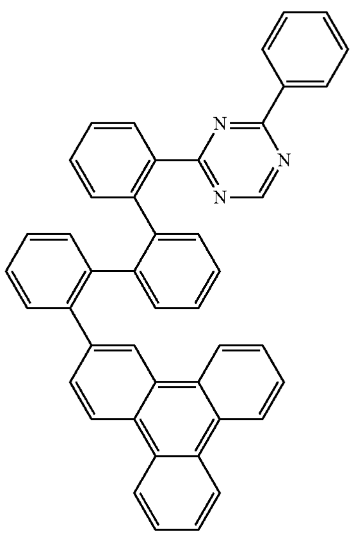
A-94
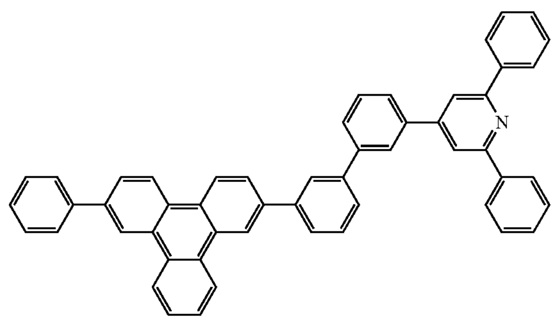
A-95
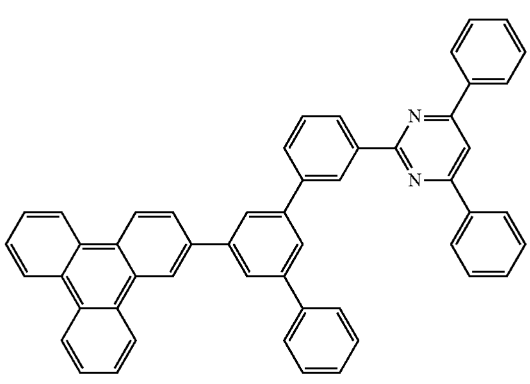
A-96
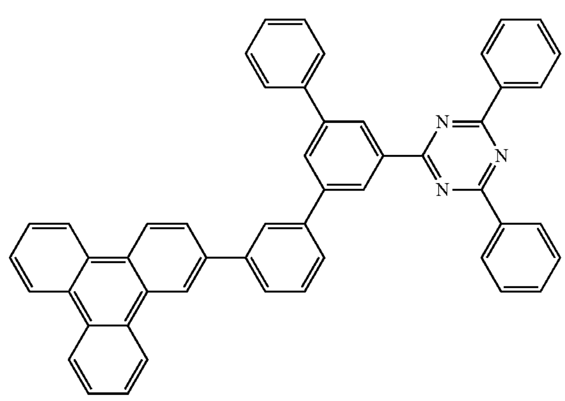

-continued
A-97
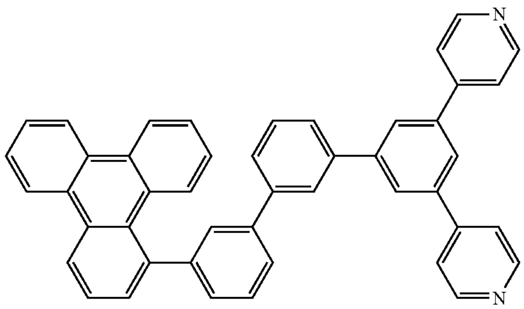
A-98
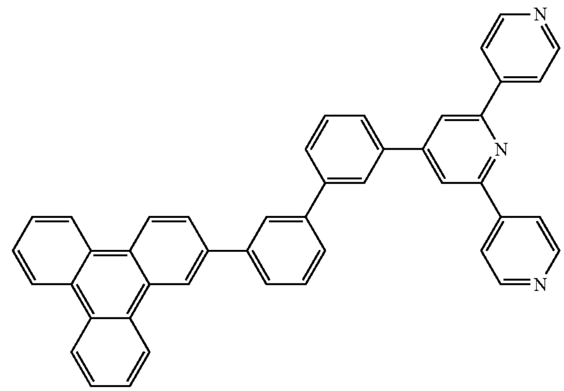
A-99
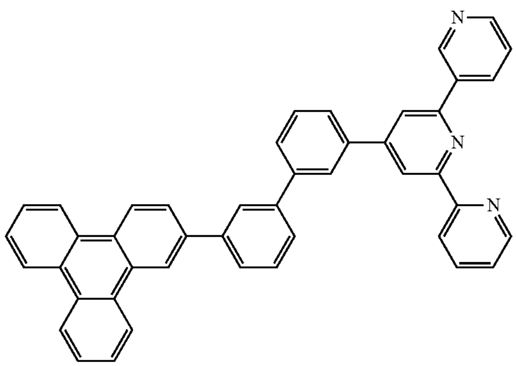
A-100
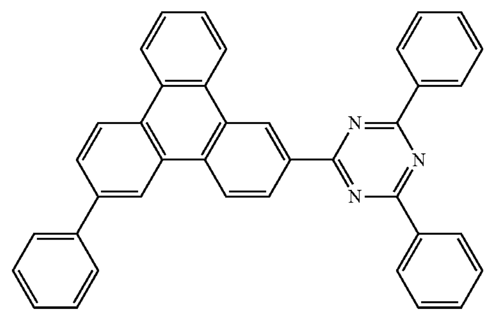
A-101
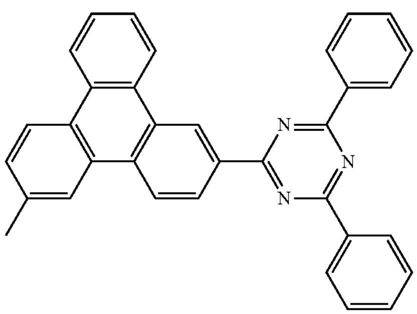
A-102
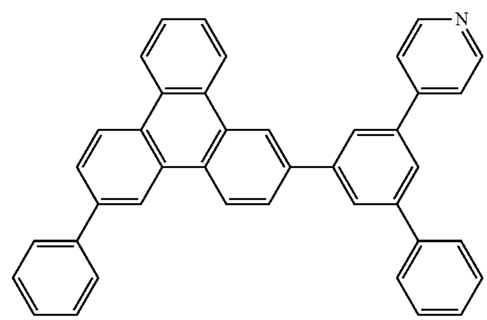
A-103
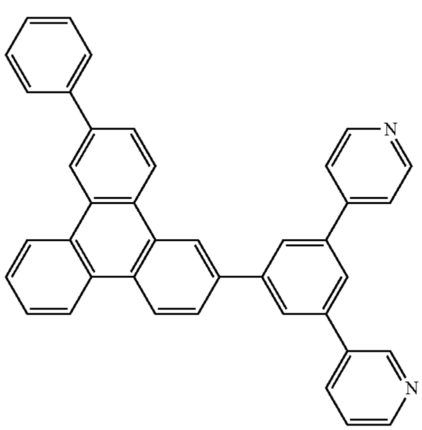
A-104
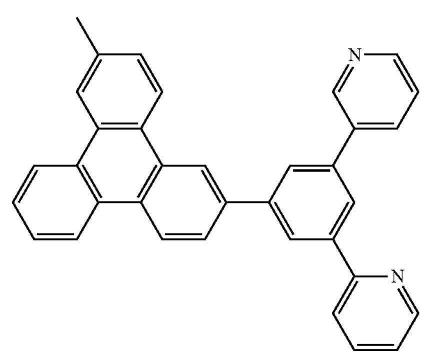

-continued
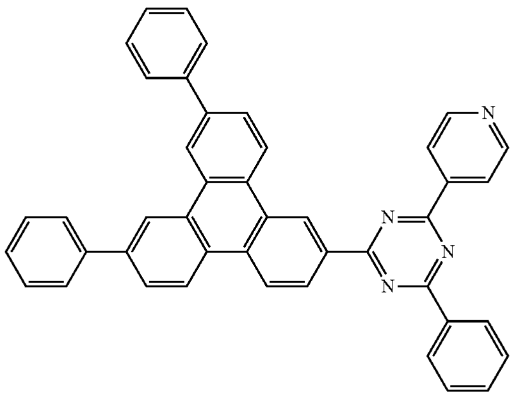
A-105
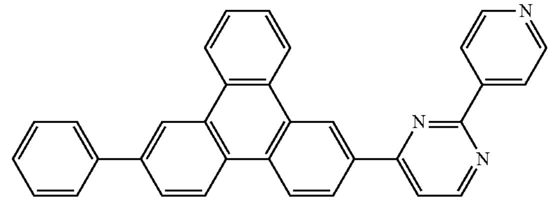
A-106
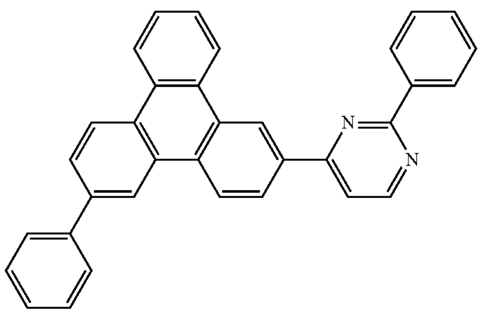
A-107
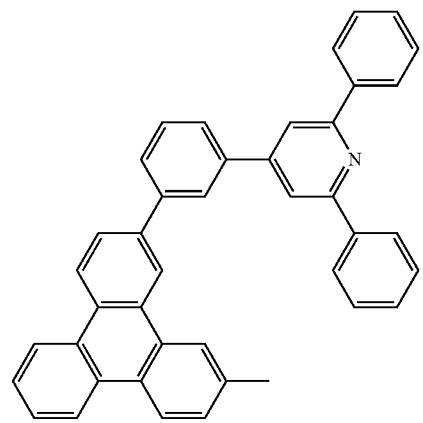
A-108
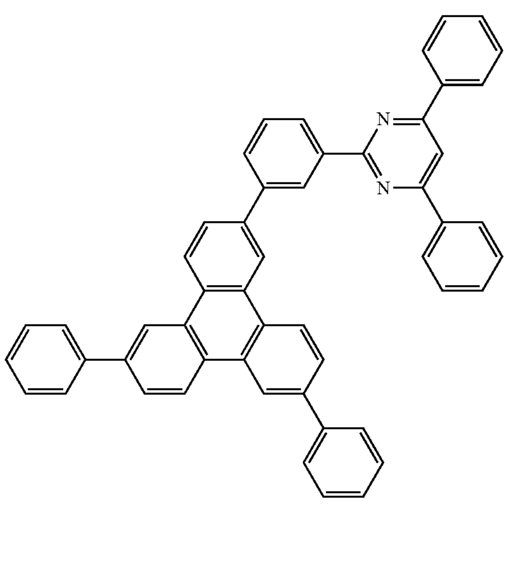
A-109
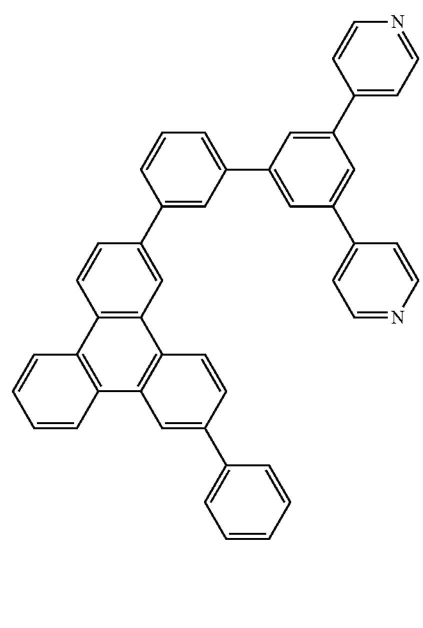
A-110

-continued
A-111
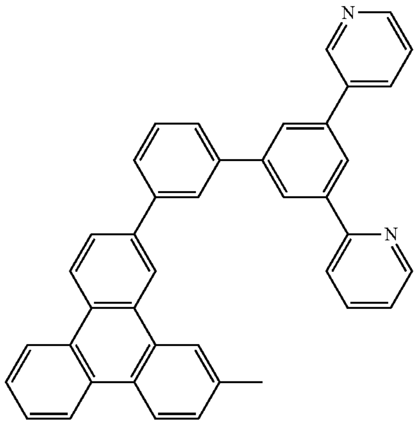
A-112
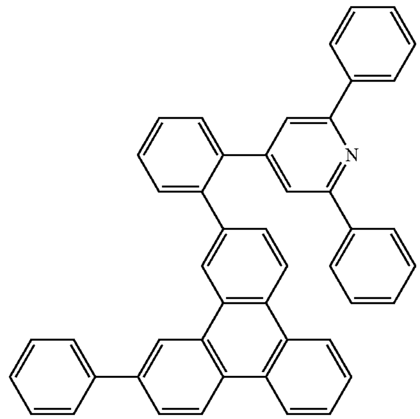
A-113
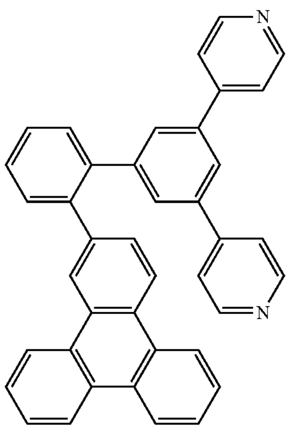
A-114
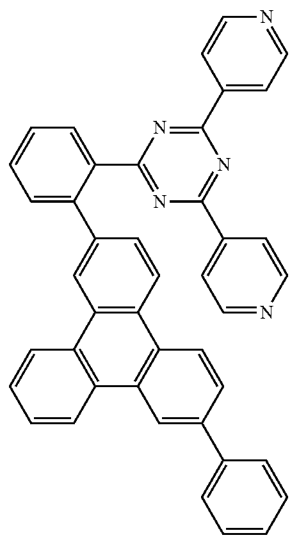
A-115
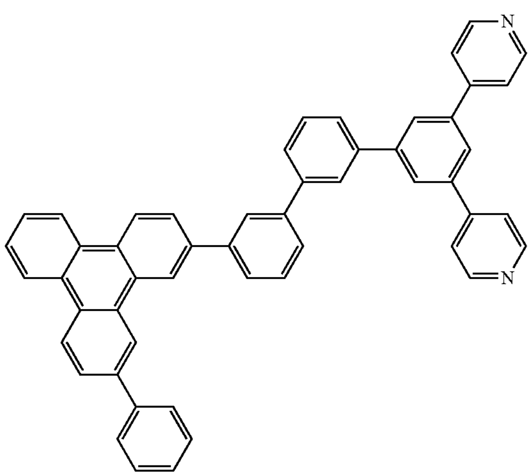
A-116
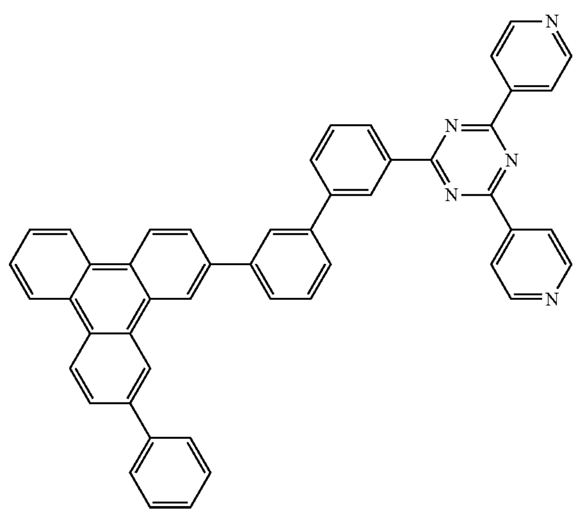

-continued
A-117
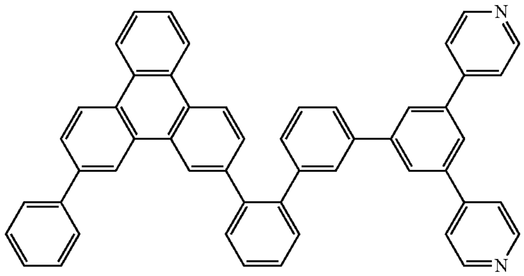
A-118
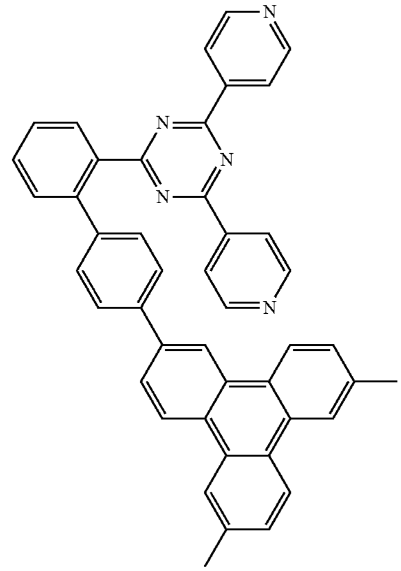
A-119
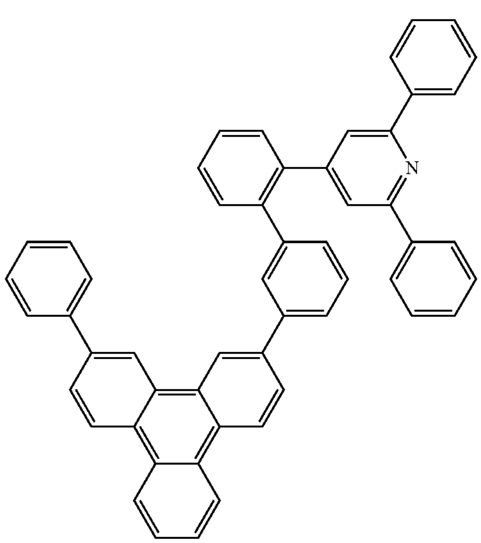
A-120
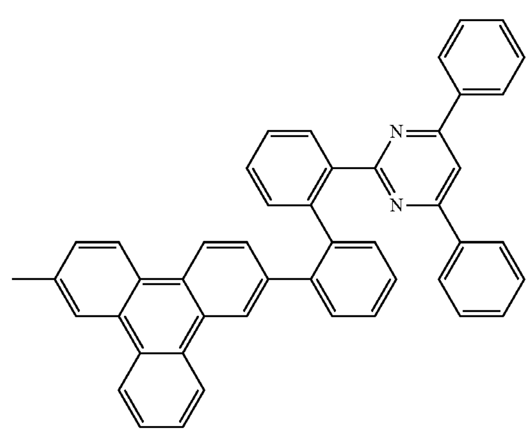

-continued
A-121
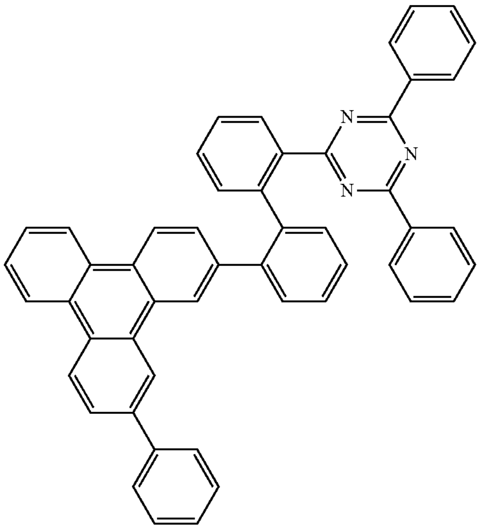
A-122
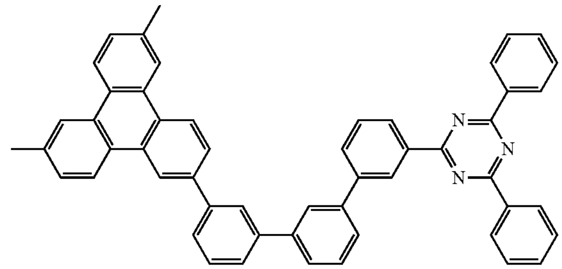
A-123
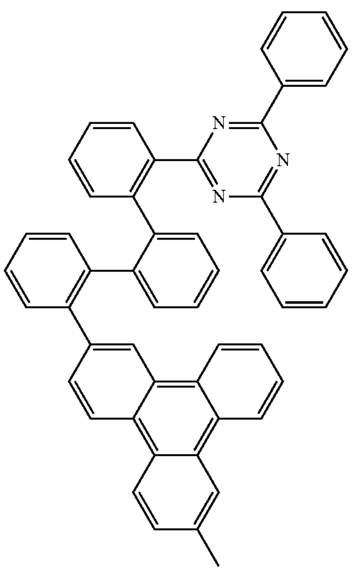
A-124
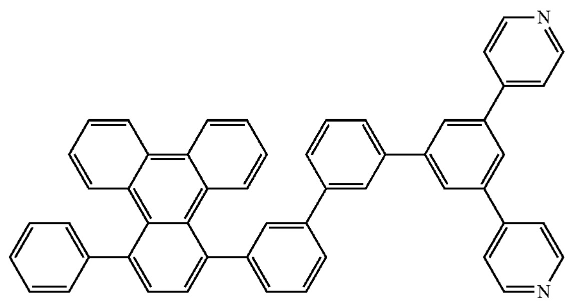
A-125
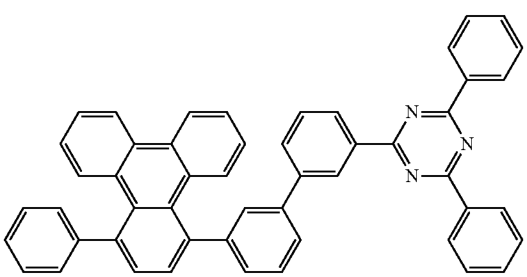
A(1)
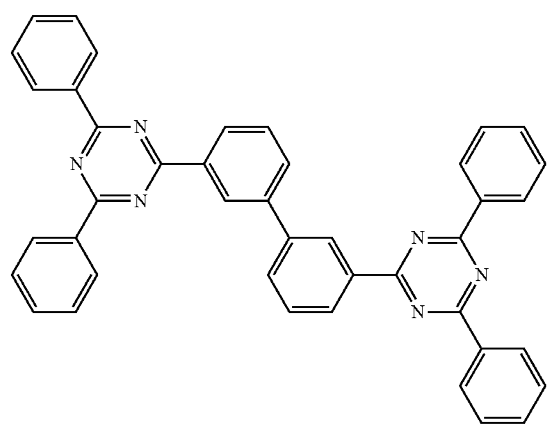

-continued
A(2)
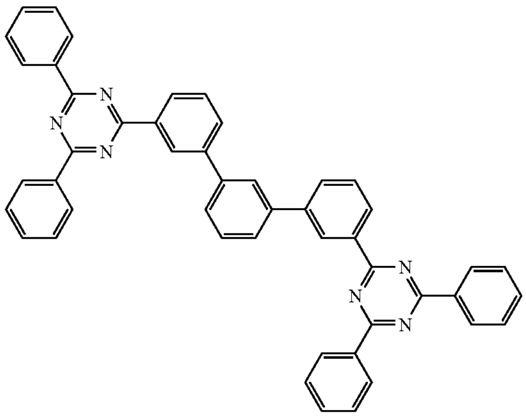
A(3)
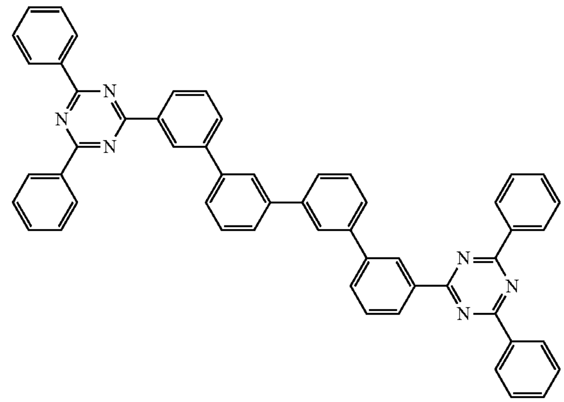
A(4)
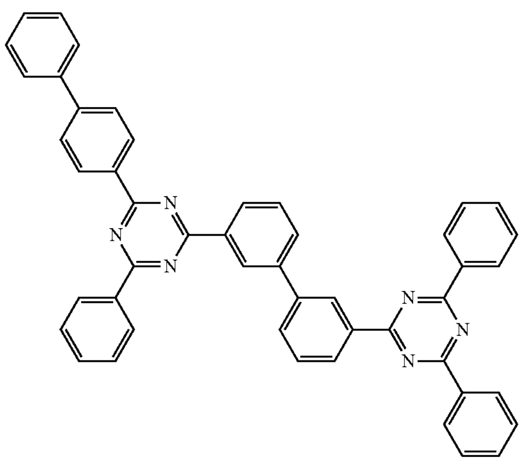
A(5)
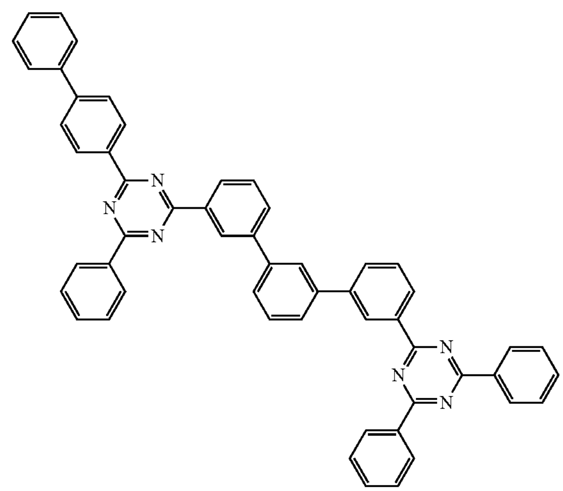
A(6)
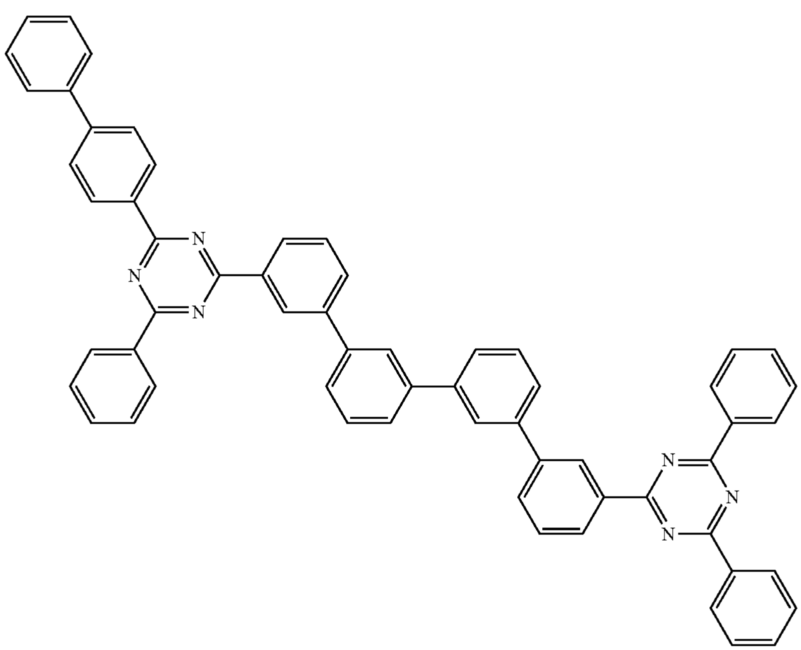

-continued
A(7)
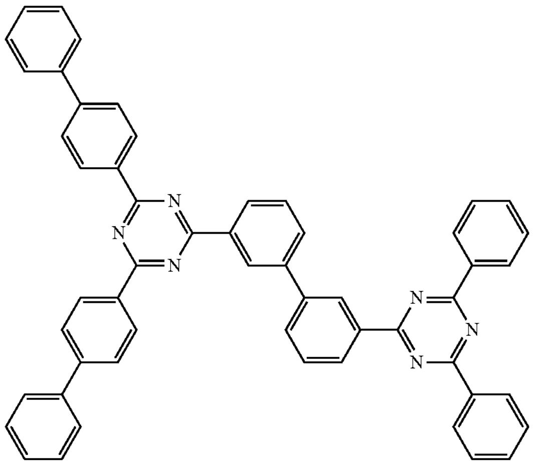
A(8)
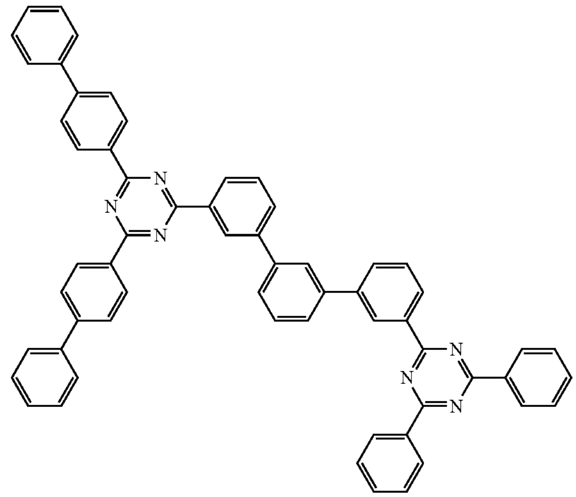
A(9)
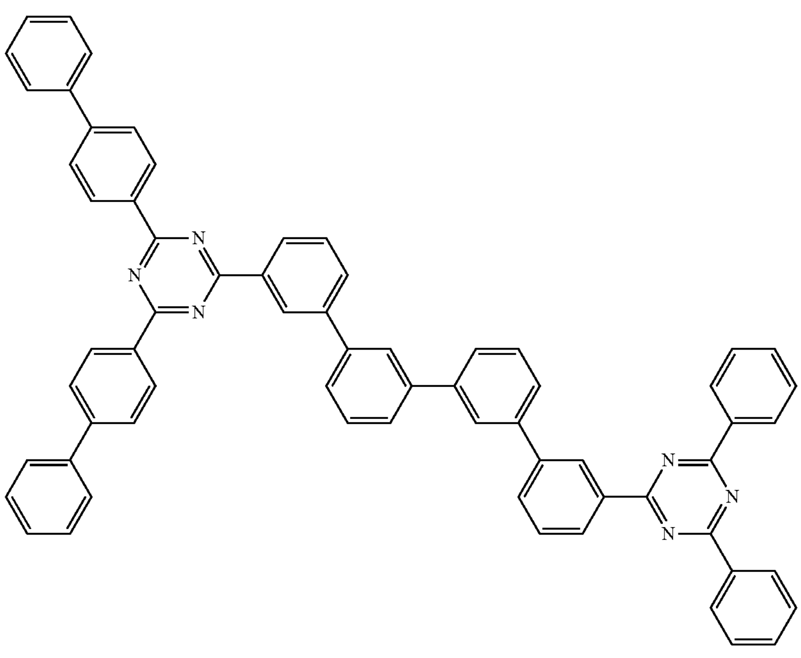

-continued
A(10)
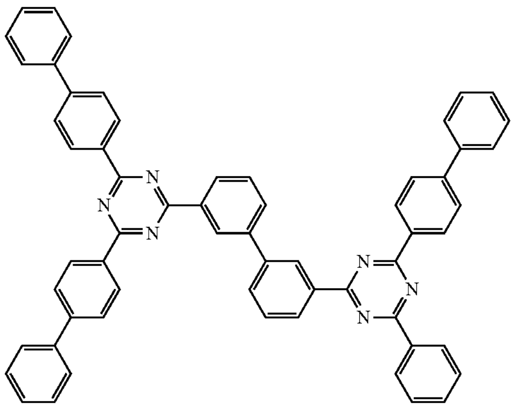
A(11)
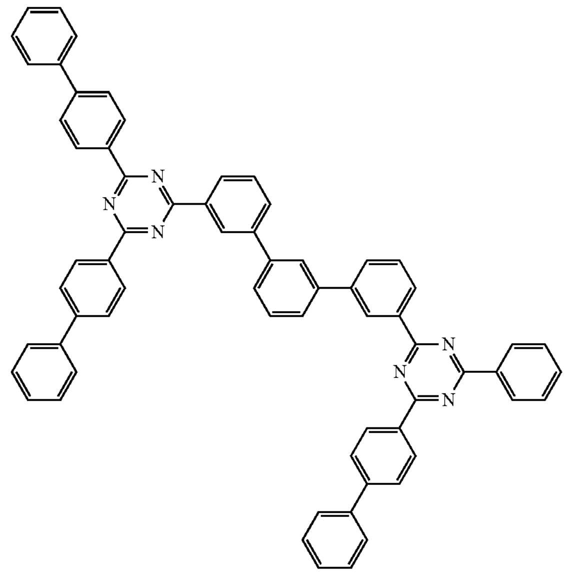
A(12)
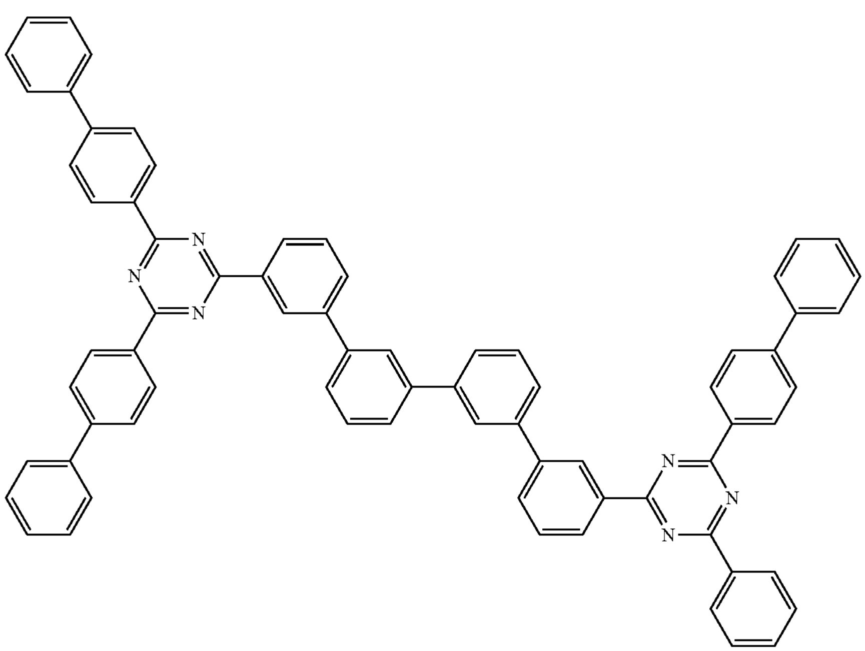

-continued
A(13)
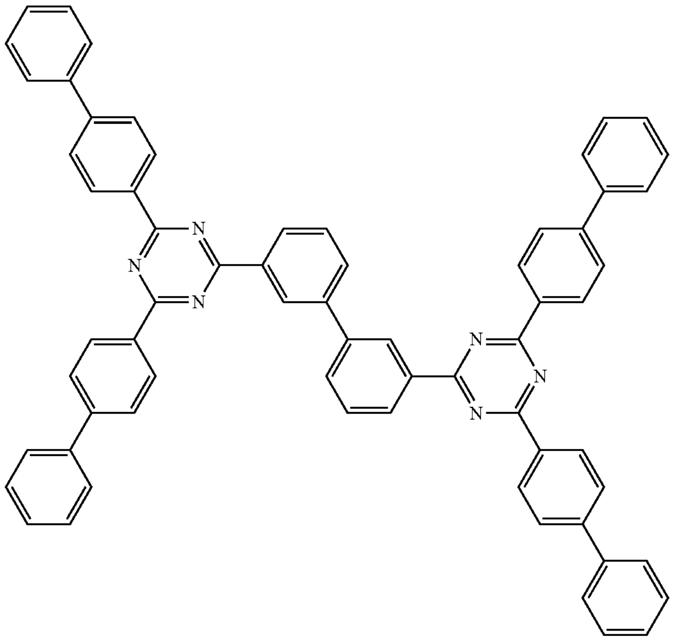
A(14)
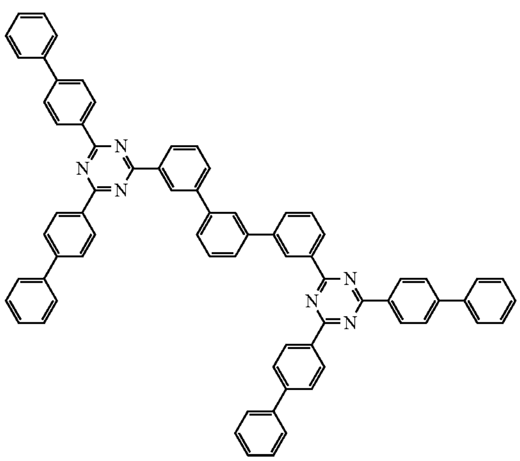
A(15)
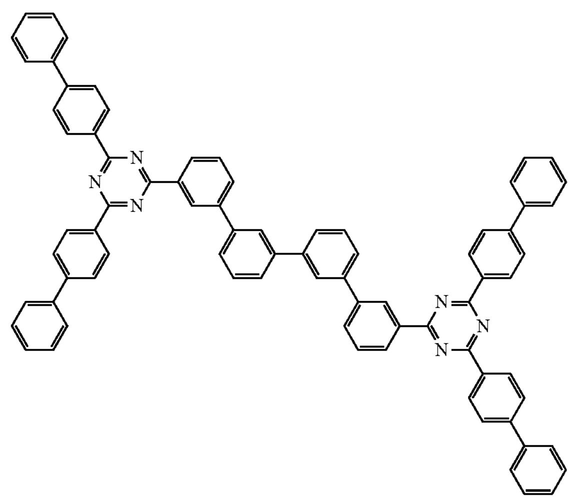
A(16)
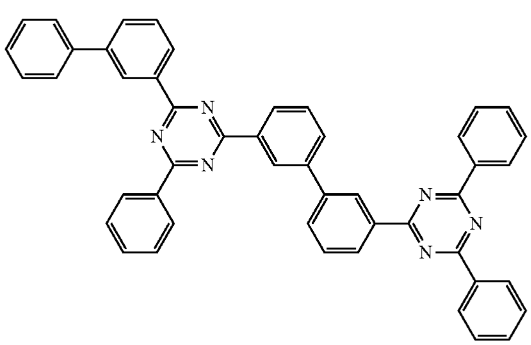

-continued
A(17)
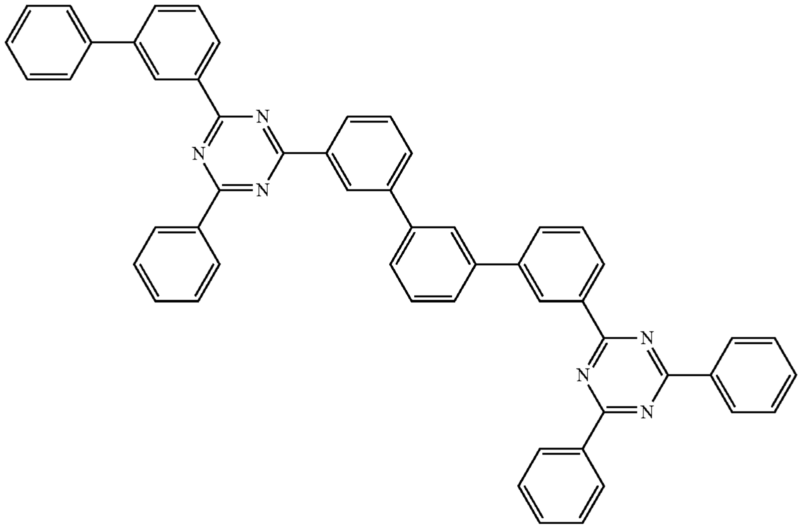
A(18)
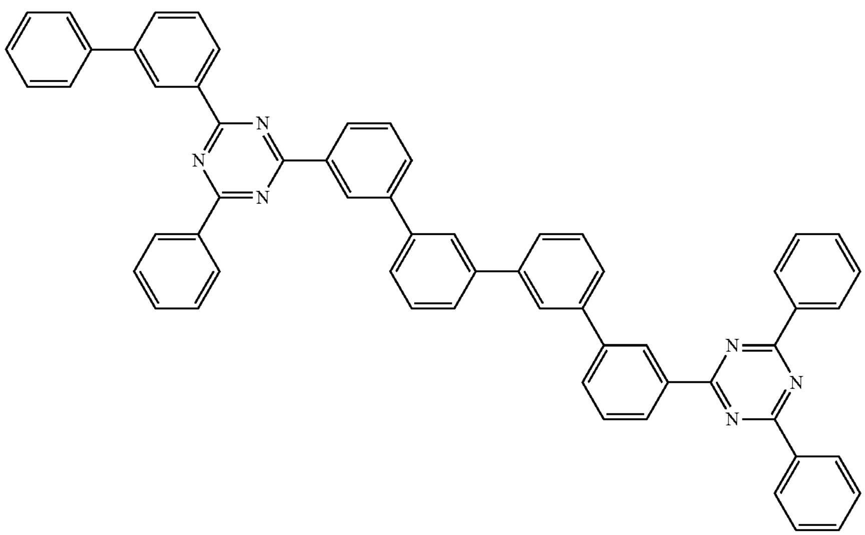
A(19)
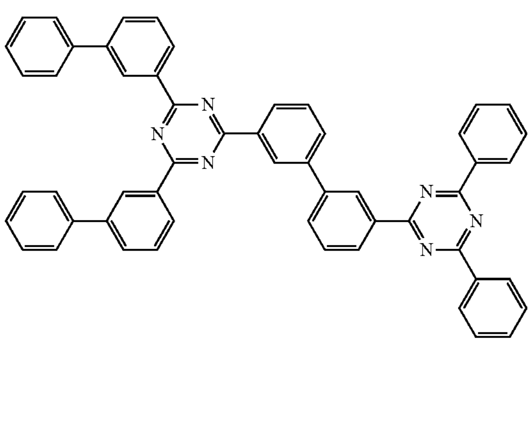

-continued
A(20)
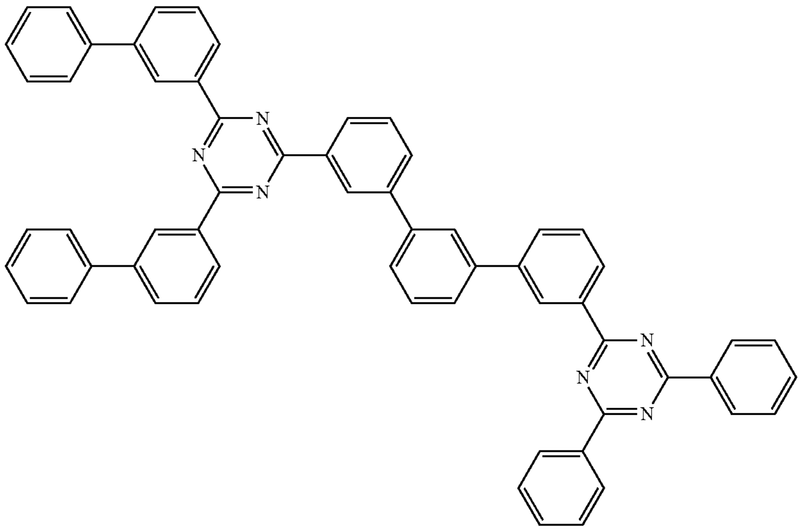
A(21)
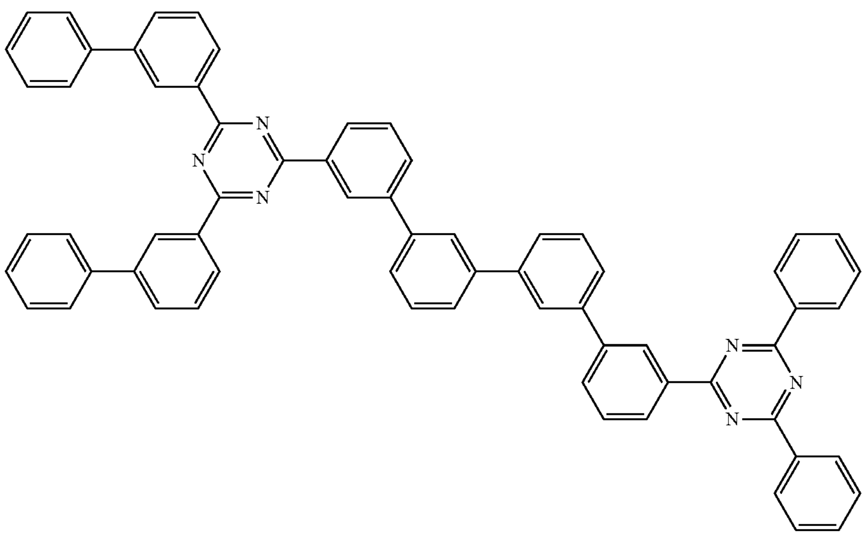
A(22)
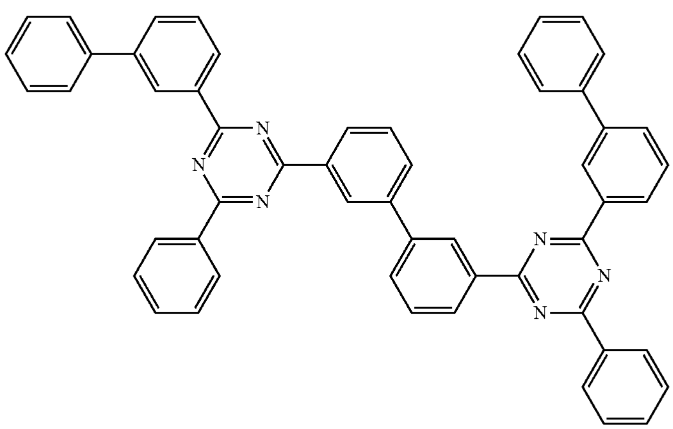

-continued
A(23)
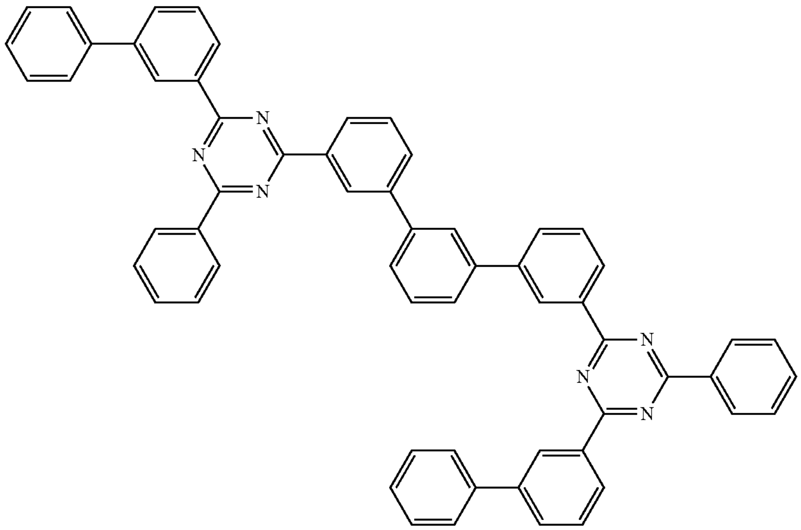
A(24)
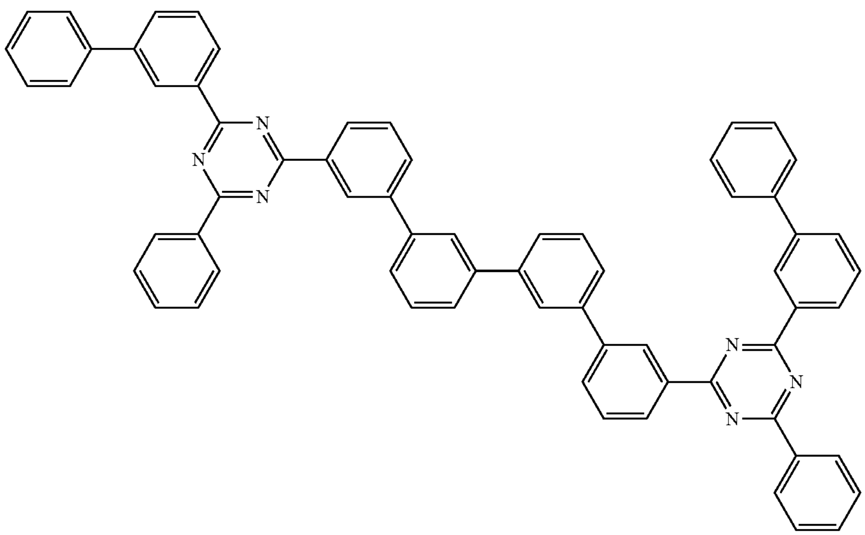
A(25)
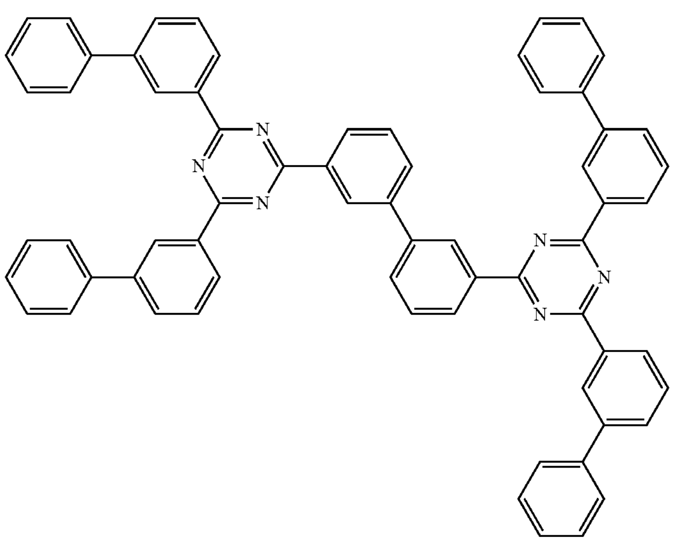

-continued
A(26)
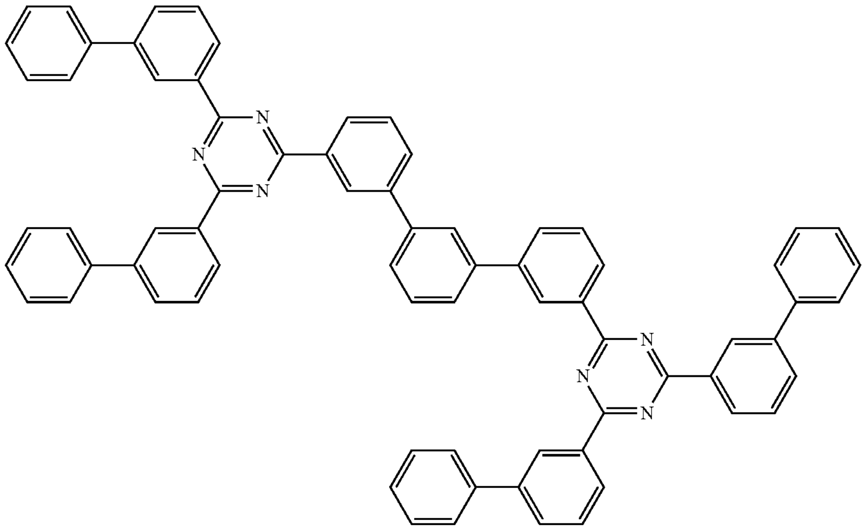
A(27)
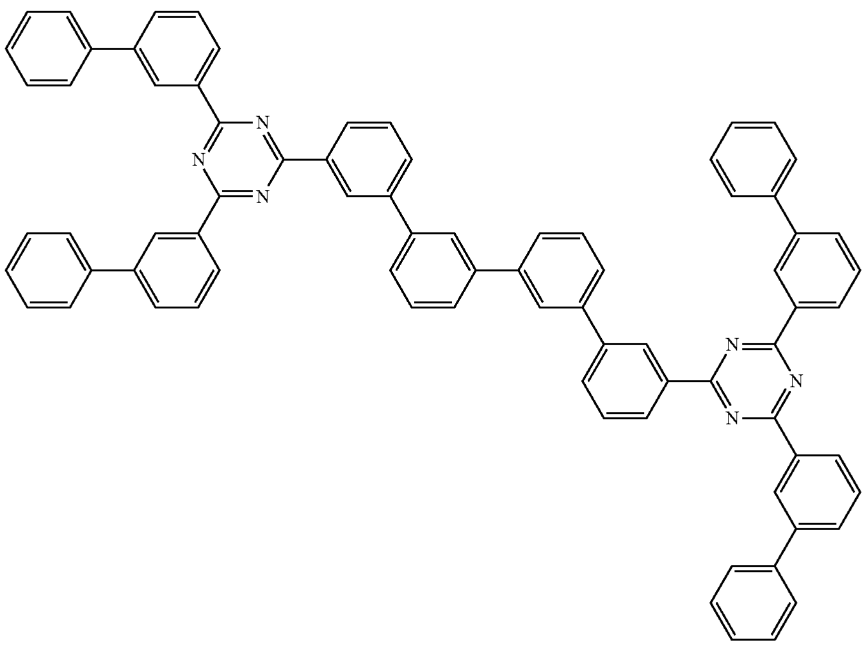
A(28)
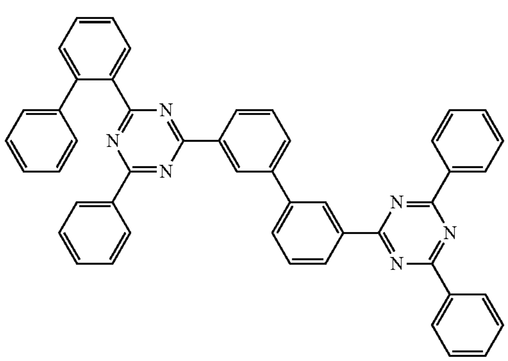
A(29)
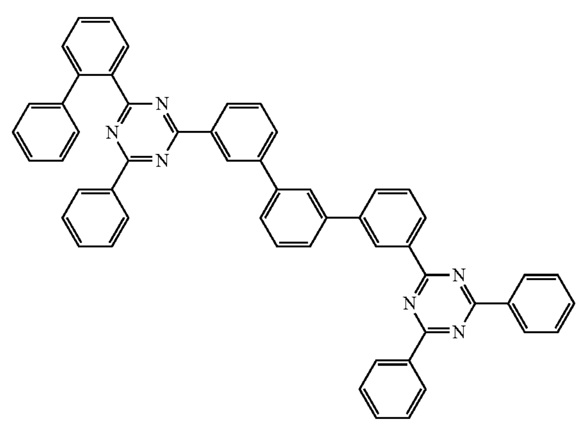

-continued
A(30)
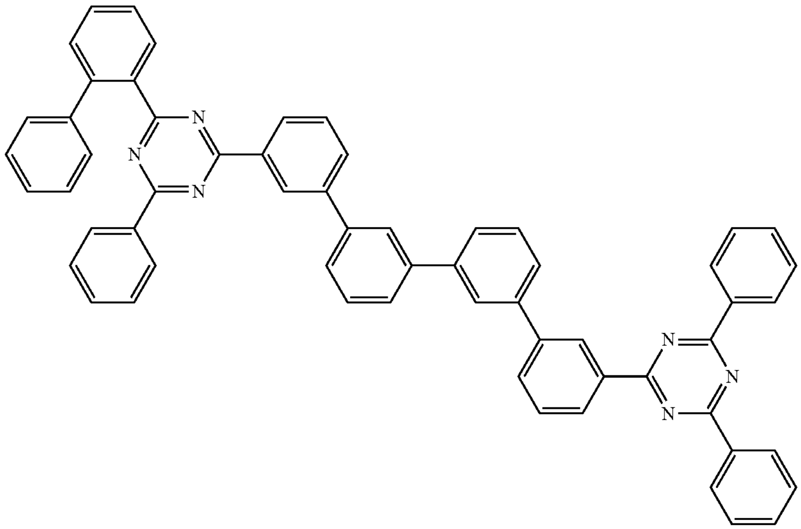
A(31)
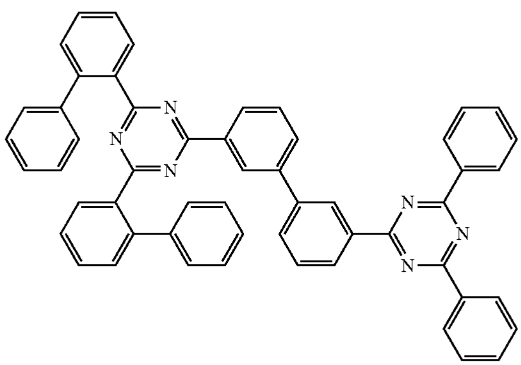
A(32)
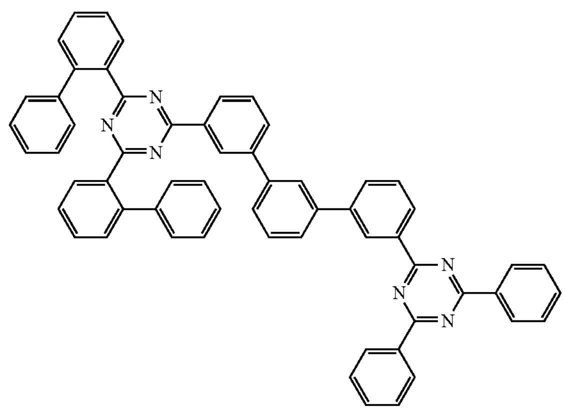
A(33)
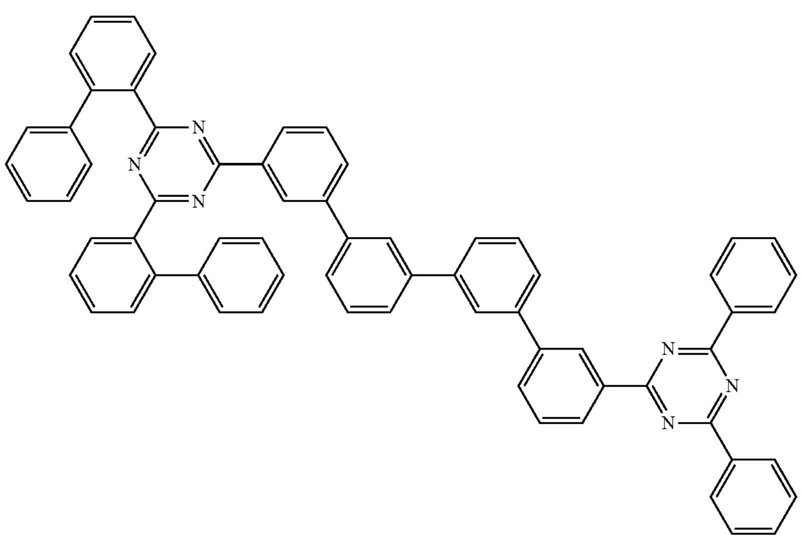

-continued
A(34)
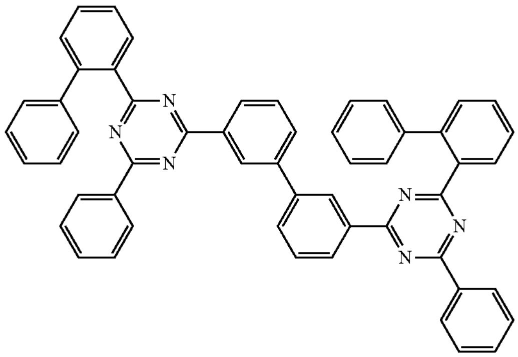
A(35)
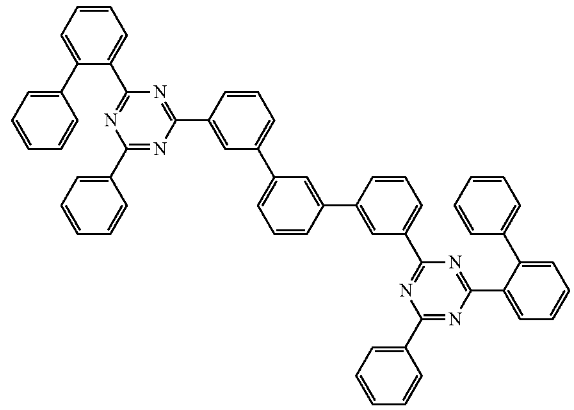
A(36)
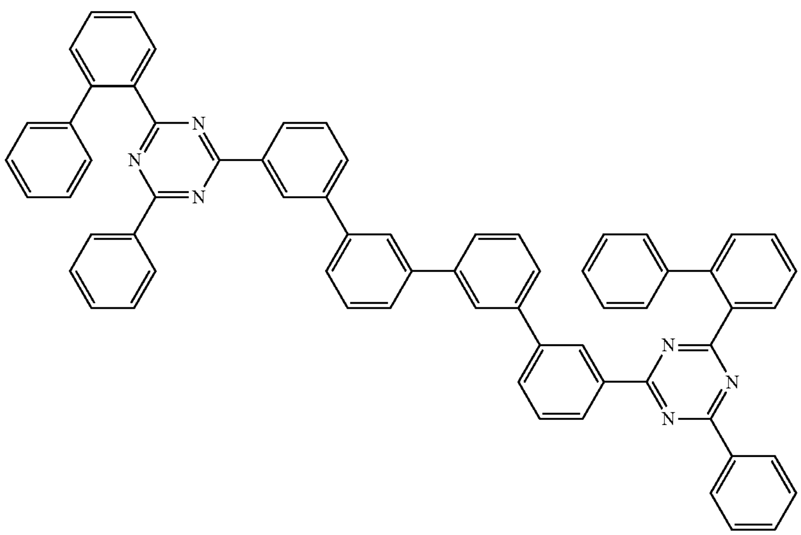
A(37)
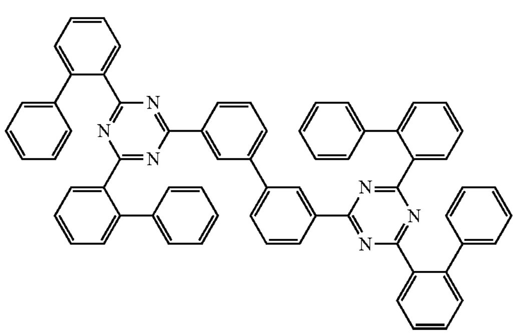
A(38)
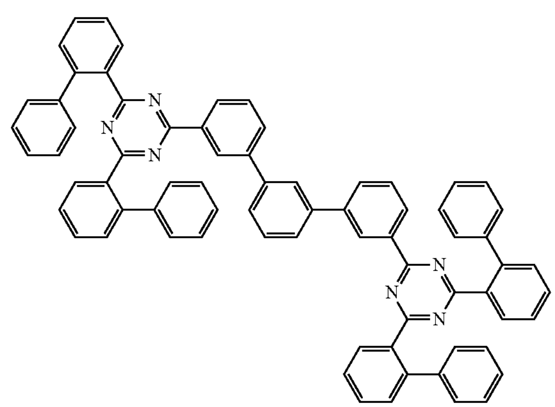

-continued
A(39)
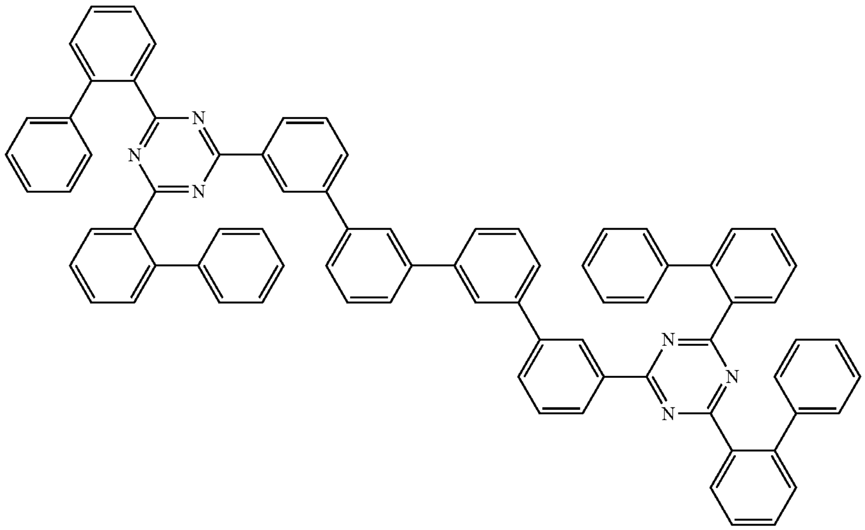
A(40)
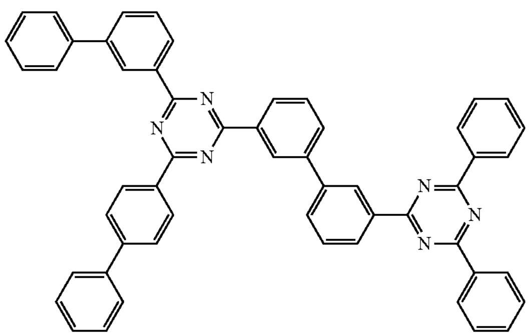
A(41)
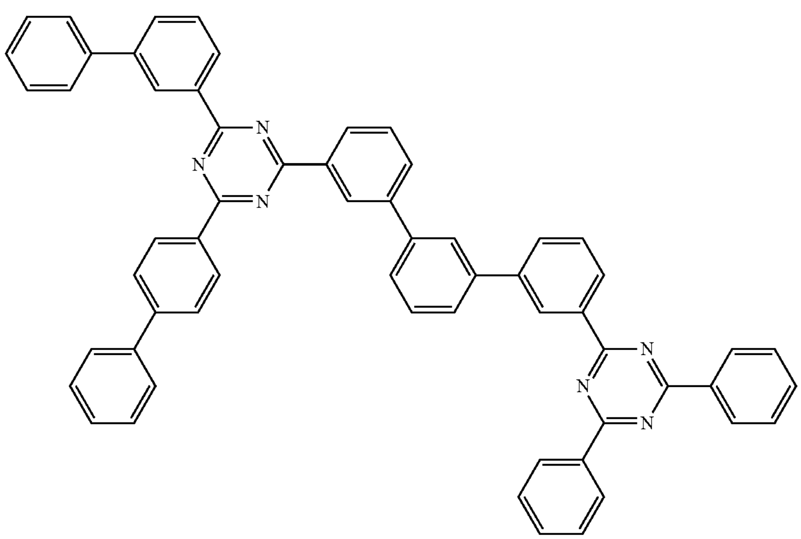

-continued
A(42)
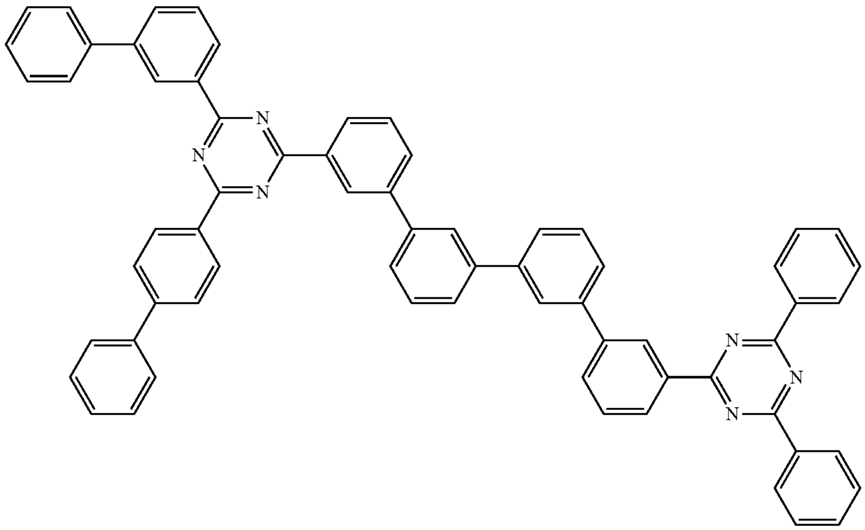
A(43)
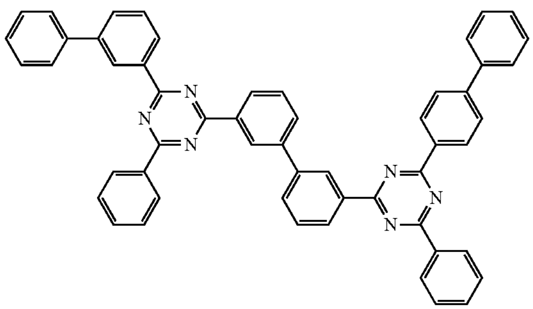
A(44)
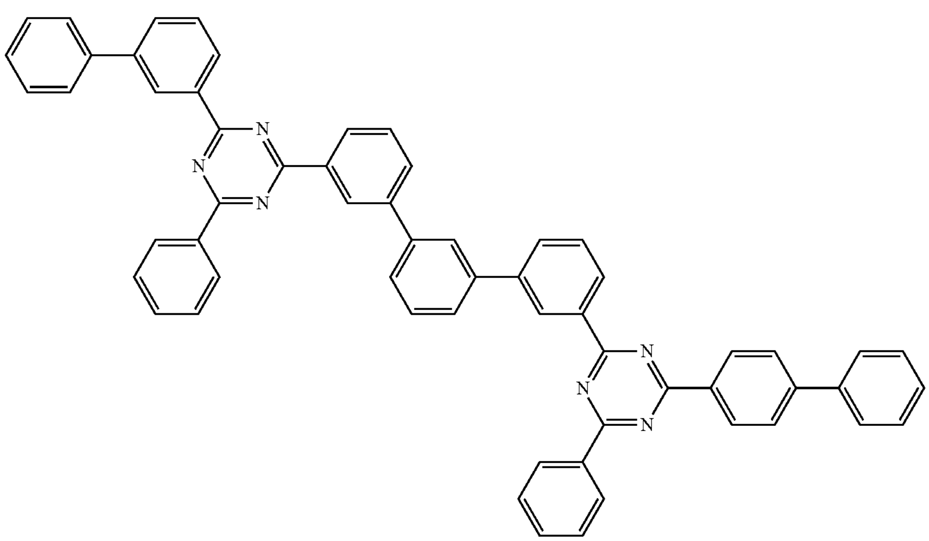

-continued
A(45)
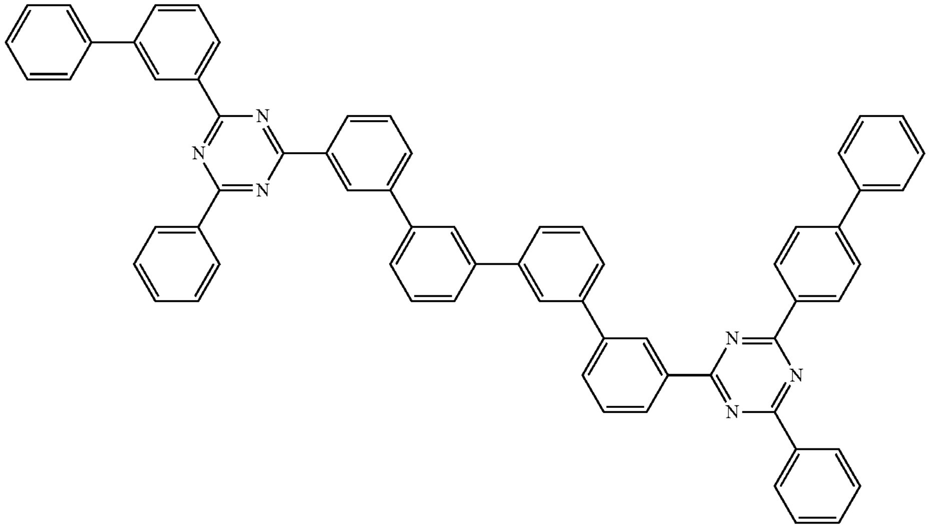
A(46)
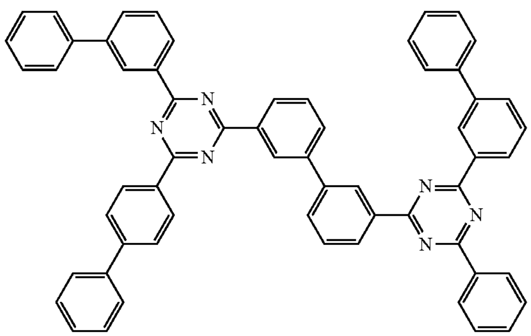
A(47)
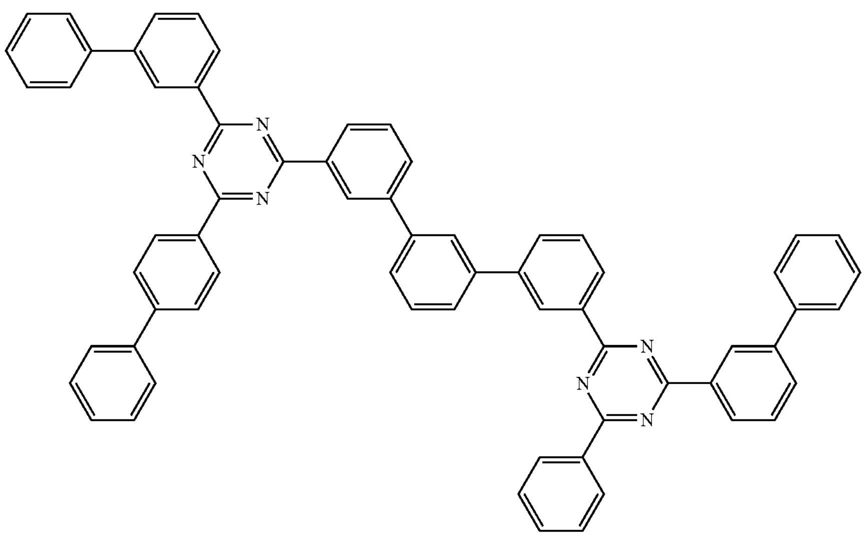

-continued
A(48)
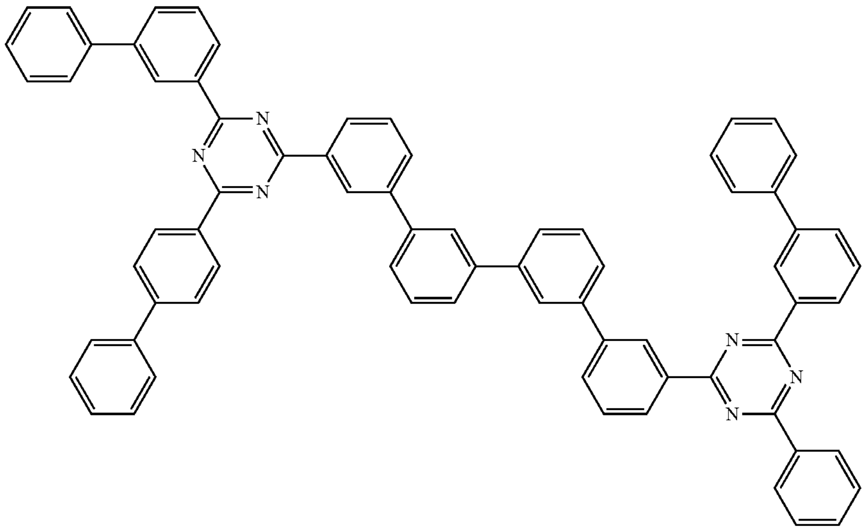
A(49)
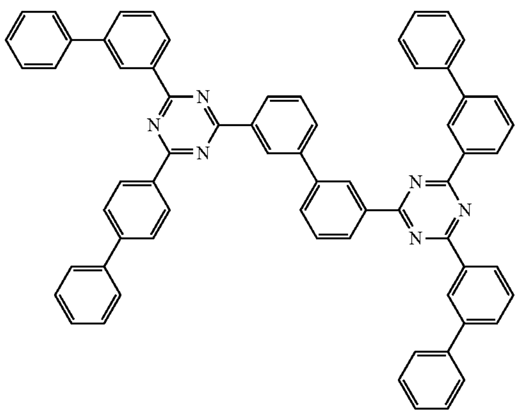
A(50)
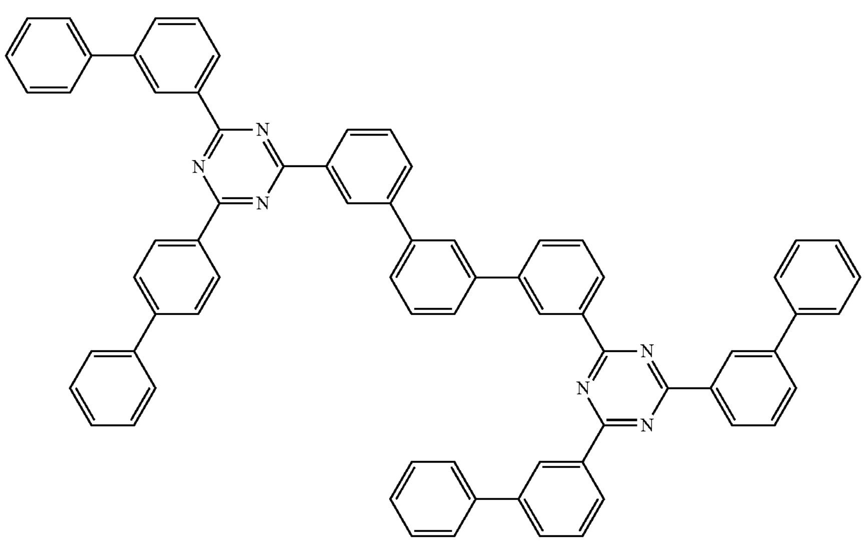

-continued
A(51)
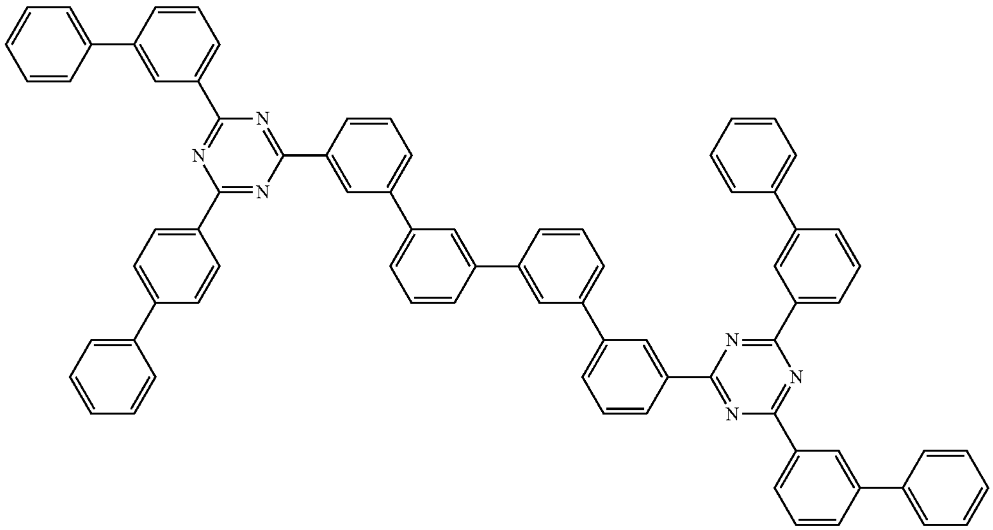
A(52)
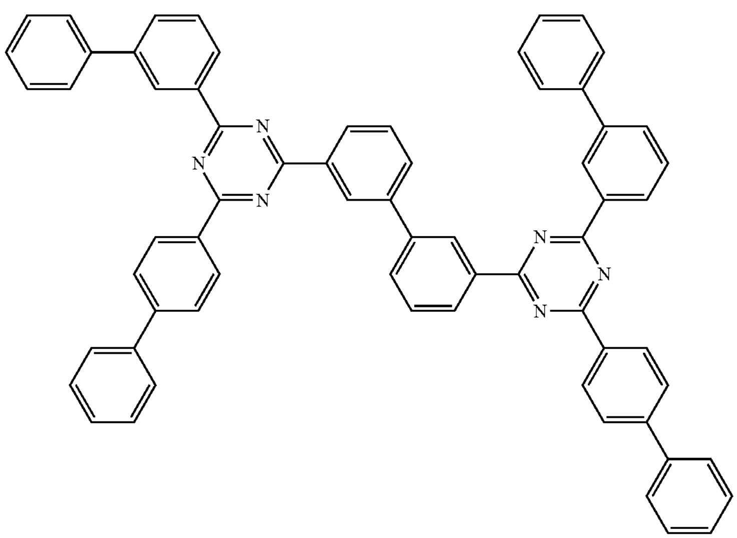

-continued
A(53)
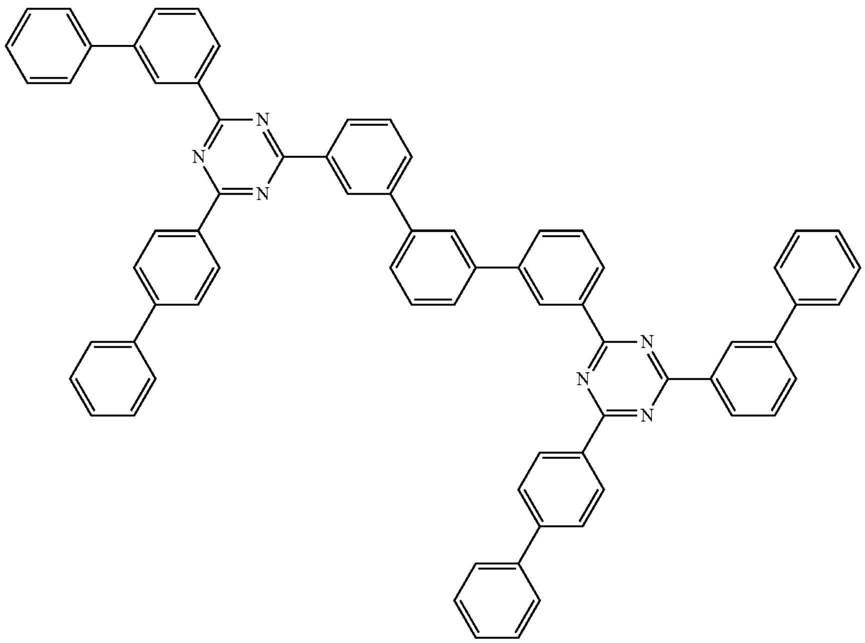
A(54)
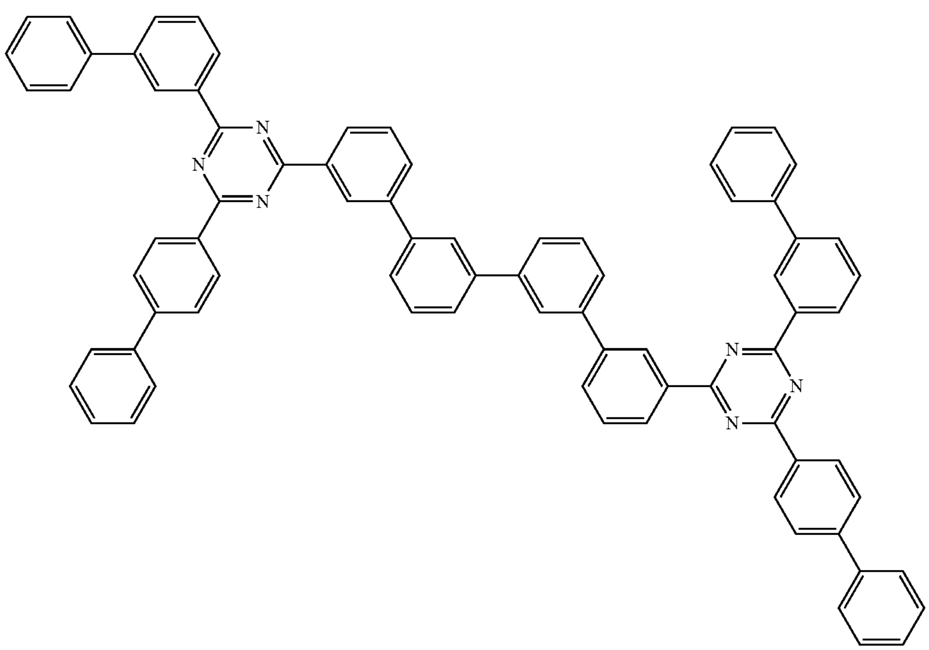

-continued
A(55)
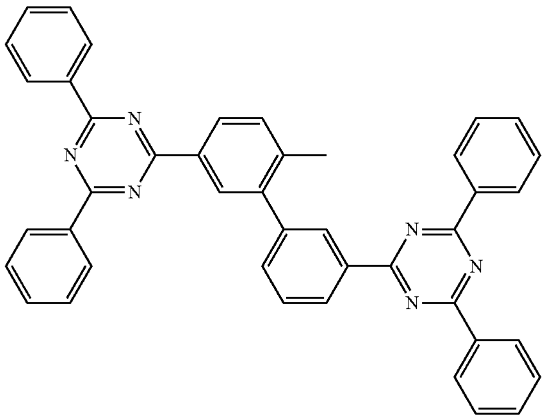
a(56)
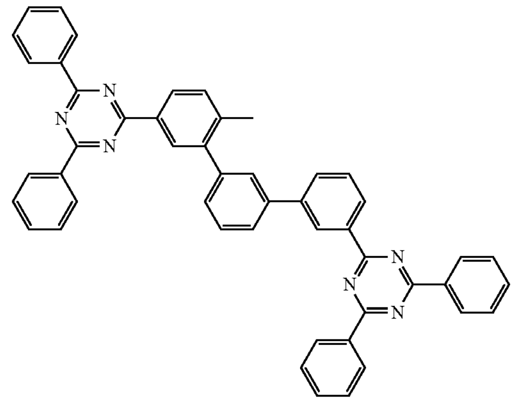
A(57)
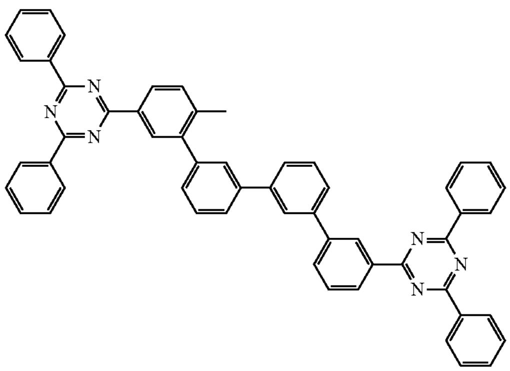
A(58)
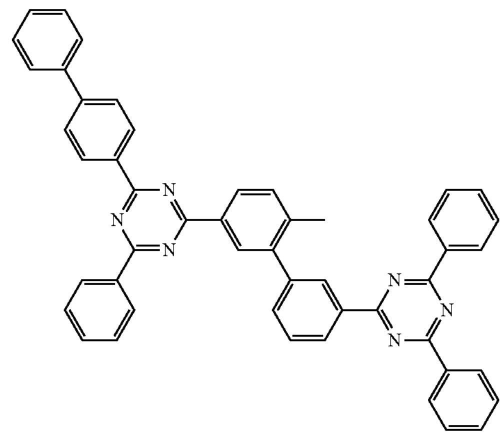
A(59)
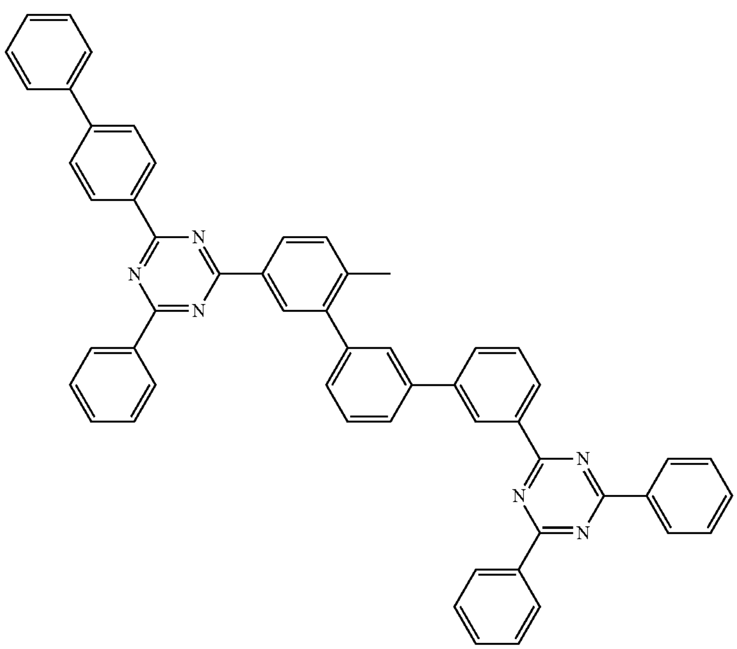

-continued
A(60)
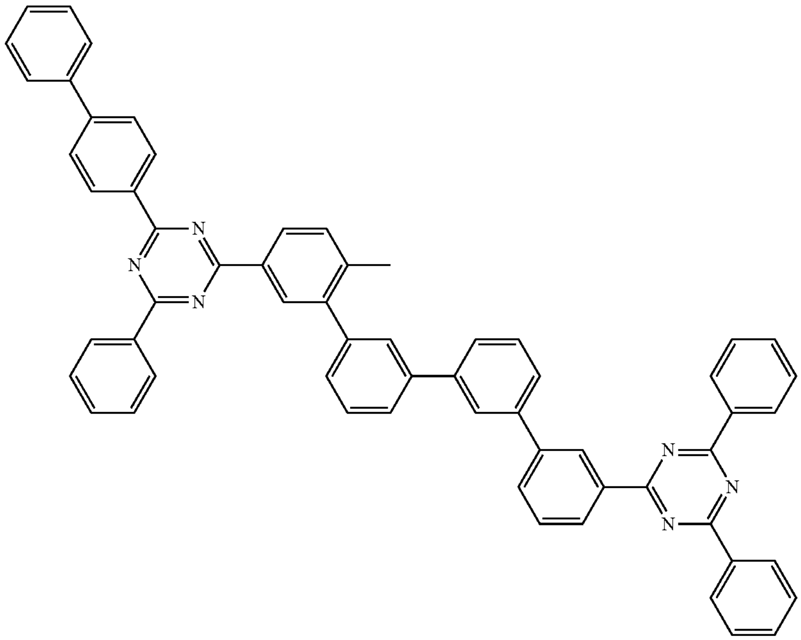
A(61)
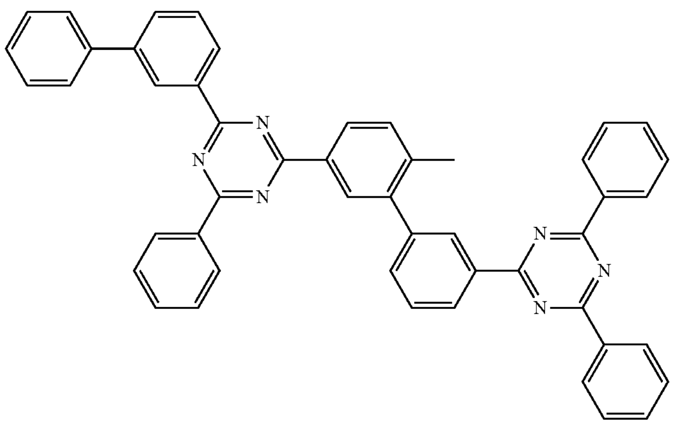
A(62)
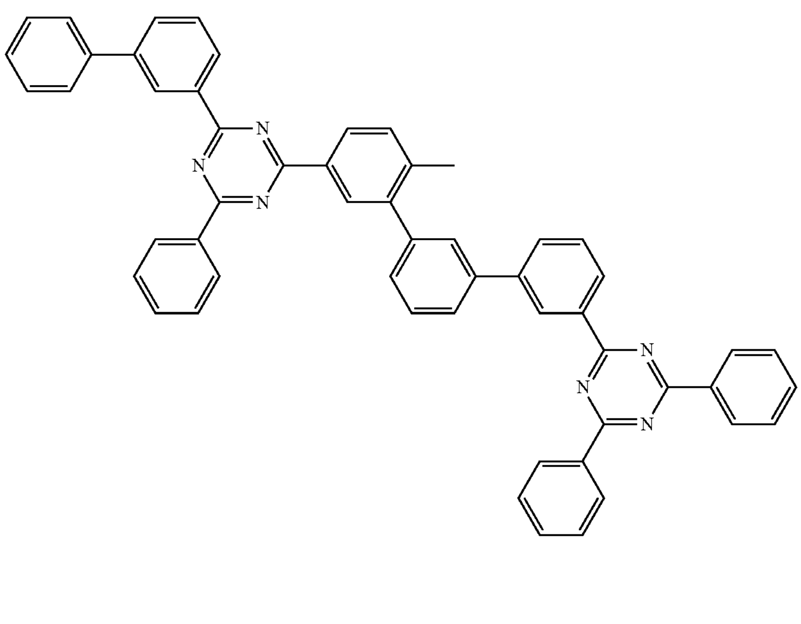

-continued
A(63)
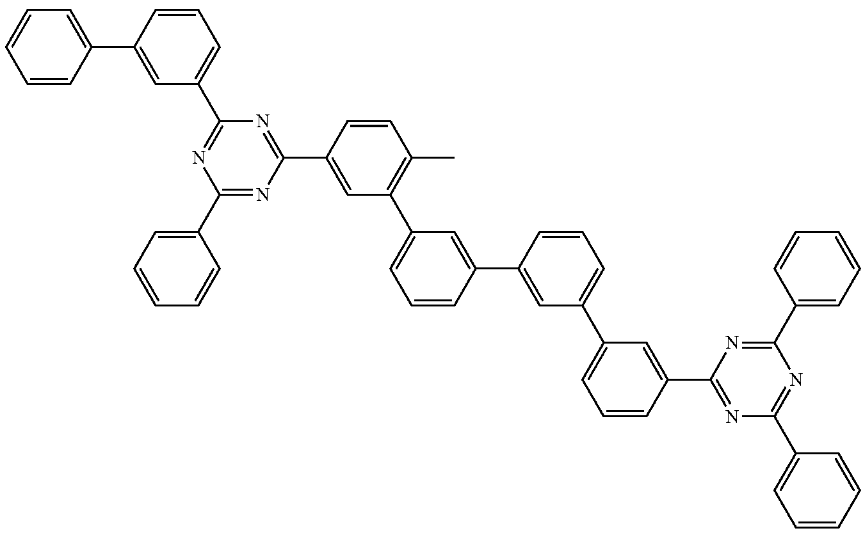
A(64)
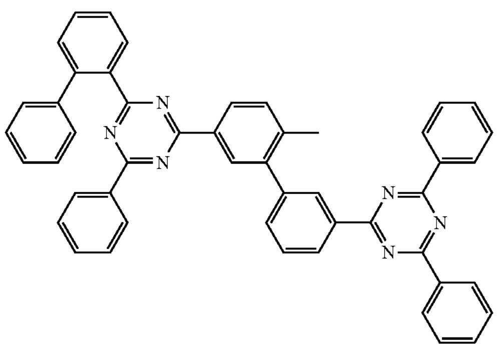
A(65)
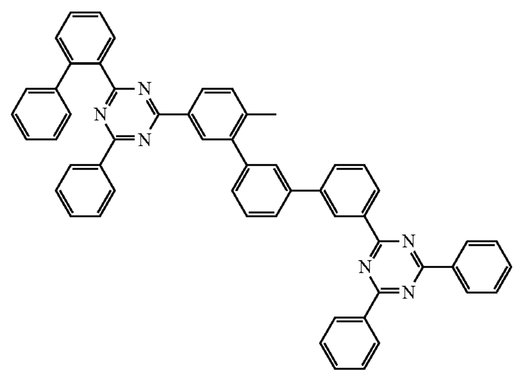
A(66)
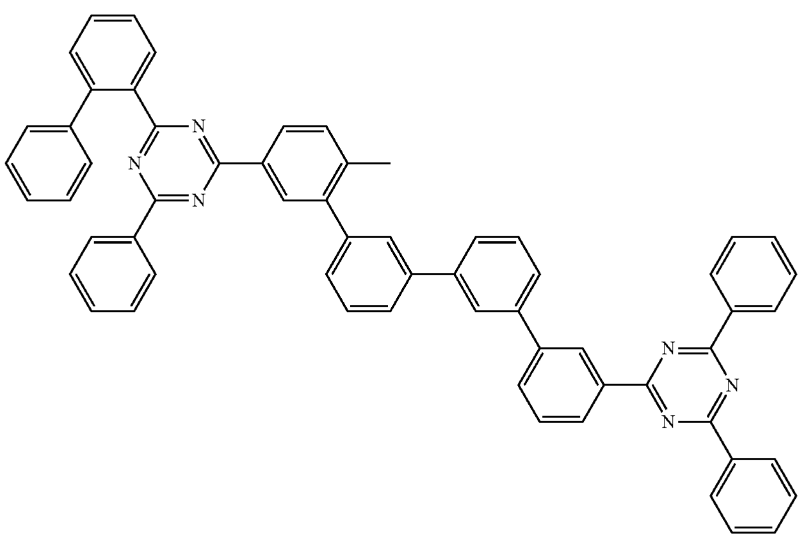

-continued
A(67)
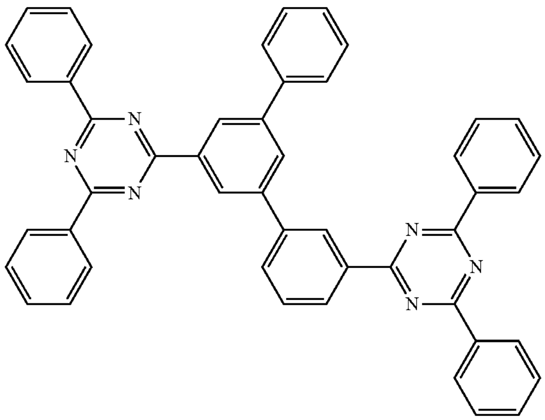
A(68)
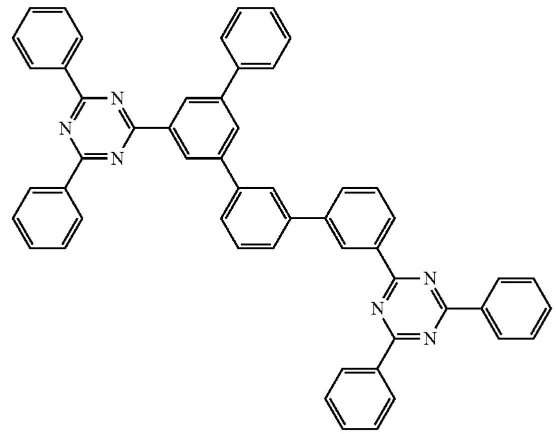
A(69)
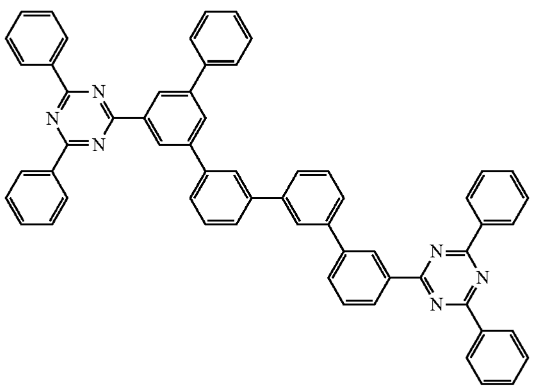
A(70)
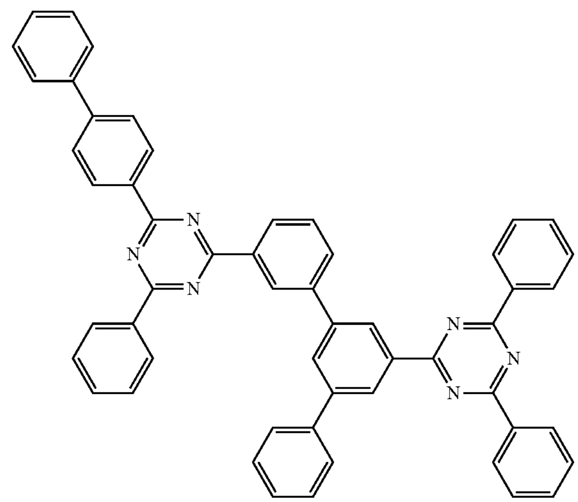
A(71)
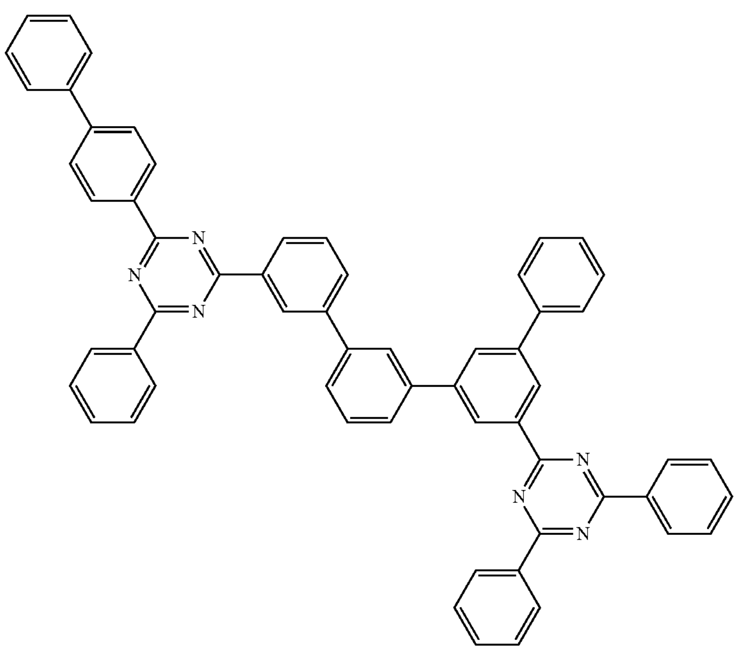

-continued
A(72)
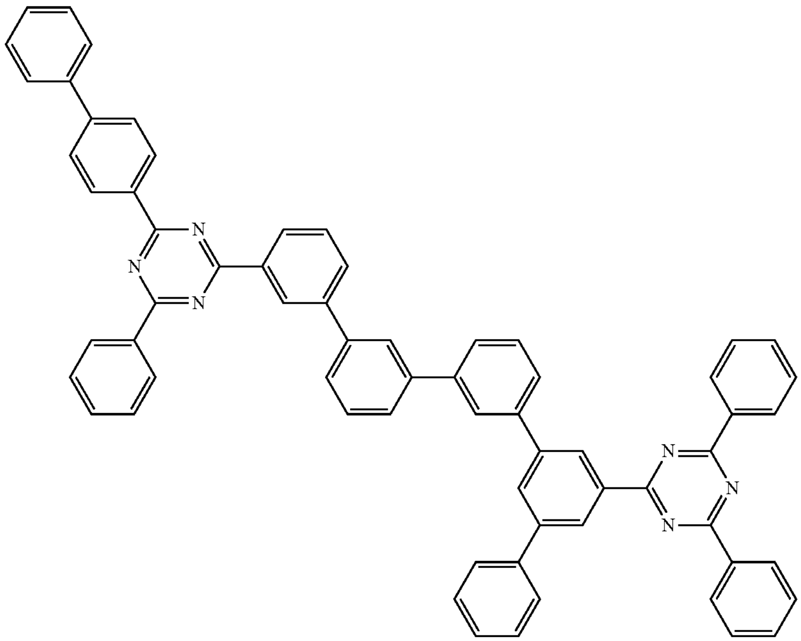
A(73)
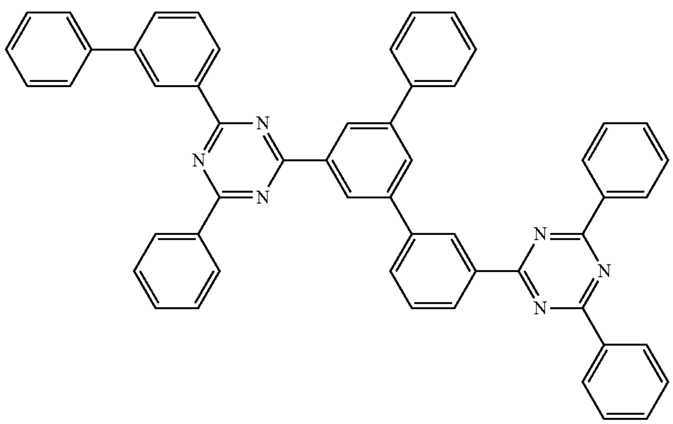
A(74)
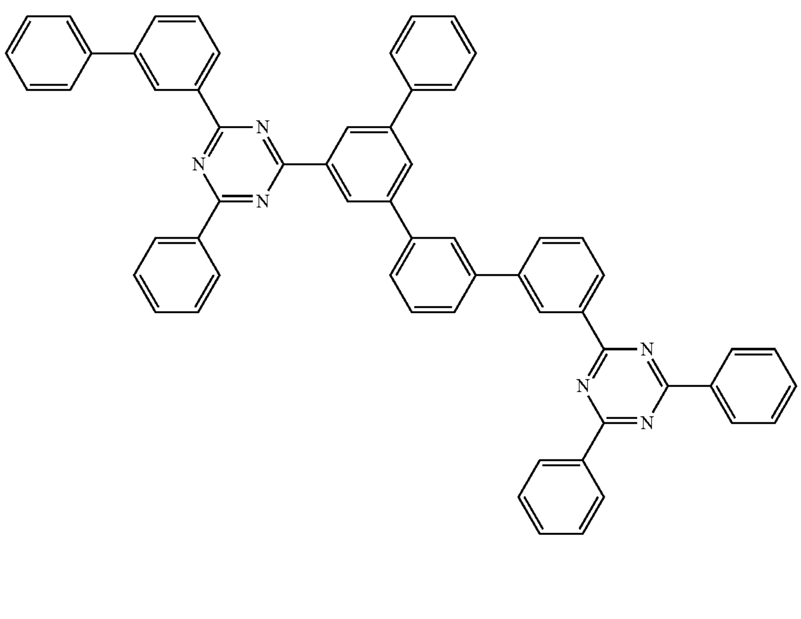

-continued
A(75)
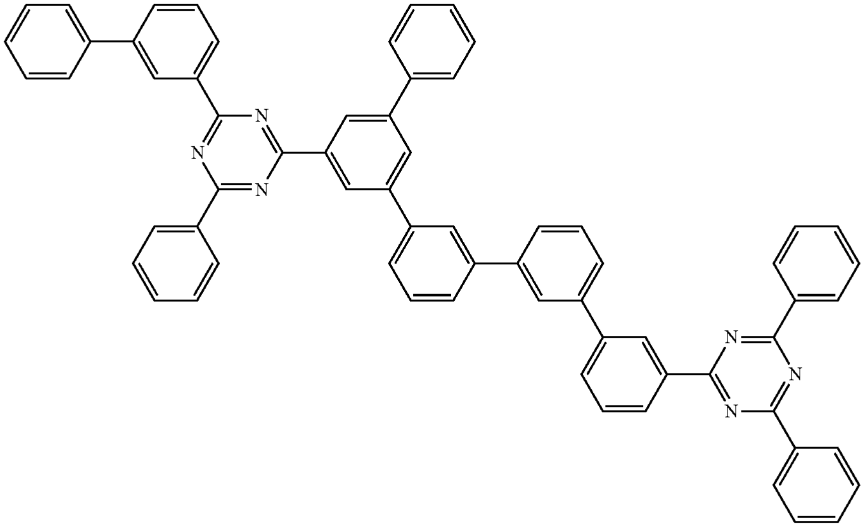
A(76)
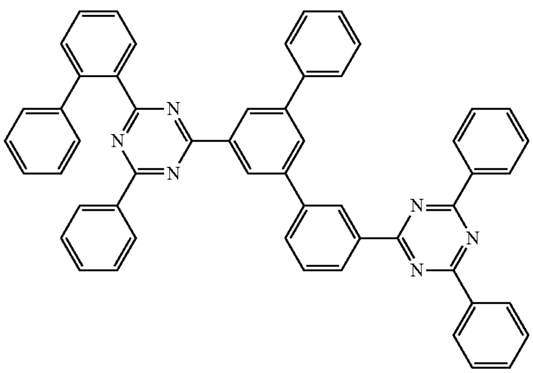
A(77)
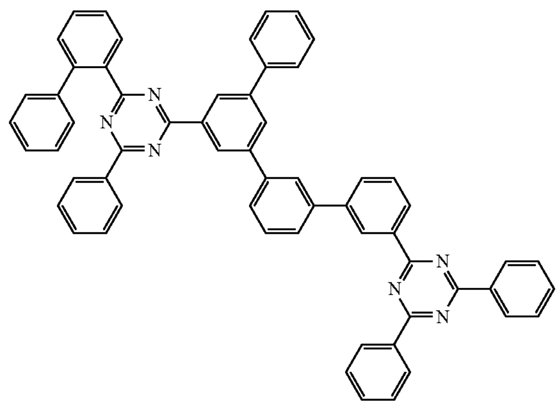
A(78)
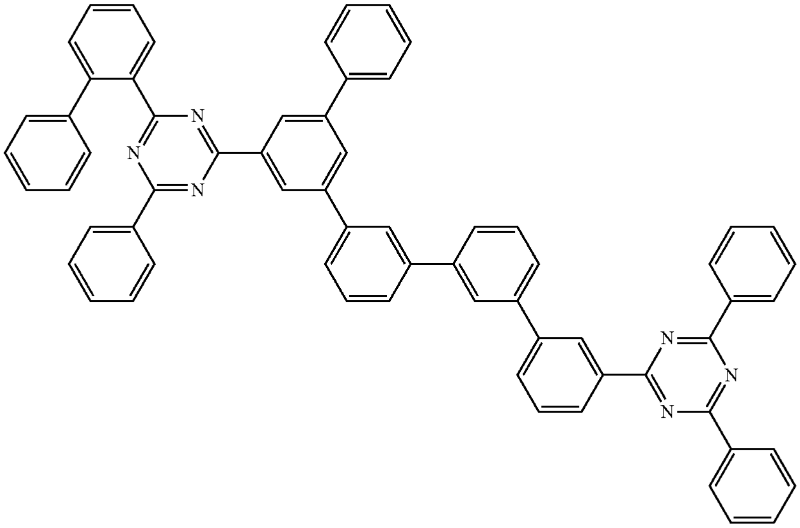

-continued
A(79)
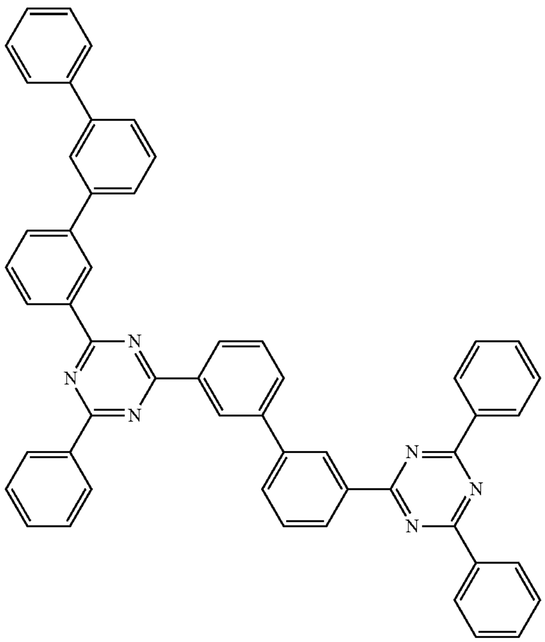
A(80)
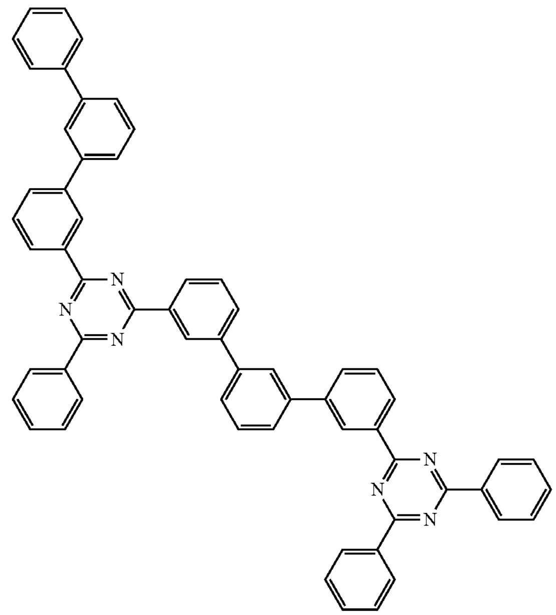
A(81)
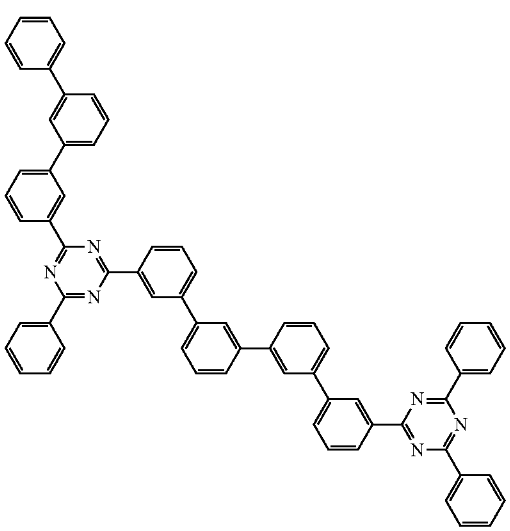
A(82)
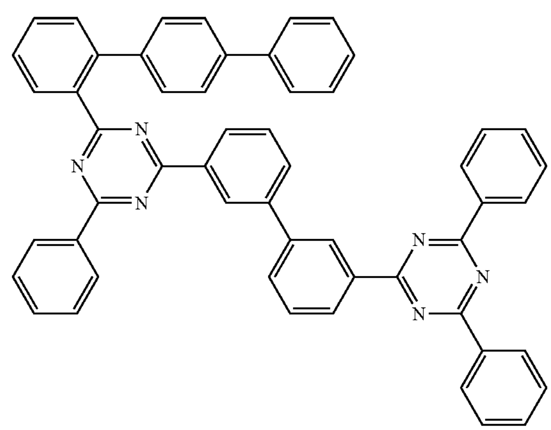
A(83)
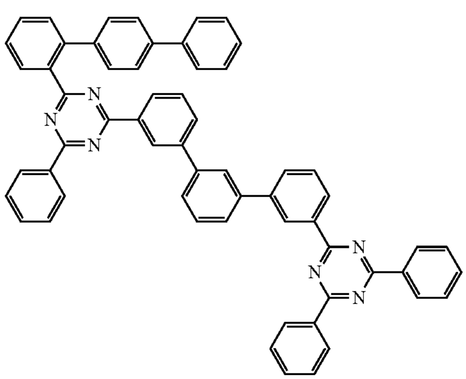
A(84)
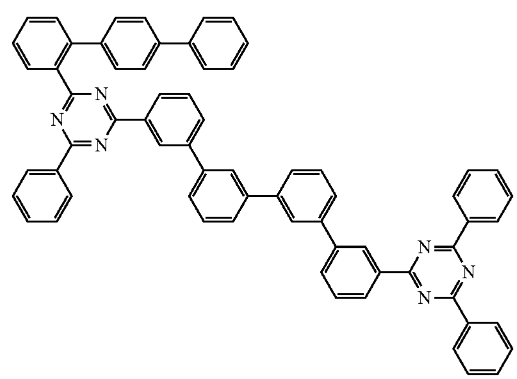

-continued
A(85)
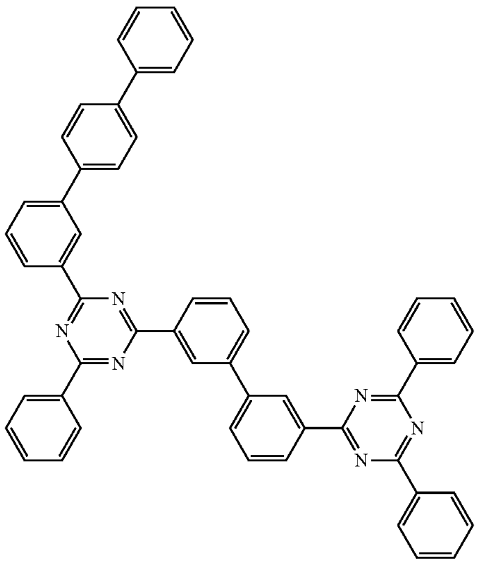
A(86)
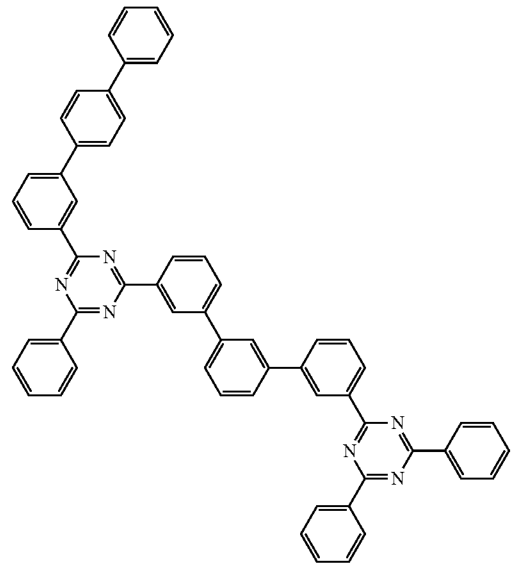
A(87)
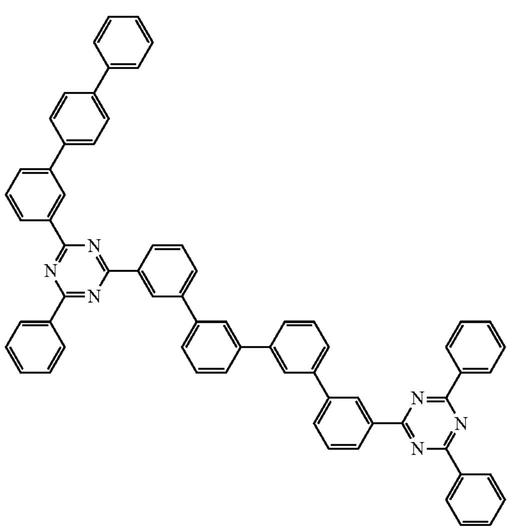
A(88)
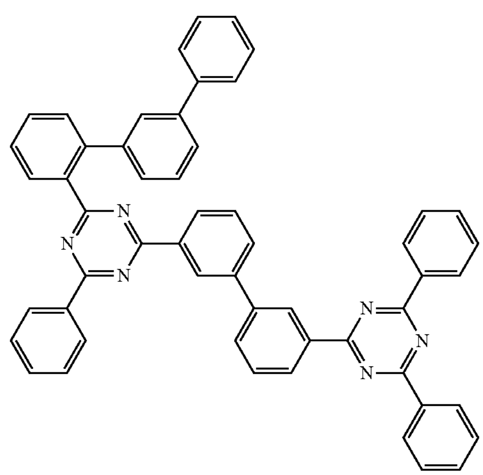

-continued
A(89)
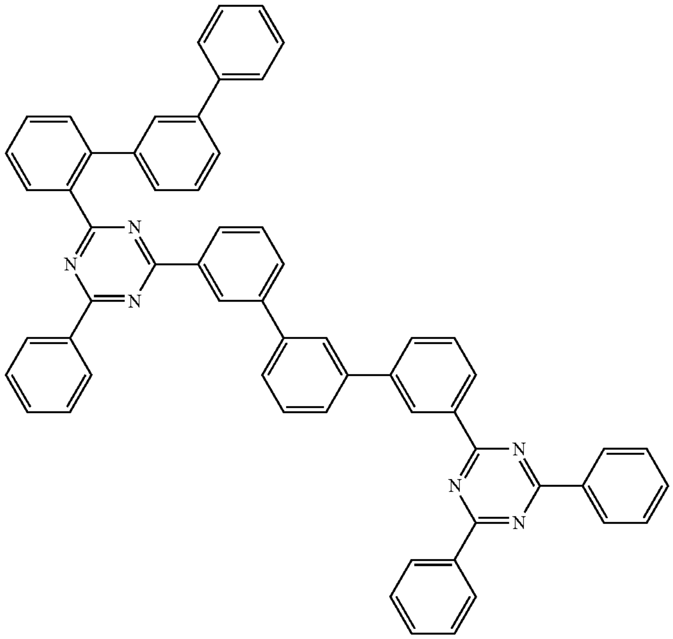
A(90)
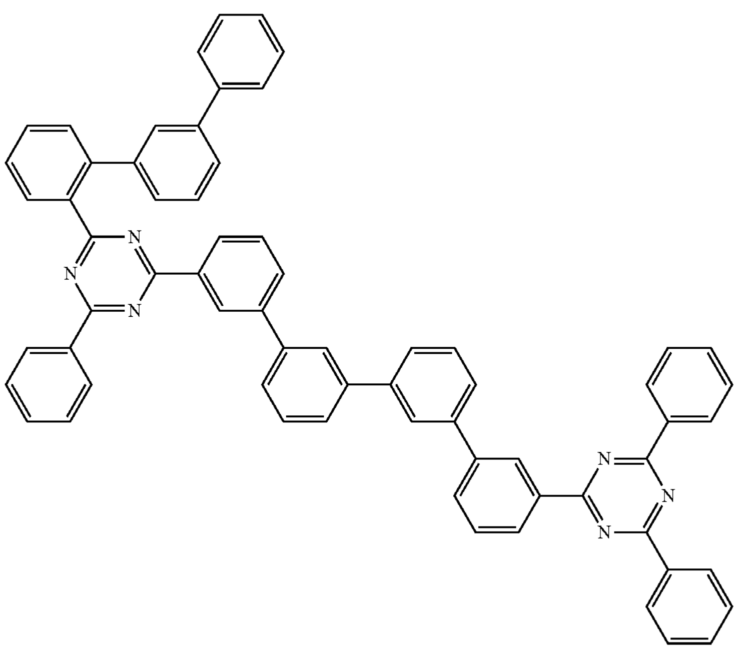

-continued
A(91)
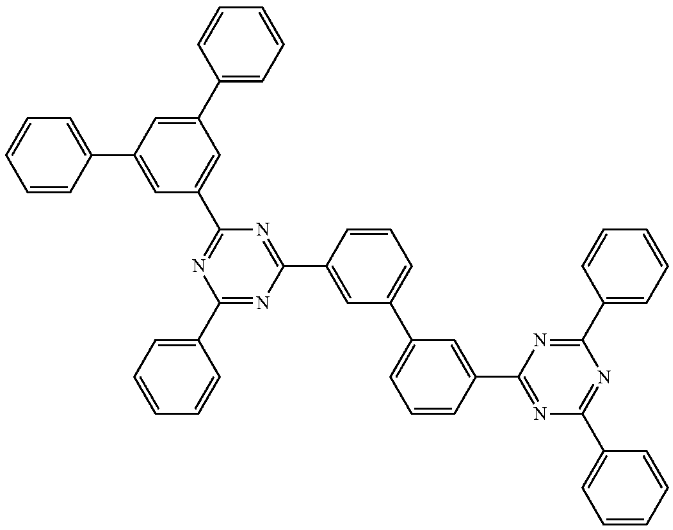
A(92)
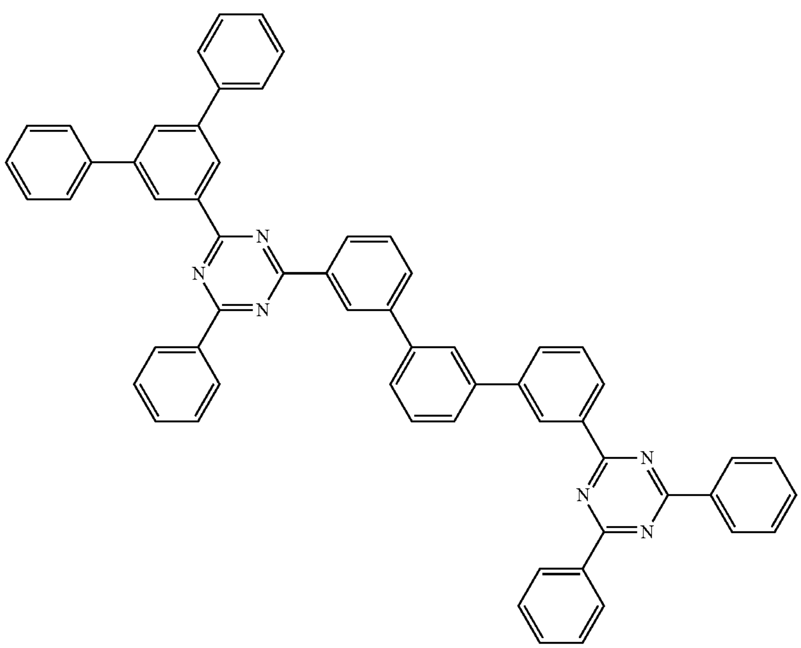

-continued
A(93)
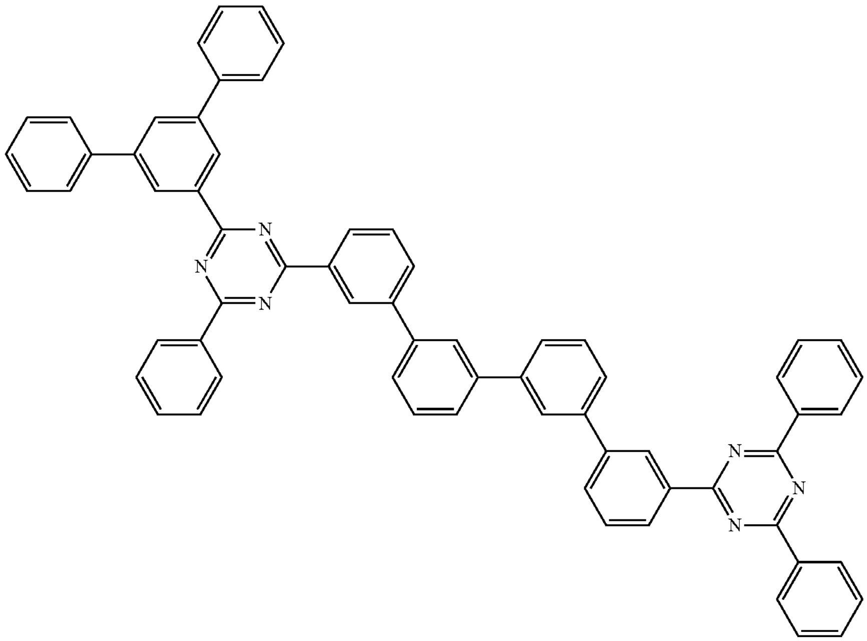
A(94)
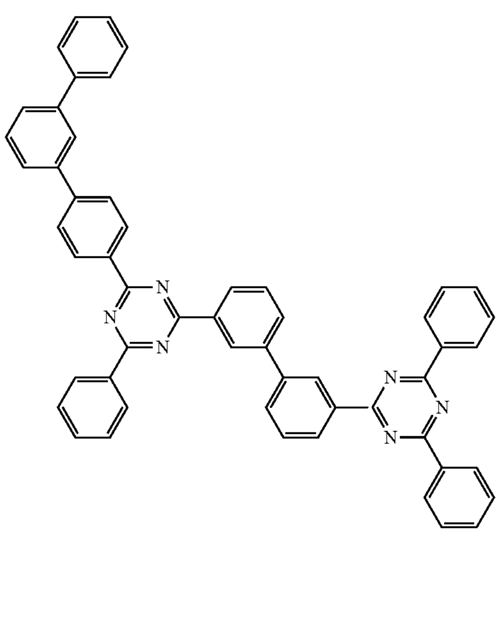
A(95)
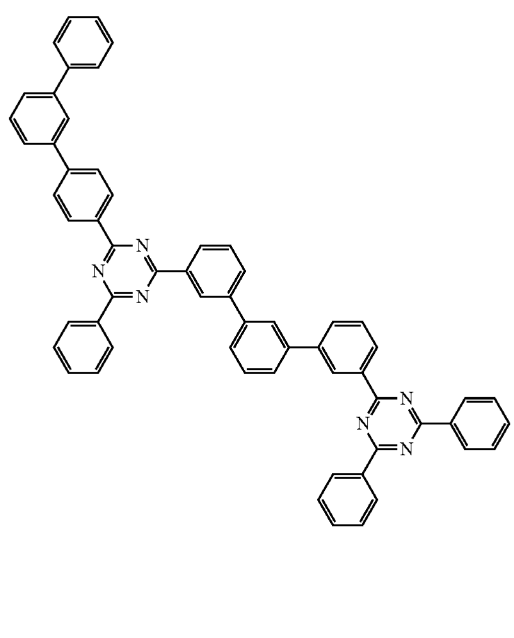

-continued
A(96)
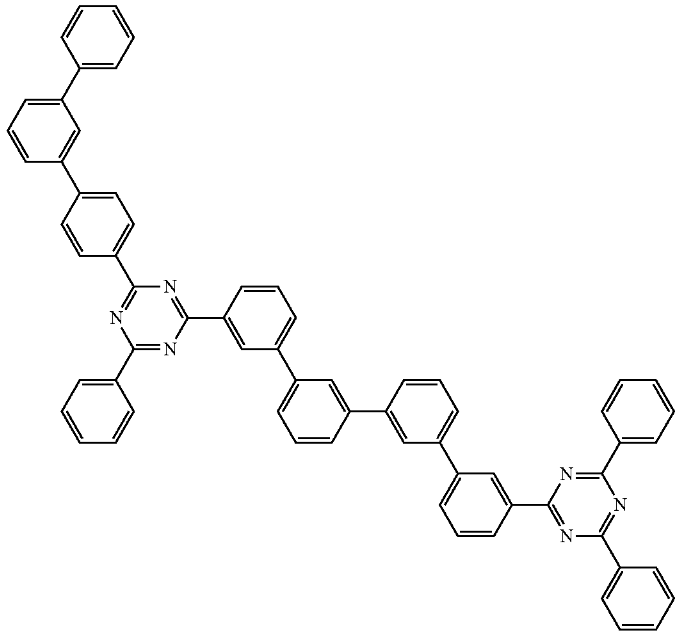
A(97)
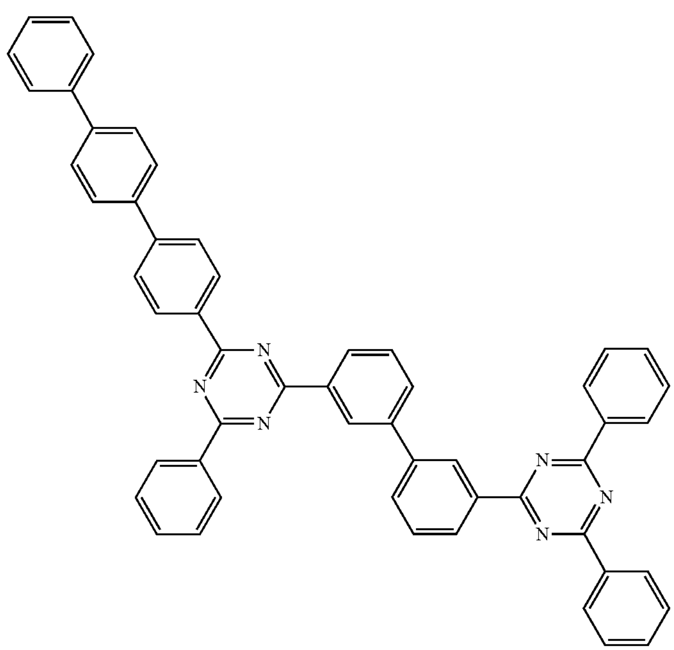

-continued
A(98)
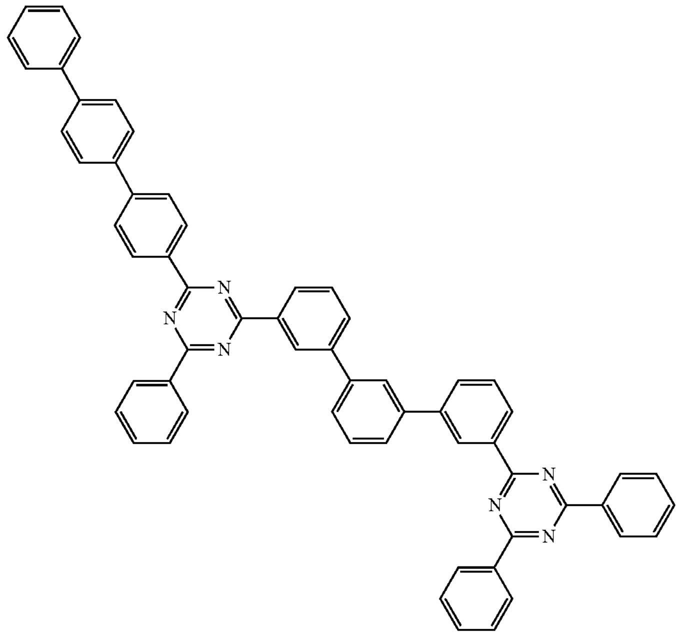
A(99)
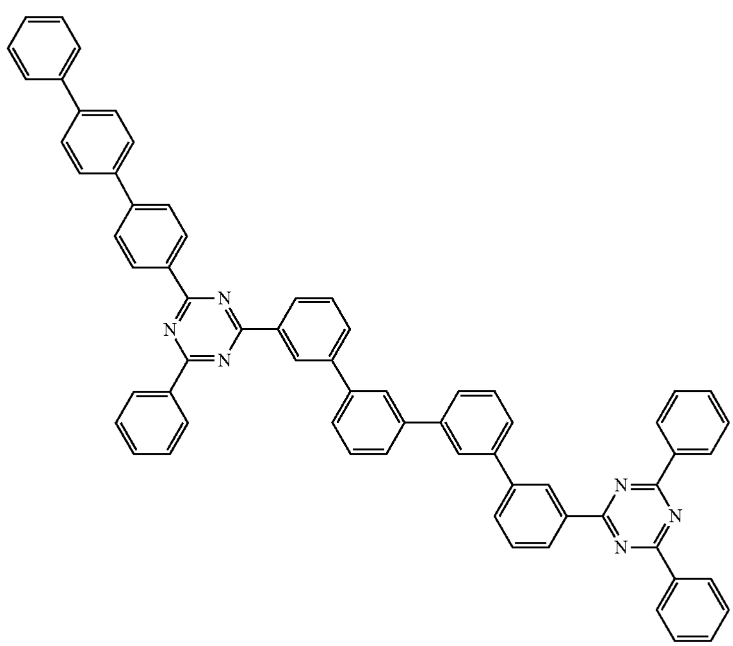

-continued
A(100)
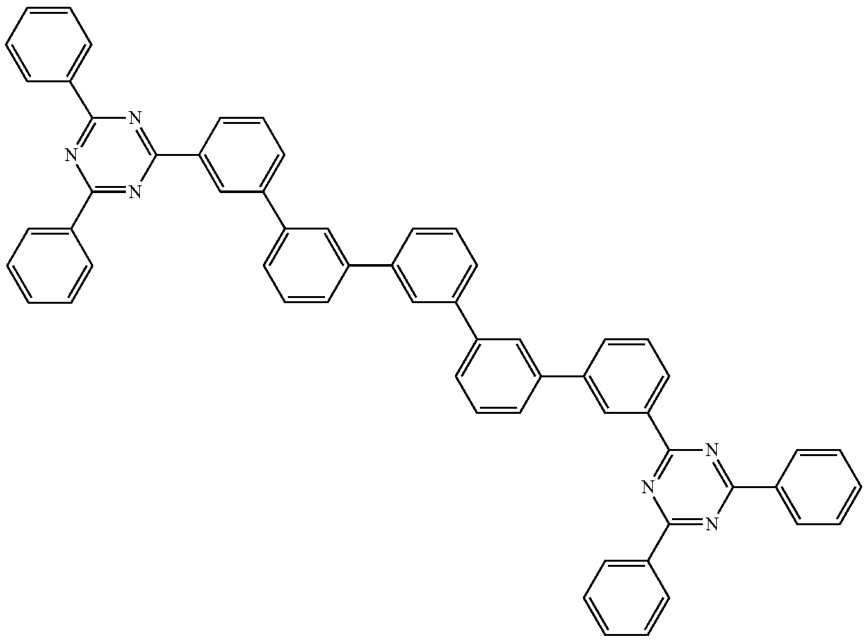
A(101)
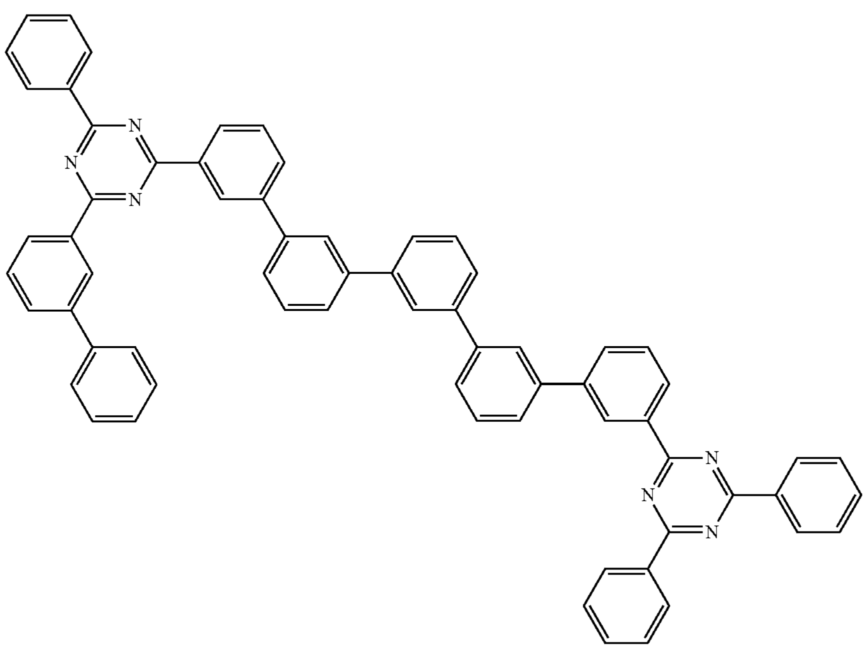

-continued
A(102)
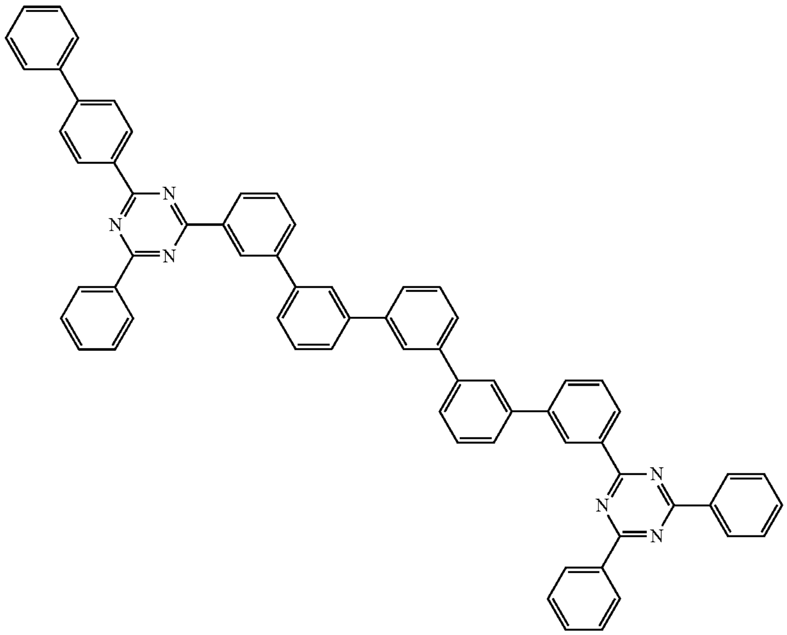
A(103)
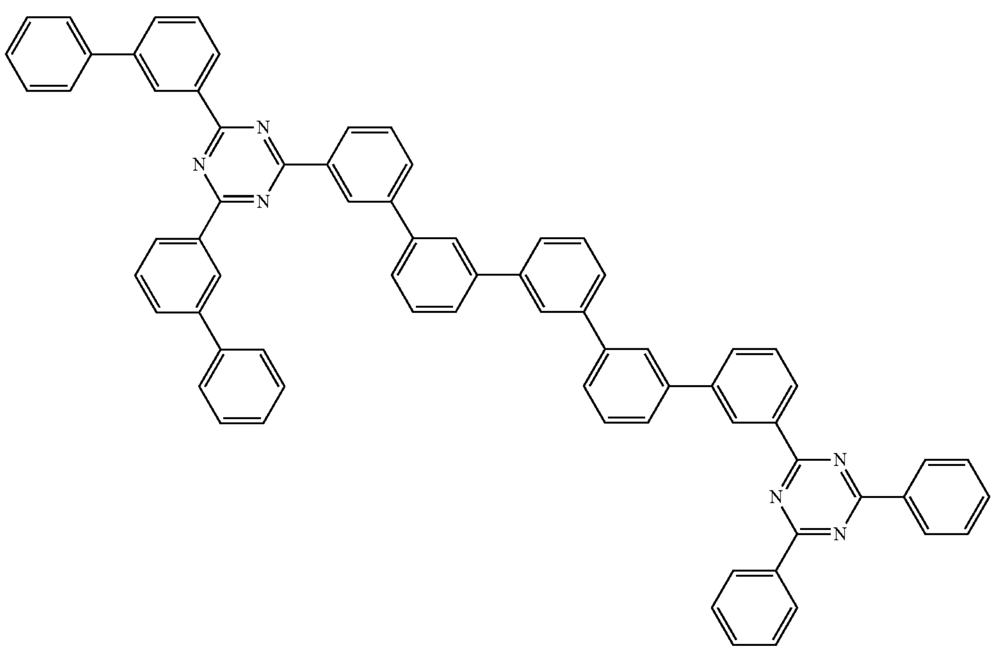

-continued
A(104)
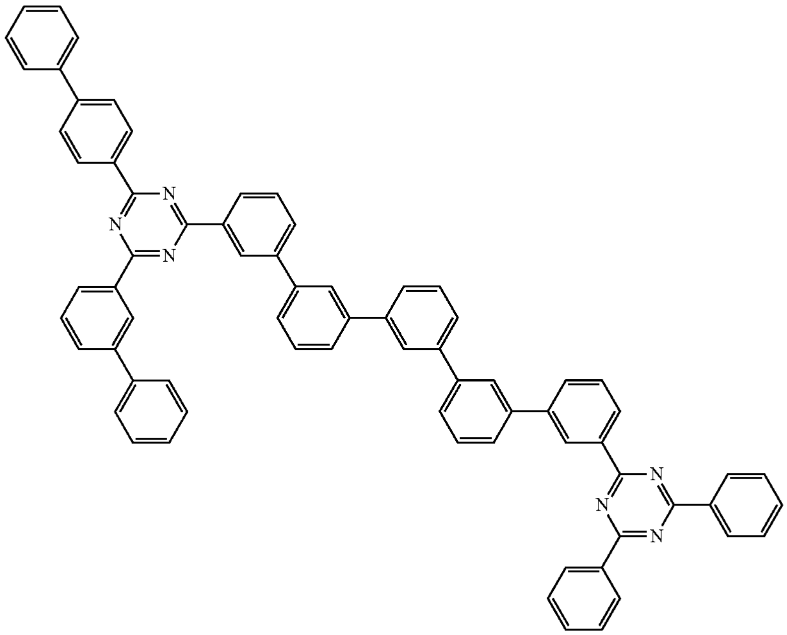
A(105)
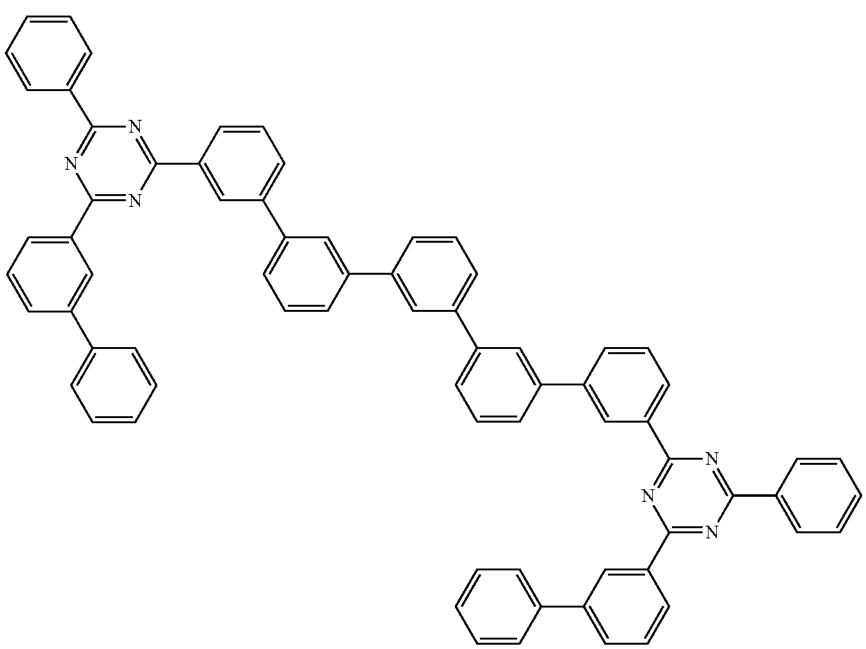

-continued
A(106)
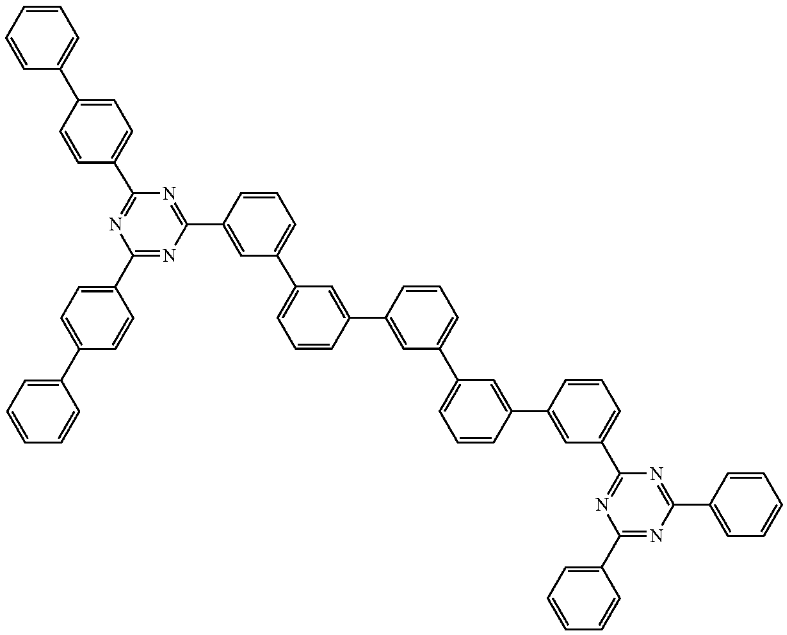
A(107)
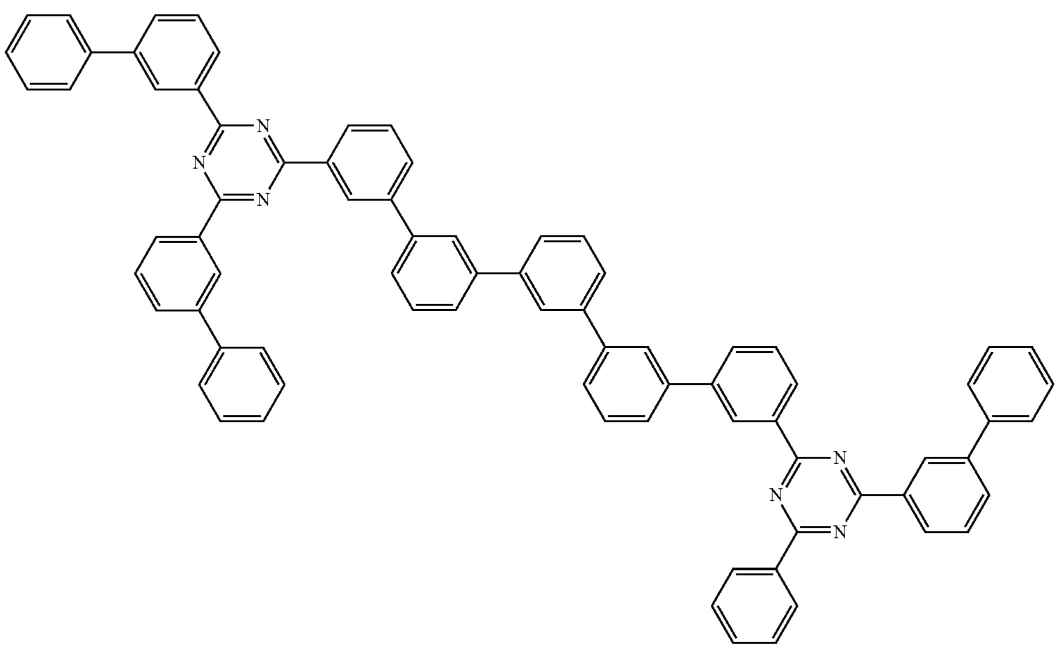

-continued
A(108)
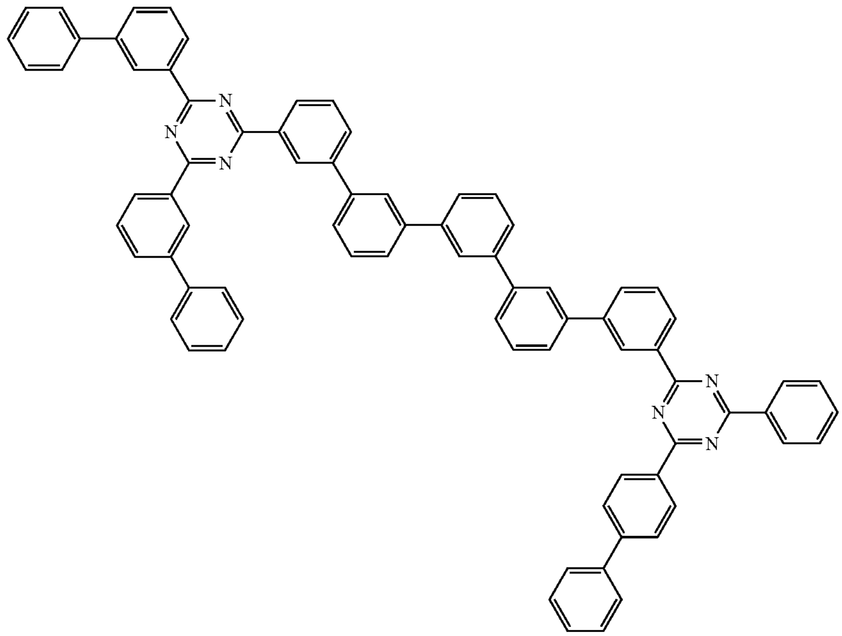
A(109)
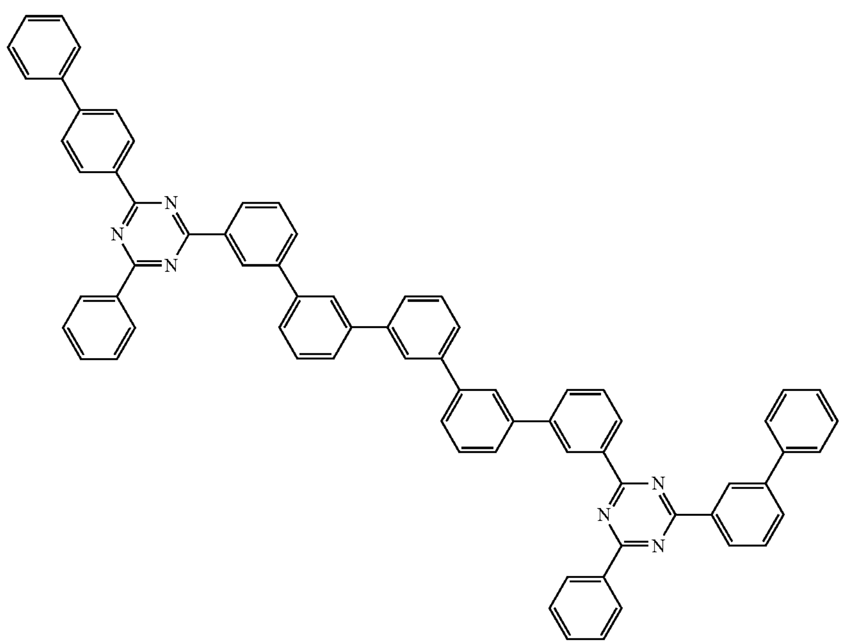

-continued
A(110)
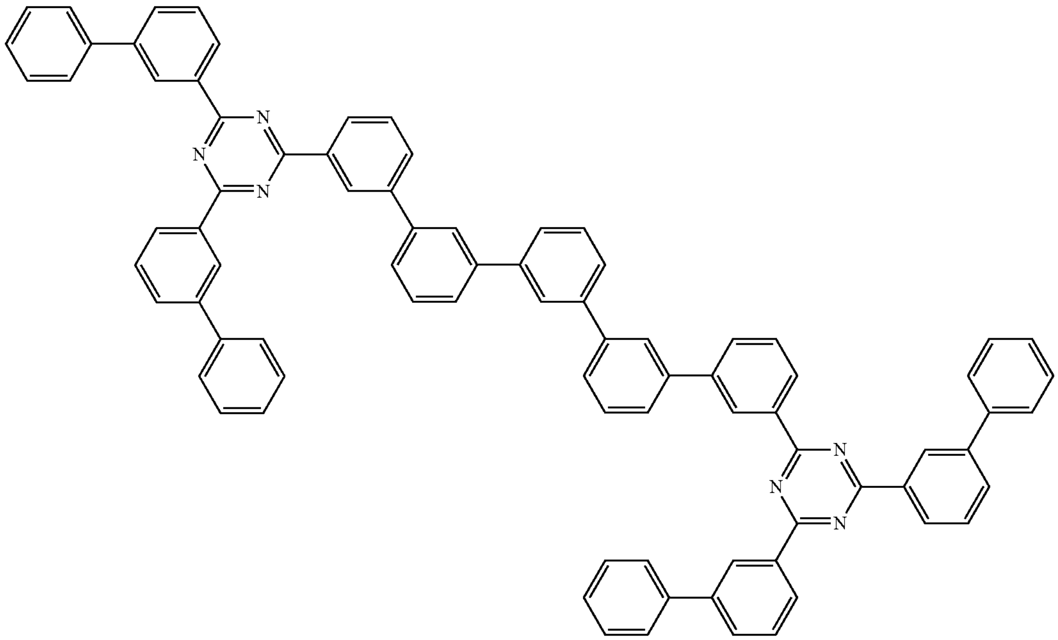
A(111)
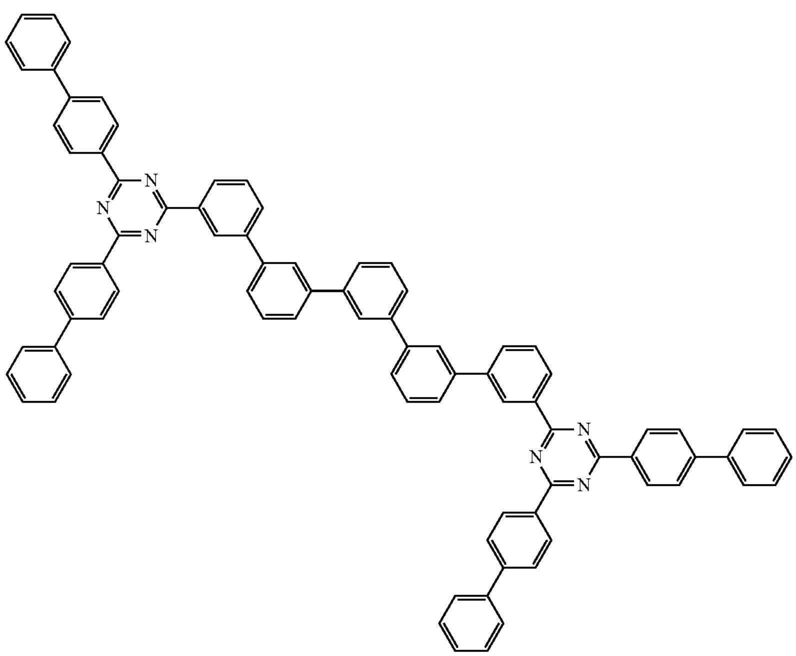

-continued
A(112)
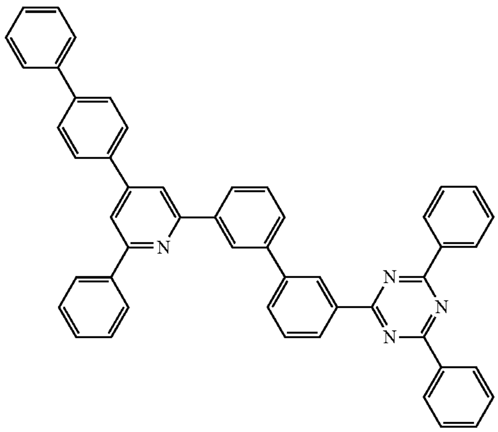
A(113)
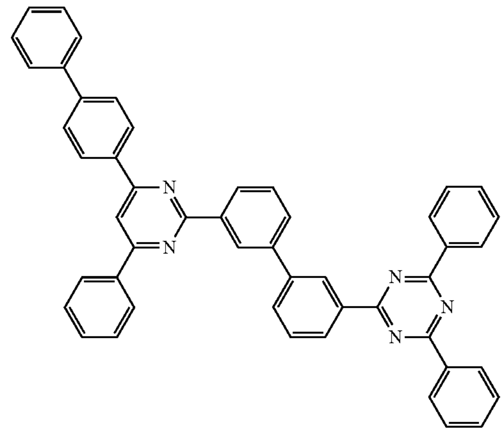
A(114)
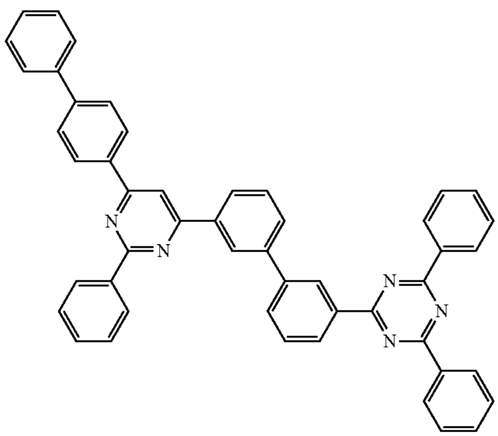
A(115)
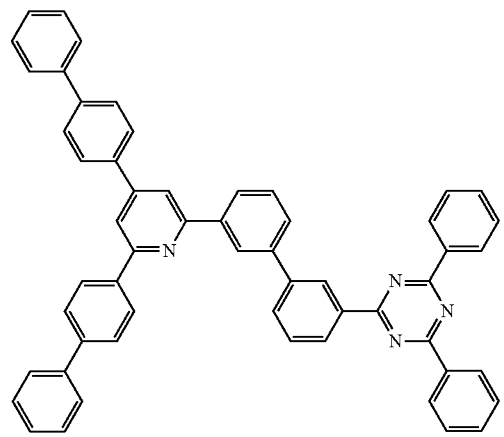
A(116)
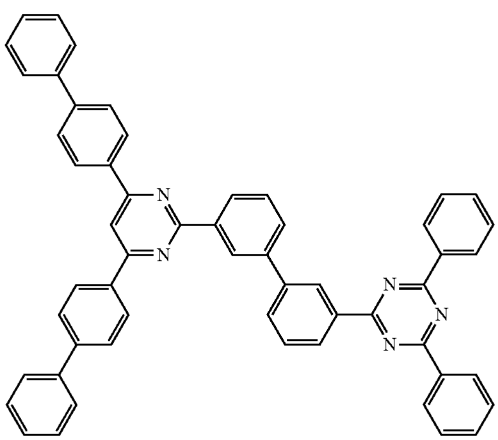
A(117)
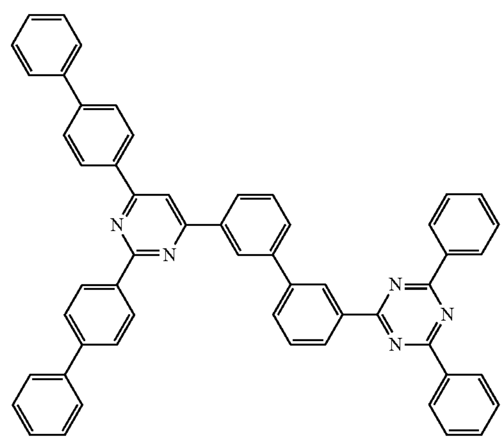
A(118)
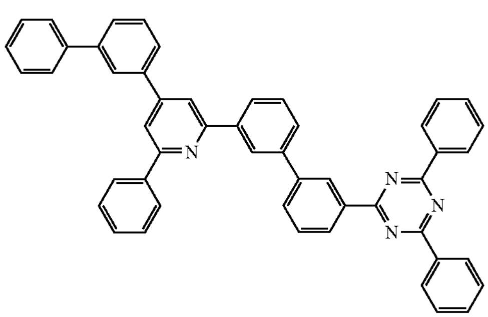
A(119)
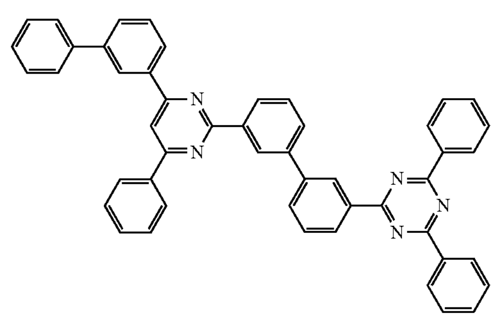

-continued
A(120)
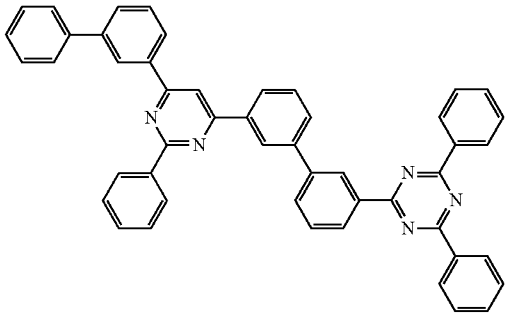
A(121)
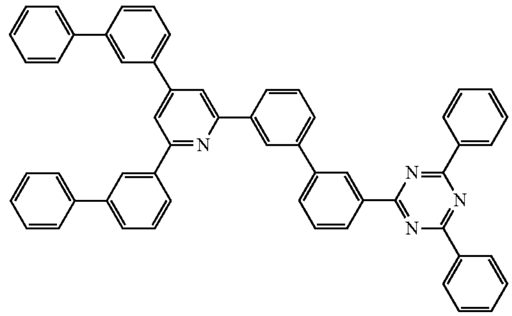
A(122)
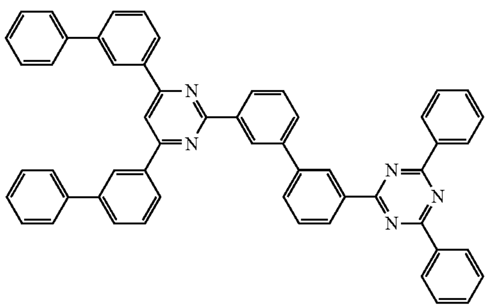
A(123)
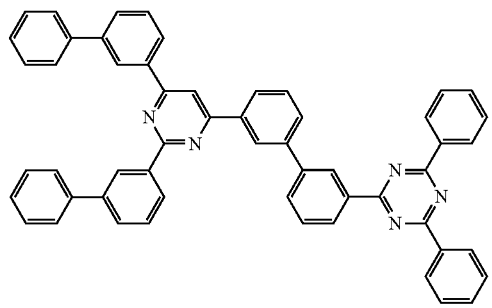
A(124)
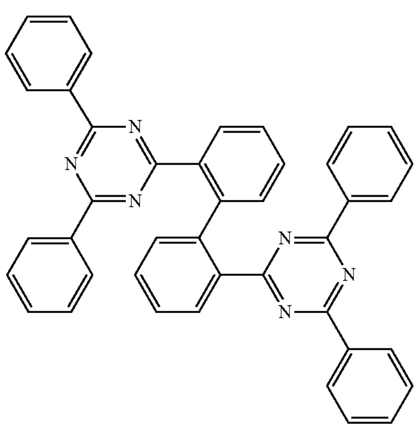
A(125)
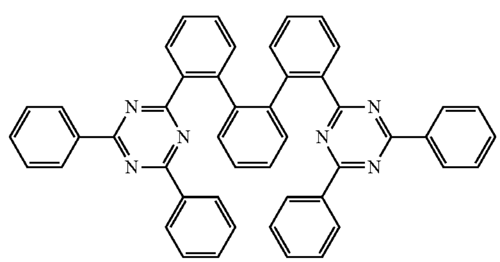
A(126)
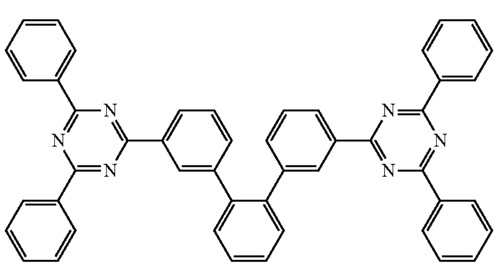
A(127)
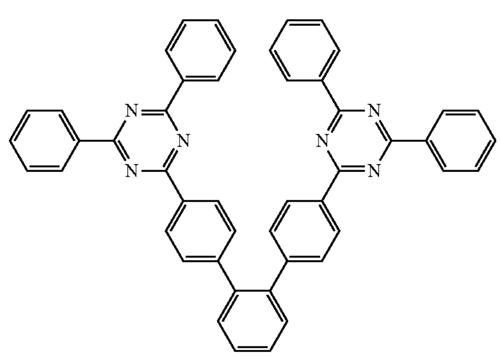

-continued
A(128)
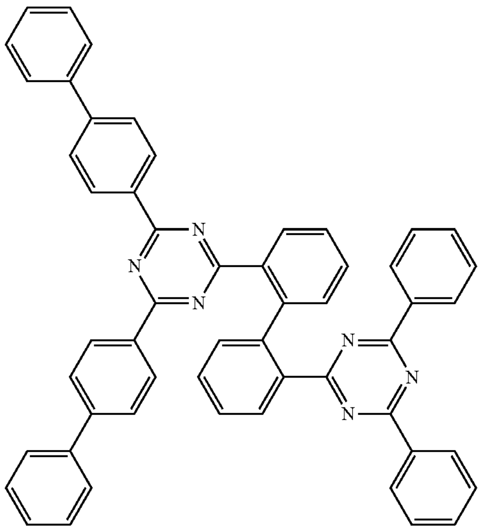
A(129)
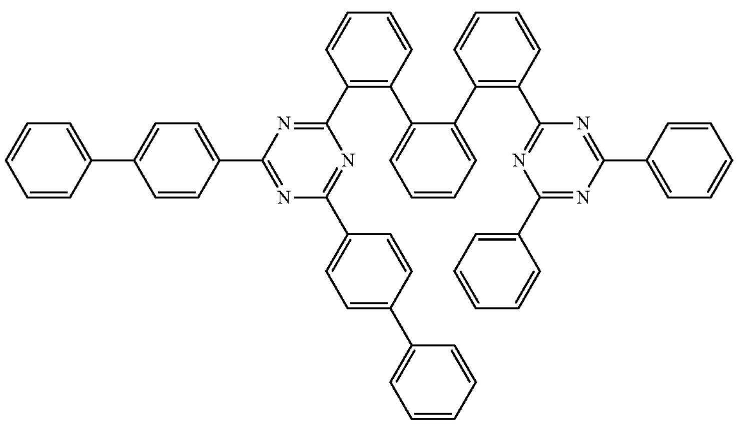
A(130)
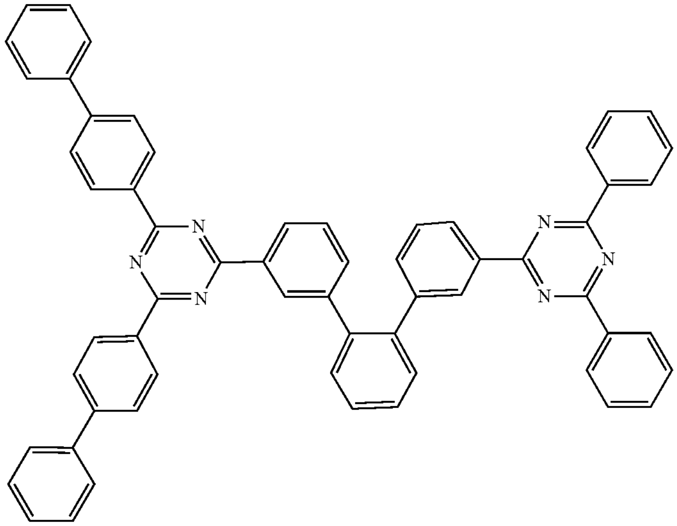

-continued
A(131)
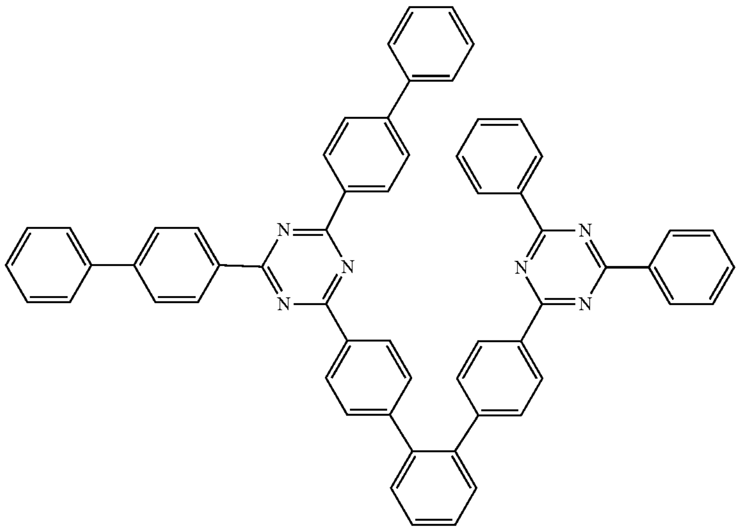
A(132)
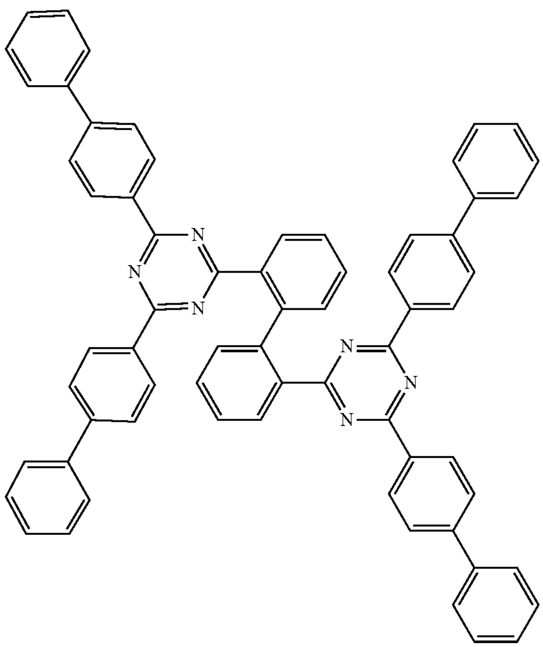
A(133)
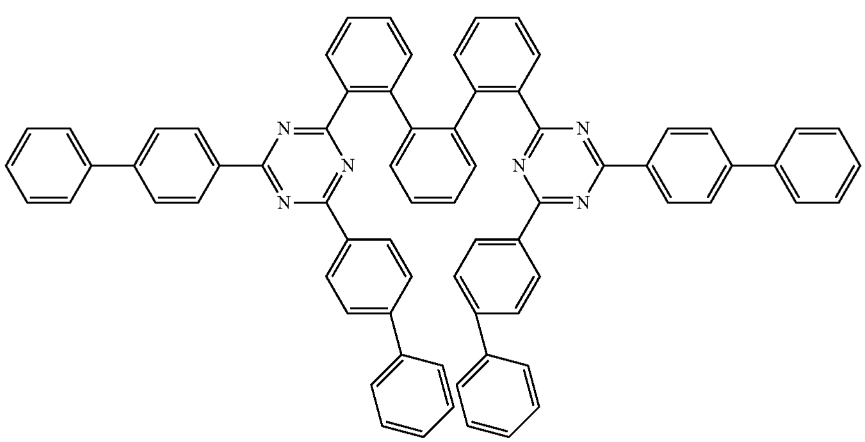

-continued
A(134)
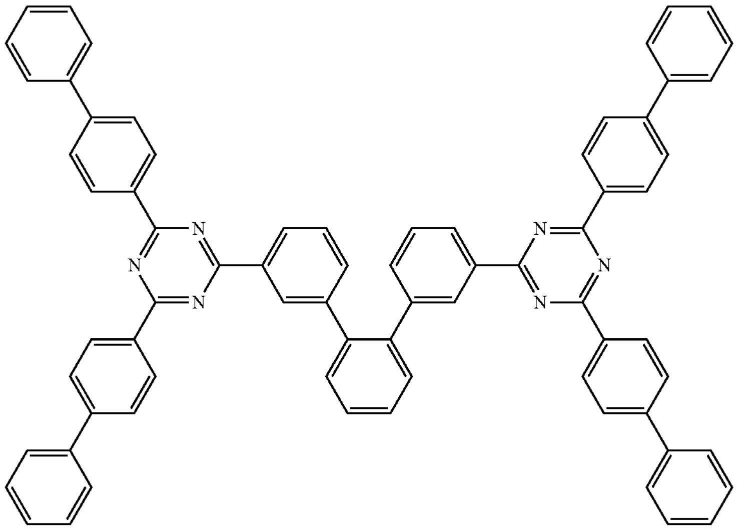
A(135)
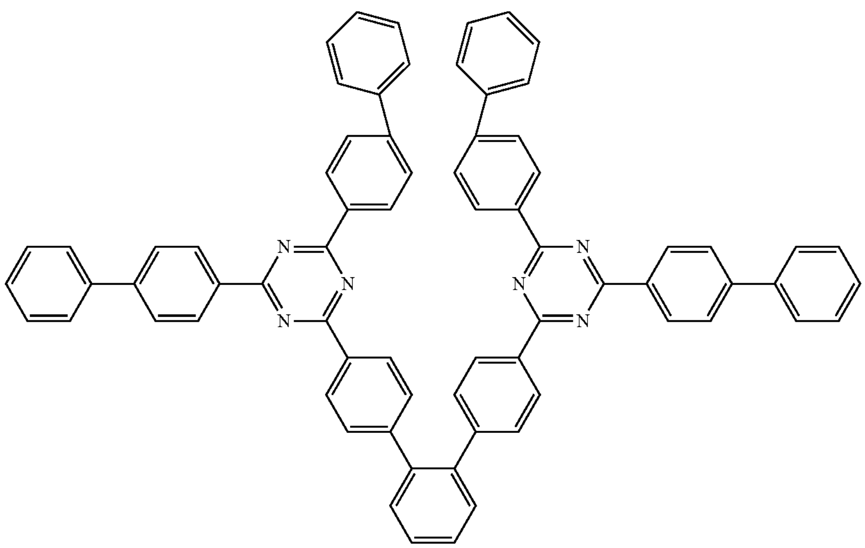
A(136)
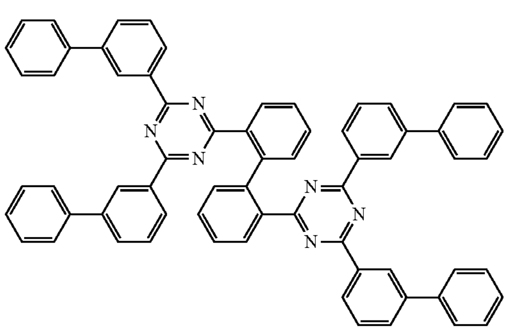
A(137)
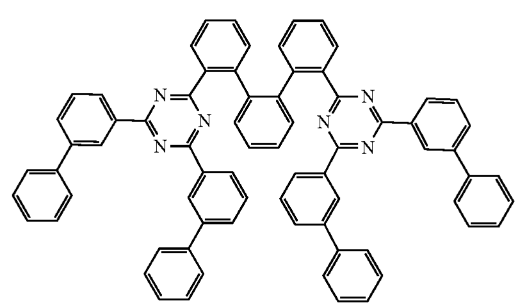

-continued
A(138)
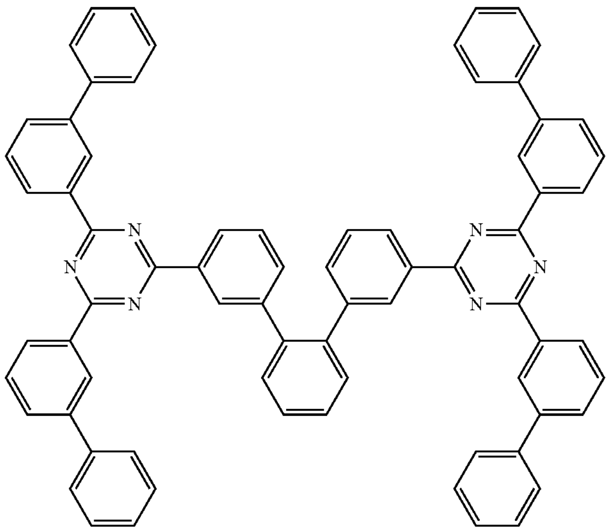
A(139)
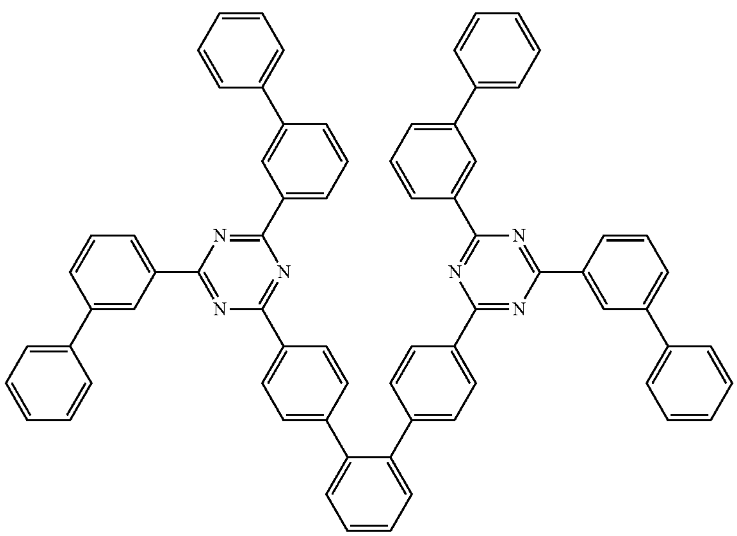
A(140)
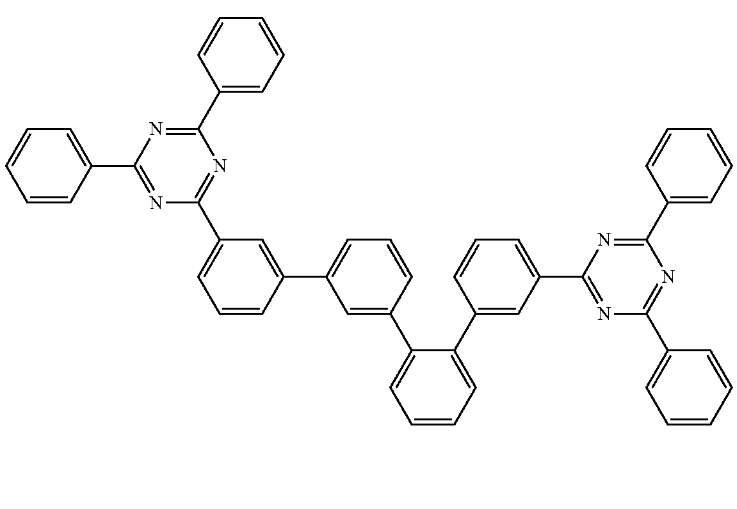

-continued
A(141)
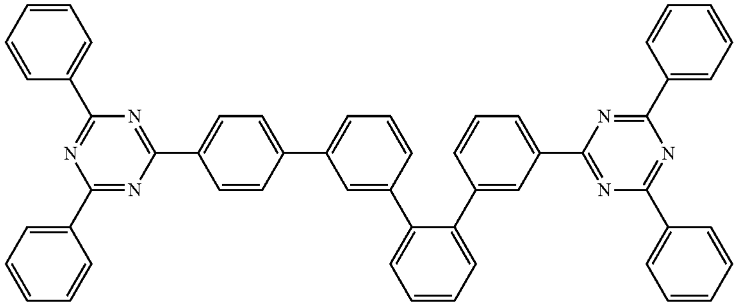
A(142)
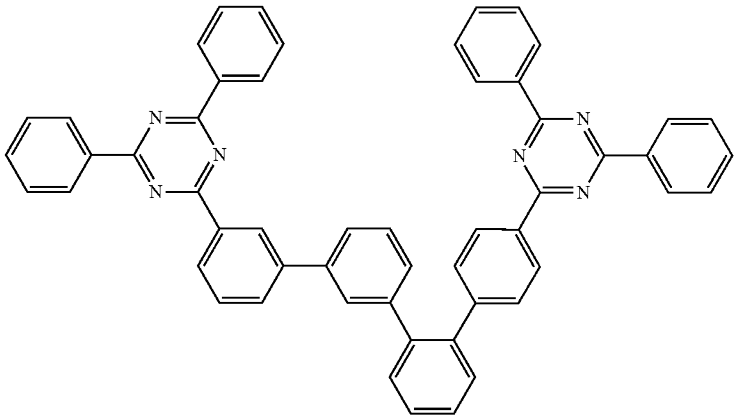
A(143)
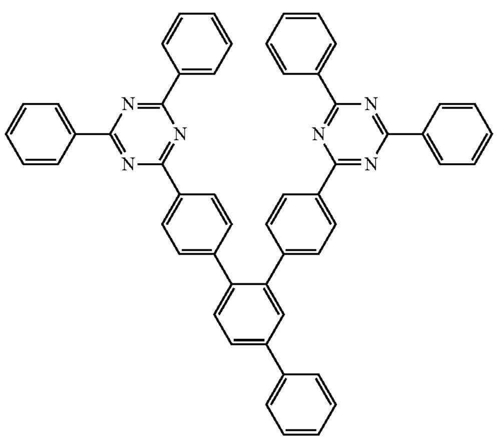
A(144)
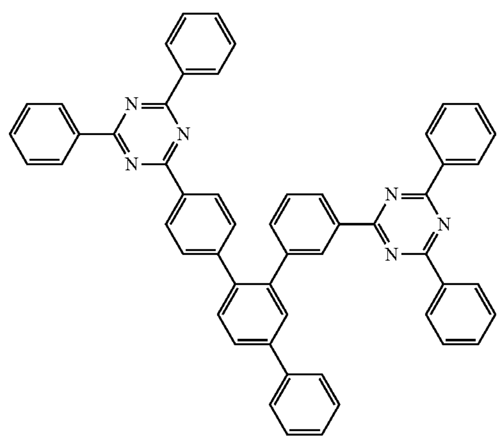
A(145)
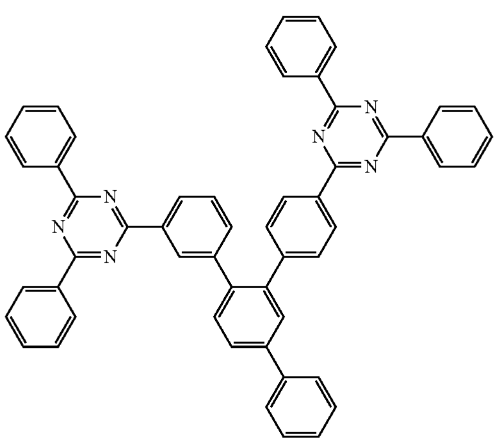
A(146)
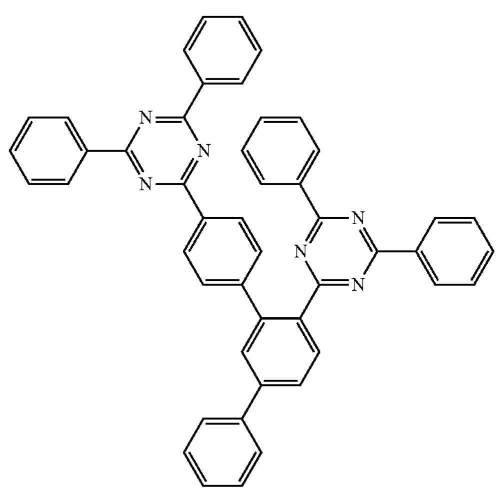

-continued
A(147)
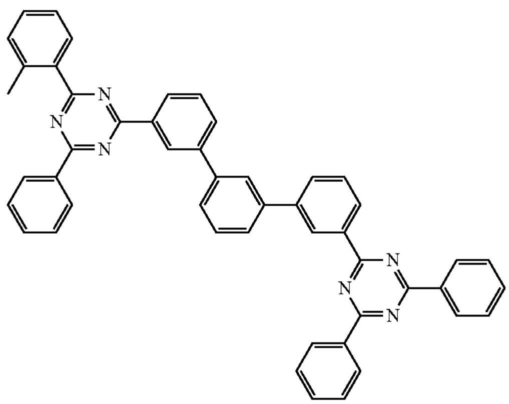
A(148)
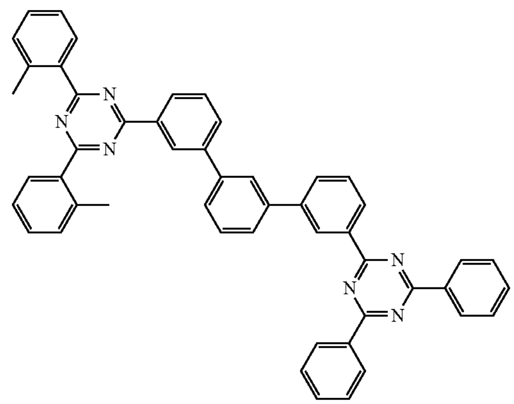
A(149)
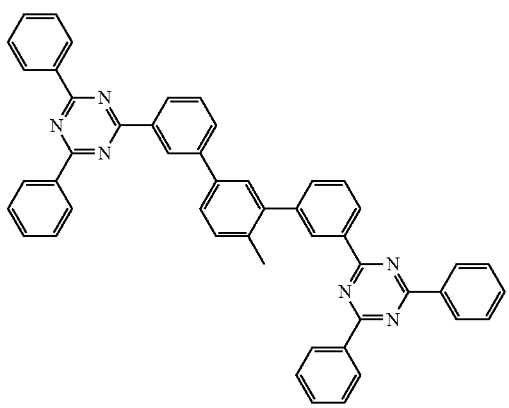
A(150)
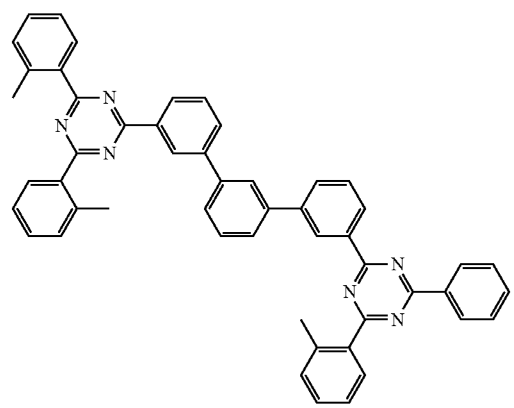
A(151)
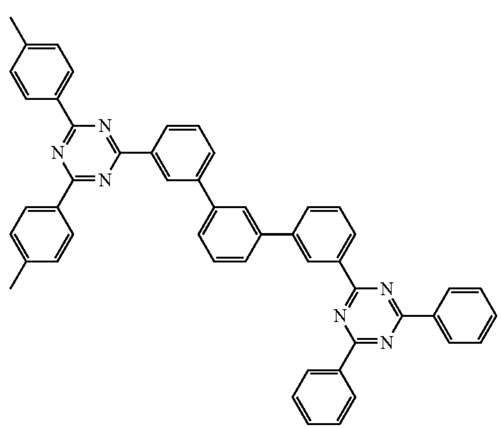
A(153)
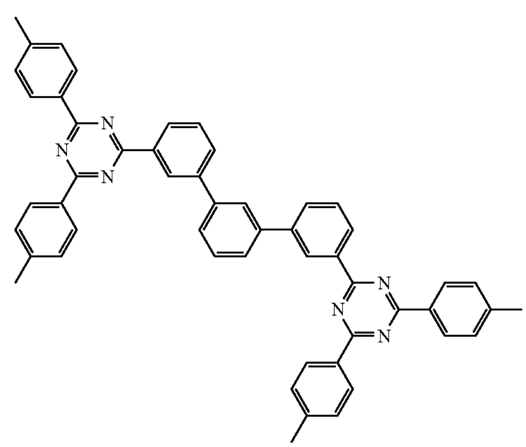

-continued
A(153)
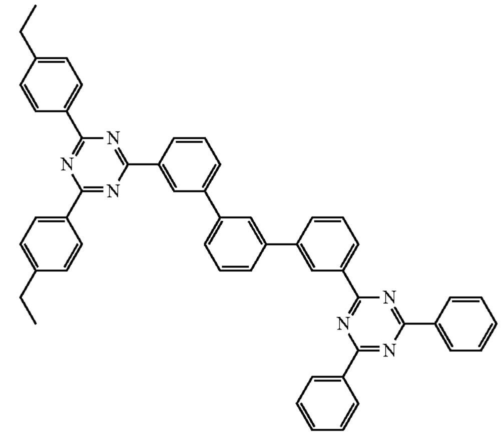
A(154)
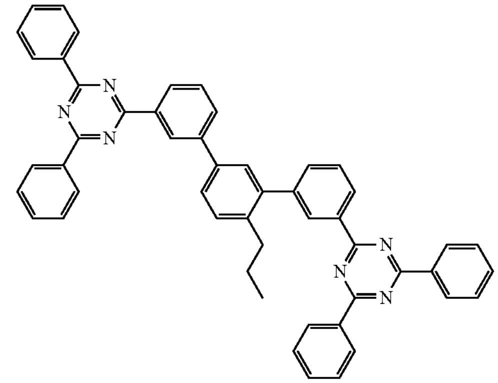
Group HE2
1
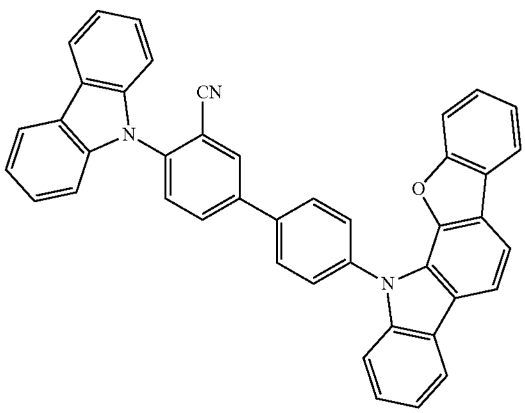
2
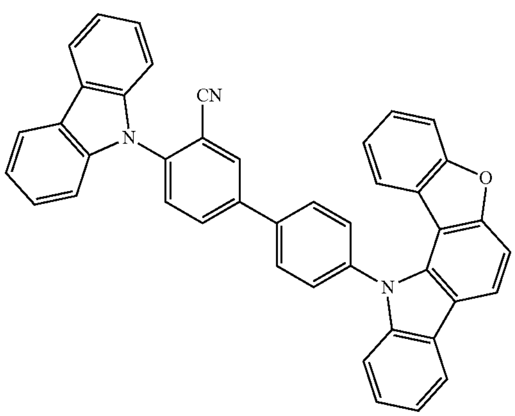
-continued
3
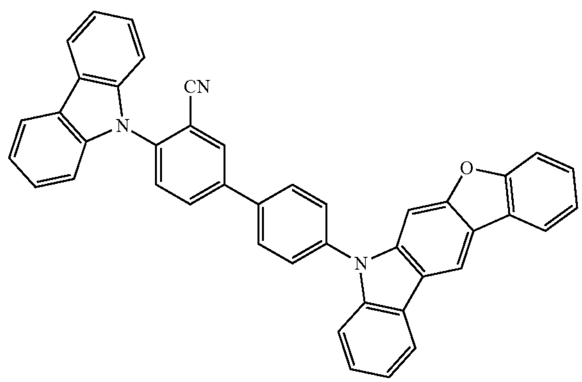
4
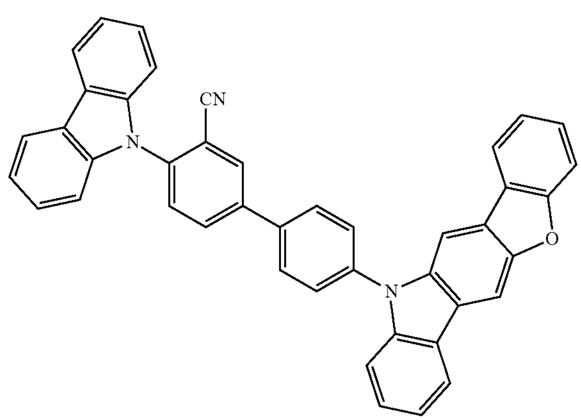

-continued
5
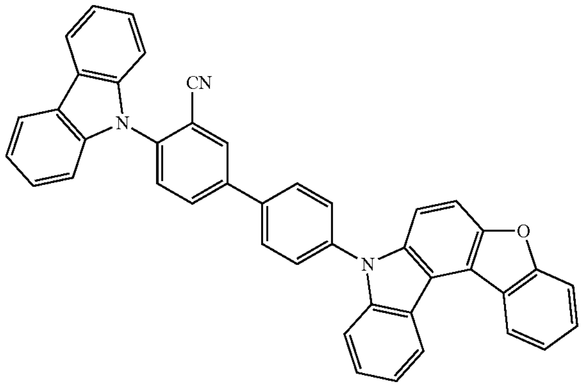
6
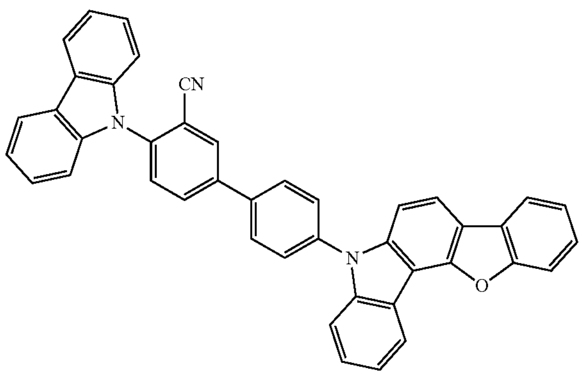
7
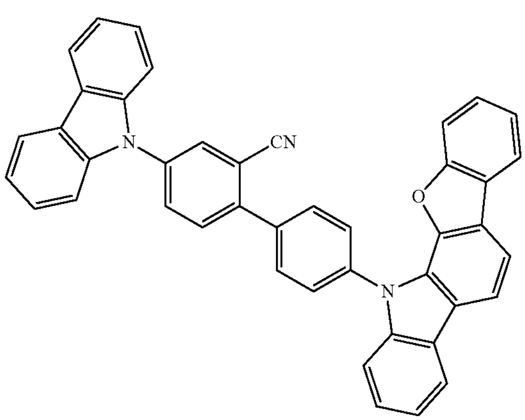
-continued
8
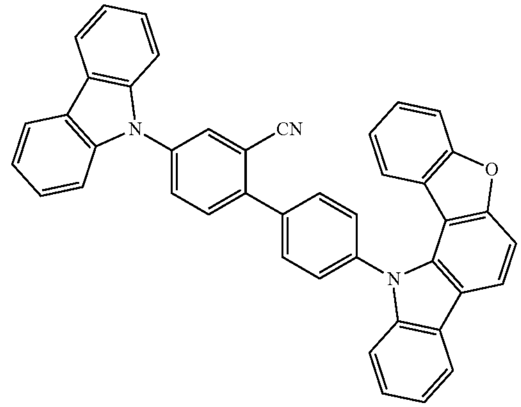
9
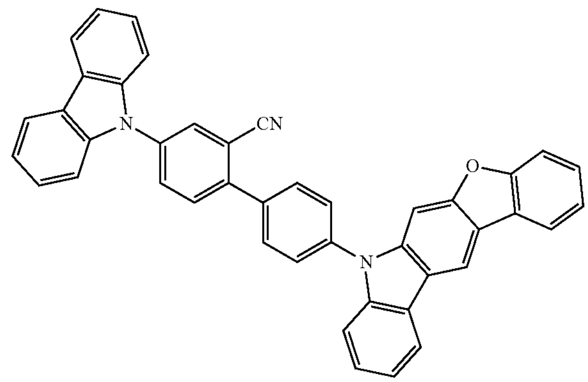
10
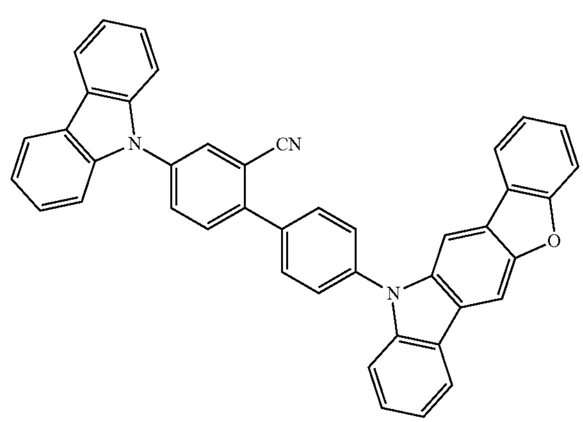

-continued
11
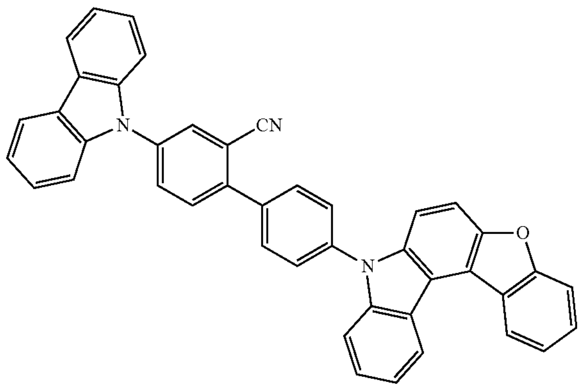
12
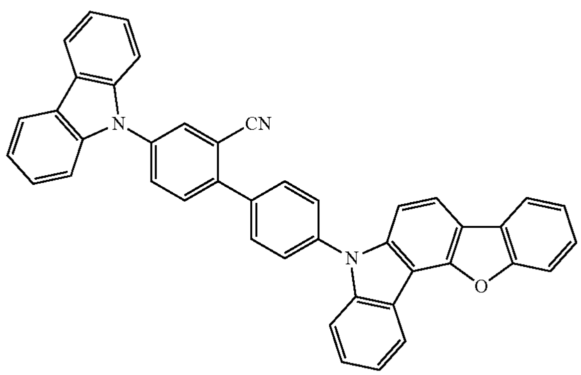
13
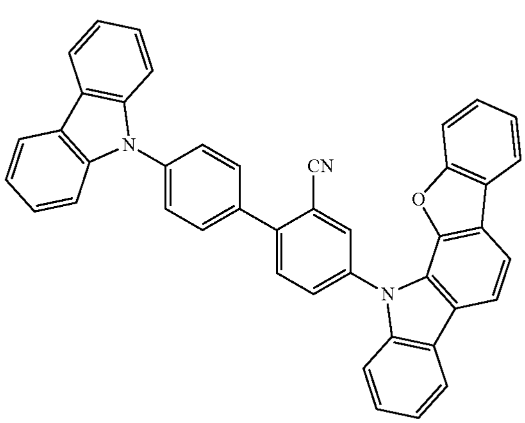
-continued
14
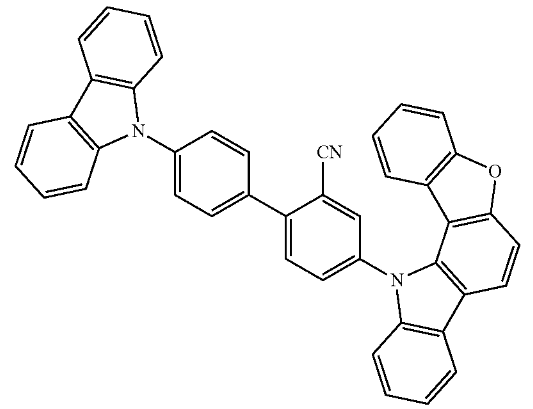
15
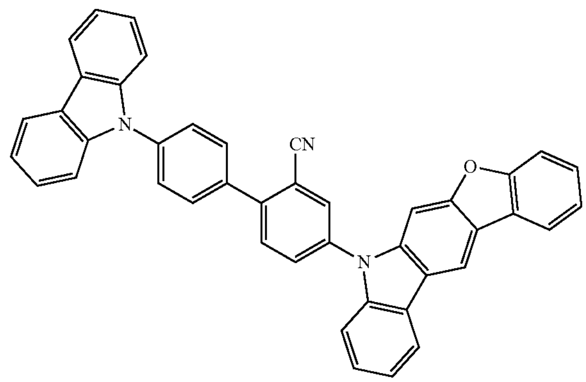
16
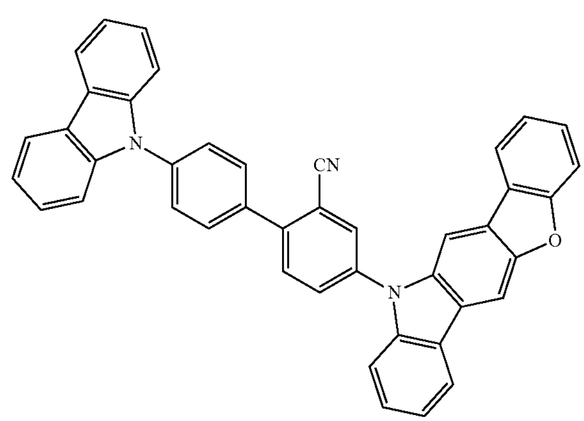

-continued
17
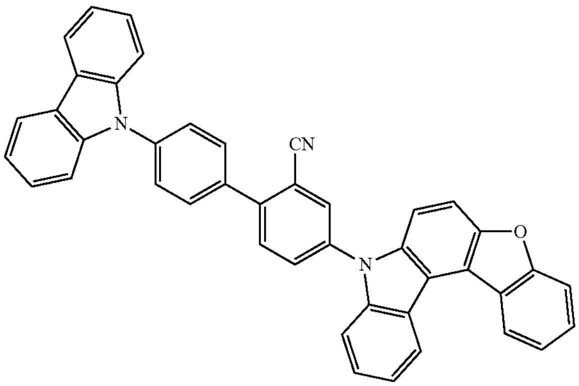
18
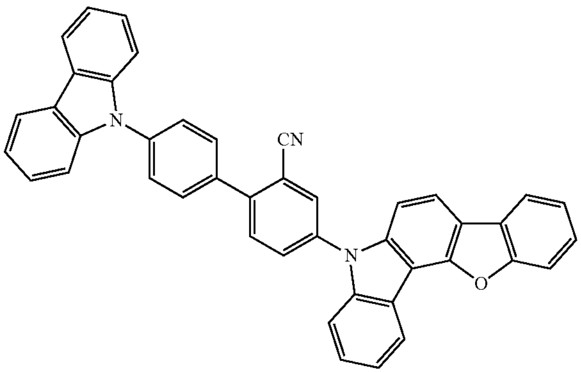
19
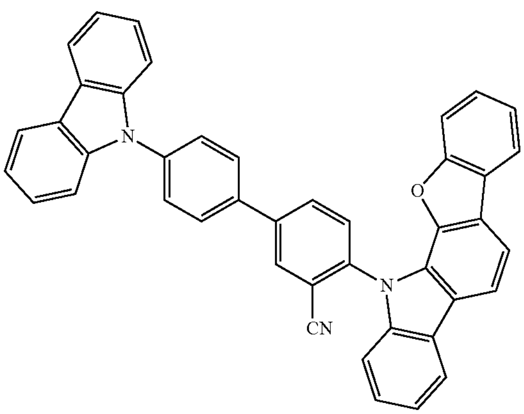
20
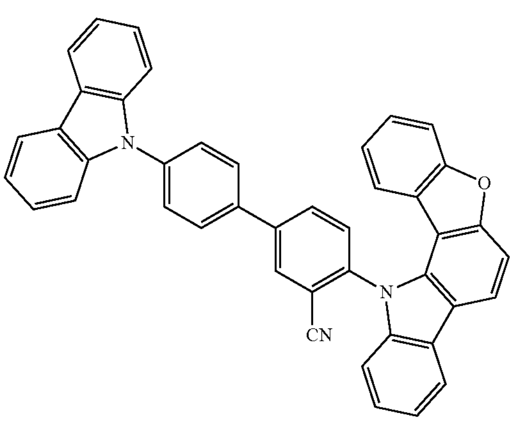
-continued
21
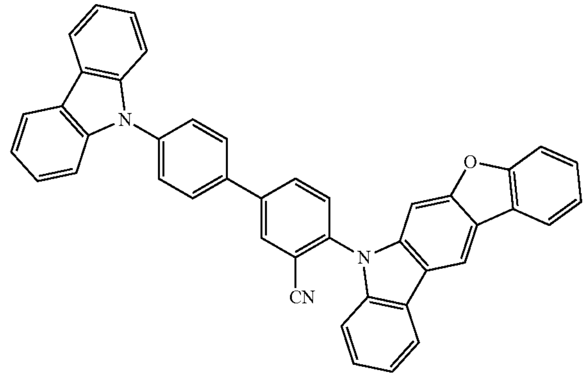
22
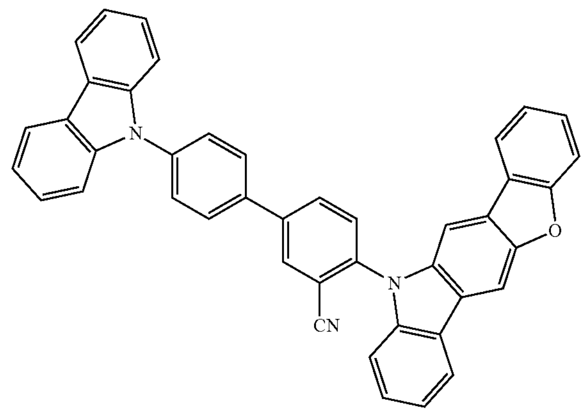
23
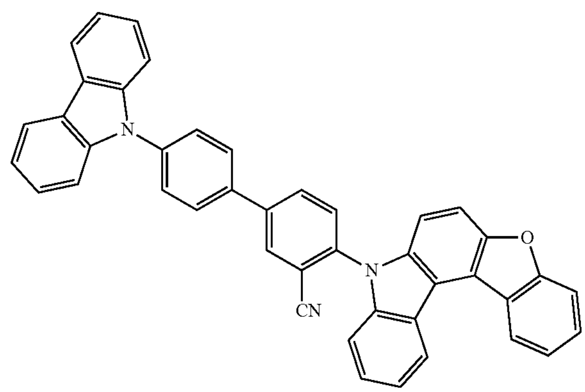
24
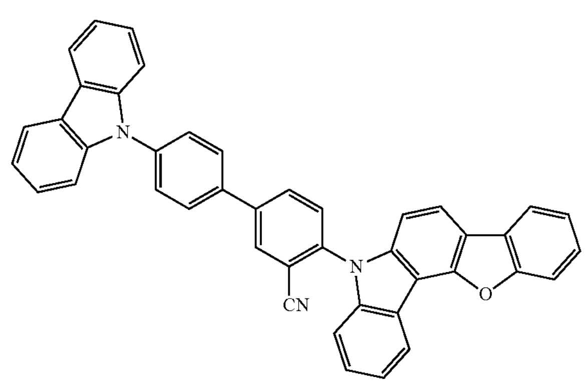

-continued
25
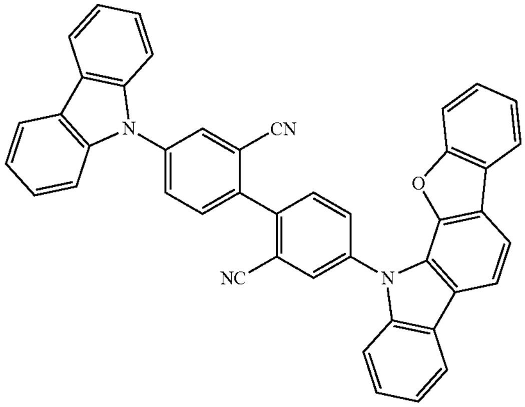
26
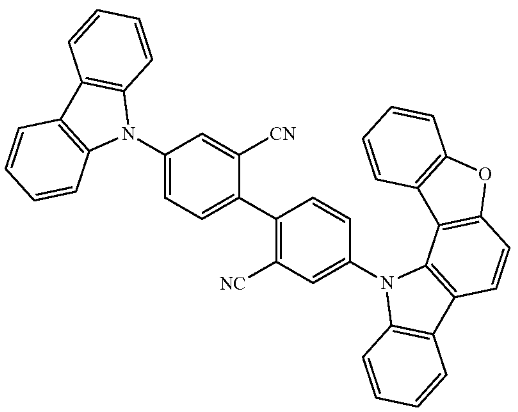
27
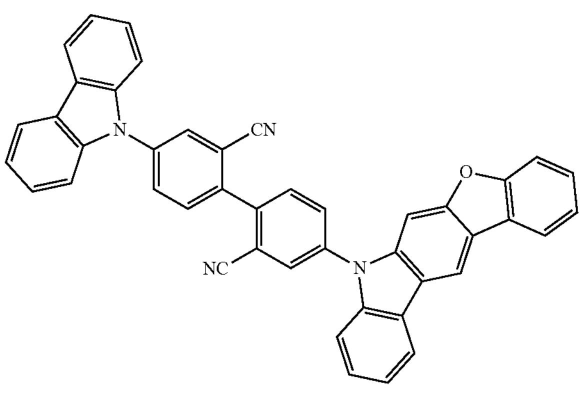
-continued
28
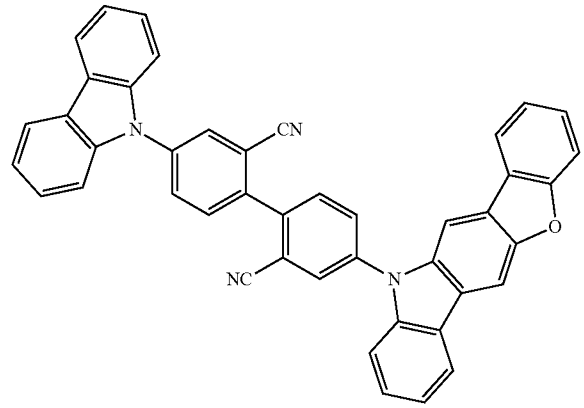
29
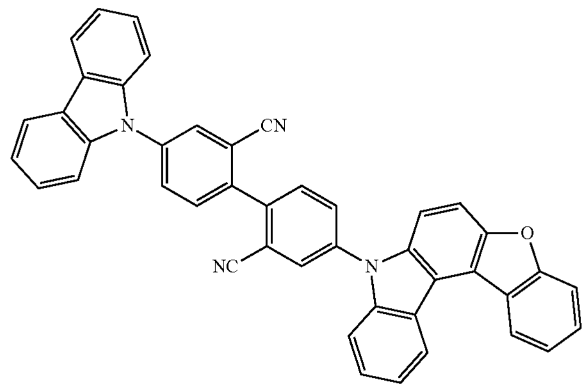
30
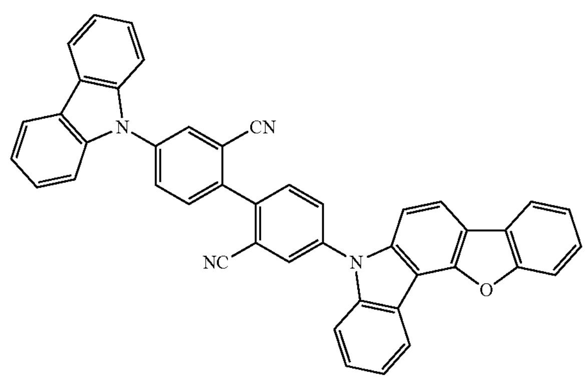
31
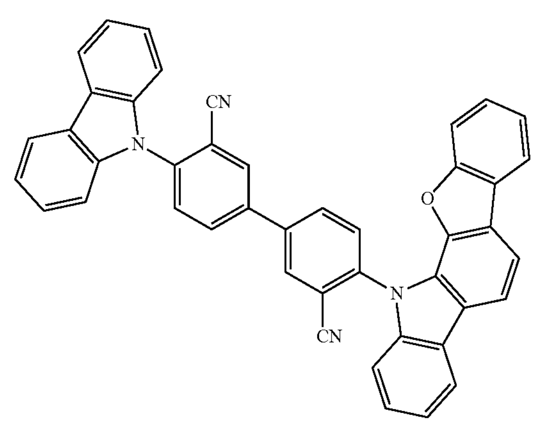

-continued
32
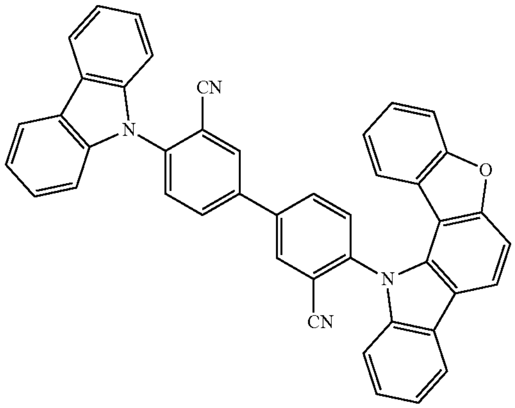
33
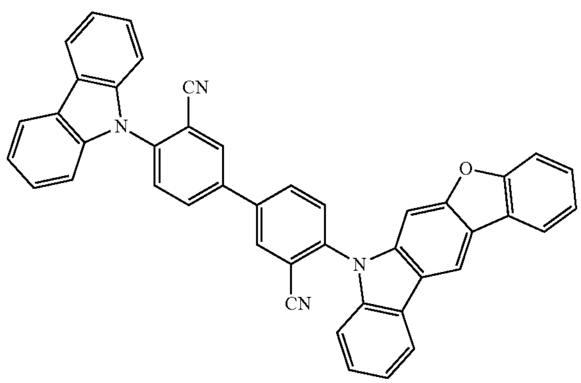
34
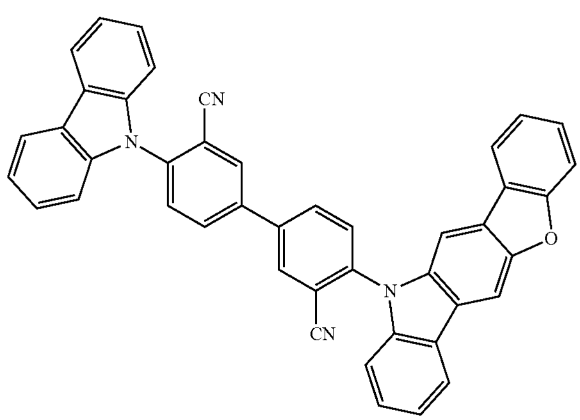
-continued
35
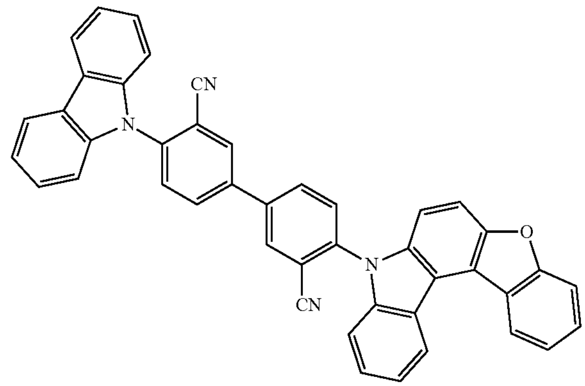
36
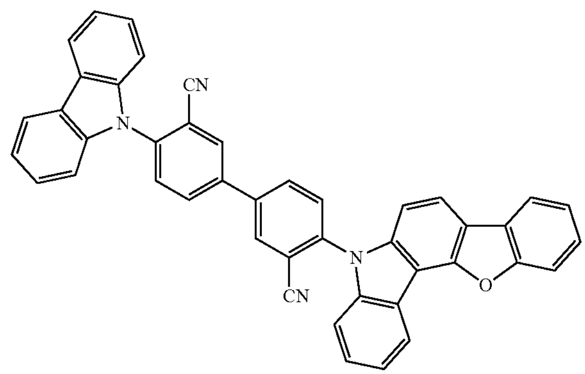
37
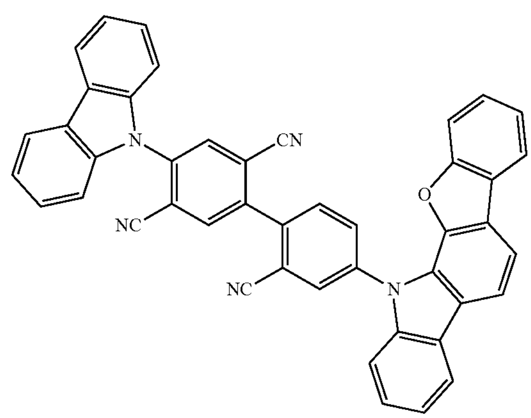
38
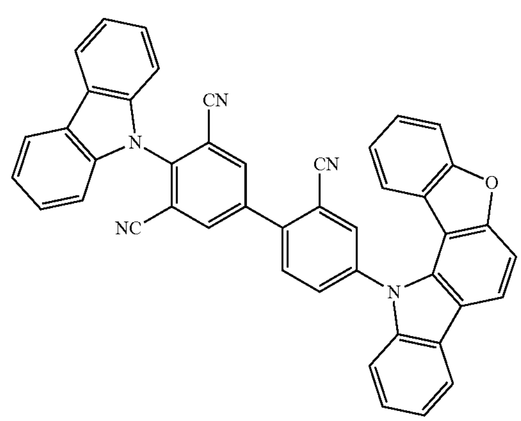

-continued
39
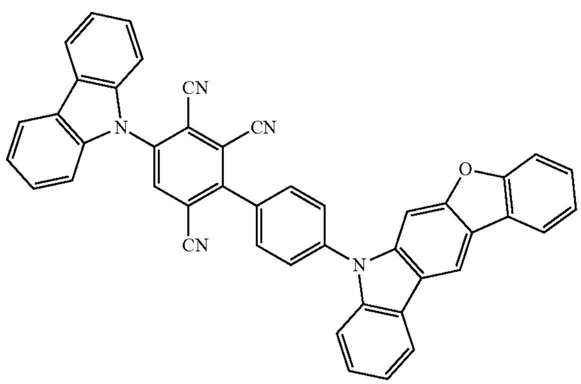
40
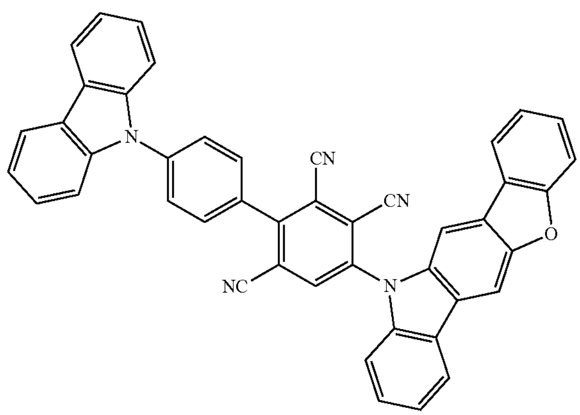
41
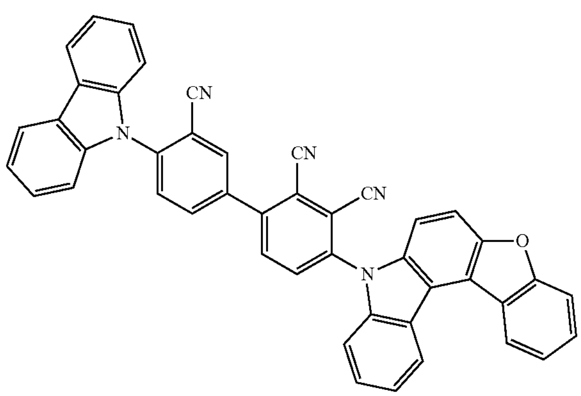
42
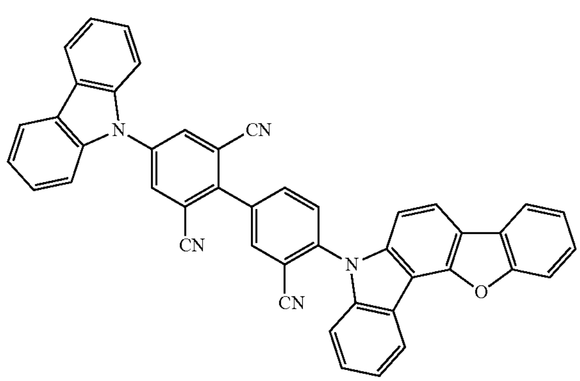
-continued
43
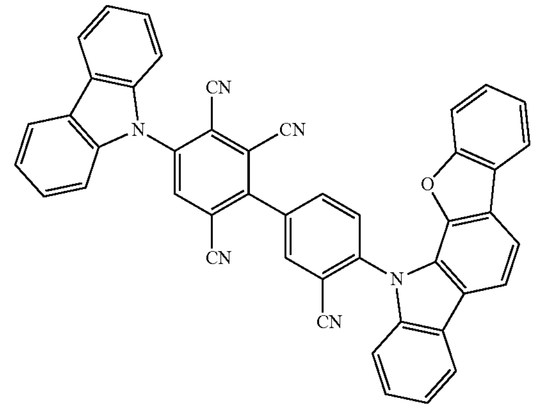
44
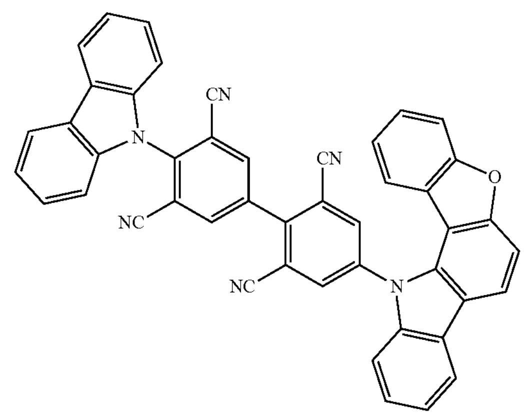
45
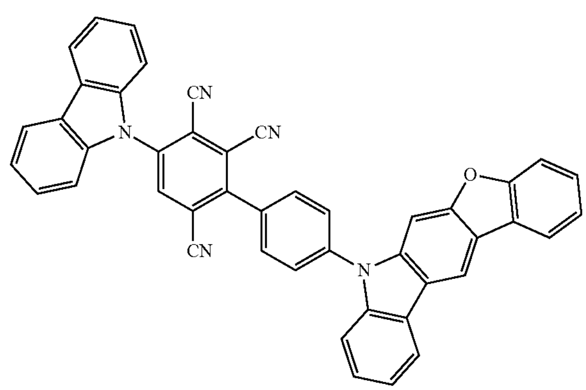

-continued
46
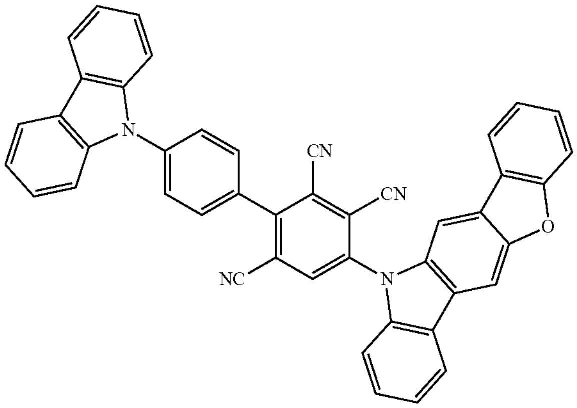
47
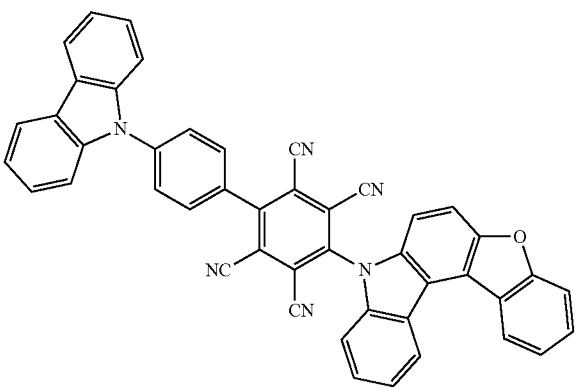
48
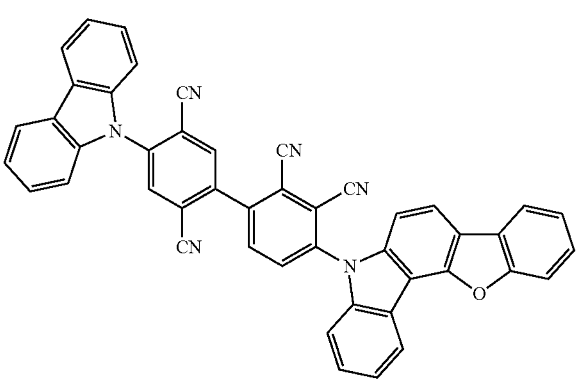
-continued
49
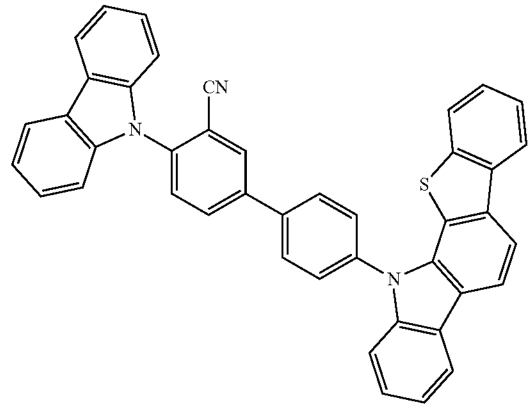
50
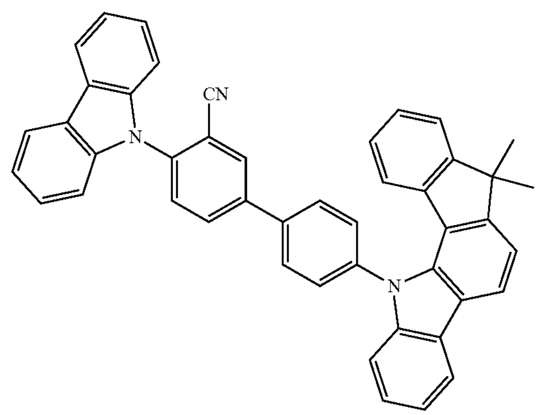
51
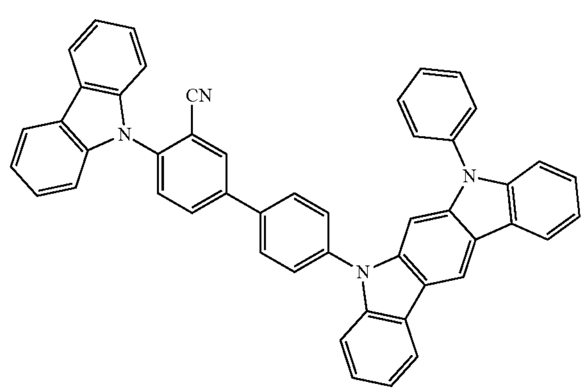

-continued
52
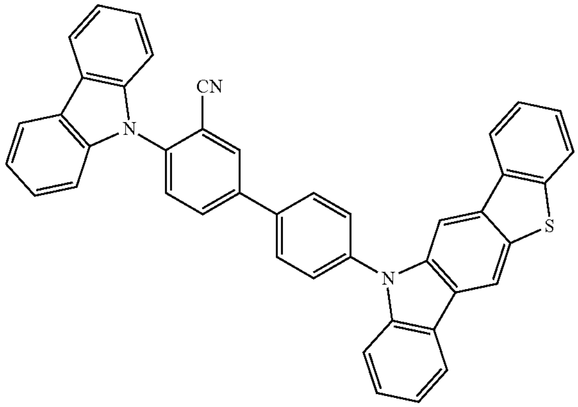
53
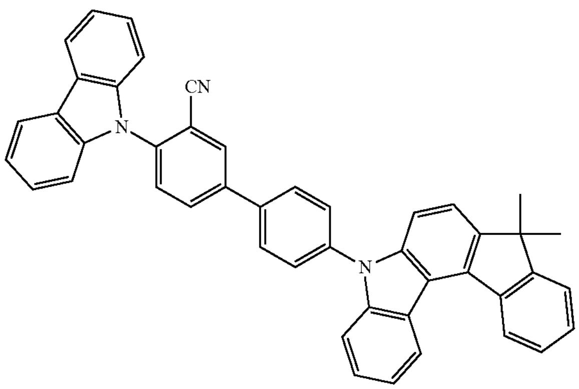
54
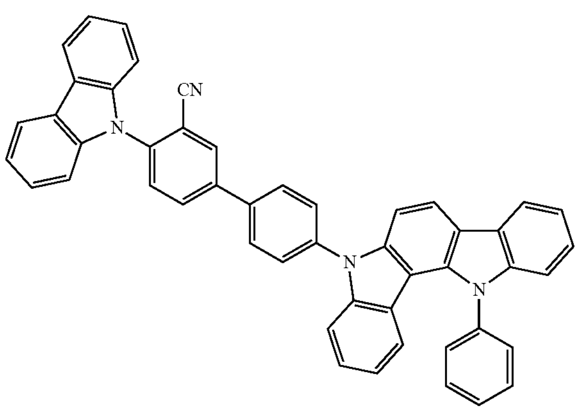
-continued
55
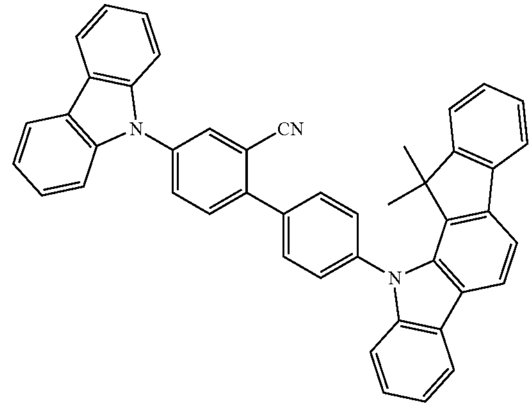
56
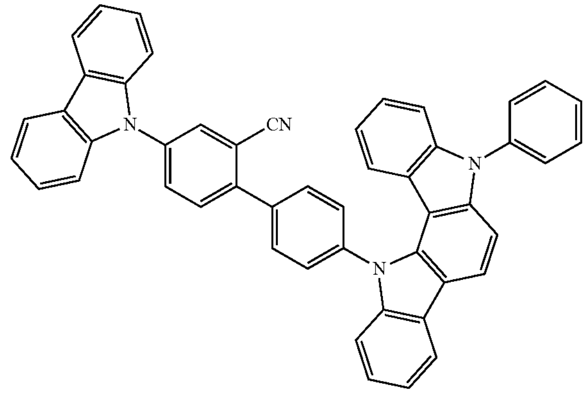
57
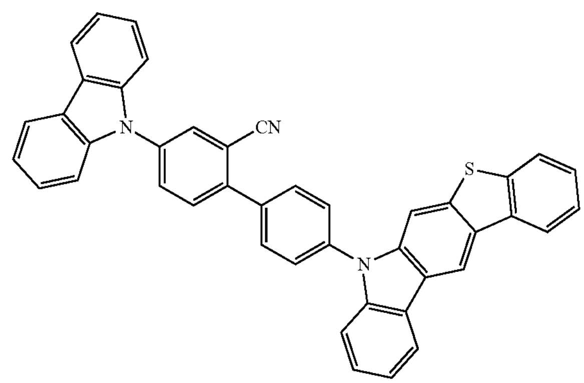
58
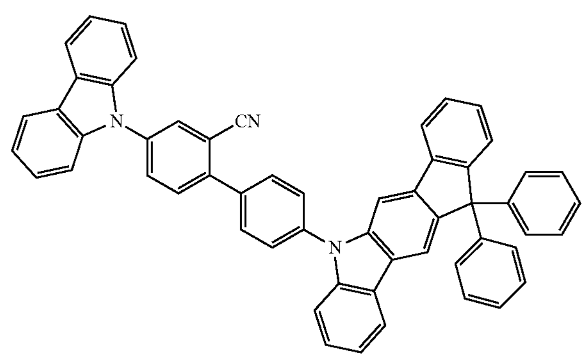

-continued
59
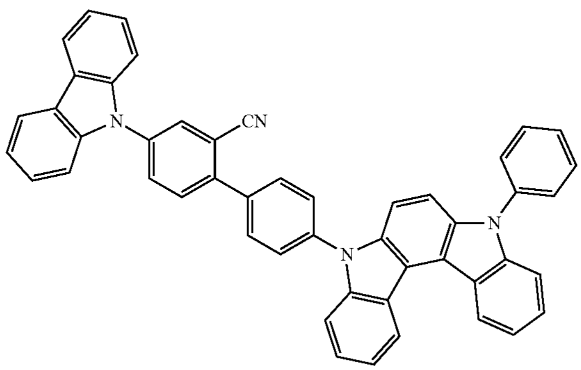
60
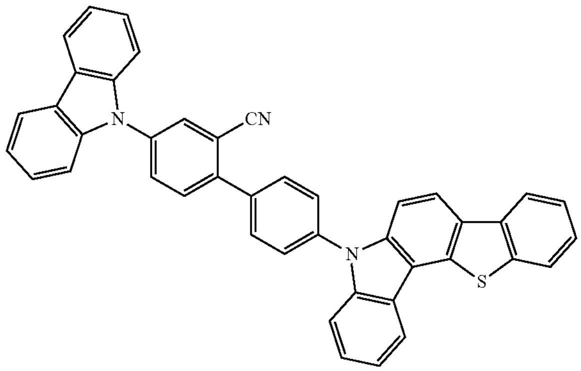
61
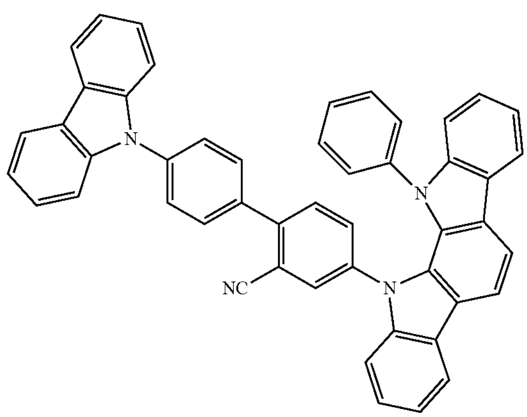
62
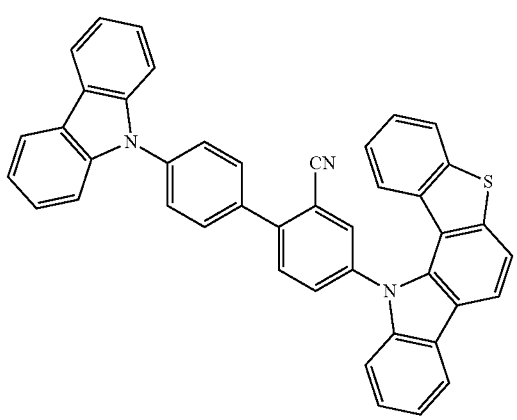
-continued
63
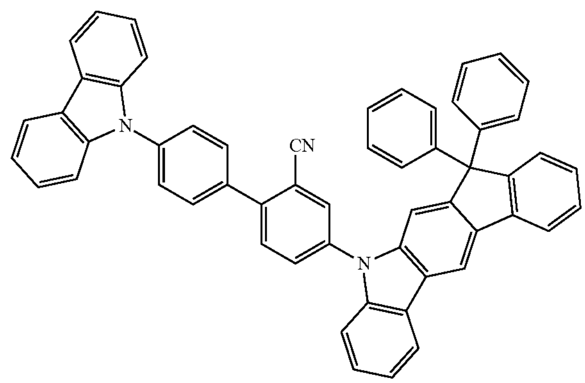
64
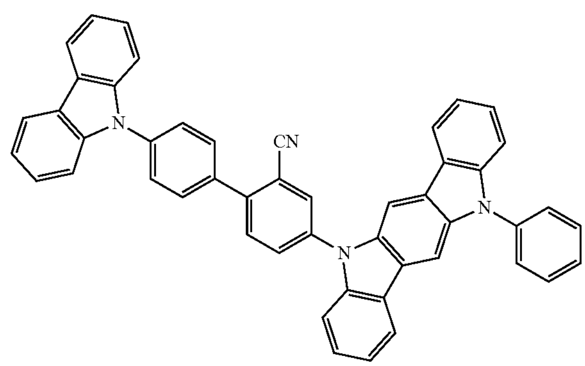
65
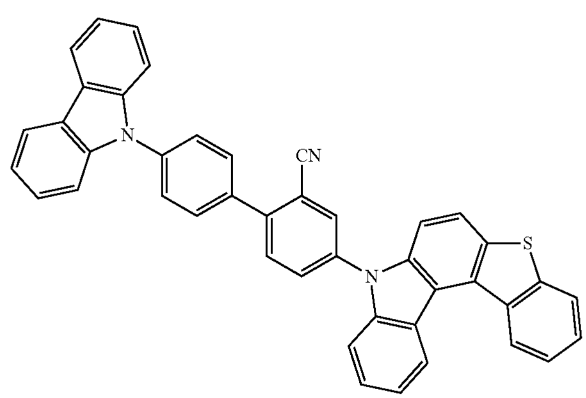
66
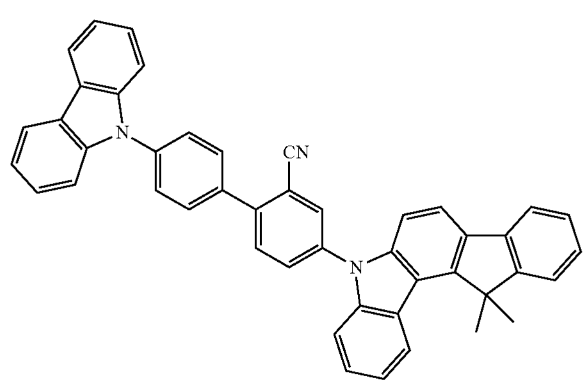

67
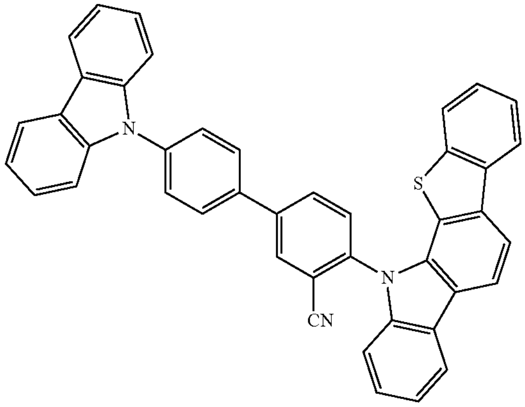
68
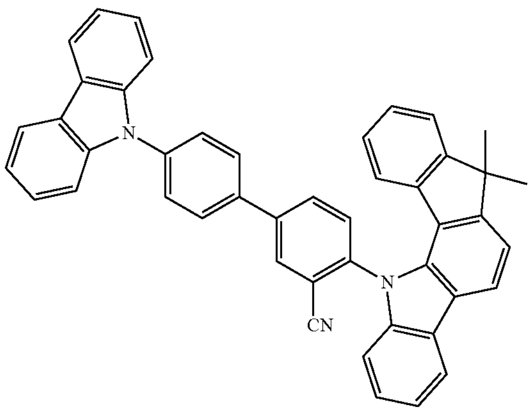
69
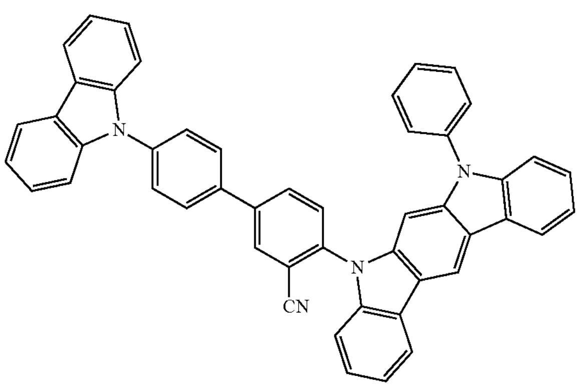
70
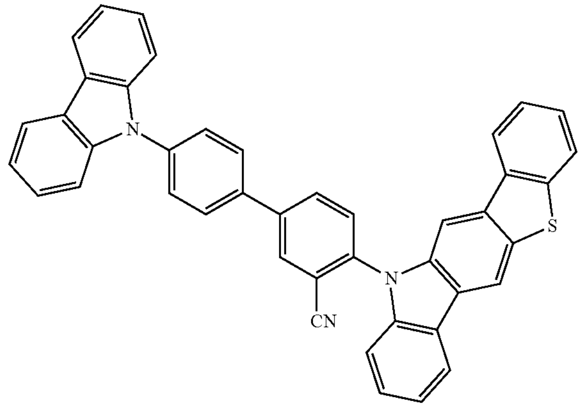
71
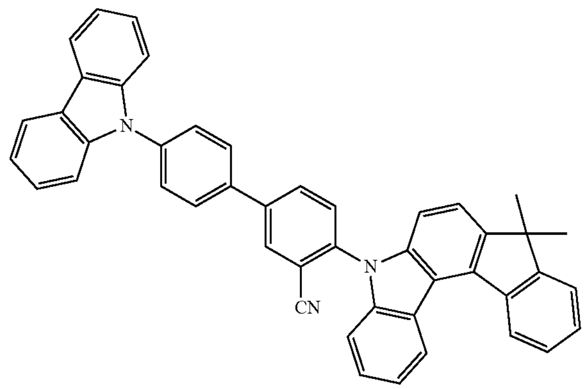
72
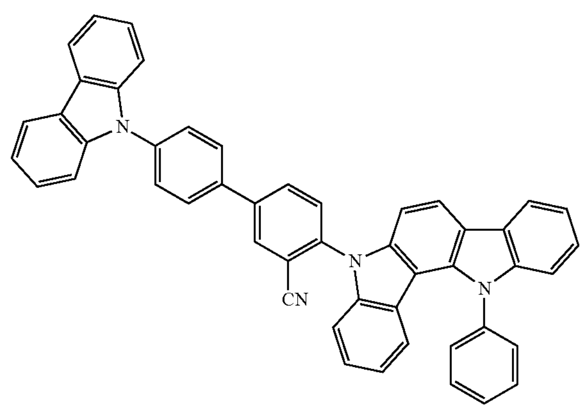

-continued
73
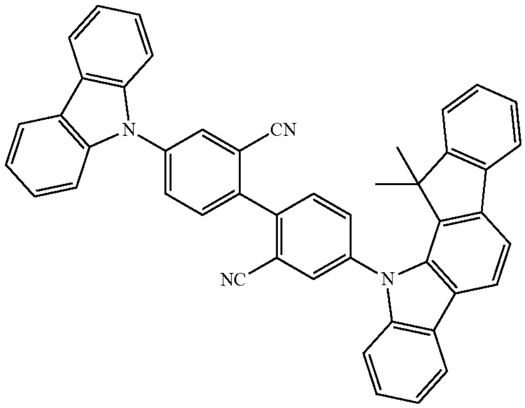
74
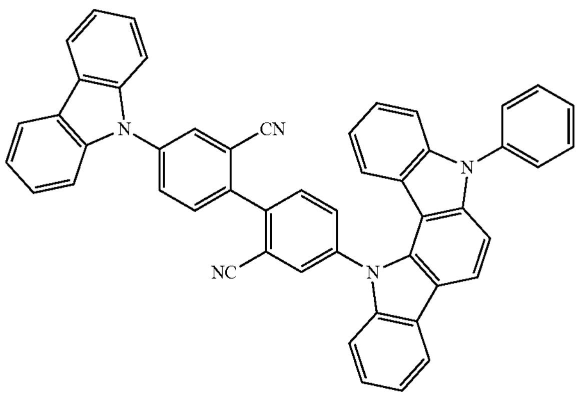
75
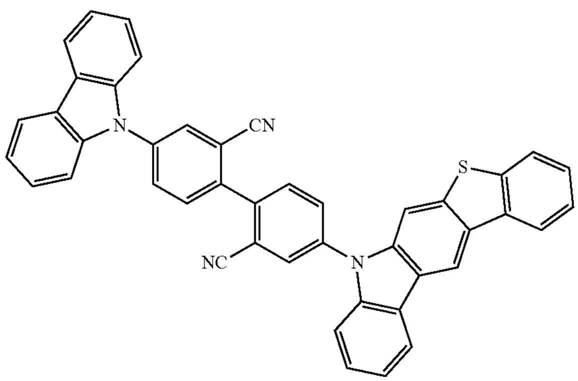
76
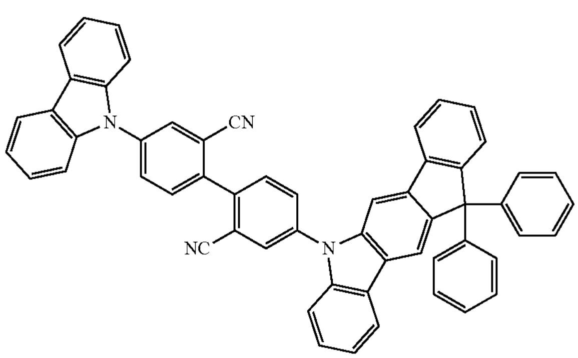
-continued
77
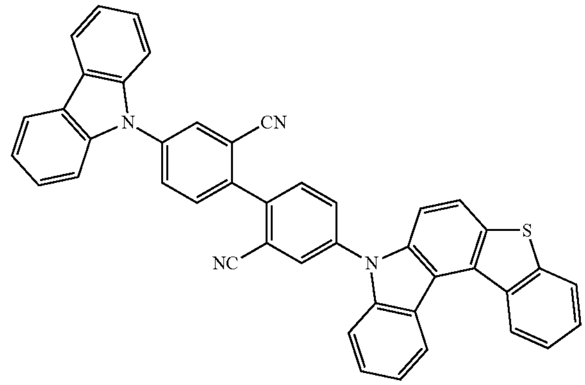
78
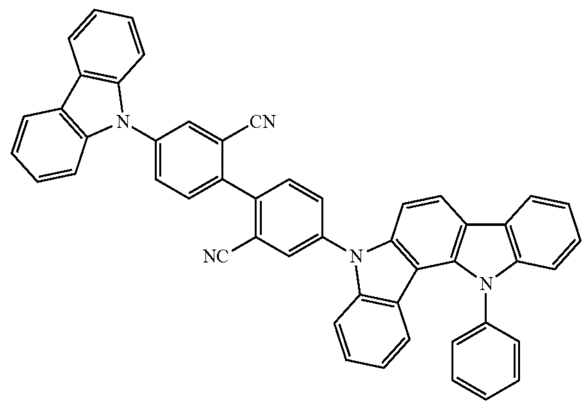
79
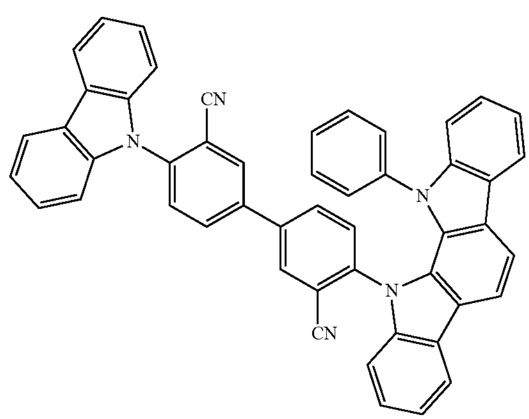

-continued
80
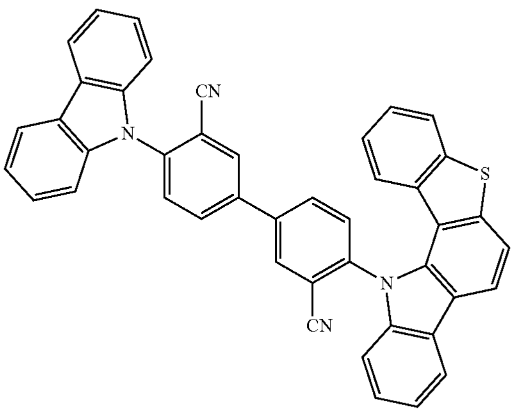
81
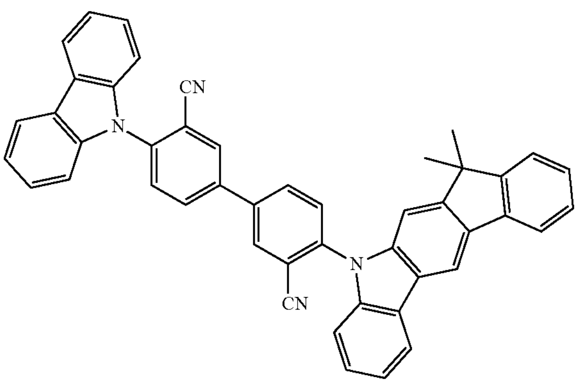
82
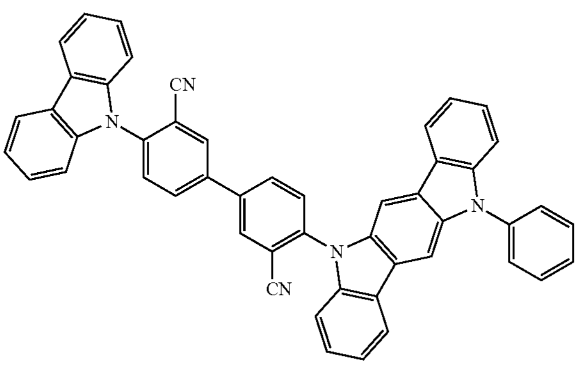
83
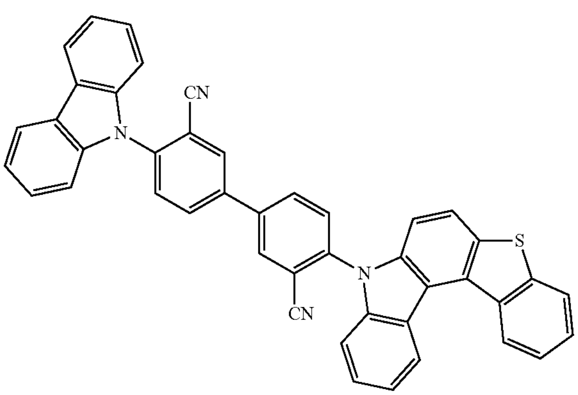
-continued
84
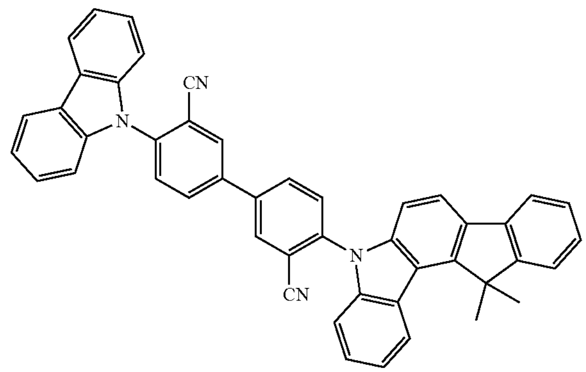
85
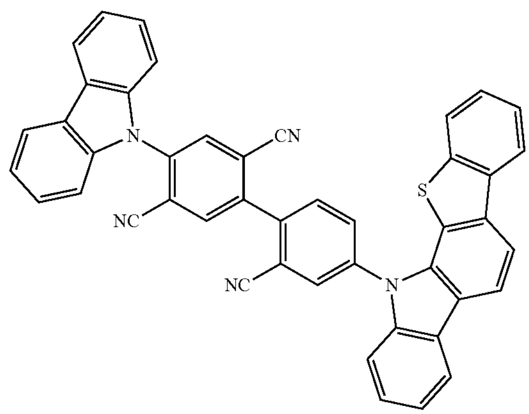
86
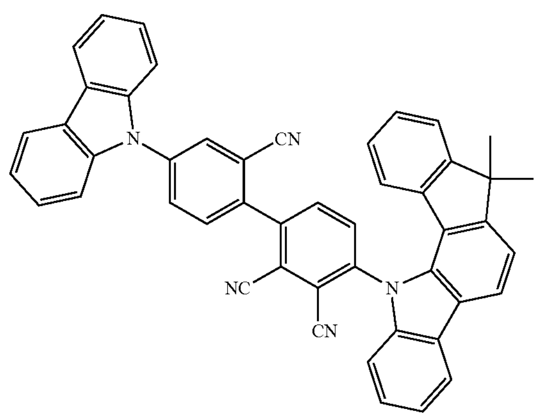
87
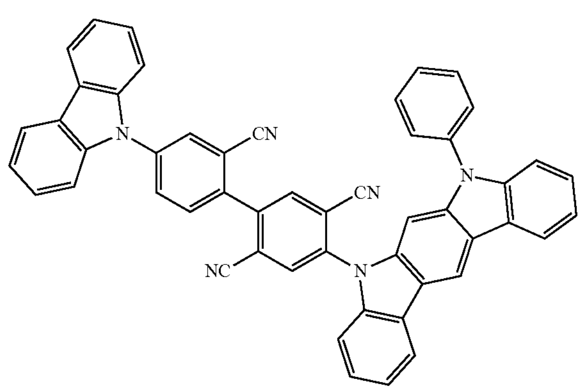

-continued
88
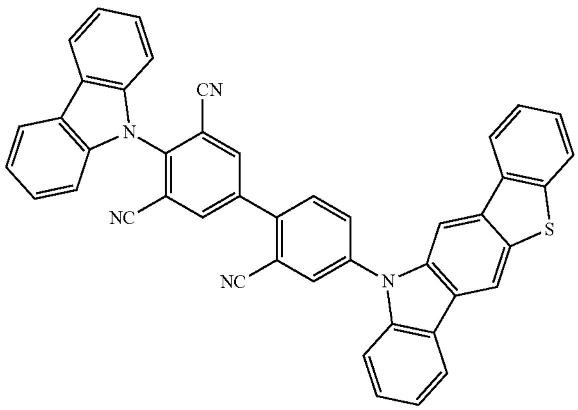
89
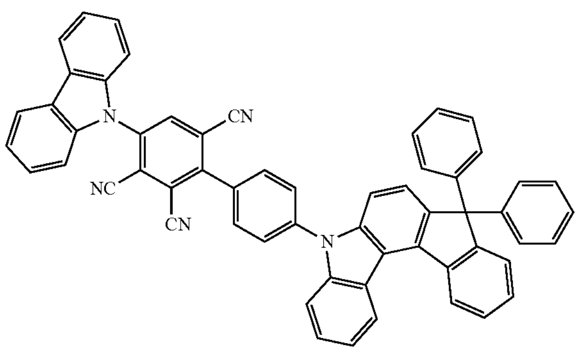
90
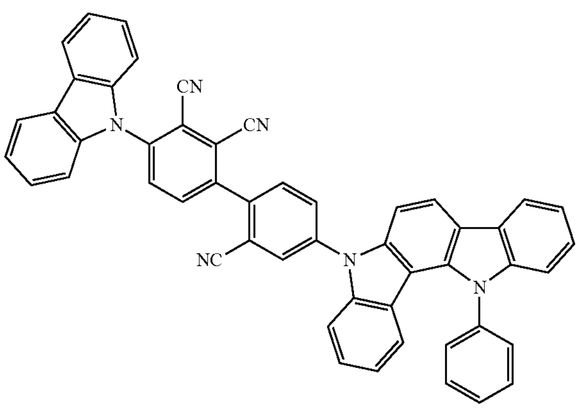
91
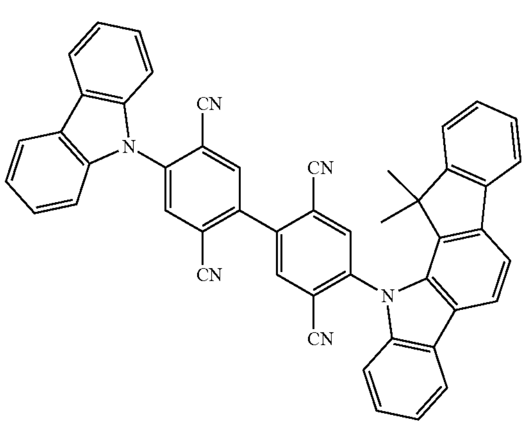
-continued
92
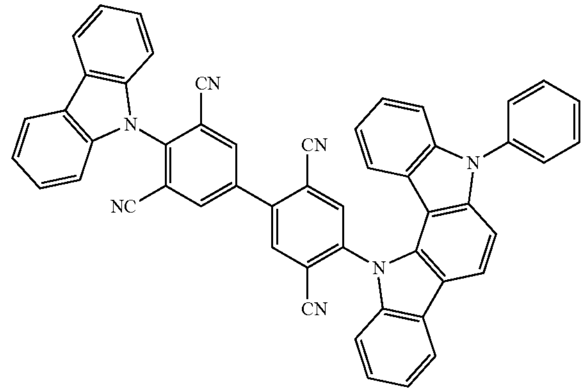
93
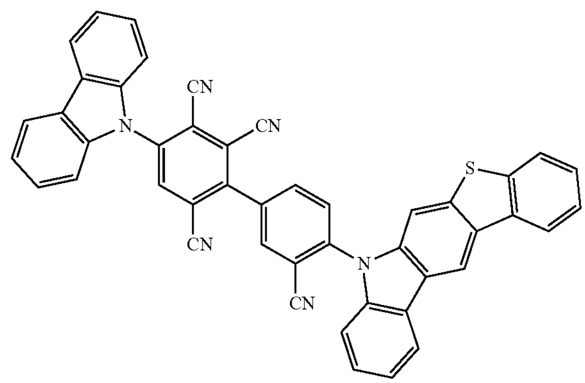
94
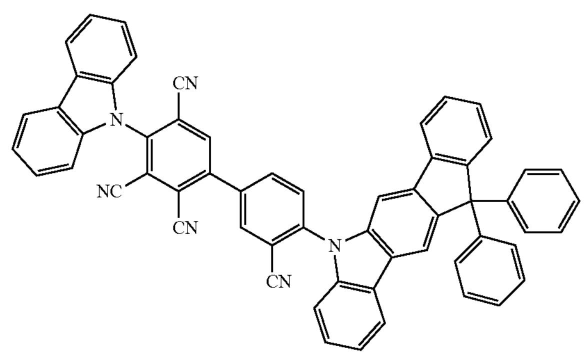
95
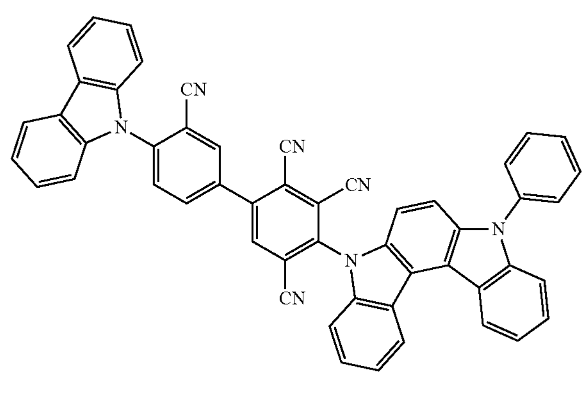

-continued
96
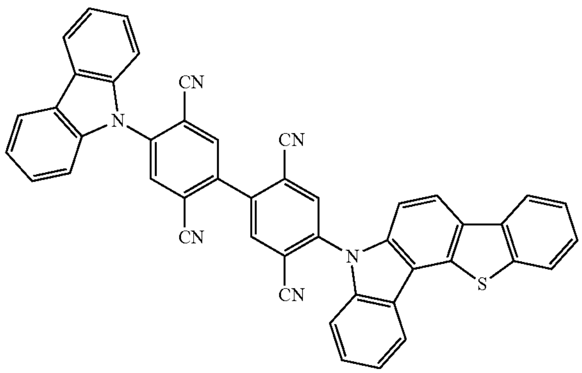
97
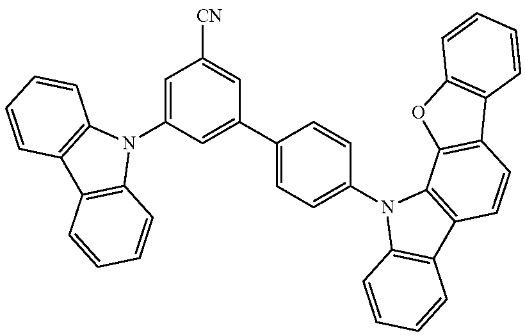
98
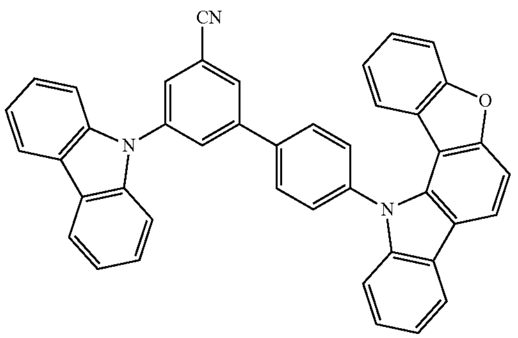
99
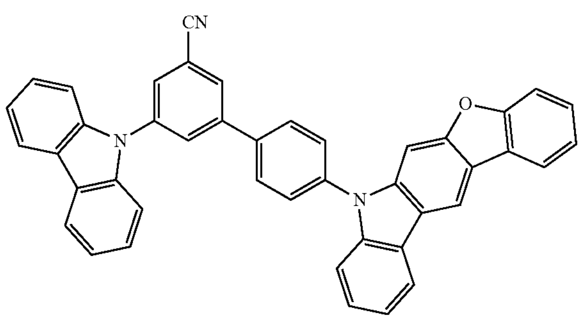
-continued
100
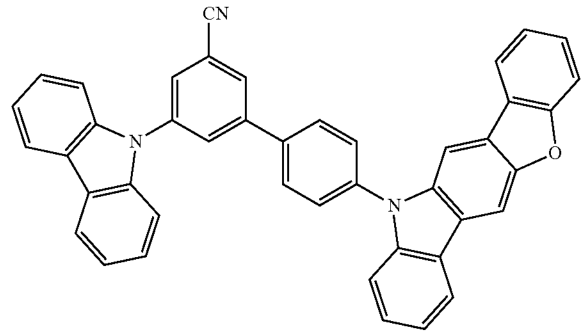
101
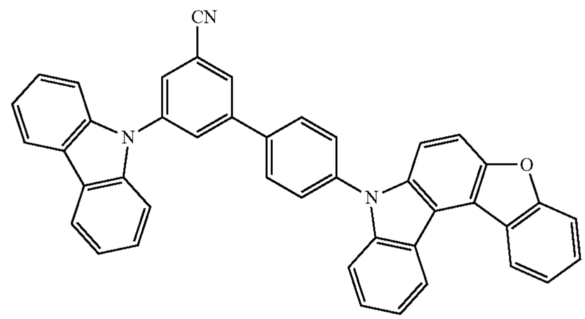
102
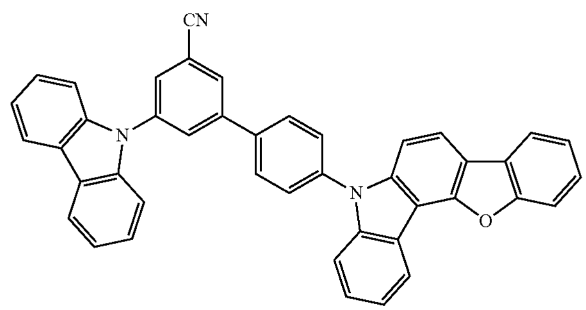
103
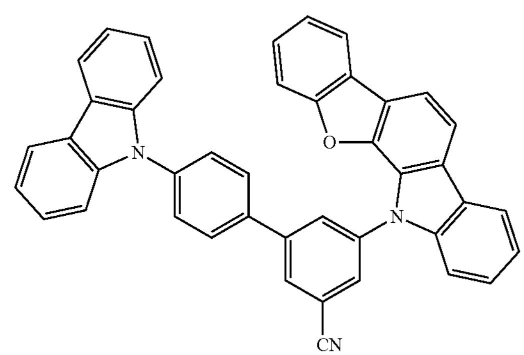

-continued
104
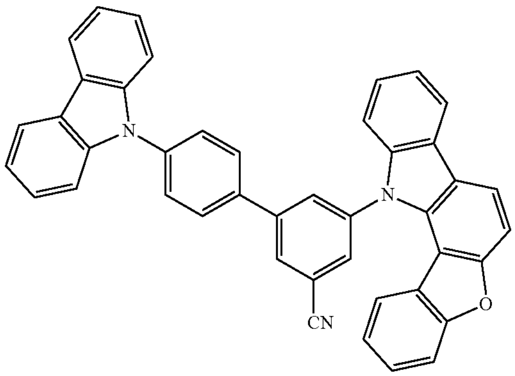
105
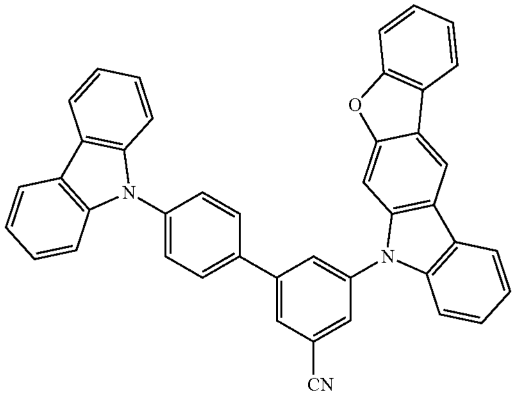
106
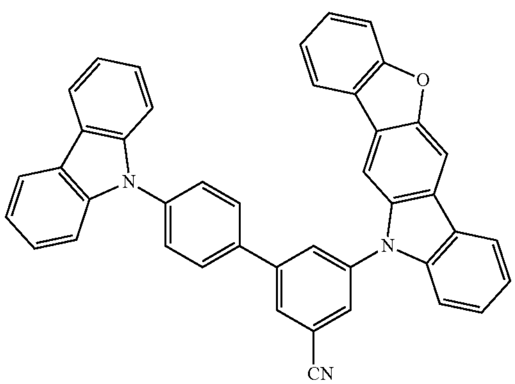
107
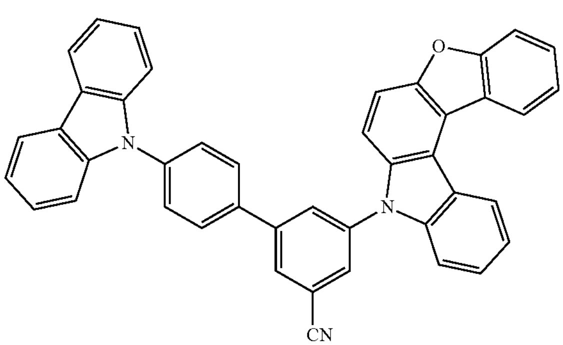
-continued
108
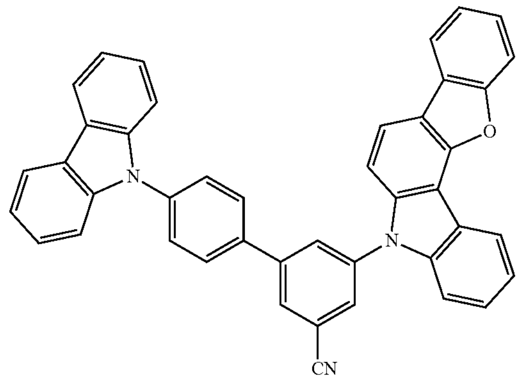
109
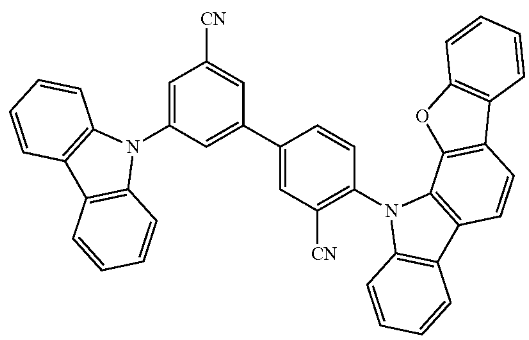
110
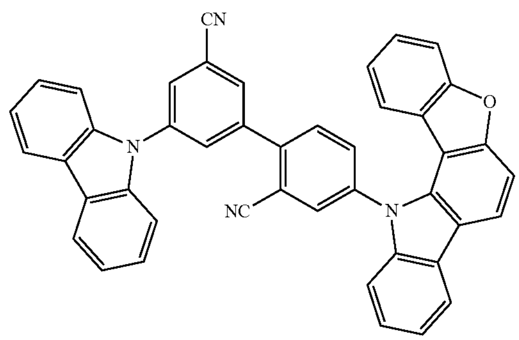
111
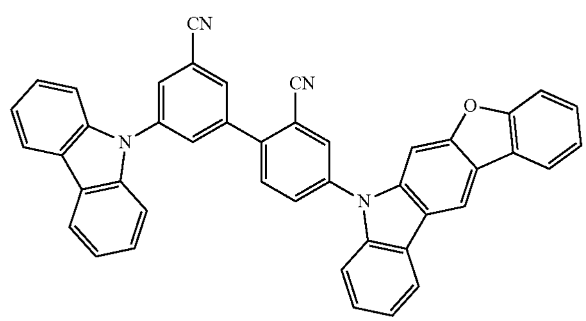

-continued
112
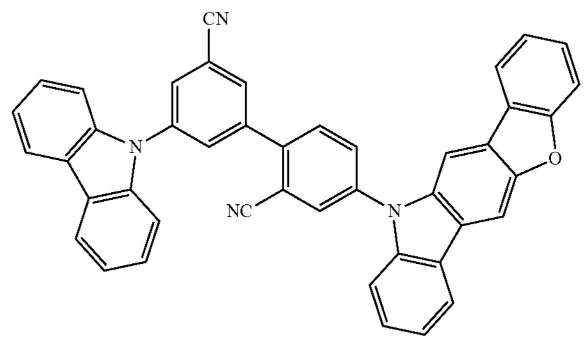
113
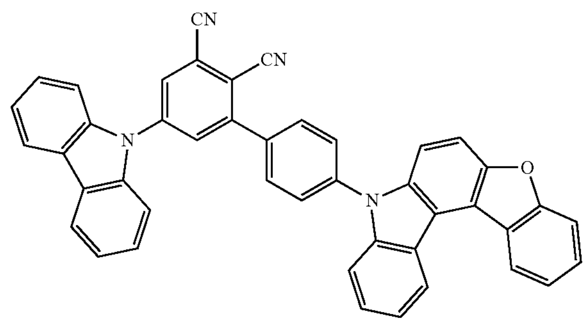
114
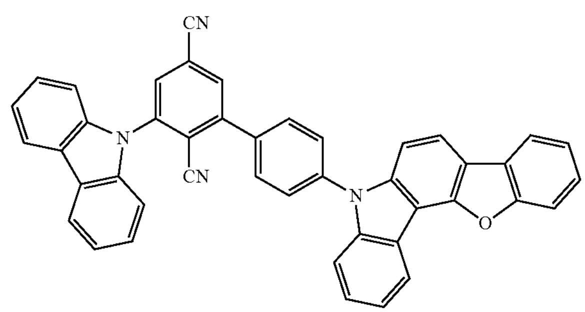
115
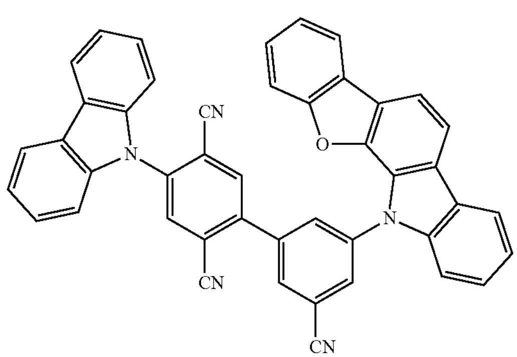
-continued
116
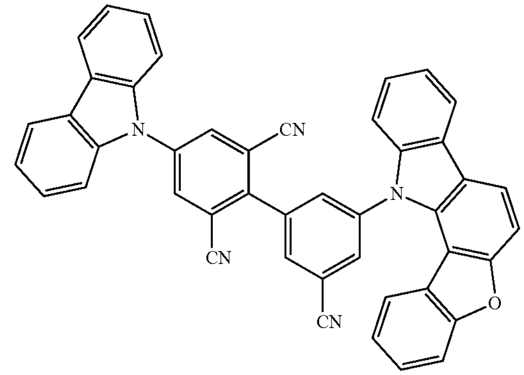
117
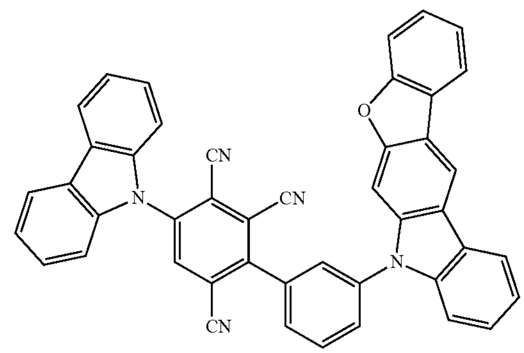
118
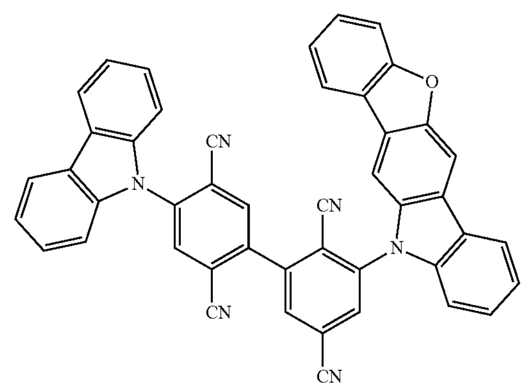
119
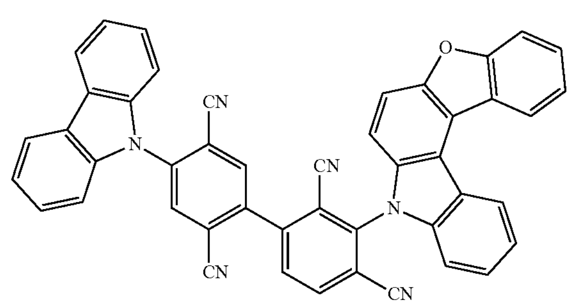

120
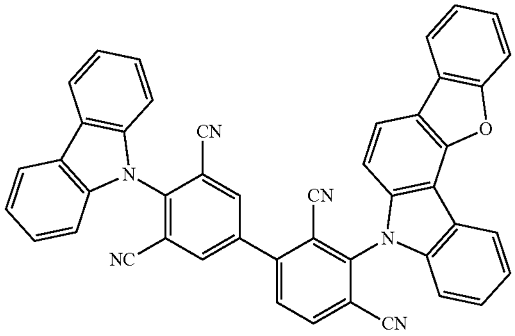
121
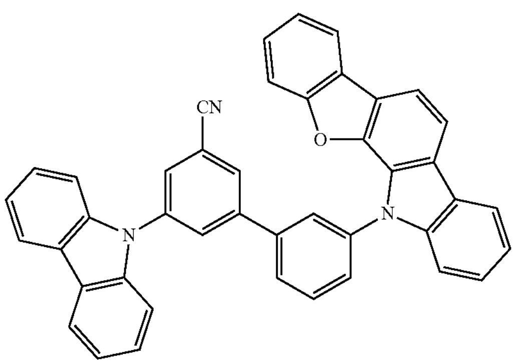
122
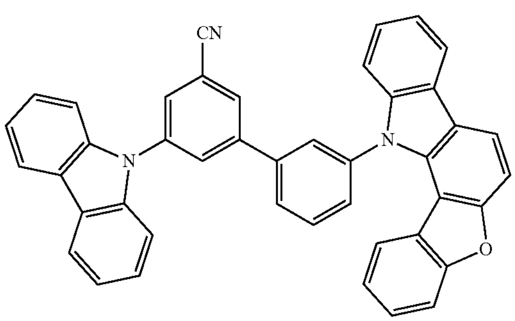
123
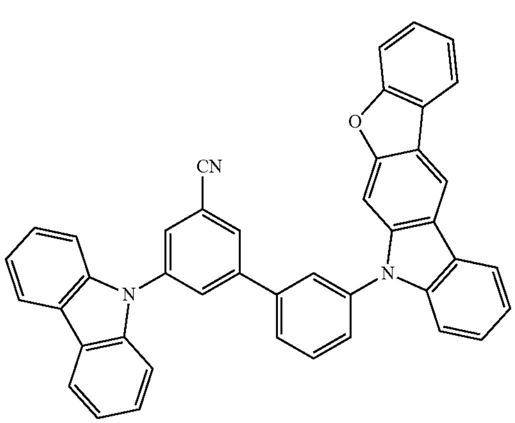
124
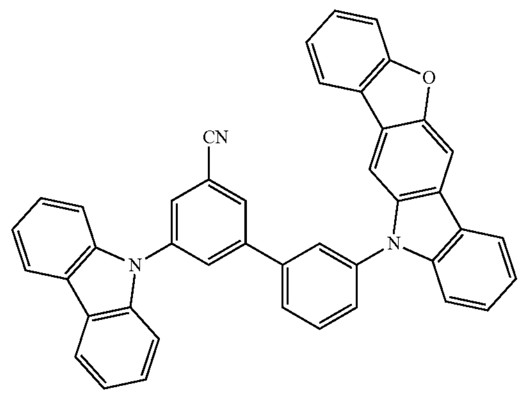
125
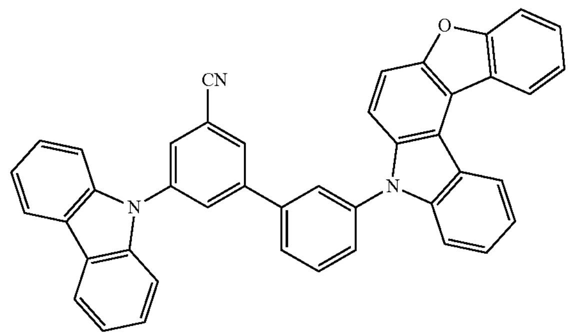
126
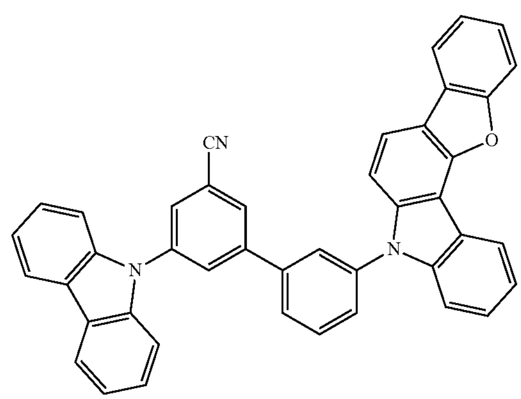
127
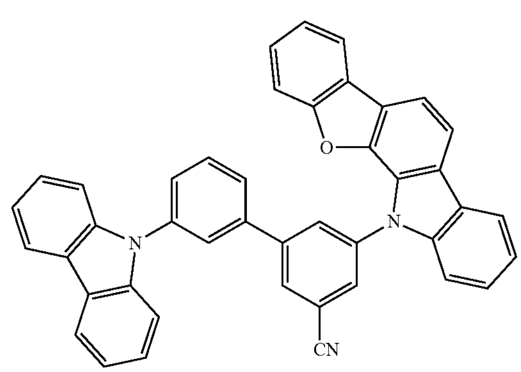

-continued
128
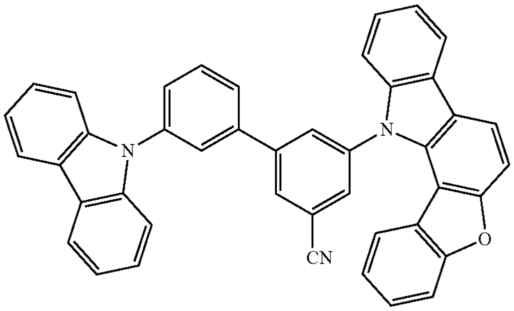
129
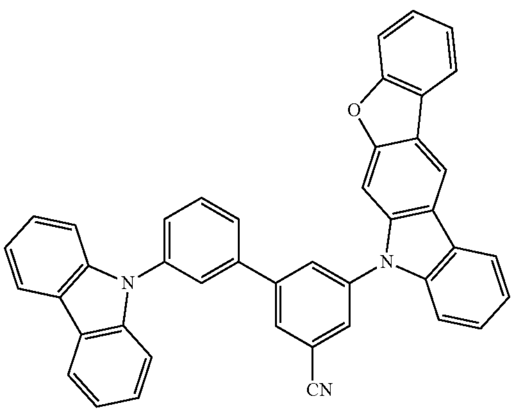
130
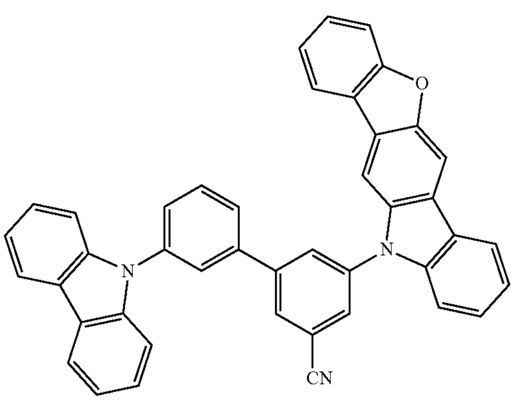
131
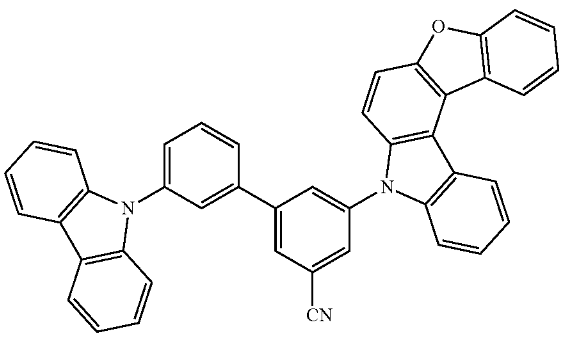
-continued
132
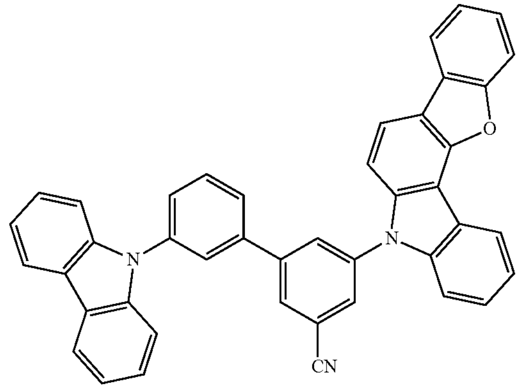
133
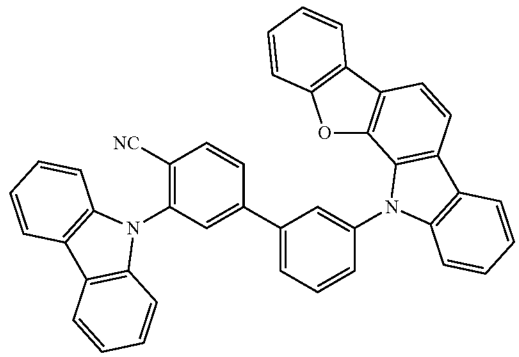
134
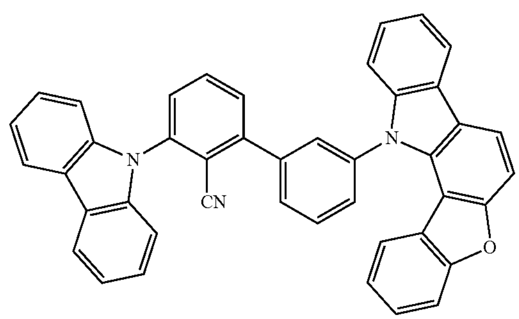
135
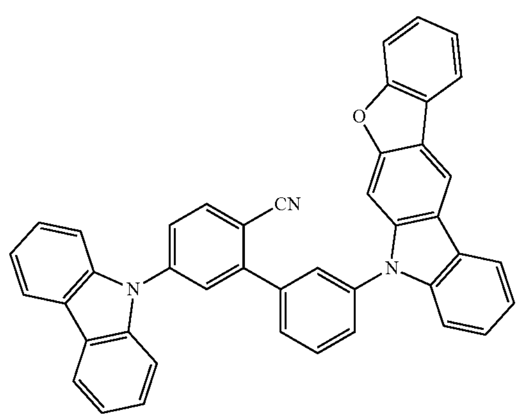

-continued
136
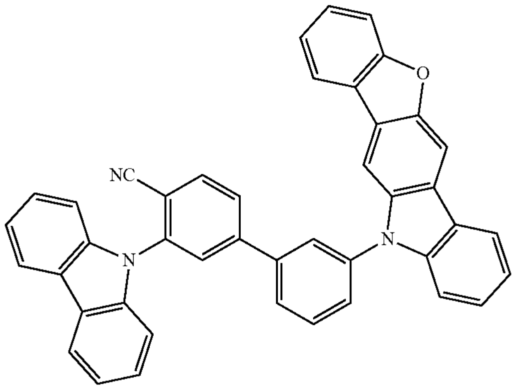
137
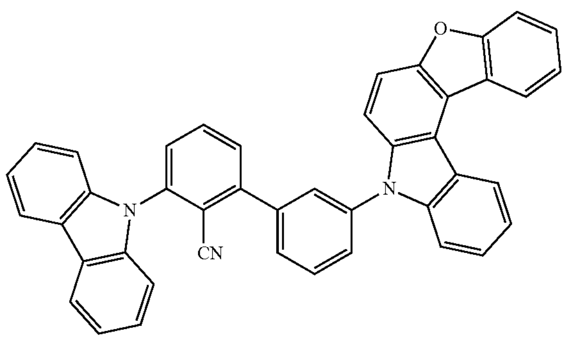
138
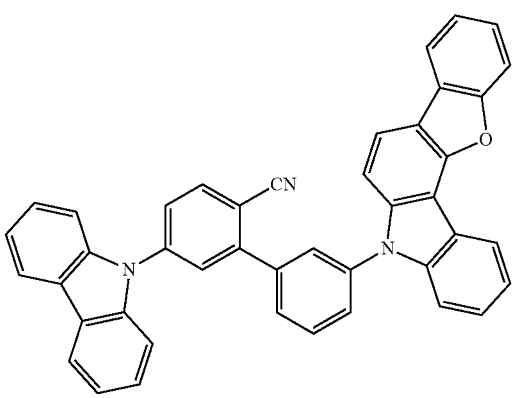
139
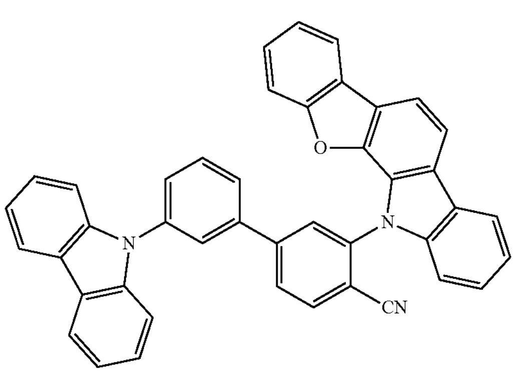
-continued
140
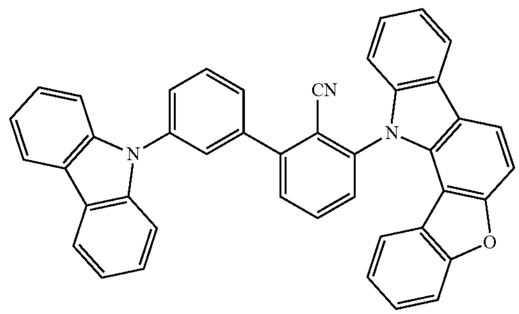
141
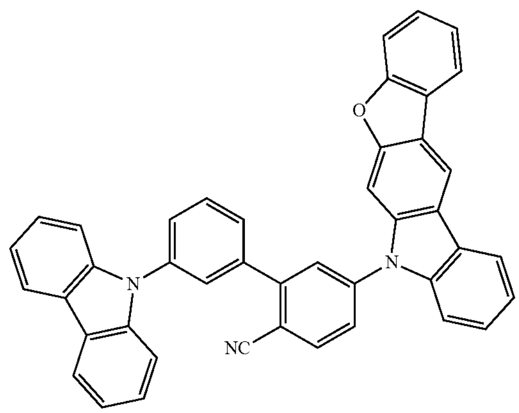
142
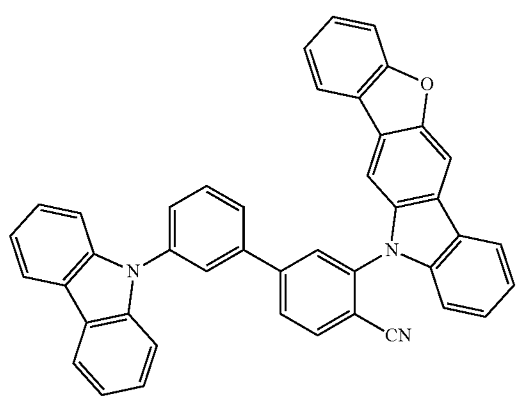
143
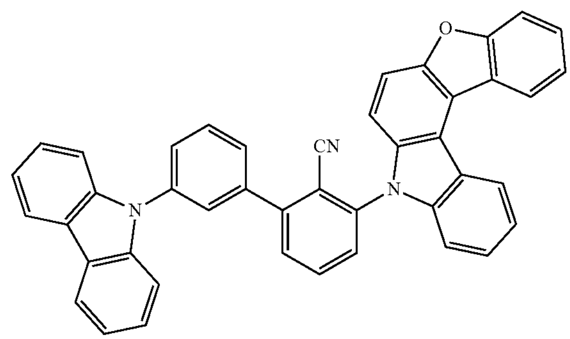

144
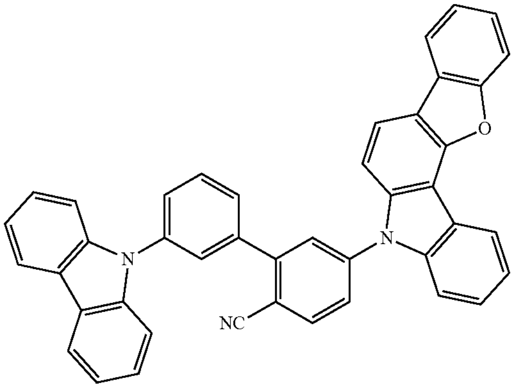
145
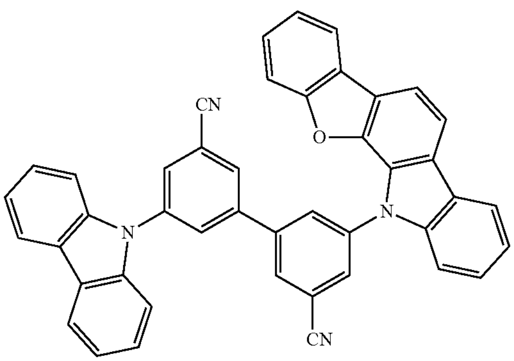
146
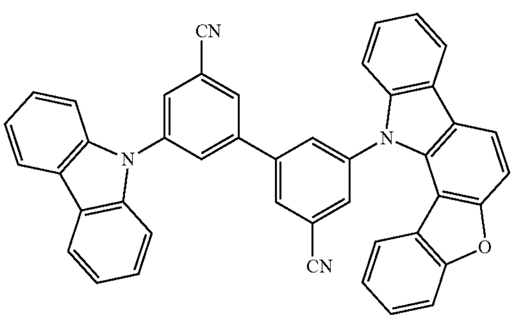
147
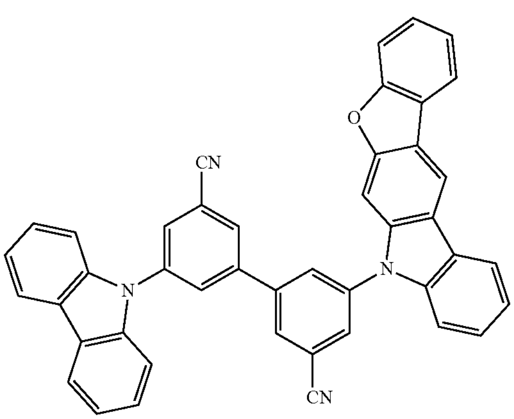
148
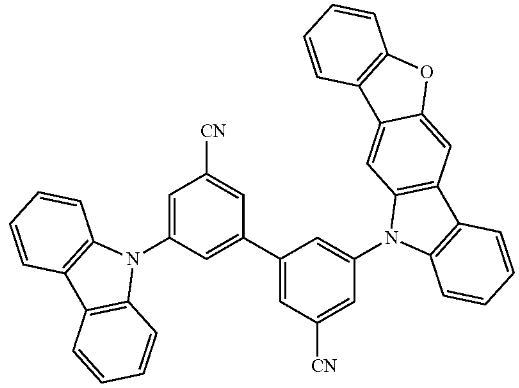
149
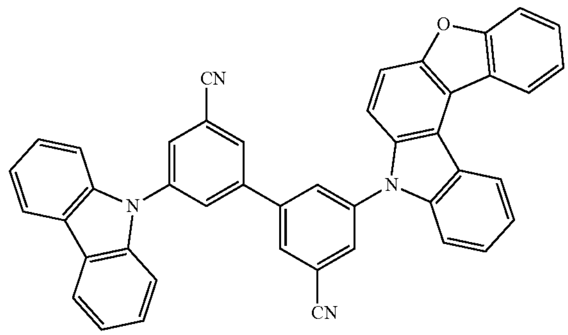
150
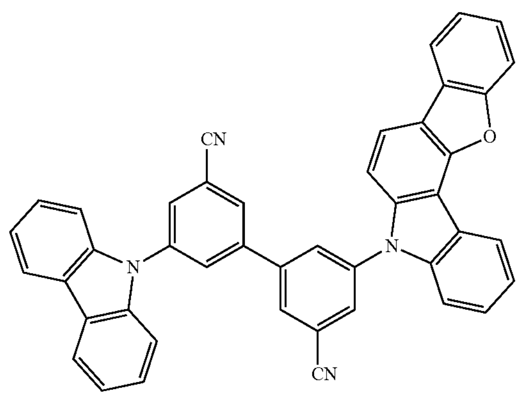
151
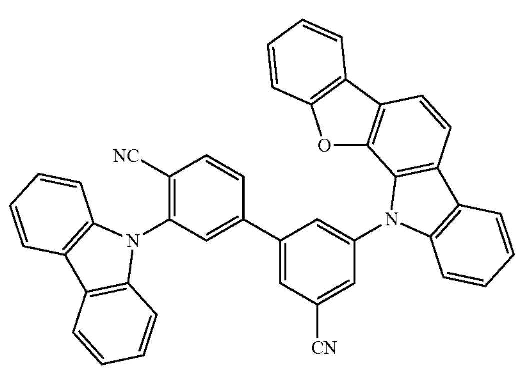

-continued
152
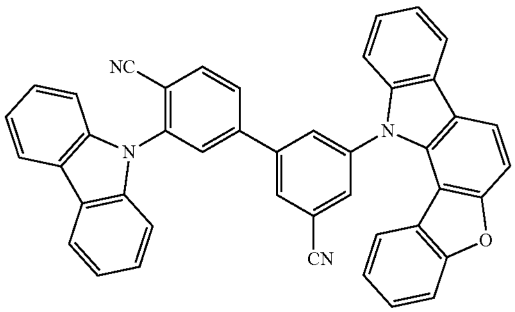
153
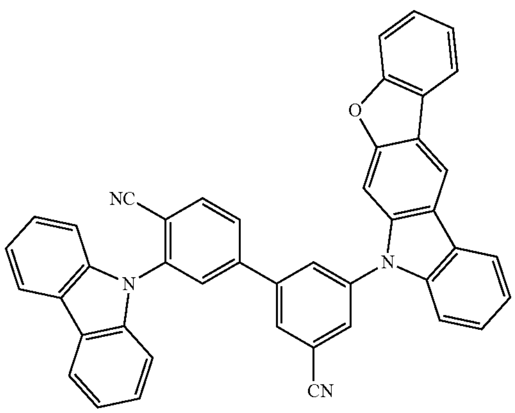
154
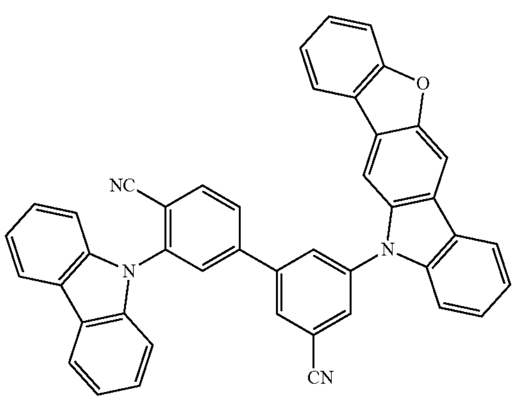
155
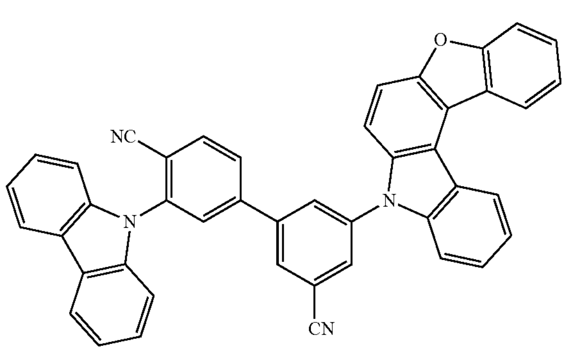
-continued
156
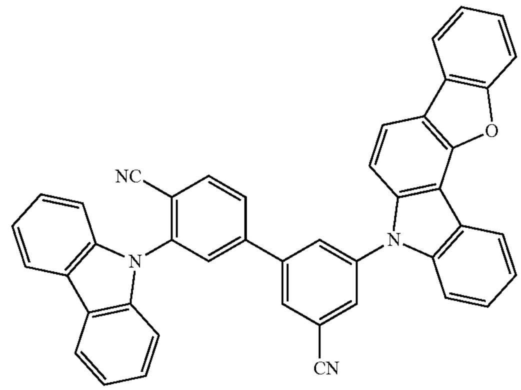
157
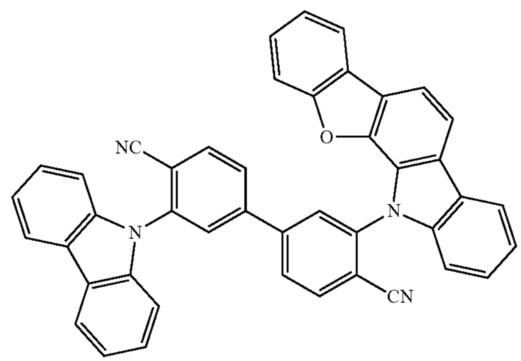
158
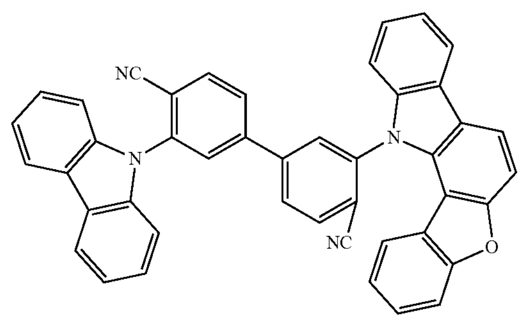
159
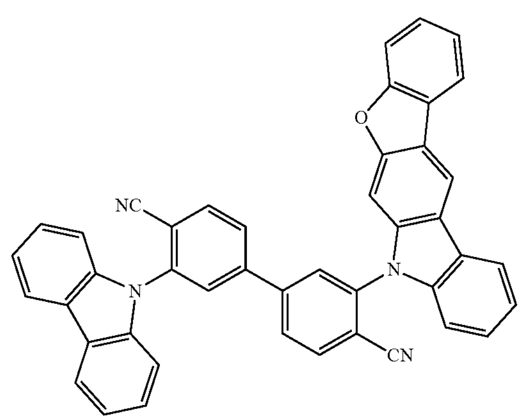

-continued
160
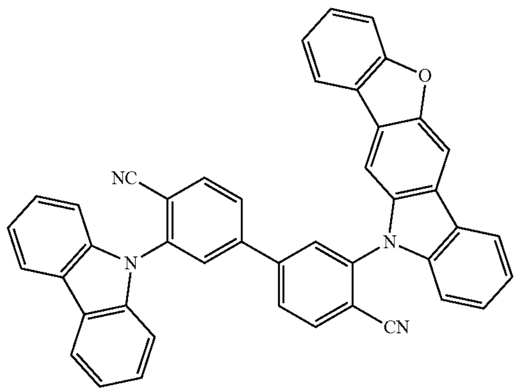
161
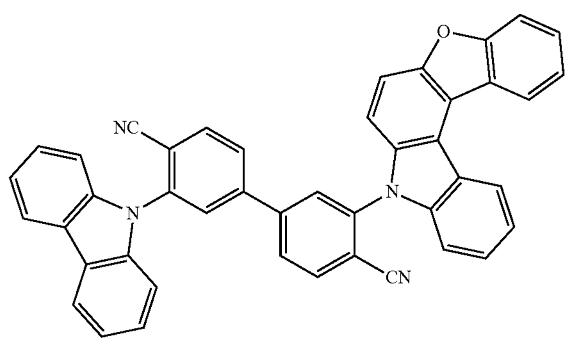
162
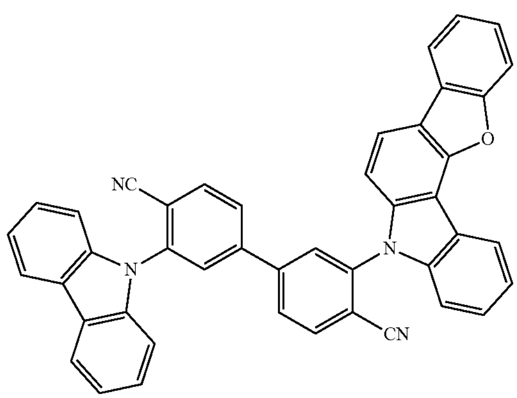
163
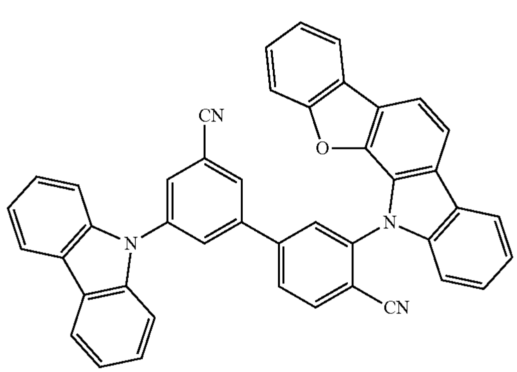
-continued
164
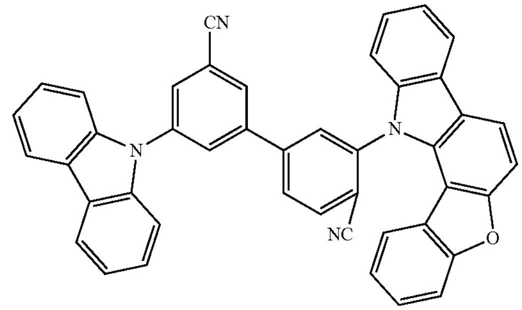
165
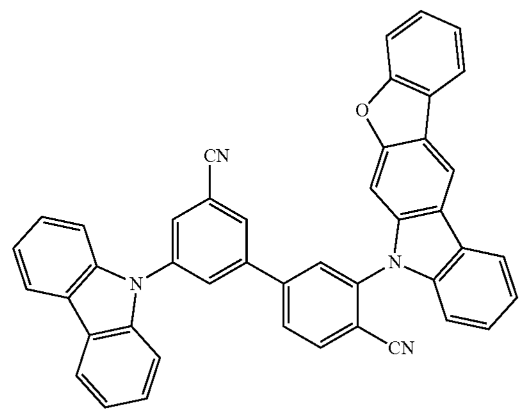
166
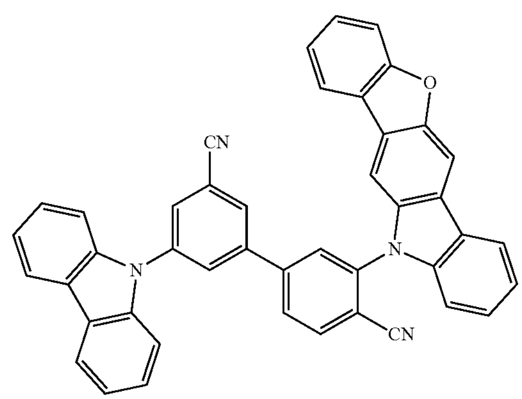
167
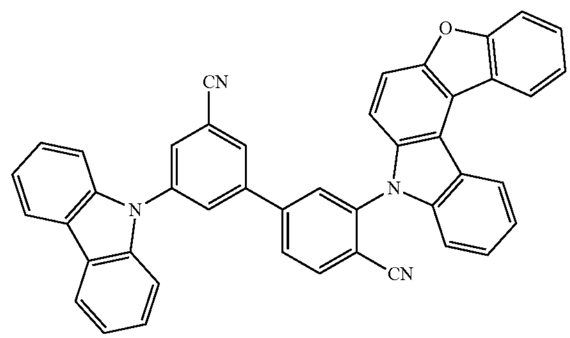

-continued
168
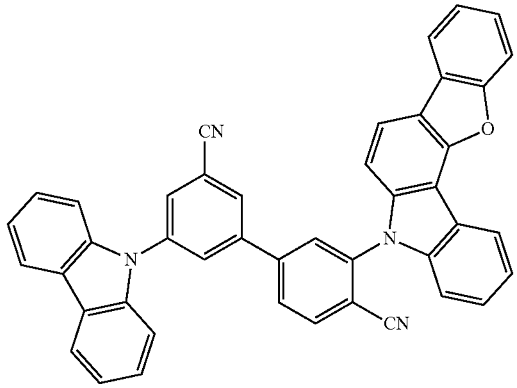
169
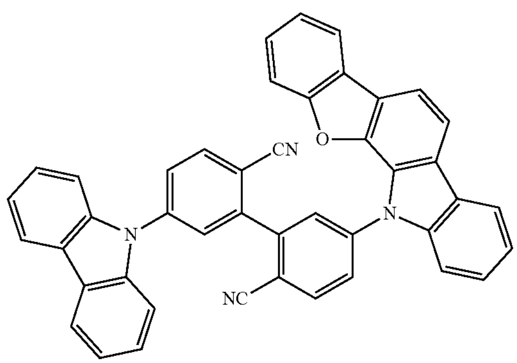
170
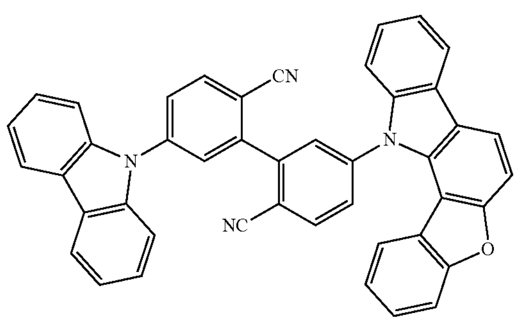
171
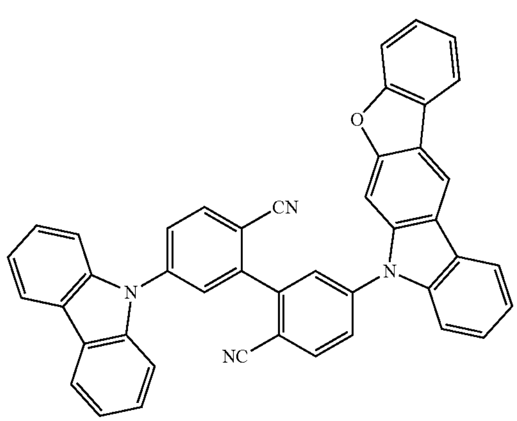
-continued
172
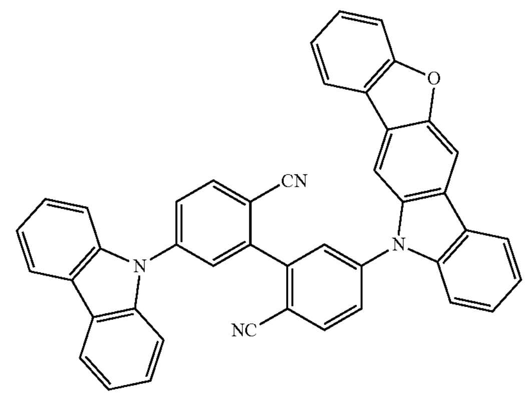
173
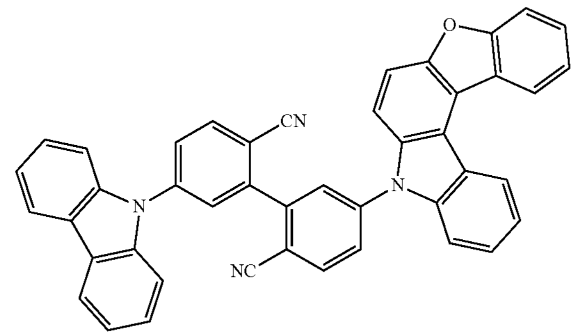
174
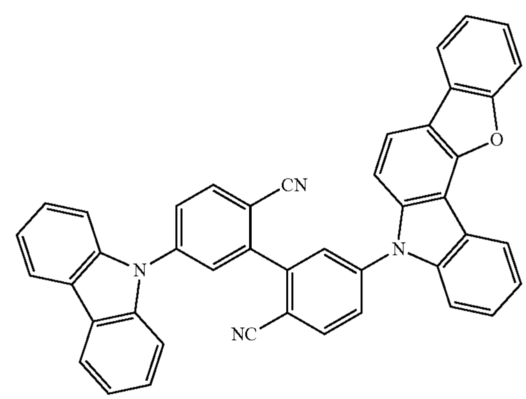
175
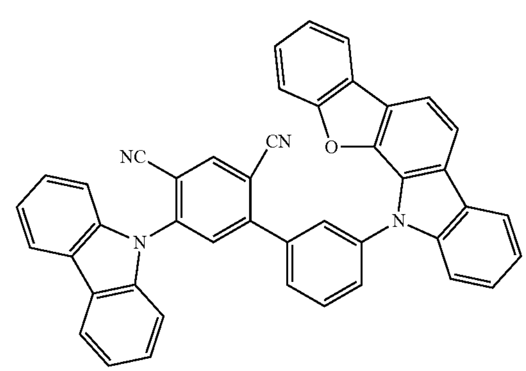

-continued
176
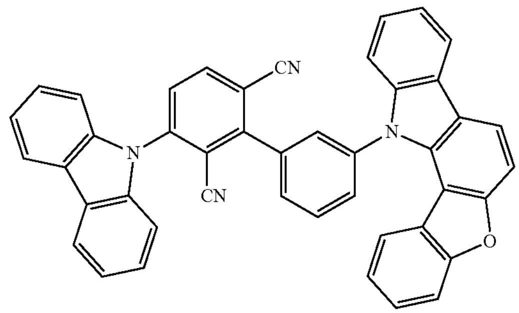
177
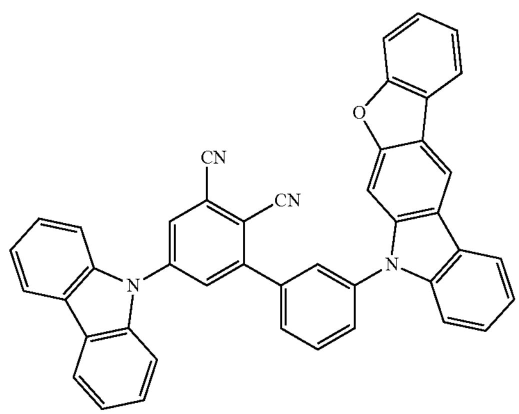
178
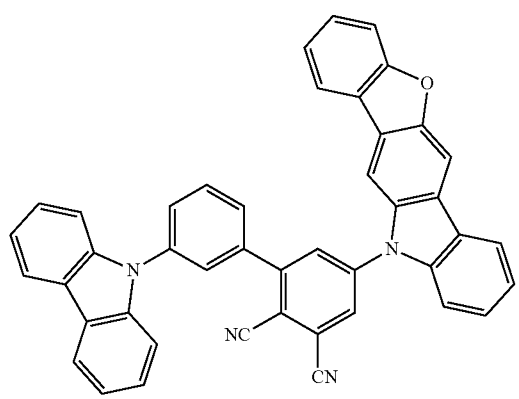
179
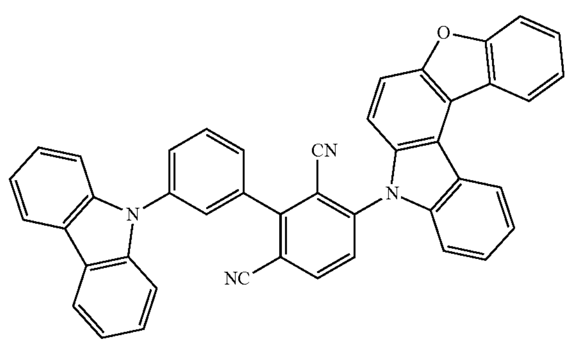
-continued
180
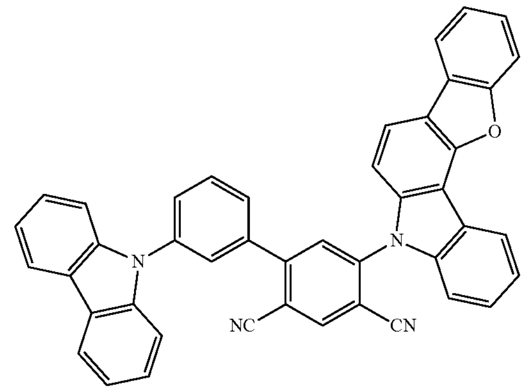
181
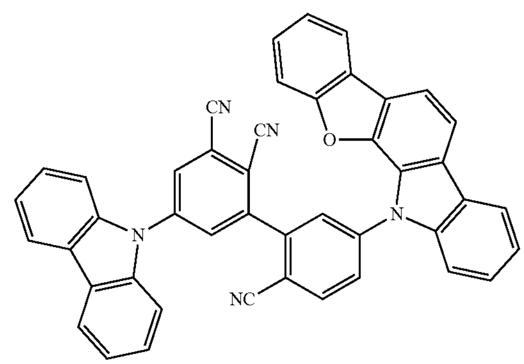
182
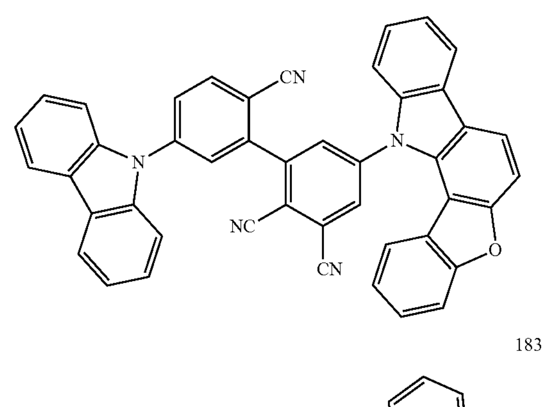
183
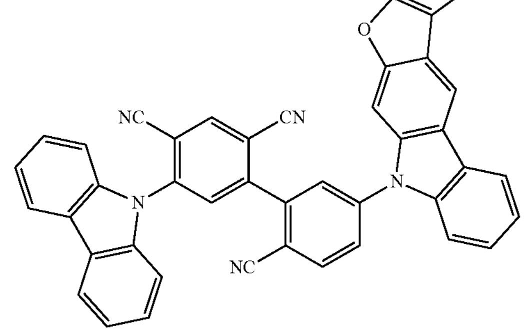

-continued
184
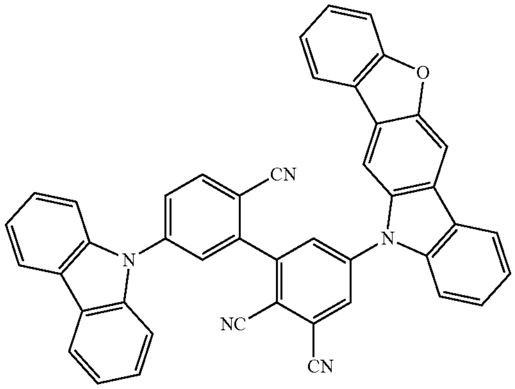
185
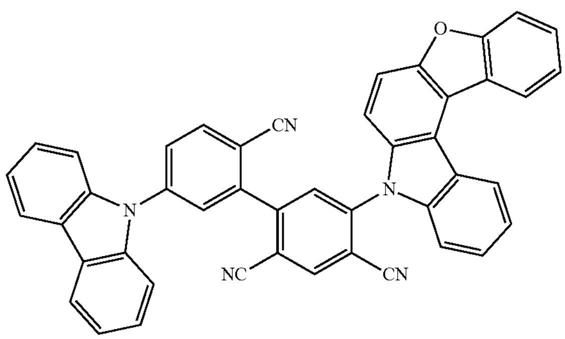
186
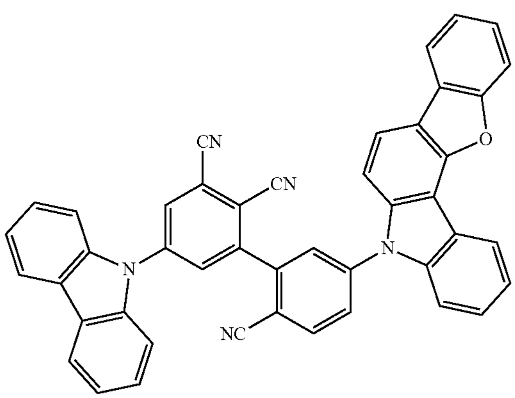
187
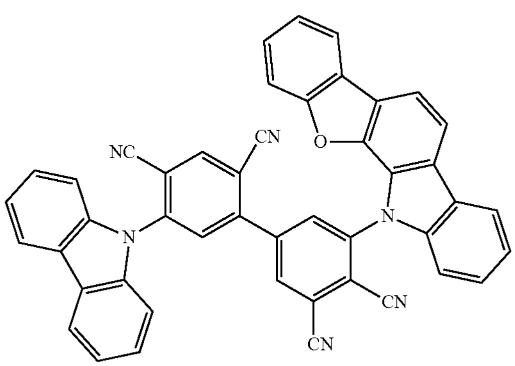
-continued
188
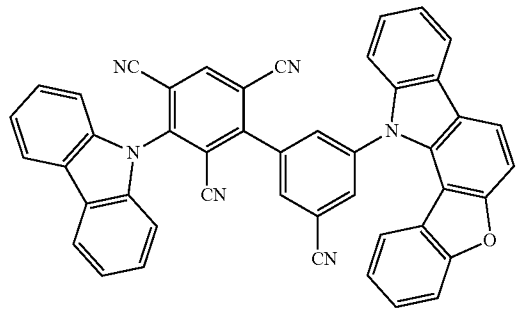
189
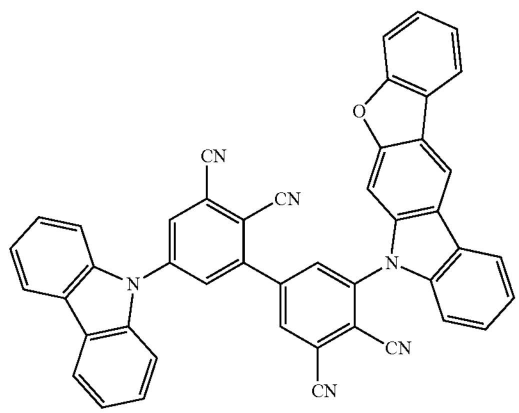
190
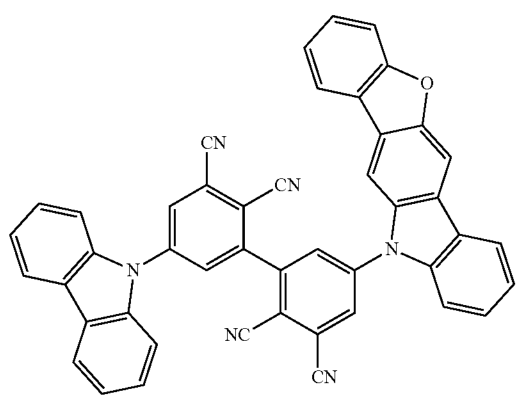
191
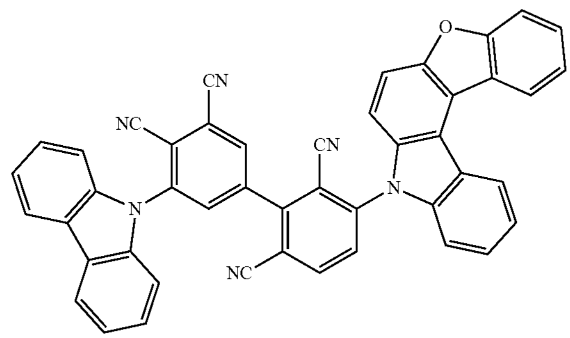

192
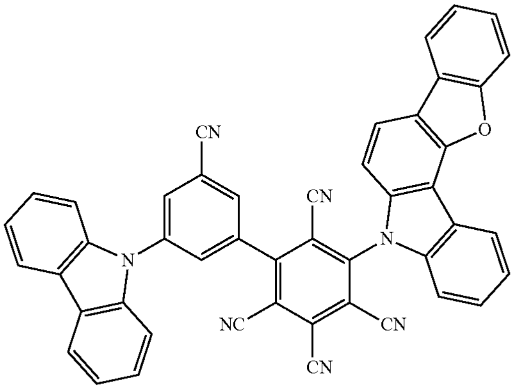
193
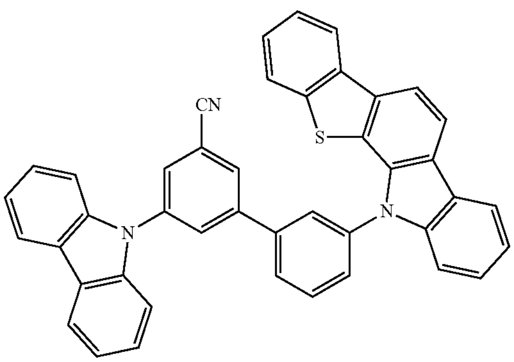
194
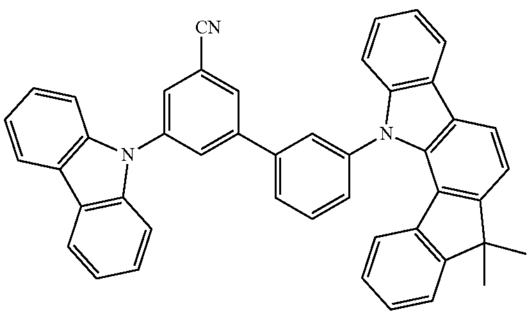
195
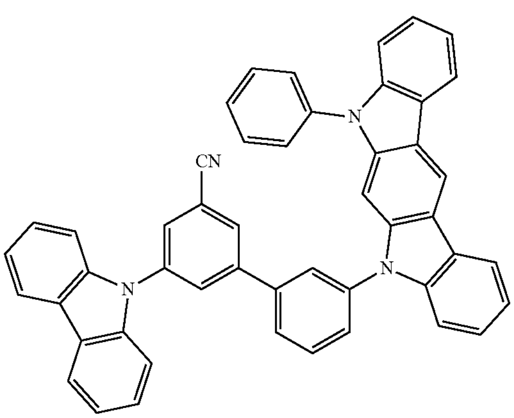
196
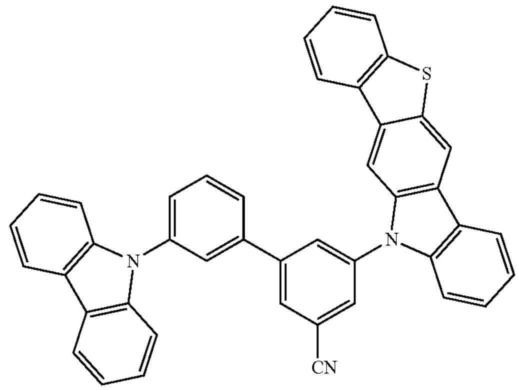
197
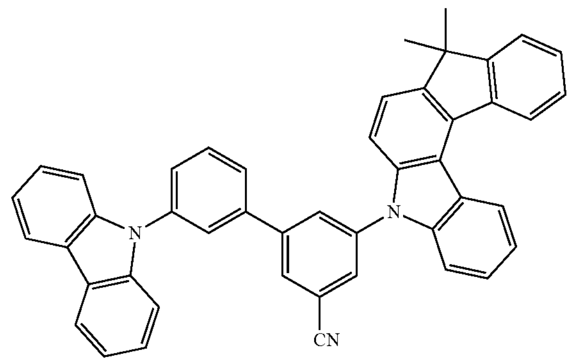
198
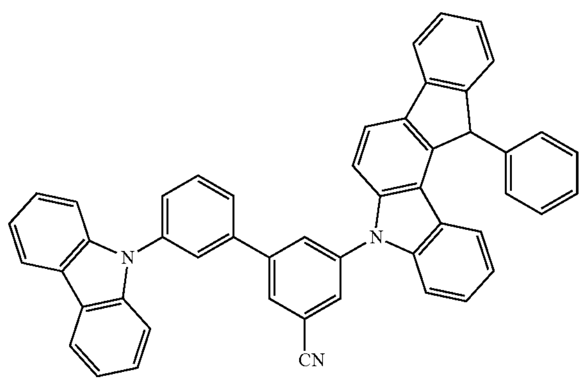
199
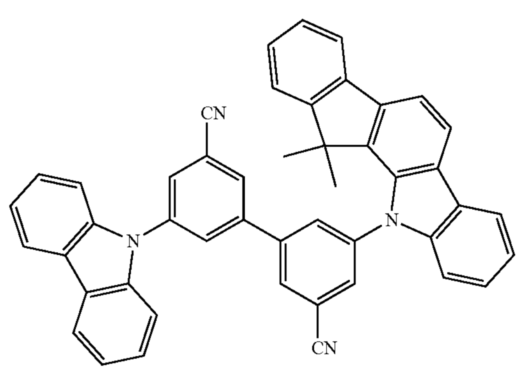

-continued
200
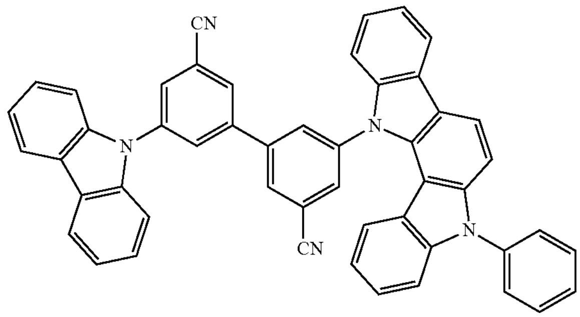
201
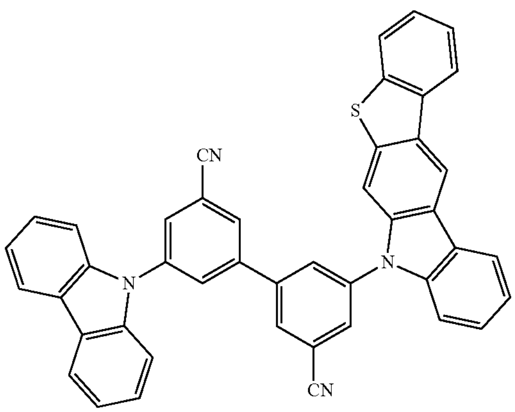
202
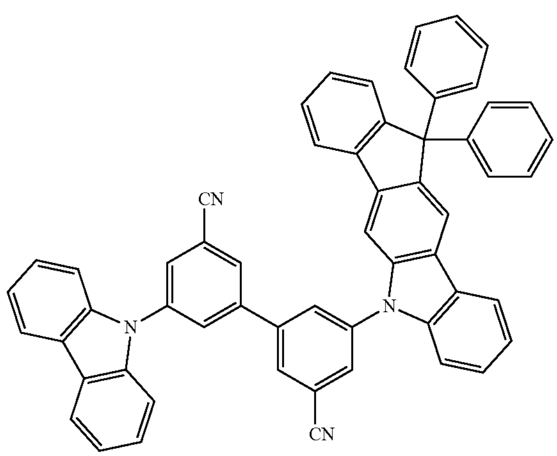
-continued
203
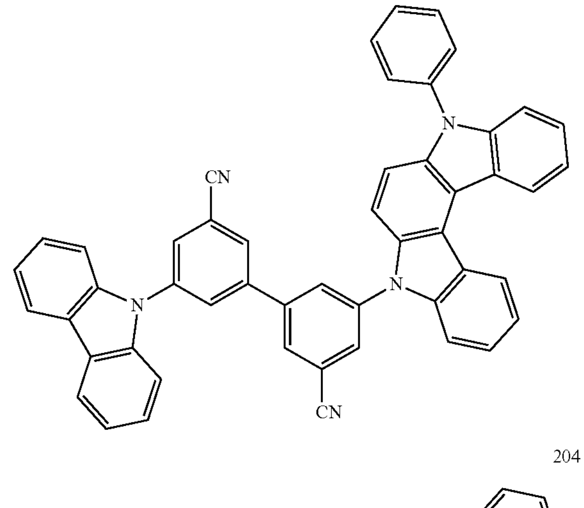
204
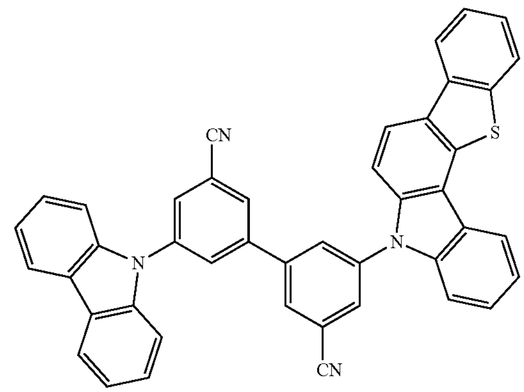
205
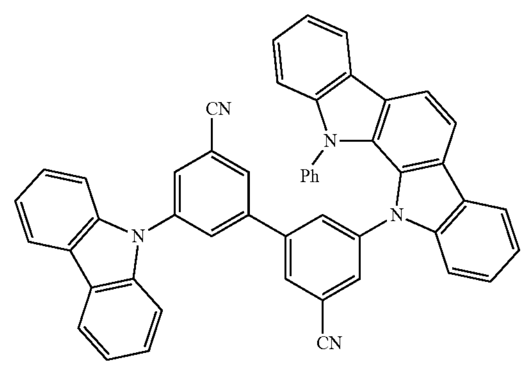
206
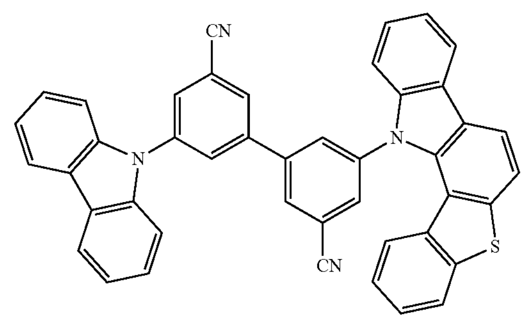

-continued
207
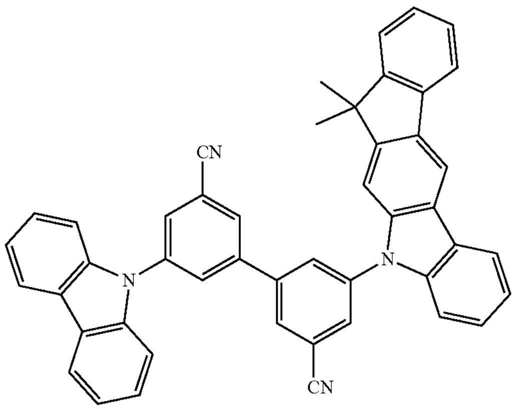
208
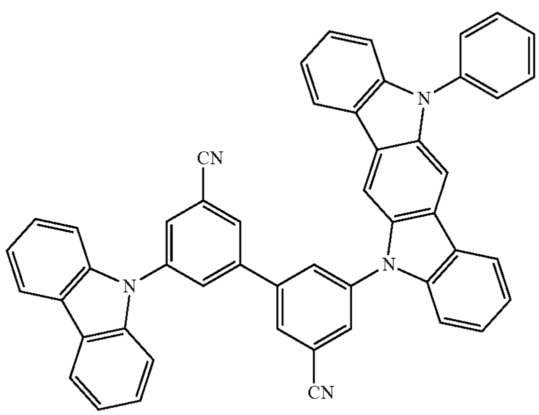
209
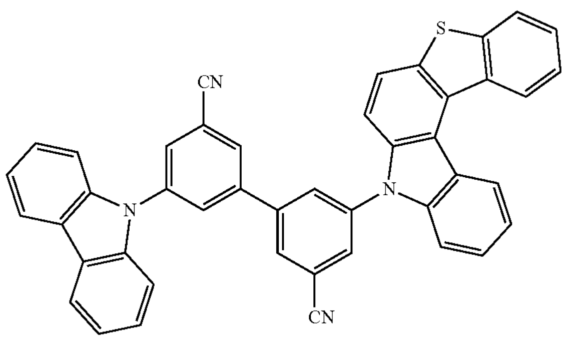
210
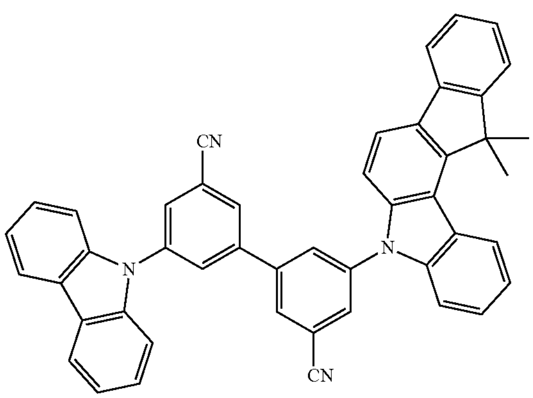
-continued
211
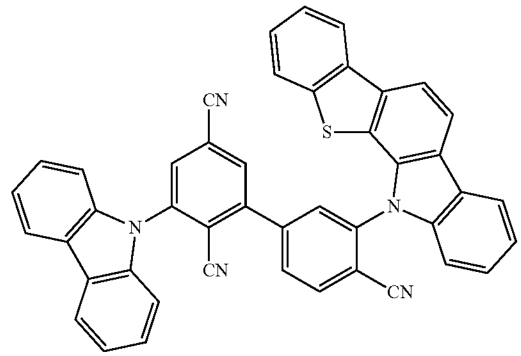
212
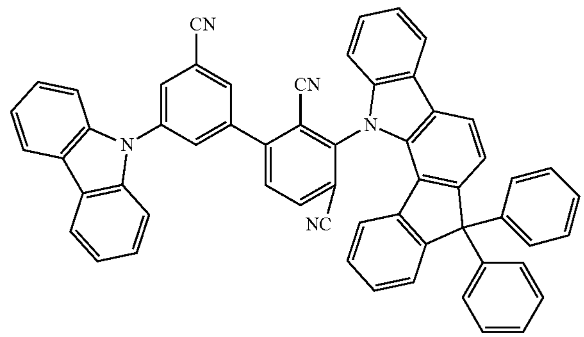
213
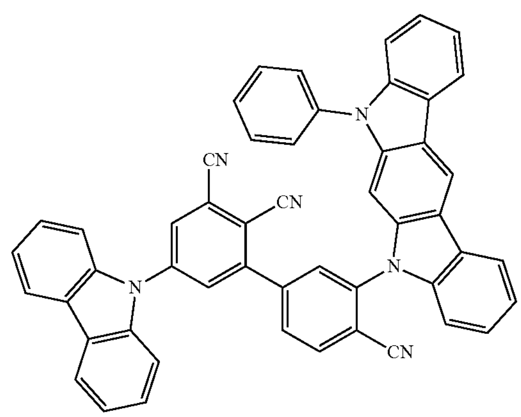
214
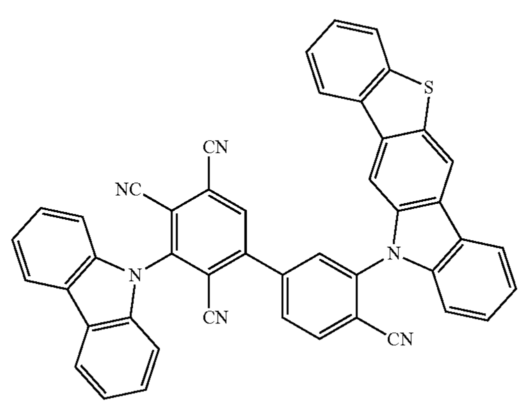

-continued
215
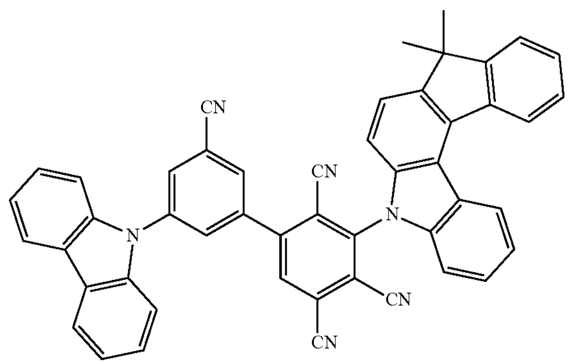
216
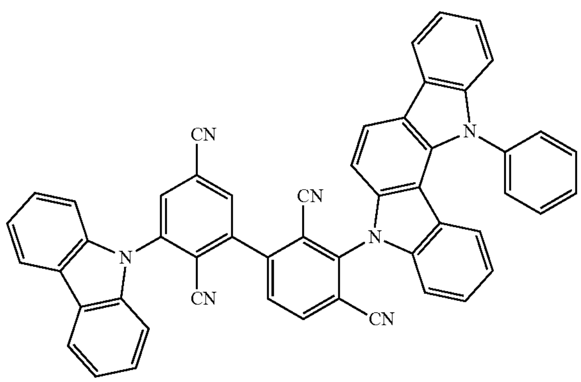
217
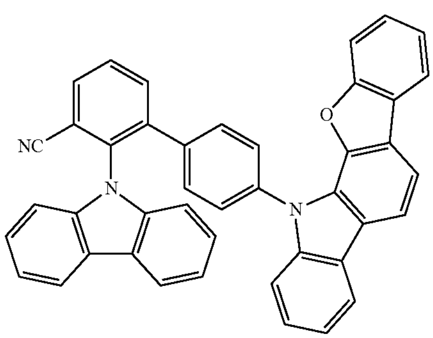
218
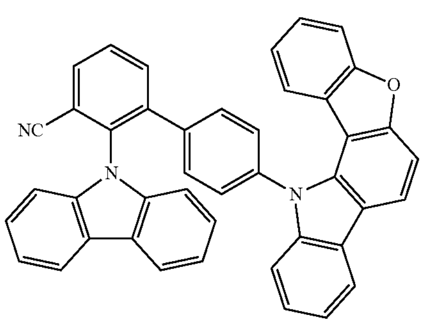
-continued
219
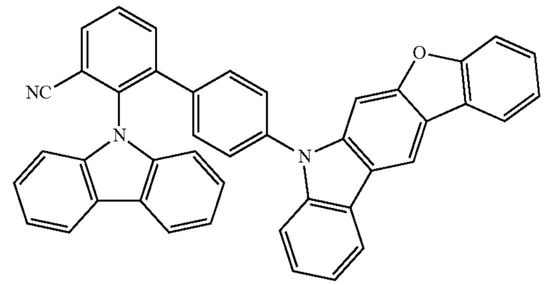
220
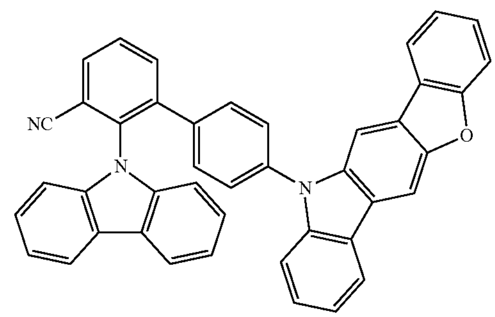
221
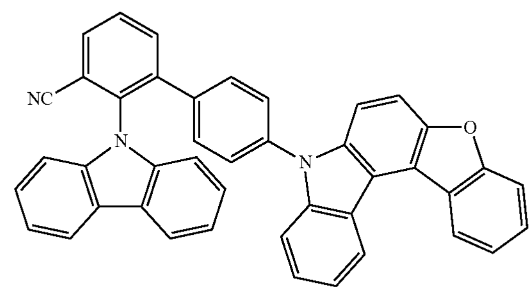
222
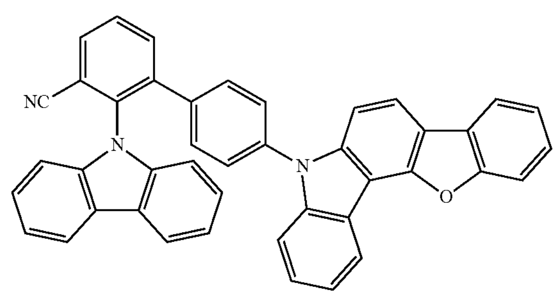
223
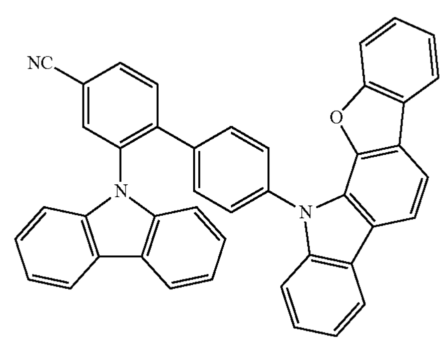

224
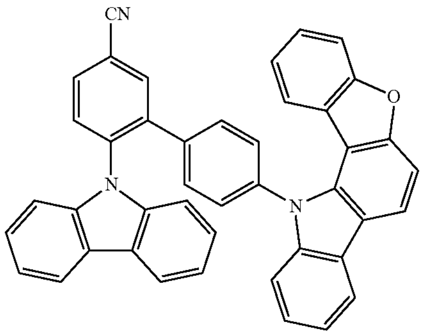
225
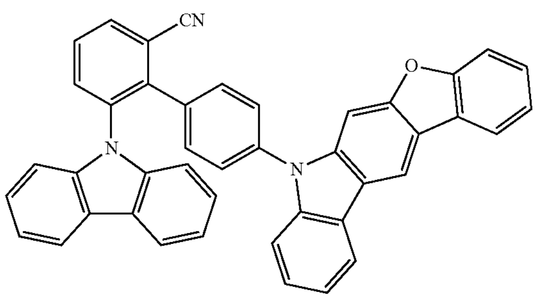
226
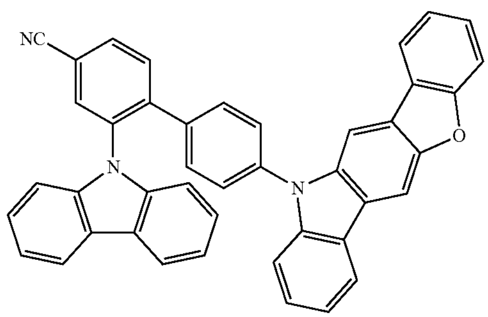
227
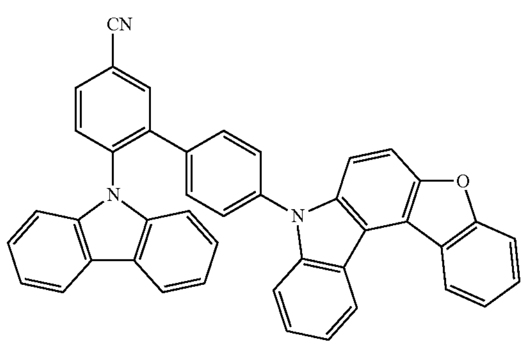
228
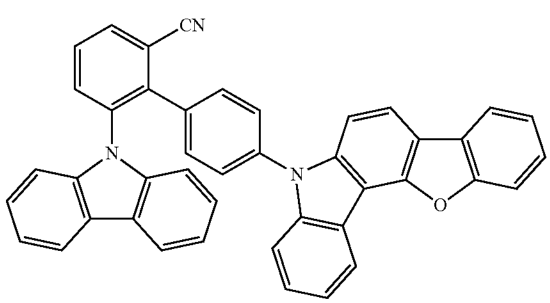
229
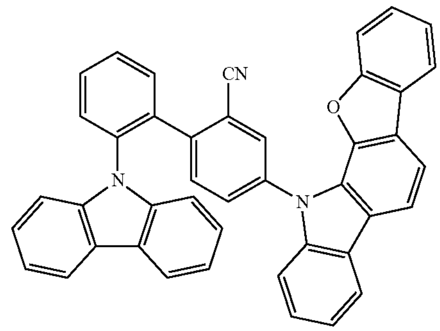
230
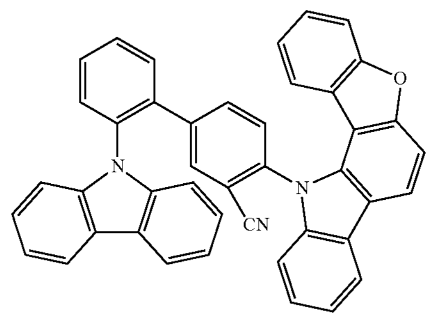
231
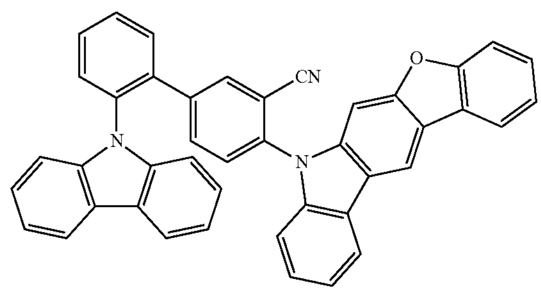
232
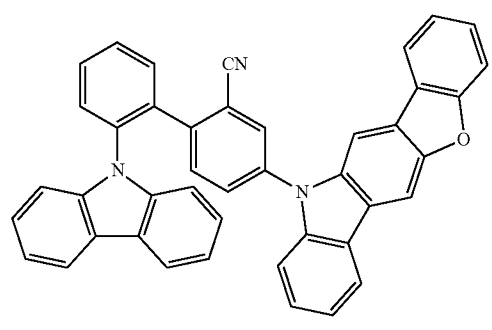
233
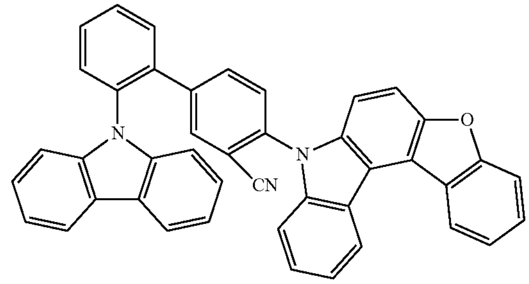

-continued
234
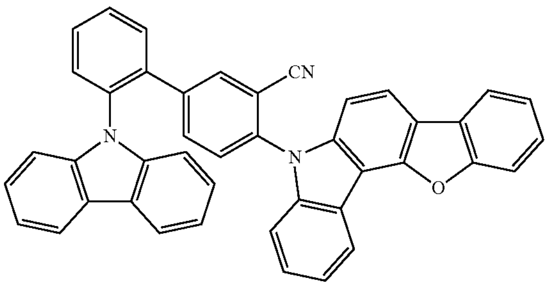
235
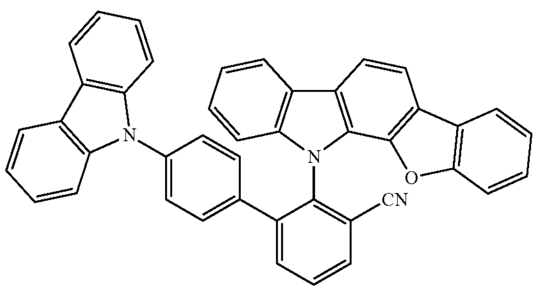
236
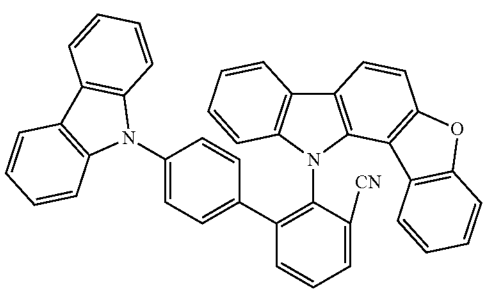
237
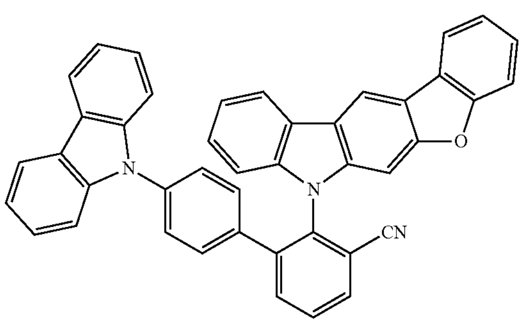
238
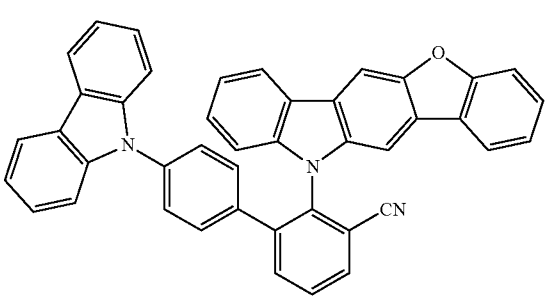
-continued
239
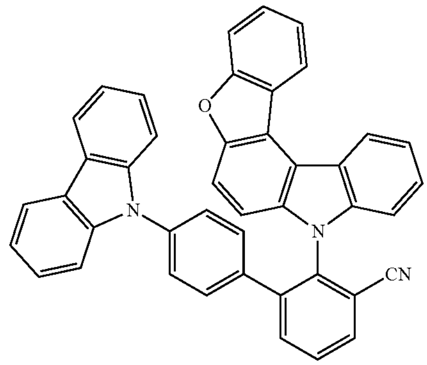
240
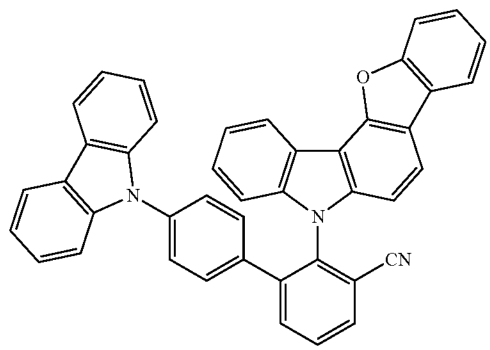
241
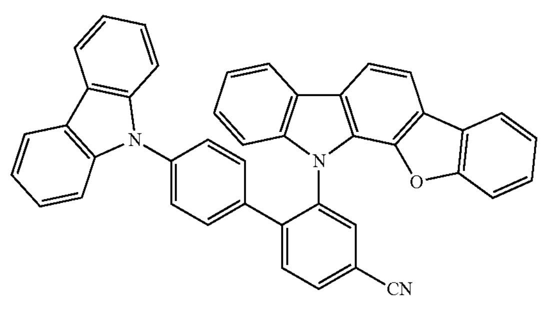
242
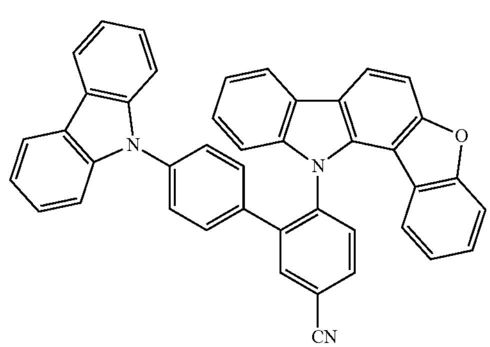

-continued
243
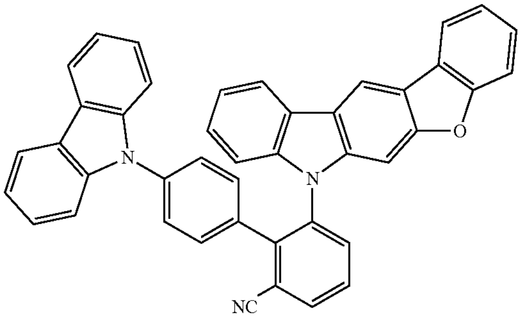
244
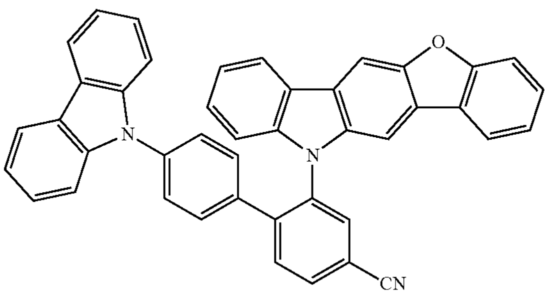
245
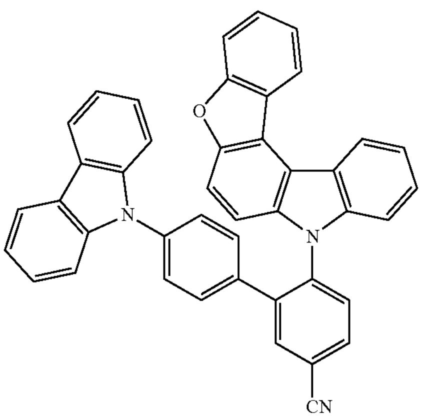
246
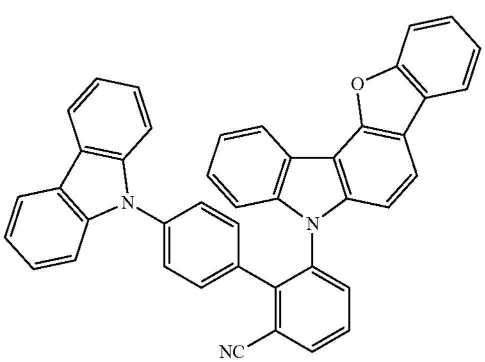
-continued
247
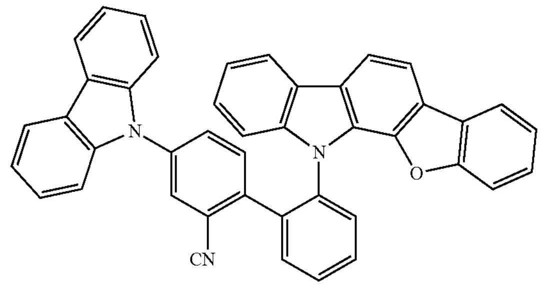
248
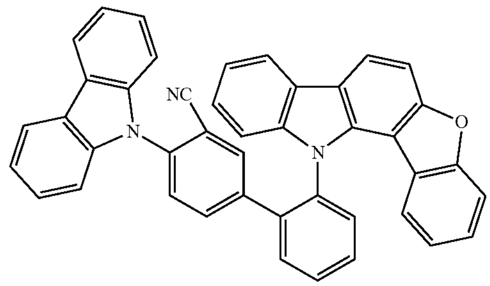
249
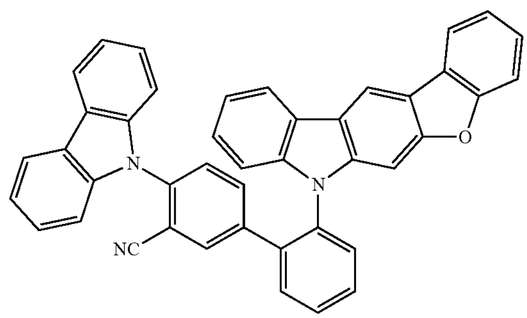
250
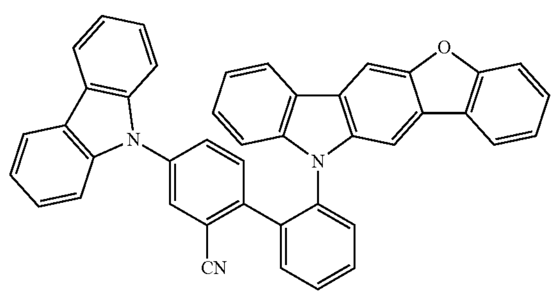
251
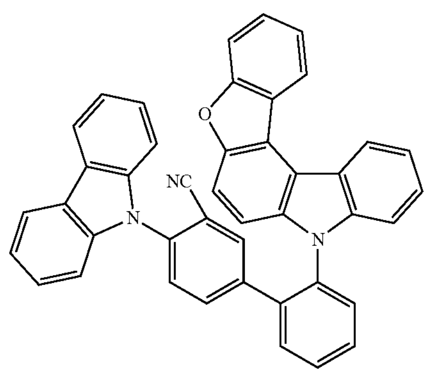

-continued
252
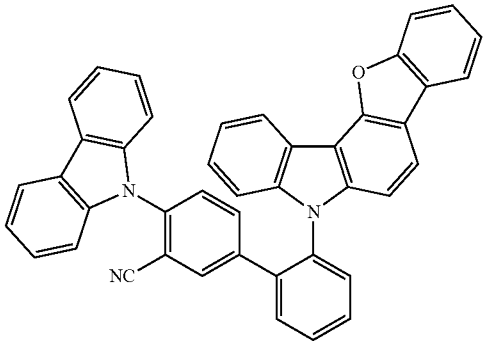
253
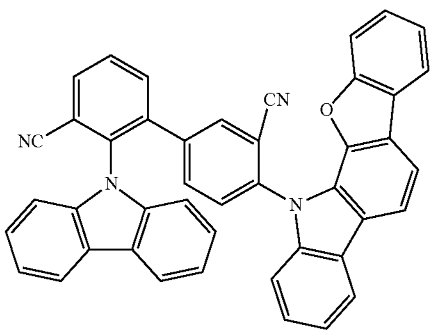
254
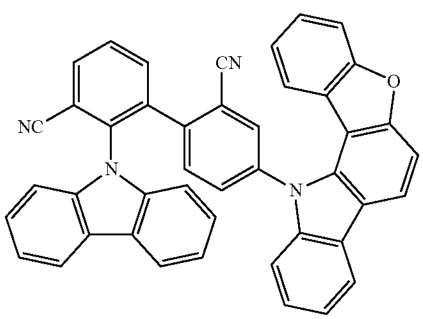
255
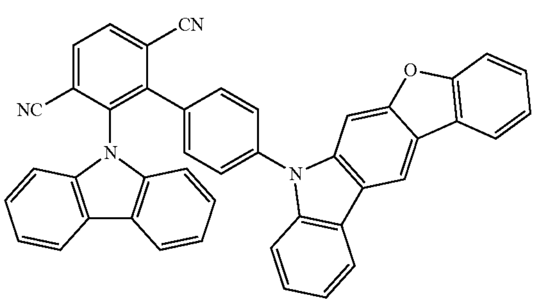
256
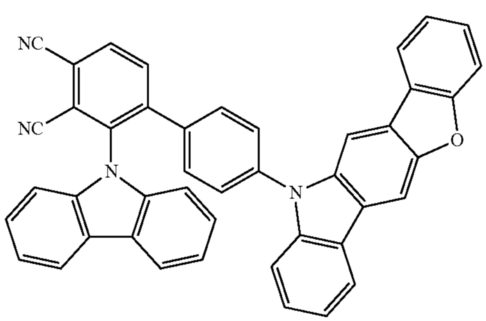
-continued
257
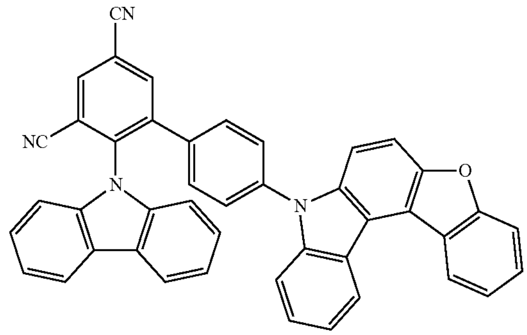
258
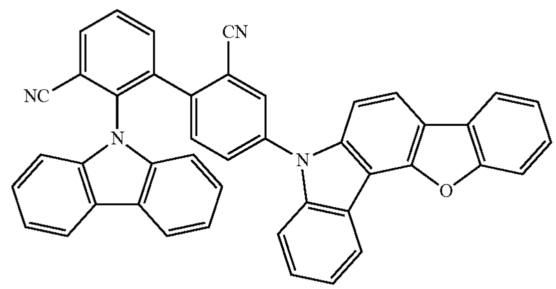
259
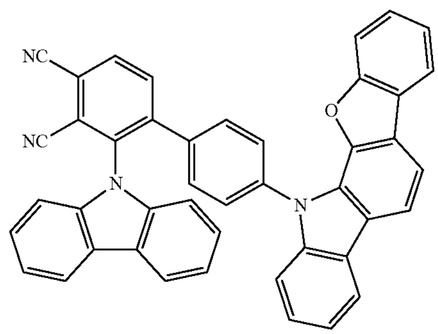
260
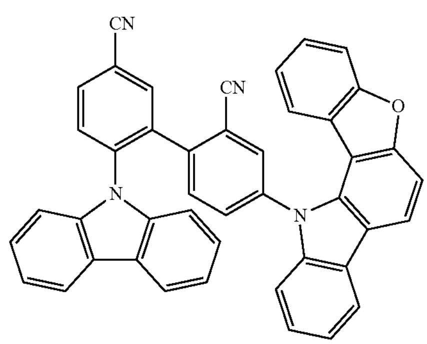
261
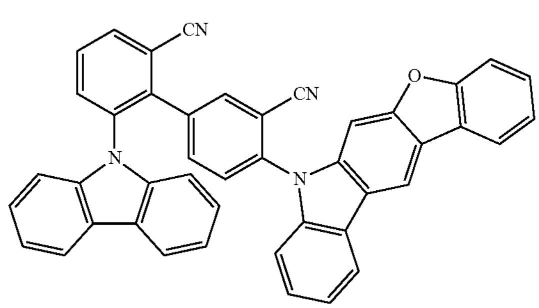

-continued
262
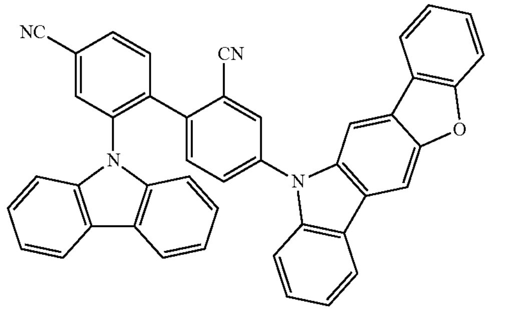
263
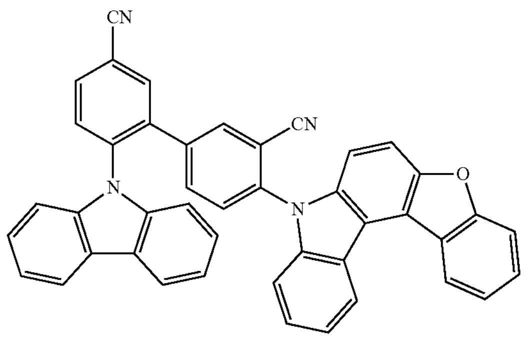
264
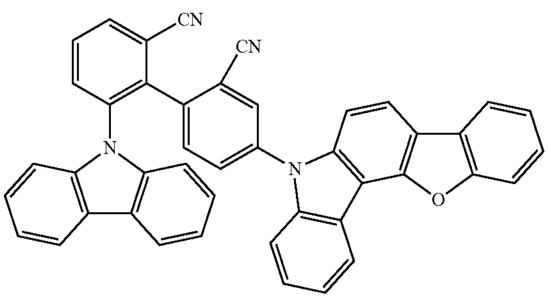
265
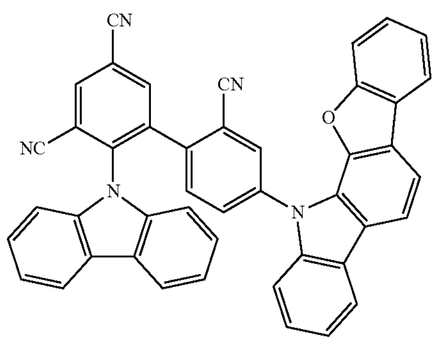
266
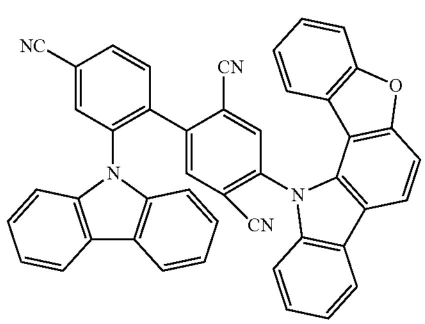
-continued
267
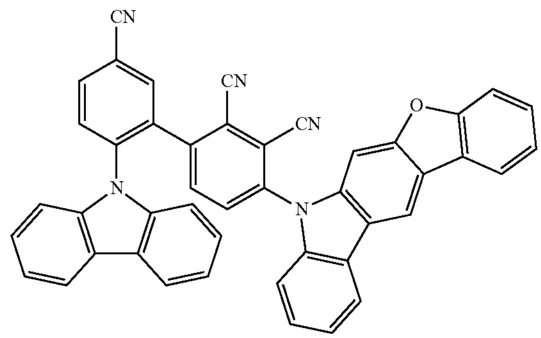
268
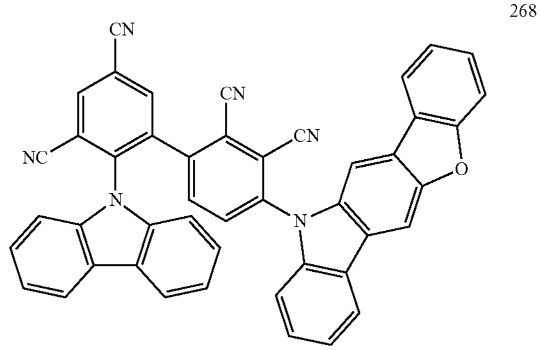
269
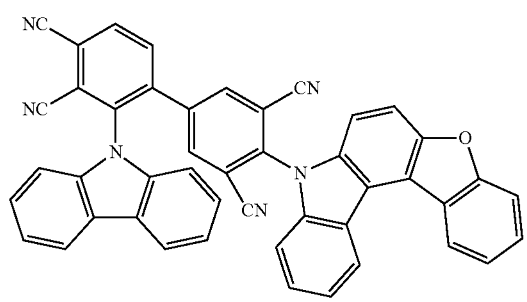
270
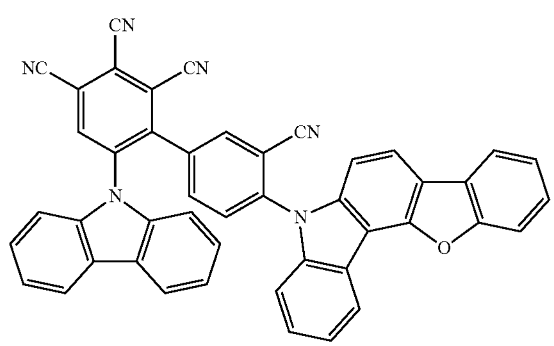

-continued
271
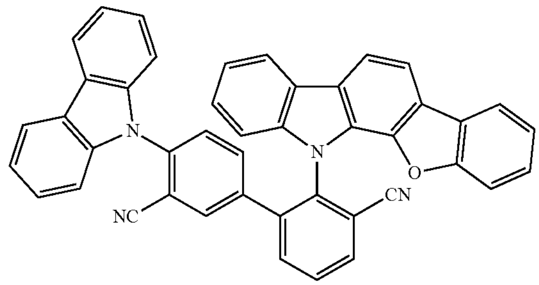
272
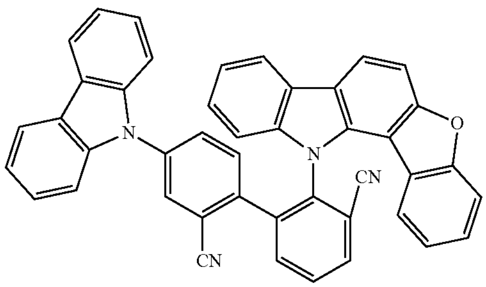
273
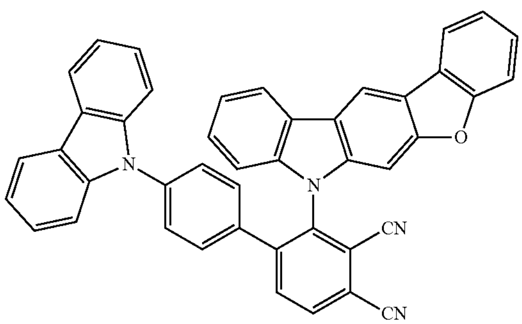
274
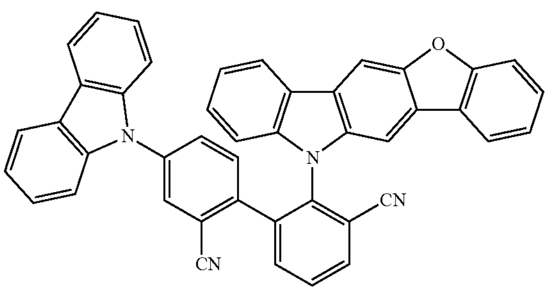
275
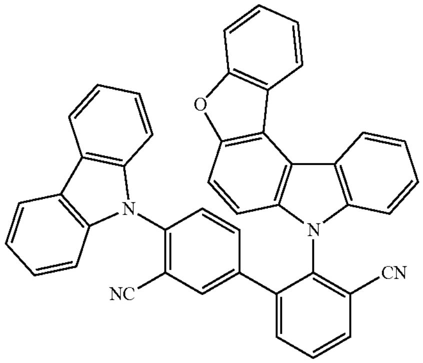
-continued
276
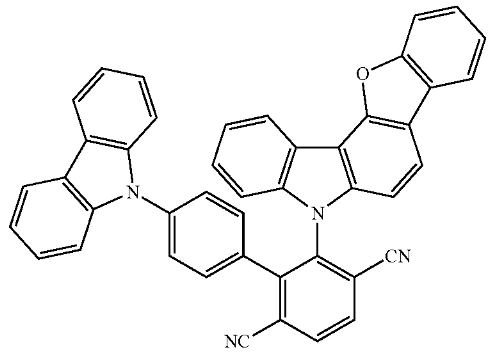
277
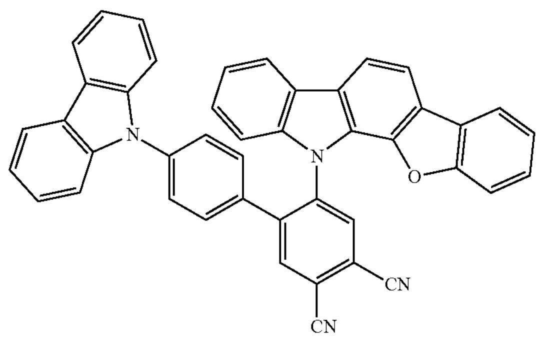
278
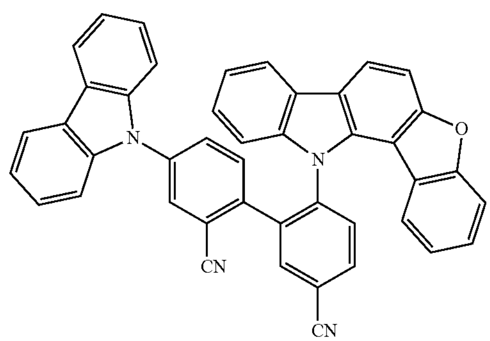
279
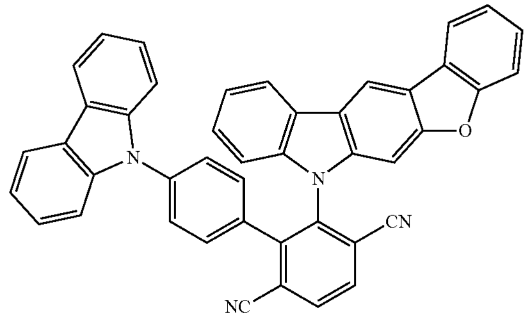

-continued
280
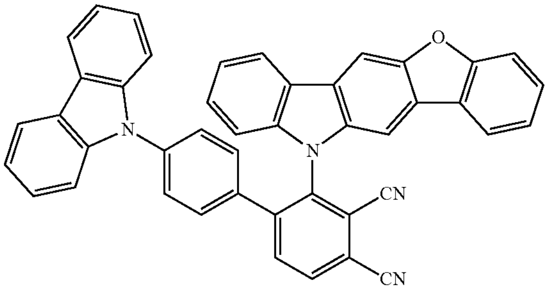
281
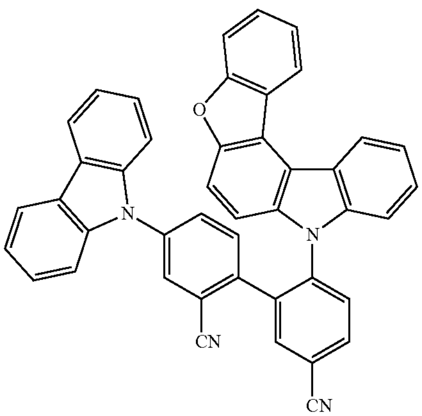
282
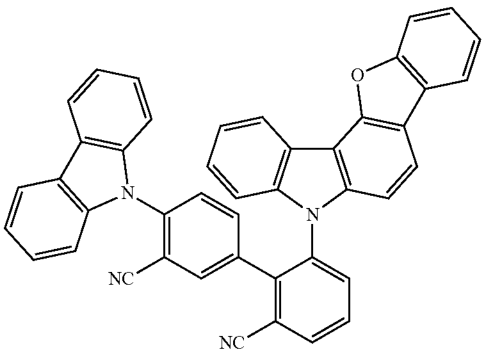
283
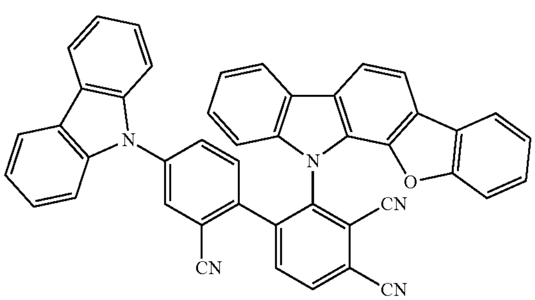
-continued
284
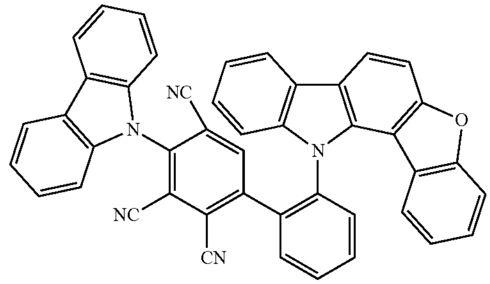
285
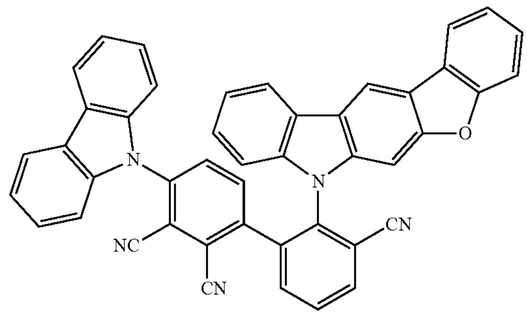
286
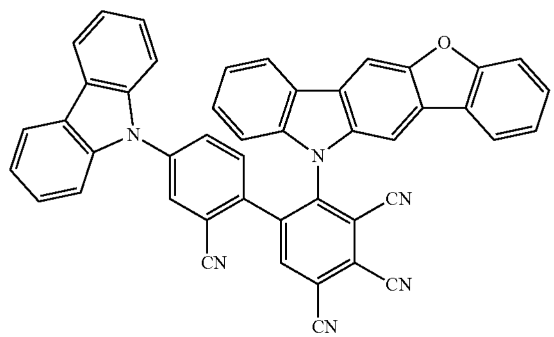
287
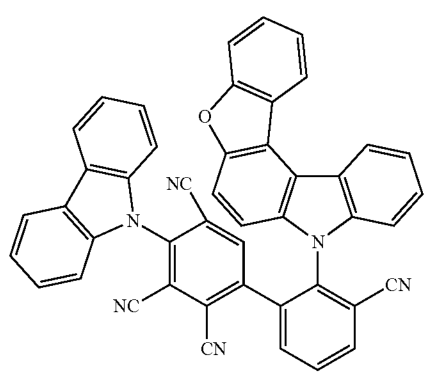

288
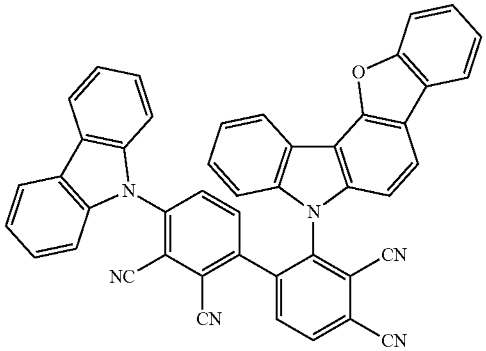
289
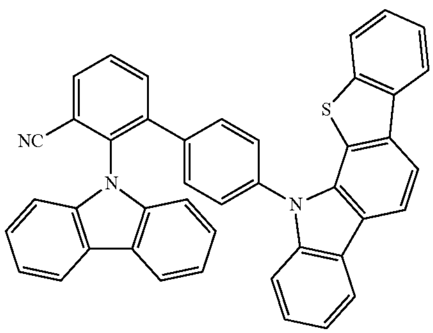
290
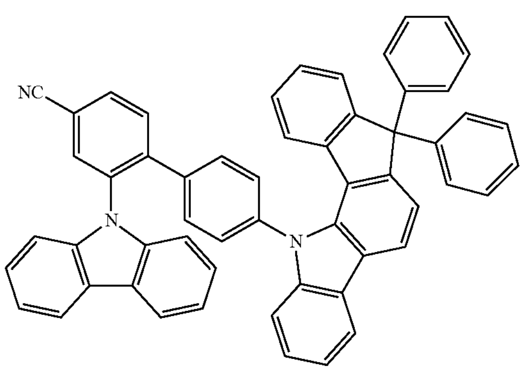
291
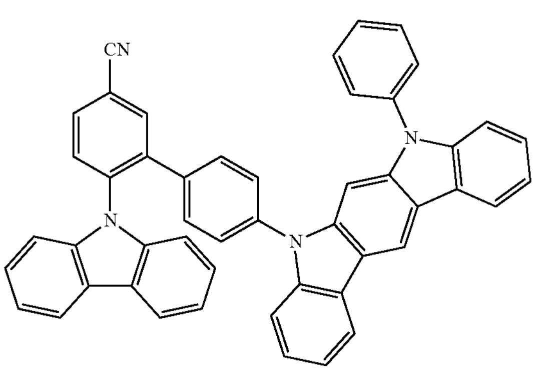
292
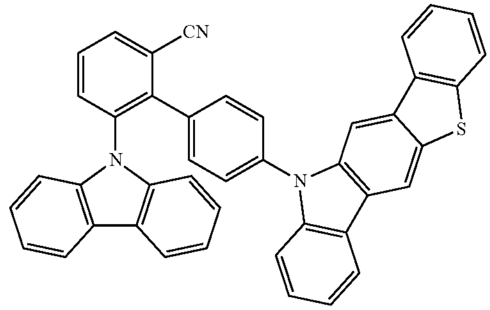
293
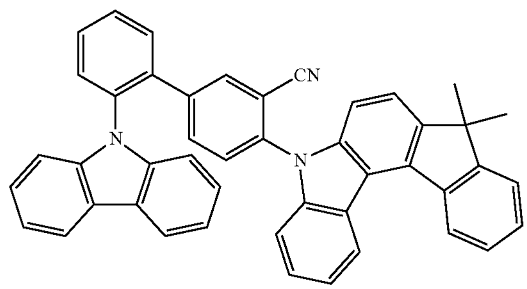
294
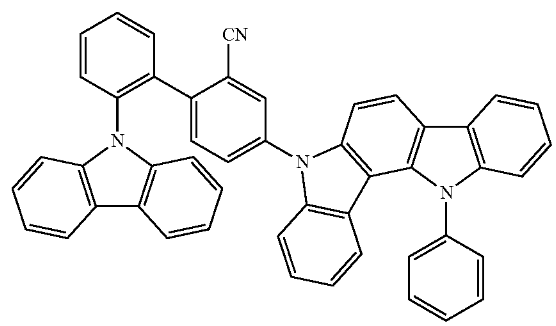
295
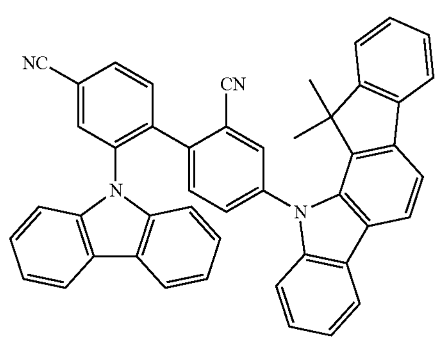

296
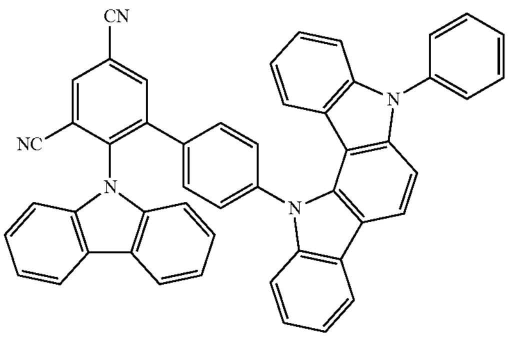
297
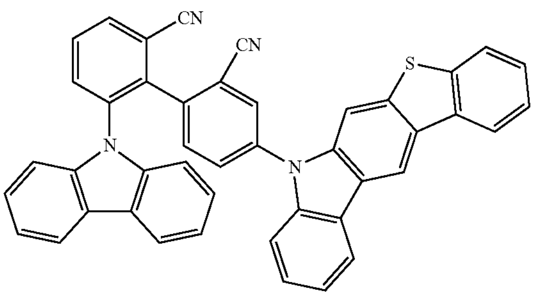
298
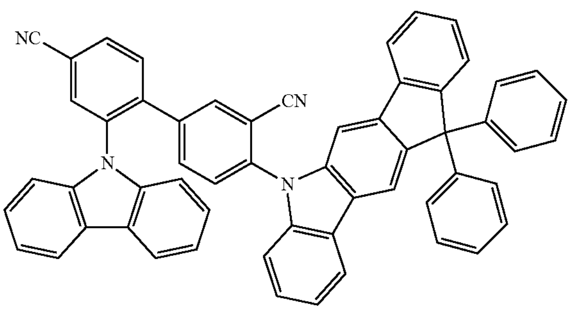
299
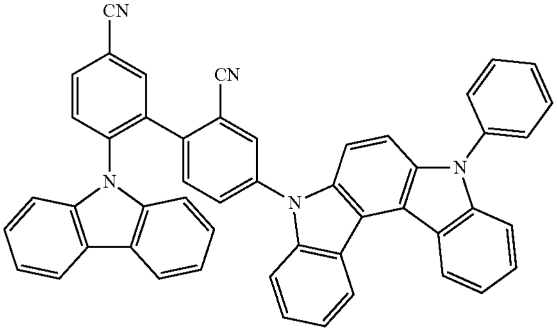
300
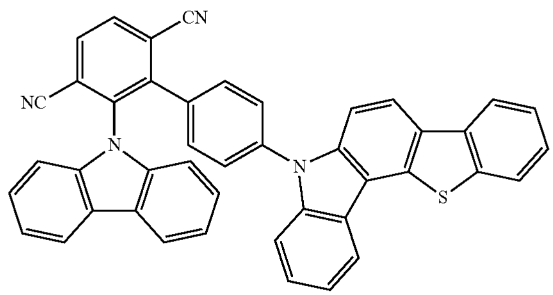
301
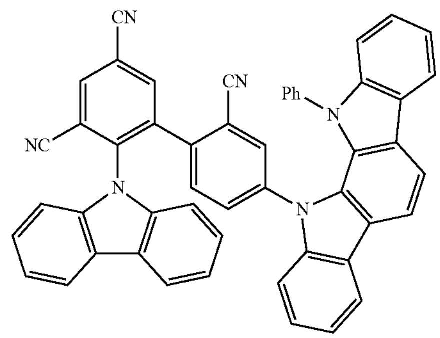
302
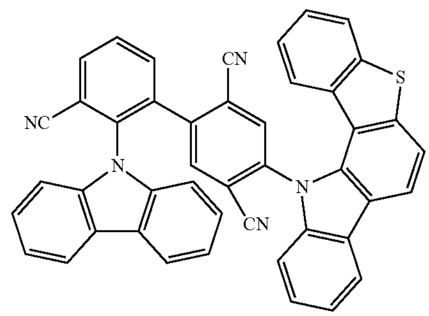
303
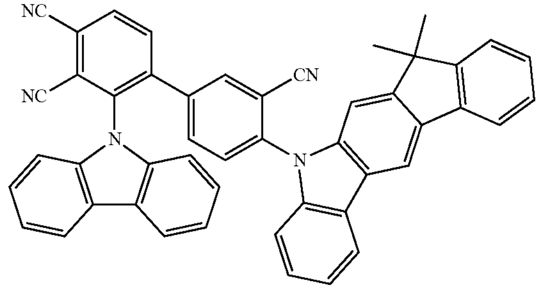
304
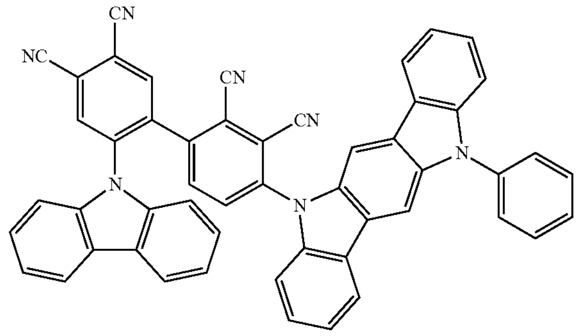

-continued
305
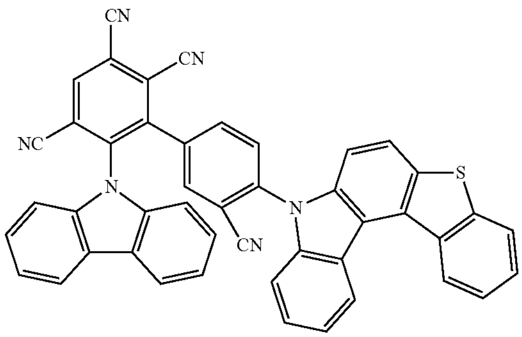
306
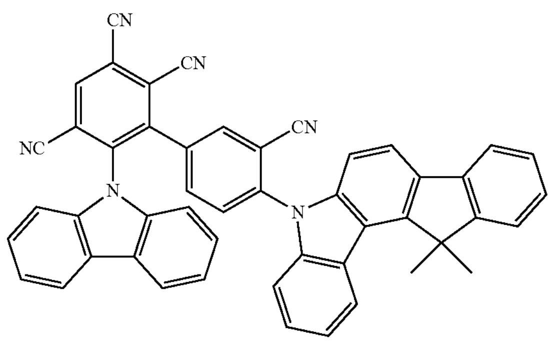
307
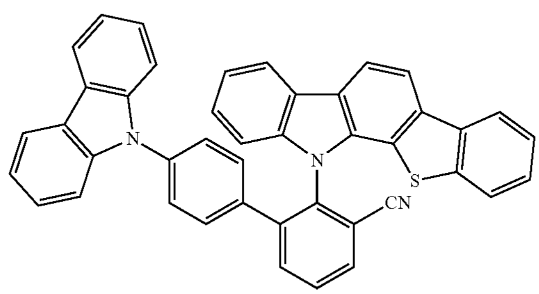
308
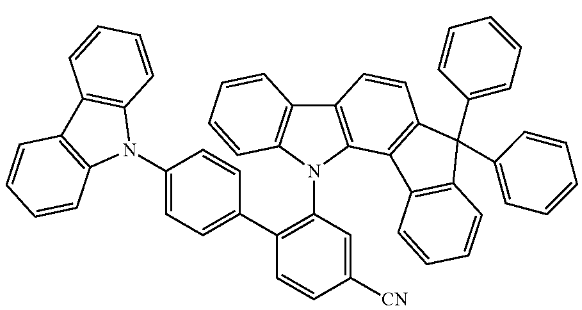
-continued
309
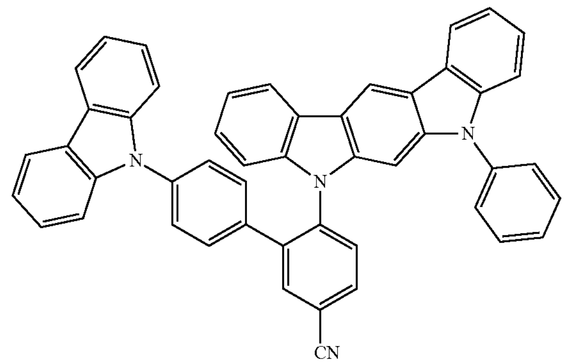
310
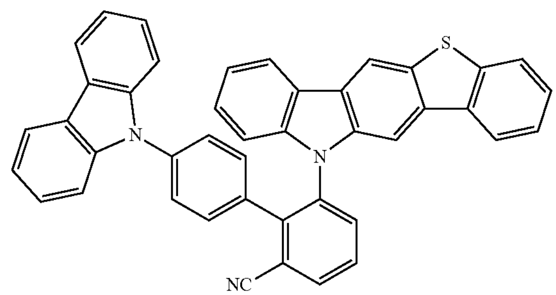
311
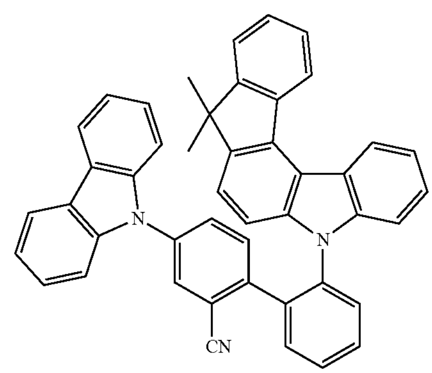
312
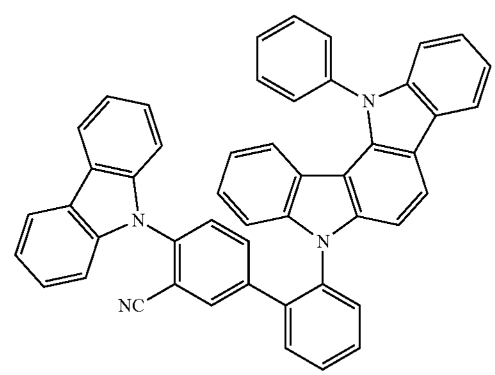

-continued
313
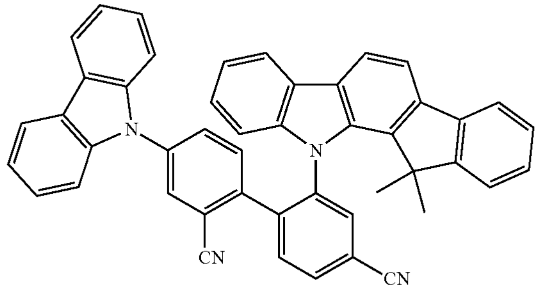
314
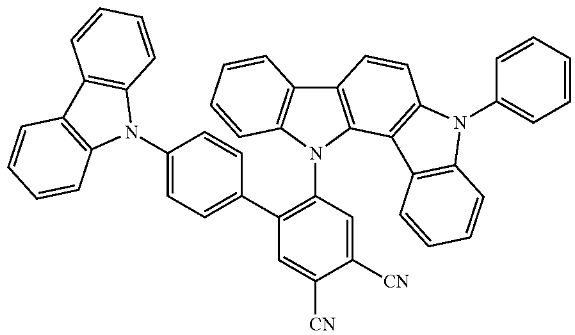
315
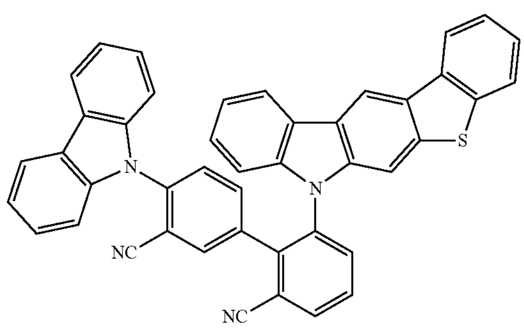
316
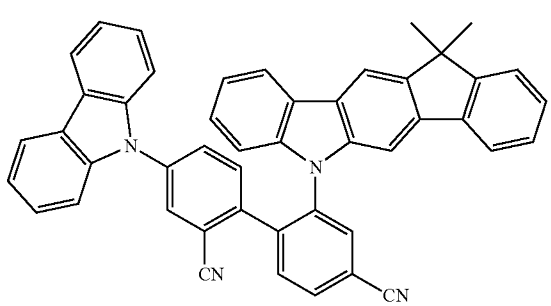
-continued
317
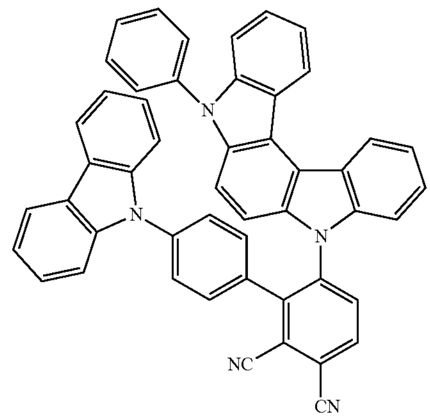
318
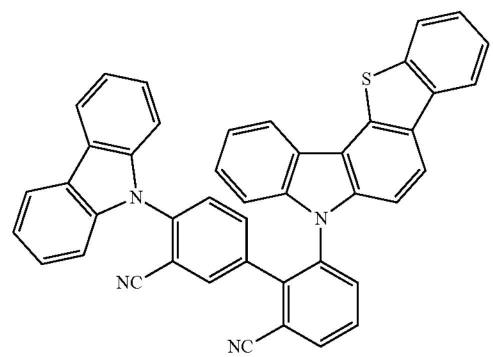
319
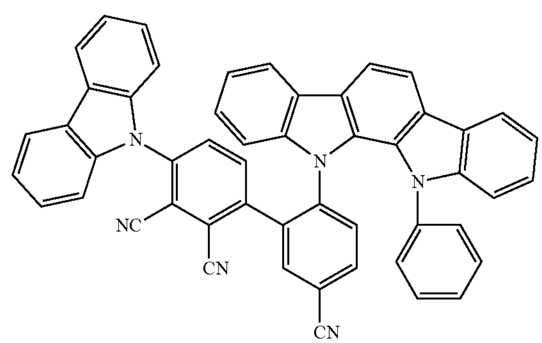
320
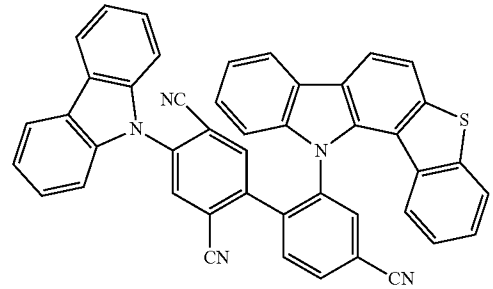

321
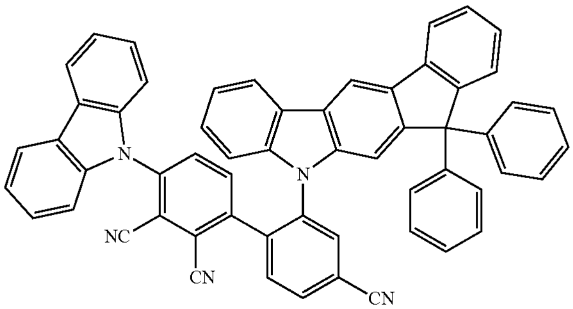
322
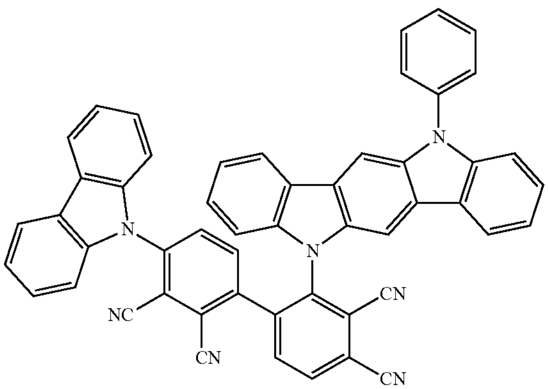
323
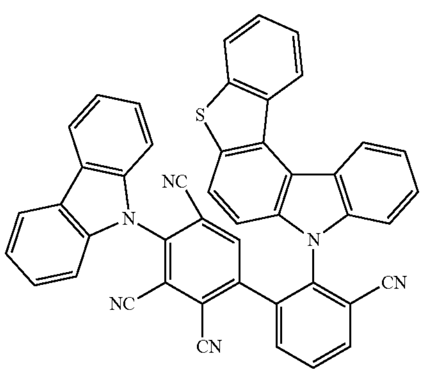
324
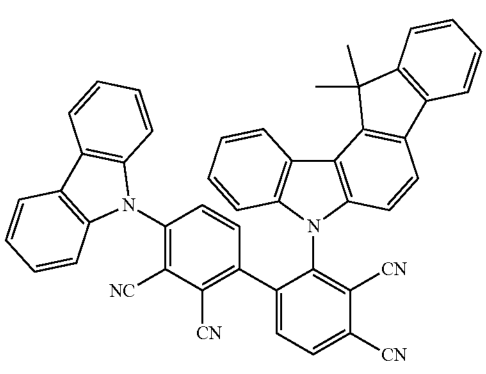
325
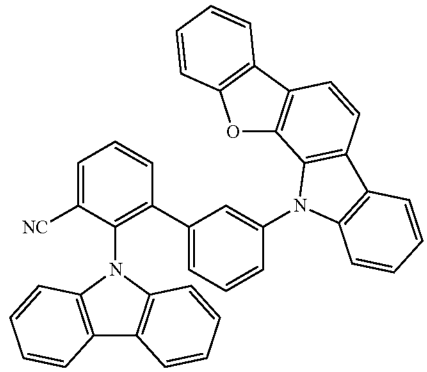
326
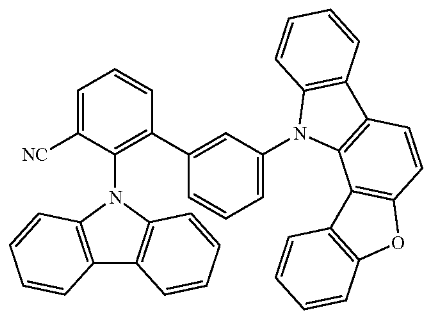
327
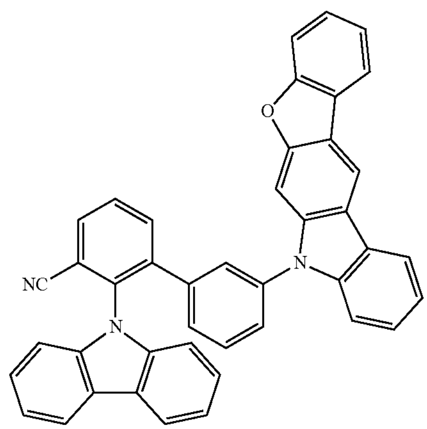
328
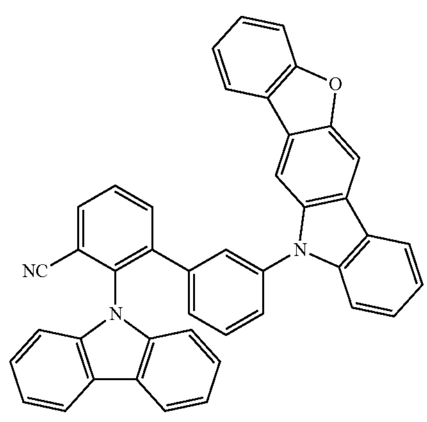

329
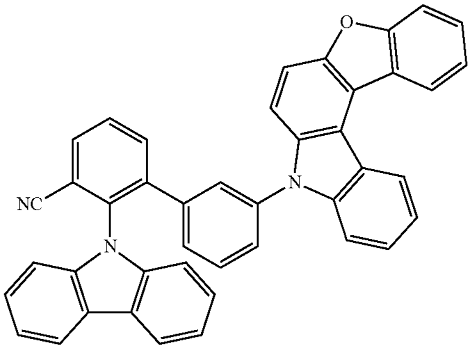
330
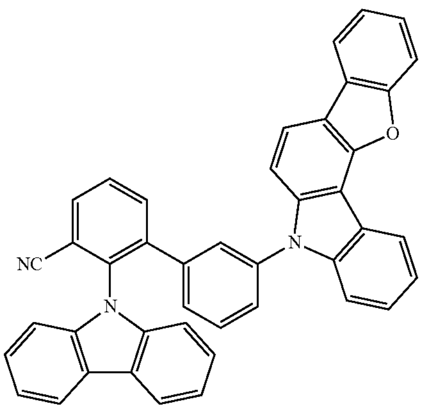
331
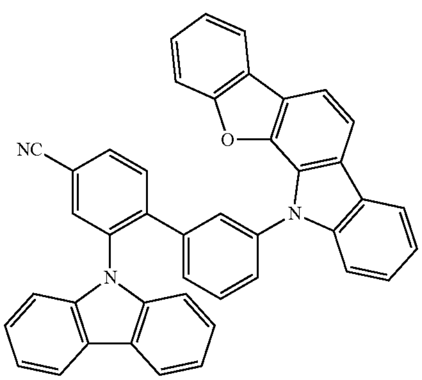
332
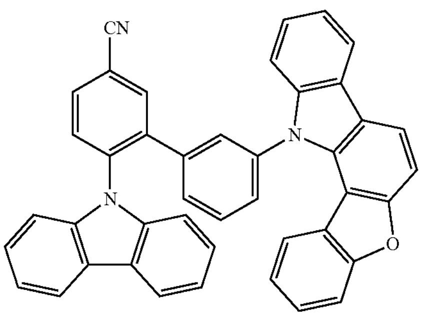
333
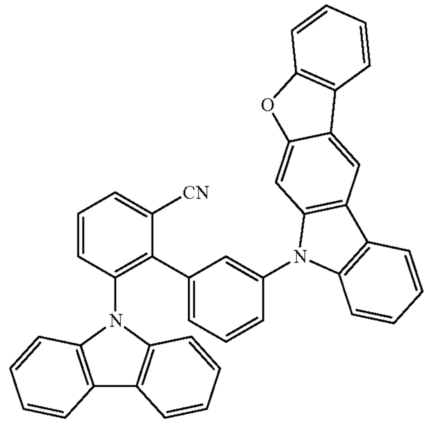
334
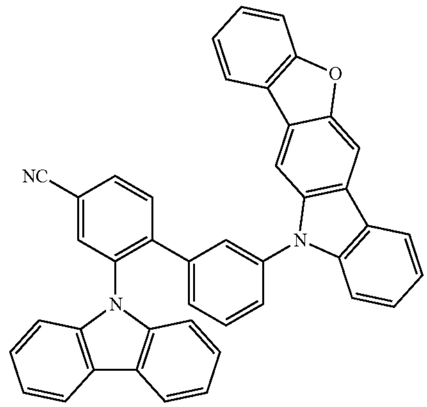
335
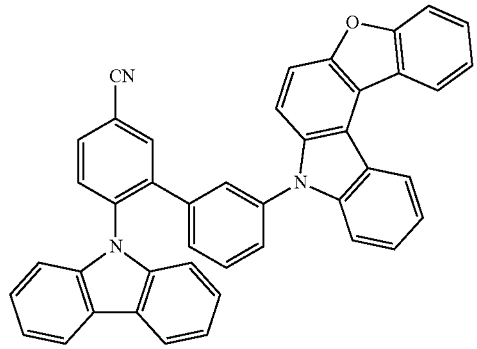
336
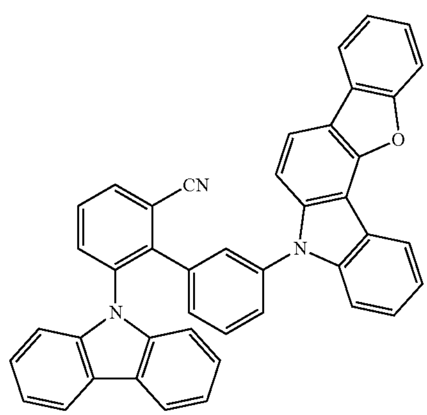

-continued
337
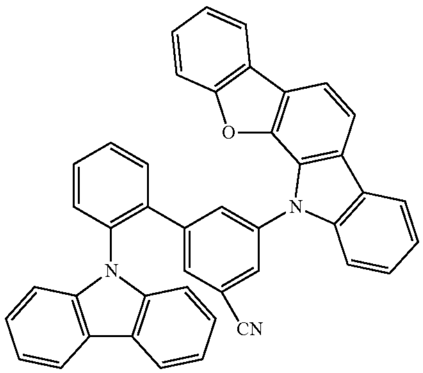
338
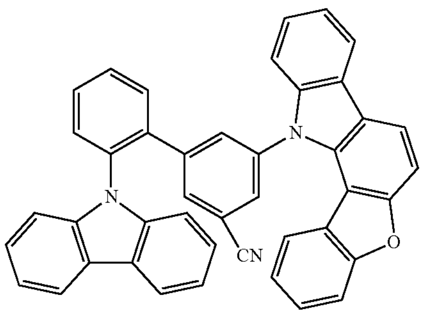
339
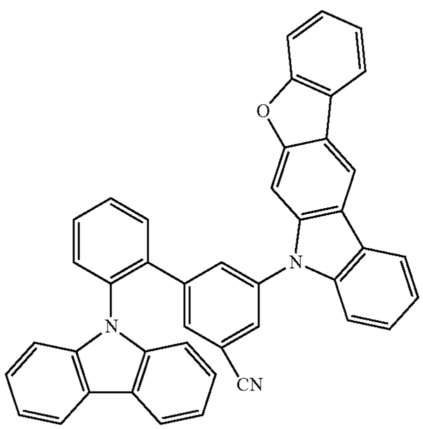
340
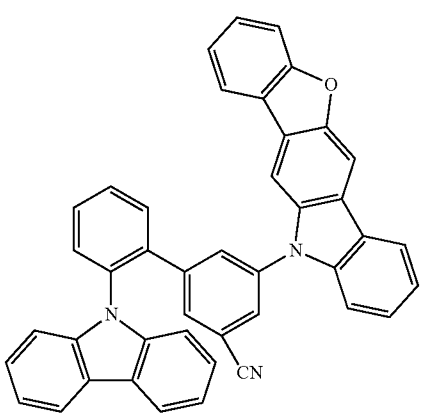
-continued
341
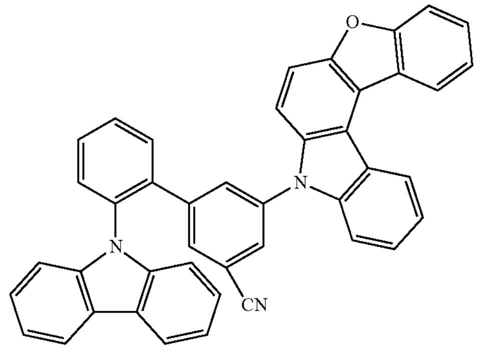
342
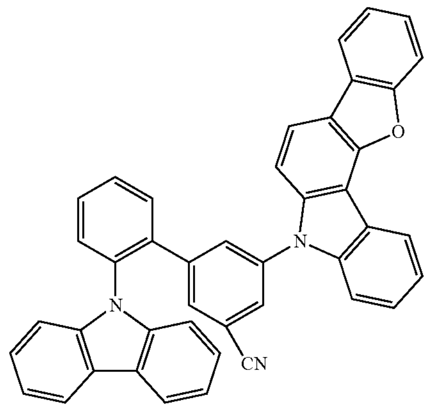
343
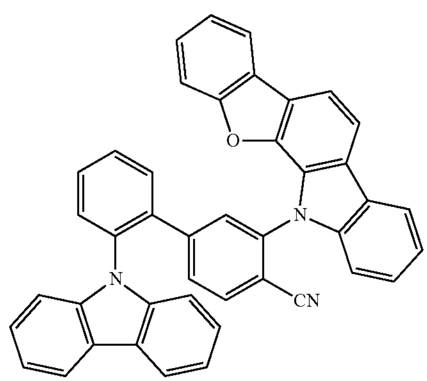
344
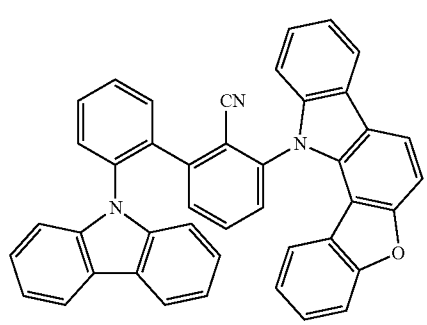

-continued
345
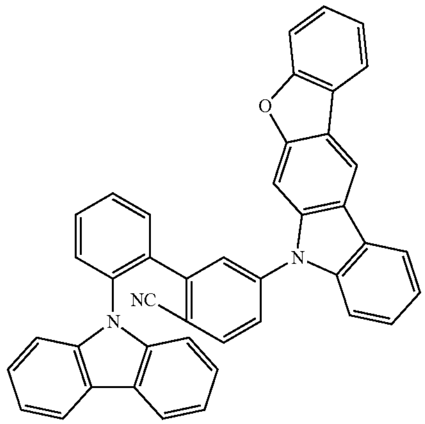
346
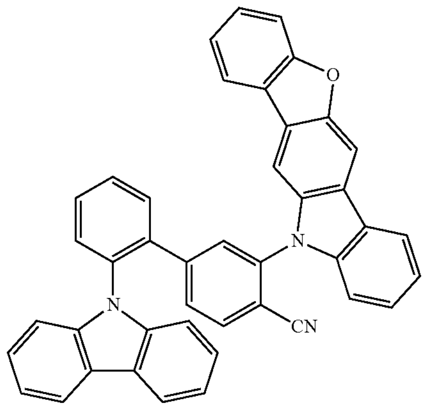
347
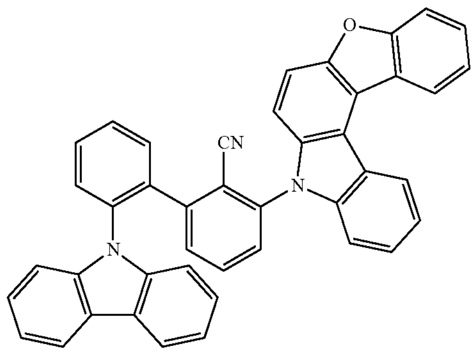
348
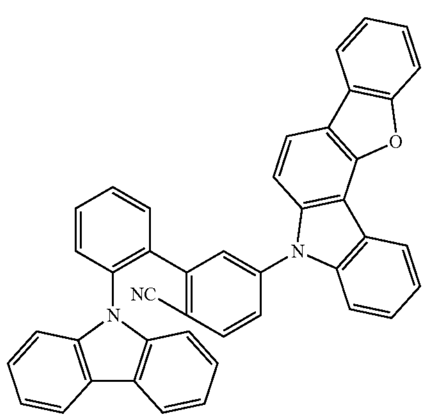
-continued
349
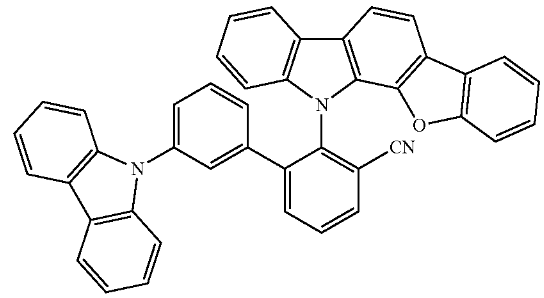
350
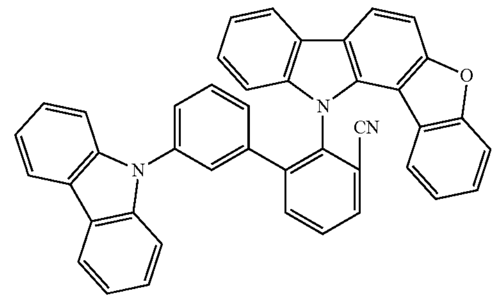
351
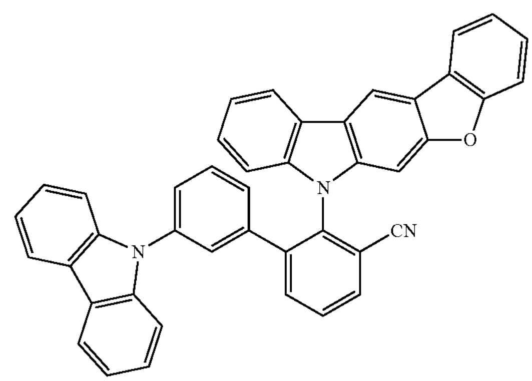
352
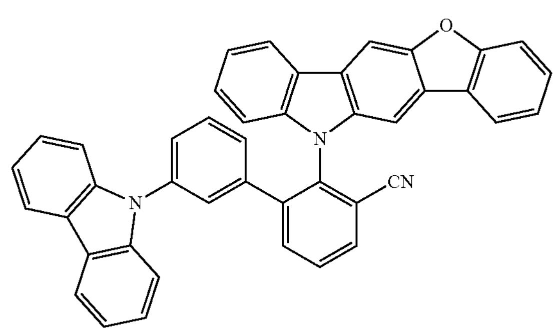

-continued
353
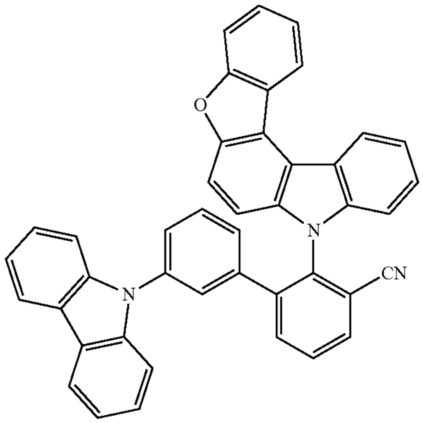
354
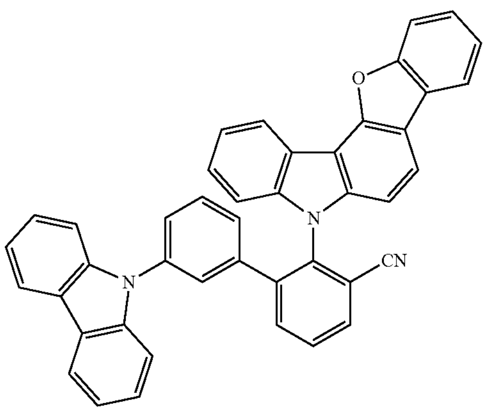
355
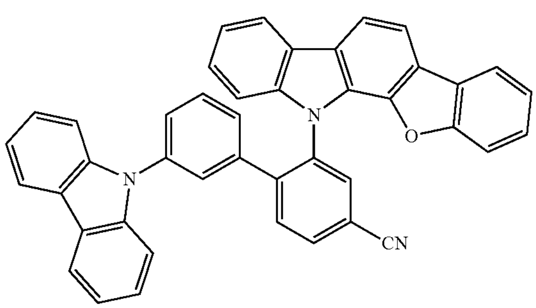
356
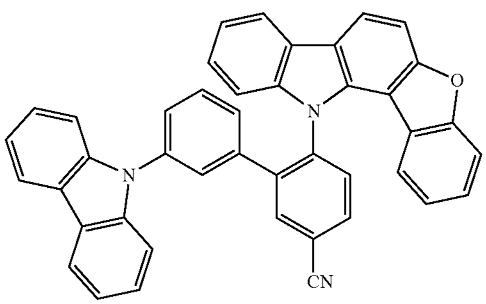
-continued
357
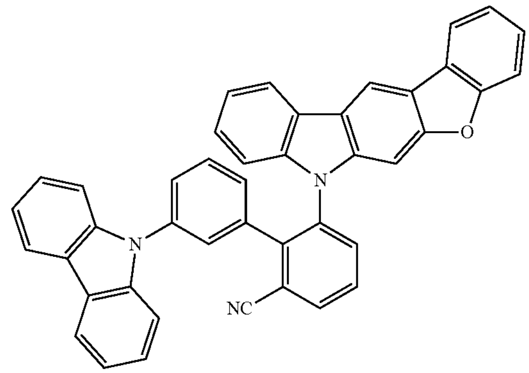
358
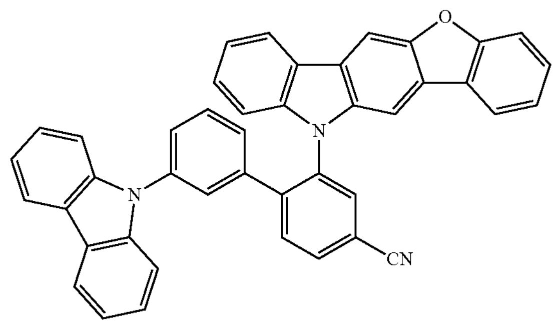
359
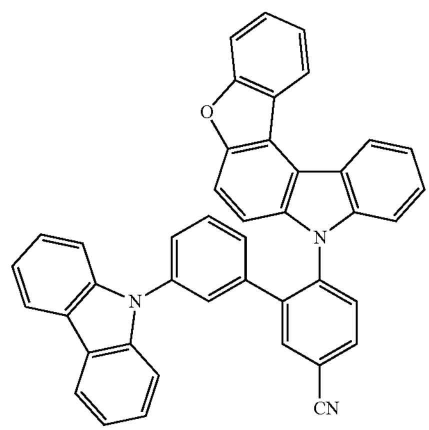
360
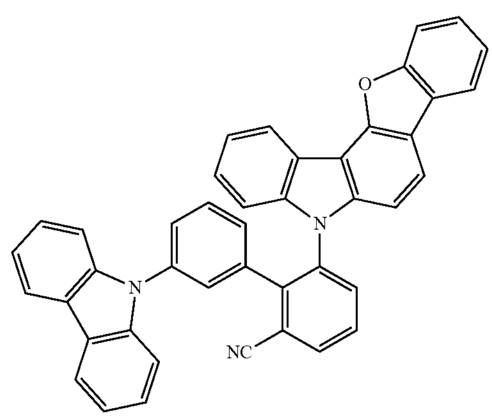

-continued
361
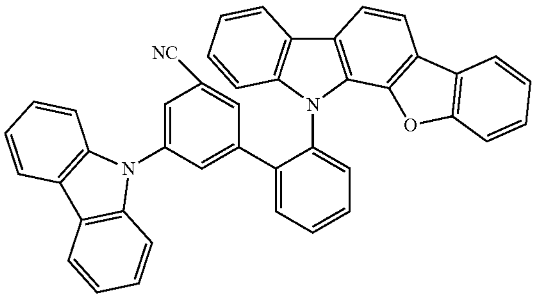
362
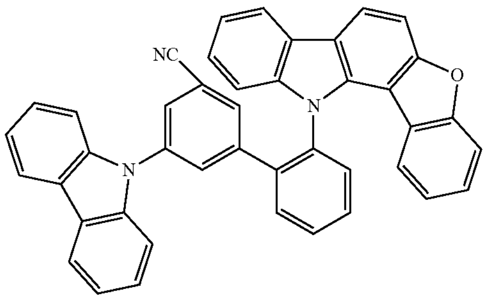
363
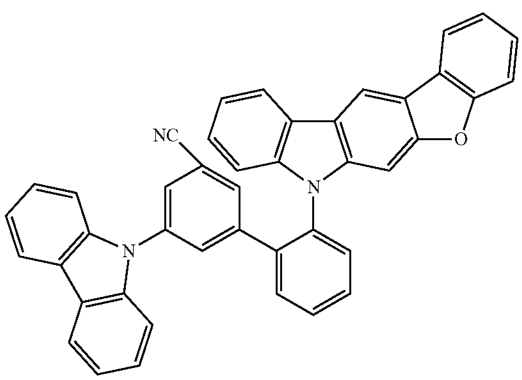
364
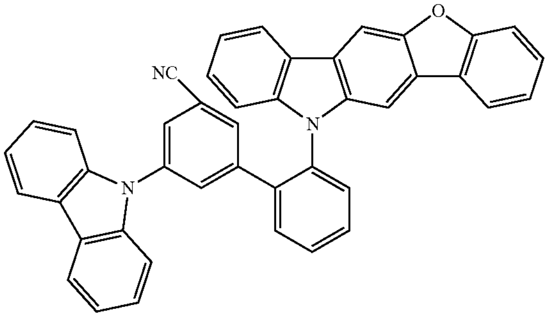
-continued
365
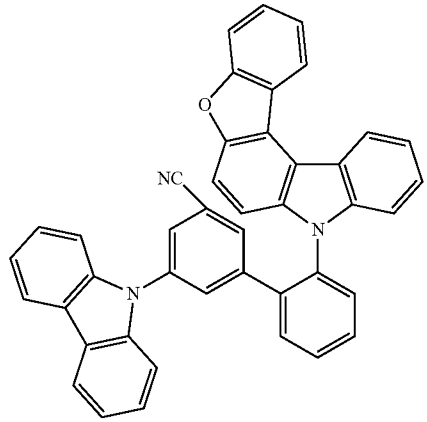
366
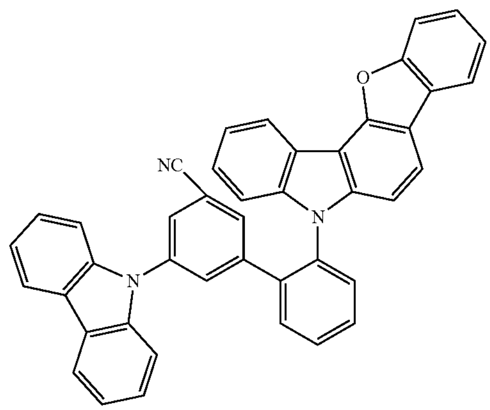
367
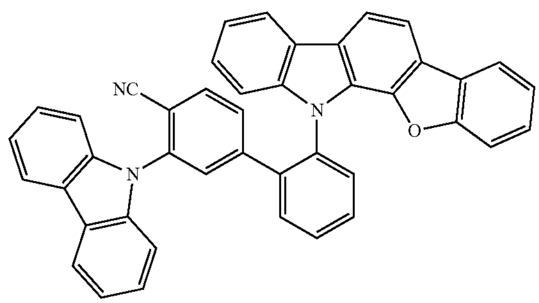
368
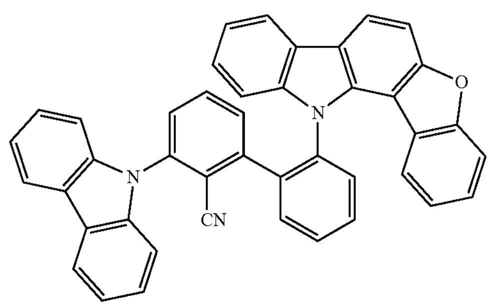

369
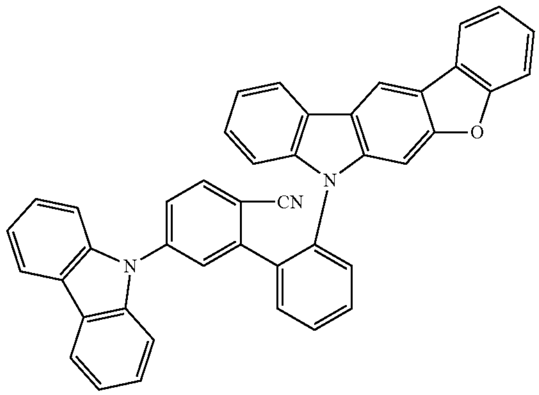
370
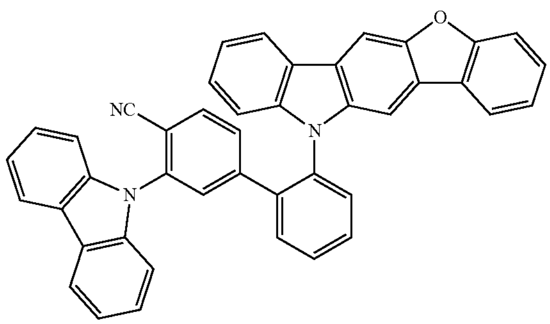
371
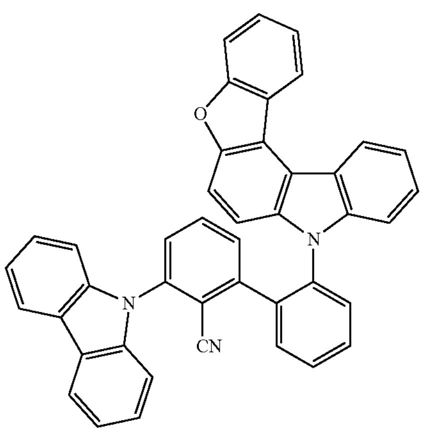
372
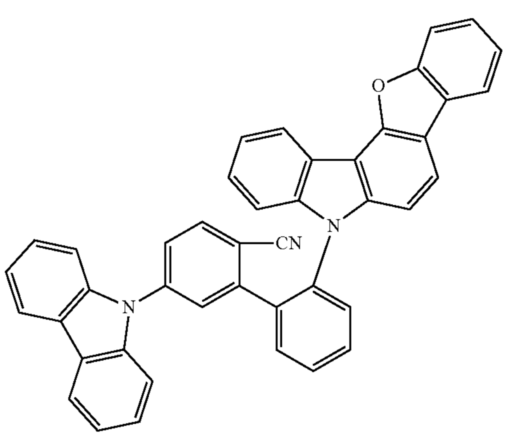
373
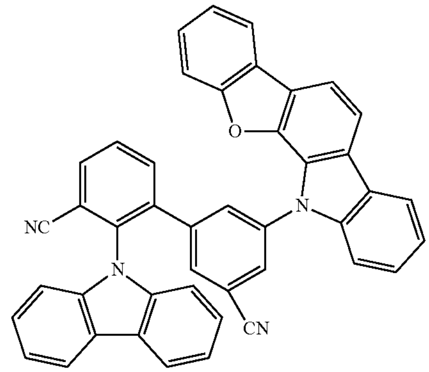
374
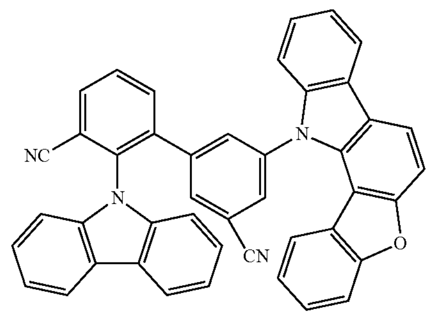
375
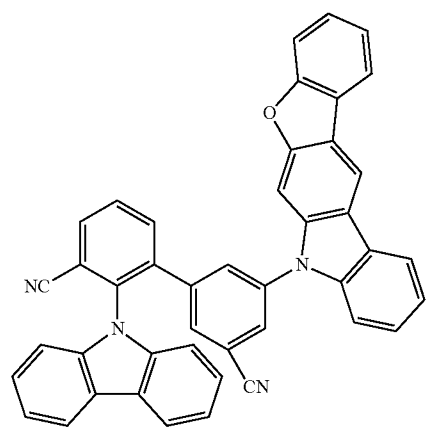
376
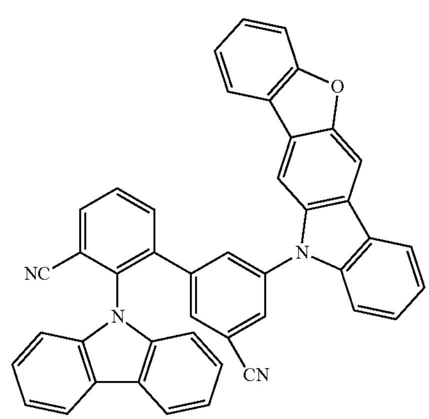

-continued
377
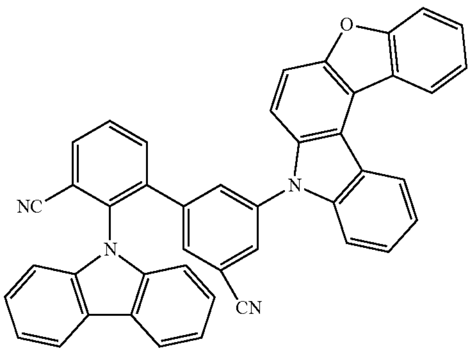
378
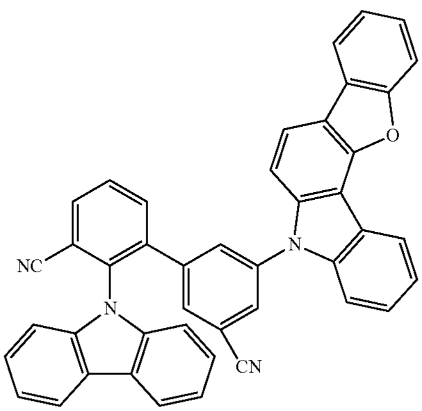
379
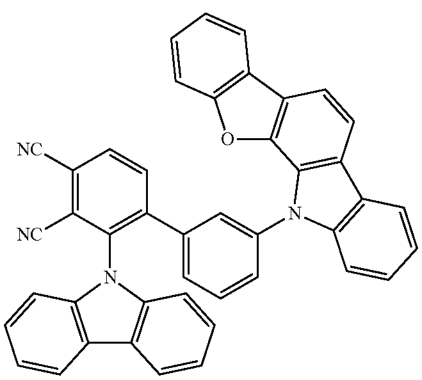
380
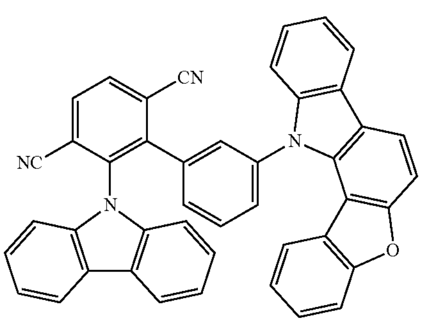
-continued
381
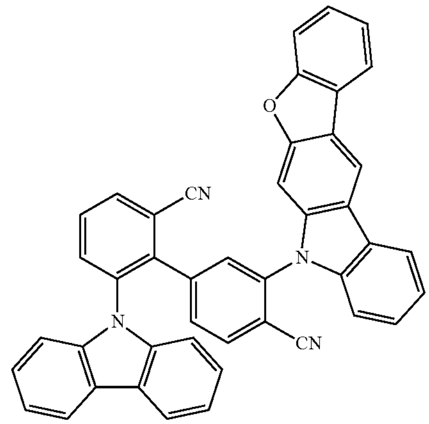
382
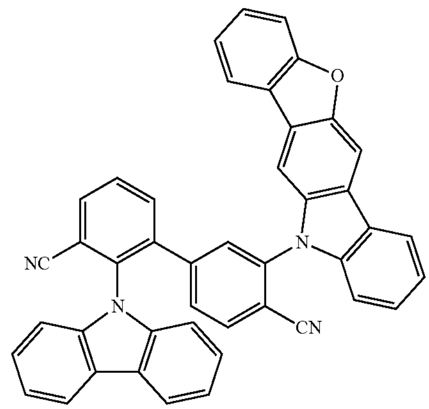
383
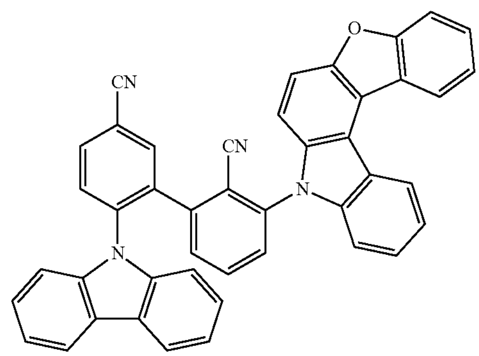
384
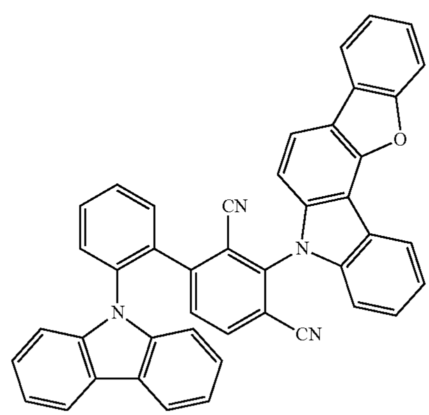

-continued
385
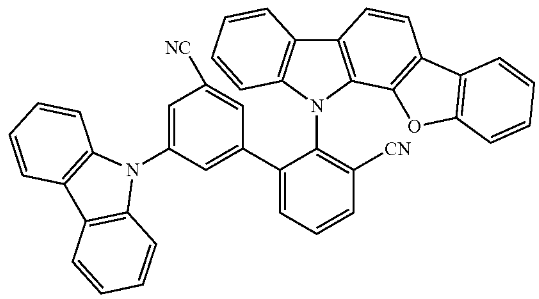
386
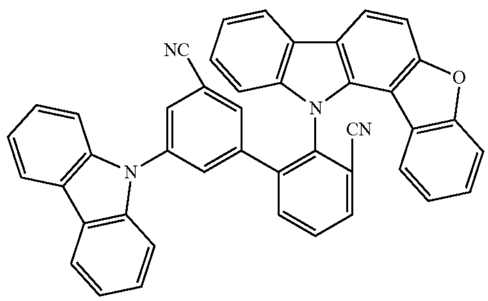
387
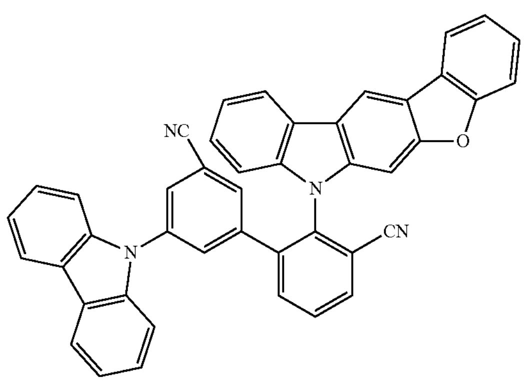
388
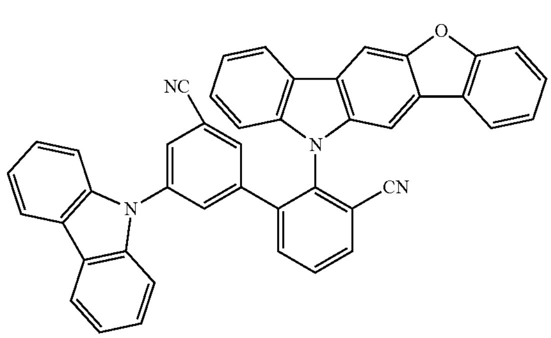
-continued
389
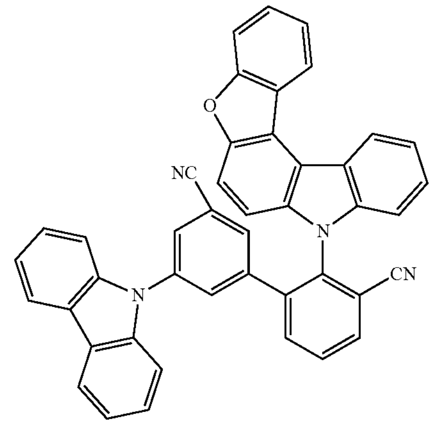
390
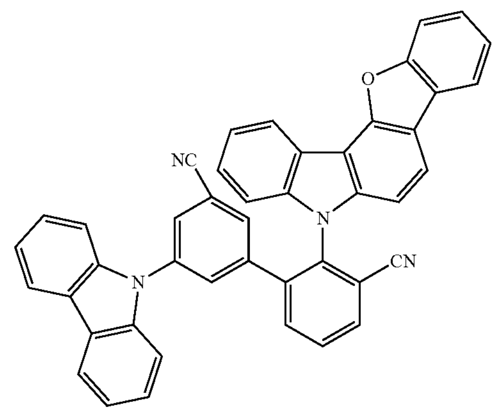
391
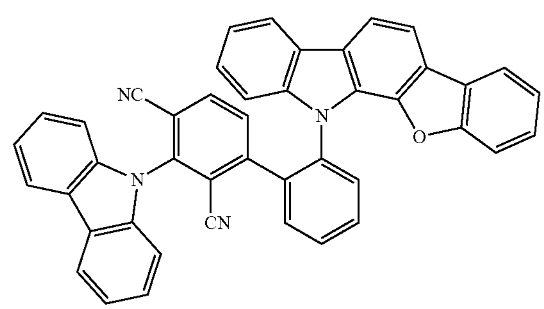
392
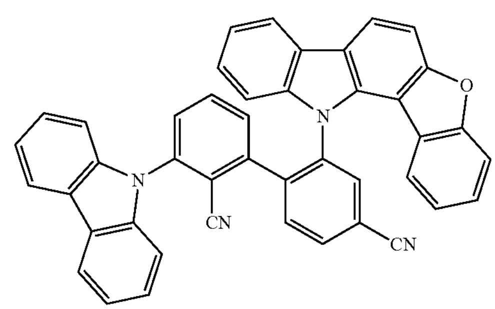

-continued
393
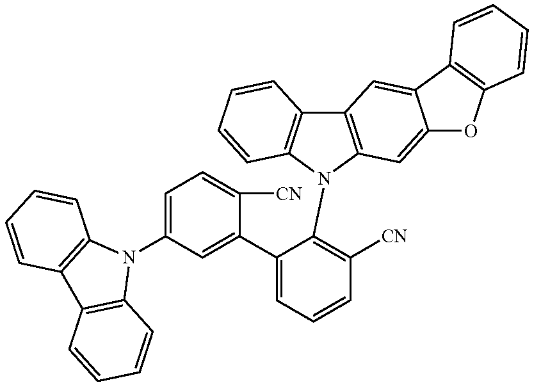
394
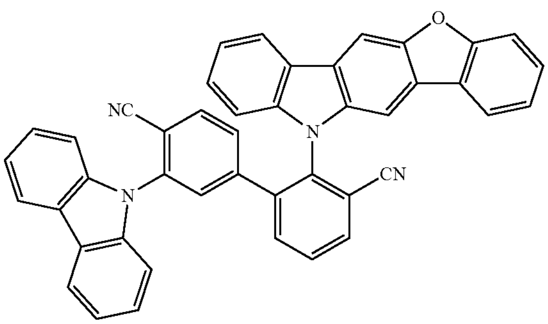
395
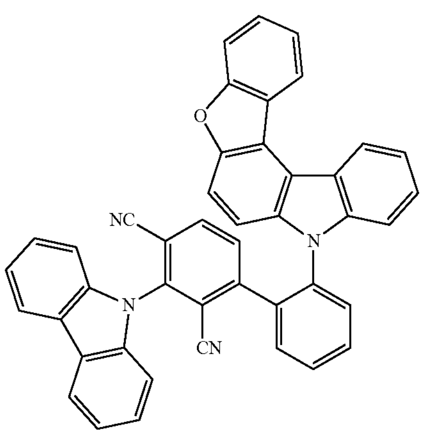
396
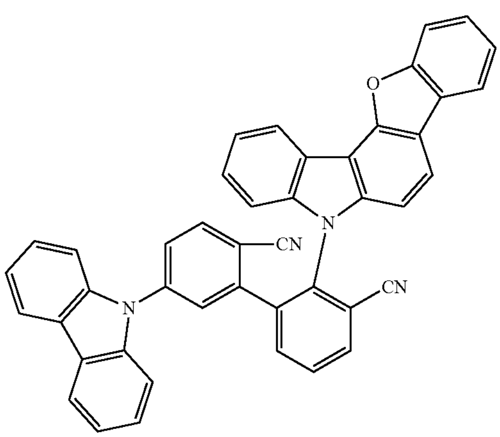
-continued
397
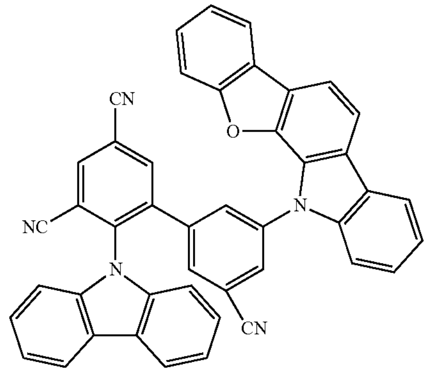
398
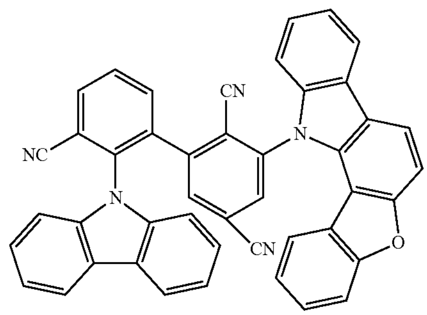
399
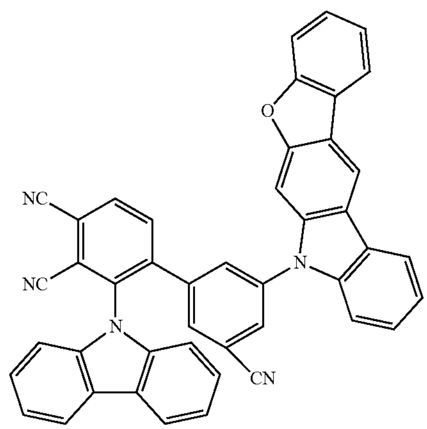
400
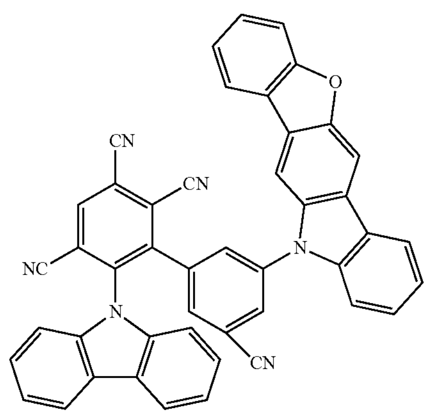

-continued
401
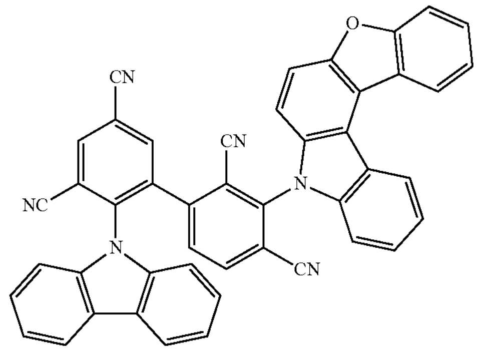
402
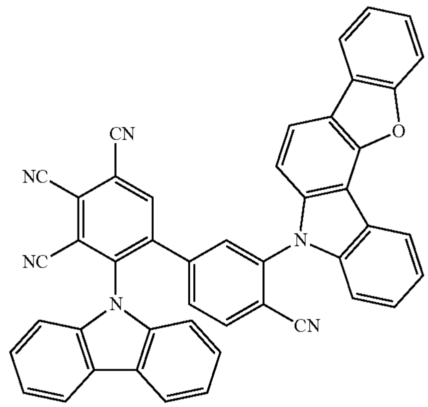
403
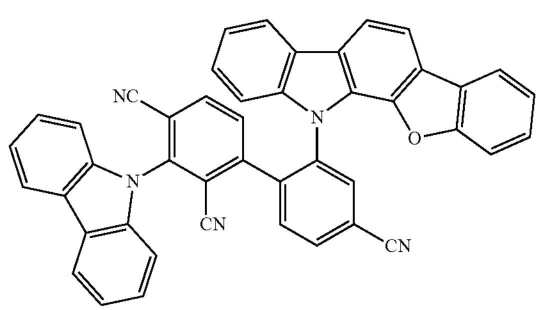
404
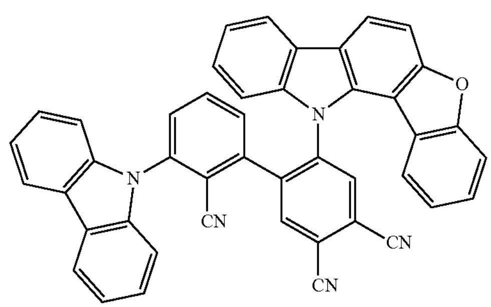
-continued
405
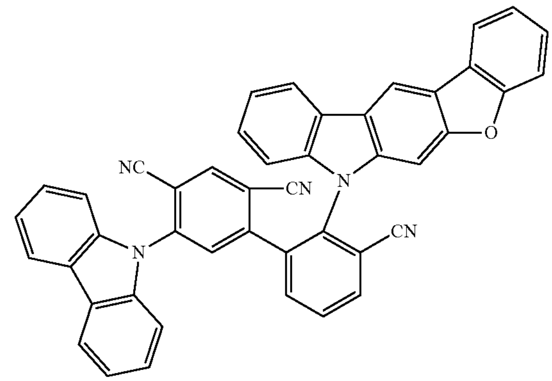
406
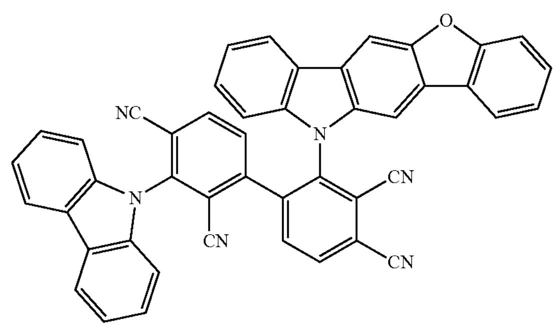
407
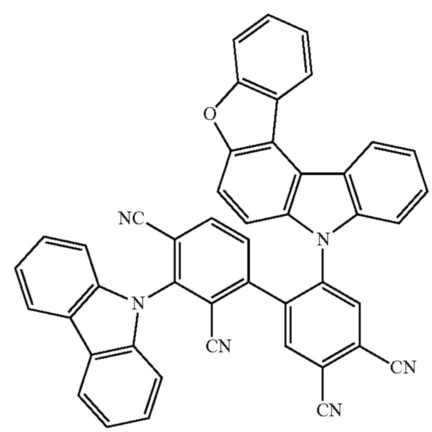
408
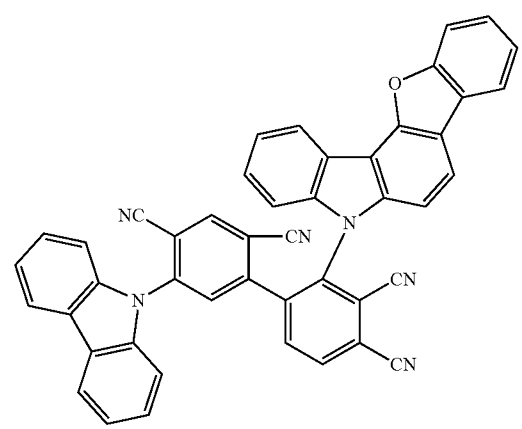

-continued
409
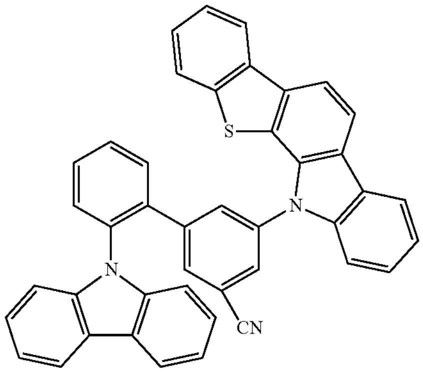
410
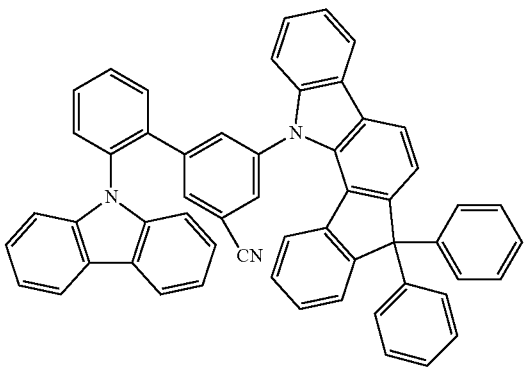
411
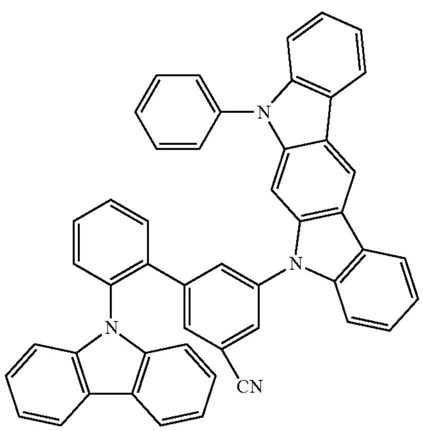
412
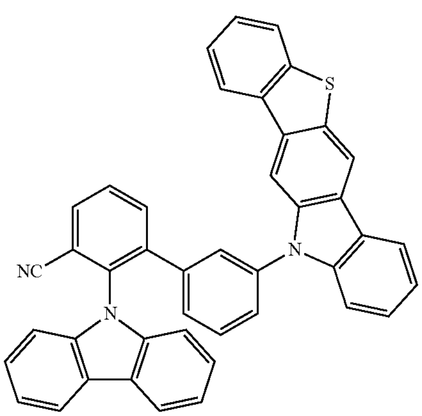
-continued
413
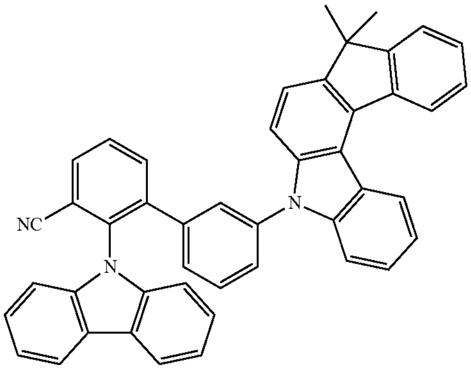
414
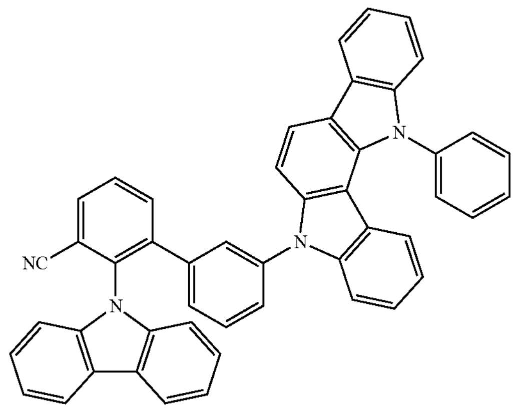
415
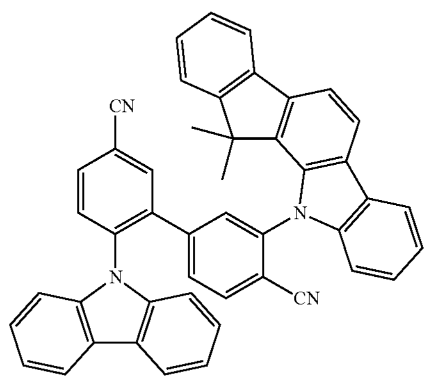
416
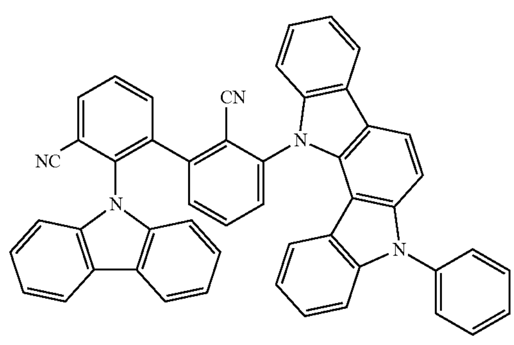

-continued
417
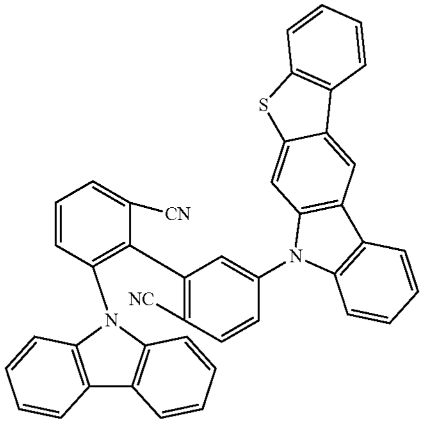
418
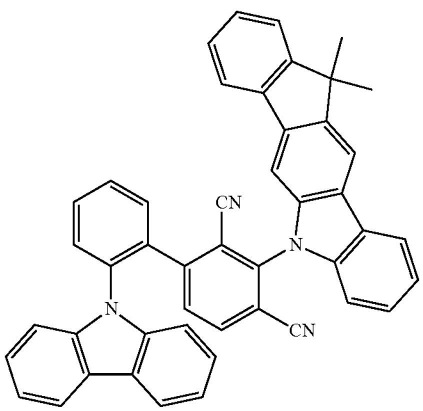
419
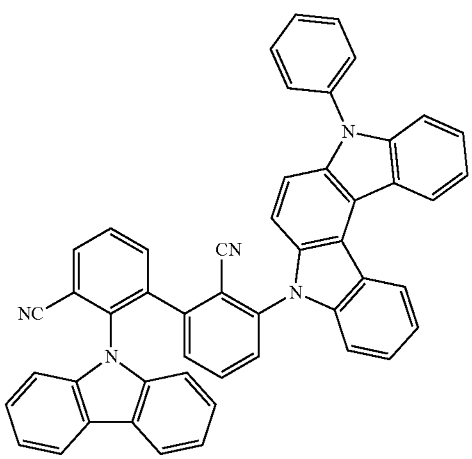
-continued
420
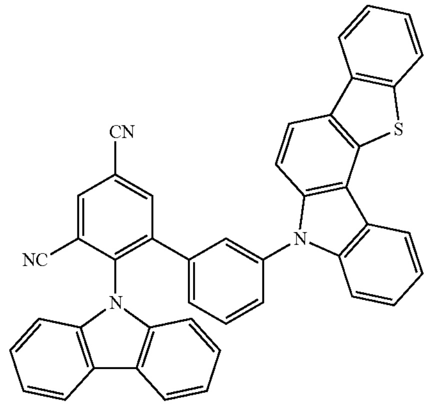
421
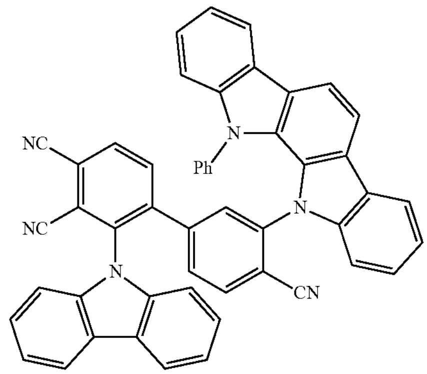
422
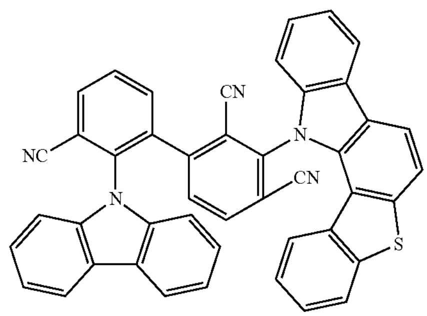
423
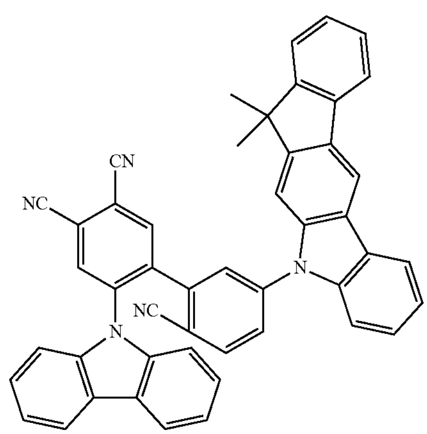

424
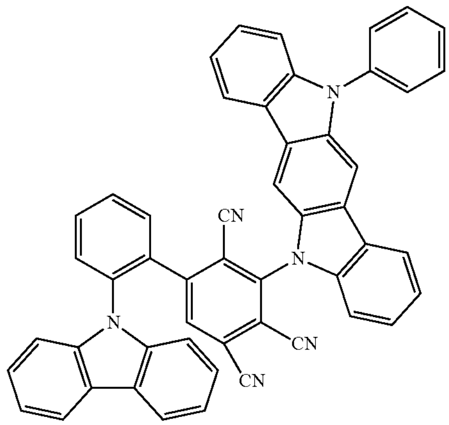
425
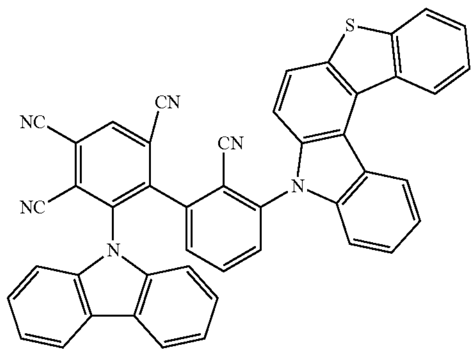
426
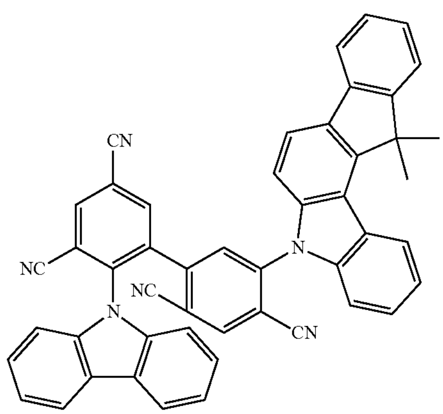
427
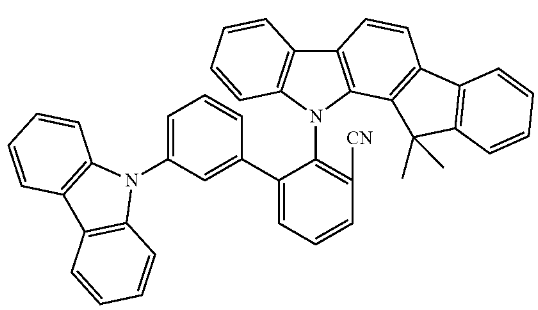
428
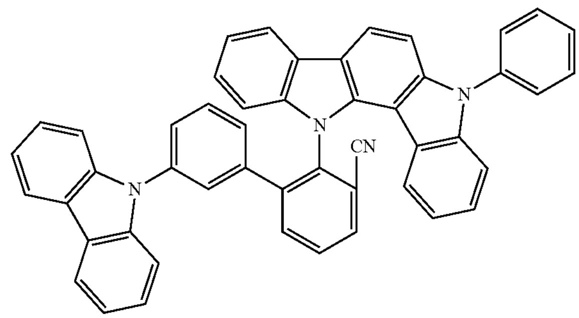
429
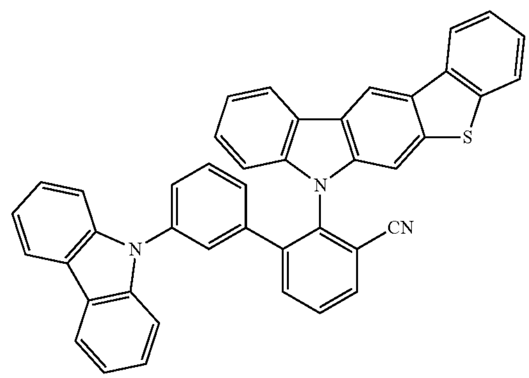
430
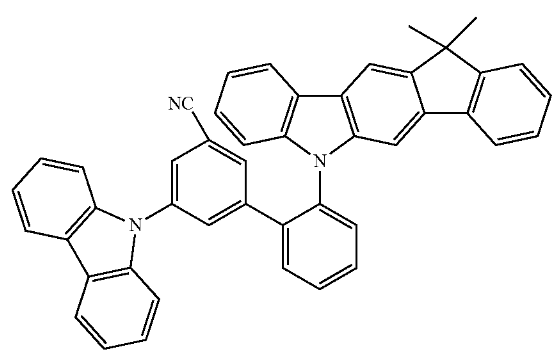
431
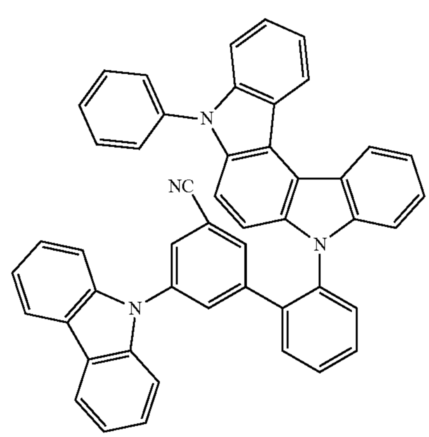

-continued
432
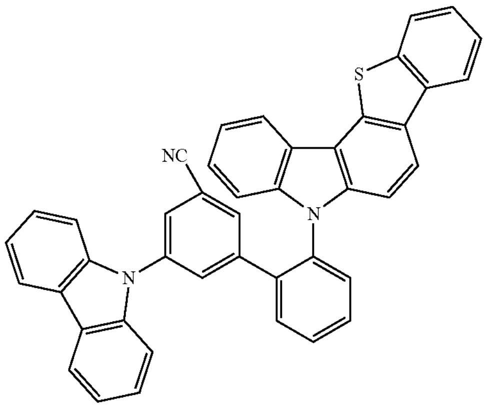
433
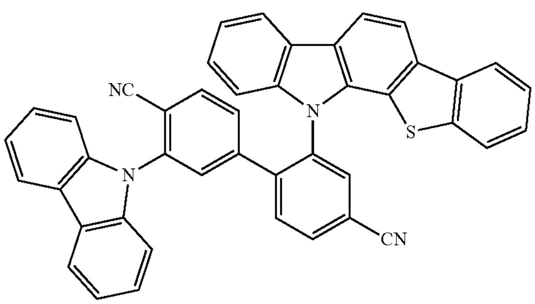
434
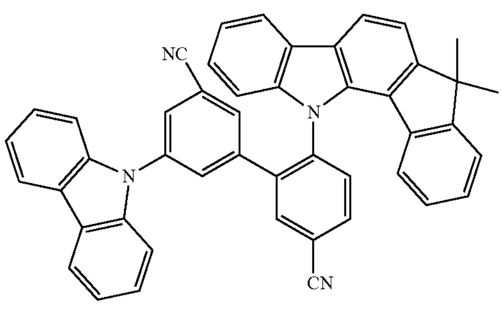
435
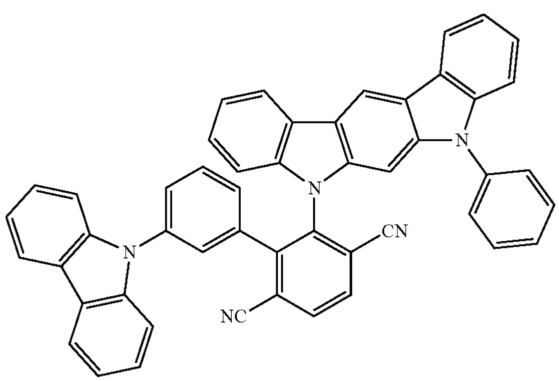
-continued
436
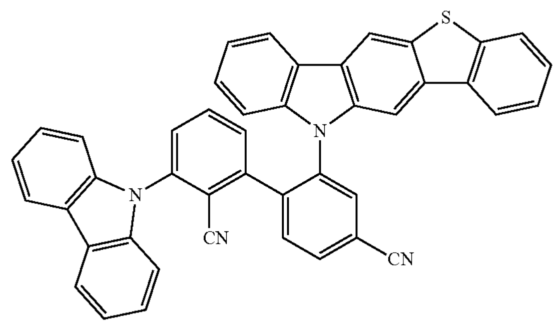
437
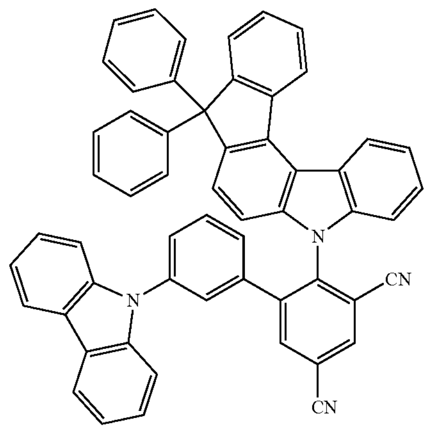
438
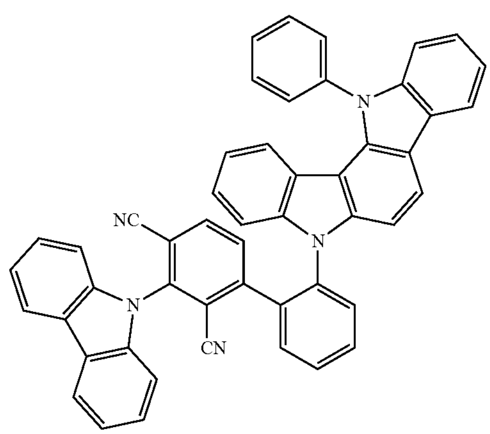
439
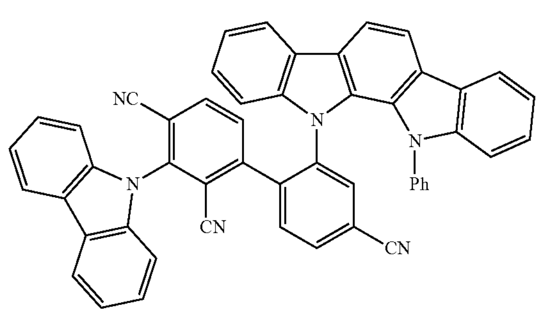

-continued
440
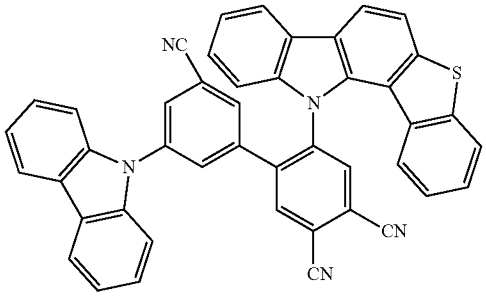
441
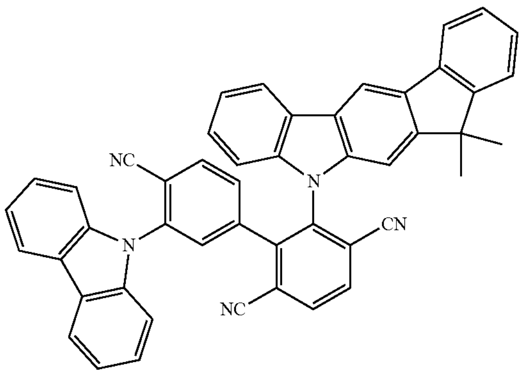
442
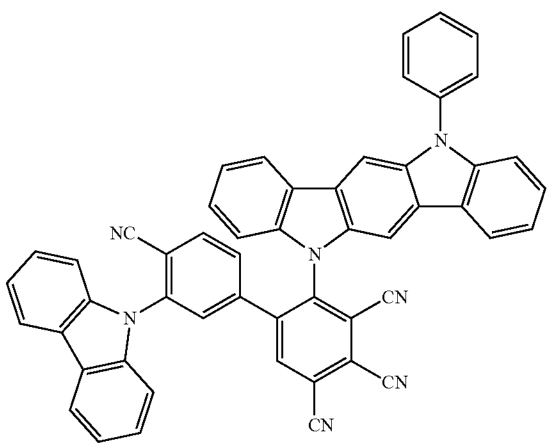
443
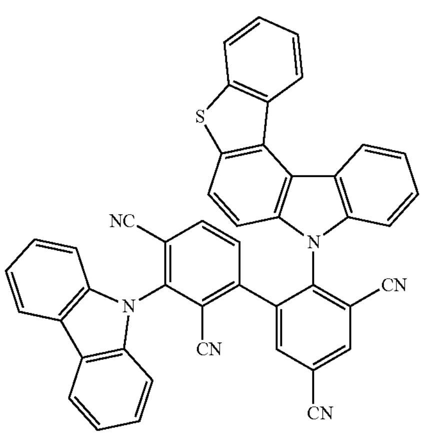
-continued
444
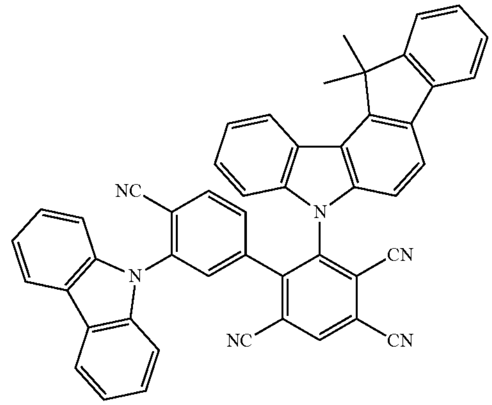
445
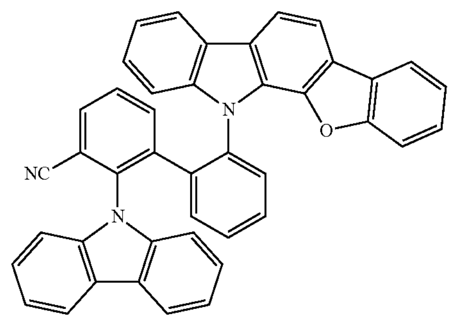
446
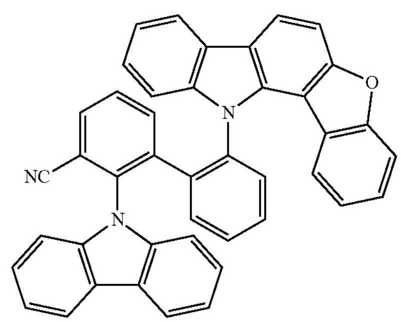
447
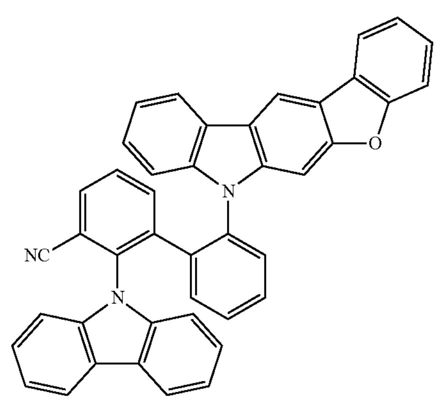

-continued
448
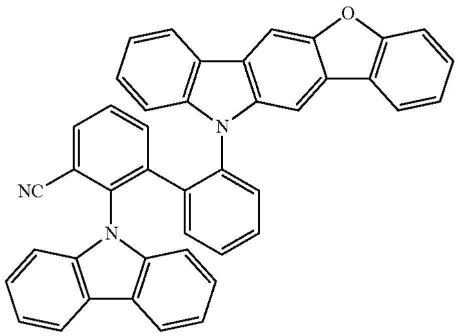
449
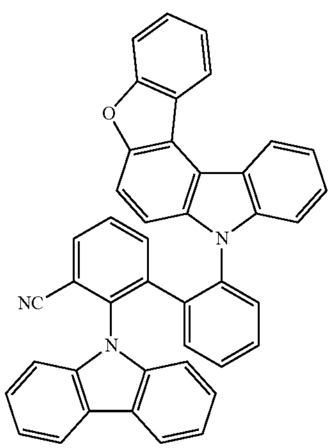
450
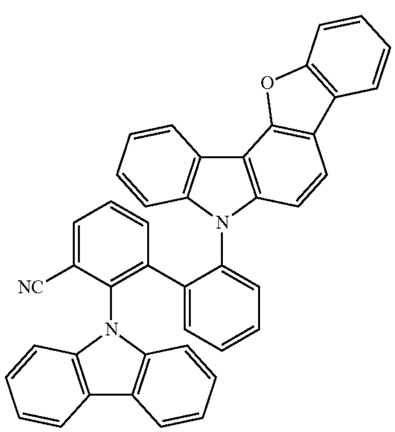
451
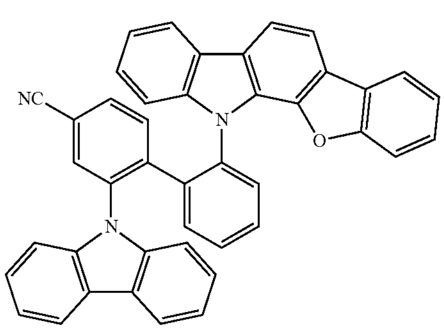
-continued
452
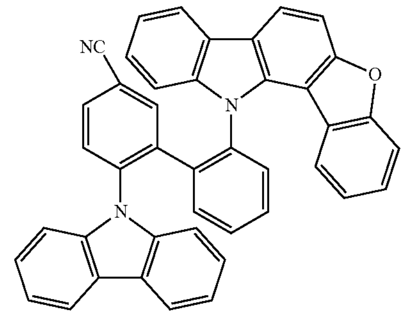
453
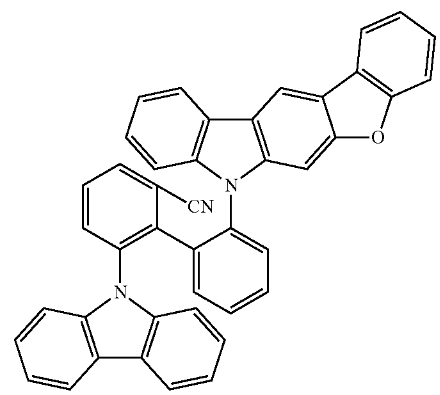
454
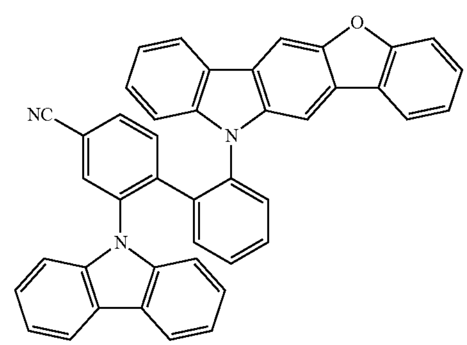
455
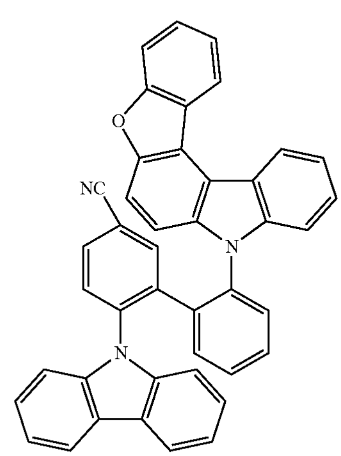

-continued
456
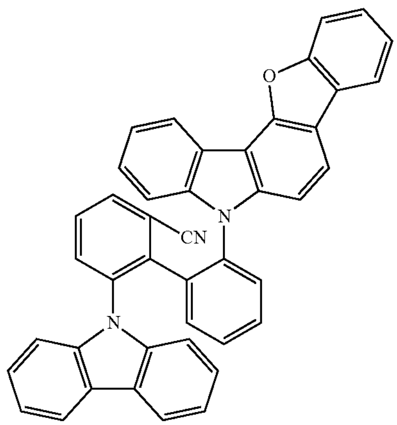
457
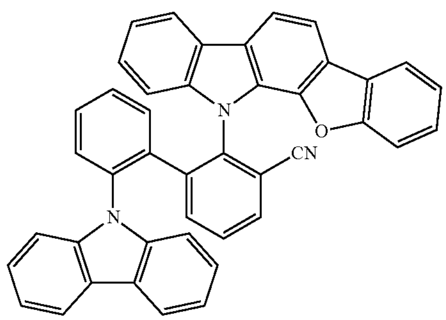
458
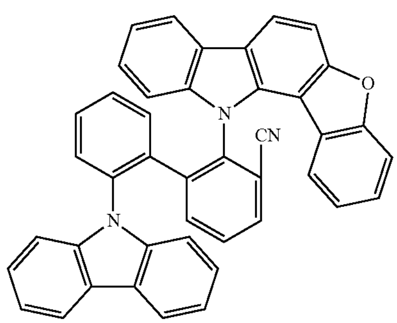
459
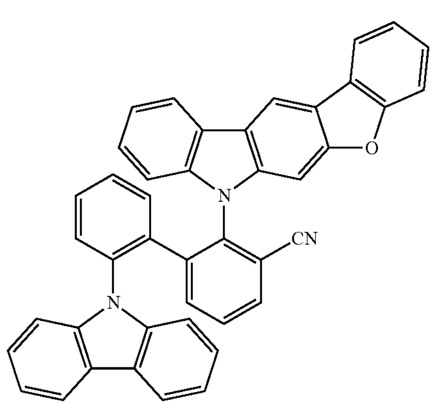
-continued
460
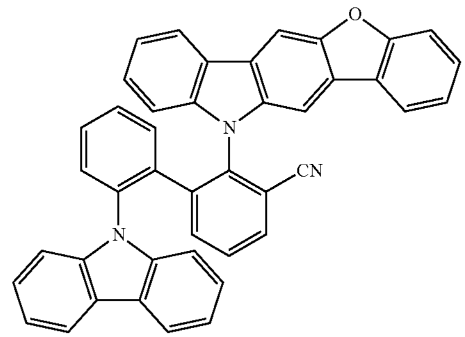
461
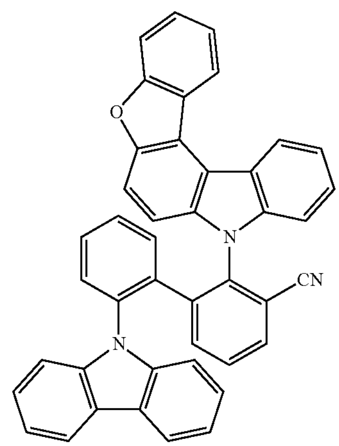
462
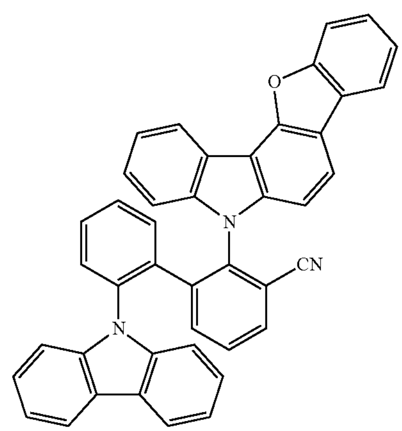
463
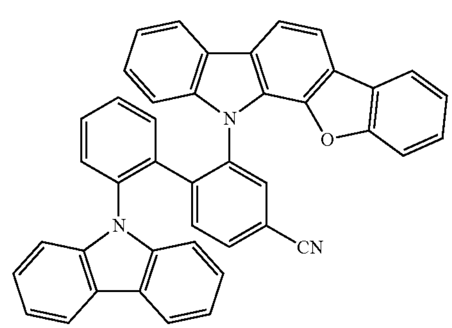

-continued
464
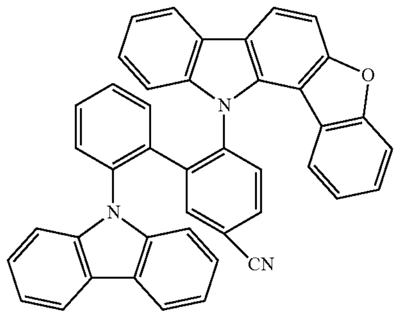
465
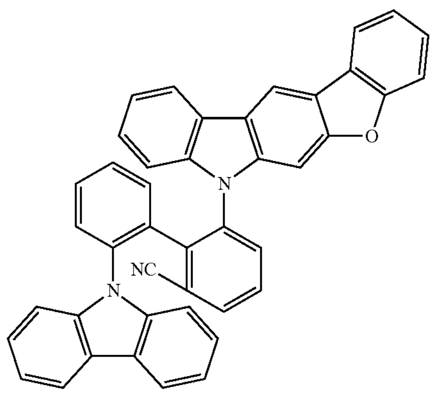
466
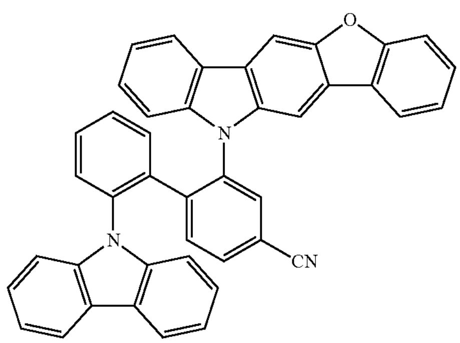
467
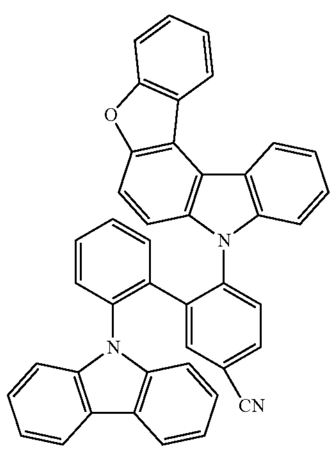
-continued
468
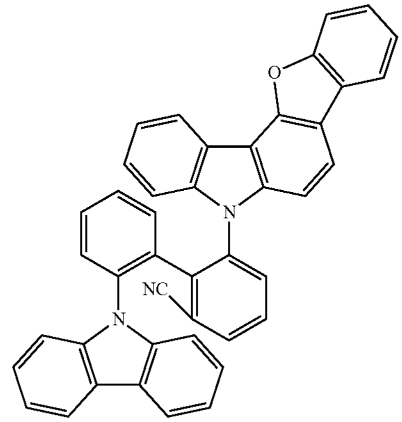
469
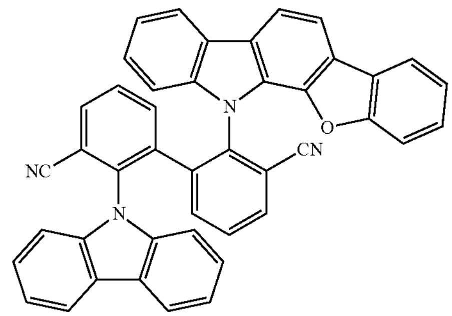
470
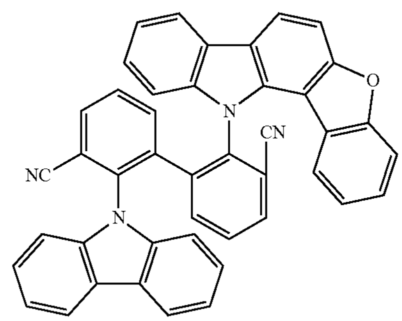
471
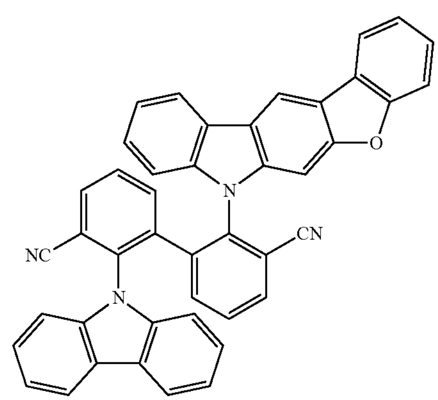

-continued
472
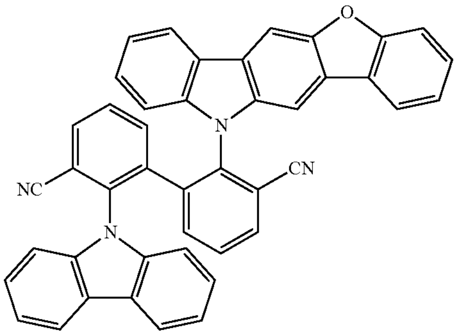
473
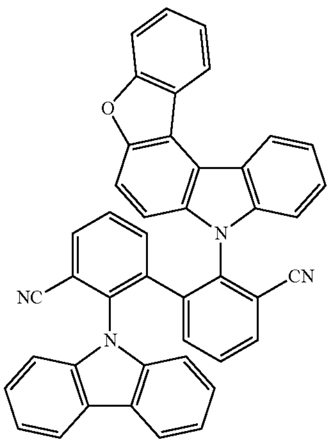
474
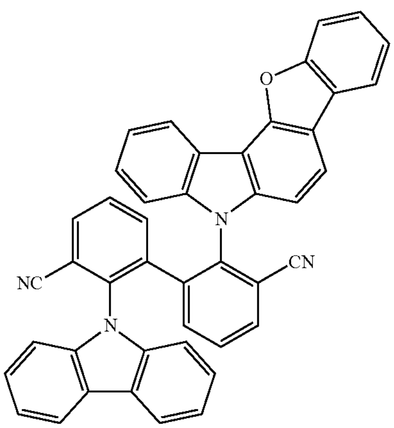
475
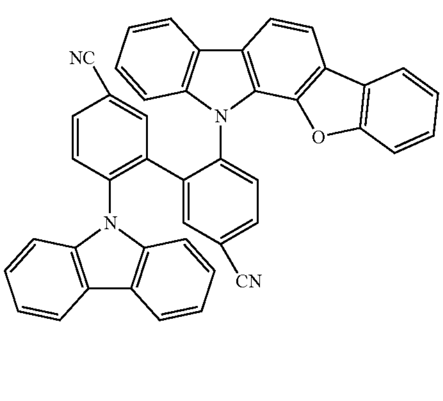
-continued
476
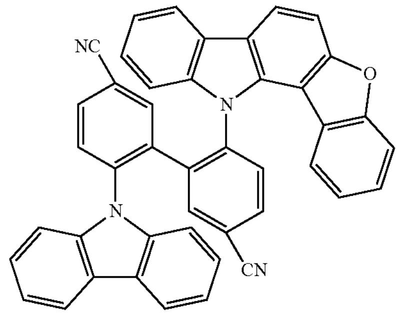
477
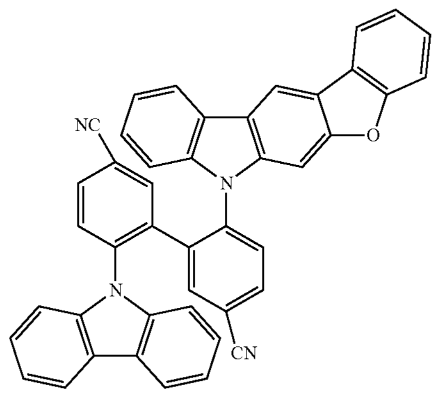
478
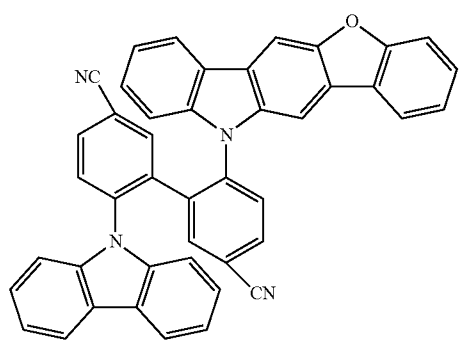
479
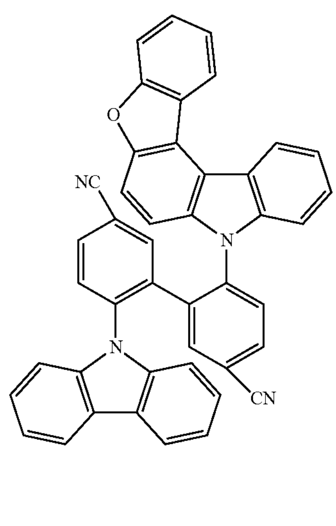

-continued
480
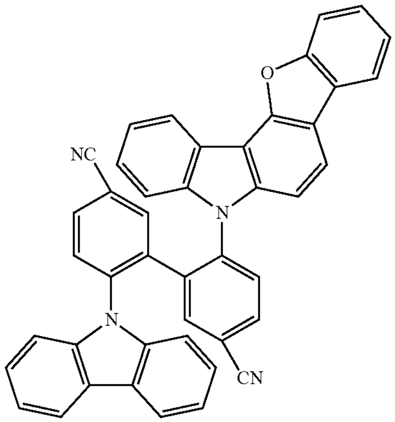
481
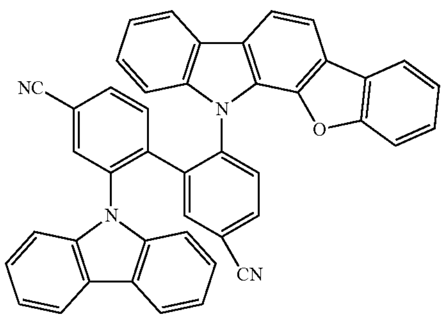
482
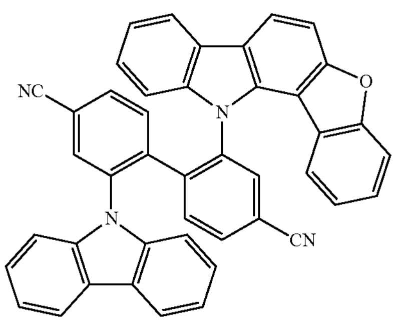
483
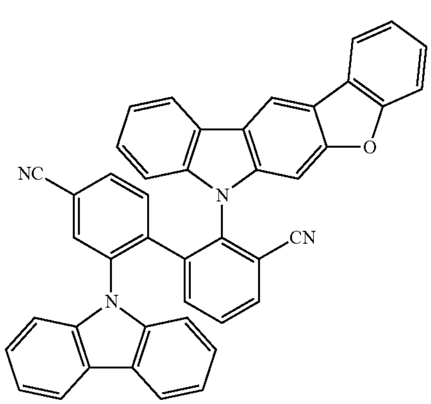
-continued
484
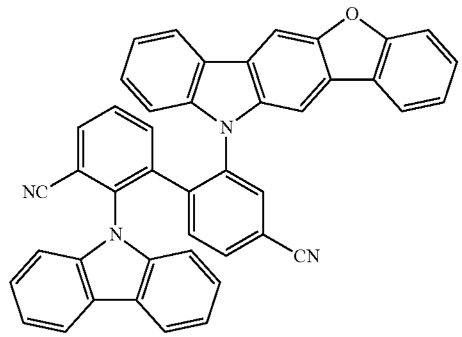
485
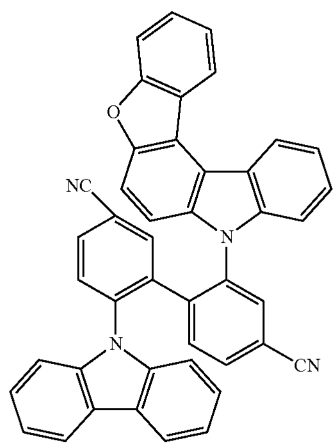
486
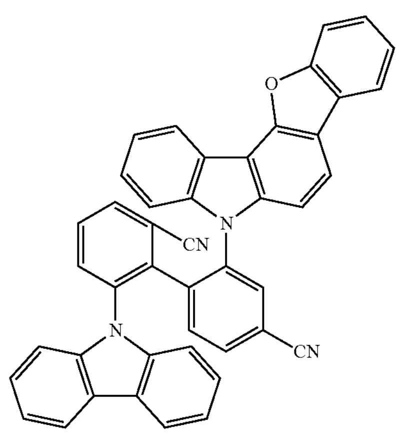
487
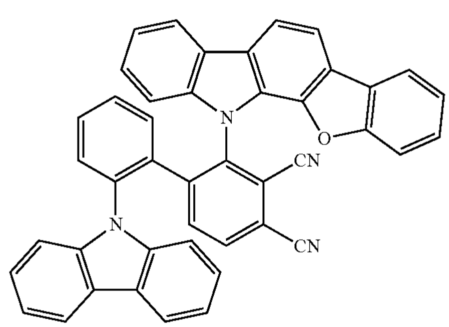

-continued
488
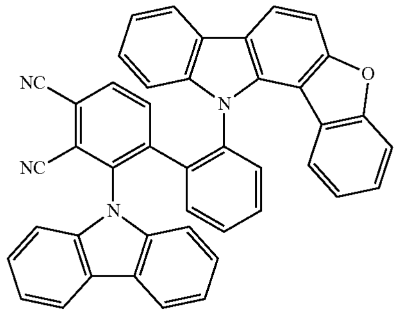
489
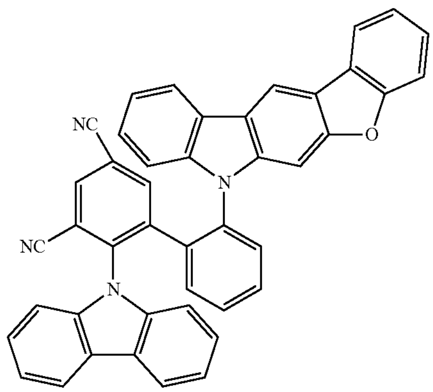
490
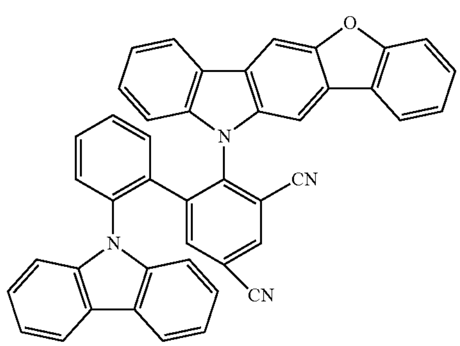
491
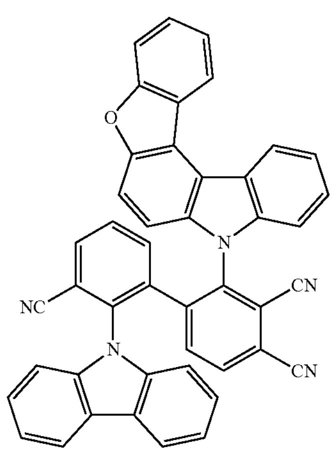
-continued
492
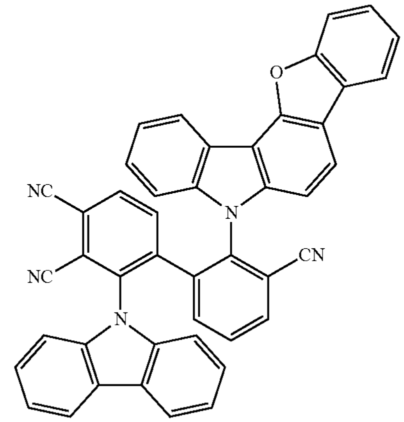
493
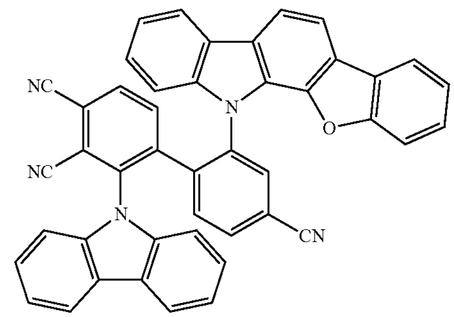
494
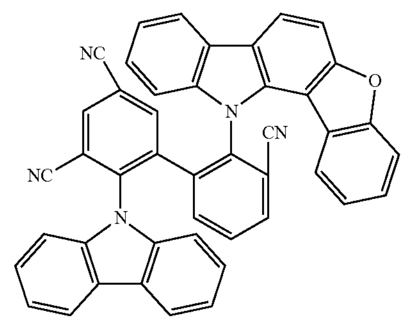
495
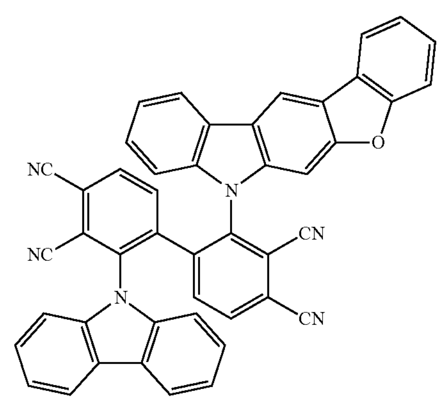

-continued
496
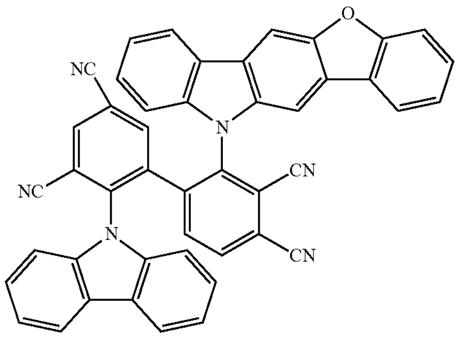
497
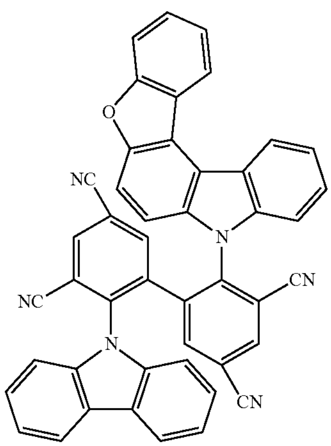
498
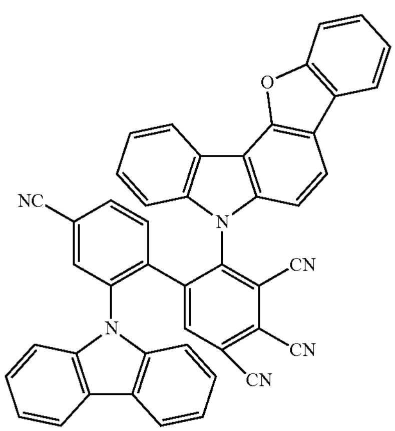
499
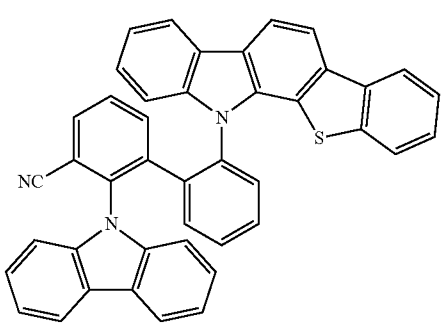
-continued
500
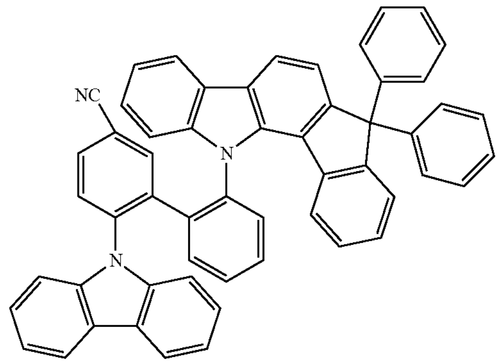
501
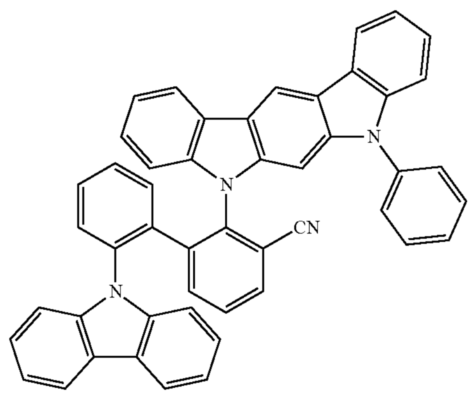
502
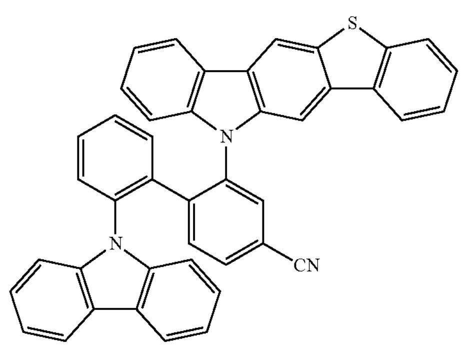
503
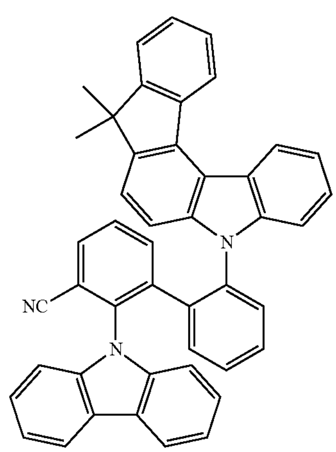

504
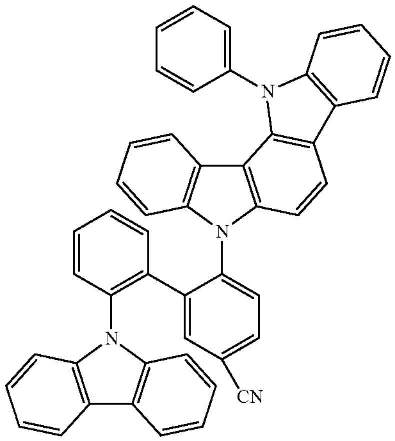
505
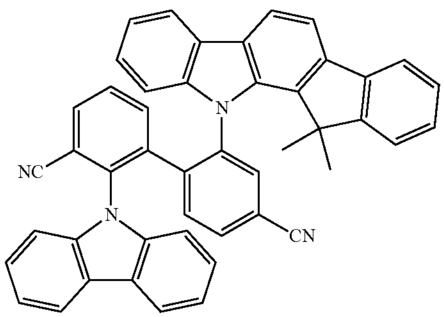
506
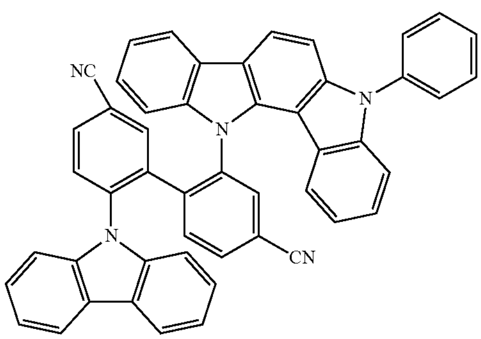
507
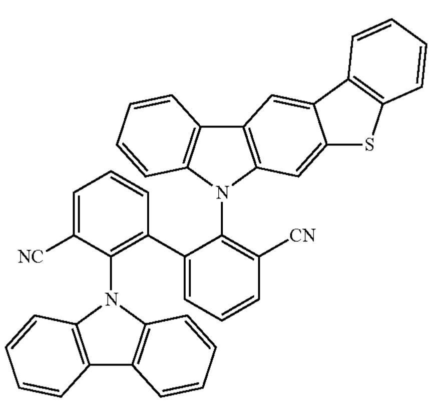
508
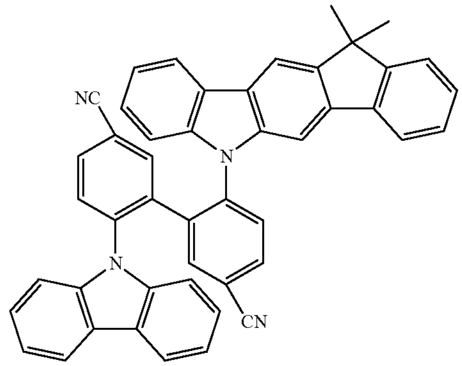
509
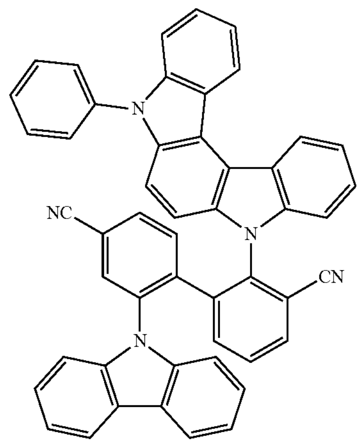
510
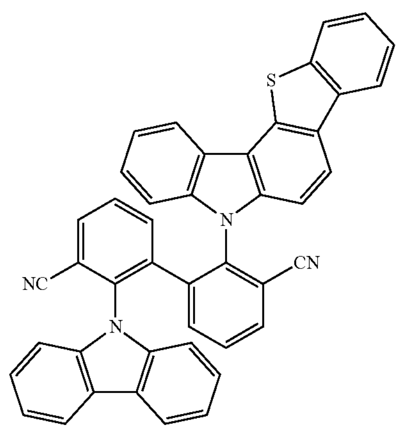
511
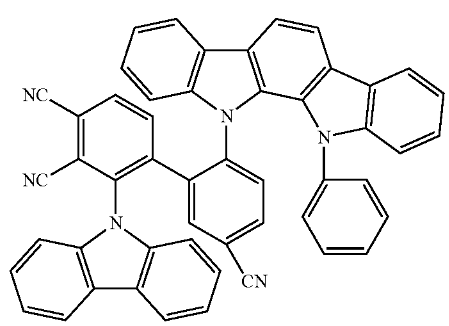

-continued
512
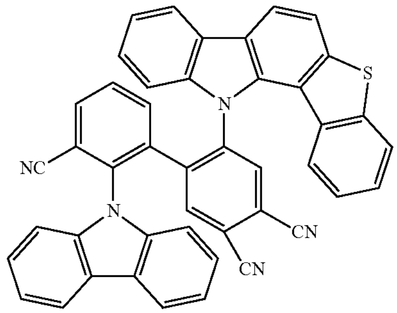
513
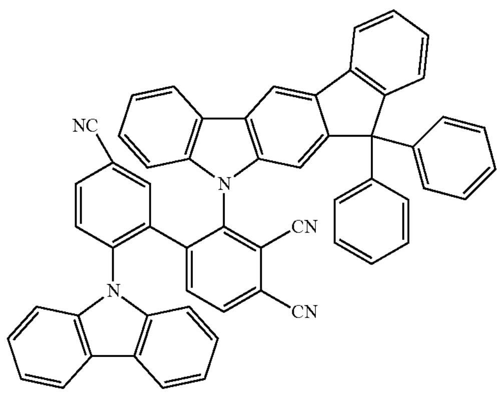
514
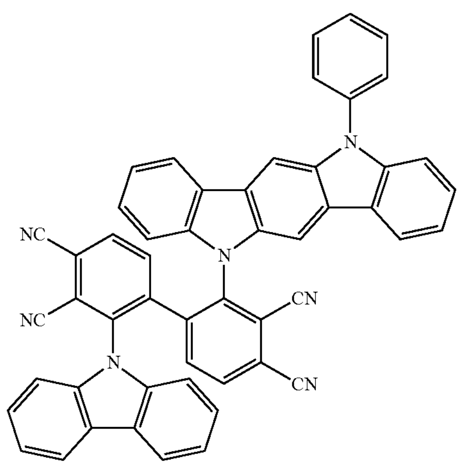
515
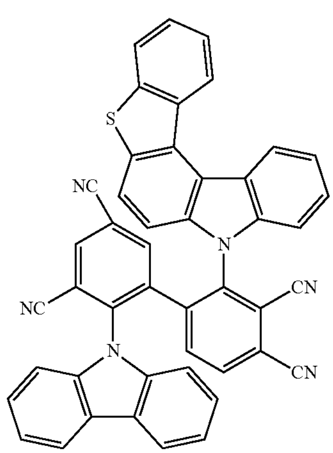
-continued
516
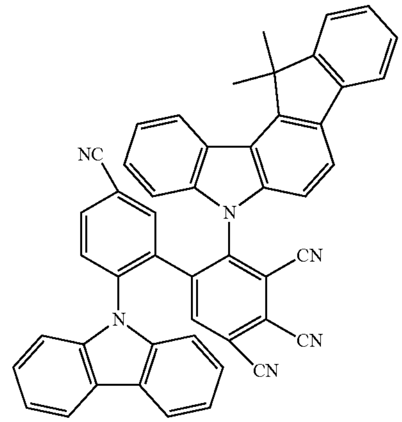
517
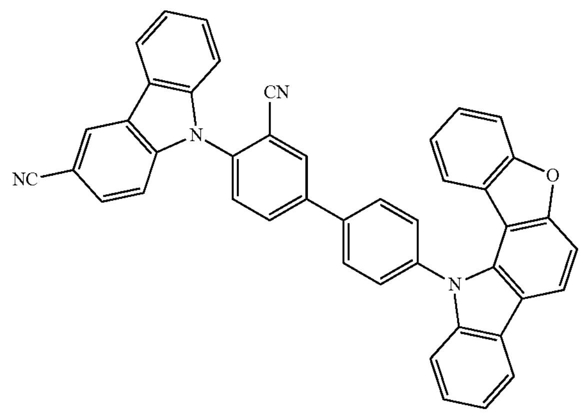
518
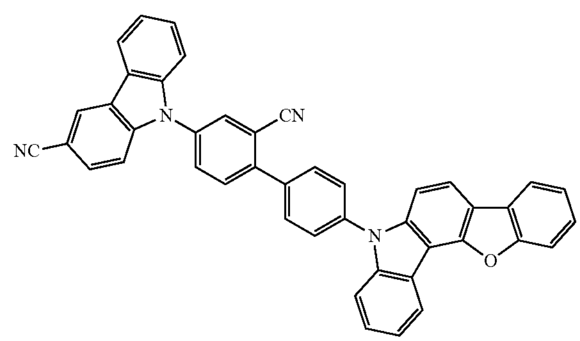
519
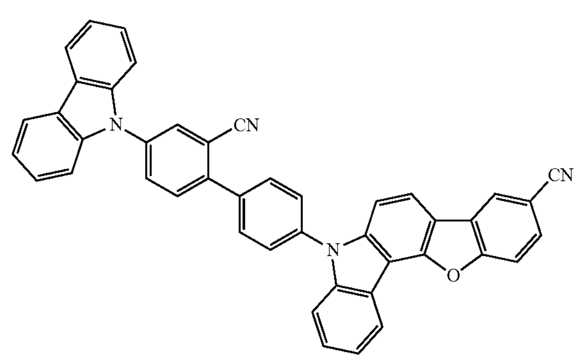

520
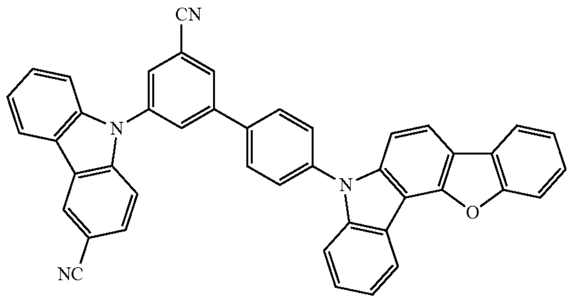
521
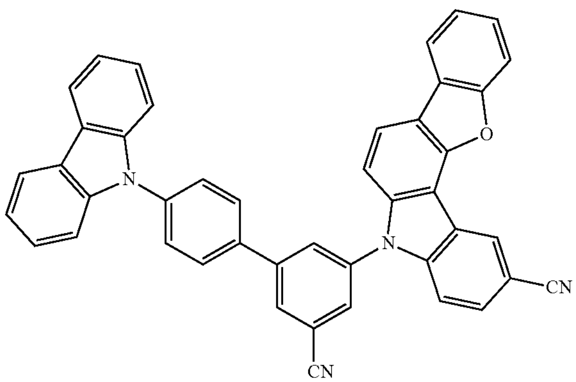
522
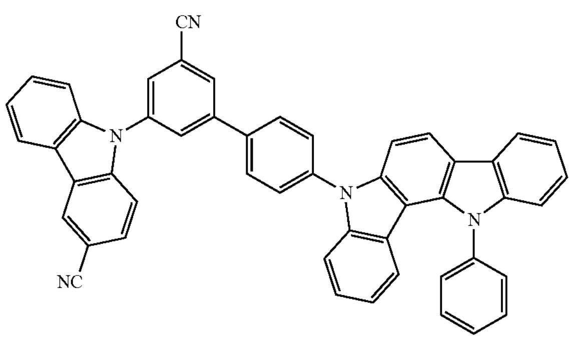
523
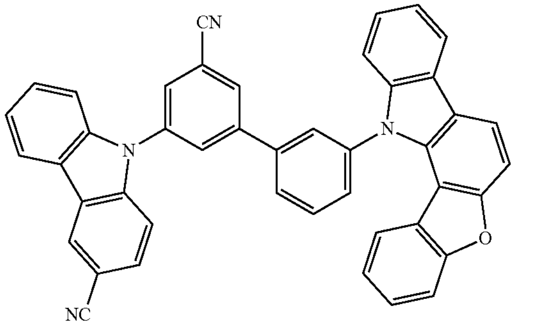
524
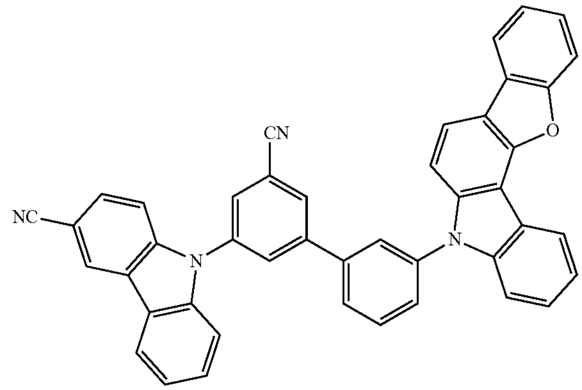
525
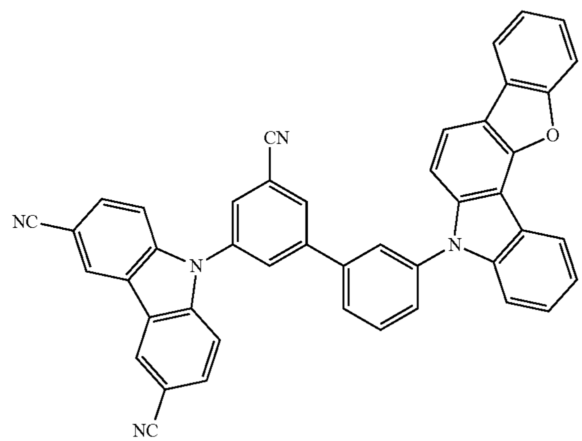
526
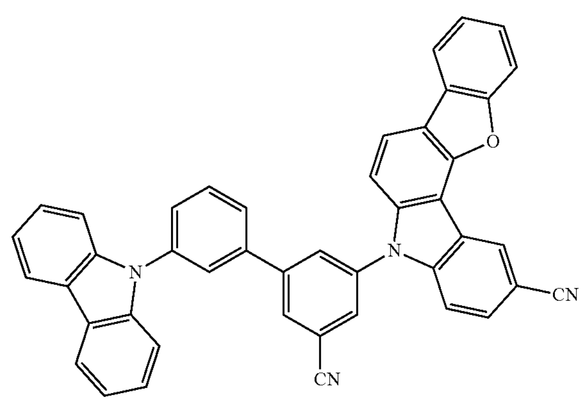

-continued
527
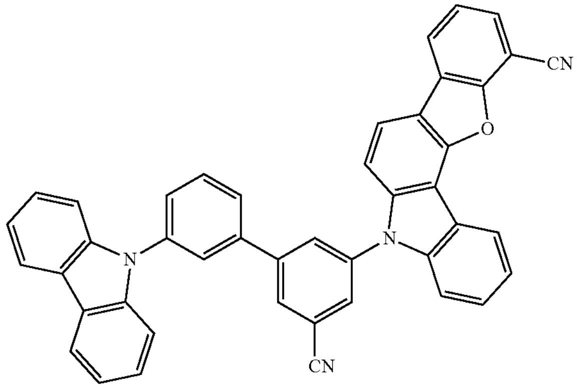
528
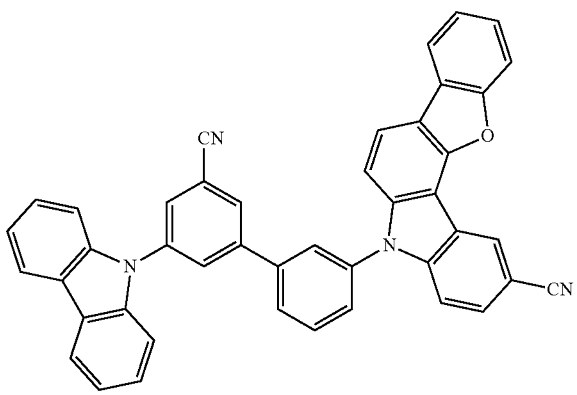
529
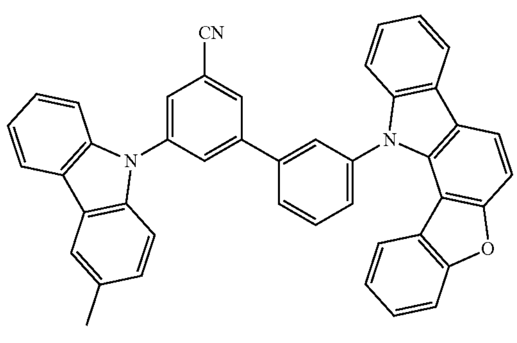
530
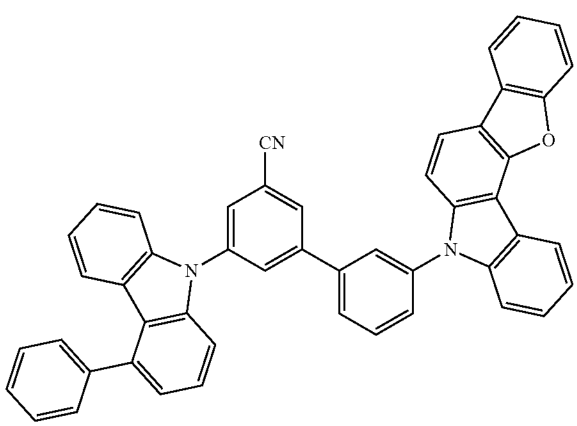
-continued
531
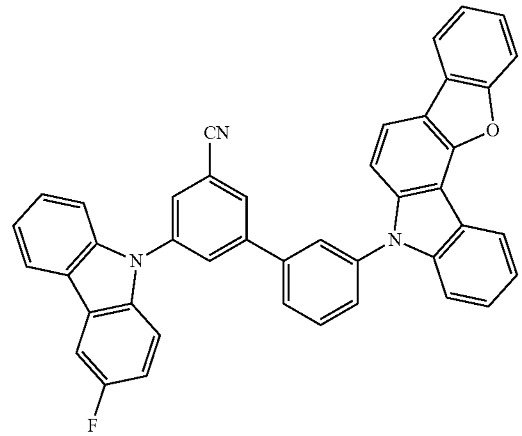
532
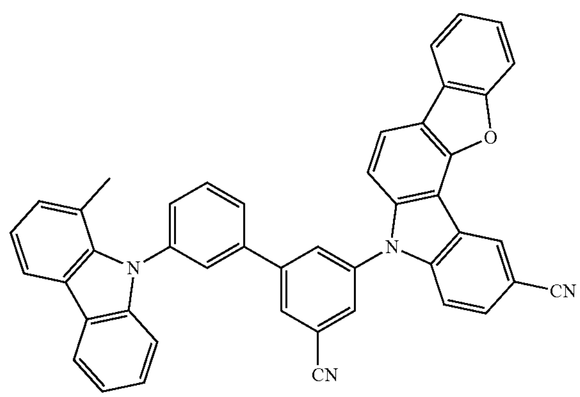
533
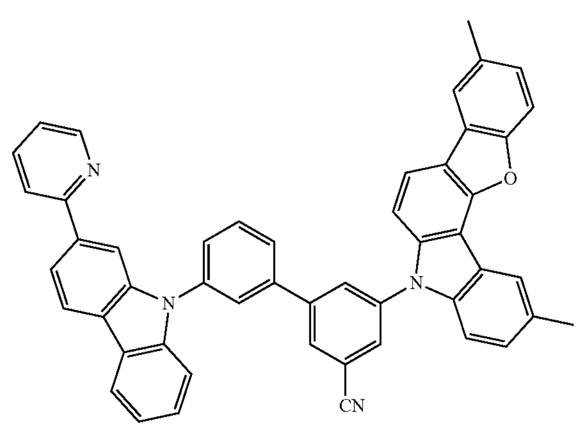

-continued
534
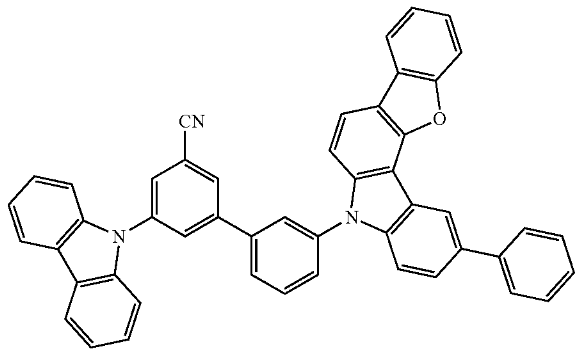
535
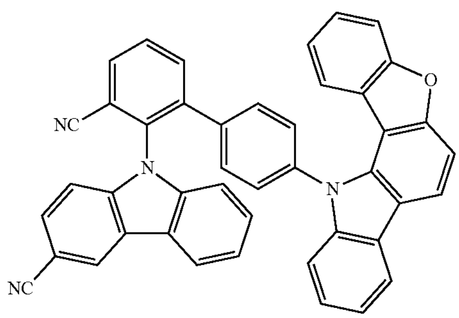
536
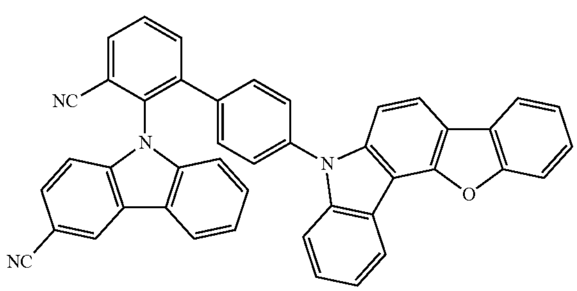
537
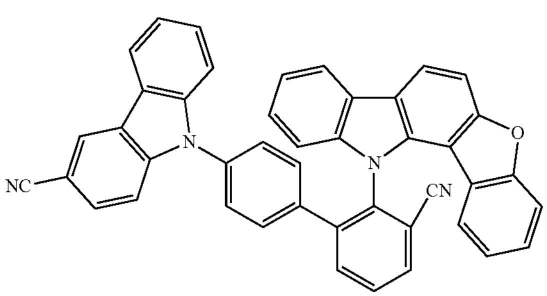
-continued
538
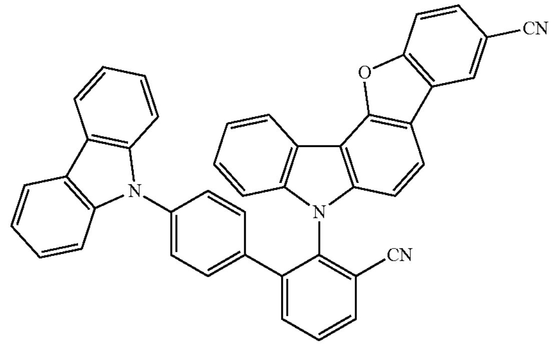
539
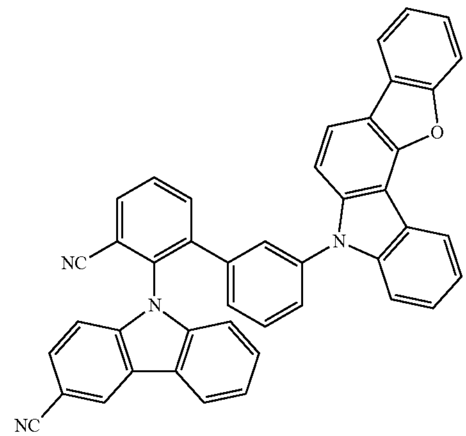
540
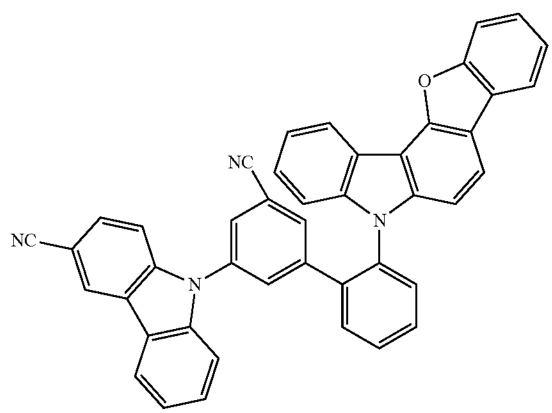
541
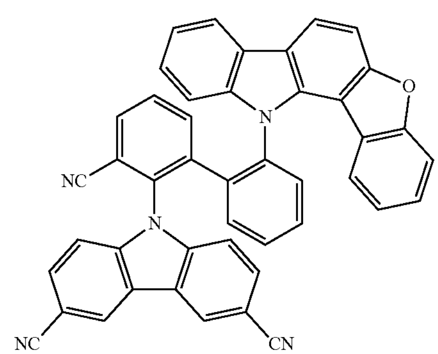

-continued
542
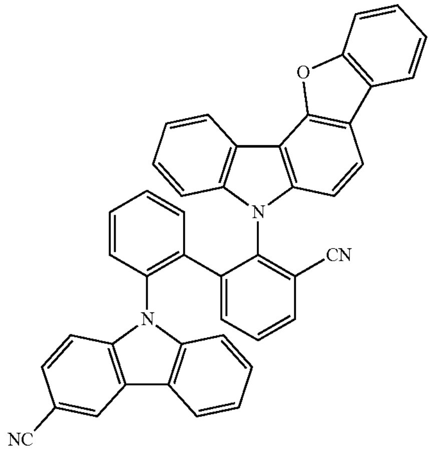
543
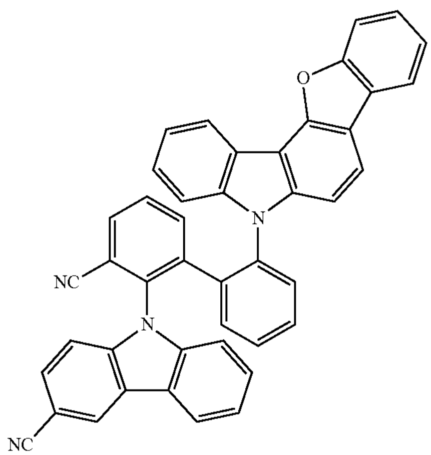
544
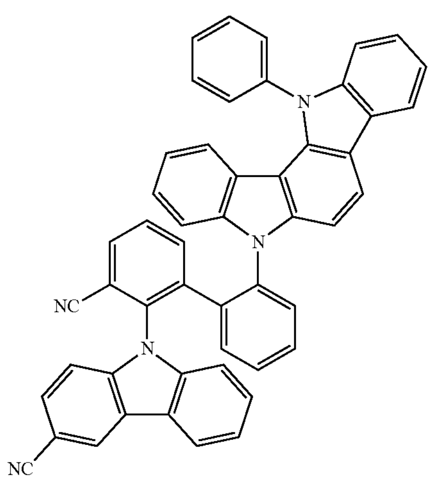
-continued
545
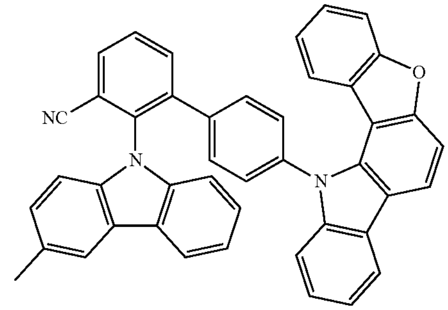
546
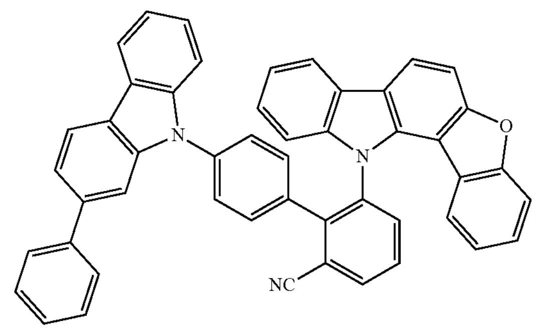
547
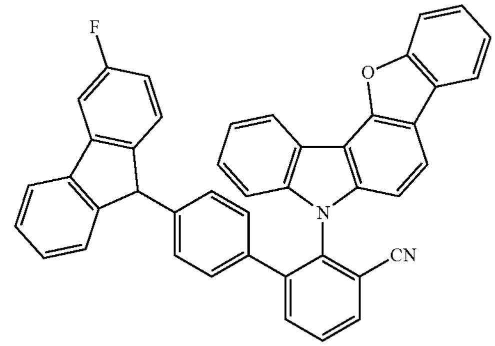
548
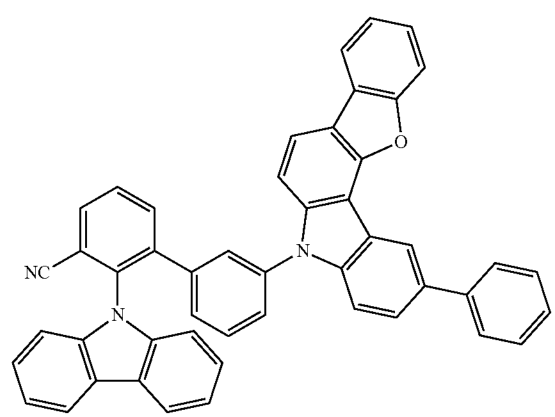

-continued
549
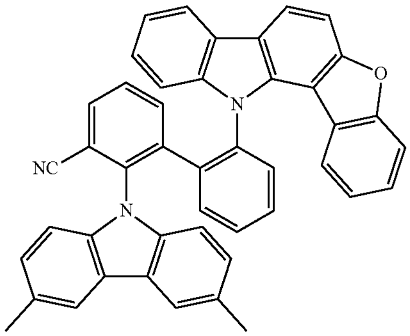
550
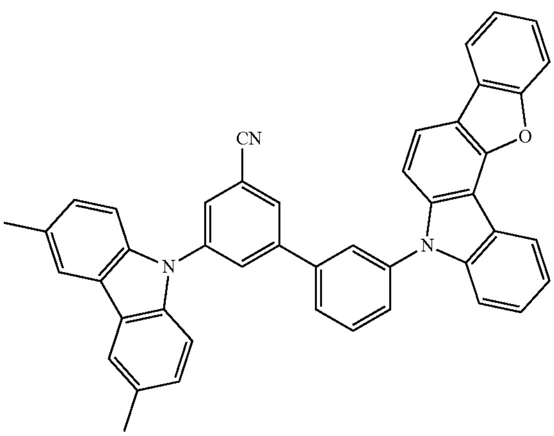
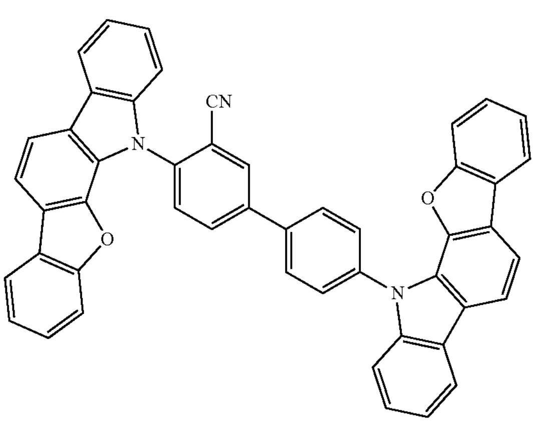
-continued
551
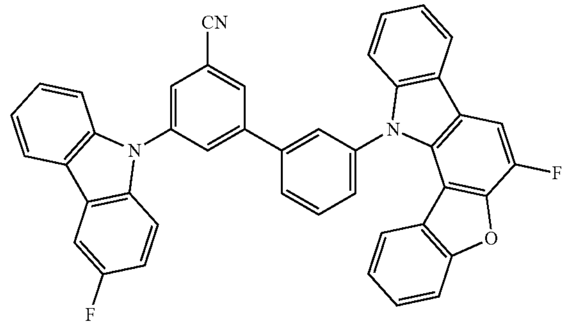
552
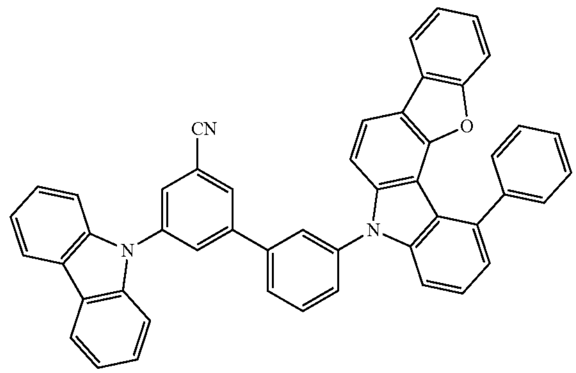
553

-continued
554
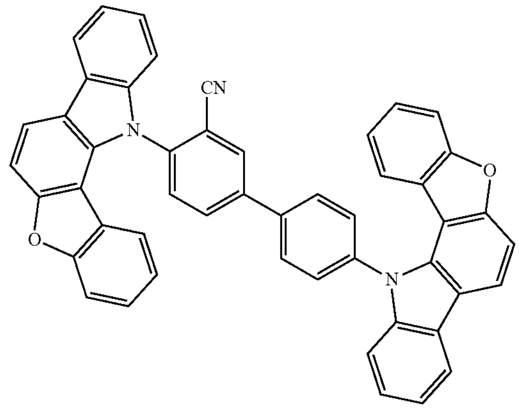
555
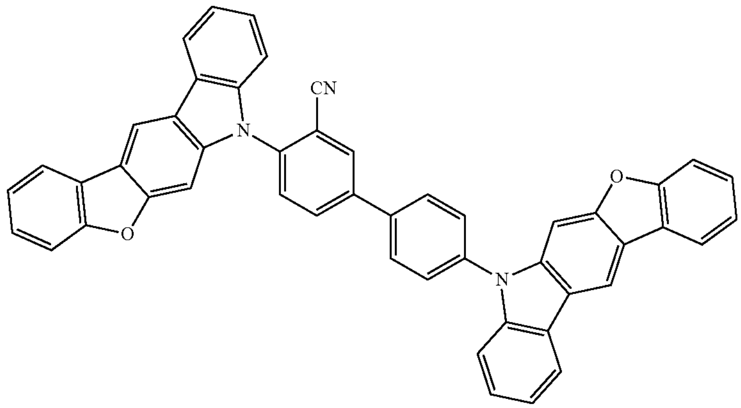
556
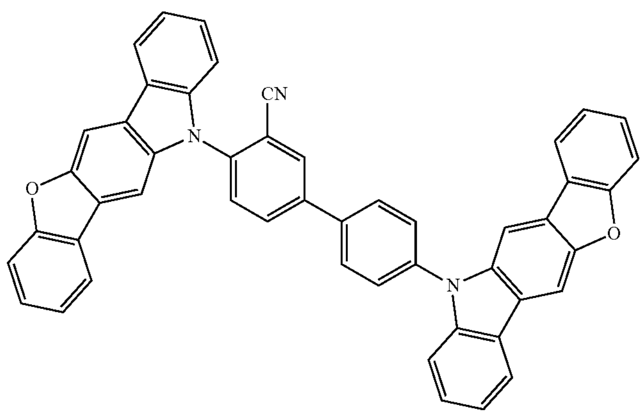
557
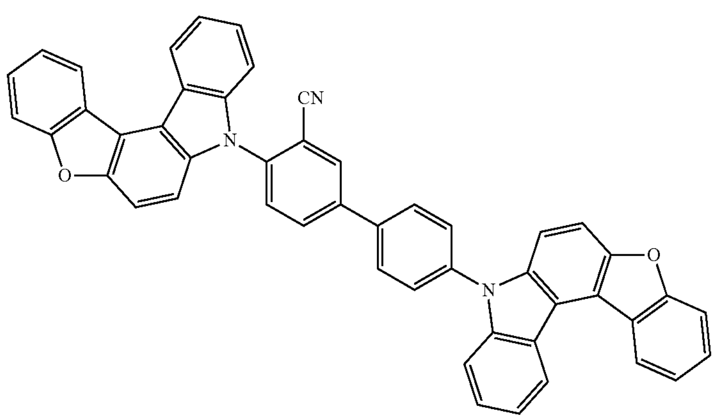

-continued
558
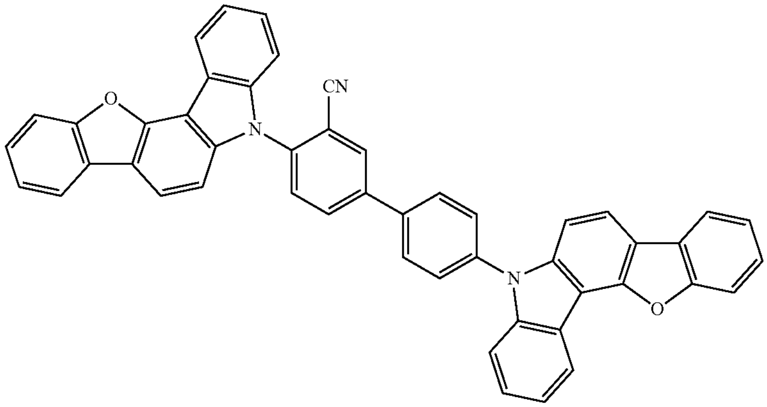
559
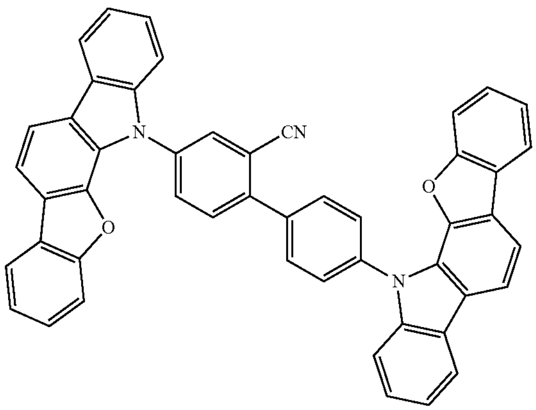
560
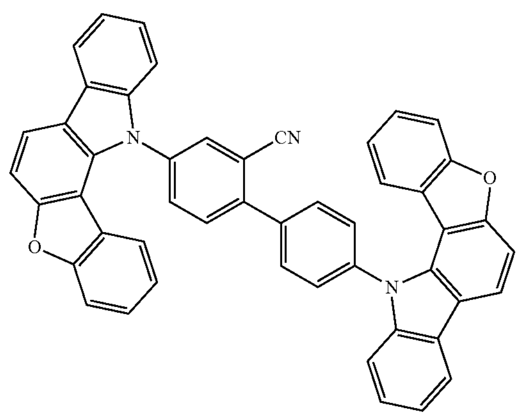
561
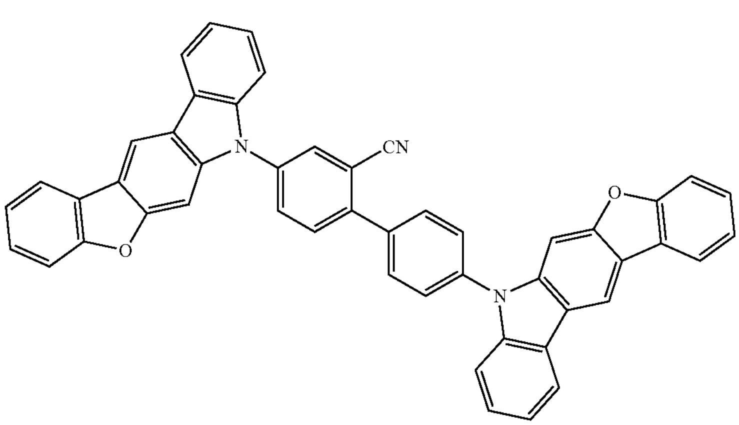

-continued
562
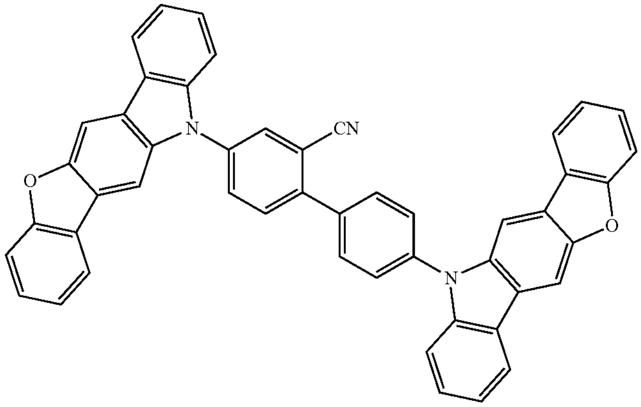
563
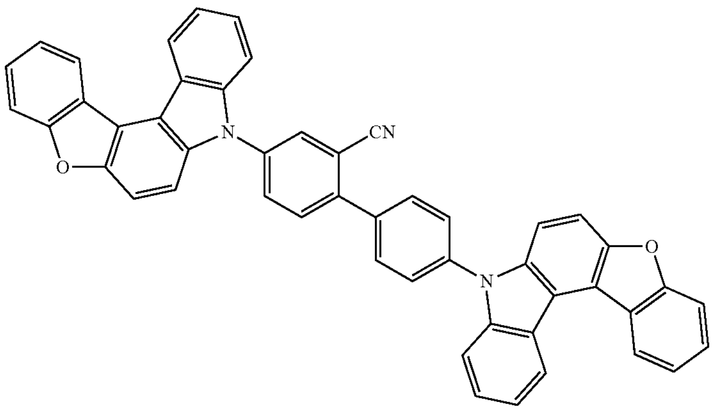
564
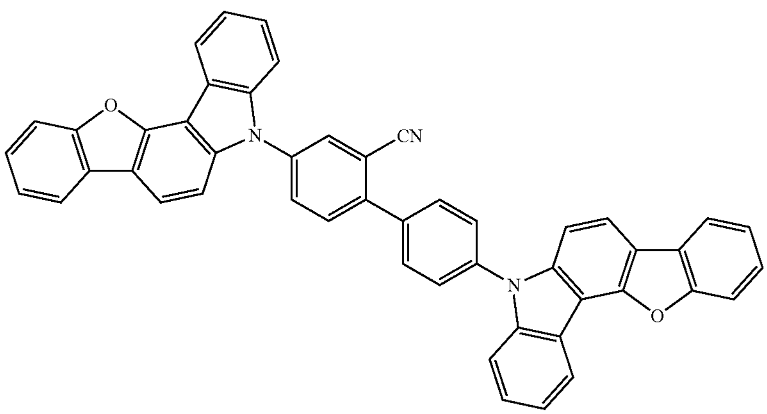
565
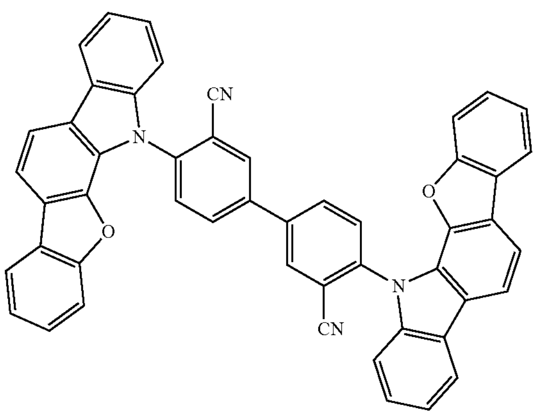

-continued
566
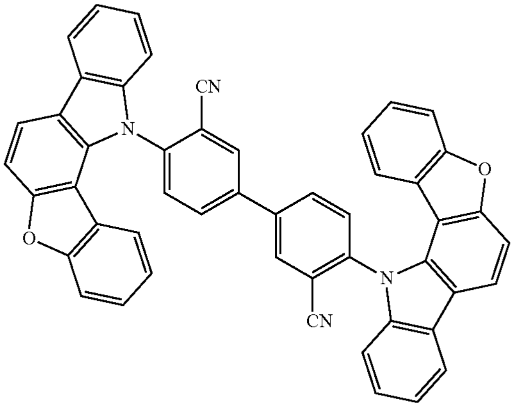
567
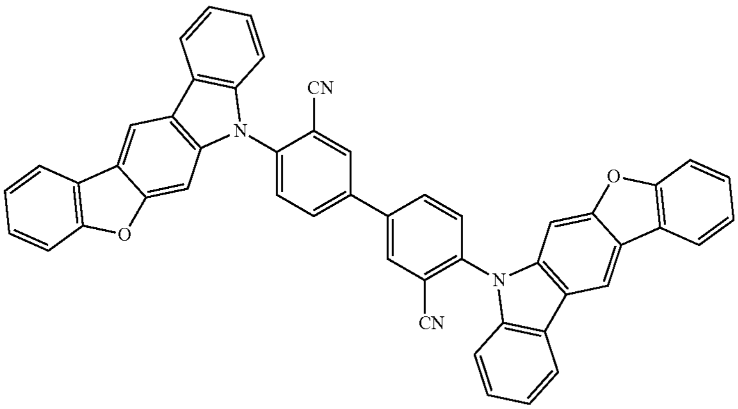
568
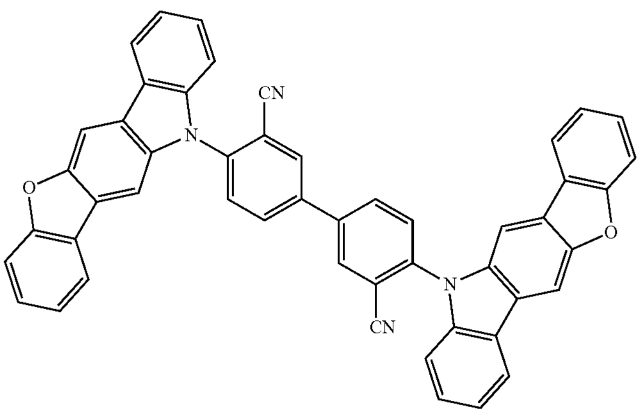
569
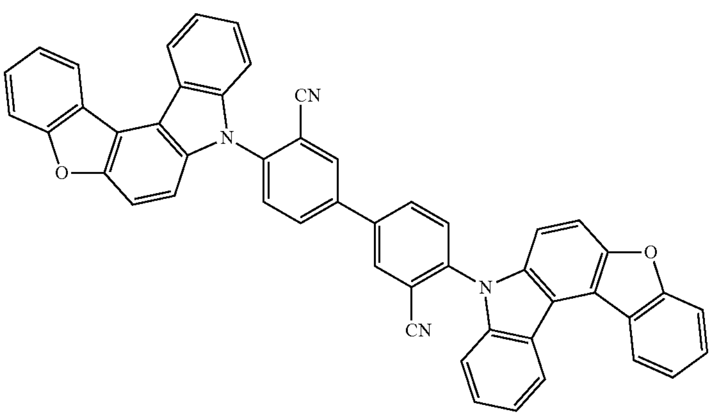

-continued
670
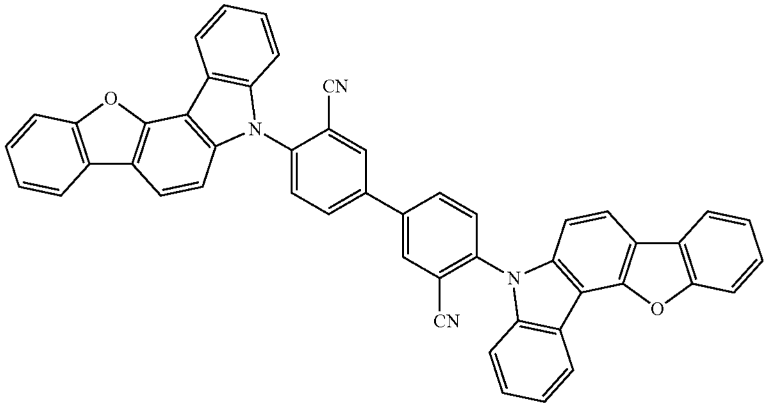
571
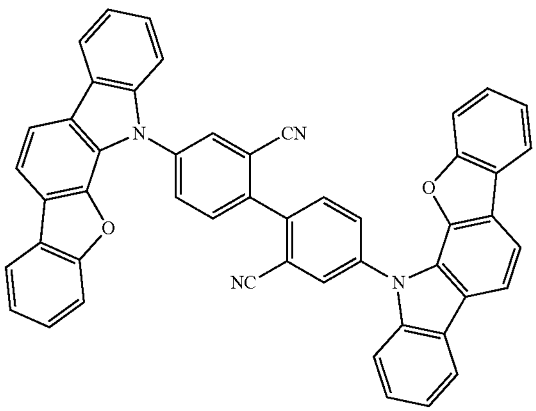
572
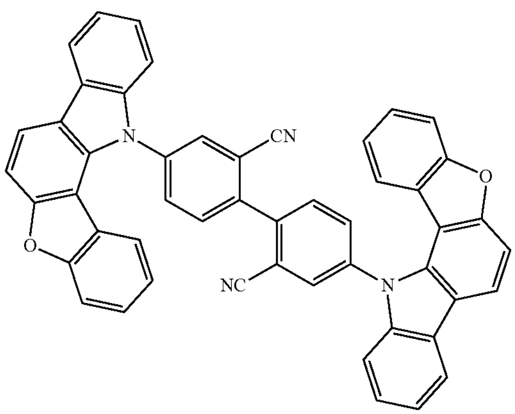
573
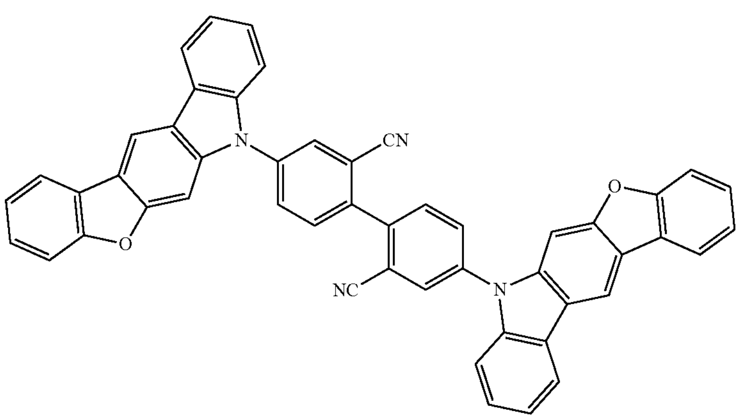

-continued
574
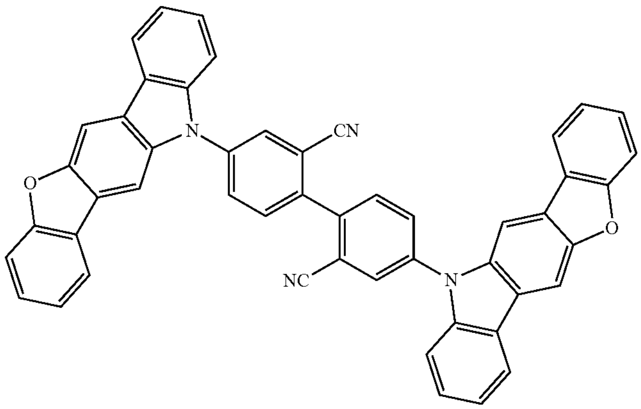
575
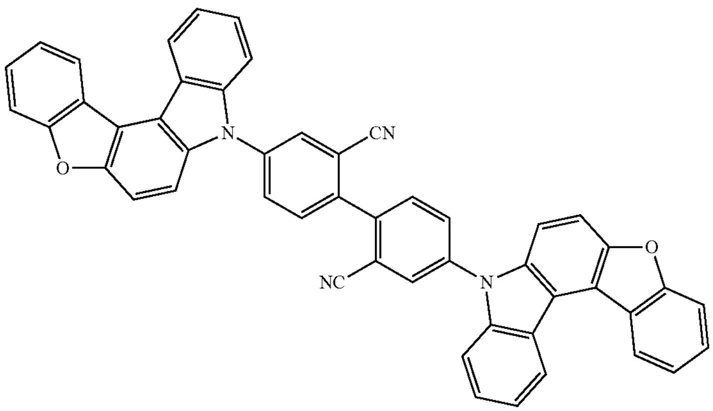
576
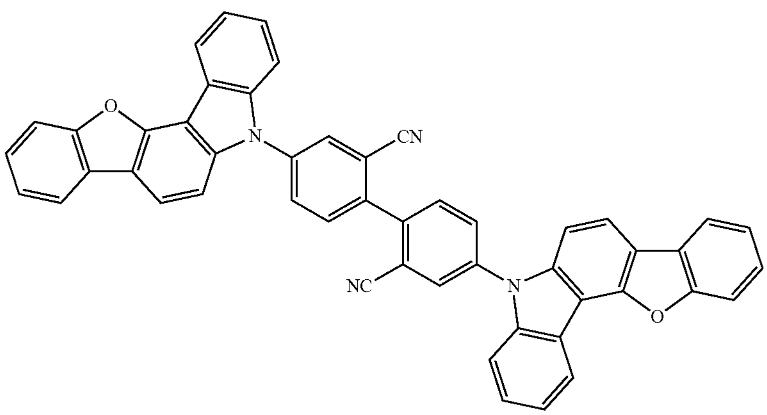
577
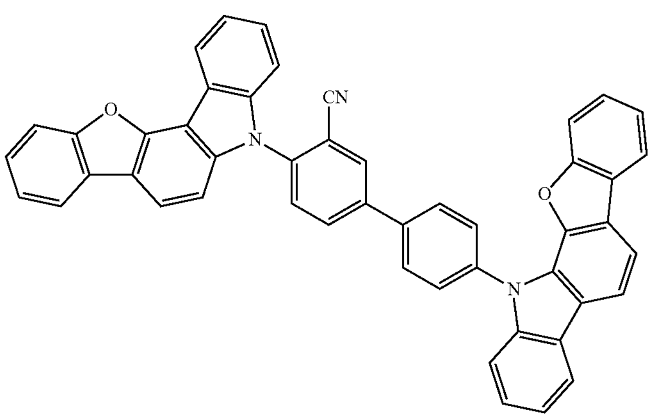

-continued
578
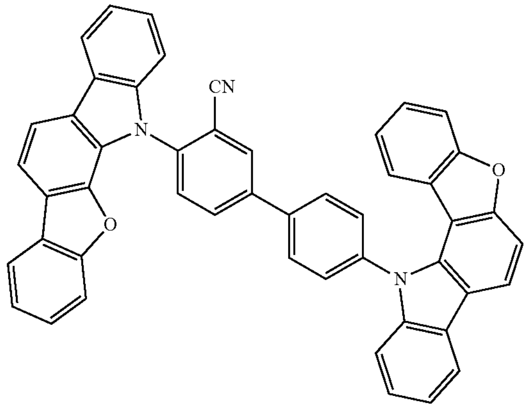
579
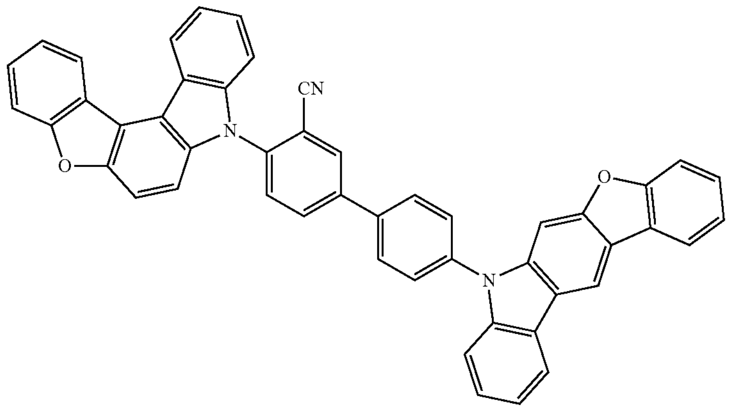
580
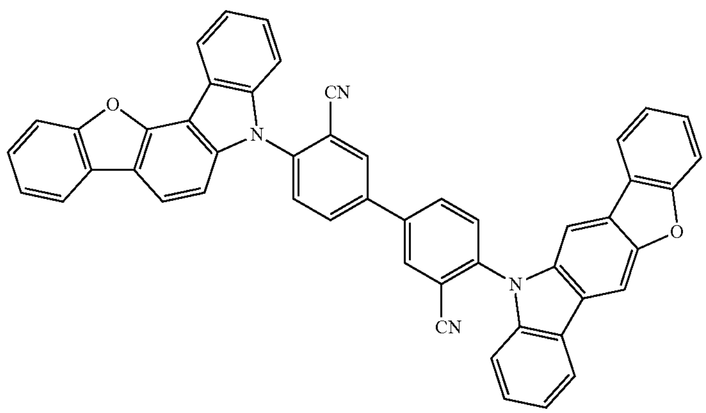
581
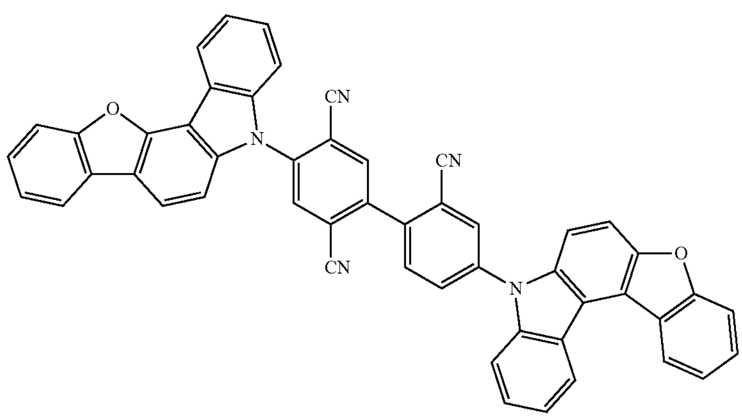

-continued
582
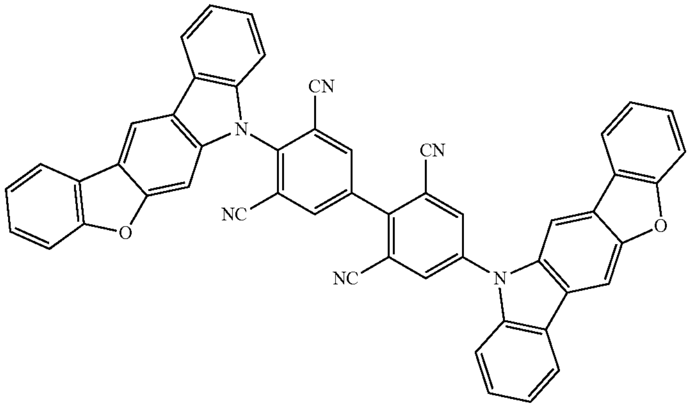
583
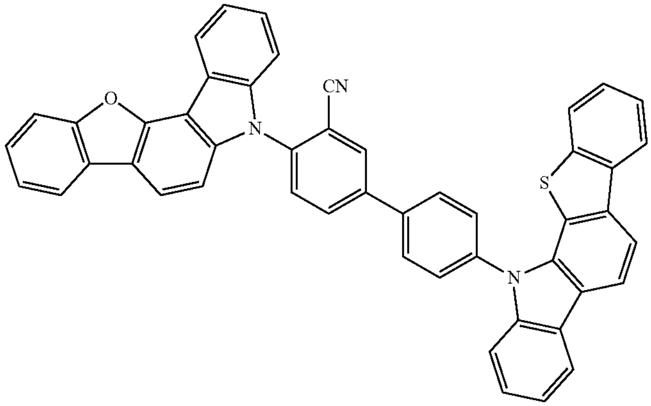
584
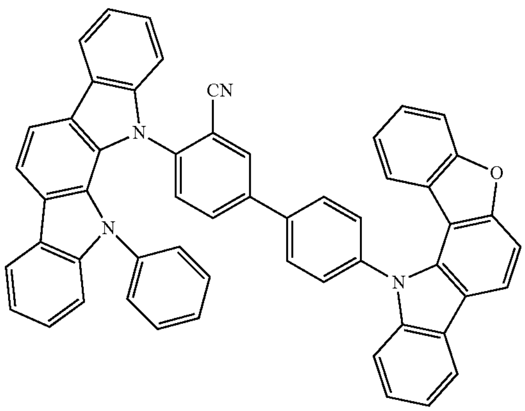
585
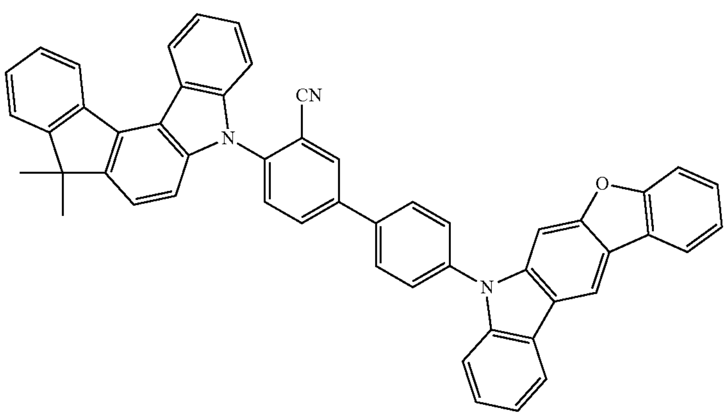

-continued
586
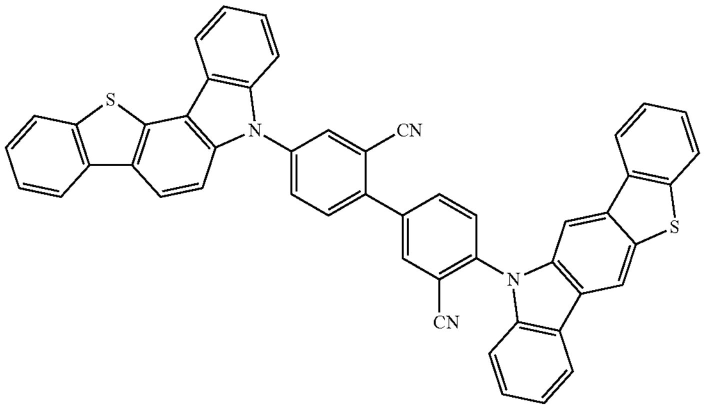
587
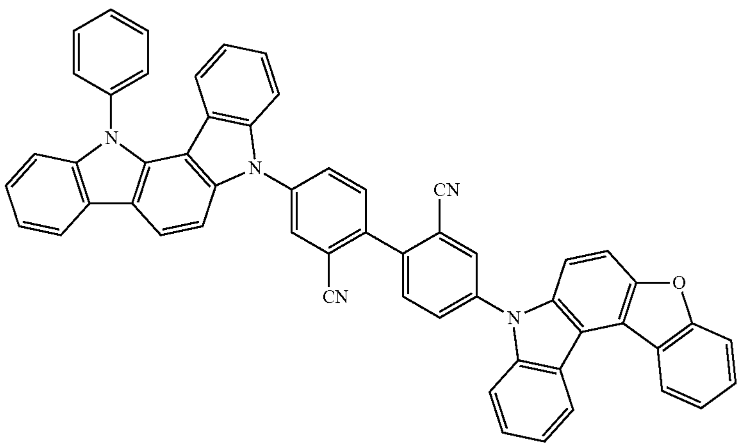
588
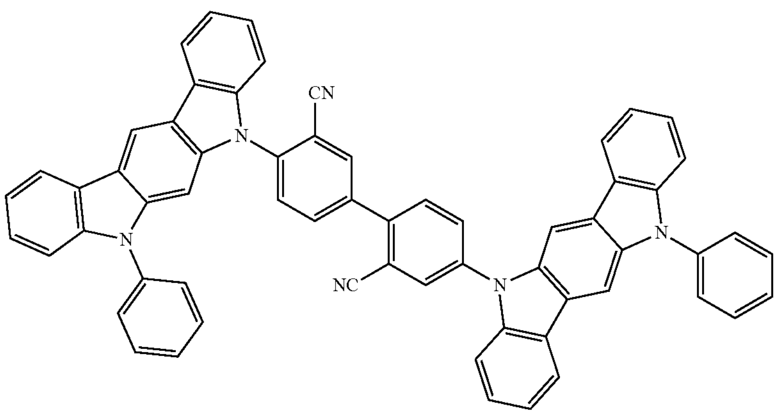
589
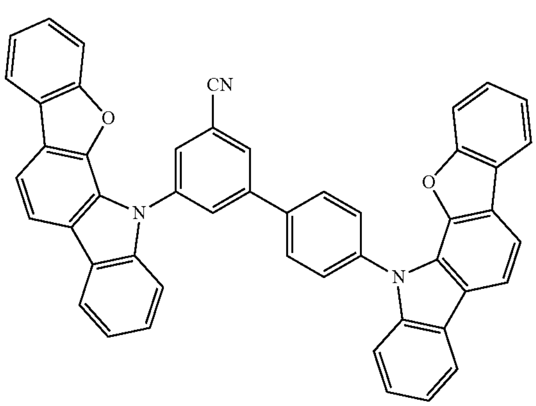

-continued
590
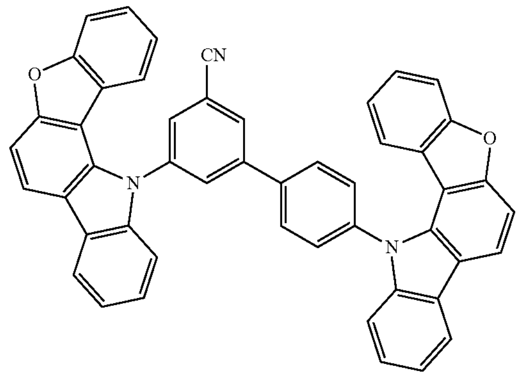
591
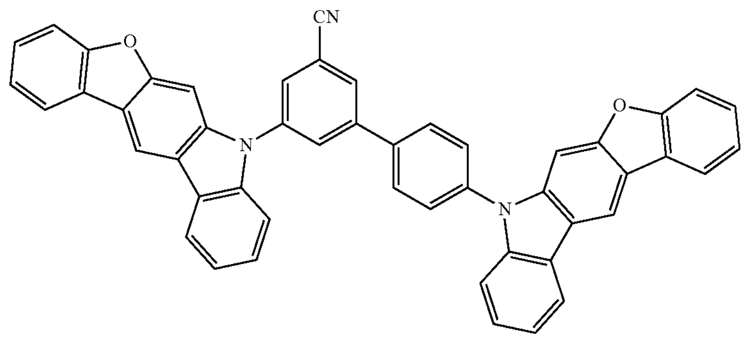
592
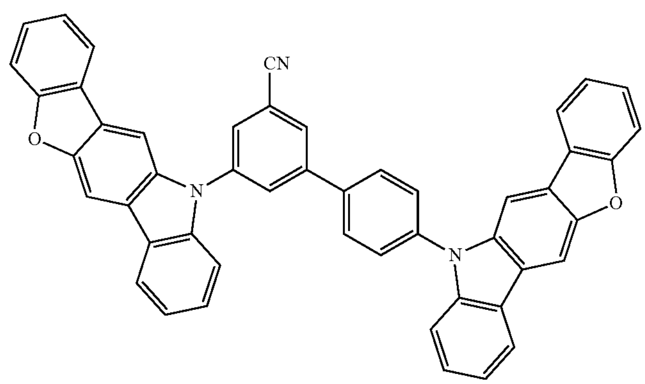
593
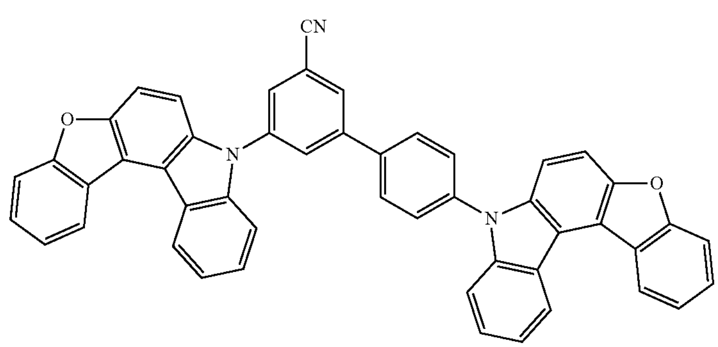

-continued
594
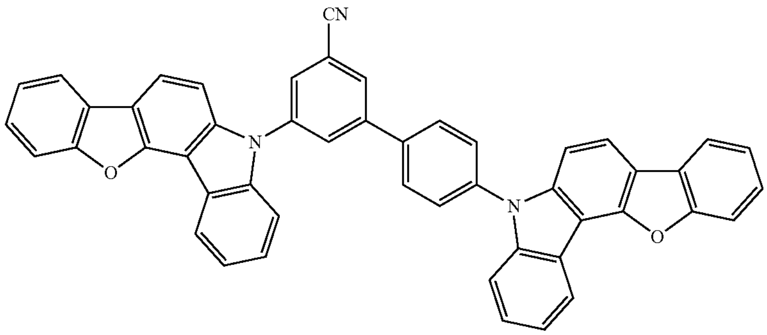
595
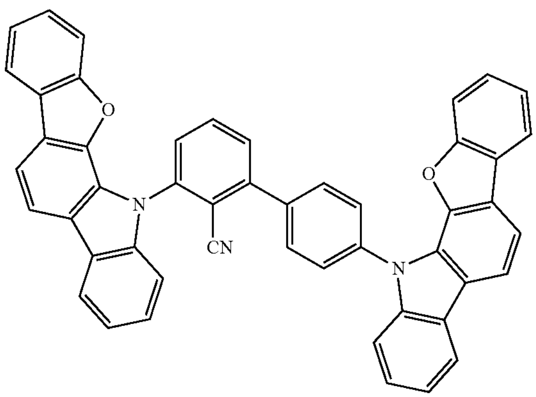
596
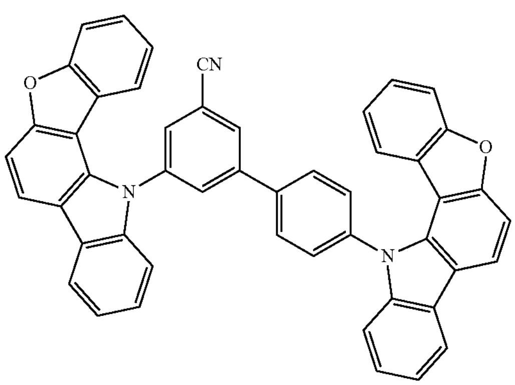
597
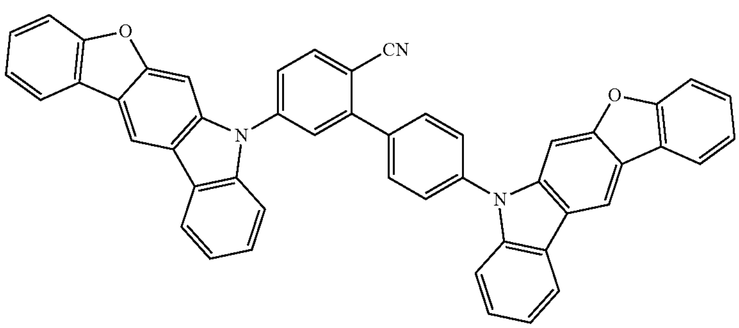

-continued
598
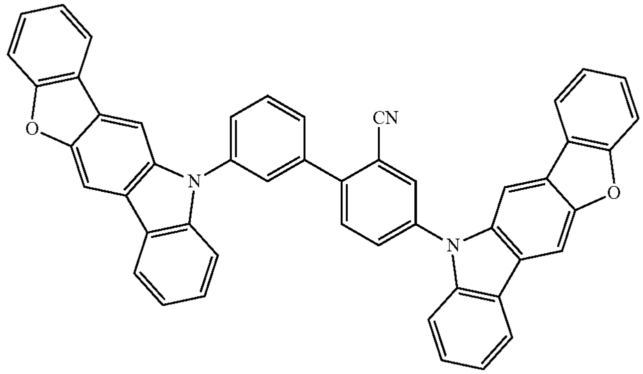
599
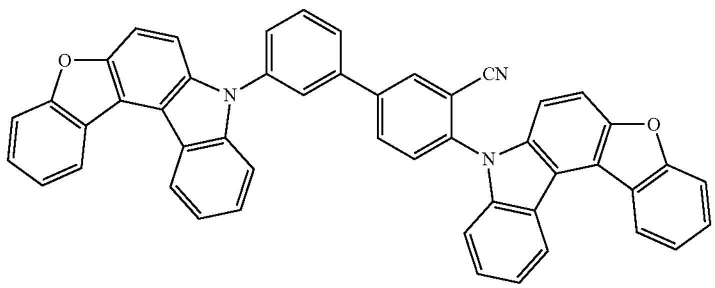
600
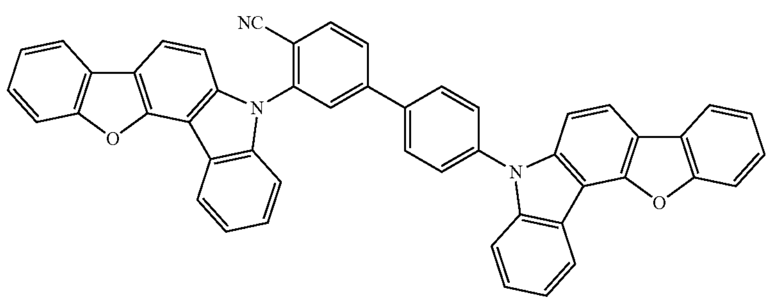
601
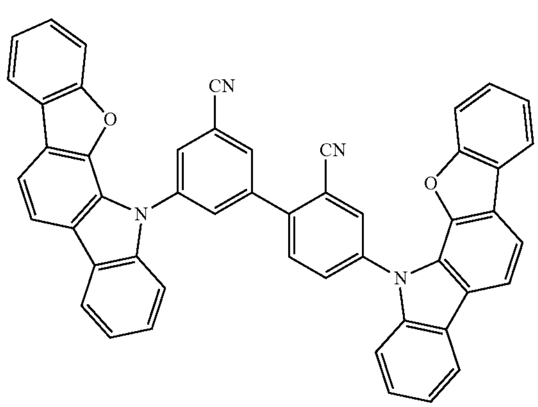

-continued
602
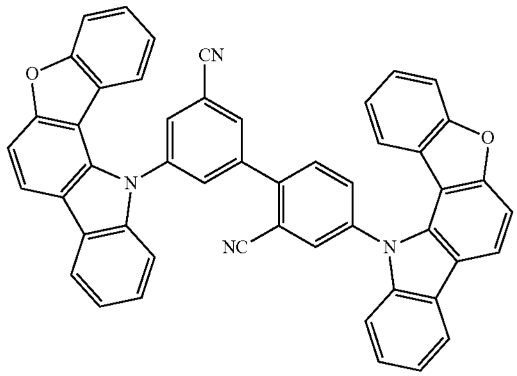
603
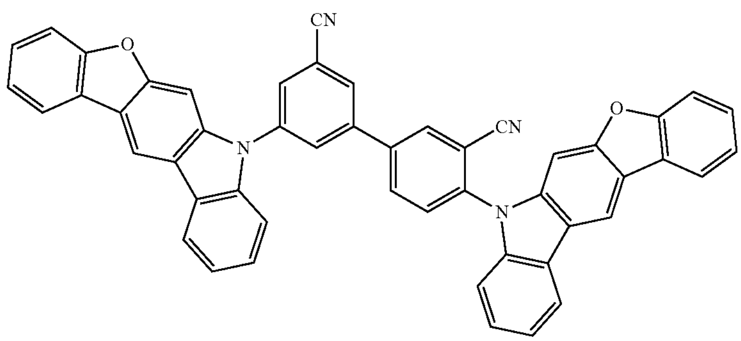
604
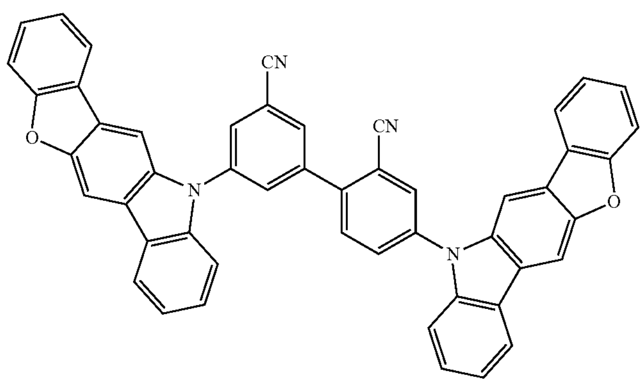
605
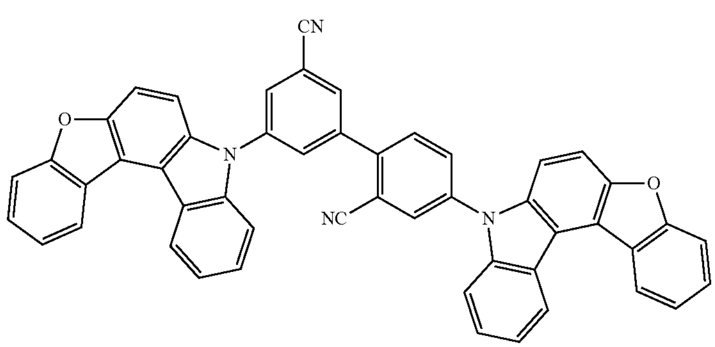

-continued
606
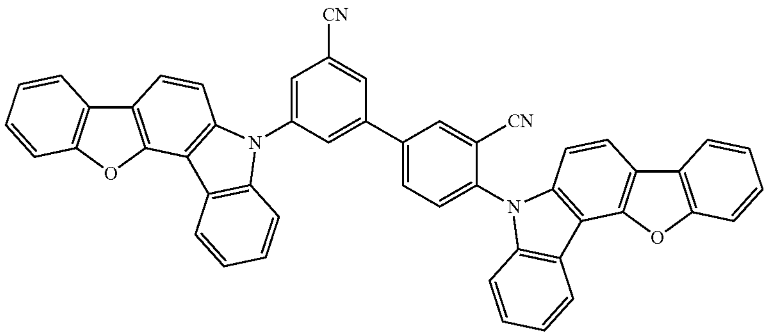
607
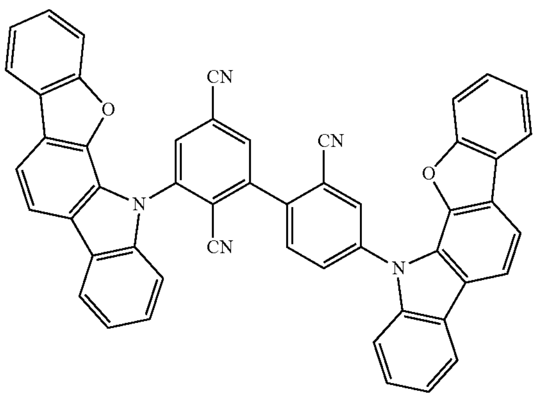
608
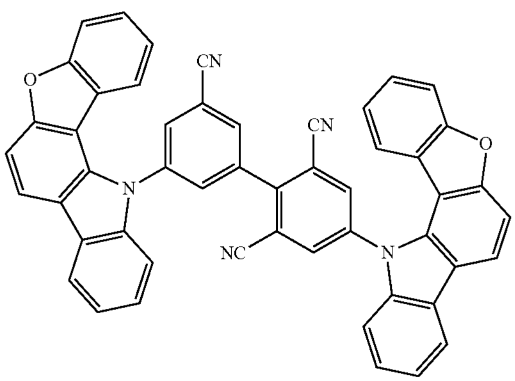
609
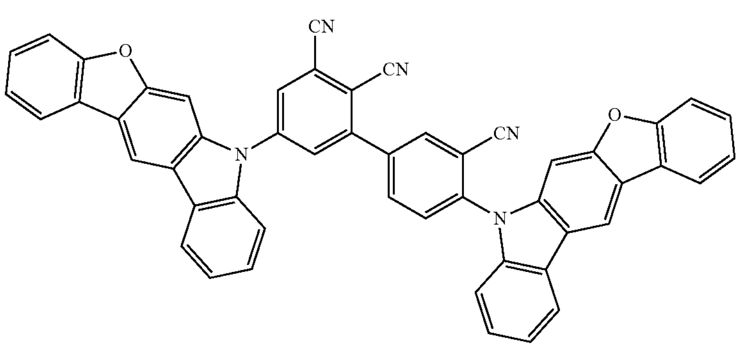

-continued
610
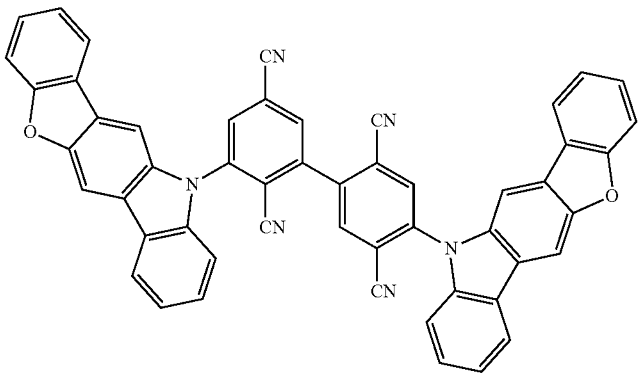
611
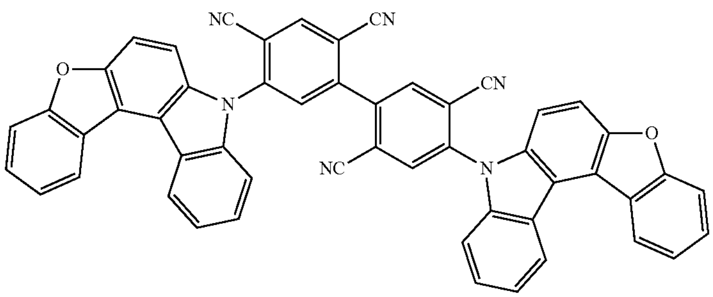
612
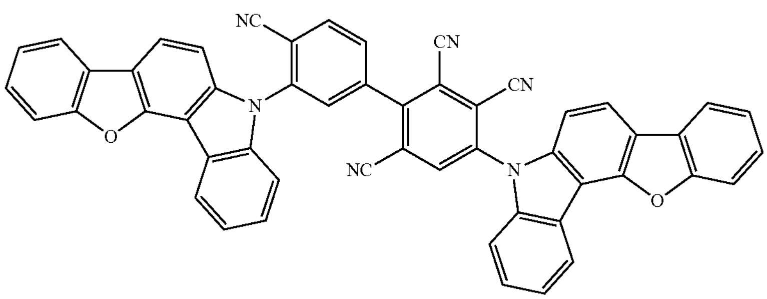
613
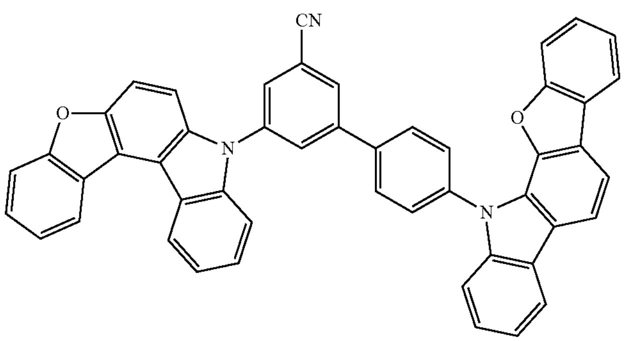

-continued
614
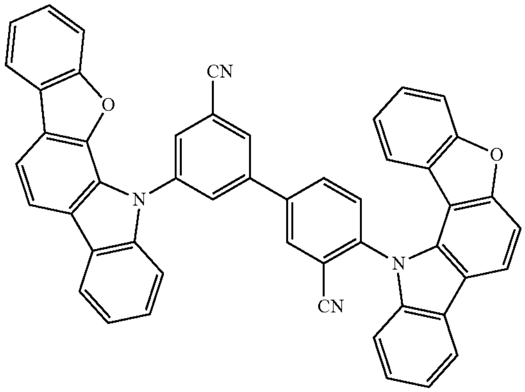
615
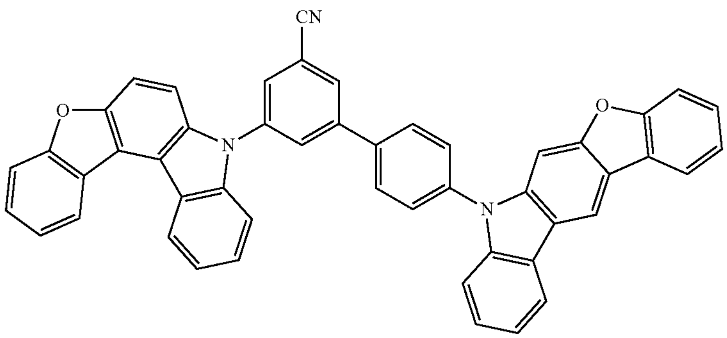
616
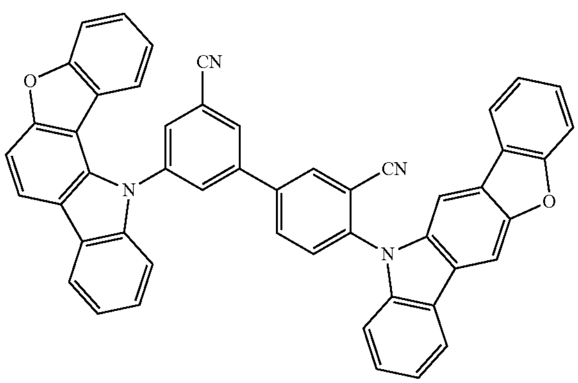
617
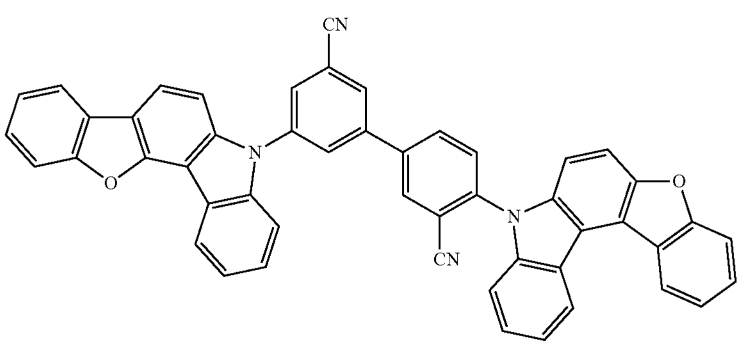

-continued
618
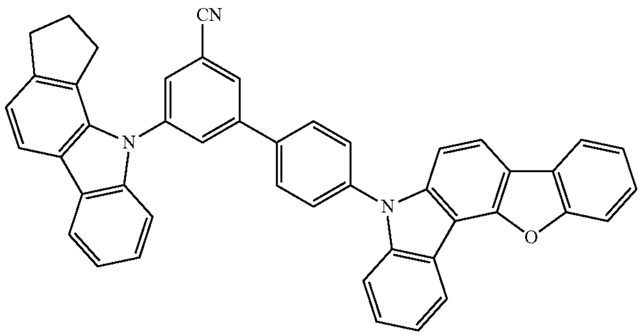
619
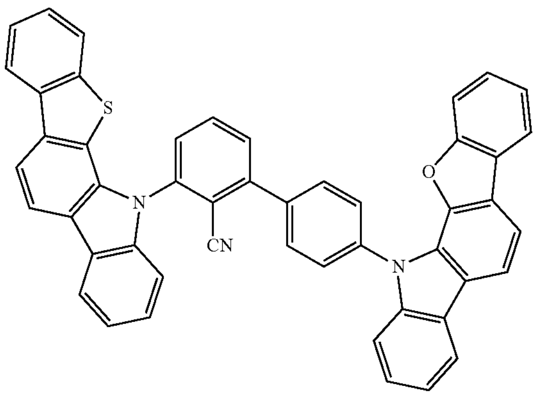
620
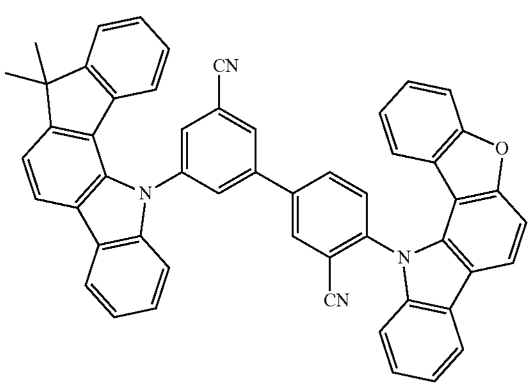
621
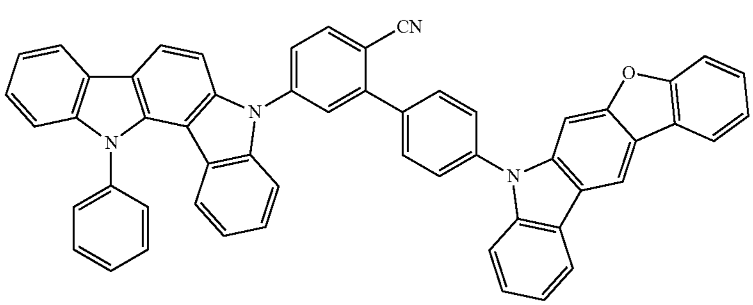

-continued
622
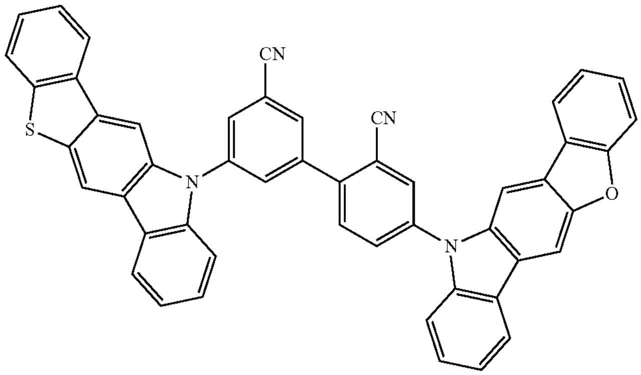
623
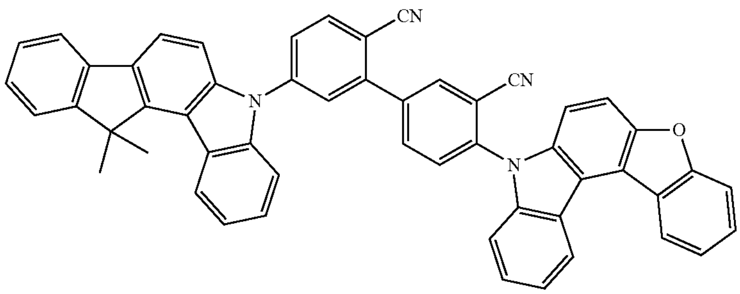
624
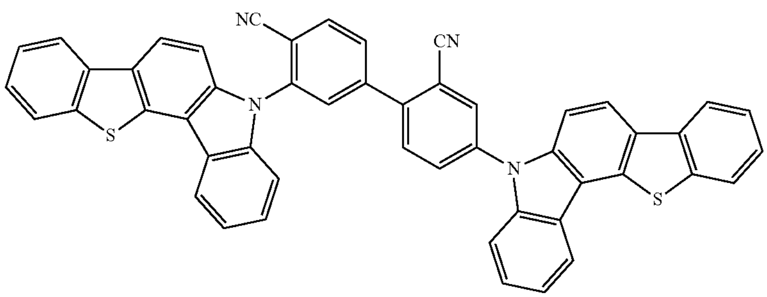
625
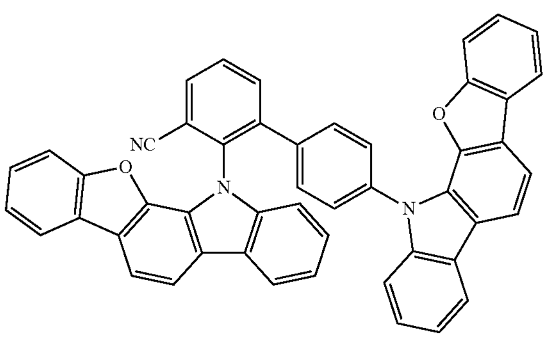
626
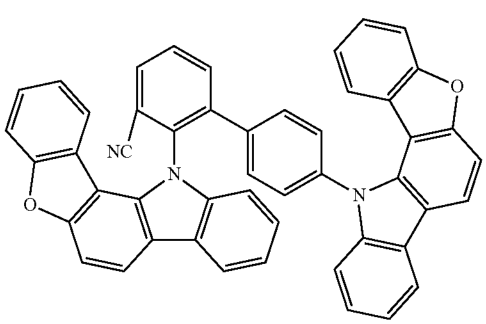

-continued
627
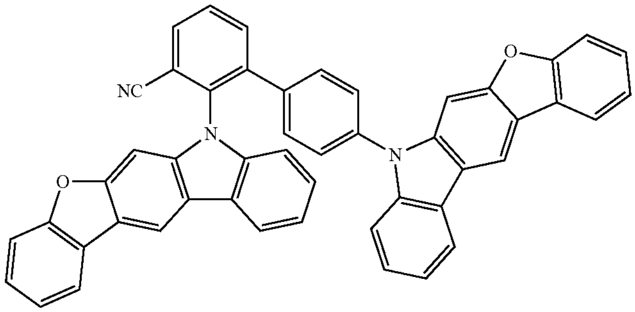
628
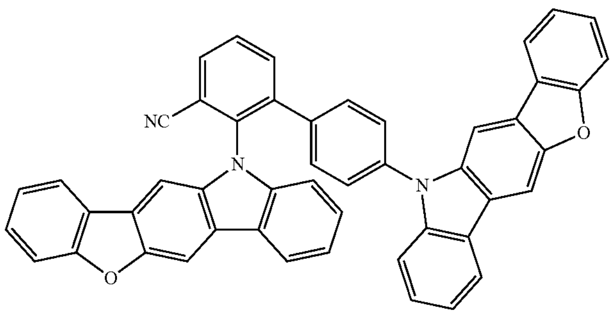
629
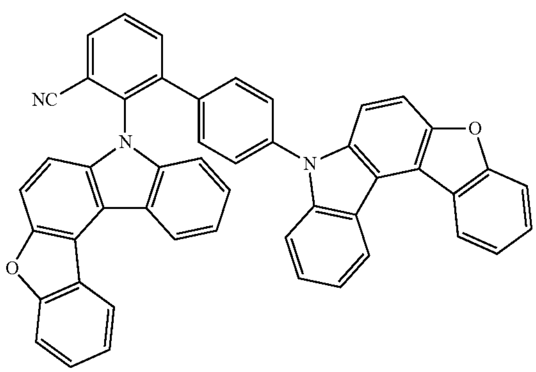
630
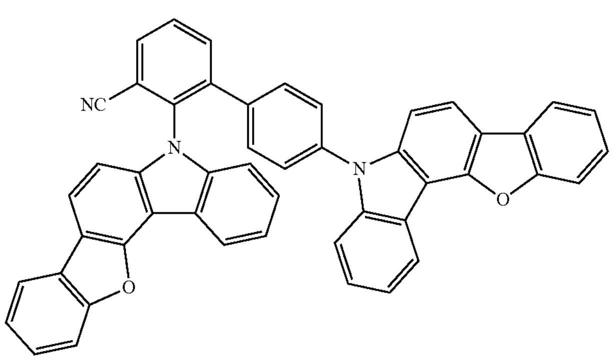

-continued
631
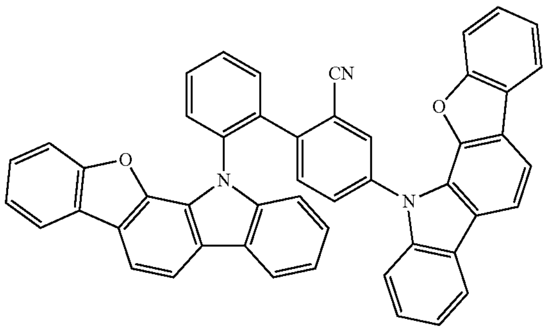
632
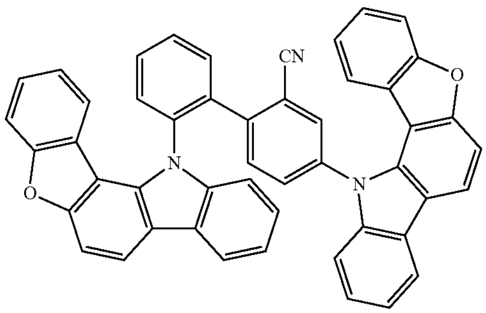
633
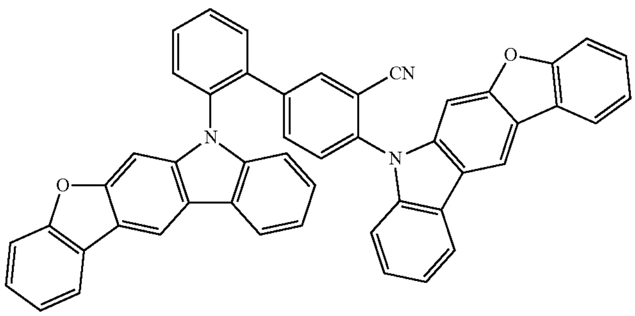
634
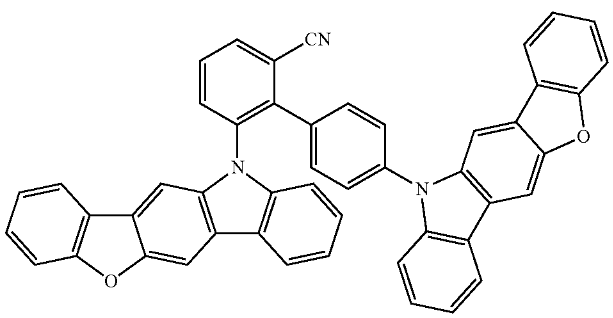
635
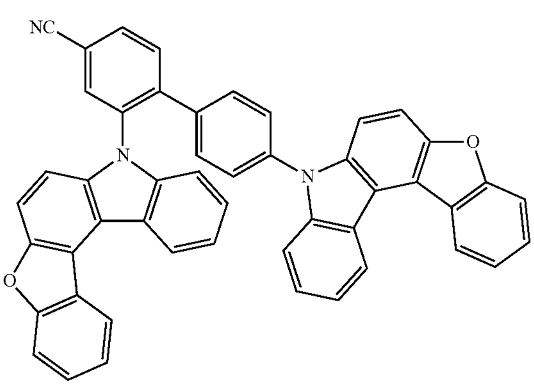

-continued
636
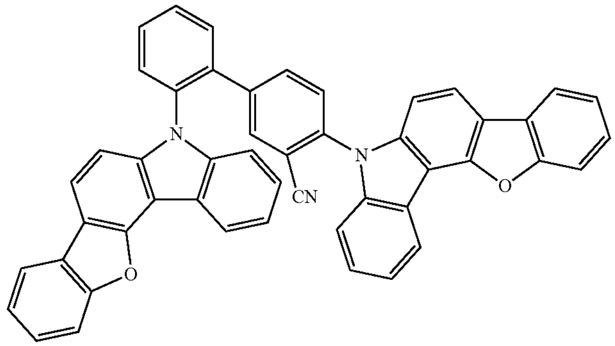
637
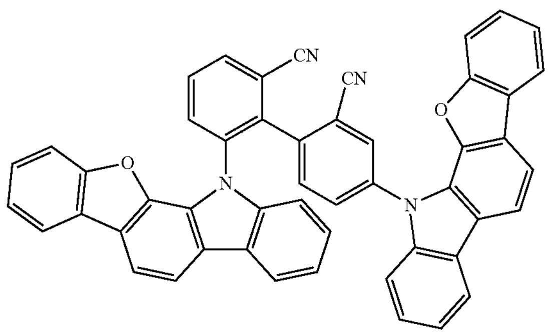
638
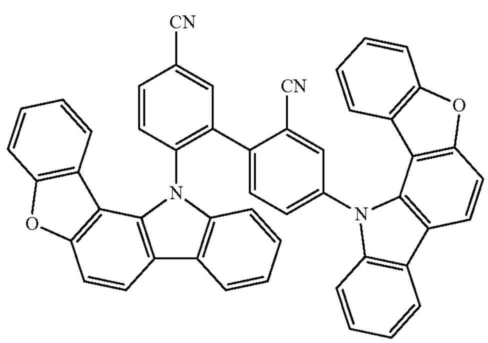
639
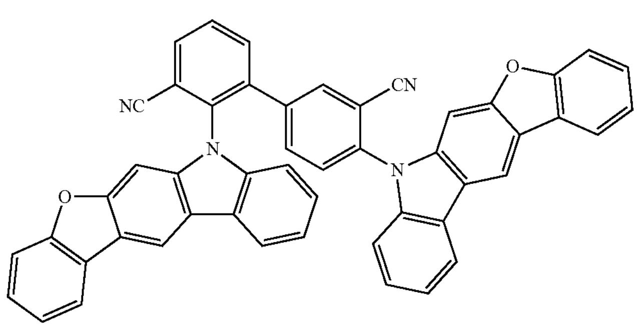

-continued
640
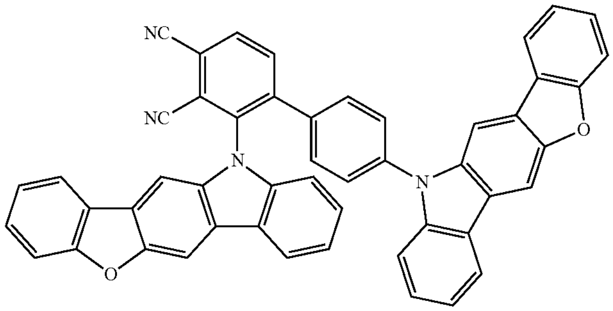
641
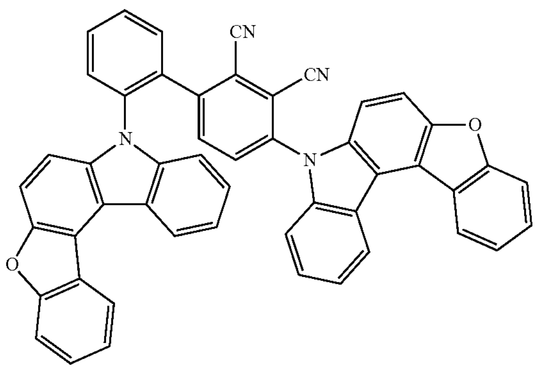
642
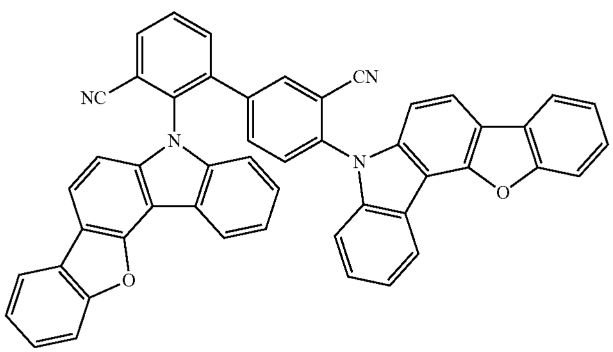
643
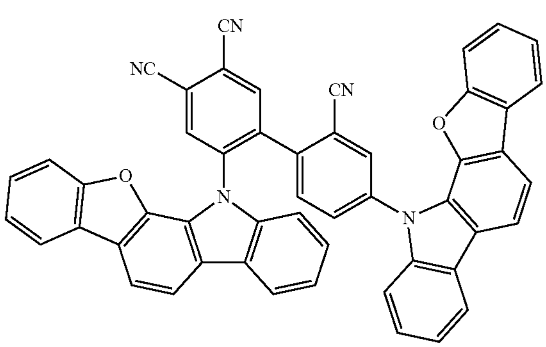

-continued
644
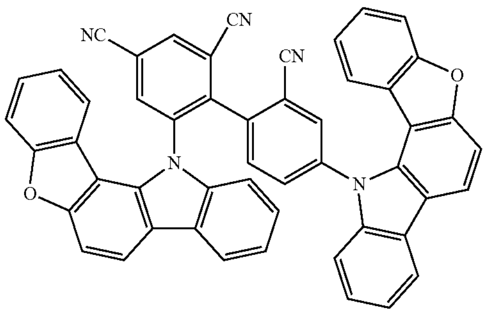
645
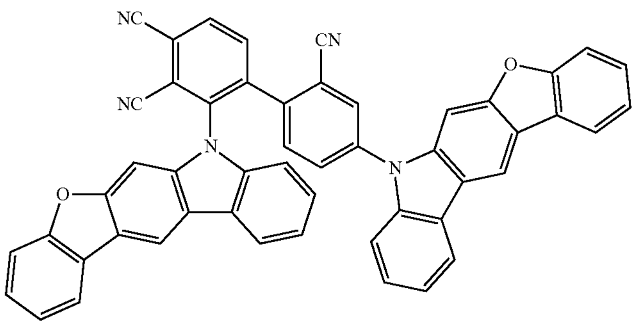
646
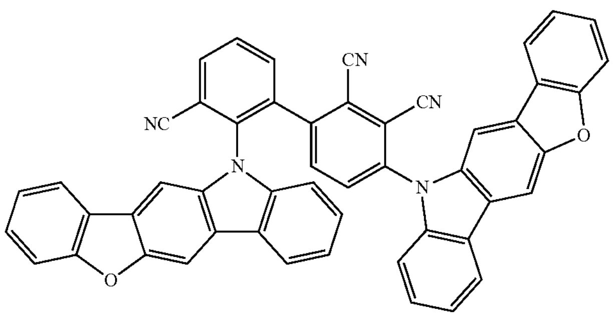
647
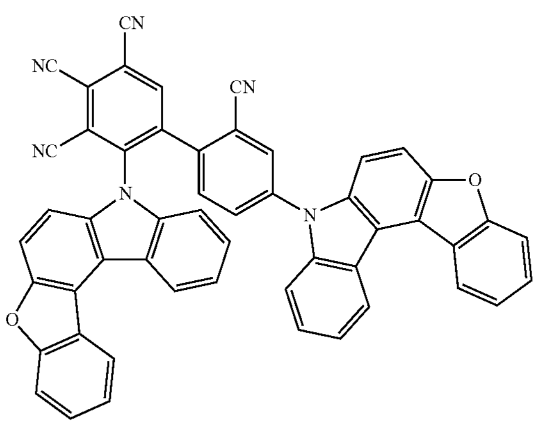

-continued
648
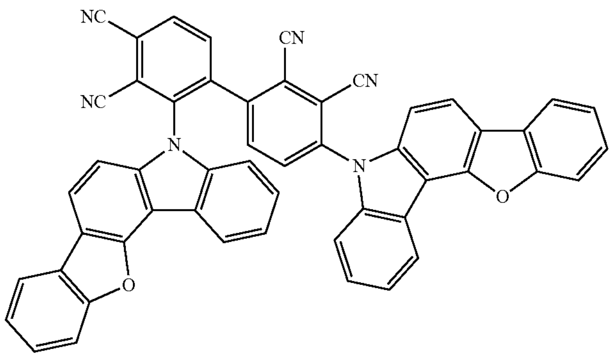
649
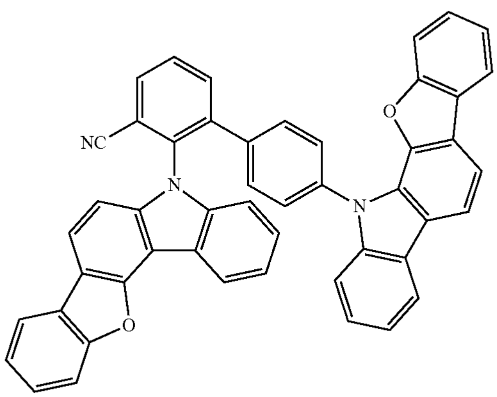
650
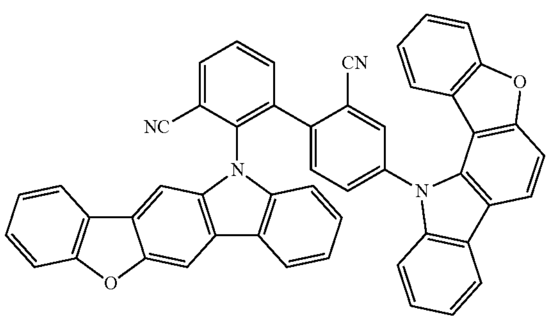
651
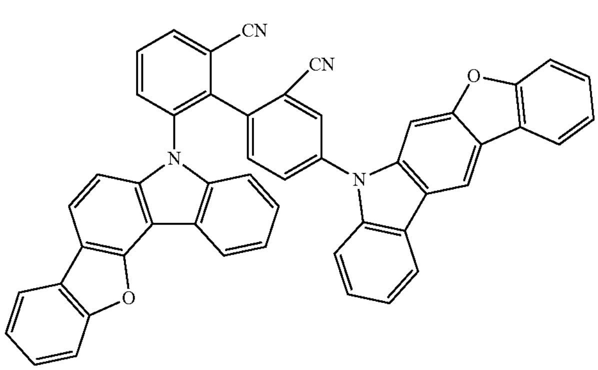

-continued
652
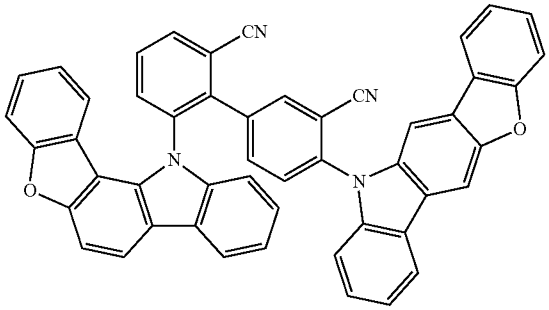
653
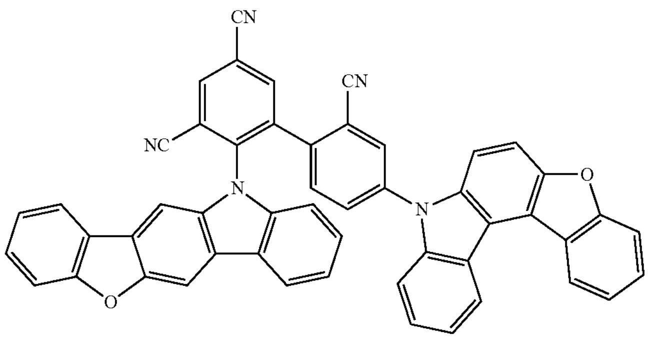
654
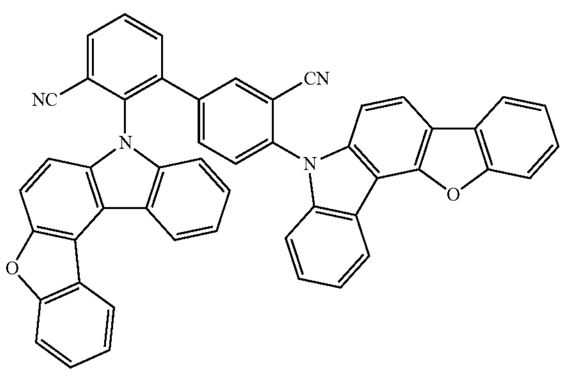
655
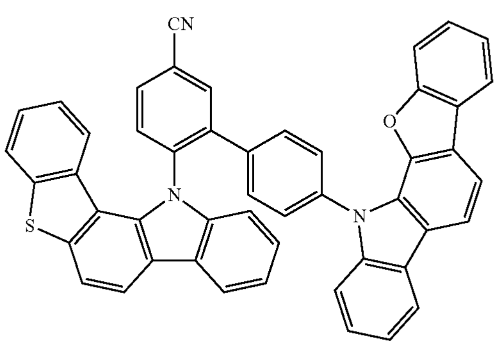

-continued
656
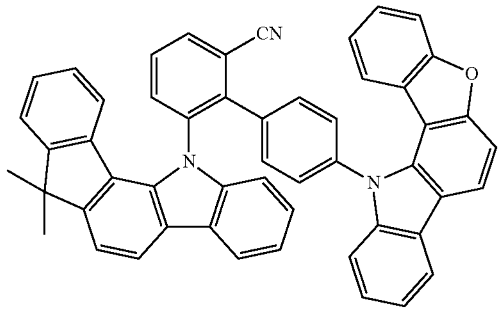
657
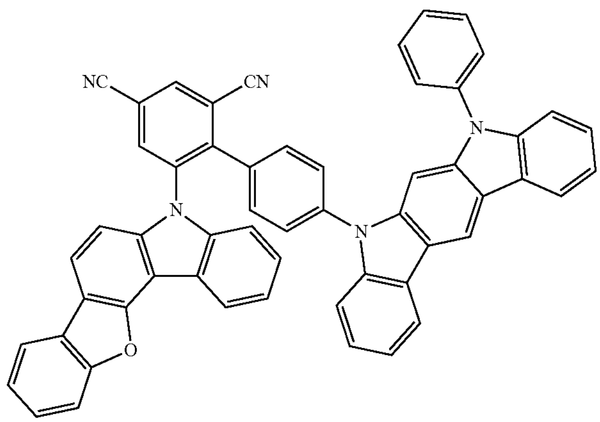
658
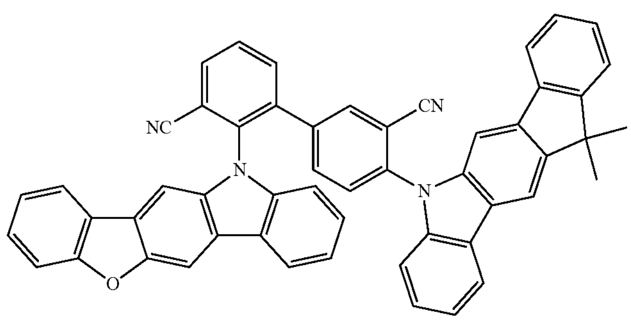
659
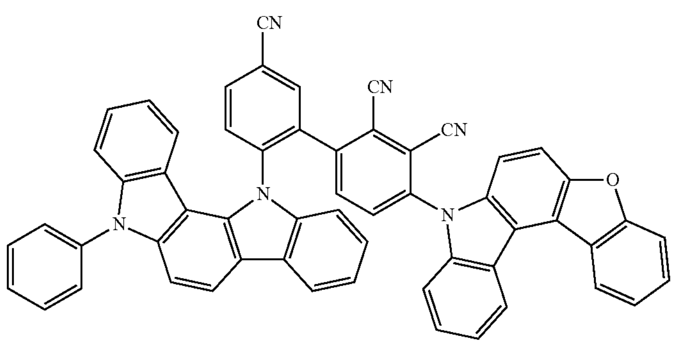

-continued
660
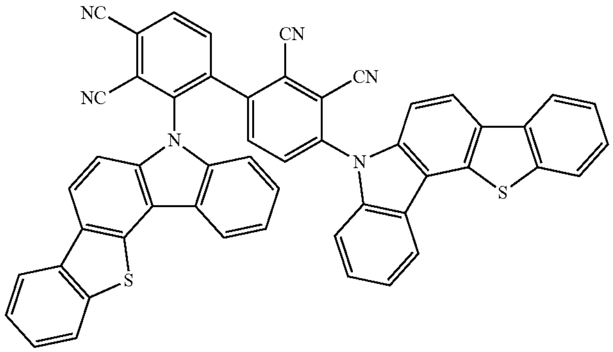
661
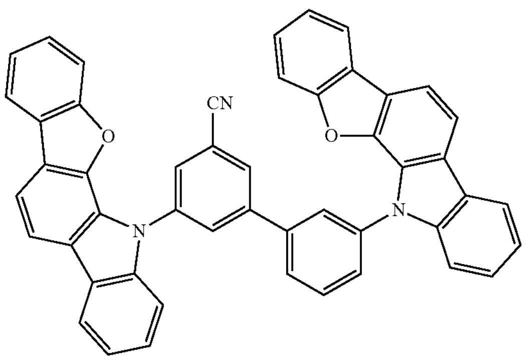
662
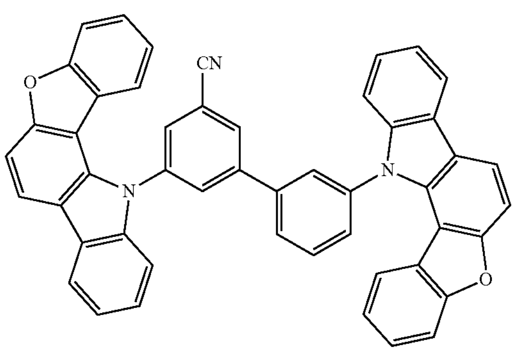
663
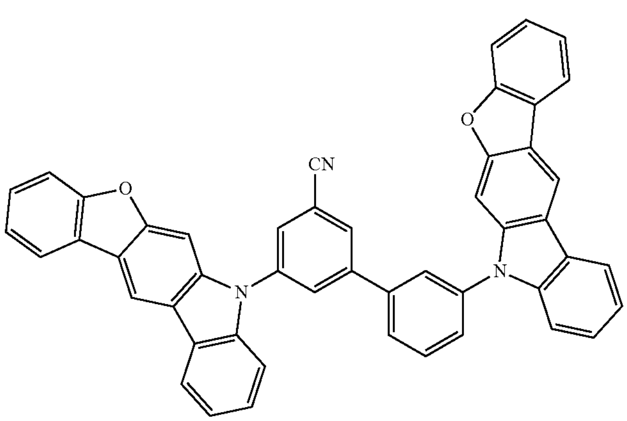

-continued
664
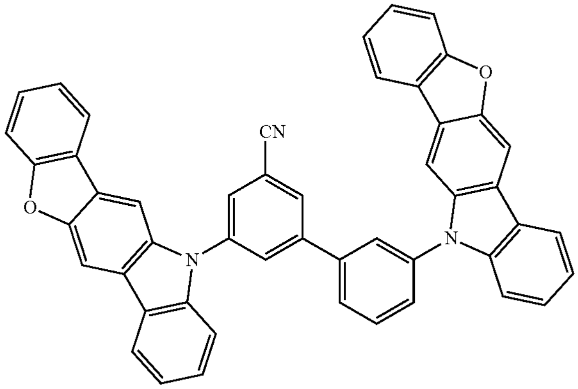
665
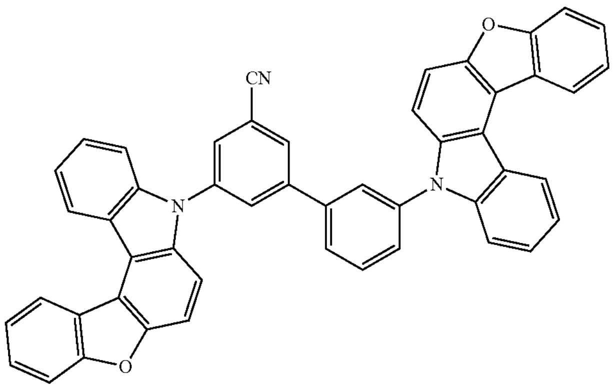
666
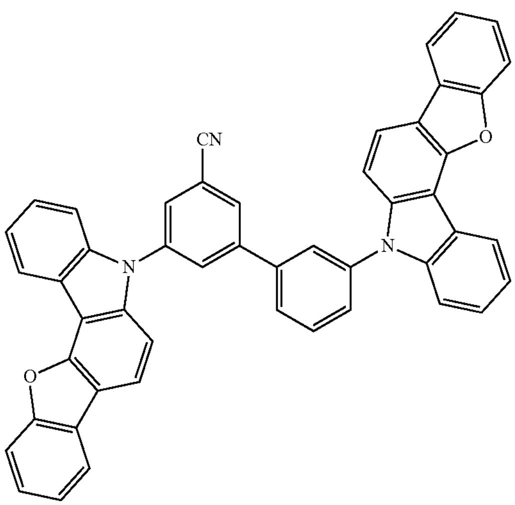
667
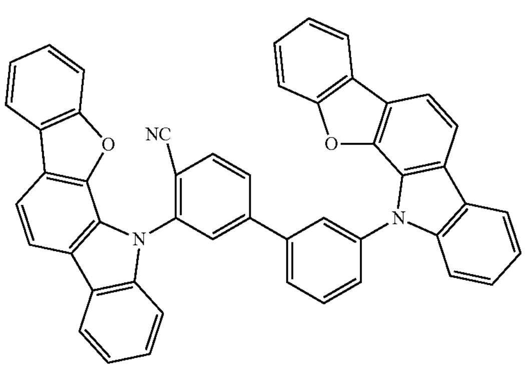

-continued
668
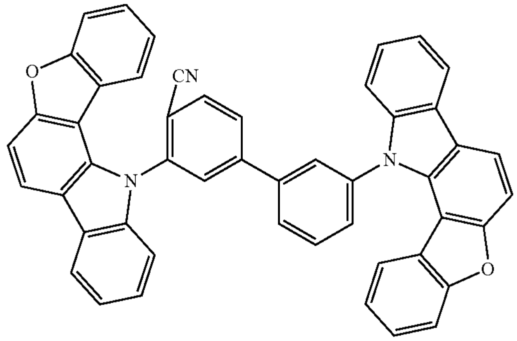
669
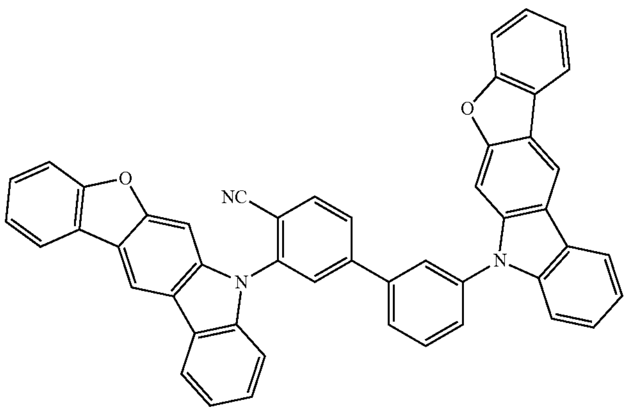
670
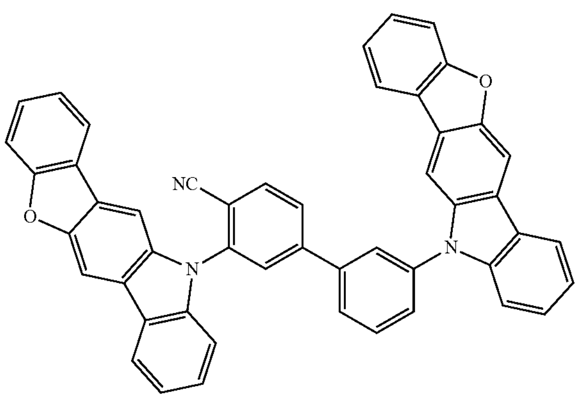
671
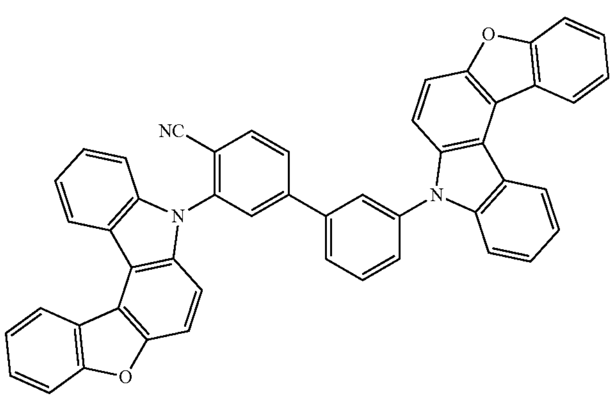

-continued
672
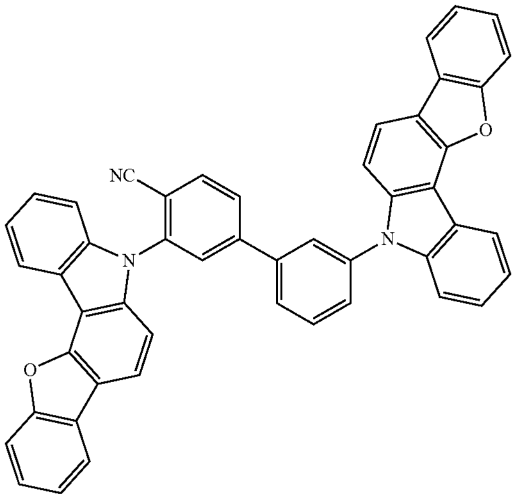
673
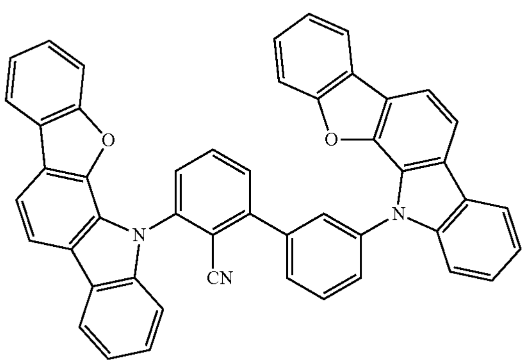
674
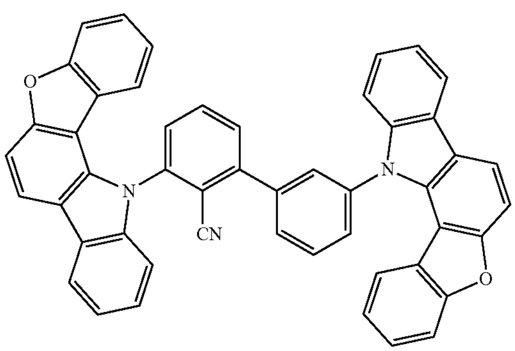
675
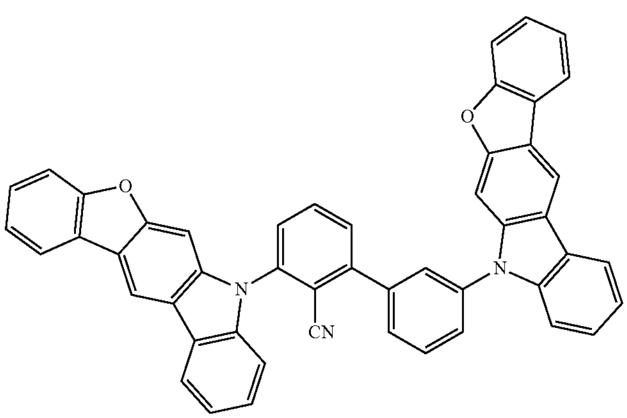

-continued
676
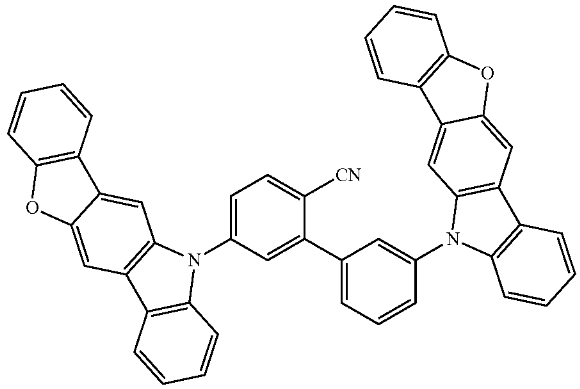
677
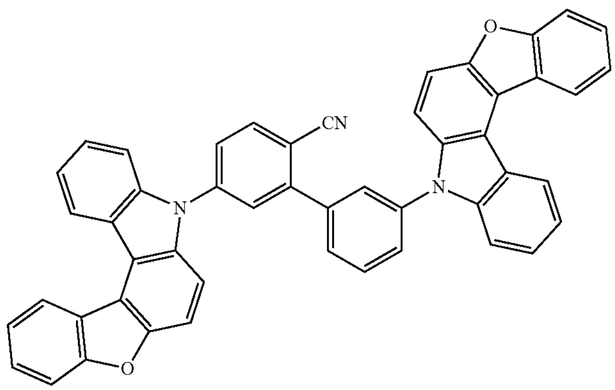
678
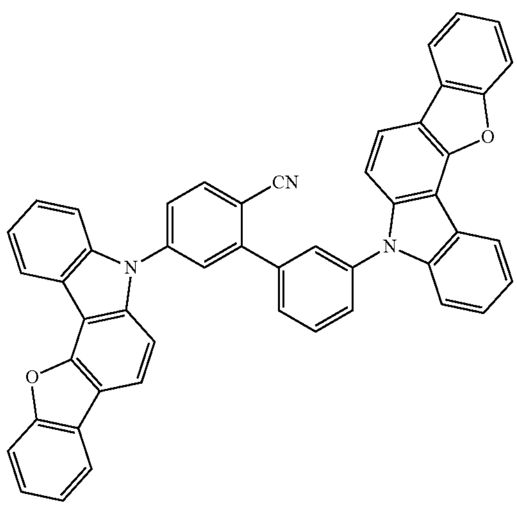
679
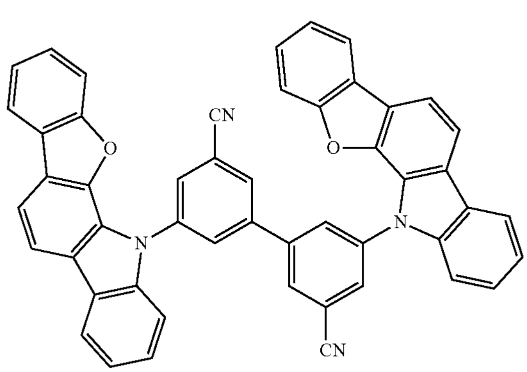

-continued
680
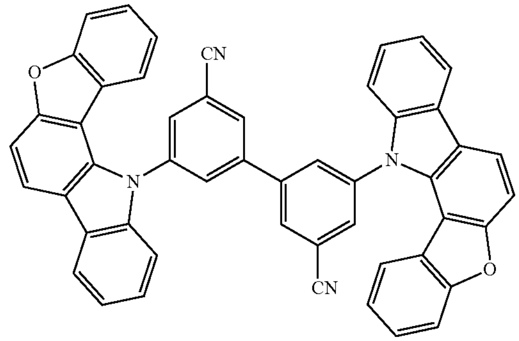
681
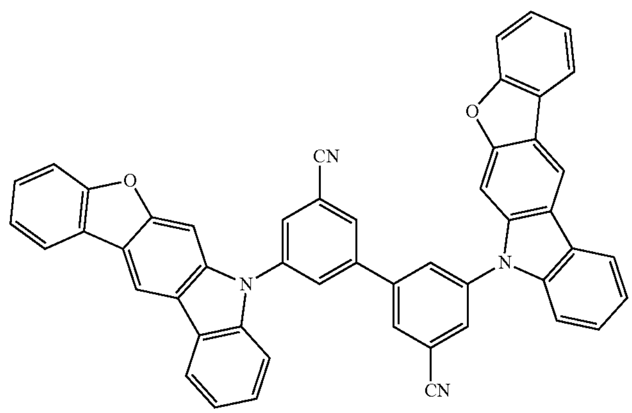
682
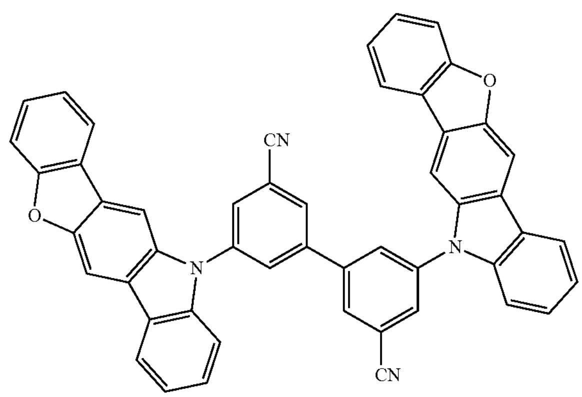
683
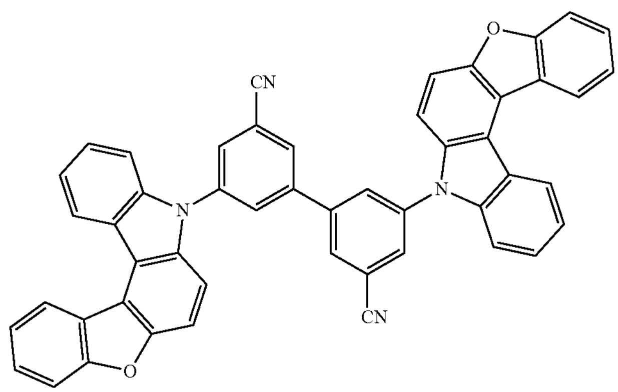

-continued
684
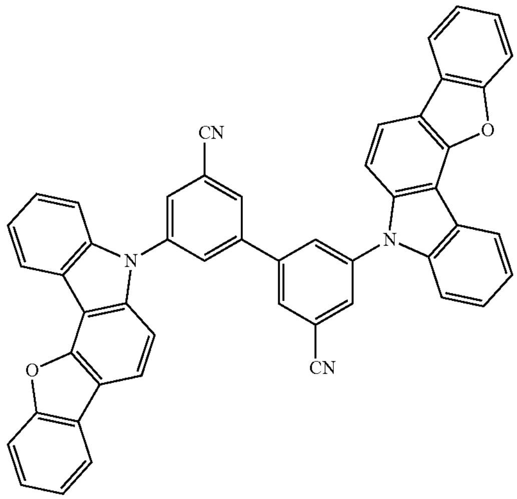
685
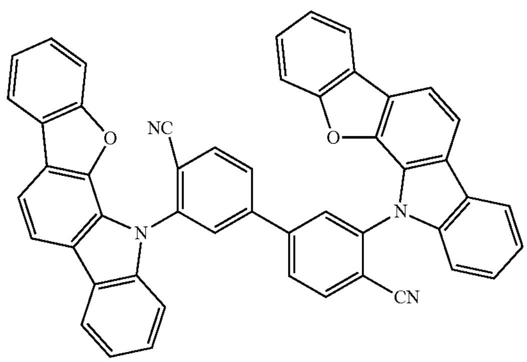
686
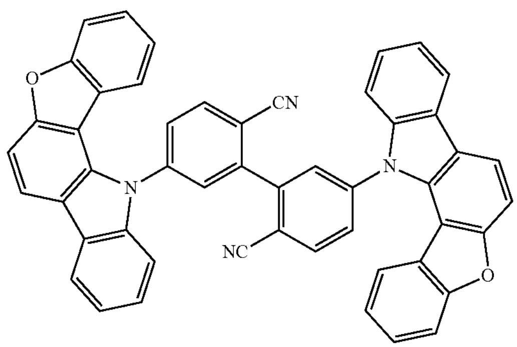
687
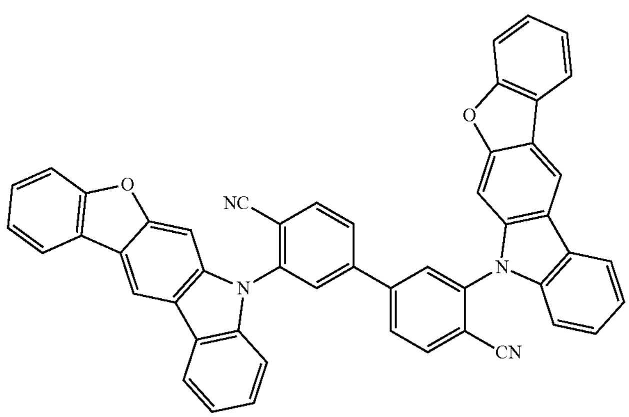

-continued
688
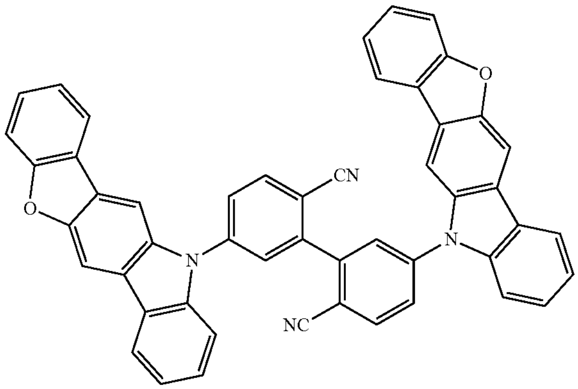
689
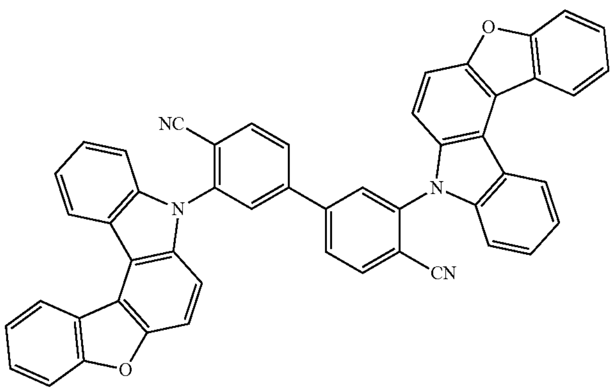
690
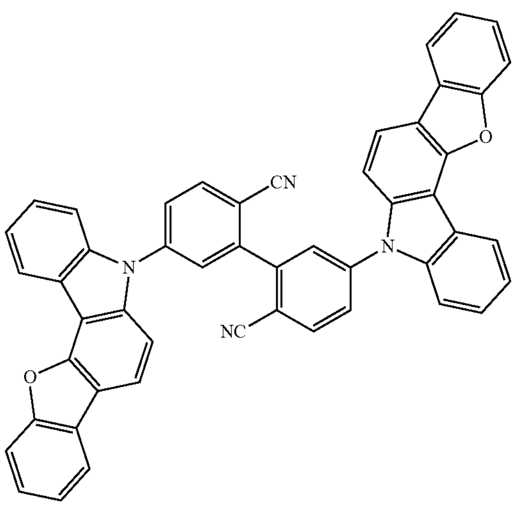
691
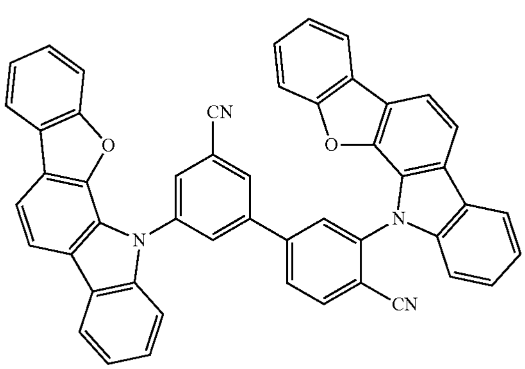

-continued
692
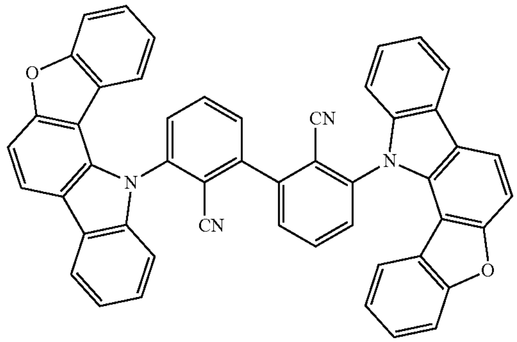
693
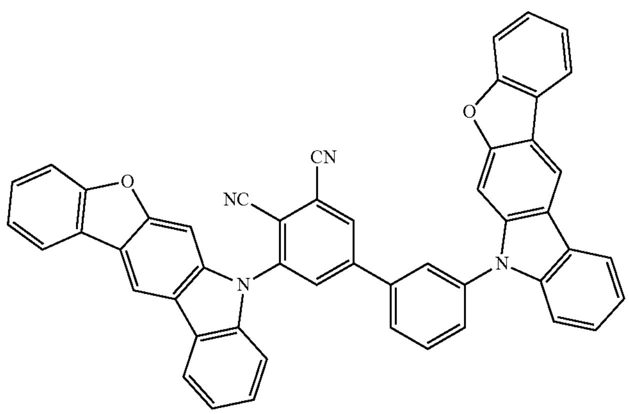
694
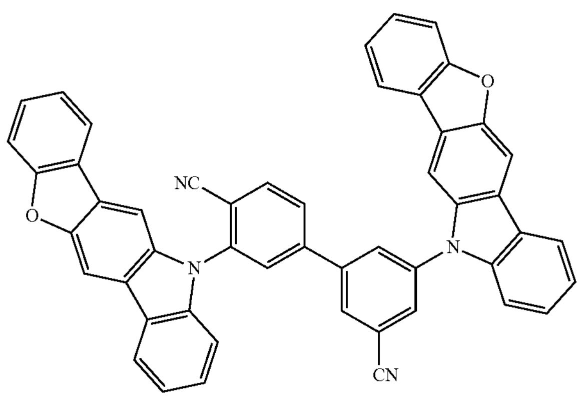
695
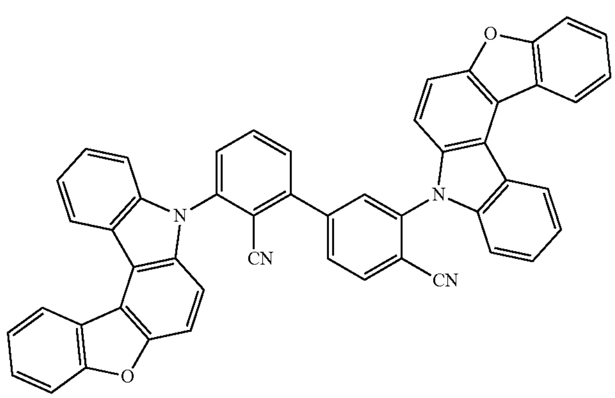

-continued
696
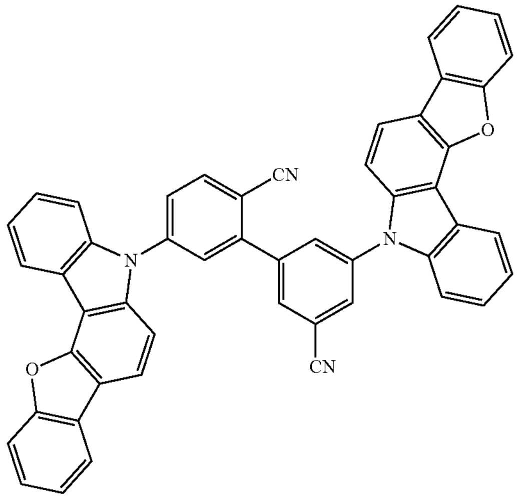
697
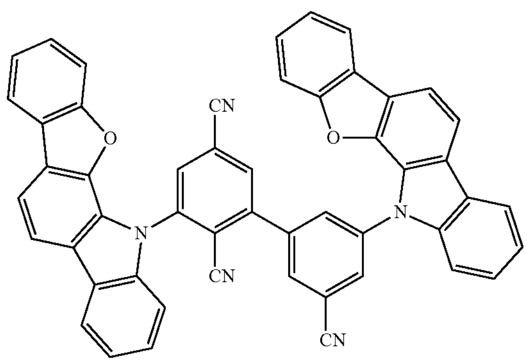
698
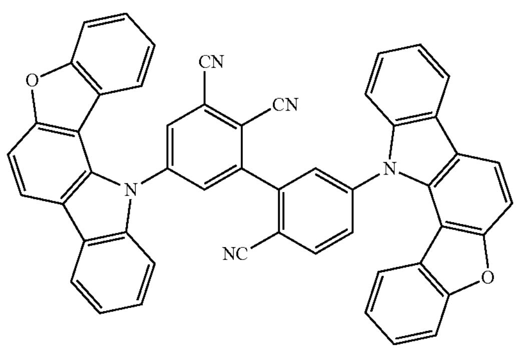
699
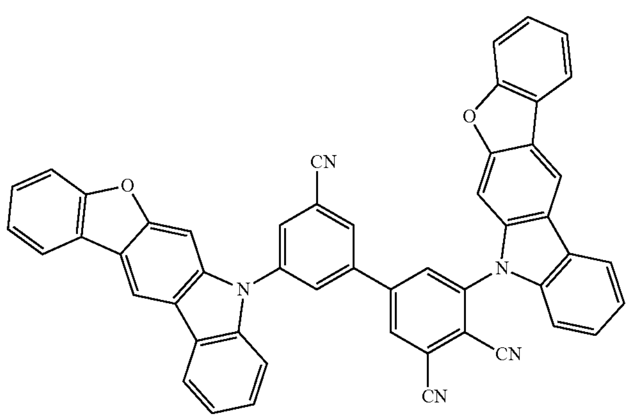

-continued
700
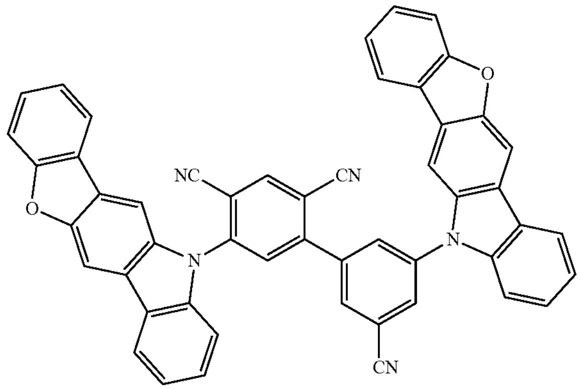
701
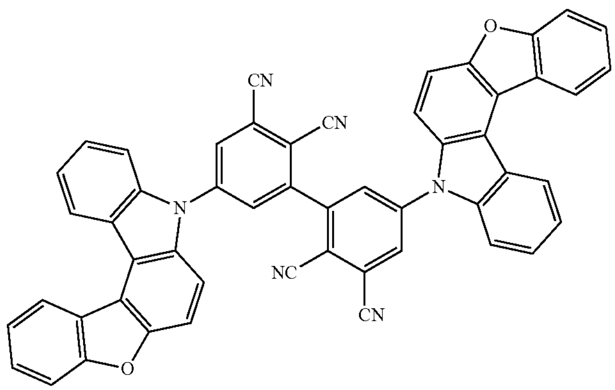
702
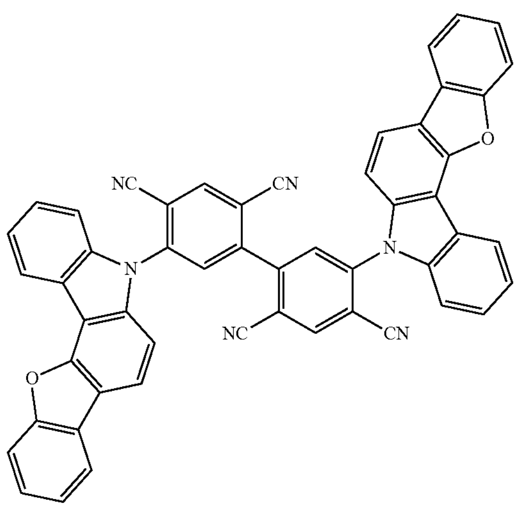
703
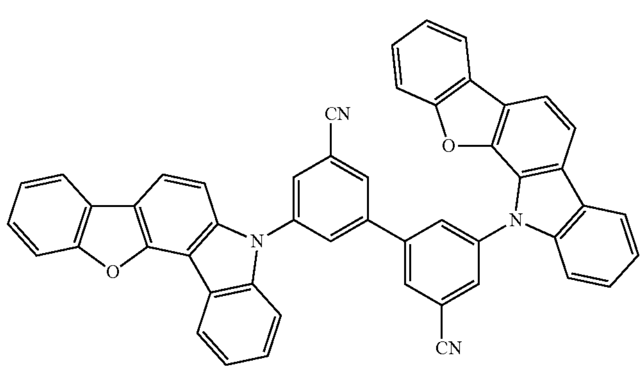

-continued
704
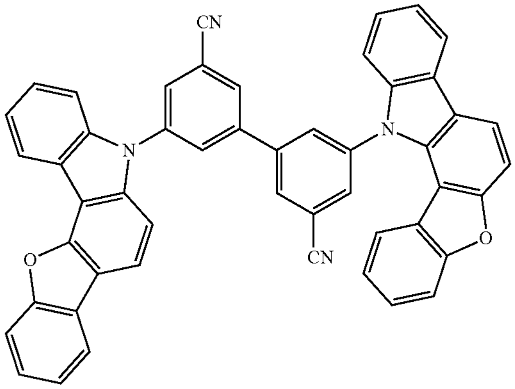
705
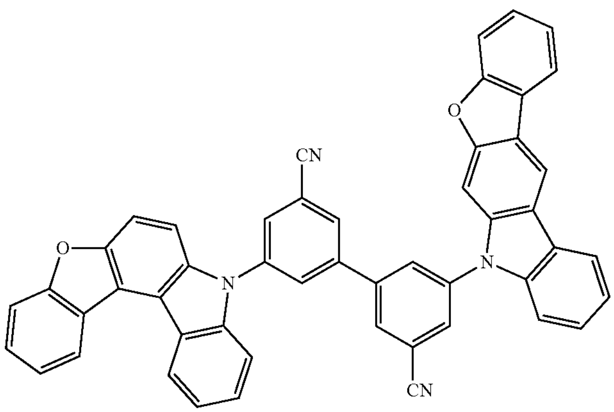
706
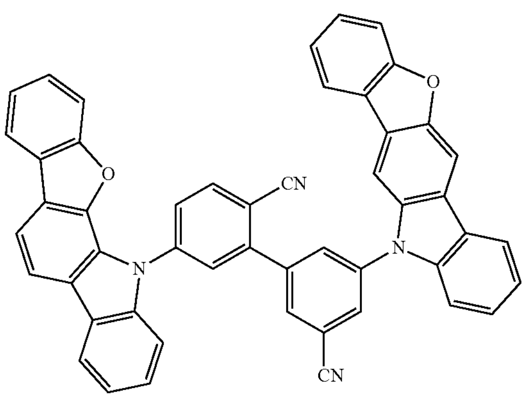
707
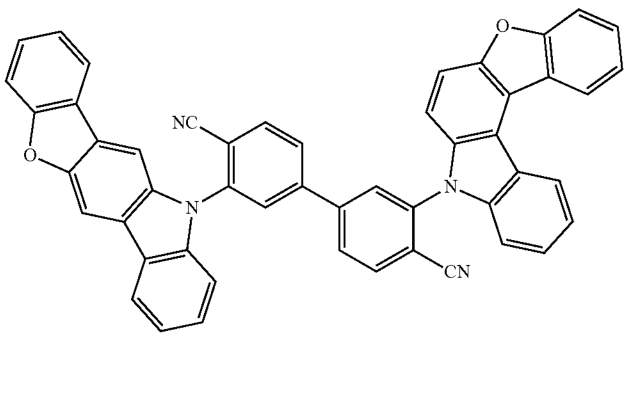

-continued
708
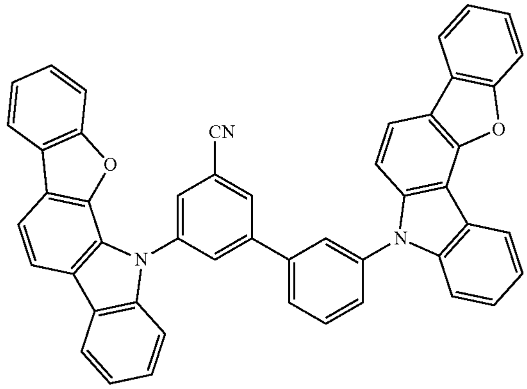
709
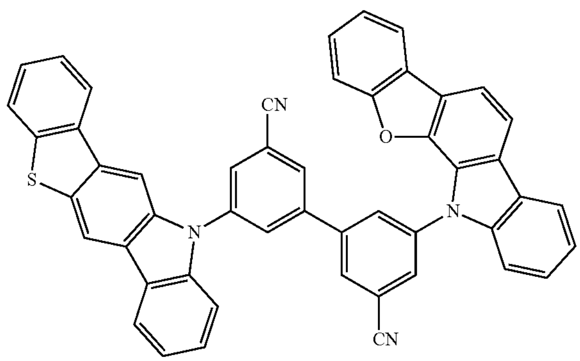
710
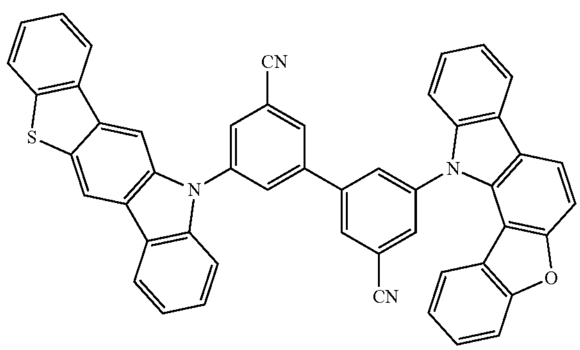
711
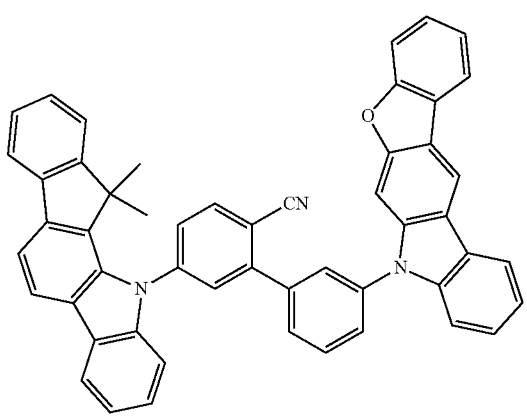

-continued
712
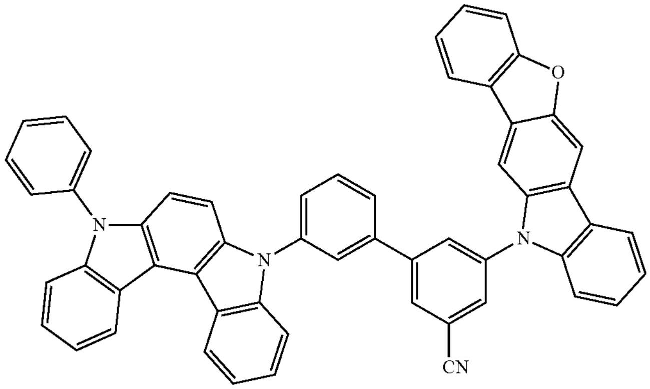
713
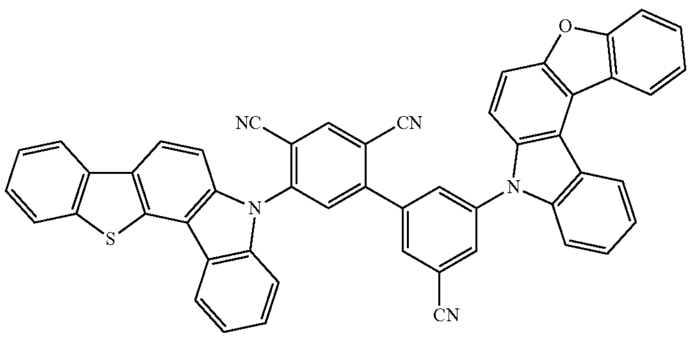
714
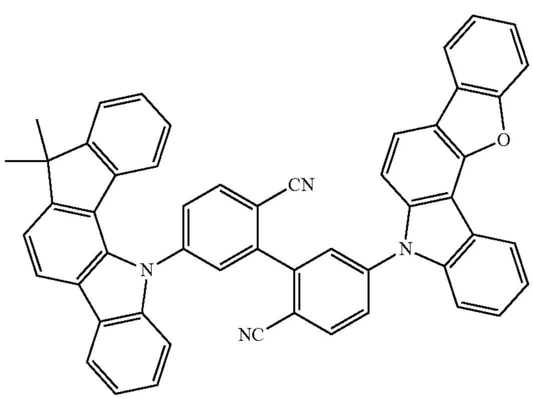
715
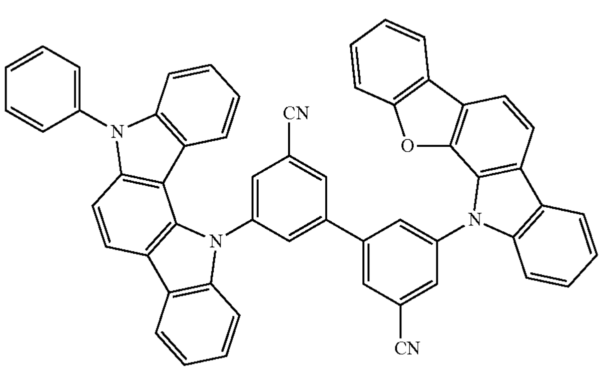

-continued
716
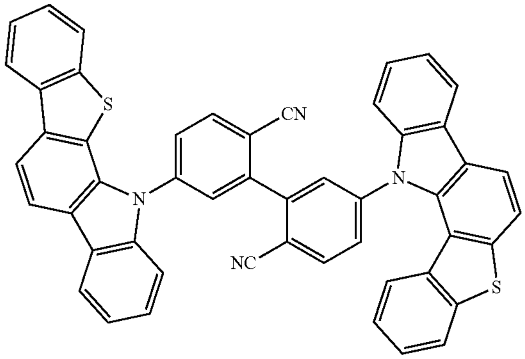
717
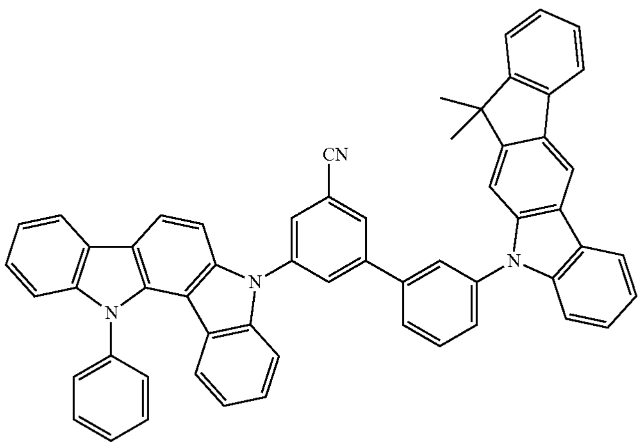
718
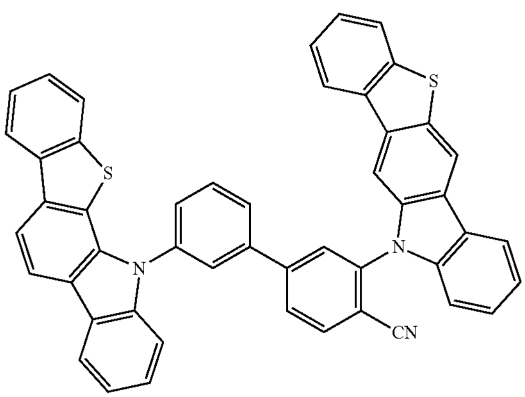
719
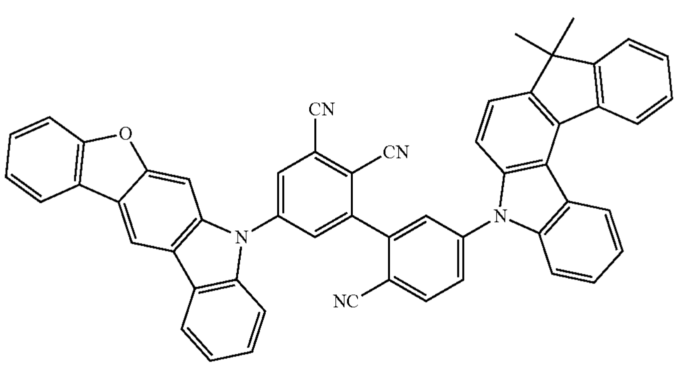

-continued
720
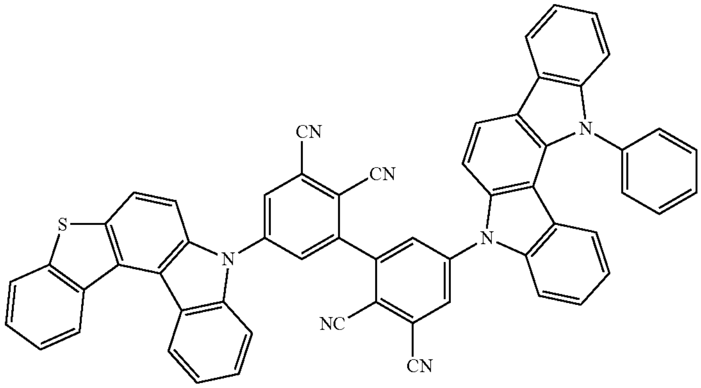
721
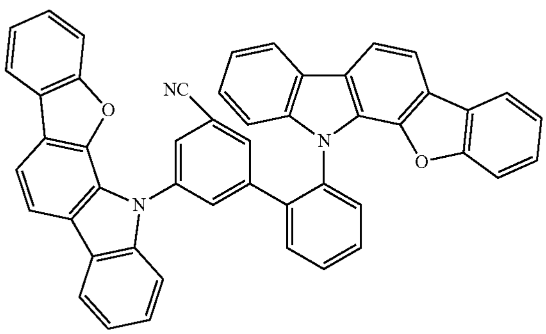
722
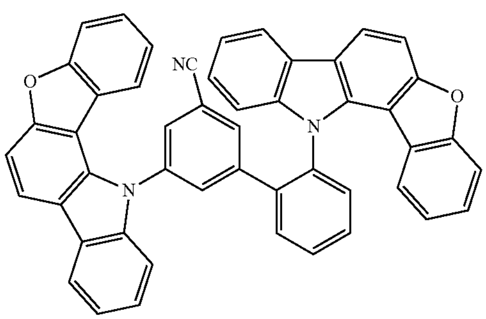
723
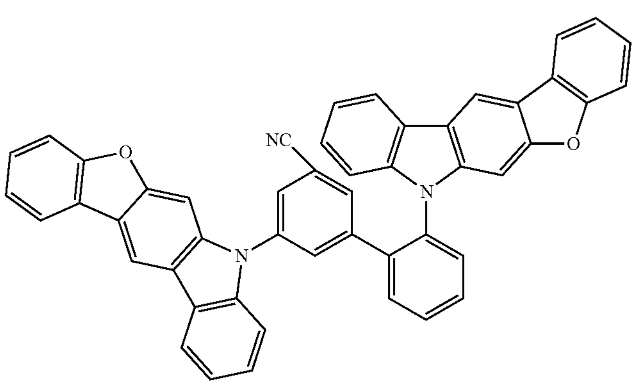

-continued
724
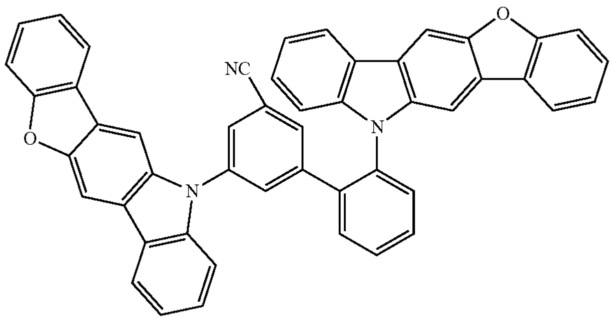
725
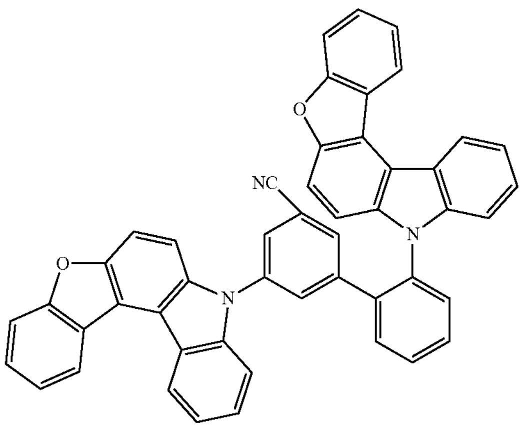
726
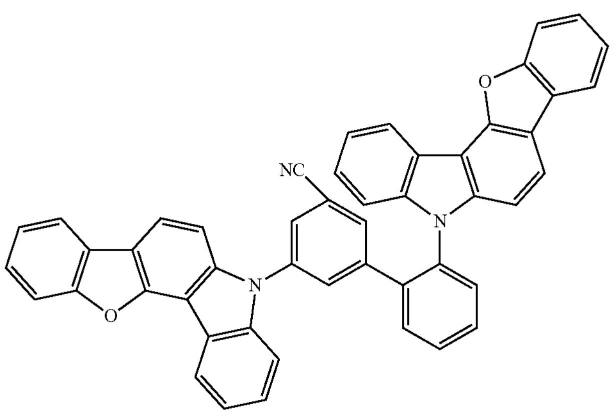
727
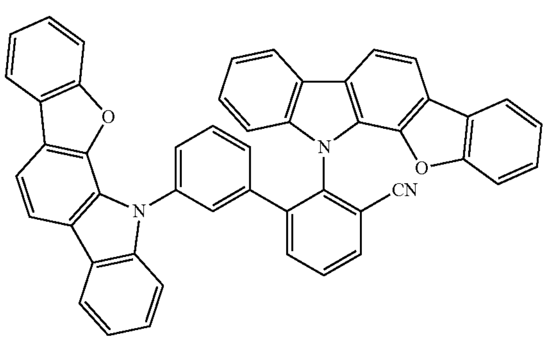

-continued
728
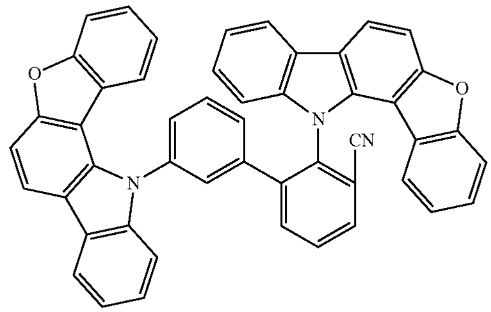
729
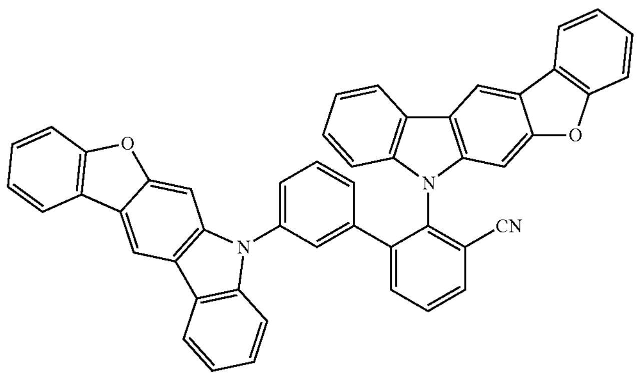
730
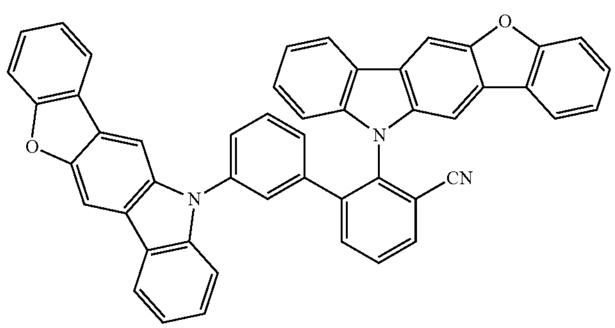
731
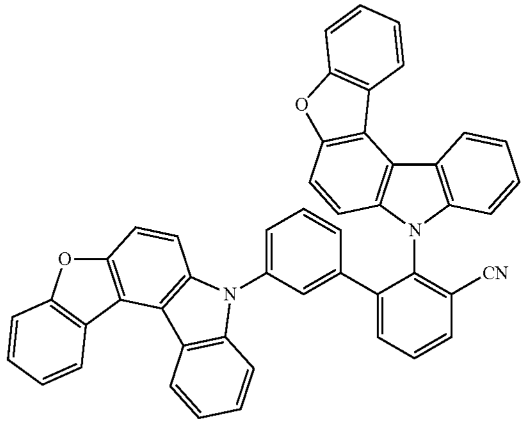

-continued
732
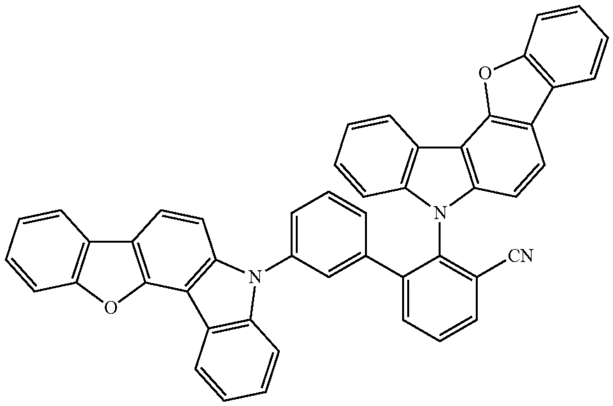
733
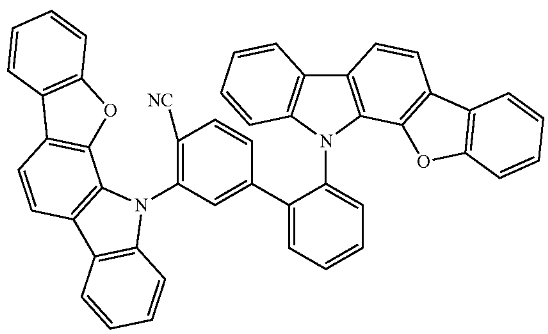
734
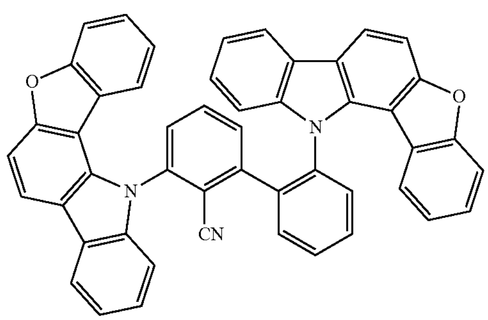
735
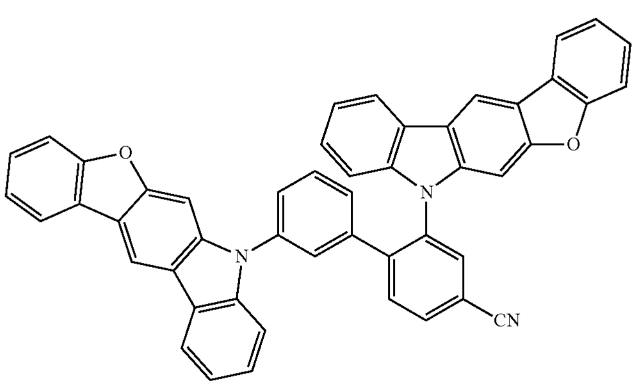

-continued
736
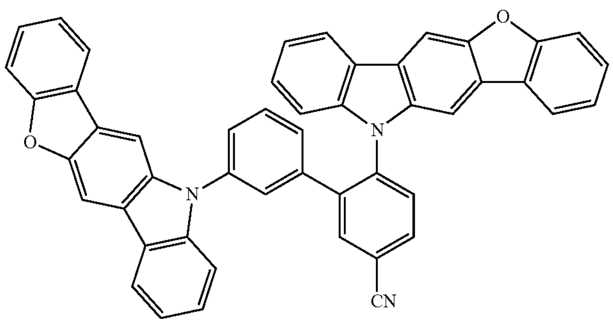
737
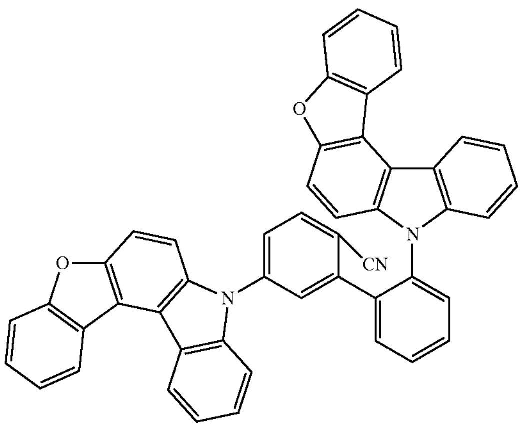
738
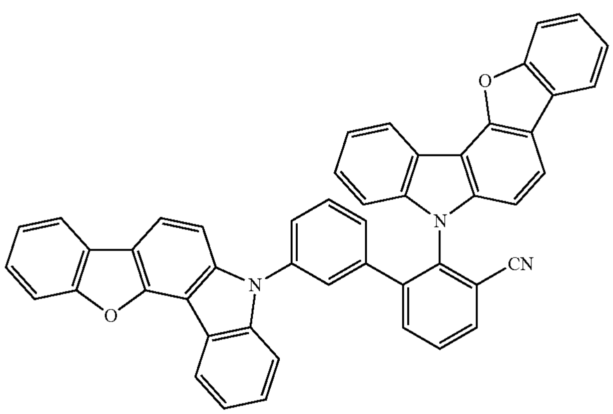
739
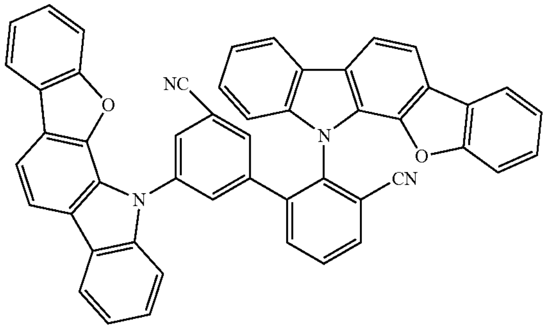

-continued
740
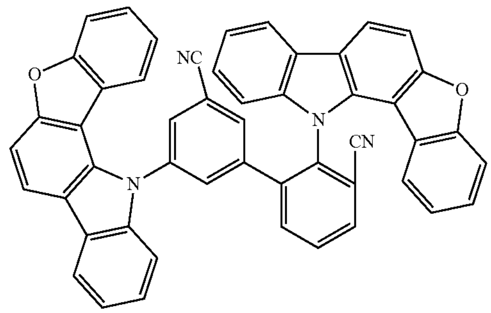
741
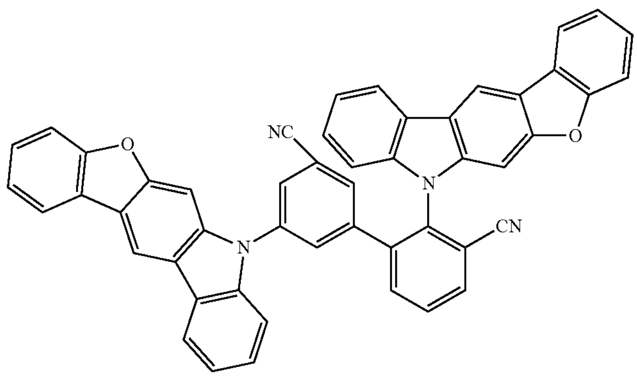
742
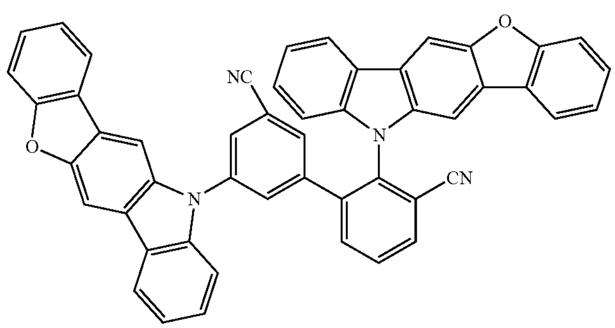
743
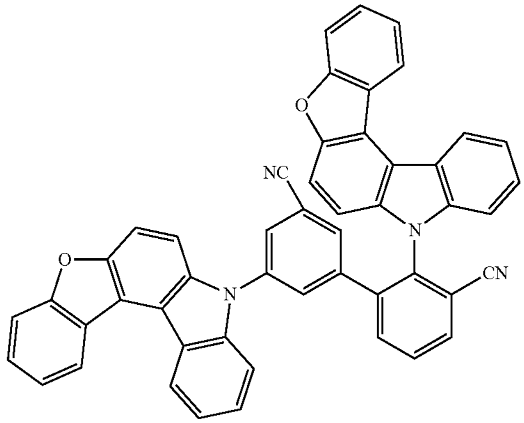

-continued
744
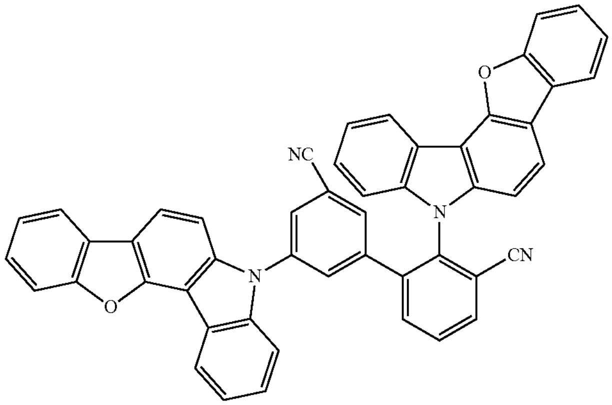
745
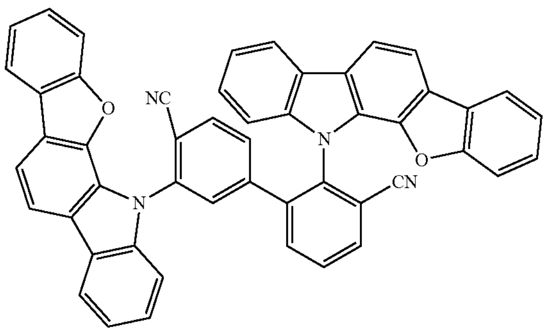
746
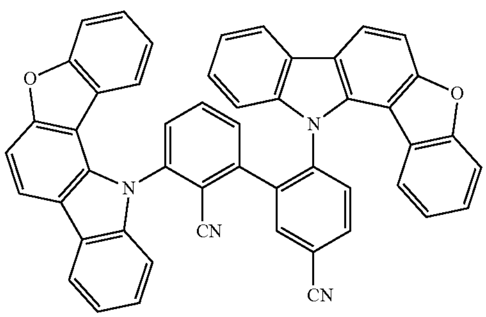
747
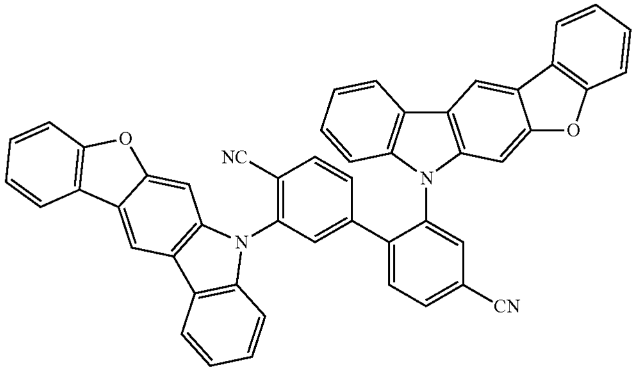

-continued
748
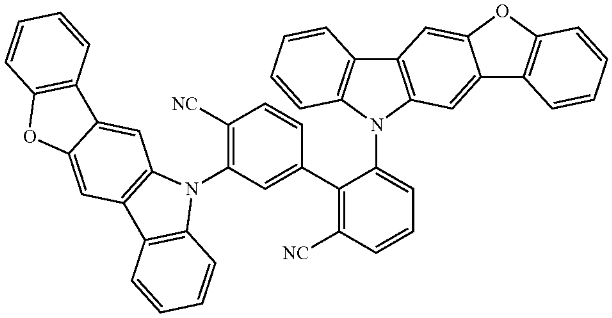
749
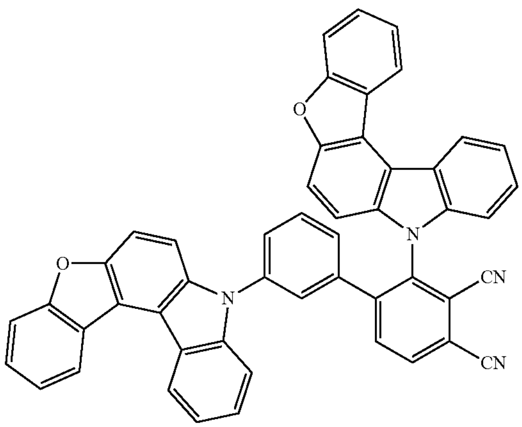
750
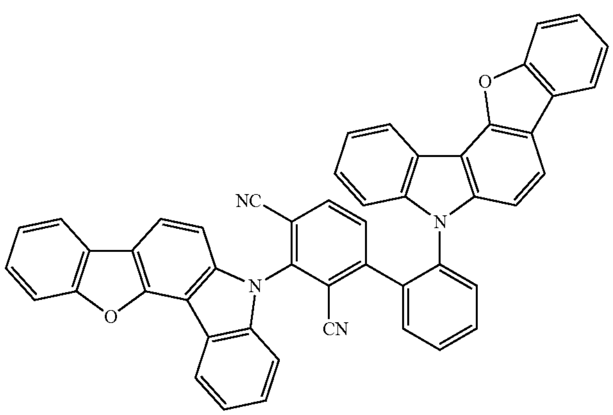
751
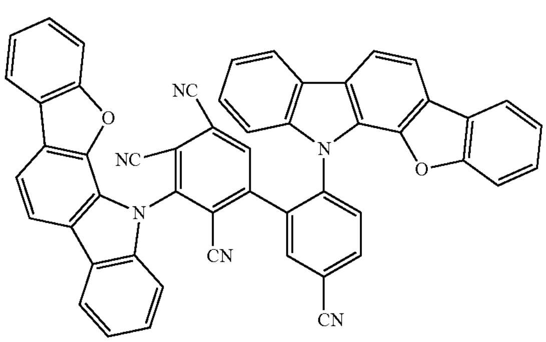

-continued
752
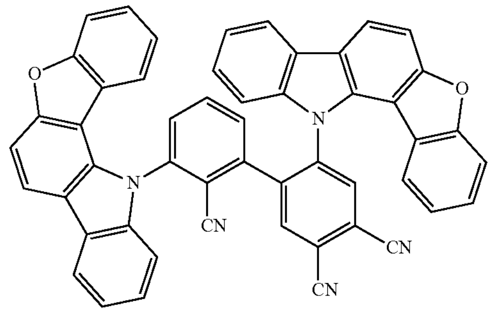
753
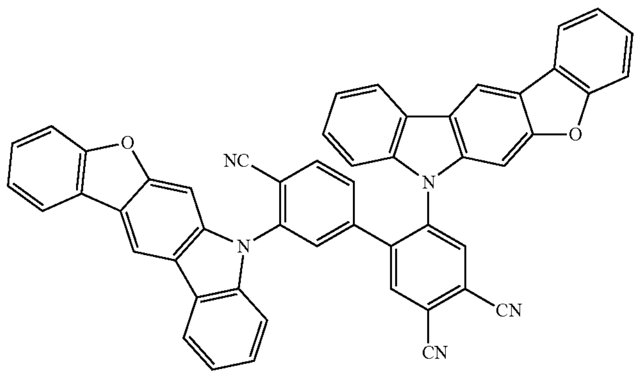
754
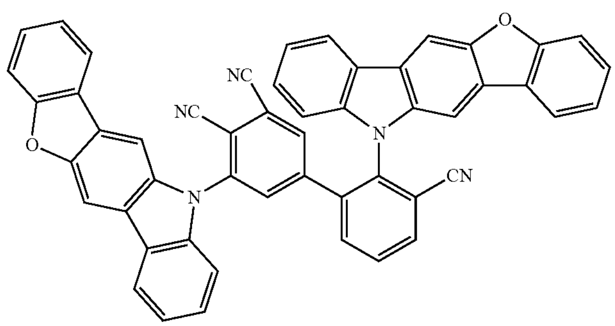
755
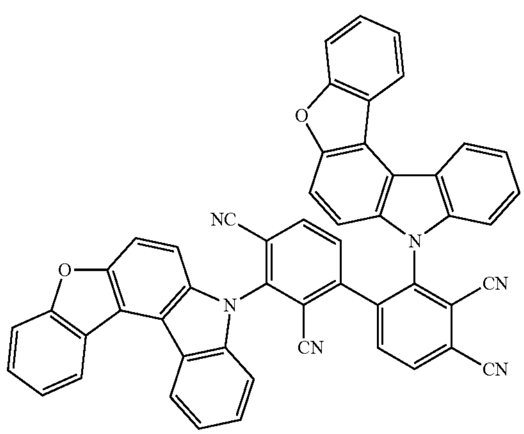

-continued
756
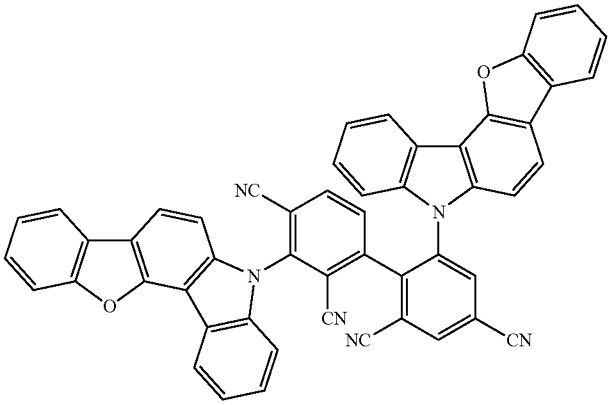
757
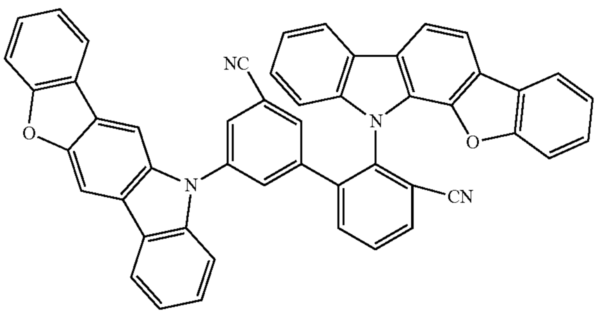
758
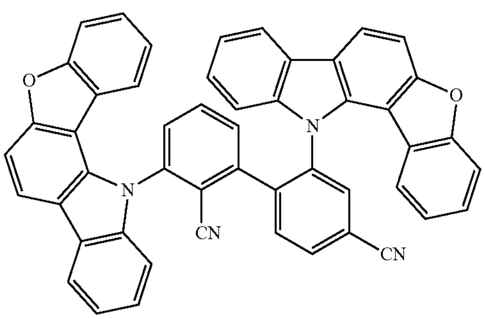
759
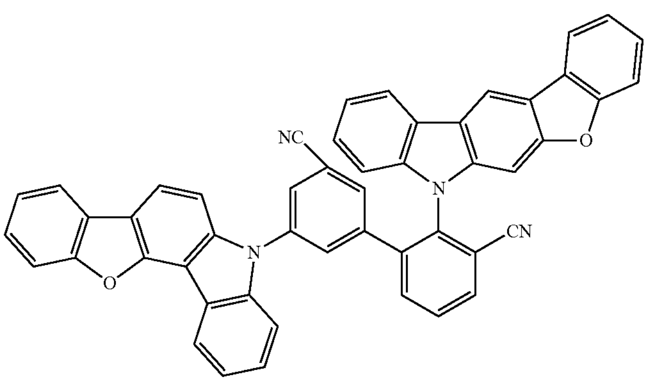

-continued
760
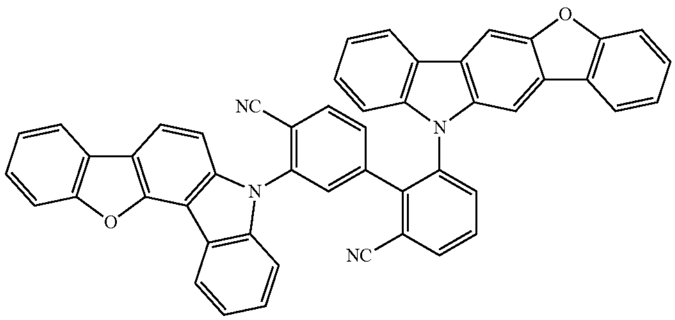
761
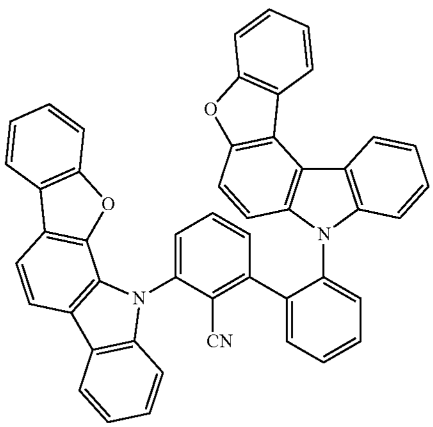
762
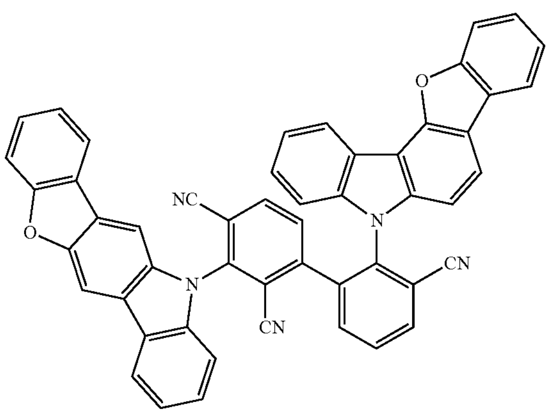
763
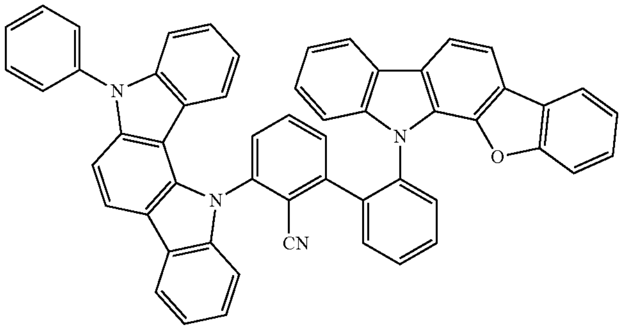

-continued
764
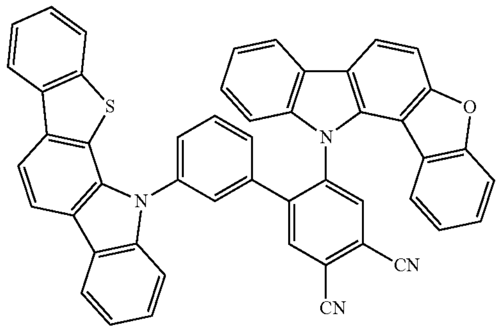
765
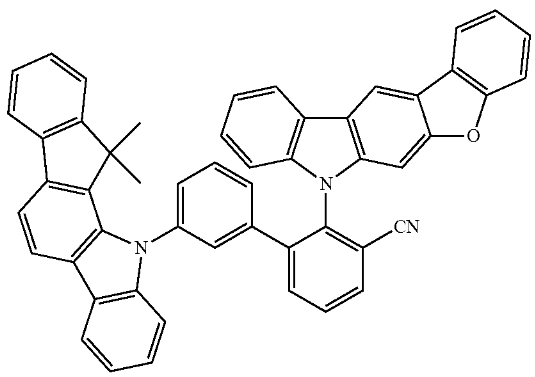
766
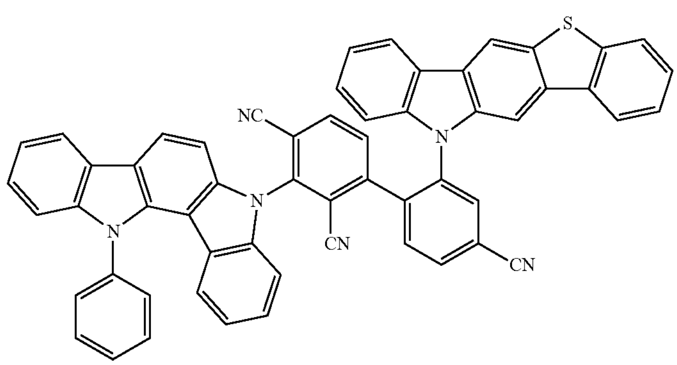
767
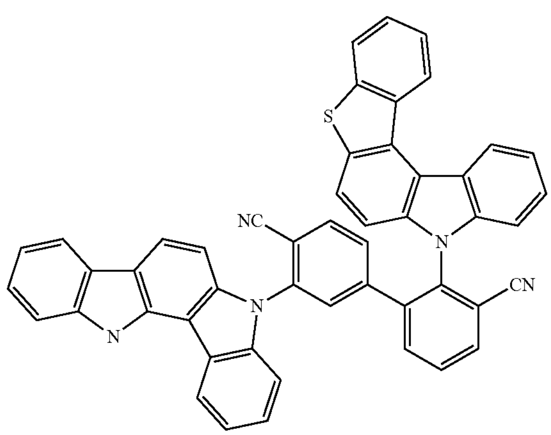

-continued
768
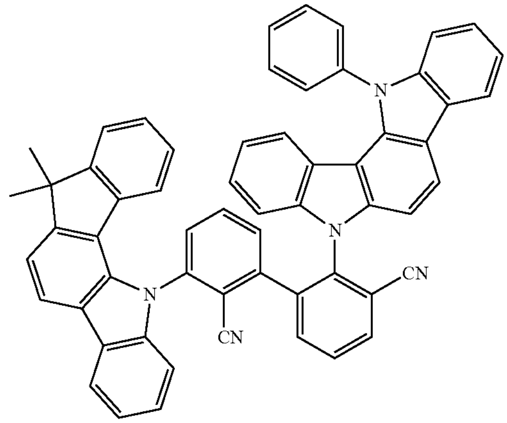
769
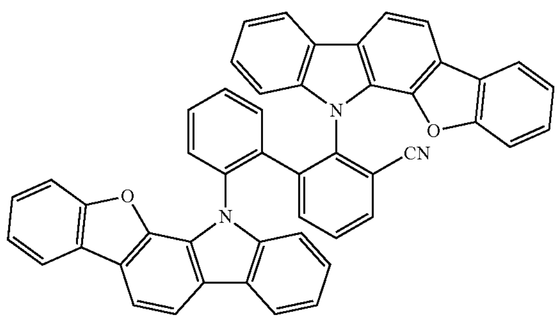
770
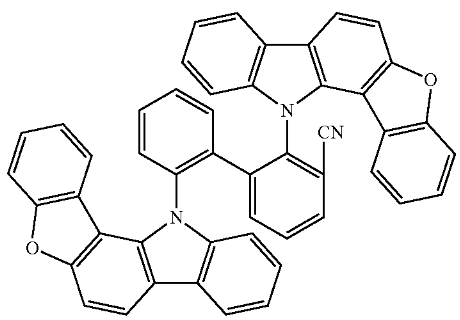
771
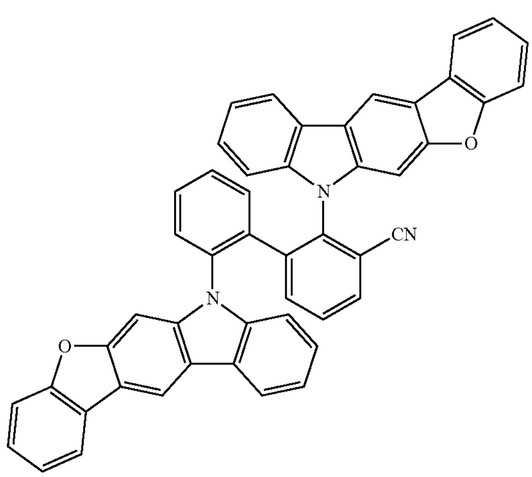

-continued
772
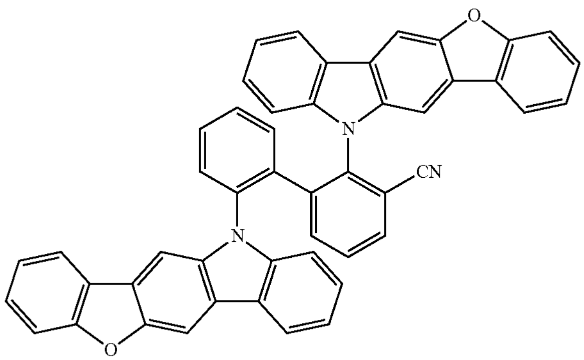
773
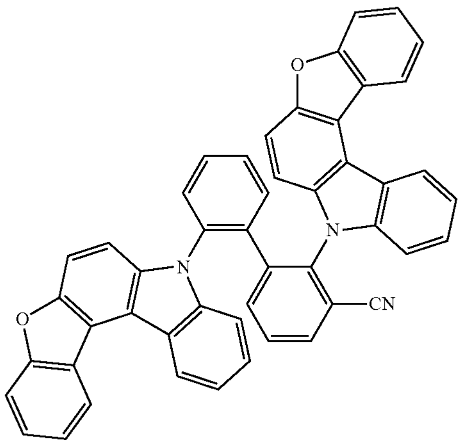
774
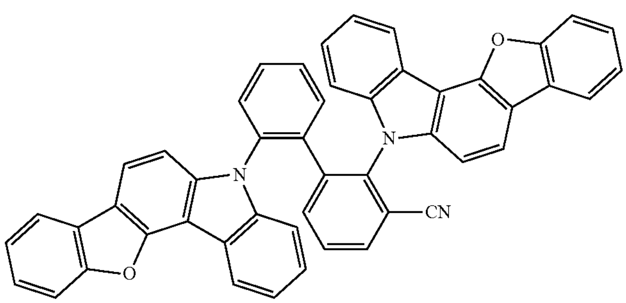
775
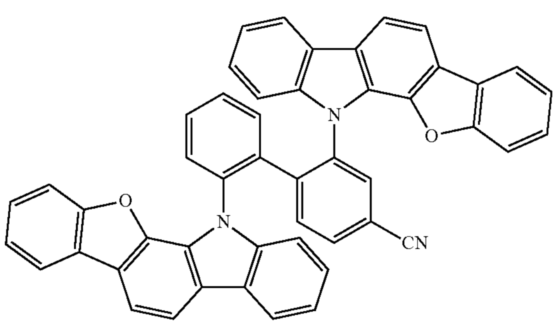

-continued
776
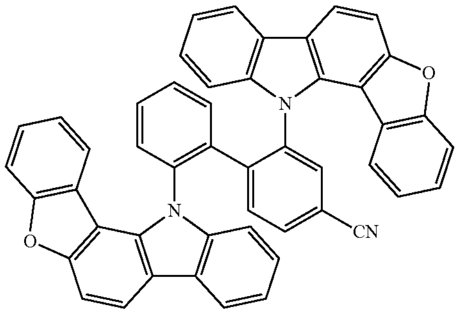
777
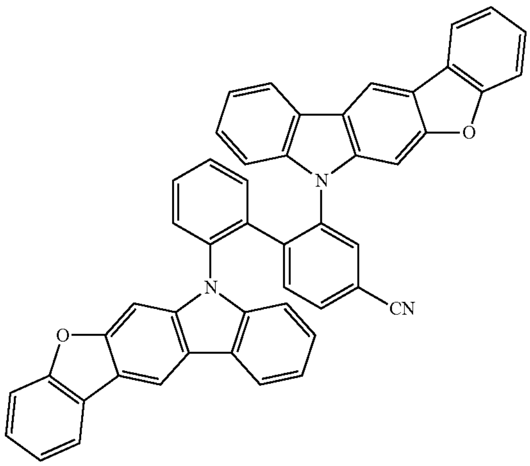
778
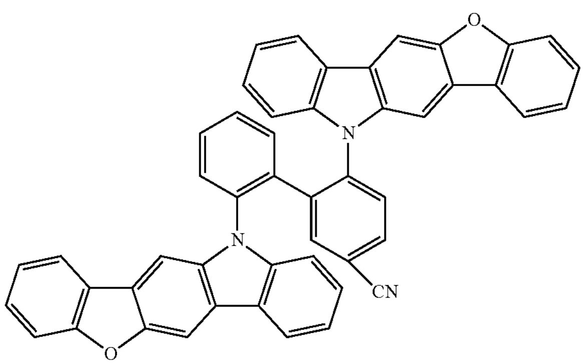
779
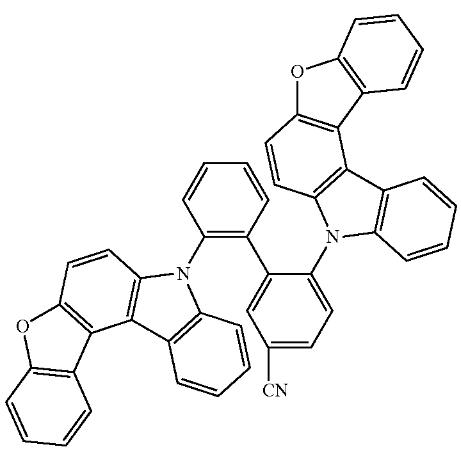

-continued
780
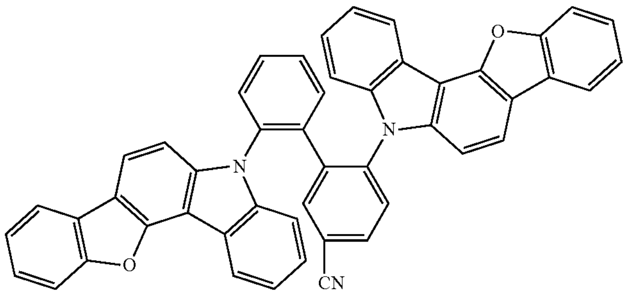
781
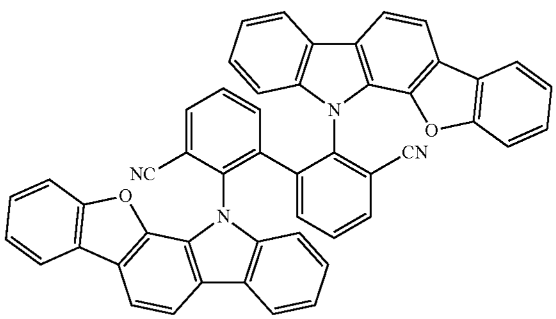
782
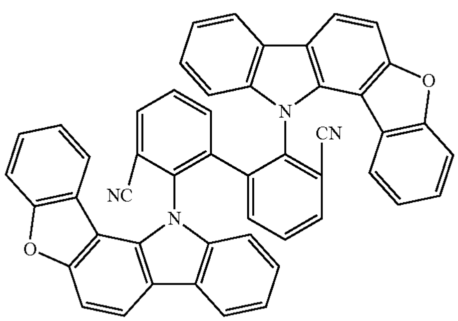
783
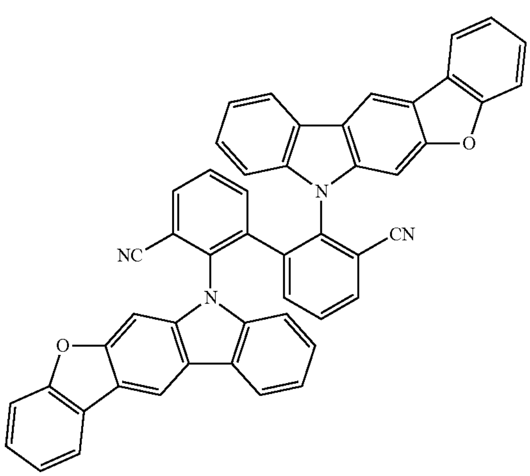

-continued
784
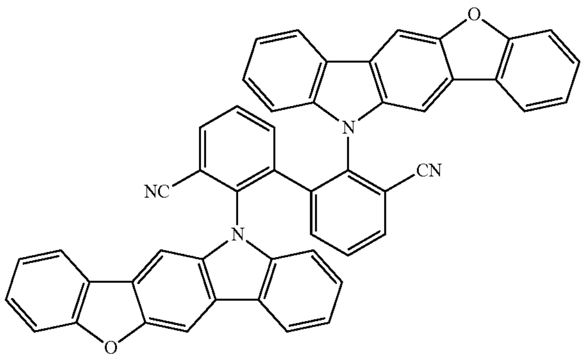
785
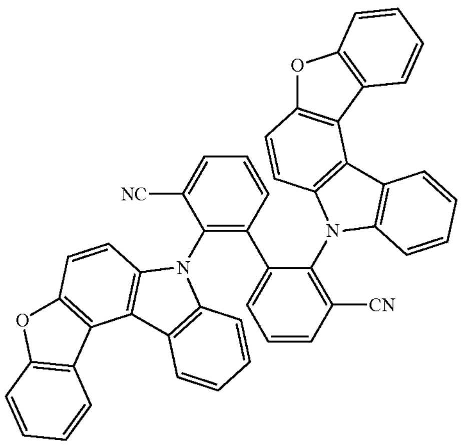
786
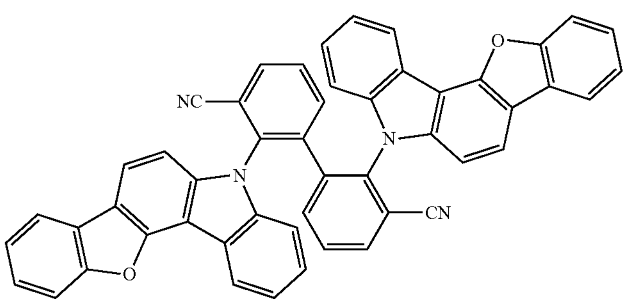
787
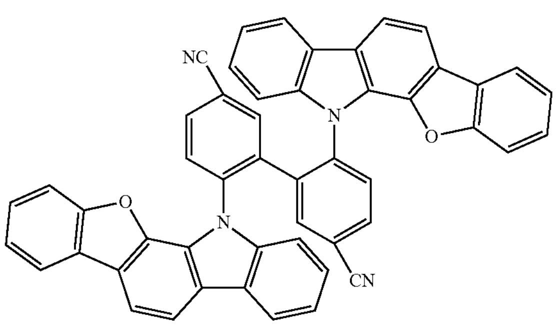

-continued
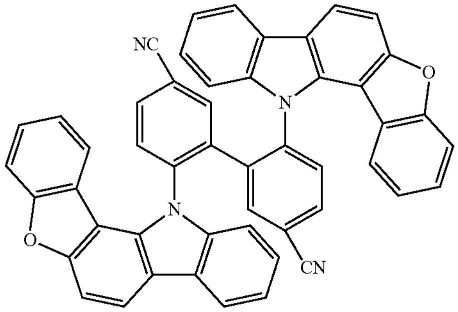
788
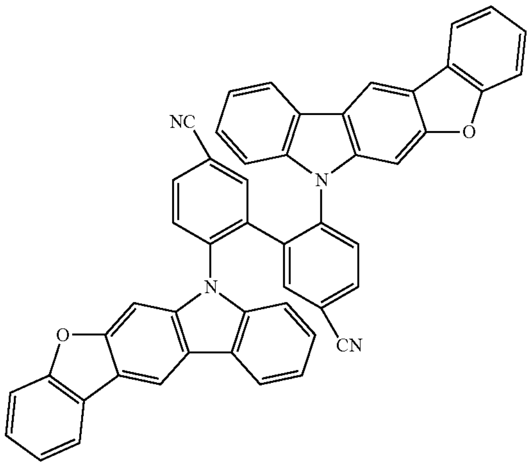
789
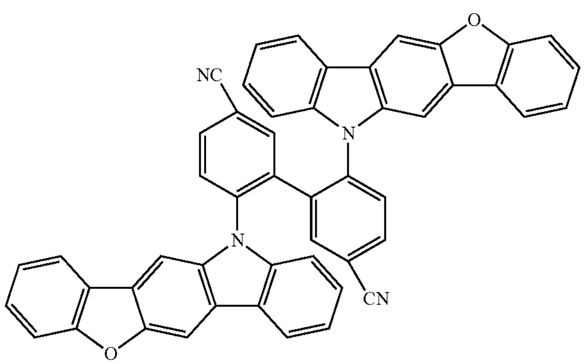
790
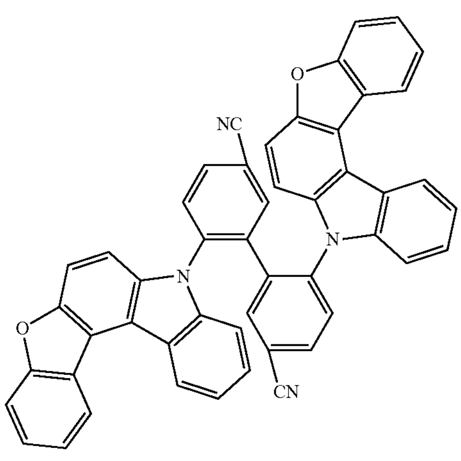
791

-continued
792
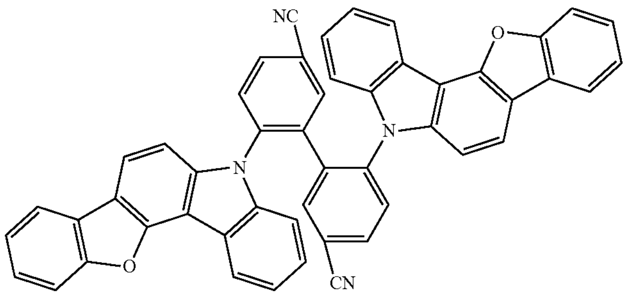
793
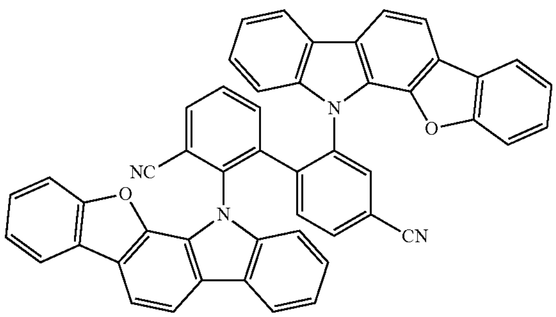
794
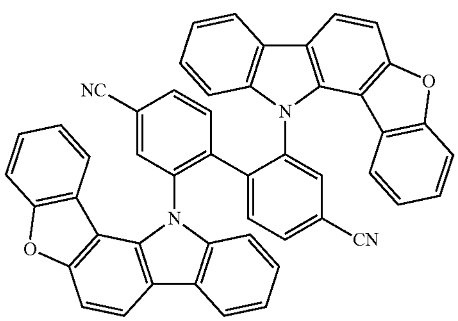
795
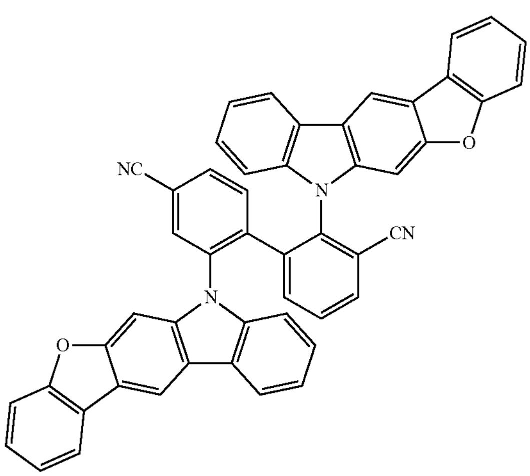

-continued
796
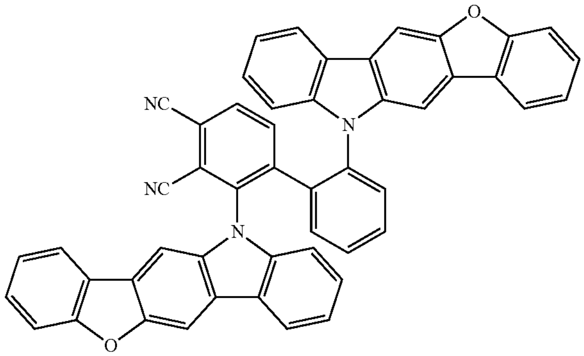
797
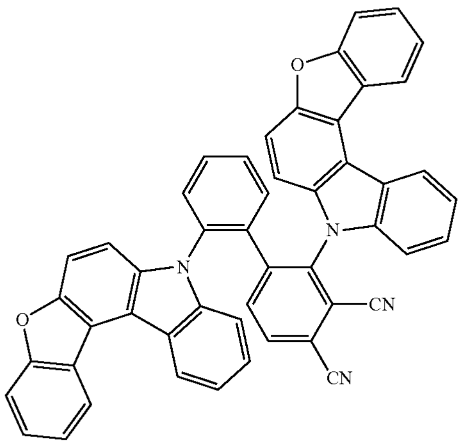
798
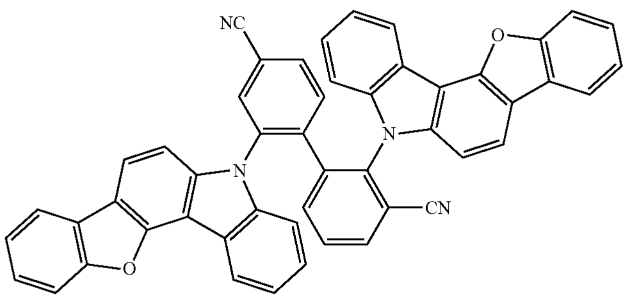
799
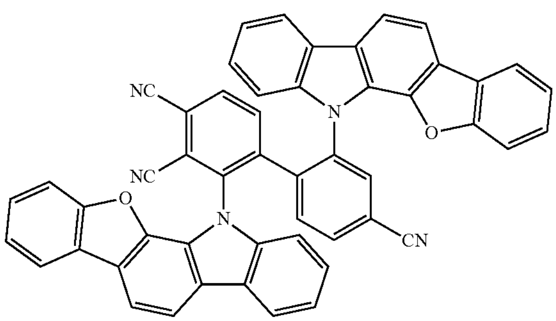

-continued
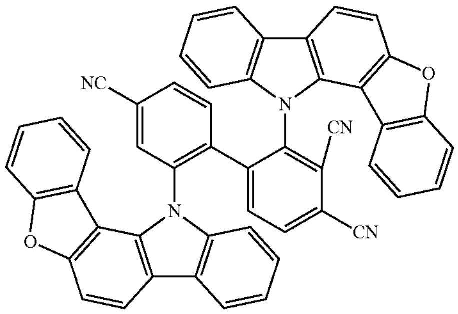
800
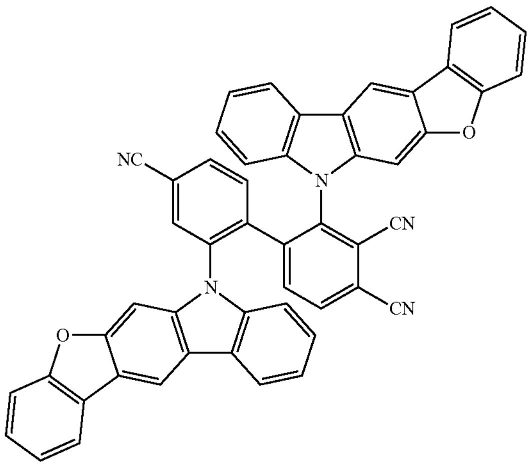
801
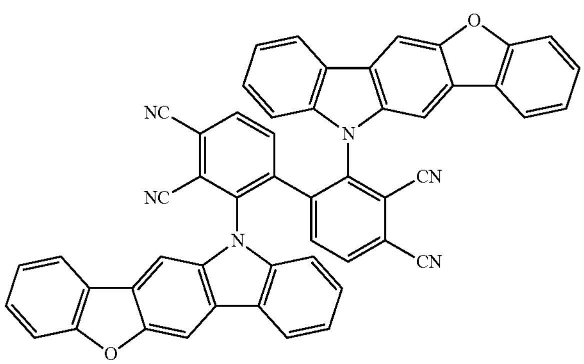
802
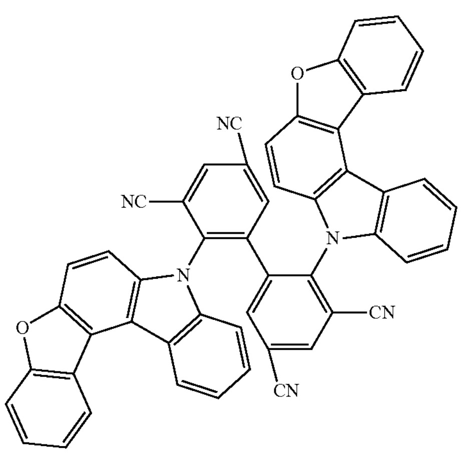
803

-continued
804
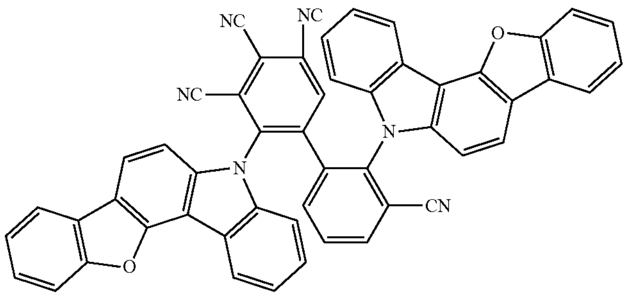
805
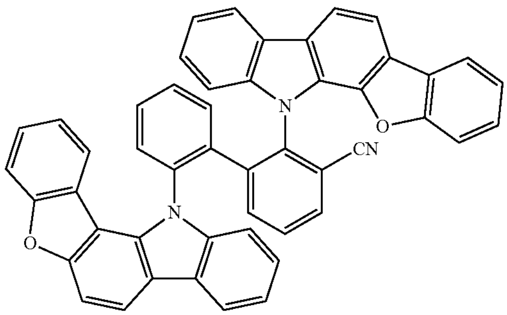
806
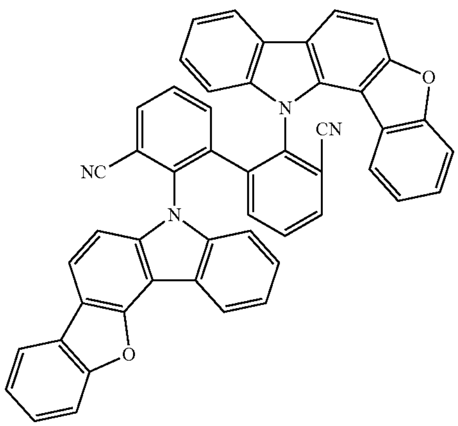
807
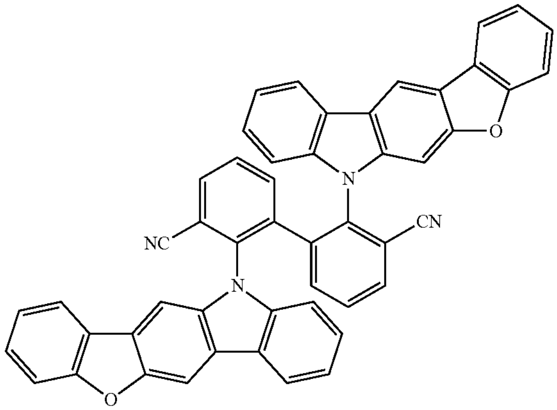

-continued
808
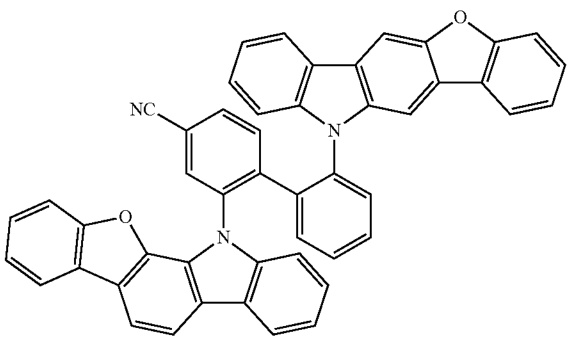
809
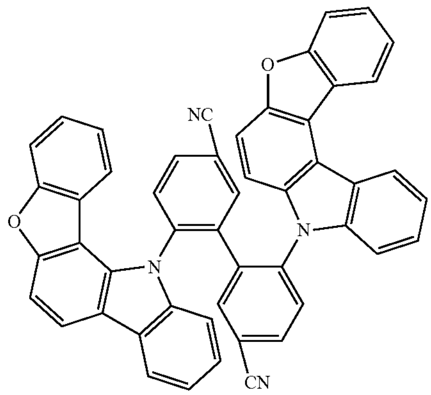
810
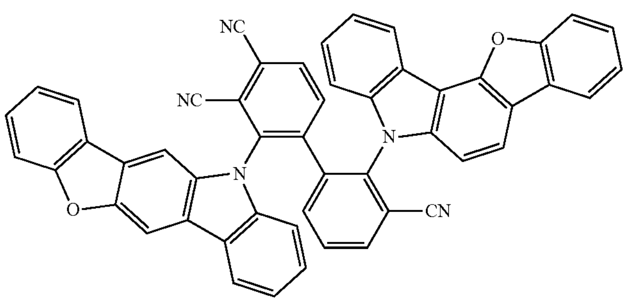
811
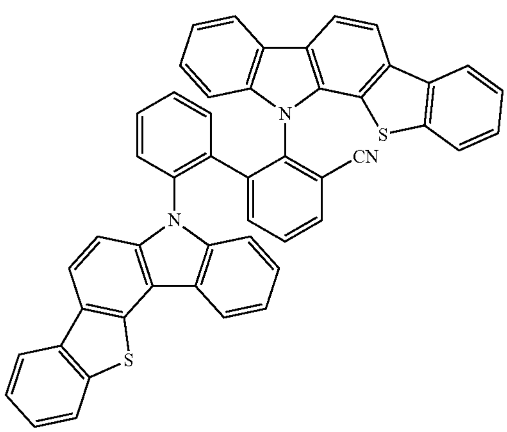

-continued
812
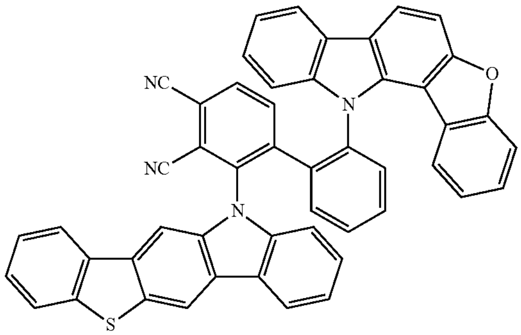
813
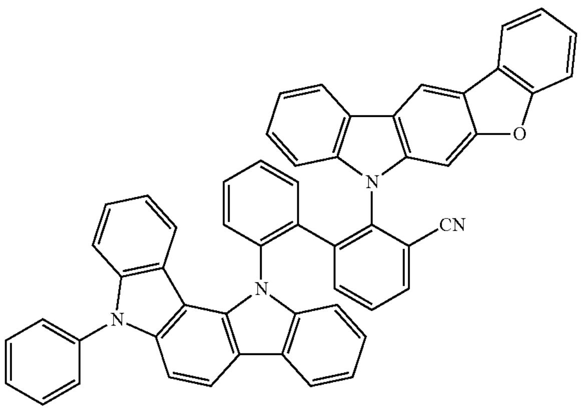
814
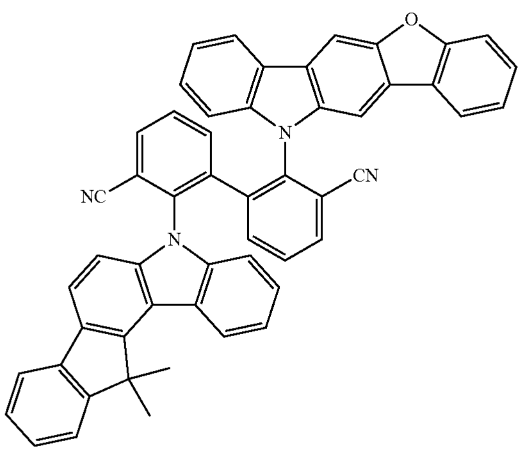
815
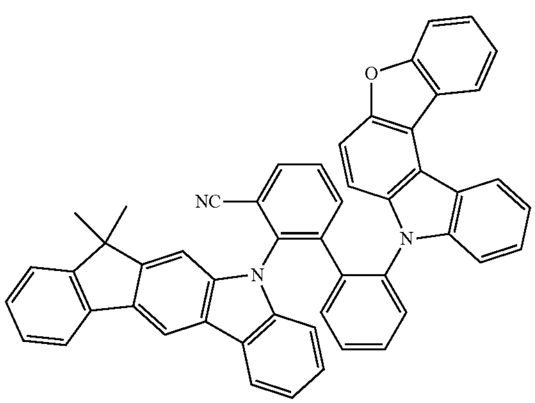

-continued
816
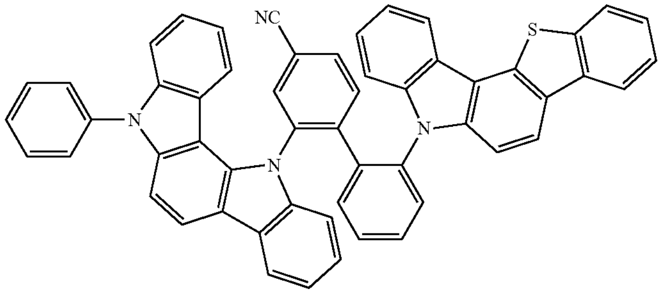
817
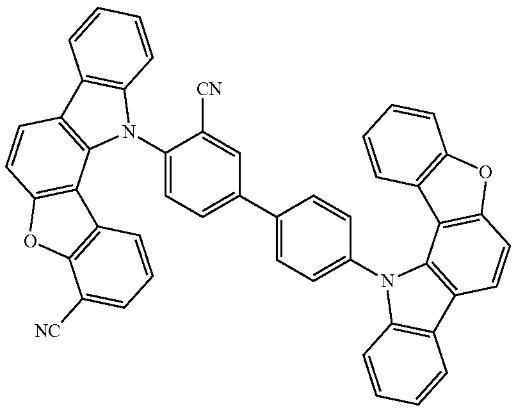
818
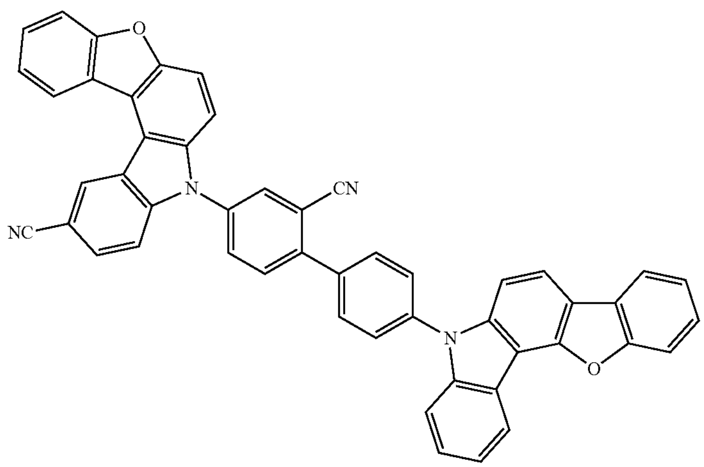
819
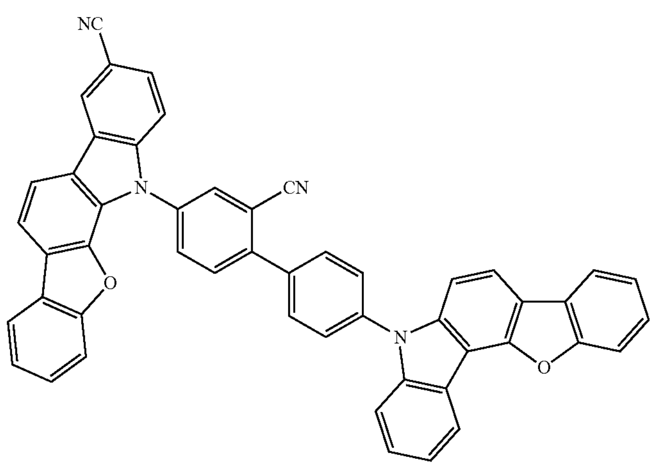

-continued
820
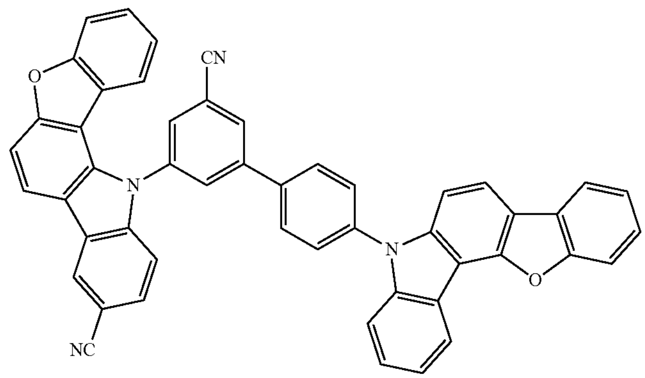
821
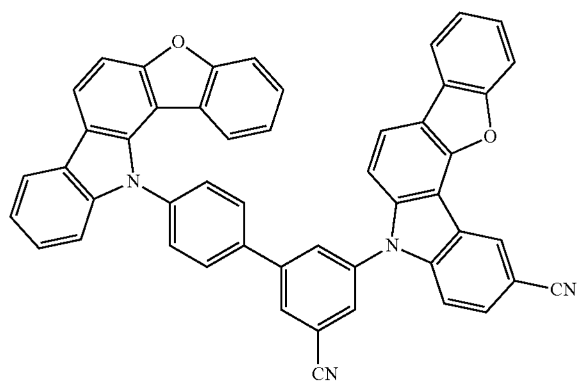
822
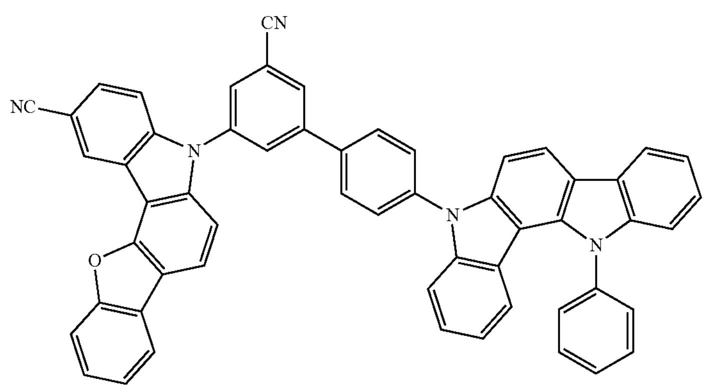
823
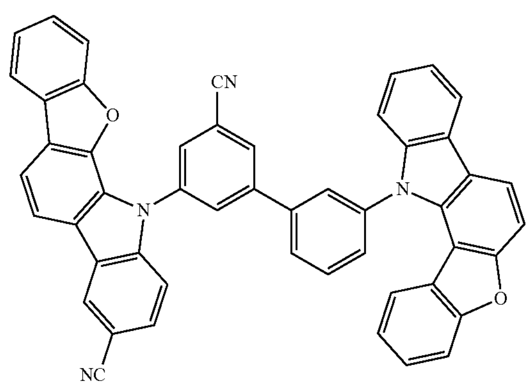

-continued
824
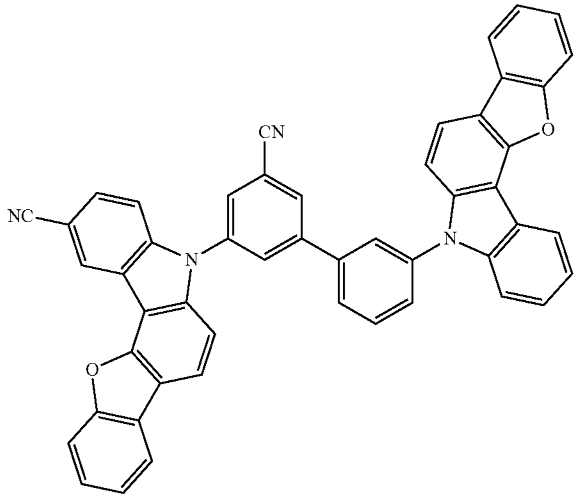
825
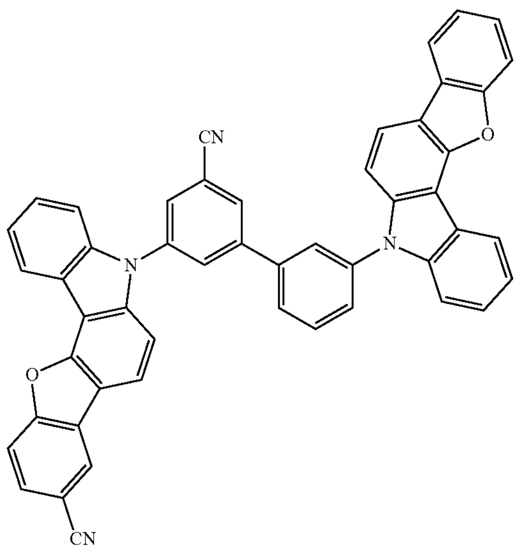
826
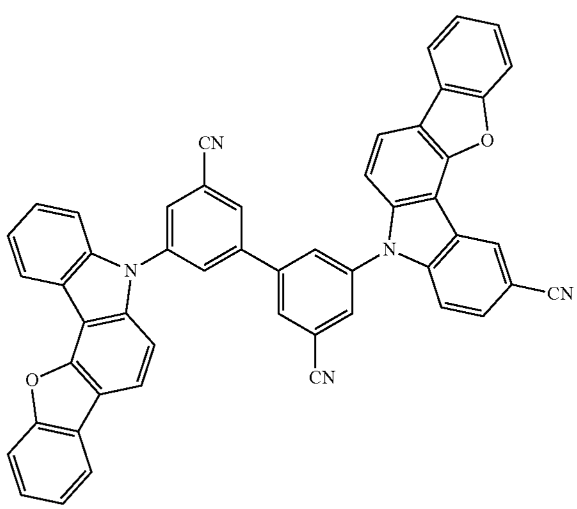

-continued
827
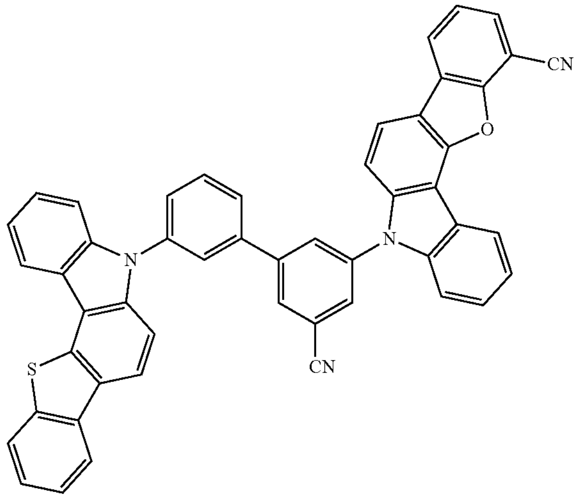
828
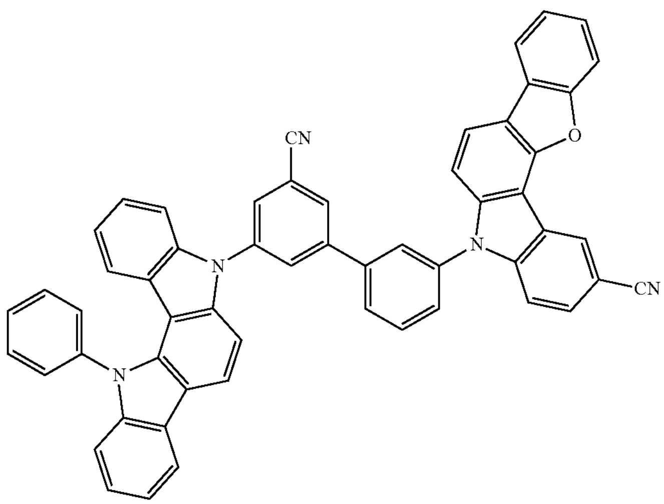
829
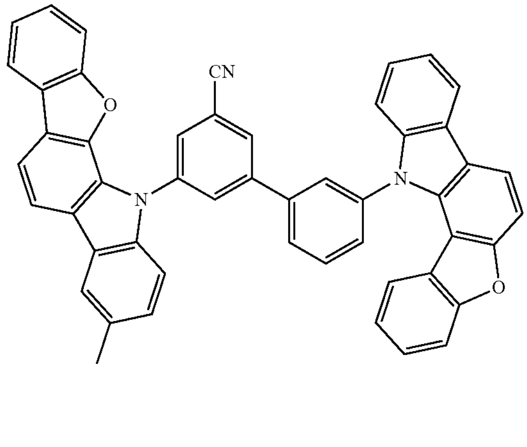

-continued
830
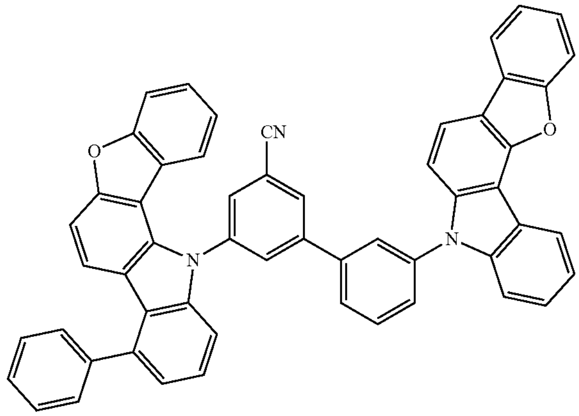
831
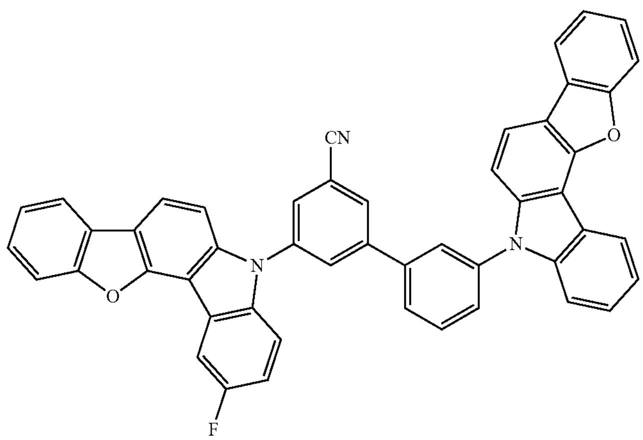
832
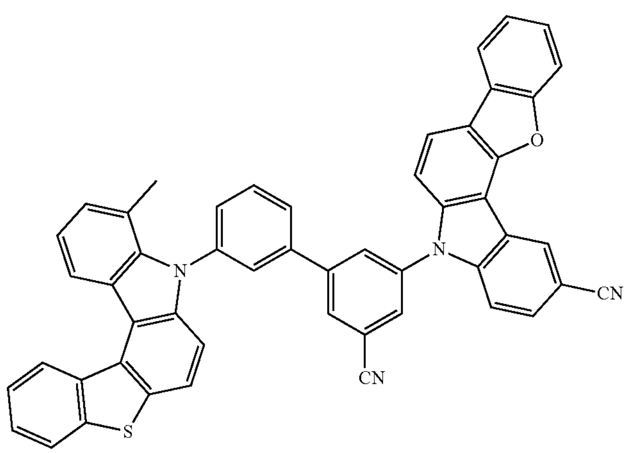

-continued
833
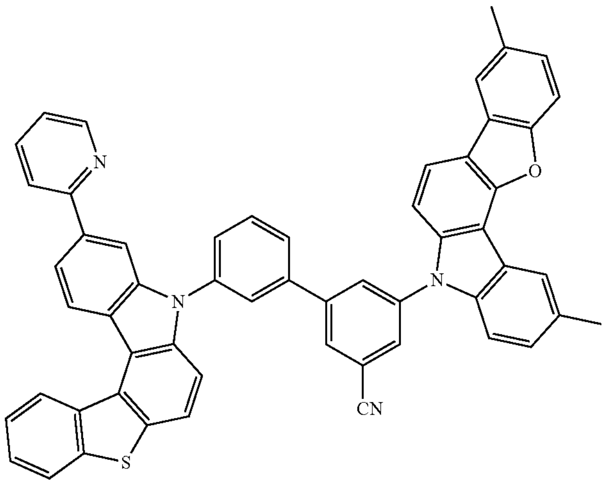
834
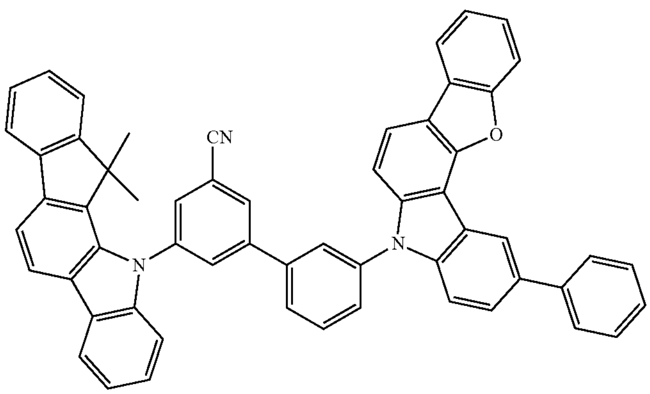
835
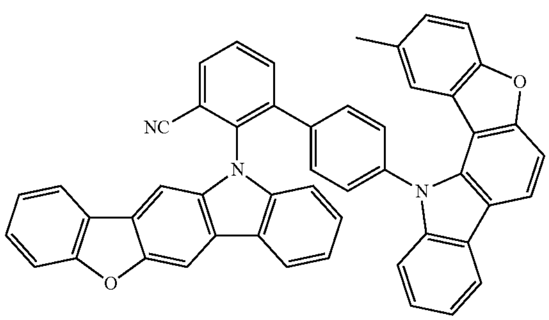
836
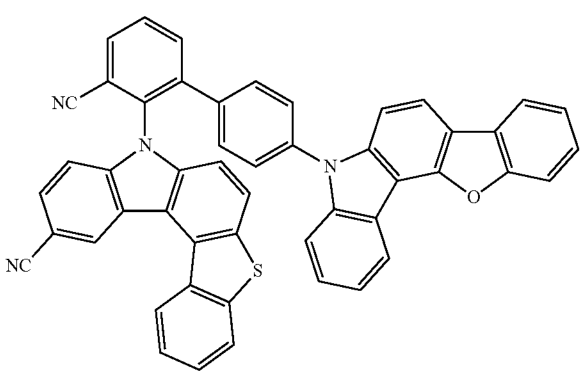

-continued
837
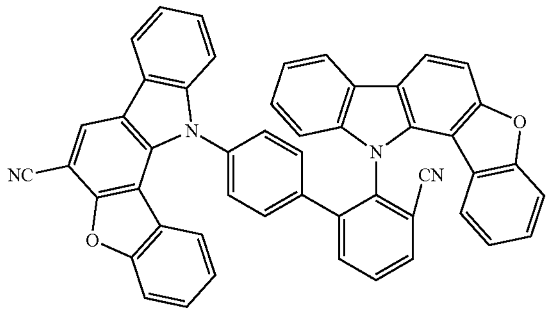
838
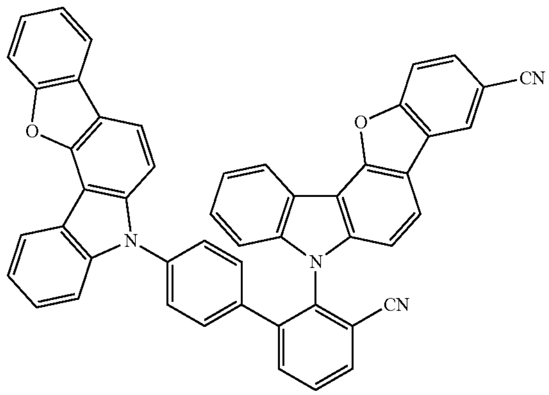
839
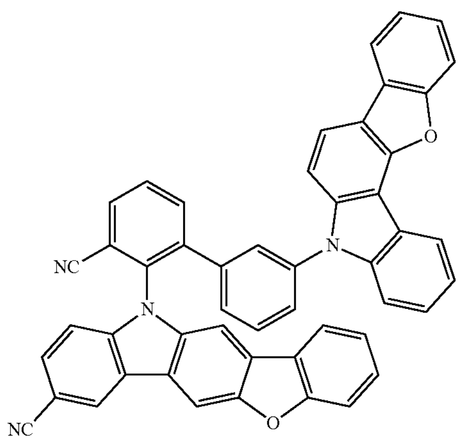
840
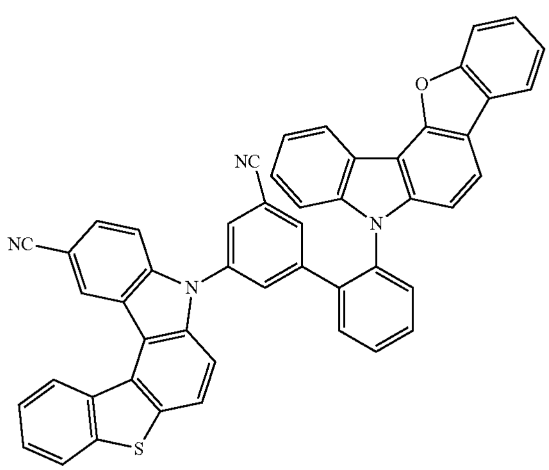

-continued
841
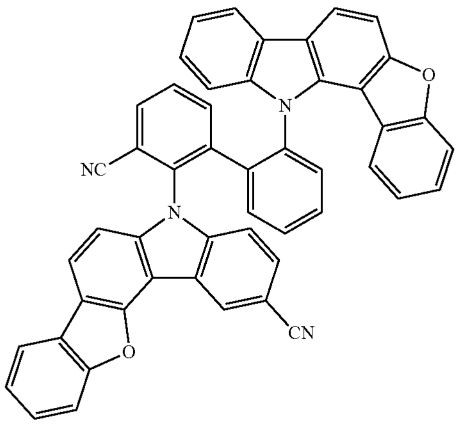
842
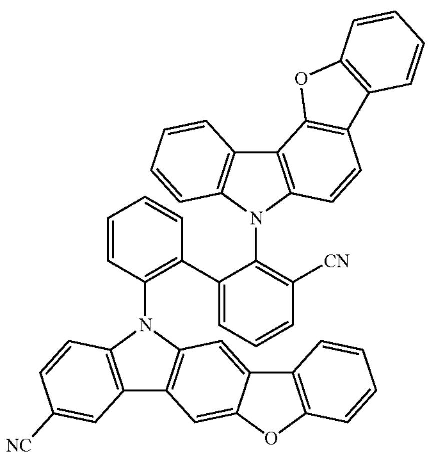
843
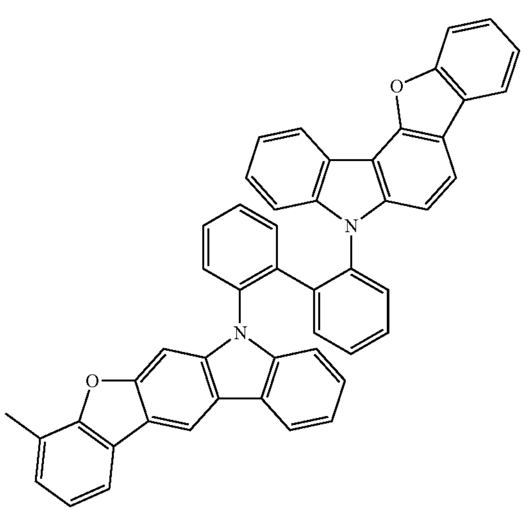

-continued
844
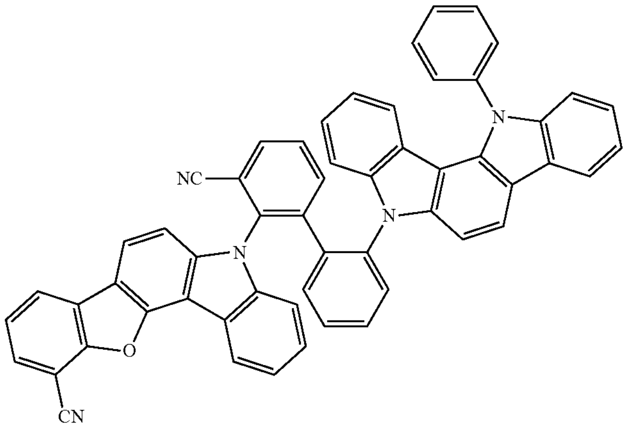
845
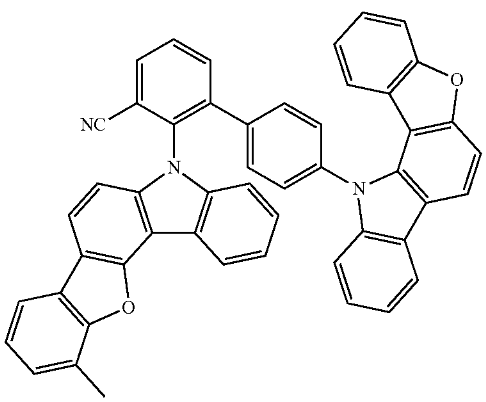
846
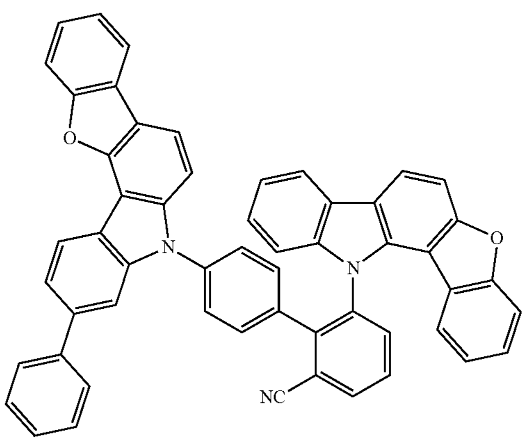
847
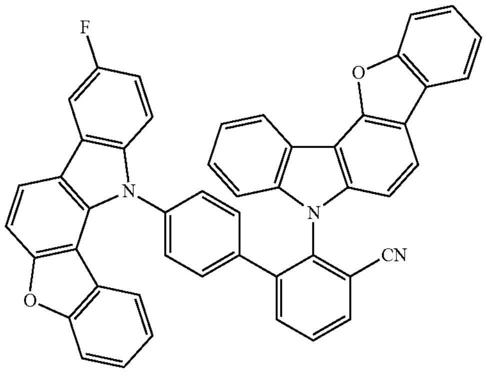

-continued
848
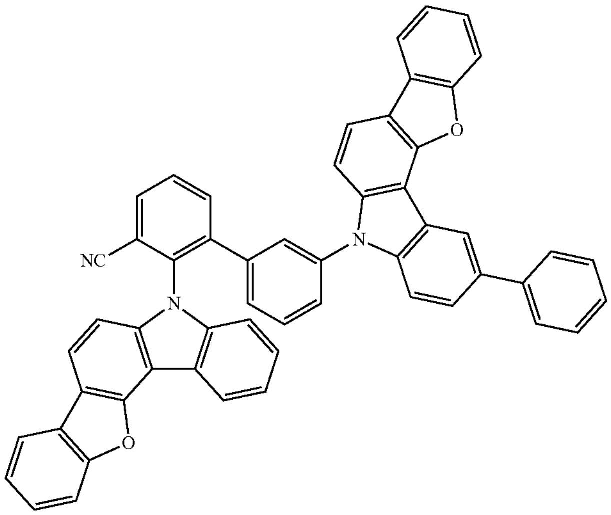
849
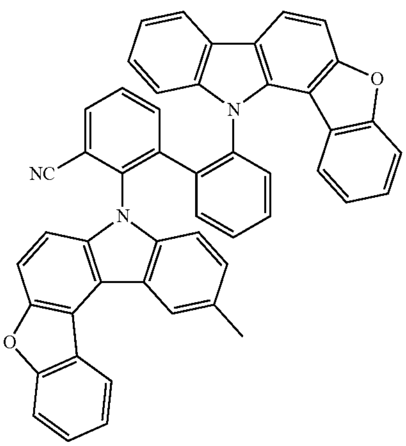
850
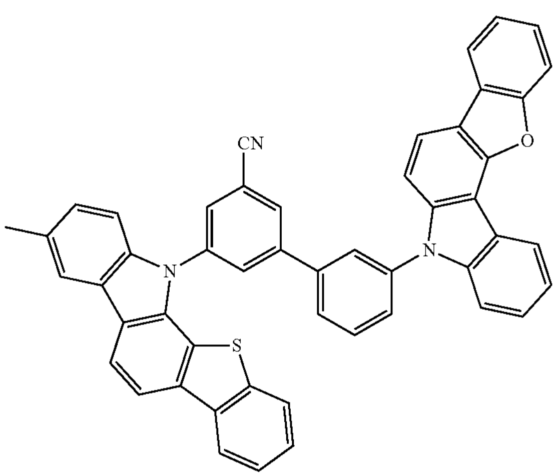

-continued
851
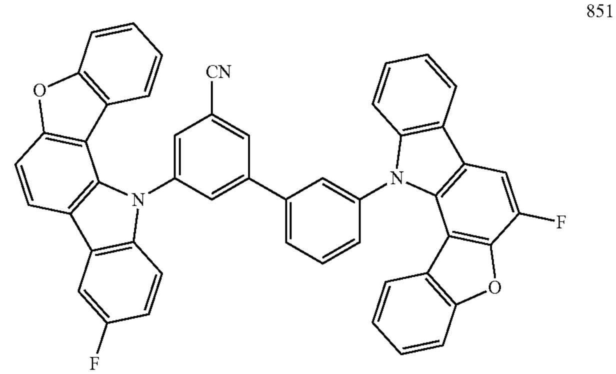
852
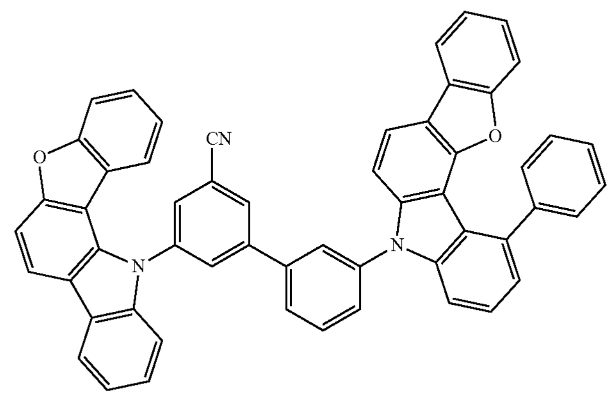
Group HE3
1
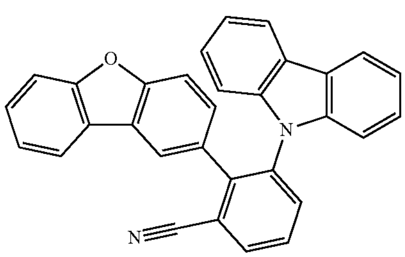
2
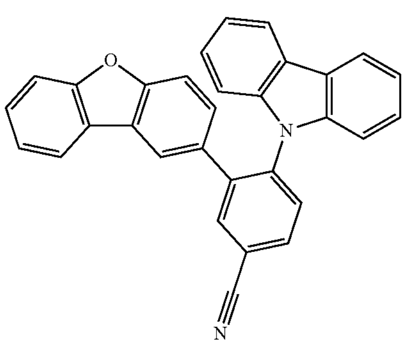
-continued
3
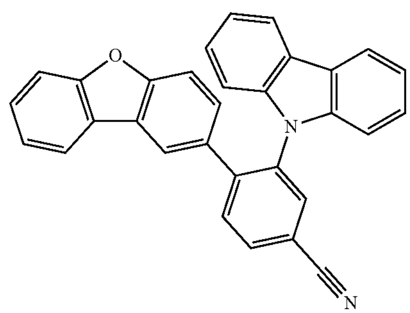
4
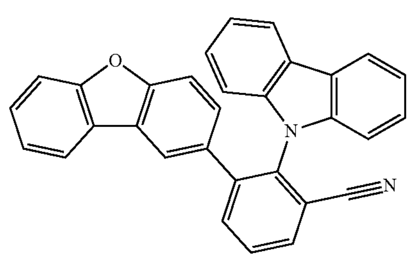

-continued
5
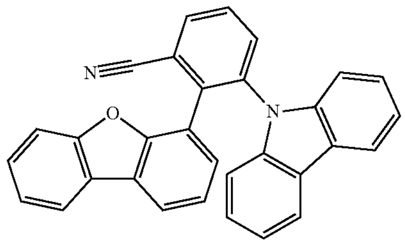
6
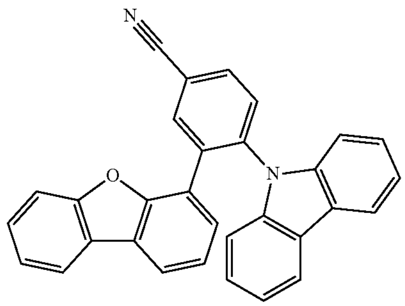
7
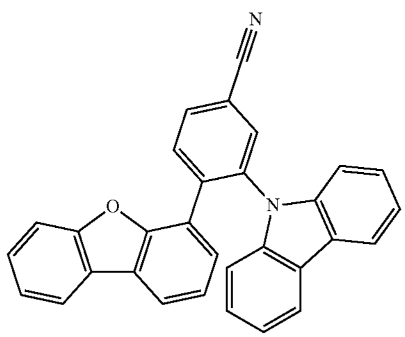
8
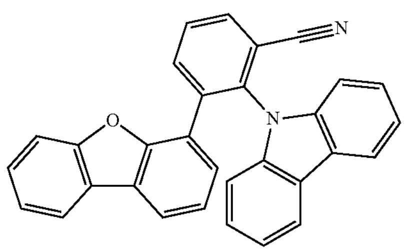
9
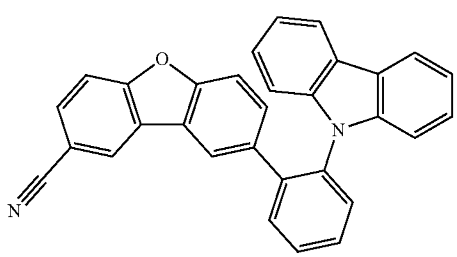
10
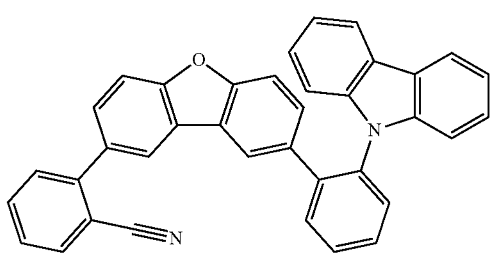
-continued
11
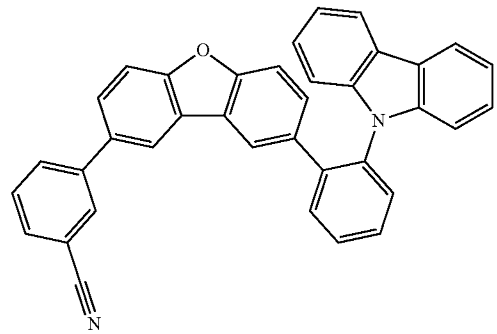
12
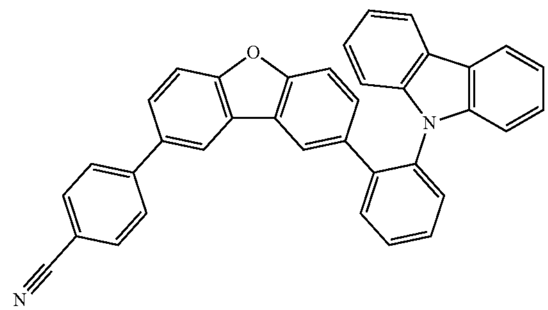
13
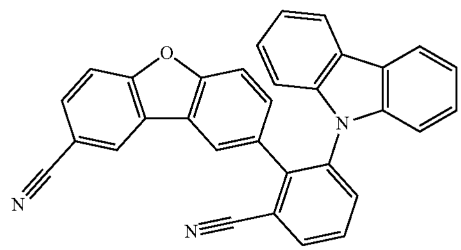
14
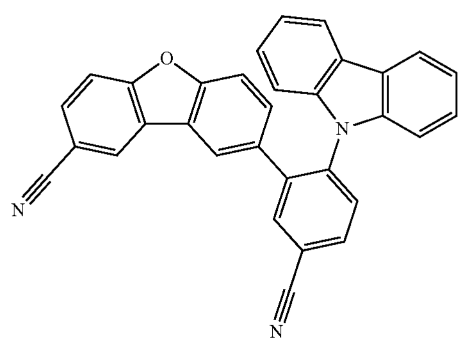
15
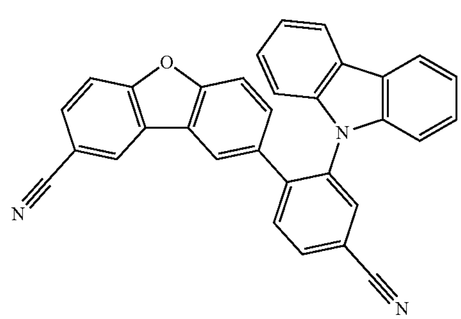

-continued
16
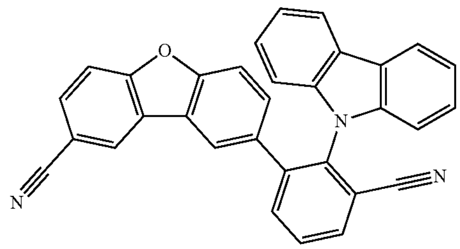
17
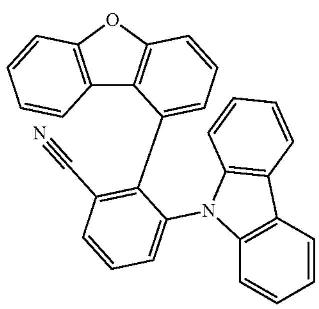
18
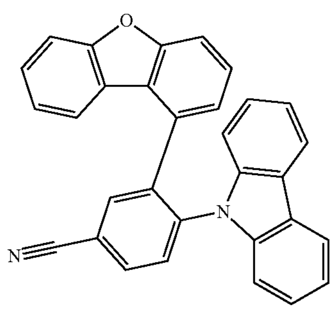
19
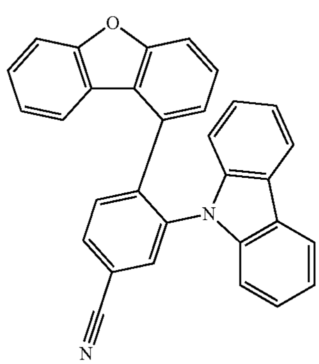
20
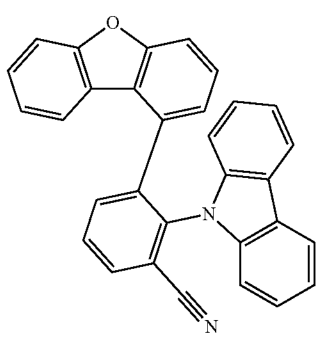
-continued
21
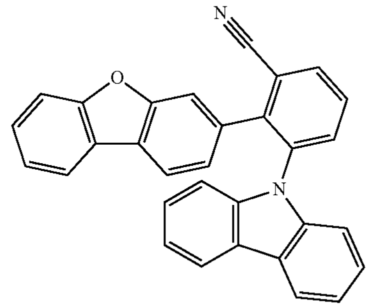
22
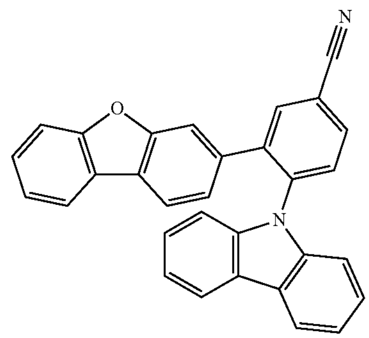
23
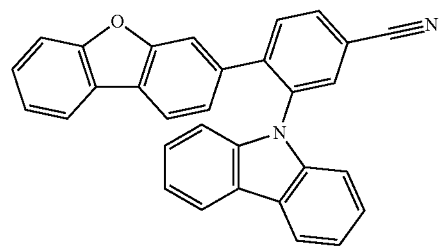
24
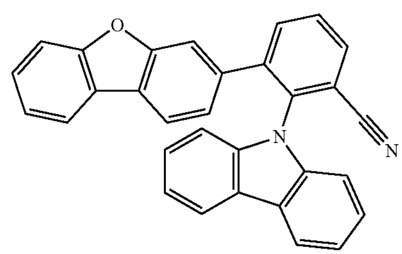
25
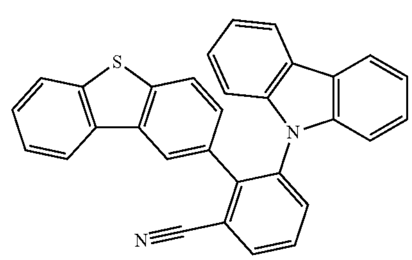

-continued
26
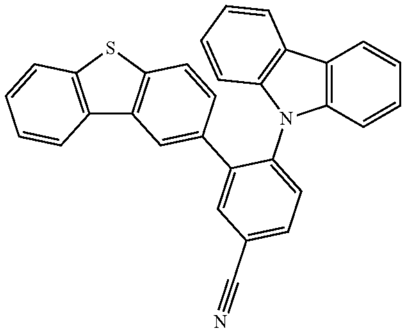
27
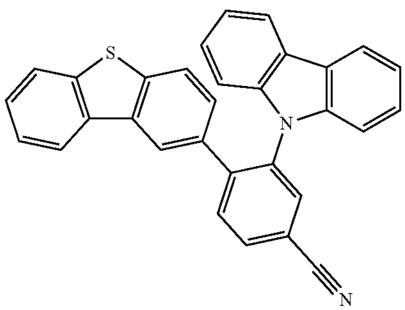
28
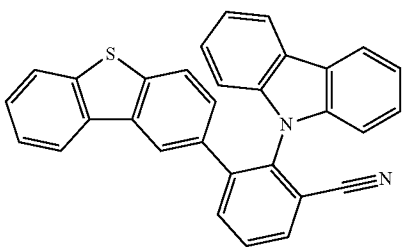
29
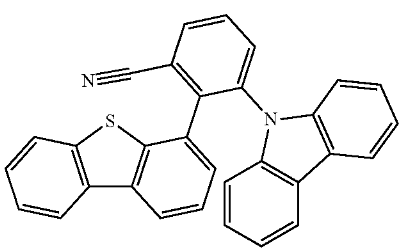
30
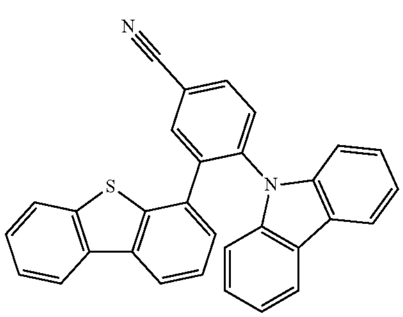
-continued
31
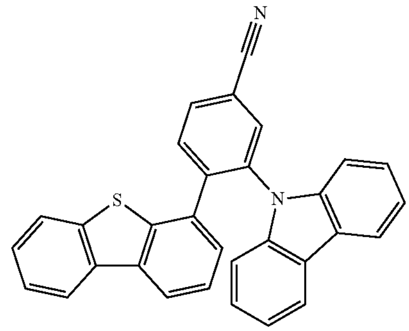
32
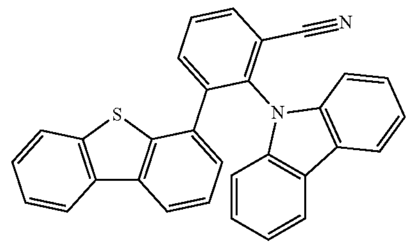
33
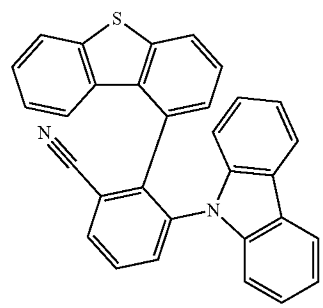
34
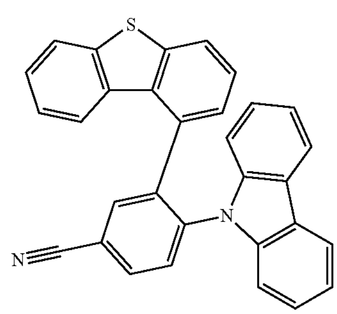
35
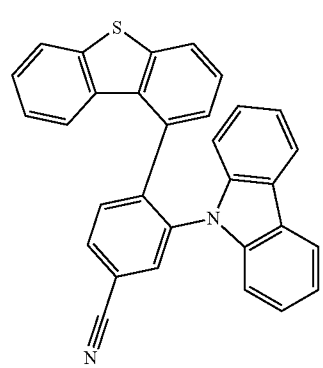

-continued
36
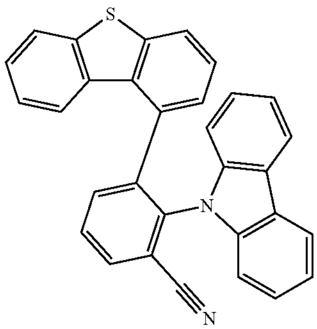
37
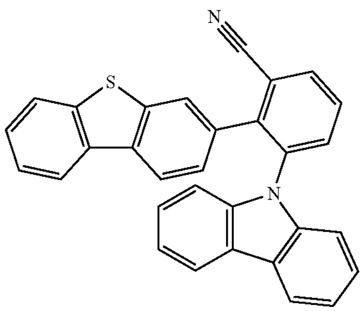
38
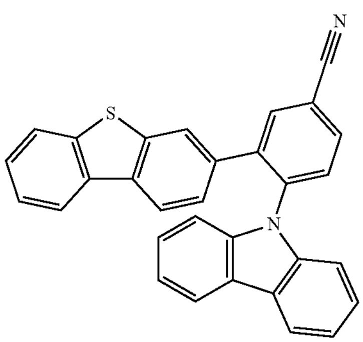
39
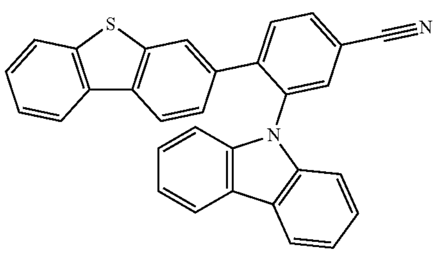
40
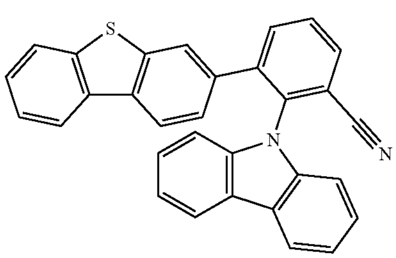
-continued
41
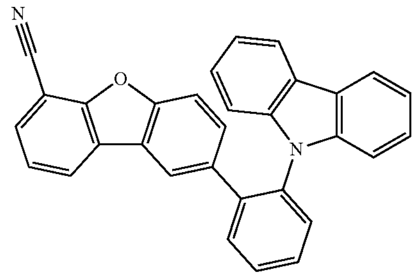
42
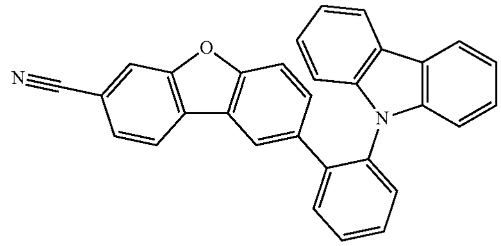
43
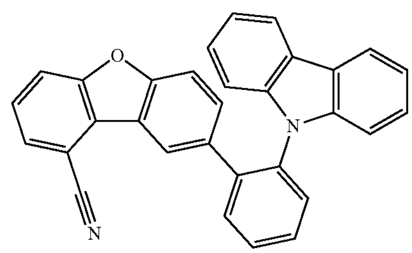
44
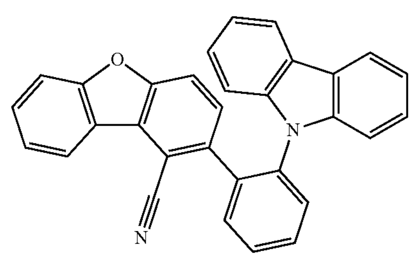
45
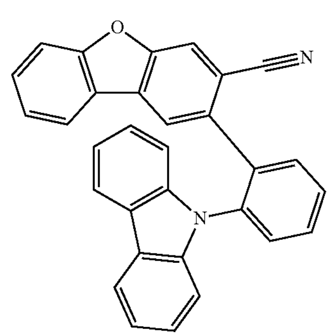

-continued
46
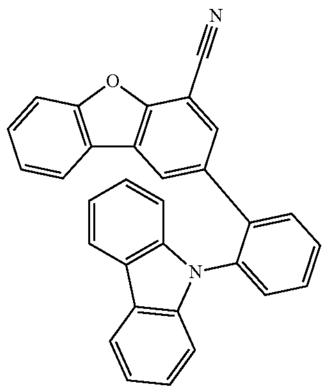
47
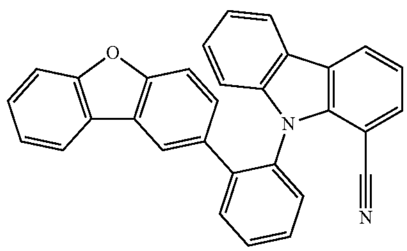
48
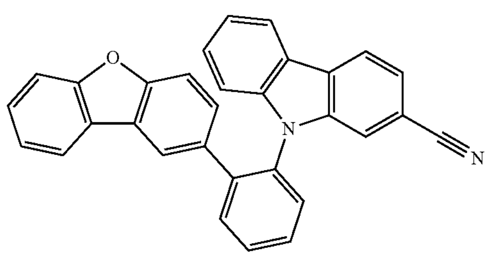
49
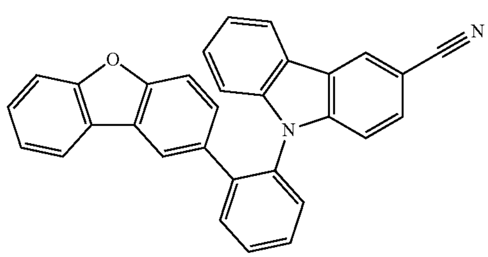
50
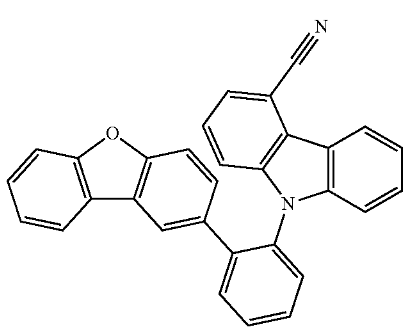
-continued
51
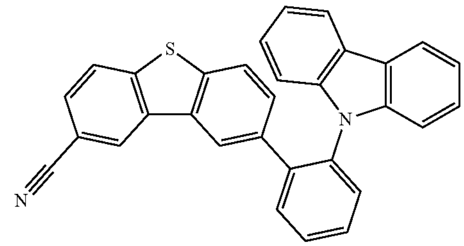
52
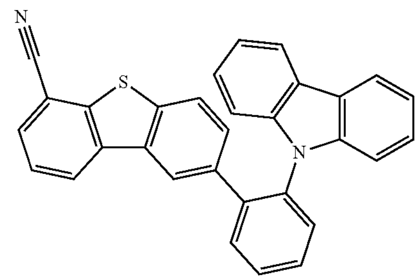
53
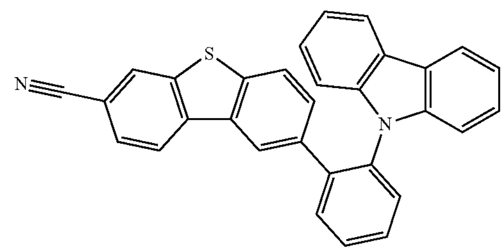
54
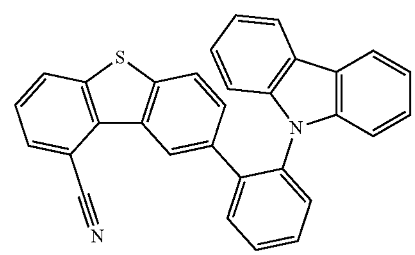
55
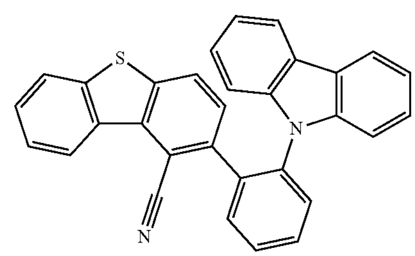
56
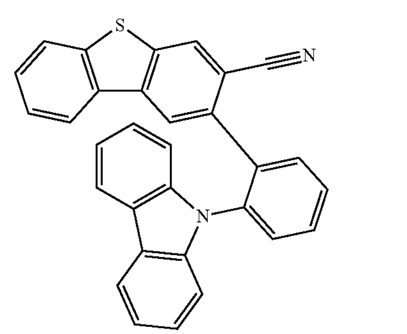

-continued
57
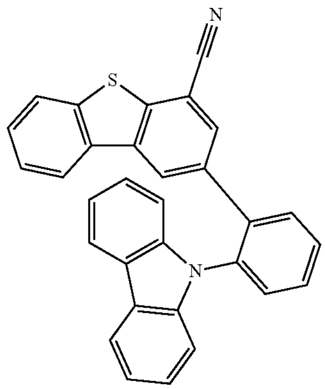
58
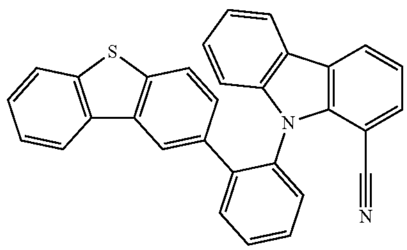
59
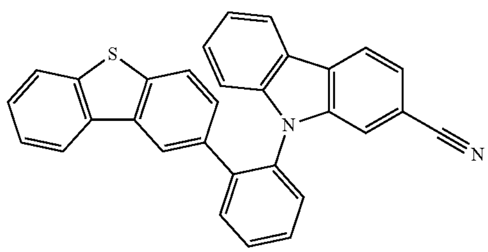
60
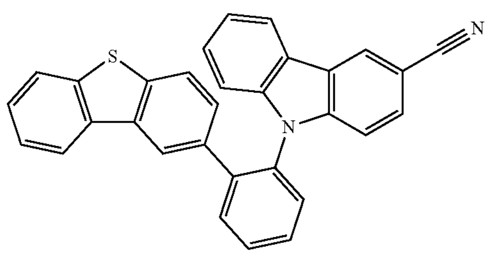
61
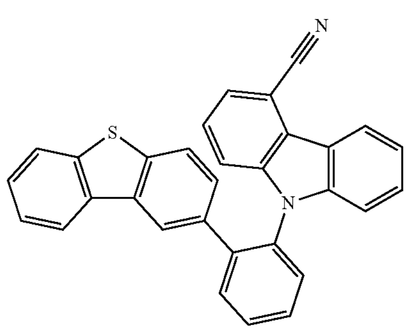
-continued
62
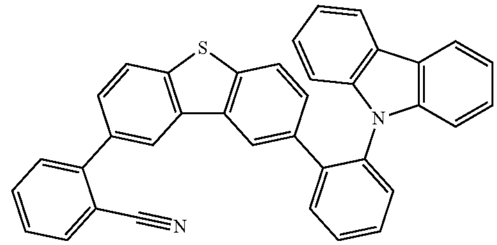
63
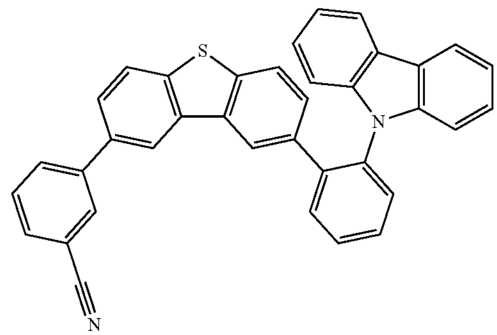
64
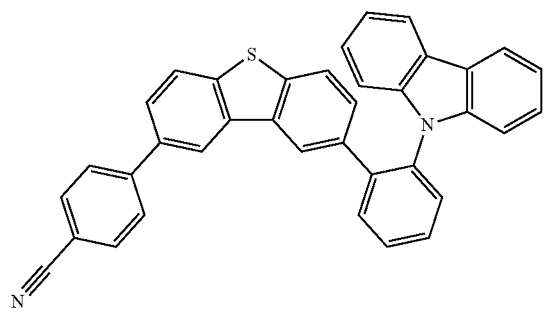
65
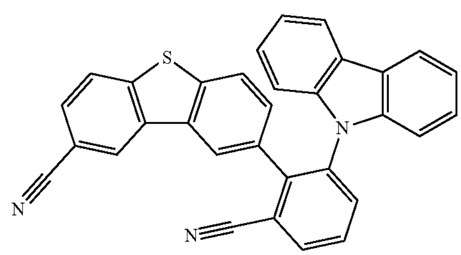
66
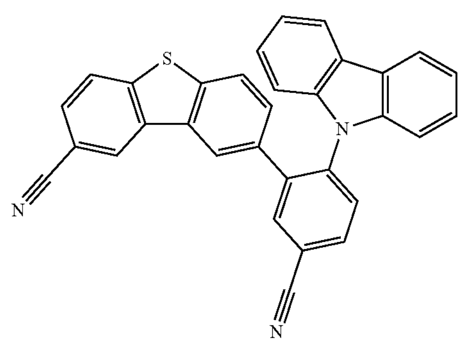

-continued
67
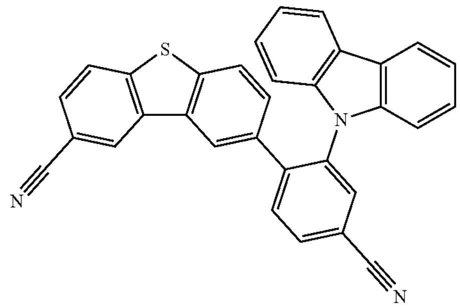
68
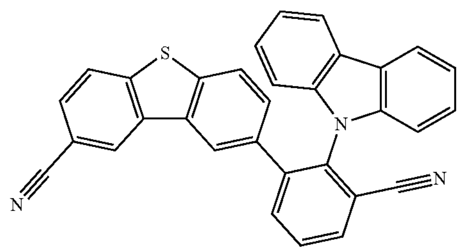
69
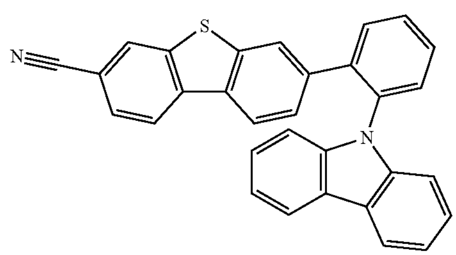
70
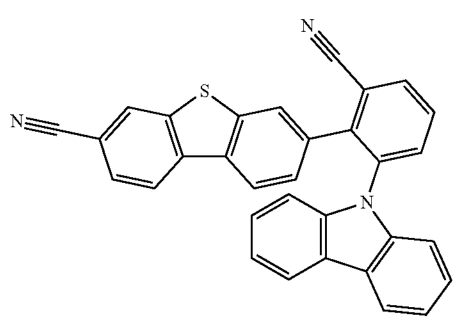
71
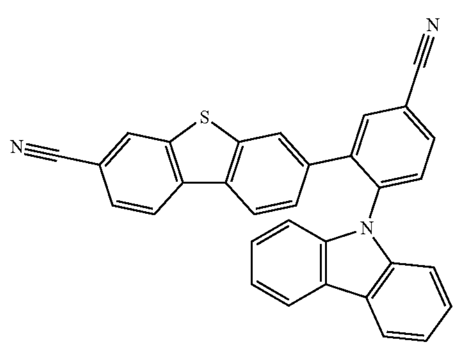
-continued
72
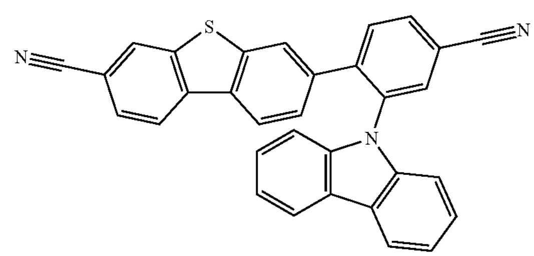
73
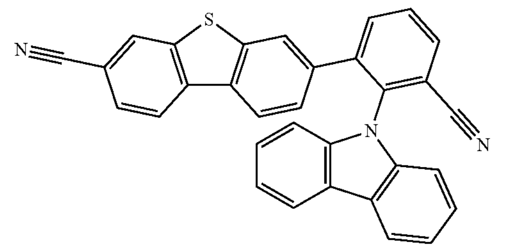
74
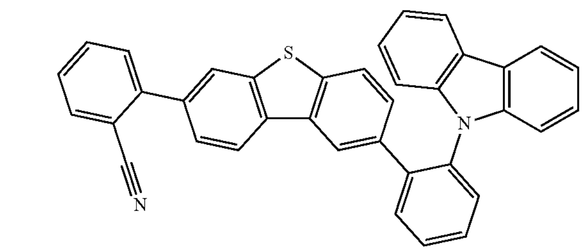
75
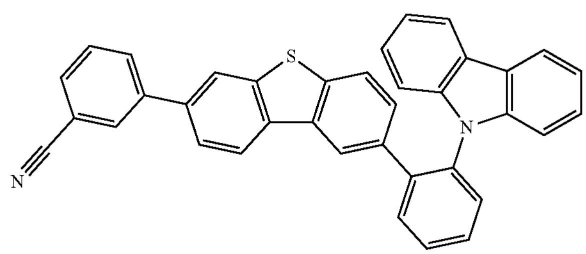
76
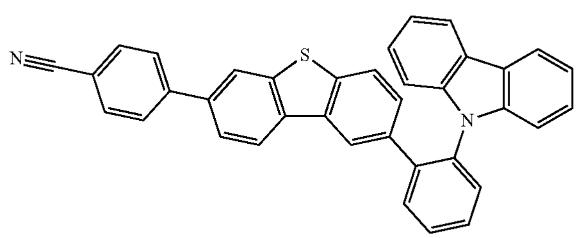
77
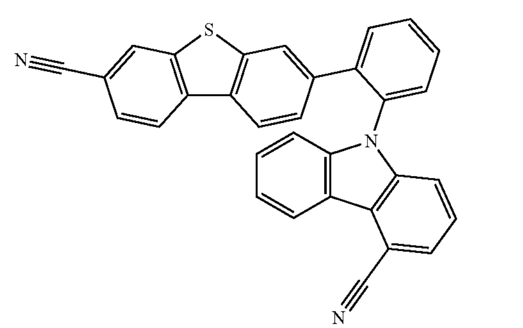

-continued
78
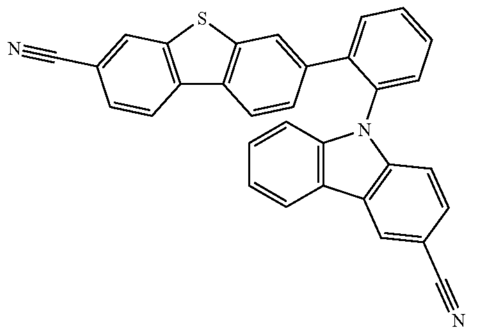
79
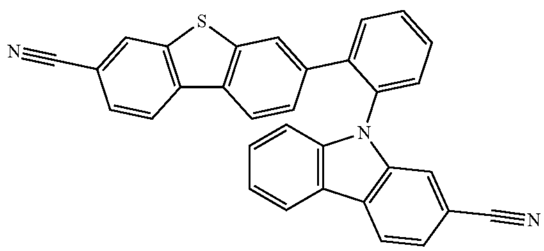
80
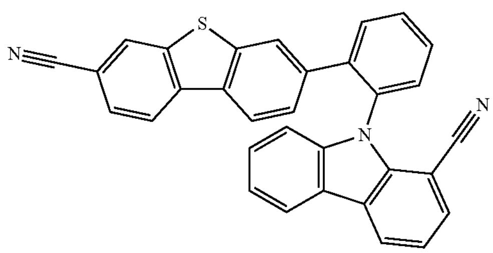
81
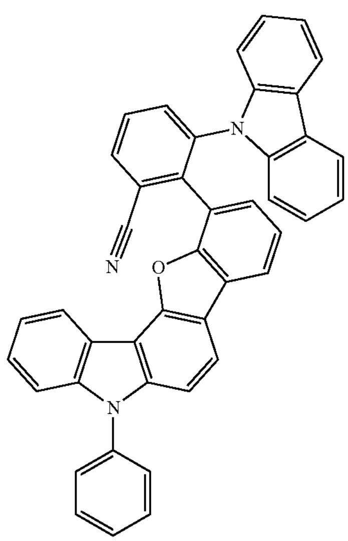
-continued
82
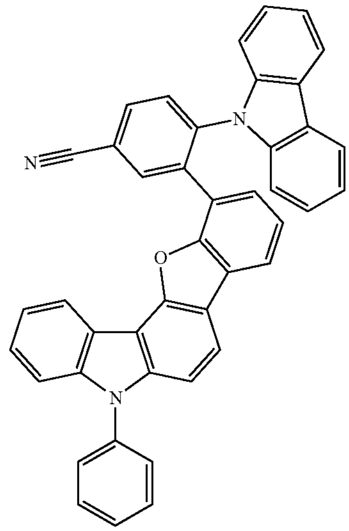
83
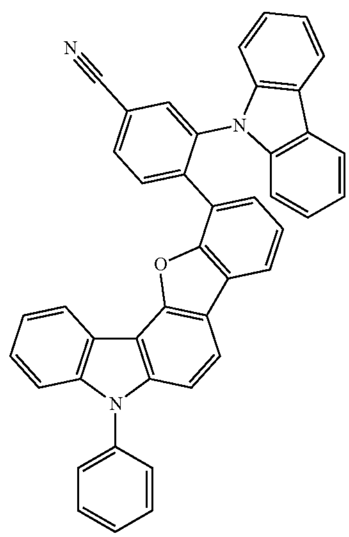
84
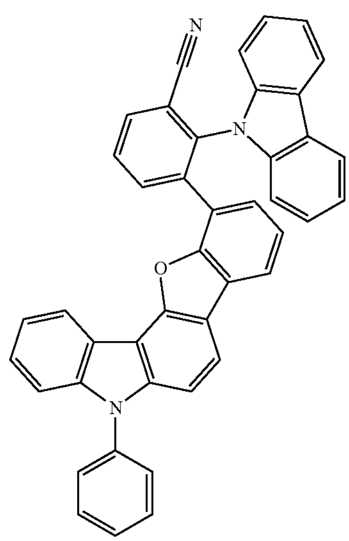

-continued
85
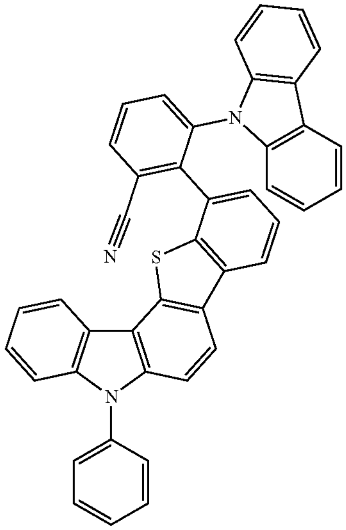
86
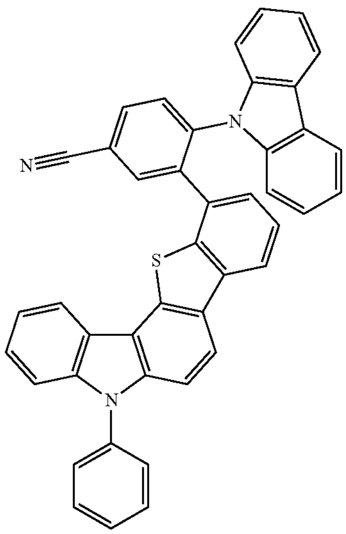
87
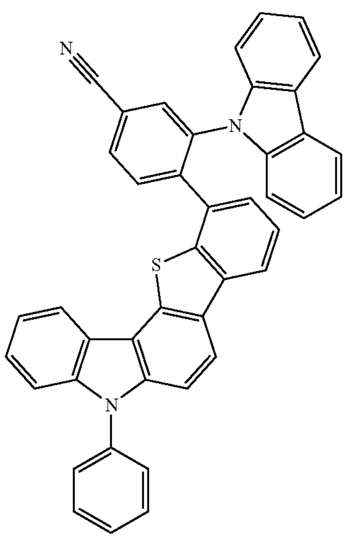
-continued
88
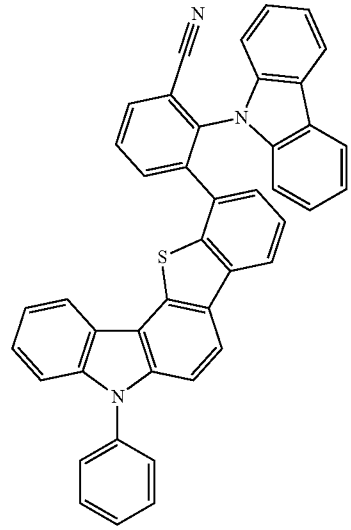
89
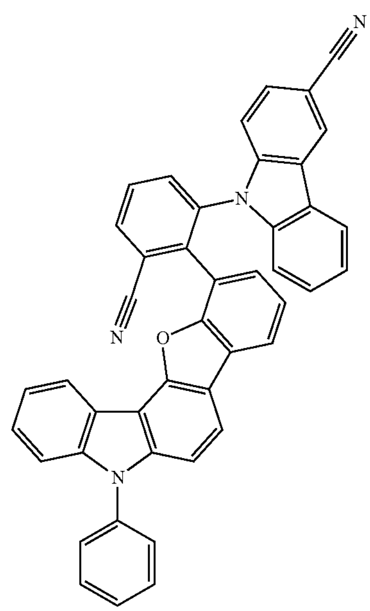

-continued
90
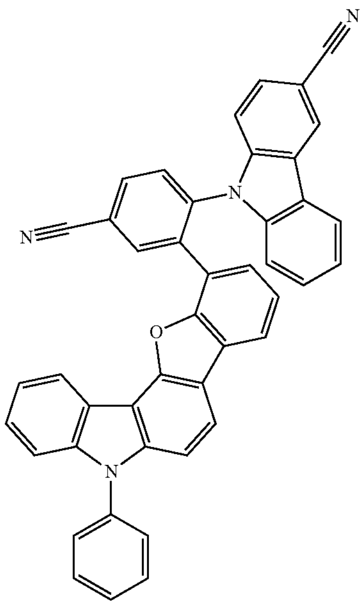
91
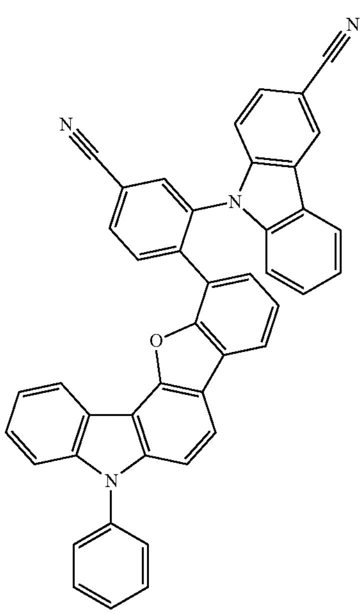
-continued
92
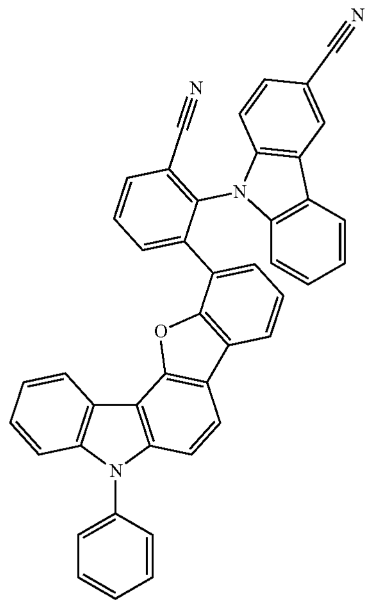
93
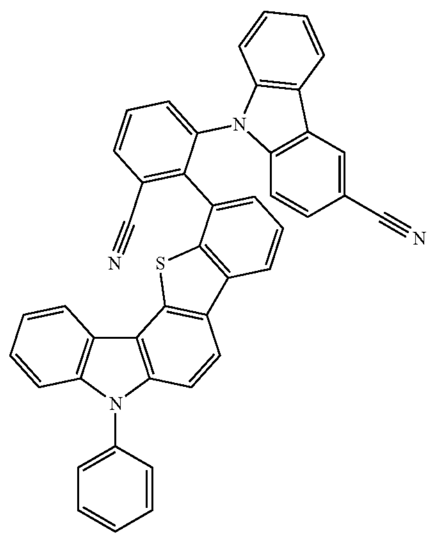
94
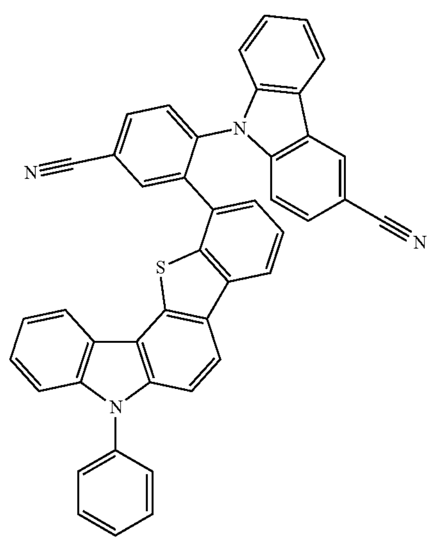

-continued
95
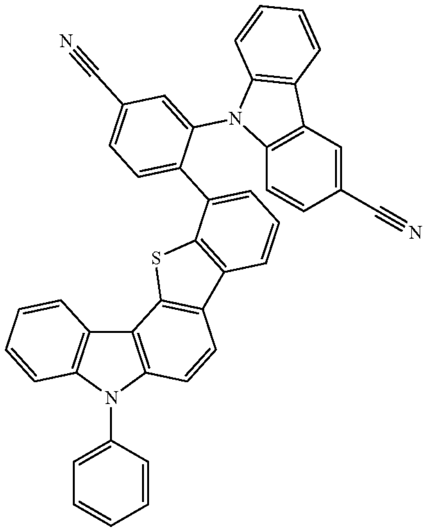
96
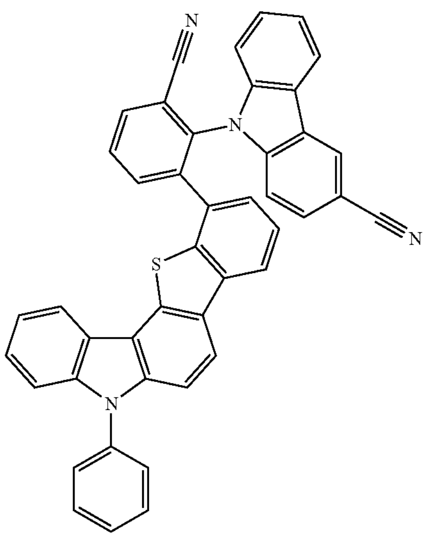
97
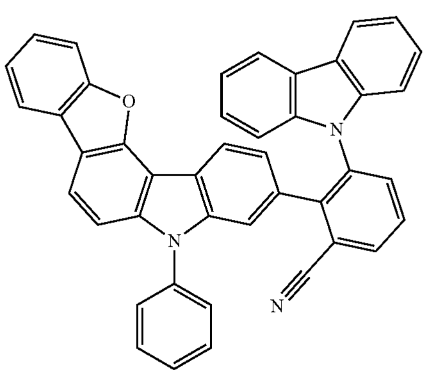
-continued
98
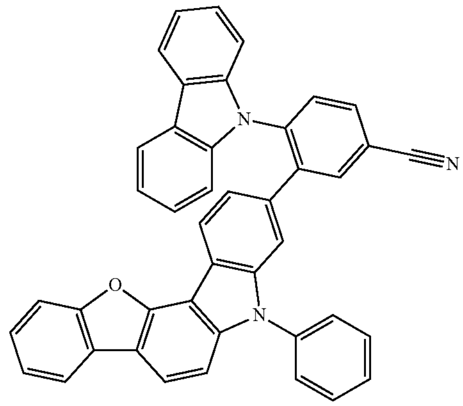
99
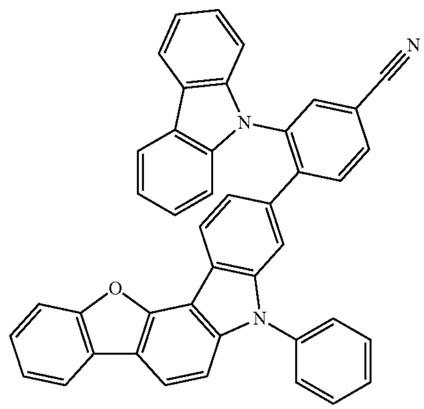
100
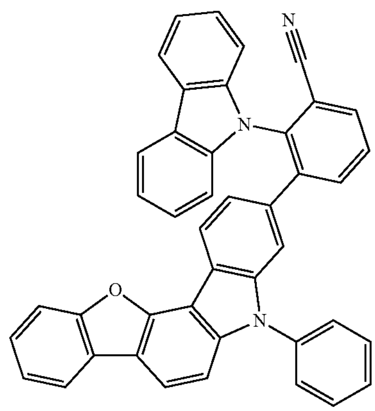
101
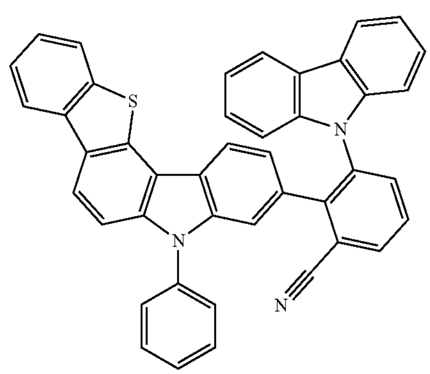

-continued
102
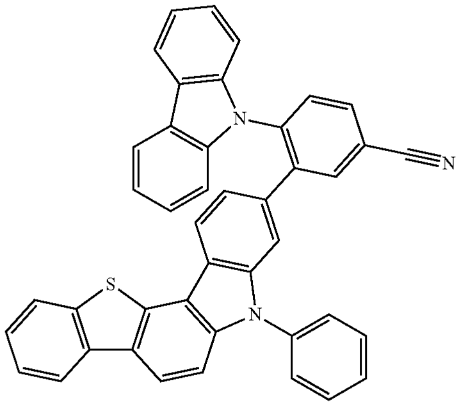
103
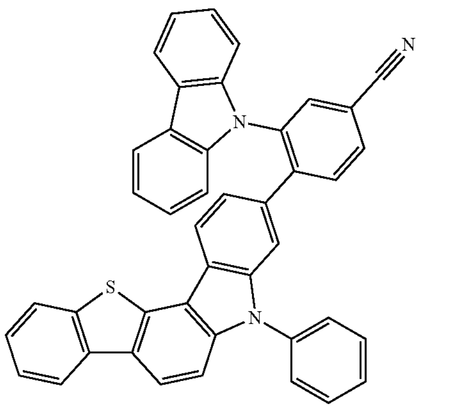
104
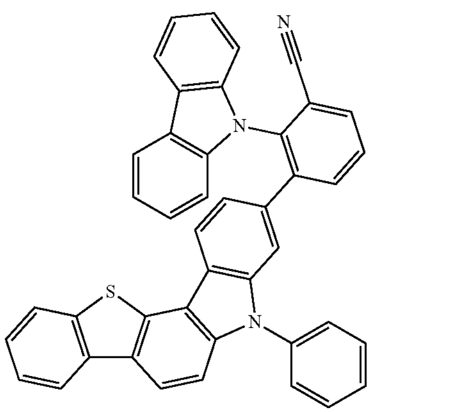
105
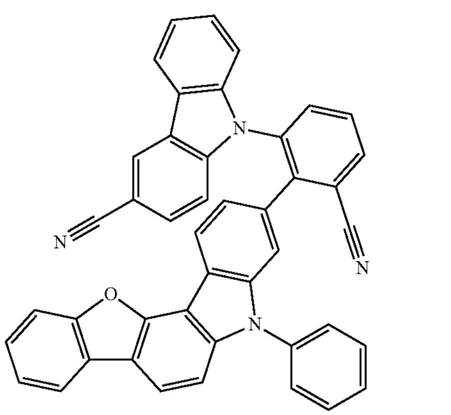
-continued
106
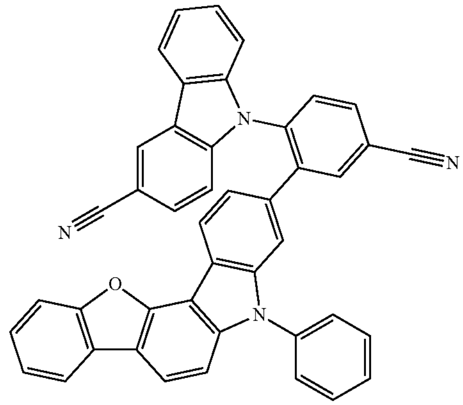
107
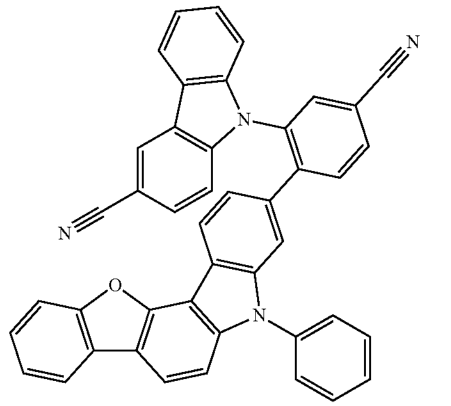
108
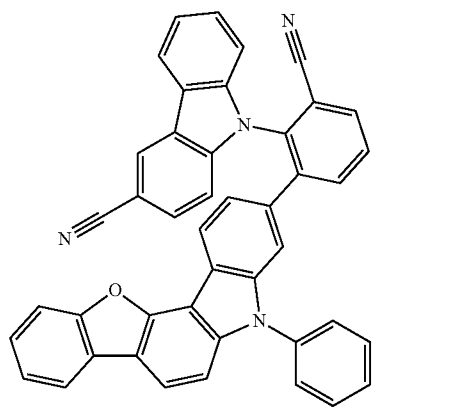
109
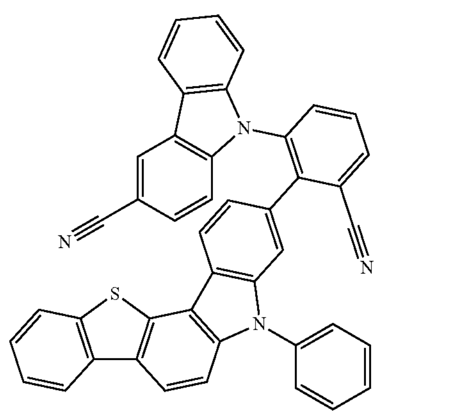

-continued
110
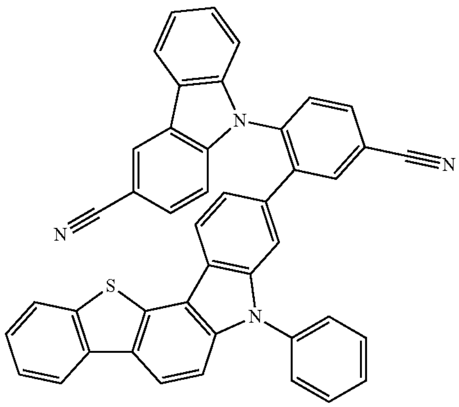
111
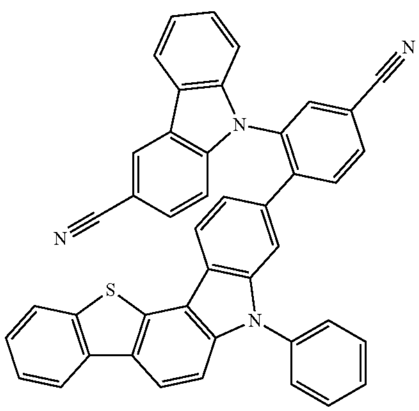
112
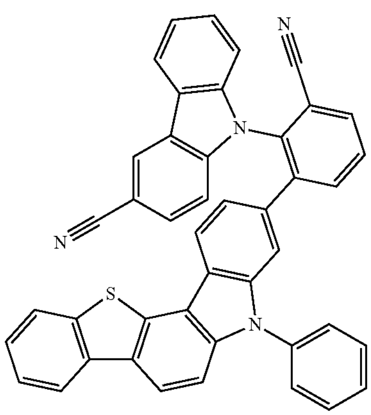
113
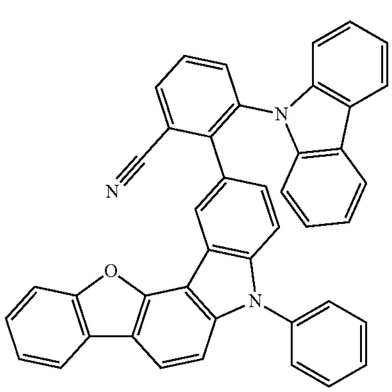
-continued
114
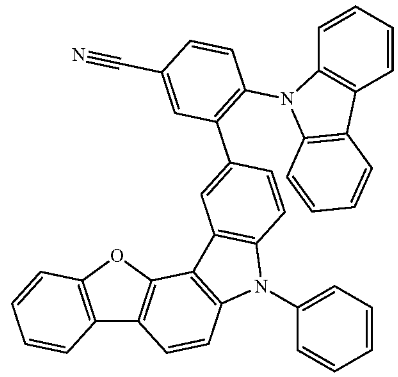
115
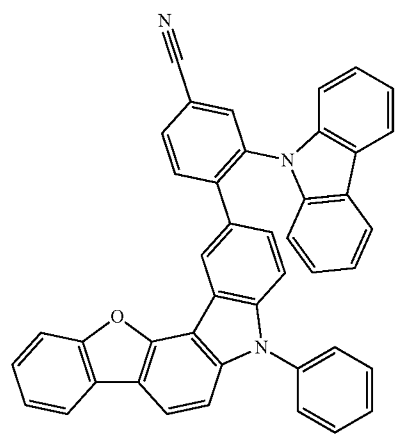
116
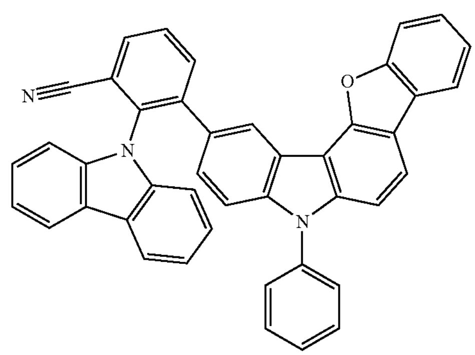
117
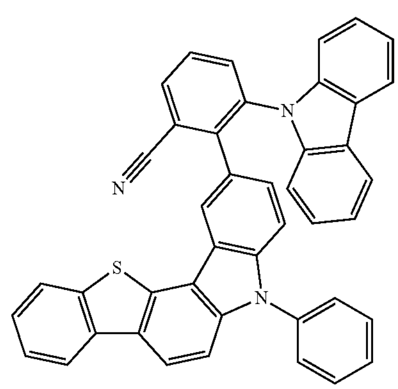

-continued
118
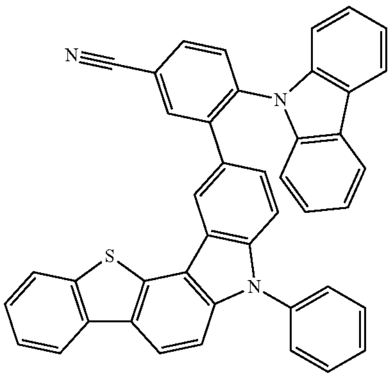
119
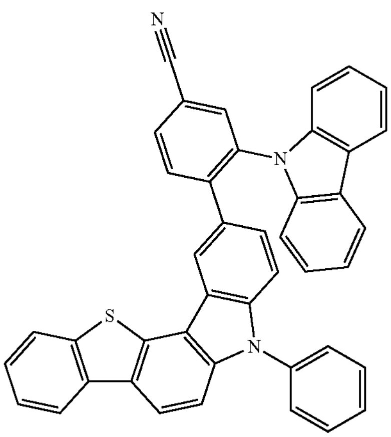
120
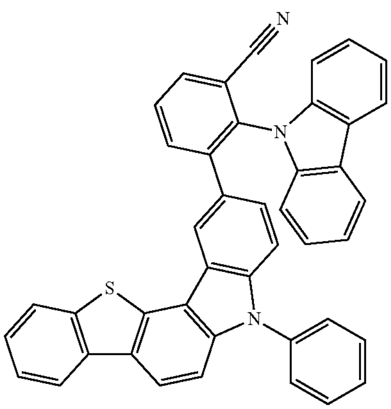
121
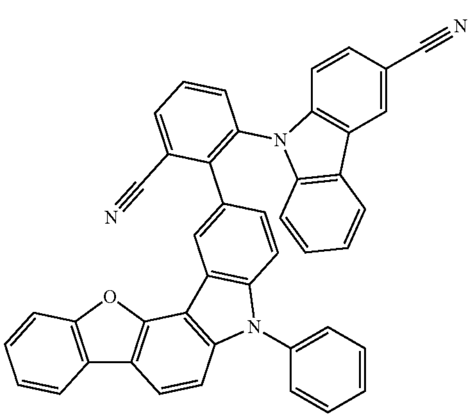
-continued
122
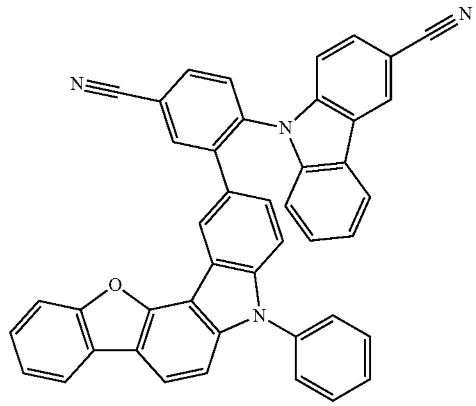
123
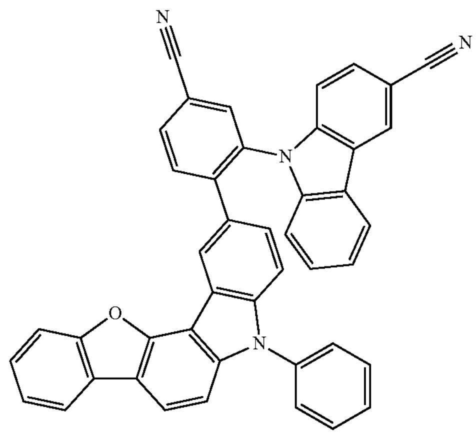
124
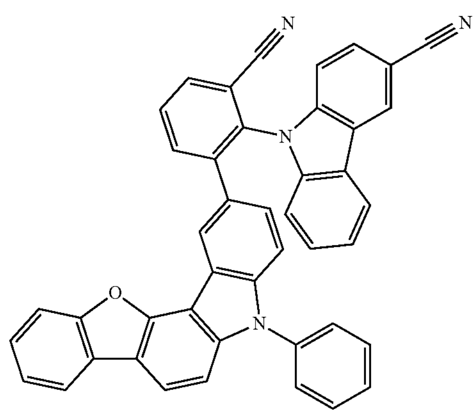
125
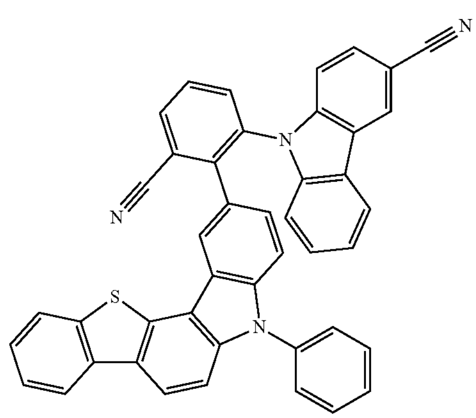

126
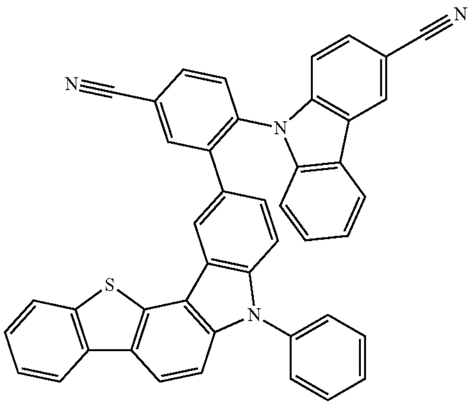
127
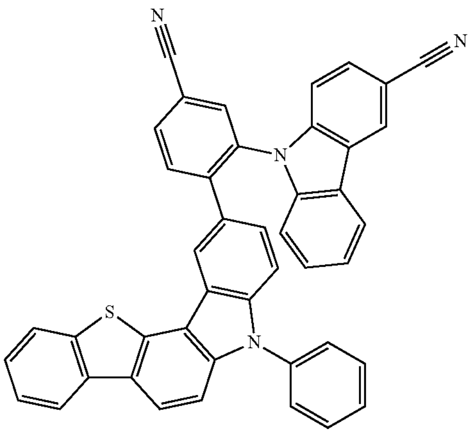
128
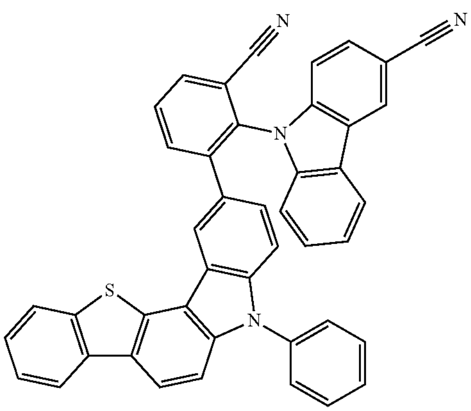
129
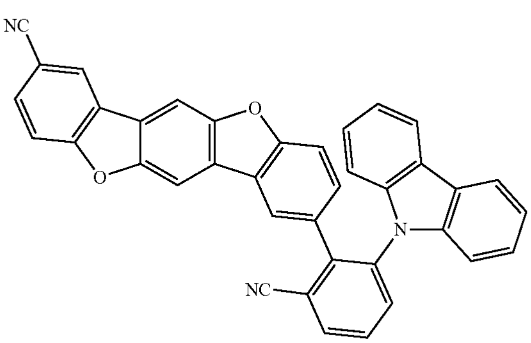
130
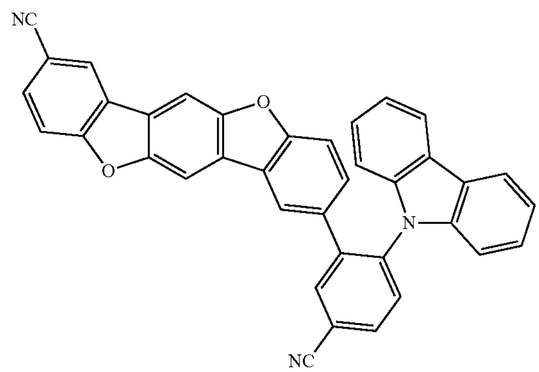
131
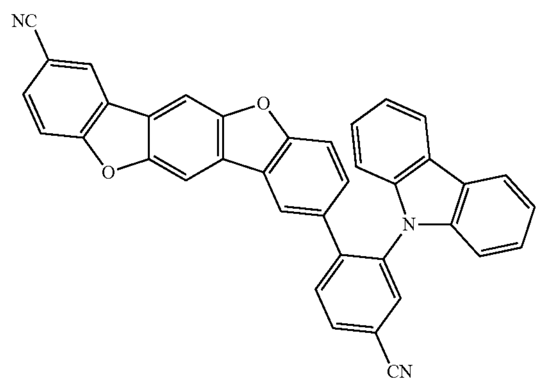
132
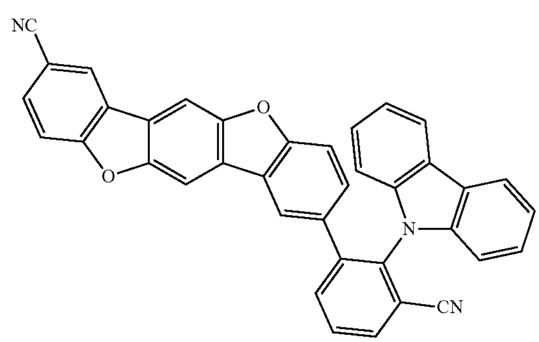
133
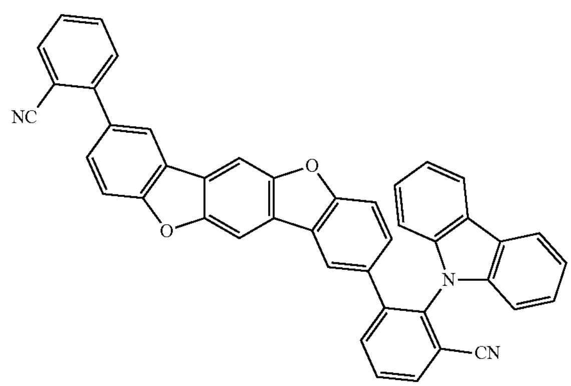

-continued
134
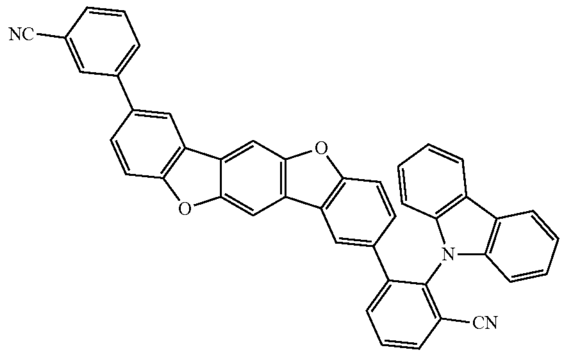
135
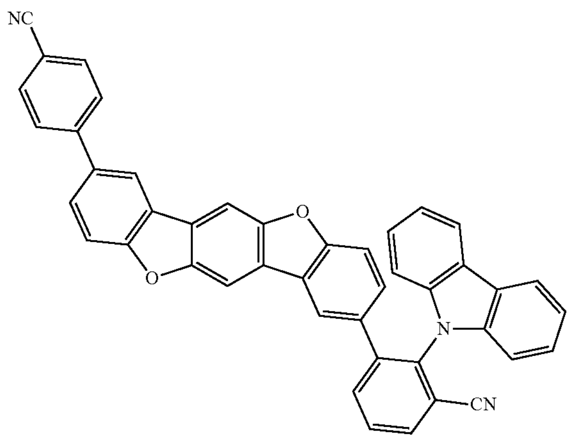
136
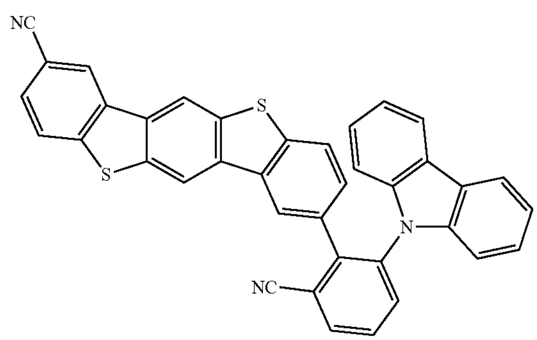
137
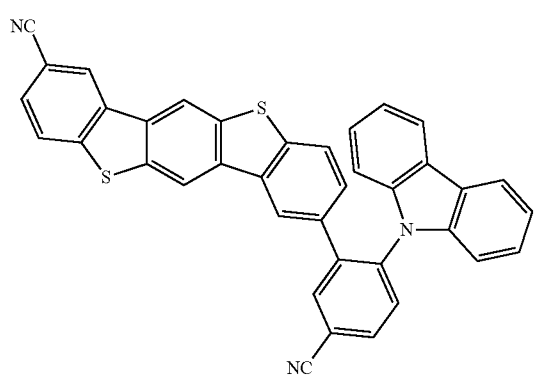
-continued
138
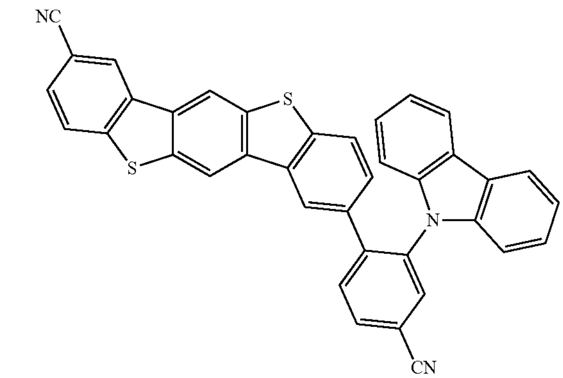
139
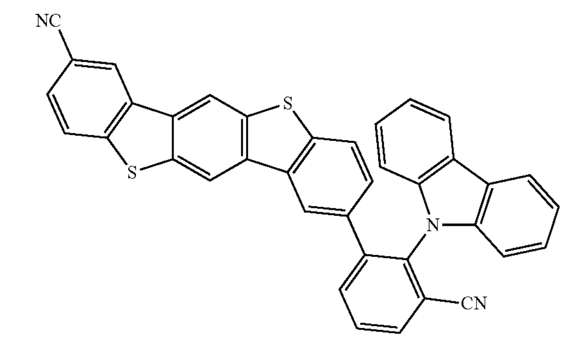
140
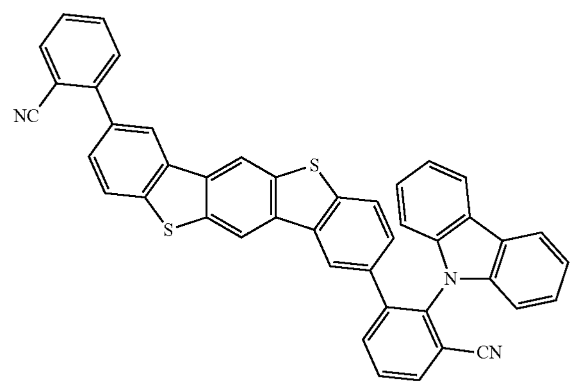
141
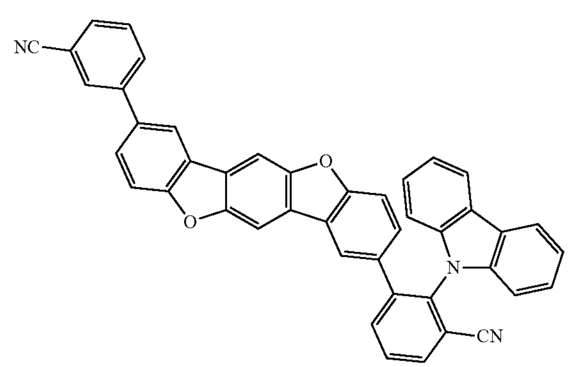

142
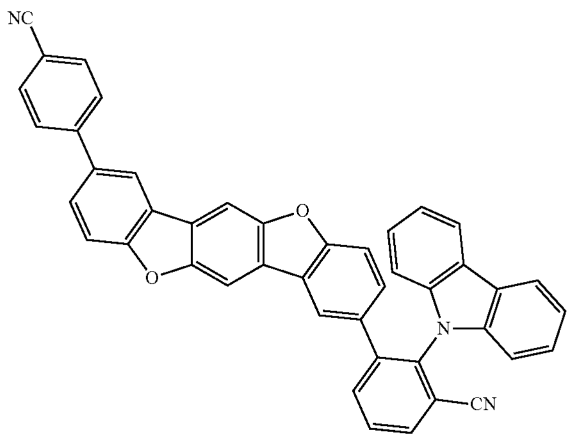
143
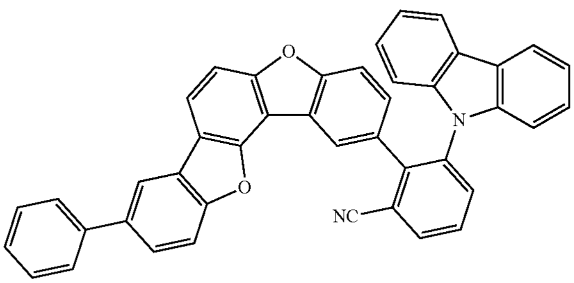
144
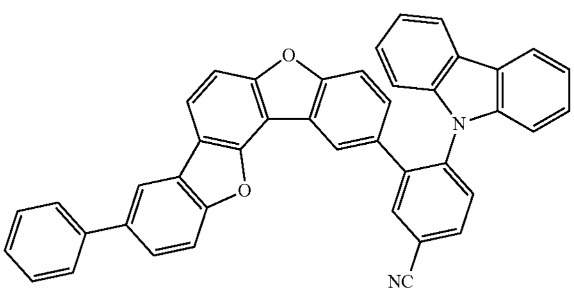
145
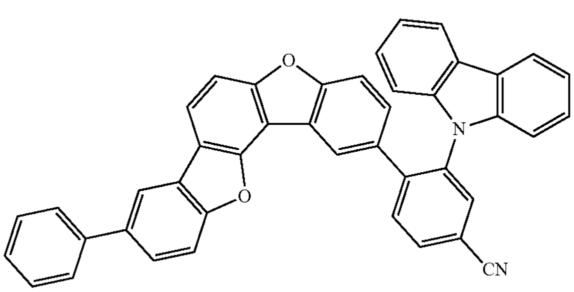
146
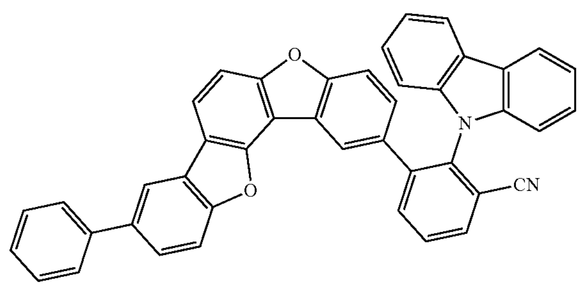
147
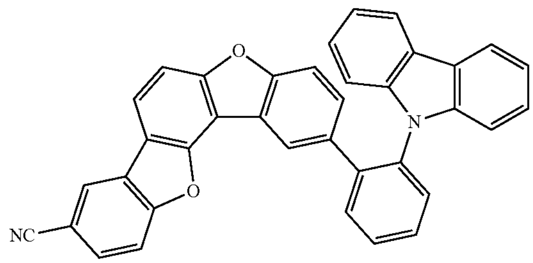
148
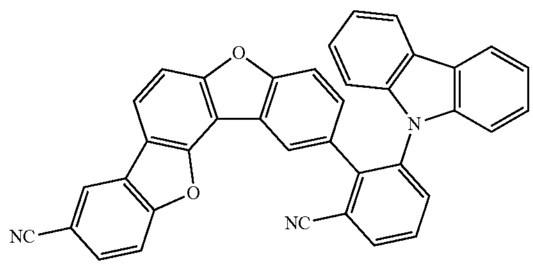
149
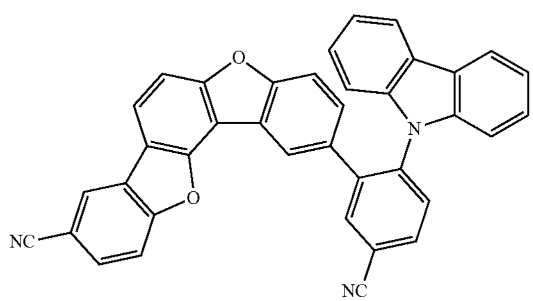
150
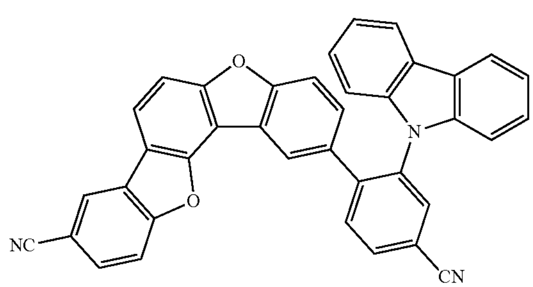

-continued
151
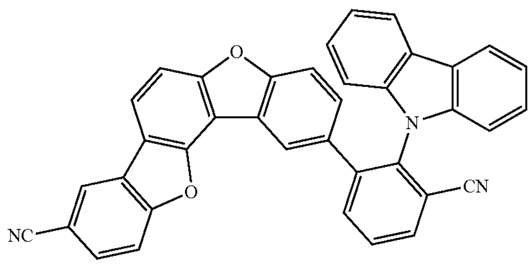
152
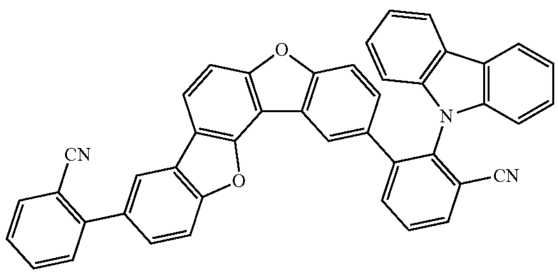
153
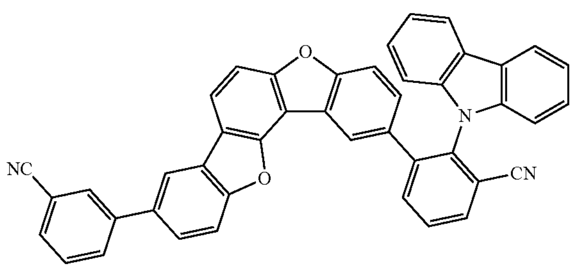
154
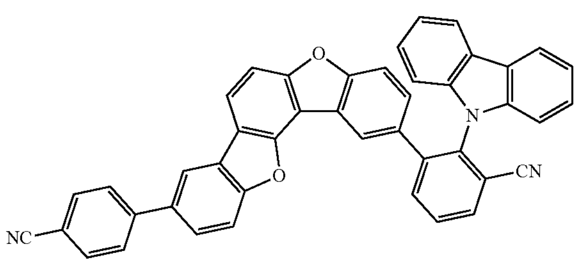
155
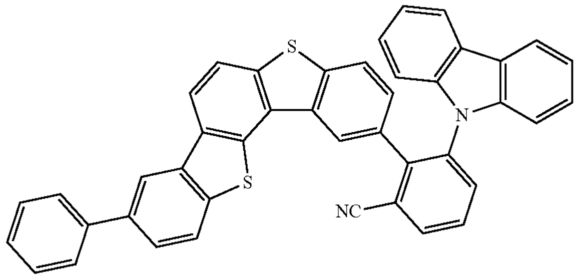
-continued
156
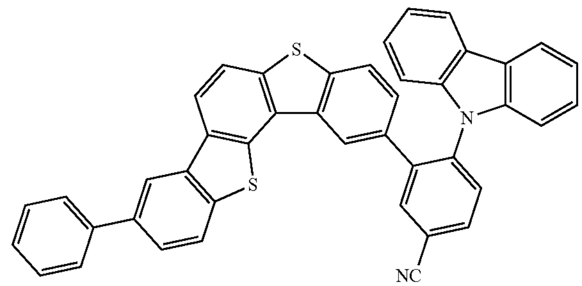
157
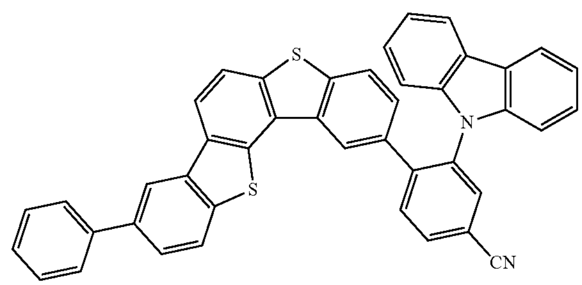
158
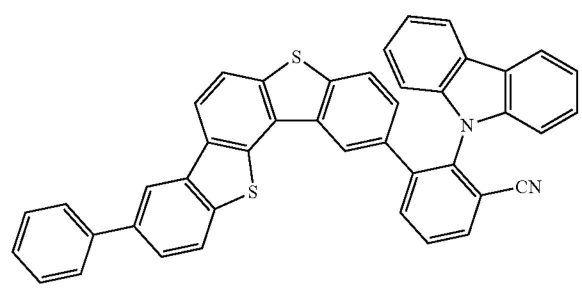
159
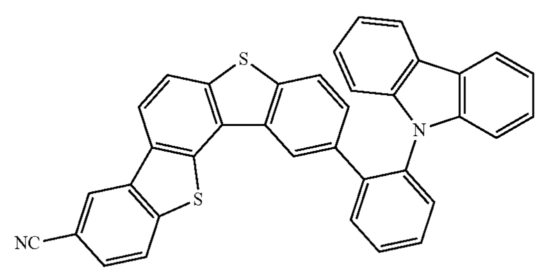
160
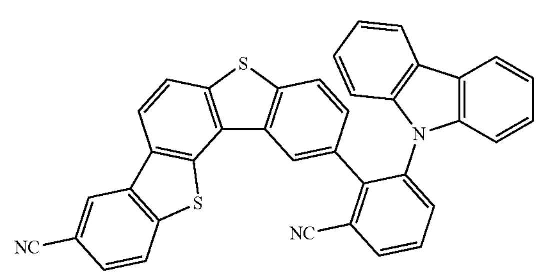

-continued
161
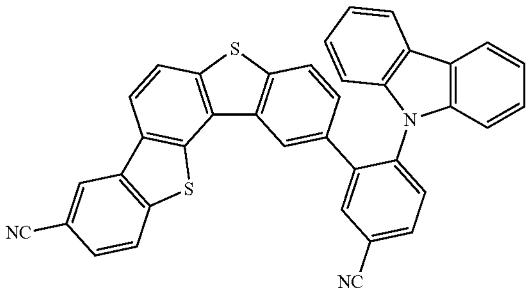
162
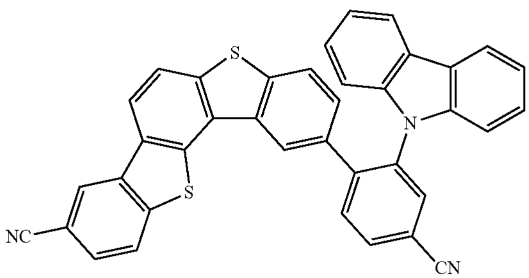
163
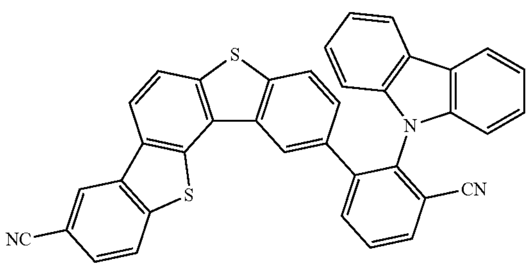
164
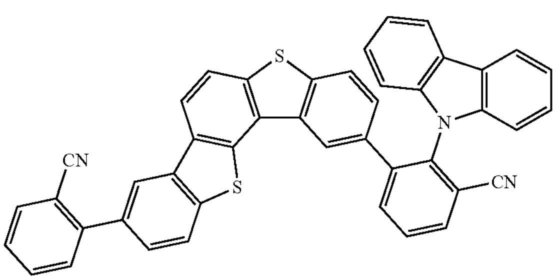
165
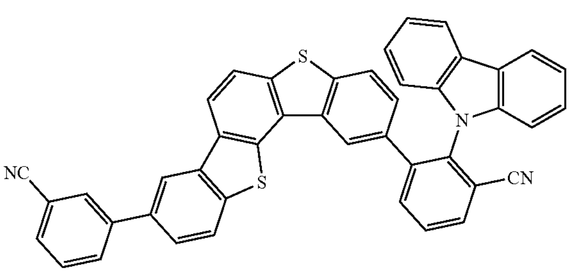
-continued
166
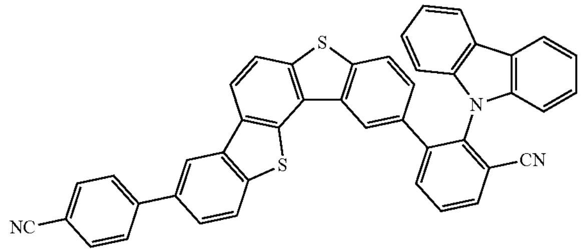
167
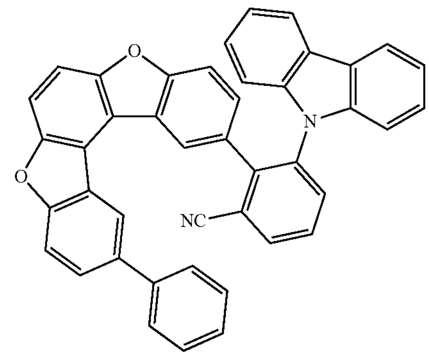
168
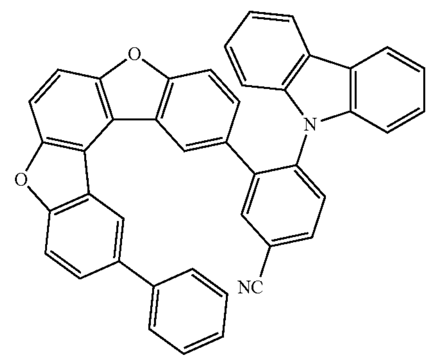
169
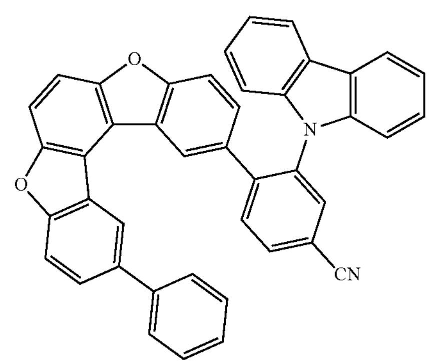

-continued
170
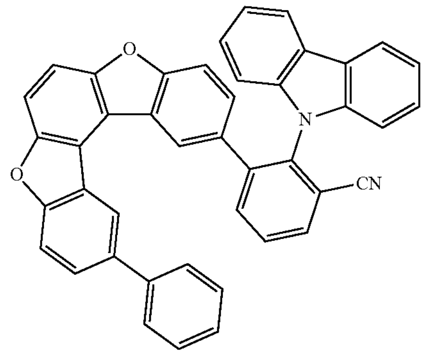
171
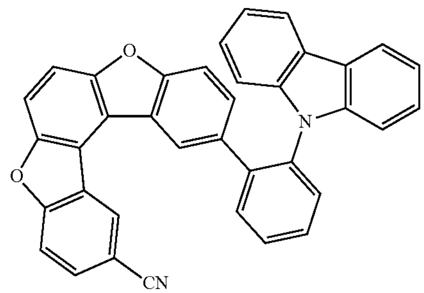
172
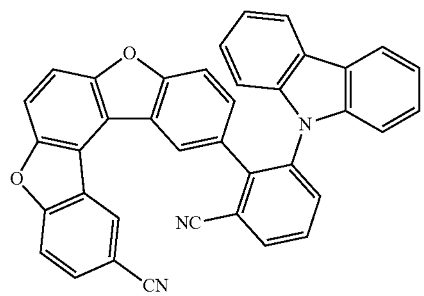
173
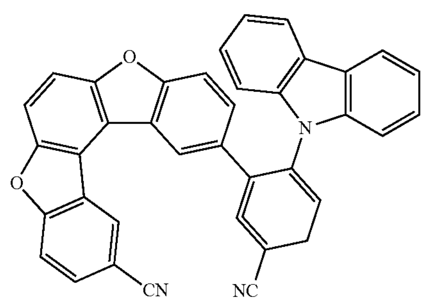
174
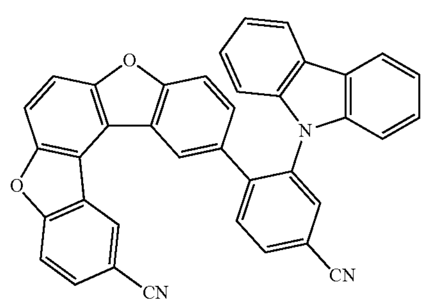
-continued
175
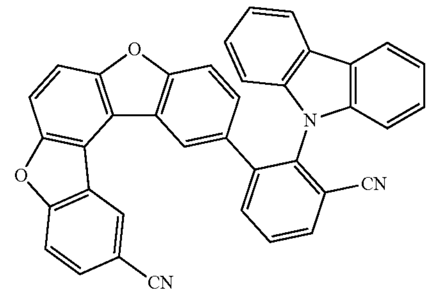
176
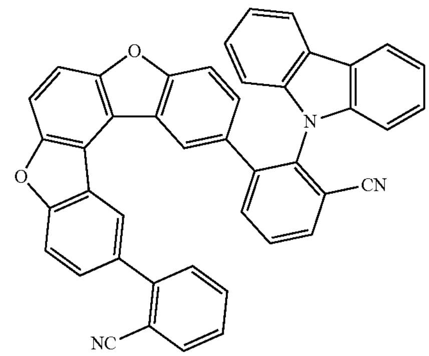
177
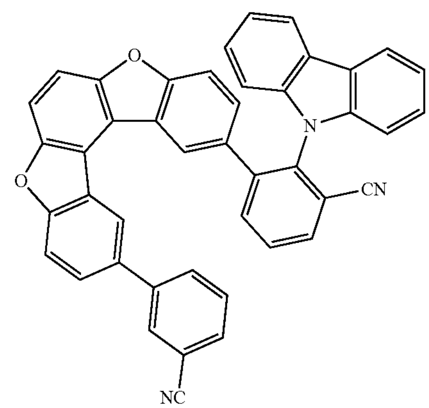
178
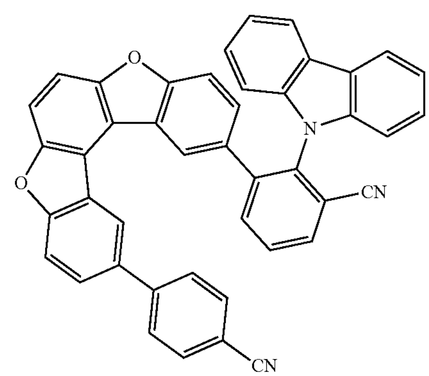

-continued
179
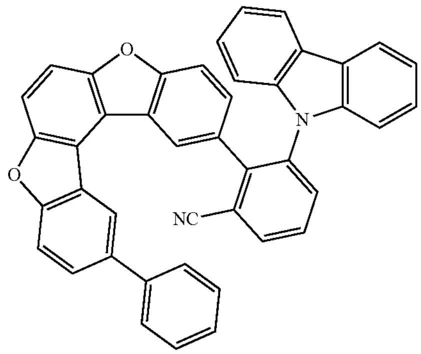
180
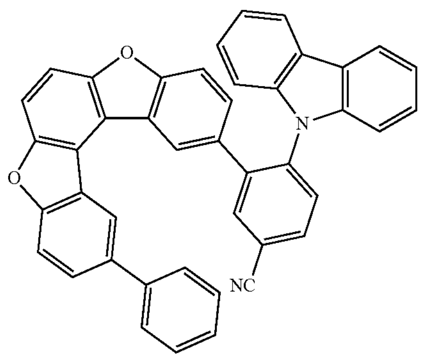
181
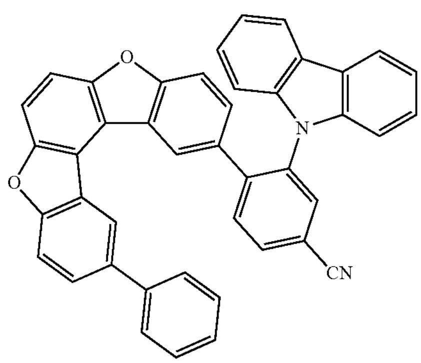
182
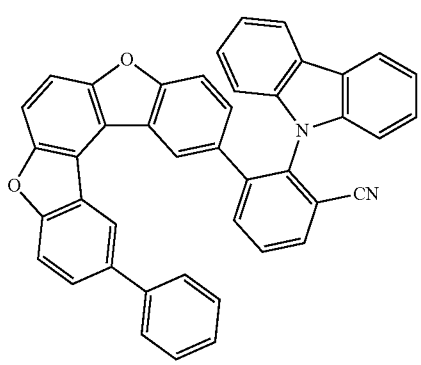
-continued
183
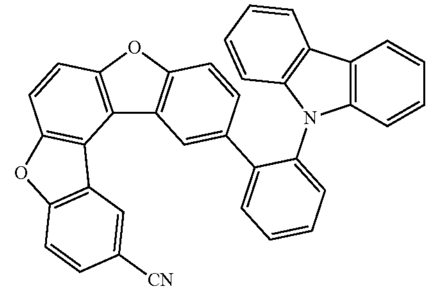
184
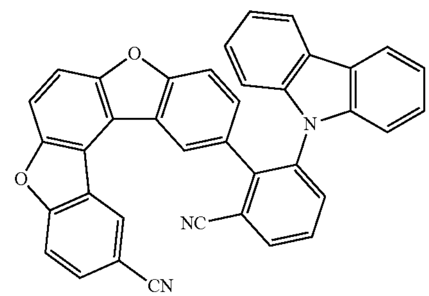
185
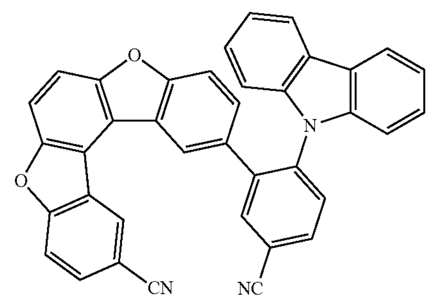
186
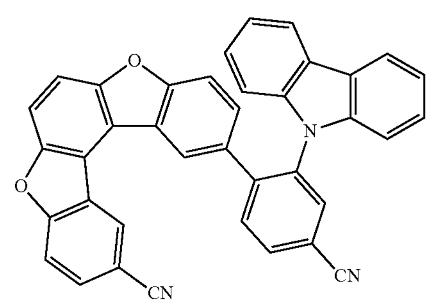
187
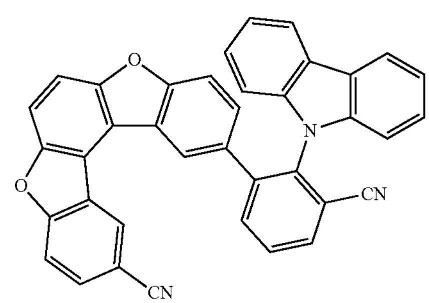

188
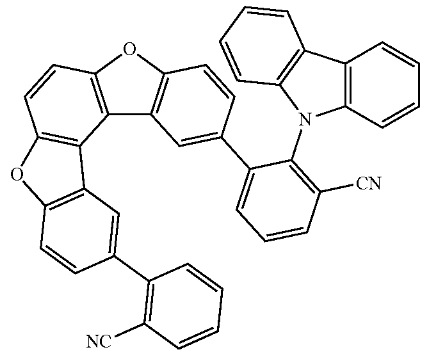
189
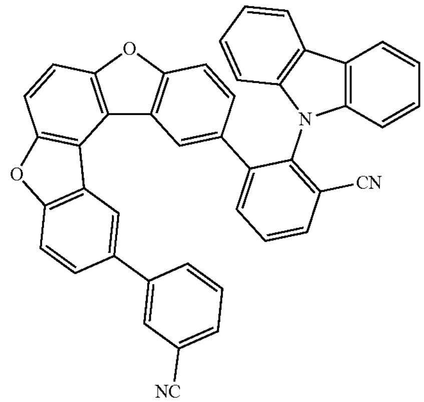
190
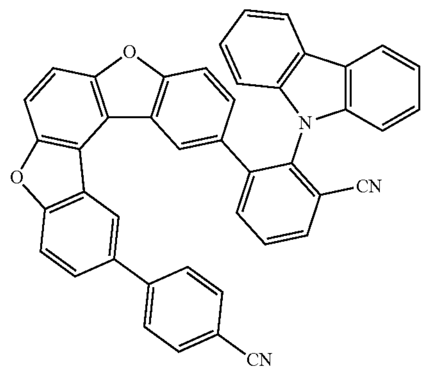
191
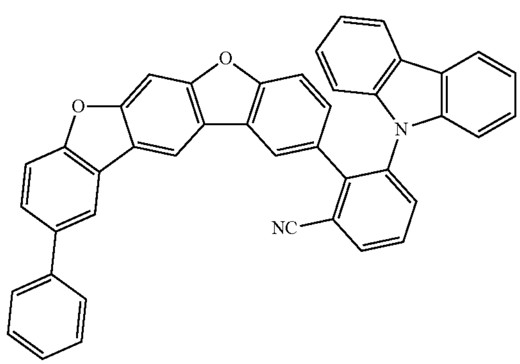
192
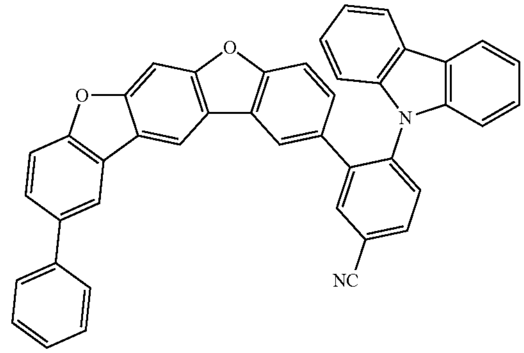
193
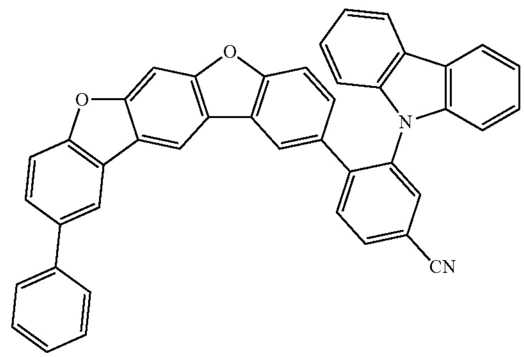
194
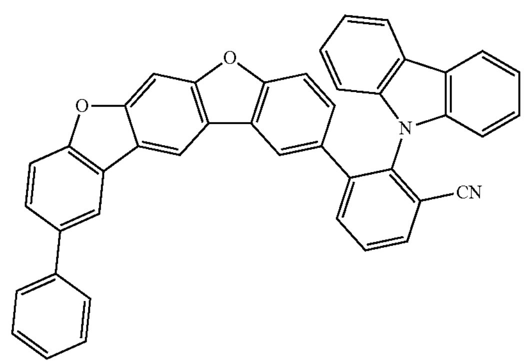
195
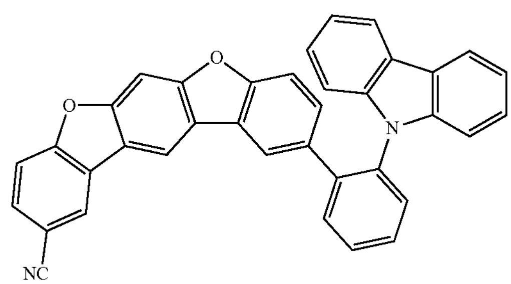

-continued
196
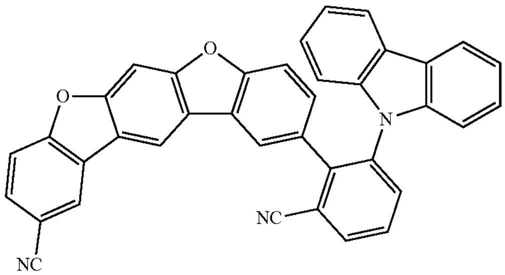
197
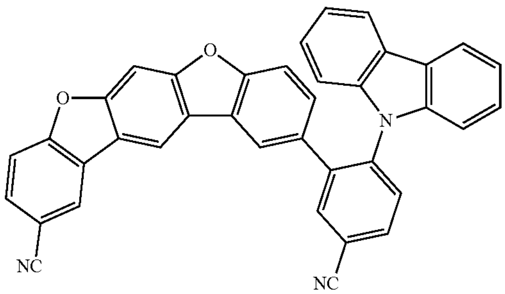
198
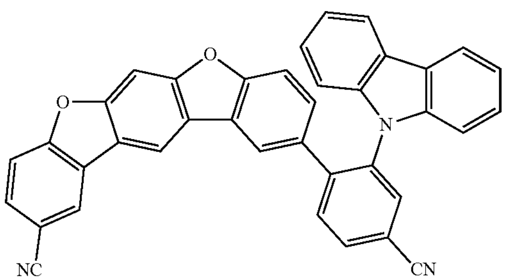
199
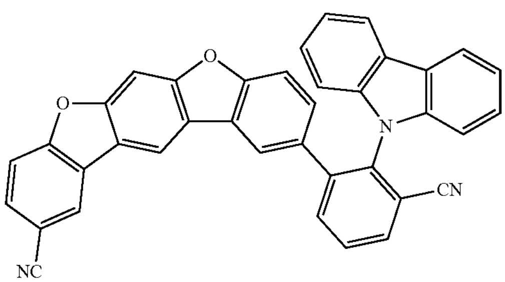
200
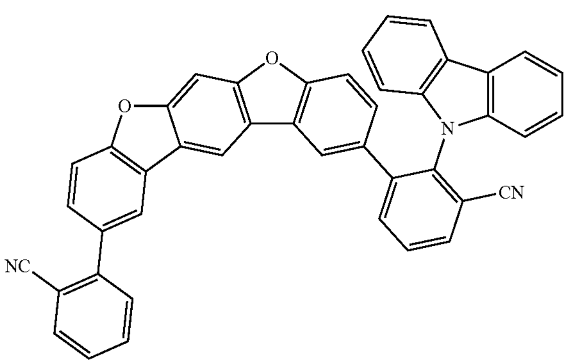
-continued
201
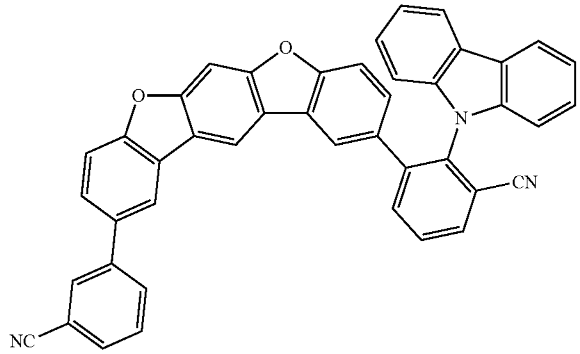
202
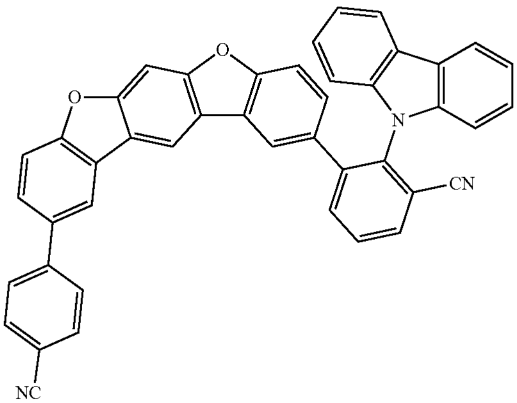
203
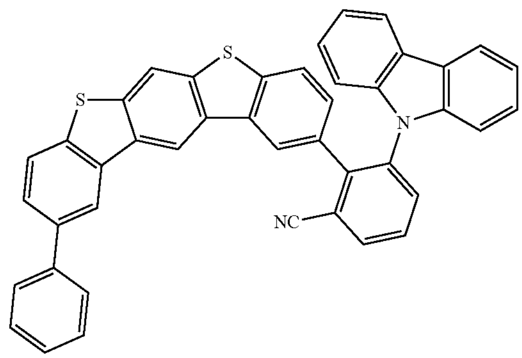
204
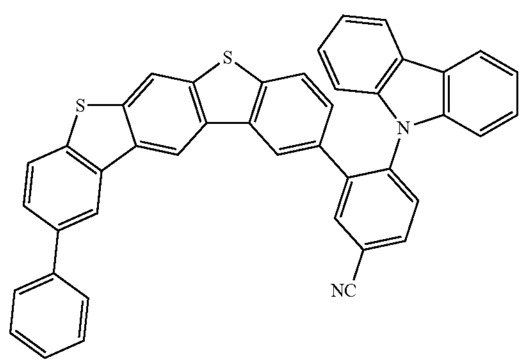

205
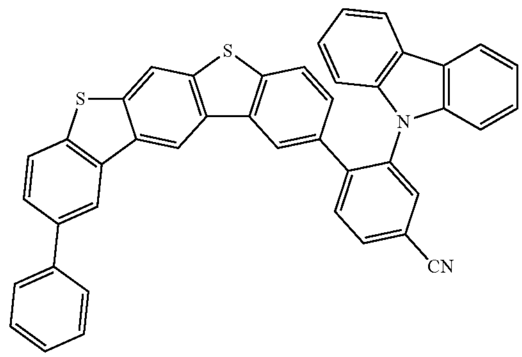
206
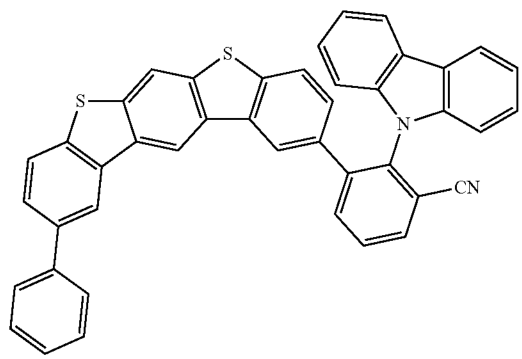
207
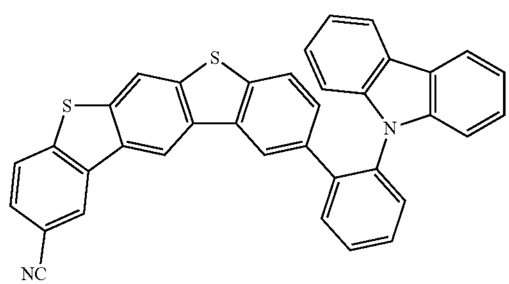
208
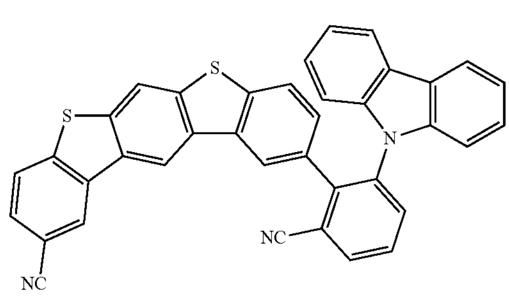
209
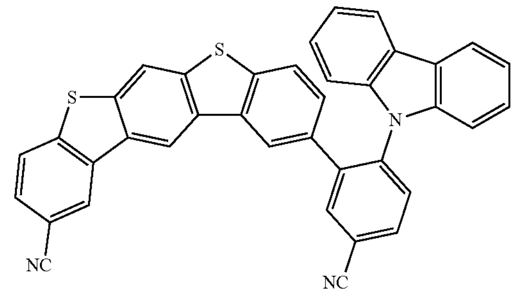
210
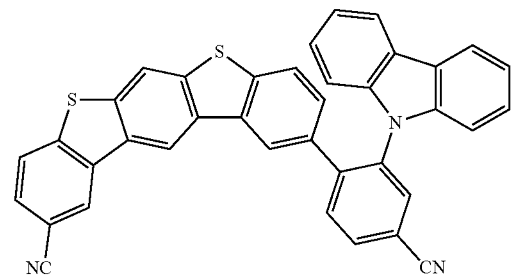
211
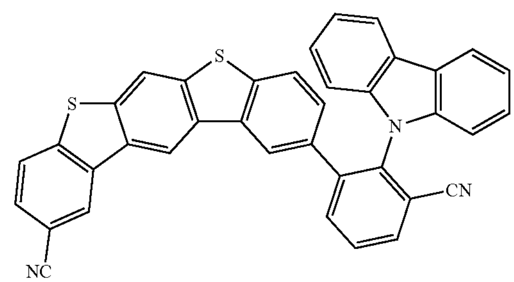
212
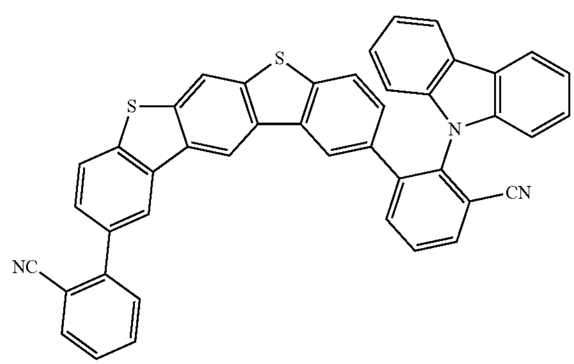

-continued
213
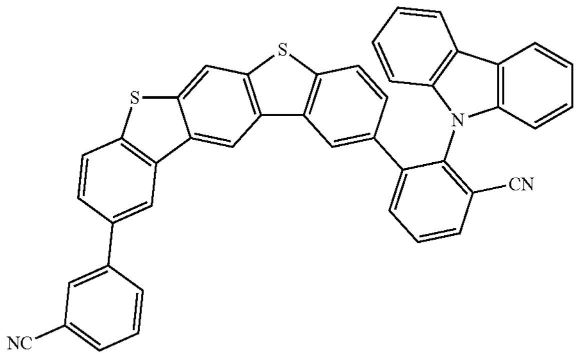
214
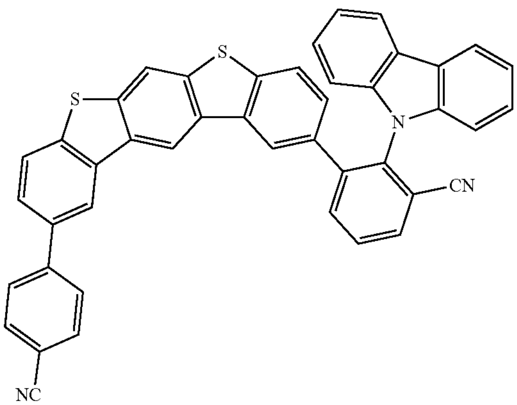
215
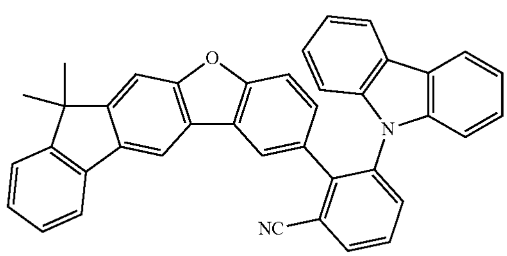
216
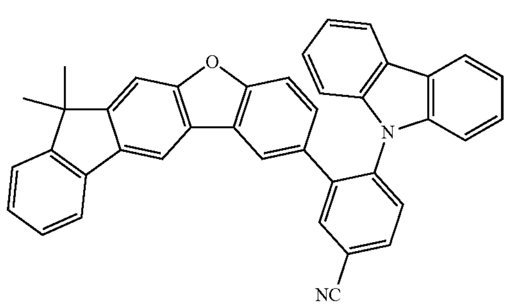
-continued
217
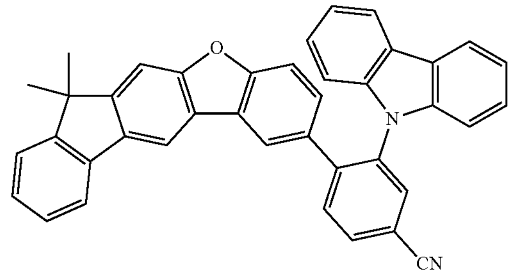
218
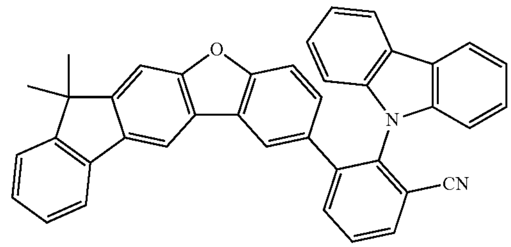
219
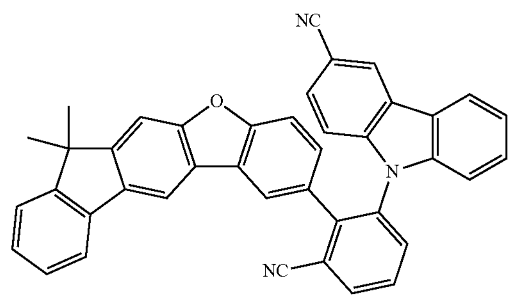
220
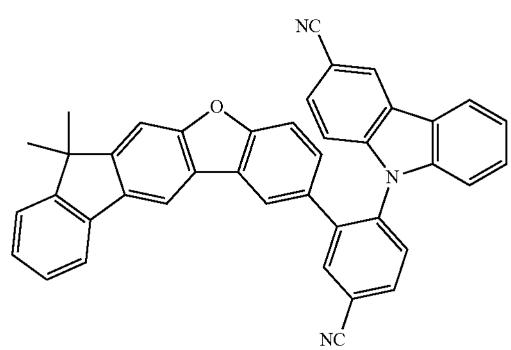
221
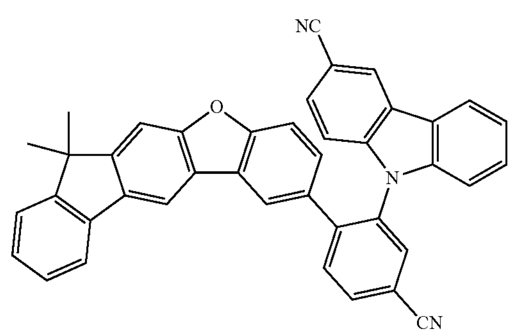

-continued
222
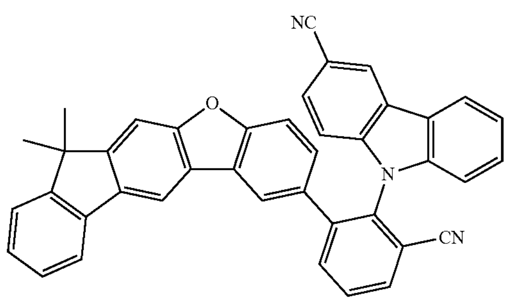
223
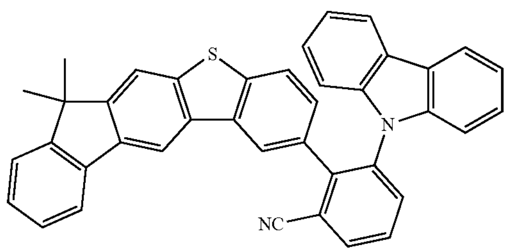
224
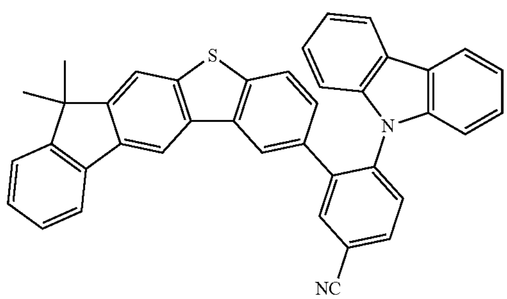
225
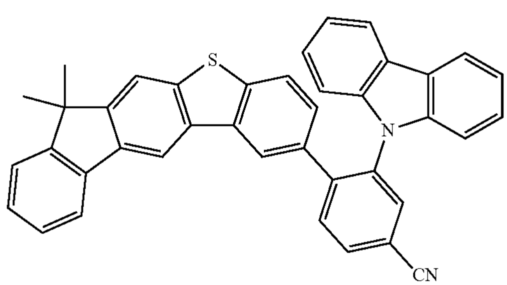
226
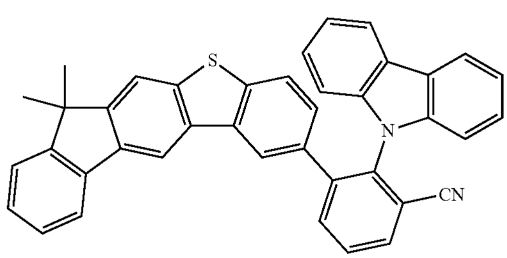
-continued
227
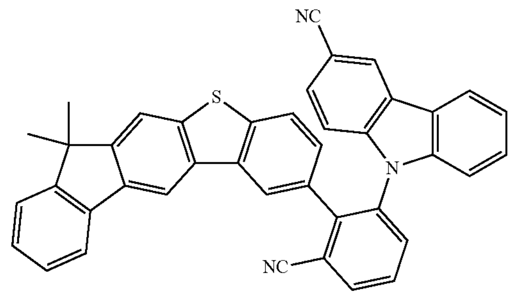
228
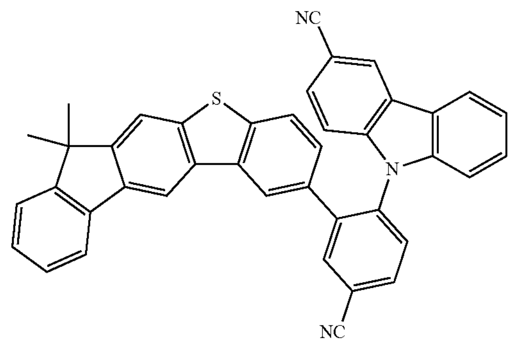
229
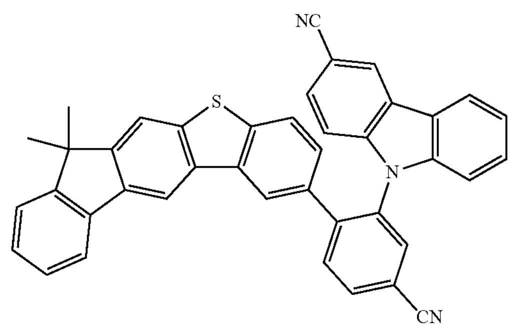
230
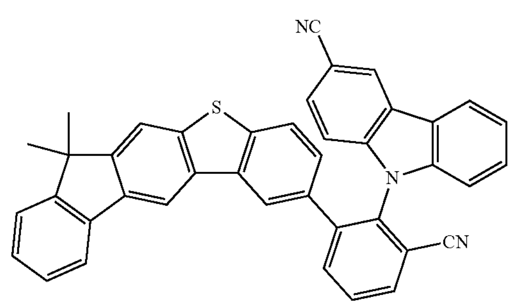
231
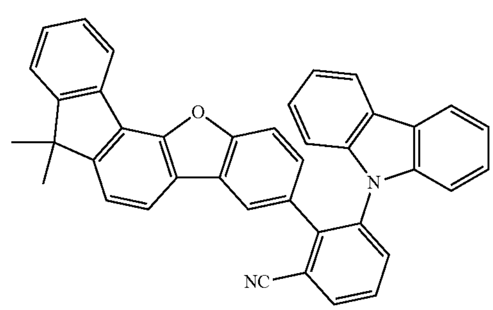

232
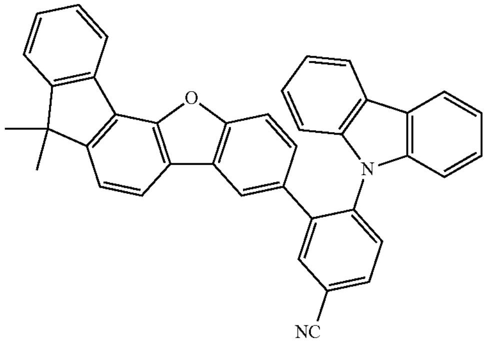
233
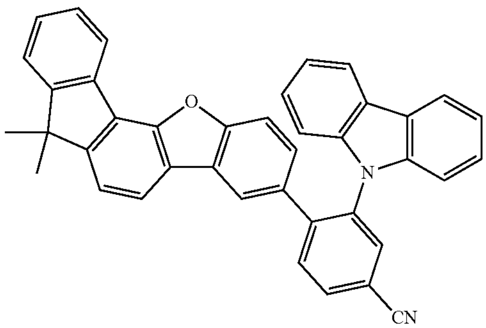
234
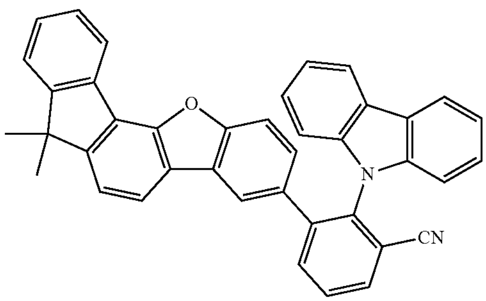
235
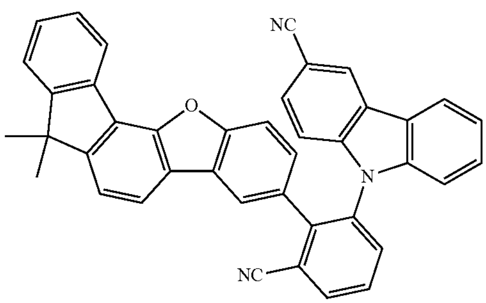
236
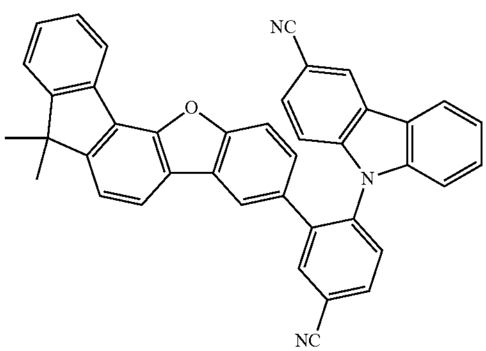
237
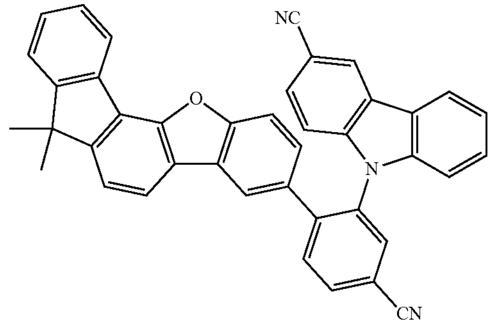
238
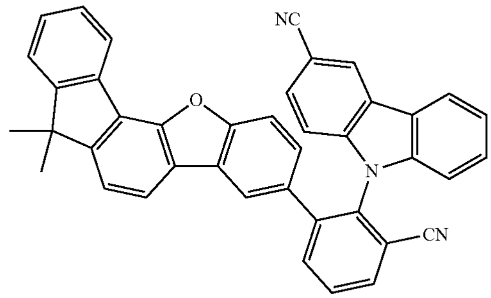
239
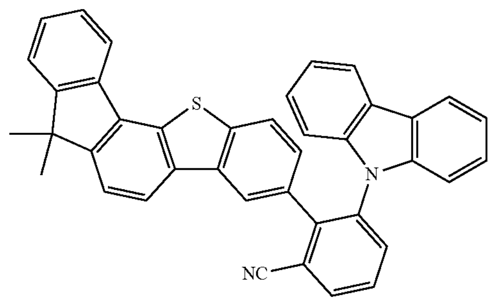
240
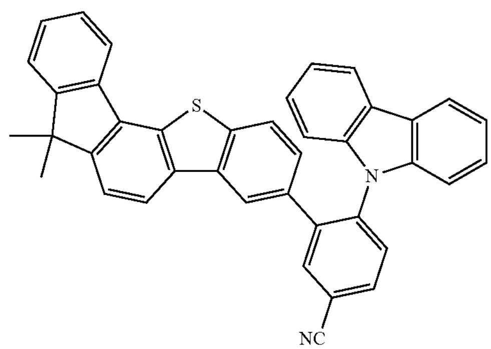
241
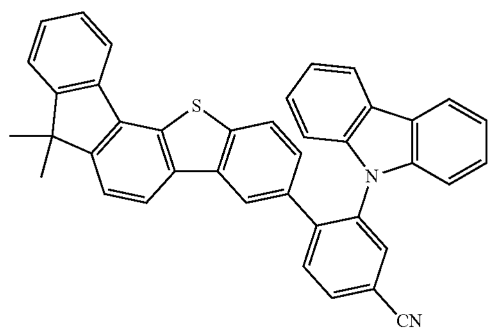

-continued
242
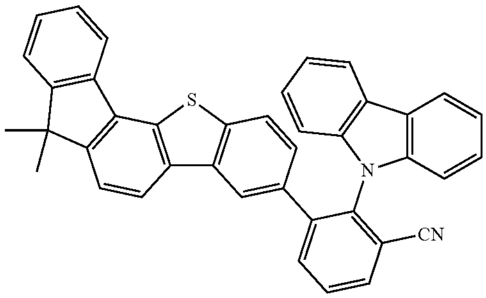
243
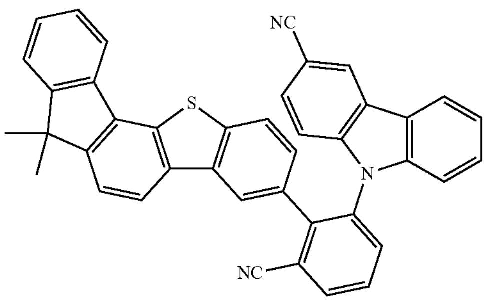
244
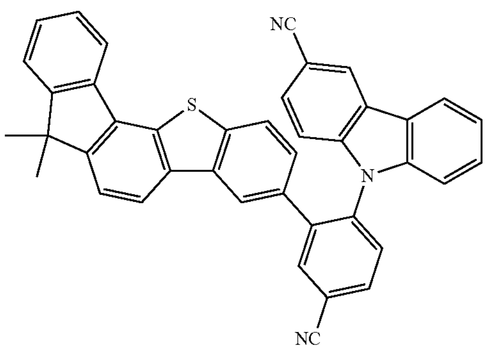
245
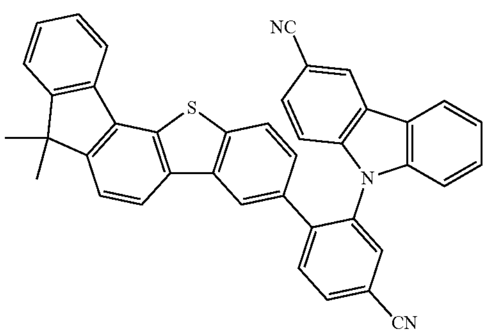
246
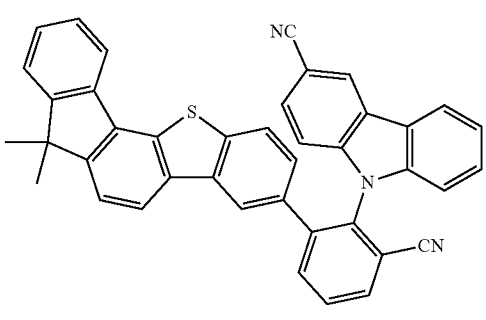
-continued
247
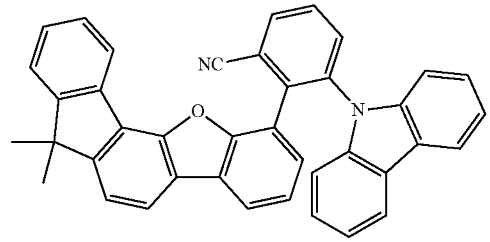
248
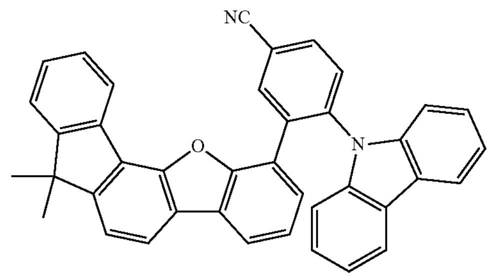
249
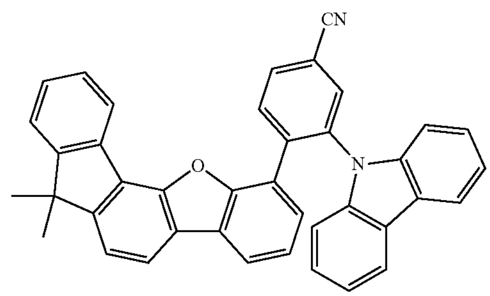
250
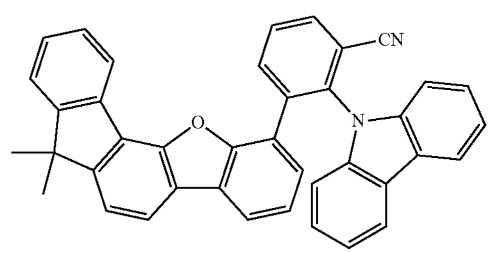
251
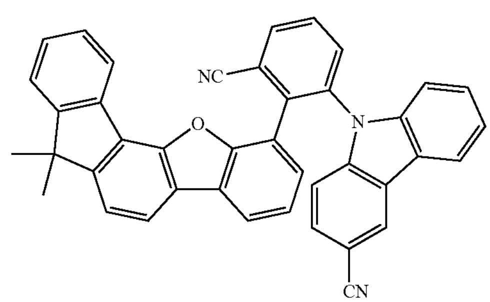

-continued
252
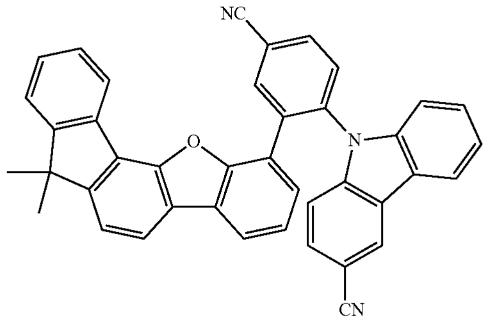
253
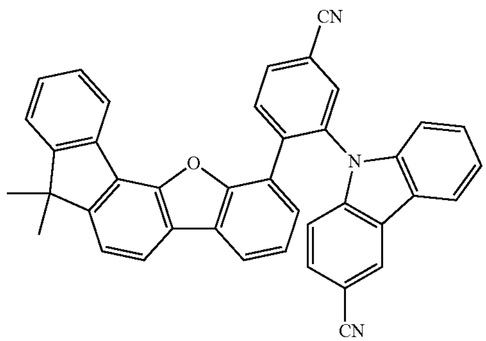
254
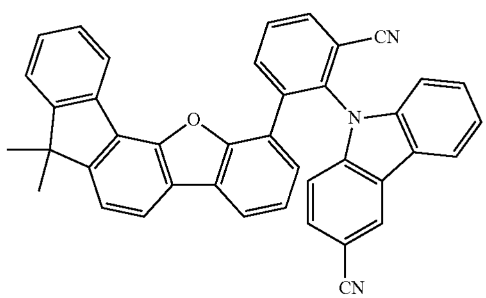
255
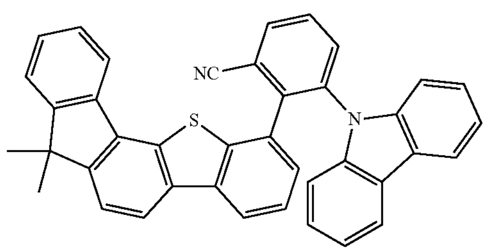
256
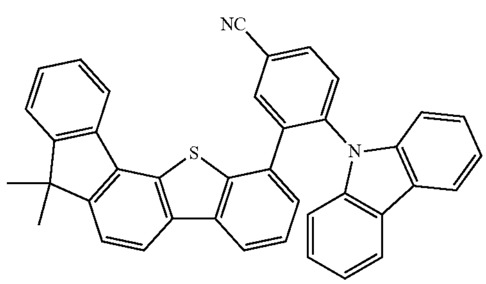
-continued
257
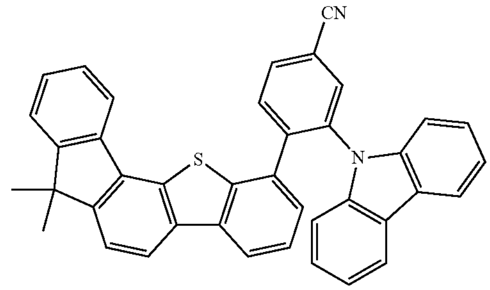
258
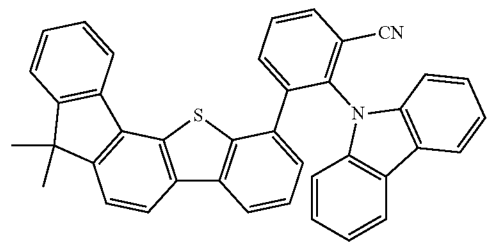
259
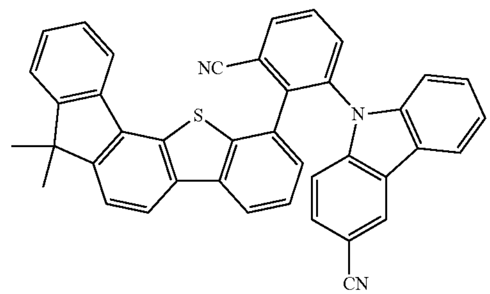
260
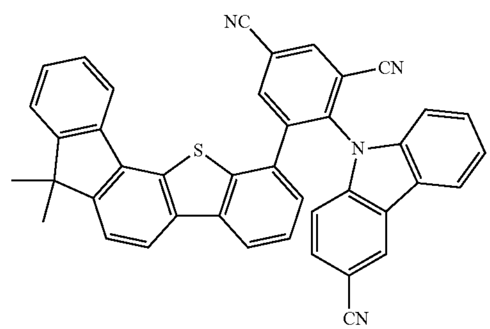
261
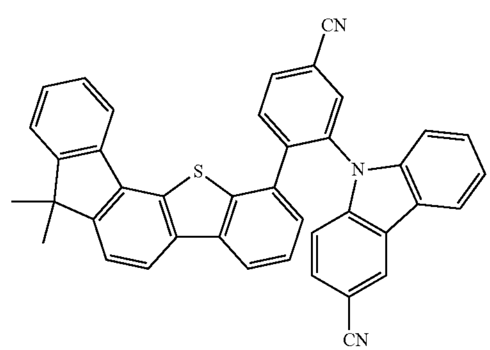

-continued
262
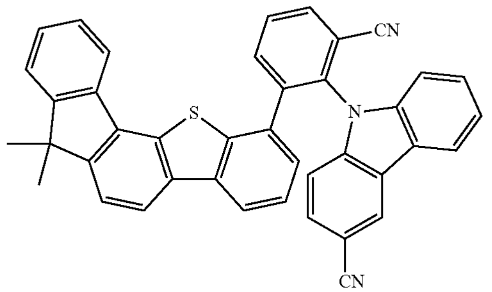
263
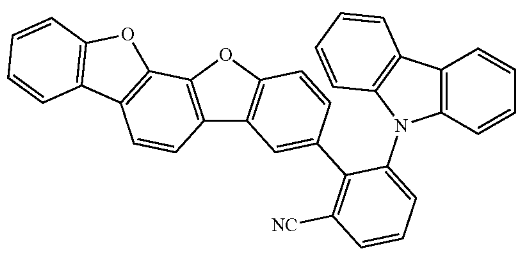
264
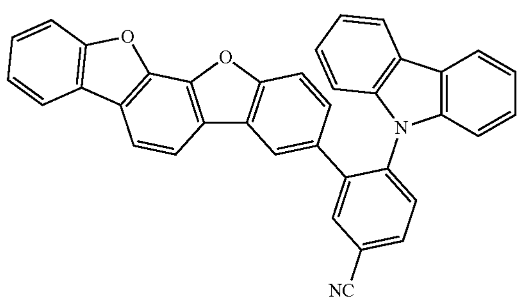
265
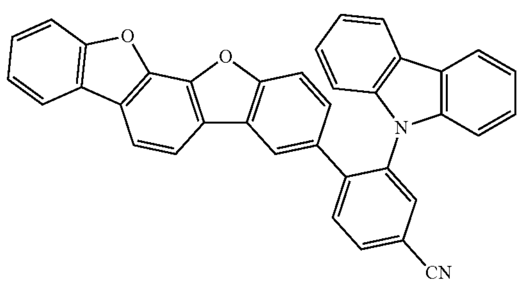
266
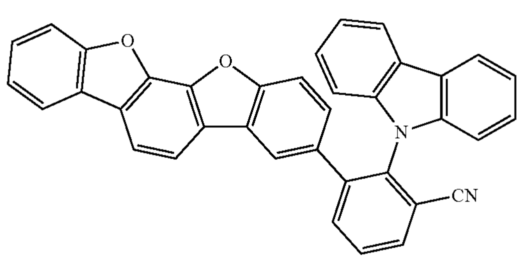
-continued
267
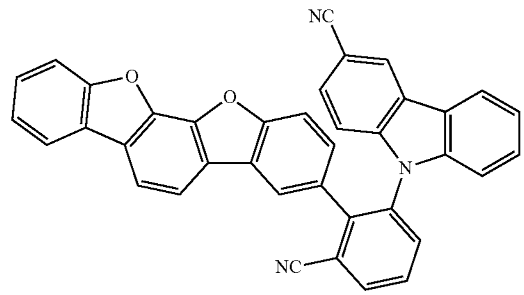
268
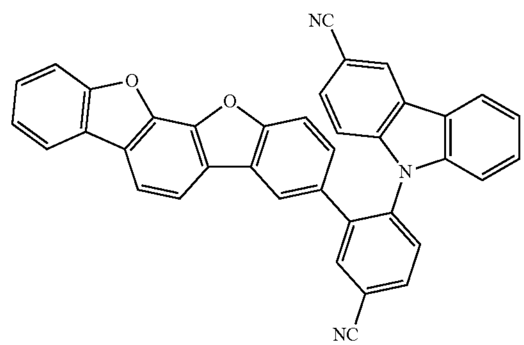
269
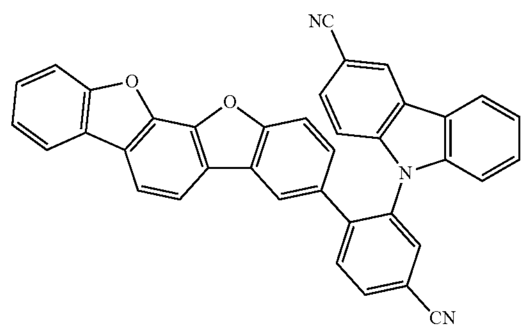
270
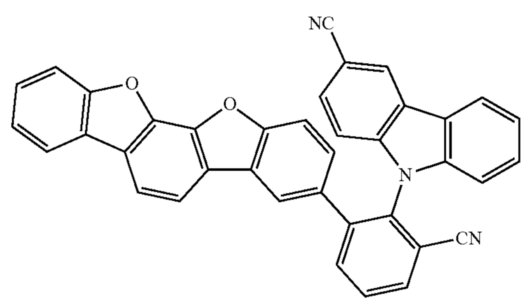
271
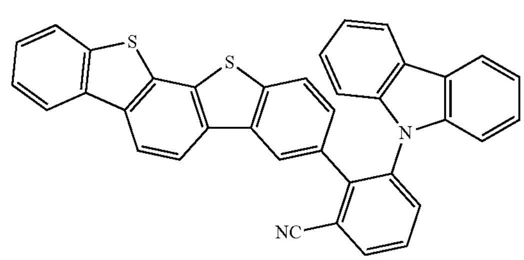

-continued
272
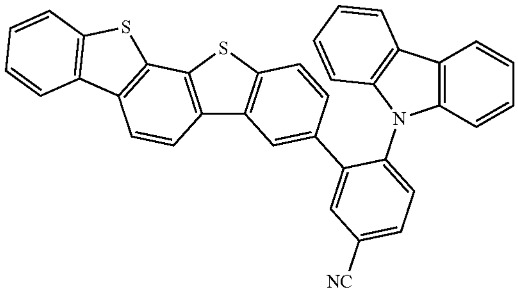
273
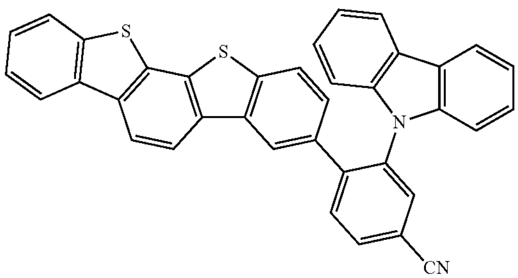
274
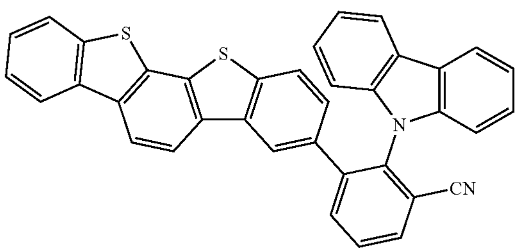
275
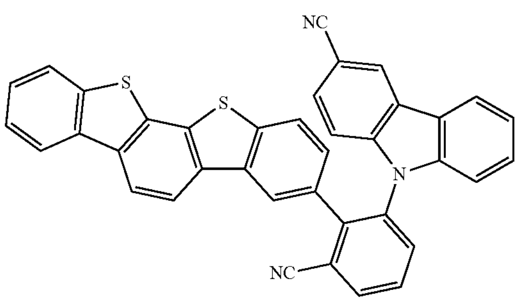
276
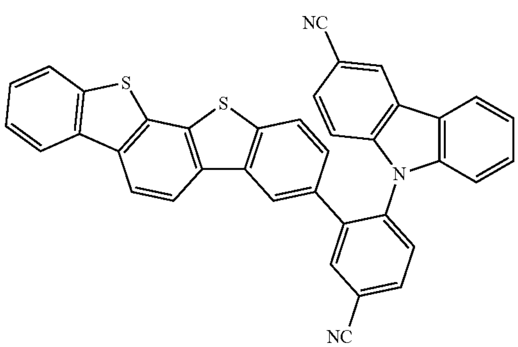
-continued
277
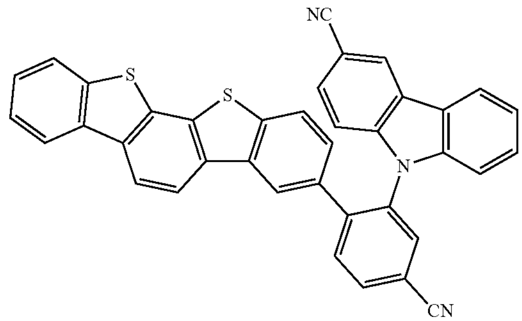
278
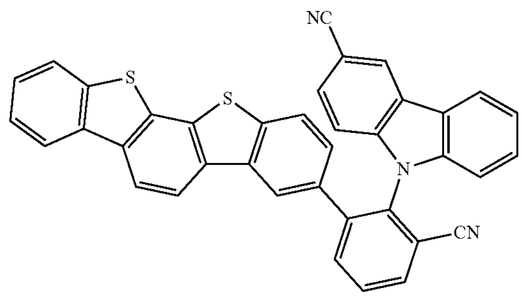
279
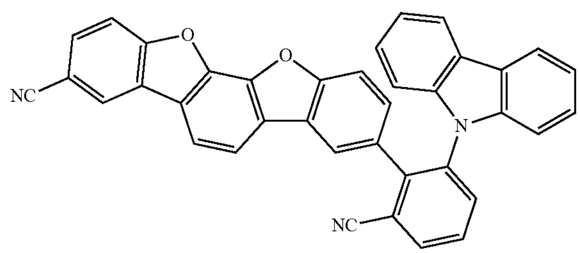
280
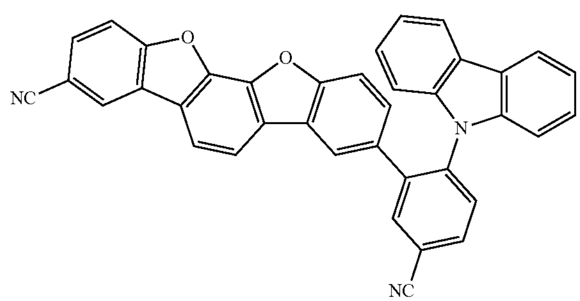
281
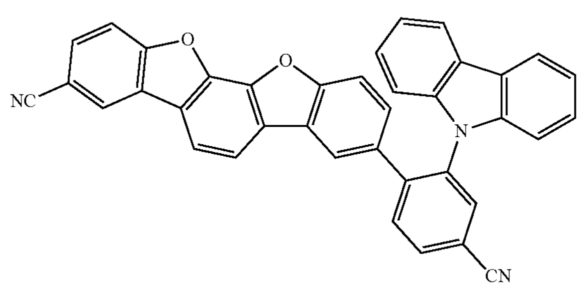

282
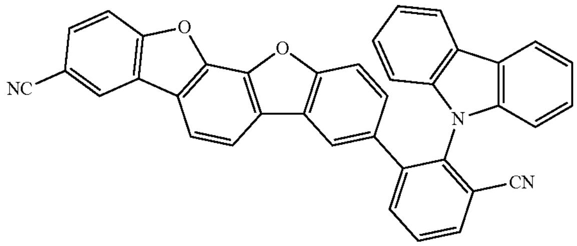
283
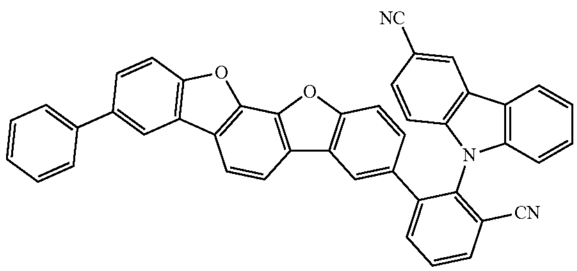
284
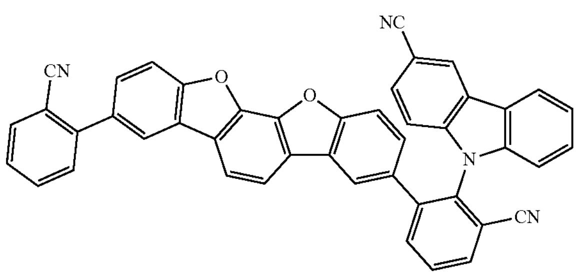
285
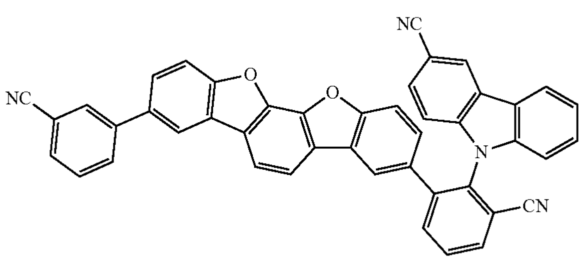
286
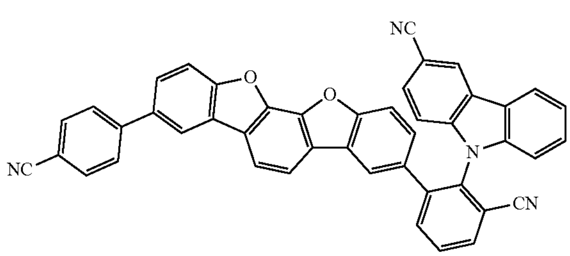
287
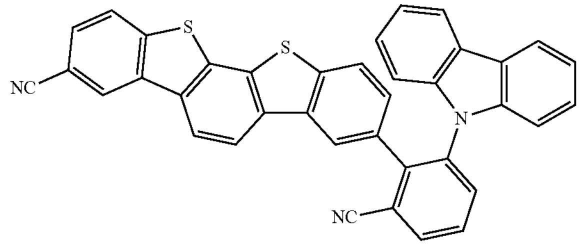
288
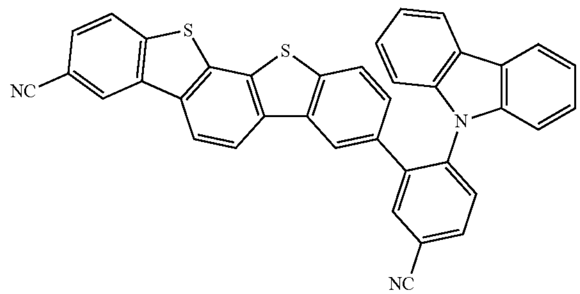
289
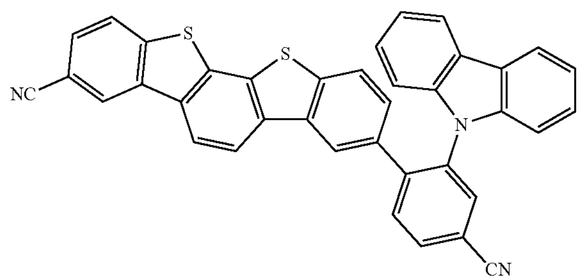
290
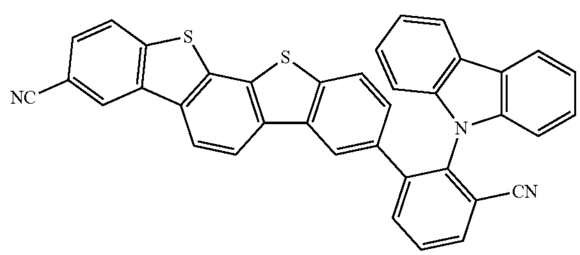
291
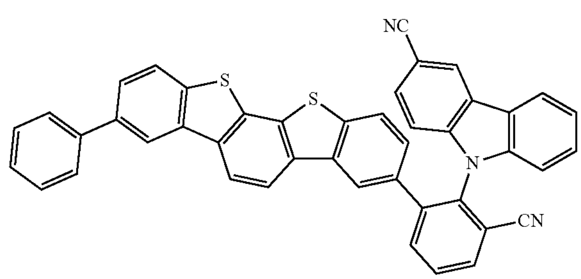

292
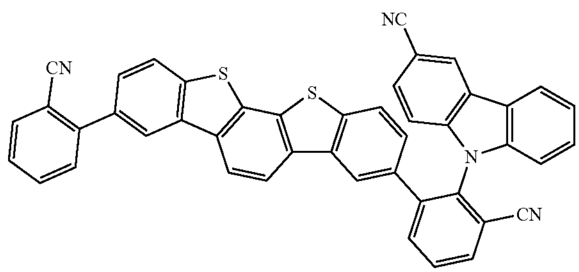
293
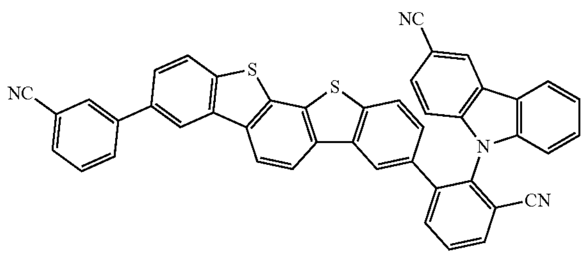
294
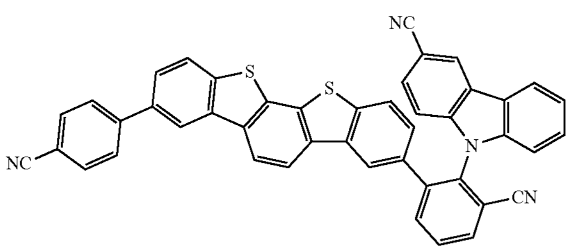
295
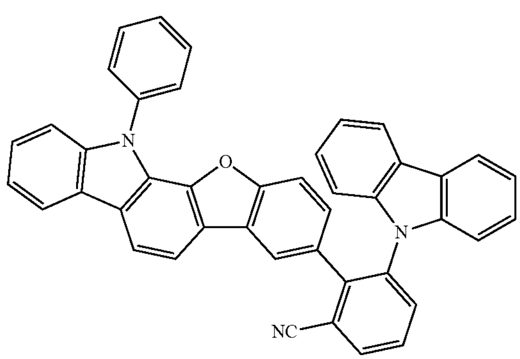
296
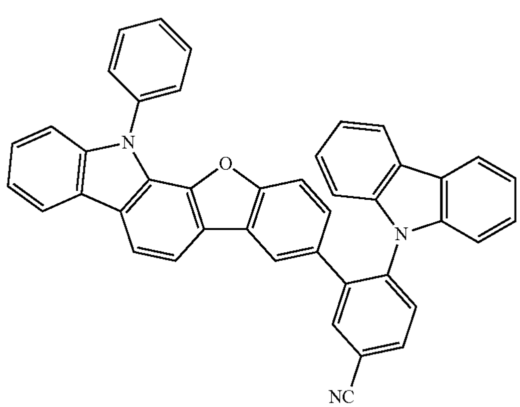
297
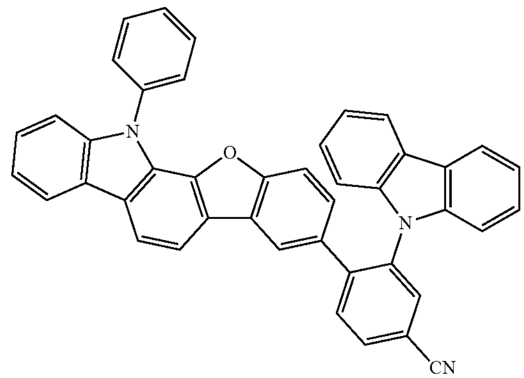
298
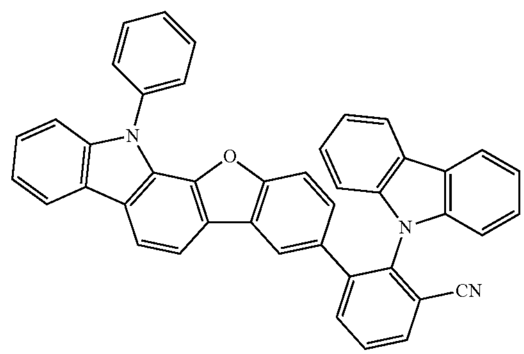
299
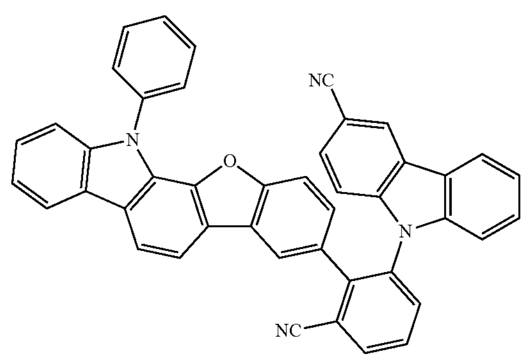
300
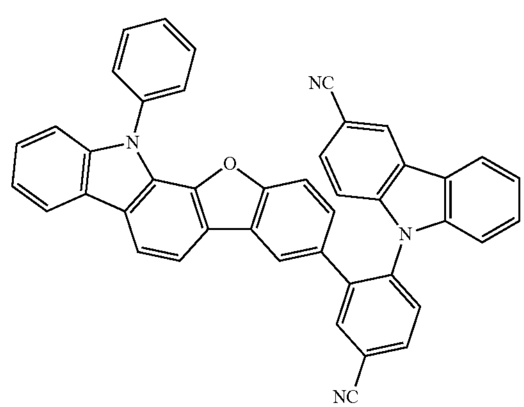

301
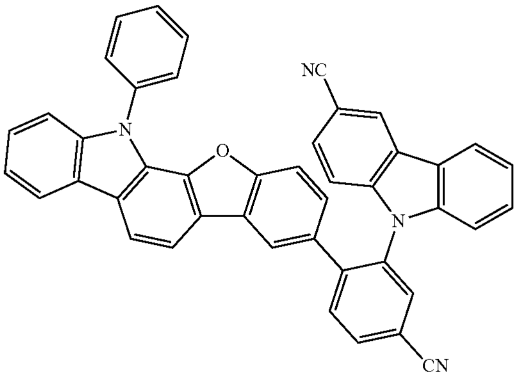
302
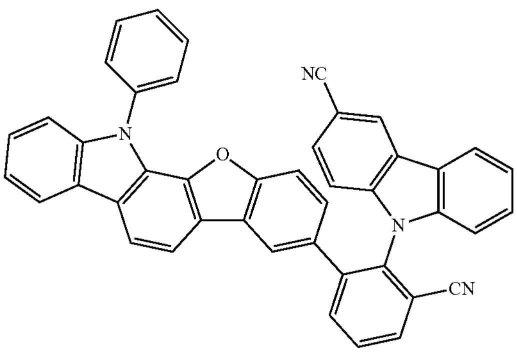
303
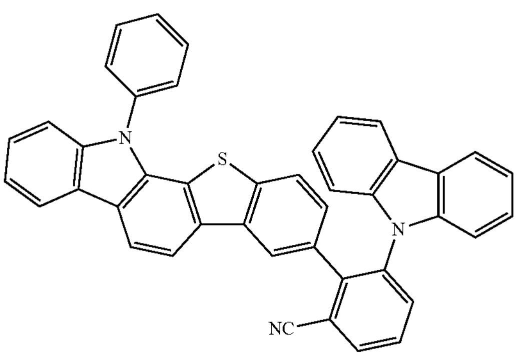
304
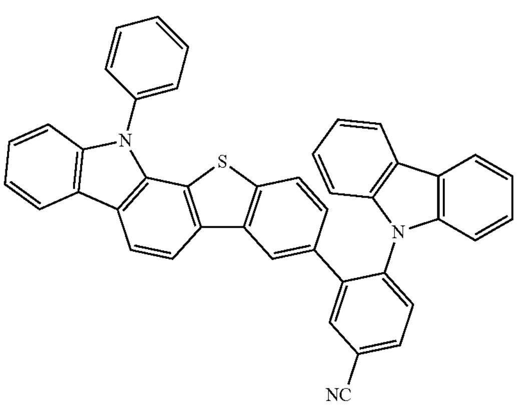
305
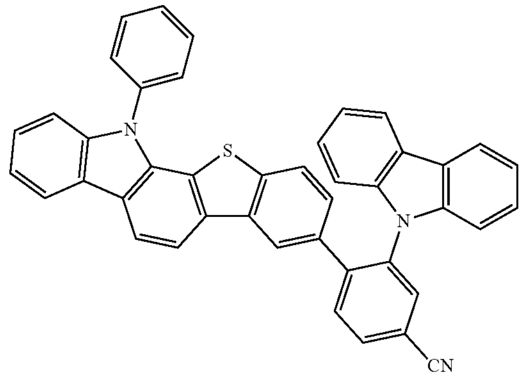
306
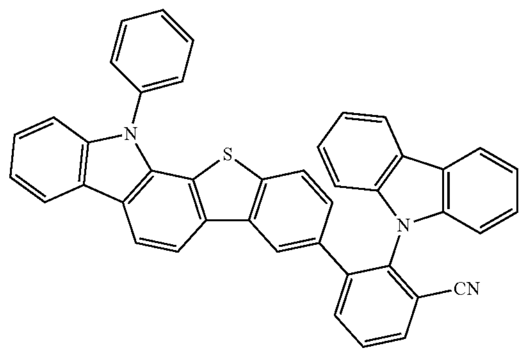
307
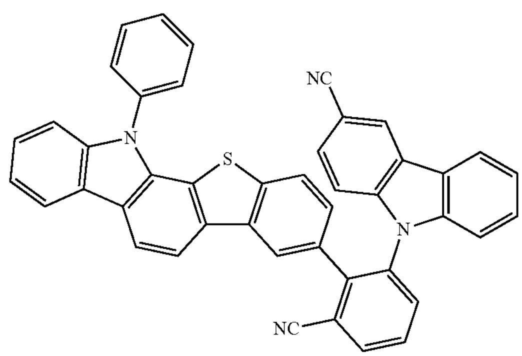
308
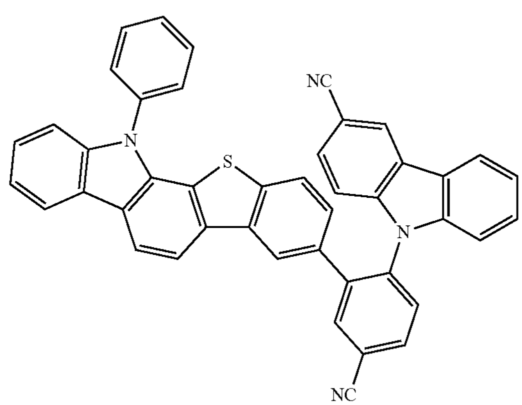

-continued
309
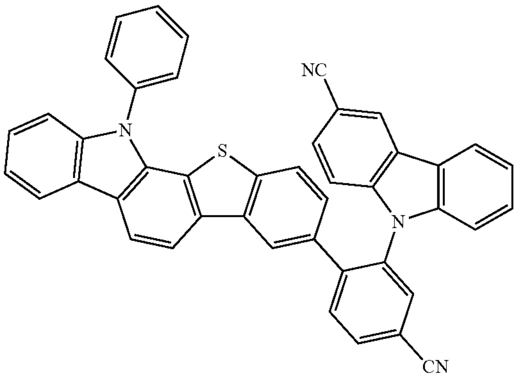
310
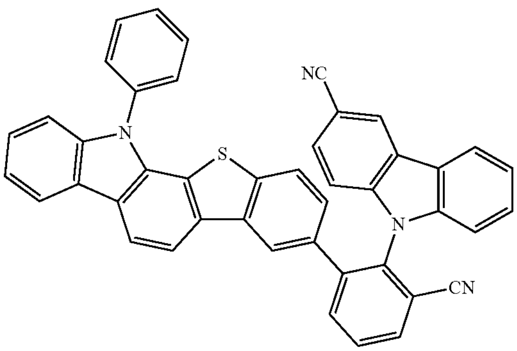
311
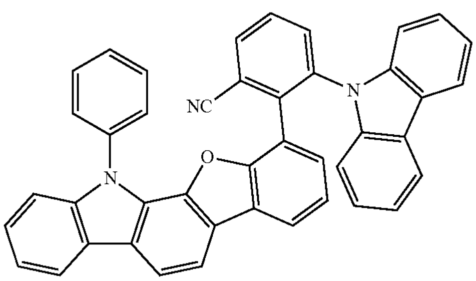
312
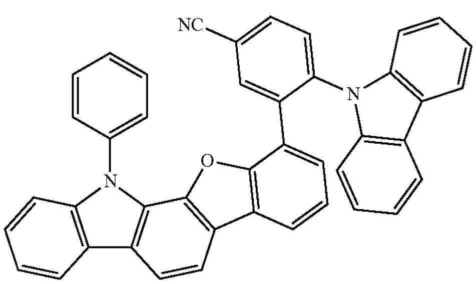
313
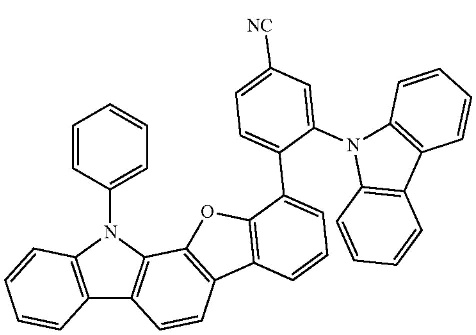
-continued
314
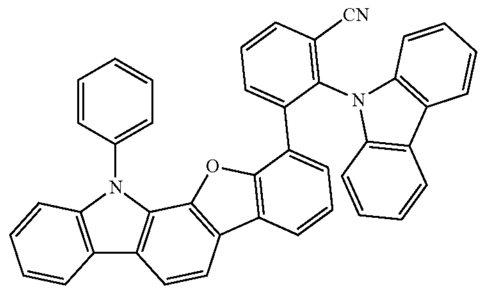
315
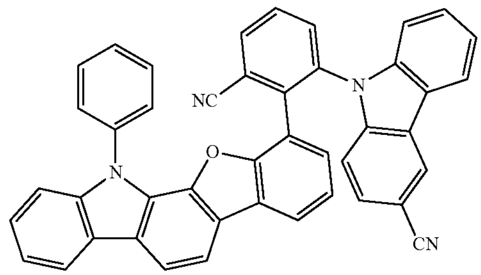
316
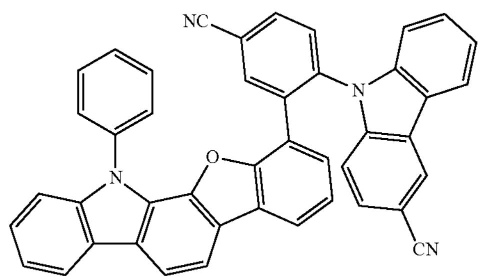
317
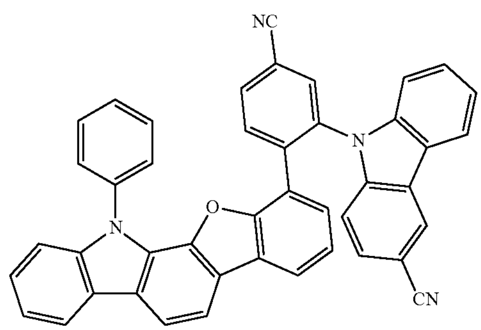
318
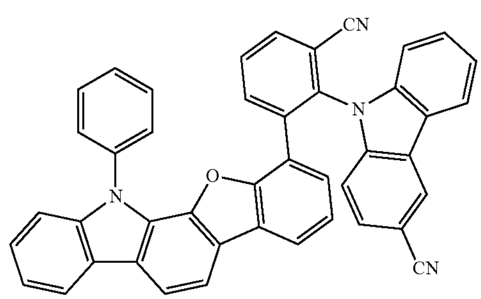

-continued
319
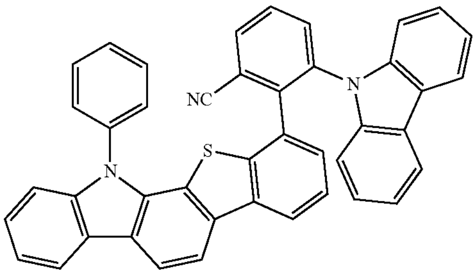
320
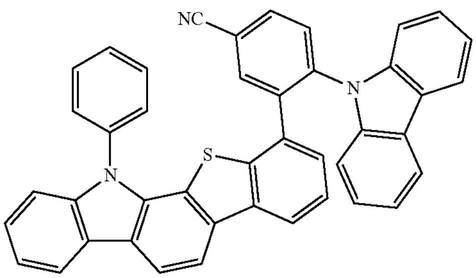
321
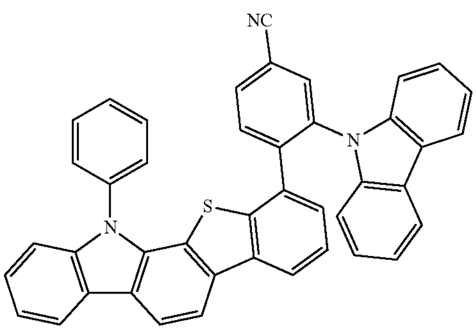
322
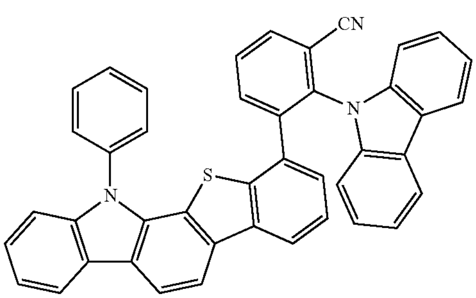
323
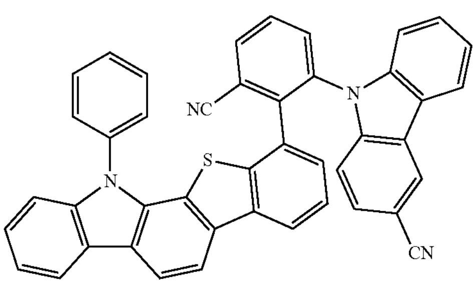
-continued
324
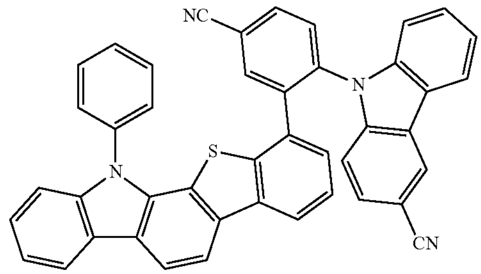
325
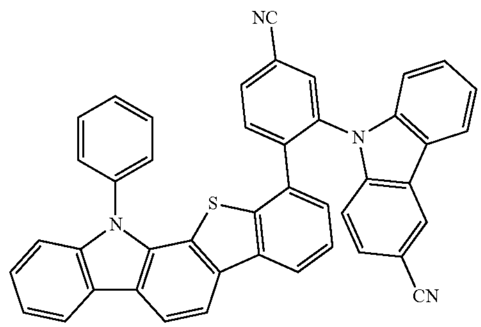
326
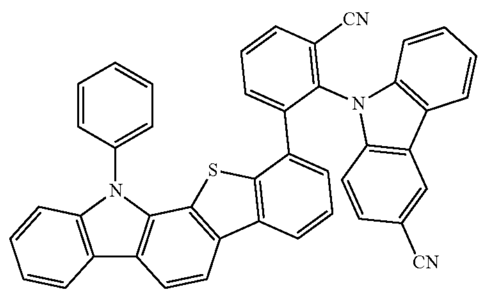
327
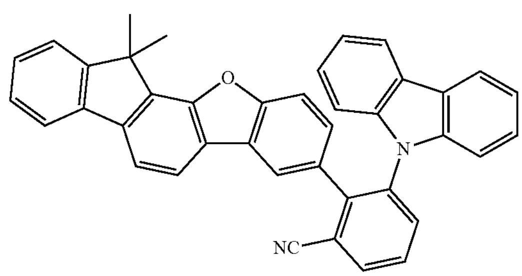
328
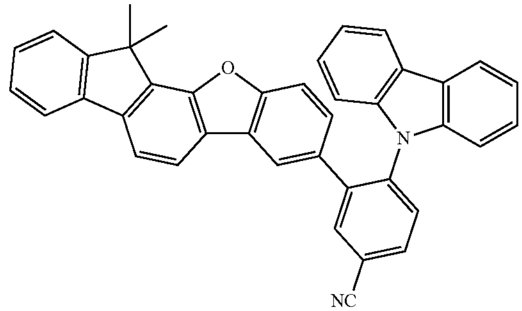

-continued
329
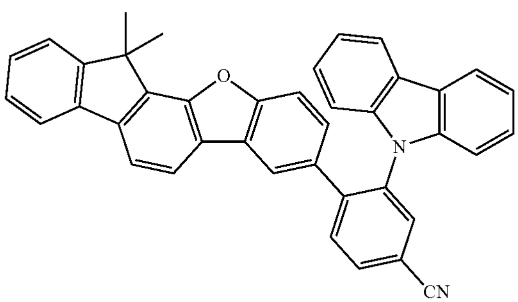
330
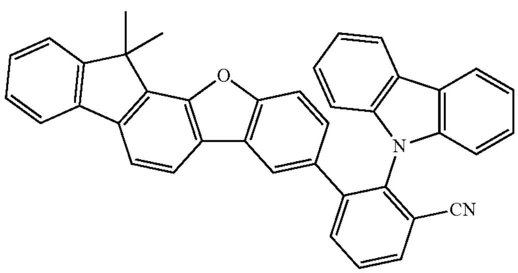
331
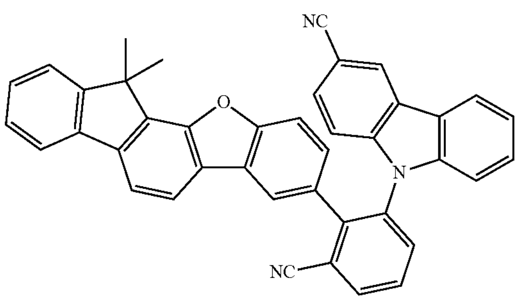
332
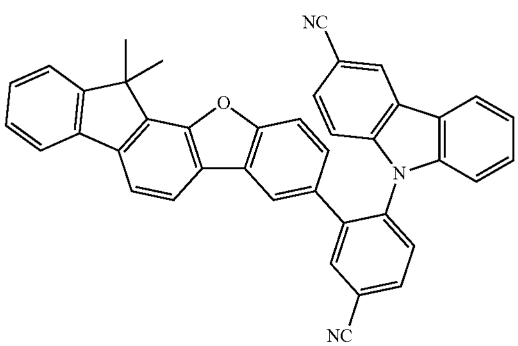
333
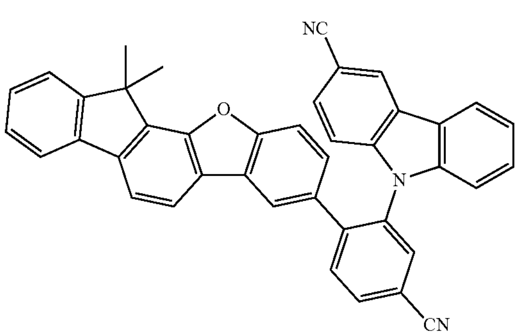
-continued
334
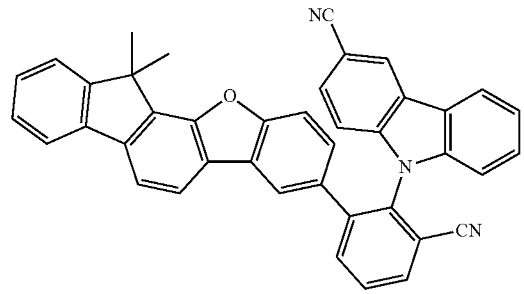
335
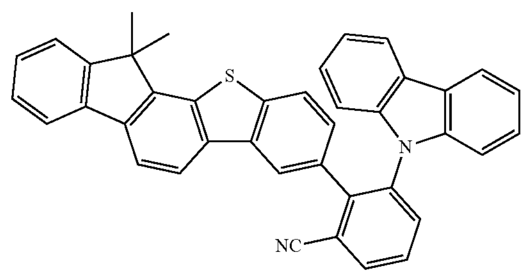
336
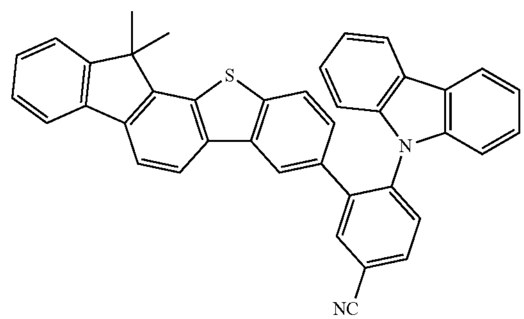
337
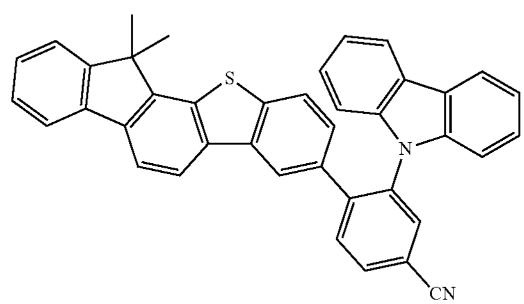
338
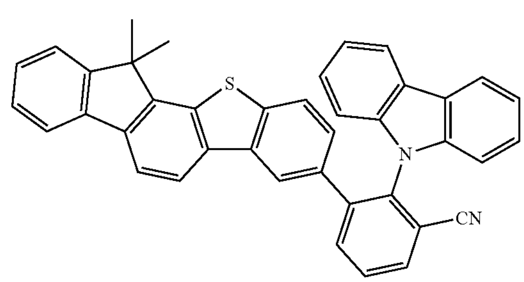

-continued
339
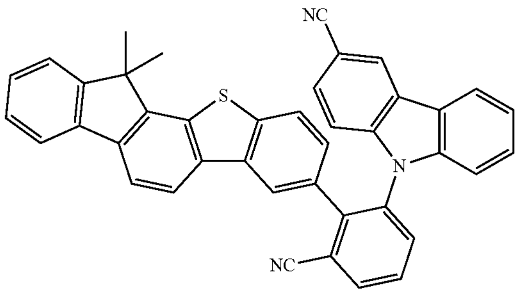
340
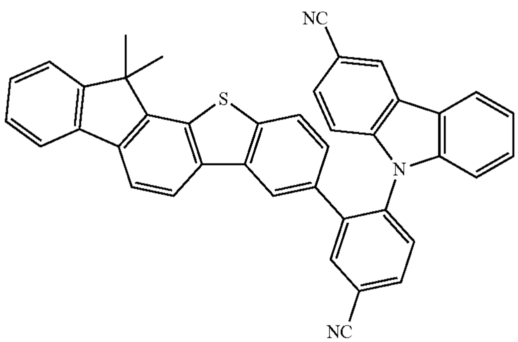
341
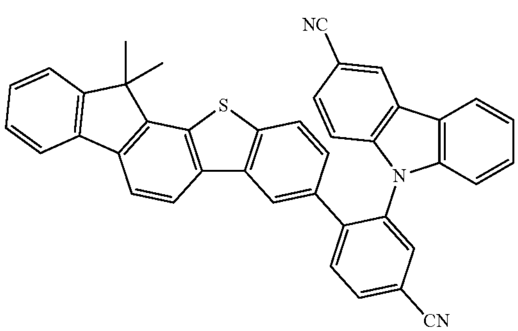
342
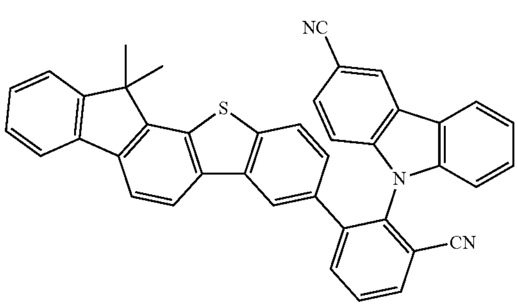
-continued
343
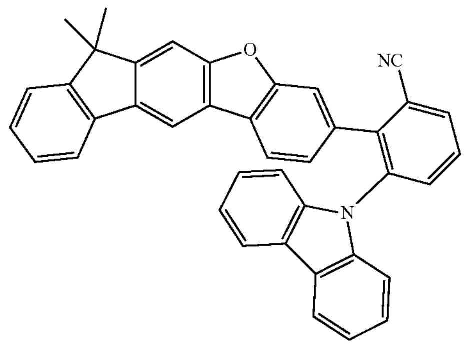
344
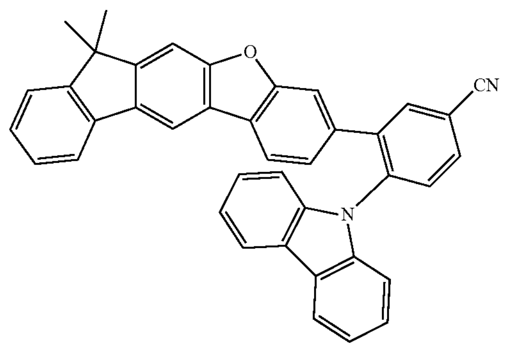
345
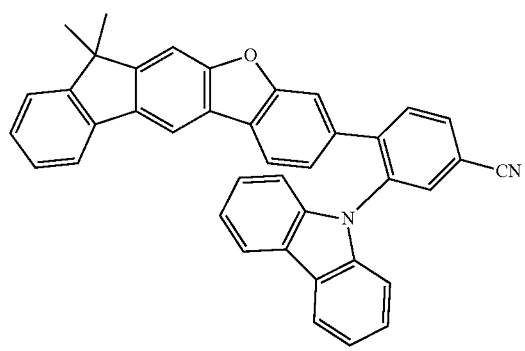
346
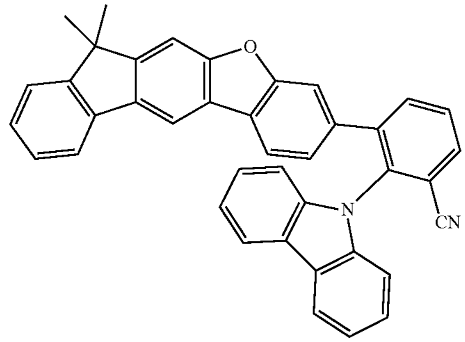

-continued
347
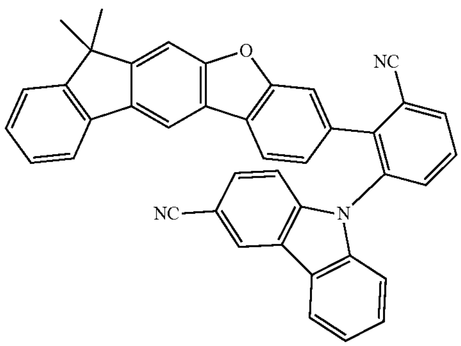
348
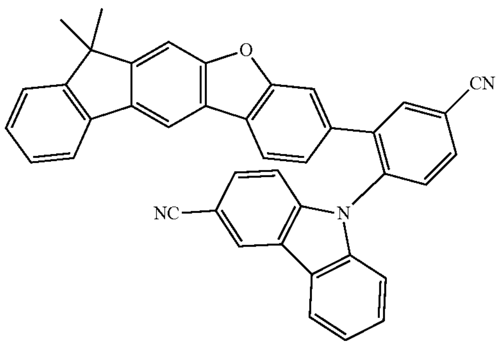
349
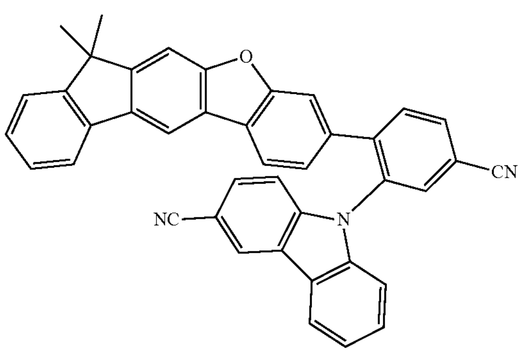
350
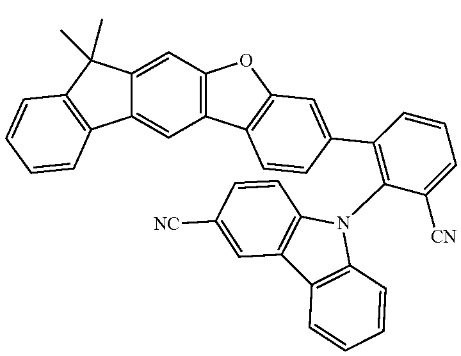
-continued
351
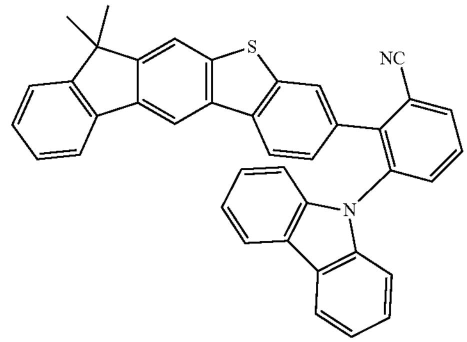
352
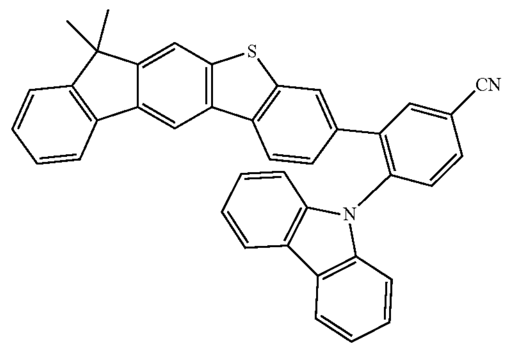
353
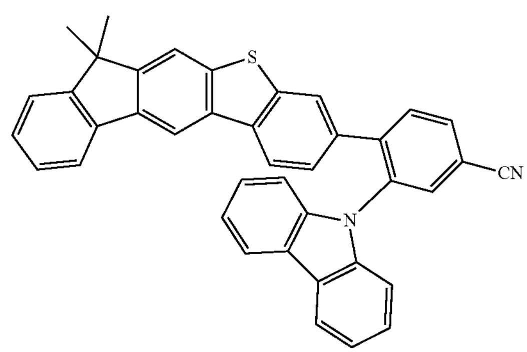
354
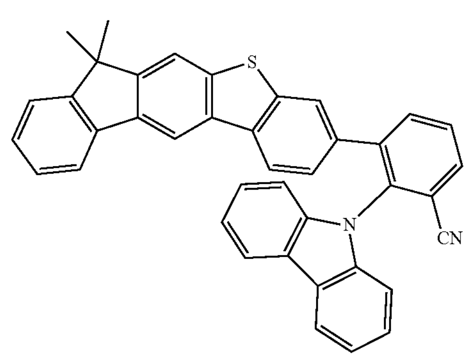

-continued
355
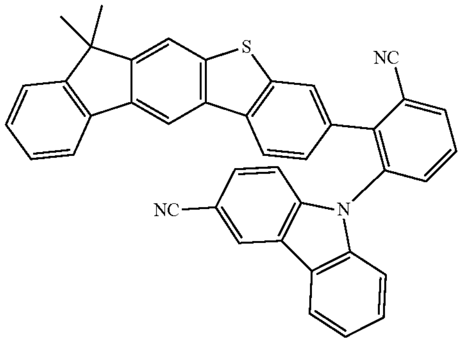
356
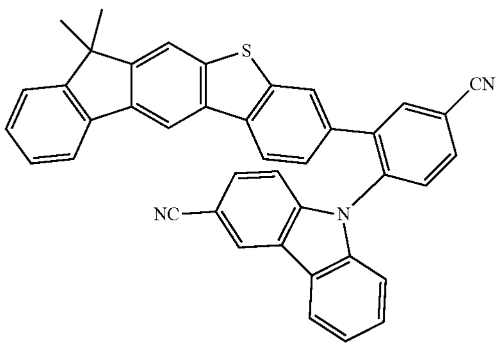
357
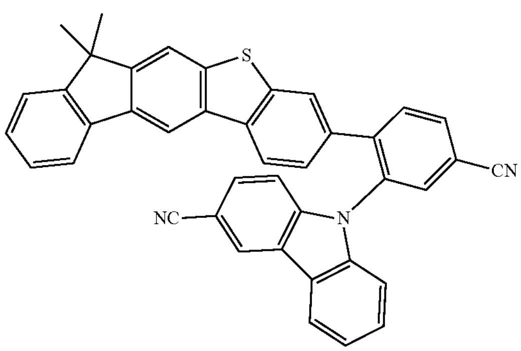
358
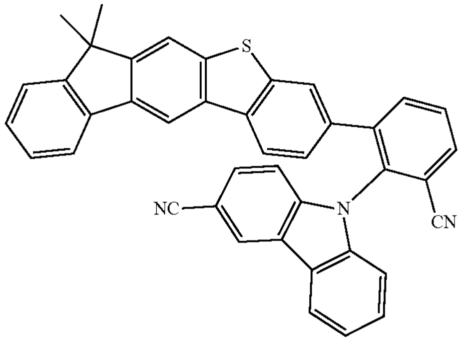
-continued
359
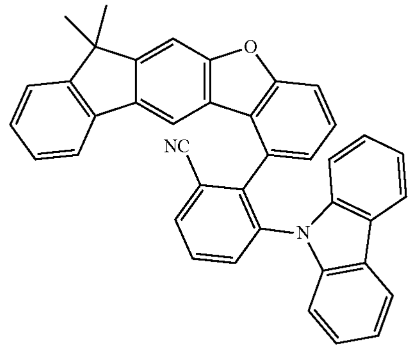
360
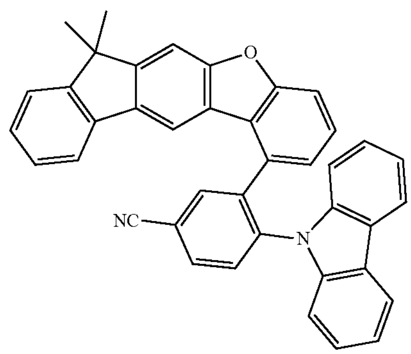
361
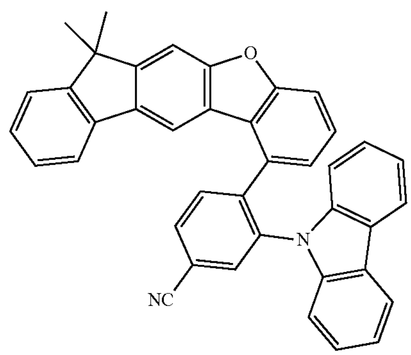
362
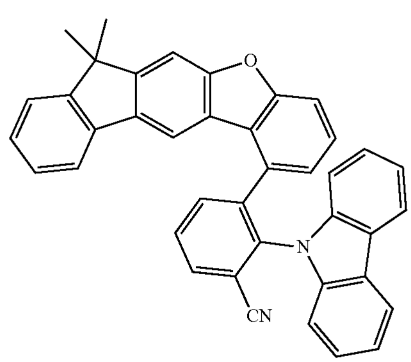

-continued
363
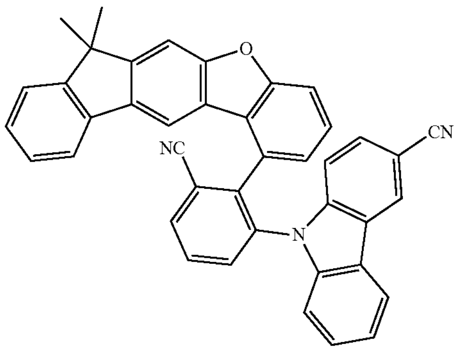
364
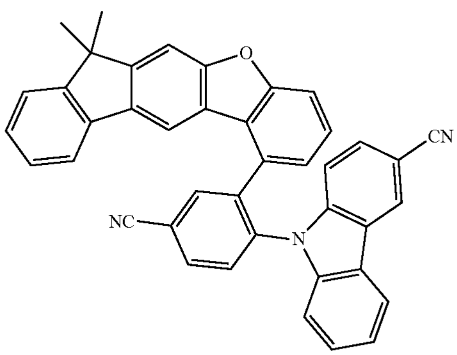
365
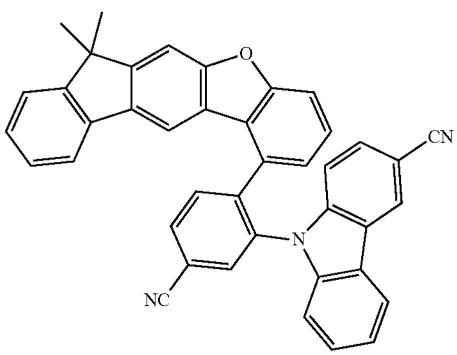
366
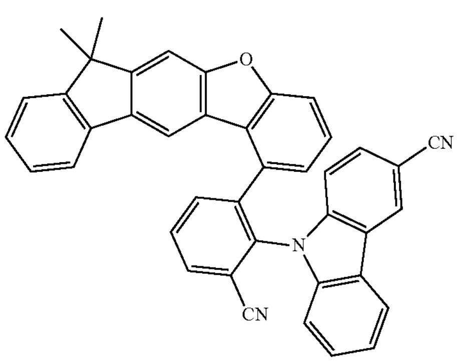
-continued
367
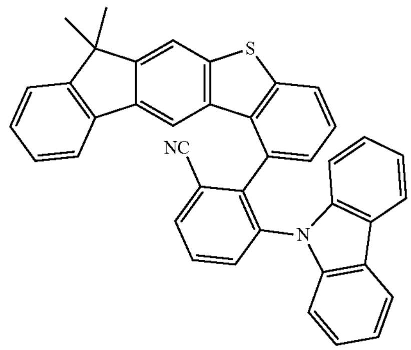
368
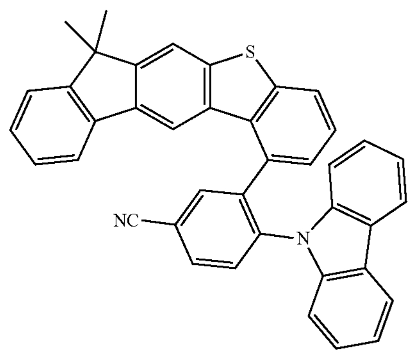
369
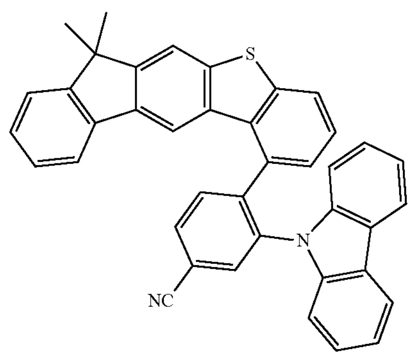
370
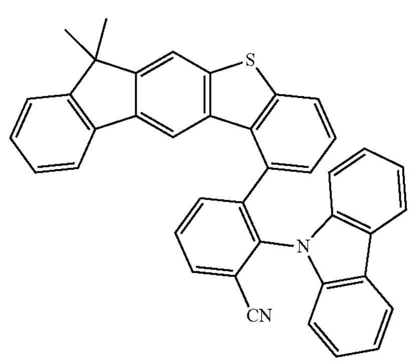

-continued
371
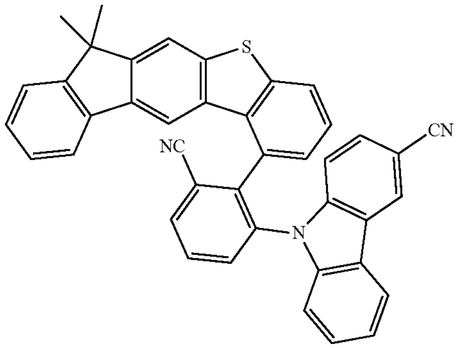
372
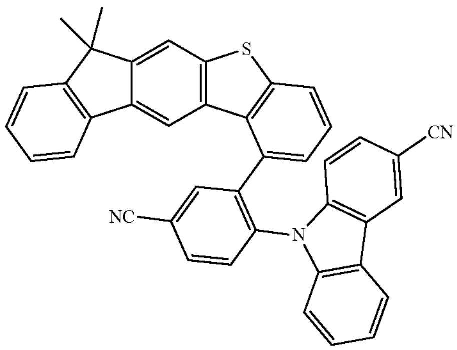
373
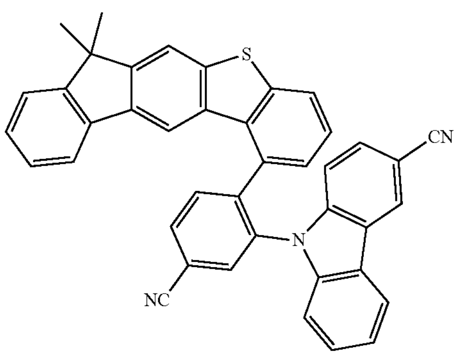
374
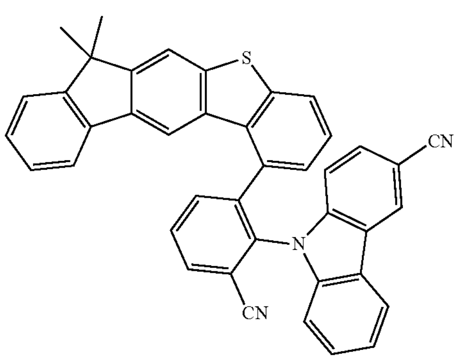
-continued
375
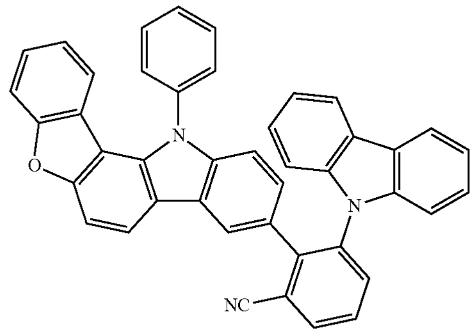
376
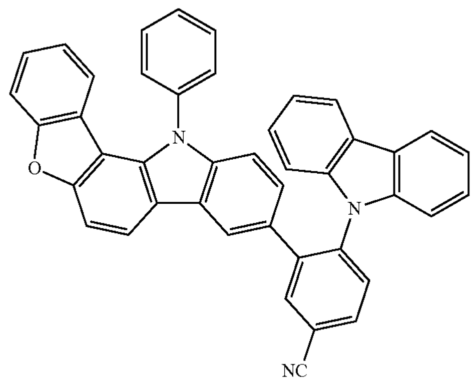
377
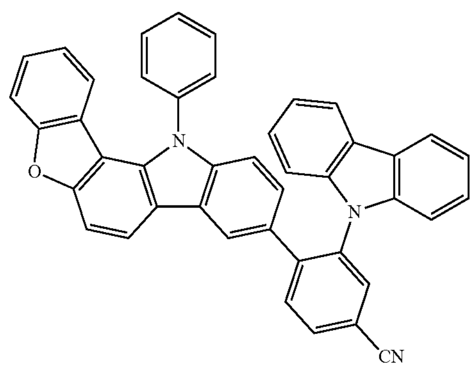
378
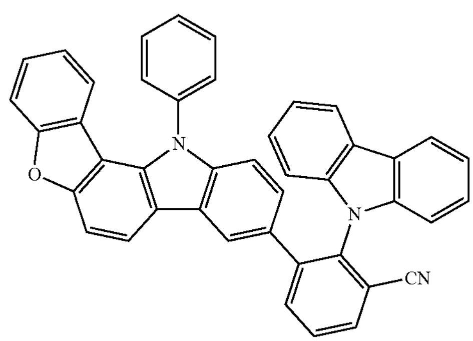

-continued
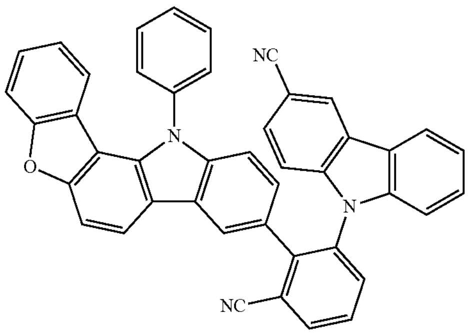
379
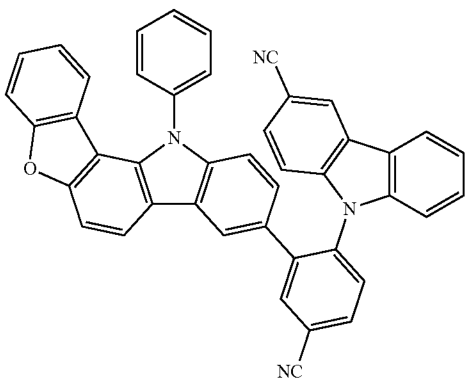
380
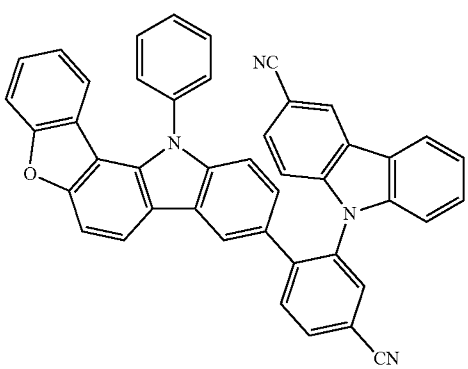
381
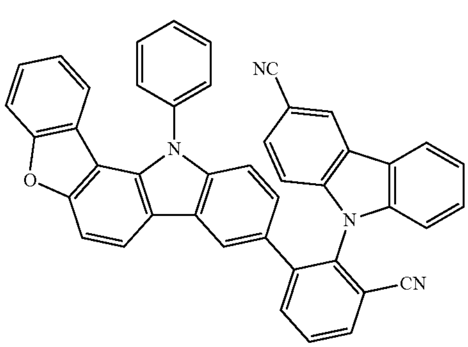
382
-continued
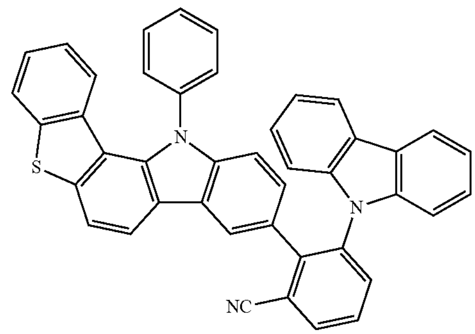
383
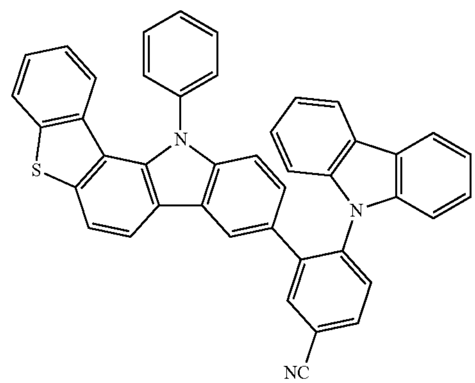
384
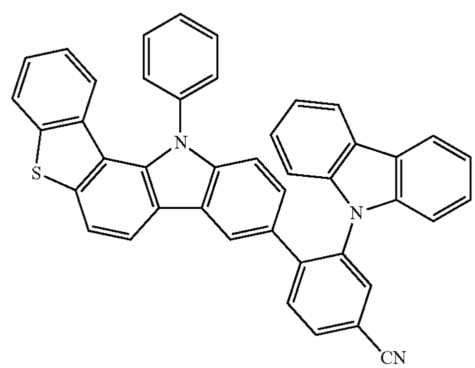
385
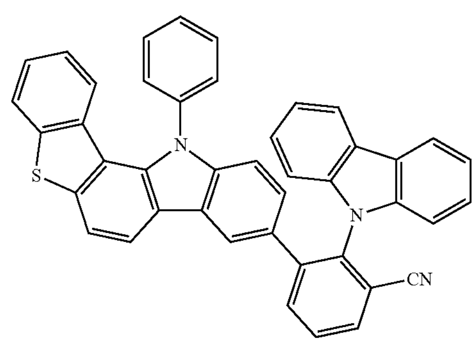
386

387
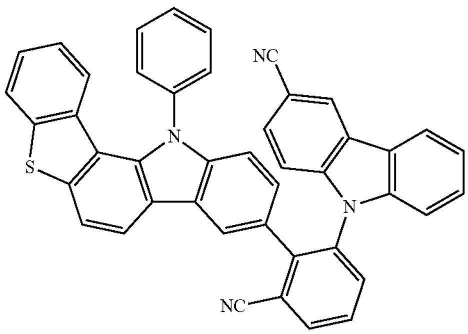
388
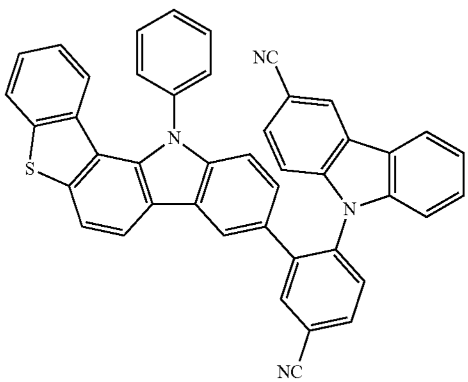
389
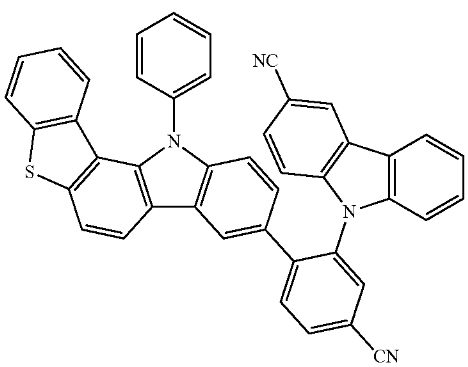
390
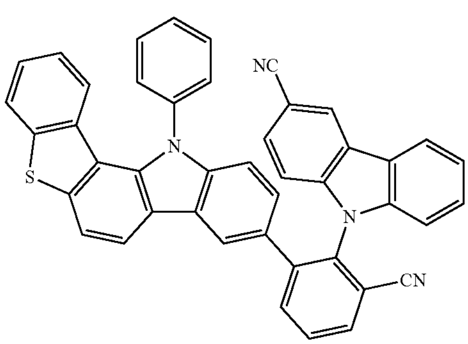
391
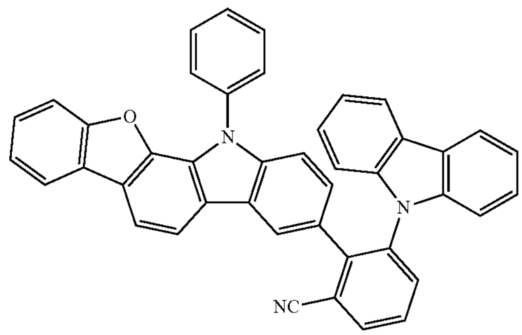
392
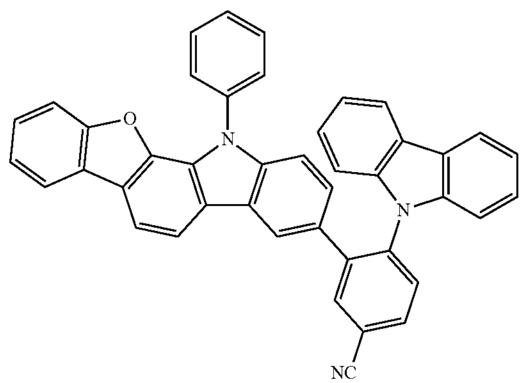
393
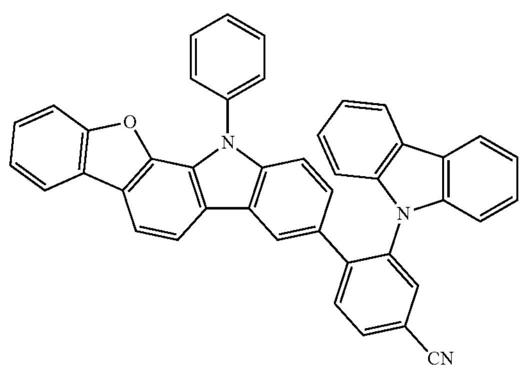
394
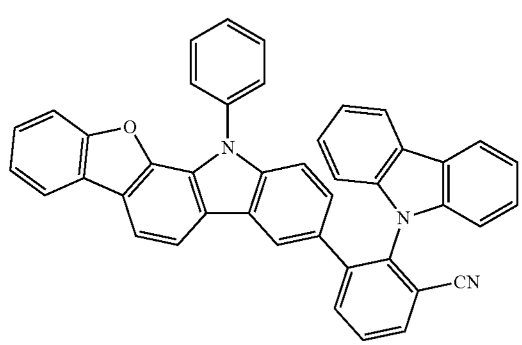

-continued
395
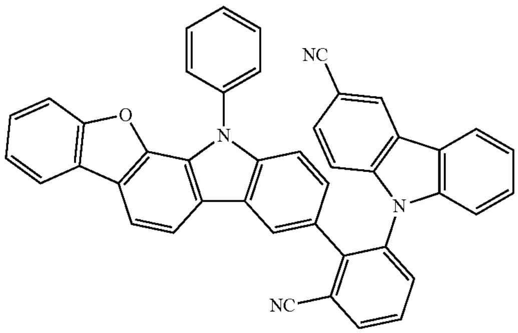
396
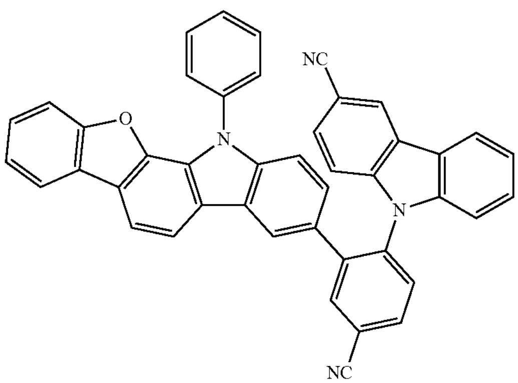
397
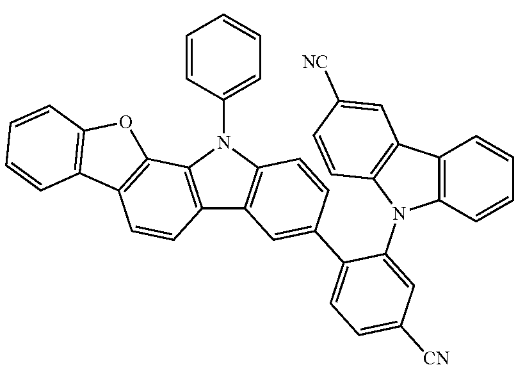
398
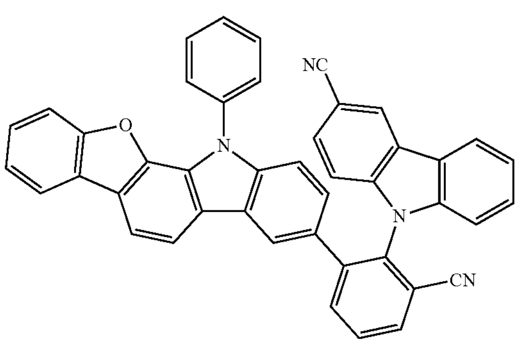
-continued
399
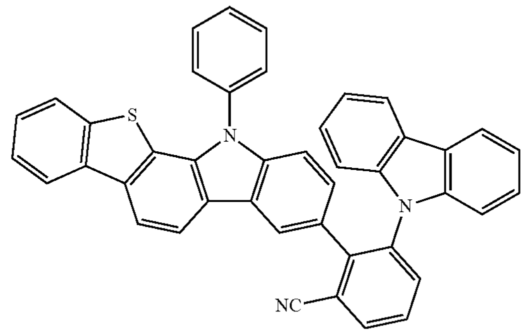
400
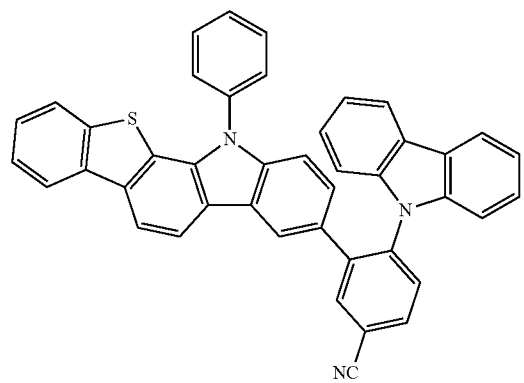
401
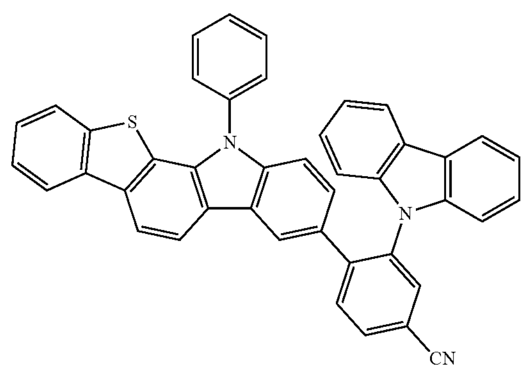
402
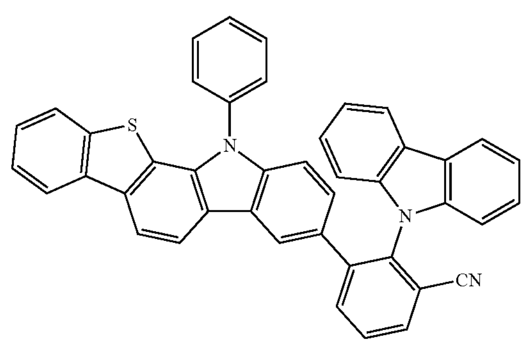

-continued
403
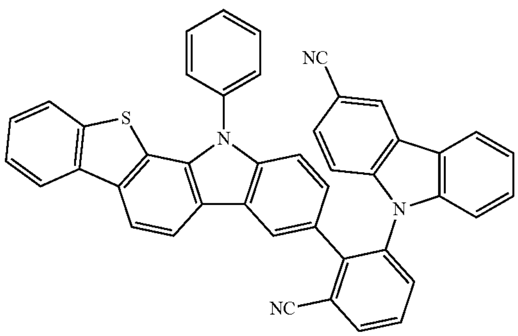
404
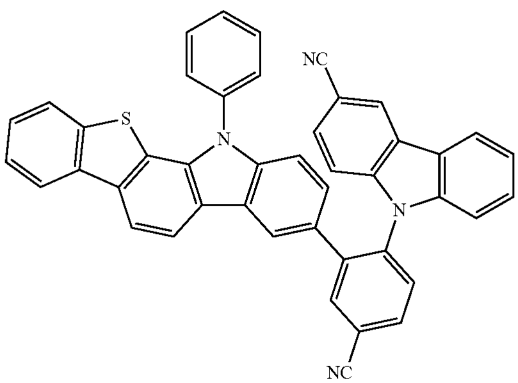
405
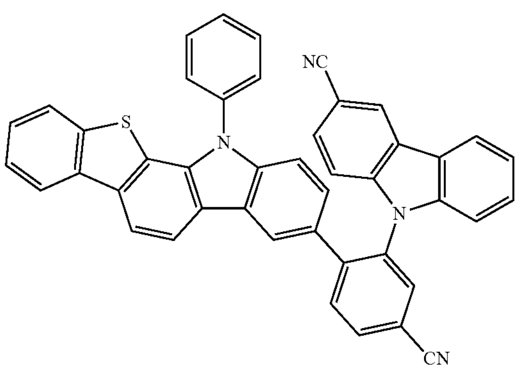
406
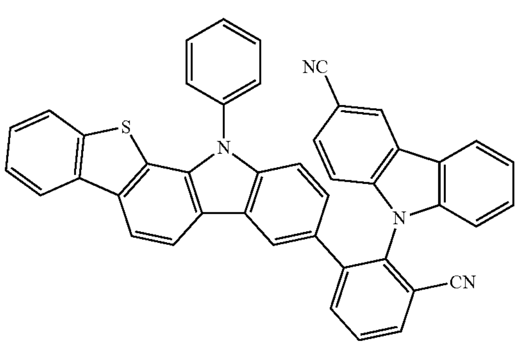
-continued
407
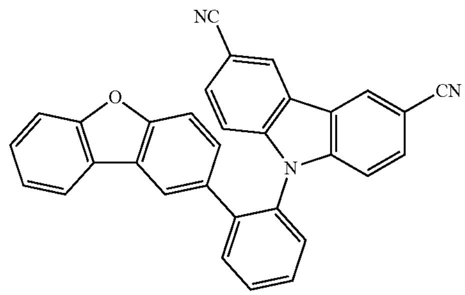
408
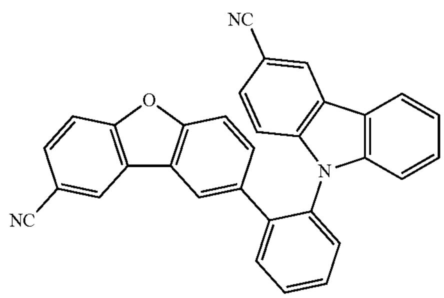
409
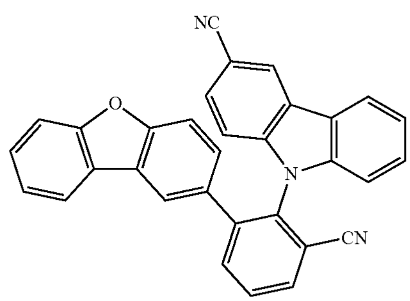
410
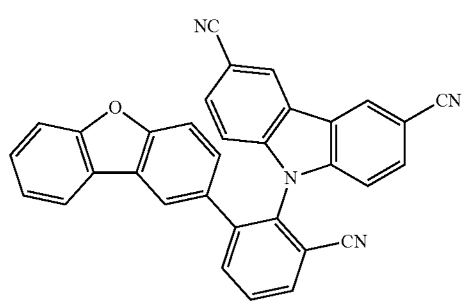
411
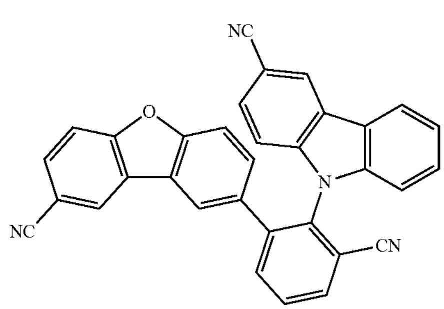

412
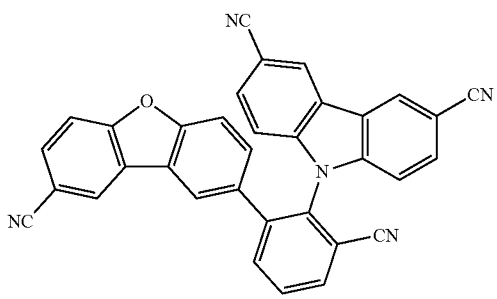
413
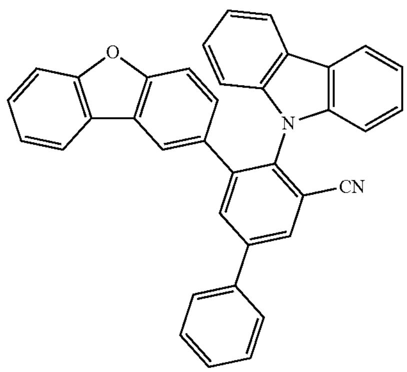
414
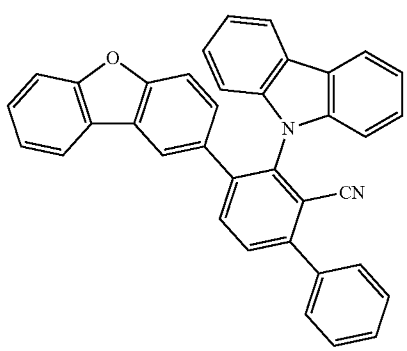
415
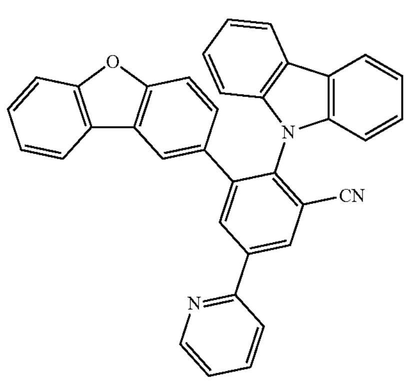
416
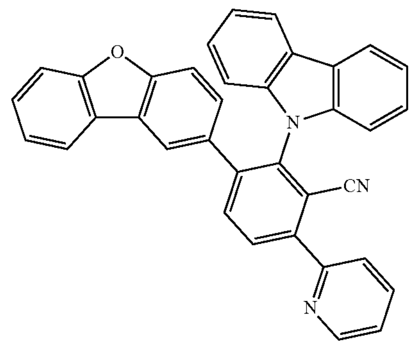
417
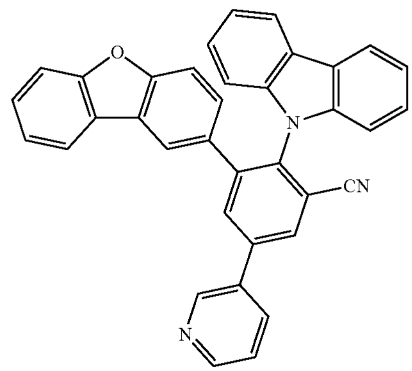
418
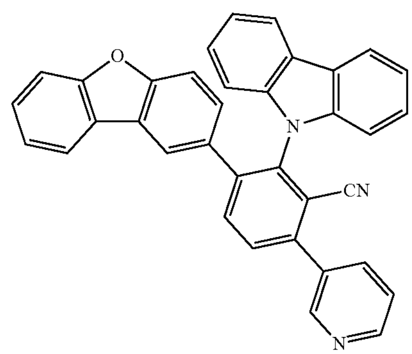
419
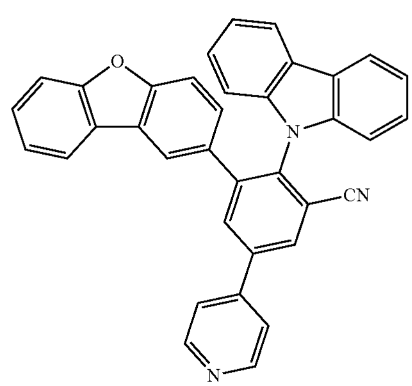

420
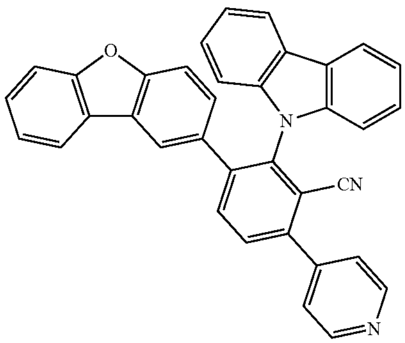
421
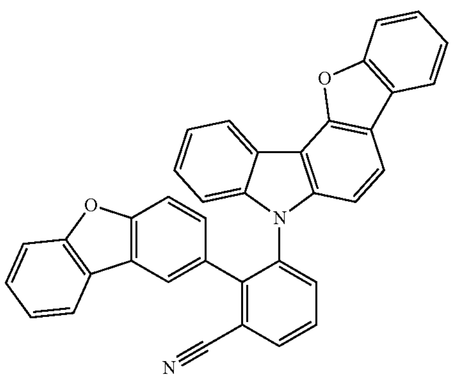
422
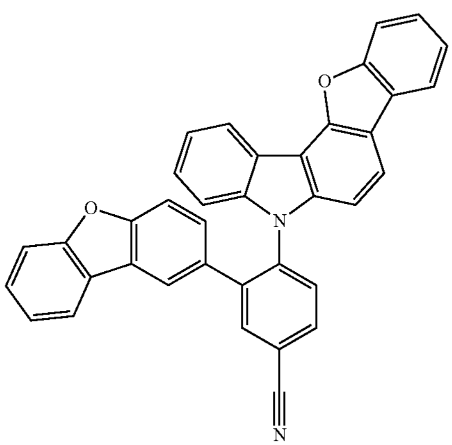
423
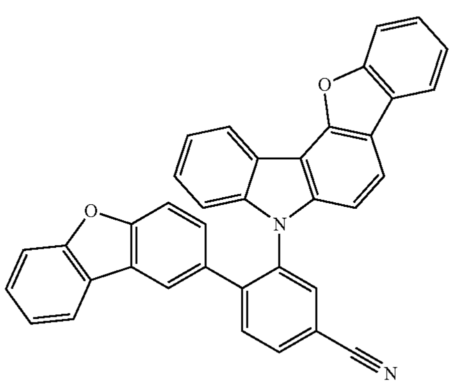
424
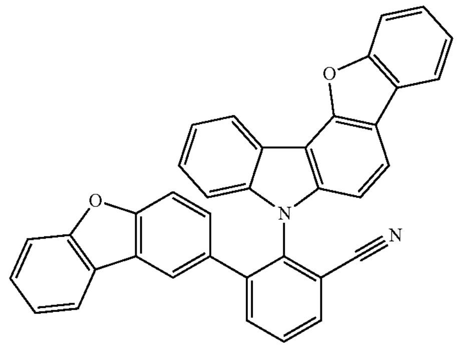
425
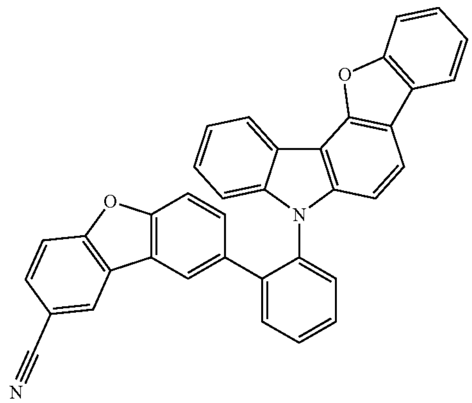
426
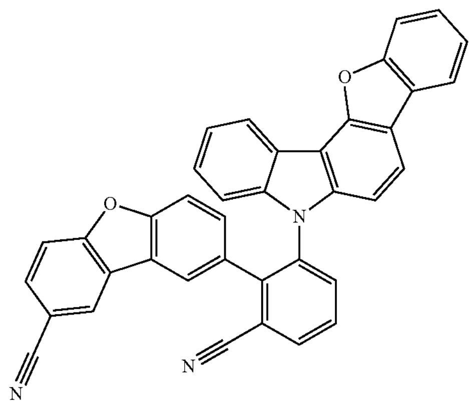
427
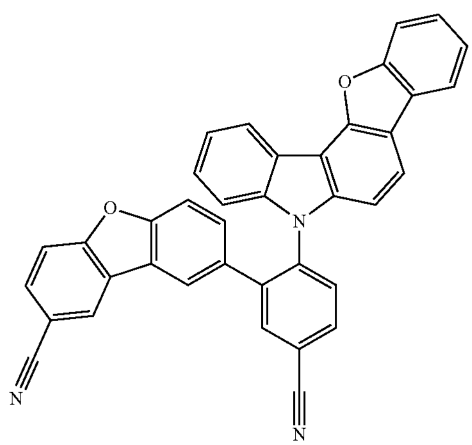

-continued
428
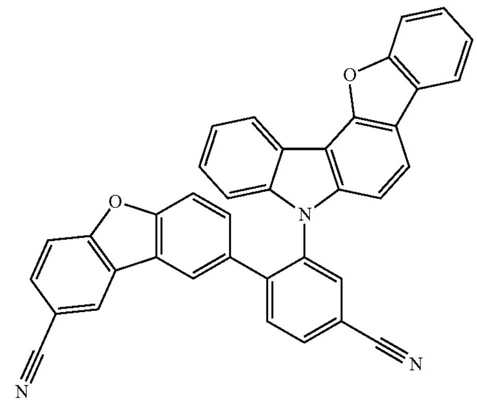
429
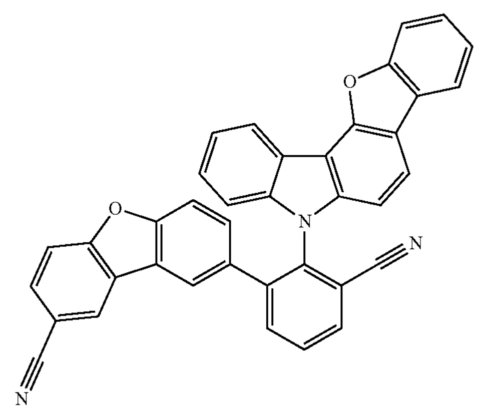
430
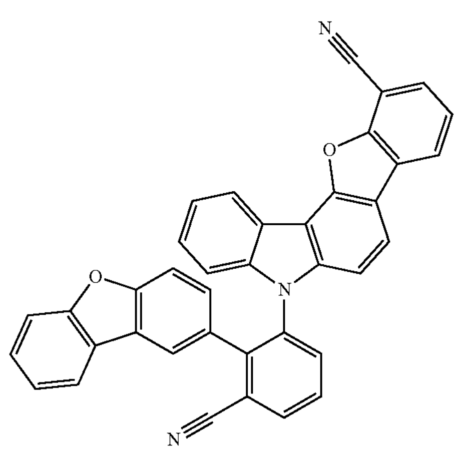
-continued
431
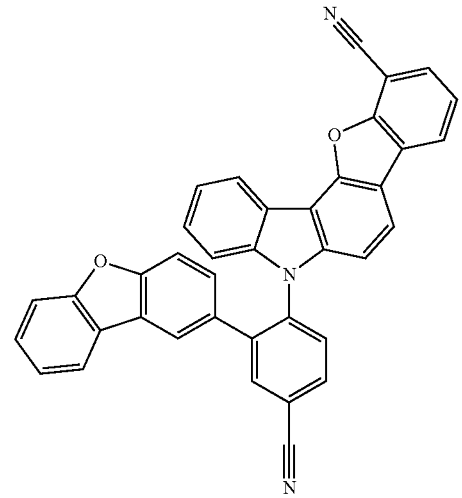
432
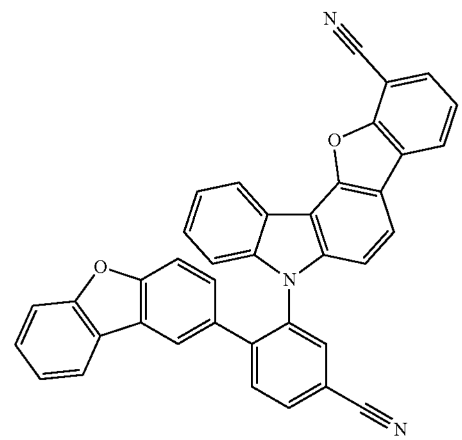
433
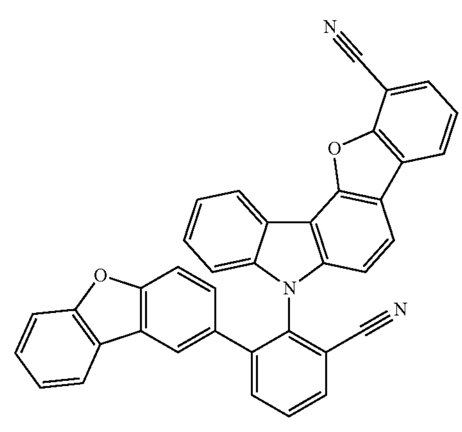

-continued
434
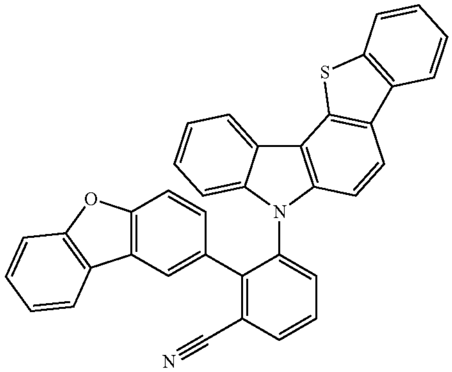
435
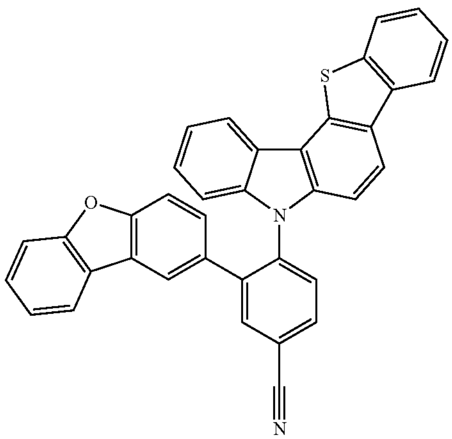
436
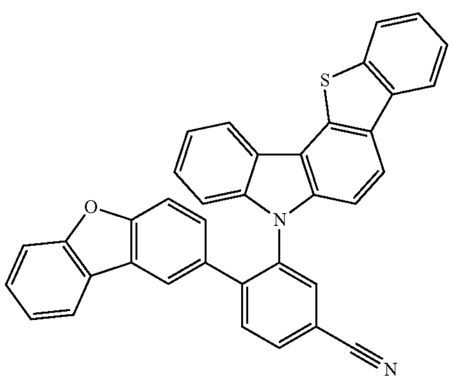
437
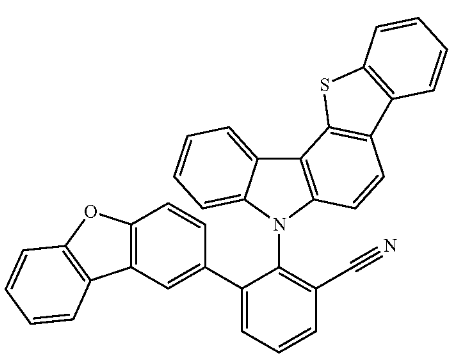
-continued
438
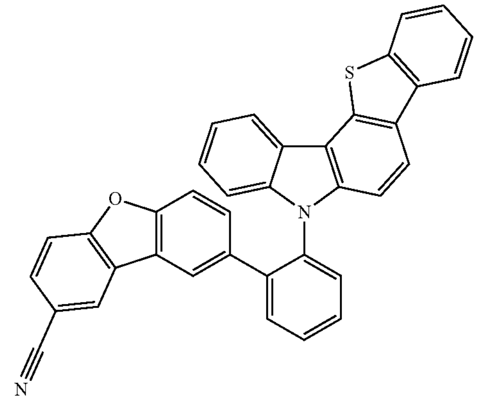
439
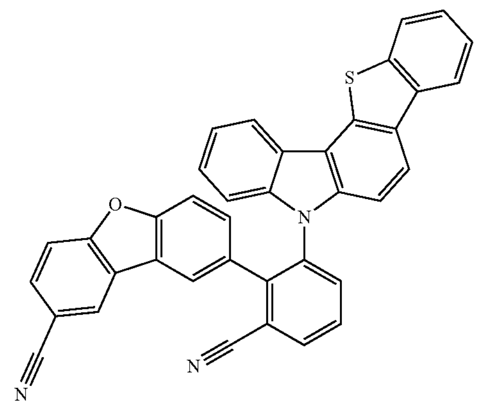
440
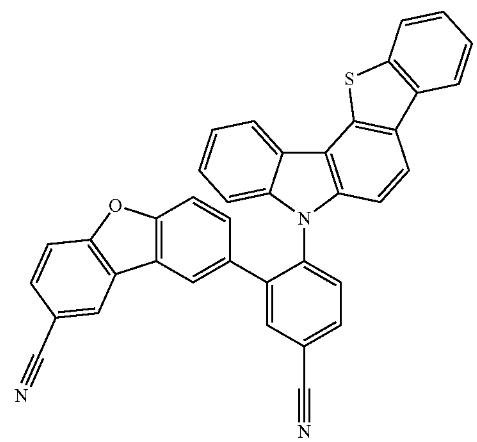
441
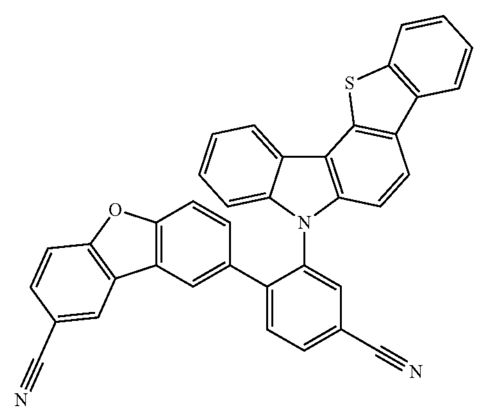

-continued
442
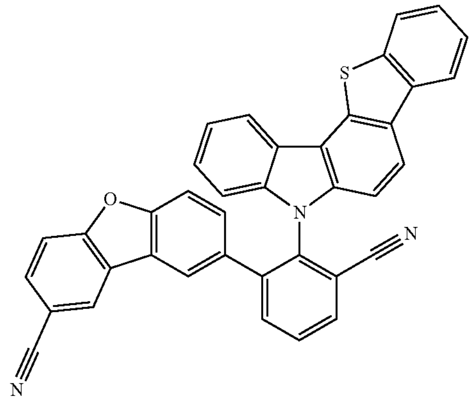
443
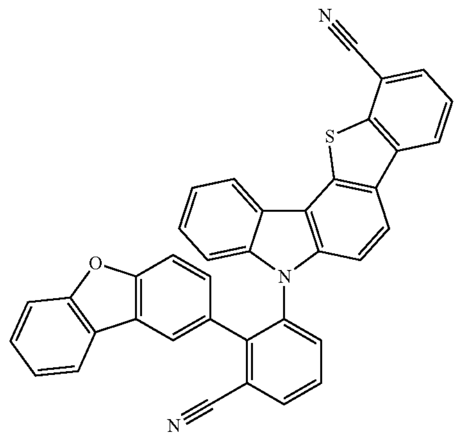
444
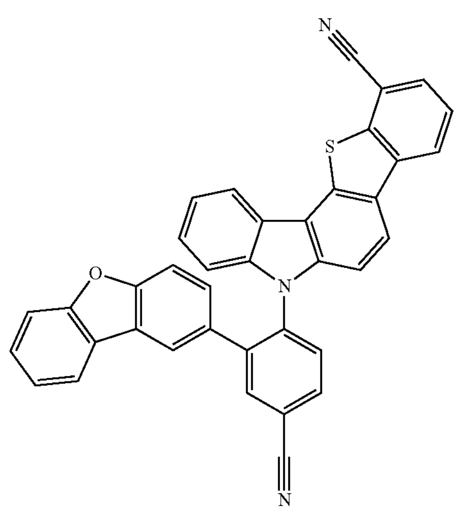
-continued
445
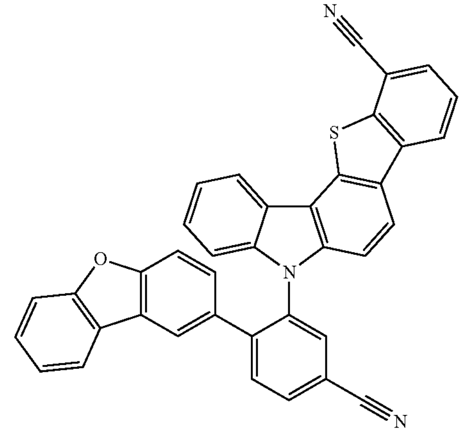
446
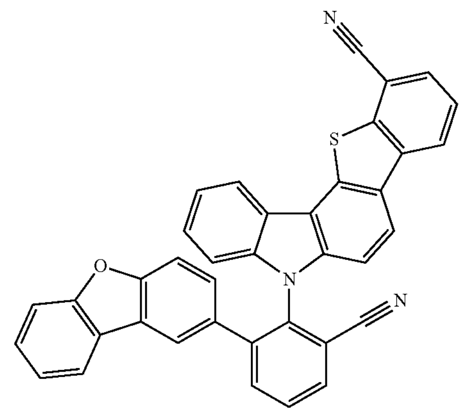
447
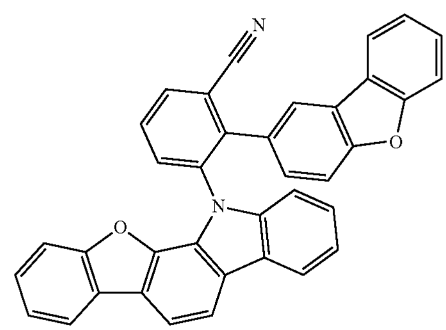
448
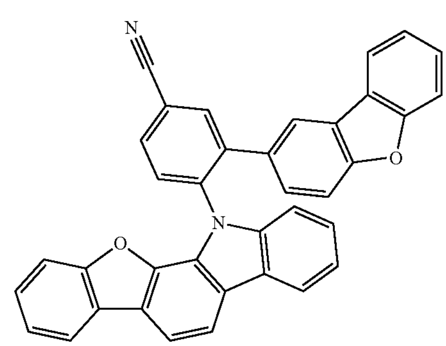

449
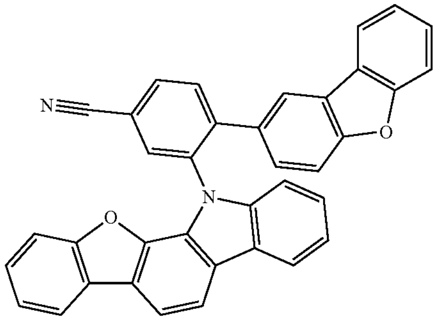
450
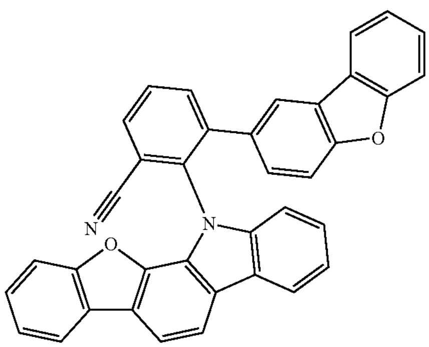
451
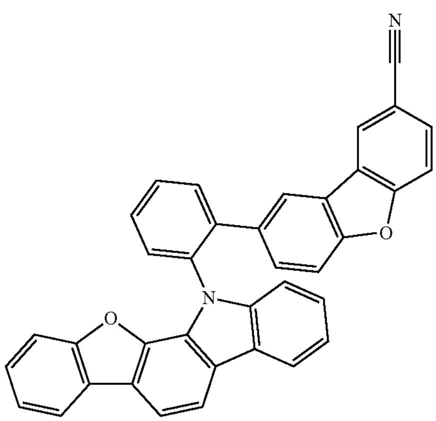
452
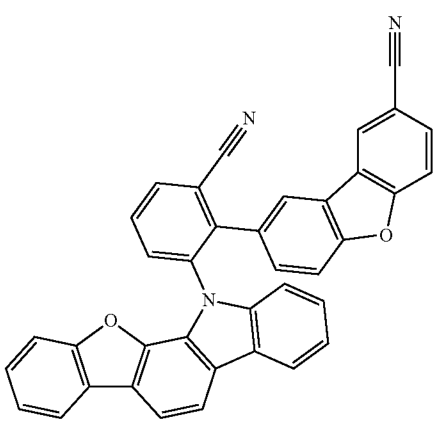
453
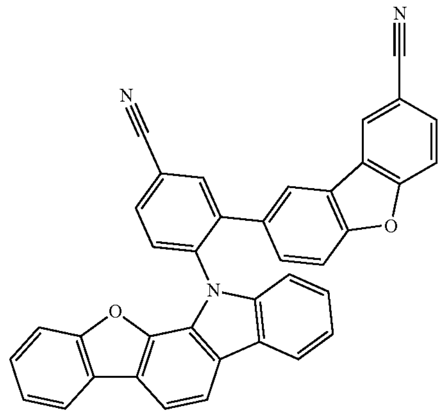
454
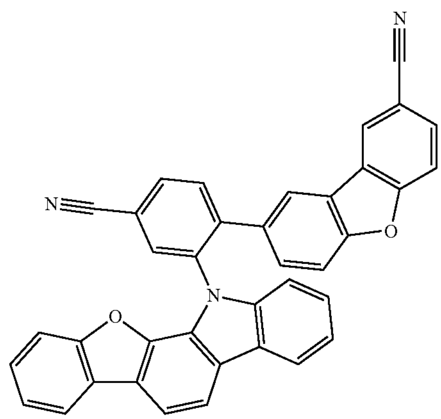
455
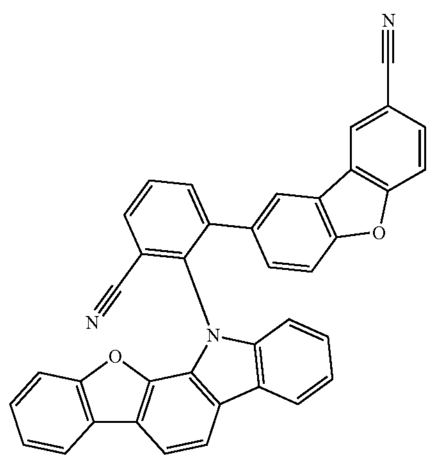
456
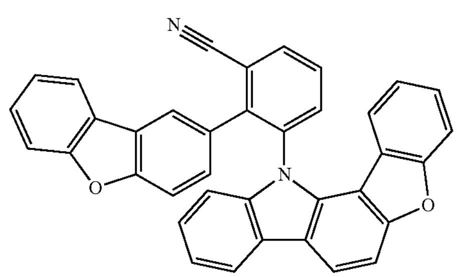

-continued
457
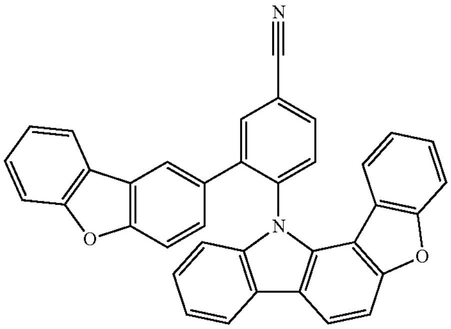
458
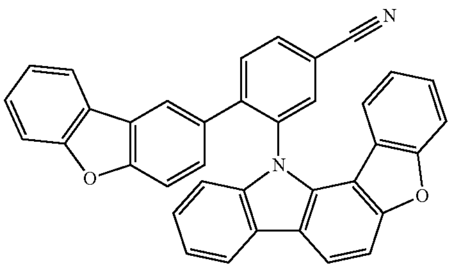
459
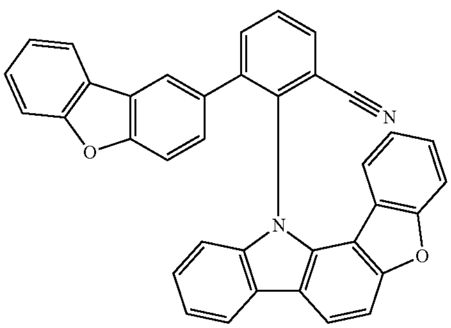
460
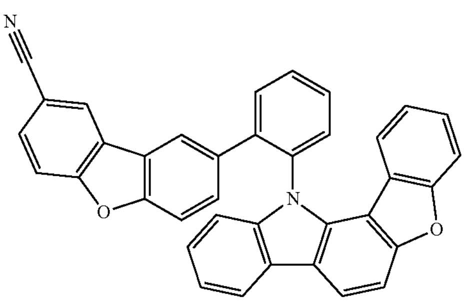
461
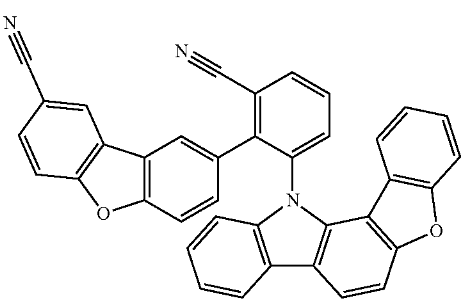
-continued
462
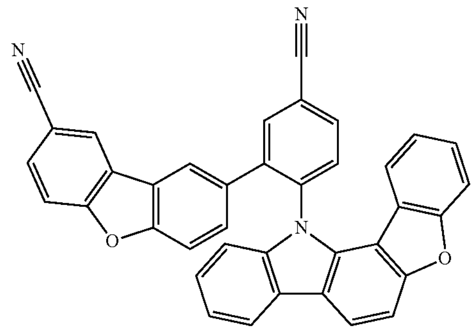
463
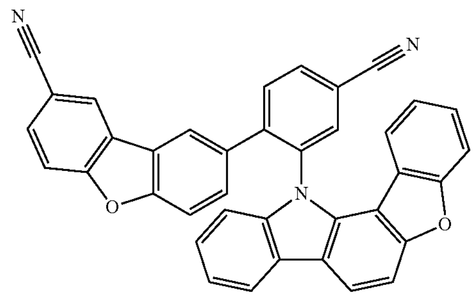
464
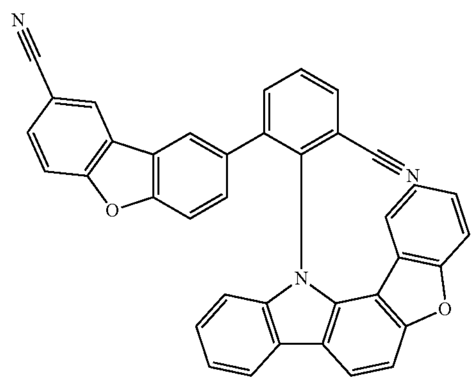
465
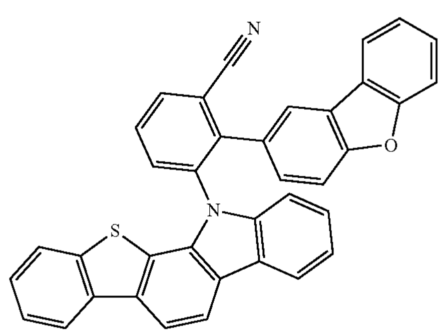

-continued
466
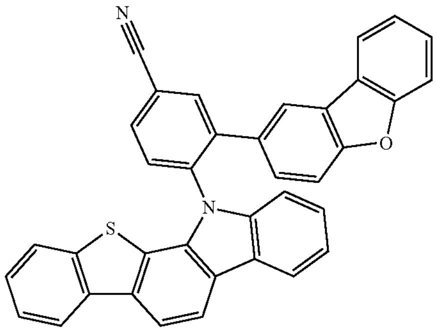
467
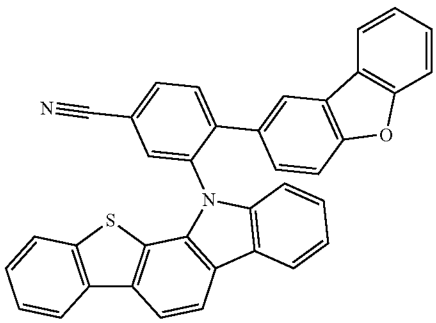
468
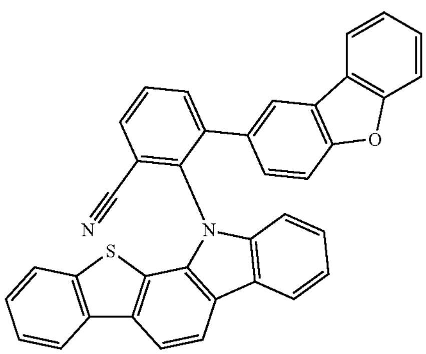
469
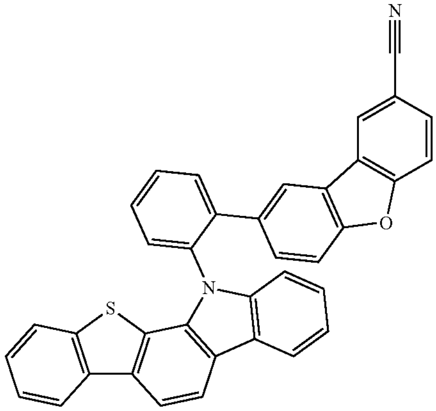
-continued
470
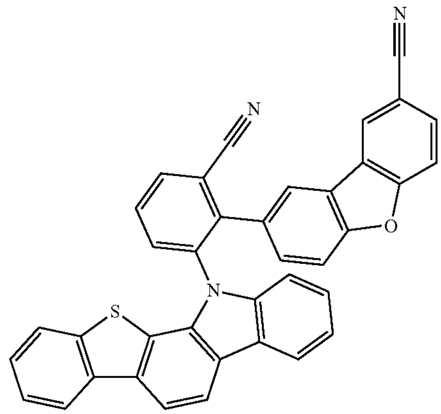
471
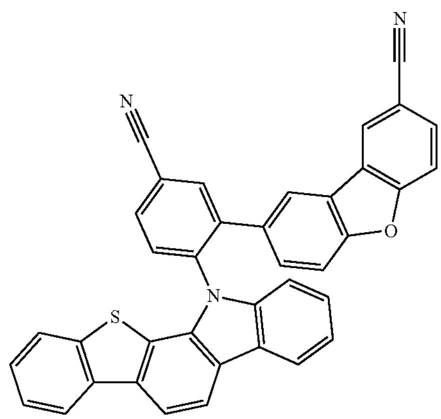
472
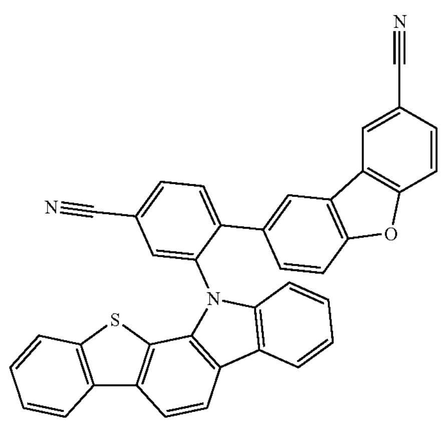

-continued
473
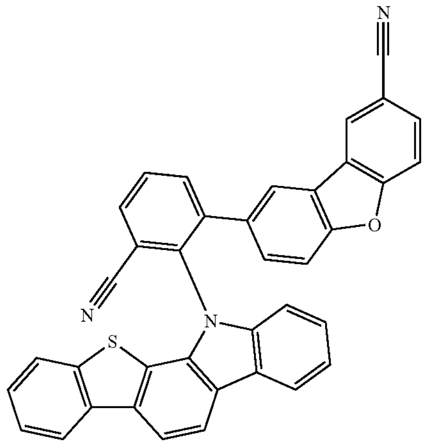
474
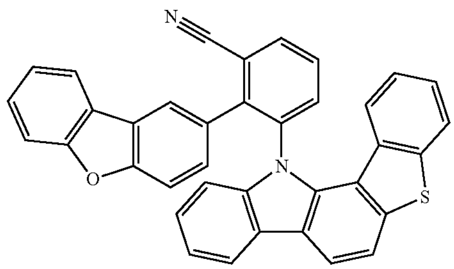
475
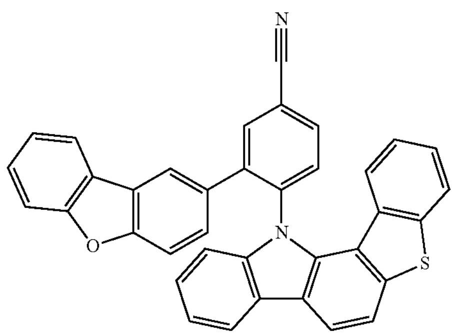
476
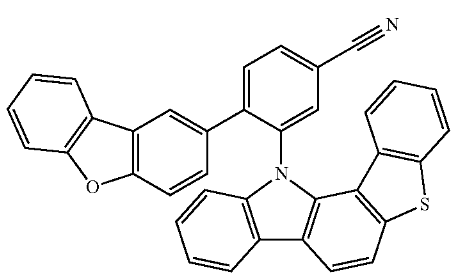
477
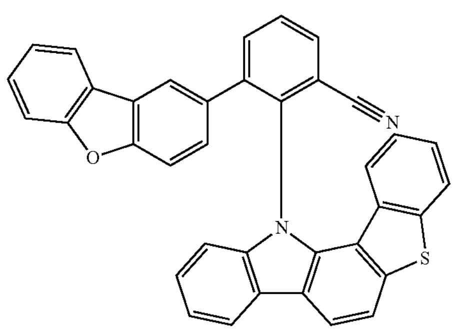
-continued
478
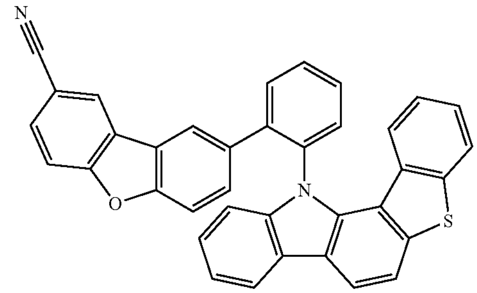
479
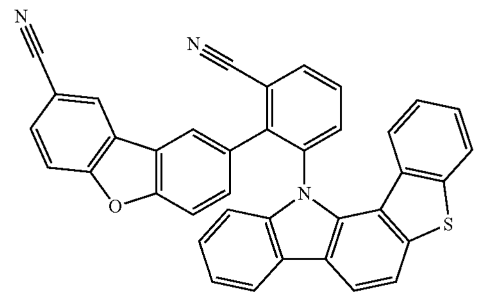
480
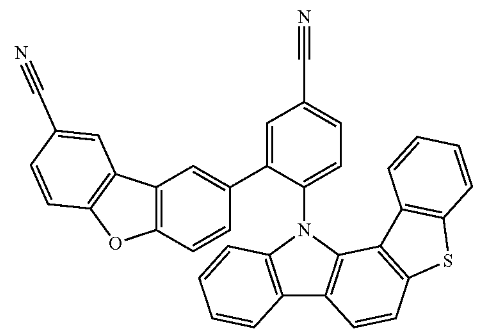
481
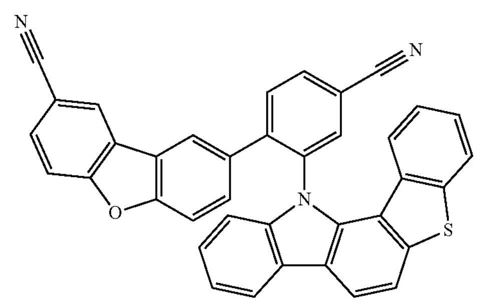
482
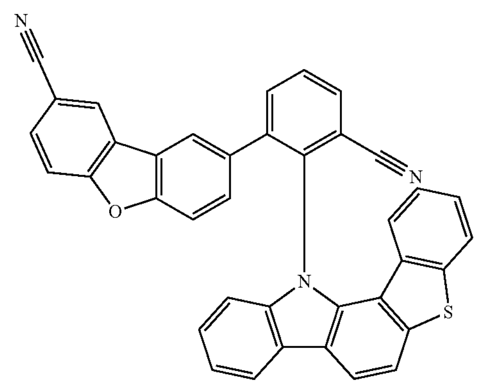

Group HE4
1
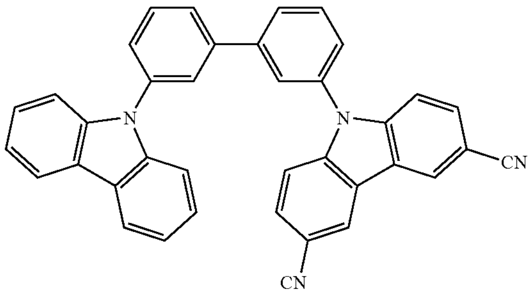
2
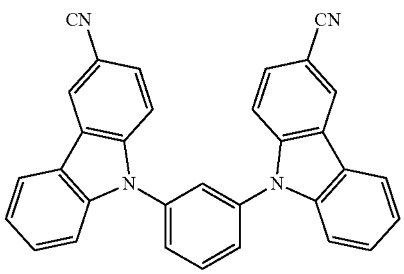
3
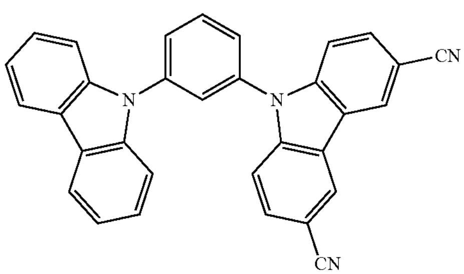
4
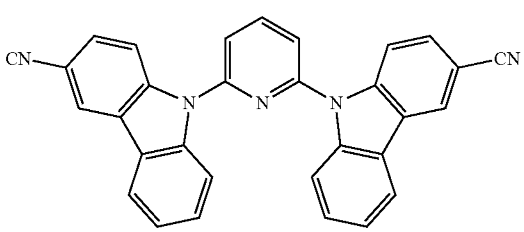
5
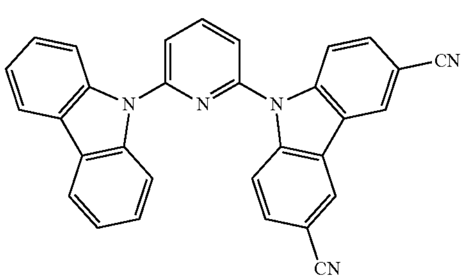
-continued
6
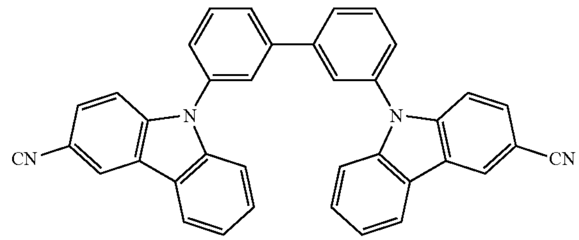
7
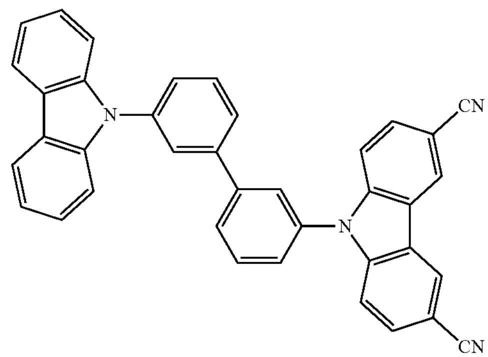
8
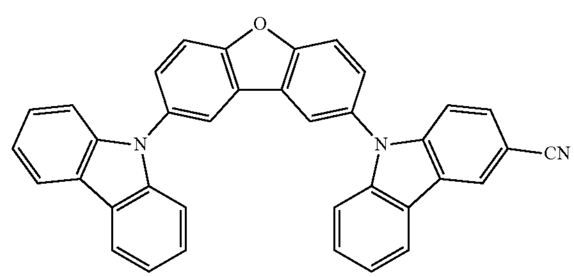
9
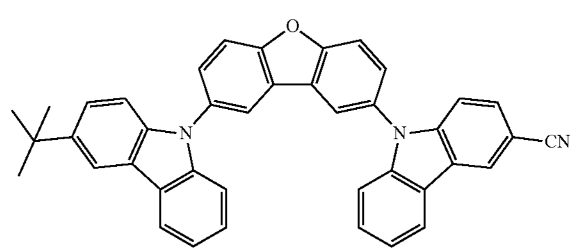
10
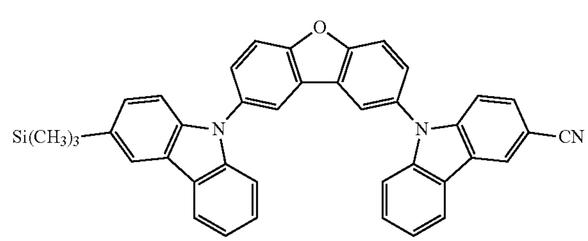

-continued
11
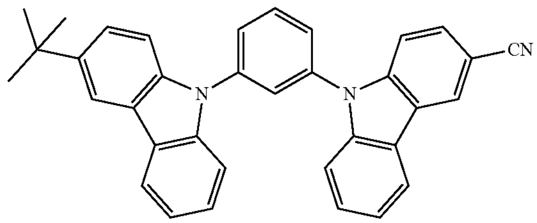
12
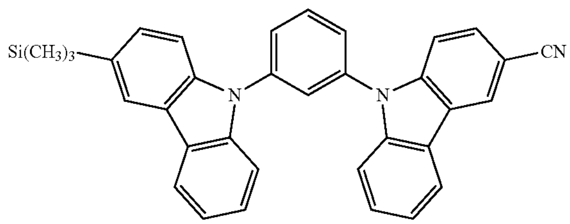
13
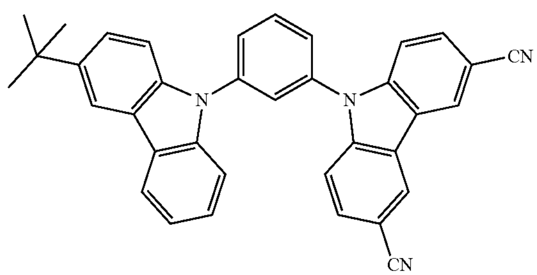
14
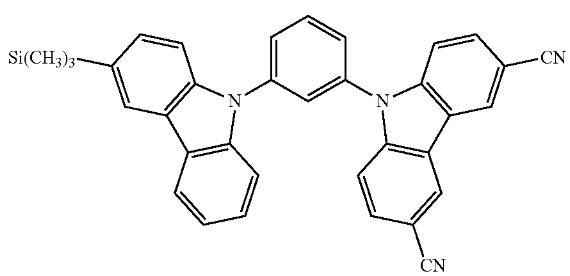
15
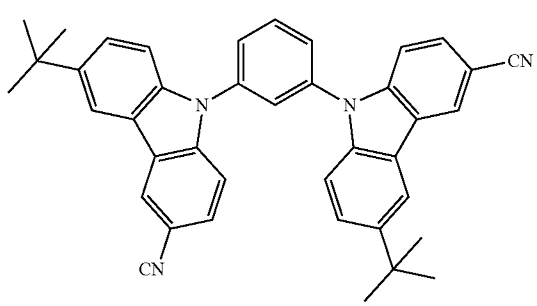
-continued
16
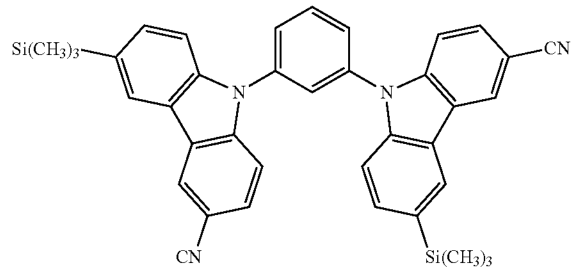
17
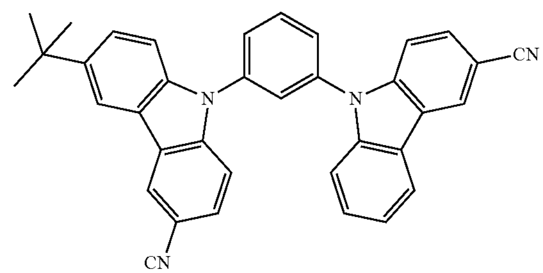
18
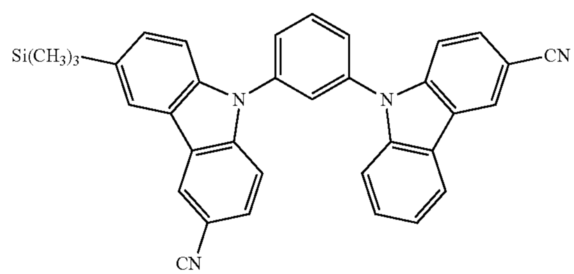
19
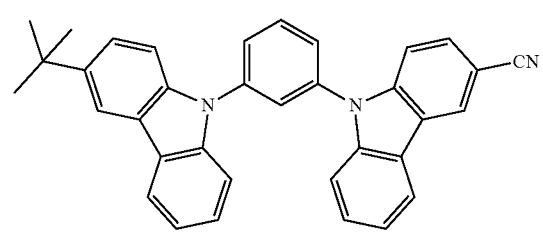
20
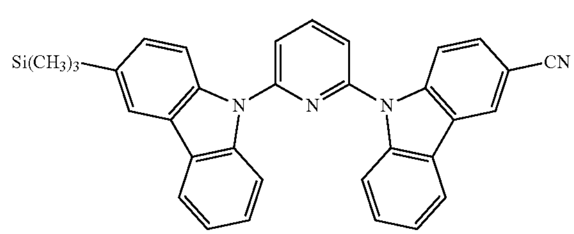

-continued
21
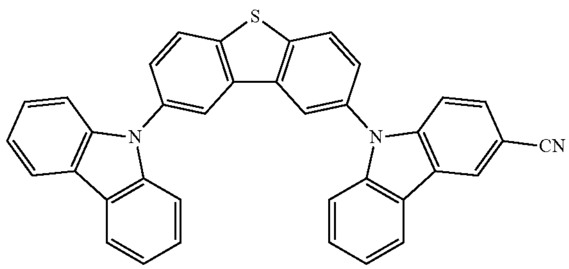
22
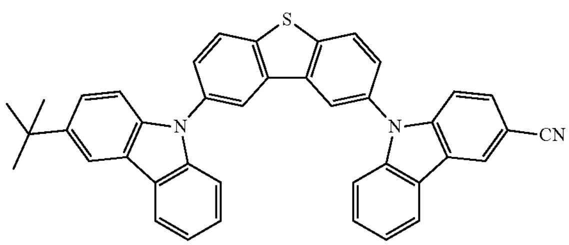
23
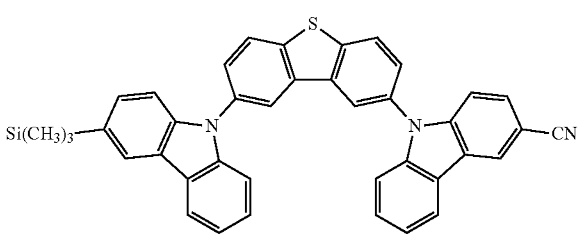
24
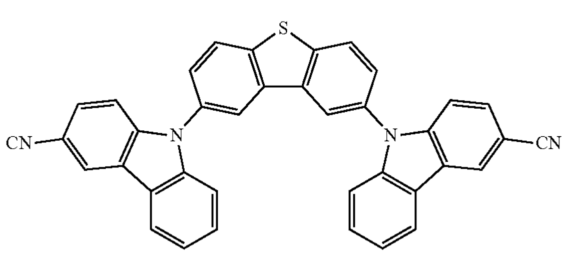
25
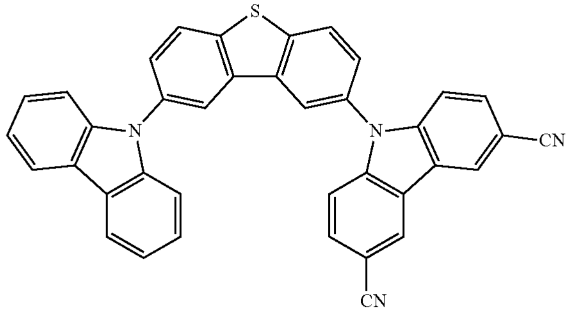
-continued
26
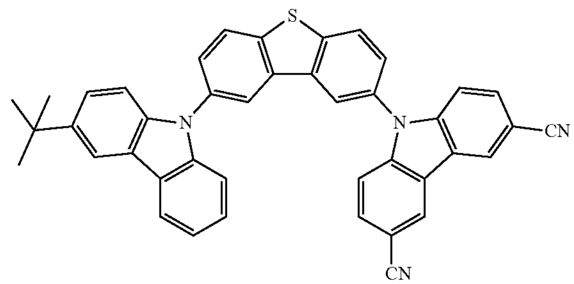
27
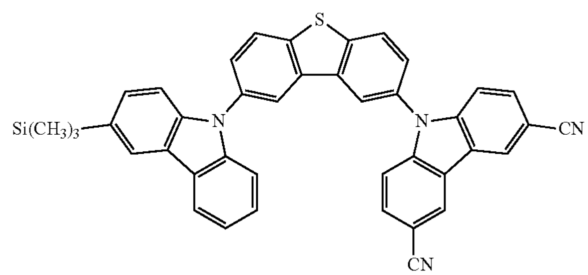
28
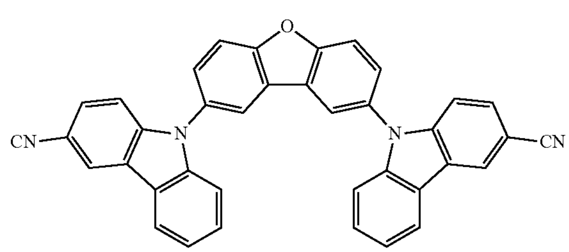
29
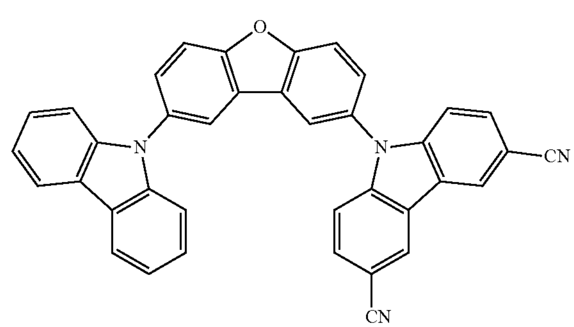
30
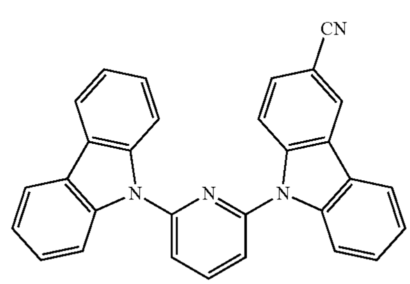

-continued
31
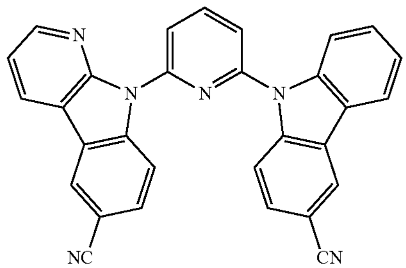
32
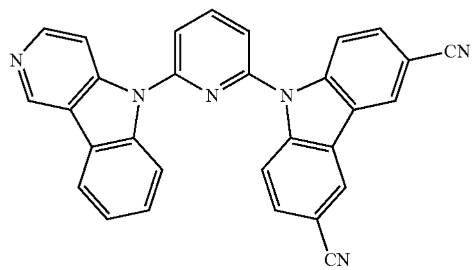
33
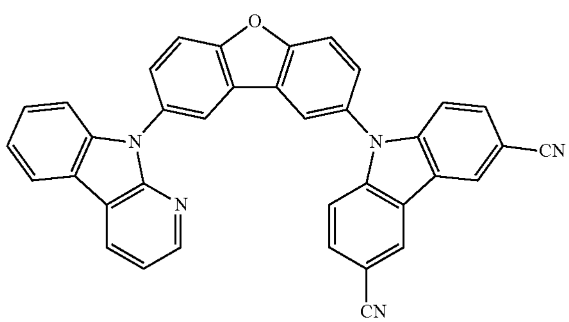
34
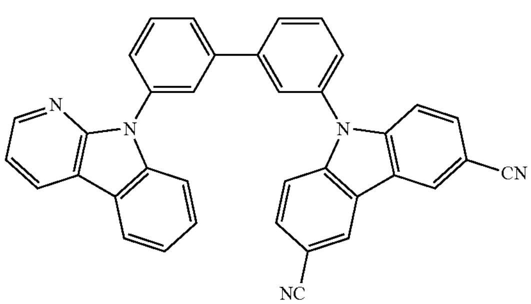
35
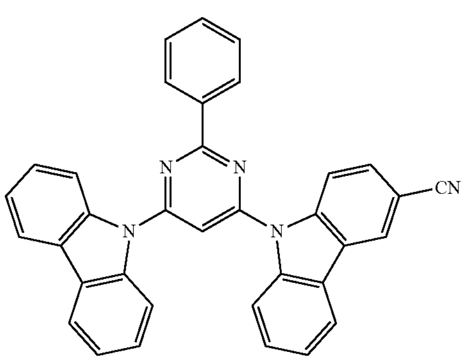
-continued
36
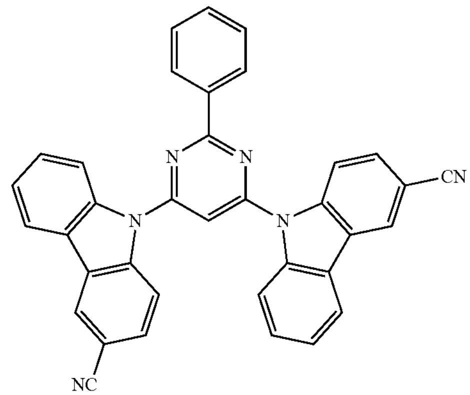
37
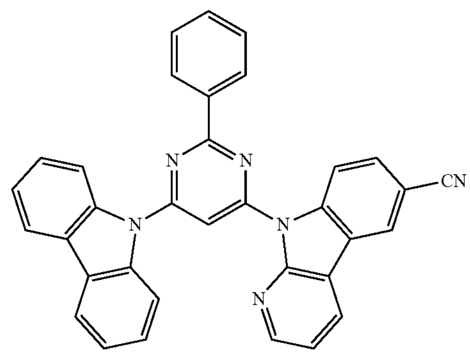
38
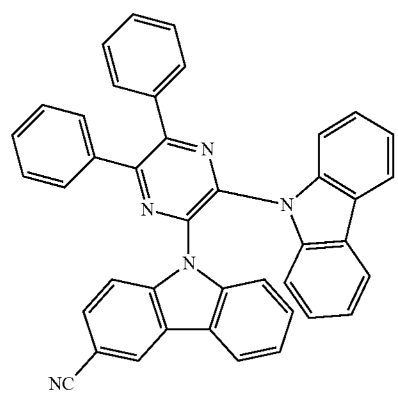
39
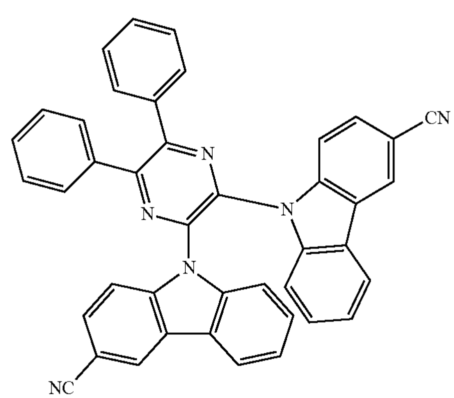

-continued
40
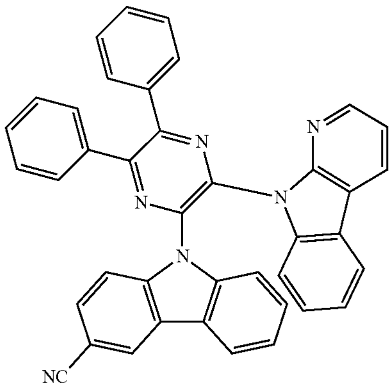
41
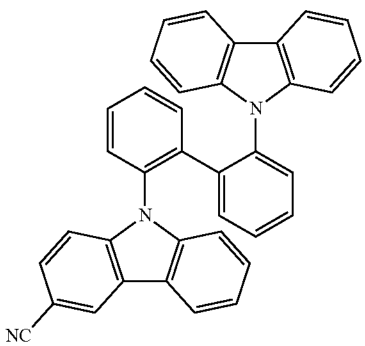
42
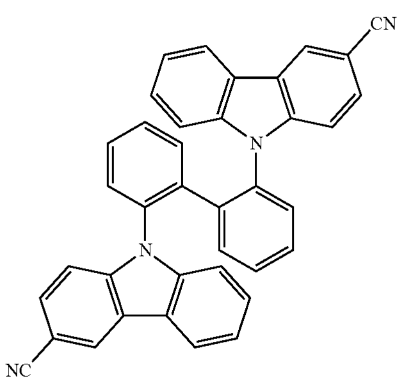
43
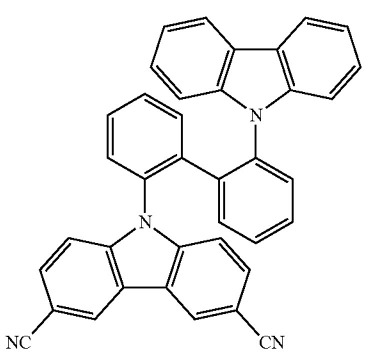
-continued
44
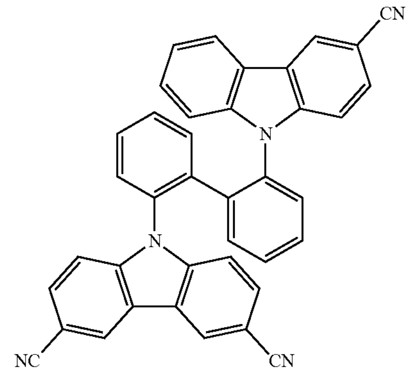
45
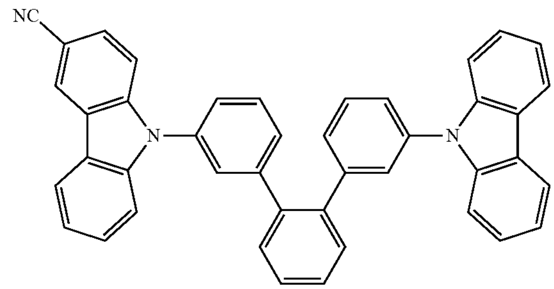
46
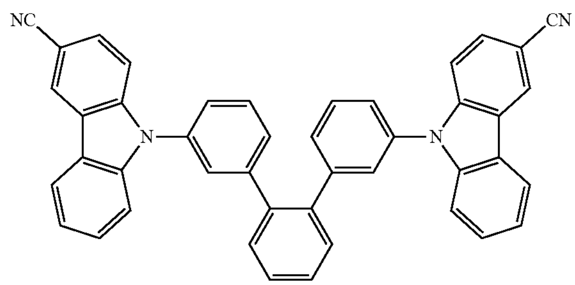
47
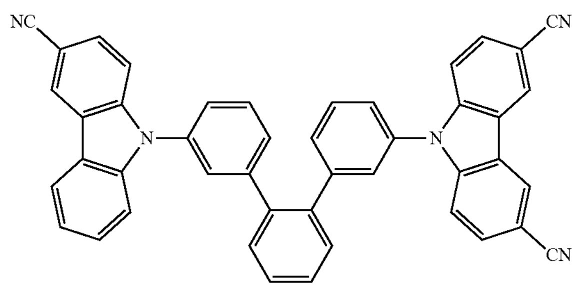
48
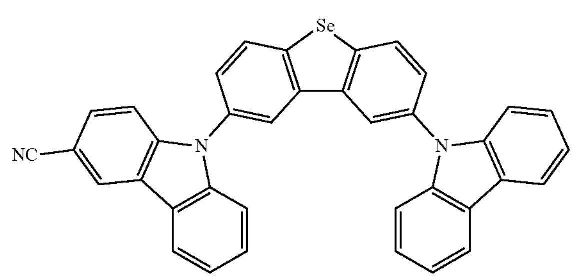

-continued
49
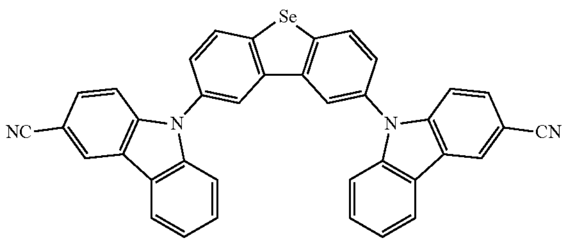
50
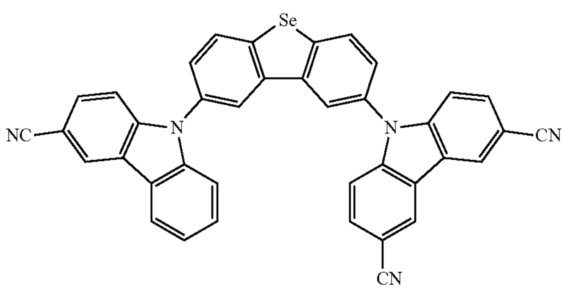
51
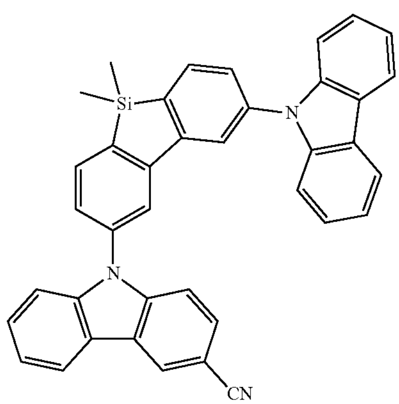
52
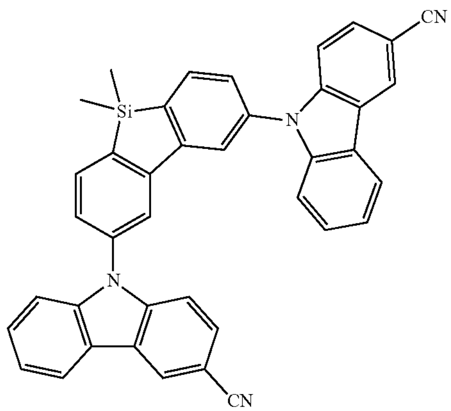
-continued
53
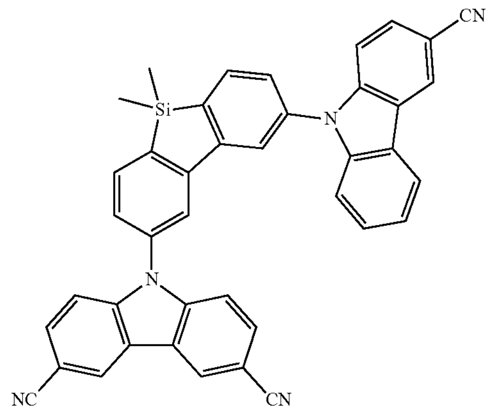
54
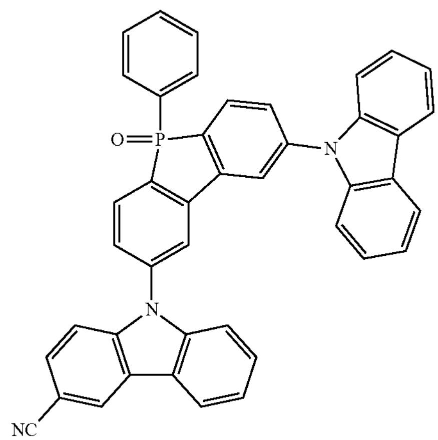
55
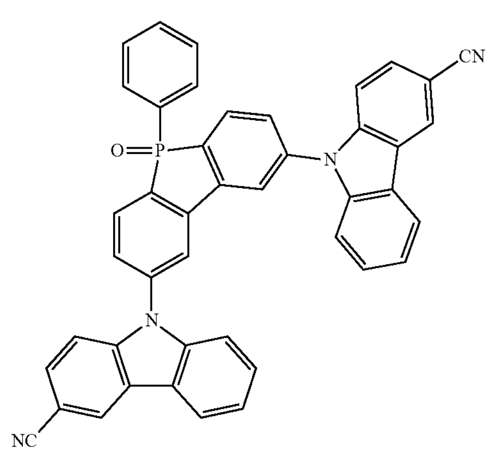

-continued
56
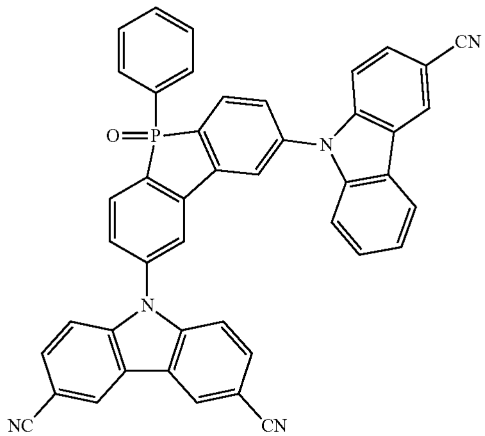
Group HE5
1
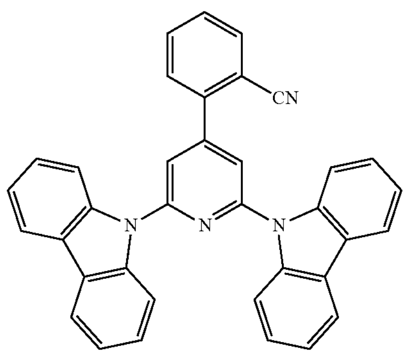
2
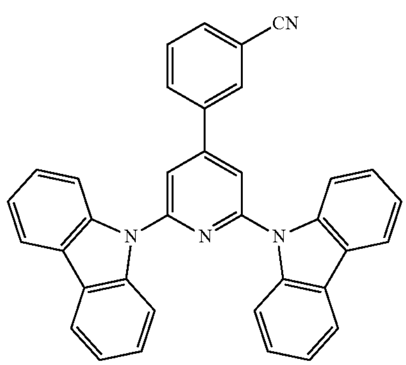
-continued
3
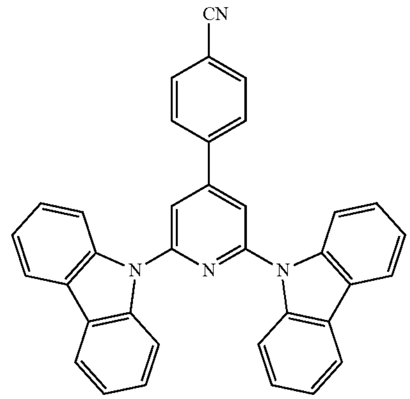
4
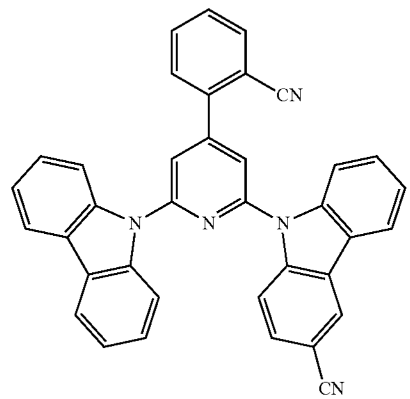
5
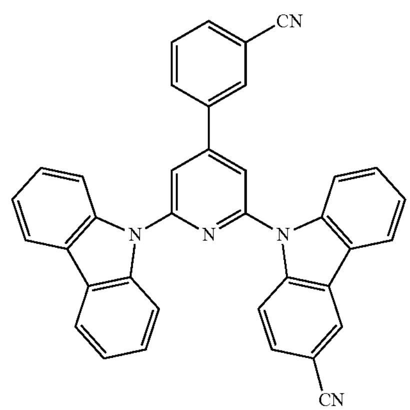
6
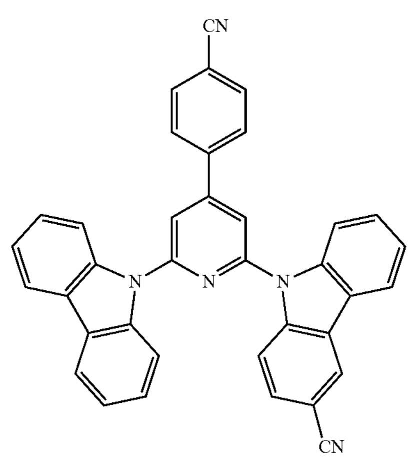

7
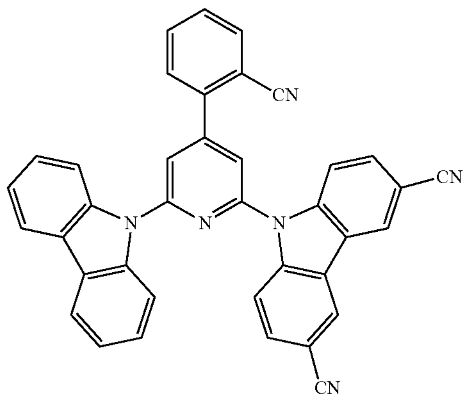
8
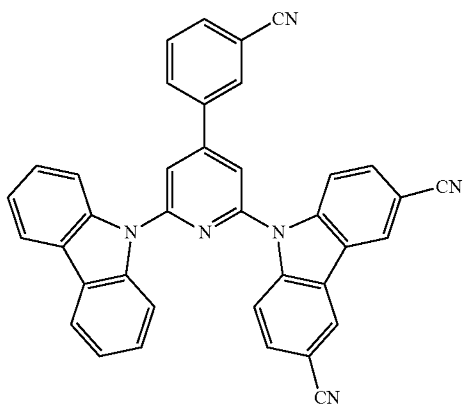
9
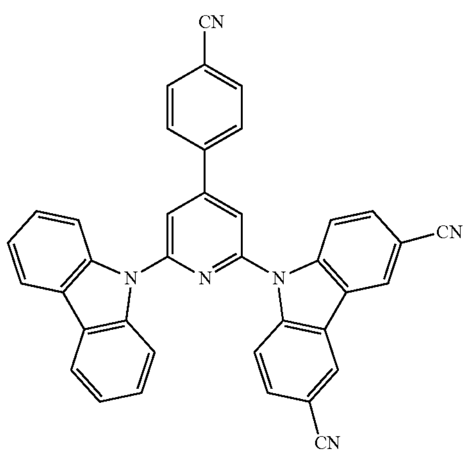
10
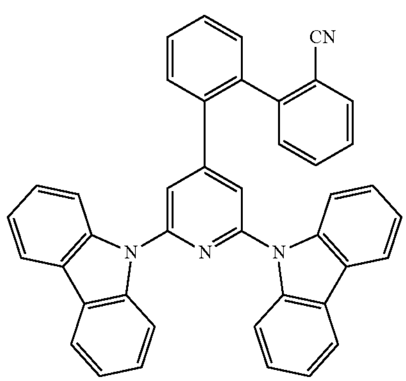
11
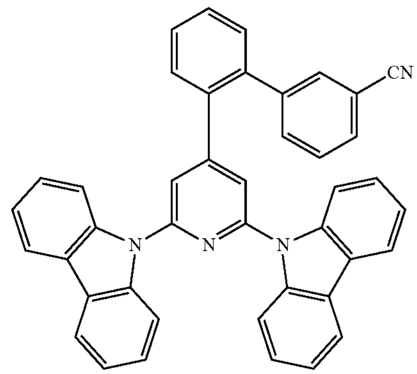
12
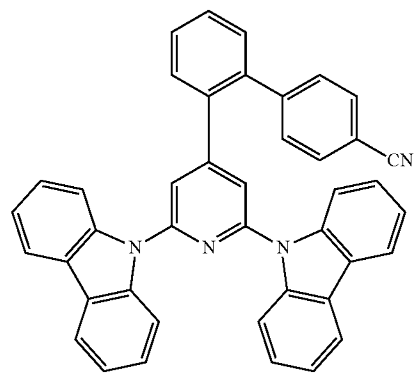
13
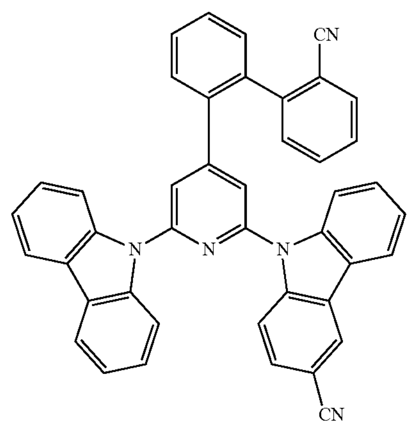
14
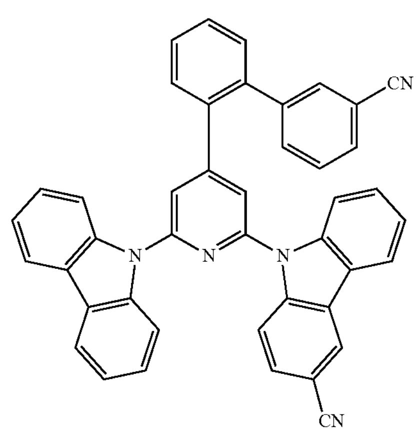

-continued
15
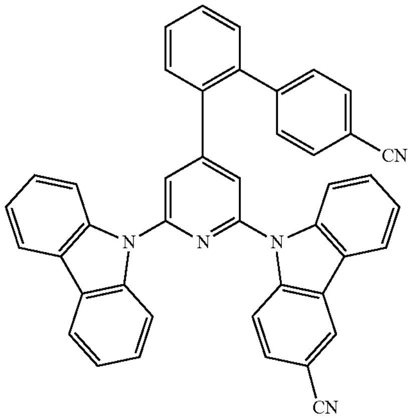
16
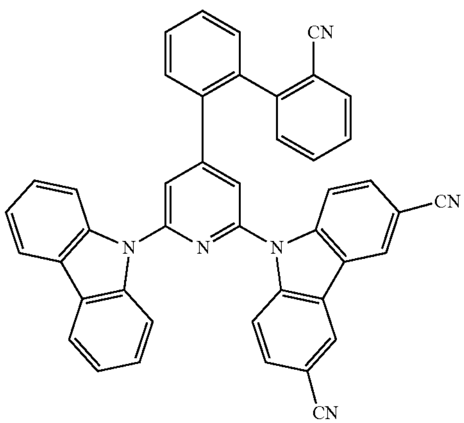
17
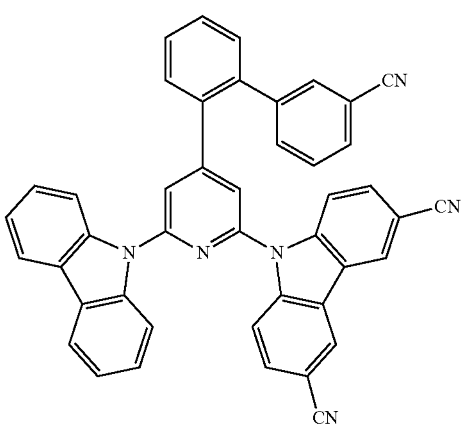
-continued
18
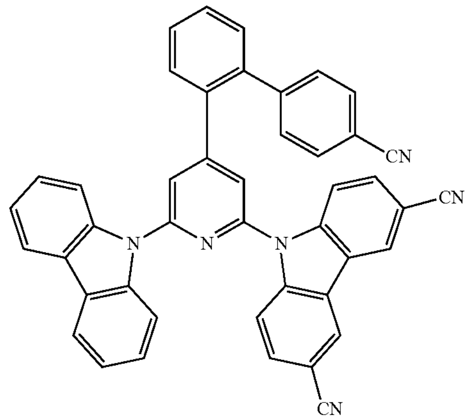
19
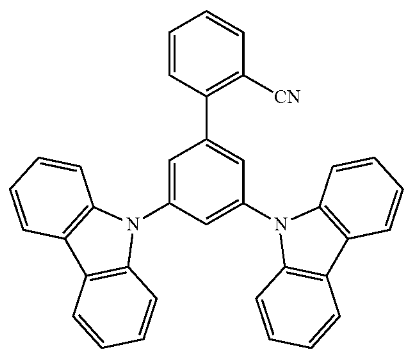
20
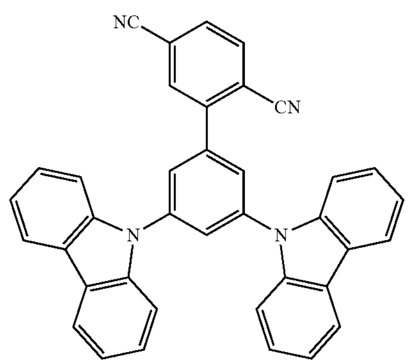
21
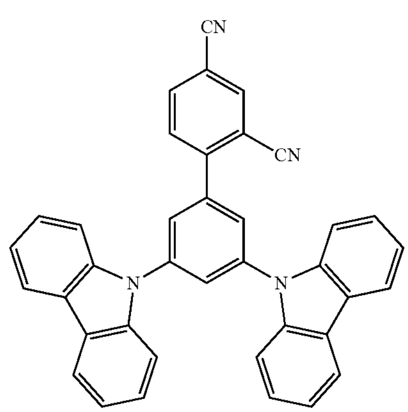

-continued
22
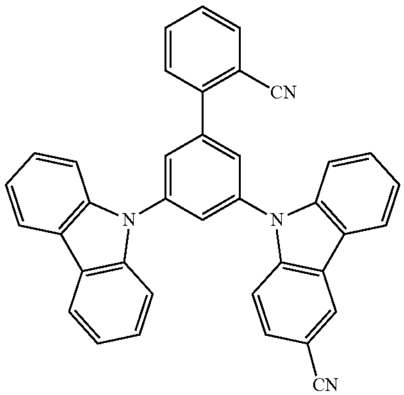
23
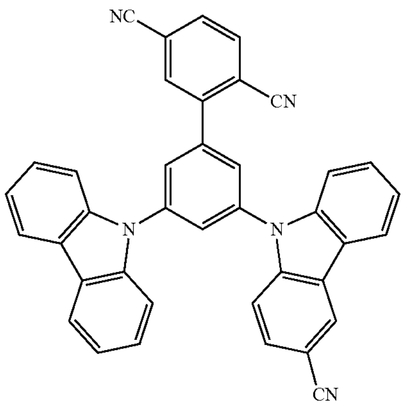
24
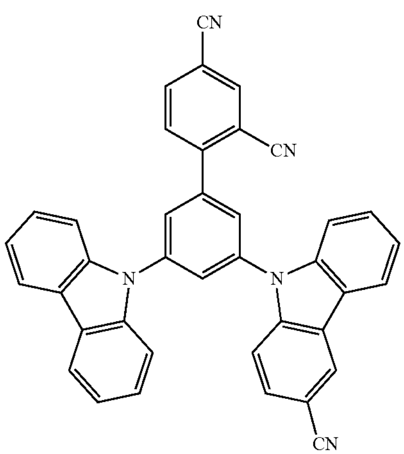
25
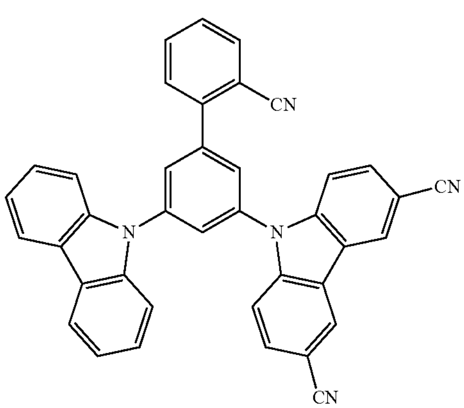
-continued
26
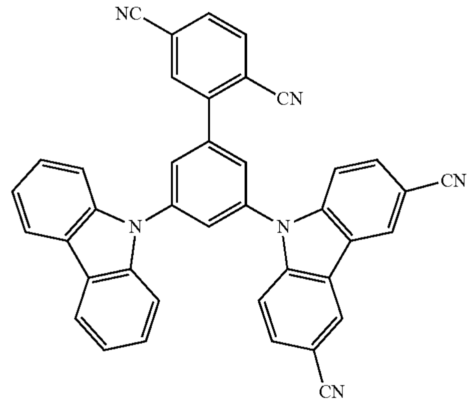
27
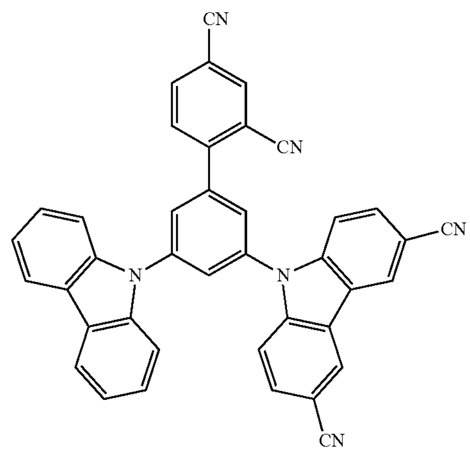
28
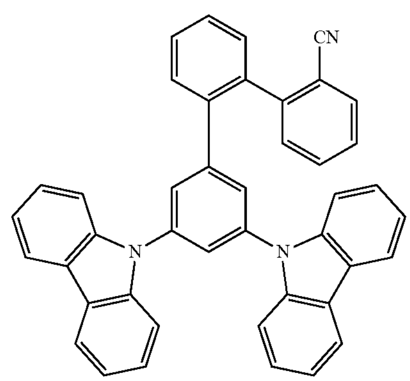
29
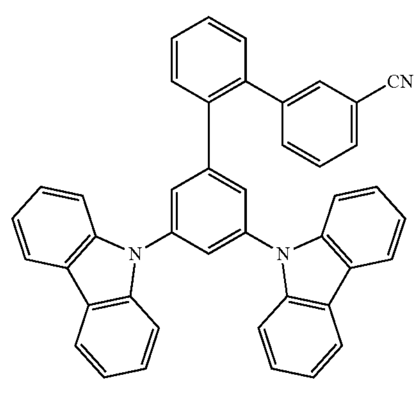

-continued
30
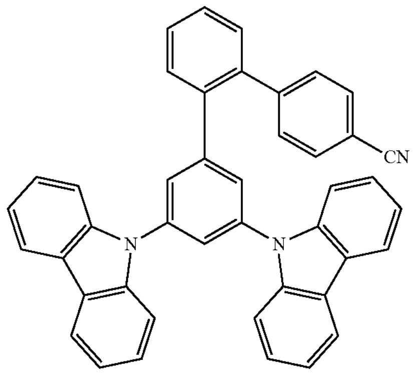
31
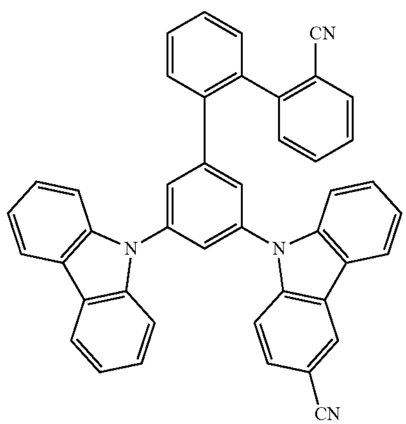
32
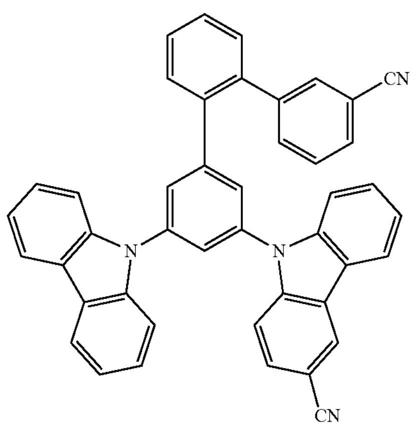
33
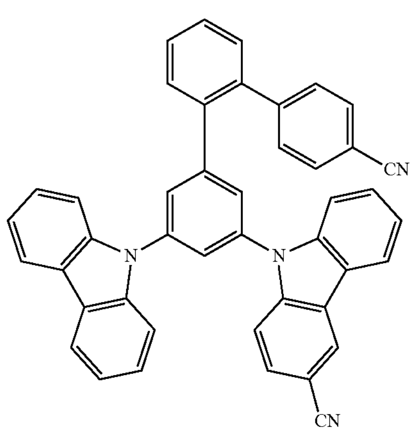
-continued
34
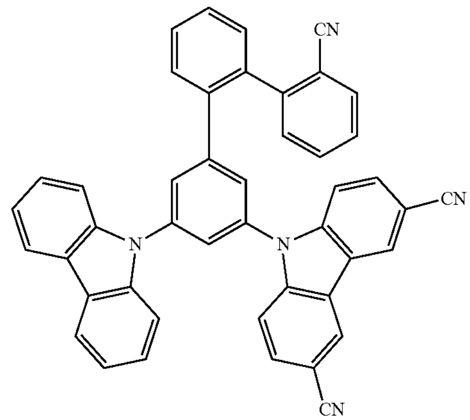
35
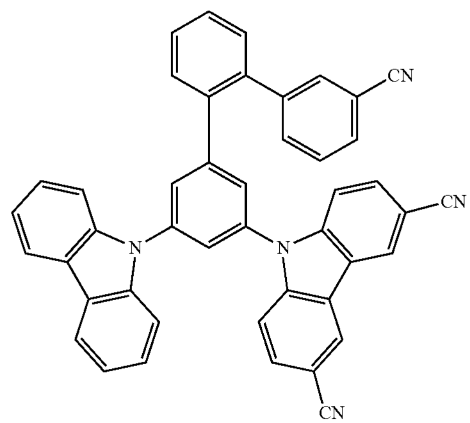
36
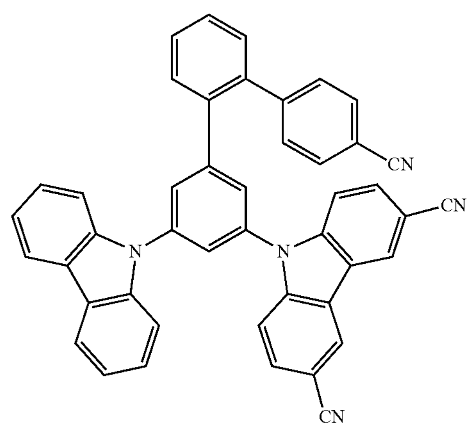
37
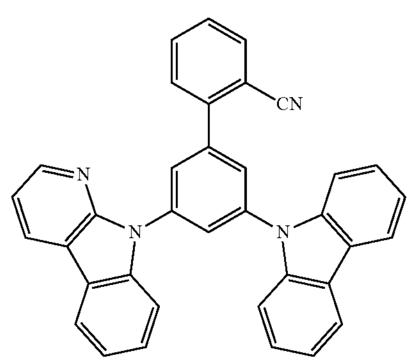

-continued
38
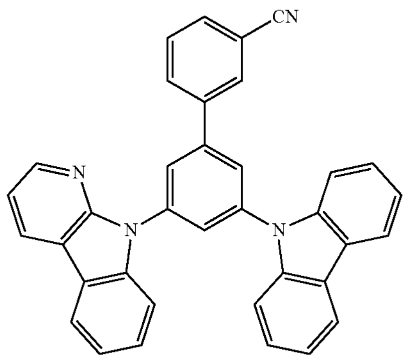
39
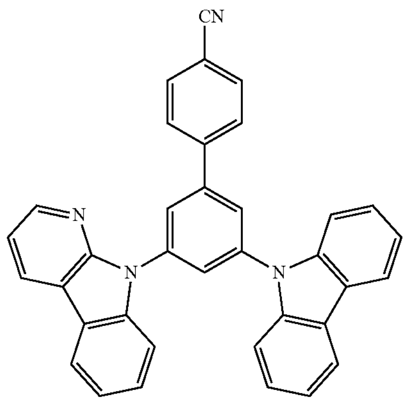
40
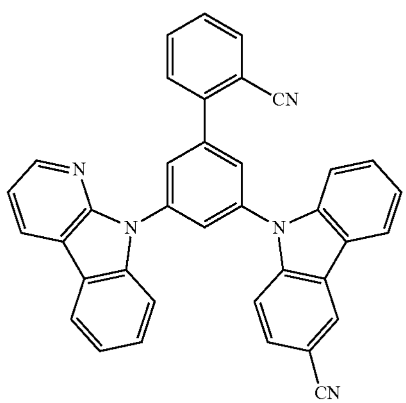
41
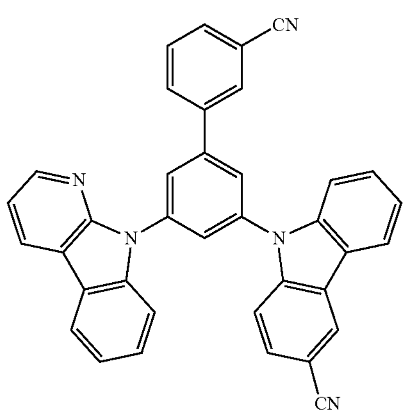
-continued
42
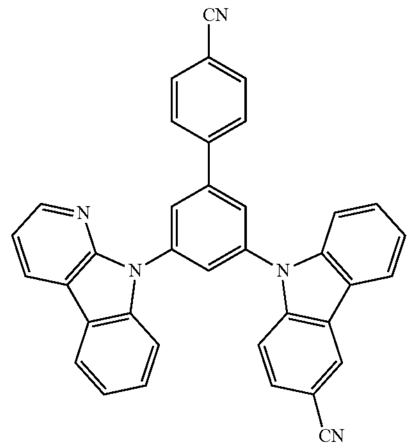
43
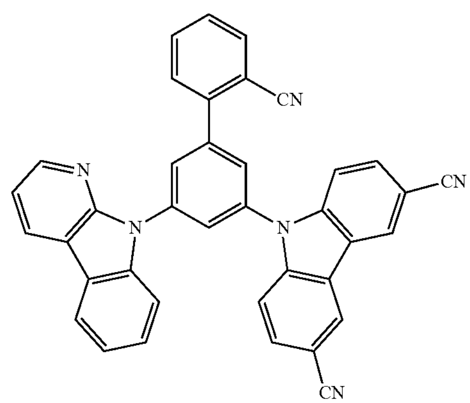
44
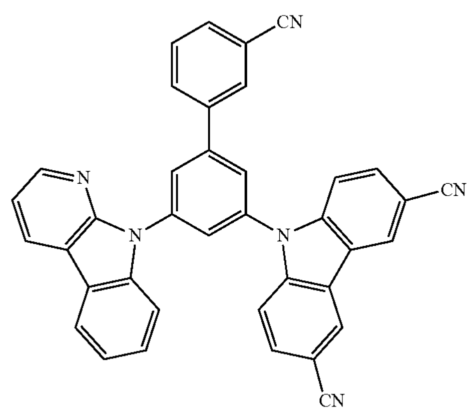

-continued
45
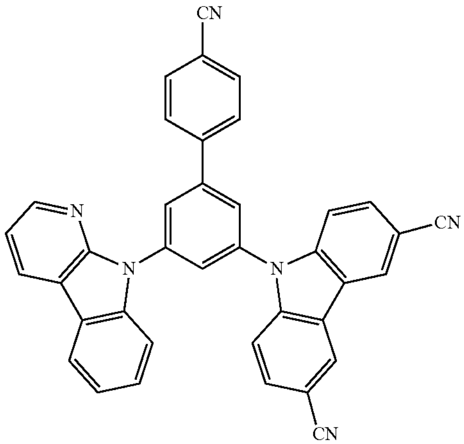
46
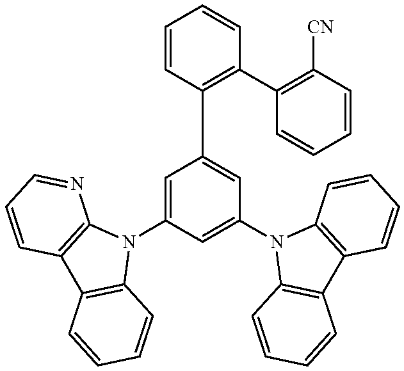
47
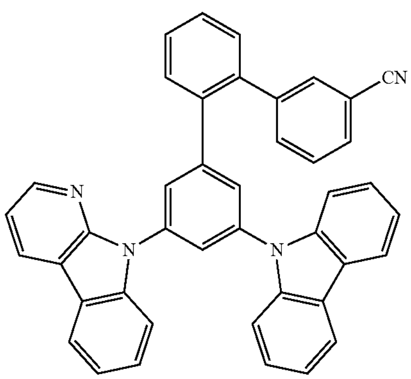
48
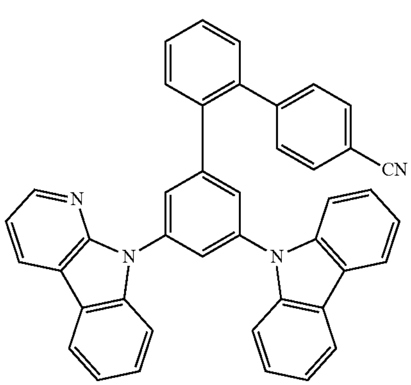
-continued
49
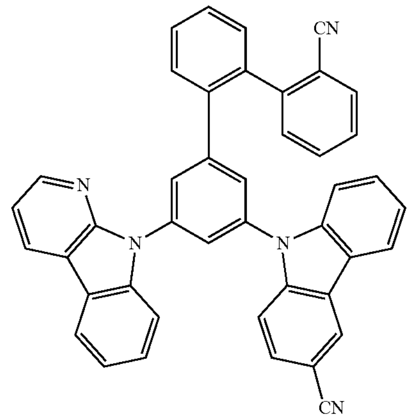
50
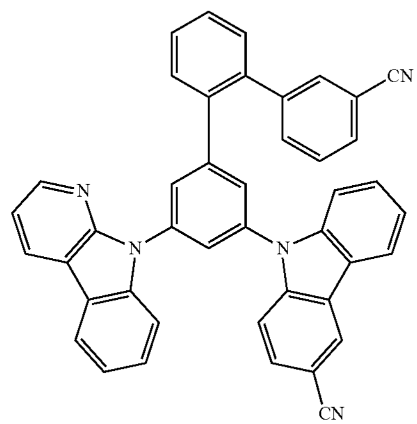
51
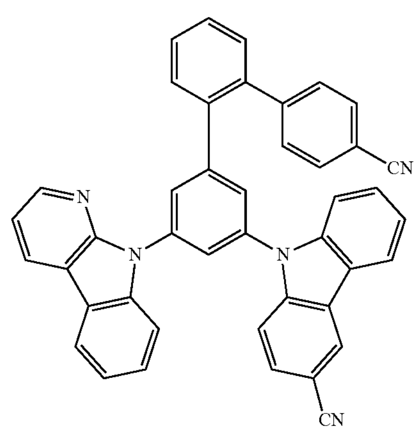

-continued
52
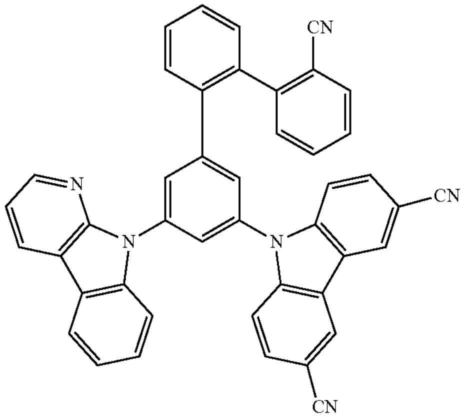
53
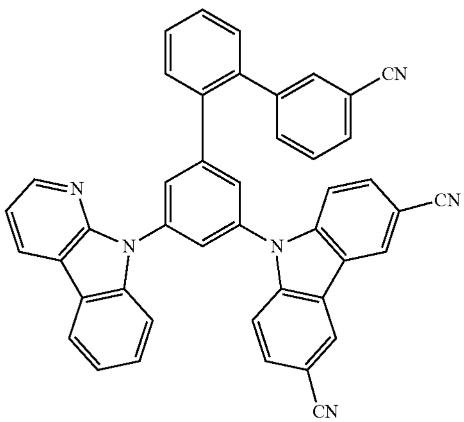
54
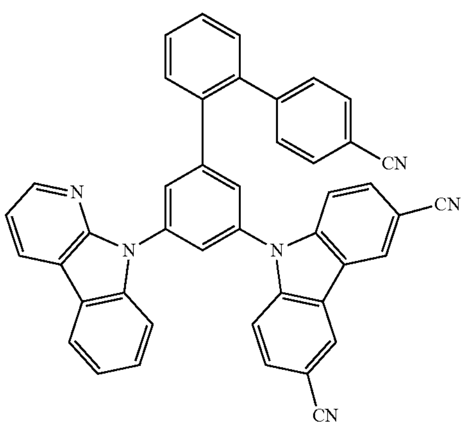
55
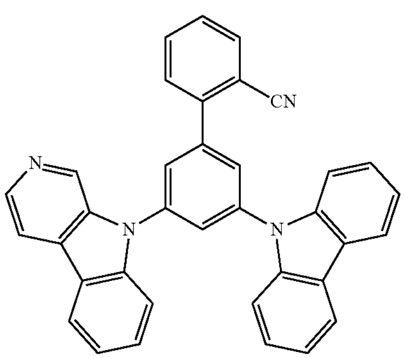
-continued
56
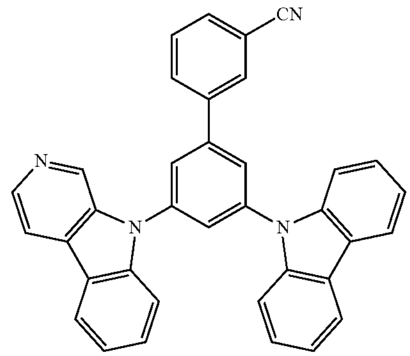
57
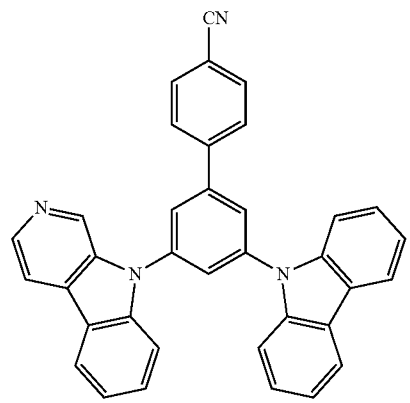
58
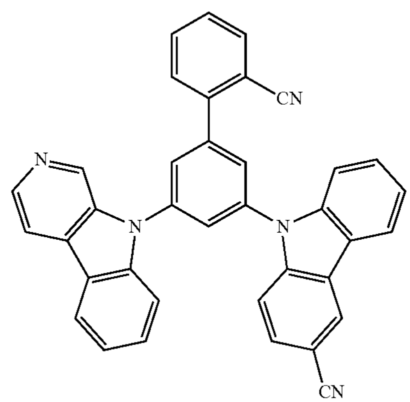
59
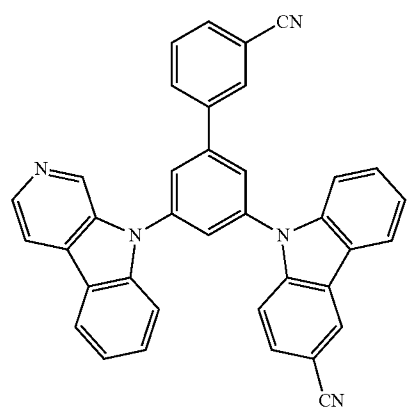

-continued
60
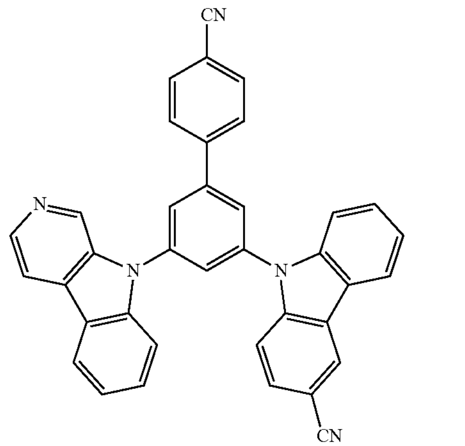
61
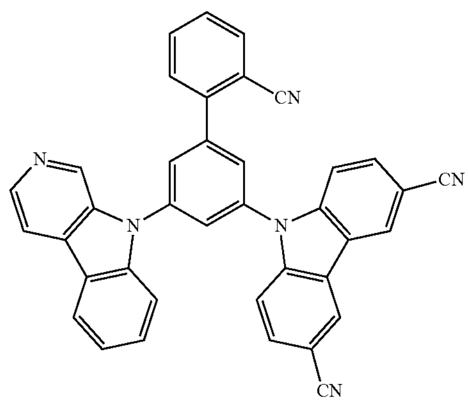
62
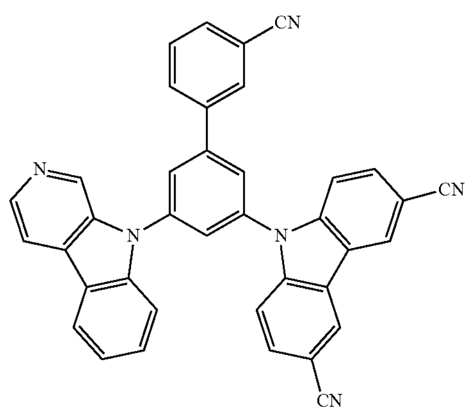
-continued
63
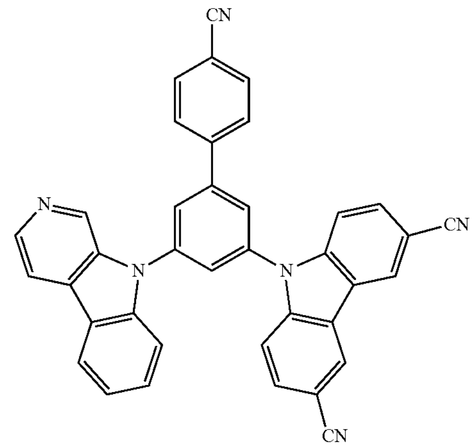
64
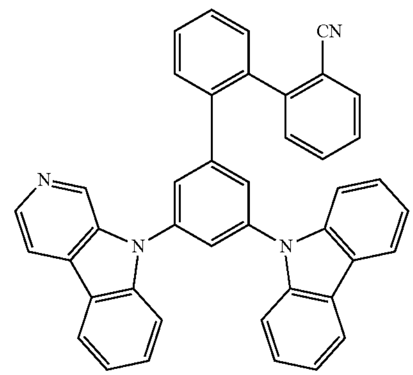
65
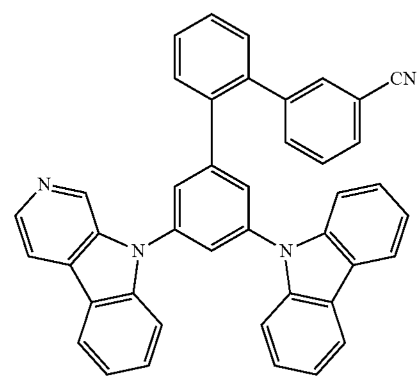
66
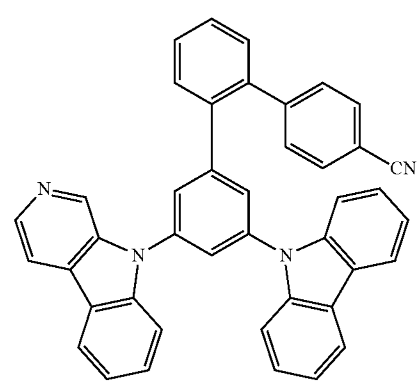

-continued
67
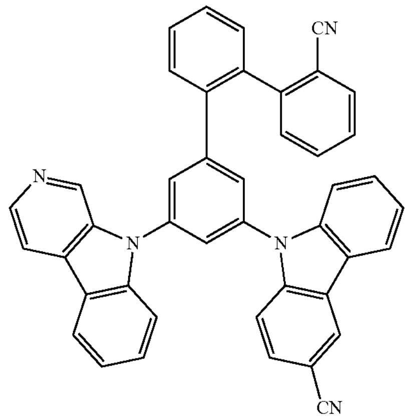
68
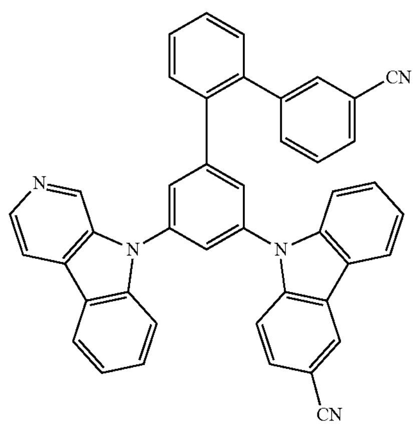
69
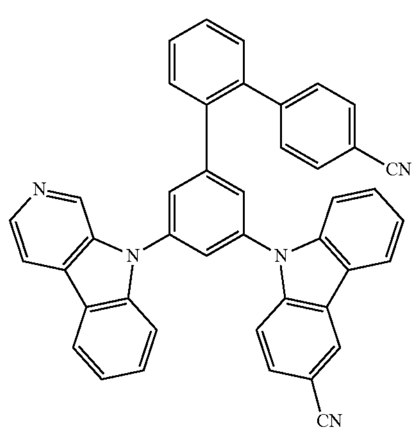
-continued
70
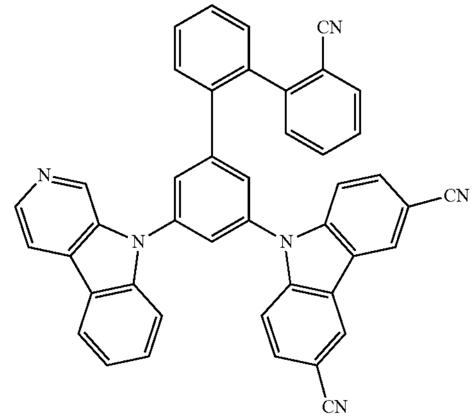
71
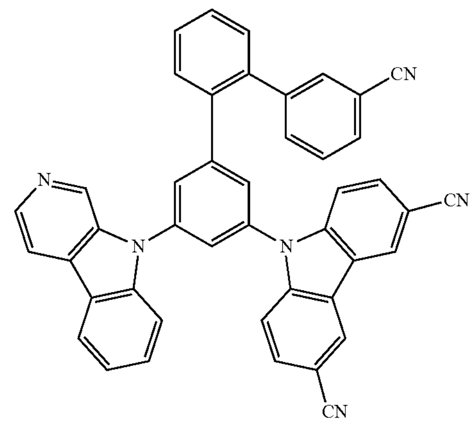
72
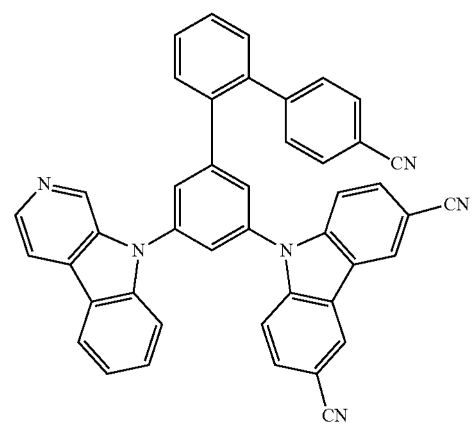
73
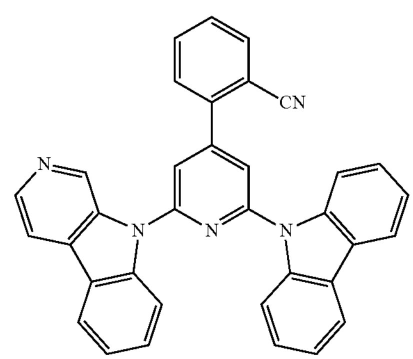

-continued
74
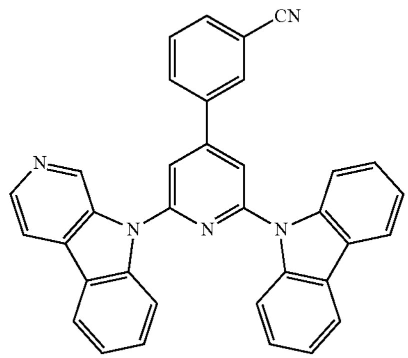
75
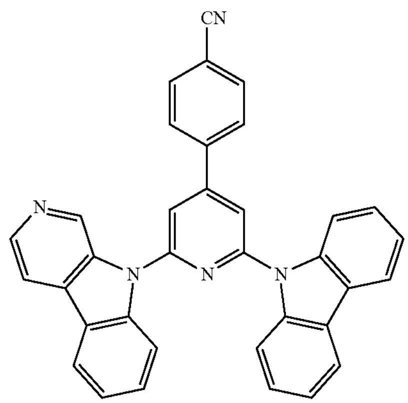
76
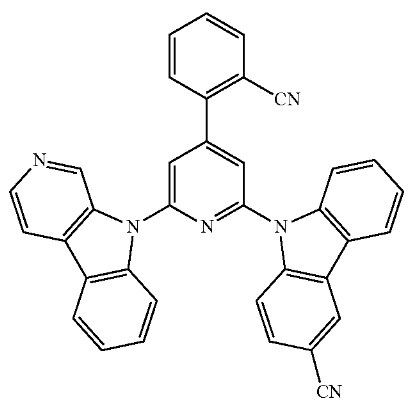
77
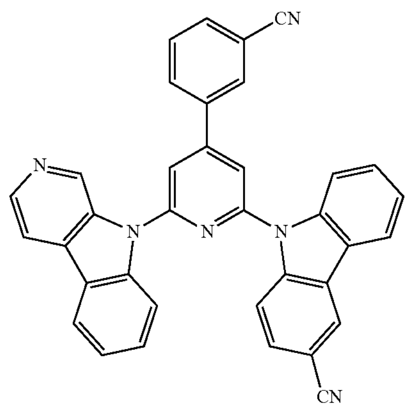
-continued
78
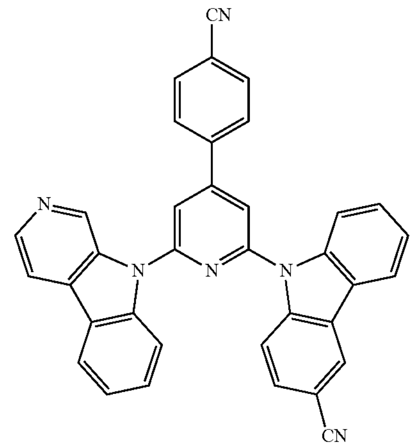
79
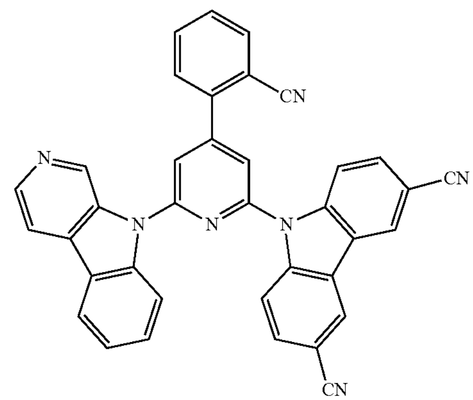
80
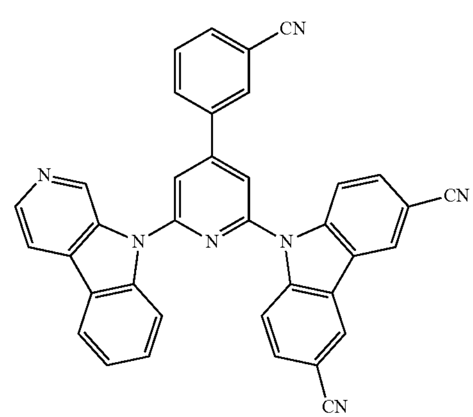

61
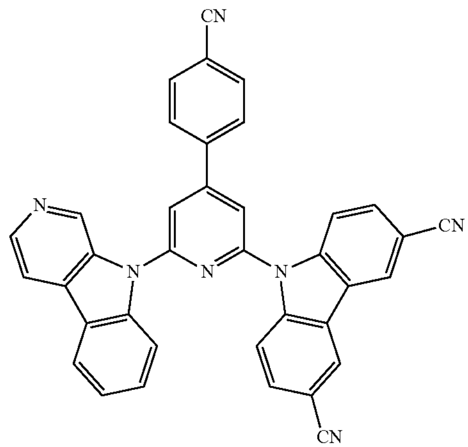
82
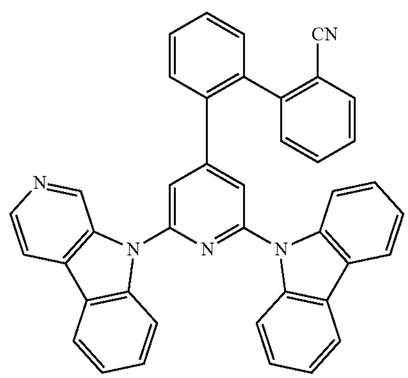
83
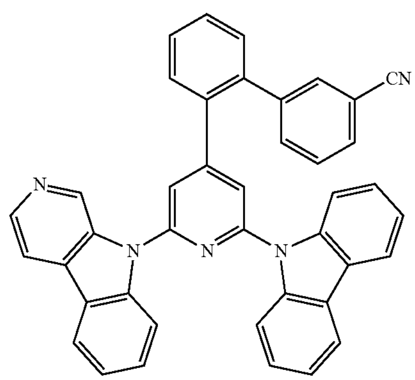
84
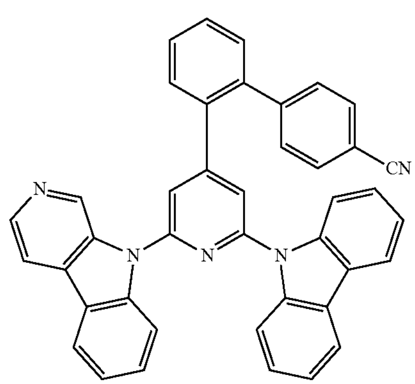
85
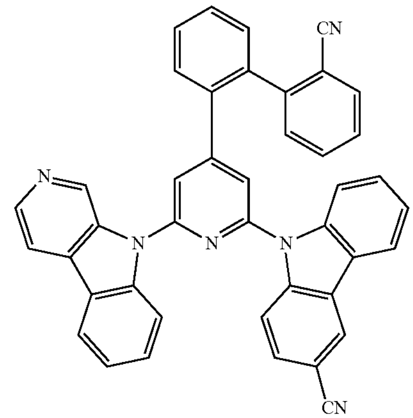
86
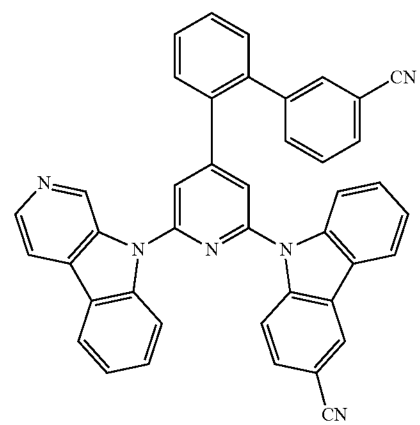
87
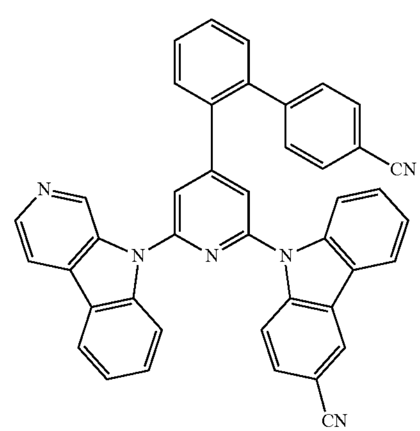

-continued
88
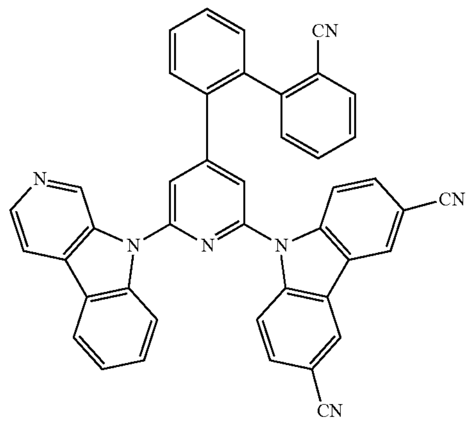
89
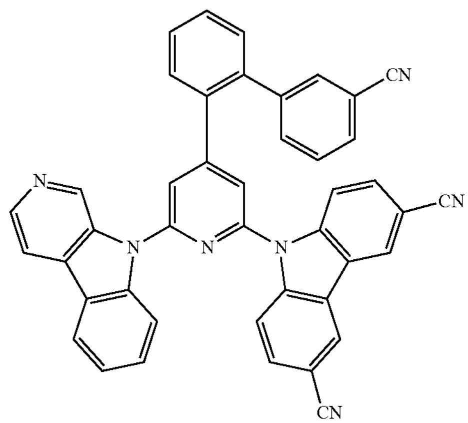
90
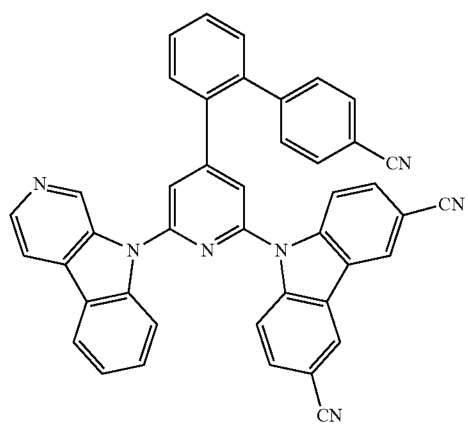
91
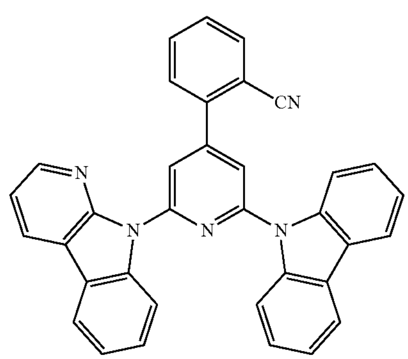
-continued
92
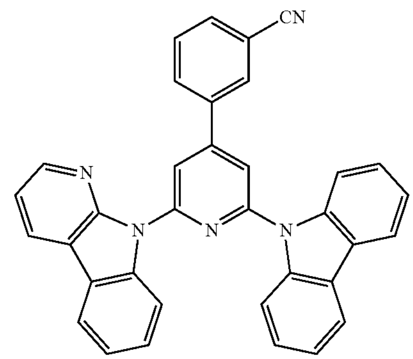
93
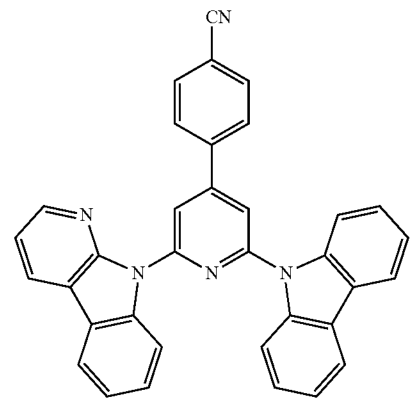
94
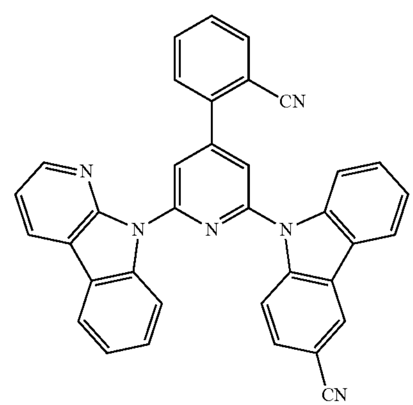
95
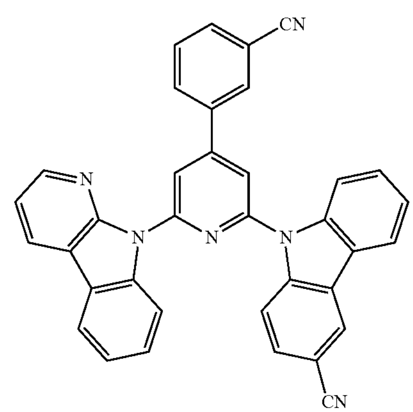

-continued
96
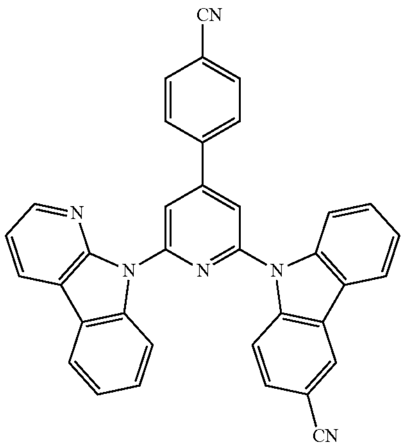
97
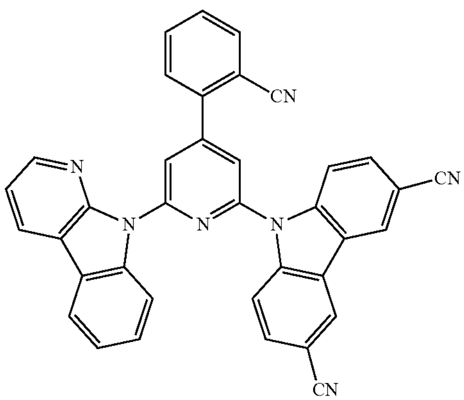
98
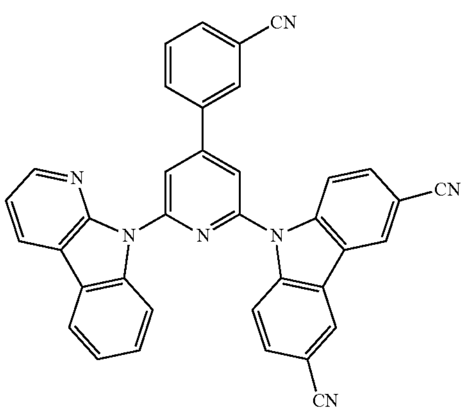
-continued
99
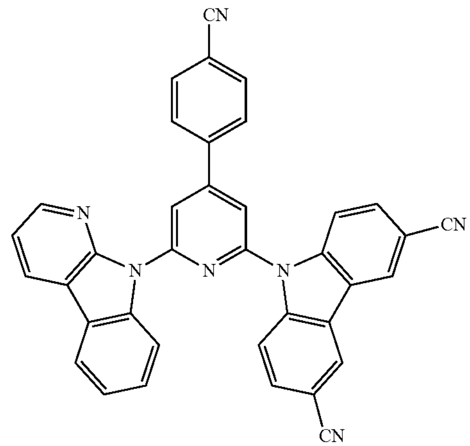
100
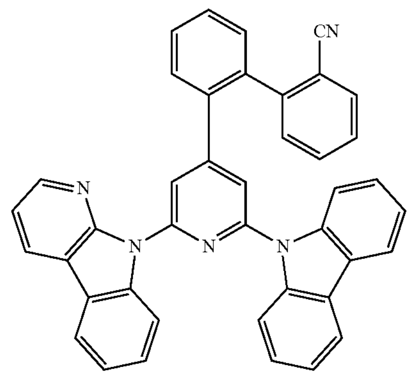
101
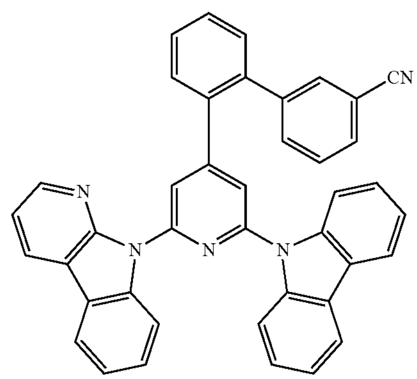
102
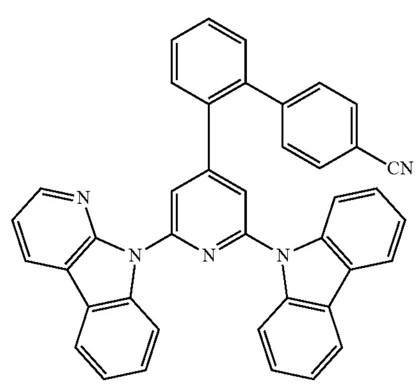

-continued
103
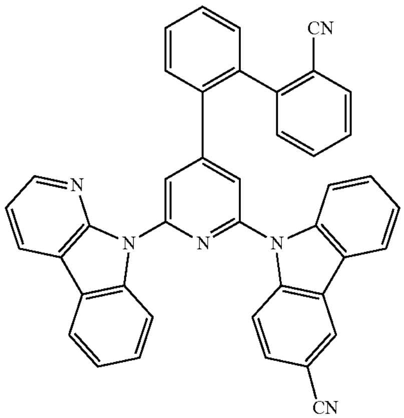
104
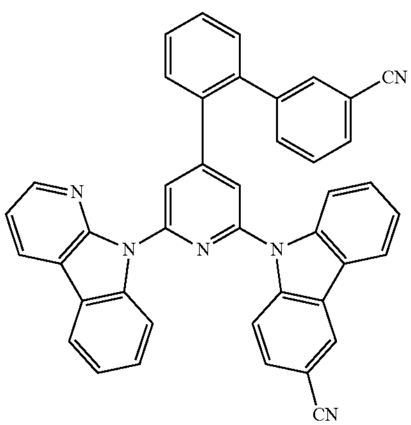
105
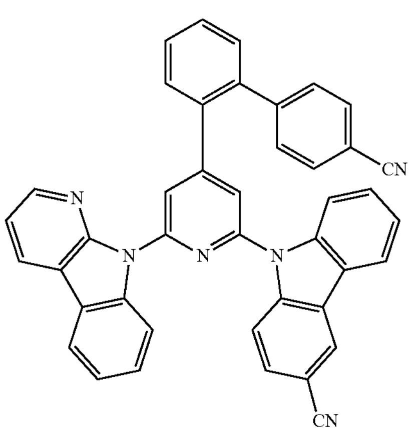
-continued
106
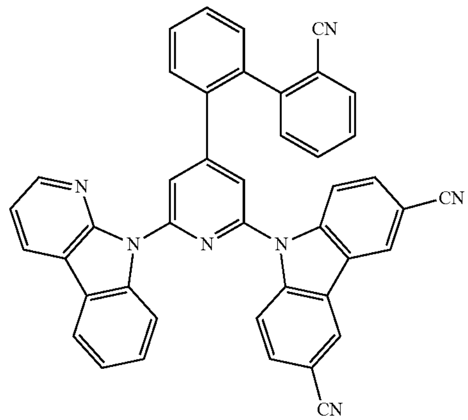
107
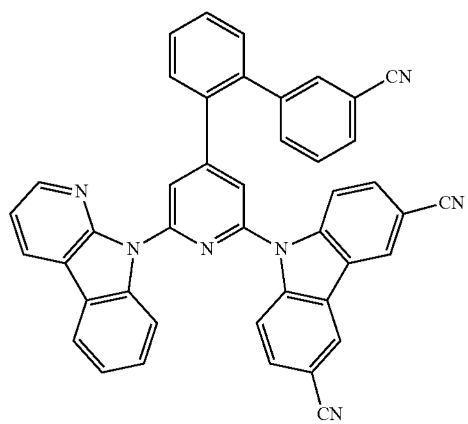
108
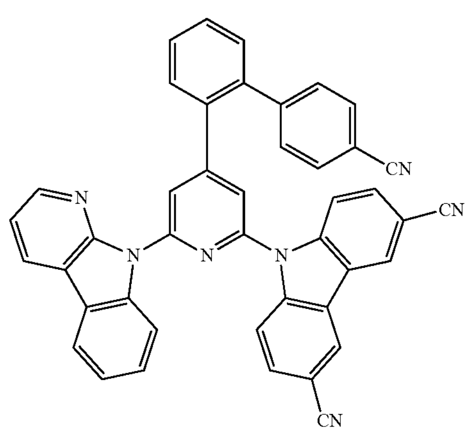

-continued
109
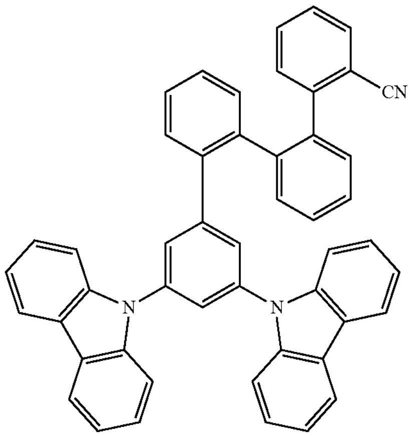
110
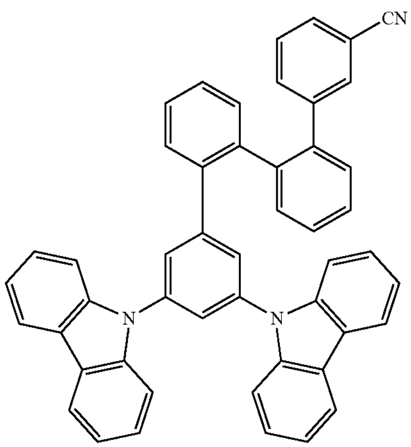
111
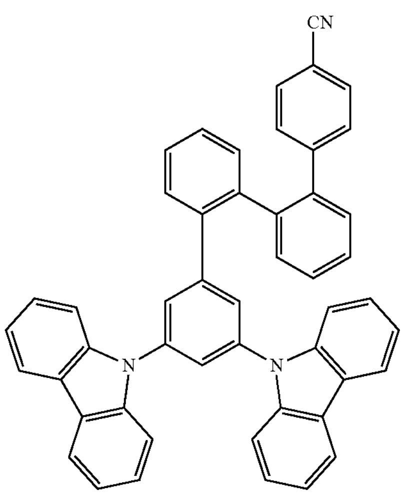
-continued
112
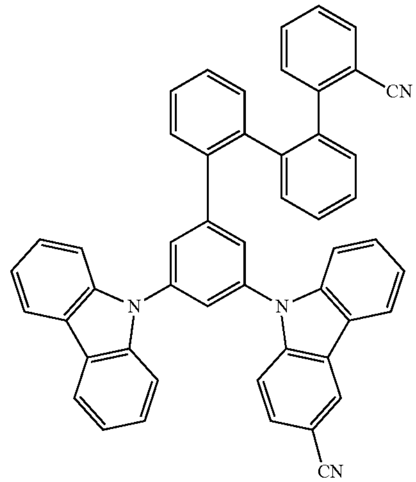
113
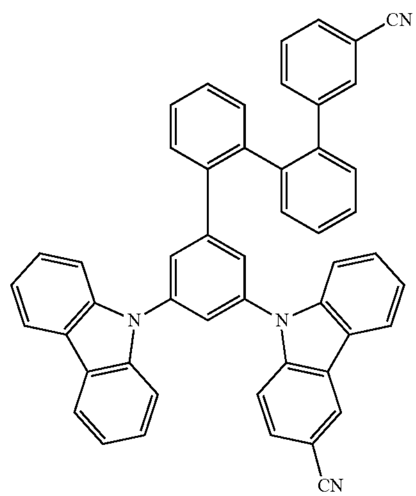
114
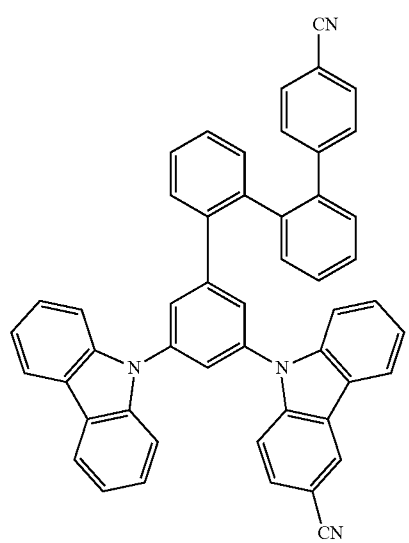

-continued
115
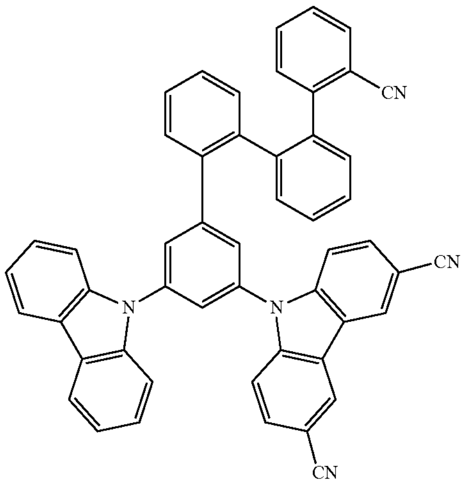
116
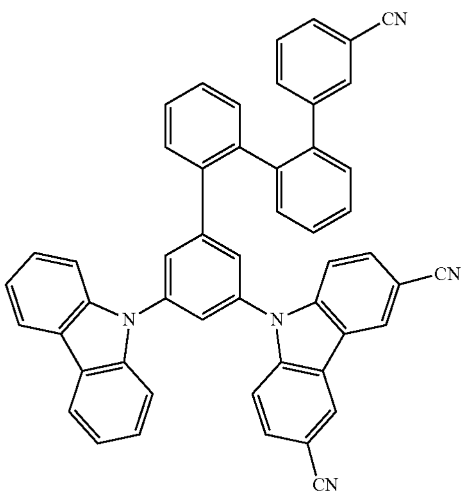
117
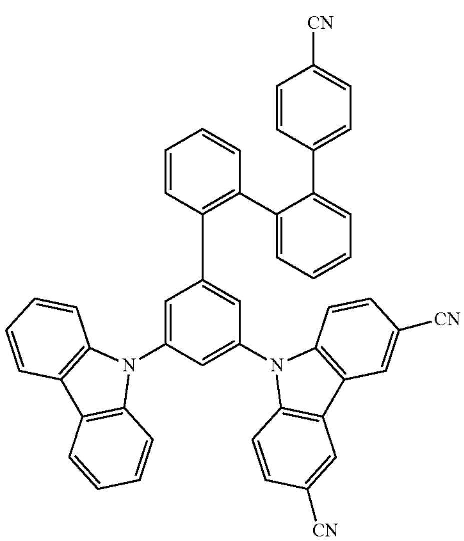
-continued
118
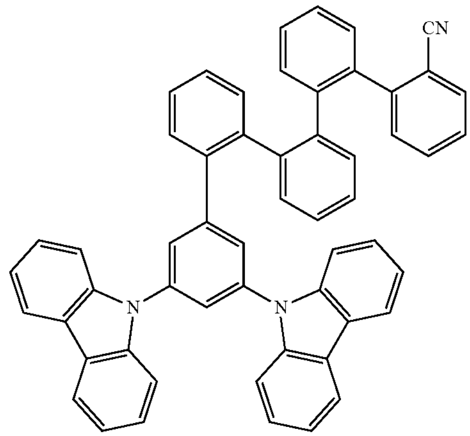
119
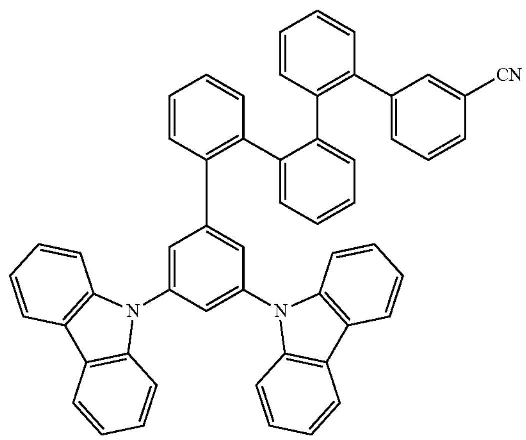
120
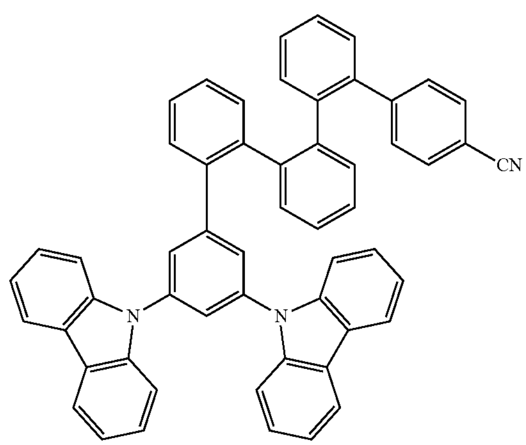

-continued
121
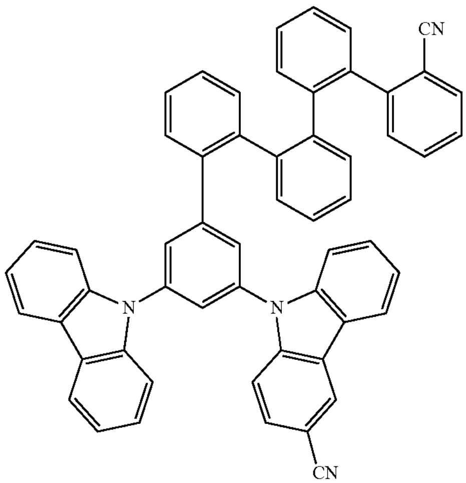
122
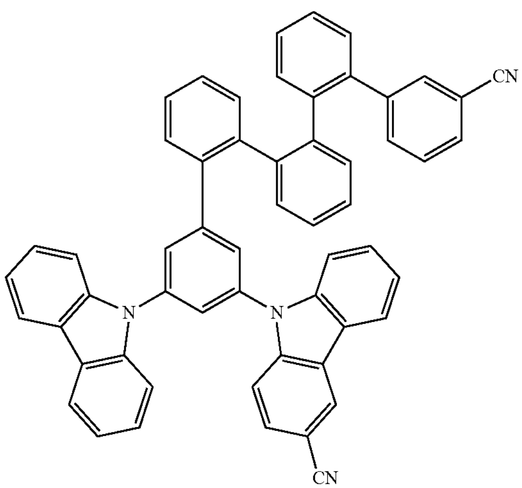
123
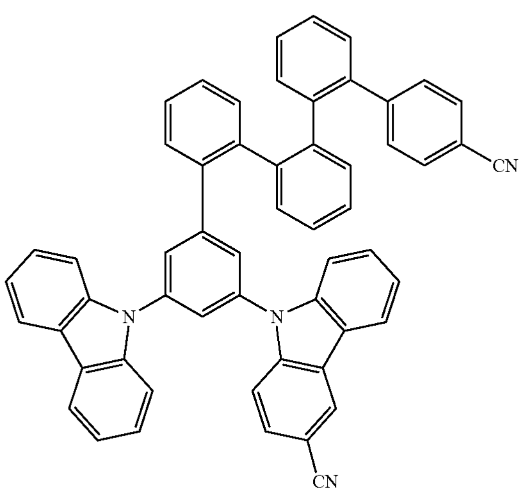
-continued
124
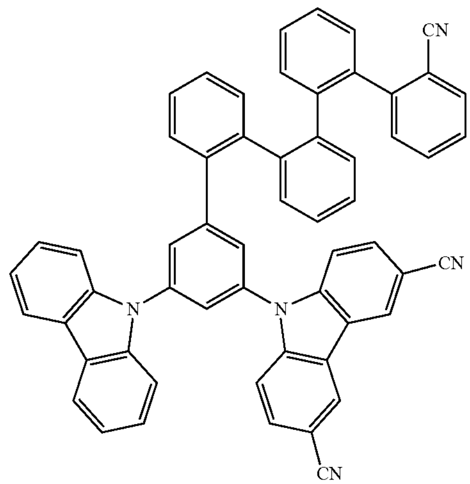
125
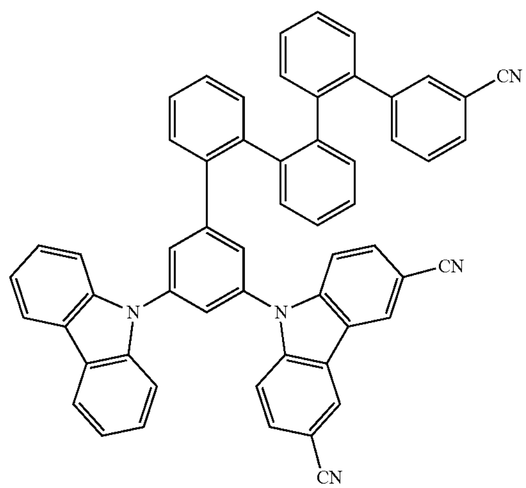
126
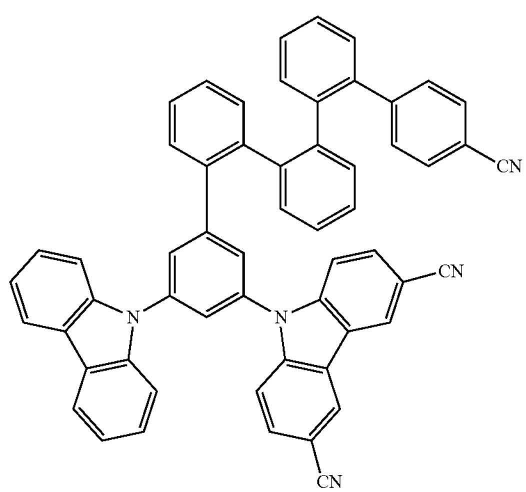

-continued
127
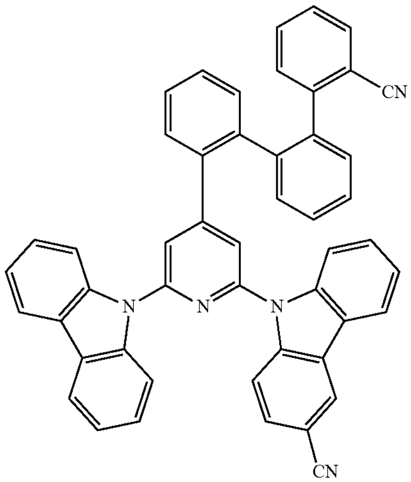
128
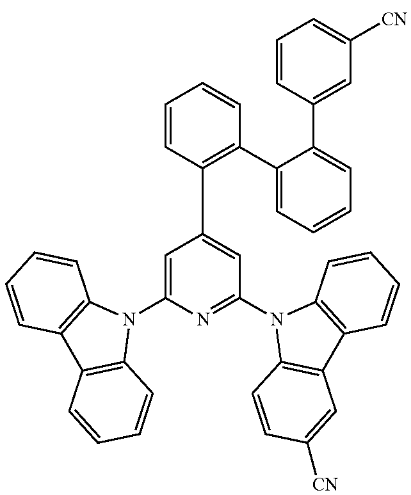
129
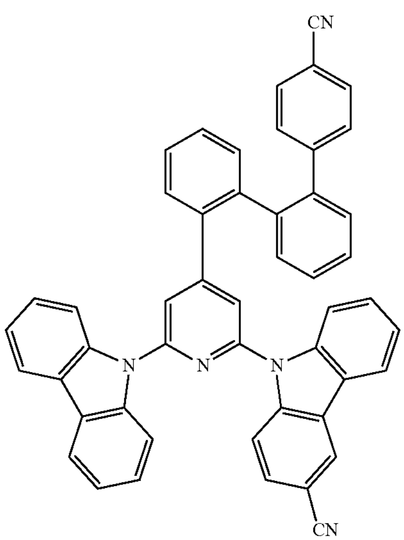
-continued
130
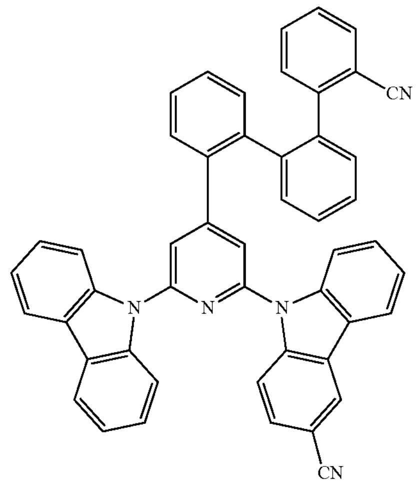
131
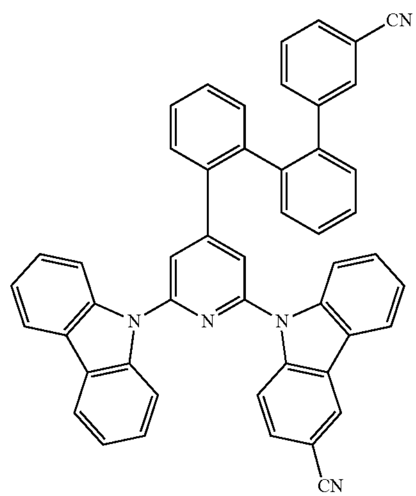
132
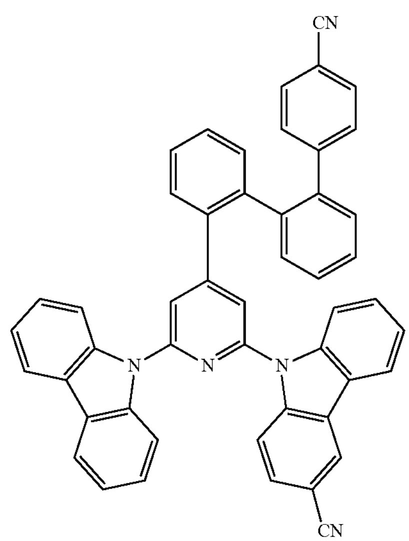

-continued
133
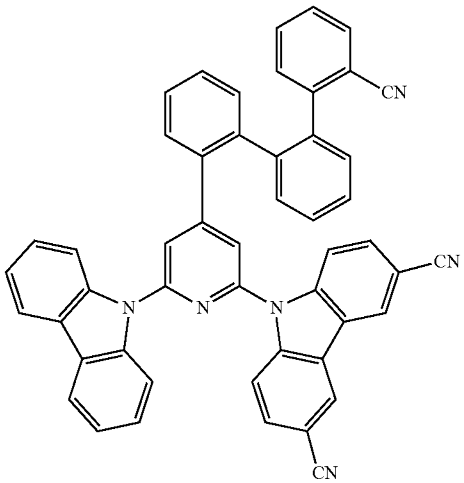
134
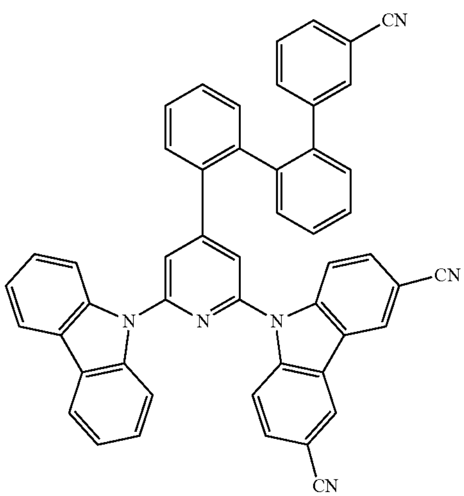
135
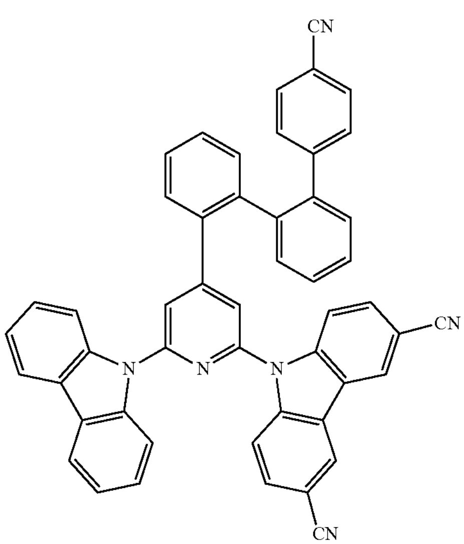
-continued
136
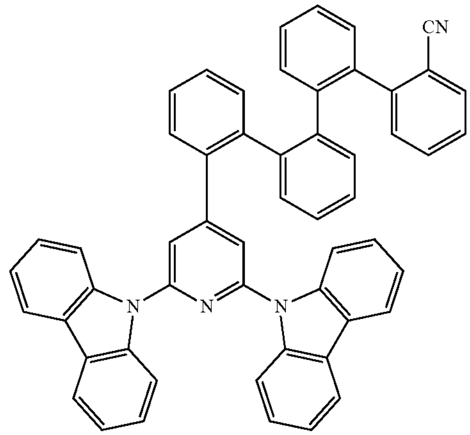
137
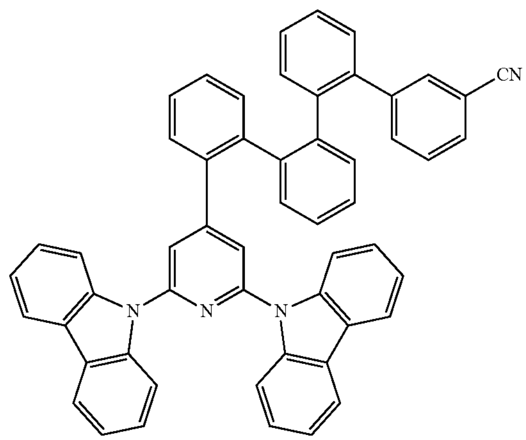
138
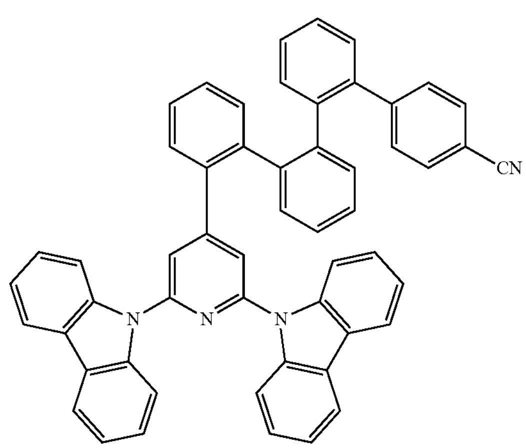

139
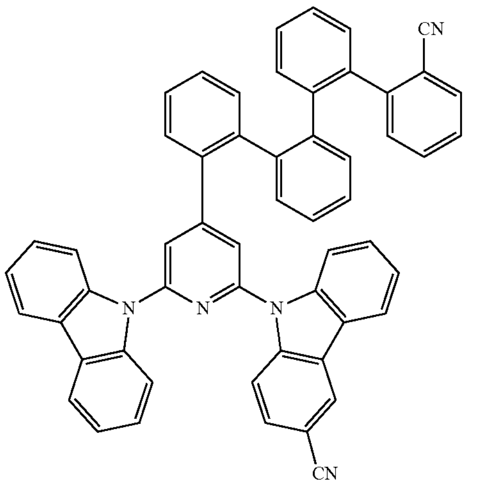
140
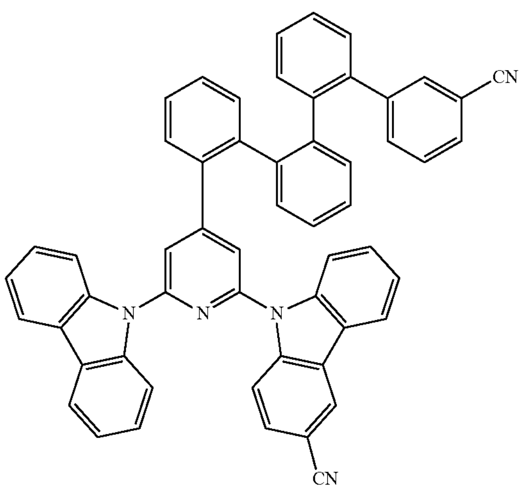
141
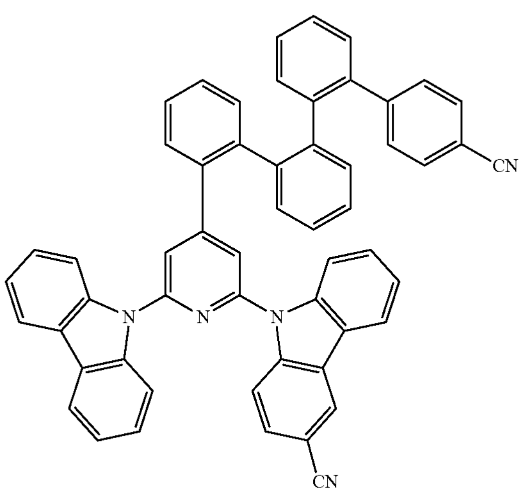
142
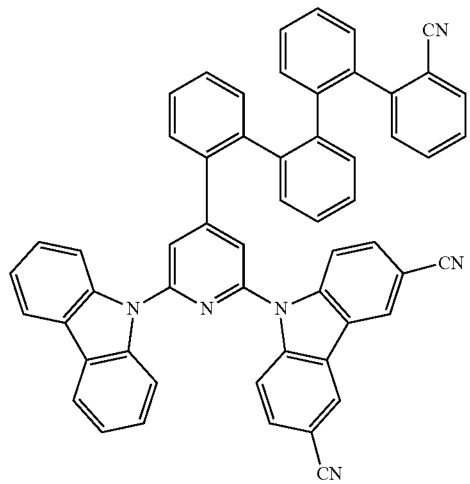
143
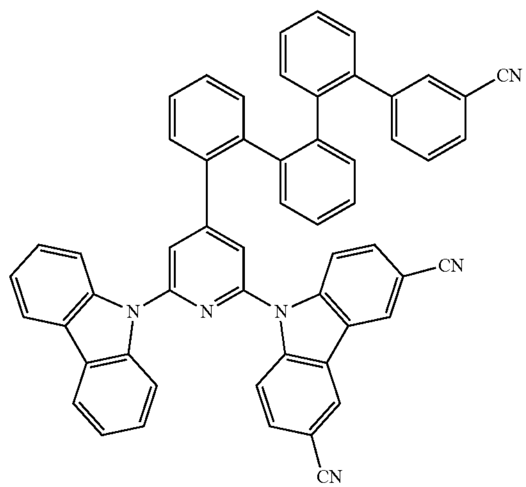
144
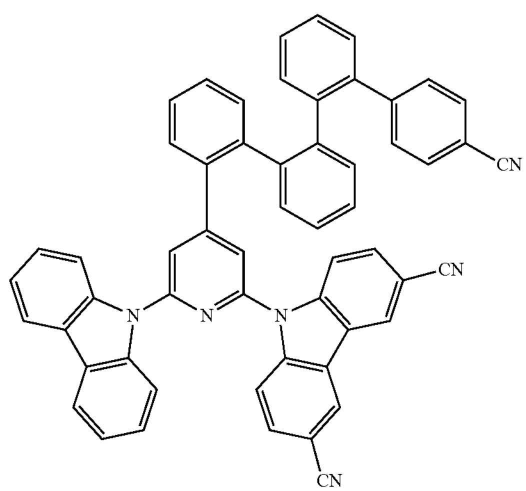

145
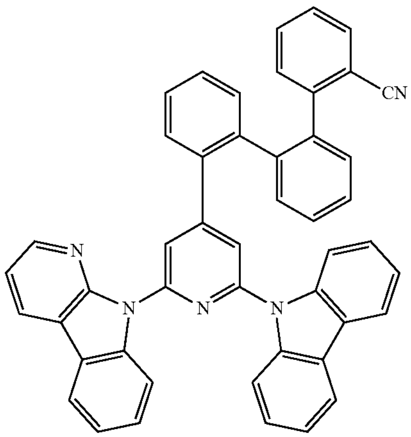
146
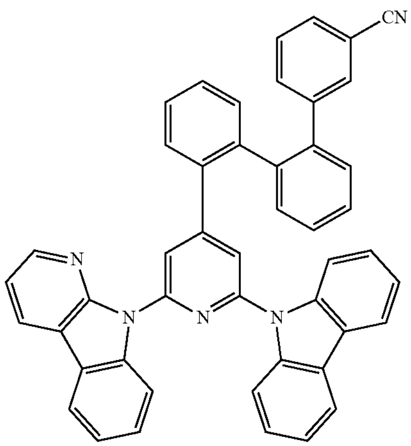
147
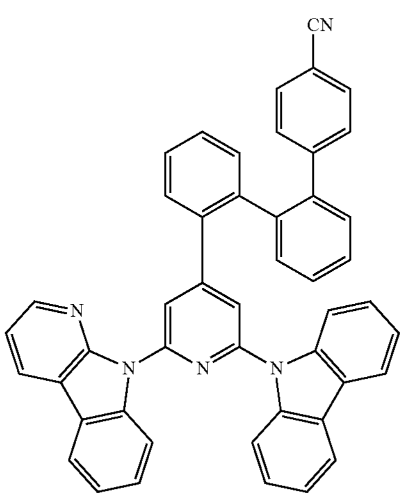
148
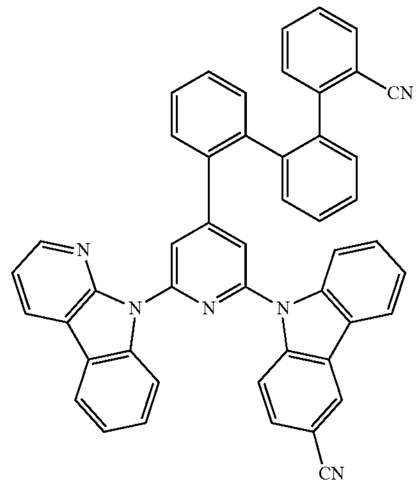
149
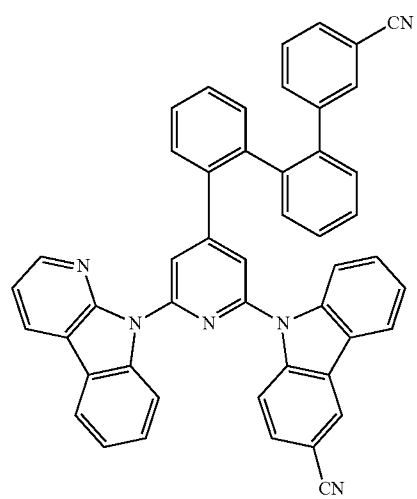
150
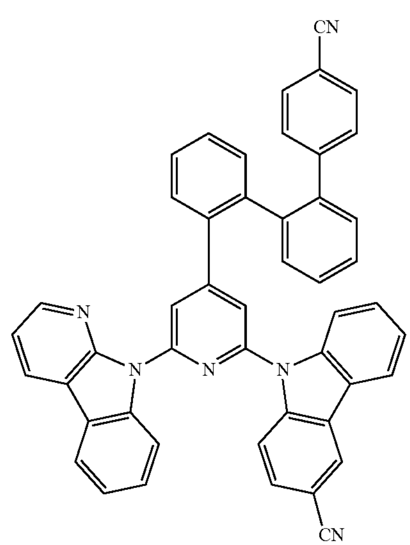

151
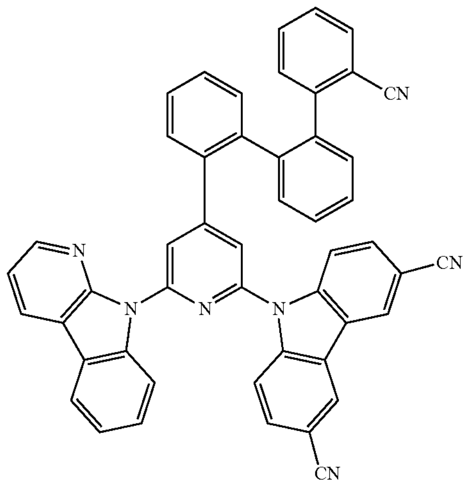
152
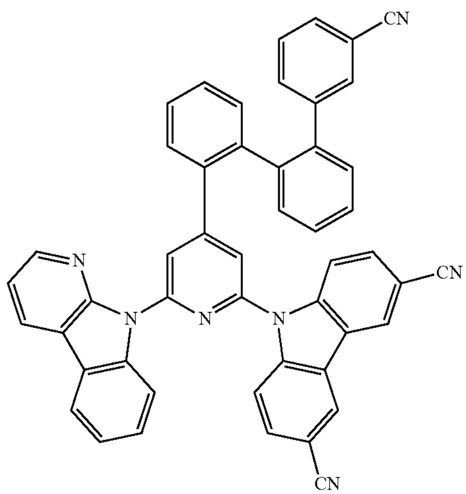
153
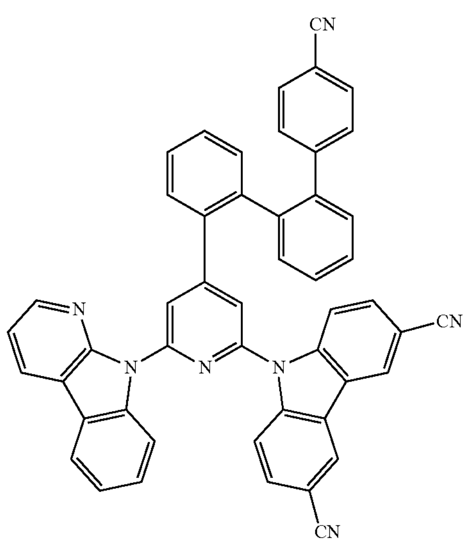
154
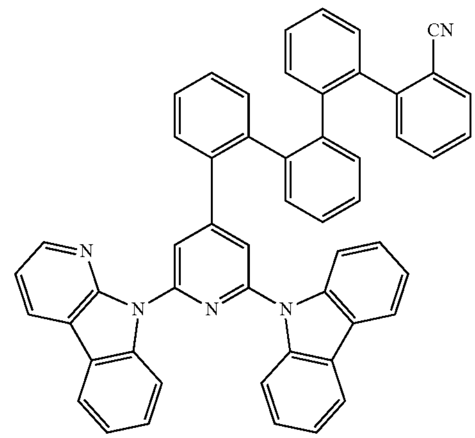
155
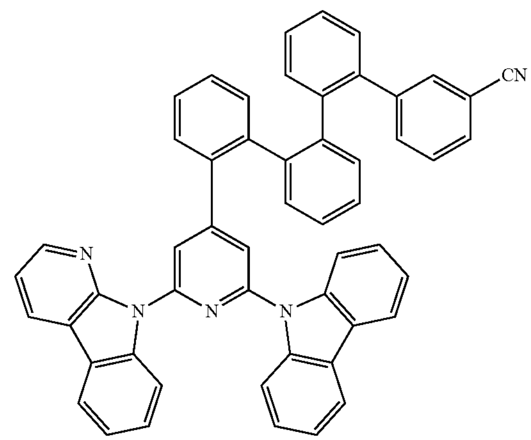
156
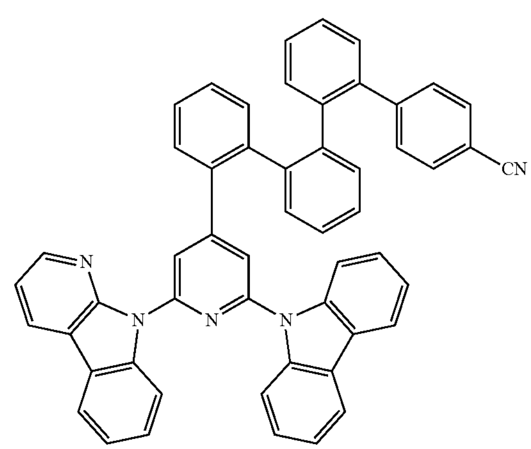

-continued
157
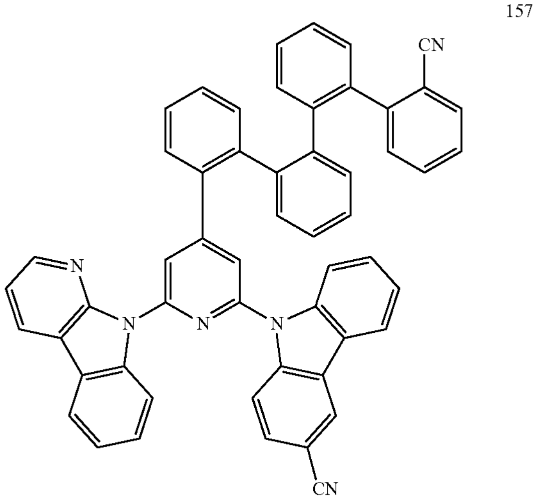
158
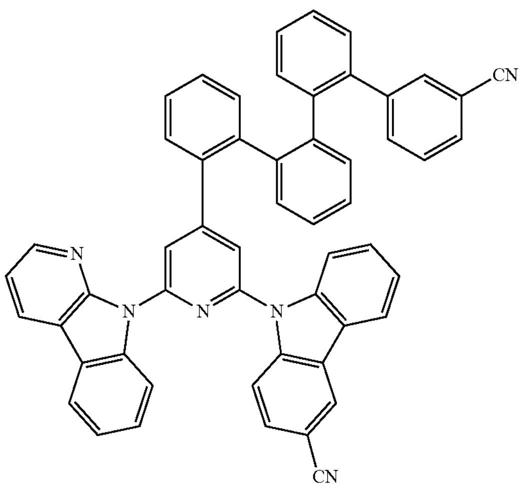
159
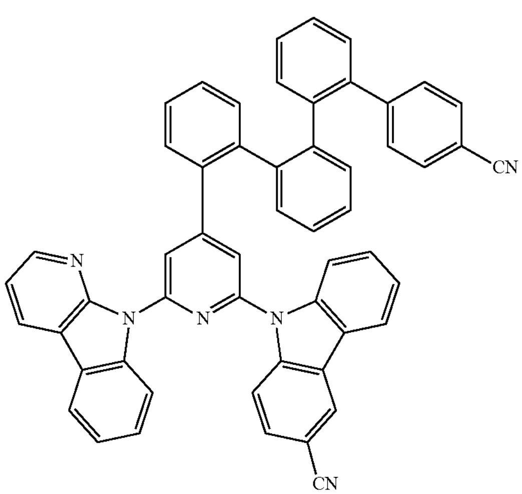
-continued
160
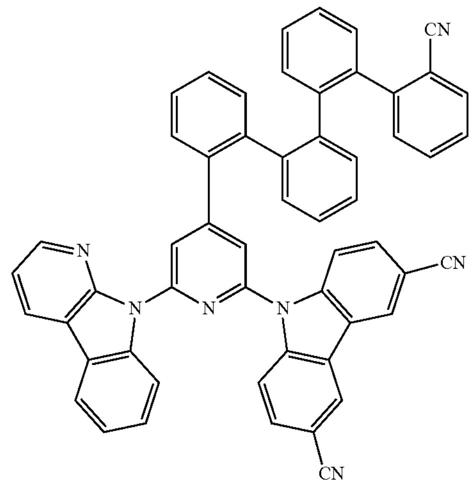
161
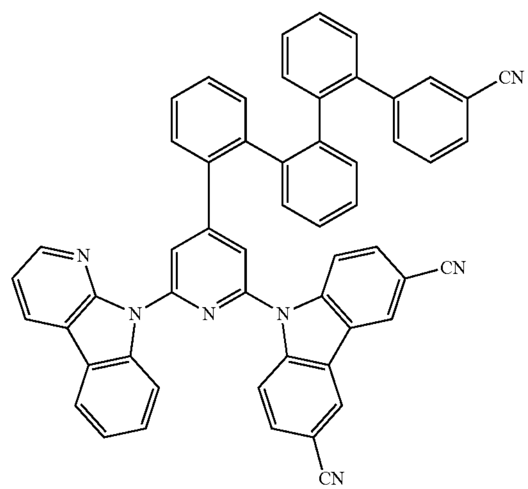
162
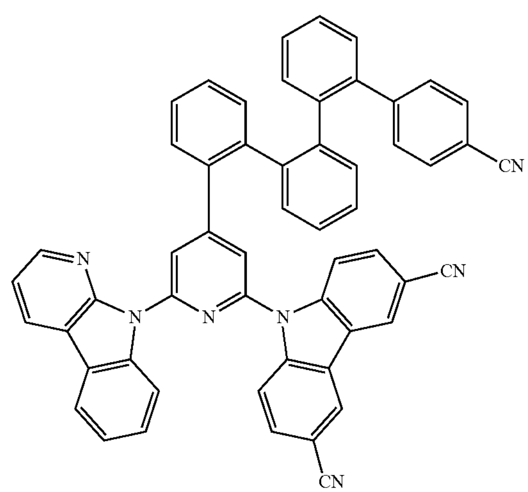

163
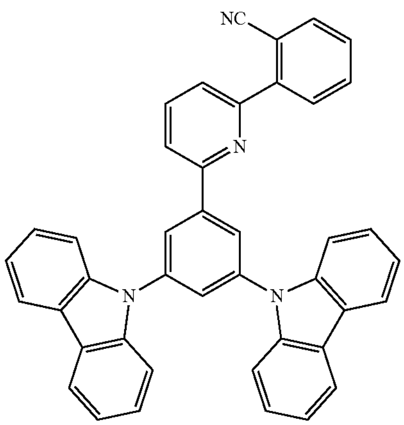
164
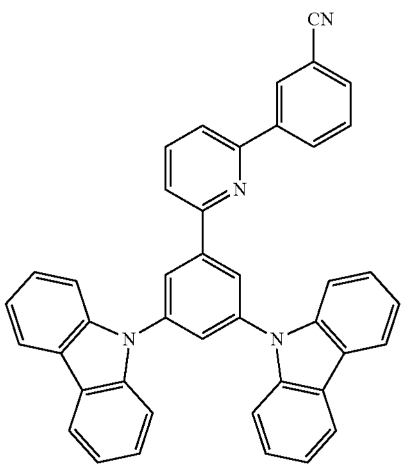
165
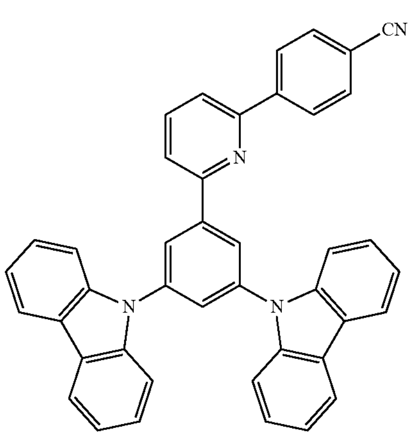
166
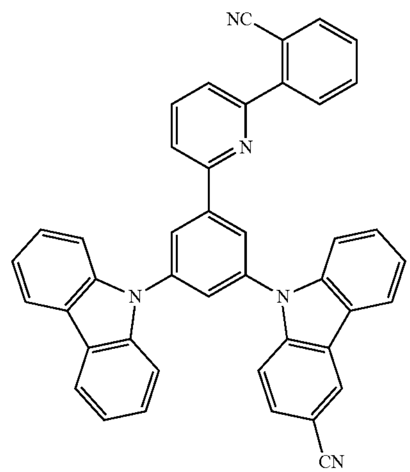
167
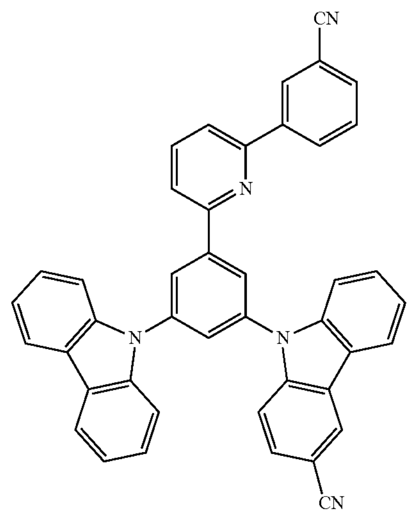
168
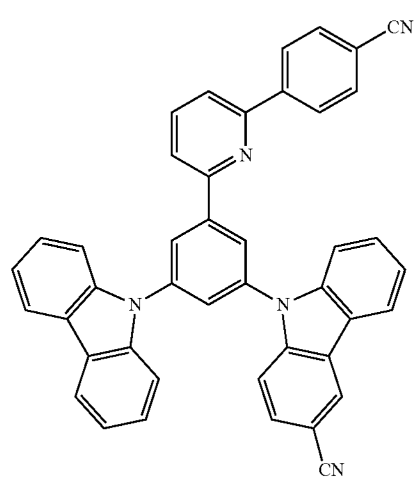

-continued
169
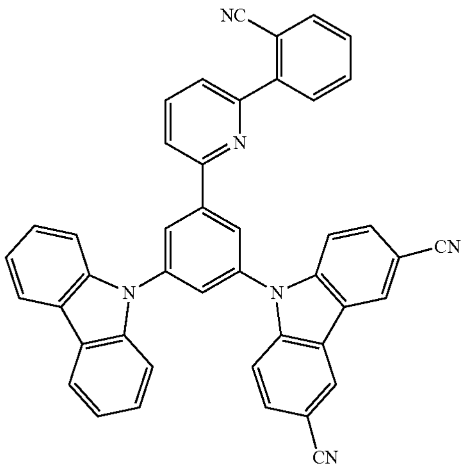
170
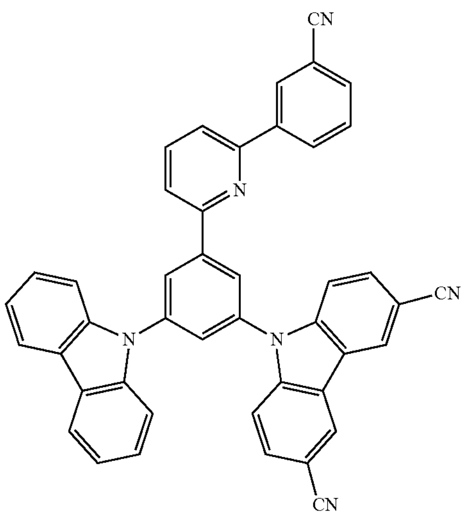
171
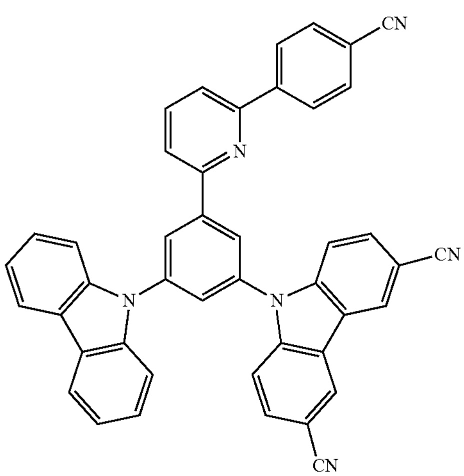
-continued
172
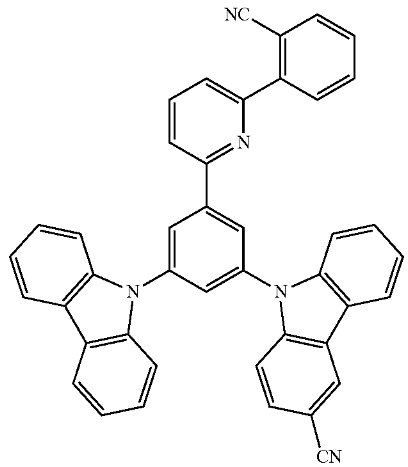
173
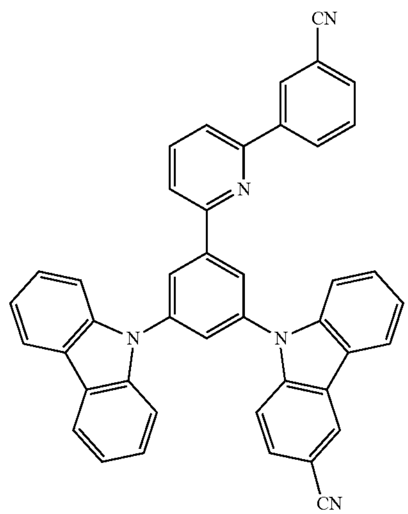
174
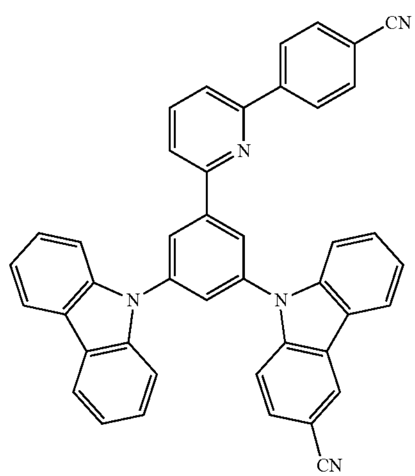

175
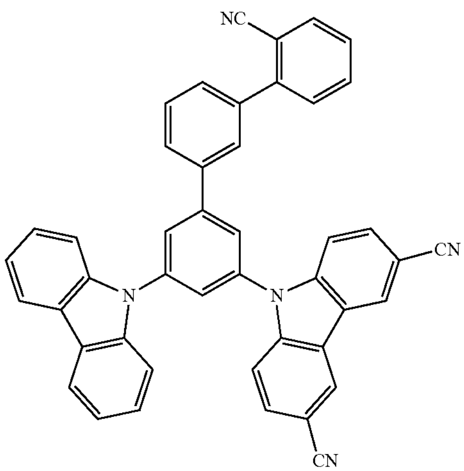
176
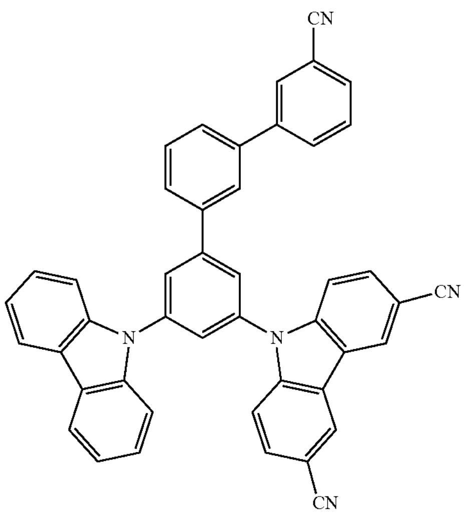
177
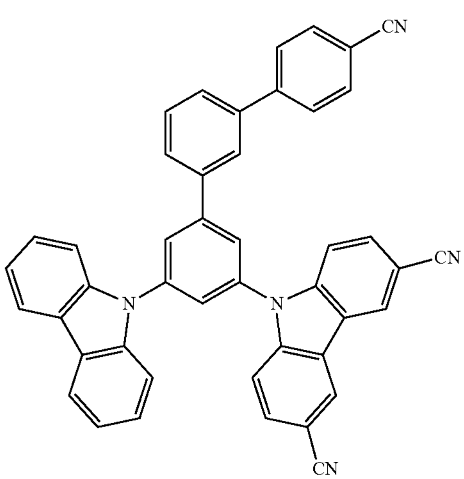
178
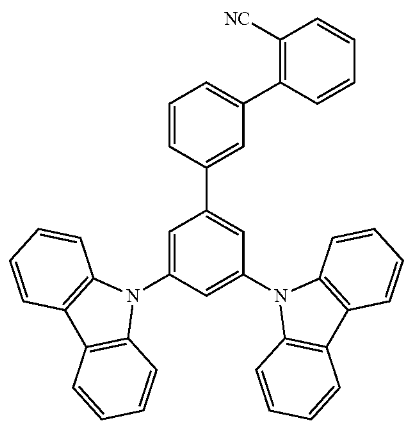
179
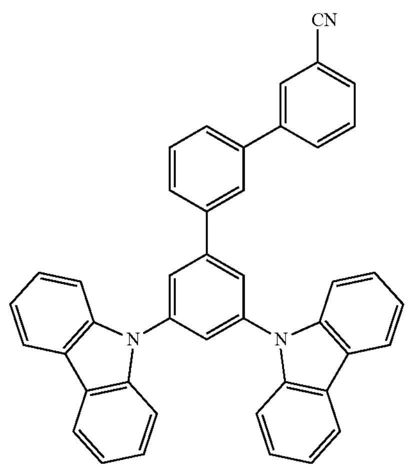
180
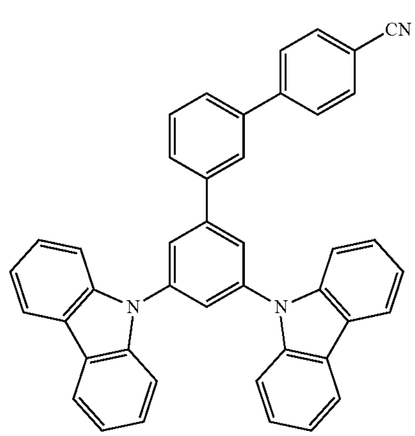

-continued
181
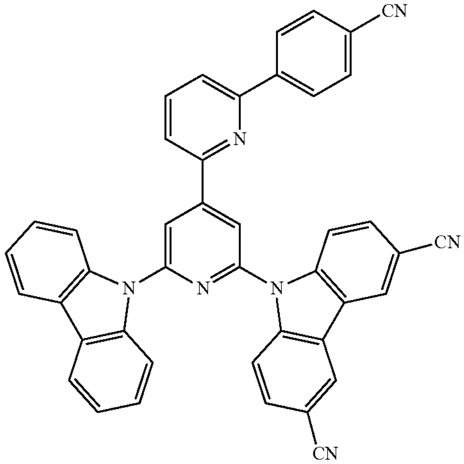
182
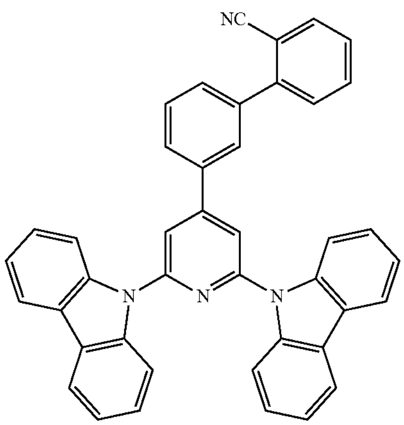
183
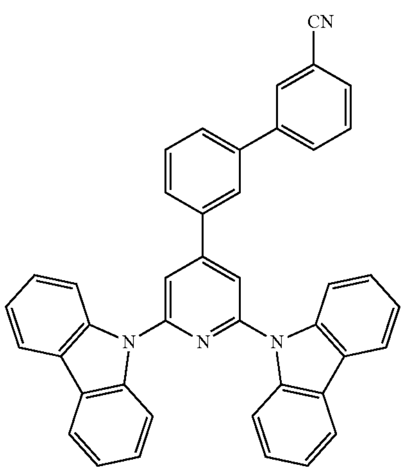
-continued
184
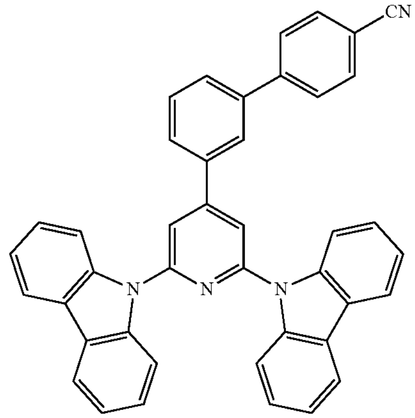
185
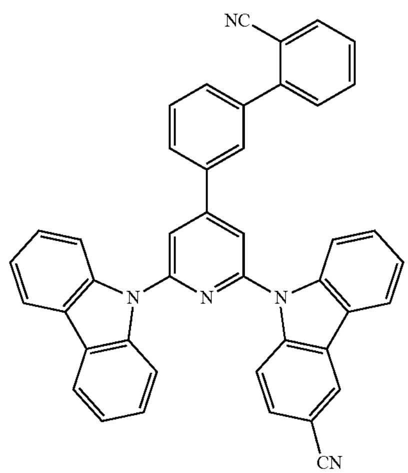
186
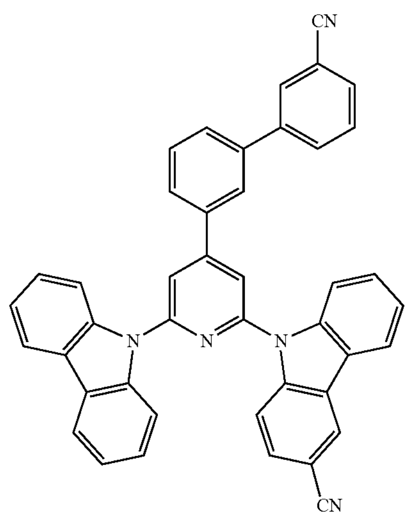

-continued
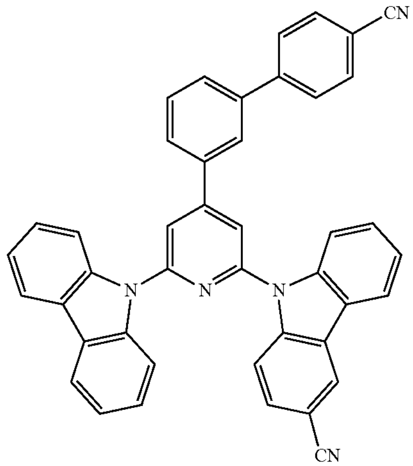
187
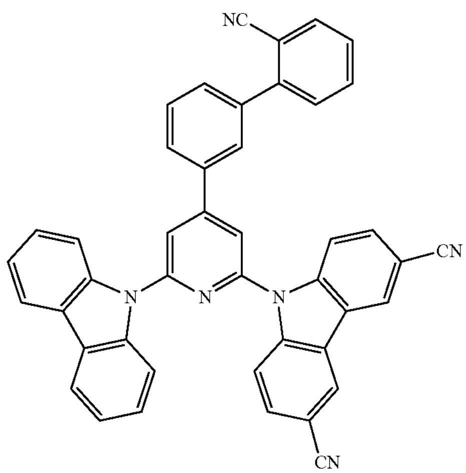
188
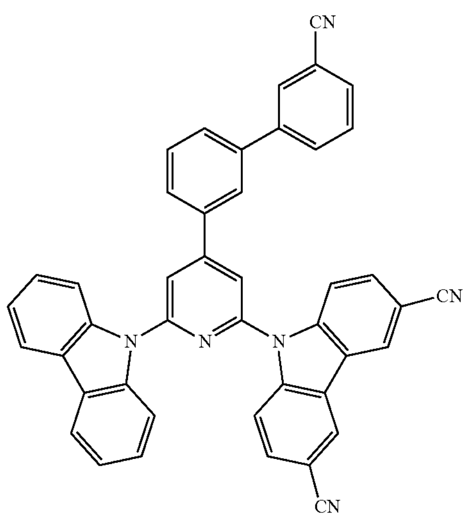
189
-continued
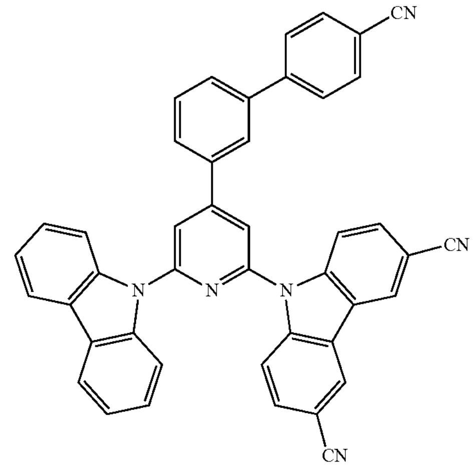
190
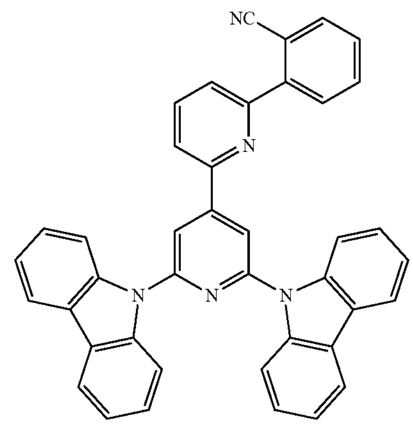
191
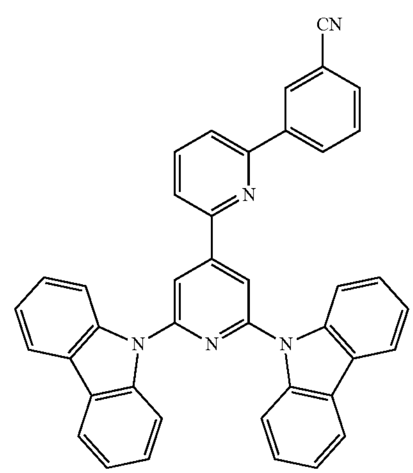
192

-continued
193
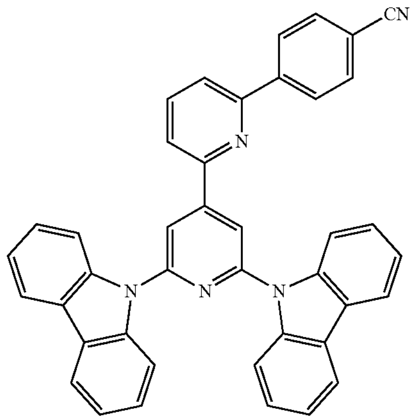
194
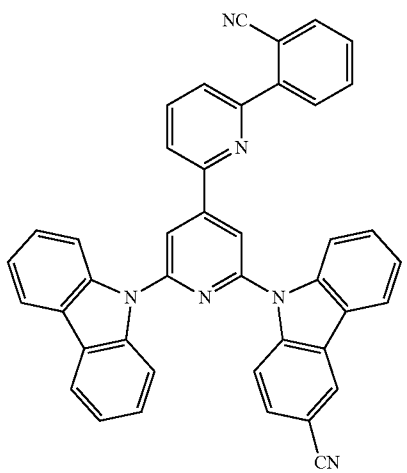
195
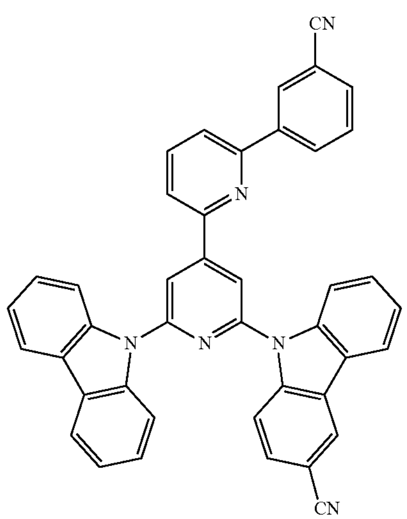
-continued
196
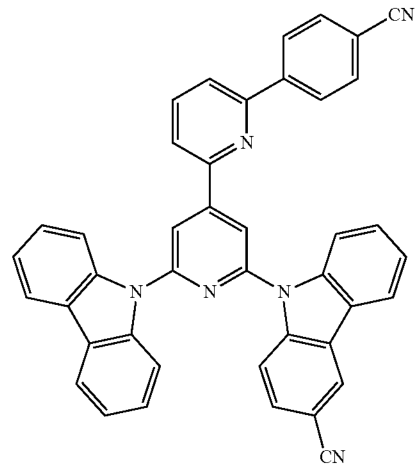
197
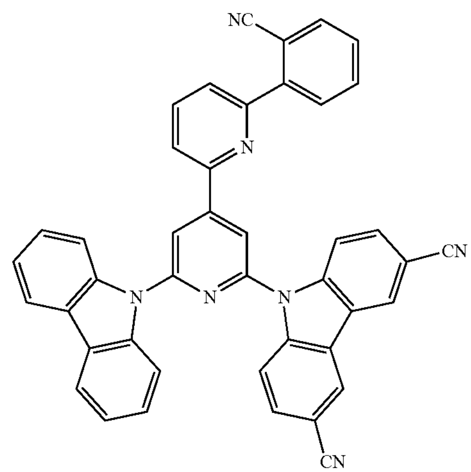
198
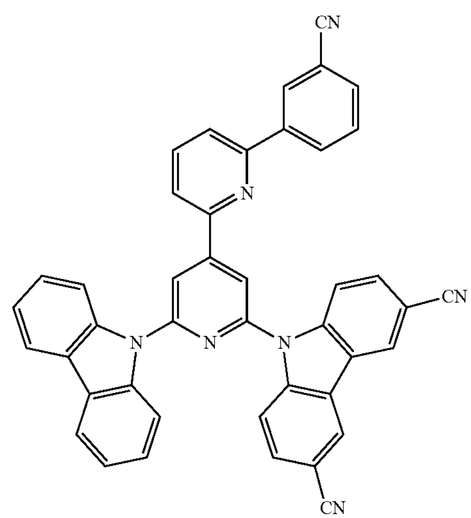

-continued
199
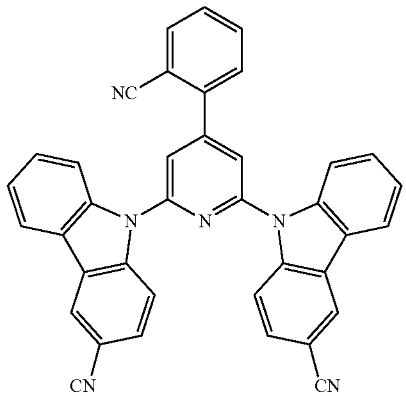
200
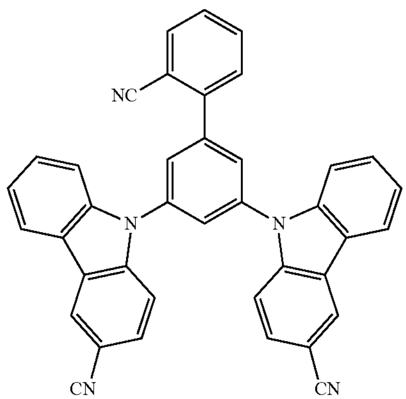
201
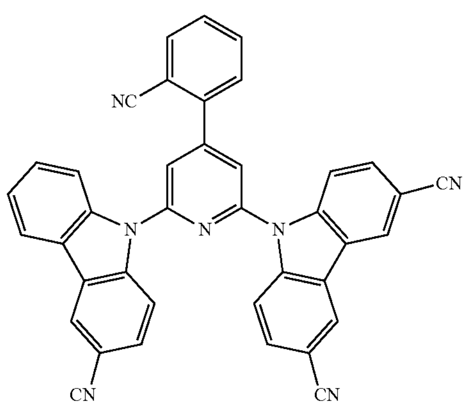
202
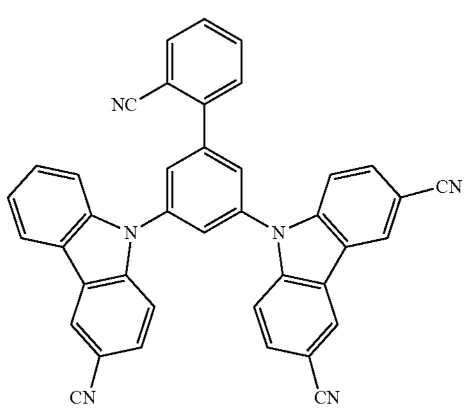
Group HE6
1
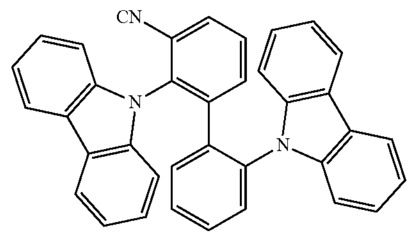
2
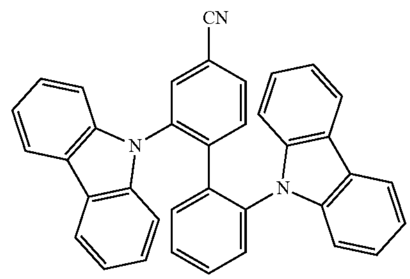
3
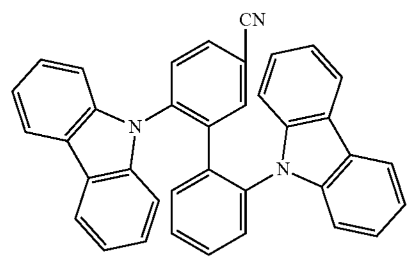
4
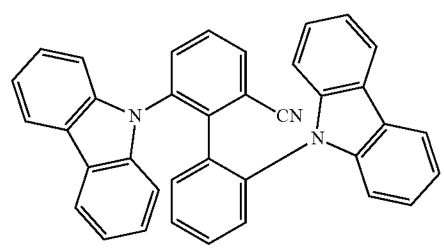
5
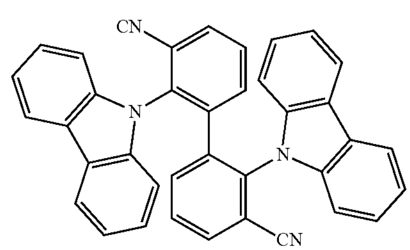
6
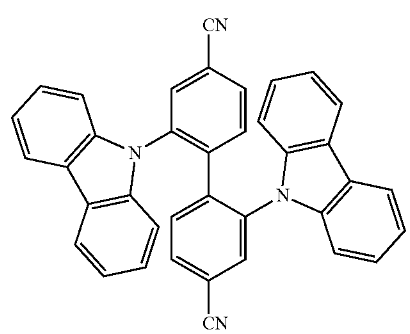

-continued
7
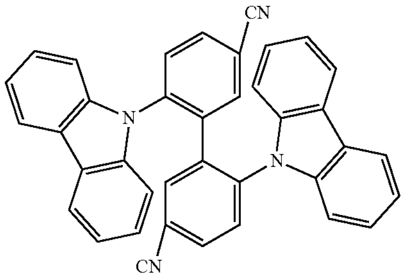
8
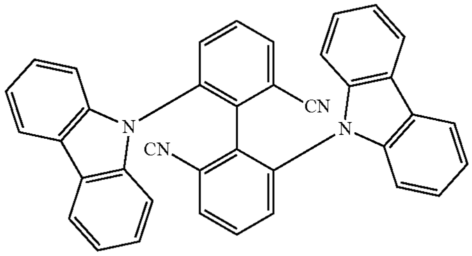
9
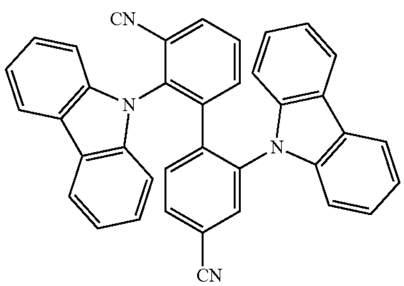
10
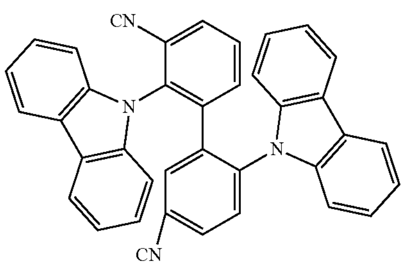
11
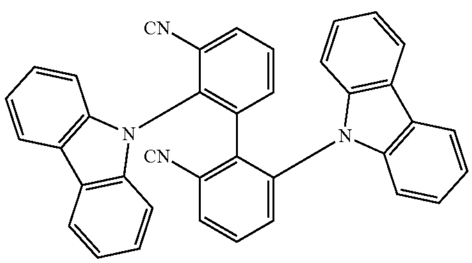
12
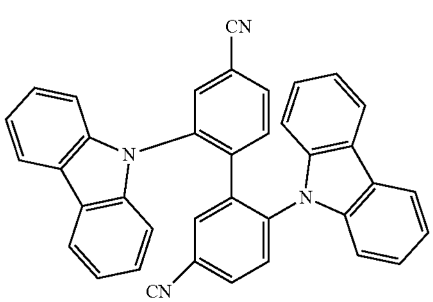
-continued
13
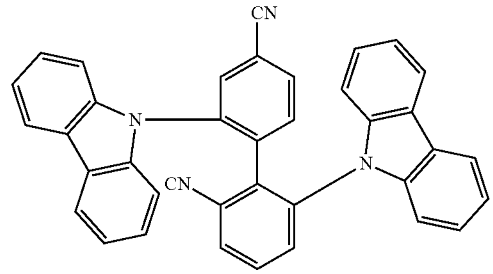
14
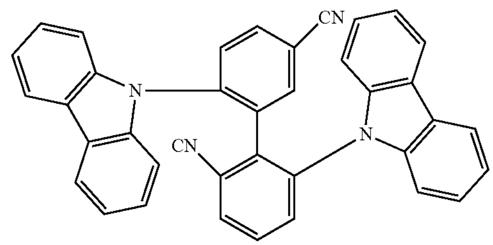
15
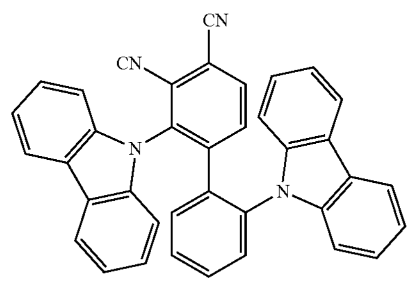
16
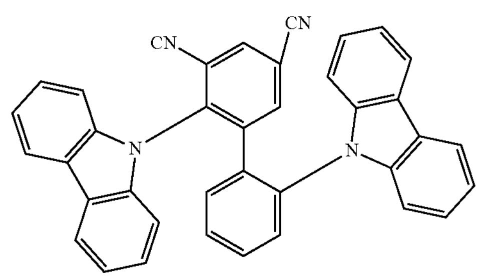
17
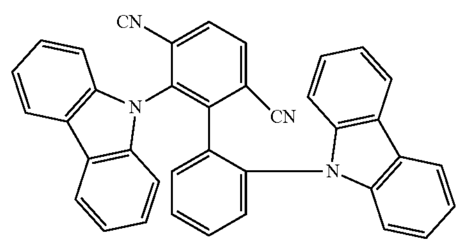
18
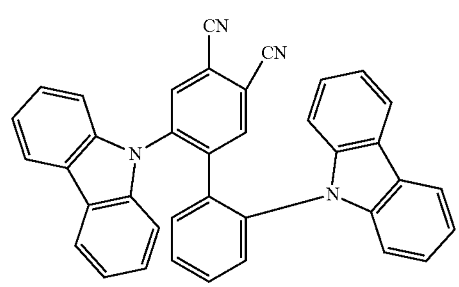

-continued
19
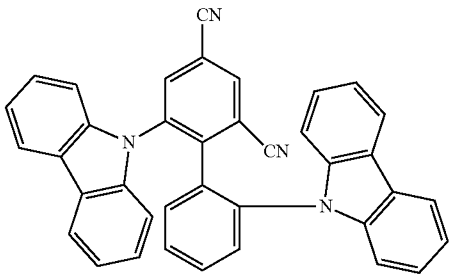
20
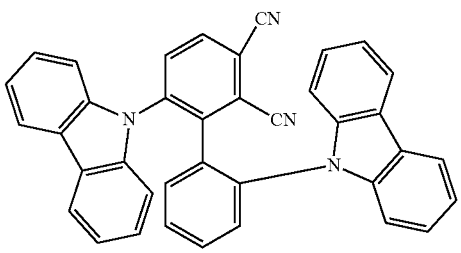
21
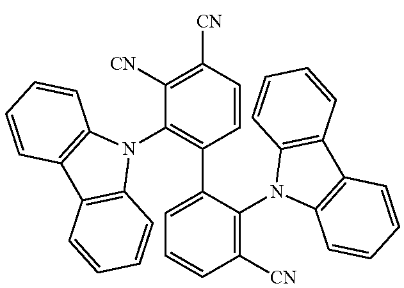
22
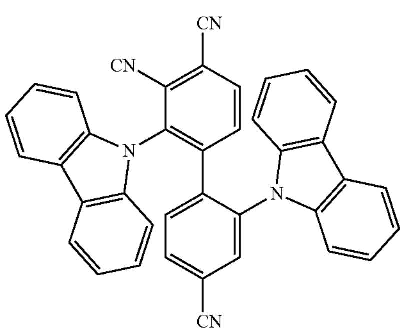
23
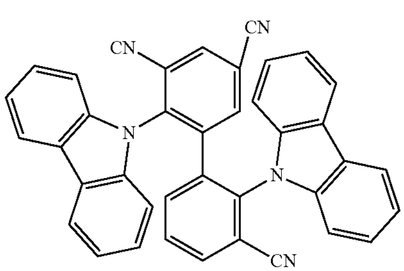
-continued
24
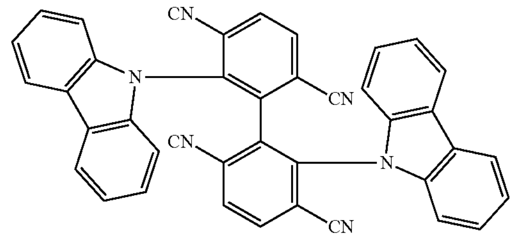
25
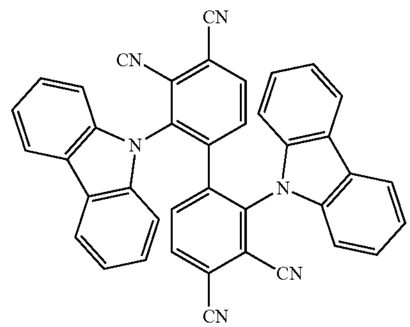
26
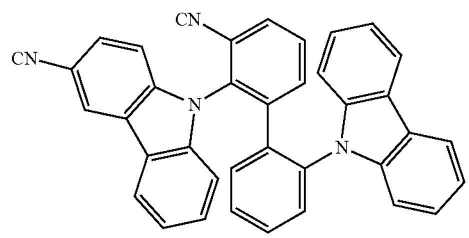
27
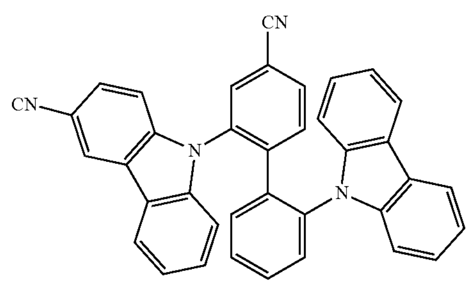
28
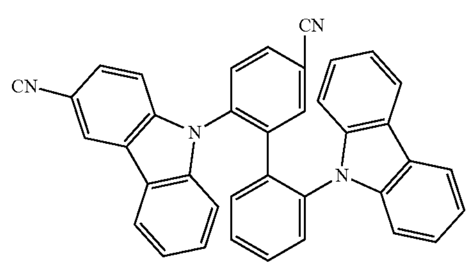
29
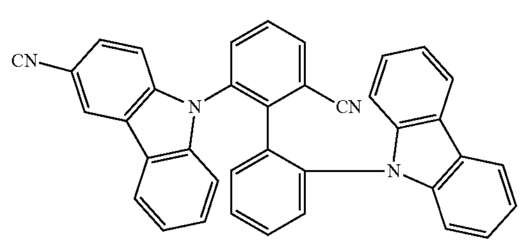

-continued
30
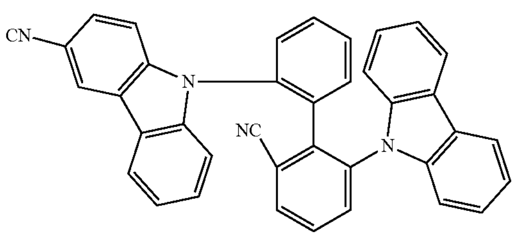
31
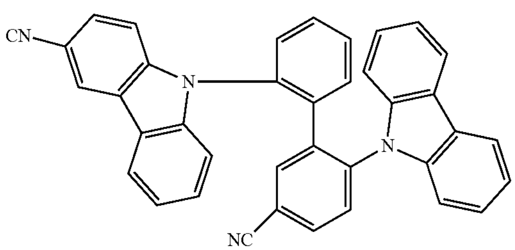
32
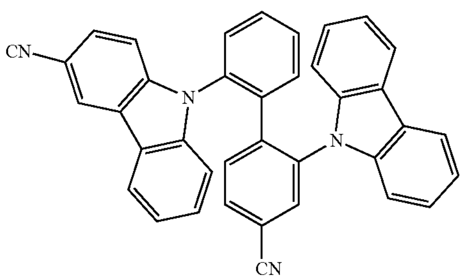
33
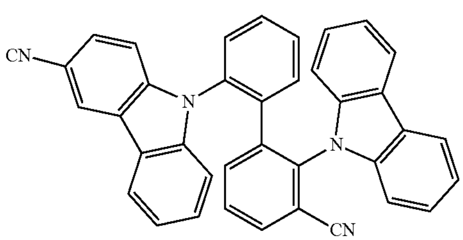
34
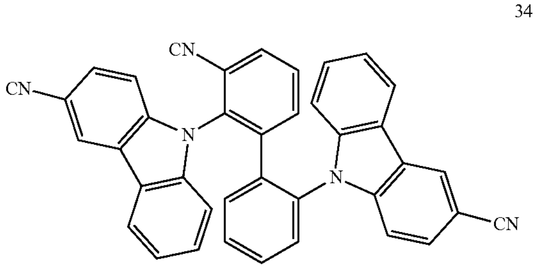
35
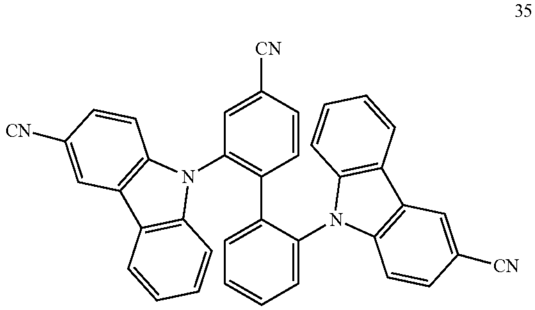
-continued
36
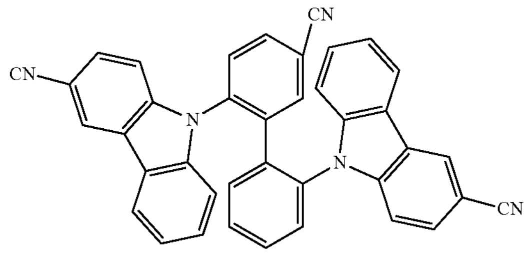
37
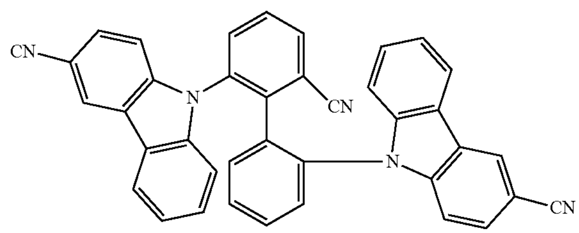
38
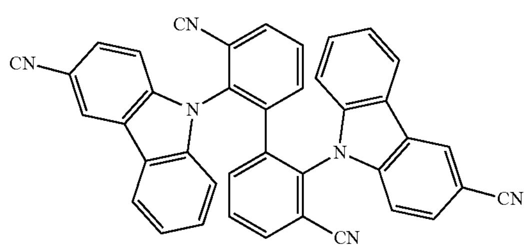
39
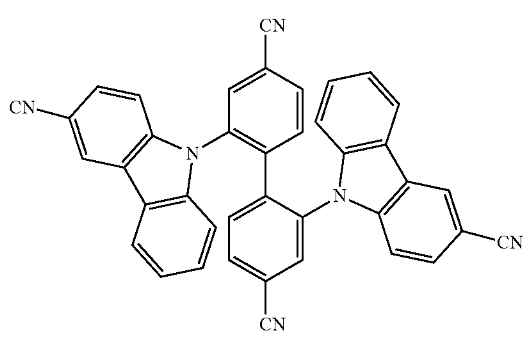
40
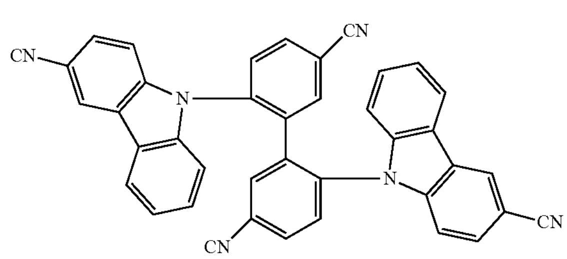

-continued
41
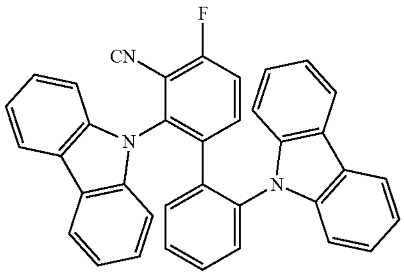
42
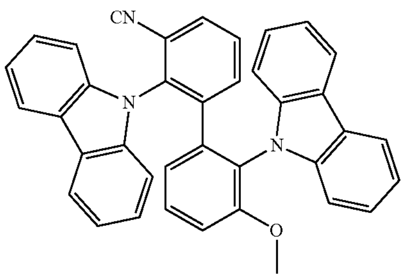
43
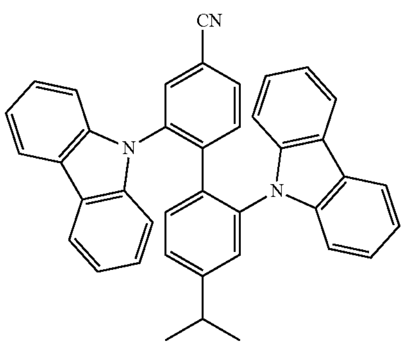
44
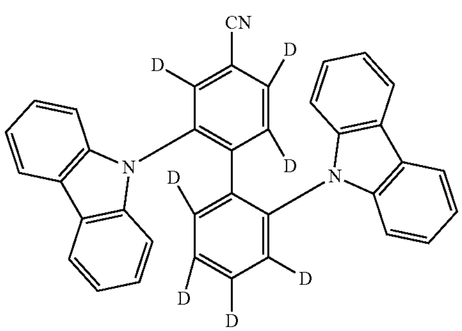
45
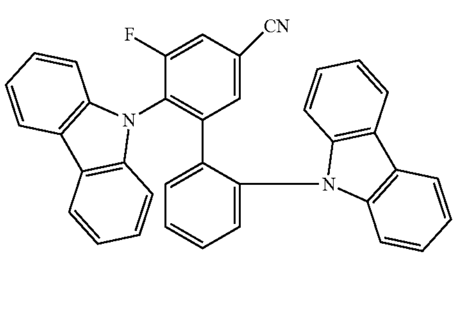
-continued
46
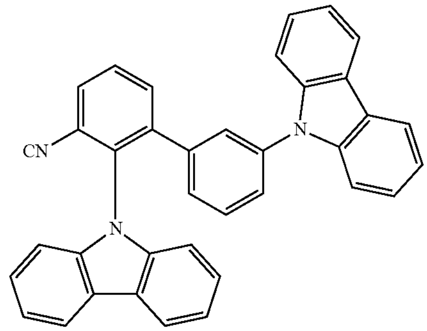
47
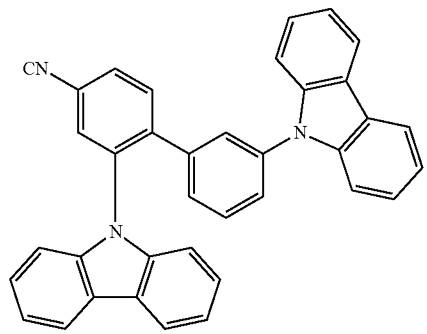
48
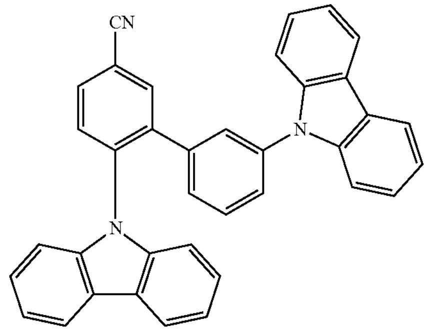
49
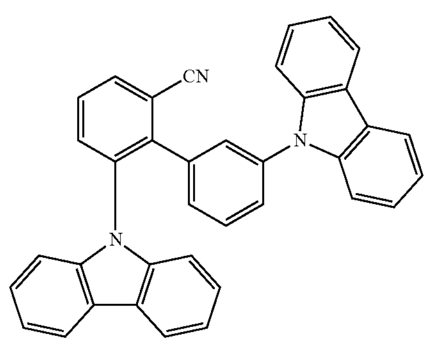

50
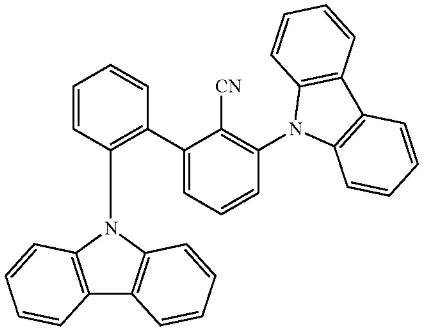
51
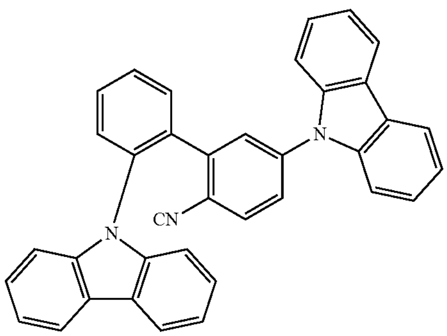
52
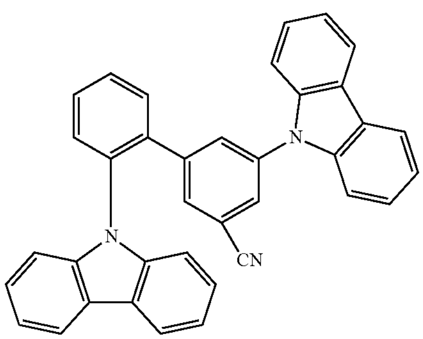
53
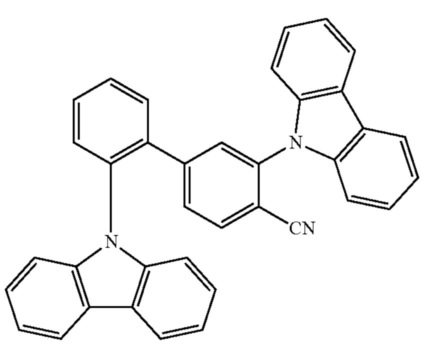
54
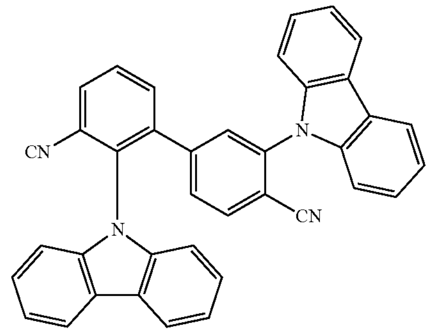
55
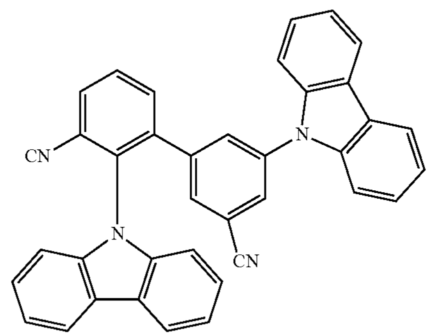
56
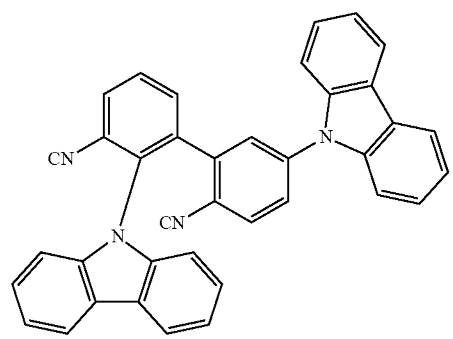
57
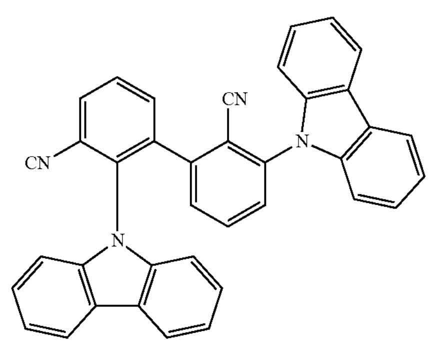

-continued
58
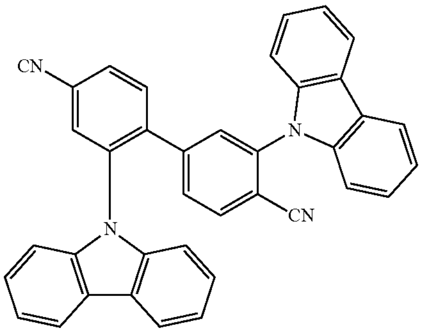
59
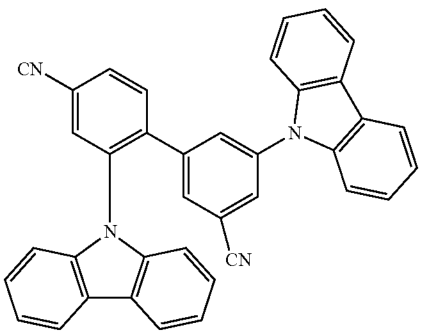
60
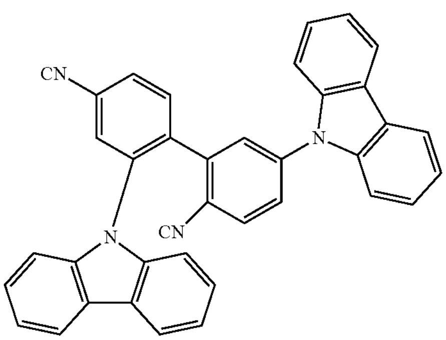
61
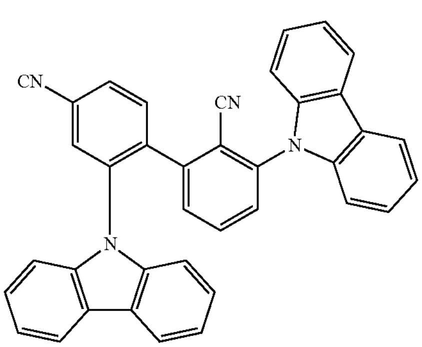
-continued
62
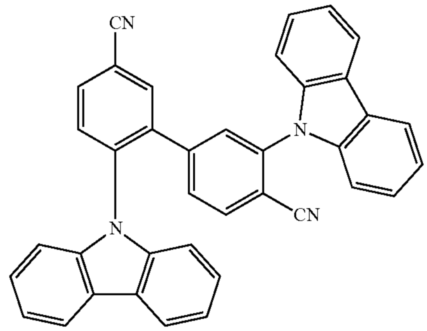
3
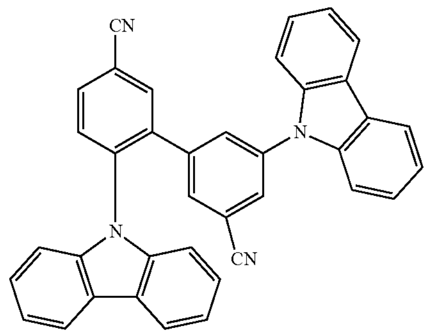
64
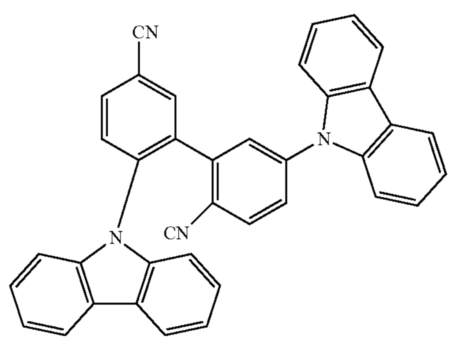
65
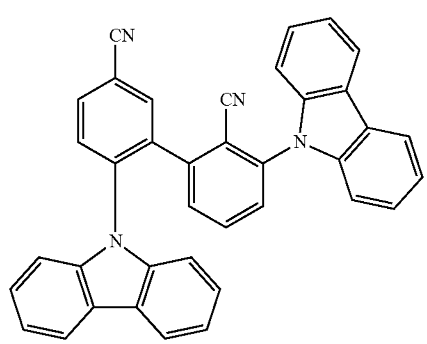

66
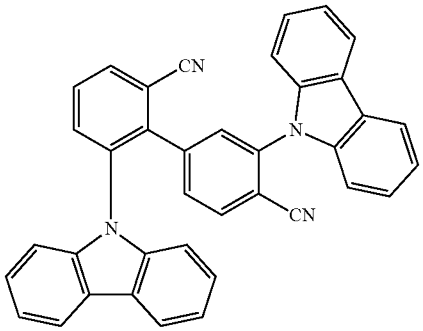
67
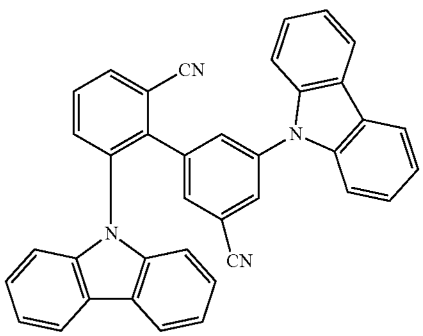
68
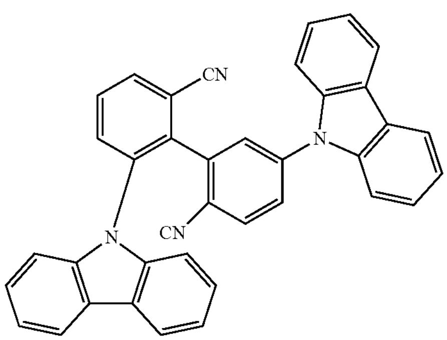
69
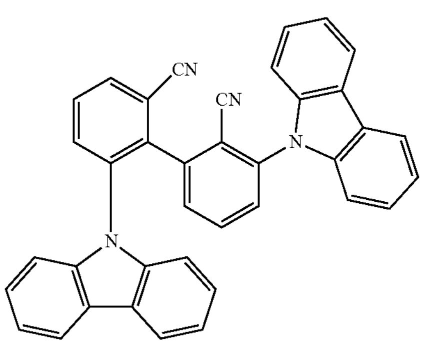
70
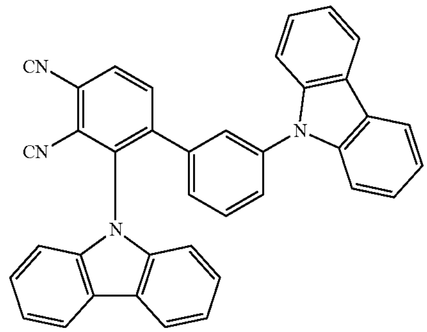
71
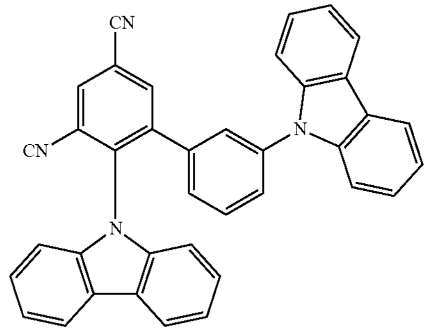
72
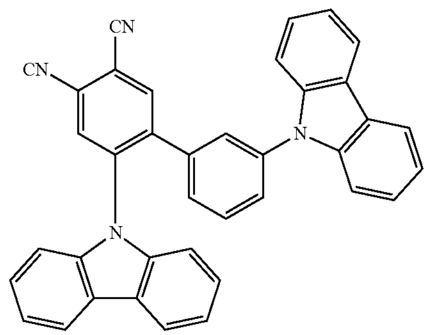
73
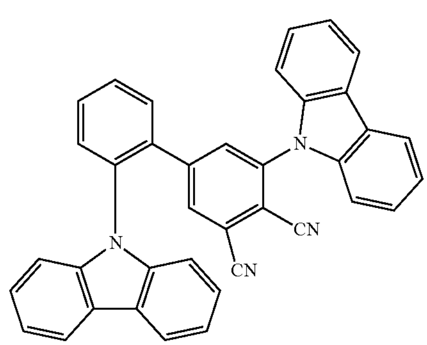

-continued
74
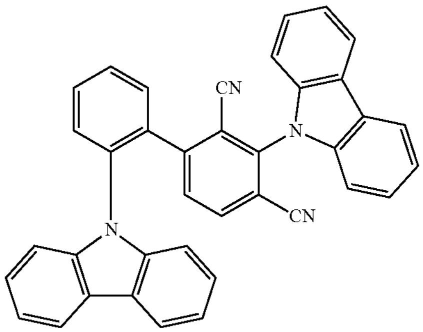
75
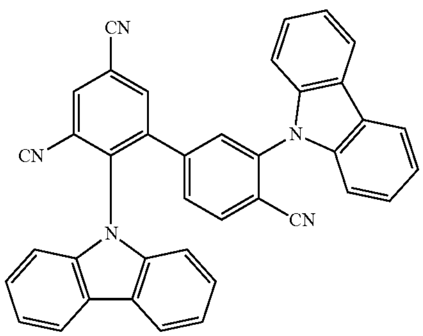
76
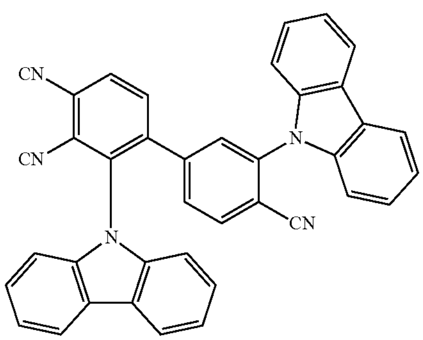
77
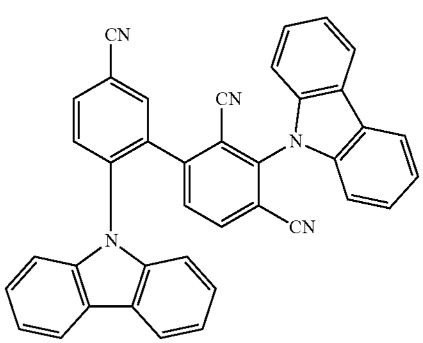
-continued
78
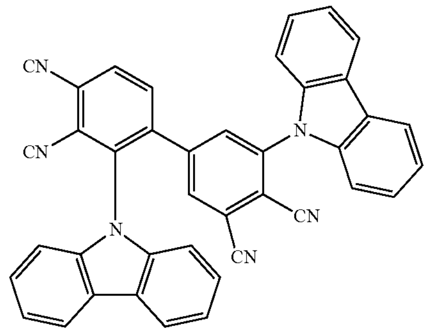
79
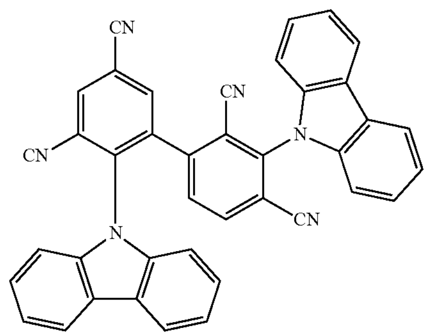
80
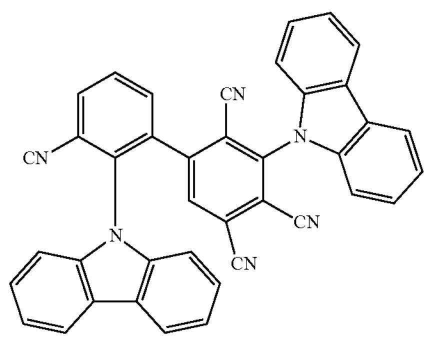
81
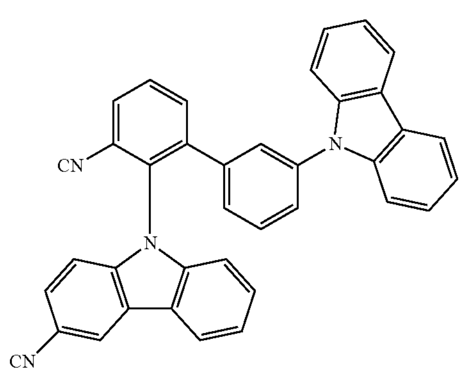

-continued
82
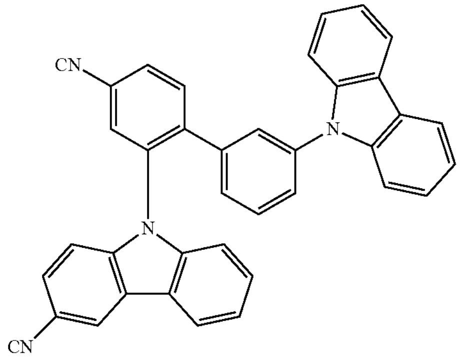
83
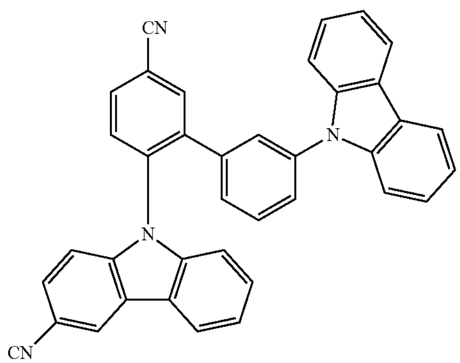
84
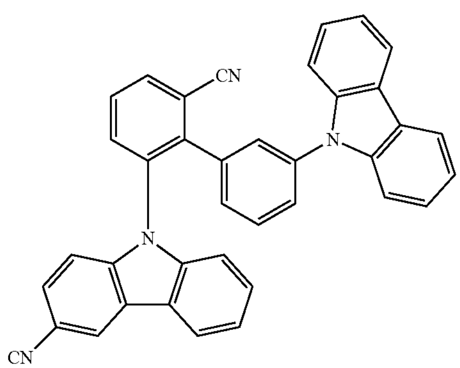
85
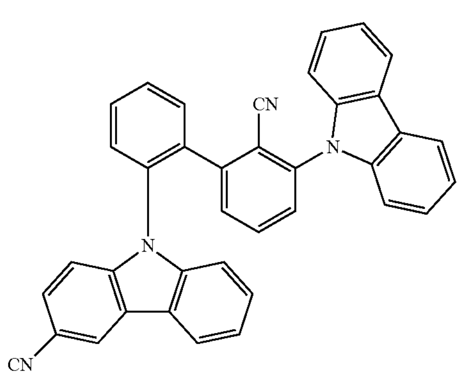
-continued
86
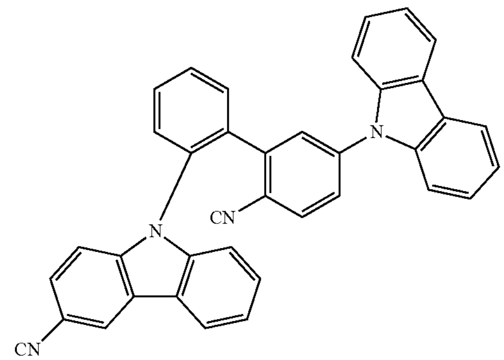
87
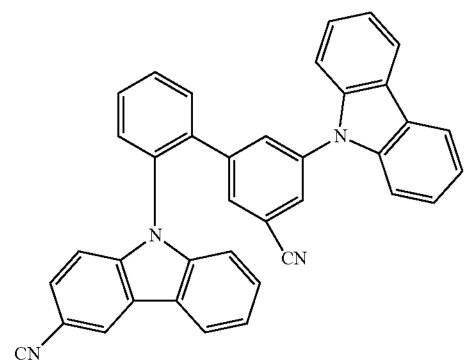
88
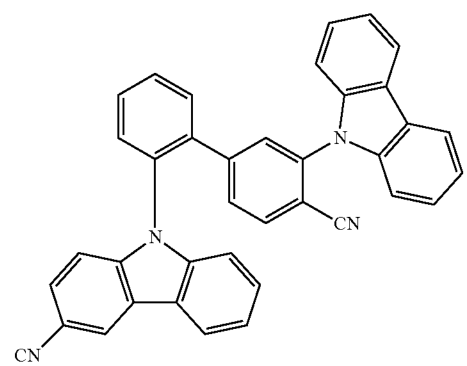
89
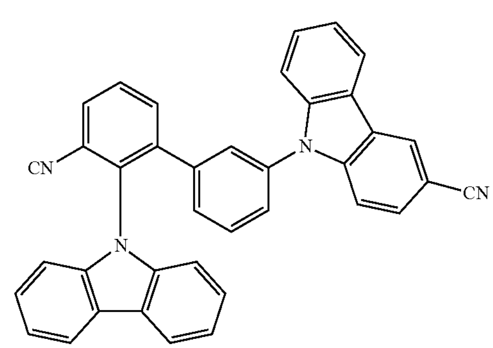

-continued
90
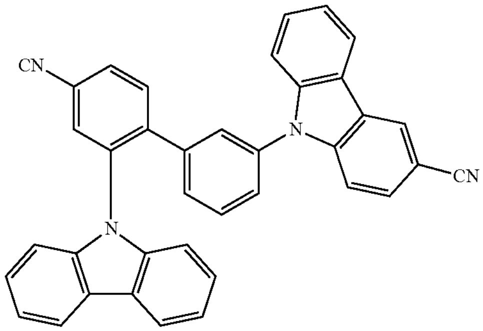
91
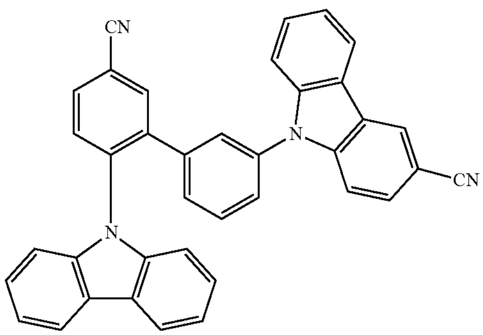
92
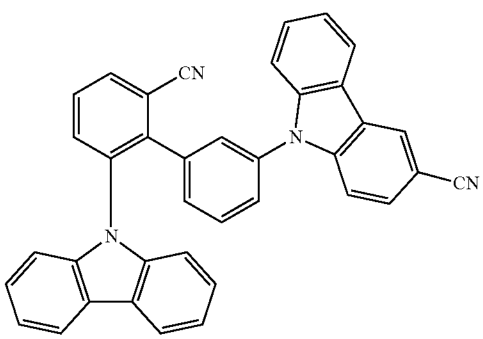
93
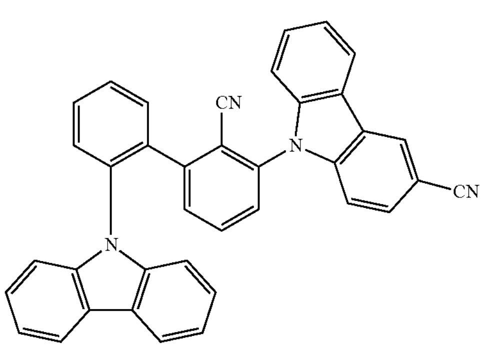
-continued
94
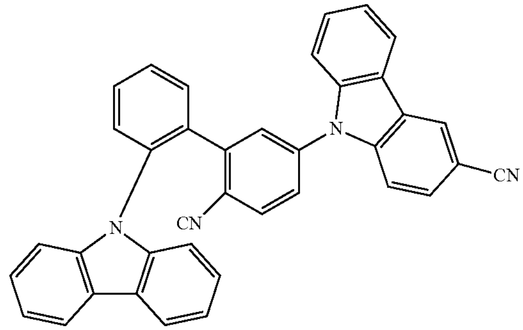
95
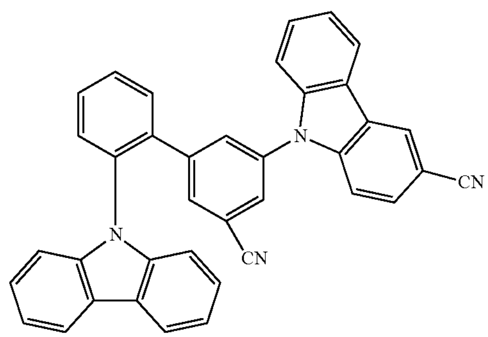
96
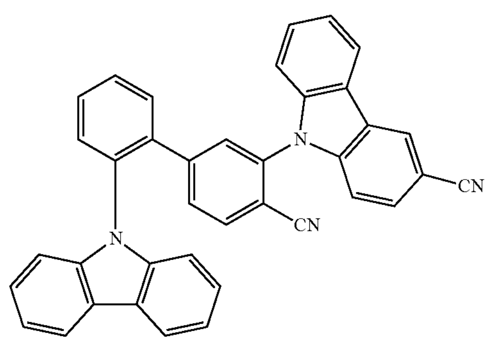
97
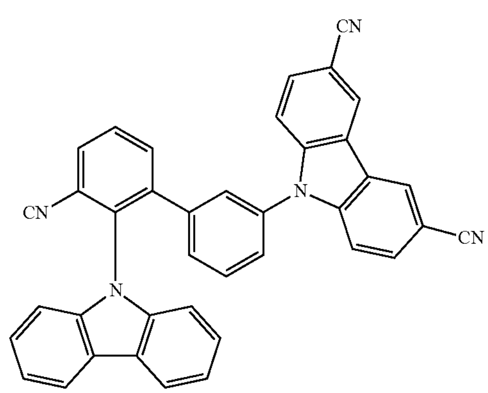

-continued
98
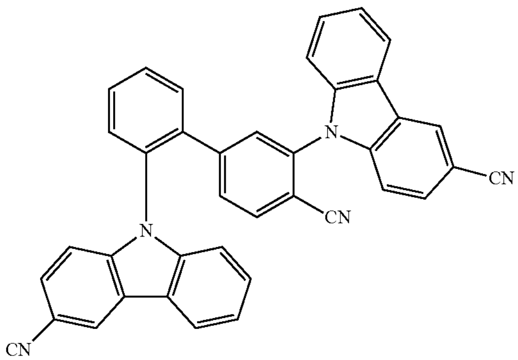
99
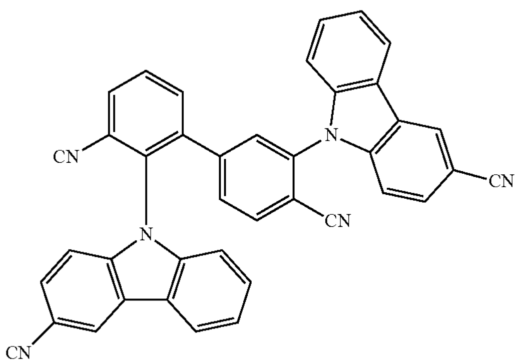
100
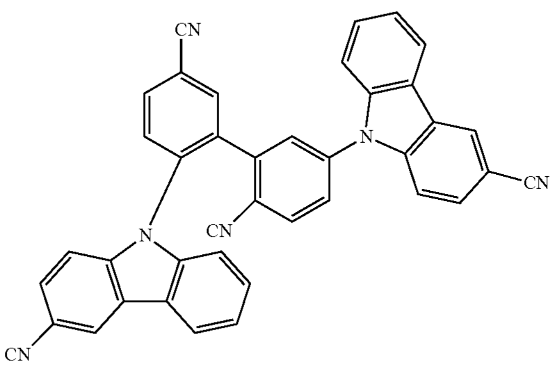
101
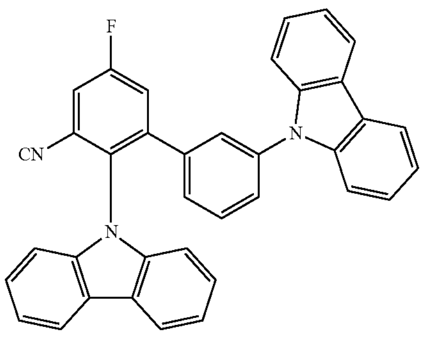
-continued
102
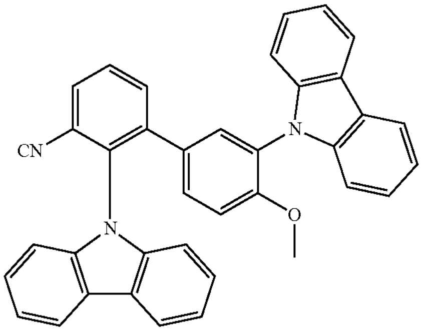
103
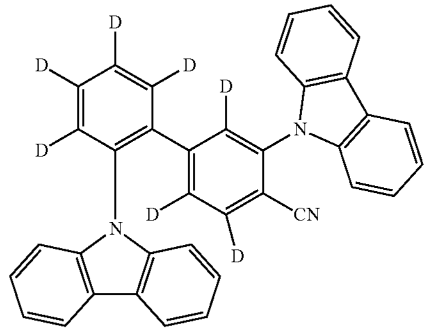
104
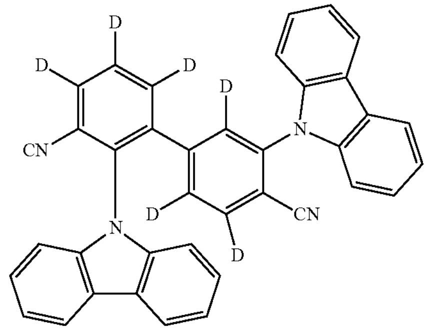
105
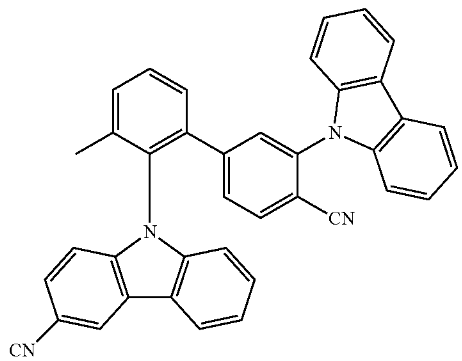

-continued
106
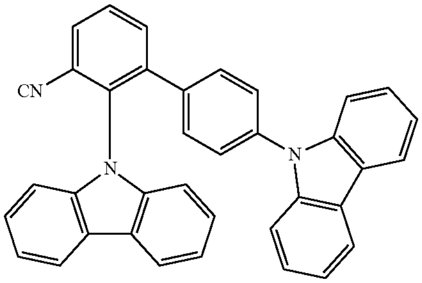
107
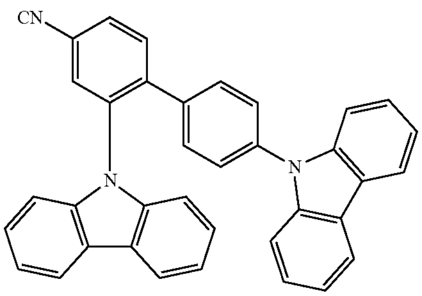
108
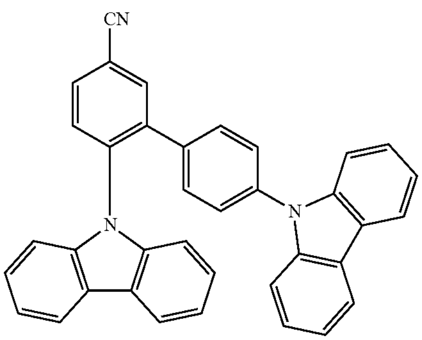
109
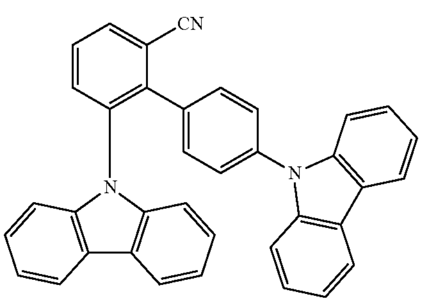
110
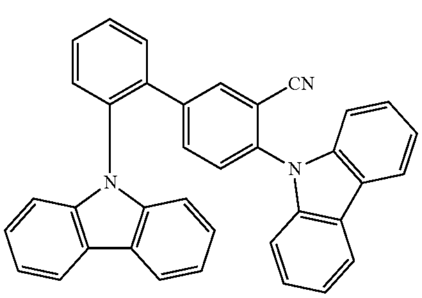
-continued
111
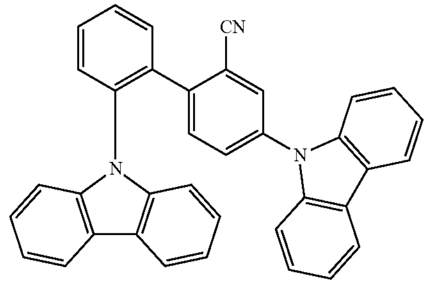
112
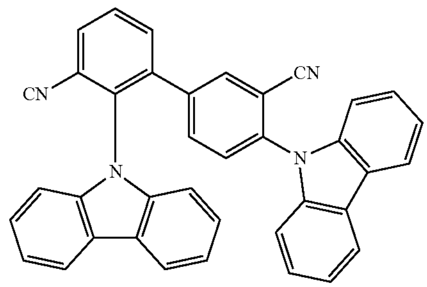
113
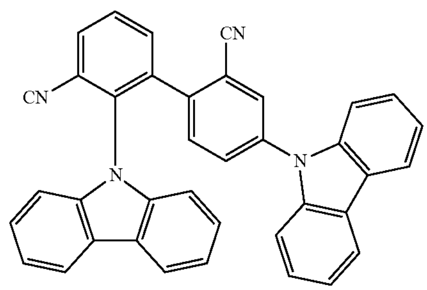
114
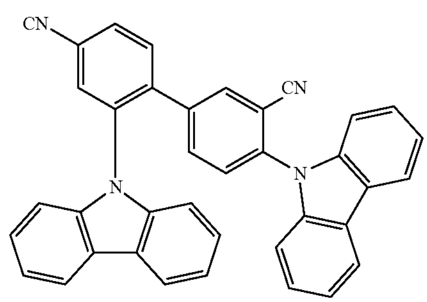
115
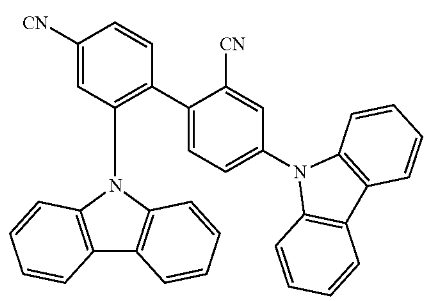

-continued
116
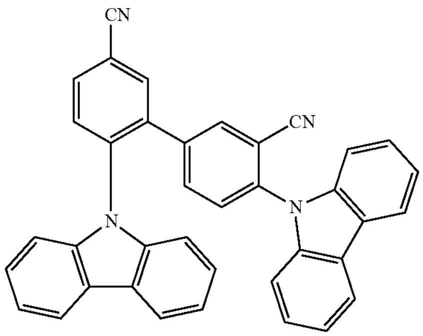
117
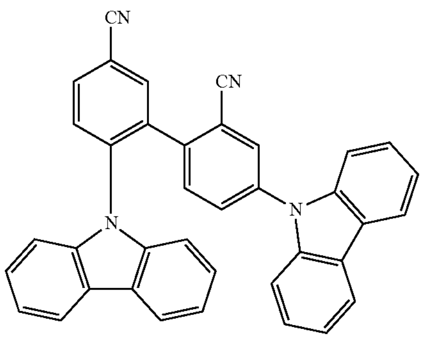
118
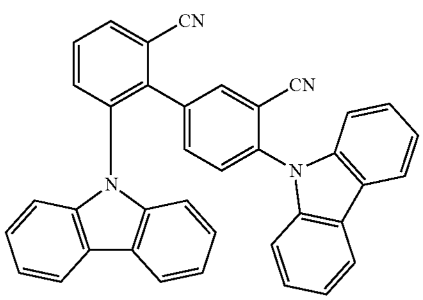
119
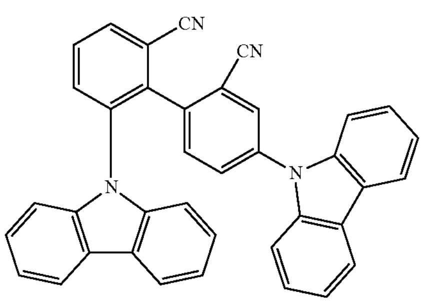
120
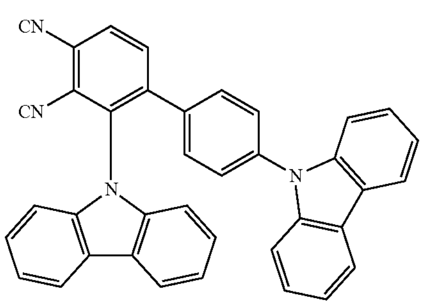
-continued
121
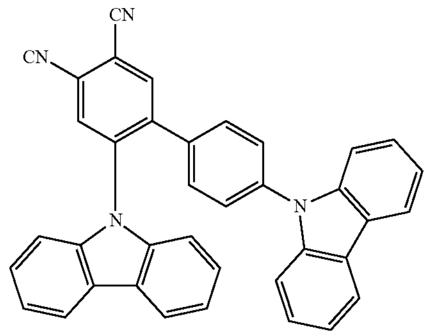
122
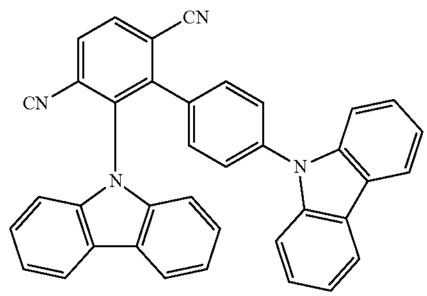
123
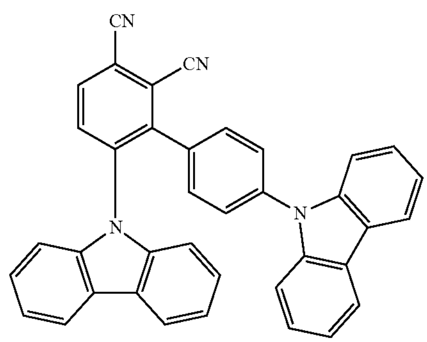
124
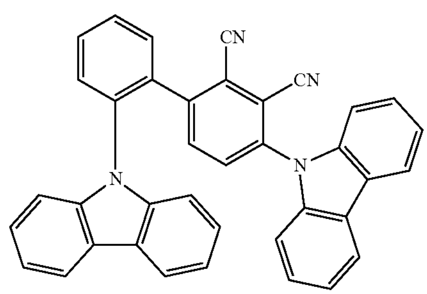
125
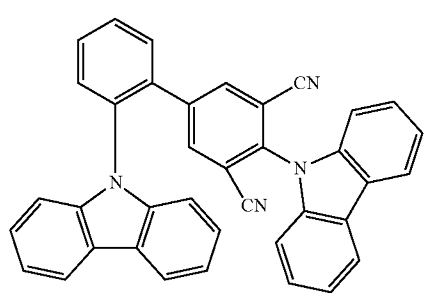

-continued
126
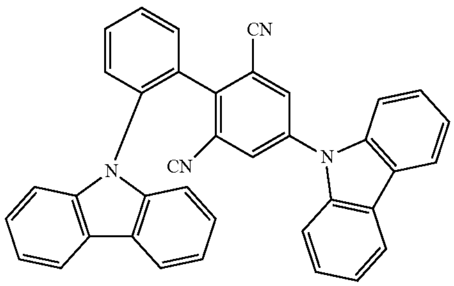
127
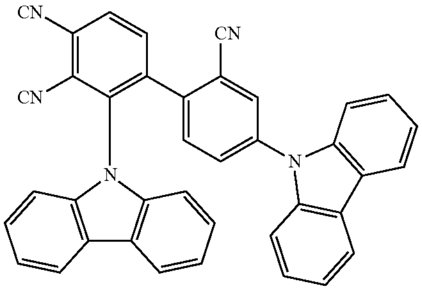
128
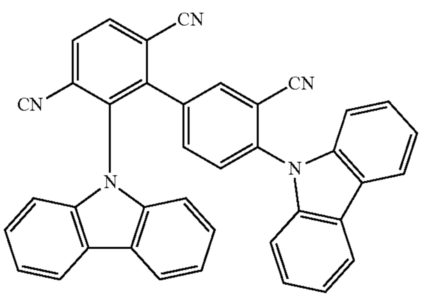
129
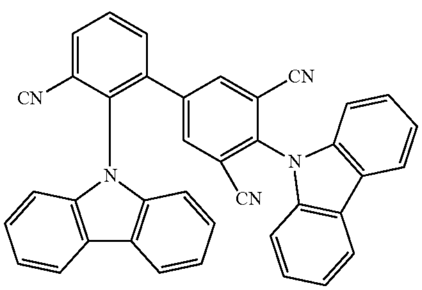
130
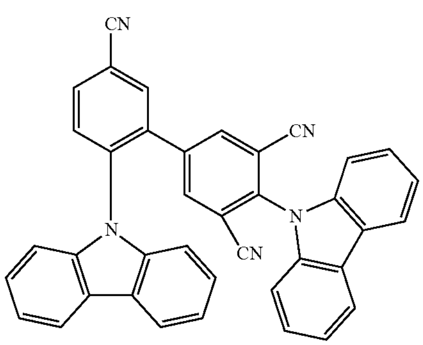
-continued
131
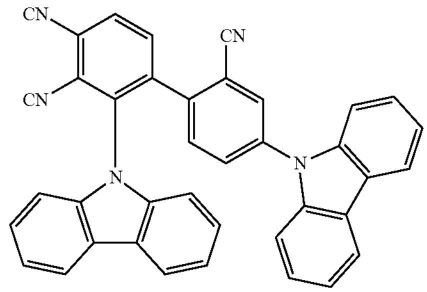
132
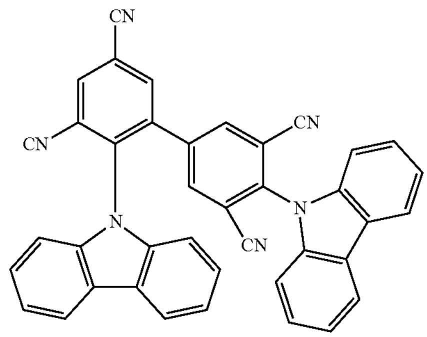
133
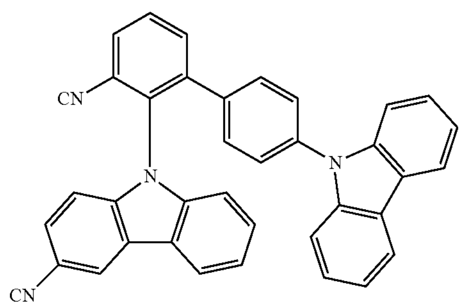
134
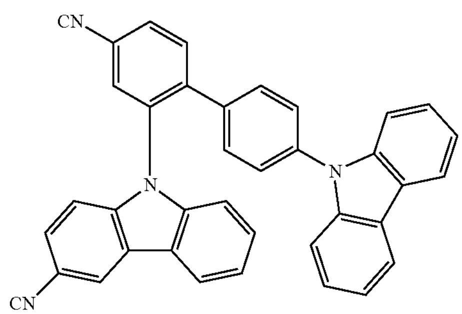
135
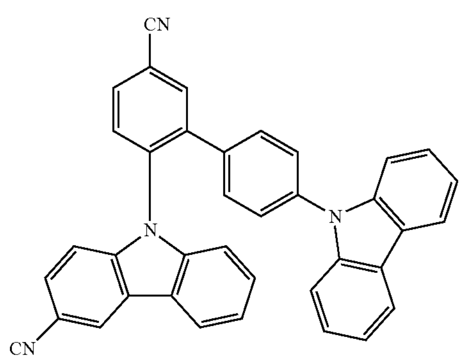

-continued
136
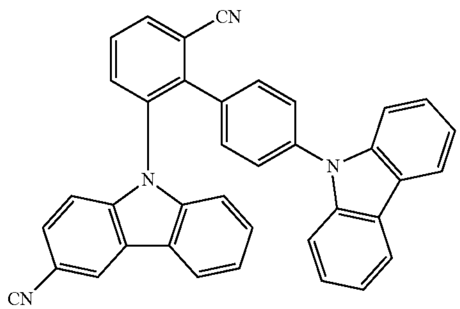
137
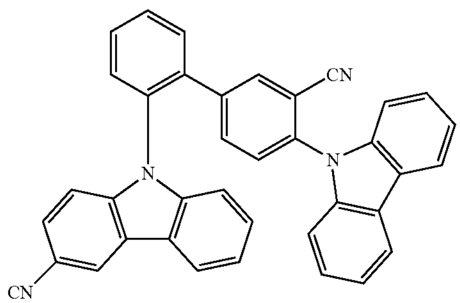
138
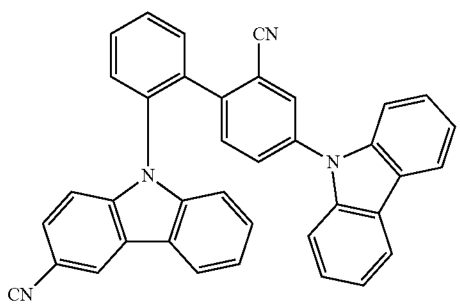
139
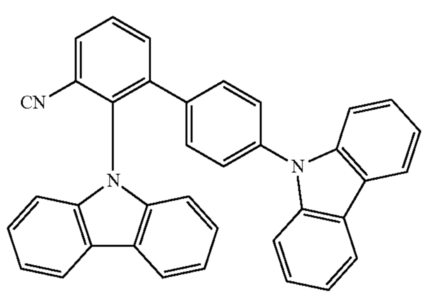
140
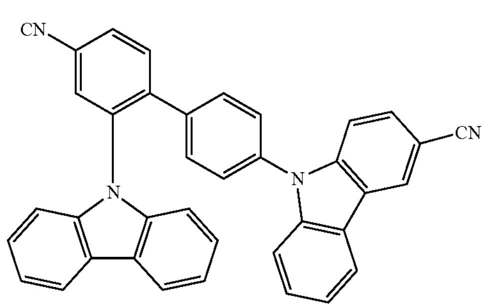
-continued
141
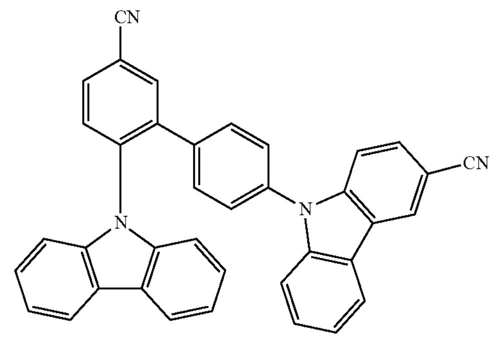
142
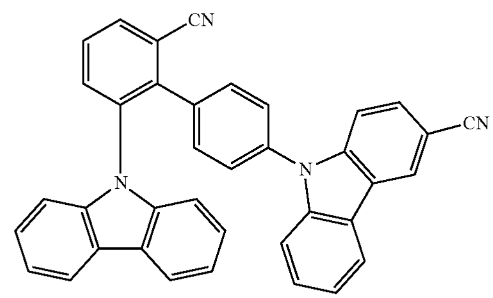
143
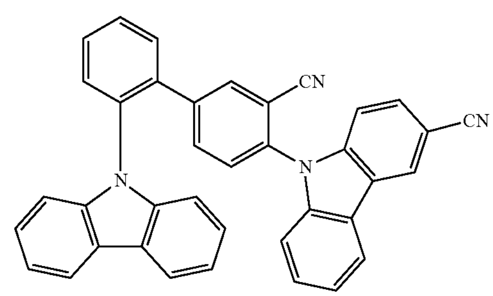
144
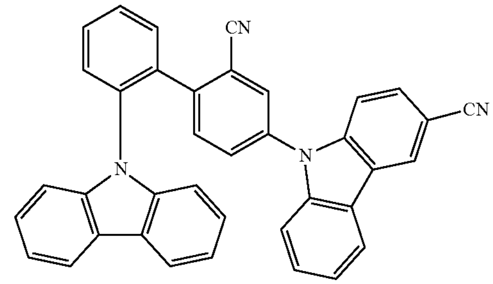
145
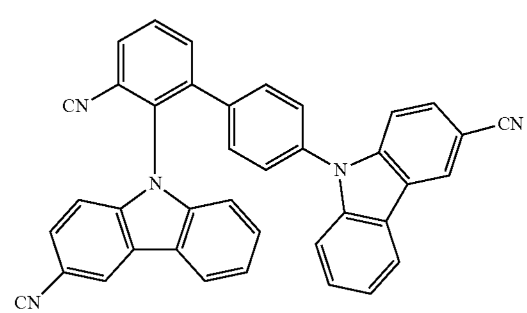

-continued
146
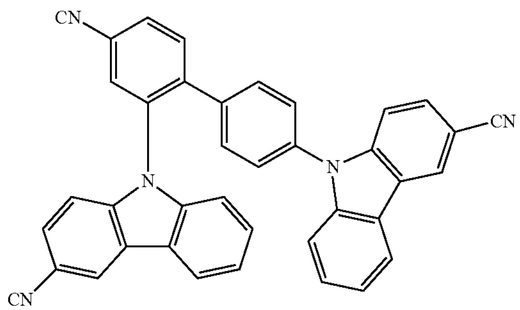
147
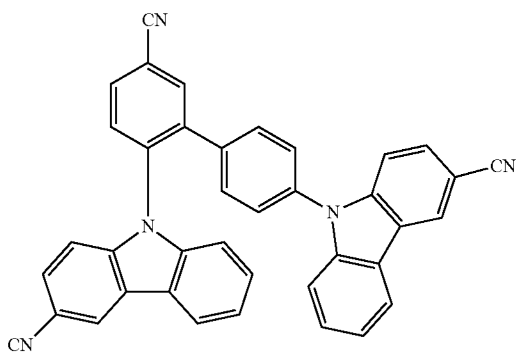
148
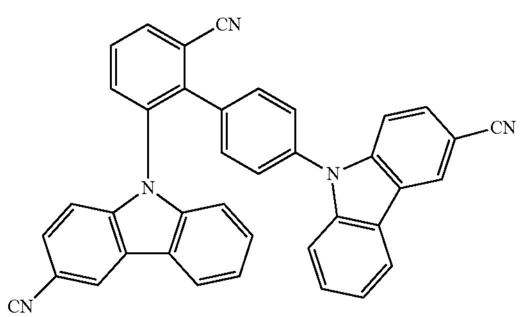
149
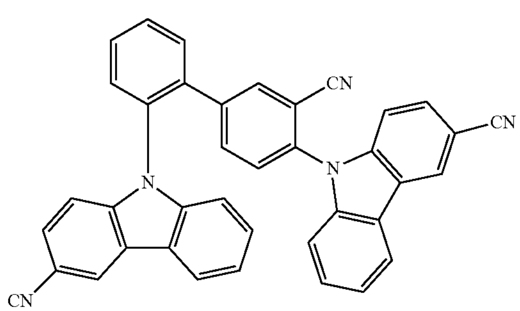
-continued
150
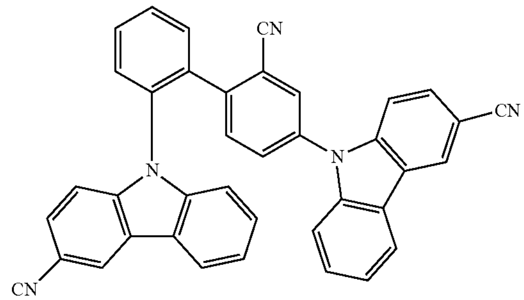
151
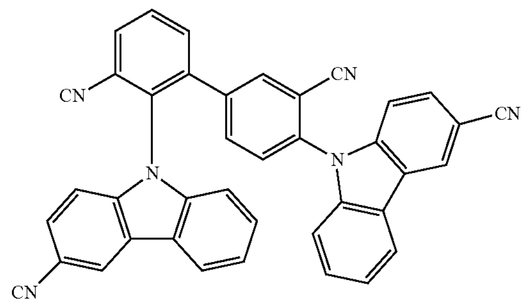
152
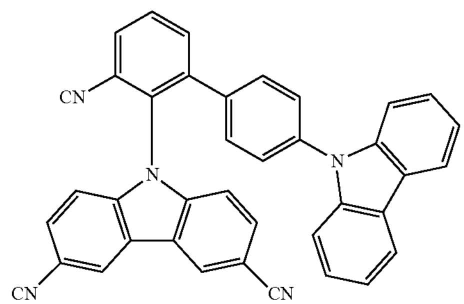
153
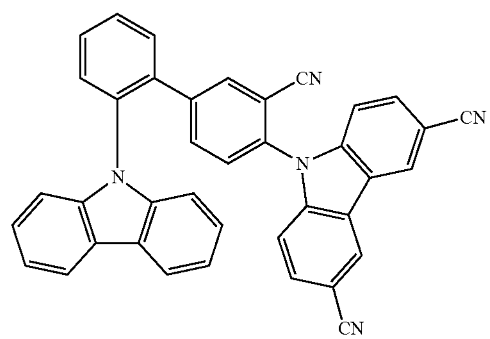
154
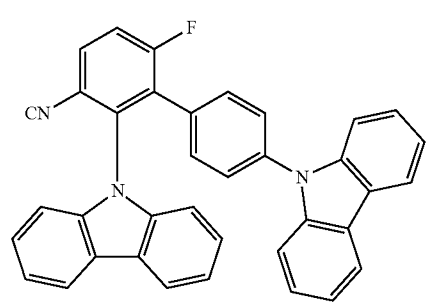

-continued
155
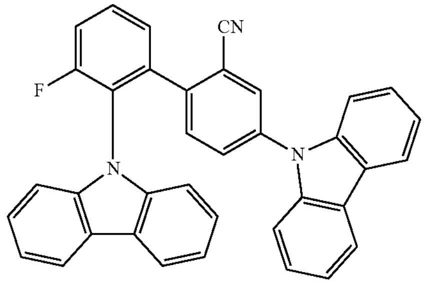
156
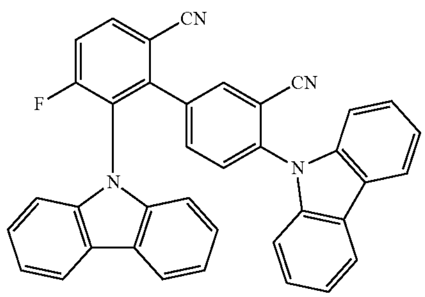
157
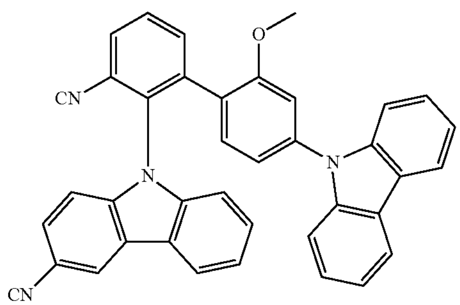
158
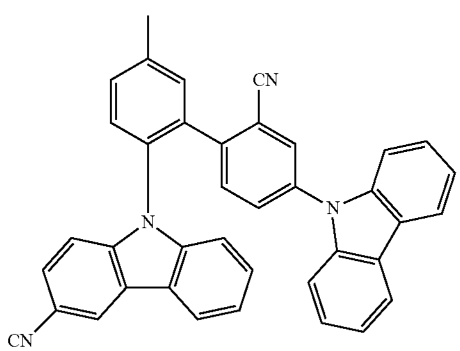
159
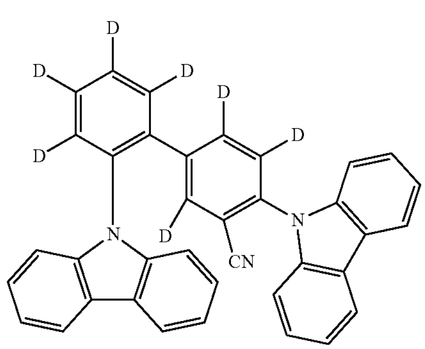
-continued
160
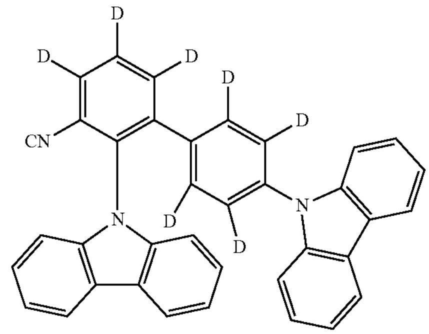
161
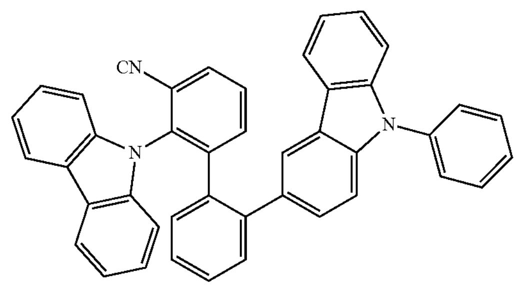
162
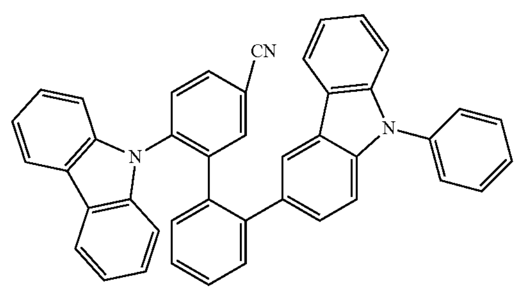
163
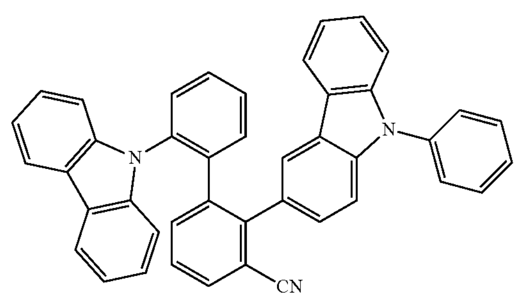
164
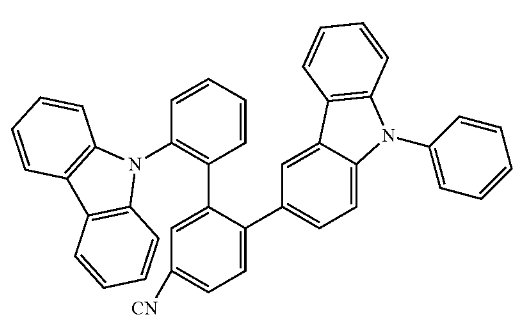

-continued
165
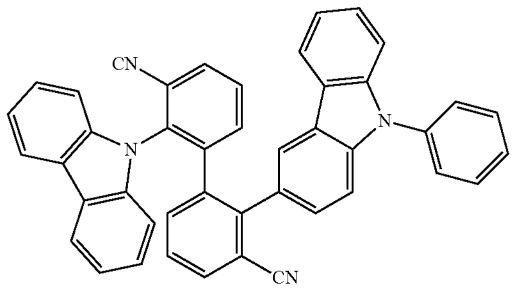
166
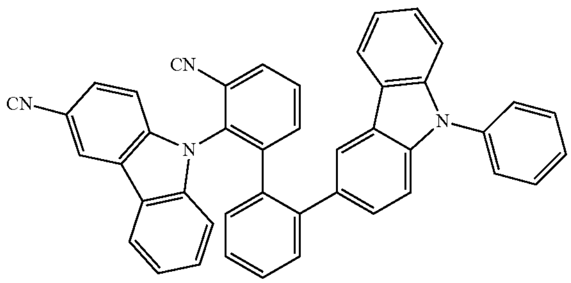
167
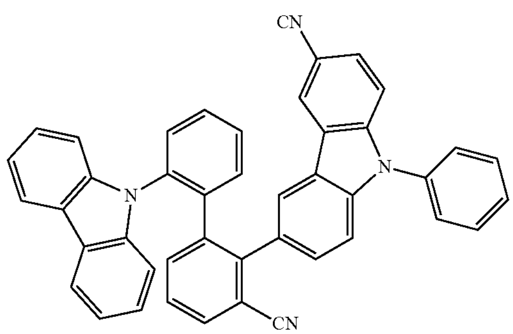
168
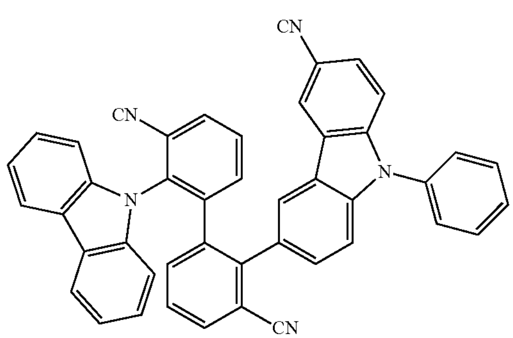
169
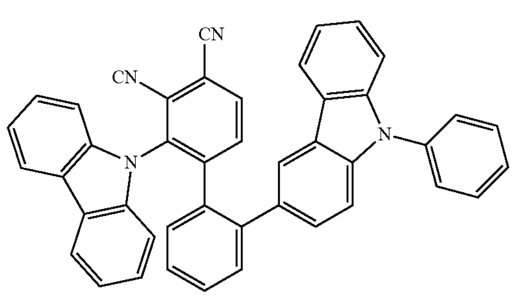
-continued
170
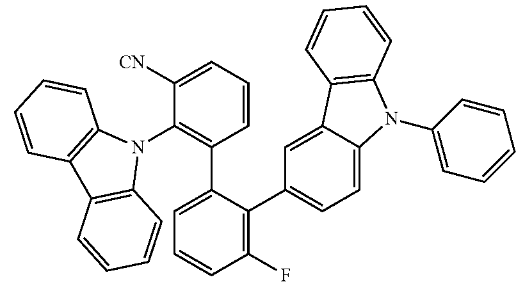
171
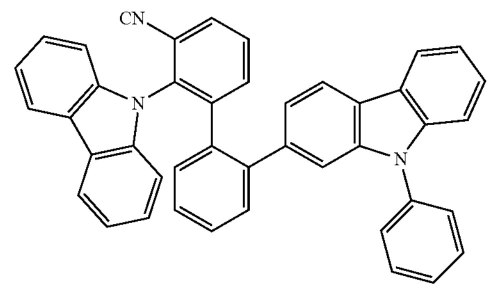
172
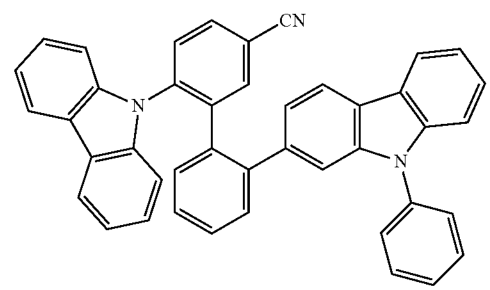
173
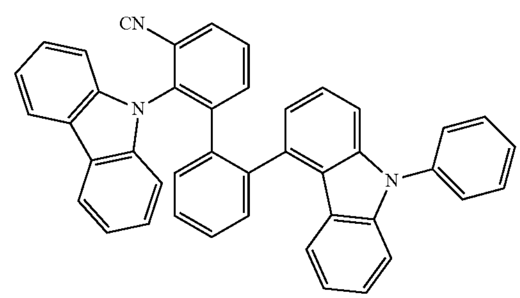
174
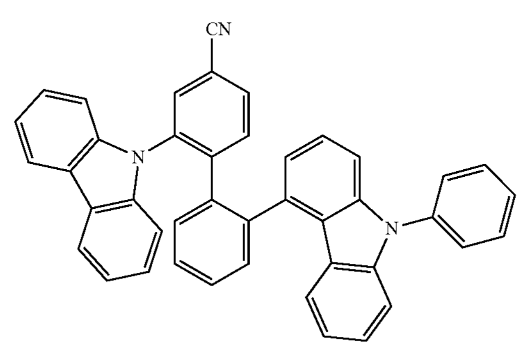

175
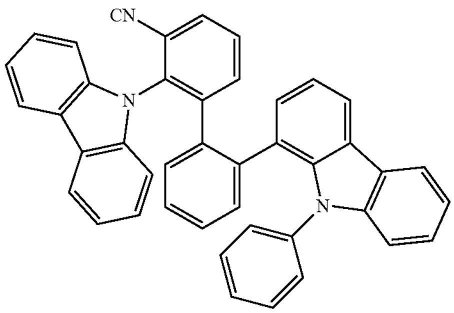
176
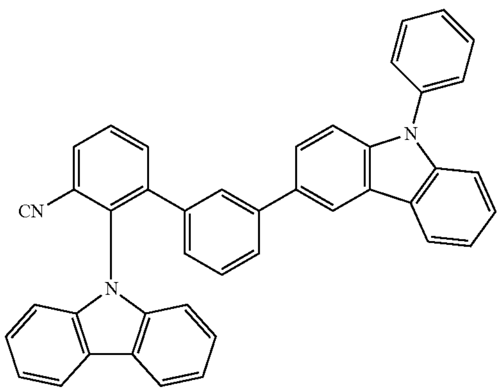
177
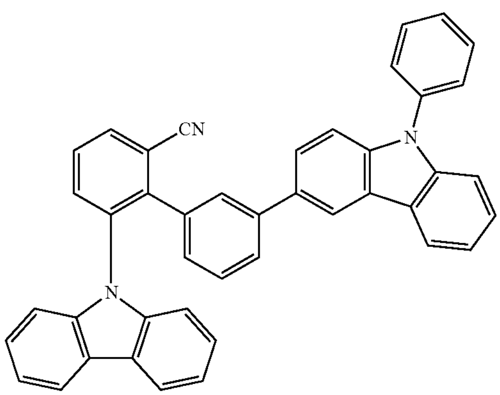
178
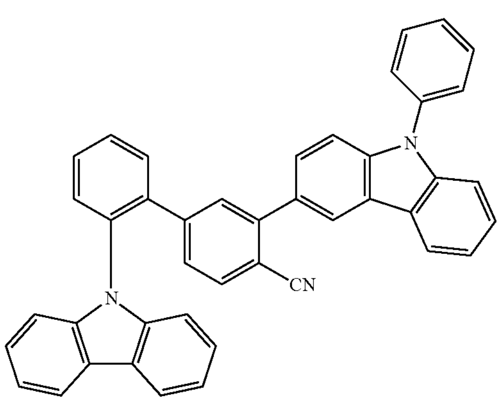
179
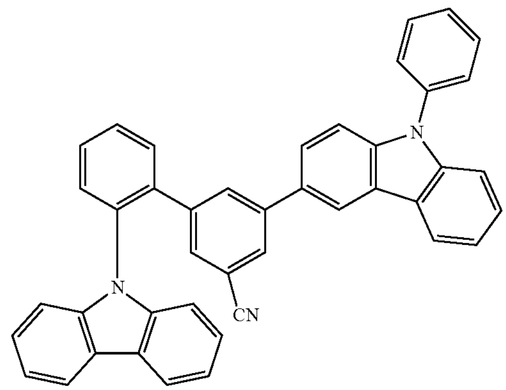
180
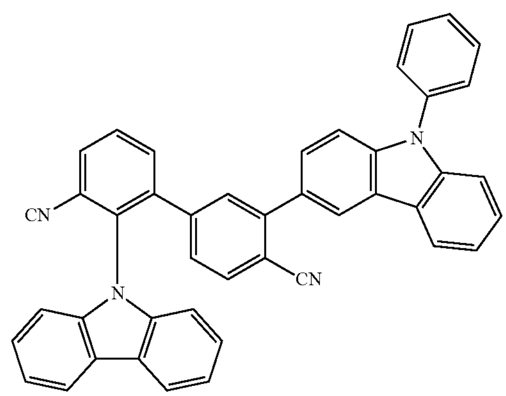
181
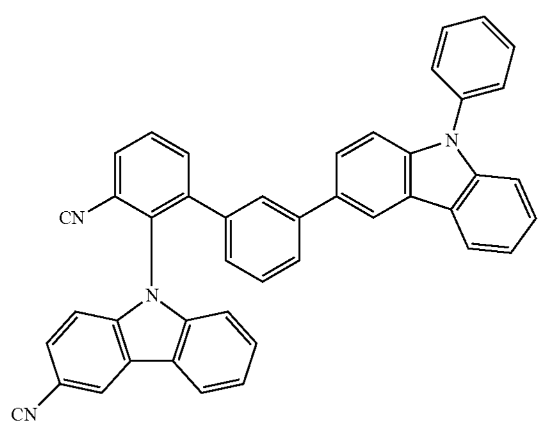

-continued
182
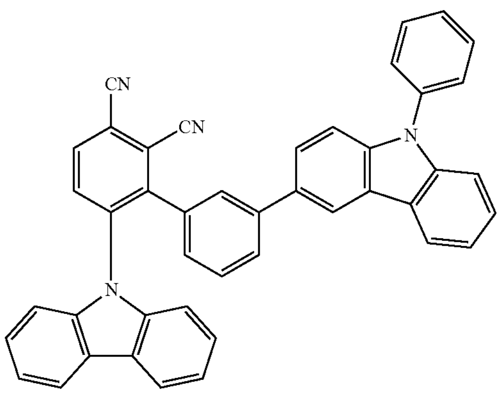
183
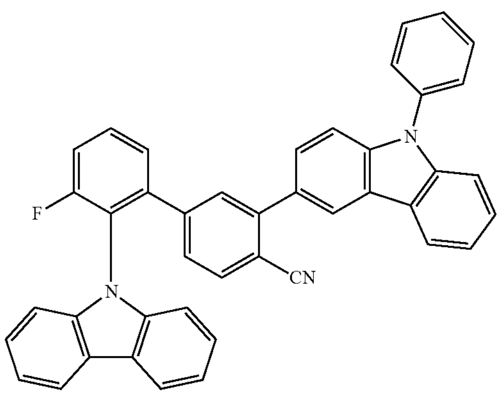
184
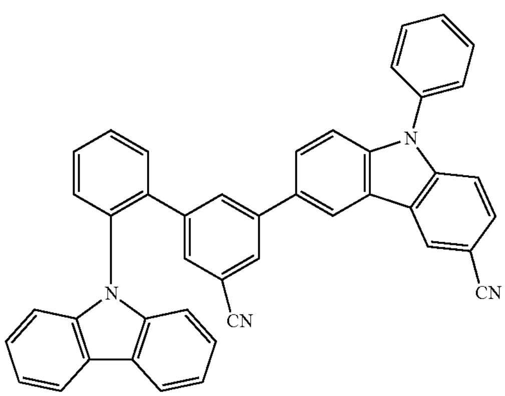
185
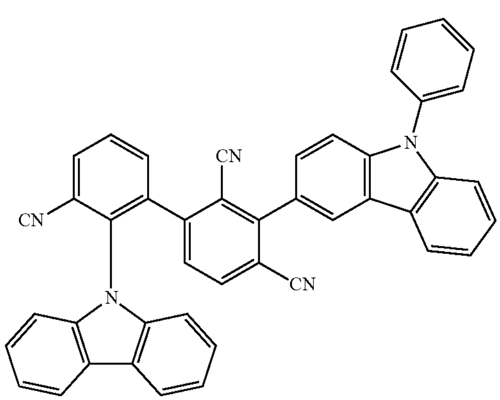
-continued
186
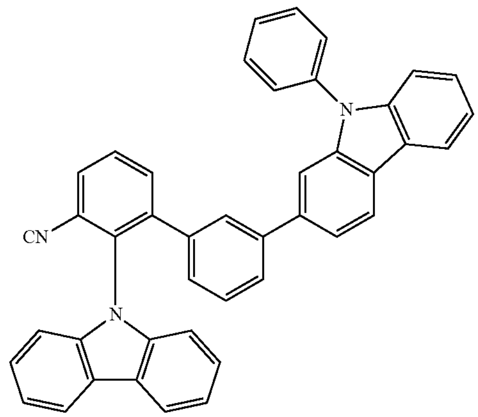
187
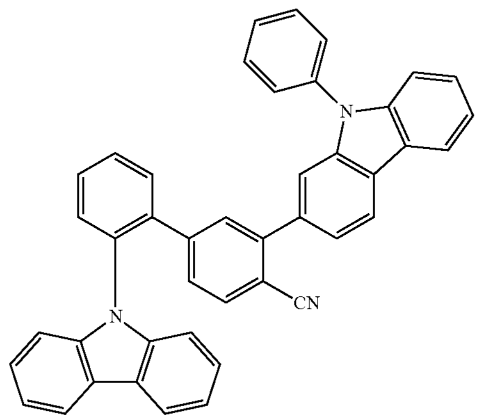
188
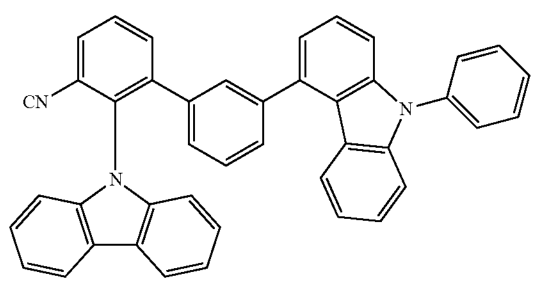
189
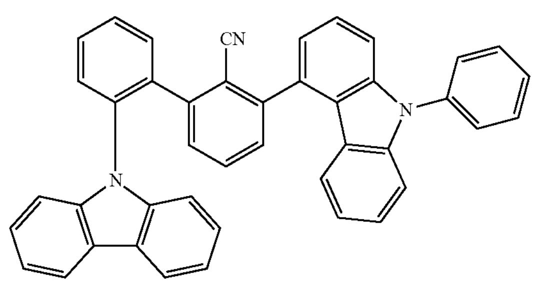

190
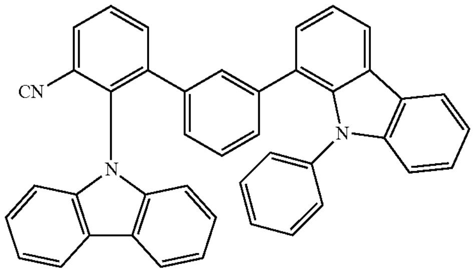
191
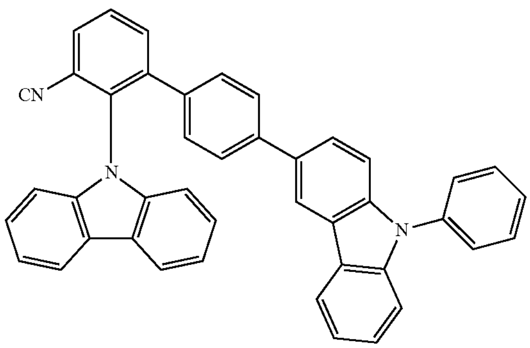
192
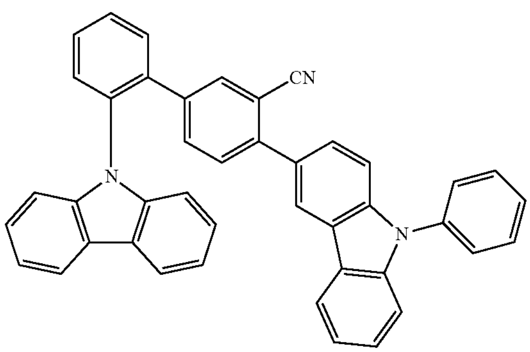
193
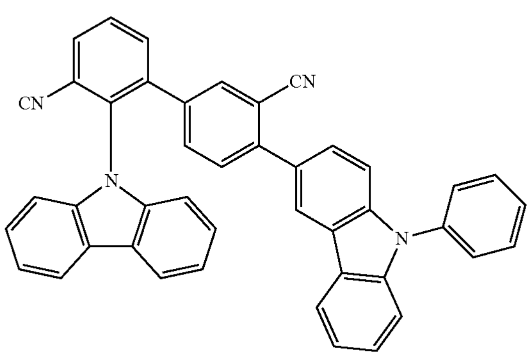
194
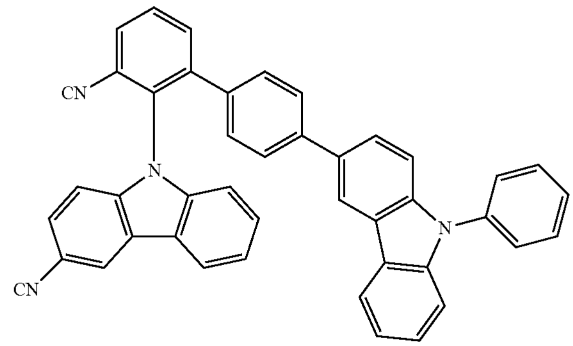
195
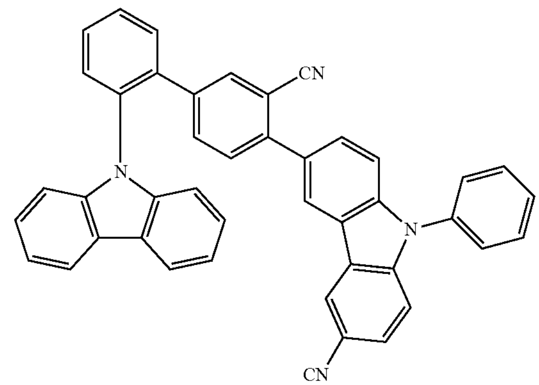
196
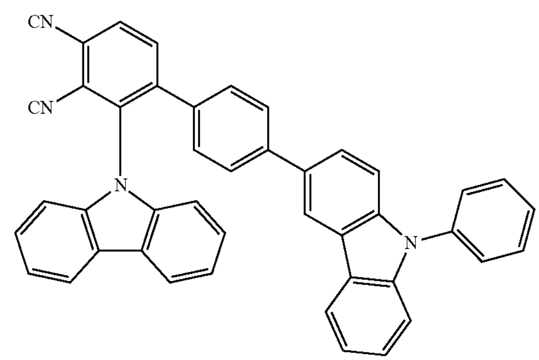
197
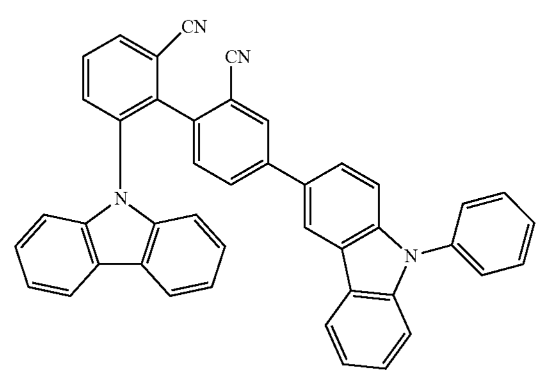

198
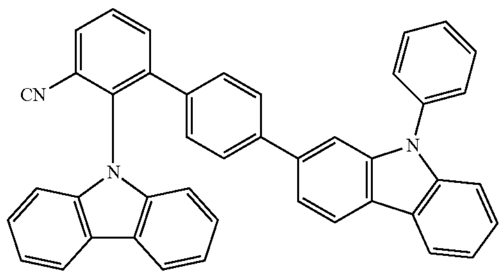
199
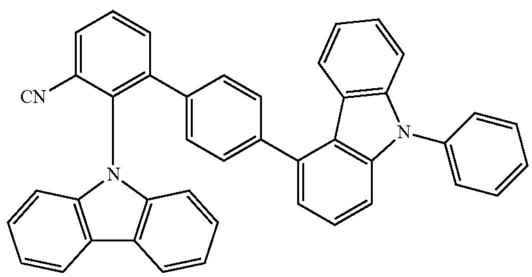
200
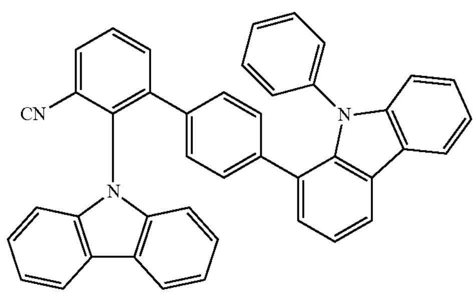
201
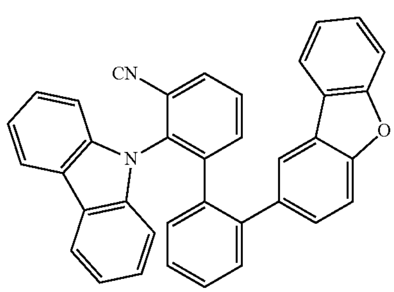
202
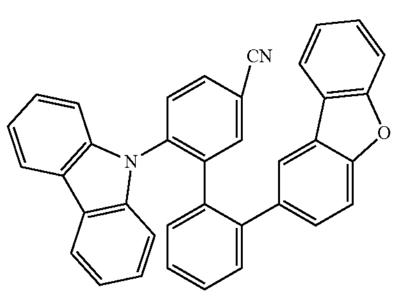
203
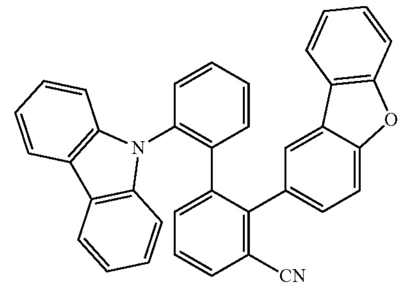
204
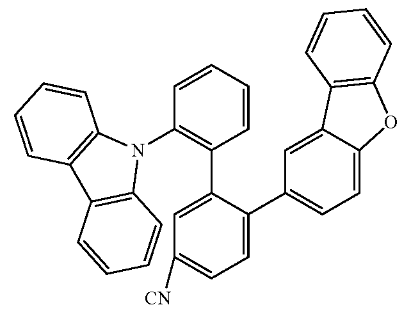
205
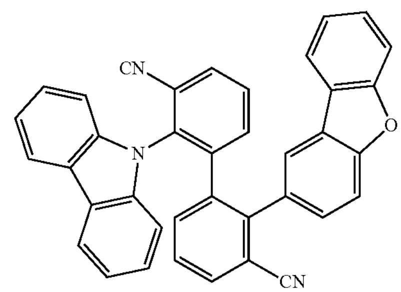
206
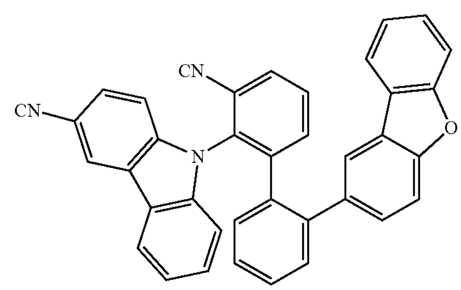
207
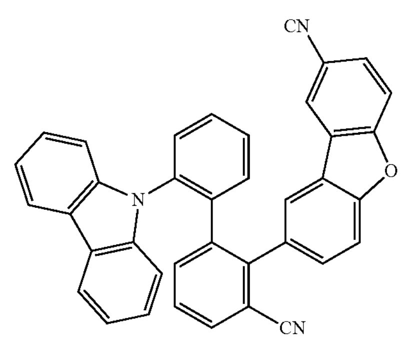

208
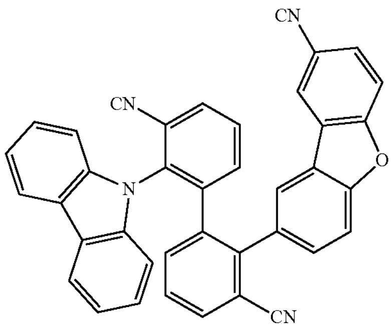
209
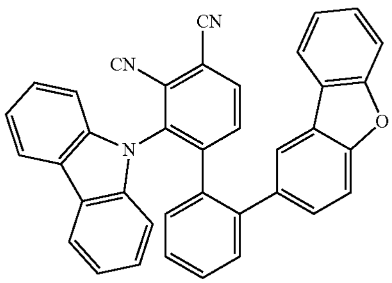
210
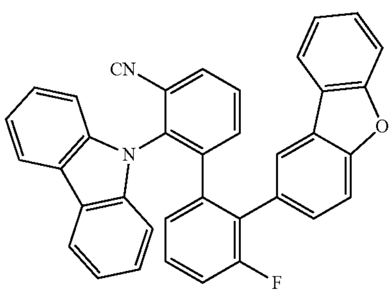
211
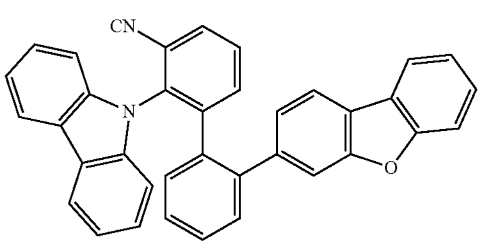
212
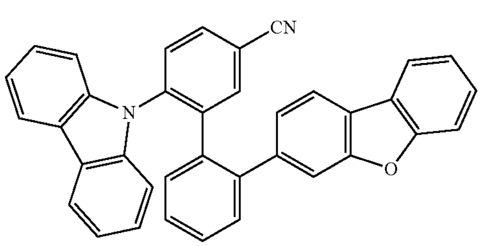
213
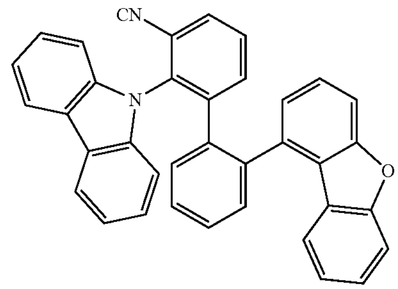
214
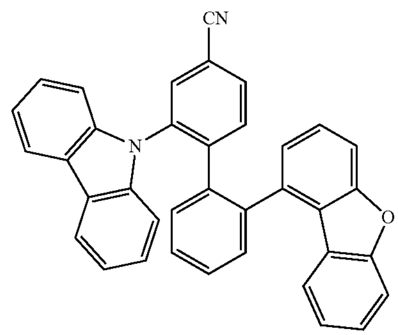
215
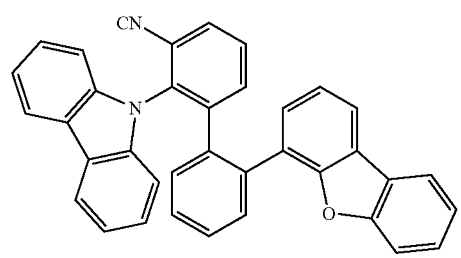
216
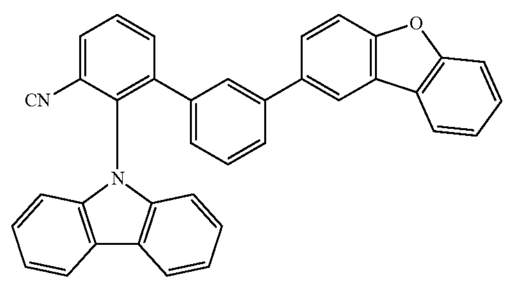
217
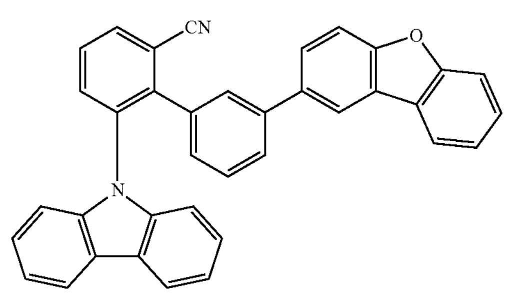

-continued
218
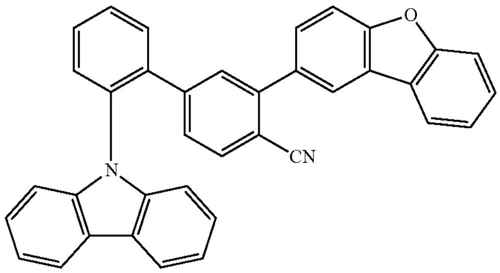
219
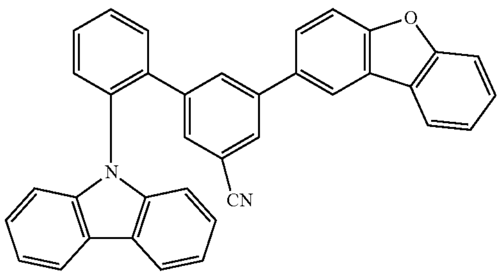
220
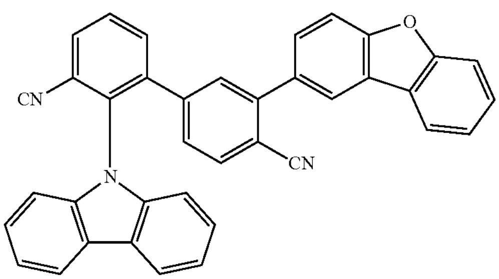
221
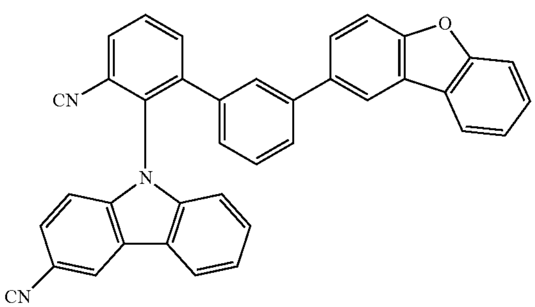
222
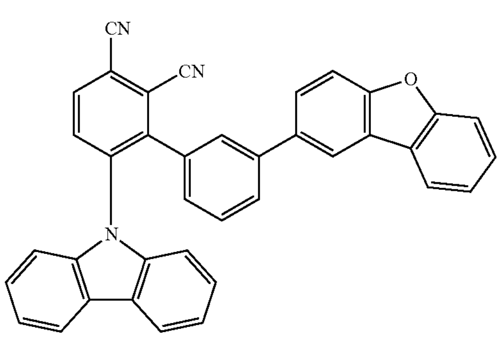
-continued
223
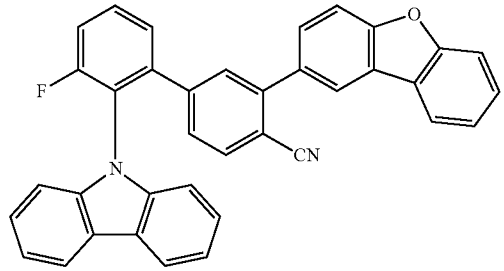
224
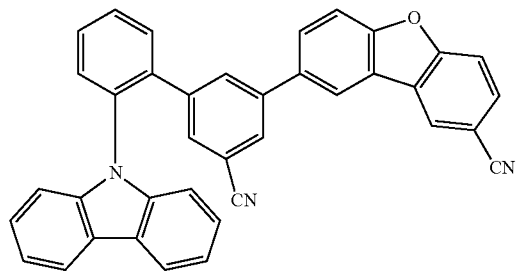
225
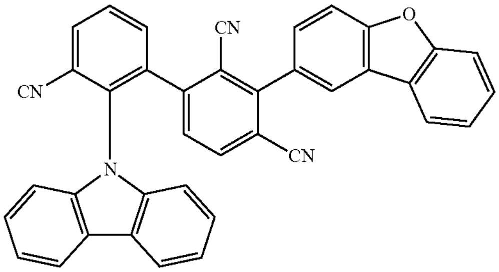
226
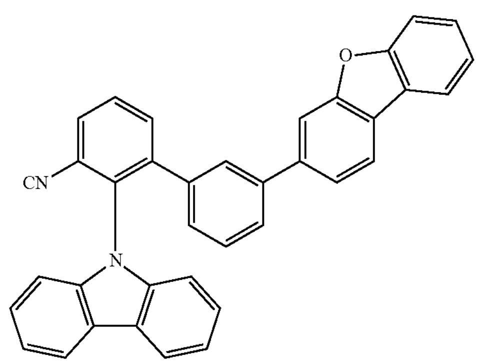
227
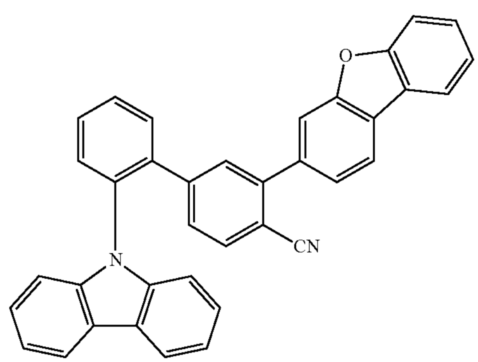

-continued
228
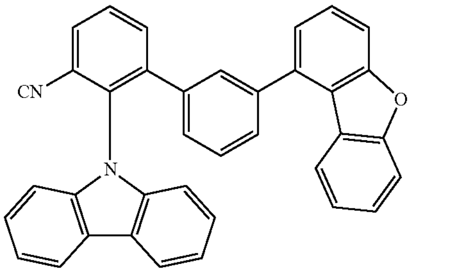
229
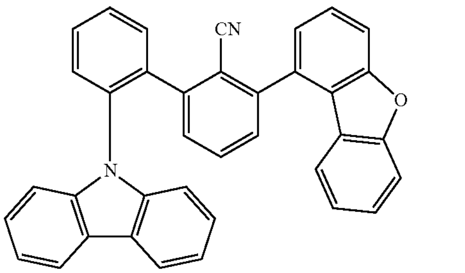
230
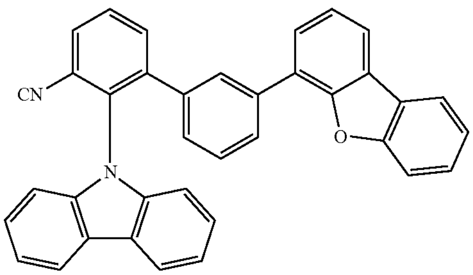
231
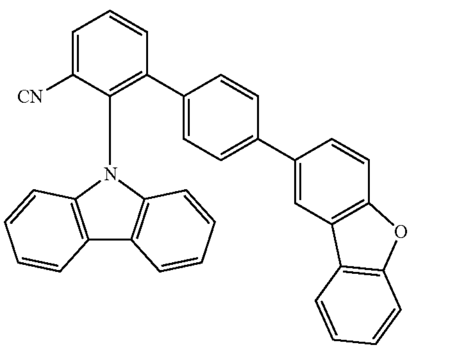
232
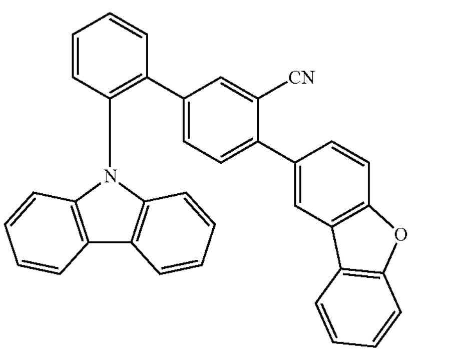
-continued
233
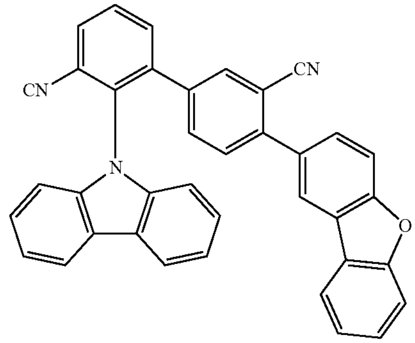
234
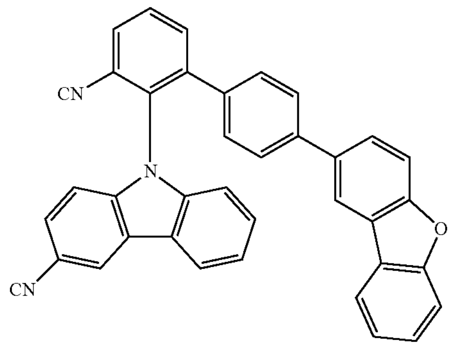
235
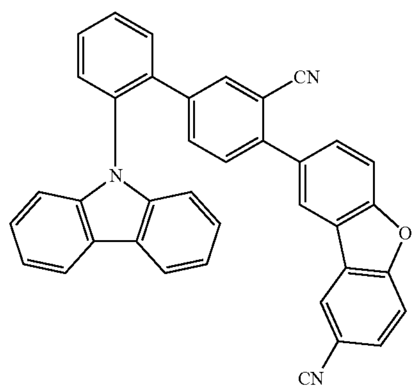
23236
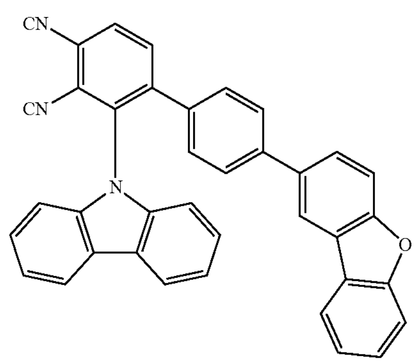

237
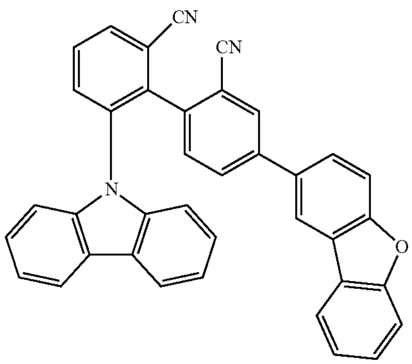
238
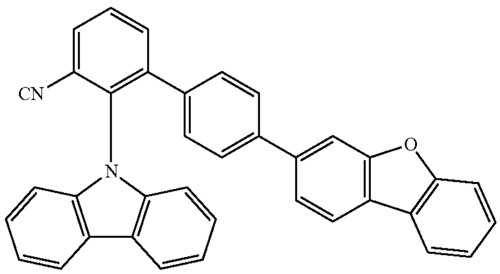
239
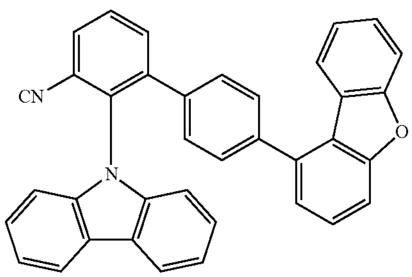
240
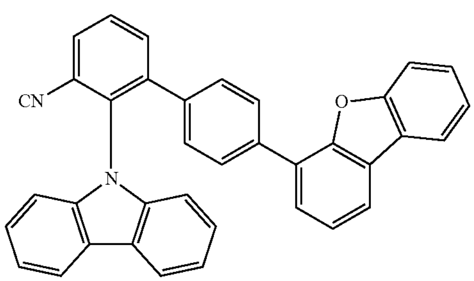
241
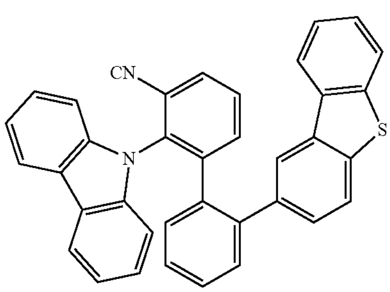
242
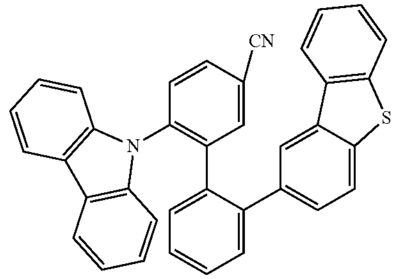
243
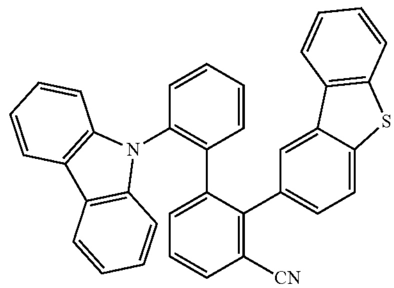
244
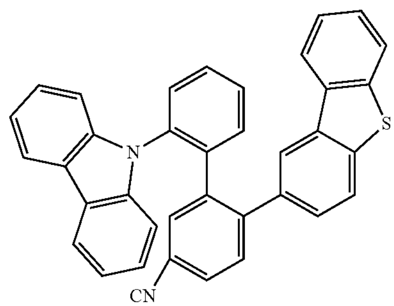
245
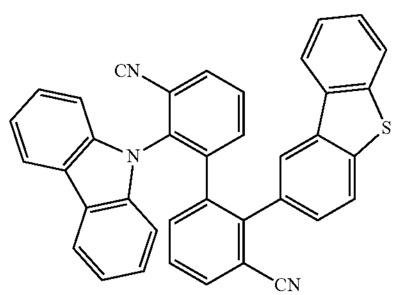
246
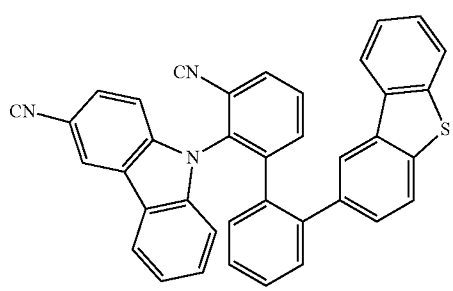

-continued
247
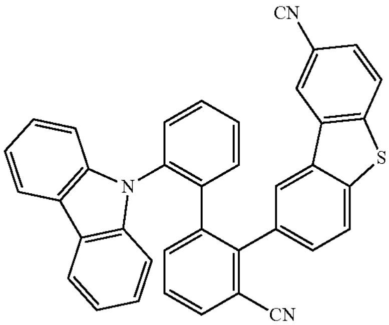
248
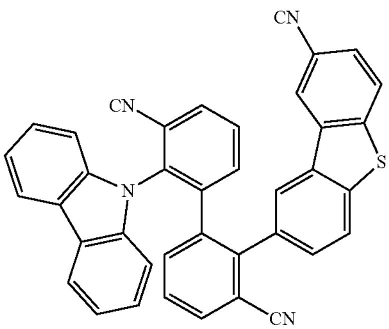
249
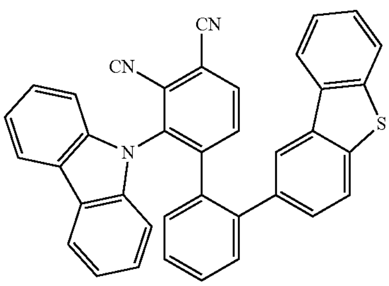
250
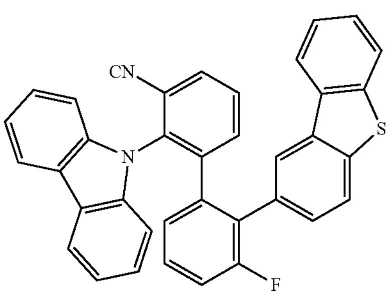
251
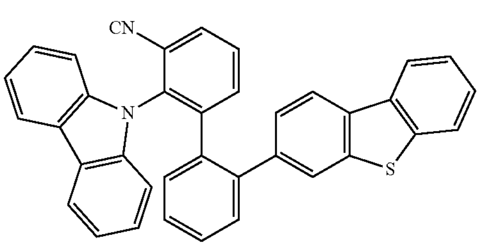
-continued
252
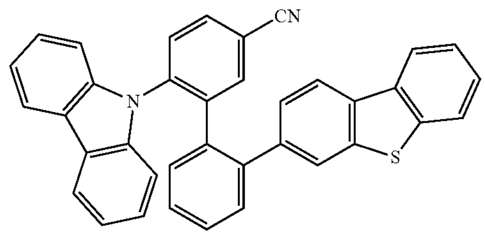
253
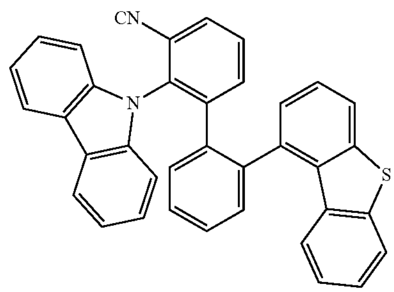
254
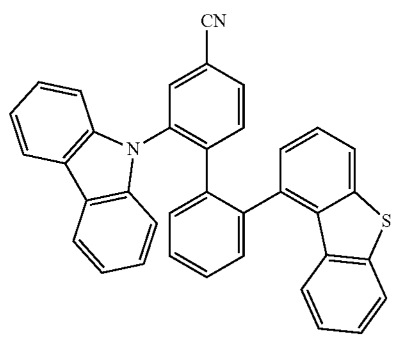
255
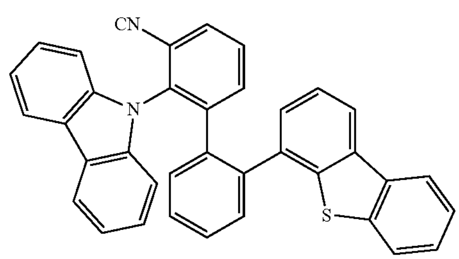
256
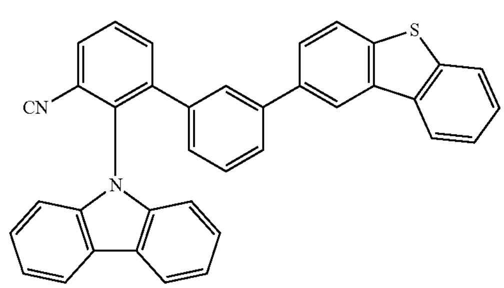

-continued
257
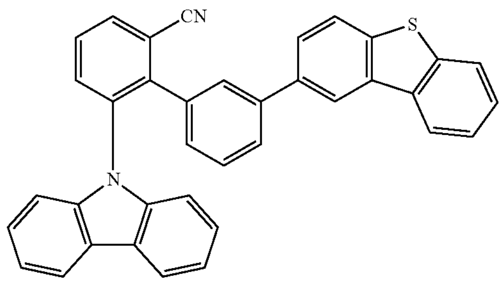
258
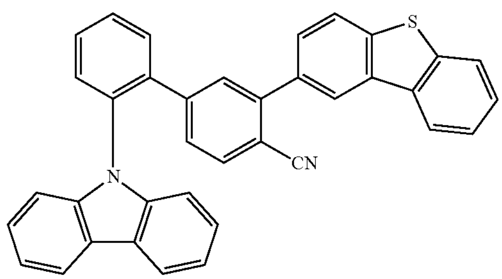
259
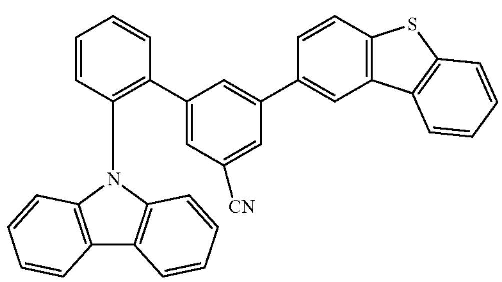
260
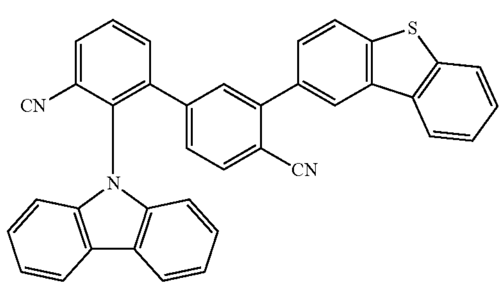
261
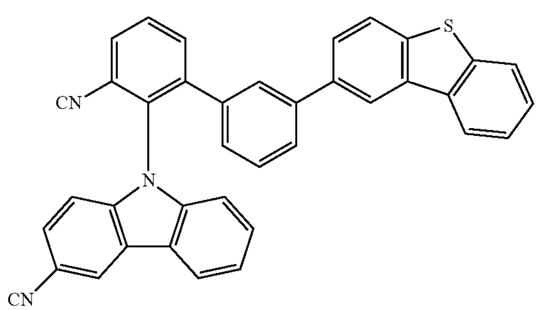
-continued
262
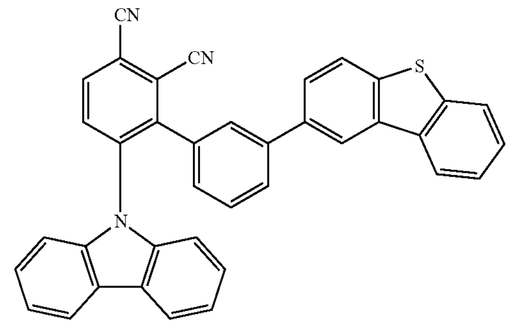
263
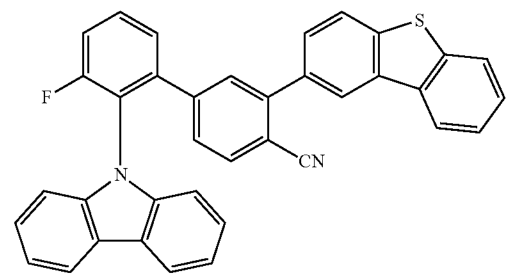
264
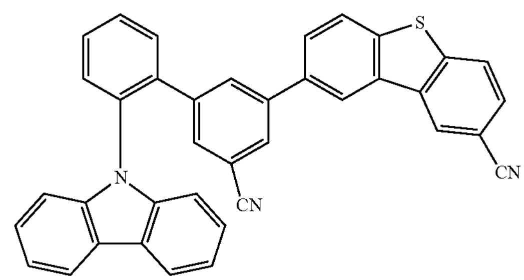
265
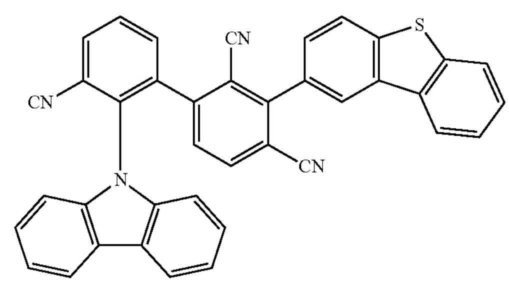
266
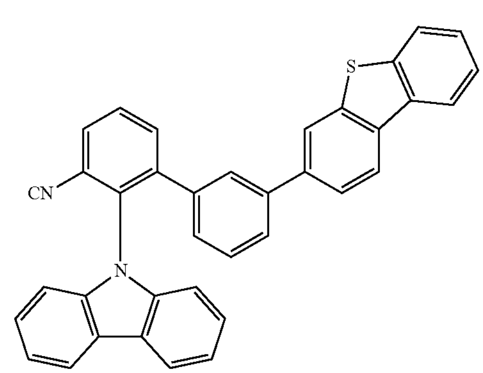

-continued
267
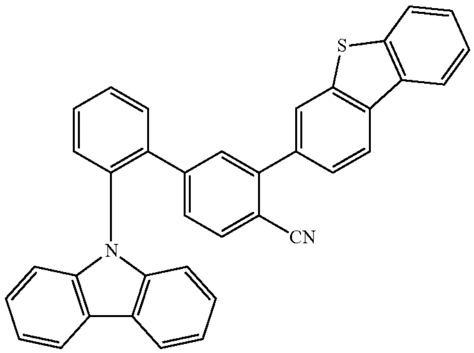
268
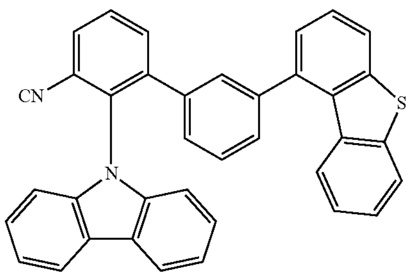
269
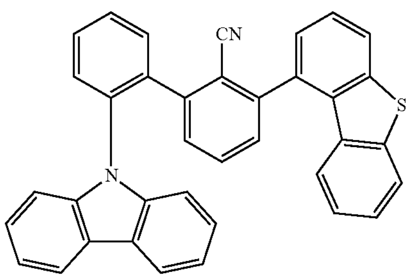
270
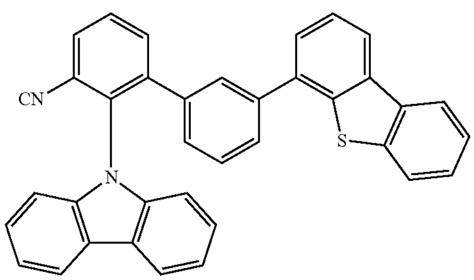
271
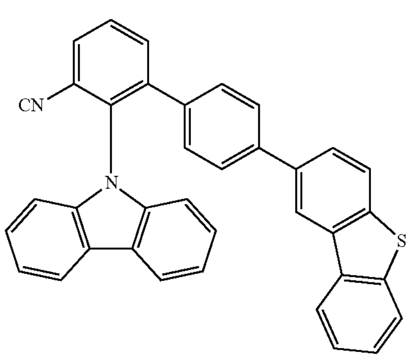
-continued
272
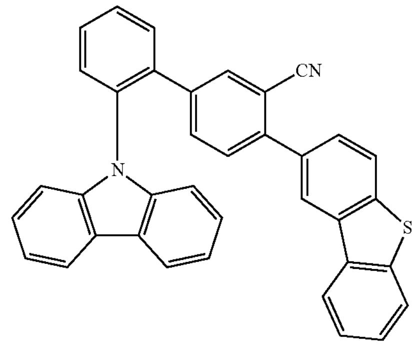
273
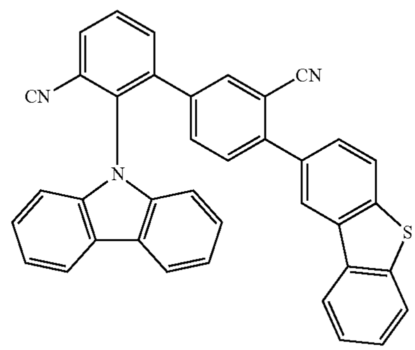
274
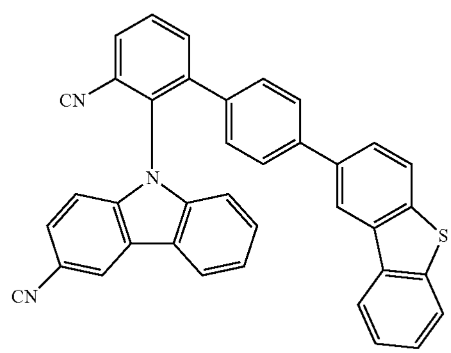
275
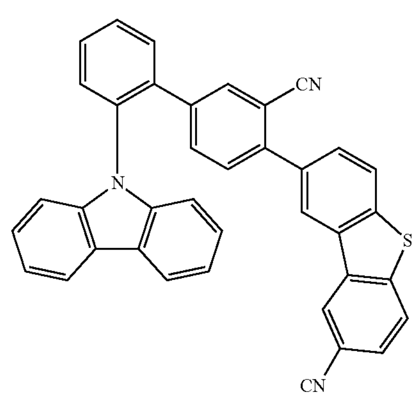

-continued
276
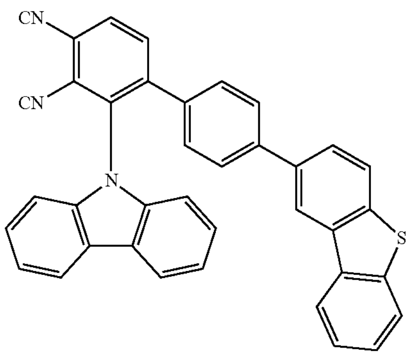
277
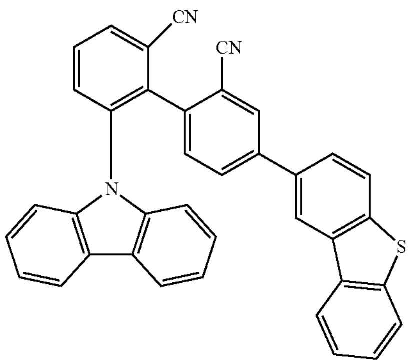
278
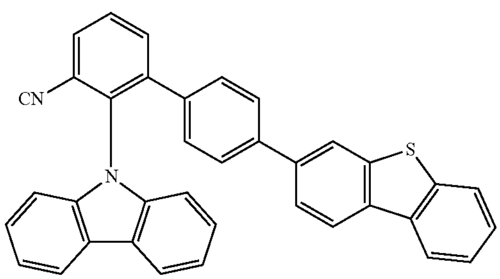
279
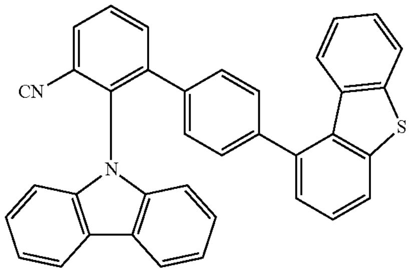
280
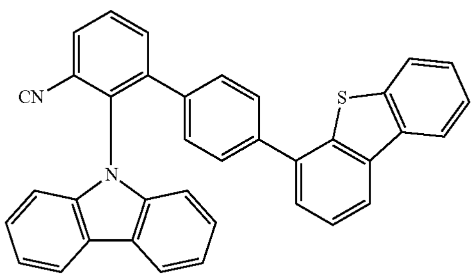
-continued
281
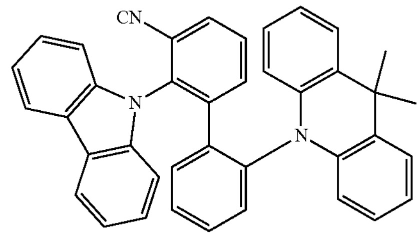
282
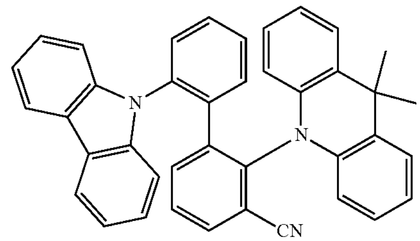
283
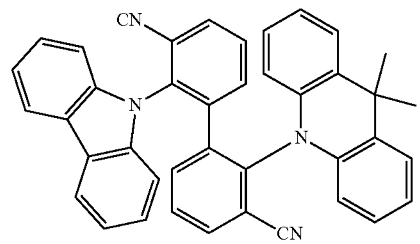
284
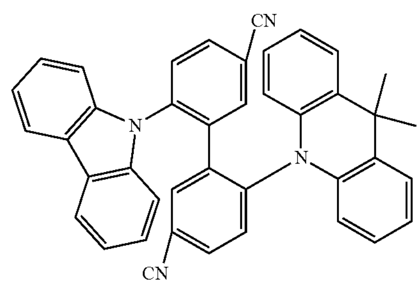
285
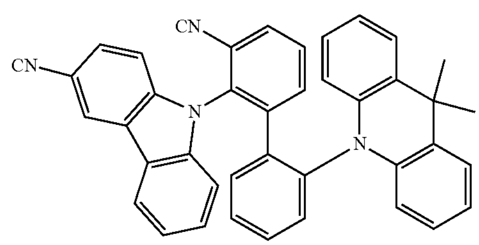
286
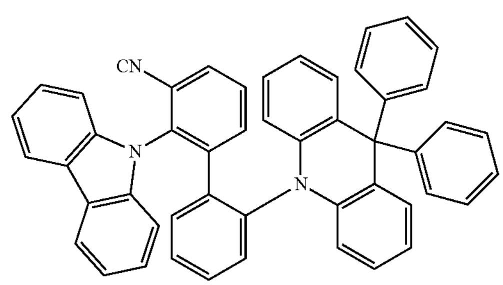

-continued
287
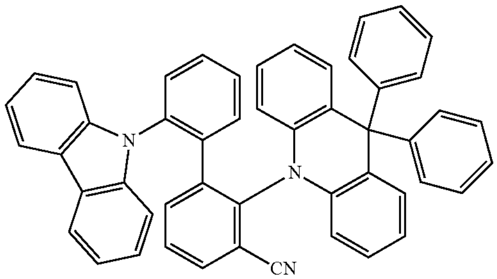
288
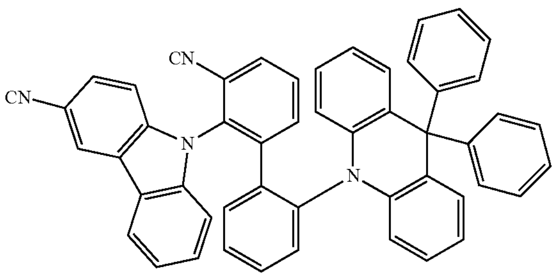
289
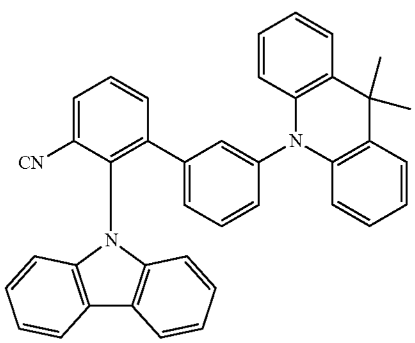
290
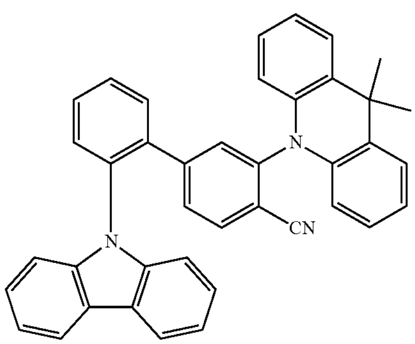
291
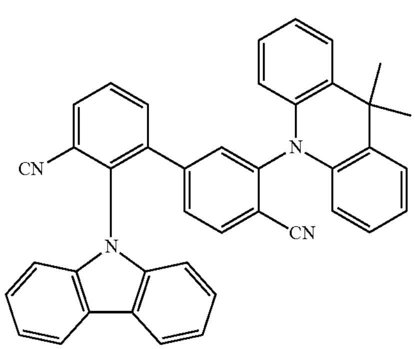
-continued
292
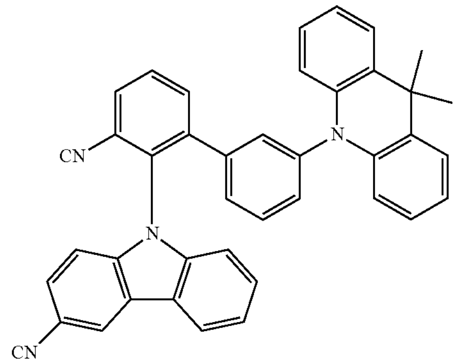
293
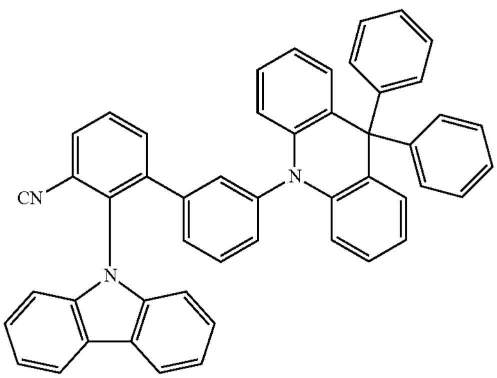
294
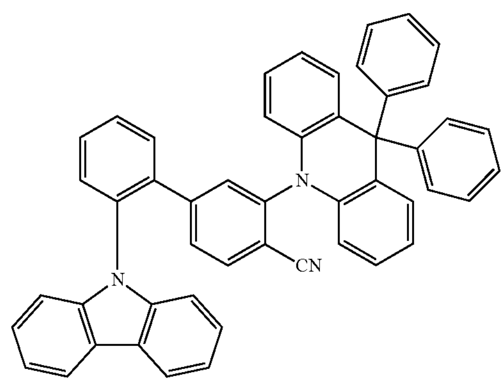
295
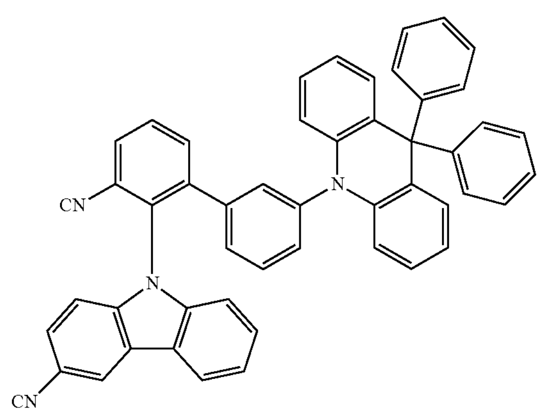

-continued
296
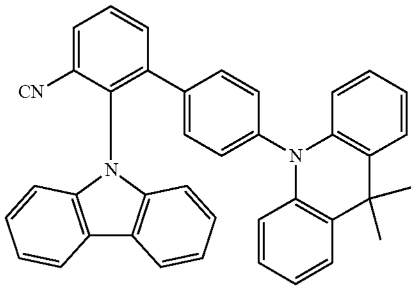
297
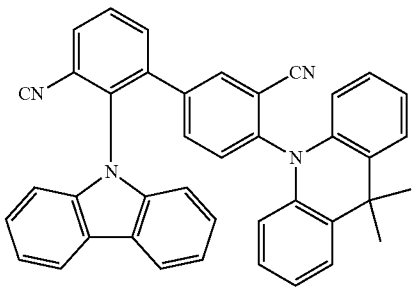
298
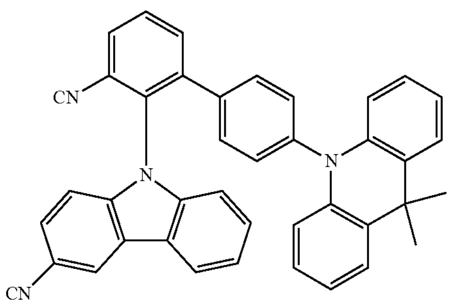
299
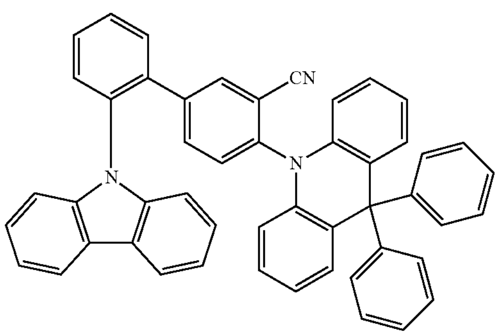
300
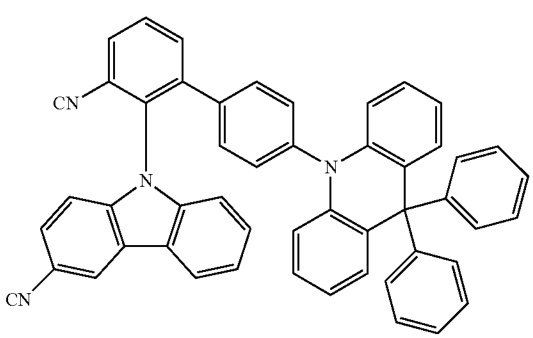
-continued
301
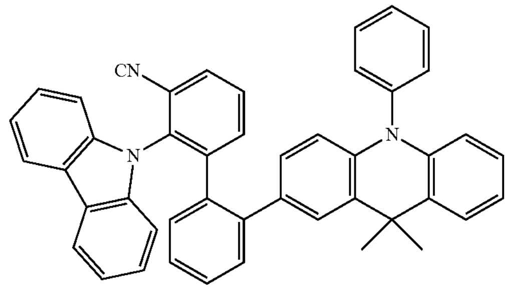
302
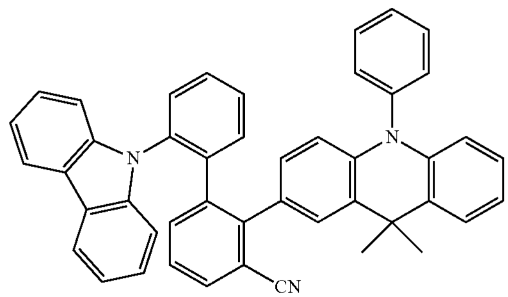
303
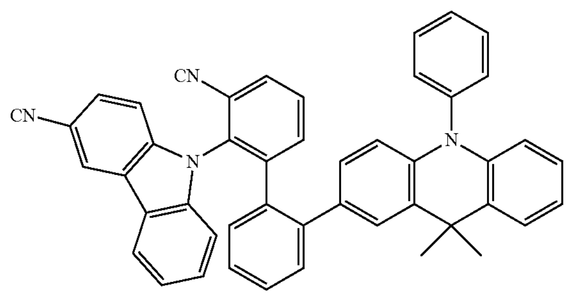
304
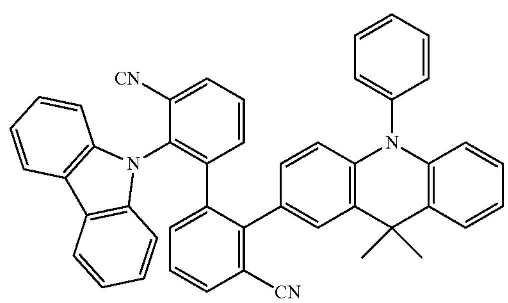
305
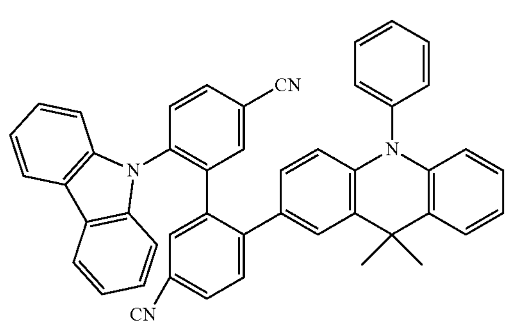

-continued
306
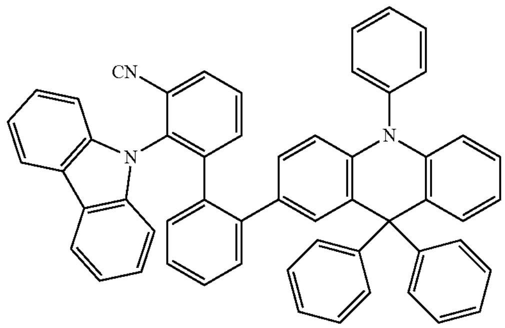
307
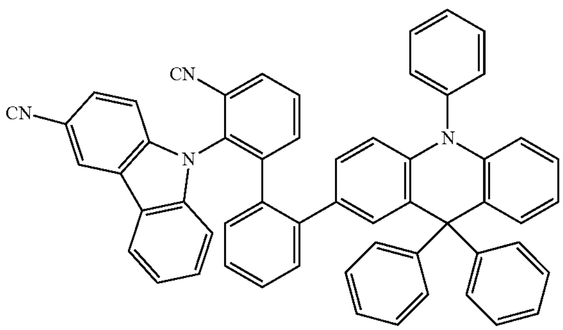
308
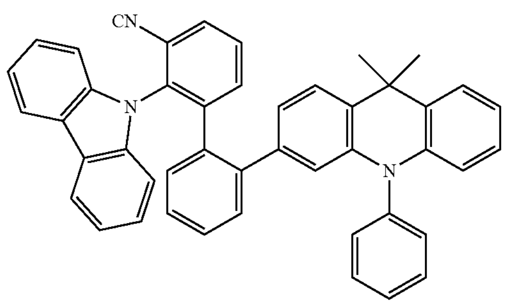
309
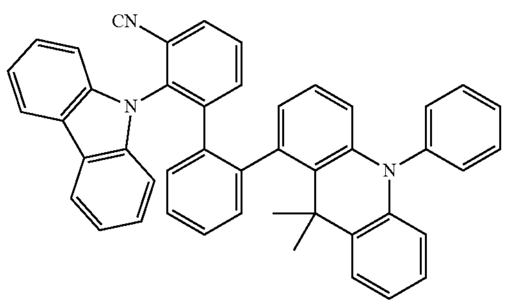
310
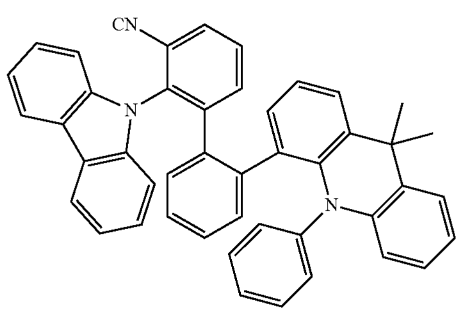
-continued
311
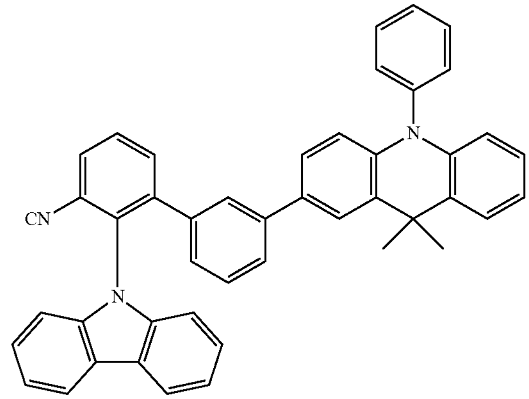
312
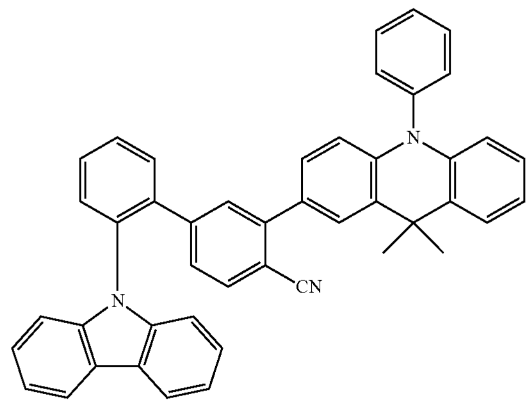
313
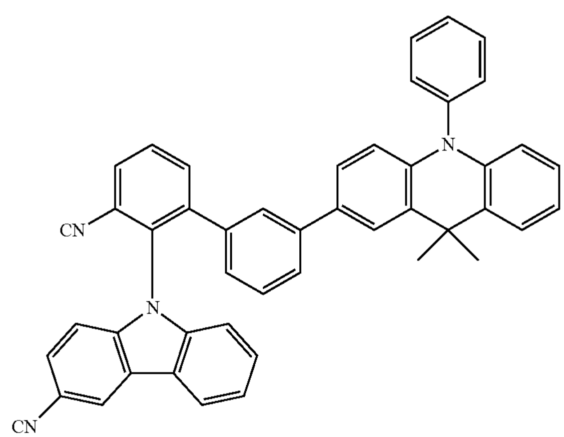

-continued
314
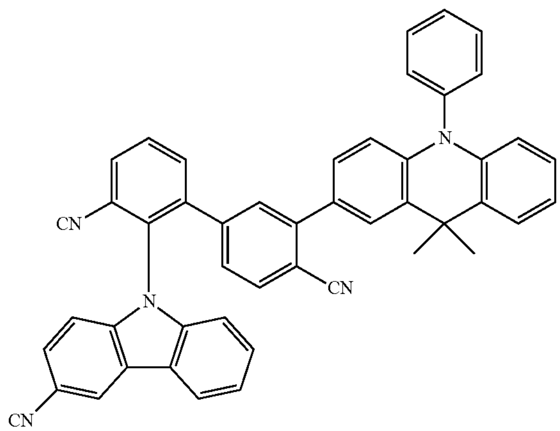
315
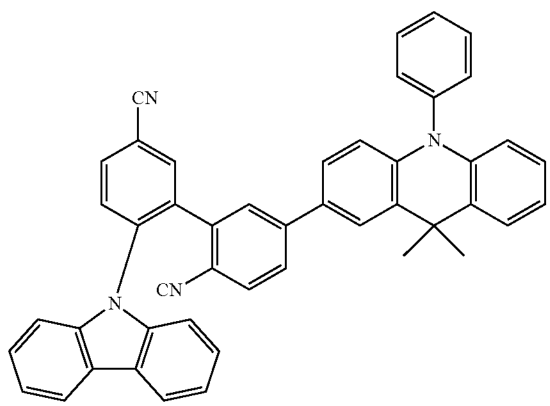
316
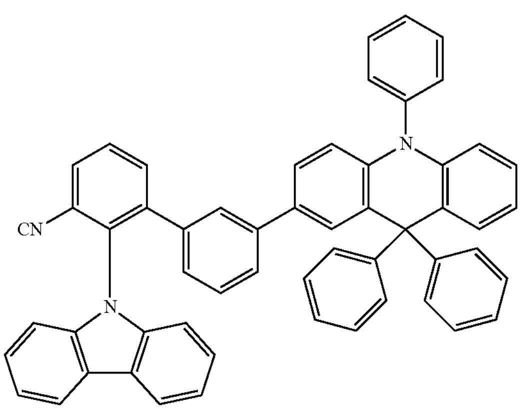
-continued
317
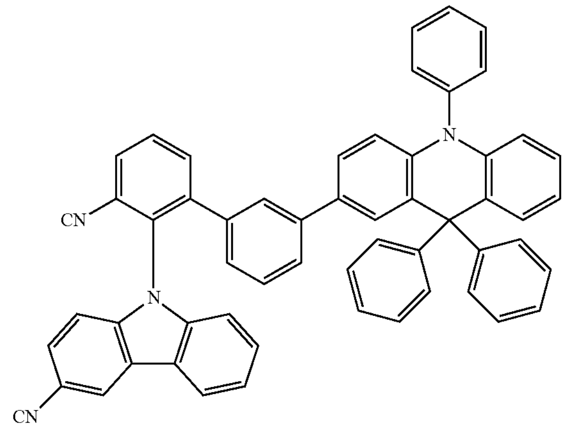
318
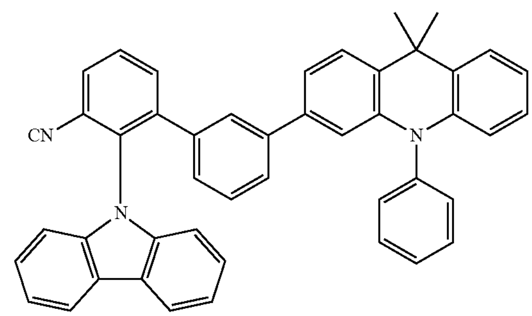
319
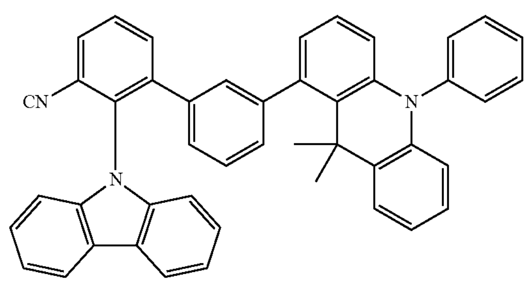
320
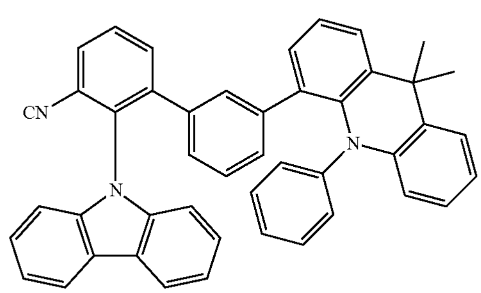

-continued
321
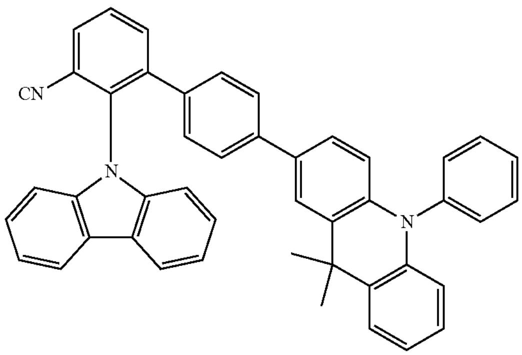
322
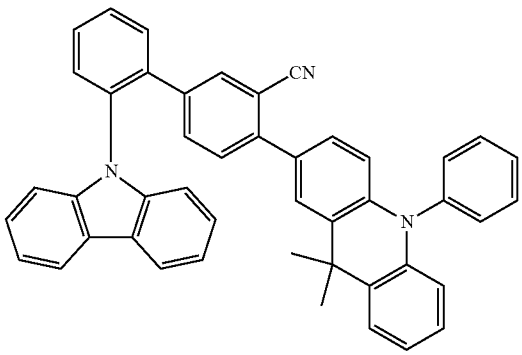
323
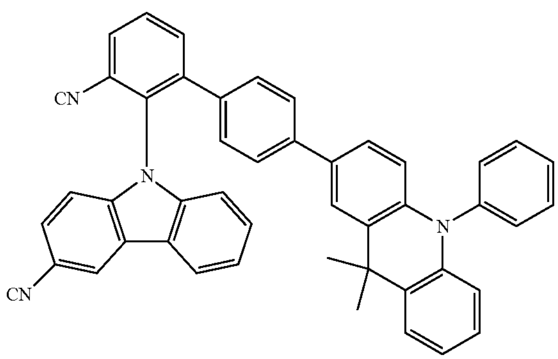
324
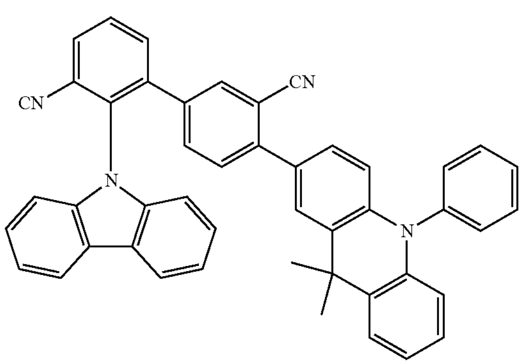
-continued
325
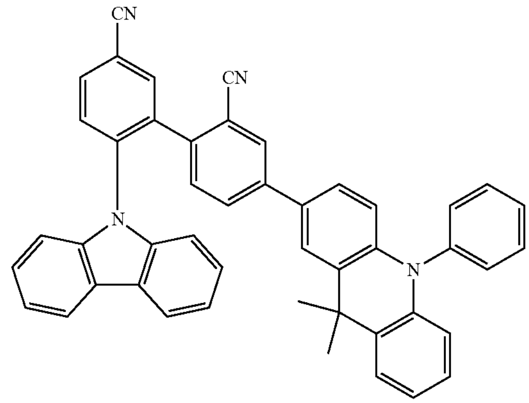
326
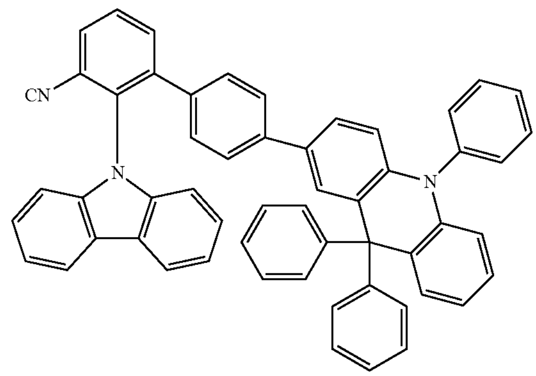
327
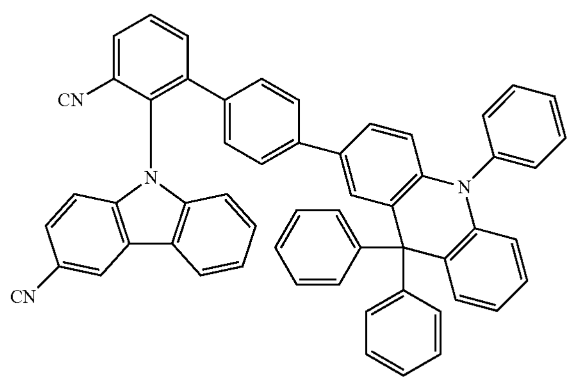
328
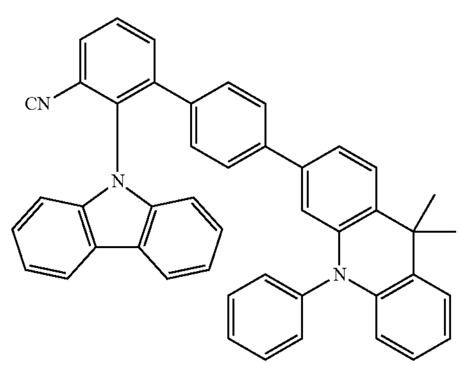

-continued
329
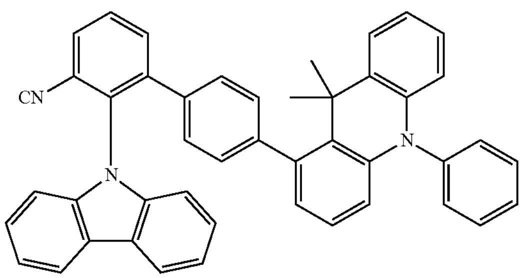
330
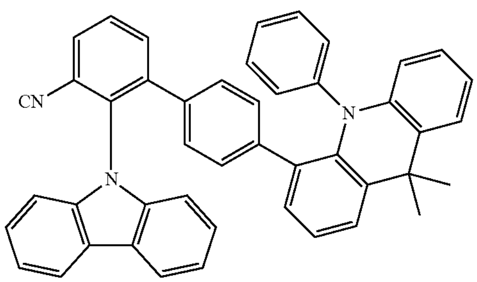
<u>Group HE7</u>
1
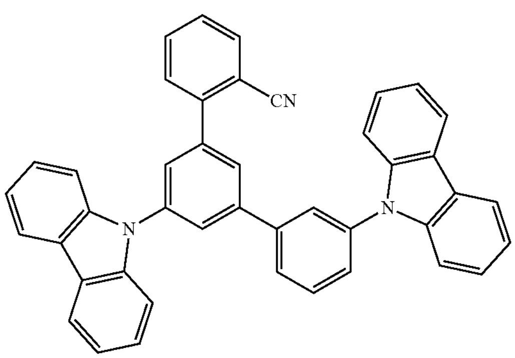
2
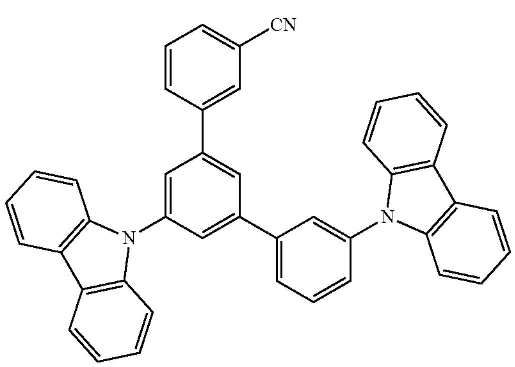
-continued
3
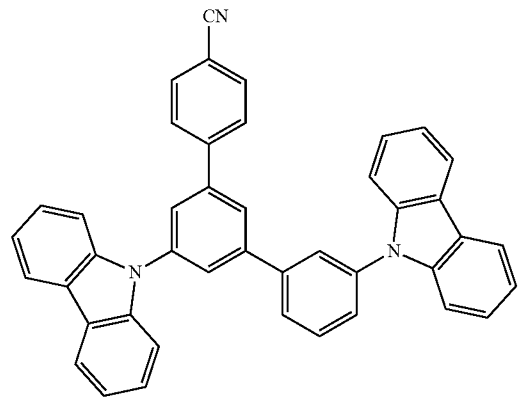
4
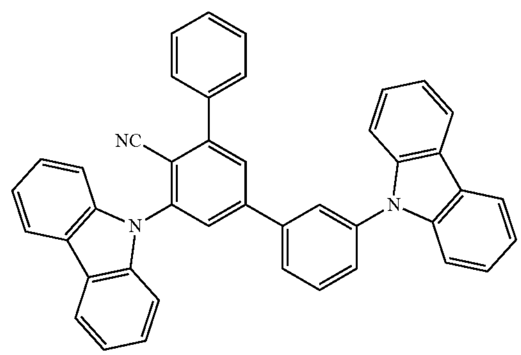
5
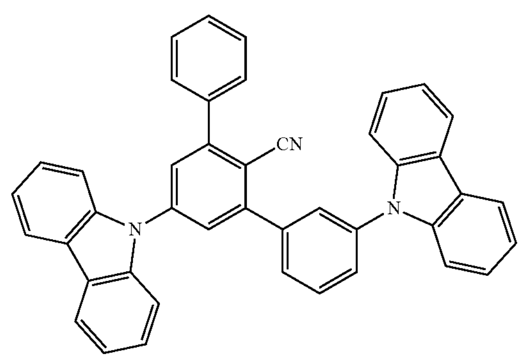
6
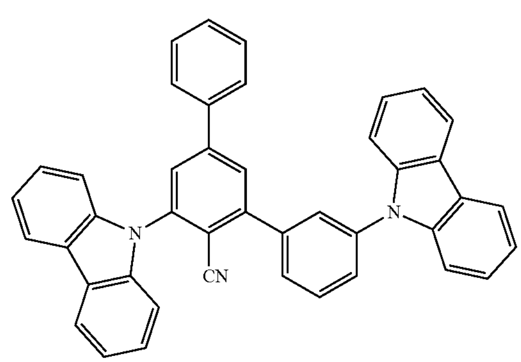

-continued
7
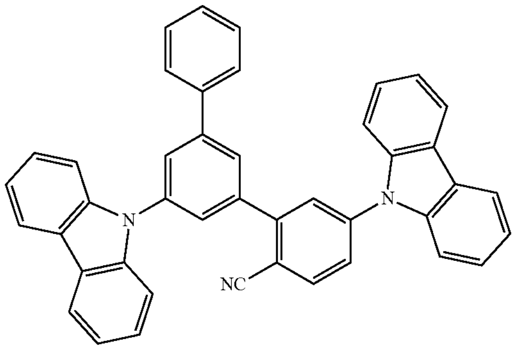
8
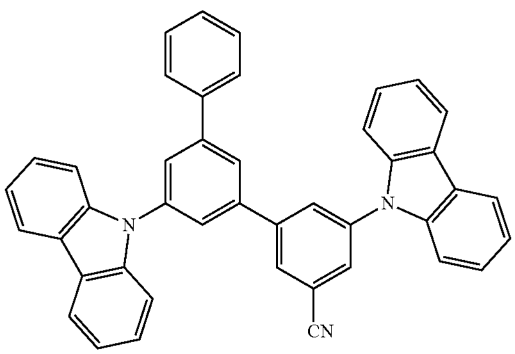
9
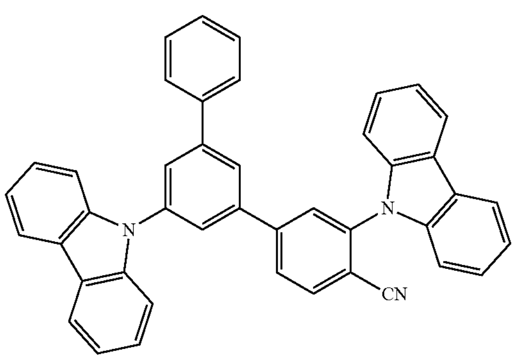
10
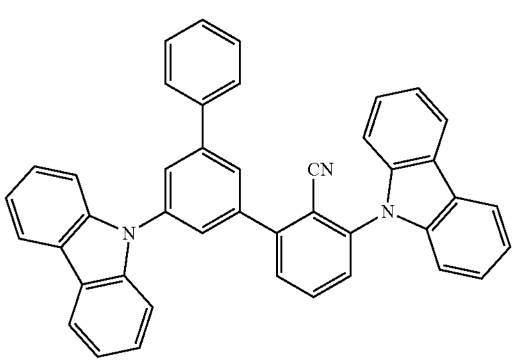
-continued
11
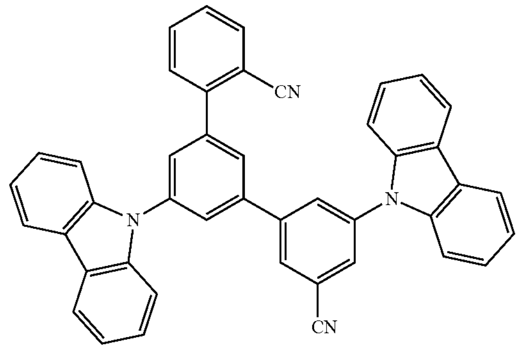
12
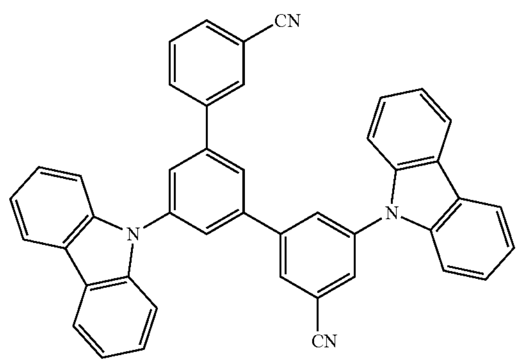
13
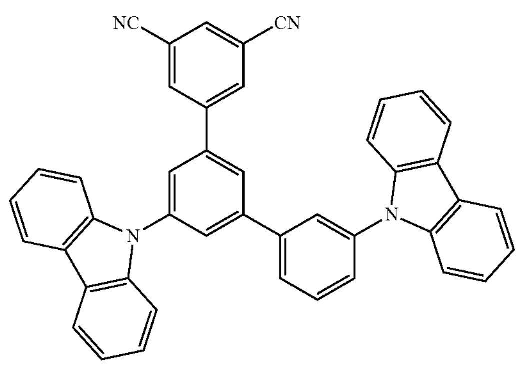
14
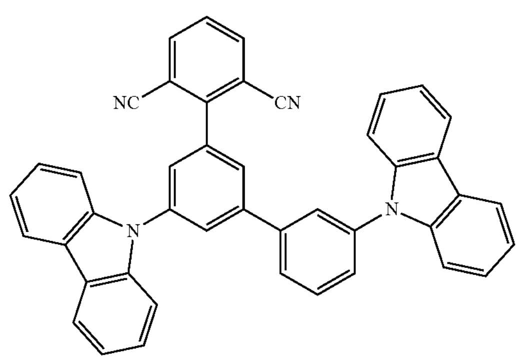

15
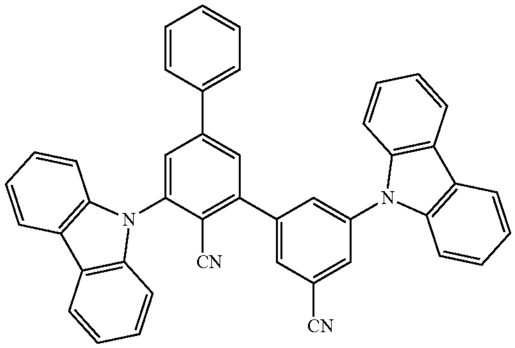
16
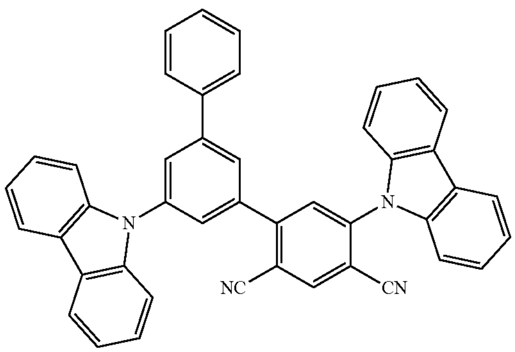
17
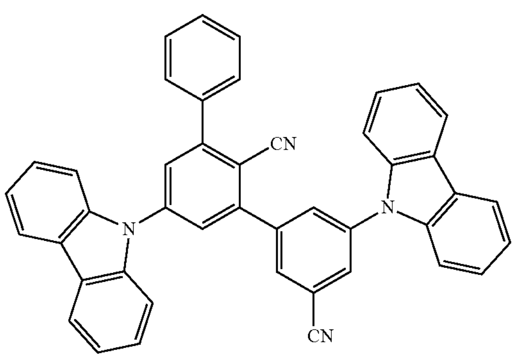
18
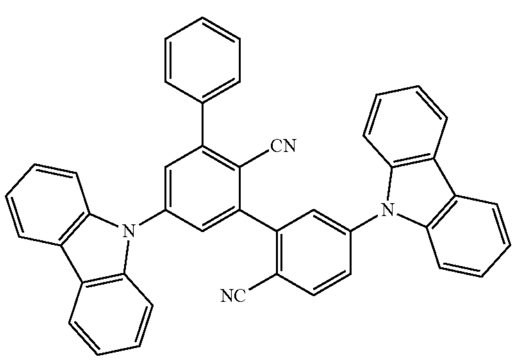
19
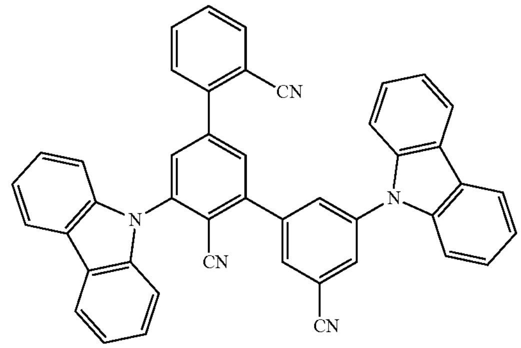
20
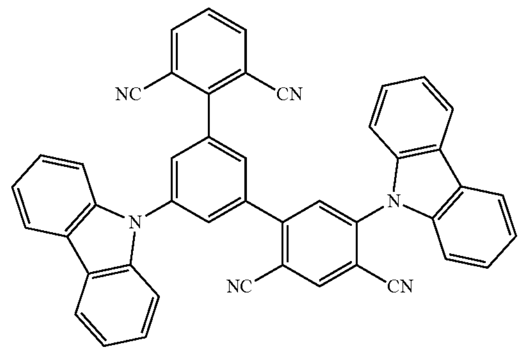
21
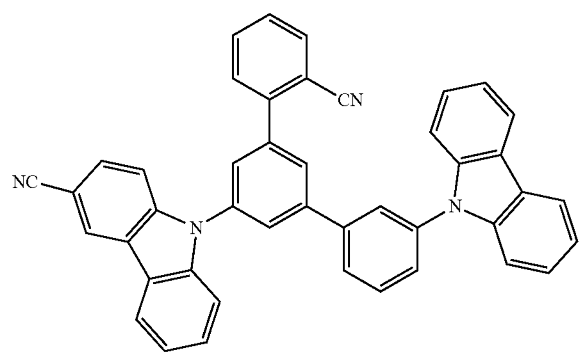
22
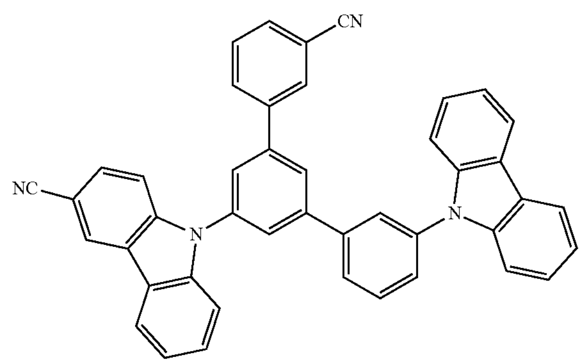

-continued
23
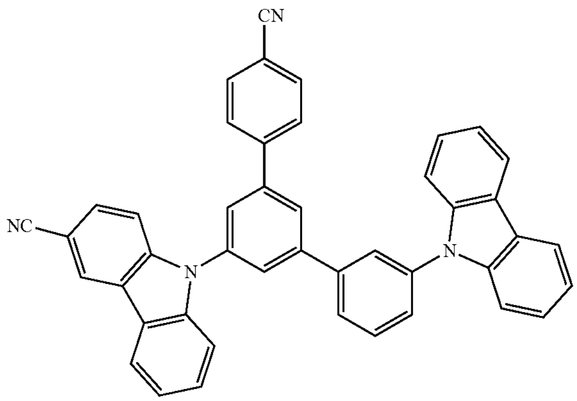
24
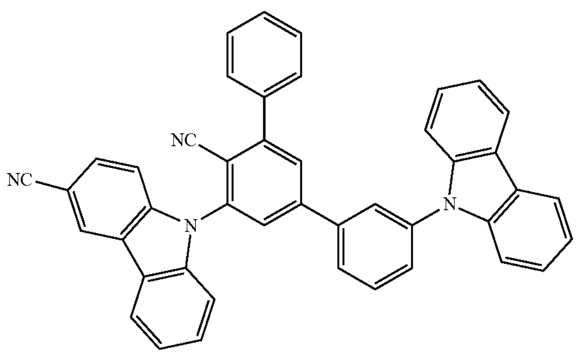
25
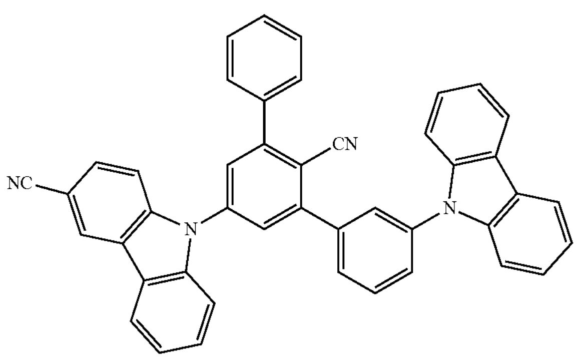
26
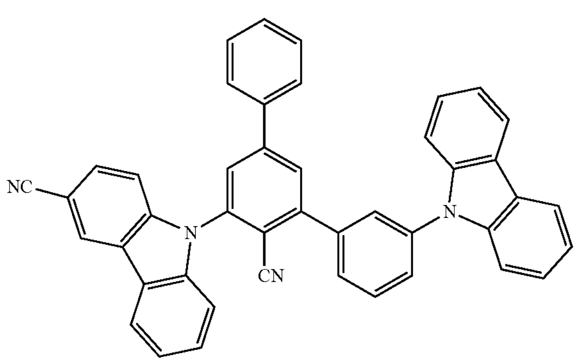
-continued
27
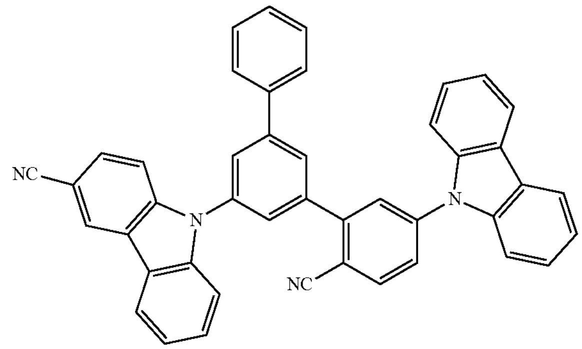
28
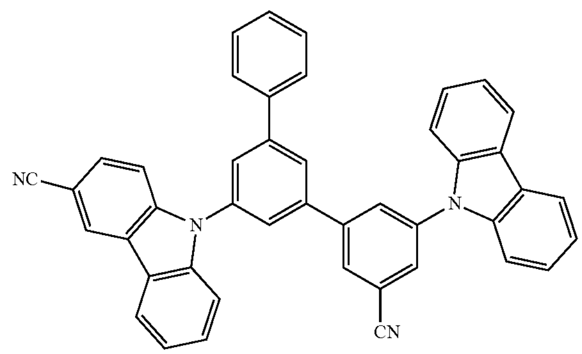
29
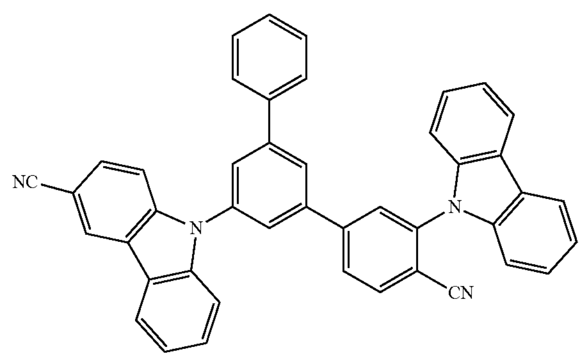
30
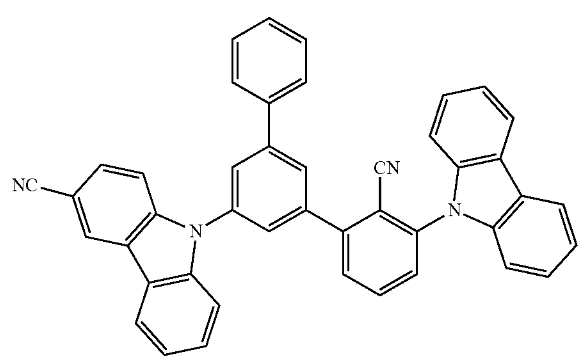

-continued
31
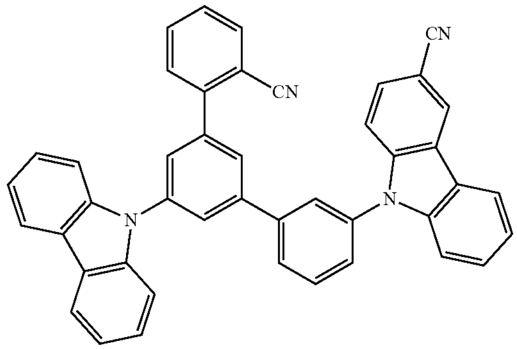
32
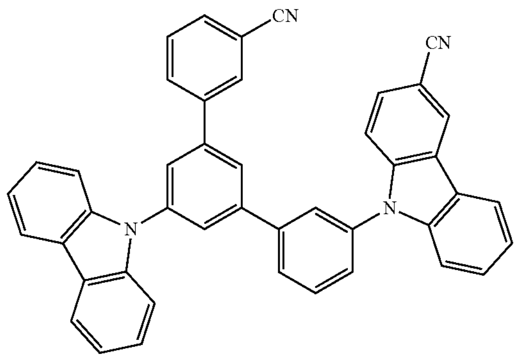
33
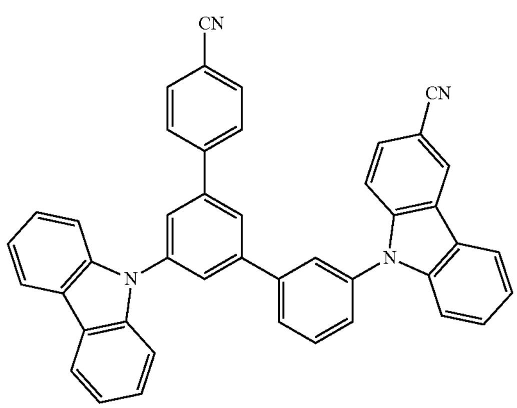
34
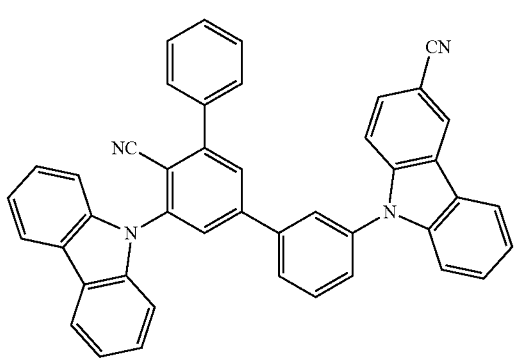
-continued
35
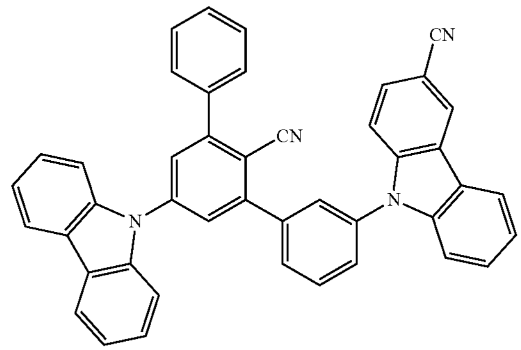
36
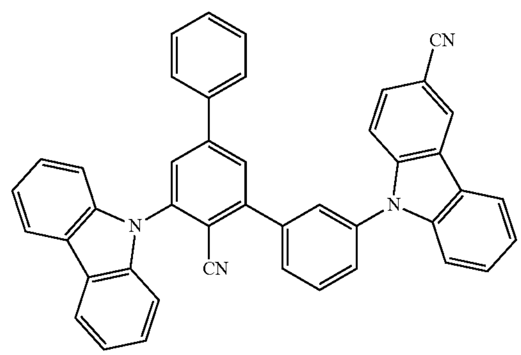
37
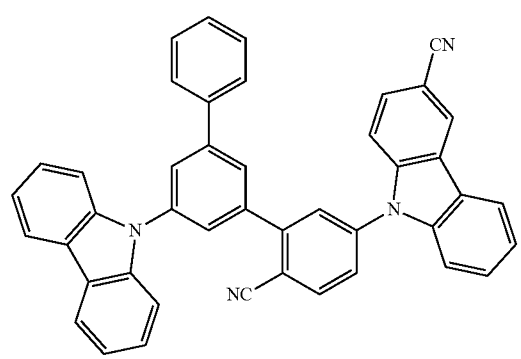
38
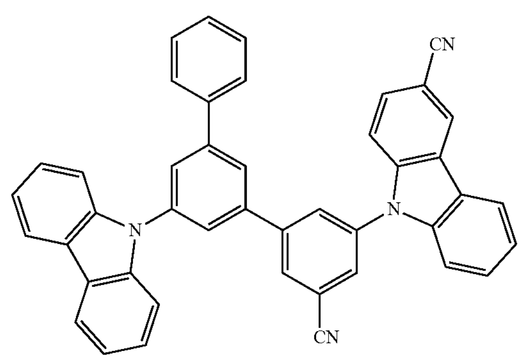

-continued
39
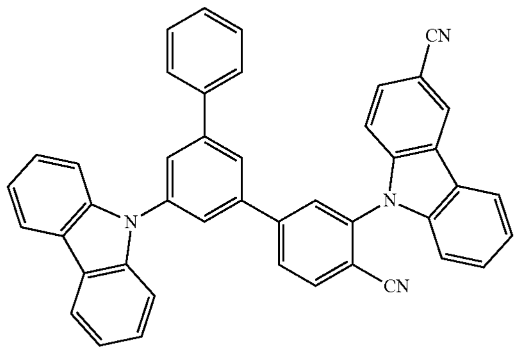
40
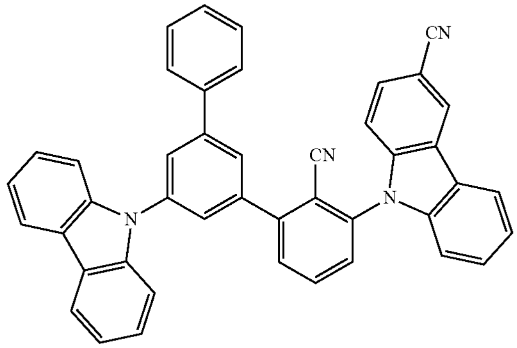
41
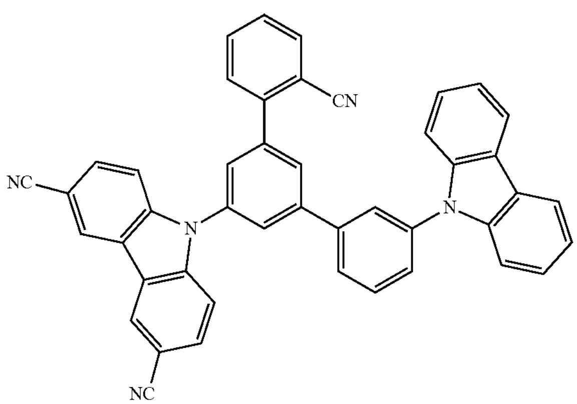
42
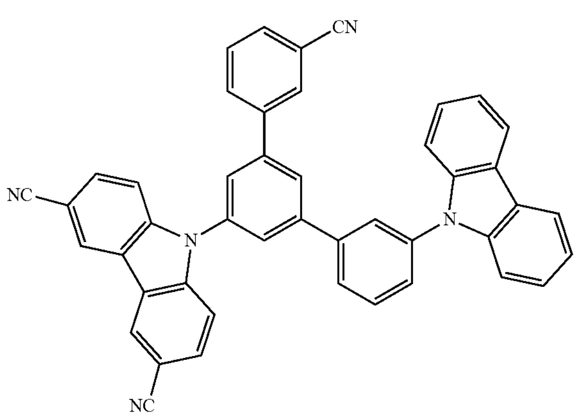
-continued
43
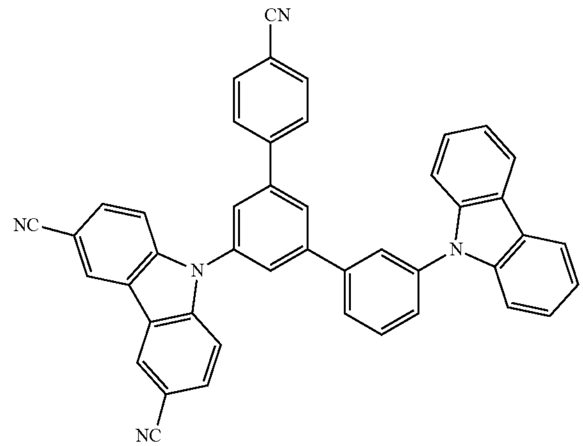
44
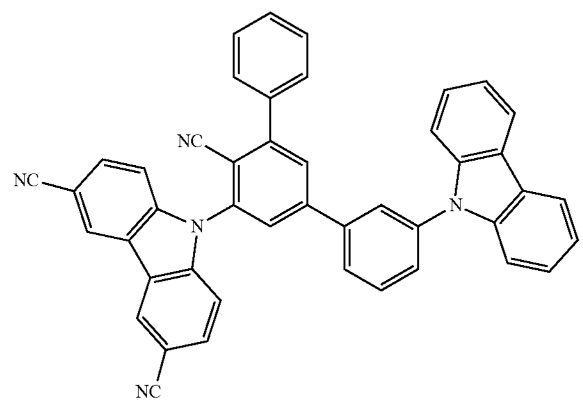
45
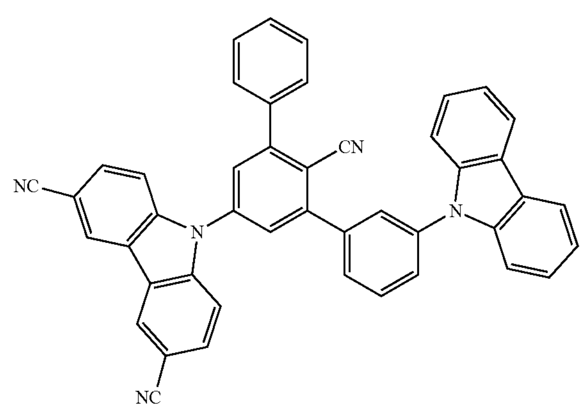

46
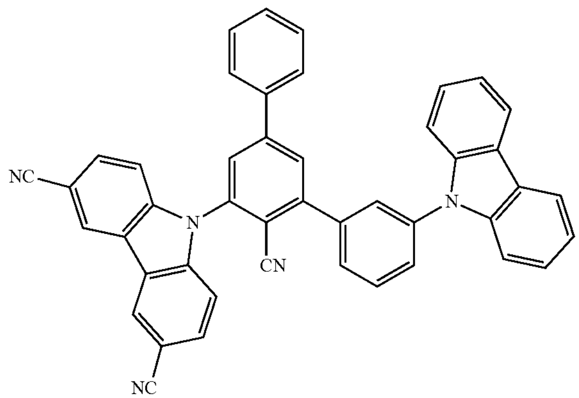
47
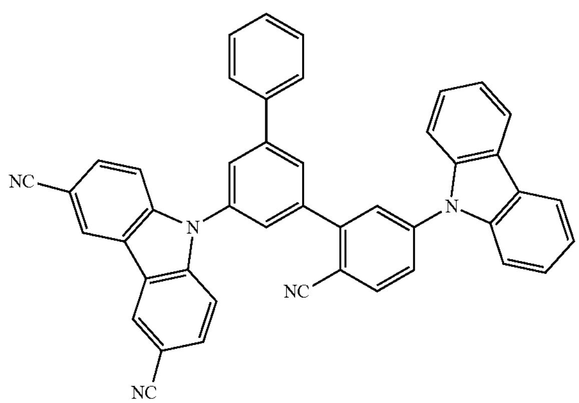
48
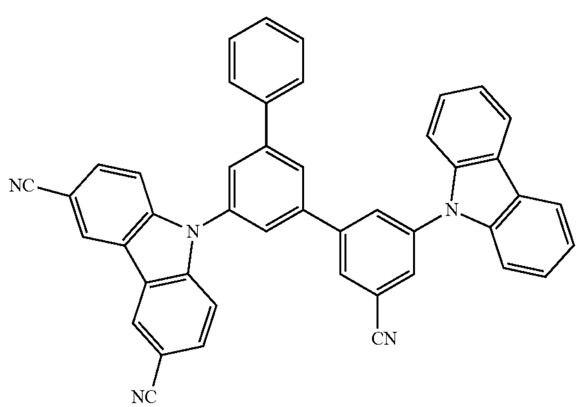
49
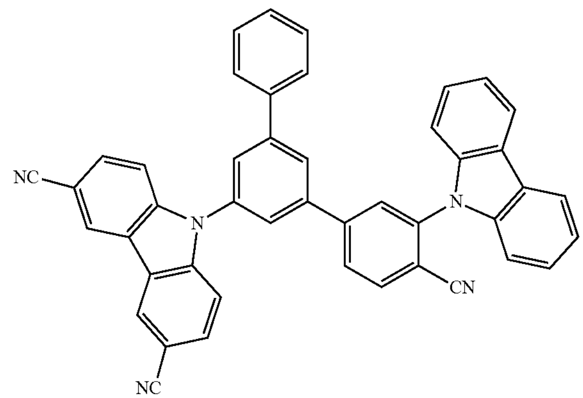
50
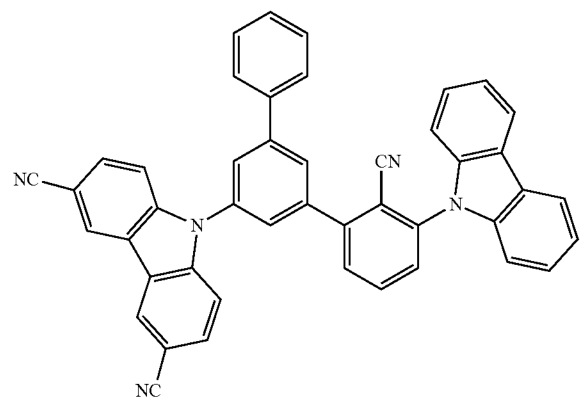
51
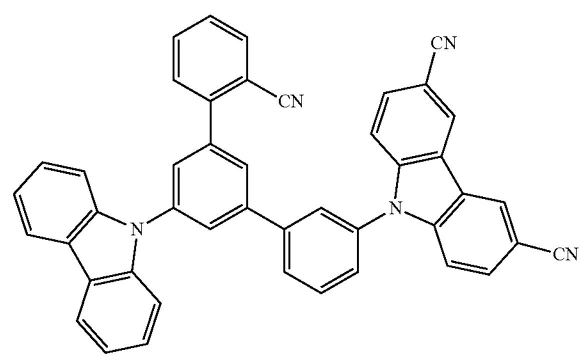
52
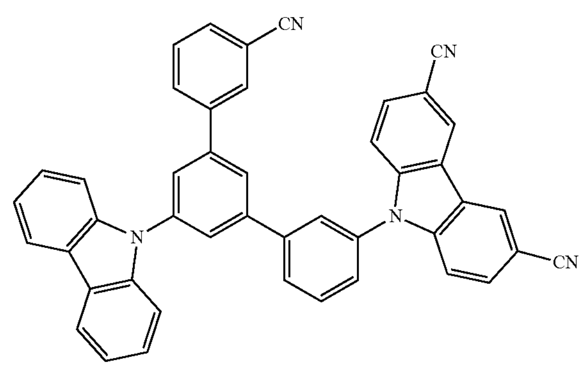

-continued
53
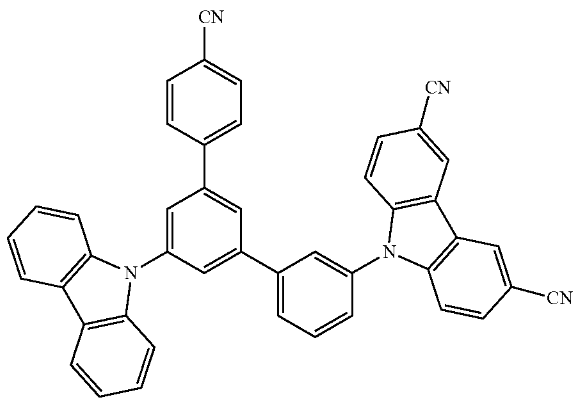
54
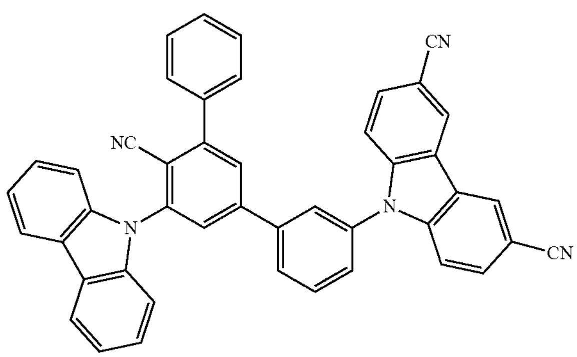
55
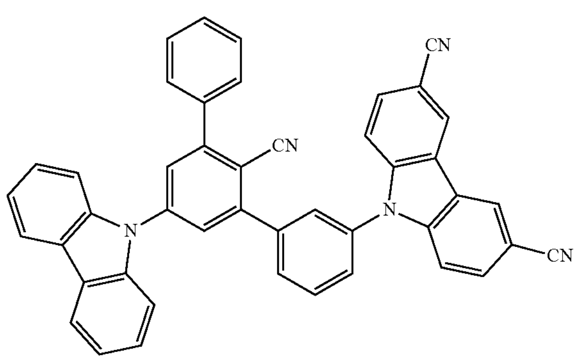
56
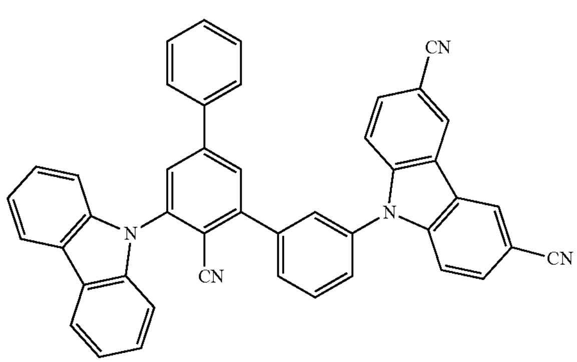
-continued
57
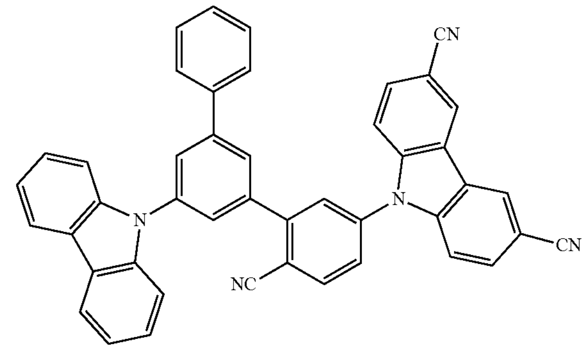
58
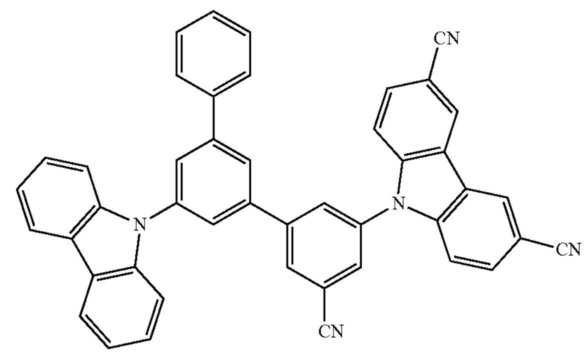
59
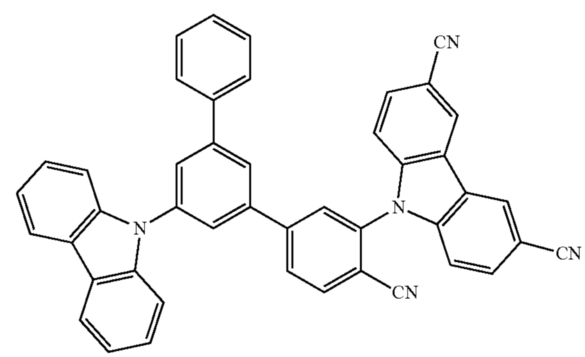
60
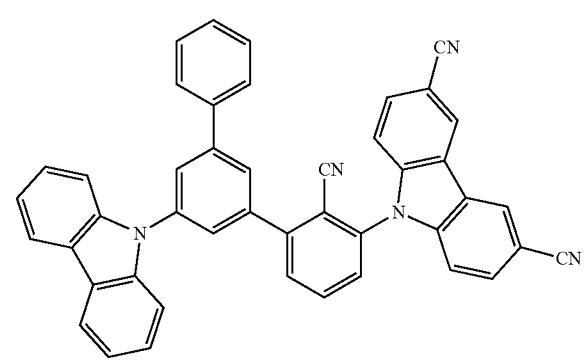

61
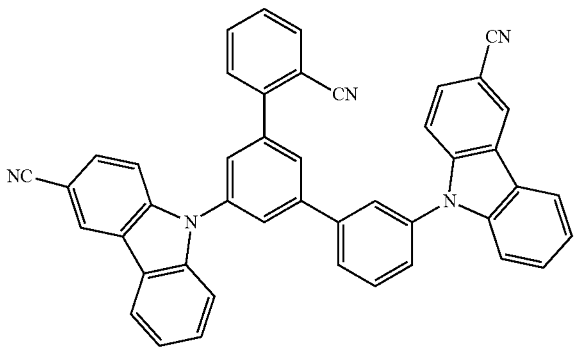
62
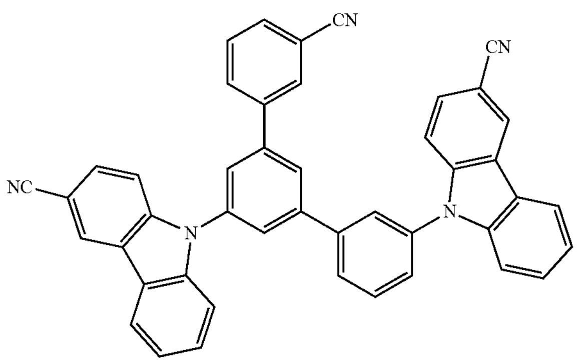
63
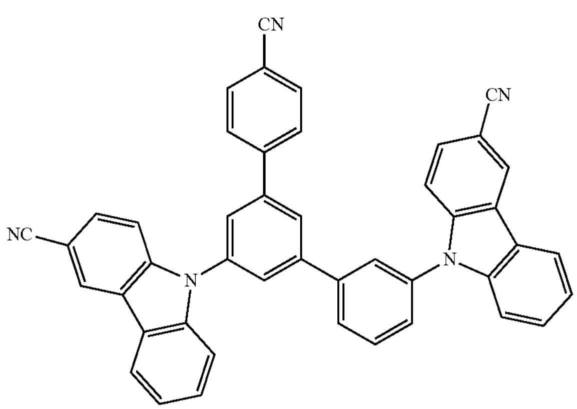
64
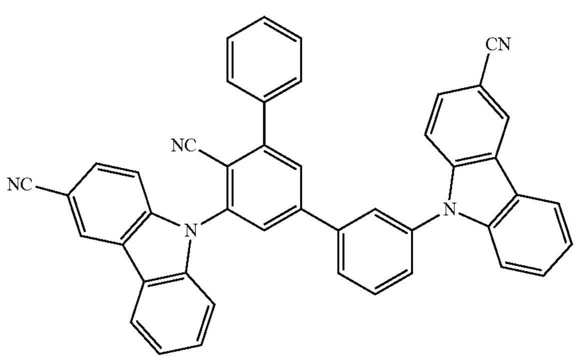
65
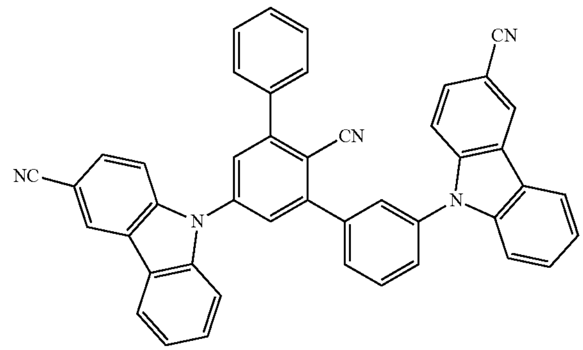
66
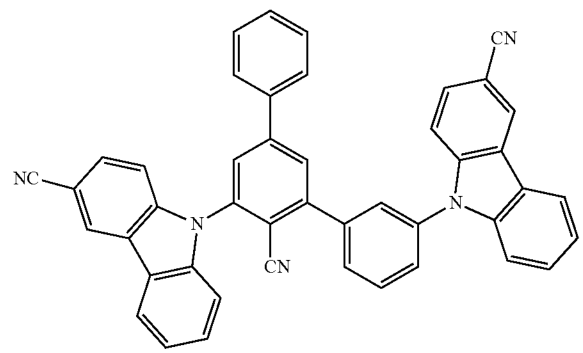
67
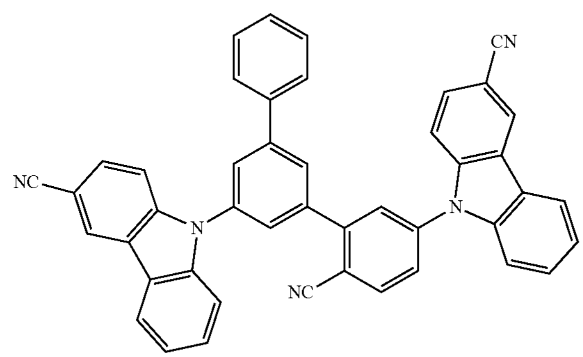
68
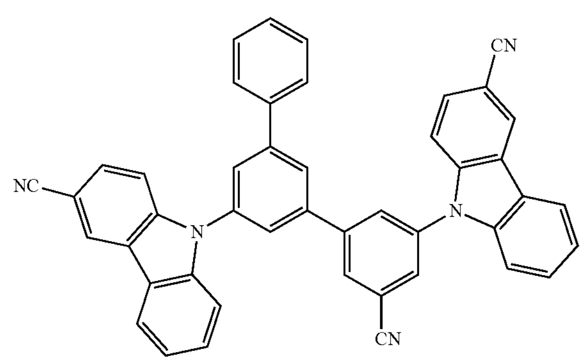

-continued
69
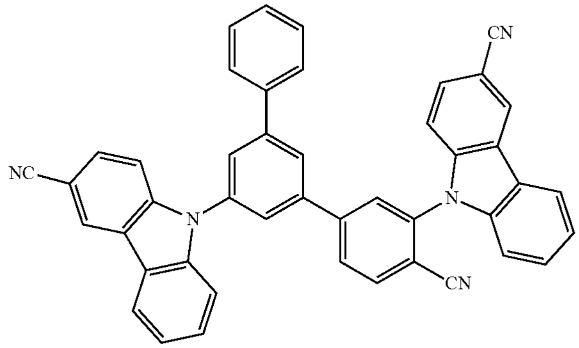
70
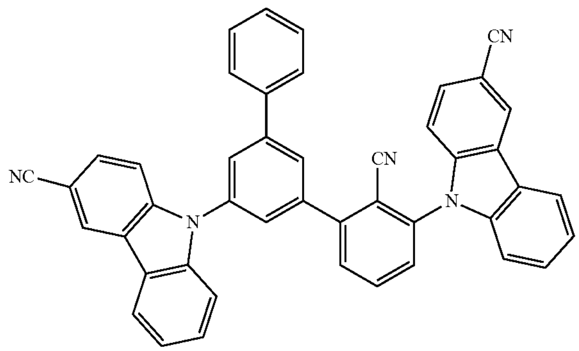
71
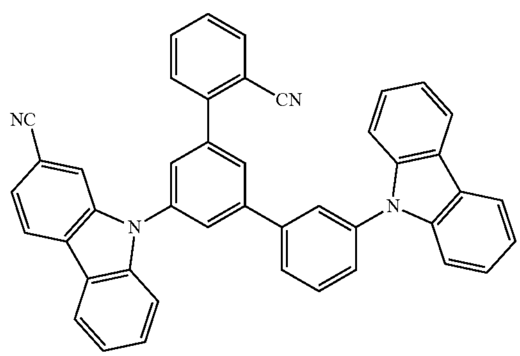
72
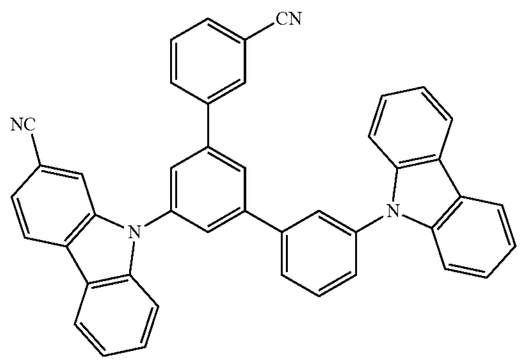
-continued
73
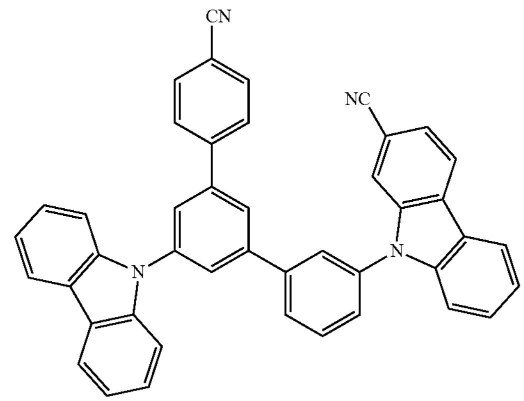
74
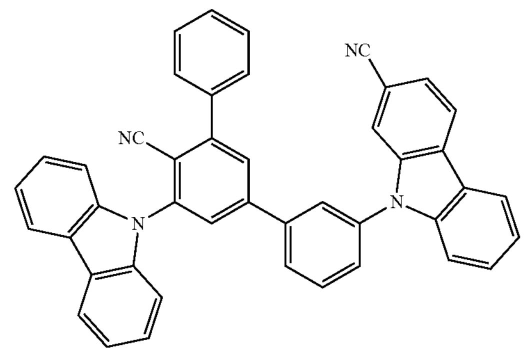
75
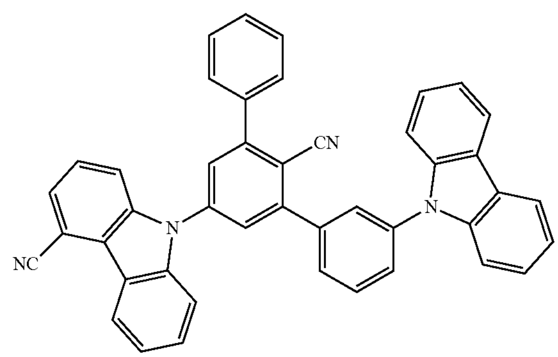
76
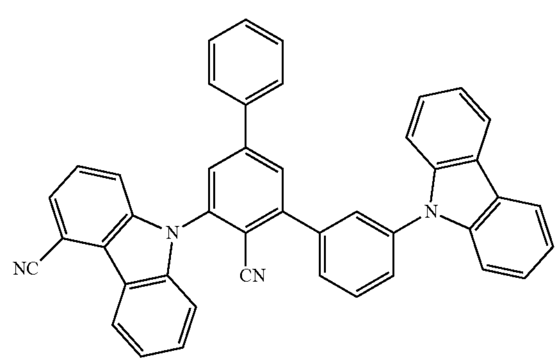

77
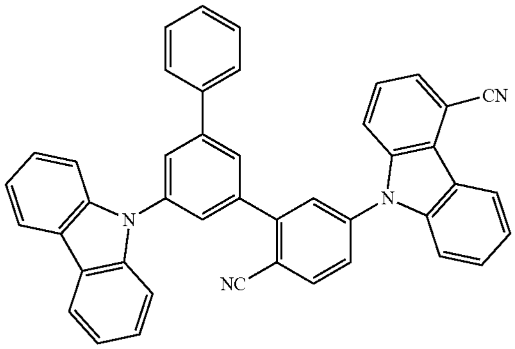
78
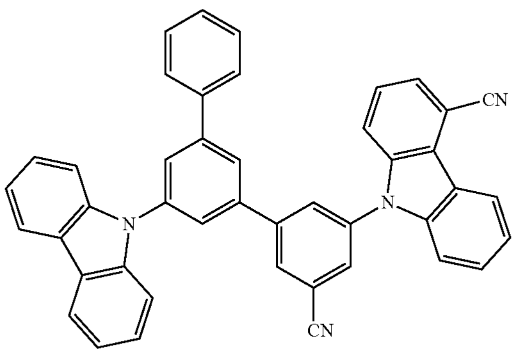
79
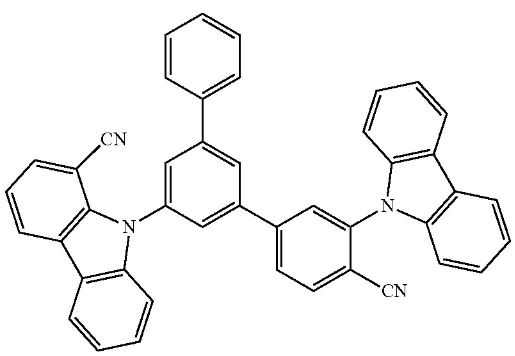
80
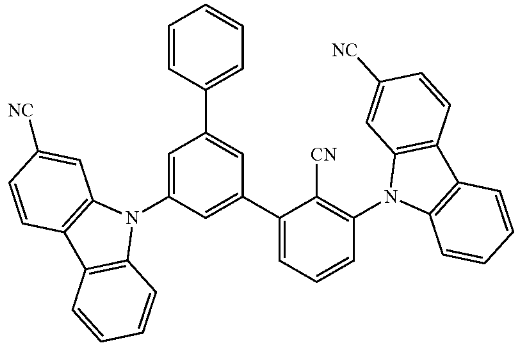
81
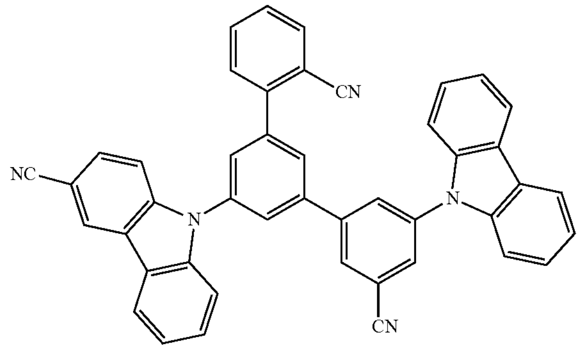
82
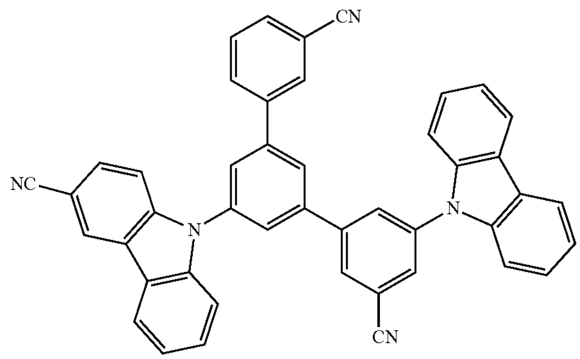
83
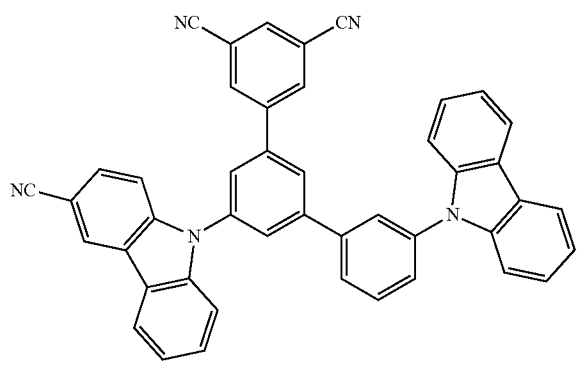
84
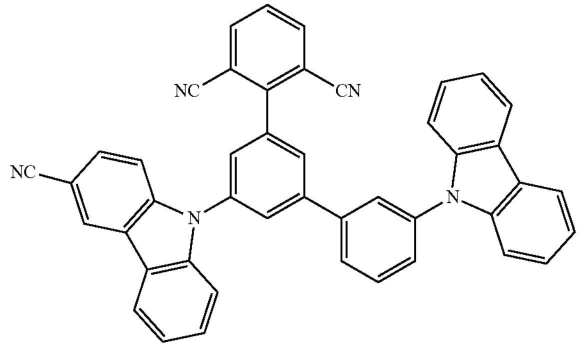

-continued
85
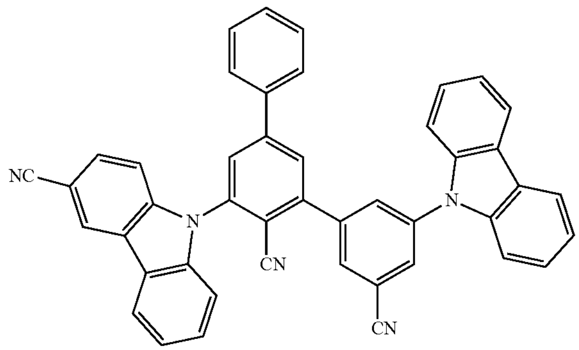
86
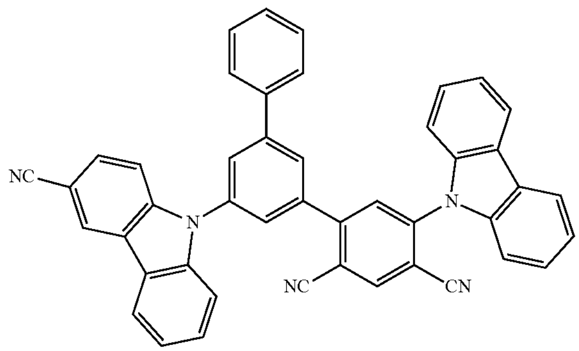
87
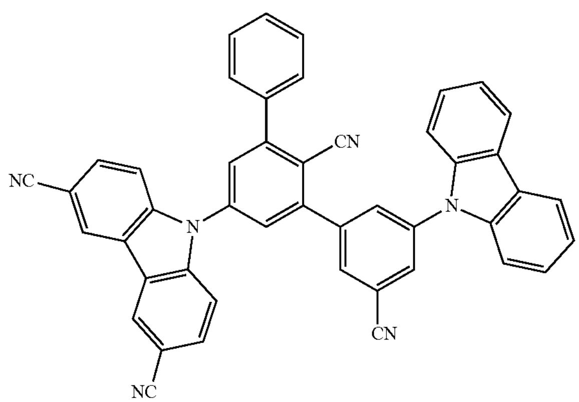
88
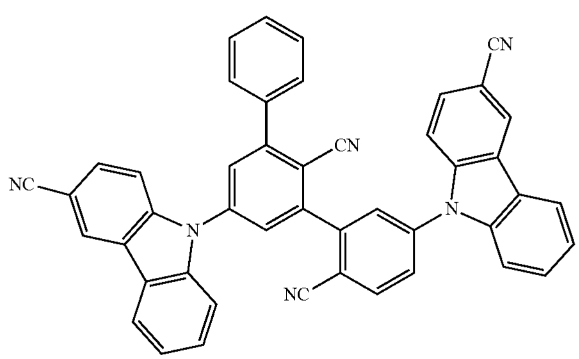
-continued
89
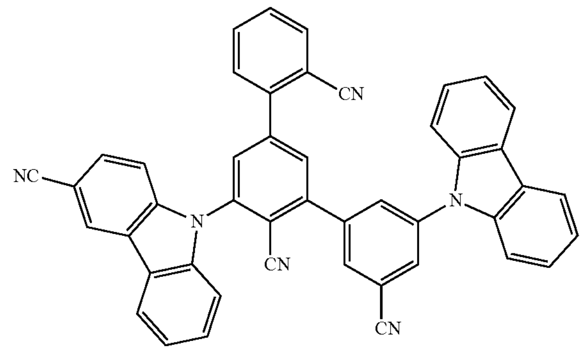
90
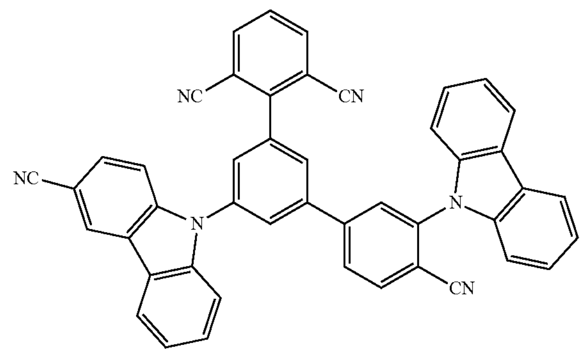
91
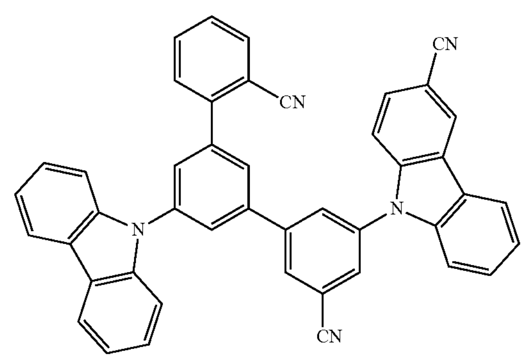
92
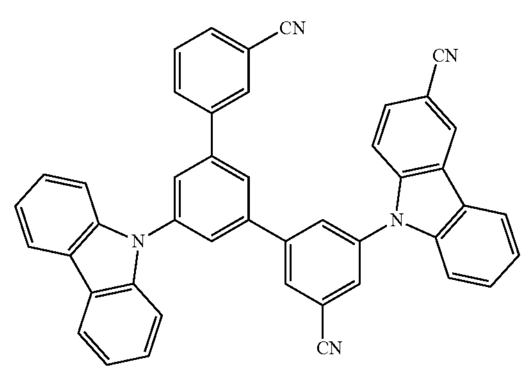

-continued
93
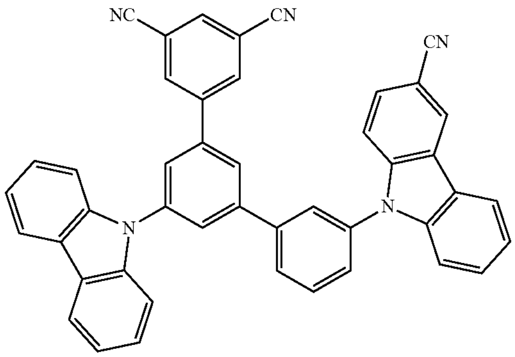
94
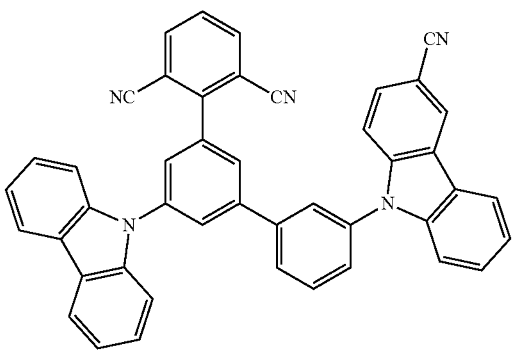
95
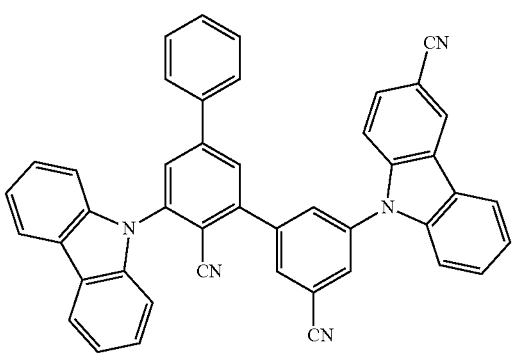
96
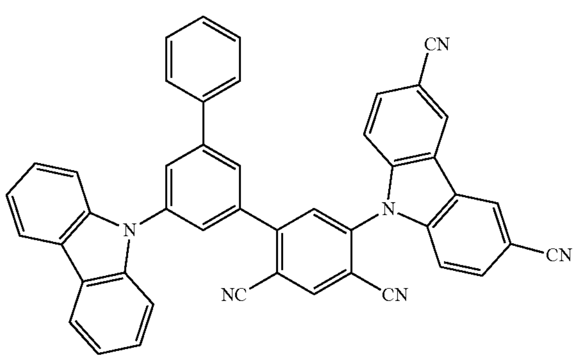
-continued
97
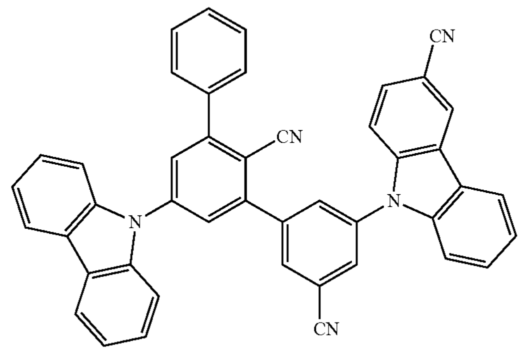
98
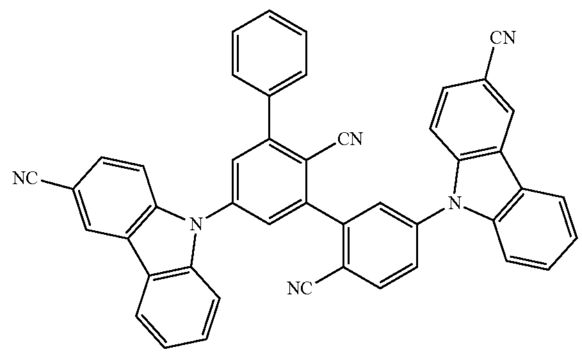
99
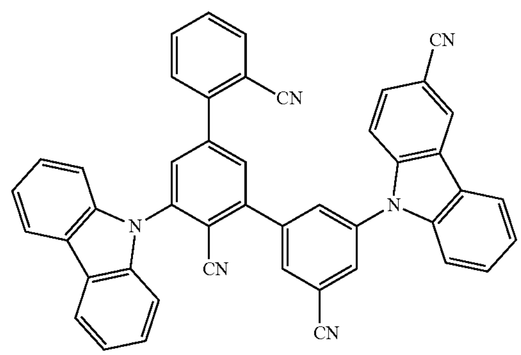
100
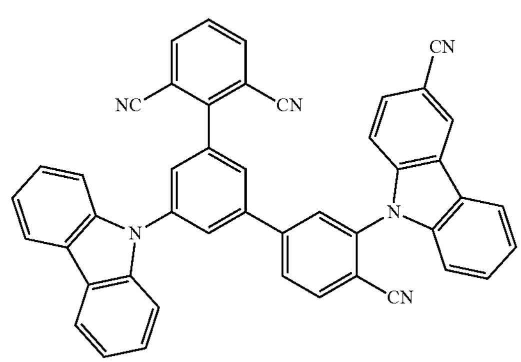

101
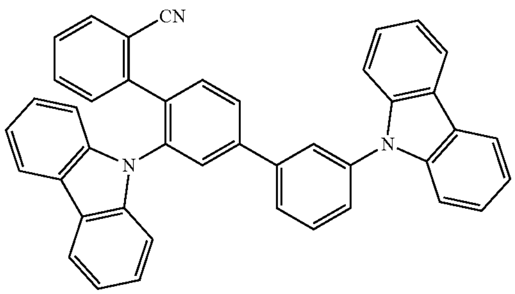
102
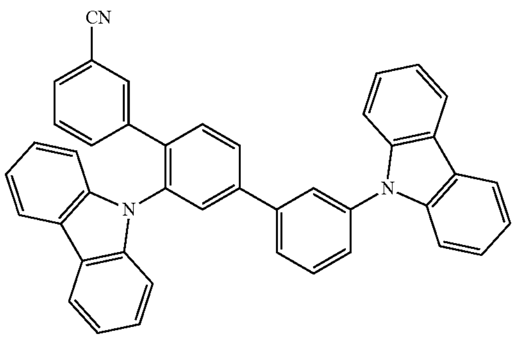
103
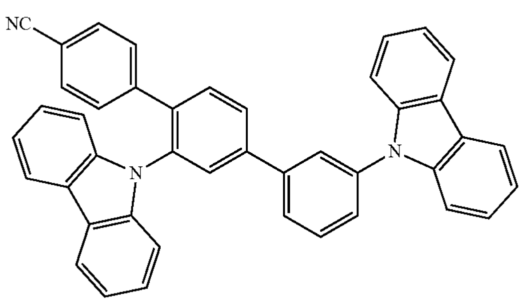
104
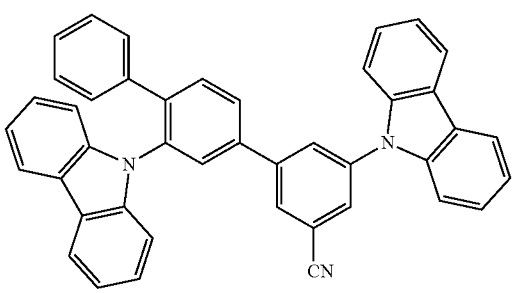
105
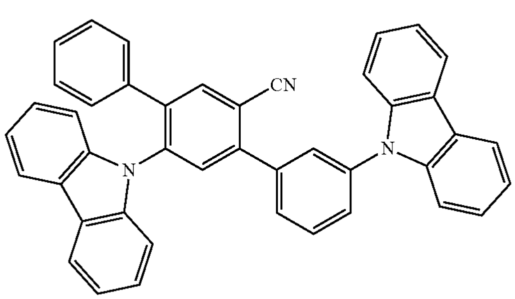
106
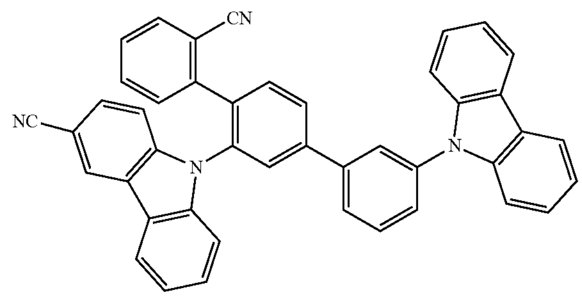
107
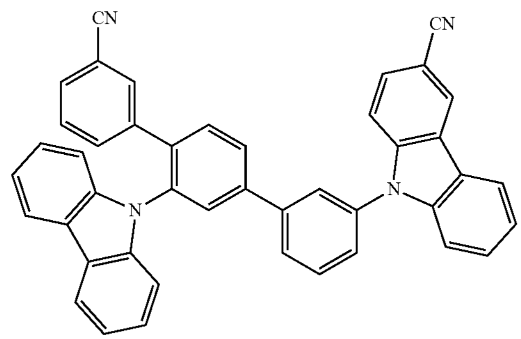
108
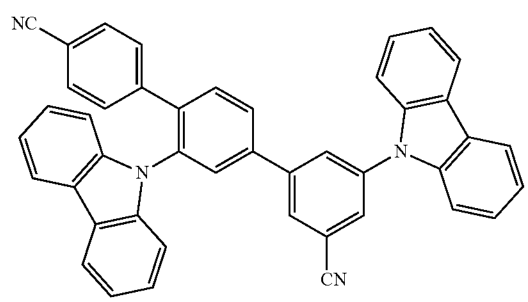
109
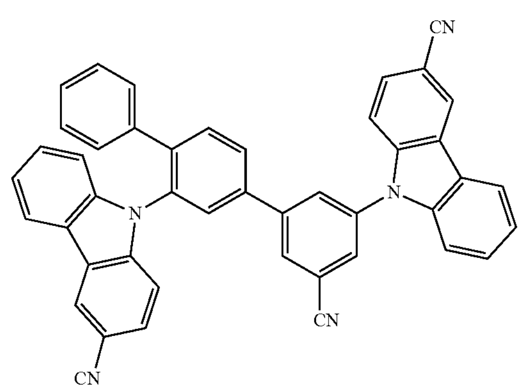

-continued
110
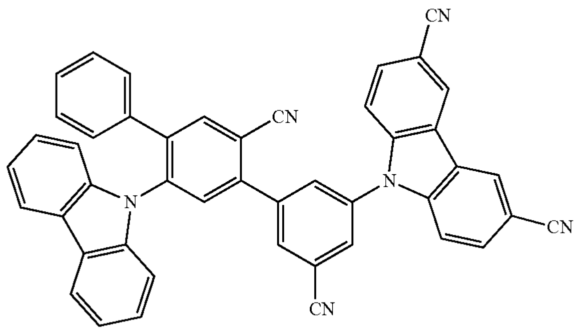
111
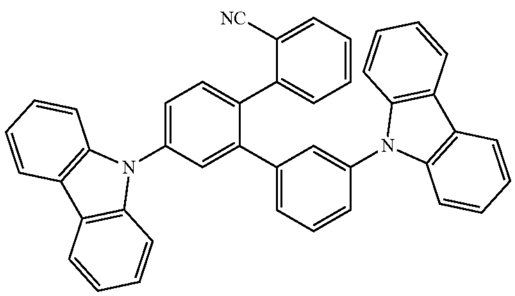
112
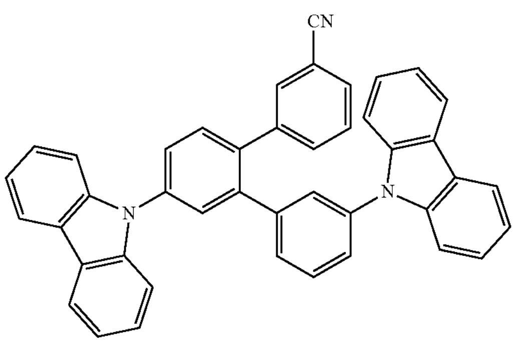
113
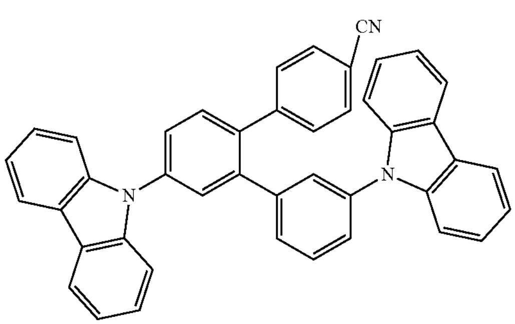
114
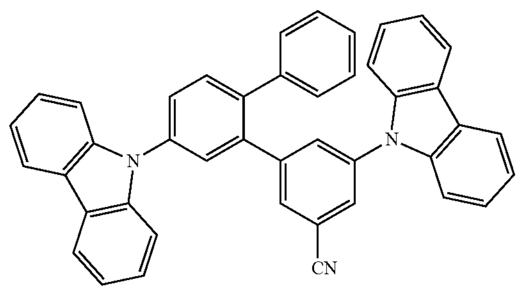
115
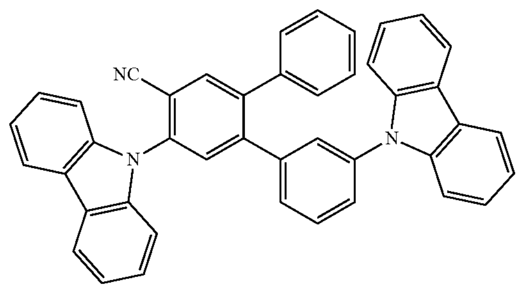
116
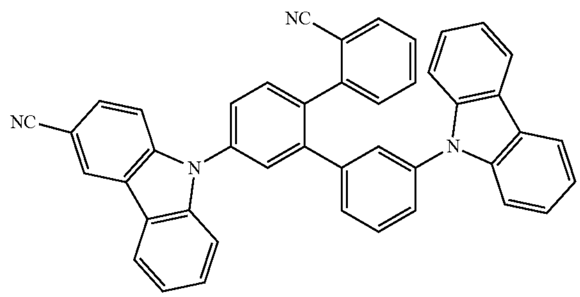
117
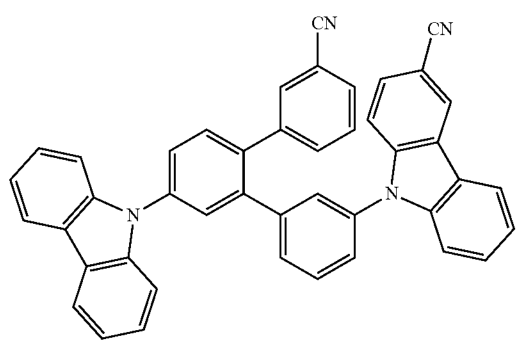
118
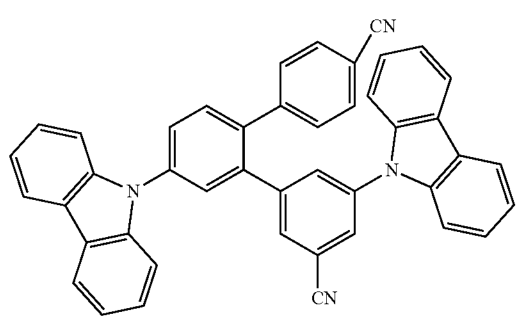

-continued
119
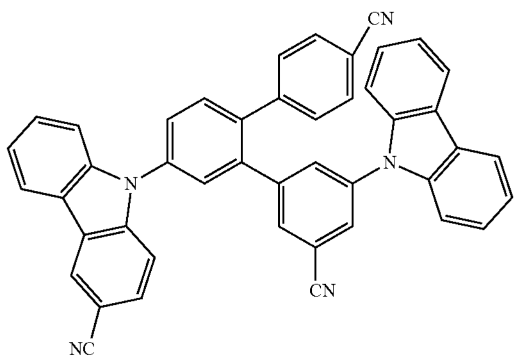
120
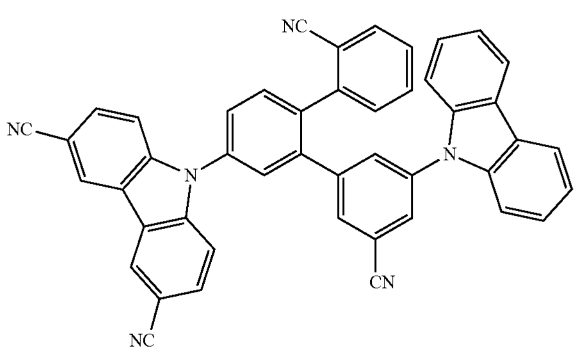
121
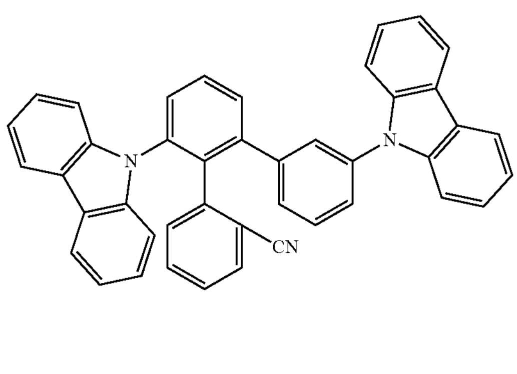
122
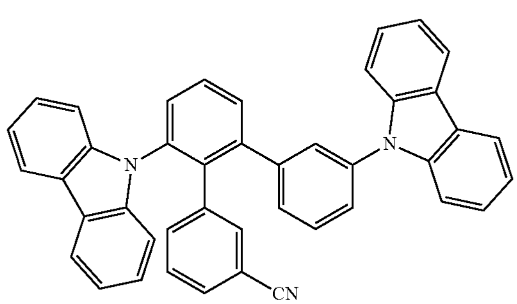
-continued
123
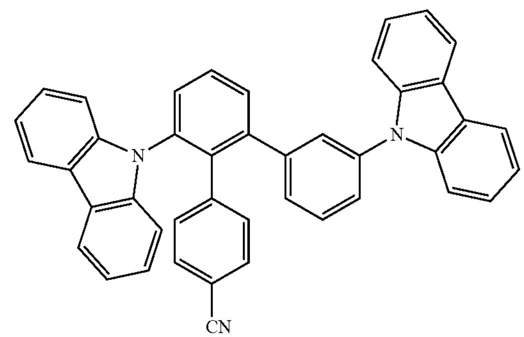
124
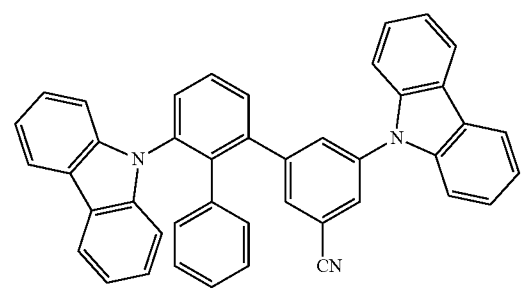
125
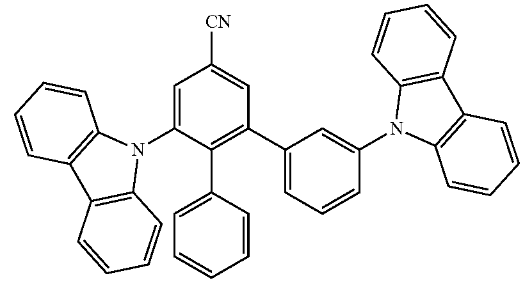
126
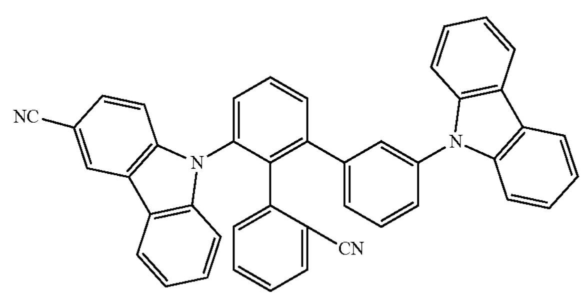
127
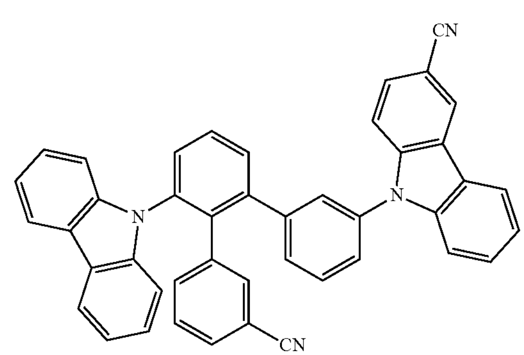

-continued
128
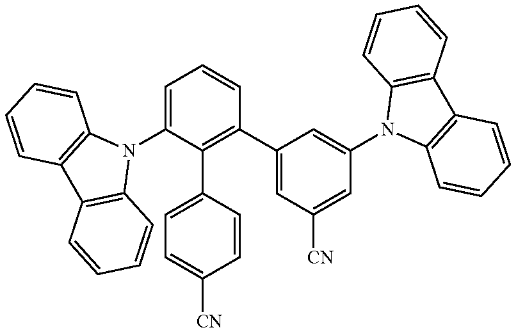
129
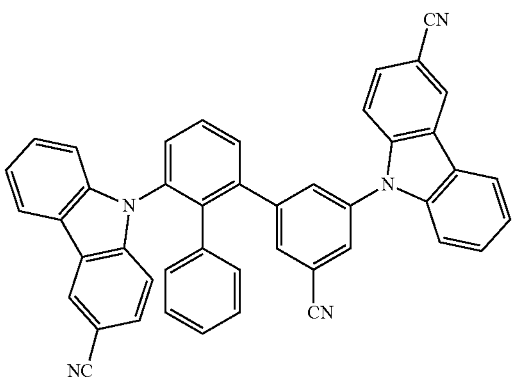
130
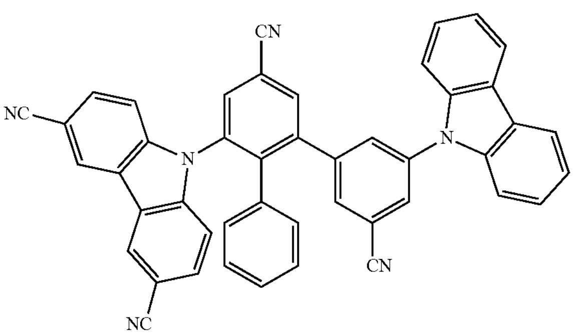
131
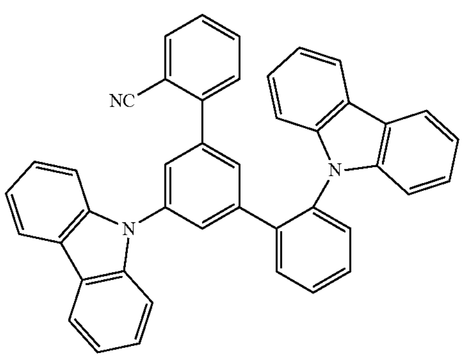
-continued
132
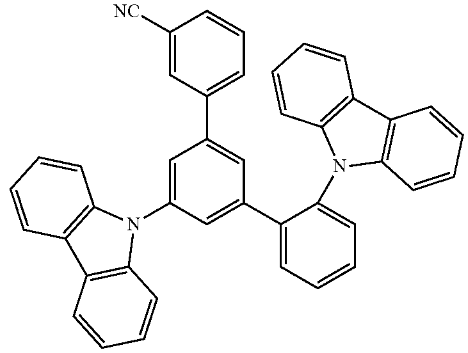
133
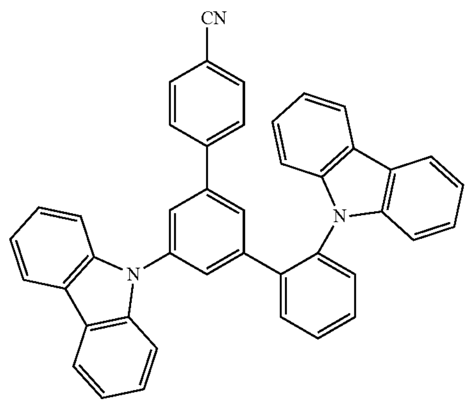
134
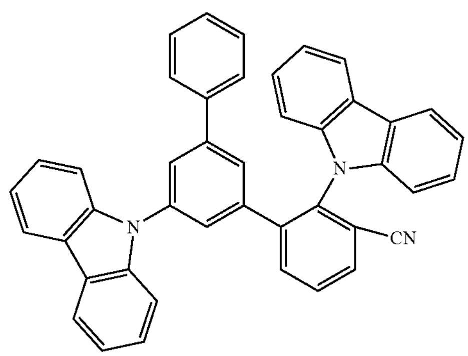
135
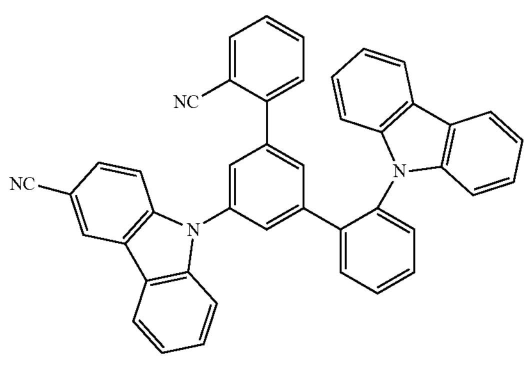

-continued
136
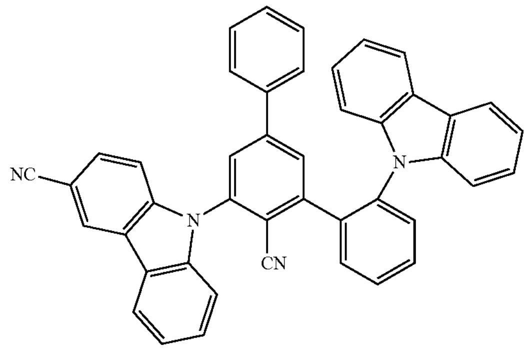
137
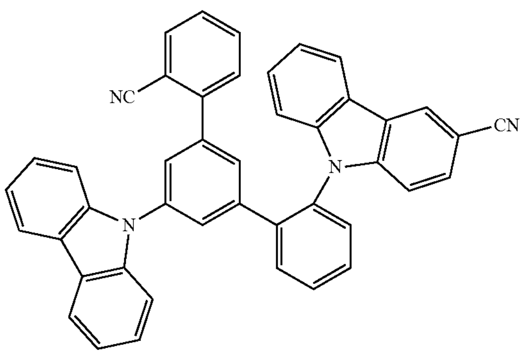
138
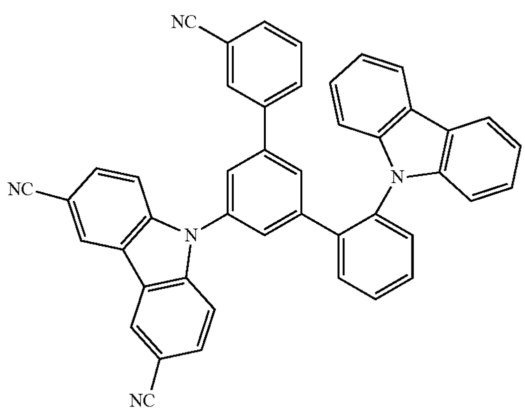
139
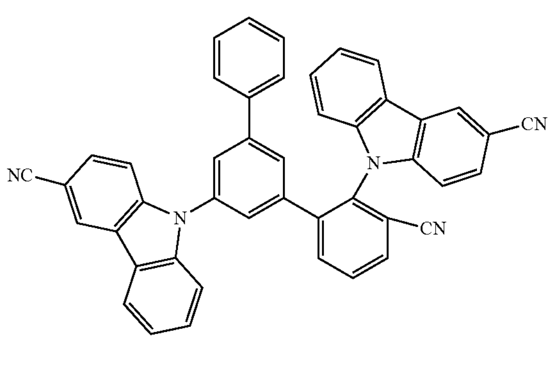
-continued
140
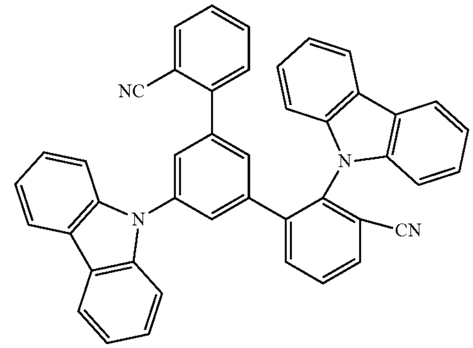
141
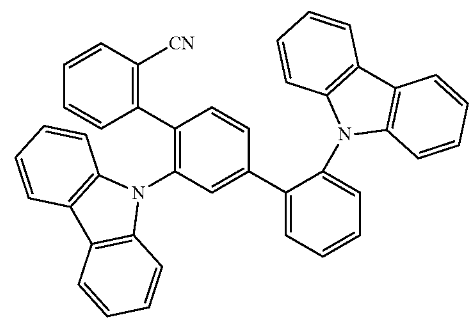
142
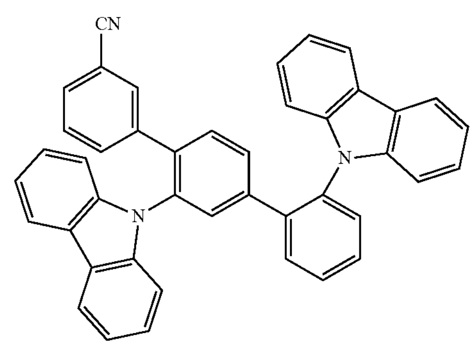
143
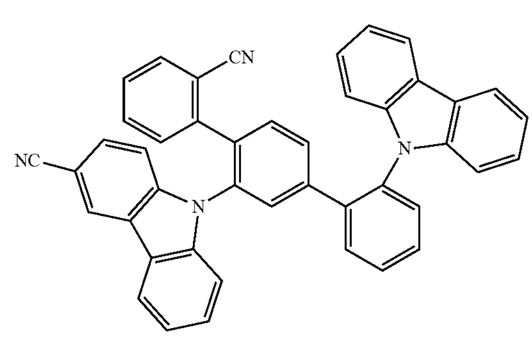

-continued
144
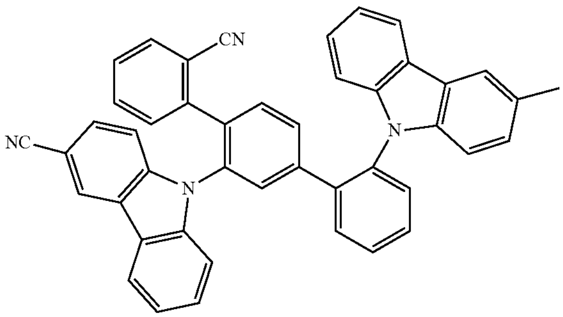
145
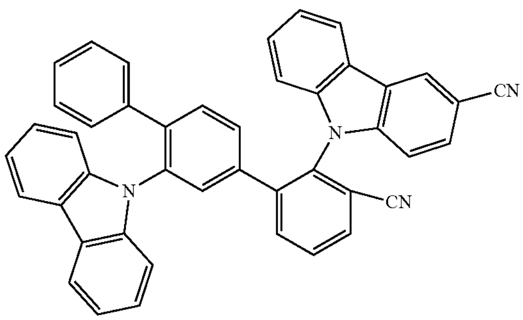
146
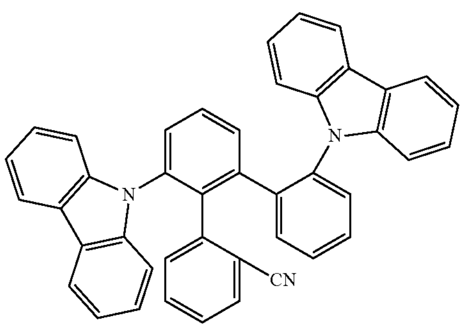
147
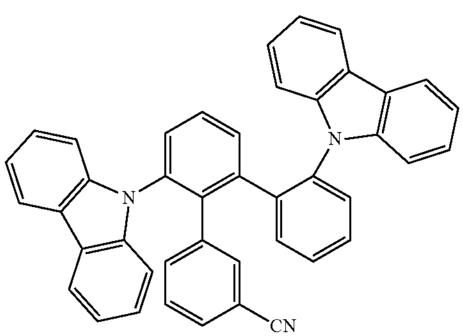
-continued
148
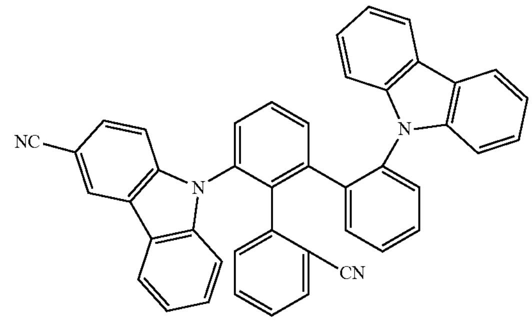
149
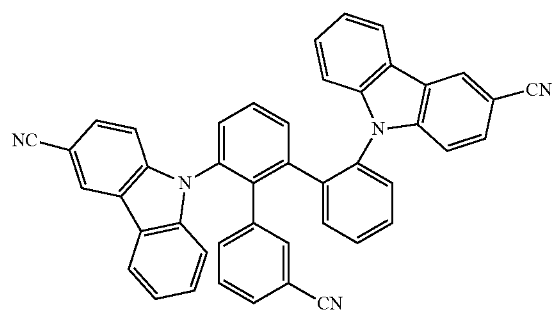
150
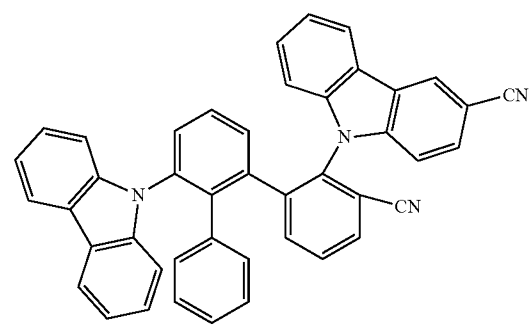
151
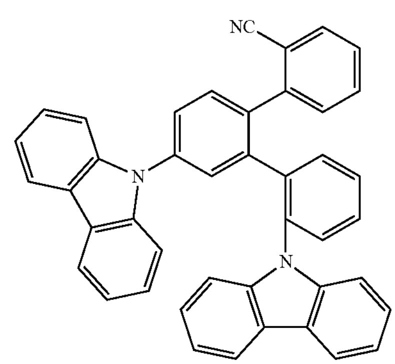

-continued
152
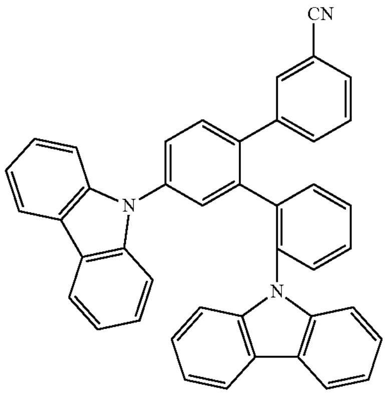
153
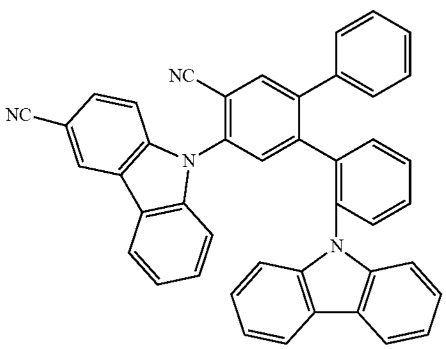
154
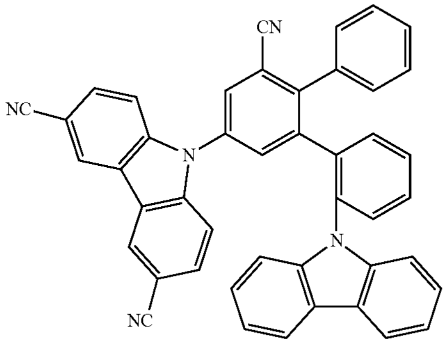
155
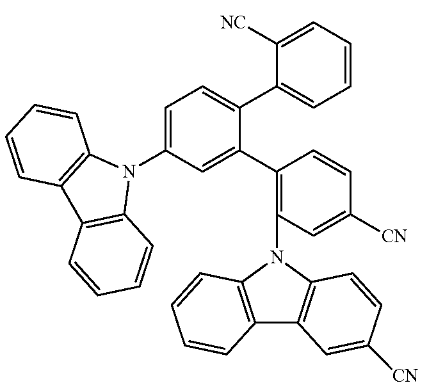
-continued
156
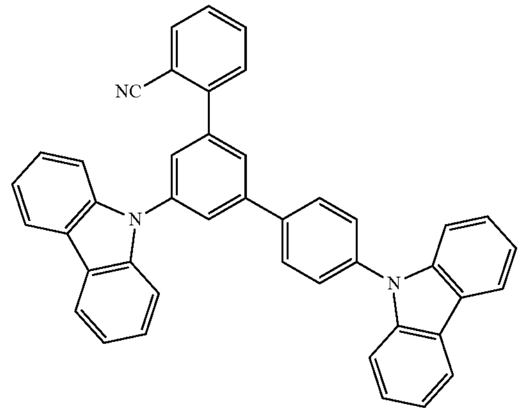
157
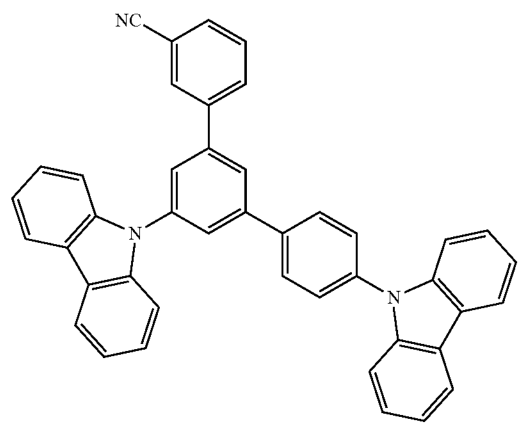
158
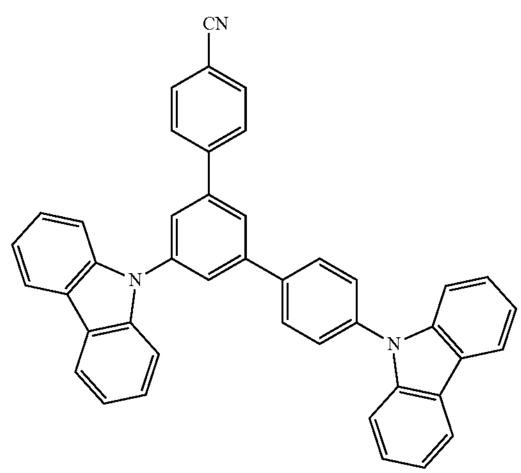

-continued
159
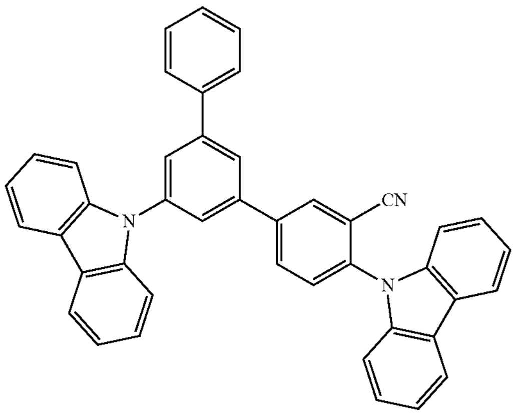
160
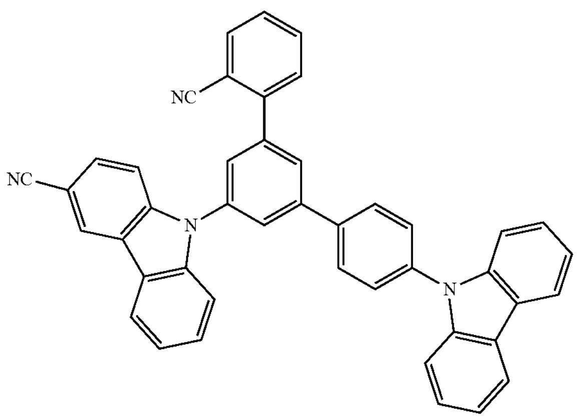
161
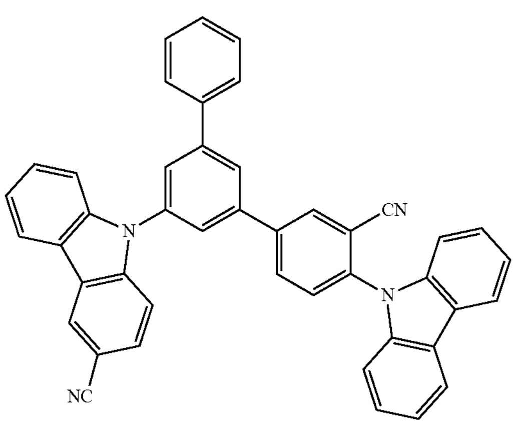
-continued
162
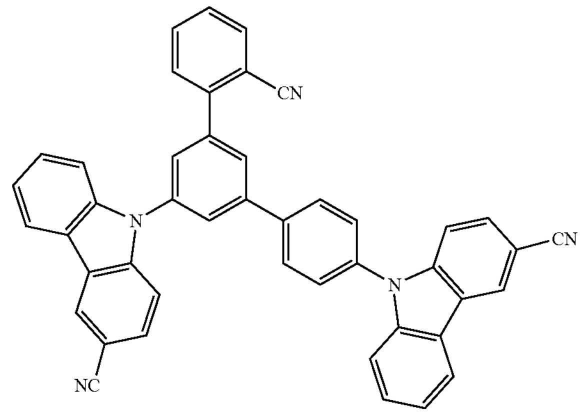
163
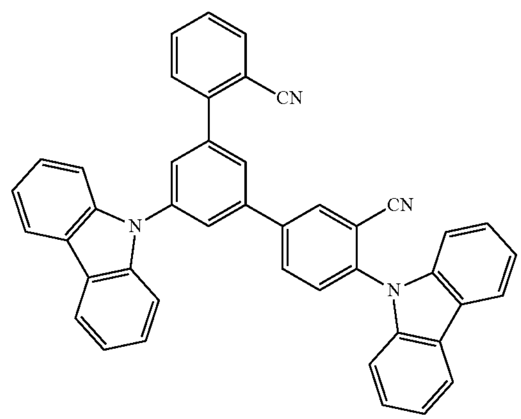
164
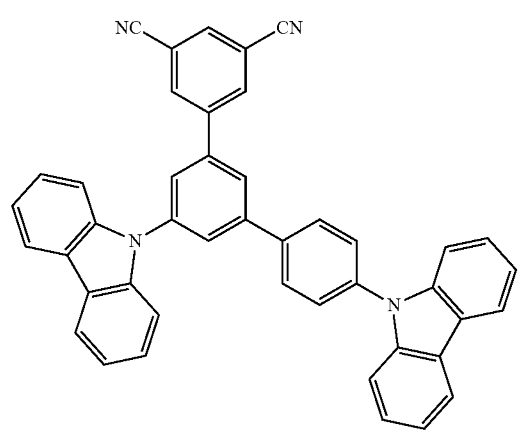

-continued
165
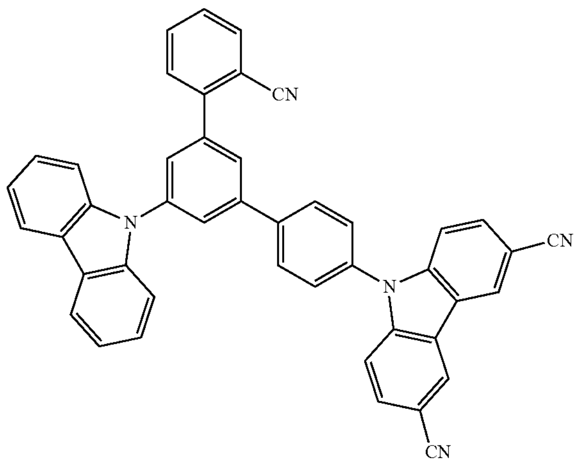
166
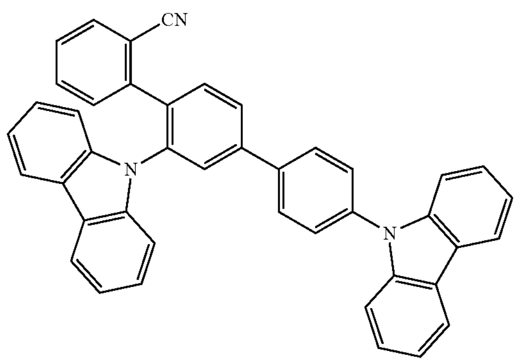
167
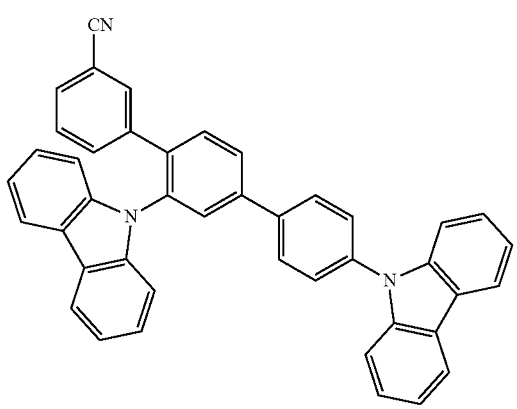
168
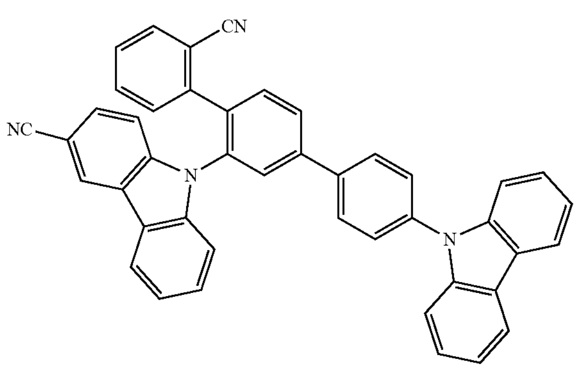
-continued
169
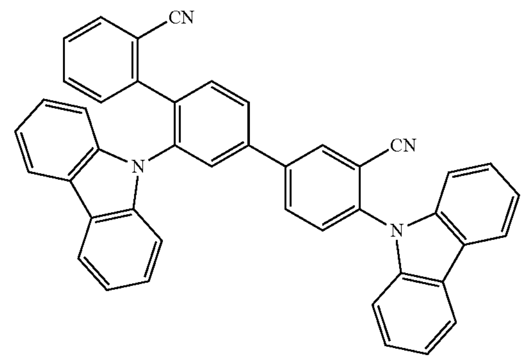
170
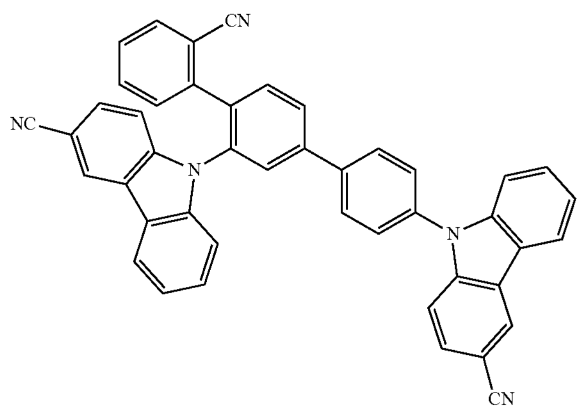
171
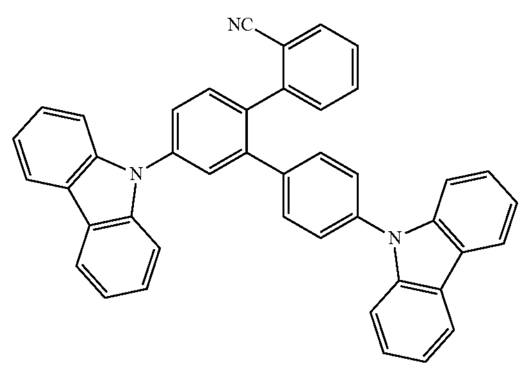
172
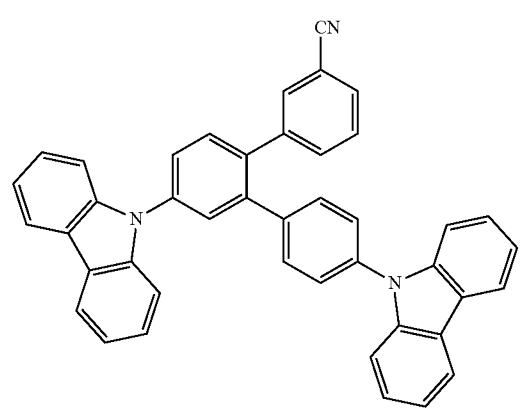

173
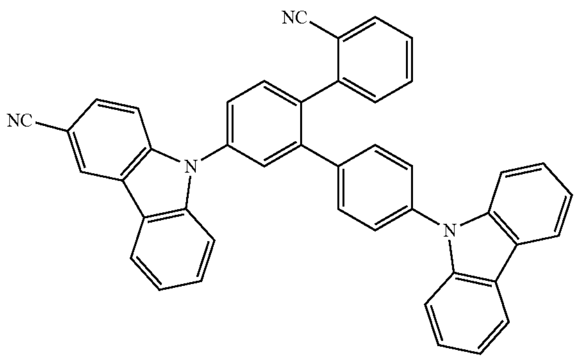
174
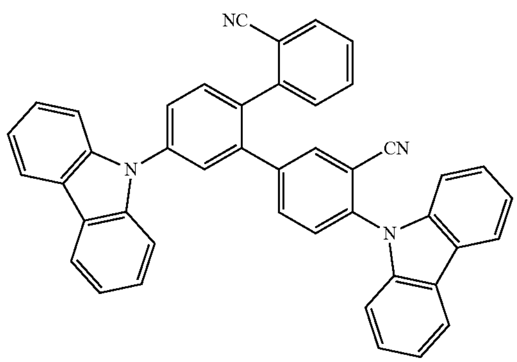
175
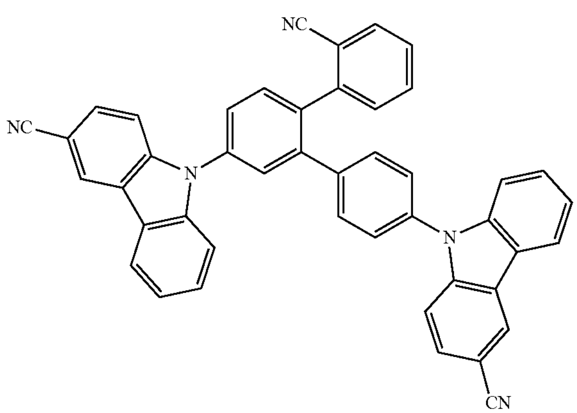
176
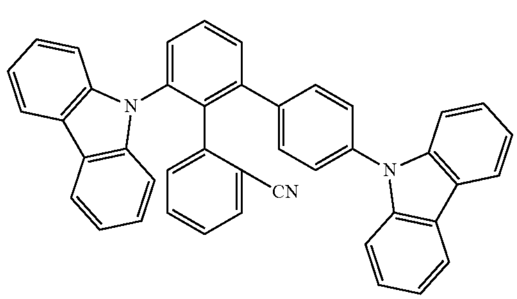
177
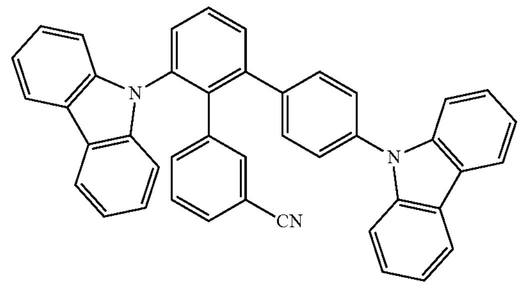
178
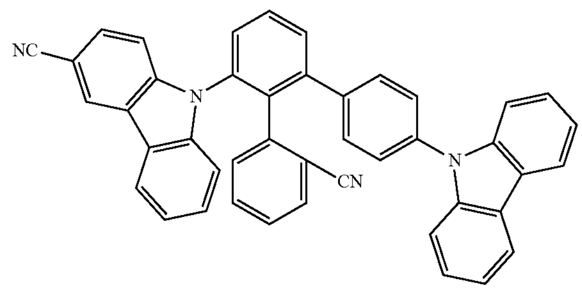
179
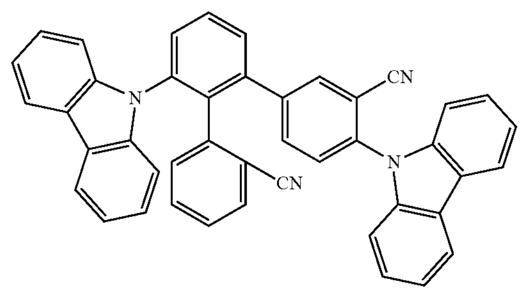
180
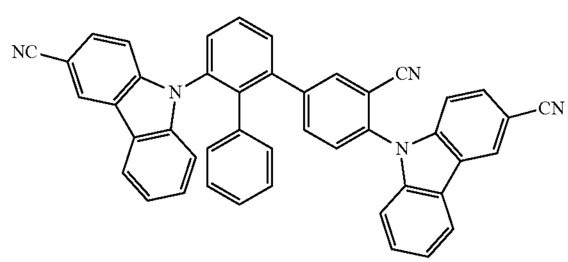
181
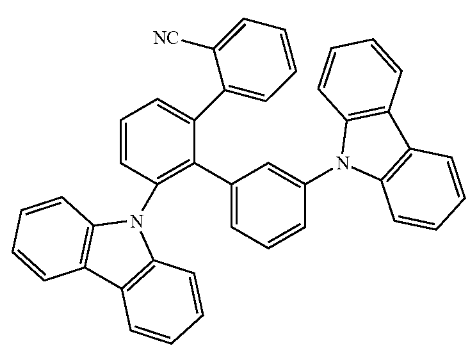

-continued
182
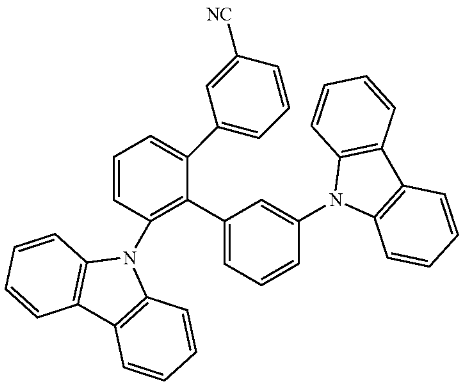
183
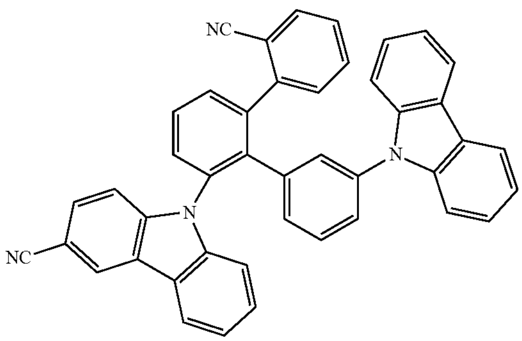
184
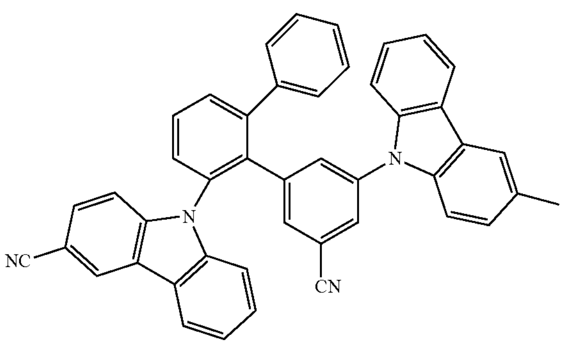
185
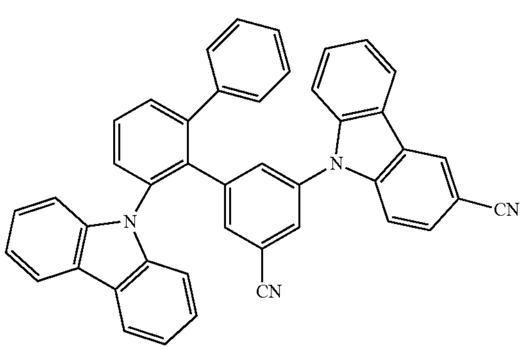
-continued
186
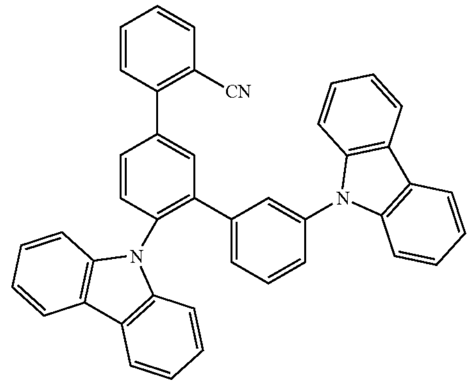
187
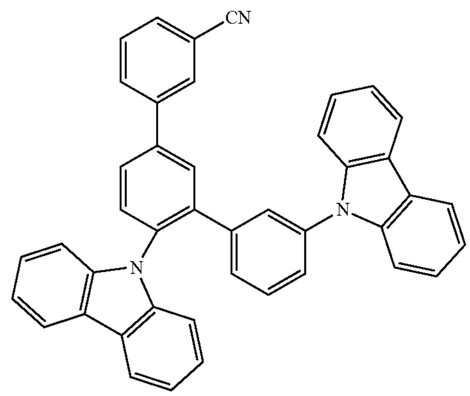
188
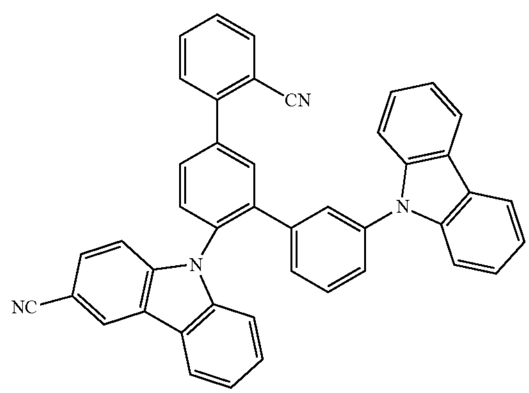
189
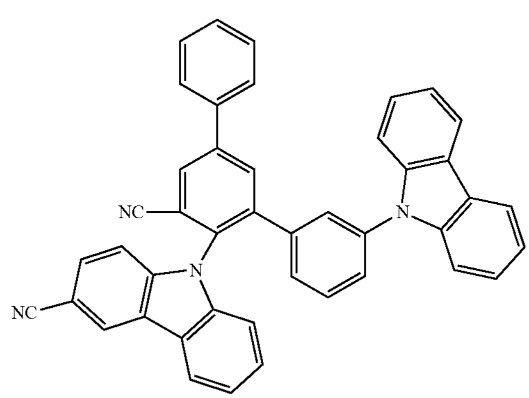

-continued
190
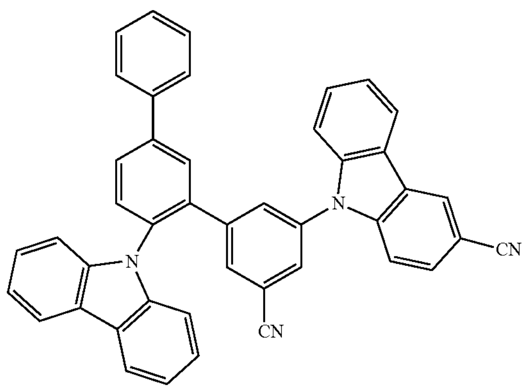
191
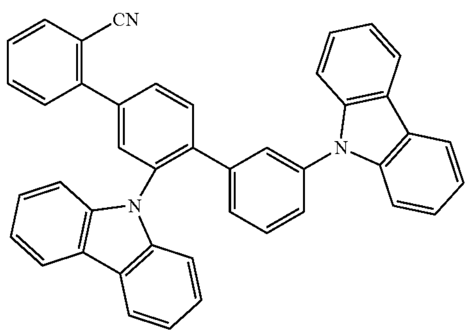
192
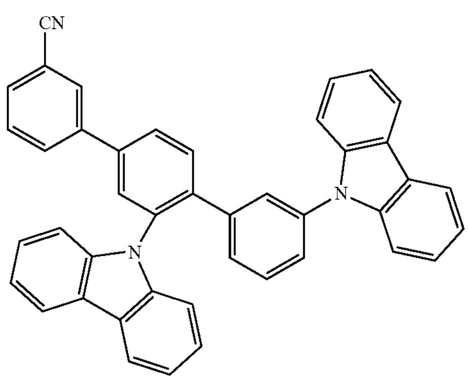
193
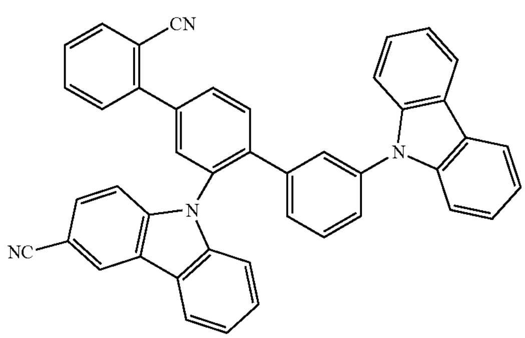
-continued
194
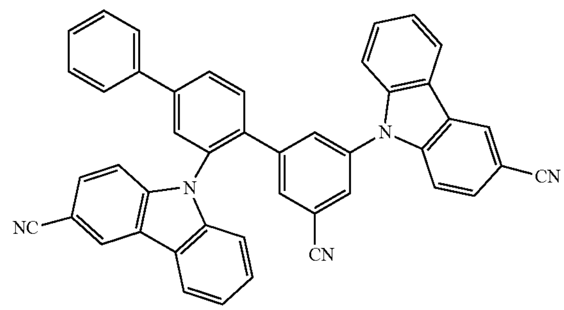
195
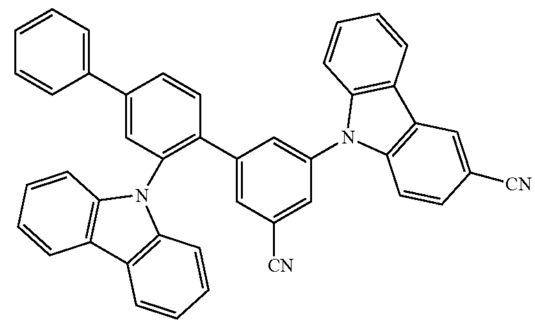
196
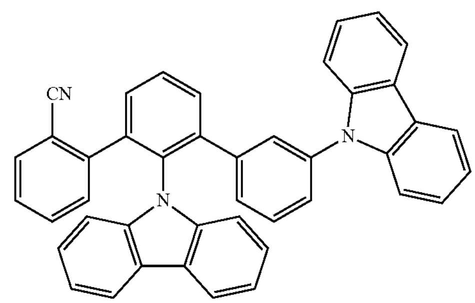
197
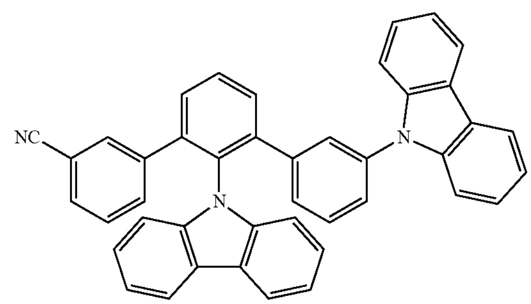
198
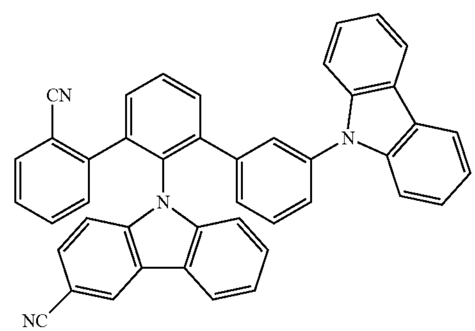

199
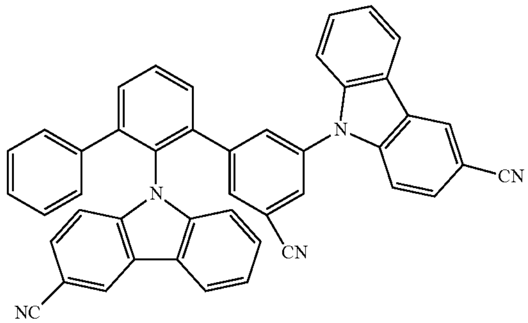
200
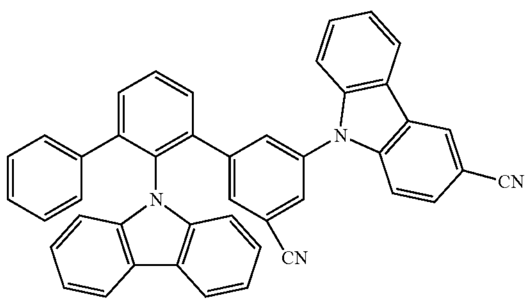
201
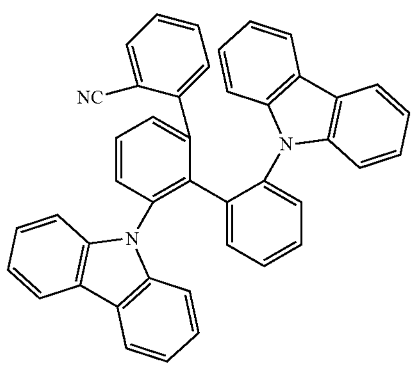
202
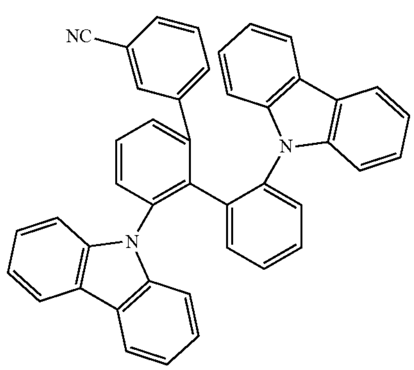
203
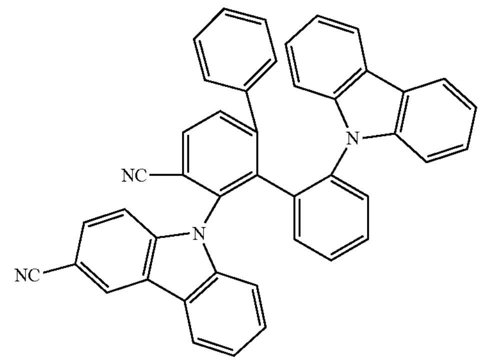
204
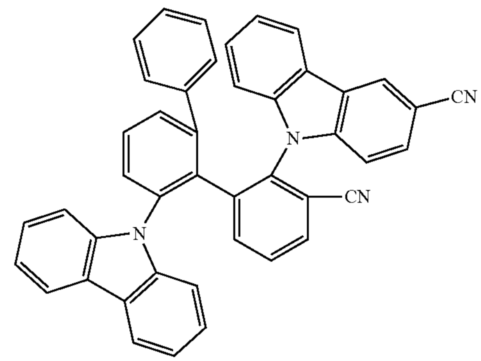
205
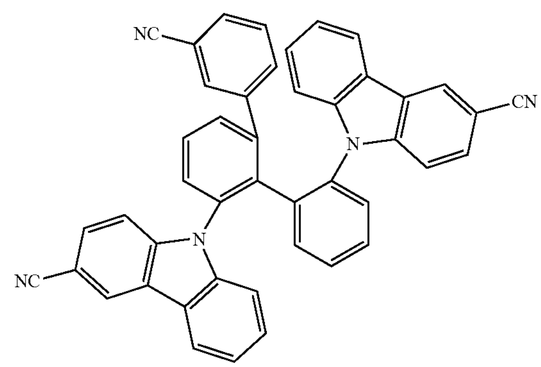
206
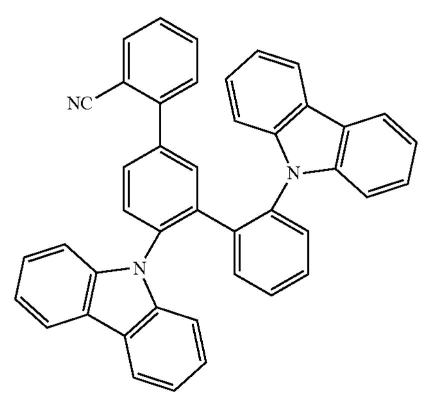

-continued
207
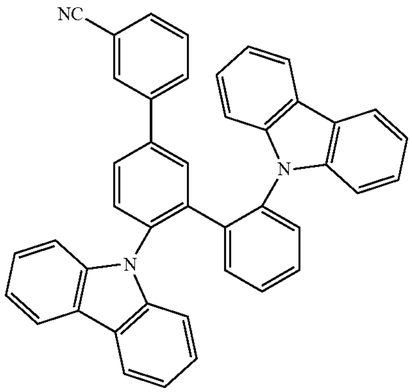
208
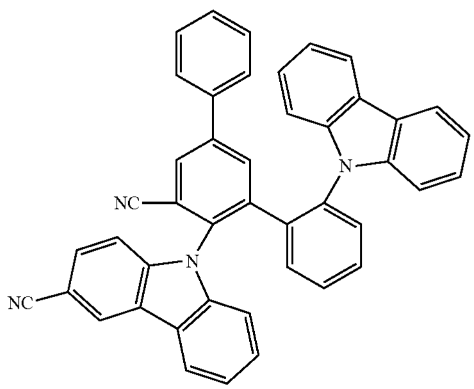
209
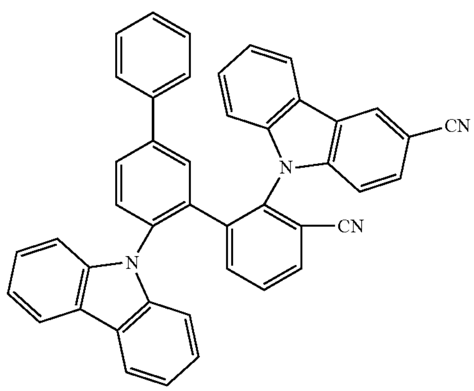
210
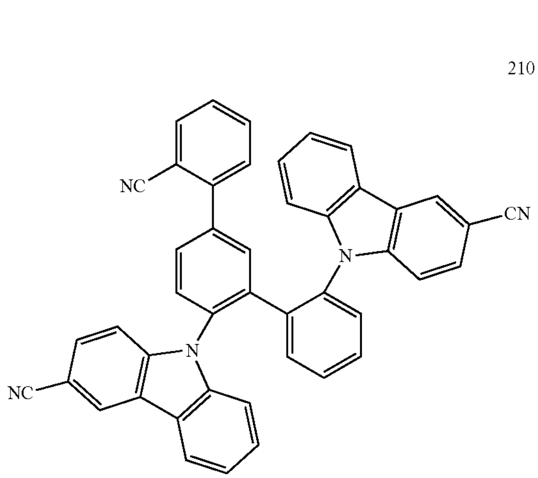
-continued
211
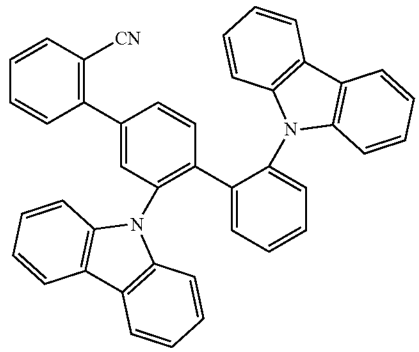
212
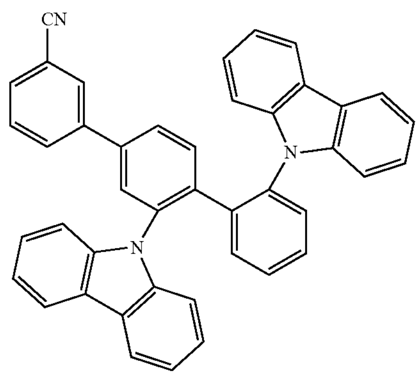
213
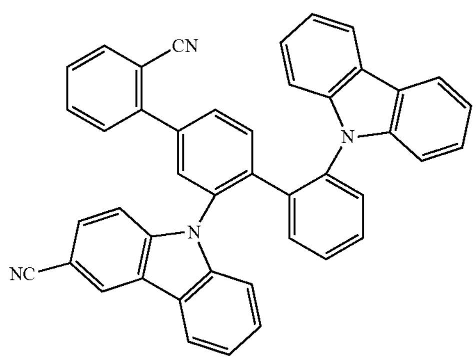
214
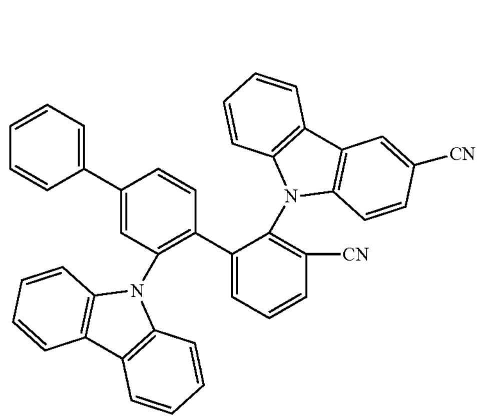

-continued
215
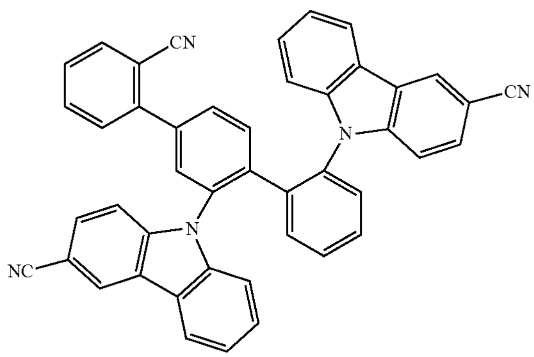
216
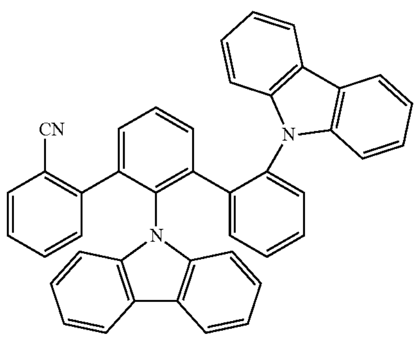
217
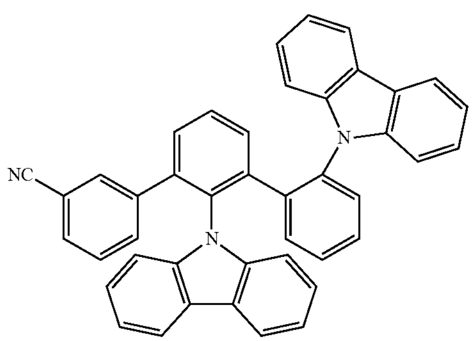
218
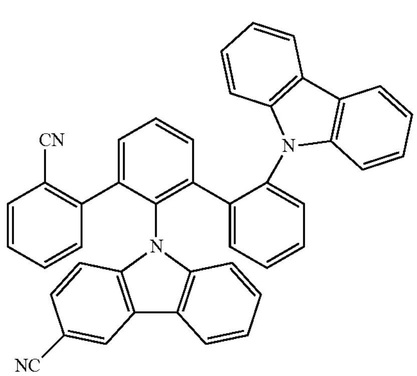
-continued
219
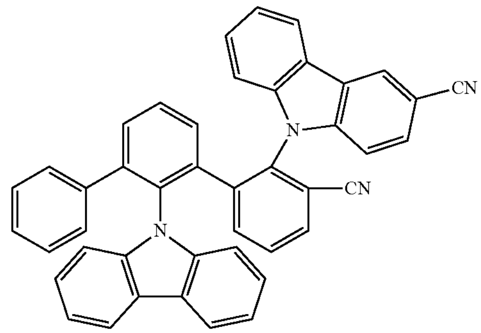
220
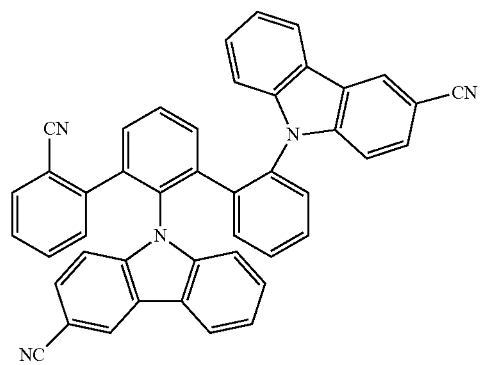
221
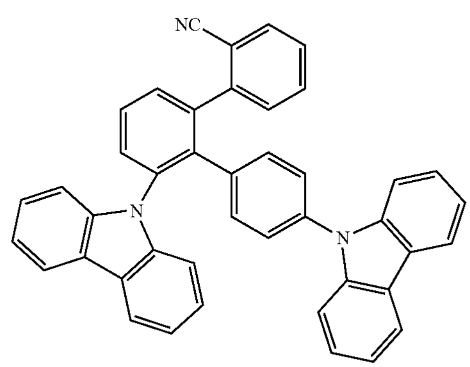
222
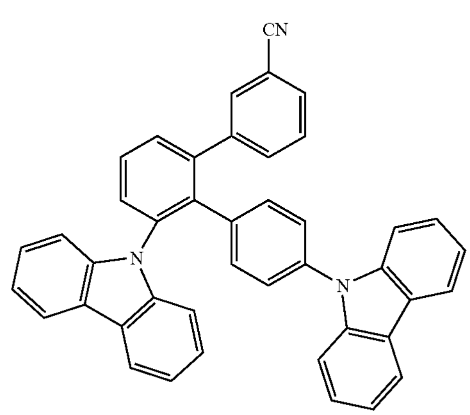

-continued
223
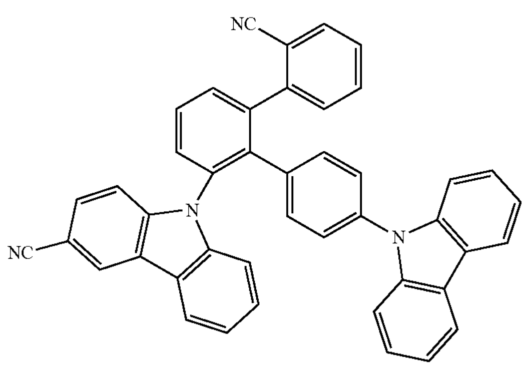
224
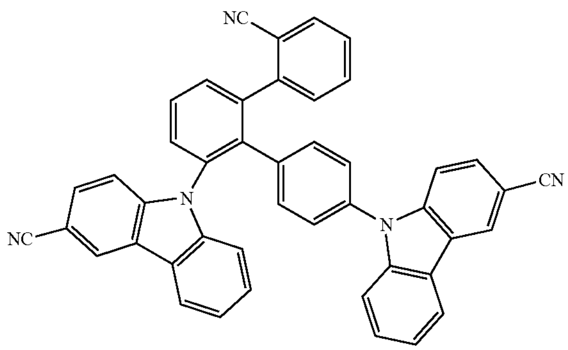
225
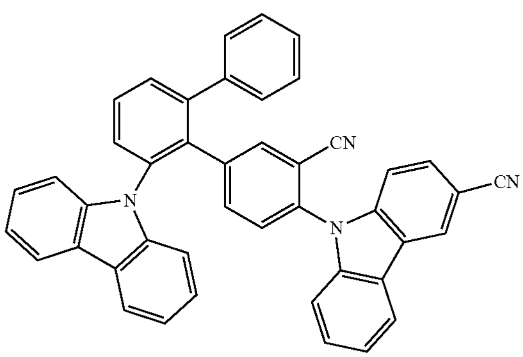
226
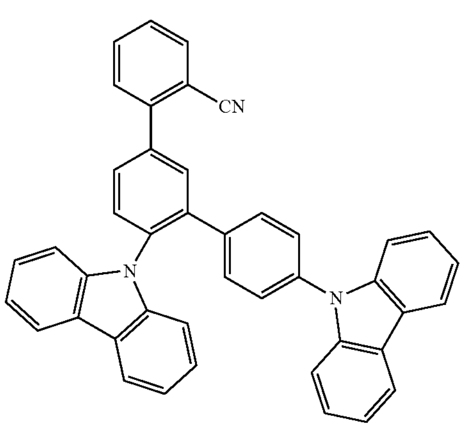
-continued
227
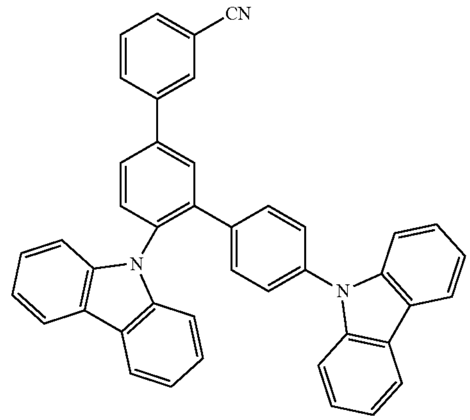
228
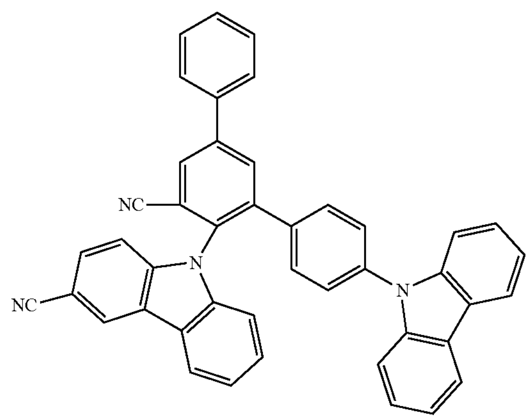
229
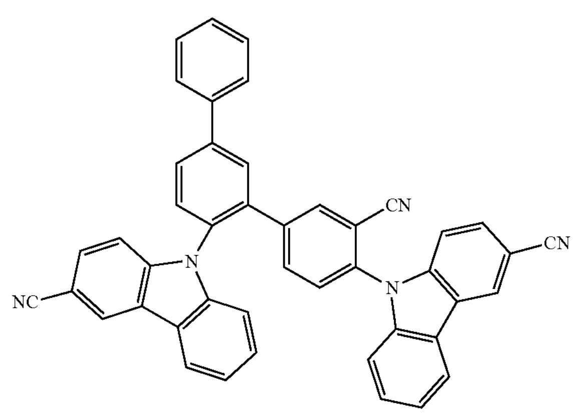

-continued
230
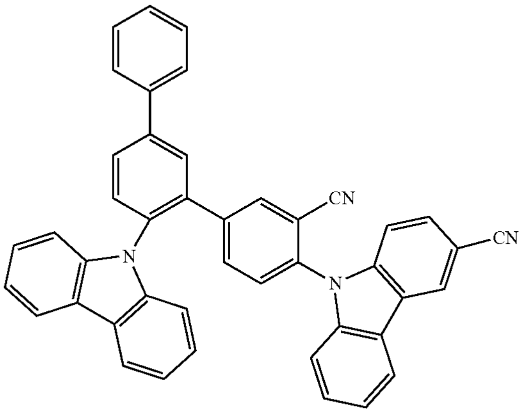
231
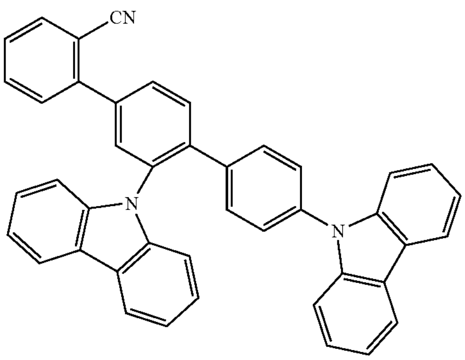
232
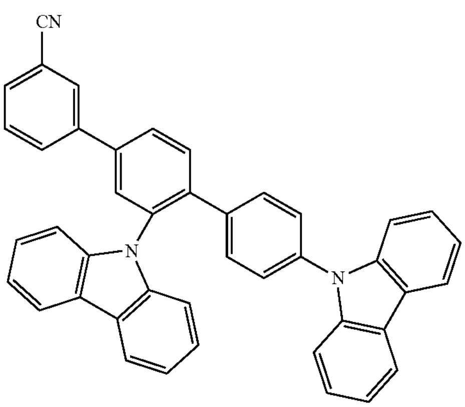
233
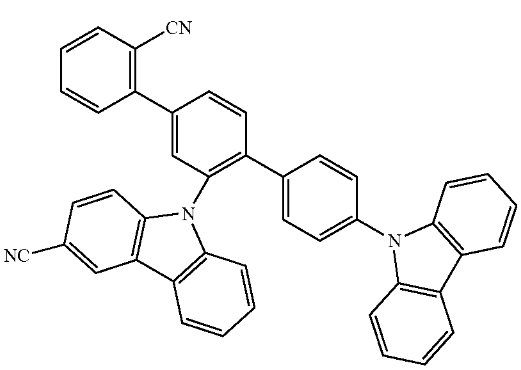
-continued
234
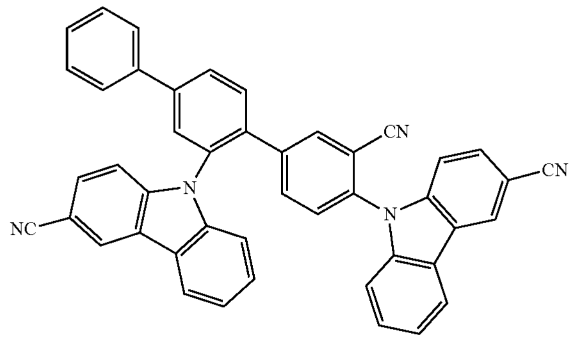
235
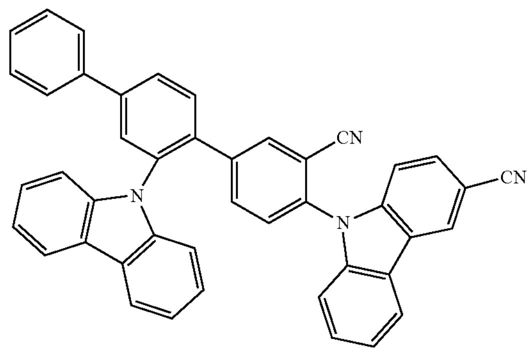
236
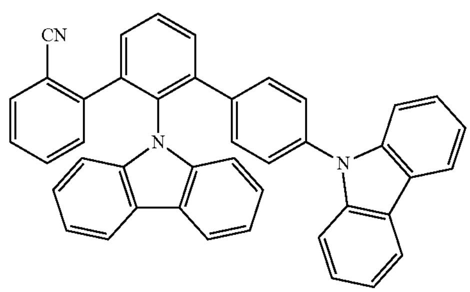
237
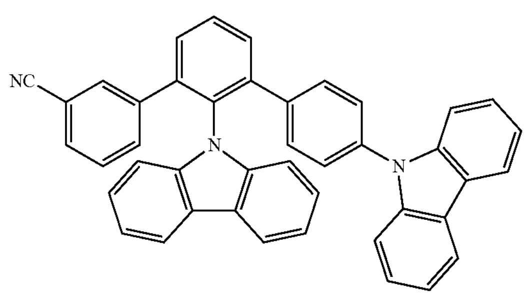
238
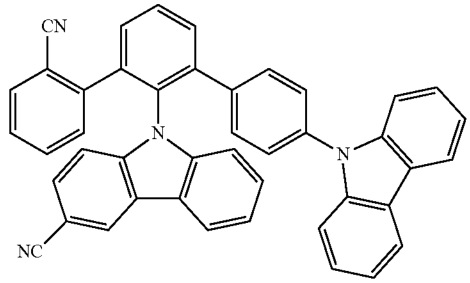

-continued
239
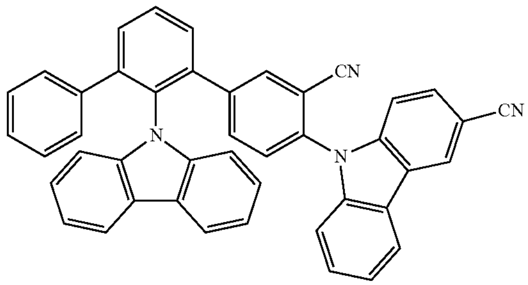
240
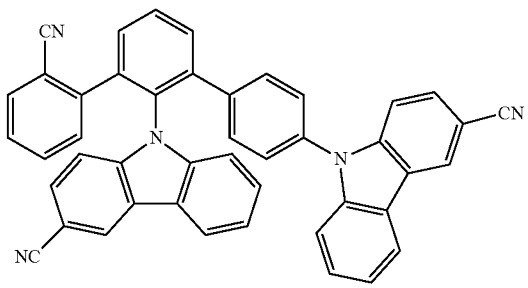
241
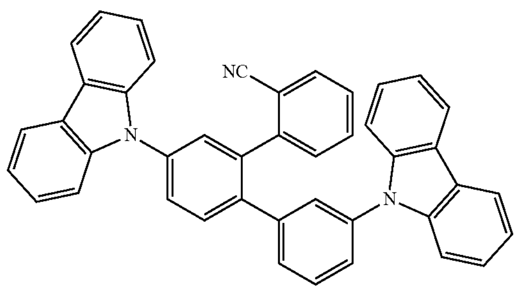
242
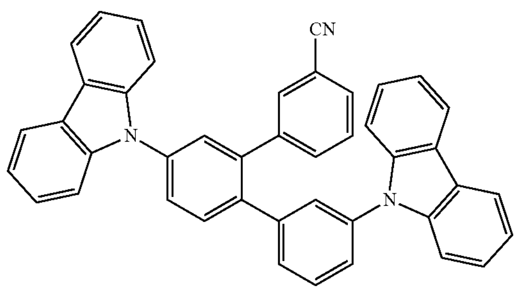
243
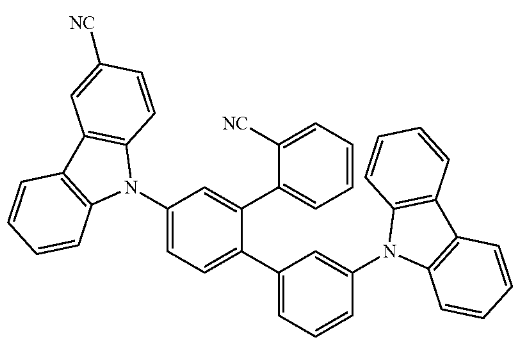
-continued
244
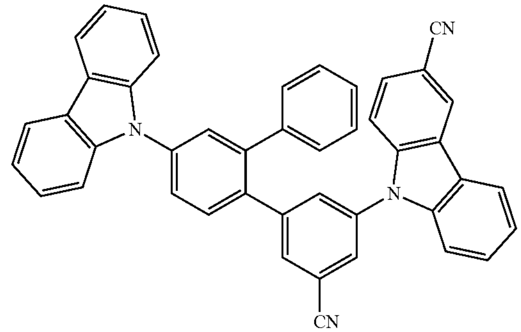
245
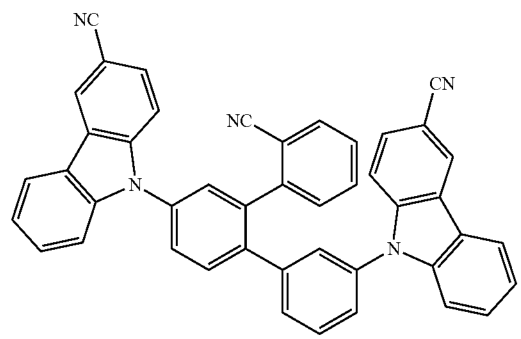
246
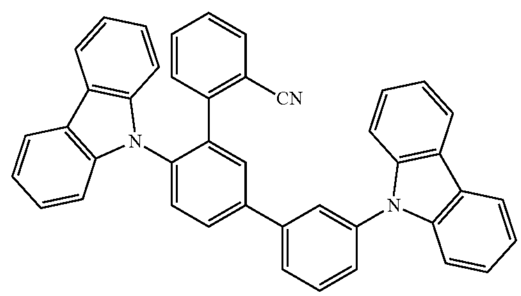
247
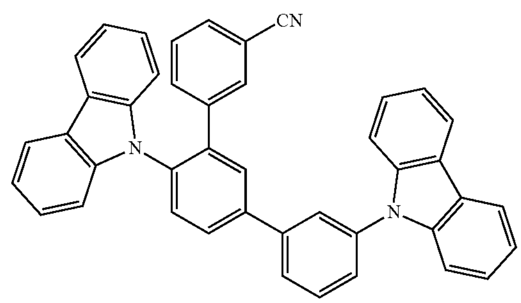

-continued
248
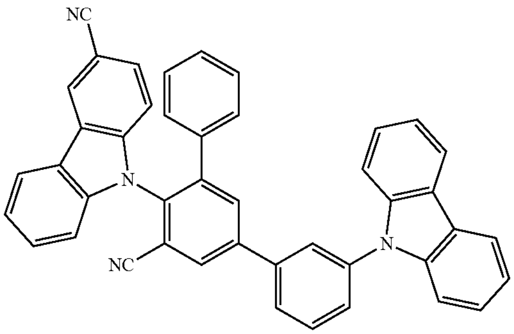
249
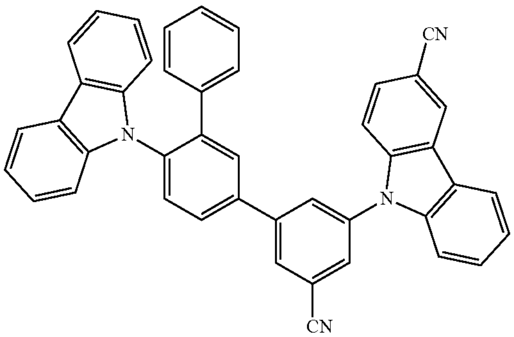
250
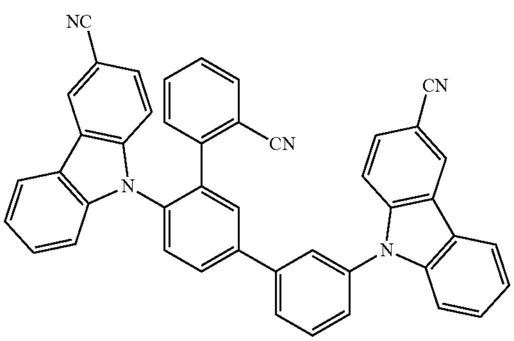
251
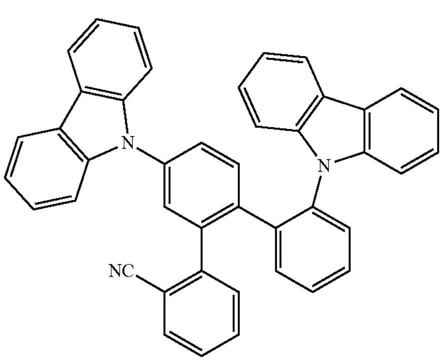
-continued
252
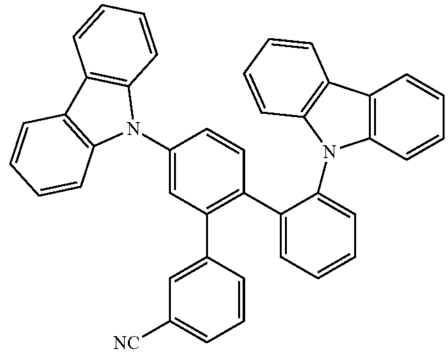
253
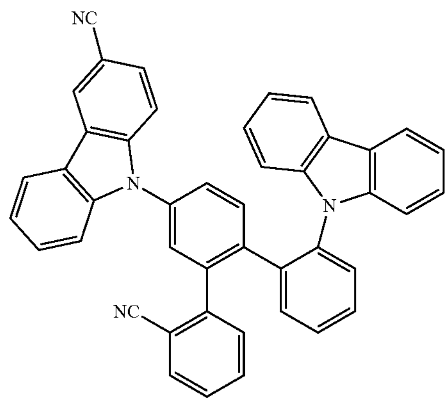
254
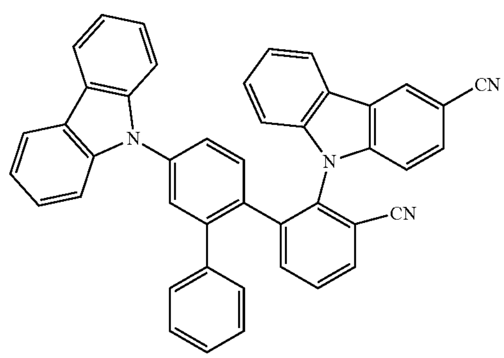
255
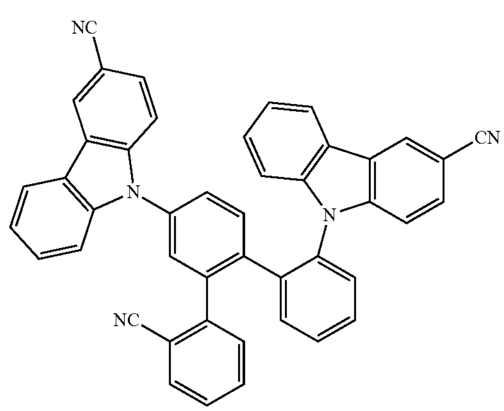

-continued
256
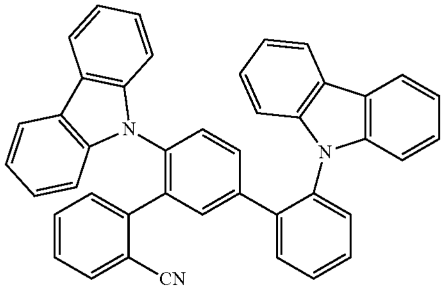
257
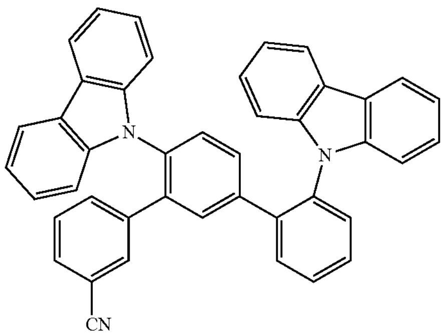
258
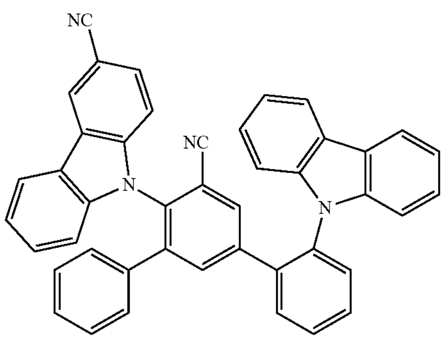
259
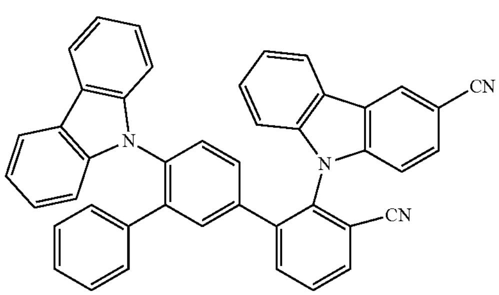
-continued
260
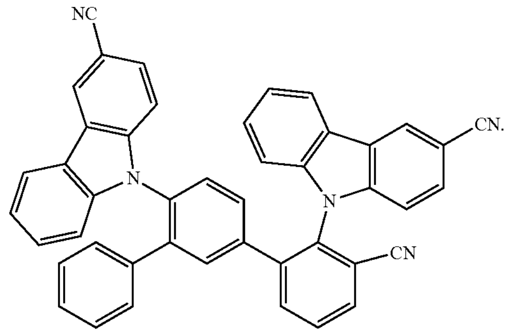
In one or more embodiments, the electron-transporting host may include DPEPO, mCBP-1CN, or mCBP-2CN:
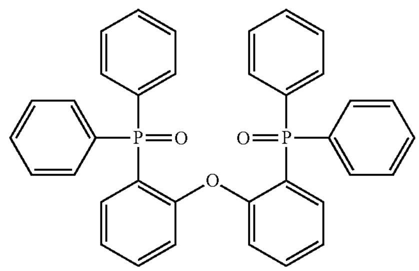
DPEPO
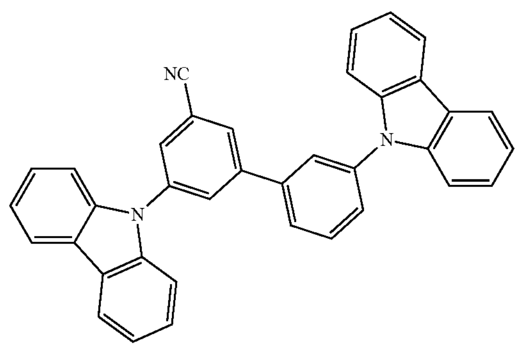
mCBP-1CN
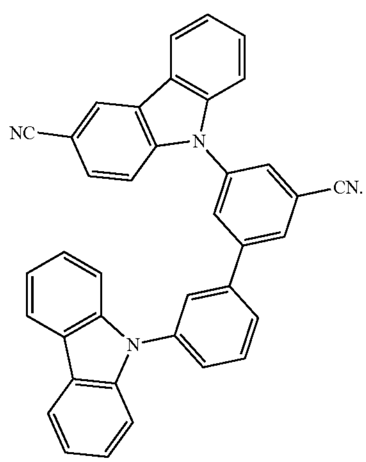
mCBP-2CN In one or more embodiments, the hole-transporting host may be one of Compounds H-H1 to H-H103, but embodiments of the present disclosure are not limited thereto:
H-H1
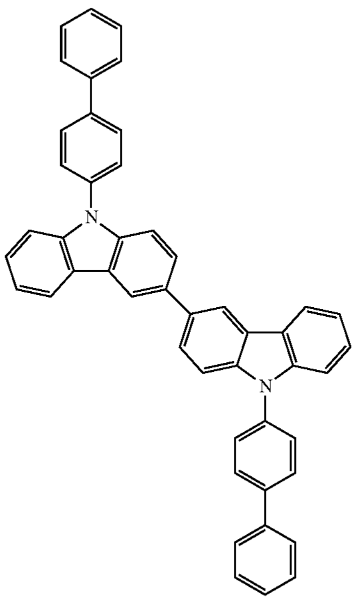
H-H2
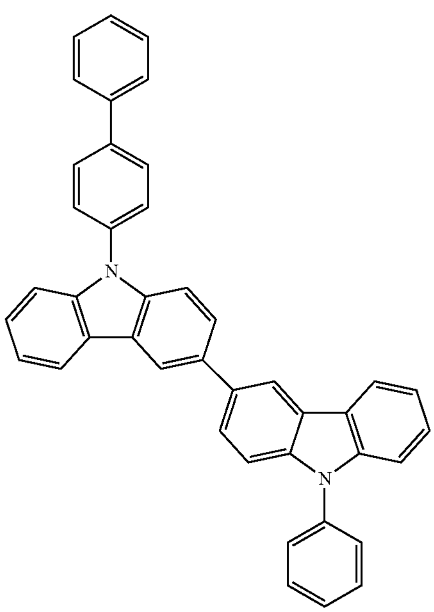
-continued
H-H3
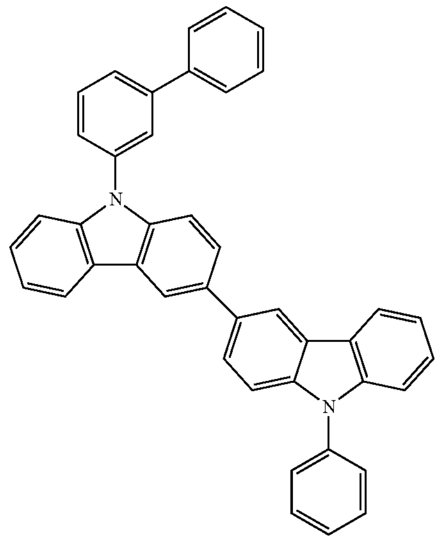
H-H4
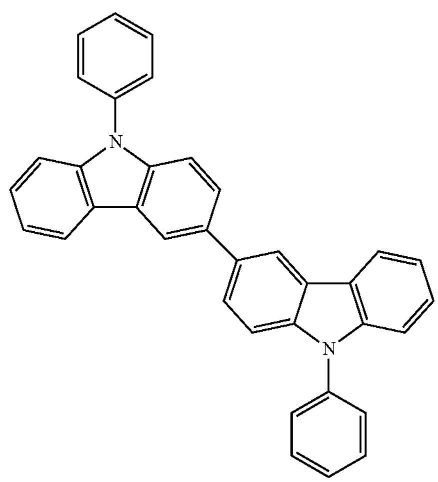
H-H5
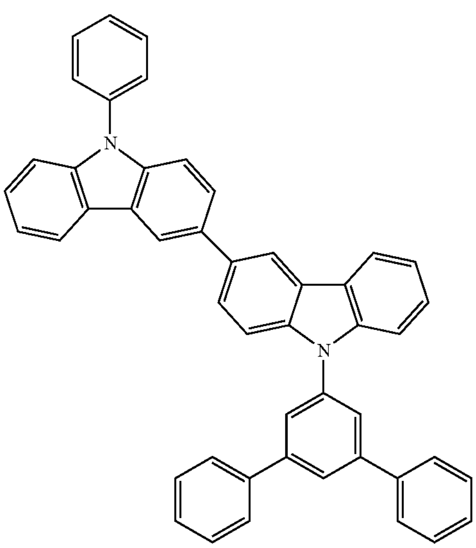

-continued
H-H6
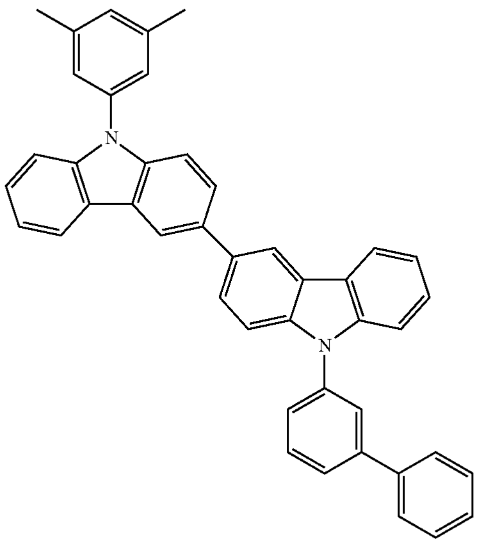
H-H7
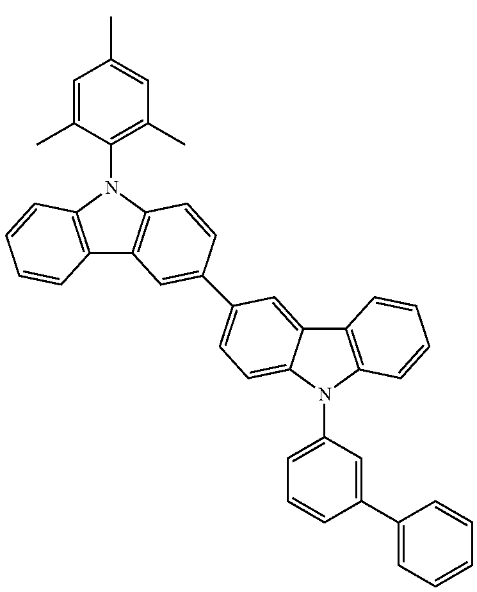
-continued
H-H8
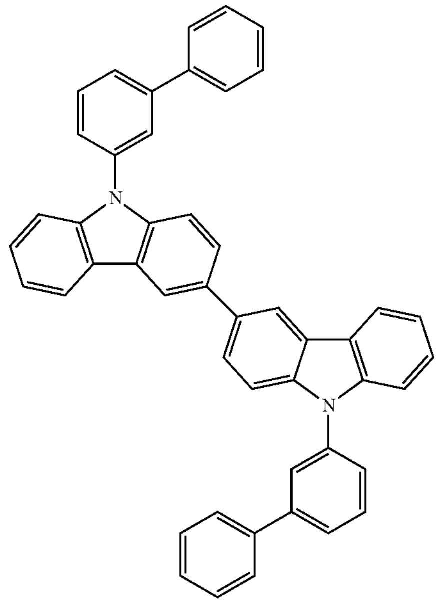
H-H9
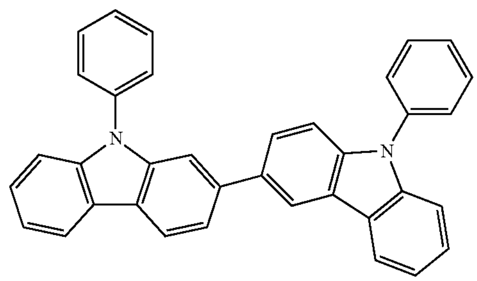
H-H10
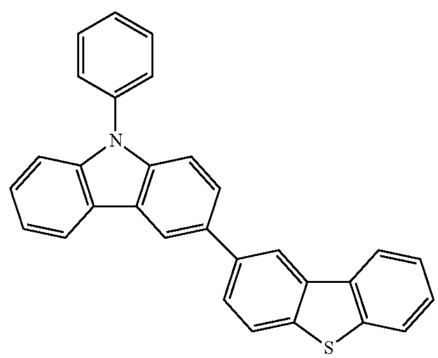
H-H11
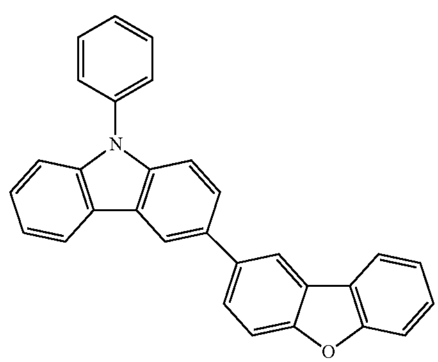

-continued
H-H12
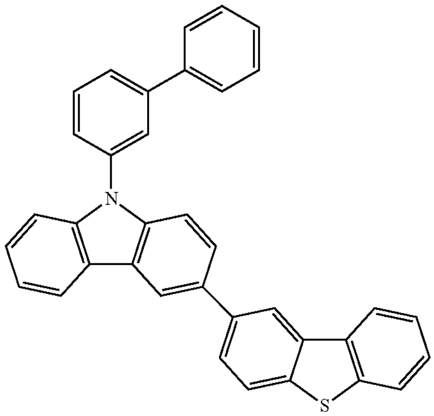
H-H13
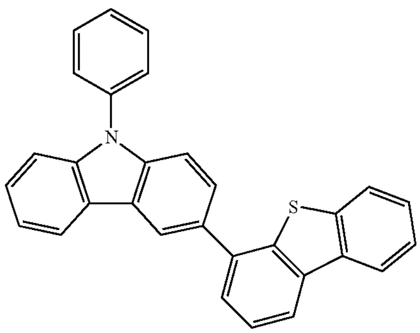
H-H14
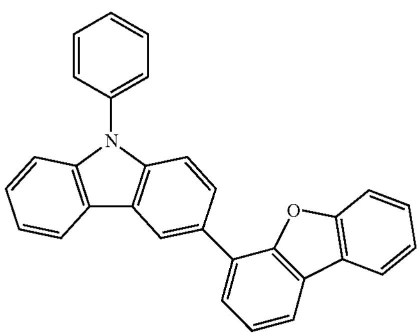
H-H15
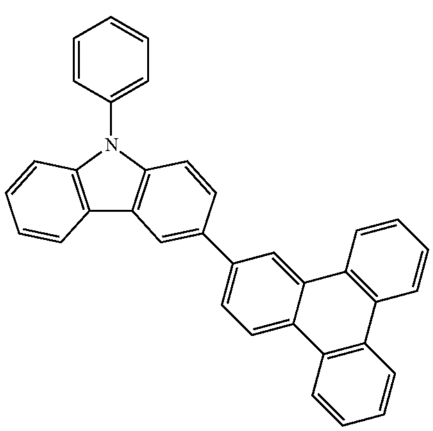
-continued
H-H16
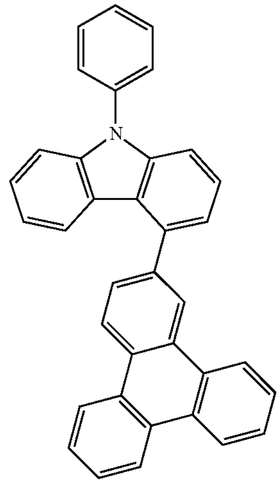
H-H17
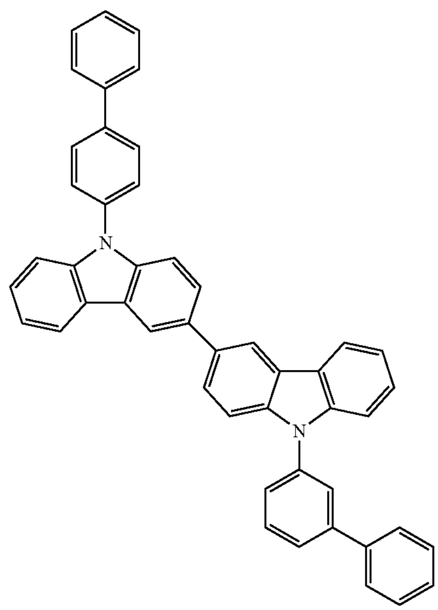
H-H18
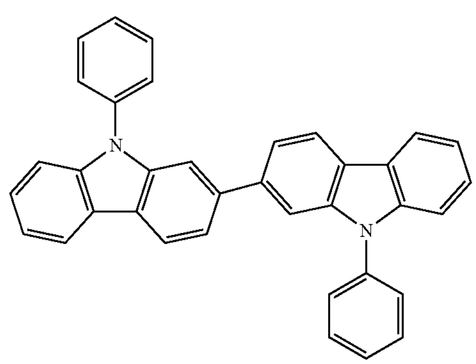

-continued
H-H19
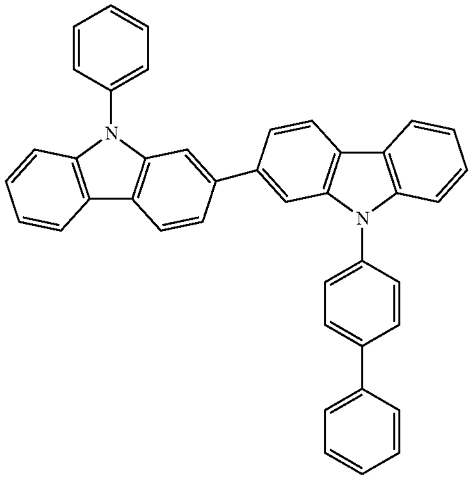
H-H20
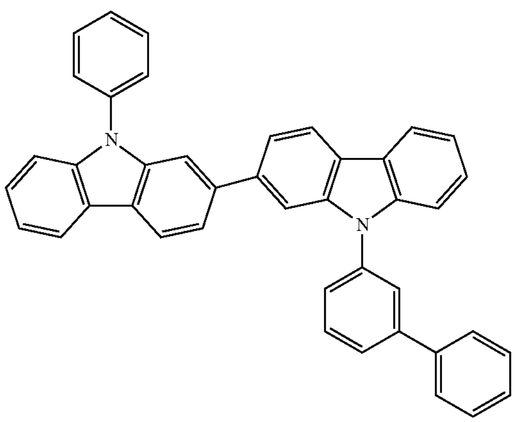
H-H21
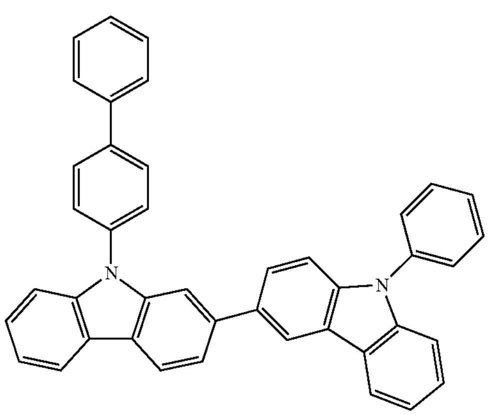
-continued
H-H22
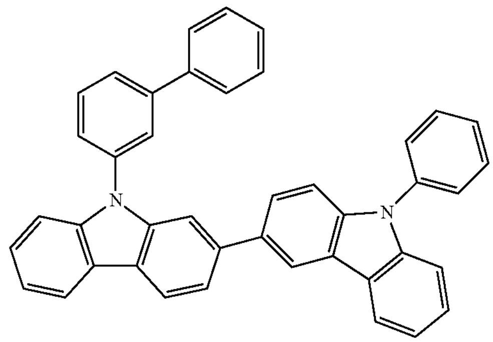
H-H23
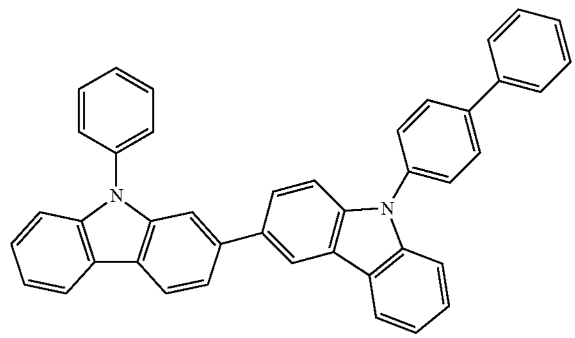
H-H24
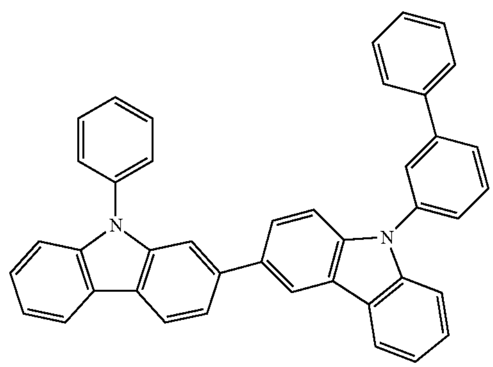
H-H25
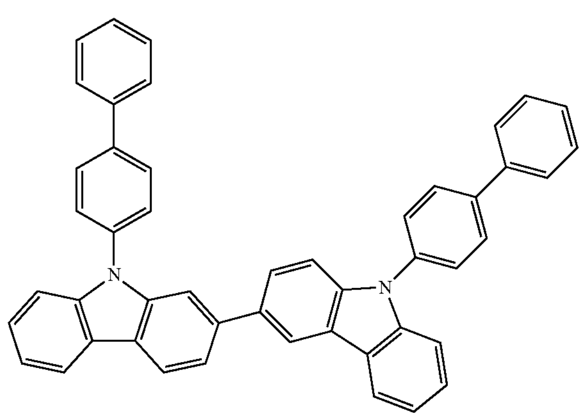

-continued
H-H26
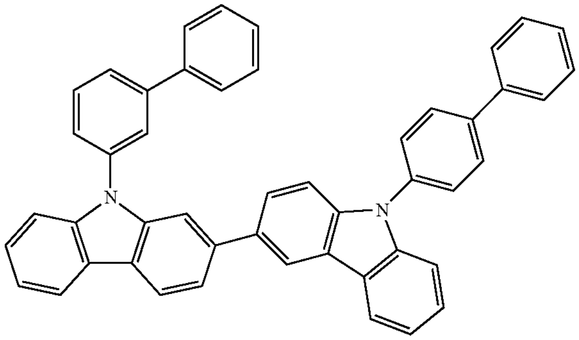
H-H27
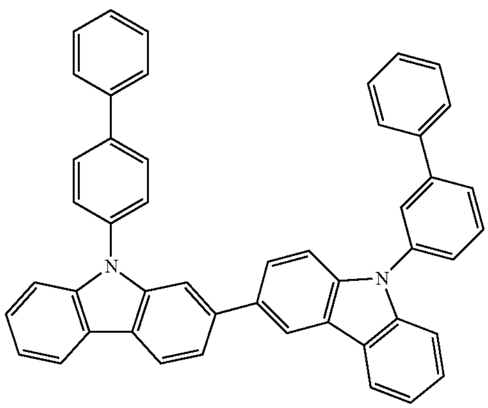
H-H28
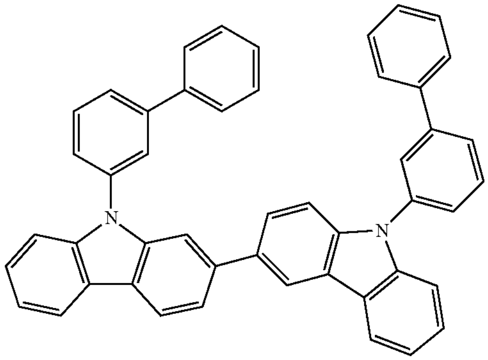
-continued
H-H29
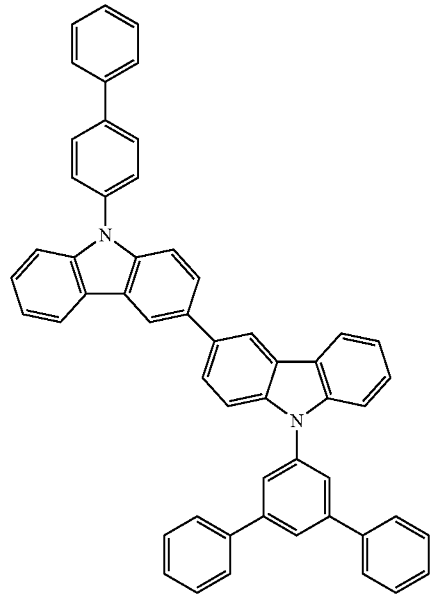
H-H30
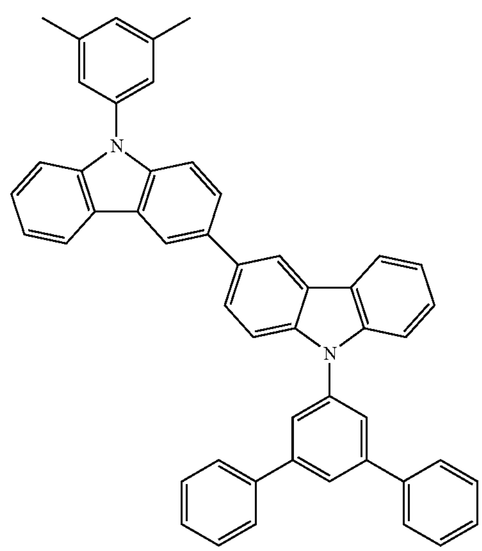

-continued
H-H31
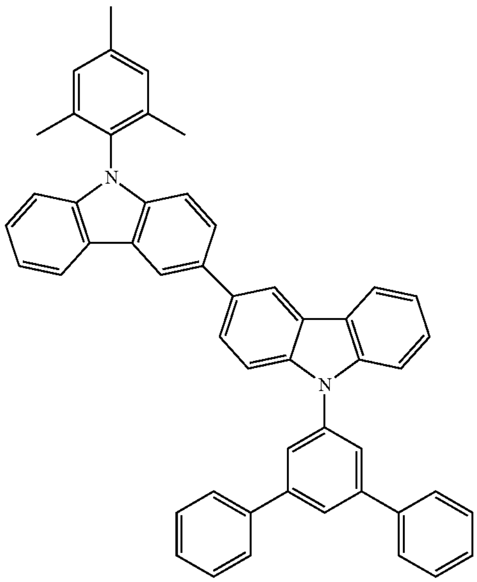
H-H32
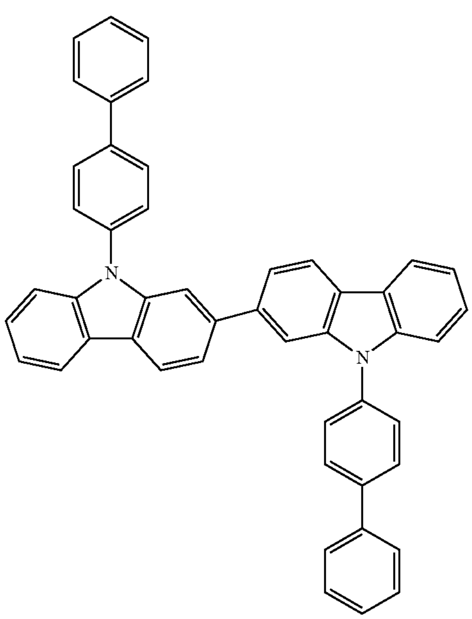
-continued
H-H33
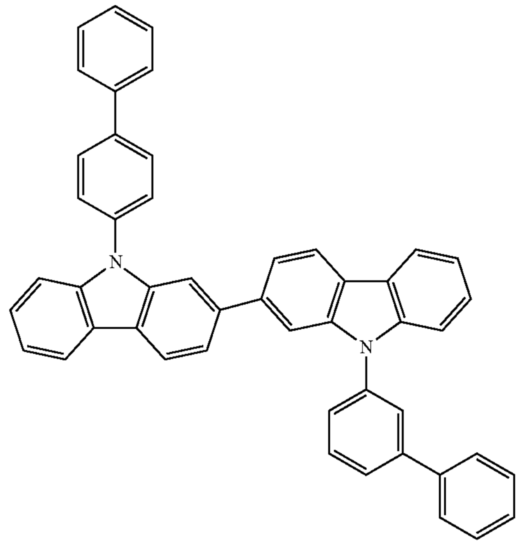
H-H34
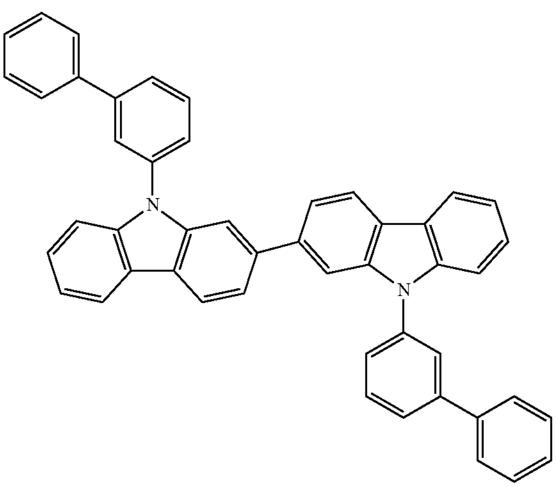
H-H35
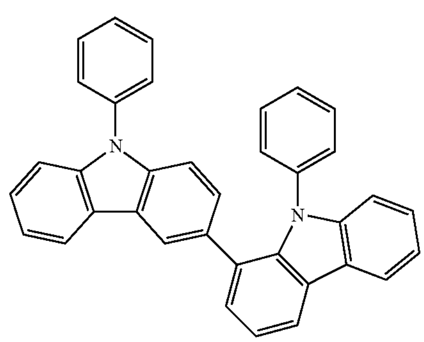

-continued
H-H36
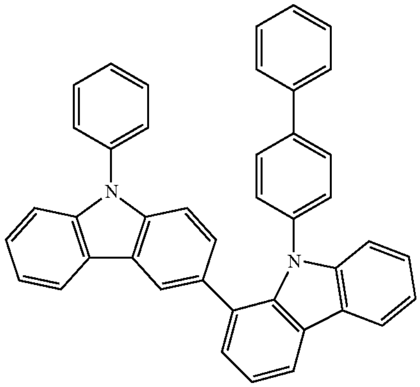
H-H37
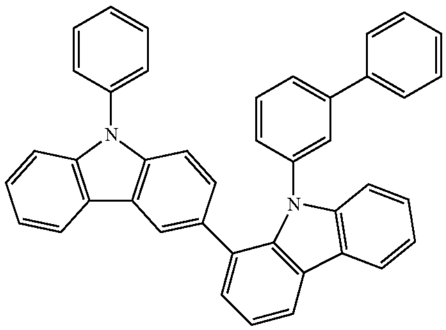
H-H38
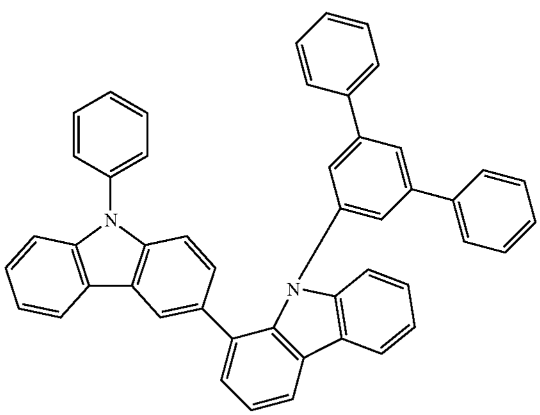
H-H39
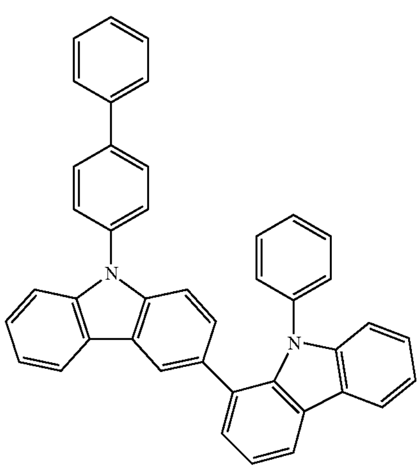
-continued
H-H40
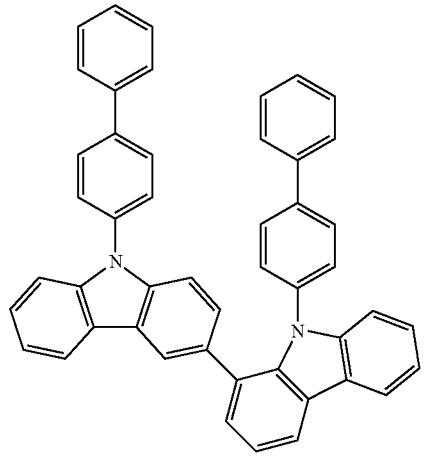
H-H41
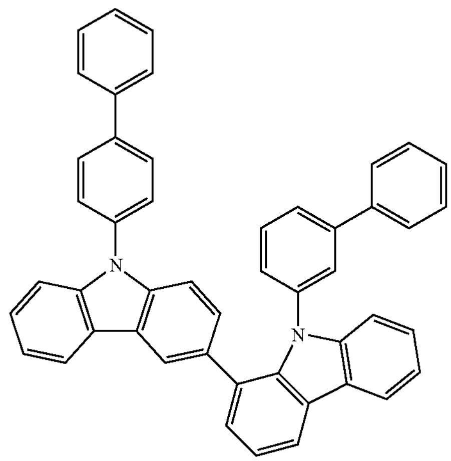
H-H42
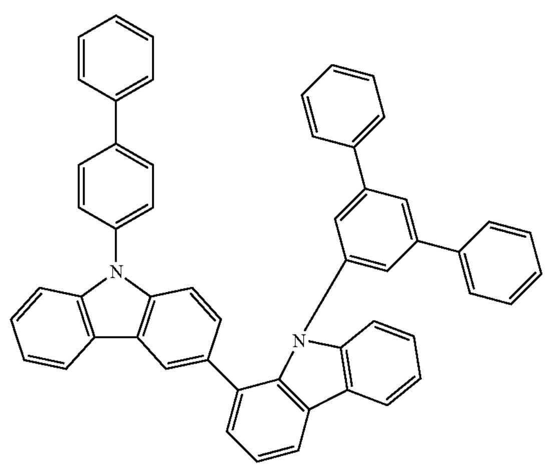

-continued
H-H43
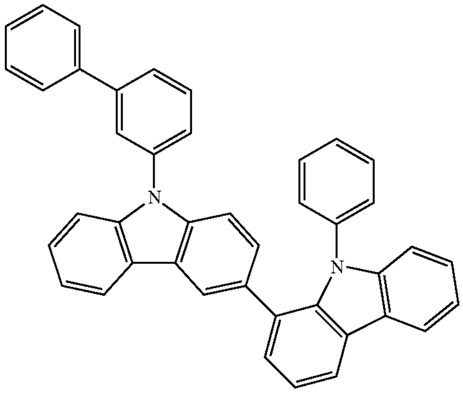
H-H44
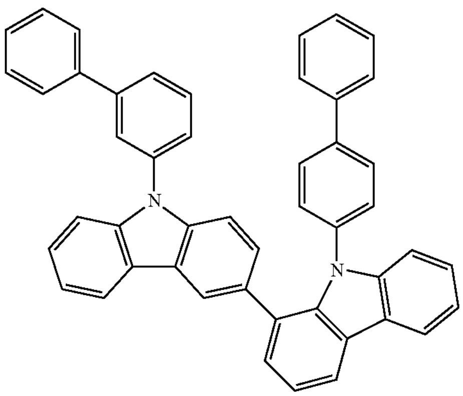
H-H45
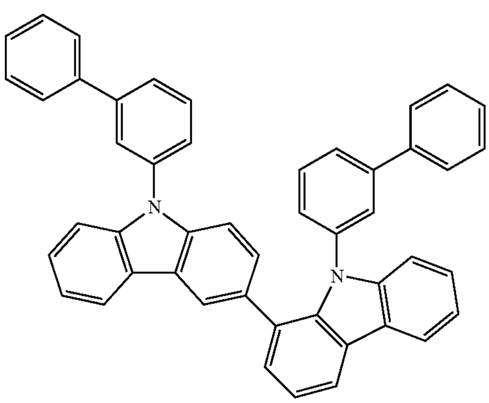
H-H46
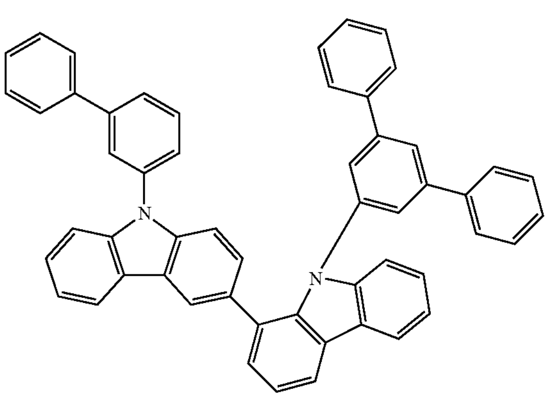
-continued
H-H47
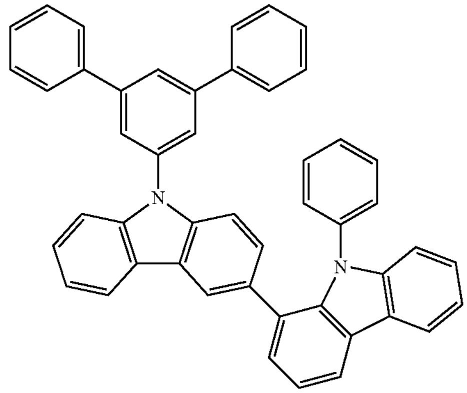
H-H48
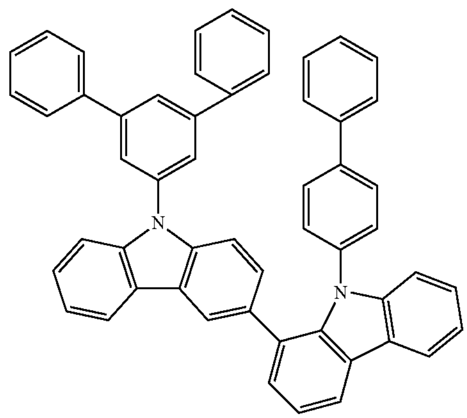
H-H49
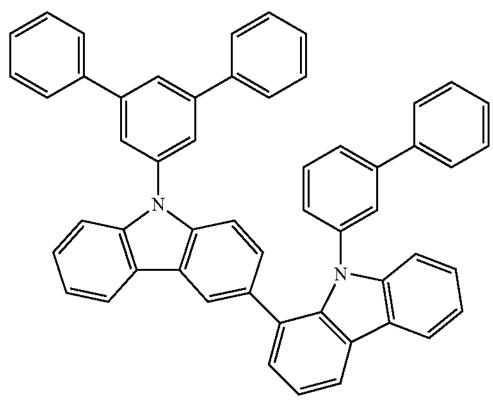
H-H50
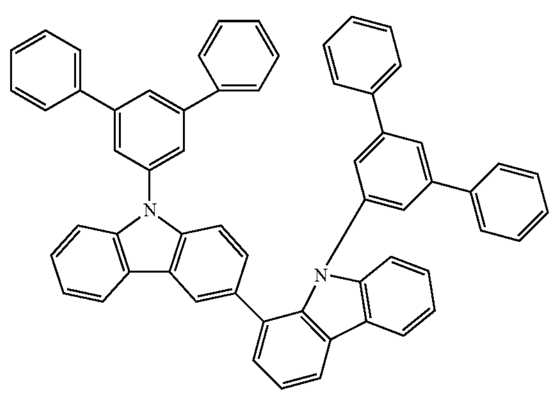

H-H51
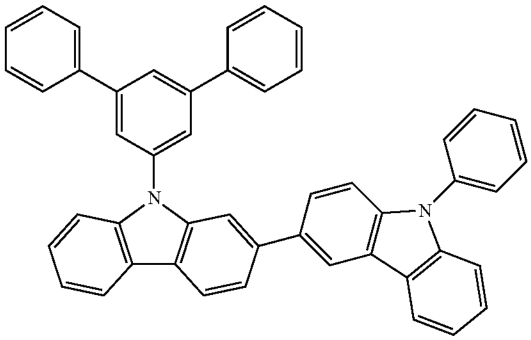
H-H52
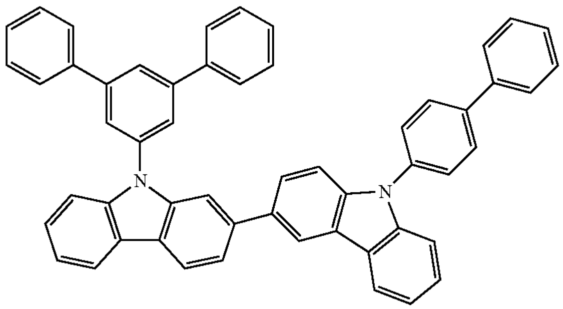
H-H53
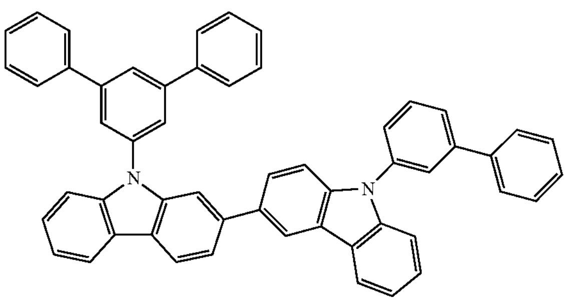
H-H54
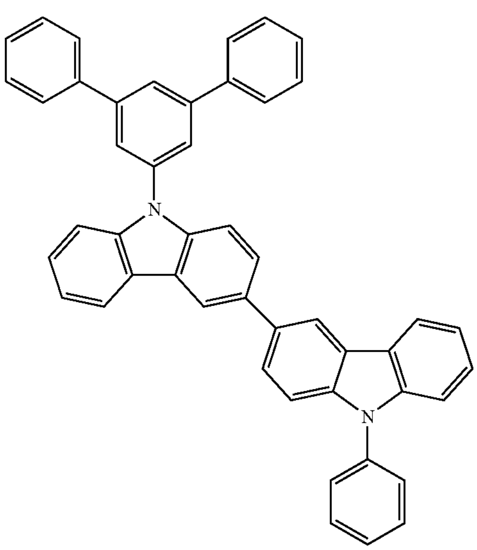
H-H55
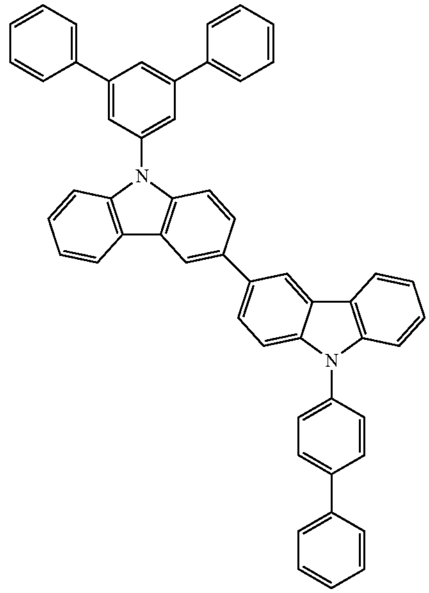
H-H56
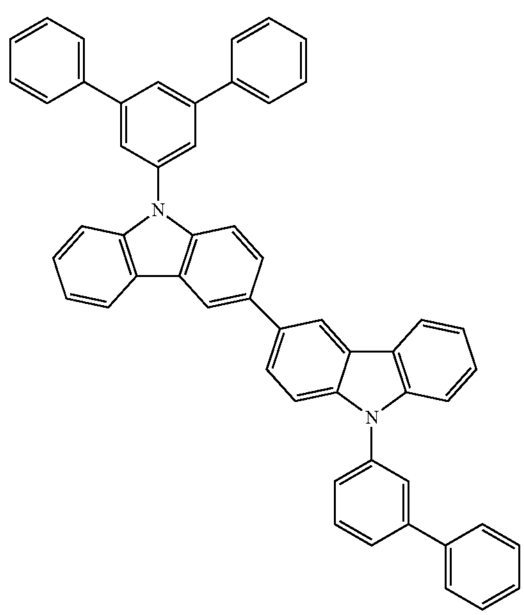

-continued
H-H57
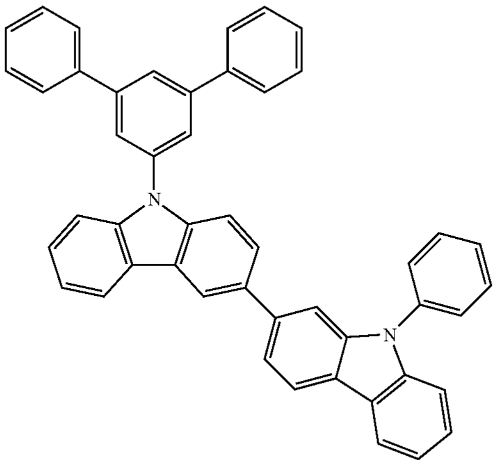
H-H58
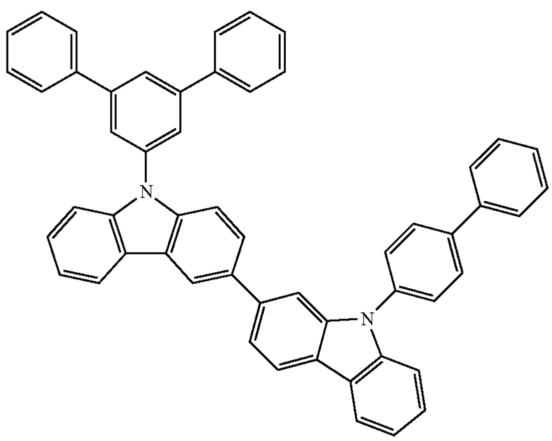
H-H59
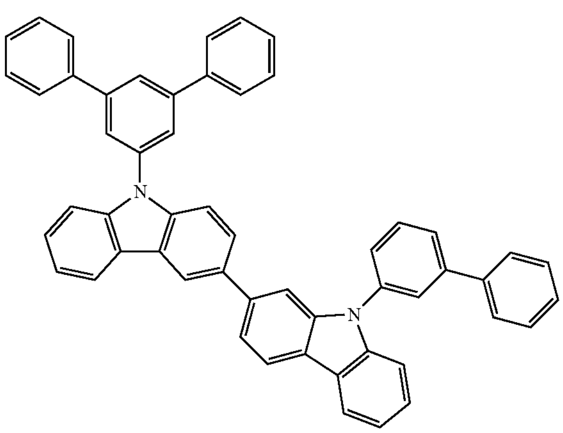
-continued
H-H60
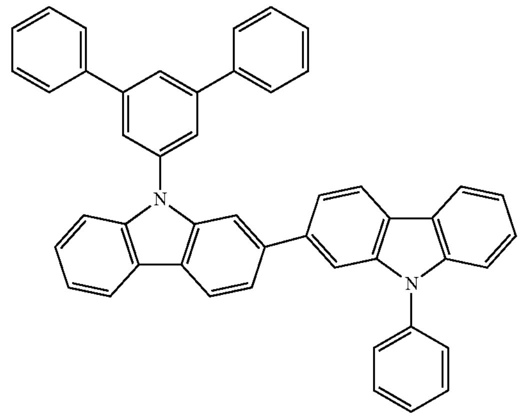
H-H61
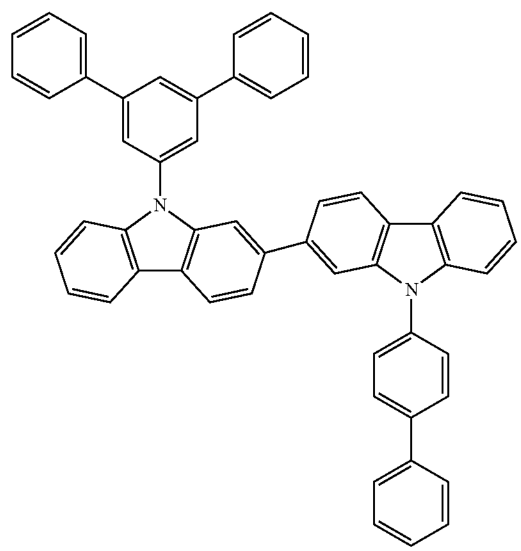
H-H62
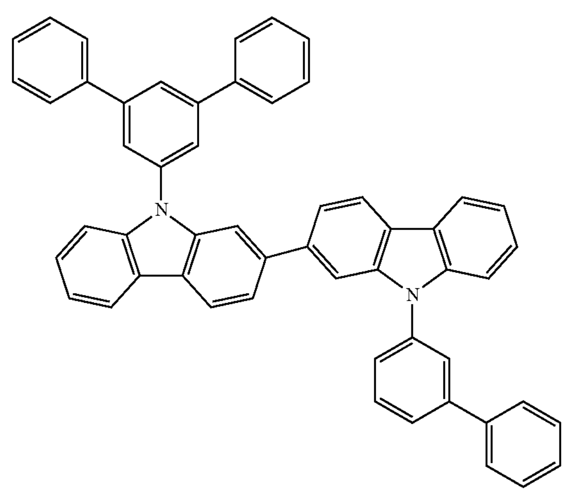

-continued
H-H63
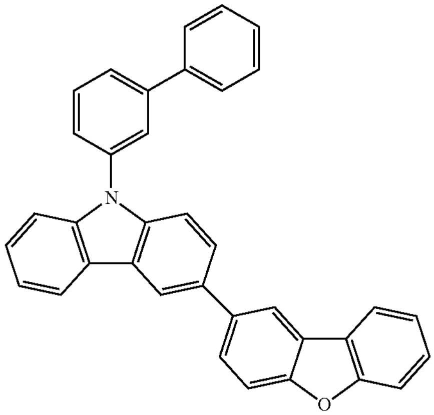
H-H64
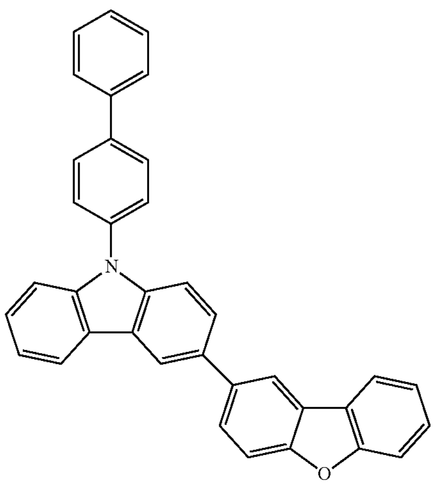
H-H65
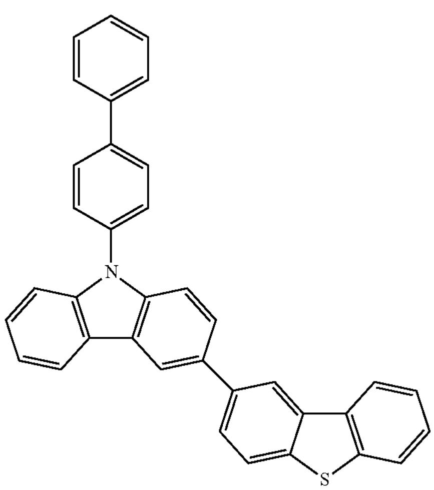
-continued
H-H66
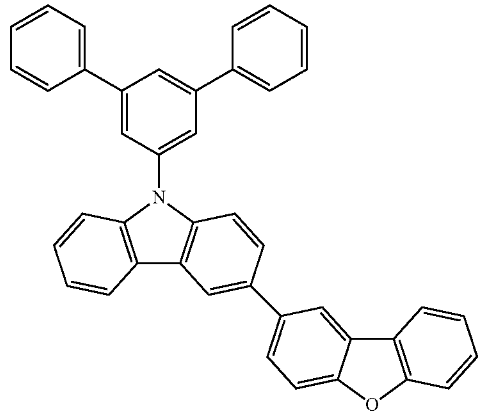
H-H67
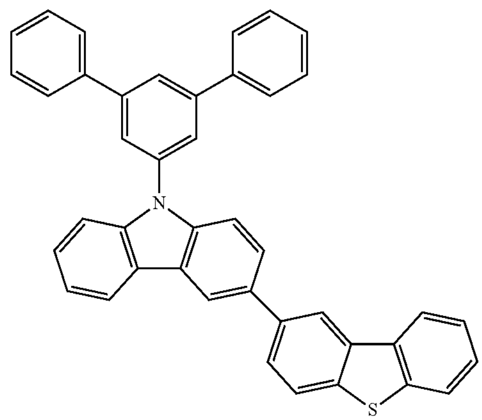
H-H68
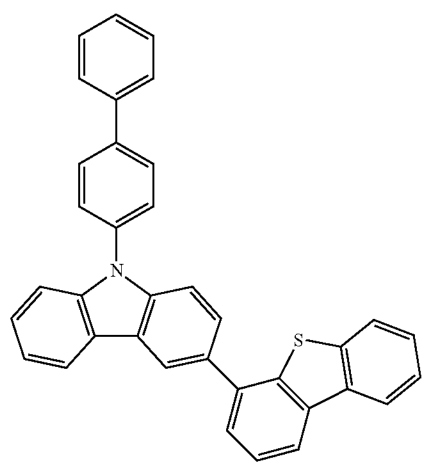

-continued
H-H69
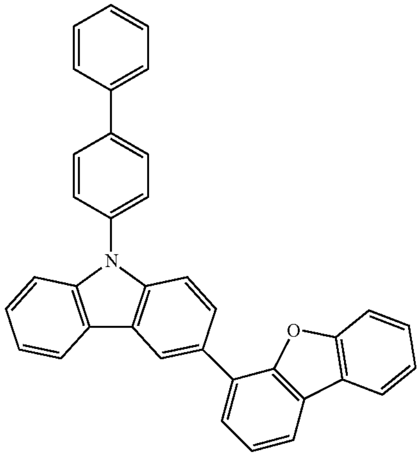
H-H70
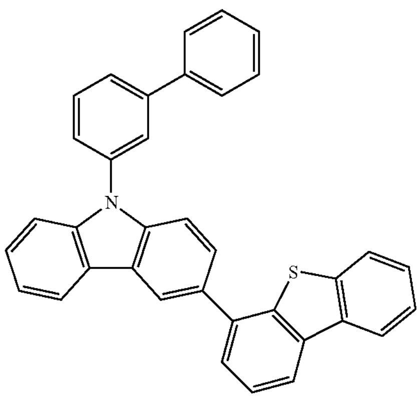
H-H71
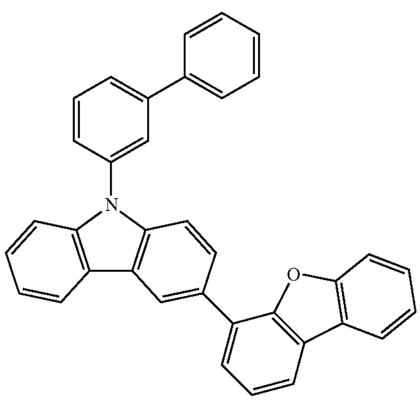
H-H72
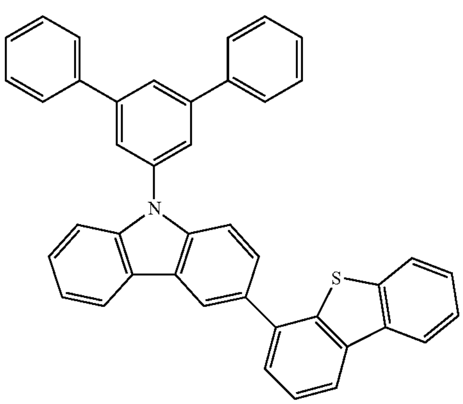
-continued
H-H73
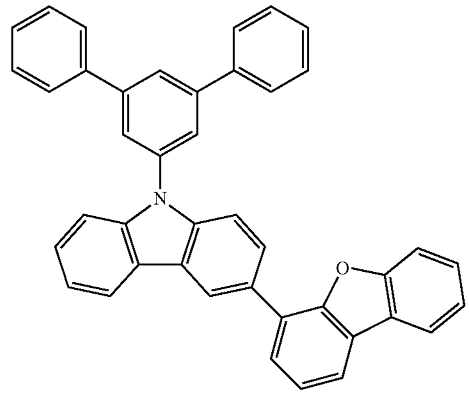
H-H74
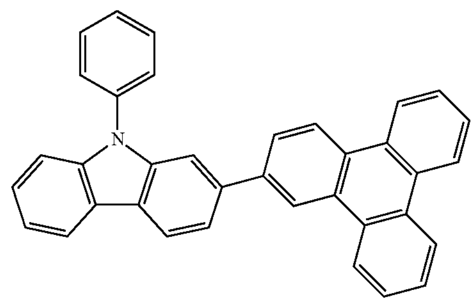
H-H75
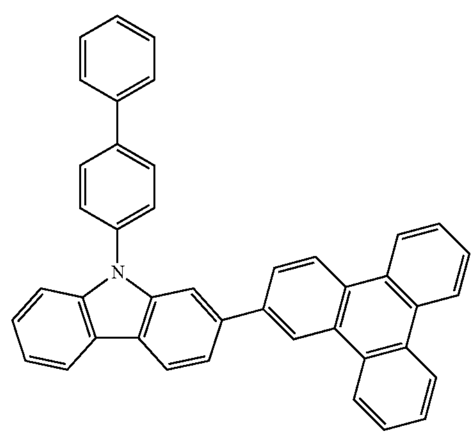

-continued
H-H76
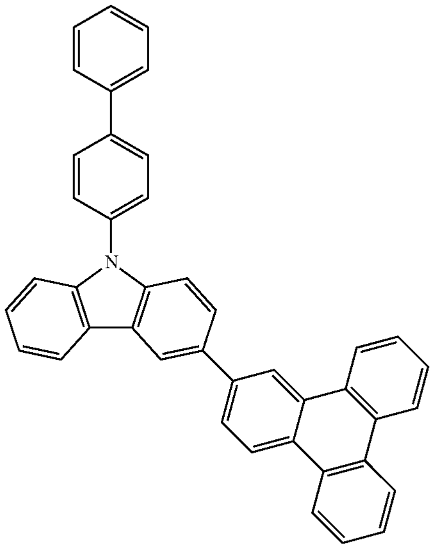
H-H77
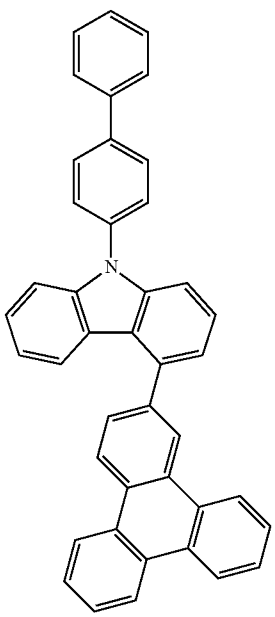
H-H78
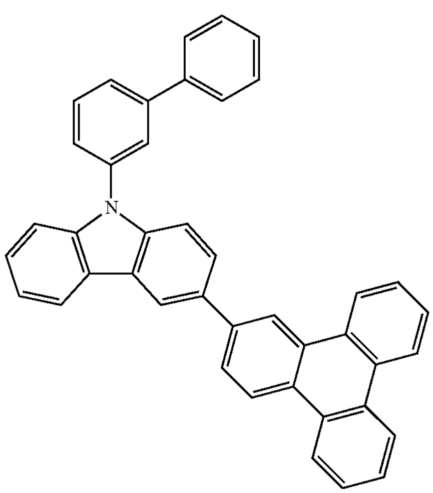
-continued
H-H79
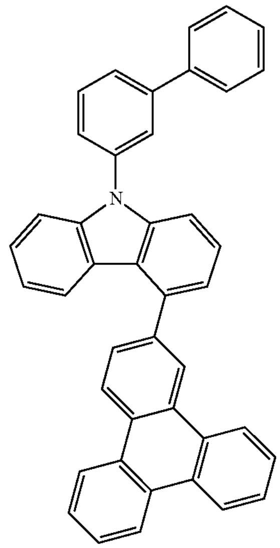
H-H80
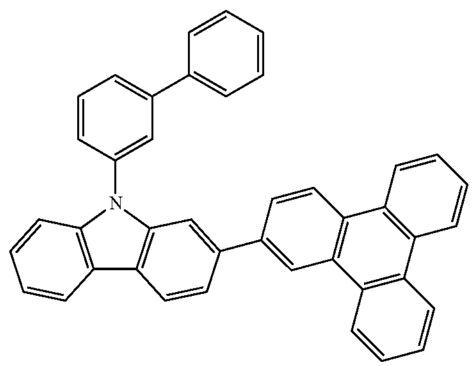
H-H81
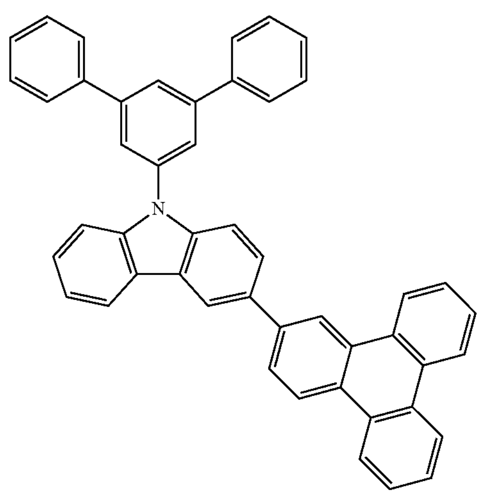

-continued
H-H82
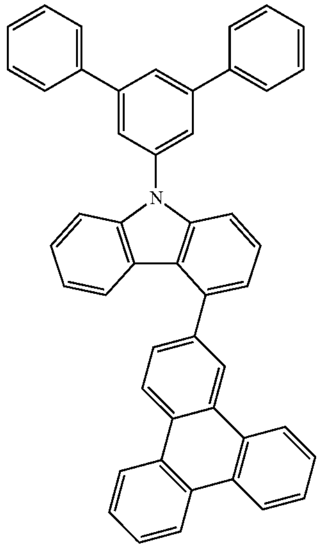
H-H83
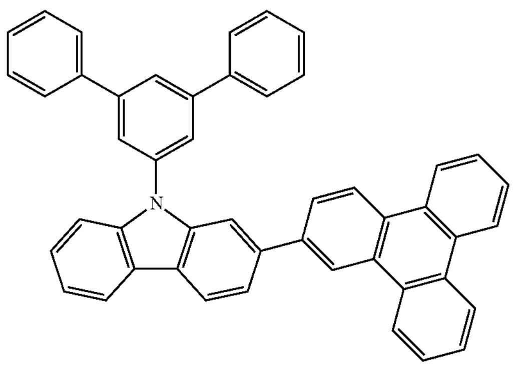
H-H84
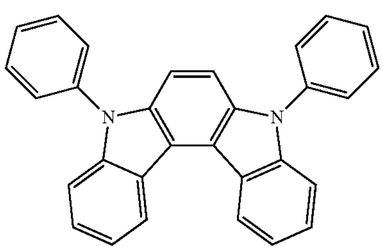
H-H85
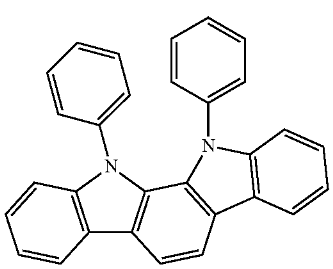
-continued
H-H86
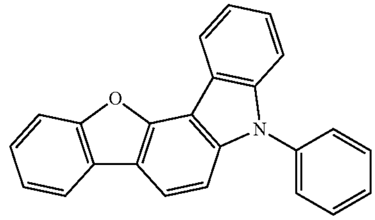
H-H87
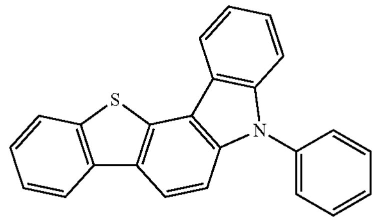
H-H88
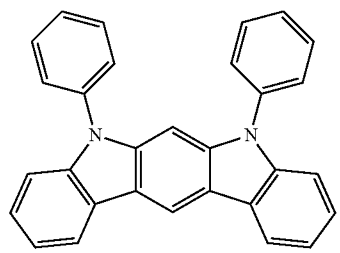
H-H89
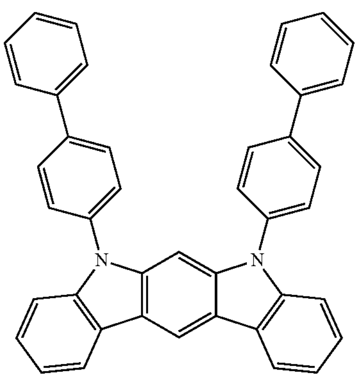
H-H90
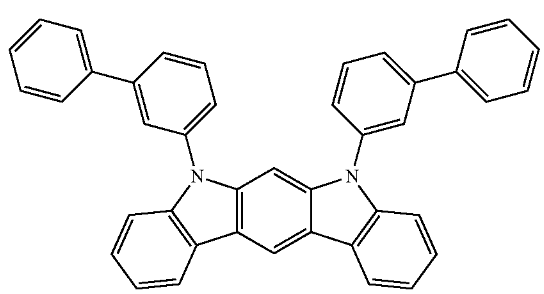

-continued
H-H91
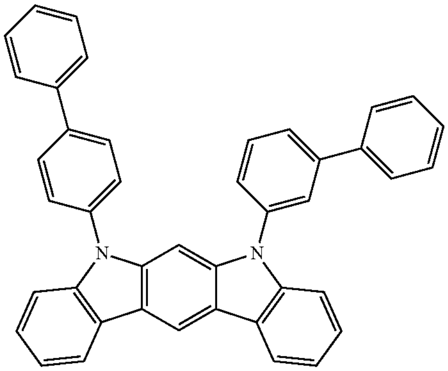
H-H92
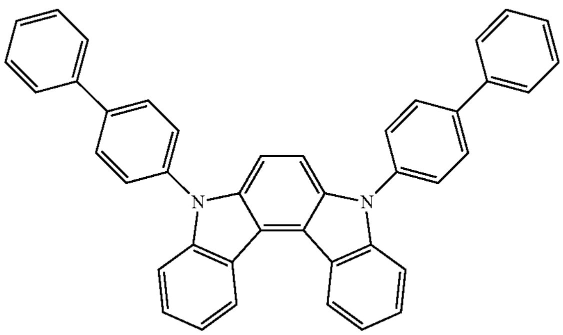
H-H93
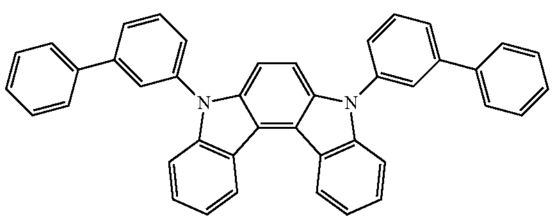
H-H94
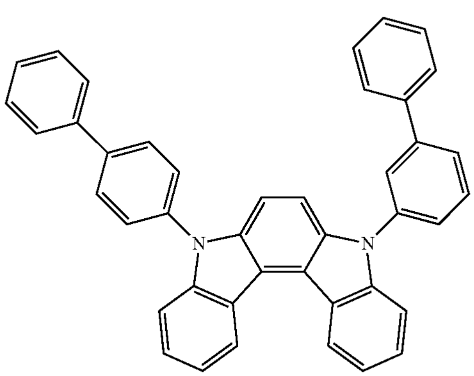
-continued
H-H95
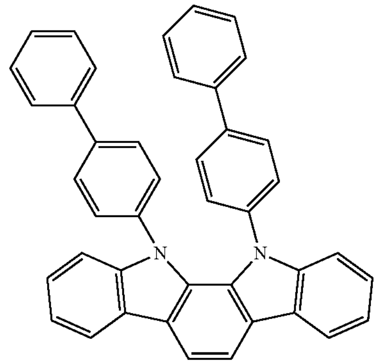
H-H96
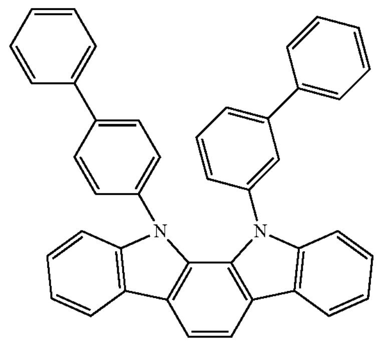
H-H97
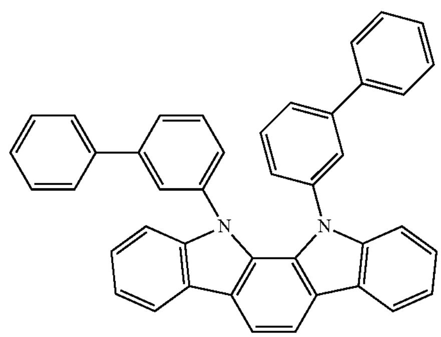
H-H98
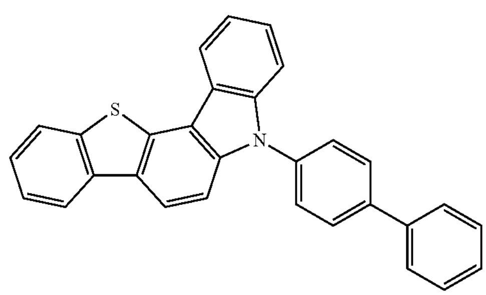
H-H99
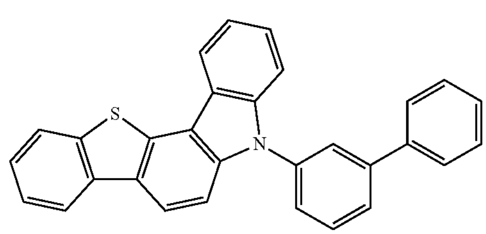

-continued
H-H100
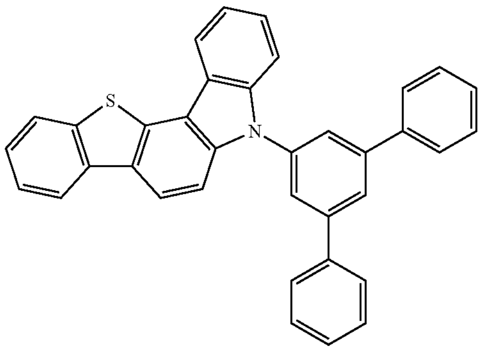
H-H101
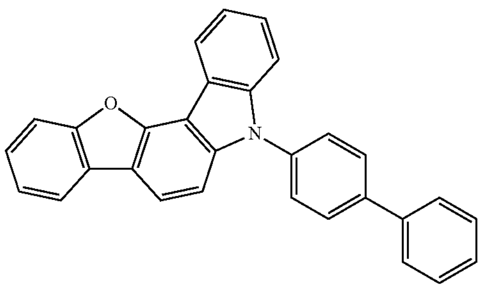
H-H102
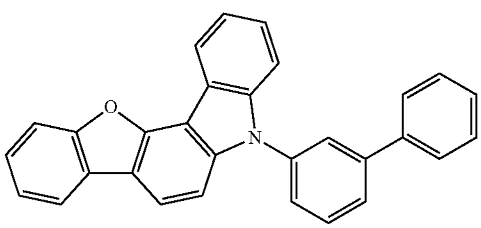
H-H103
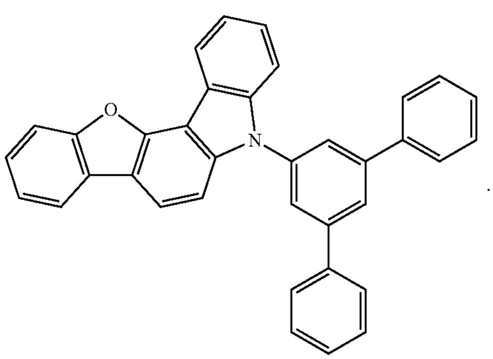
In one or more embodiments, the bipolar host may be of Group HEH1, but embodiments of the present disclosure are not limited thereto:
Group HEH1
1
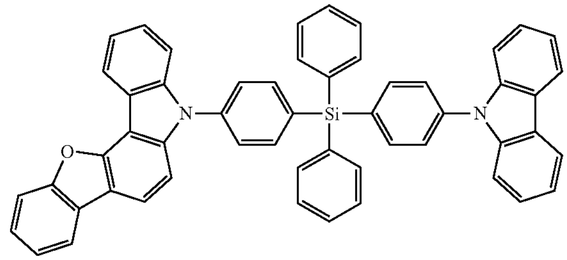
2
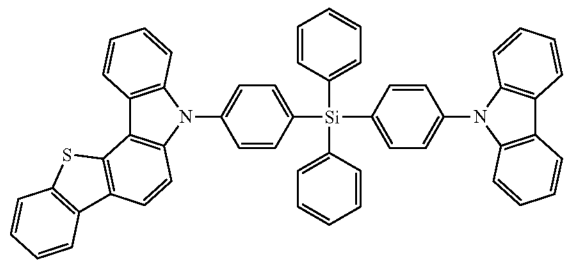
3
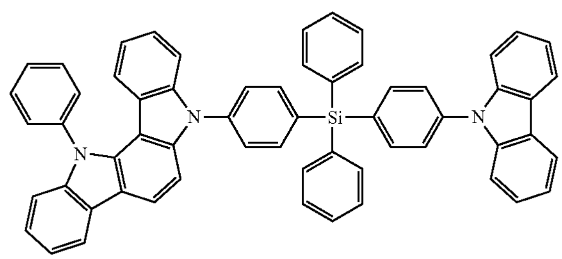
4
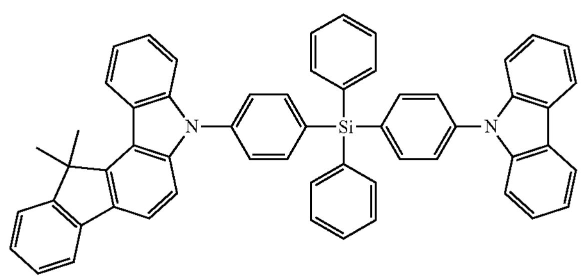
5
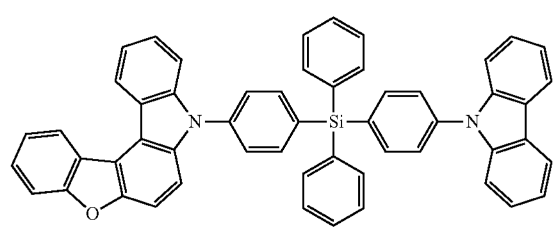

-continued
6
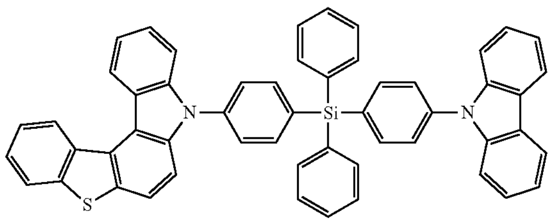
7
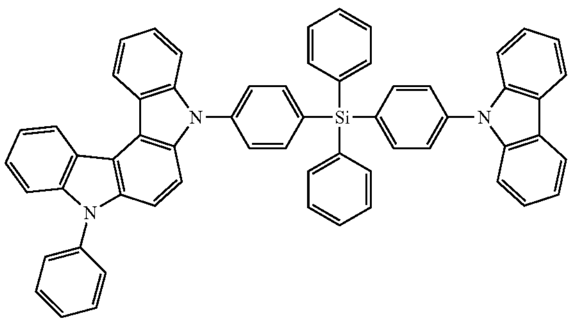
8
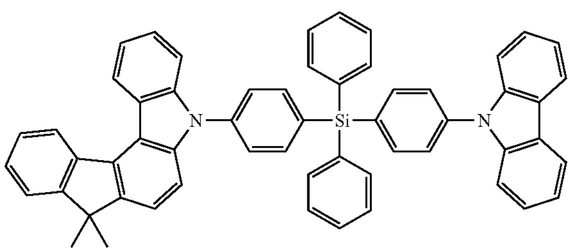
9
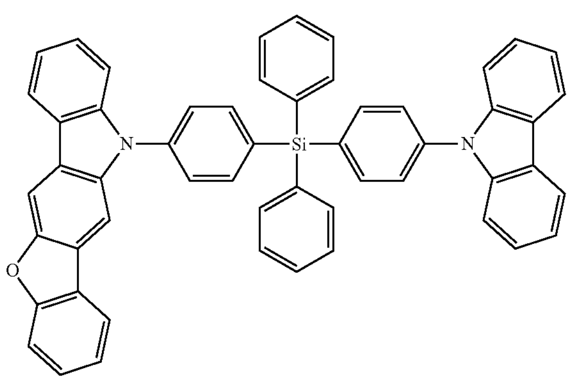
10
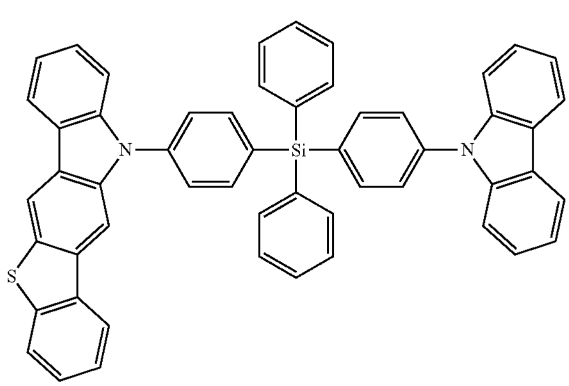
-continued
11
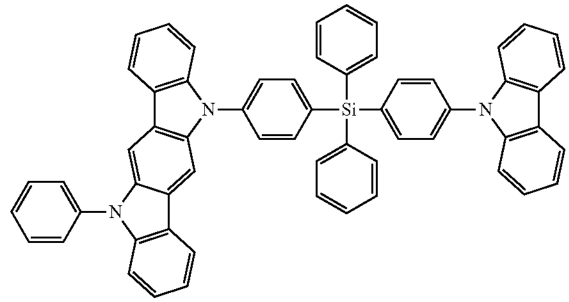
12
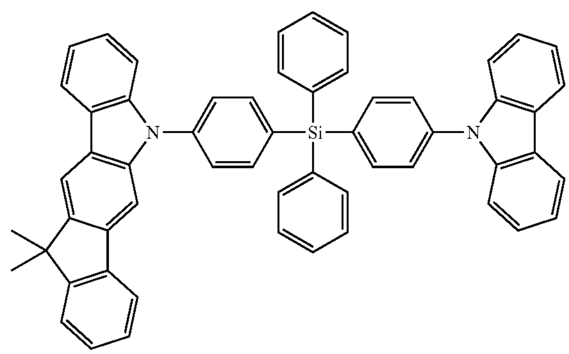
13
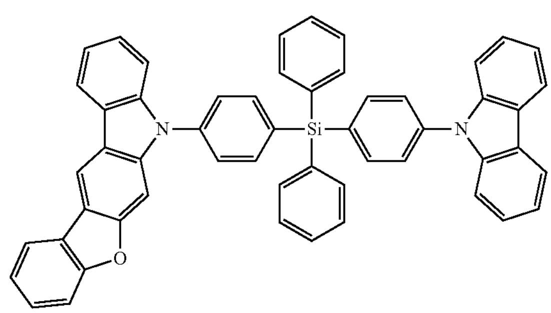
14
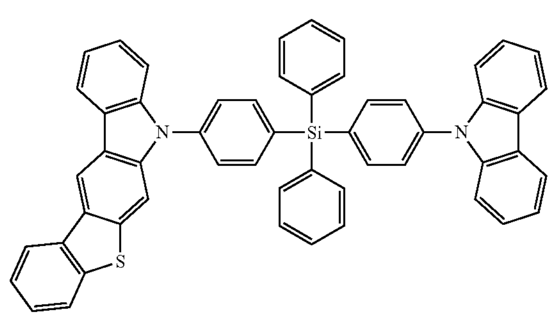

15
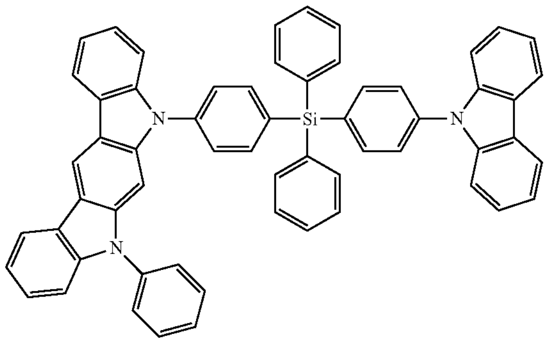
16
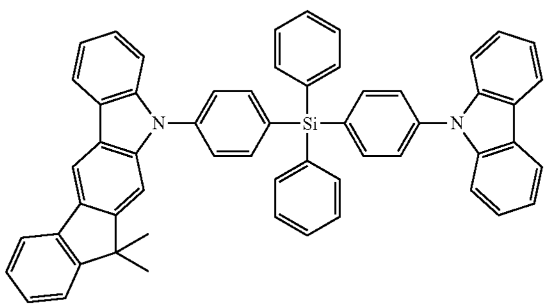
17
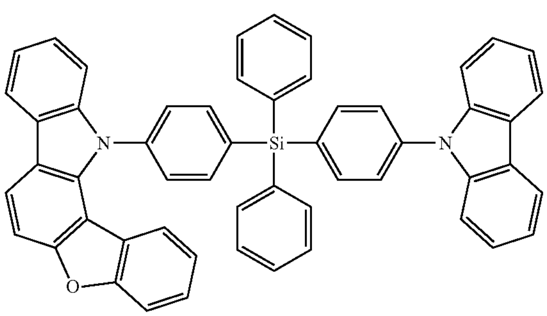
18
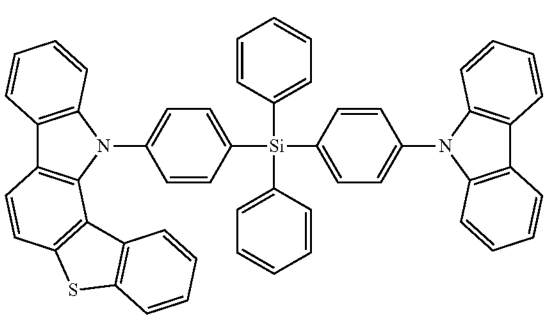
19
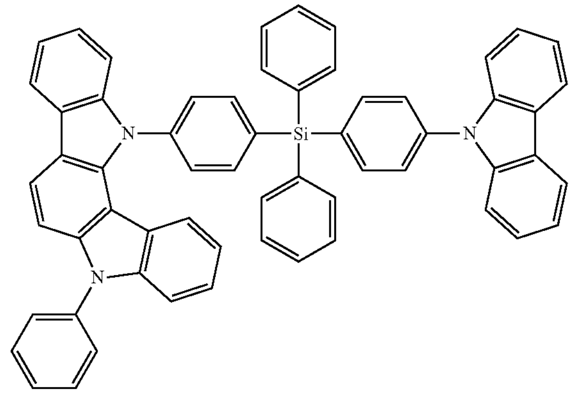
20
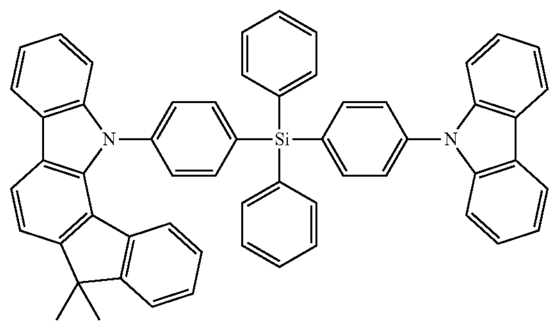
21
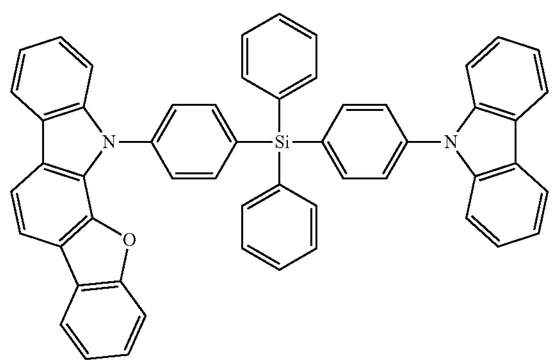
22
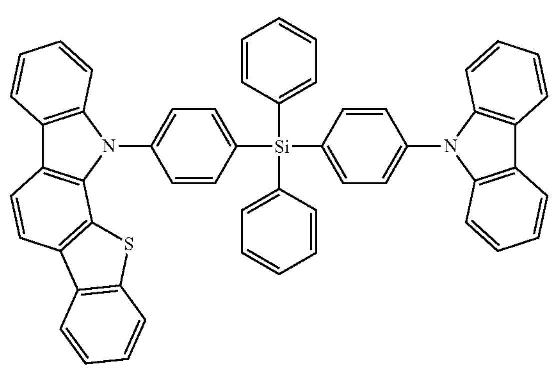

-continued
23
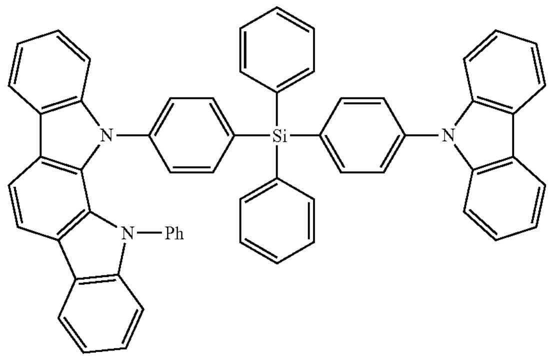
24
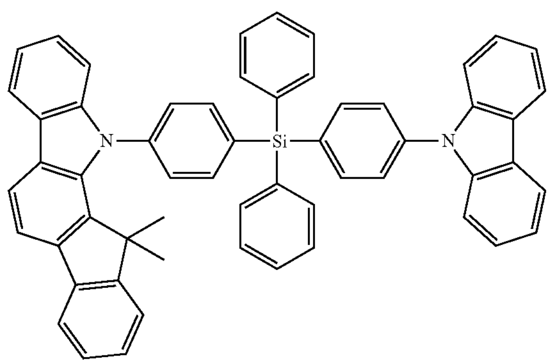
25
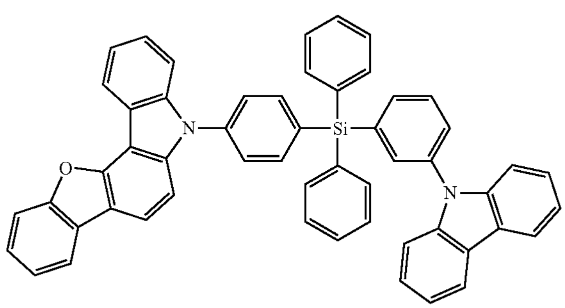
26
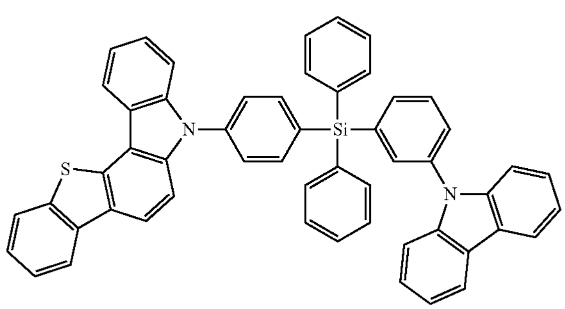
-continued
27
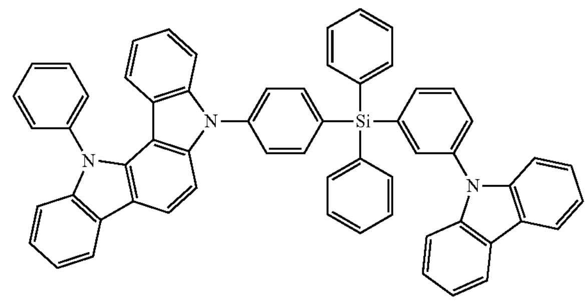
28
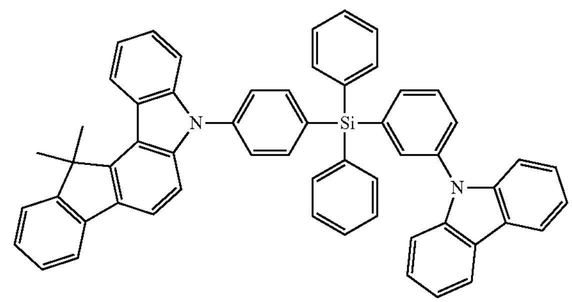
29
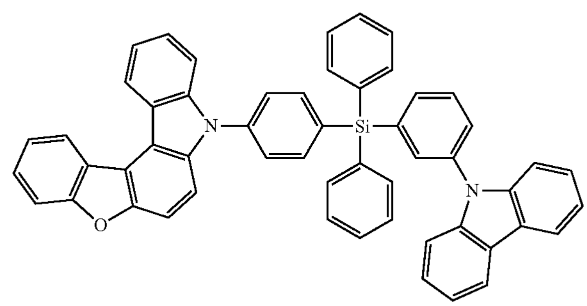
30
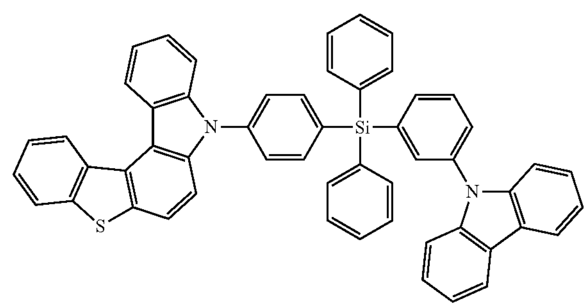
31
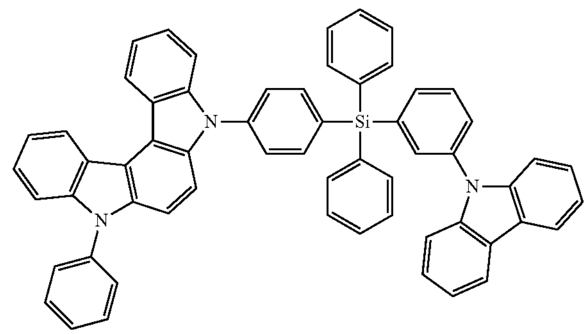

-continued
32
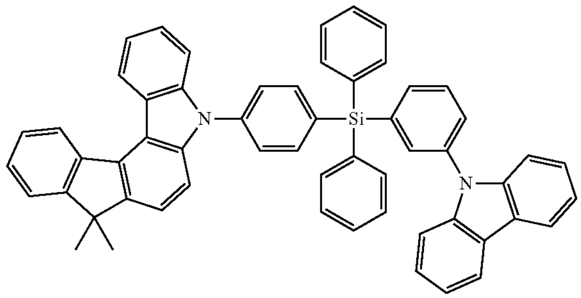
33
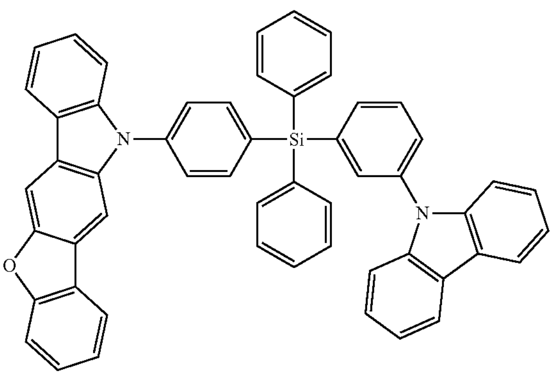
34
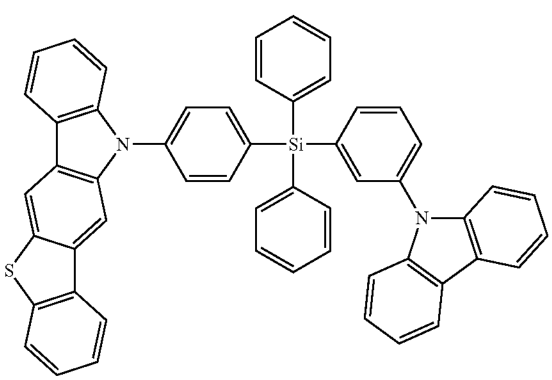
35
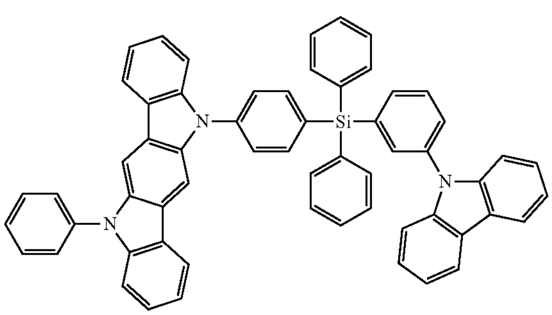
-continued
36
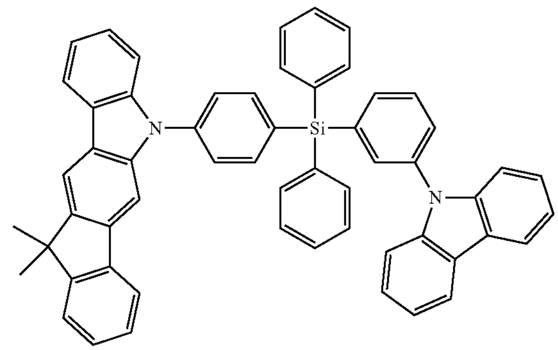
37
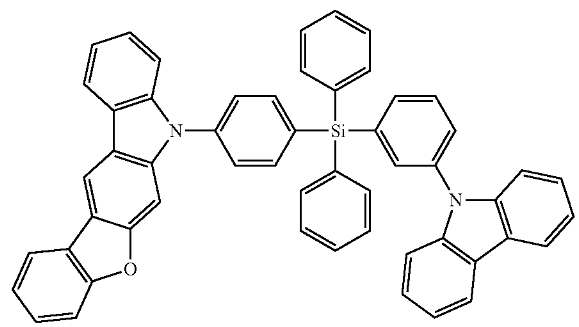
38
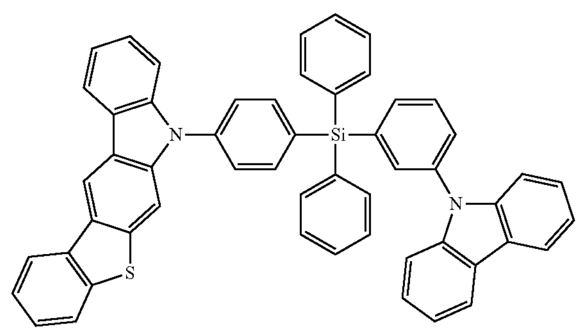
39
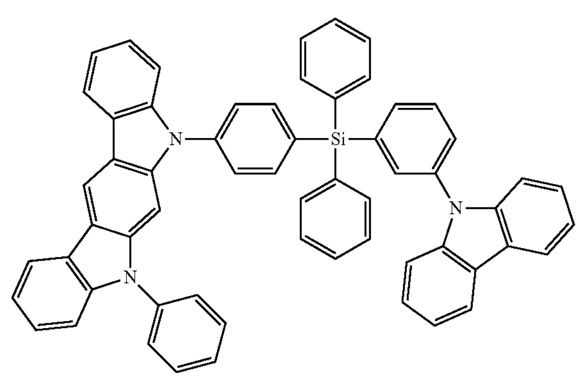

40
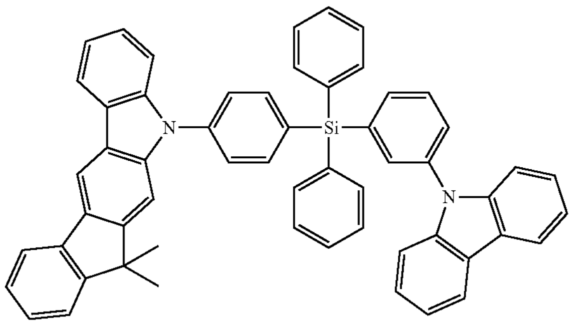
41
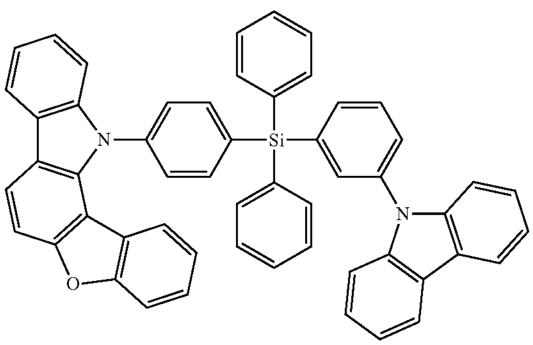
42
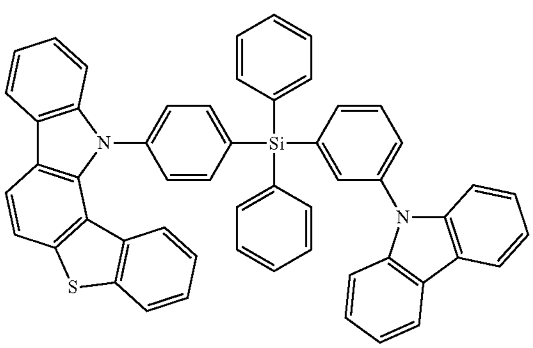
43
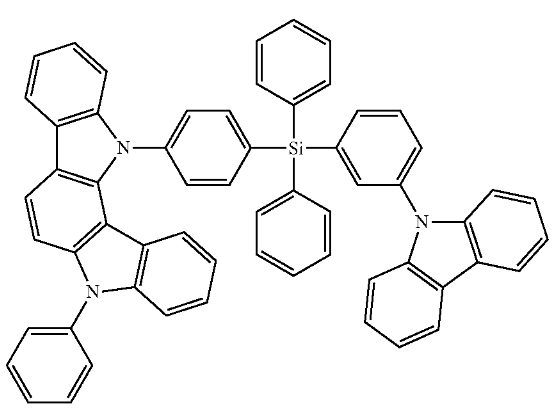
44
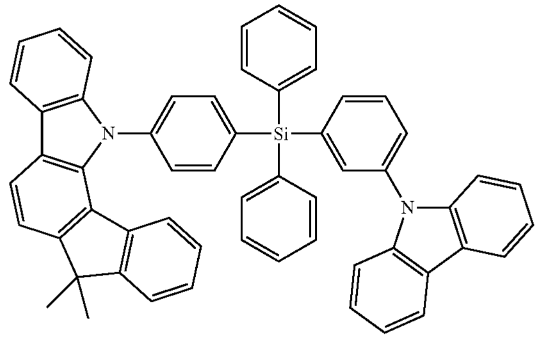
45
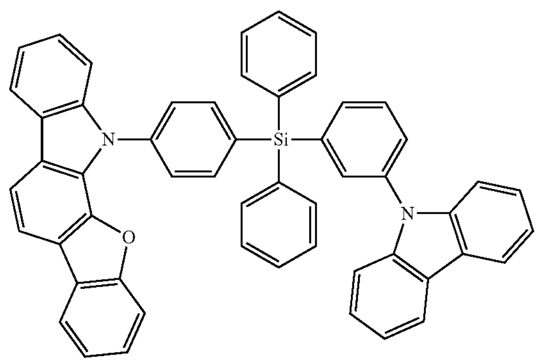
46
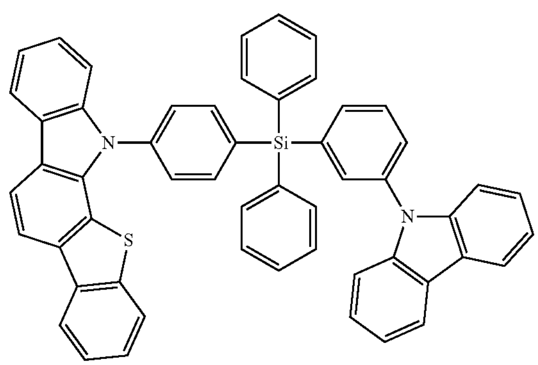
47
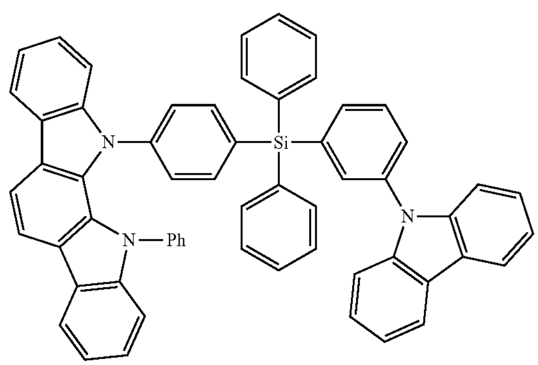

48
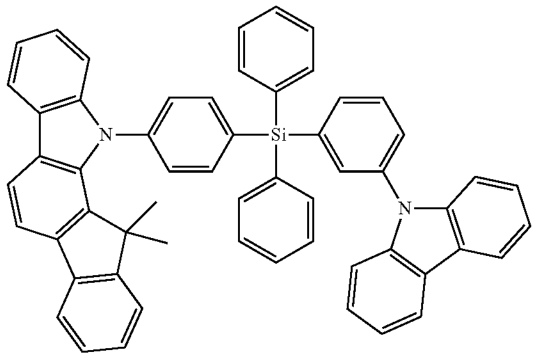
49
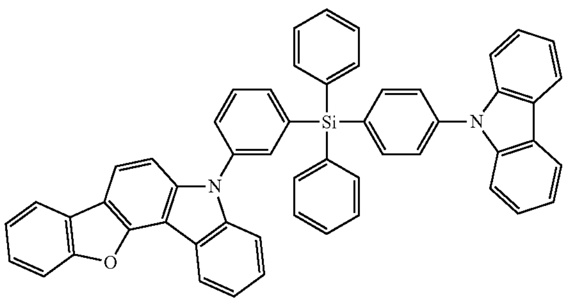
50
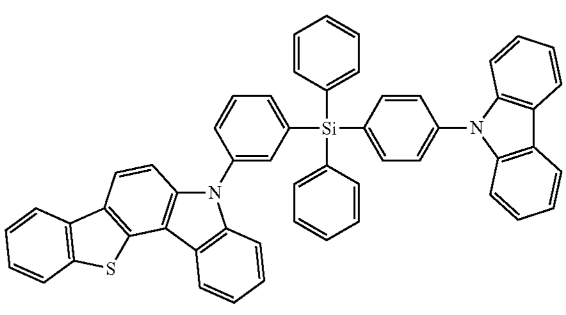
51
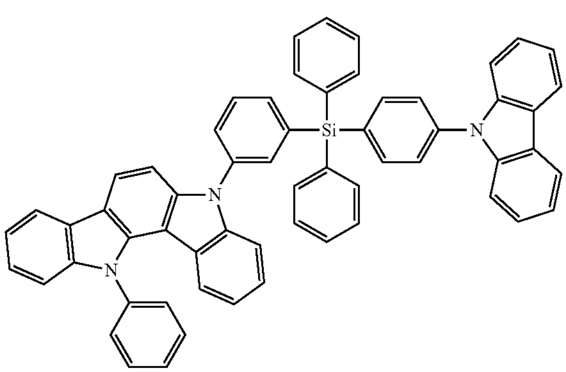
52
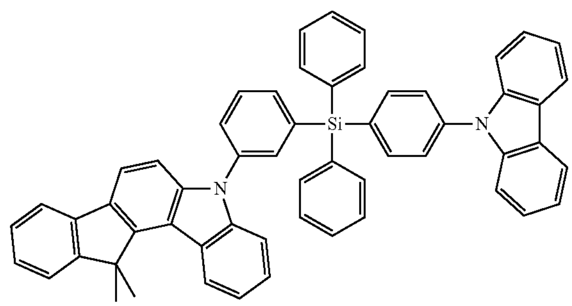
53
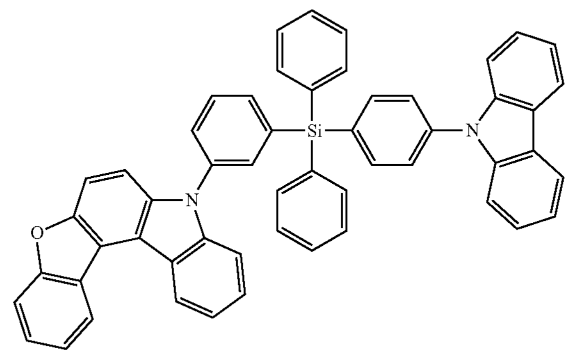
54
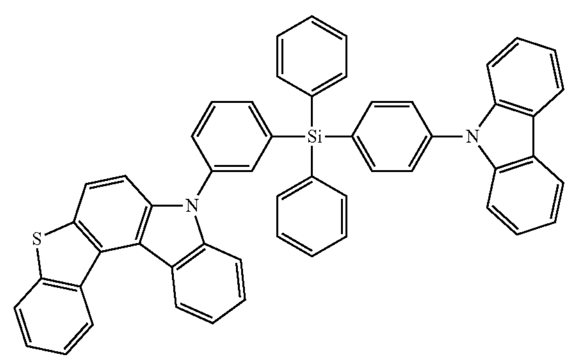
55
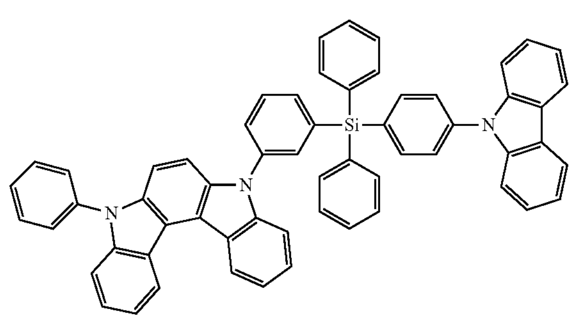

-continued
56
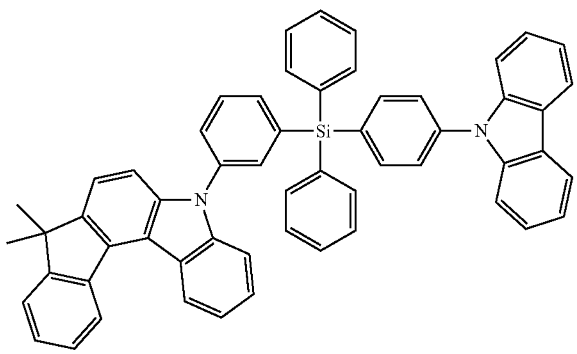
57
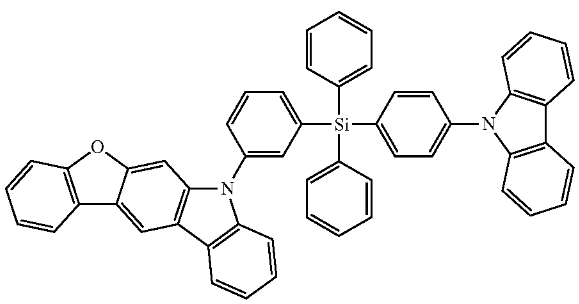
58
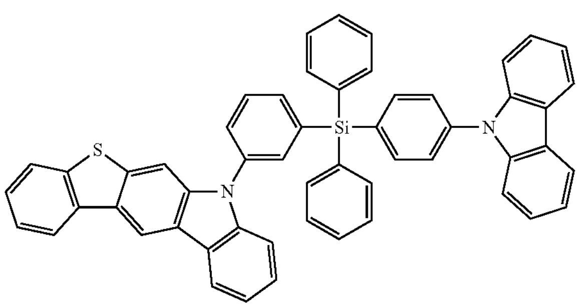
59
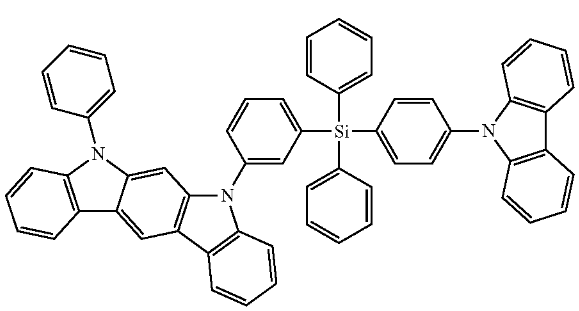
-continued
60
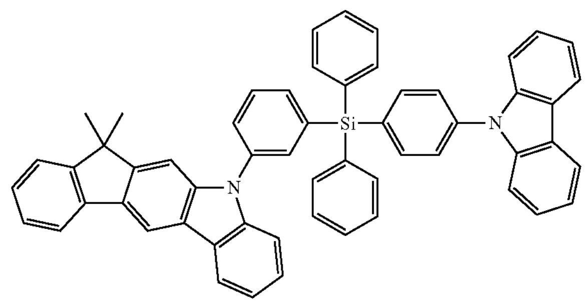
61
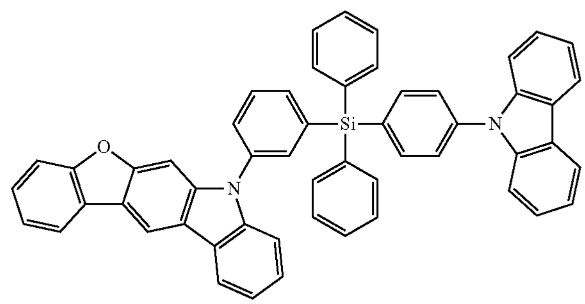
62
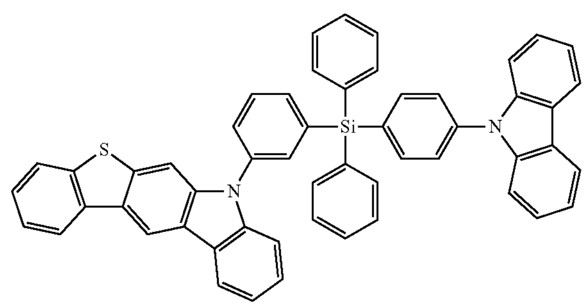
63
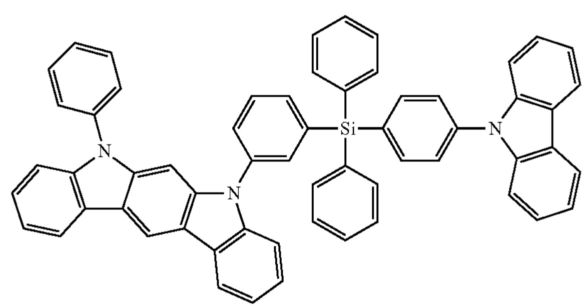
64
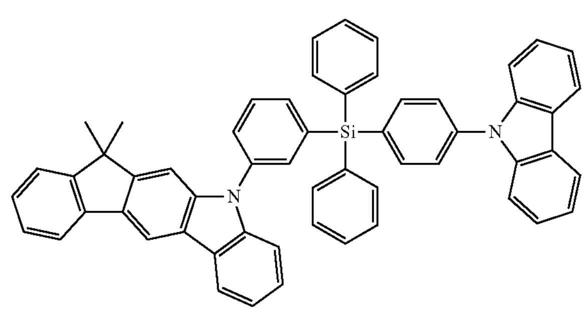

-continued
65
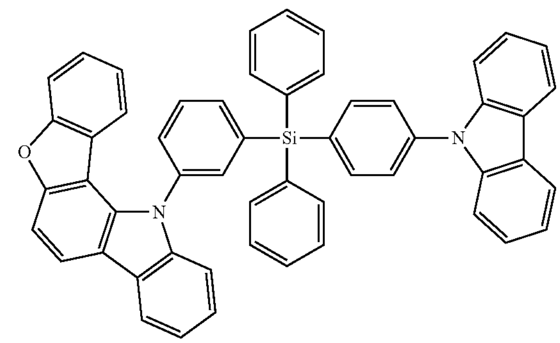
66
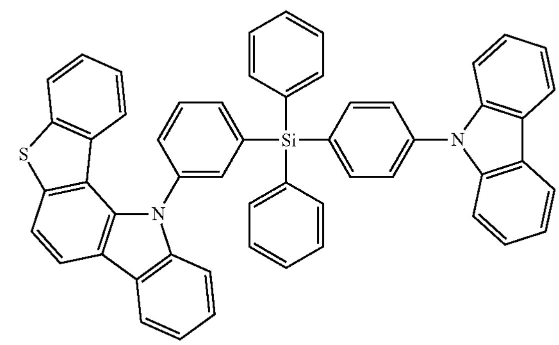
67
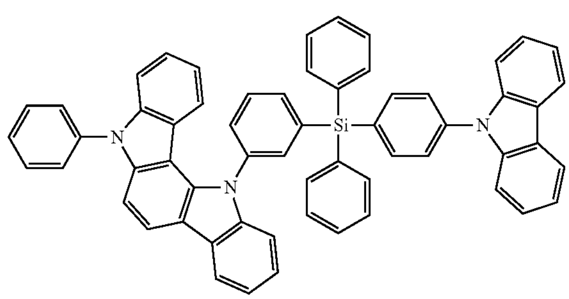
68
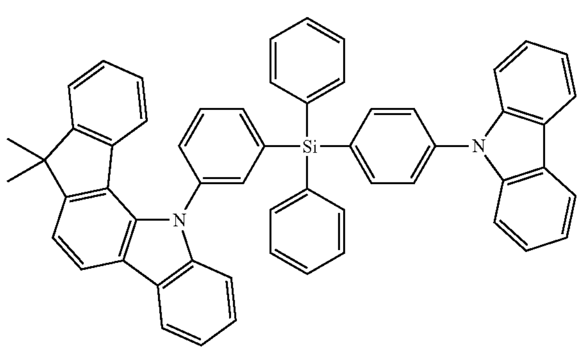
-continued
69
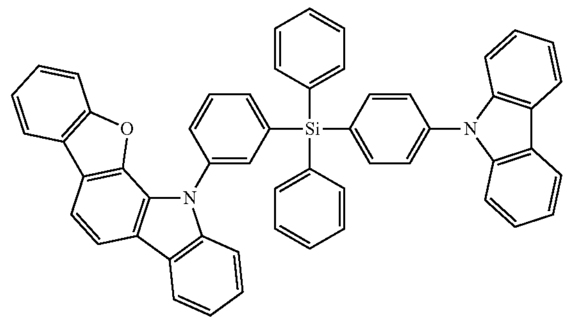
70
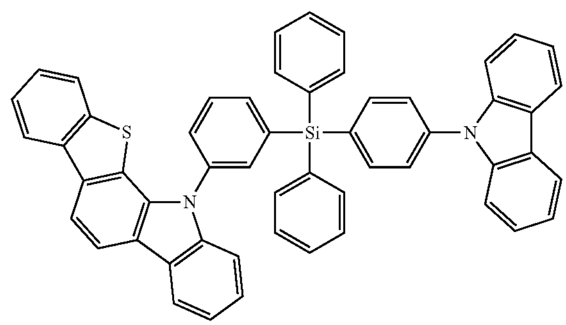
71
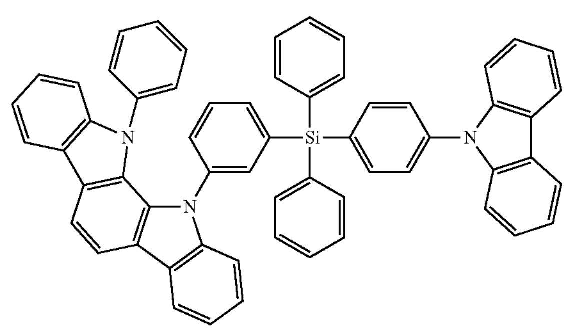
72
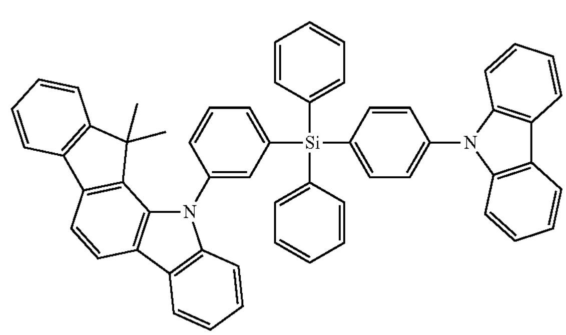

-continued
73
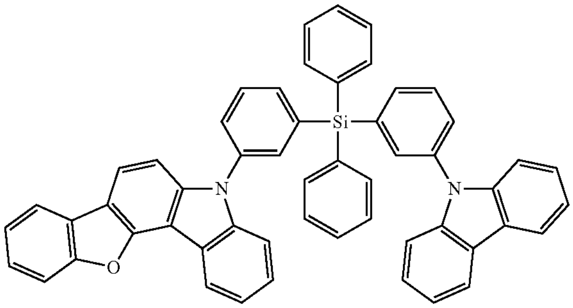
74
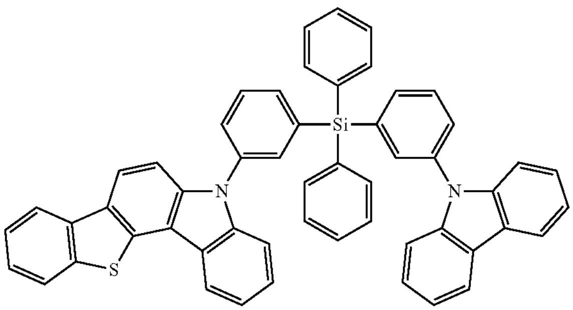
75
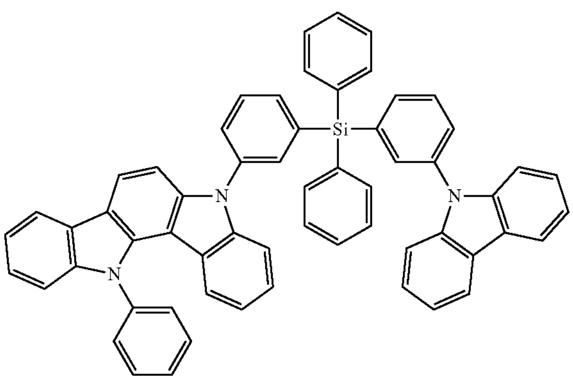
76
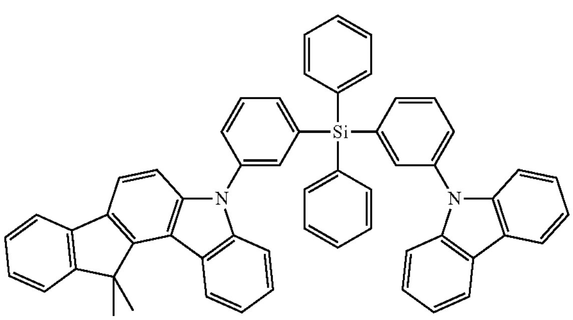
-continued
77
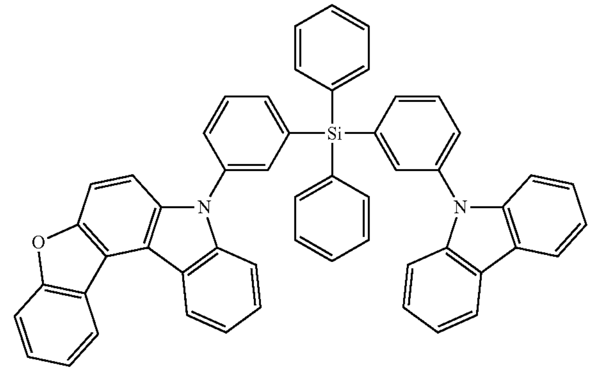
78
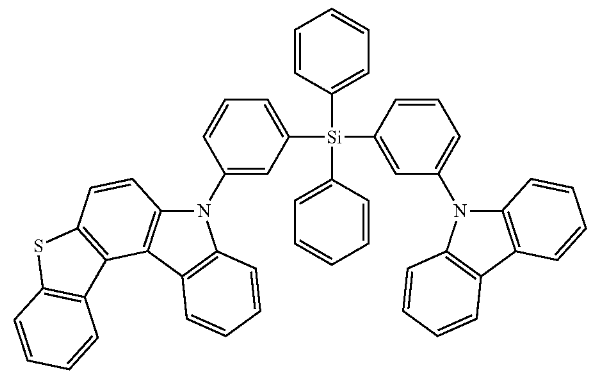
79
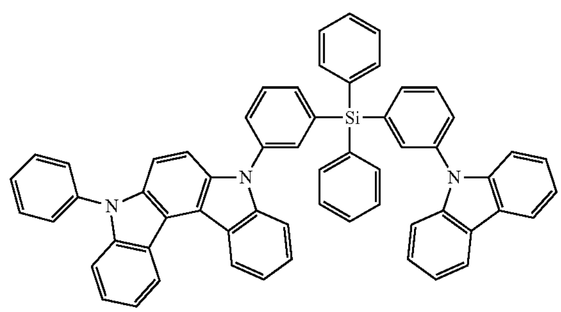
80
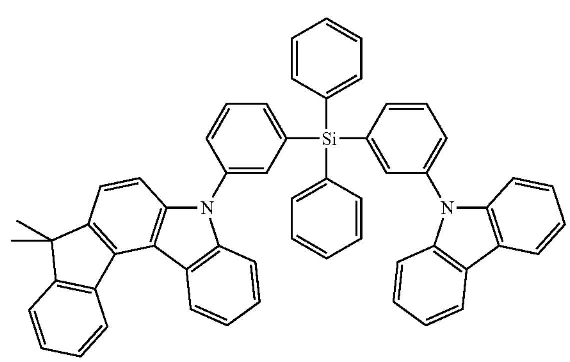

-continued
81
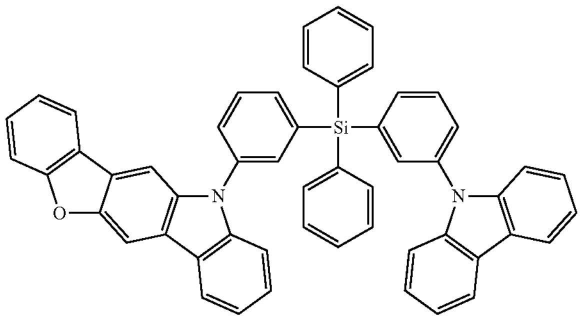
82
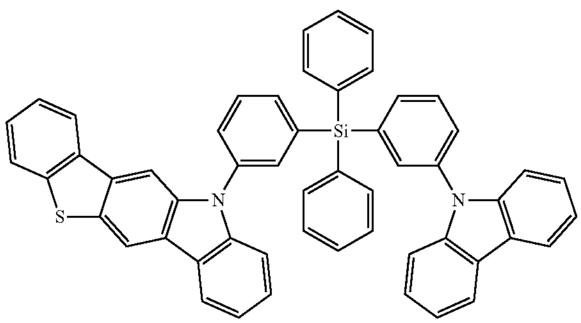
83
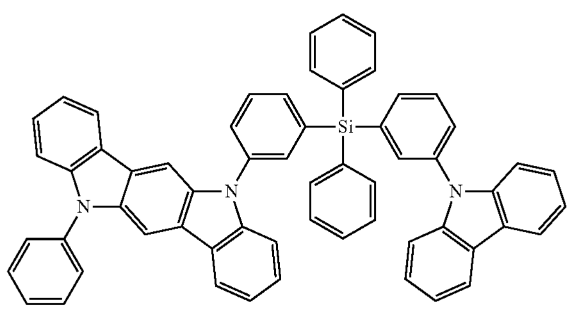
84
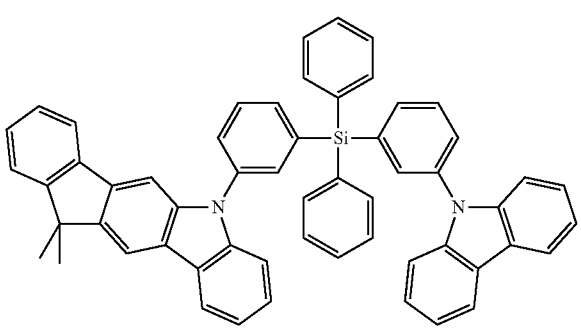
-continued
85
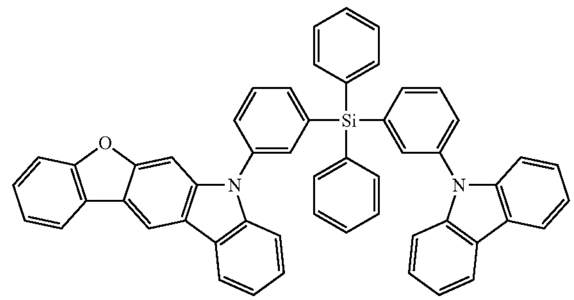
86
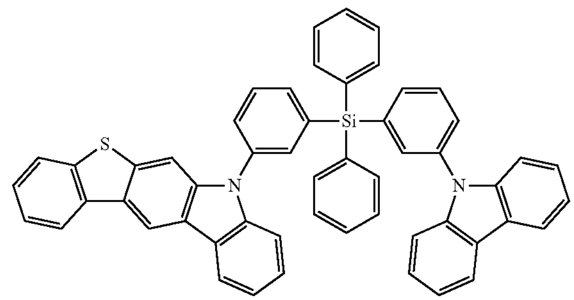
87
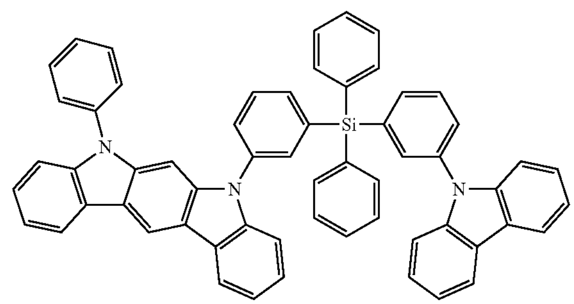
88
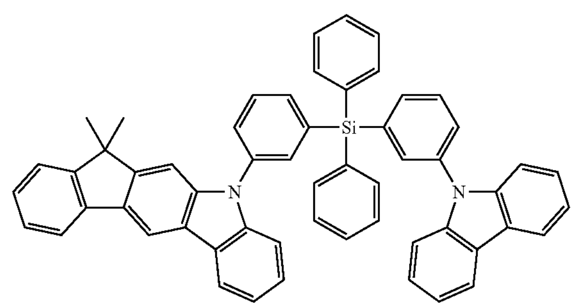
89
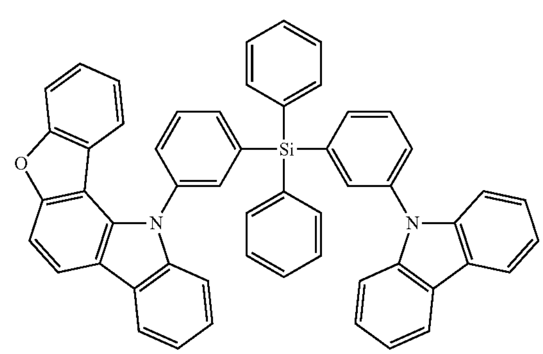

-continued
90
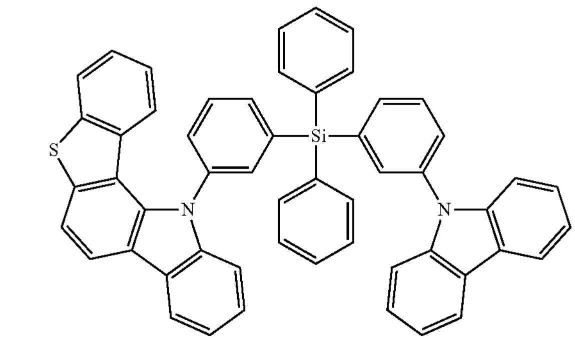
91
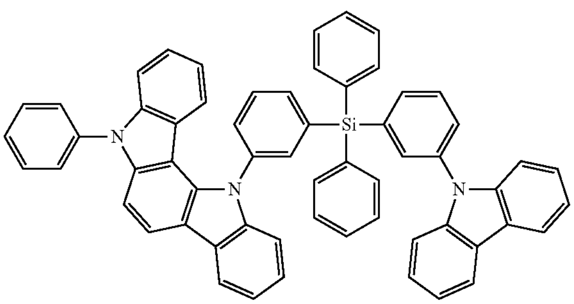
92
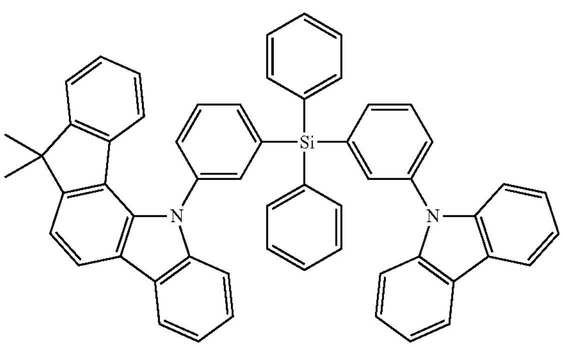
93
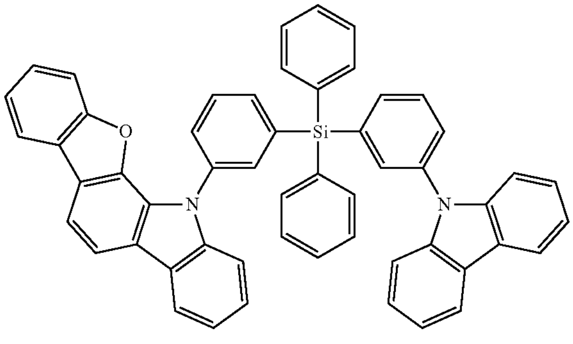
-continued
94
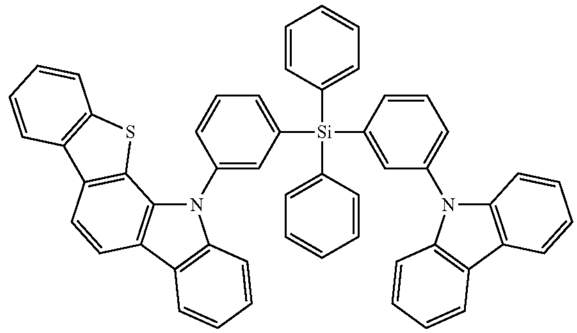
95
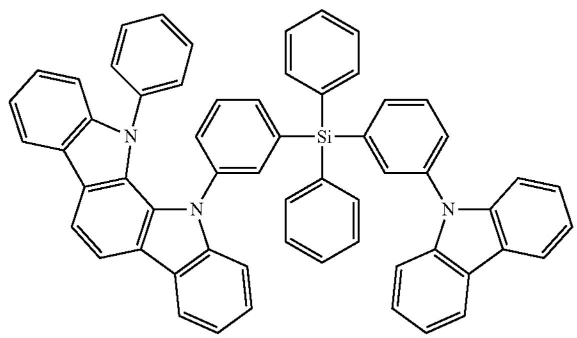
96
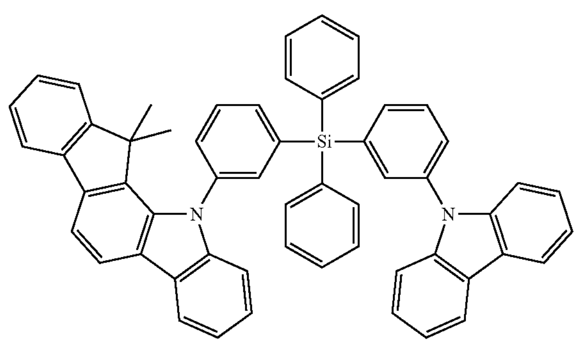
97
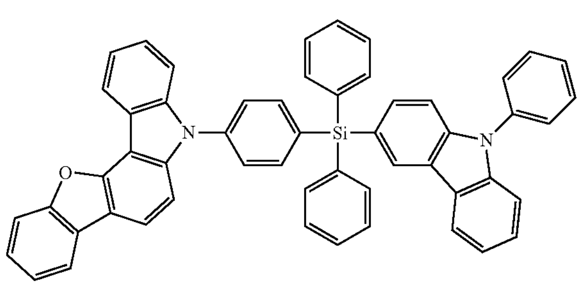

-continued
98
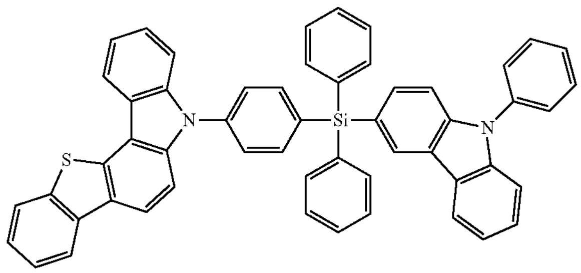
99
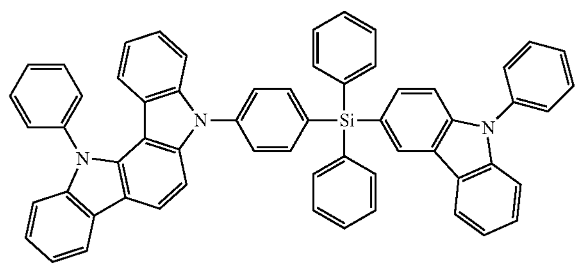
100
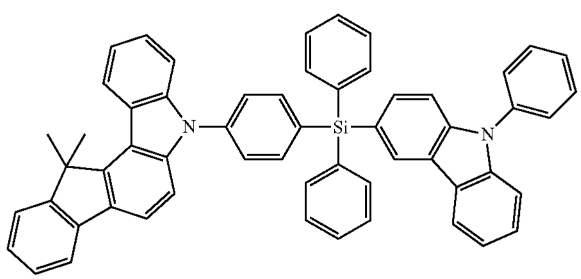
101
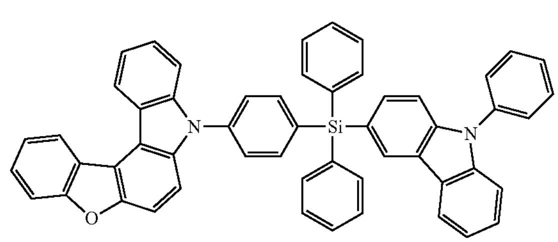
102
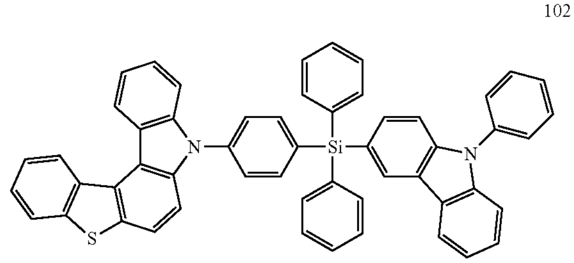
-continued
103
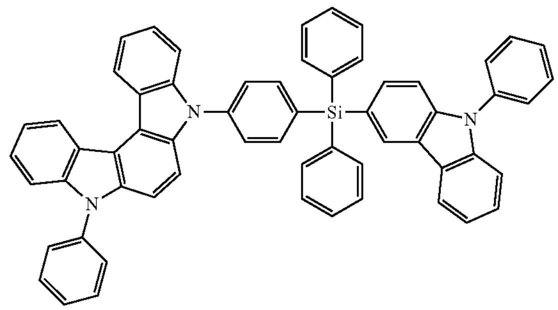
104
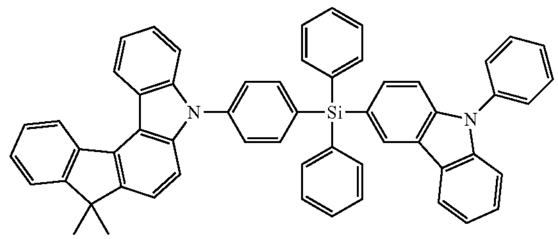
105
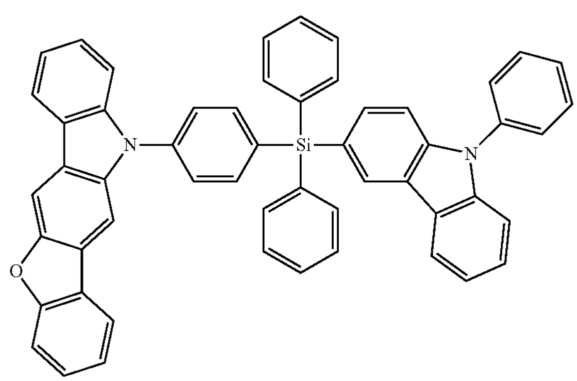
106
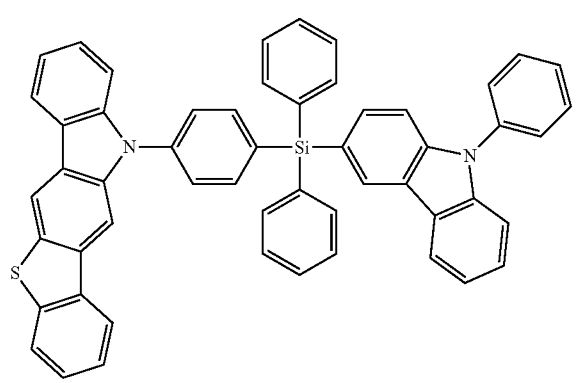

-continued
107
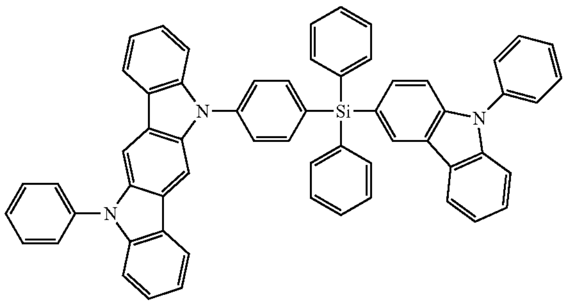
108
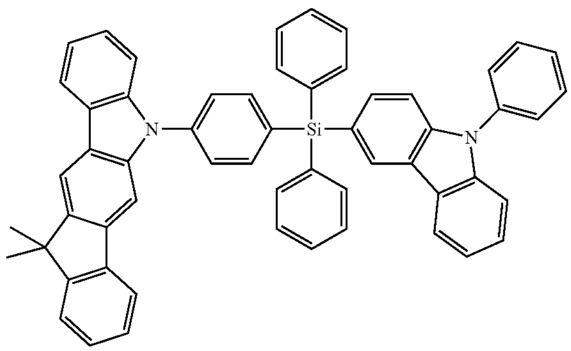
109
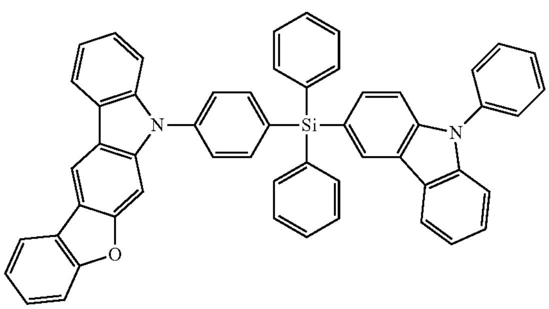
110
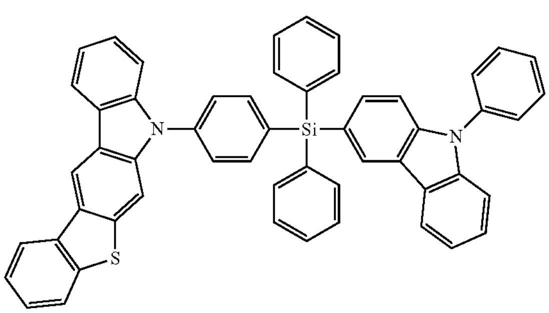
-continued
111
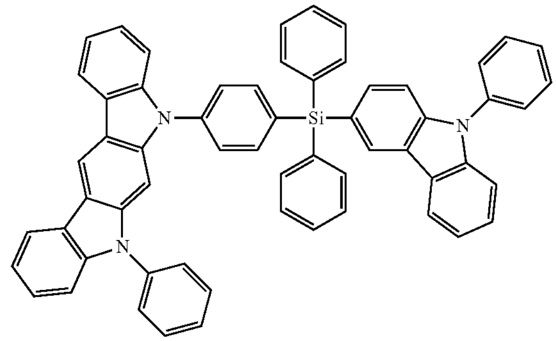
112
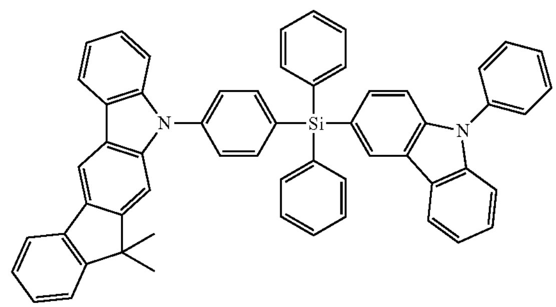
113
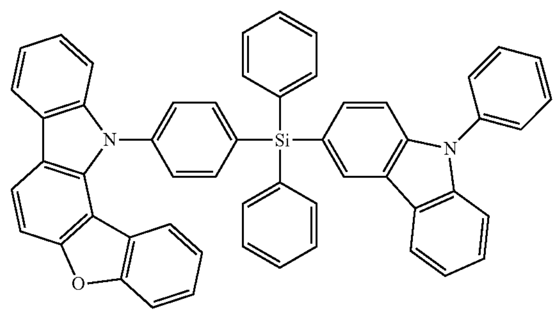
114
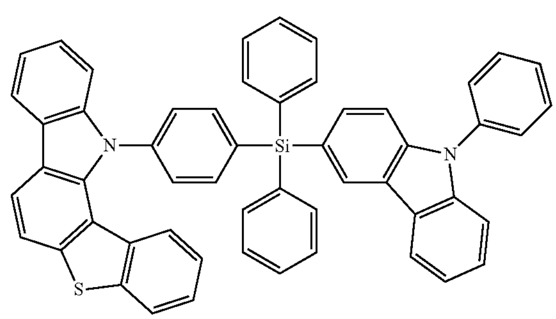

-continued
115
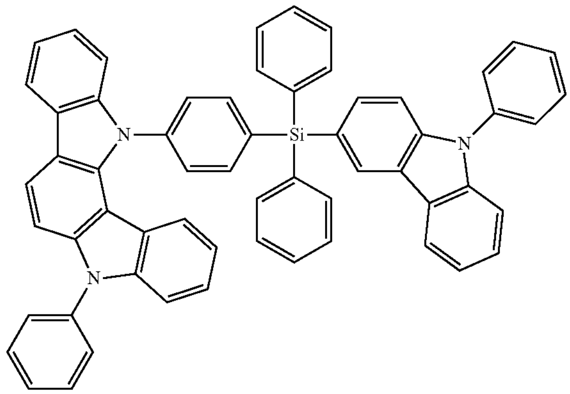
116
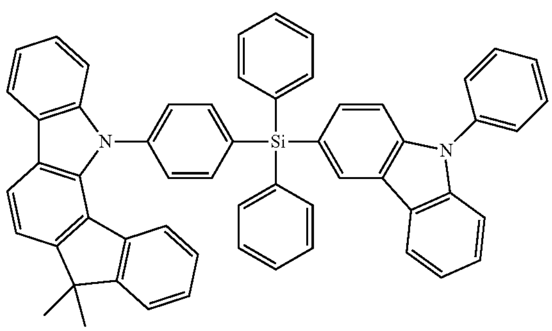
117
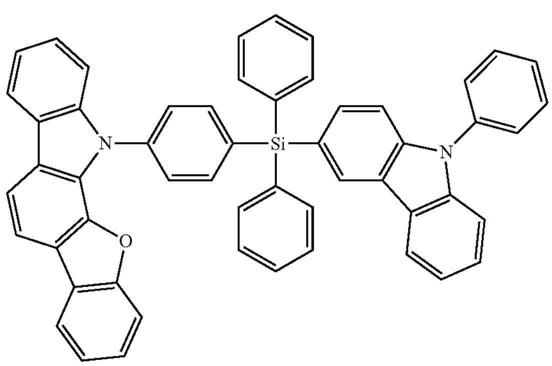
118
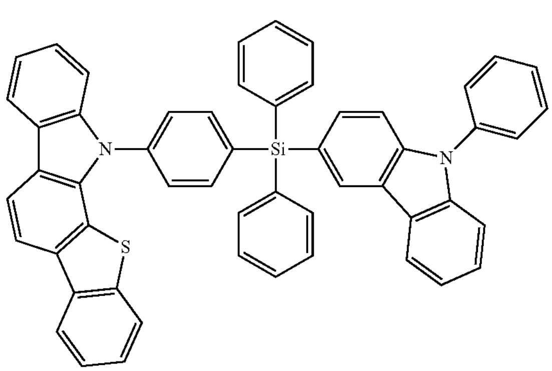
-continued
119
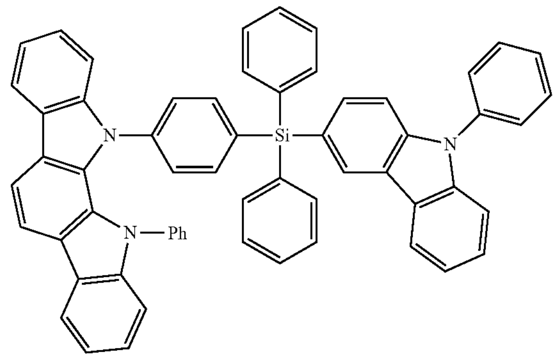
120
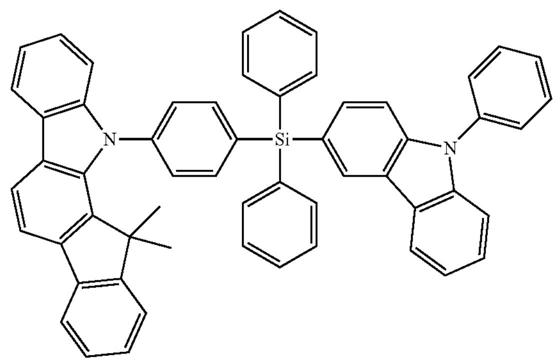
121
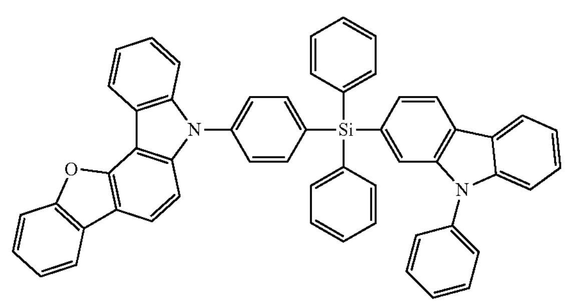
122
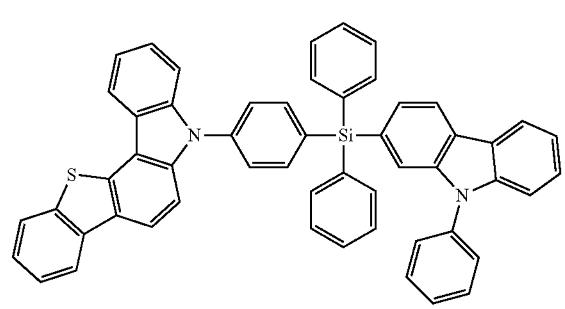

123
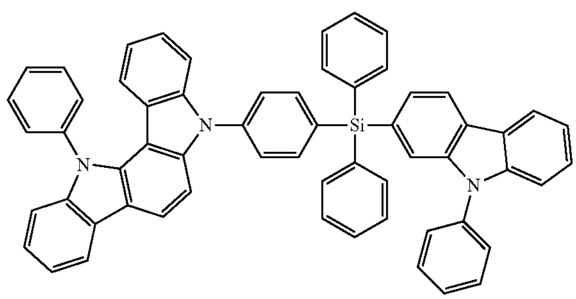
124
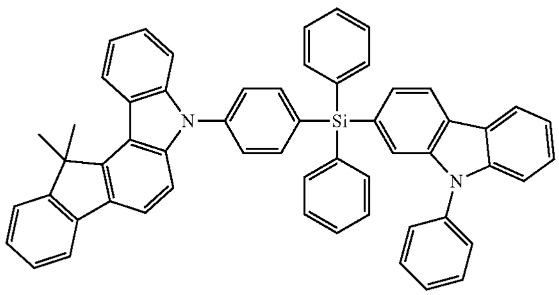
125
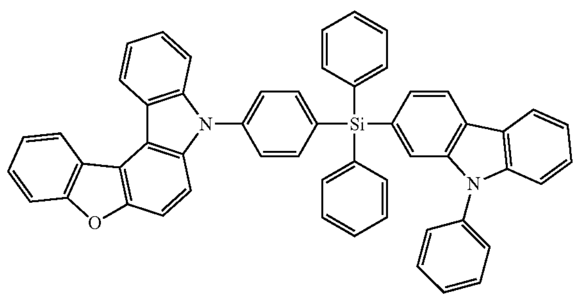
126
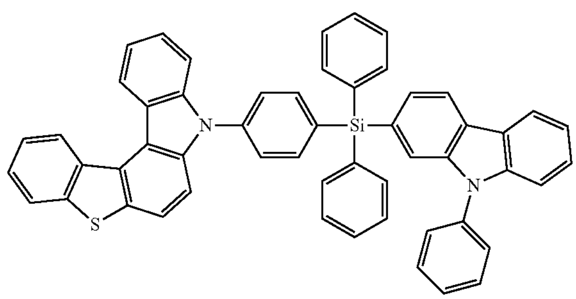
127
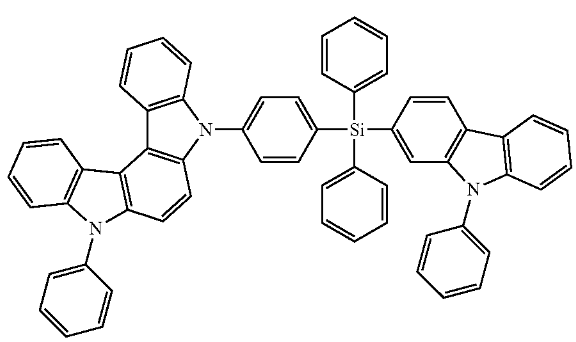
128
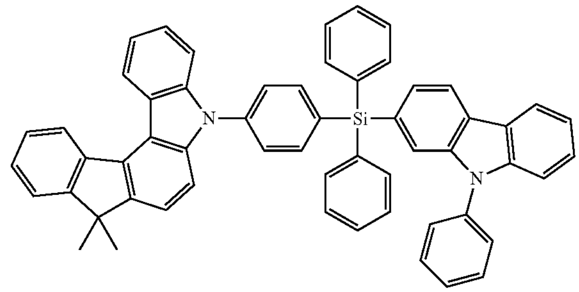
129
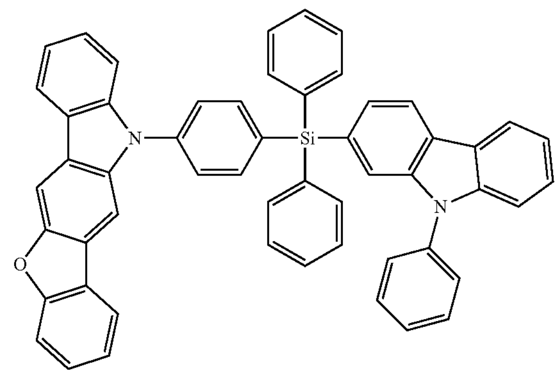
130
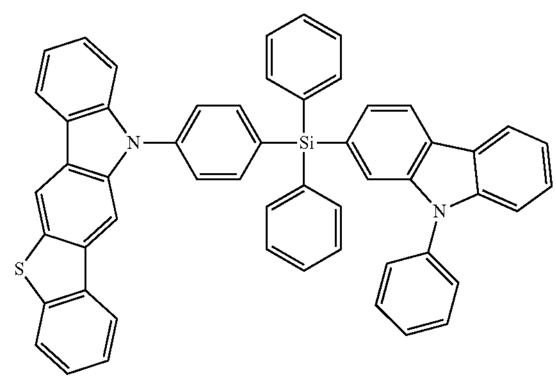
131
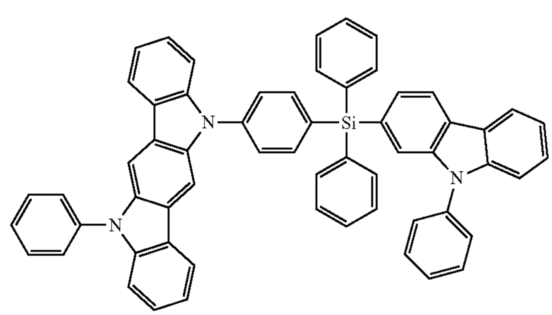

132
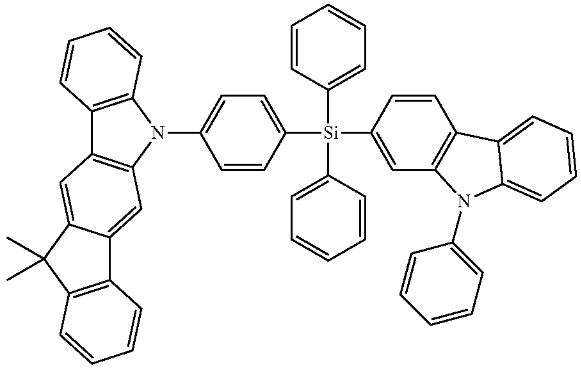
133
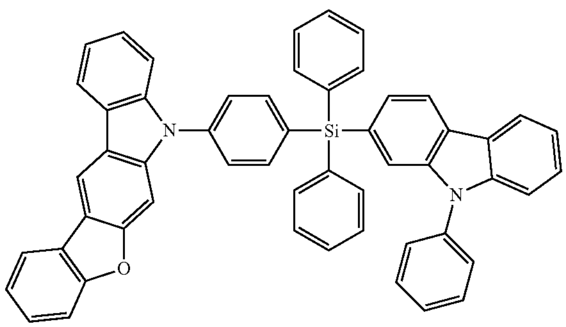
134
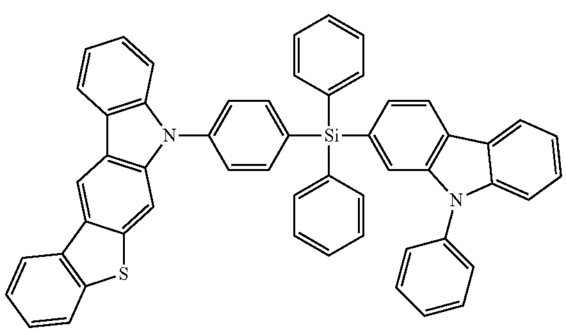
135
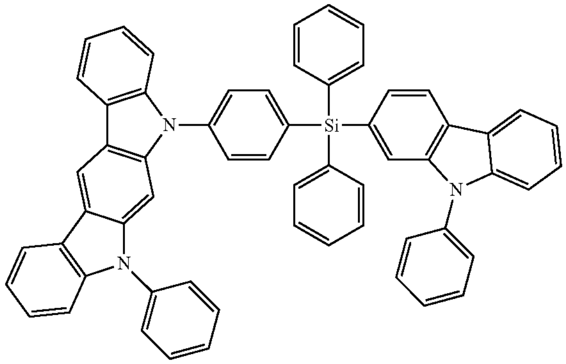
136
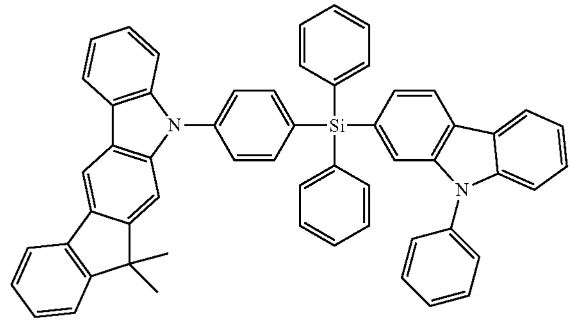
137
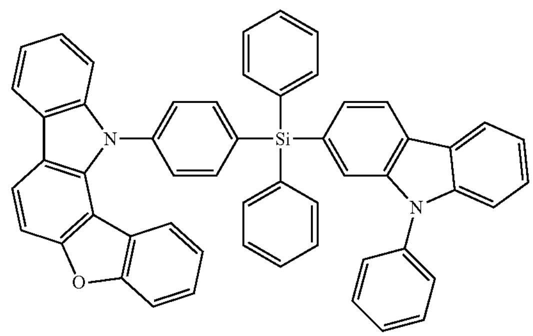
138
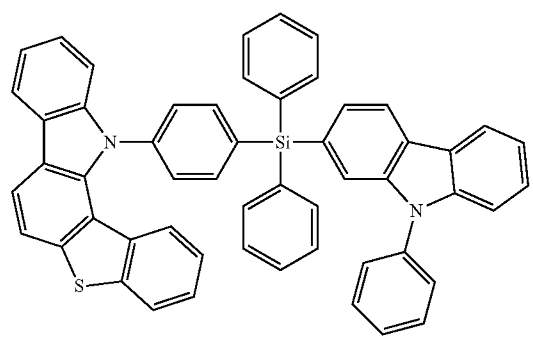
139
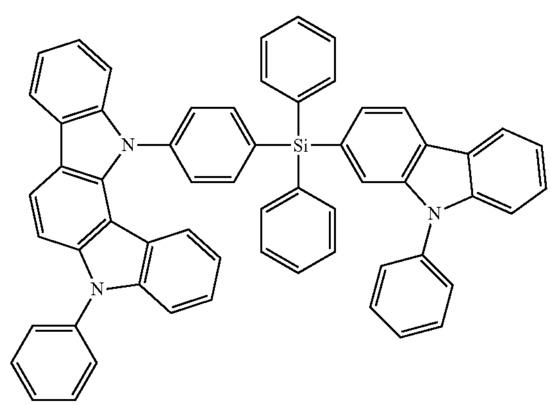

-continued
140
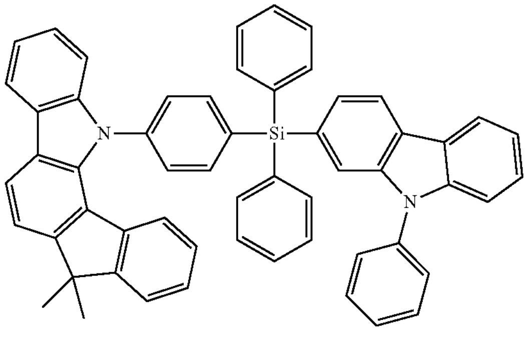
141
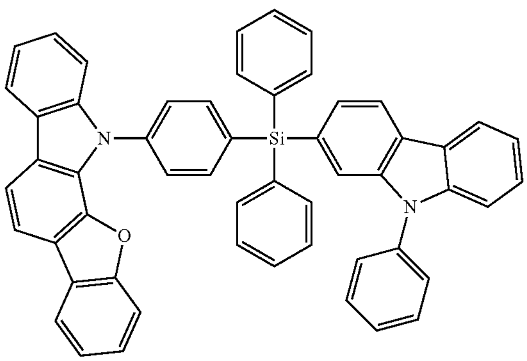
142
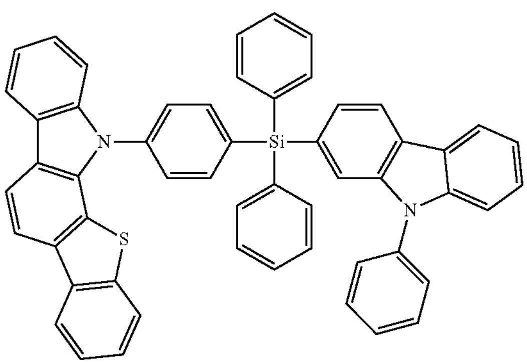
143
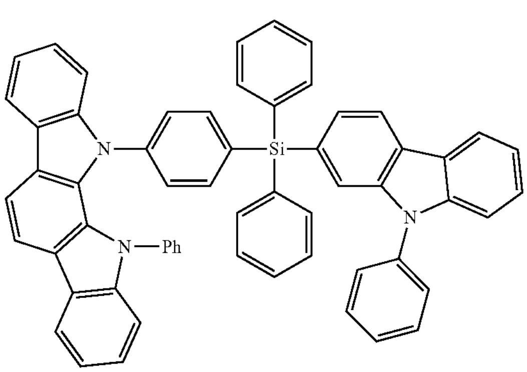
-continued
144
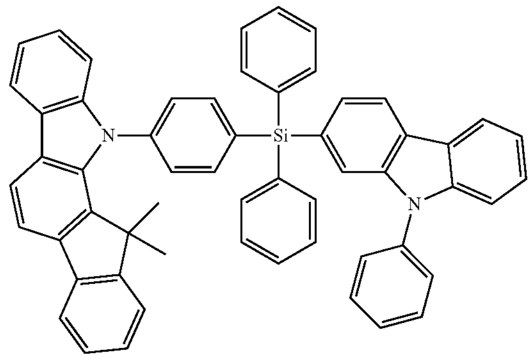
145
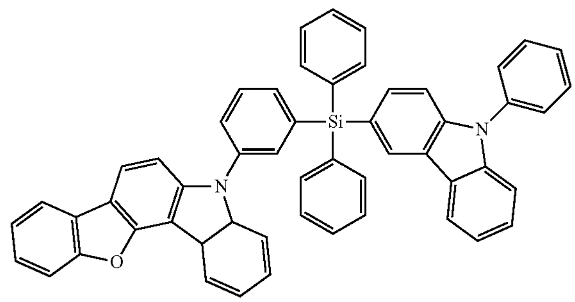
146
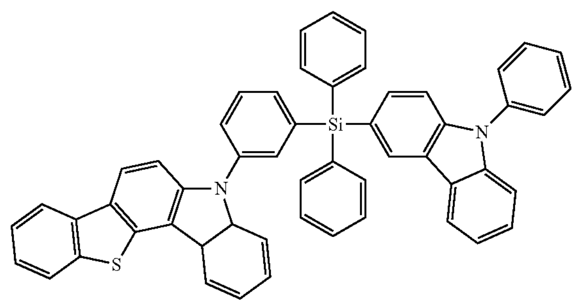
147
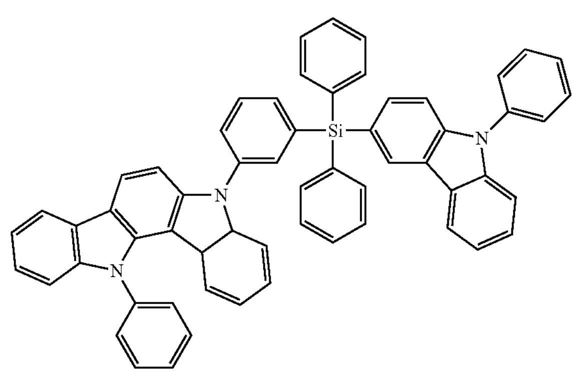

-continued
148
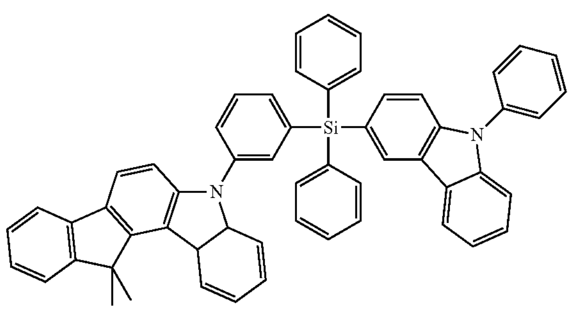
149
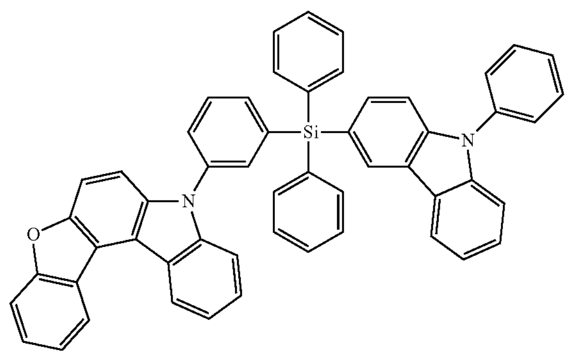
150
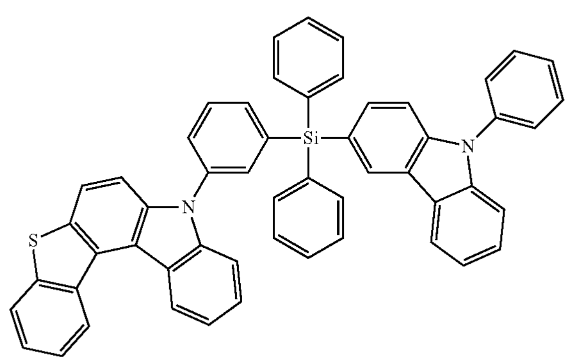
151
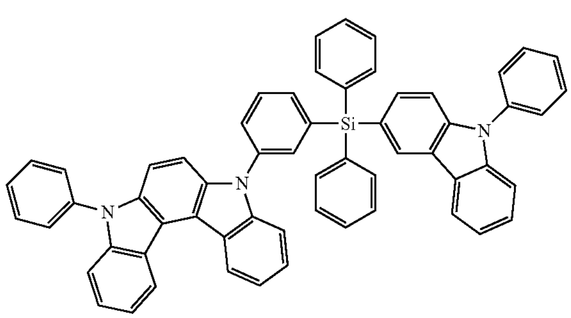
-continued
152
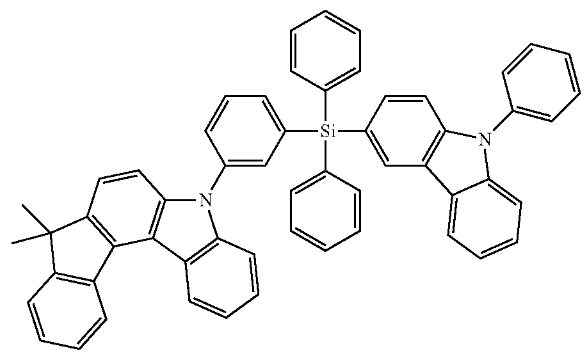
153
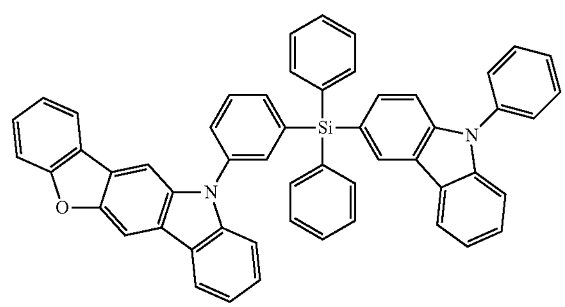
154
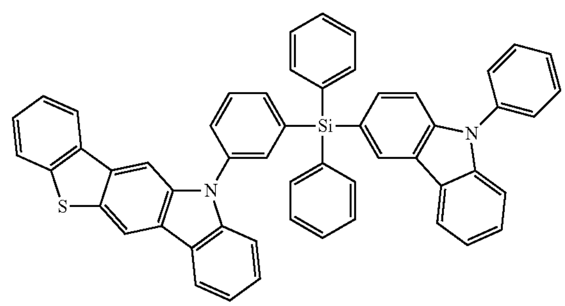
155
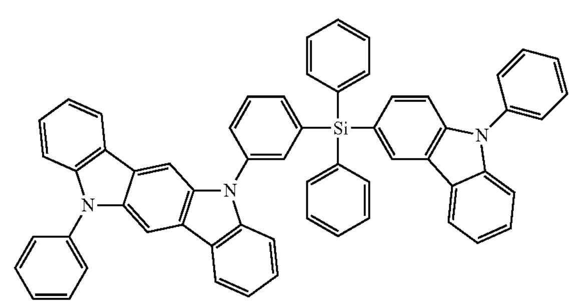

-continued
156
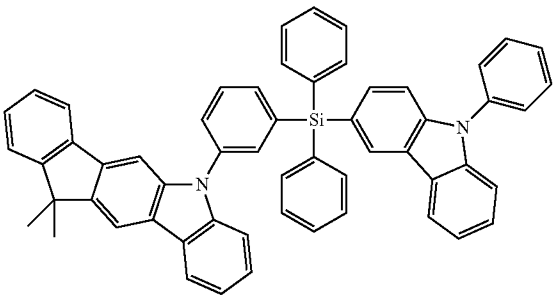
157
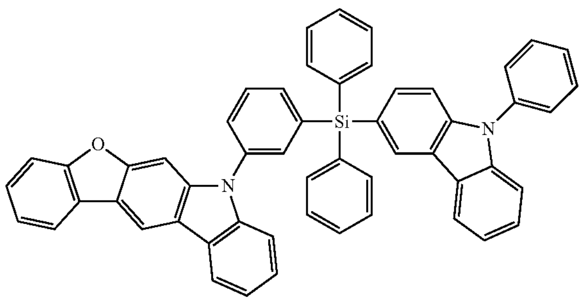
158
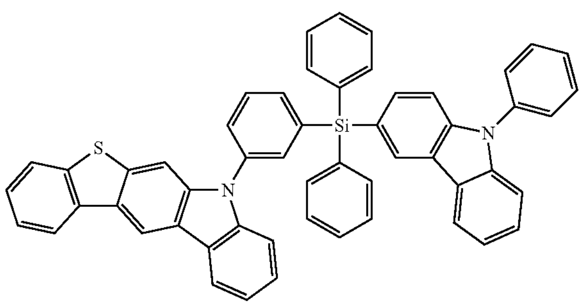
159
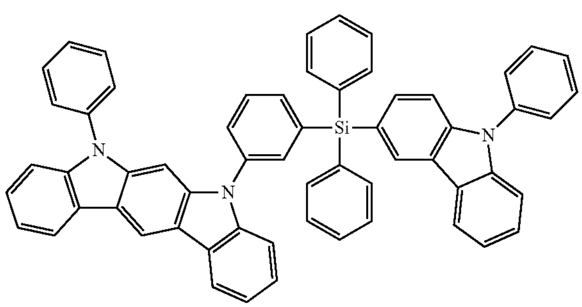
160
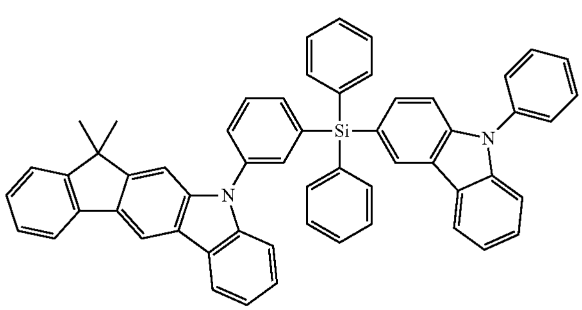
-continued
161
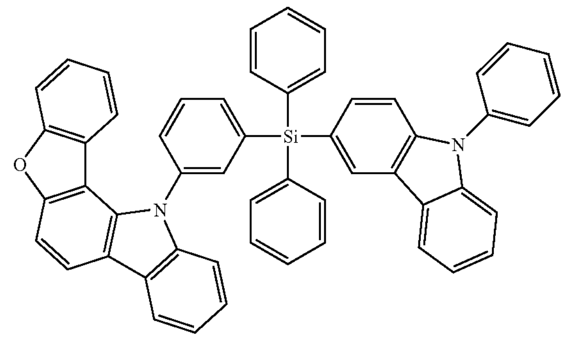
162
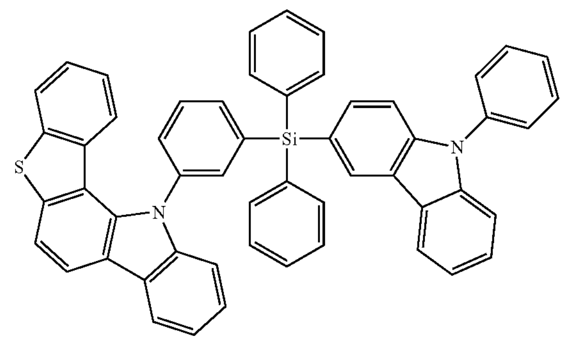
163
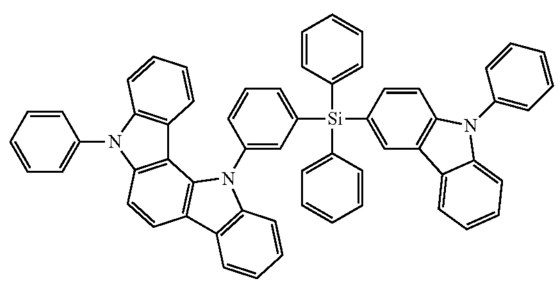
164
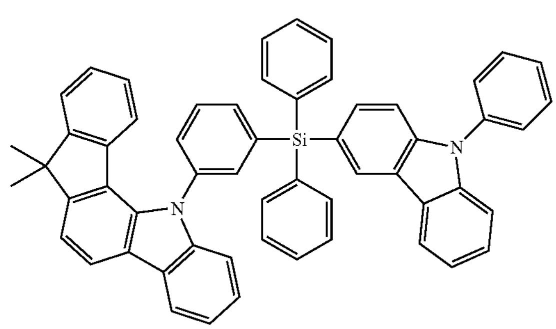

-continued
165
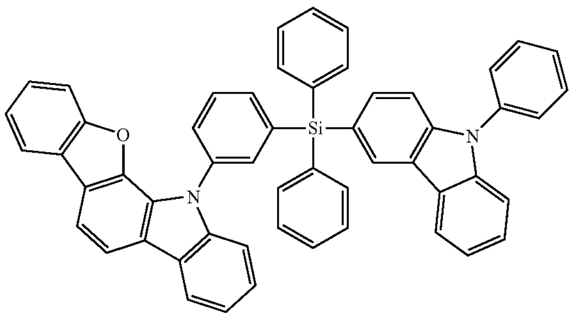
166
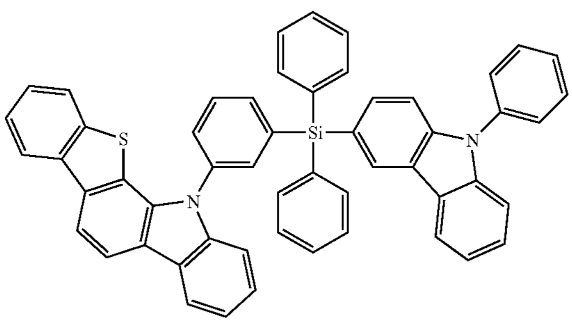
167
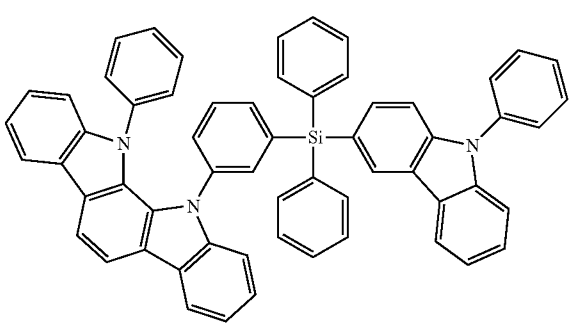
168
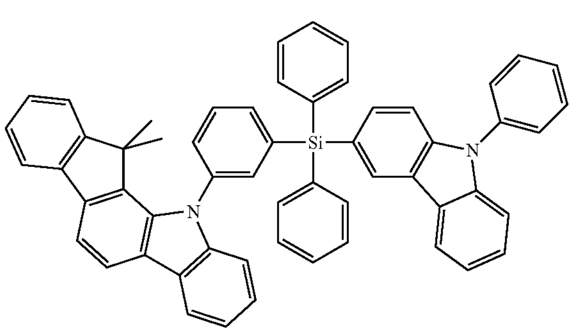
-continued
169
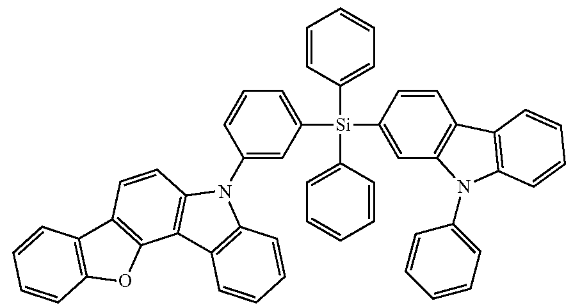
170
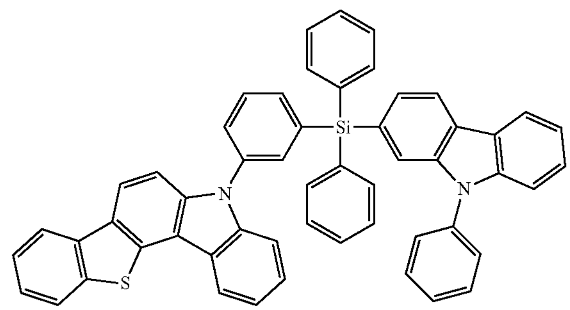
171
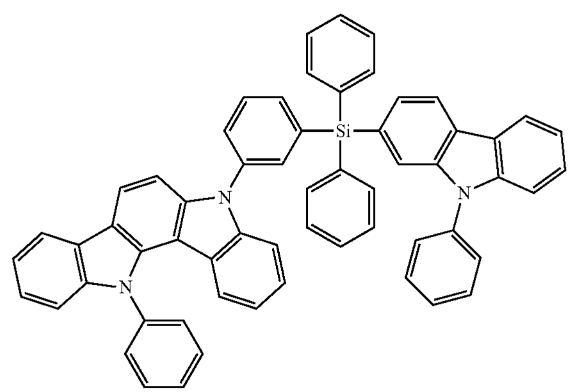
172
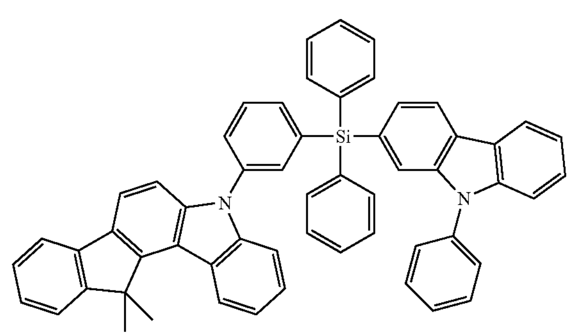

-continued
173
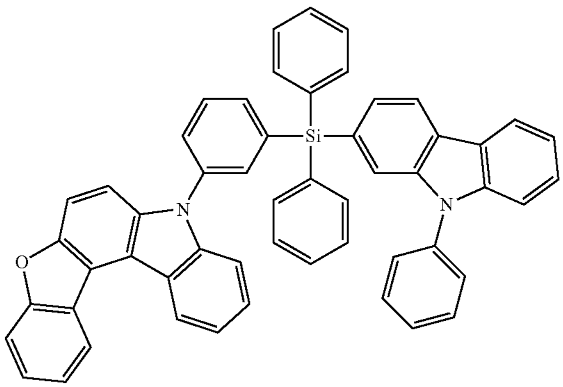
174
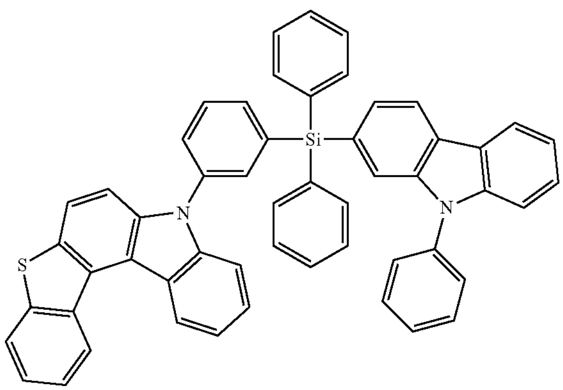
175
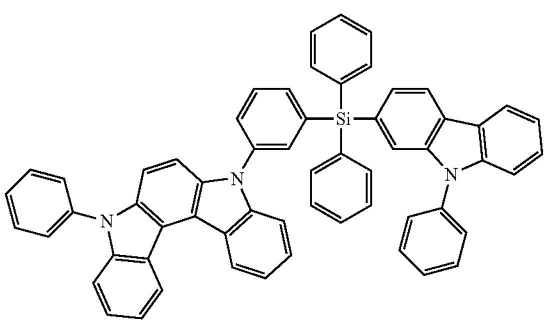
176
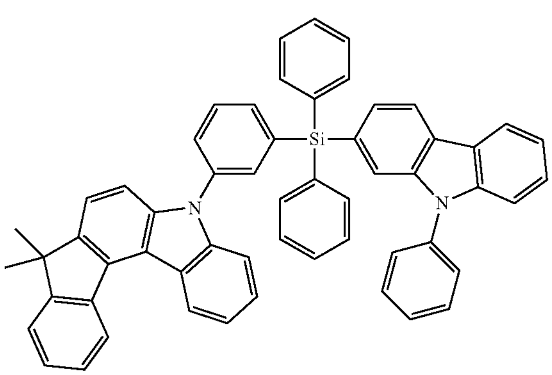
-continued
177
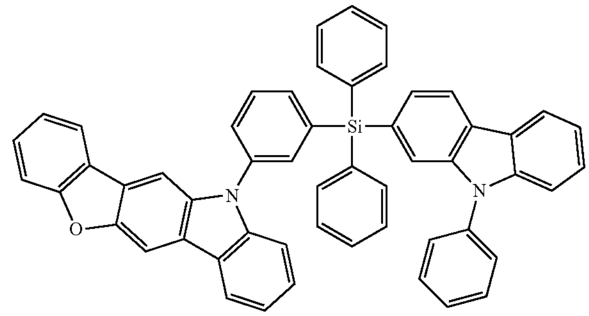
178
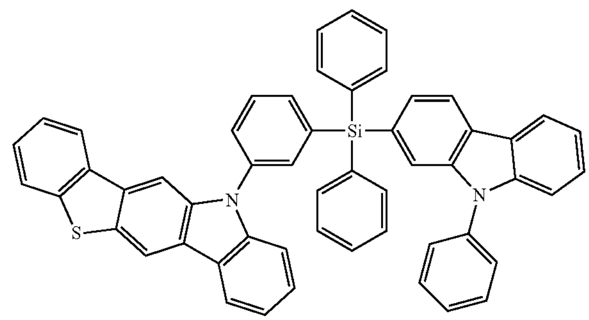
179
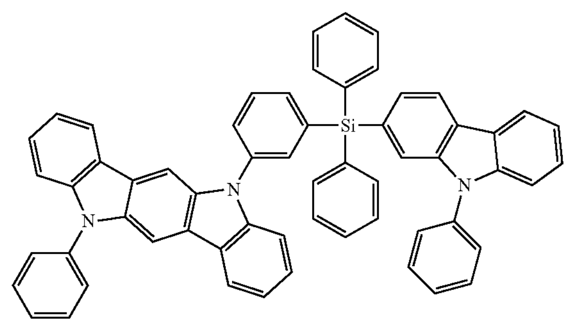
180
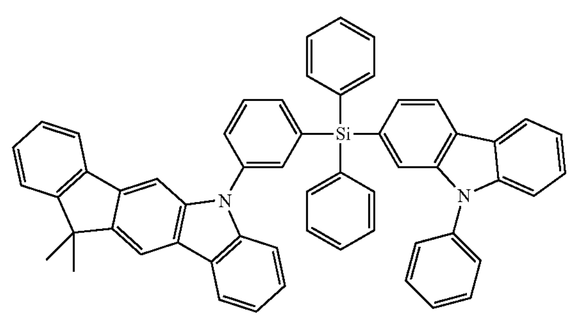

-continued
181
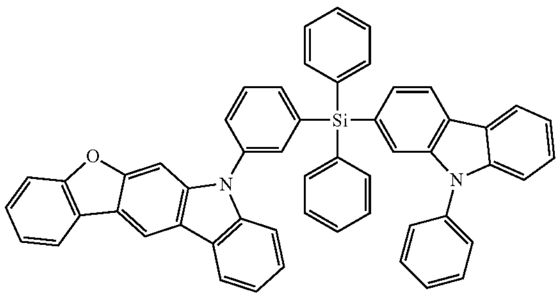
182
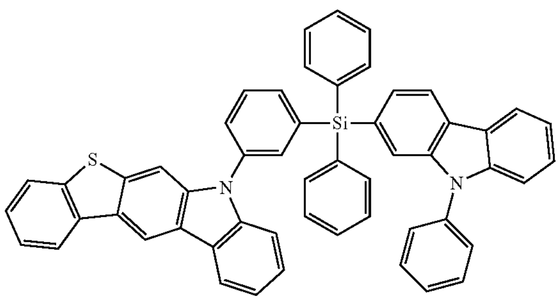
183
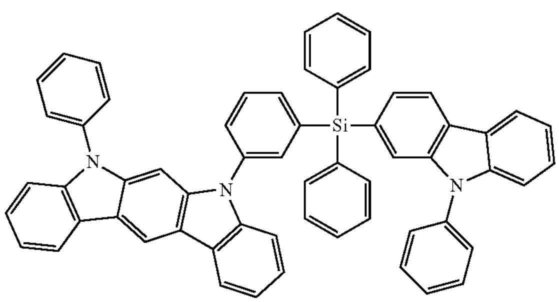
184
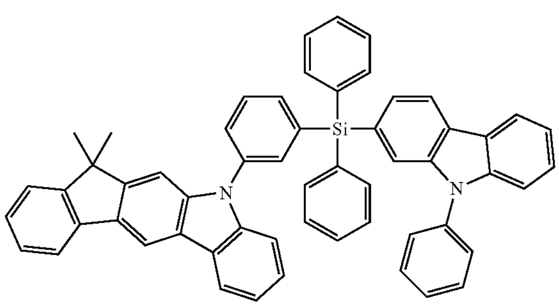
185
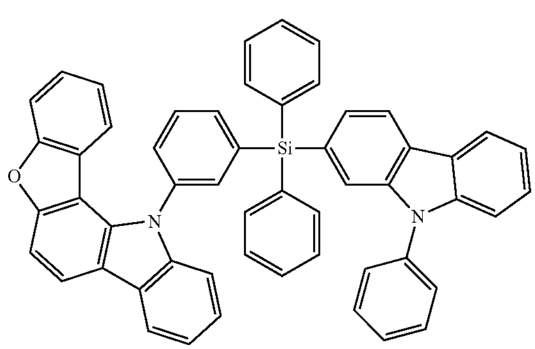
-continued
186
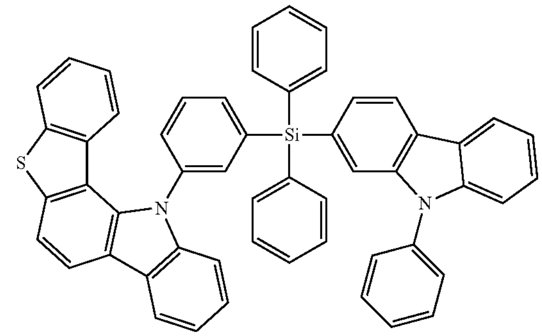
187
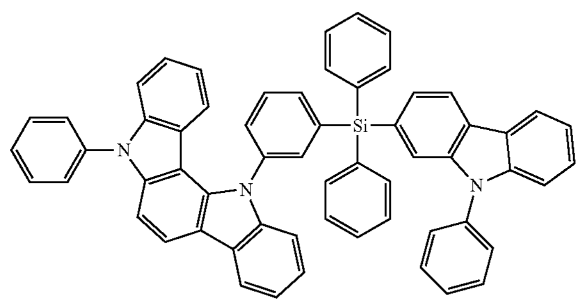
188
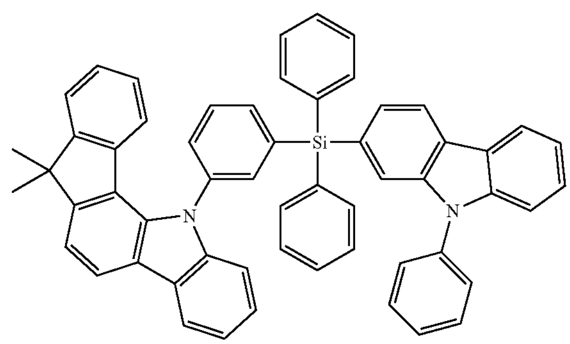
189
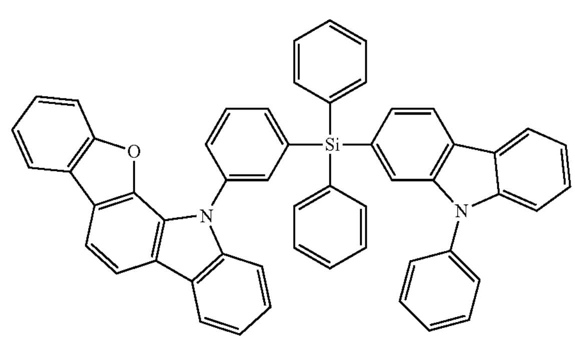

190
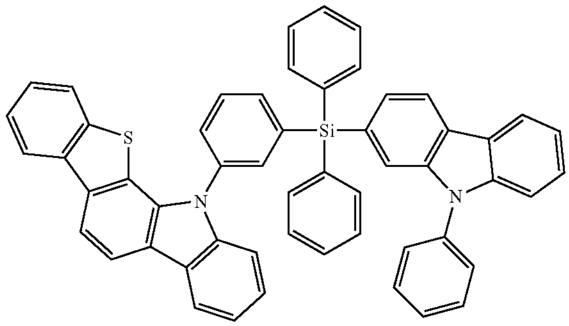
191
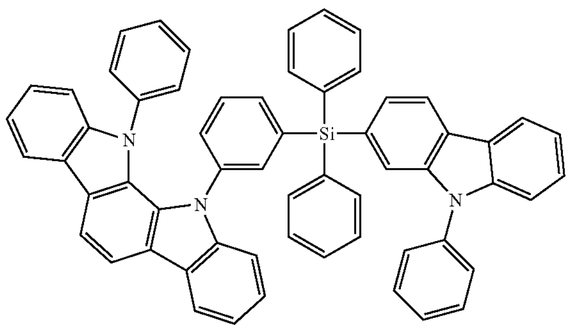
192
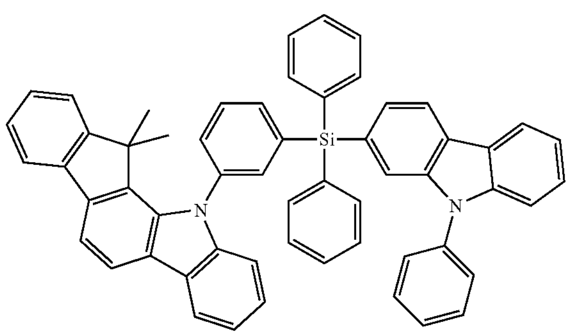
193
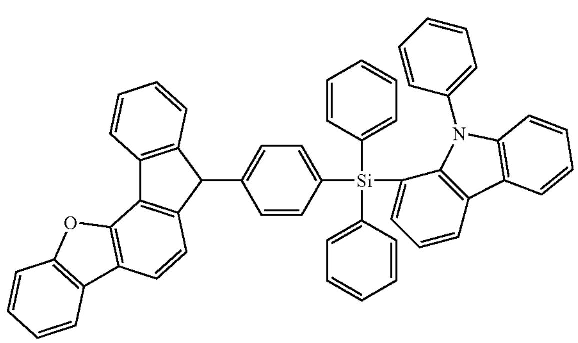
194
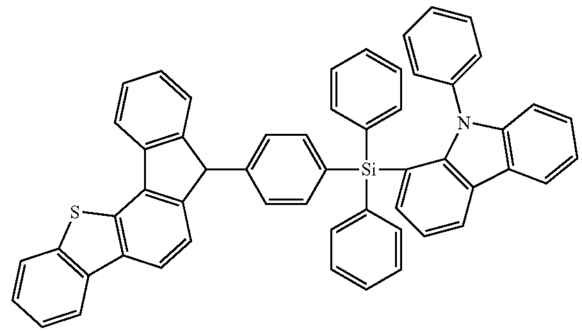
195
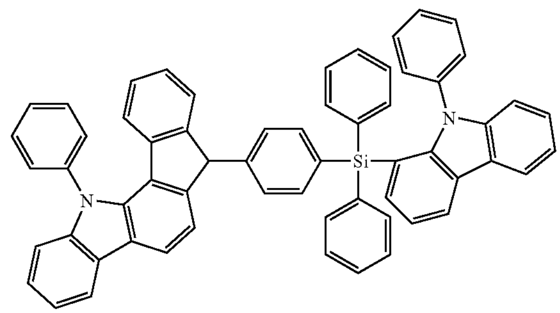
196
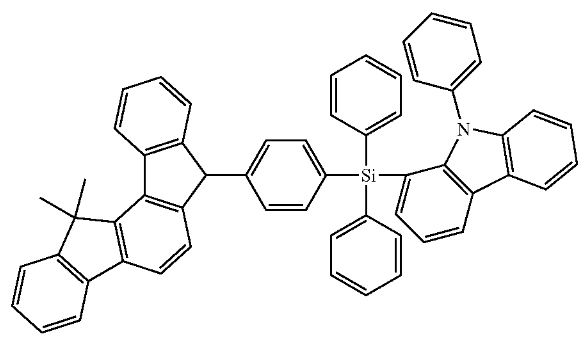
197
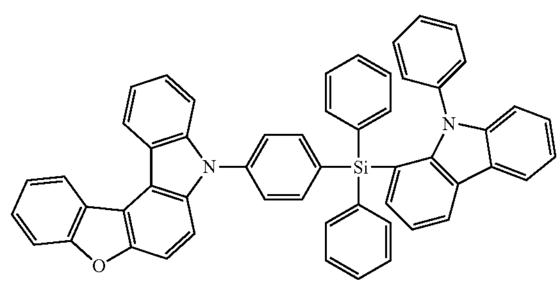
198
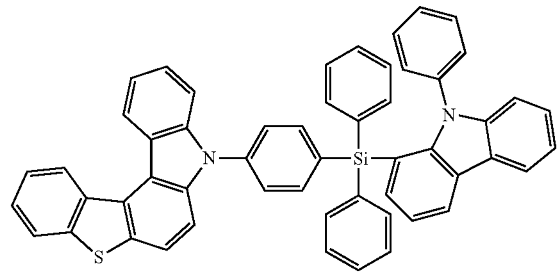

-continued
199
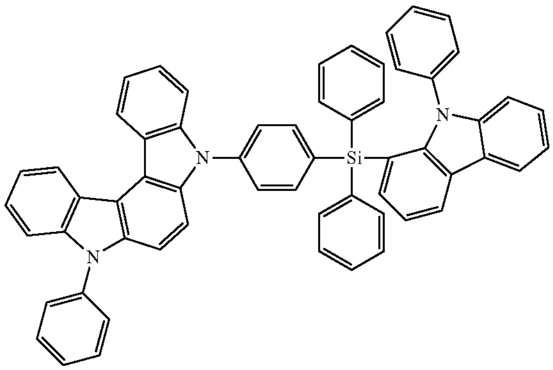
200
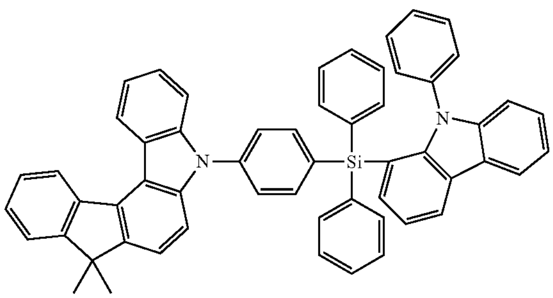
201
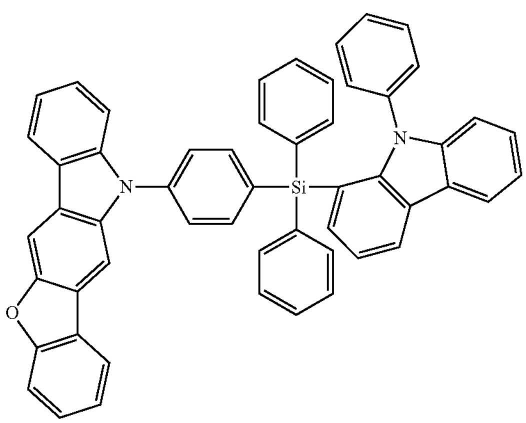
202
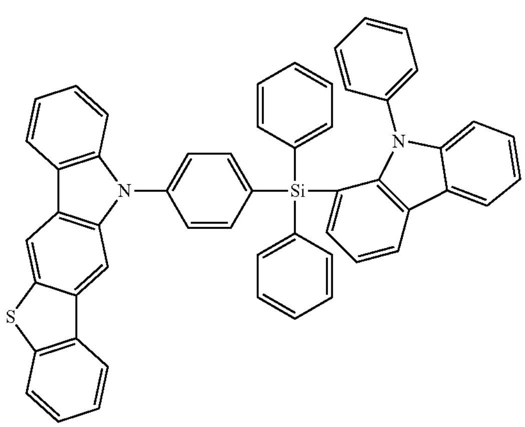
-continued
203
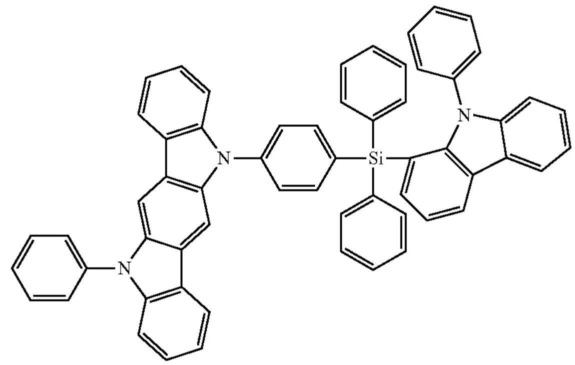
204
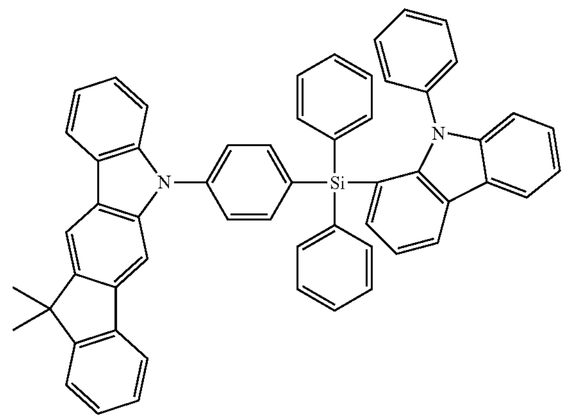
205
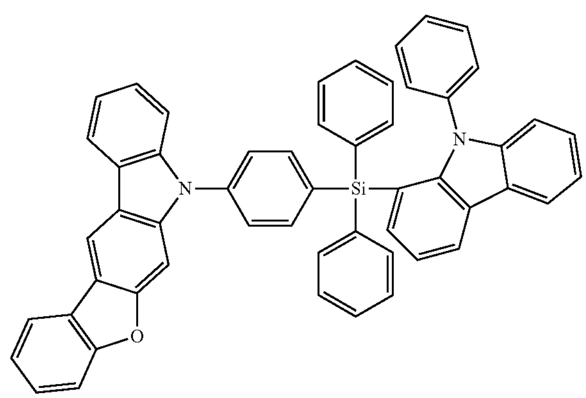
206
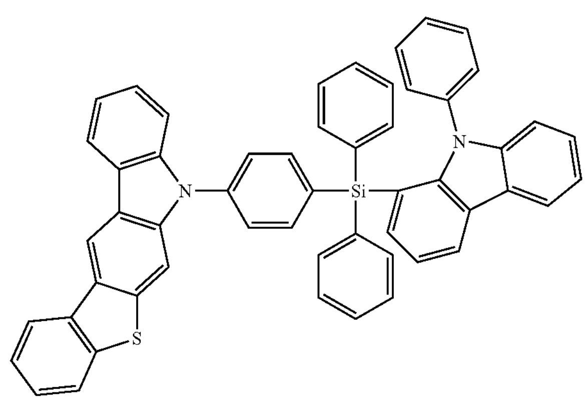

207
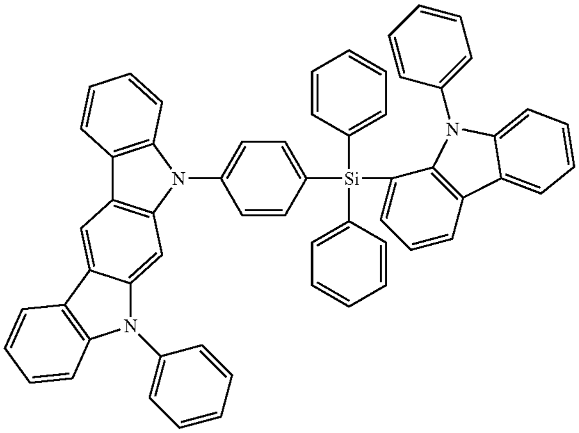
208
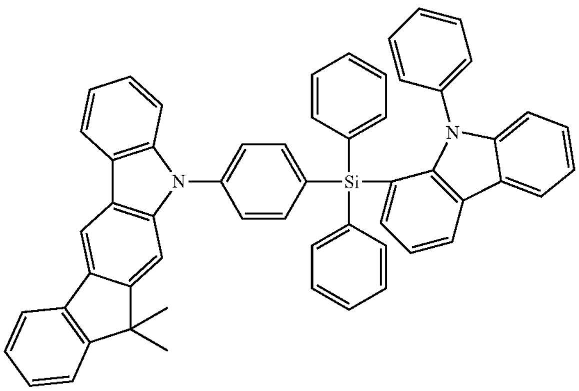
209
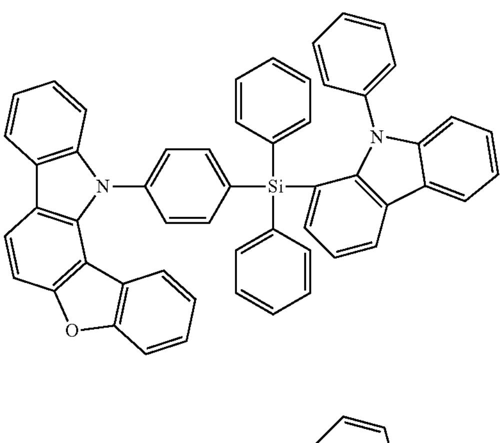
210
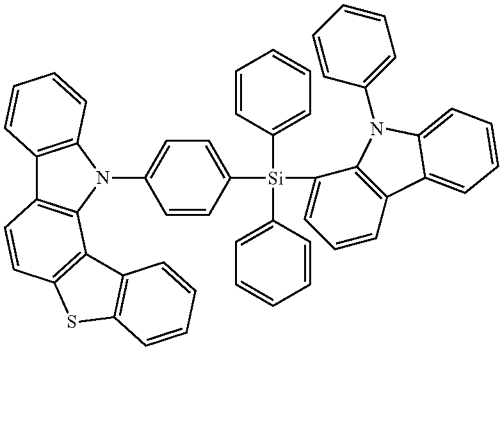
211
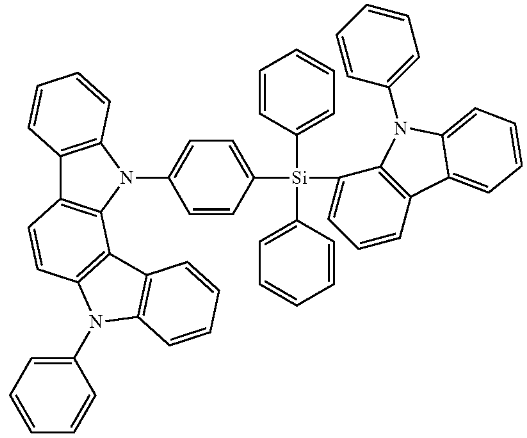
212
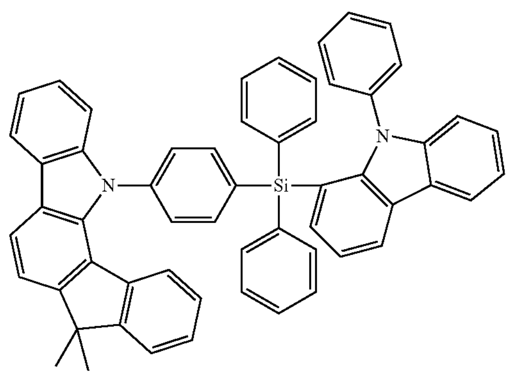
213
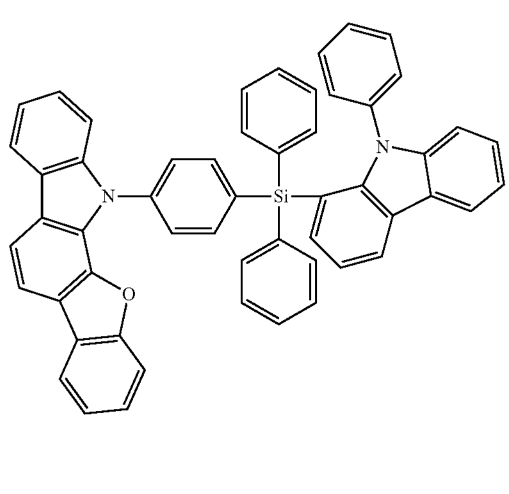

-continued
214
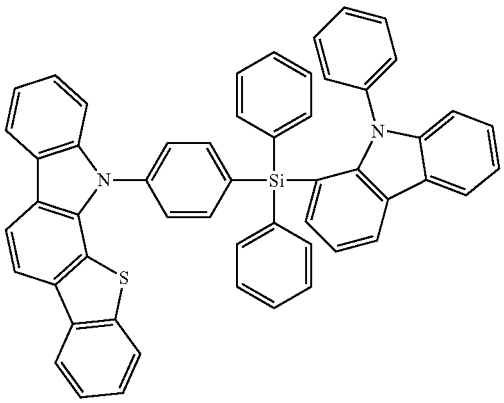
215
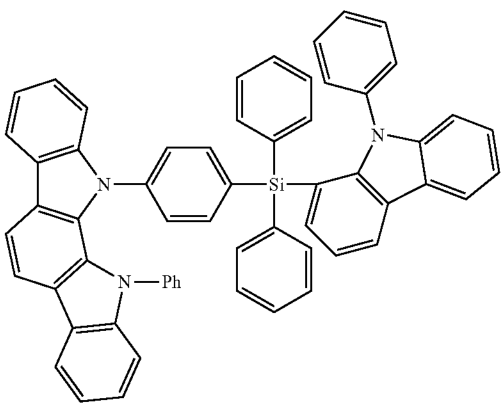
216
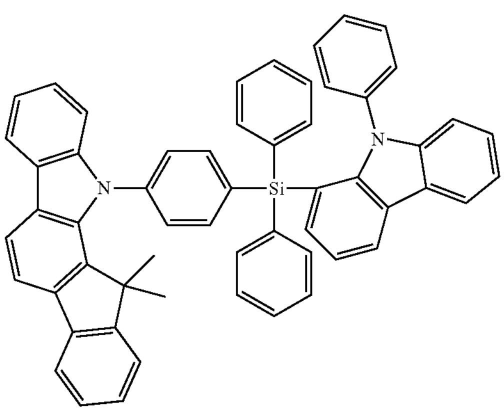
217
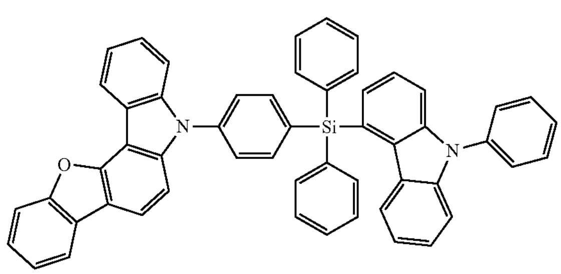
-continued
218
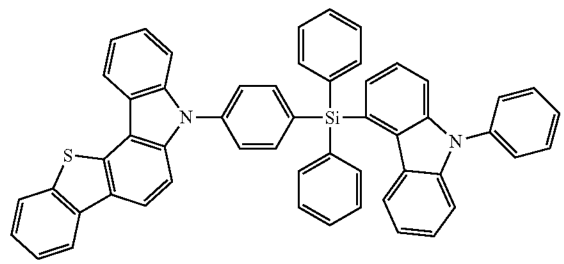
219
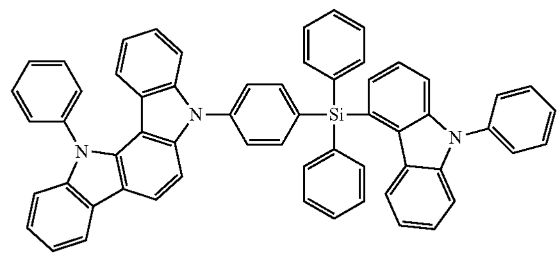
220
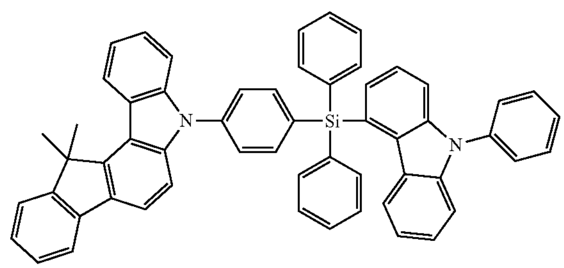
221
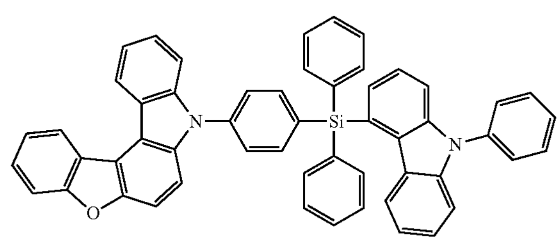
222
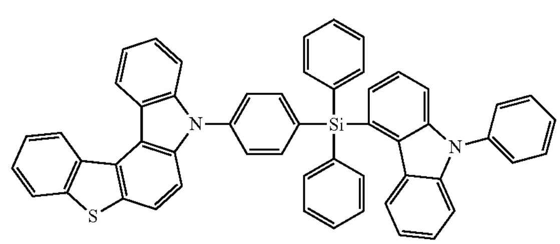

223
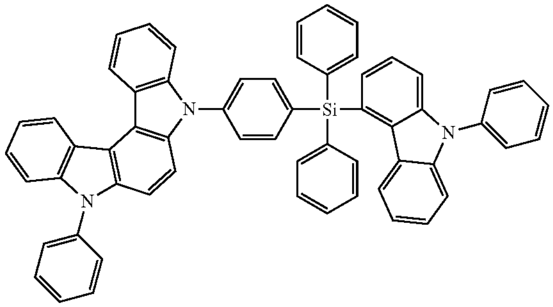
224
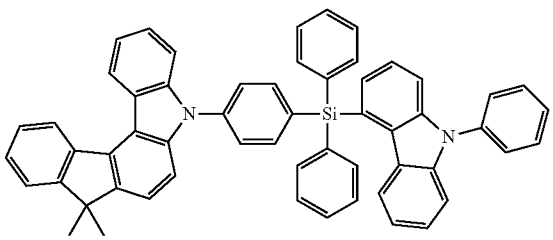
225
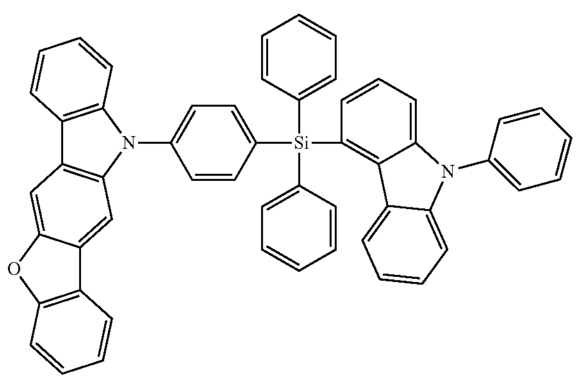
226
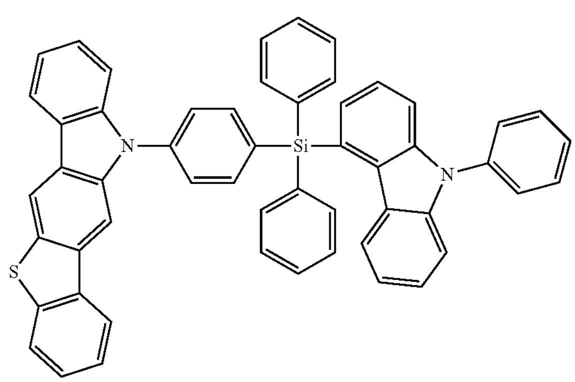
227
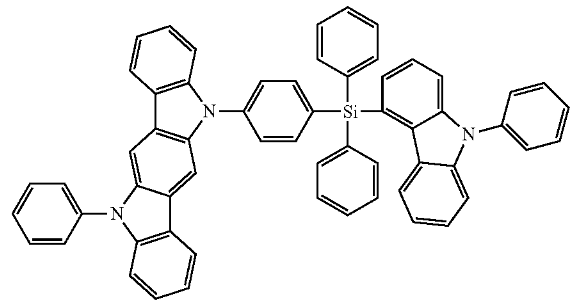
228
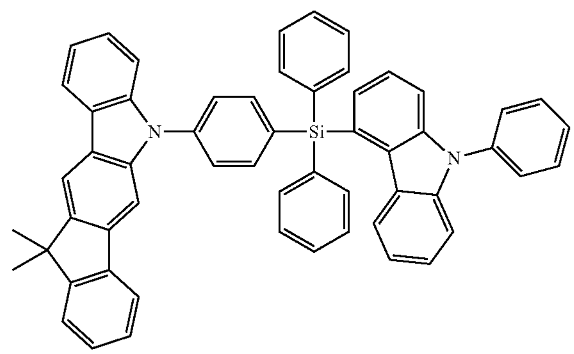
229
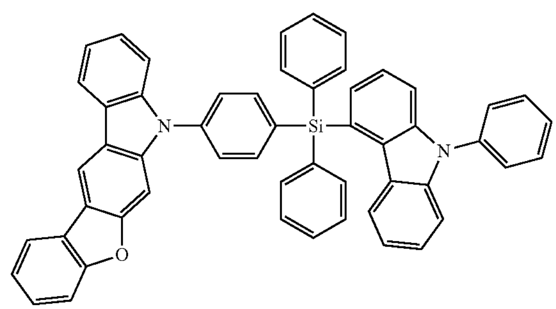
230
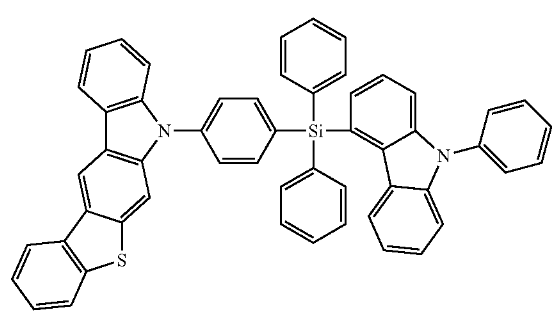

-continued
231
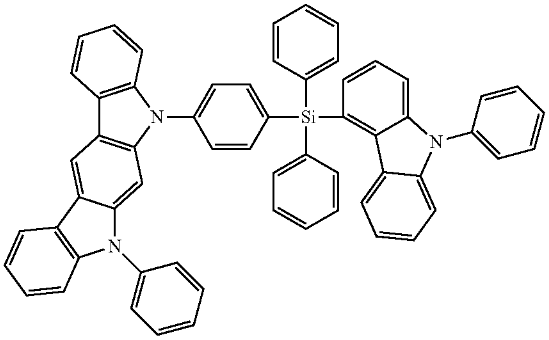
232
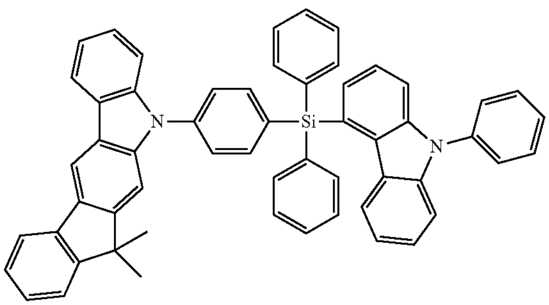
233
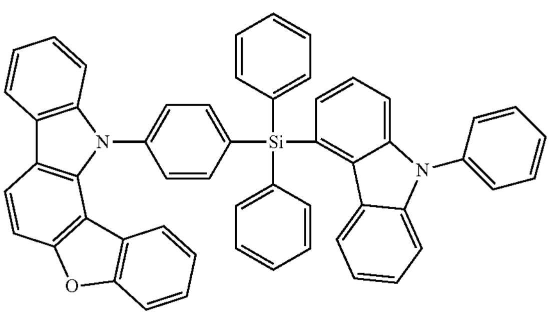
234
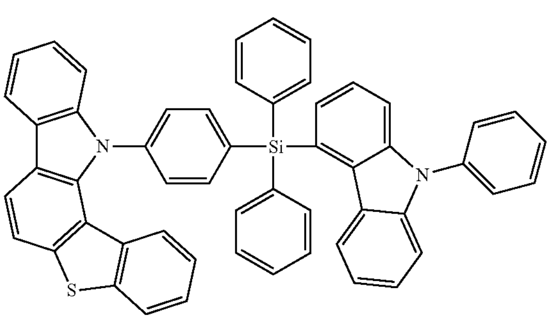
-continued
235
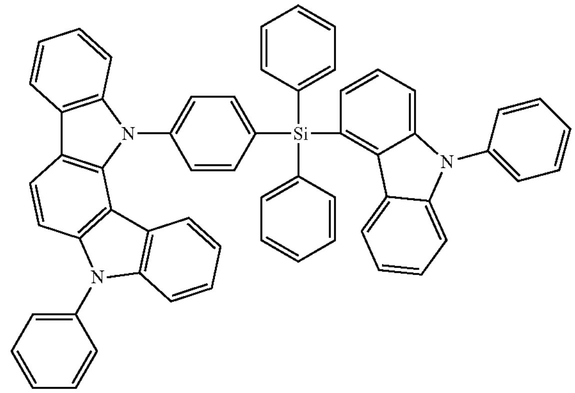
236
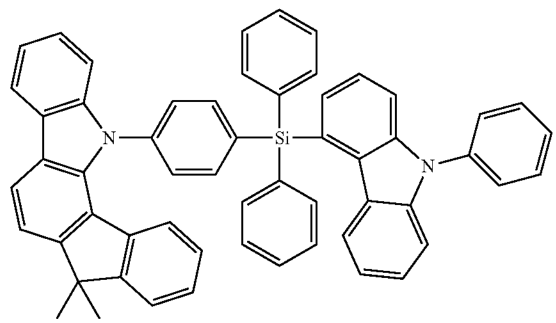
237
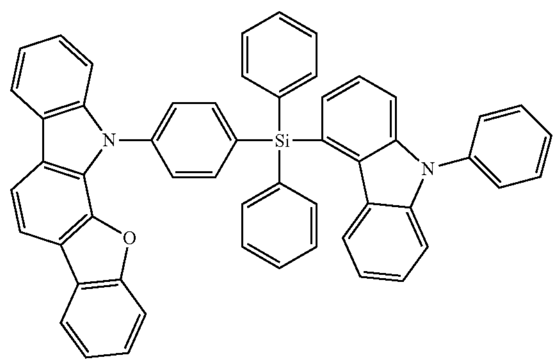
238
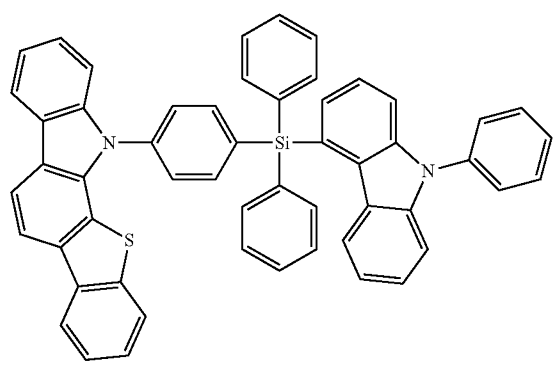

-continued
239
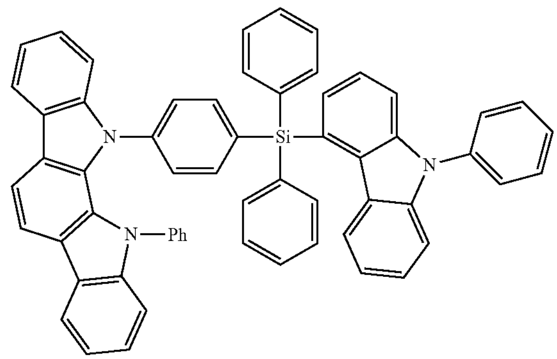
240
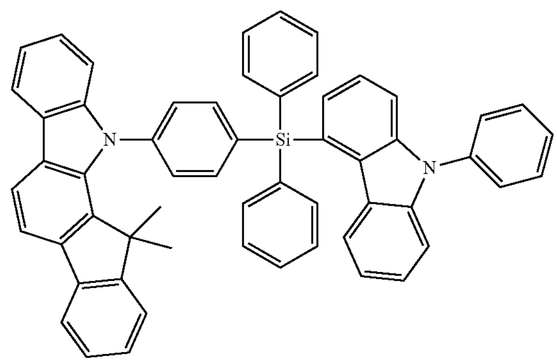
241
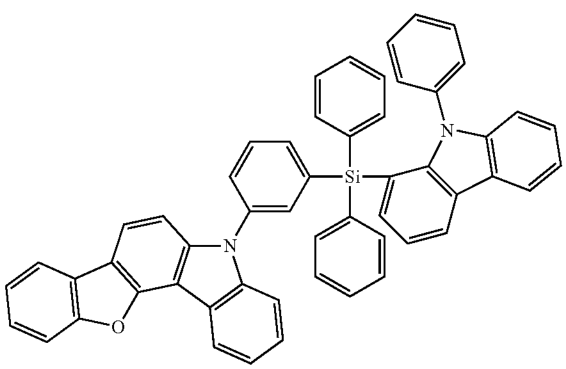
242
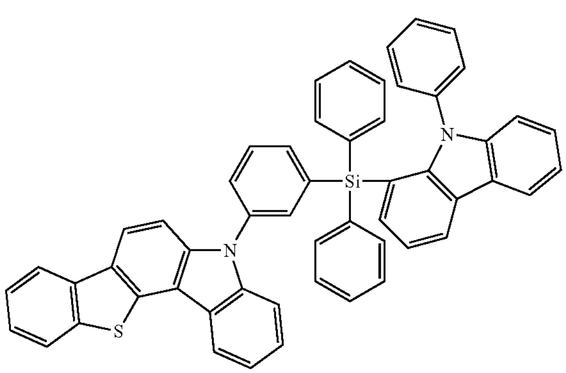
-continued
243
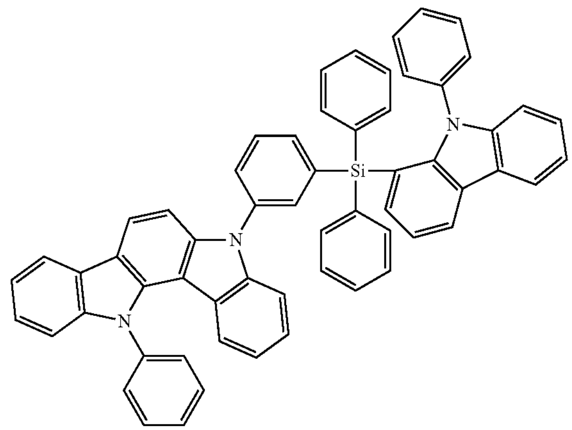
244
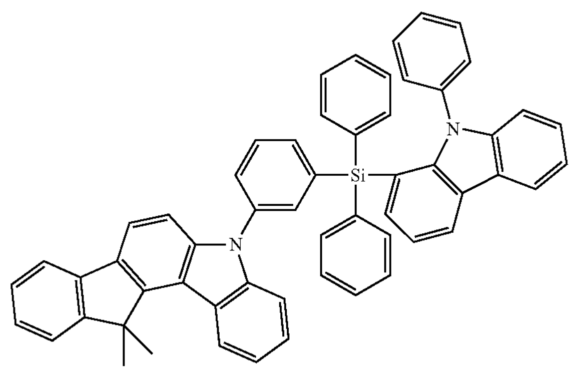
245
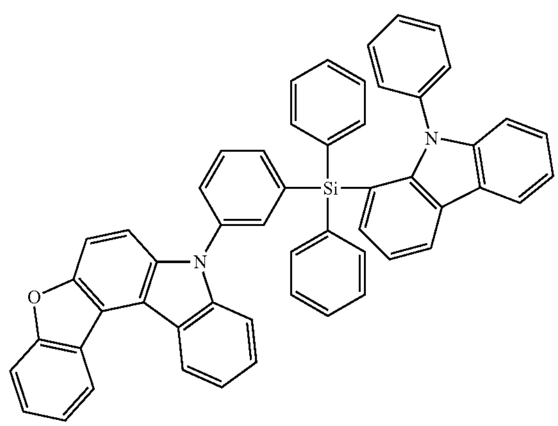

-continued
246
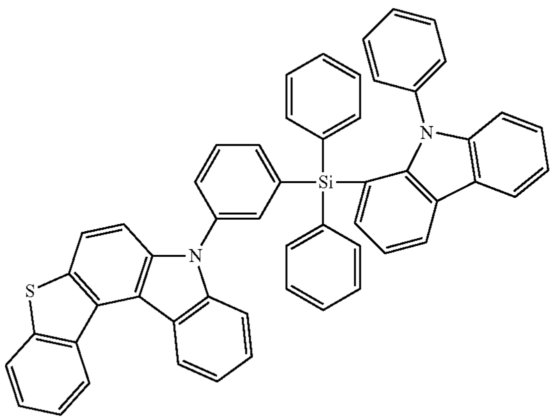
247
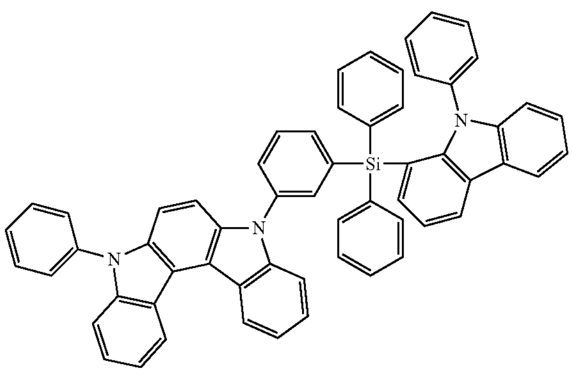
248
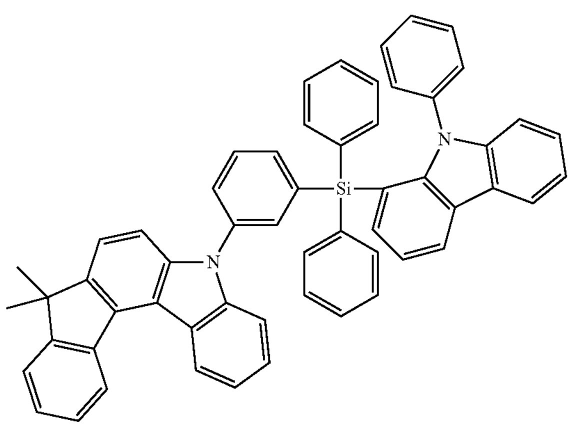
249
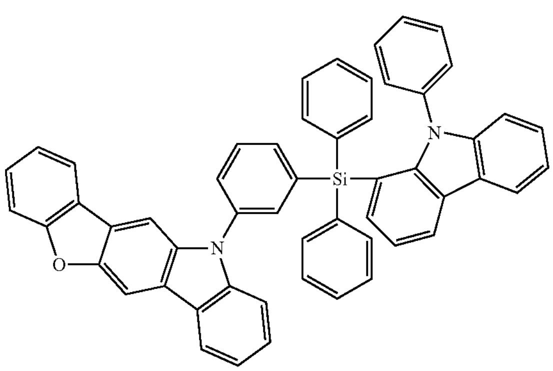
-continued
250
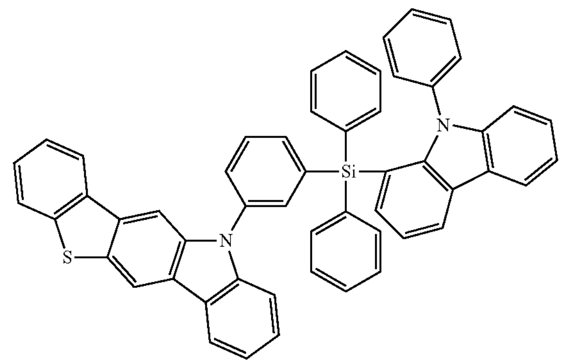
251
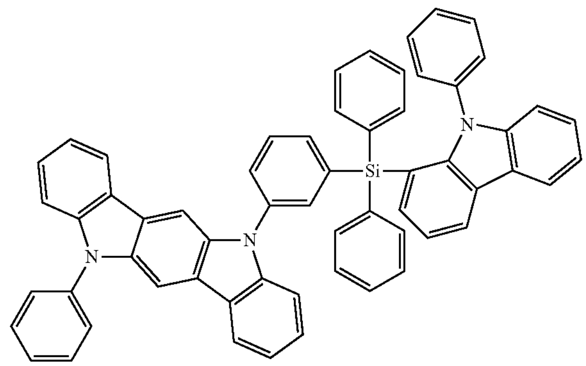
252
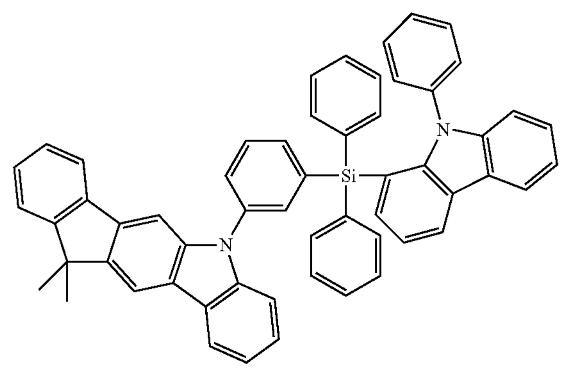
253
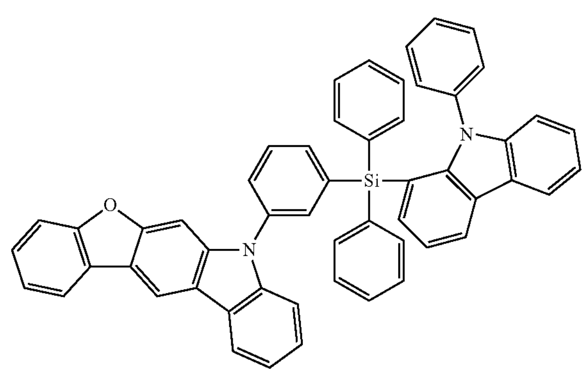

-continued
254
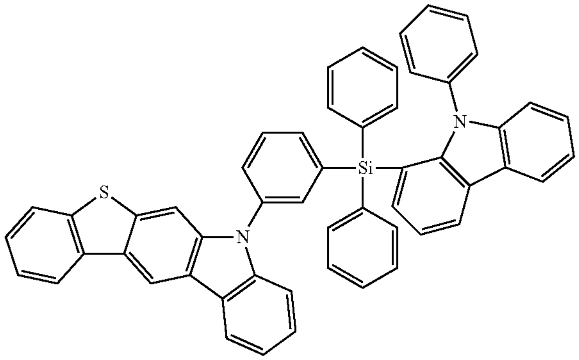
255
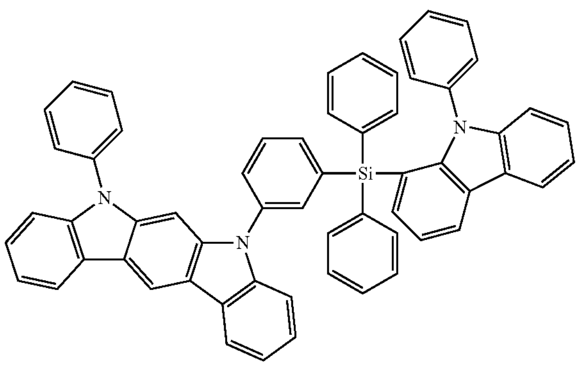
256
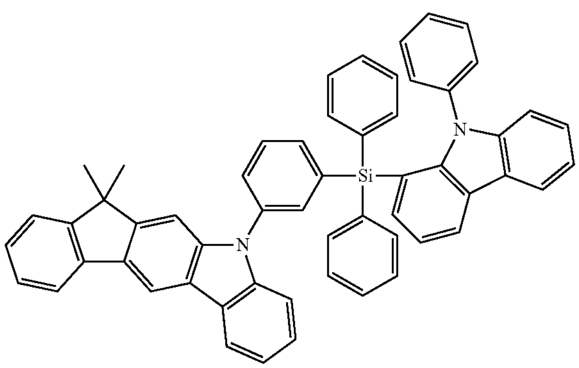
257
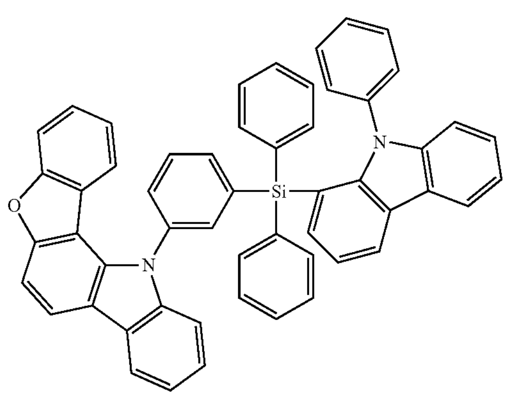
-continued
258
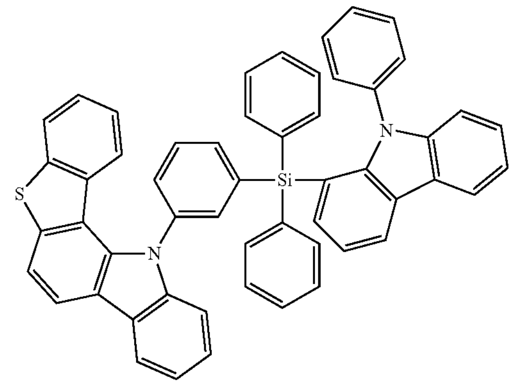
259
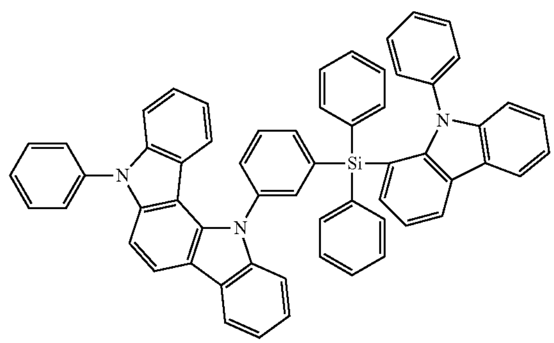
260
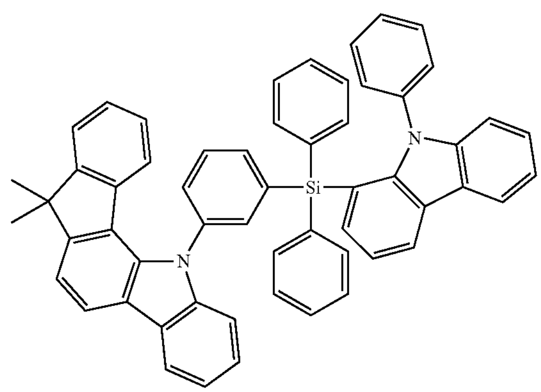
261
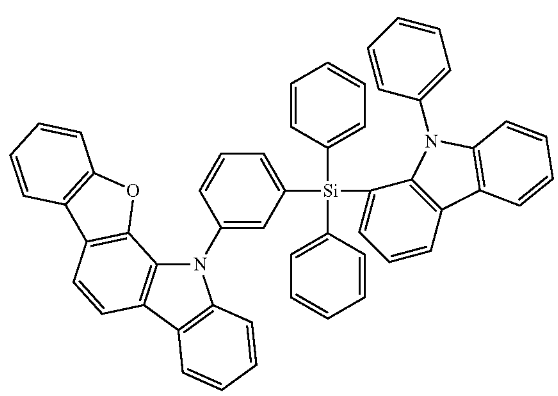

-continued
262
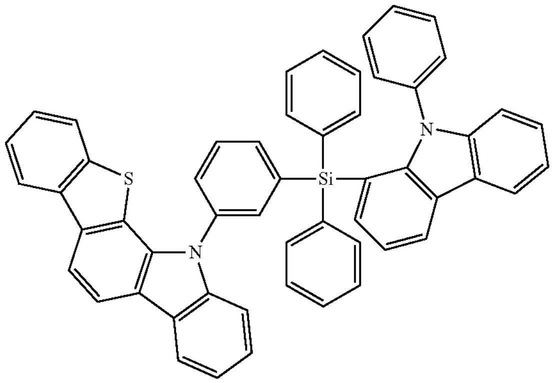
263
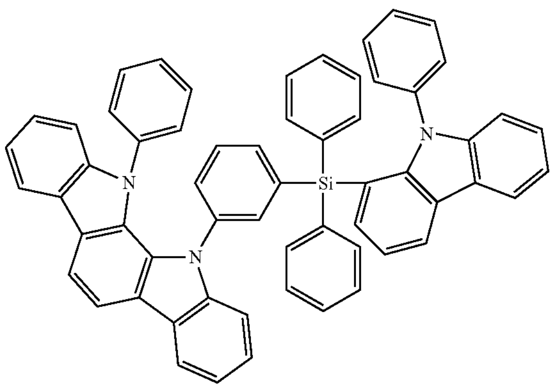
264
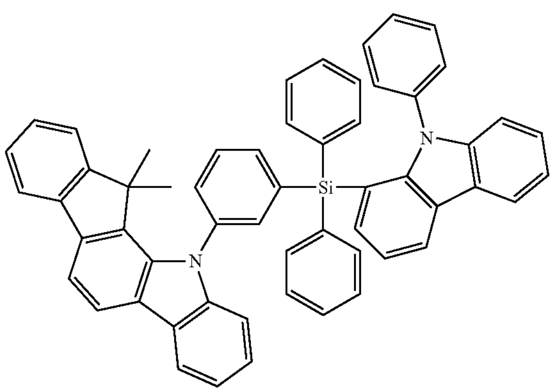
265
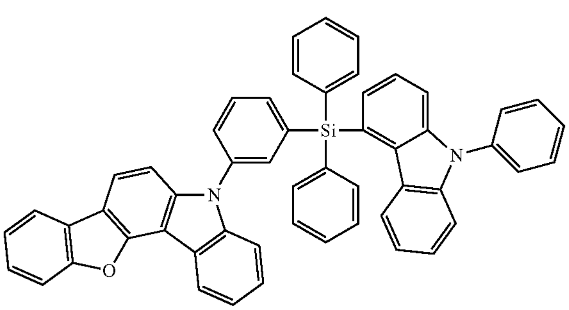
-continued
266
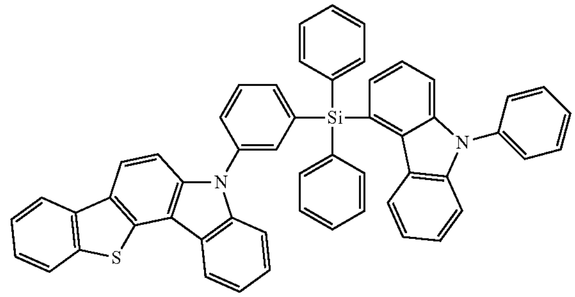
267
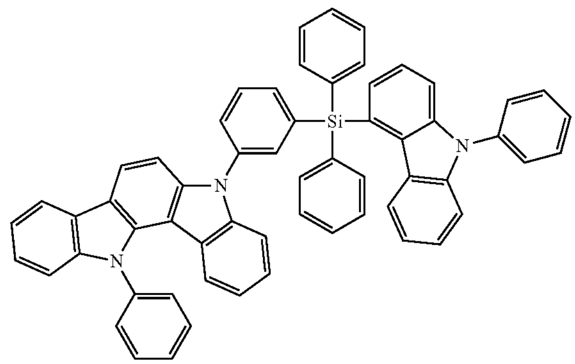
268
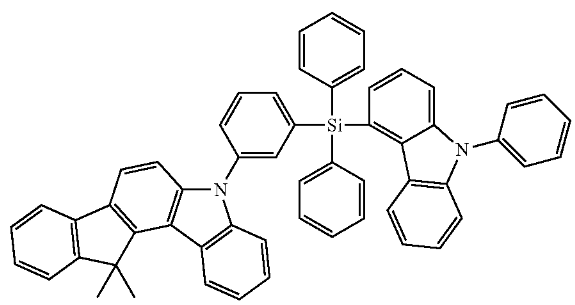
269
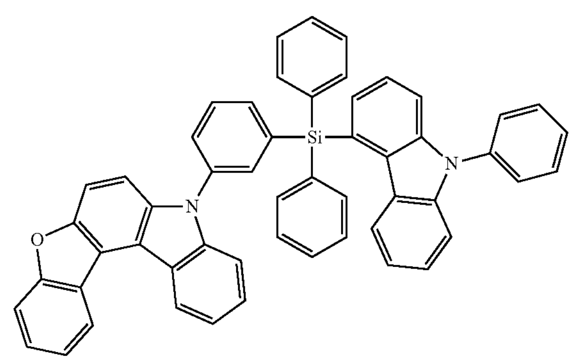

-continued
270
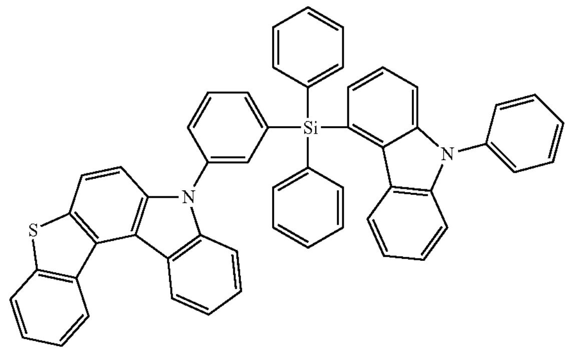
271
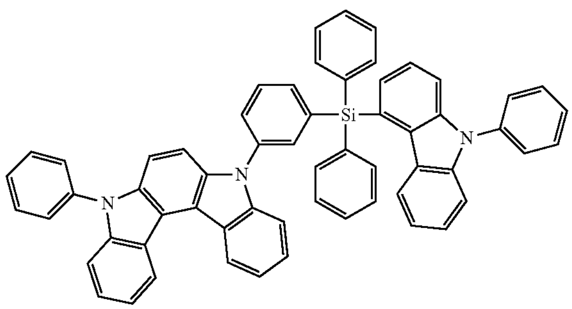
272
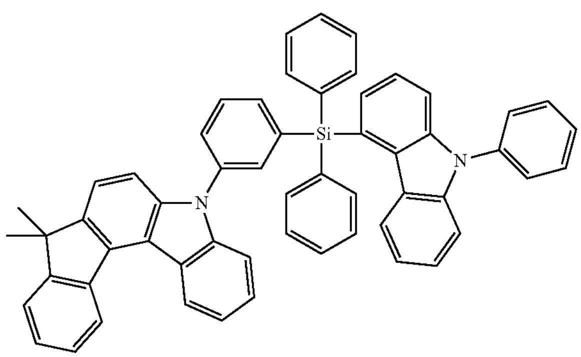
273
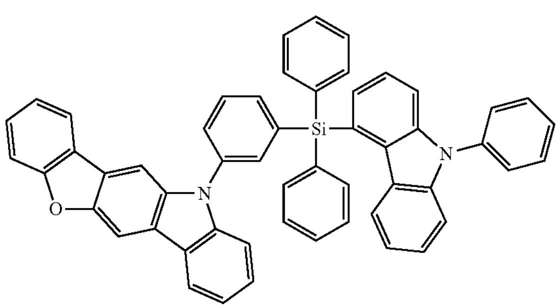
-continued
274
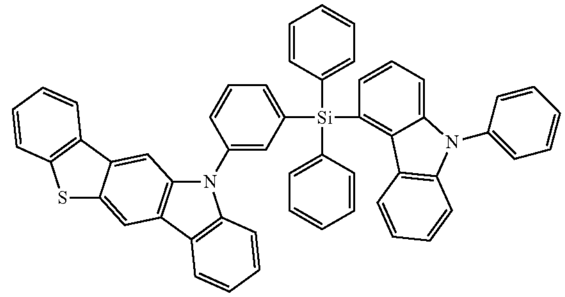
275
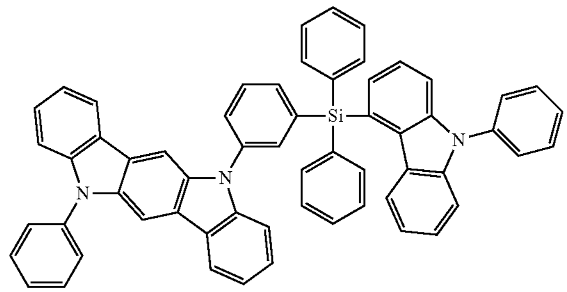
276
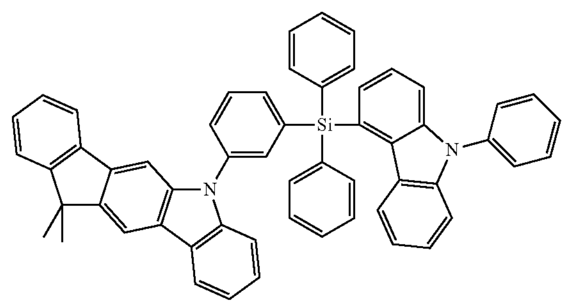
277
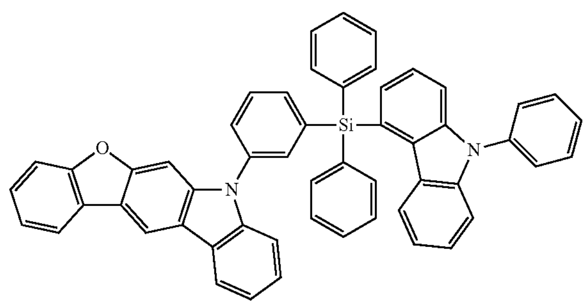
278
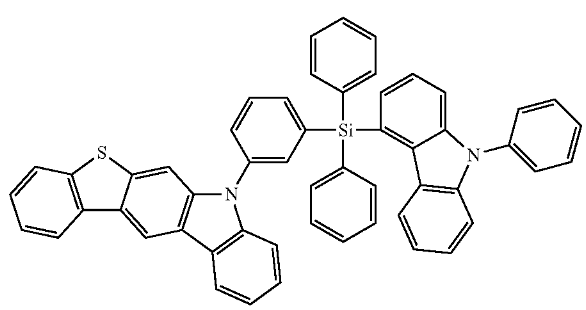

-continued
279
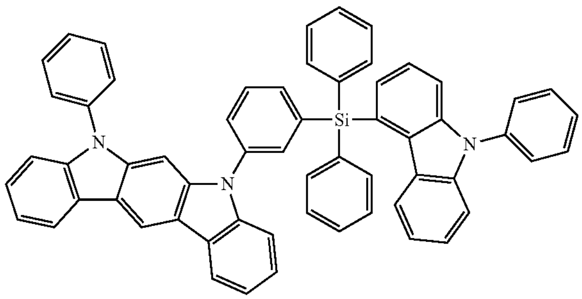
280
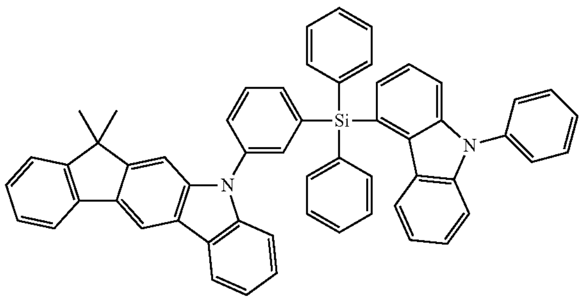
281
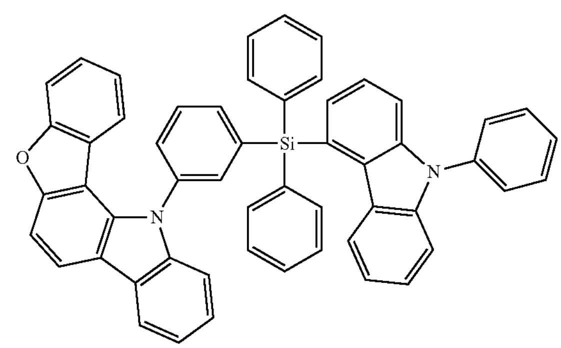
282
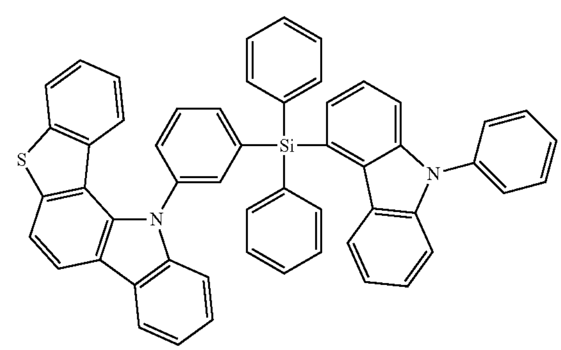
-continued
283
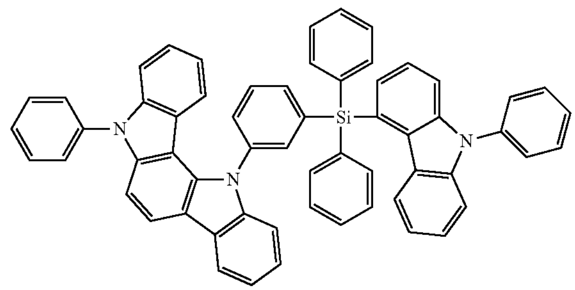
284
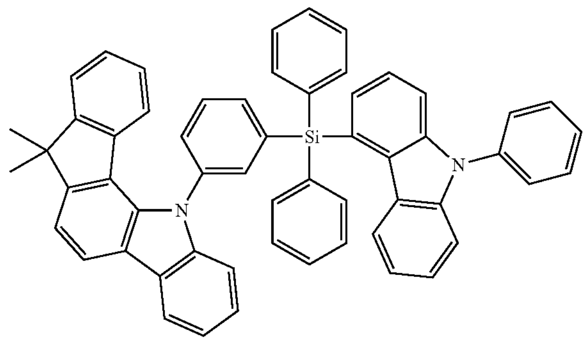
285
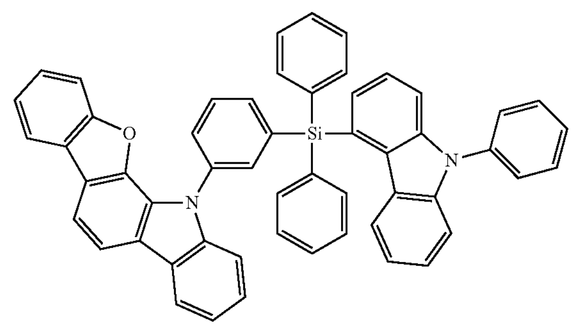
286
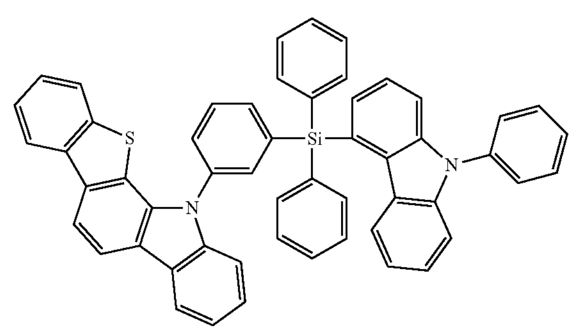

-continued
287
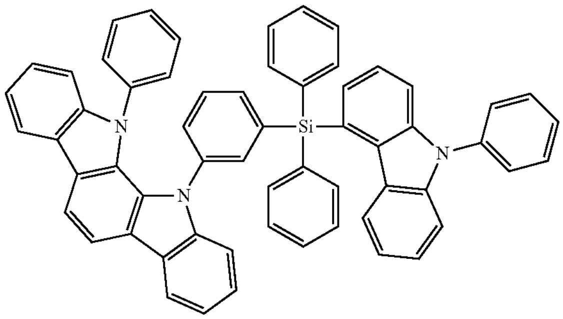
288
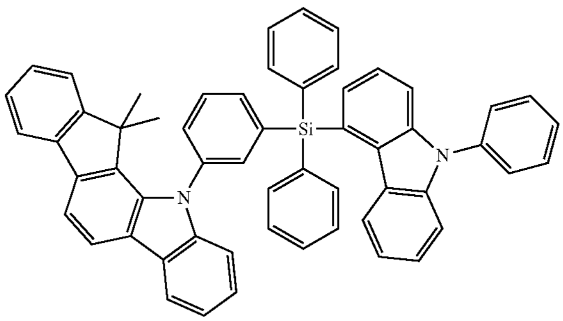
289
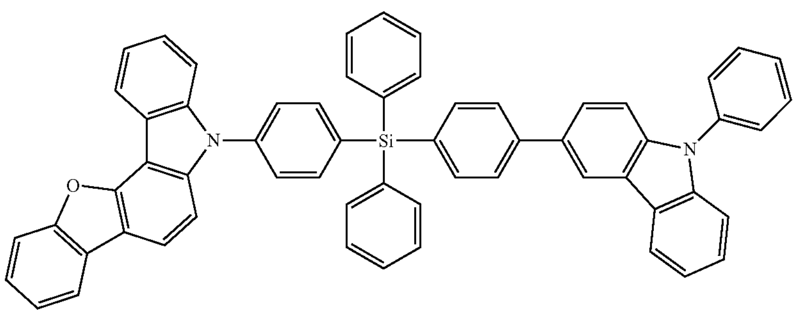
290
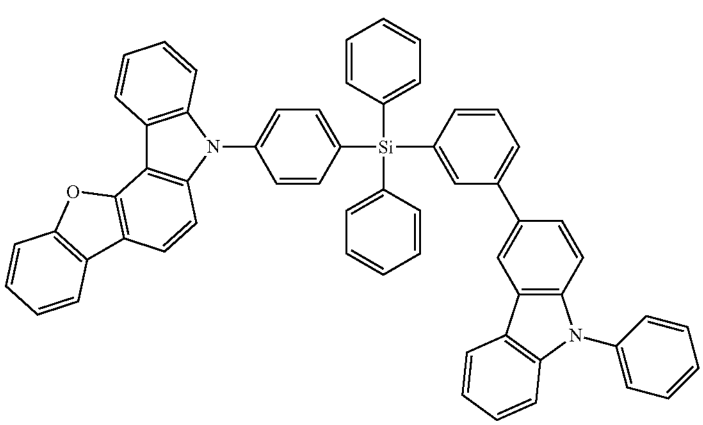

-continued
291
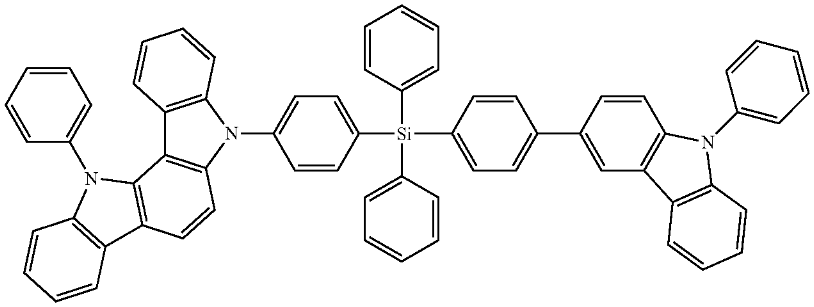
292
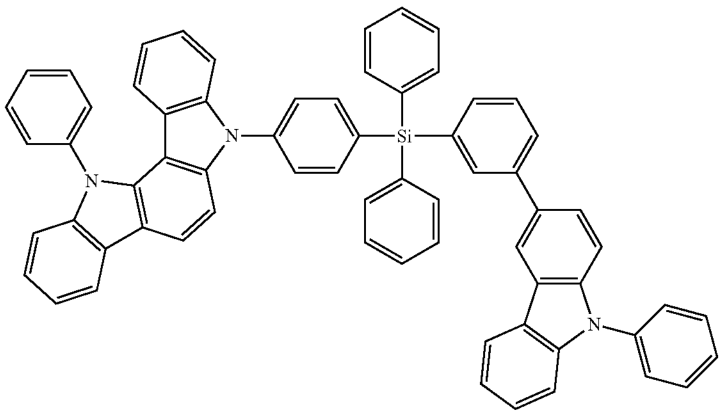
293
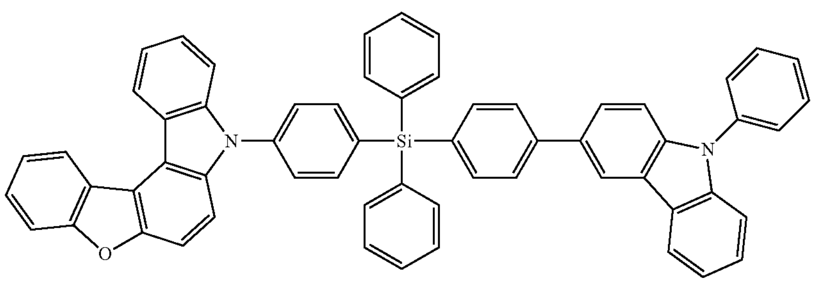
294
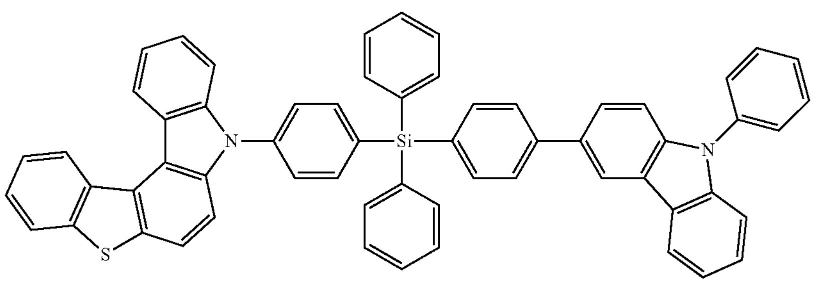

-continued
295
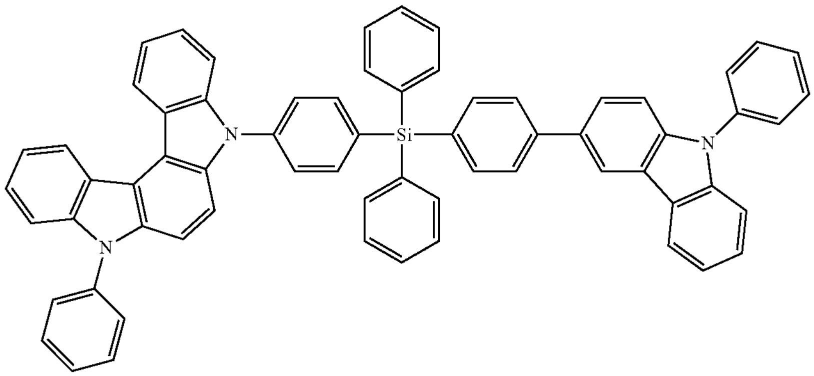
296
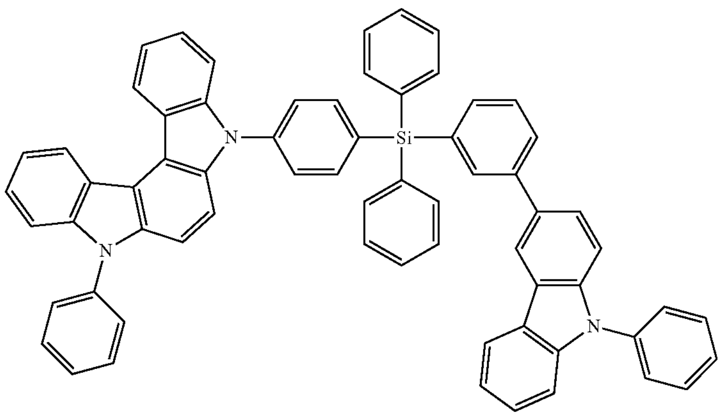
297
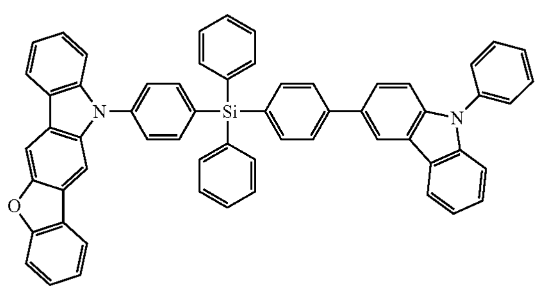
298
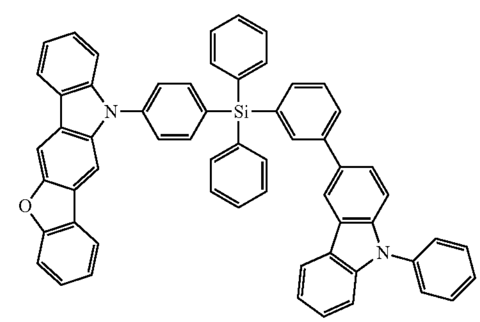
299
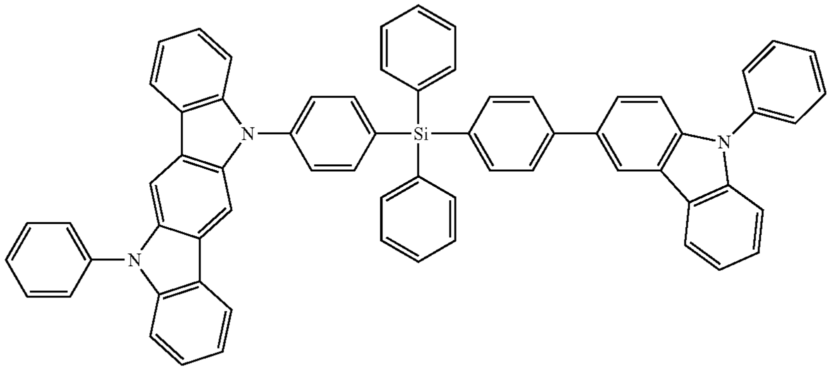

-continued
300
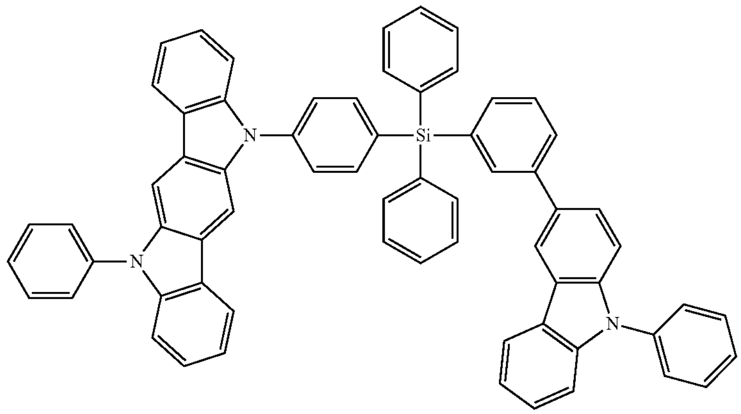
301
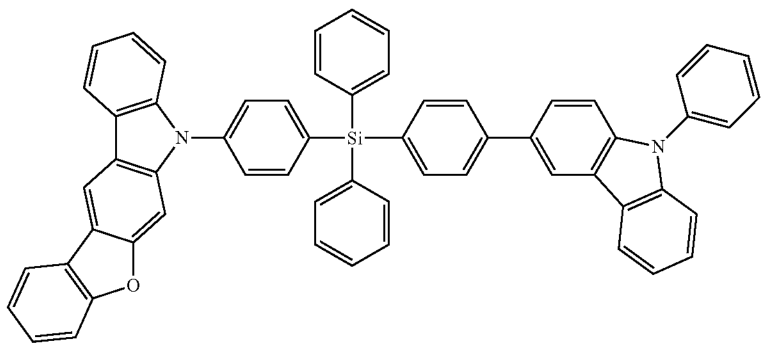
302
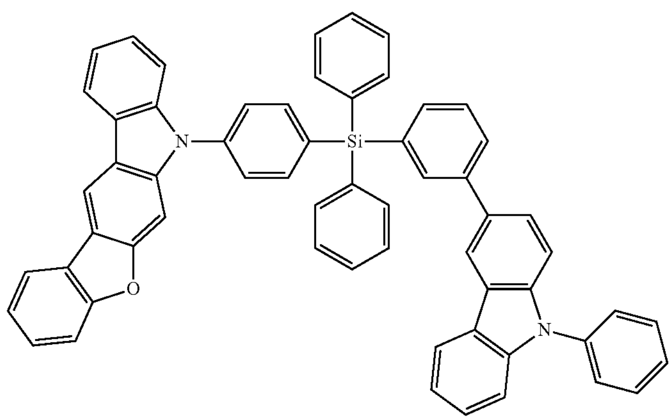
303
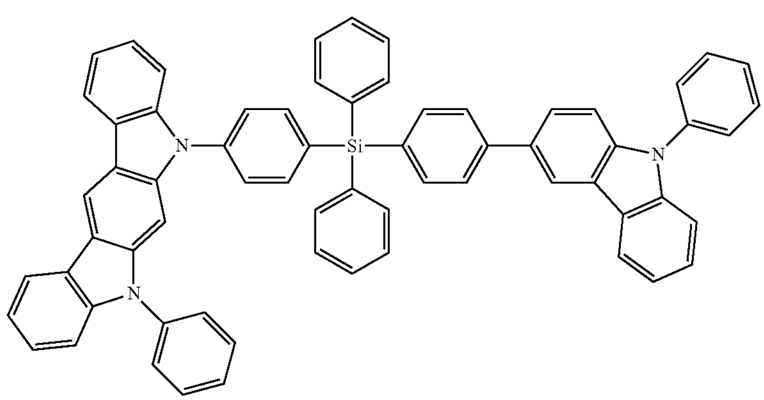

-continued
304
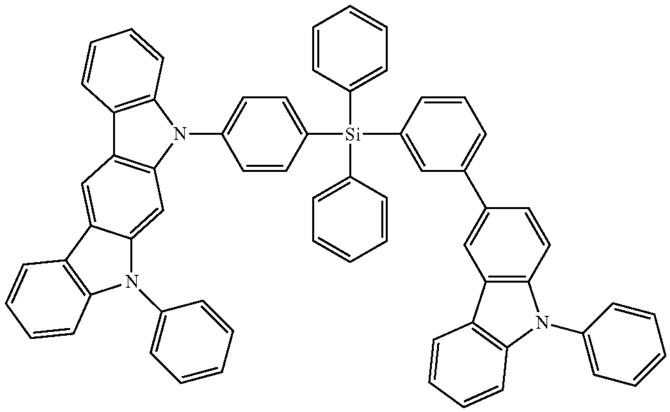
305
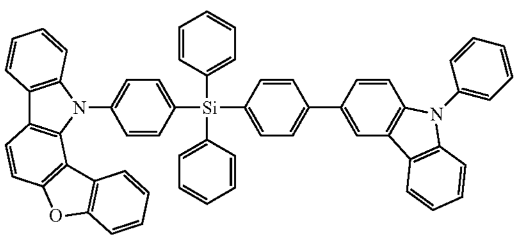
306
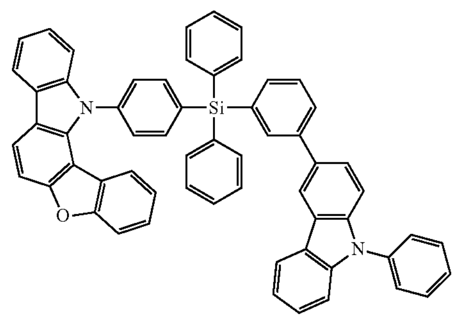
307
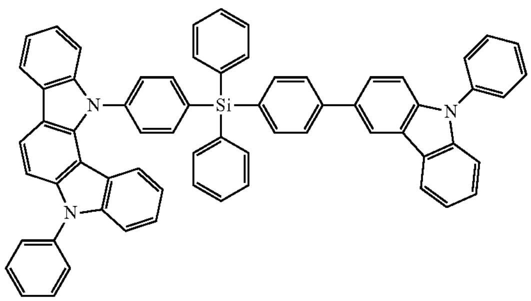
308
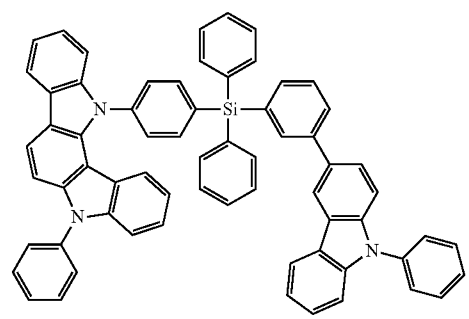
309
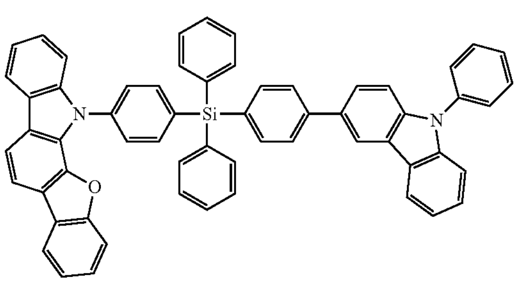
310
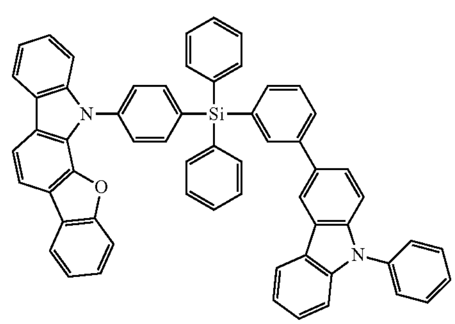

-continued
311
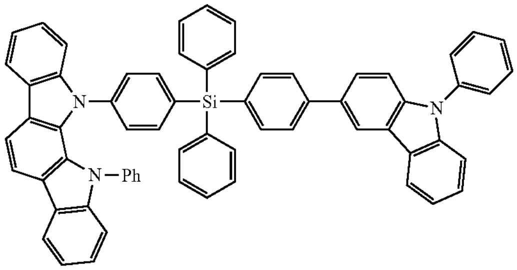
312
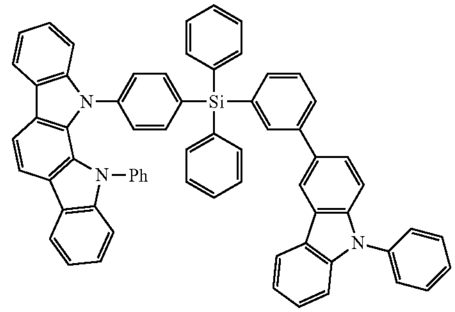
313
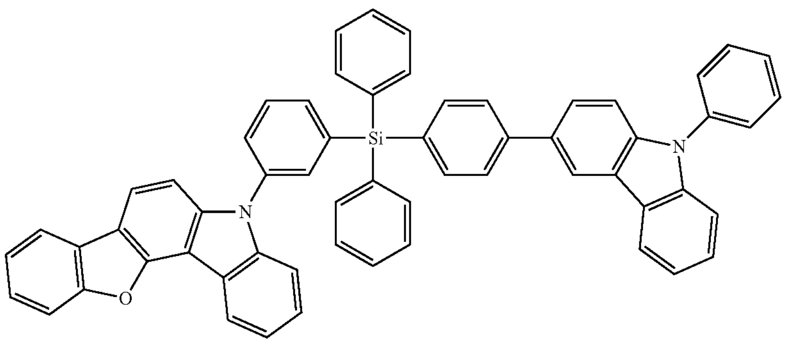
314
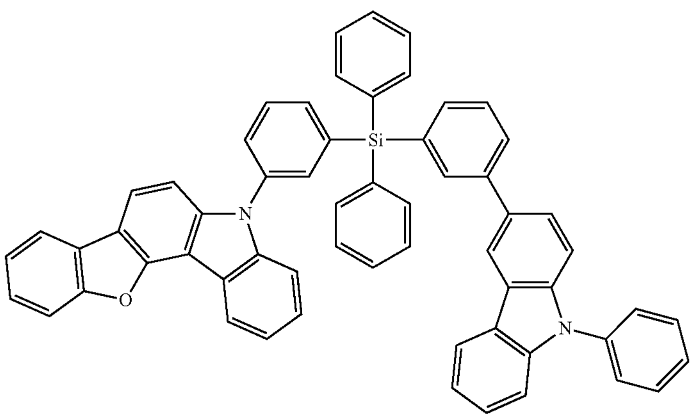
315
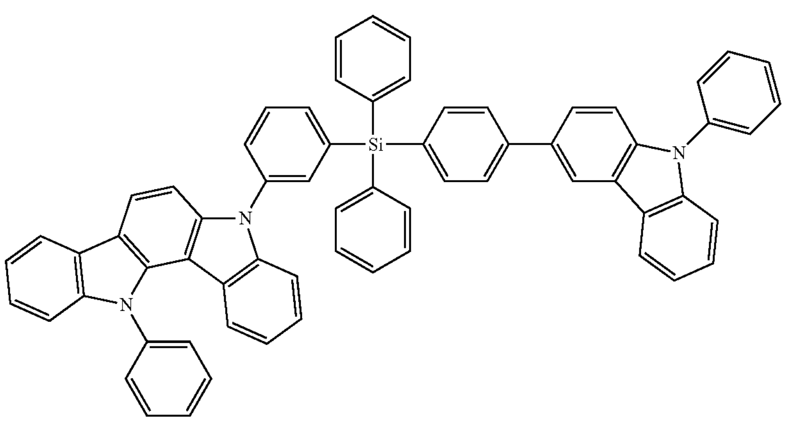

-continued
316
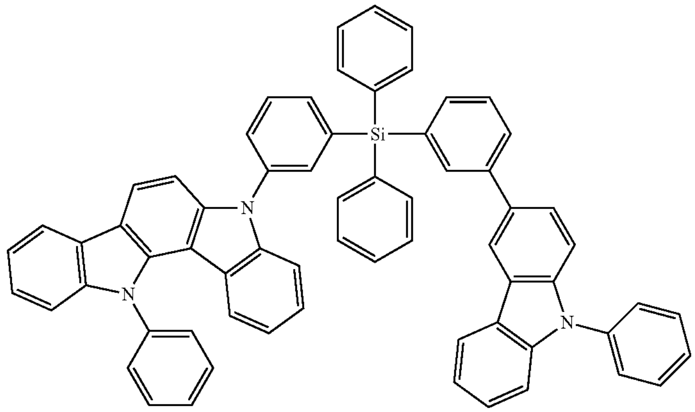
317
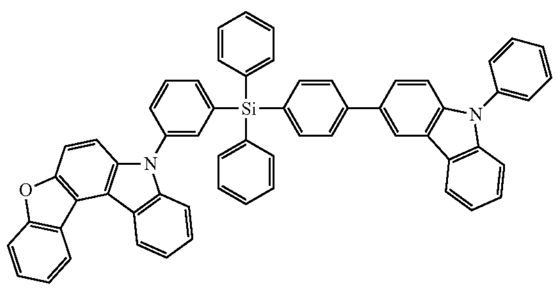
318
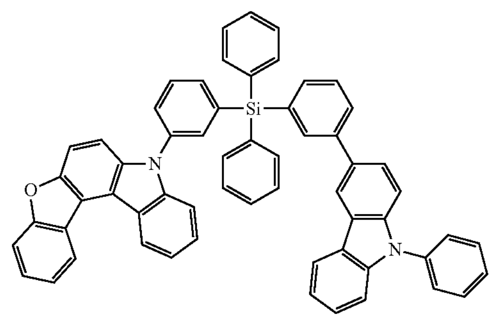
319
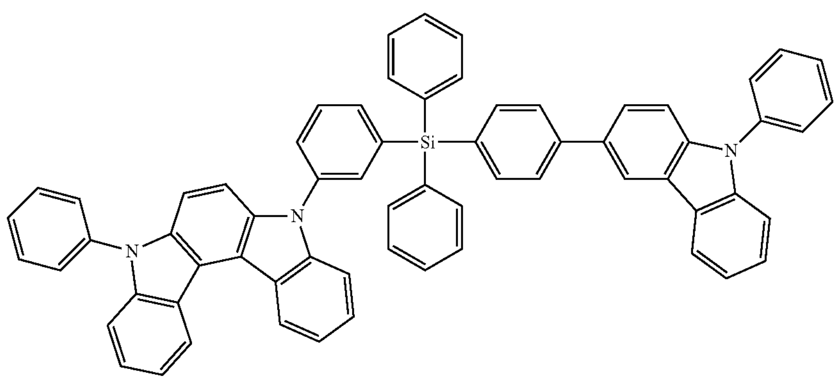
320
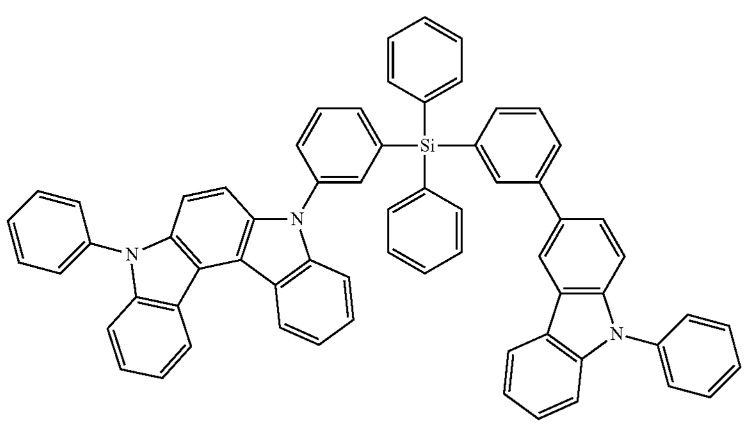

-continued
321
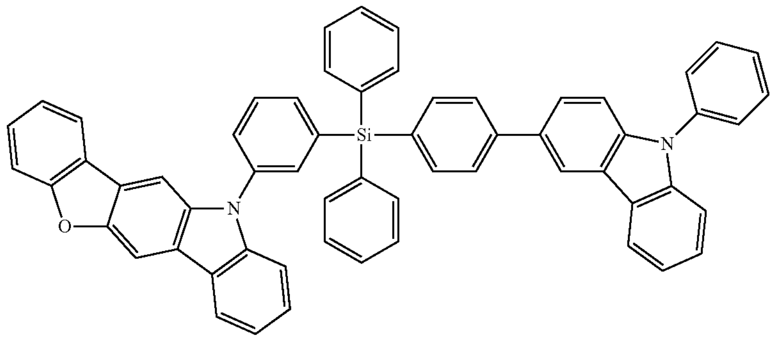
322
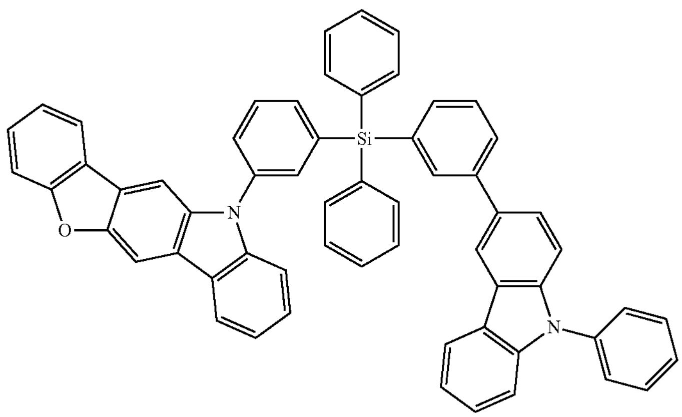
323
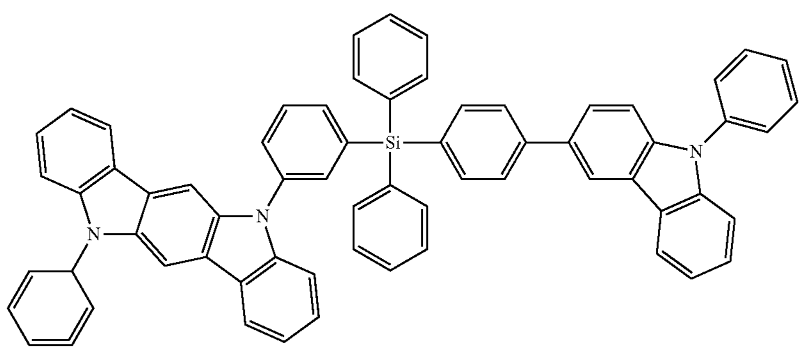
324
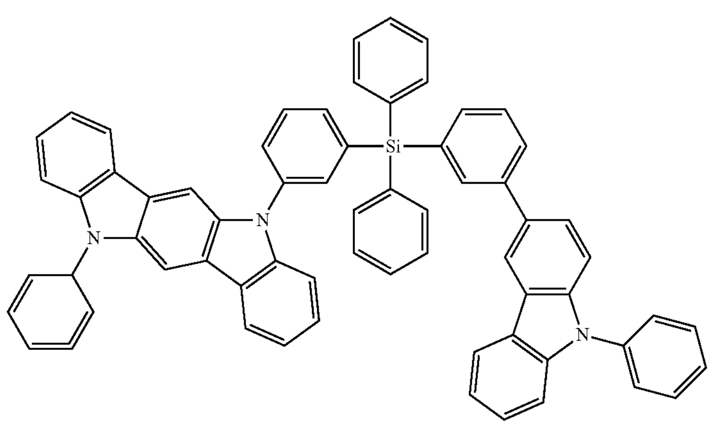

-continued
325
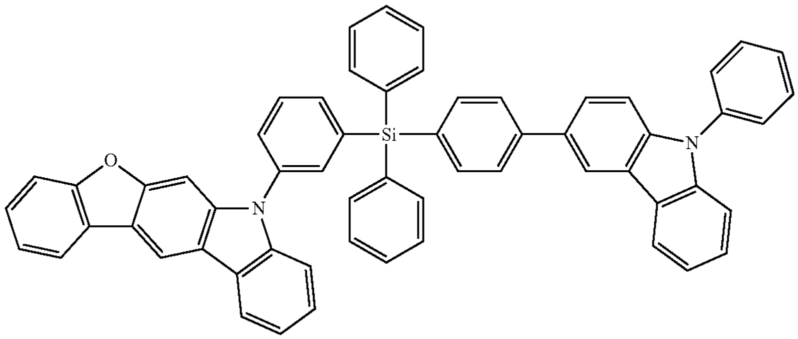
326
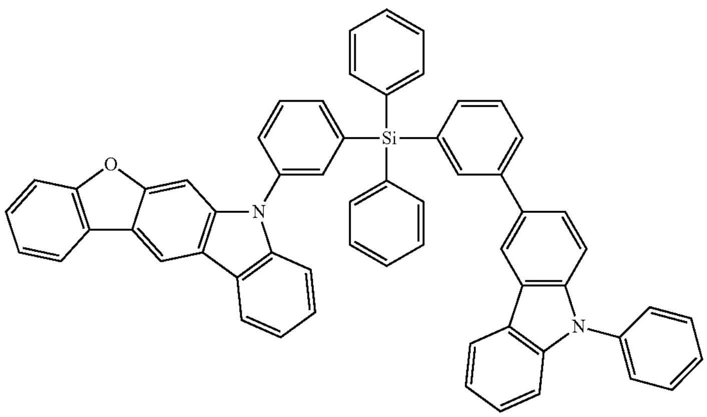
327
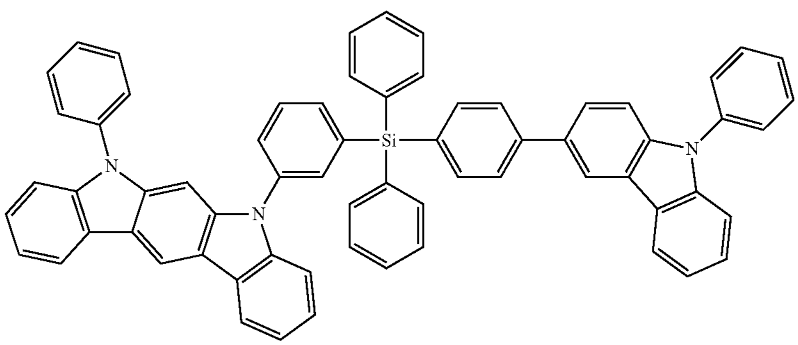
328
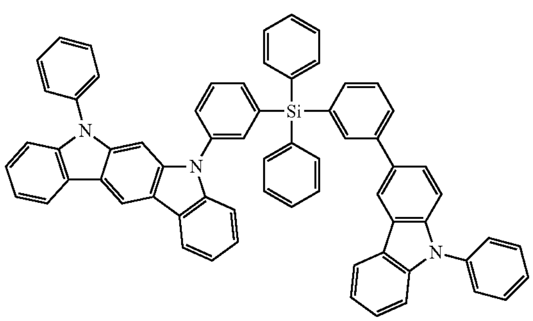
329
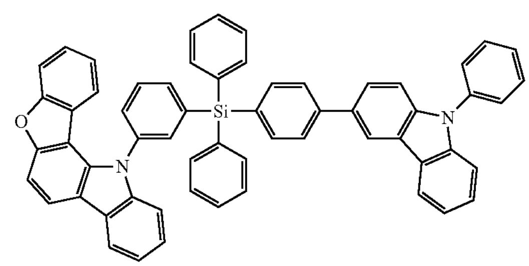

-continued
330
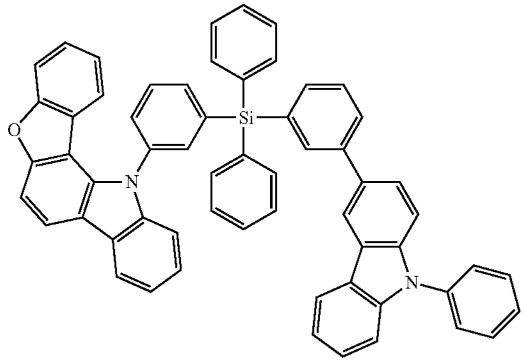
331
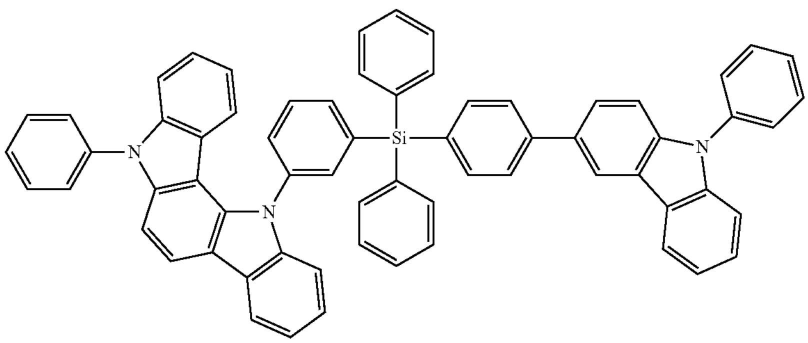
332
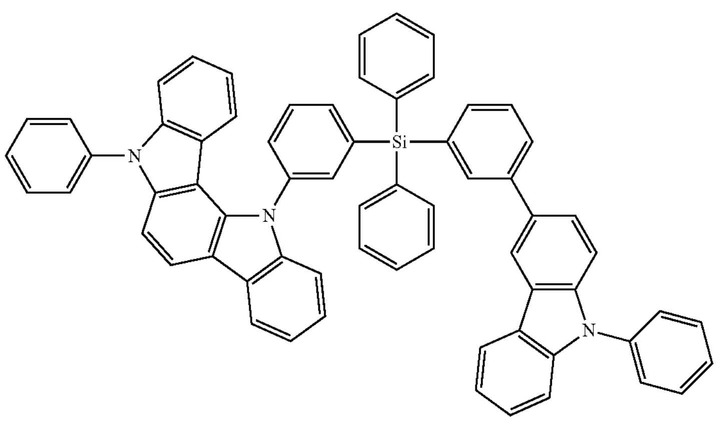
333
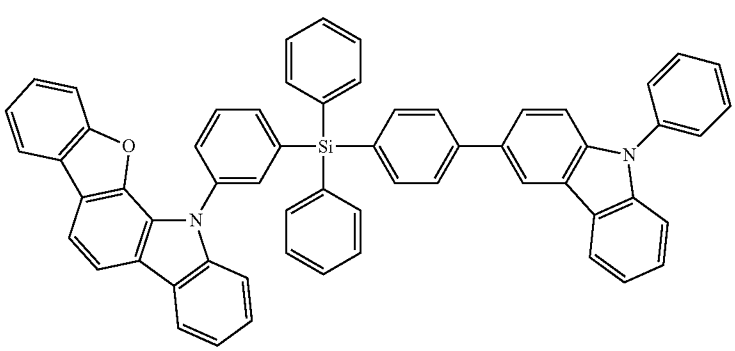

-continued
334
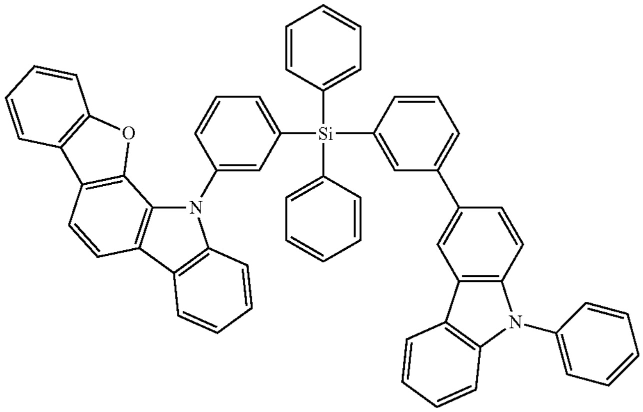
335
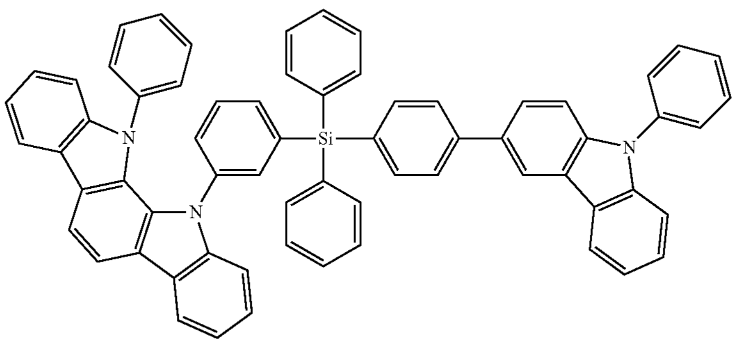
336
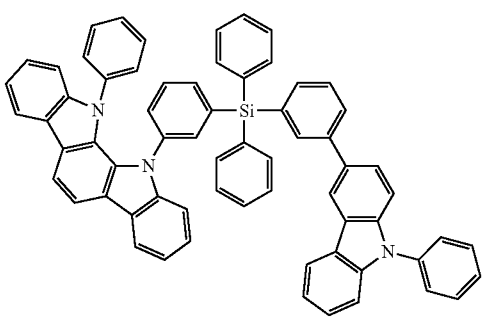
337
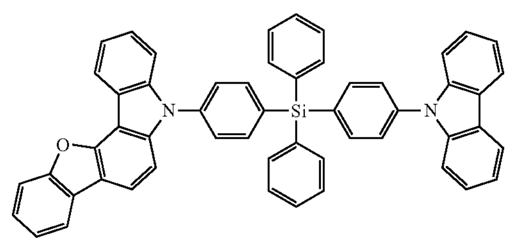
338
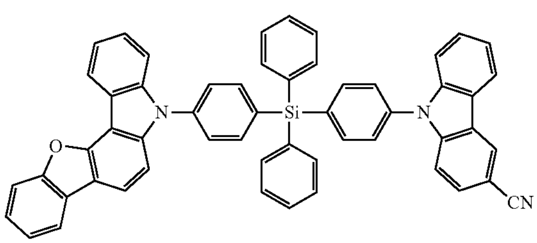
339
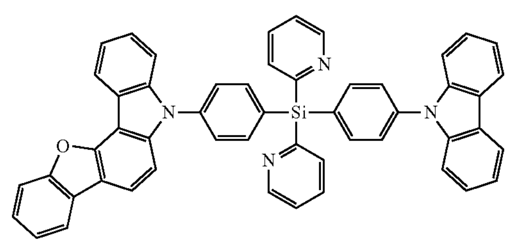
340
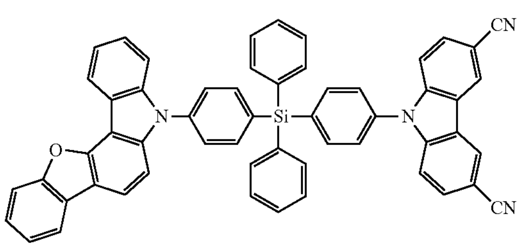
341
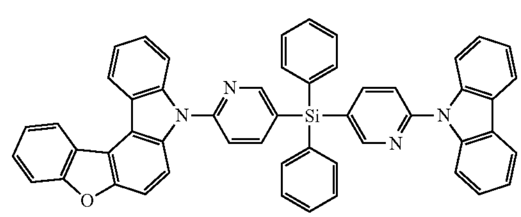

-continued
342
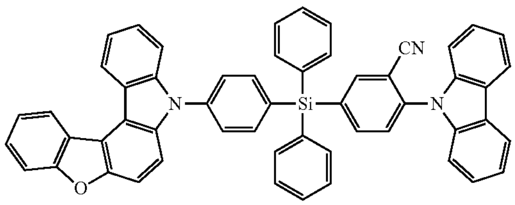
343
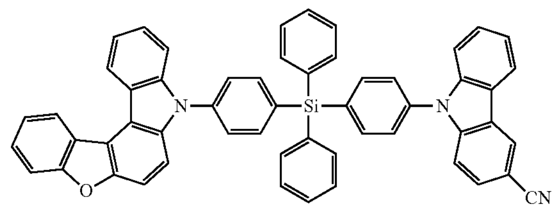
344
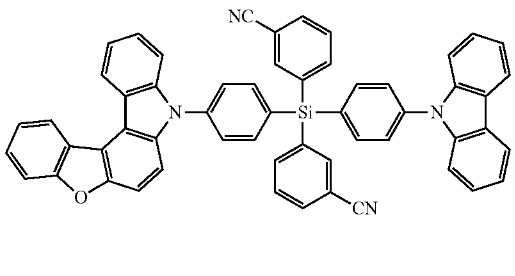
345
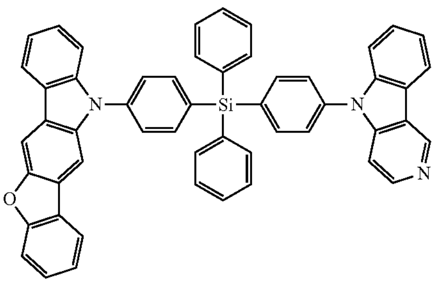
346
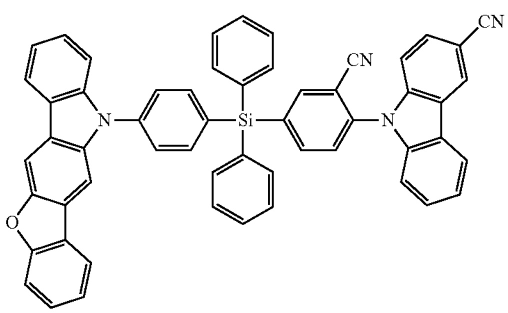
347
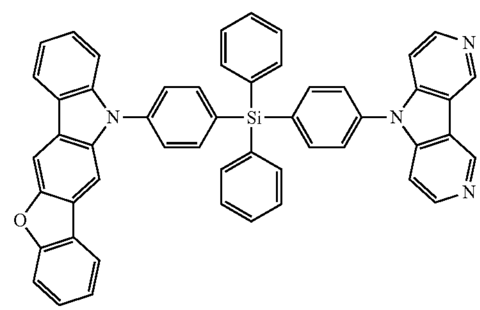
348
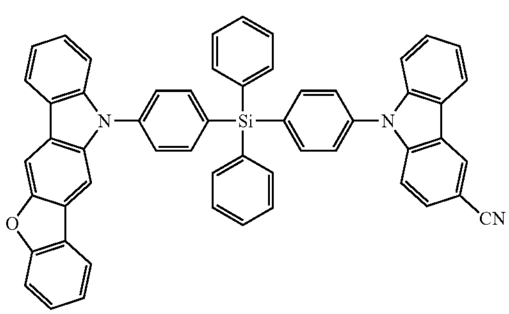
349
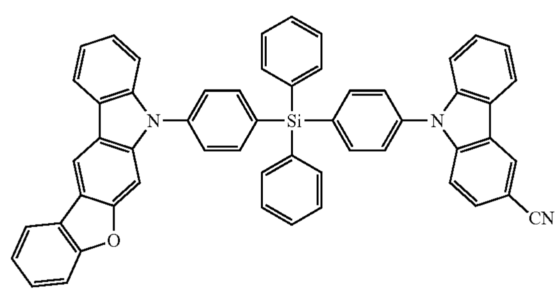
350
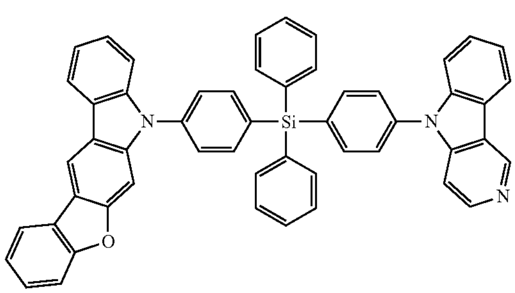
351
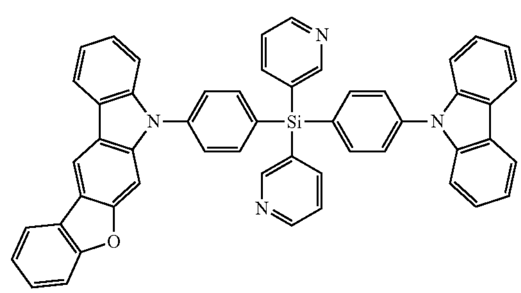

-continued
352
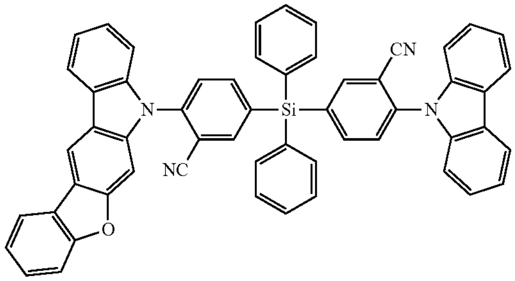
353
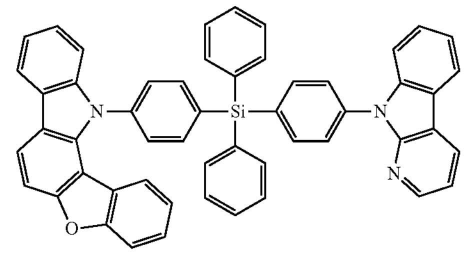
354
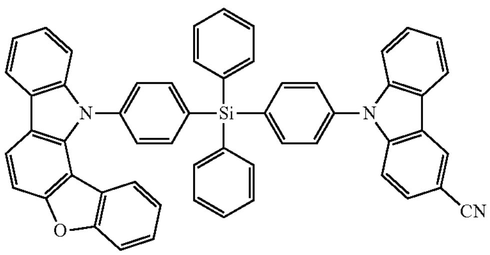
355
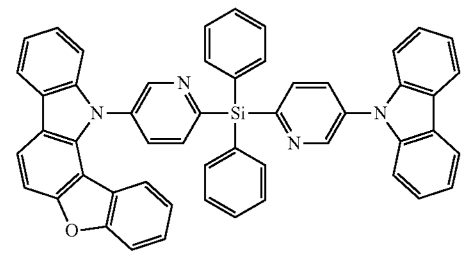
356
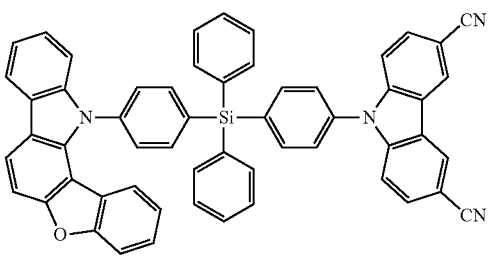
357
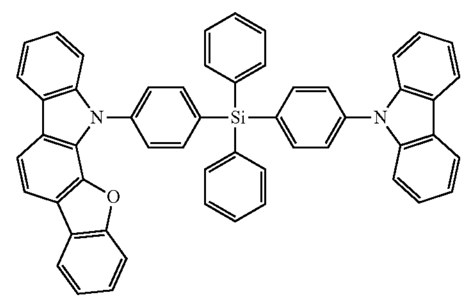
358
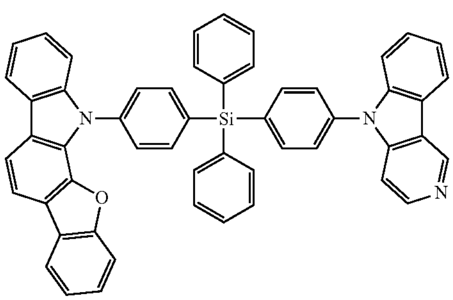
359
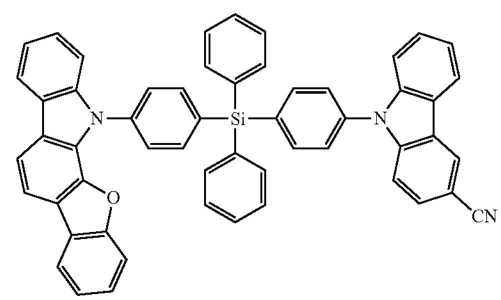
360
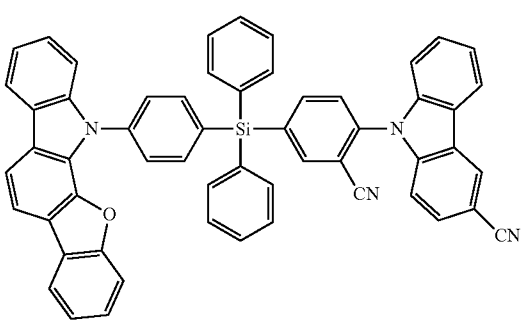
361
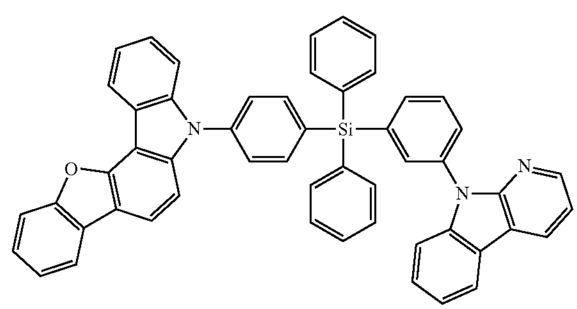

-continued
362
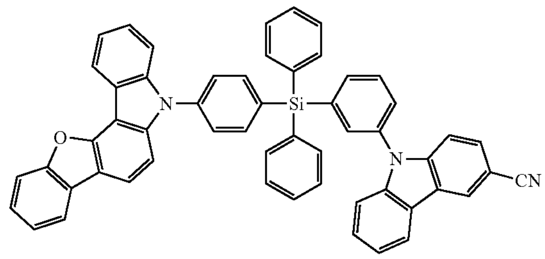
363
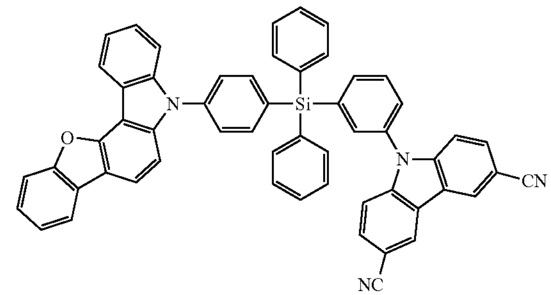
364
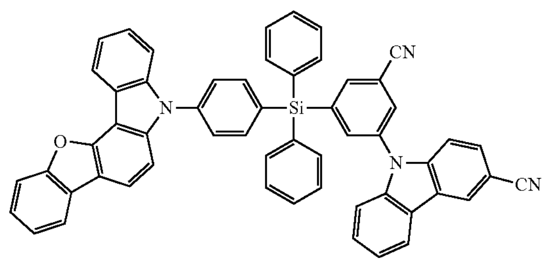
365
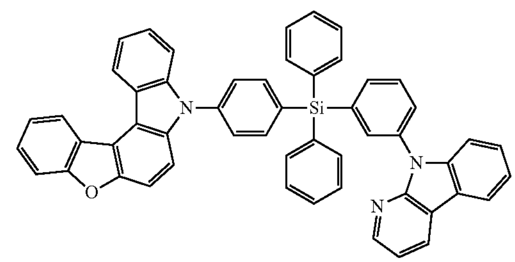
366
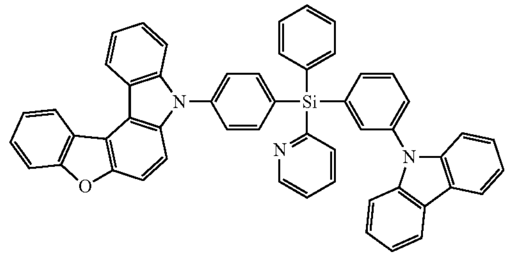
367
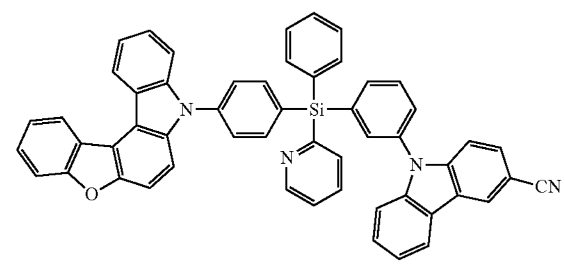
368
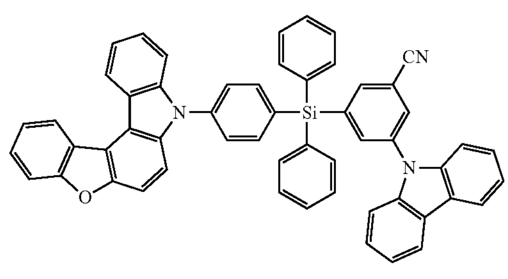
369
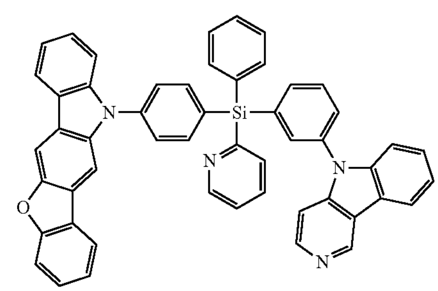
370
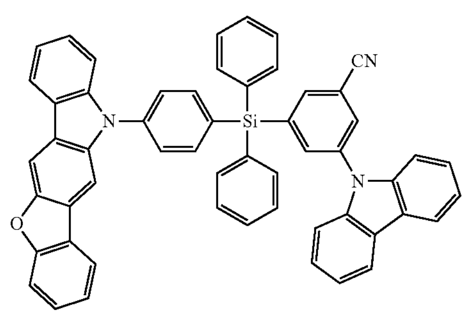
371
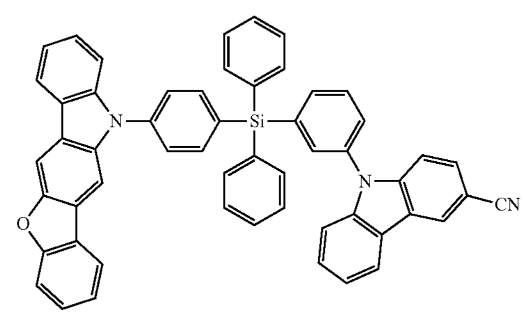

-continued
372
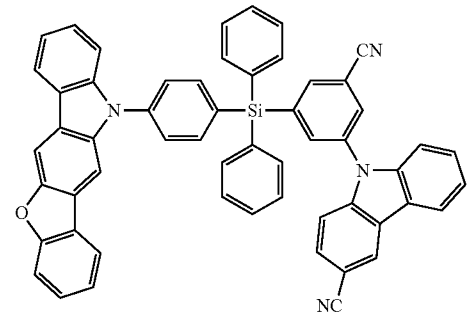
373
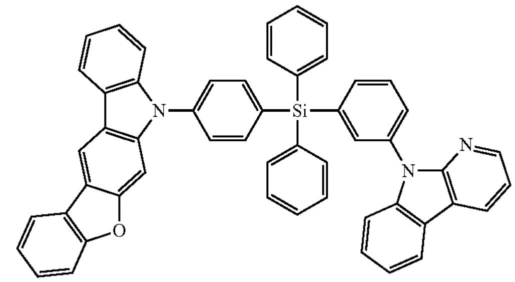
374
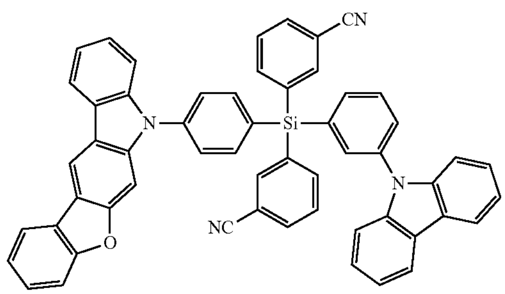
375
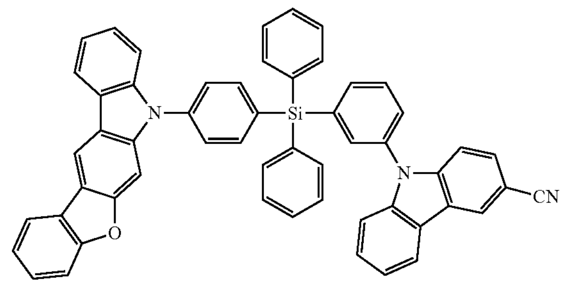
376
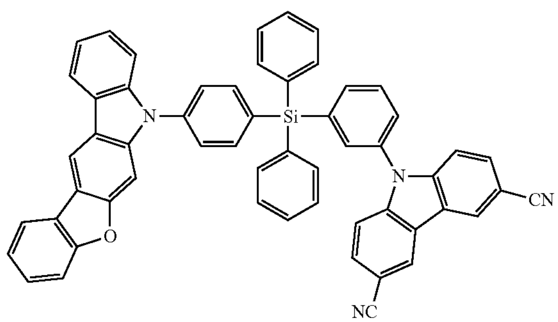
377
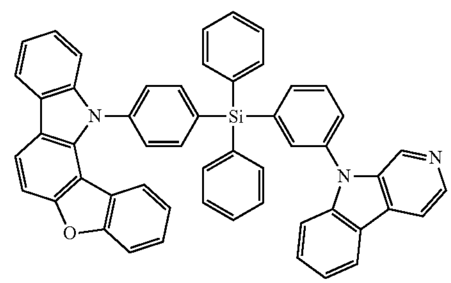
378
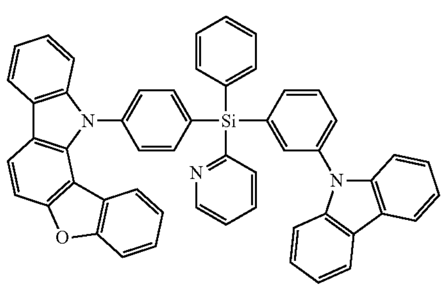
379
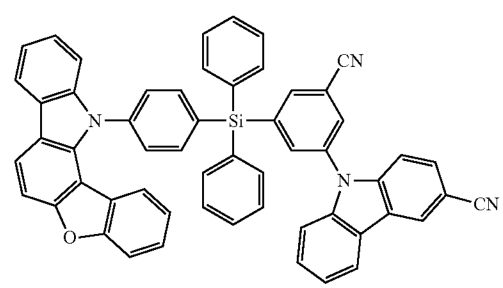
380
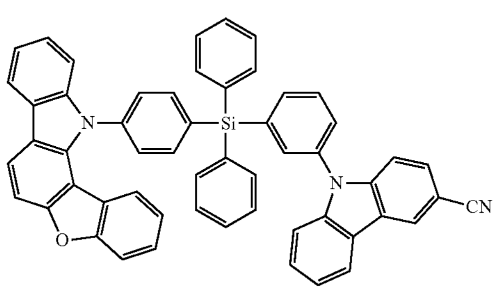
381
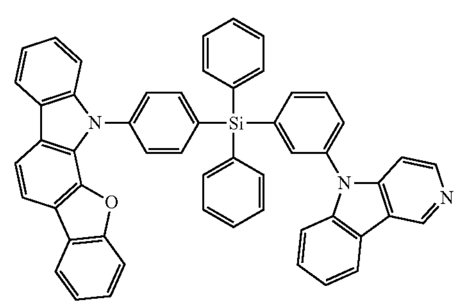

-continued
382
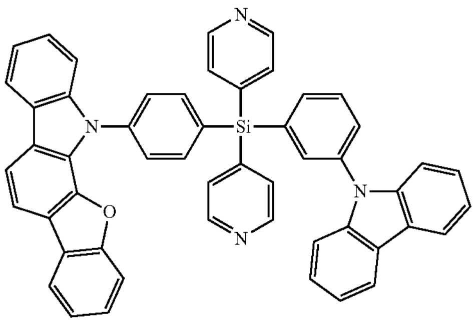
383
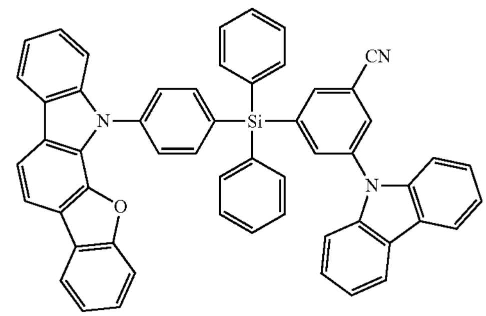
384
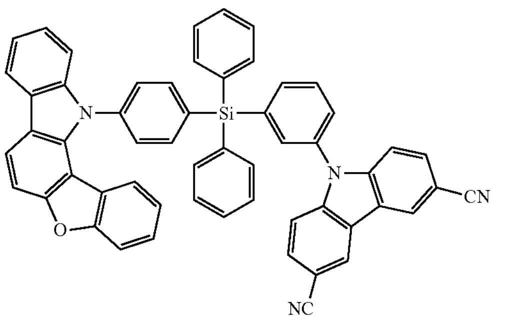
385
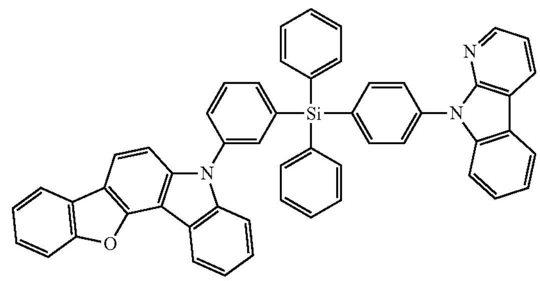
386
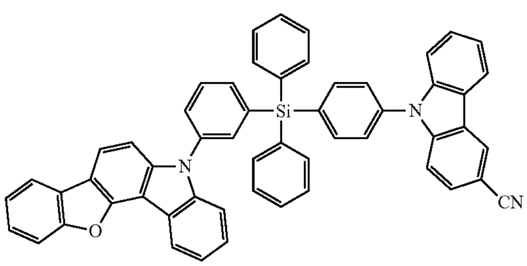
387
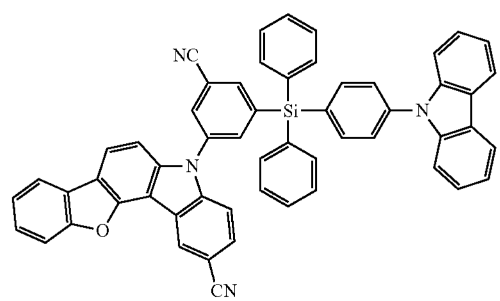
388
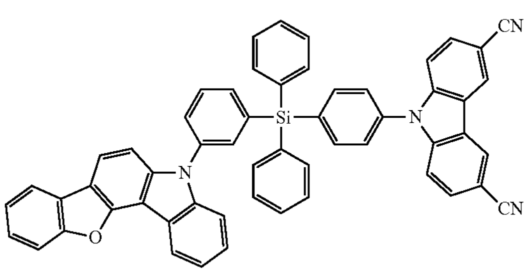
389
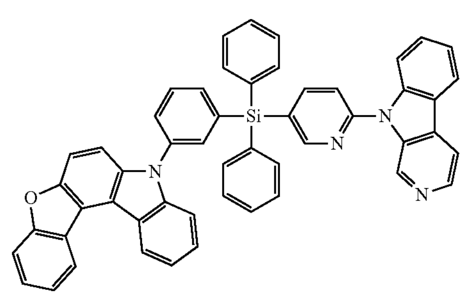
390
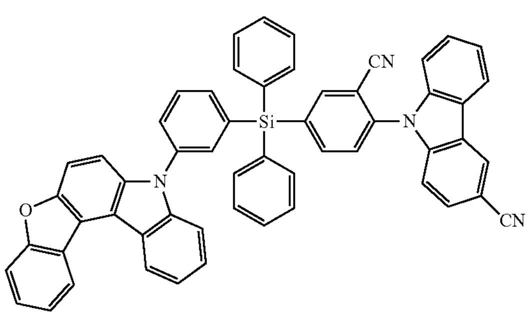
391
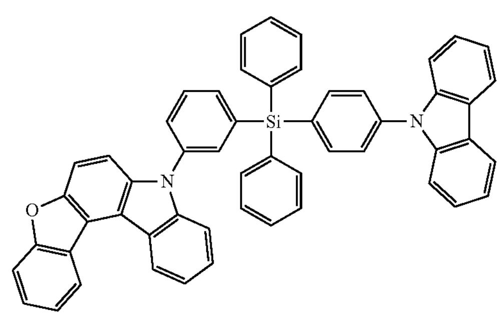

-continued
392
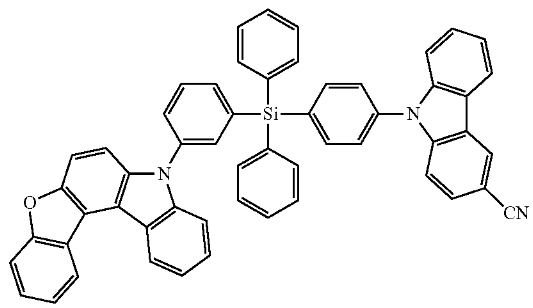
393
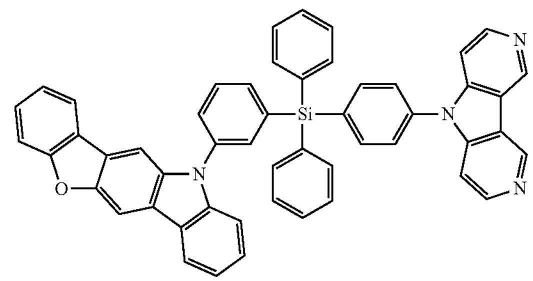
395
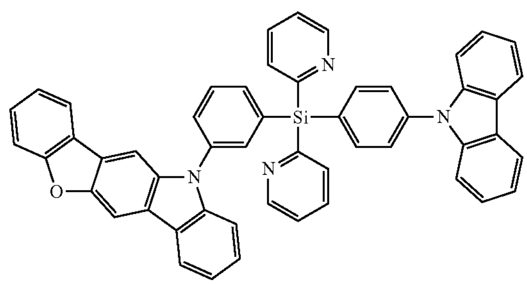
394
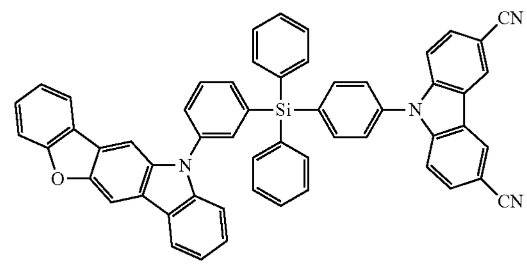
396
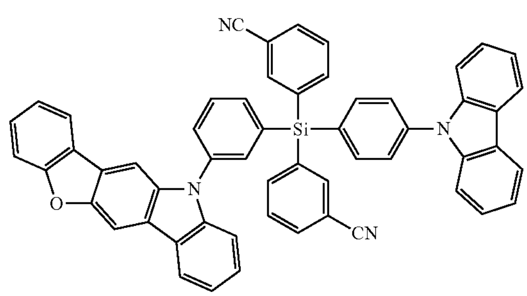
397
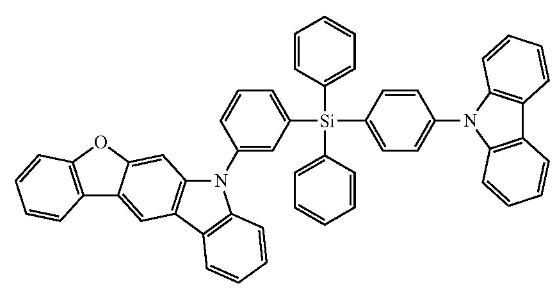
398
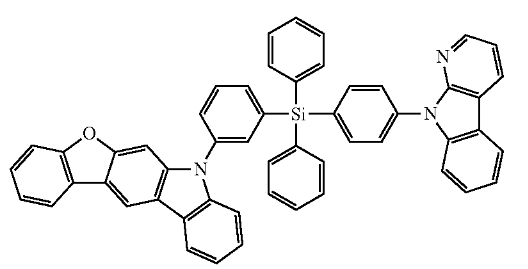
399
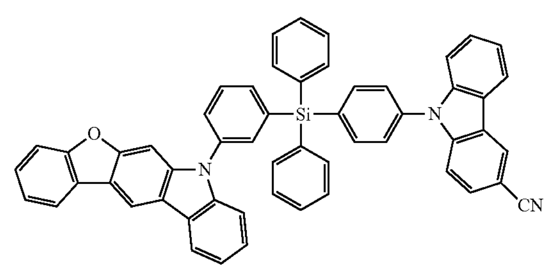
400
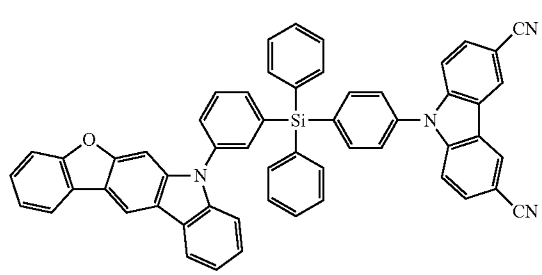
401
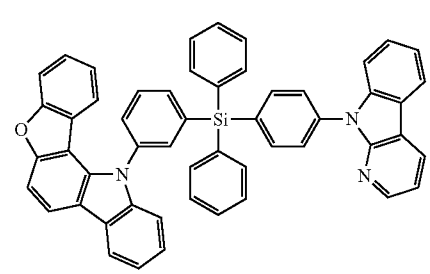

-continued
402
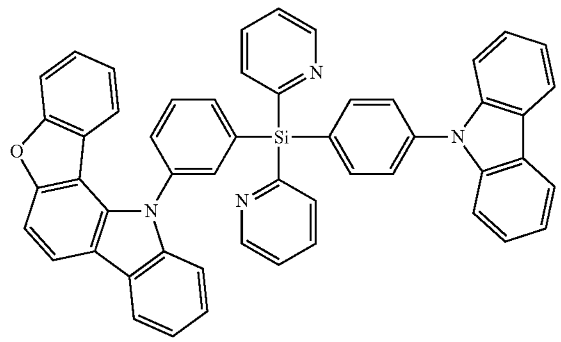
403
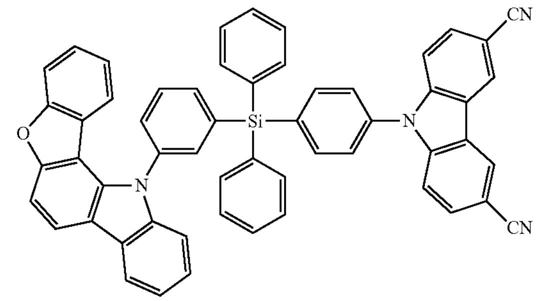
404
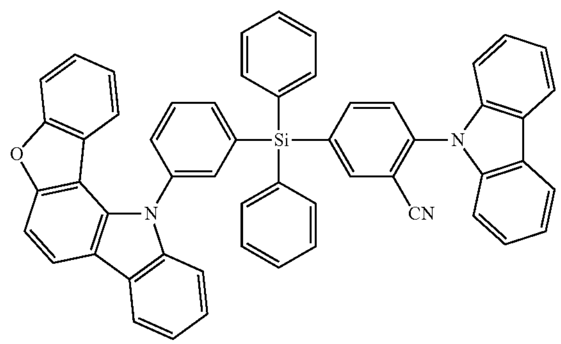
405
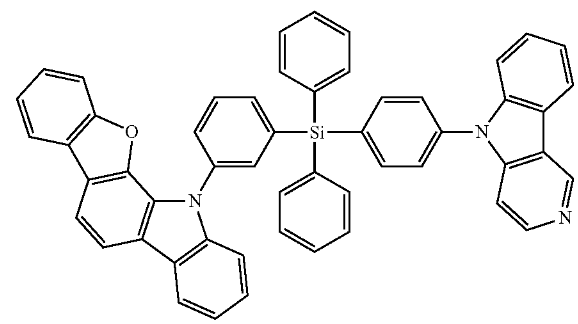
406
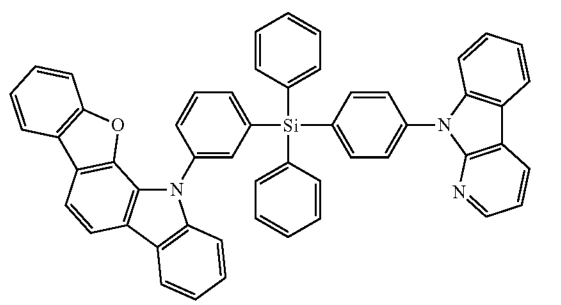
407
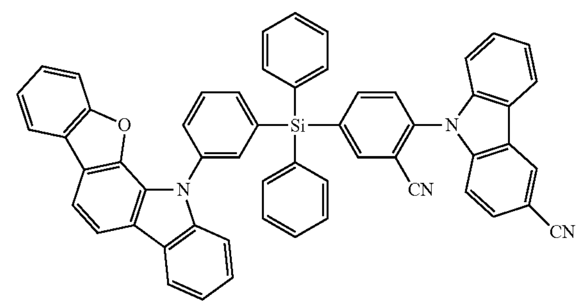
408
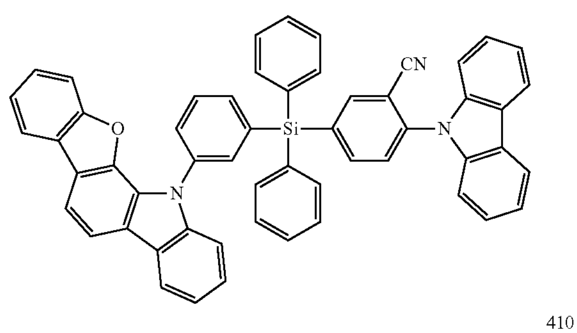
409
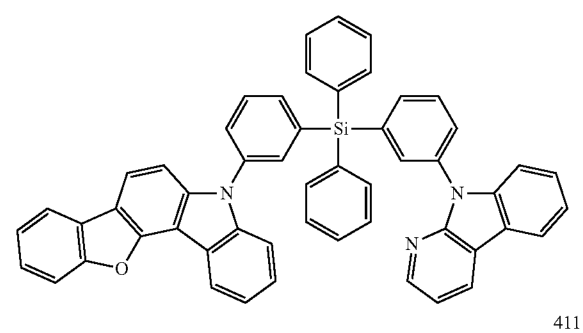
410
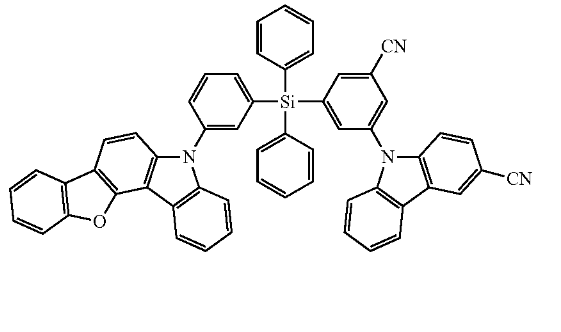
411
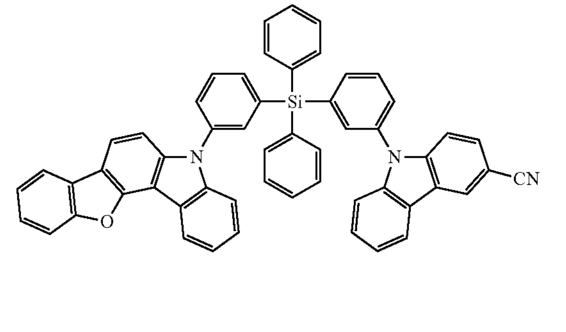

-continued
412
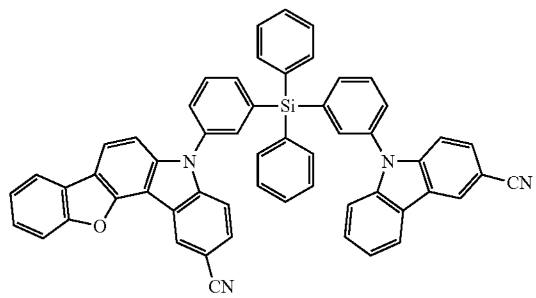
413
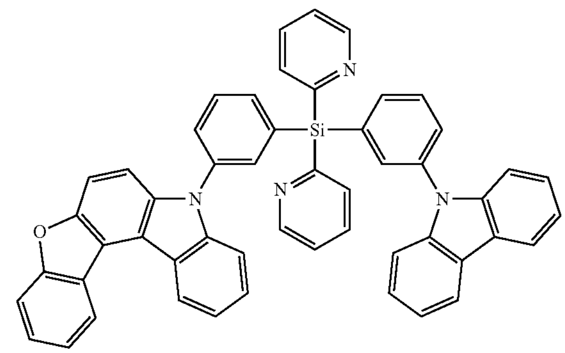
414
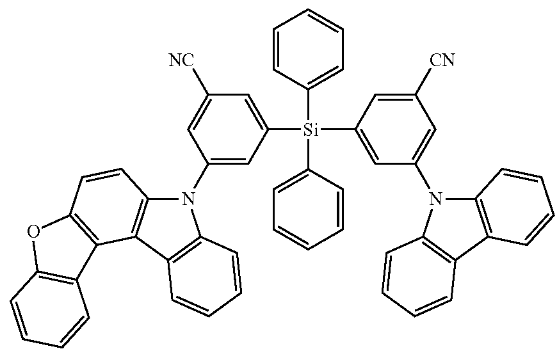
415
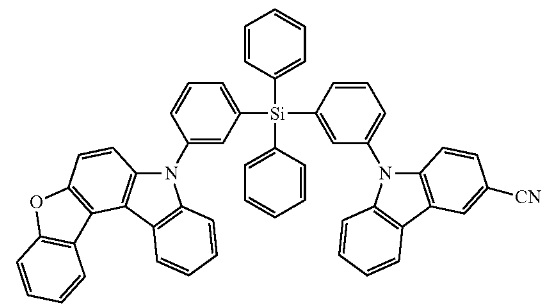
416
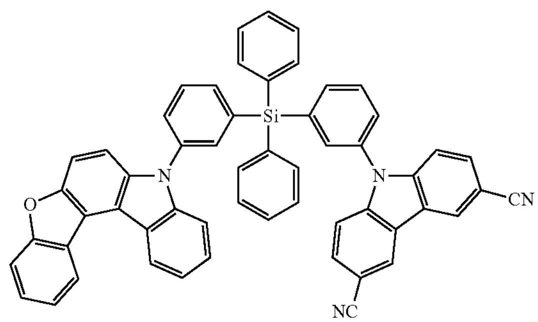
417
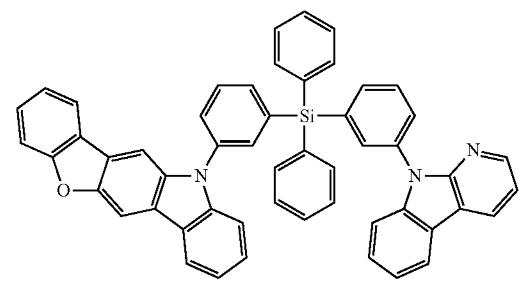
418
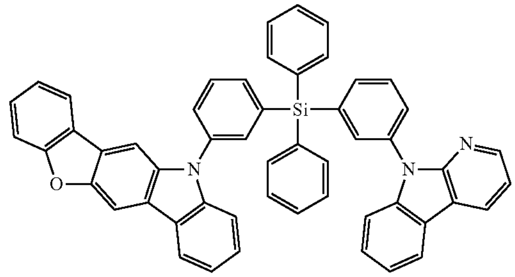
419
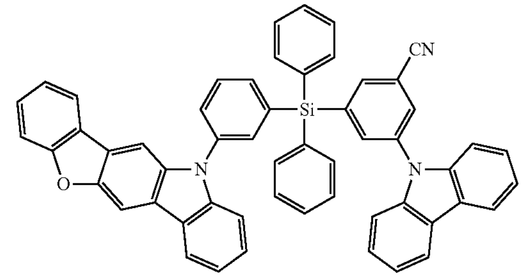
420
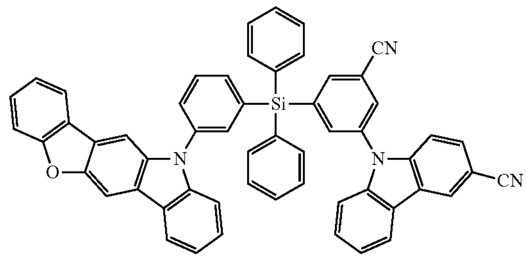
421
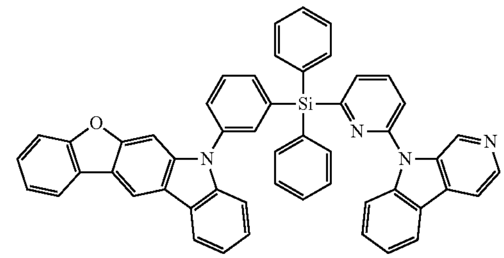

-continued
422
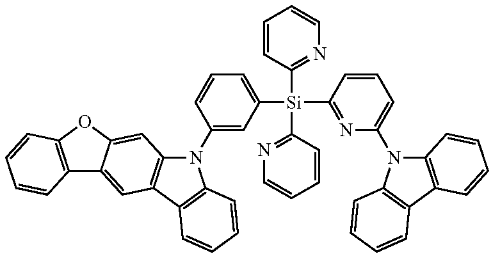
423
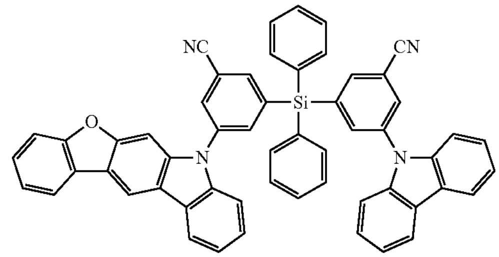
424
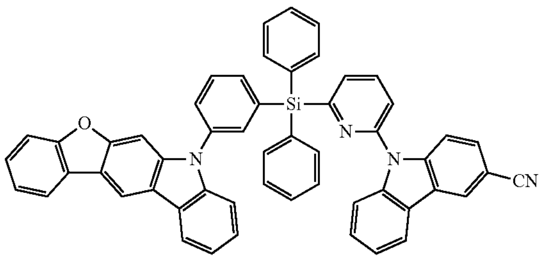
425
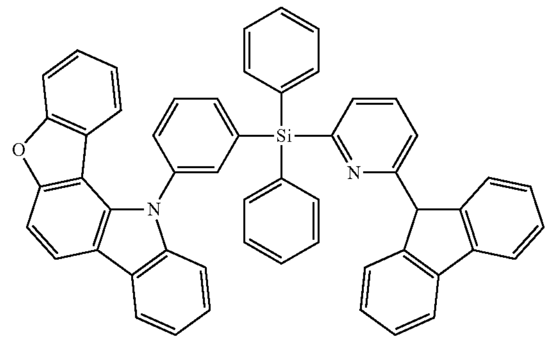
426
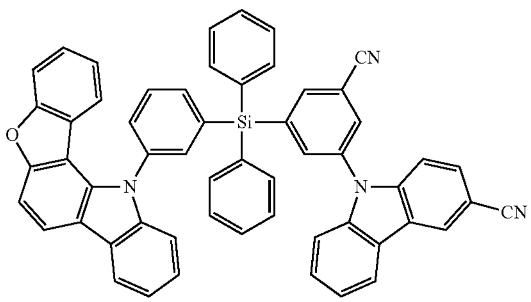
427
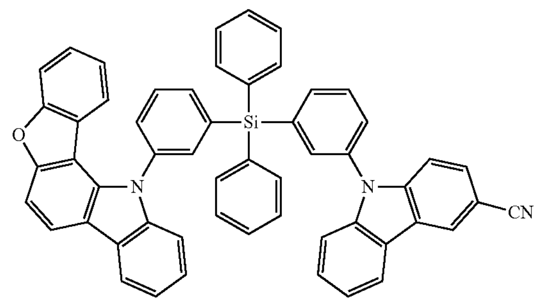
428
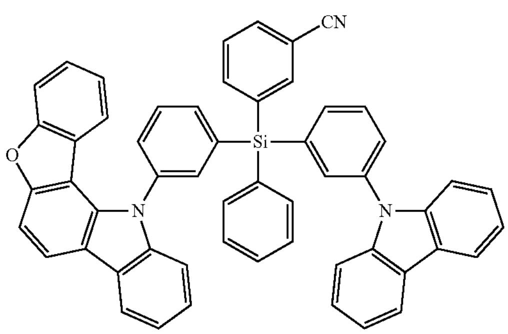
429
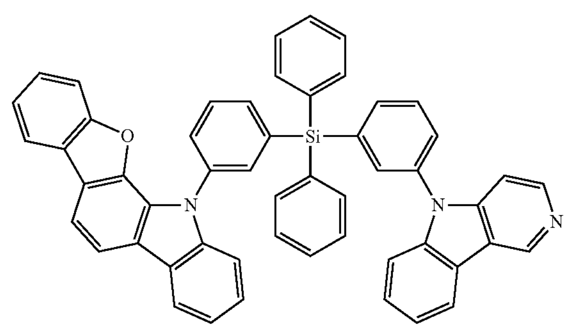
430
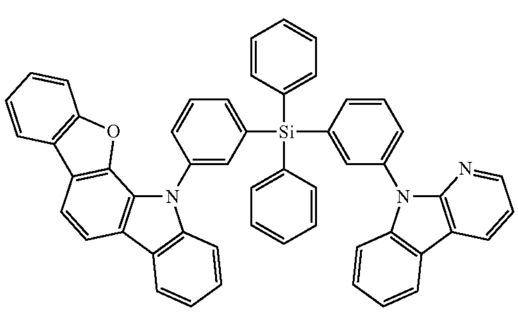
431
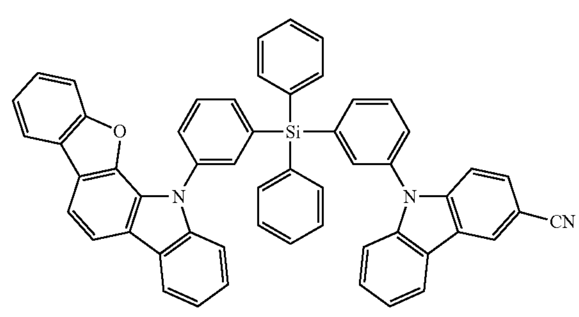

-continued

432

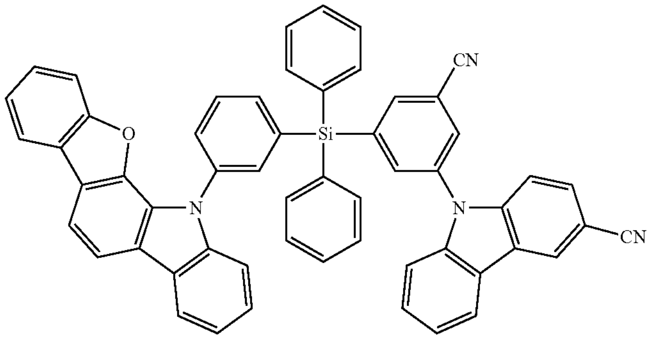

wherein, in Compounds 1 to 432, Ph indicates a phenyl group.

In one or more embodiments, the hole-transporting host may include o-CBP:

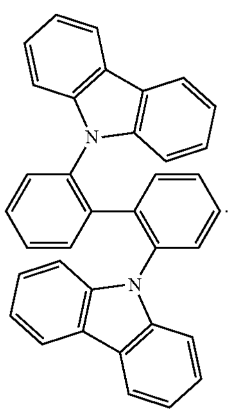 [SMILES: c1ccc(-n2c3ccccc3c3ccccc32)c(-c2ccccc2-n2c3ccccc3c3ccccc32)c1]

When the host is a mixture of an electron-transporting host and a hole-transporting host, a weight ratio of the electron-transporting host and the hole-transporting host may be in a range of 1:9 to 9:1, for example, 2:8 to 8:2, for example, 4:6 to 6:4, and for example, 5:5. When the weight ratio of the electron-transporting host and the hole-transporting host is satisfied with these ranges, the balance between holes and electrons in the emission layer 4 may be made.

In an embodiment, the host may include at least one of TPBi, TBADN, ADN (also referred to as "DNA"), CBP, CDBP, TCP, mCP, Compounds H50 to H52, or any combination thereof:

TPBi

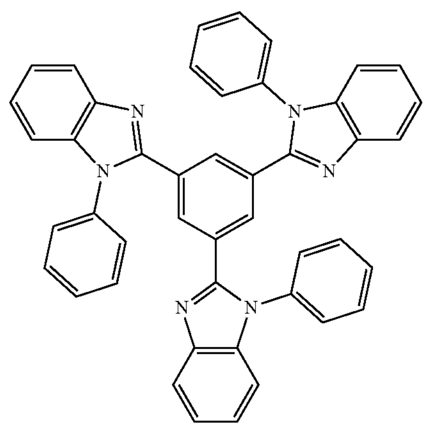

TBADN

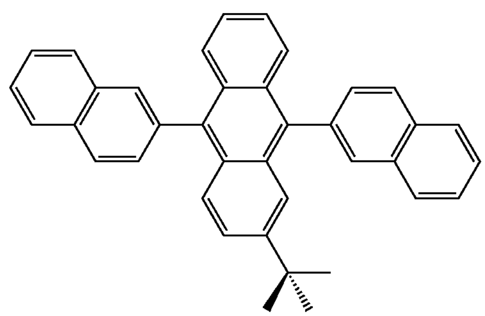

ADN

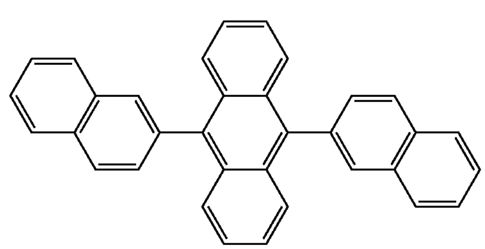

-continued

CBP

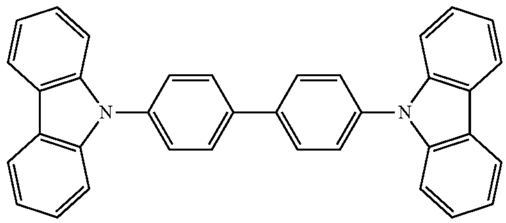

CDBP

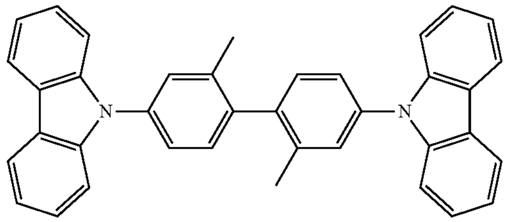

TCP

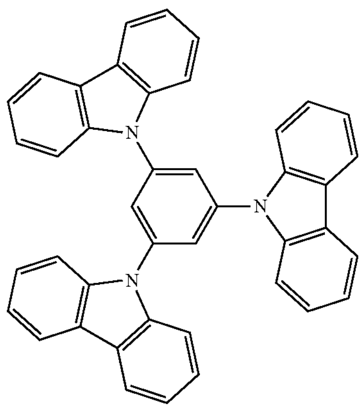

mCP

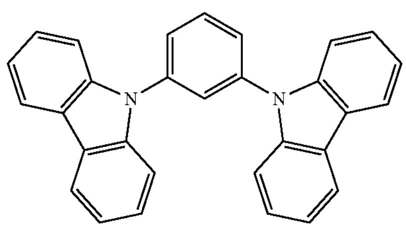

H50

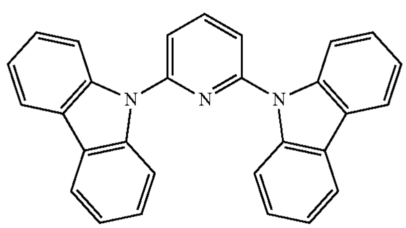

H51

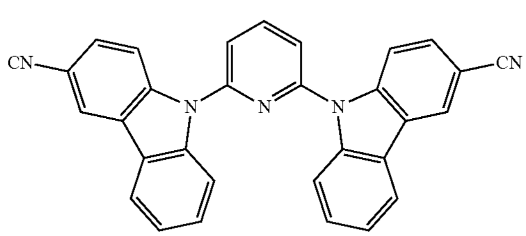

-continued

H52

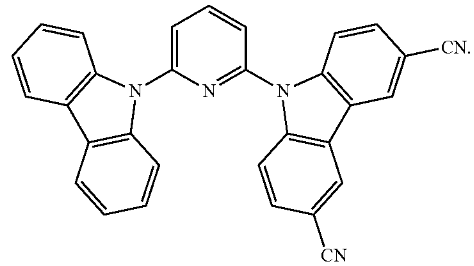

In one or more embodiments, the host may further include a compound represented by Formula 301:

Formula 301

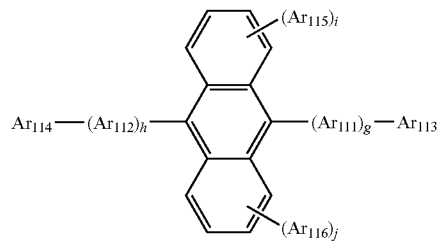

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with at least one of a phenyl group, a naphthyl group, an anthracenyl group, or any combination thereof.

In Formula 301, $Ar_{113}$ to $Ar_{116}$ may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with at least one of a phenyl group, a naphthyl group, an anthracenyl group, or any combination thereof.

In Formula 301, g, h, i, and j may each independently be an integer from 0 to 4, and for example, may be 0, 1, or 2.

In Formula 301, $Ar_{113}$ and $Ar_{116}$ may each independently be:

a $C_1$-$C_{10}$ alkyl group substituted with at least one of a phenyl group, a naphthyl group, an anthracenyl group, or any combination thereof;

a phenyl group, a naphthyl group, an anthracenyl group, a pyrenyl, a phenanthrenyl group, or a fluorenyl group;

a phenyl group, a naphthyl group, an anthracenyl group, a pyrenyl group, a phenanthrenyl group, or a fluorenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or any combination thereof; or

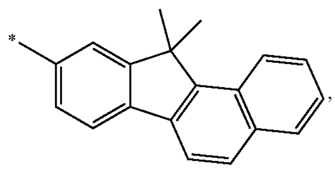 [SMILES: Cc1ccc2c(c1)C(C)(C)c1c-2ccc2ccccc12]

but embodiments of the present disclosure are not limited thereto.

In one or more embodiments, the host may include a compound represented by Formula 302:

Formula 302

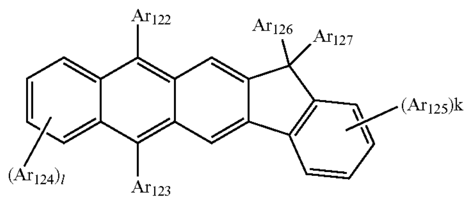

wherein, in Formula 302, $Ar_{122}$ to $Ar_{125}$ may each be the same as described in connection with $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may each independently be 0, 1, or 2.

When the organic light-emitting device 10 is a full-color organic light-emitting device, the emission layer may be patterned into a red emission layer, a green emission layer, and a blue emission layer. In an embodiment, based on a stacked structure including a red emission layer, a green emission layer, and/or a blue emission layer, the emission layer may emit white light, and various modifications are possible.

When the emission layer includes both a host and a dopant, an amount of the dopant may be in a range of about 0.01 parts by weight to about 15 parts by weight based on 100 parts by weight of the host, but embodiments of the present disclosure are not limited thereto.

The dopant may include the condensed cyclic compound represented by Formula 1-1 or 1-2.

In an embodiment, the dopant may be 1,4-bis[2-(3-N-ethylcarbazolyl)-vinyl]benzene (BCzVB), 4-(di-p-tolylamino)-4'-[(di-p-tolylamino) styryl]stilbene (DPAVB), N-(4-((E)-2-(6-((E)-4-(diphenylamino)styryl)naphthalene-2-yl)vinyl)phenyl)-N-phenylbenzeneamine (N-BDAVBi), 2,5,8,11-tetra-t-butylperylene (TBP), or any combination thereof.

In an embodiment, the sensitizer may include a phosphorescent sensitizer including at least one metal a first-row transition metal of the Periodic Table of Elements, a second-row transition metal of the Periodic Table of Elements, third-row transition metal of the Periodic Table of Elements, or any combination thereof.

In an embodiment, the sensitizer may include an organic ligand ($L_{11}$) and a metal ($M_{11}$) of at least one of a first-row transition metal of the Periodic Table of Elements, a second-row transition metal of the Periodic Table of Elements, a third-row transition metal of the Periodic Table of Elements, or any combination thereof wherein $L_{11}$ and $M_{11}$ may form one cyclometallated ring or two, three, or four cyclometallated rings.

In an embodiment, the sensitizer may include an organometallic compound represented by Formula 101:

$$M_{11}(L_{11})_{n11}(L_{12})_{n12} \quad \text{Formula 101}$$

wherein, in Formula 101, $M_{11}$ may be a first-row transition metal of the Periodic Table of Elements, a second-row transition metal of the Periodic Table of Elements, or a third-row transition metal of the Periodic Table of Elements, $L_{11}$ may be a ligand represented by one of Formulae 13-1 to 13-4, $L_{12}$ may be a monodentate ligand or a bidentate ligand, n11 may be 1, n12 may be 0, 1, or 2, 13-1

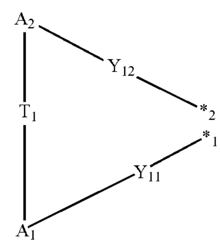

13-2

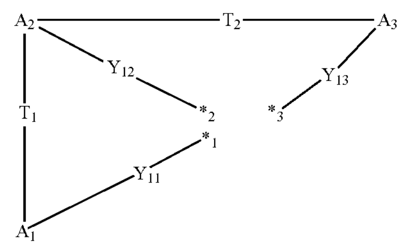

13-3

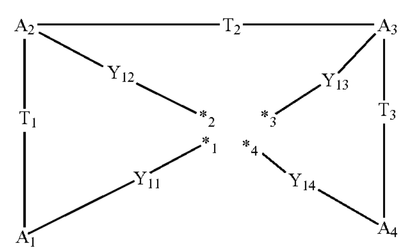

13-4

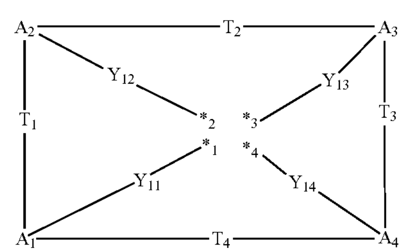

wherein, in Formulae 13-1 to 13-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—N($R_{93}$)—*', *—B($R_{93}$)—*', *—P($R_{93}$)—*', *—C($R_{93}$)($R_{94}$)—*', *—Si($R_{93}$)($R_{94}$)—*', *—Ge($R_{93}$)($R_{94}$)—*', *—S—*', *—Se—*', *—O—*', *—C(═O)—*', *—S(═O)—*', *—S(═O)$_2$—*', *—C($R_{93}$)═*', *═C($R_{93}$)—*', *—C($R_{93}$)═C($R_{94}$)—*', *—C(═S)—*', or *—C≡C—*', a substituent of the substituted $C_5$-$C_{30}$ carbocyclic group, a substituent of substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent aromatic condensed polycyclic group, a substituted or unsubstituted monovalent aromatic heteropolycyclic group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —C($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$ ($Q_1$), —P(═O)($Q_1$)($Q_2$), or —P(═S)($Q_1$)($Q_2$), wherein each of a substituent of the substituted $C_5$-$C_{30}$ carbocyclic group and a substituent of substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_1$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent aromatic condensed polycyclic group, a monovalent aromatic heteropolycyclic group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with deuterium, —F, a cyano group, a $C_1$-$C_{60}$ alkyl group, a $C_6$-$C_{60}$ aryl group, or any combination thereof.

In one or more embodiments, the sensitizer may be of Groups I to IX, but embodiments of the present disclosure are not limited thereto:

Group I

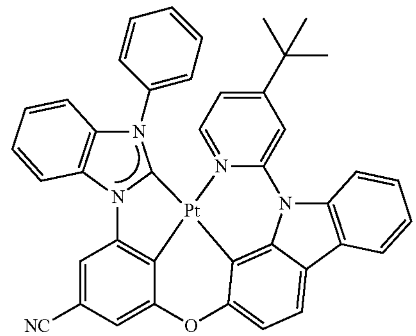

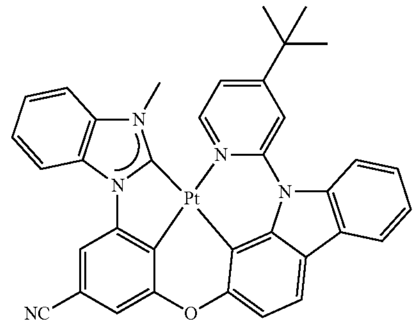

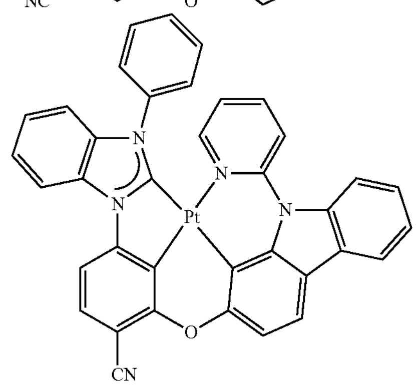

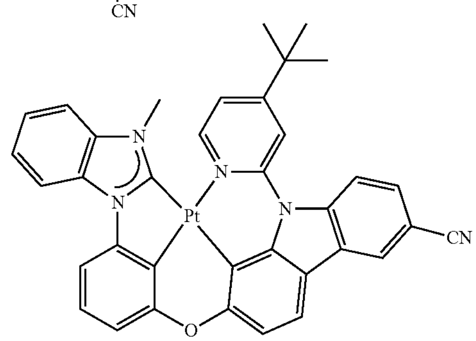

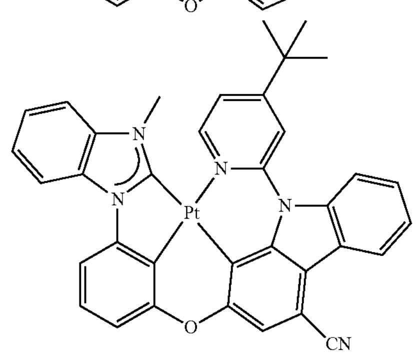

-continued
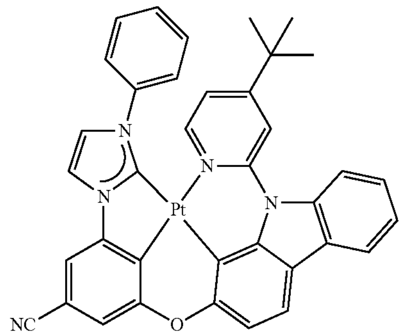
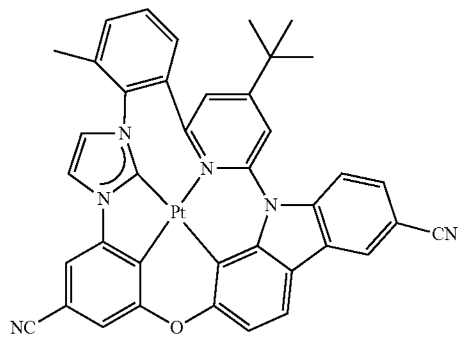
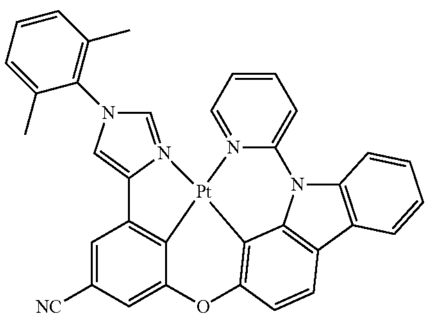
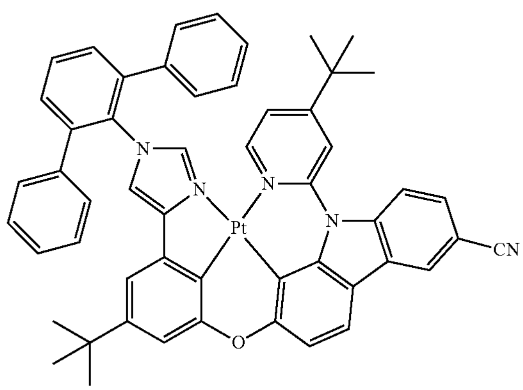
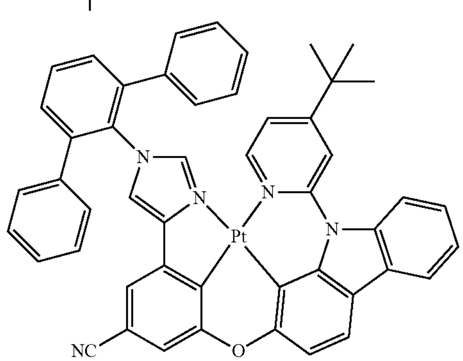
-continued
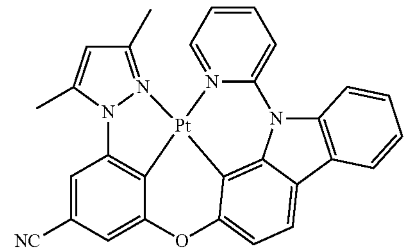
Group II
1
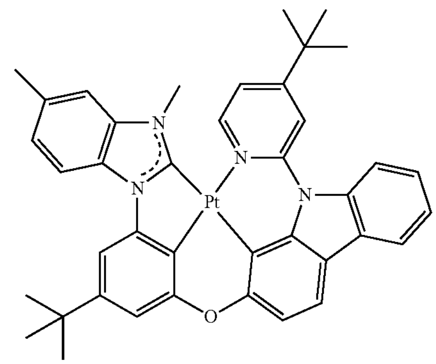
2
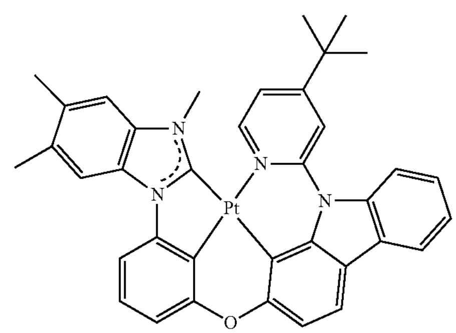
3
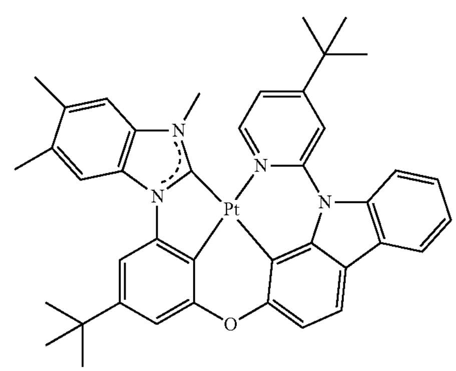

4
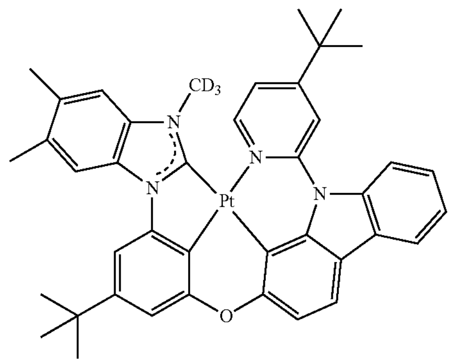
5
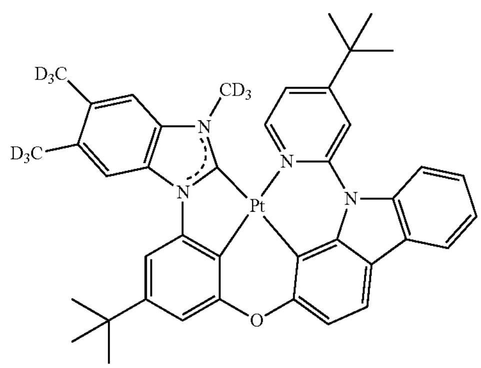
6
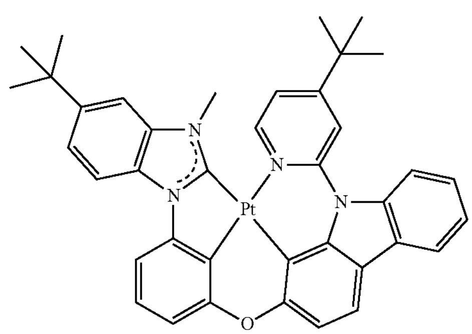
7
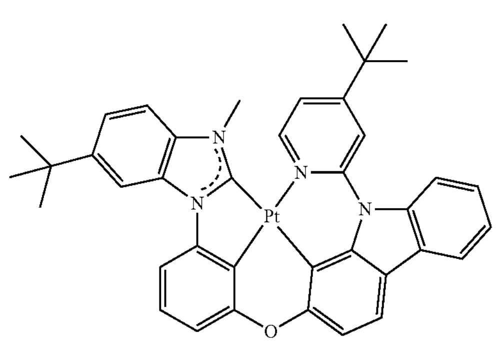
8
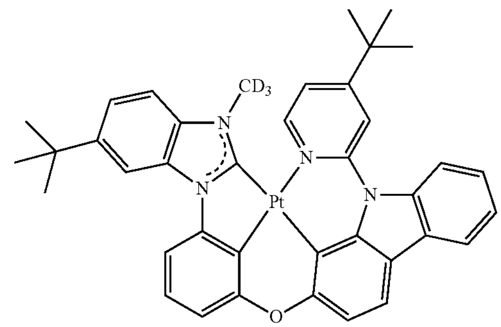
9
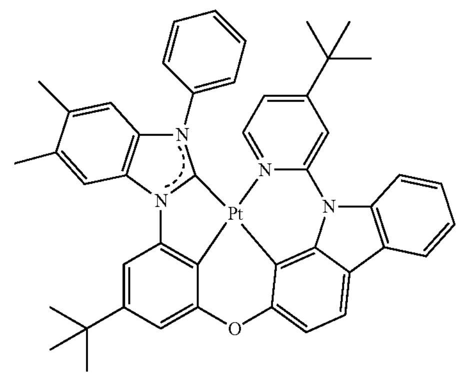
10
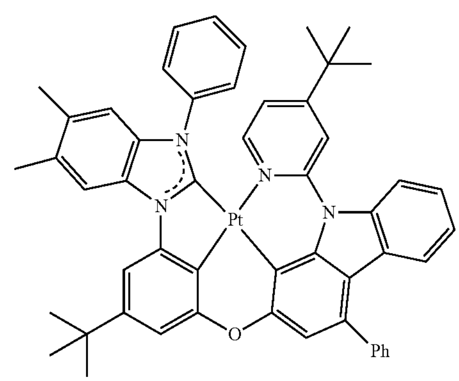
11
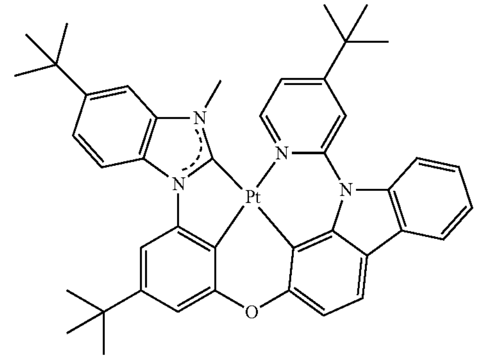

-continued
12
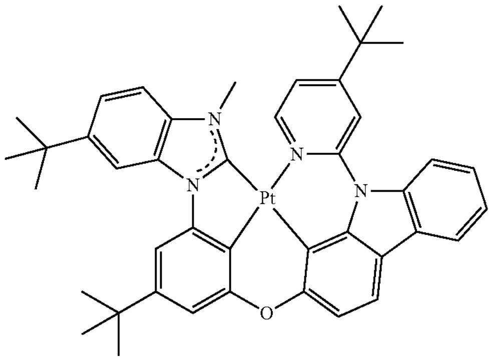
13
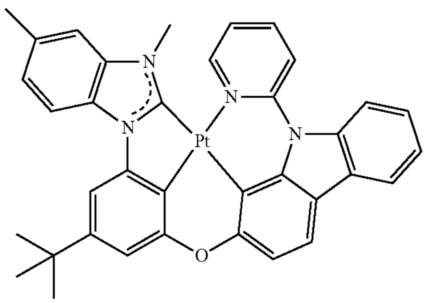
14
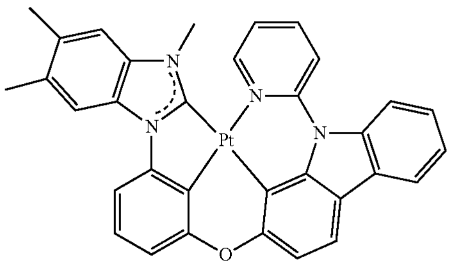
15
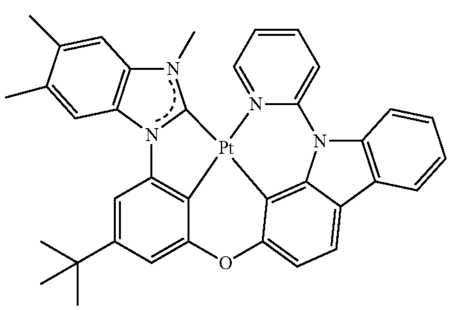
16
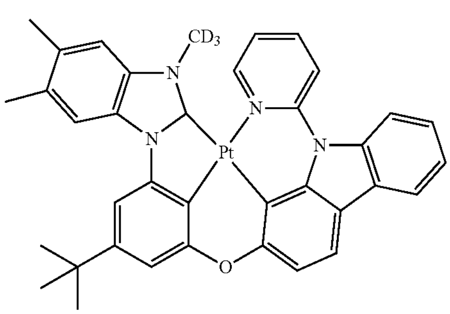
-continued
17
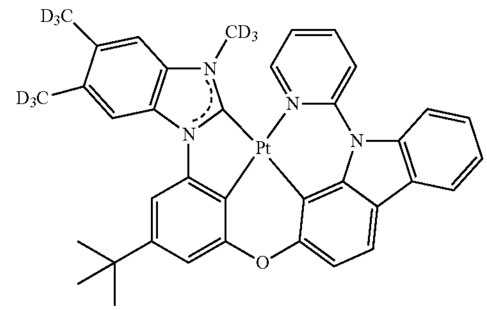
18
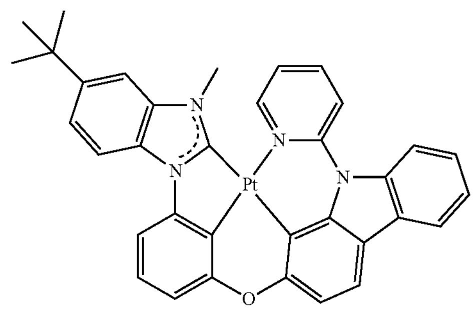
19
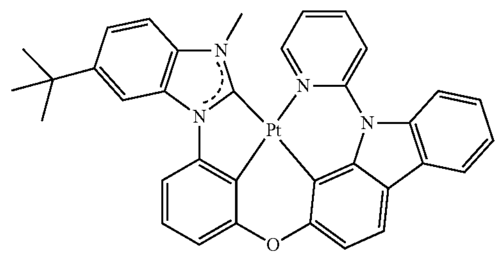
20
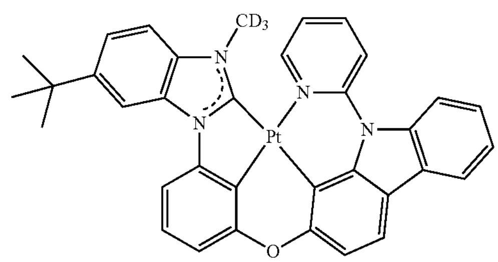
21
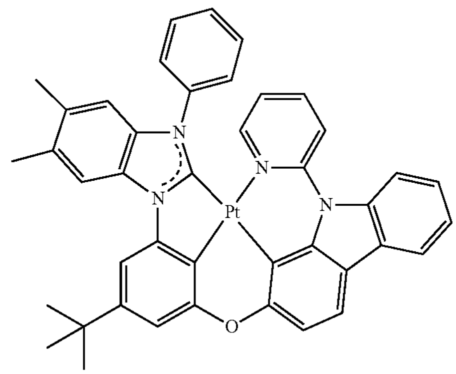

-continued
22
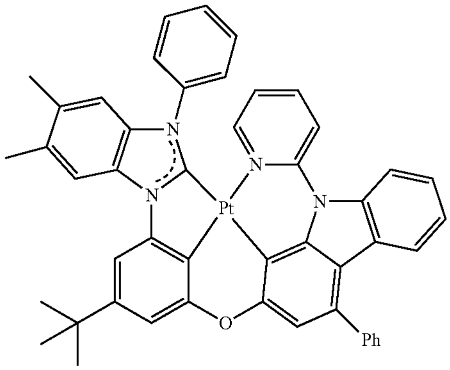
23
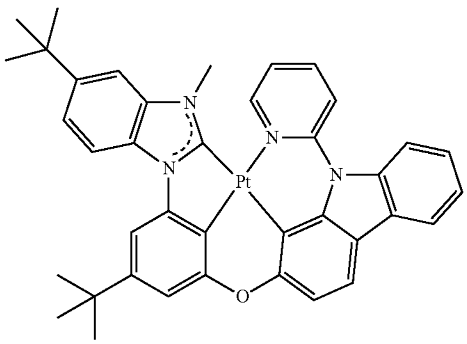
24
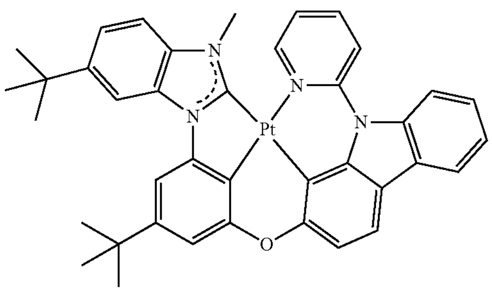
25
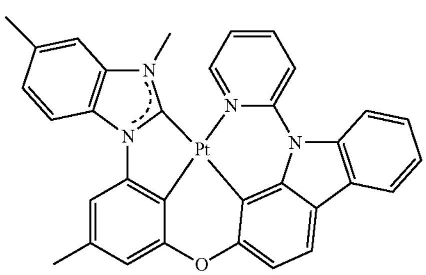
26
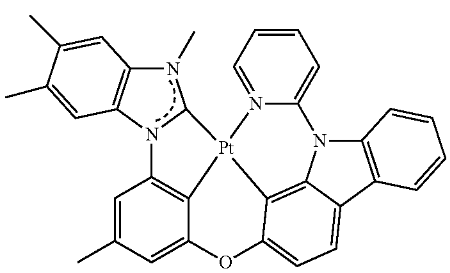
-continued
27
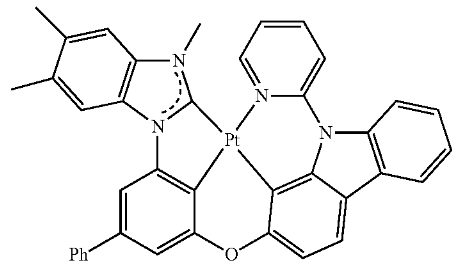
28
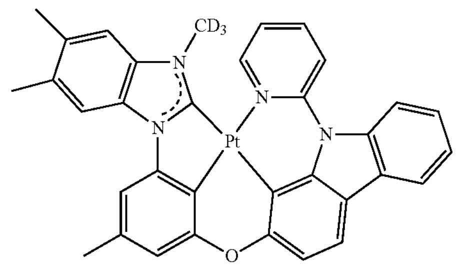
29
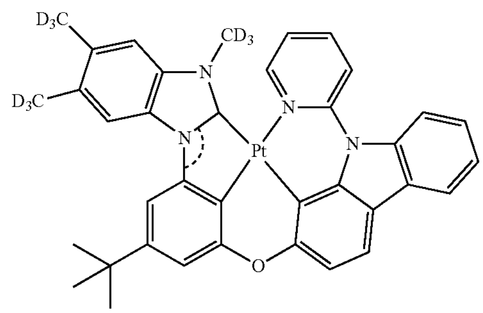
30
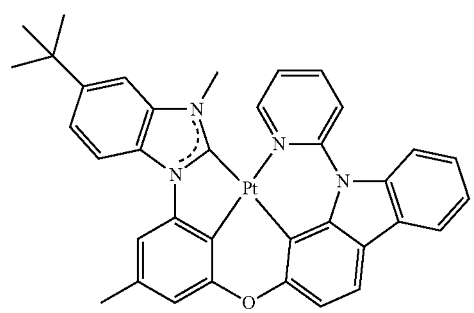
31
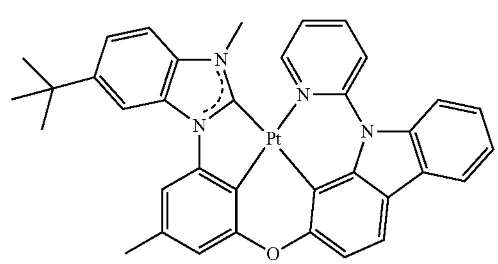

-continued
32
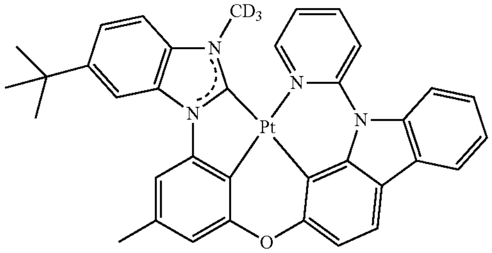
33
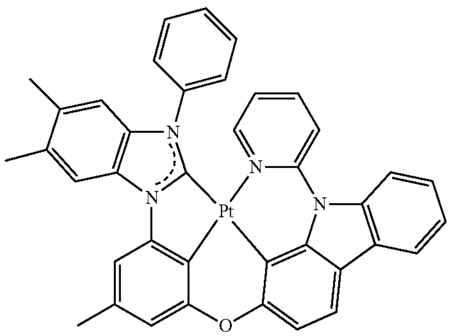
34
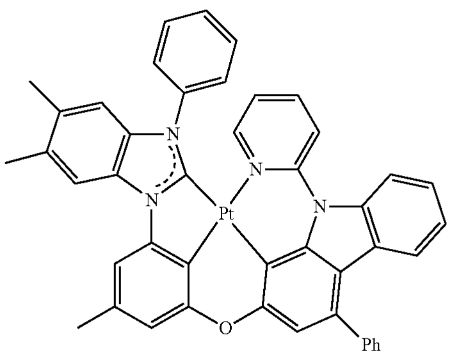
35
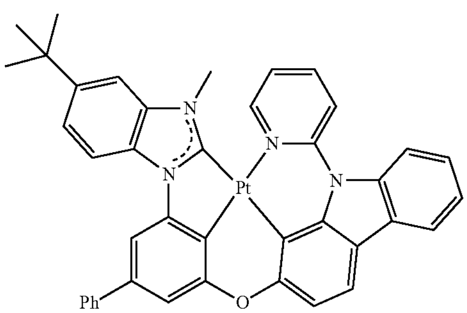
36
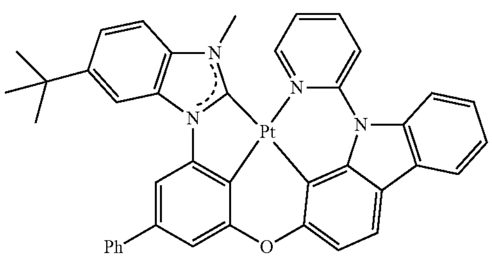
-continued
37
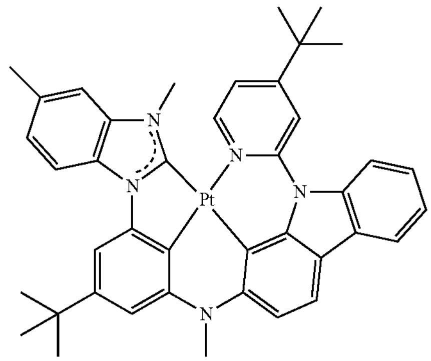
38
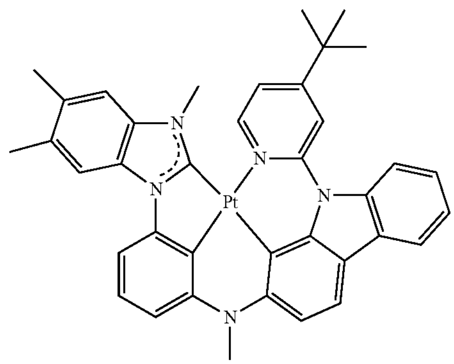
39
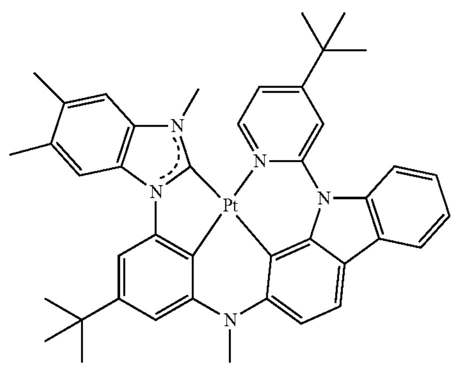
40
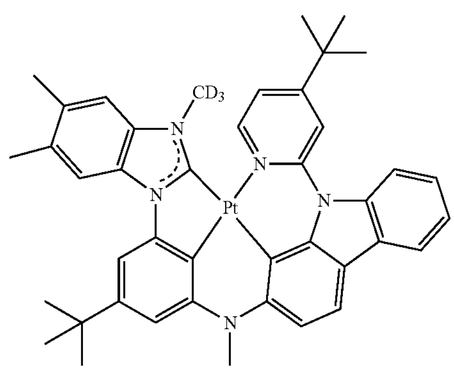

41
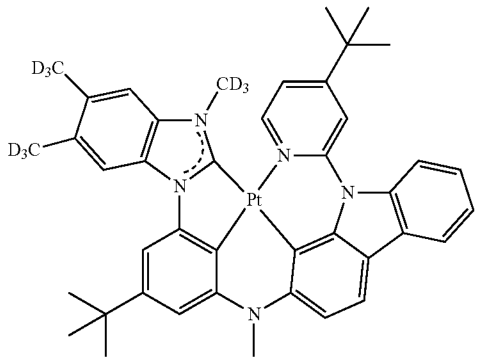
42
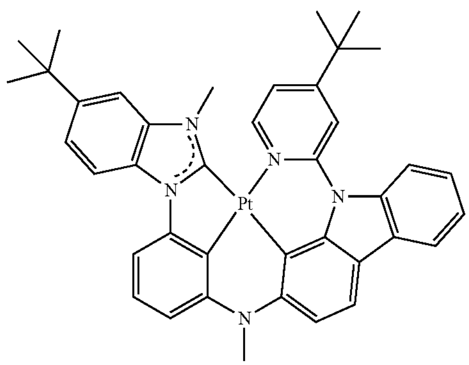
43
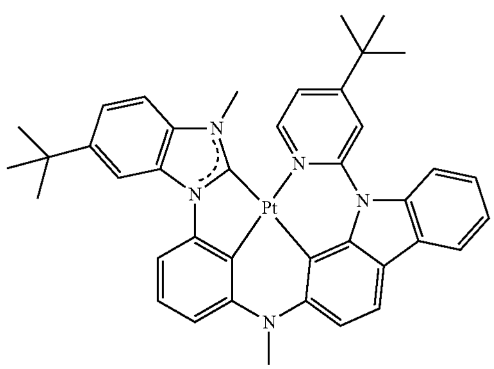
44
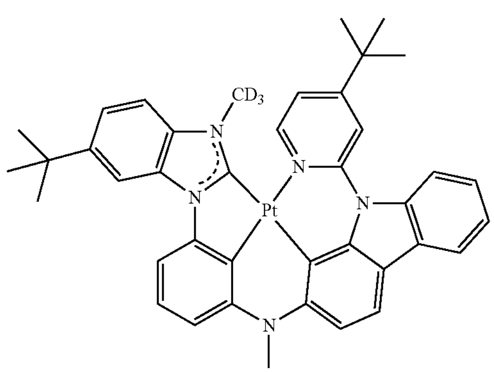
45
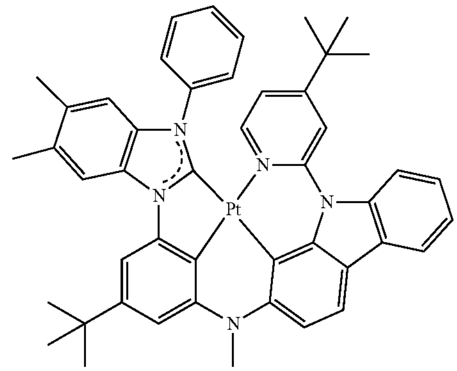
46
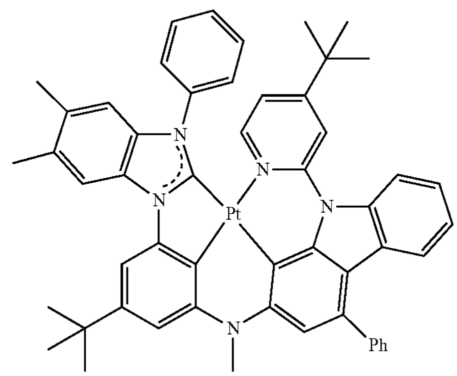
47
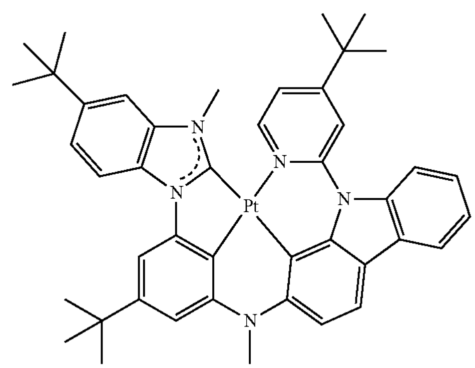
48
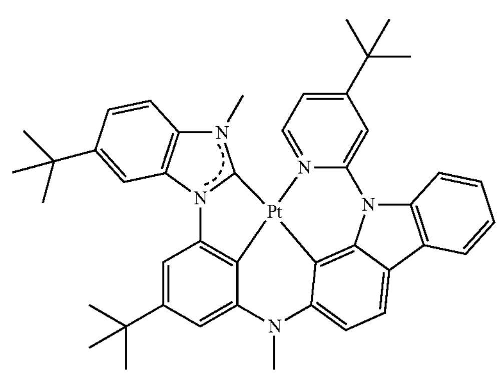

-continued
49
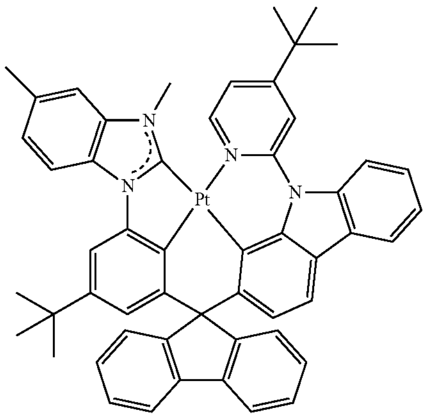
50
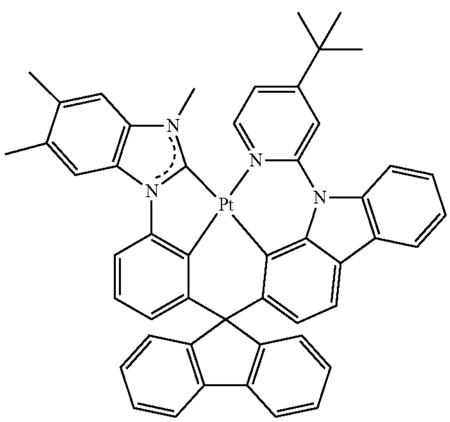
51
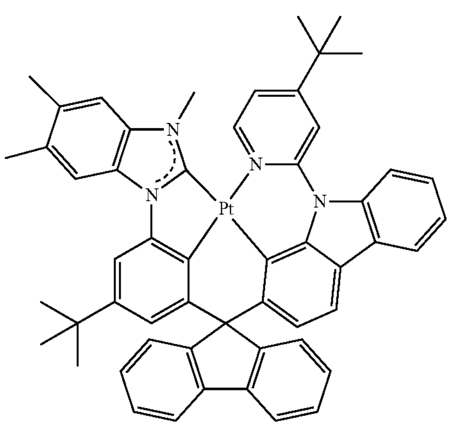
-continued
52
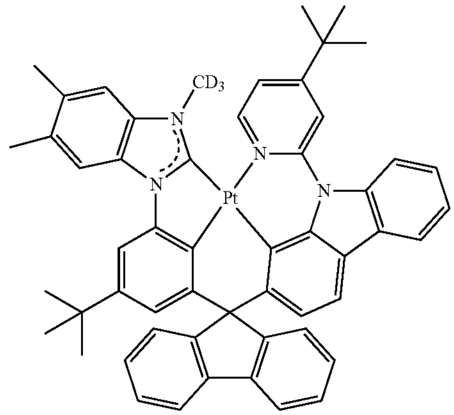
53
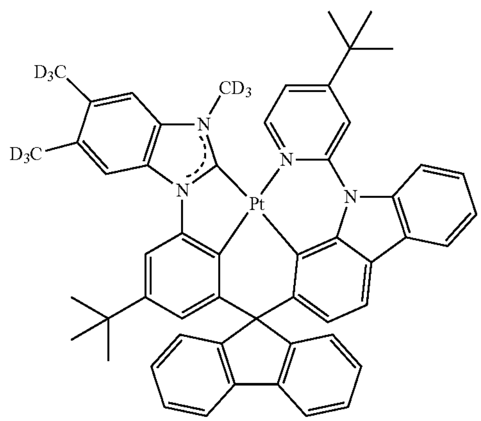
54
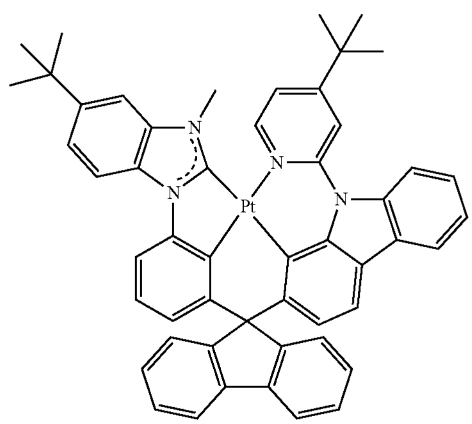

-continued
55
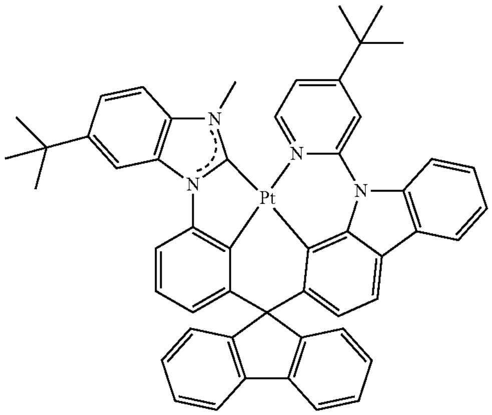
56
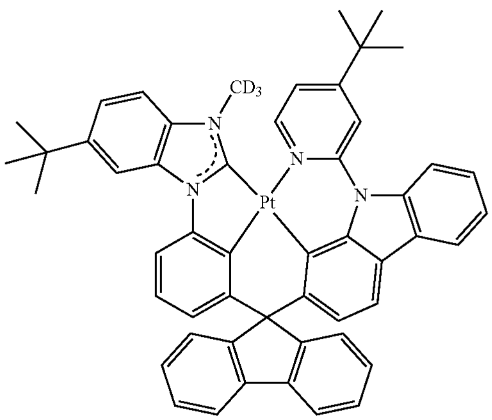
57
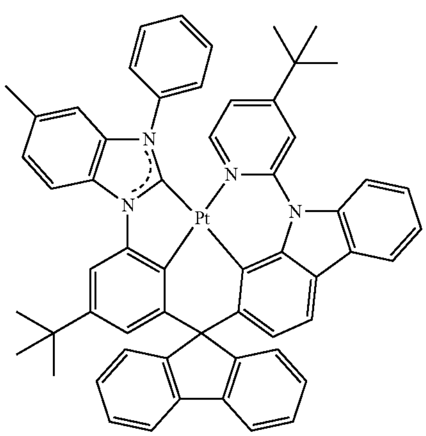
-continued
58
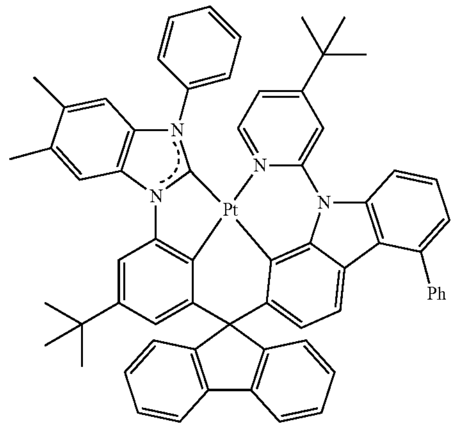
59
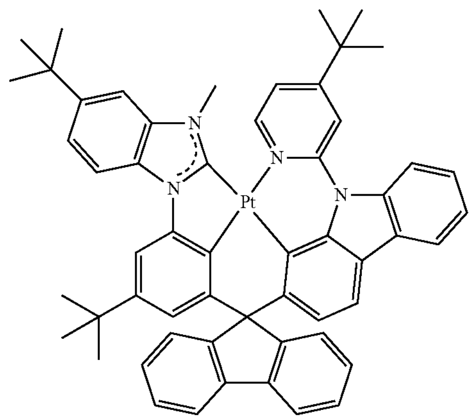
60
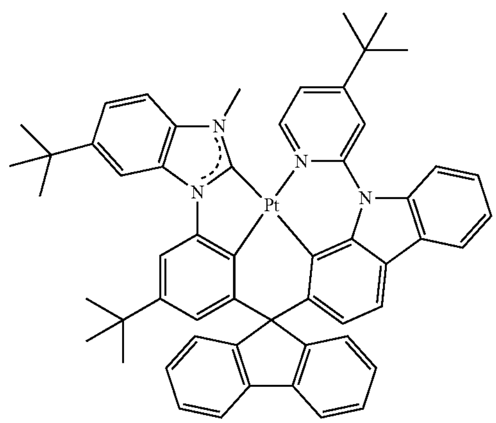
61
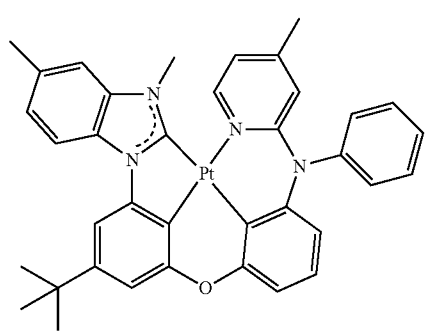

-continued
62
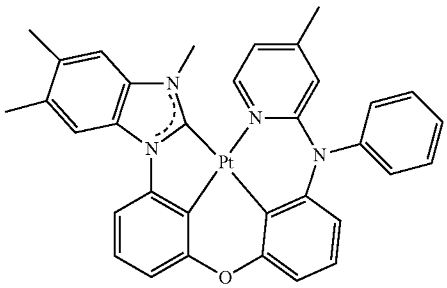
63
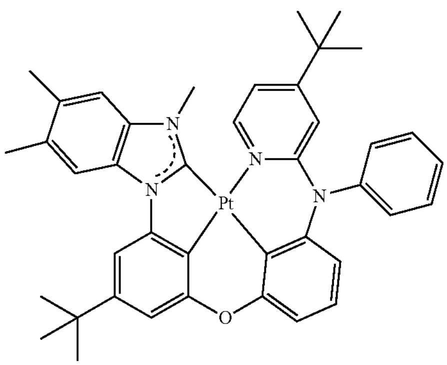
64
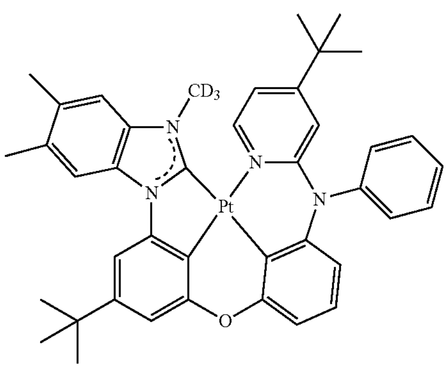
65
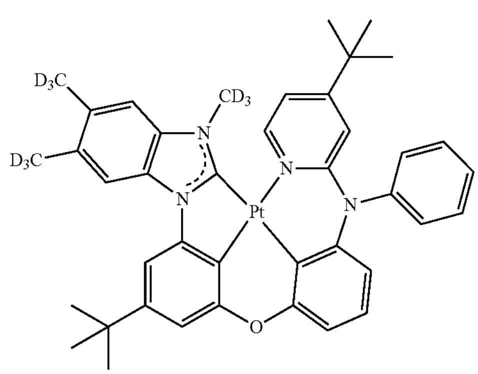
-continued
66
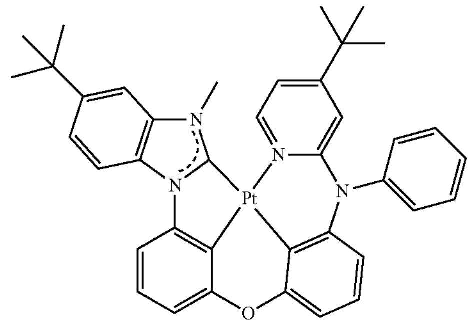
67
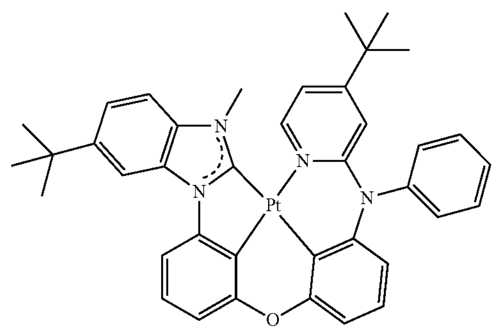
68
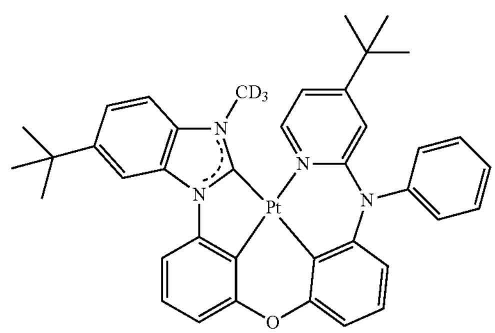
69
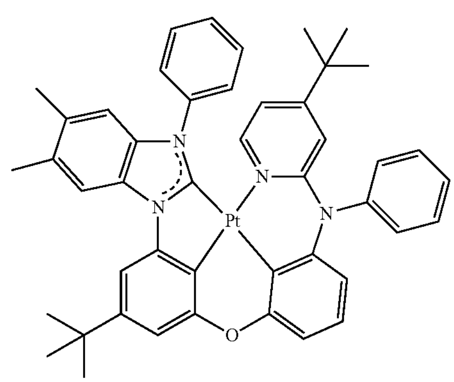

-continued
70
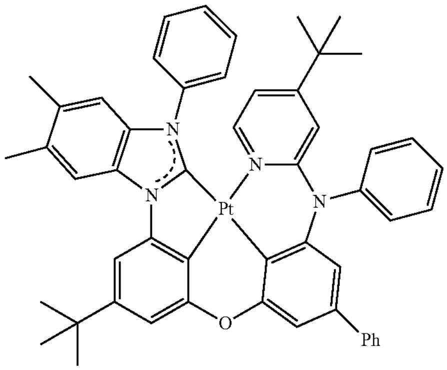
71
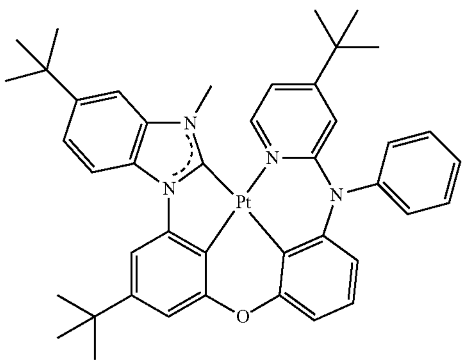
72
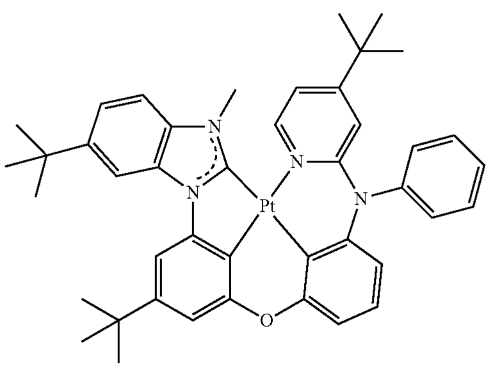
73
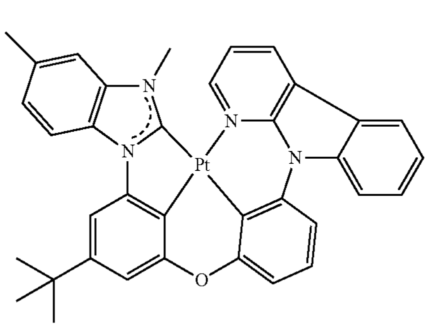
-continued
74
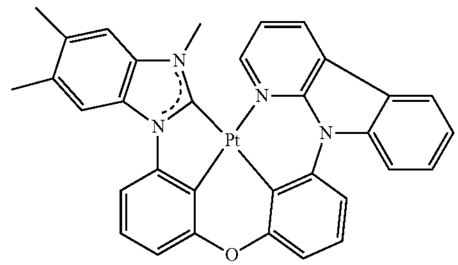
75
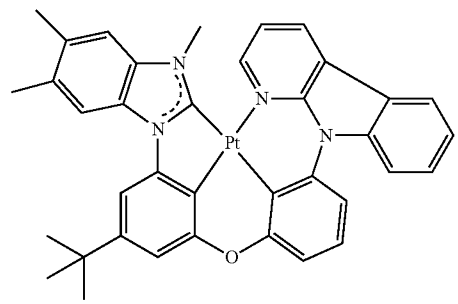
76
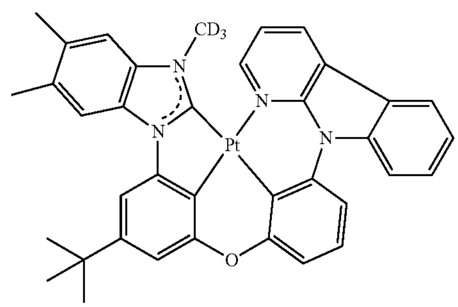
77
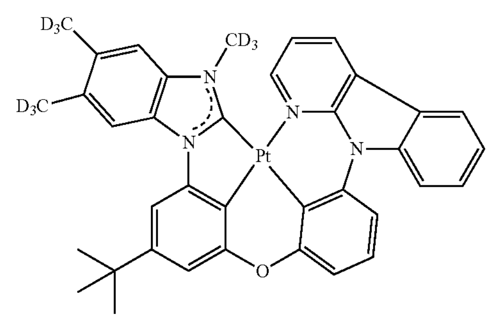
78
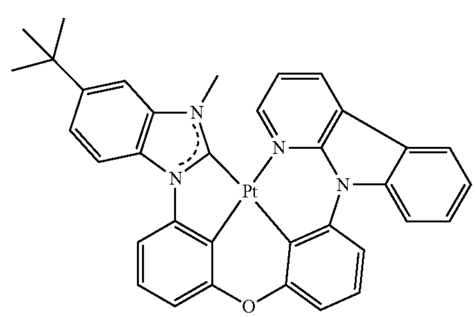

-continued
79
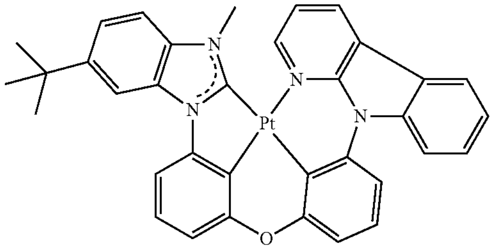
89
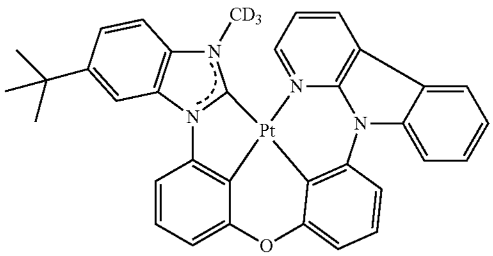
81
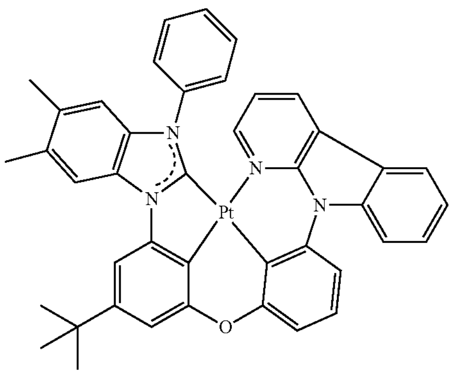
82
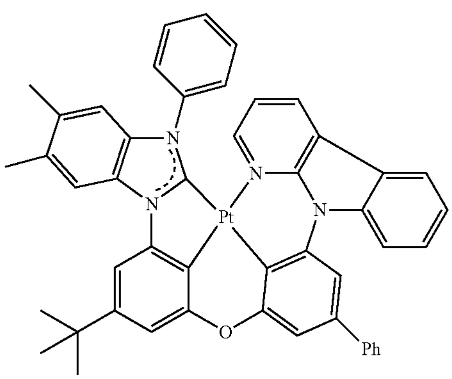
83
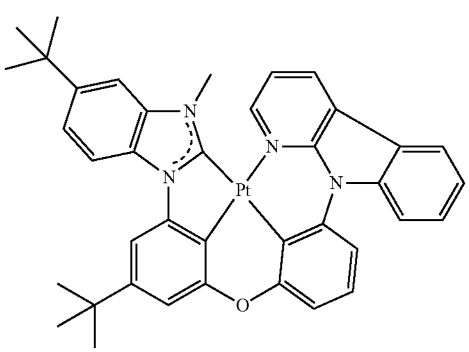
-continued
84
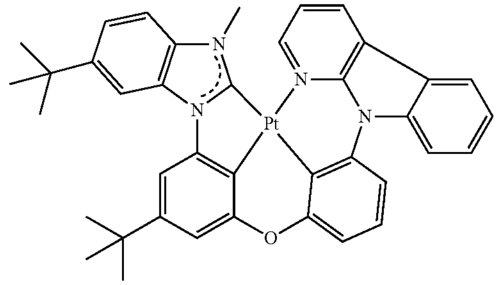
85
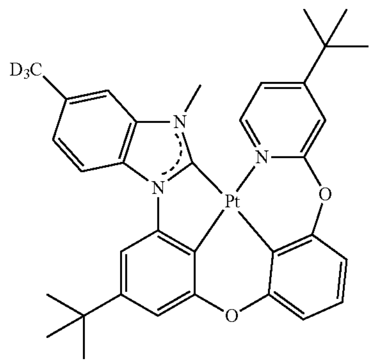
86
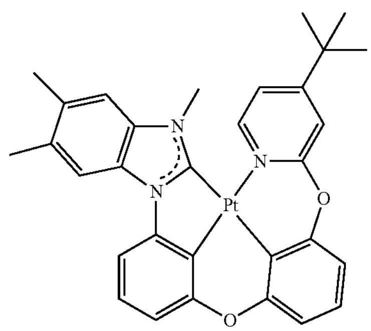
87
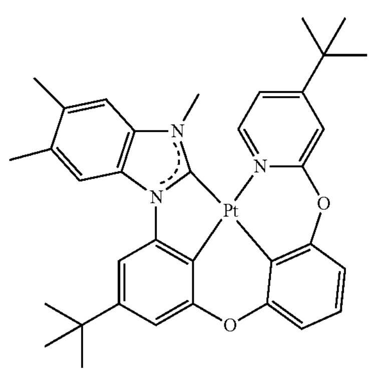

-continued
88
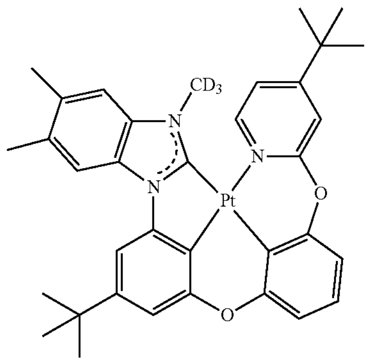
89
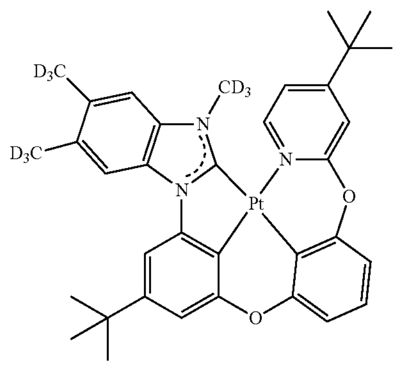
90
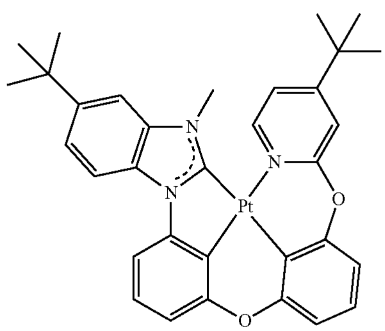
91
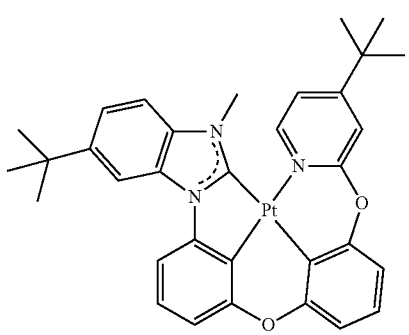
-continued
92
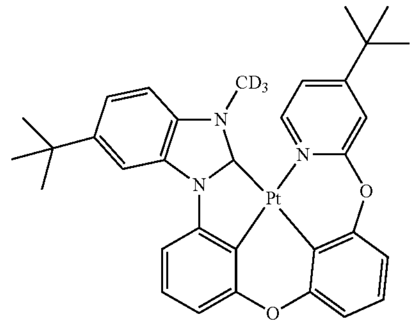
93
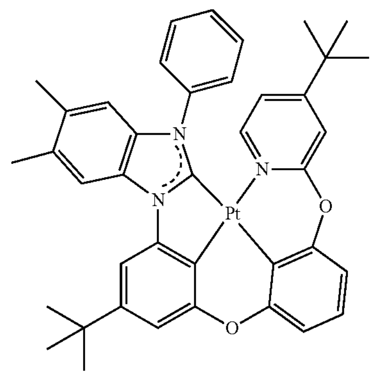
94
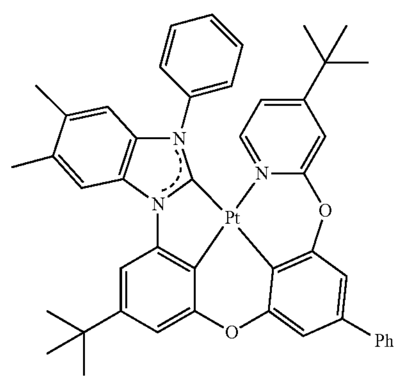
95
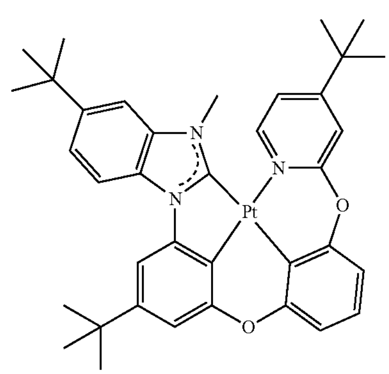

-continued
96
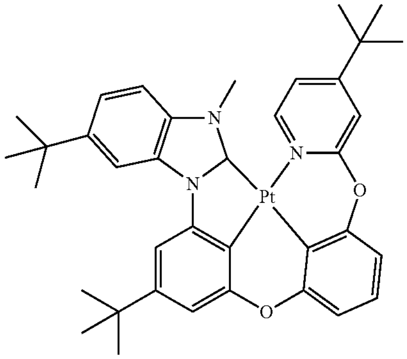
97
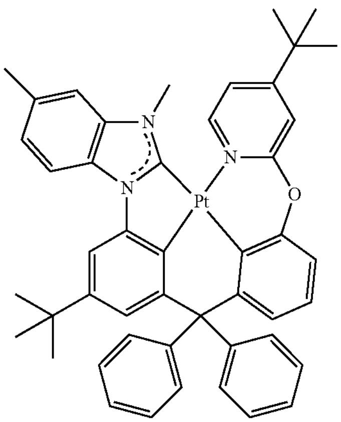
98
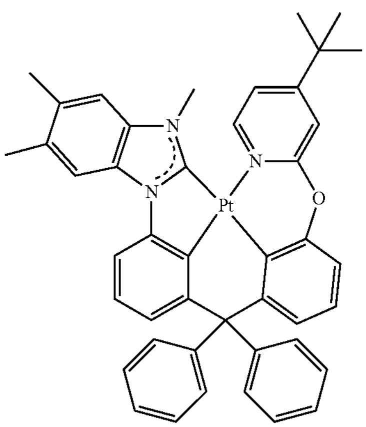
99
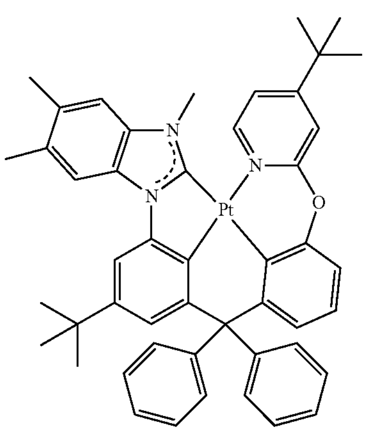
-continued
100
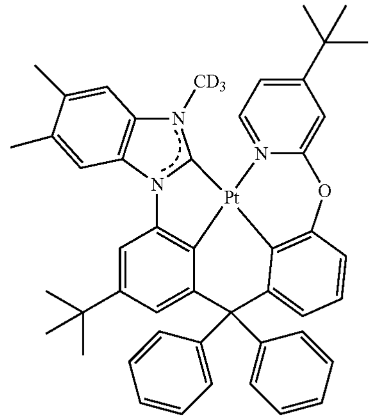
101
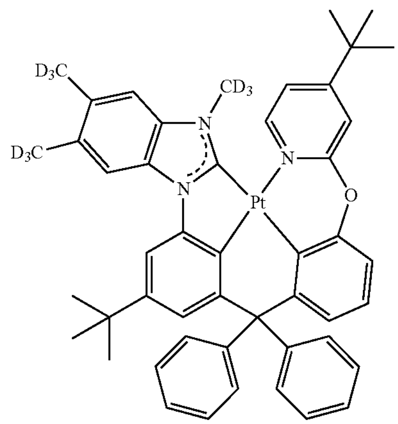
102
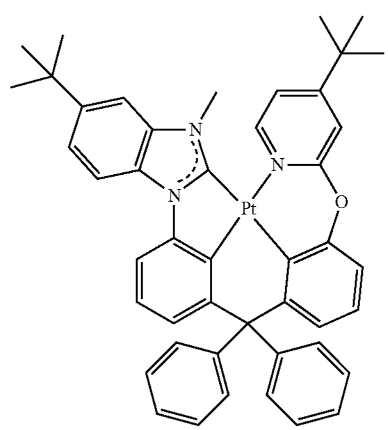

-continued
103
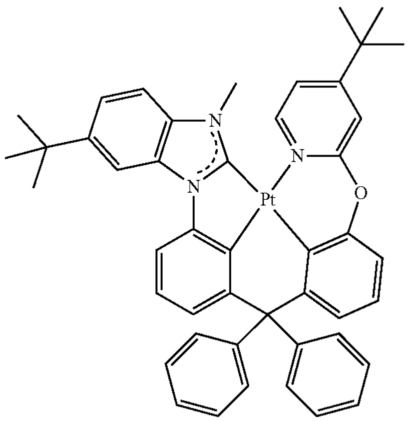
104
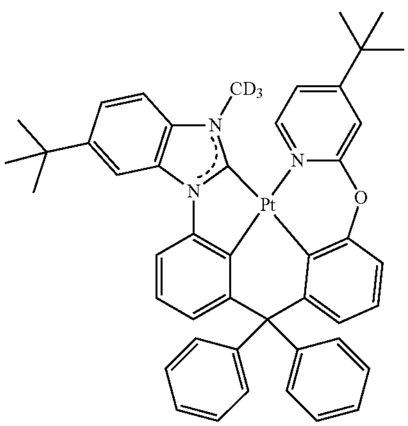
105
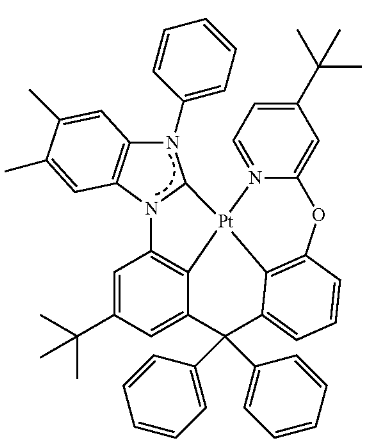
-continued
106
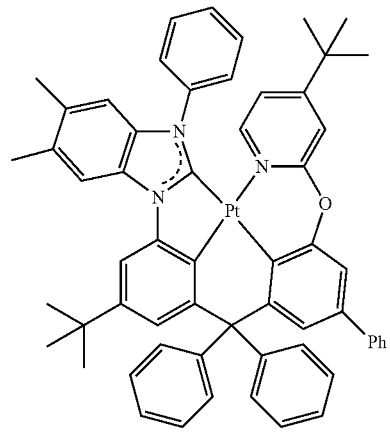
107
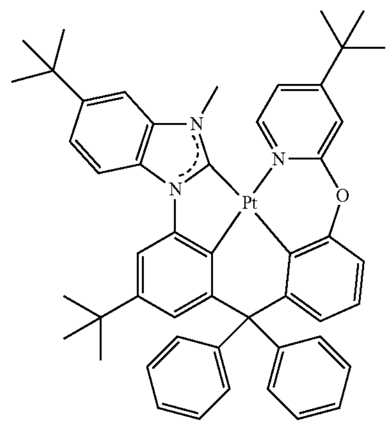
108
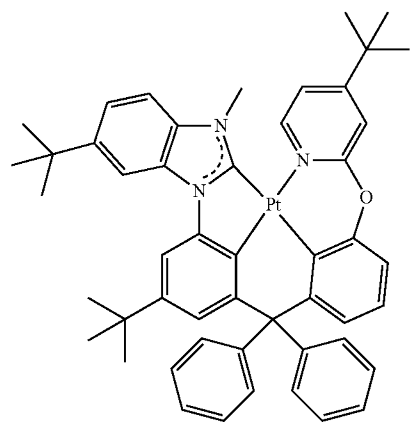
109
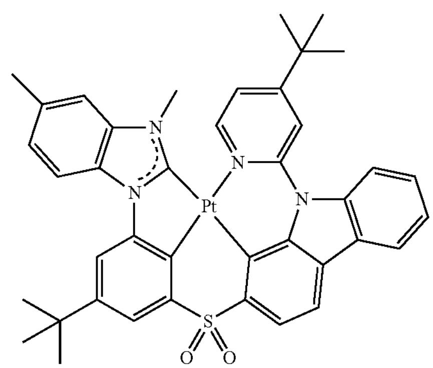

-continued
110
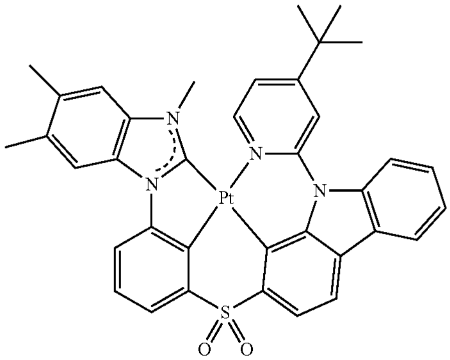
111
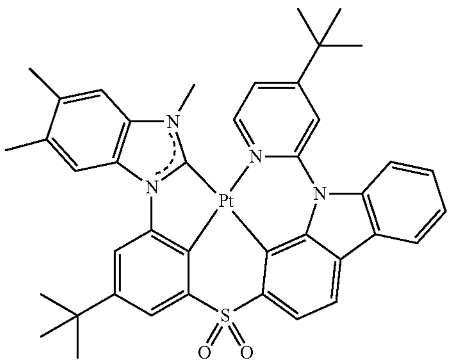
112
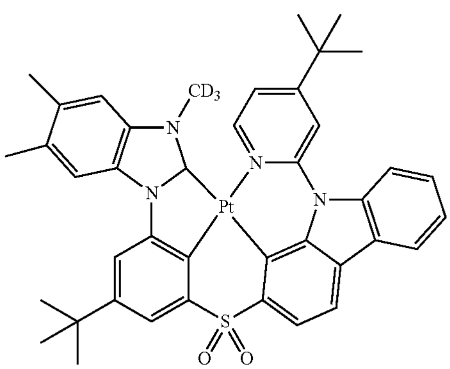
113
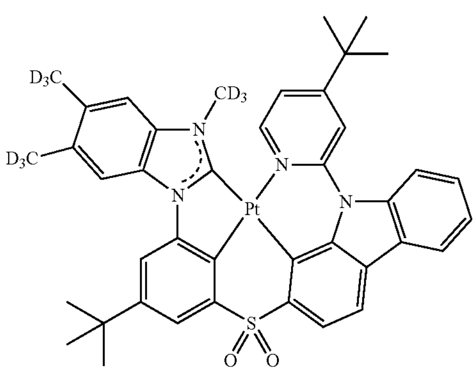
-continued
114
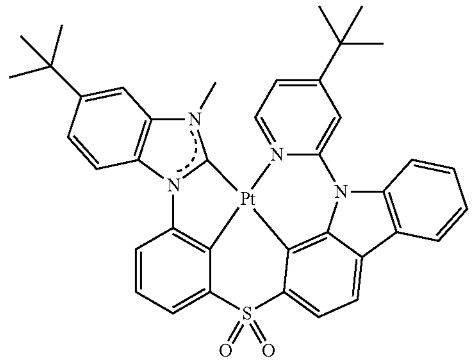
115
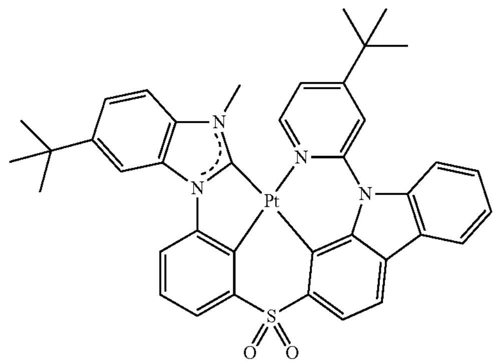
116
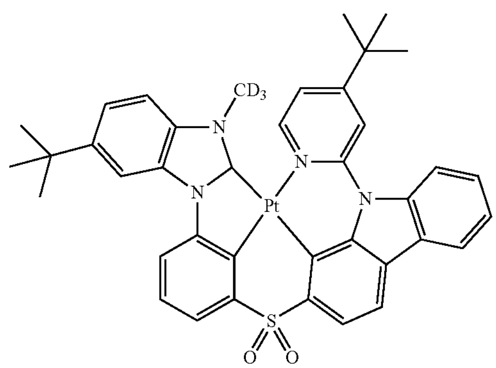
117
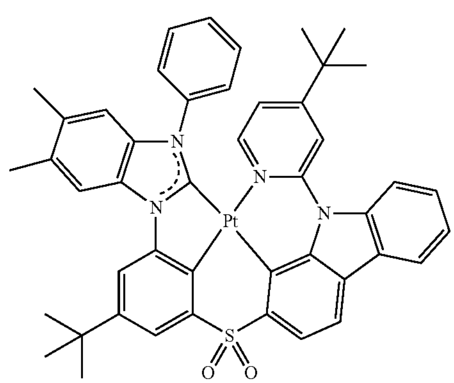

118
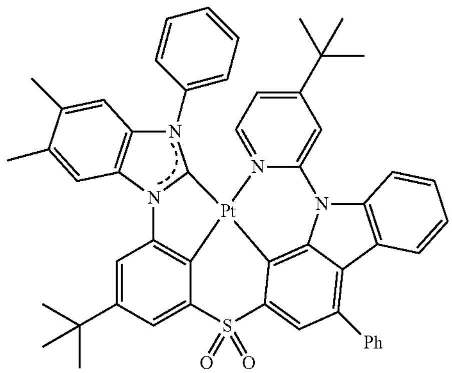
119
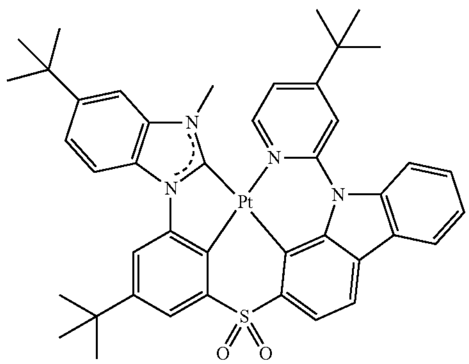
120
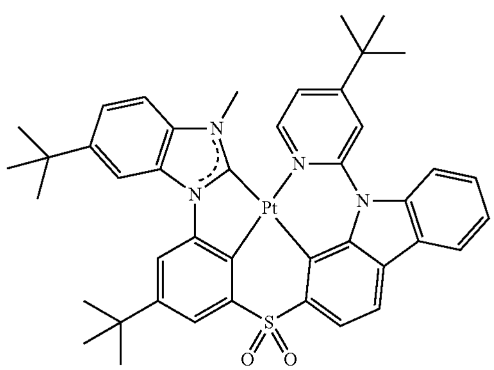
Group III
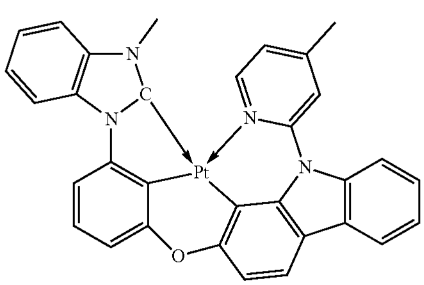
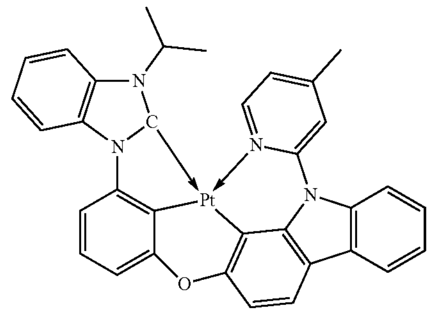
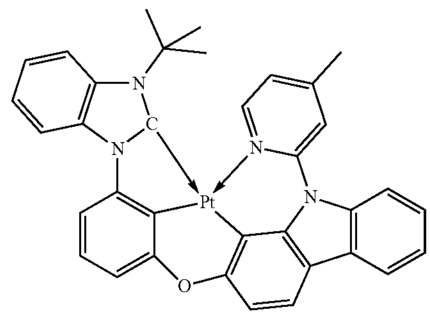
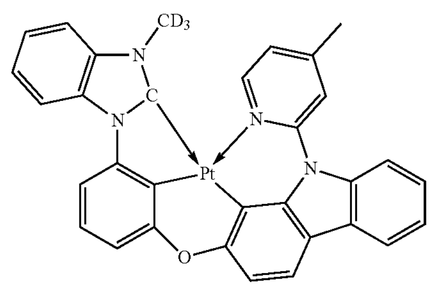
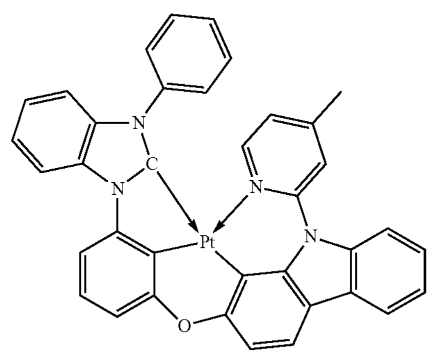
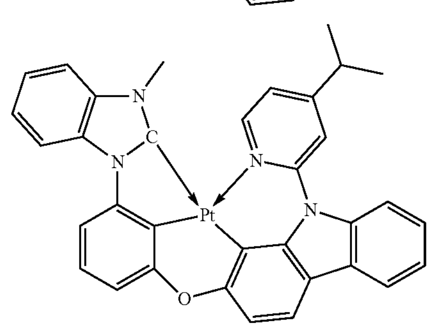

-continued
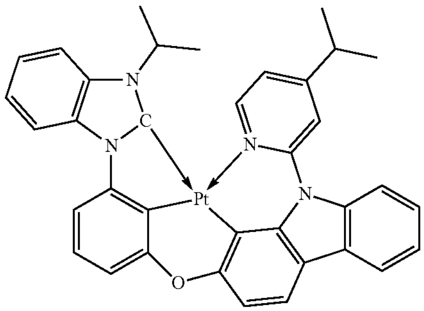
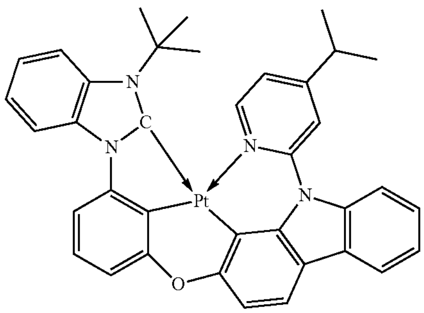
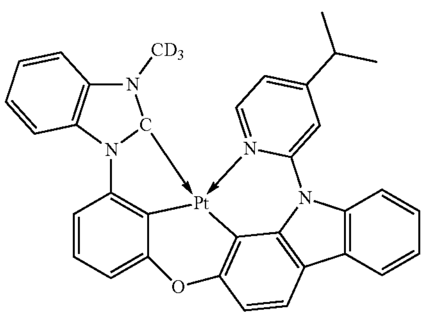
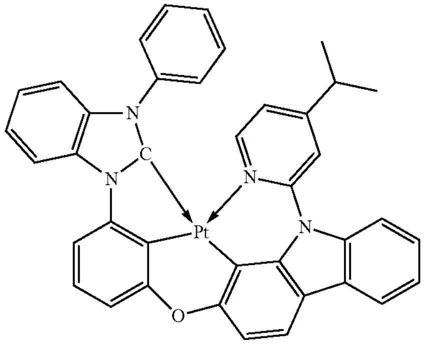
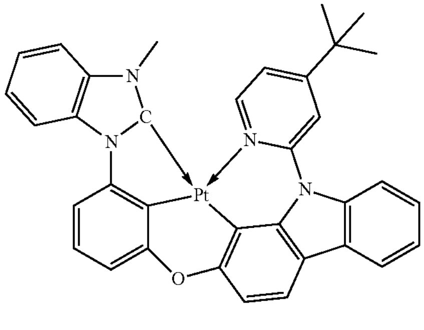
-continued
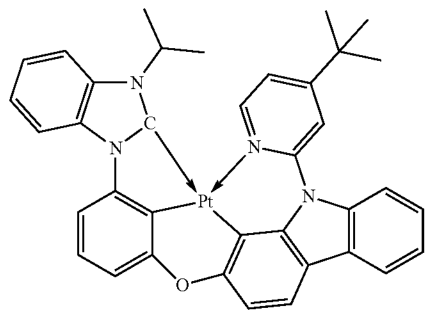
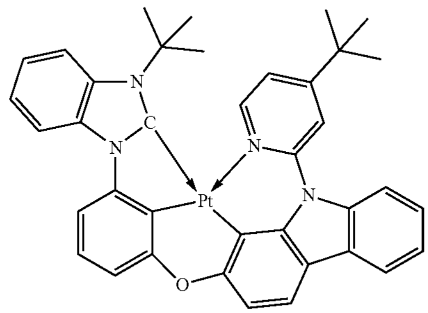
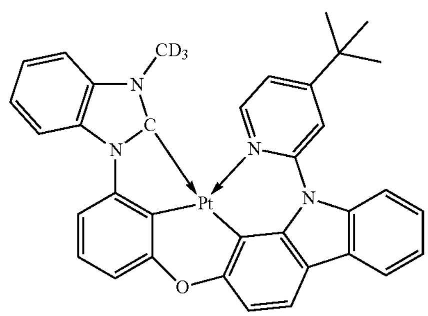
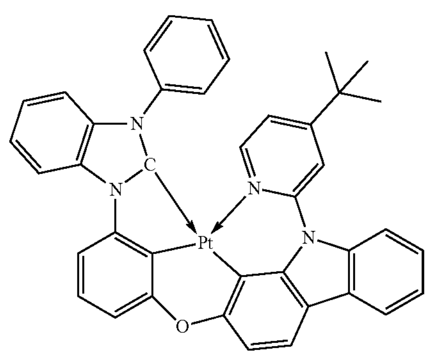
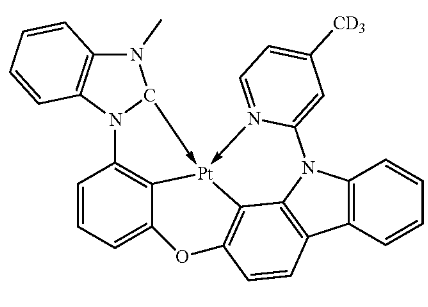

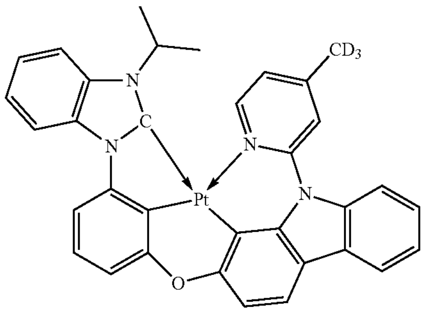
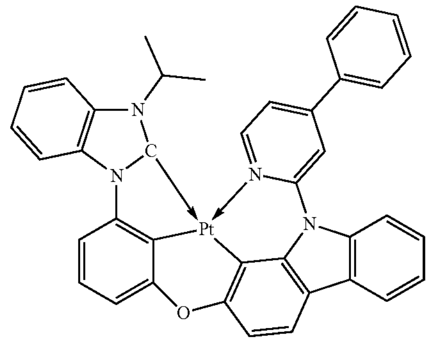
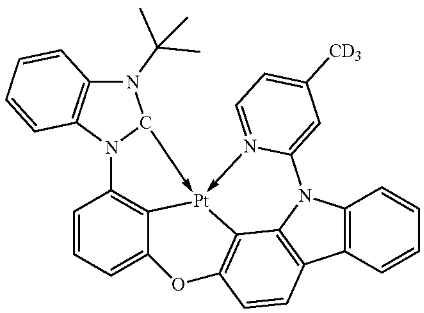
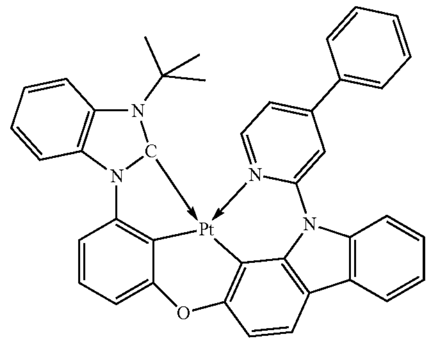
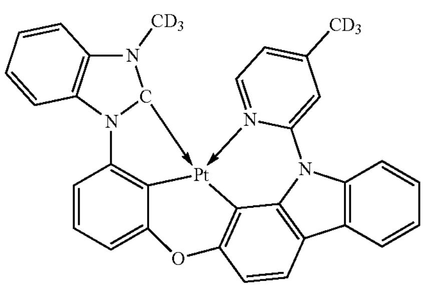
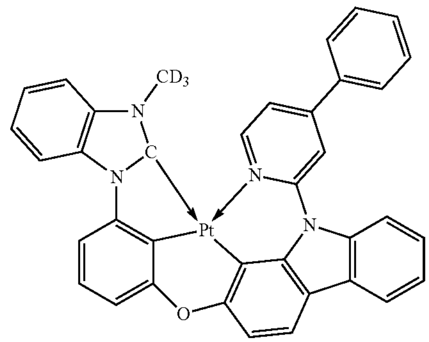
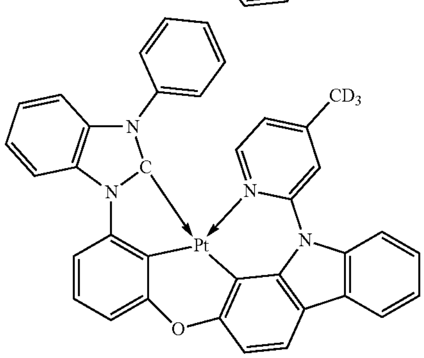
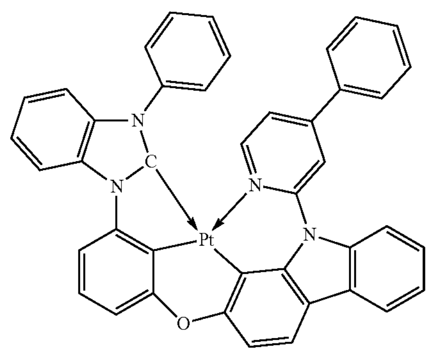
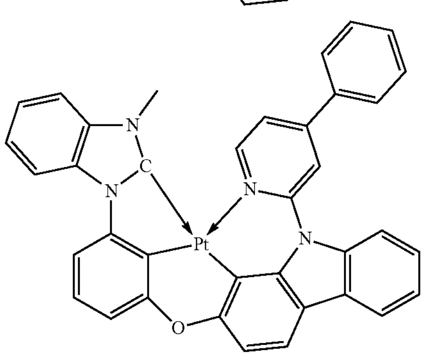
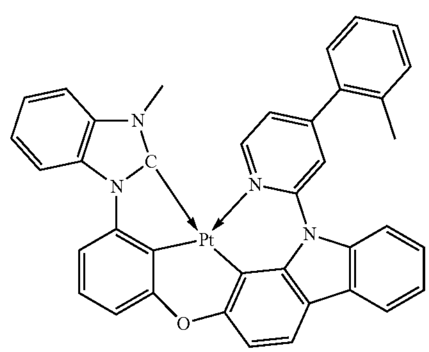

-continued
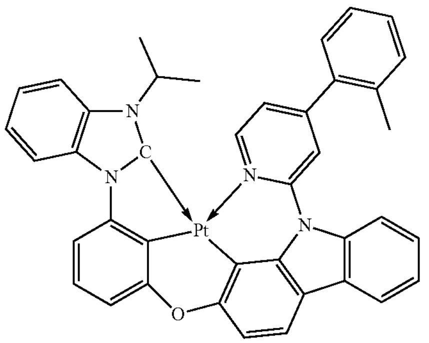
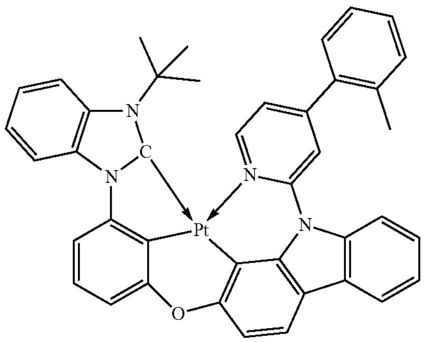
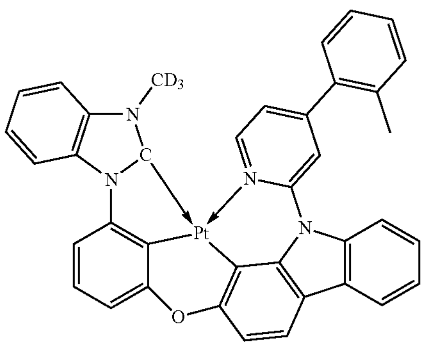
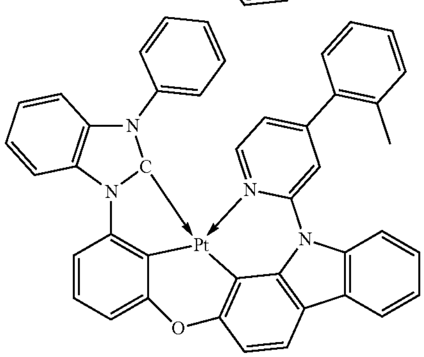
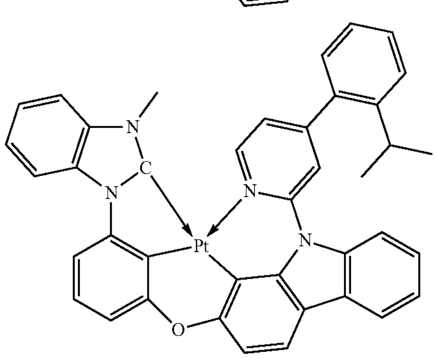
-continued
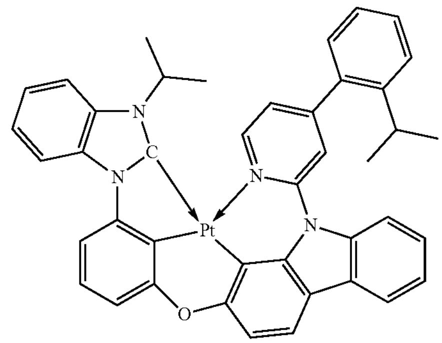
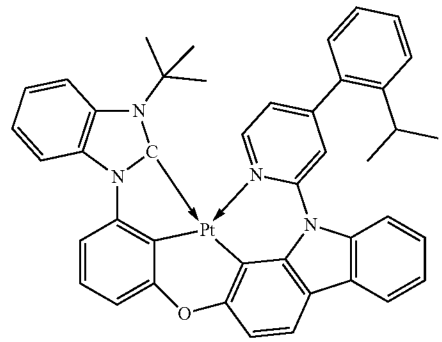
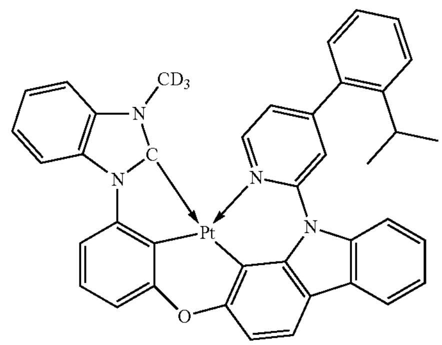
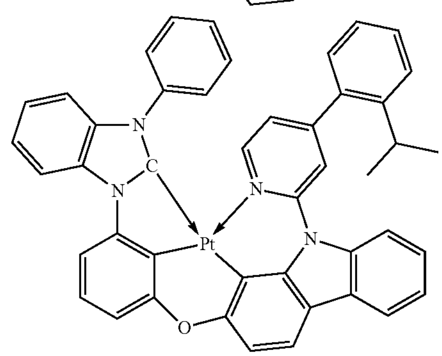
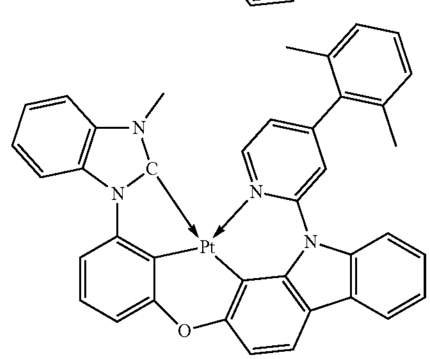

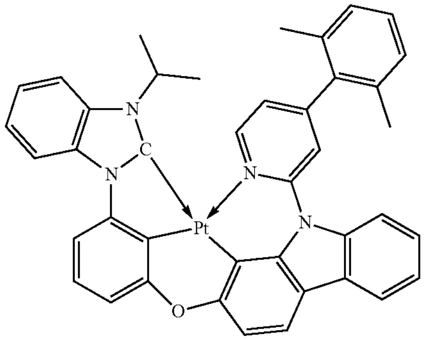
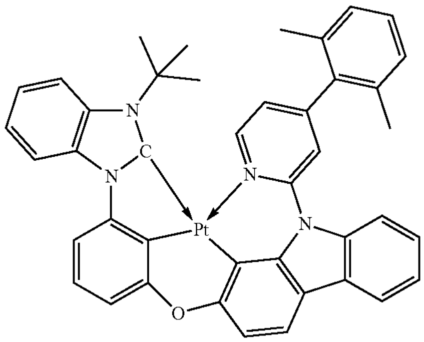
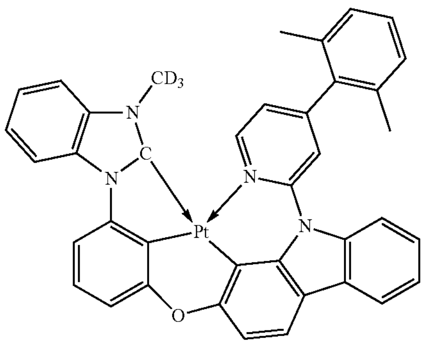
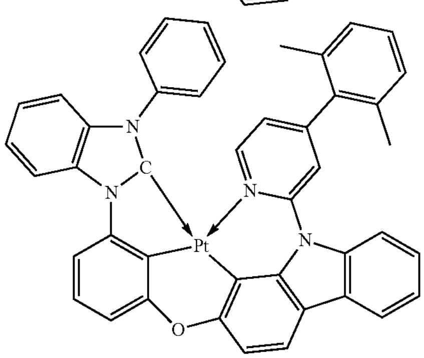
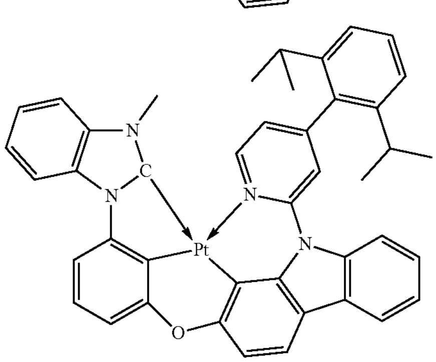
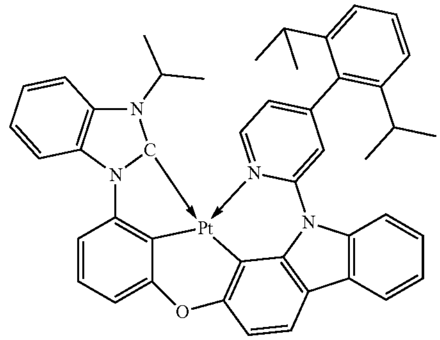
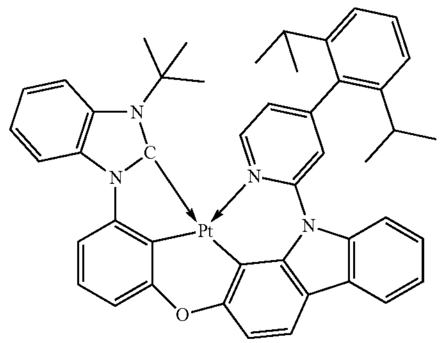
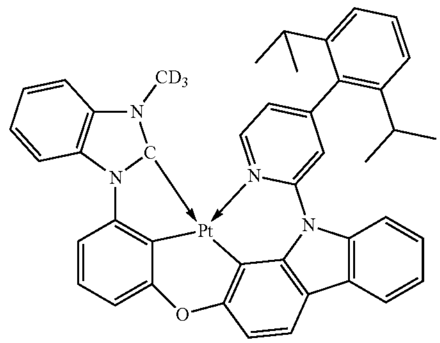
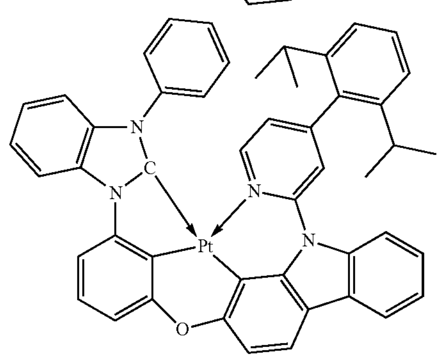
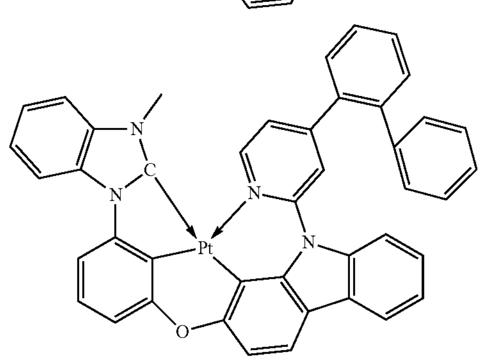

-continued
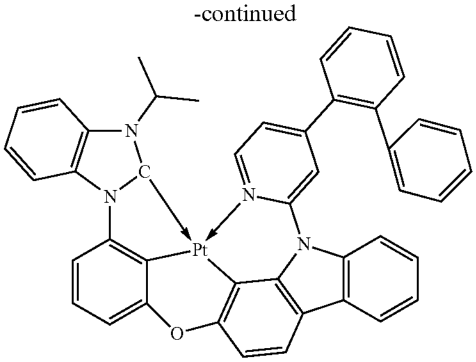
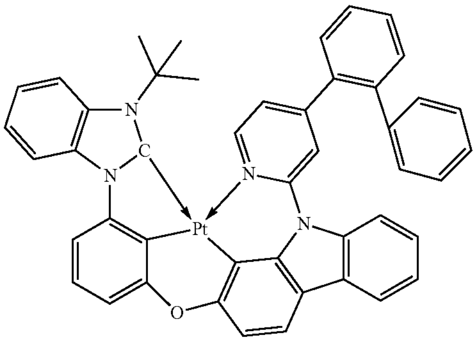
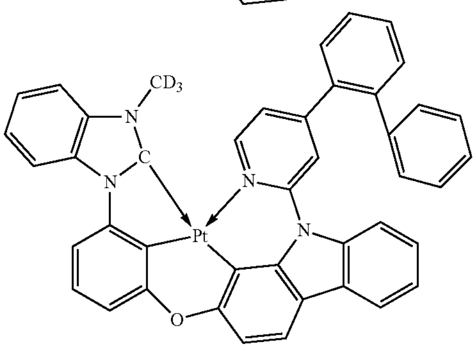
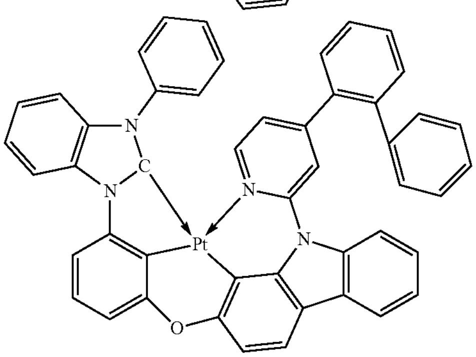
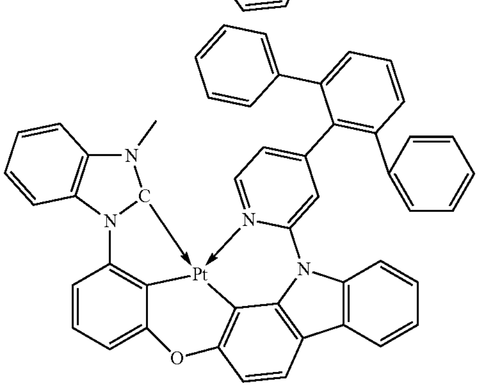
-continued
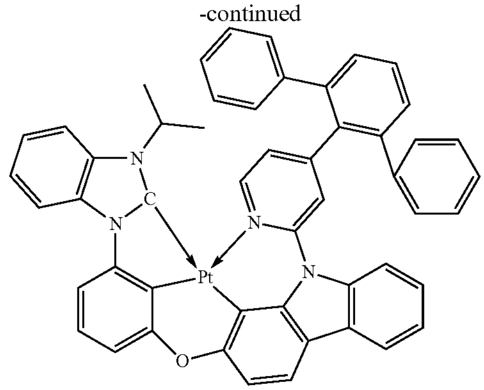
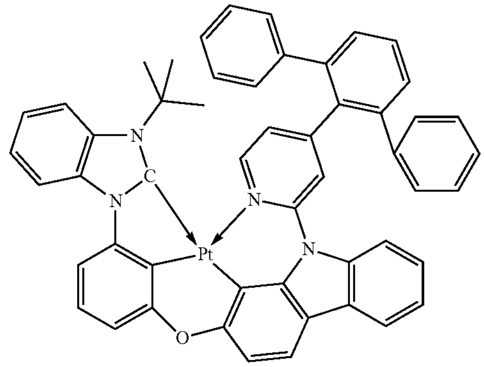
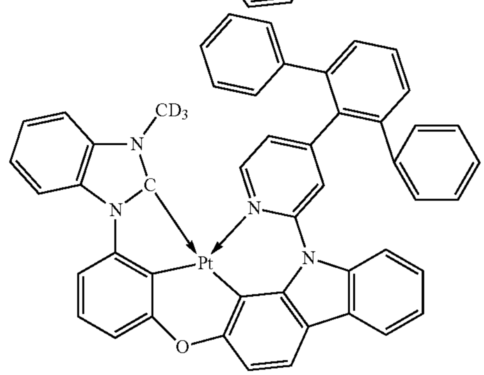
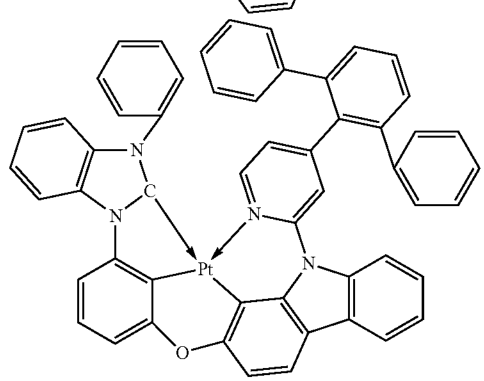
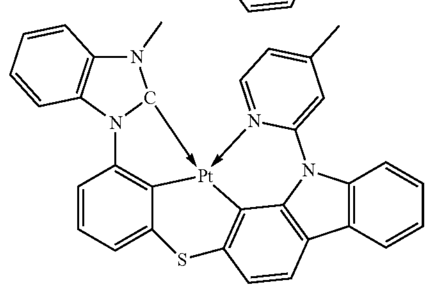

-continued
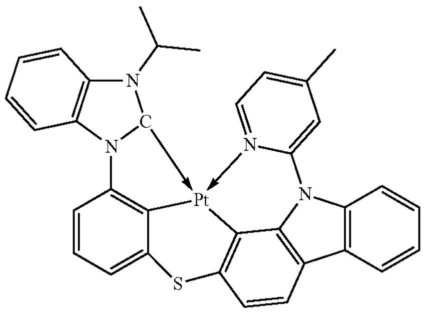
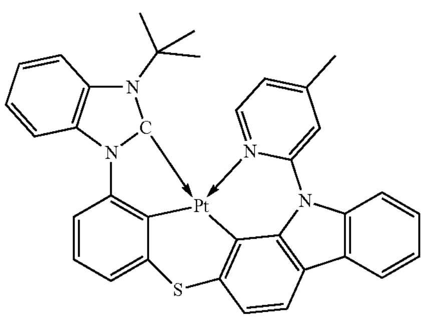
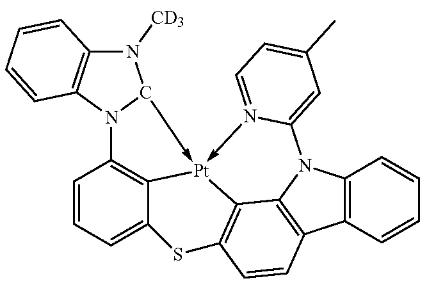
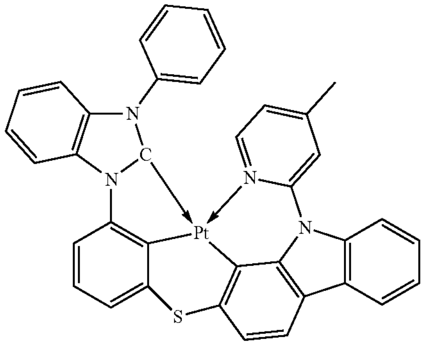
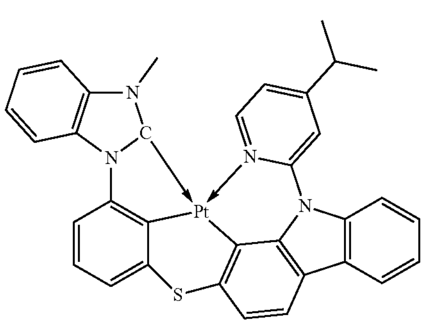
-continued
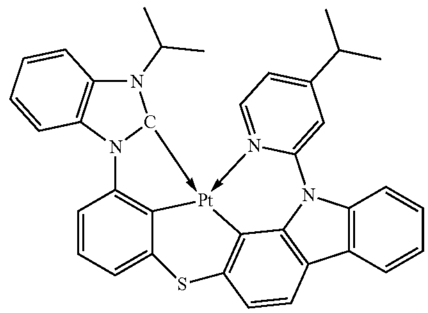
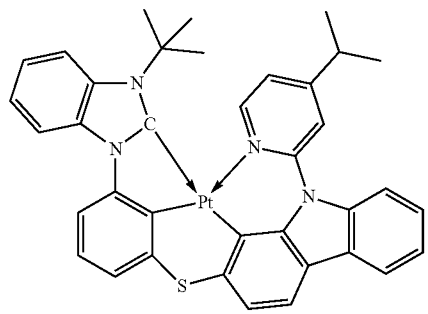
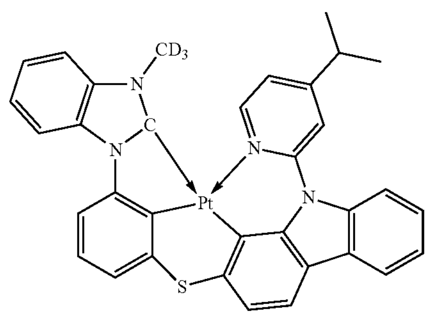
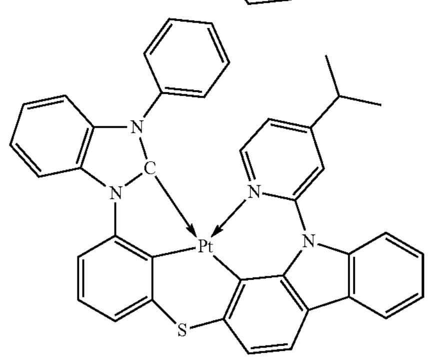
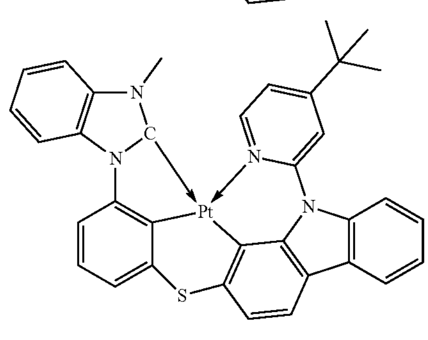

-continued
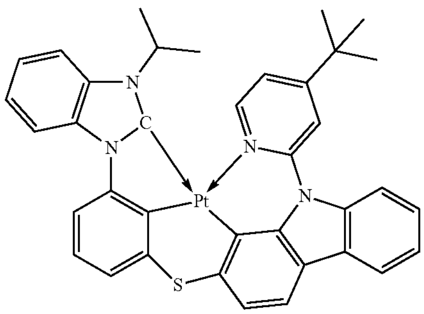
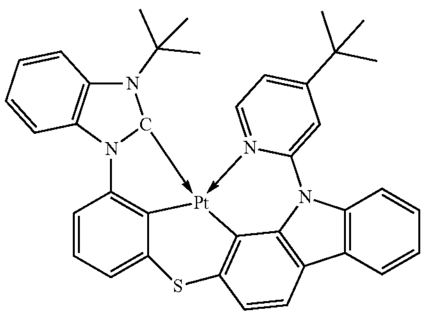
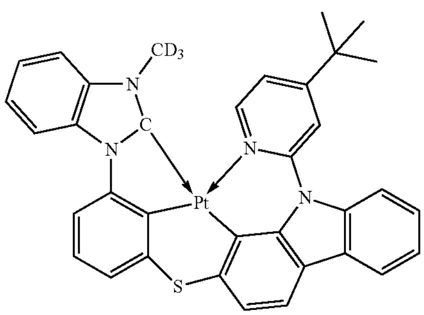
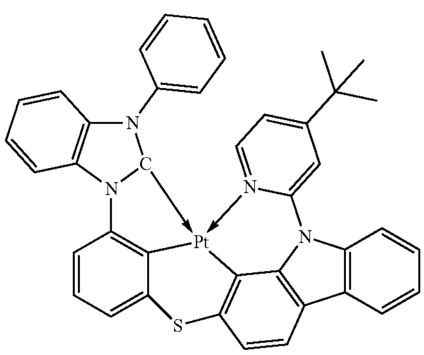
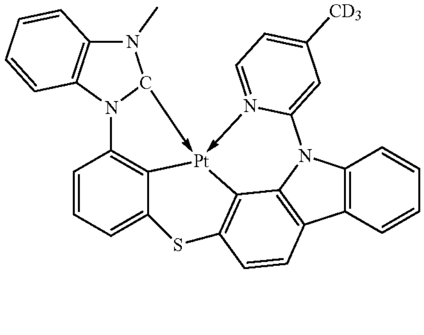
-continued
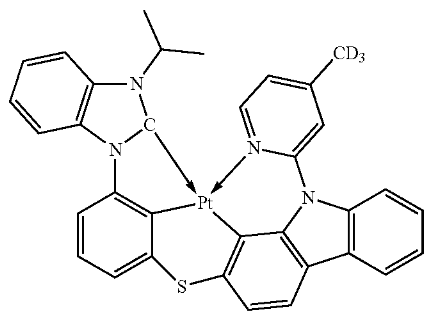
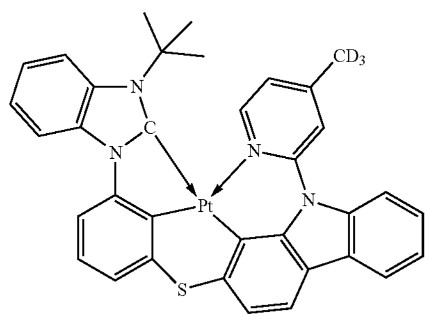
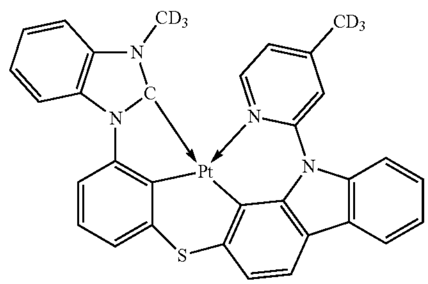
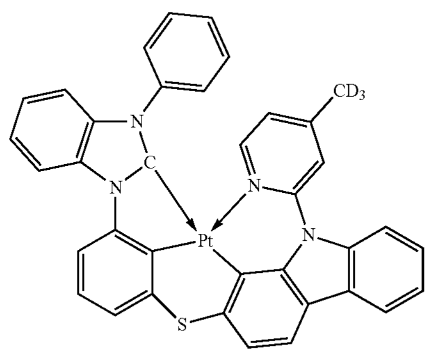
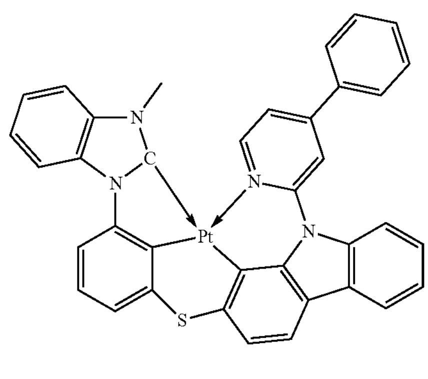

-continued
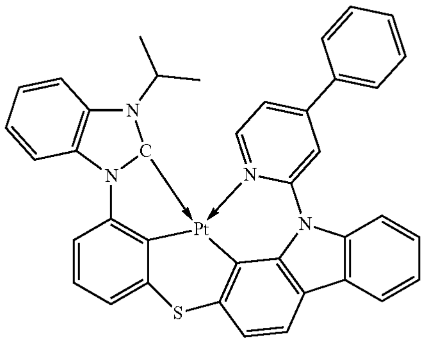
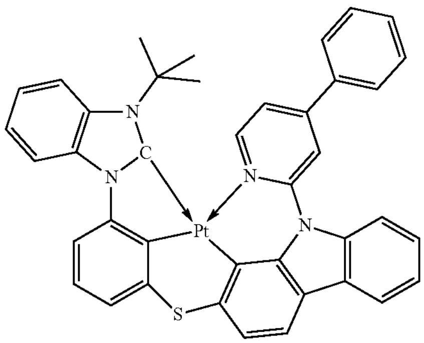
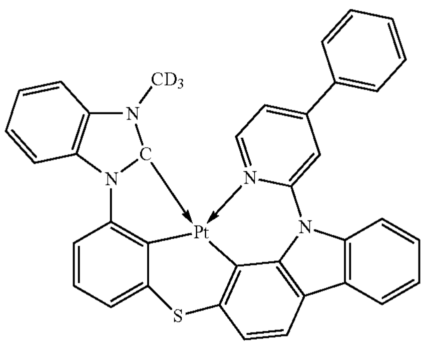
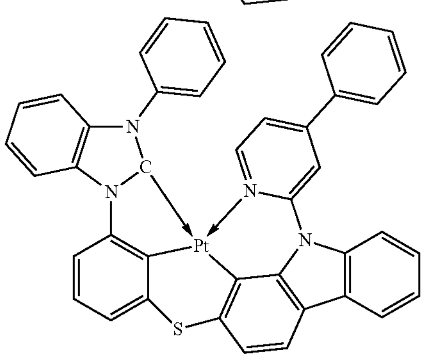
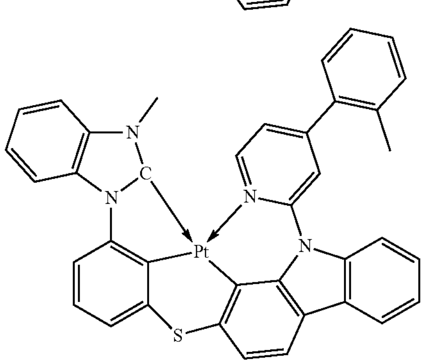
-continued
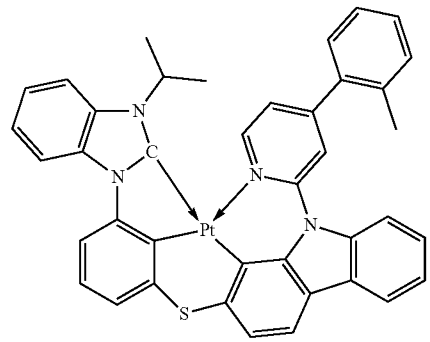
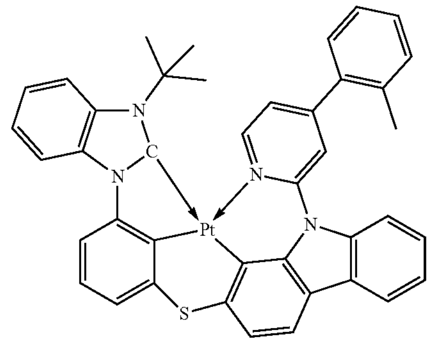
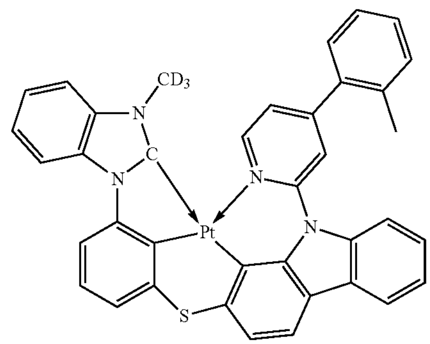
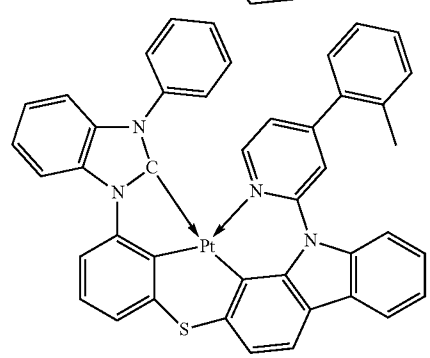
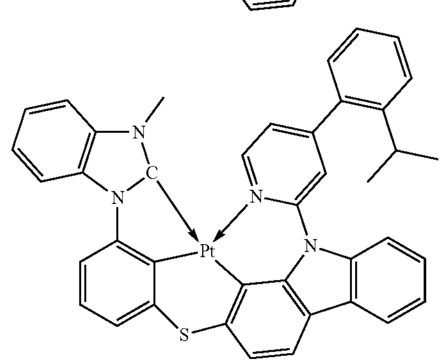

-continued
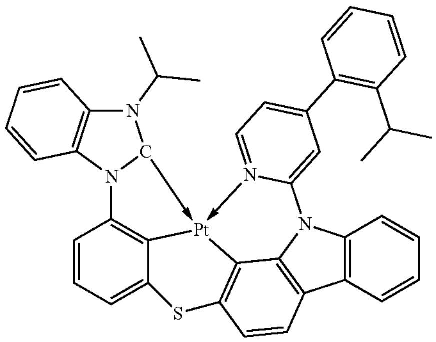
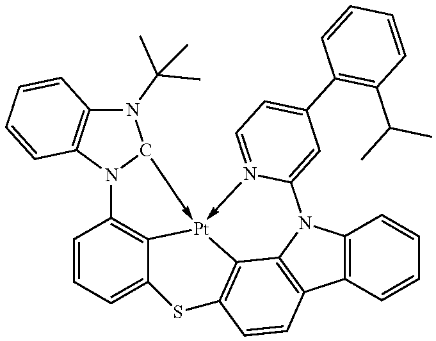
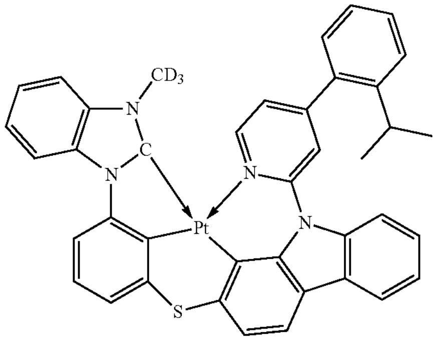
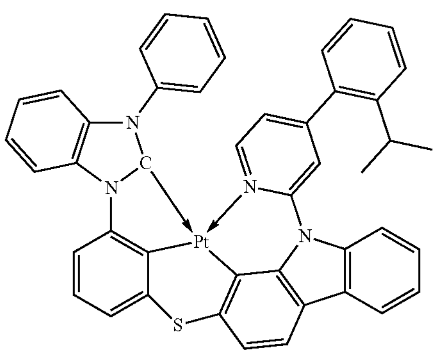
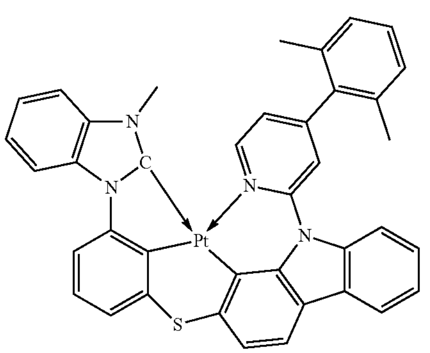
-continued
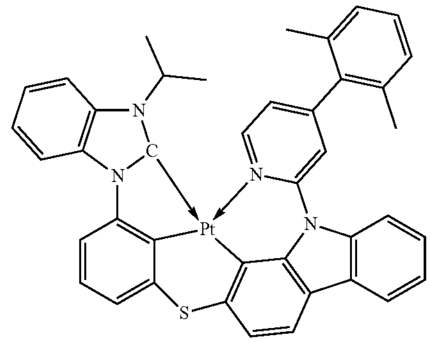
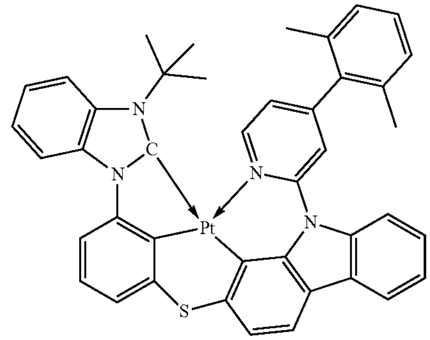
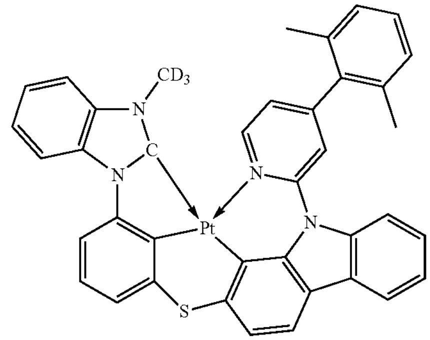
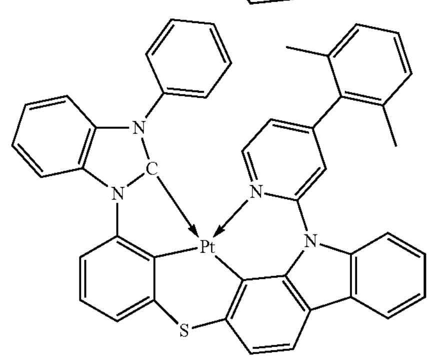
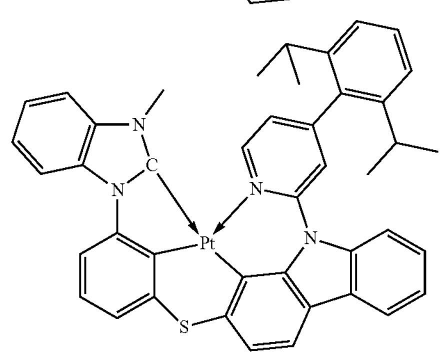

-continued
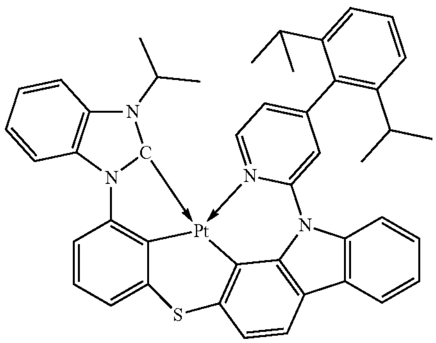
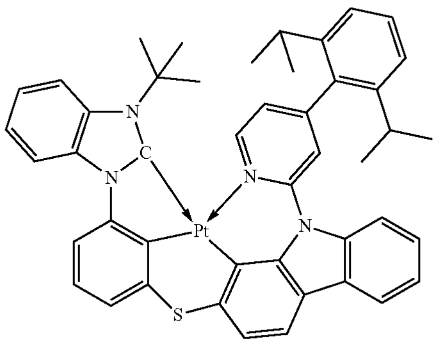
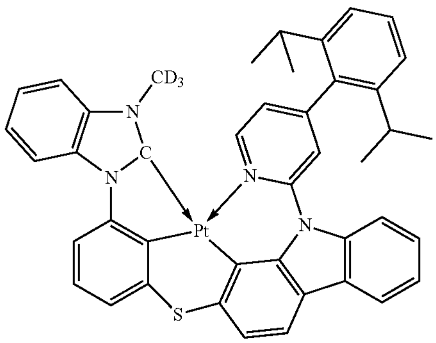
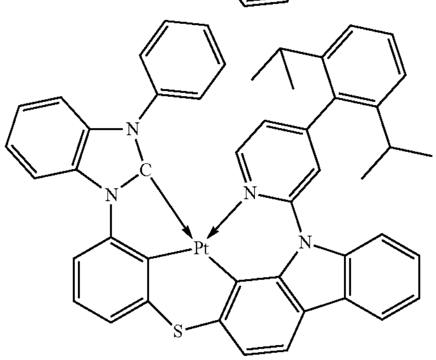
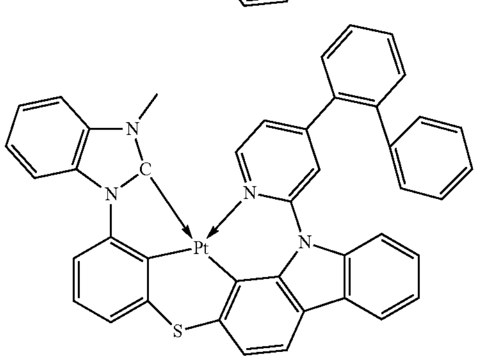
-continued
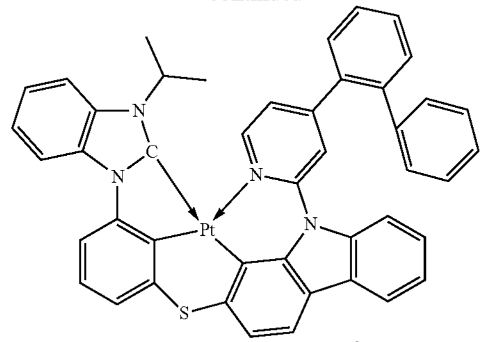
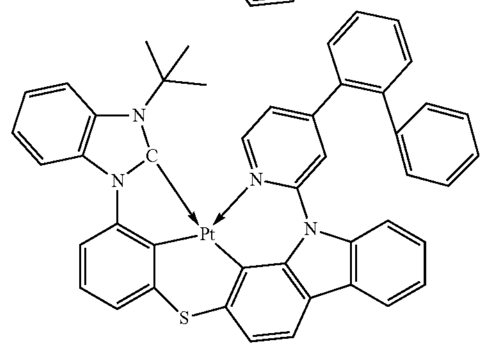
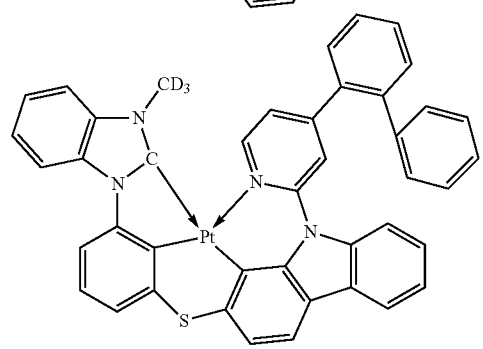
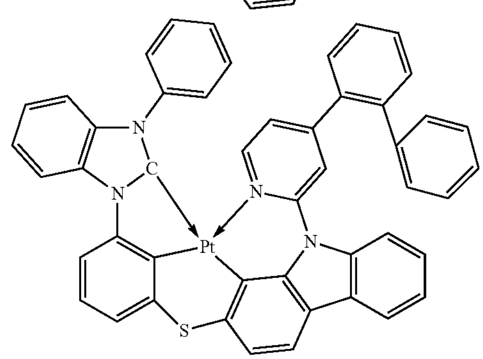
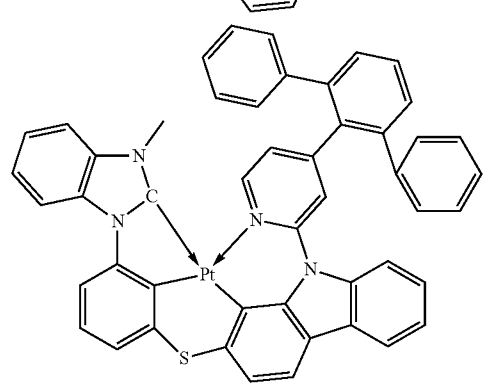

-continued
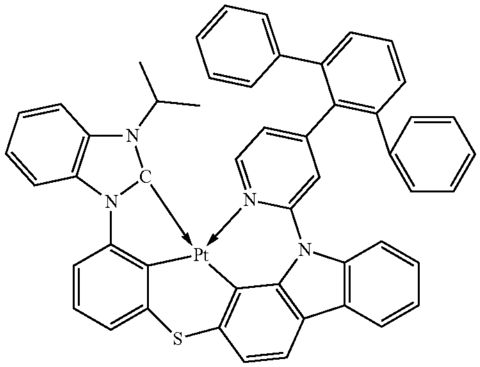
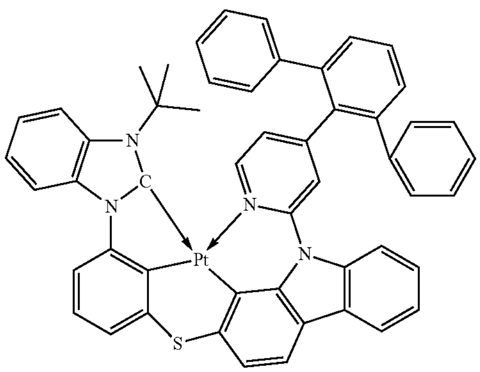
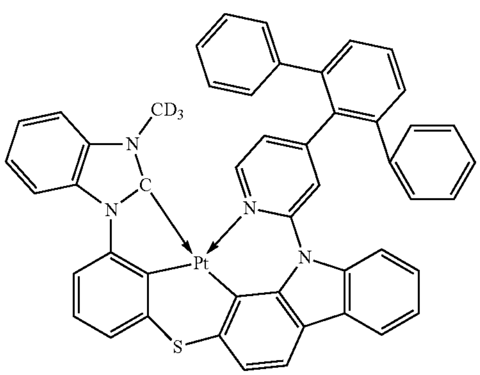
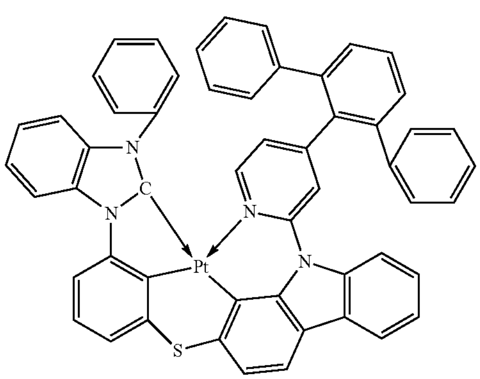
-continued
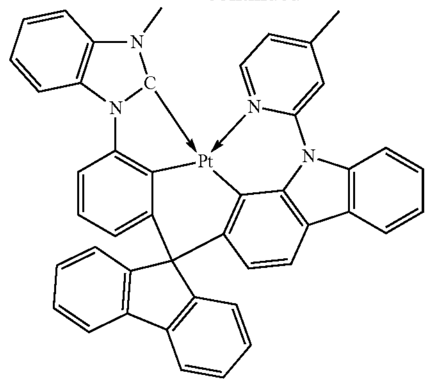
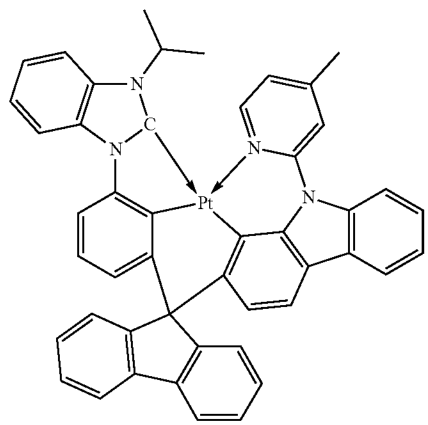
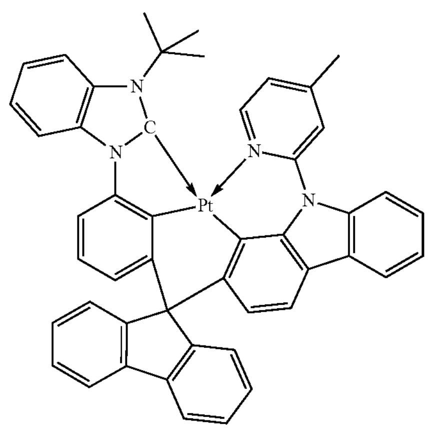
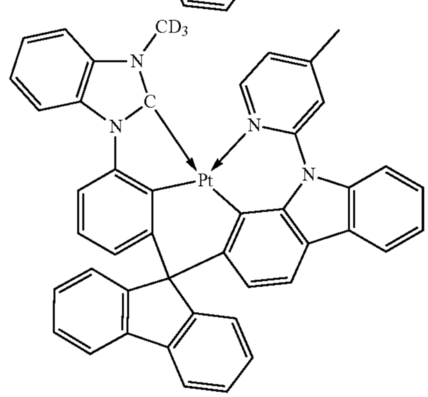

-continued
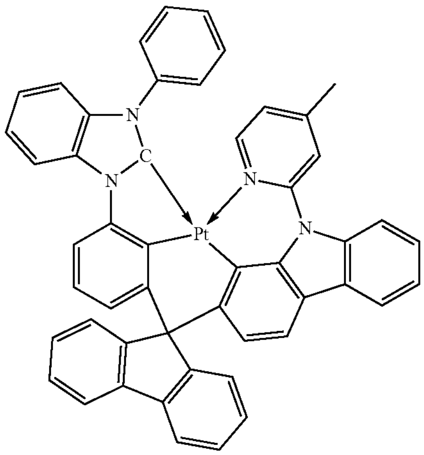
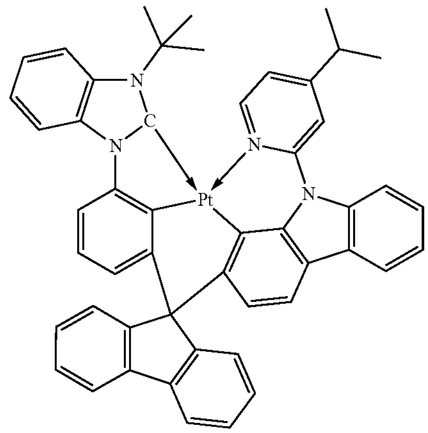
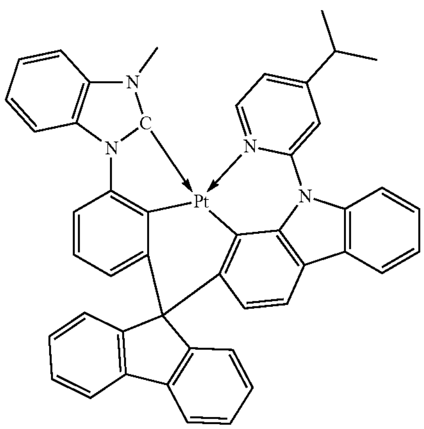
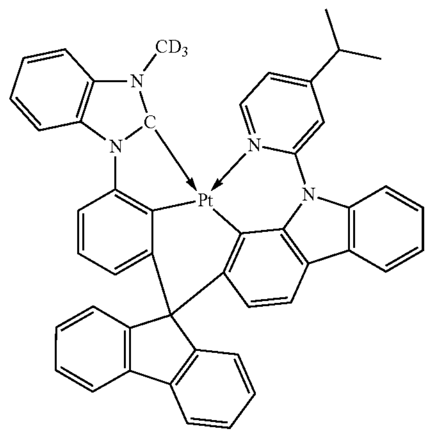
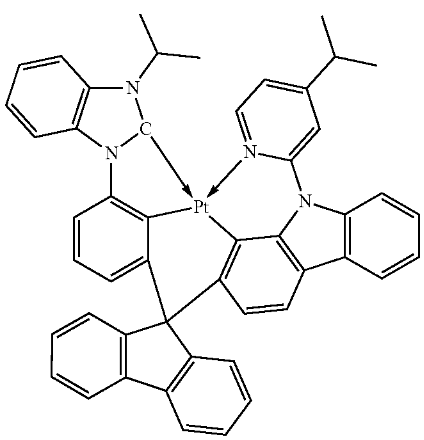
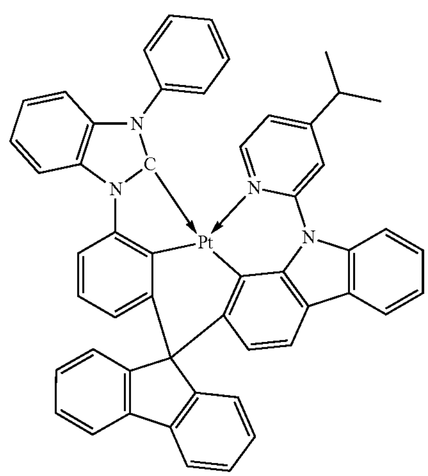

-continued
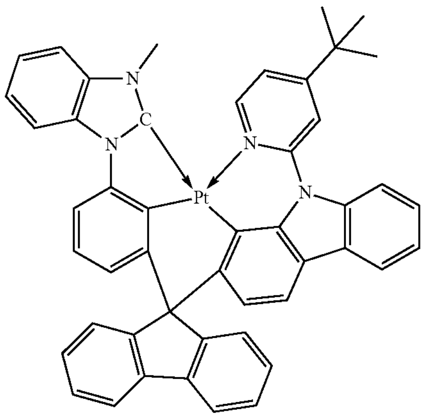
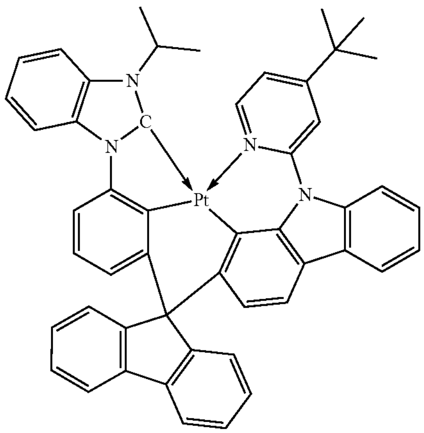
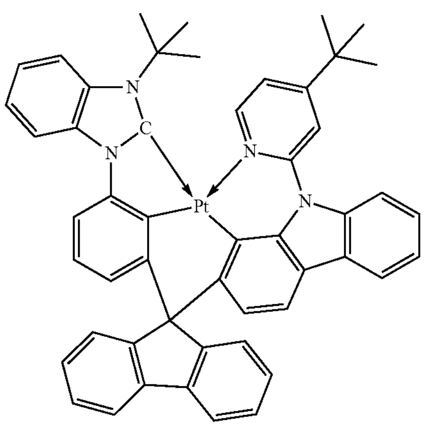
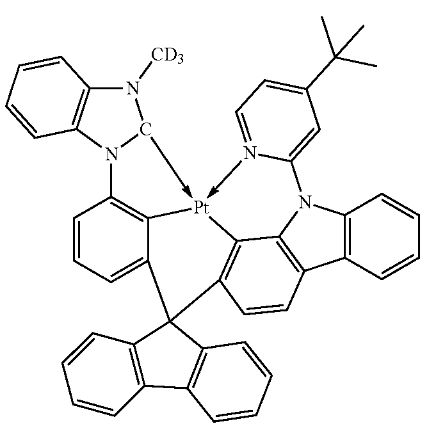
-continued
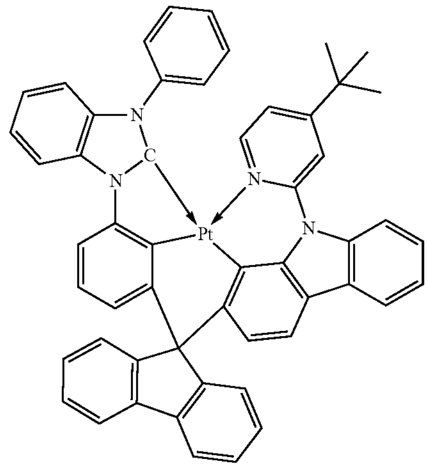
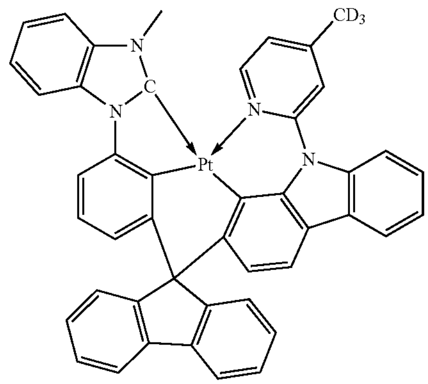
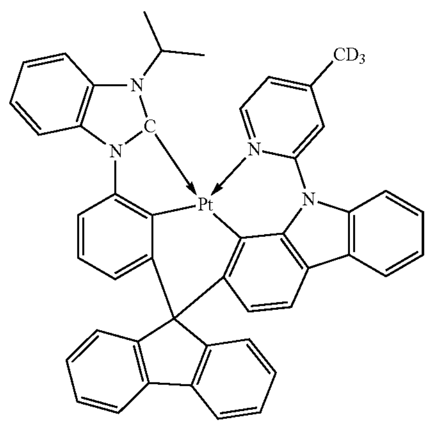
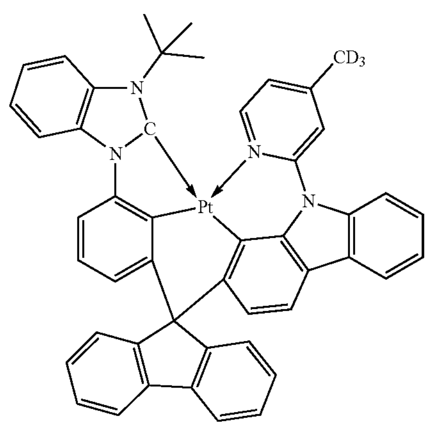

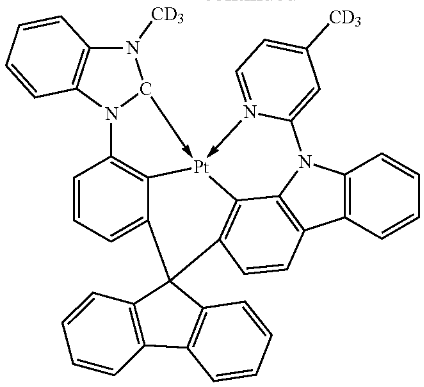
CD3
N
C
N
Pt
CD3
N
N
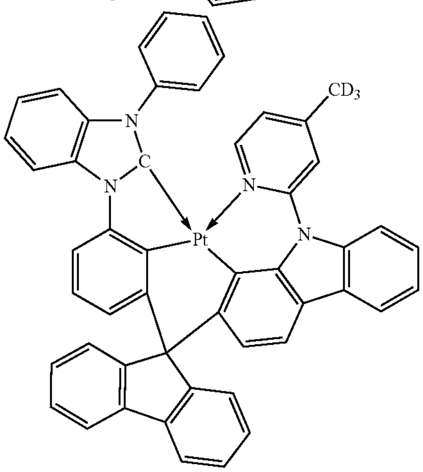
CD3
N
C
N
Pt
N
N
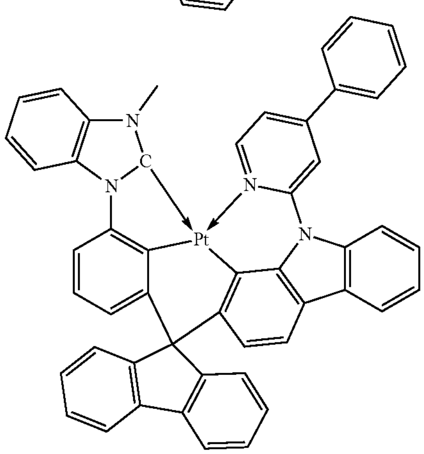
N
C
N
Pt
N
N
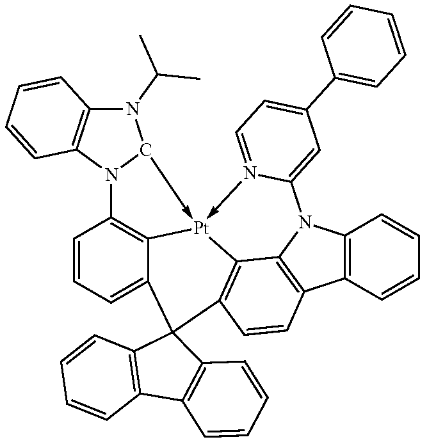
N
C
N
Pt
N
N
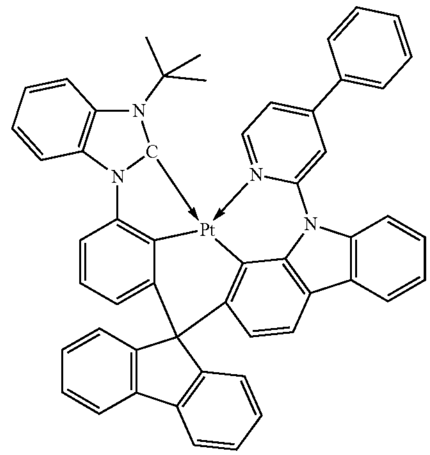
N
C
N
Pt
N
N
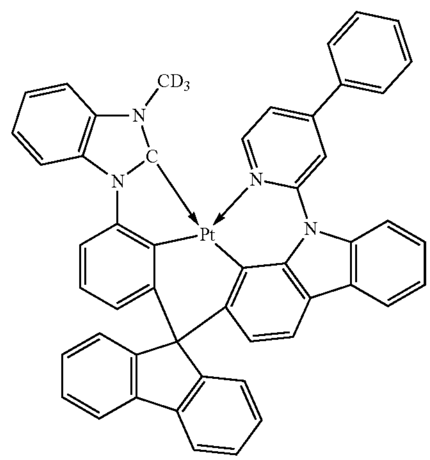
CD3
N
C
N
Pt
N
N
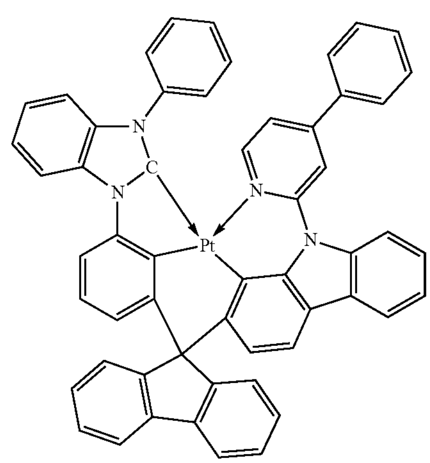
N
C
N
Pt
N
N -continued
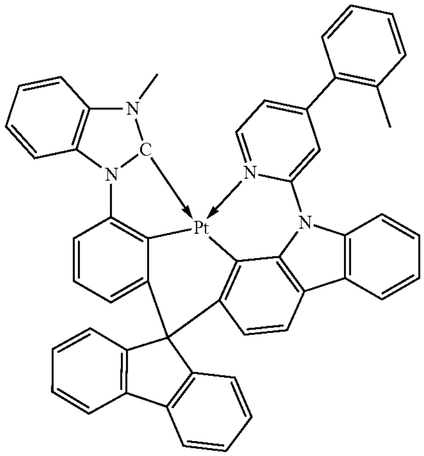
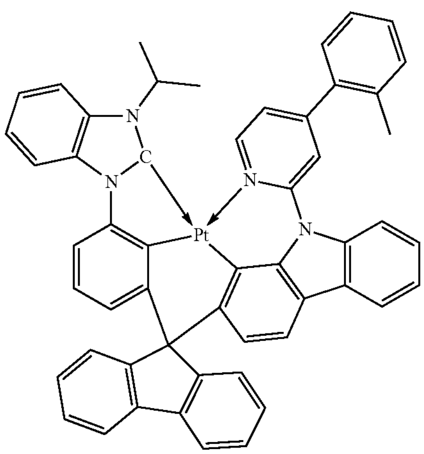
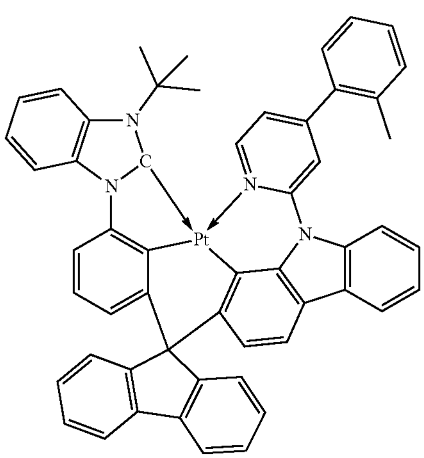
-continued
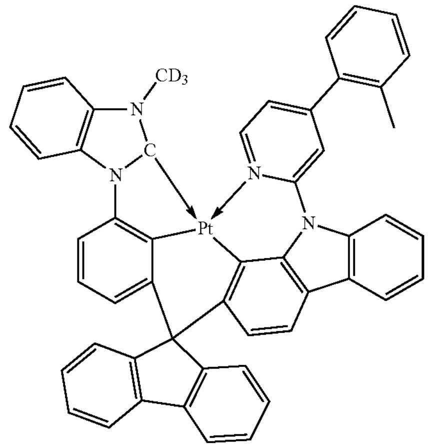
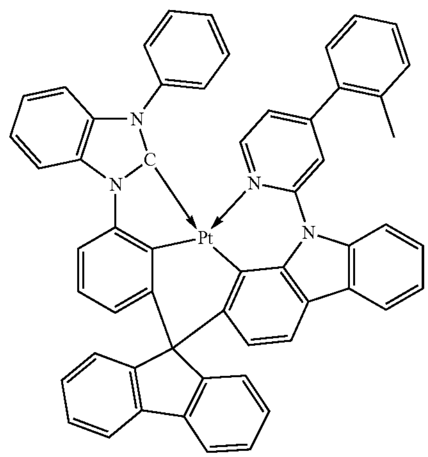
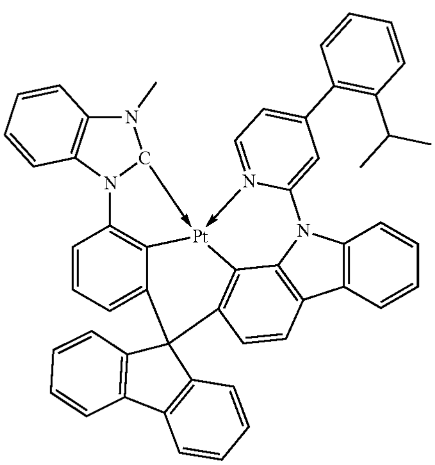

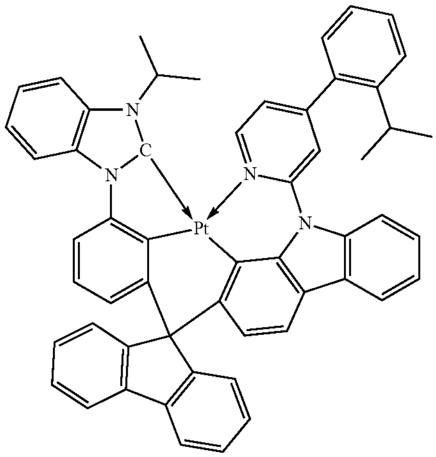
N
C
N
Pt
N
N
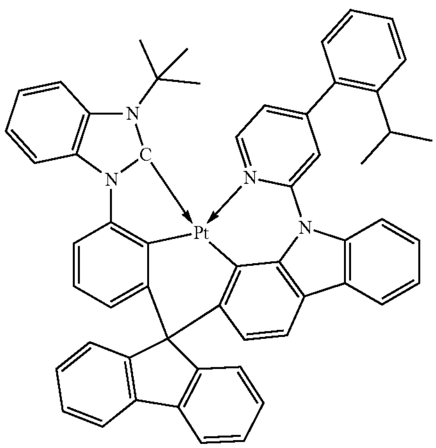
N
C
N
Pt
N
N
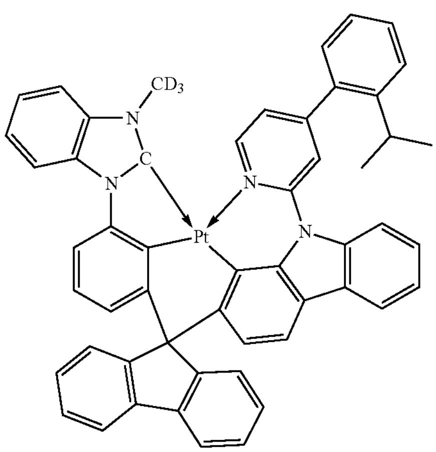
$CD_3$
N
C
N
Pt
N
N
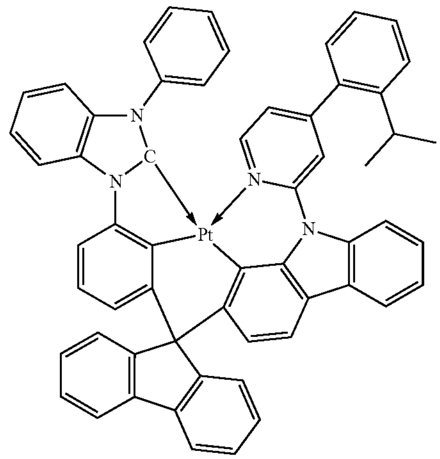
N
C
N
Pt
N
N
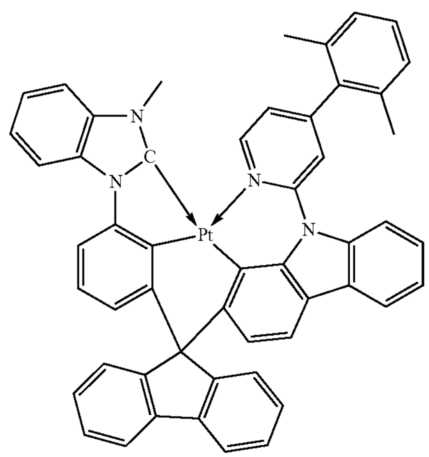
N
C
N
Pt
N
N
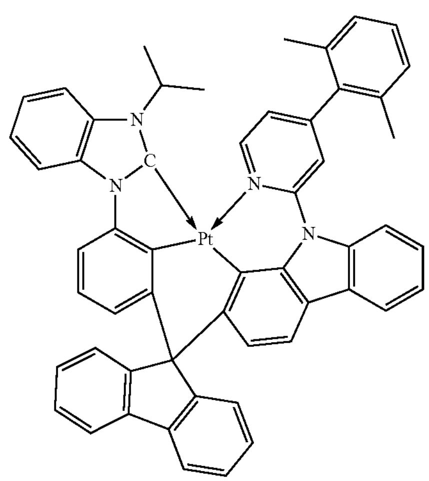
N
C
N
Pt
N
N -continued
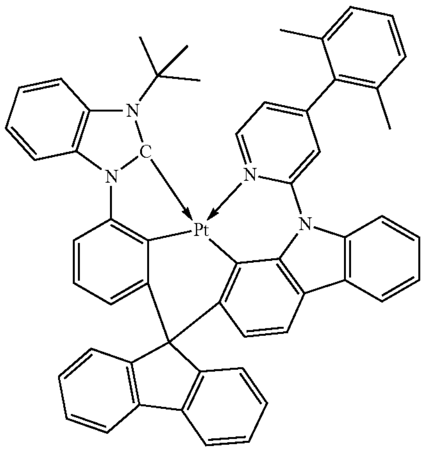
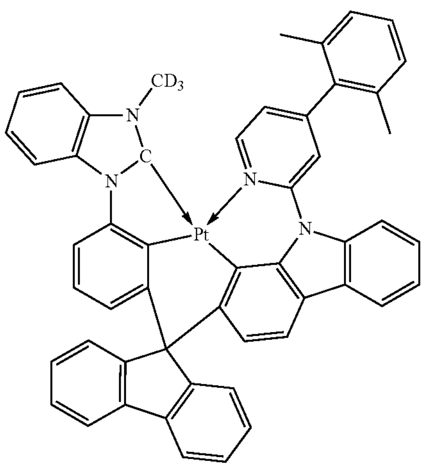
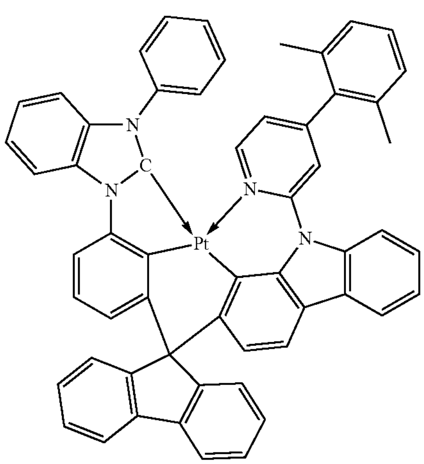
-continued
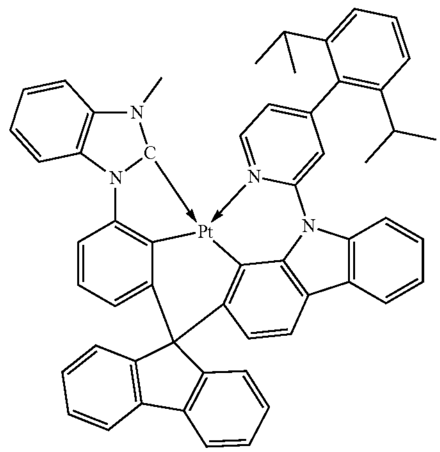
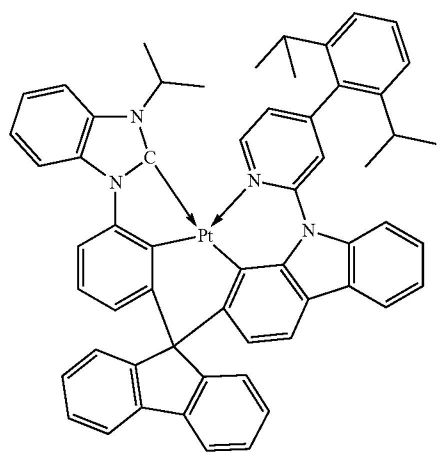
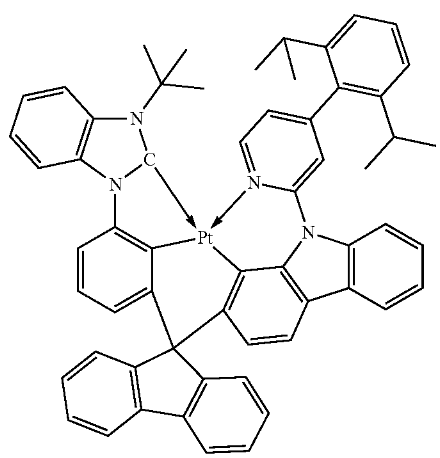

-continued
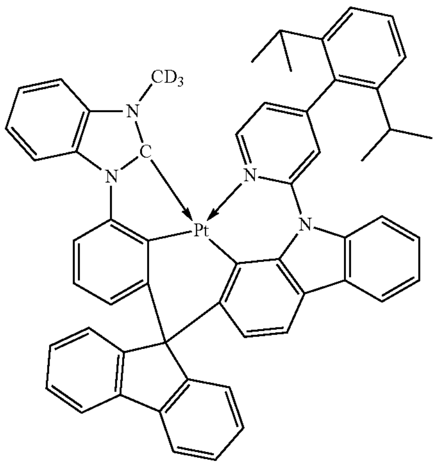
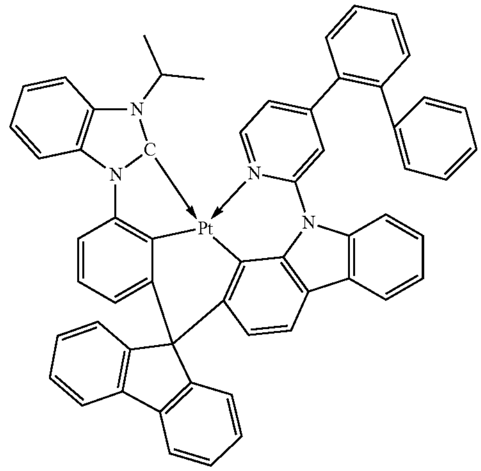
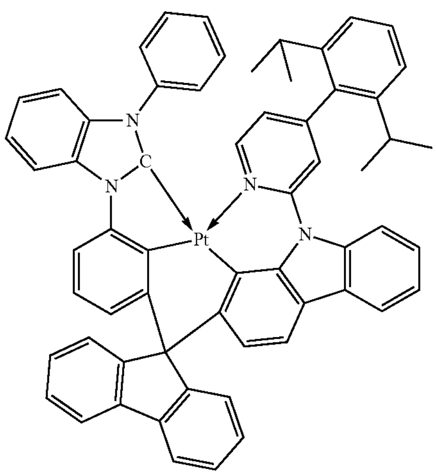
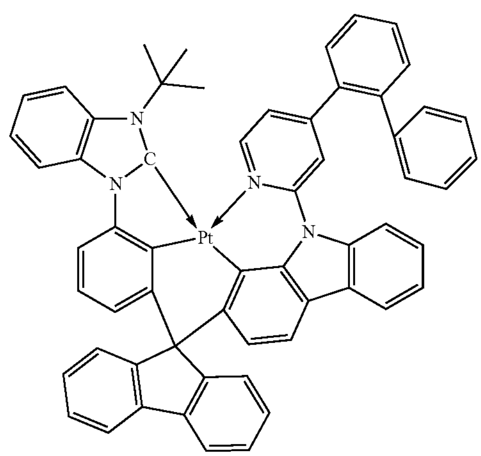
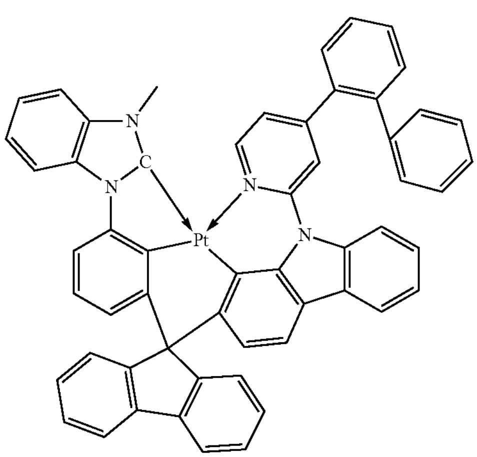
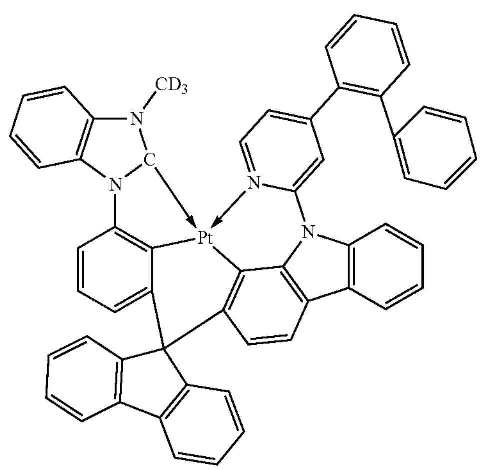
-continued -continued
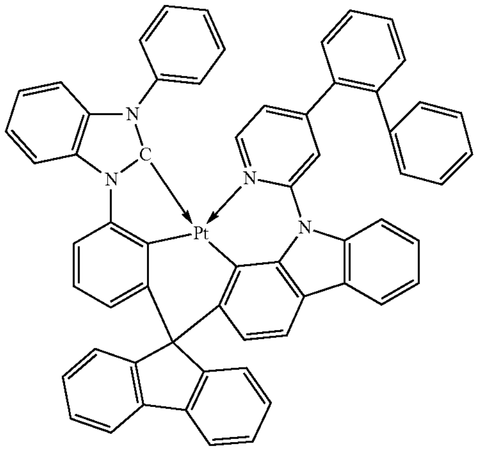
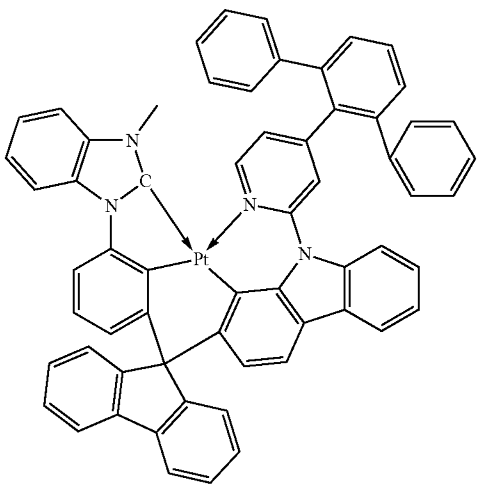
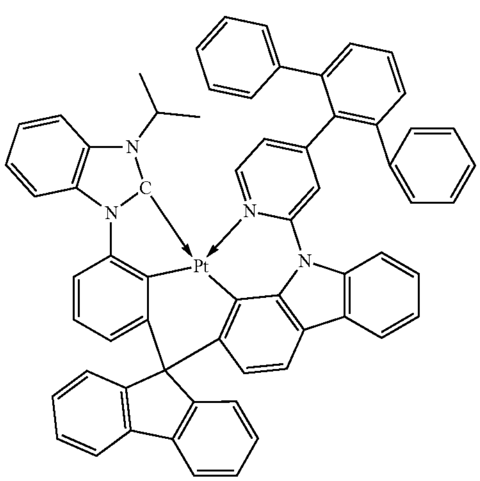
-continued
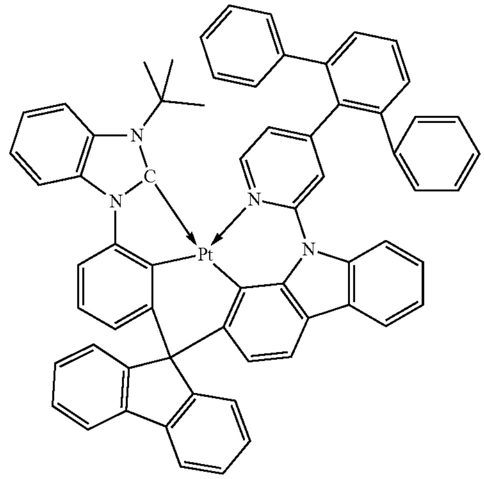
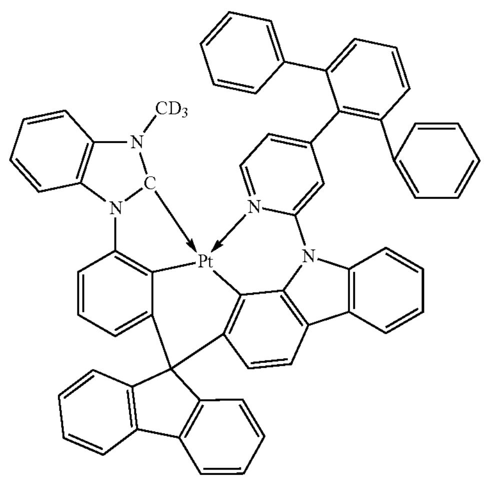
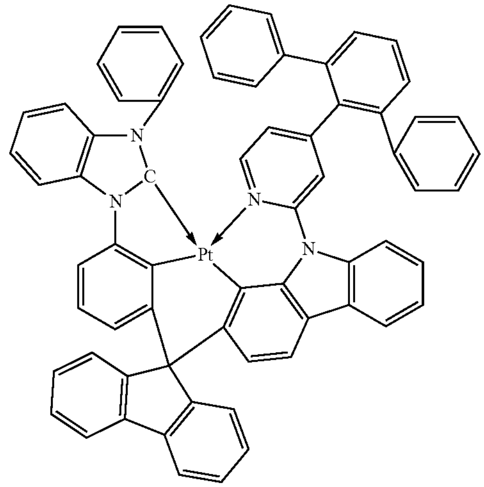

-continued
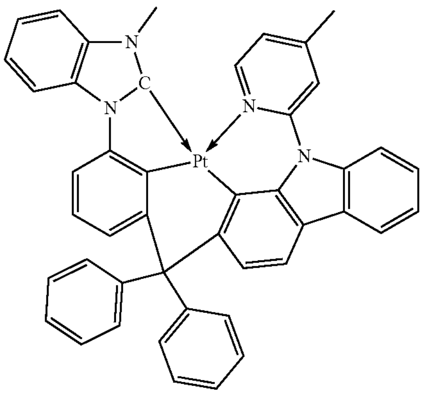
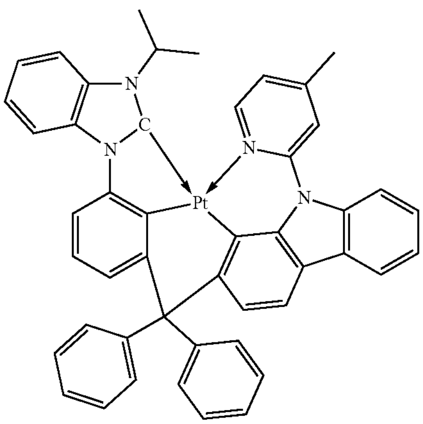
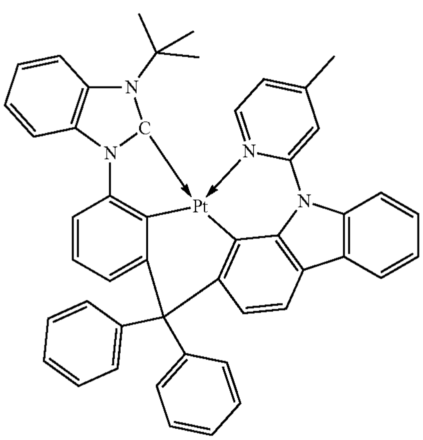
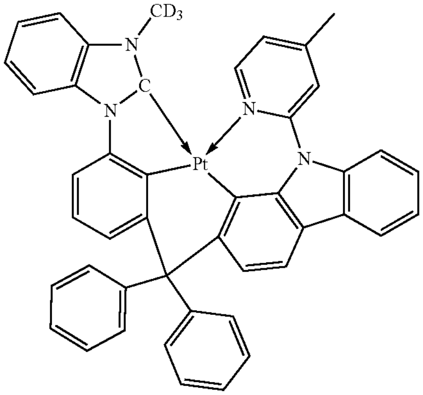
-continued
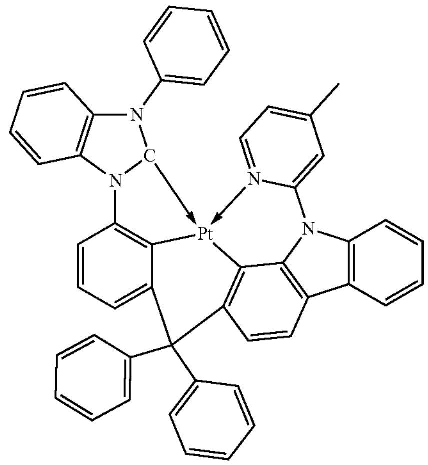
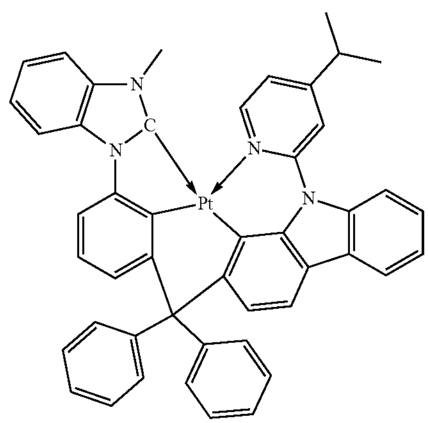
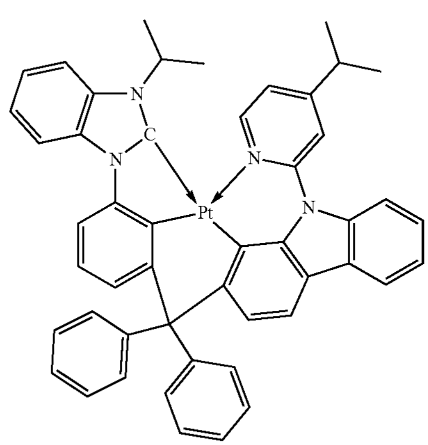

-continued
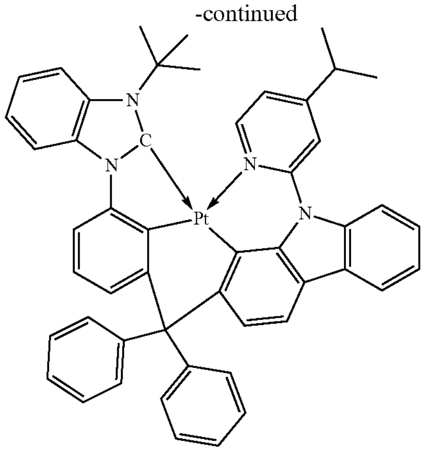
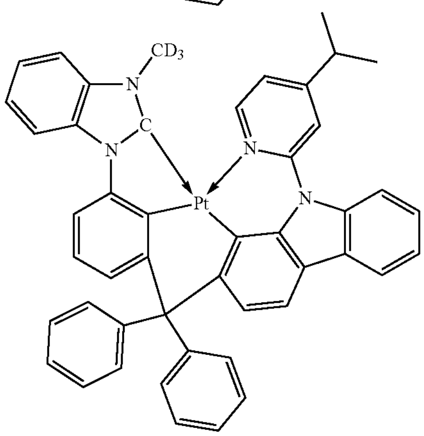
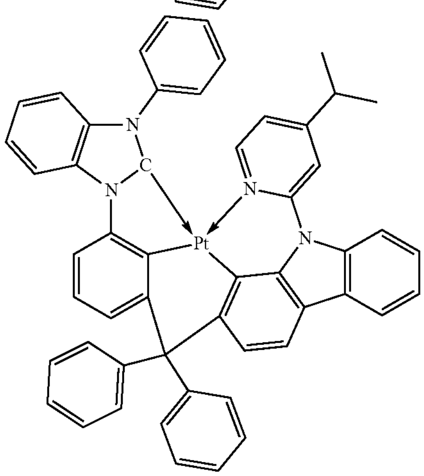
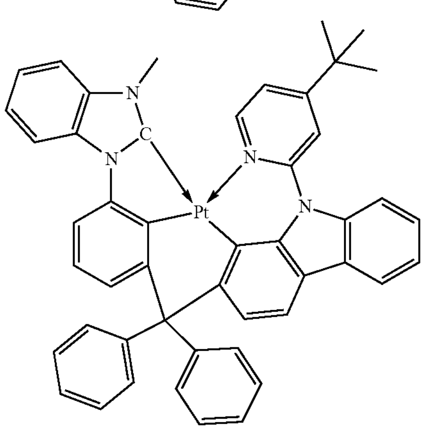
-continued
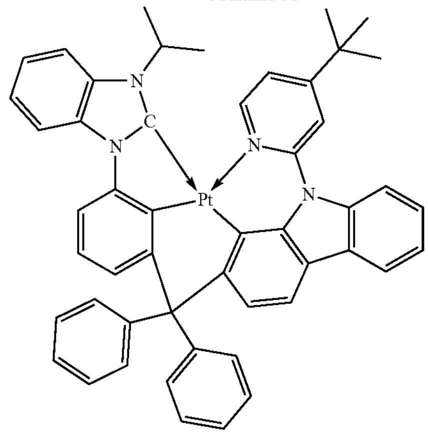
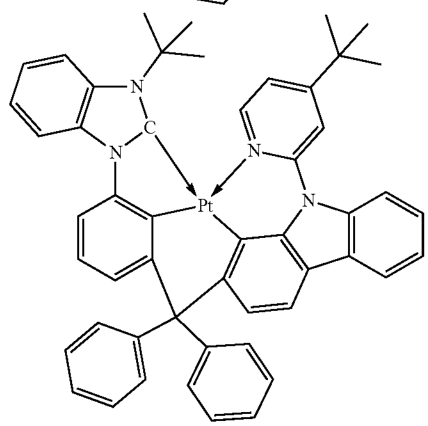
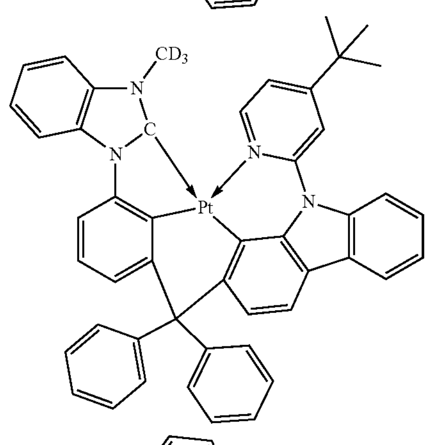
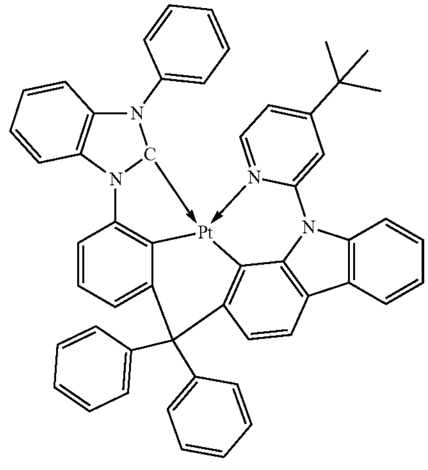

-continued
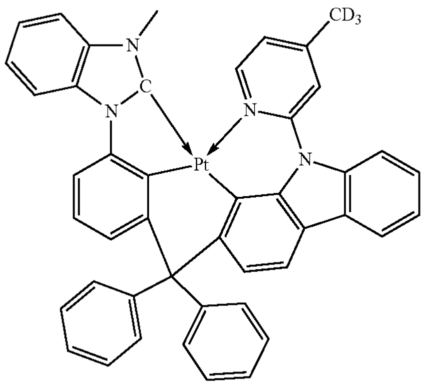
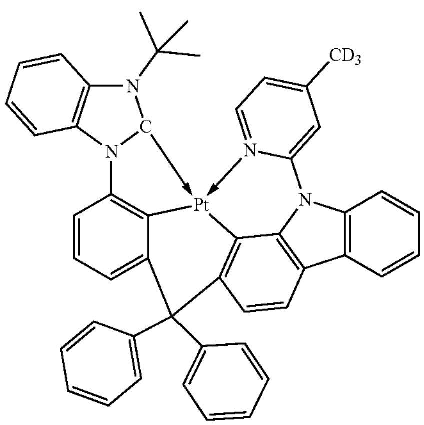
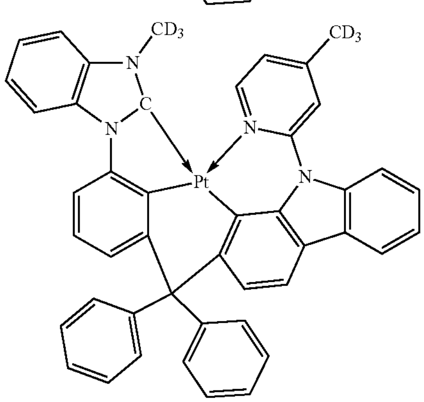
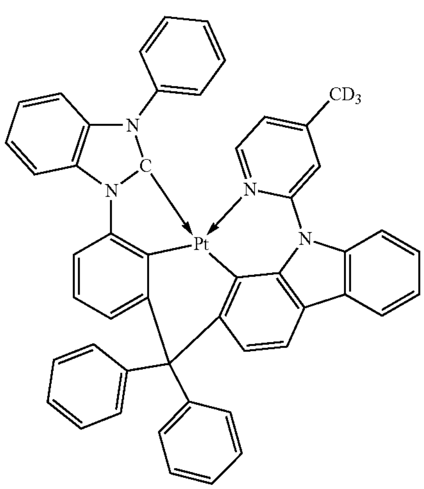
-continued
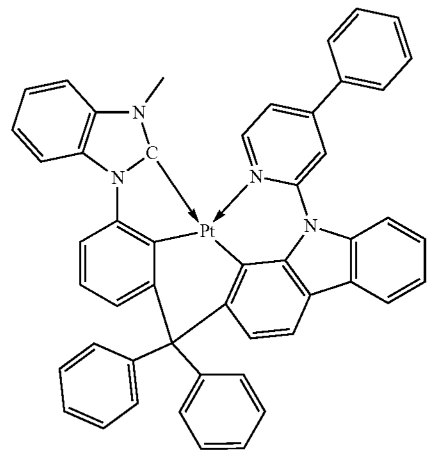
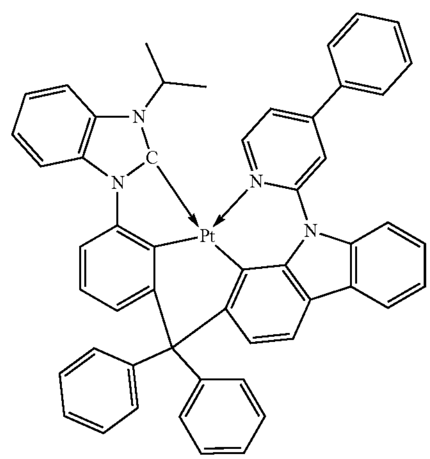
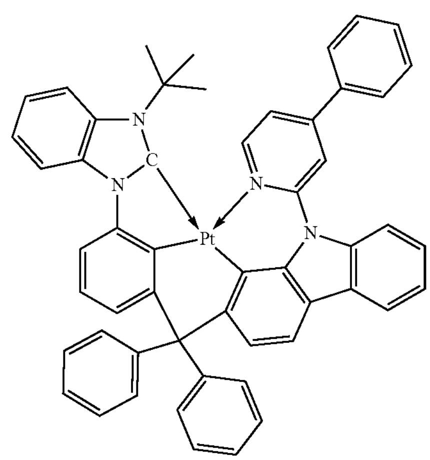

-continued
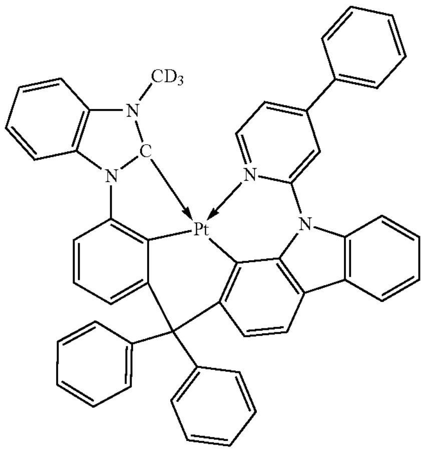
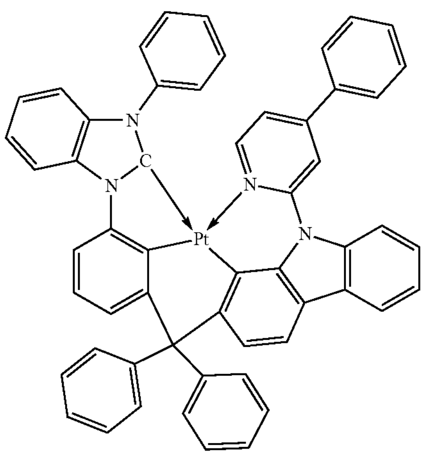
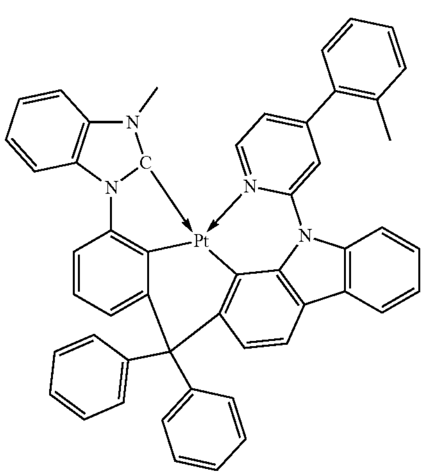
-continued
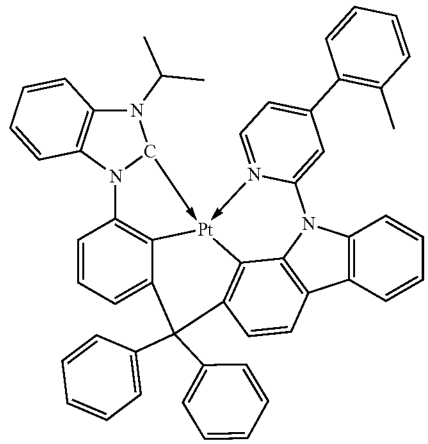
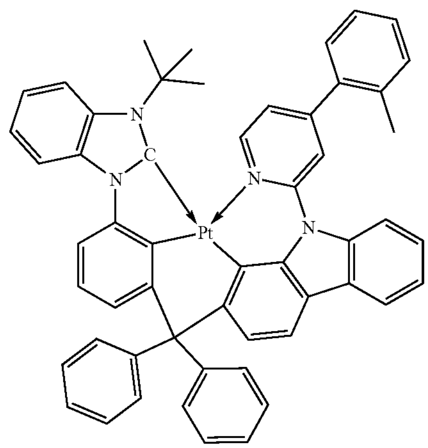
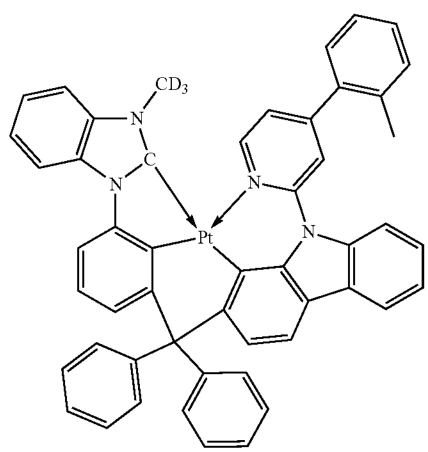

-continued
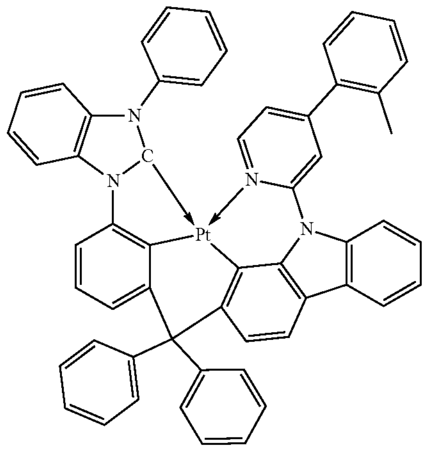
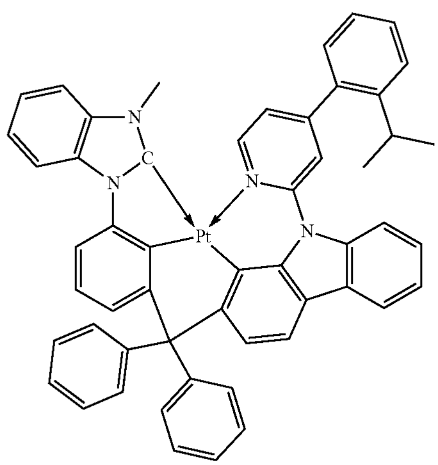
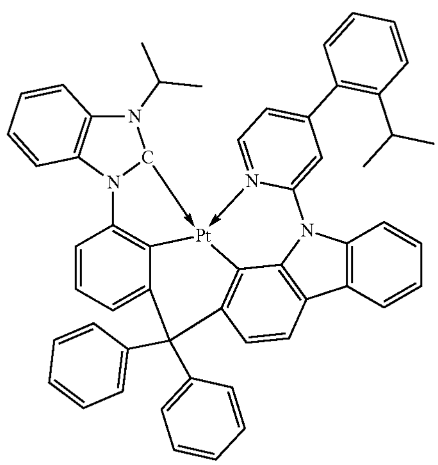
-continued
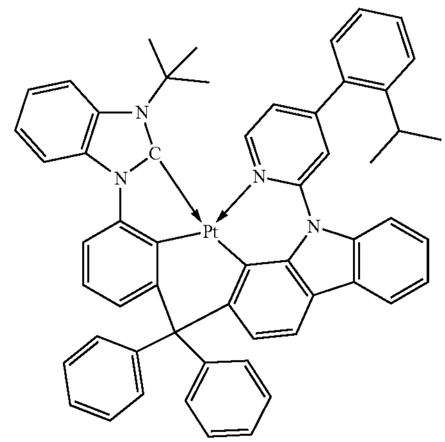
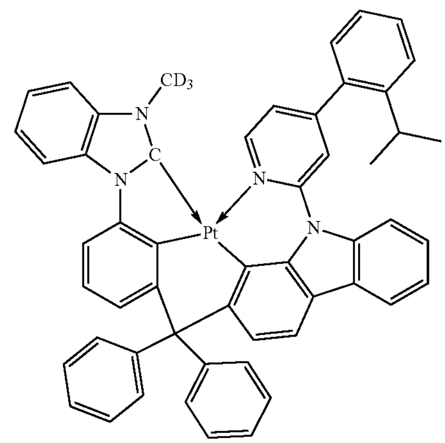
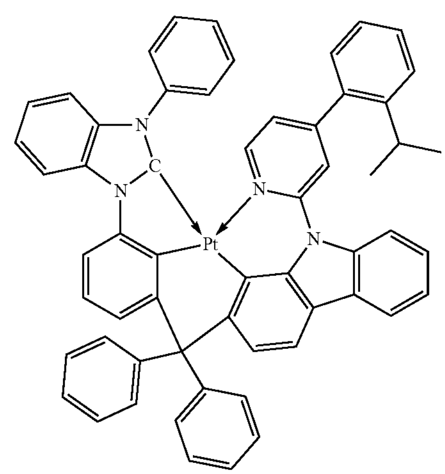

-continued
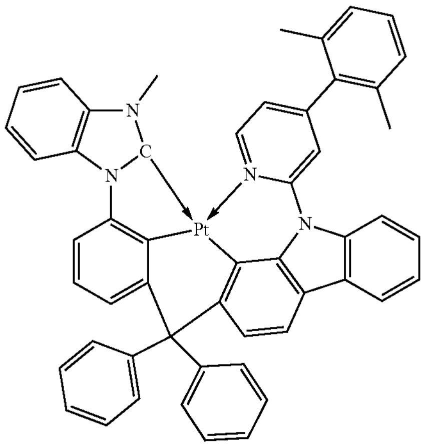
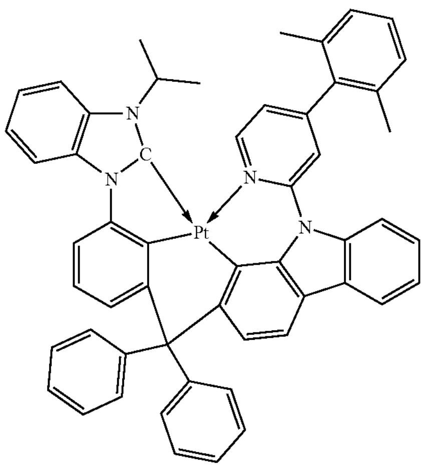
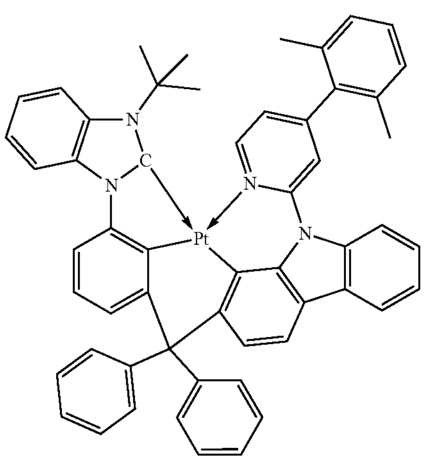
-continued
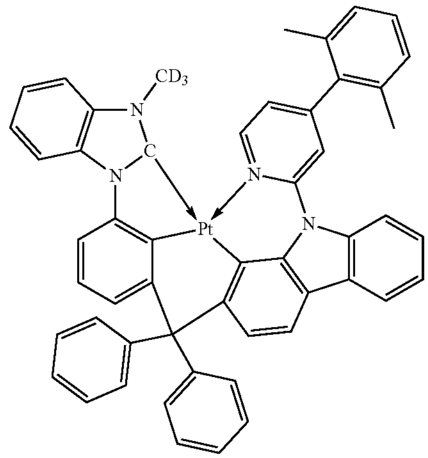
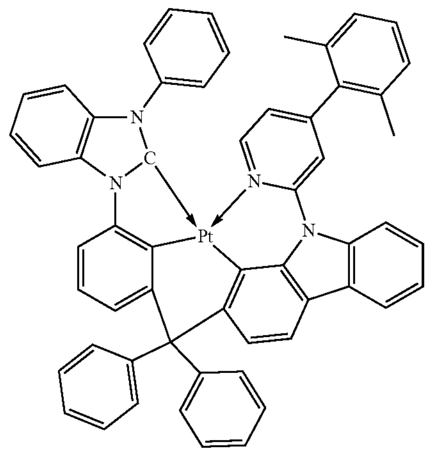
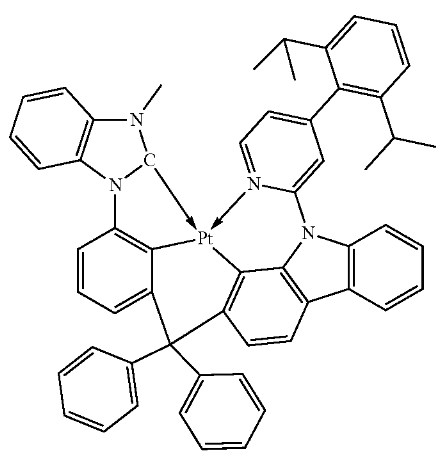

-continued
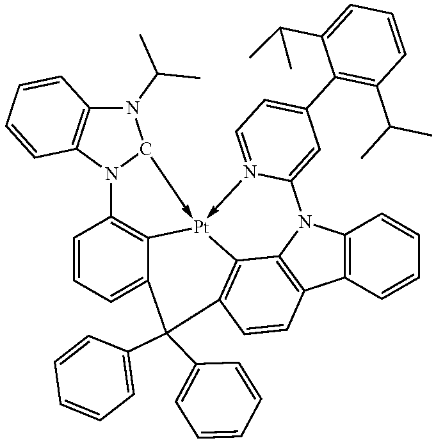
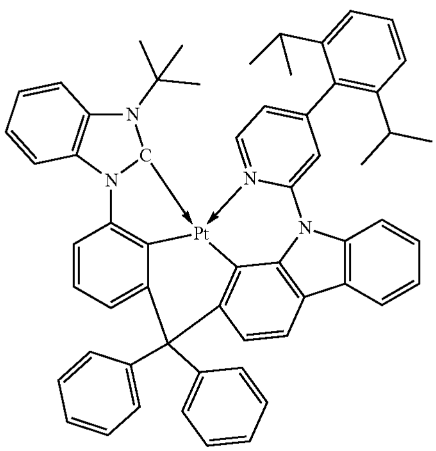
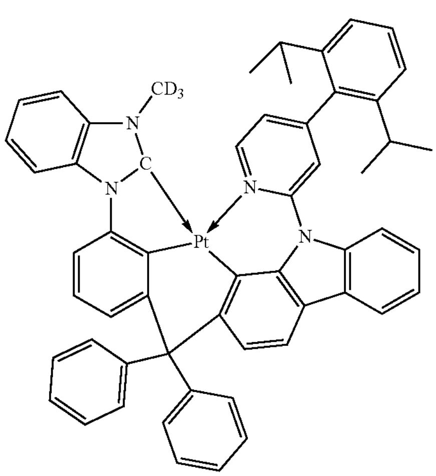
-continued
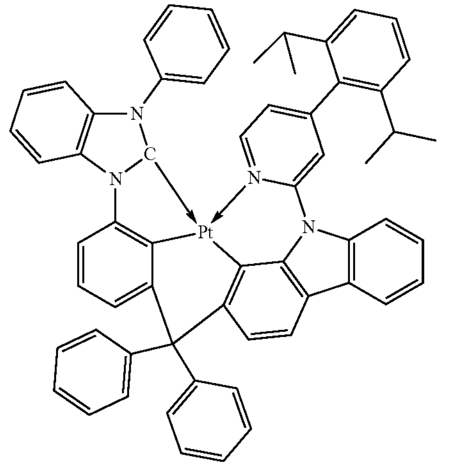
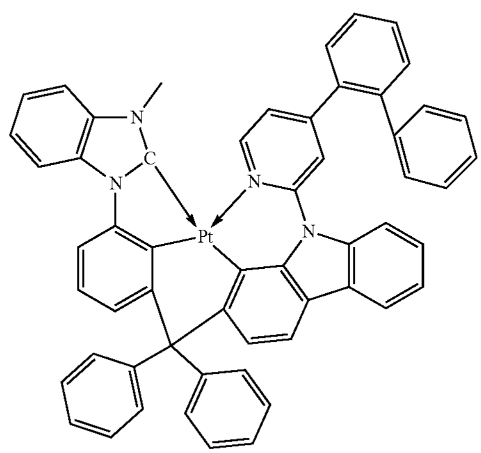
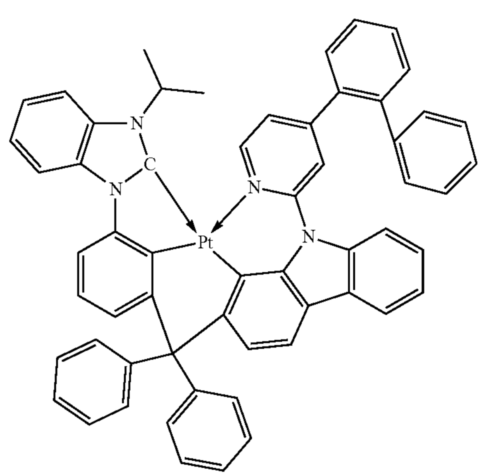

-continued
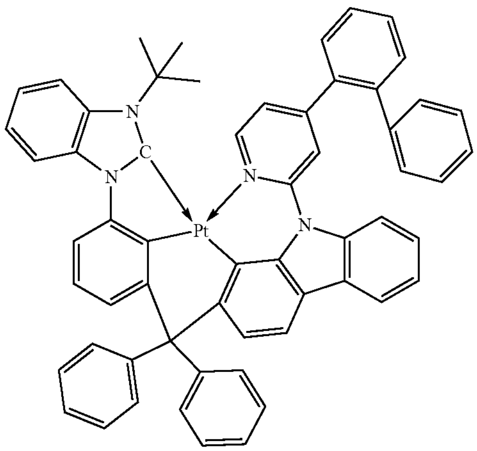
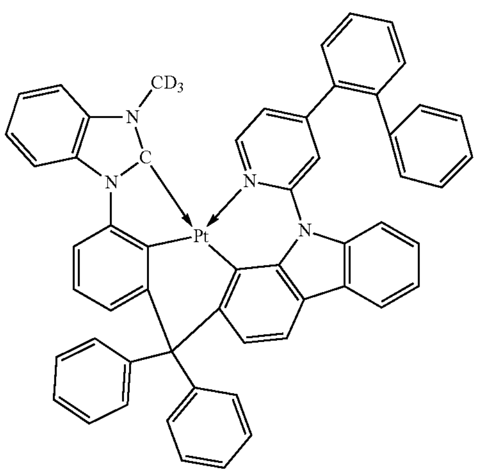
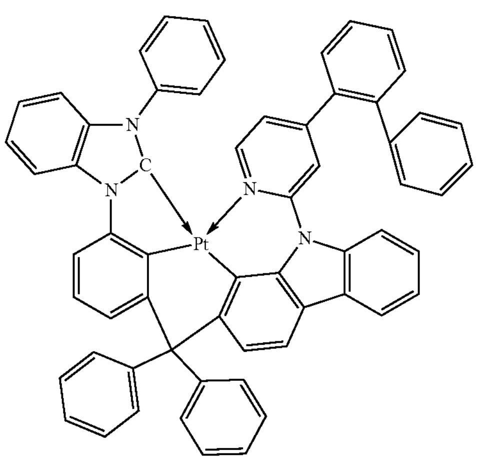
-continued
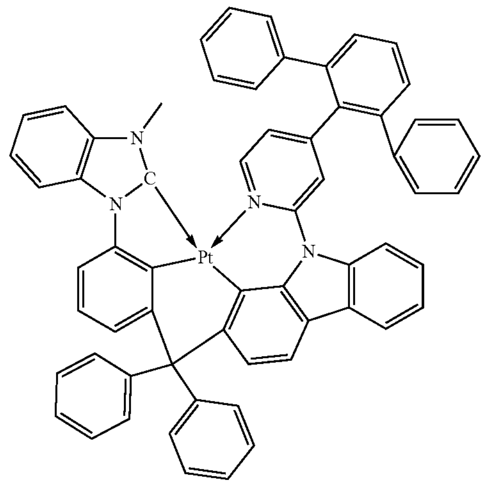
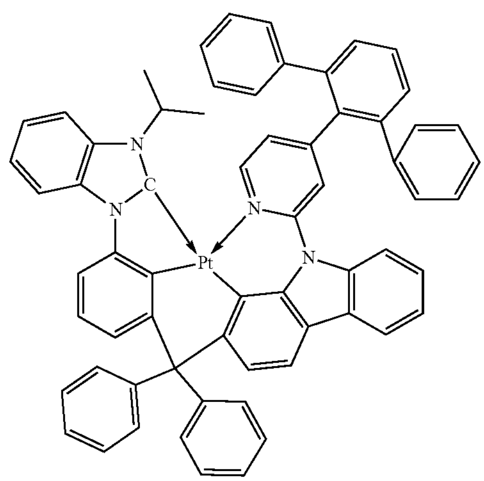
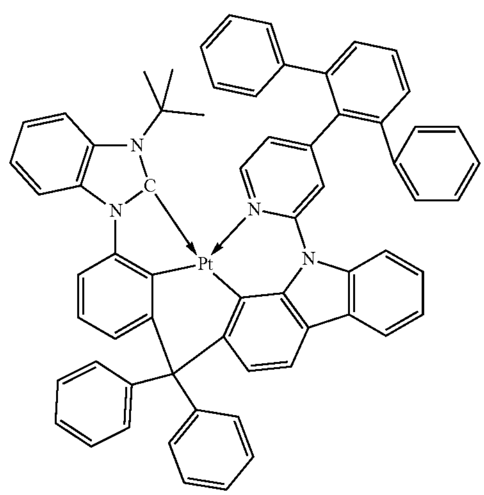

-continued
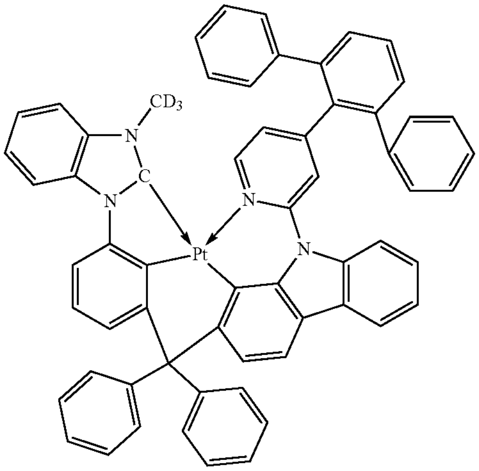
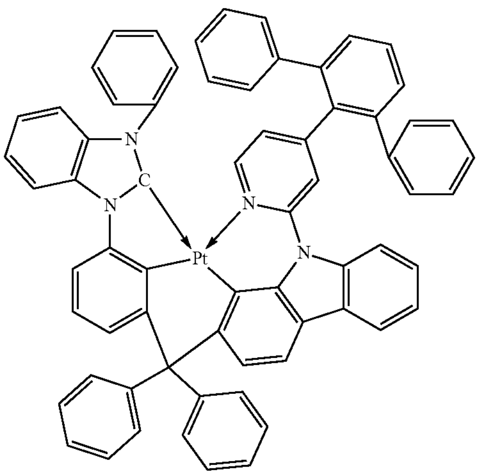
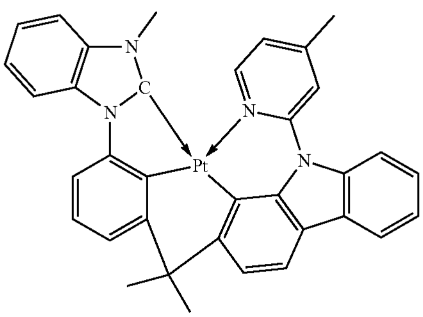
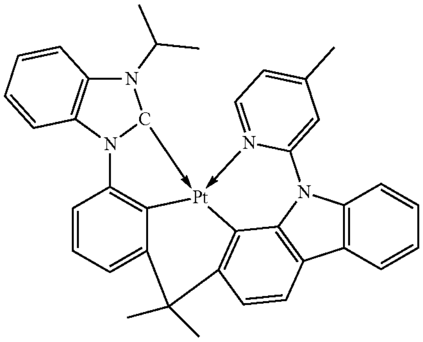
-continued
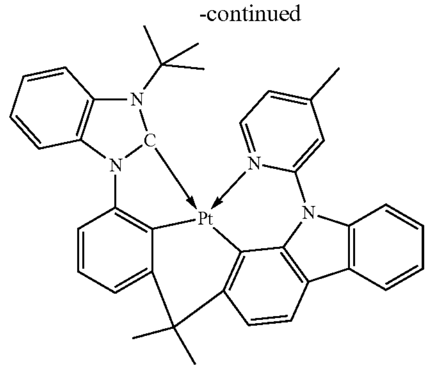
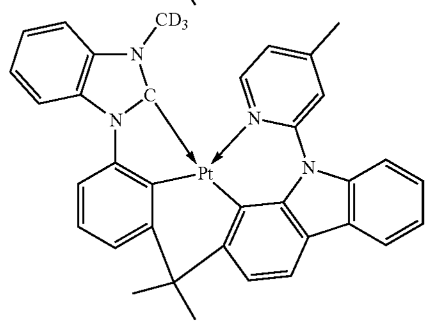
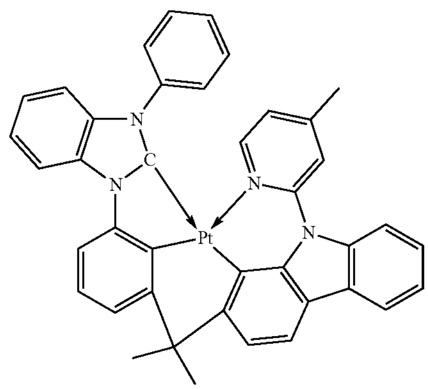
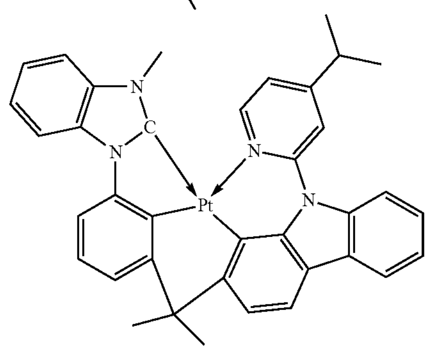
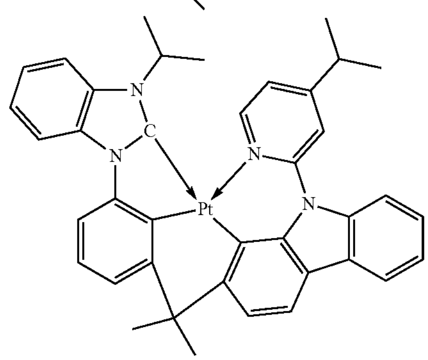

-continued
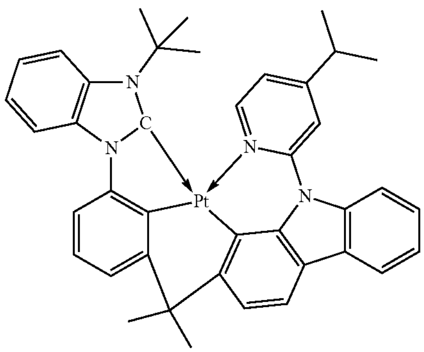
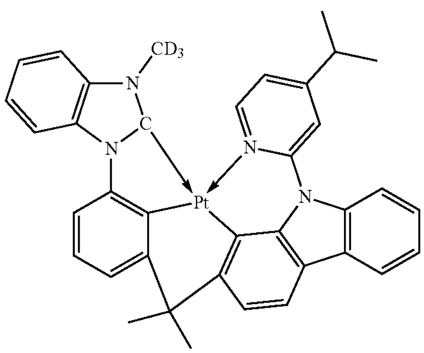
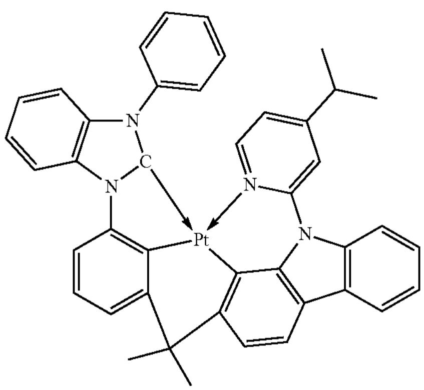
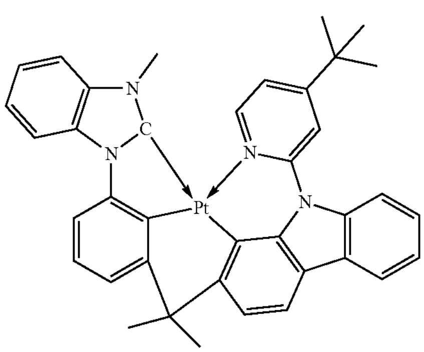
-continued
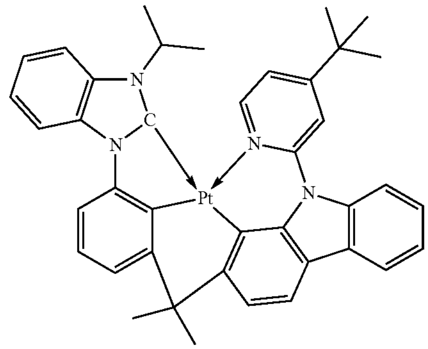
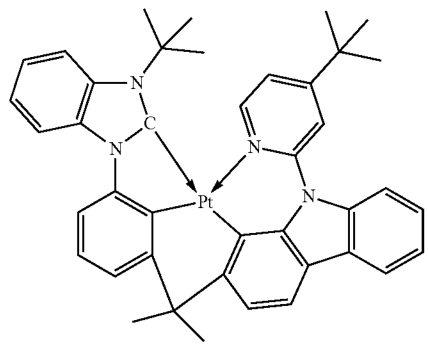
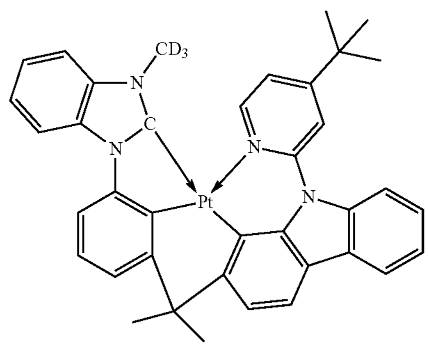
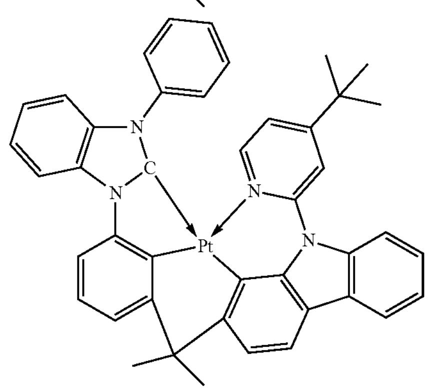
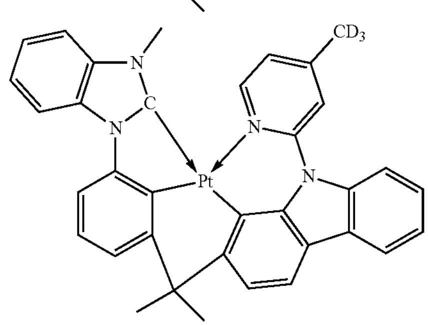

-continued
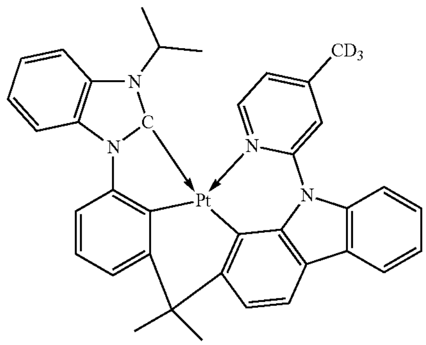
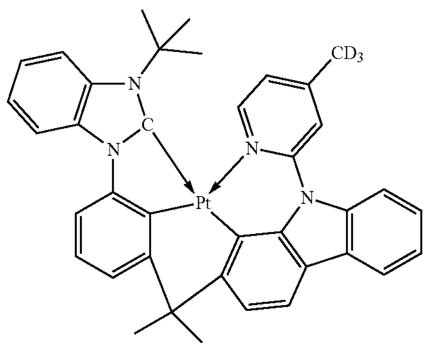
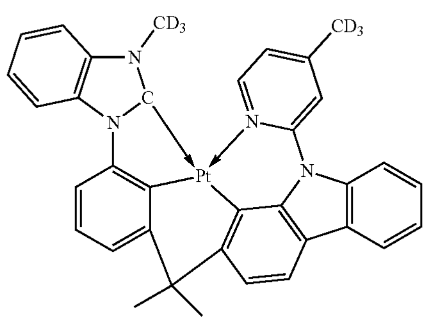
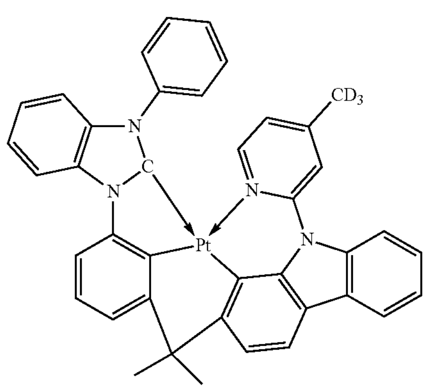
-continued
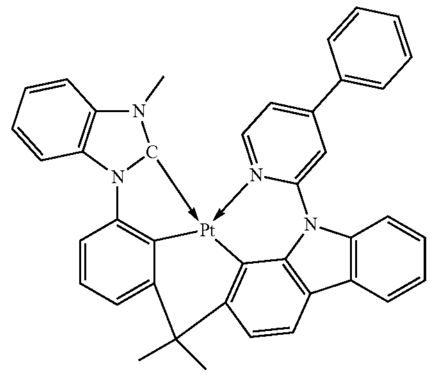
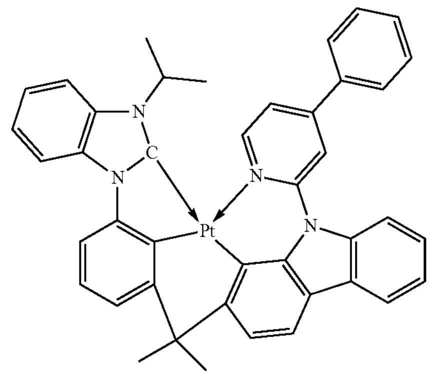
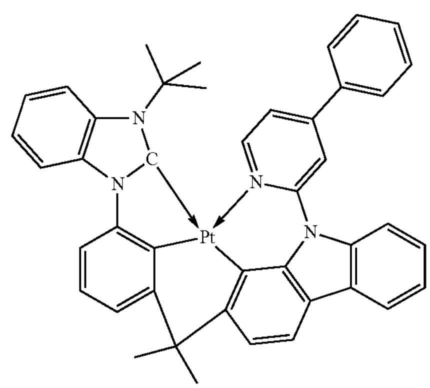
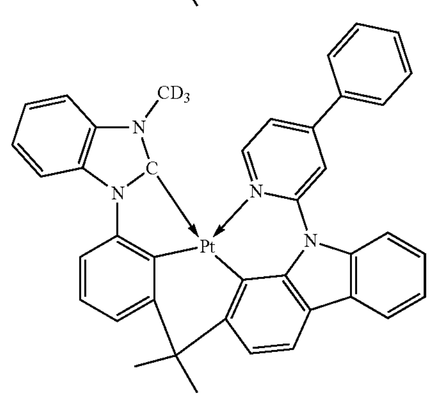

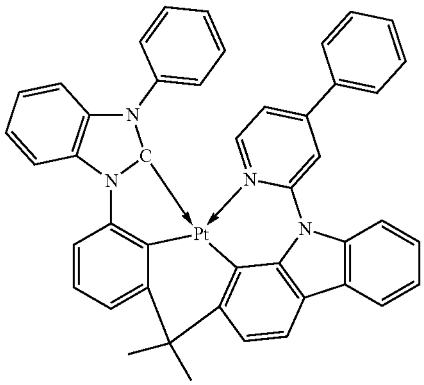
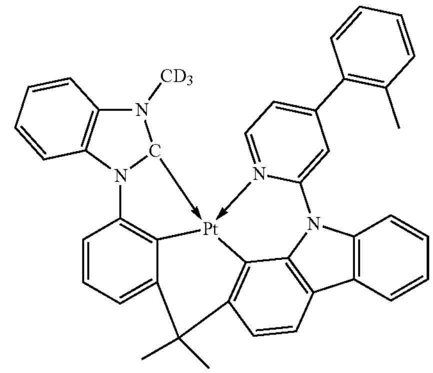
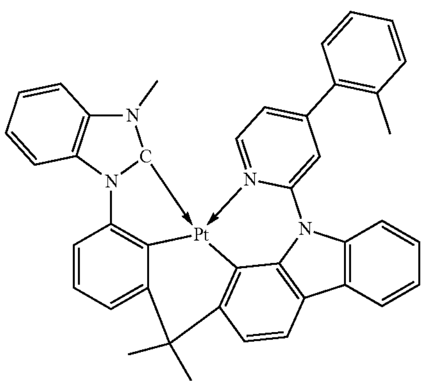
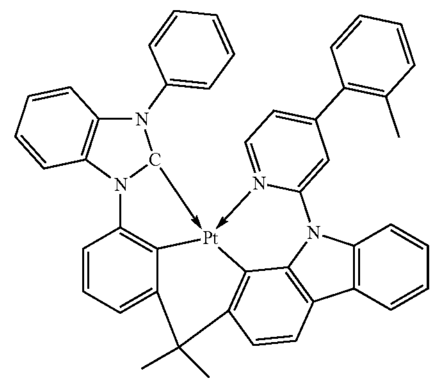
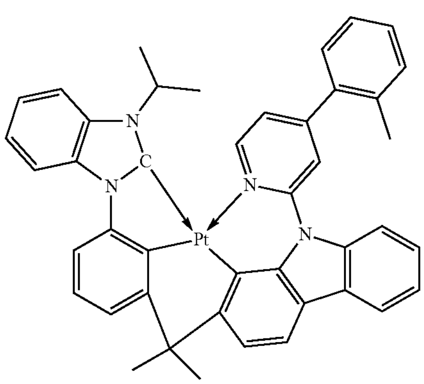
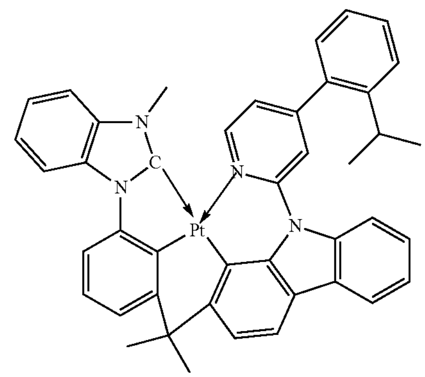
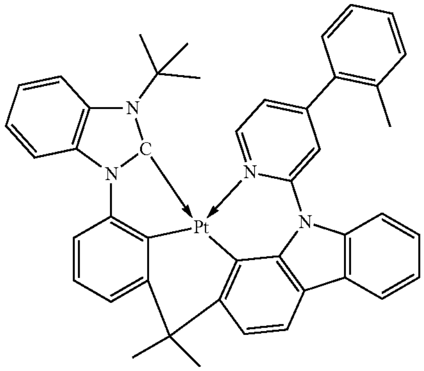
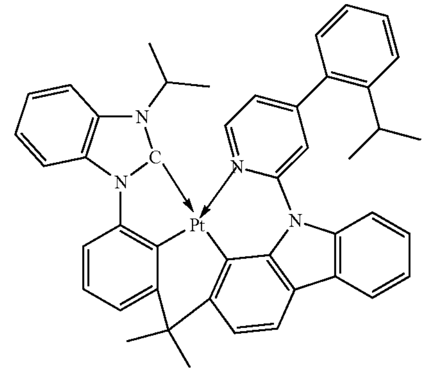

-continued
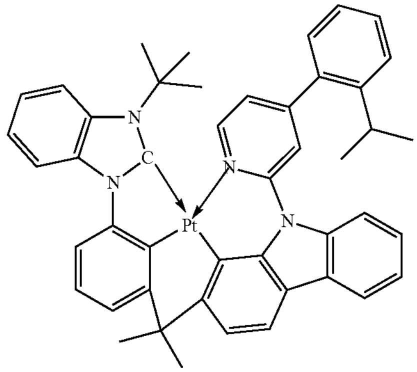
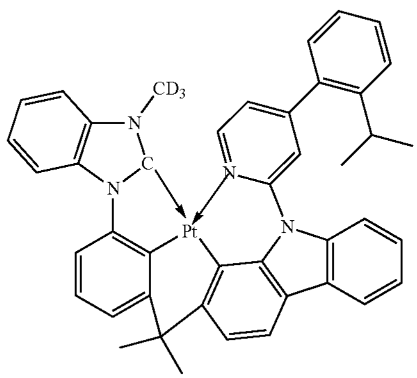
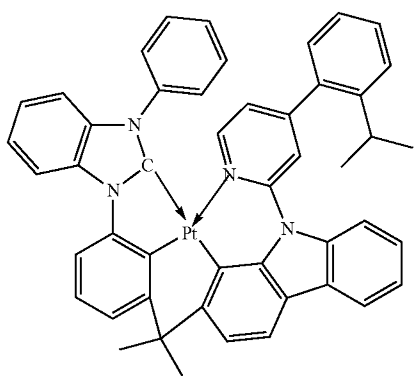
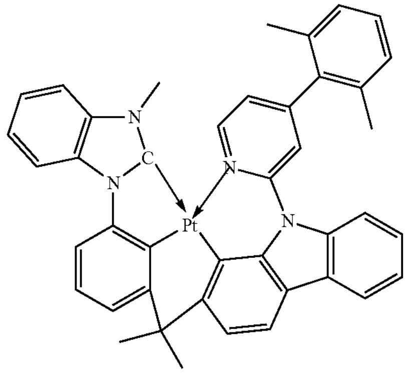
-continued
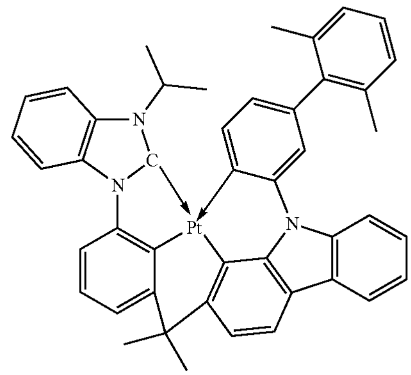
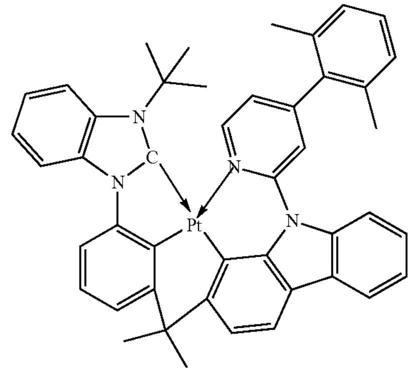
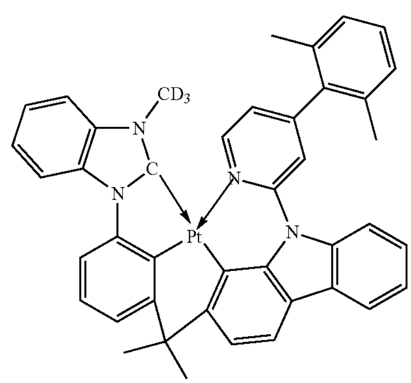
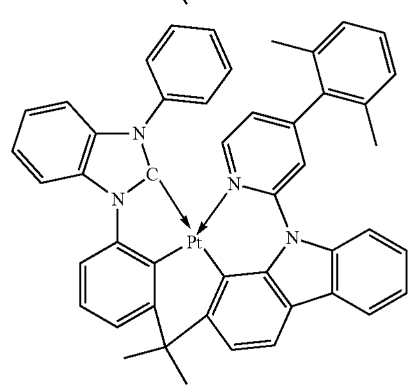

-continued
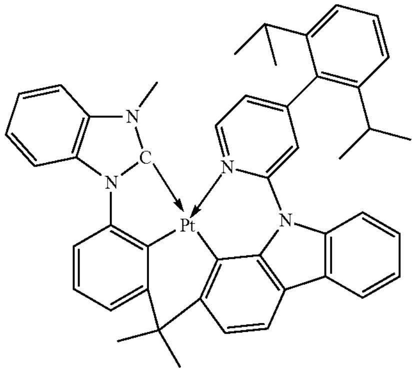
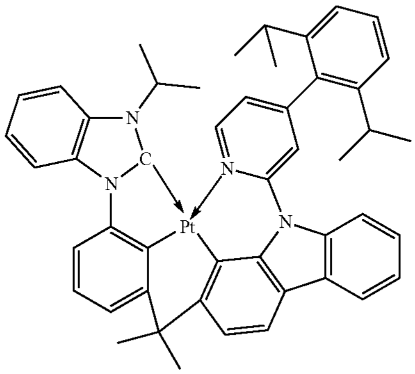
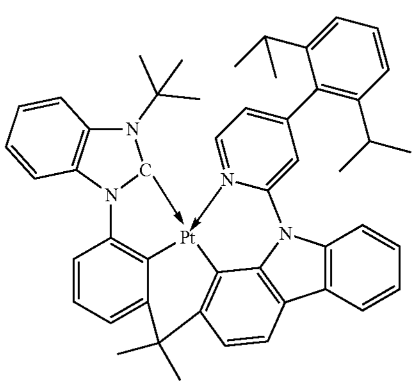
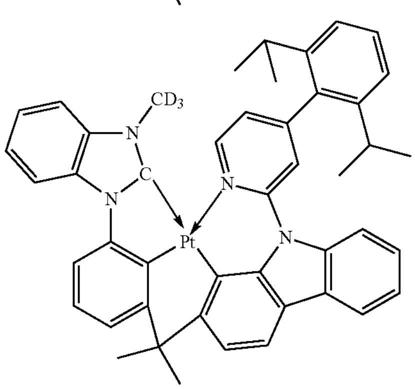
-continued
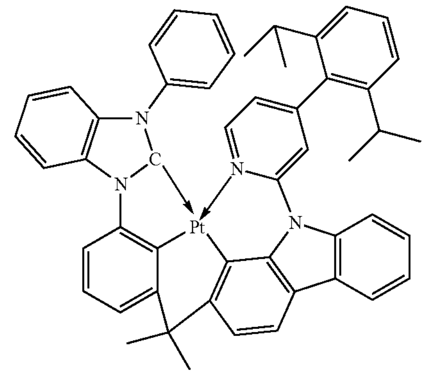
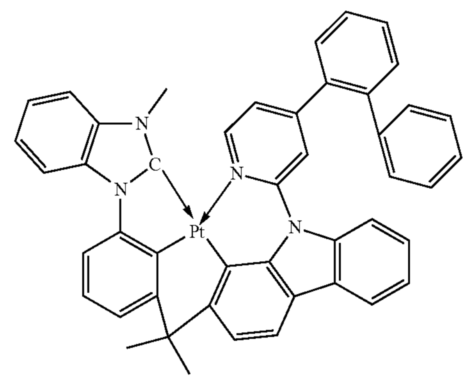
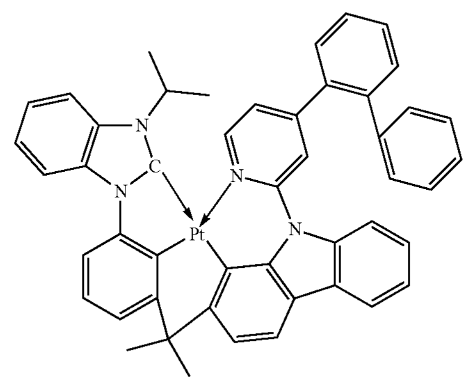
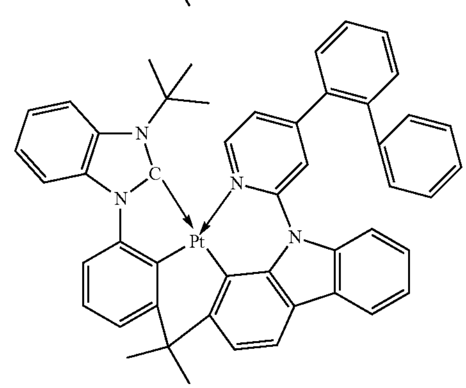

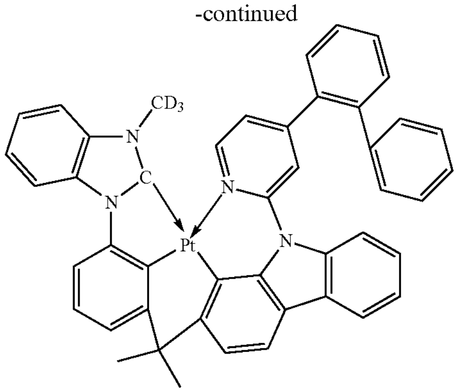
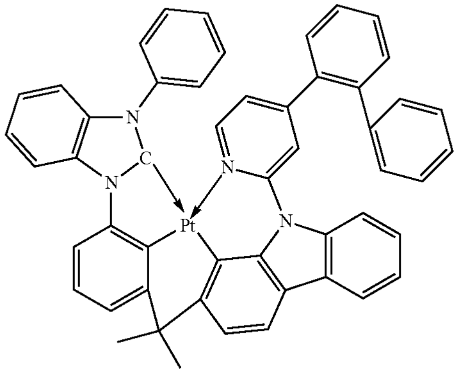
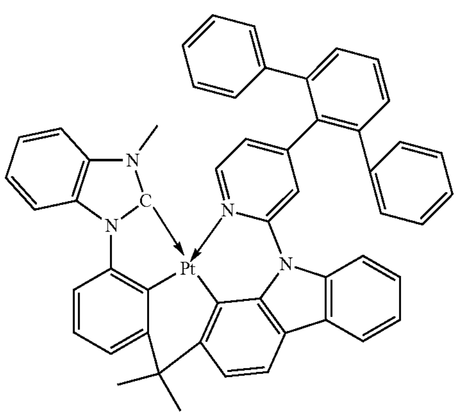
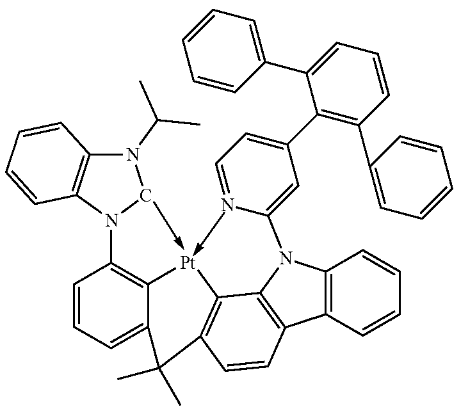
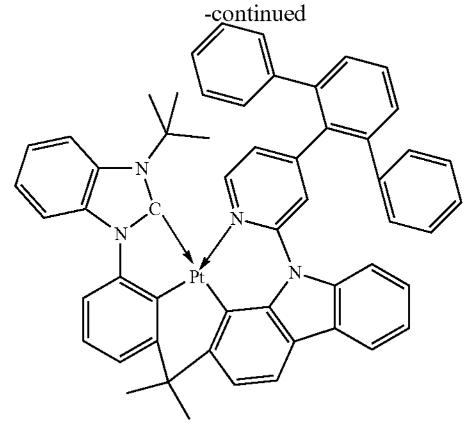
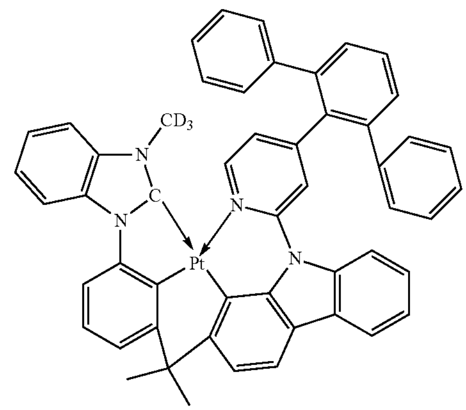
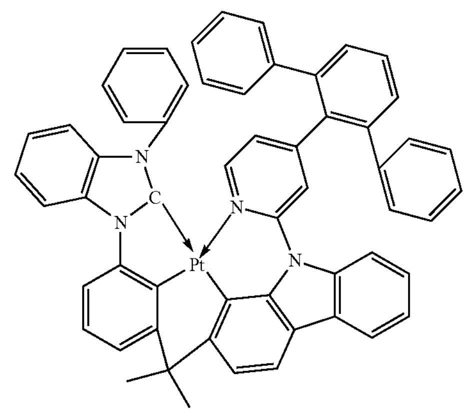
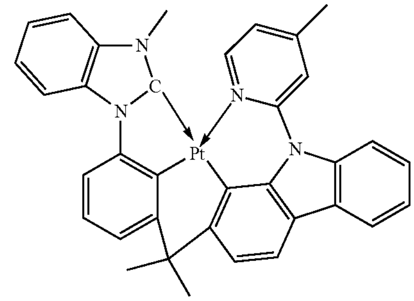

-continued
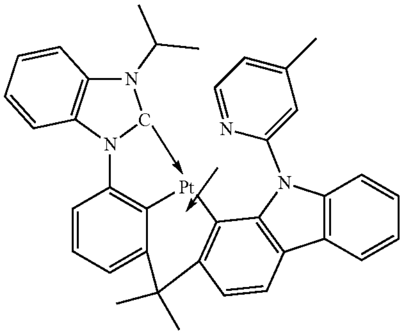
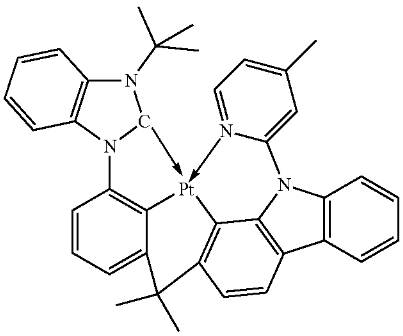
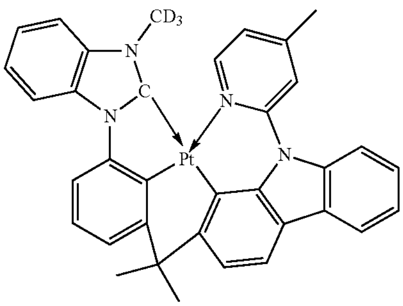
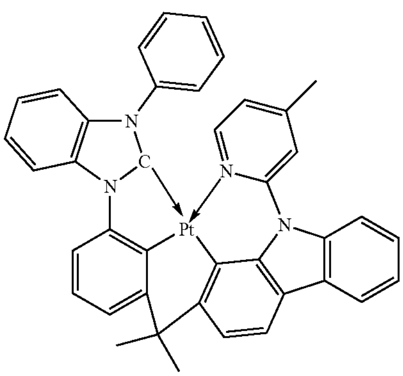
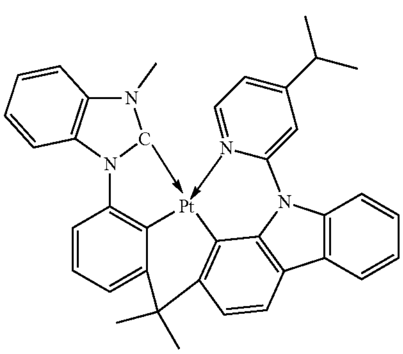
-continued
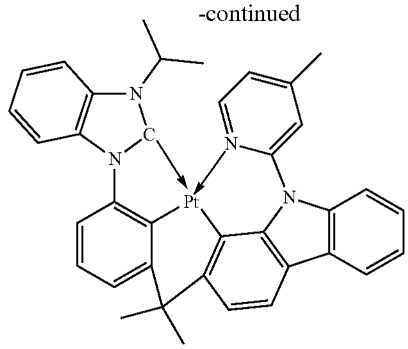
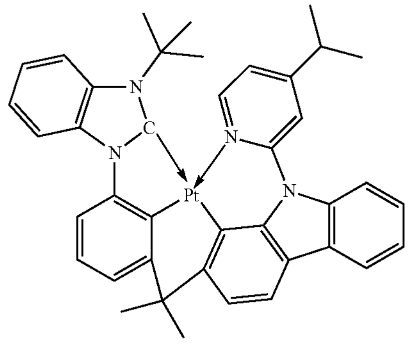
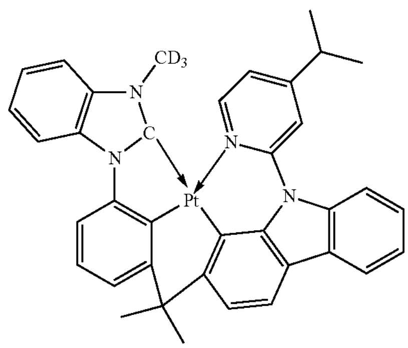
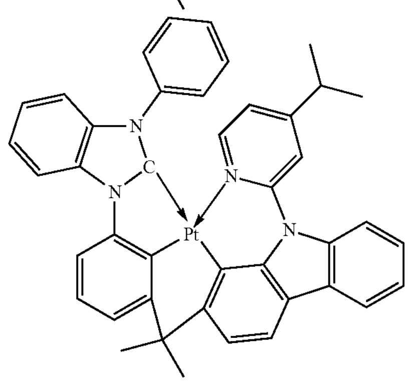
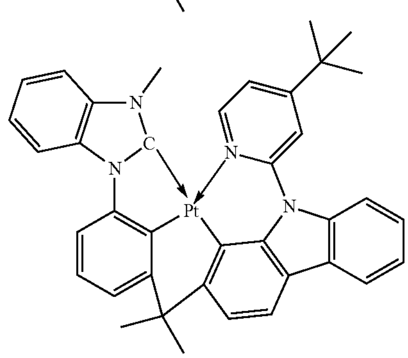

-continued
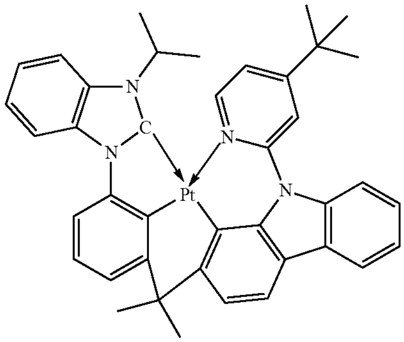
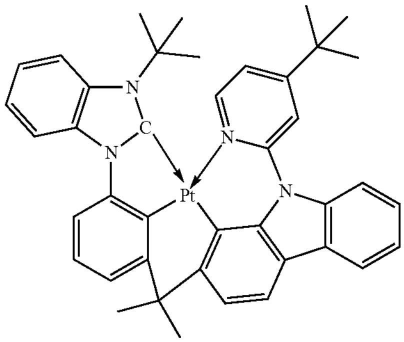
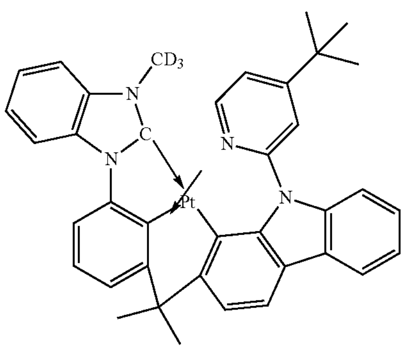
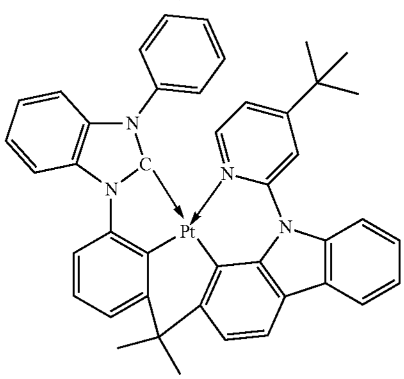
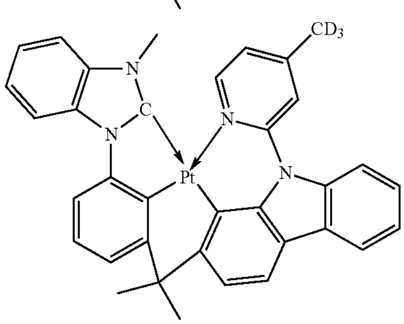
-continued
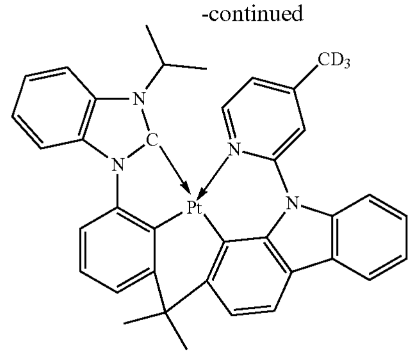
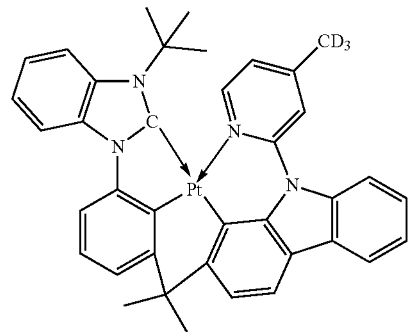
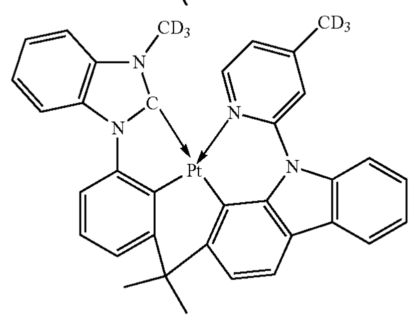
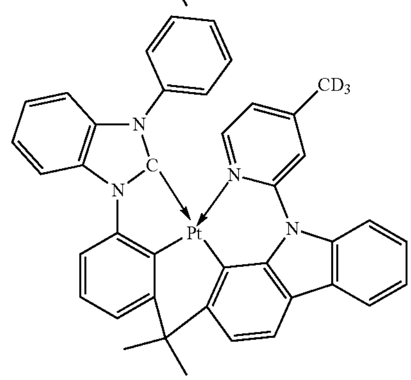
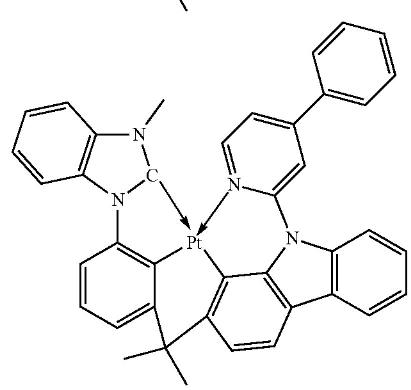

-continued
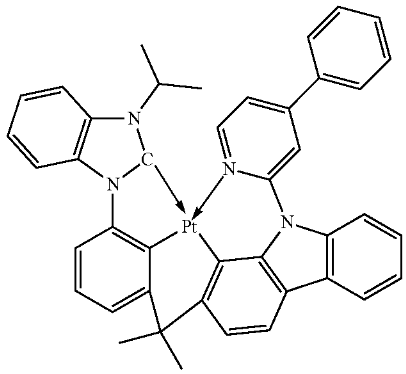
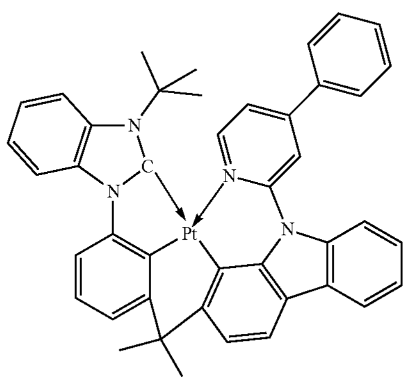
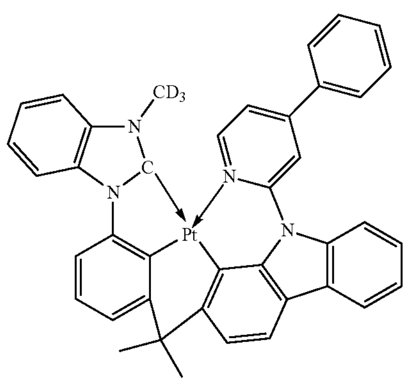
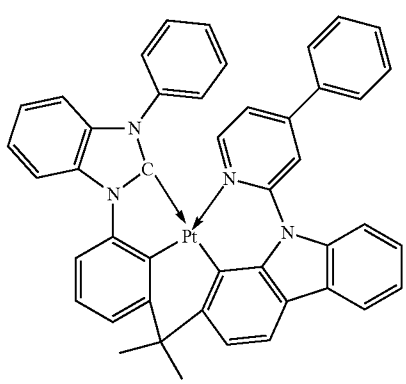
-continued
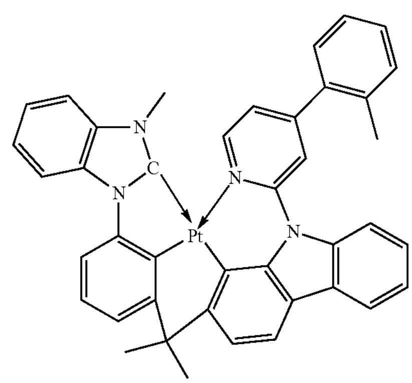
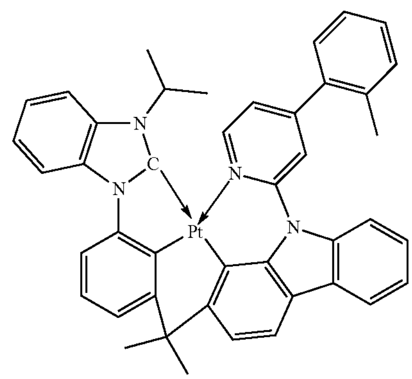
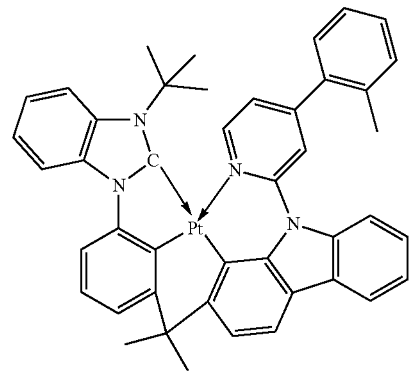
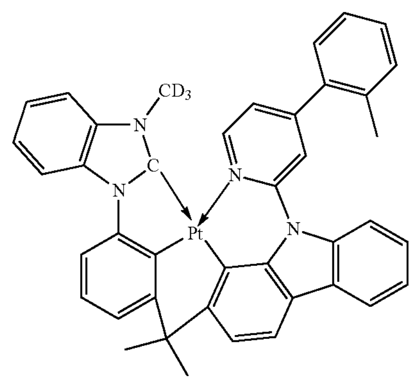

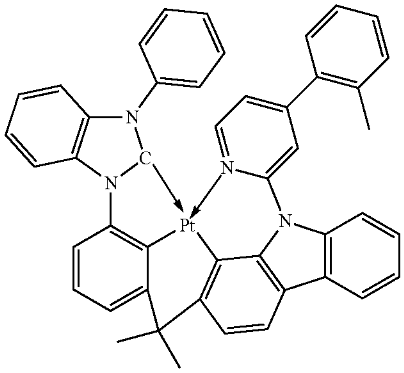
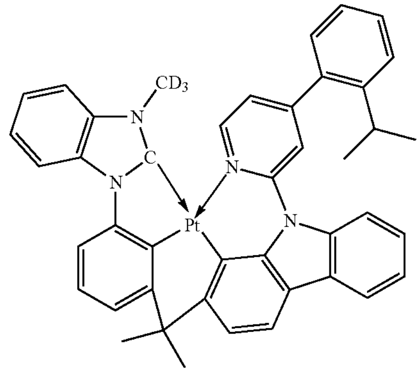
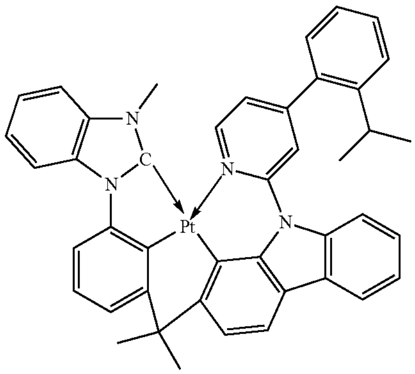
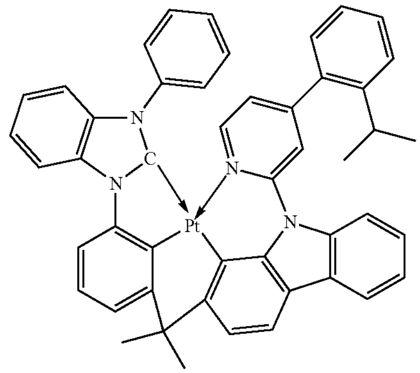
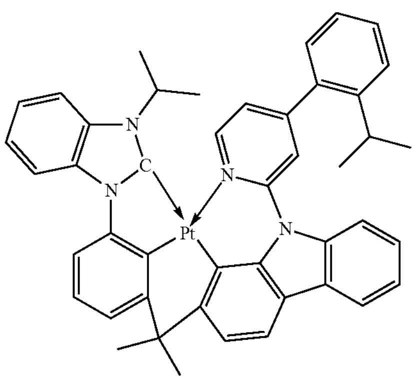
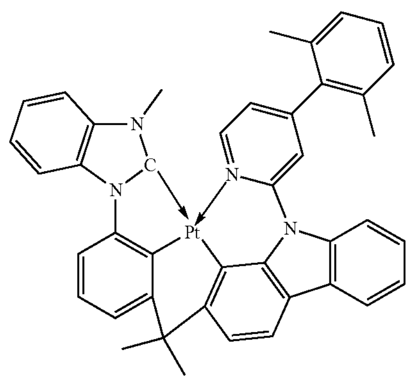
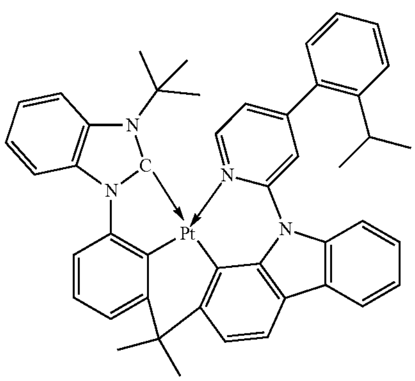
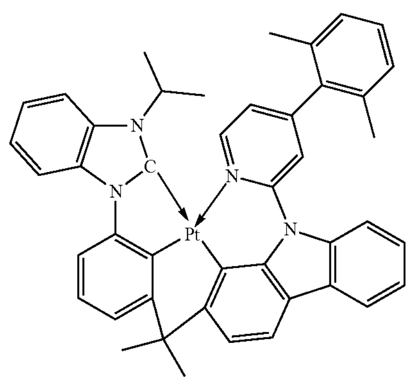

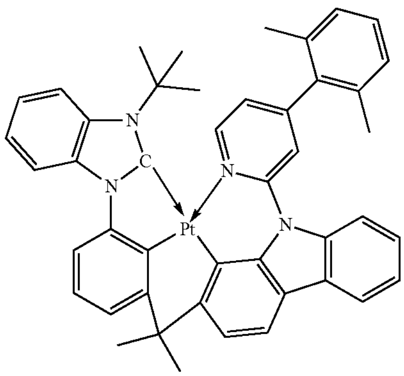
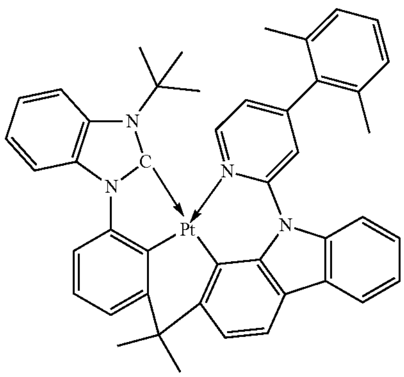
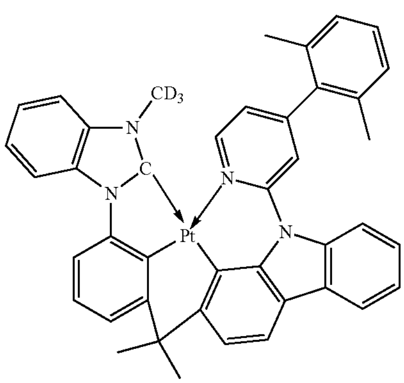
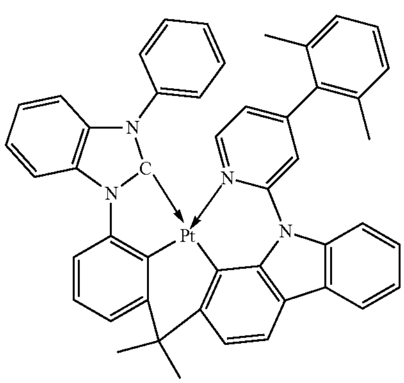
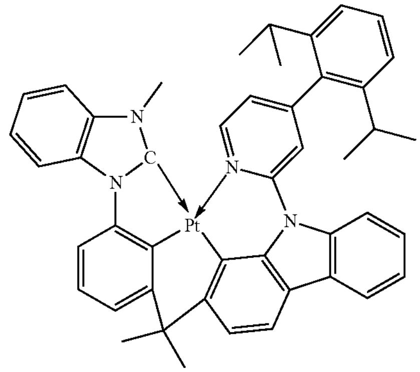
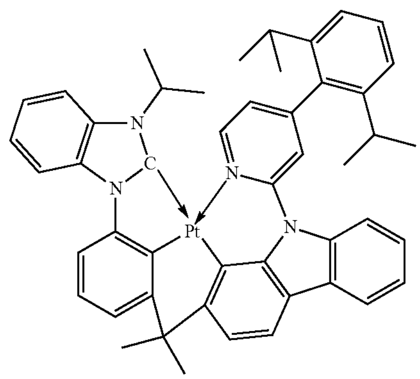
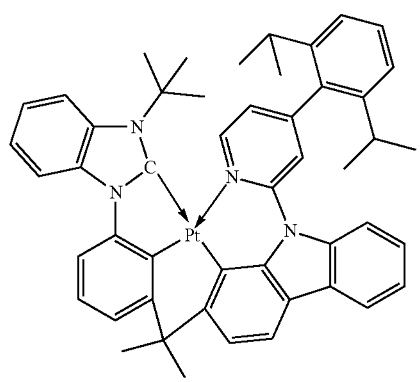
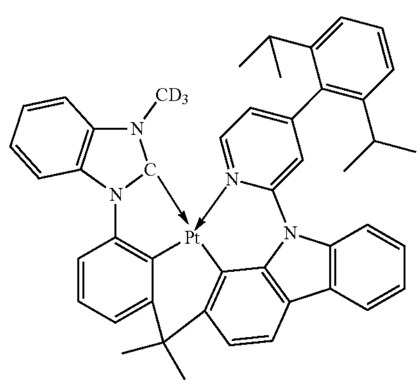

-continued
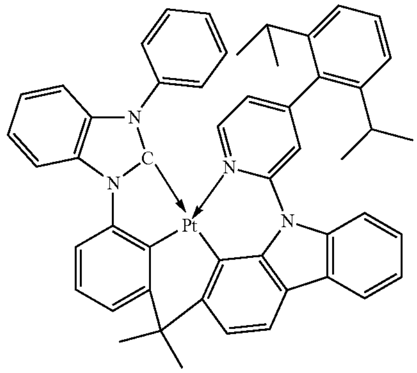
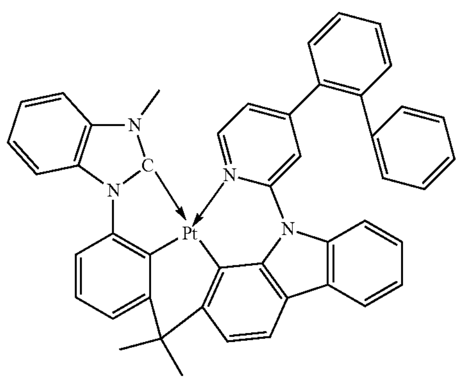
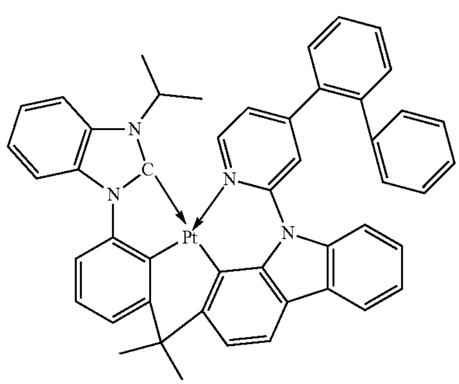
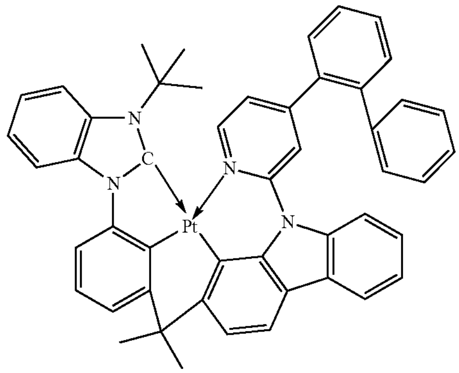
-continued
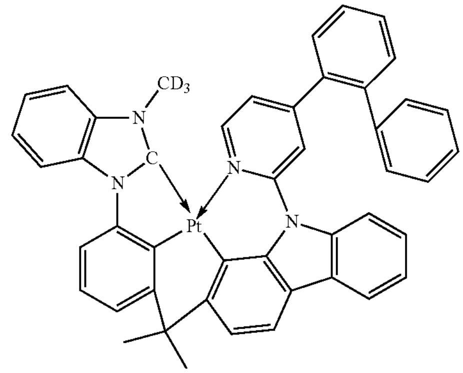
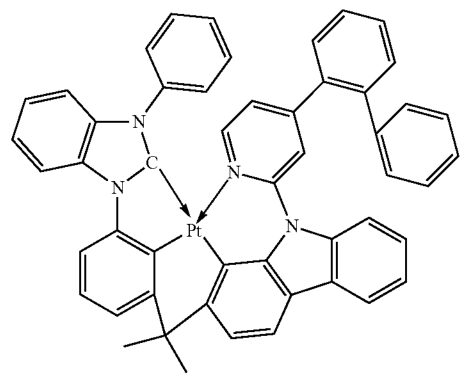
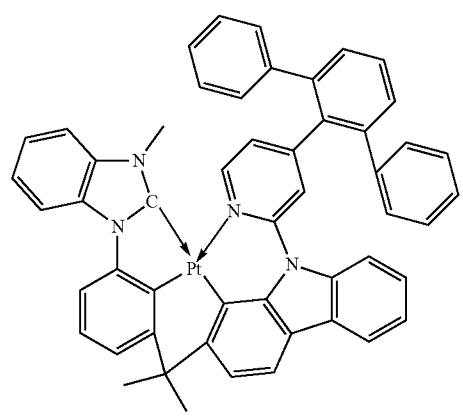
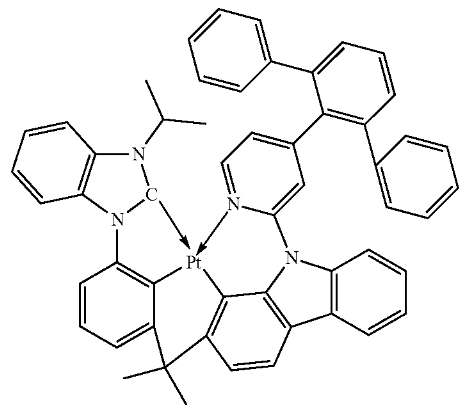

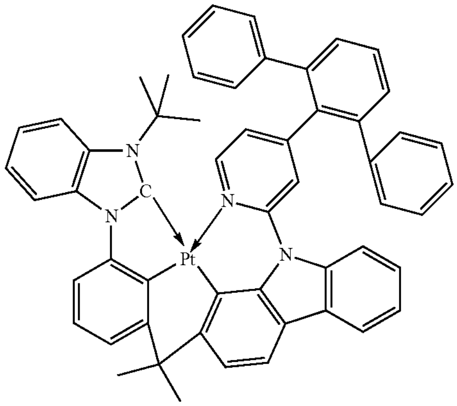
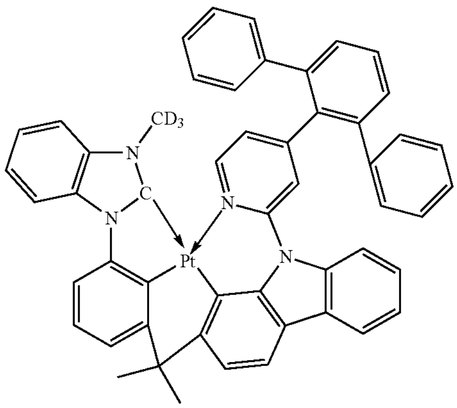
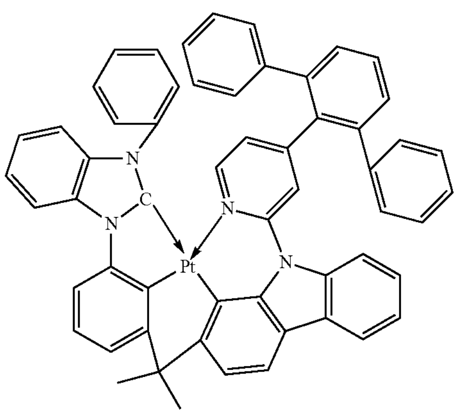
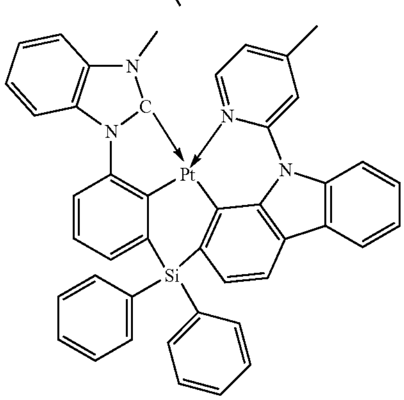
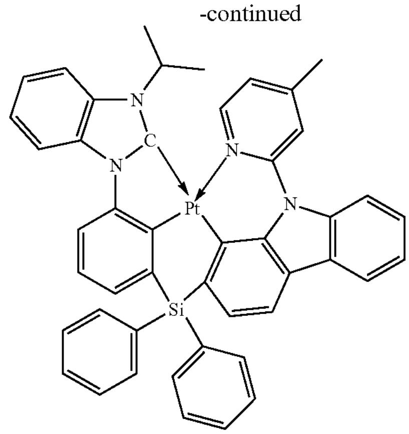
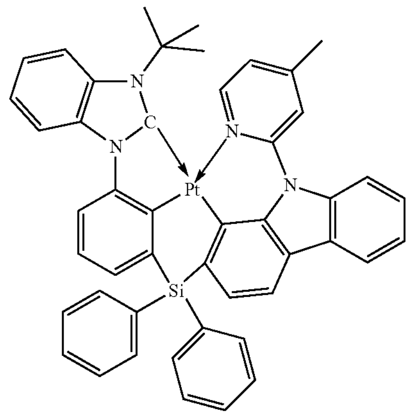
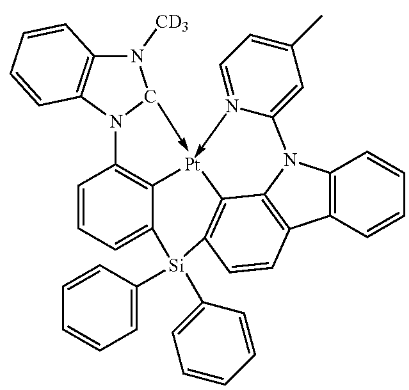
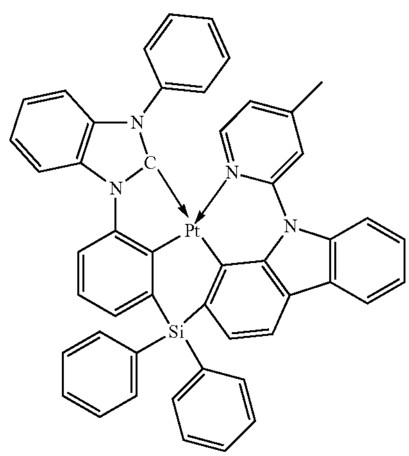

-continued
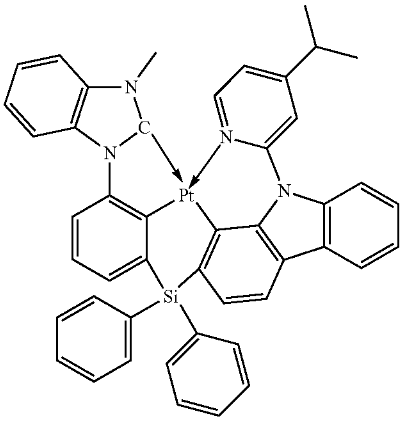
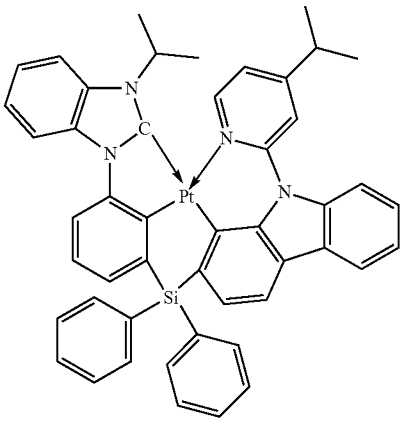
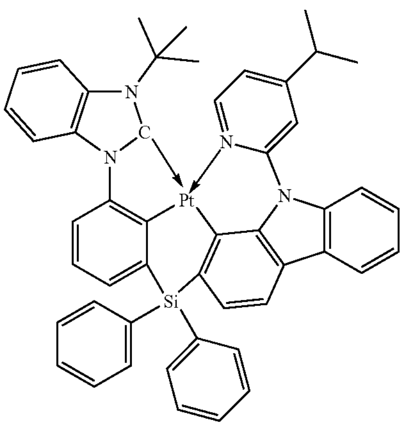
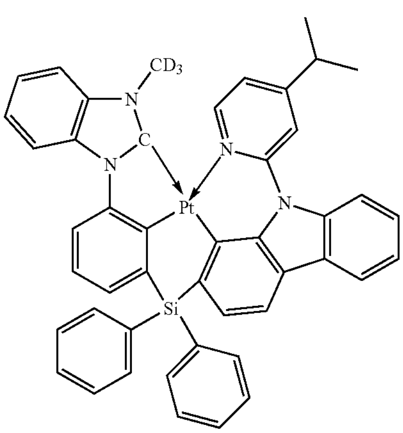
-continued
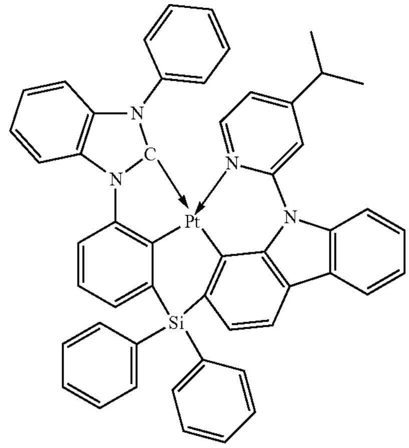
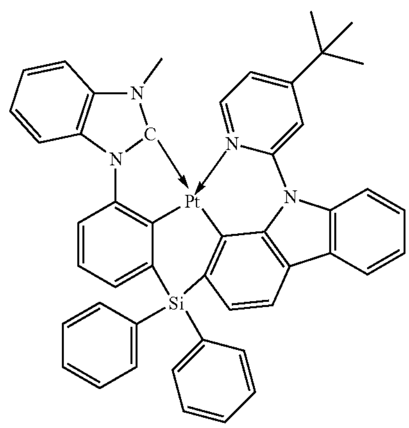
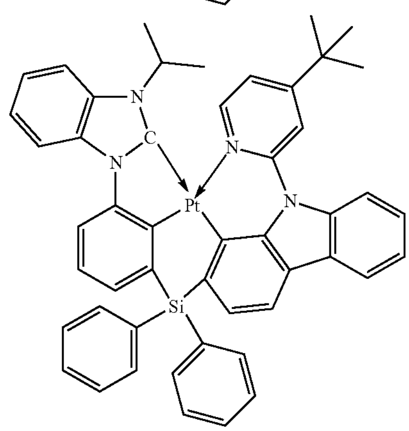
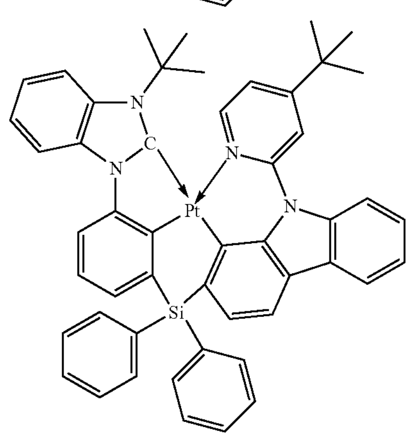

-continued
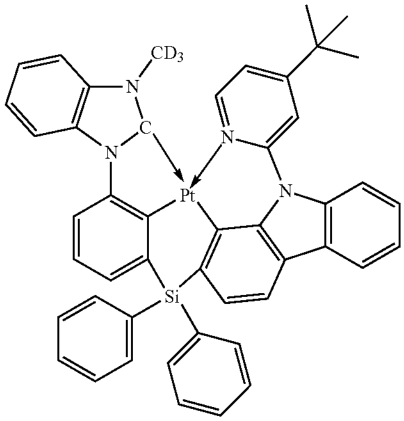
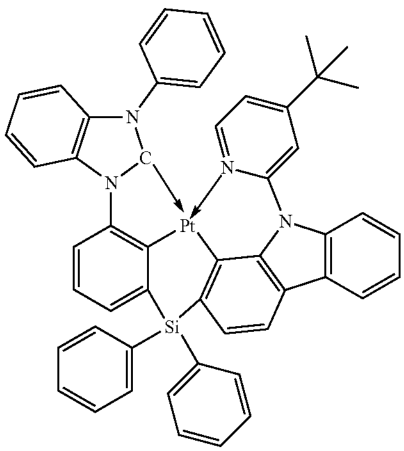
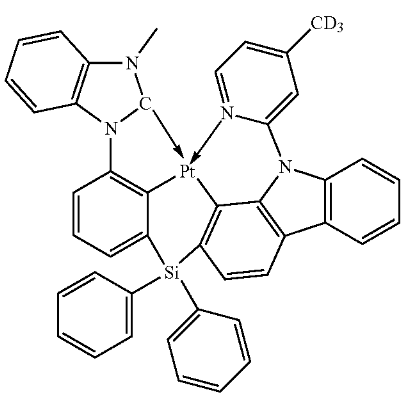
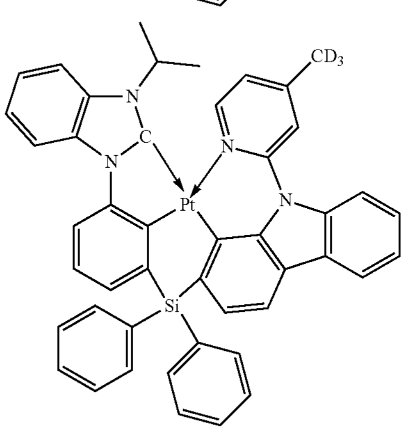
-continued
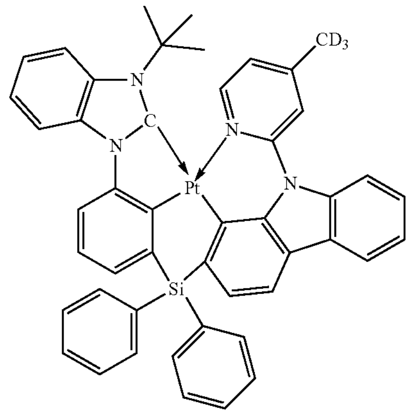
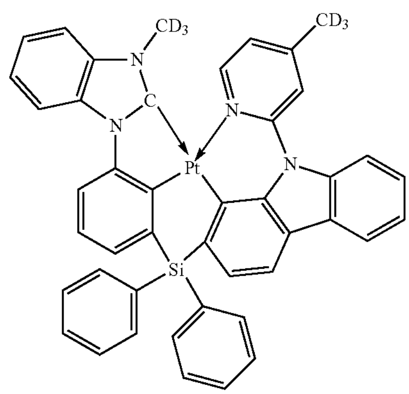
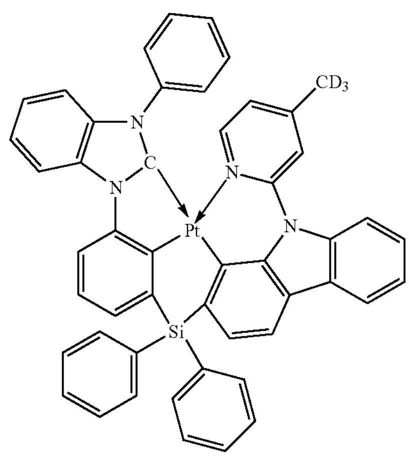
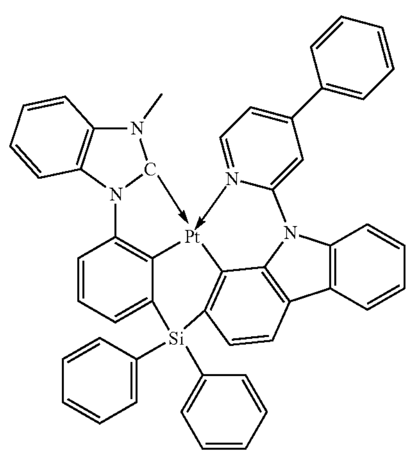

-continued
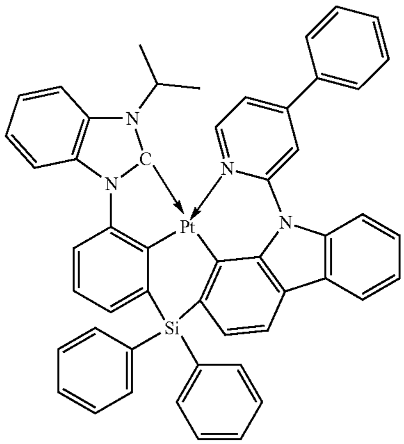
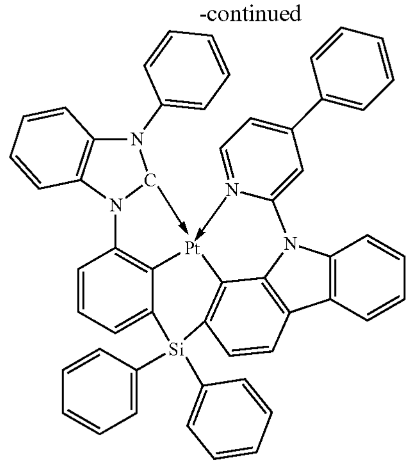
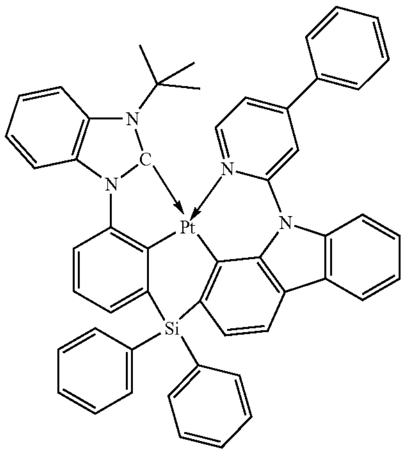
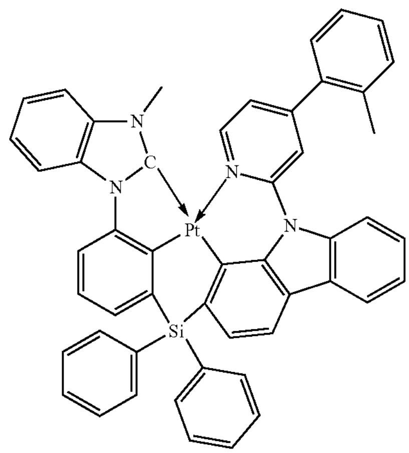
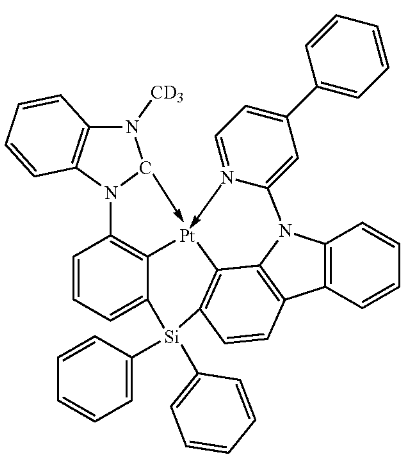
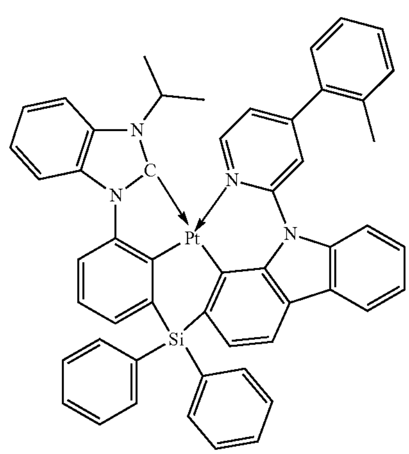

-continued
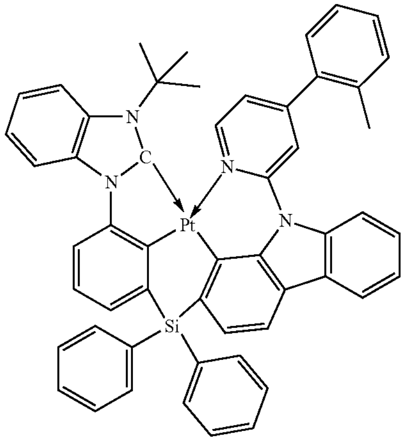
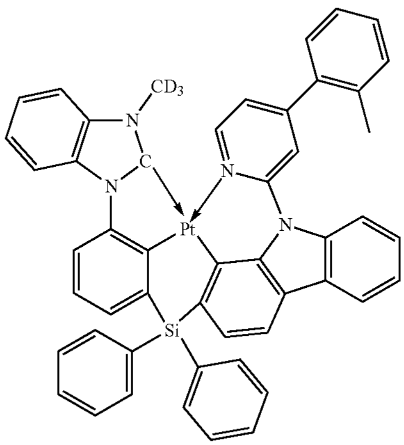
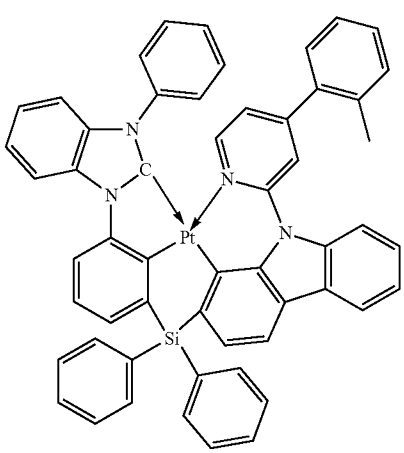
-continued
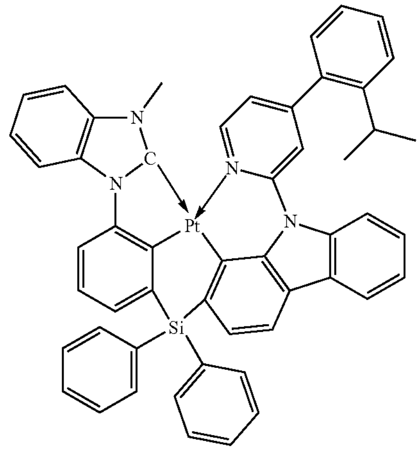
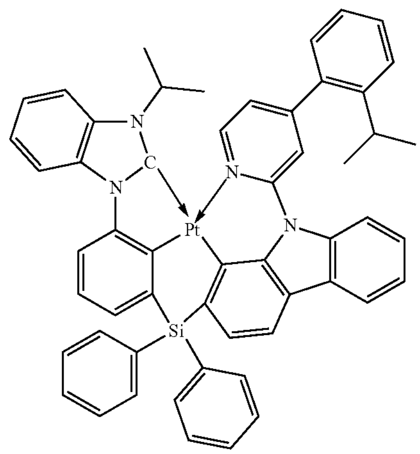
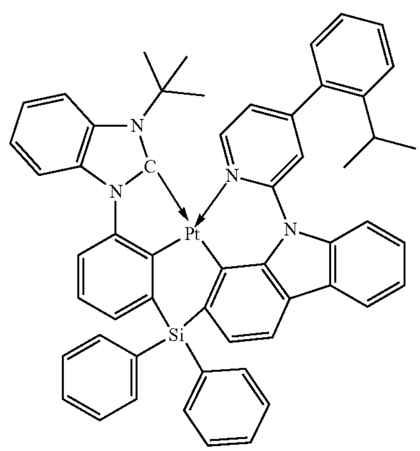

-continued
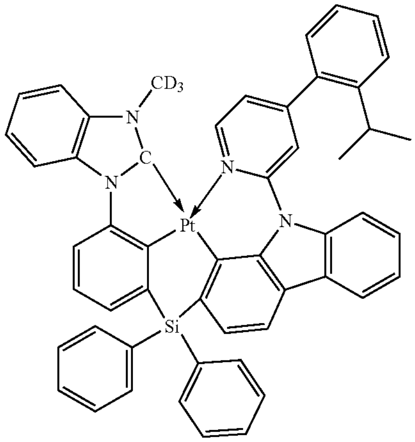
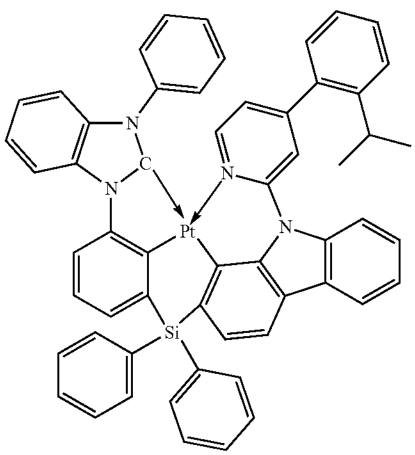
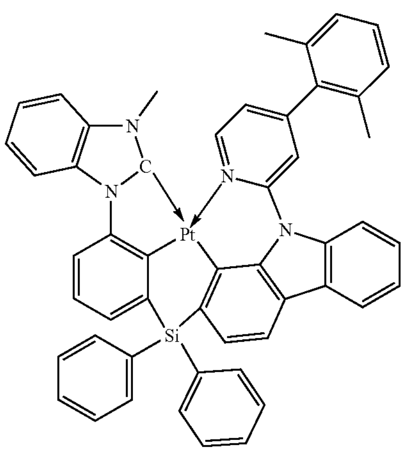
-continued
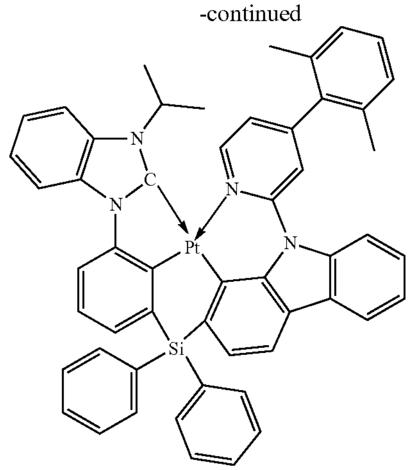
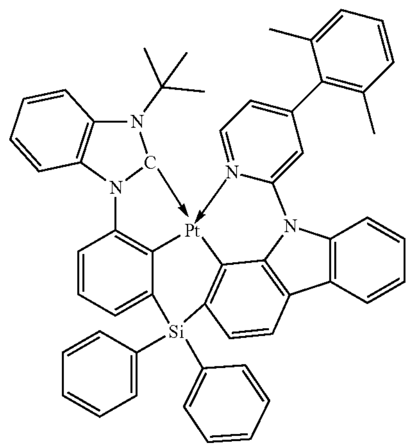
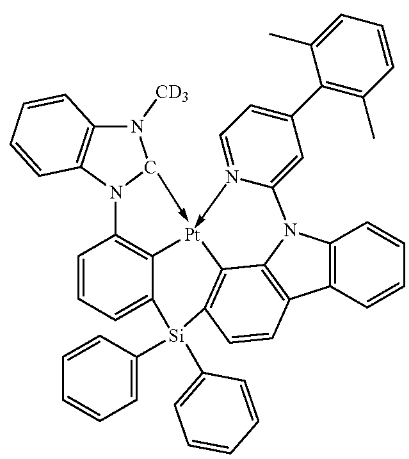

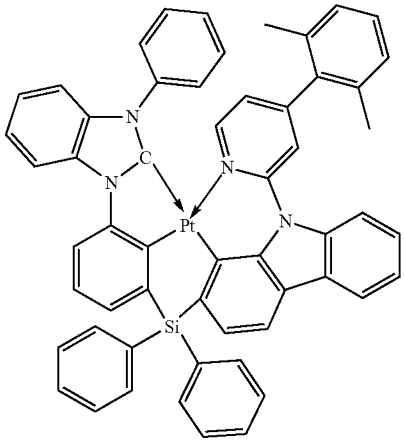
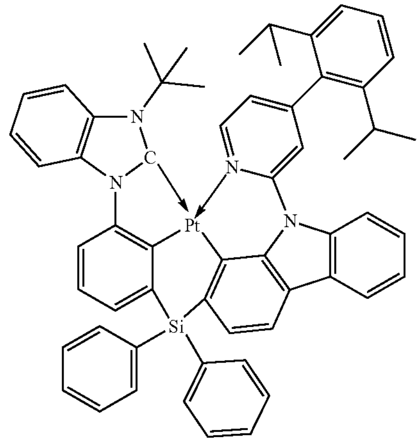
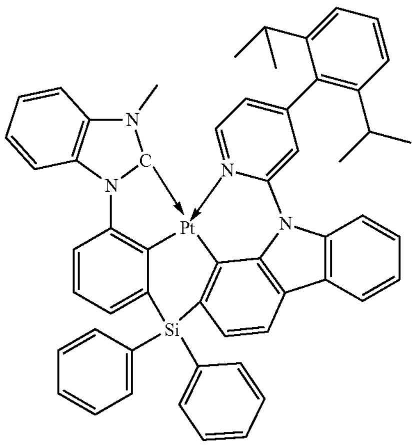
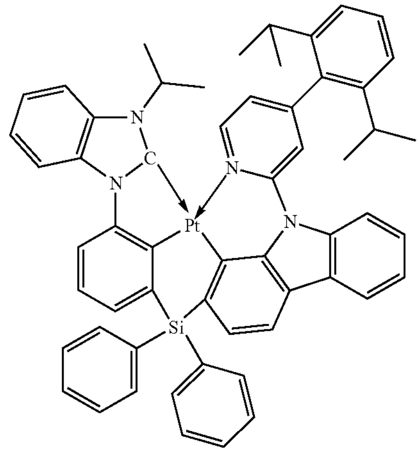
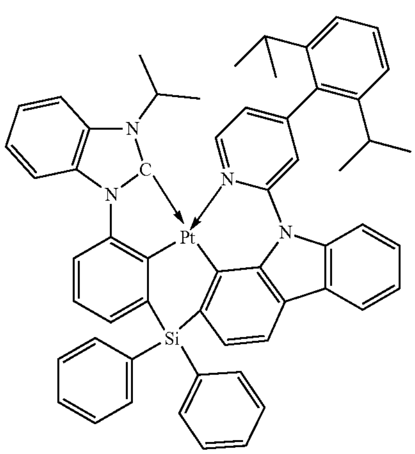
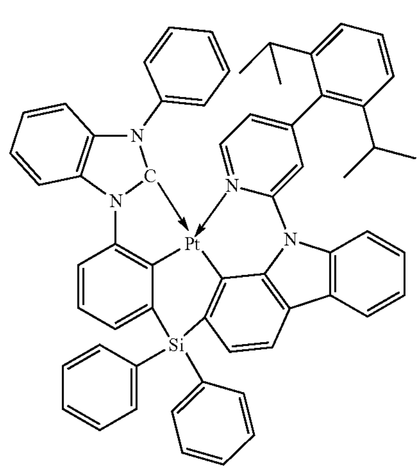

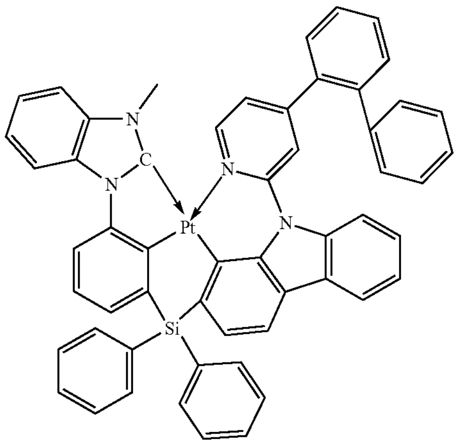
N
C
N
Pt
N
N
Si
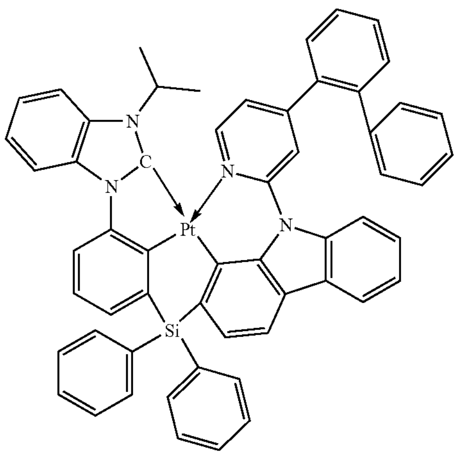
N
C
N
Pt
N
N
Si
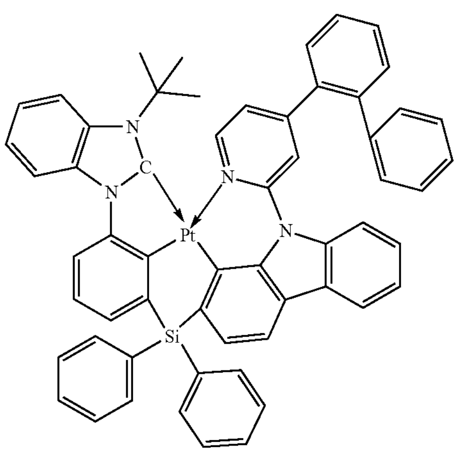
N
C
N
Pt
N
N
Si
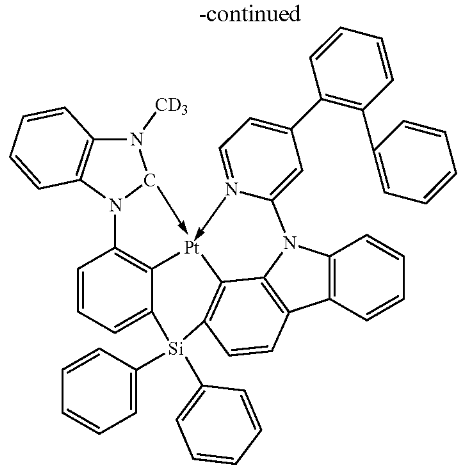
CD3
N
C
N
Pt
N
N
Si
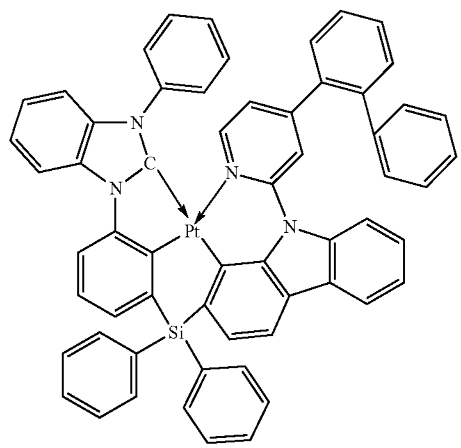
N
C
N
Pt
N
N
Si
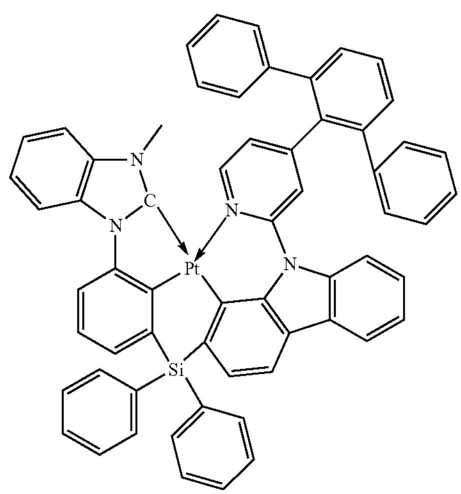
N
C
N
Pt
N
N
Si

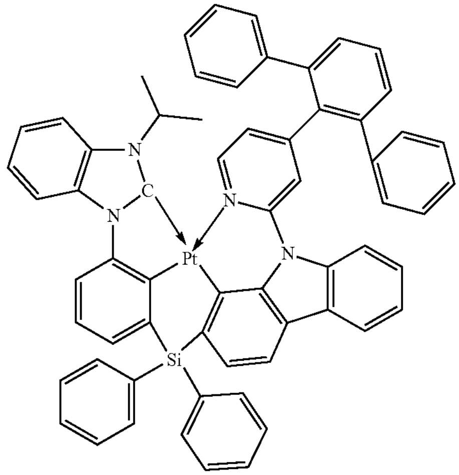
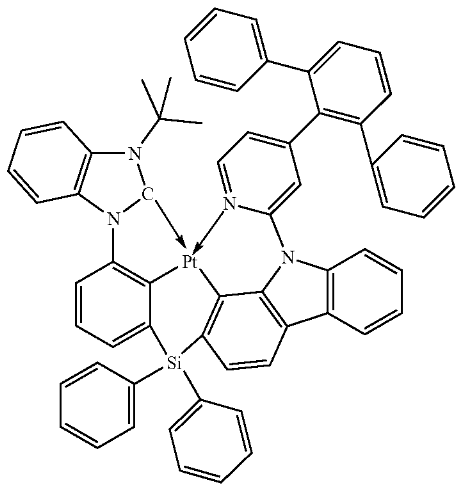
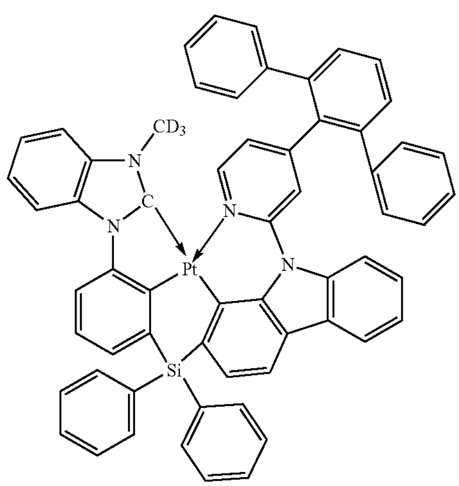
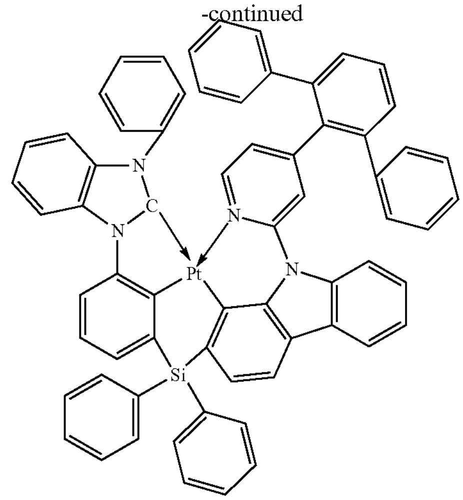
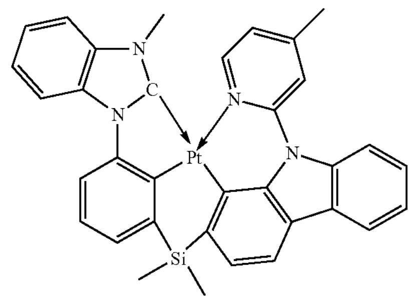
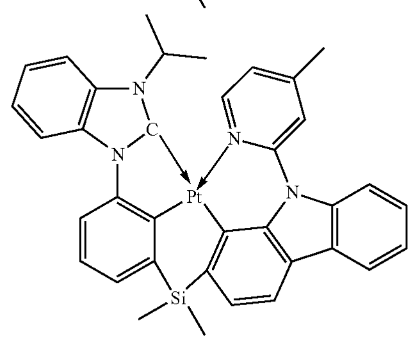
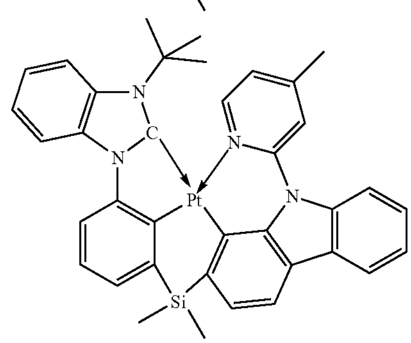
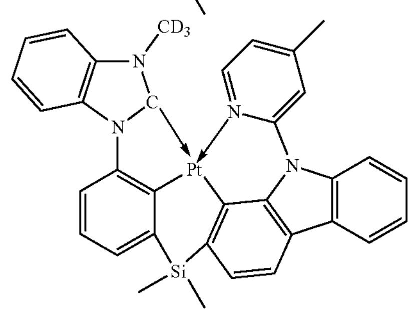

-continued
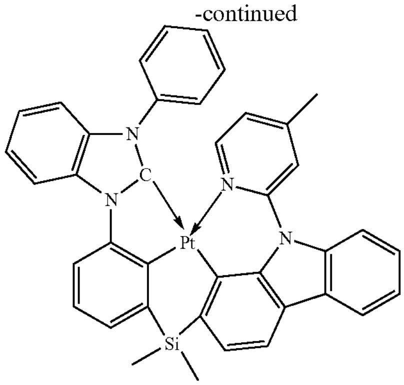
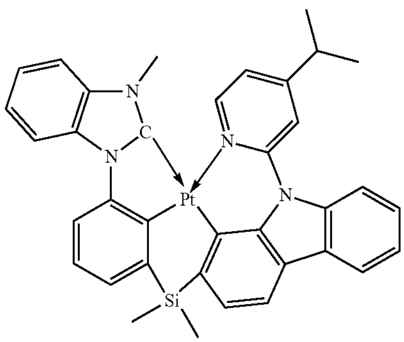
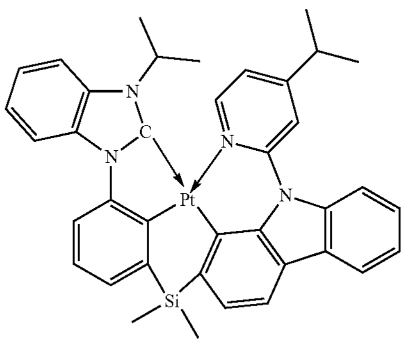
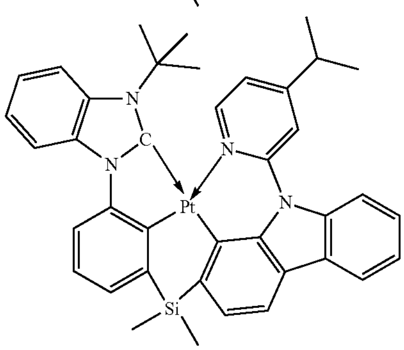
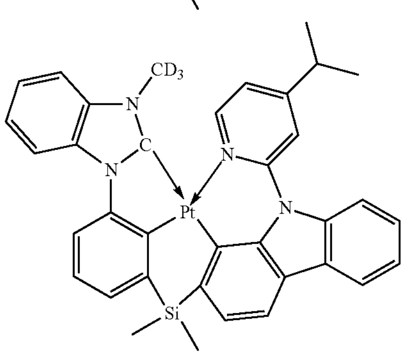
-continued
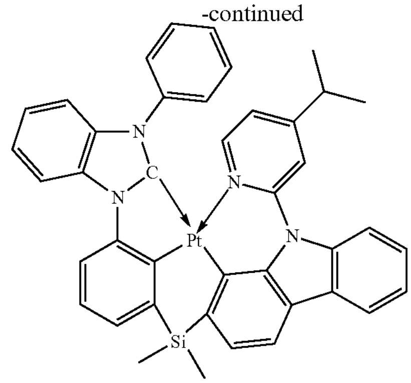
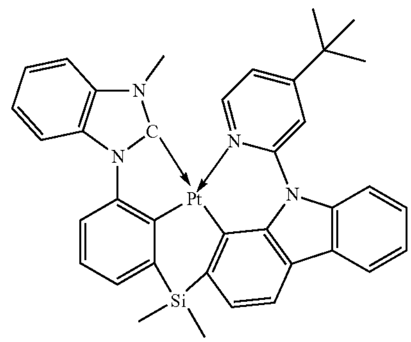
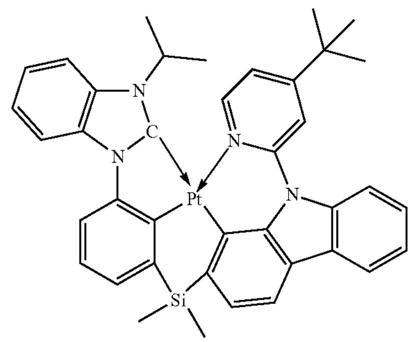
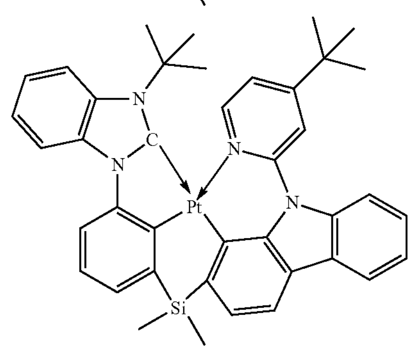
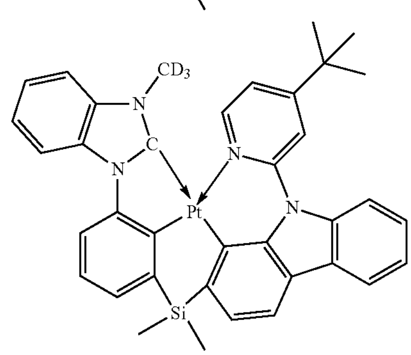

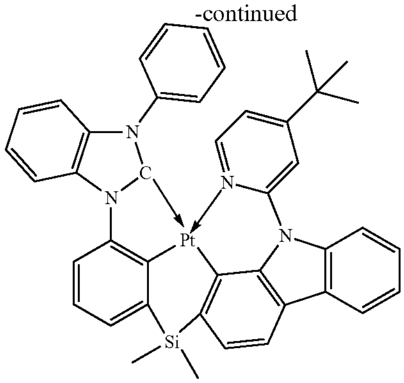
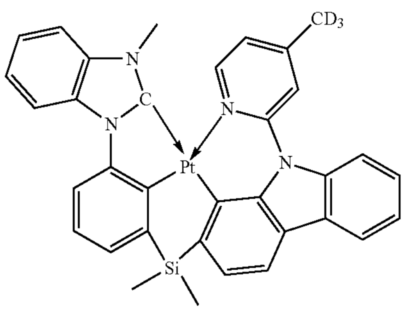
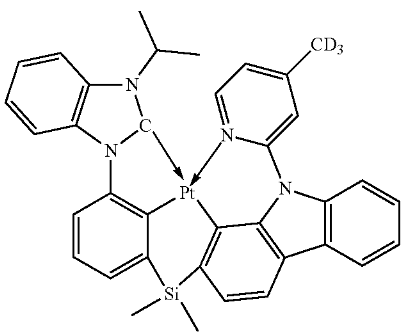
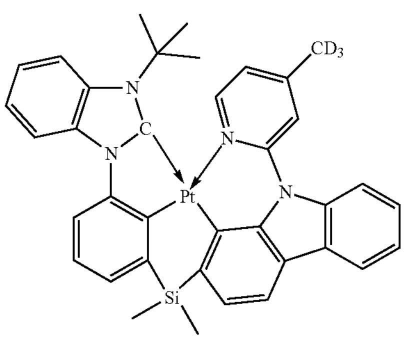
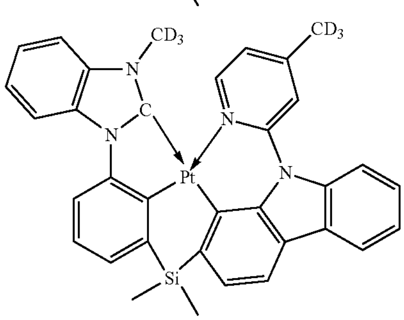
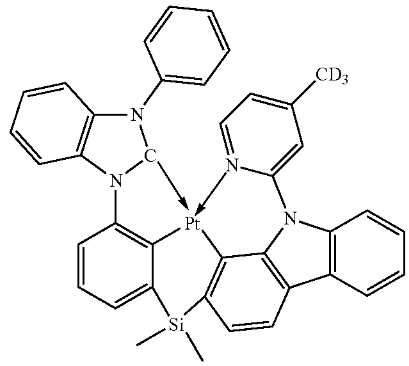
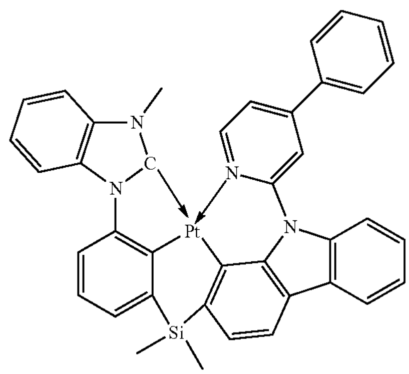
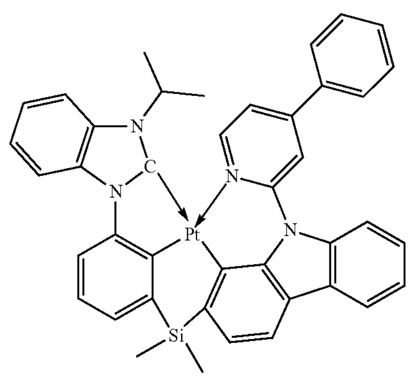
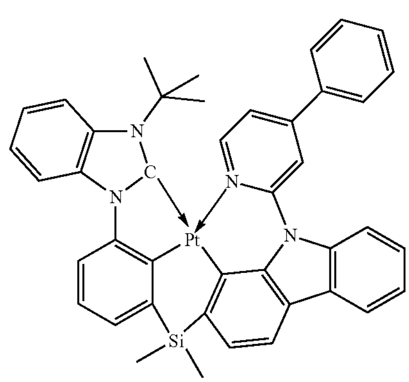

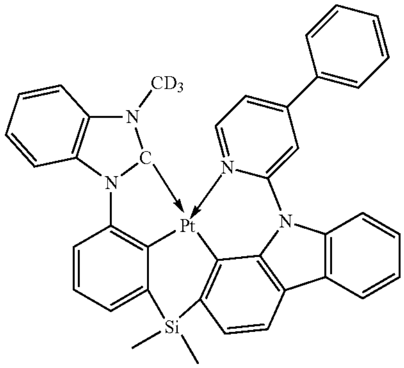
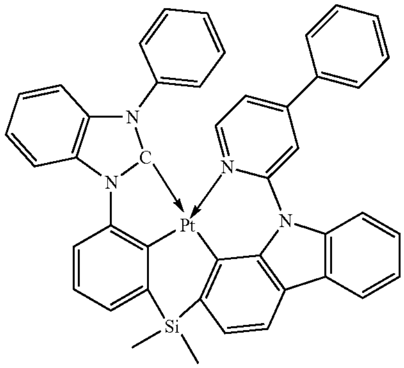
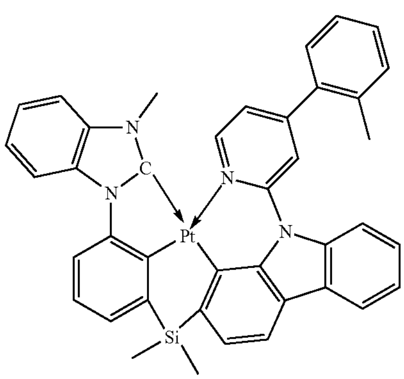
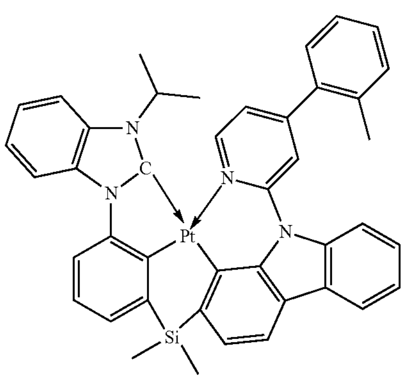
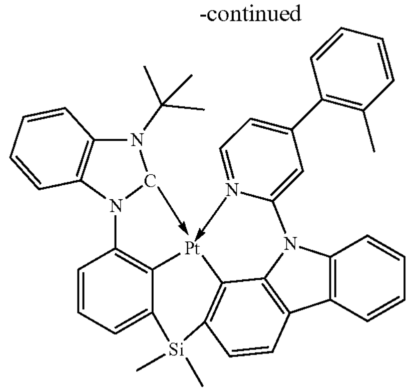
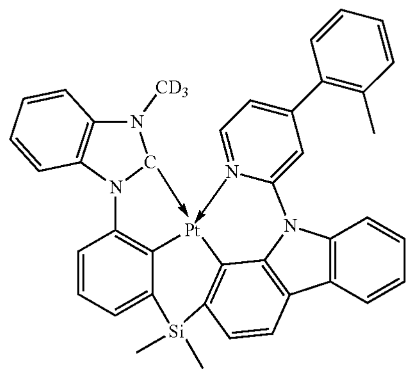
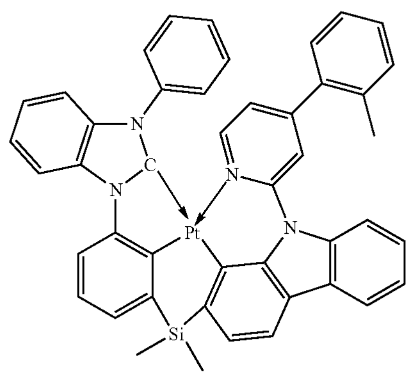
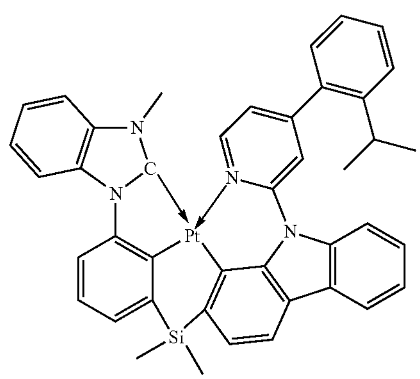

-continued
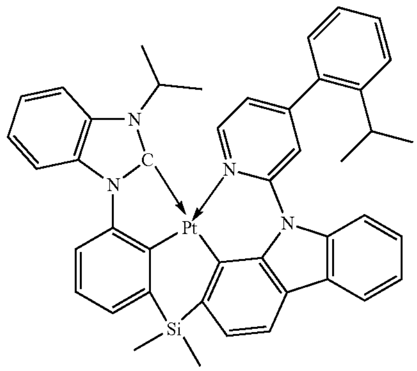
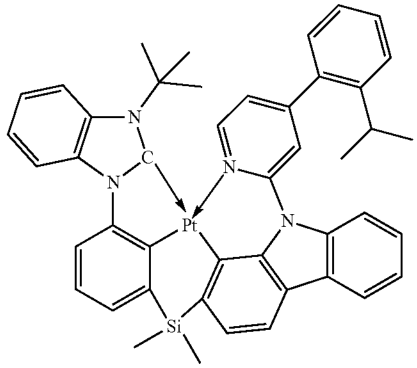
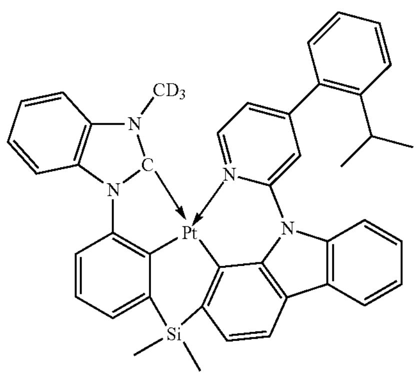
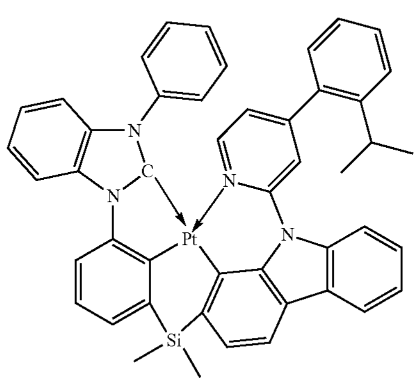
-continued
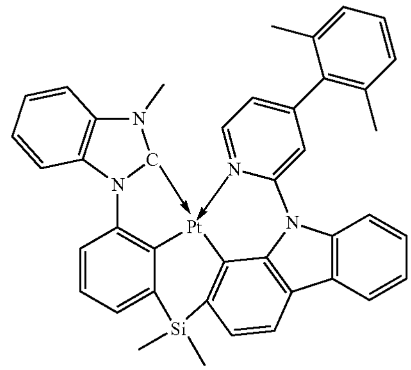
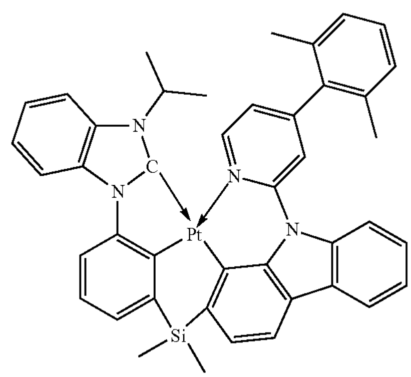
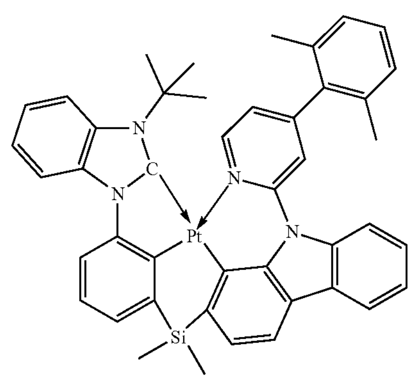
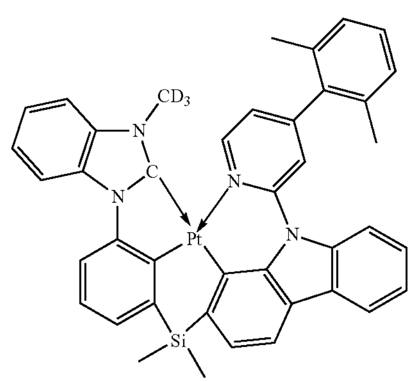

-continued
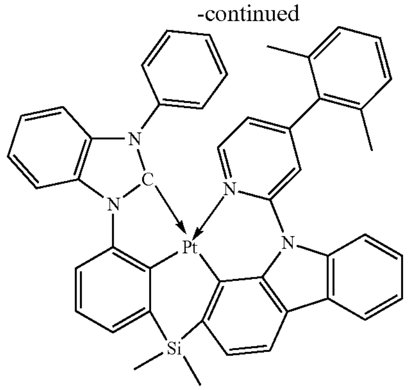
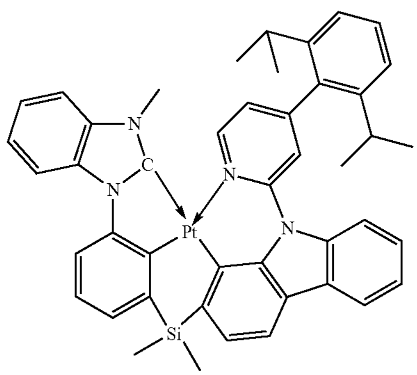
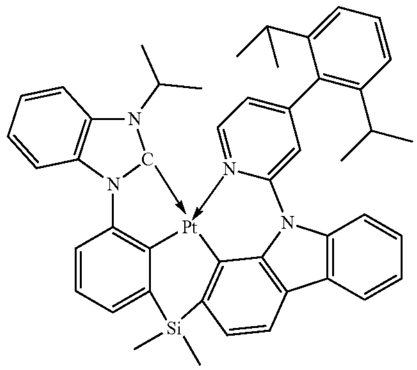
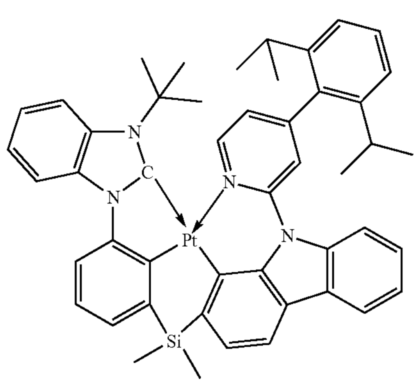
-continued
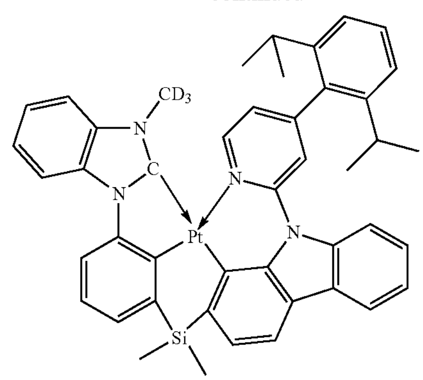
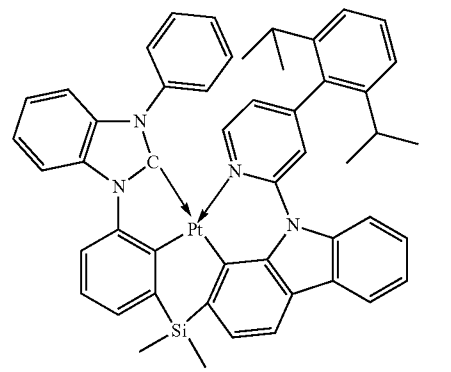
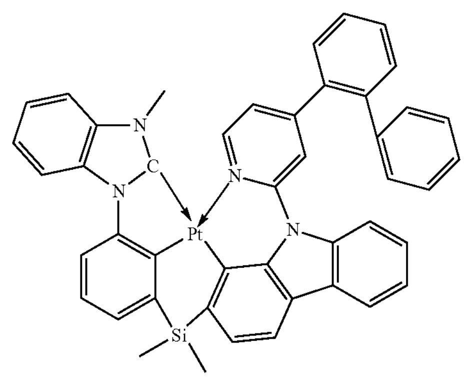
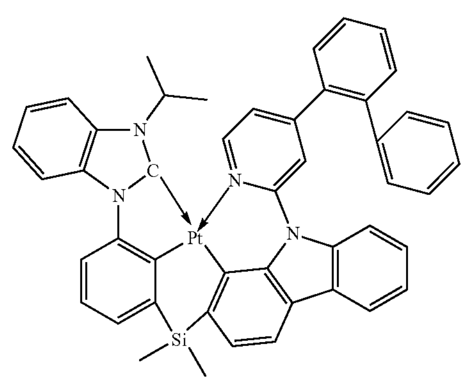

-continued
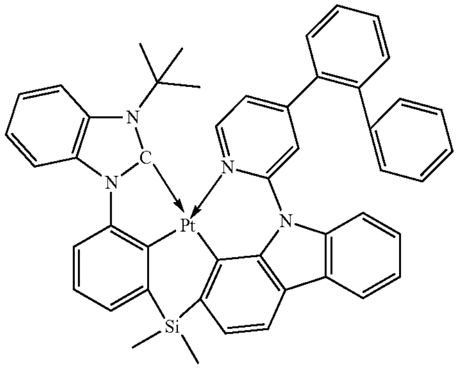
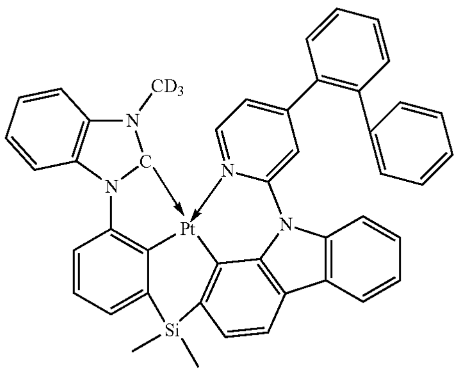
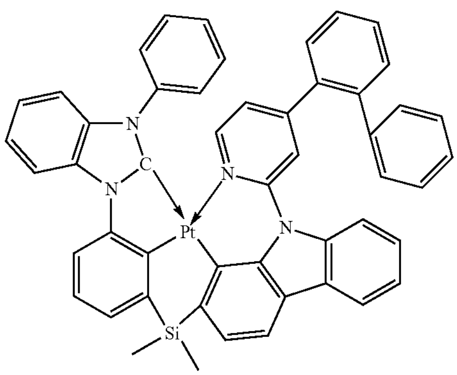
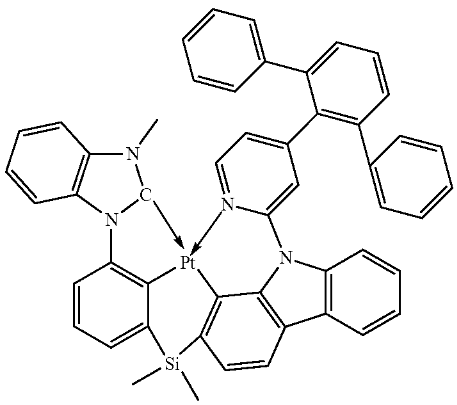
-continued
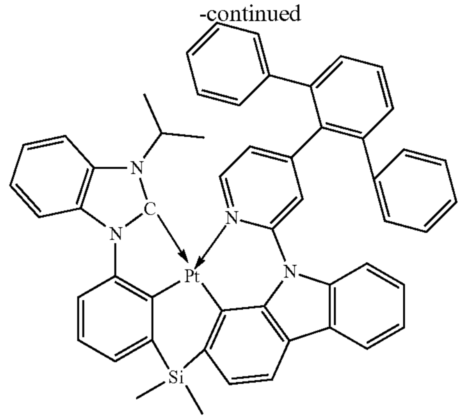
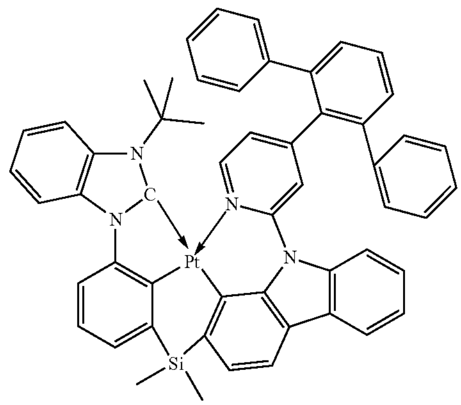
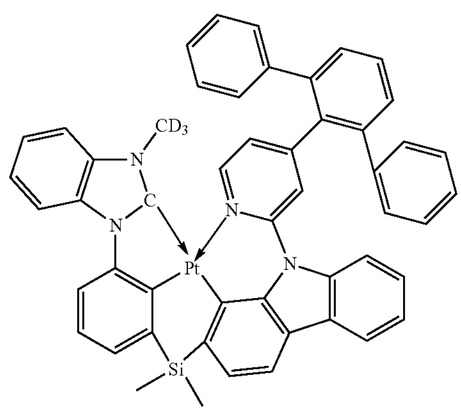
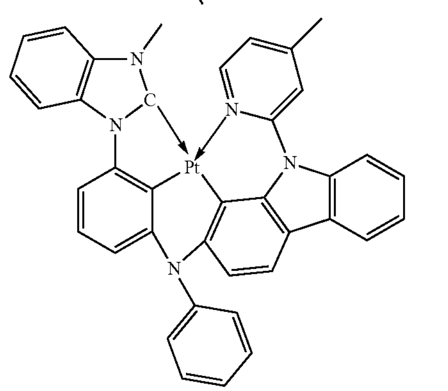

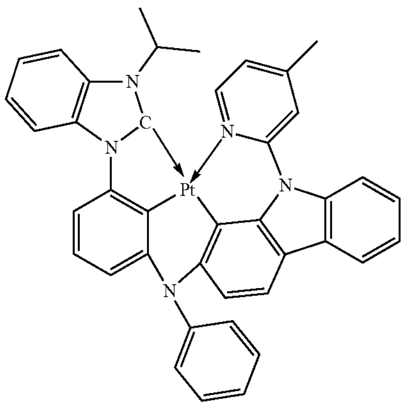
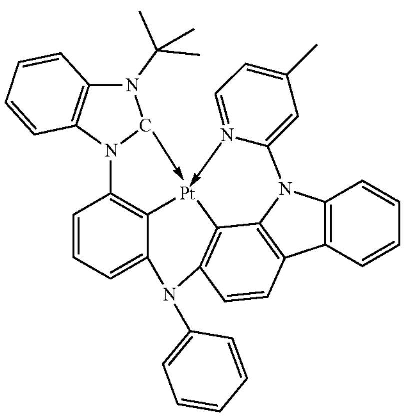
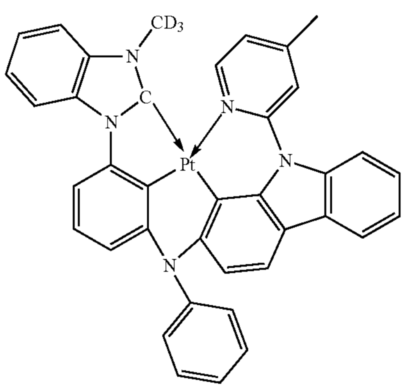
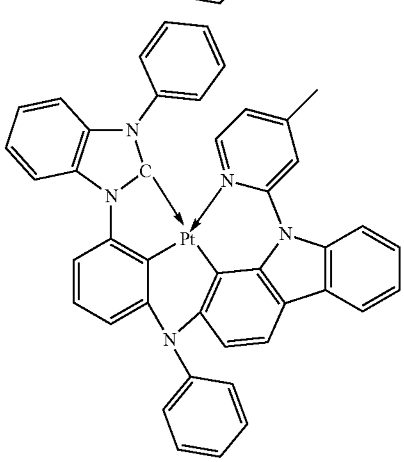
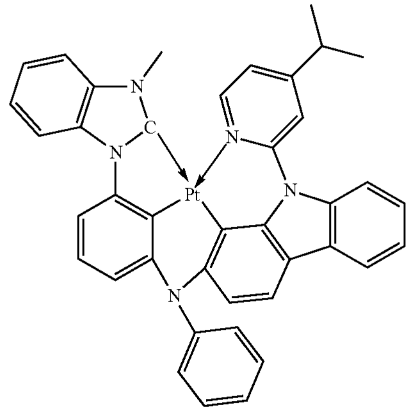
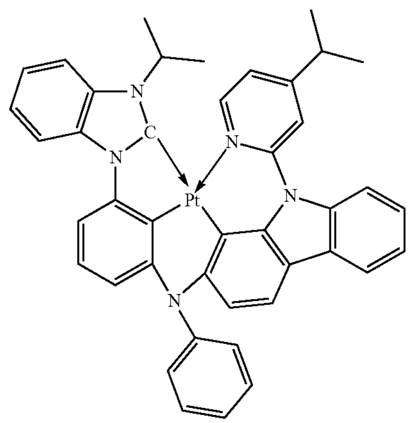
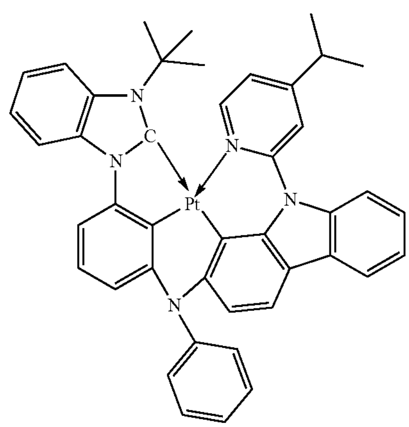
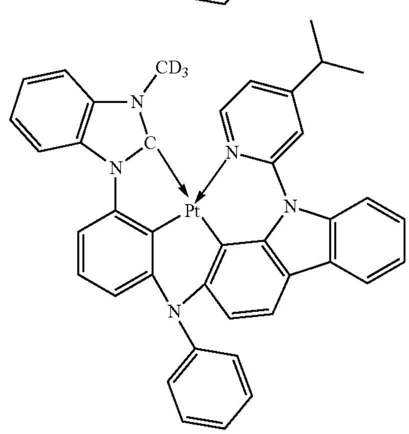

-continued
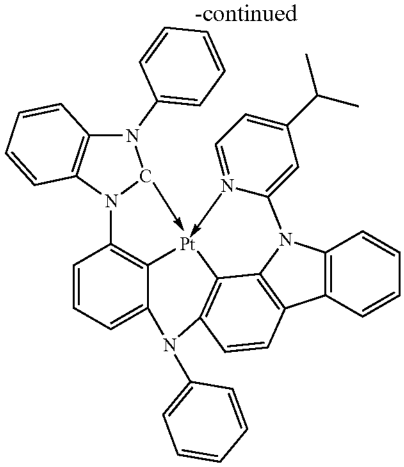
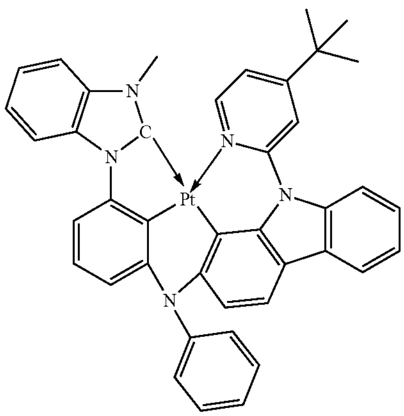
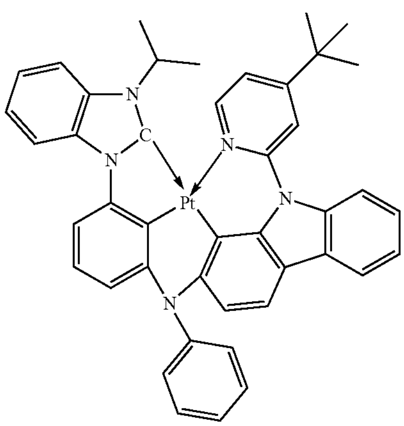
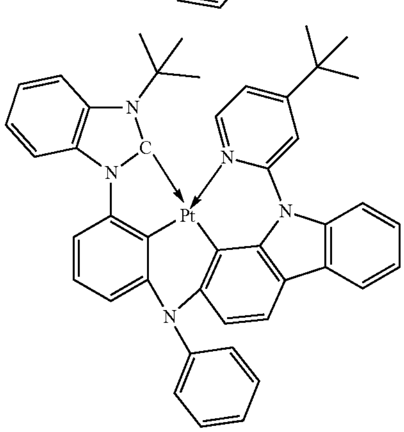
-continued
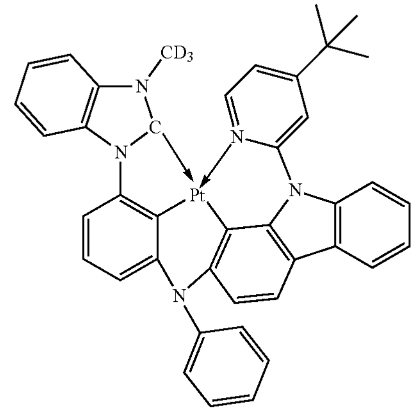
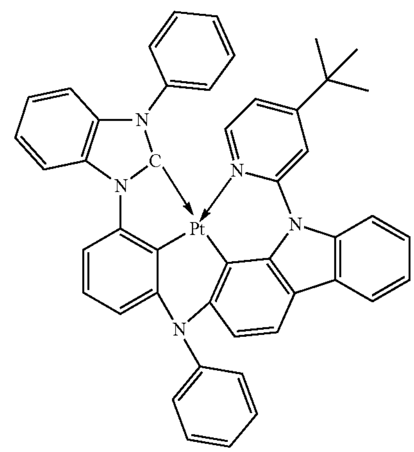
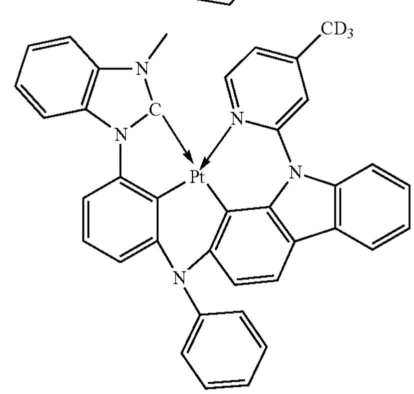
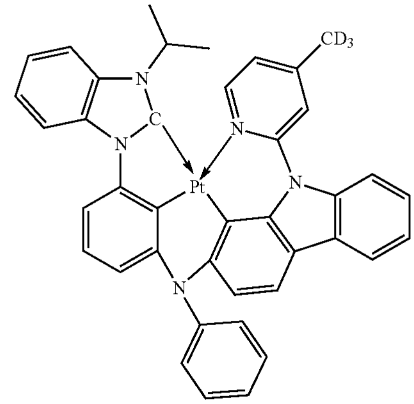

-continued
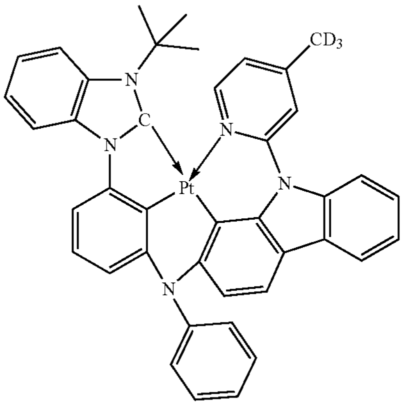
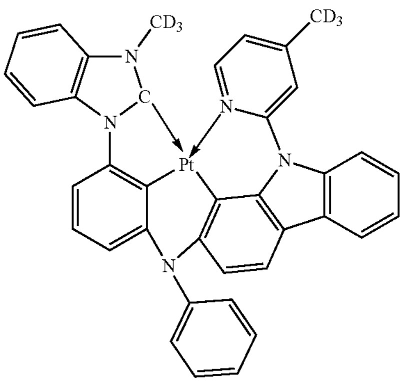
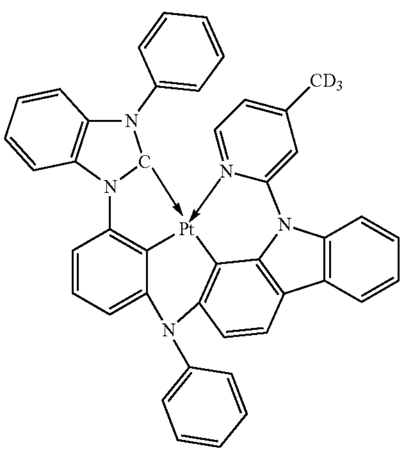
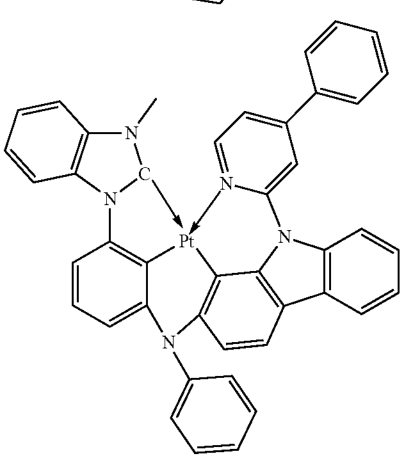
-continued
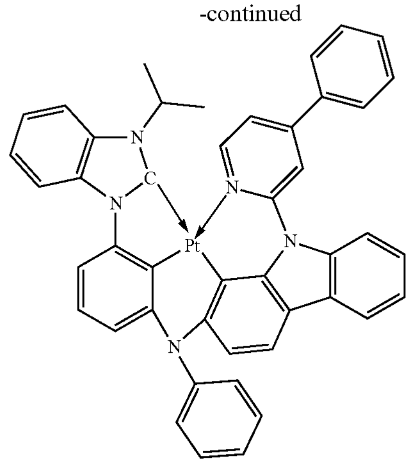
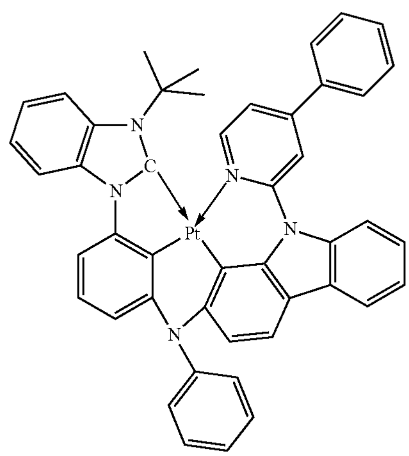
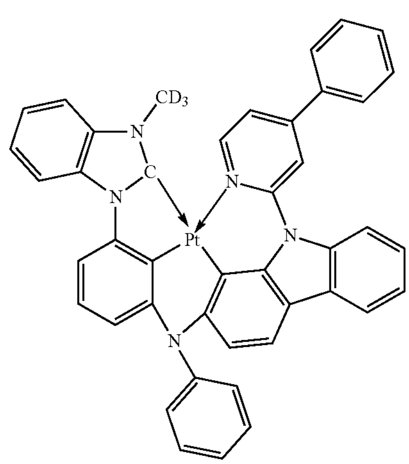

-continued
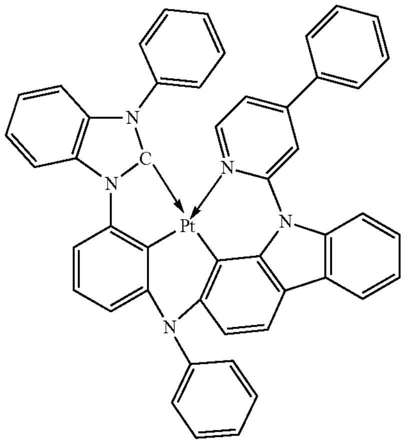
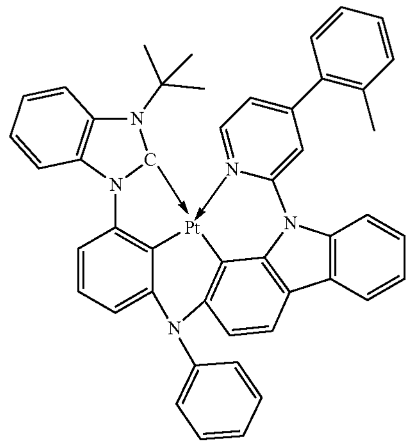
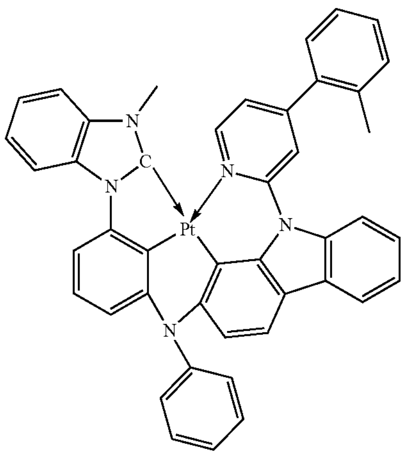
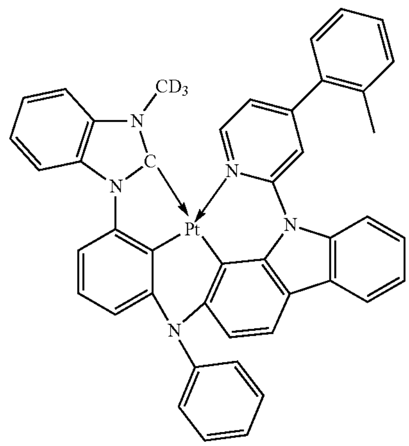
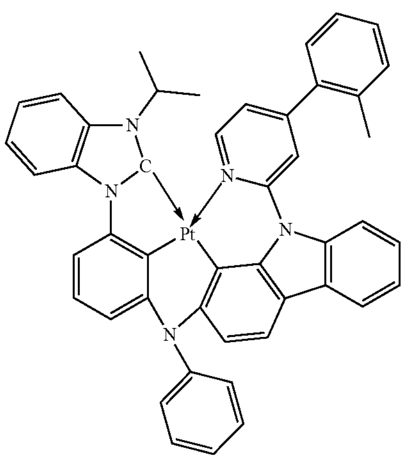
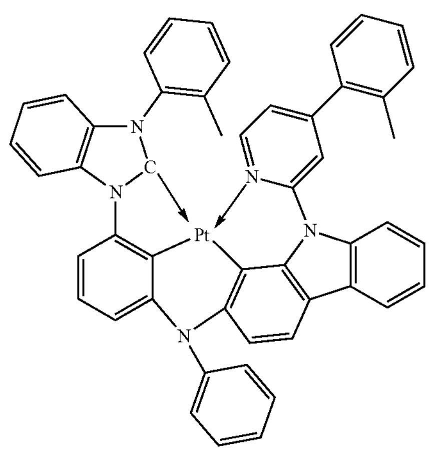
-continued -continued
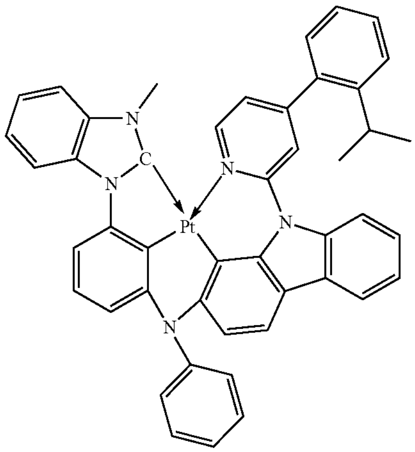
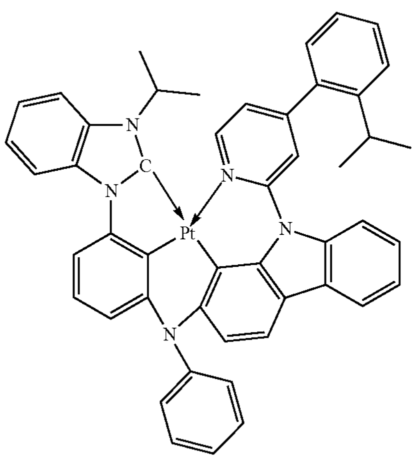
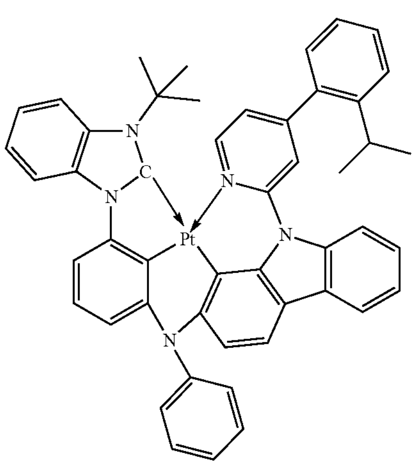
-continued
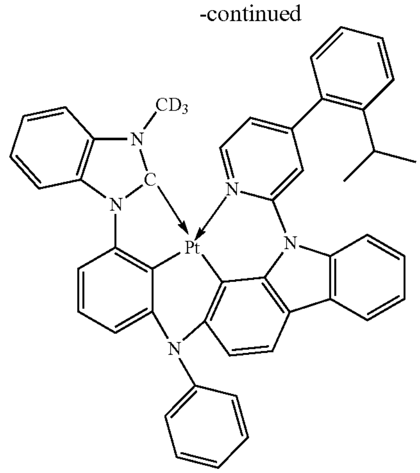
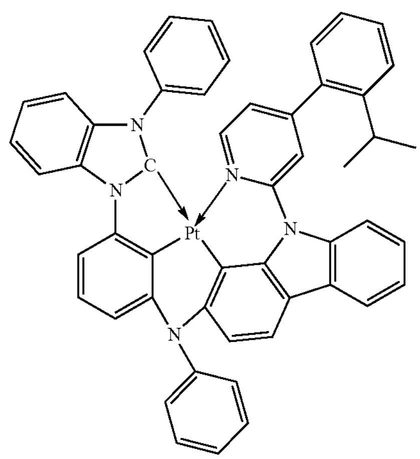
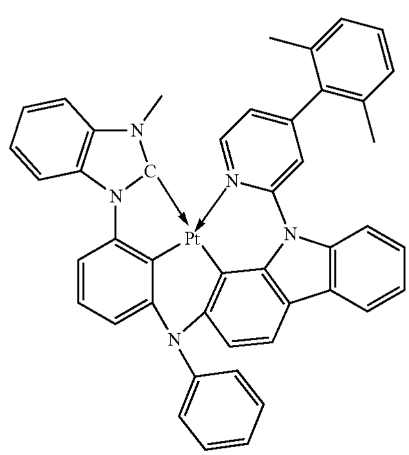

-continued
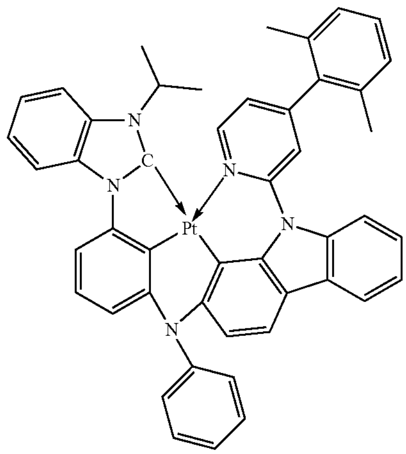
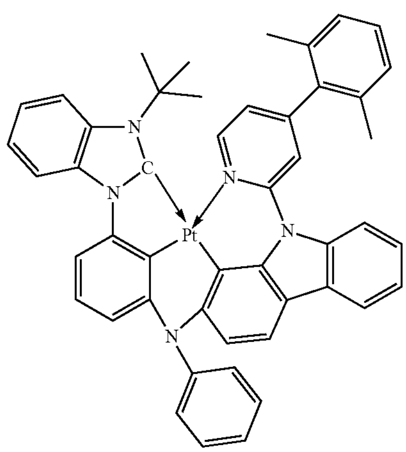
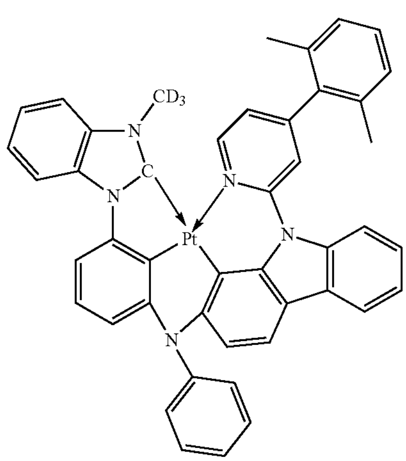
-continued
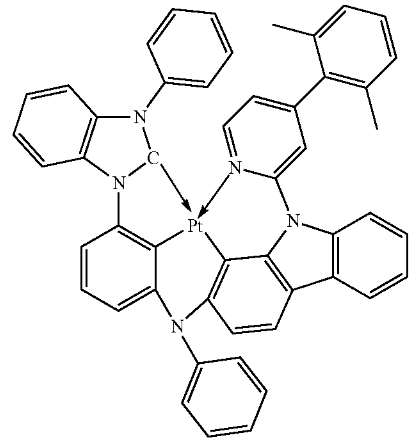
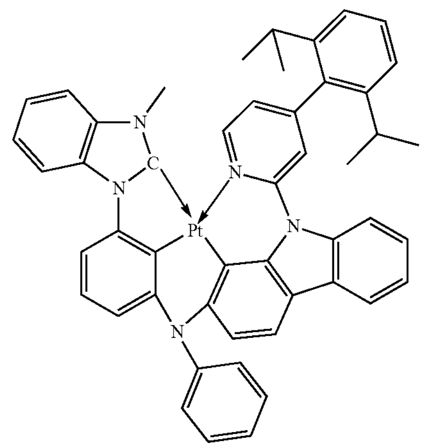
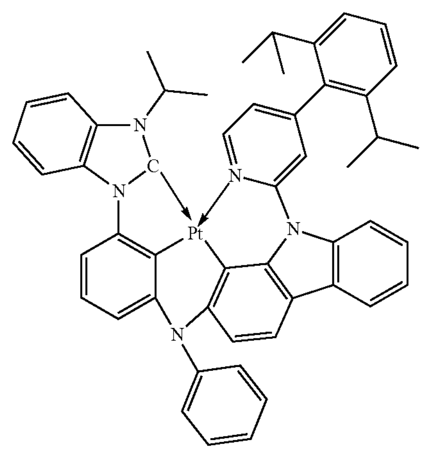

-continued
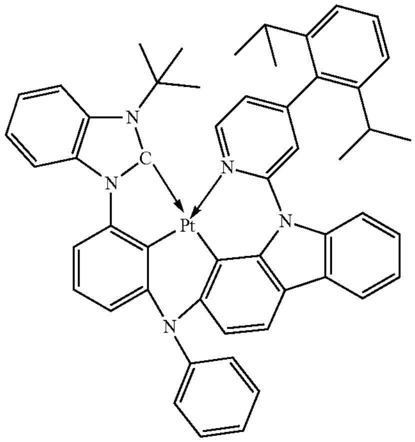
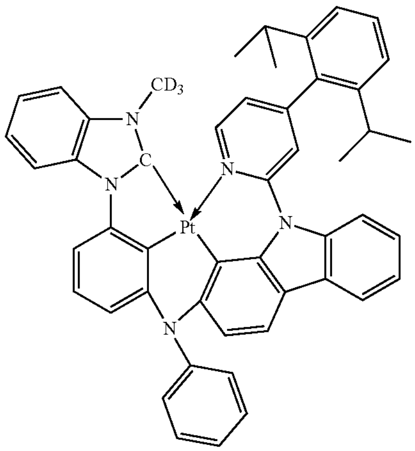
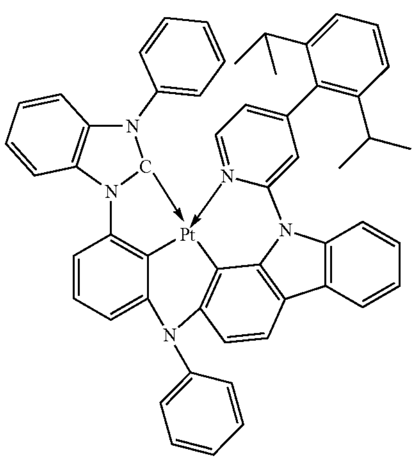
-continued
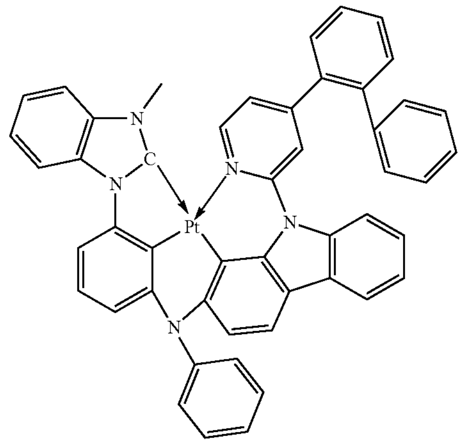
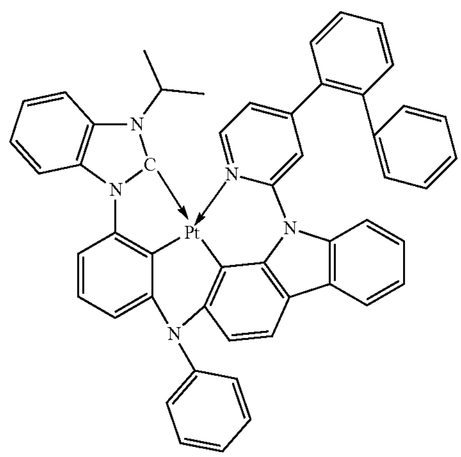
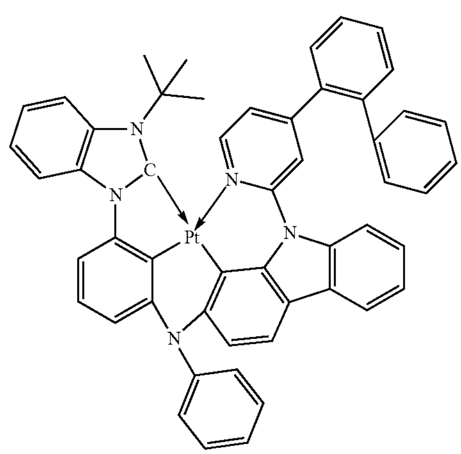

-continued
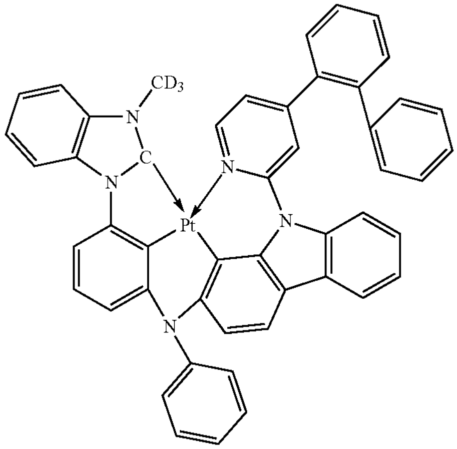
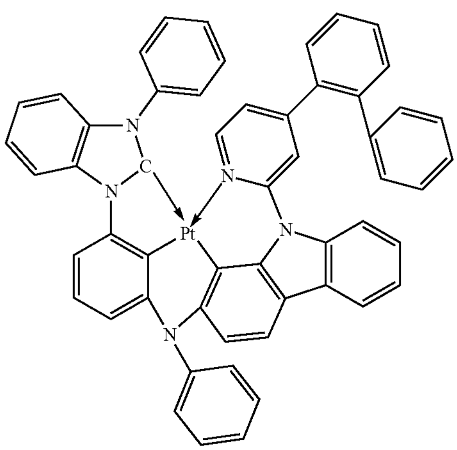
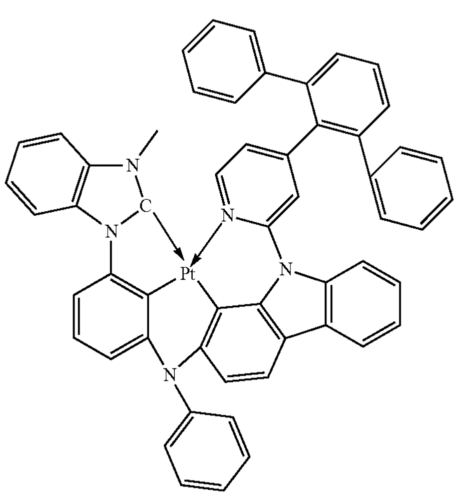
-continued
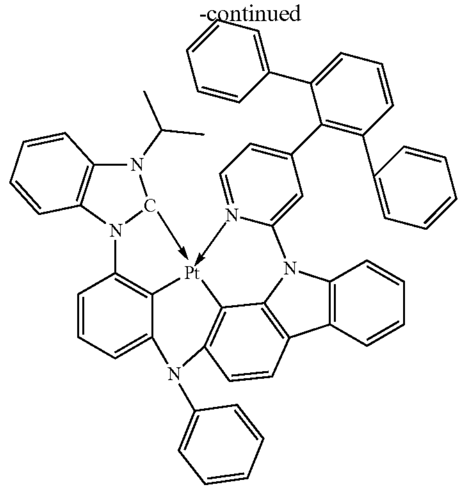
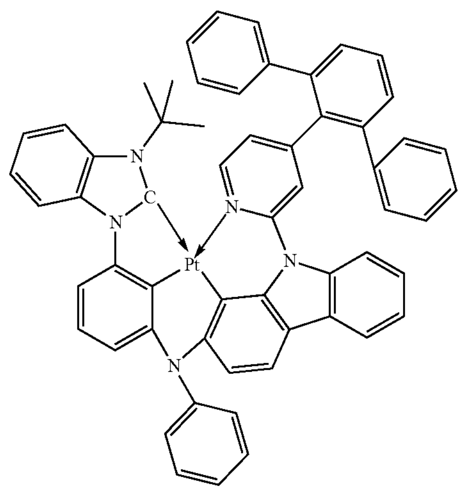
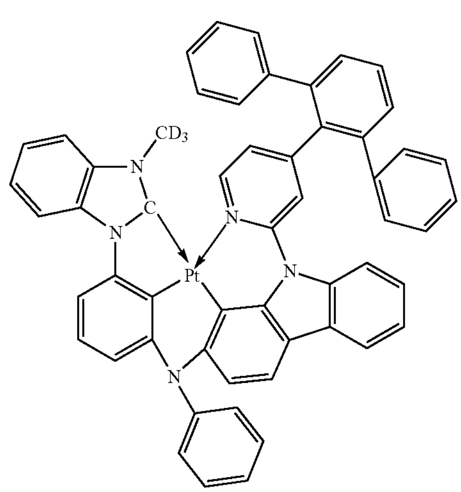

-continued
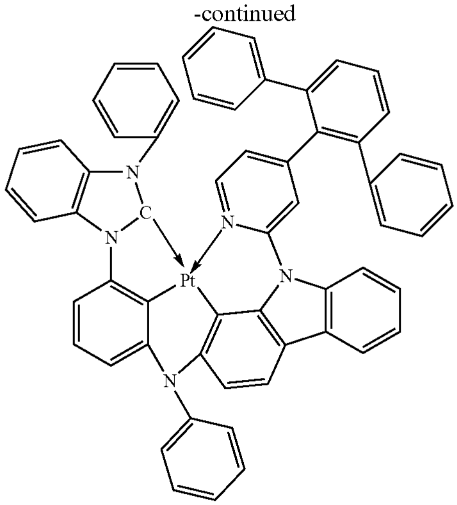
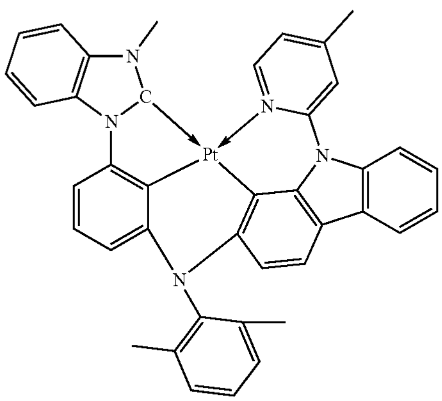
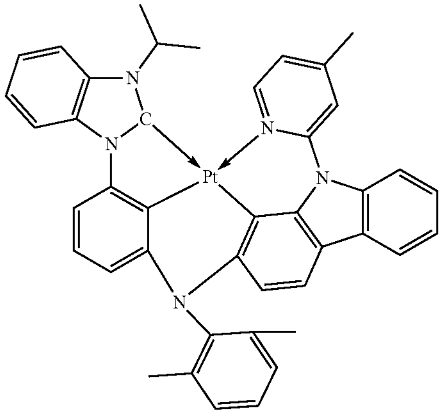
-continued
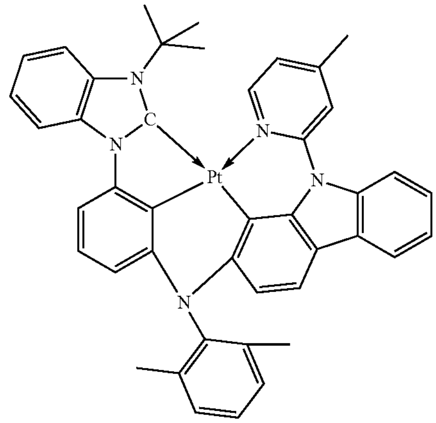
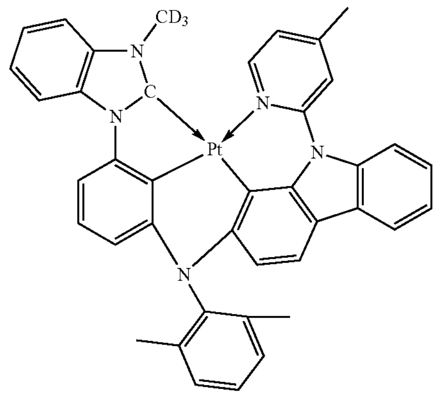
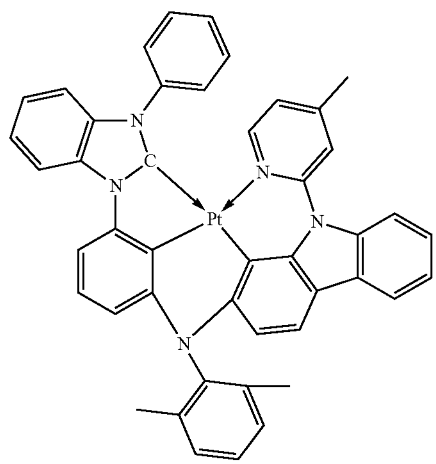
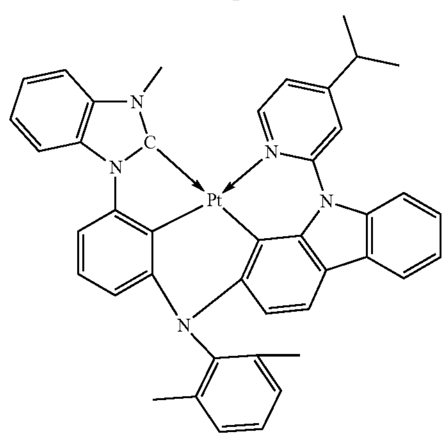

-continued
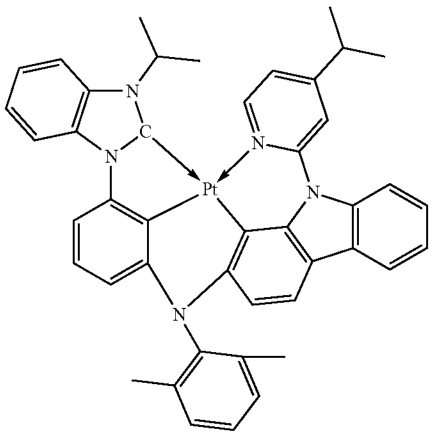
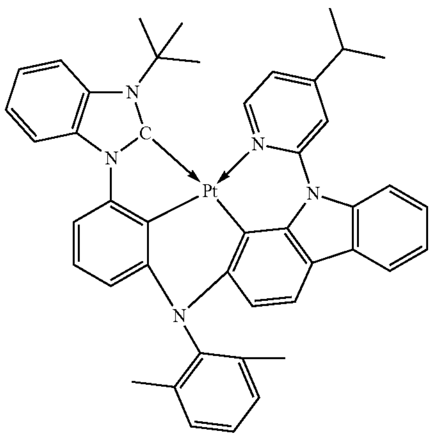
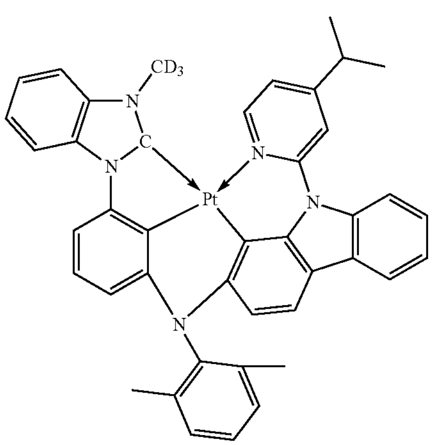
-continued
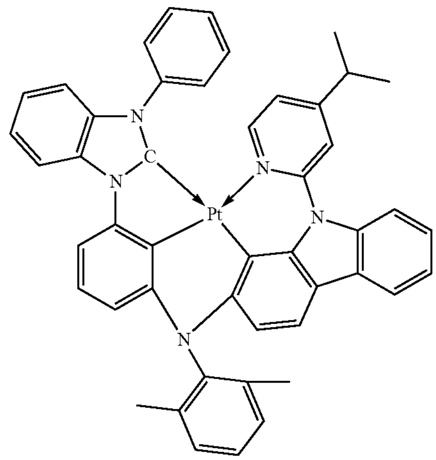
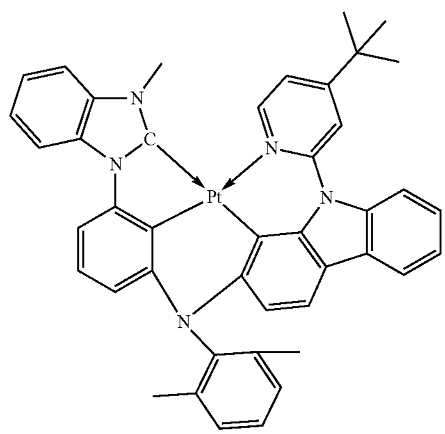
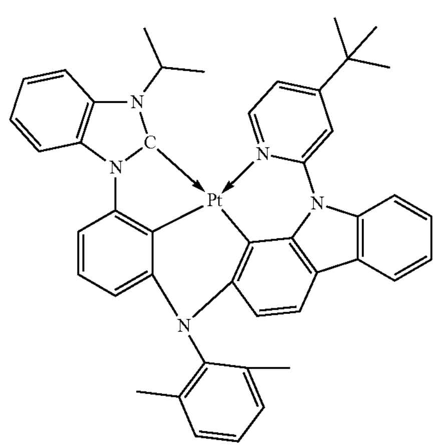

-continued
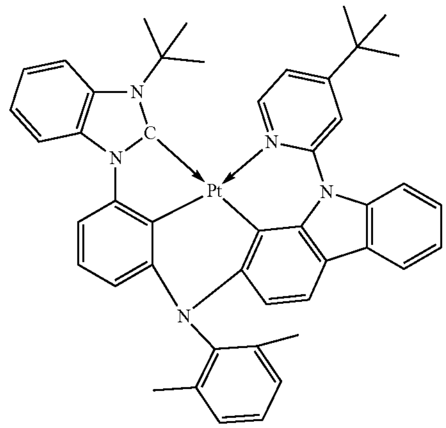
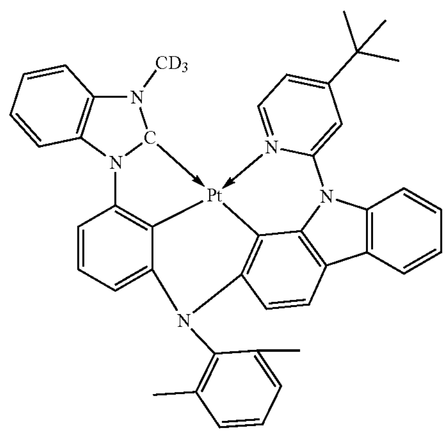
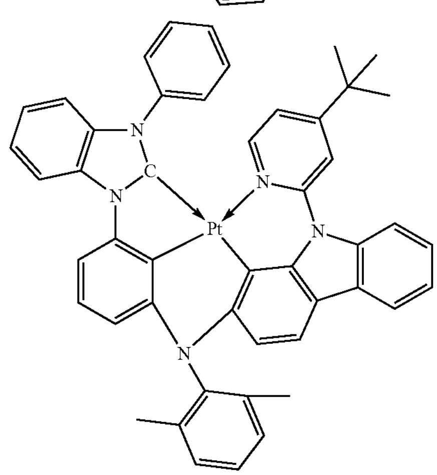
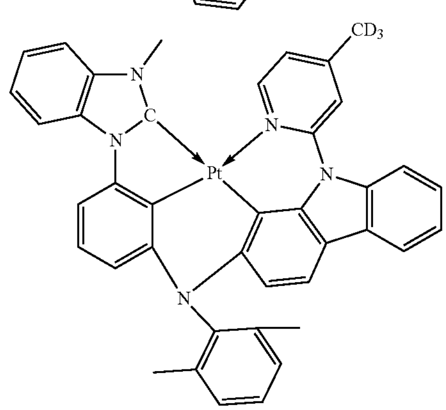
-continued
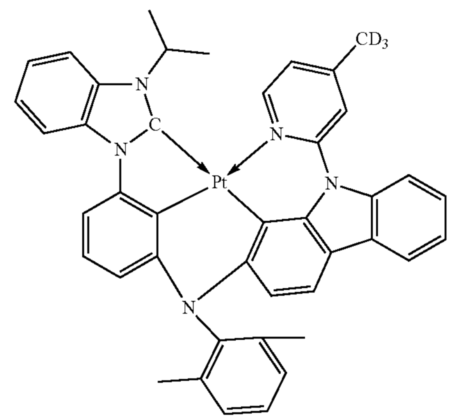
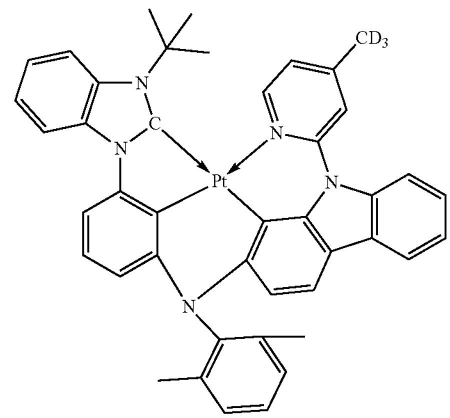
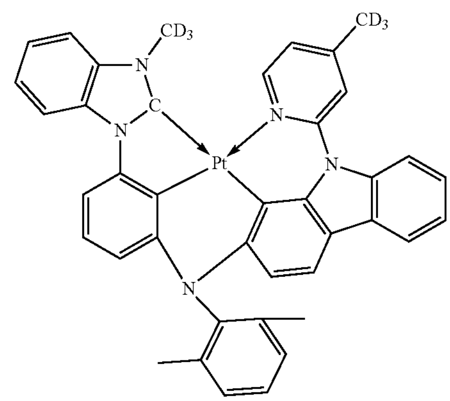
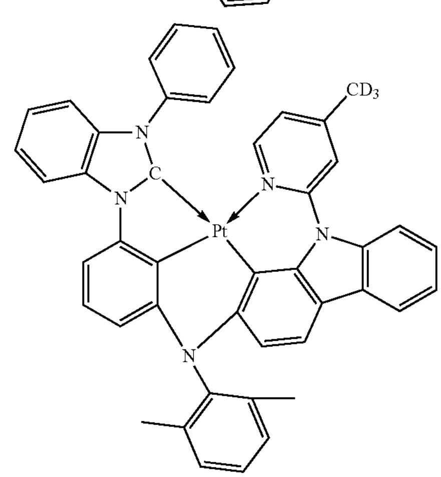

-continued
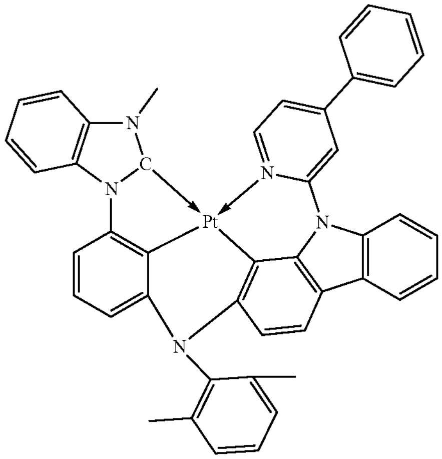
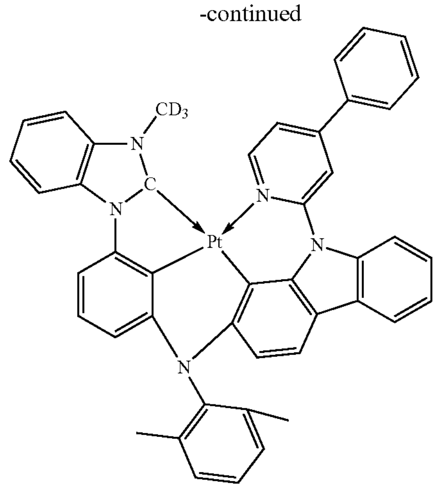
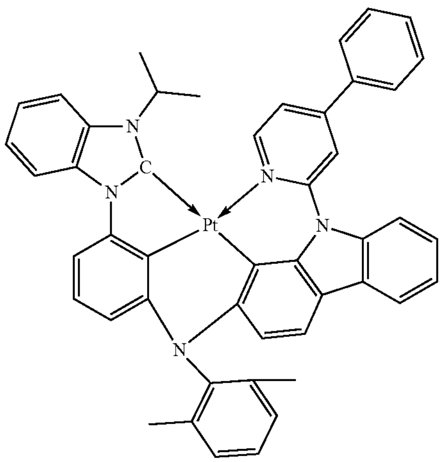
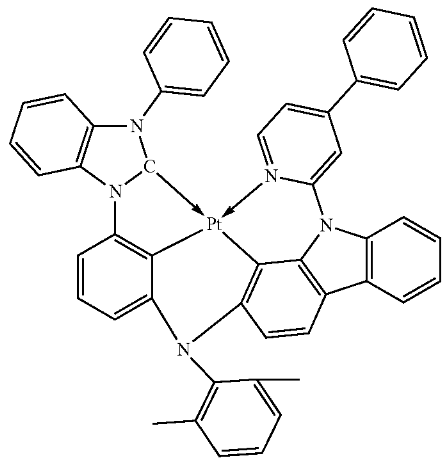
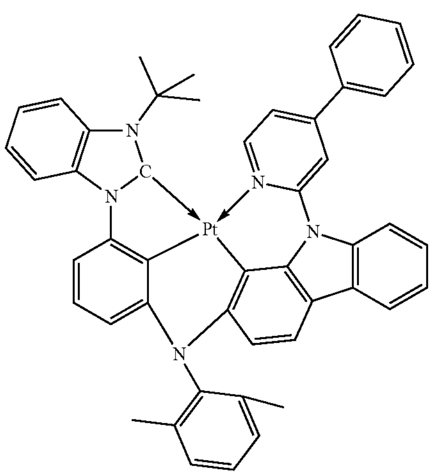
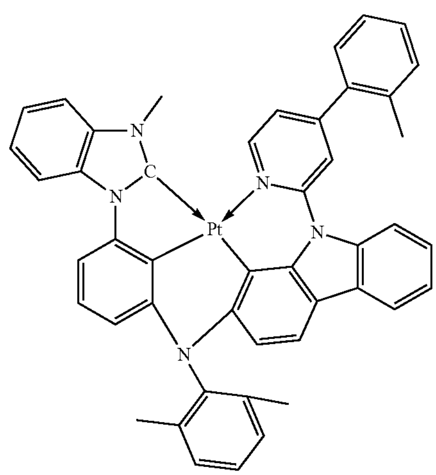

-continued
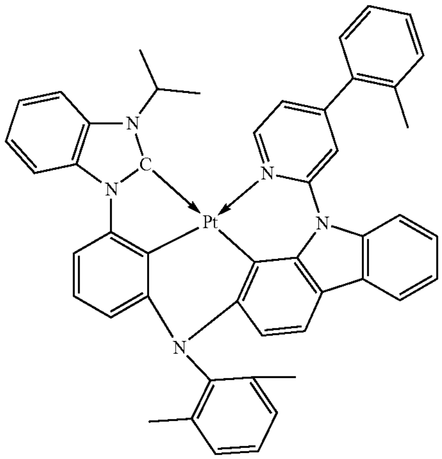
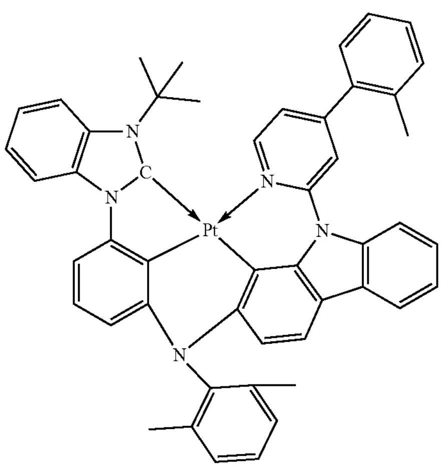
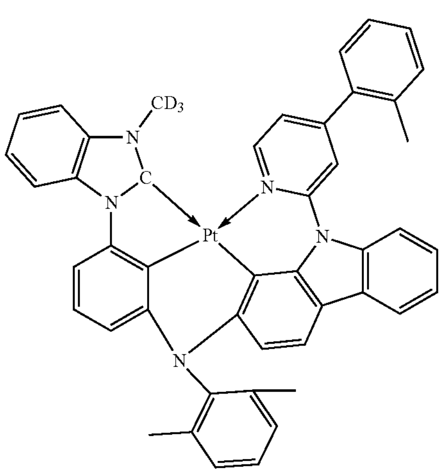
-continued
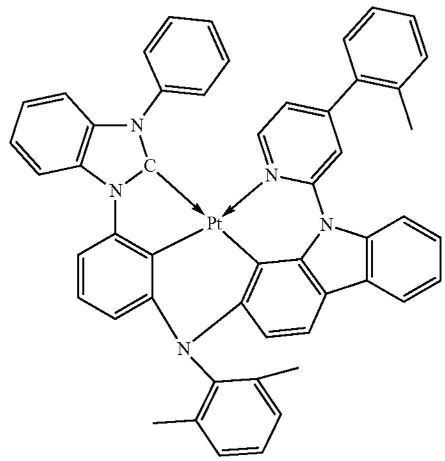
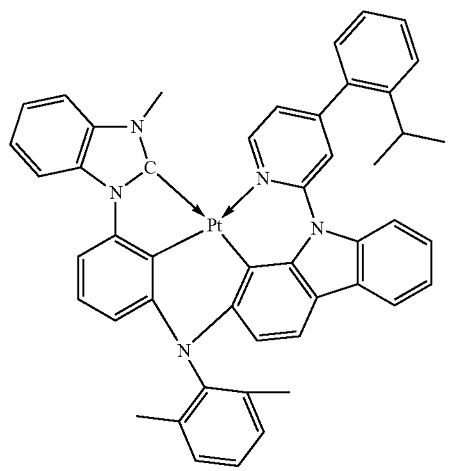
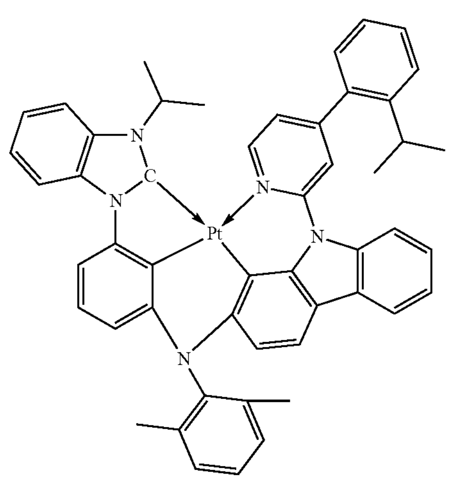

-continued
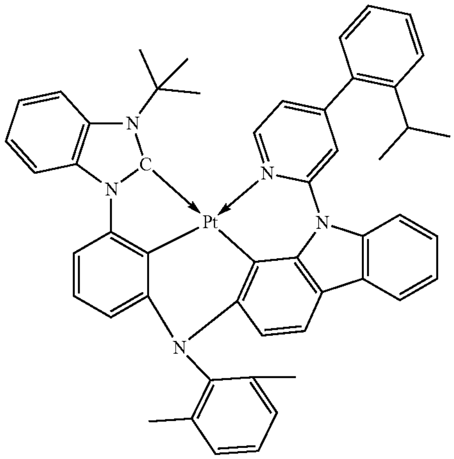
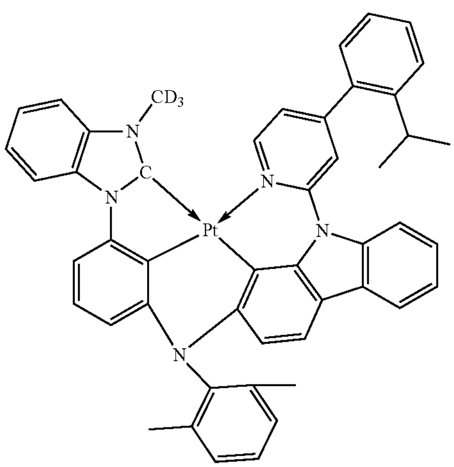
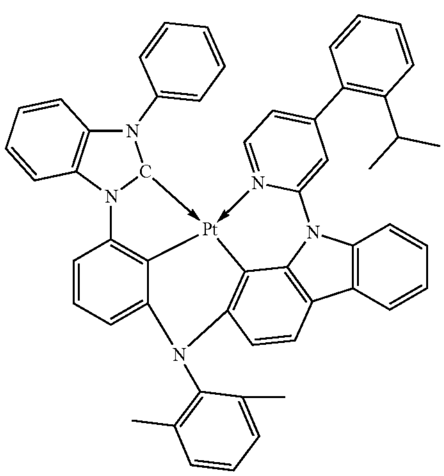
-continued
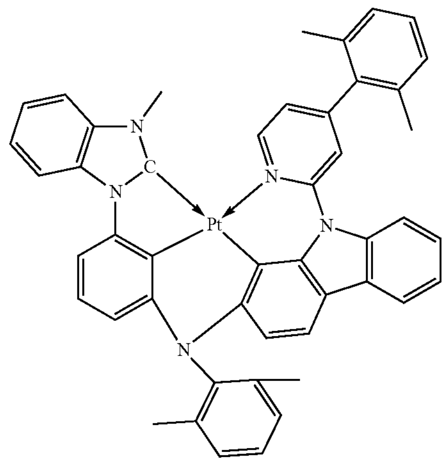
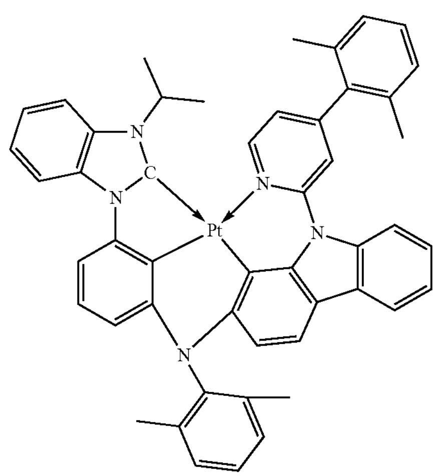
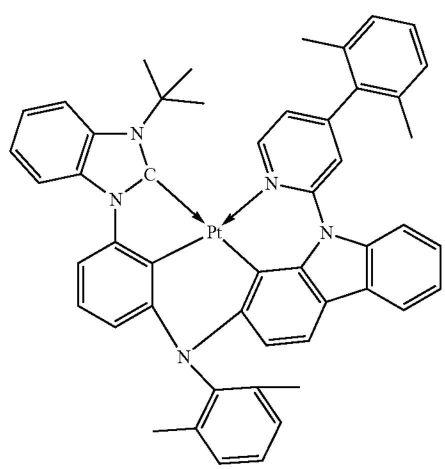

-continued
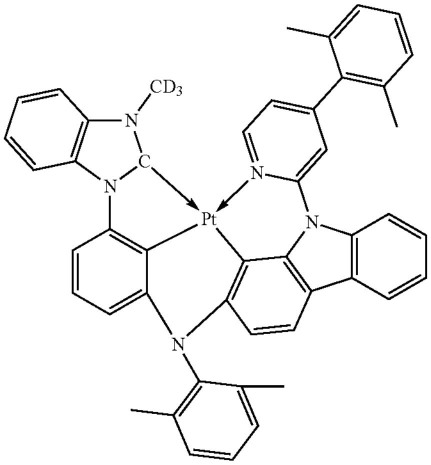
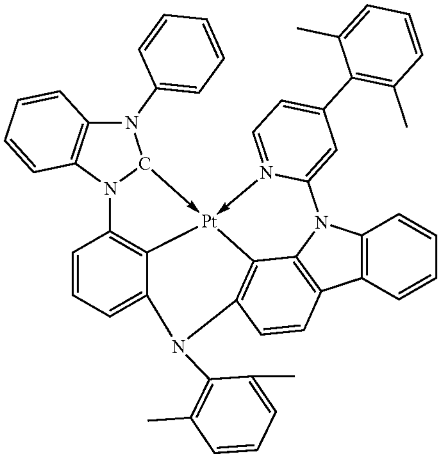
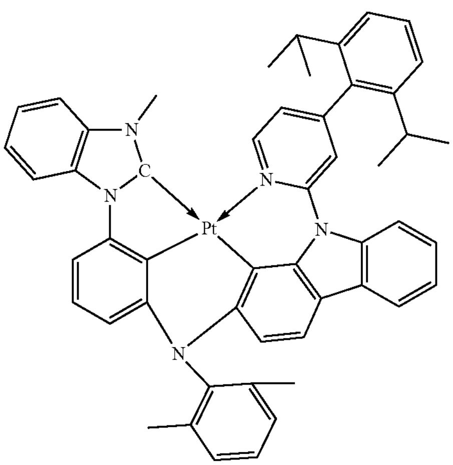
-continued
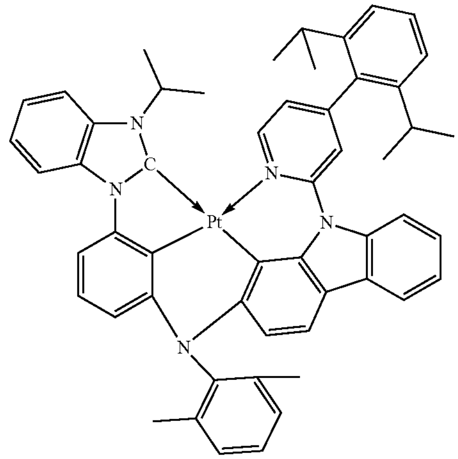
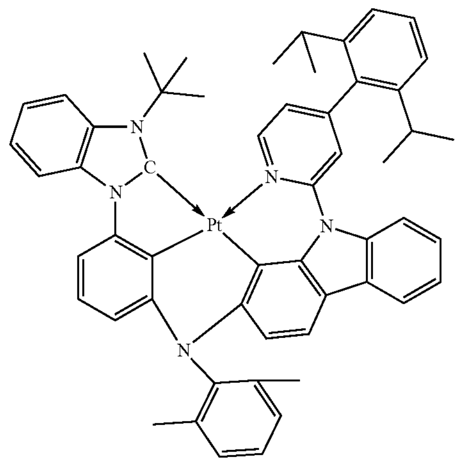
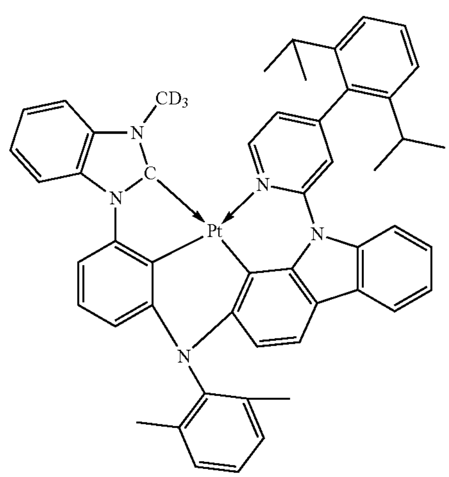

-continued
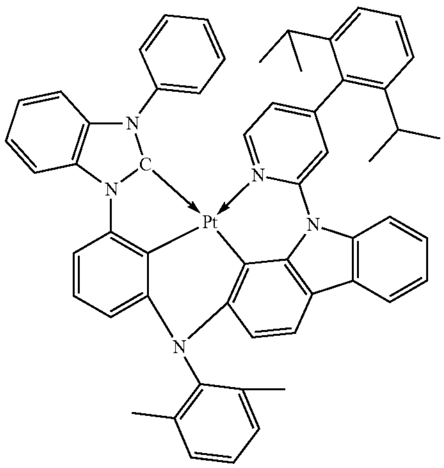
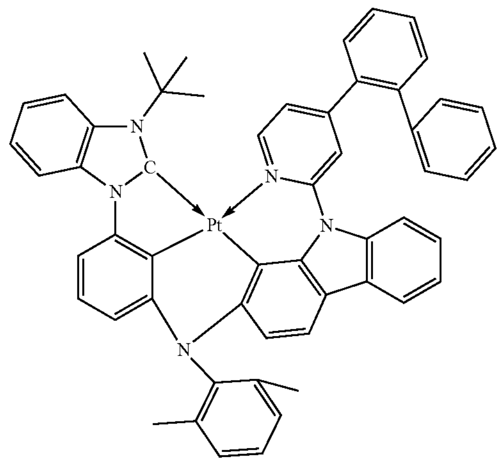
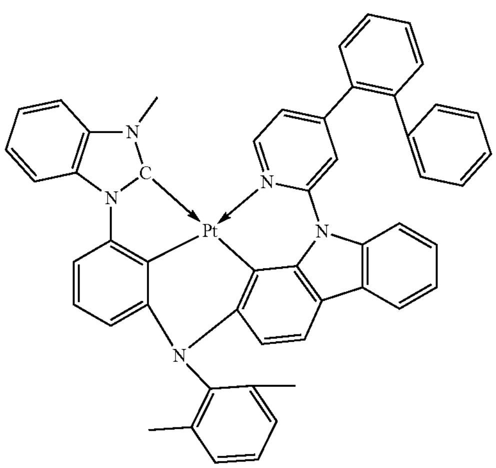
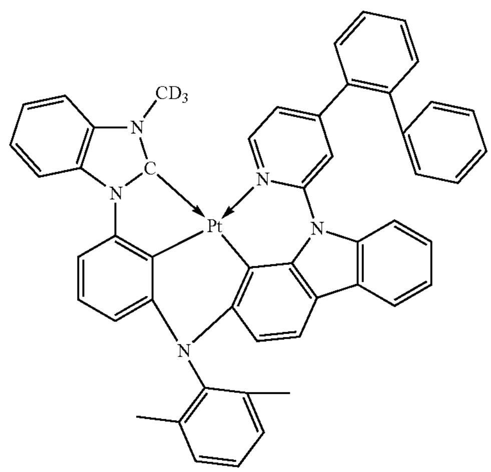
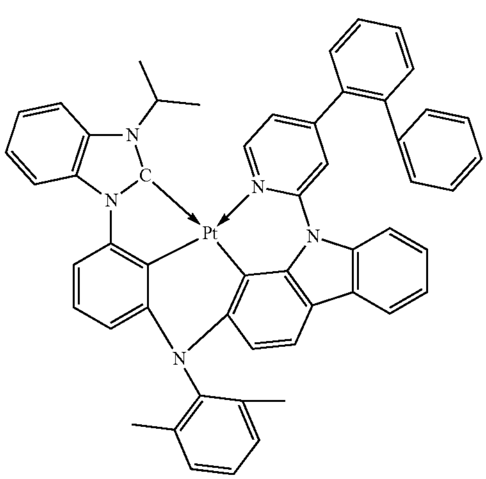
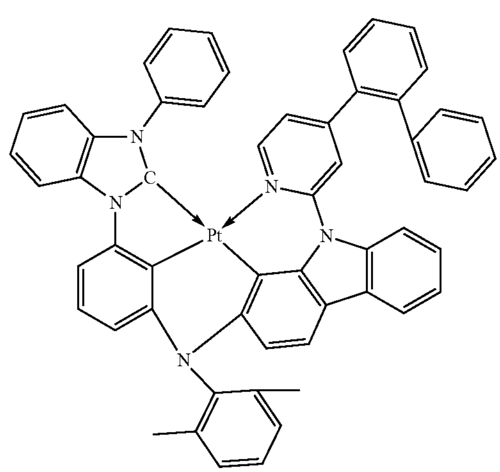
-continued -continued
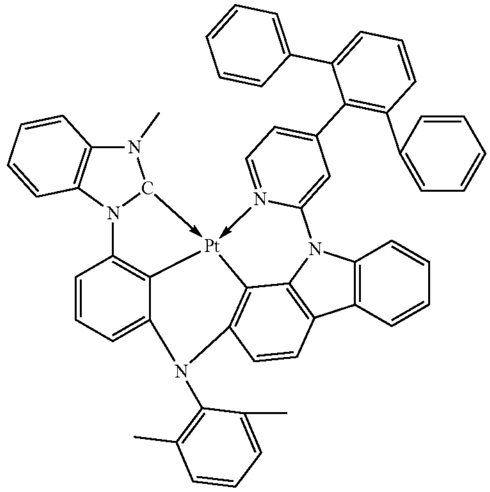
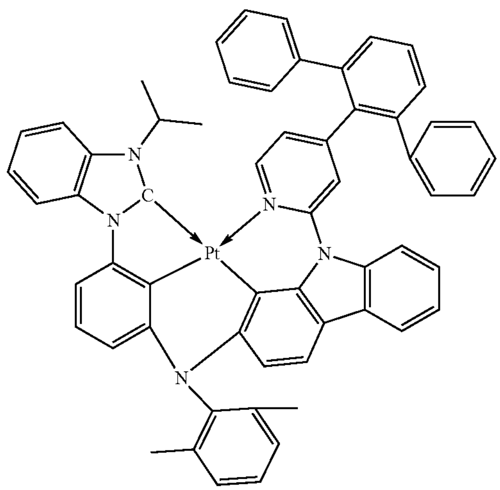
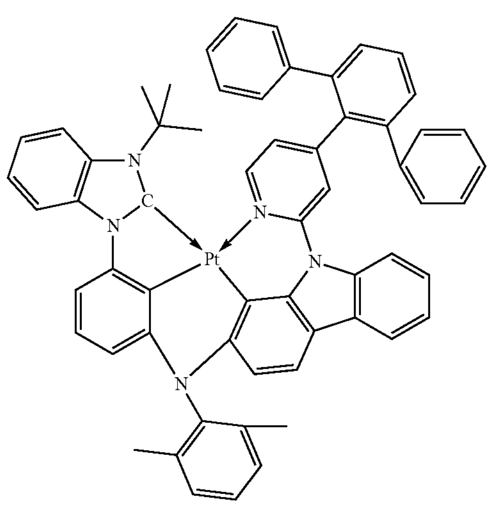
-continued
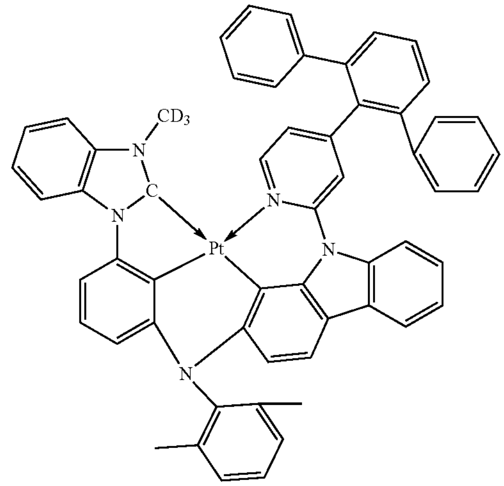
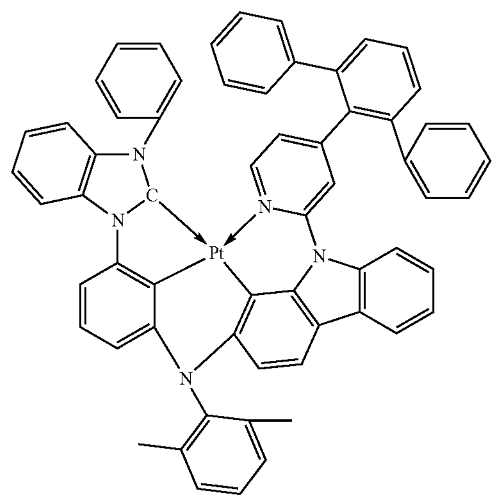
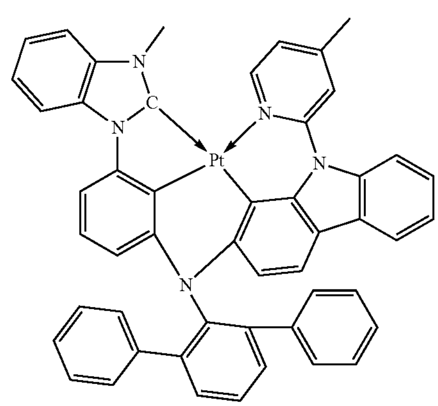

-continued
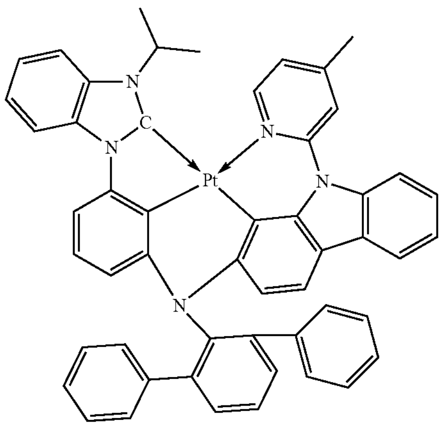
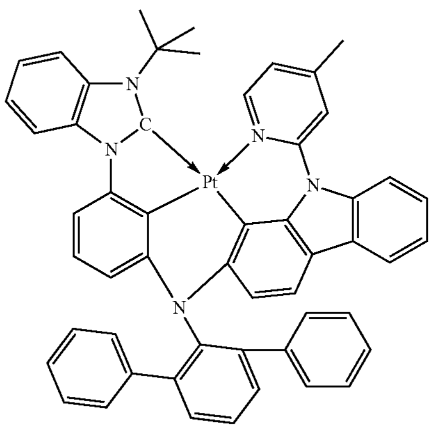
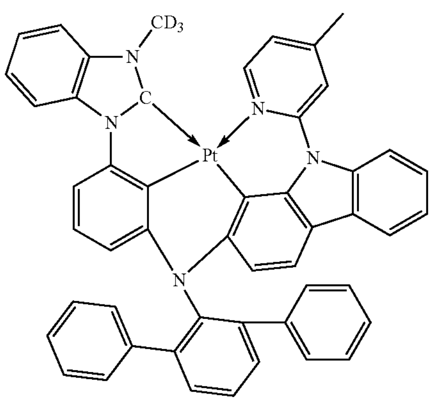
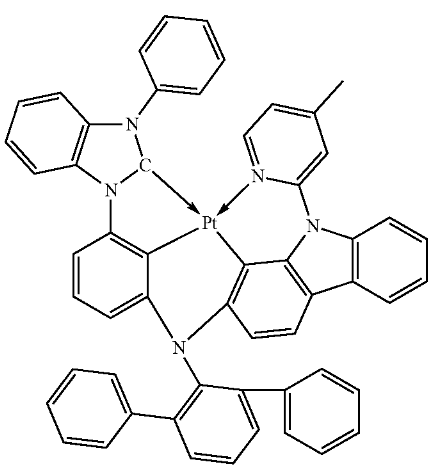
-continued
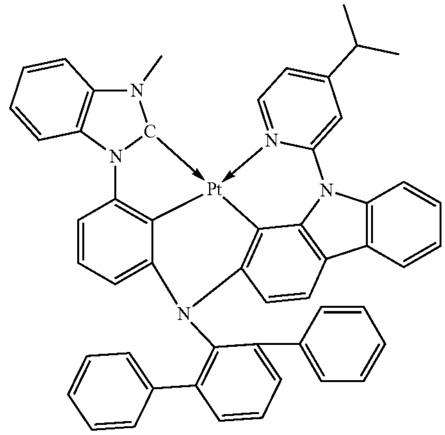
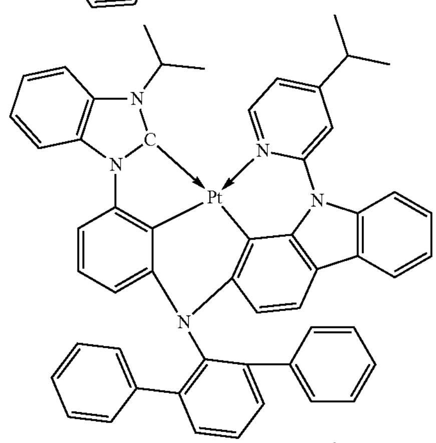
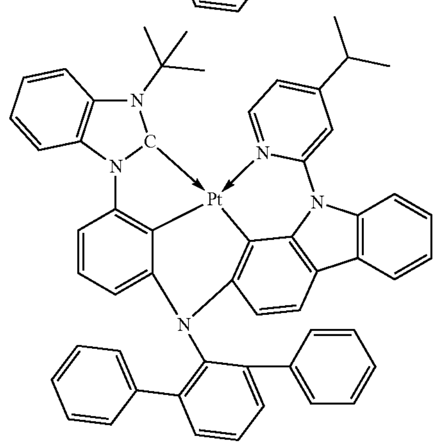
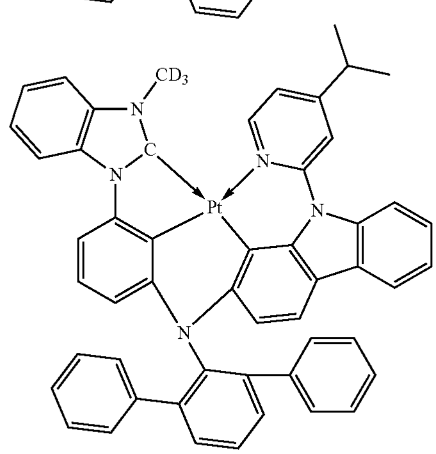

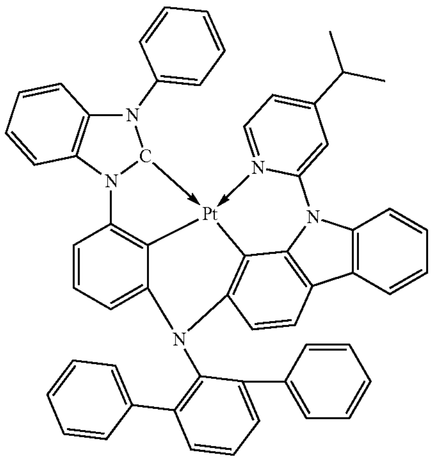
N
C
N
Pt
N
N
N
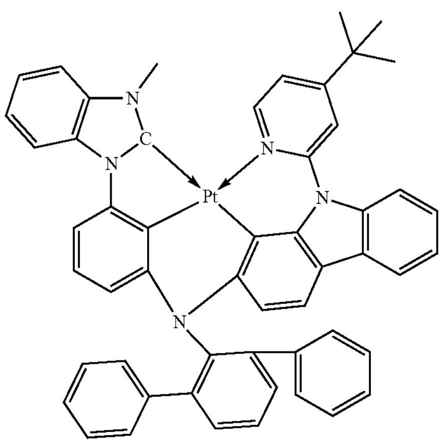
N
C
N
Pt
N
N
N
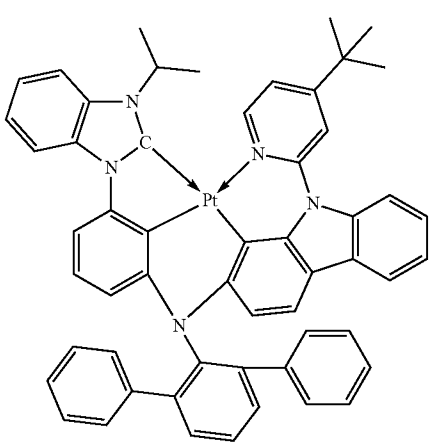
N
C
N
Pt
N
N
N
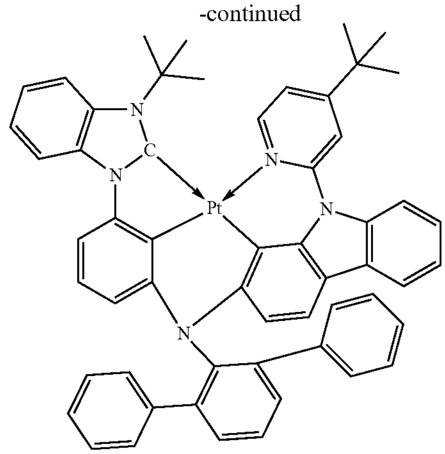
N
C
N
Pt
N
N
N
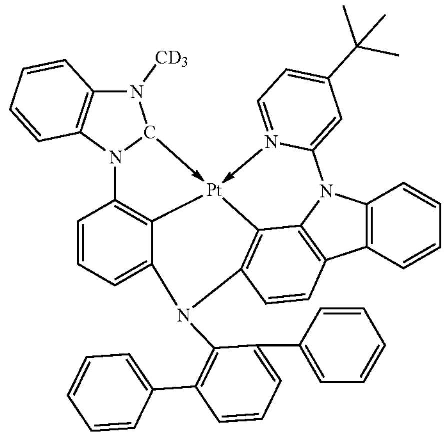
CD3
N
C
N
Pt
N
N
N
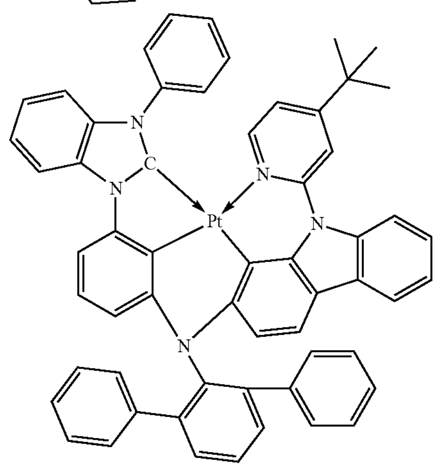
N
C
N
Pt
N
N
N
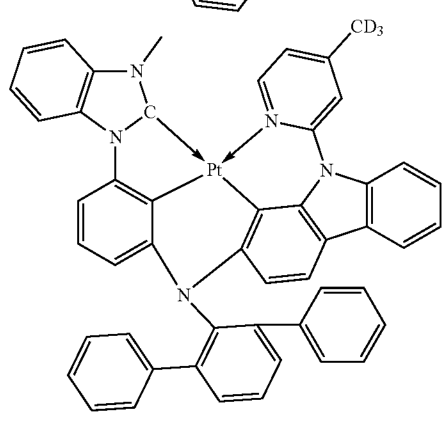
CD3
N
C
N
Pt
N
N
N -continued
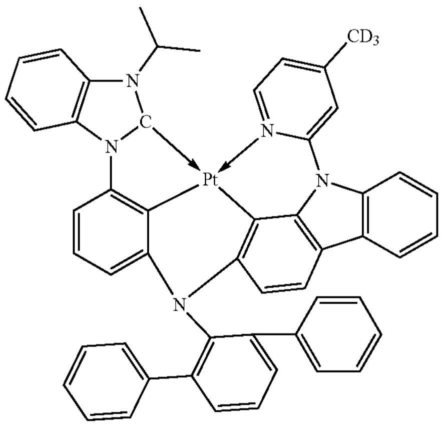
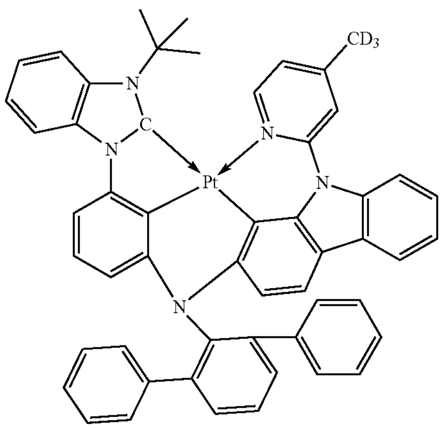
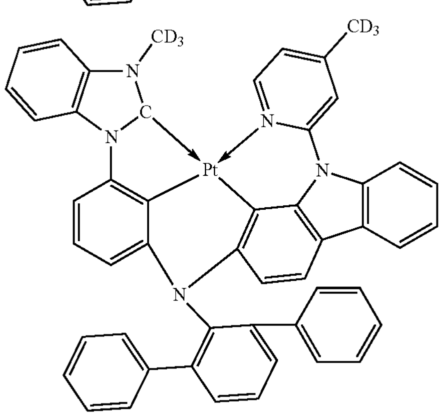
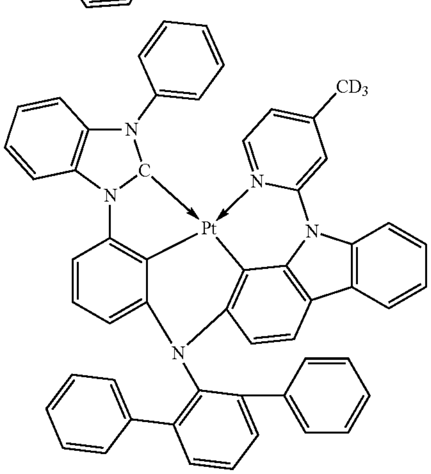
-continued
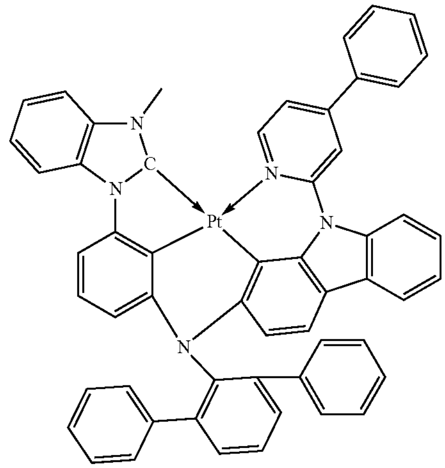
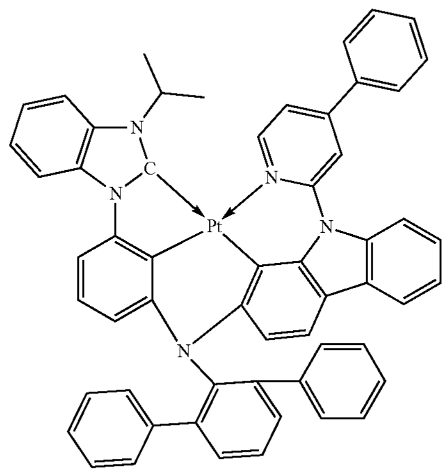
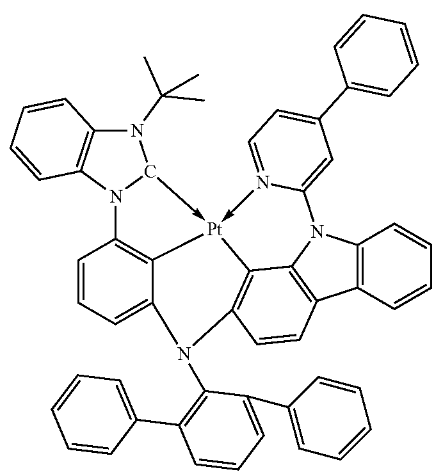

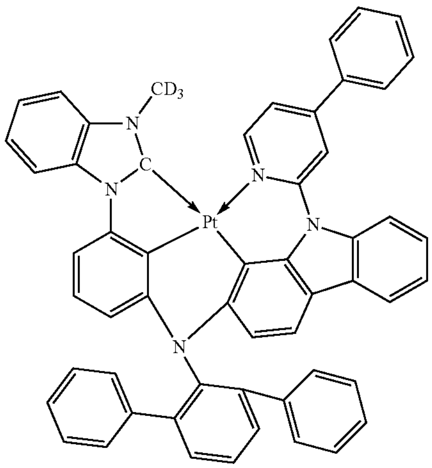
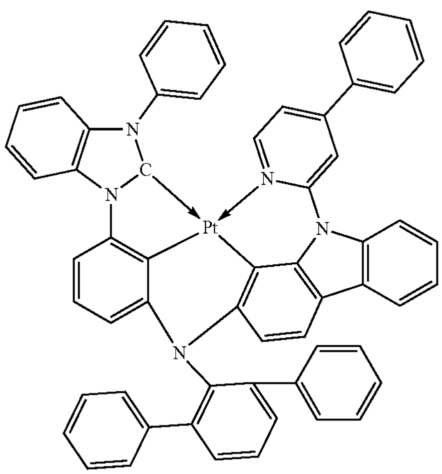
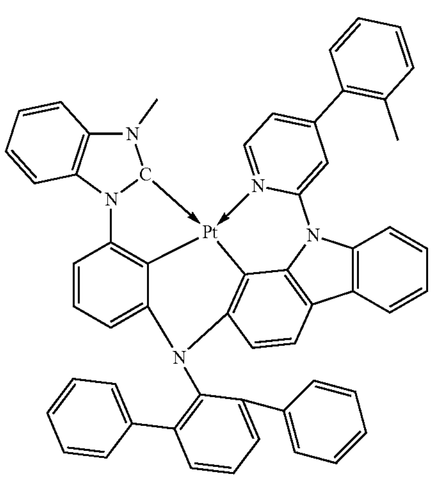
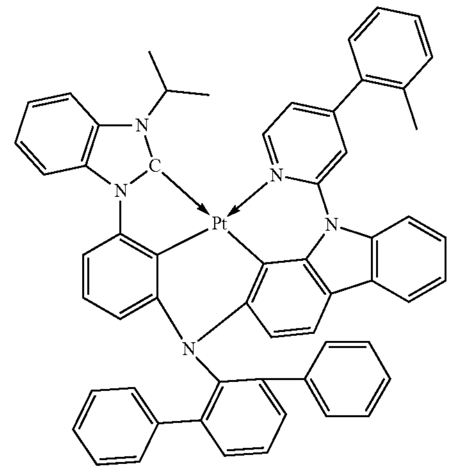
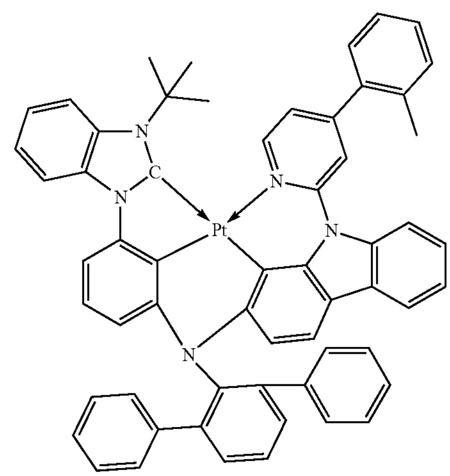
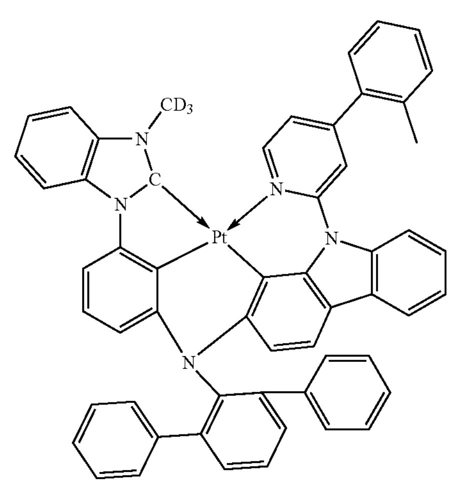

-continued
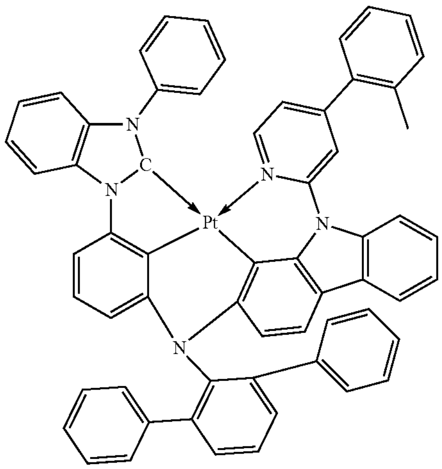
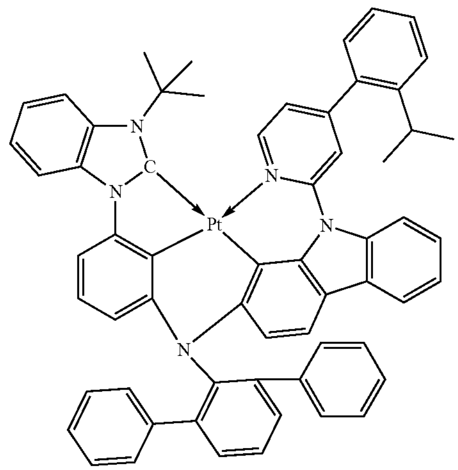
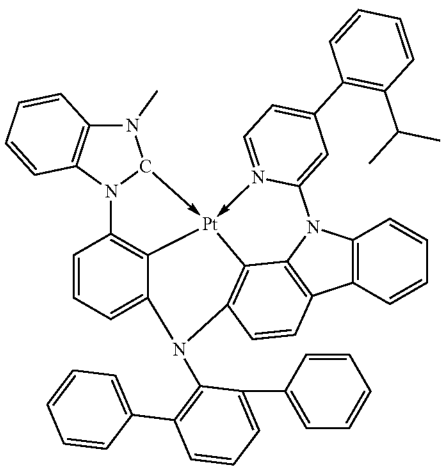
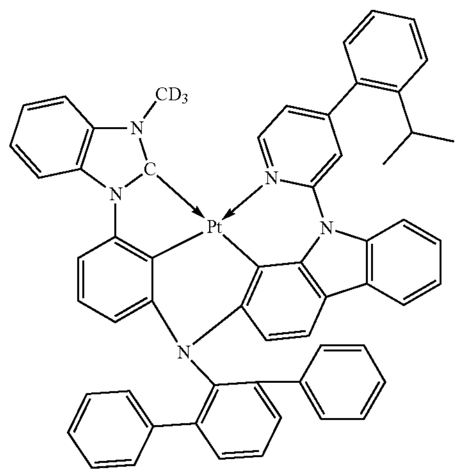
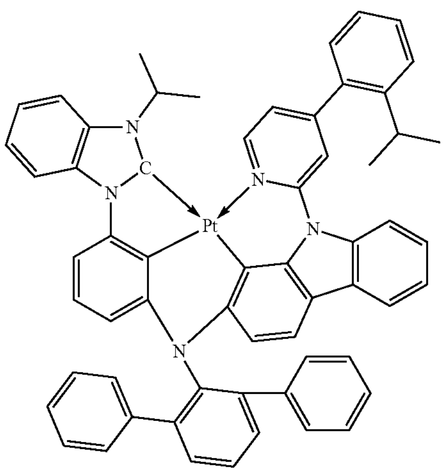
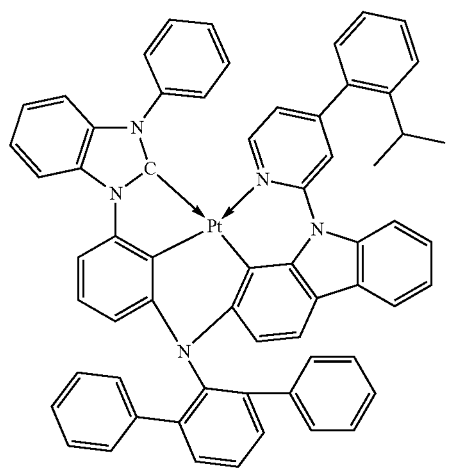
-continued -continued
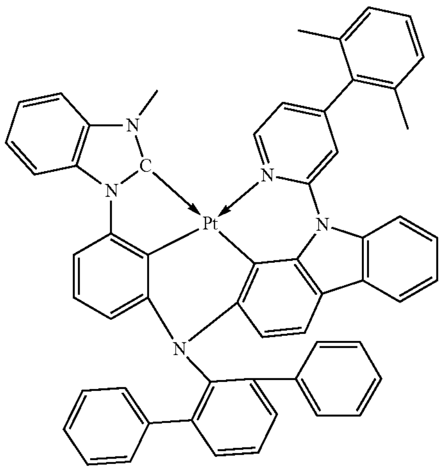
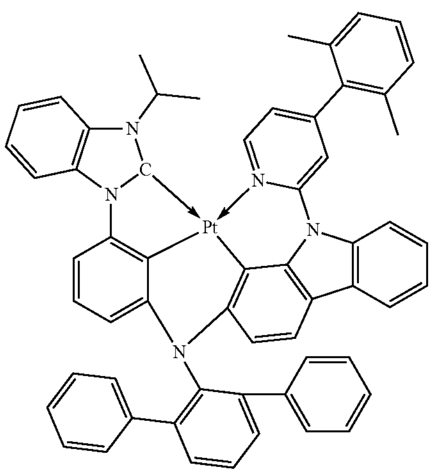
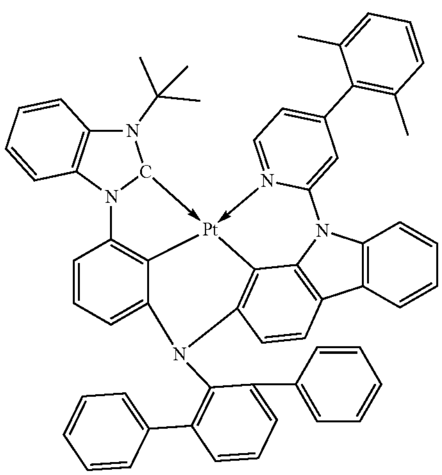
-continued
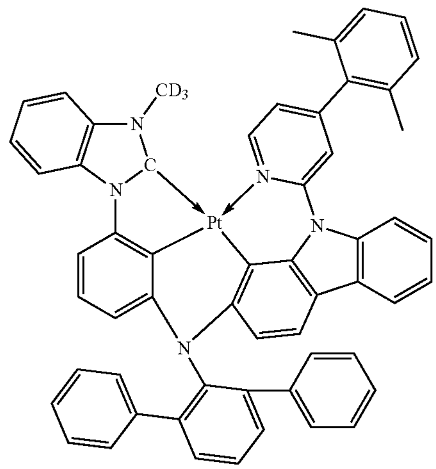
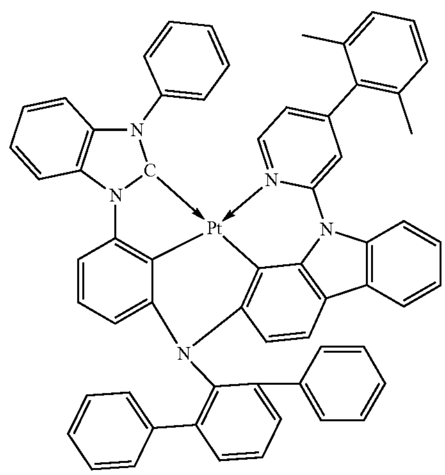
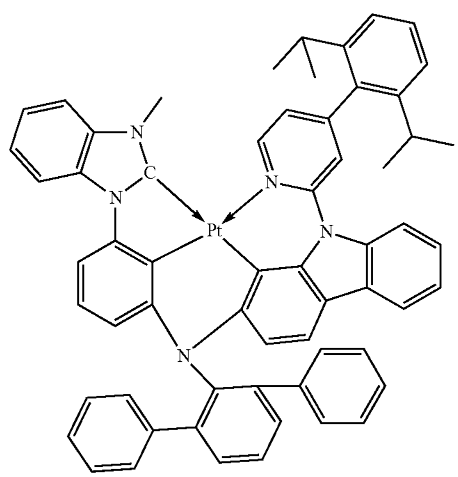

-continued
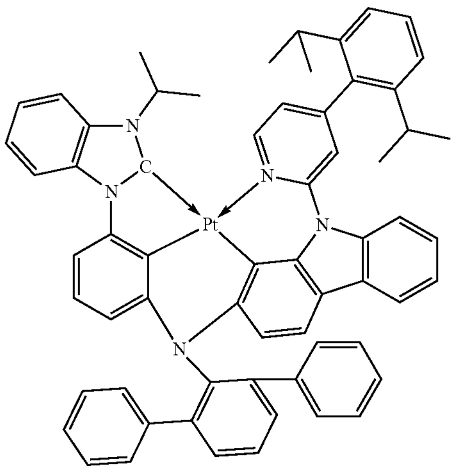
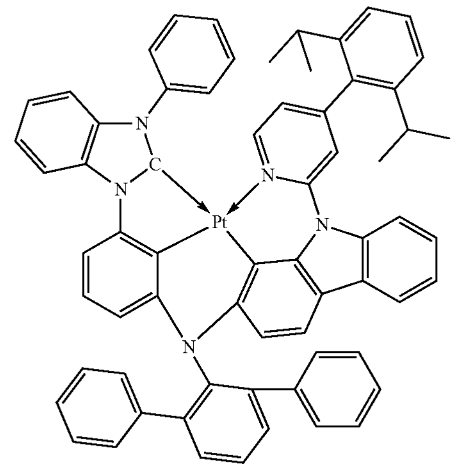
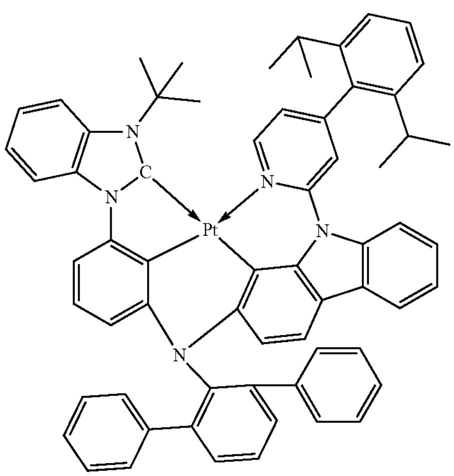
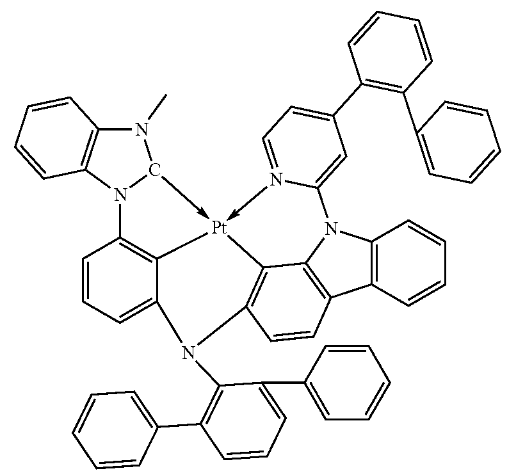
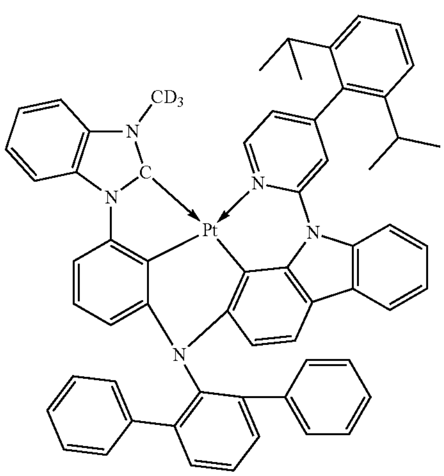
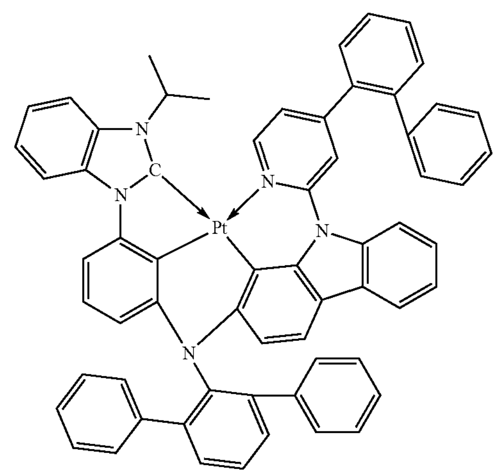
-continued

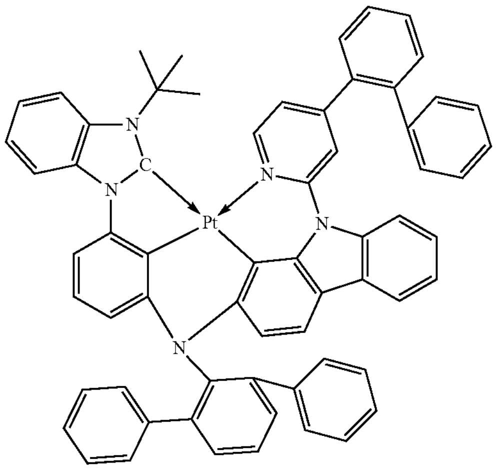
N
C
N
Pt
N
N
N
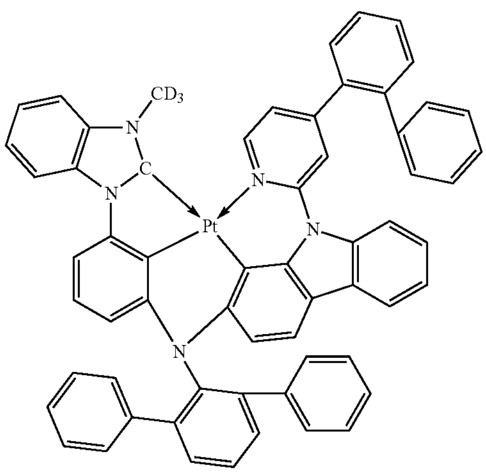
CD3
N
C
N
Pt
N
N
N
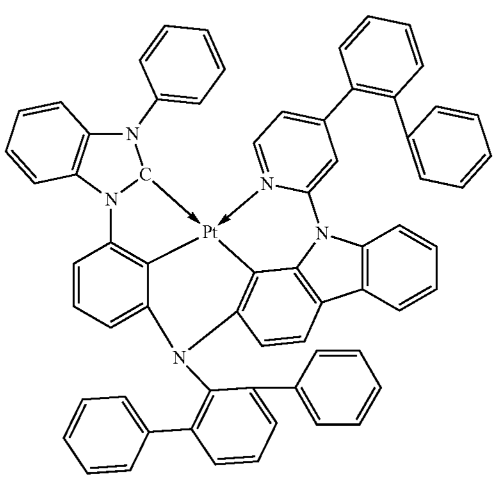
N
C
N
Pt
N
N
N
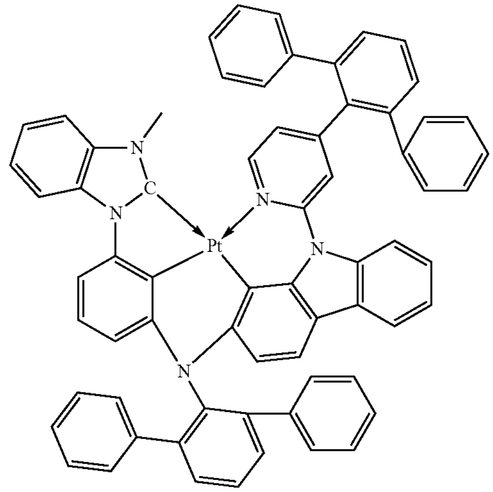
N
C
N
Pt
N
N
N
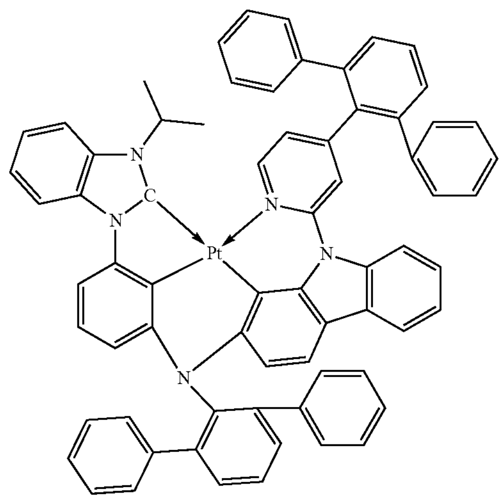
N
C
N
Pt
N
N
N
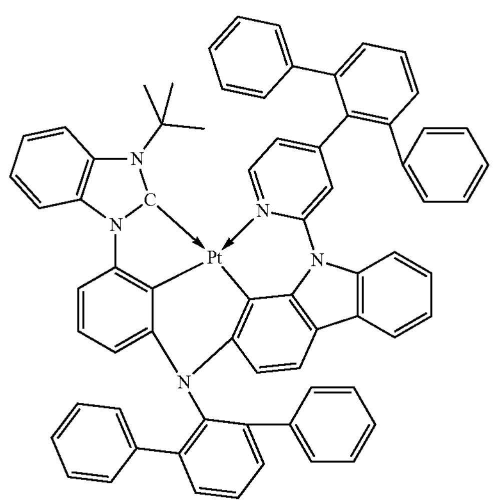
N
C
N
Pt
N
N
N -continued
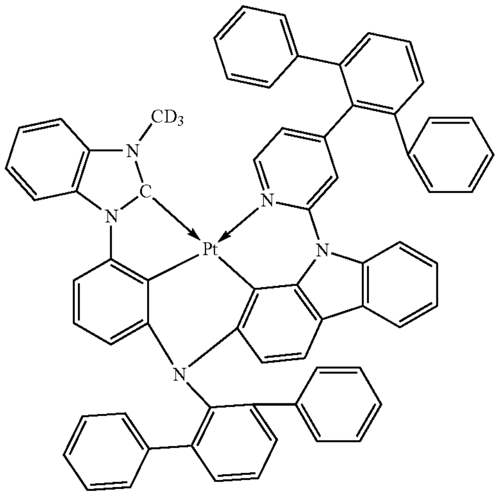
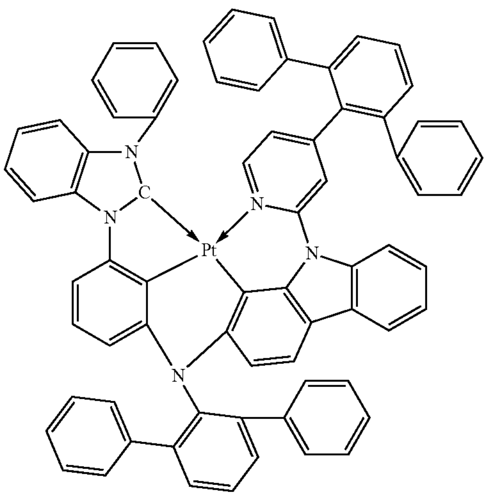
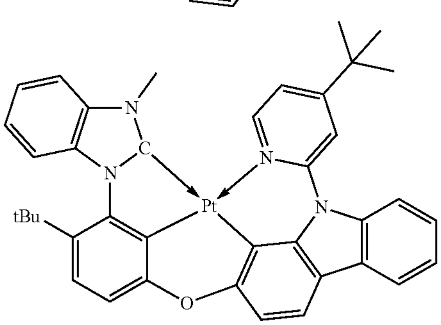
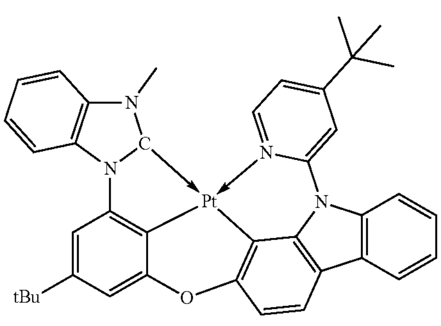
-continued
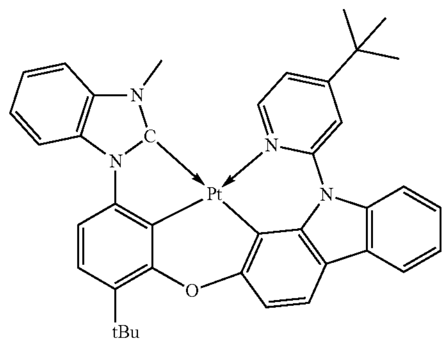
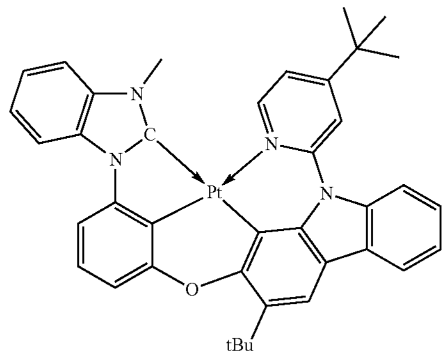
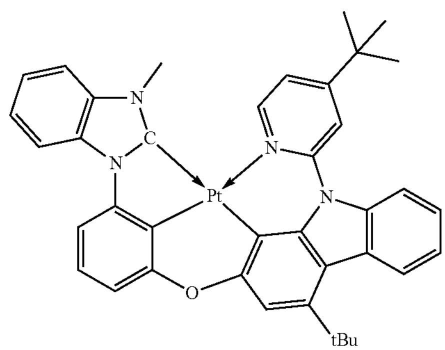
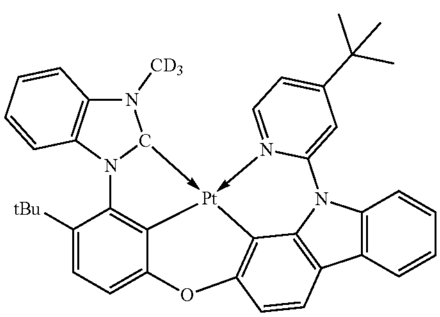
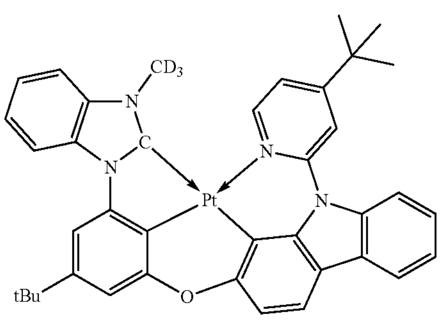

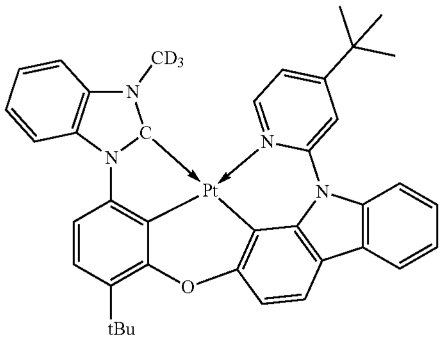
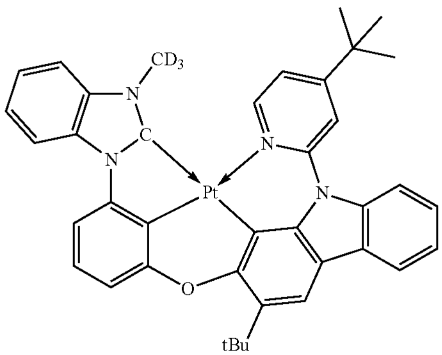
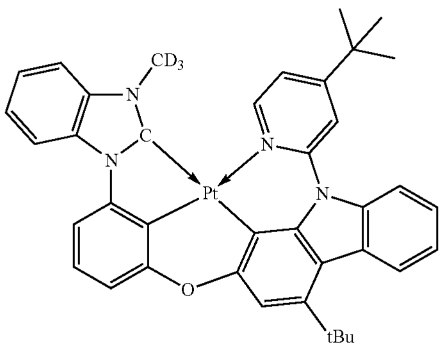
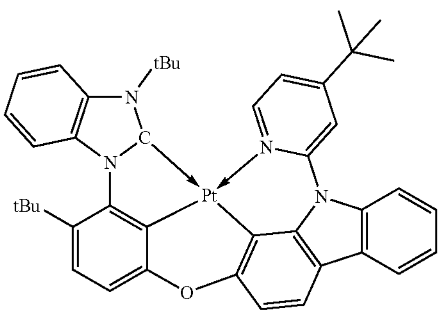
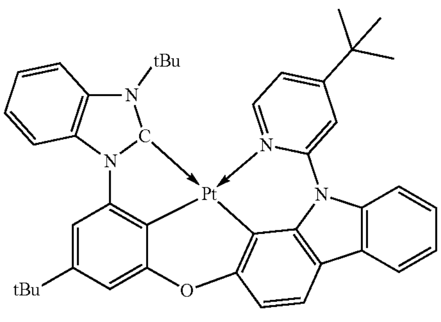
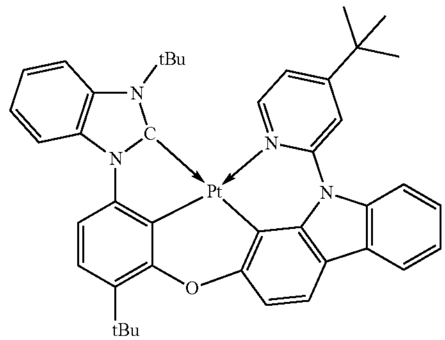
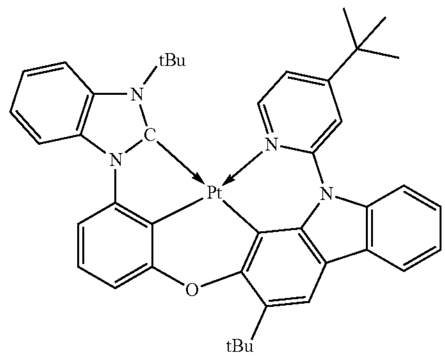
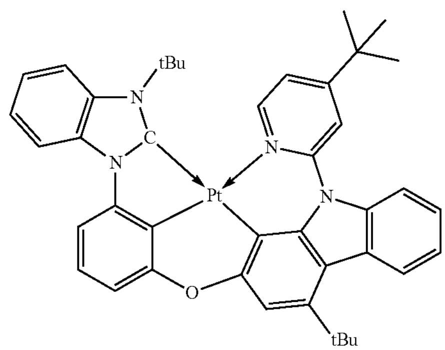
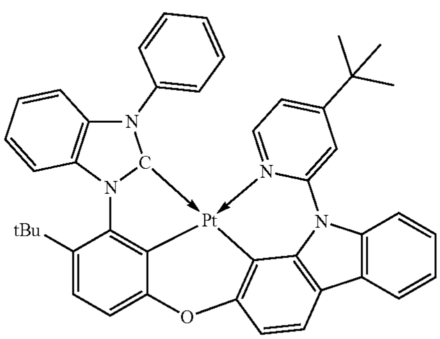
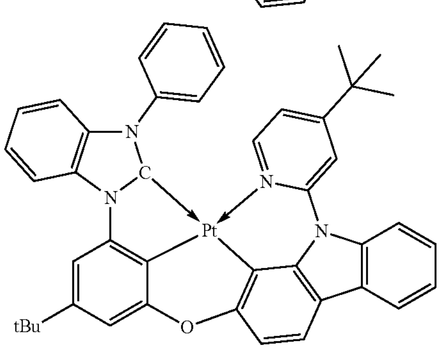

-continued
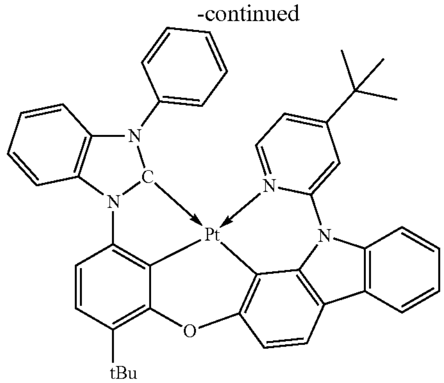
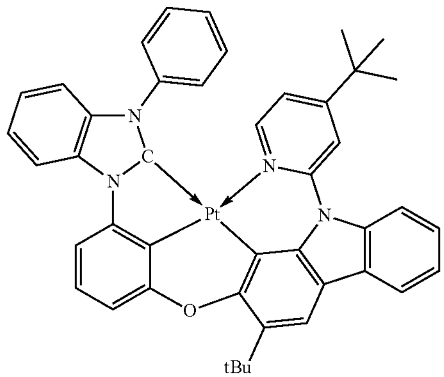
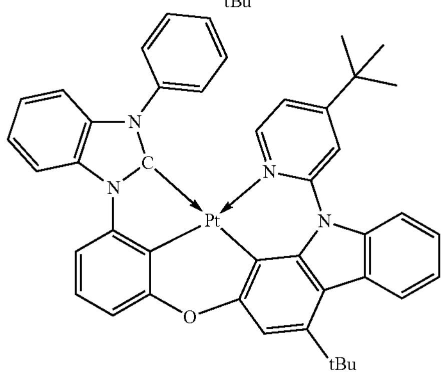
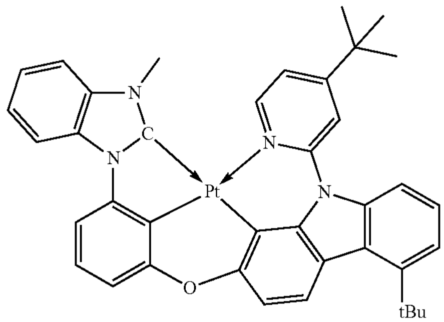
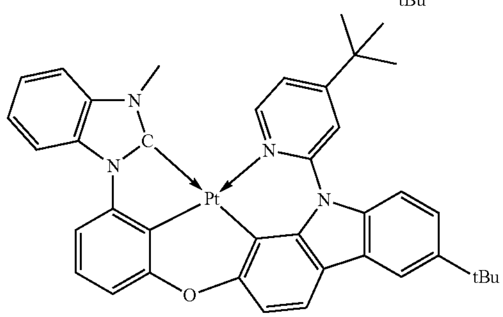
-continued
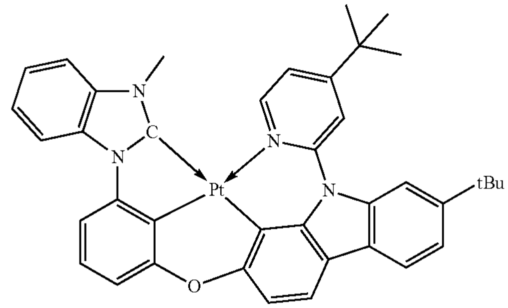
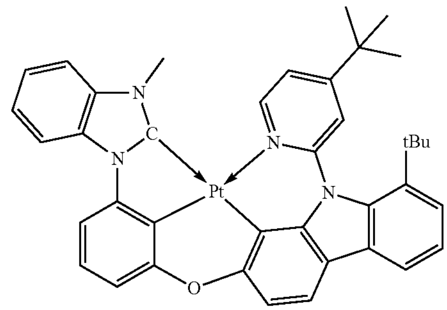
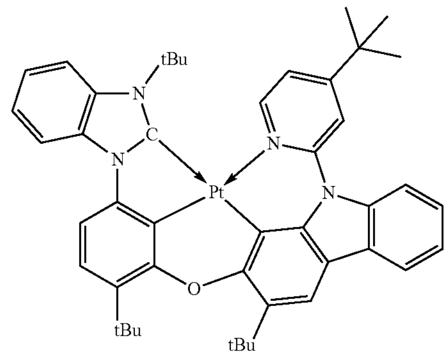
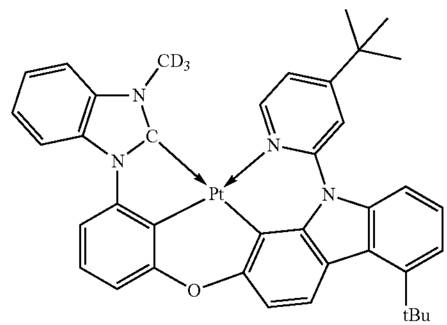
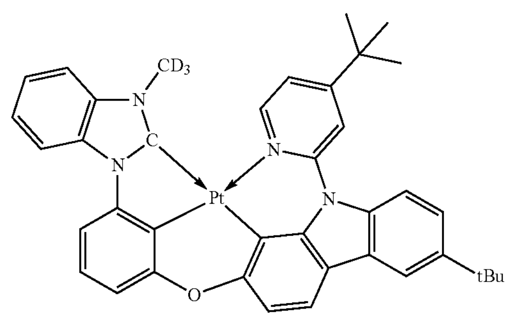

-continued
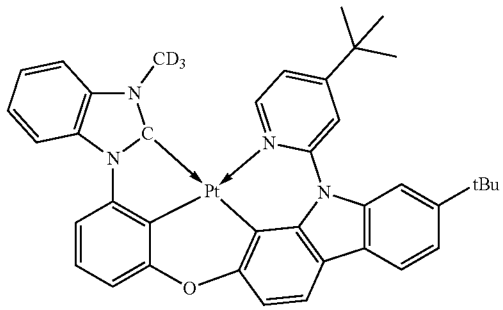
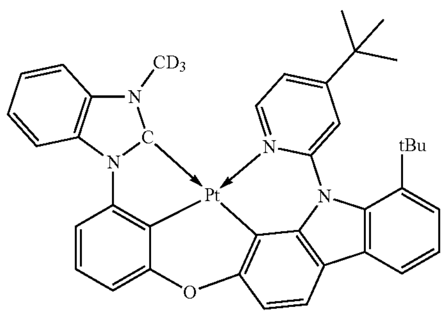
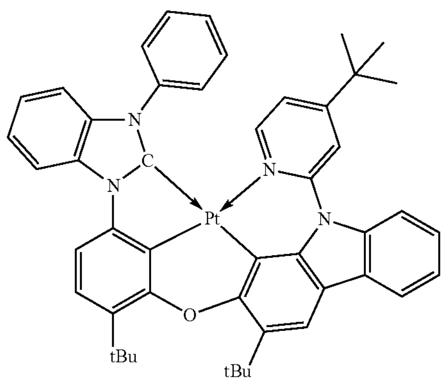
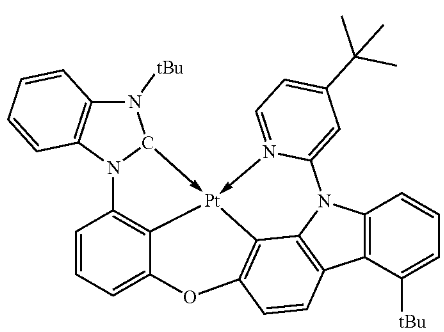
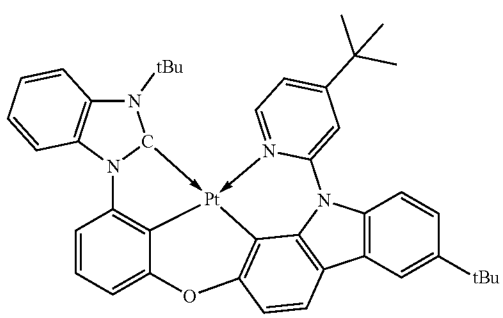
-continued
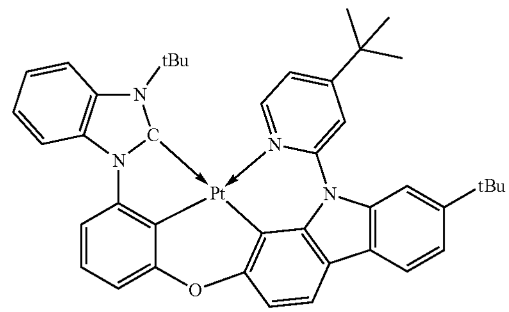
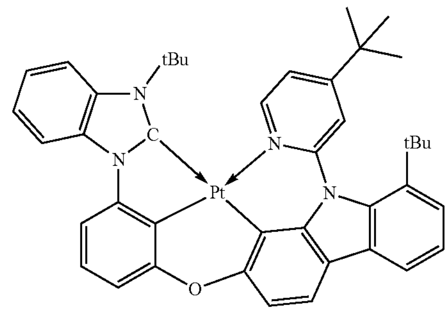
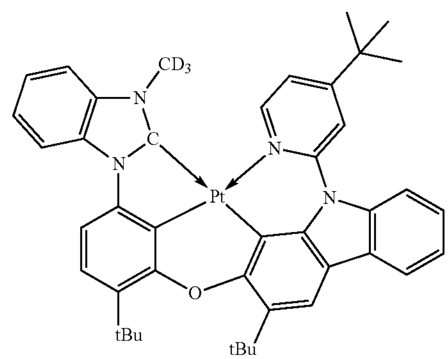
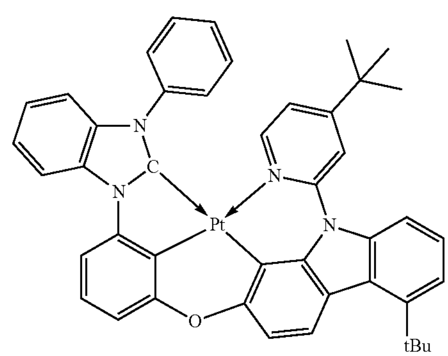
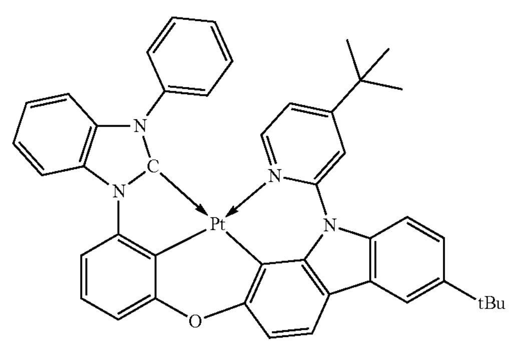

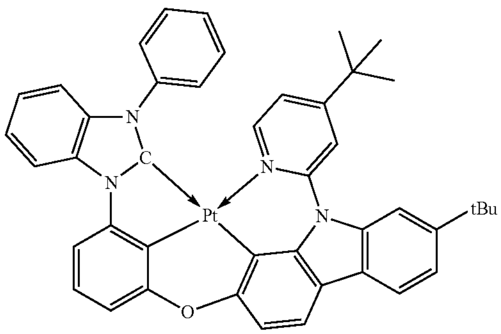
N
C
N
Pt
N
N
tBu
O
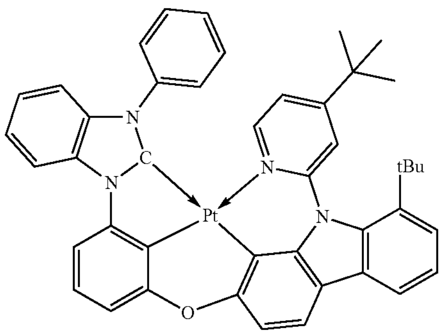
N
C
N
Pt
N
N
tBu
O
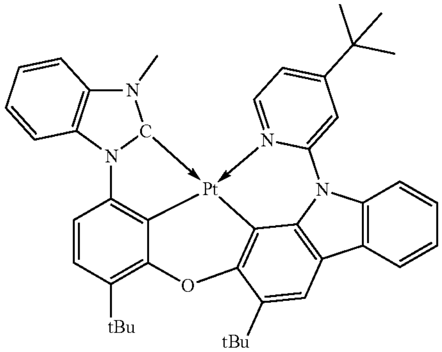
N
C
N
Pt
N
N
O
tBu
tBu
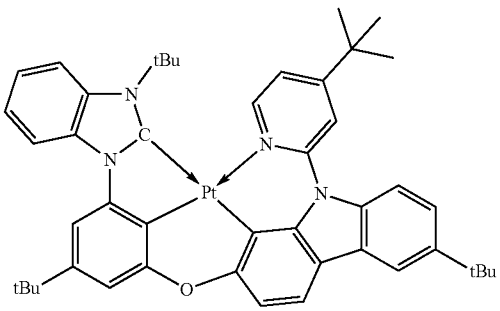
tBu
N
C
N
Pt
N
N
tBu
O
tBu
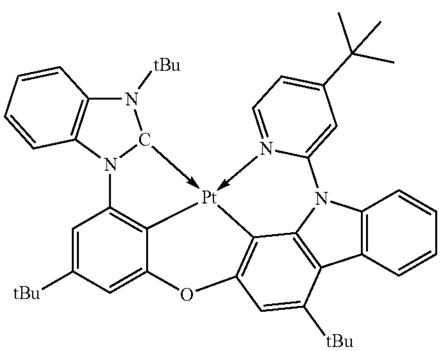
tBu
N
C
N
Pt
N
N
tBu
O
tBu
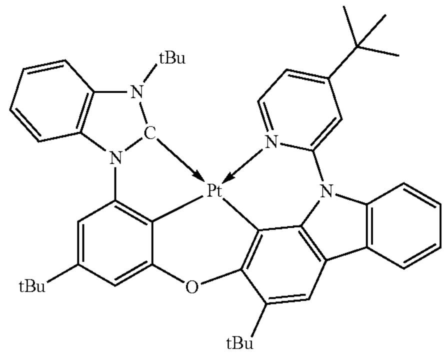
tBu
N
C
N
Pt
N
N
tBu
O
tBu
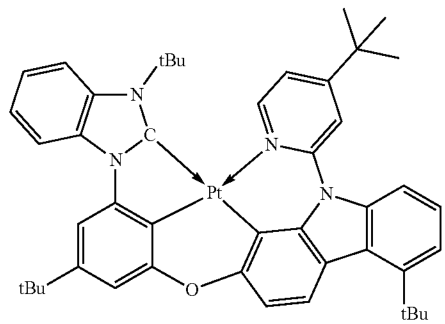
tBu
N
C
N
Pt
N
N
tBu
O
tBu
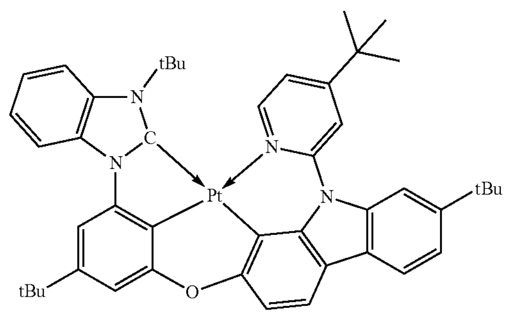
tBu
N
C
N
Pt
N
N
tBu
tBu
O
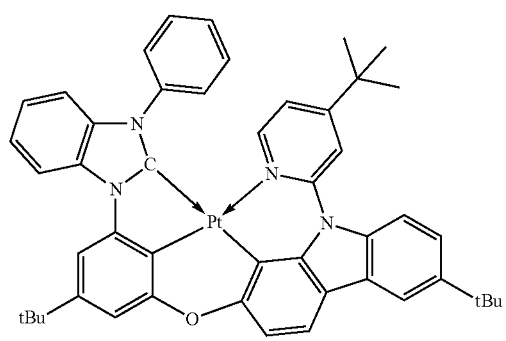
N
C
N
Pt
N
N
tBu
O
tBu
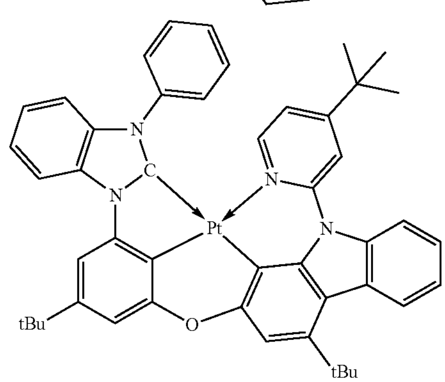
N
C
N
Pt
N
N
tBu
O
tBu

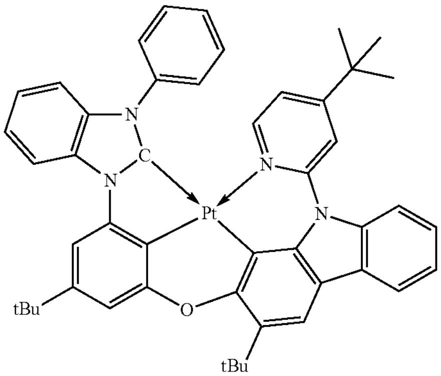
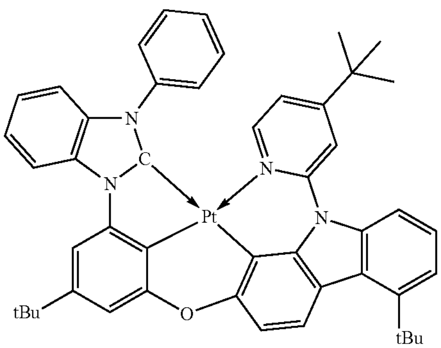
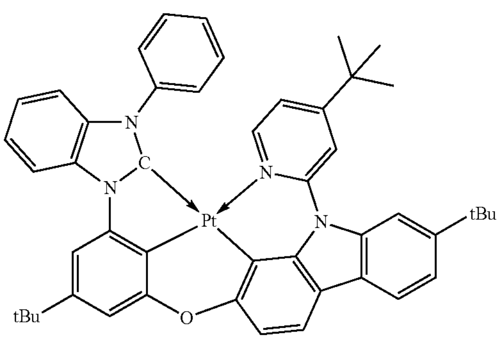
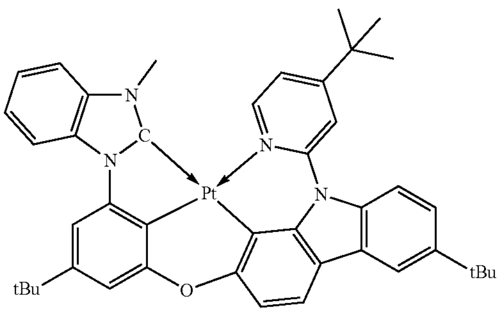
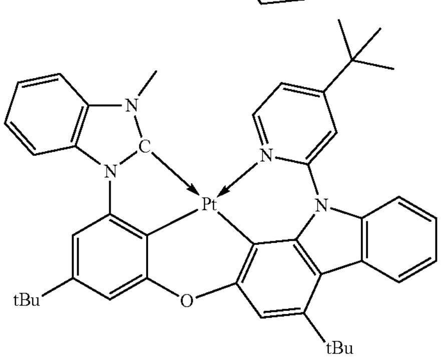
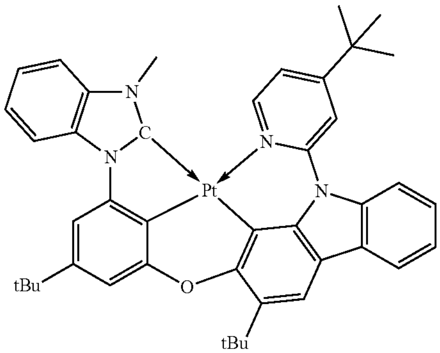
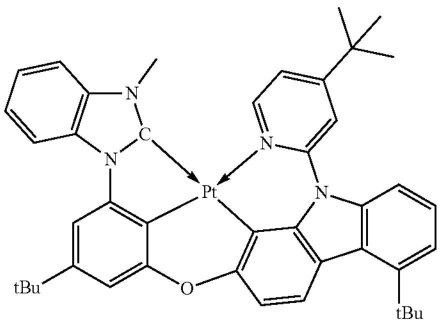
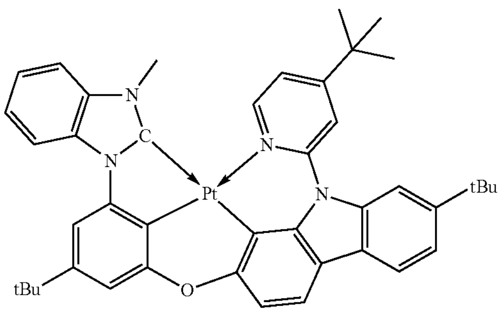
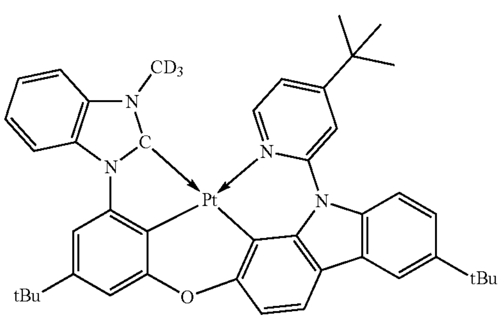
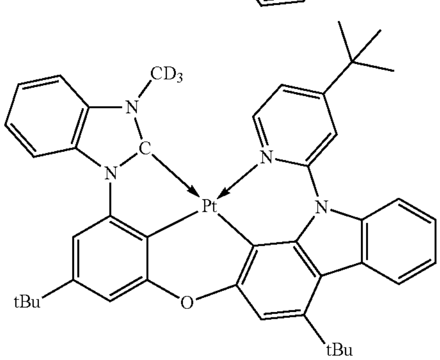

-continued
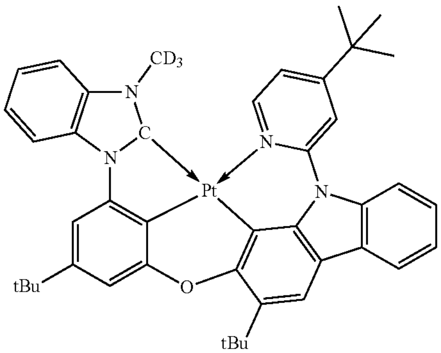
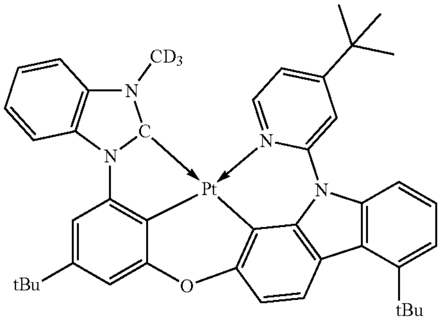
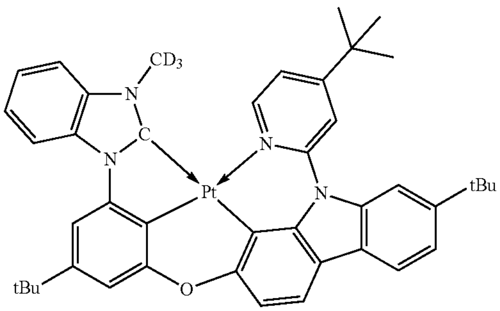
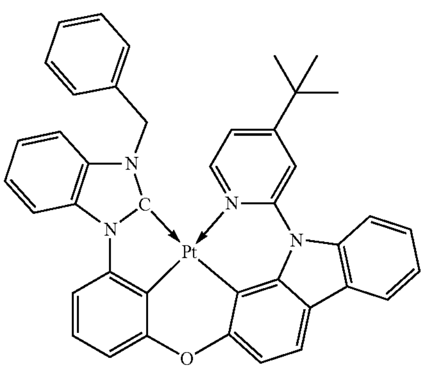
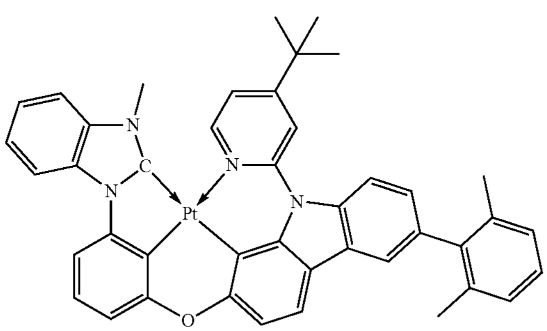
-continued
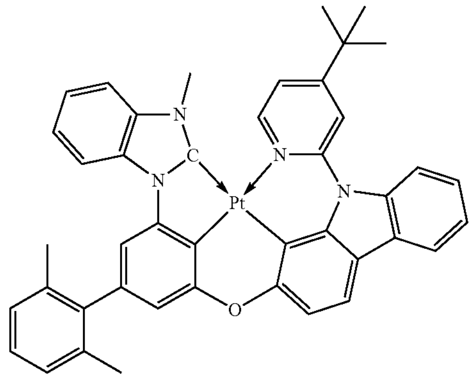
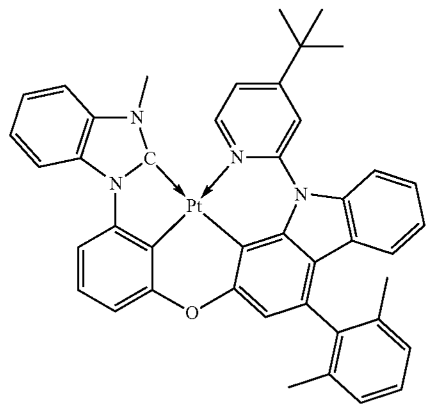
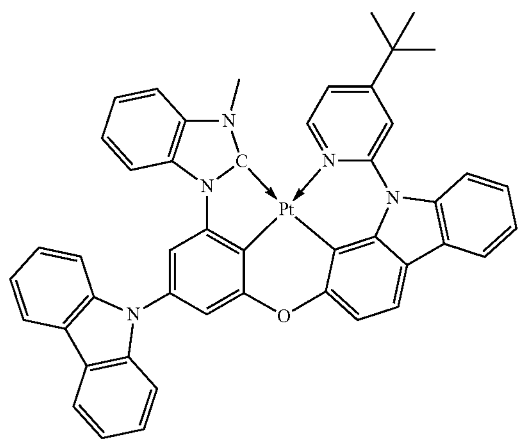
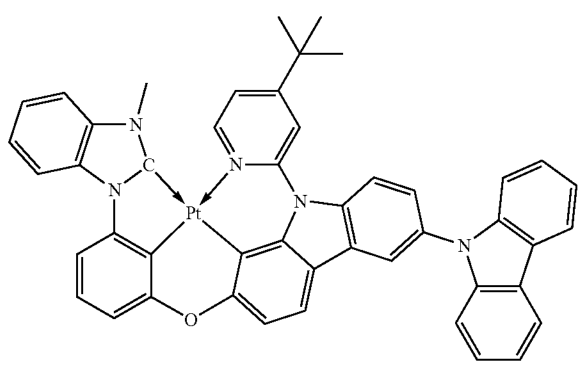

Group IV
1
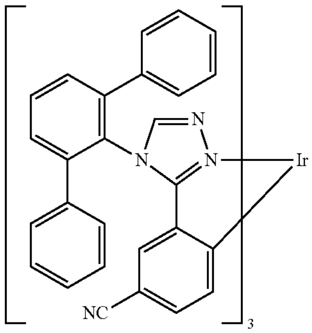
2
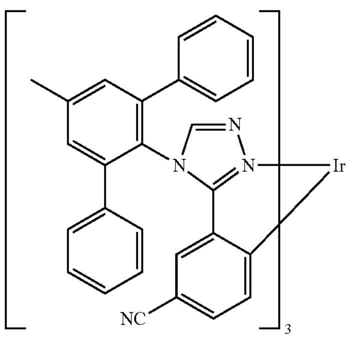
3
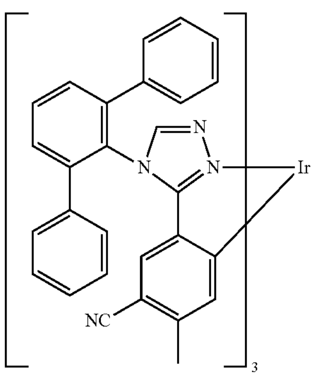
4
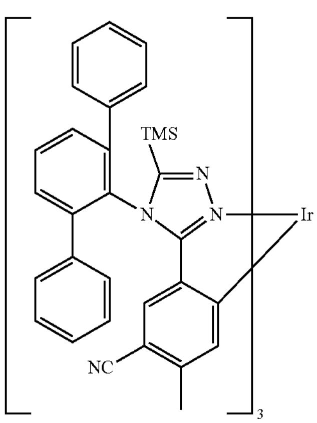
-continued
5
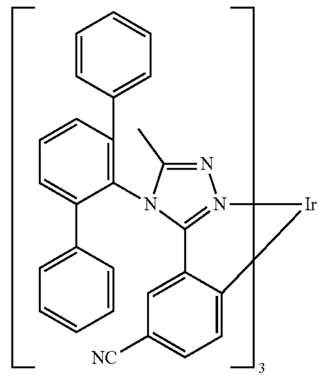
6
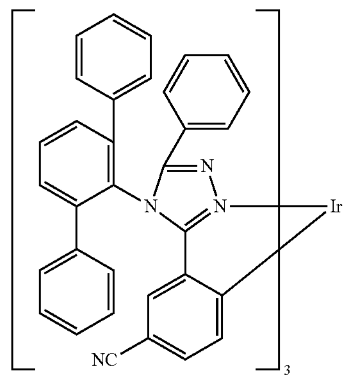
7
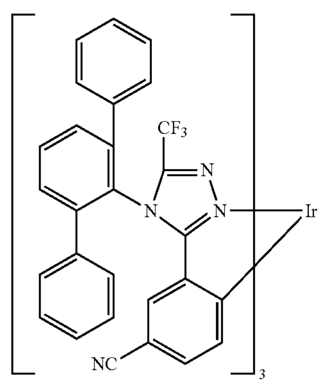
8
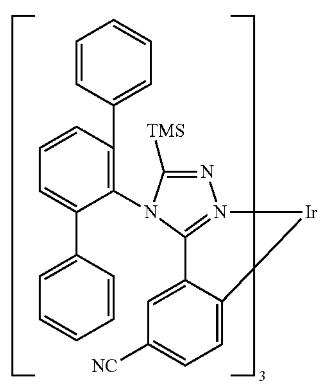

-continued
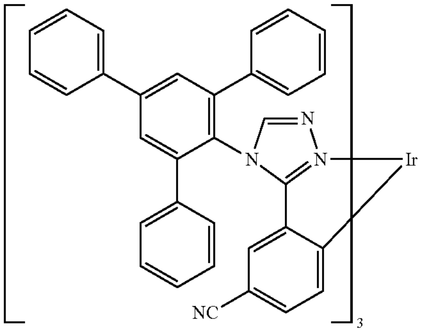
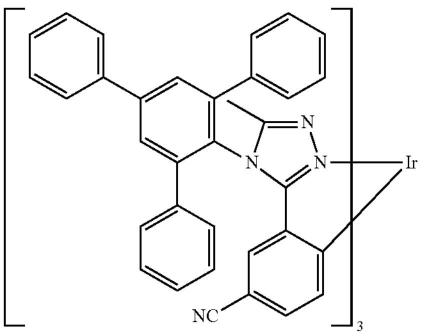
Group V
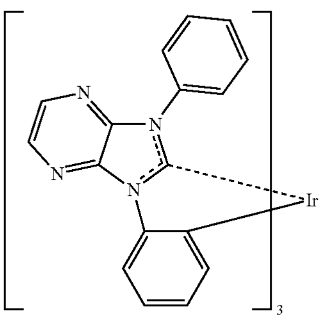
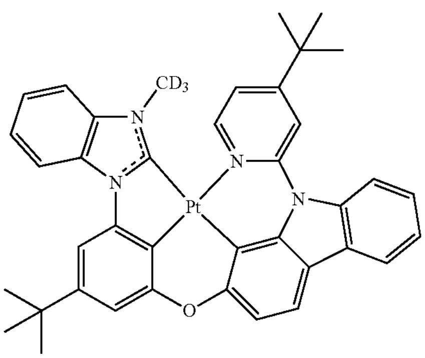
-continued
9
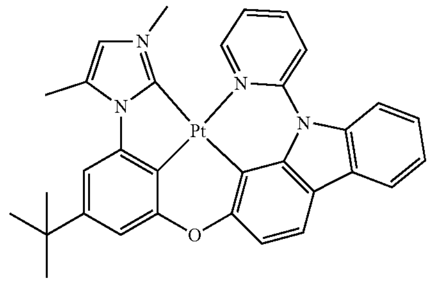
10
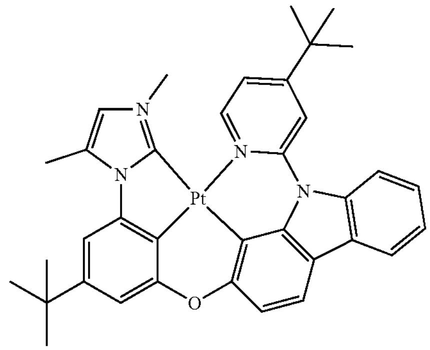
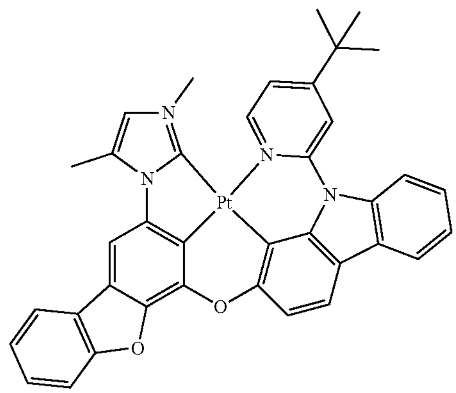
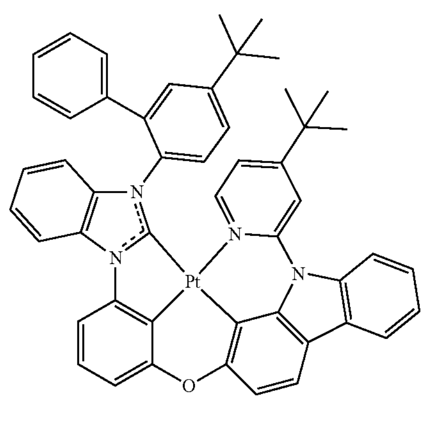

-continued
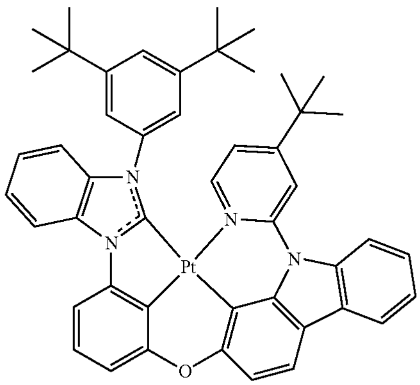
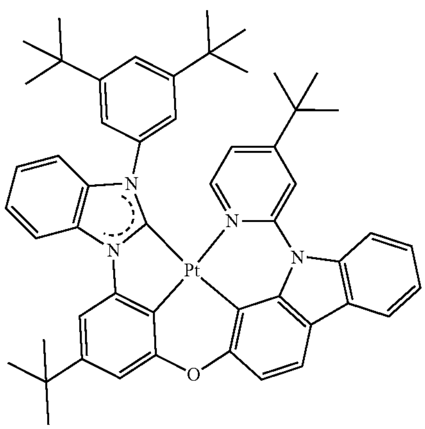
Group VI
1
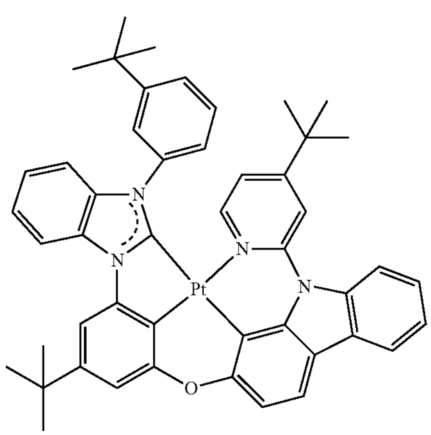
-continued
2
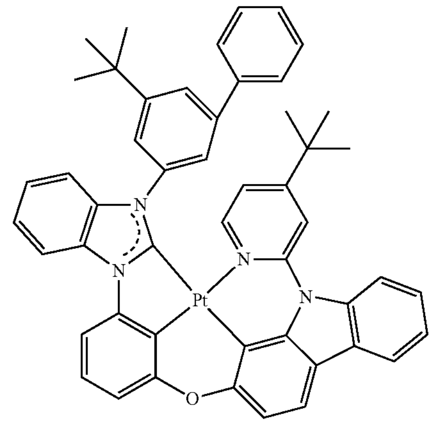
3
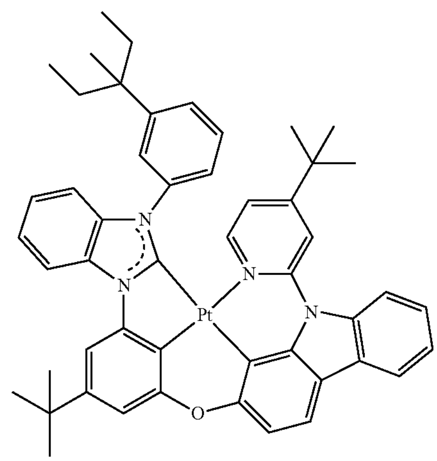
4
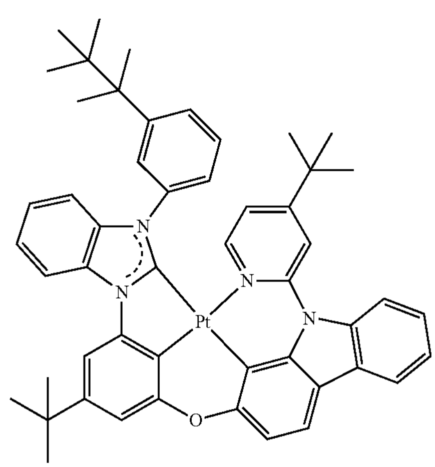

-continued
5
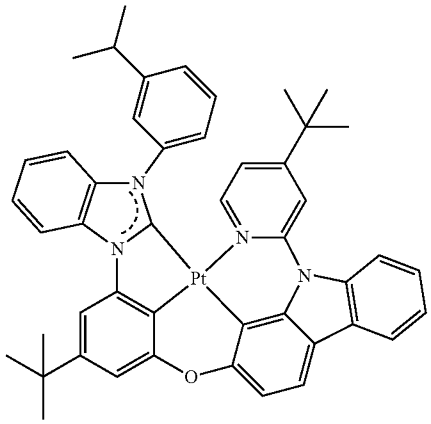
6
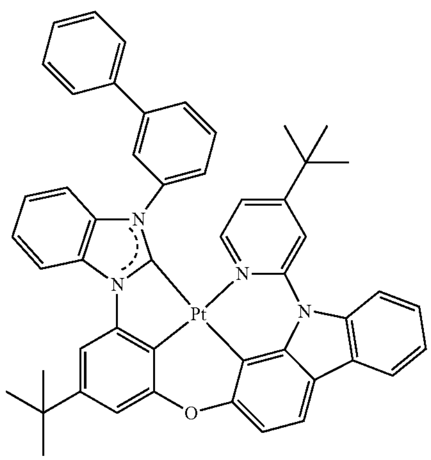
7
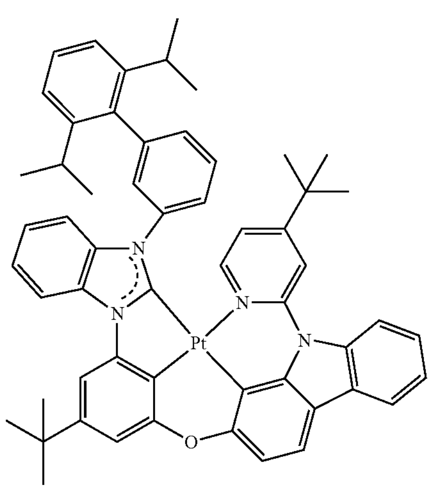
-continued
8
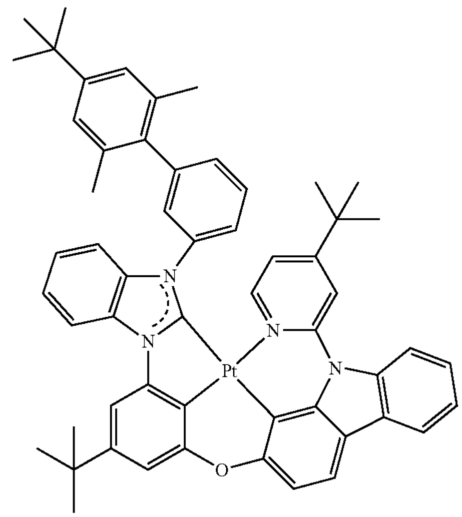
9
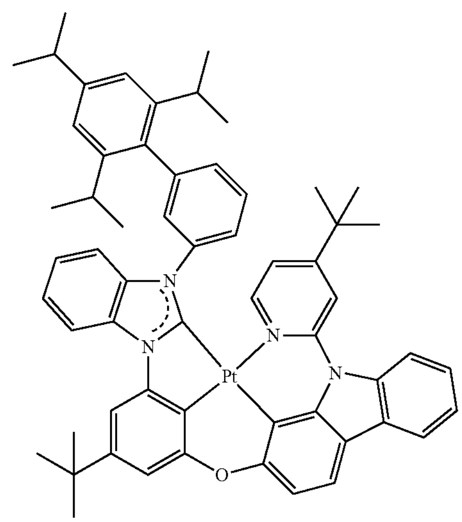
10
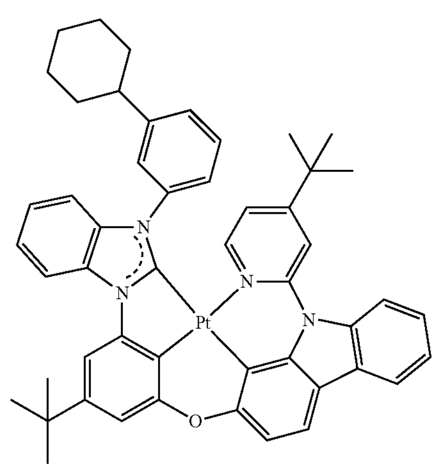

-continued
11
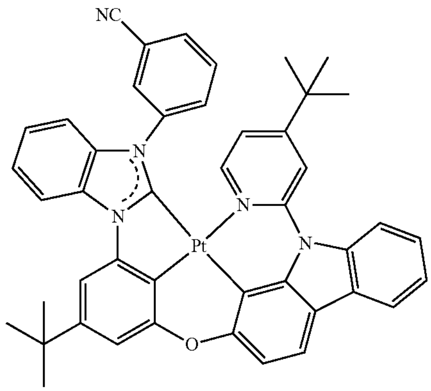
12
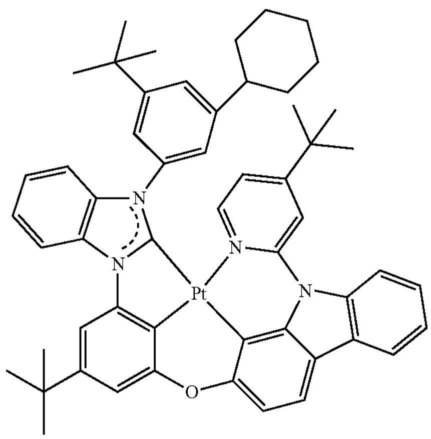
13
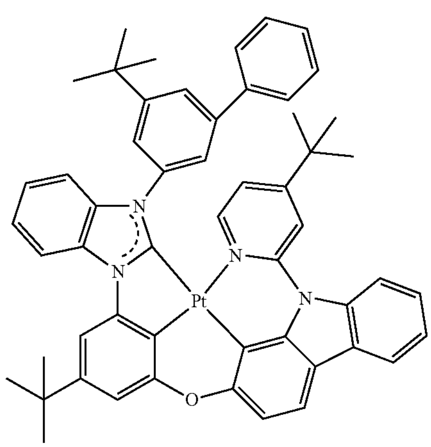
-continued
14
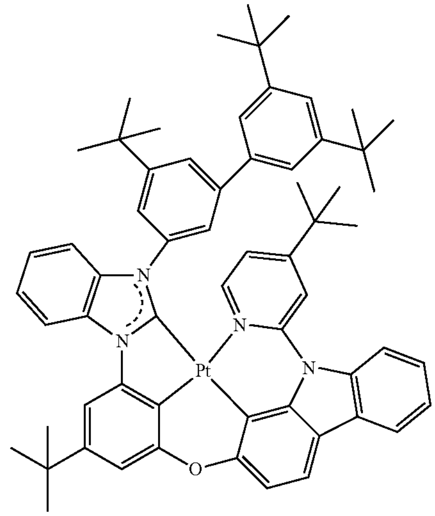
15
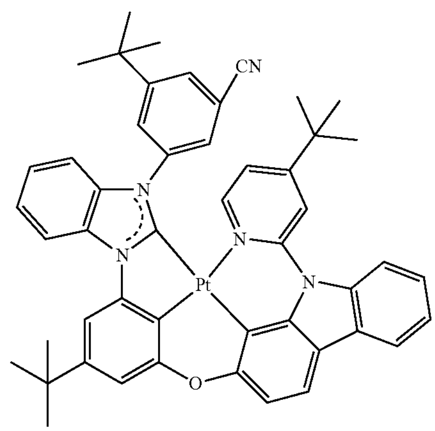
16
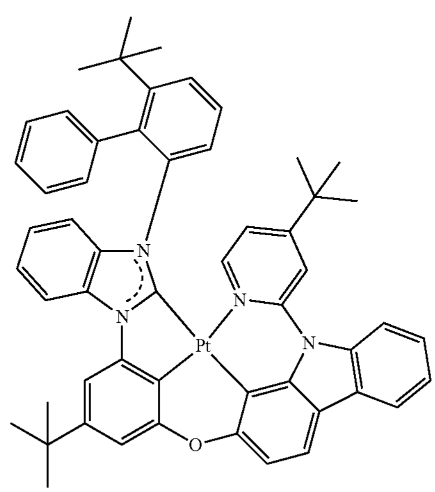

-continued
17
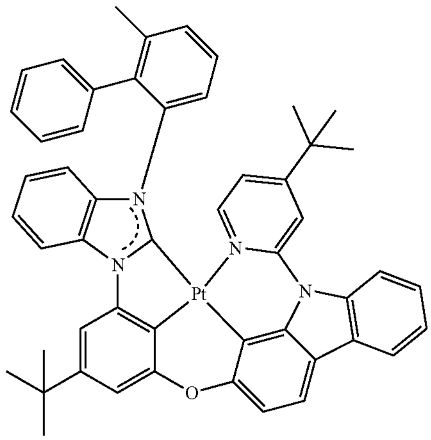
18
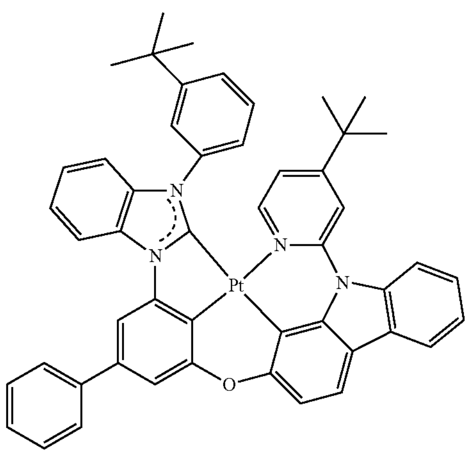
19
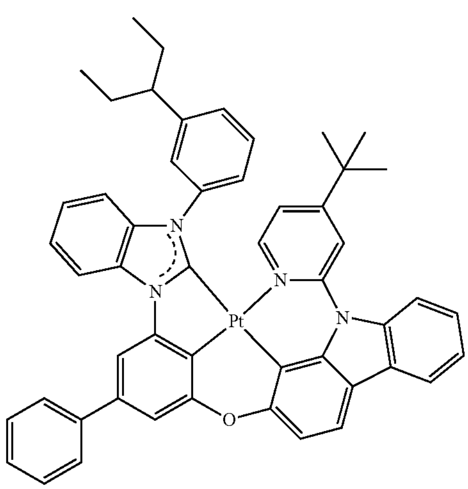
-continued
20
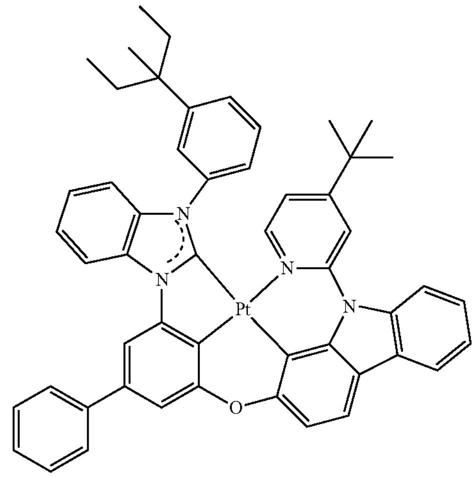
21
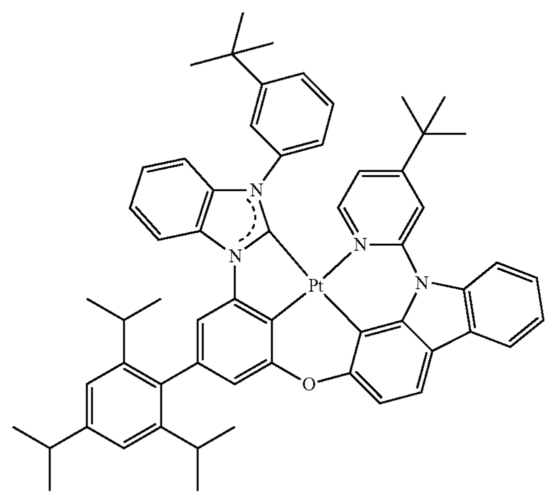
22
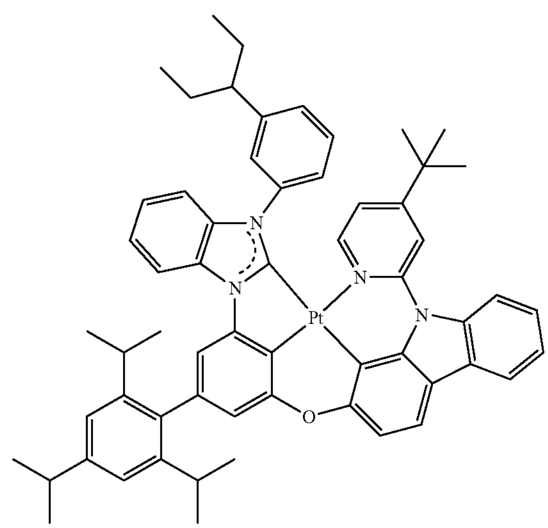

-continued
23
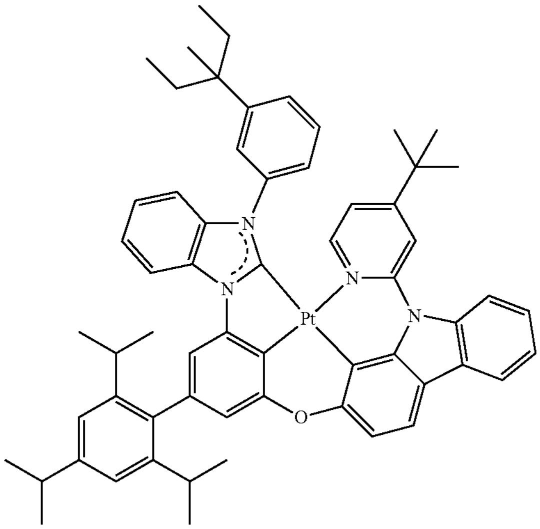
24
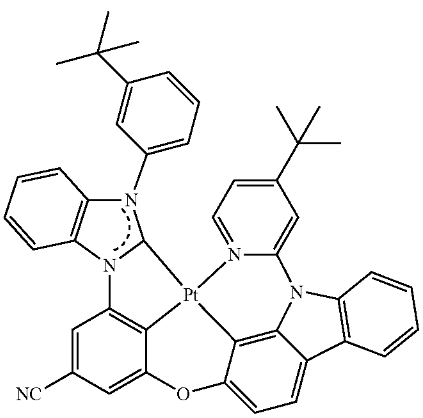
25
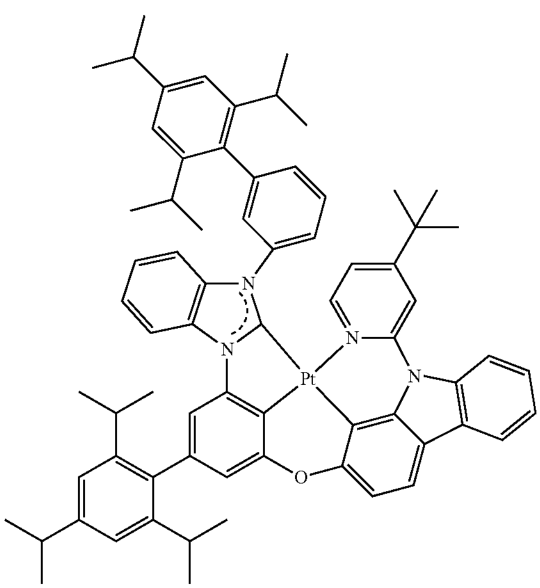
-continued
26
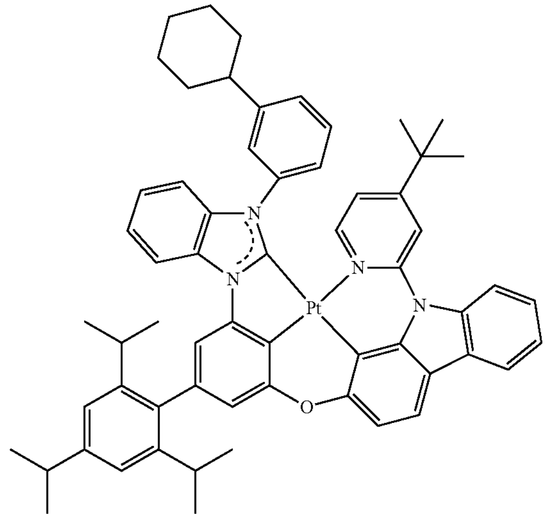
27
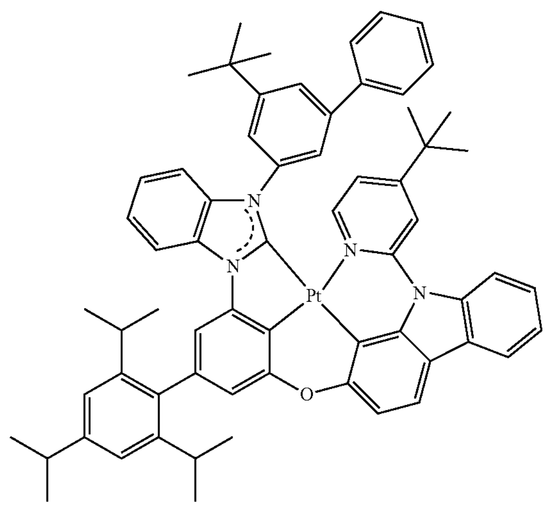
28
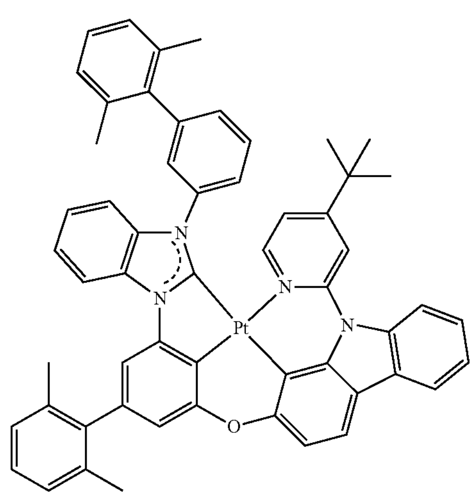

-continued
29
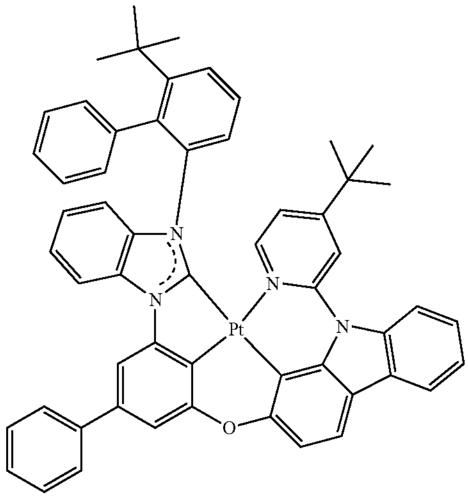
30
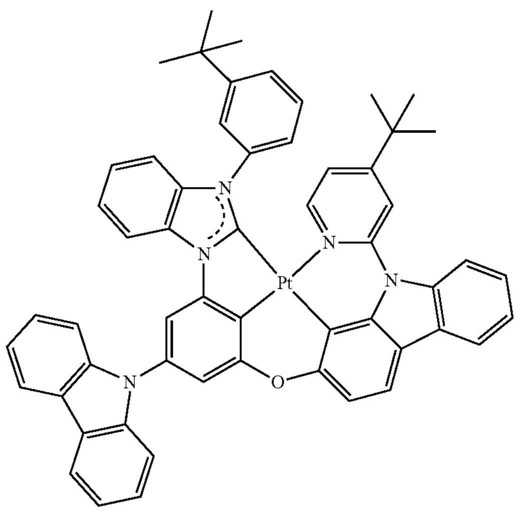
31
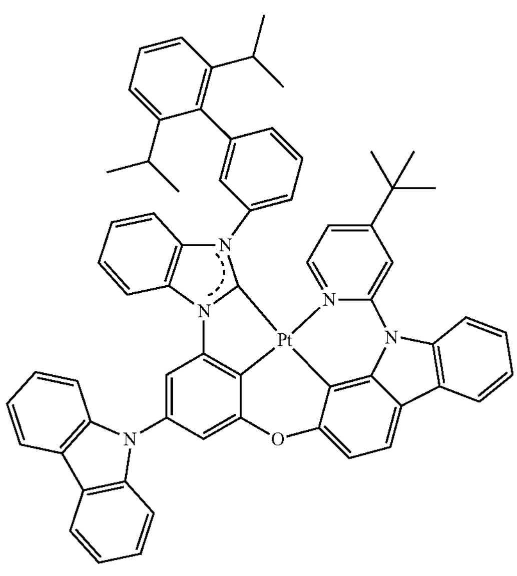
-continued
32
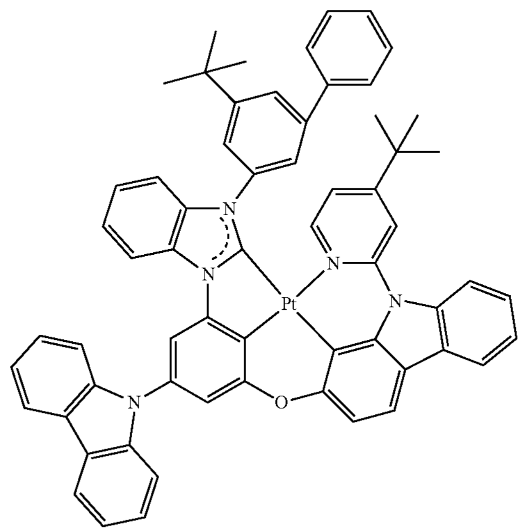
33
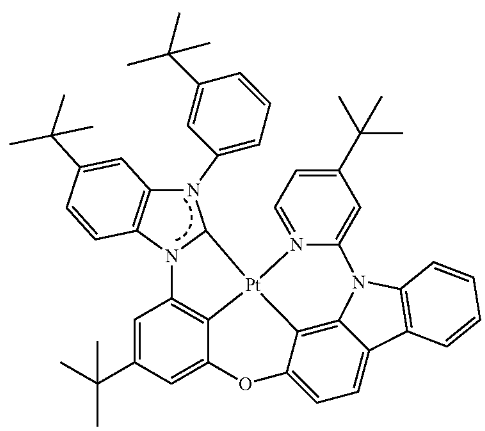
34
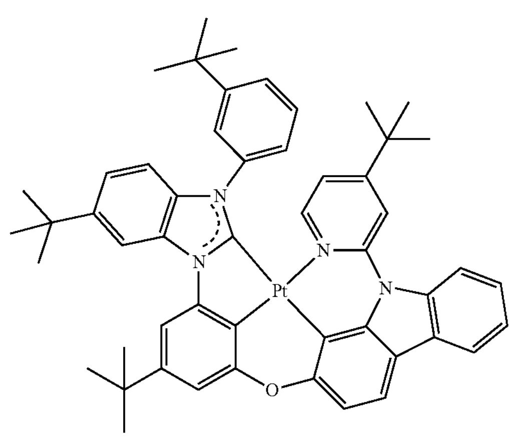

-continued
35
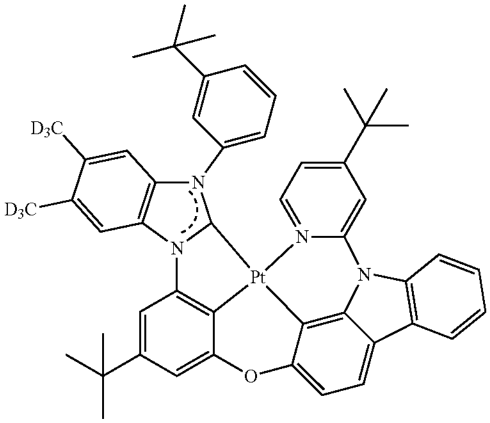
36
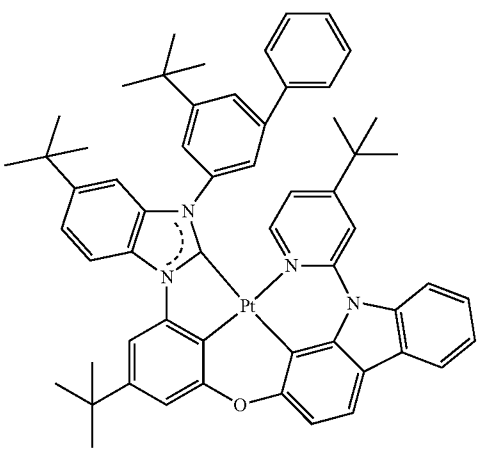
37
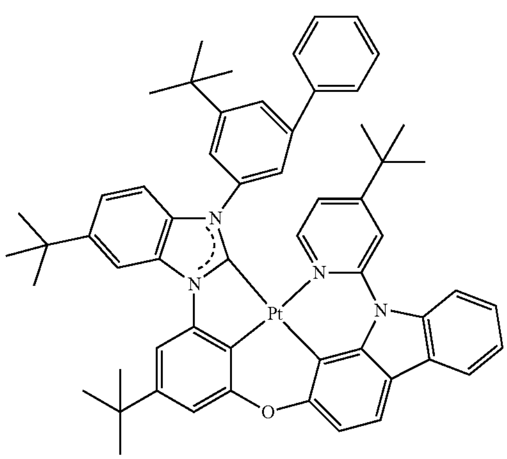
-continued
38
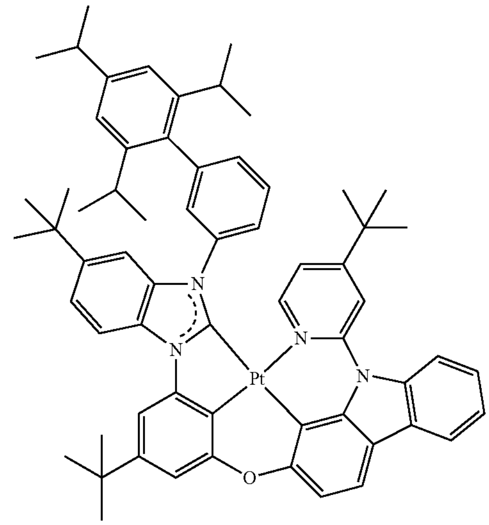
39
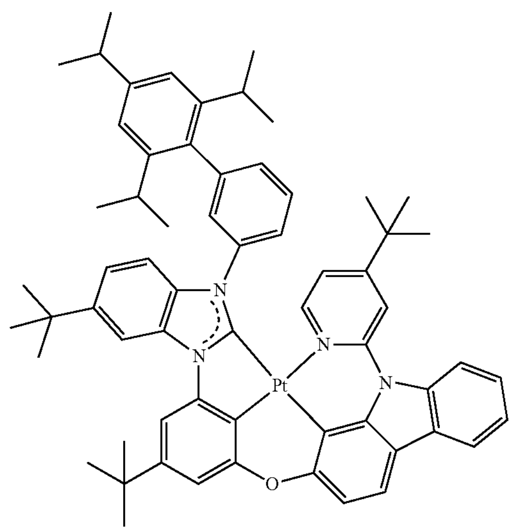
40
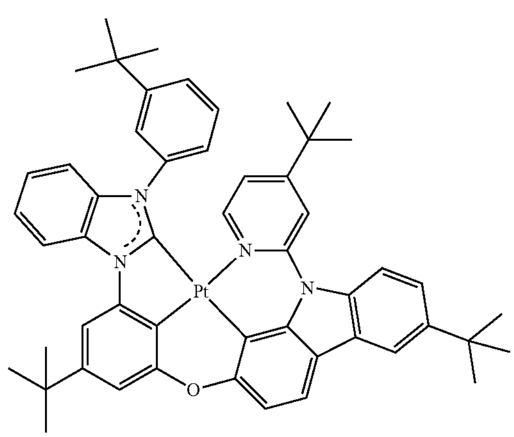

-continued
41
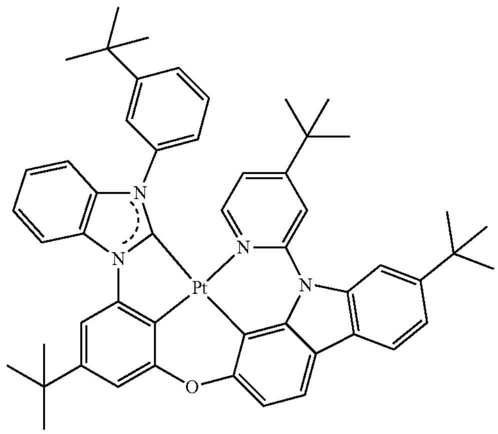
42
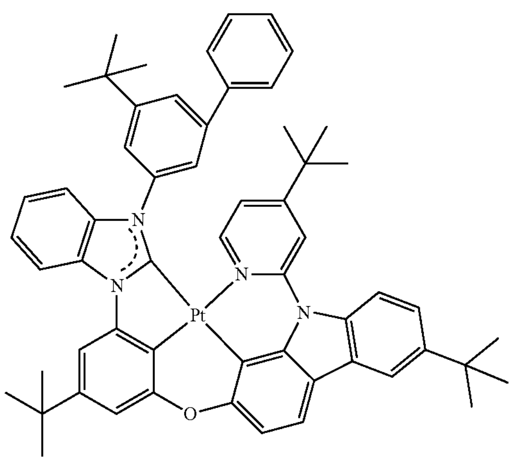
43
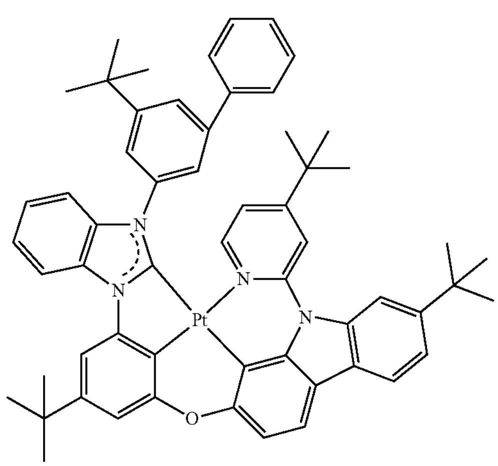
-continued
44
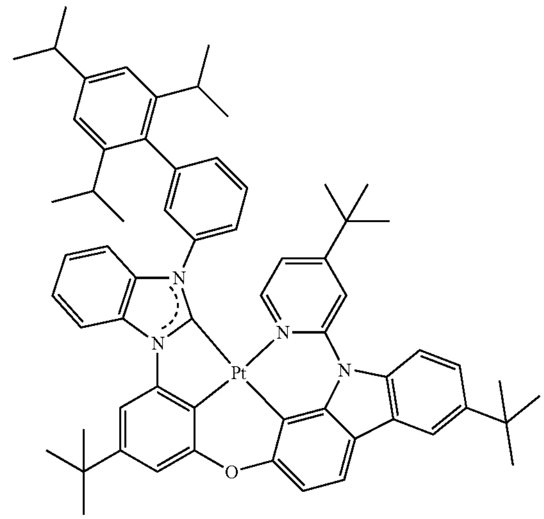
45
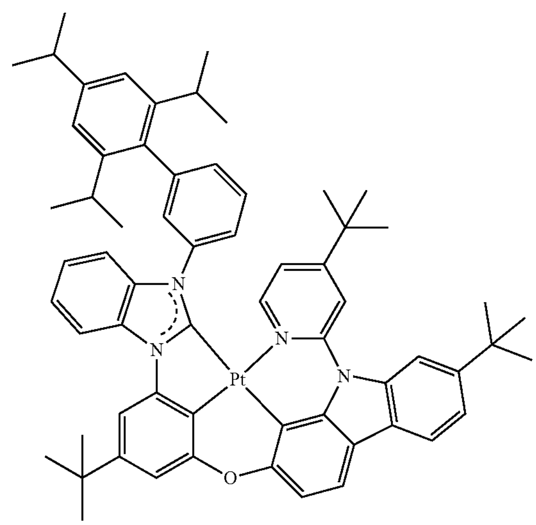
46
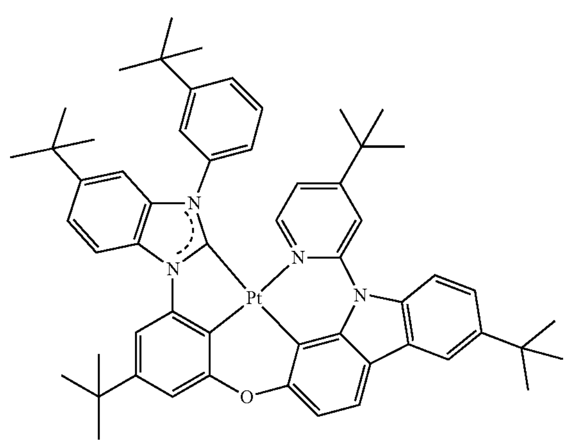

-continued
47
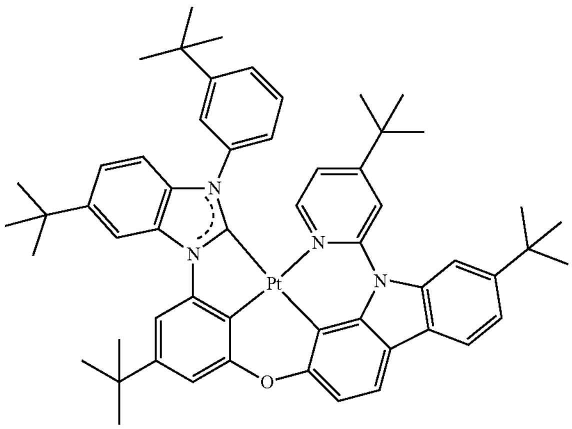
48
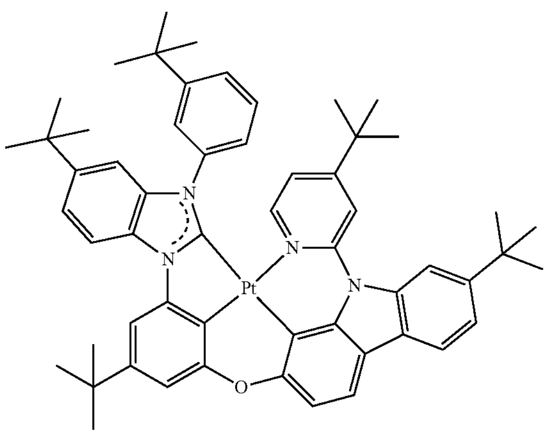
49
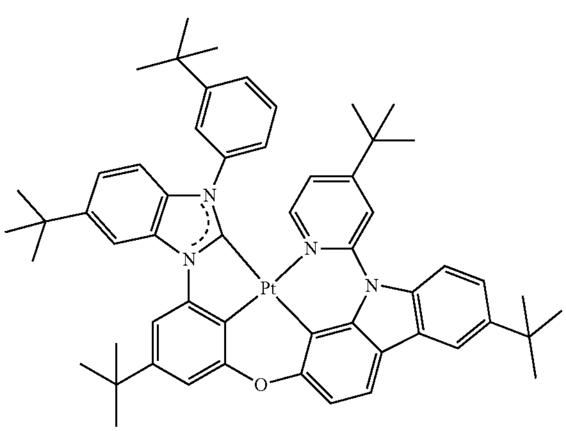
-continued
50
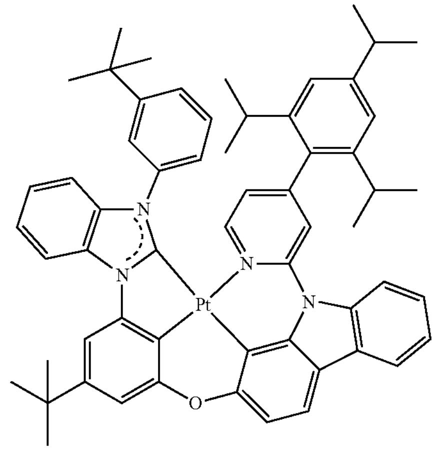
51
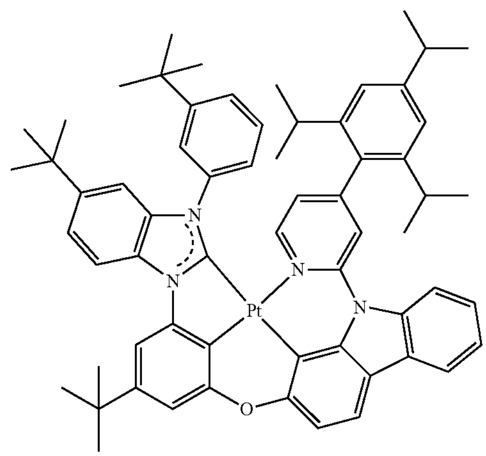
52
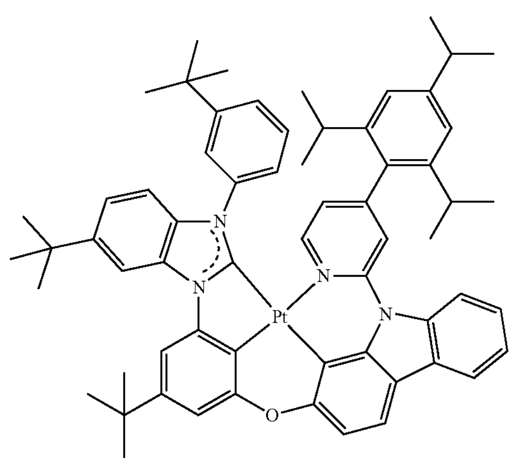

-continued
53
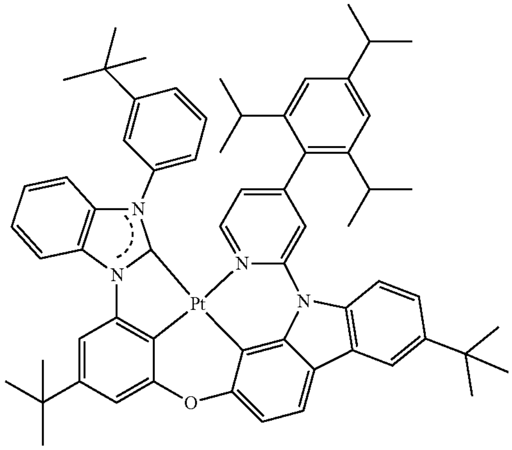
54
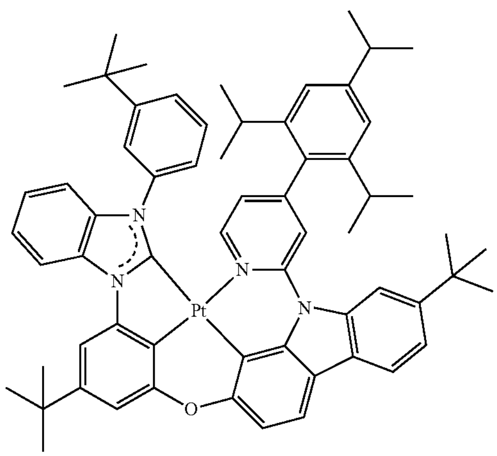
55
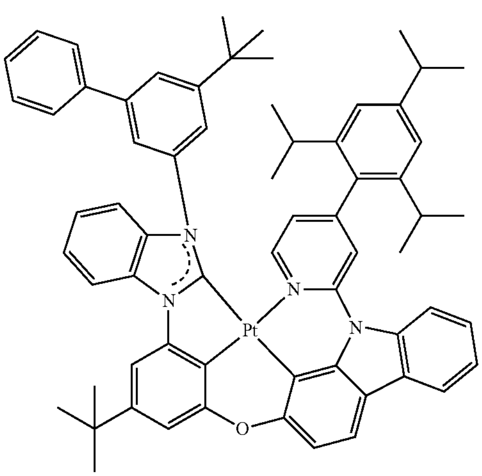
-continued
56
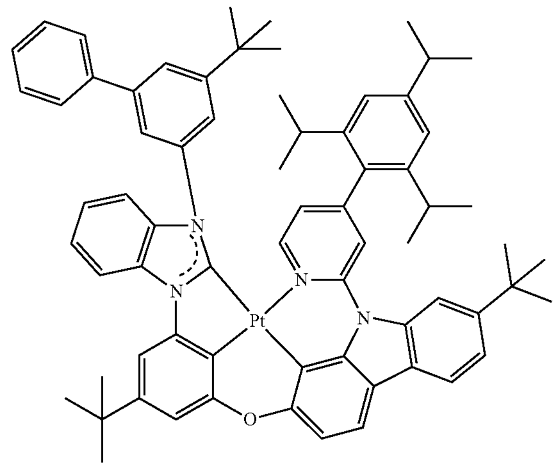
57
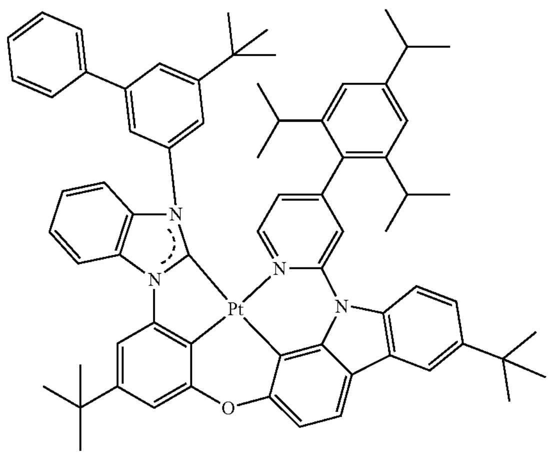
58
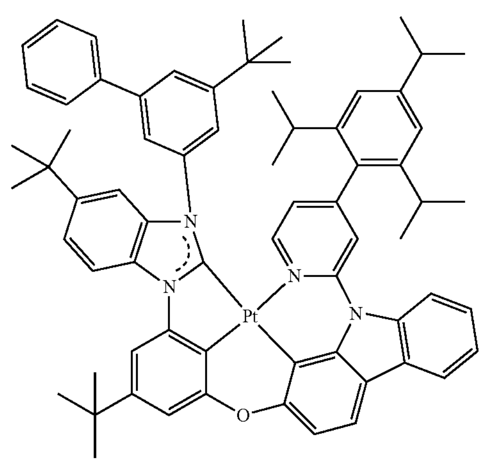

-continued
59
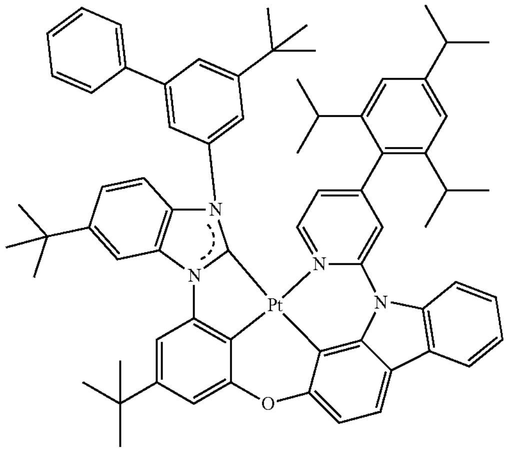
60
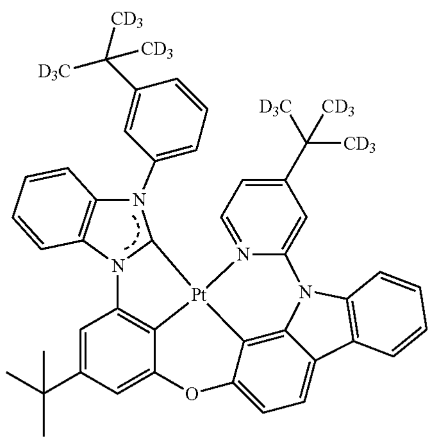
61
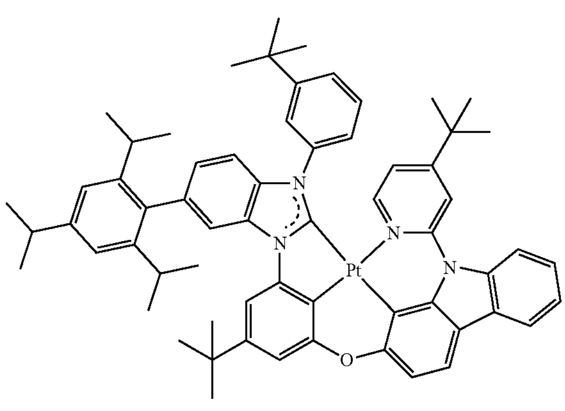
-continued
62
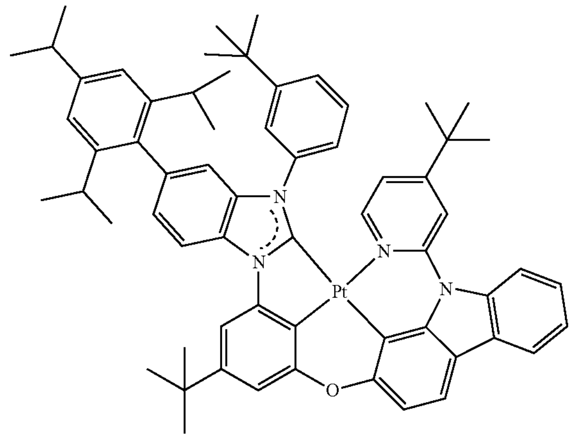
63
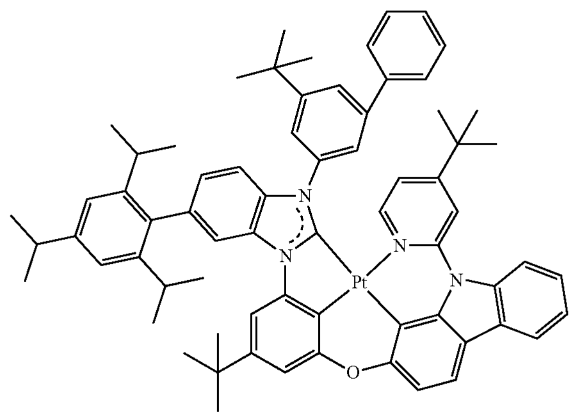
64
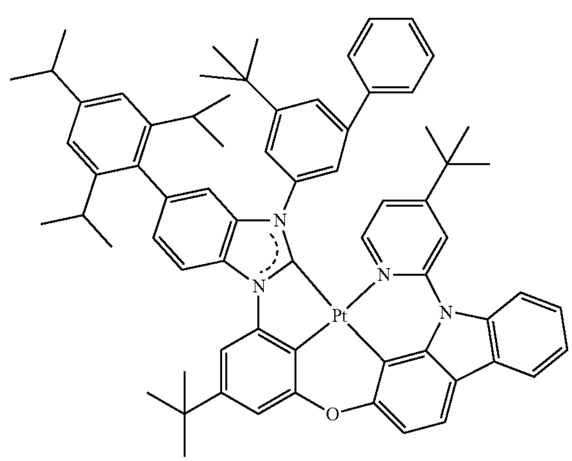

-continued
65
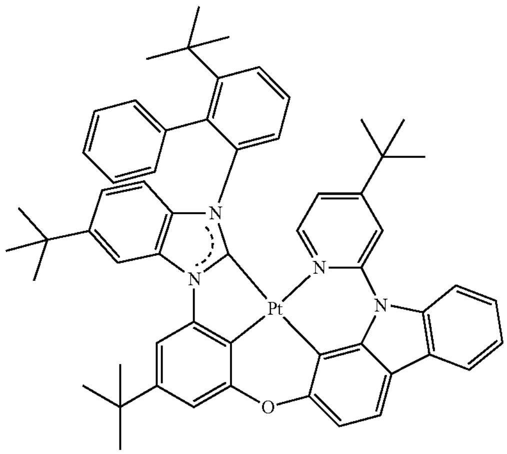
66
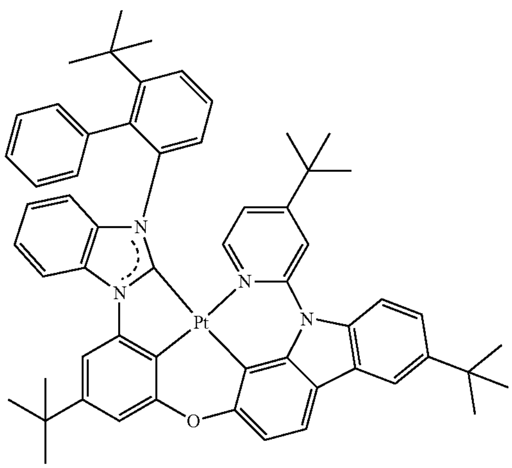
67
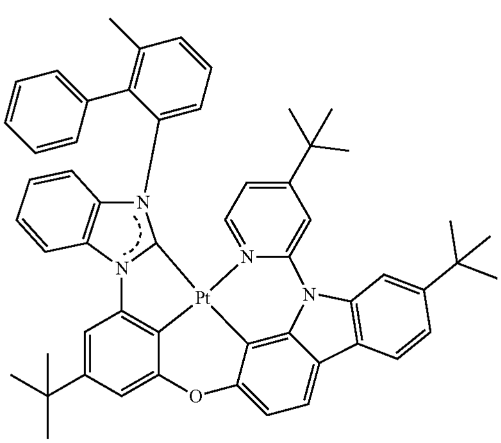
-continued
68
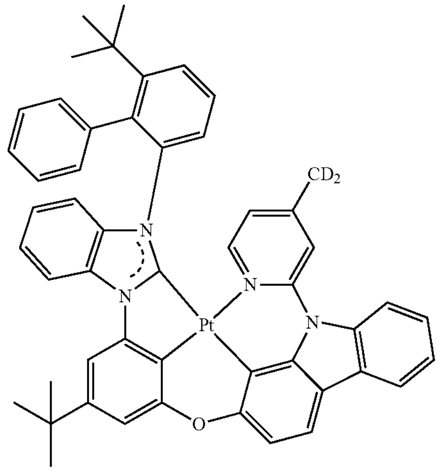
69
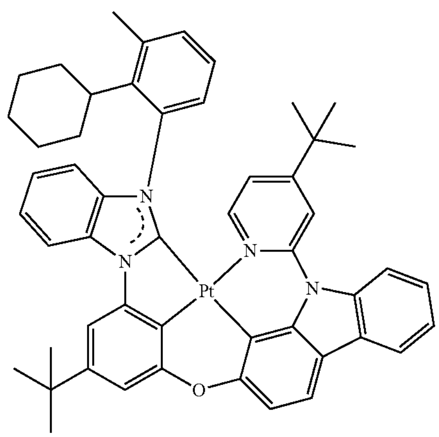
70
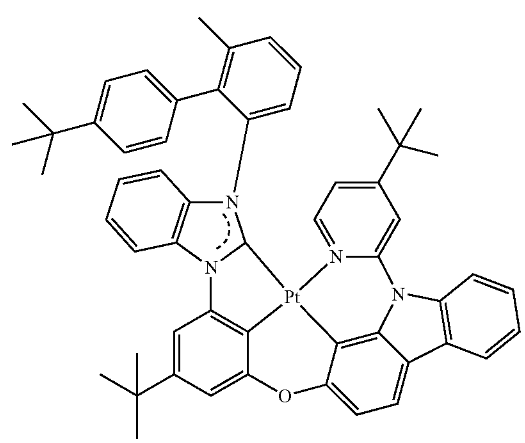

-continued
71
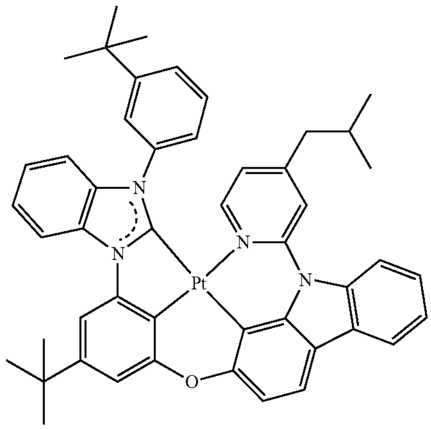
72
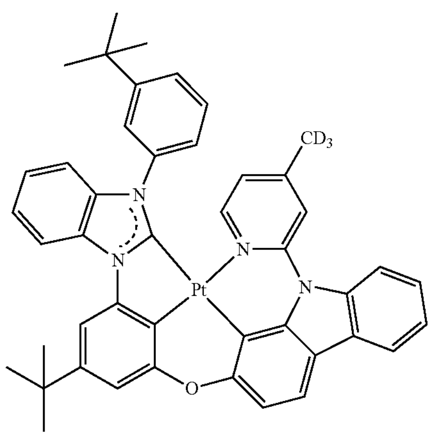
73
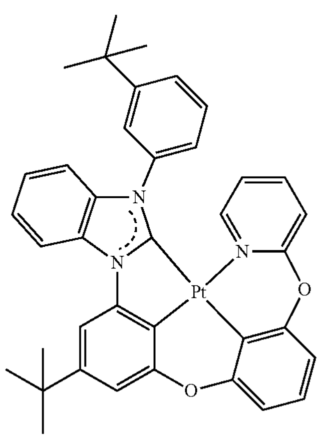
-continued
74
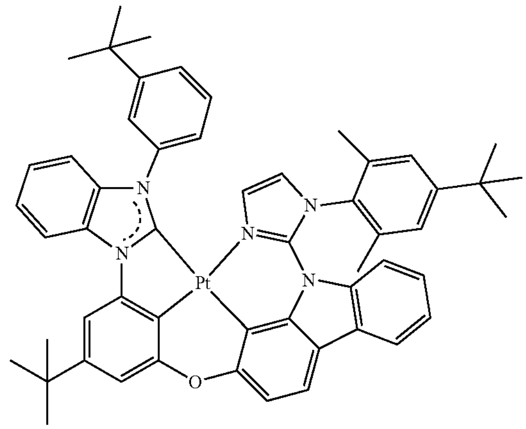
75
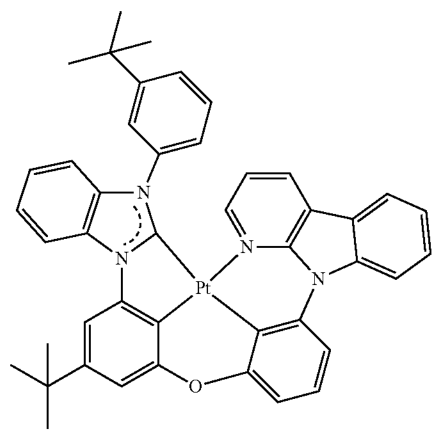
76
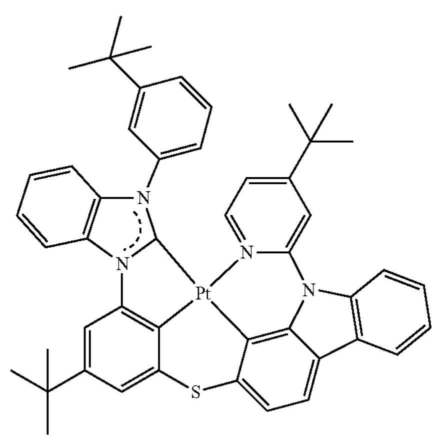

-continued
77
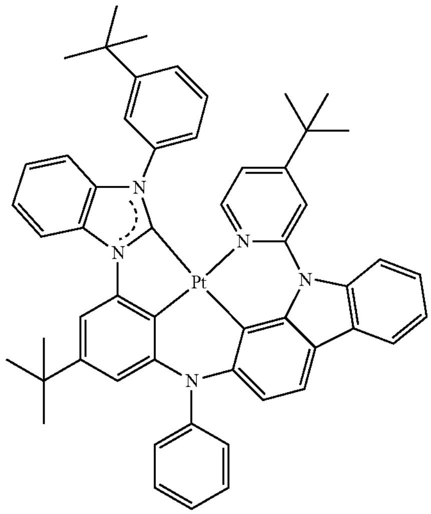
78
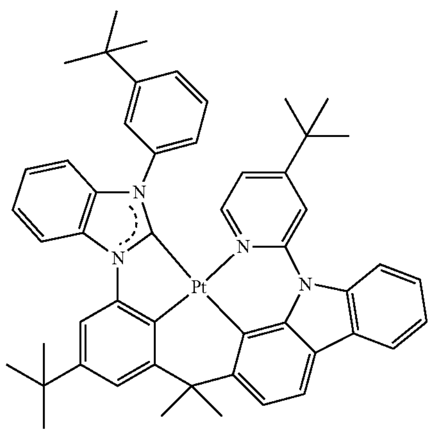
79
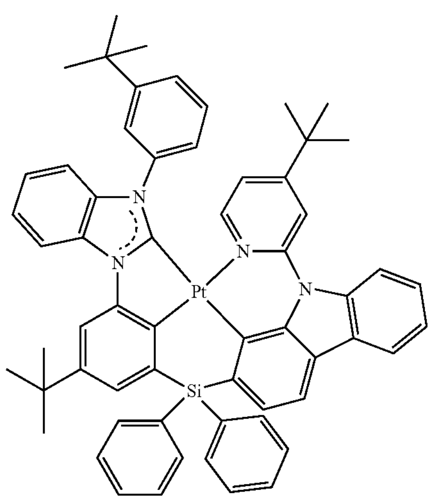
-continued
80
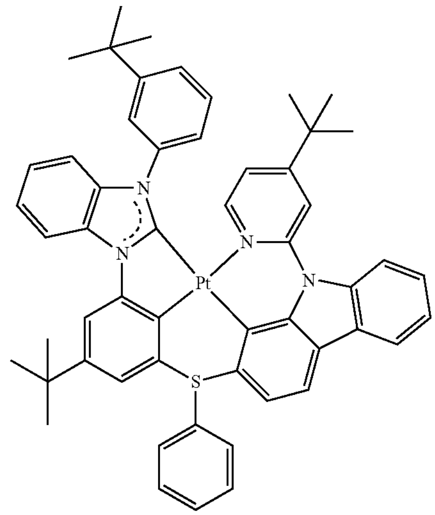
81
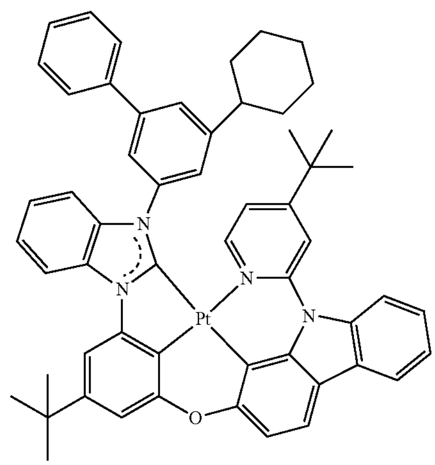
82
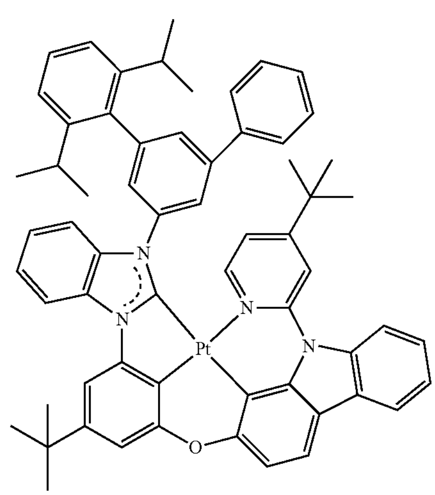

1276
-continued
83
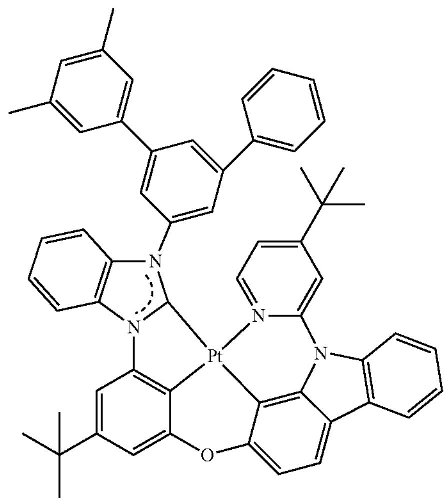
84
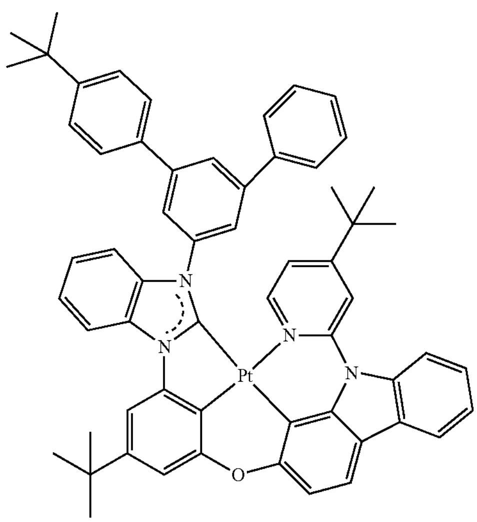
85
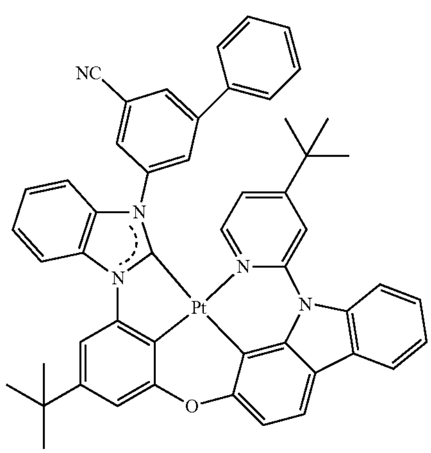
86
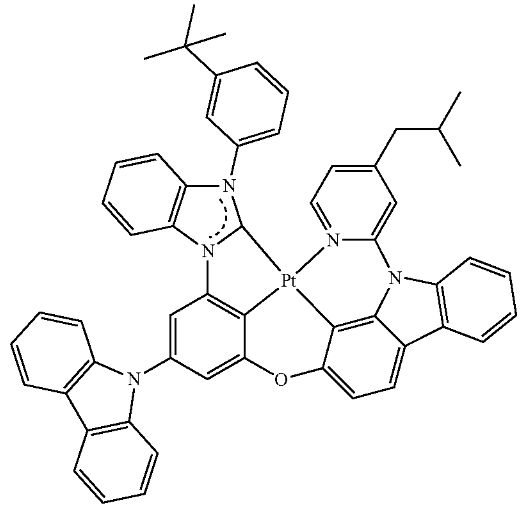
87
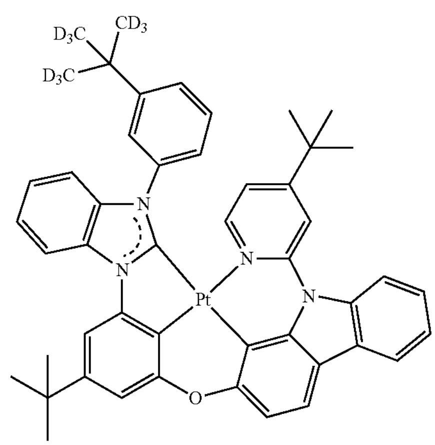
88
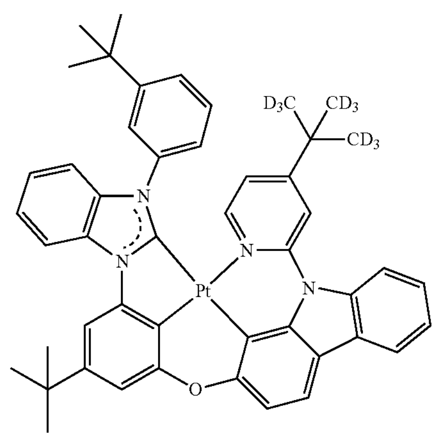

-continued
89
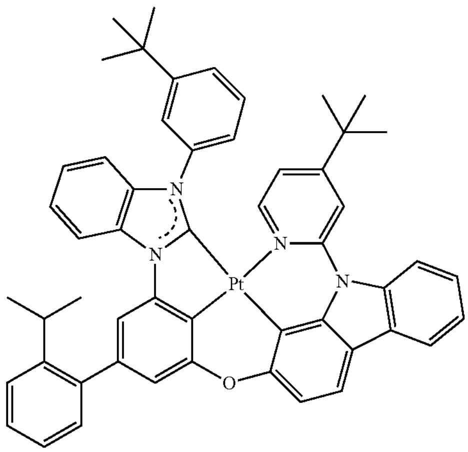
90
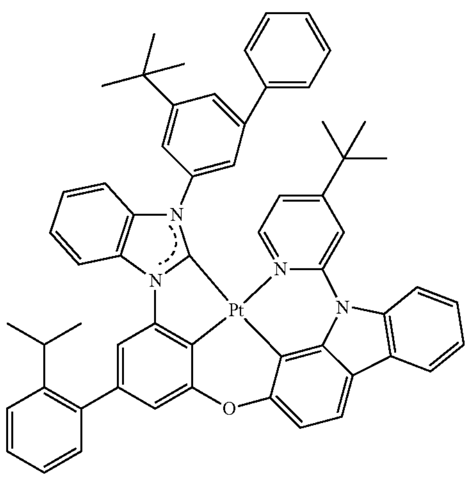
91
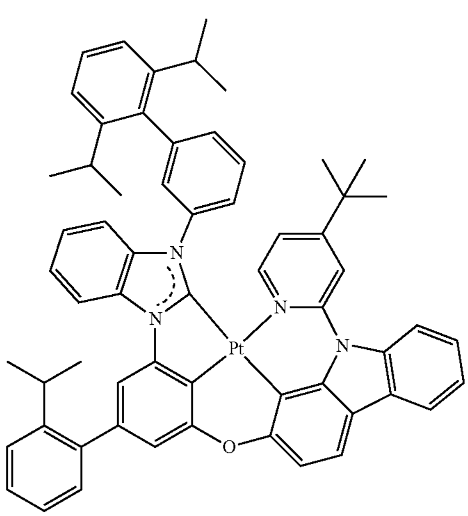
-continued
92
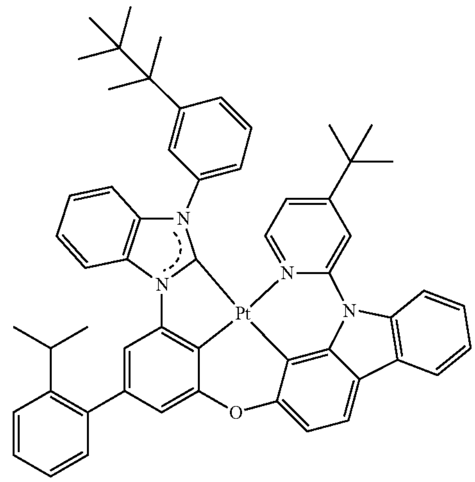
93
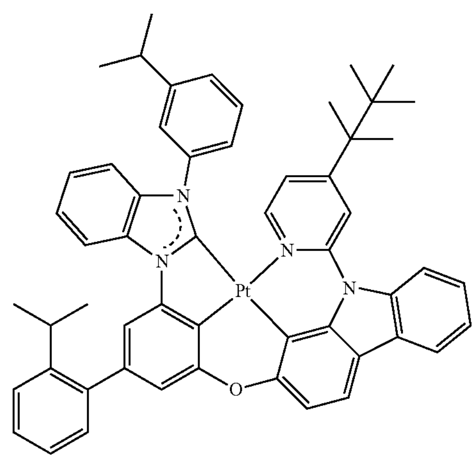
94
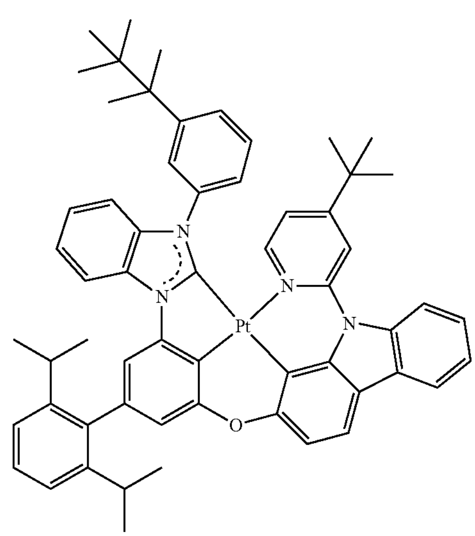

-continued
95
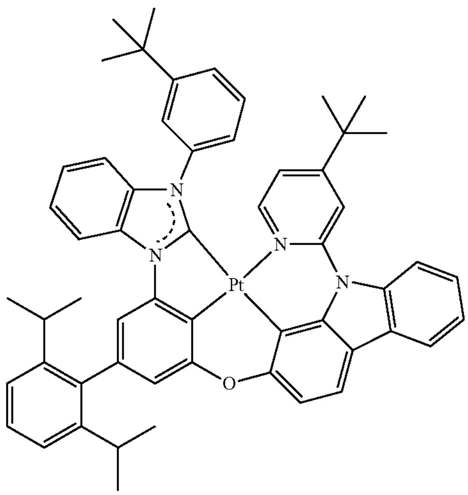
96
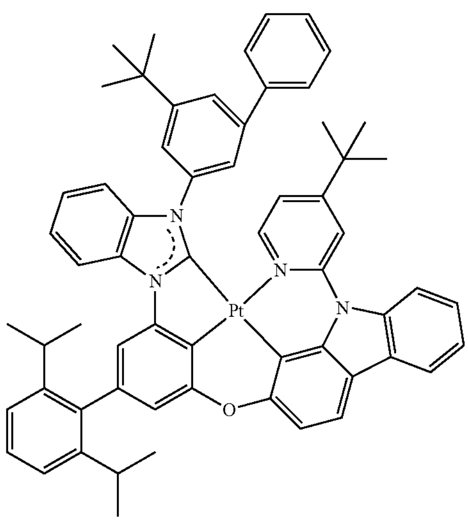
97
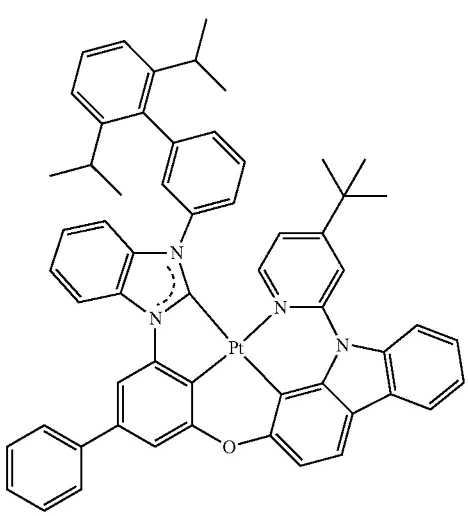
-continued
98
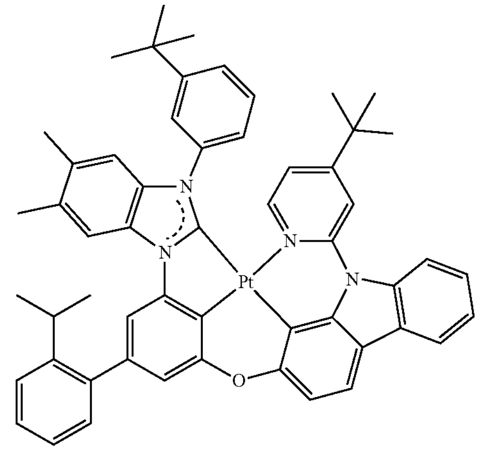
99
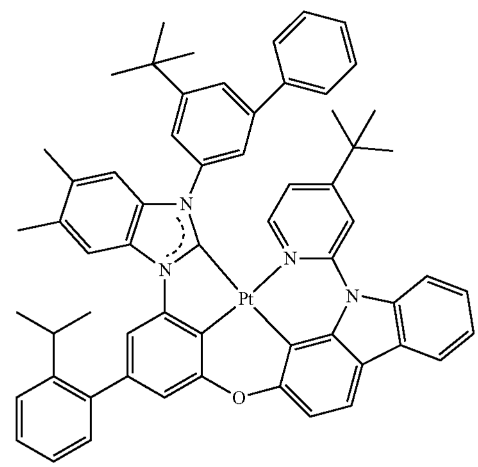
100
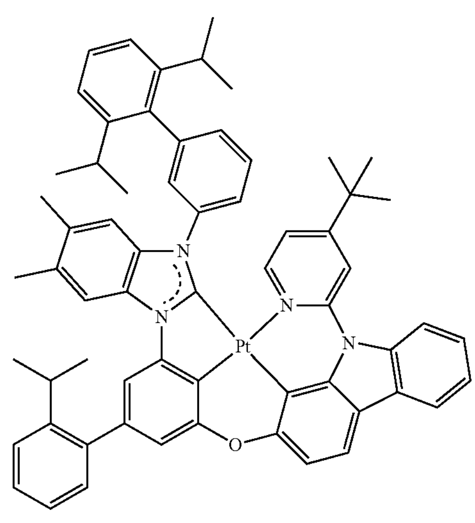

101
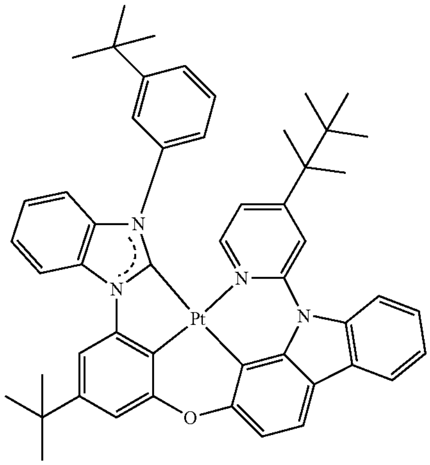
102
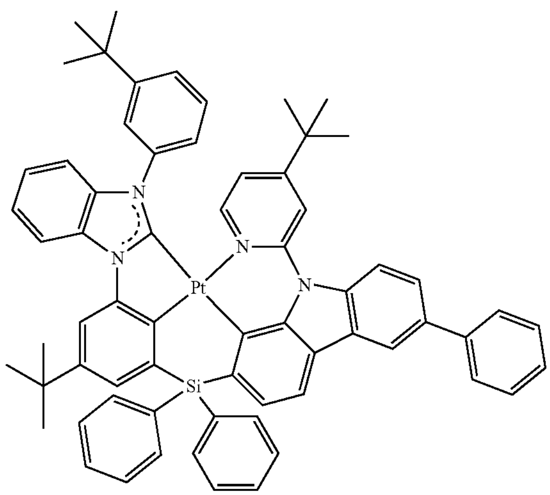
103
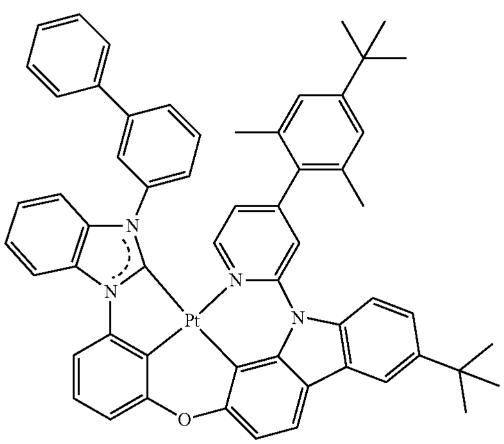
104
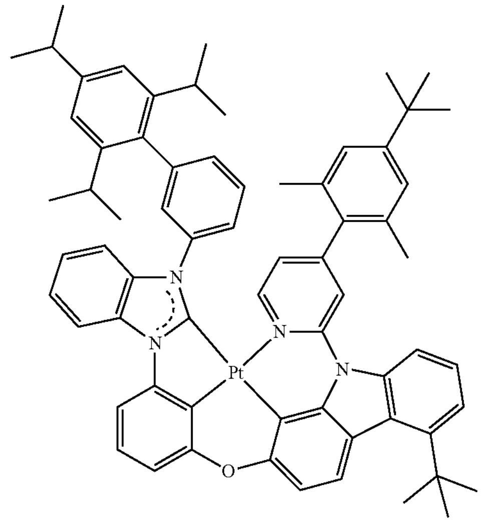
105
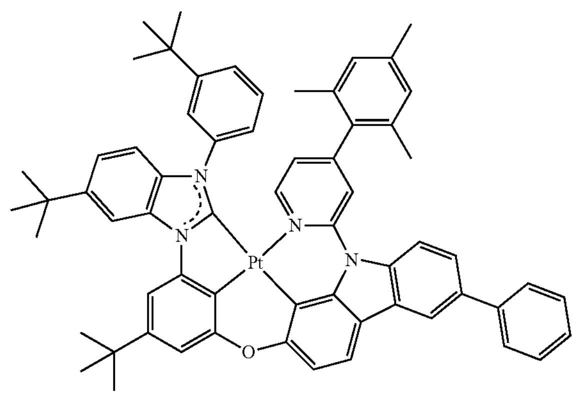
106
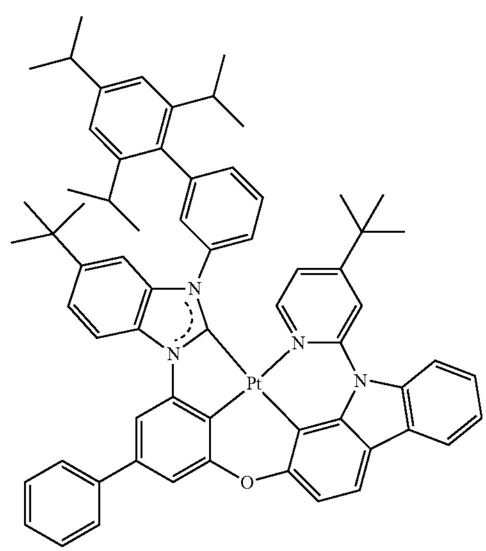

-continued
107
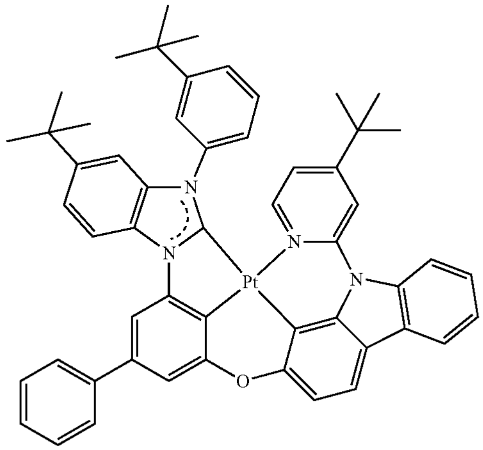
108
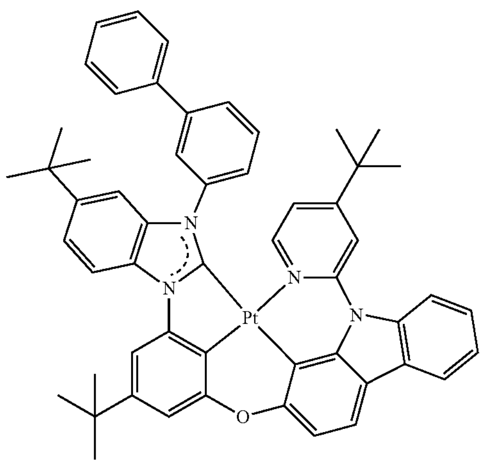
109
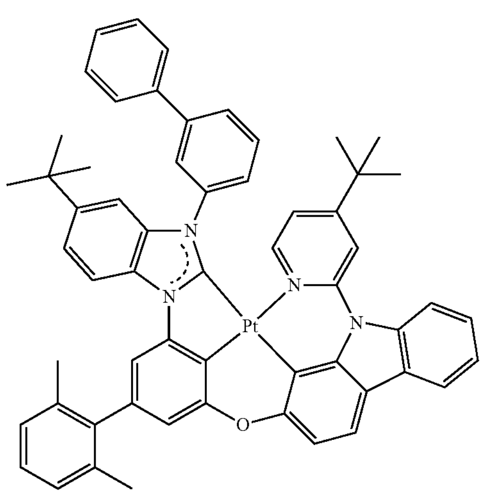
-continued
110
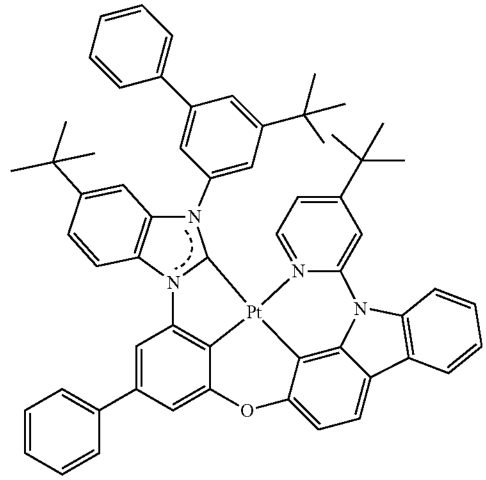
111
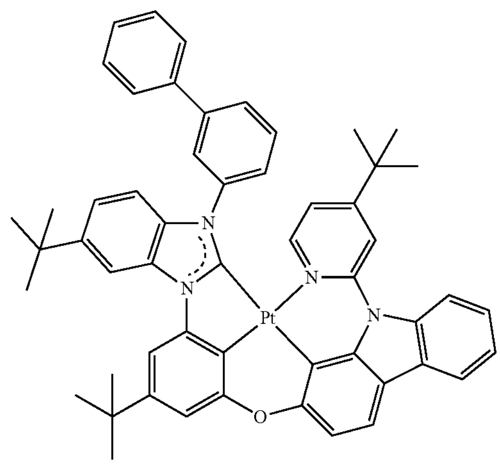
112
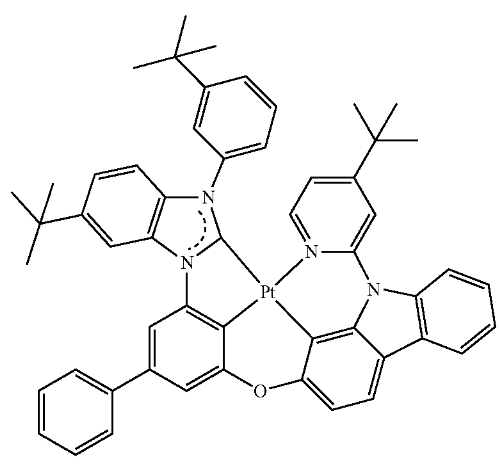

113
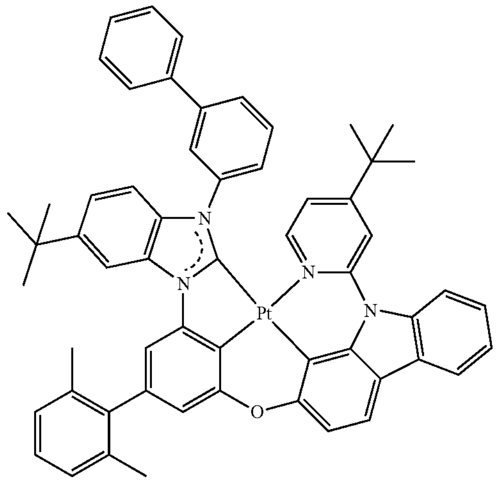
114
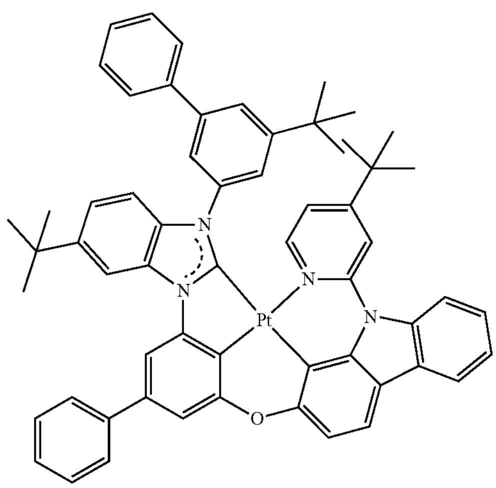
115
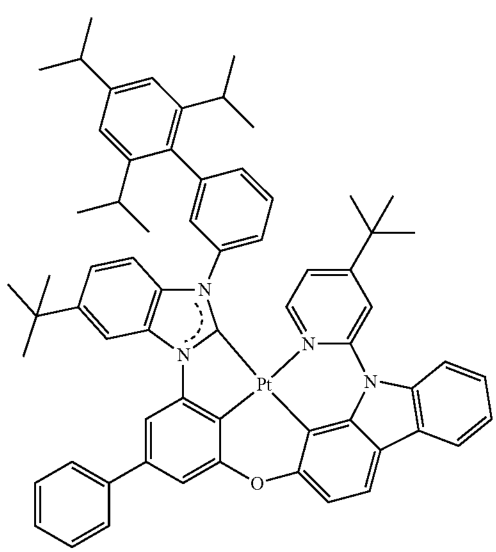
116
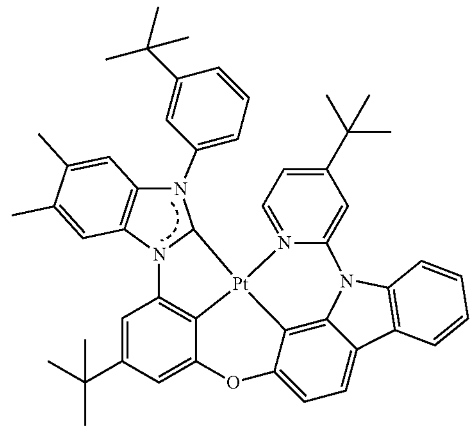
117
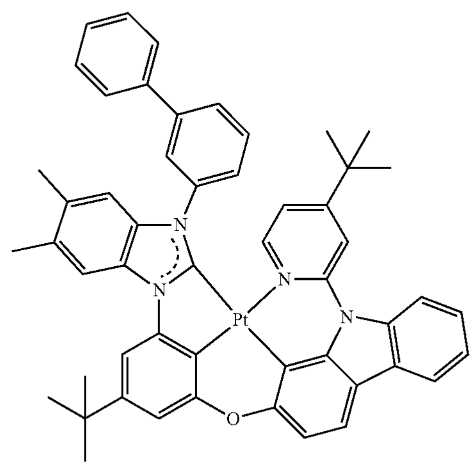
118
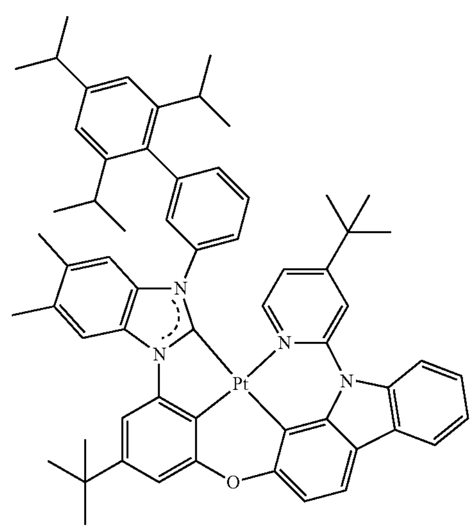

-continued
119
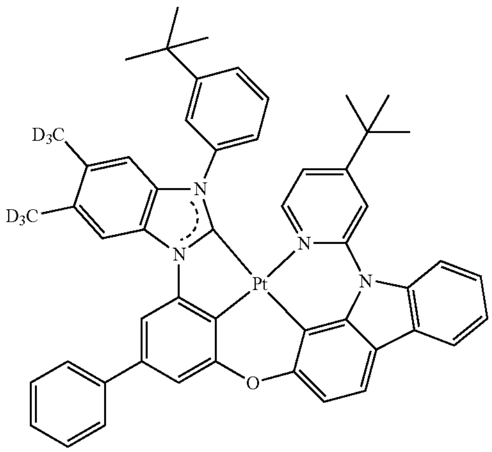
120
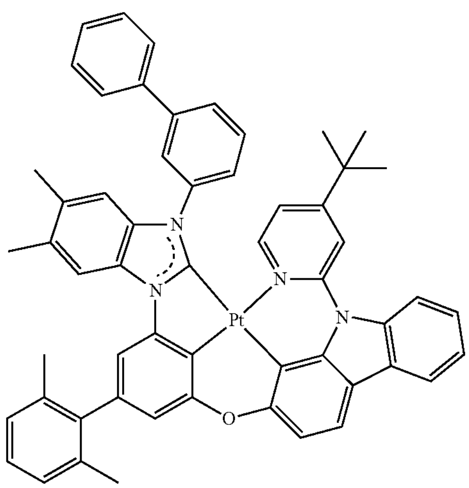
121
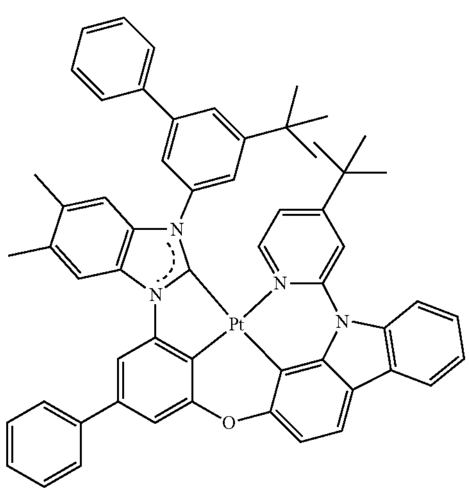
-continued
122
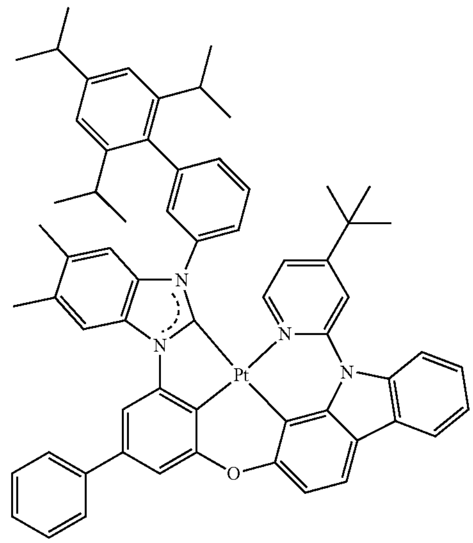
123
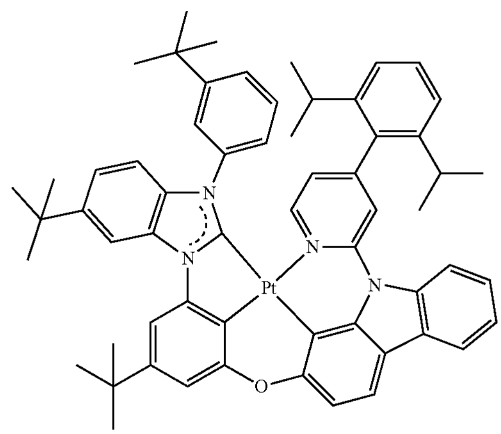
124
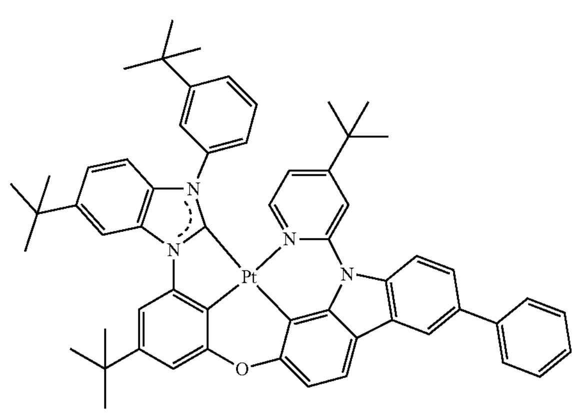

125
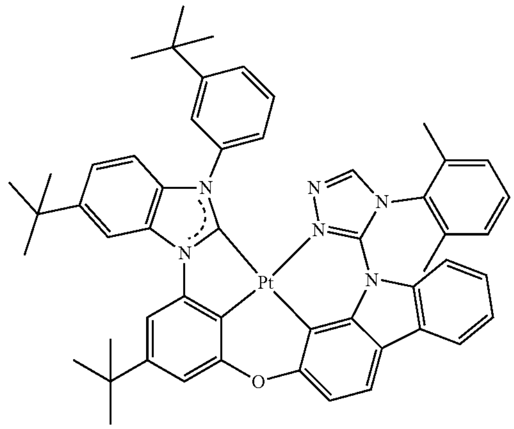
126
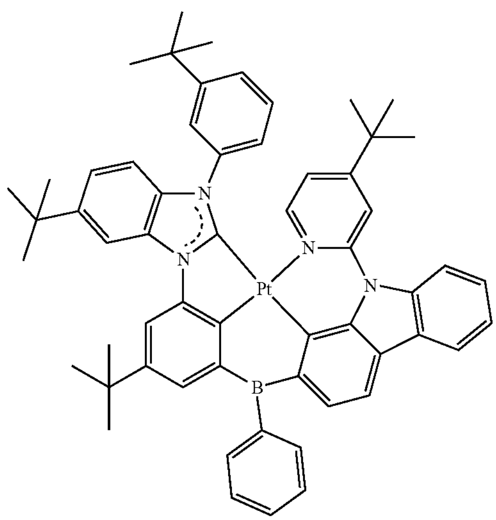
127
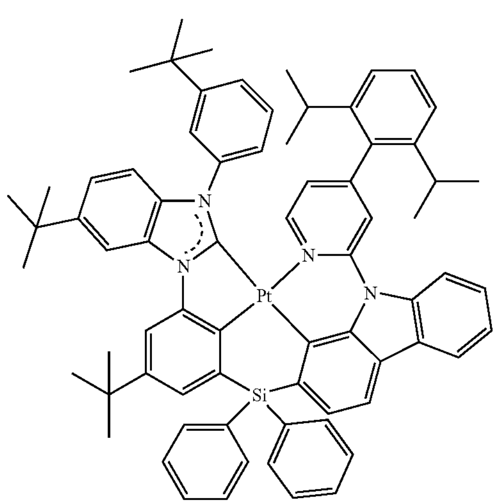
128
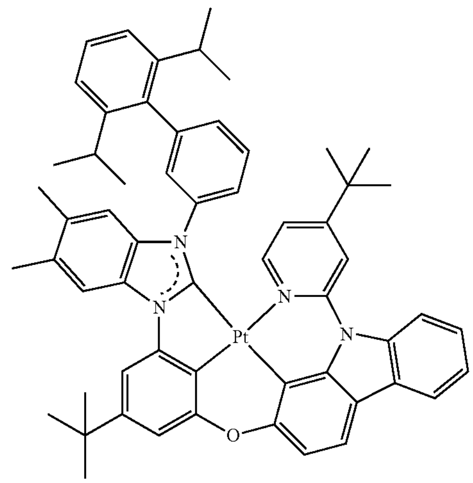
129
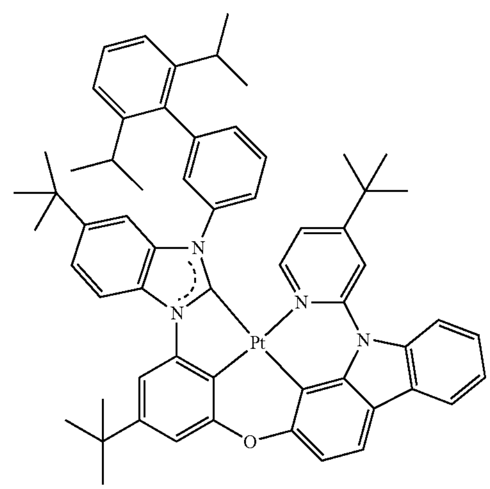
130
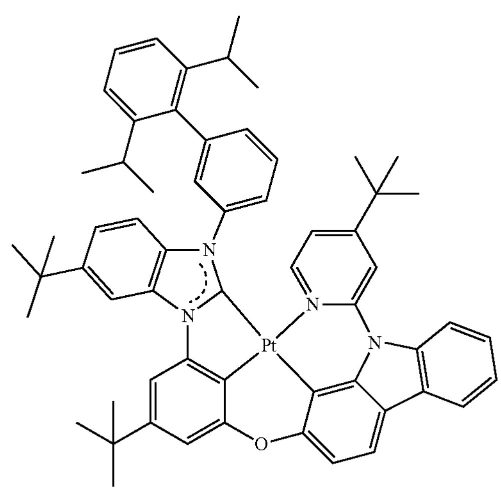

131
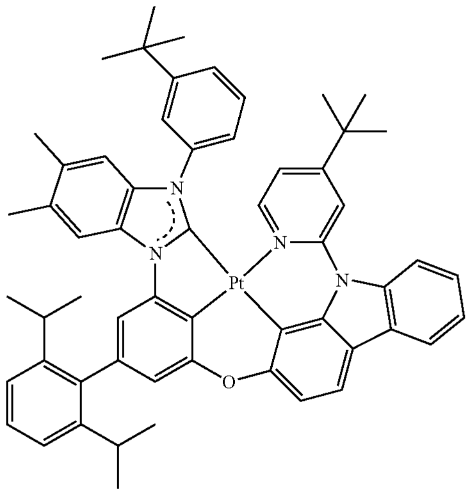
132
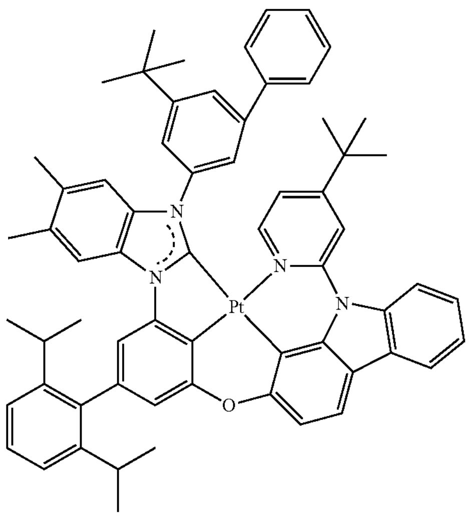
133
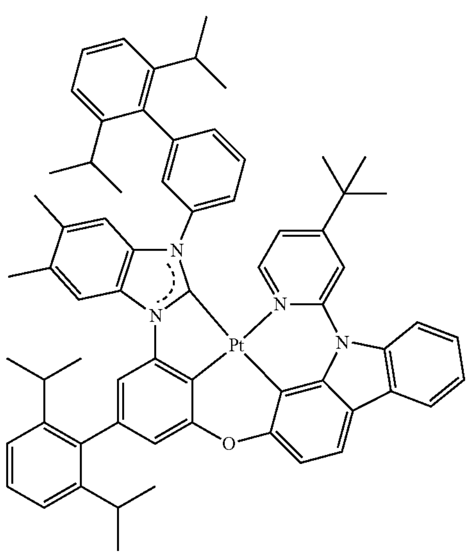
134
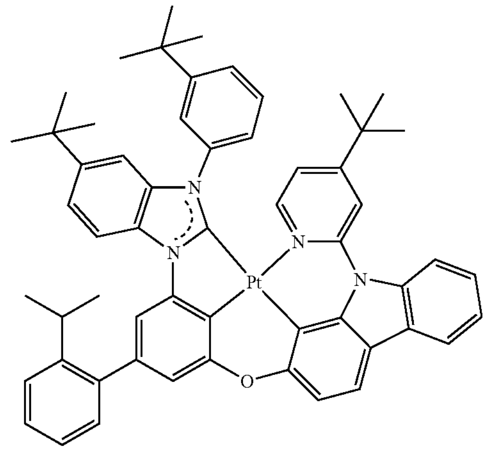
135
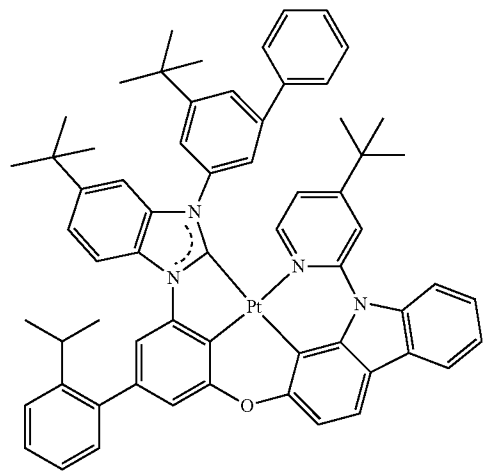
136
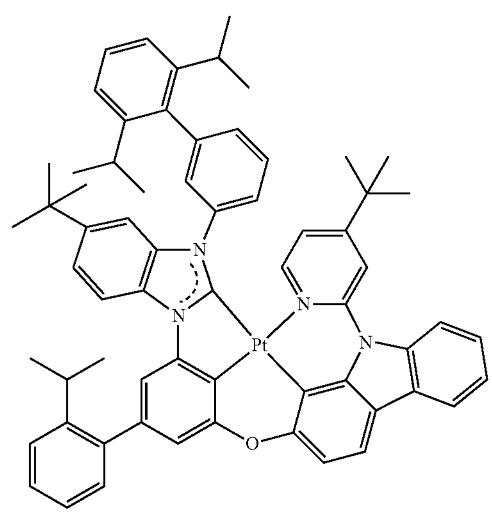

-continued
137
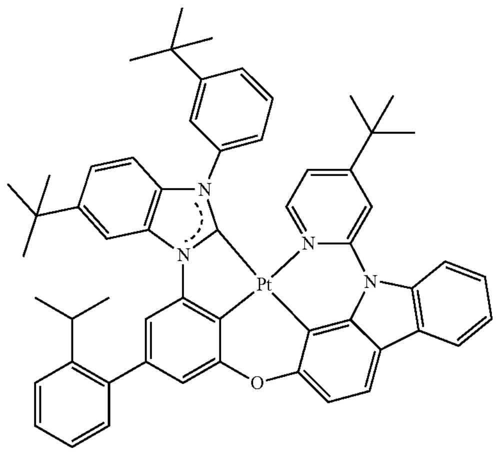
138
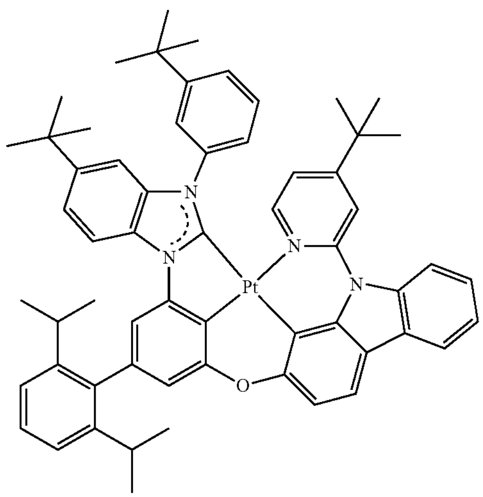
139
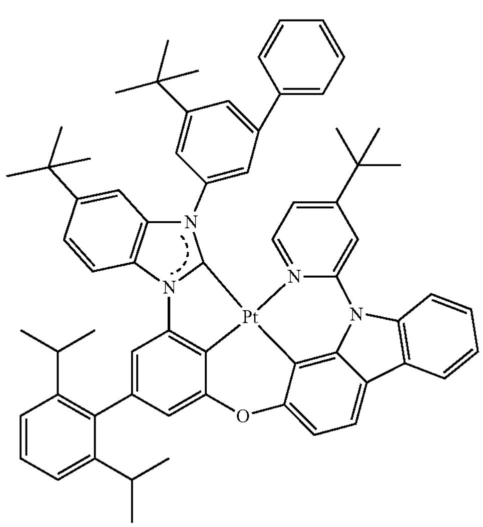
-continued
140
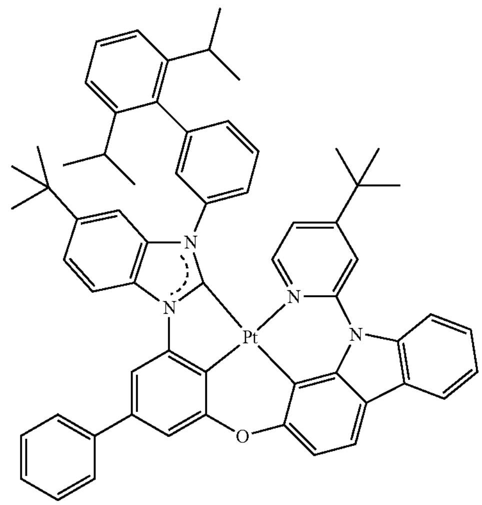
141
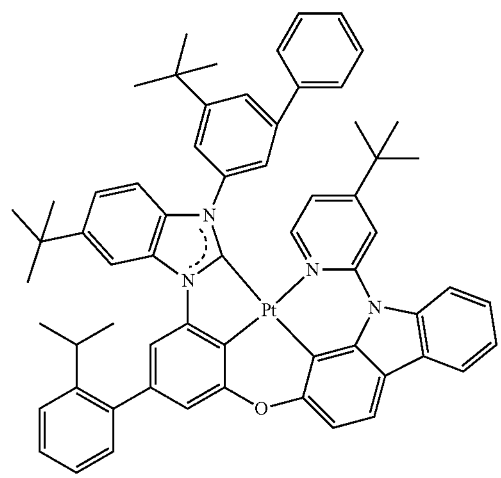
142
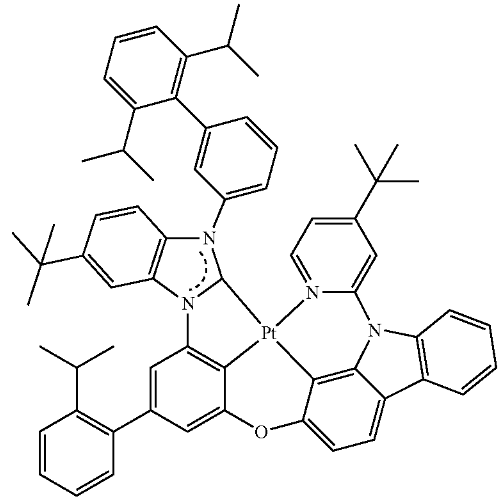

-continued
143
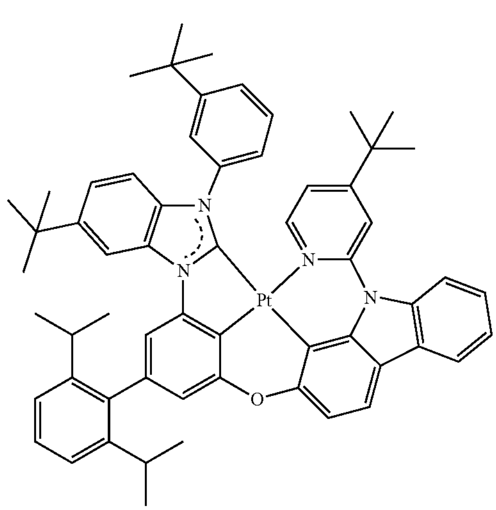
144
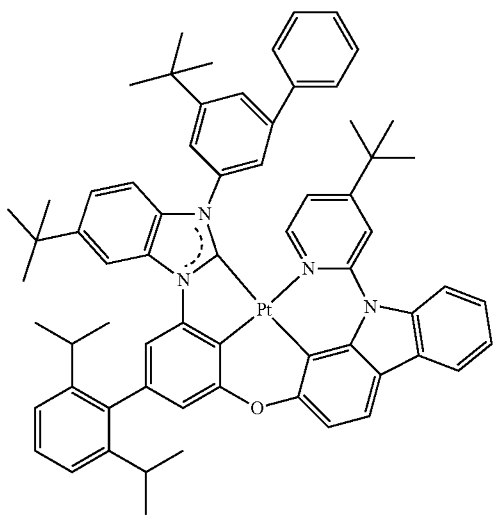
145
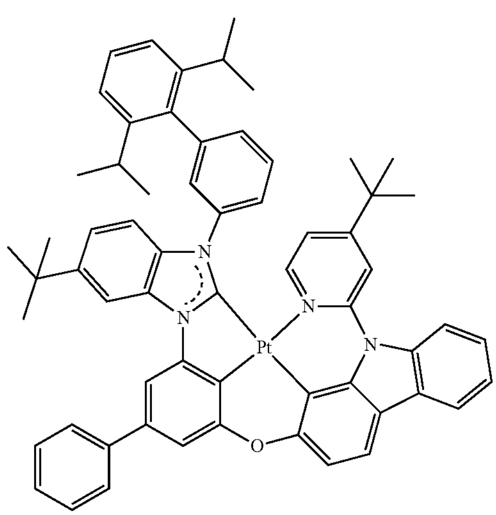
-continued
146
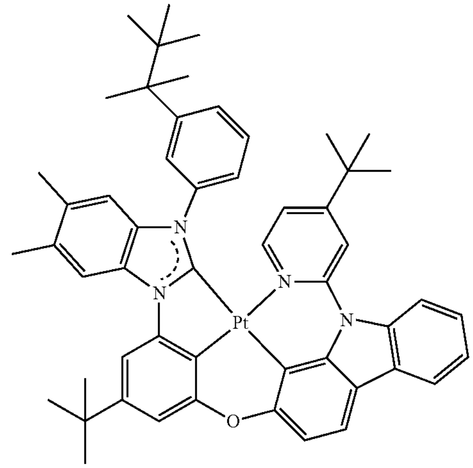
147
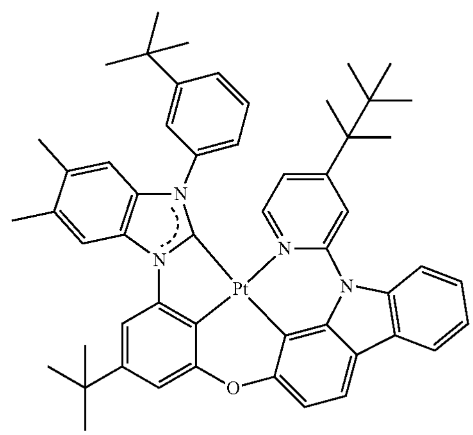
148
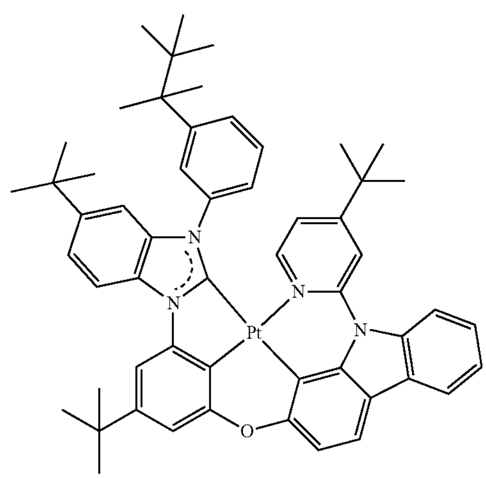

-continued
149
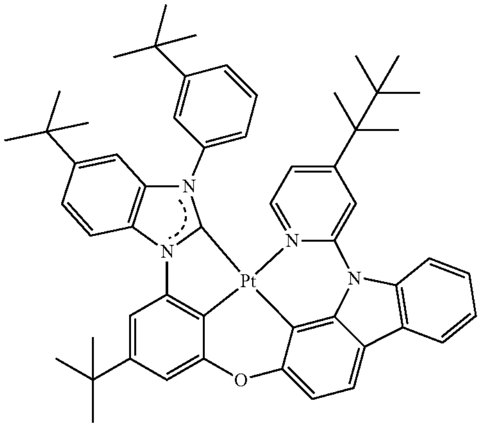
150
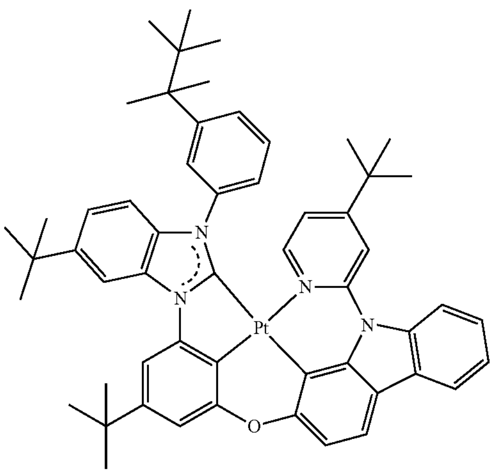
151
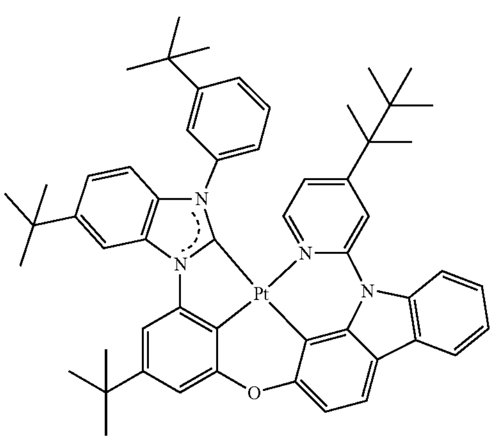
-continued
152
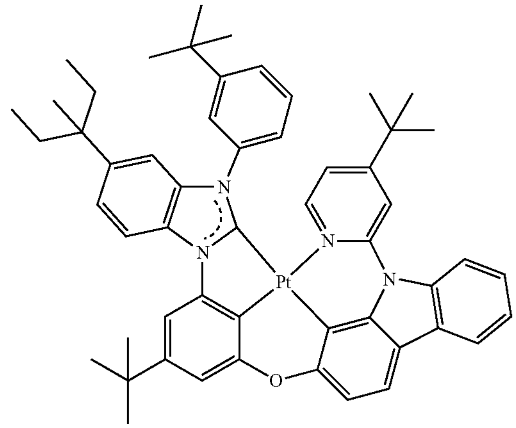
153
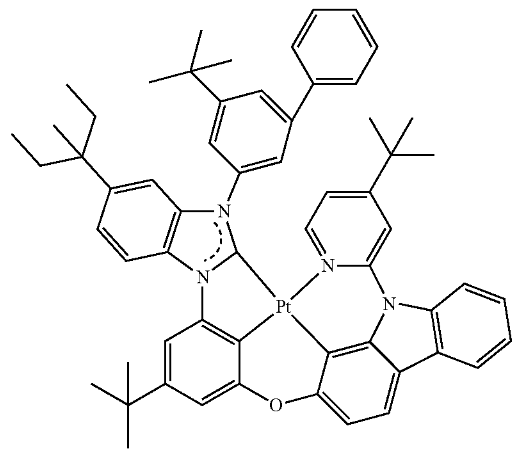
154
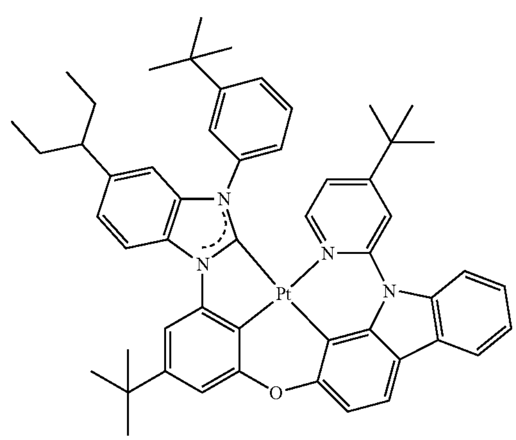

-continued
155
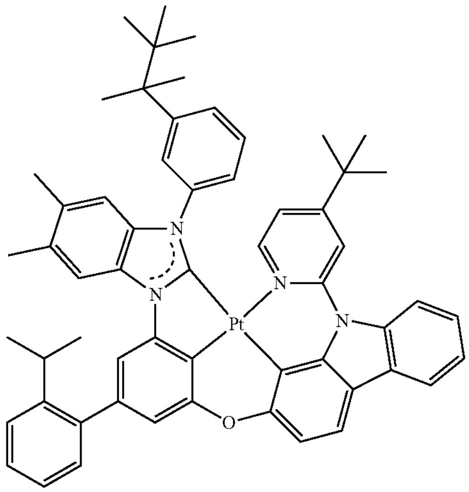
156
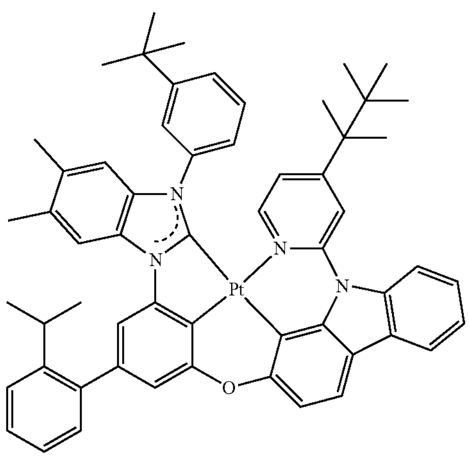
157
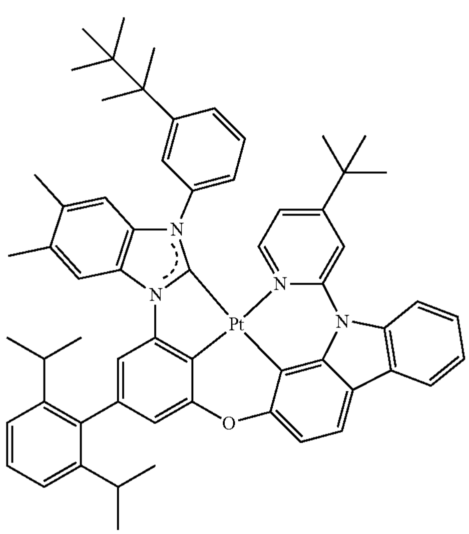
-continued
158
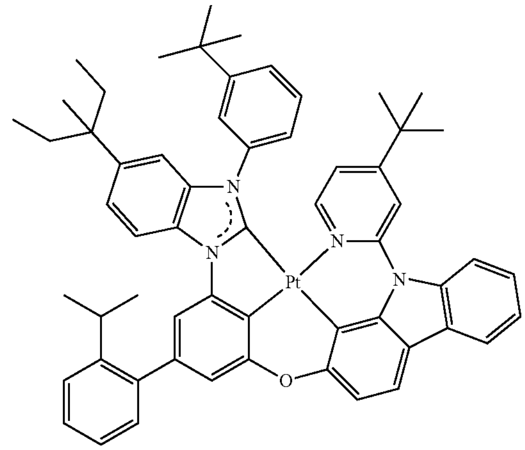
159
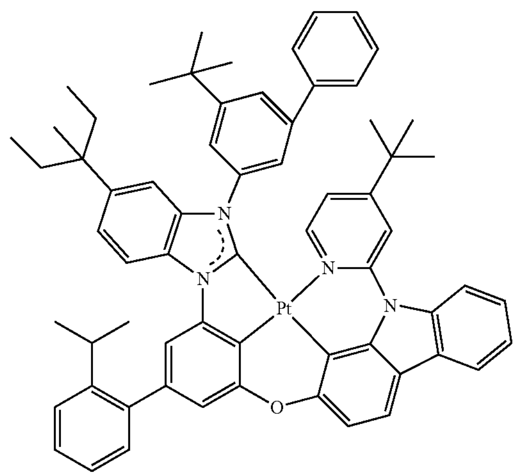
160
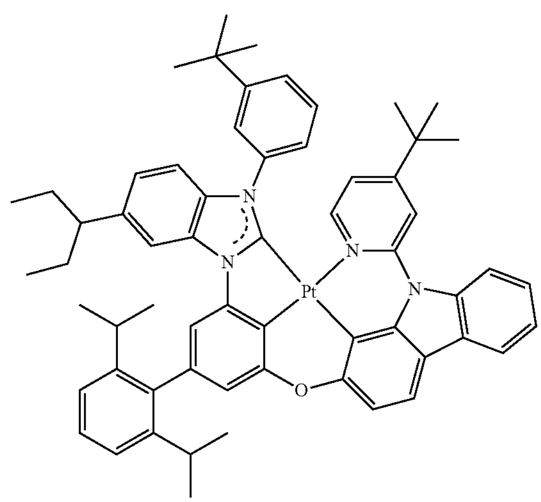

-continued
161
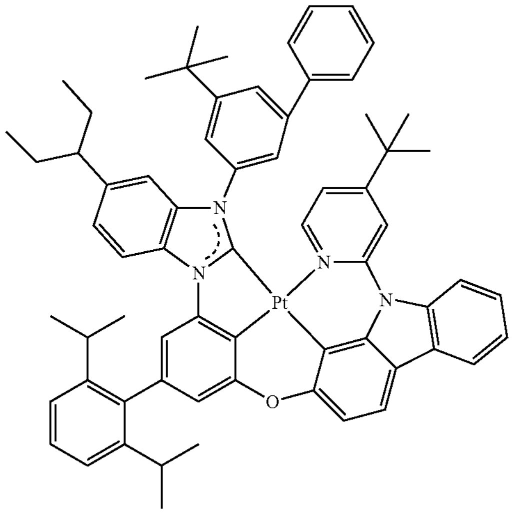
162
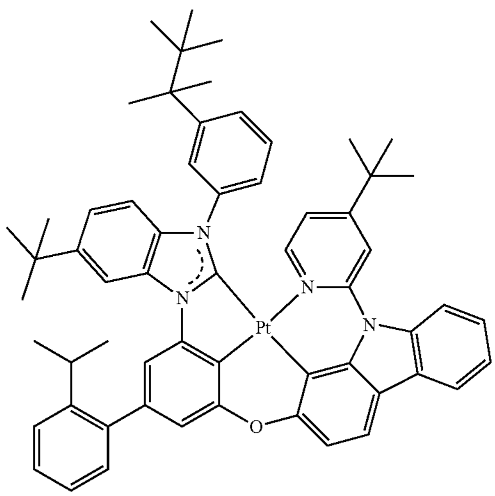
163
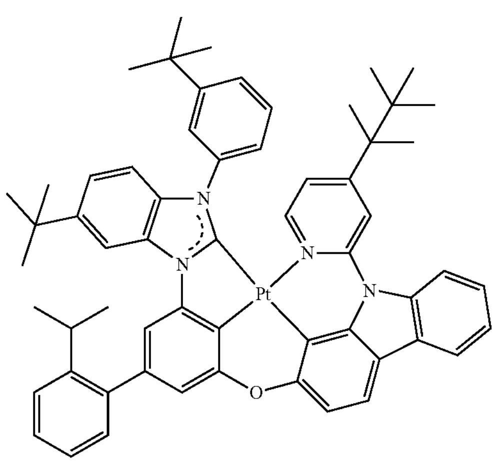
-continued
164
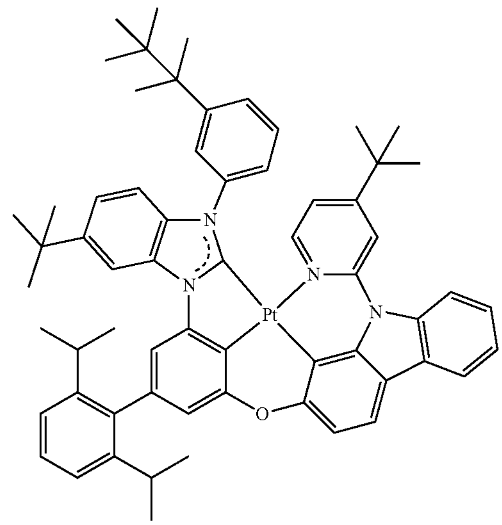
165
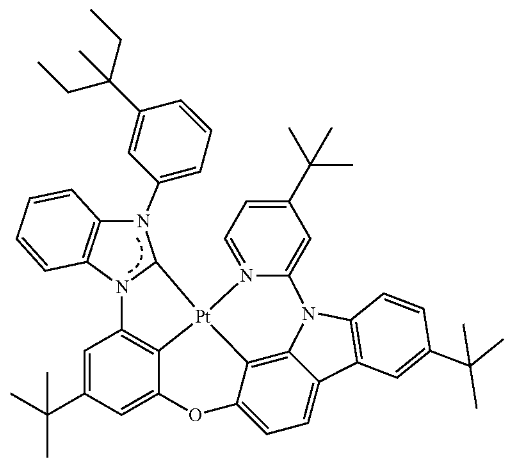
166
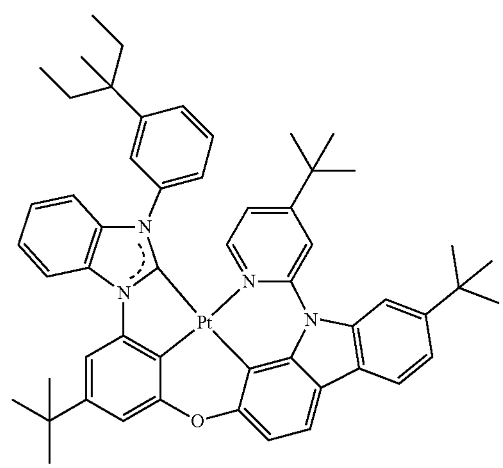

167
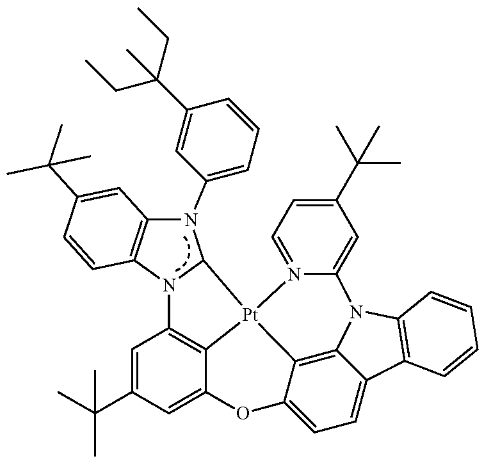
168
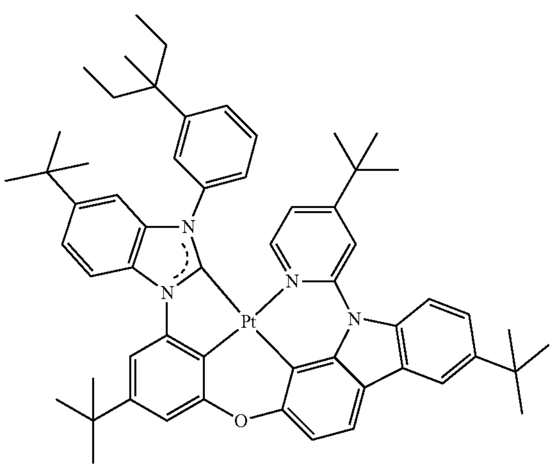
169
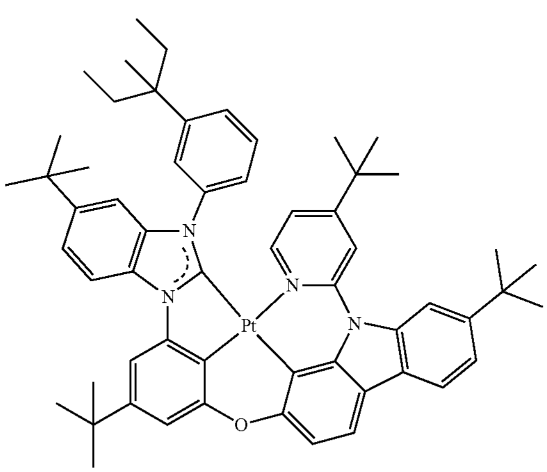
170
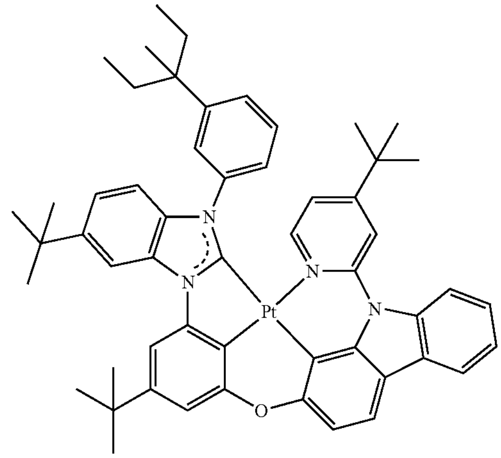
171
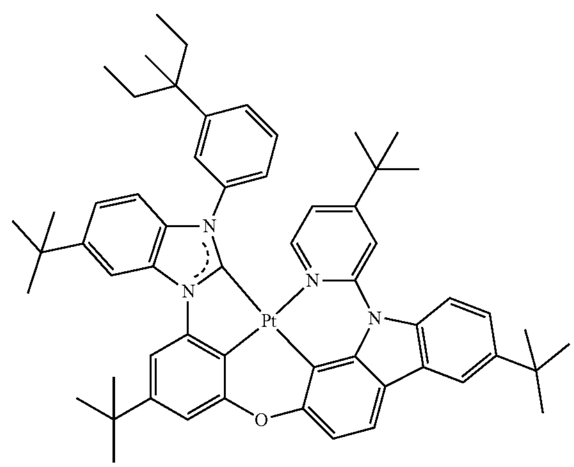
172
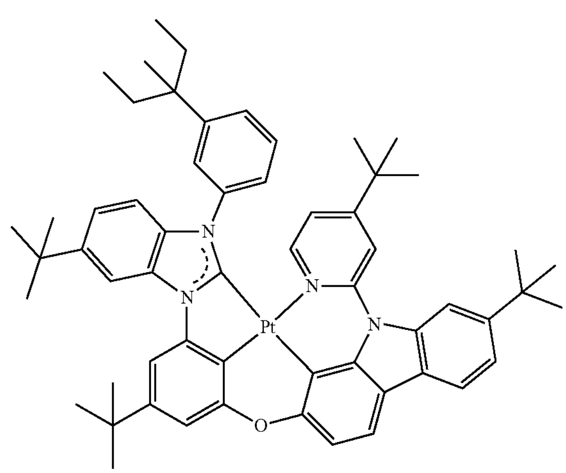

173
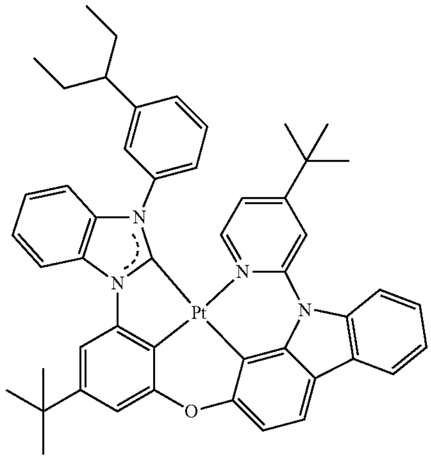
174
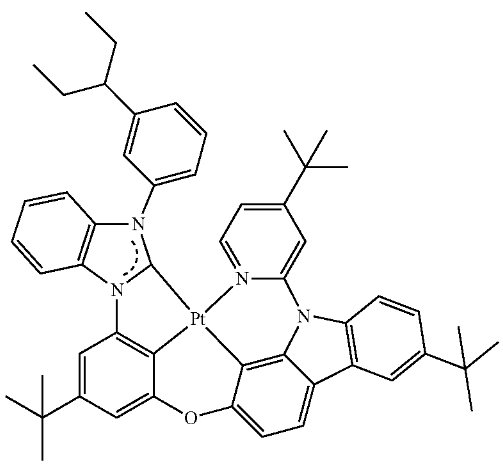
175
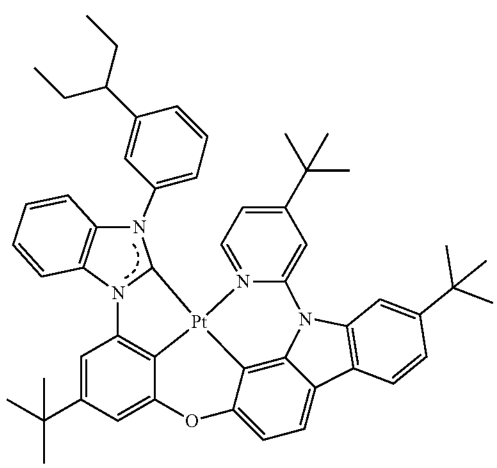
176
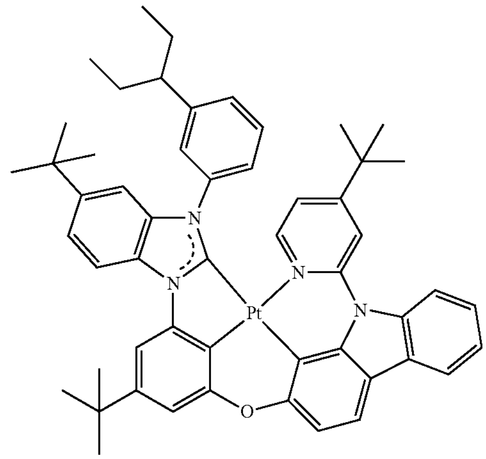
177
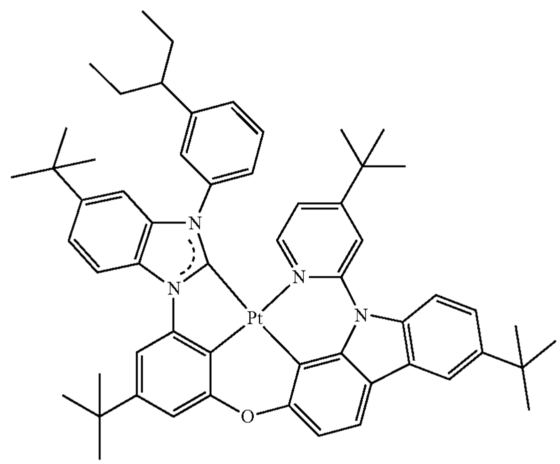
178
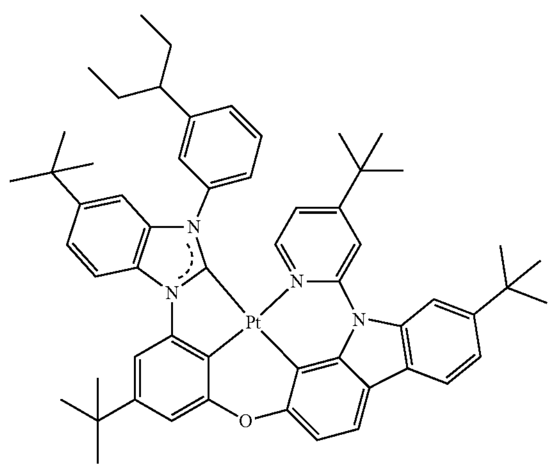

-continued
179
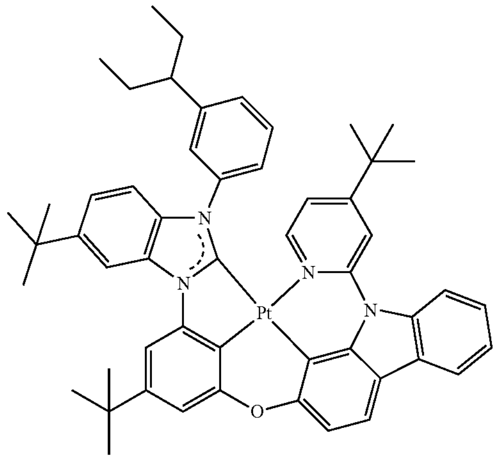
180
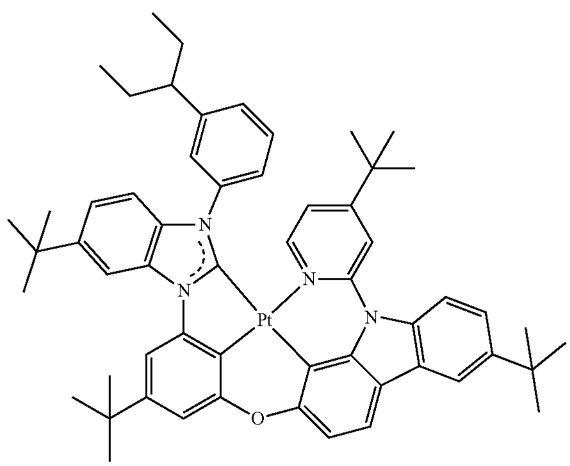
181
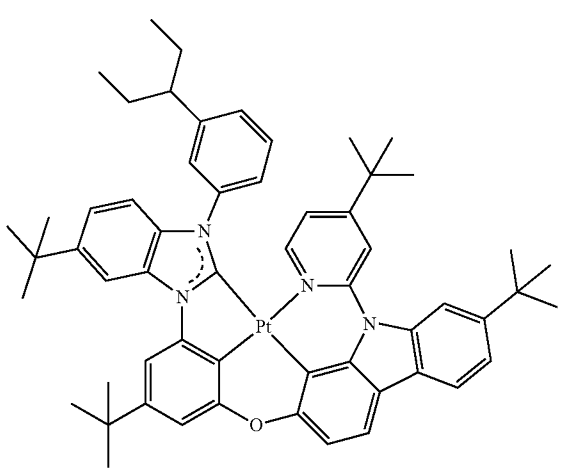
-continued
182
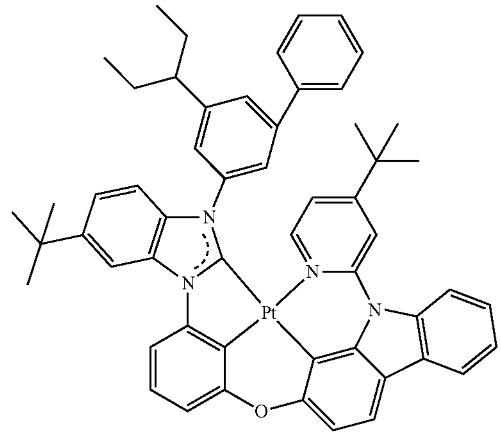
183
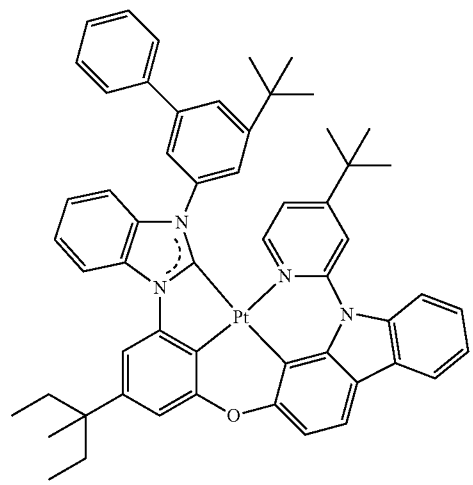
184
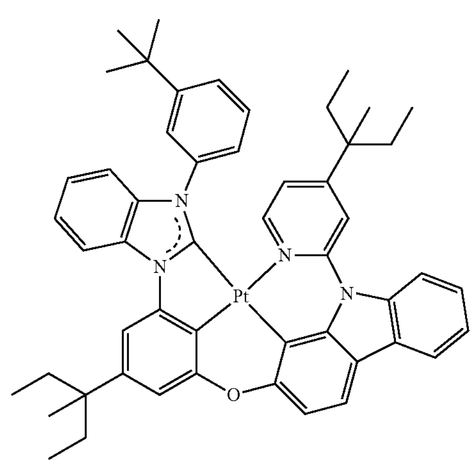

-continued
185
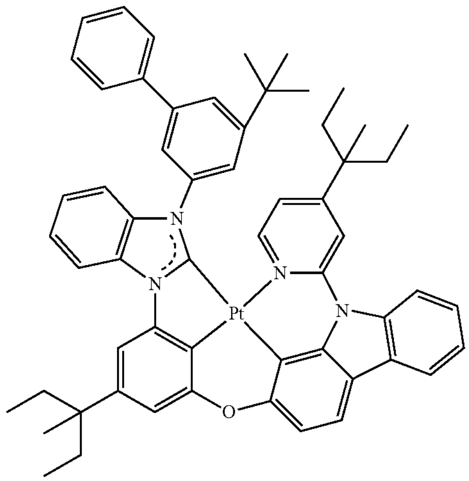
186
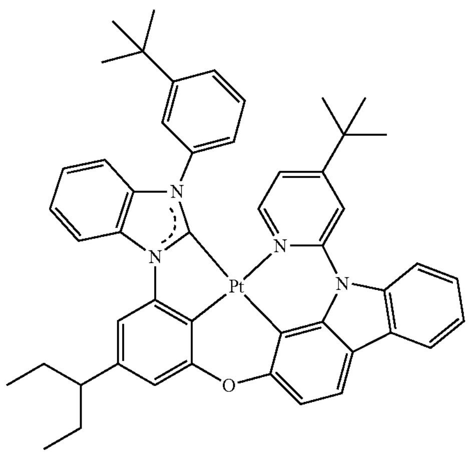
187
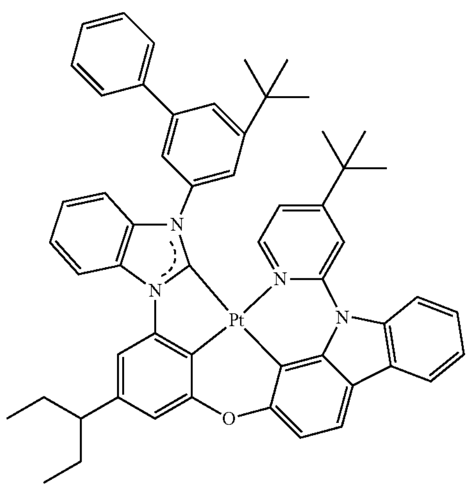
-continued
188
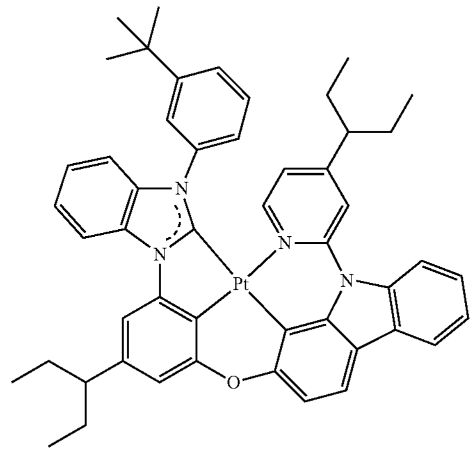
189
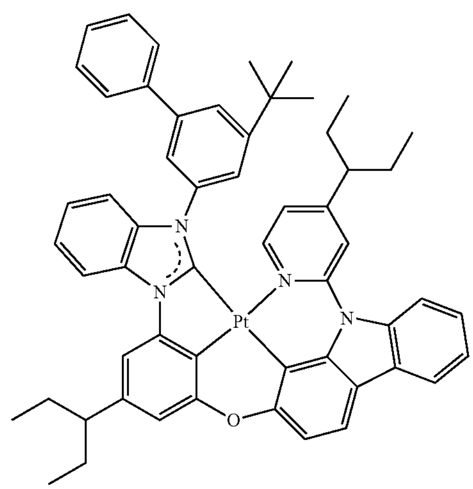
190
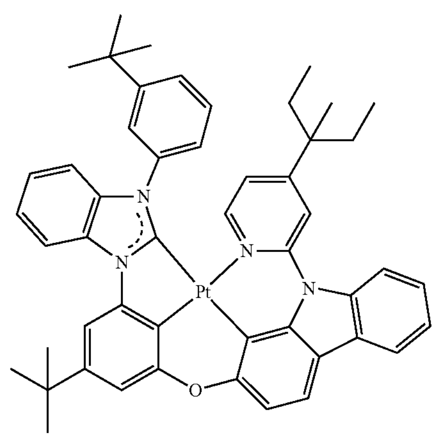

-continued
191
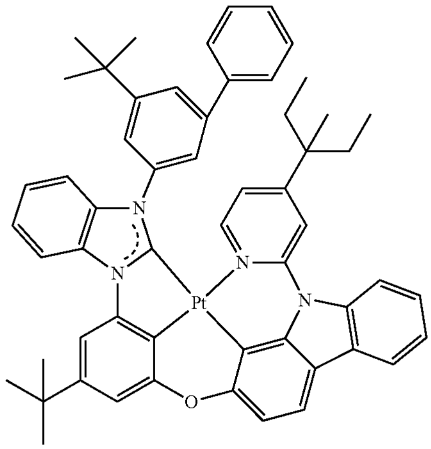
192
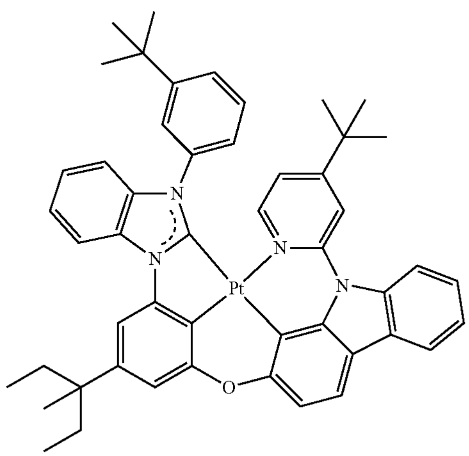
193
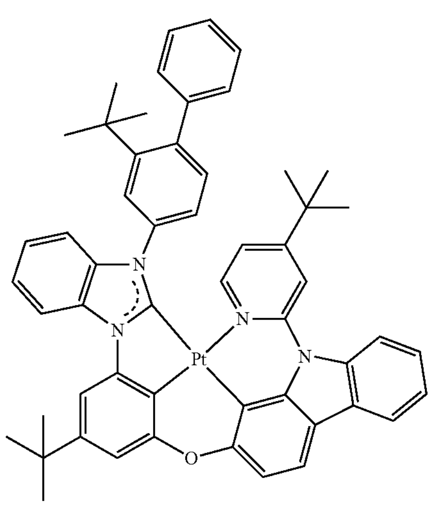
-continued
194
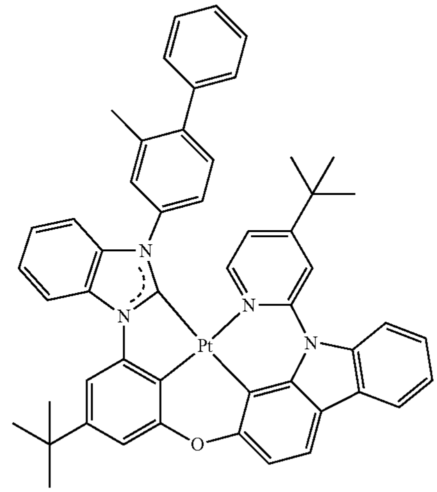
195
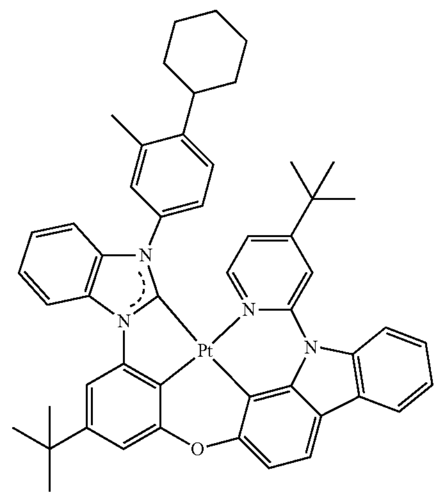
196
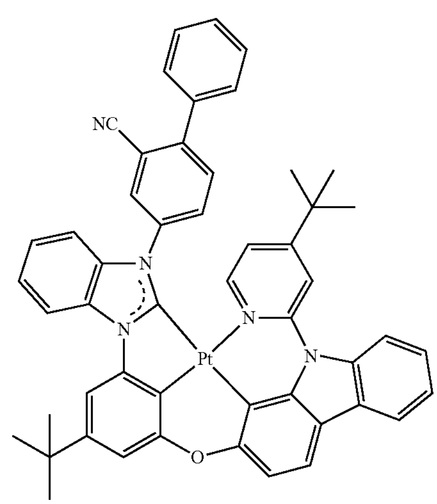

-continued
197
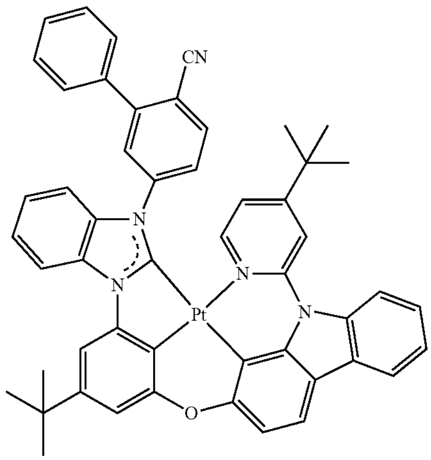
198
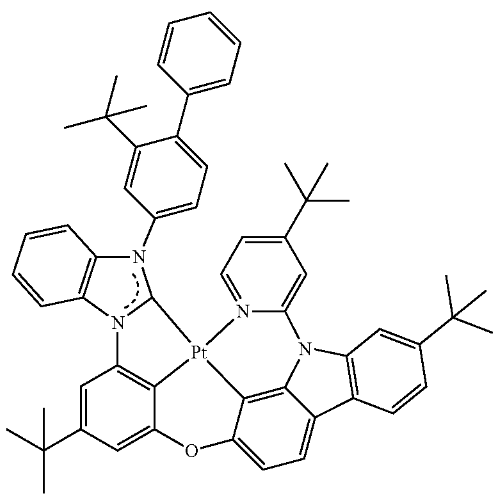
199
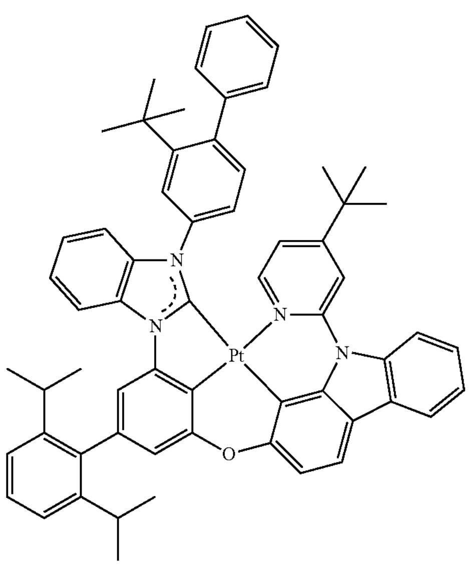
-continued
200
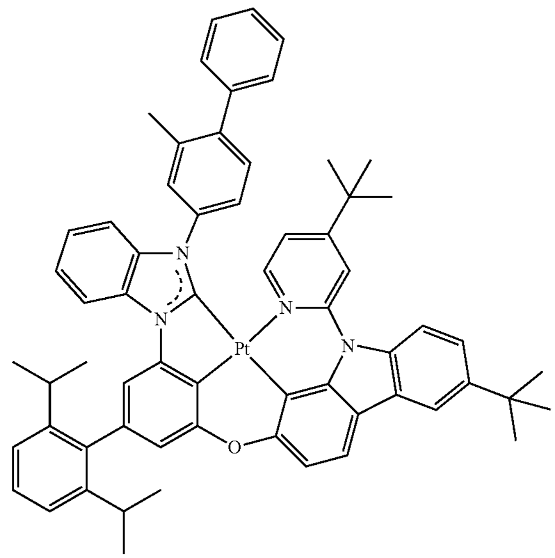
201
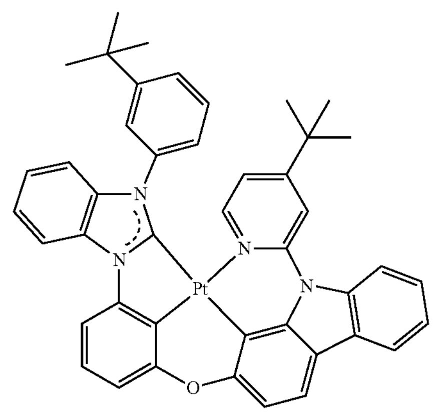
202
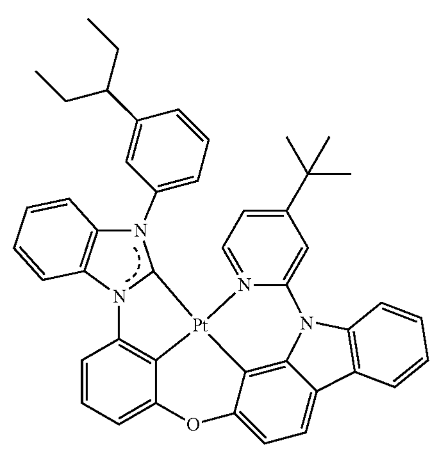

-continued
203
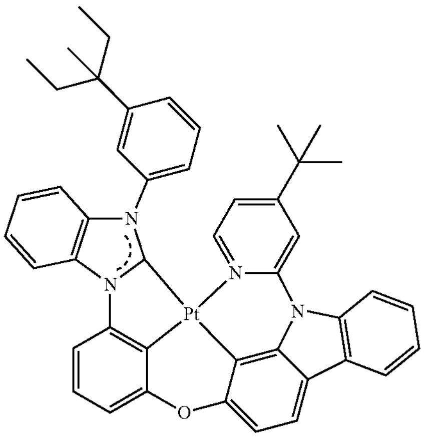
204
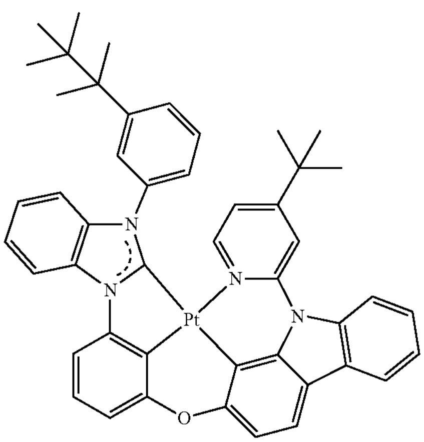
205
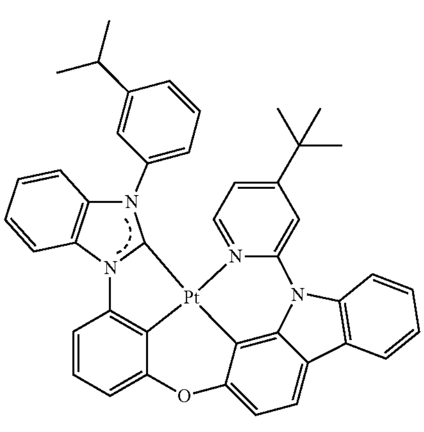
-continued
206
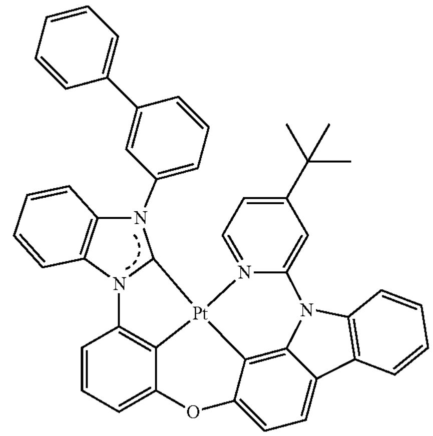
207
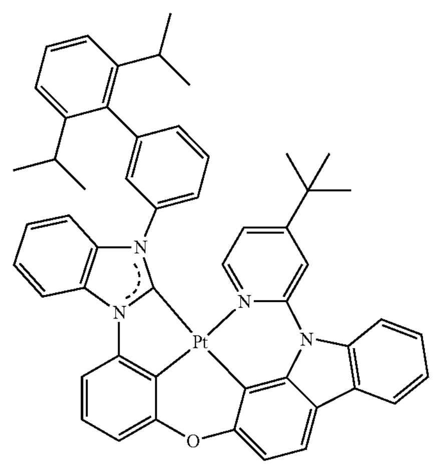
208
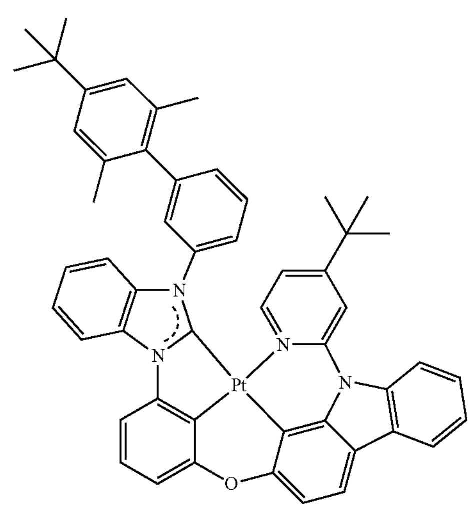

-continued
209
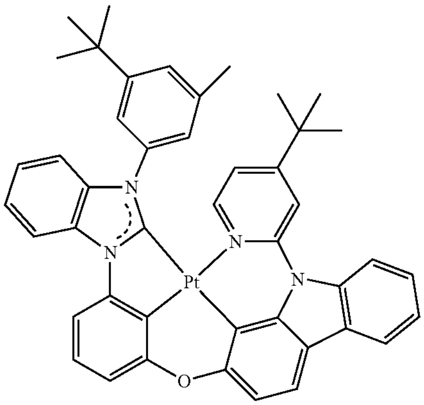
210
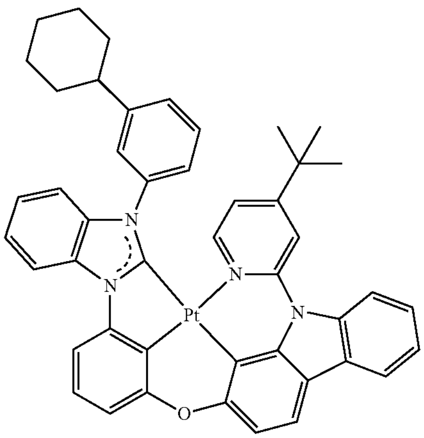
211
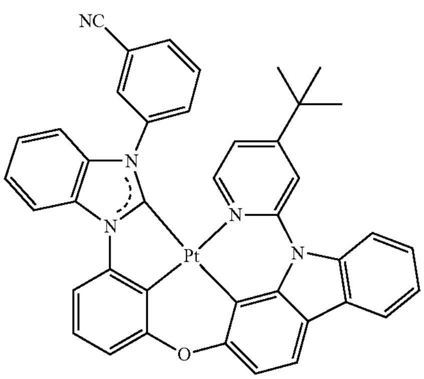
212
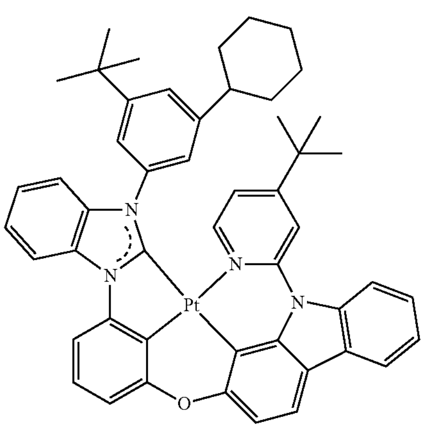
-continued
213
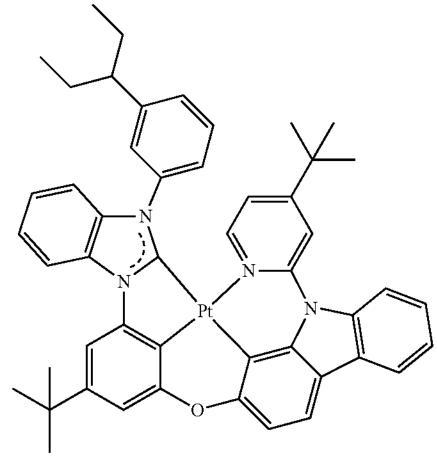
214
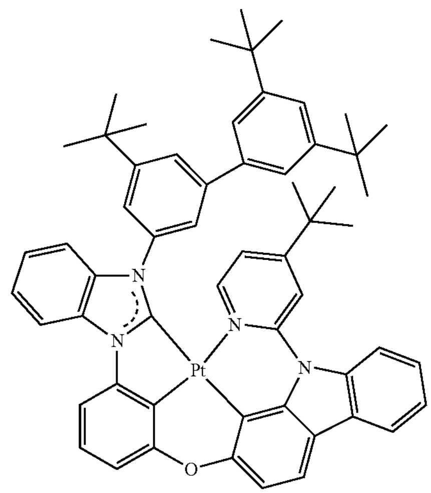
215
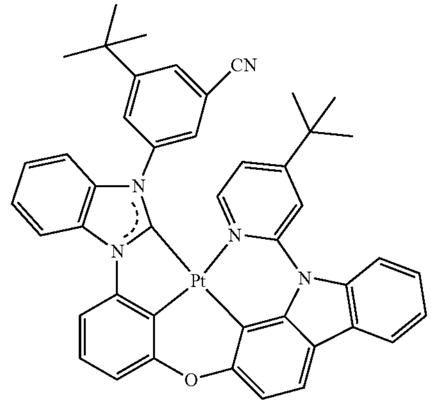

-continued
216
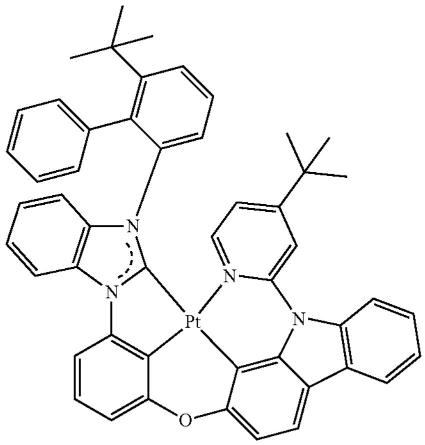
217
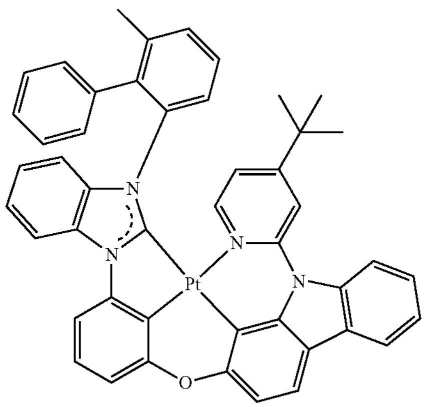
218
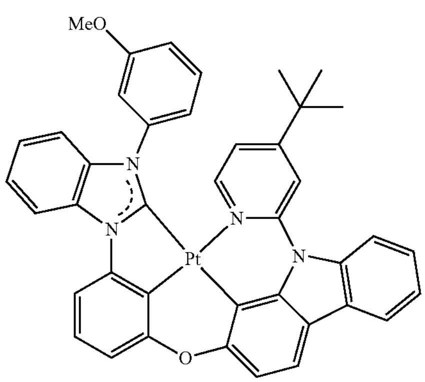
219
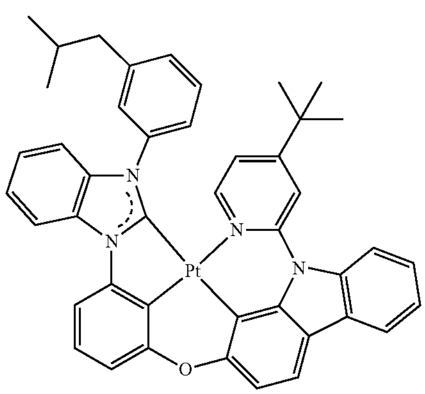
-continued
220
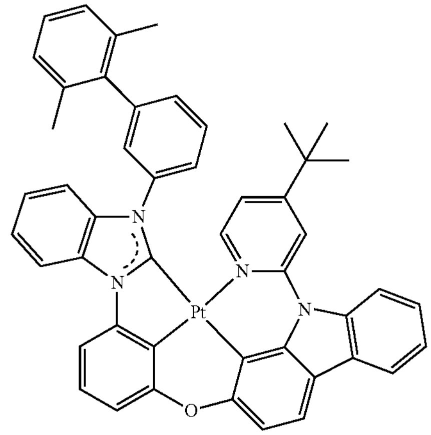
221
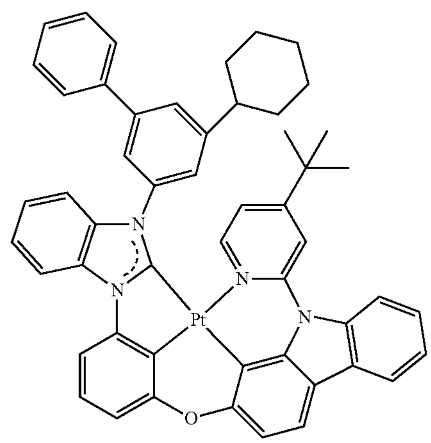
222
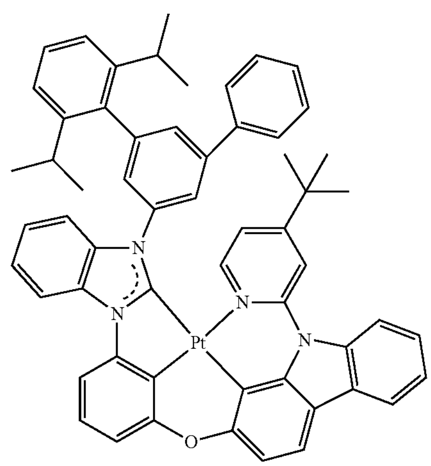

223
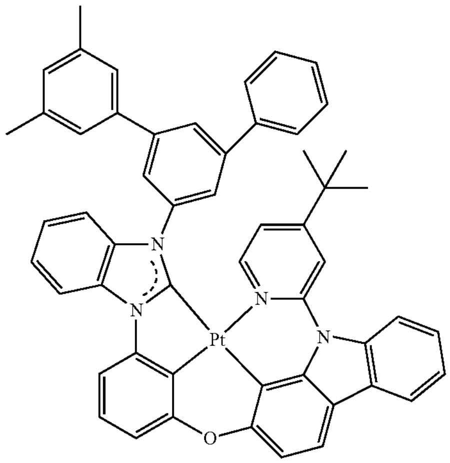
224
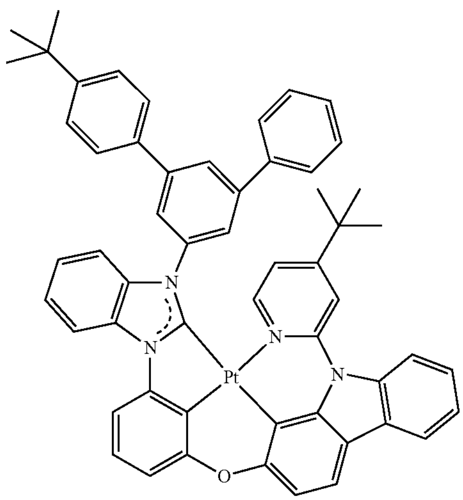
225
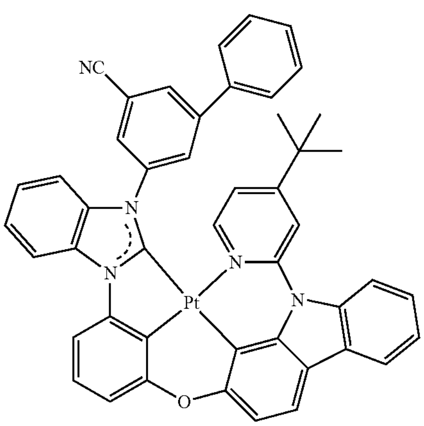
226
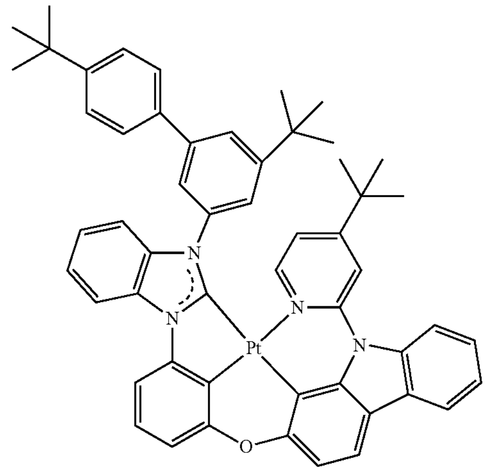
227
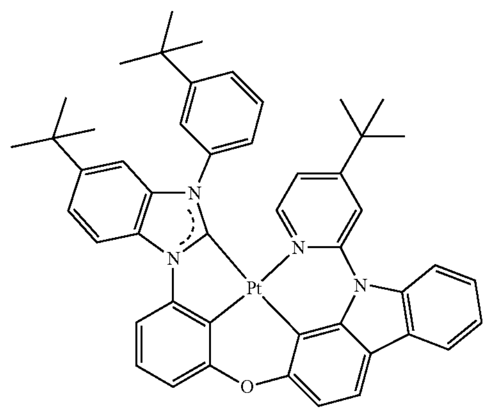
228
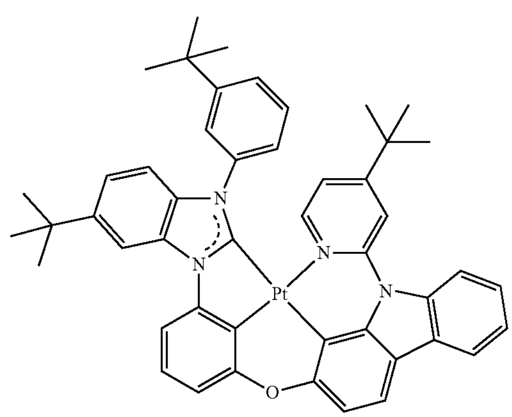

229
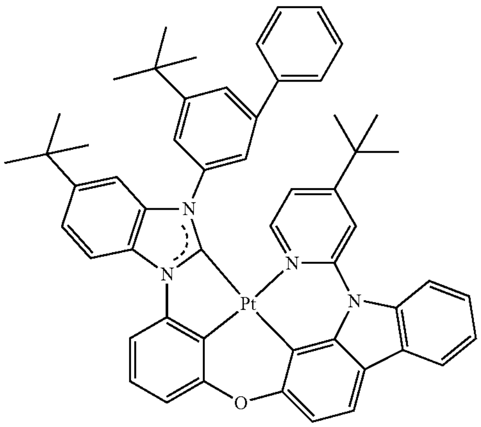
230
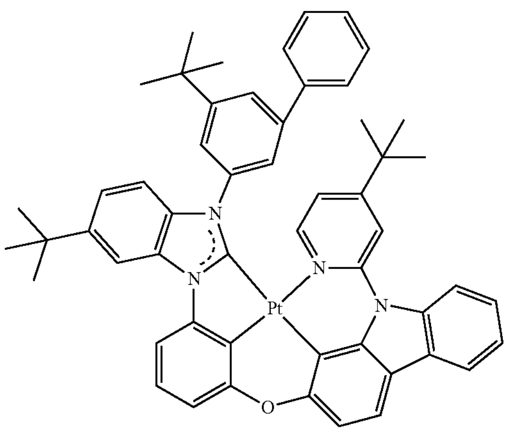
231
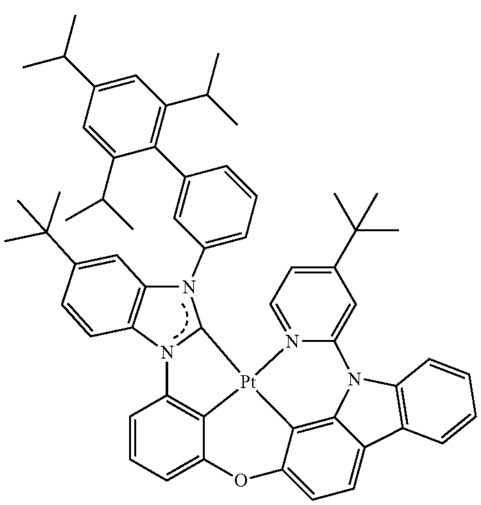
232
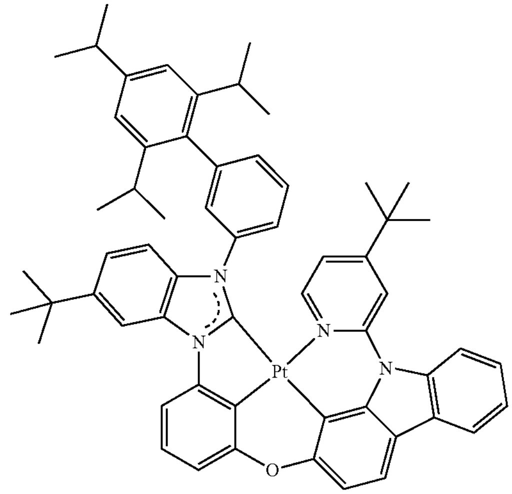
233
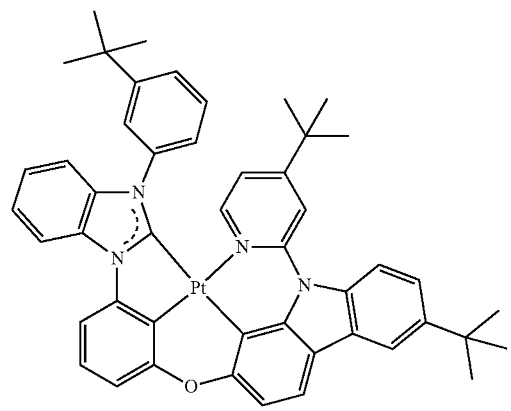
234
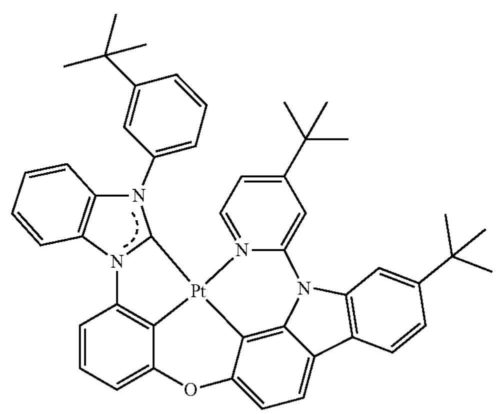

-continued
235
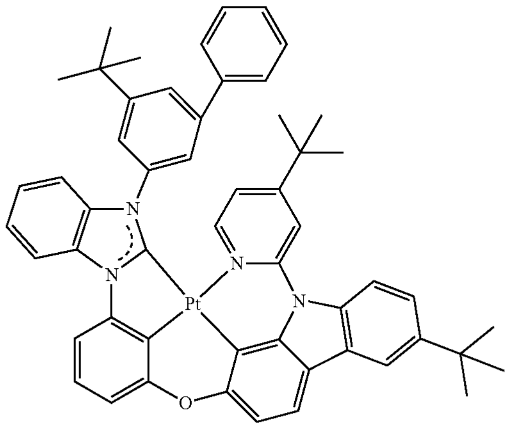
236
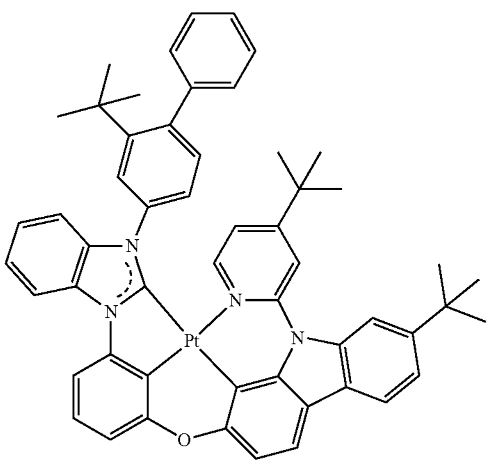
237
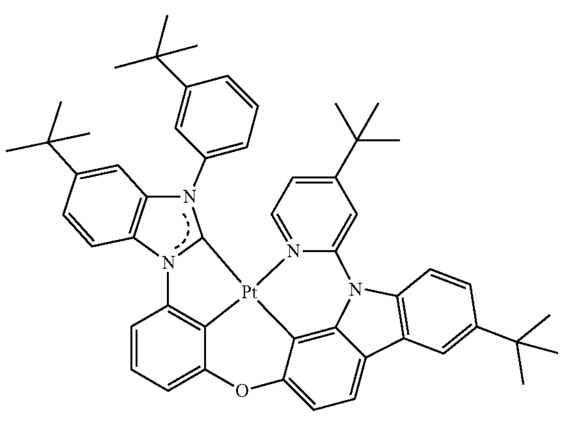
-continued
238
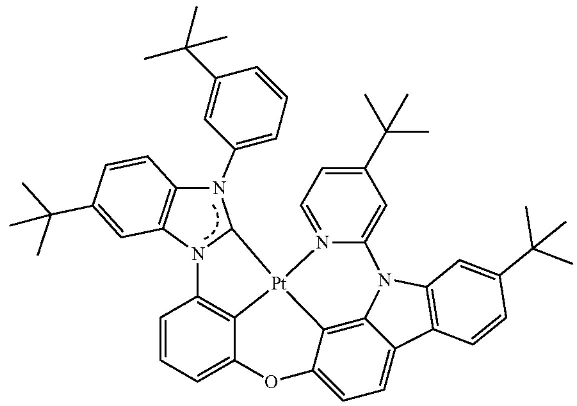
239
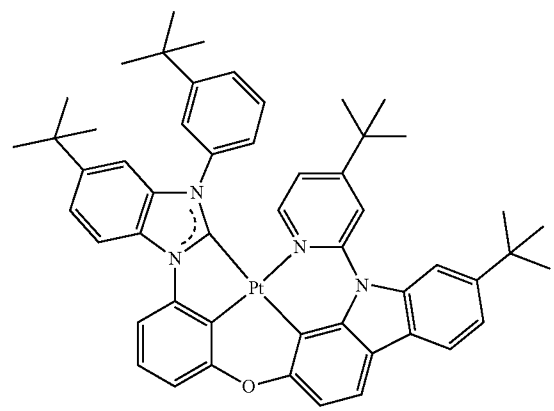
240
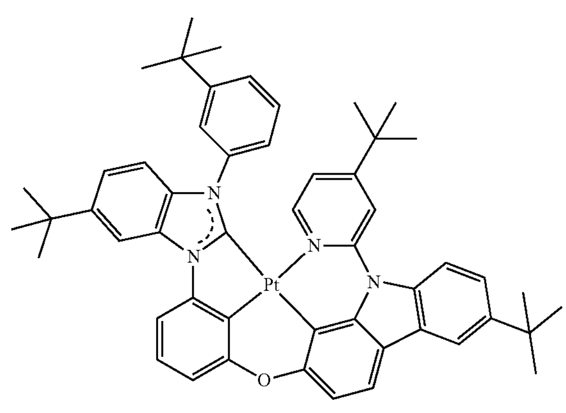

-continued
241
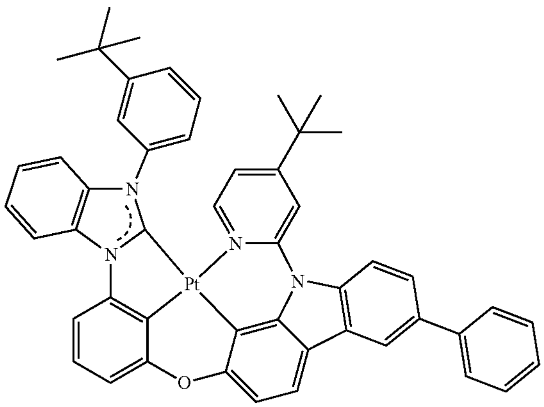
242
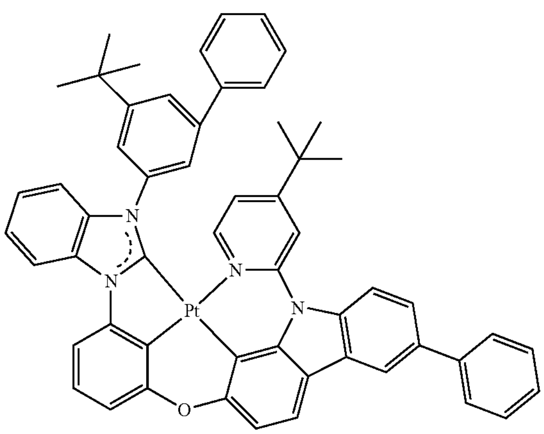
243
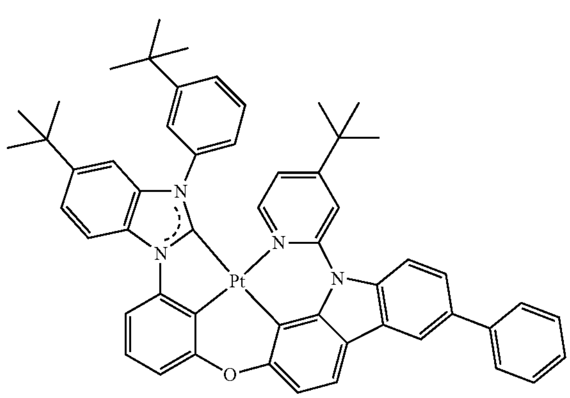
-continued
244
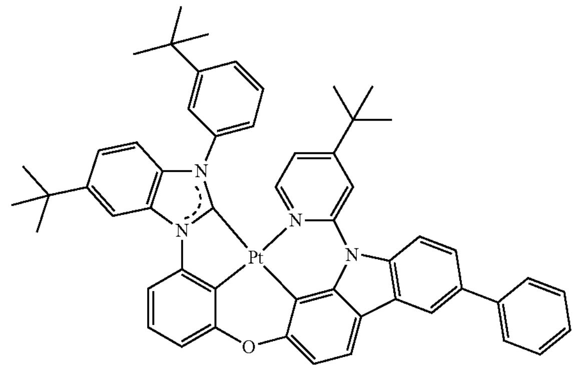
245
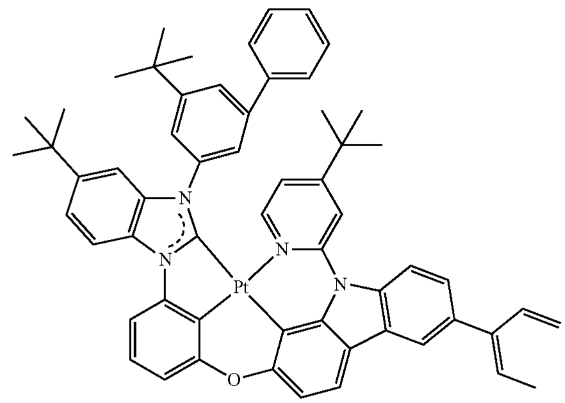
246
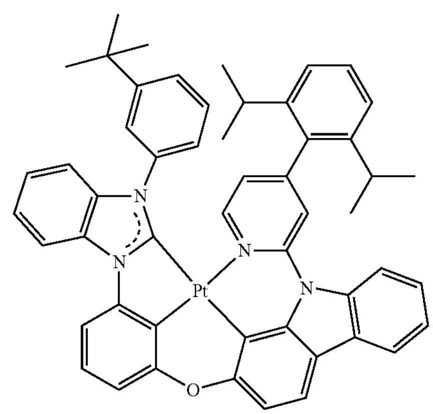
247
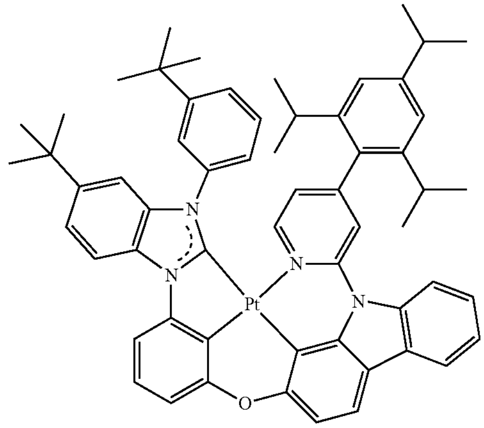

-continued
248
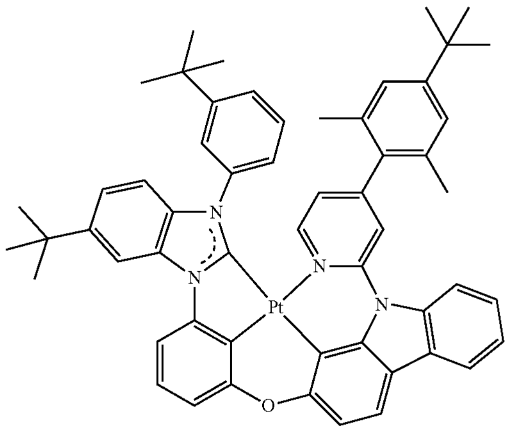
249
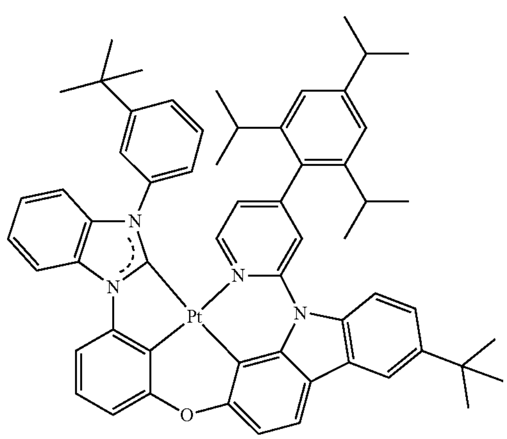
250
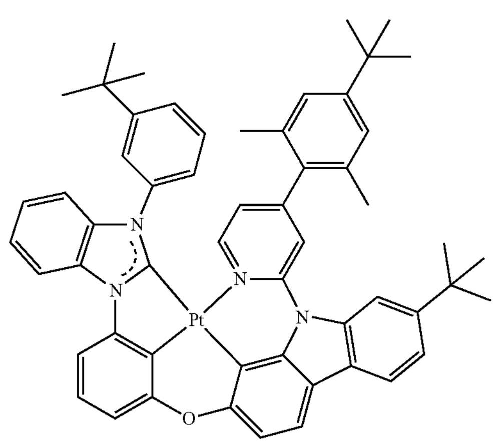
-continued
251
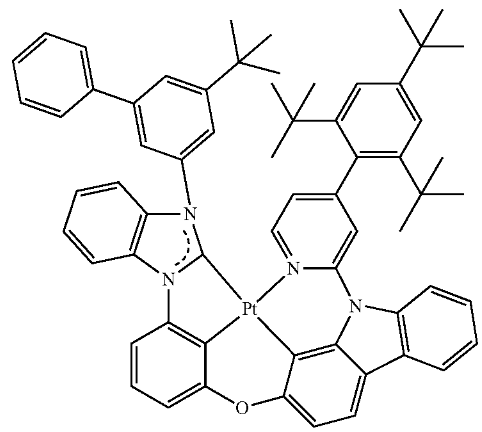
252
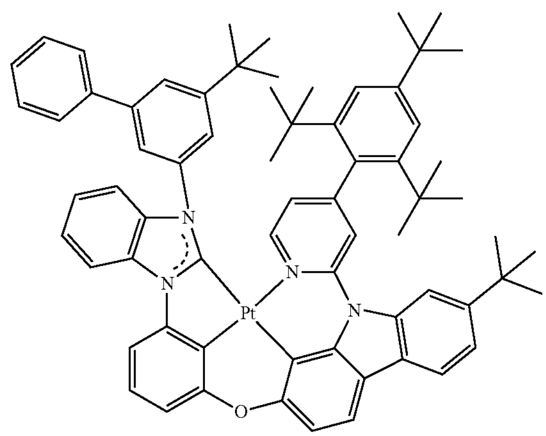
253
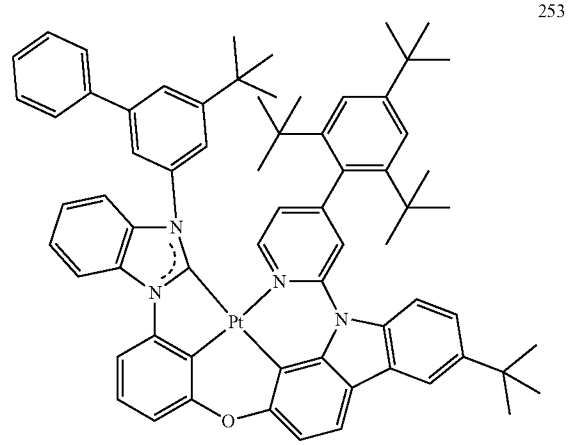

-continued
254
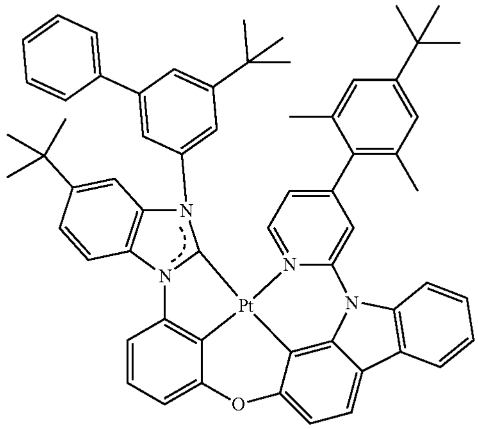
255
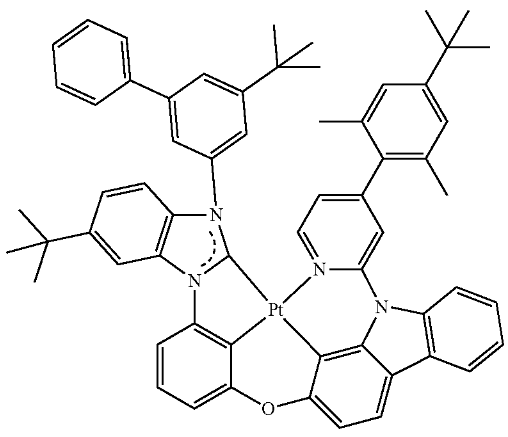
256
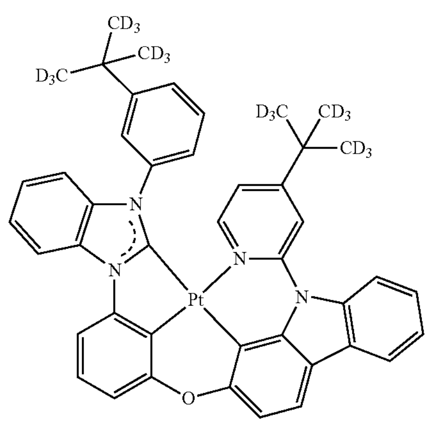
-continued
257
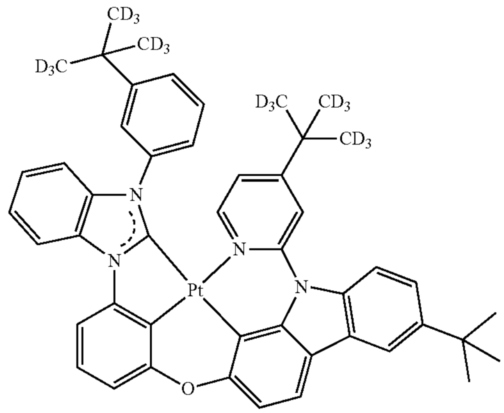
258
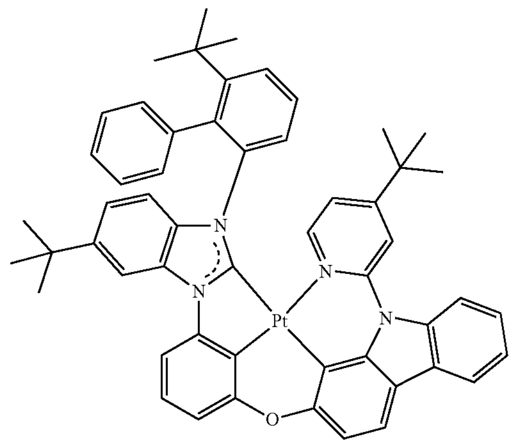
259
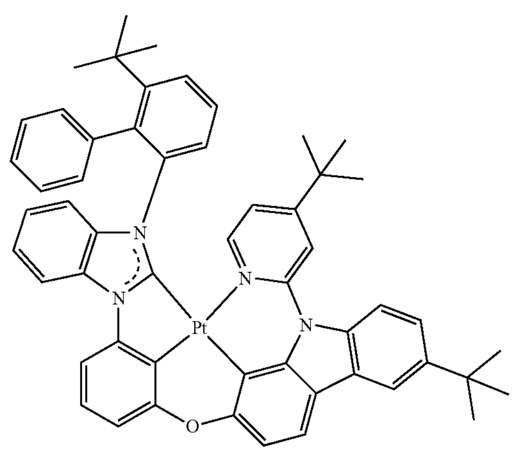

-continued
260
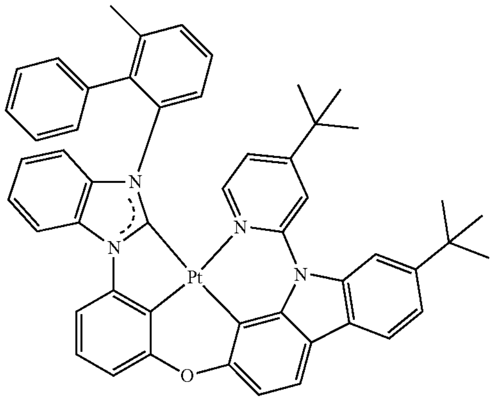
261
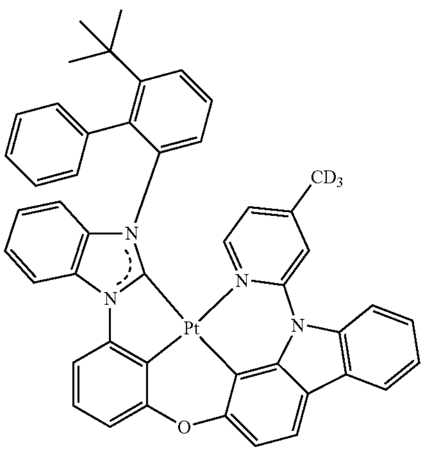
262
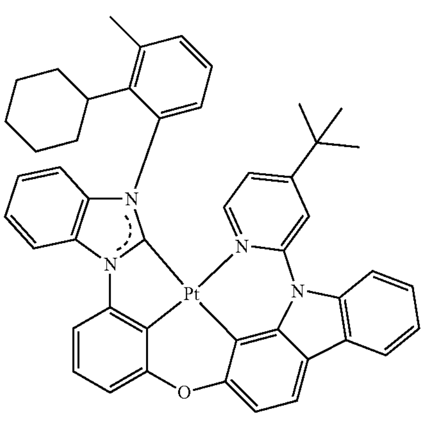
-continued
263
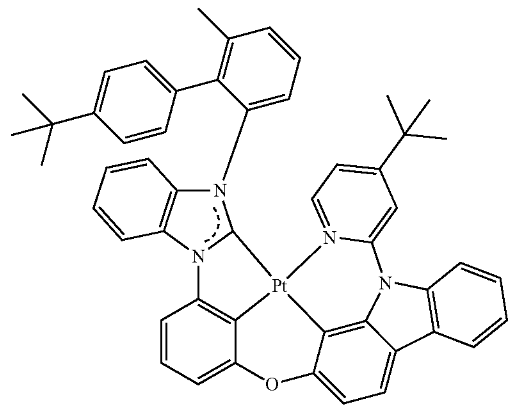
264
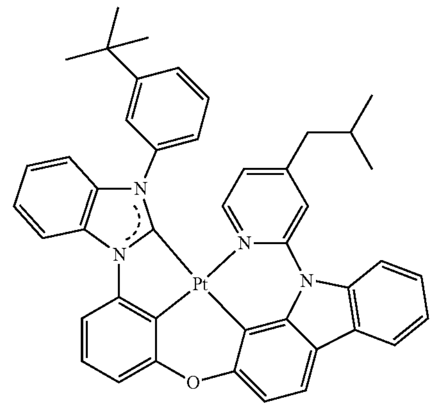
265
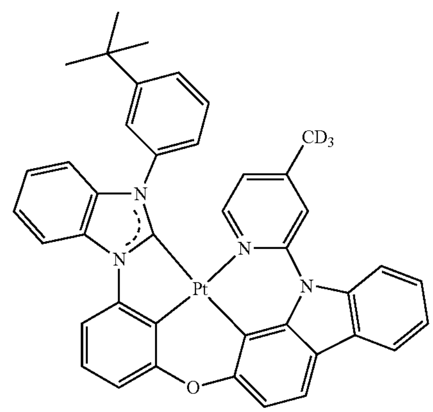
266
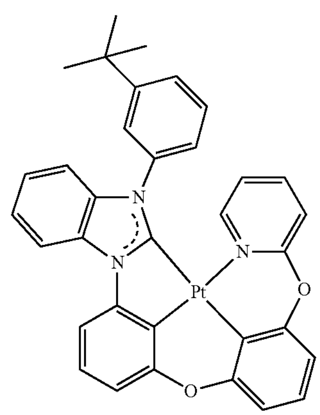

-continued
267
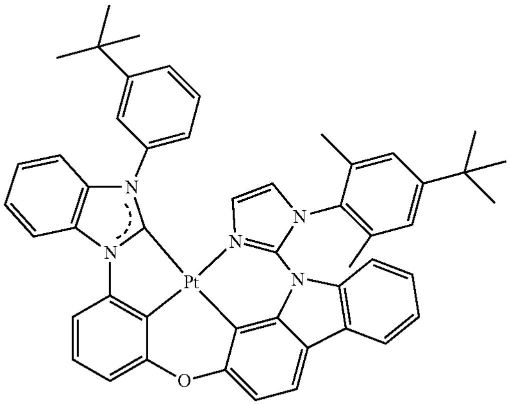
268
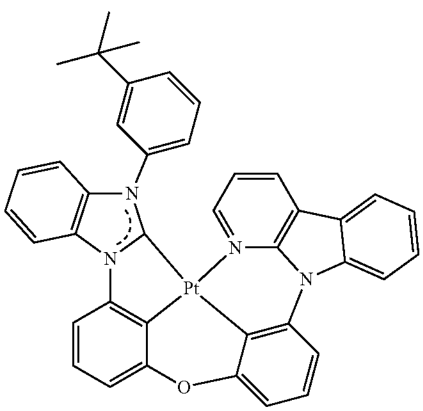
269
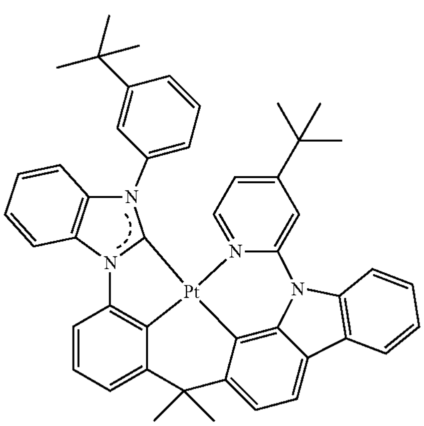
-continued
270
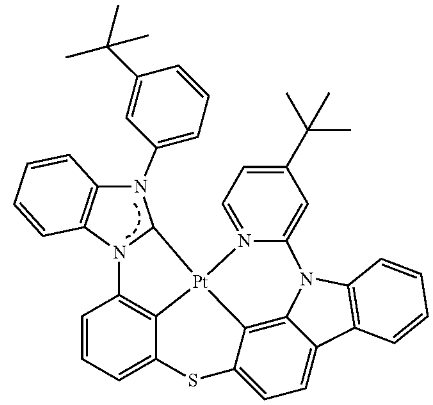
271
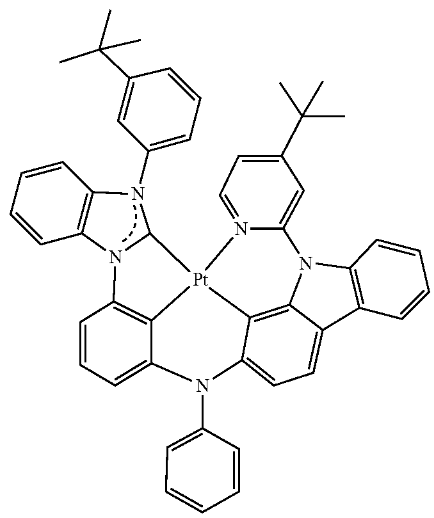
272
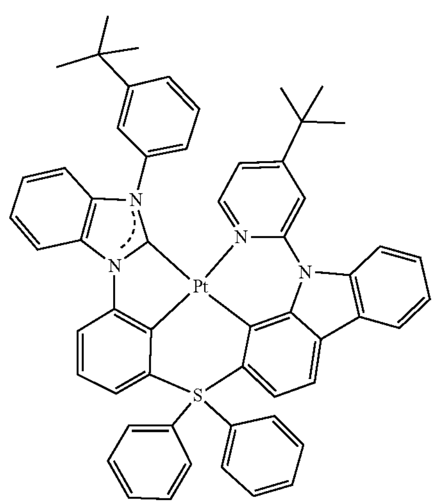

-continued
273
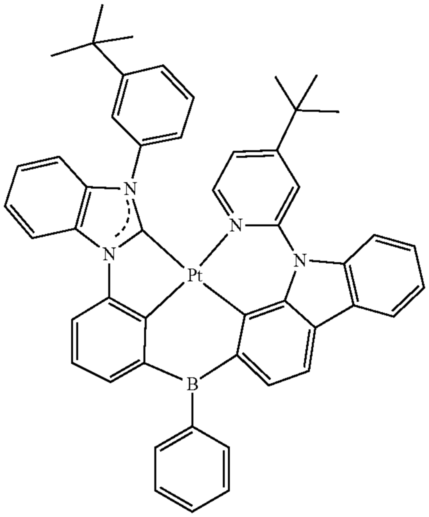
274
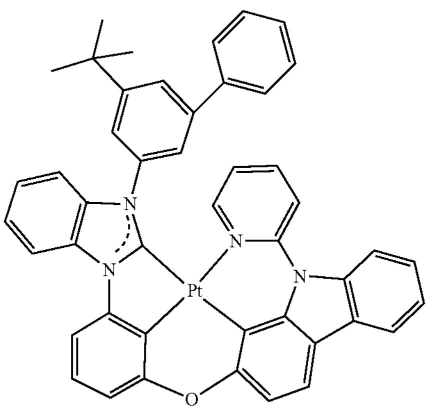
275
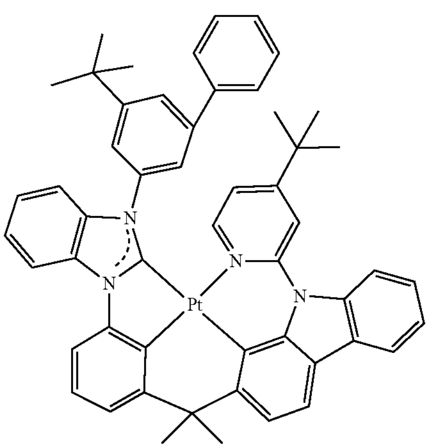
-continued
276
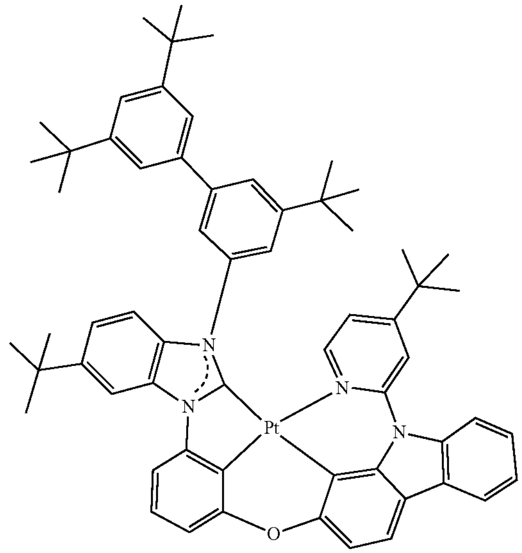
277
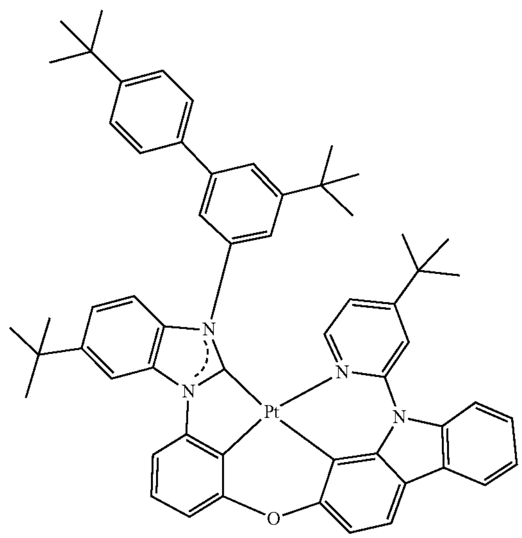
278
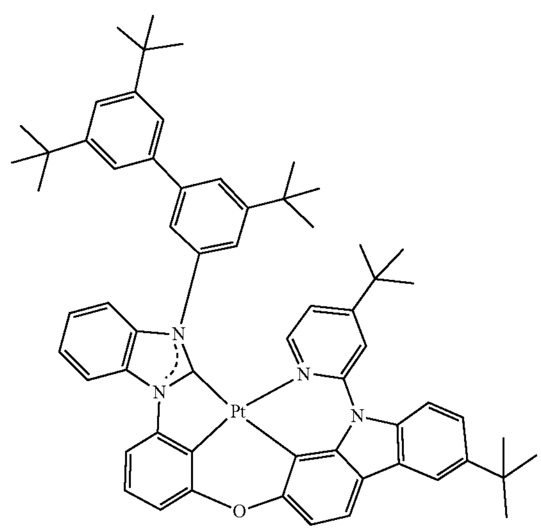

-continued
279
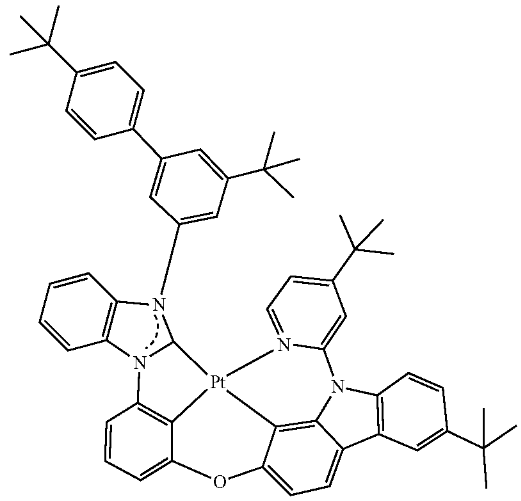
280
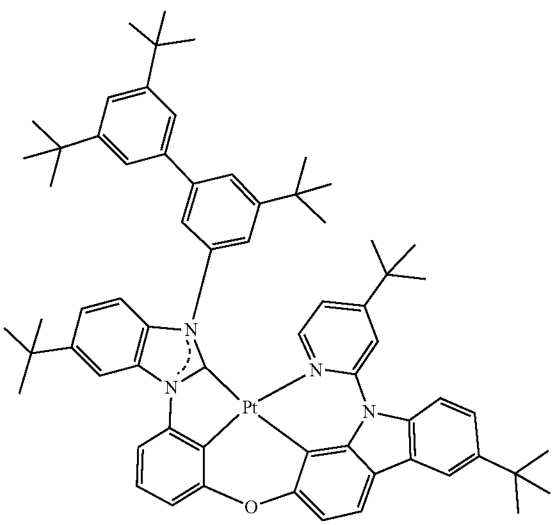
281
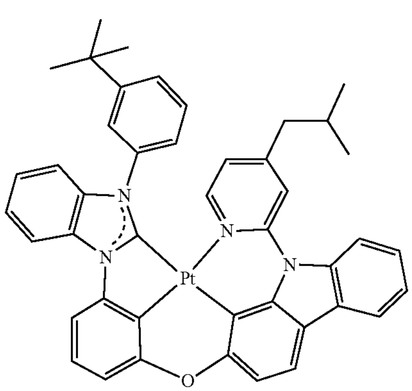
-continued
282
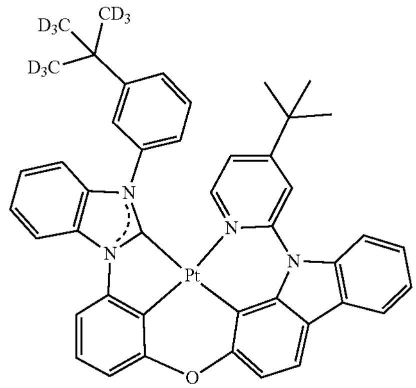
283
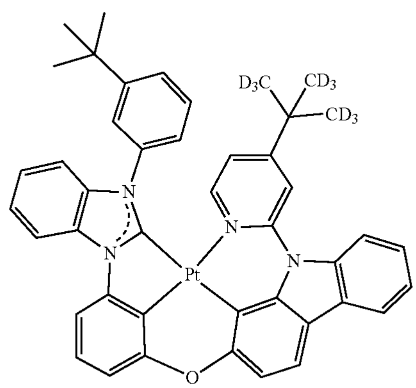
284
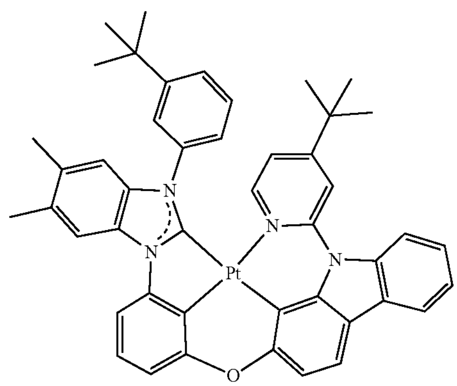
285
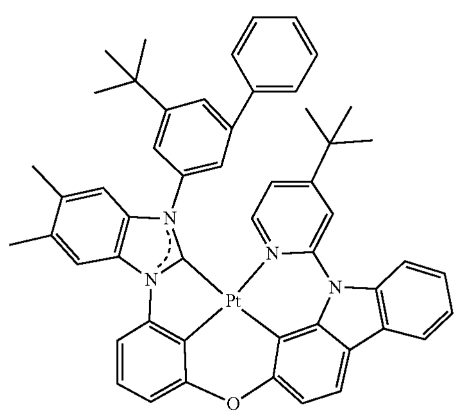

-continued
286
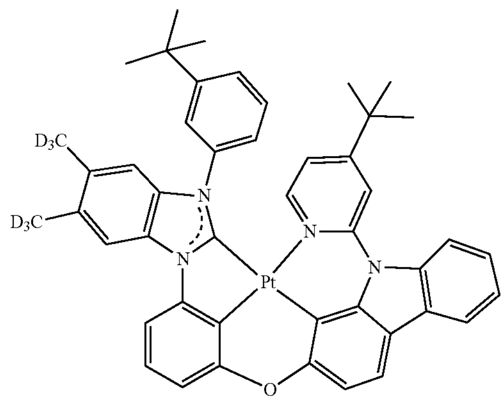
287
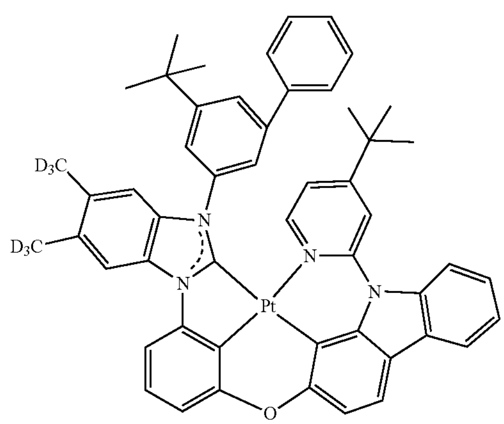
288
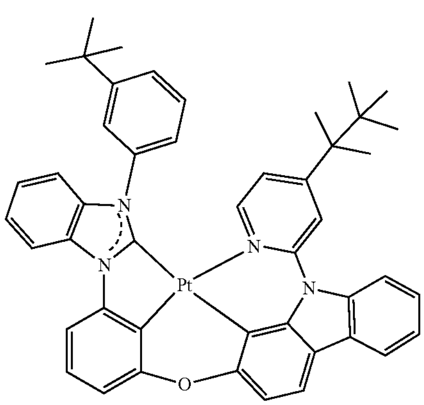
-continued
289
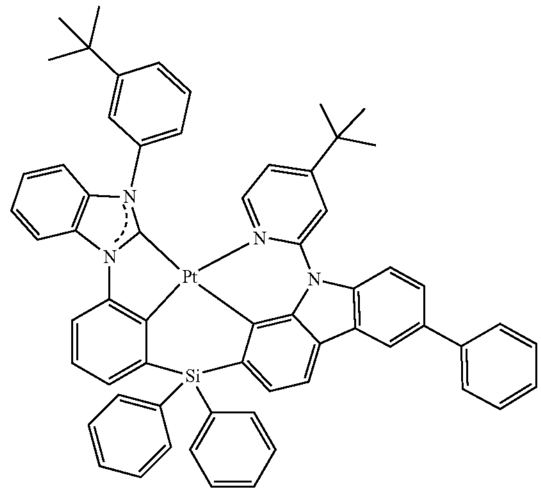
290
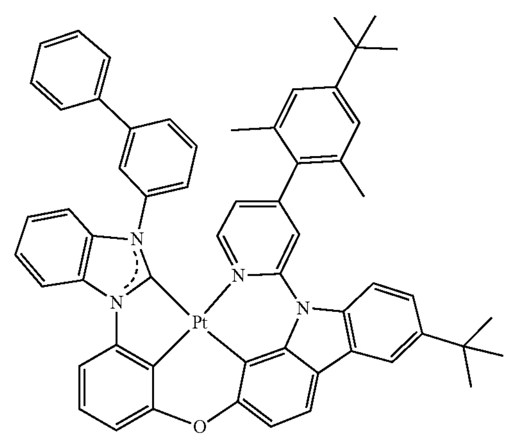
291
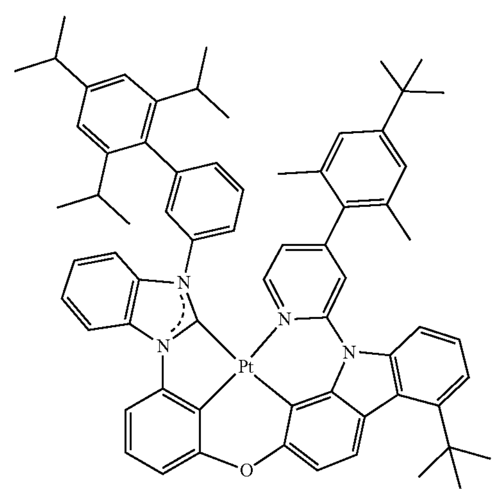

-continued
292
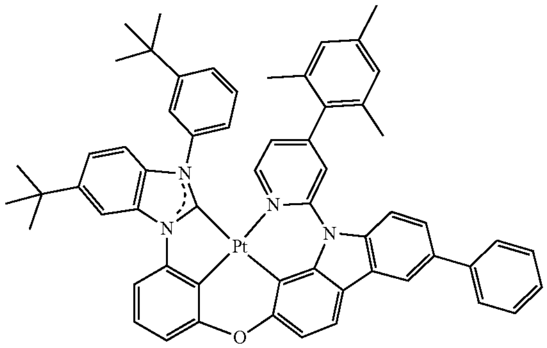
293
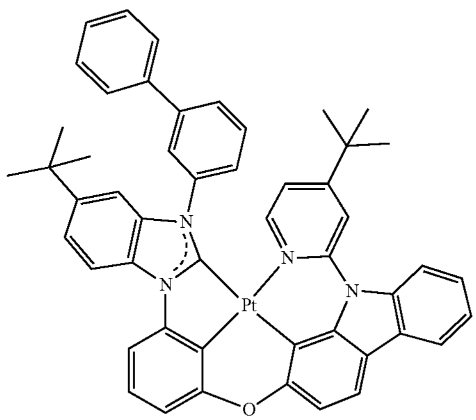
294
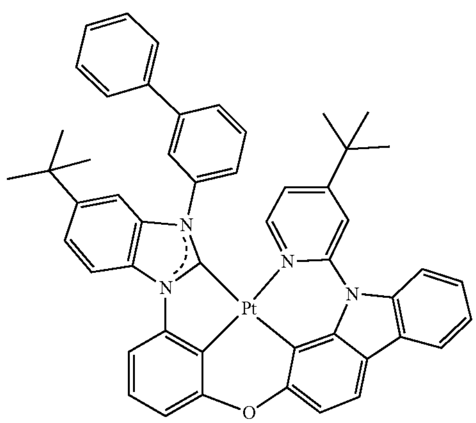
295
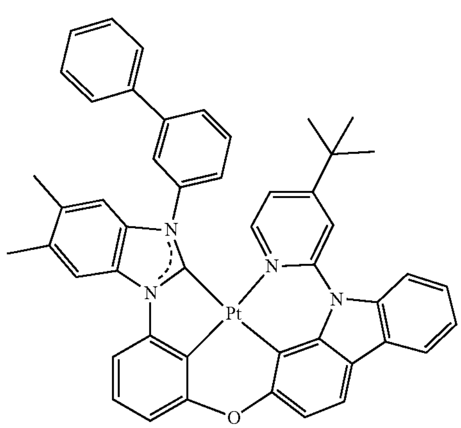
-continued
296
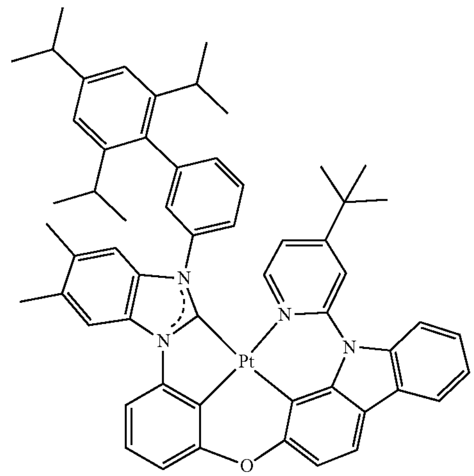
297
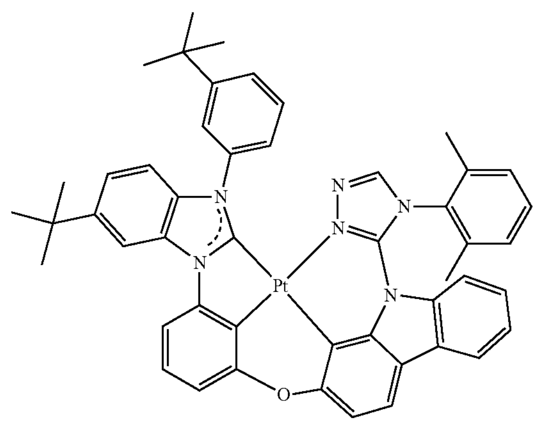
298
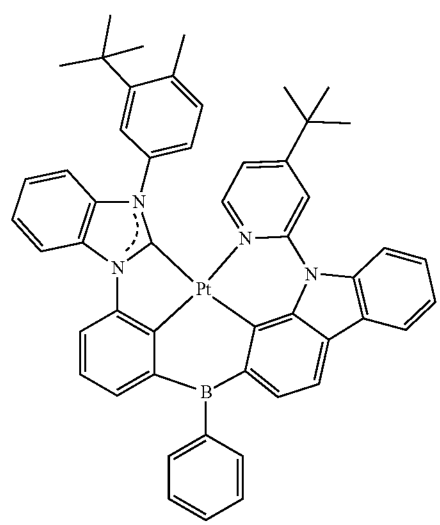

-continued
299
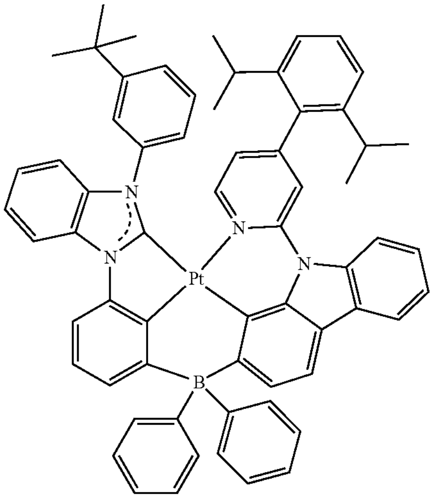
300
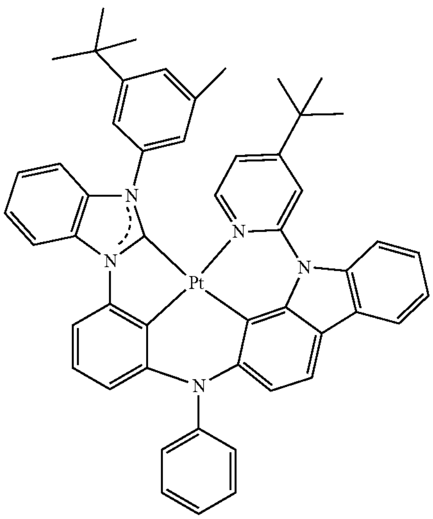
301
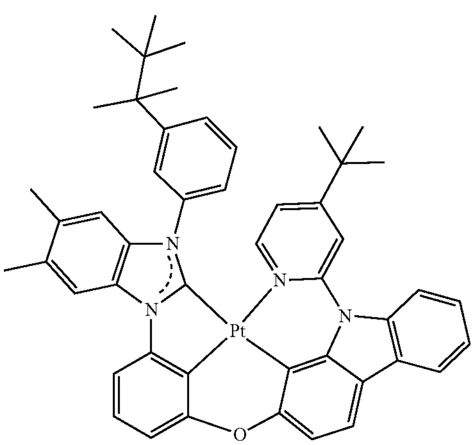
-continued
302
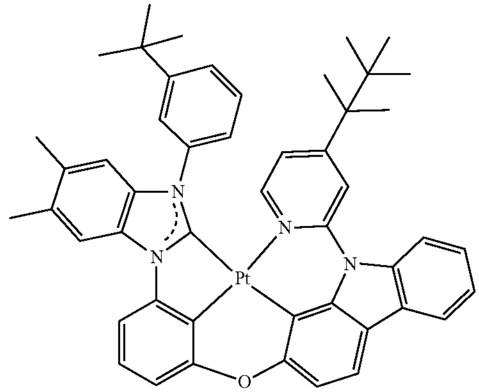
303
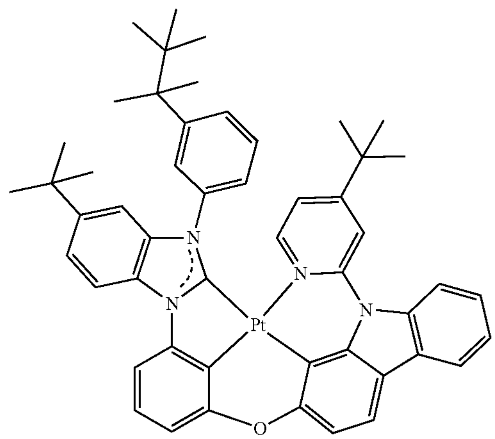
304
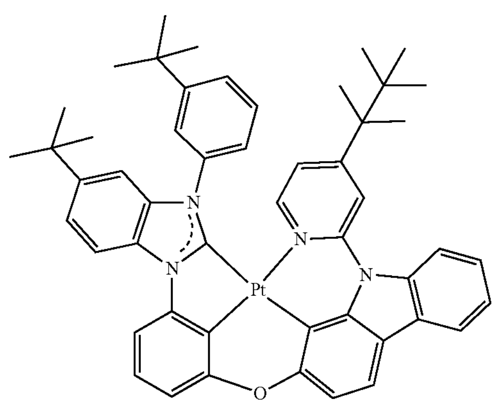

-continued
305
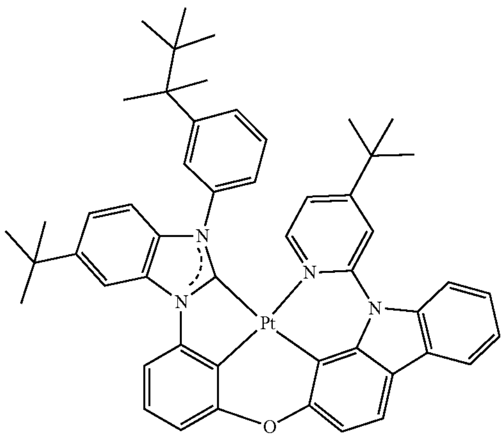
306
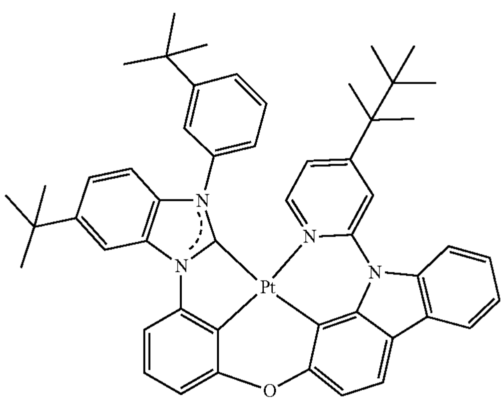
307
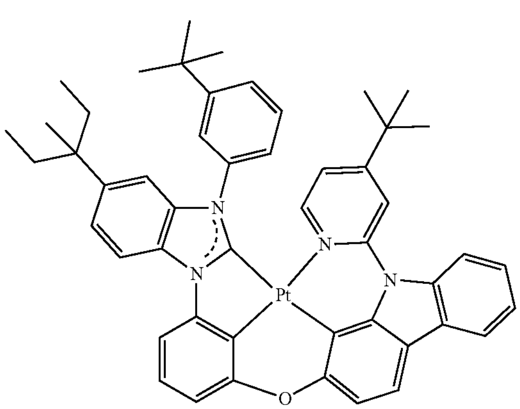
-continued
308
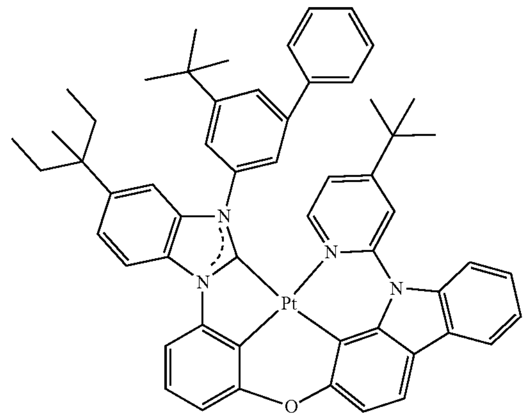
309
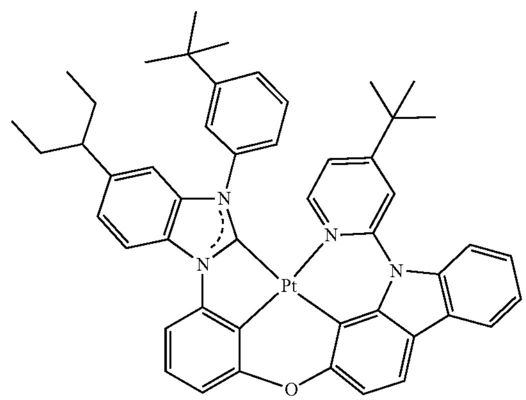
310
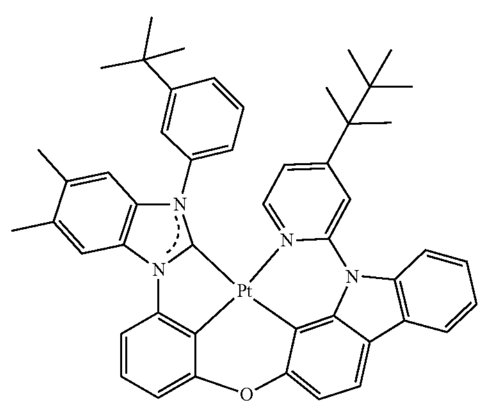

-continued
311
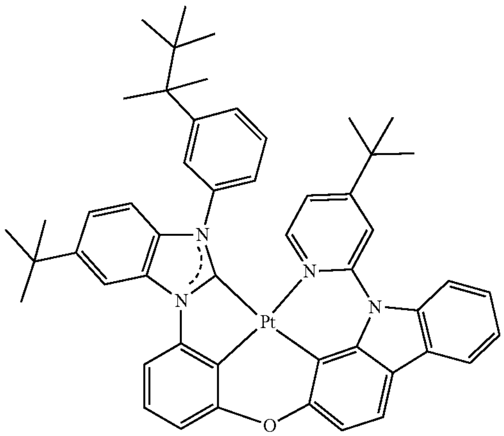
312
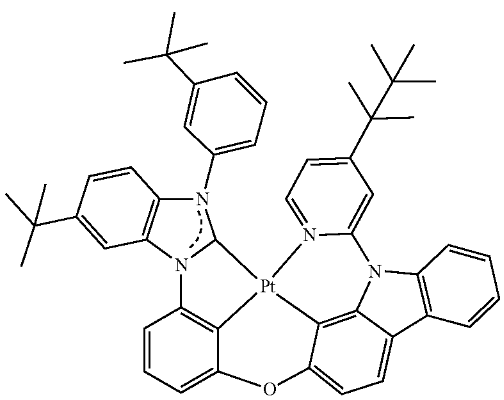
313
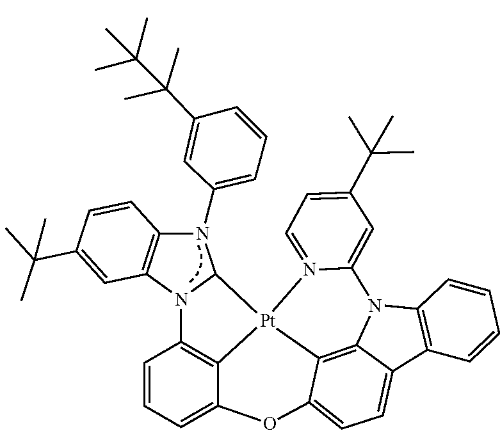
-continued
314
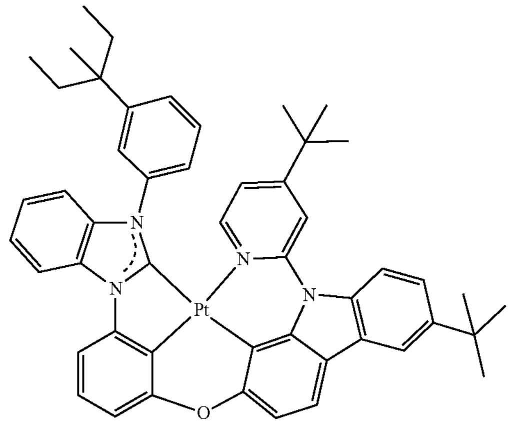
315
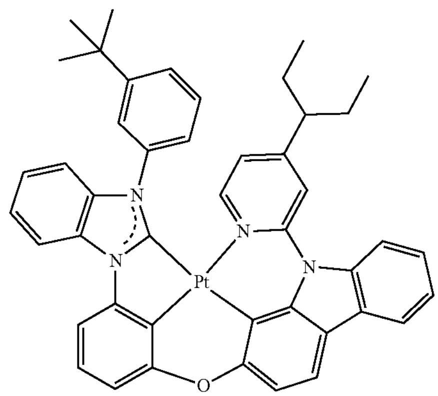
316
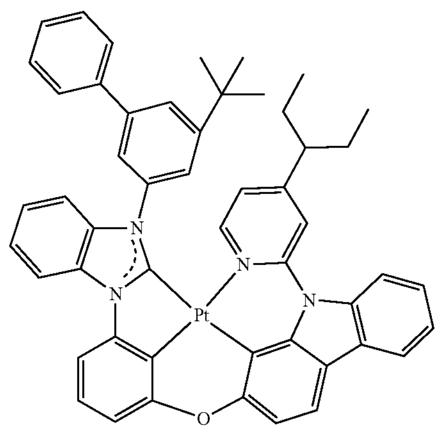
317
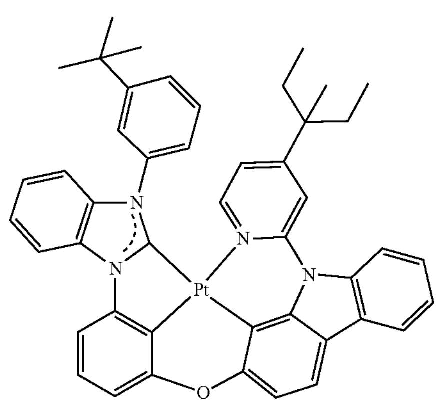

-continued
318
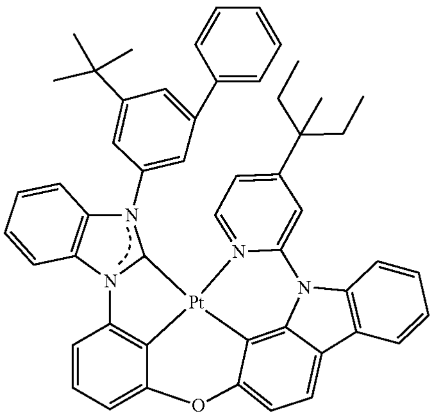
319
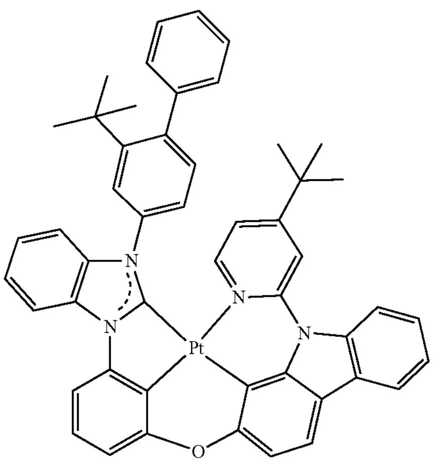
320
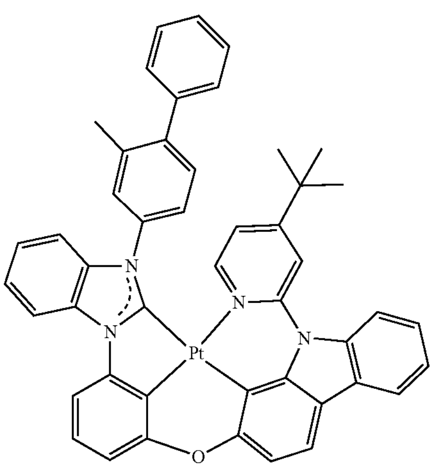
-continued
321
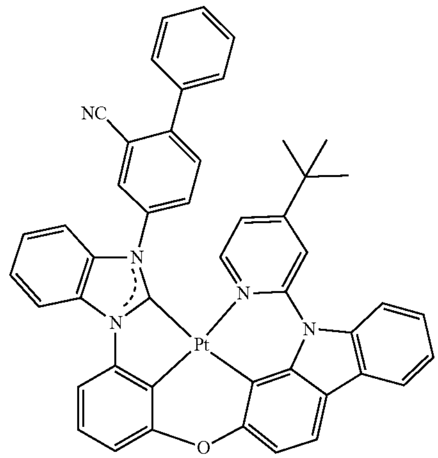
322
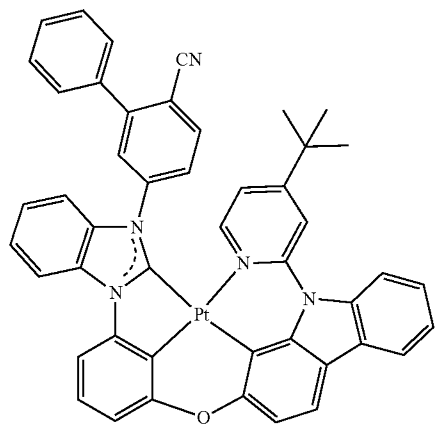
323
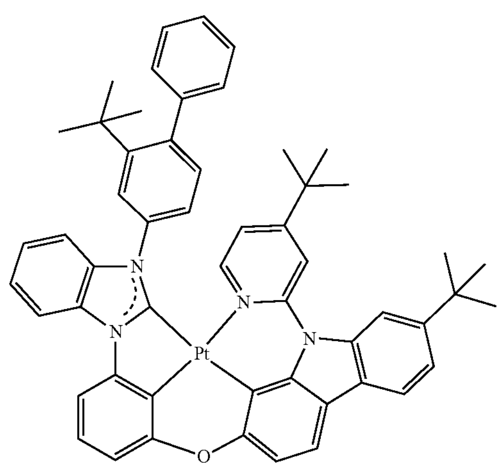

324
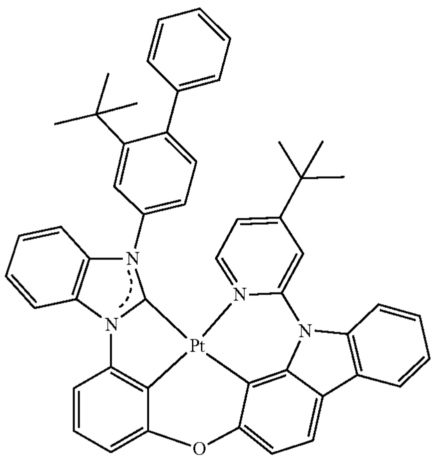
325
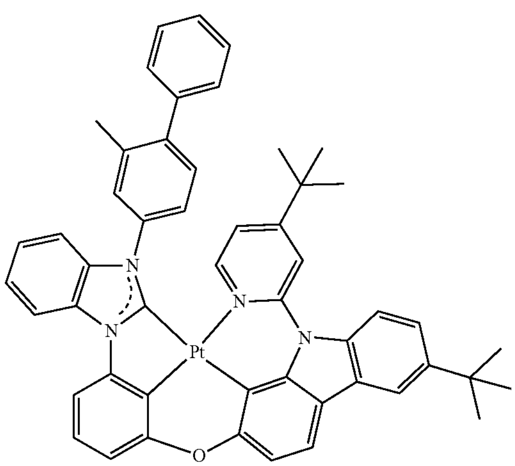
Group VII
1
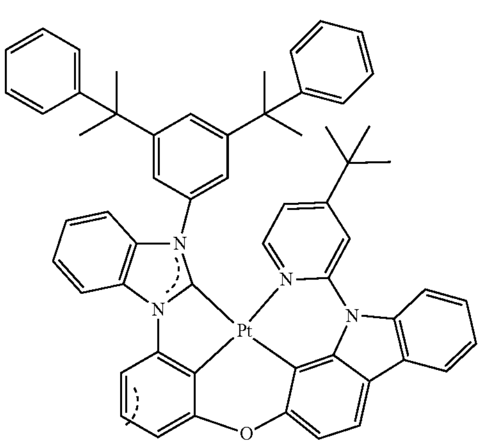
2
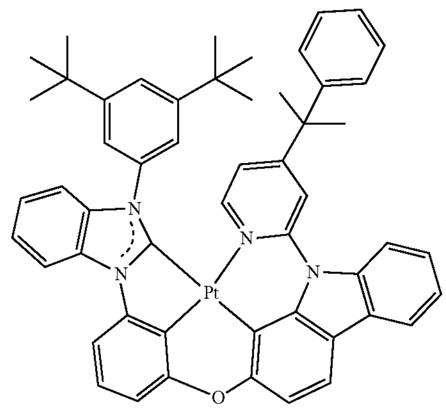
3
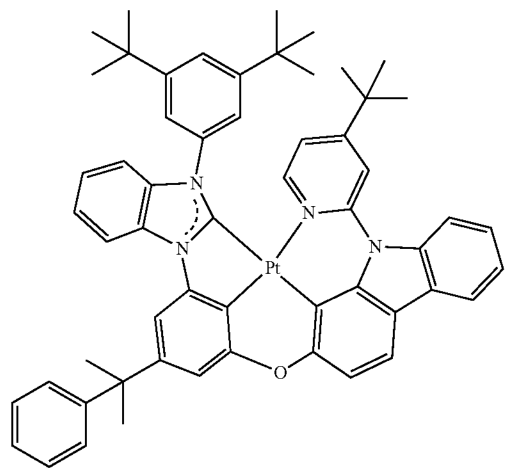
4
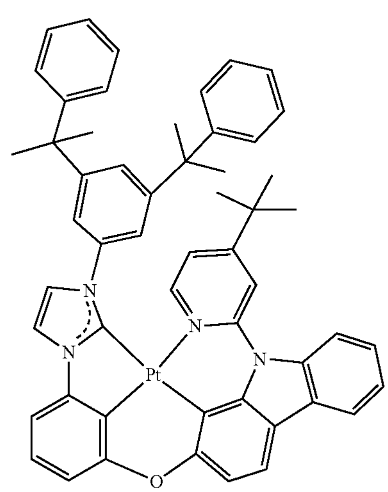

-continued
5
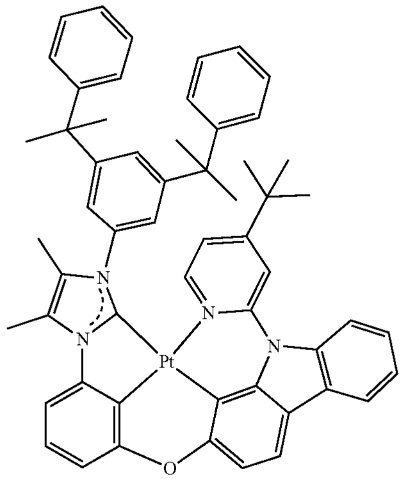
6
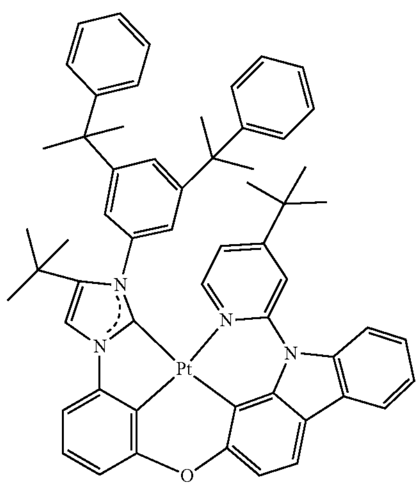
7
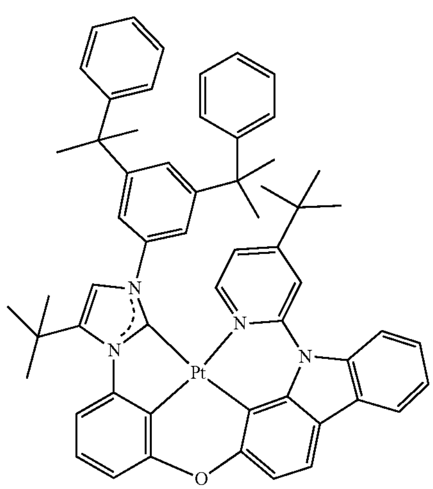
-continued
8
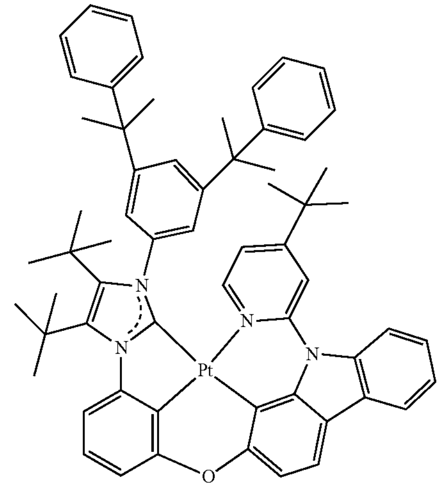
9
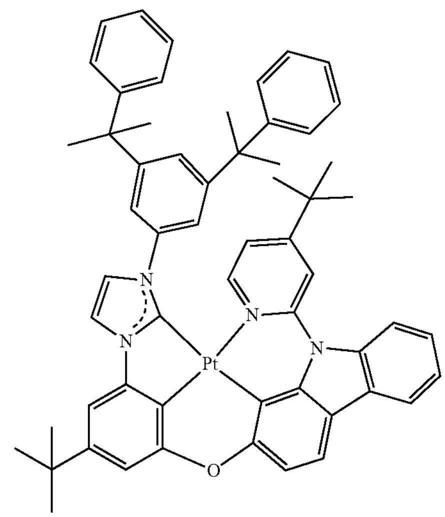
10
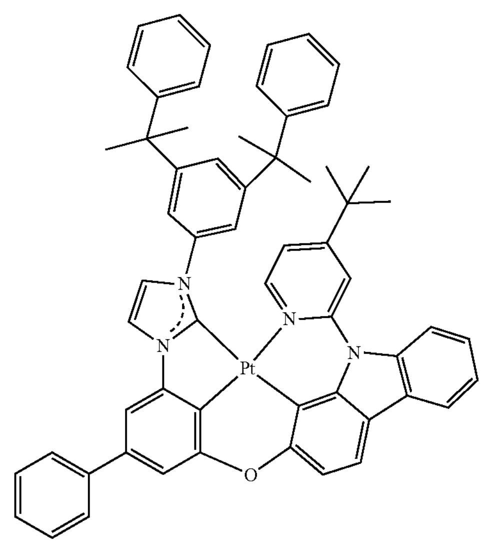

-continued
11
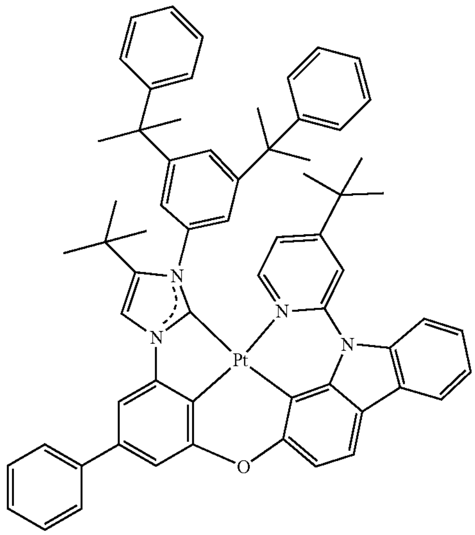
12
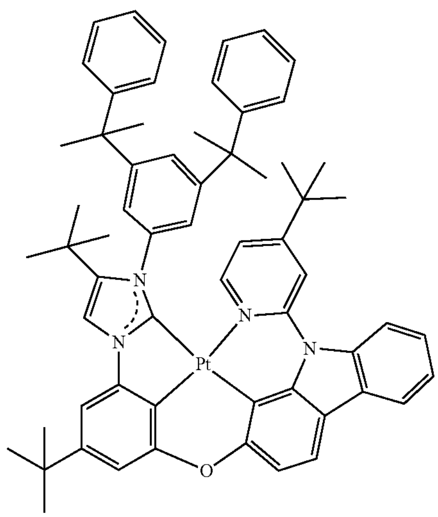
13
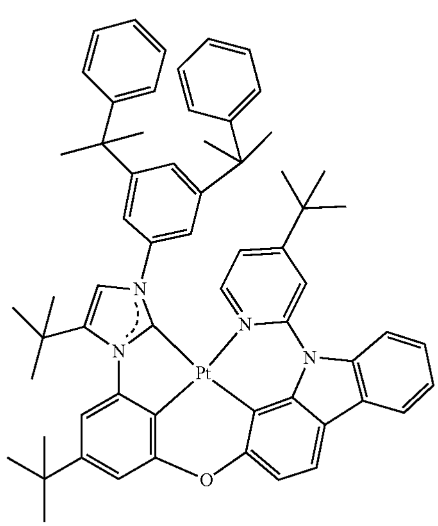
-continued
14
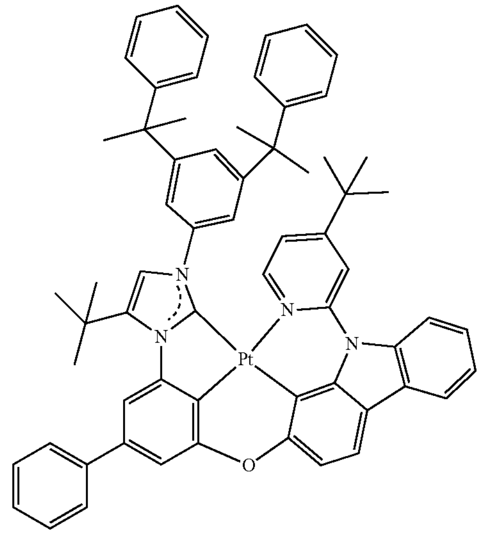
15
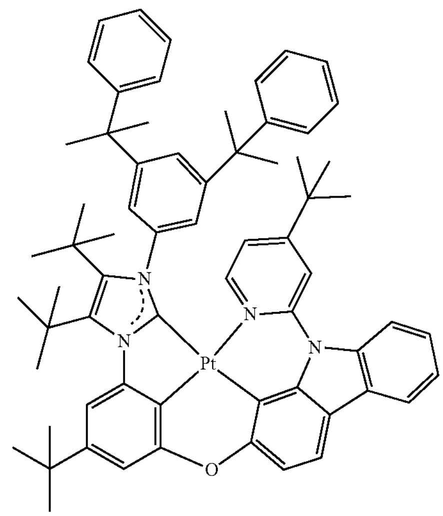
16
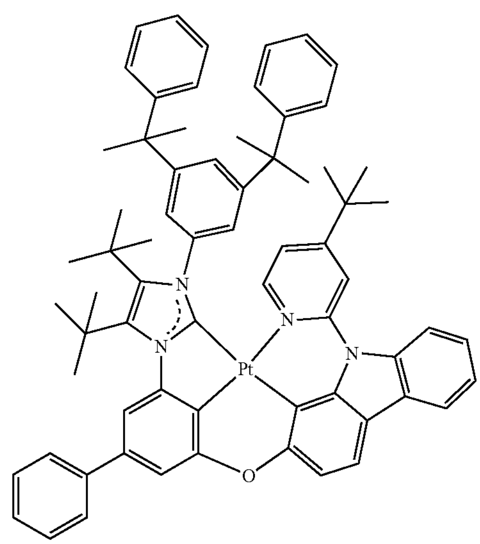

-continued
17
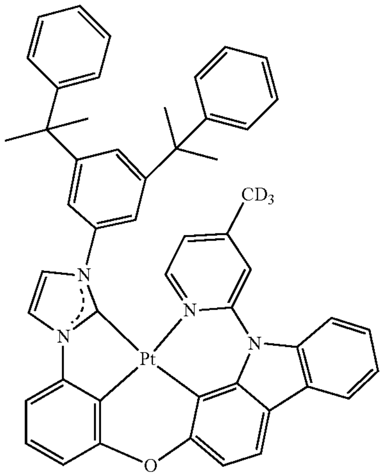
18
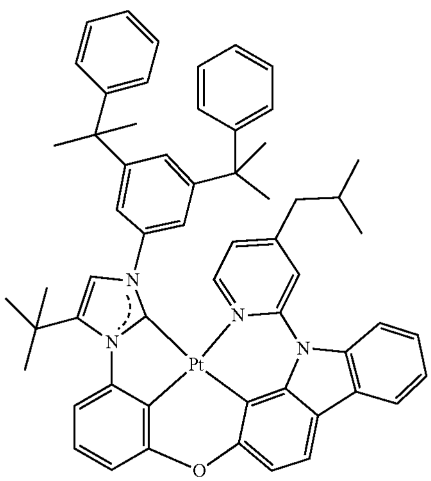
19
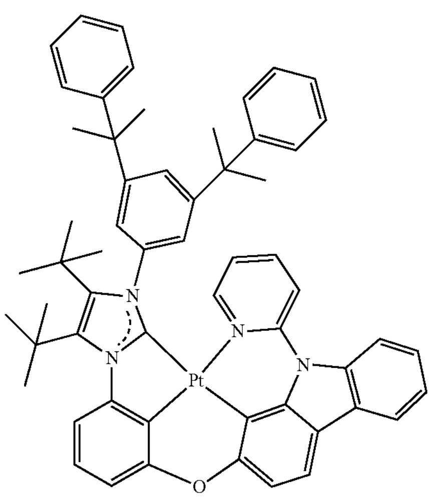
-continued
20
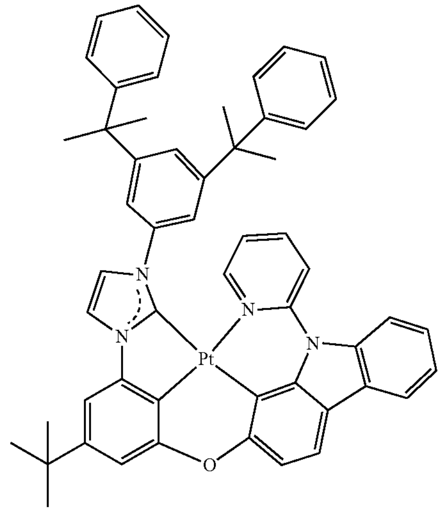
21
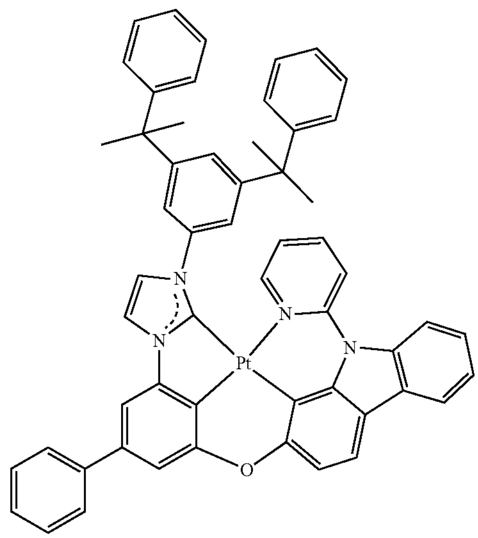
22
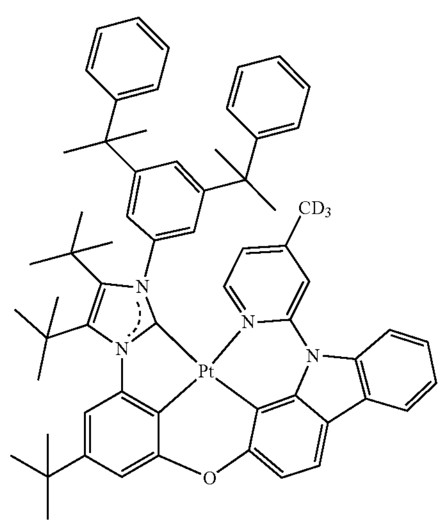

-continued
23
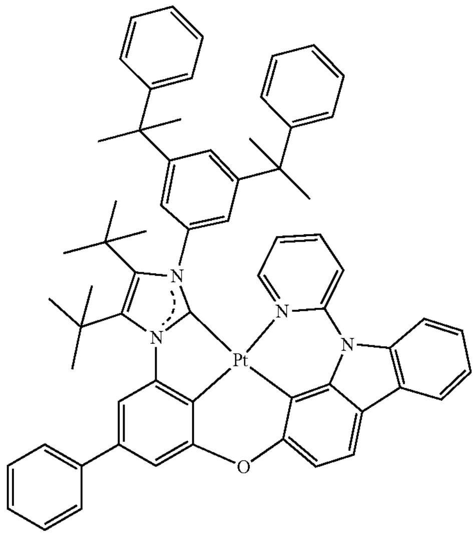
24
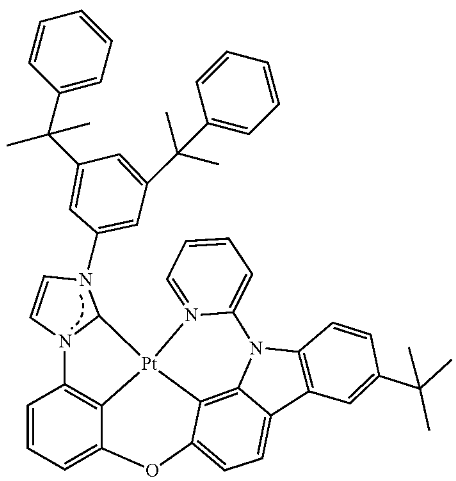
25
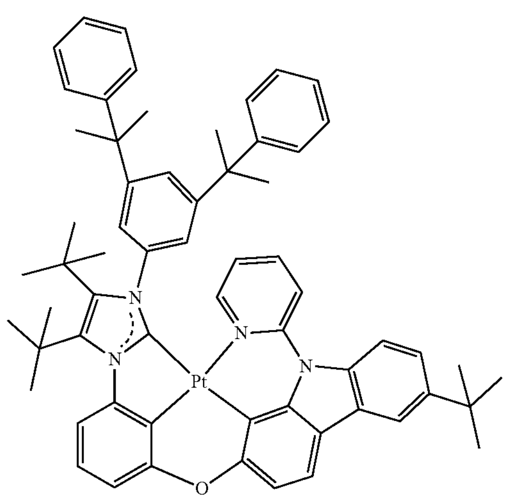
-continued
26
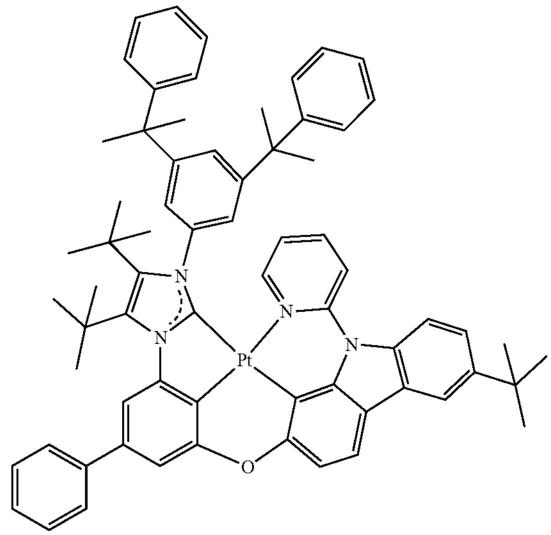
27
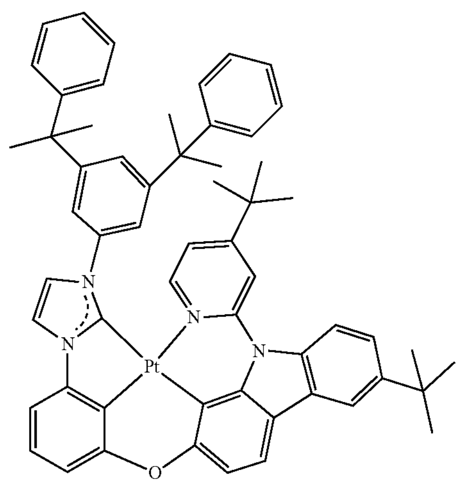
28
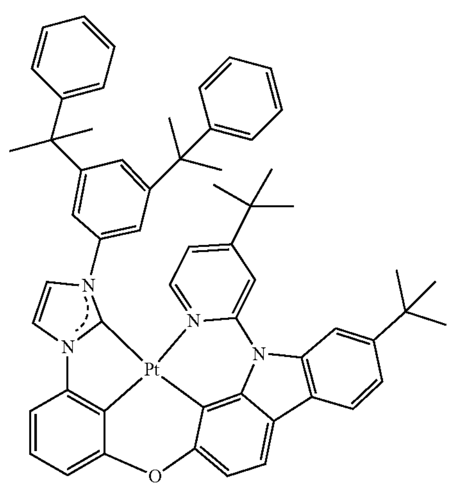

-continued
29
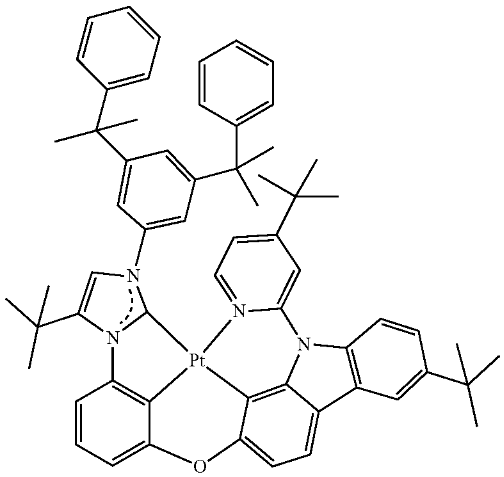
30
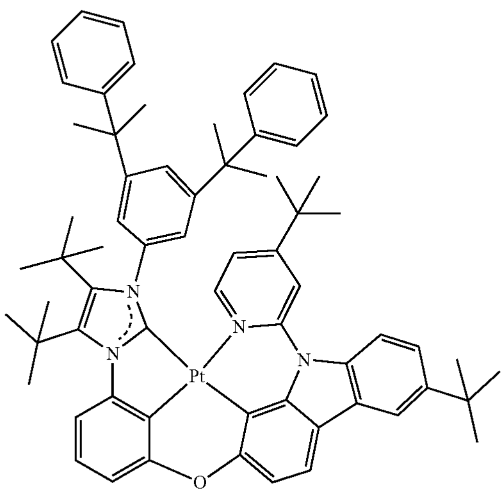
31
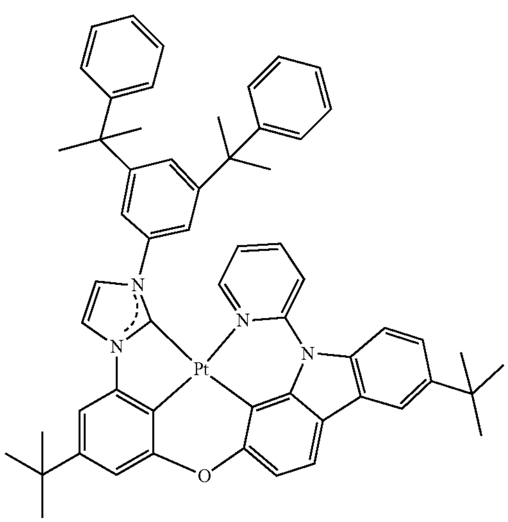
-continued
32
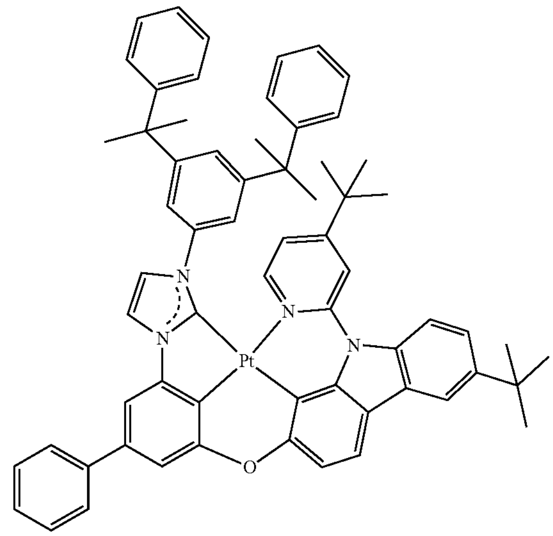
33
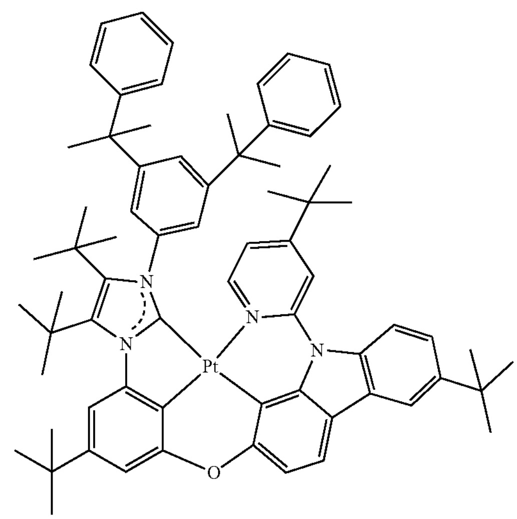
34
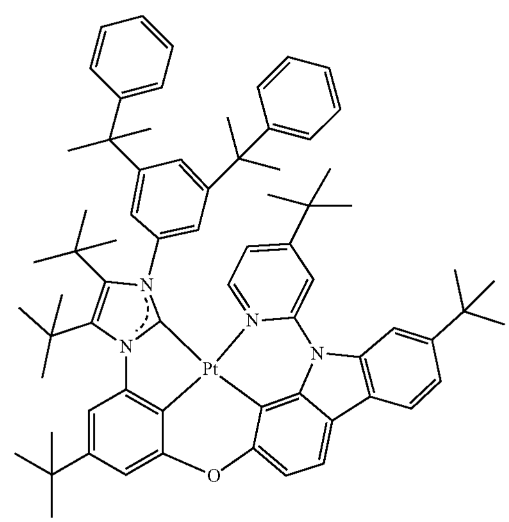

-continued
35
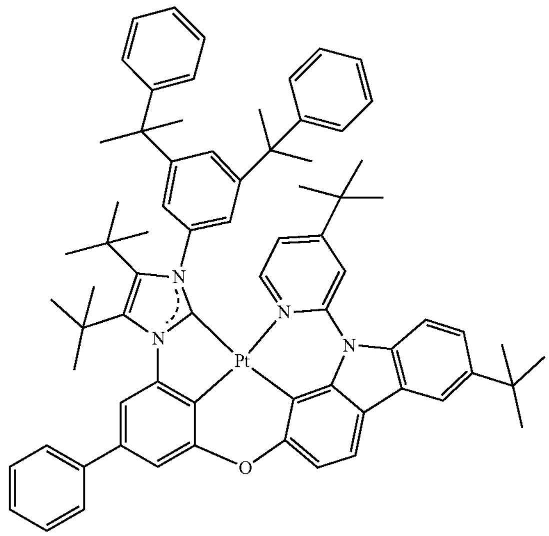
36
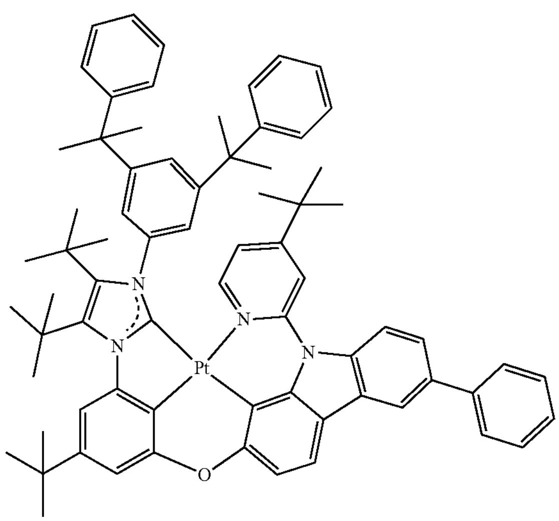
37
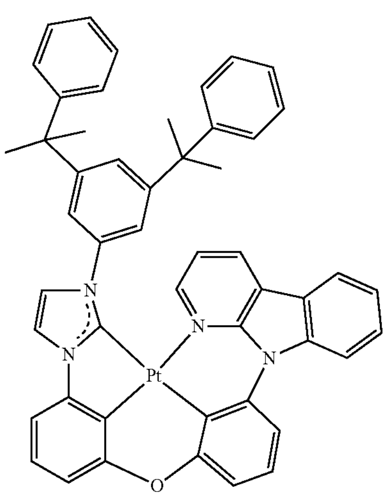
38
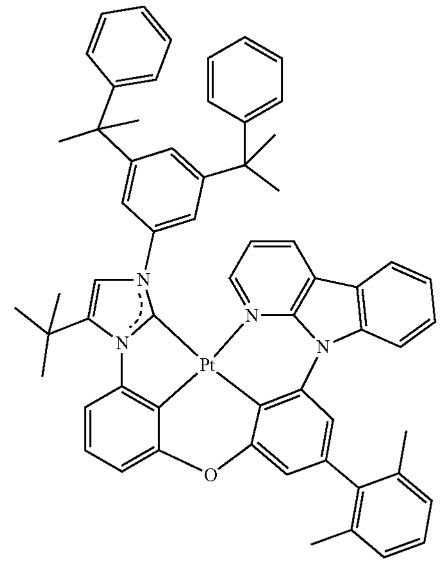
39
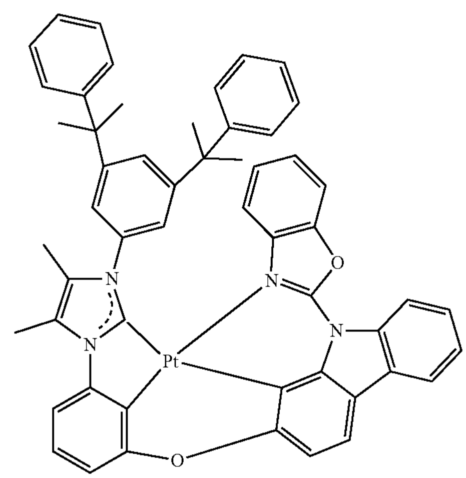
40
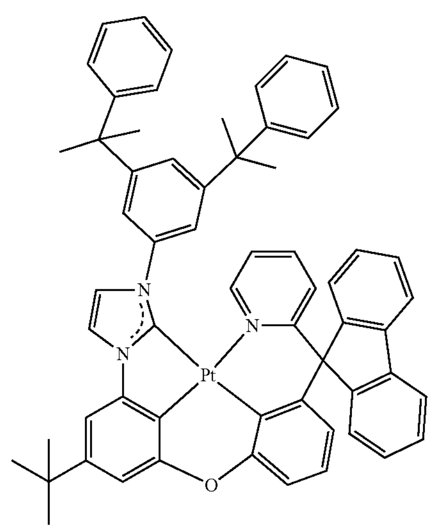

41
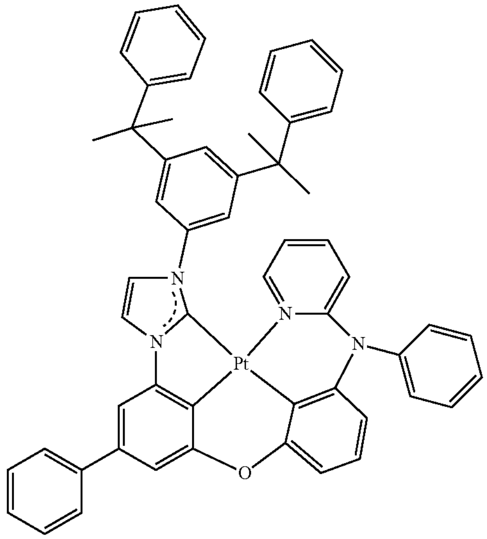
42
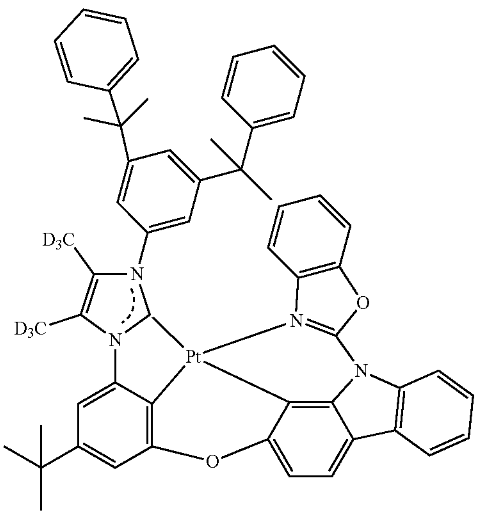
43
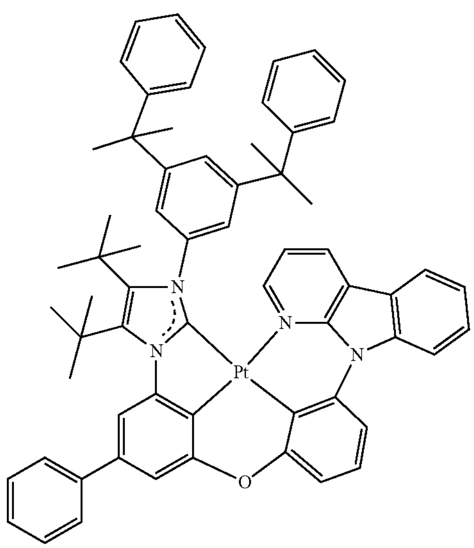
44
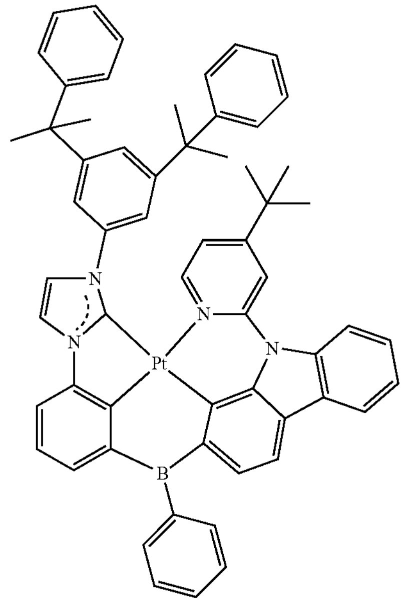
45
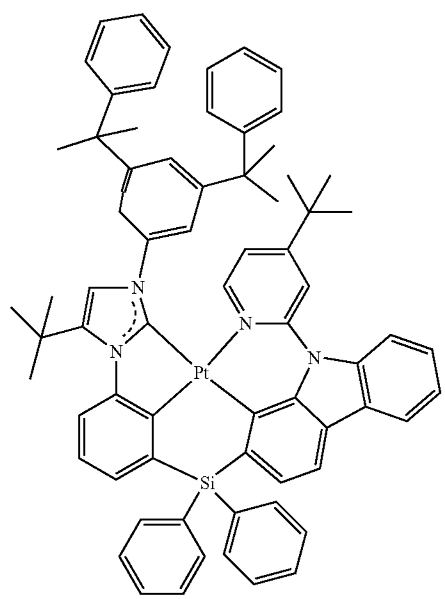

-continued
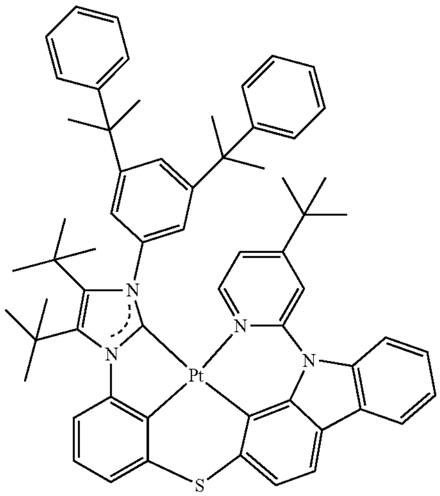
46
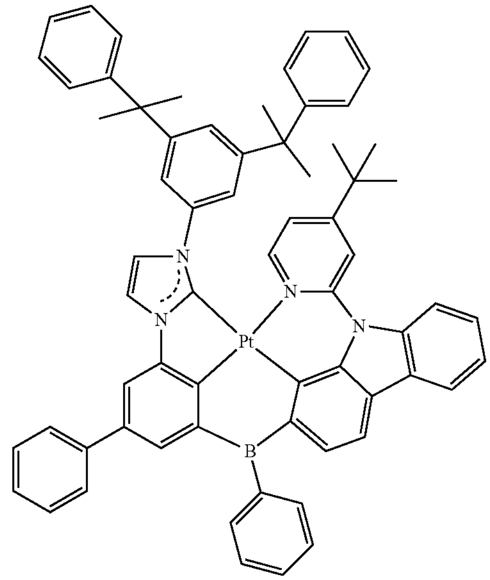
48
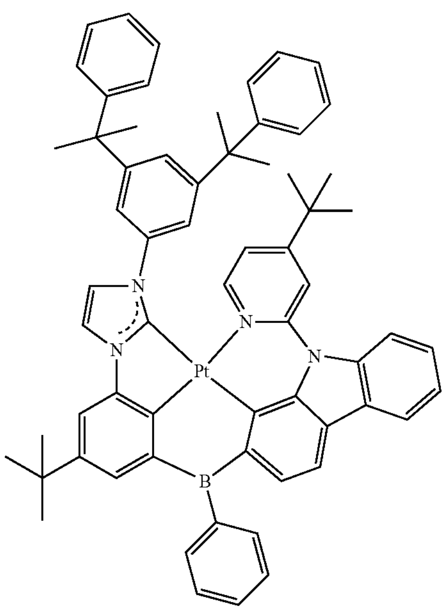
47
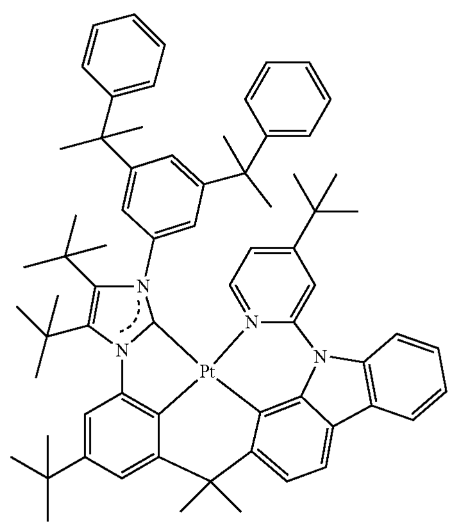
49

-continued
50
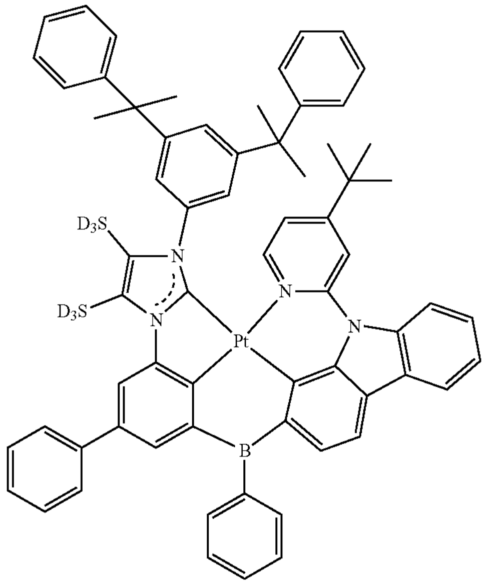
52
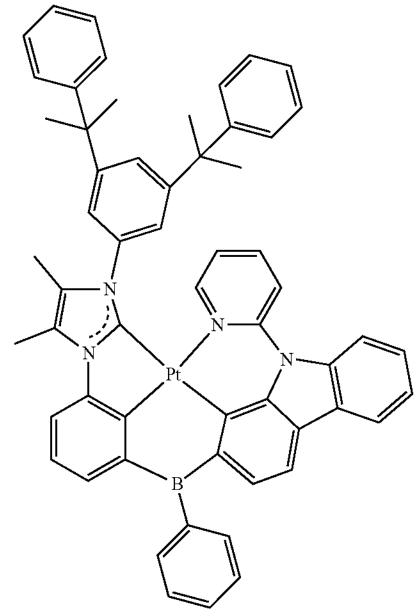
51
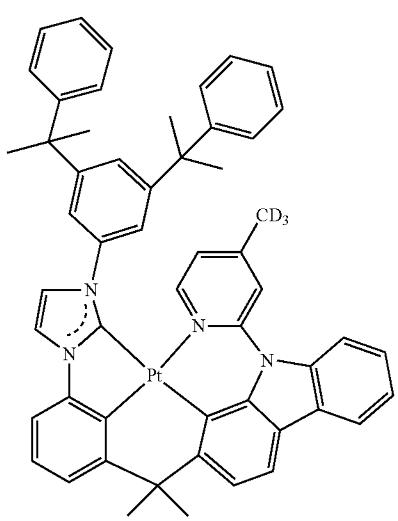
53
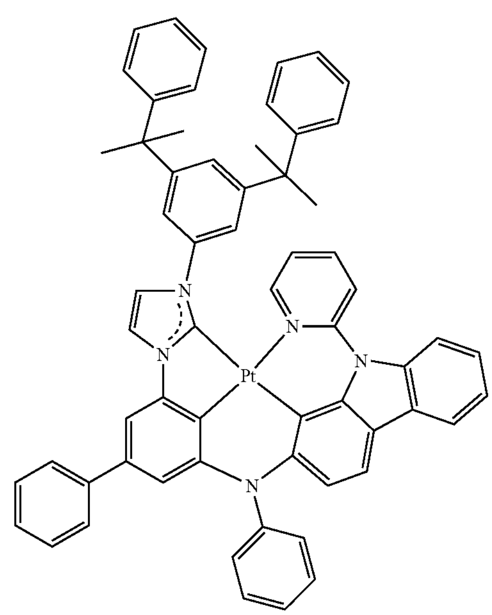

-continued
54
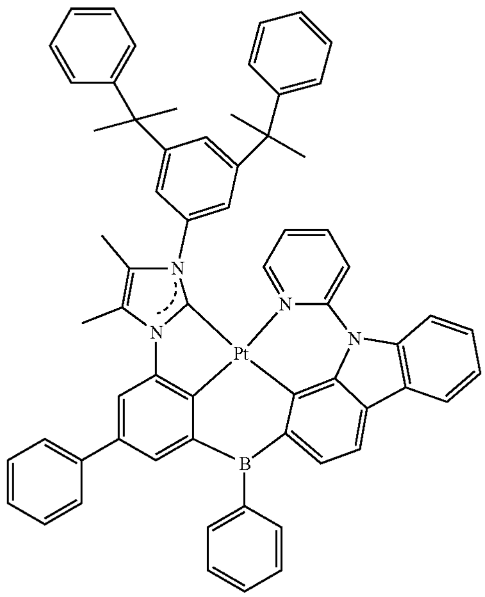
55
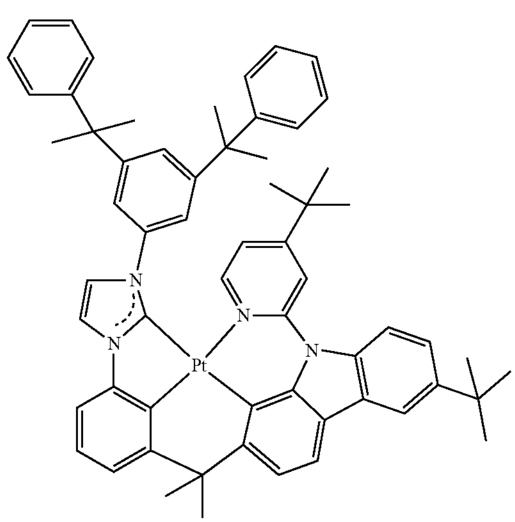
-continued
56
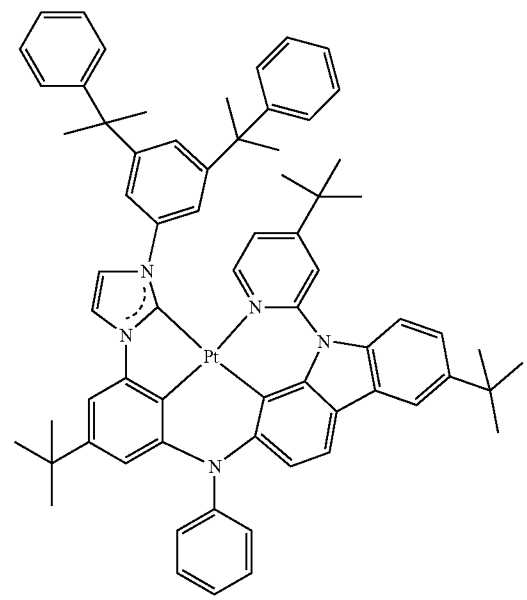
57
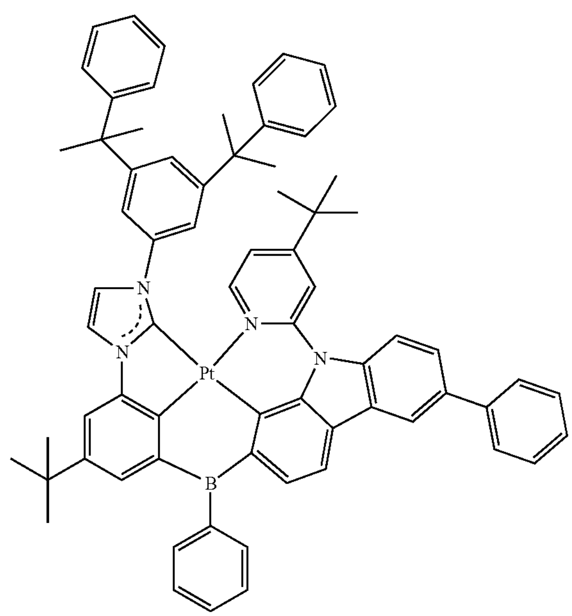

58
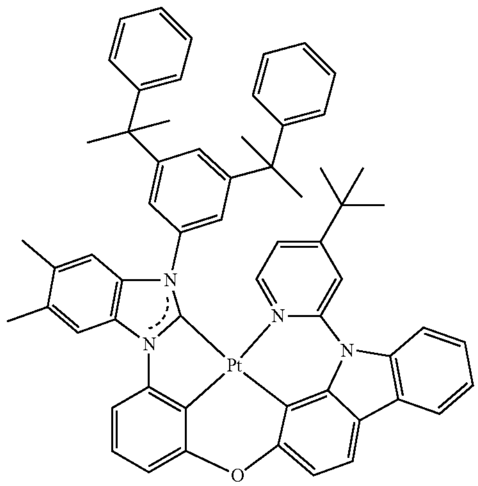
59
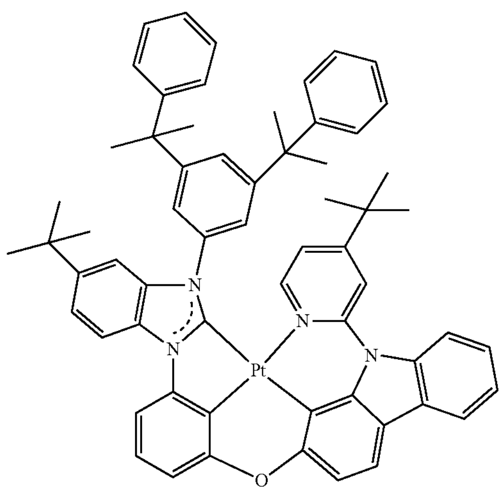
60
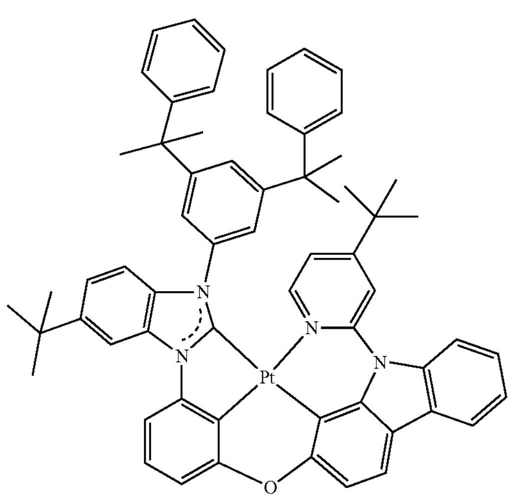
61
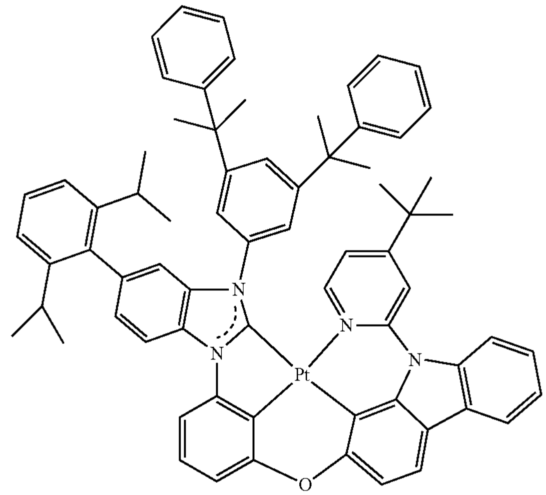
62
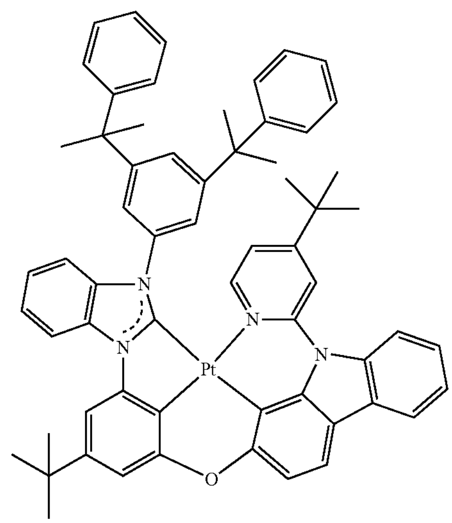
63
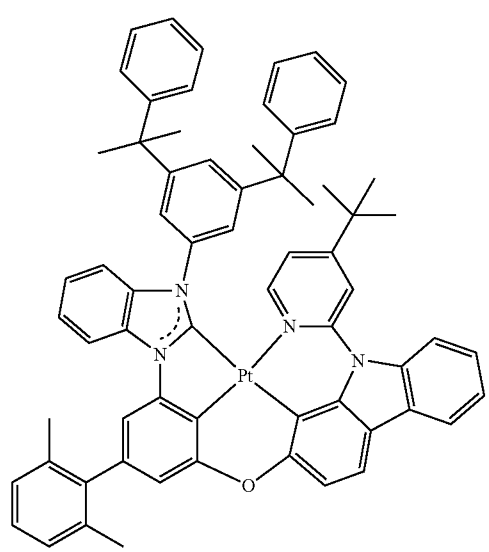

-continued
64
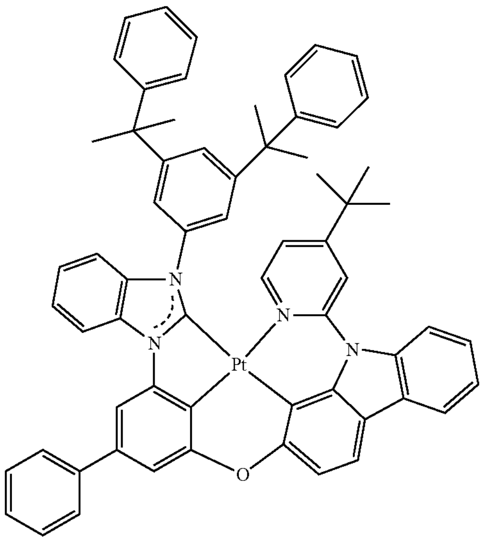
65
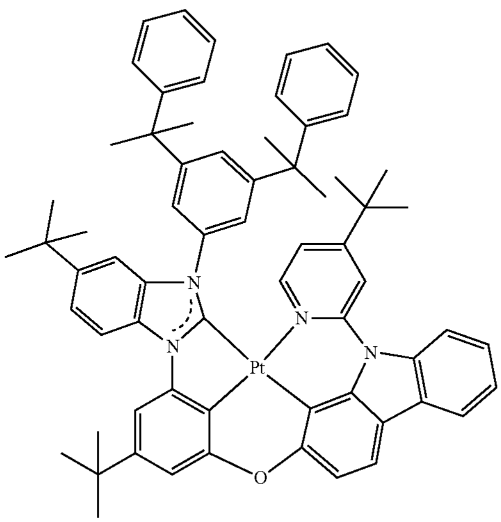
66
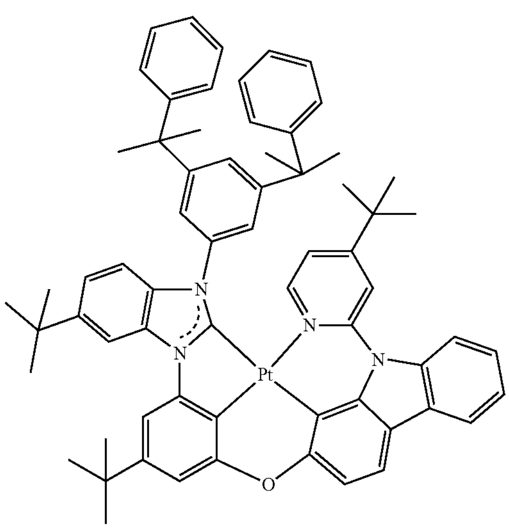
-continued
67
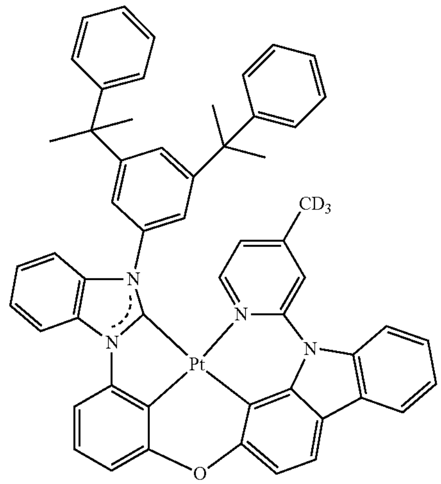
68
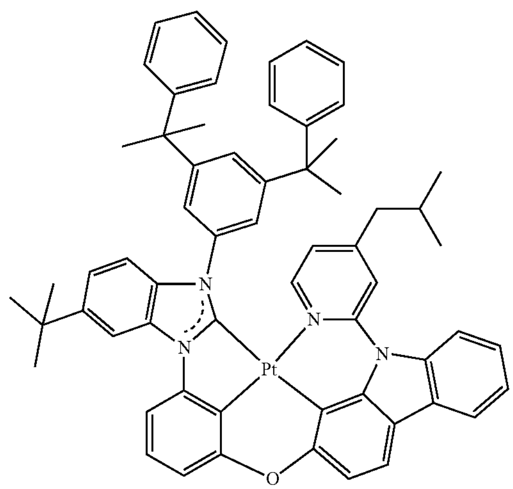
69
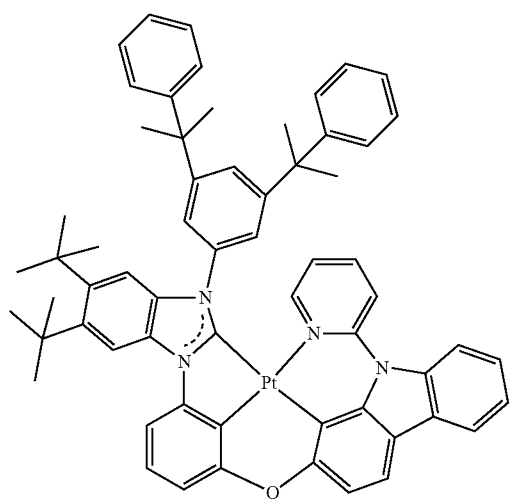

-continued
70
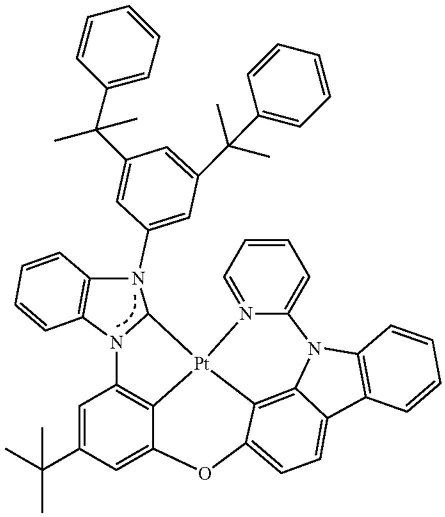
71
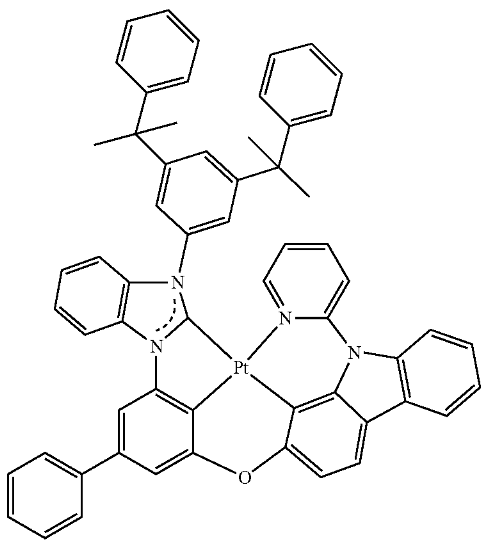
72
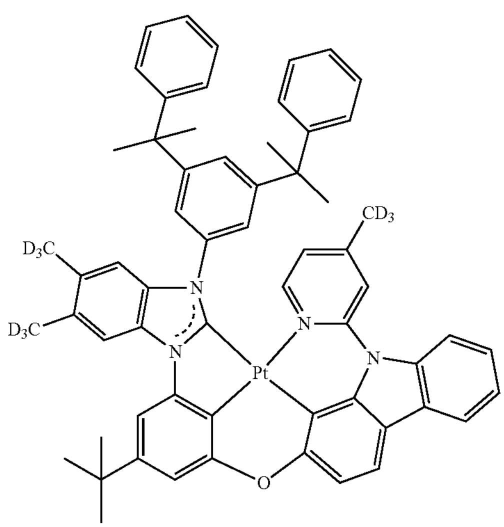
-continued
73
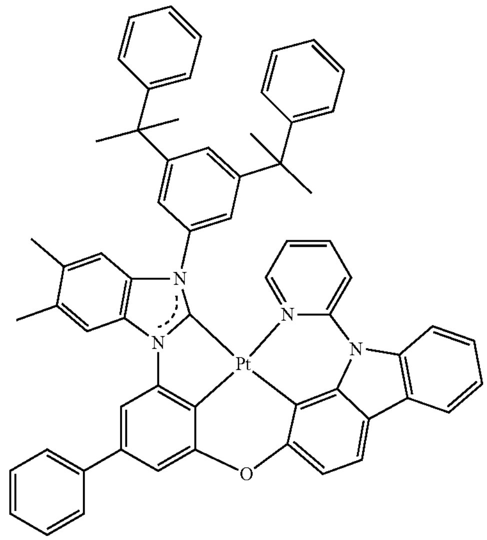
74
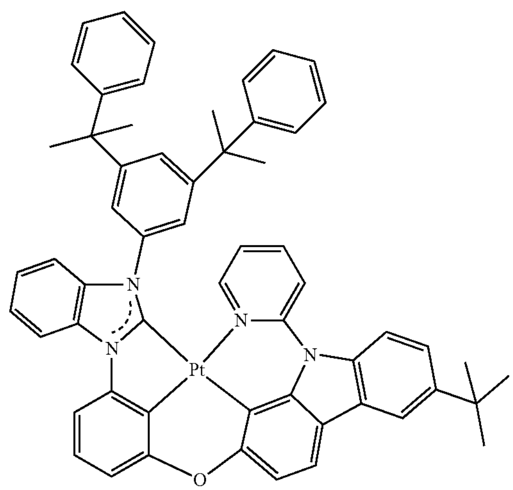
75
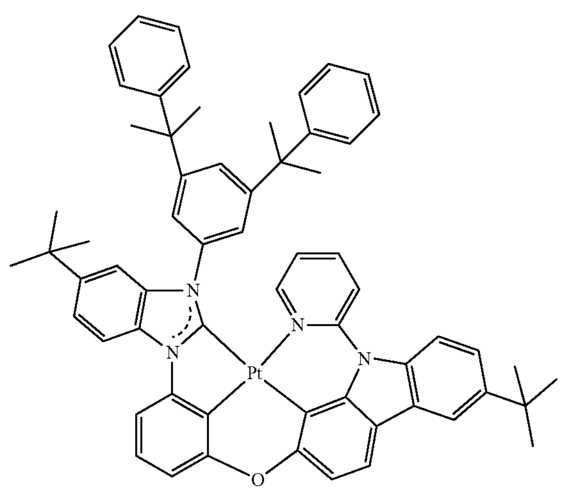

-continued
76
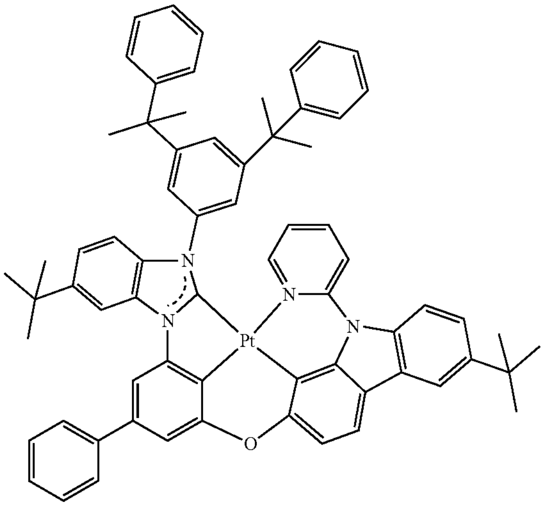
77
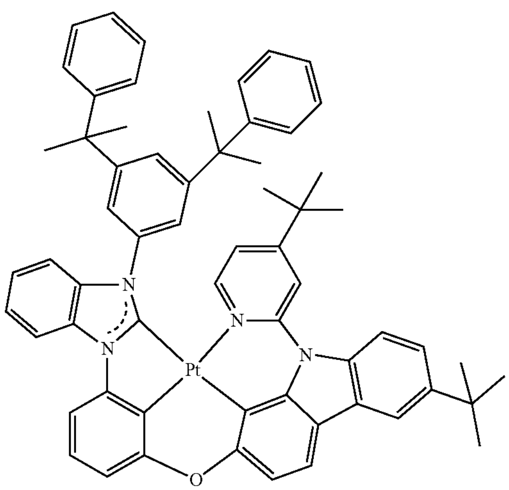
78
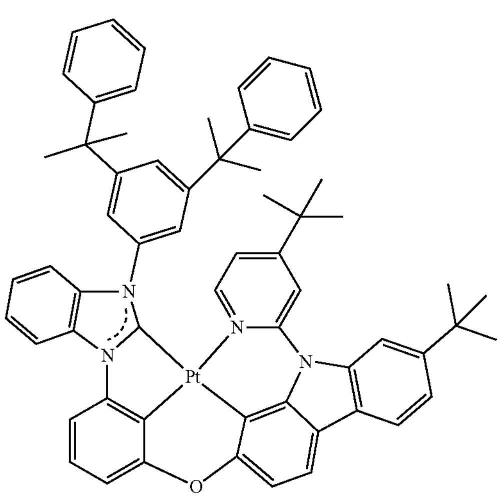
-continued
79
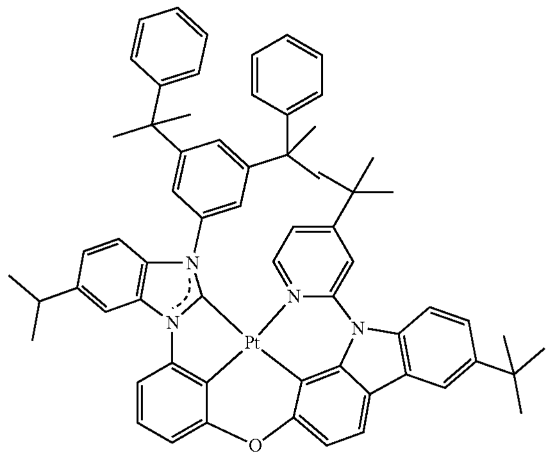
80
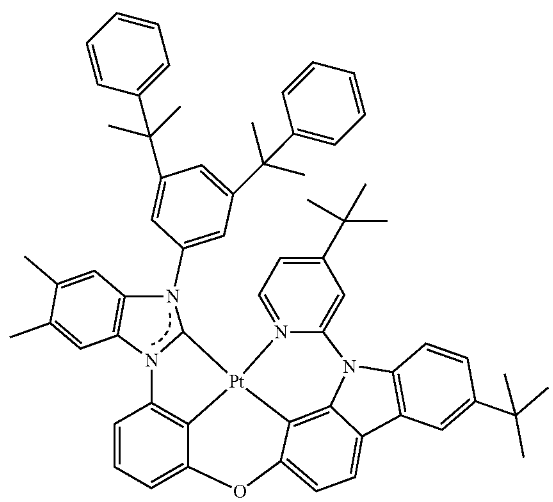
81
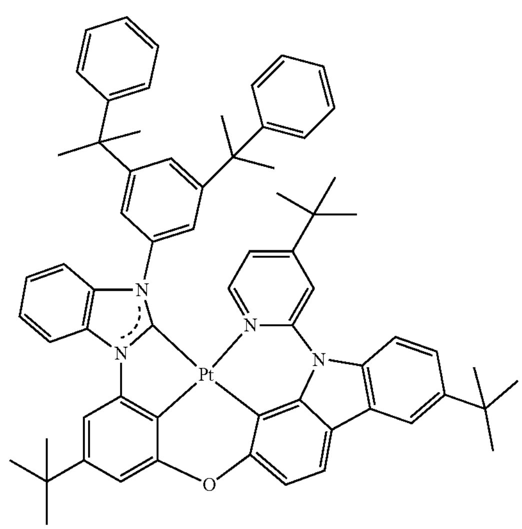

-continued
82
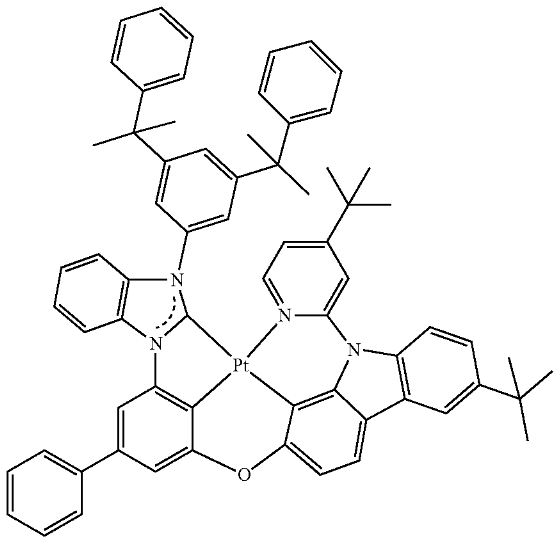
83
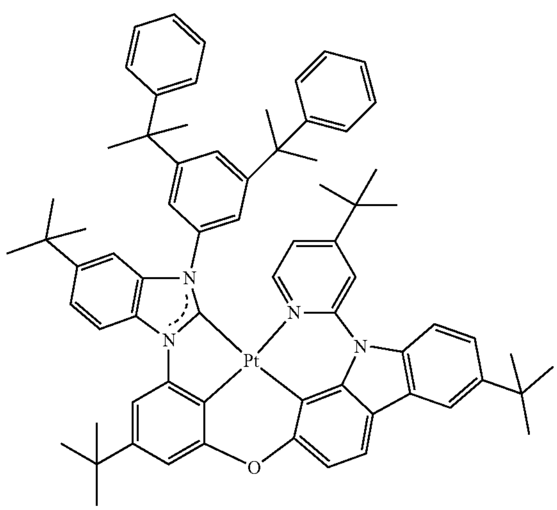
84
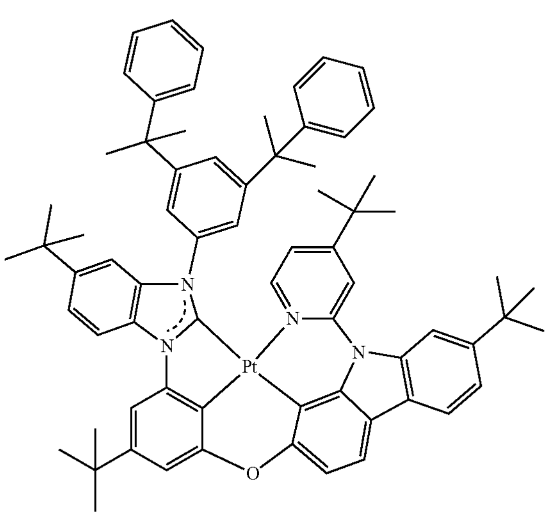
-continued
85
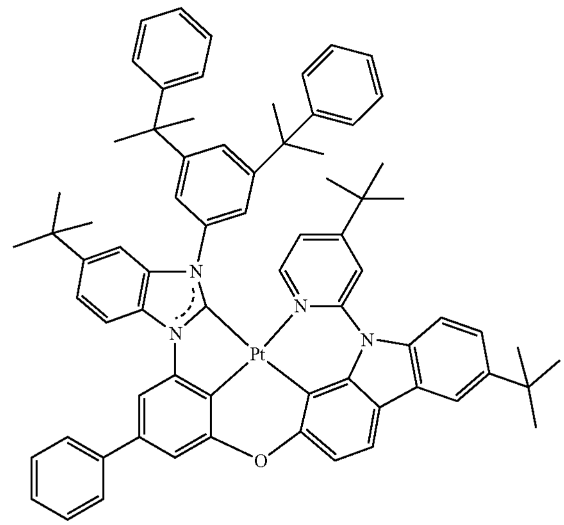
86
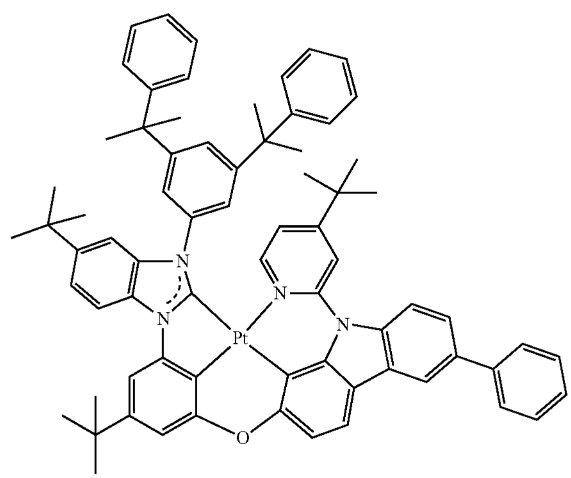
87
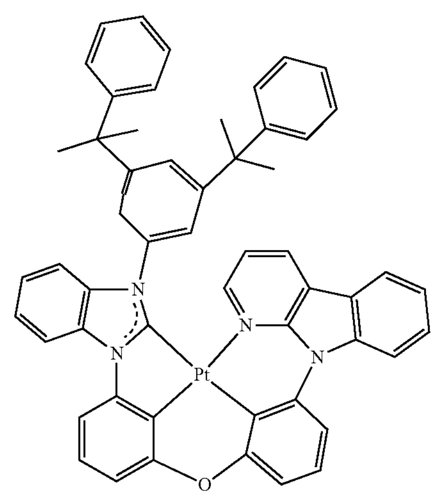

-continued
88
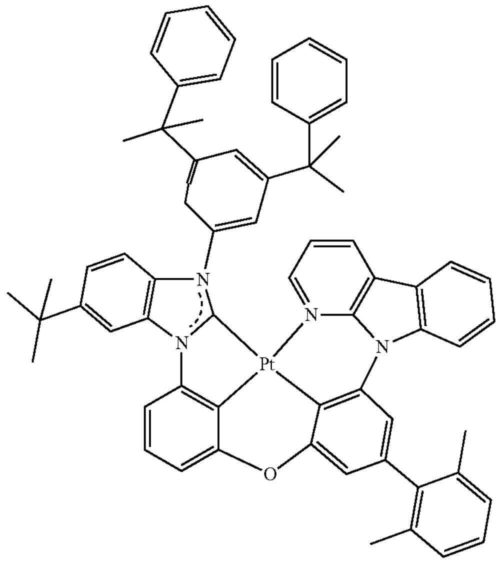
89
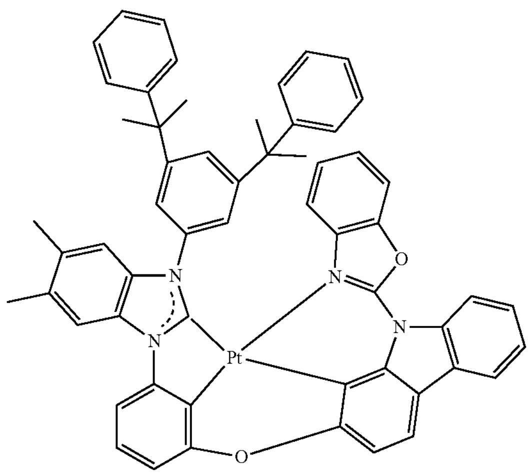
90
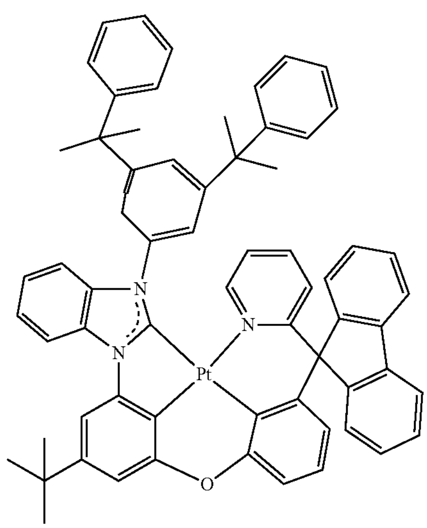
-continued
91
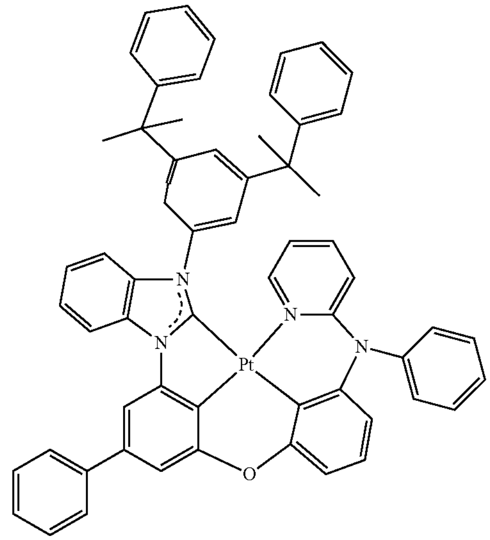
92
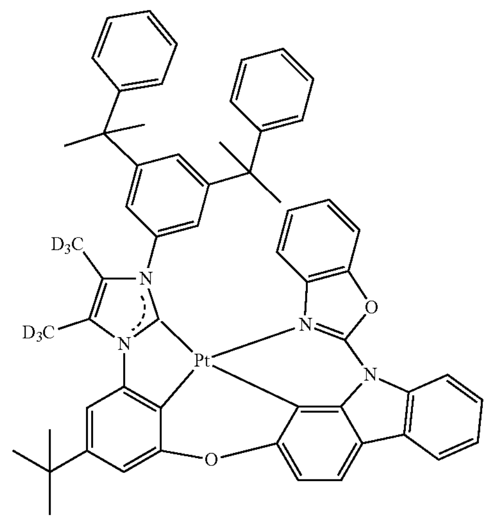
93
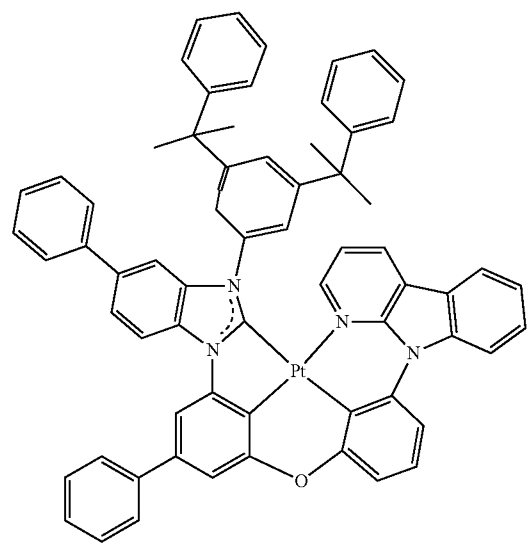

-continued
94
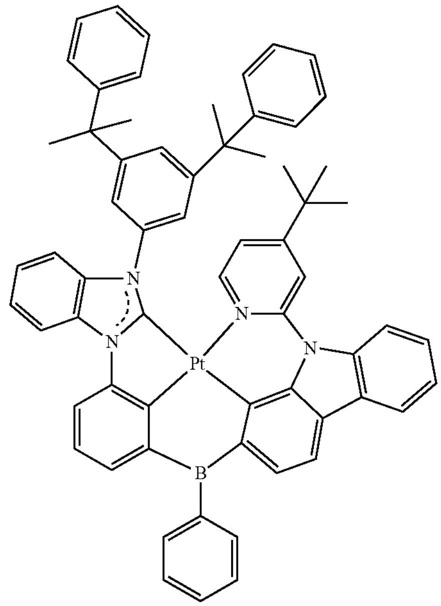
96
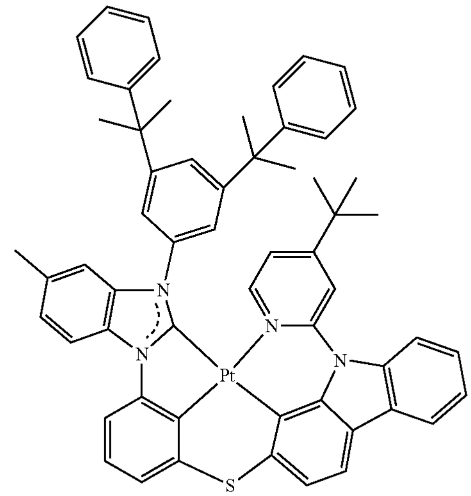
95
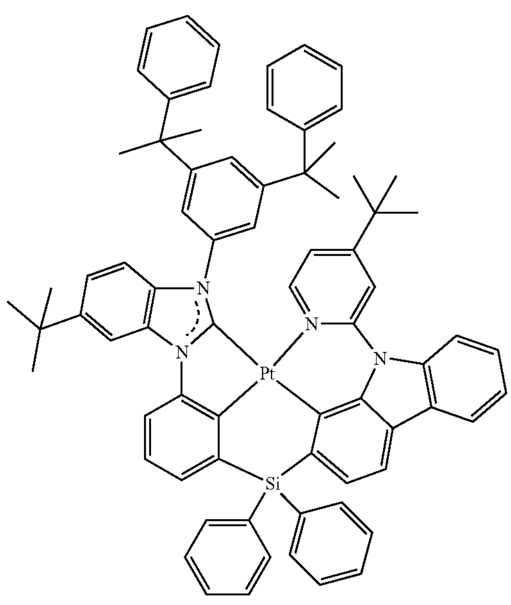
97
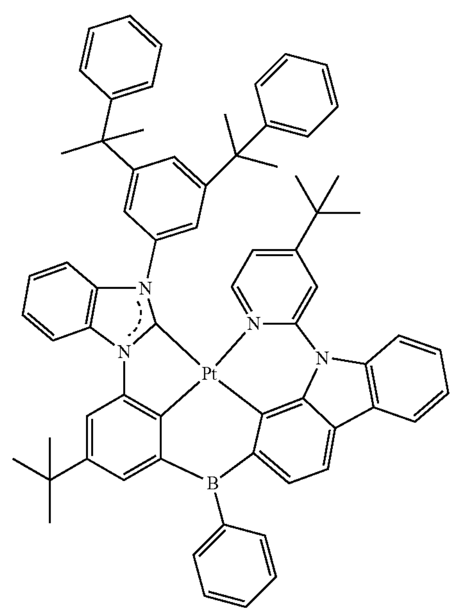

-continued
98
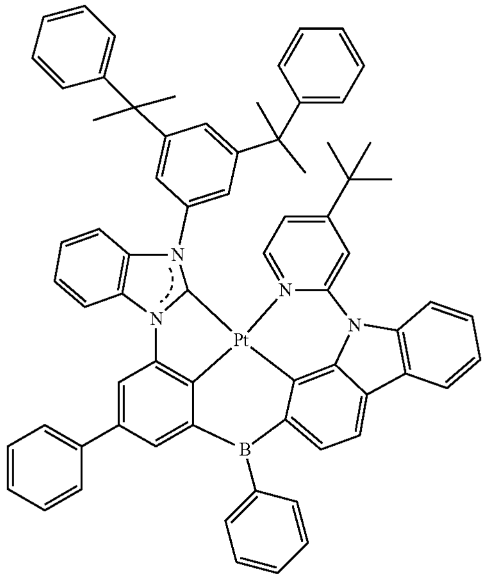
100
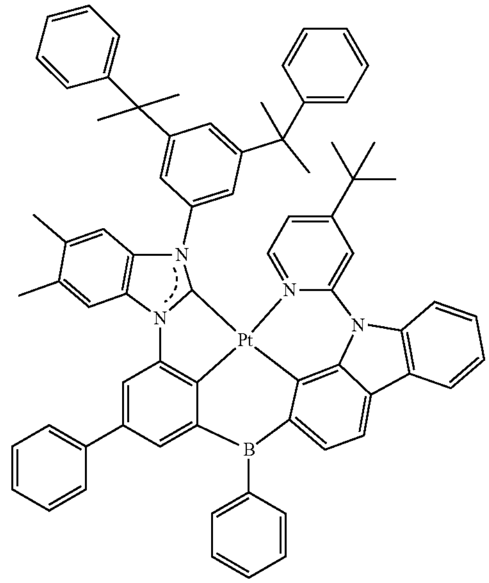
99
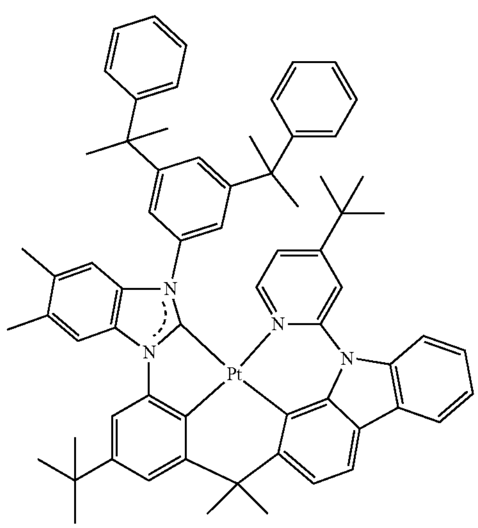
101
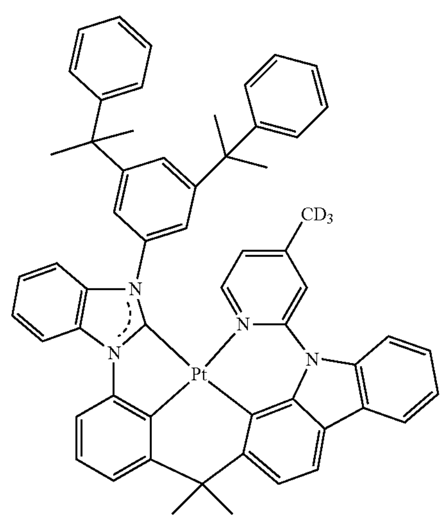

-continued
102
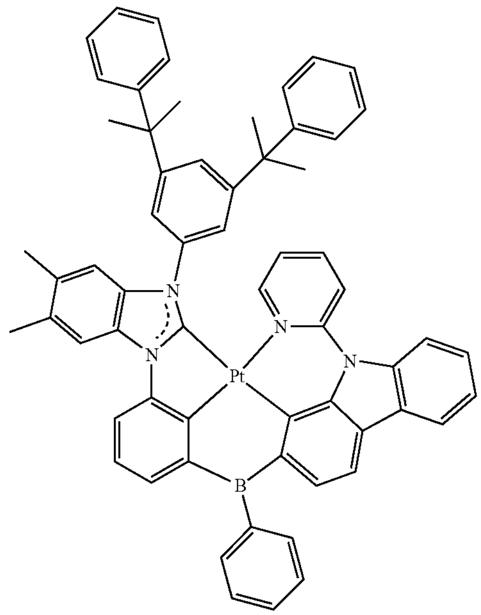
103
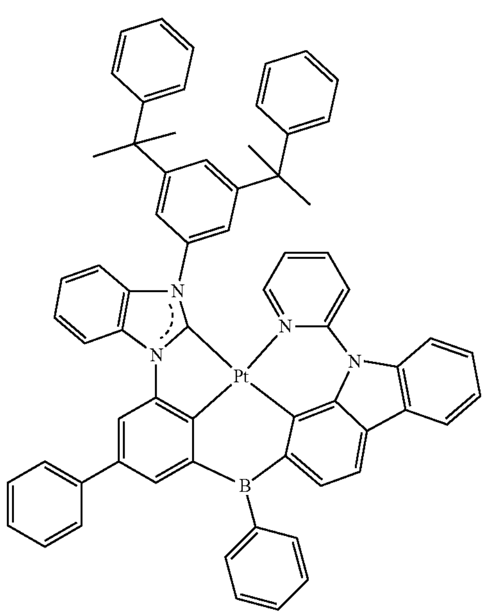
104
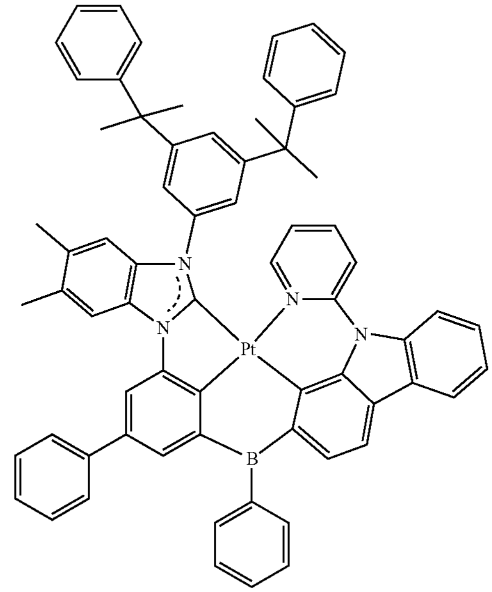
105
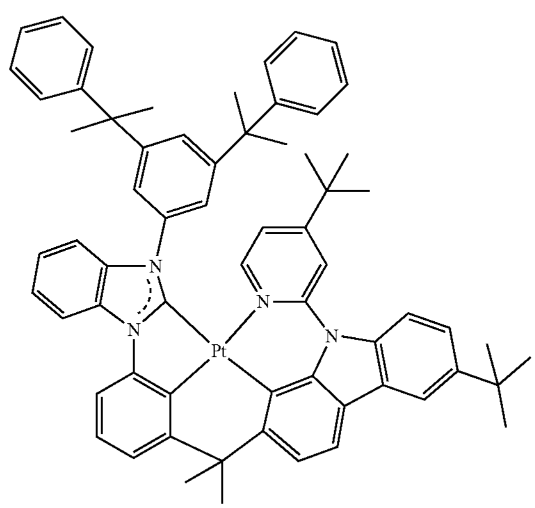

-continued
106
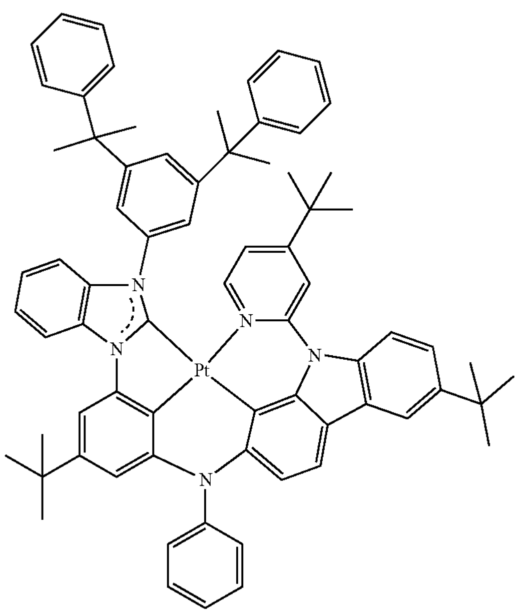
107
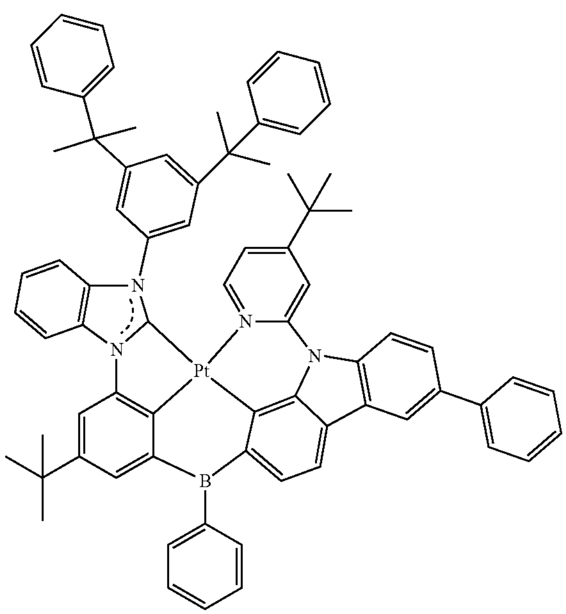
-continued
108
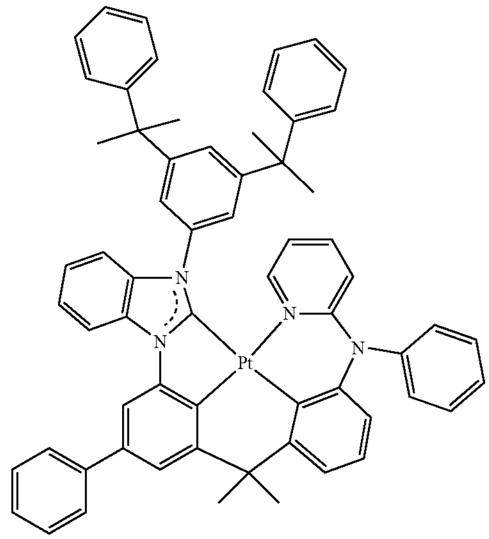
Group VIII
1
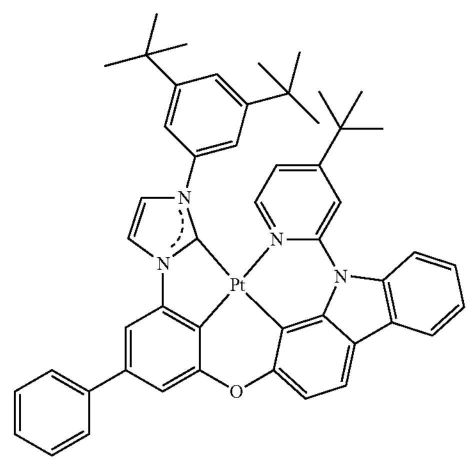
2
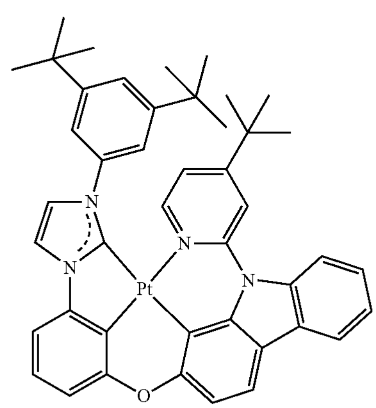

-continued
3
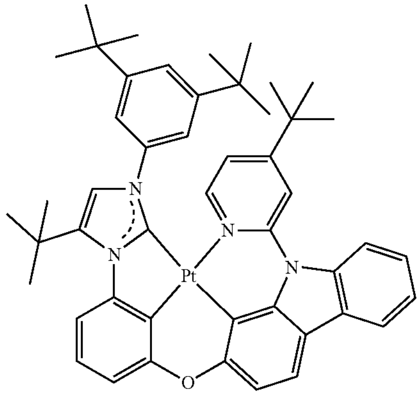
4
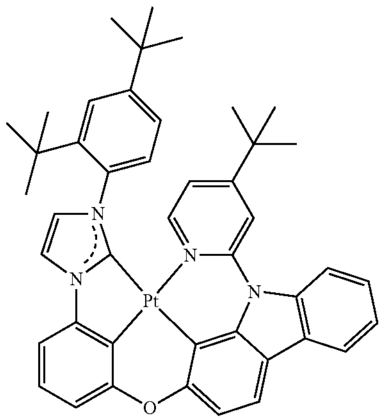
5
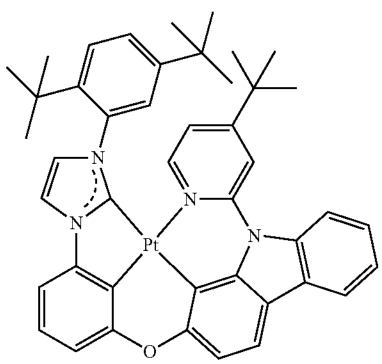
6
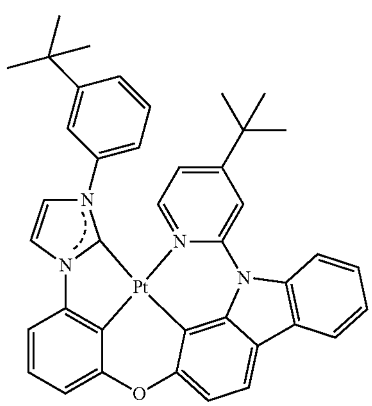
-continued
7
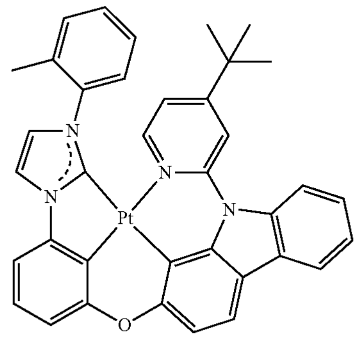
8
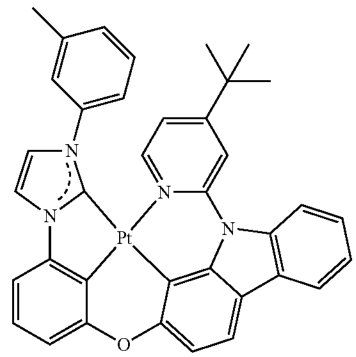
9
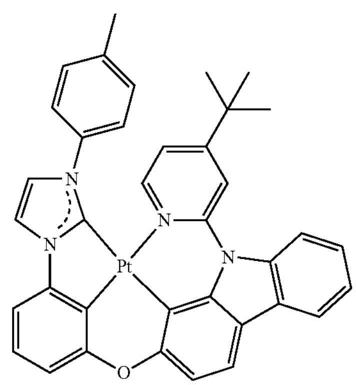
10
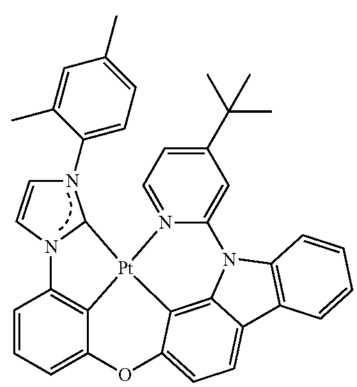

-continued
11
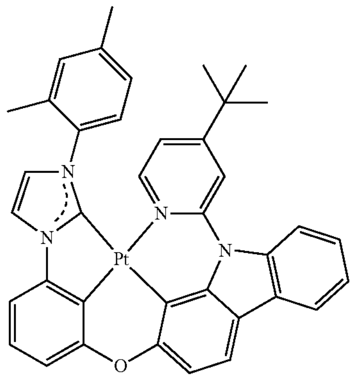
12
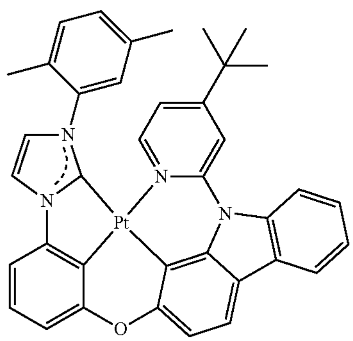
13
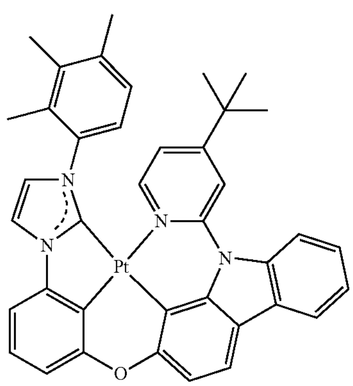
14
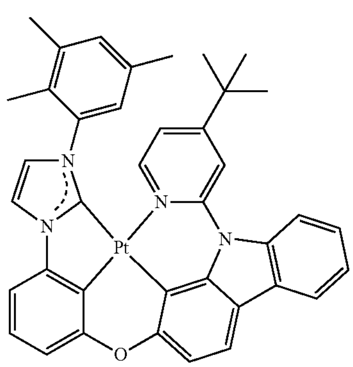
-continued
15
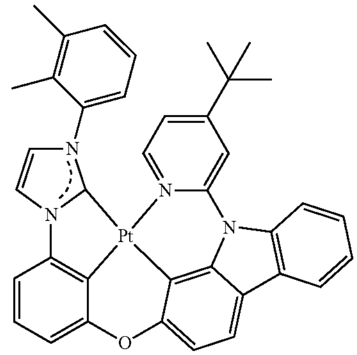
16
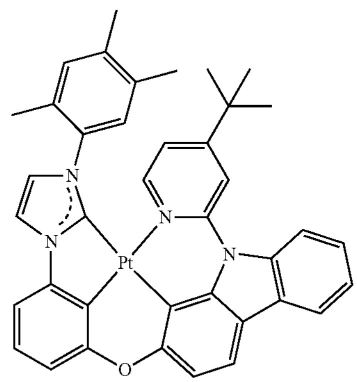
17
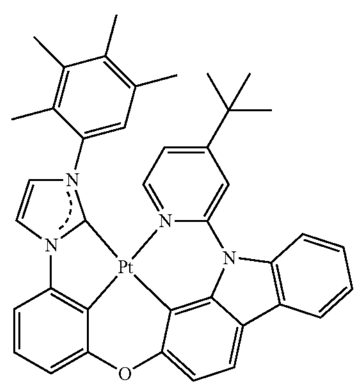
18
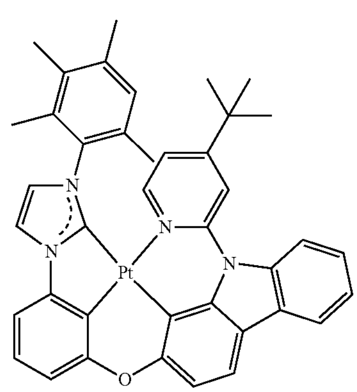

-continued
19
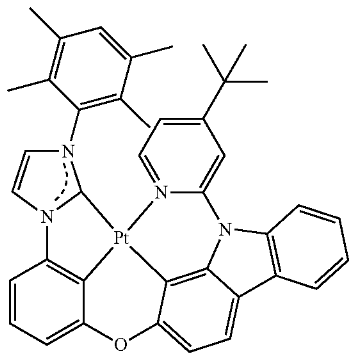
20
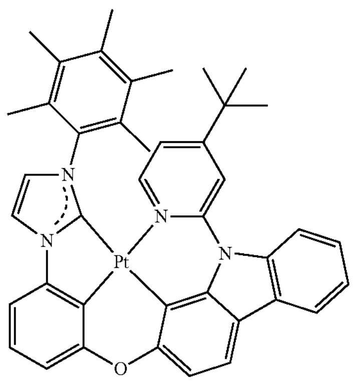
21
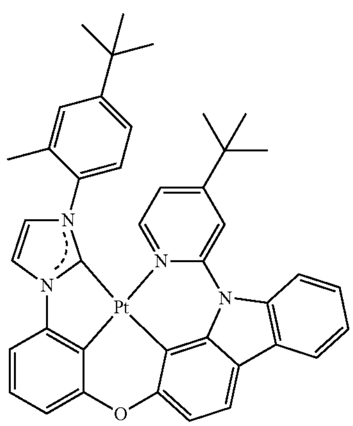
22
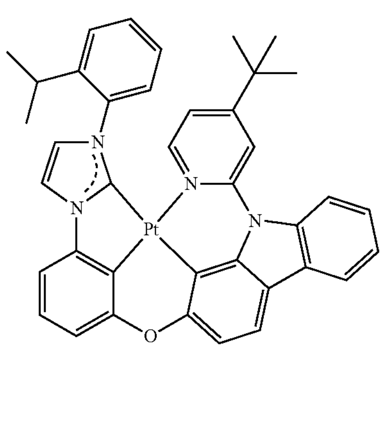
-continued
23
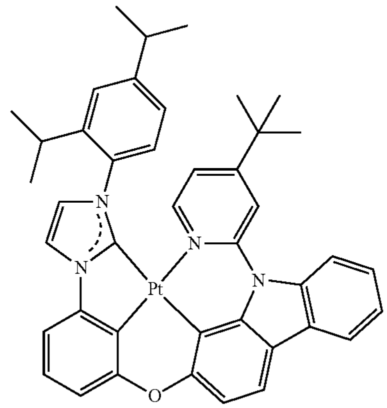
24
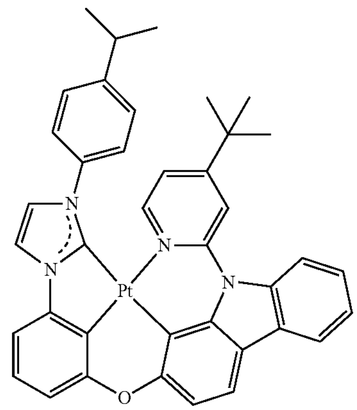
25
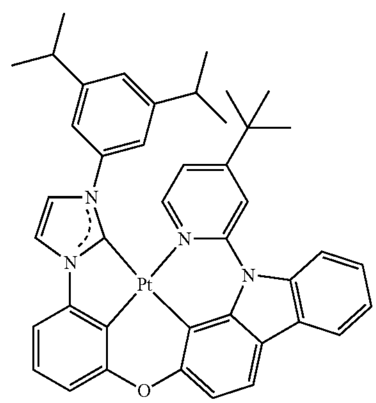
26
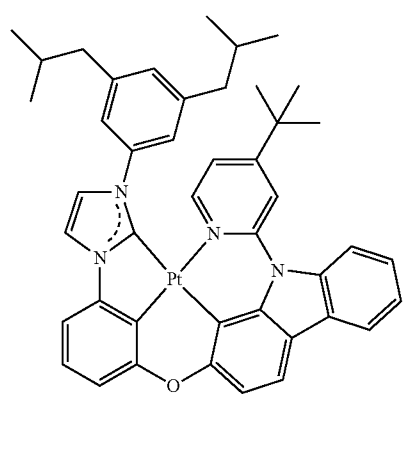

27
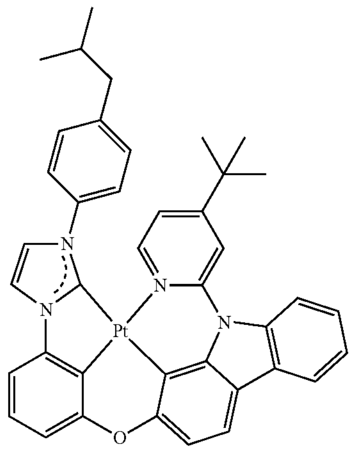
28
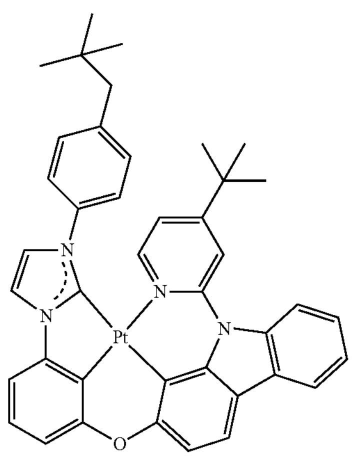
29
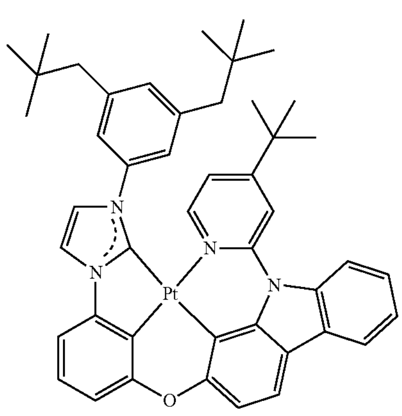
30
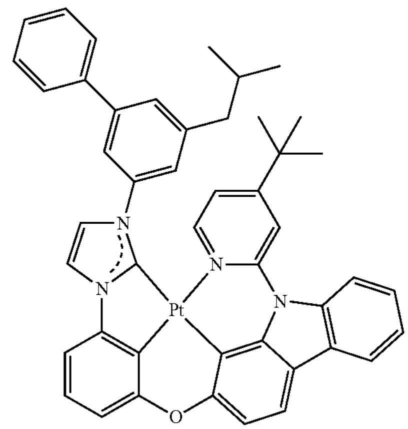
31
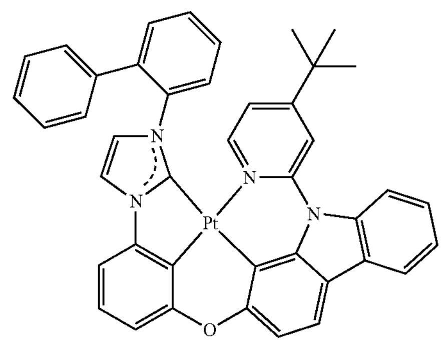
32
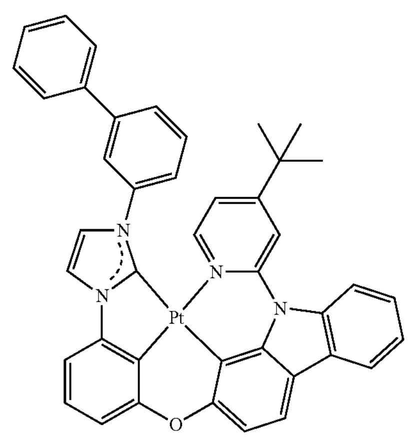
33
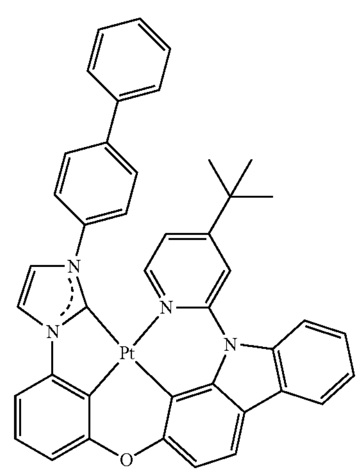

-continued
34
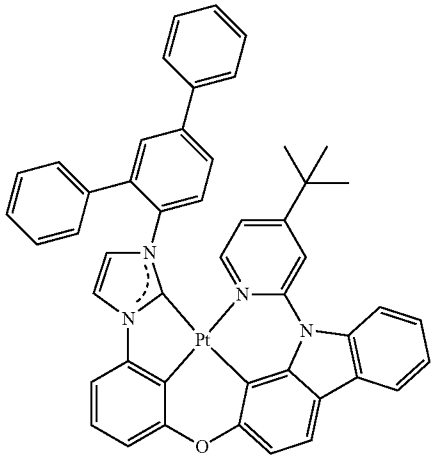
35
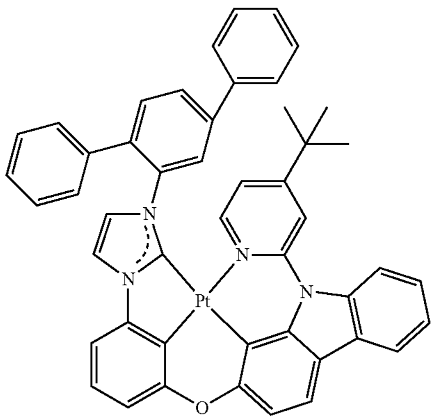
36
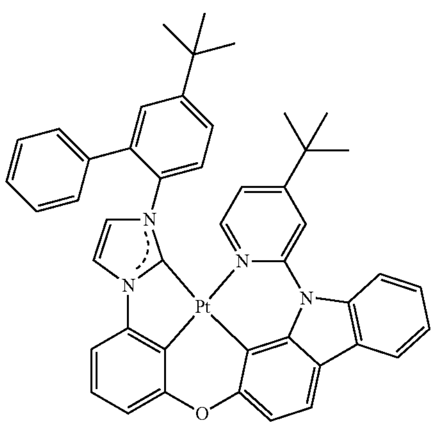
37
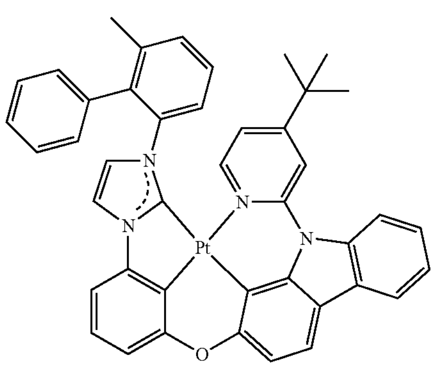
-continued
38
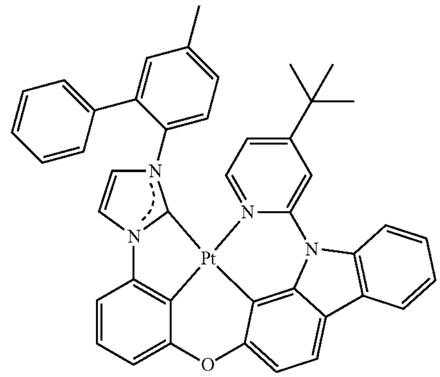
39
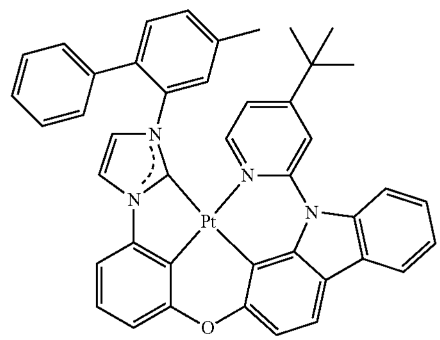
40
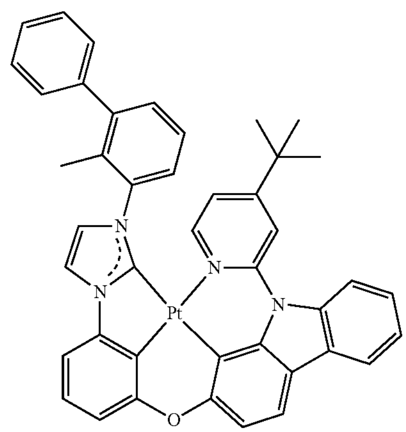
41
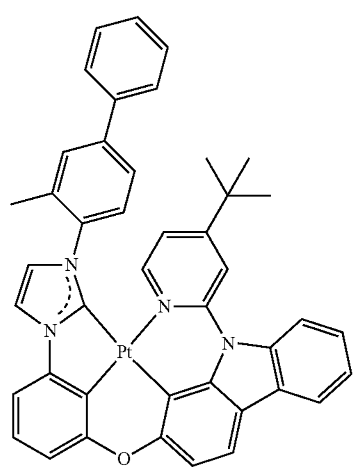

-continued
42
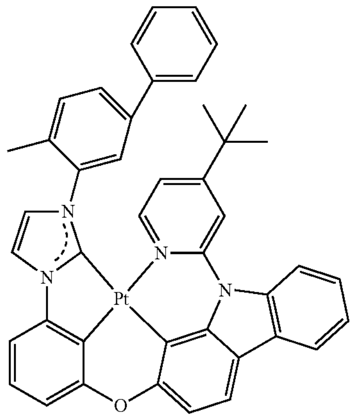
43
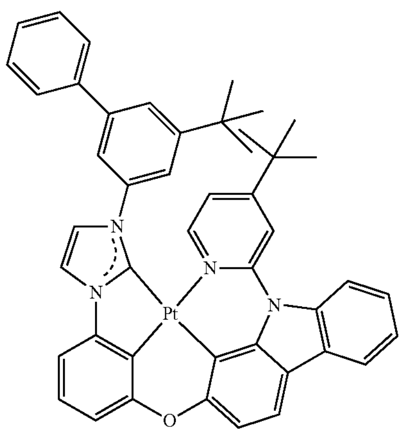
44
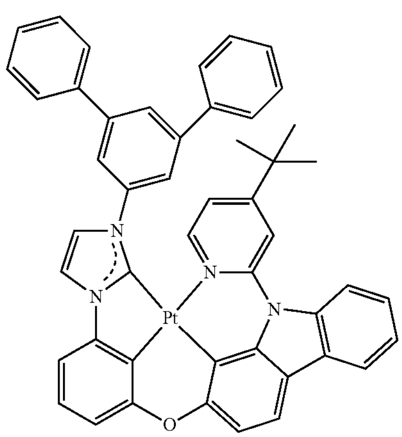
-continued
45
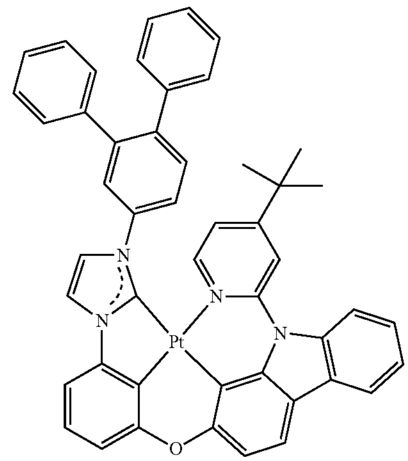
46
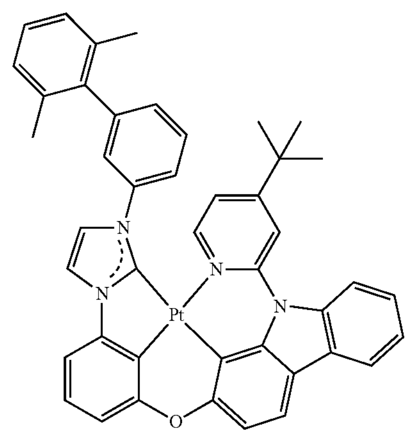
47
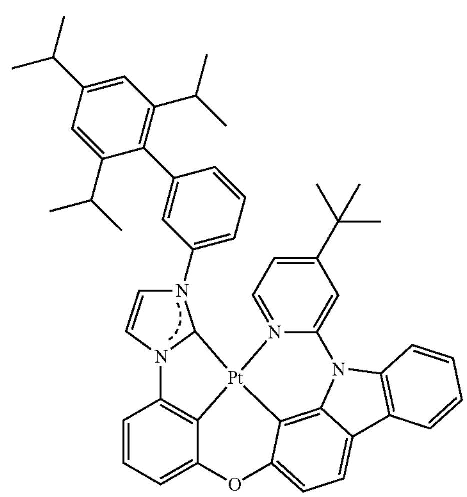

-continued
48
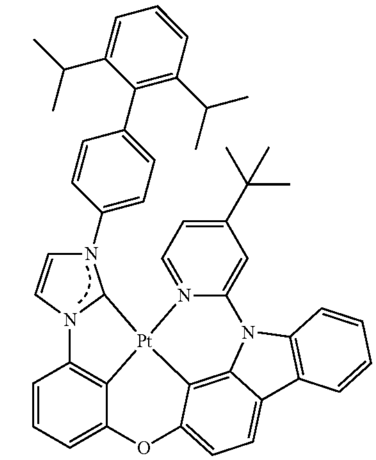
49
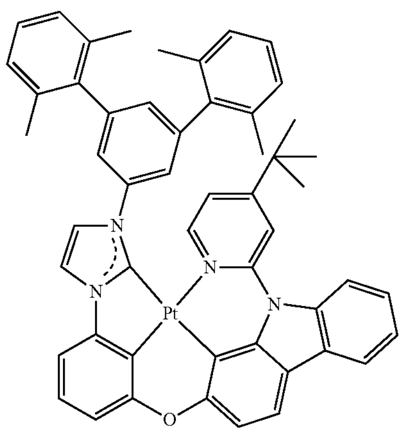
50
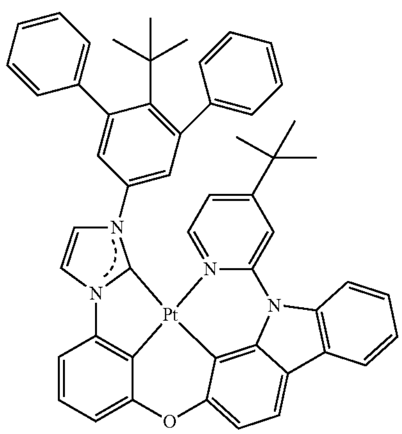
-continued
51
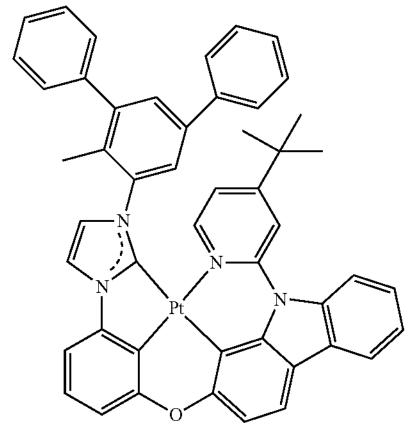
52
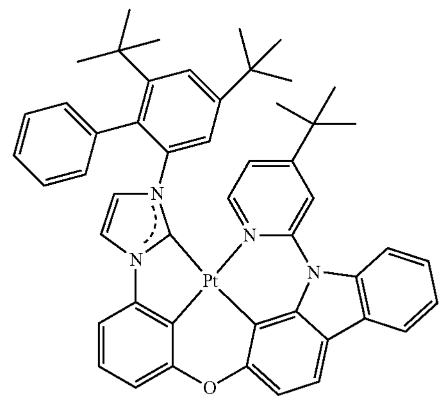
53
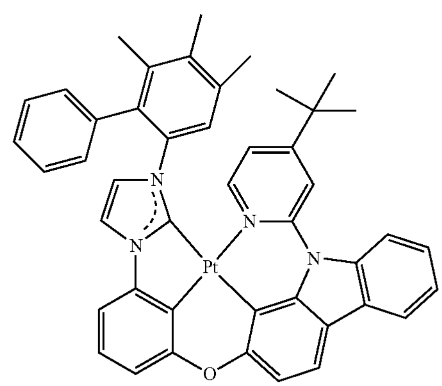
54
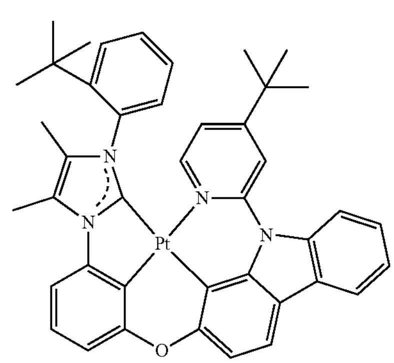

-continued
55
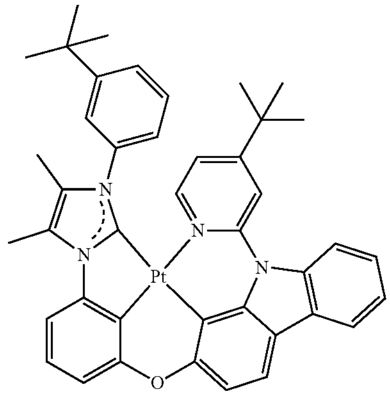
56
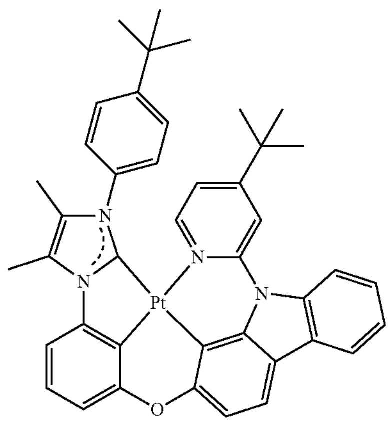
57
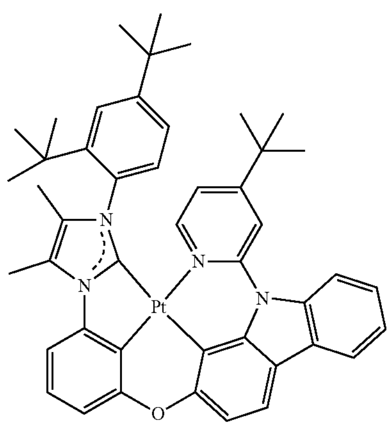
58
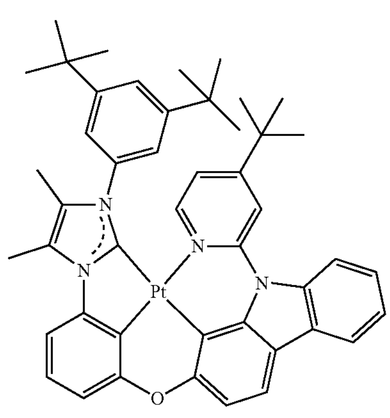
-continued
59
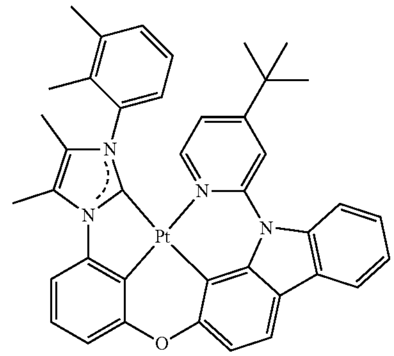
60
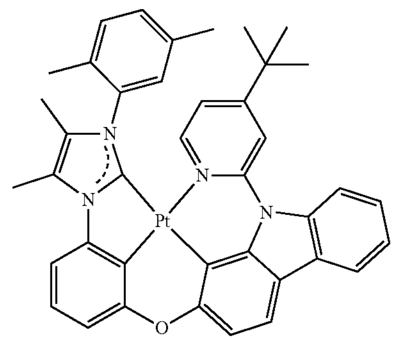
61
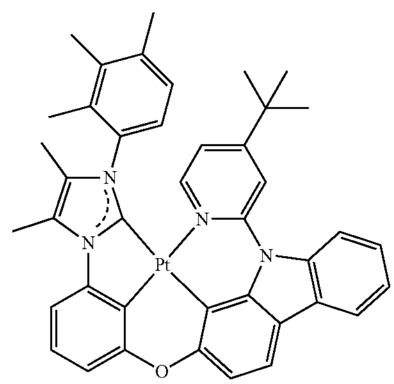
62
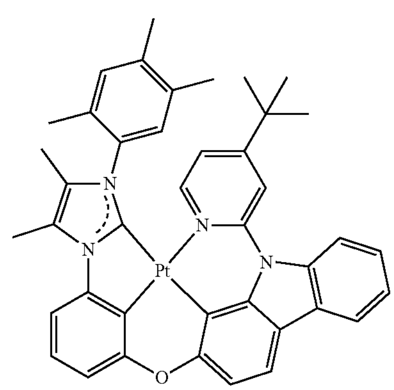

-continued
63
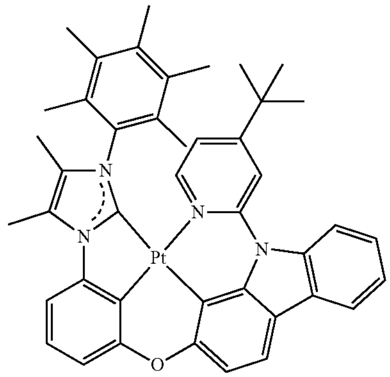
64
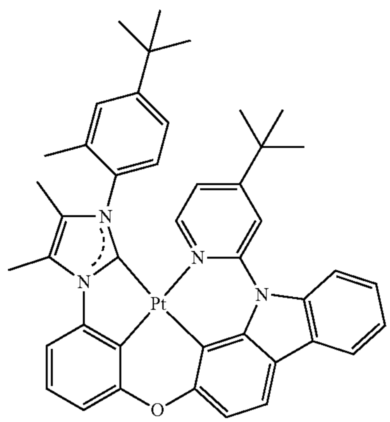
65
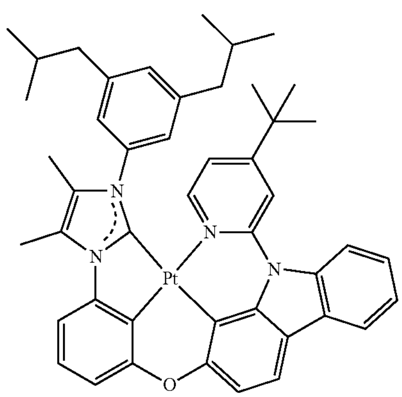
66
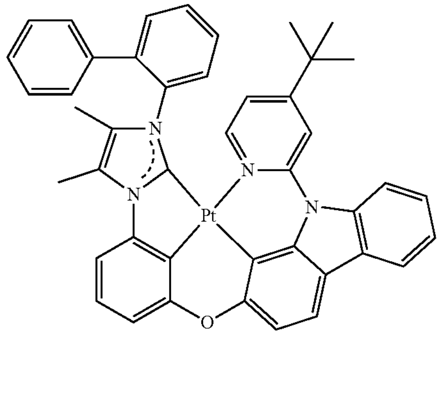
-continued
67
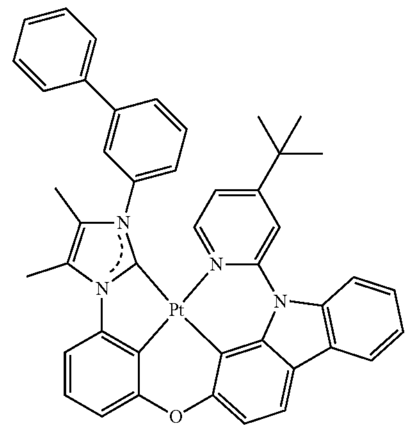
68
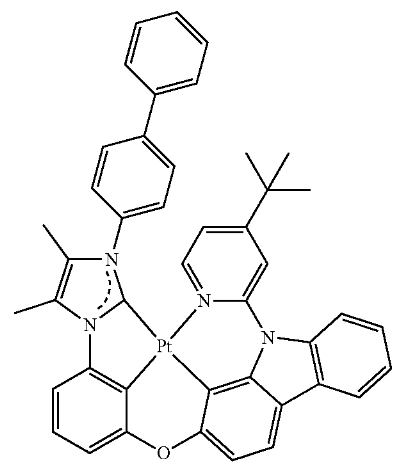
69
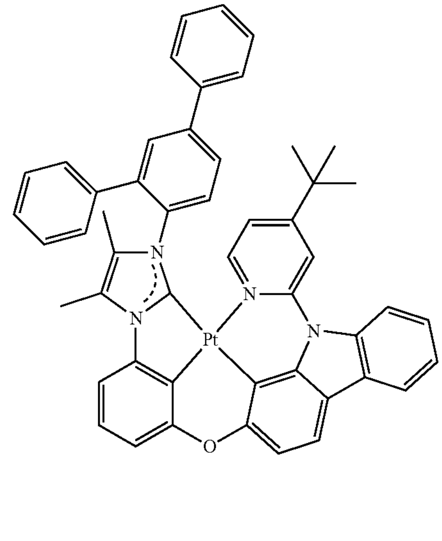

-continued
70
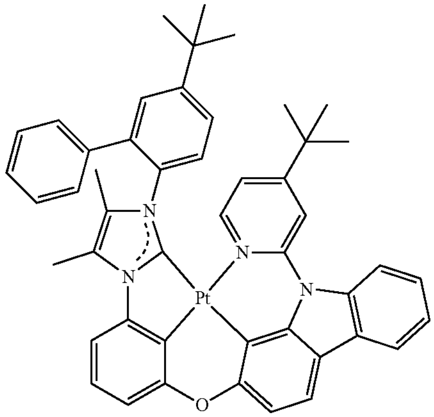
71
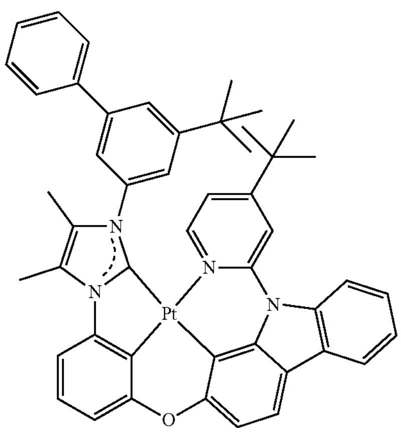
72
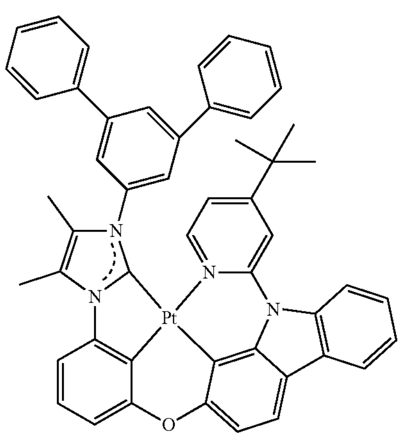
-continued
73
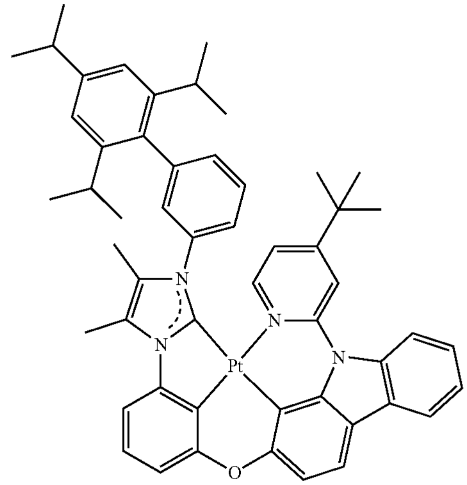
74
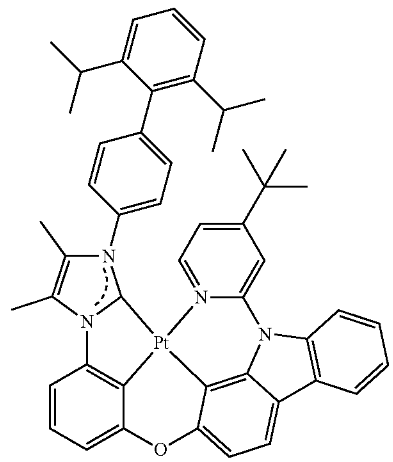
75
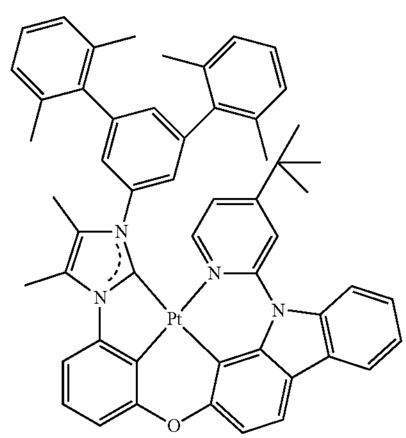

-continued
76
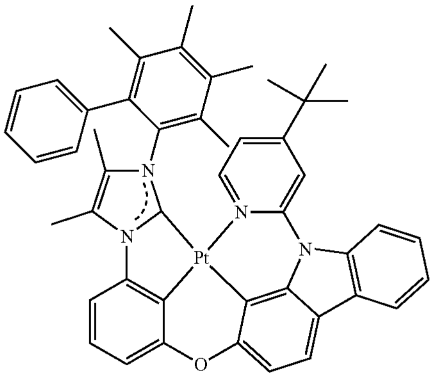
77
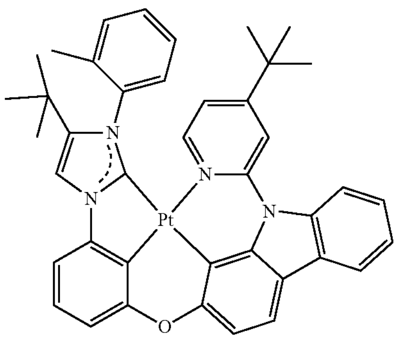
78
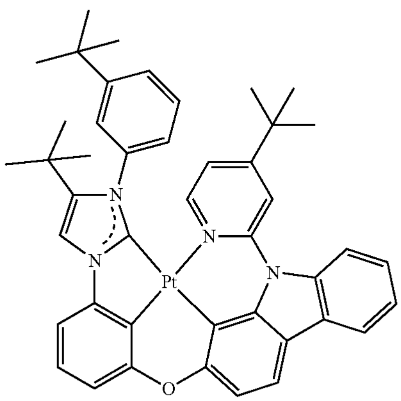
79
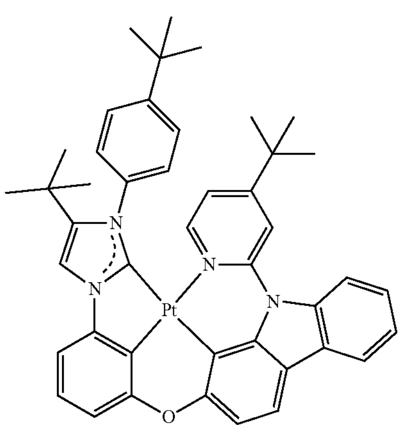
-continued
80
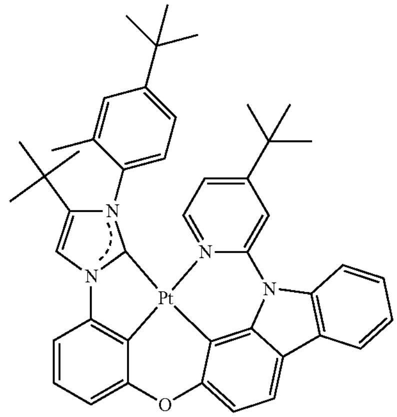
81
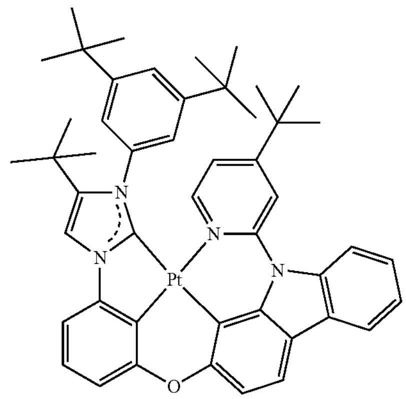
82
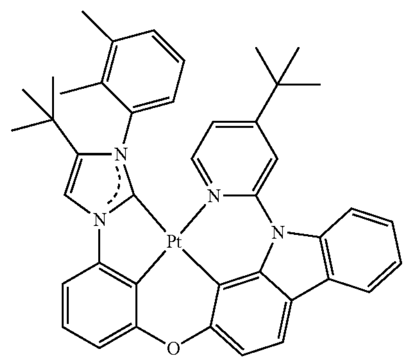
83
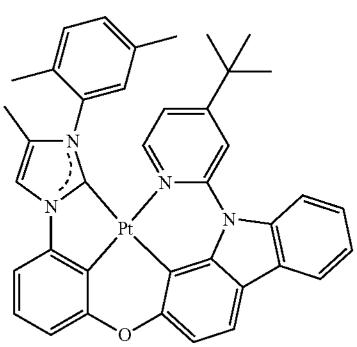

-continued
84
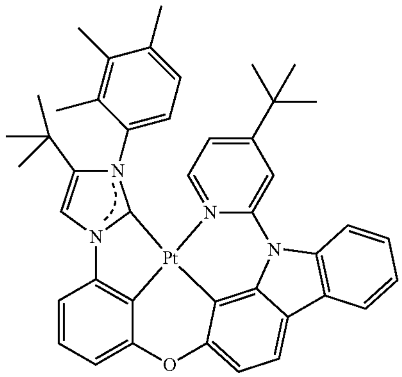
85
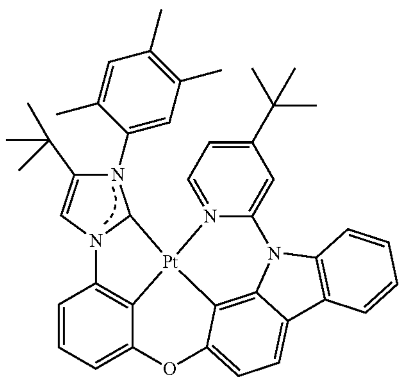
86
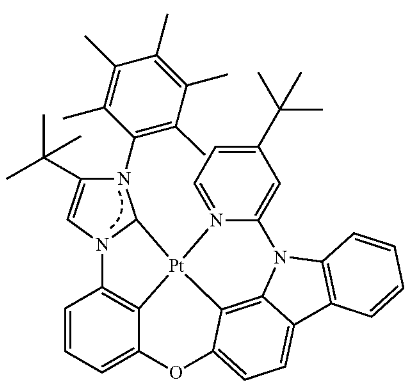
87
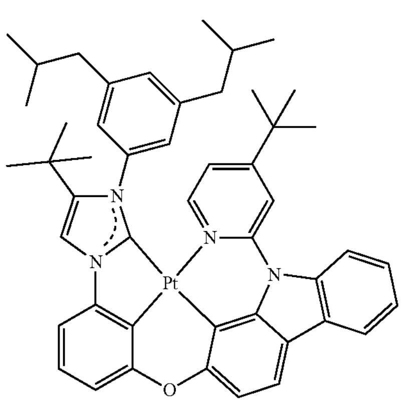
-continued
88
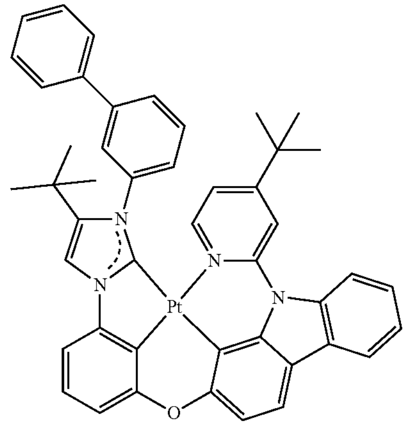
89
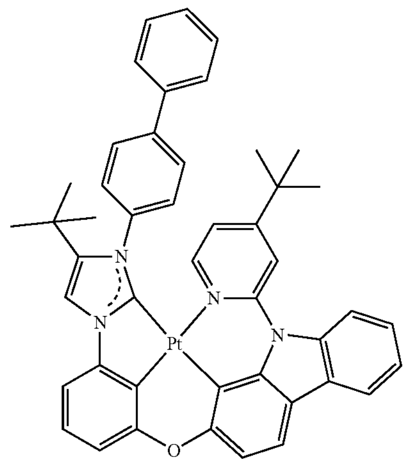
90
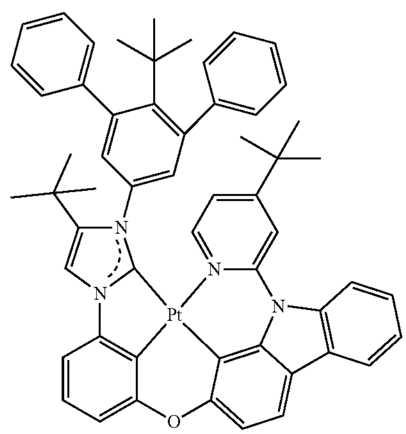
91
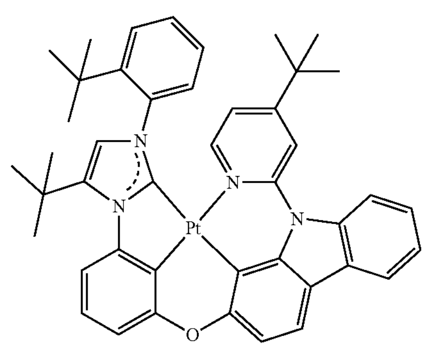

92
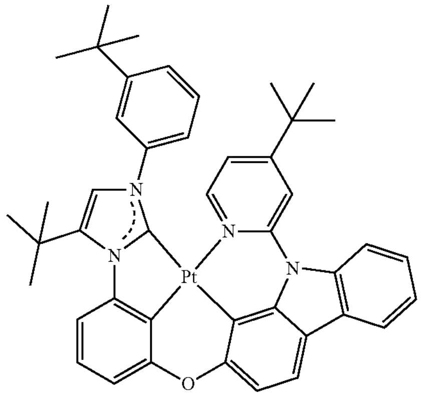
93
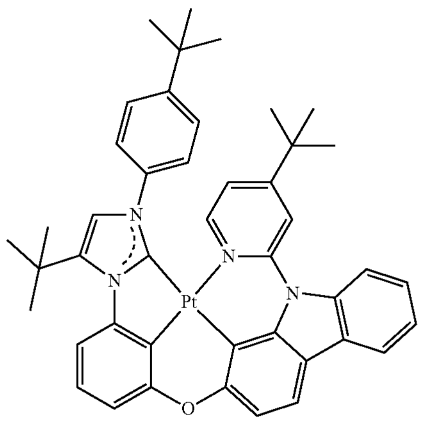
94
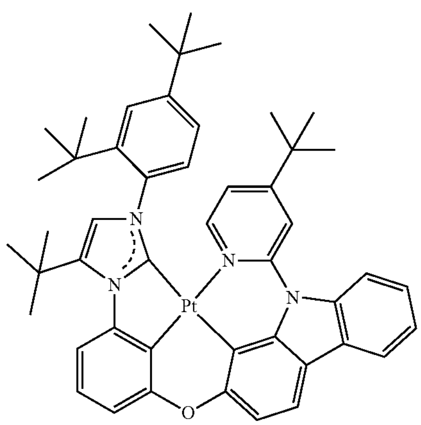
95
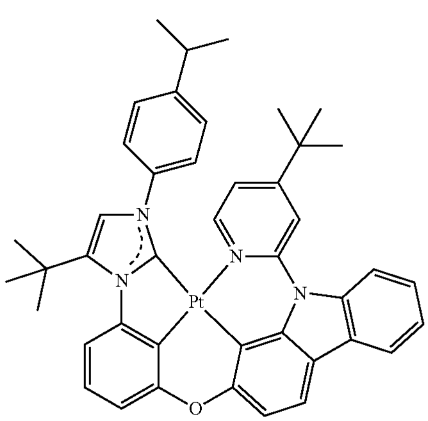
96
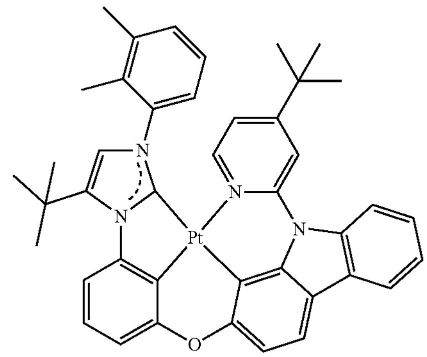
97
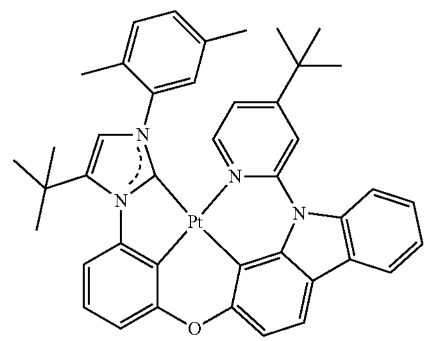
98
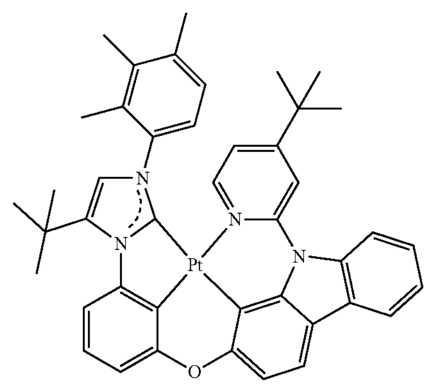
99
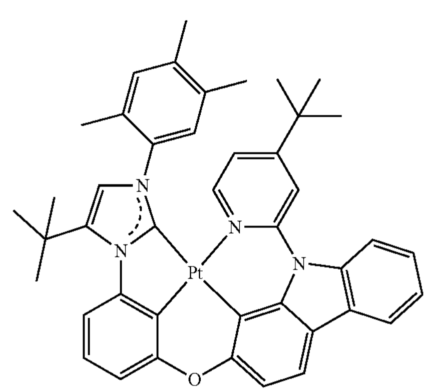

-continued
100
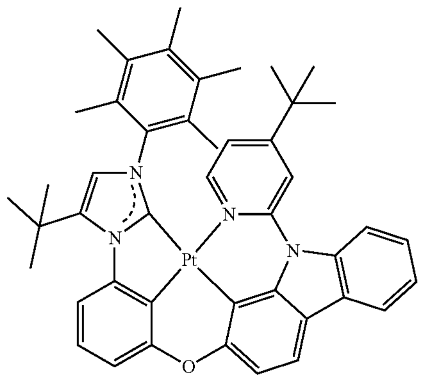
101
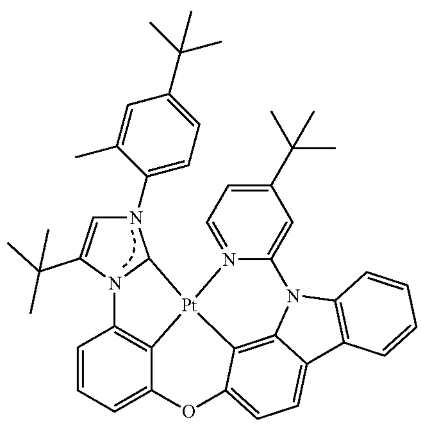
102
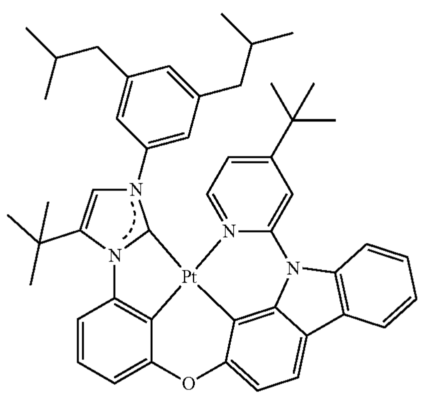
103
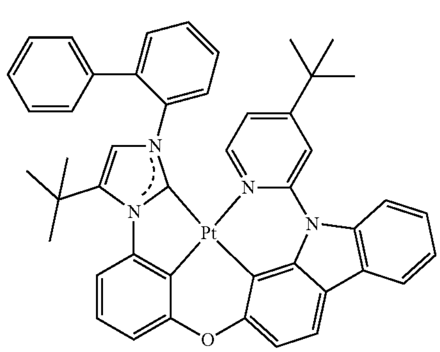
-continued
104
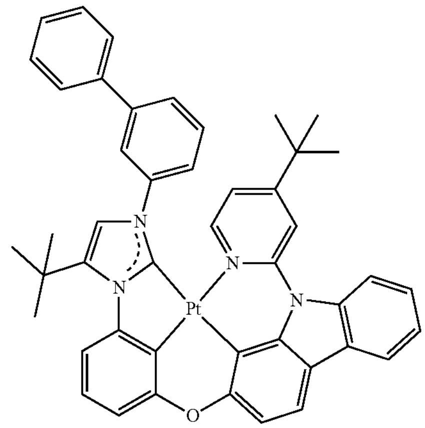
105
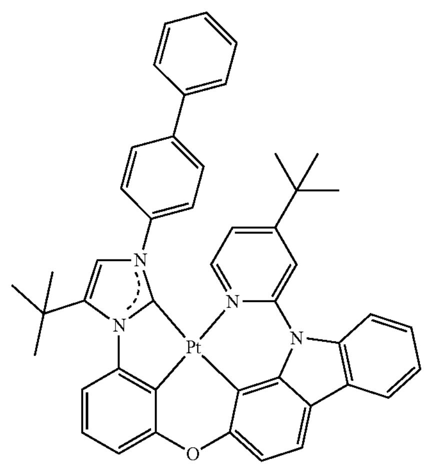
106
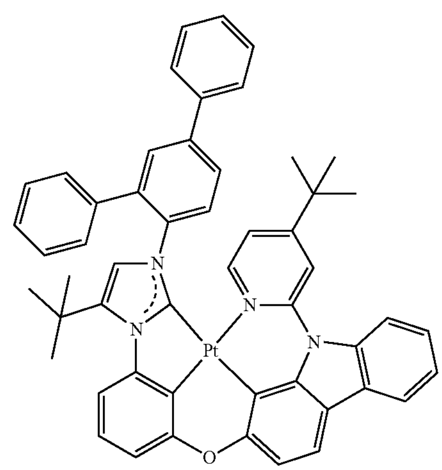

-continued
107
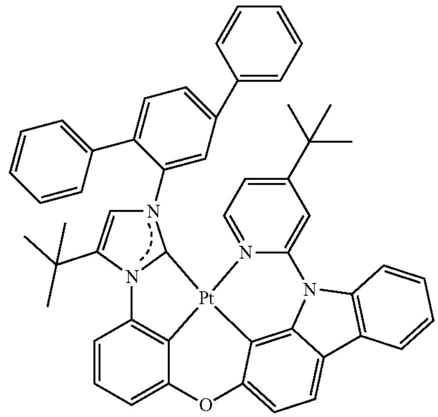
108
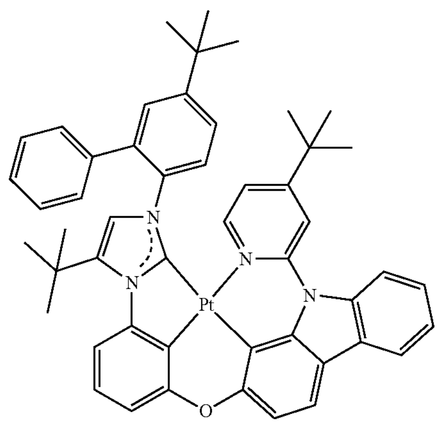
109
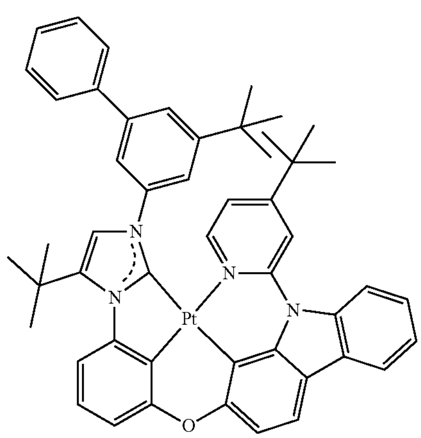
-continued
110
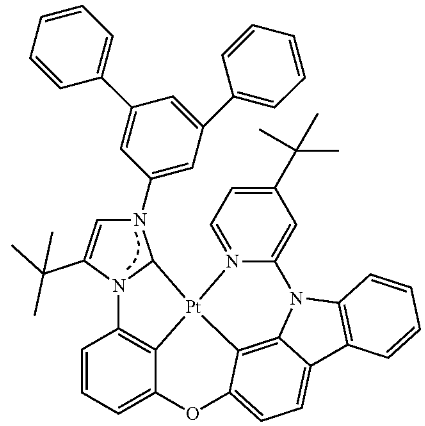
111
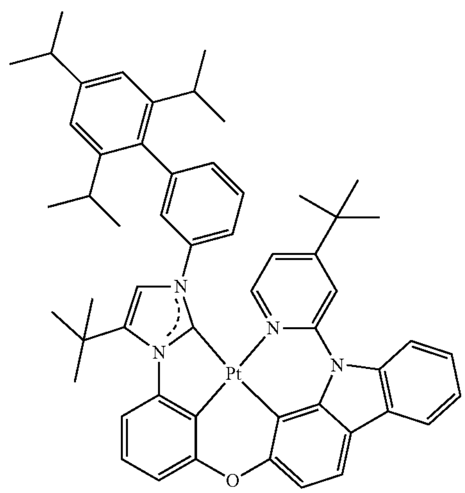
112
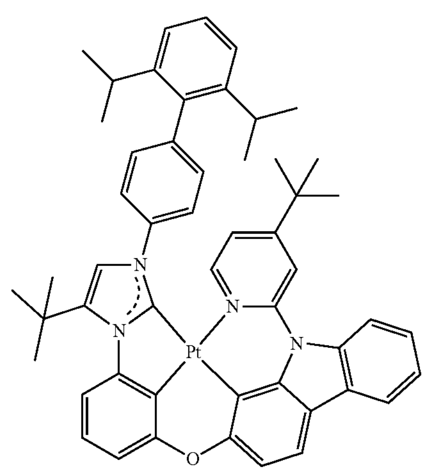

-continued
113
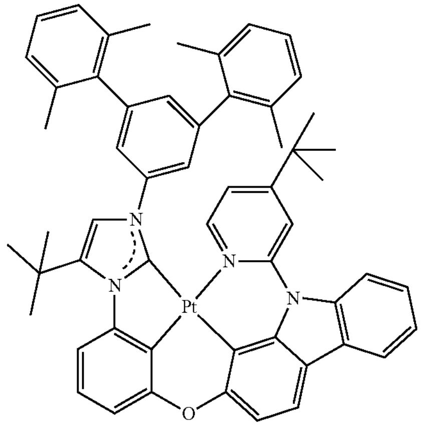
114
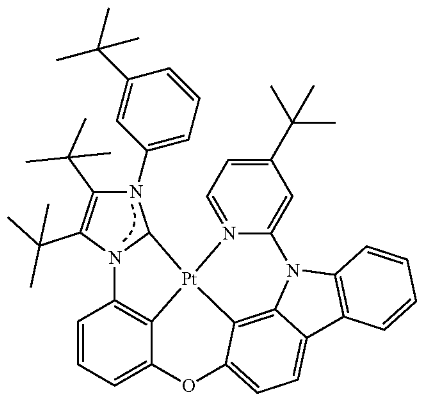
115
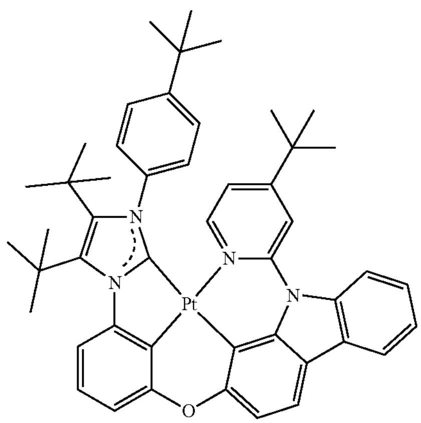
116
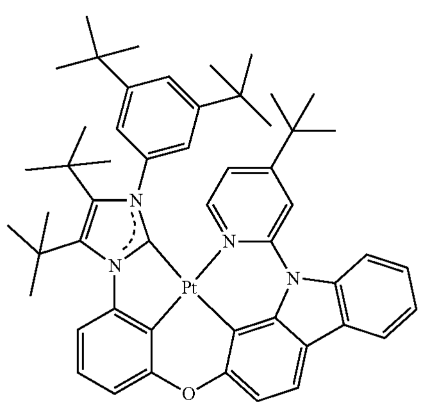
117
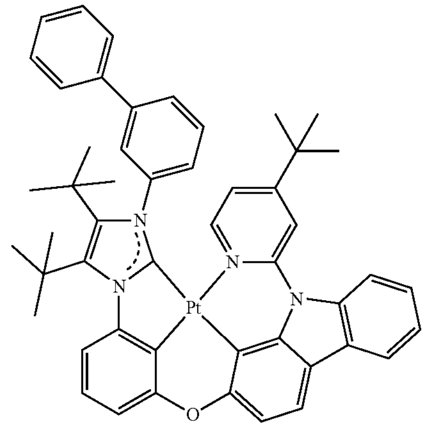
118
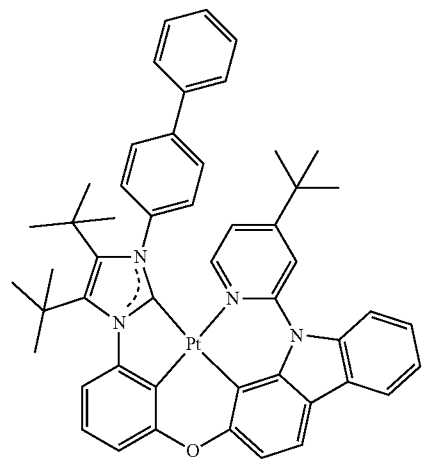
119
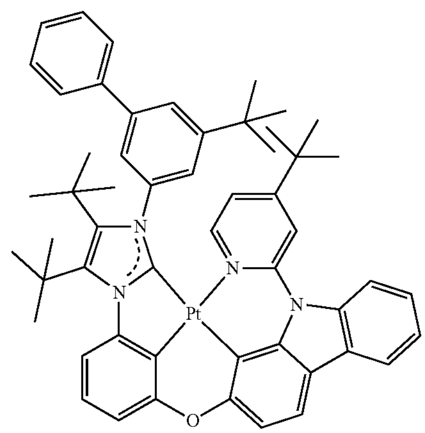

-continued
120
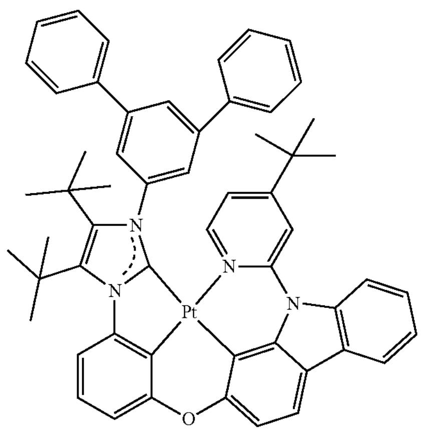
121
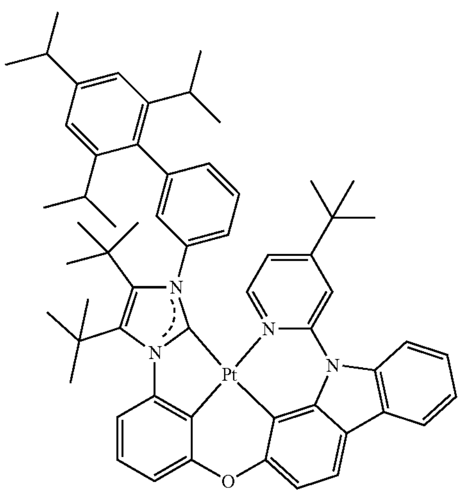
122
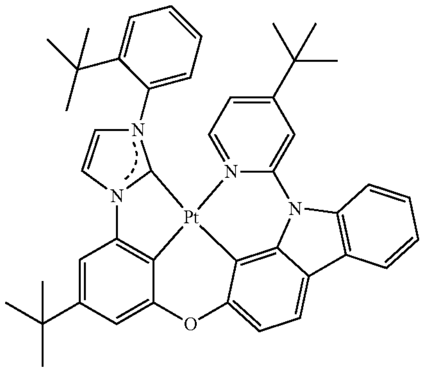
-continued
123
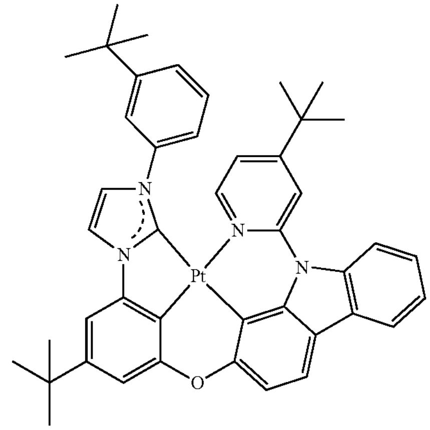
124
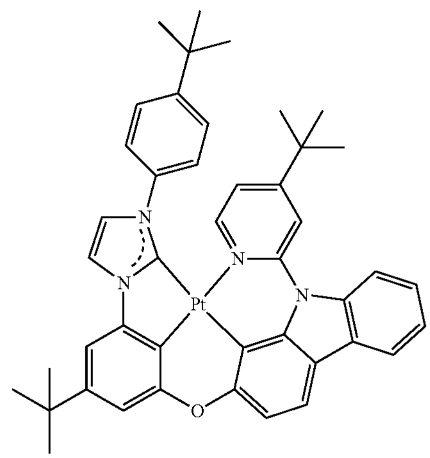
125
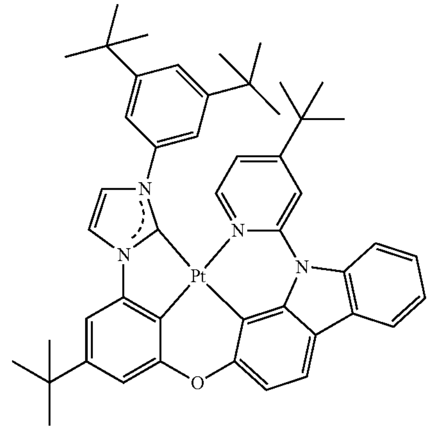

-continued
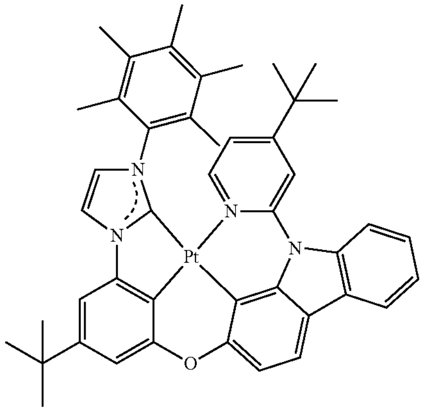
126
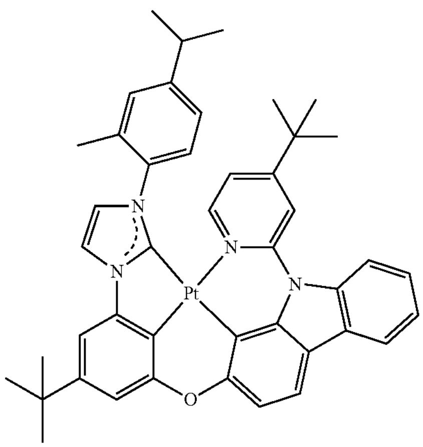
127
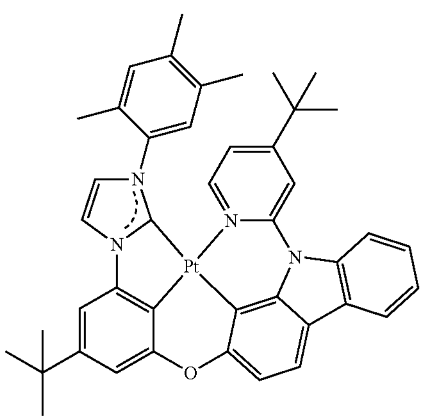
128
-continued
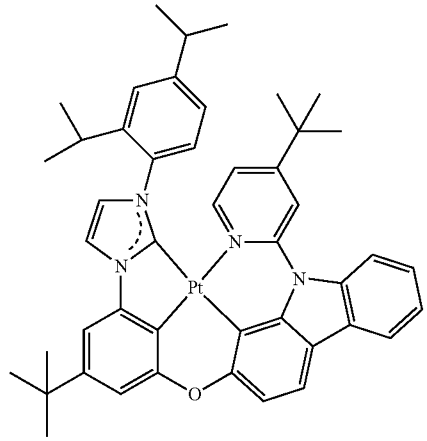
129
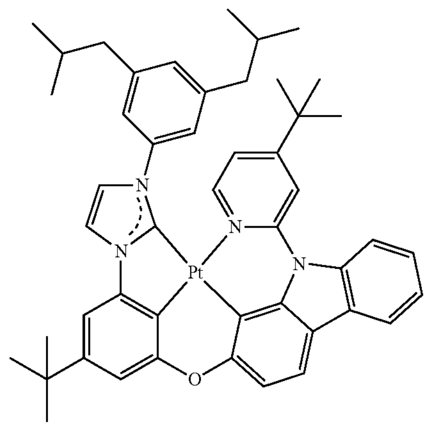
130
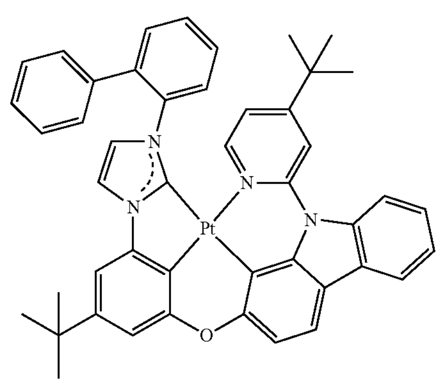
131

132
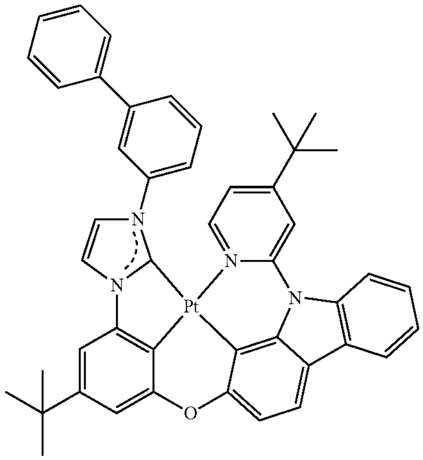
133
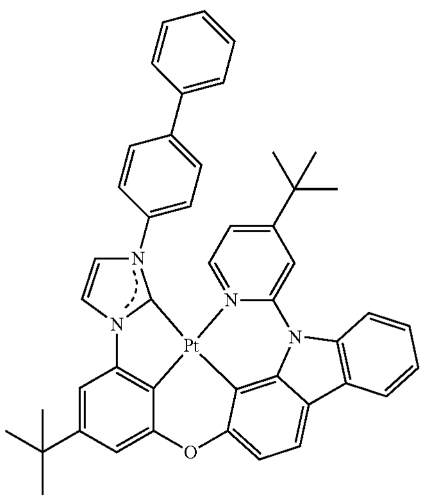
134
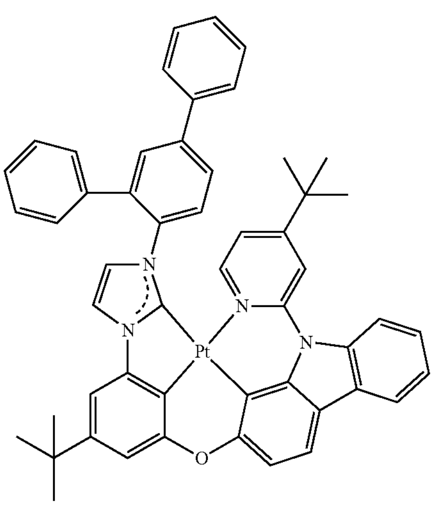
135
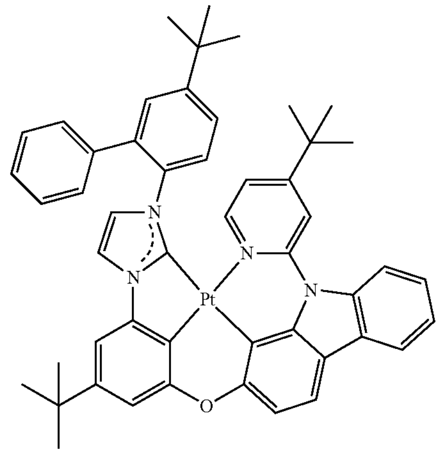
136
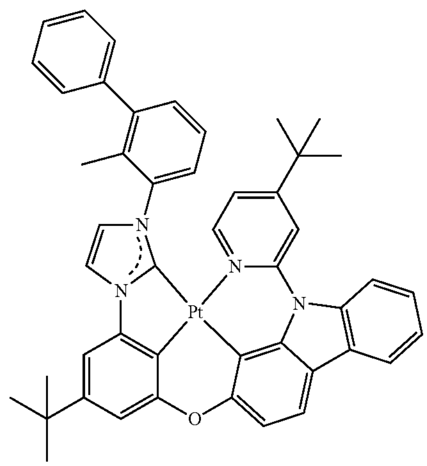
137
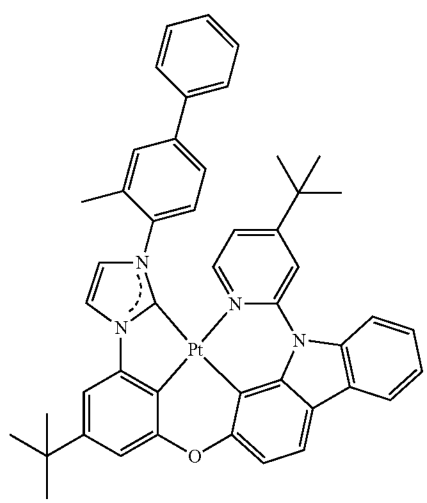

-continued
138
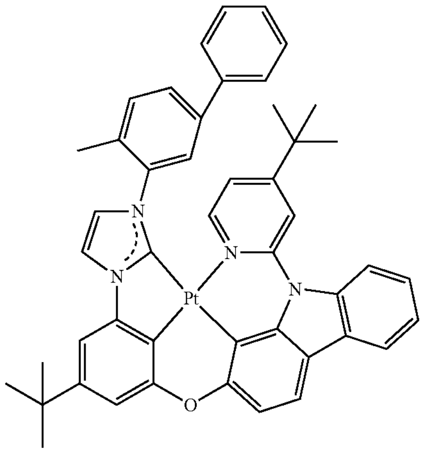
139
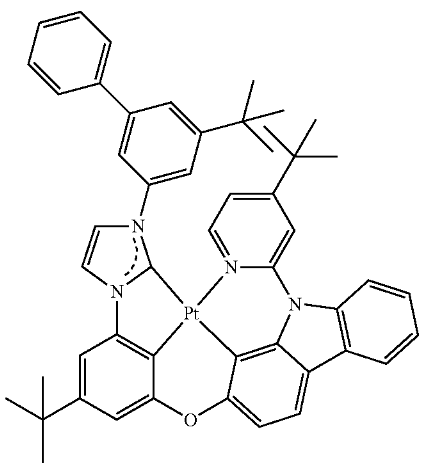
140
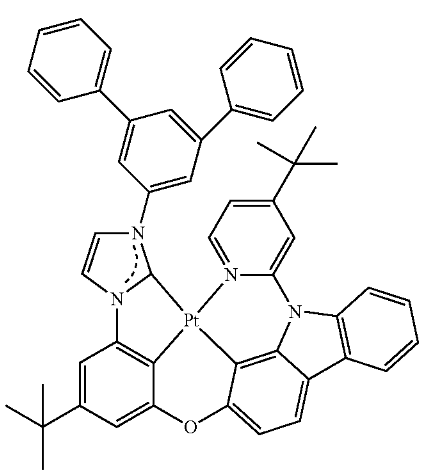
-continued
141
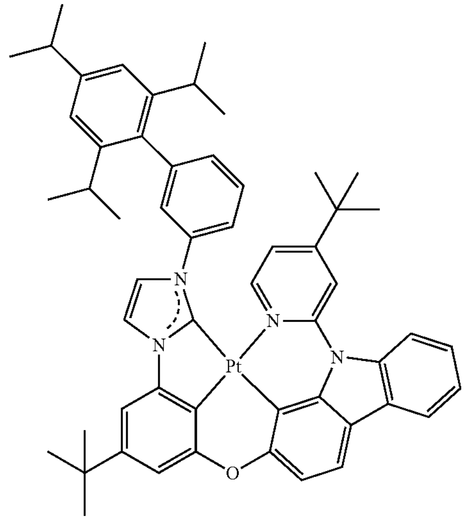
142
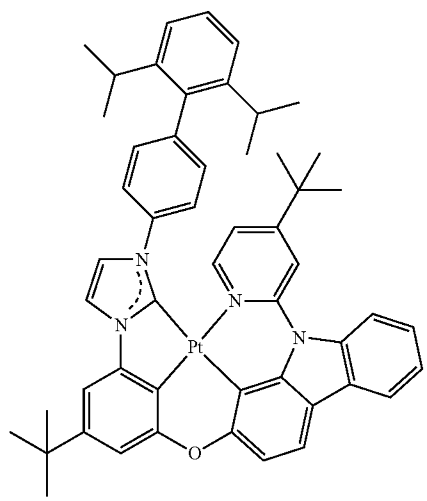
143
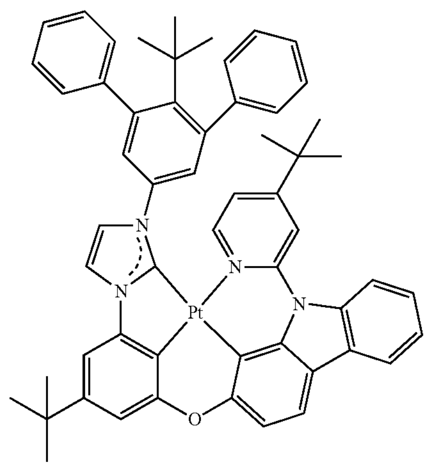

-continued
144
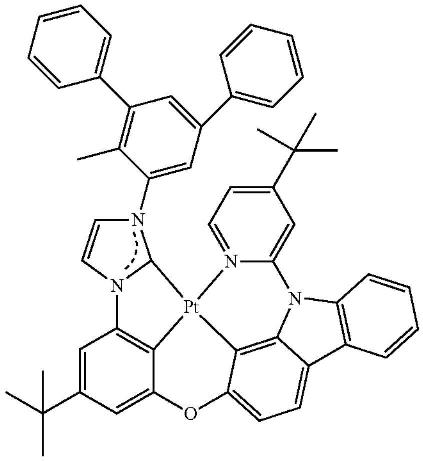
145
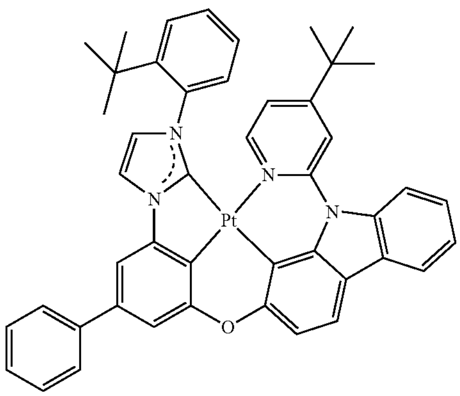
146
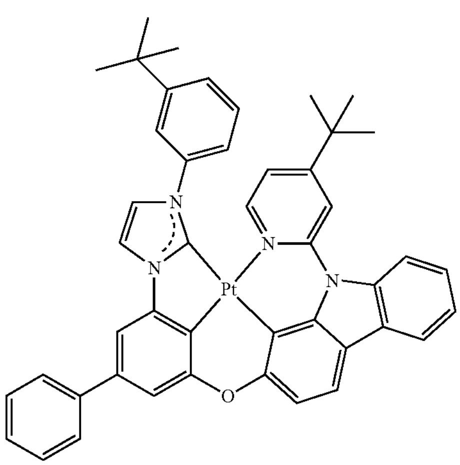
-continued
147
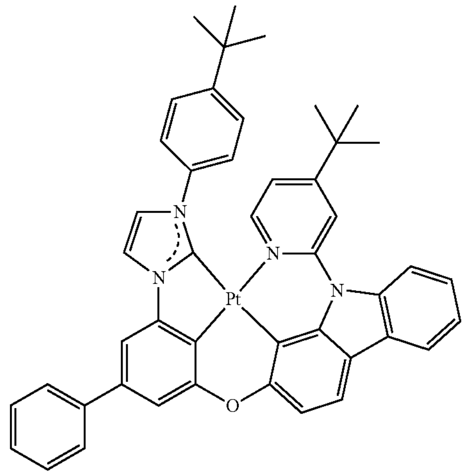
148
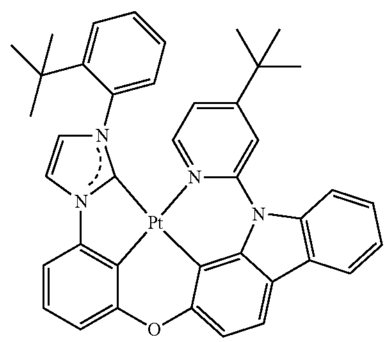
149
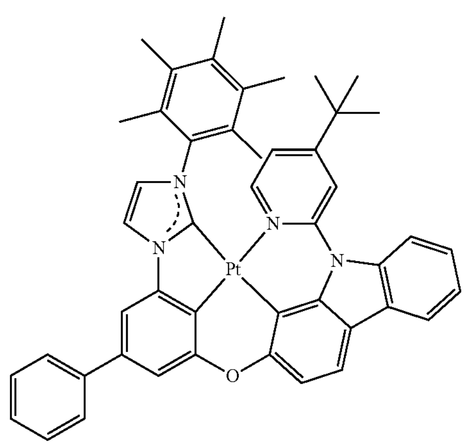

-continued
150
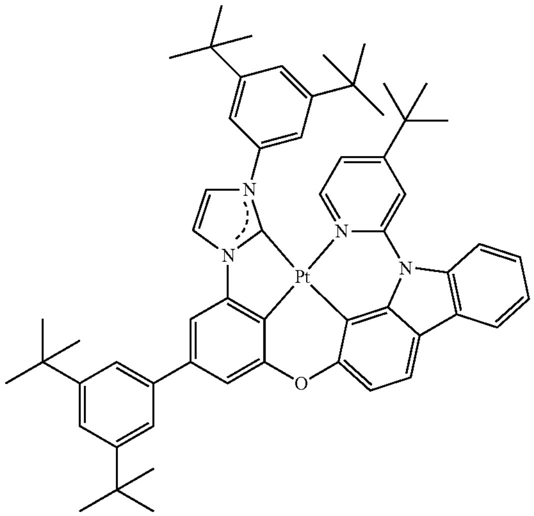
151
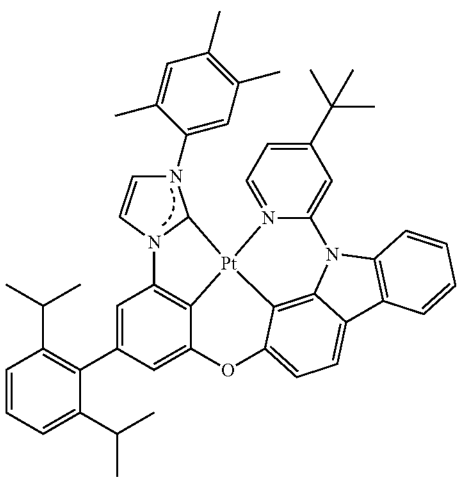
152
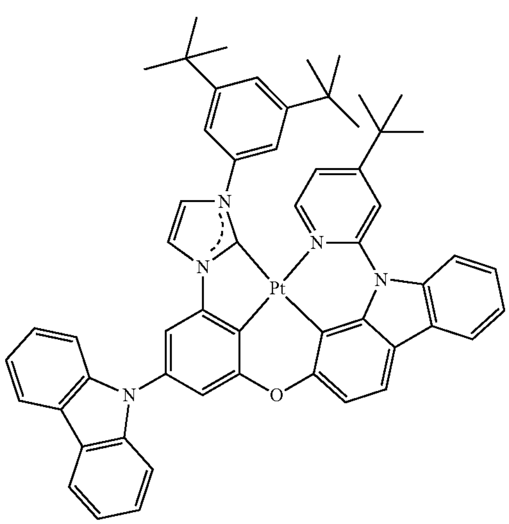
-continued
153
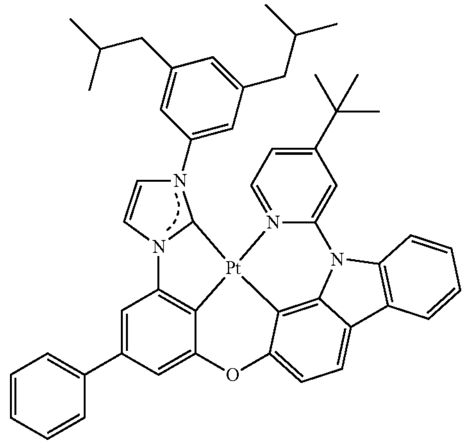
154
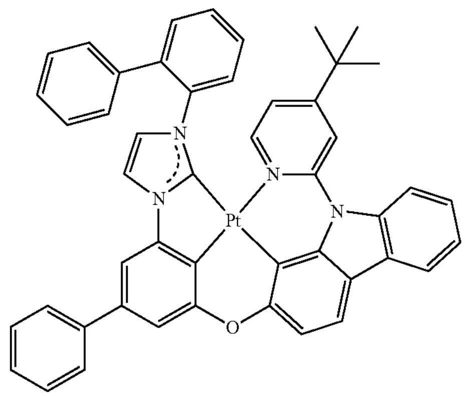
155
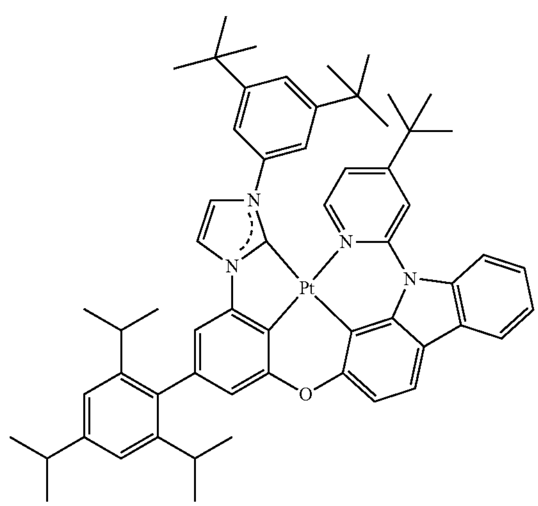

-continued
156
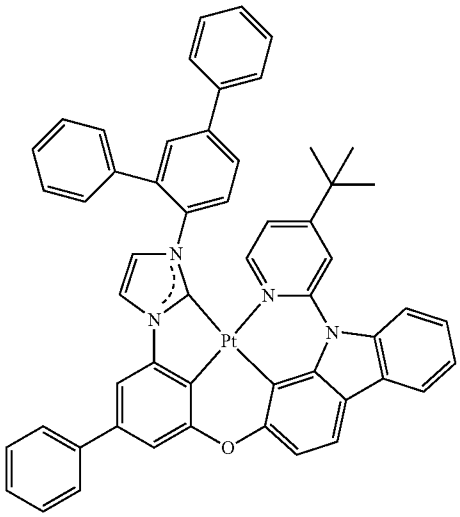
157
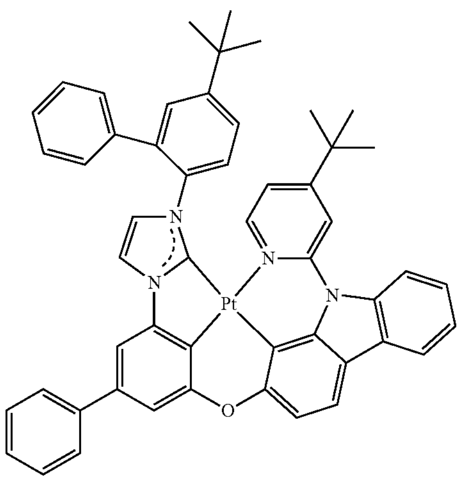
158
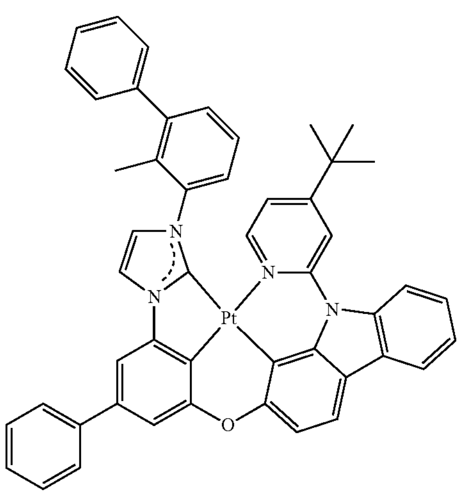
-continued
159
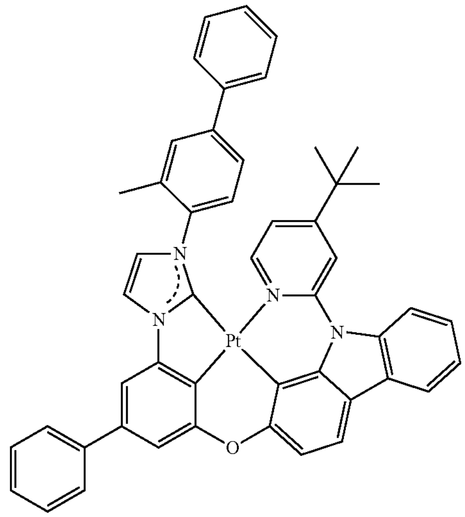
160
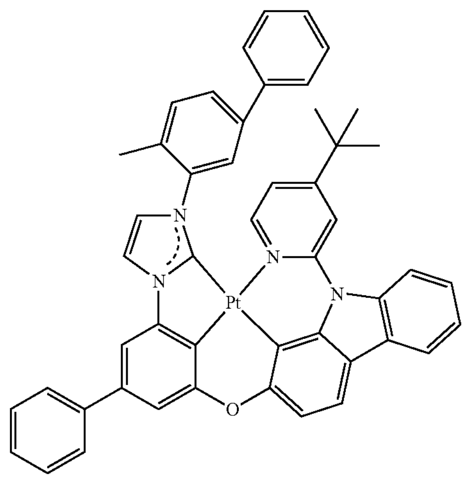
161
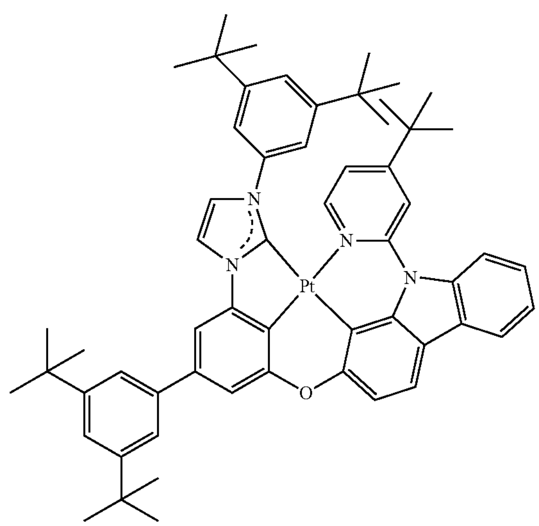

162
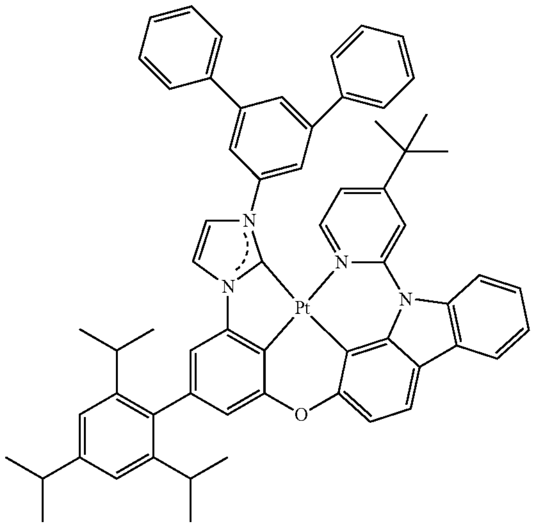
163
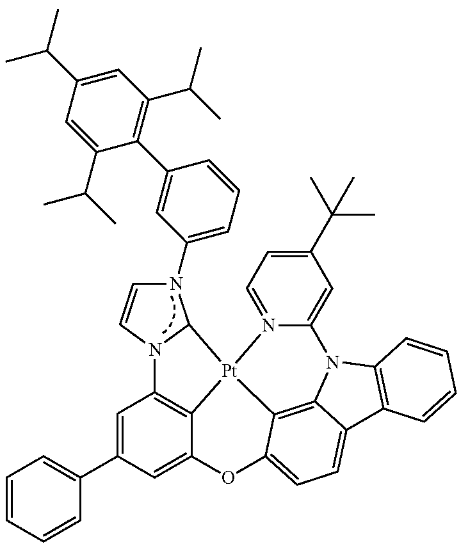
164
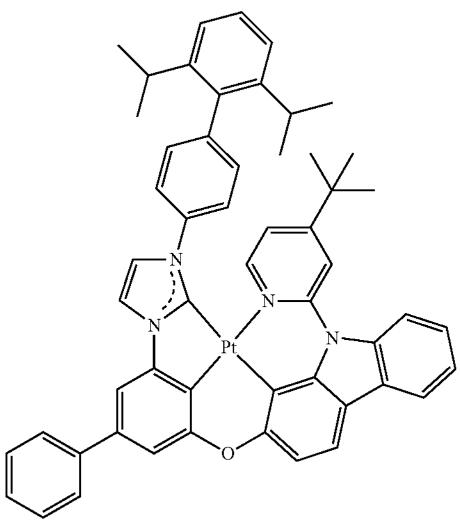
165
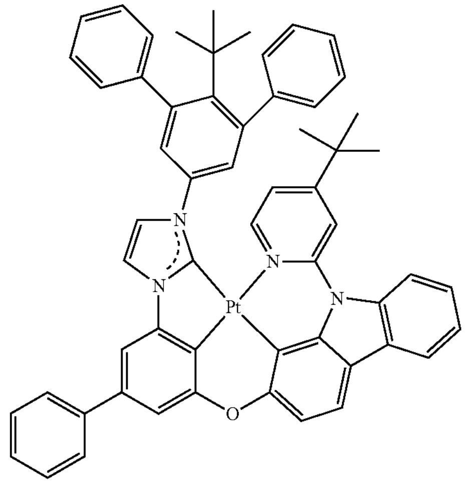
166
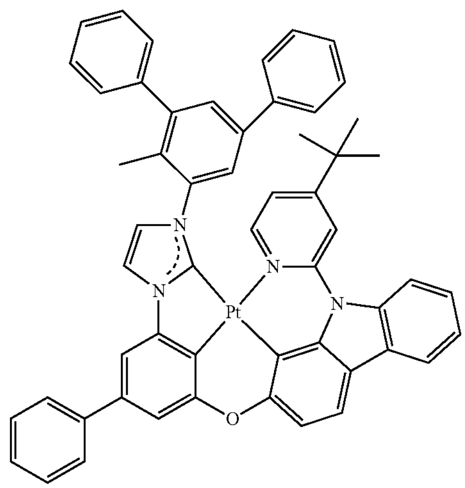
167
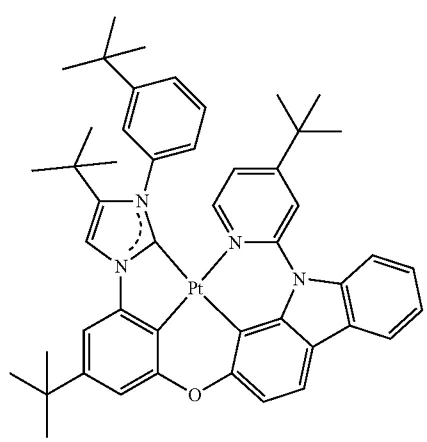

-continued
168
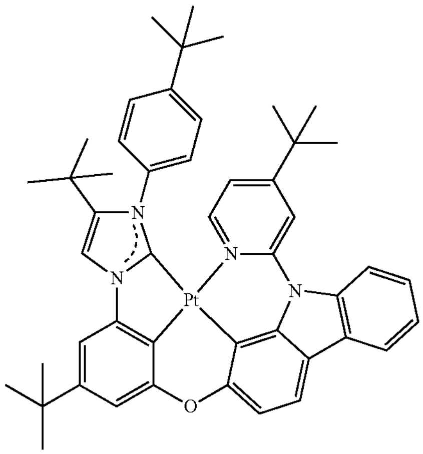
169
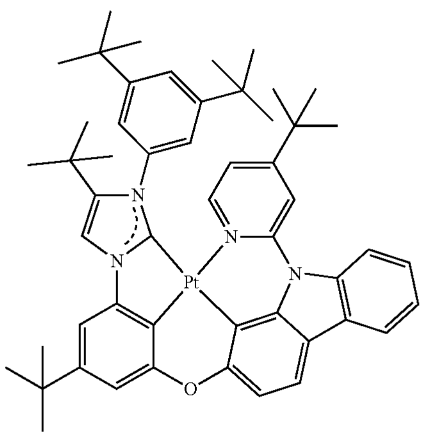
170
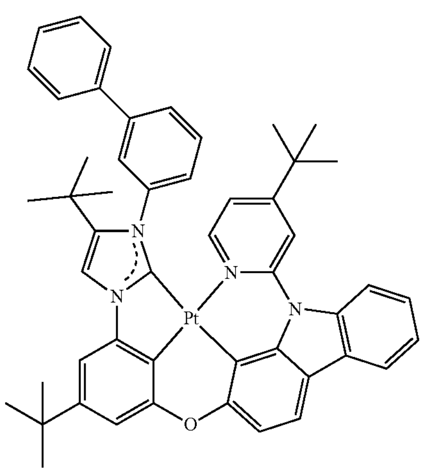
171
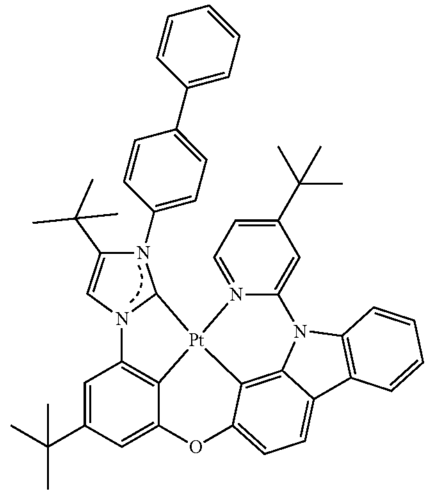
172
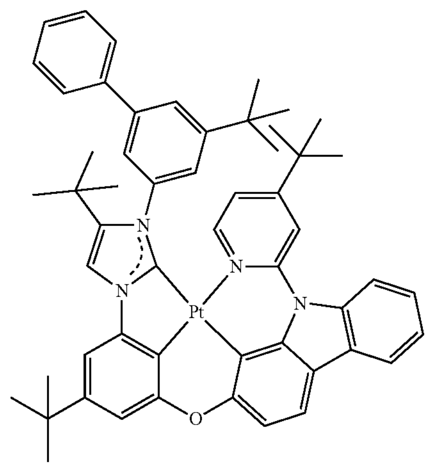
173
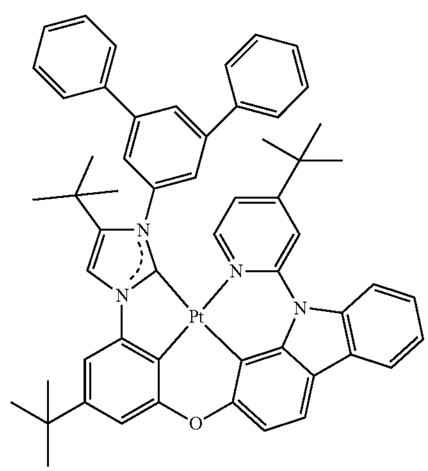

-continued
174
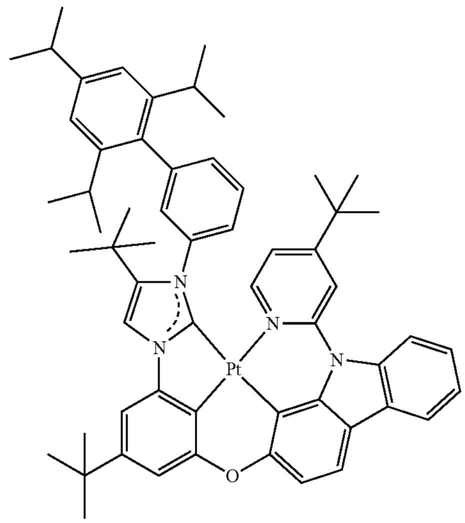
175
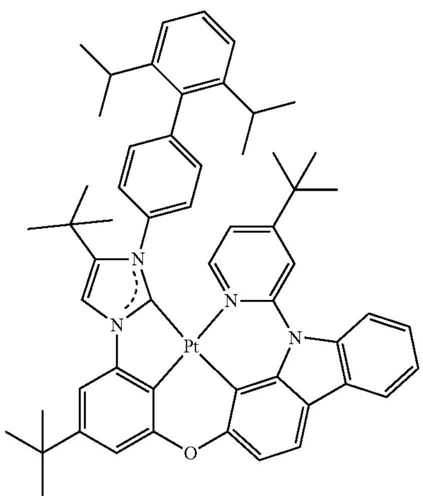
176
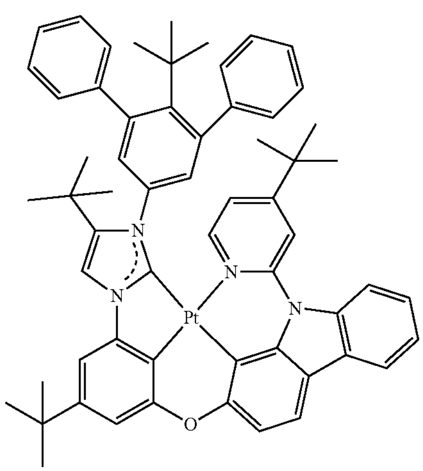
-continued
177
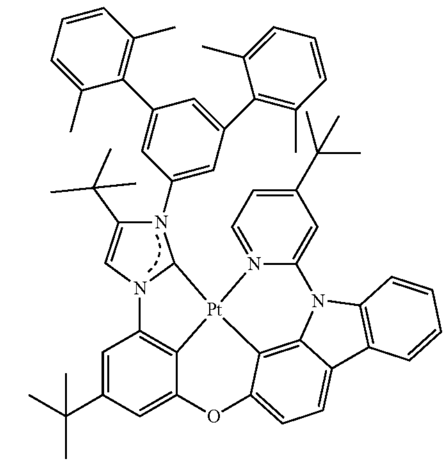
178
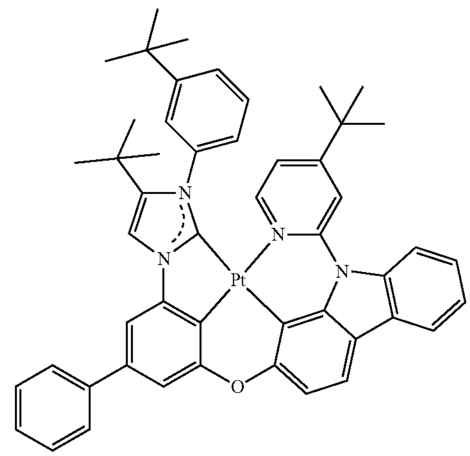
179
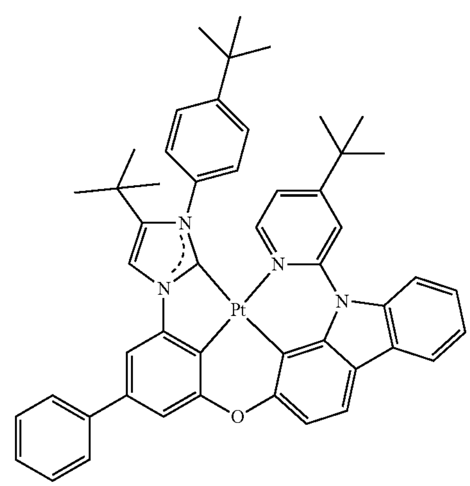

-continued
180
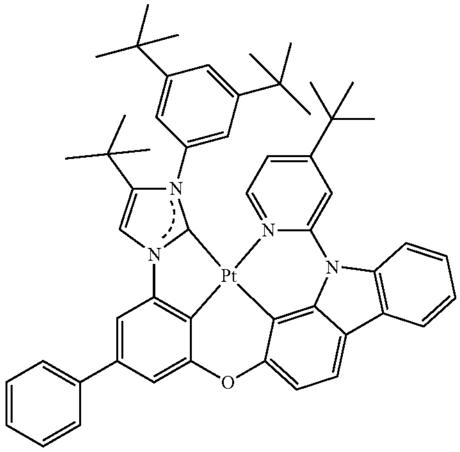
181
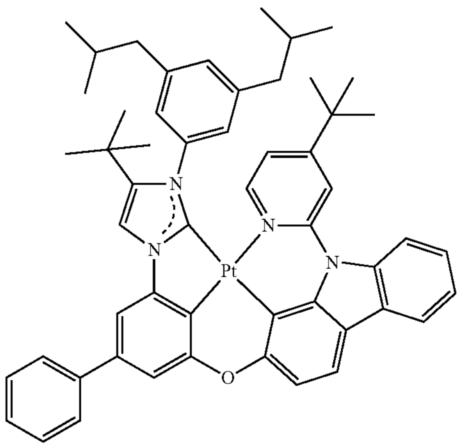
182
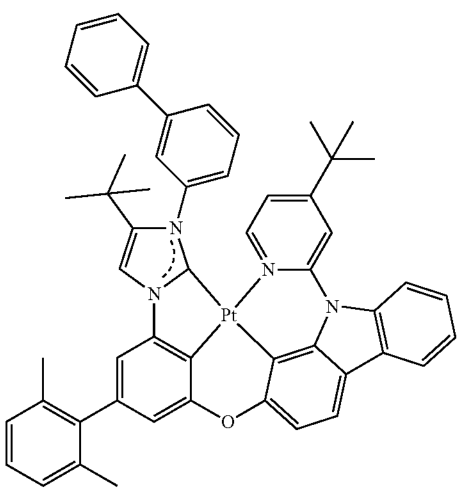
-continued
183
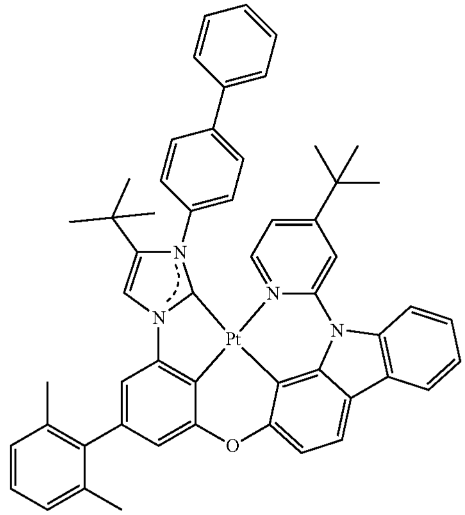
184
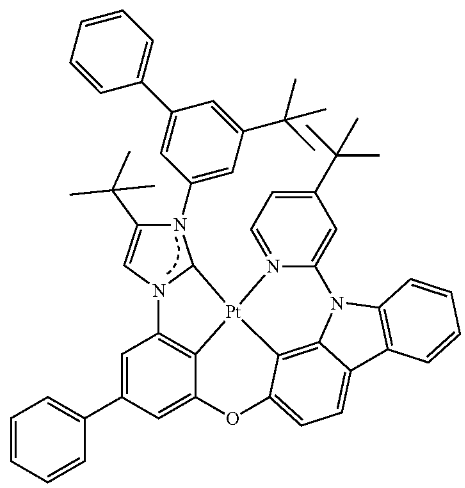
185
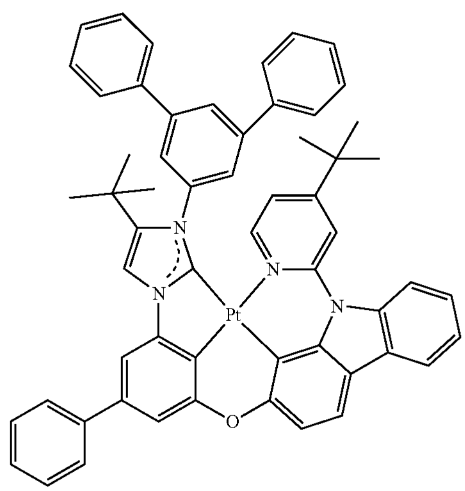

186
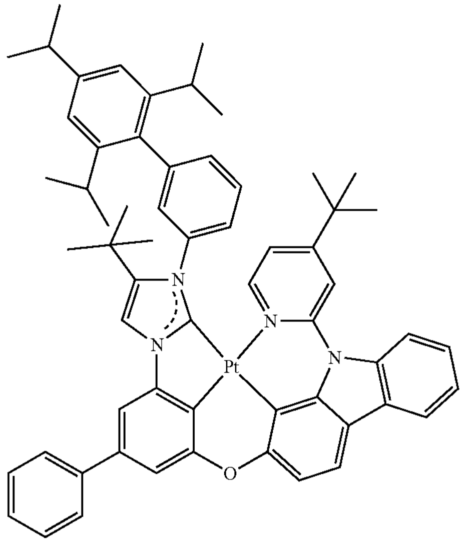
187
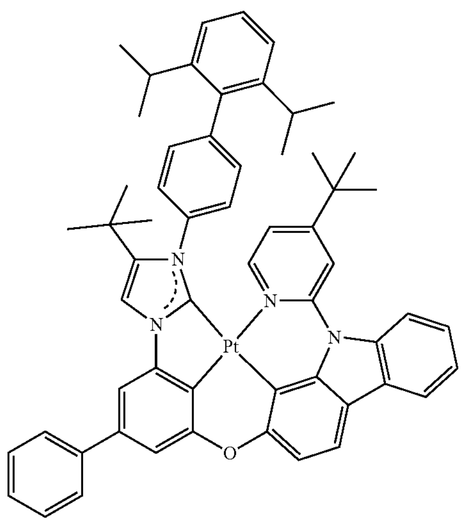
188
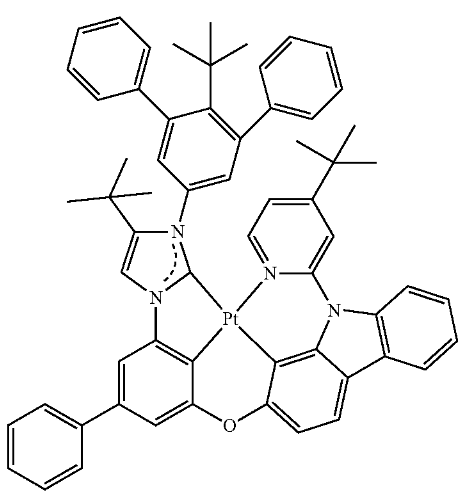
189
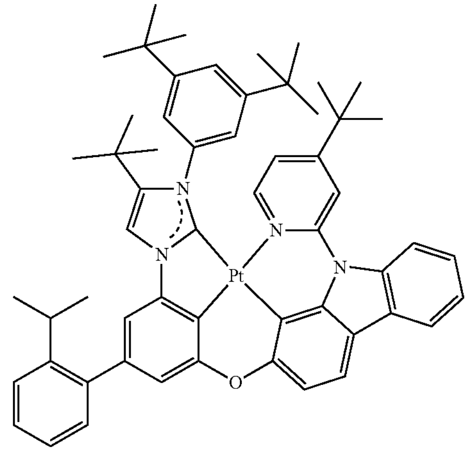
190
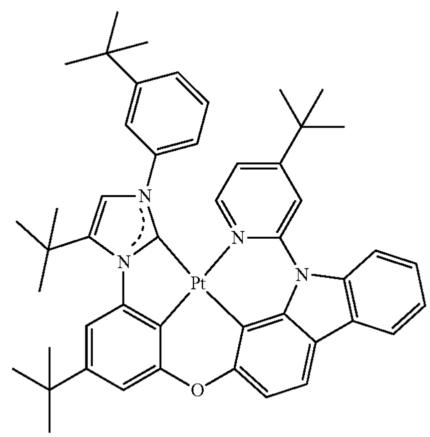
191
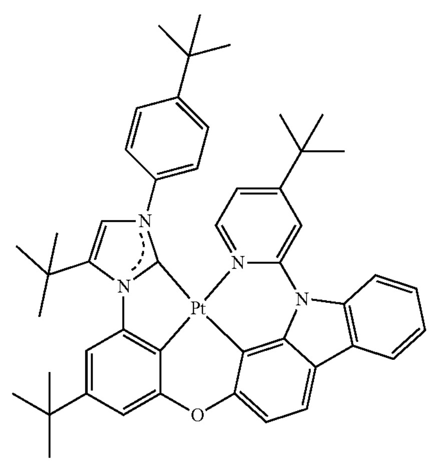

-continued
192
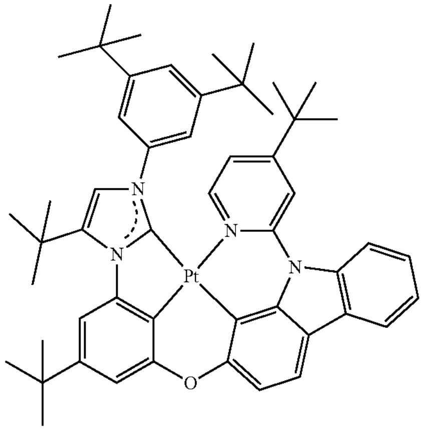
193
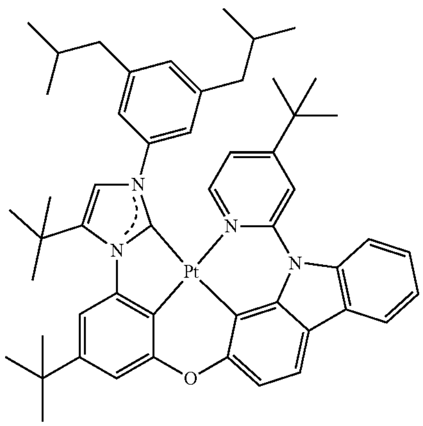
194
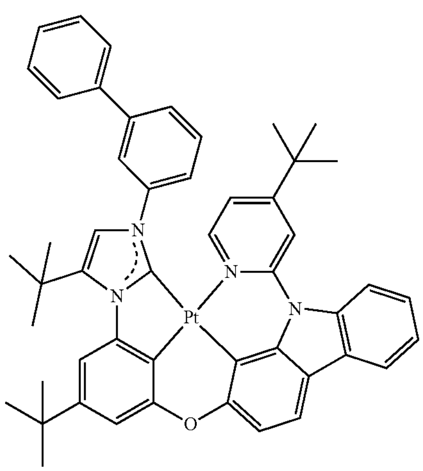
-continued
195
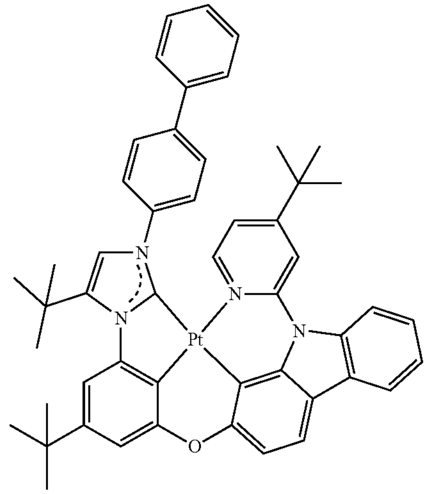
196
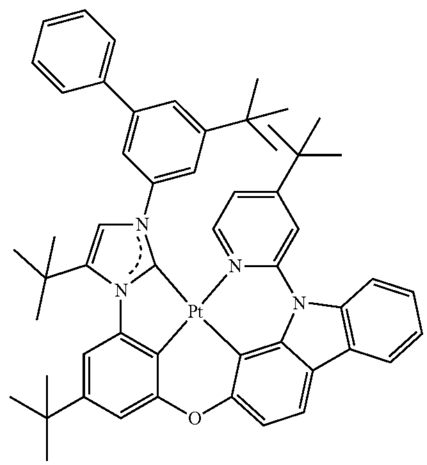
197
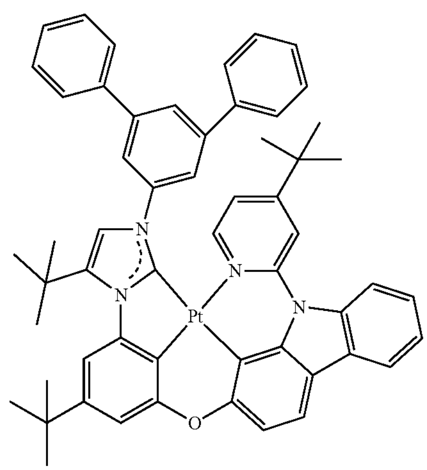

-continued
198
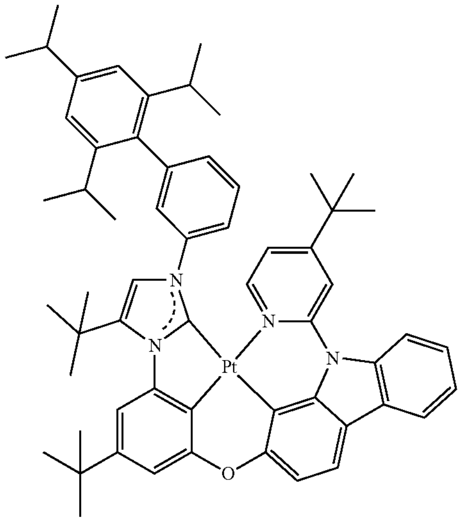
199
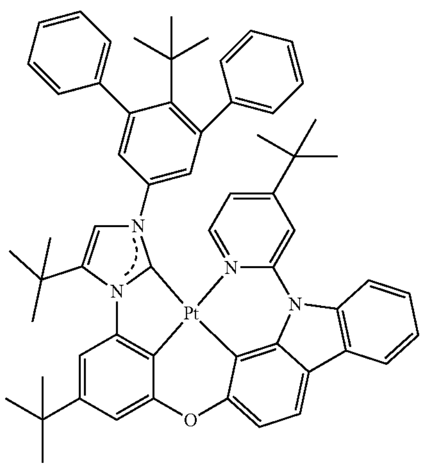
200
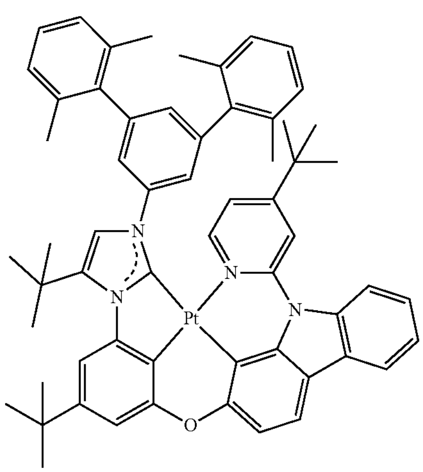
-continued
201
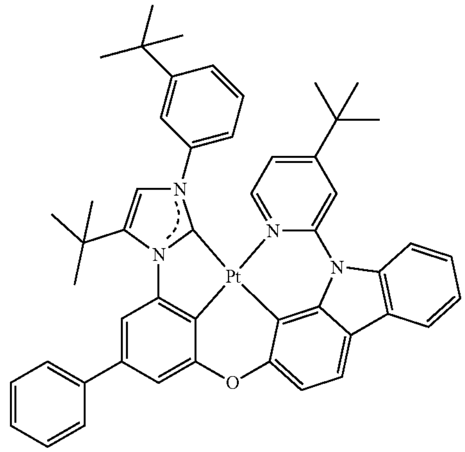
202
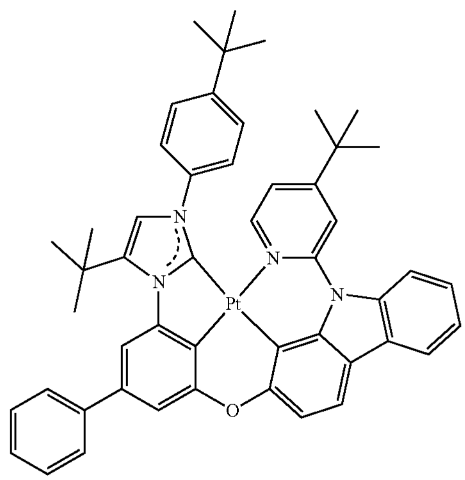
203
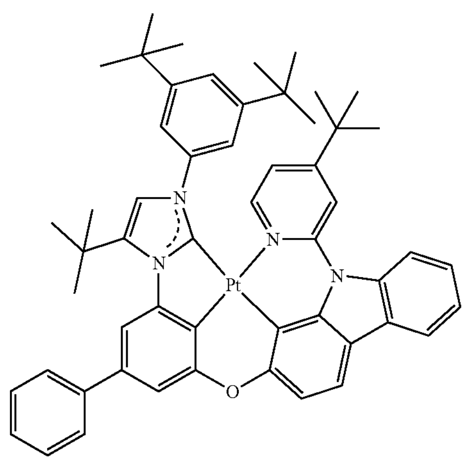

-continued
204
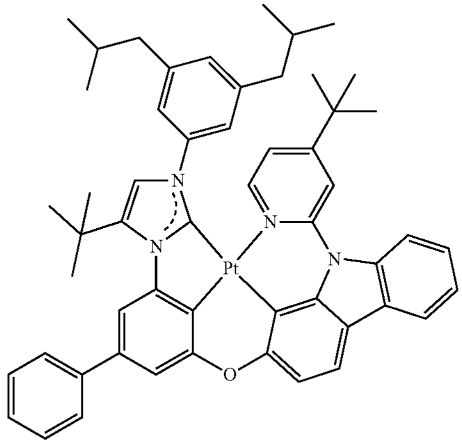
205
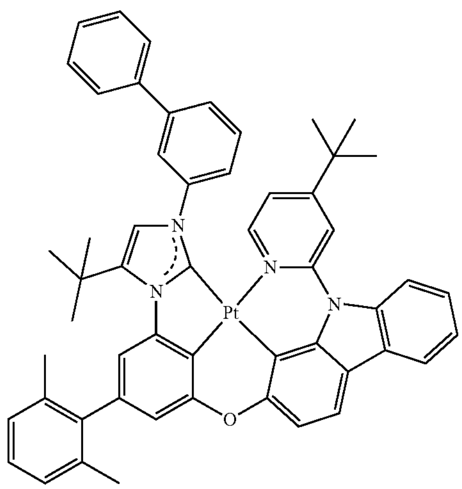
206
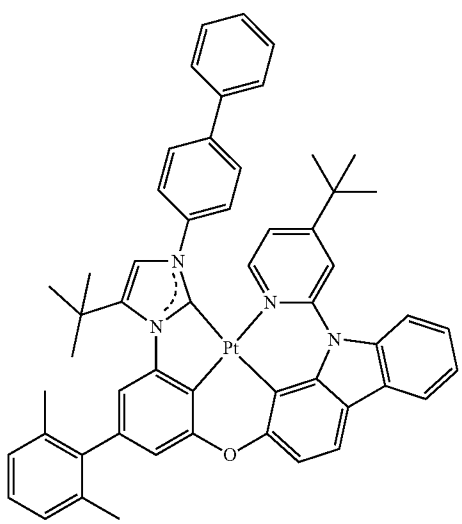
-continued
207
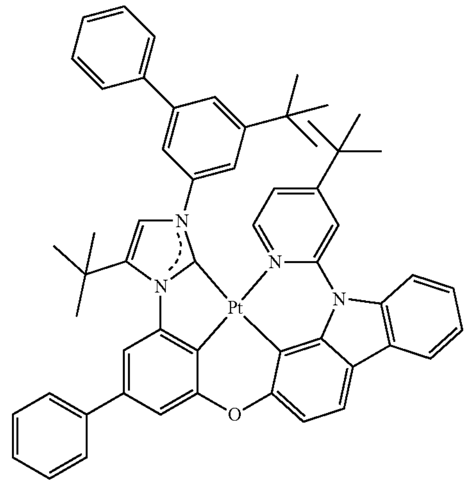
208
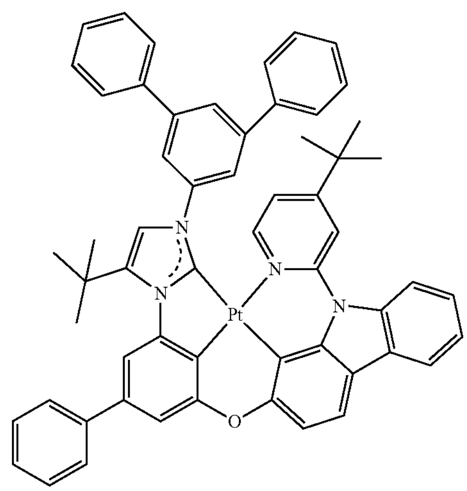
209
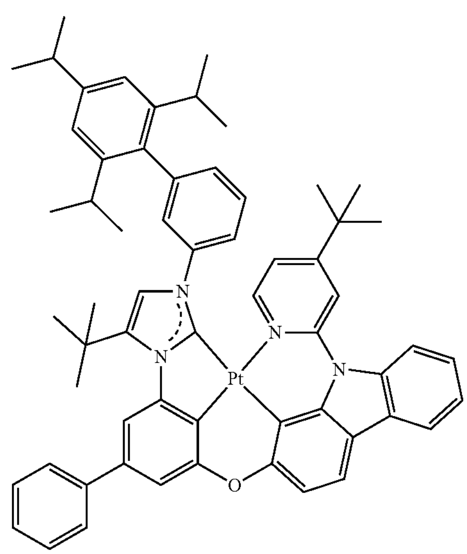

210
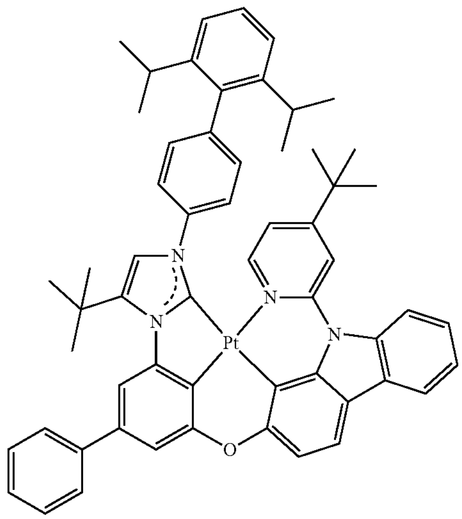
211
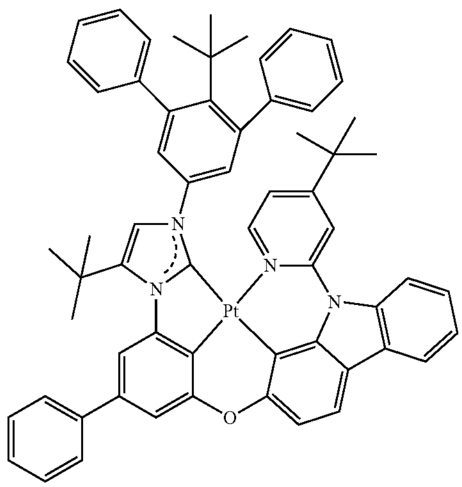
212
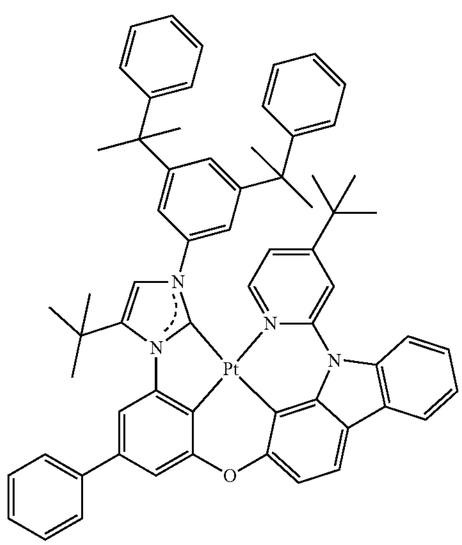
213
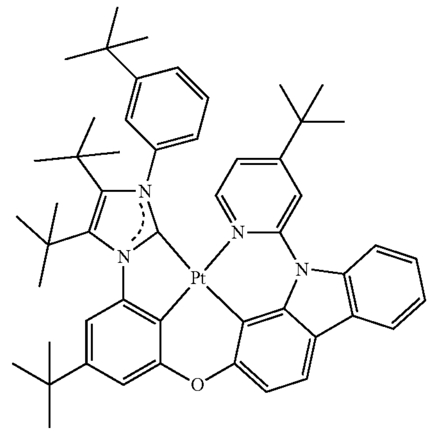
214
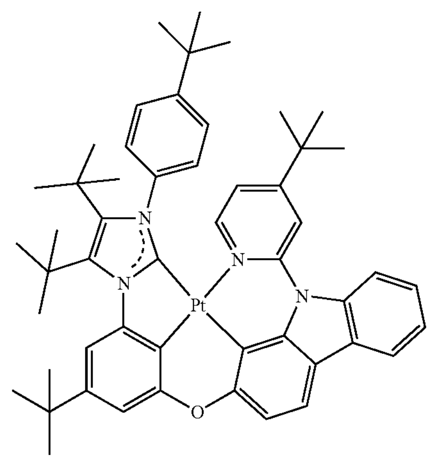
215
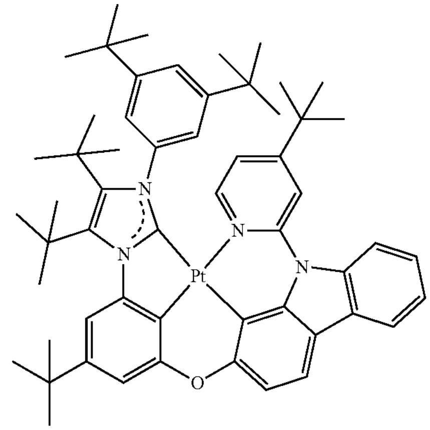

216
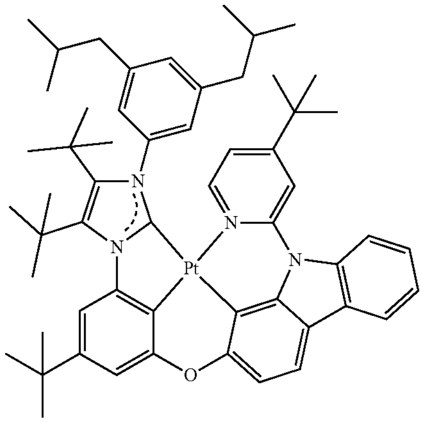
217
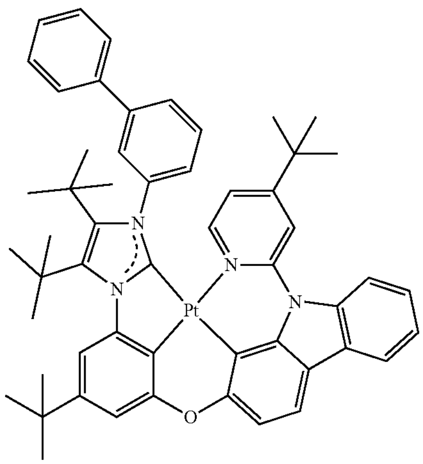
218
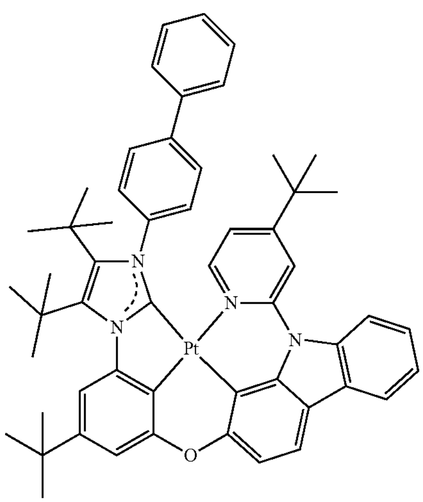
219
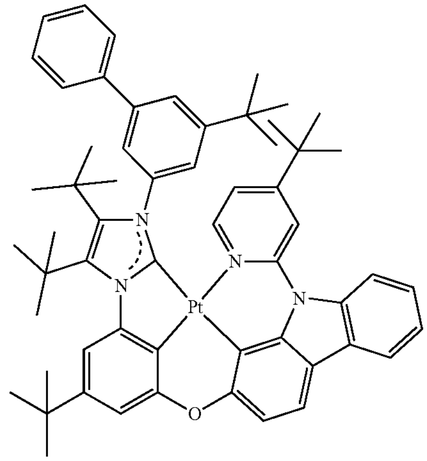
220
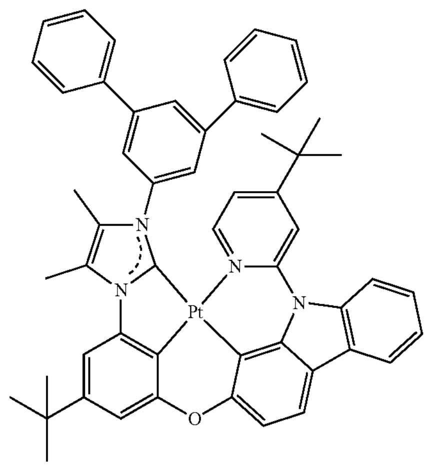
221
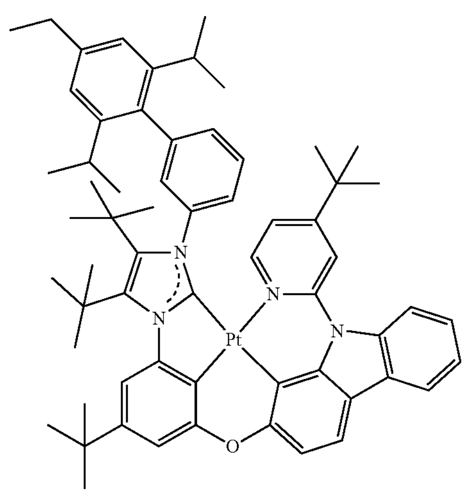

-continued
222
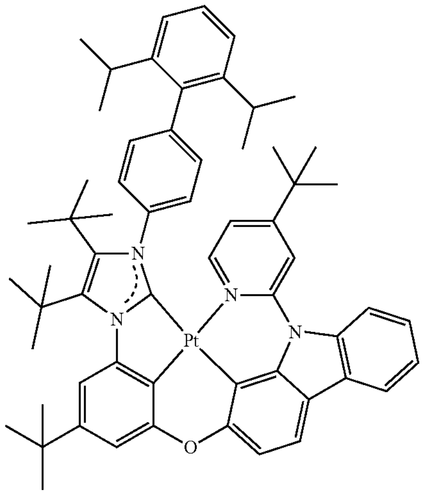
223
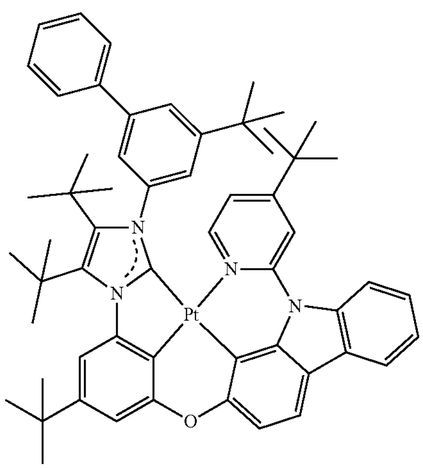
224
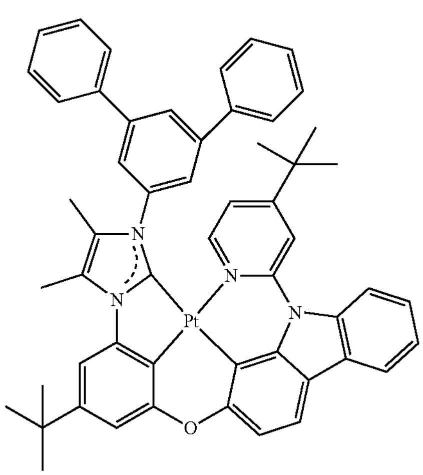
-continued
225
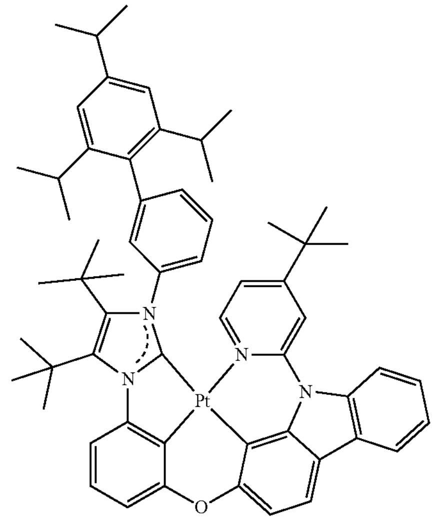
226
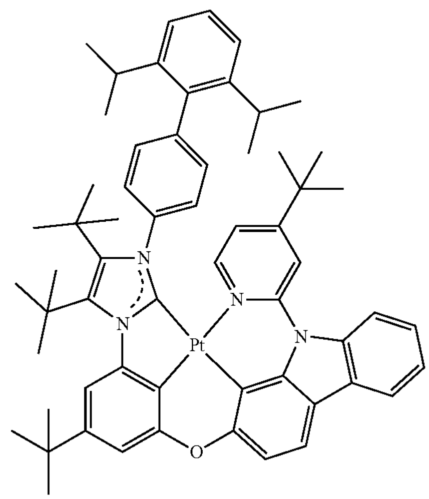
227
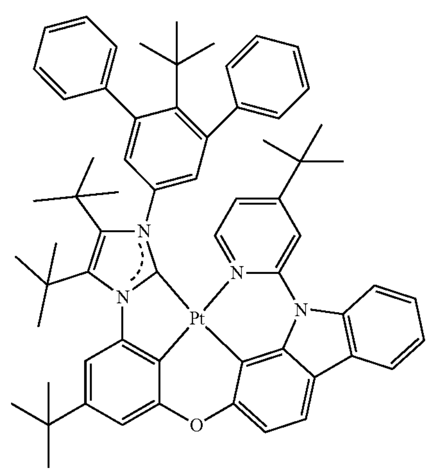

-continued
228
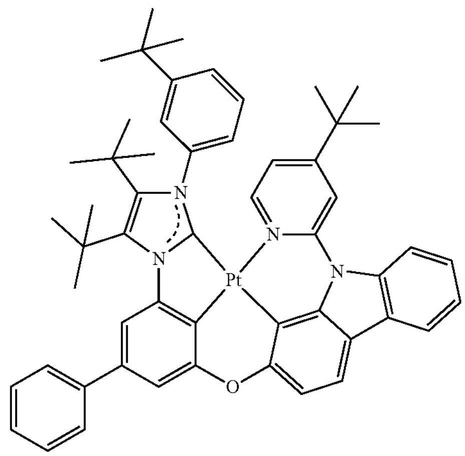
229
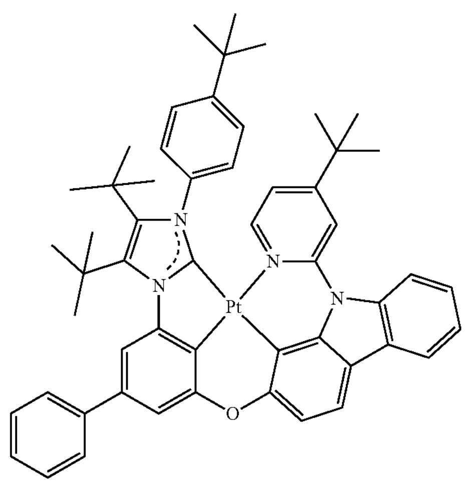
230
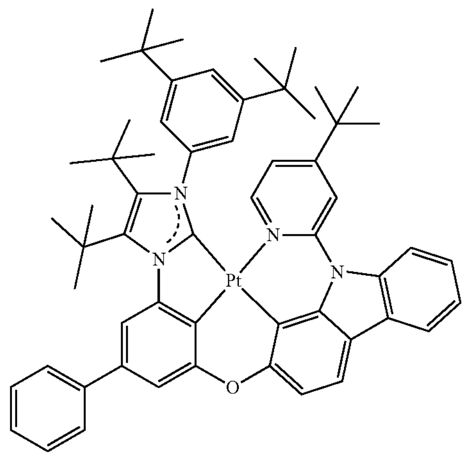
-continued
231
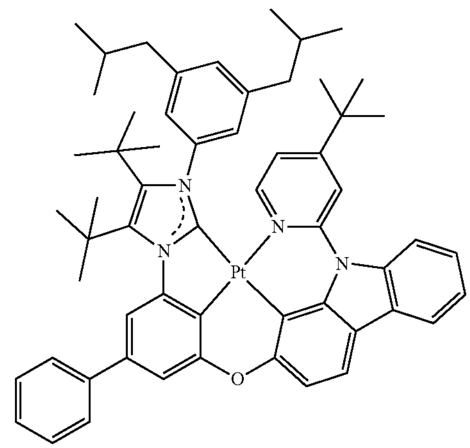
232
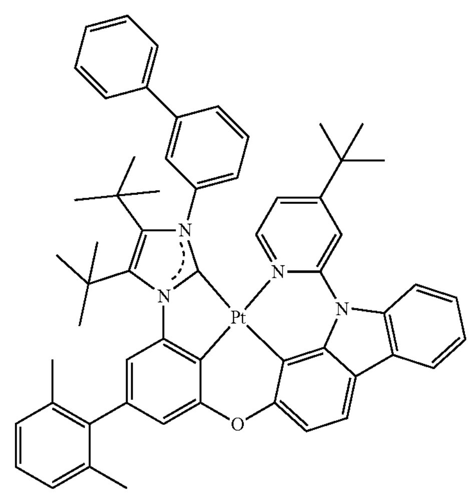
233
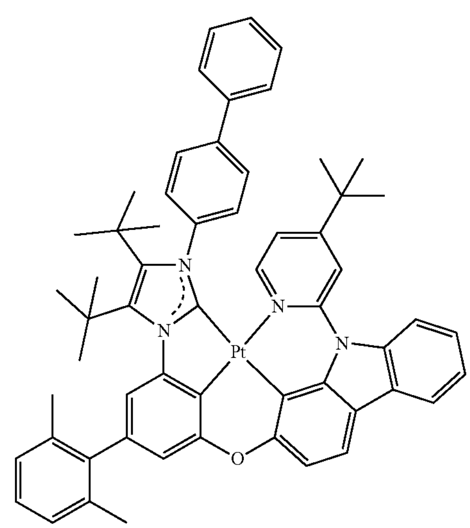

-continued
234
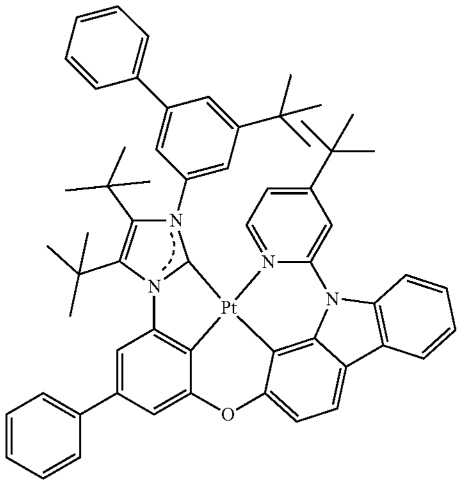
235
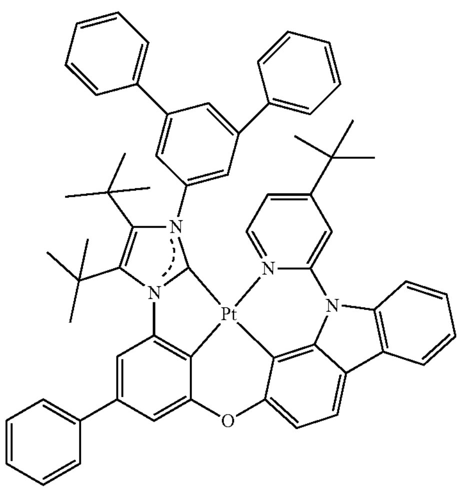
236
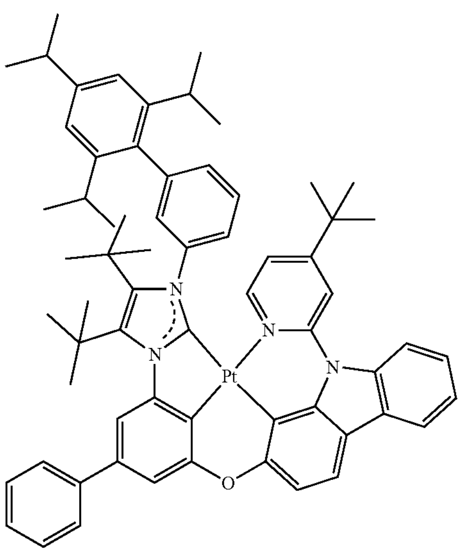
237
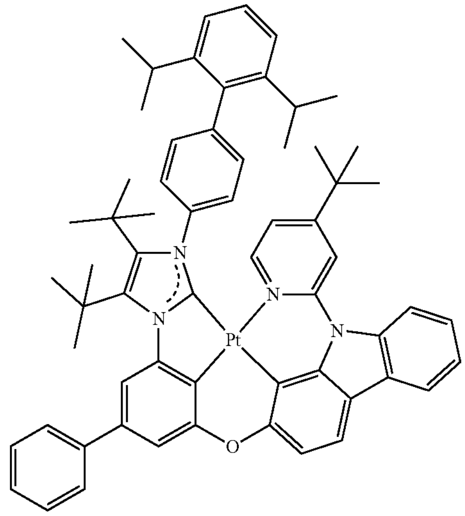
238
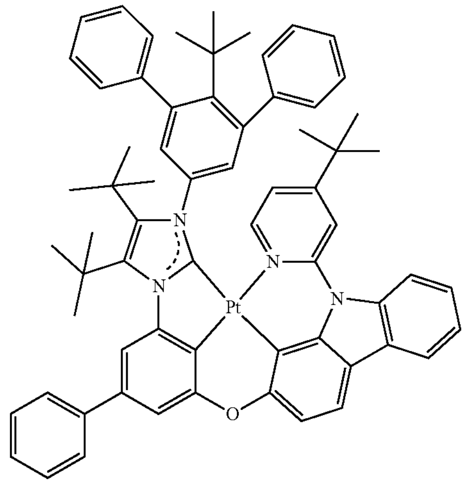
239
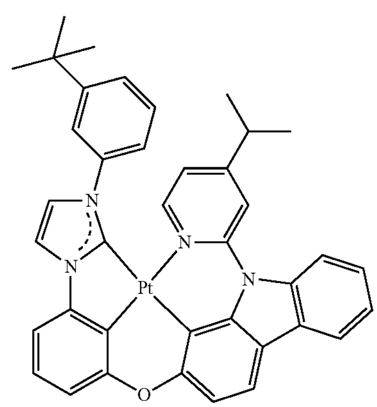

-continued
240
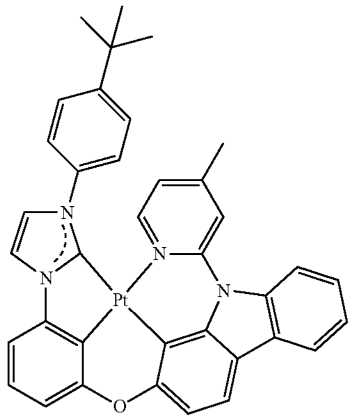
241
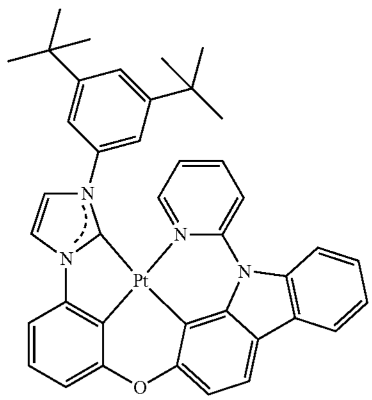
242
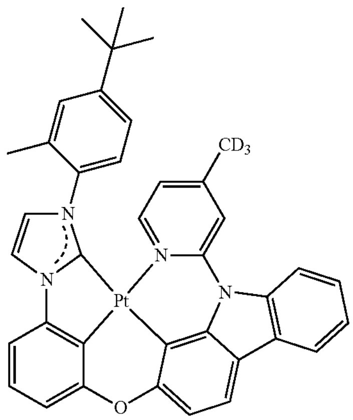
243
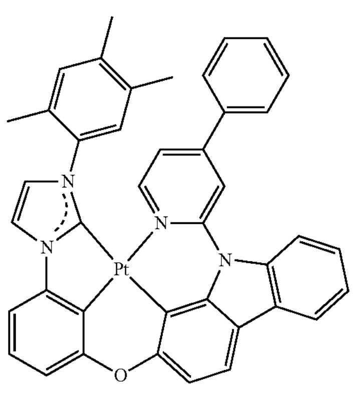
244
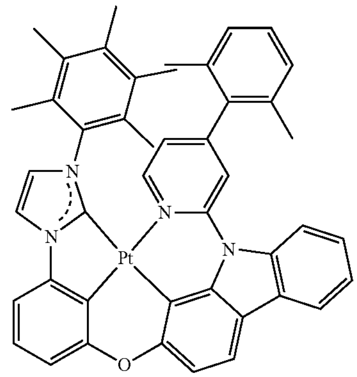
245
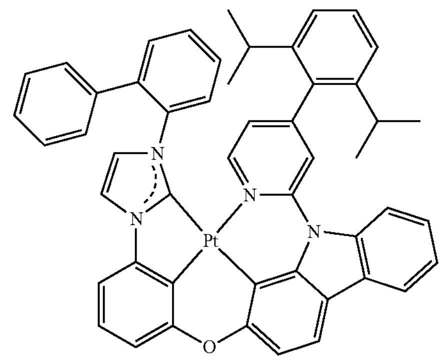
246
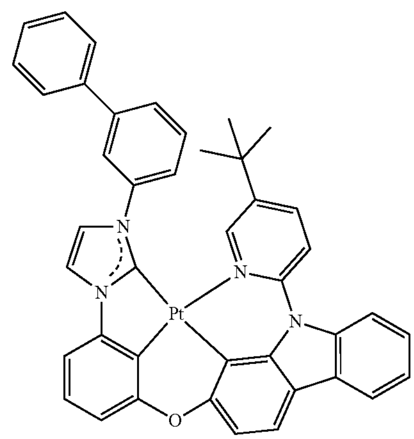
247
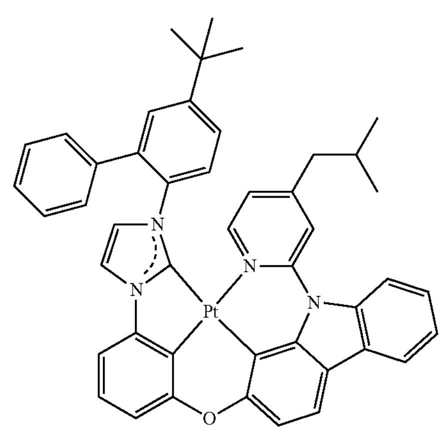

-continued
248
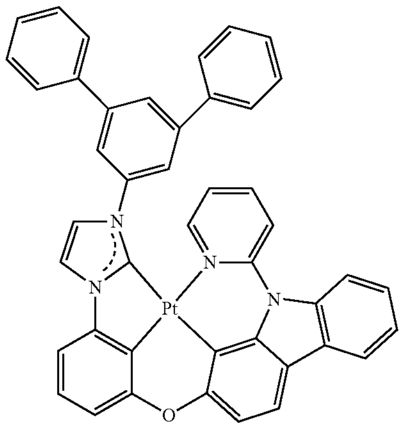
249
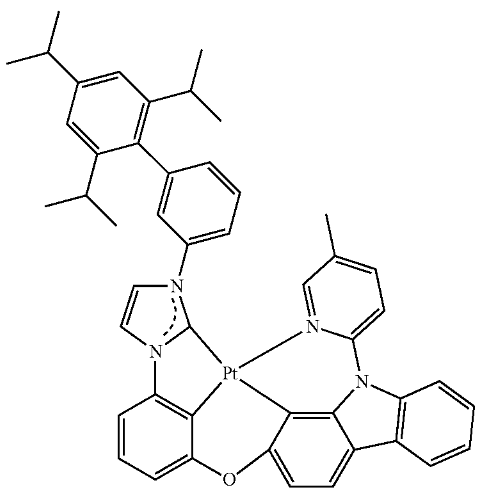
250
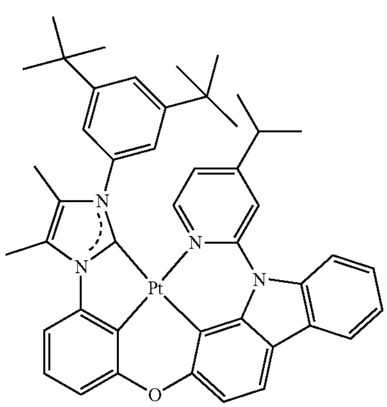
-continued
251
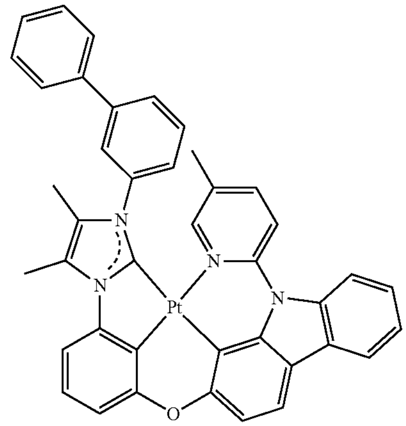
252
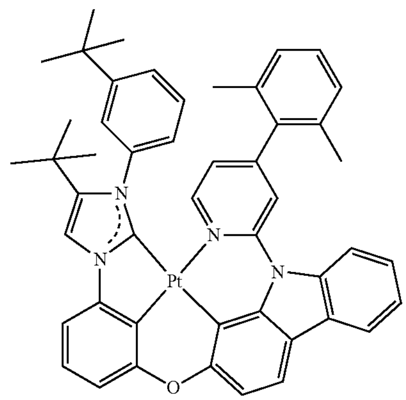
253
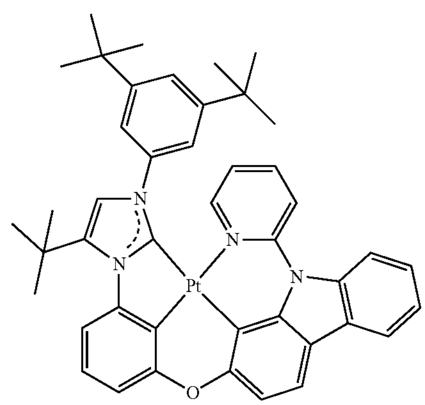
254
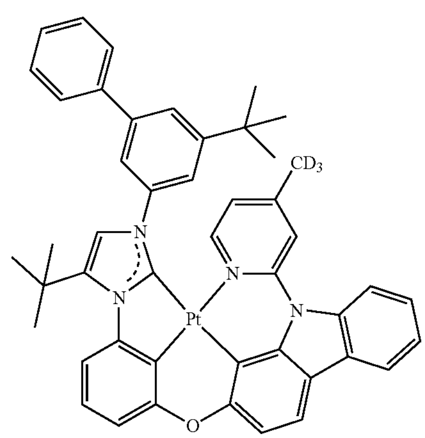

-continued
255
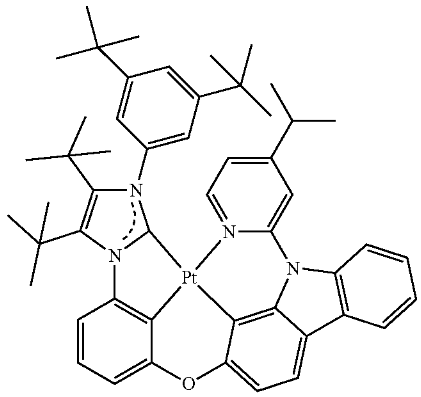
256
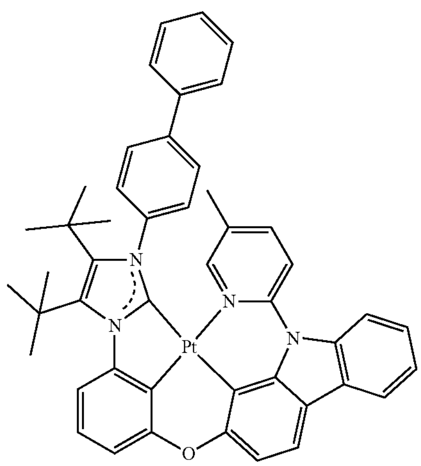
257
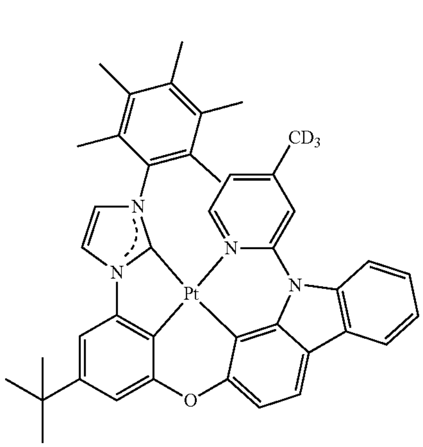
-continued
258
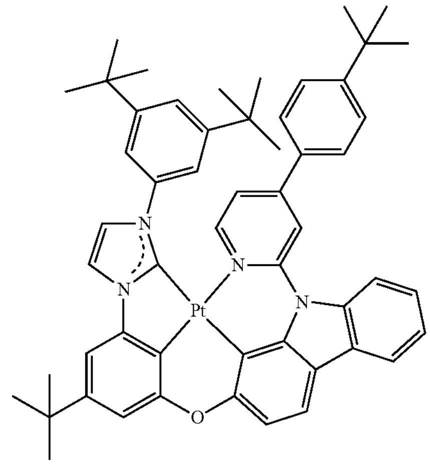
259
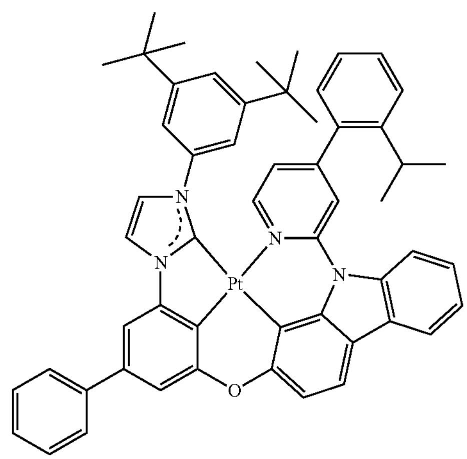
260
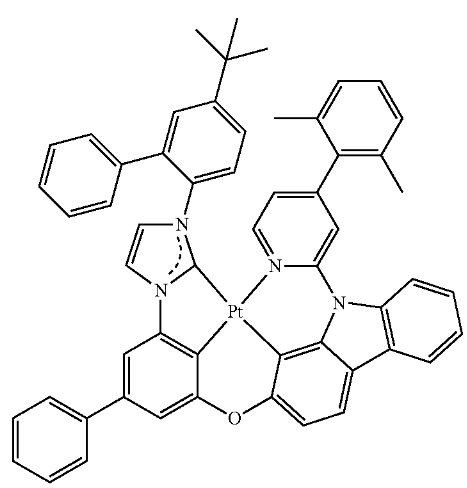

-continued
261
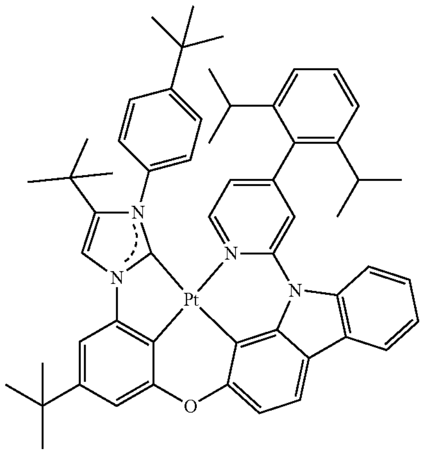
262
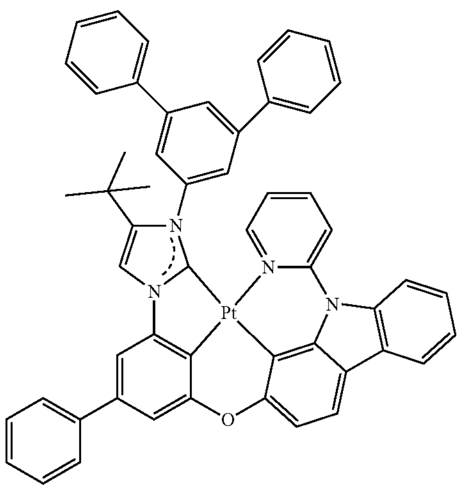
263
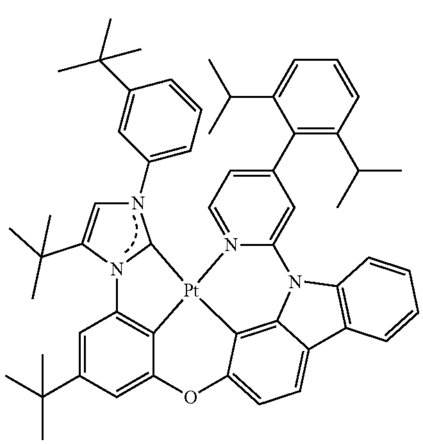
-continued
264
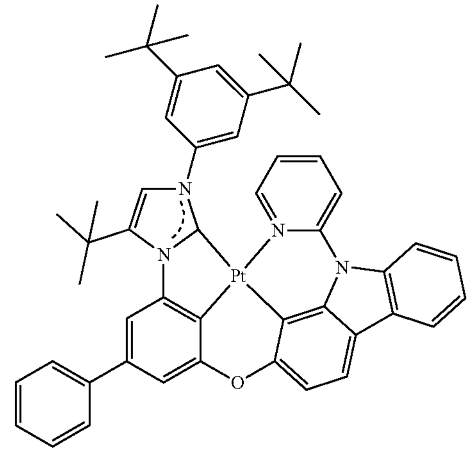
265
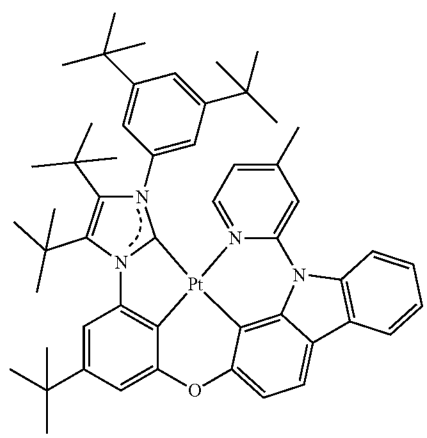
266
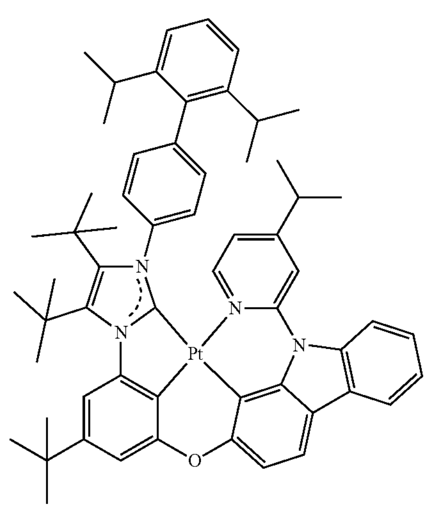

267
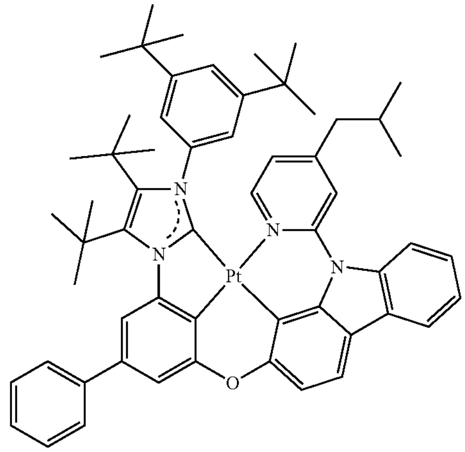
268
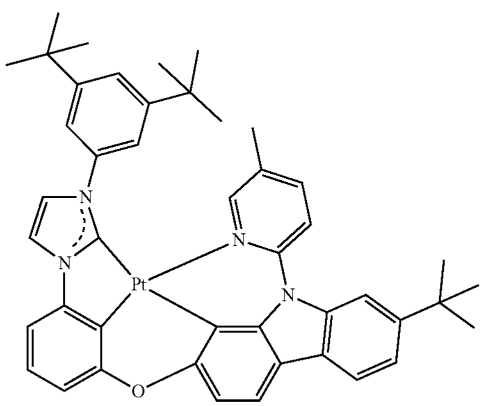
269
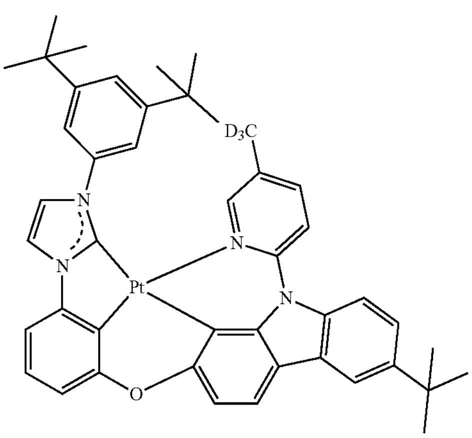
270
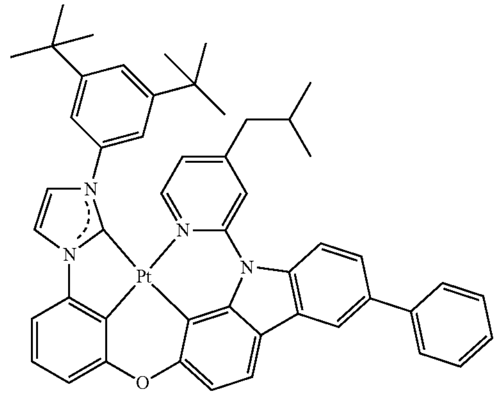
271
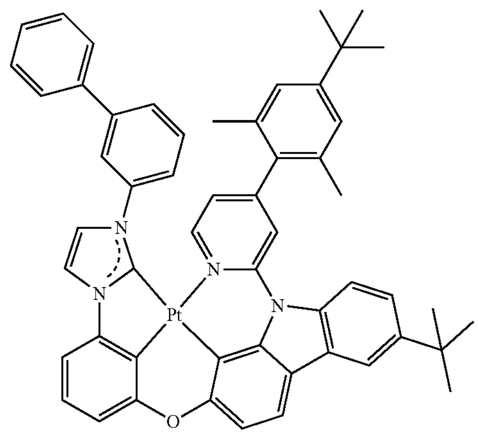
272
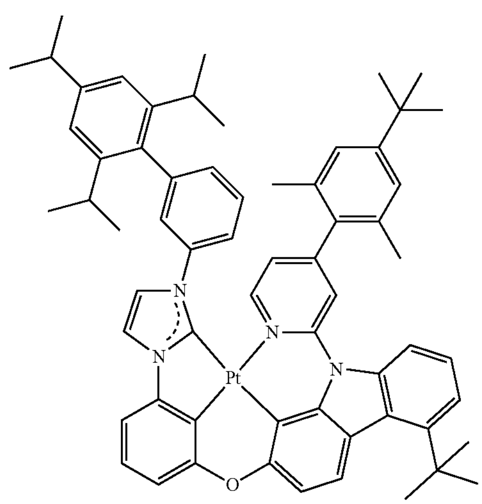

-continued
273
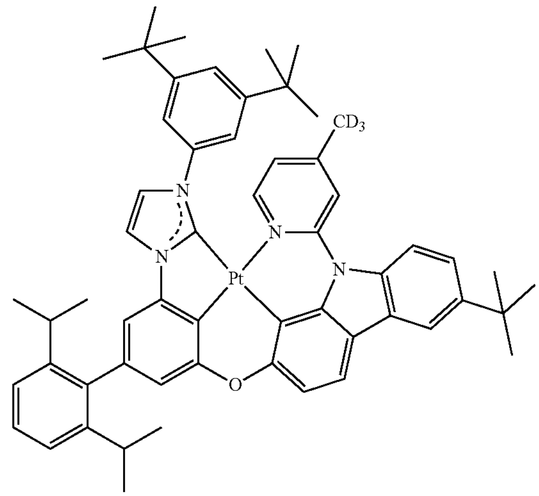
274
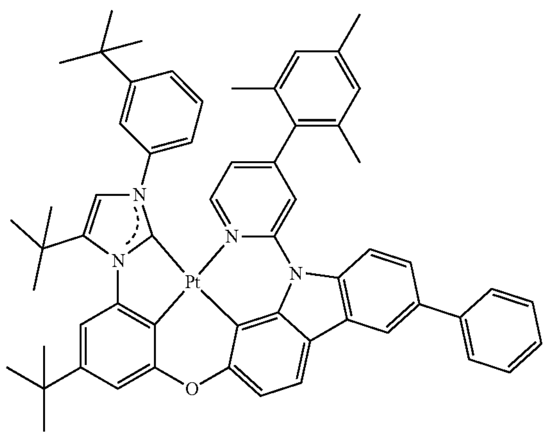
275
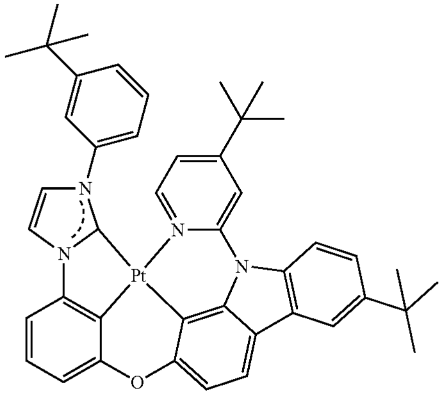
276
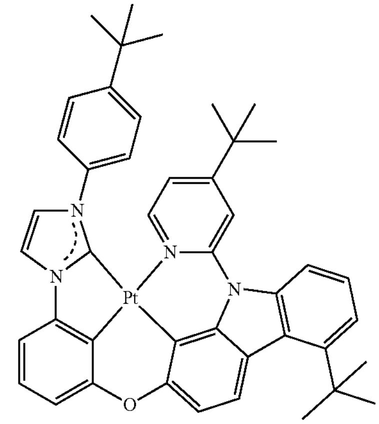
277
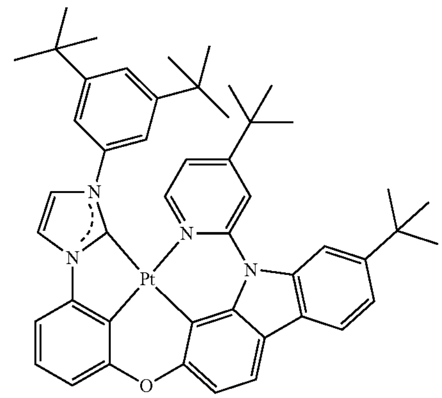
278
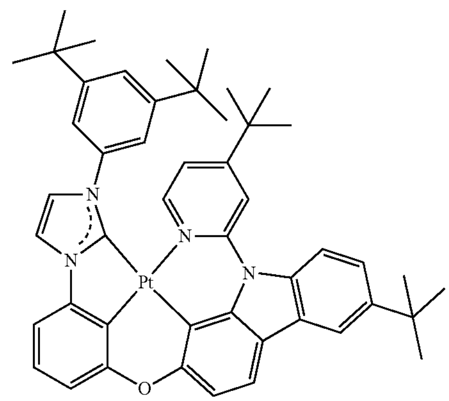
279
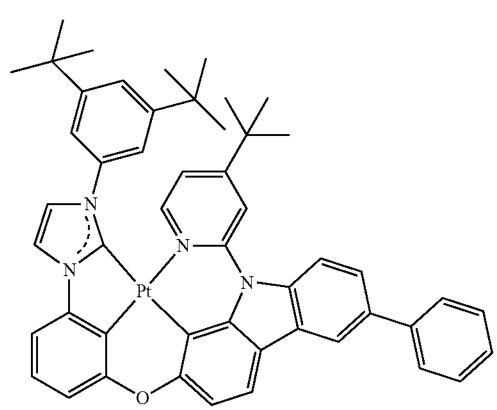

-continued
280
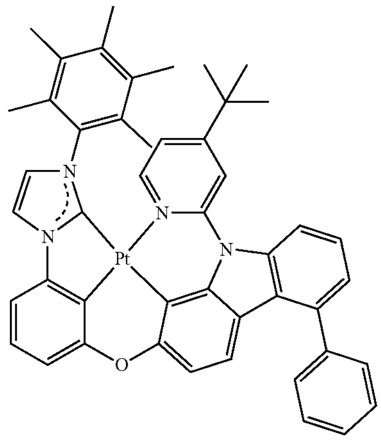
281
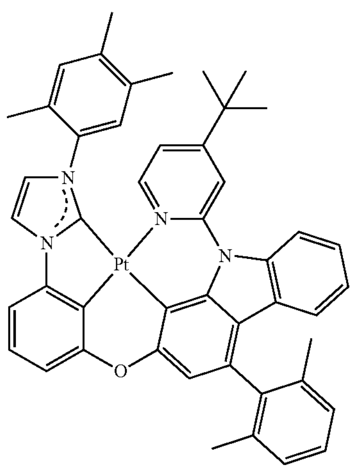
282
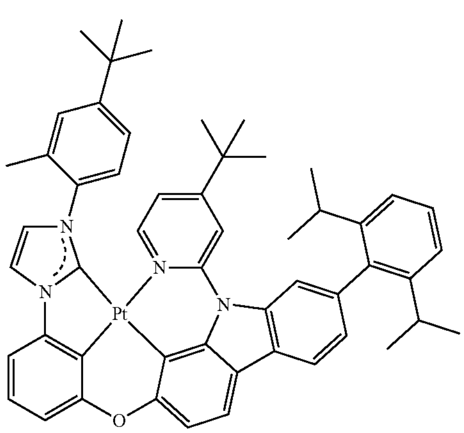
-continued
283
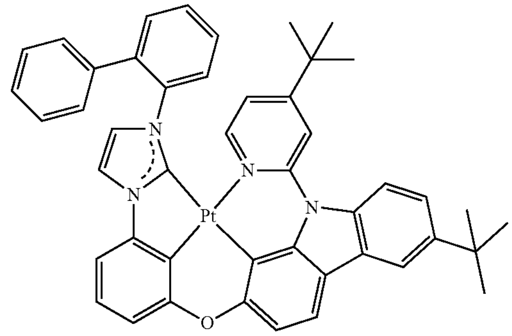
284
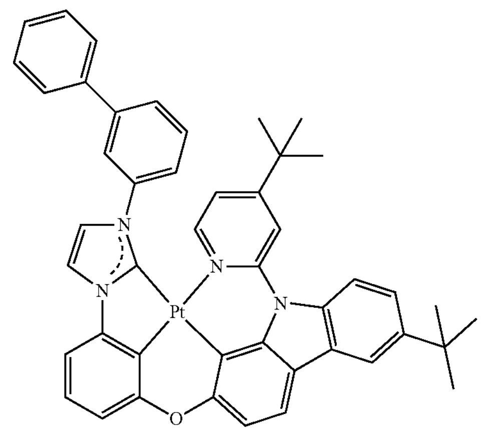
285
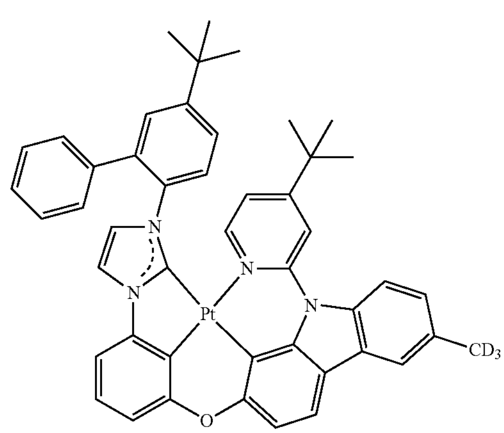

286
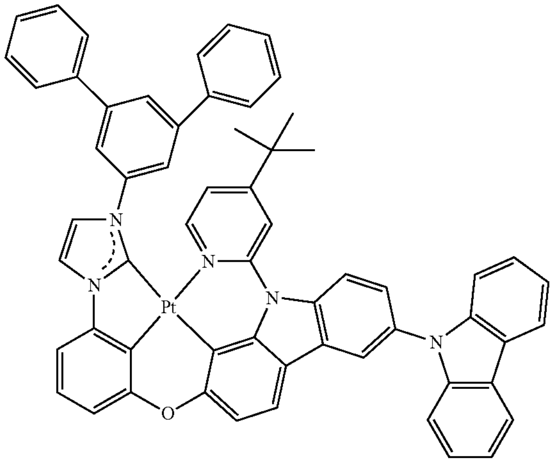
287
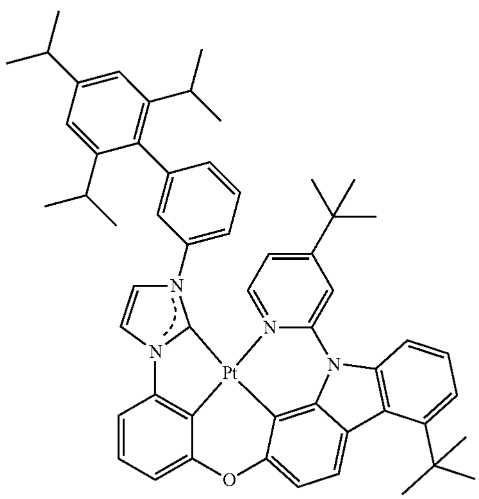
288
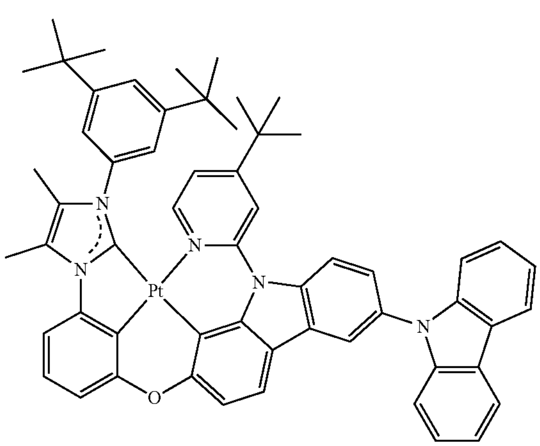
289
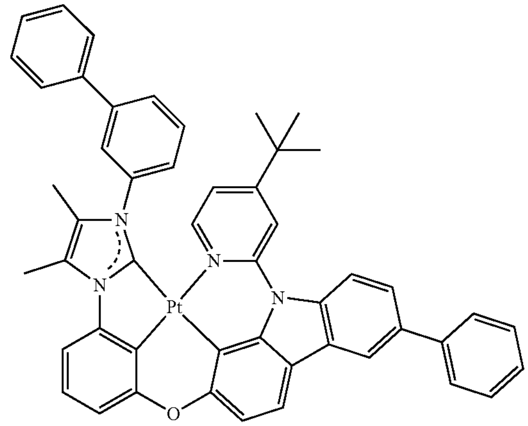
290
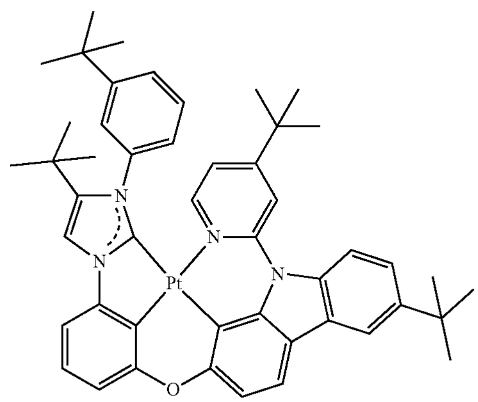
291
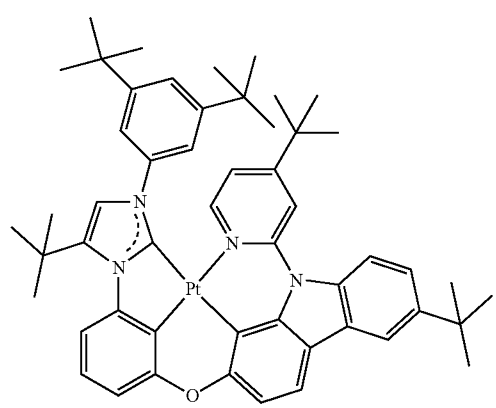

-continued
292
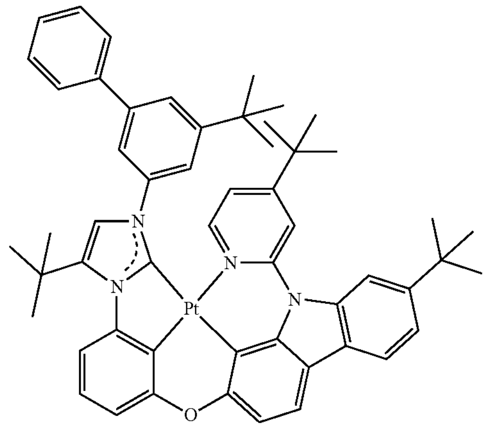
293
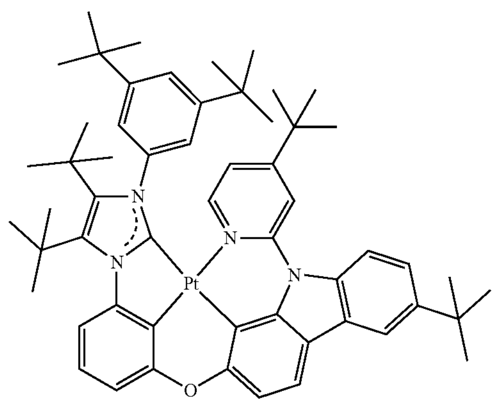
294
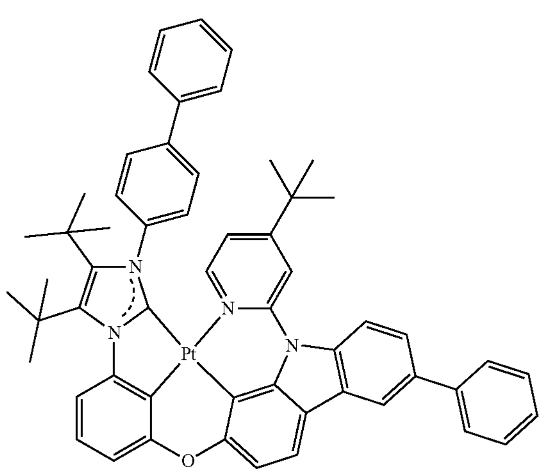
295
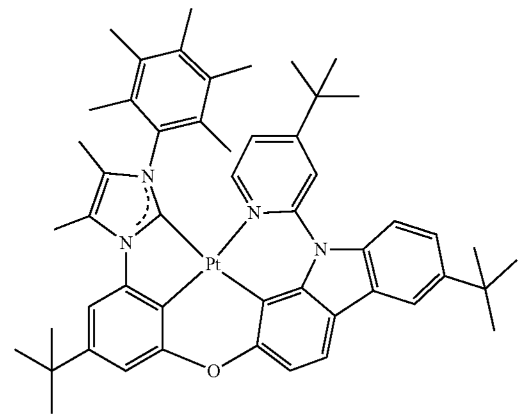
296
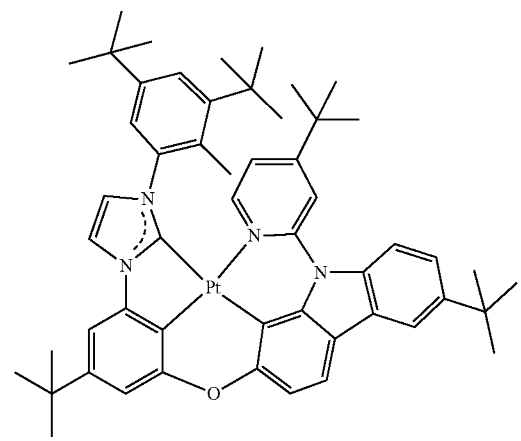
297
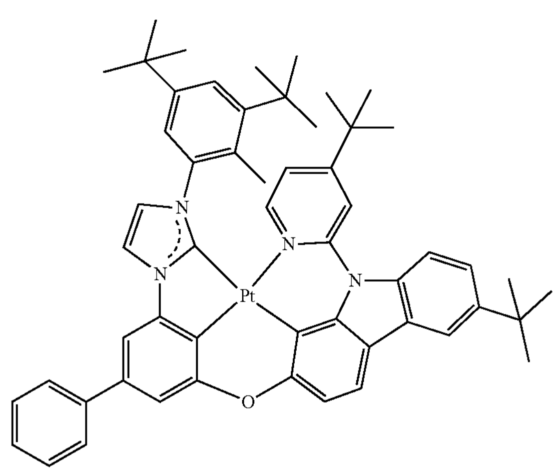

-continued
298
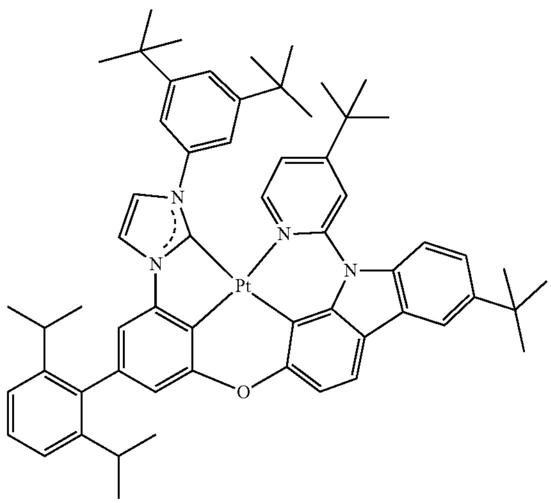
299
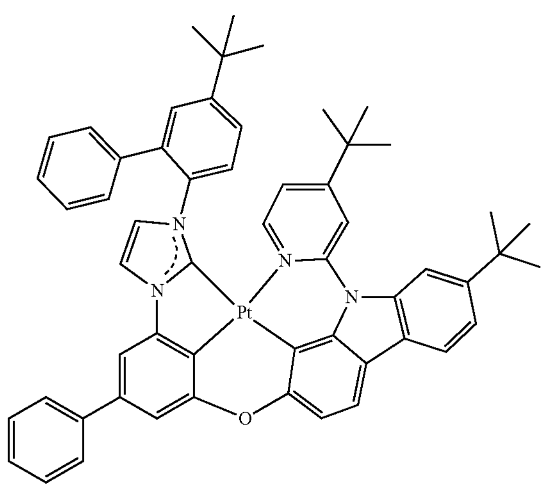
300
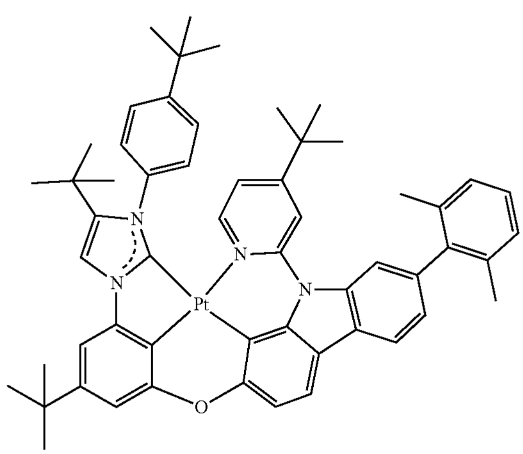
-continued
301
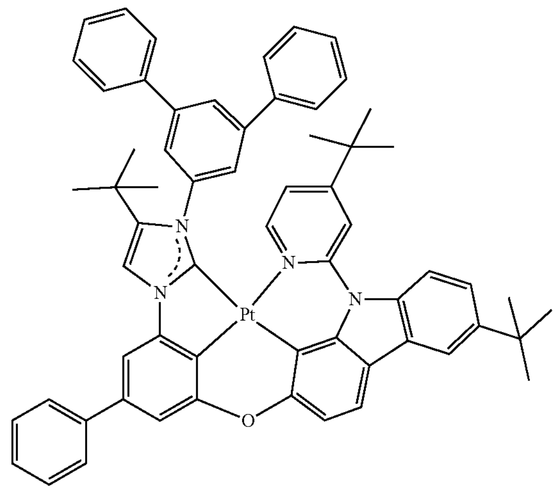
302
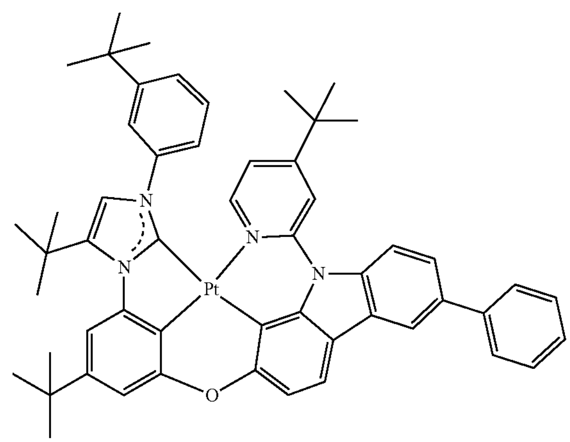
303
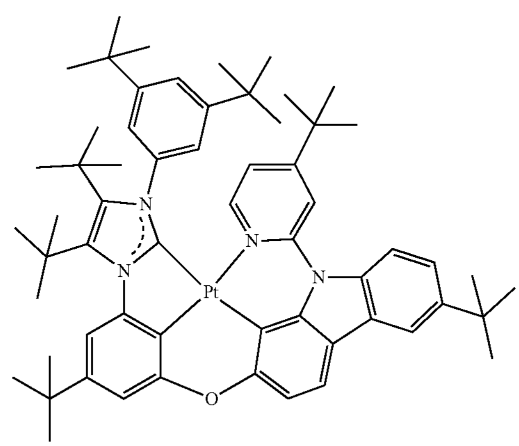

-continued
304
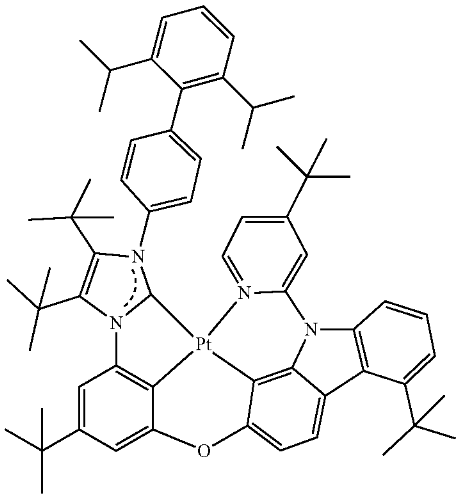
305
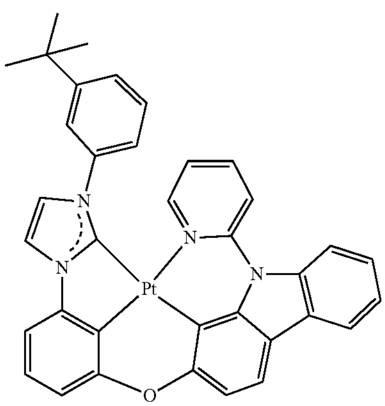
306
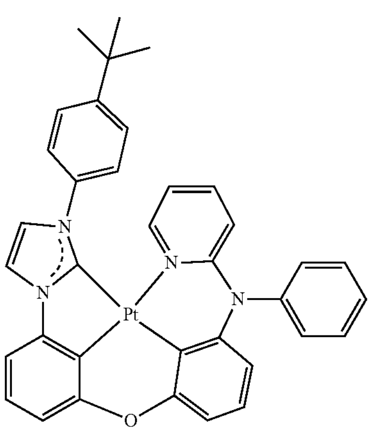
-continued
307
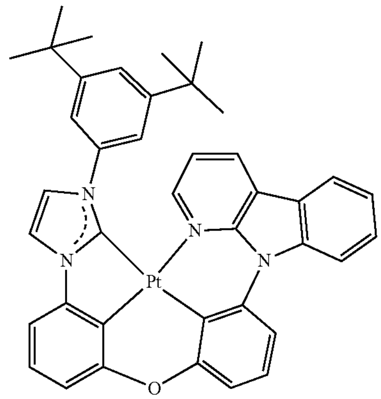
308
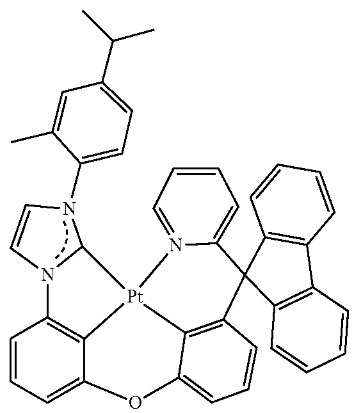
309
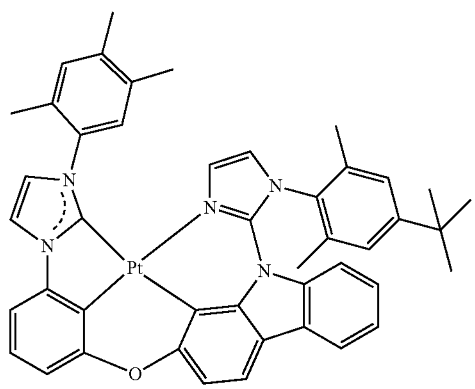
310
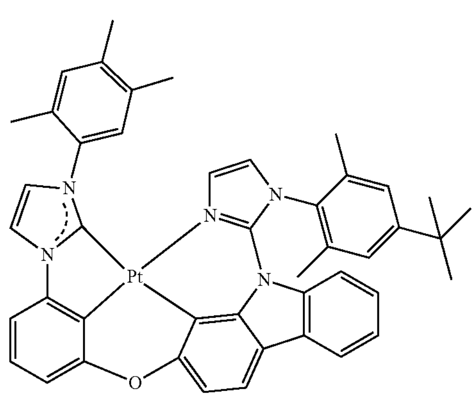

-continued
311
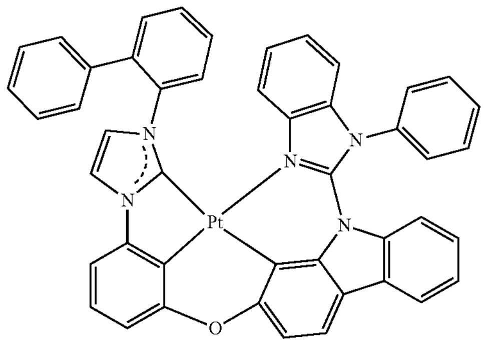
312
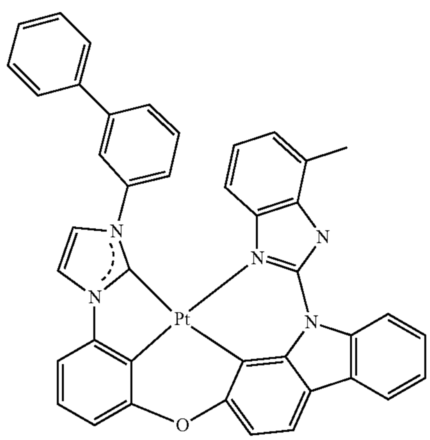
313
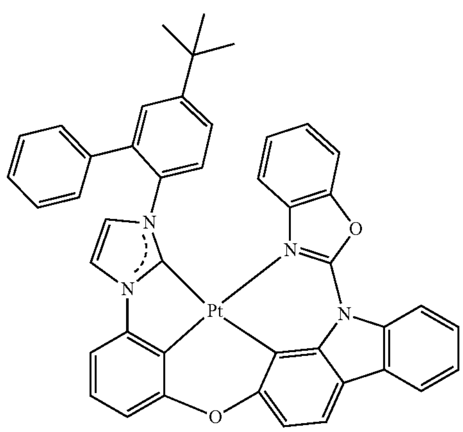
314
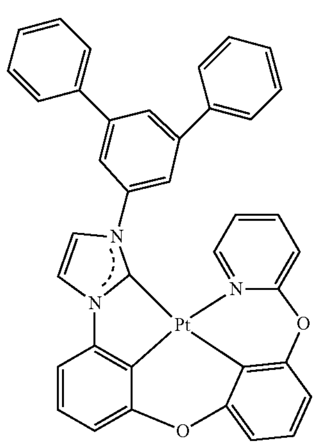
-continued
315
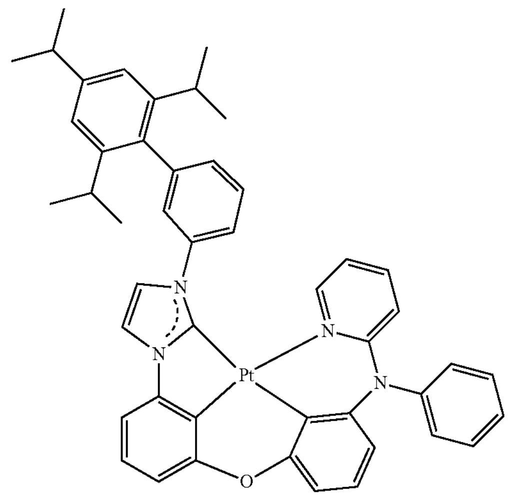
316
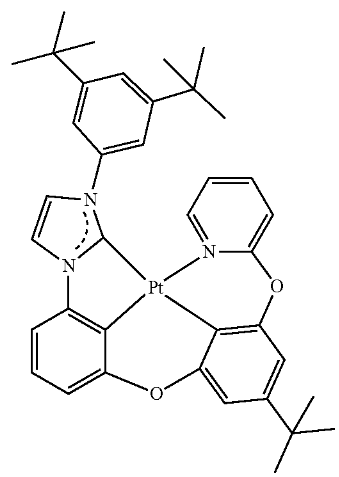
317
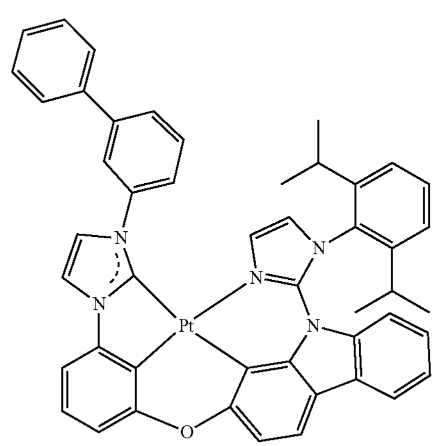

318
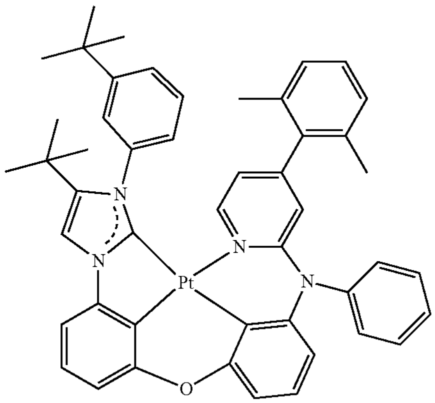
321
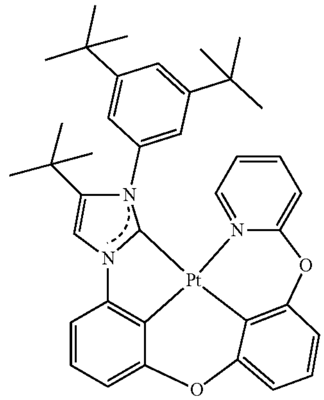
319
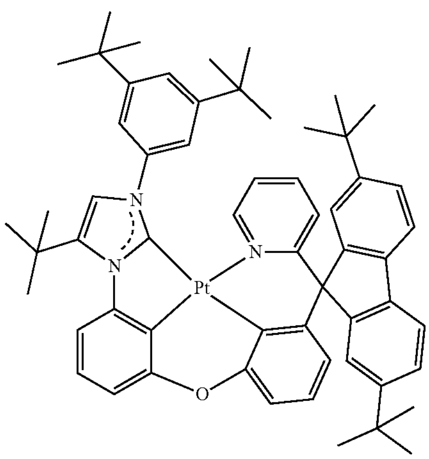
322
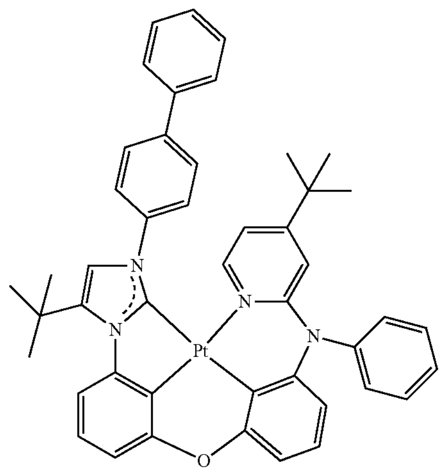
320
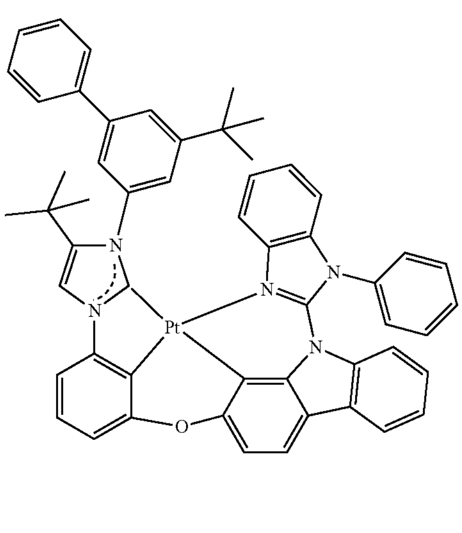
323
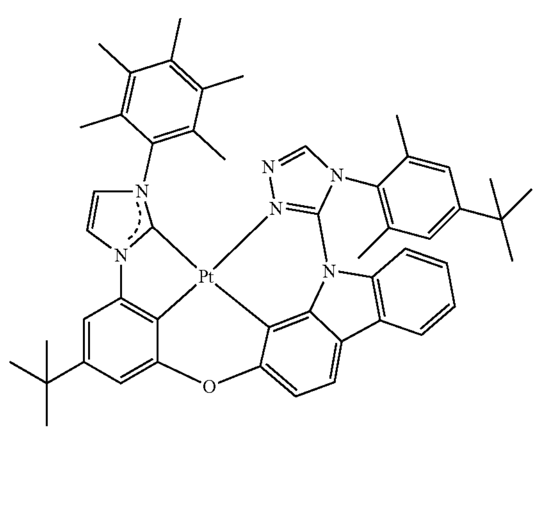

-continued
324
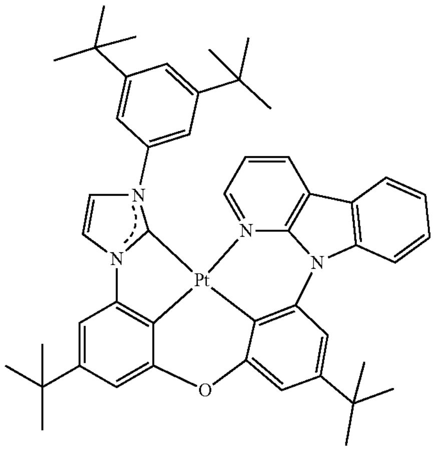
325
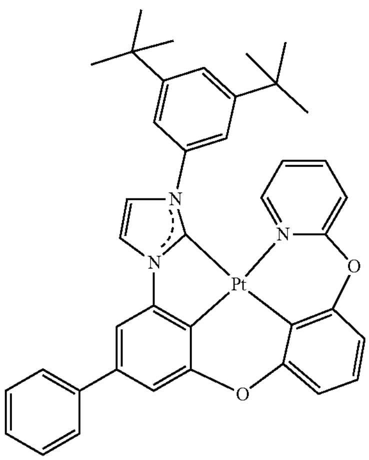
326
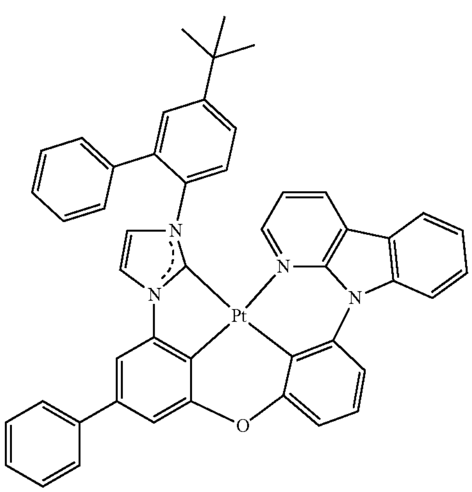
-continued
327
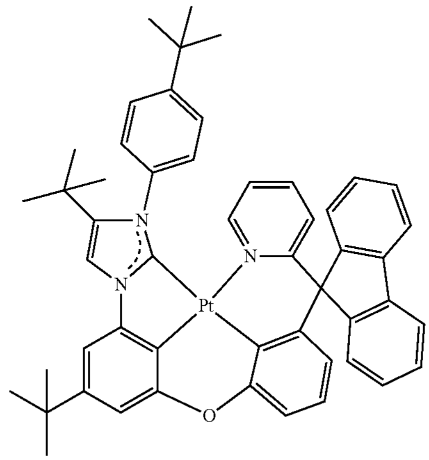
328
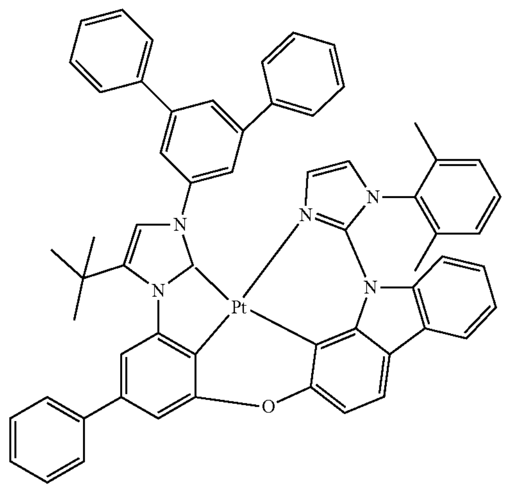
329
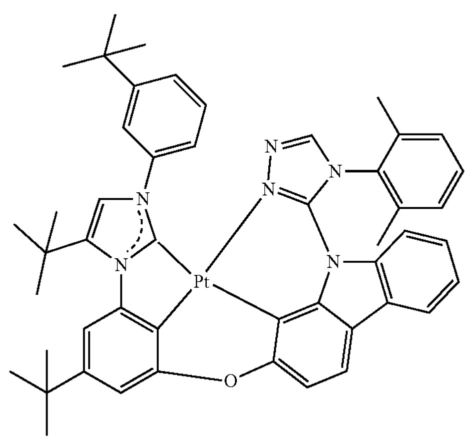

-continued
330
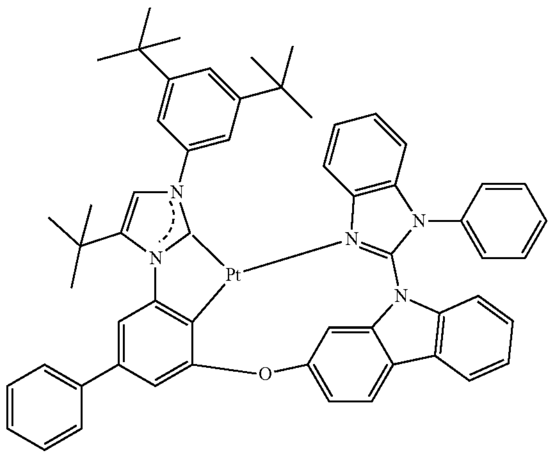
331
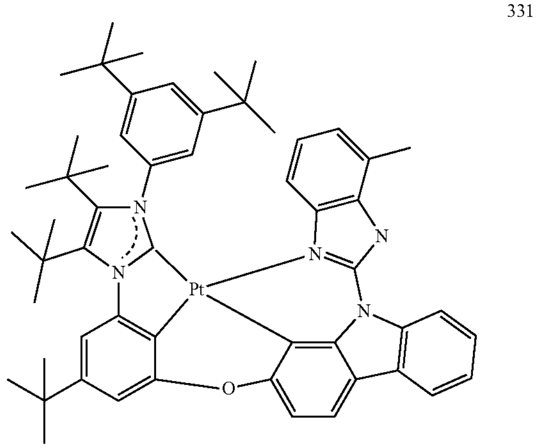
332
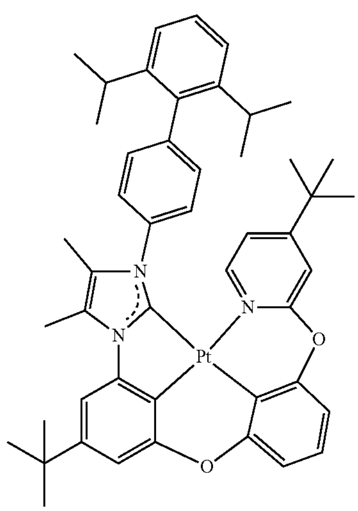
-continued
333
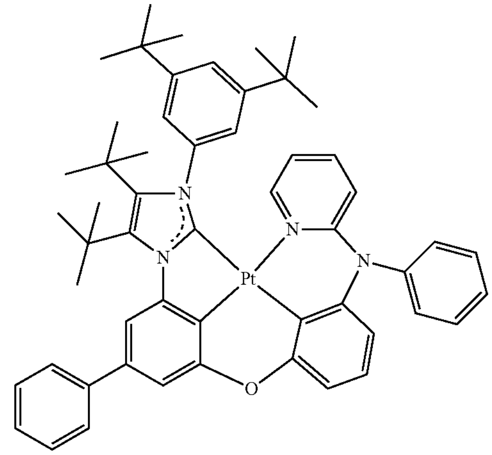
334
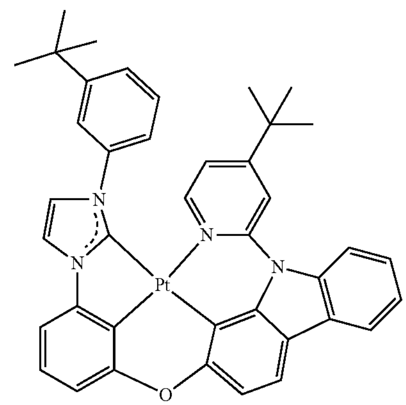
335
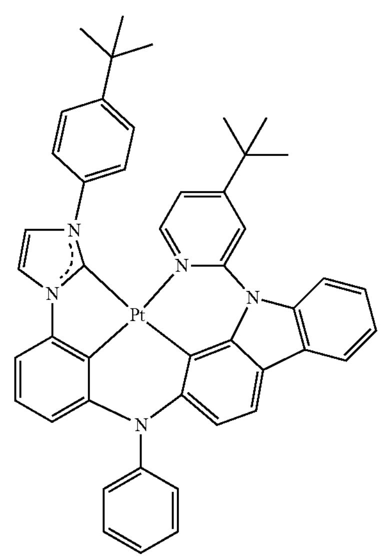

336
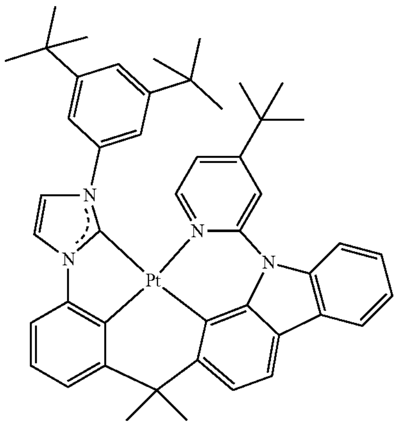
337
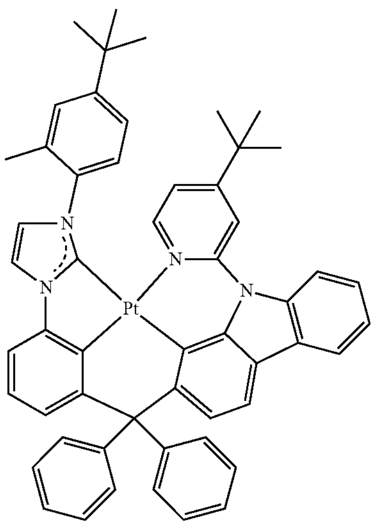
338
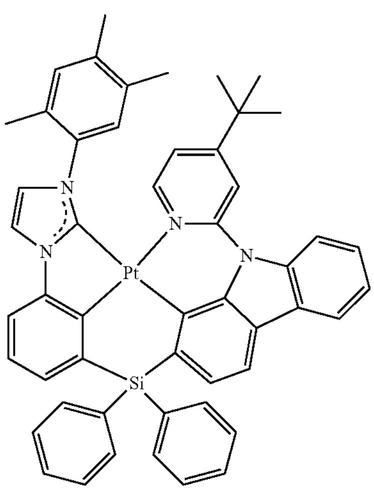
339
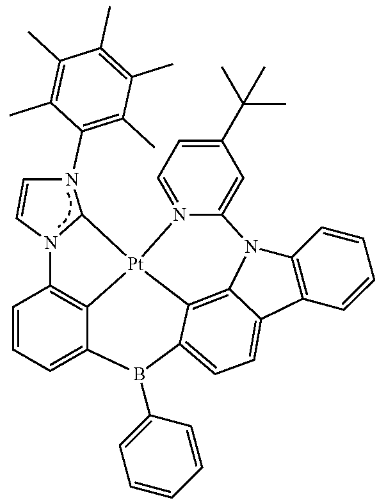
340
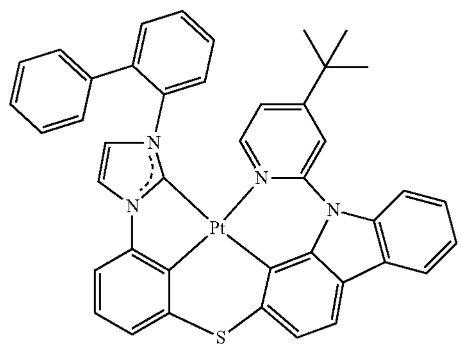
341
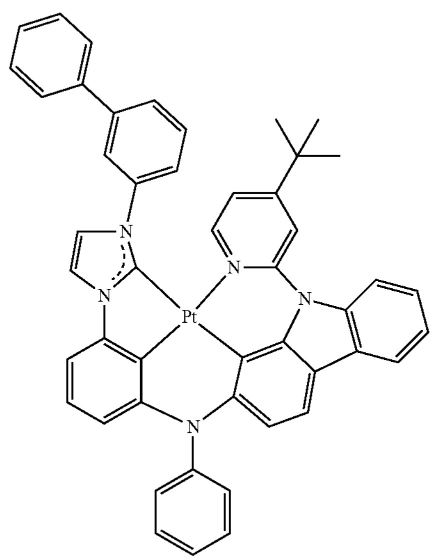

342
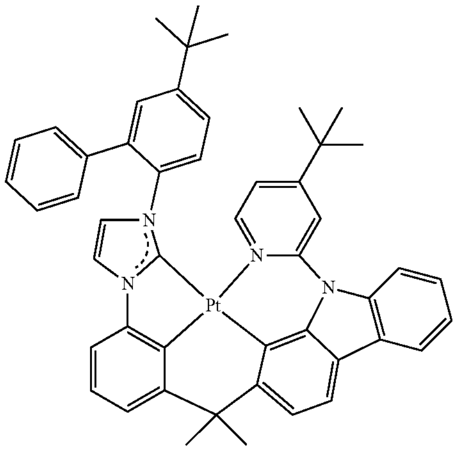
343
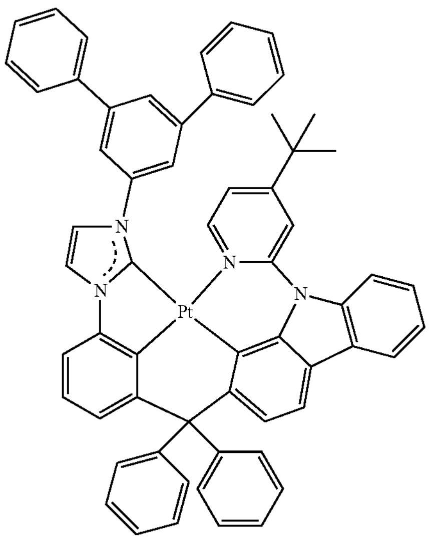
344
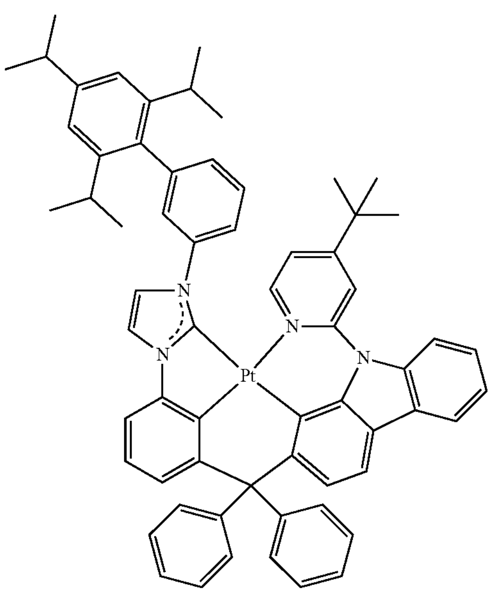
345
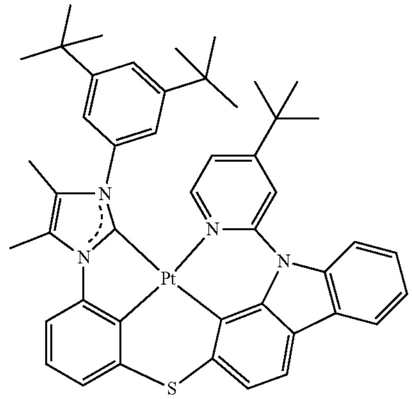
346
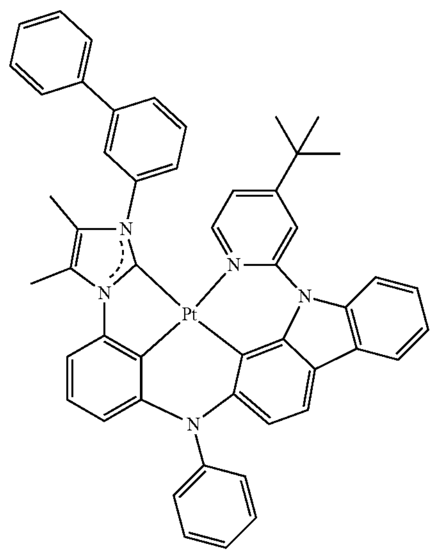
347
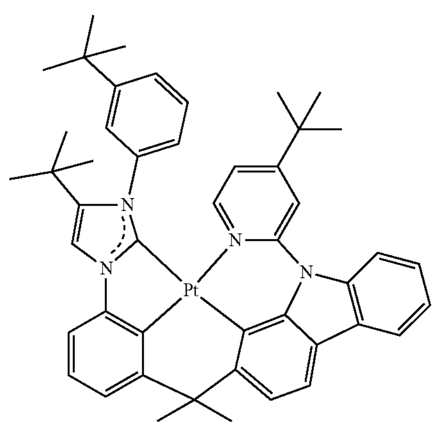

-continued
348
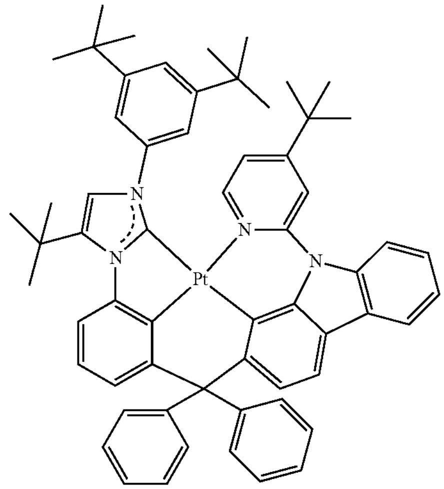
349
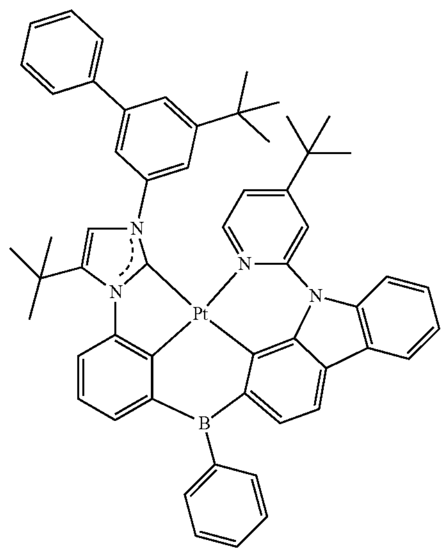
350
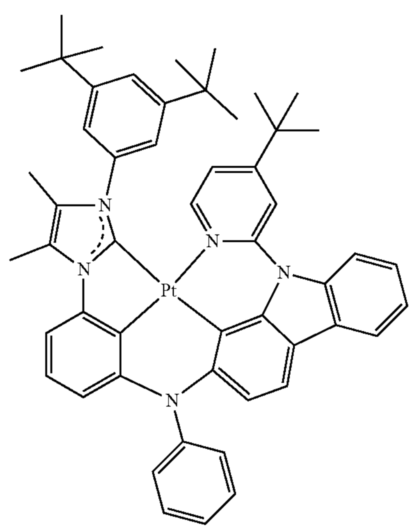
-continued
351
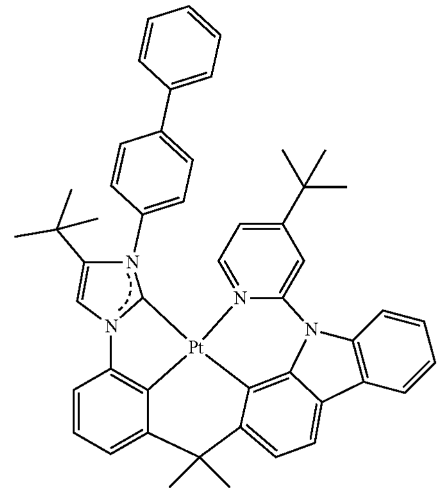
352
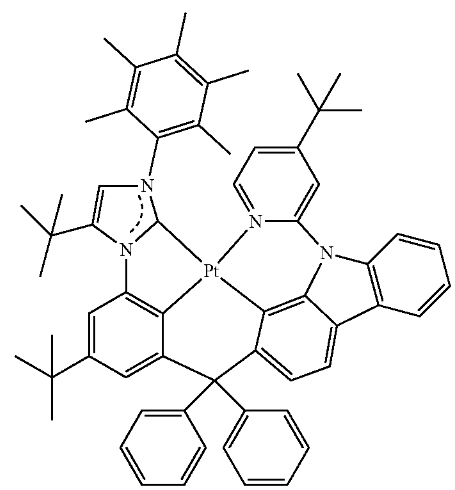
353
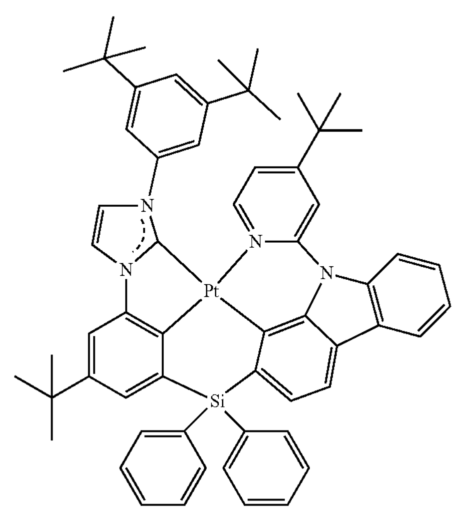

-continued
354
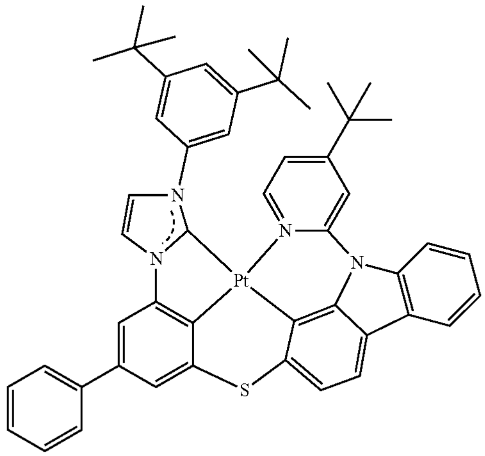
355
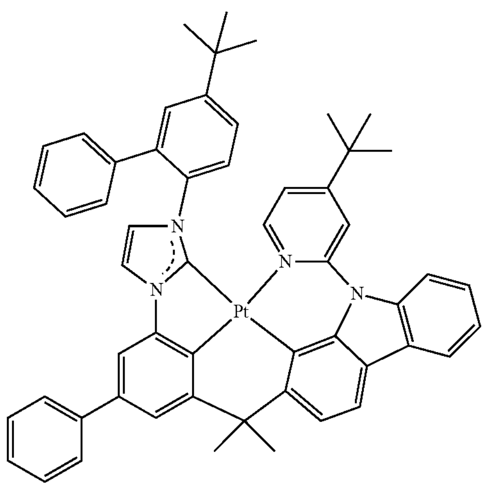
356
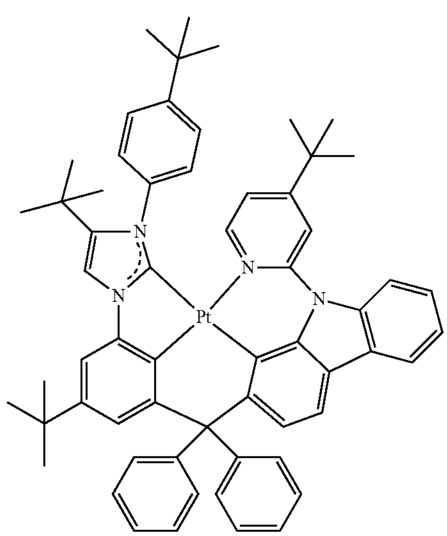
-continued
357
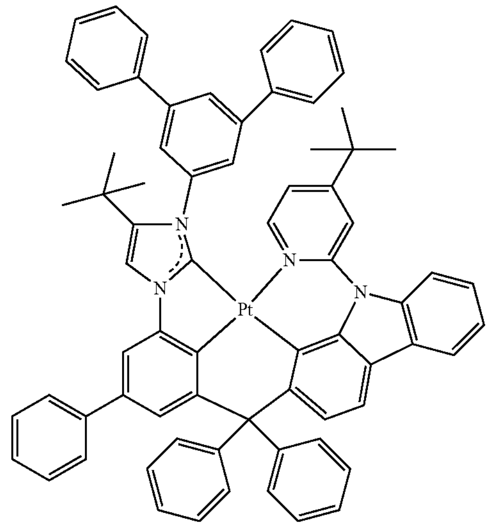
358
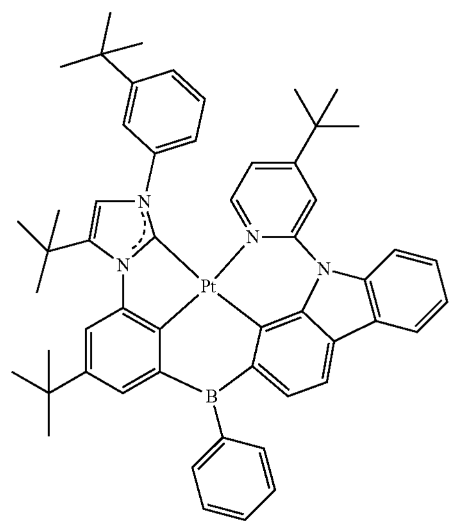
359
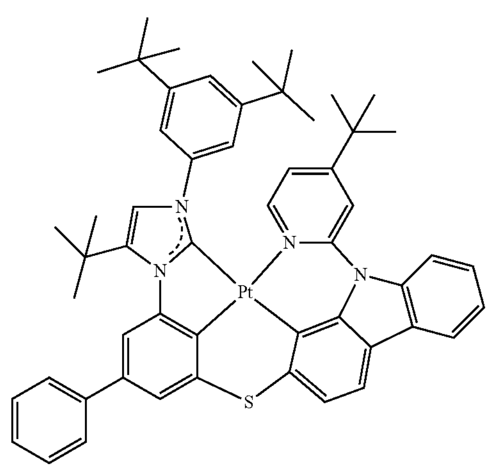

360
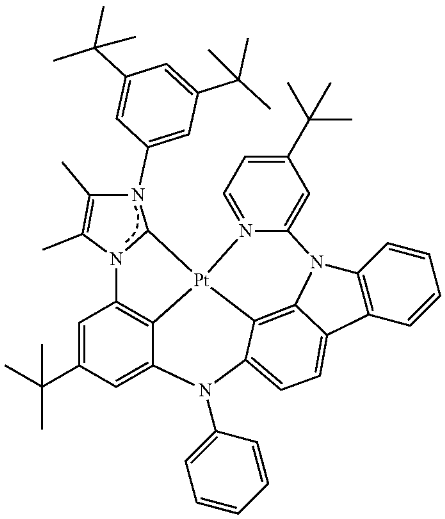
361
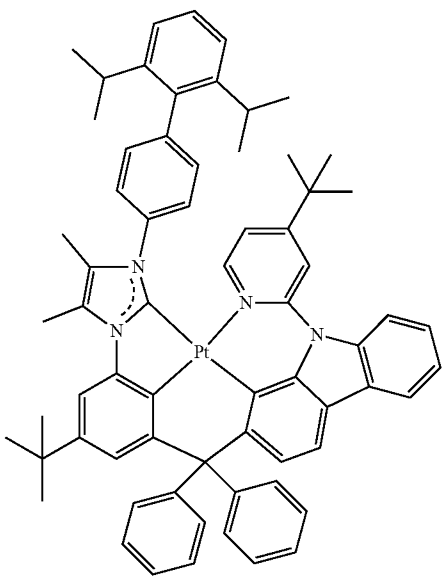
362
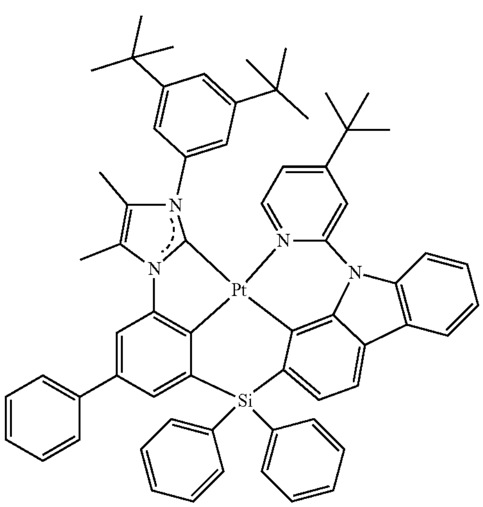
363
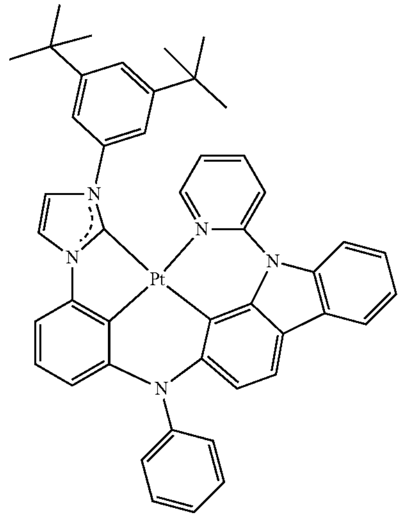
364
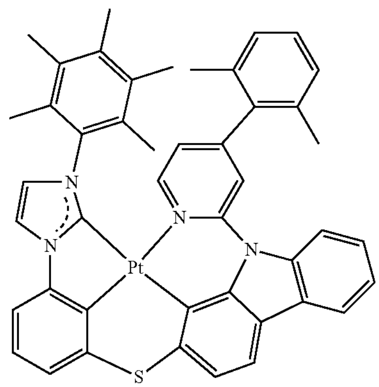
365
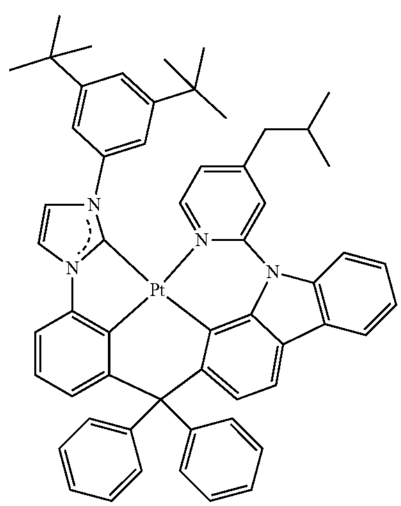

366
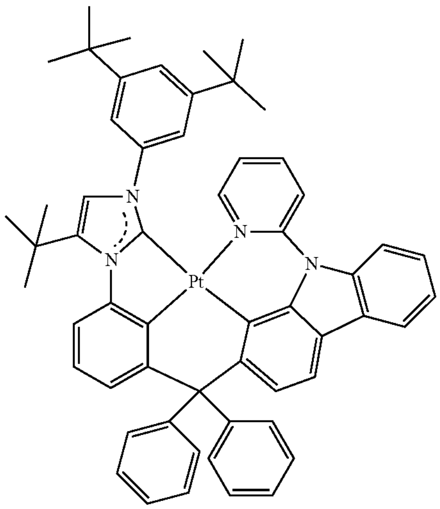
367
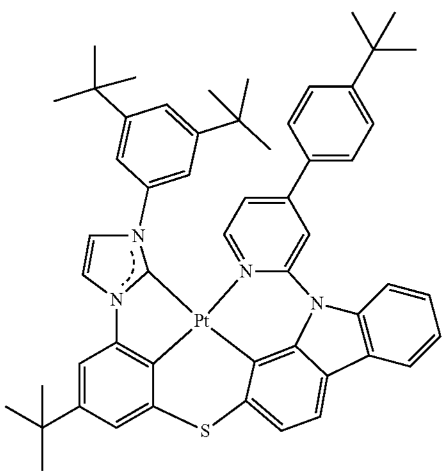
368
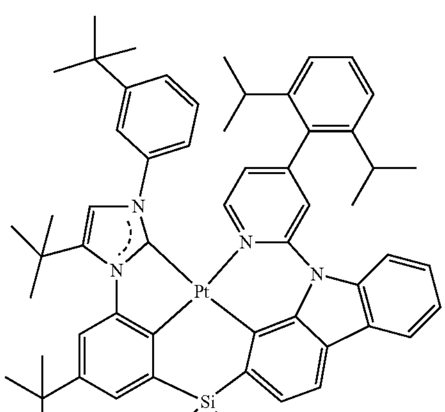
369
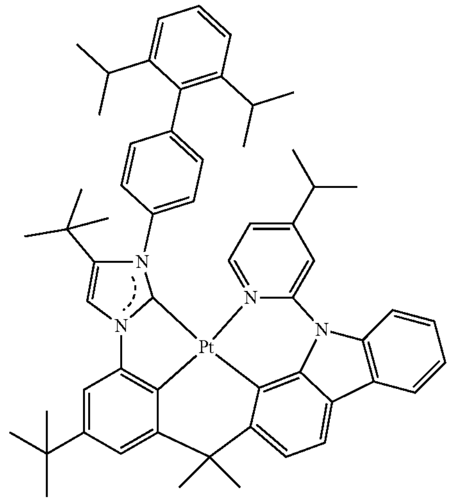
370
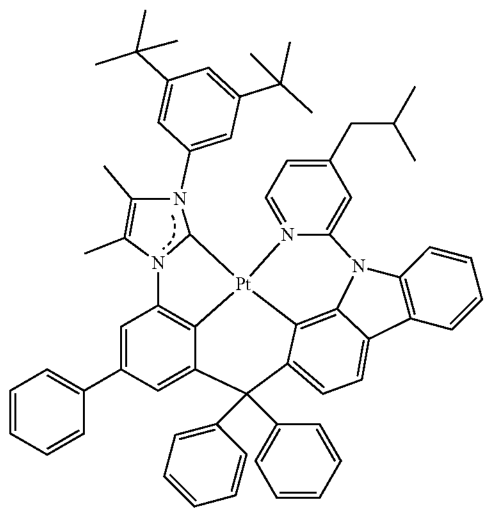
371
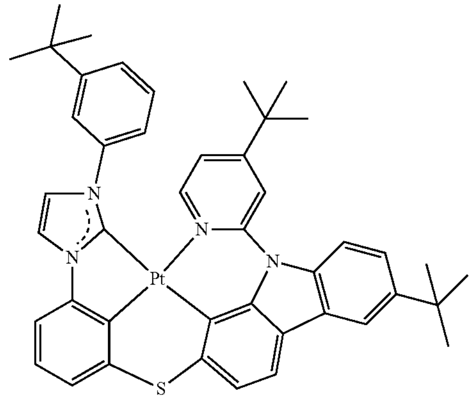

-continued
372
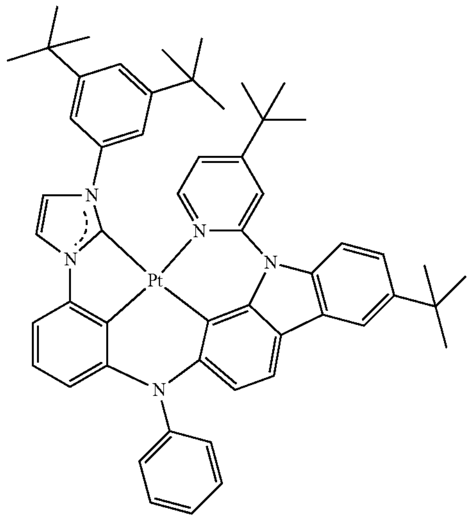
373
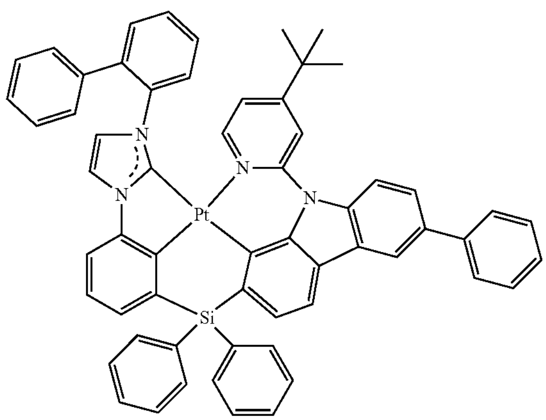
374
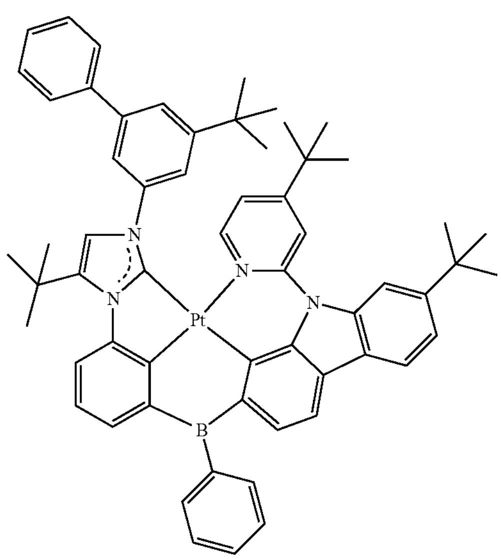
-continued
375
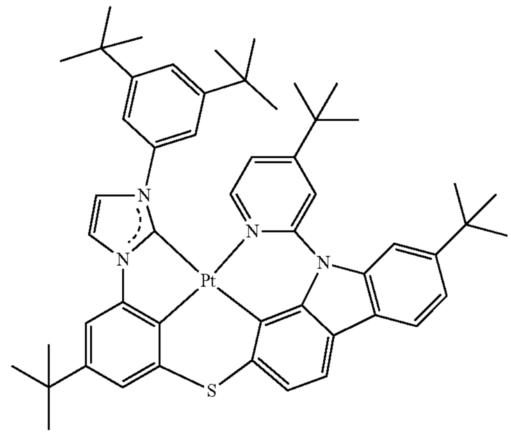
376
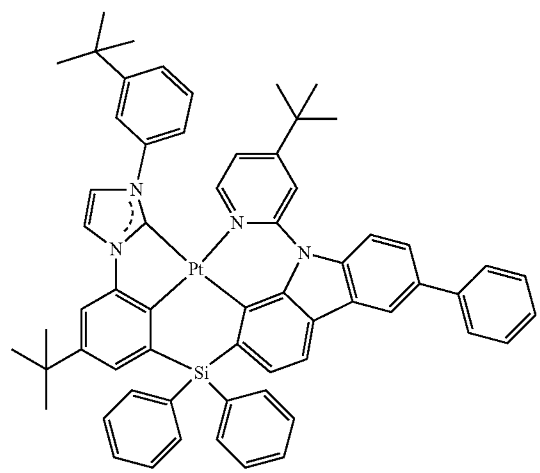
377
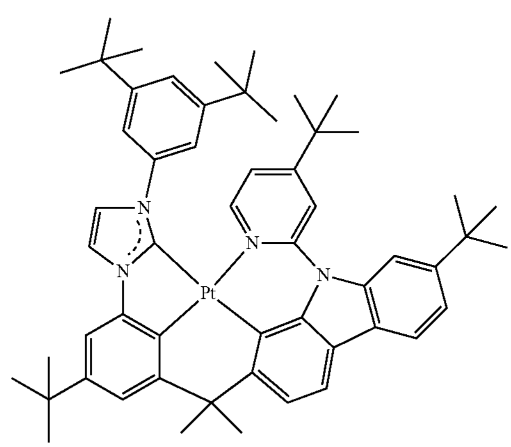

-continued
378
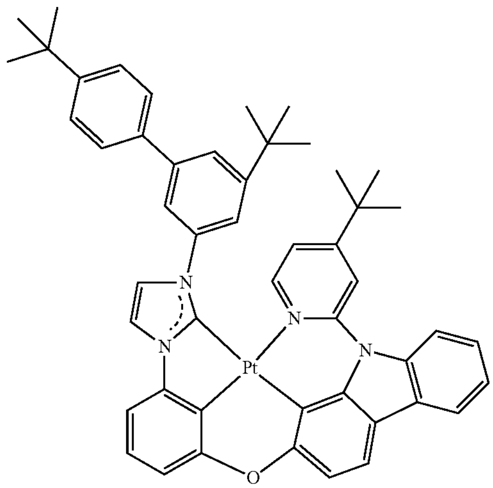
379
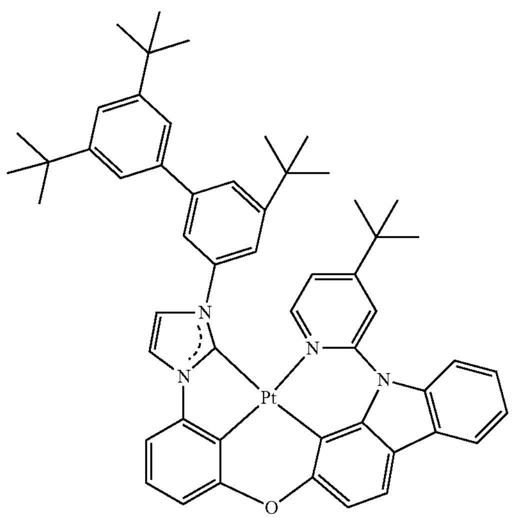
380
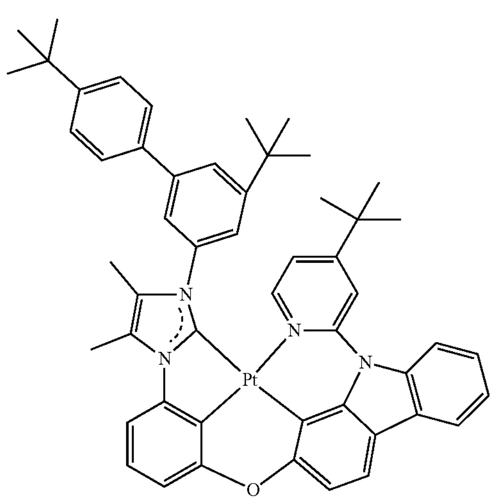
-continued
381
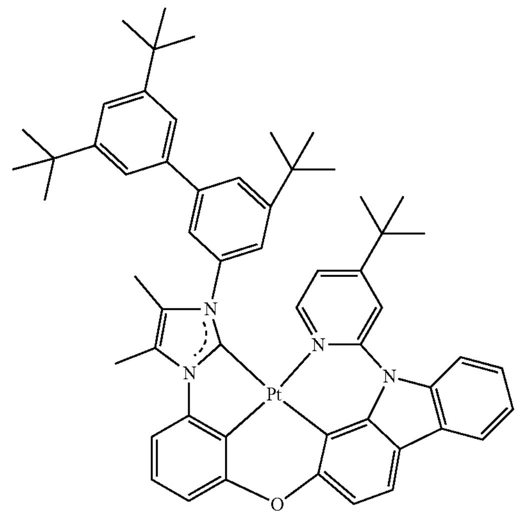
382
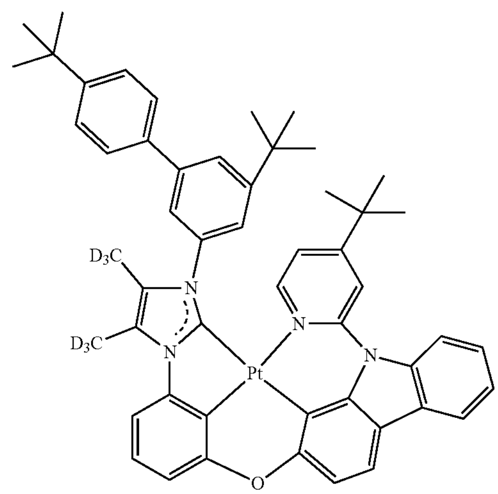
383
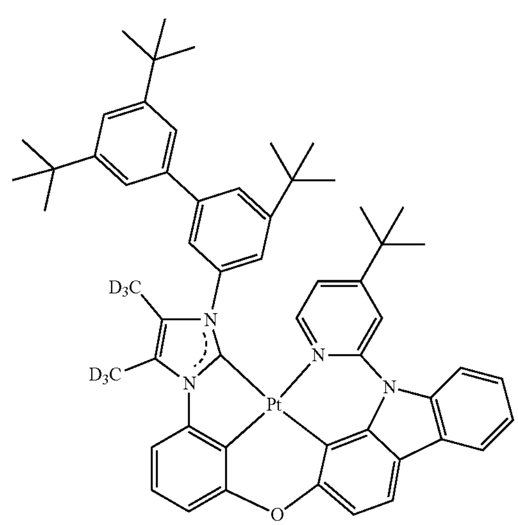

-continued
384
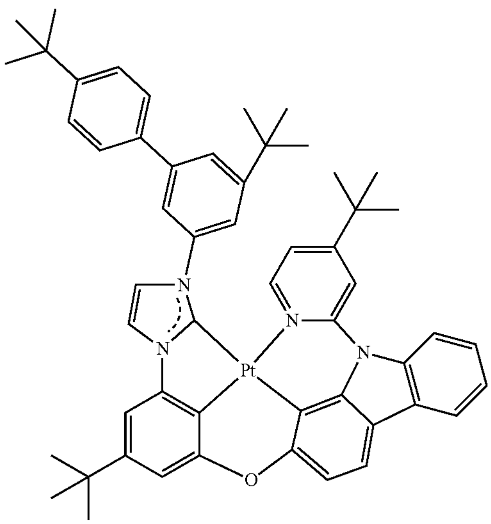
385
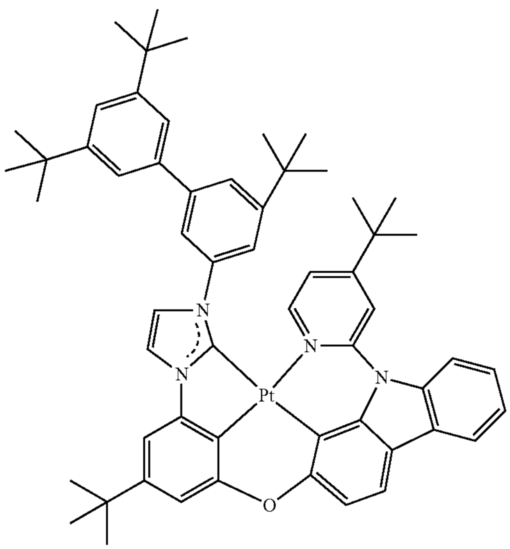
386
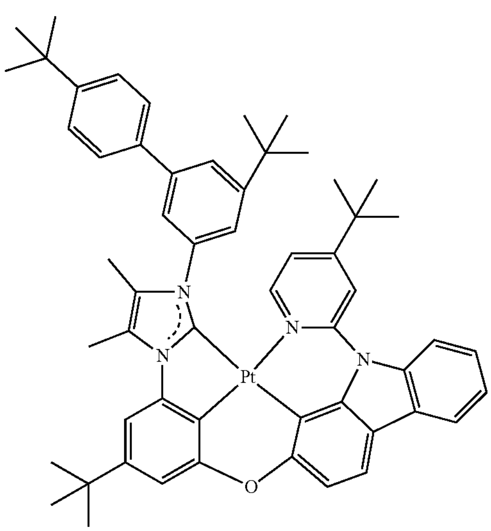
-continued
387
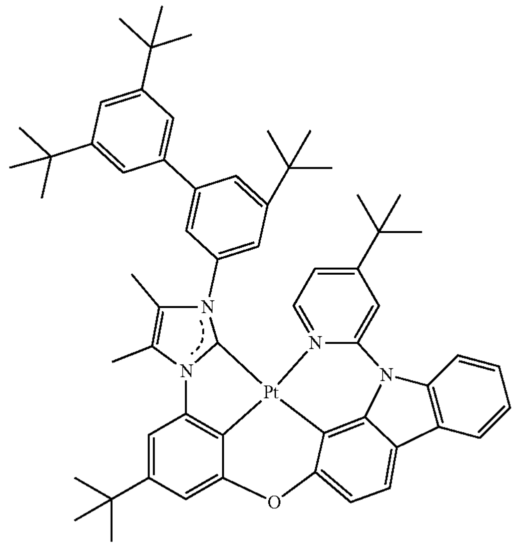
388
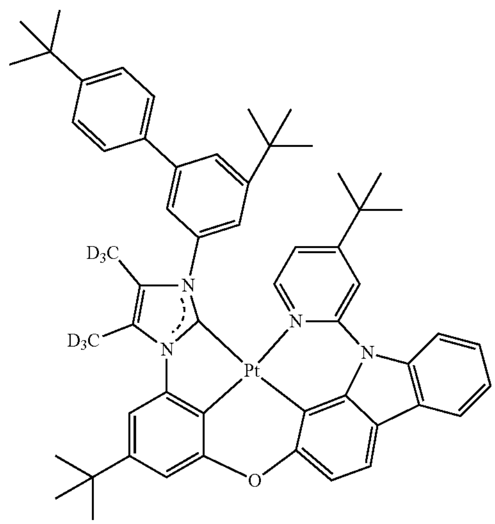
389
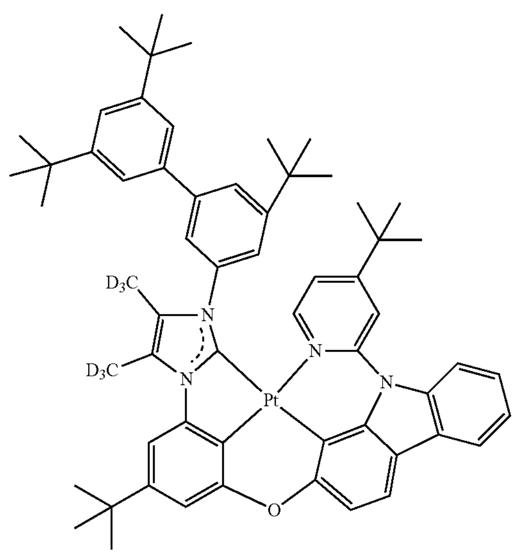

390
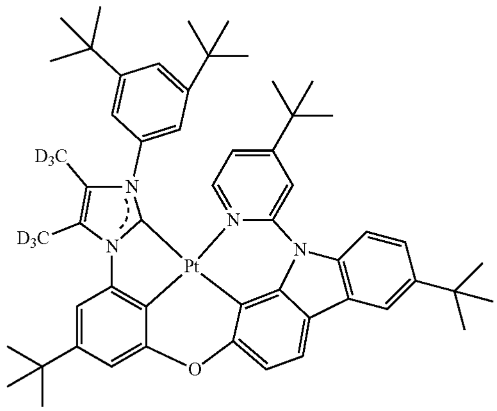
391
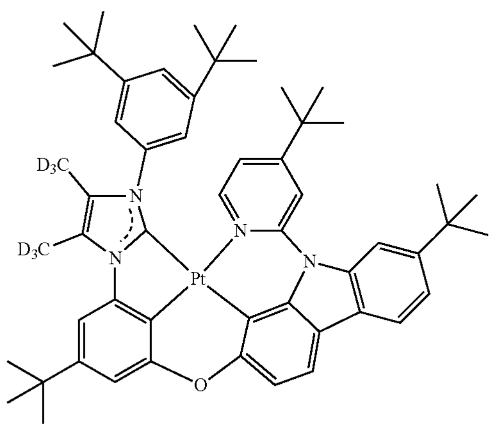
392
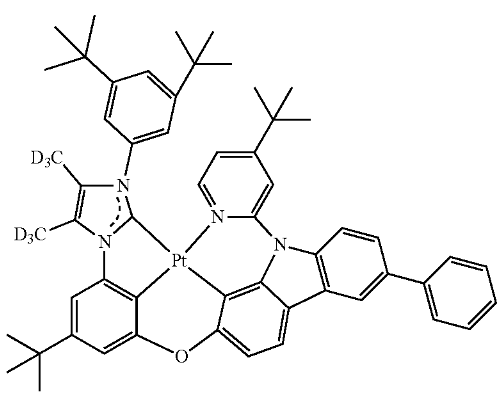
393
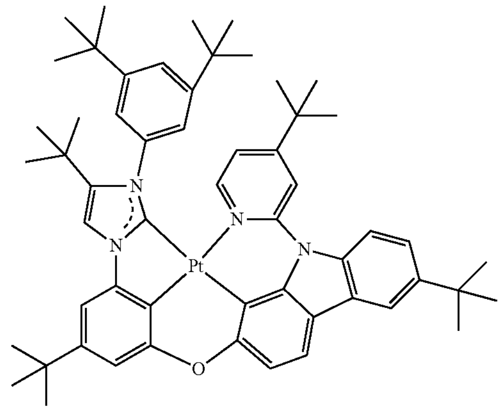
394
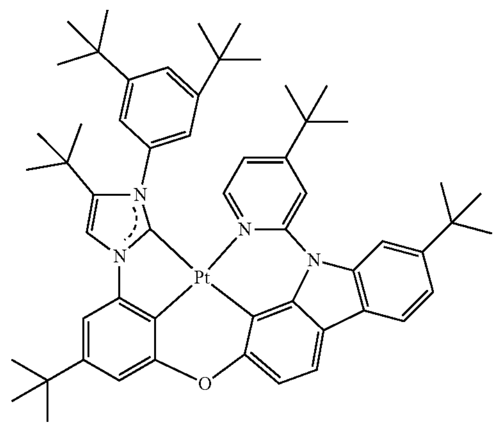
395
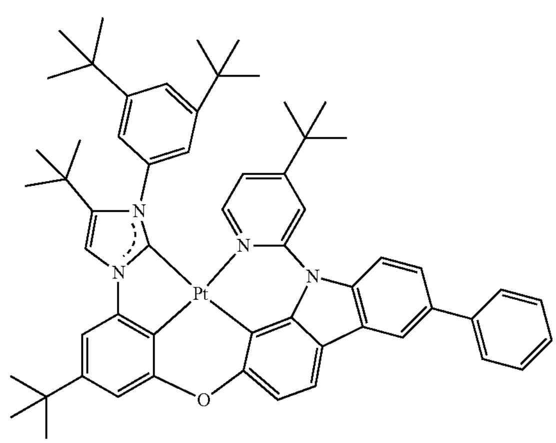

-continued
396
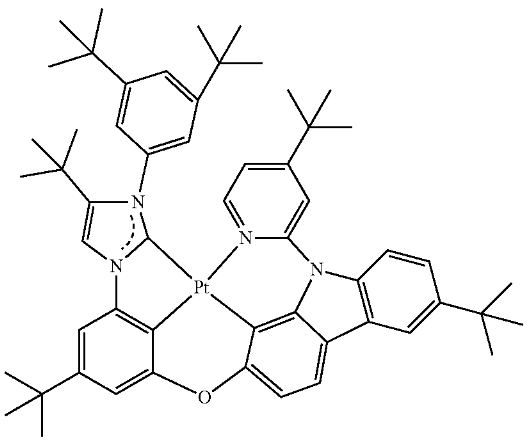
397
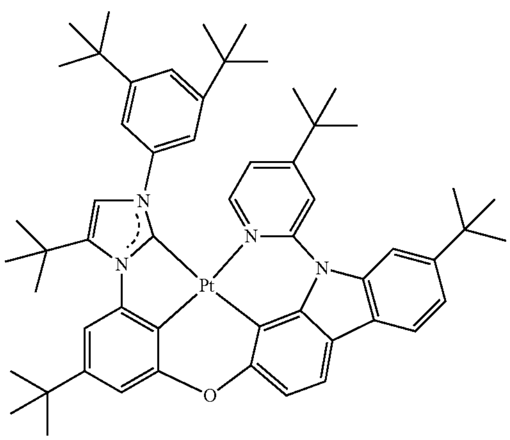
398
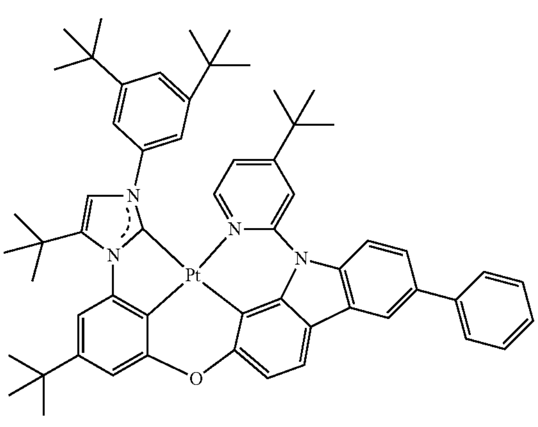
-continued
399
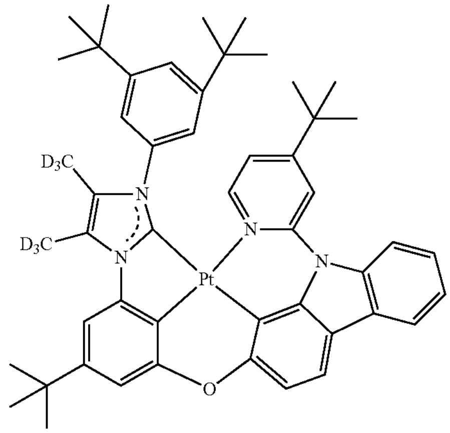
400
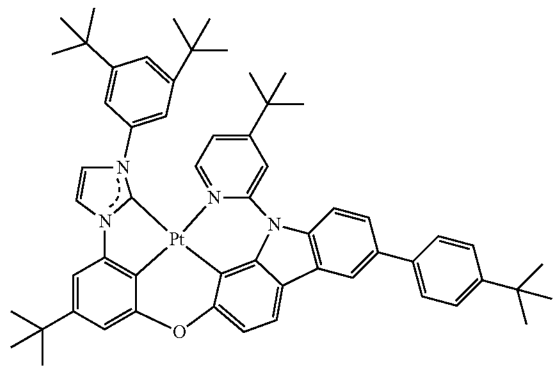
401
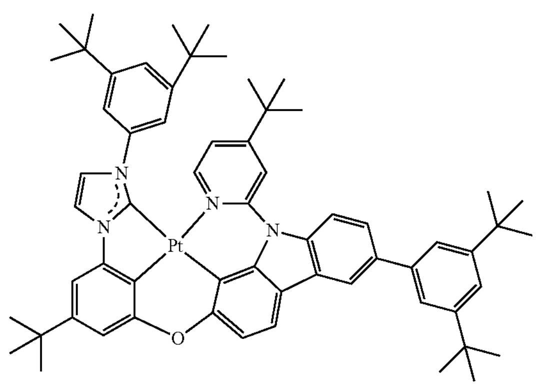
402
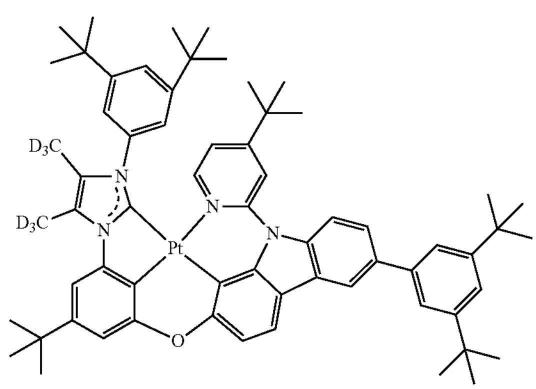

-continued
403
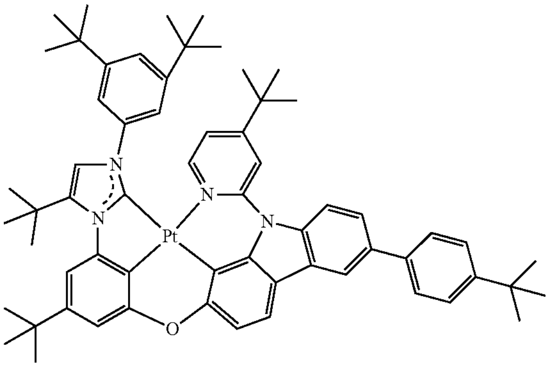
404
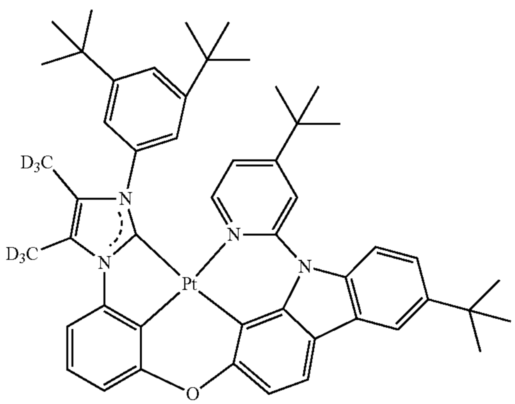
405
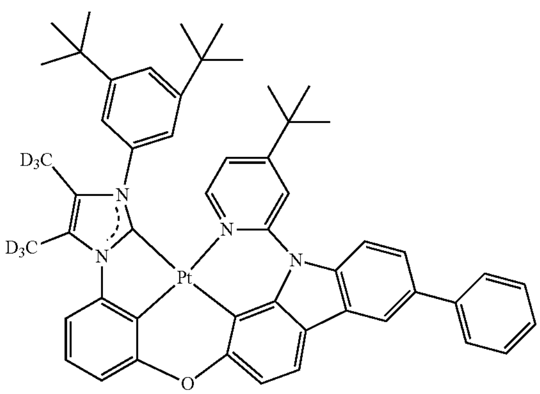
406
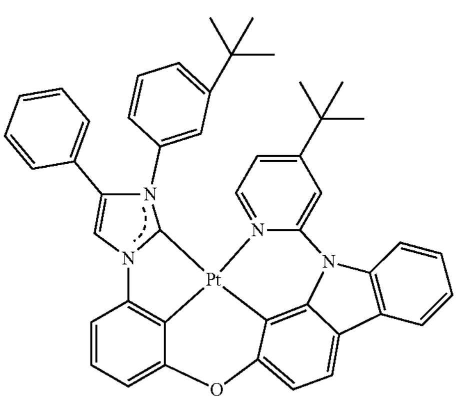
-continued
407
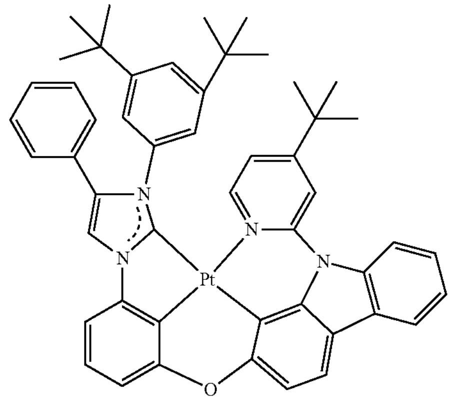
408
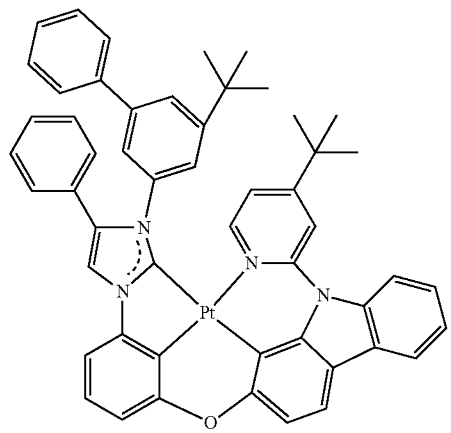
409
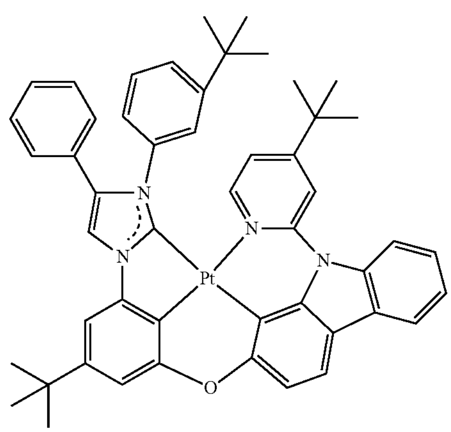

-continued
410
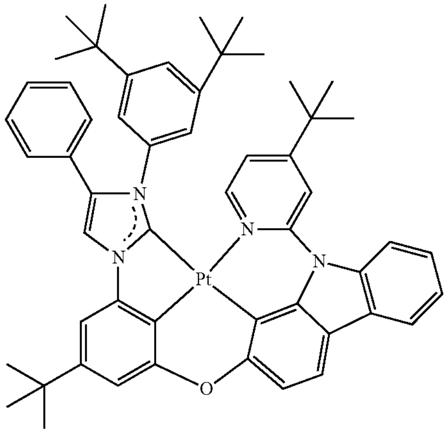
411
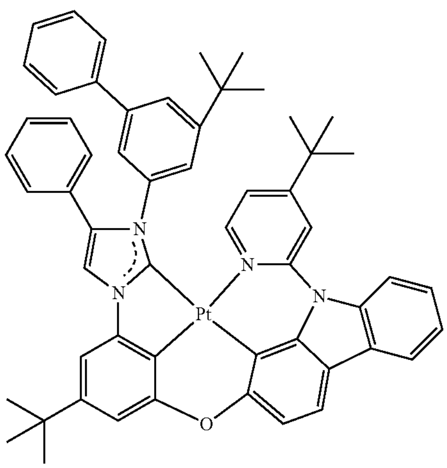
412
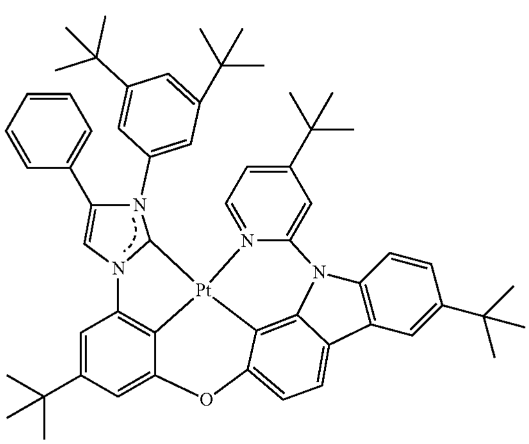
-continued
413
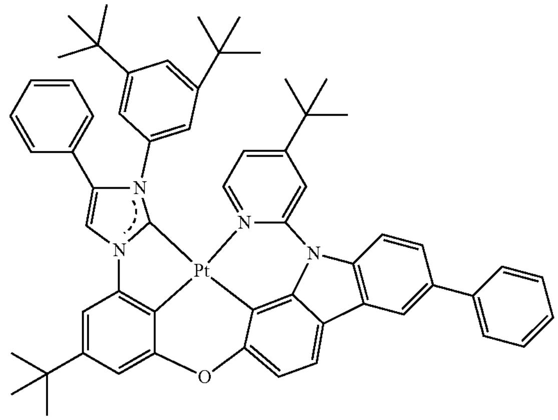
414
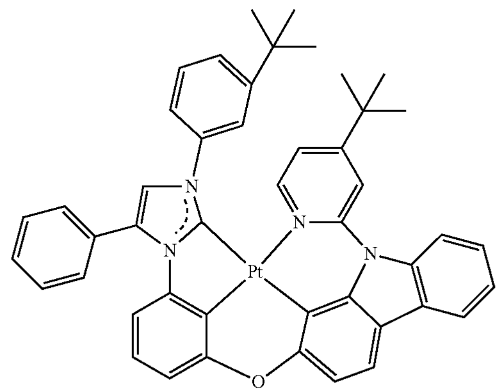
415
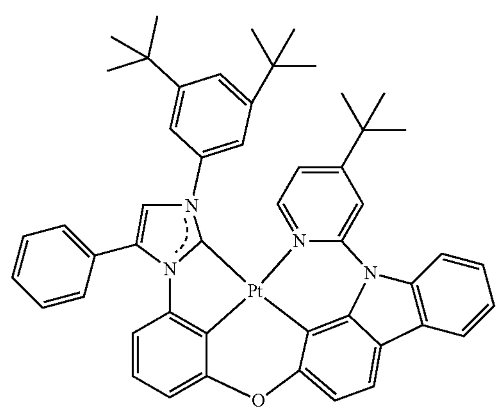

-continued
416
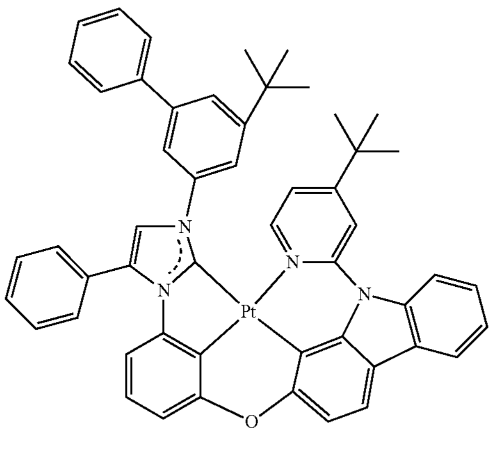
417
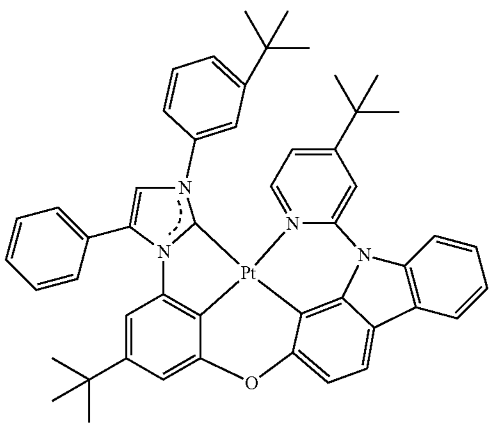
418
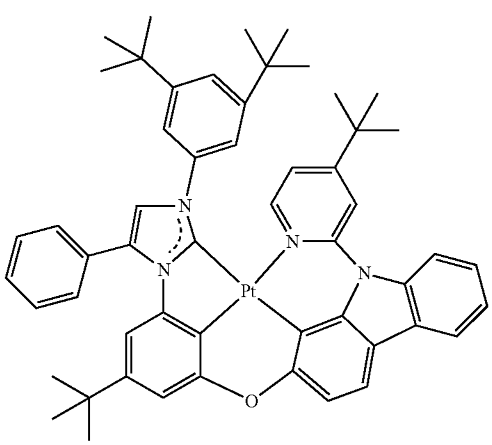
-continued
419
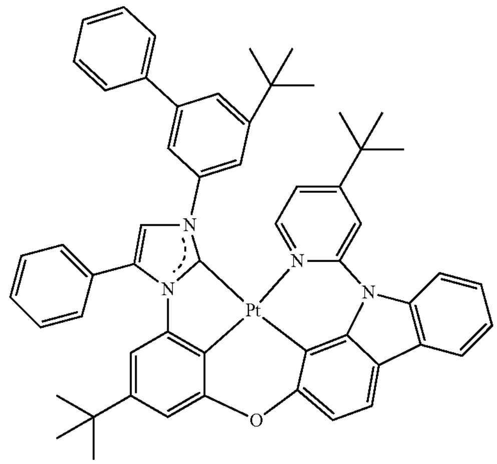
420
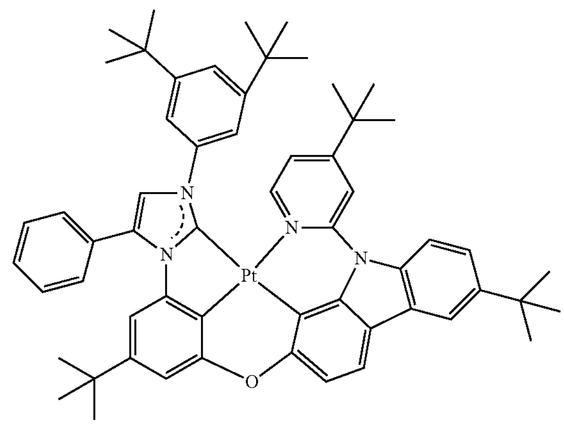
421
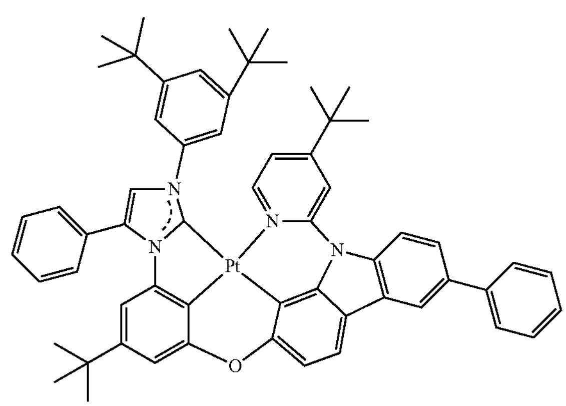

-continued
422
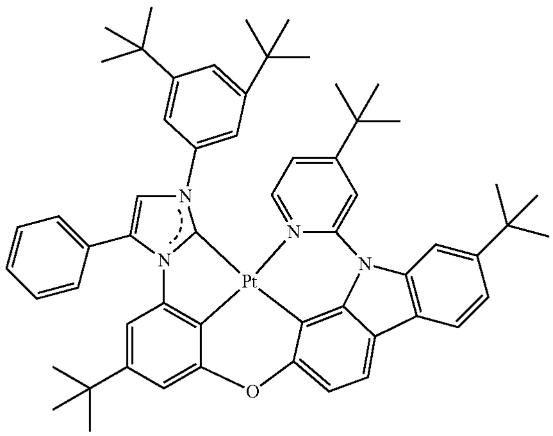
423
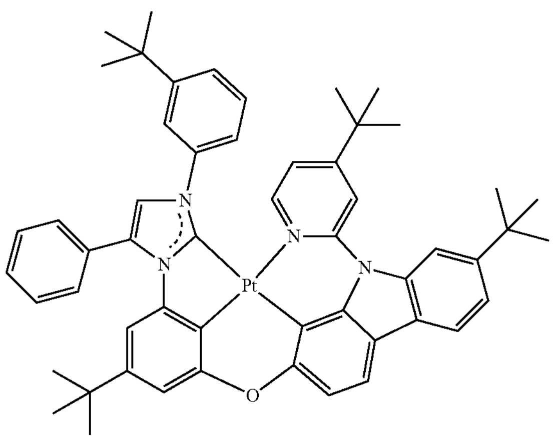
424
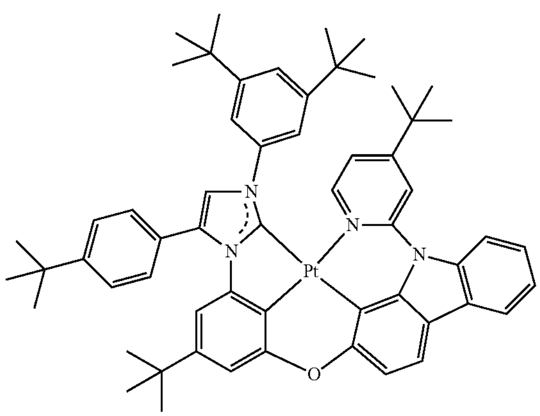
-continued
425
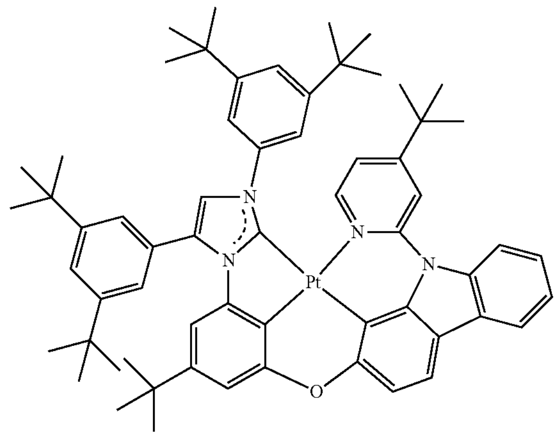
426
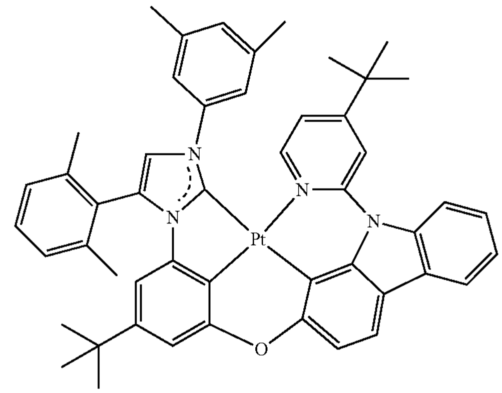
427
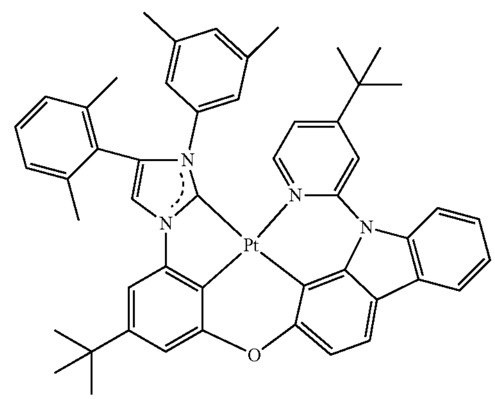
428
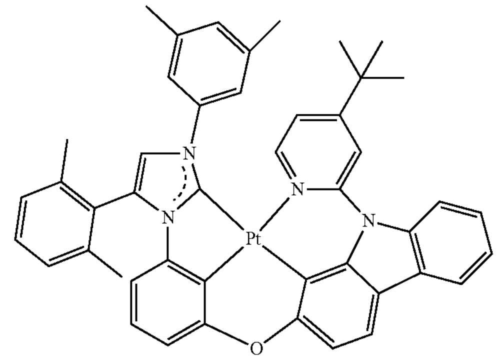

Group IX
1
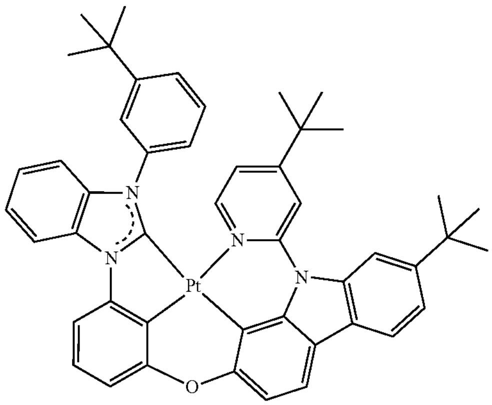
2
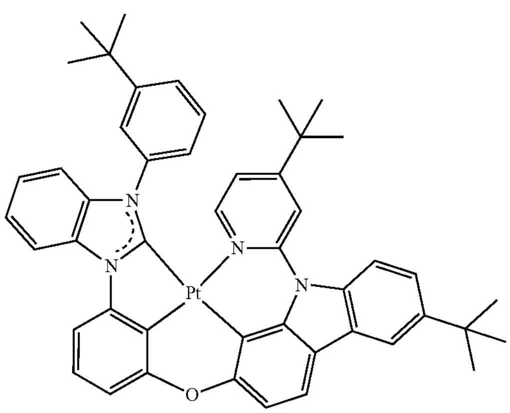
3
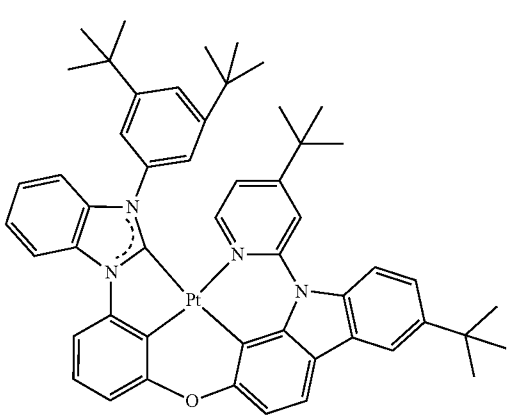
-continued
4
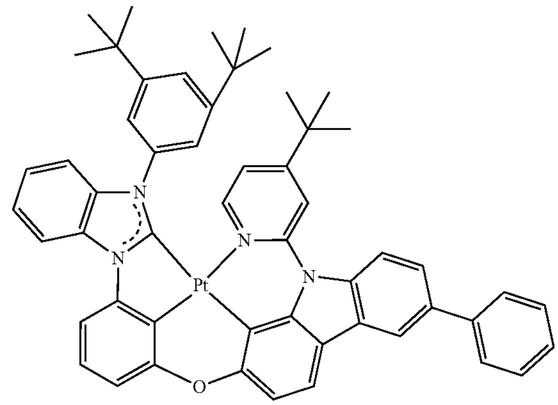
5
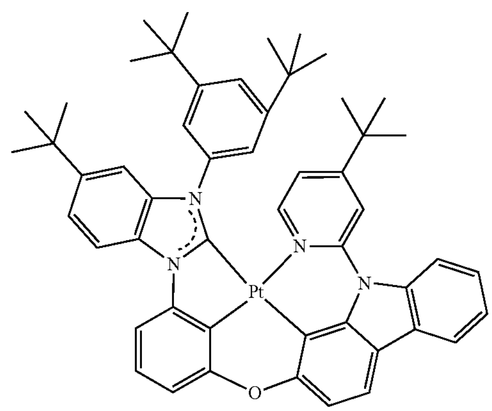
6
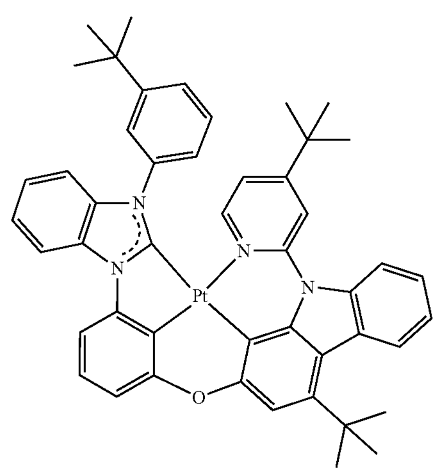

7
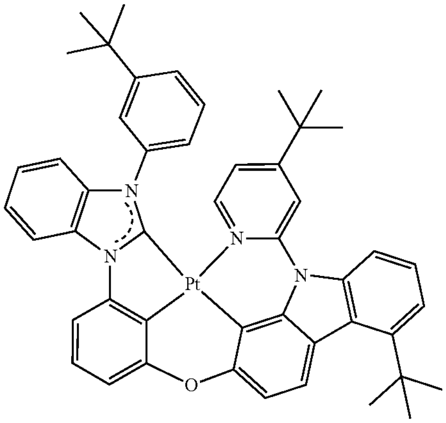
8
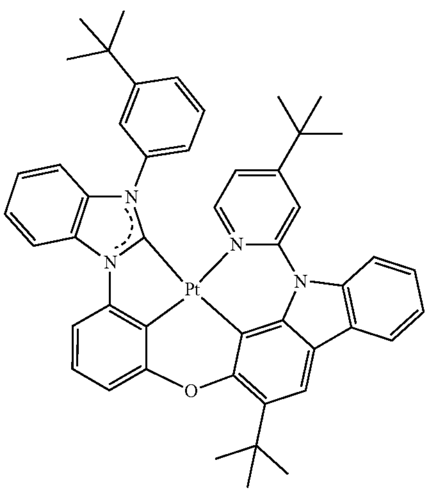
9
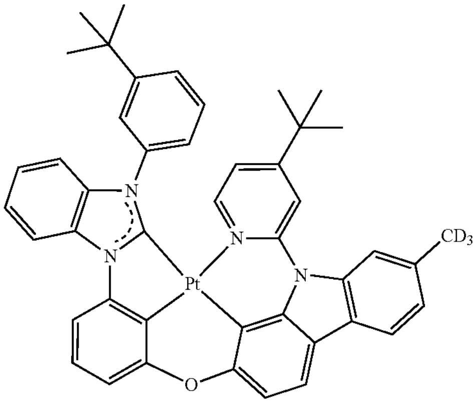
10
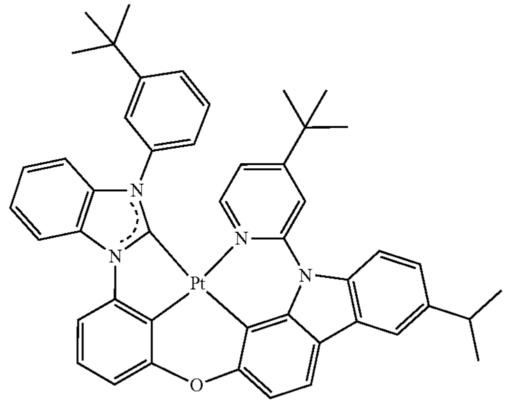
11
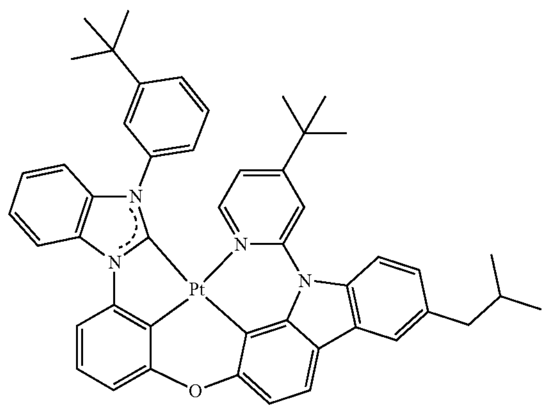
12
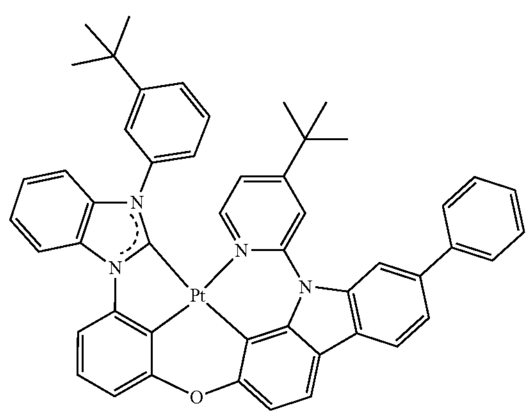

-continued
13
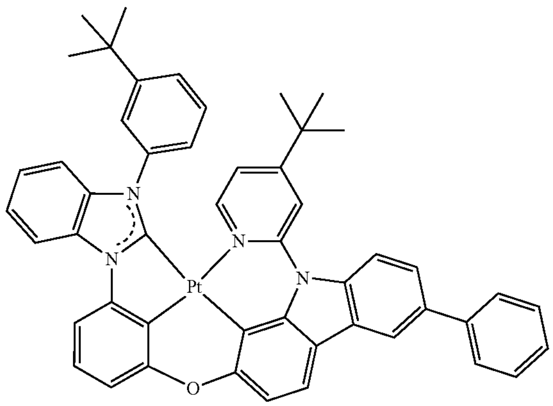
14
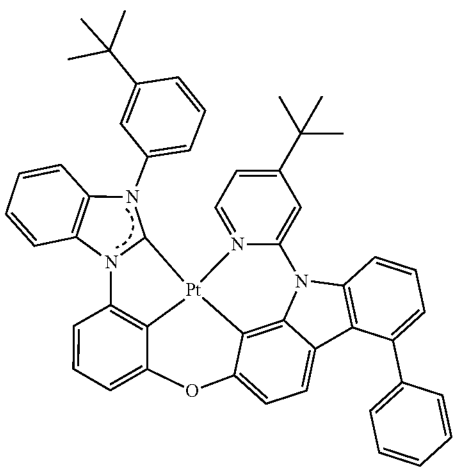
15
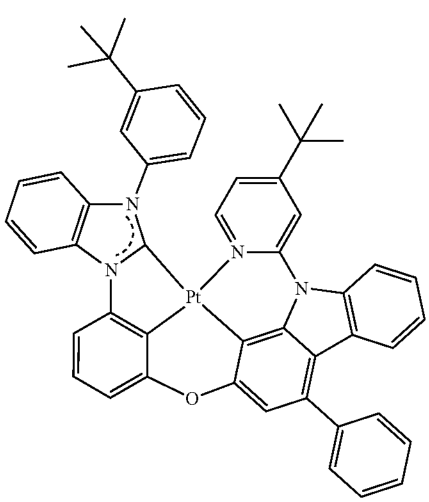
-continued
16
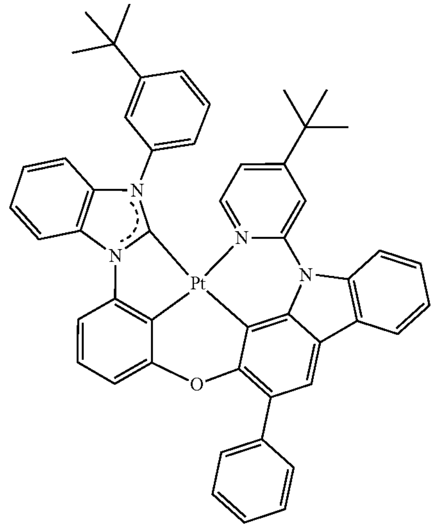
17
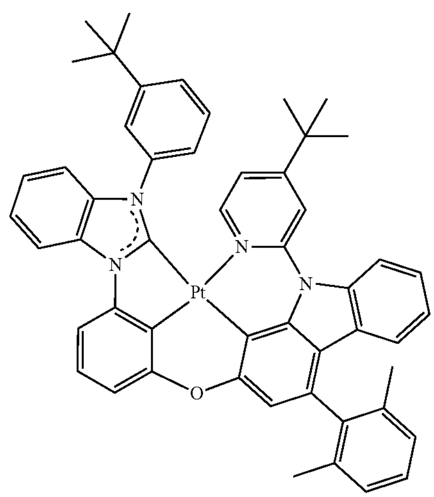
18
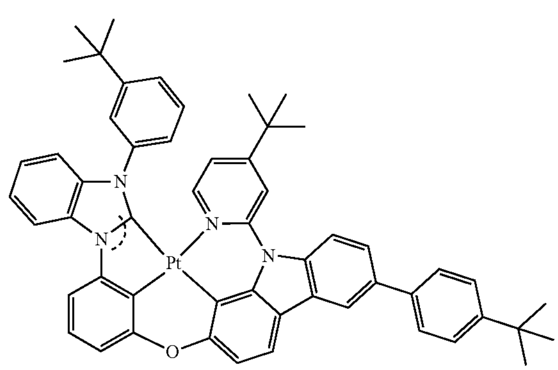

19
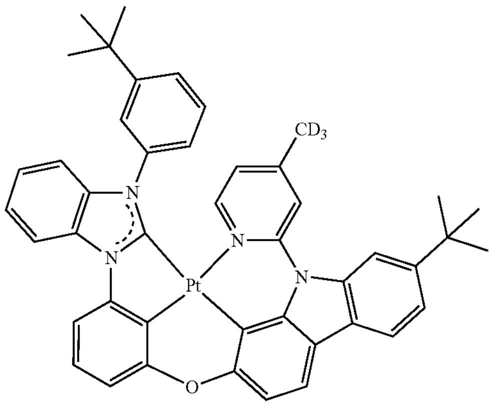
20
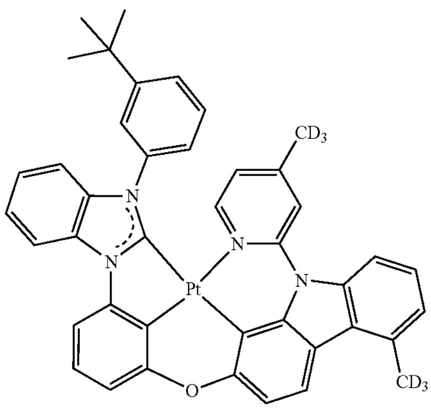
21
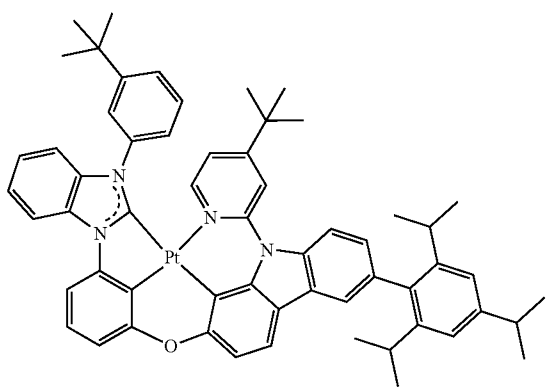
22
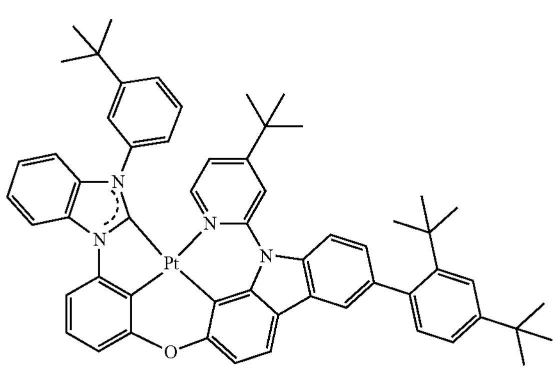
23
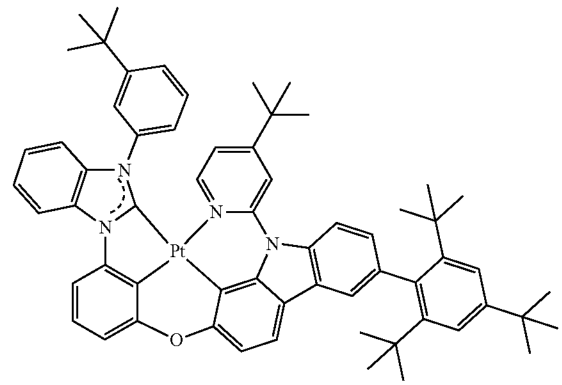
24
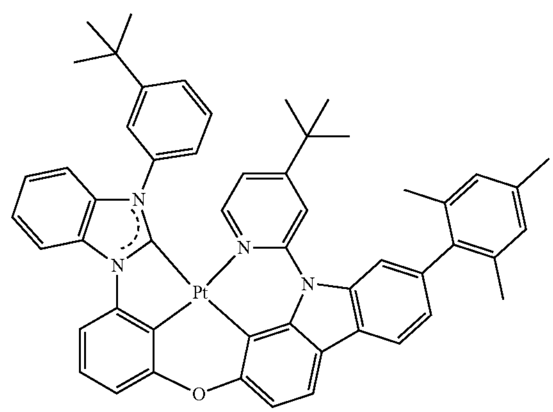
25
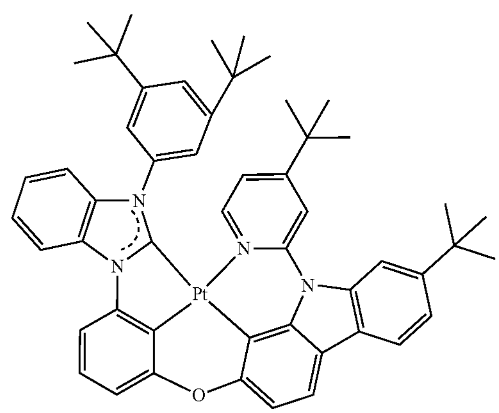

26
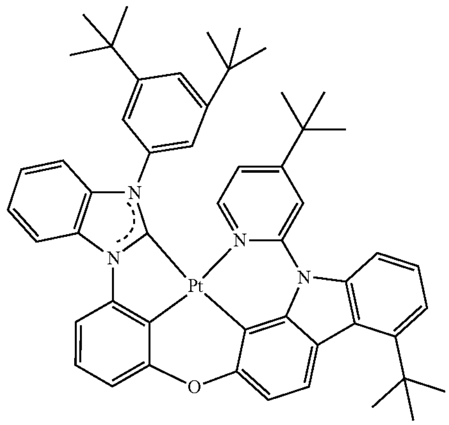
27
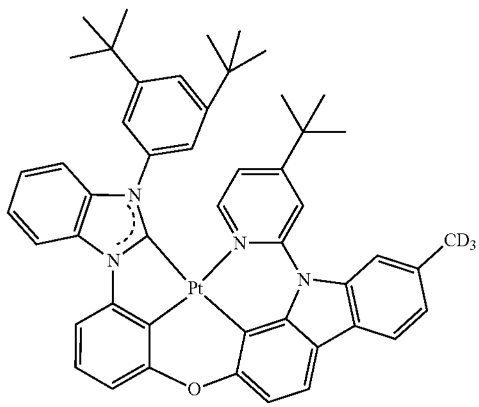
28
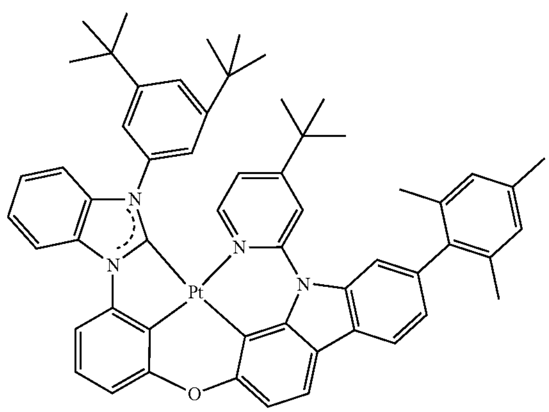
29
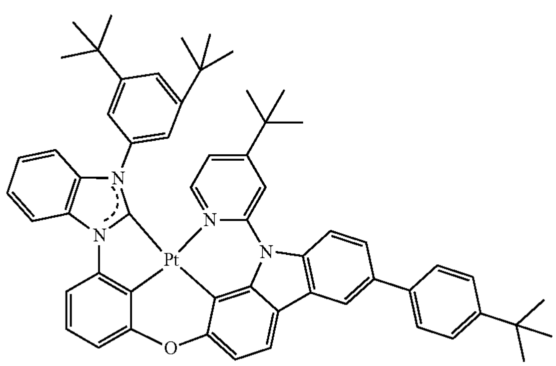
30
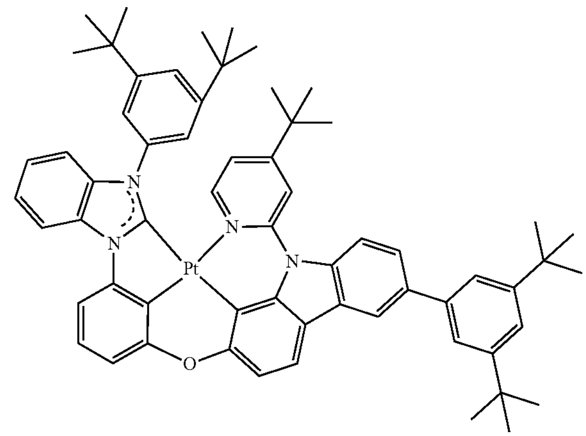
31
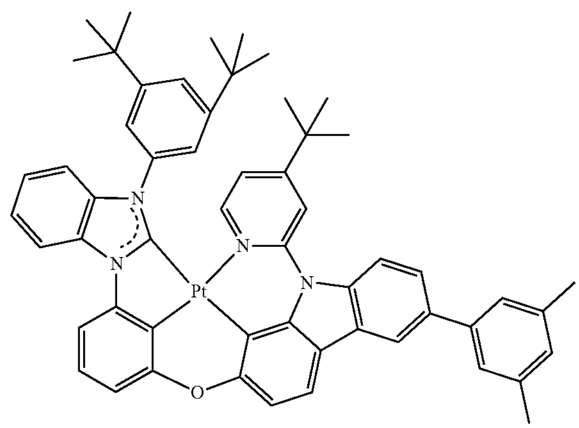
32
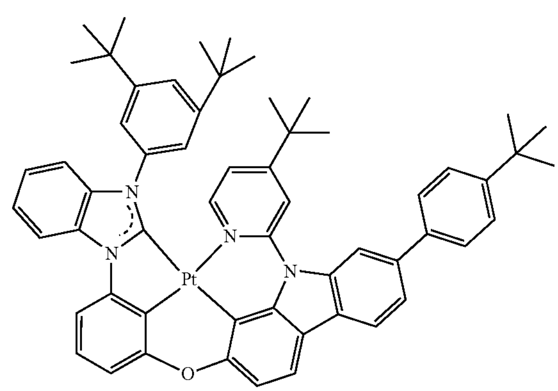

-continued
33
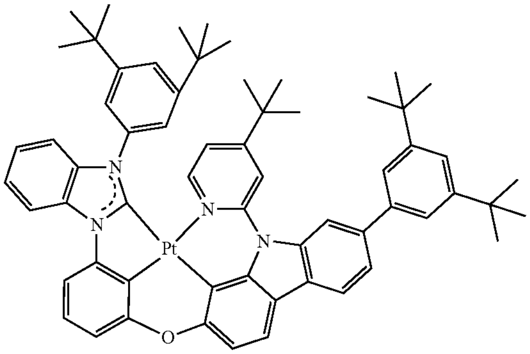
34
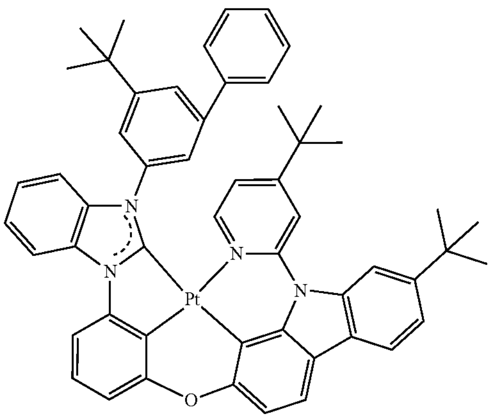
35
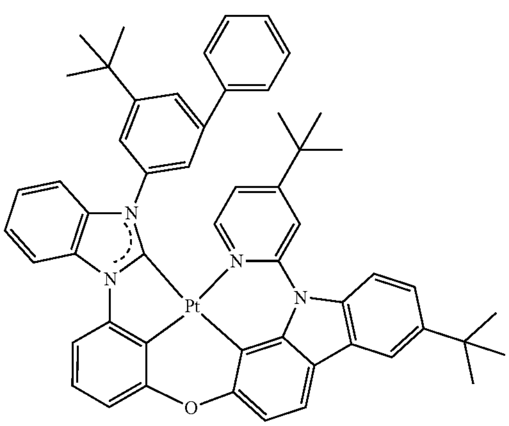
-continued
36
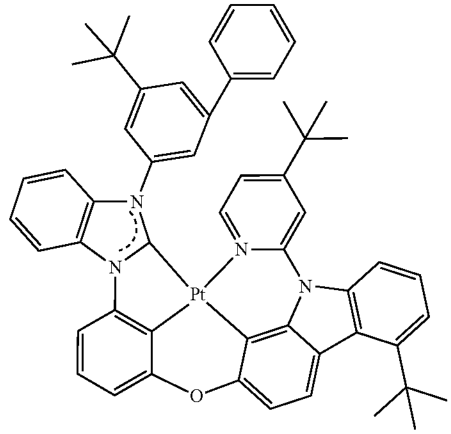
37
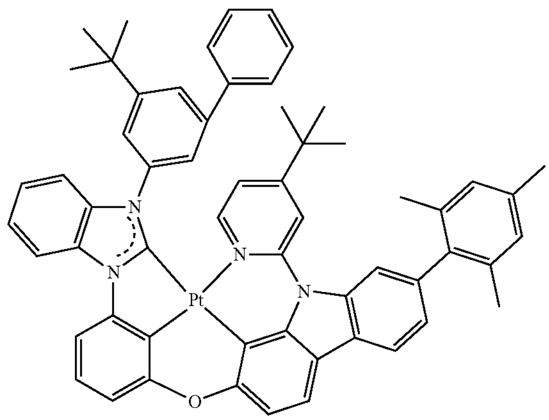
38
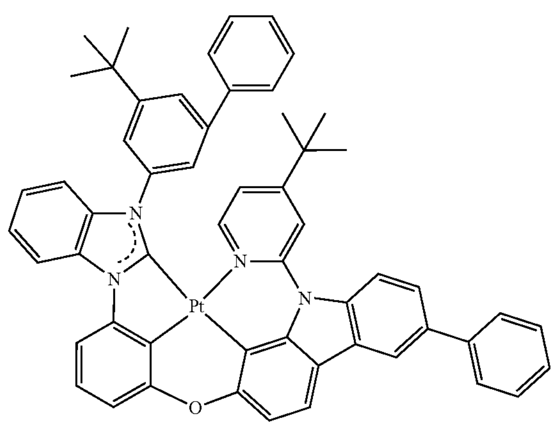

-continued
39
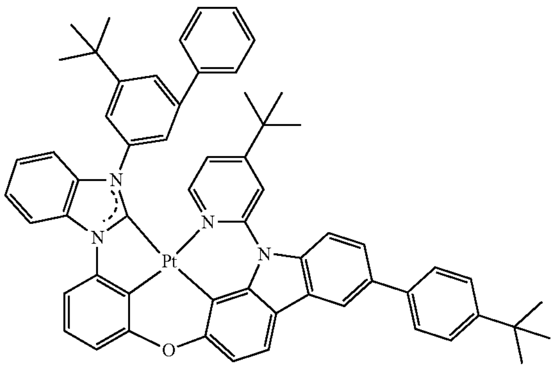
40
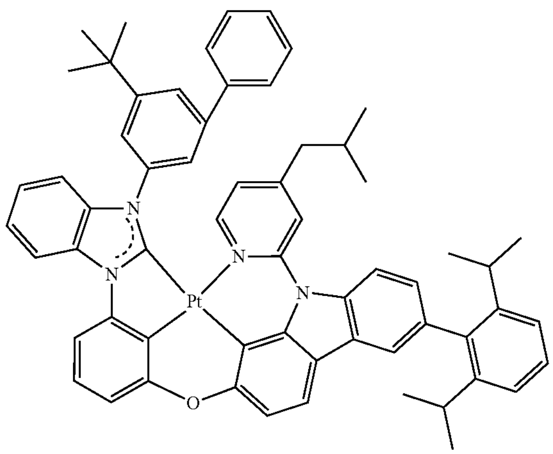
41
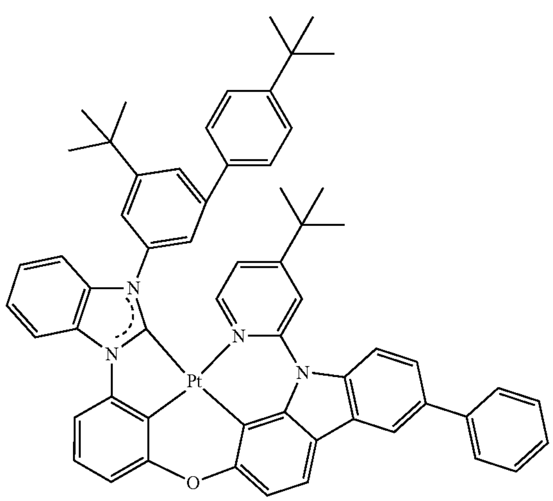
-continued
42
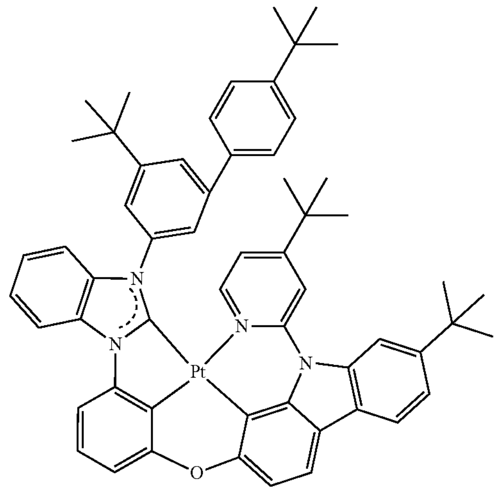
43
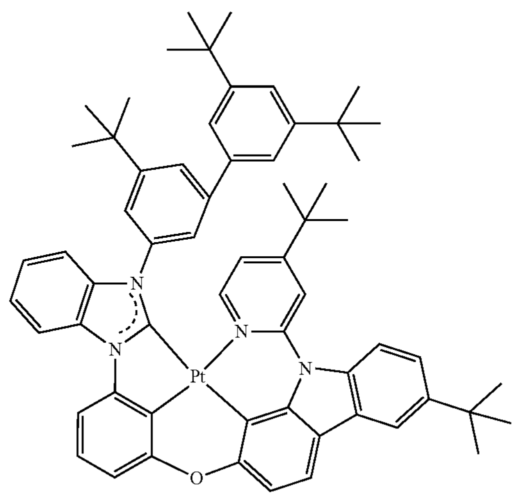
44
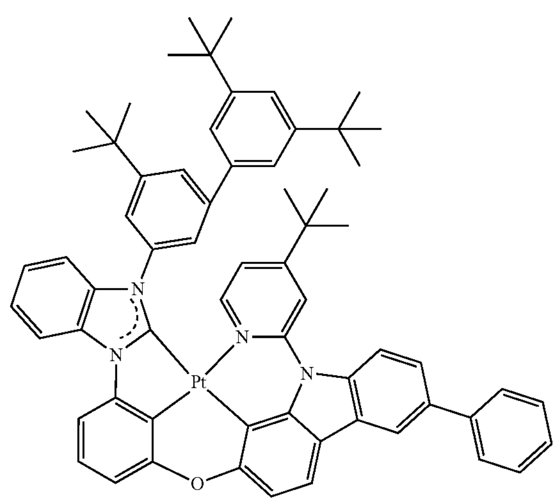

-continued
45
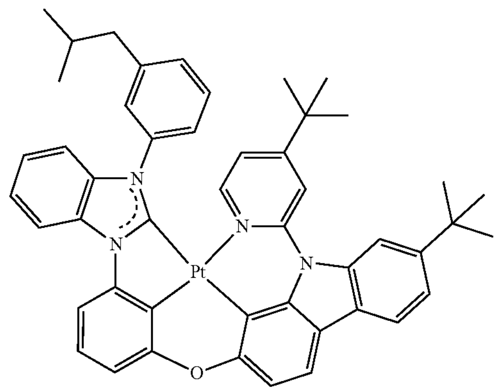
46
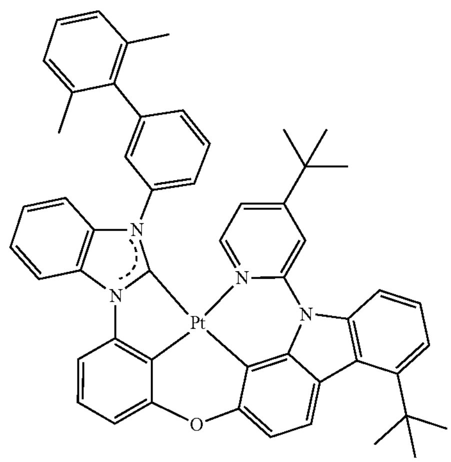
47
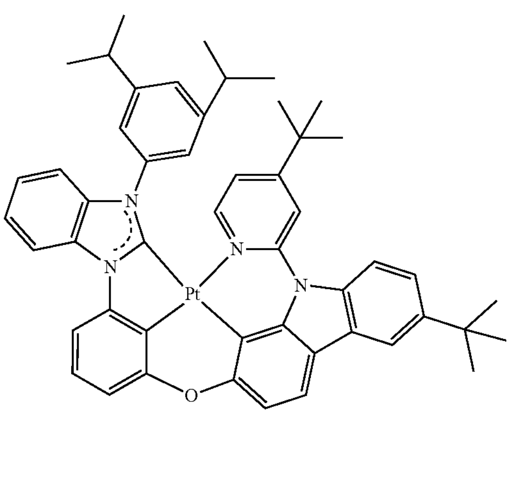
-continued
48
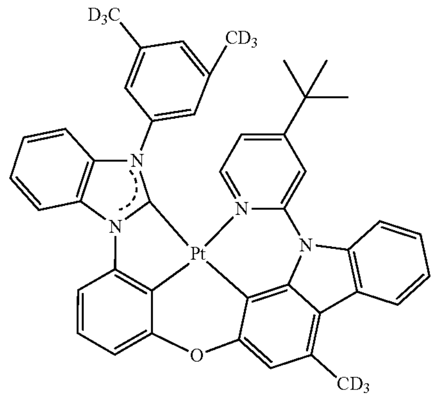
49
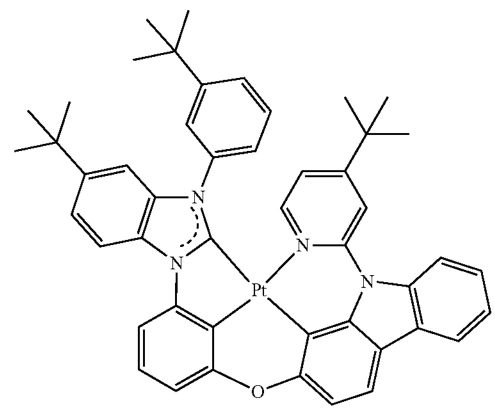
50
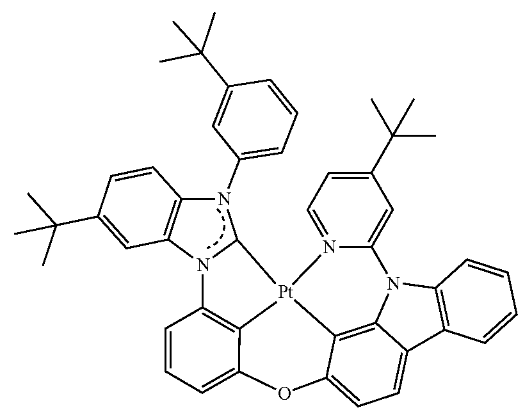
51
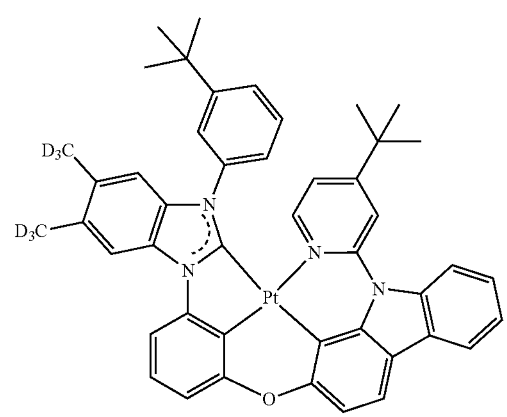

-continued
52
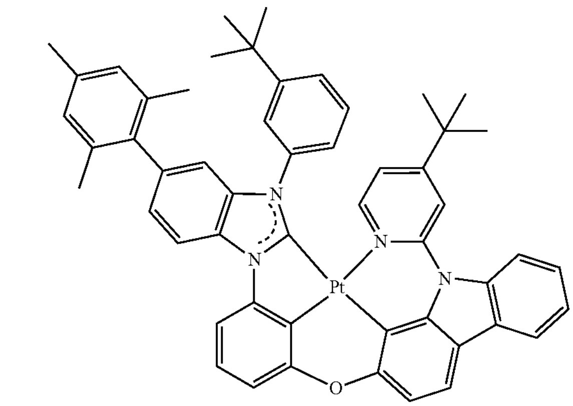
53
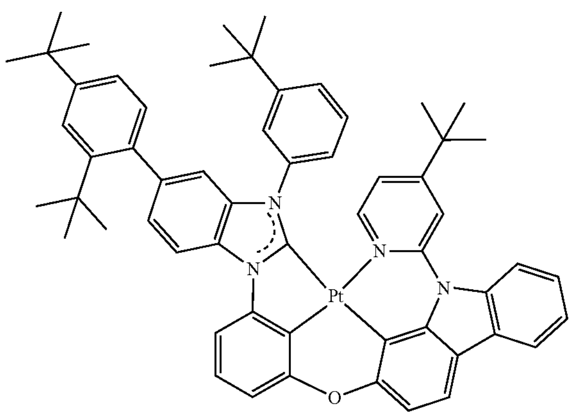
54
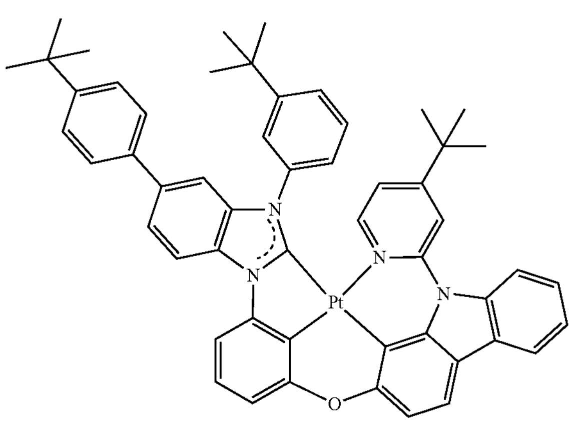
-continued
55
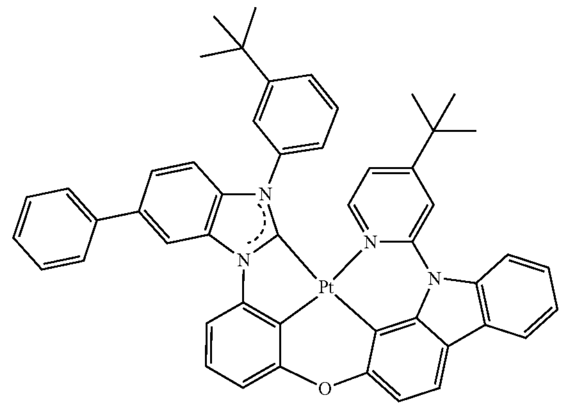
56
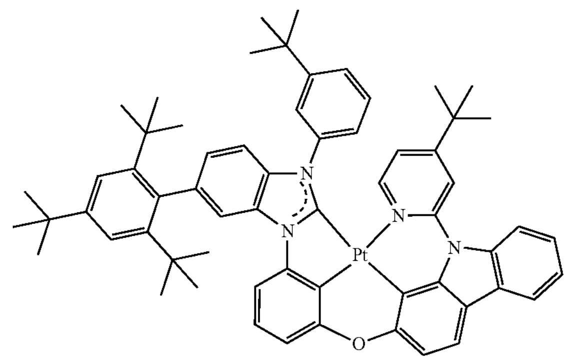
57
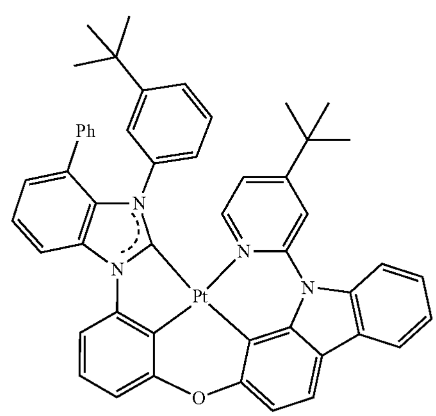
58
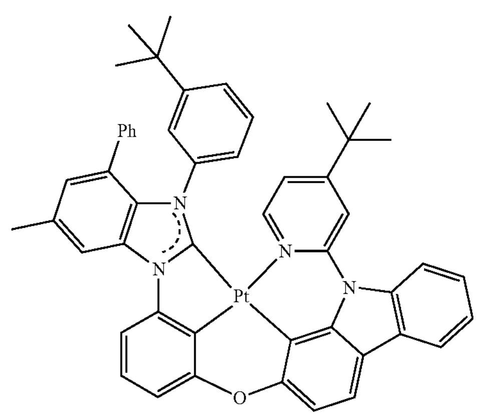

-continued
59
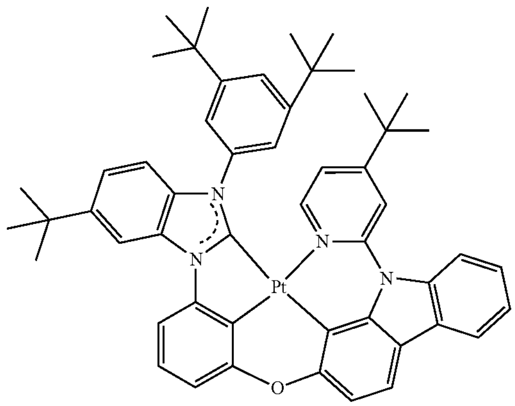
60
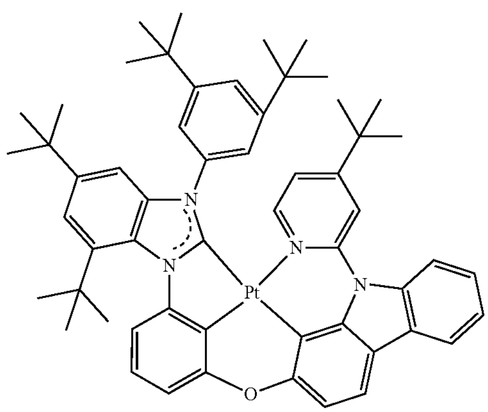
61
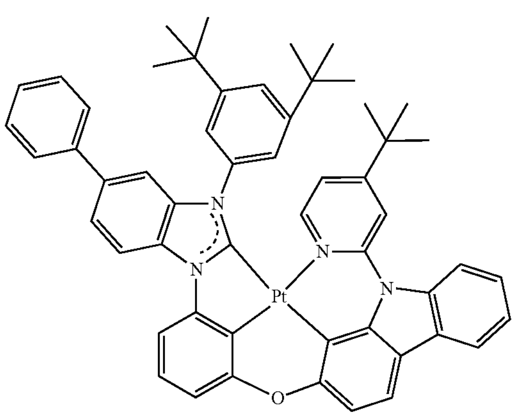
62
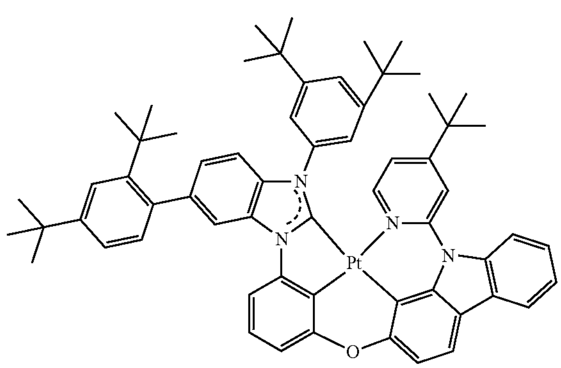
-continued
63
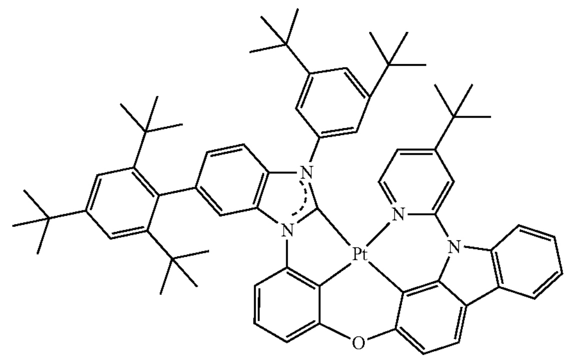
64
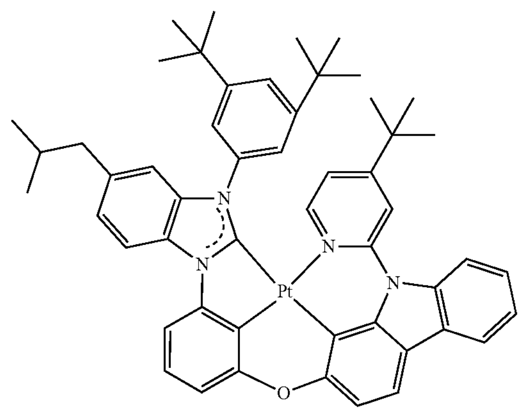
65
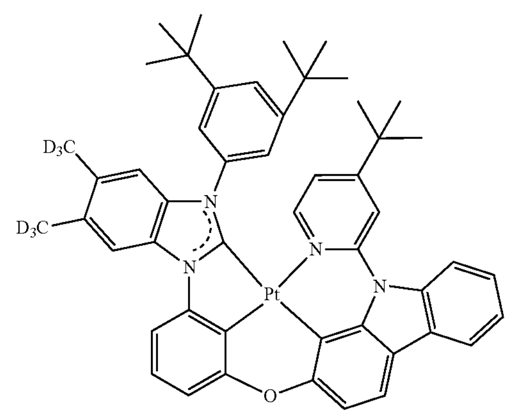
66
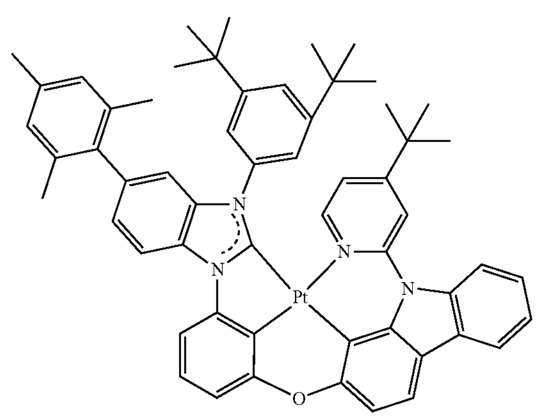

-continued
67
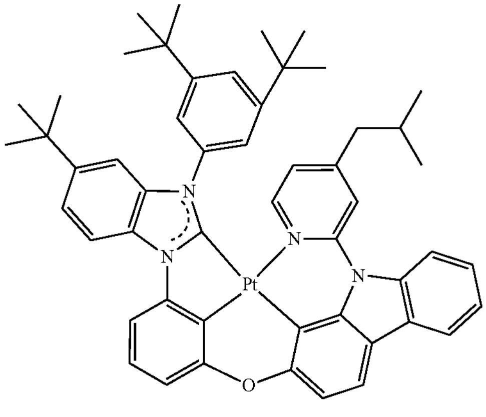
68
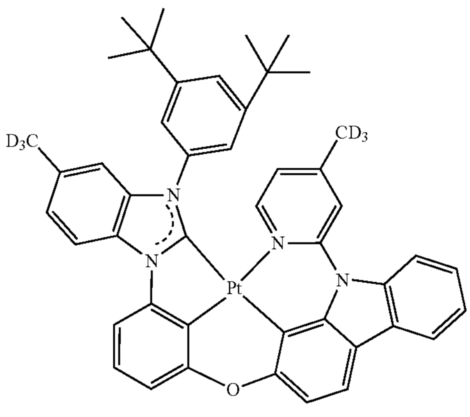
69
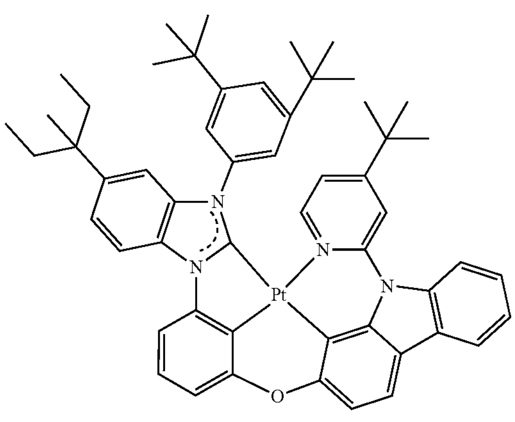
-continued
70
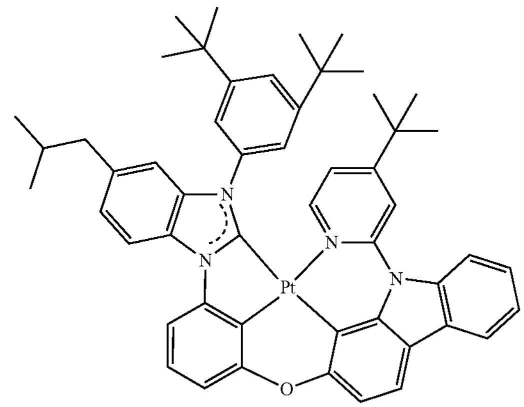
71
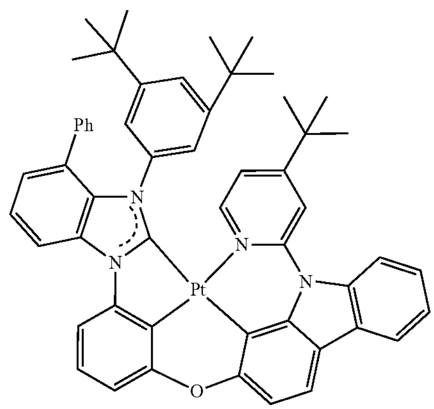
72
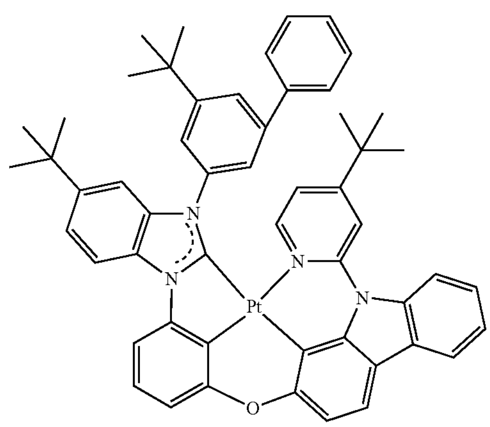

73
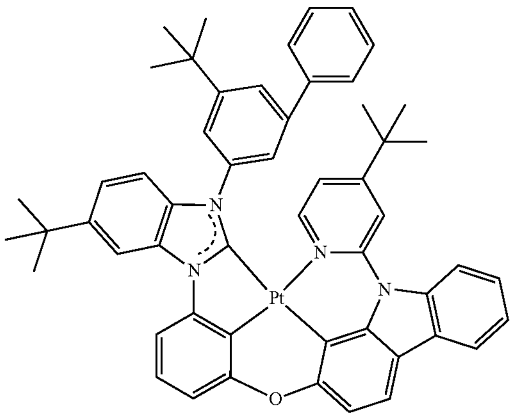
74
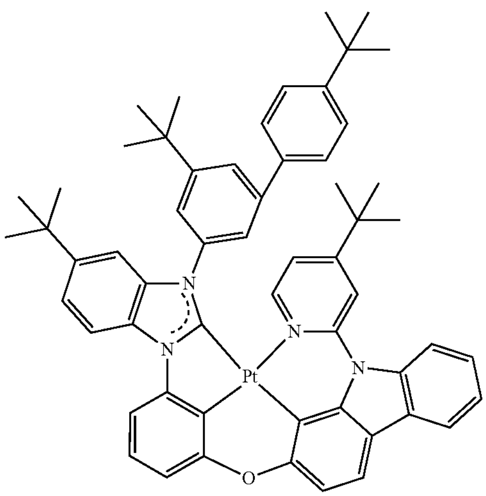
75
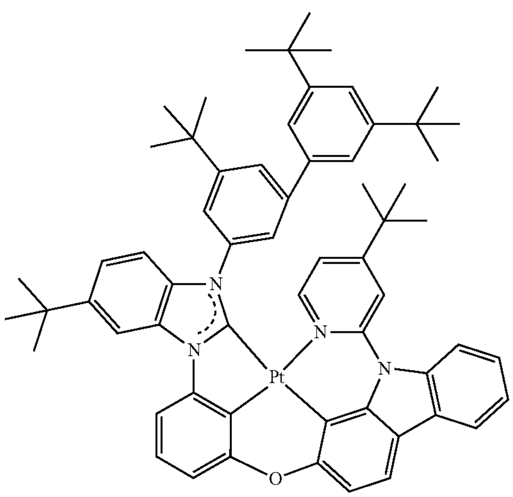
76
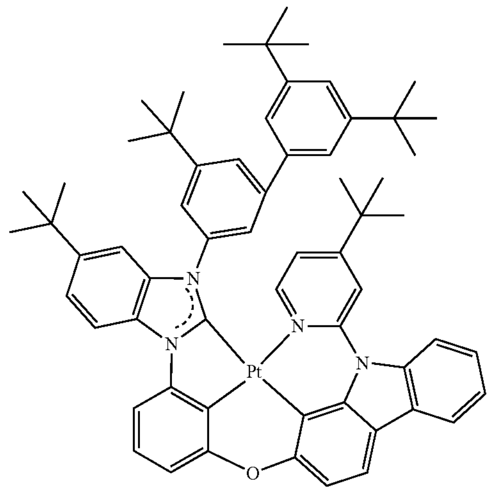
77
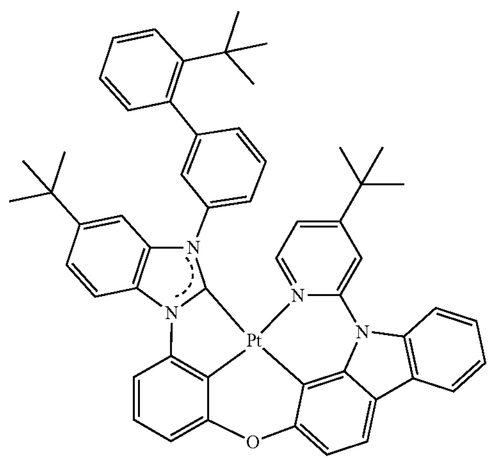
78
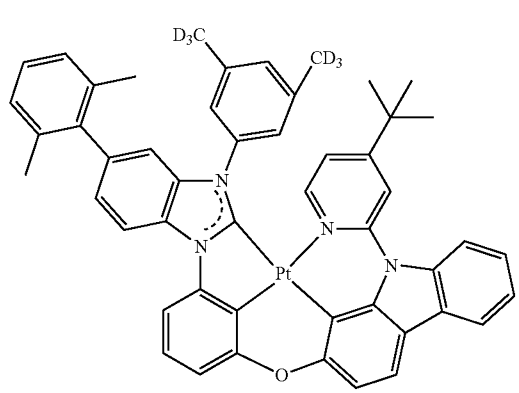

-continued
79
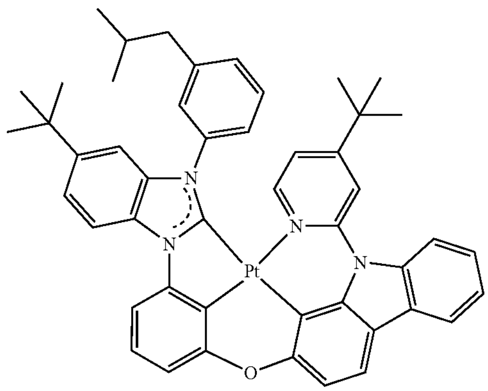
80
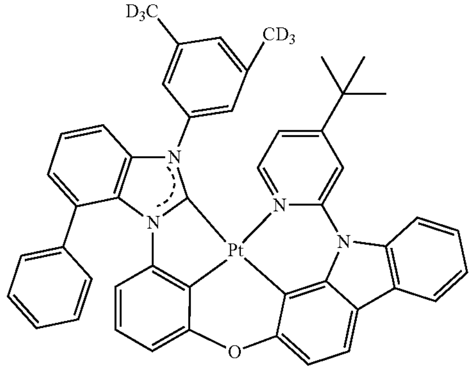
81
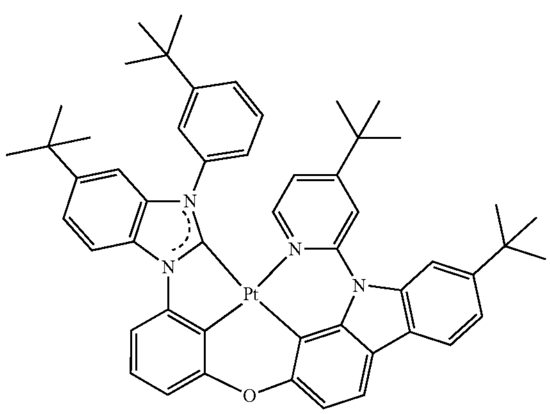
82
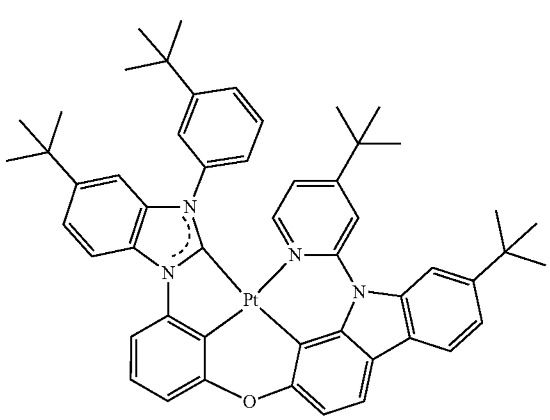
-continued
83
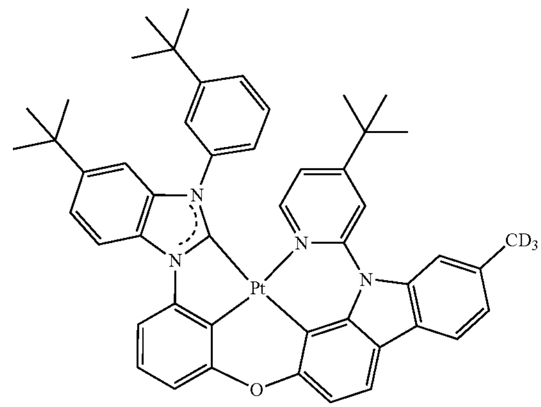
84
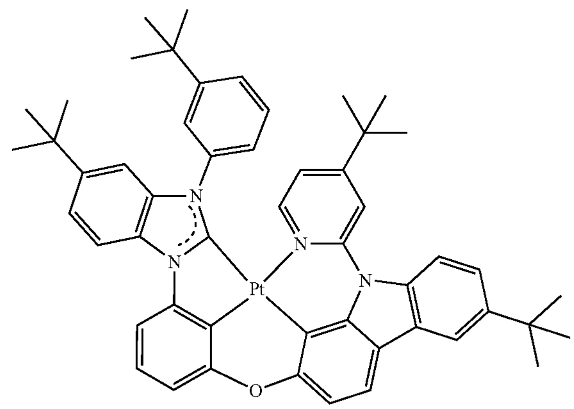
85
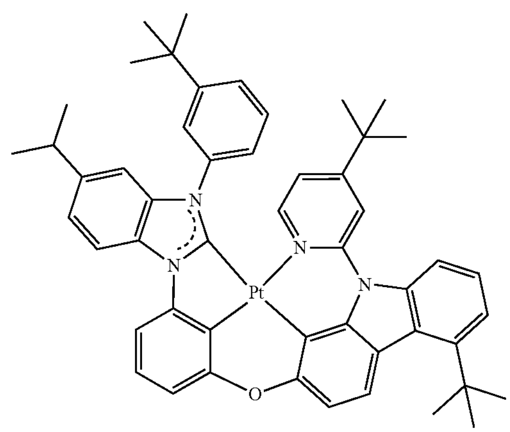
86
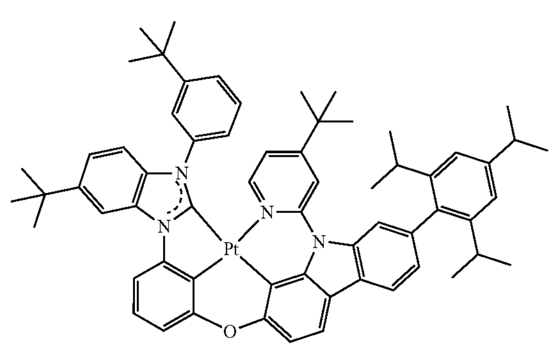

87
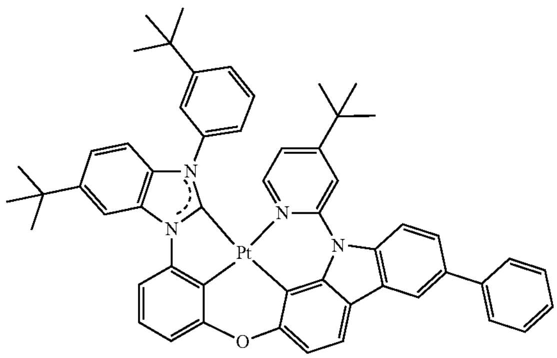
88
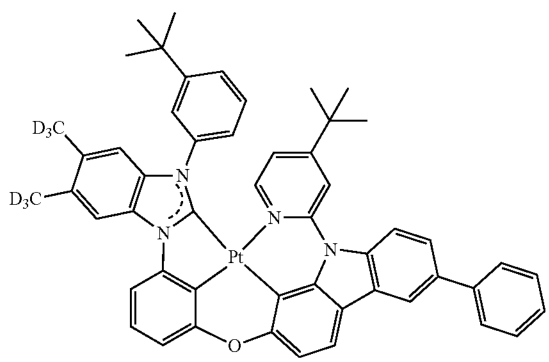
89
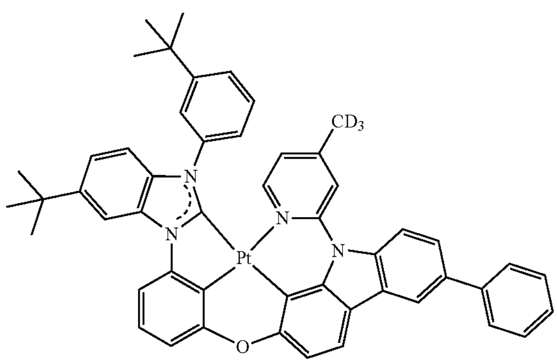
90
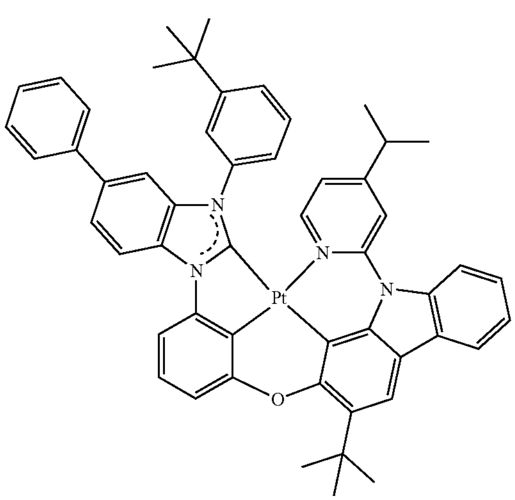
91
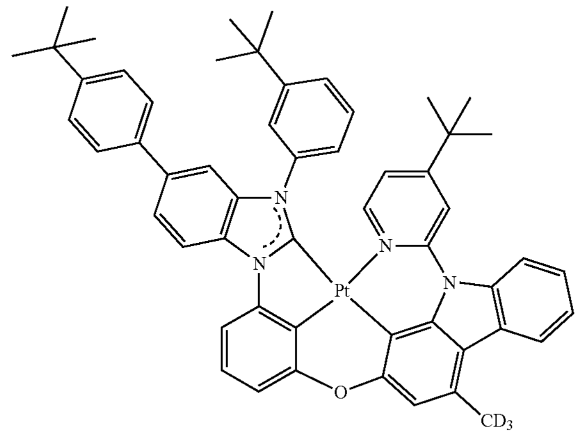
92
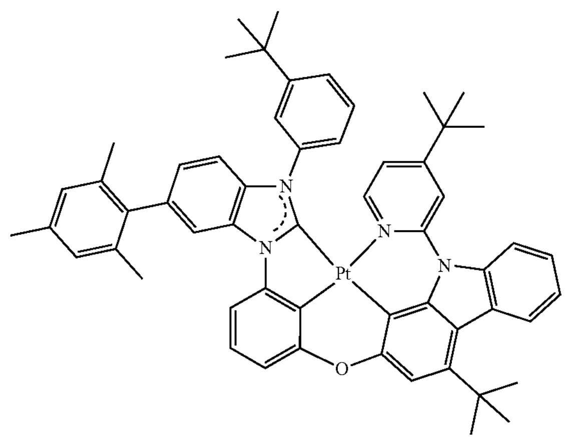
93
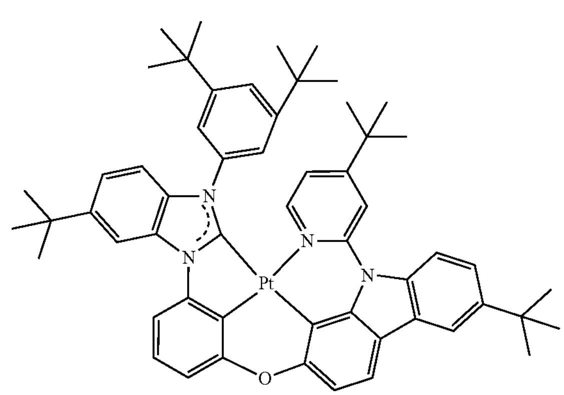

-continued
94
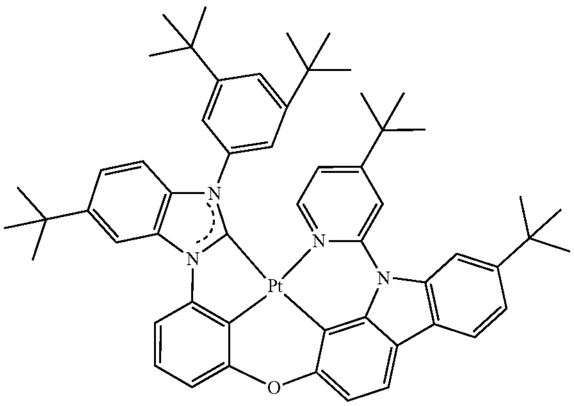
95
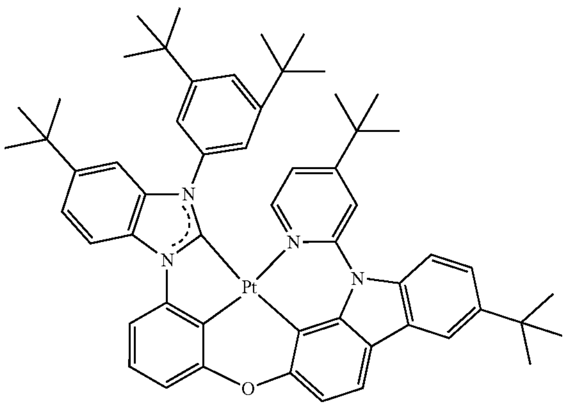
96
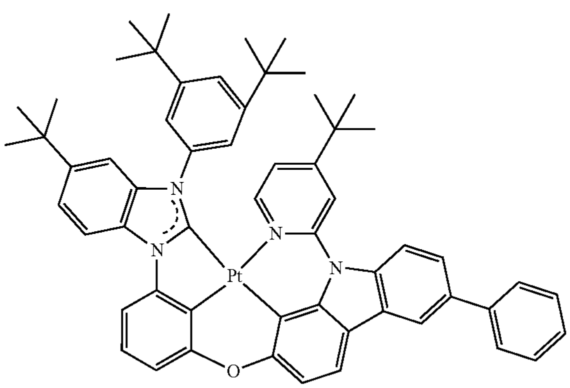
97
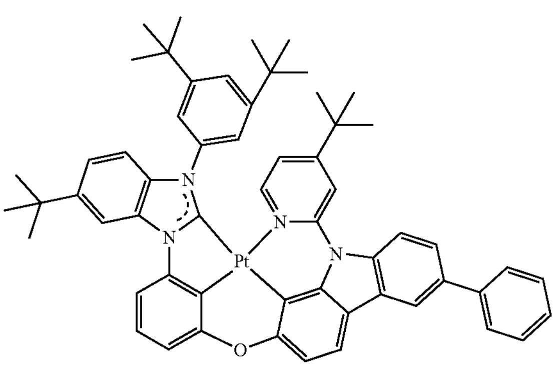
-continued
98
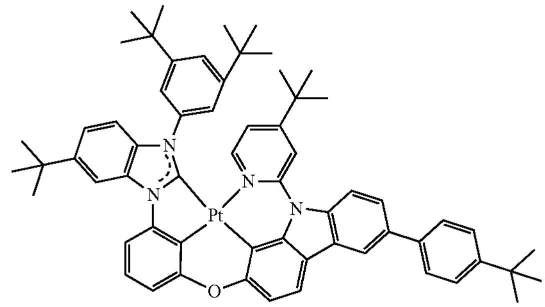
99
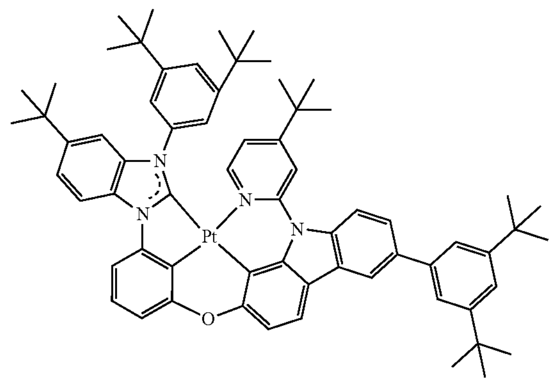
100
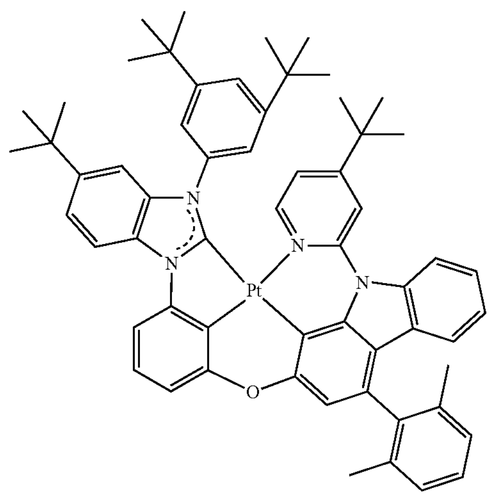
101
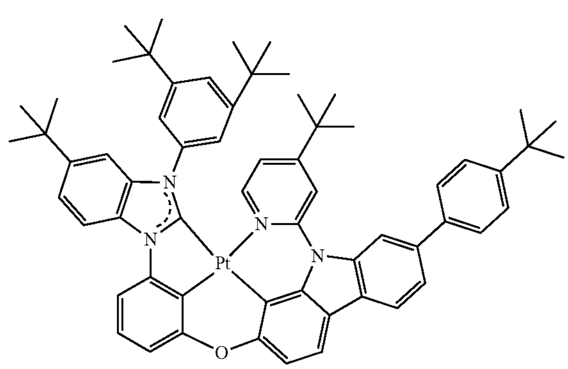

102
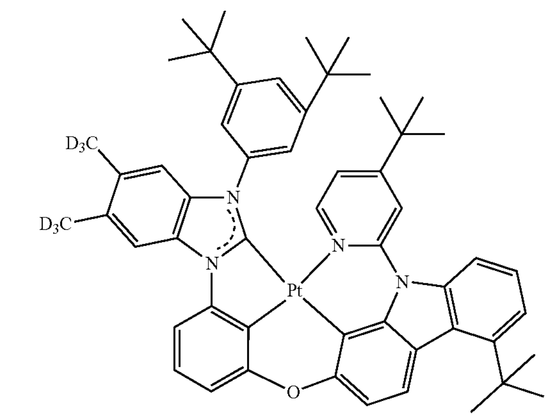
103
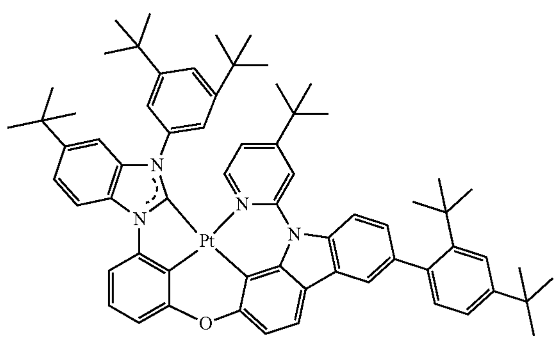
104
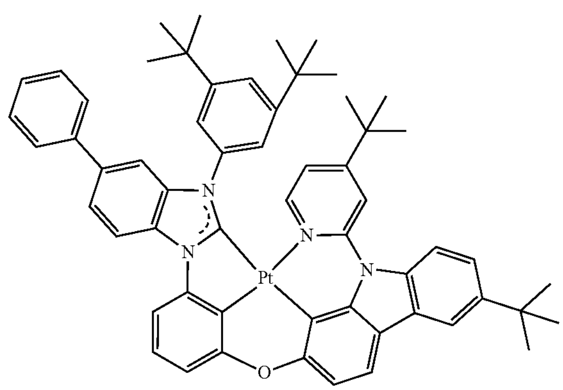
105
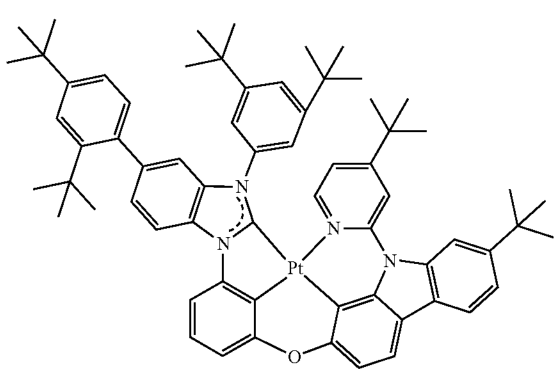
106
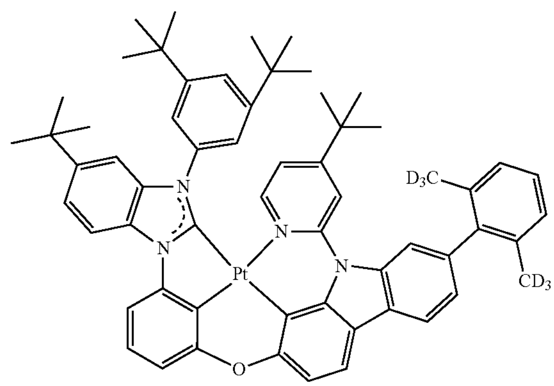
107
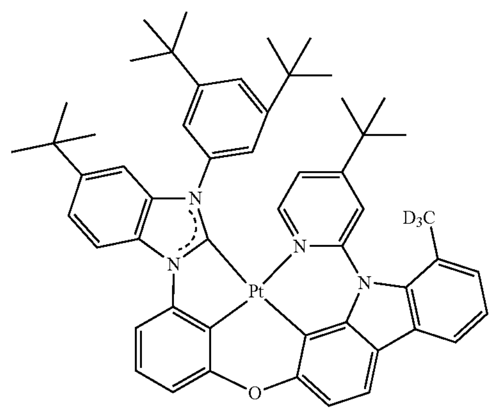
108
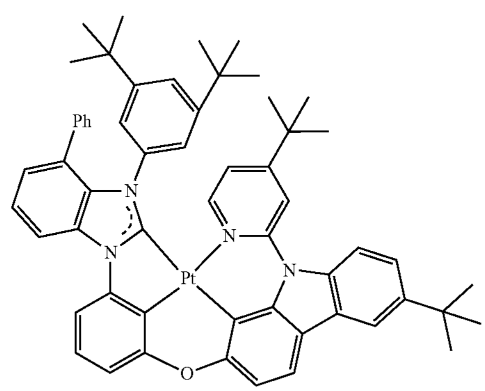
109
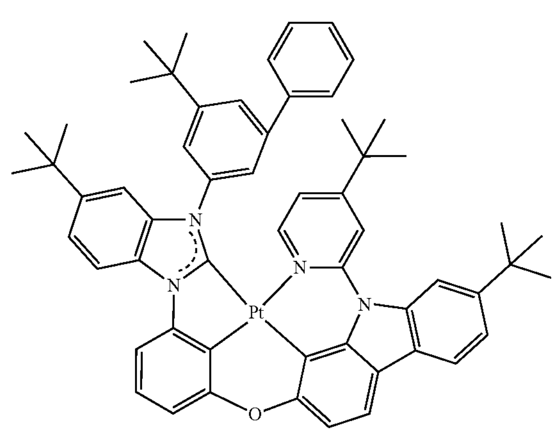

-continued
110
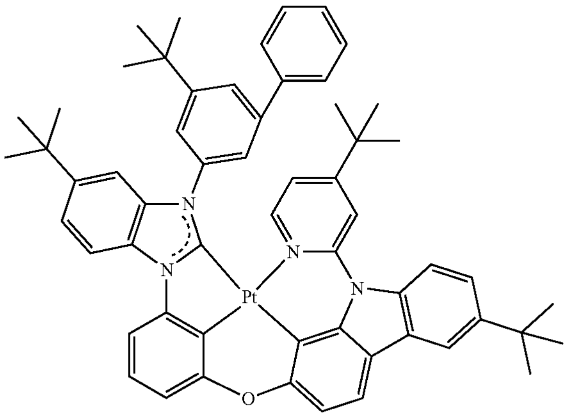
111
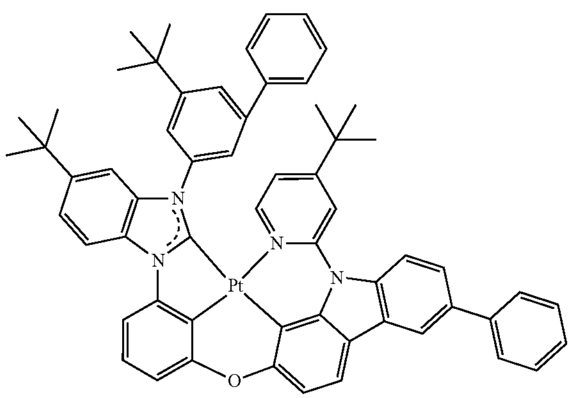
112
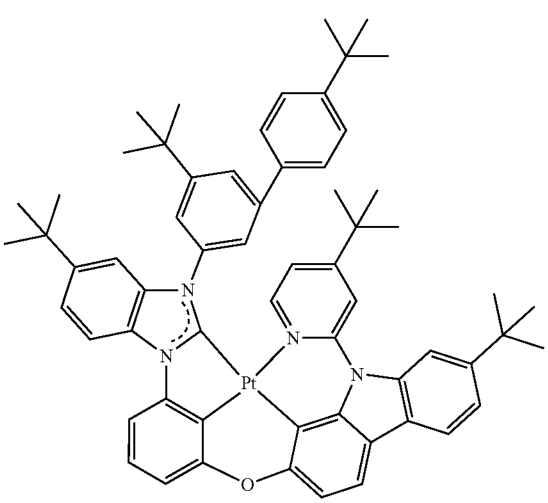
-continued
113
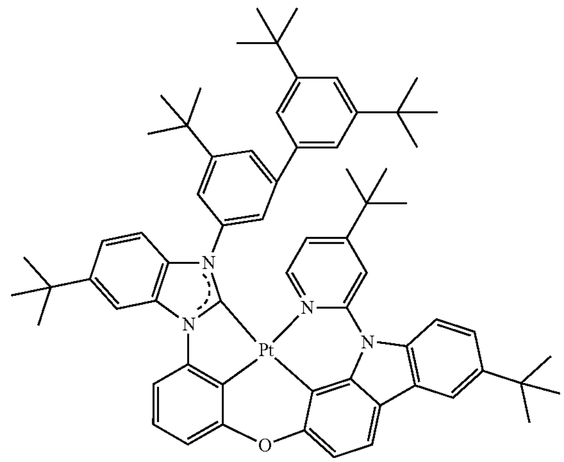
114
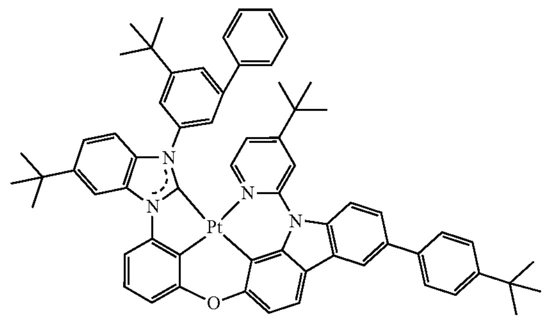
115
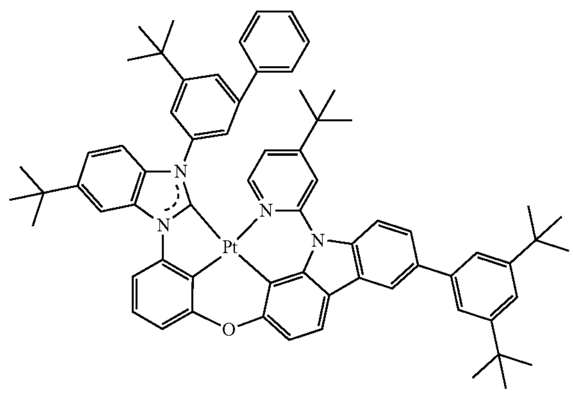
116
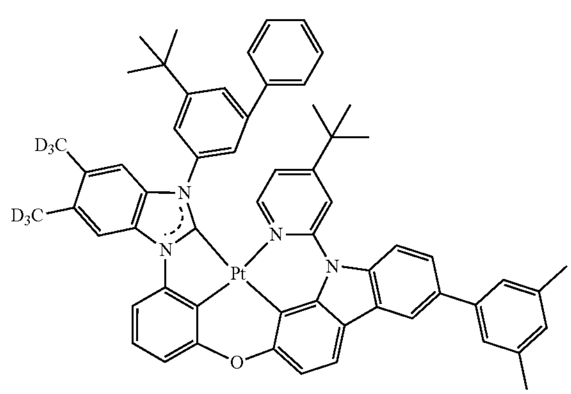

-continued
117
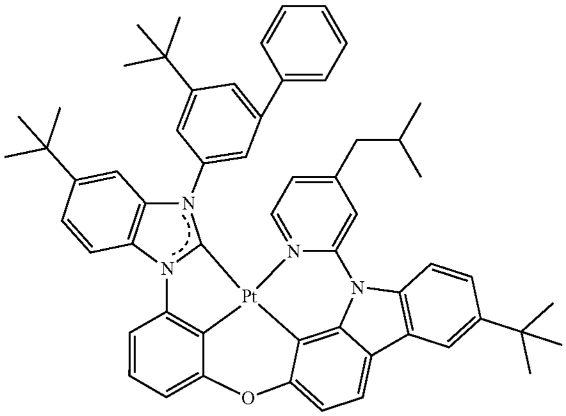
118
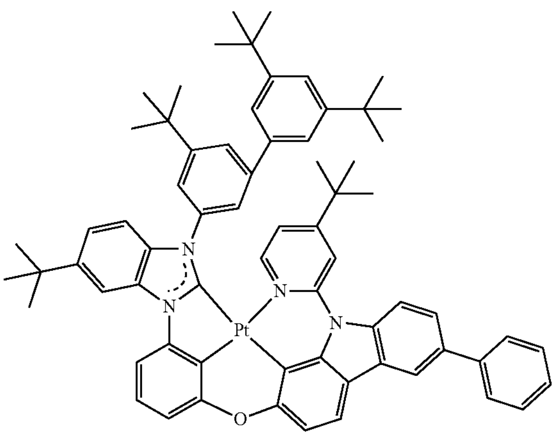
119
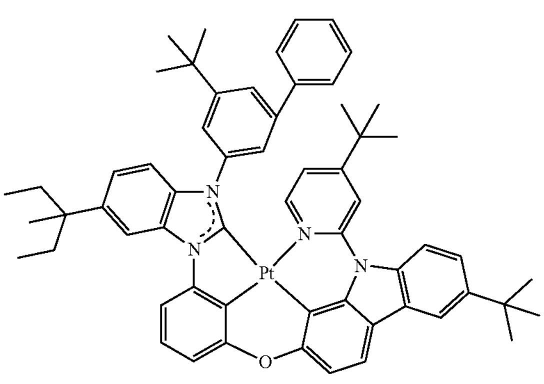
-continued
120
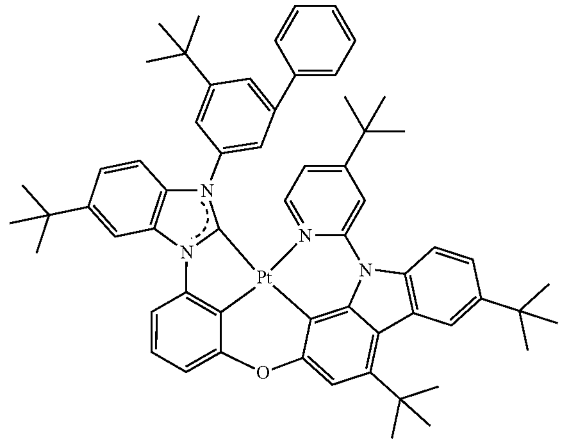
121
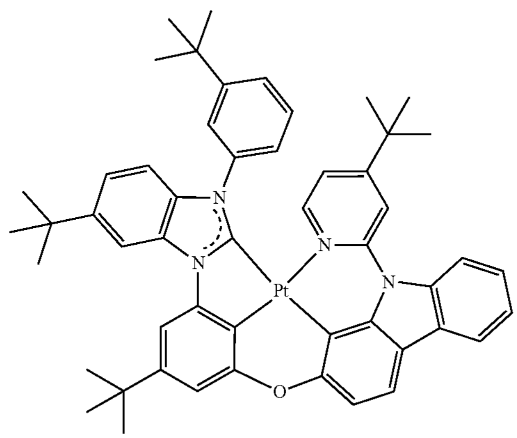
122
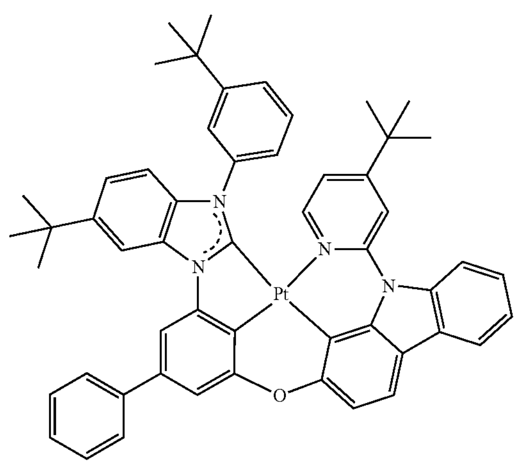

123
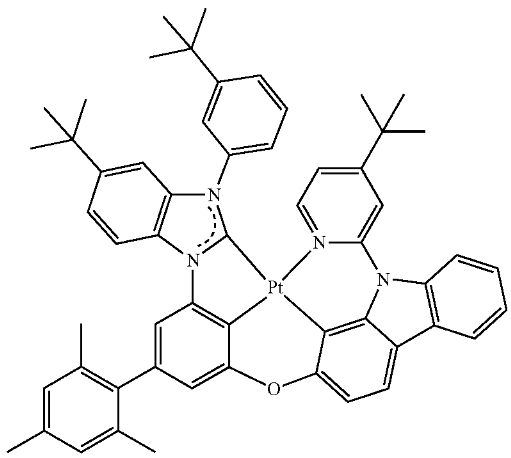
124
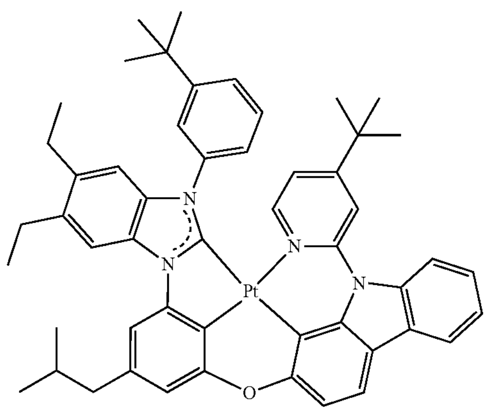
125
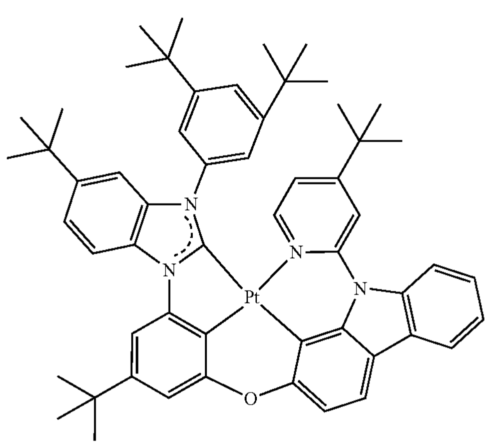
126
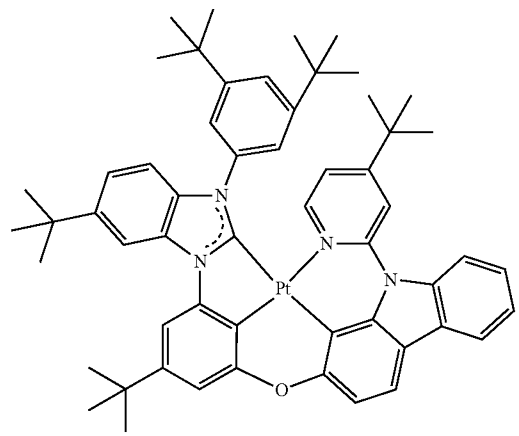
127
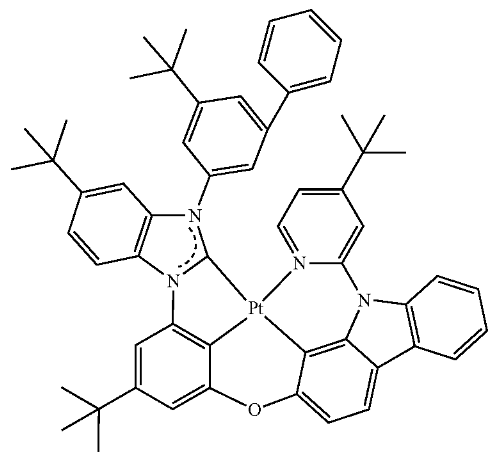
128
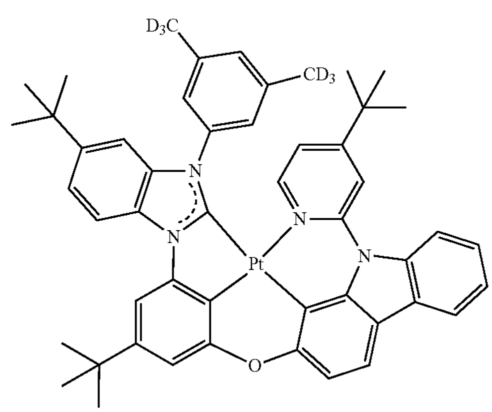

-continued
129
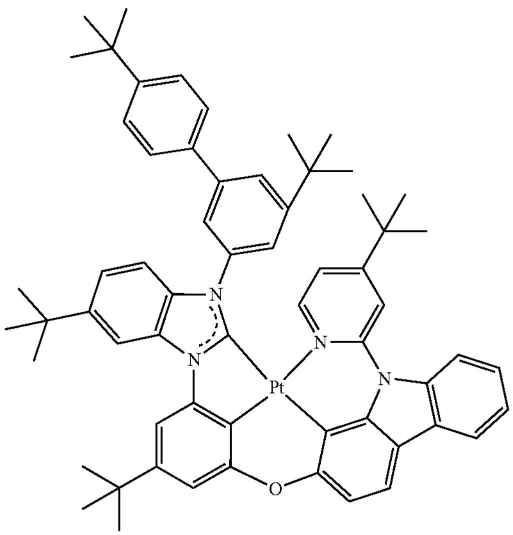
130
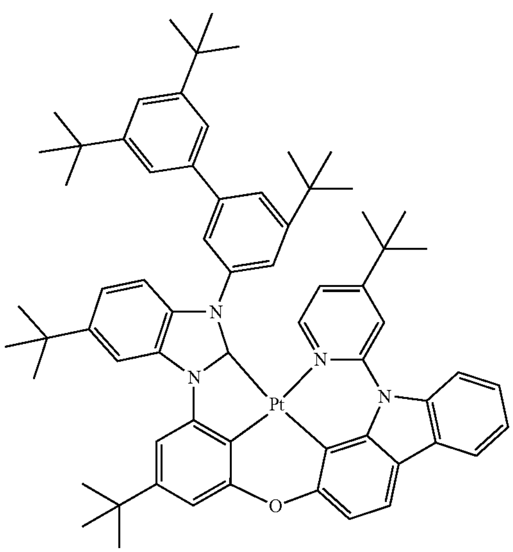
131
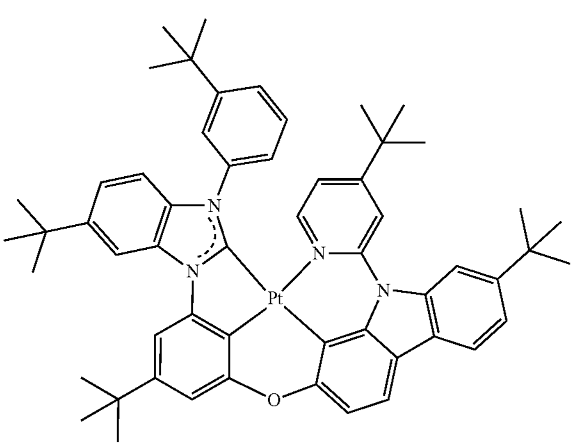
-continued
132
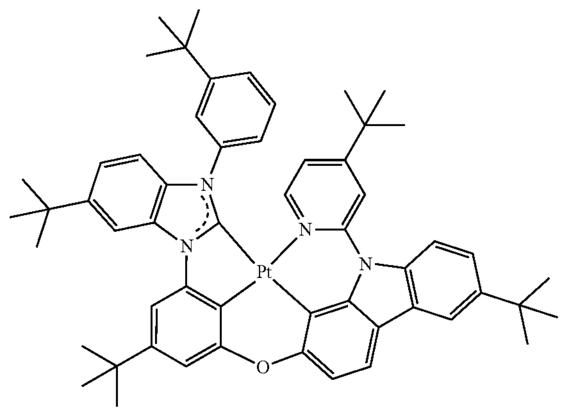
133
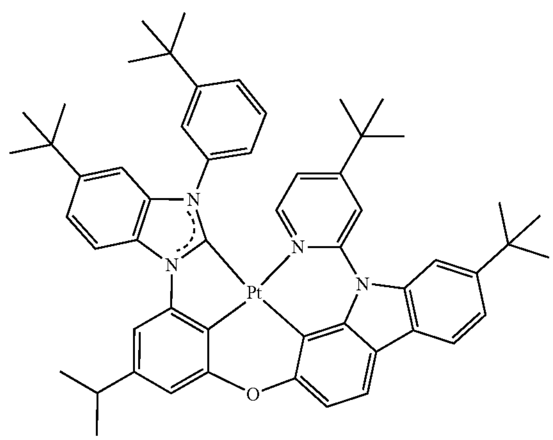
134
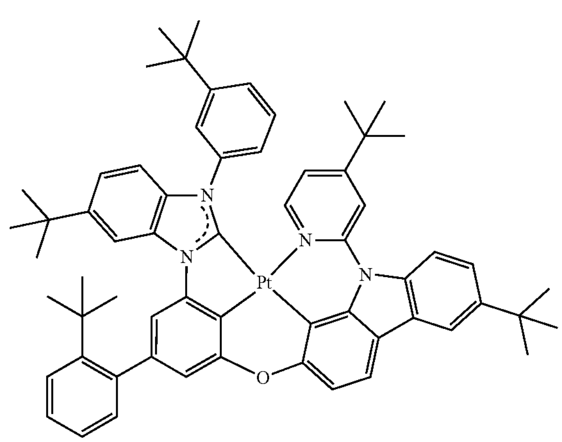

-continued
135
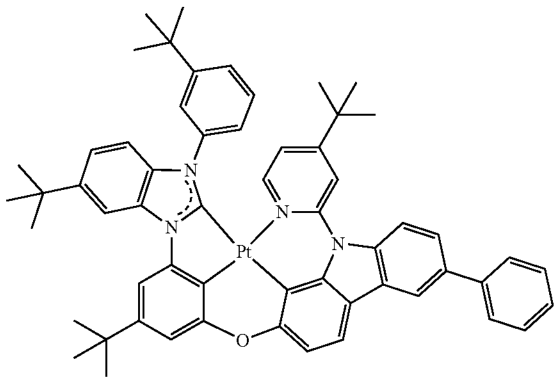
136
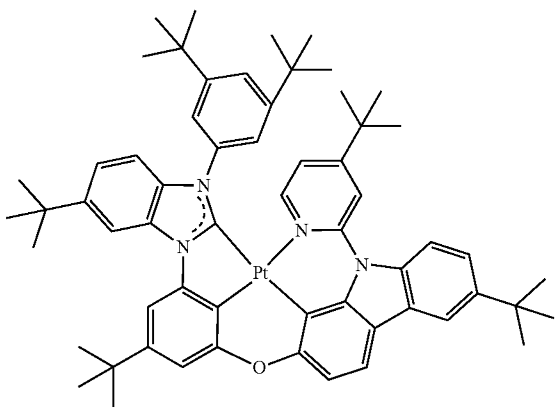
137
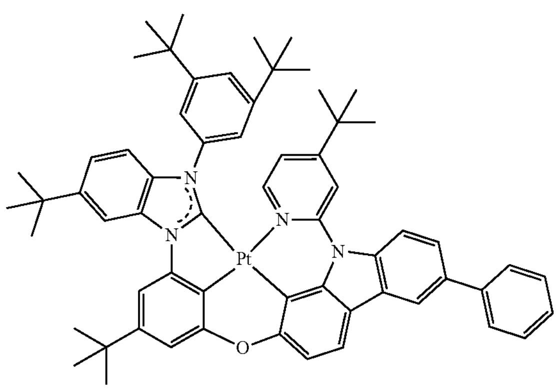
138
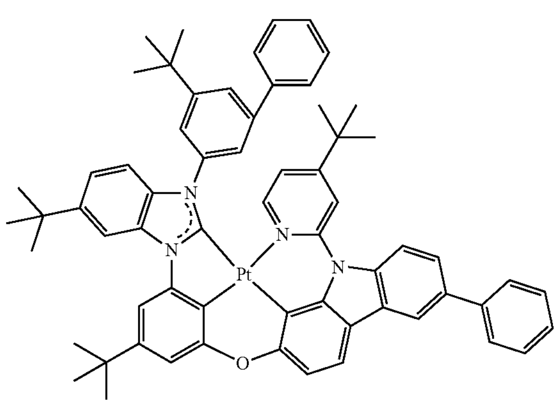
-continued
139
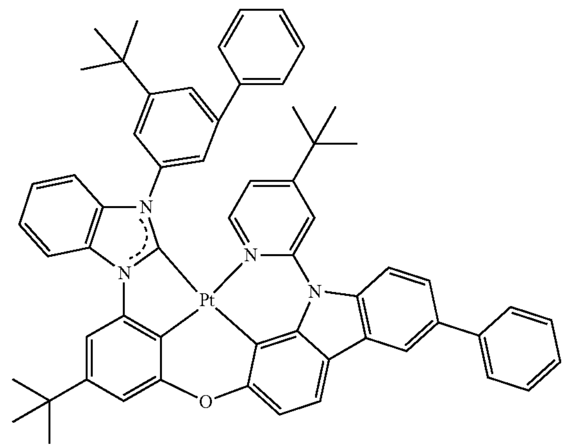
140
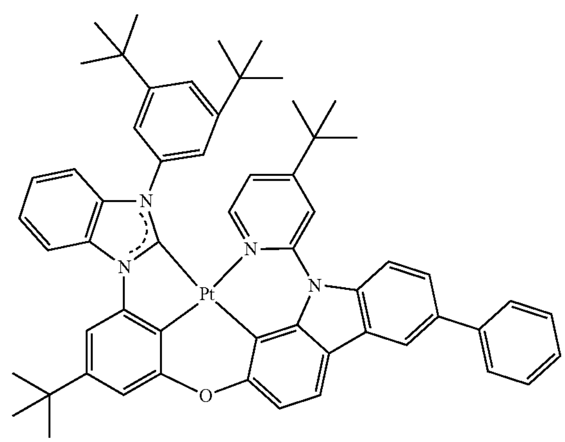
141
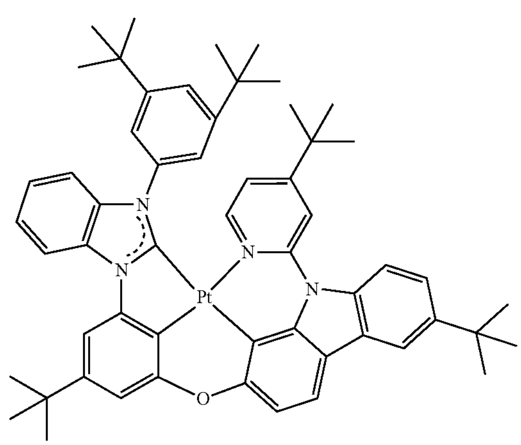

142
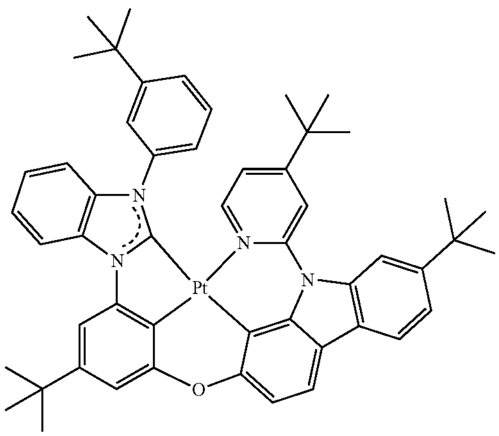
143
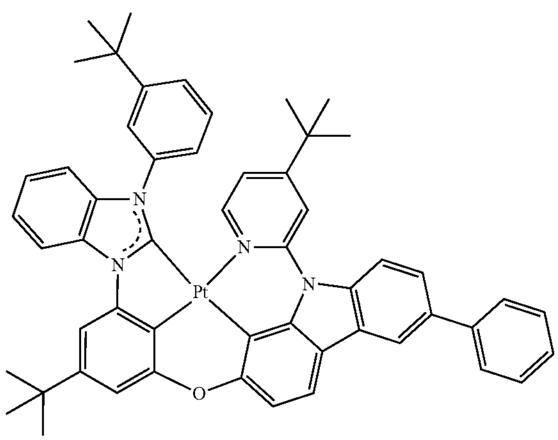
144
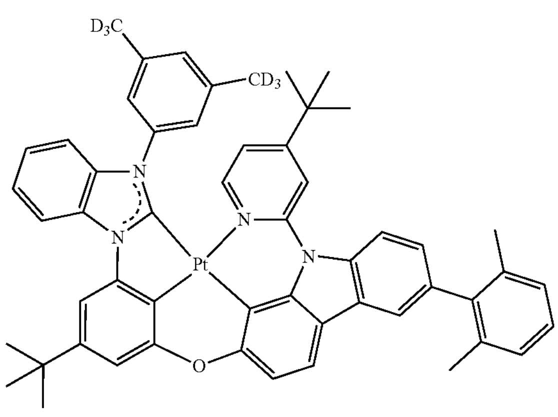
145
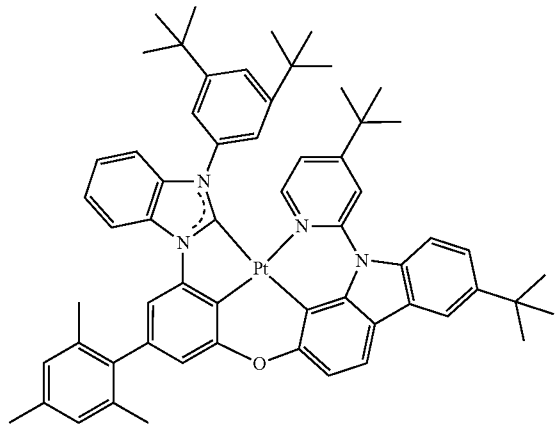
146
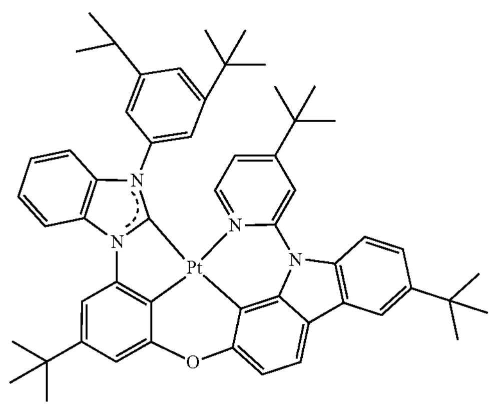
147
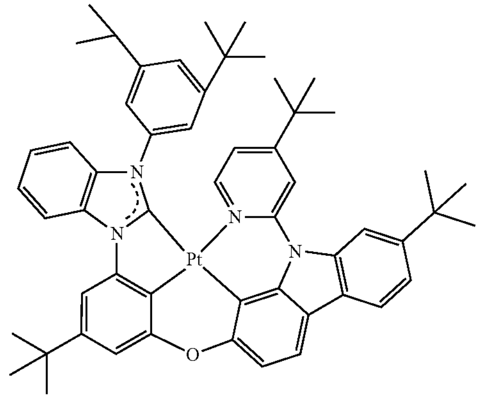

-continued
148
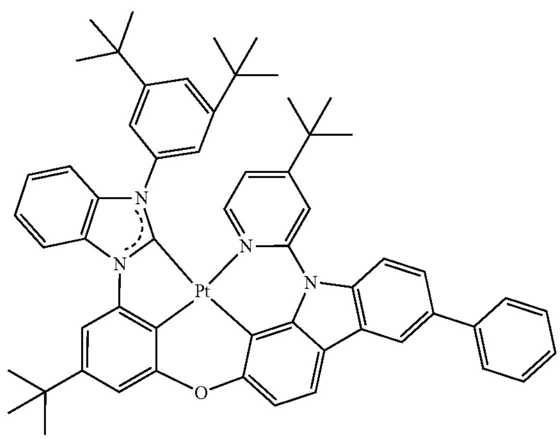
149
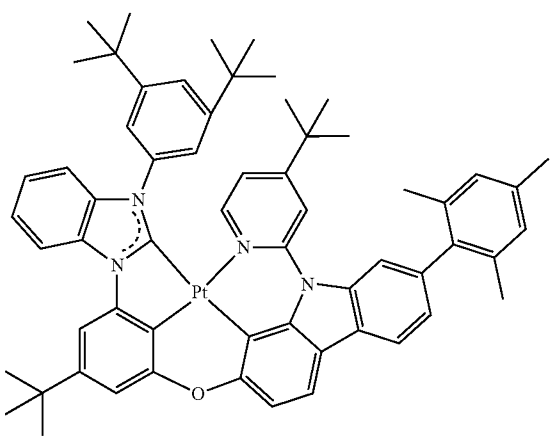
150
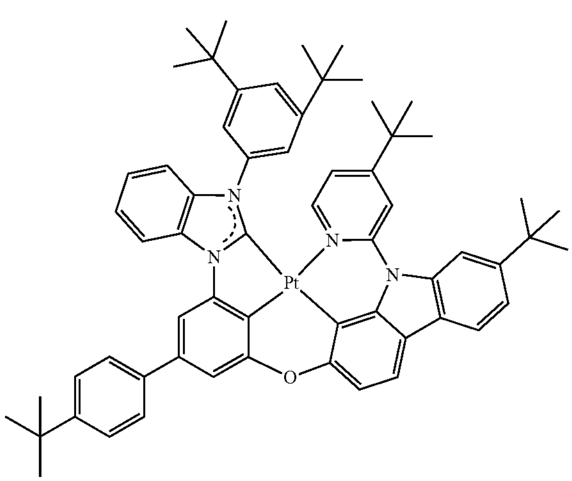
-continued
151
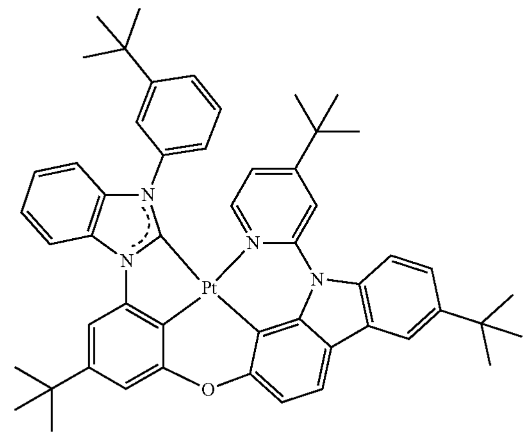
152
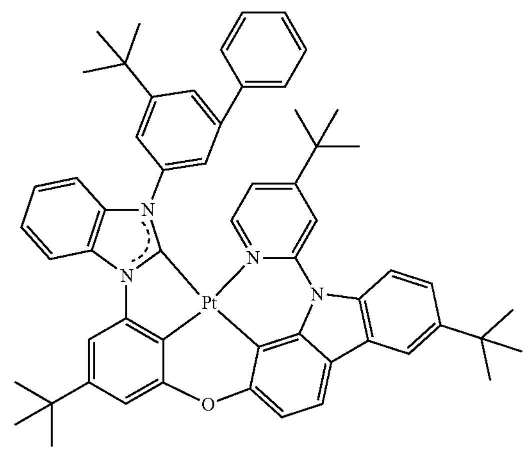
153
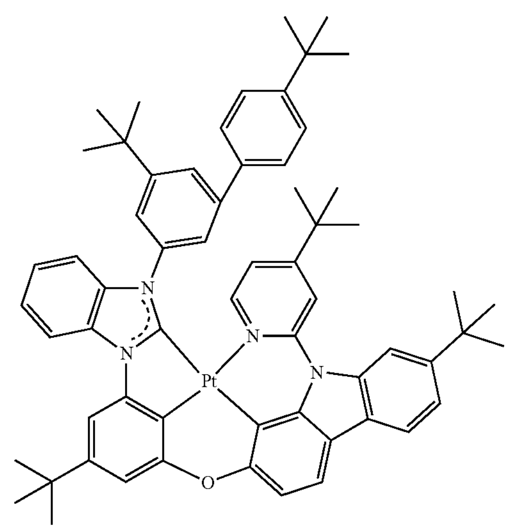

154
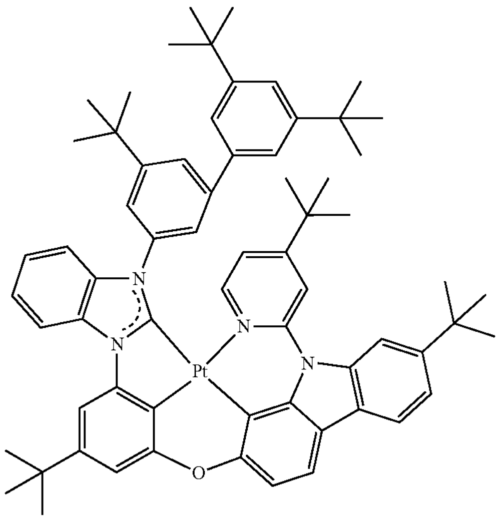
155
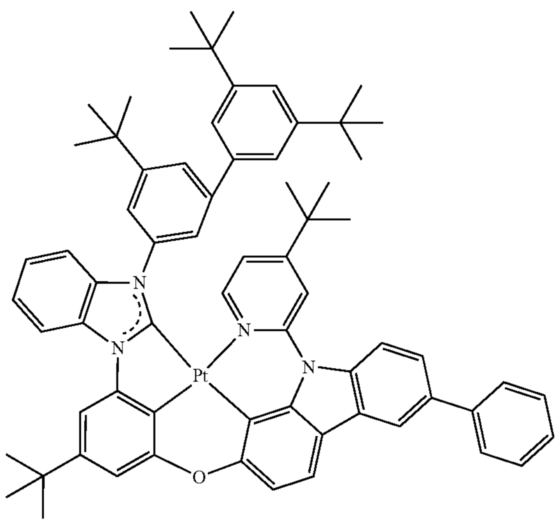
156
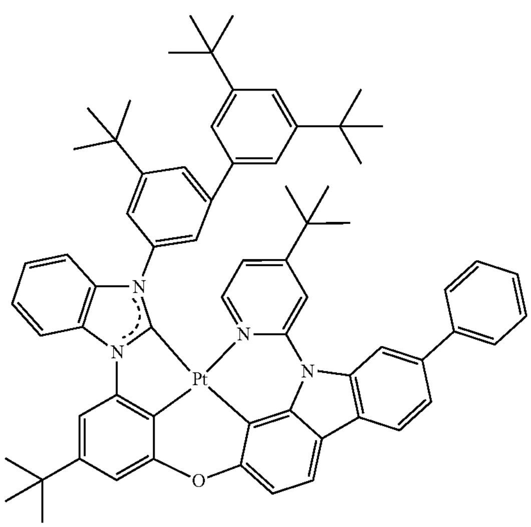
157
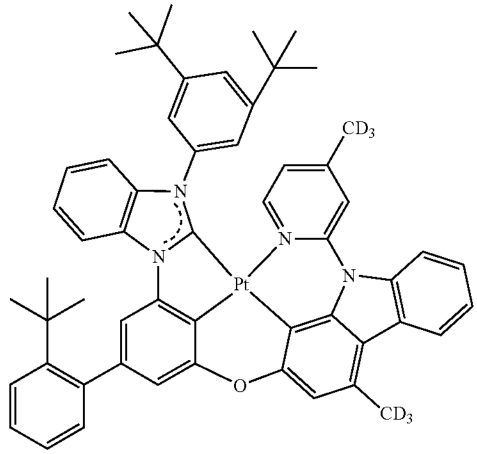
158
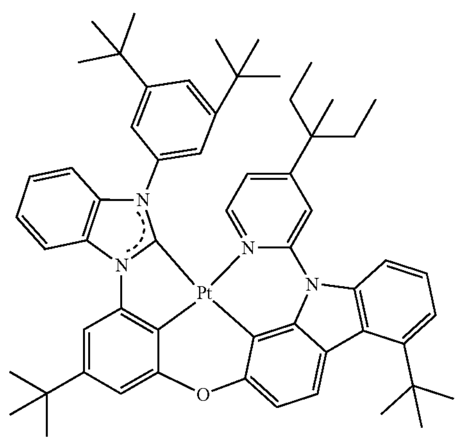
159
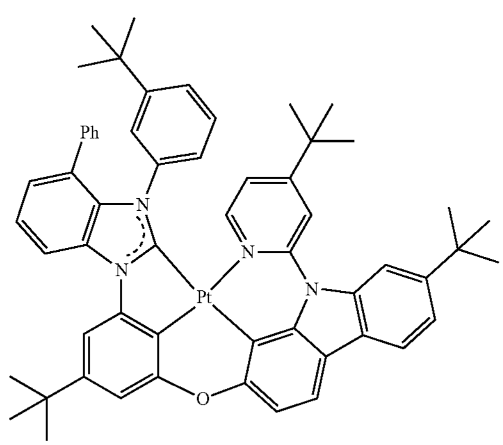

-continued
160
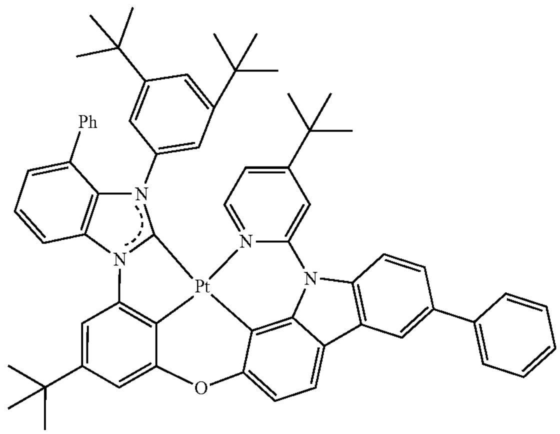
161
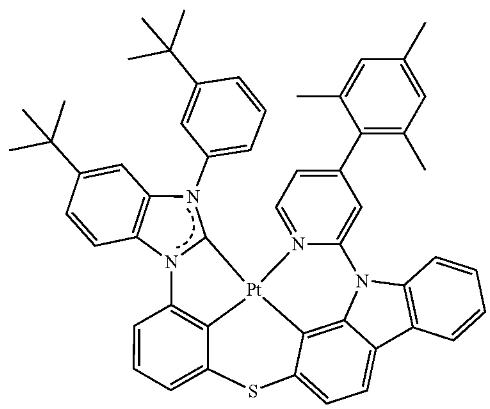
162
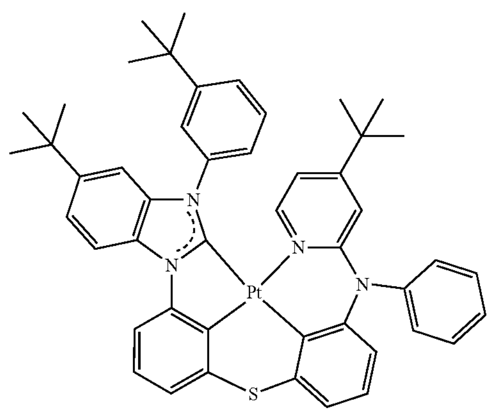
-continued
163
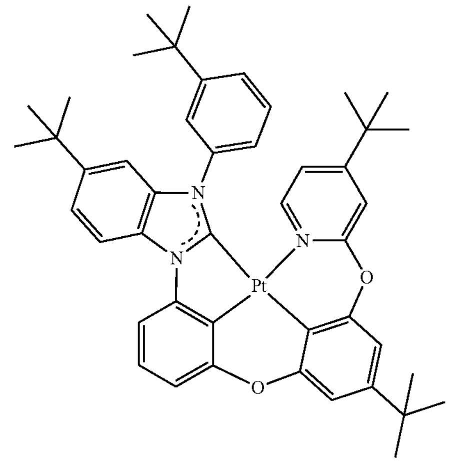
164
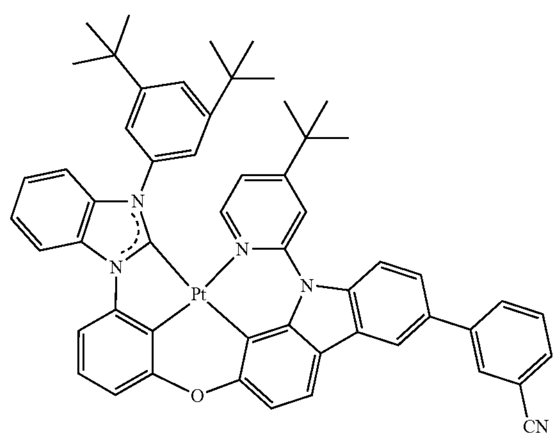
165
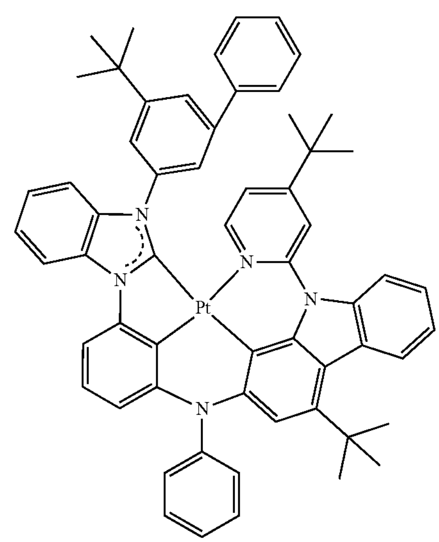

166
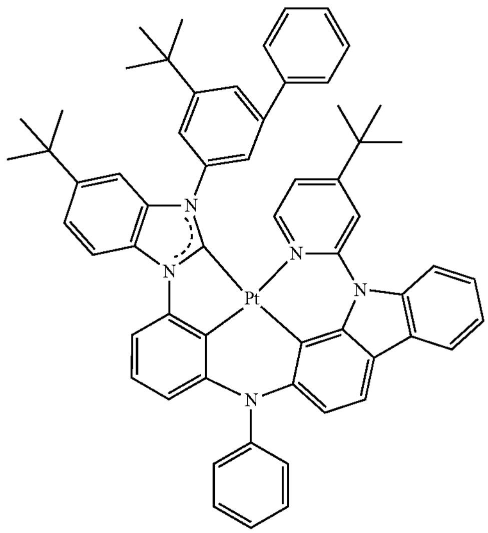
167
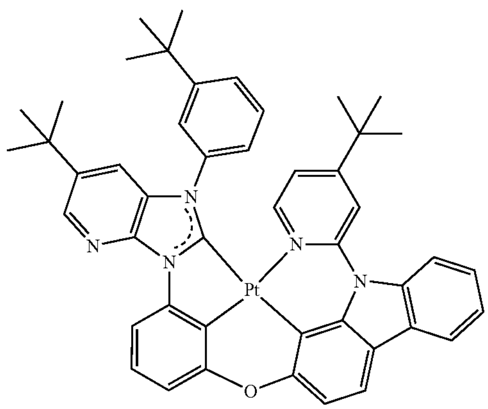
168
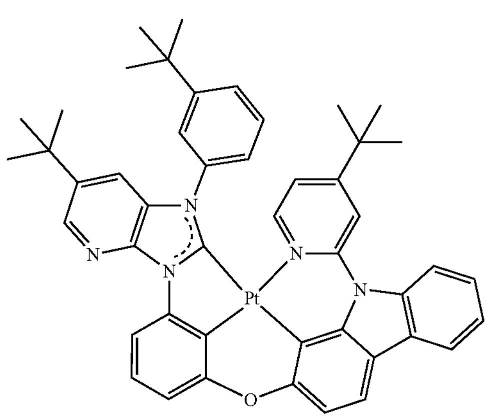
169
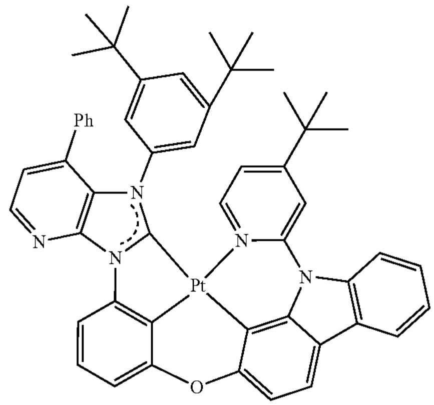
170
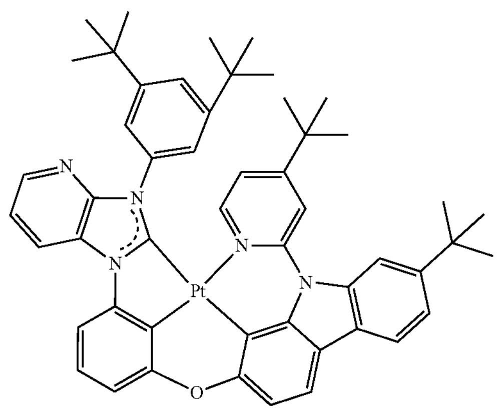
171
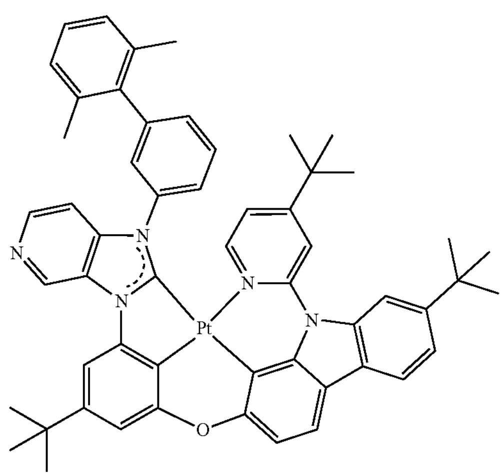

-continued
172
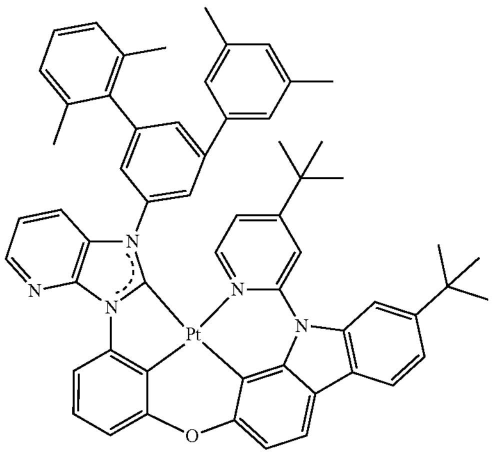
173
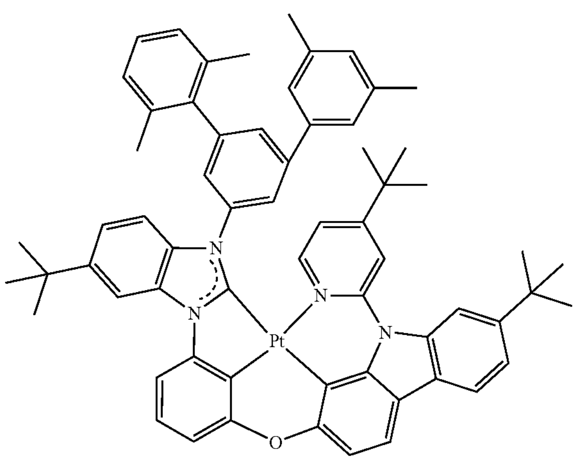
174
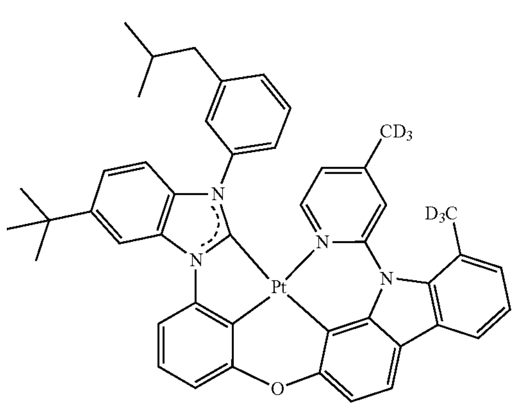
-continued
175
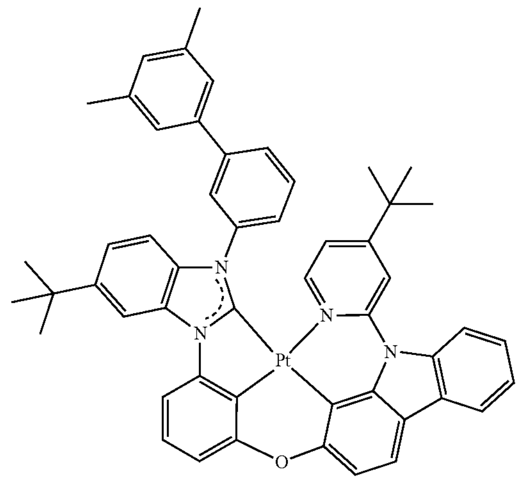
176
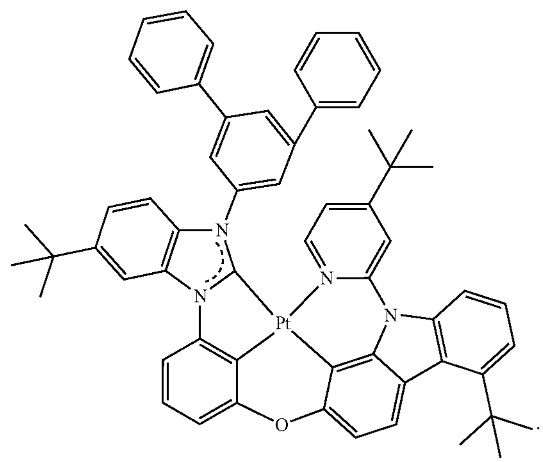
In one or more embodiments, the sensitizer may include Compound Pt1, but embodiments of the present disclosure are not limited thereto:
Pt1
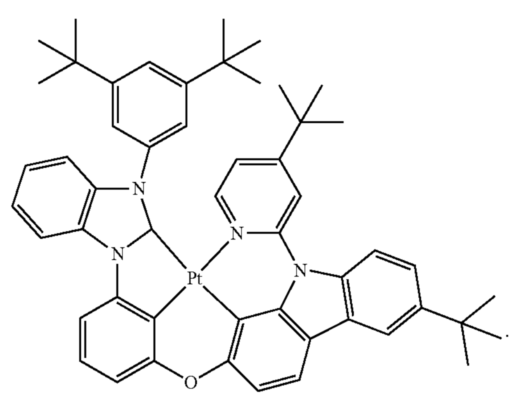
In one or more embodiments, the sensitizer may be represented by Formula 102 or 103, and in this case, the sensitizer may be referred to as a delayed fluorescence sensitizer:

Formula 102

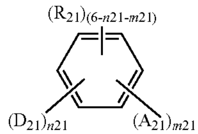

Formula 103

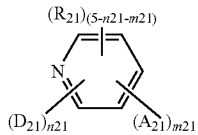

wherein, in Formulae 102 and 103, $A_{21}$ may be an acceptor group, $D_{21}$ may be a donor group, m21 may be 1, 2, or 3, and n21 may be 1, 2, or 3, the sum of n21 and m21 in Formula 101 may be 6 or less, and the sum of n21 and m21 in Formula 102 may be 5 or less, $R_{21}$ may be hydrogen, deuterium, —F, —Cl, —Br, —I, $SF_5$, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ alkylheteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —C($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$ ($Q_1$), —P(═O)($Q_1$)($Q_2$), or —P(═S)($Q_1$)($Q_2$), wherein a plurality of $R_{21}$(s) may optionally be linked to each other to form a substituted or unsubstituted $C_5$-$C_{30}$ carbocyclic group or a substituted or unsubstituted $C_1$-$C_{30}$ heterocyclic group, and $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent aromatic condensed polycyclic group, a monovalent aromatic heteropolycyclic group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with deuterium, —F, a cyano group, a $C_1$-$C_{60}$ alkyl group, a $C_6$-$C_{60}$ aryl group, or any combination thereof.

For example, $A_{21}$ in Formulae 102 and 103 may be a substituted or unsubstituted π electron-deficient nitrogen-free cyclic group.

In an embodiment, the π electron-deficient nitrogen-free cyclic group may be: a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a triindolobenzene group; or a condensed cyclic group of two or more π electron-deficient nitrogen-free cyclic groups, but embodiments of the present disclosure are not limited thereto.

For example, $D_{21}$ in Formulae 102 and 103 may be:—F, a cyano group, or an π-electron deficient nitrogen-containing cyclic group;

a $C_1$-$C_{60}$ alkyl group, an π-electron deficient nitrogen-containing cyclic group, or an π electron-deficient nitrogen-free cyclic group, each substituted with at least one —F a cyano group, or any combination thereof; or an π-electron deficient nitrogen-containing cyclic group, each substituted with at least one deuterium, a $C_1$-$C_{60}$ alkyl group, an π-electron deficient nitrogen-containing cyclic group, an π electron-deficient nitrogen-free cyclic group, or any combination thereof.

In detail, the π electron-deficient nitrogen-free cyclic group may be the same as described above.

The term "π electron-deficient nitrogen-containing cyclic group" as used herein refers to a cyclic group having at least one *—N═*' moiety, and, for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, and a benzimidazolobenzimidazole group; or a condensed cyclic group in which two or more π electron-efficient nitrogen-containing cyclic groups are condensed with each other.
In one or more embodiments, the sensitizer may be of Groups X to XV, but embodiments of the present disclosure are not limited thereto:
Group X
1
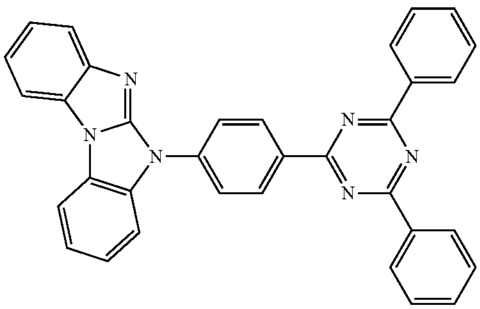
2
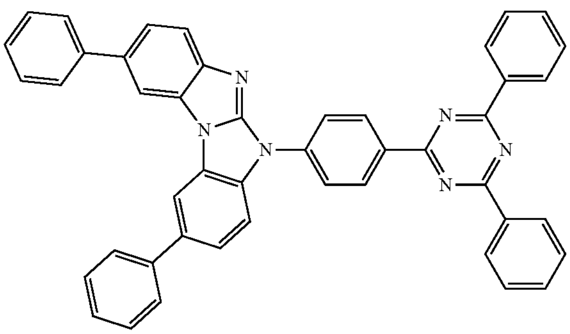
3
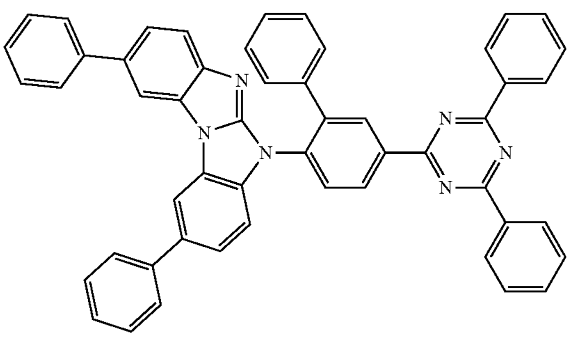
4
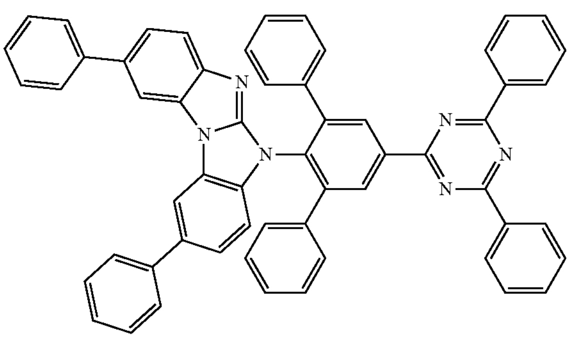
-continued
5
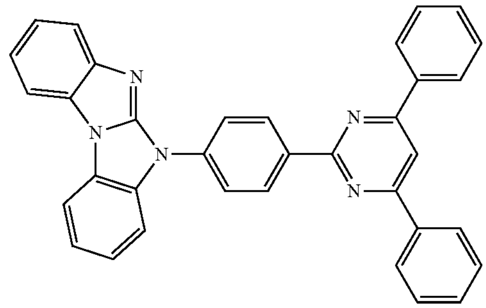
6
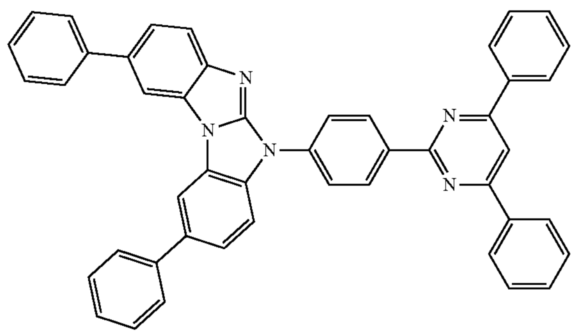
7
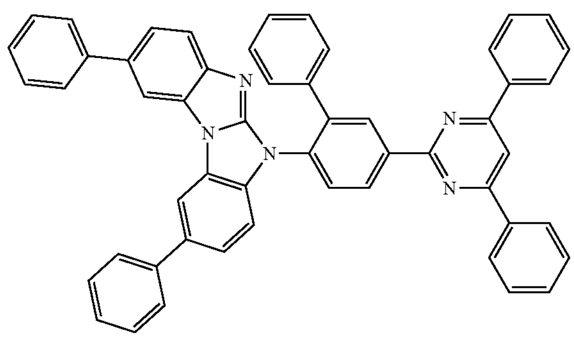
8
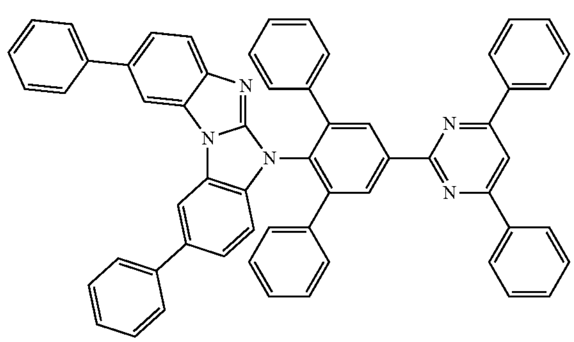

-continued
9
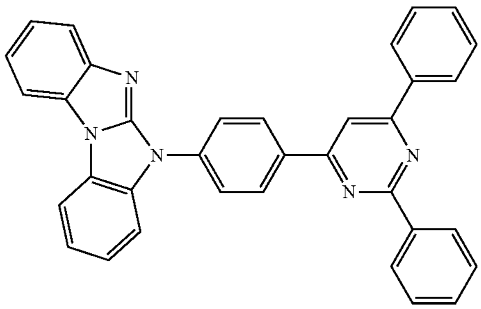
10
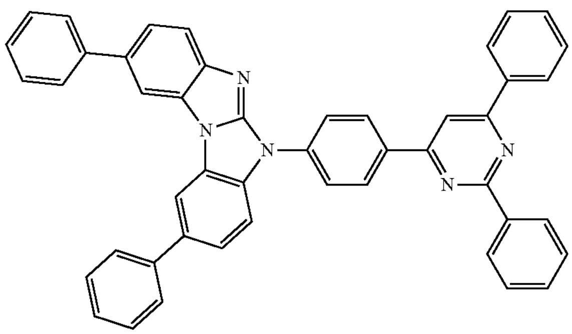
11
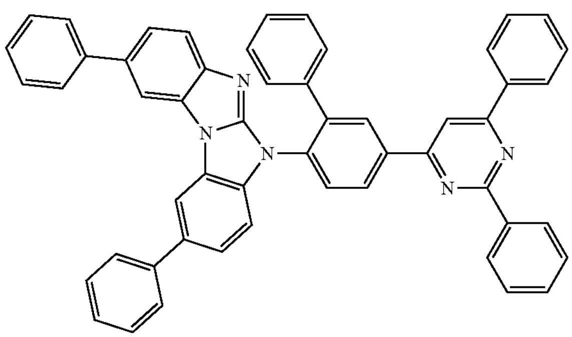
12
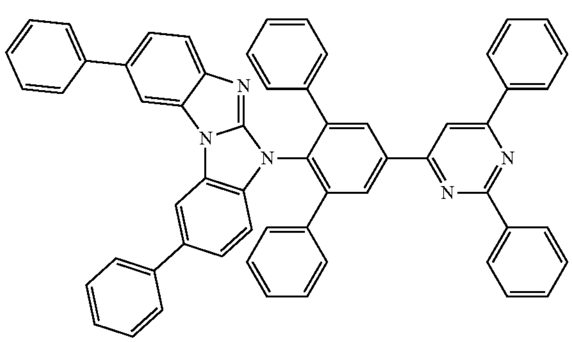
-continued
13
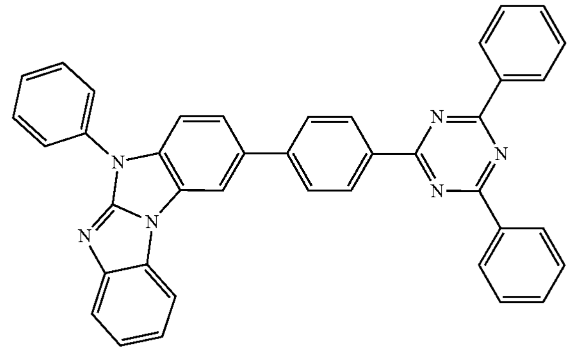
14
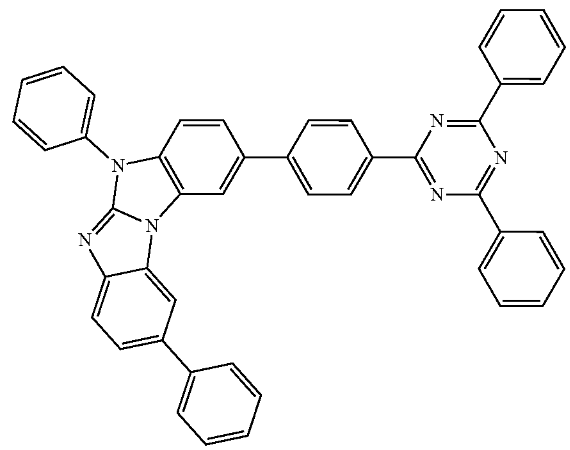
15
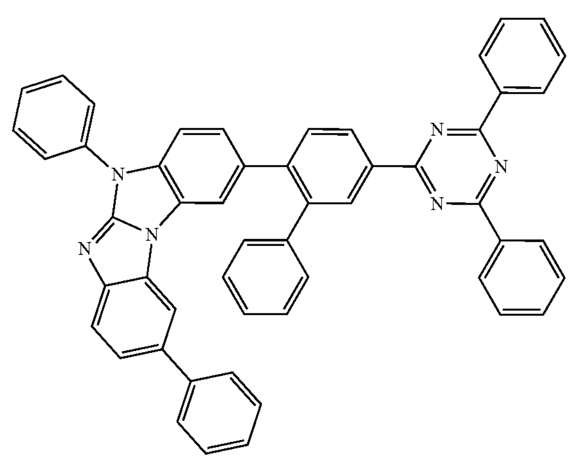

-continued
16
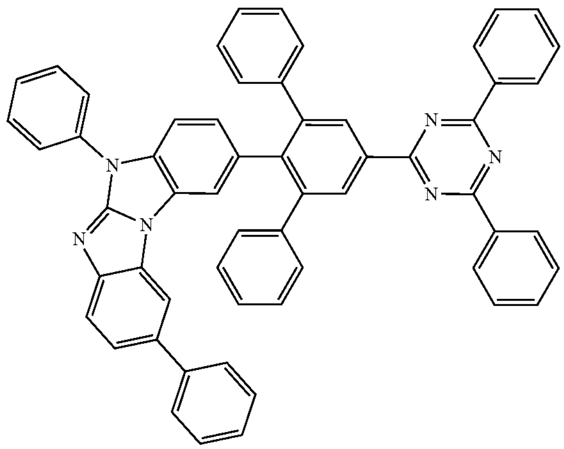
17
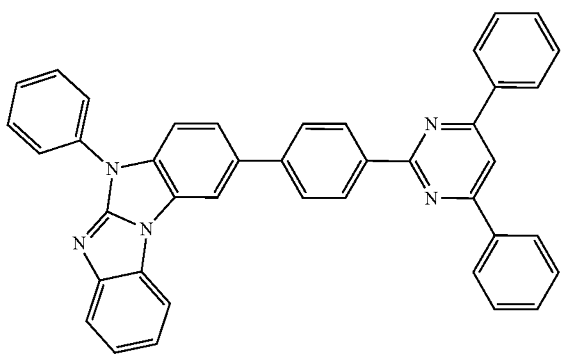
18
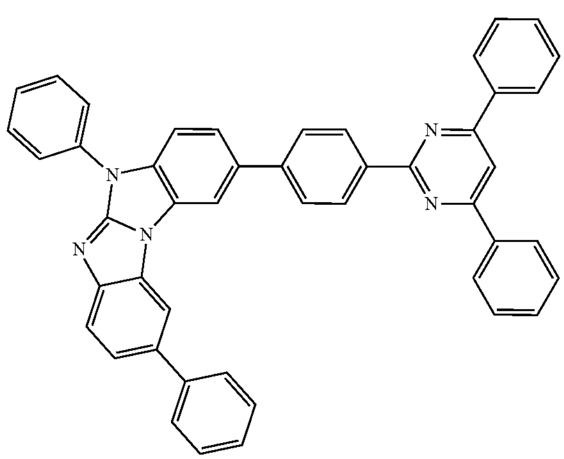
-continued
19
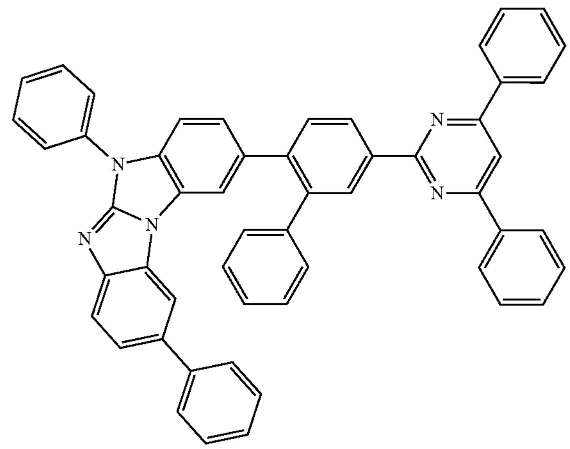
20
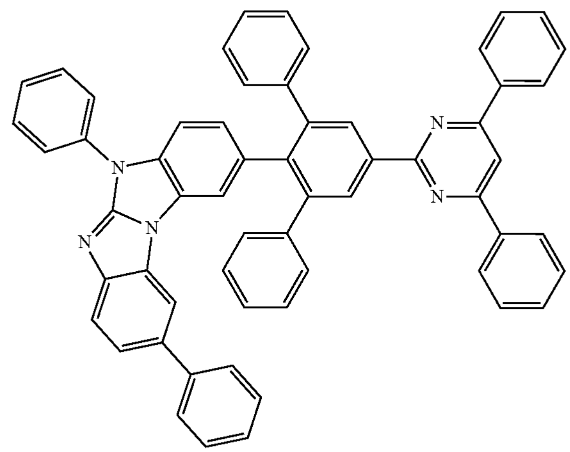
21
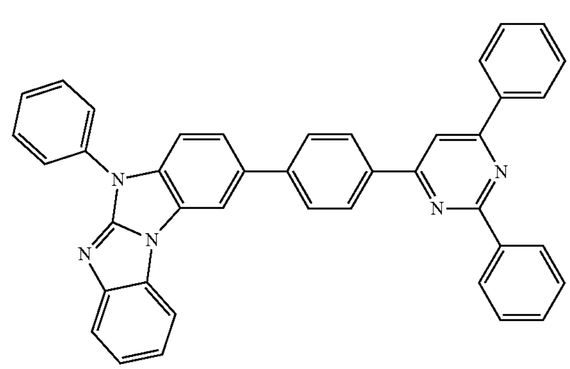

-continued
22
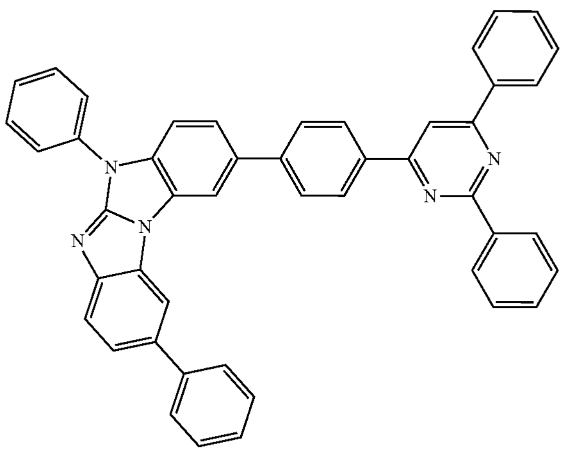
23
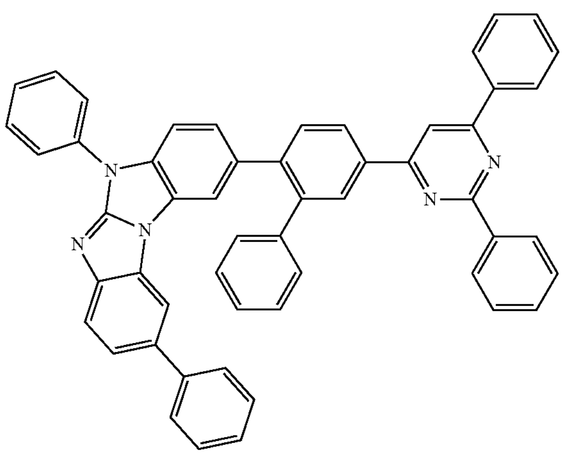
24
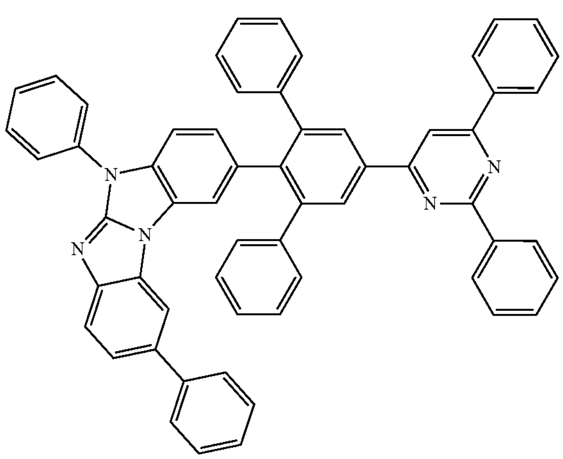
-continued
25
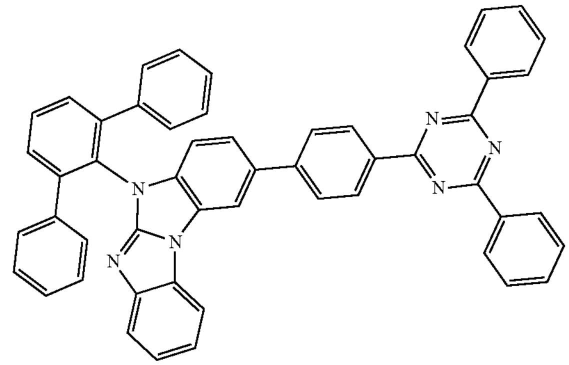
26
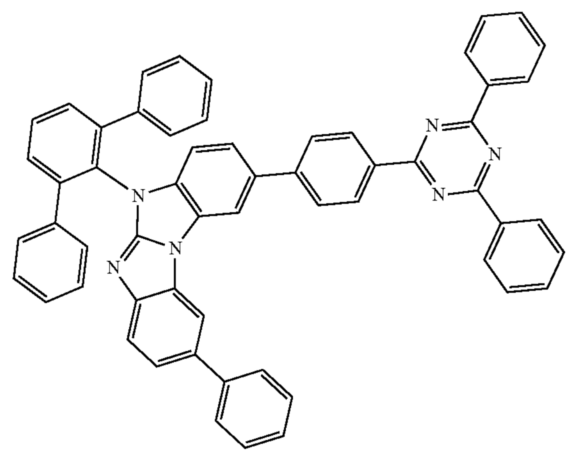
27
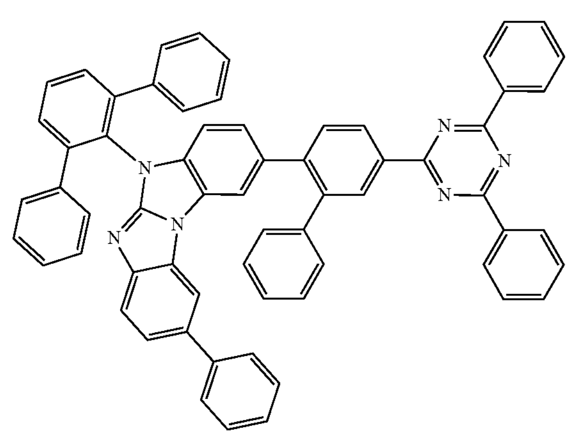

-continued
28
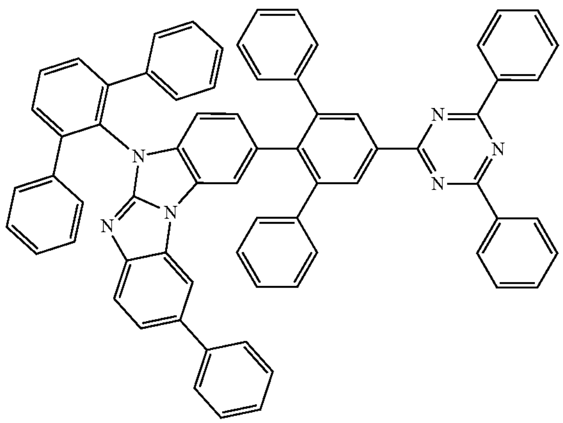
29
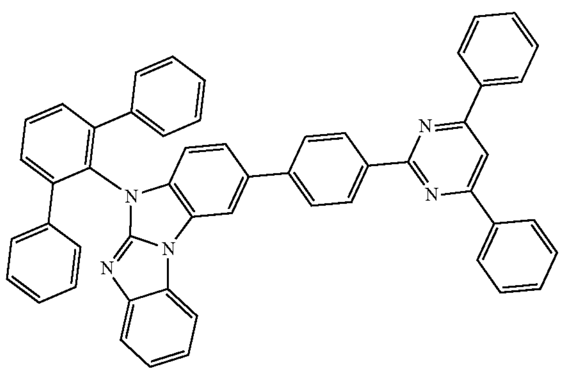
30
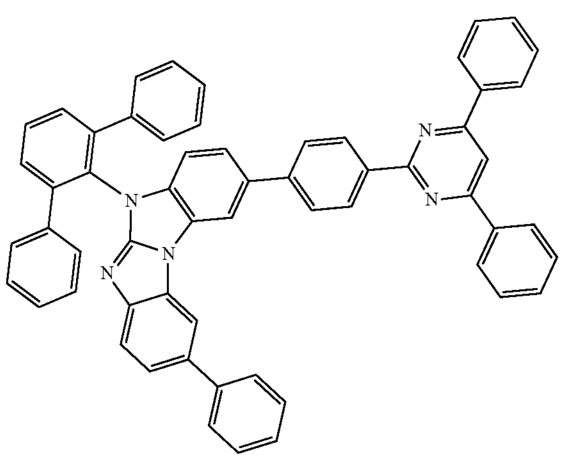
-continued
31
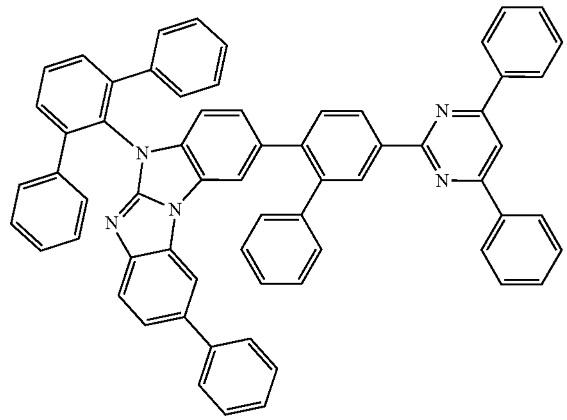
32
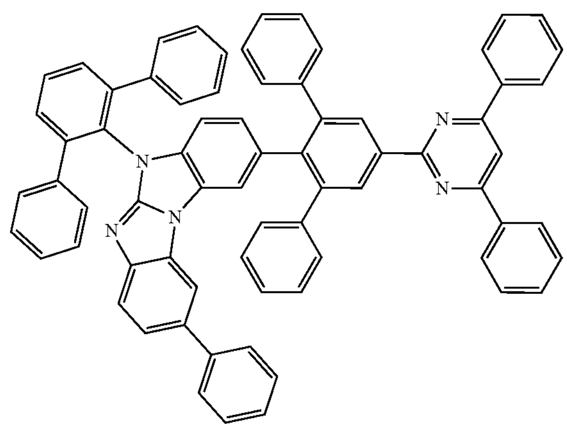
33
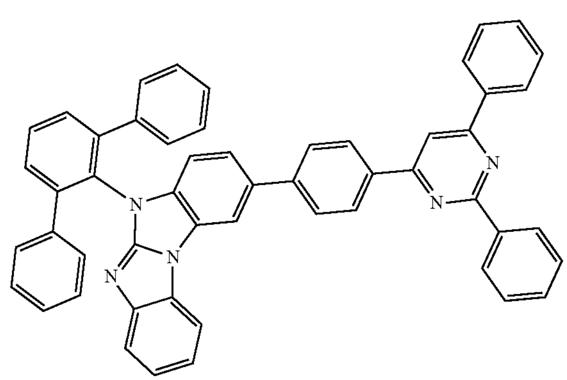

-continued
34
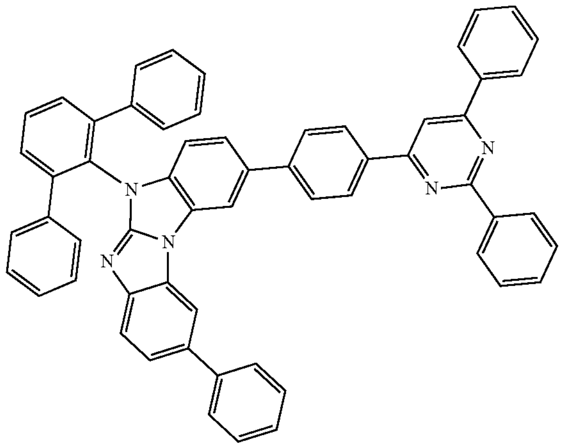
35
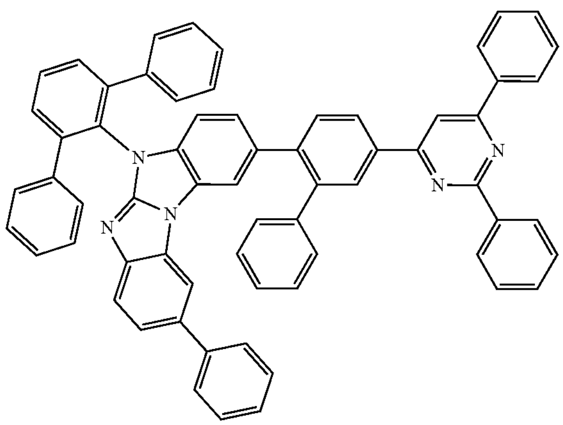
36
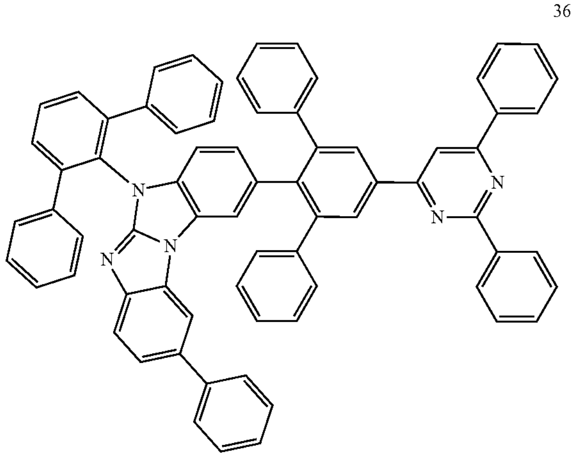
-continued
37
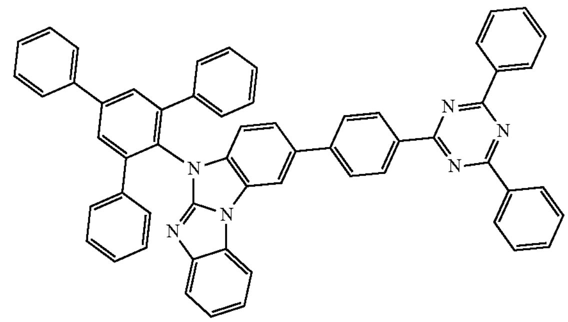
38
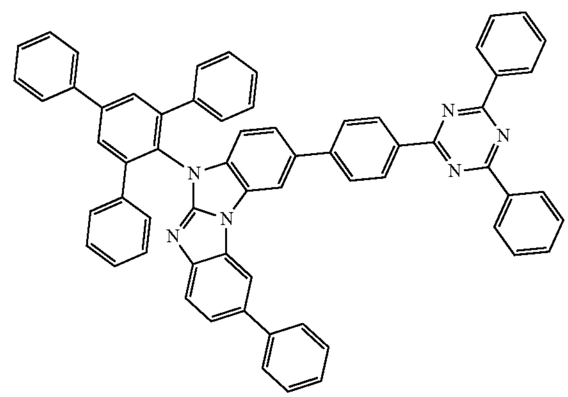
39
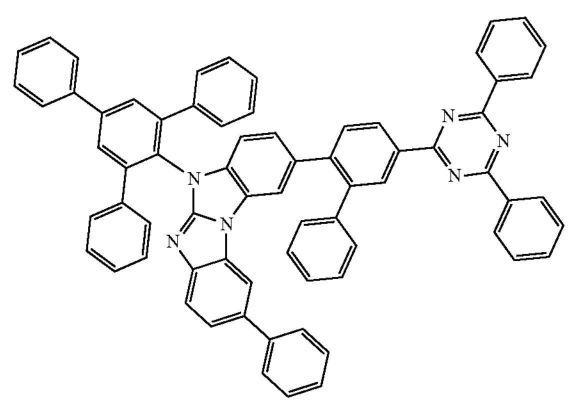
40
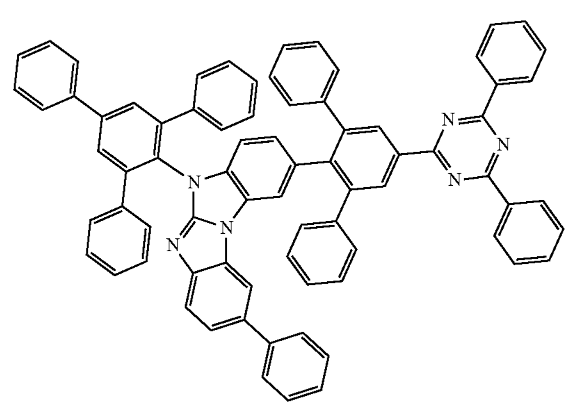

-continued
41
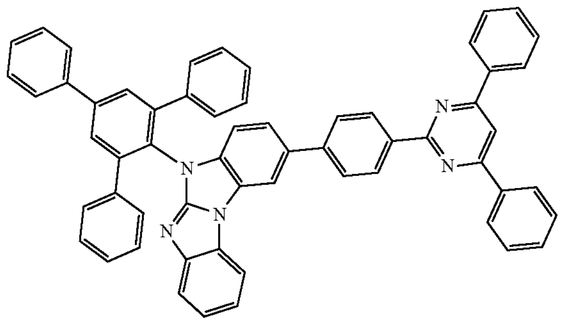
42
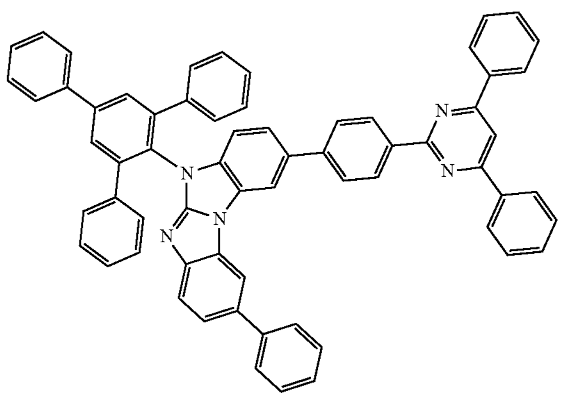
43
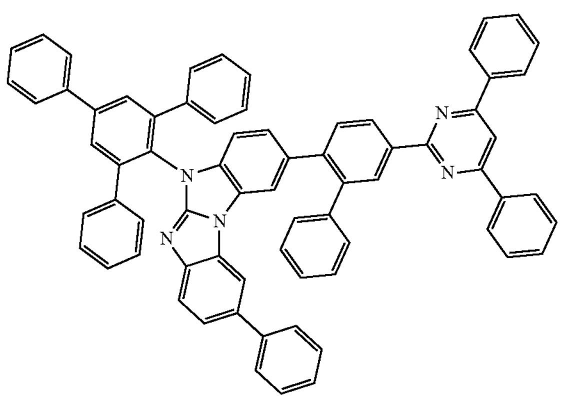
44
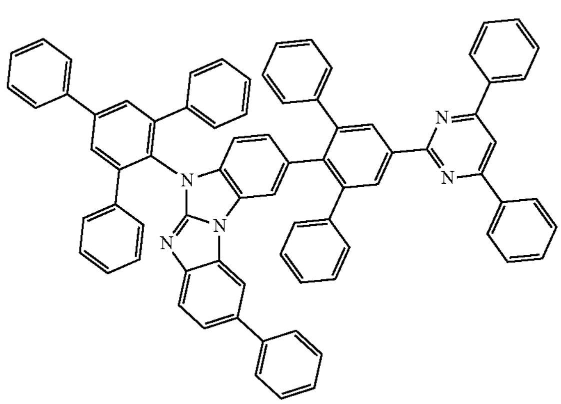
-continued
45
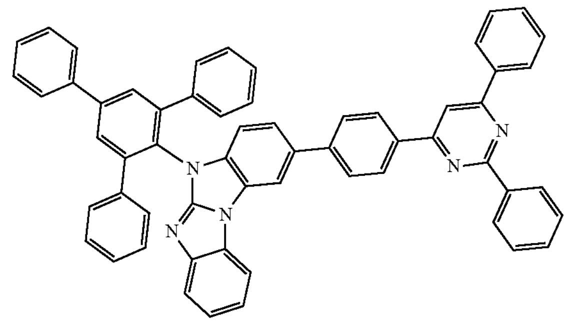
46
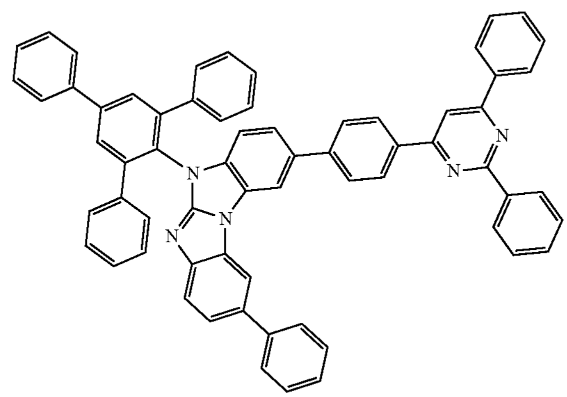
47
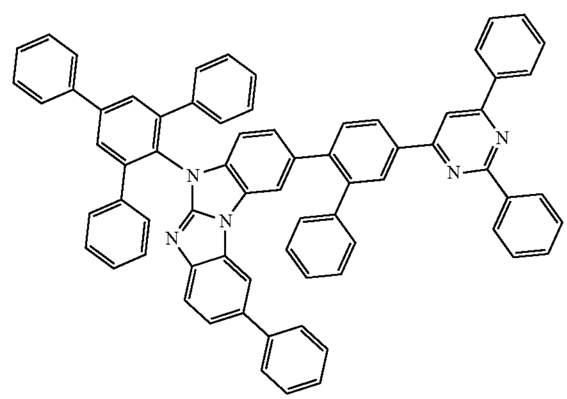
48
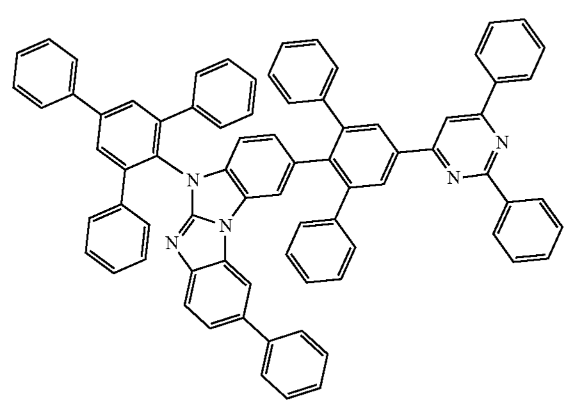

-continued
49
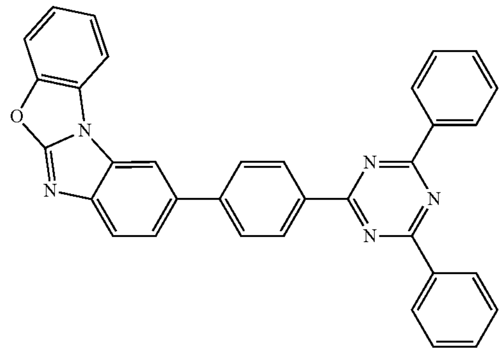
50
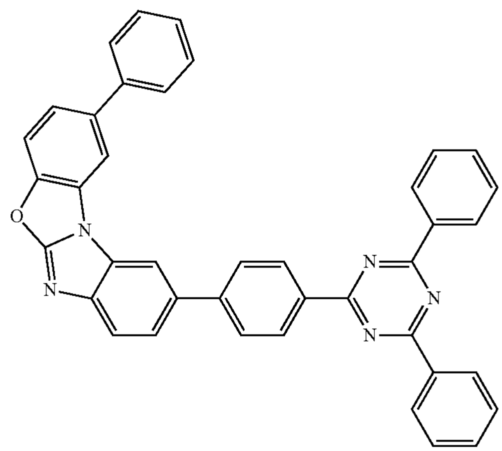
51
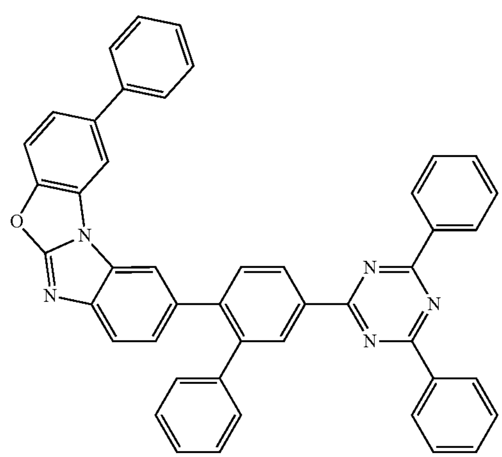
-continued
52
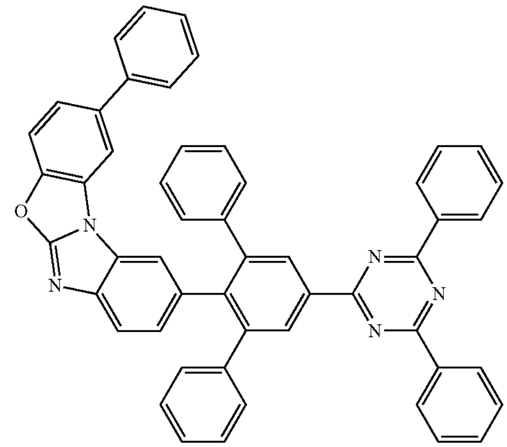
53
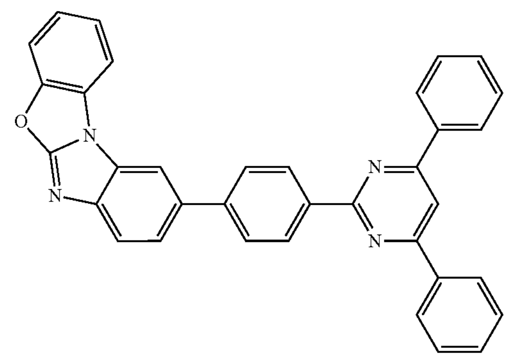
54
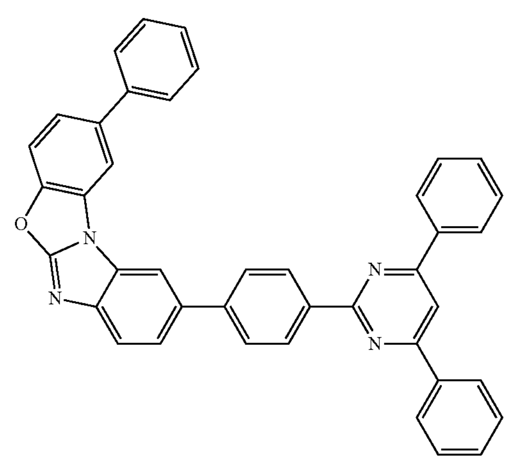

-continued
55
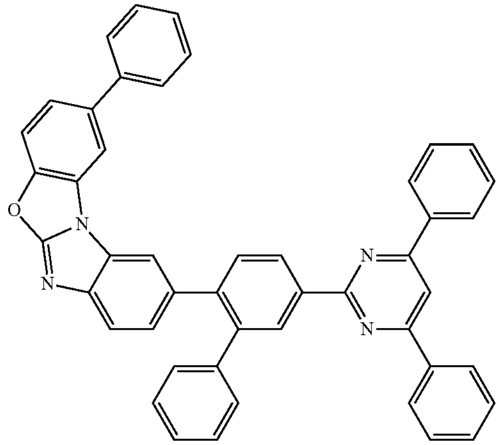
58
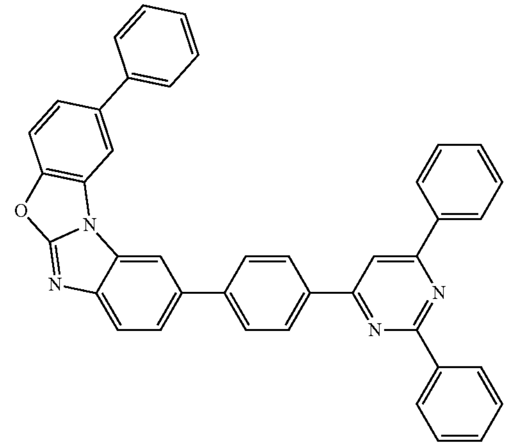
56
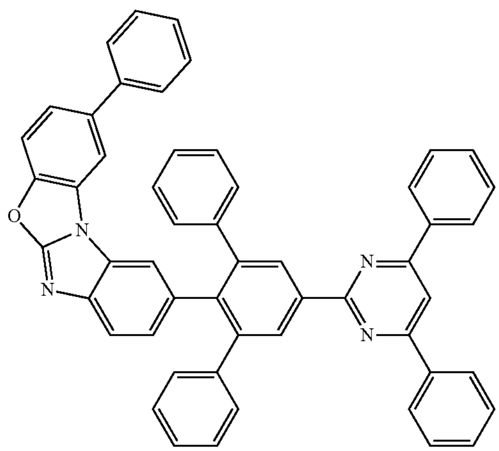
59
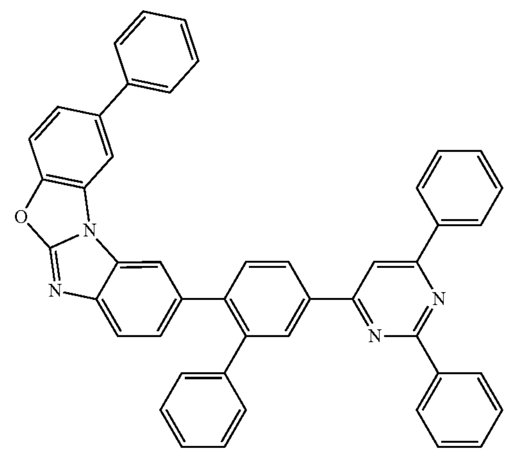
57
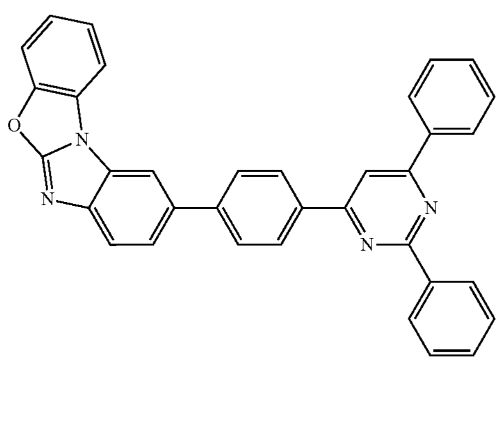
60
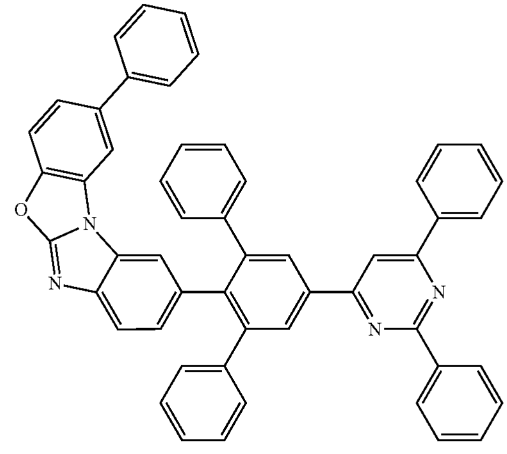

-continued
61
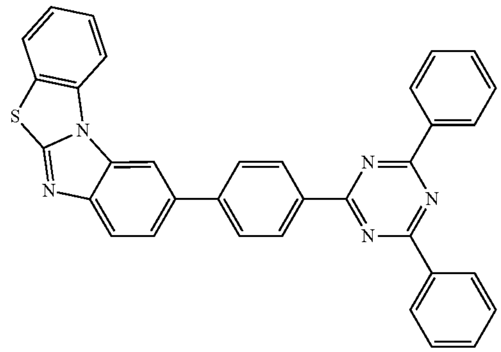
62
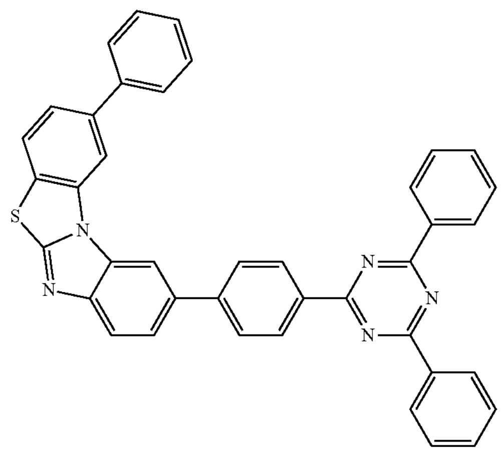
63
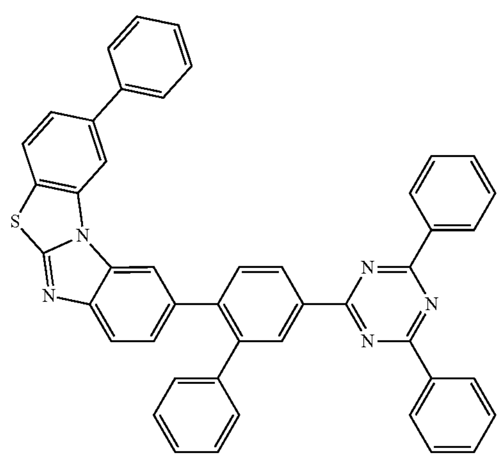
-continued
64
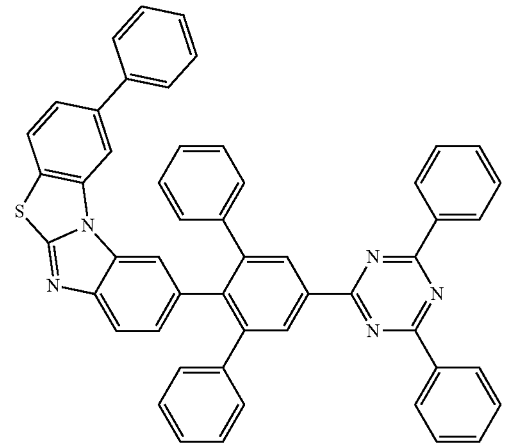
65
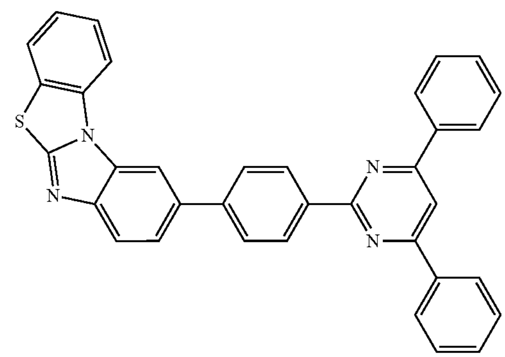
66
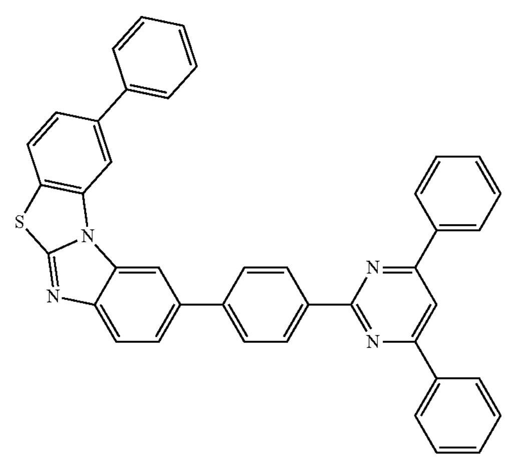

-continued
67
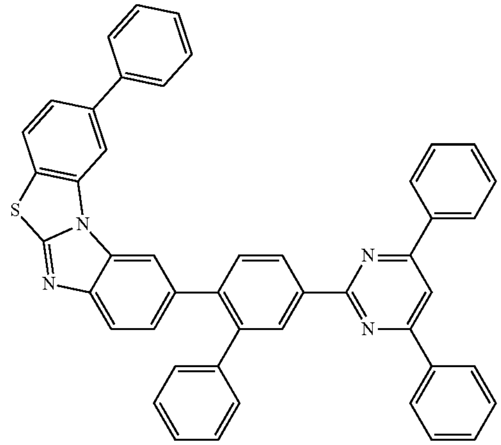
68
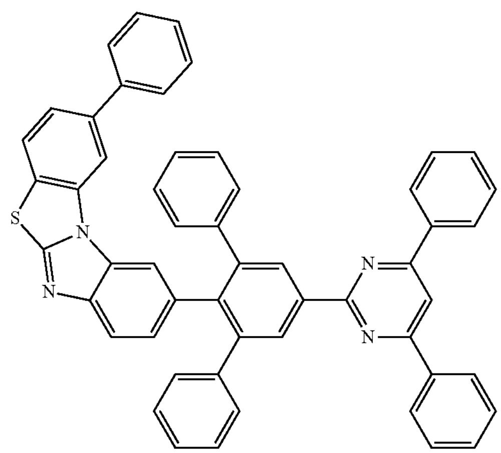
69
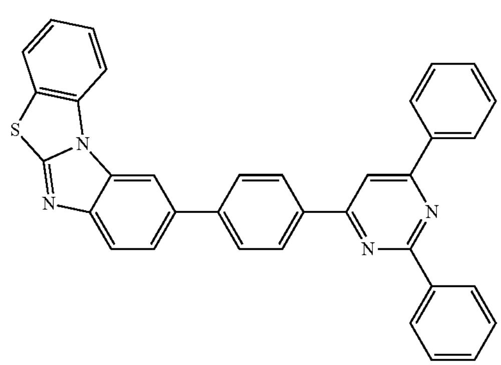
-continued
70
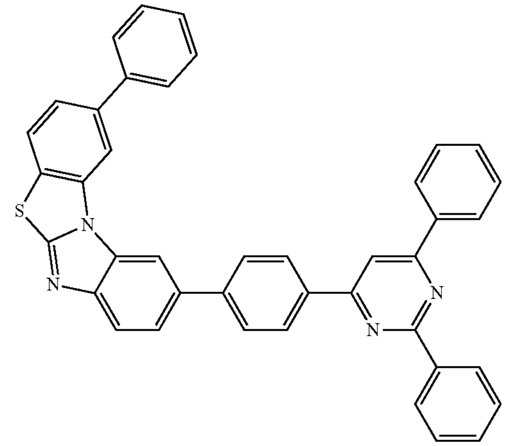
71
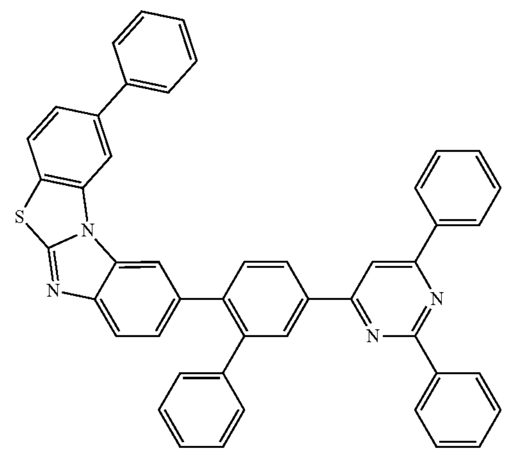
72
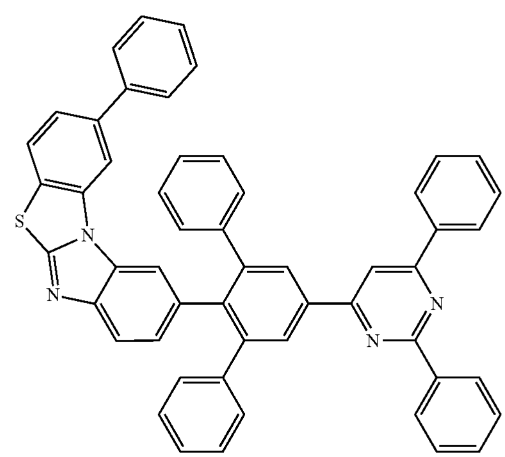

-continued
73
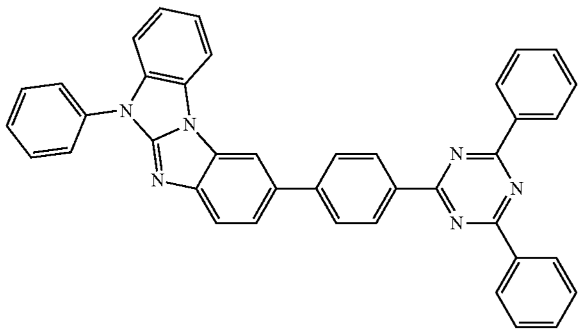
74
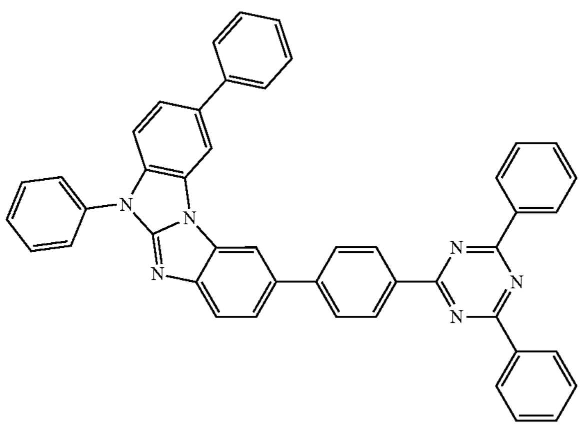
75
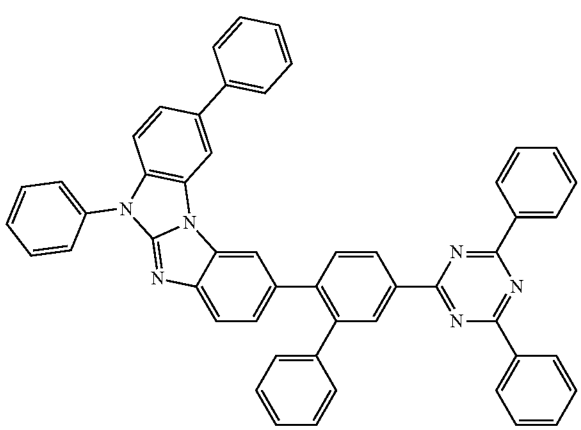
-continued
76
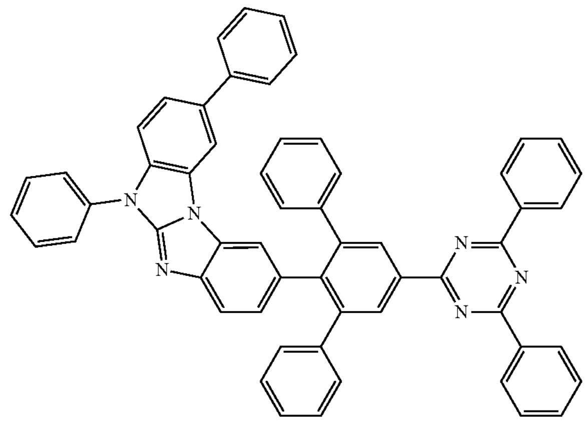
77
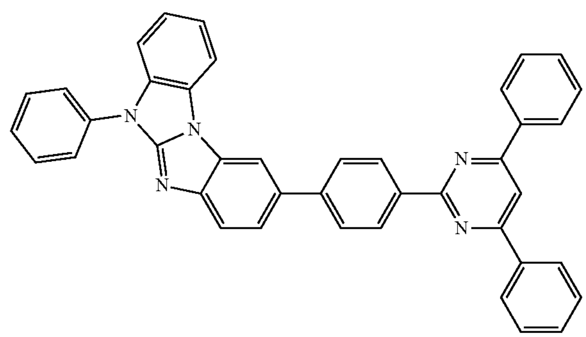
78
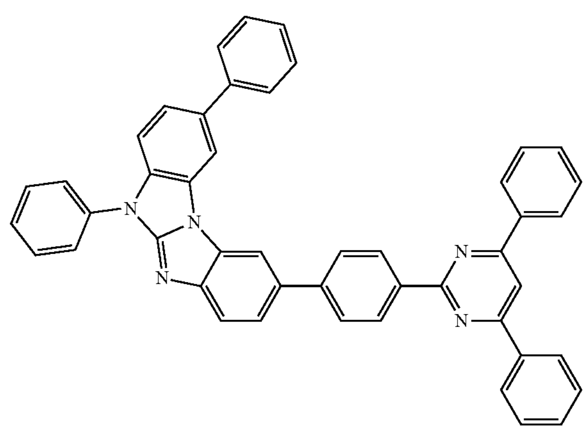

79
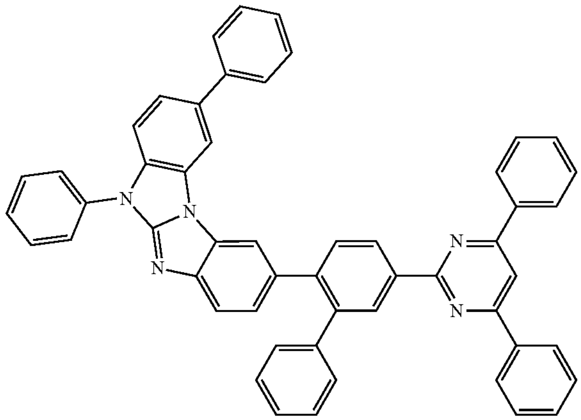
80
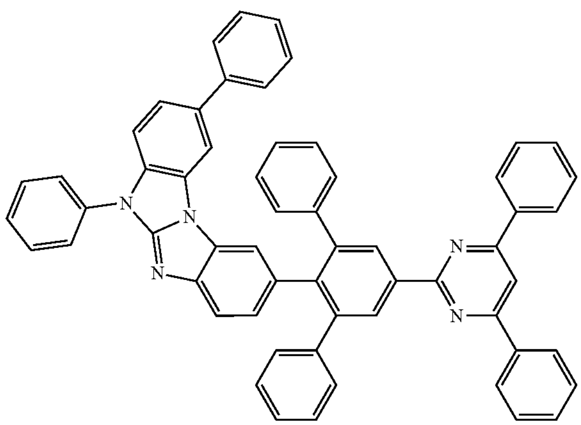
81
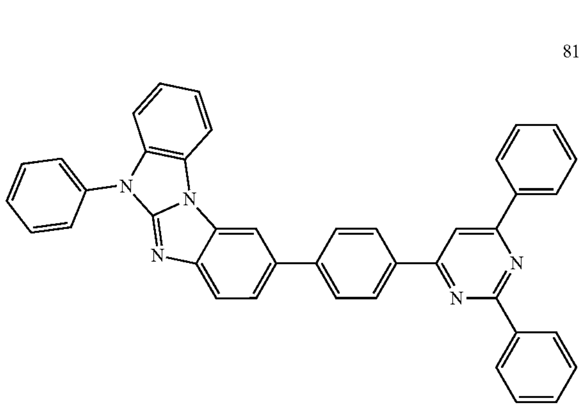
82
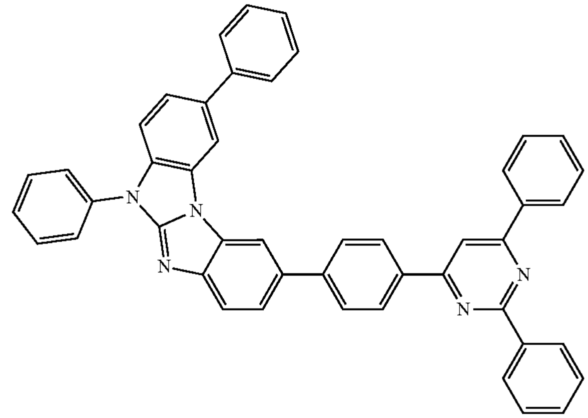
83
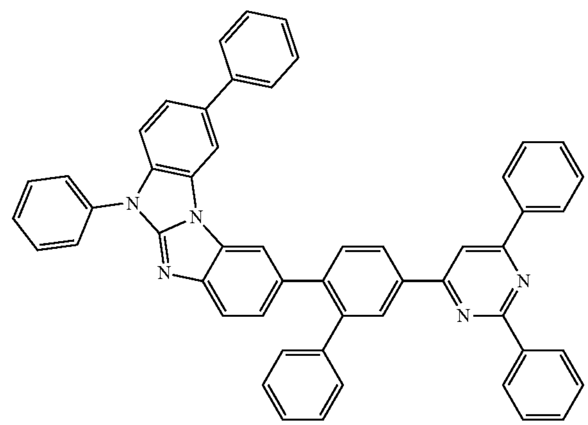
84
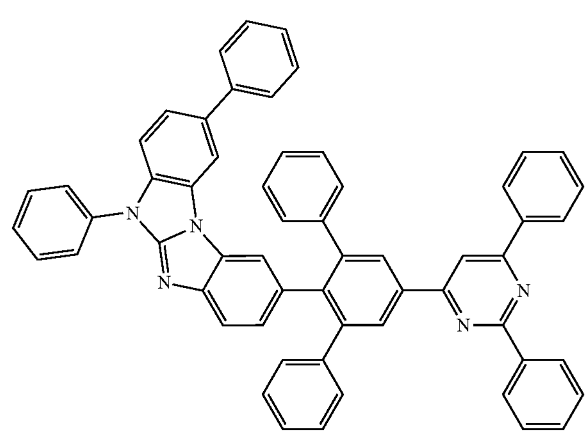

-continued
85
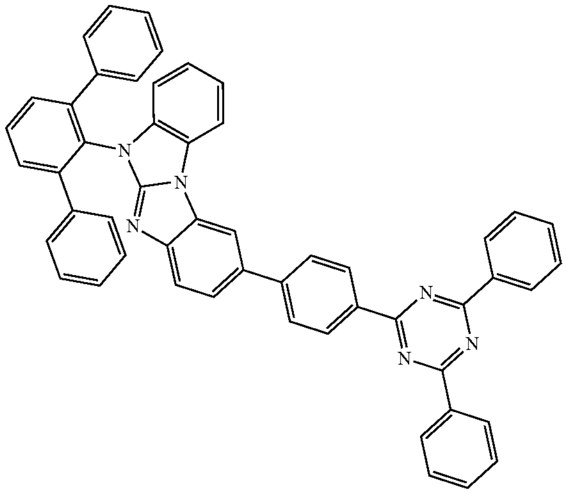
86
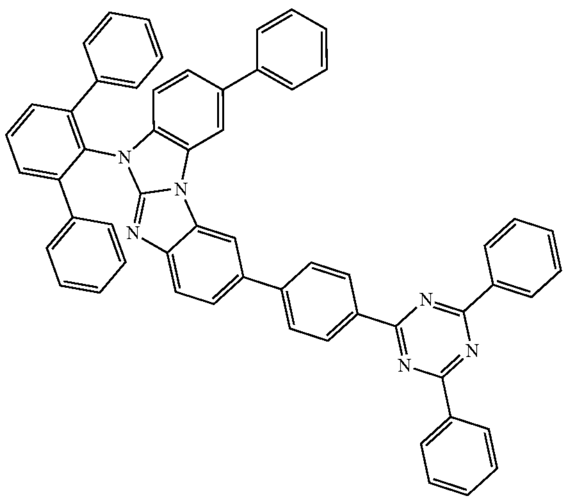
87
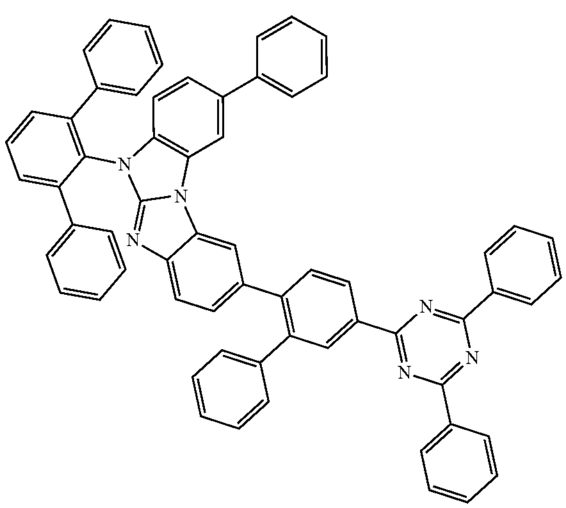
-continued
88
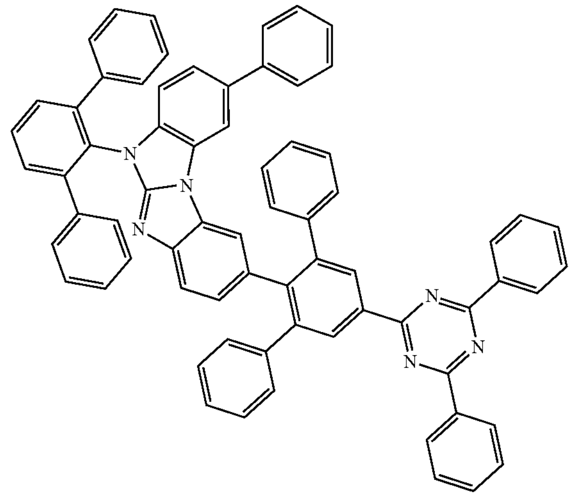
89
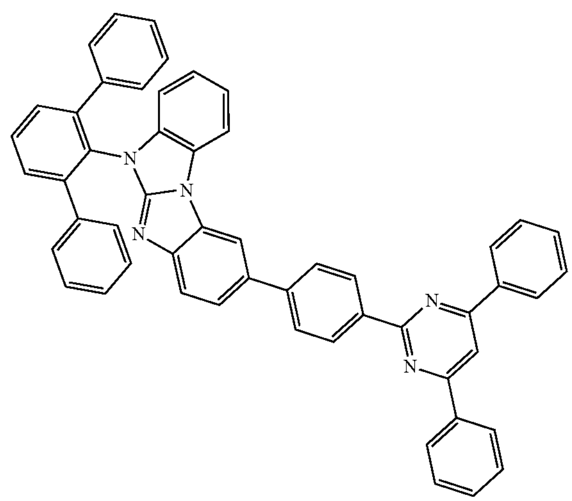
90
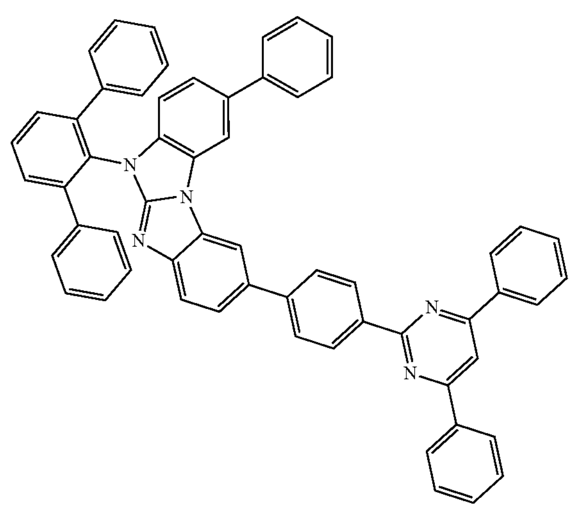

91
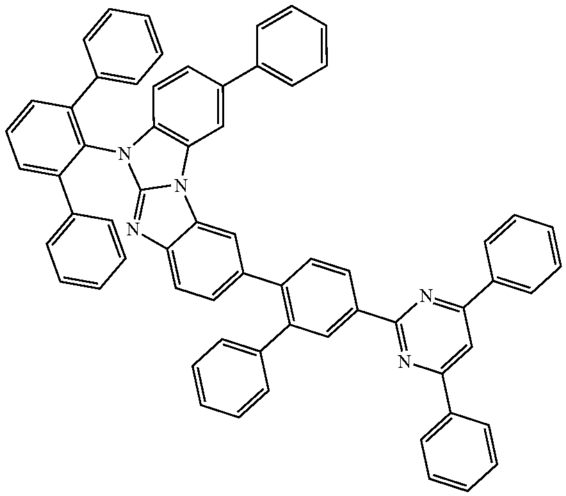
92
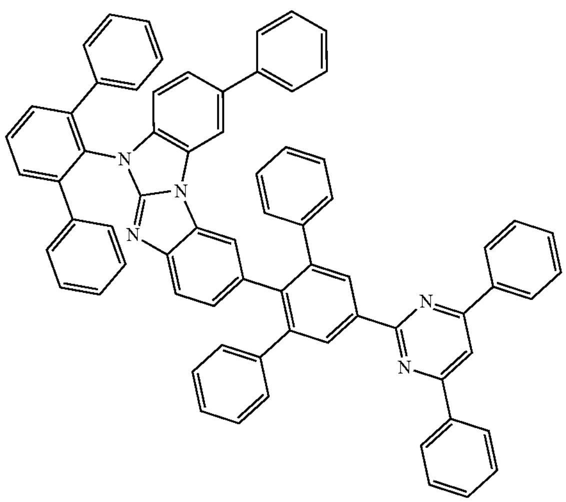
93
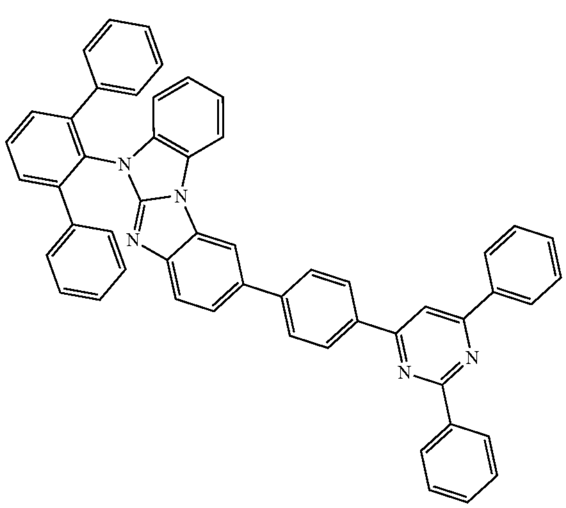
94
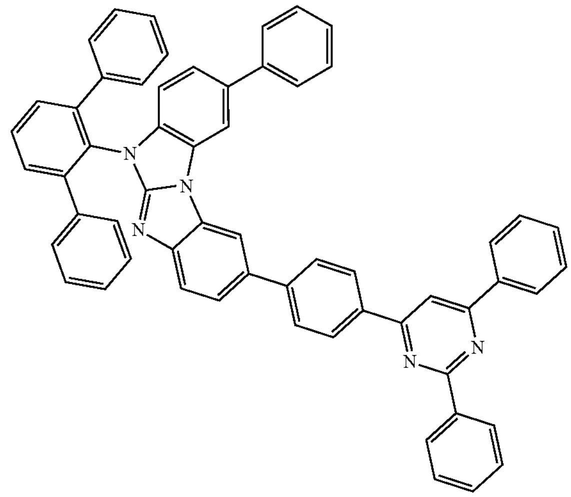
95
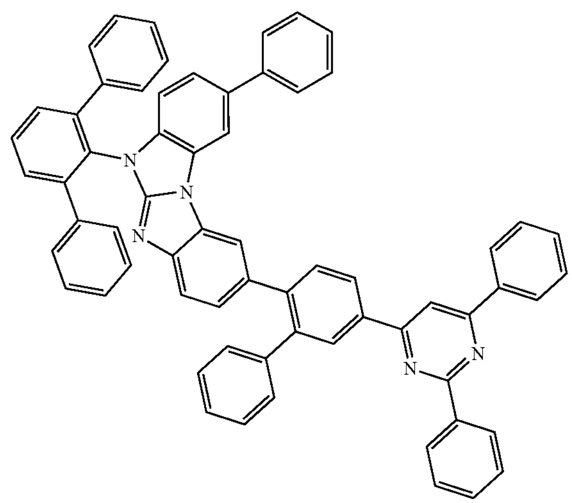
96
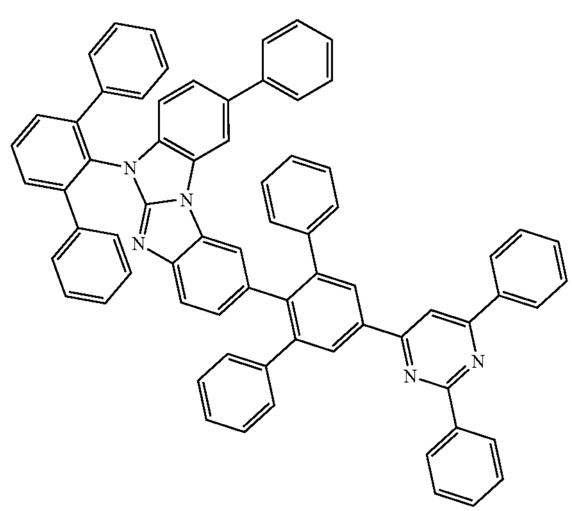

-continued
97
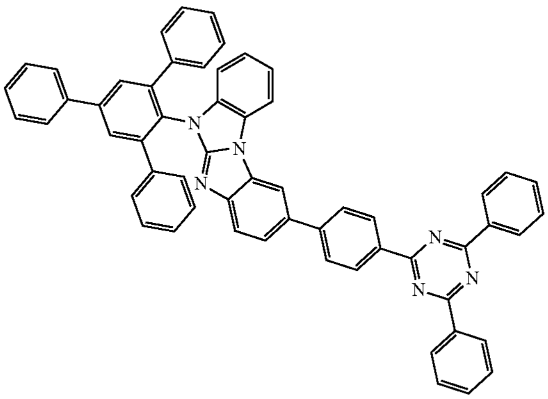
98
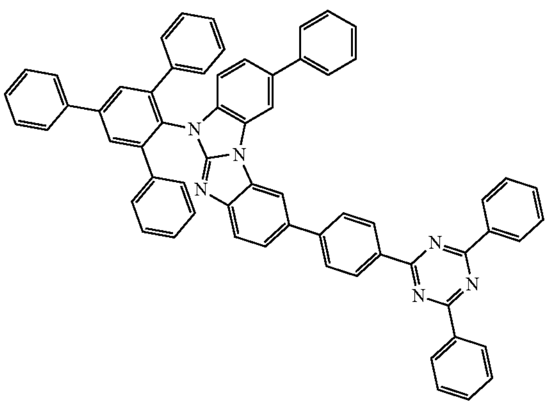
99
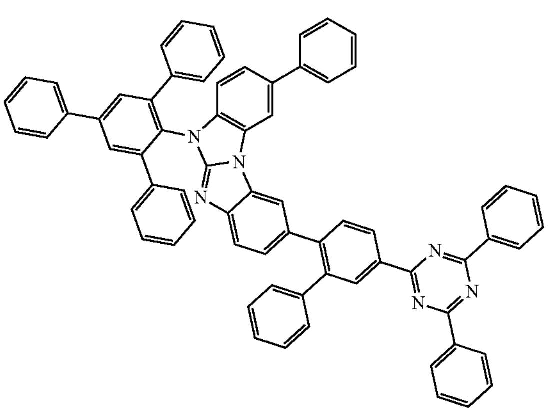
-continued
100
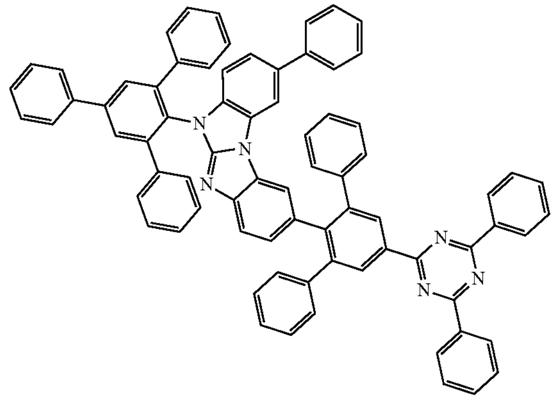
101
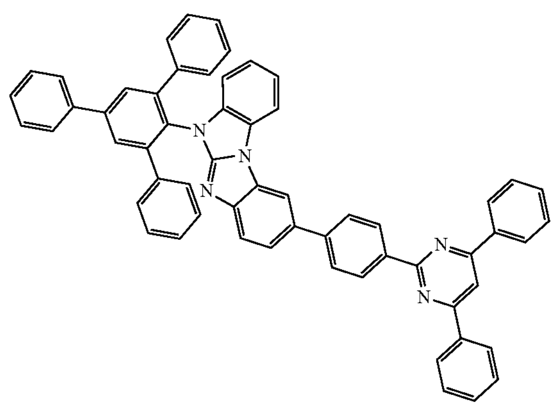
102
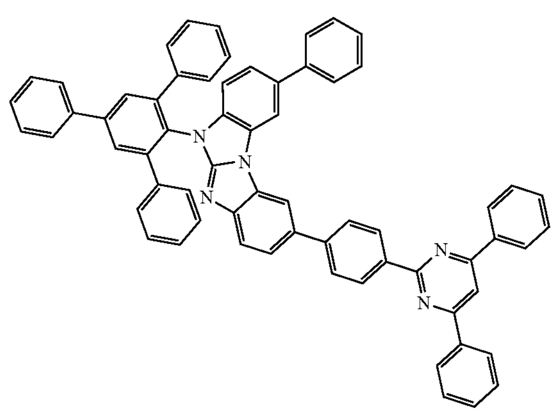

103
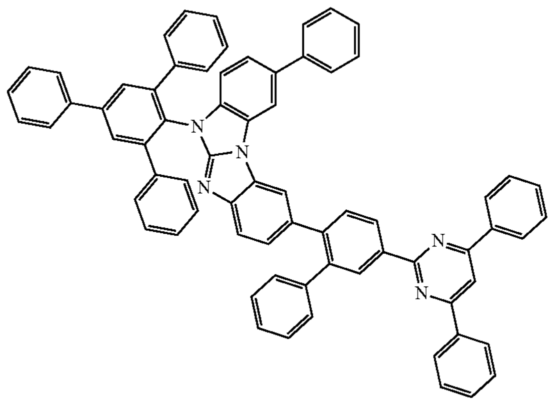
104
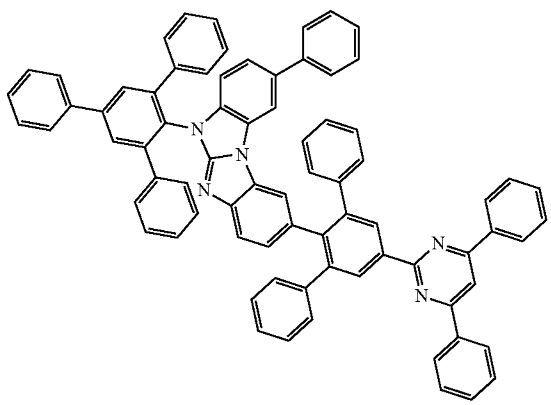
105
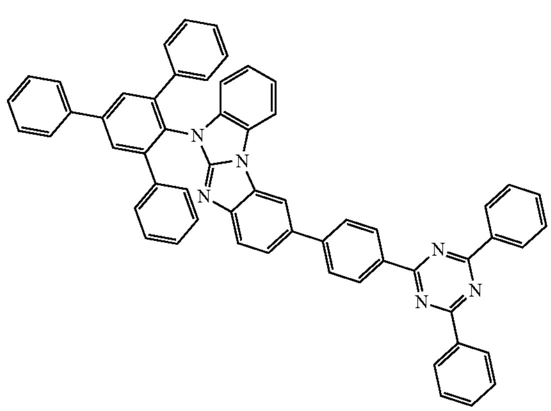
106
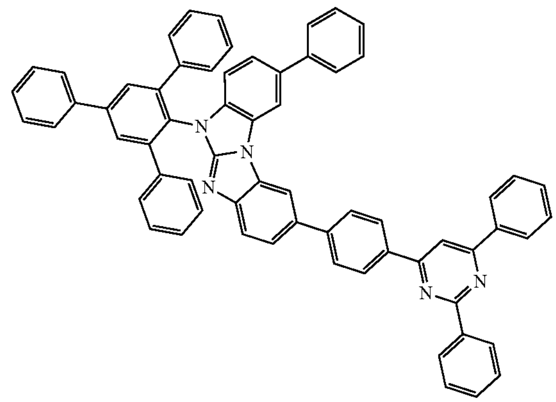
107
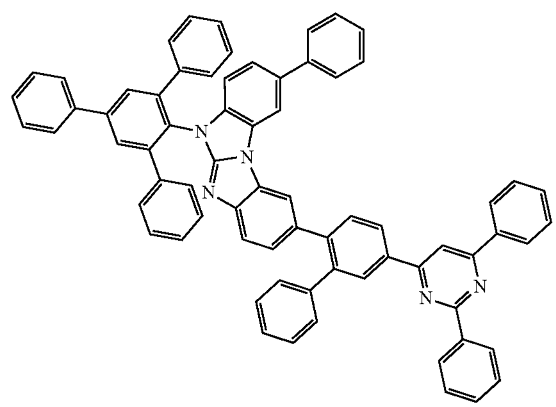
108
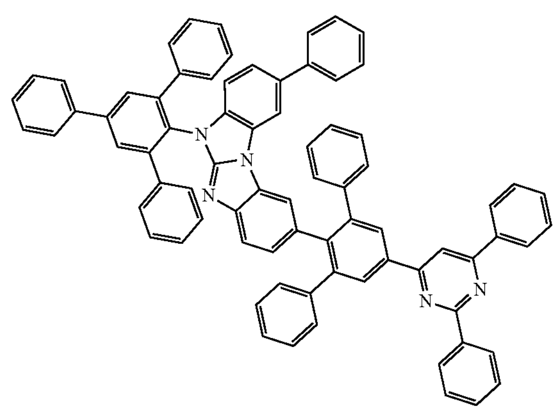

-continued
109
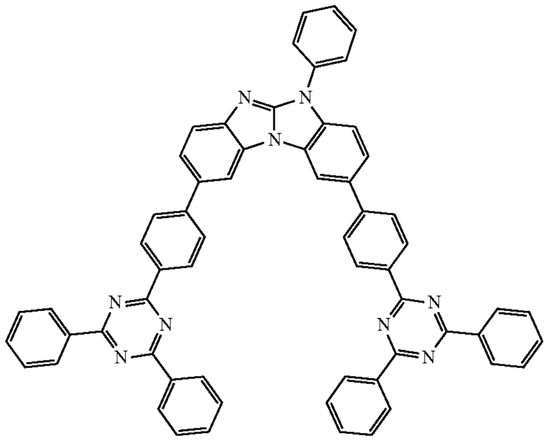
110
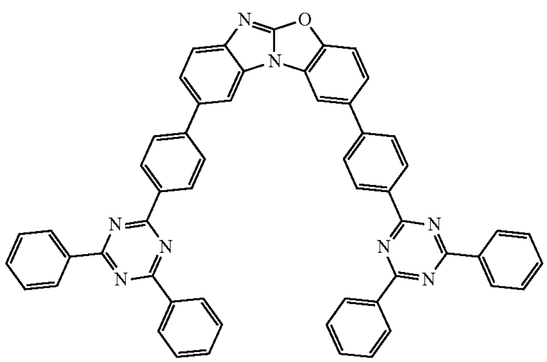
111
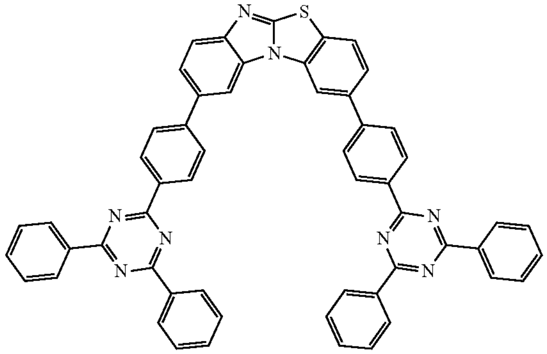
-continued
112
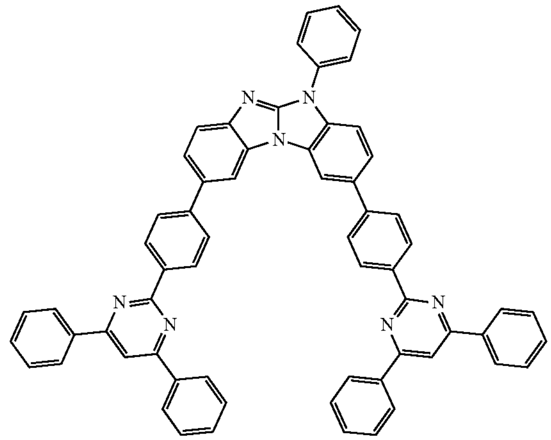
113
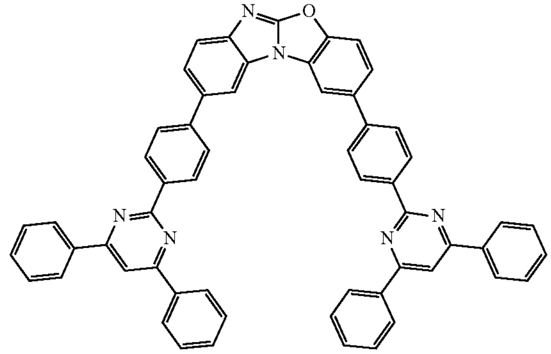

-continued
114
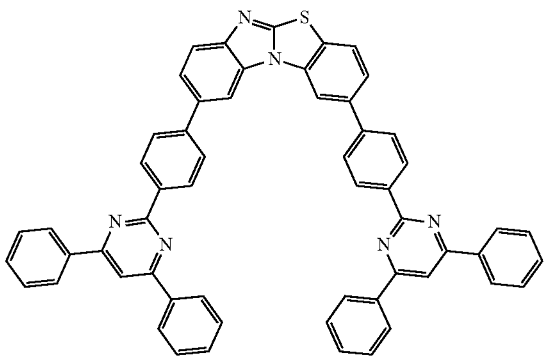
115
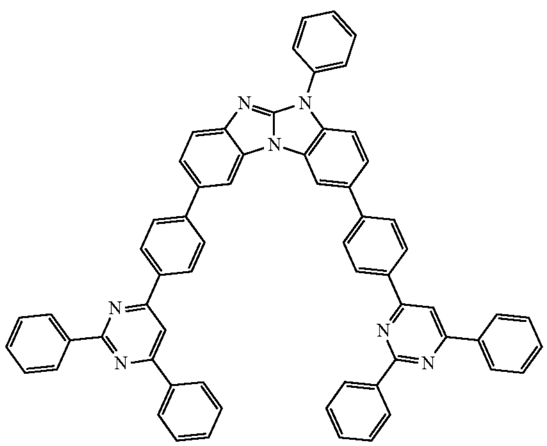
-continued
116
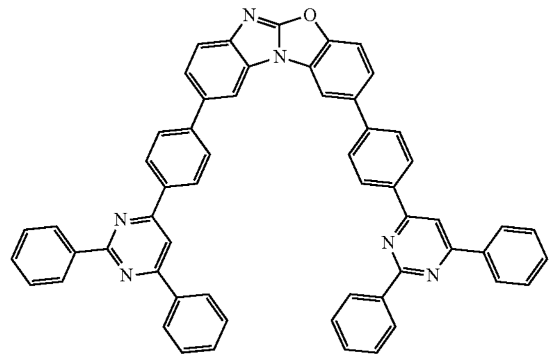
117
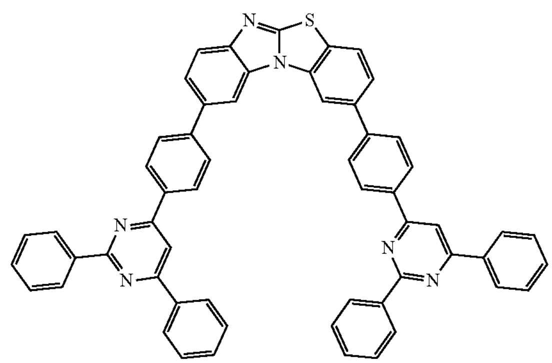
Group XI
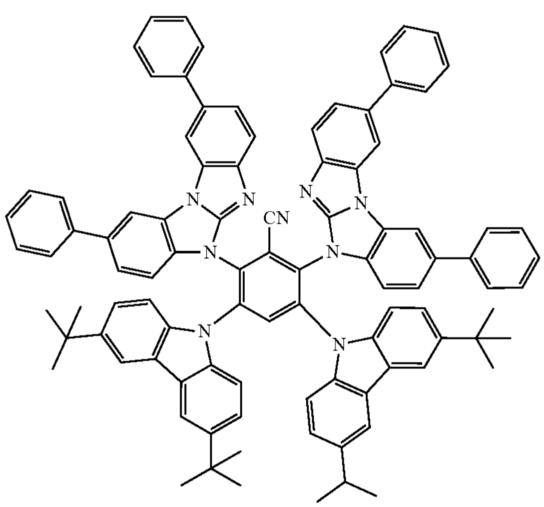
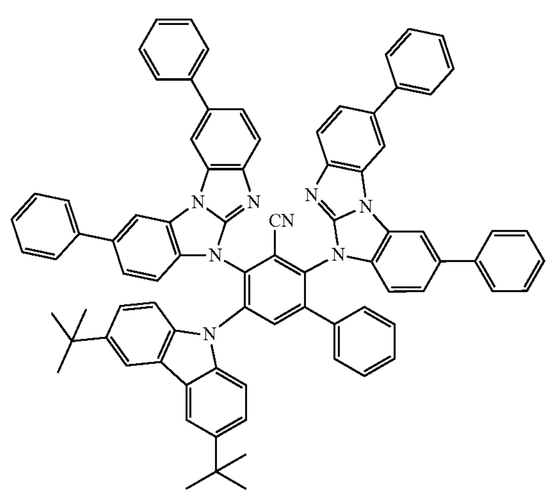

-continued
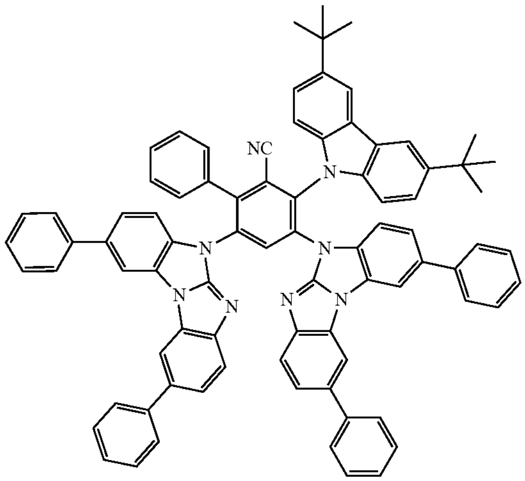
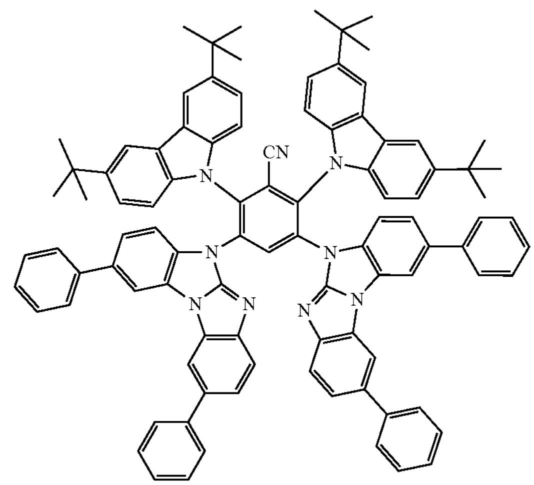
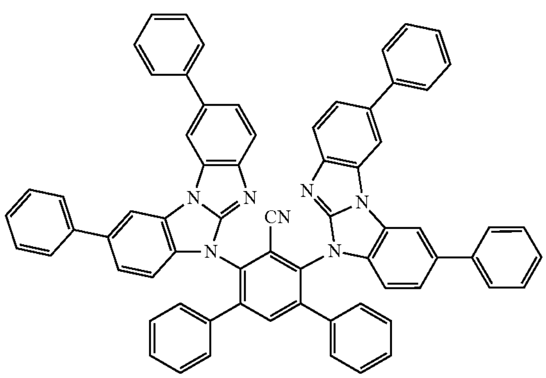
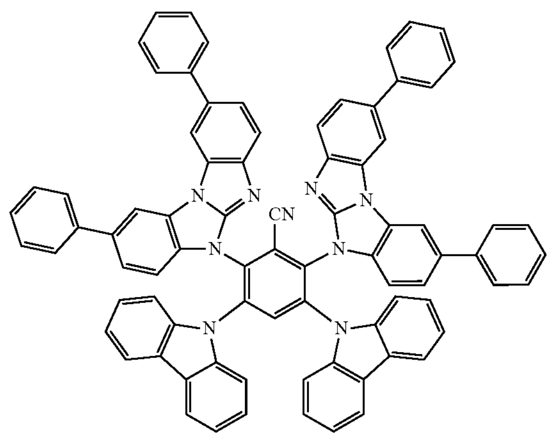
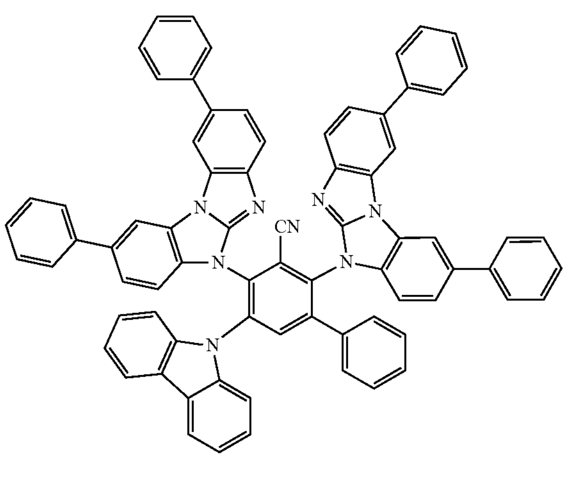
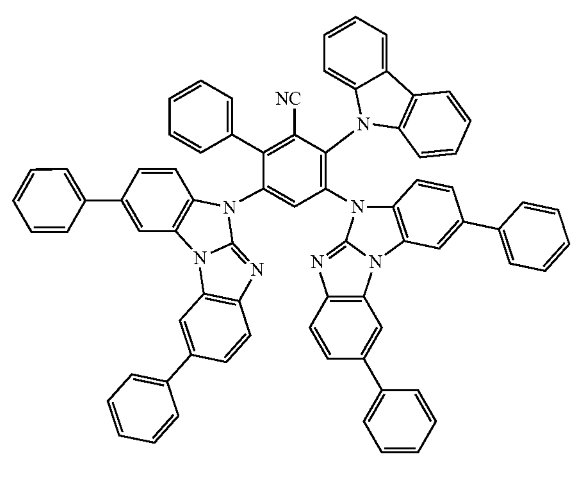

-continued
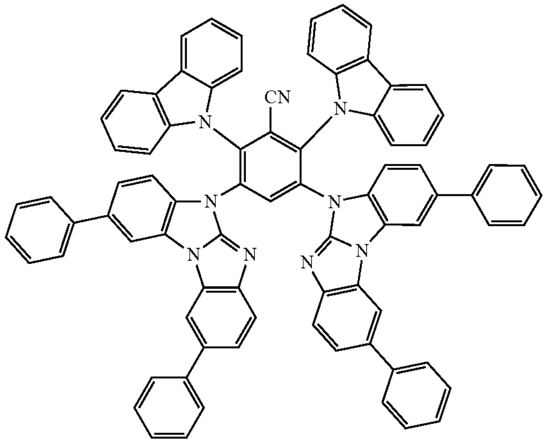
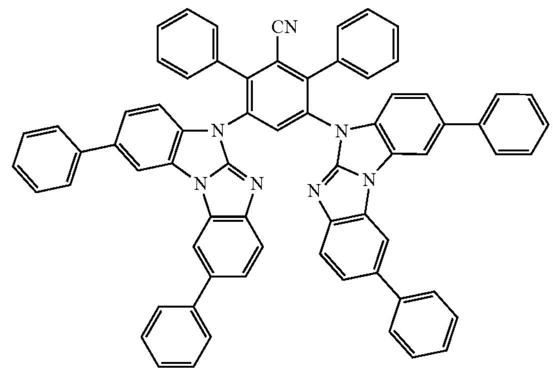
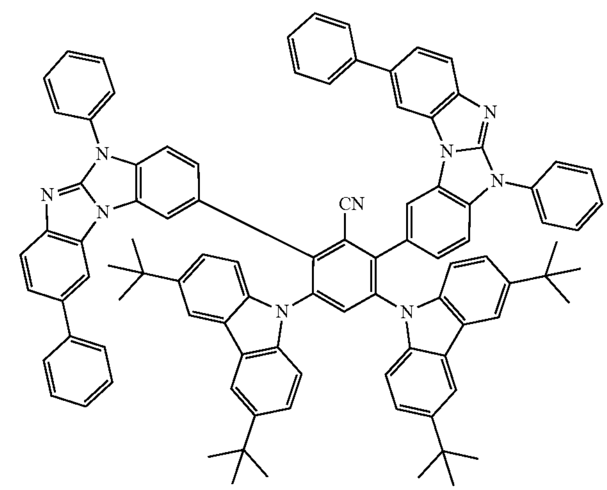
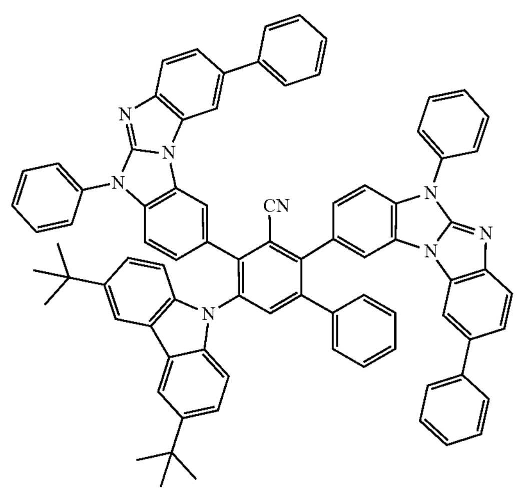
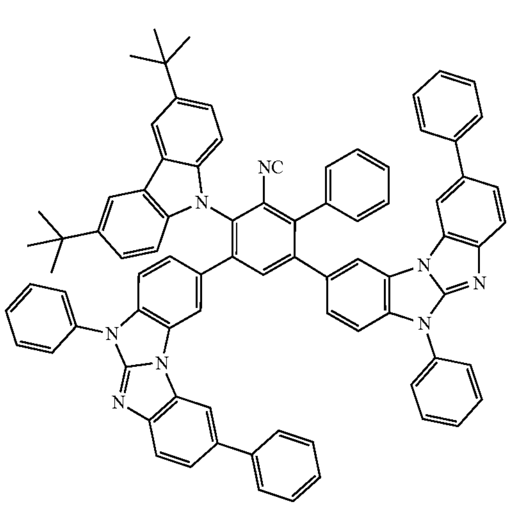
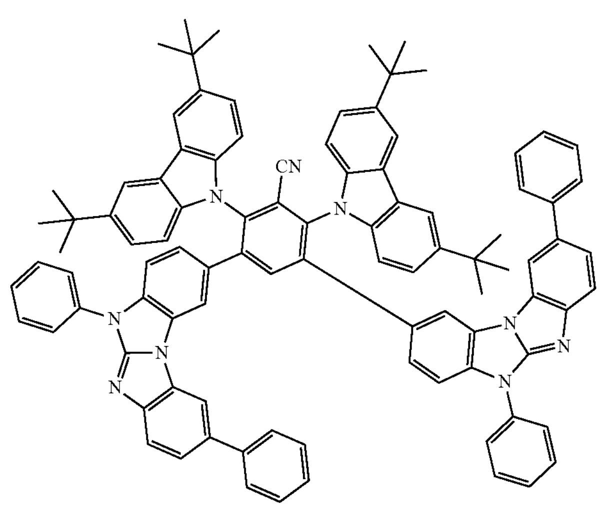

-continued
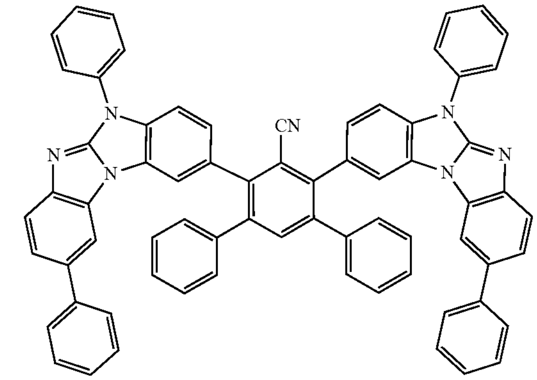
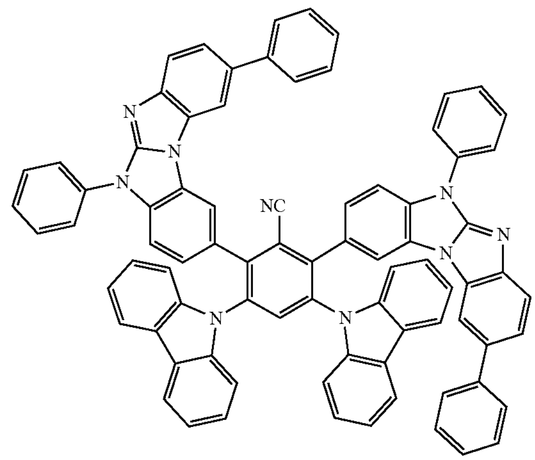
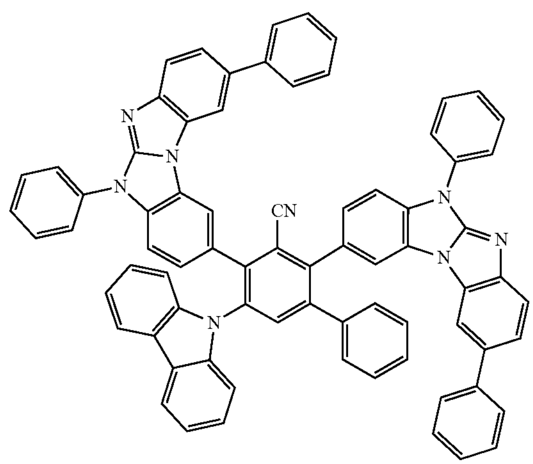
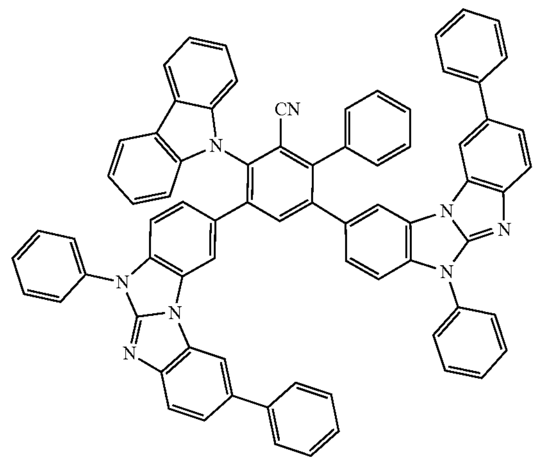
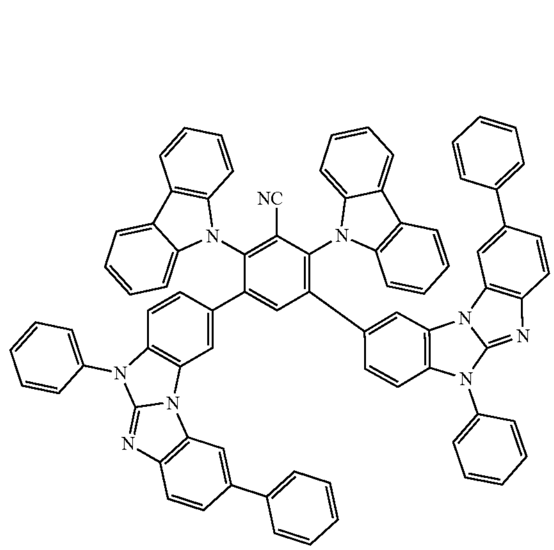
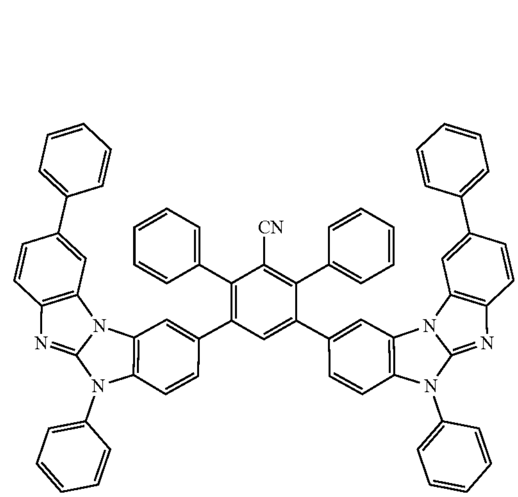

-continued
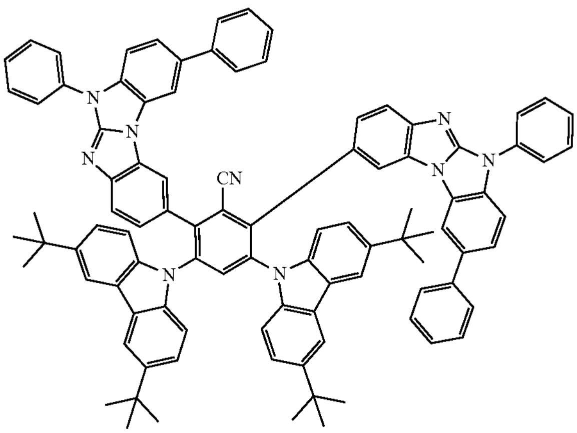
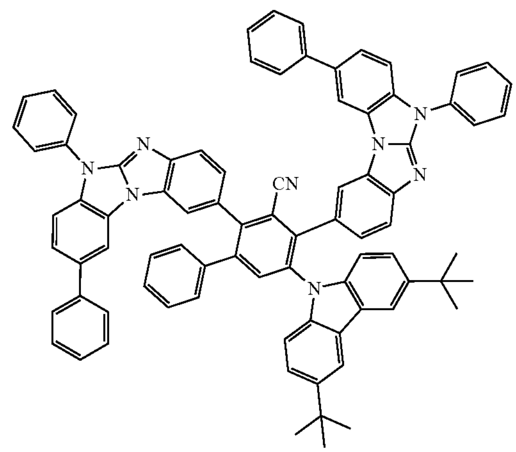
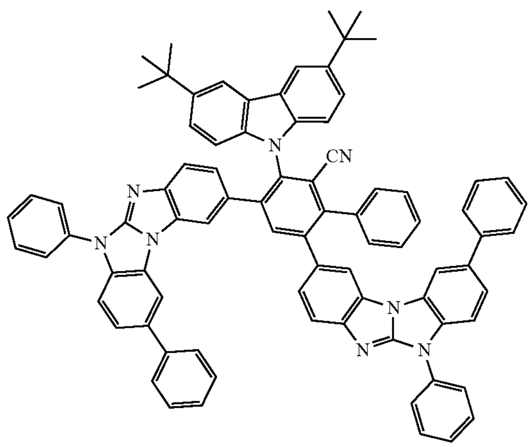
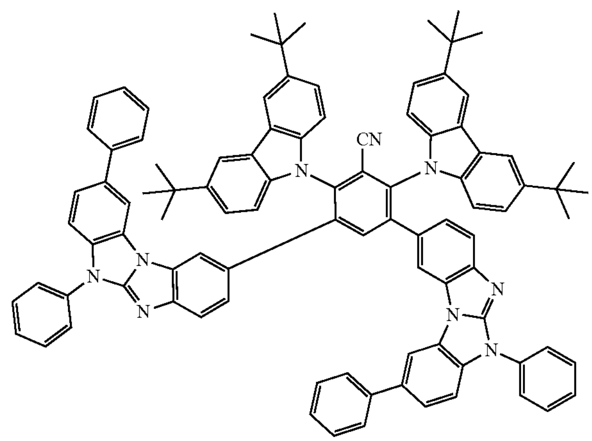
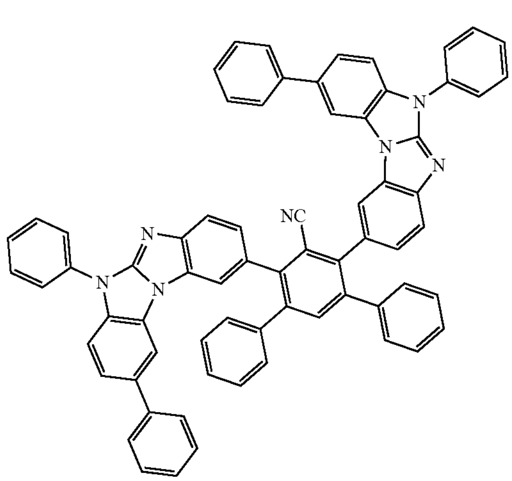
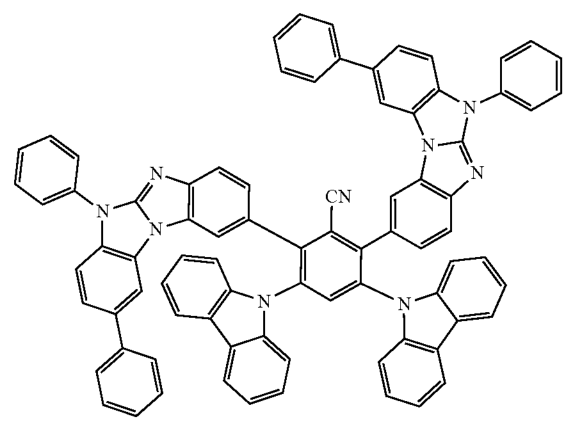

-continued
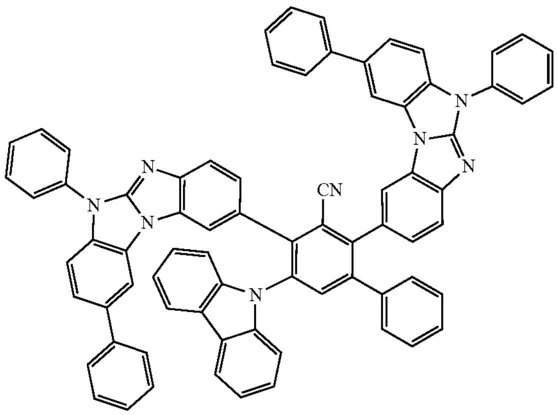
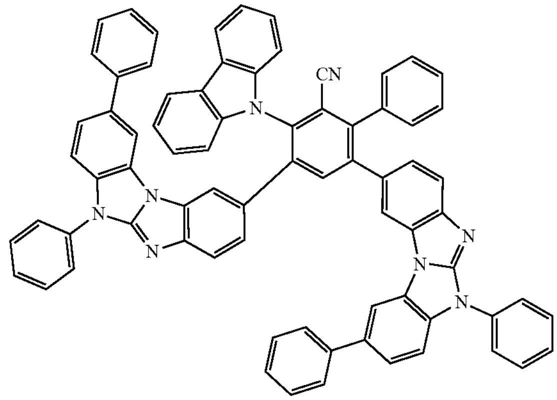
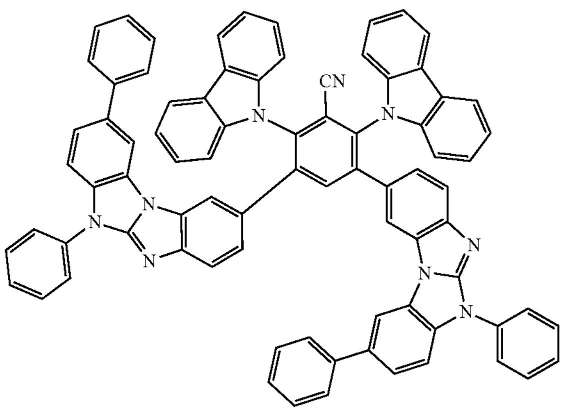
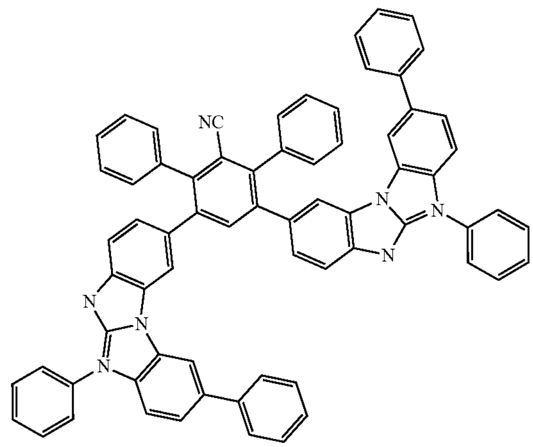
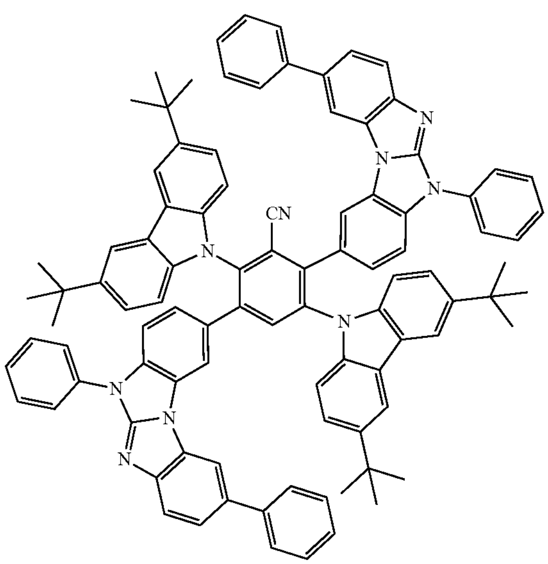
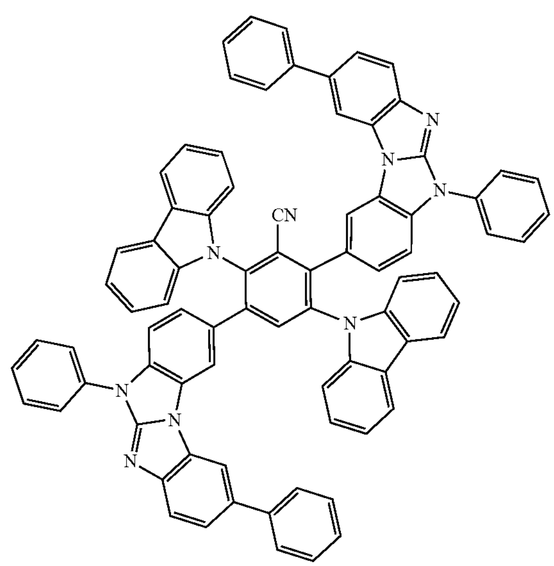

-continued
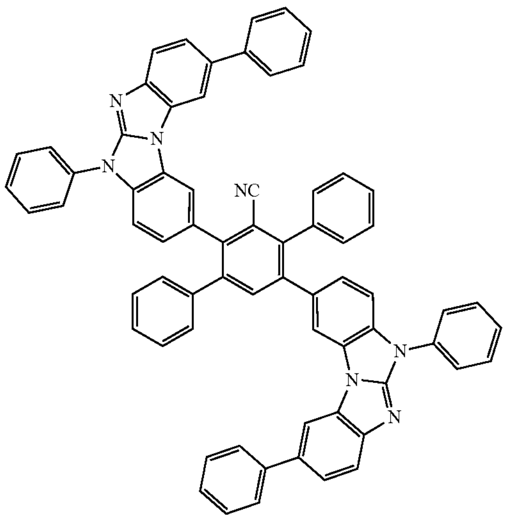
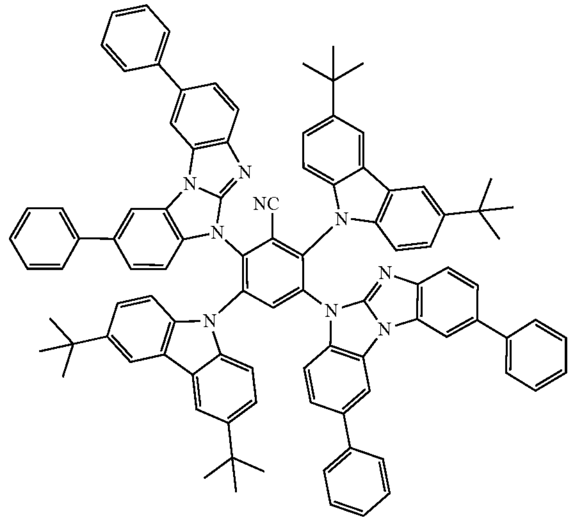
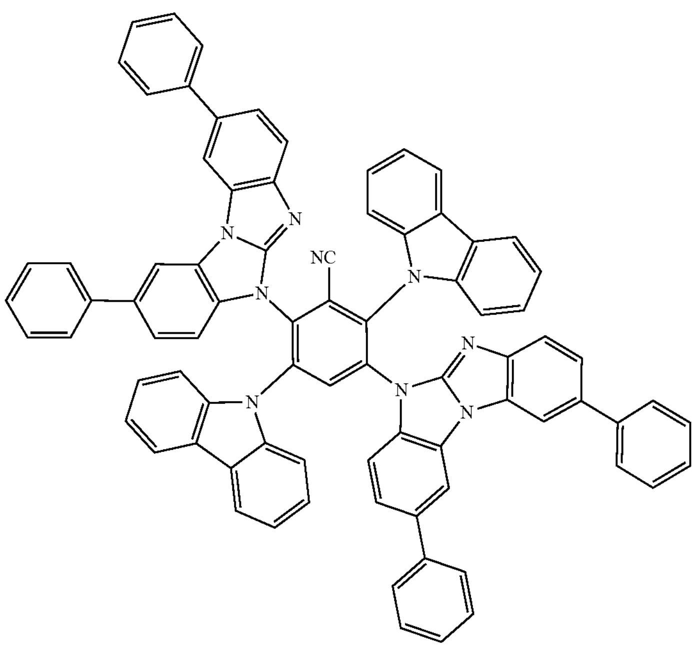

-continued
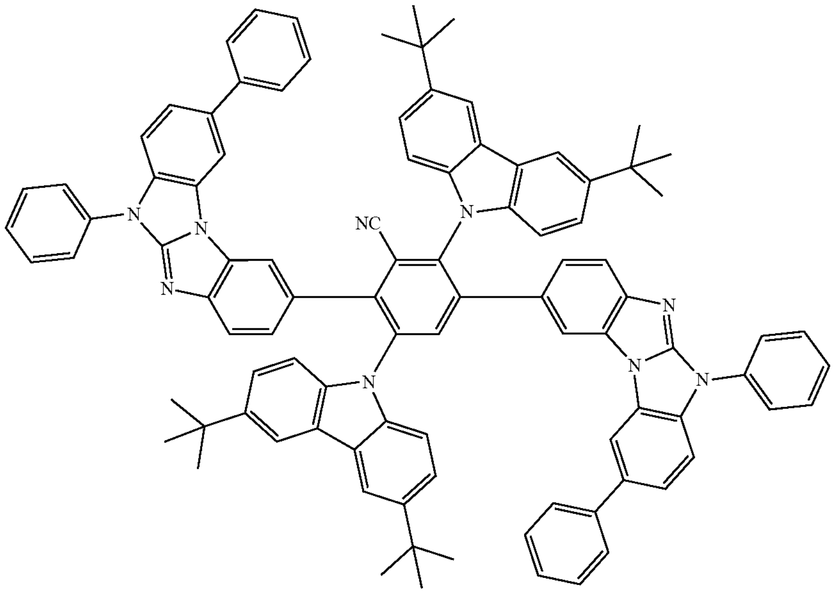
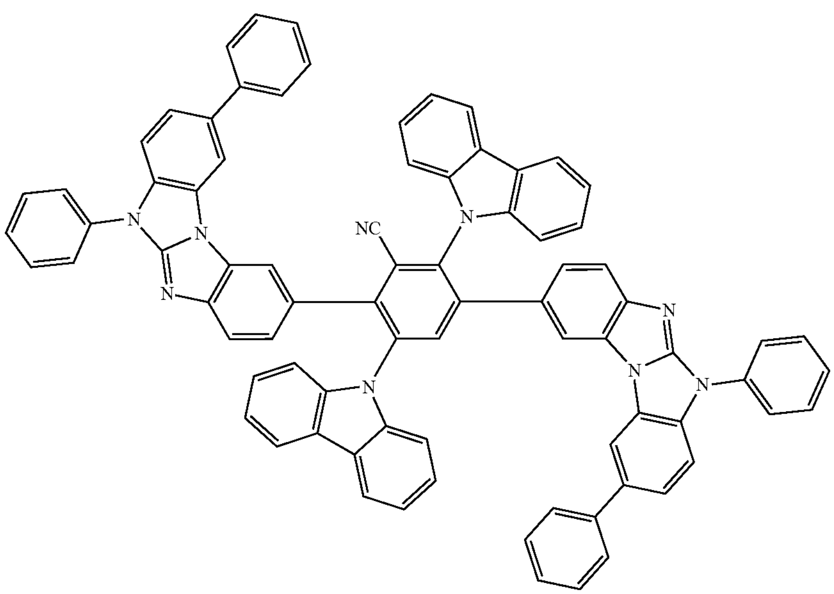

-continued
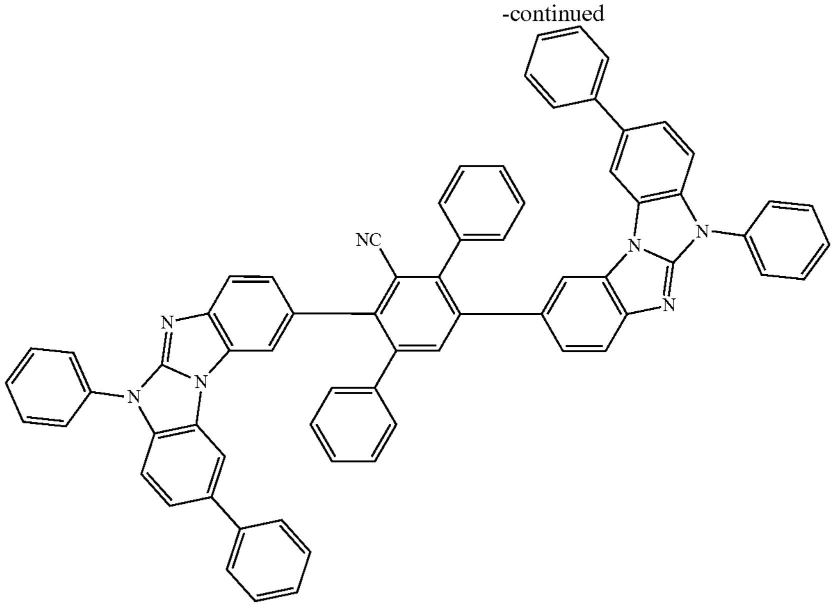
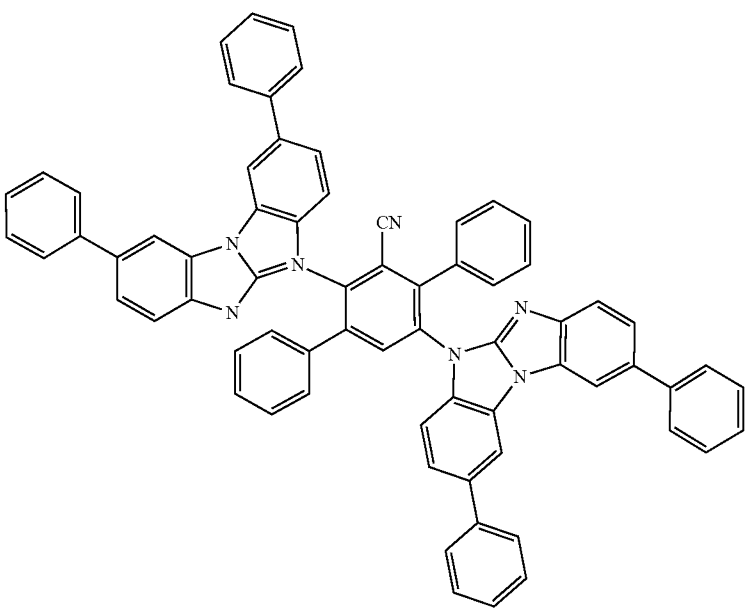
Group XII
1
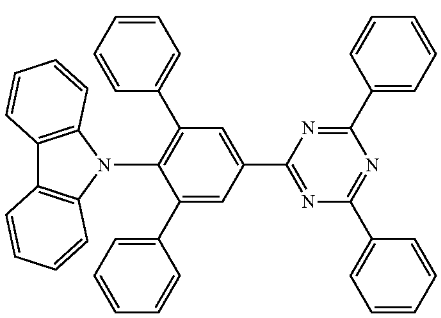
-continued
2
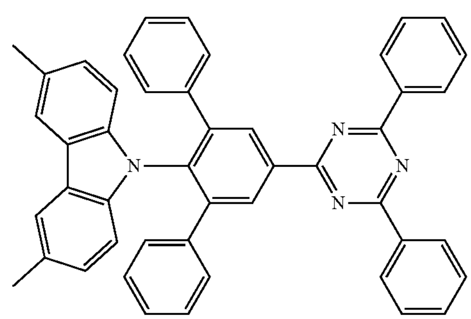

-continued
3
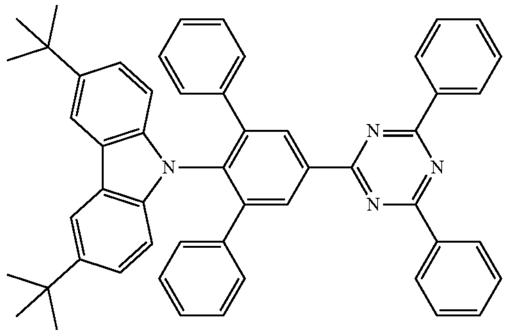
4
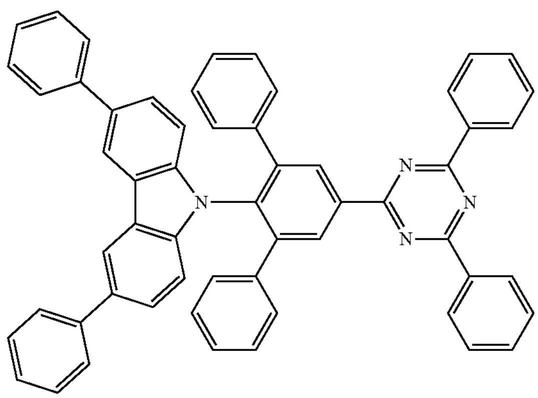
5
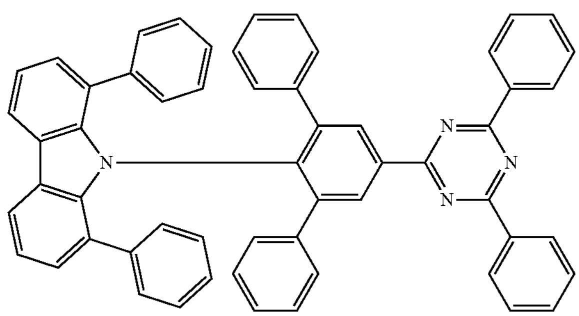
6
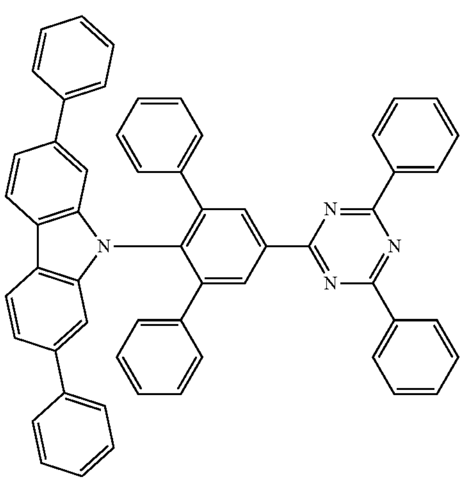
-continued
7
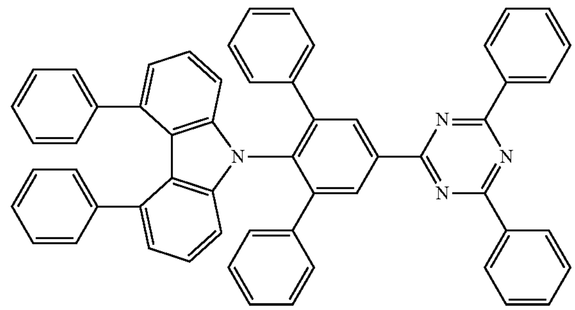
8
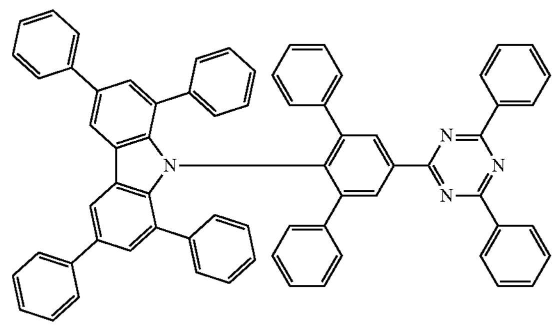
9
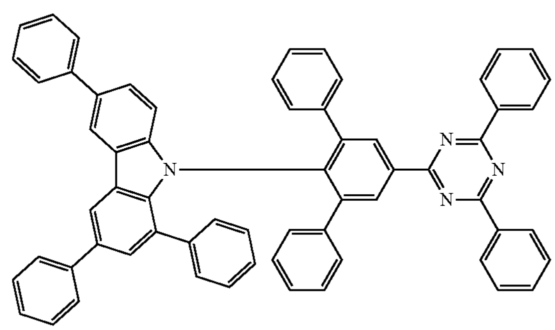
10
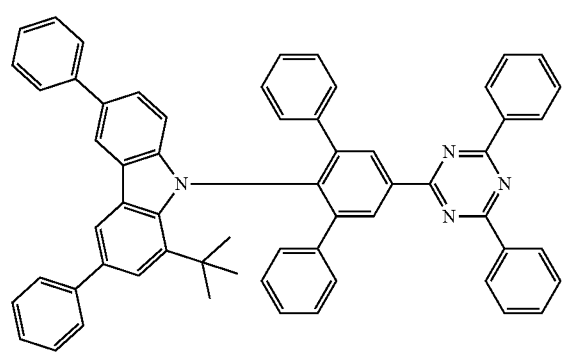

11
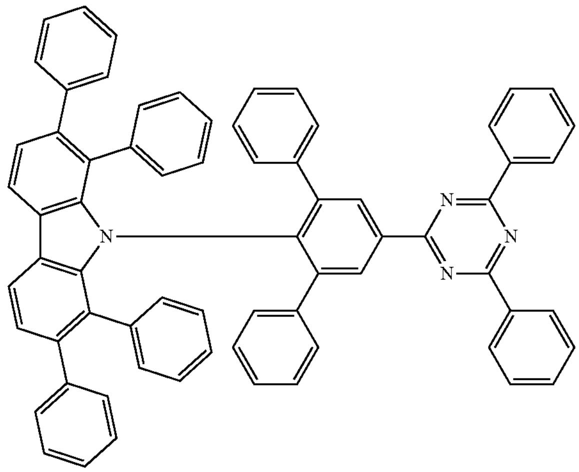
12
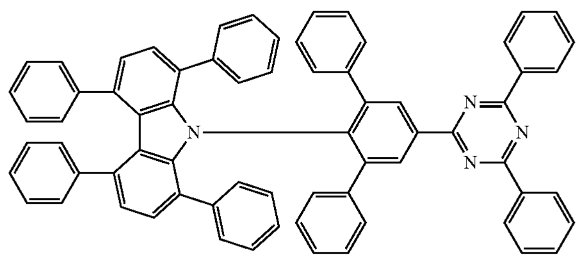
13
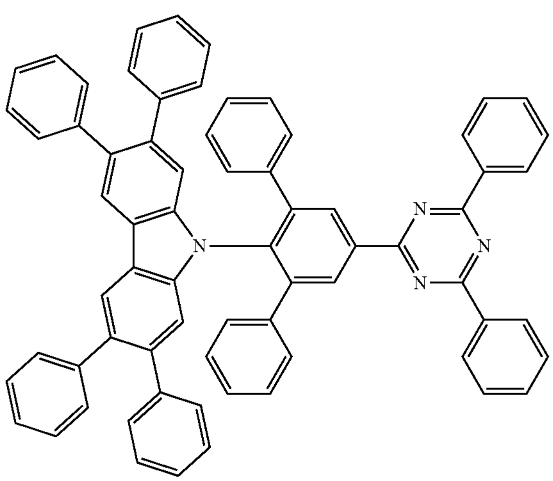
14
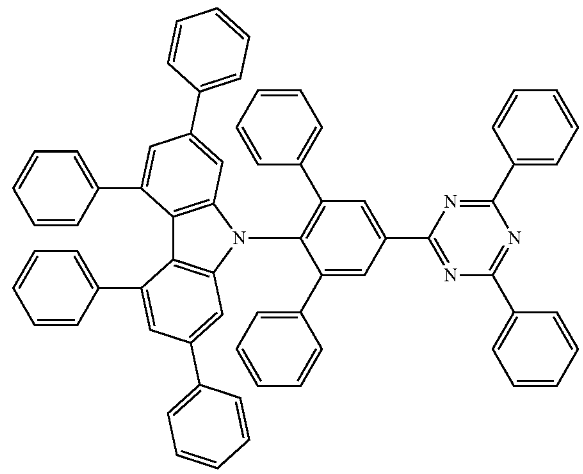
15
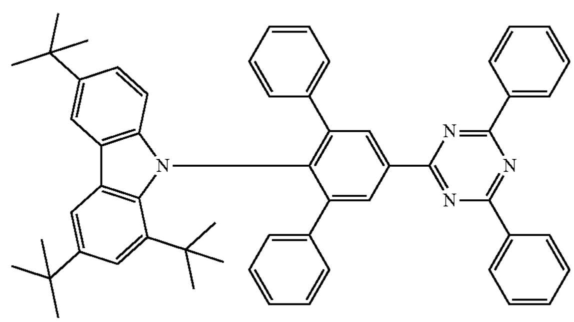
16
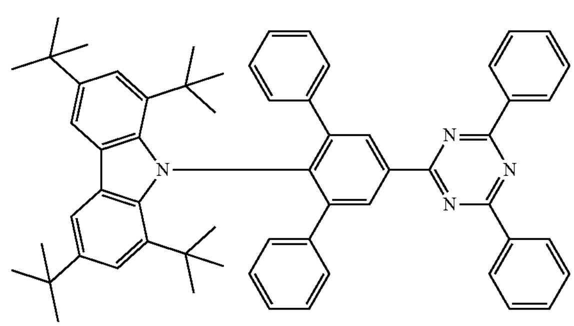
17
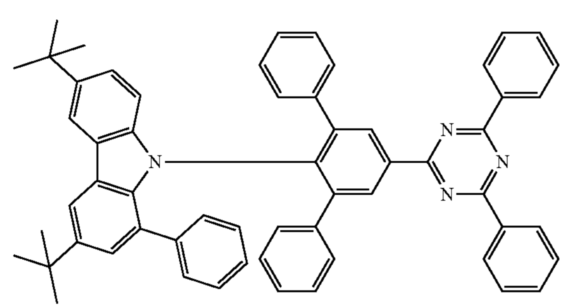

-continued
18
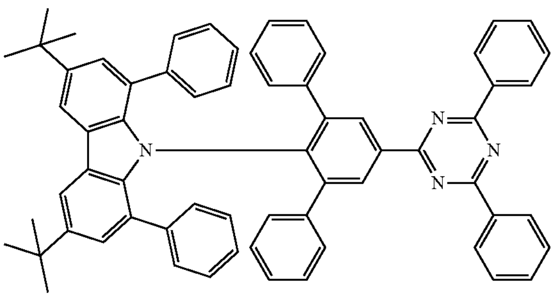
22
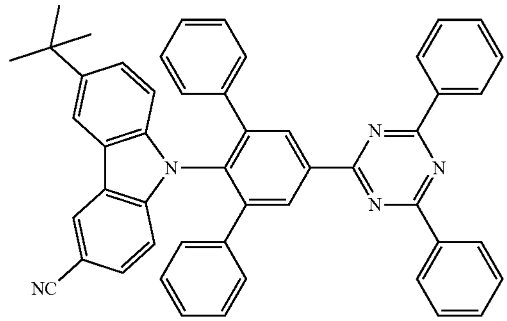
19
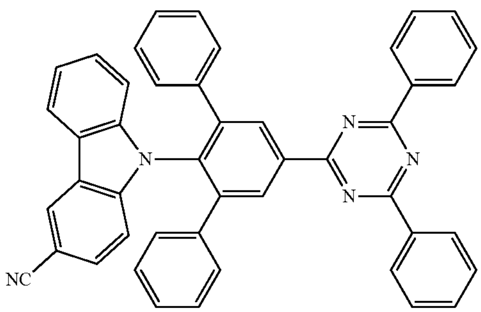
23
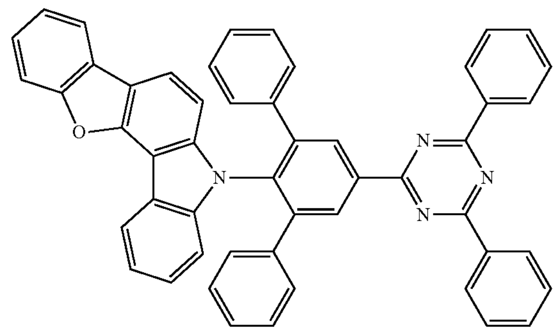
20
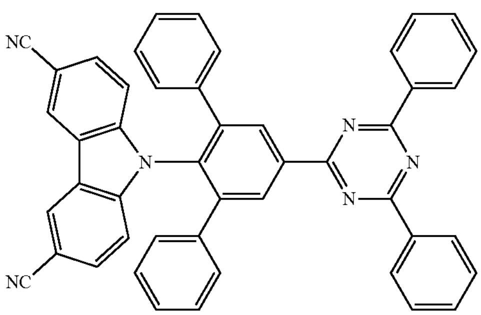
24
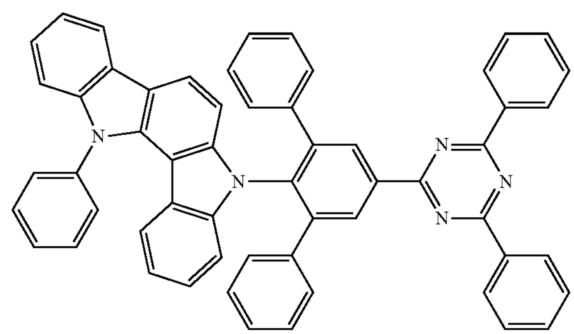
21
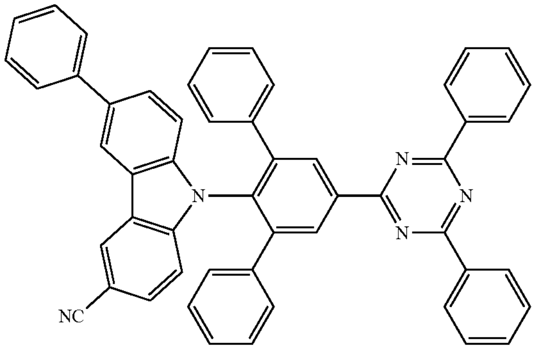
25
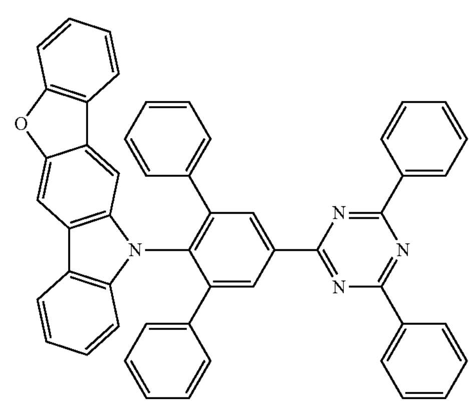

-continued
26
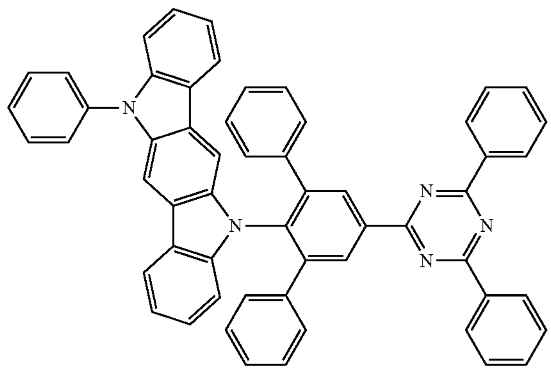
27
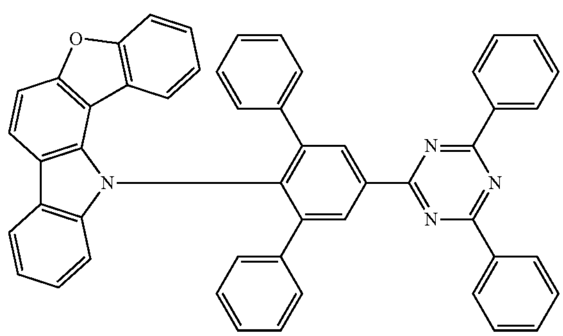
28
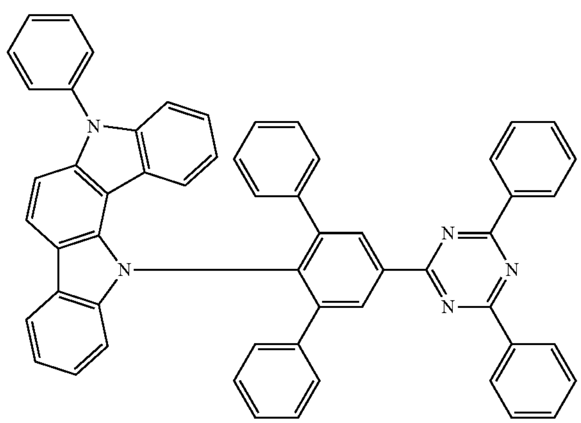
29
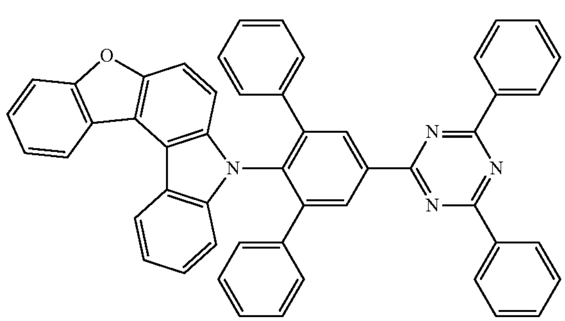
-continued
30
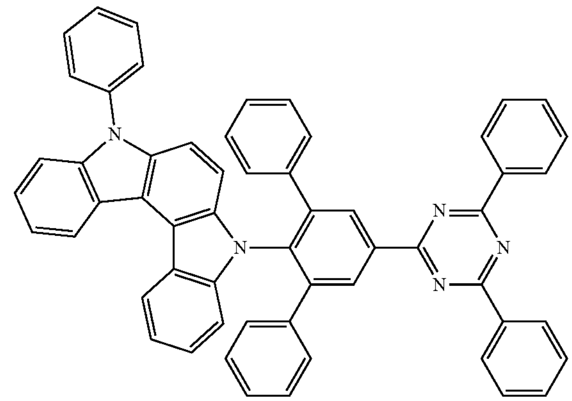
31
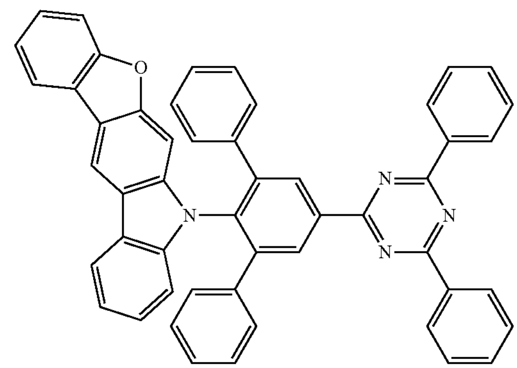
32
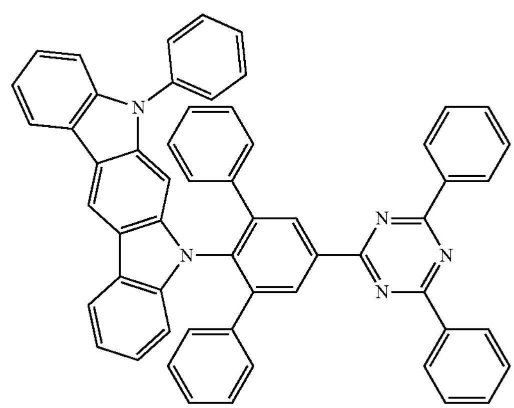
33
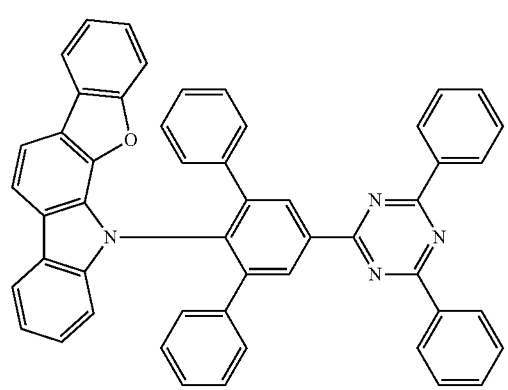

-continued
34
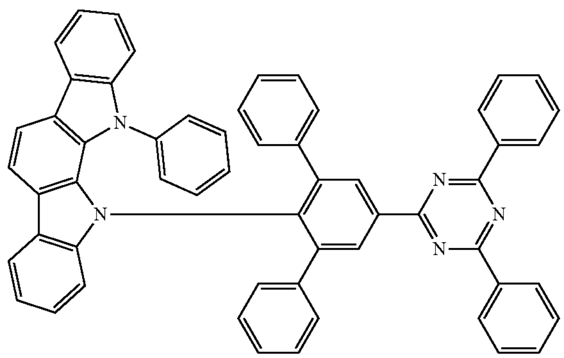
35
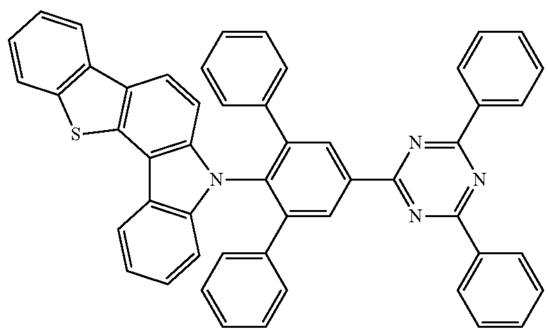
36
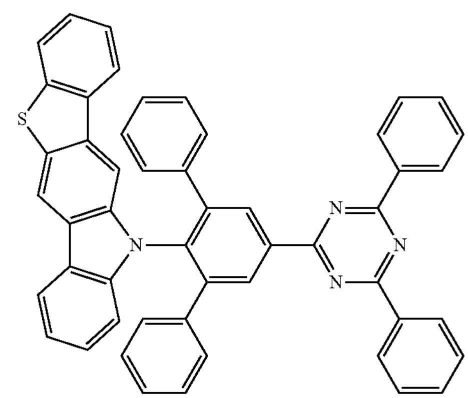
37
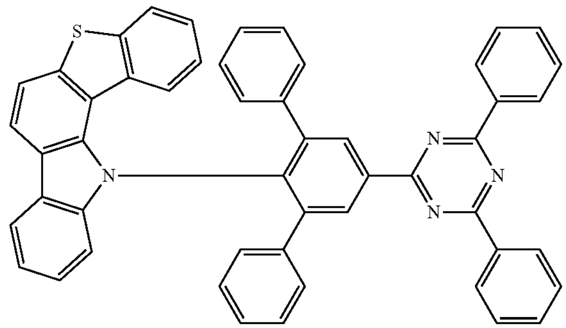
-continued
38
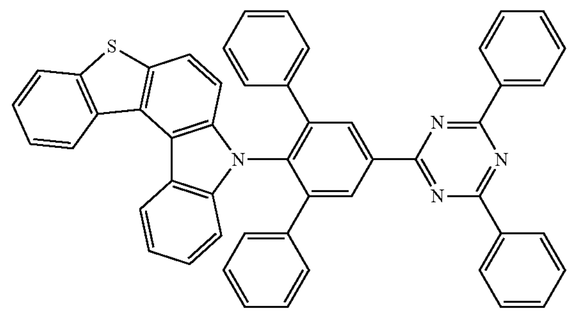
39
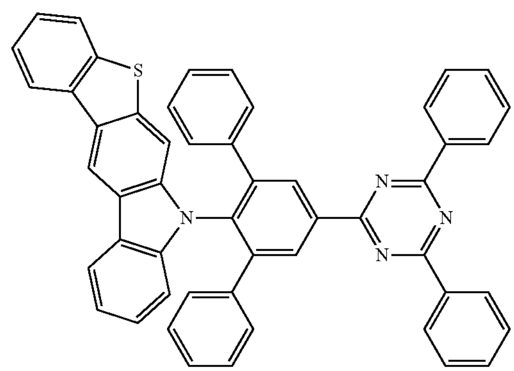
40
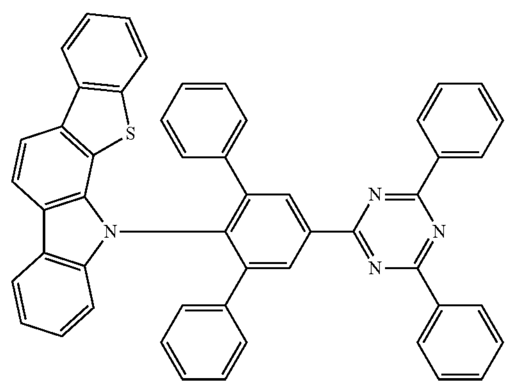
41
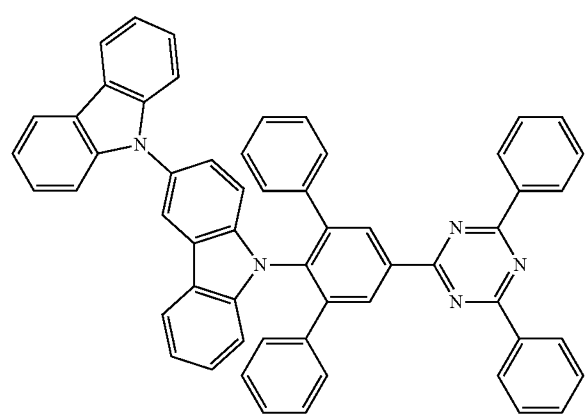

-continued
42
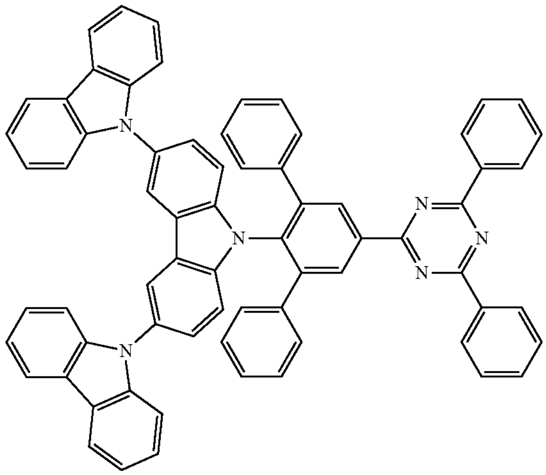
43
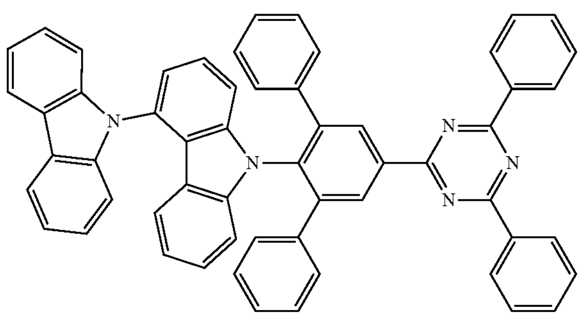
44
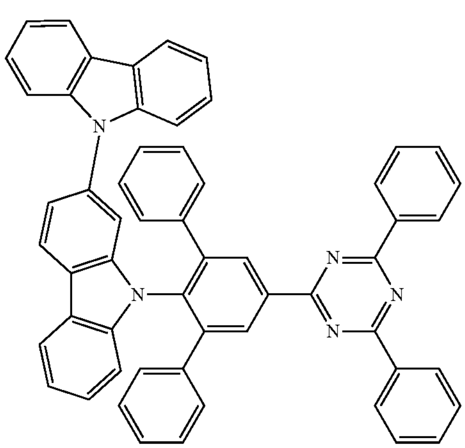
-continued
45
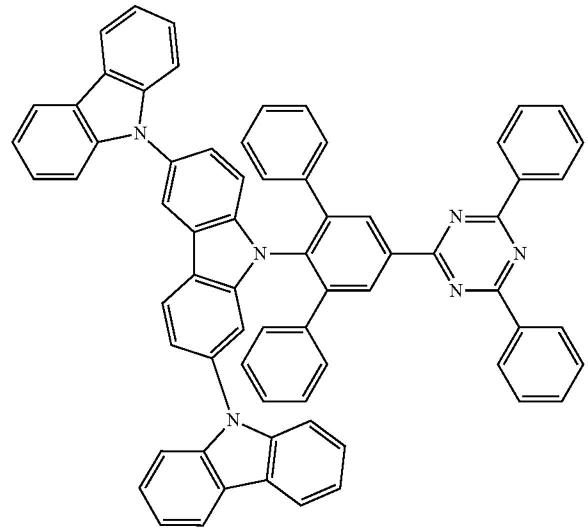
46
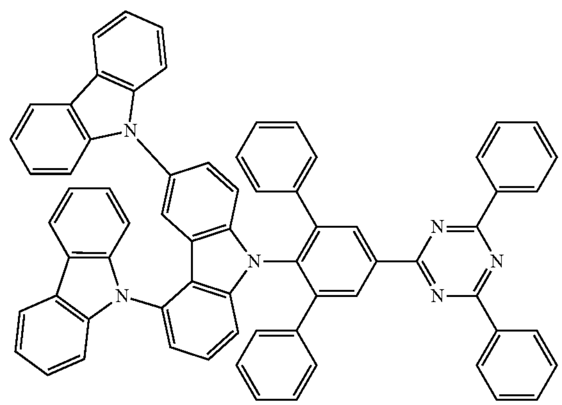
47
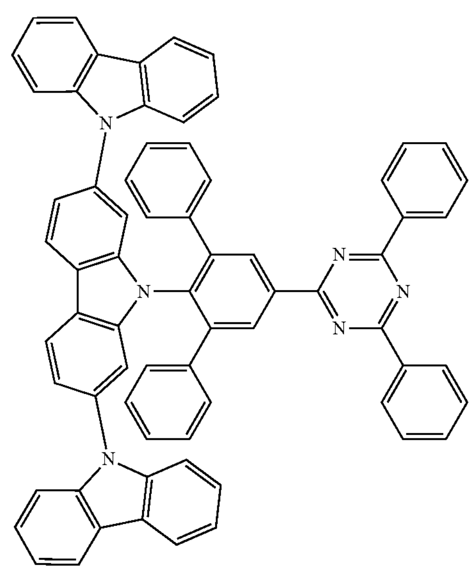

48
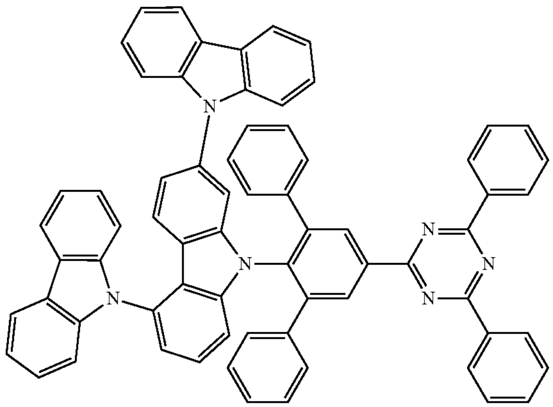
49
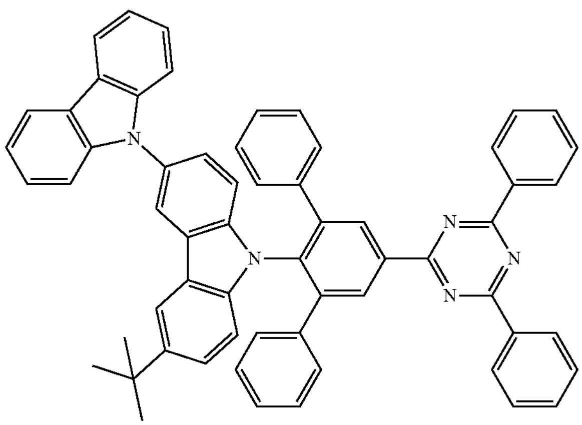
50
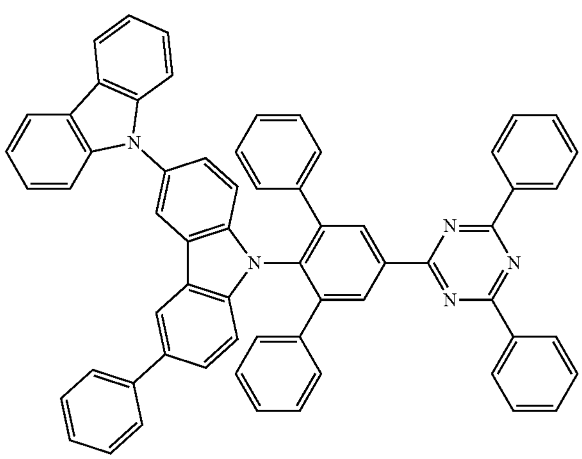
51
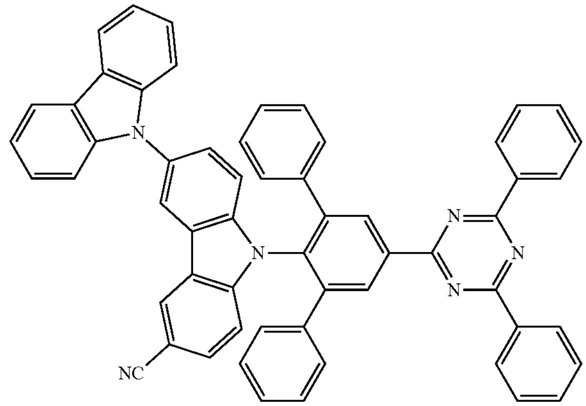
52
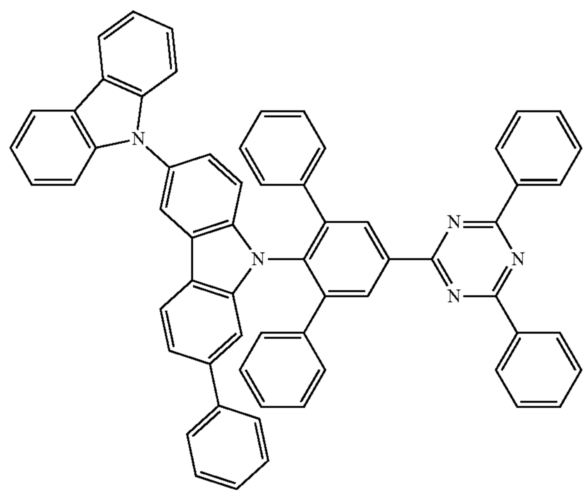
53
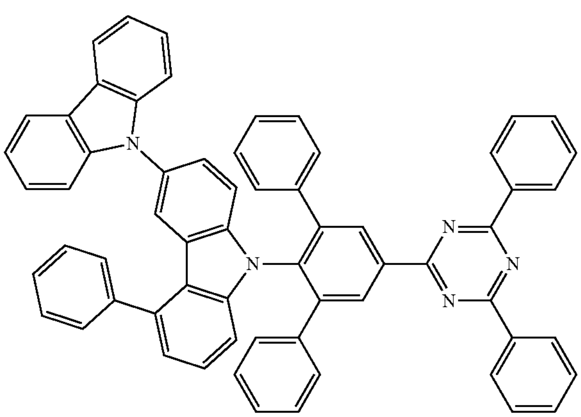

-continued
54
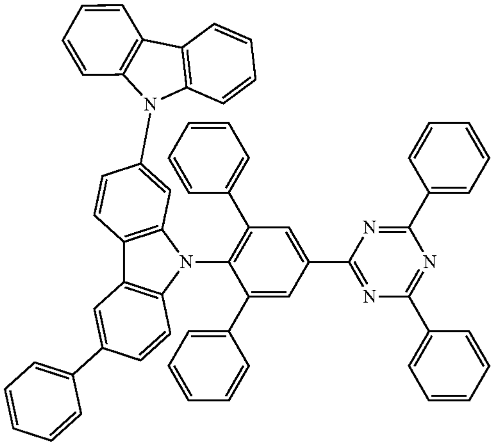
55
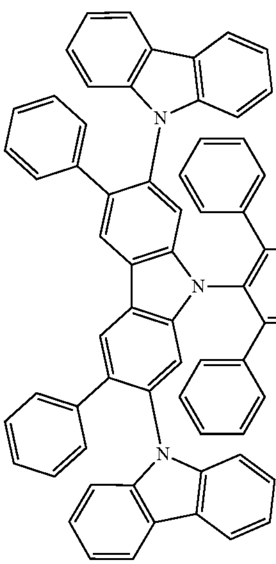
56
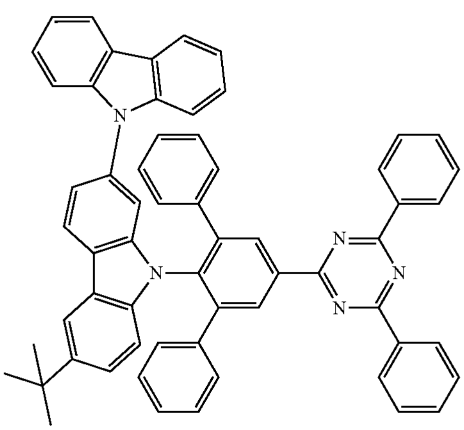
-continued
57
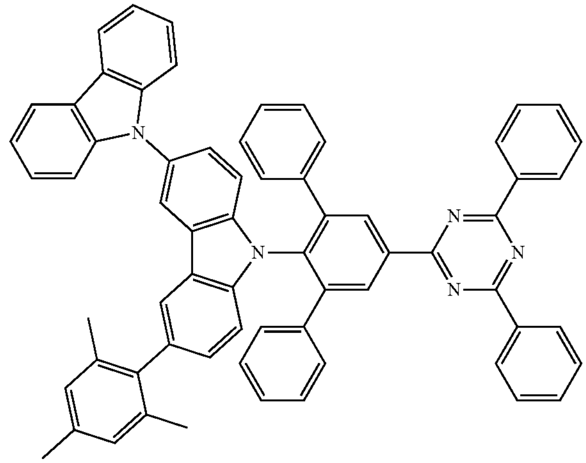
58
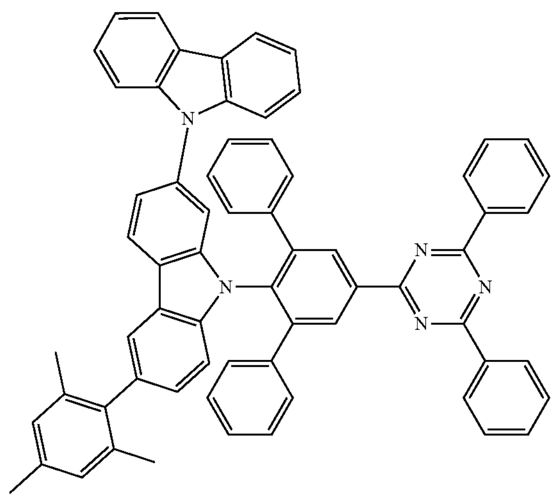
59
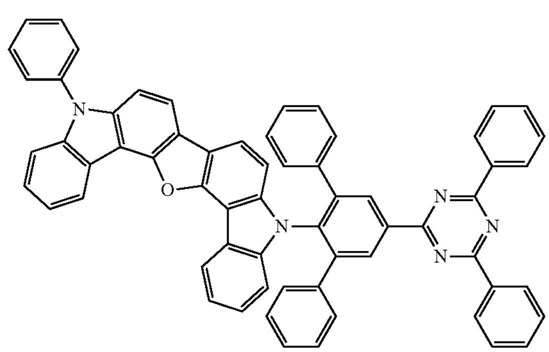

-continued
60
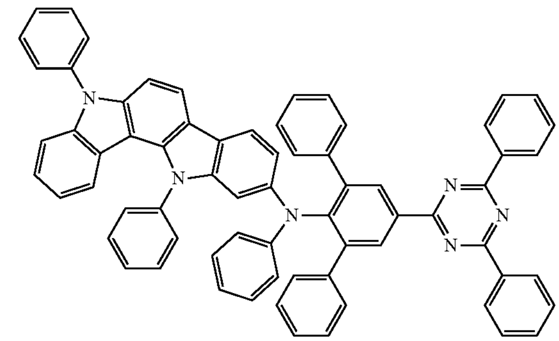
61
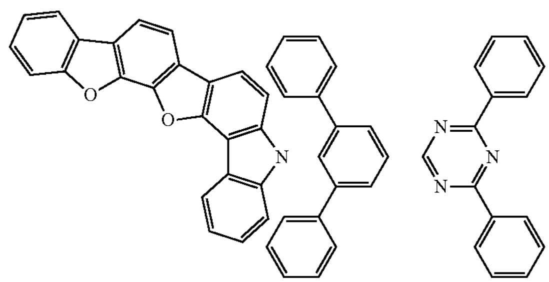
62
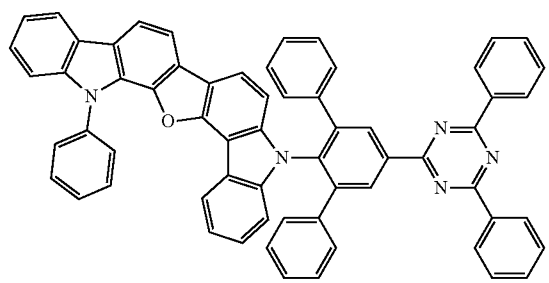
63
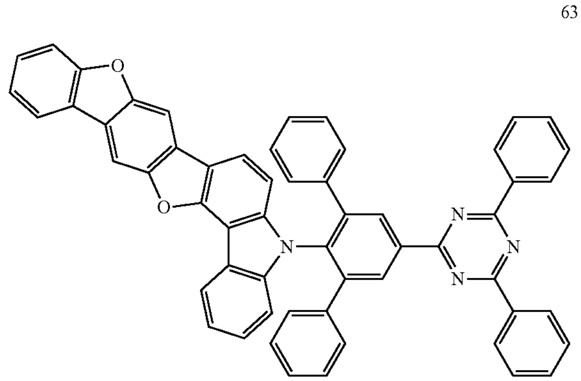
-continued
64
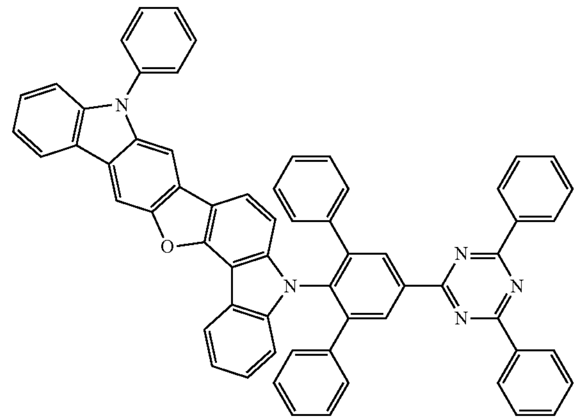
65
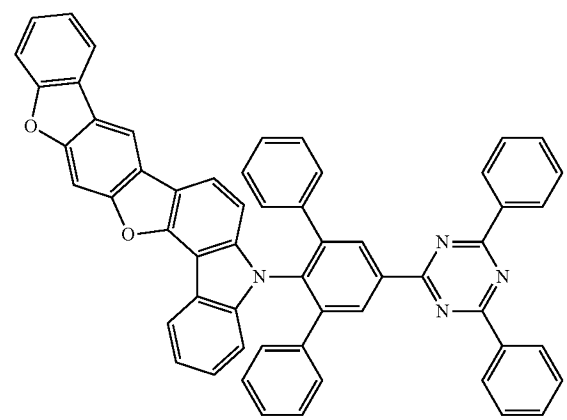
66
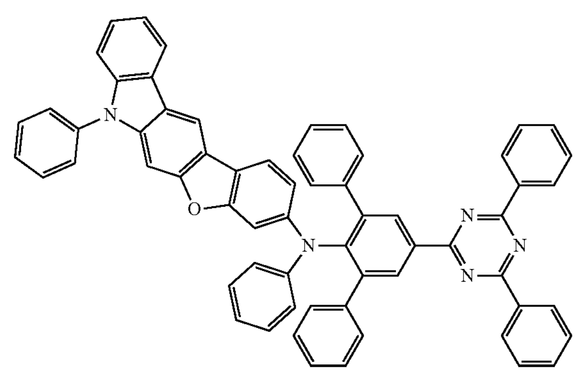

-continued
67
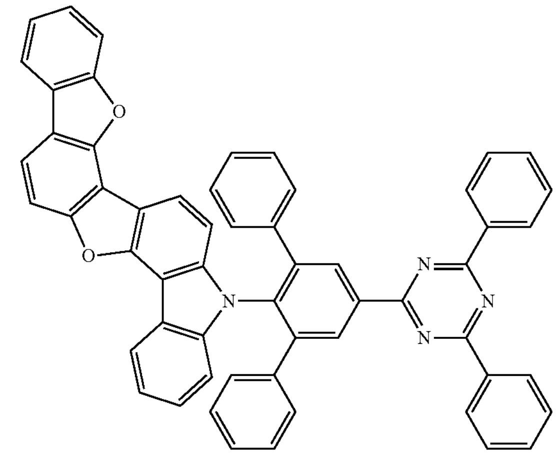
68
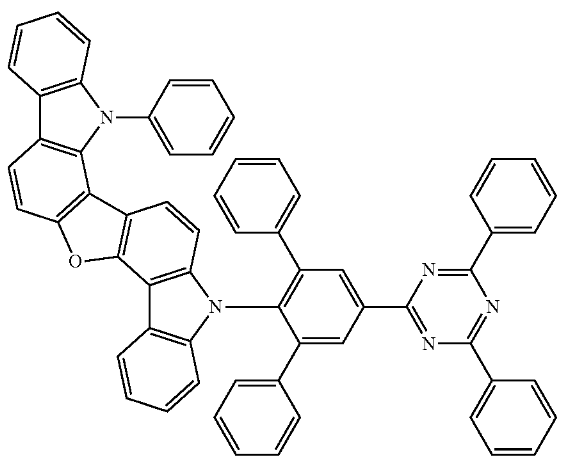
69
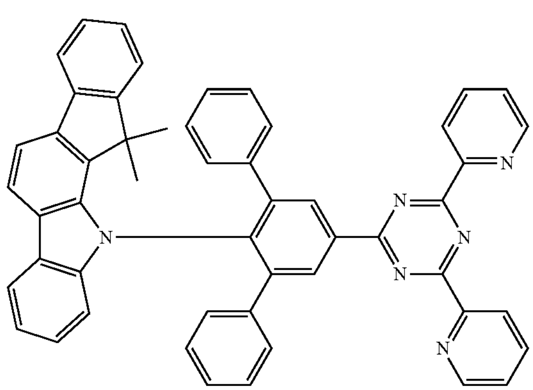
-continued
70
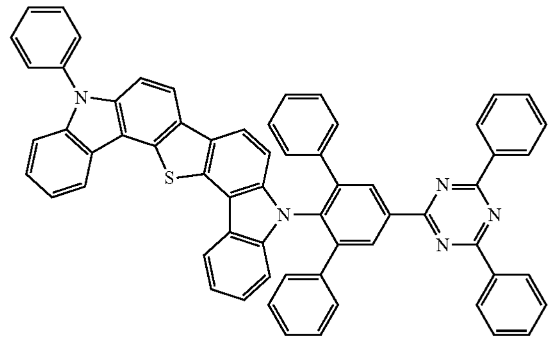
71
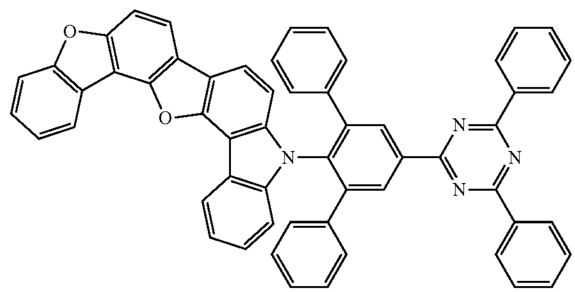
72
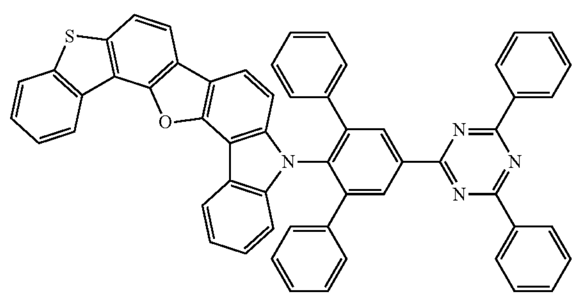
73
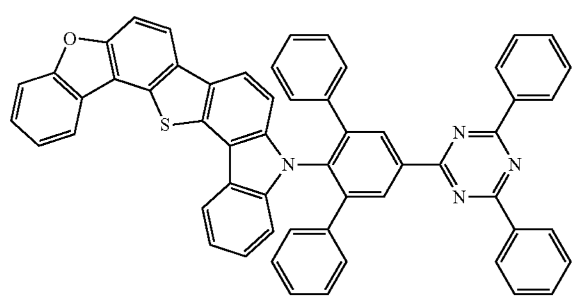
74
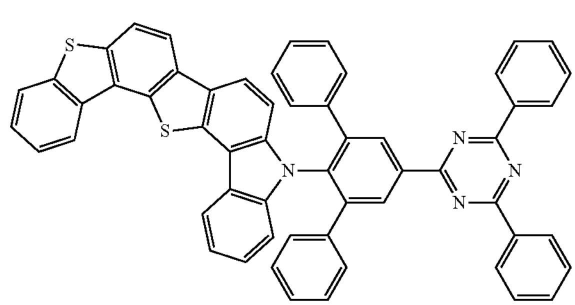

-continued
75
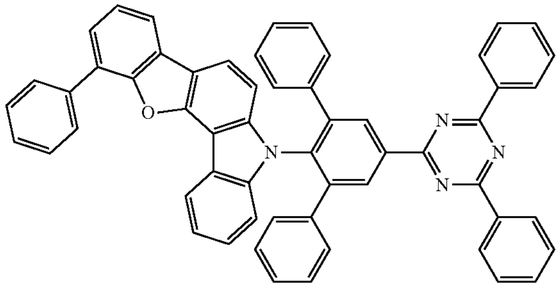
76
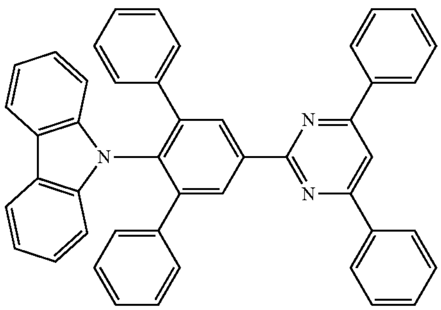
77
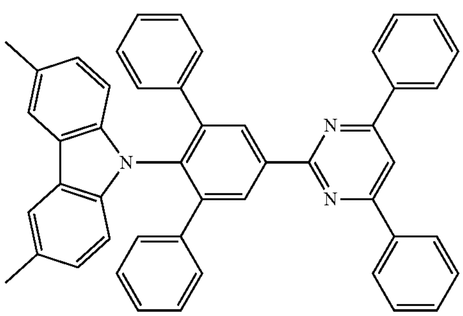
78
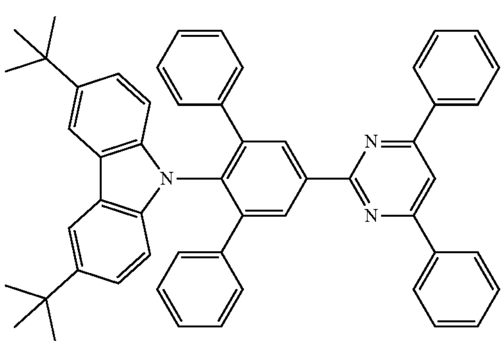
-continued
79
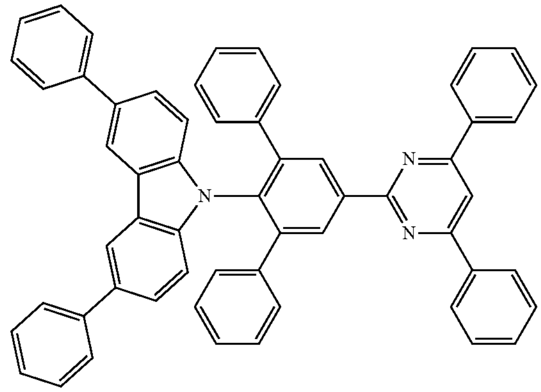
80
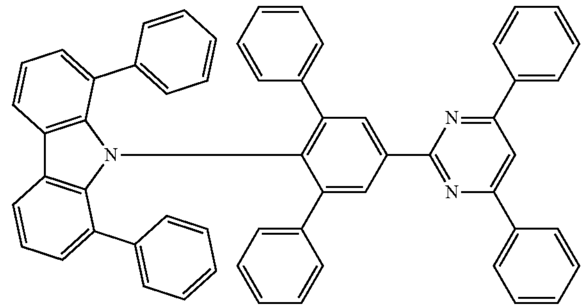
81
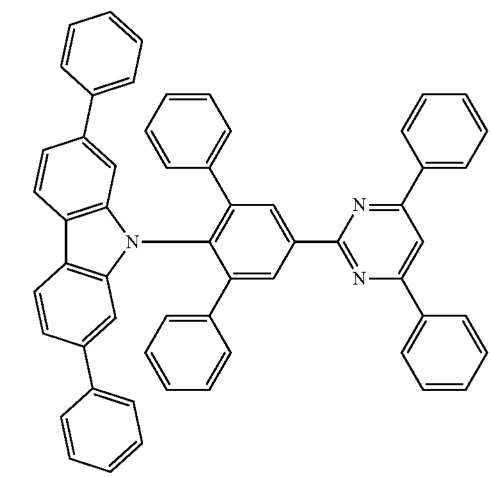
82
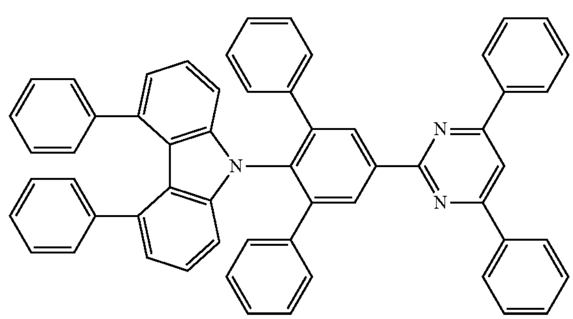

-continued
83
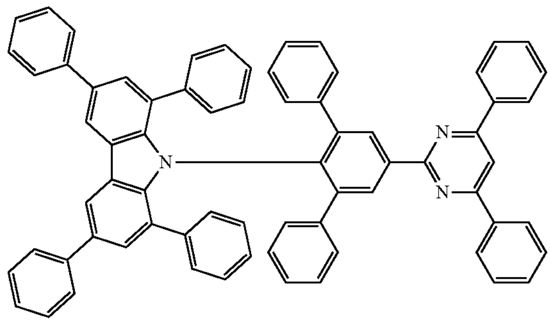
84
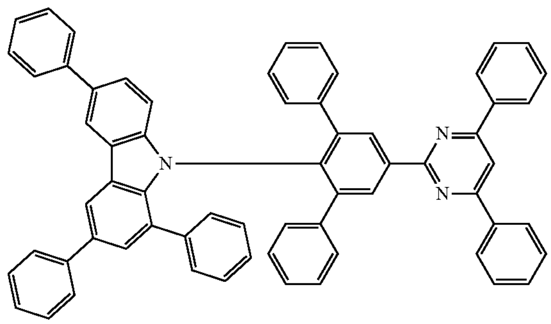
85
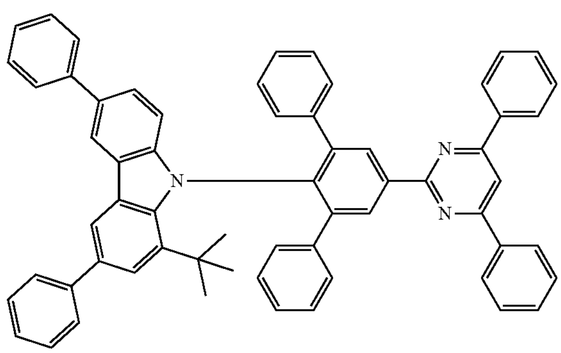
86
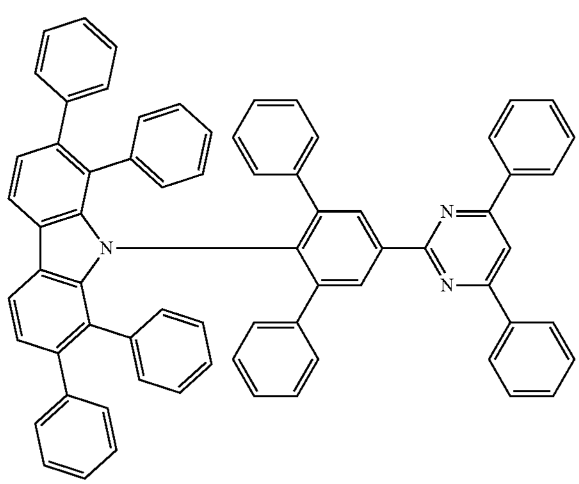
87
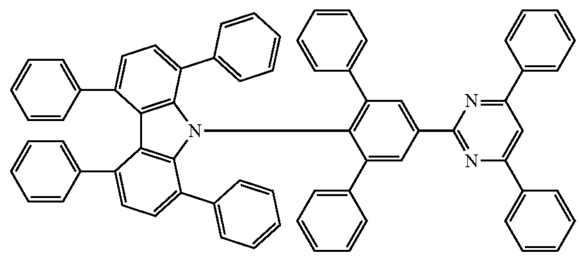
88
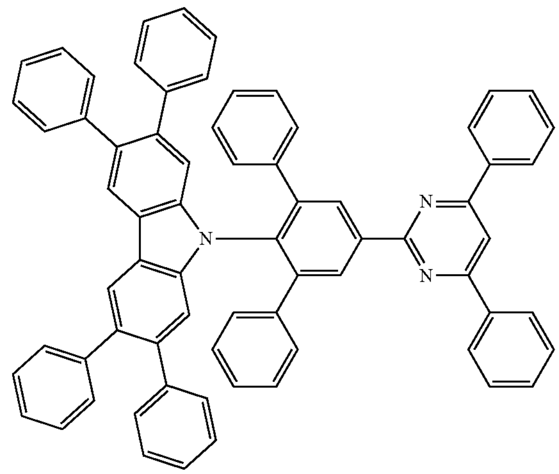
89
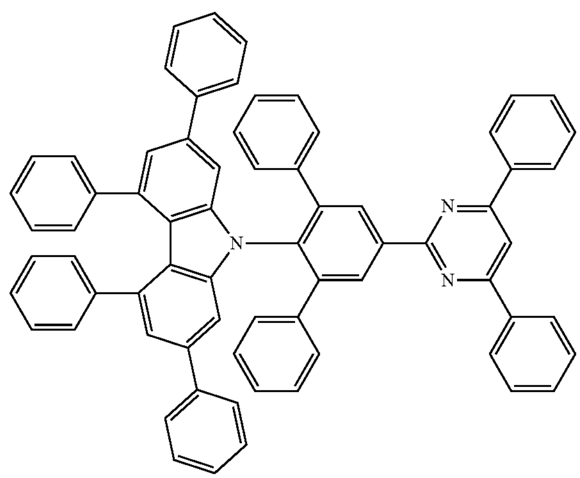
90
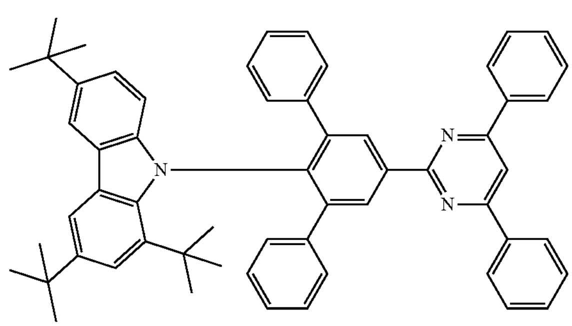

-continued
91
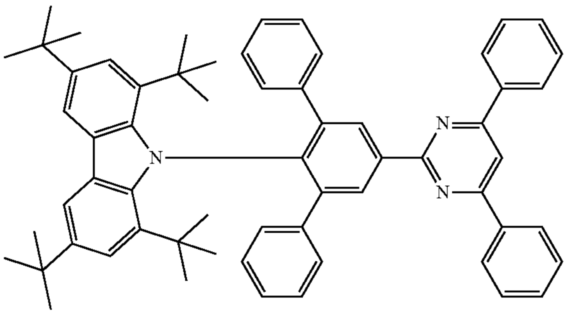
92
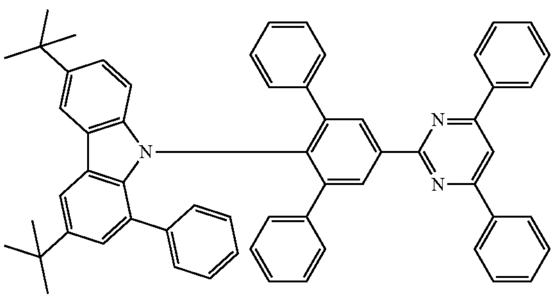
93
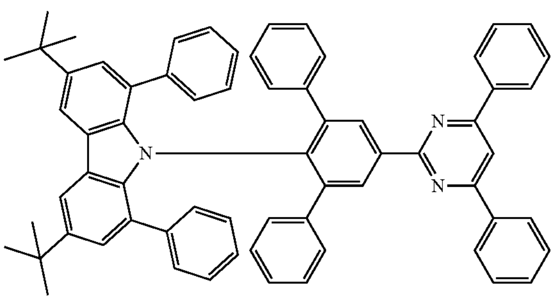
94
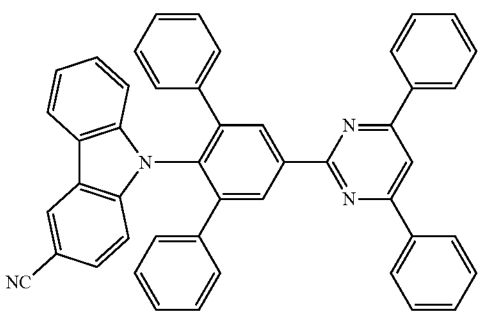
95
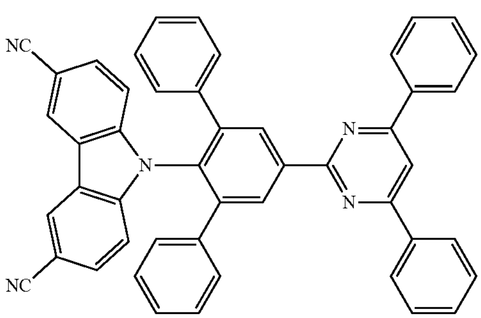
-continued
96
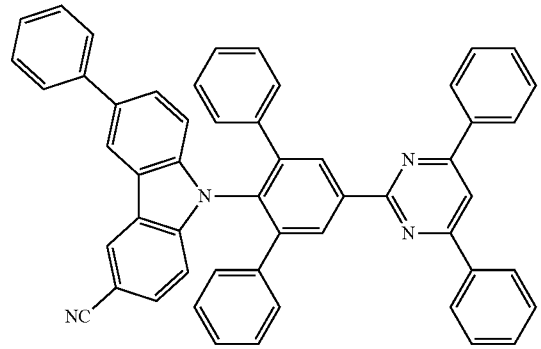
97
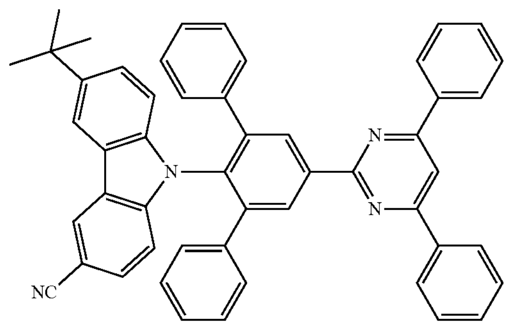
98
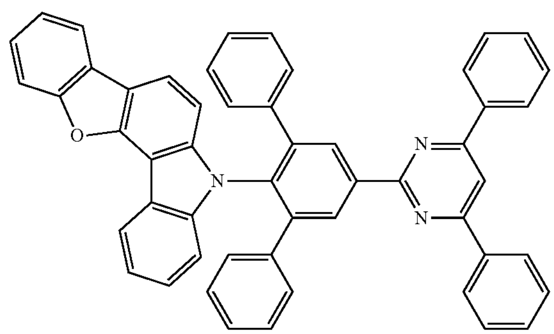
99
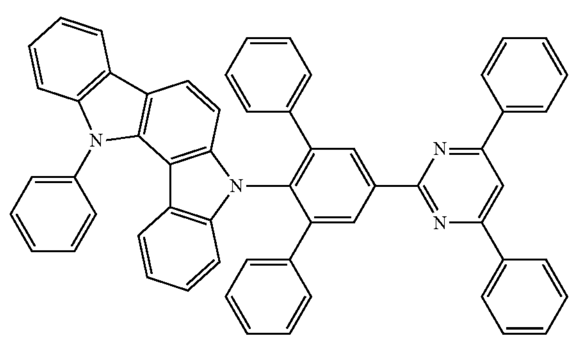

-continued
100
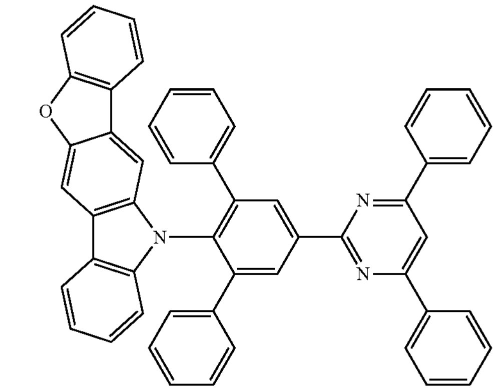
101
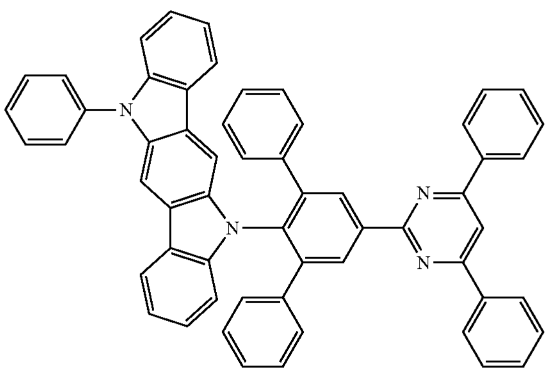
102
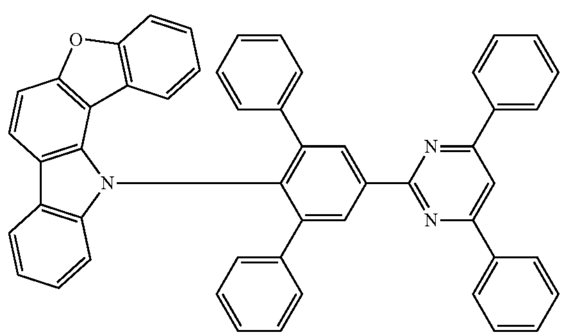
103
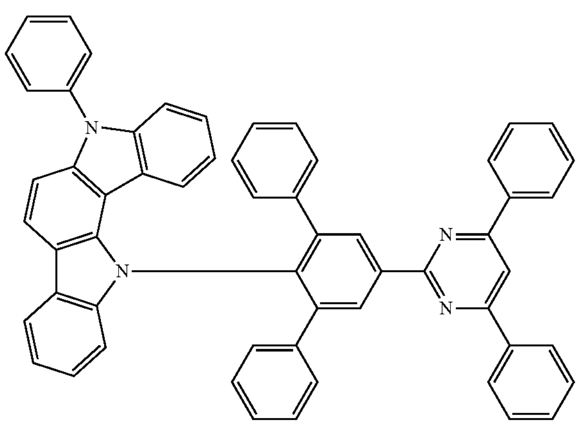
-continued
104
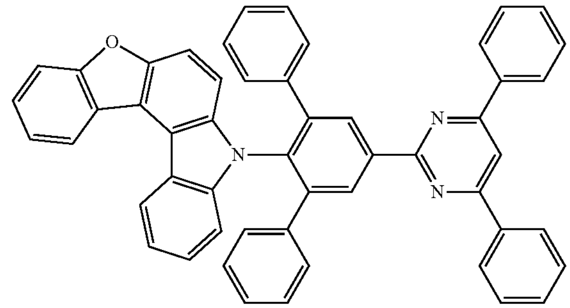
105
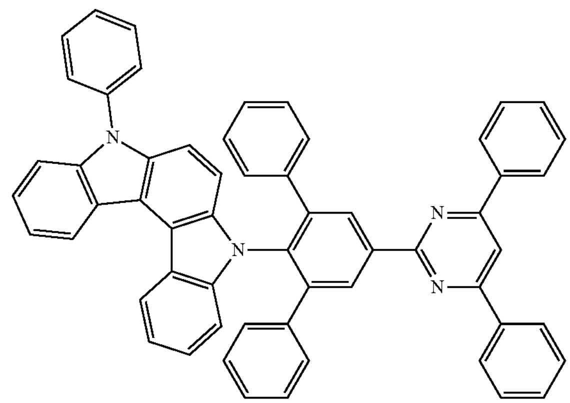
106
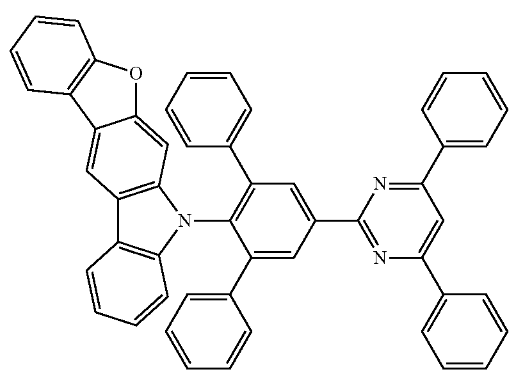
107
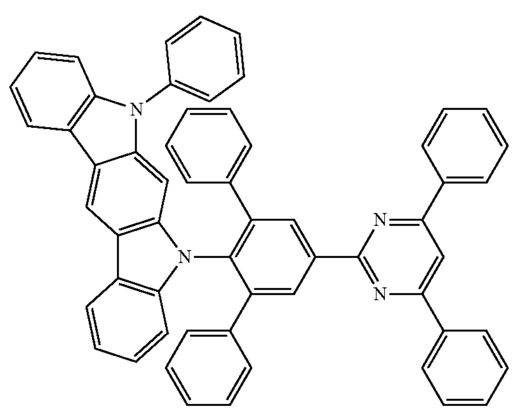

108
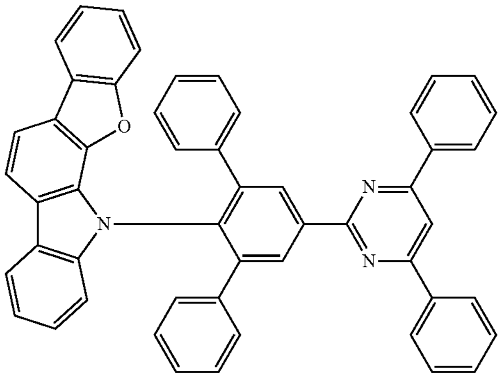
109
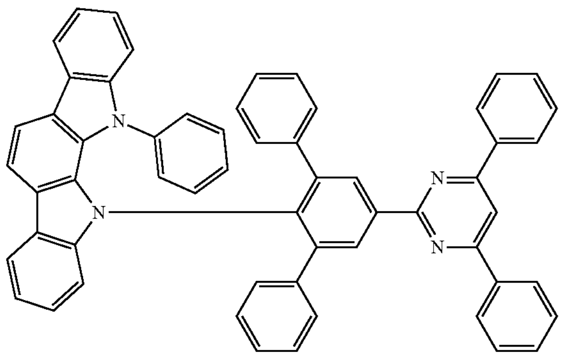
110
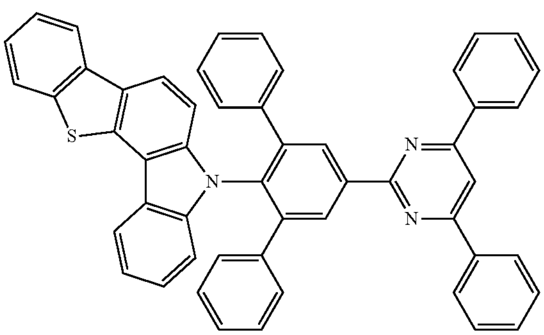
111
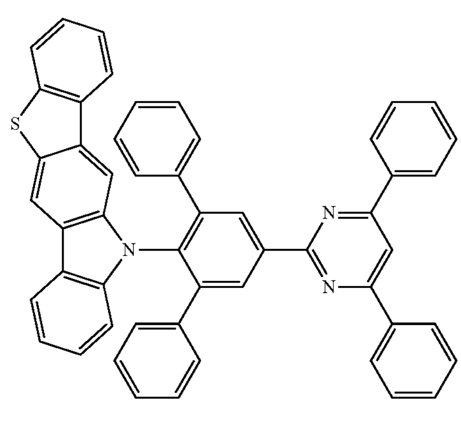
112
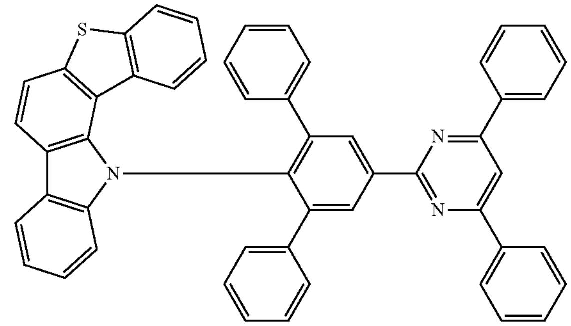
113
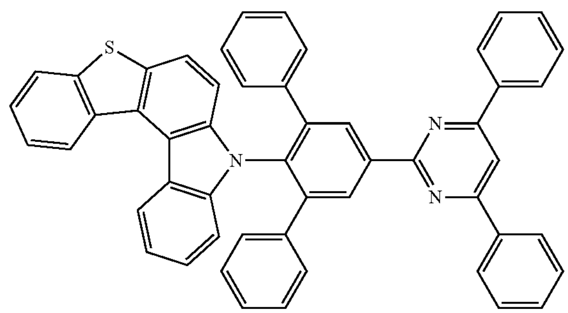
114
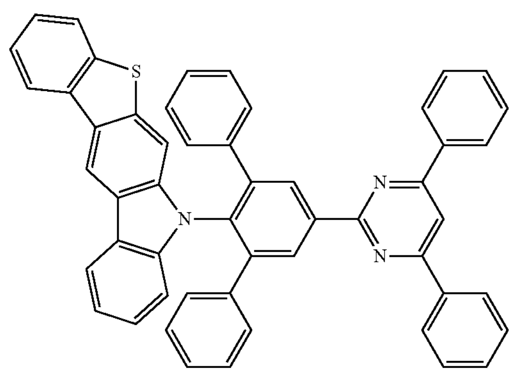
115
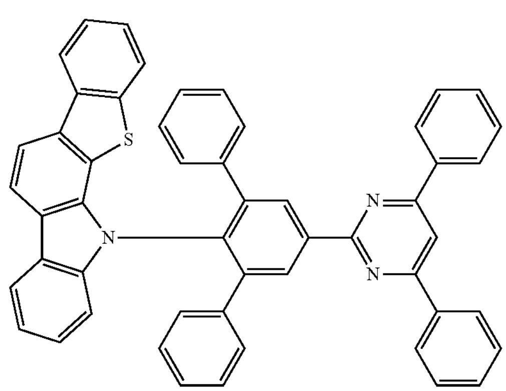

-continued
116
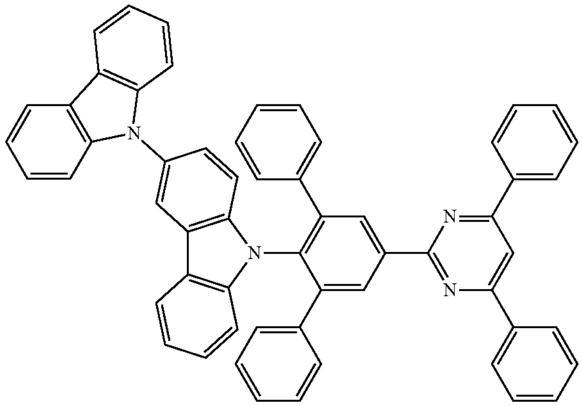
117
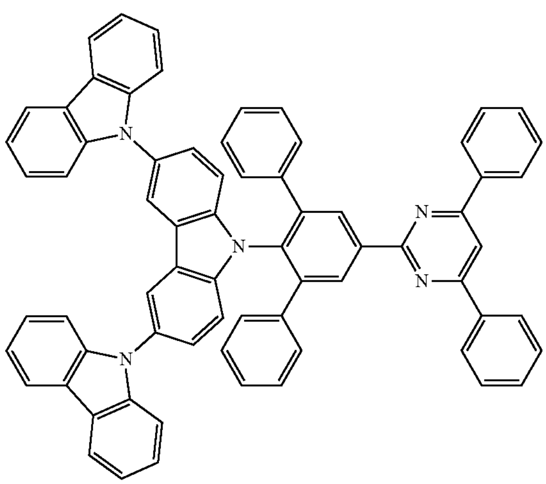
118
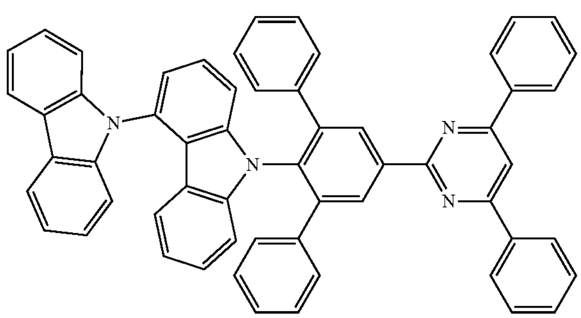
-continued
119
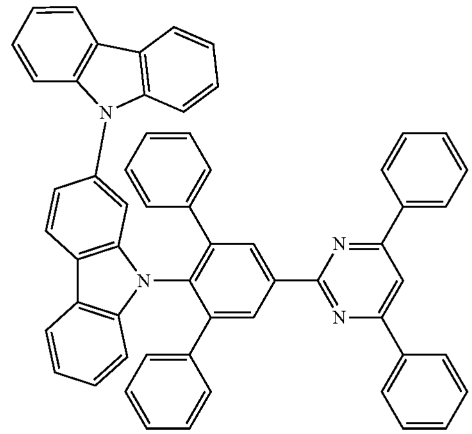
120
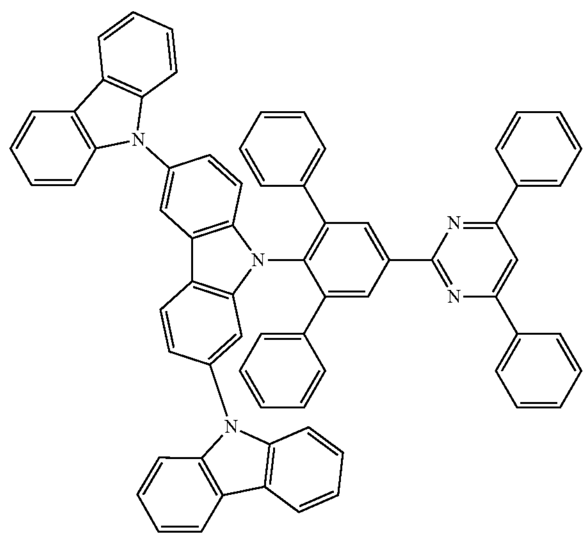
121
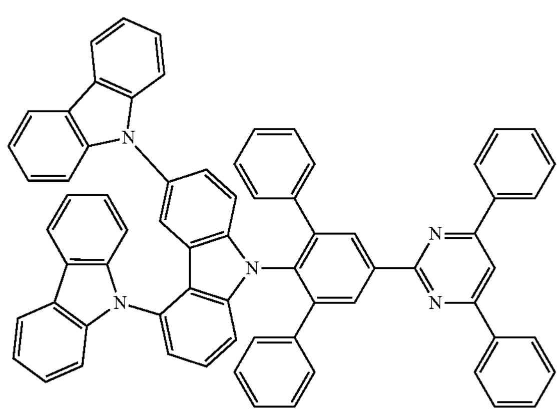

-continued
122
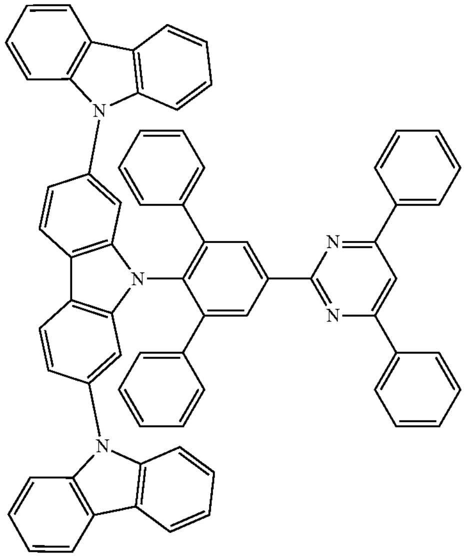
123
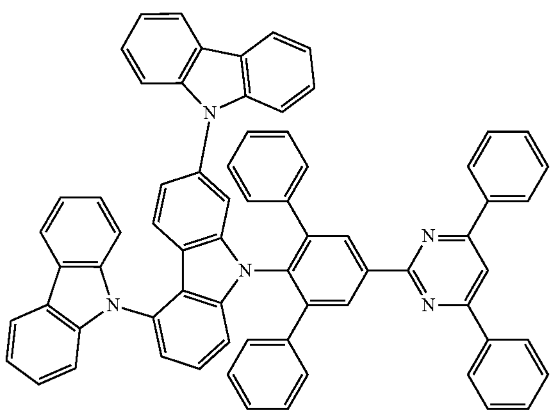
124
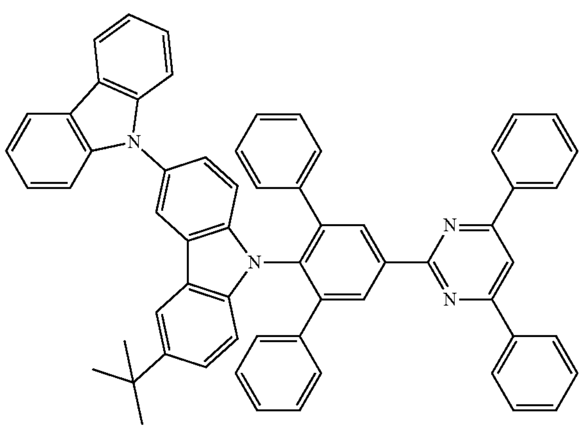
-continued
125
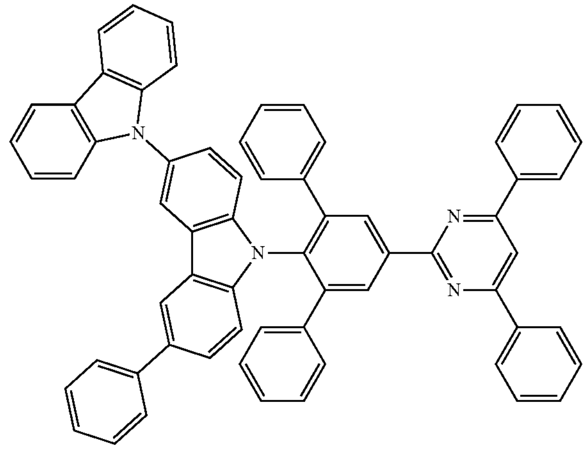
126
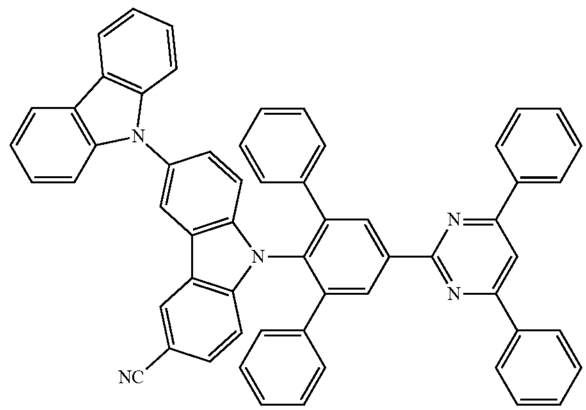
127
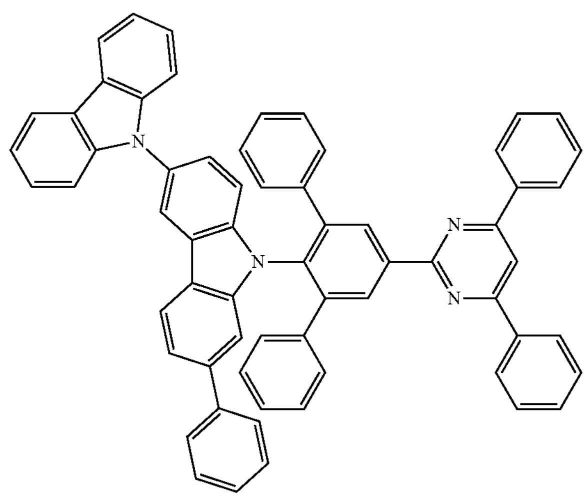

-continued
128
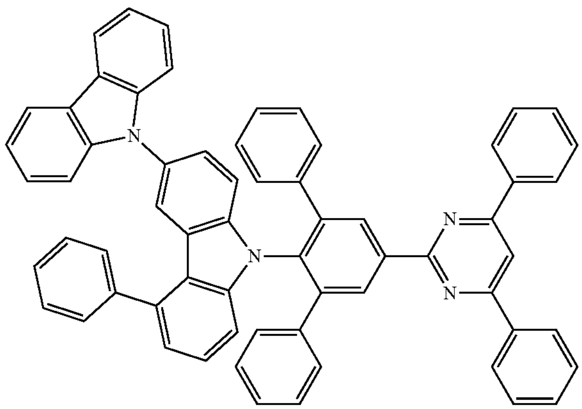
129
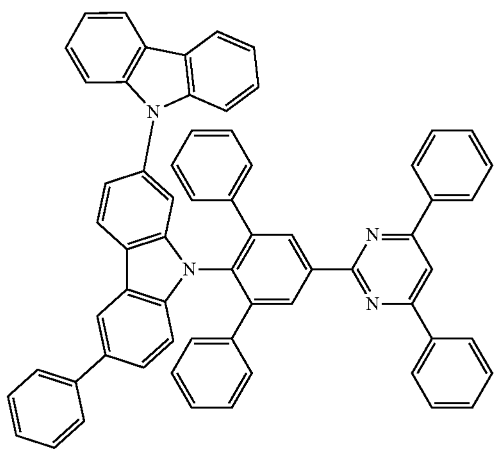
130
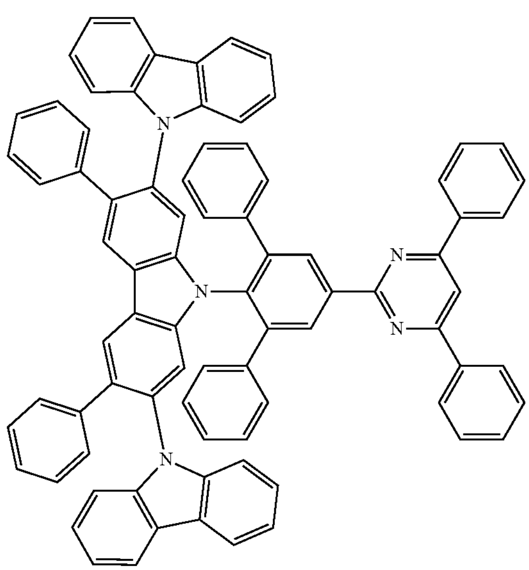
-continued
131
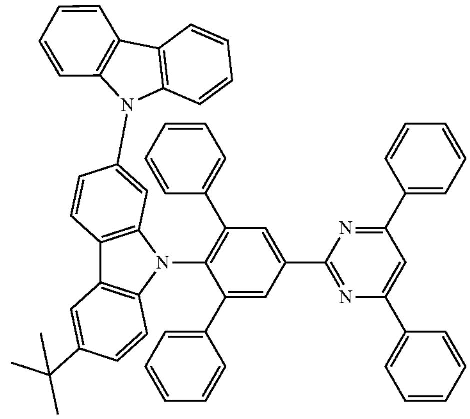
132
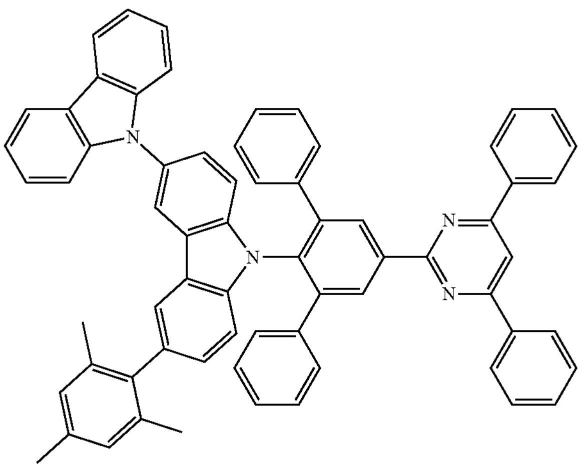
133
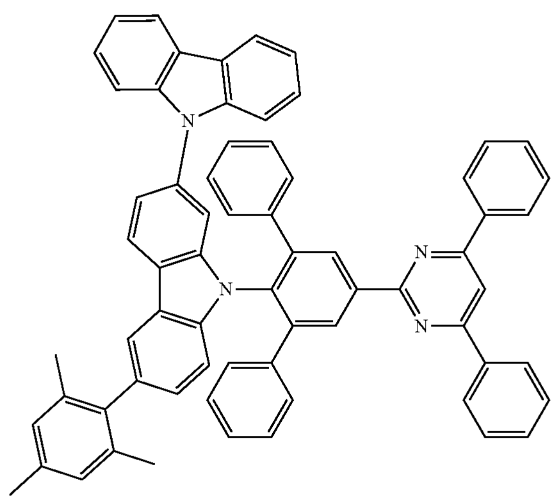

-continued
134
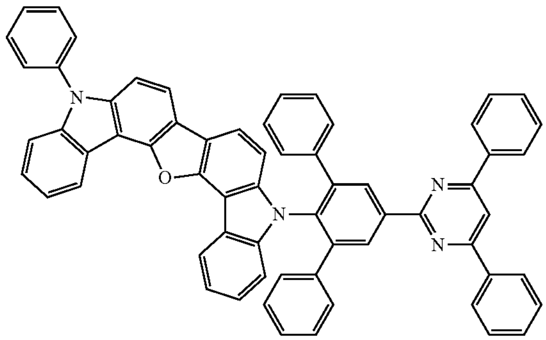
135
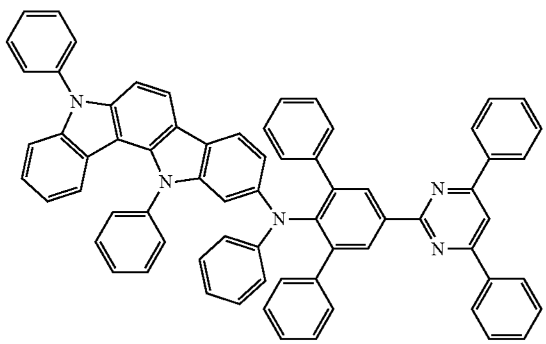
136
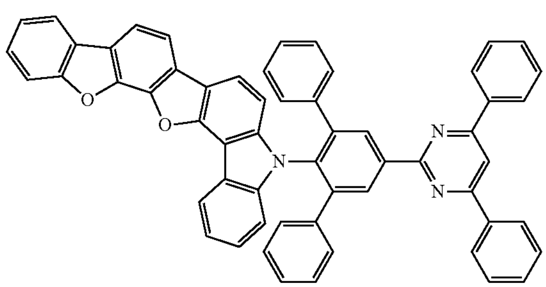
137
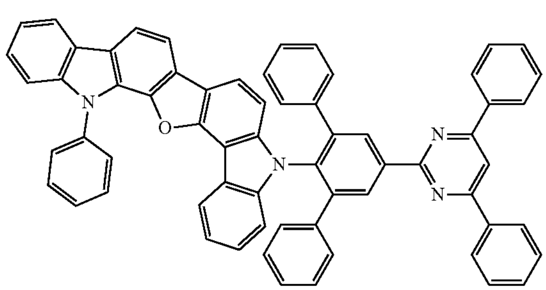
-continued
138
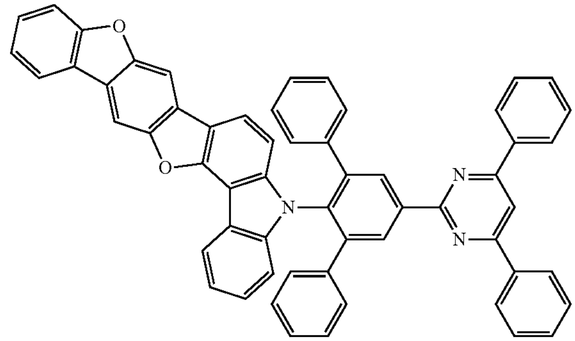
139
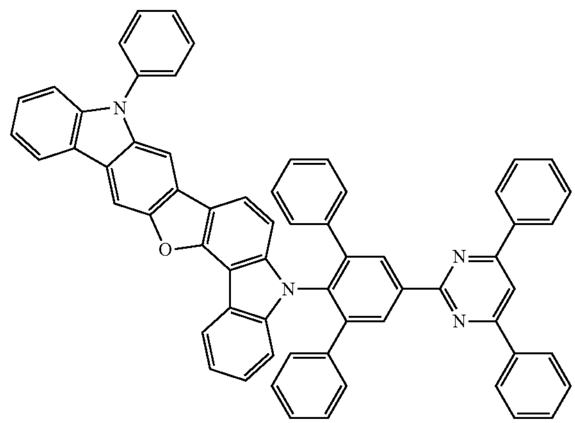
140
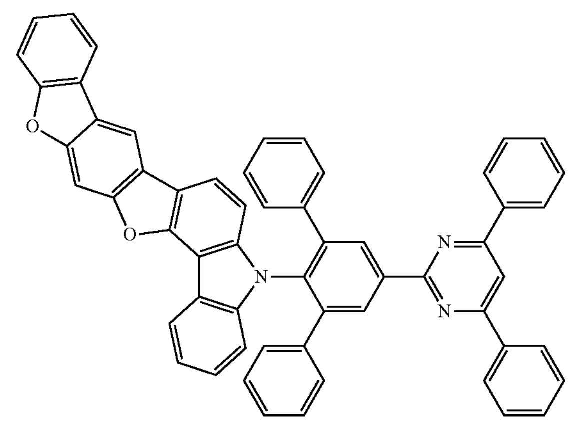
141
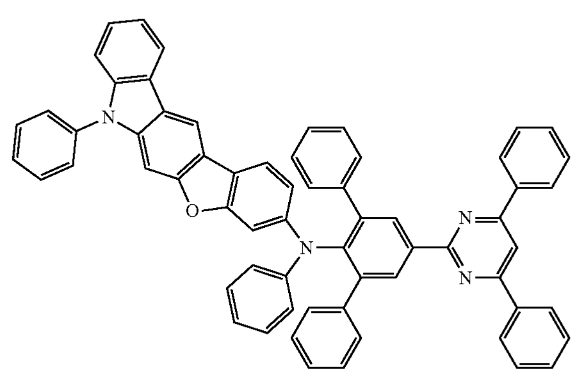

142
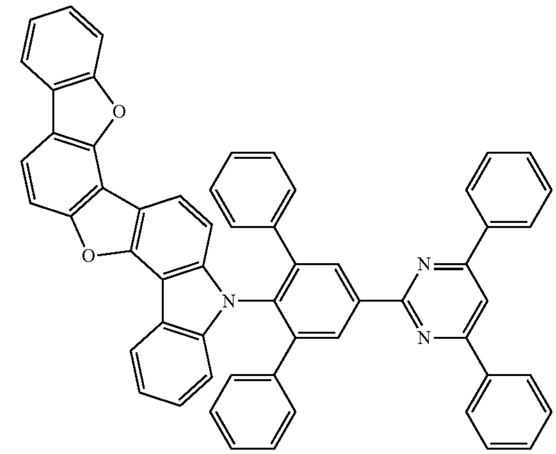
143
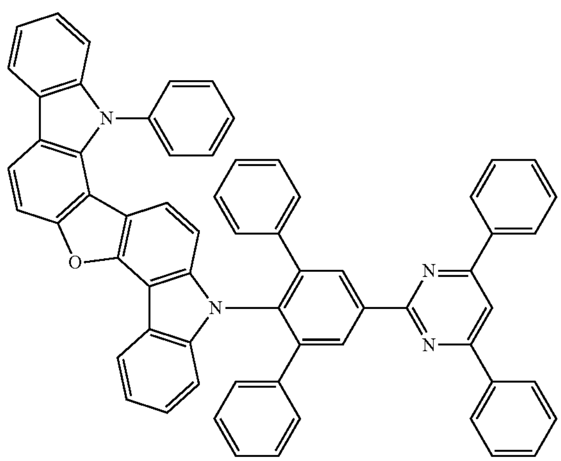
144
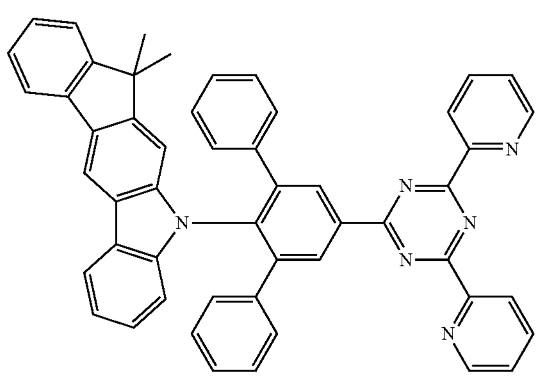
145
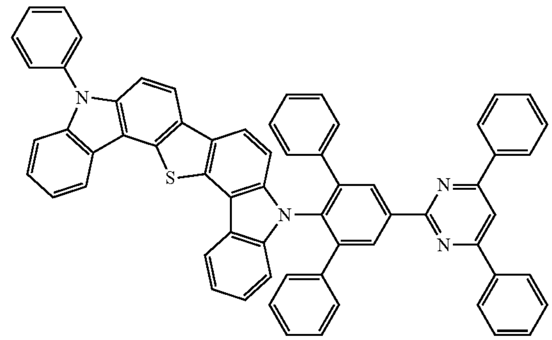
146
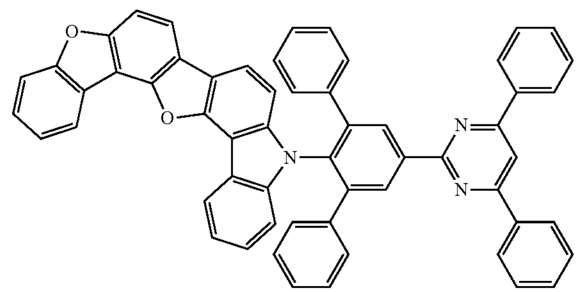
147
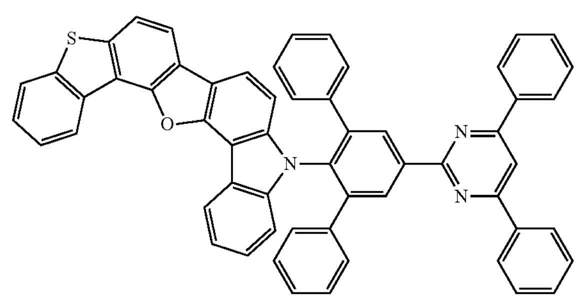
148
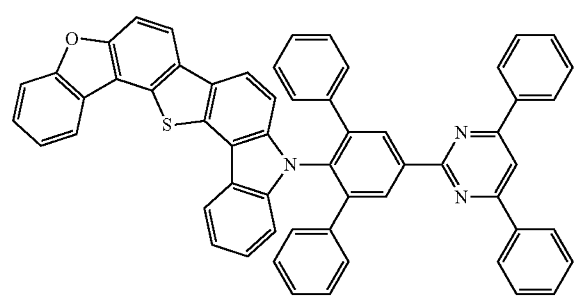
149
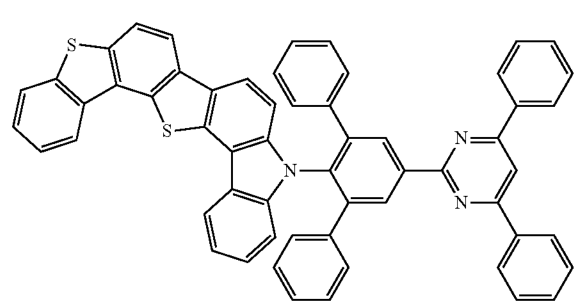

150
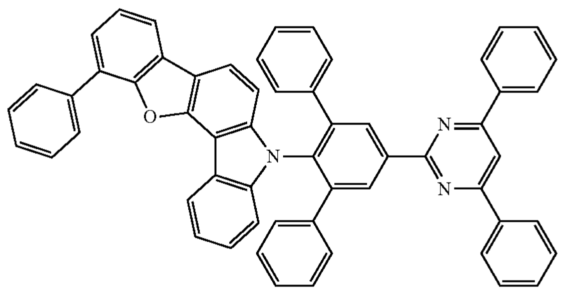
151
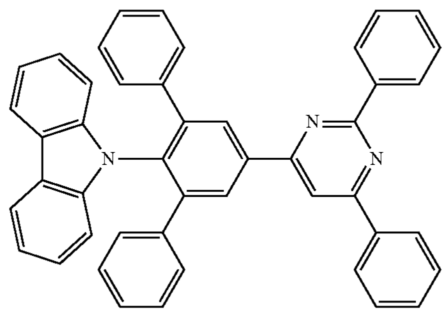
152
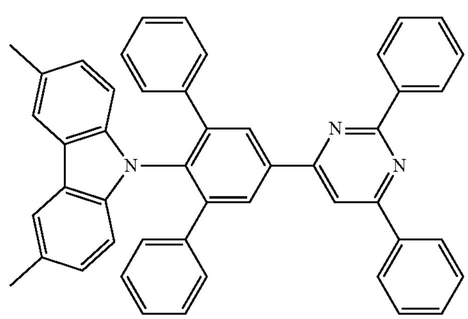
153
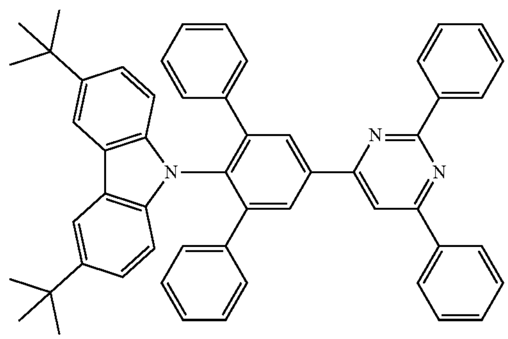
154
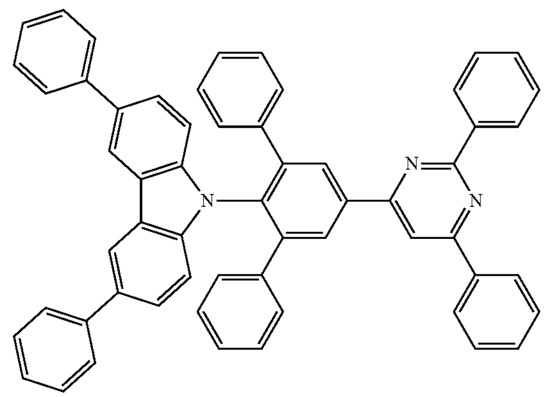
155
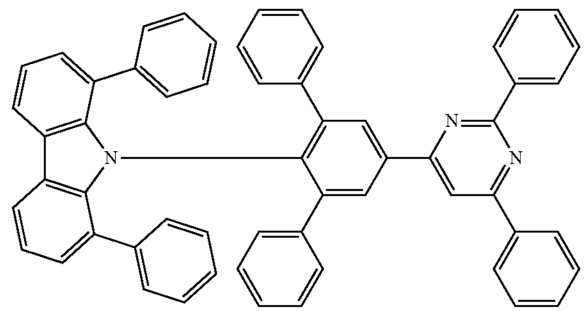
156
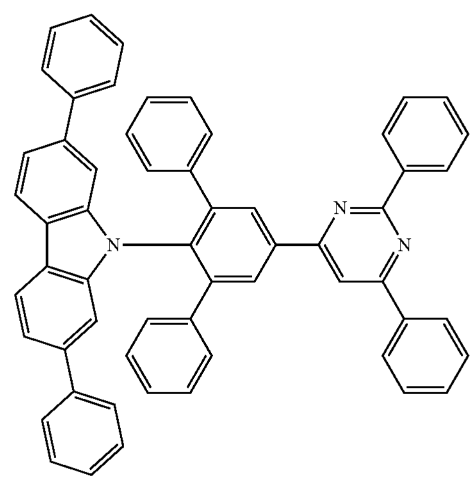
157
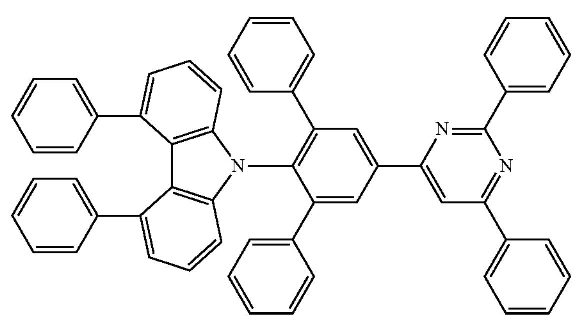

-continued
158
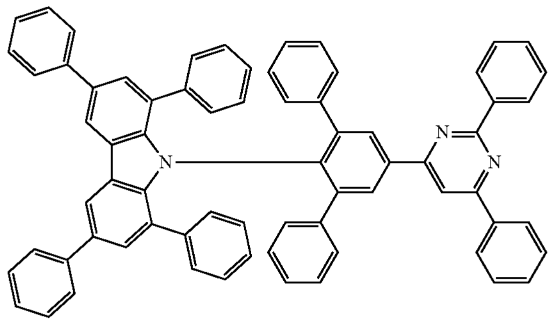
159
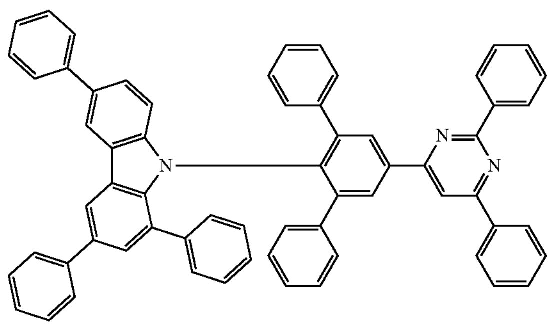
160
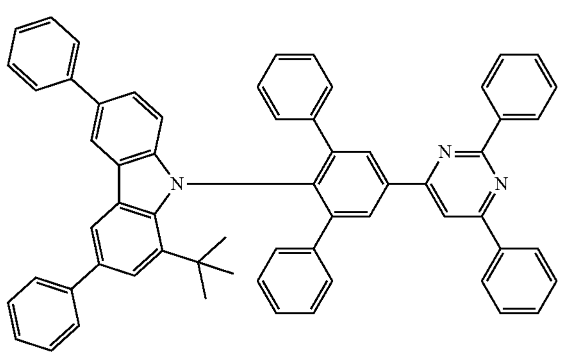
161
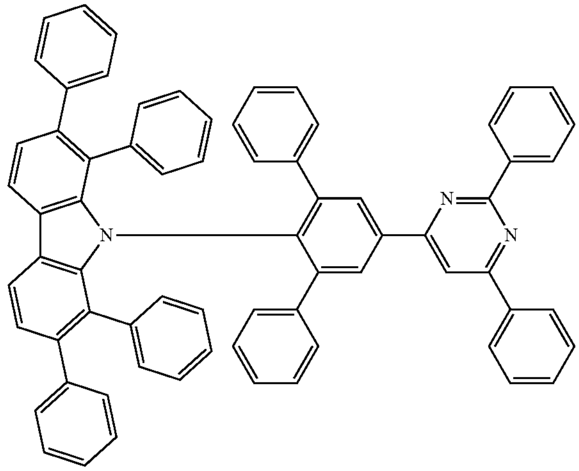
-continued
162
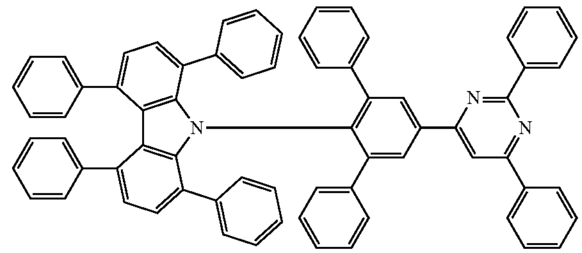
163
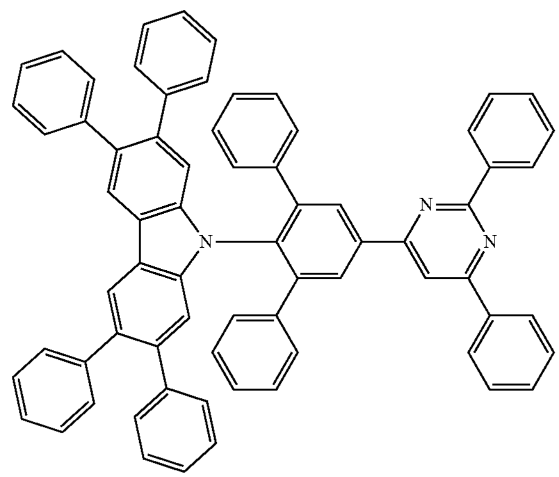
164
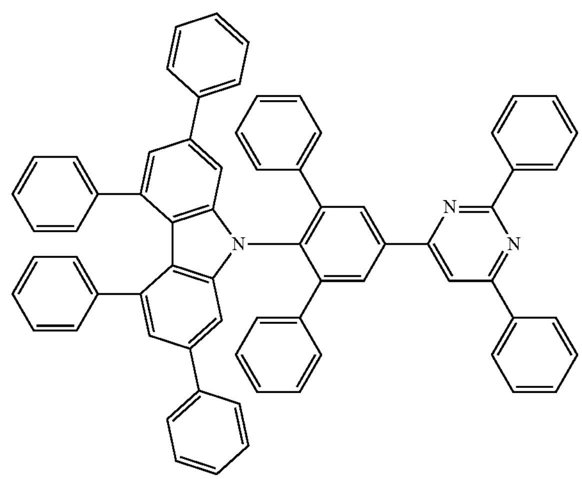
165
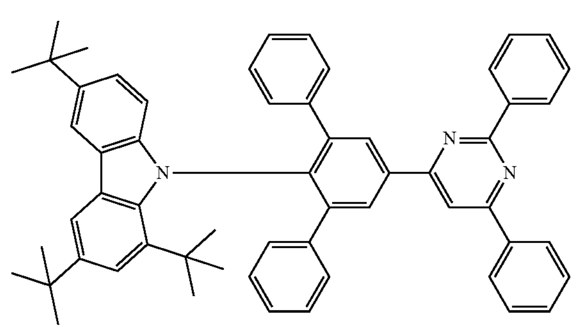

166
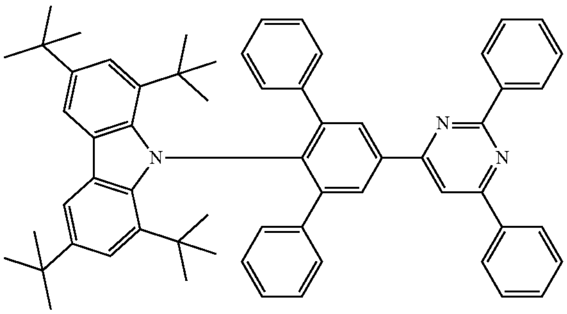
167
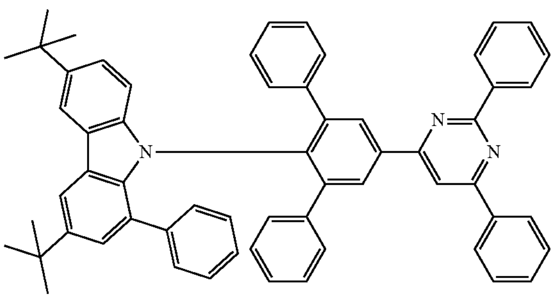
168
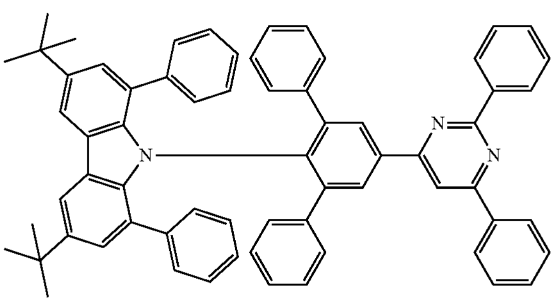
169
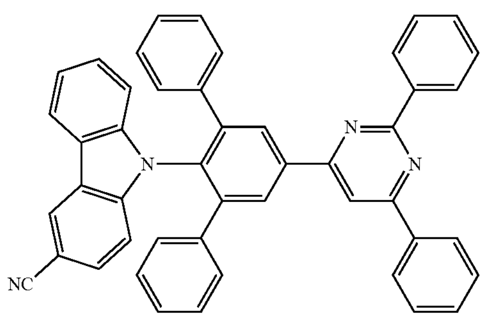
170
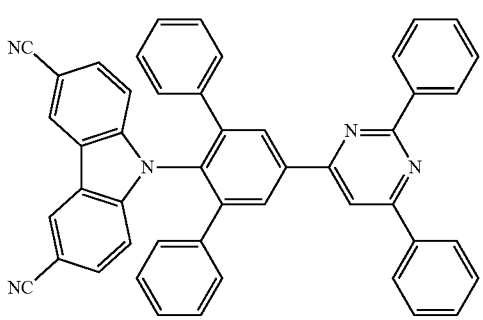
171
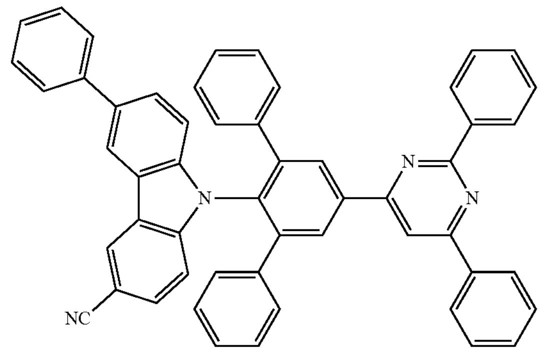
172
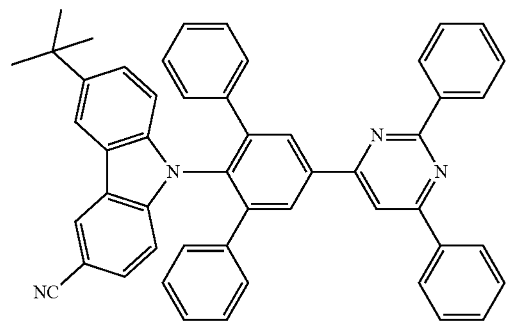
173
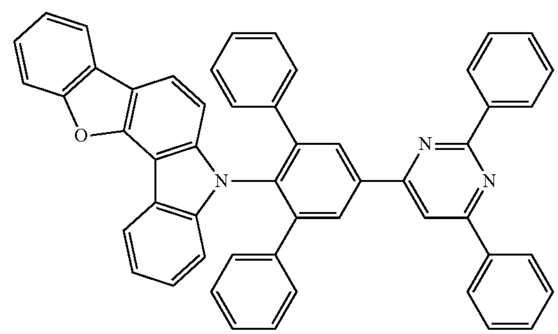
174
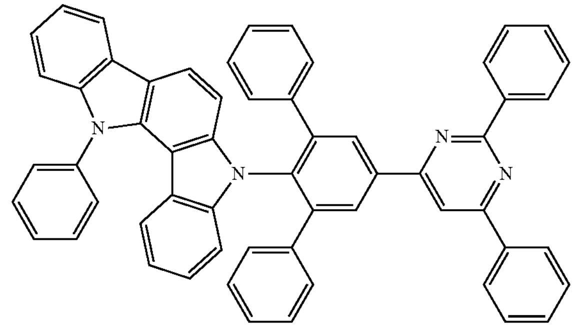

-continued
175
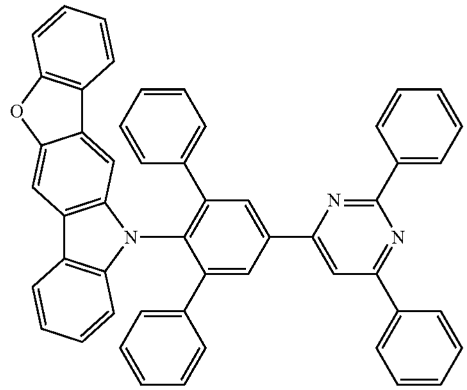
176
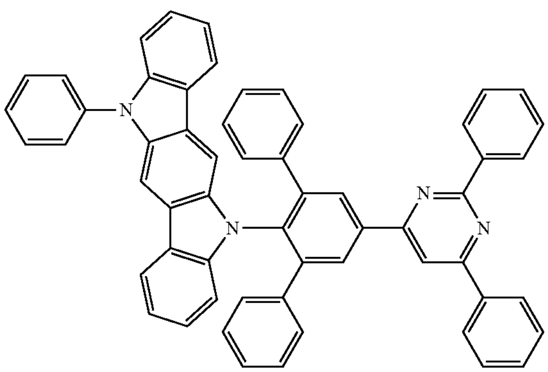
177
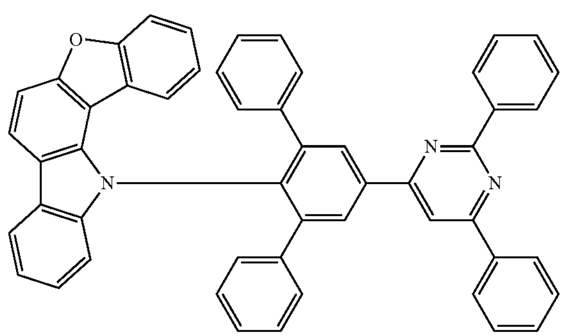
178
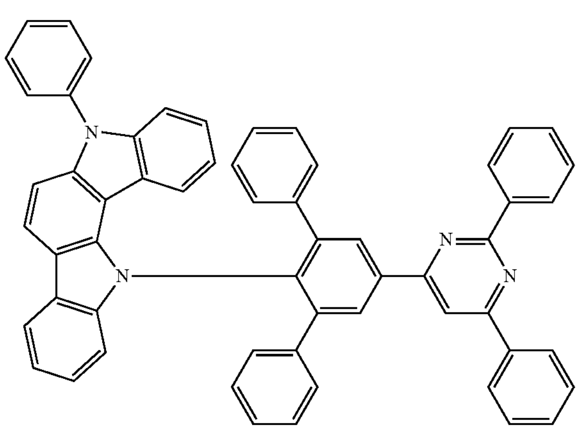
-continued
179
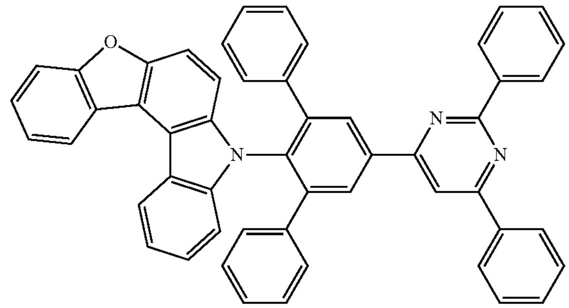
180
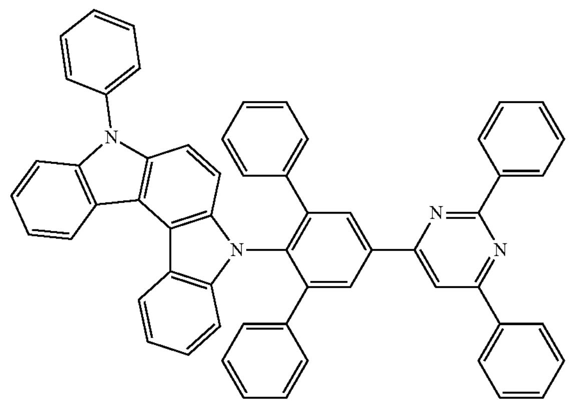
181
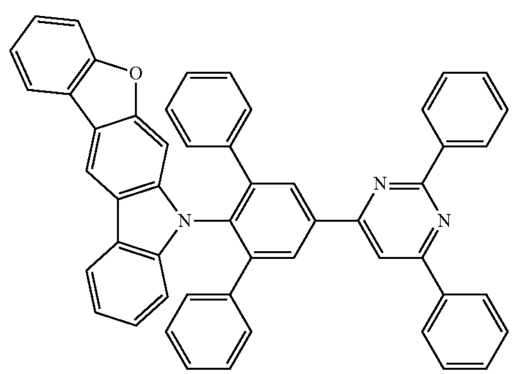
182
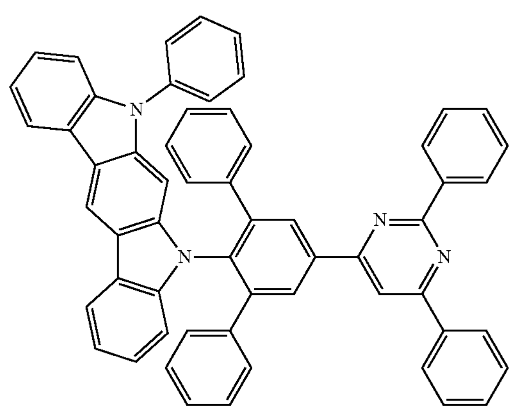

-continued
183
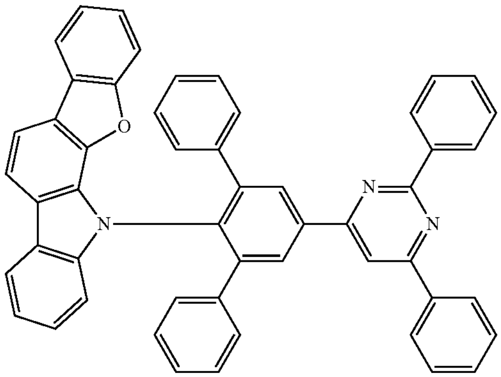
184
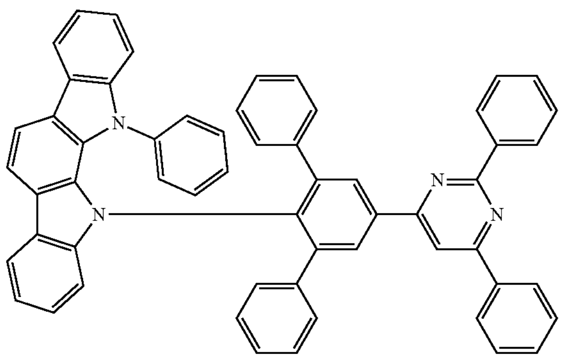
185
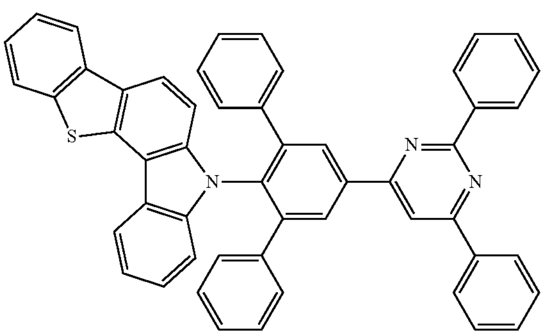
186
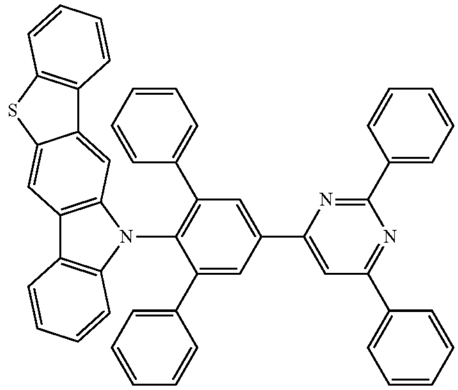
-continued
187
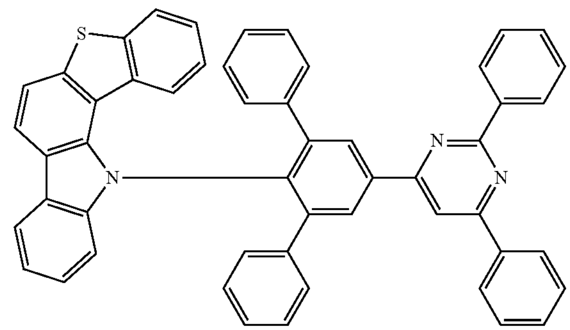
188
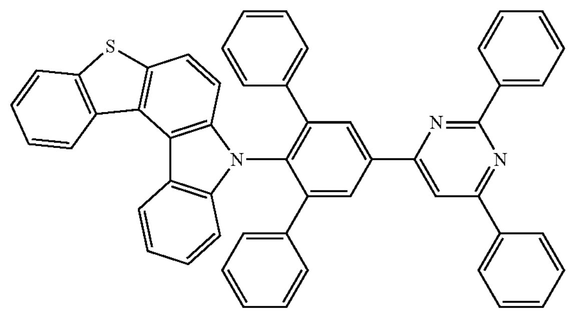
189
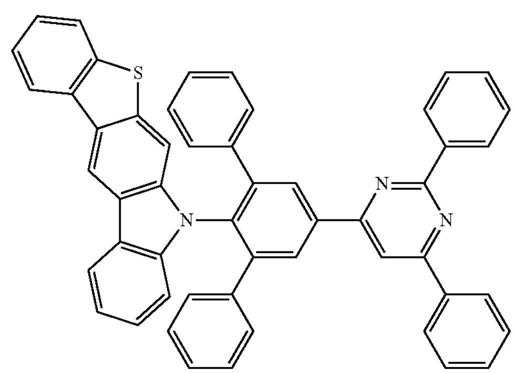
190
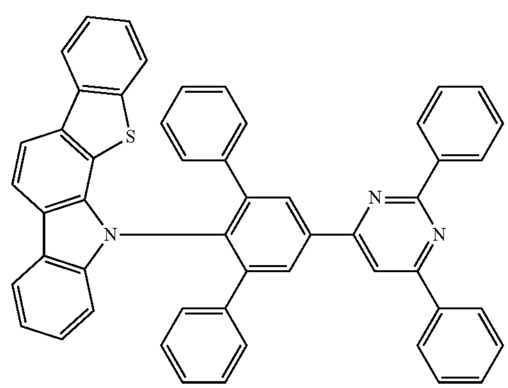

-continued
191
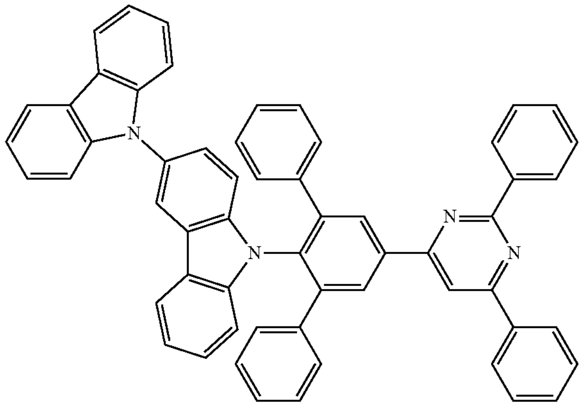
192
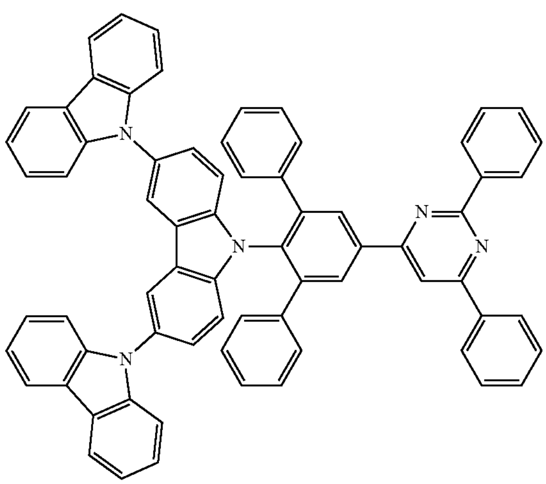
193
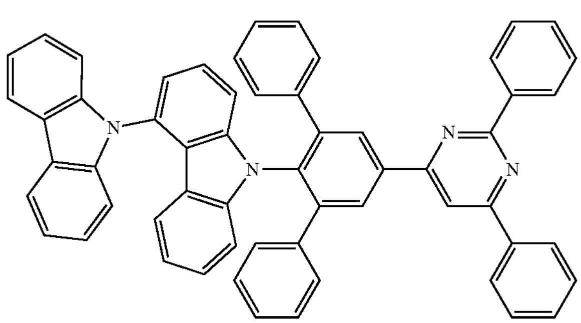
-continued
194
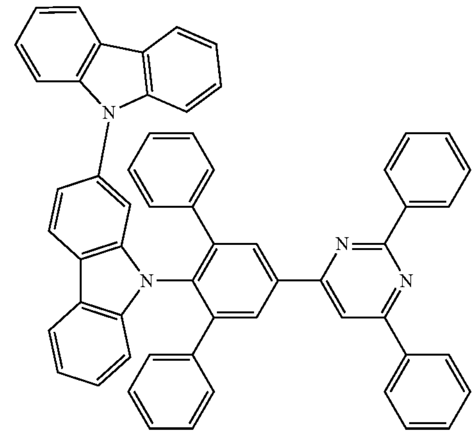
195
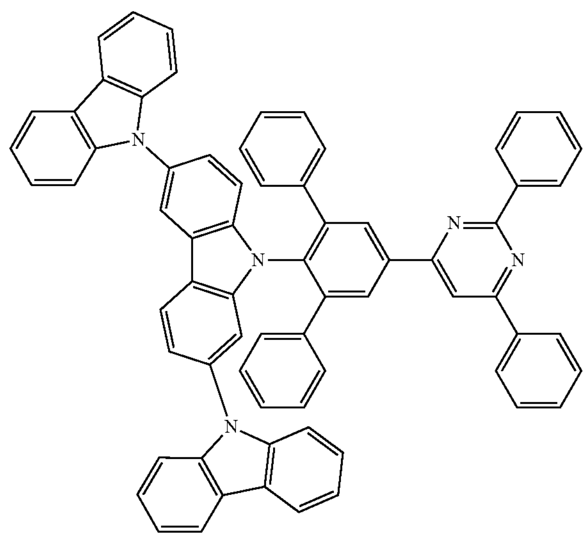
196
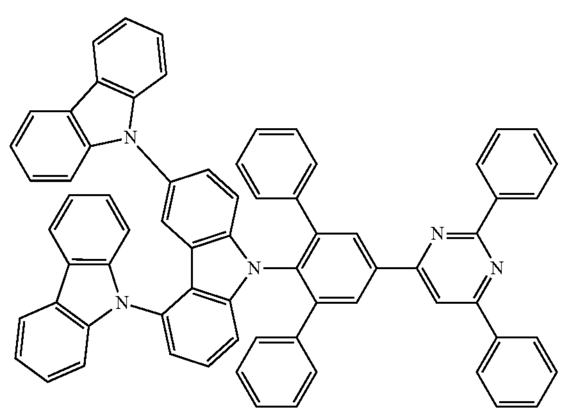

197
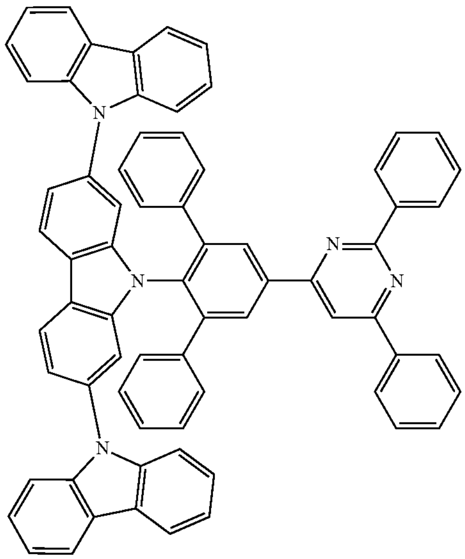
198
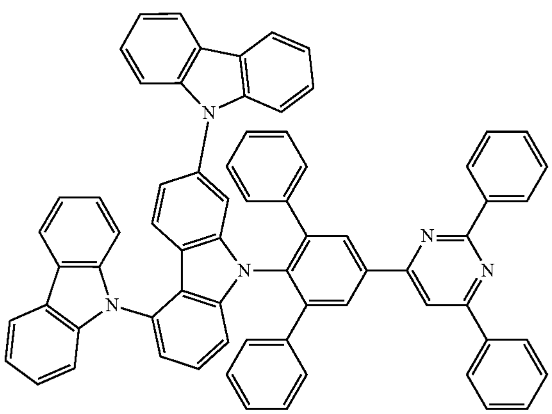
199
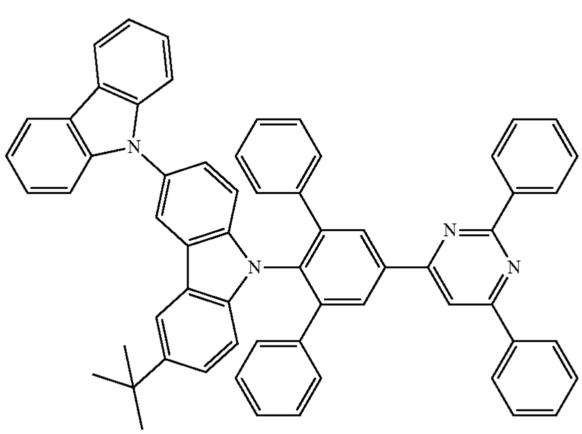
200
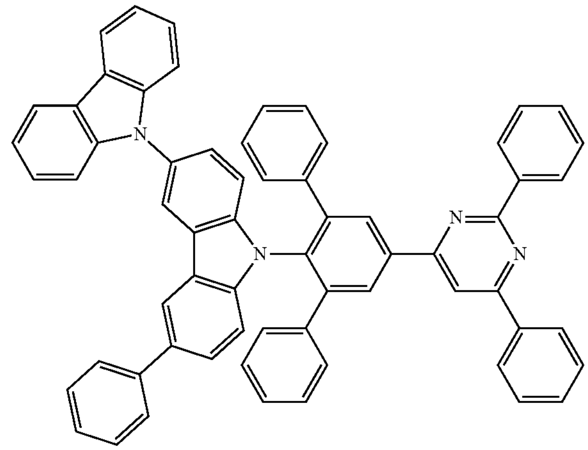
201
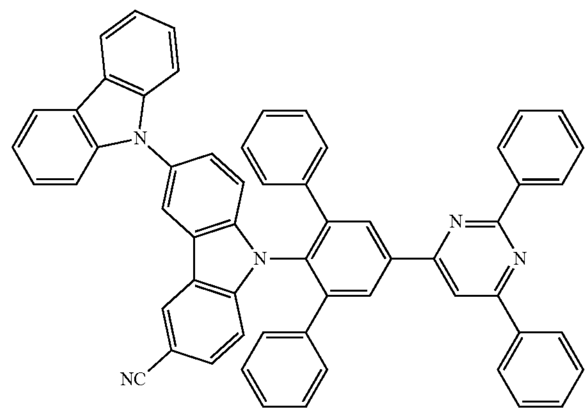
202
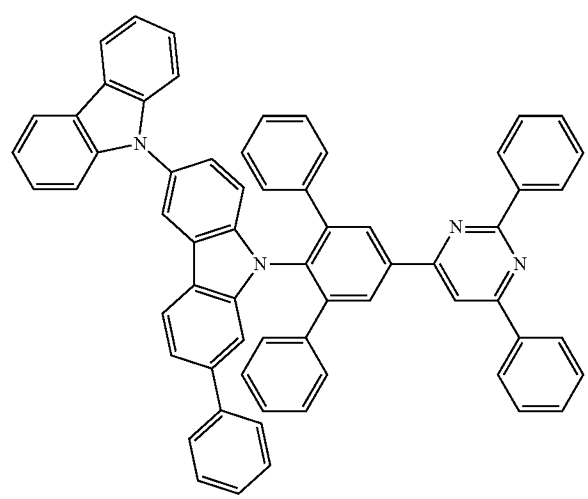

-continued
203
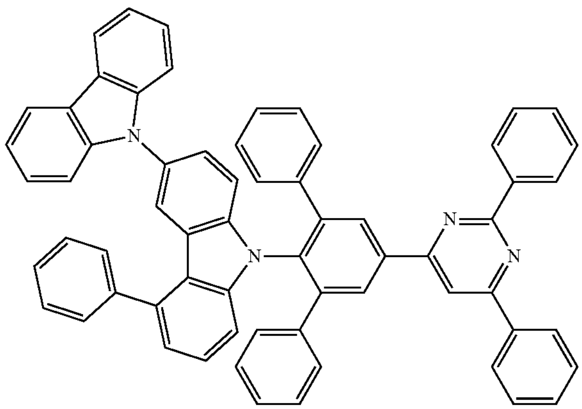
204
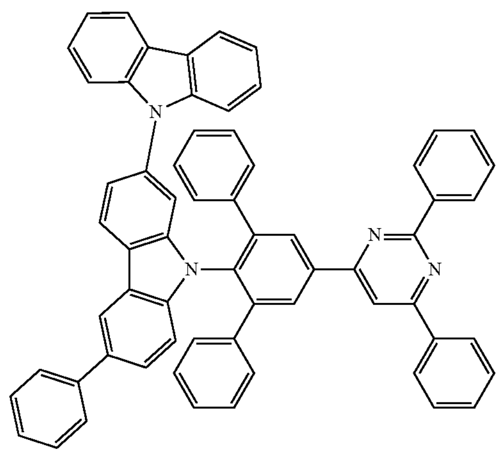
205
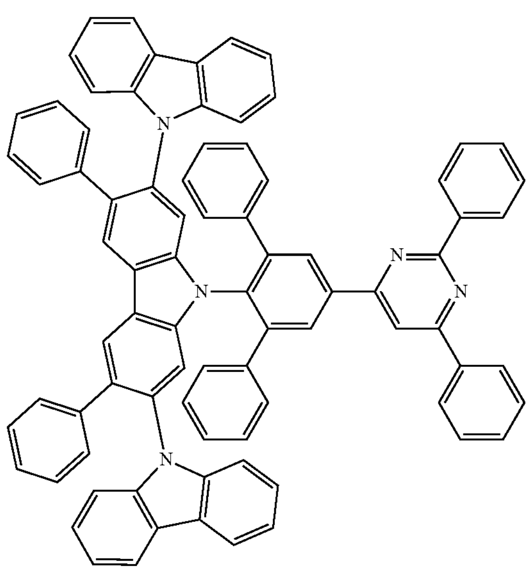
-continued
206
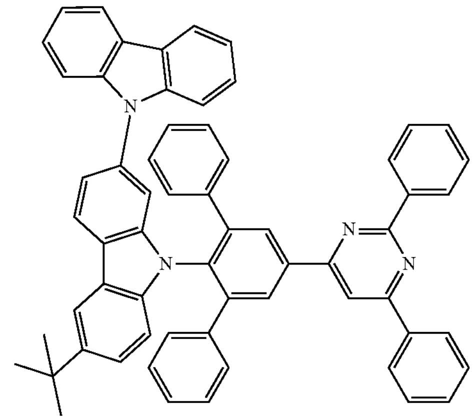
207
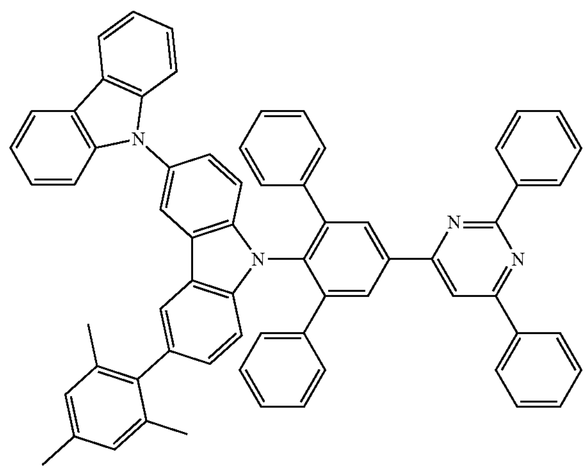
208
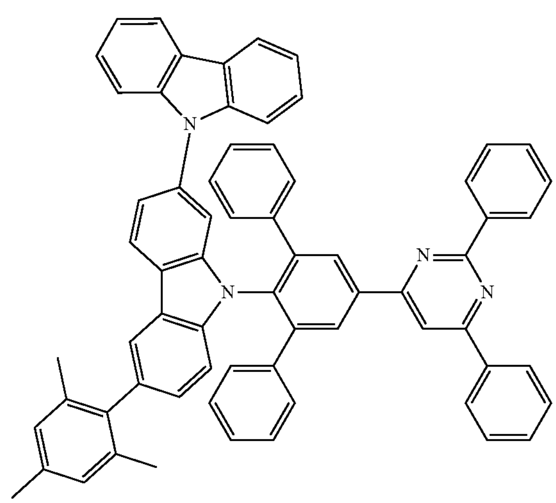

-continued
209
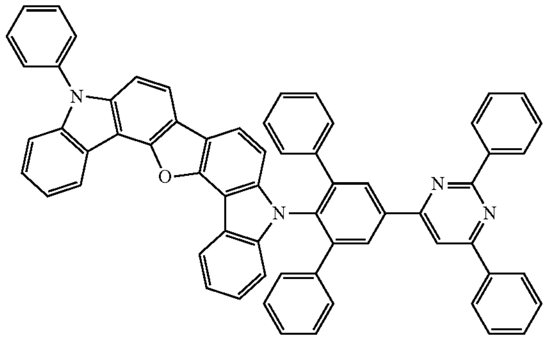
210
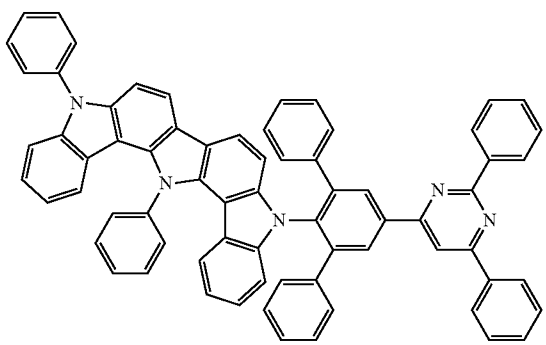
211
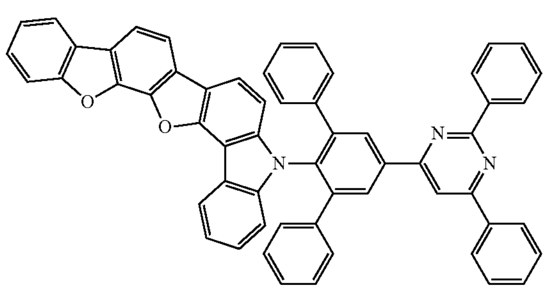
212
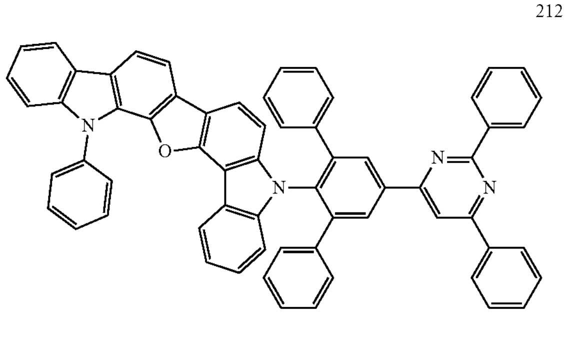
-continued
213
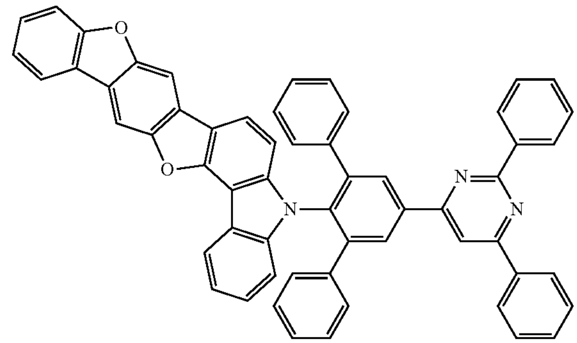
214
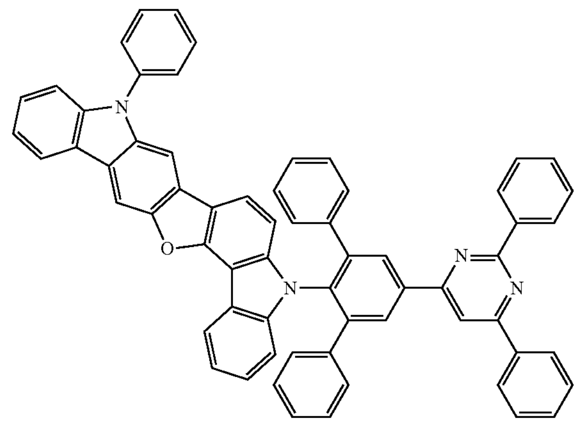
215
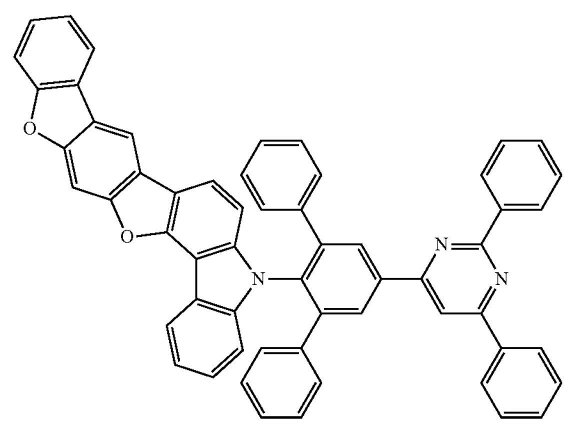
216
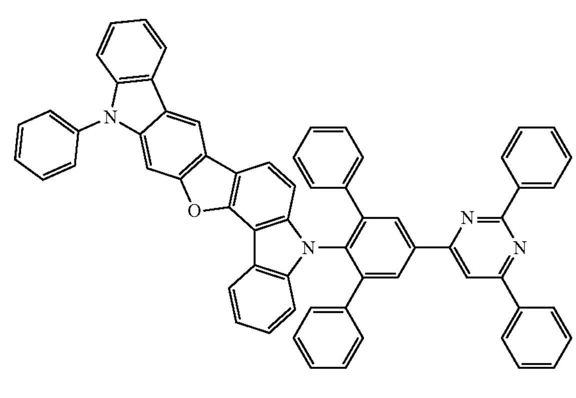

-continued
217
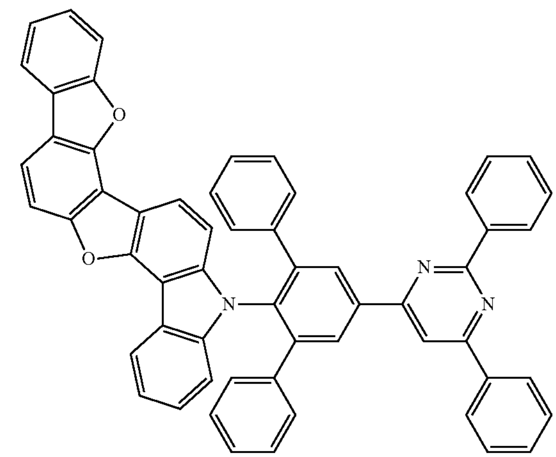
218
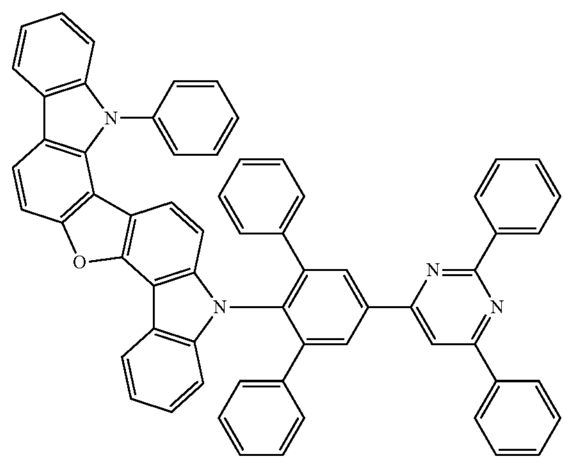
219
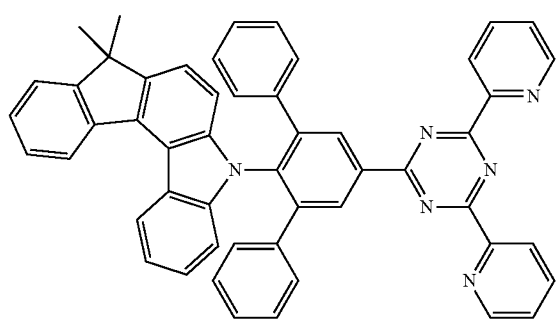
220
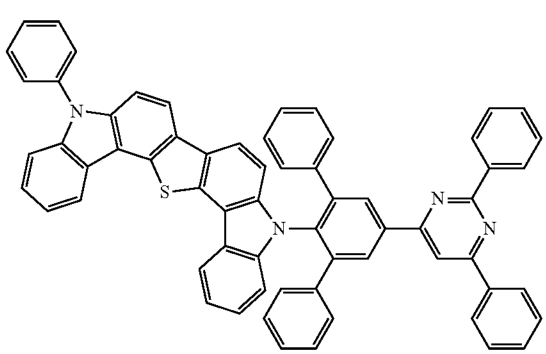
-continued
221
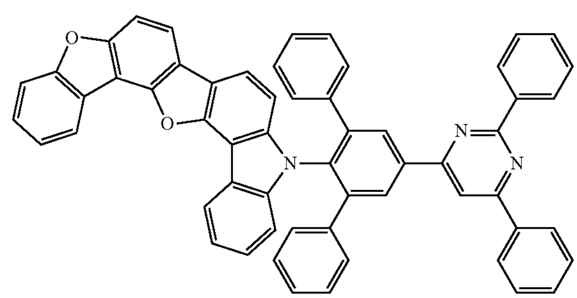
222
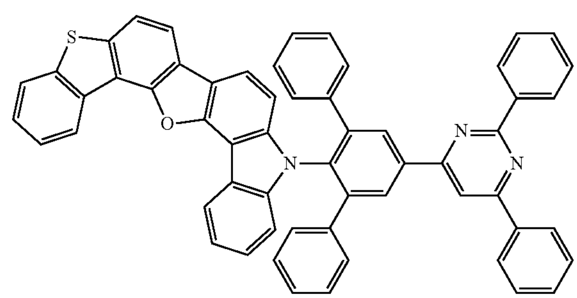
223
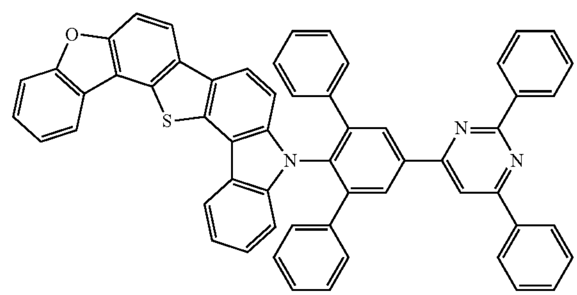
224
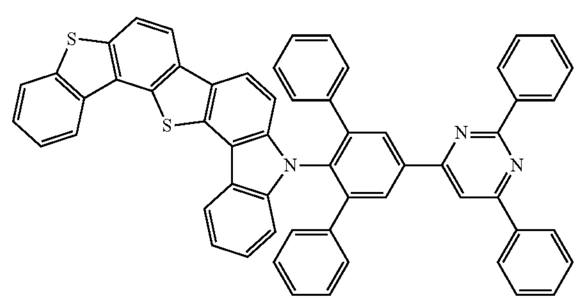
225
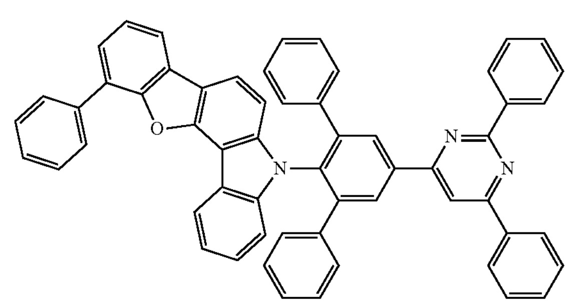

226
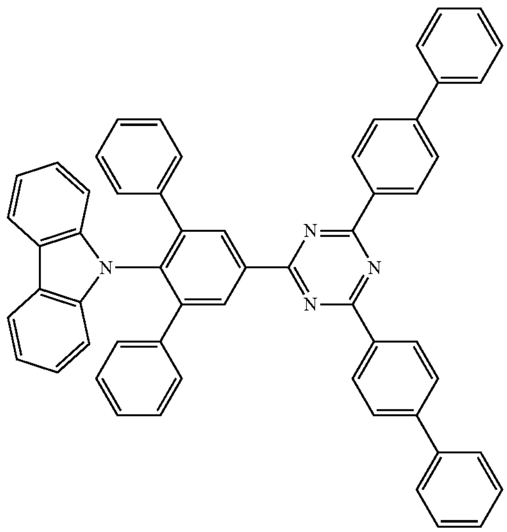
227
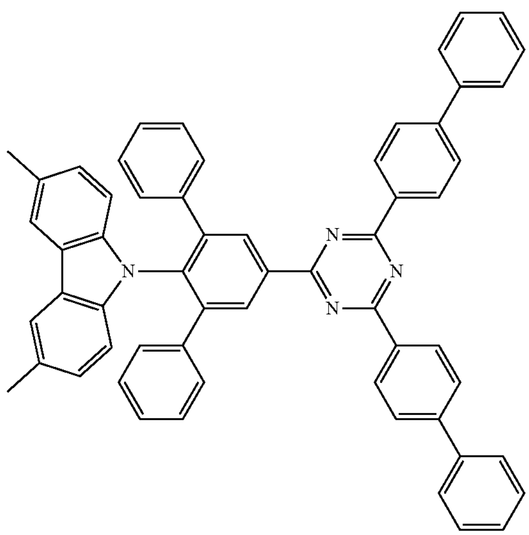
228
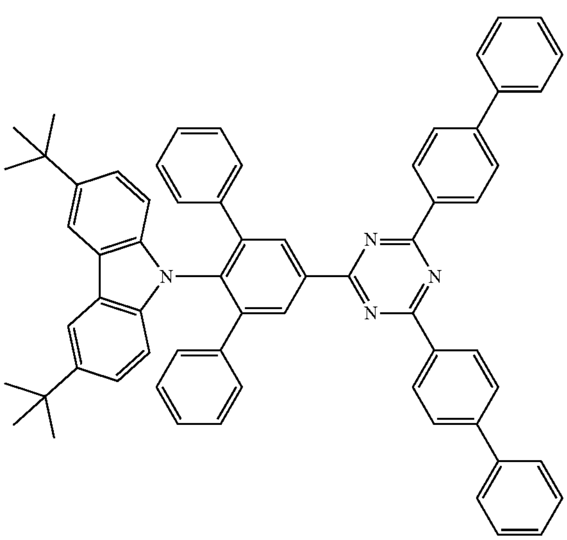
229
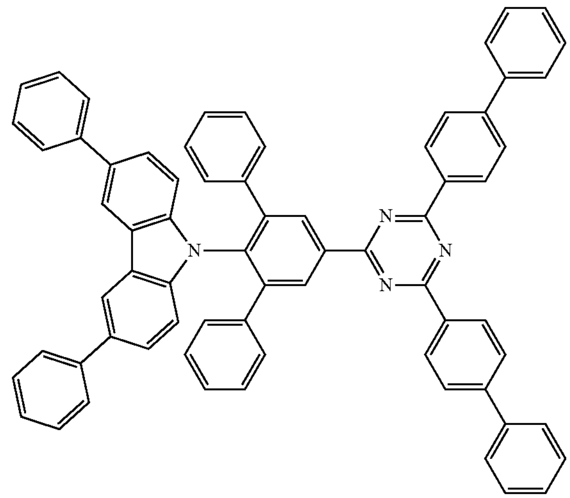
230
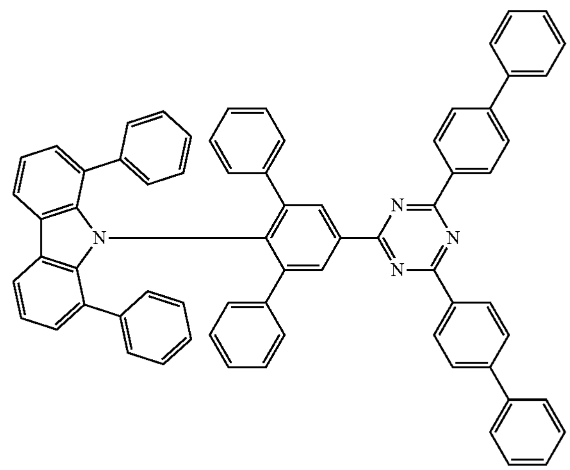
231
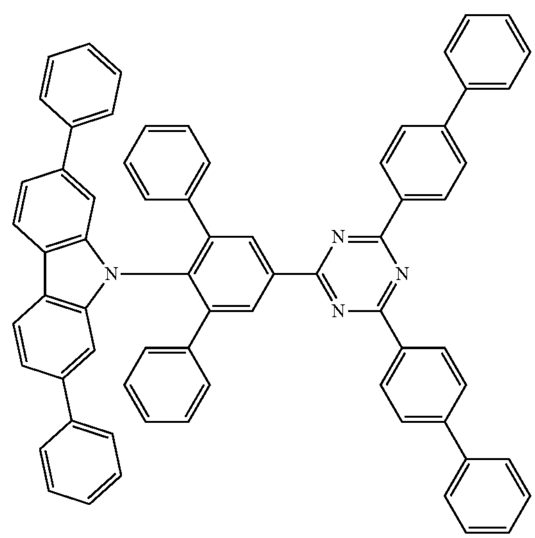

-continued
232
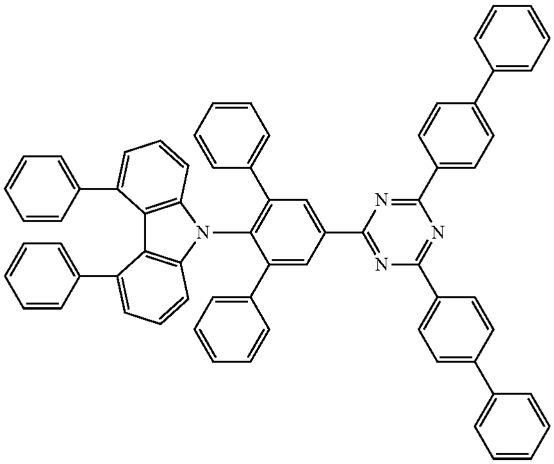
233
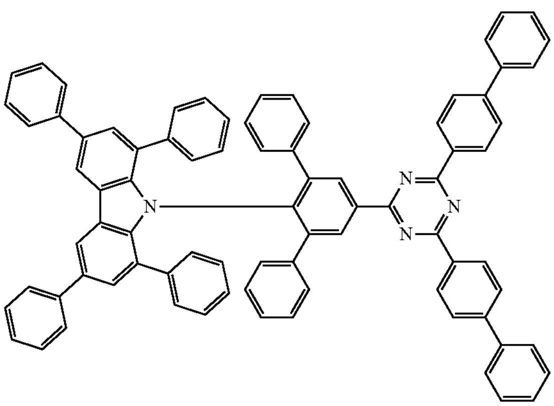
234
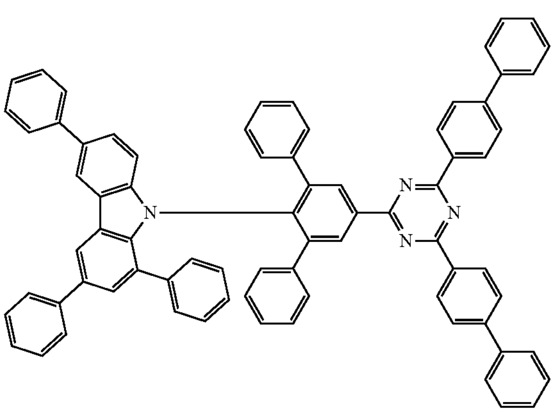
-continued
235
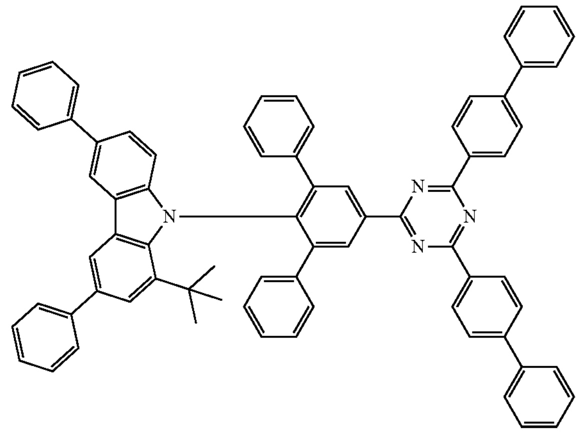
236
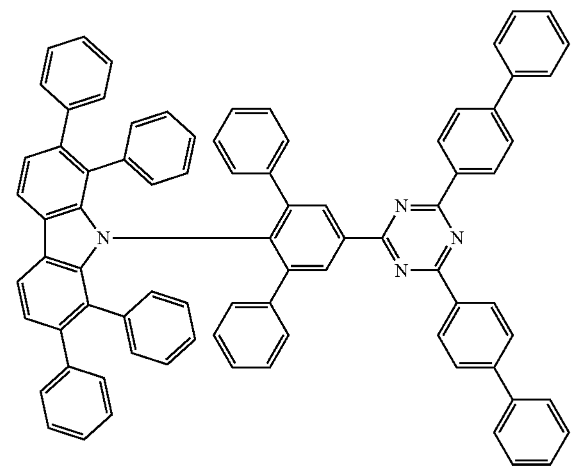
237
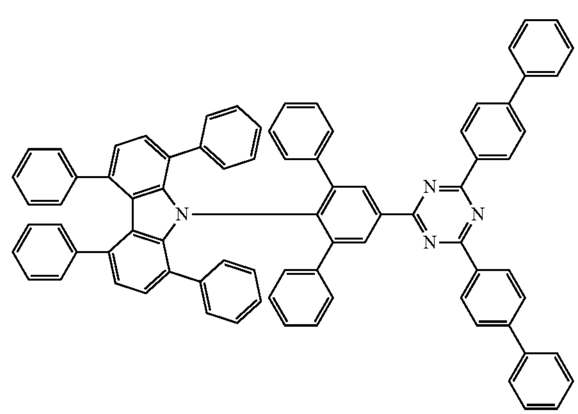

-continued
238
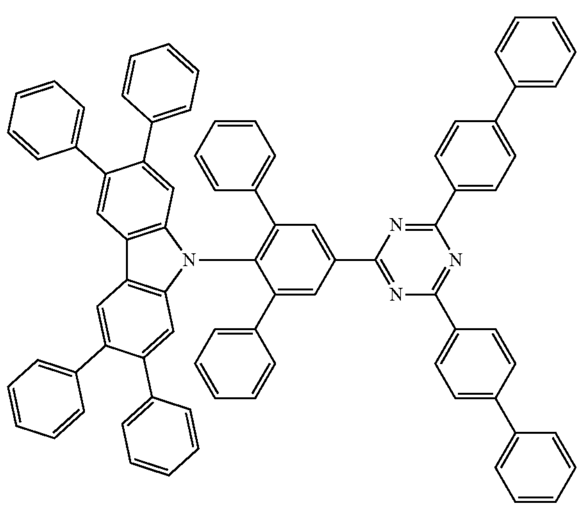
239
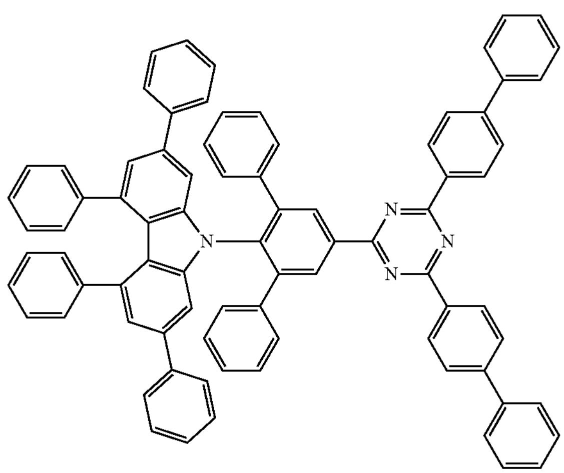
240
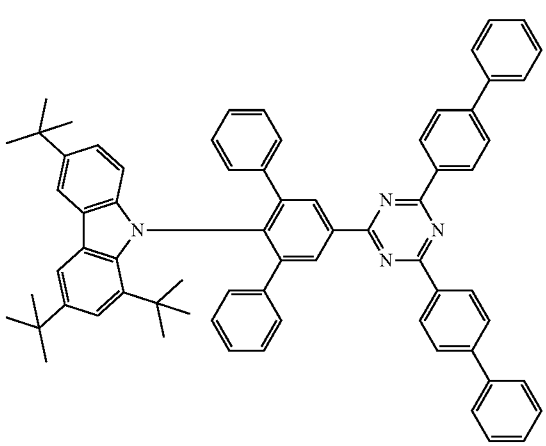
-continued
241
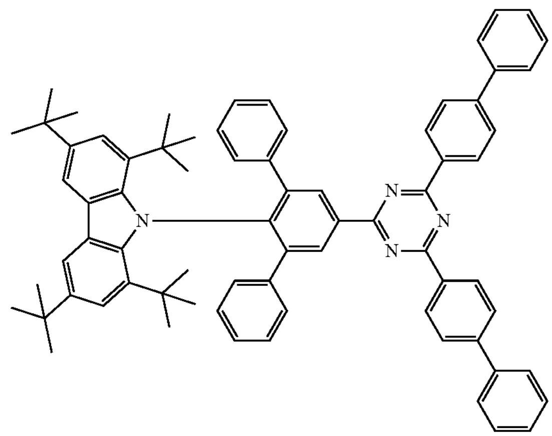
242
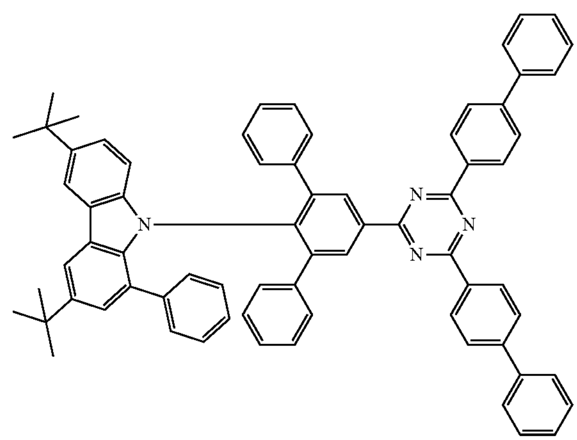
243
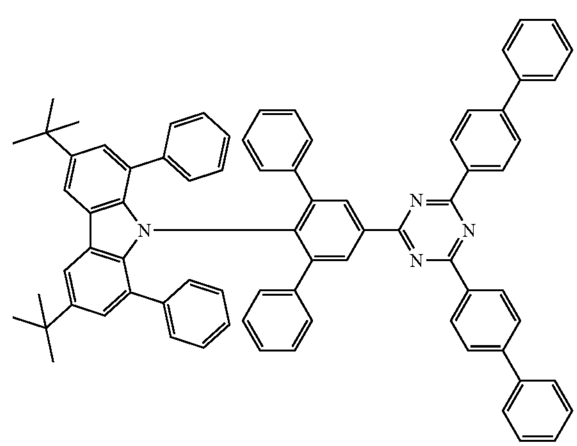

-continued
244
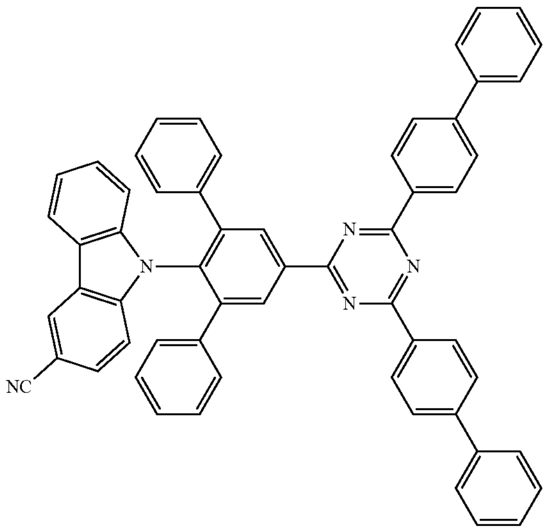
245
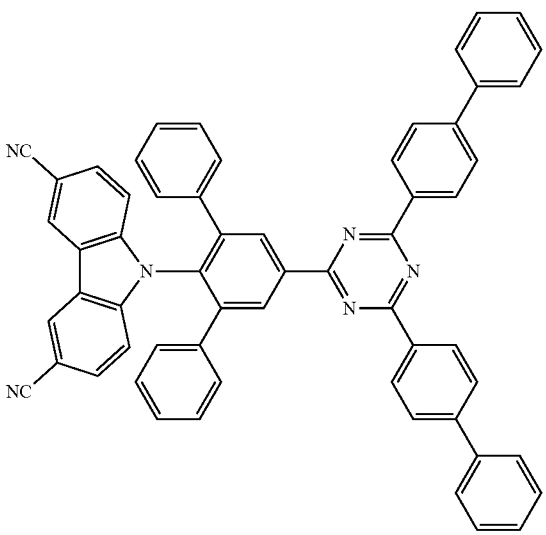
246
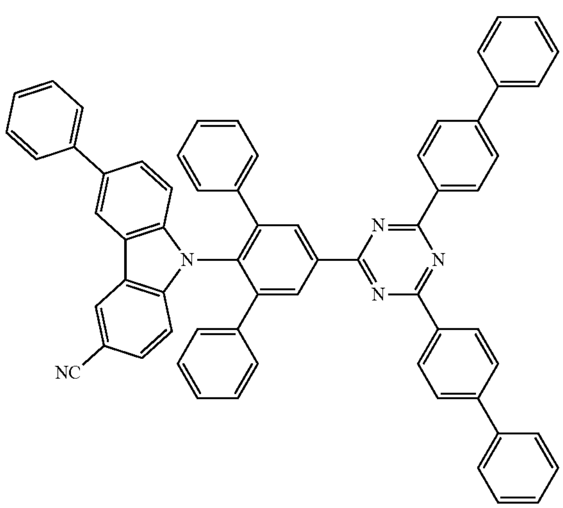
-continued
247
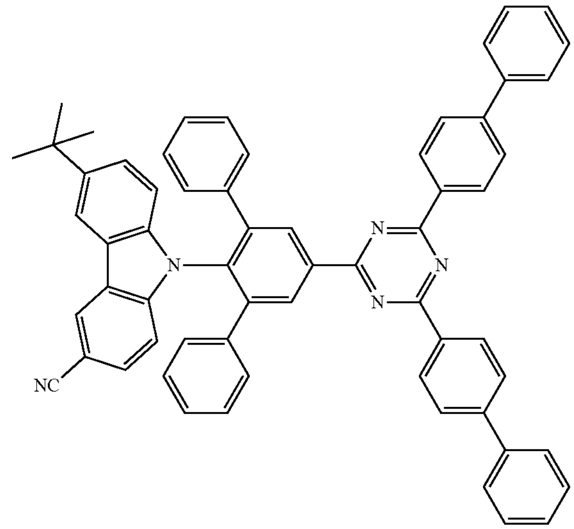
248
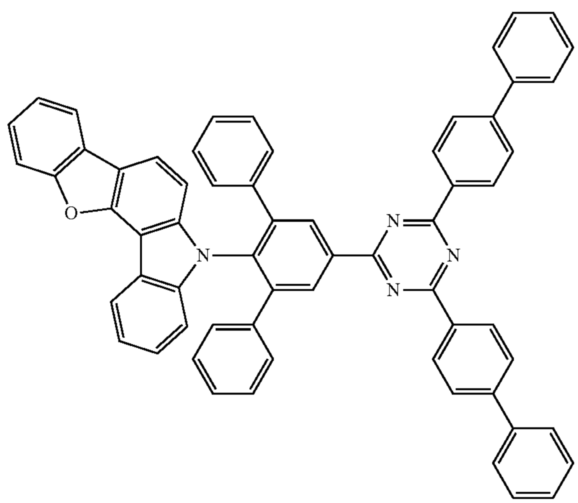
249
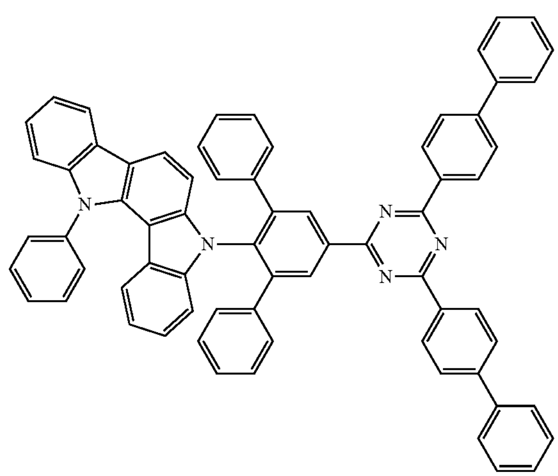

-continued
250
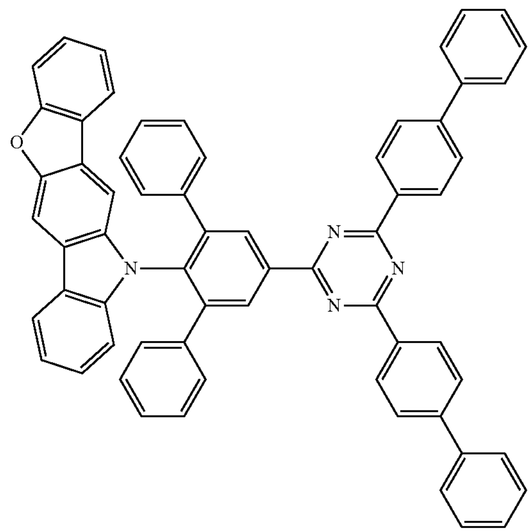
251
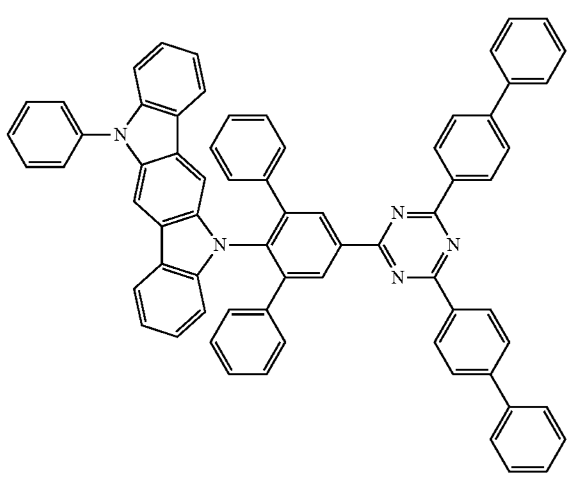
252
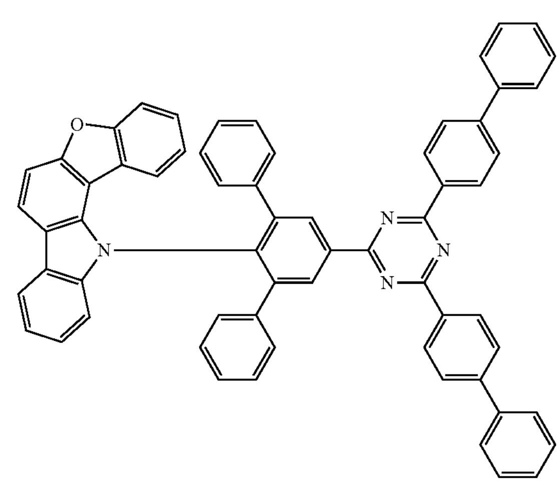
-continued
253
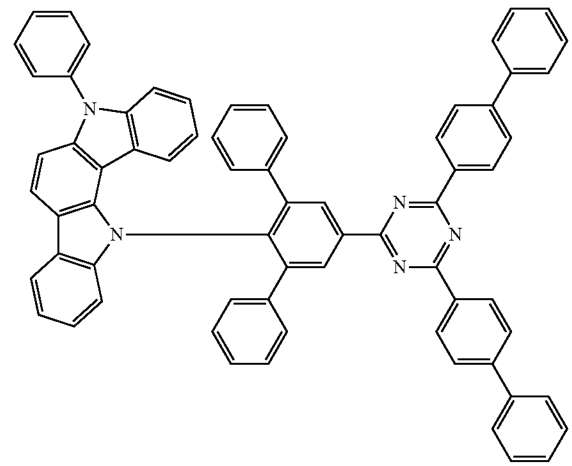
254
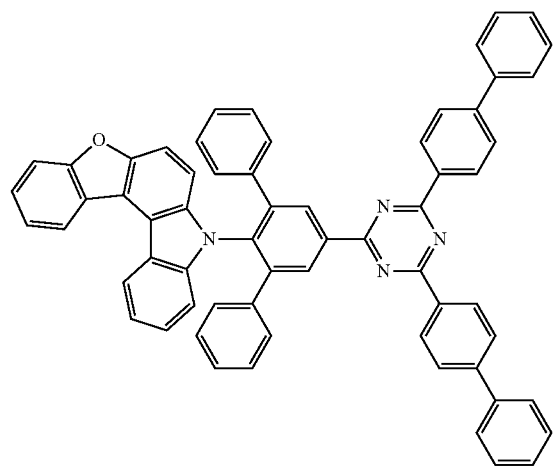
255
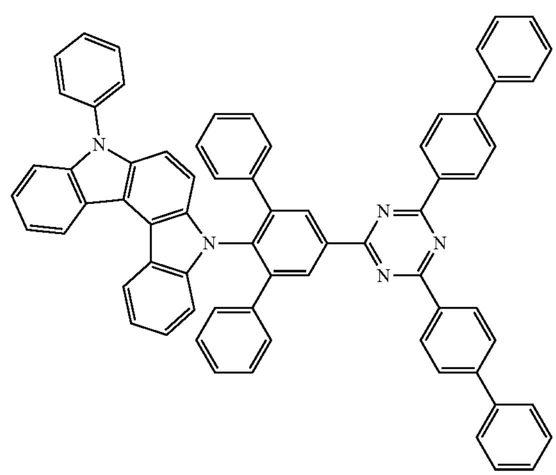

-continued
256
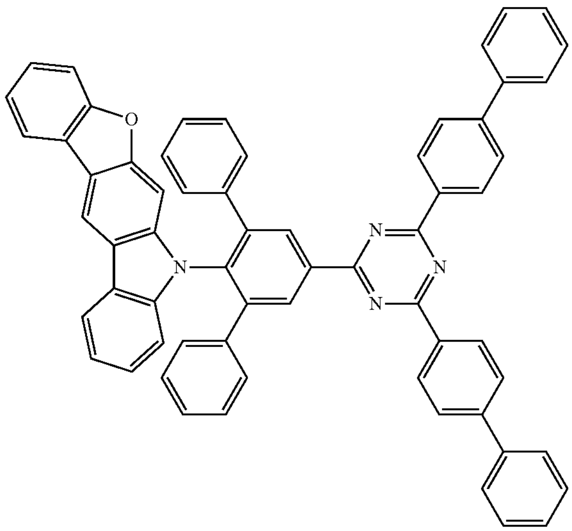
257
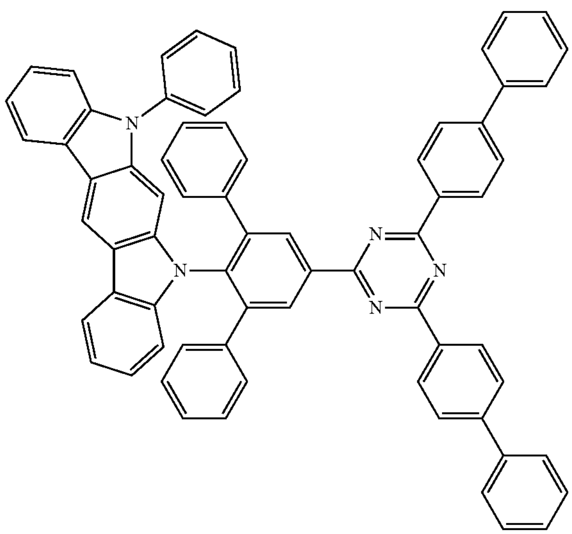
258
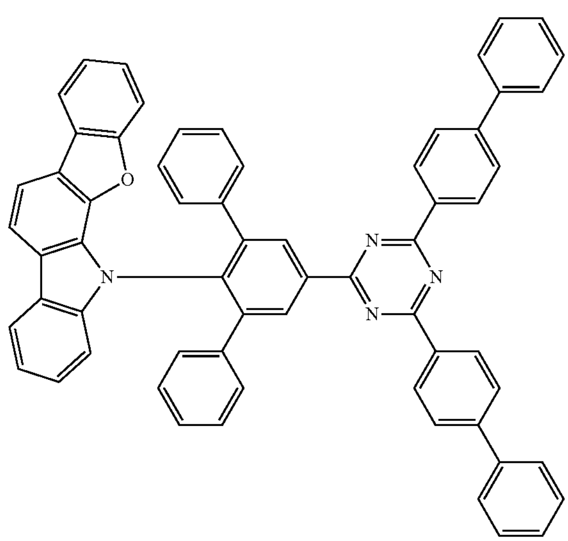
-continued
259
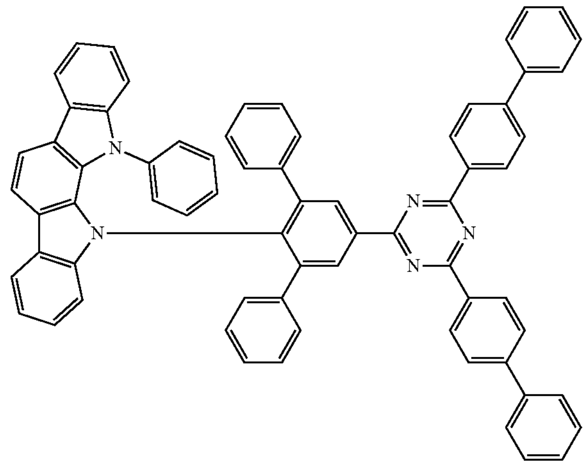
260
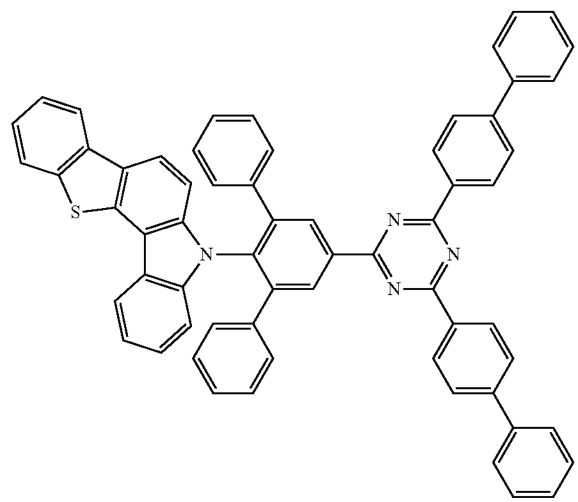
261
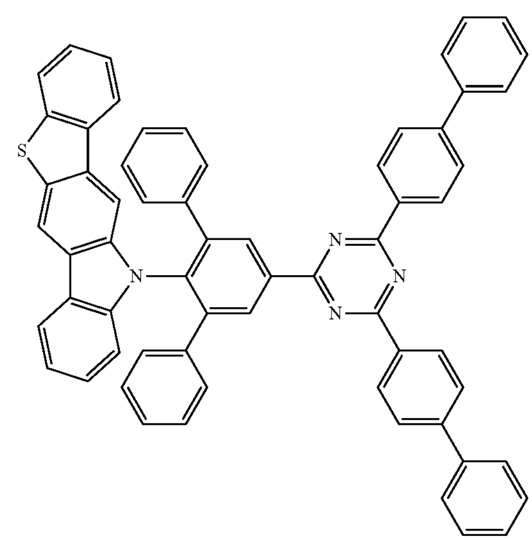

-continued
262
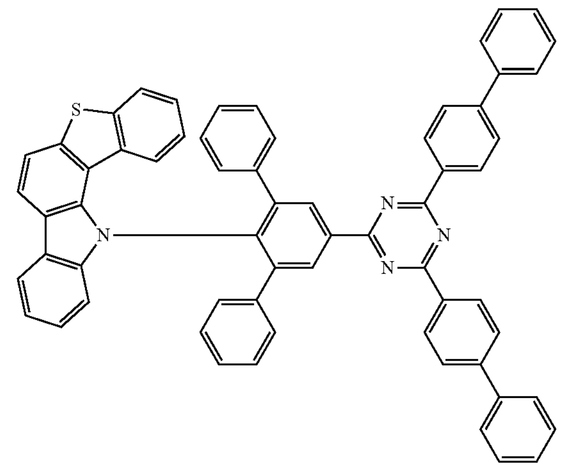
263
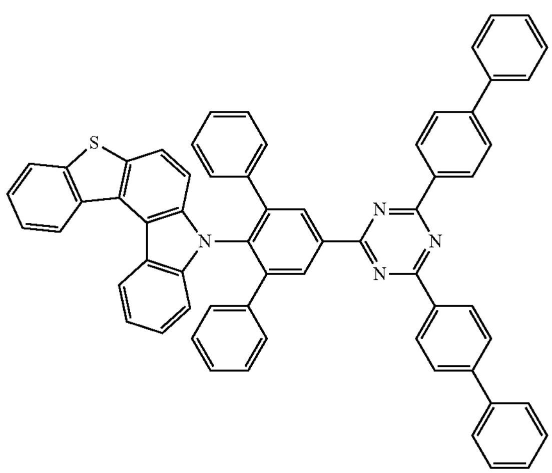
264
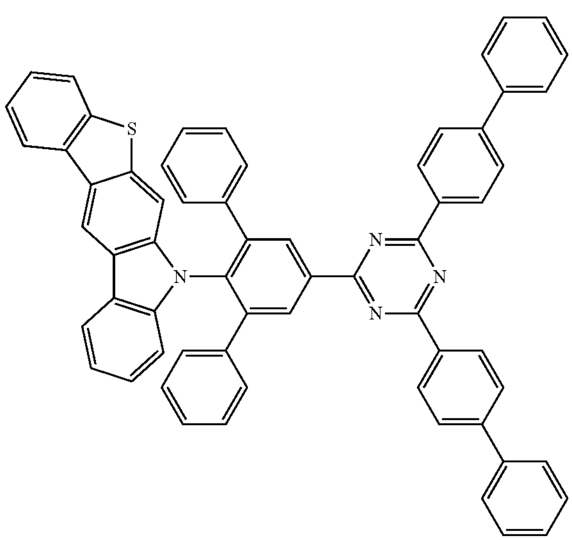
-continued
265
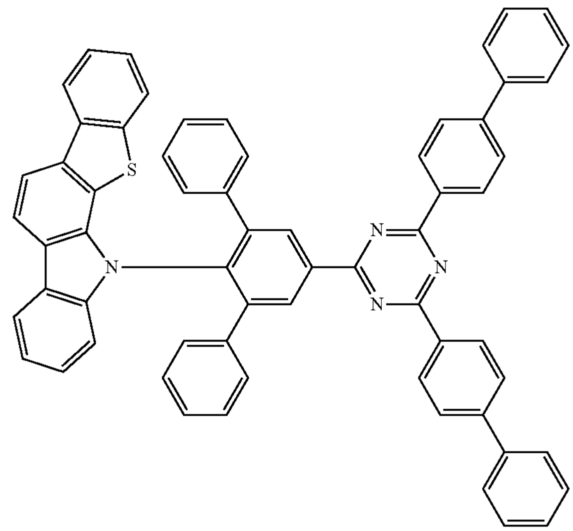
266
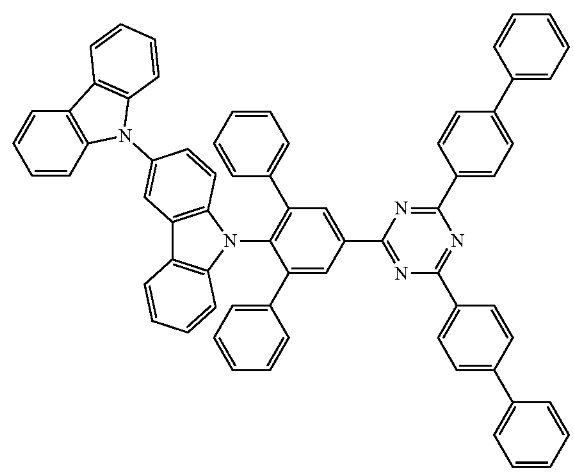
267
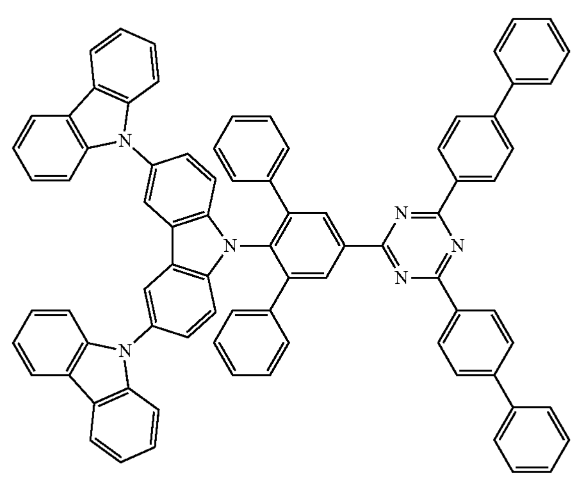

-continued
268
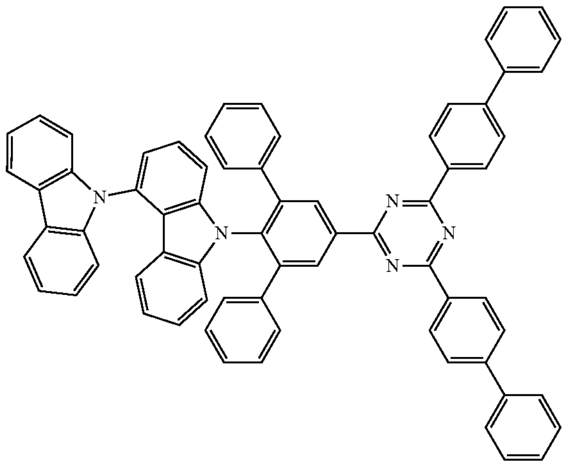
269
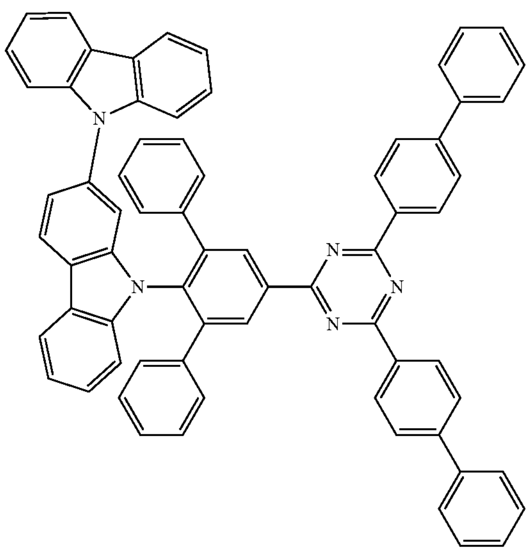
270
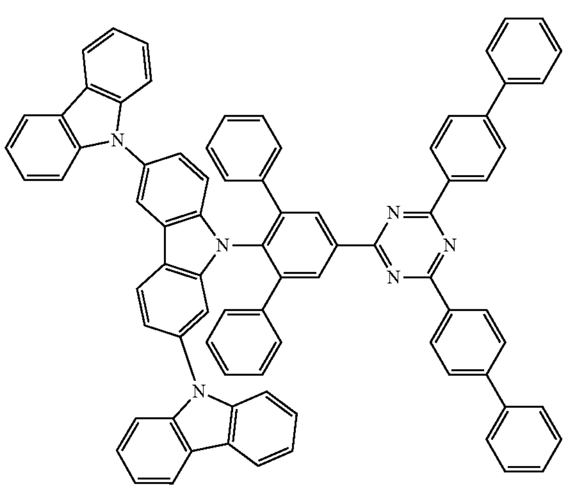
-continued
271
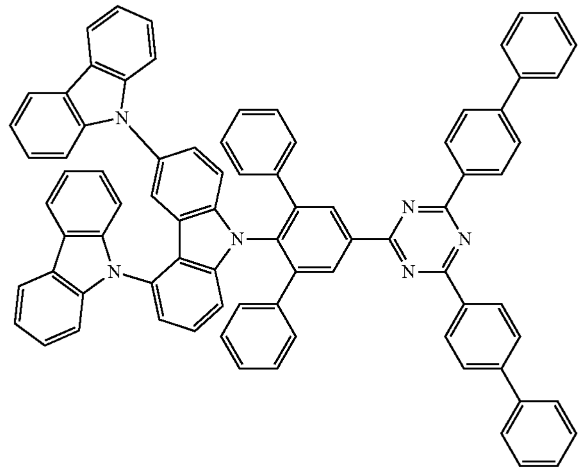
272
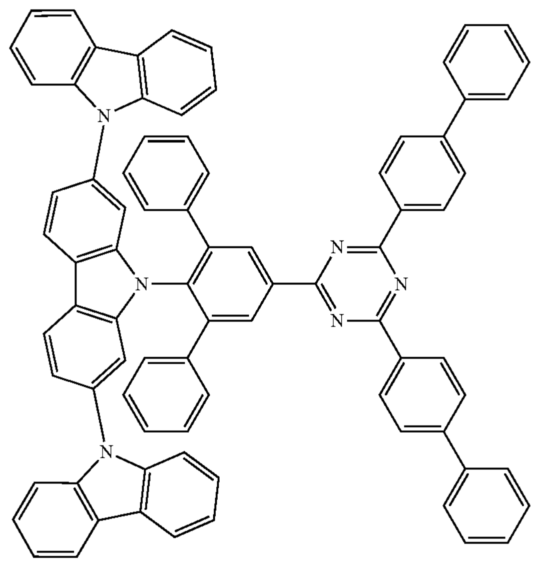
273
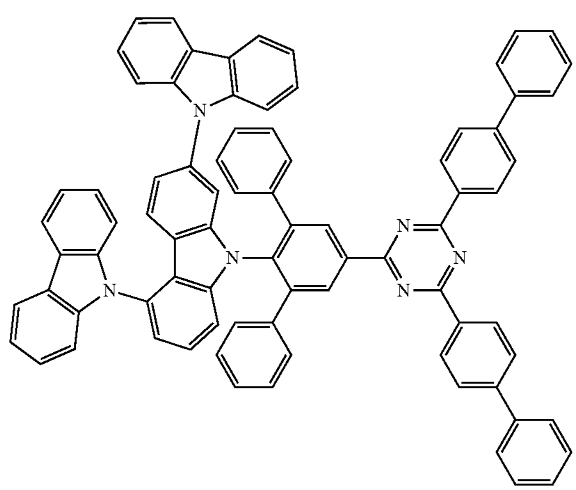

-continued
274
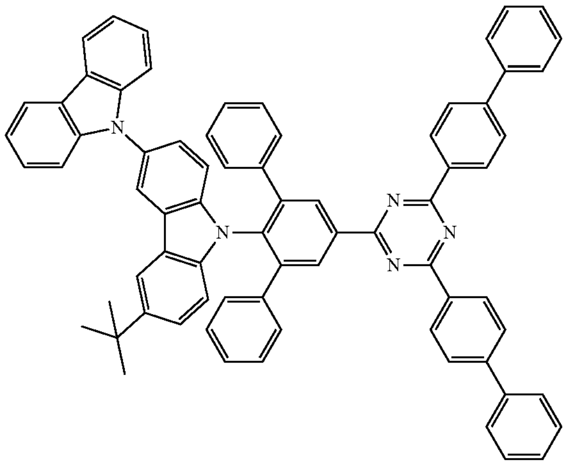
275
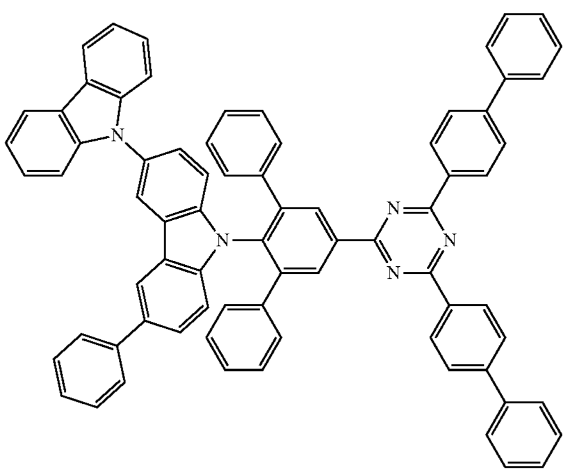
276
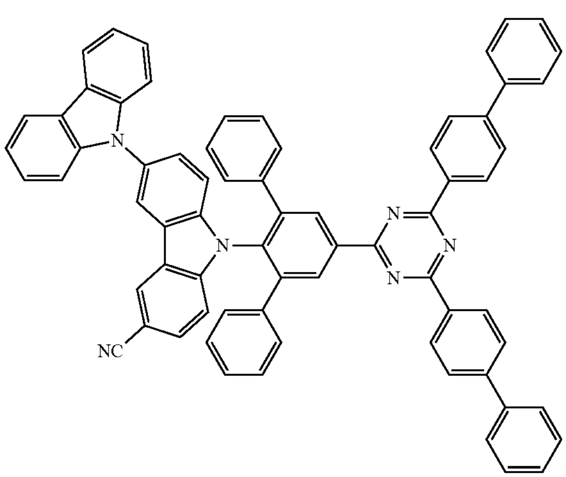
-continued
277
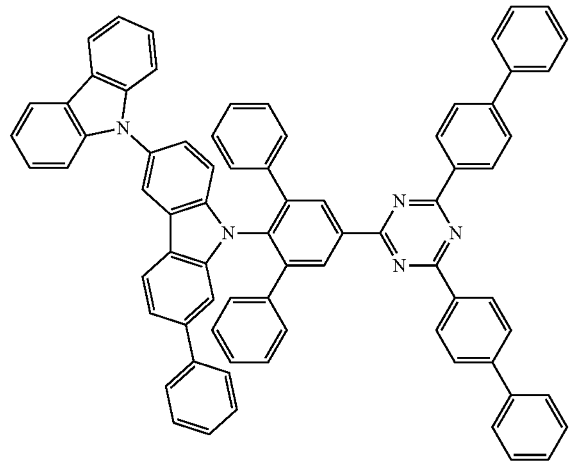
278
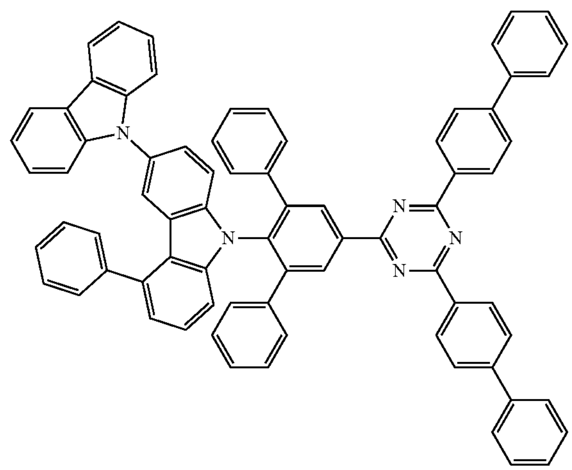
279
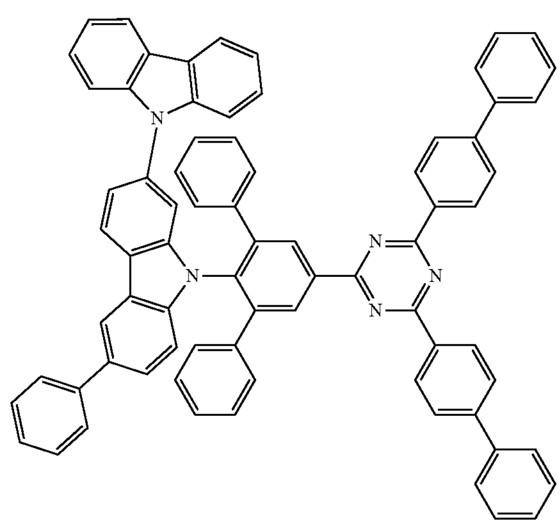

-continued
280
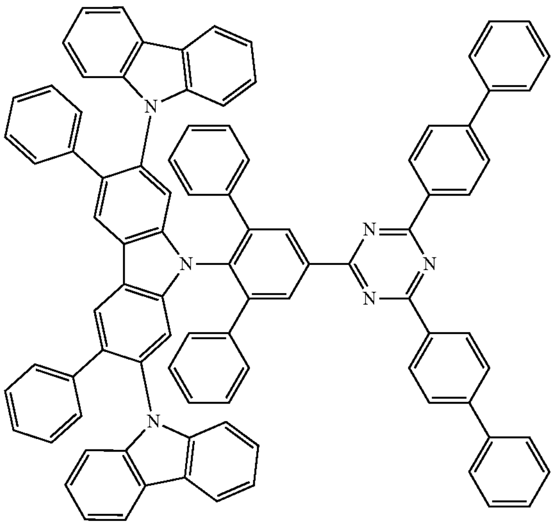
281
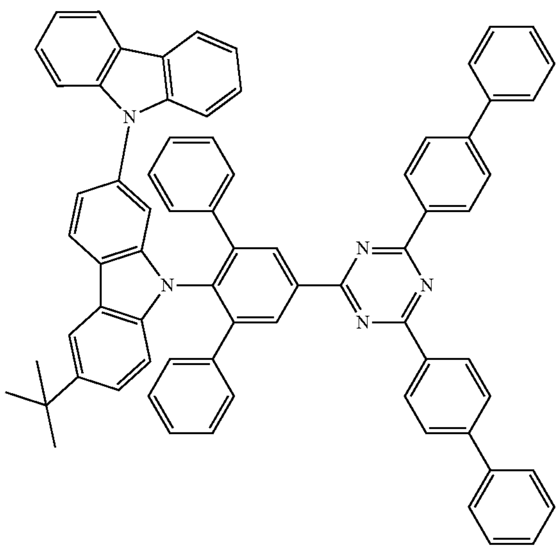
282
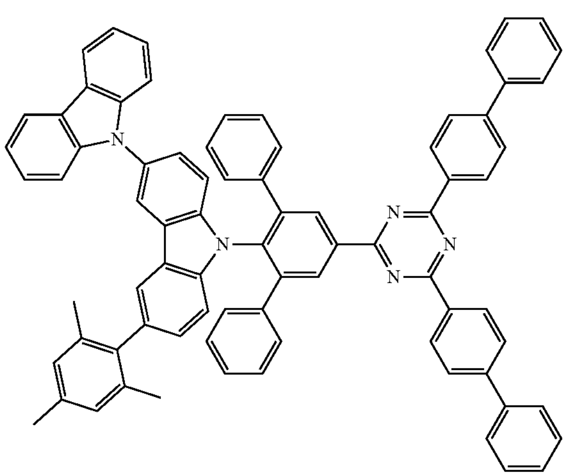
-continued
283
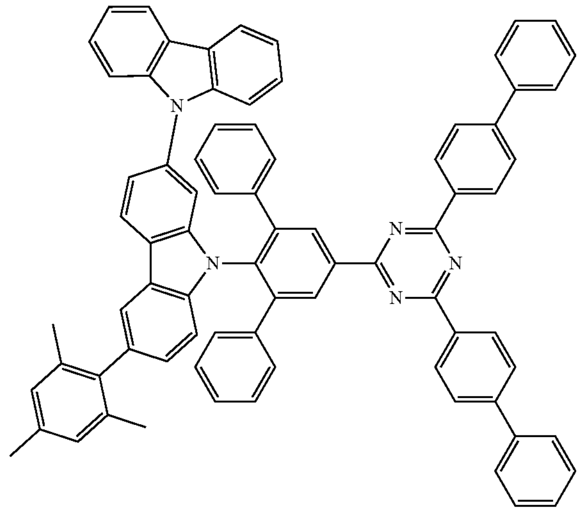
284
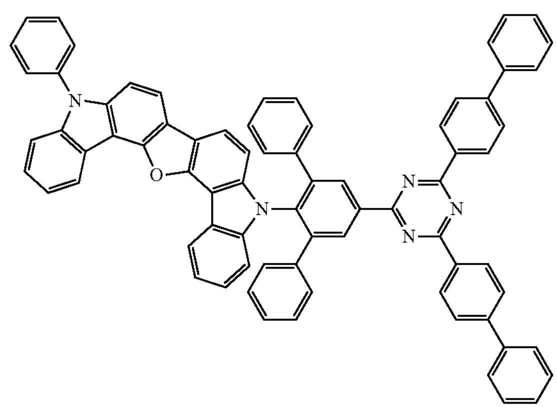
285
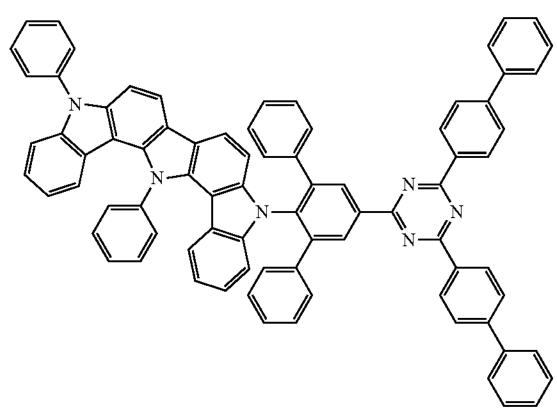

-continued
286
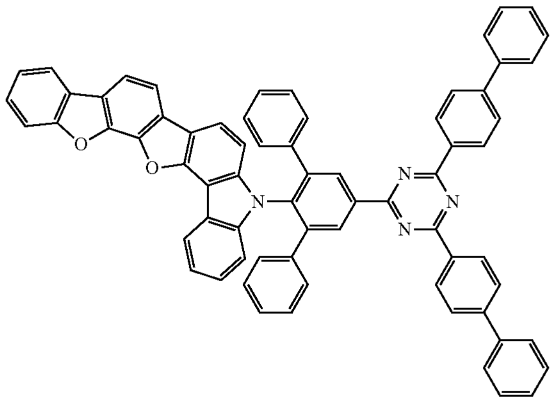
287
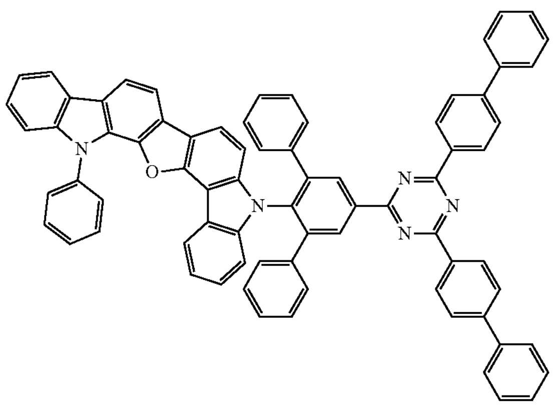
288
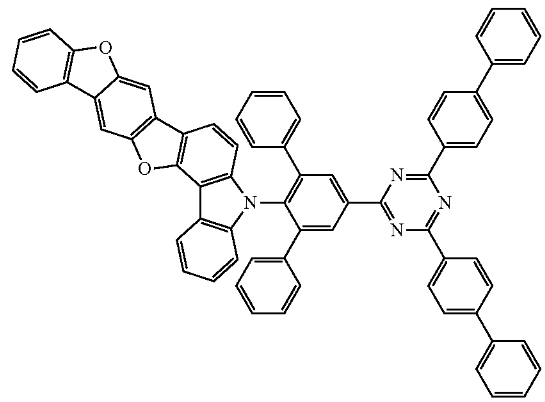
289
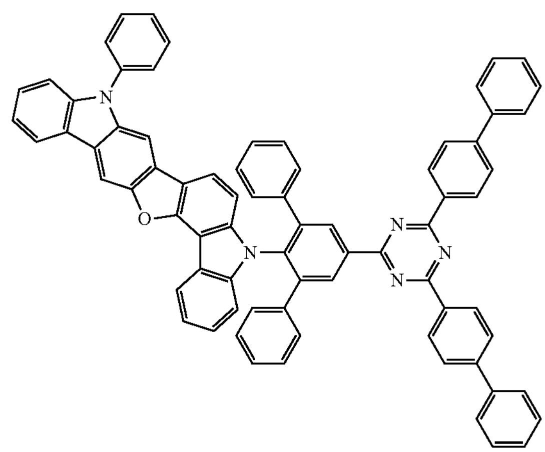
290
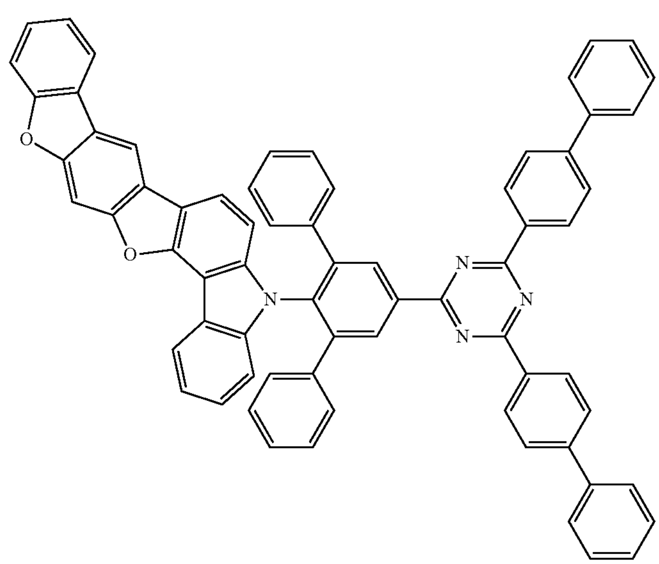

-continued
291
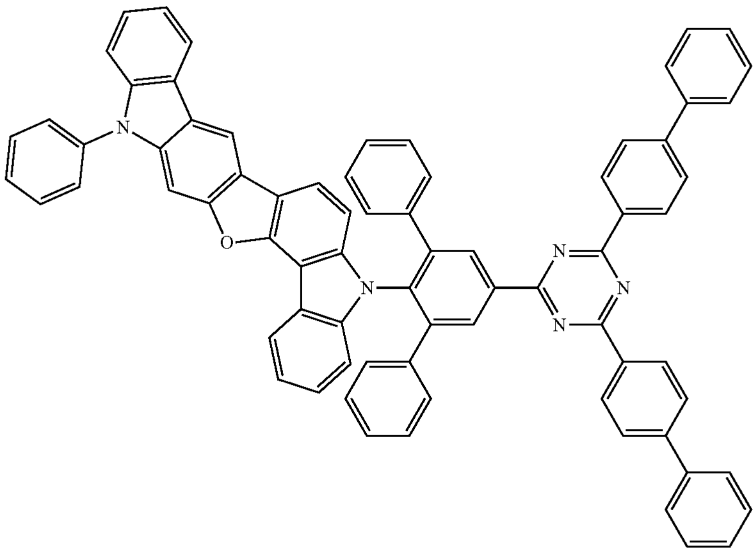
292
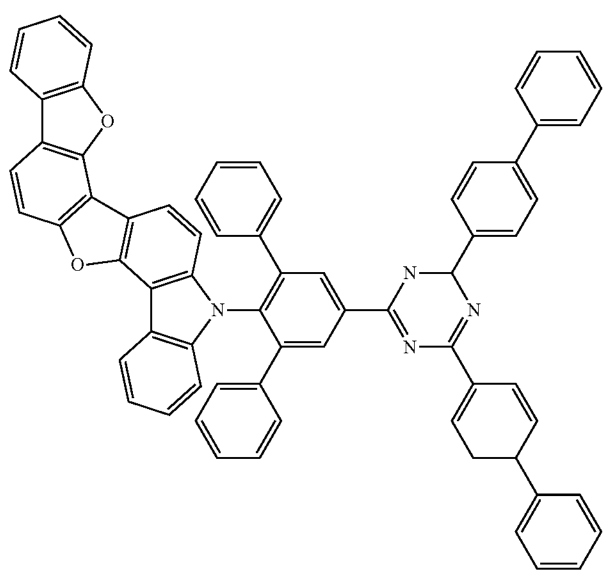

-continued
293
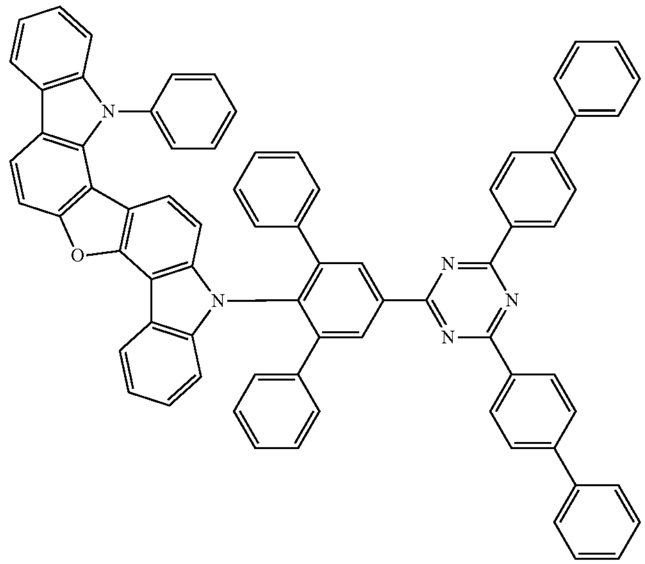
294
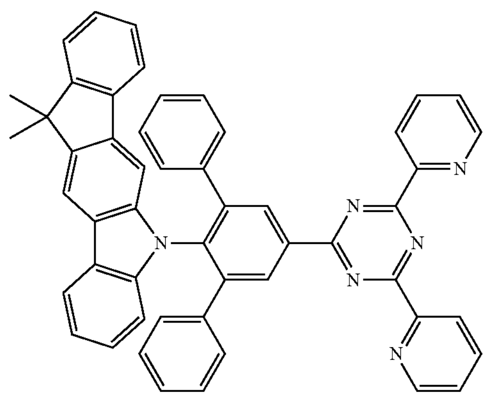
295
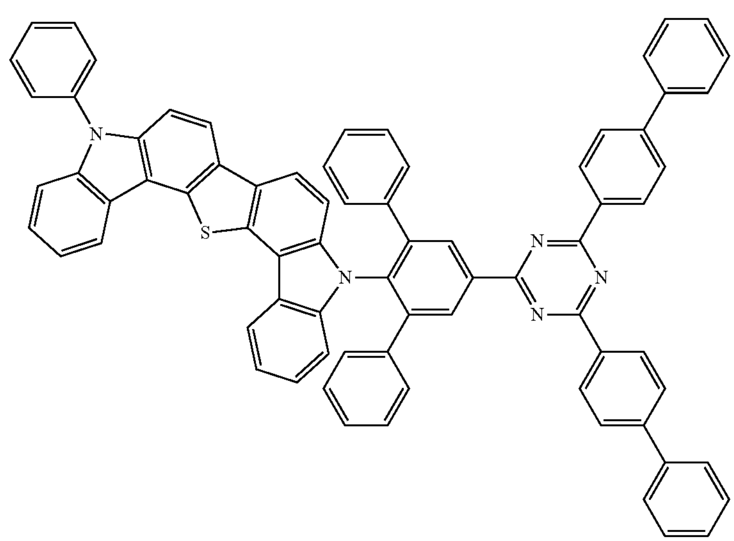

-continued
296
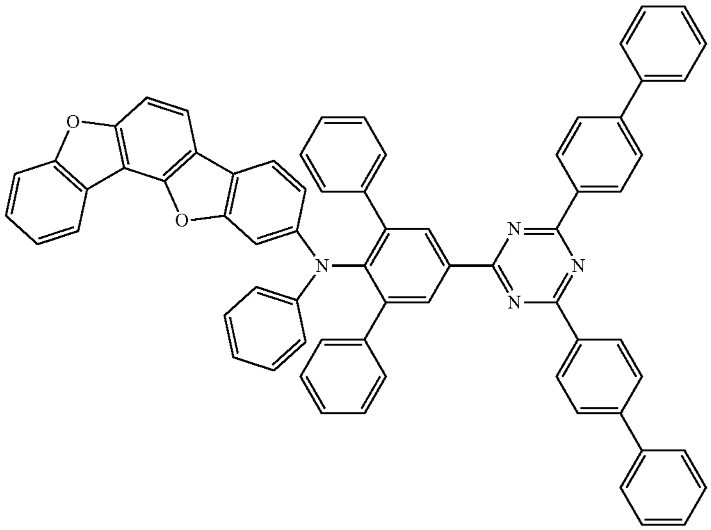
297
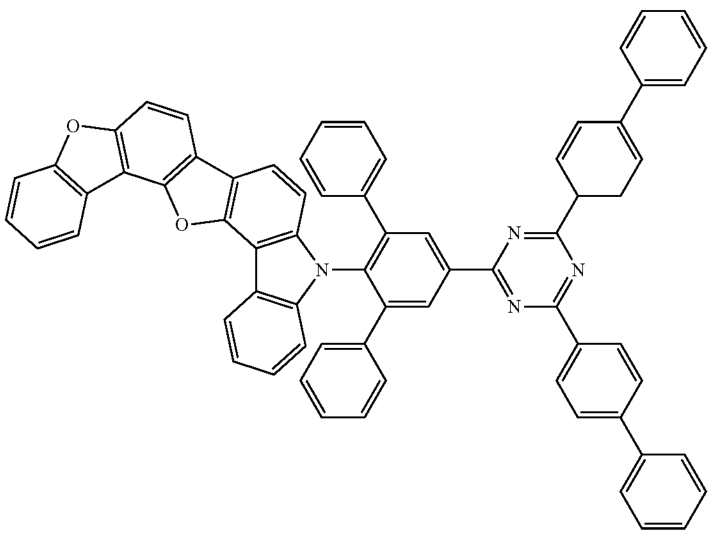
298
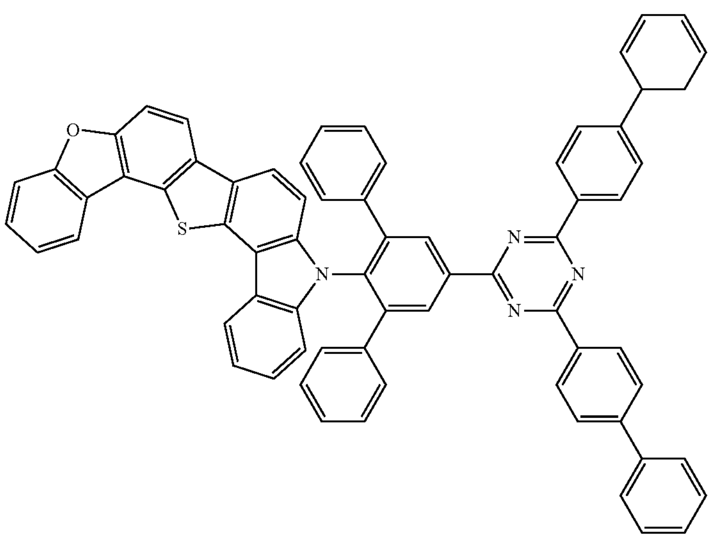

-continued
299
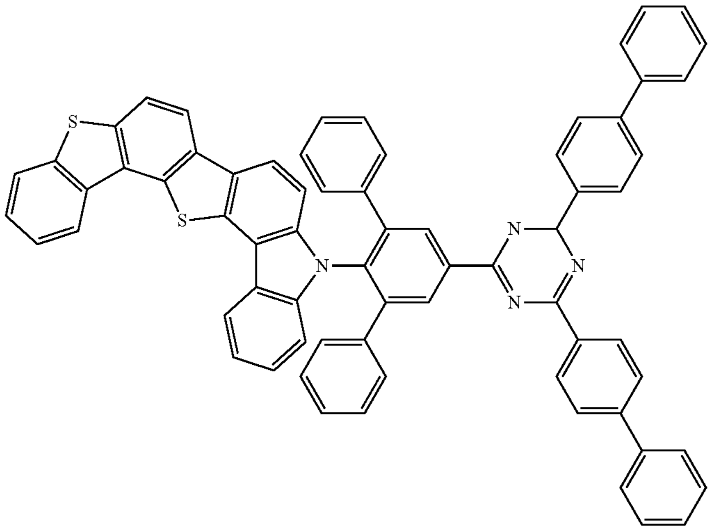
300
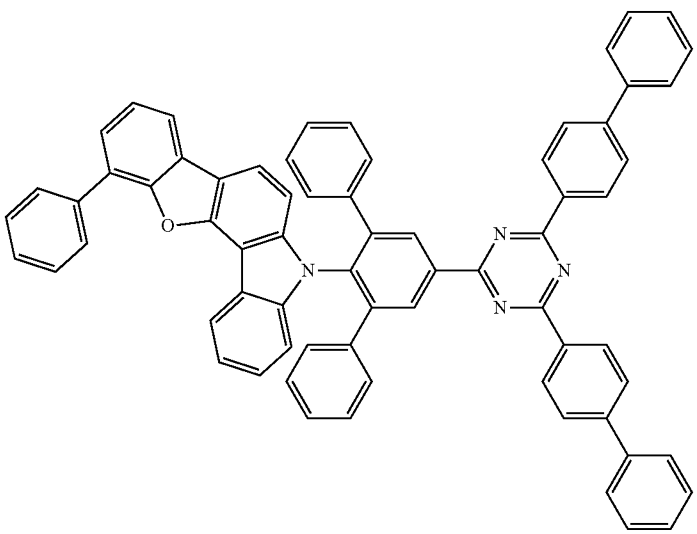
301
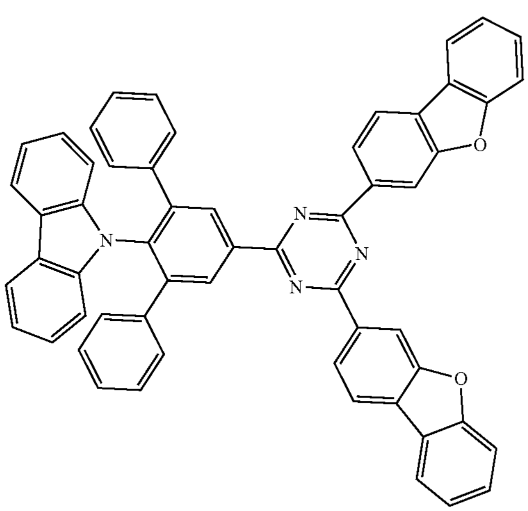

-continued
302
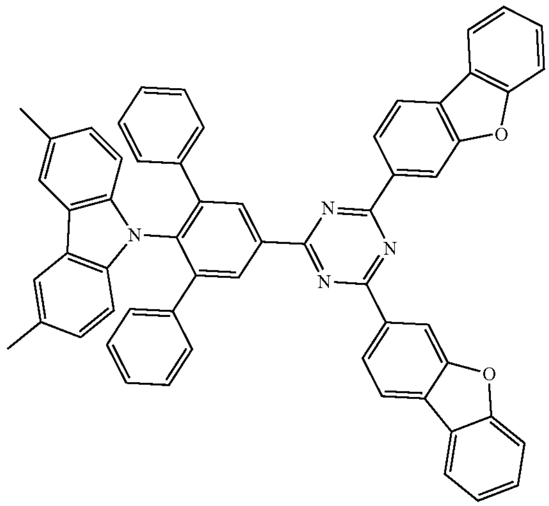
303
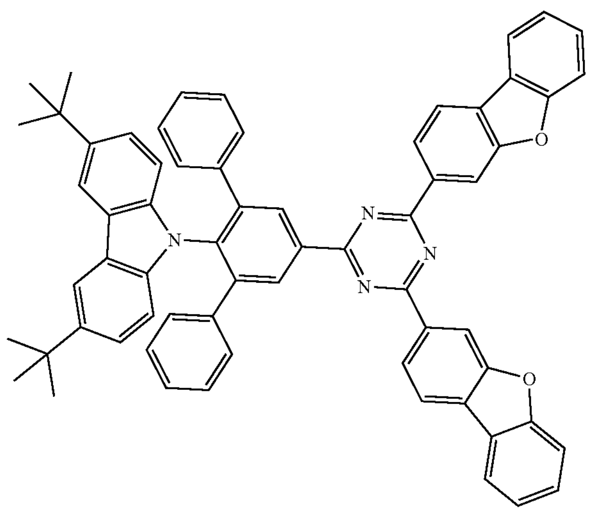
304
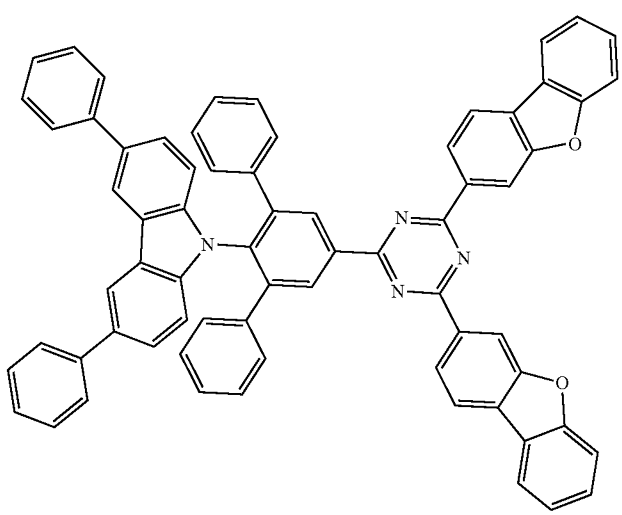

-continued
305
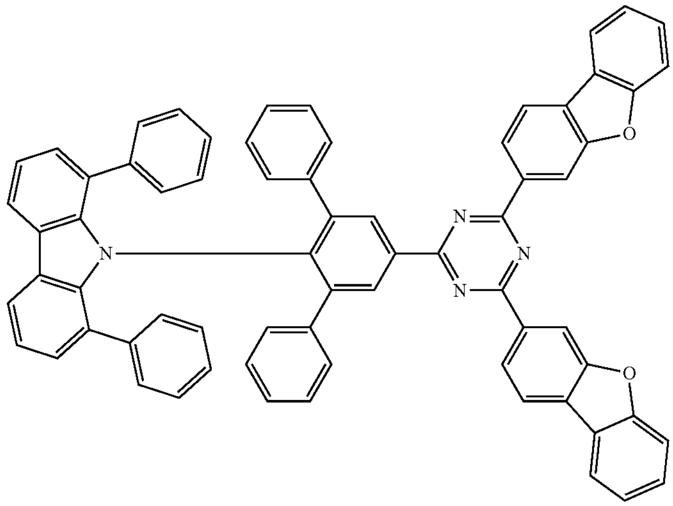
306
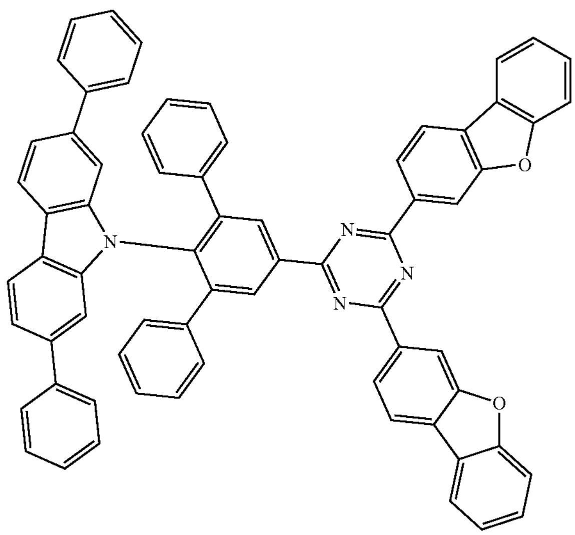
307
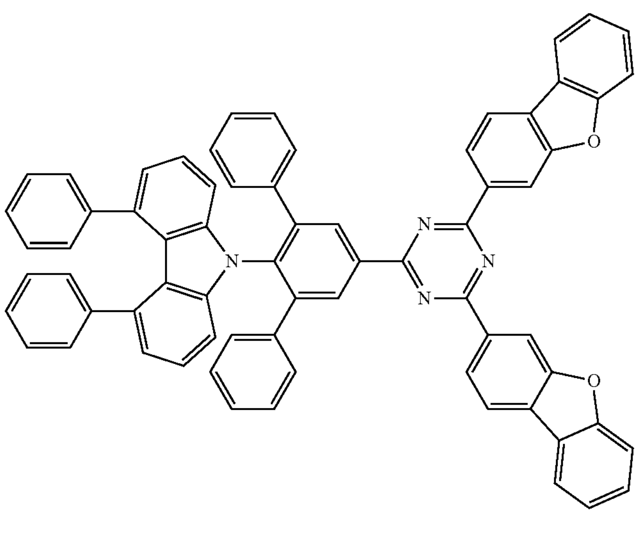

-continued
308
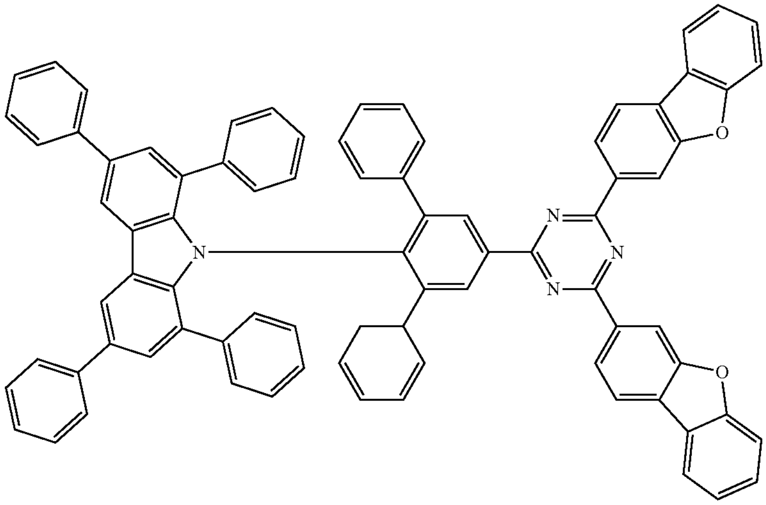
309
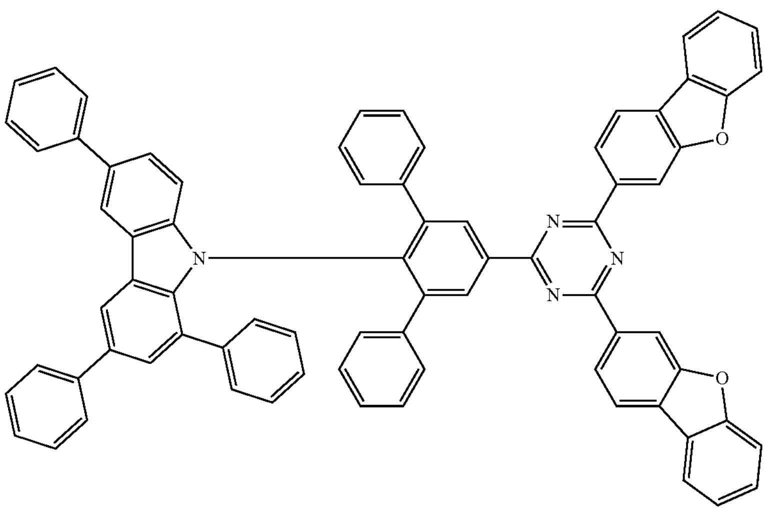
310
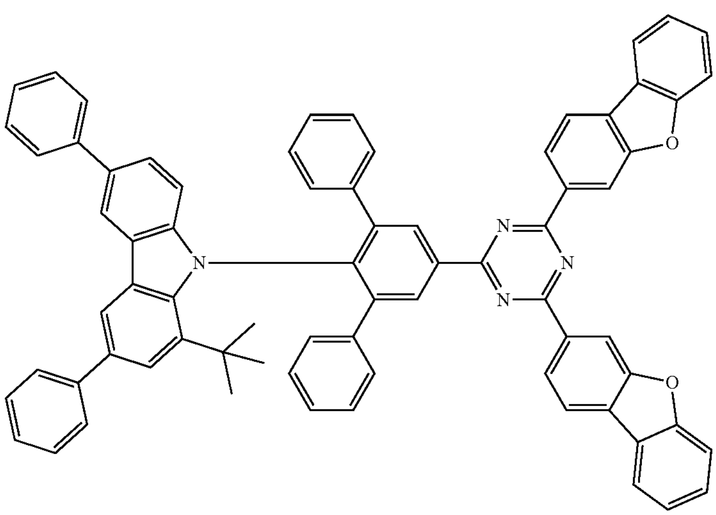

-continued
311
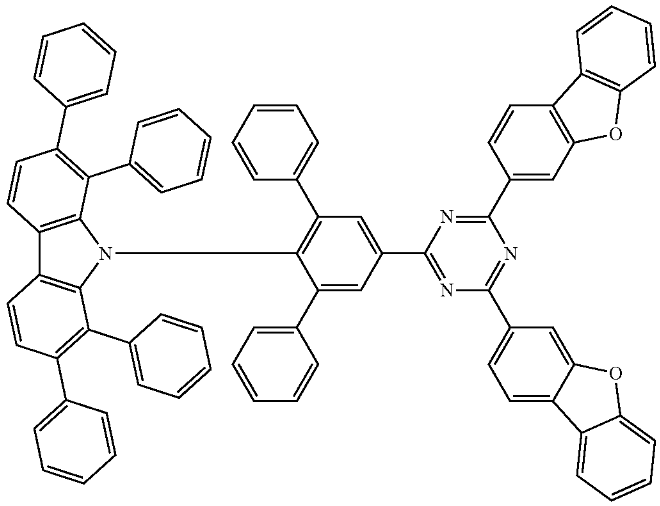
312
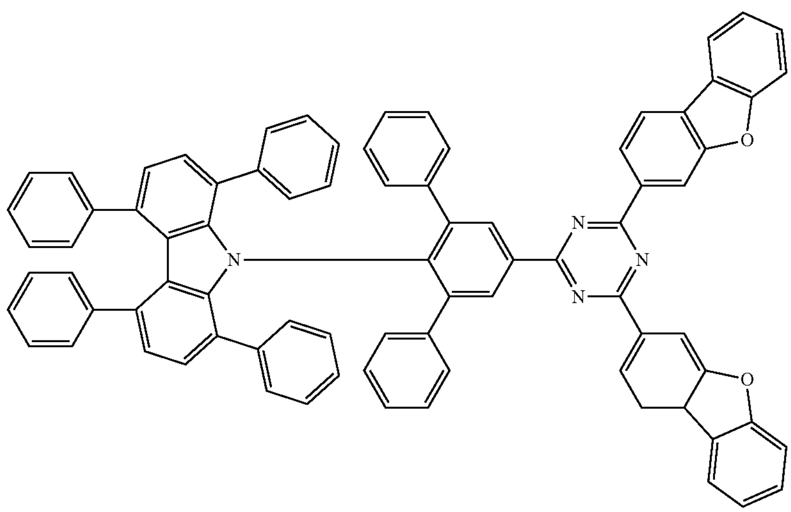
313
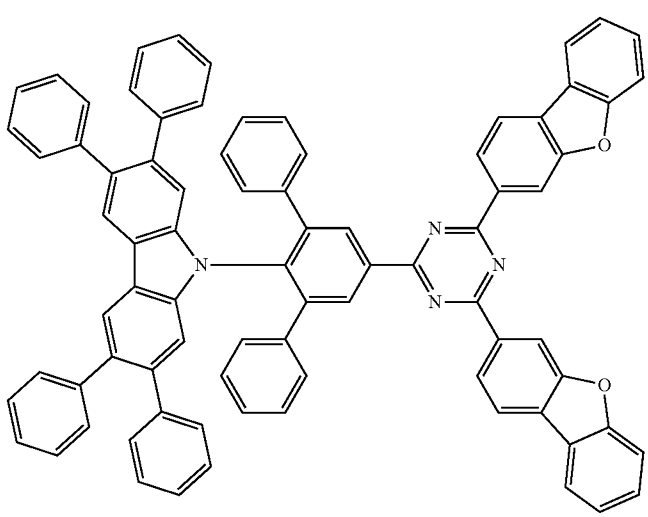

-continued
314
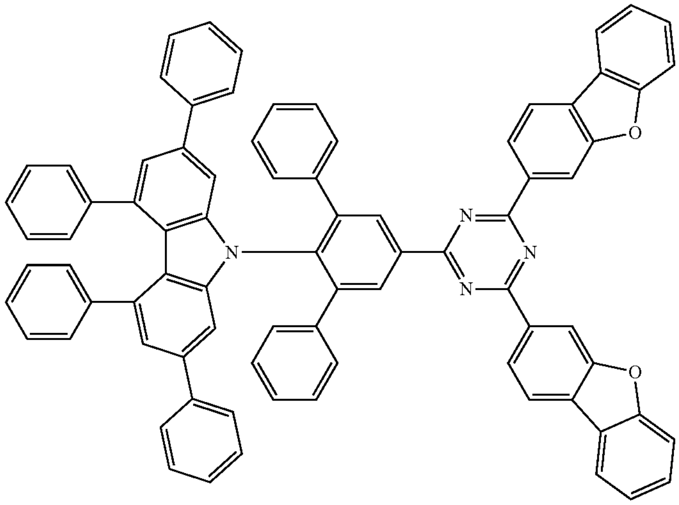
315
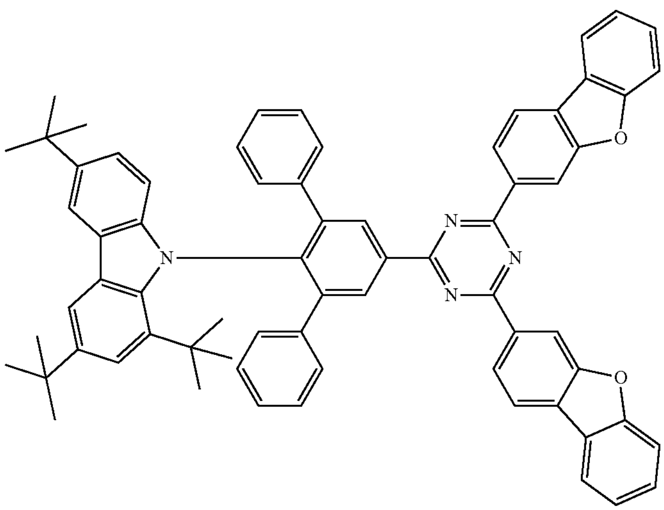
316
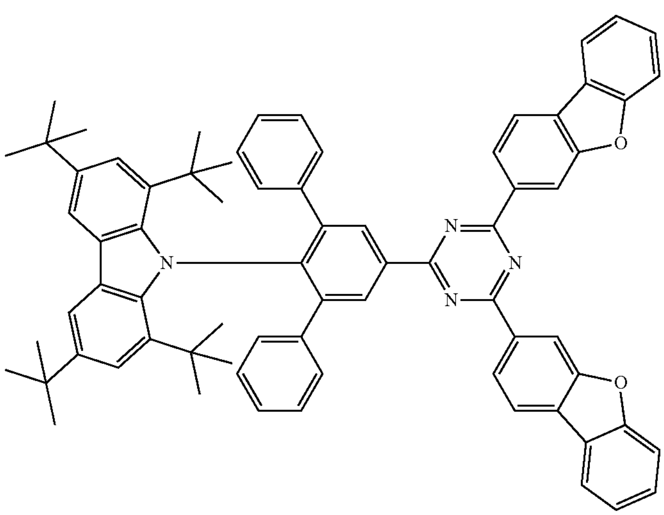

-continued
317
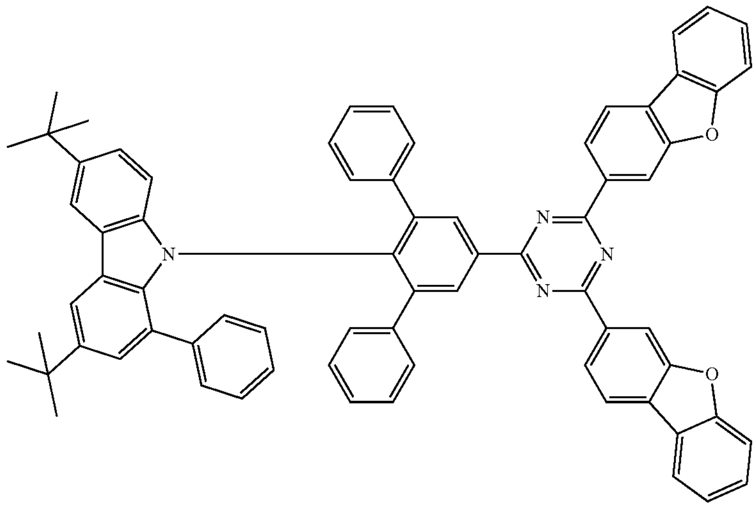
318
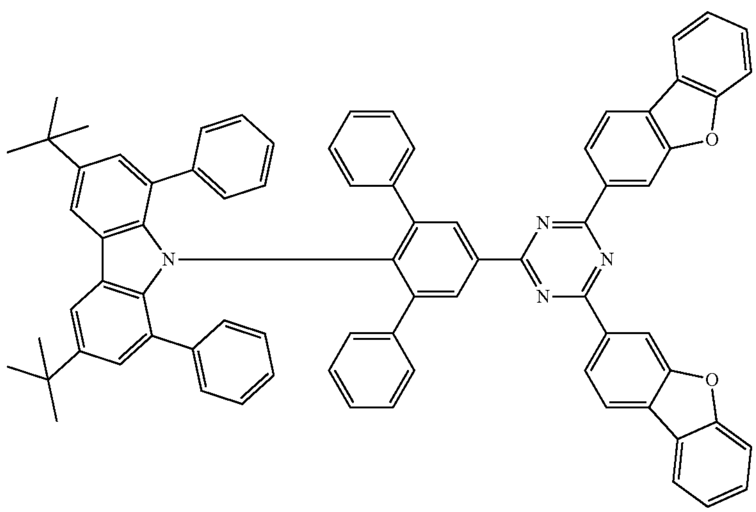
319
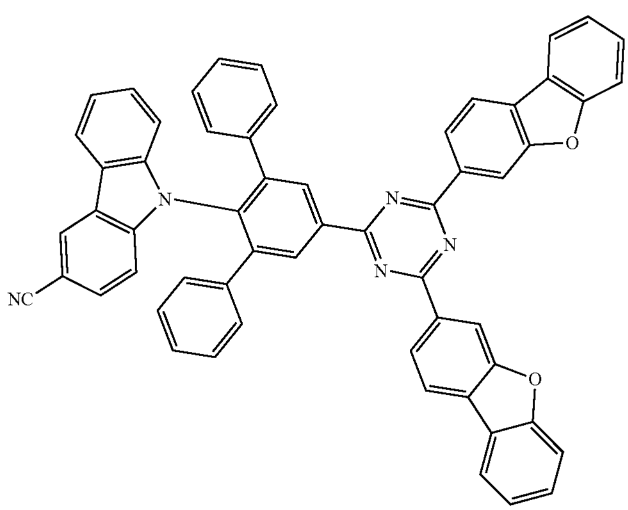

-continued
320
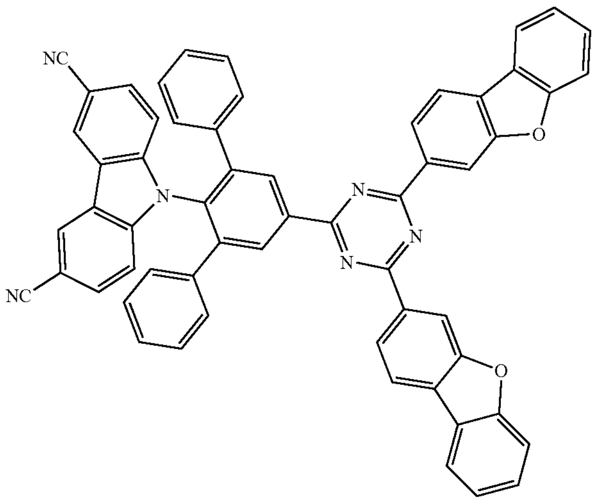
321
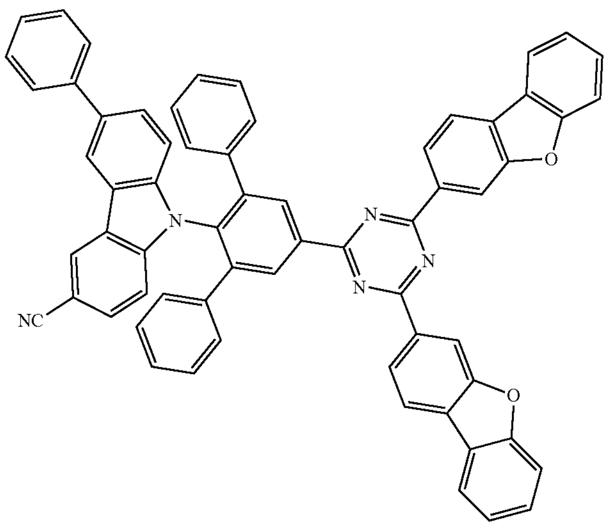
322
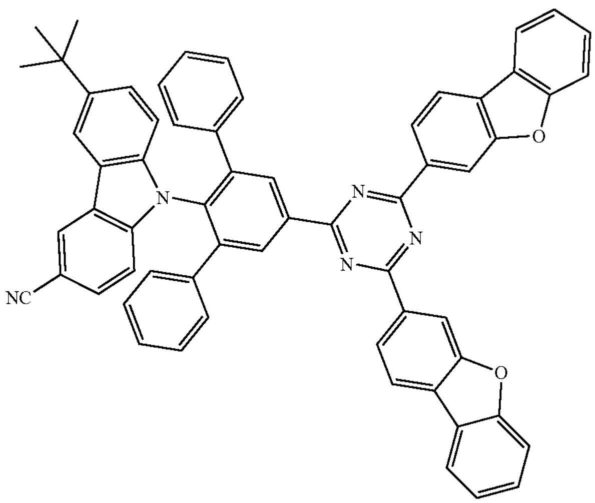

-continued
323
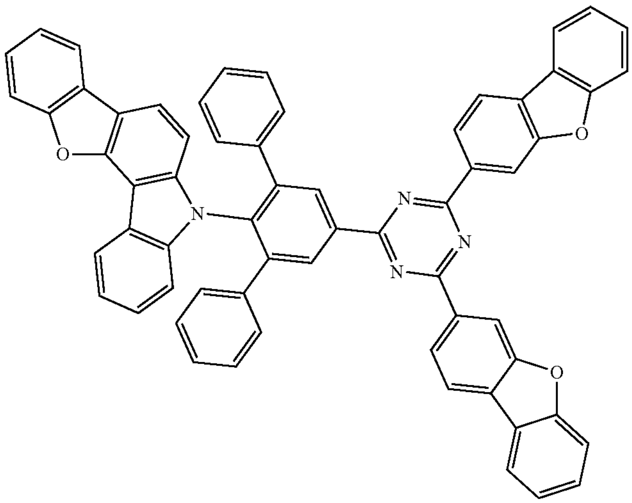
324
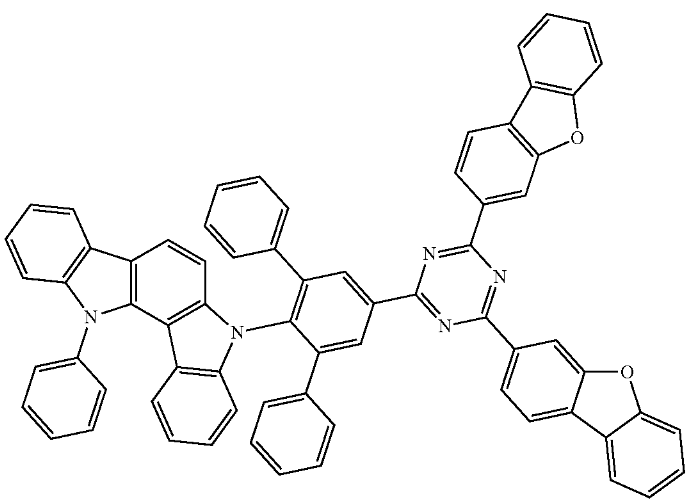
325
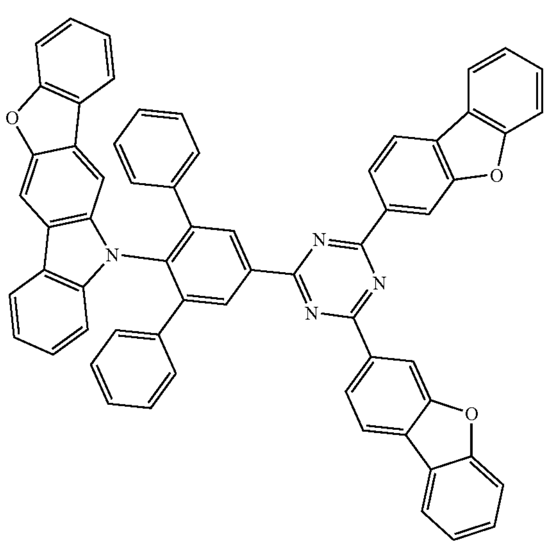

-continued
326
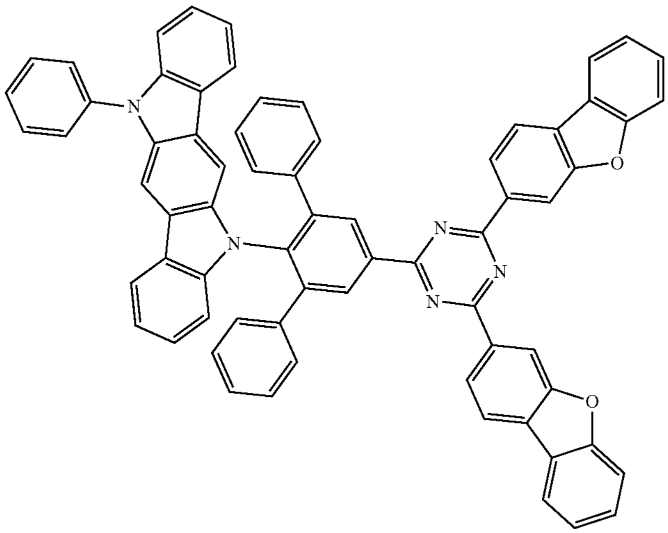
327
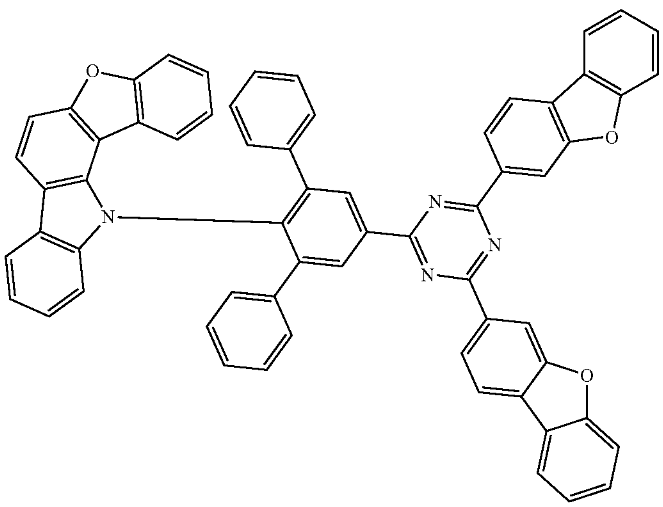
328
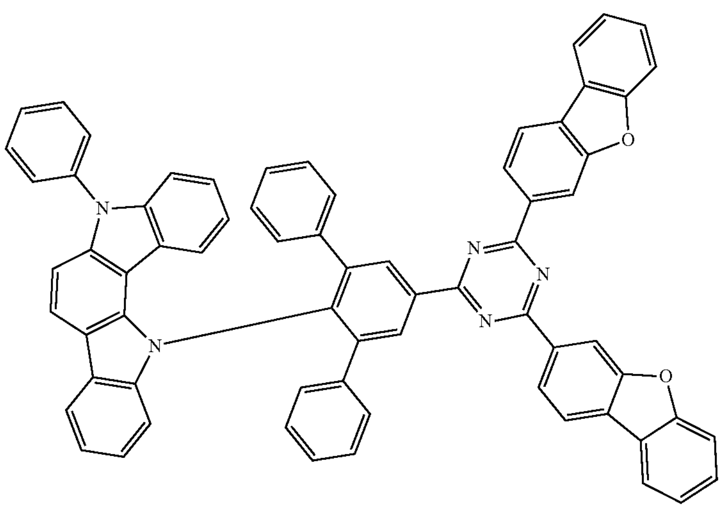

-continued
329
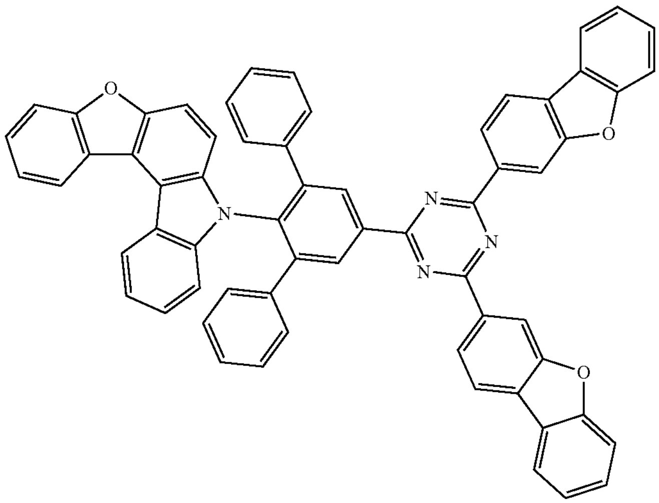
330
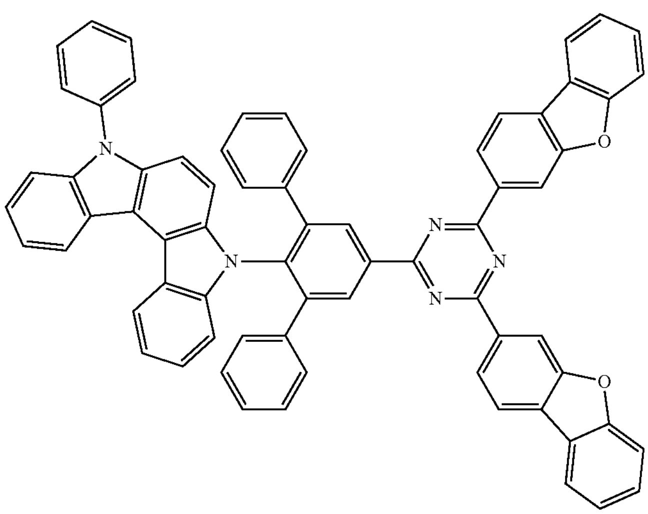
331
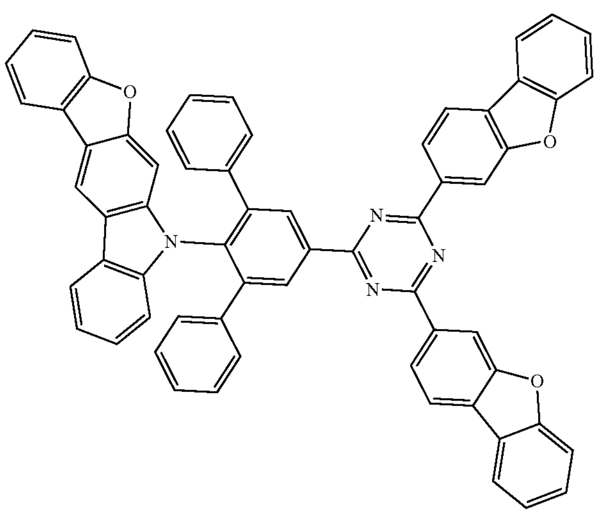

-continued
332
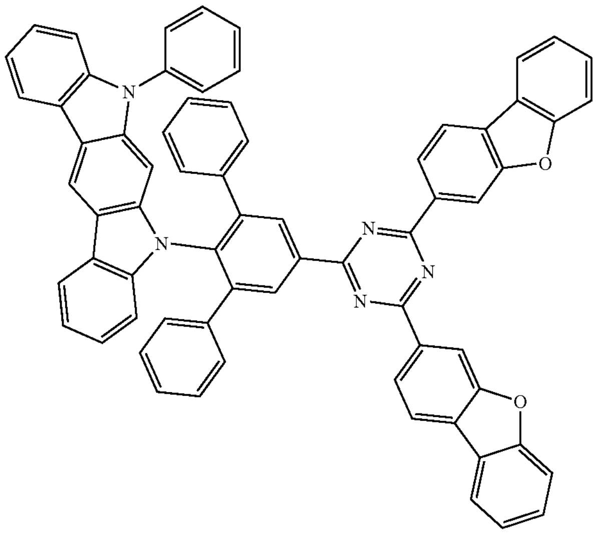
333
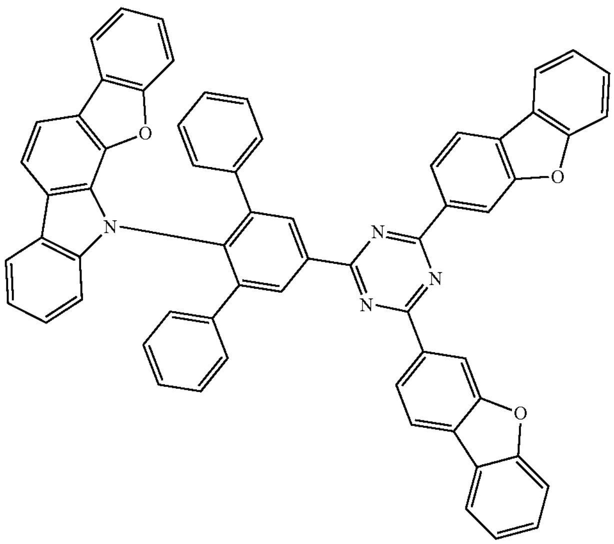
334
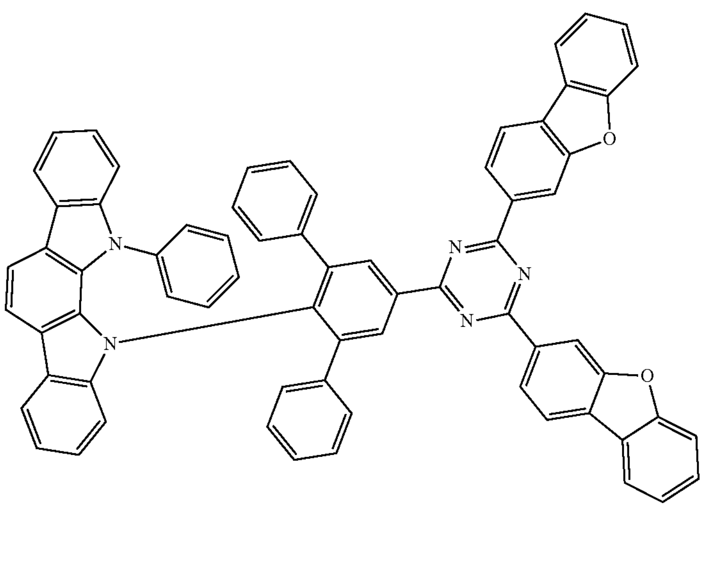

-continued
335
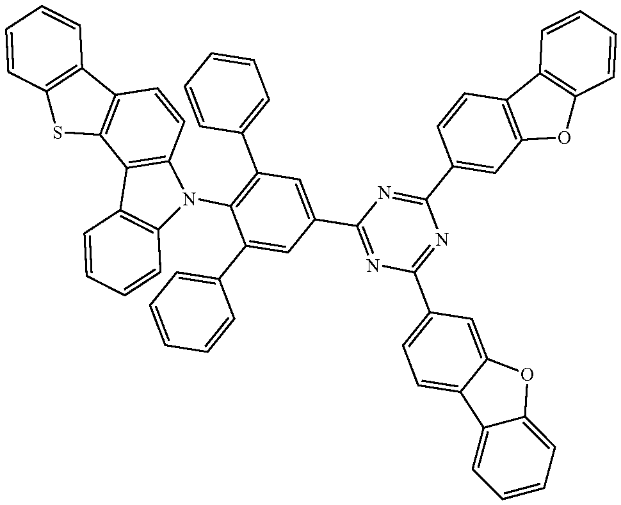
336
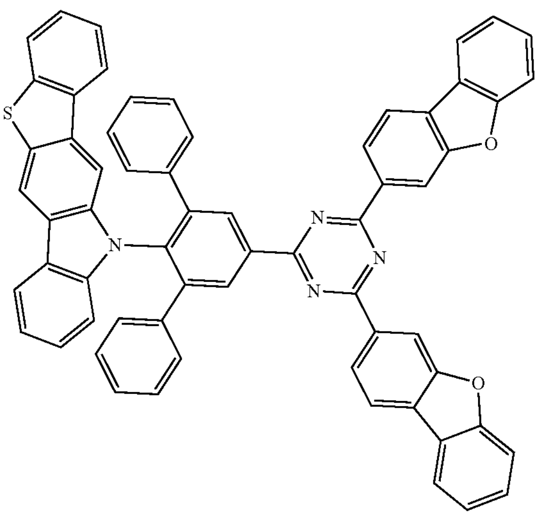
337
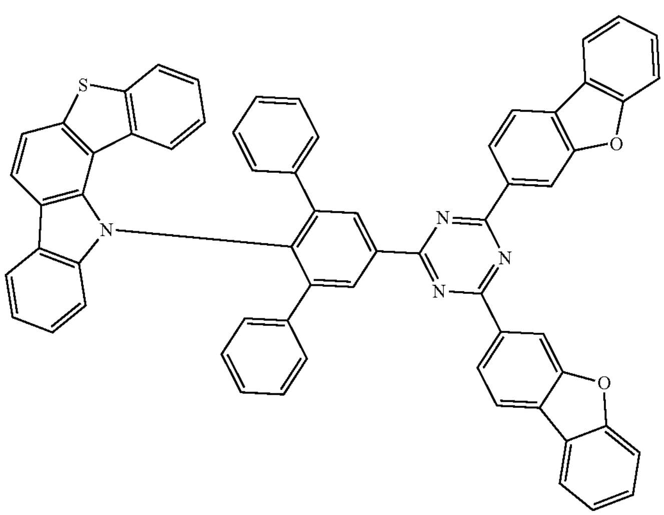

-continued
338
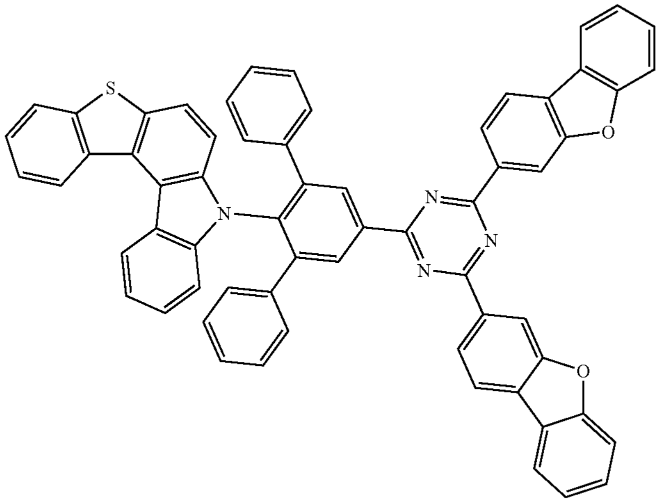
339
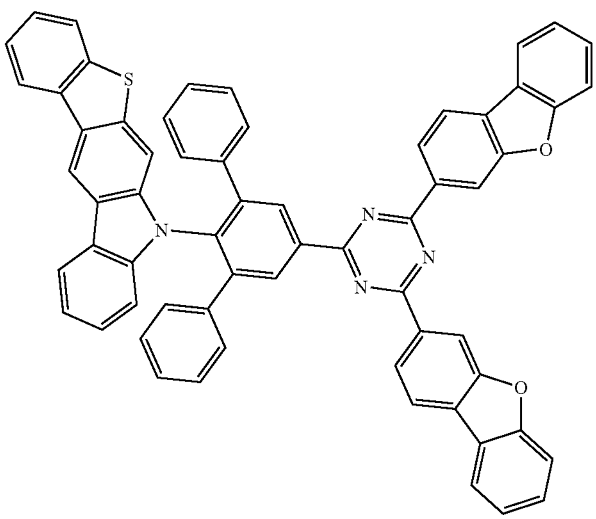
340
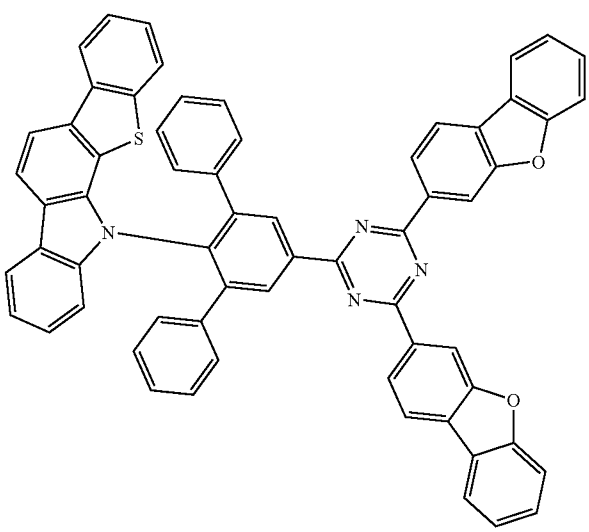

-continued
341
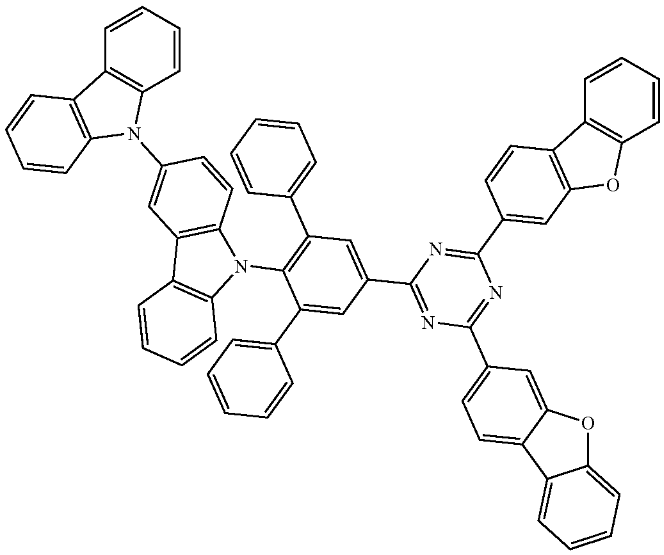
342
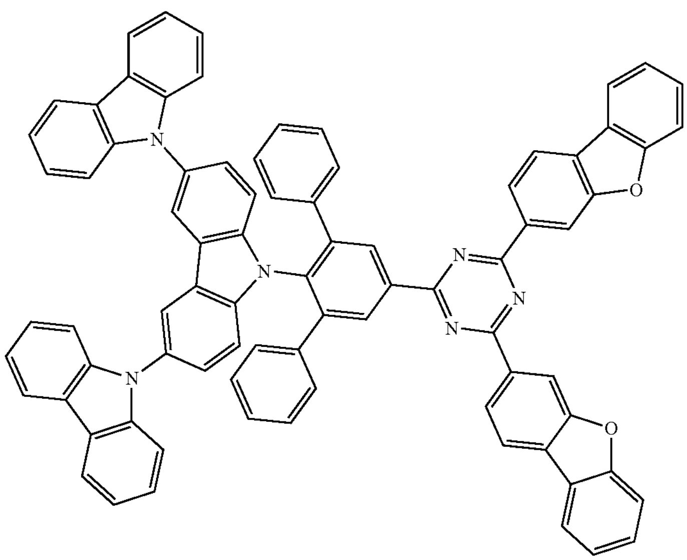
343
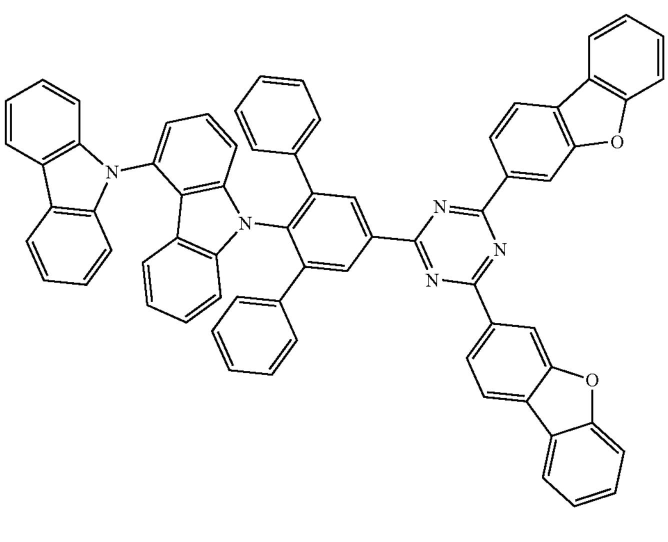

-continued
344
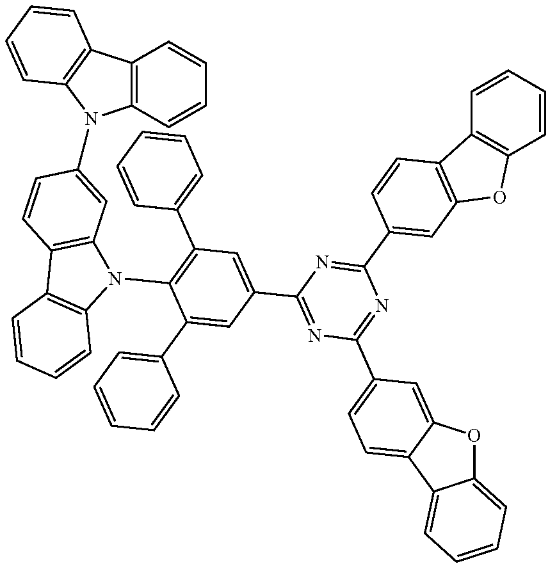
345
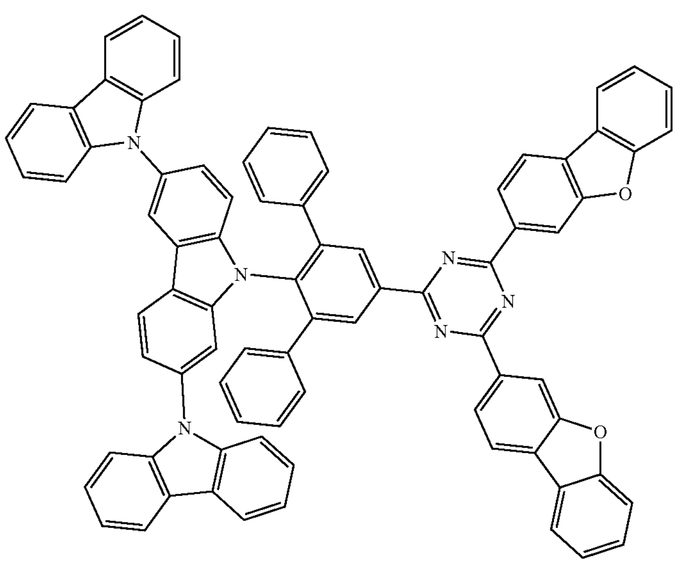

-continued
346
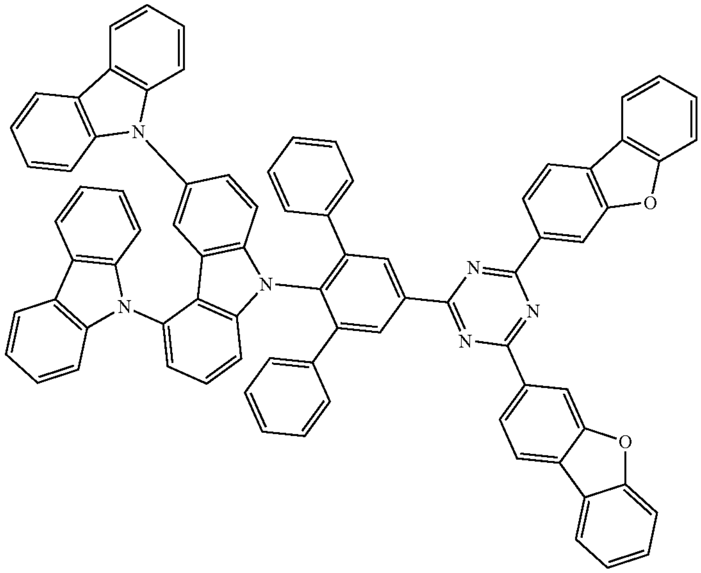
347
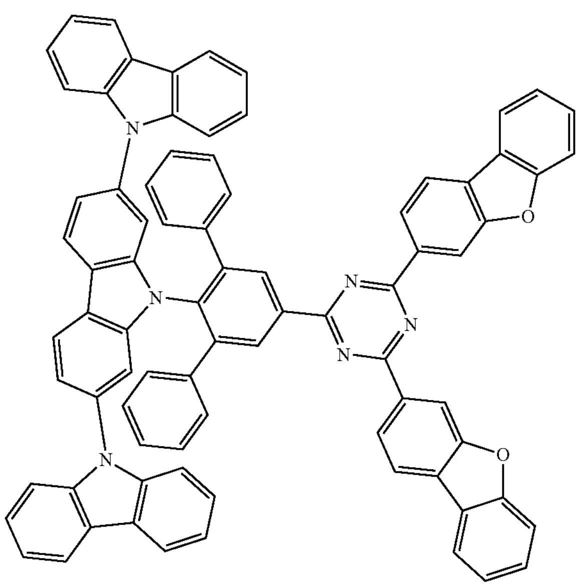

-continued
348
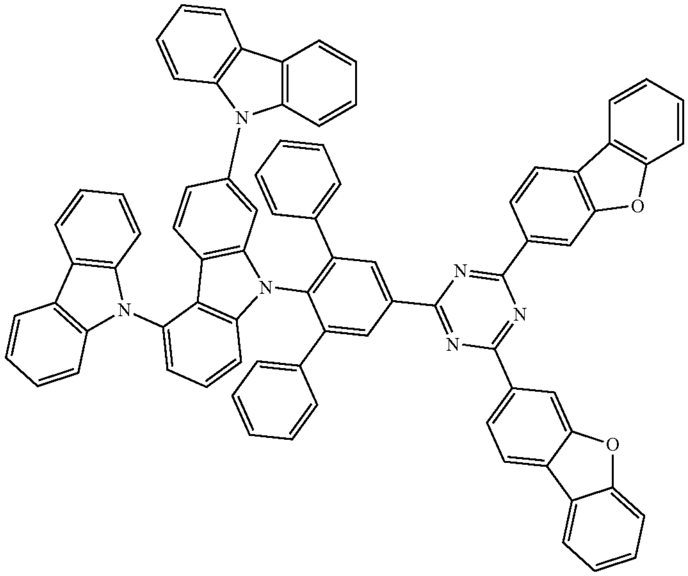
349
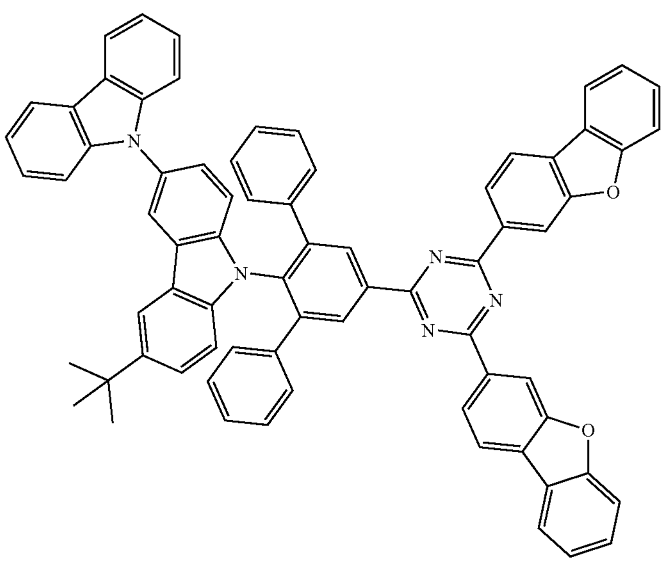

-continued
350
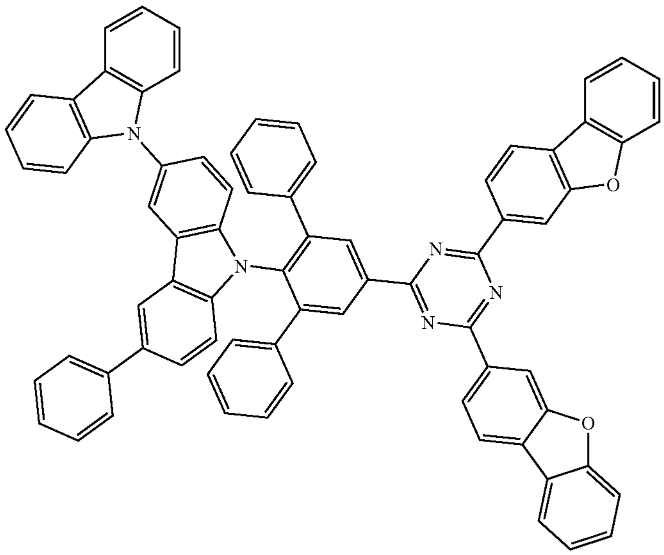
351
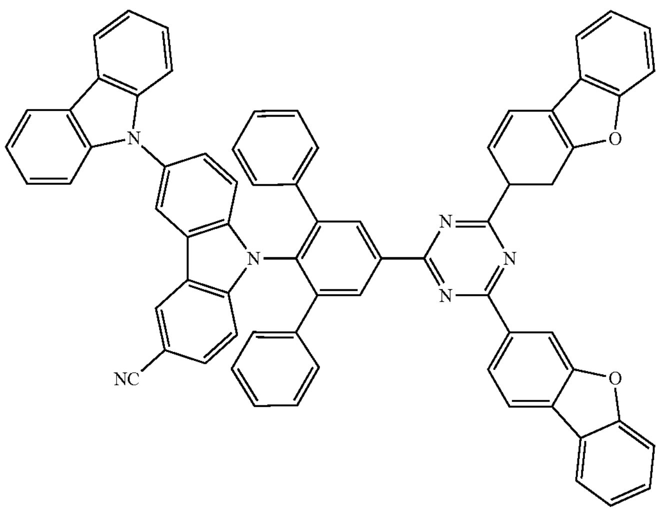
352
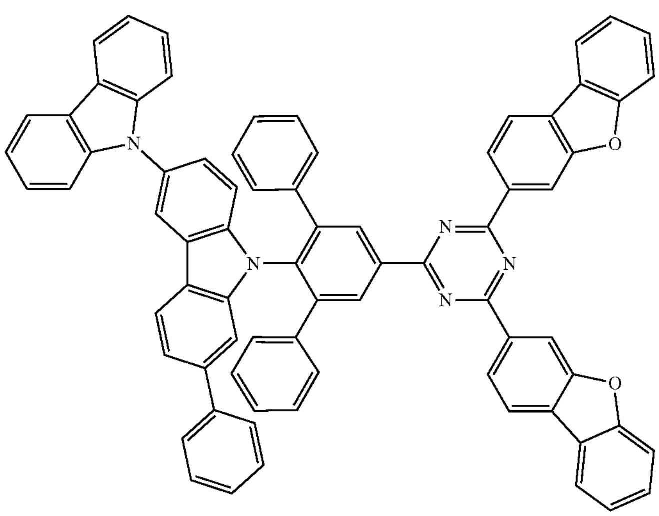

-continued
353
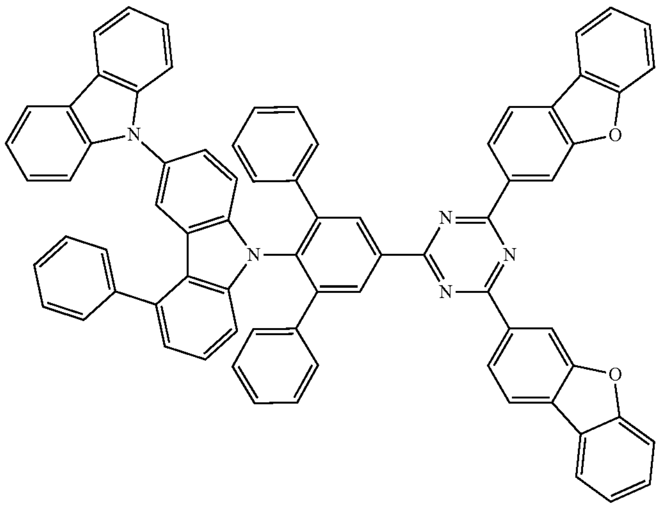
354
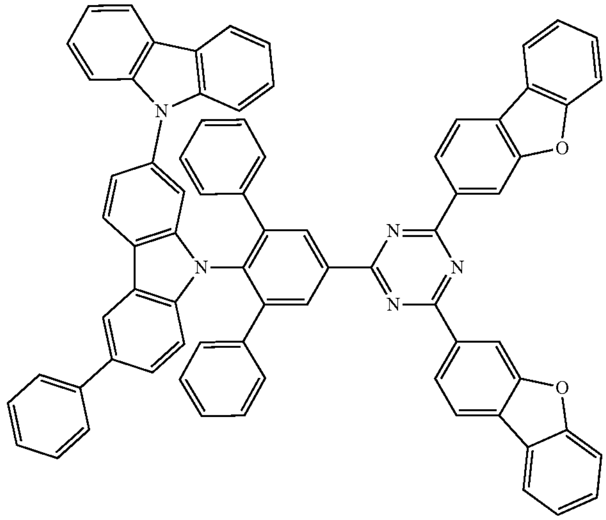
355
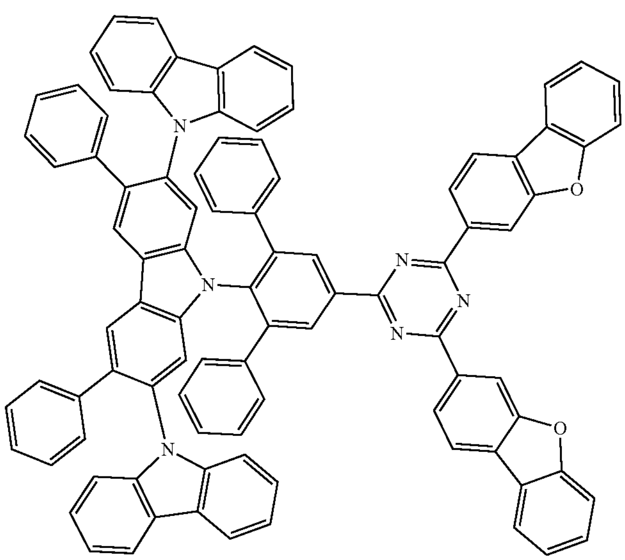

-continued
356
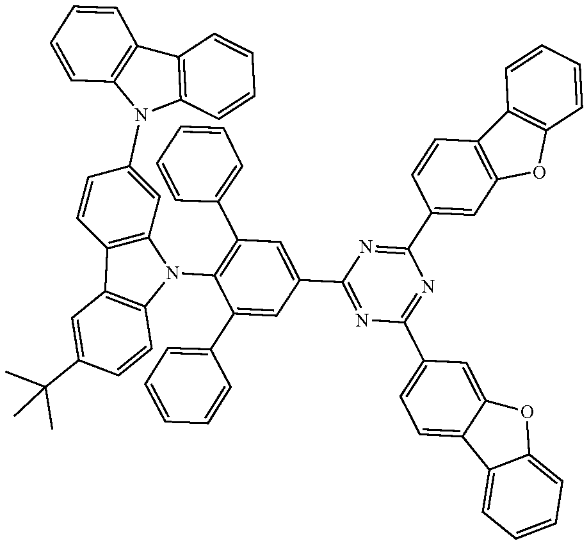
357
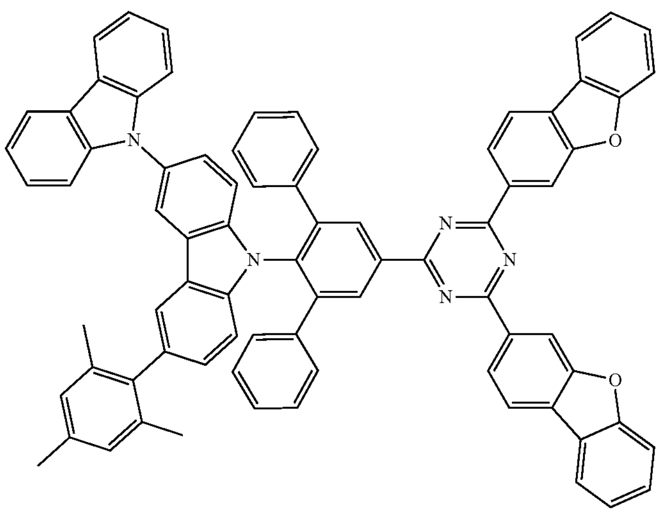
358
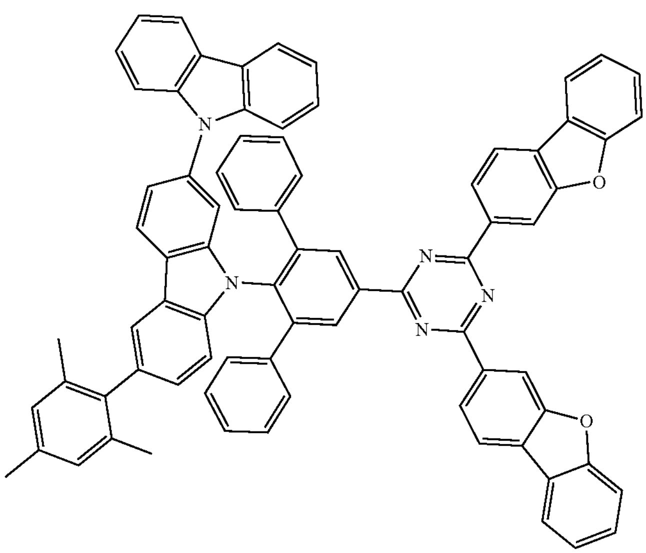

-continued
359
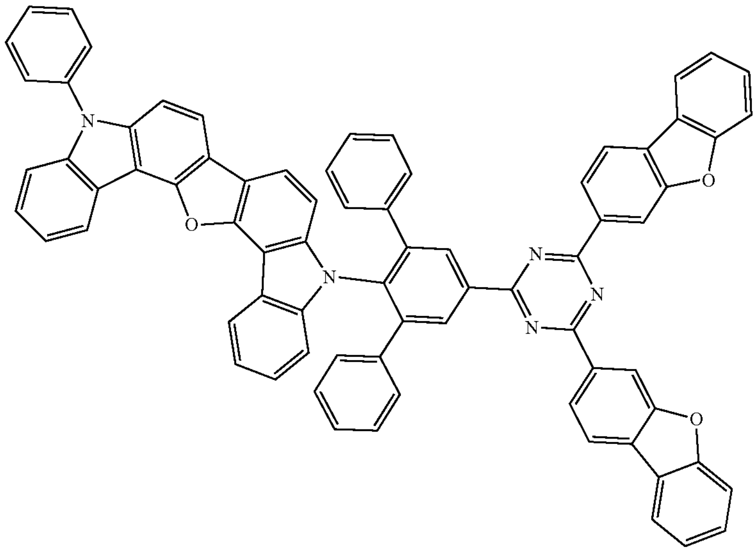
360
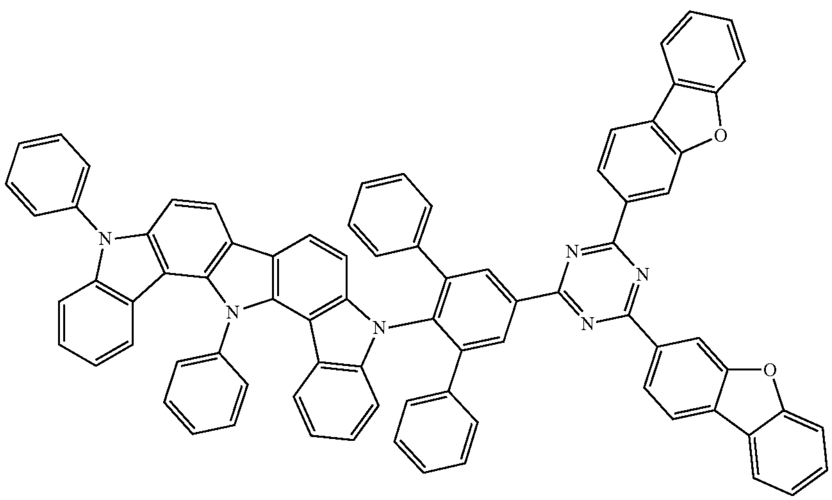
361
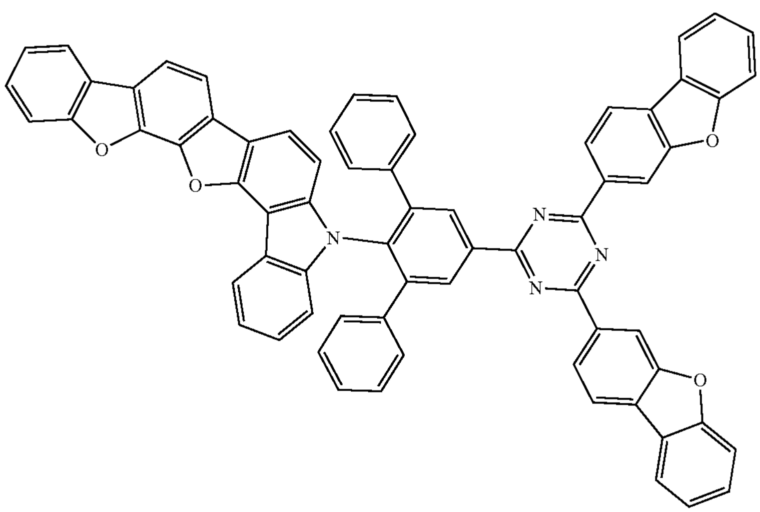

-continued
362
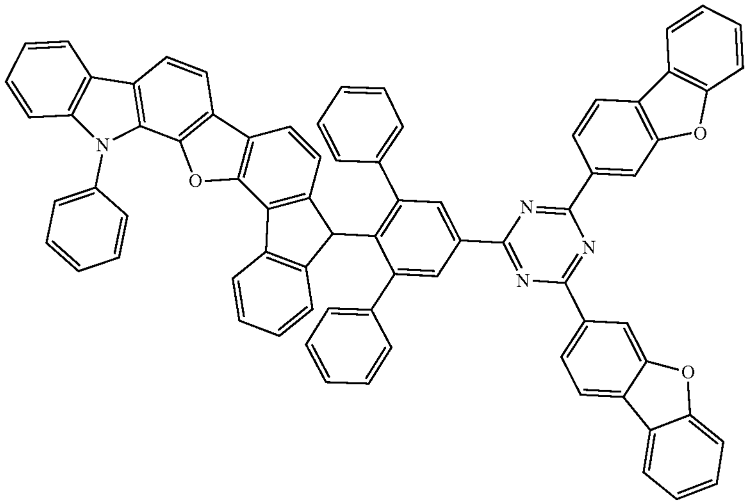
363
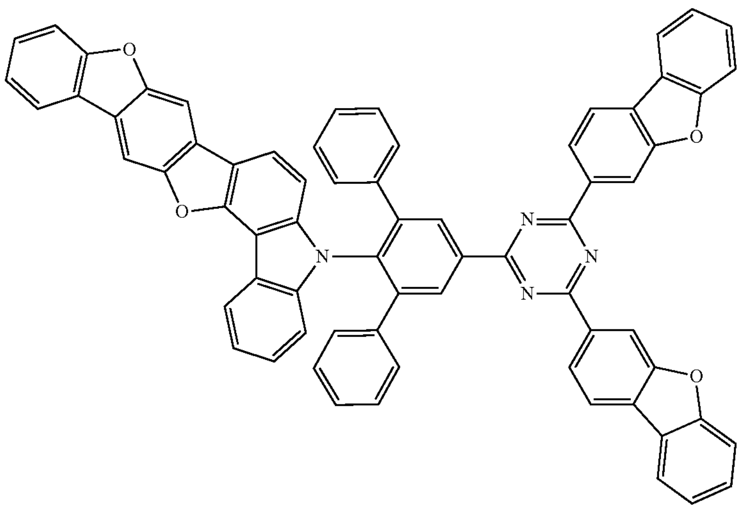
364
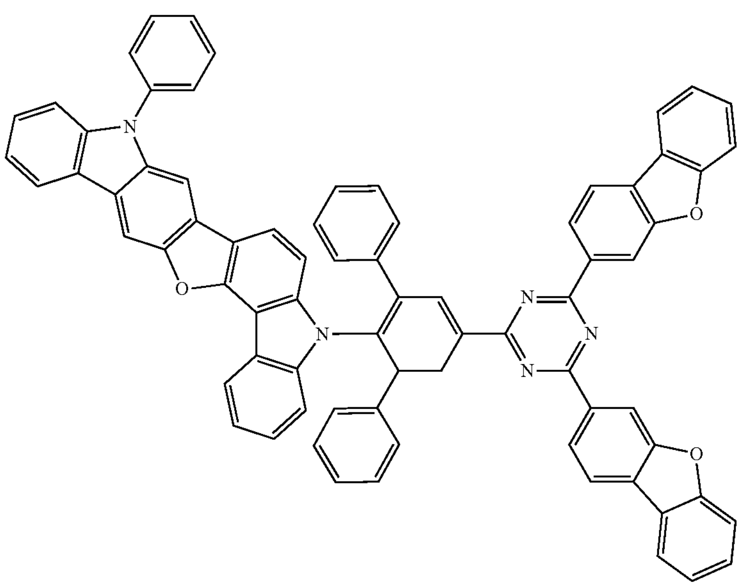

-continued
365
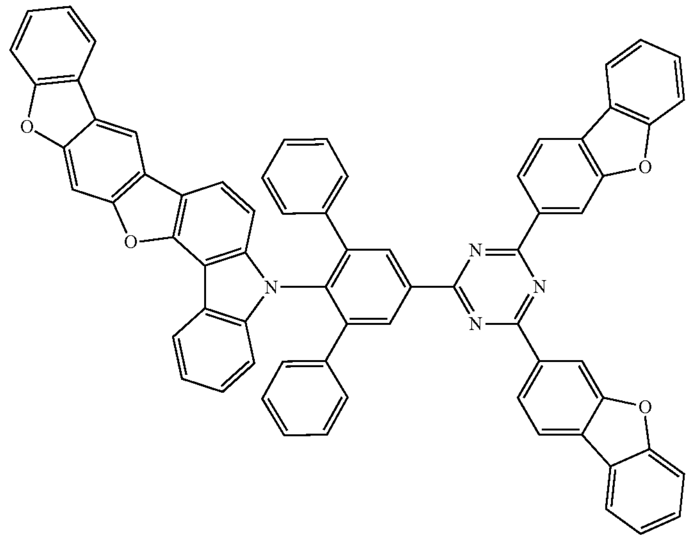
366
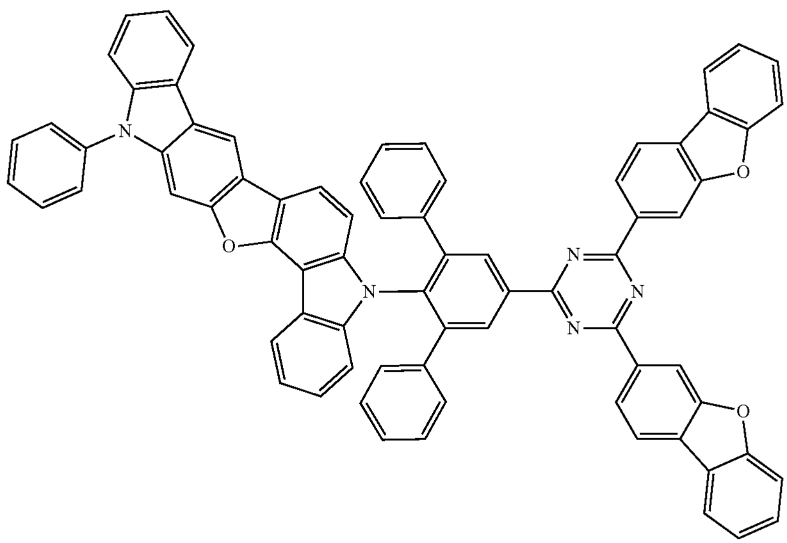
367
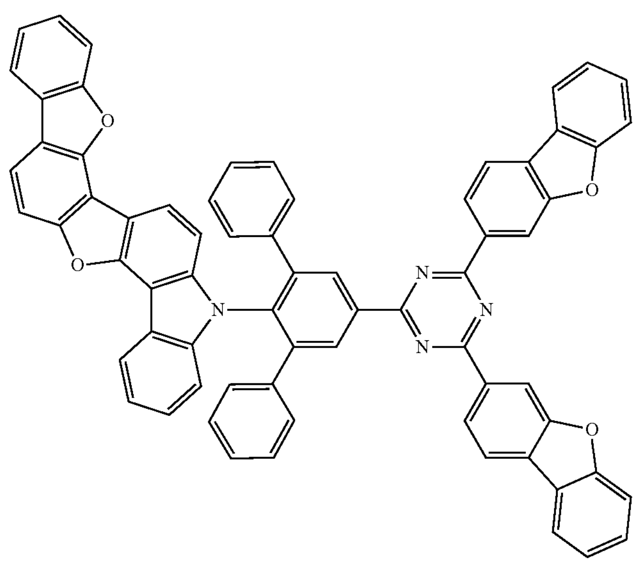

-continued
368
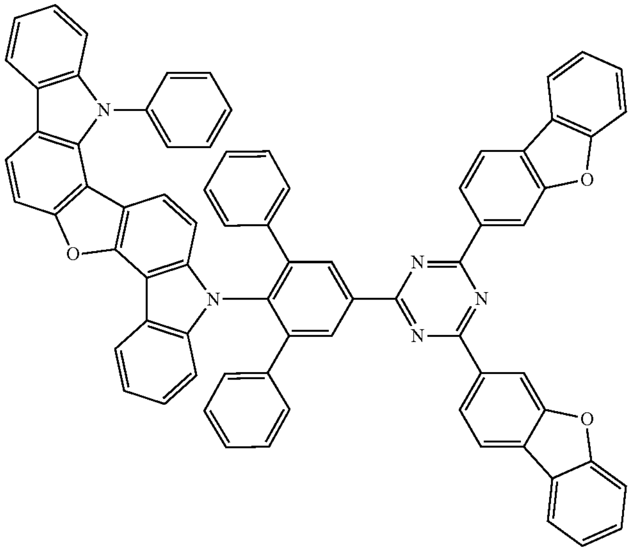
369
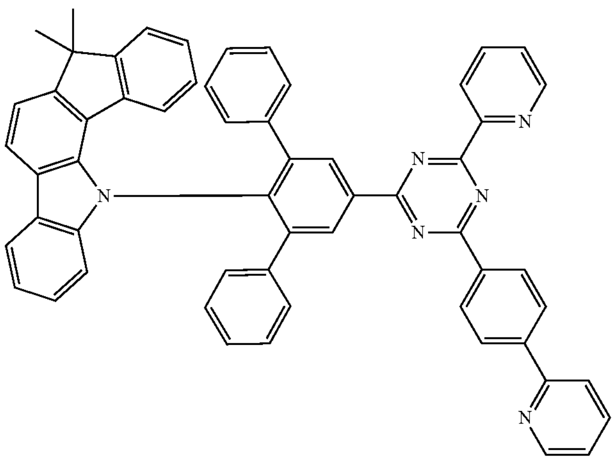
370
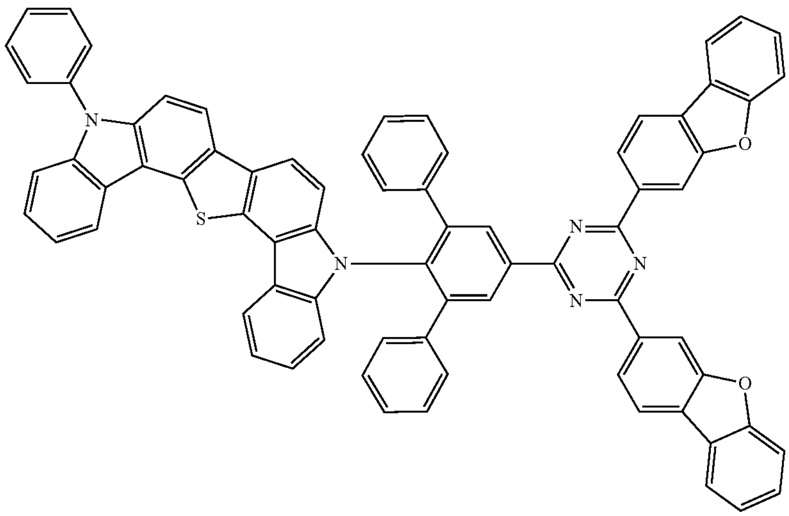

-continued
371
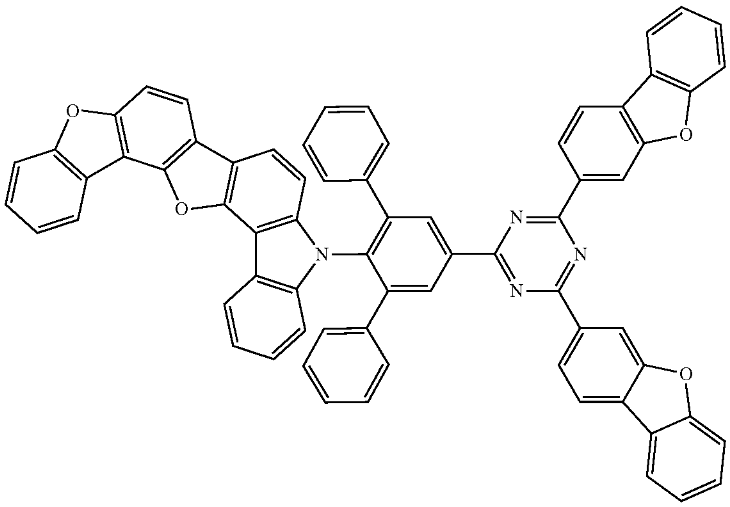
372
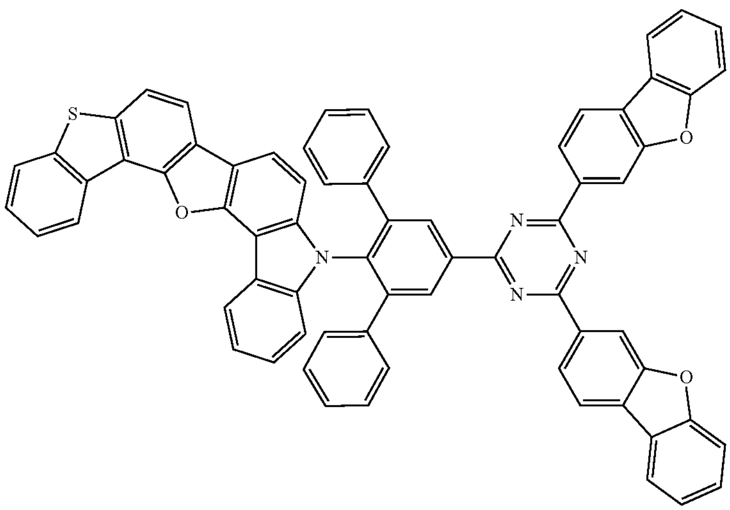
373
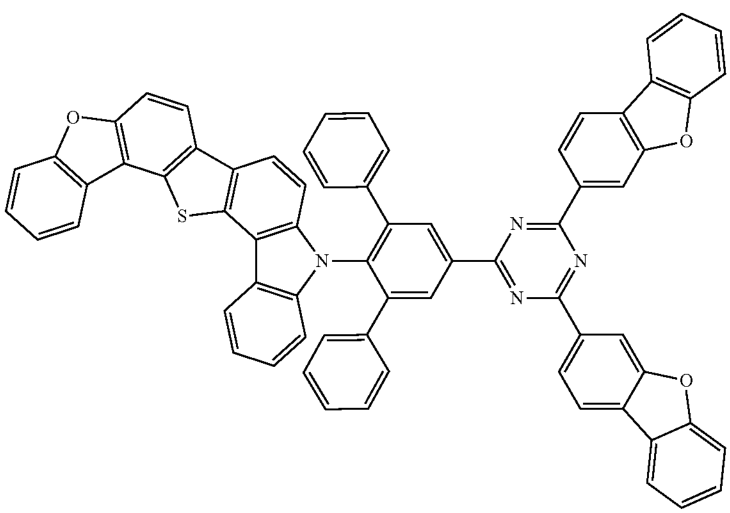

-continued
374
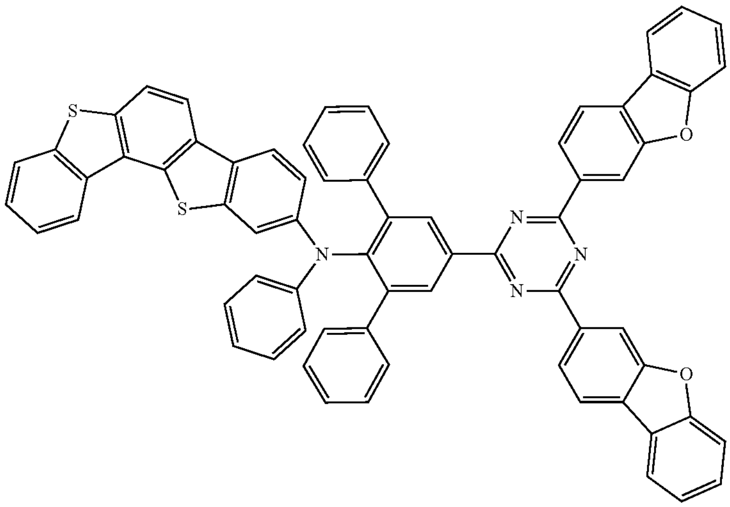
375
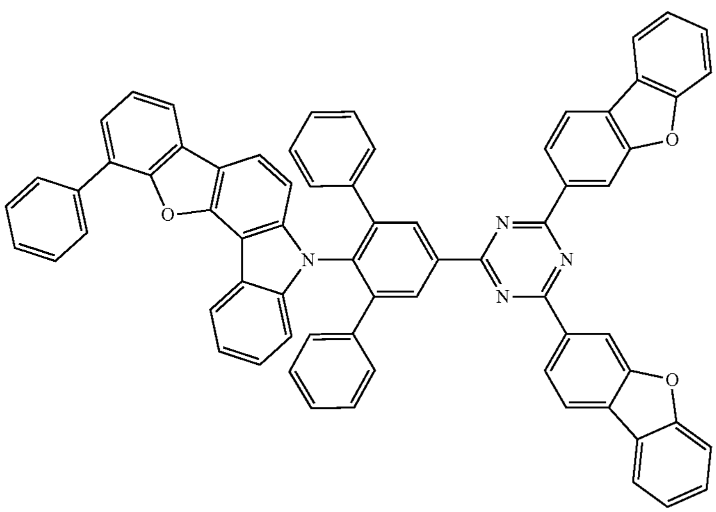
376
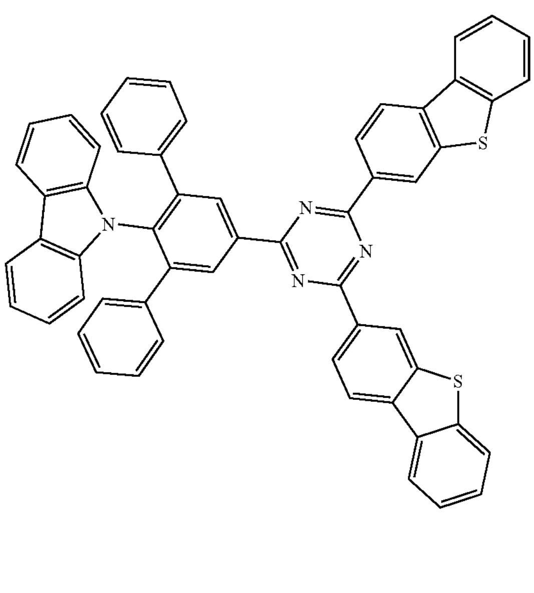

-continued
377
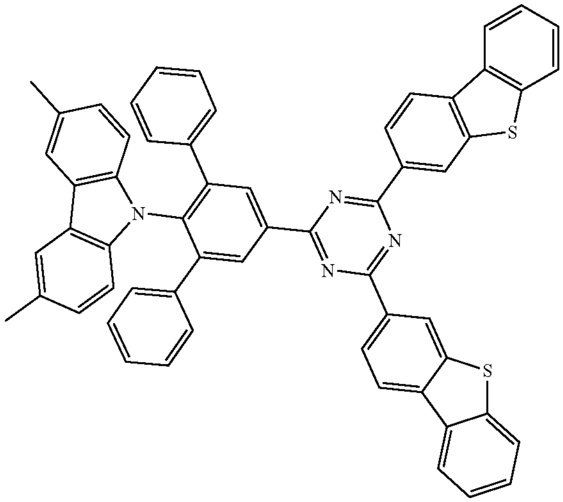
378
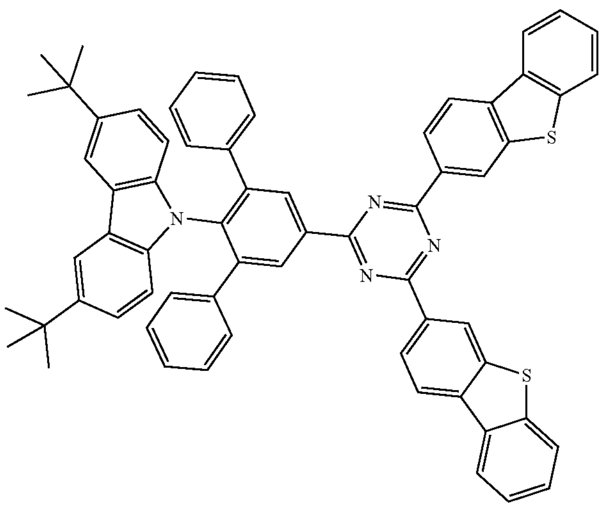
379
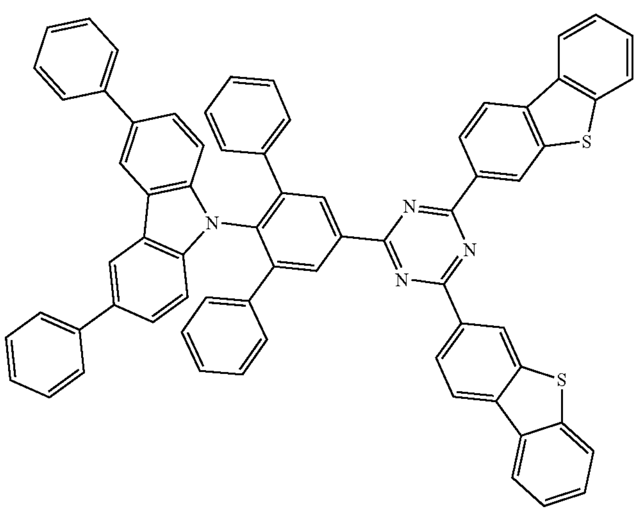

-continued
380
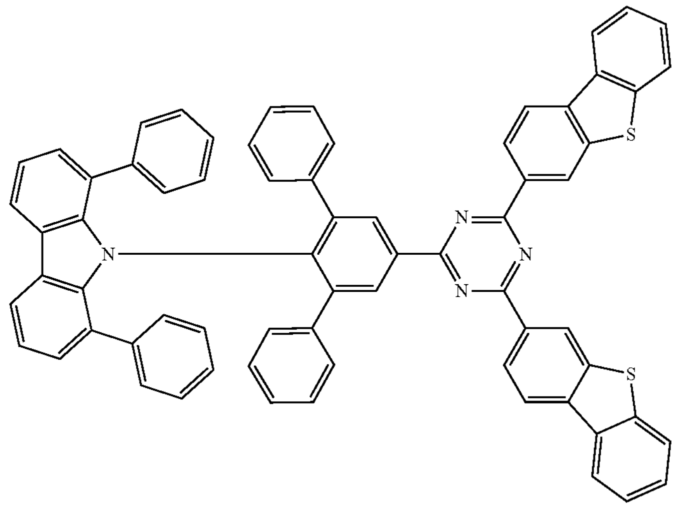
381
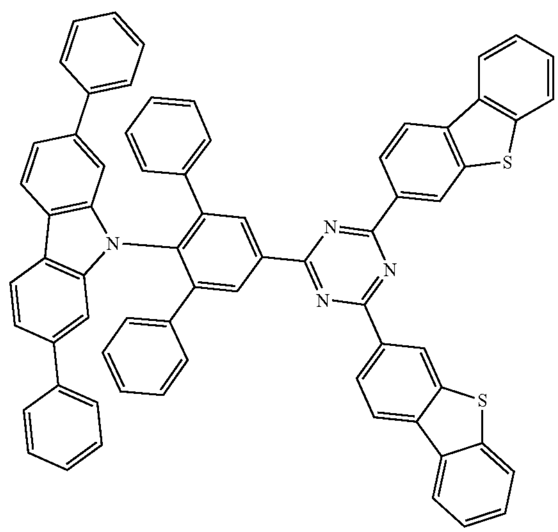
382
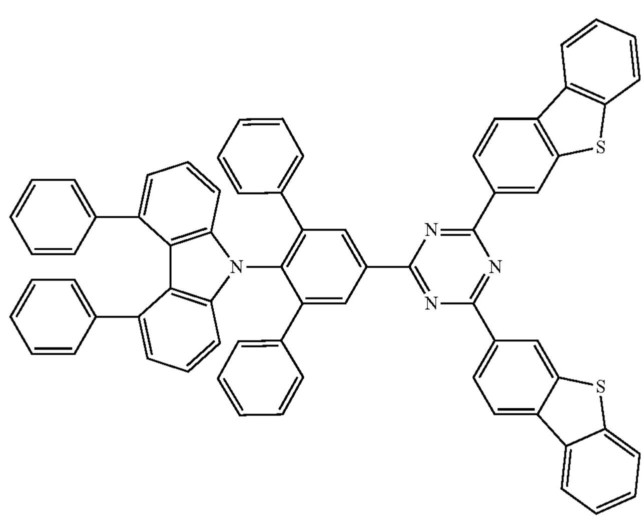

-continued
384
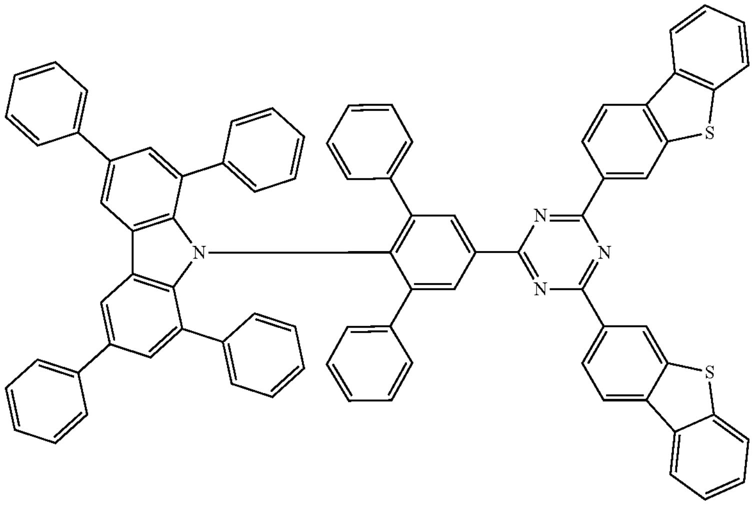
385
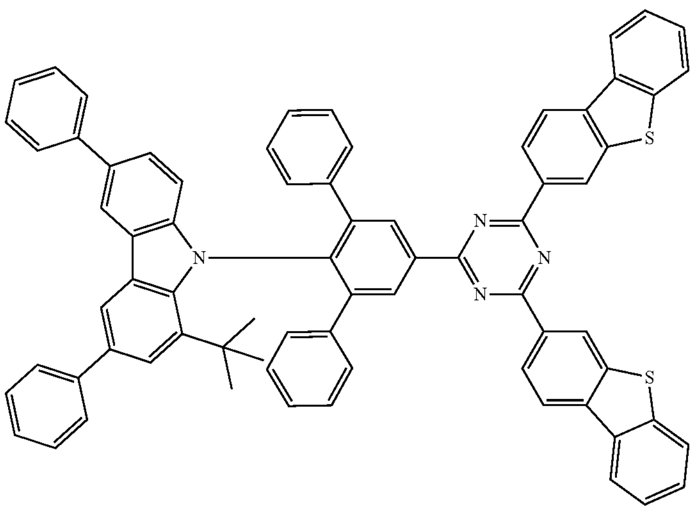
386
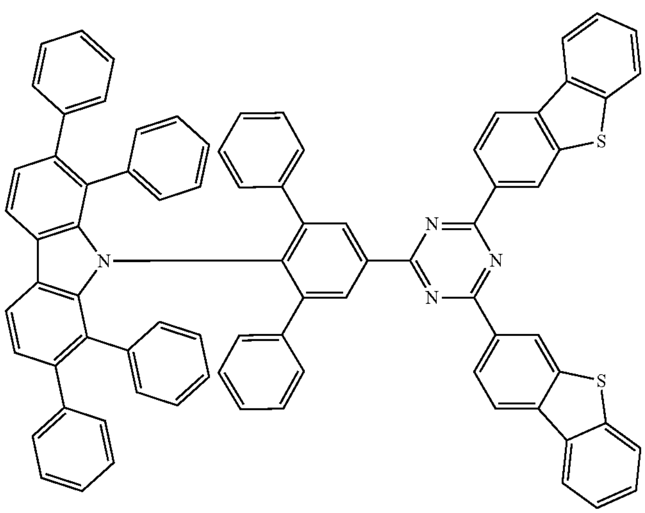

-continued
387
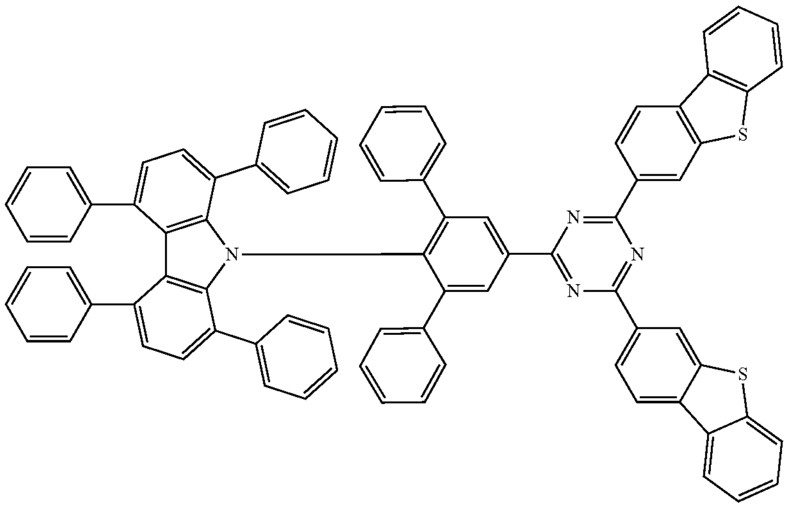
388
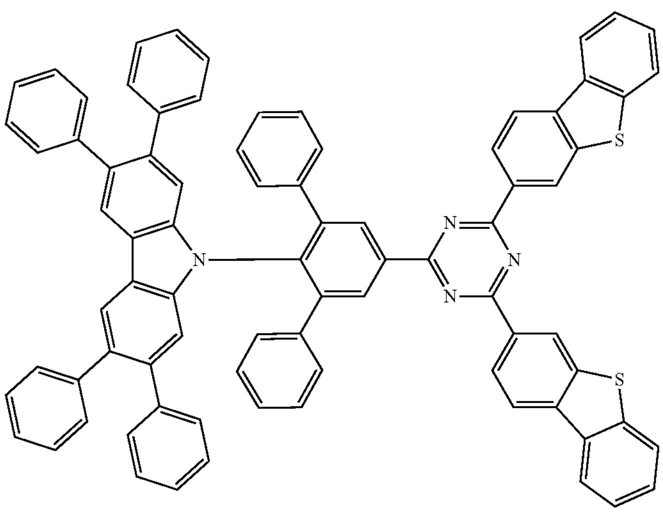
389
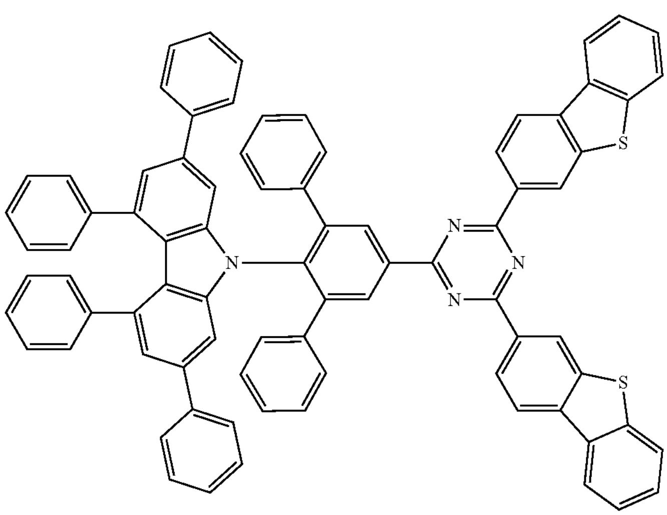

-continued
390
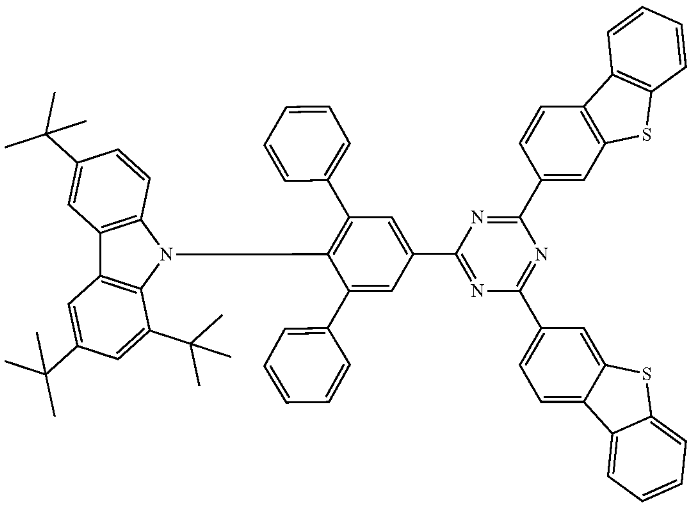
391
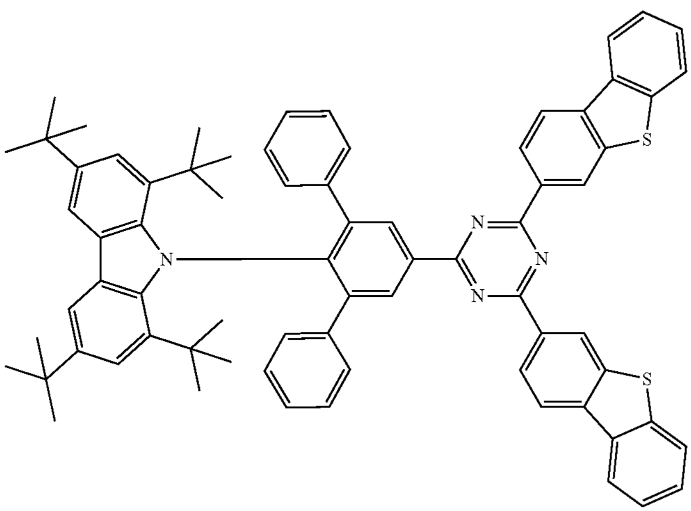
392
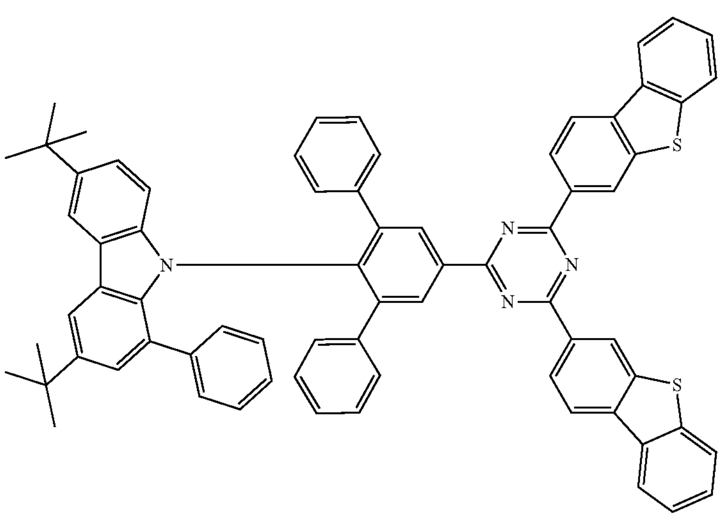

-continued
393
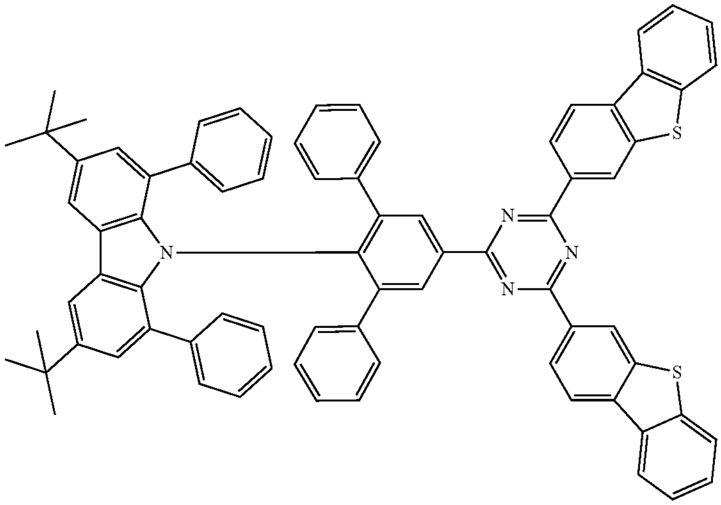
394
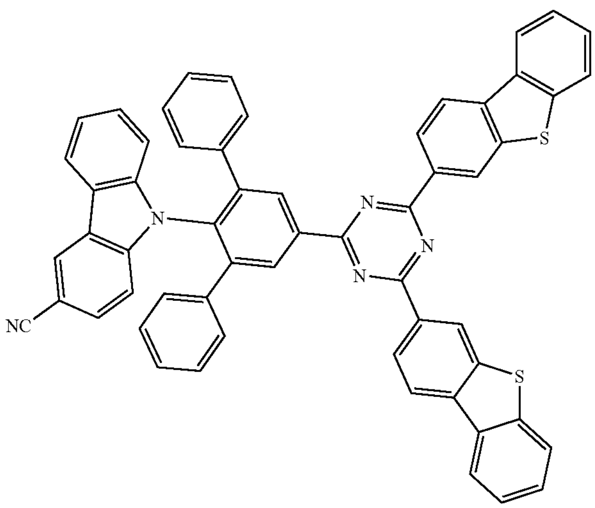
395
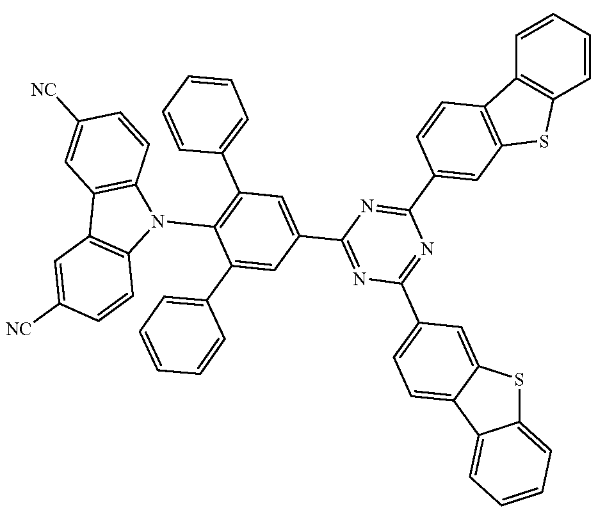

-continued
396
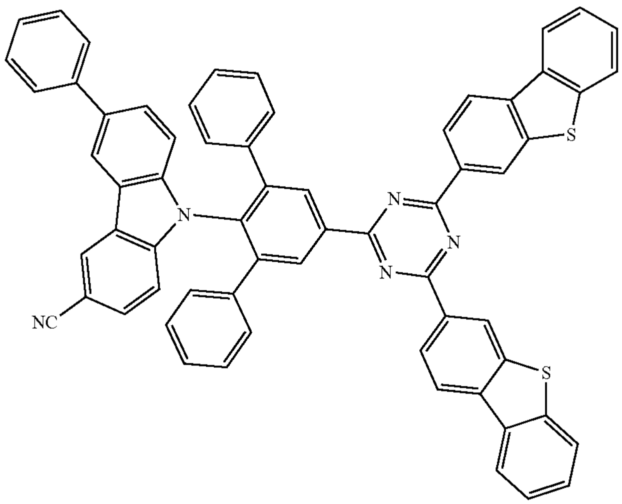
397
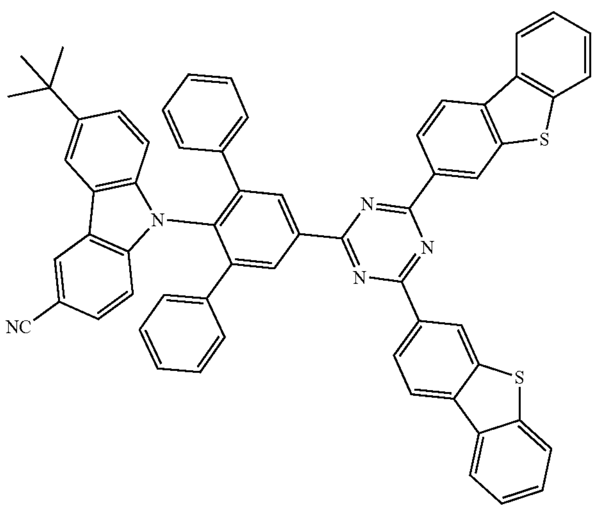
398
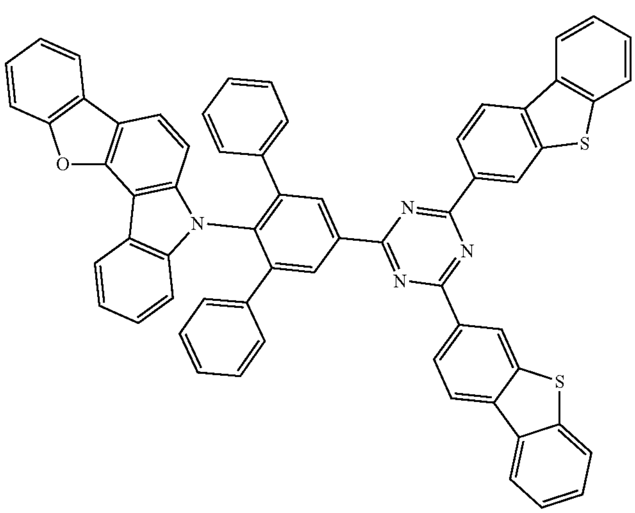

-continued
399
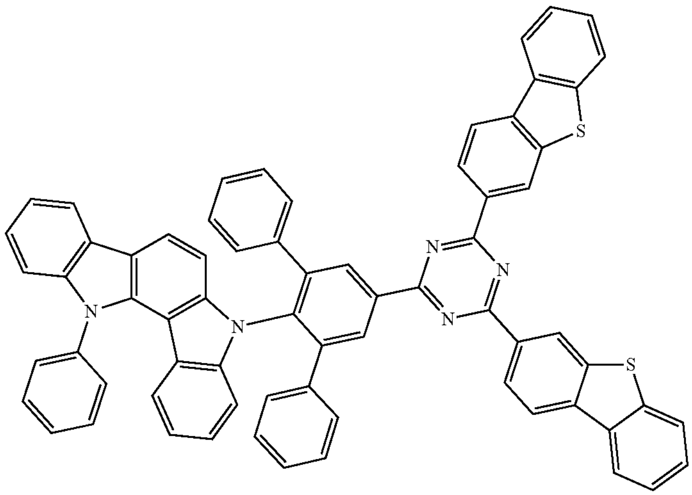
400
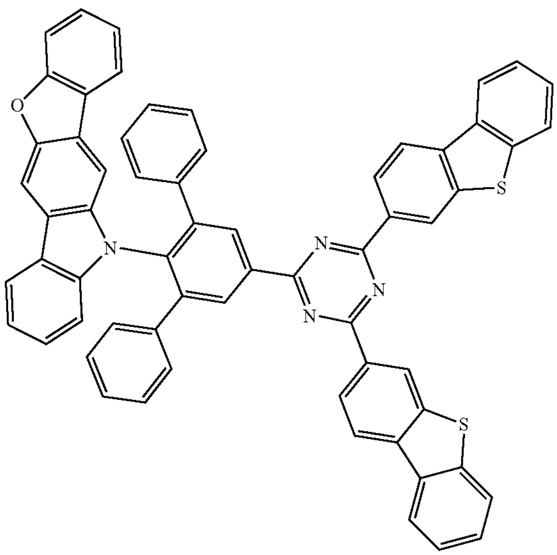
401
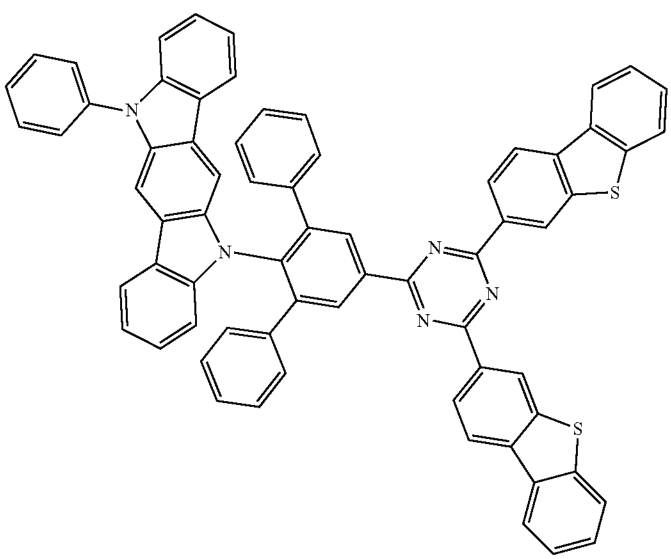

-continued
402
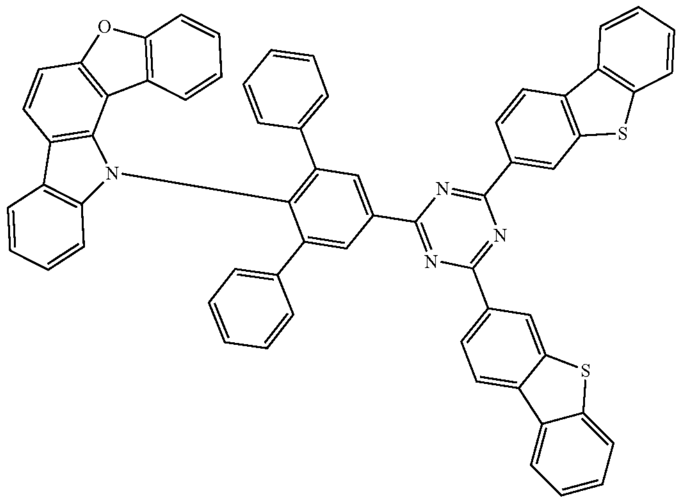
403
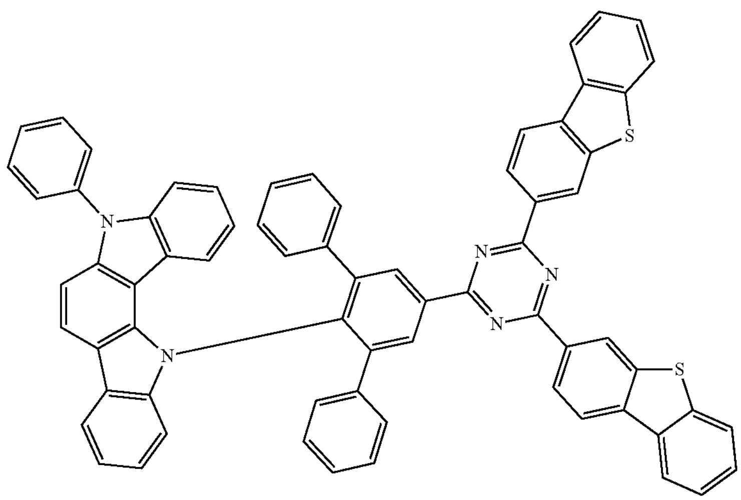
404
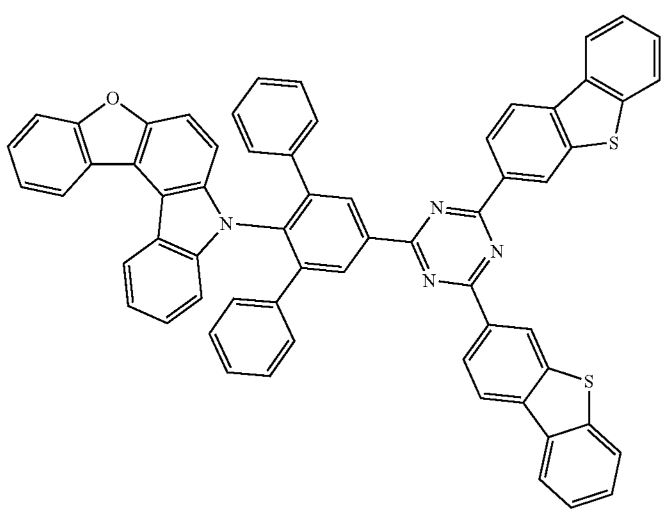

-continued
405
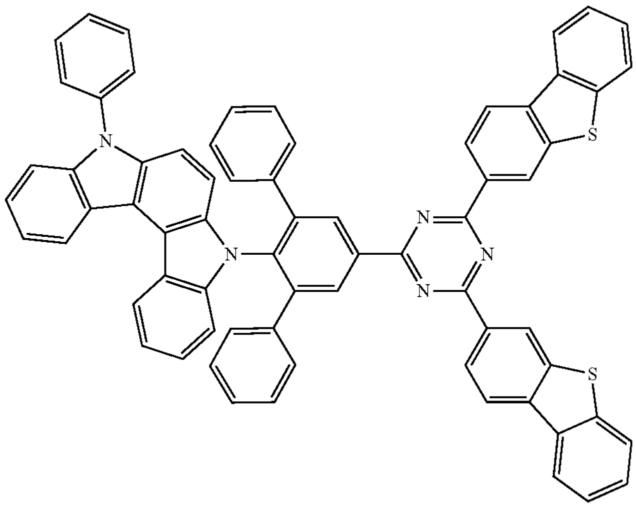
406
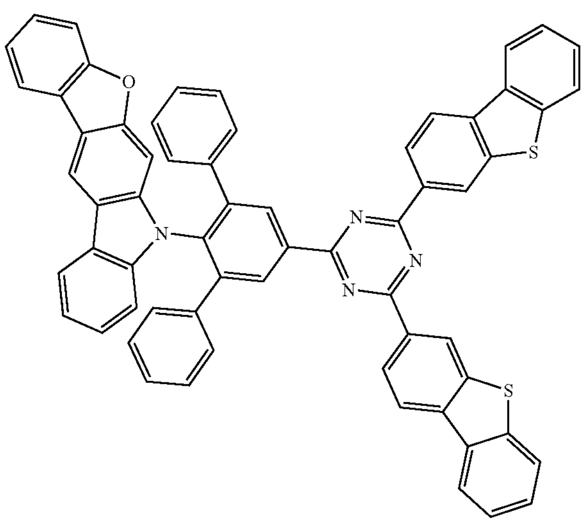
407
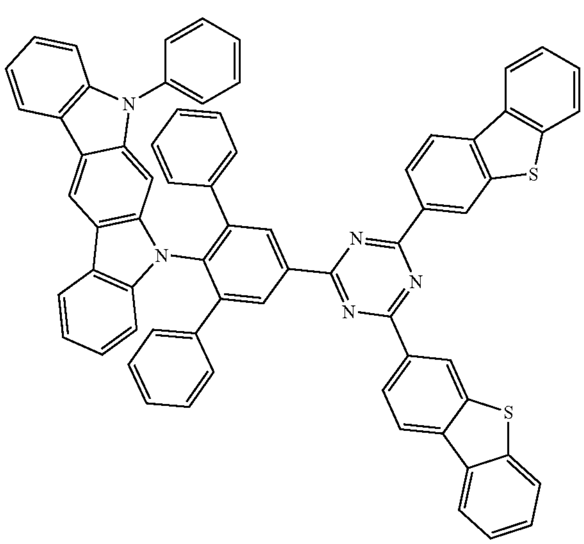

-continued
408
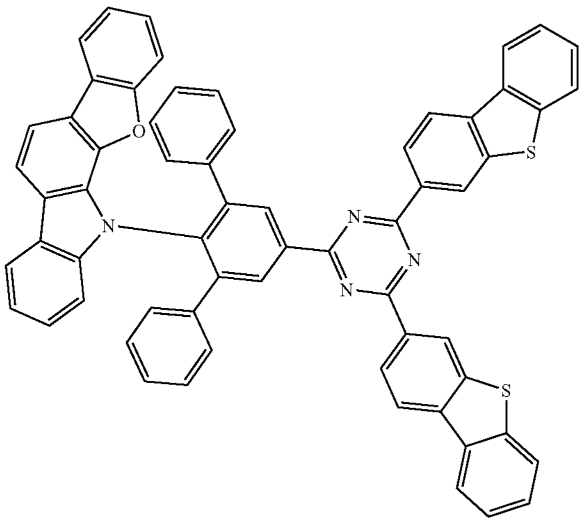
409
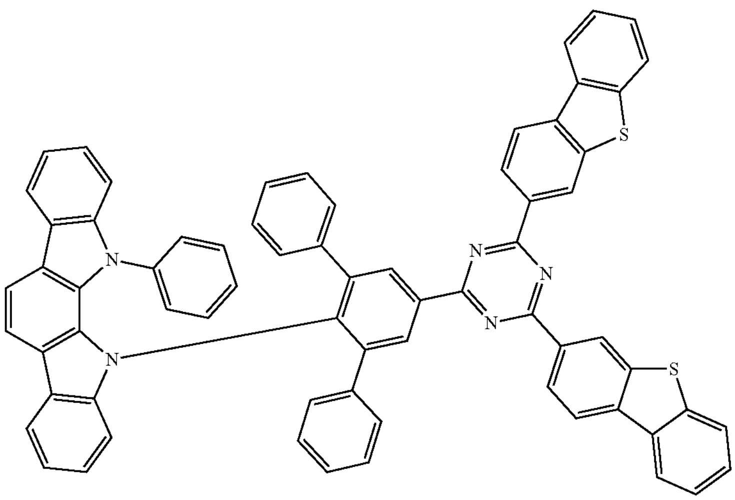
410
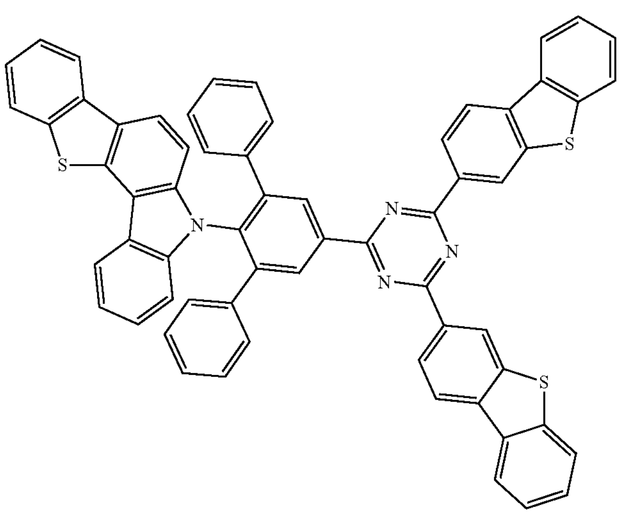

-continued
411
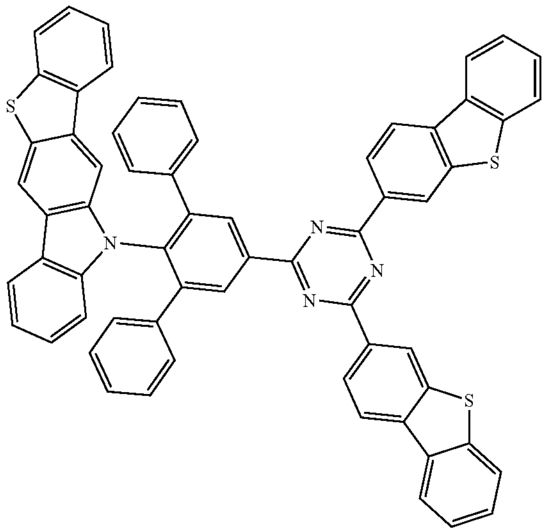
412
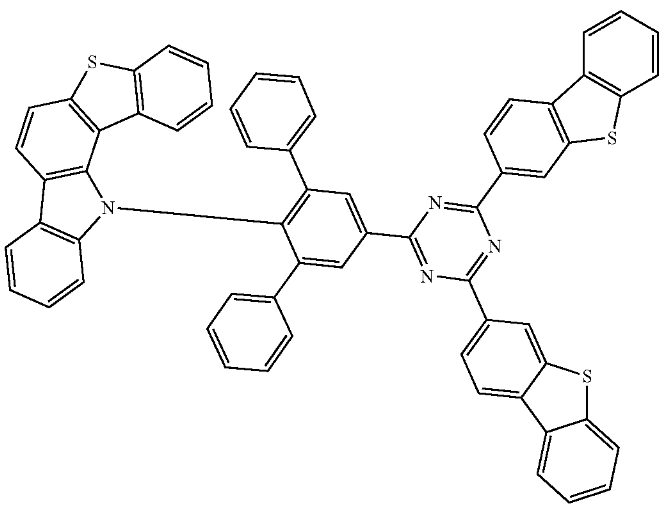
413
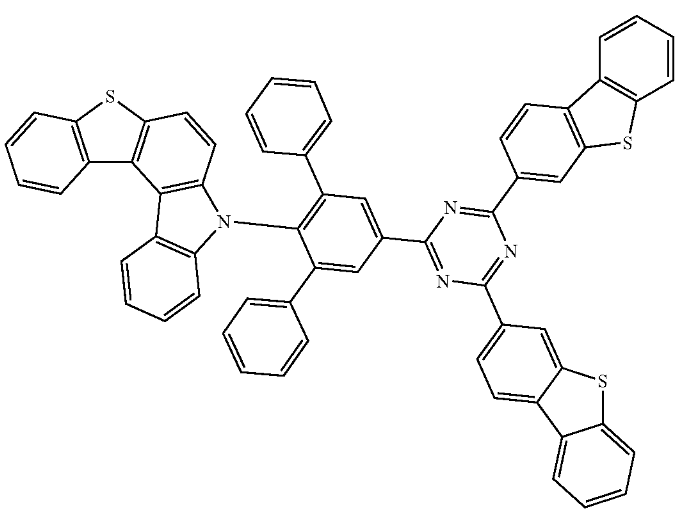

-continued
414
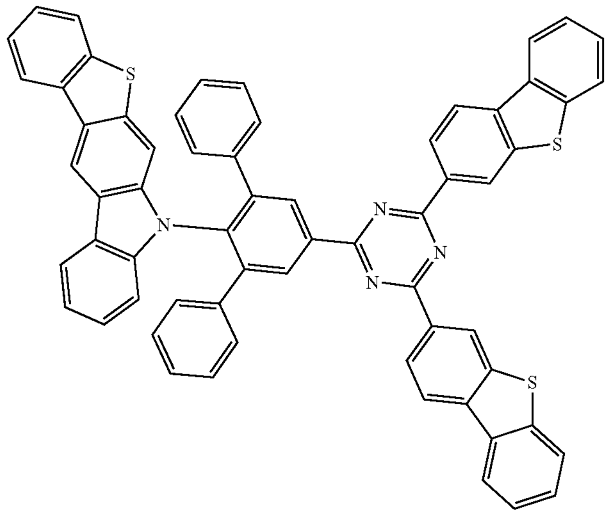
415
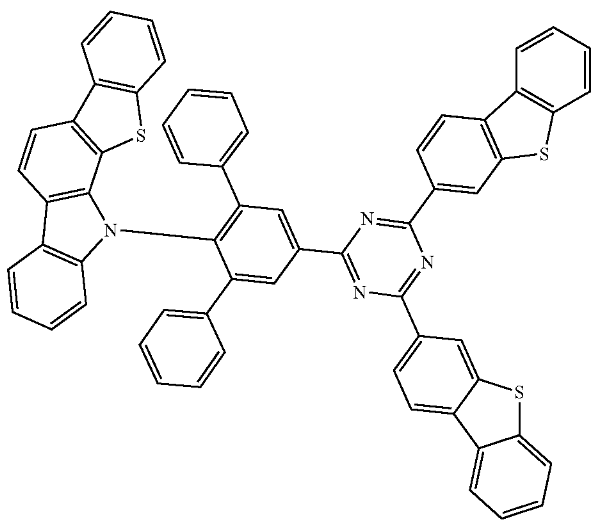
416
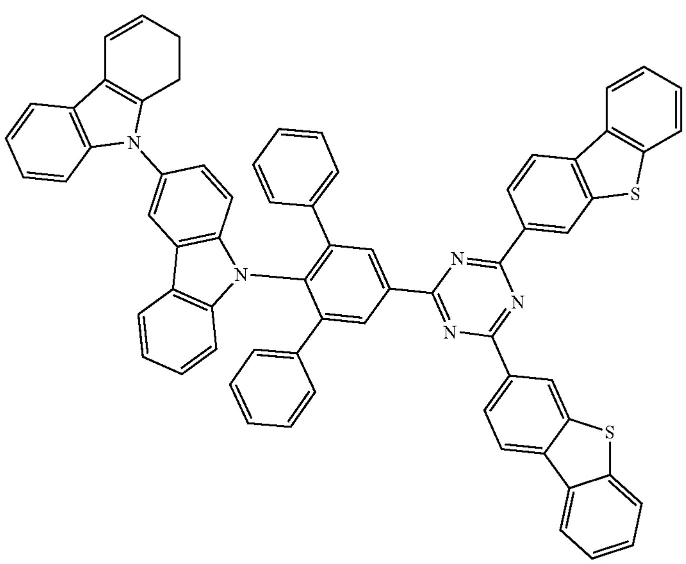

-continued
417
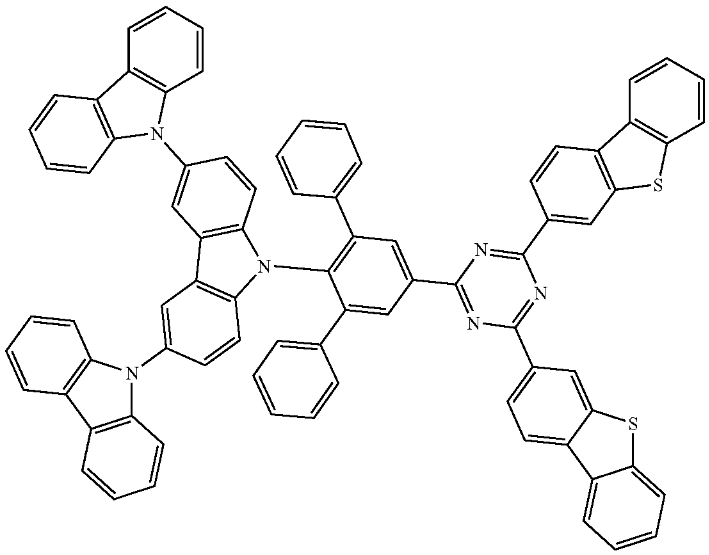
418
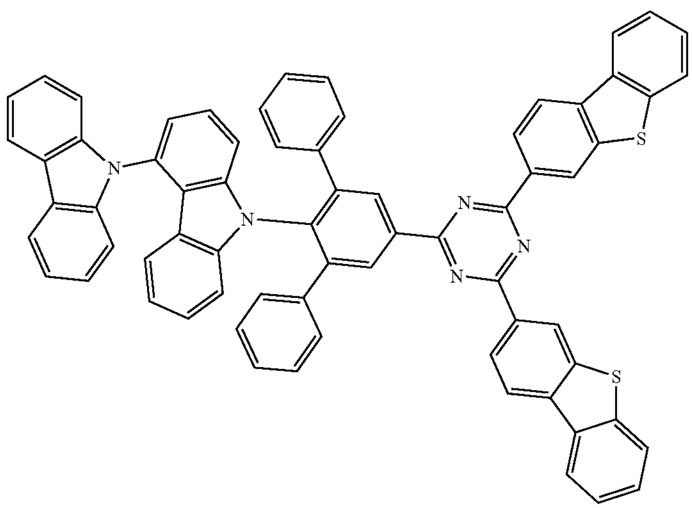
419
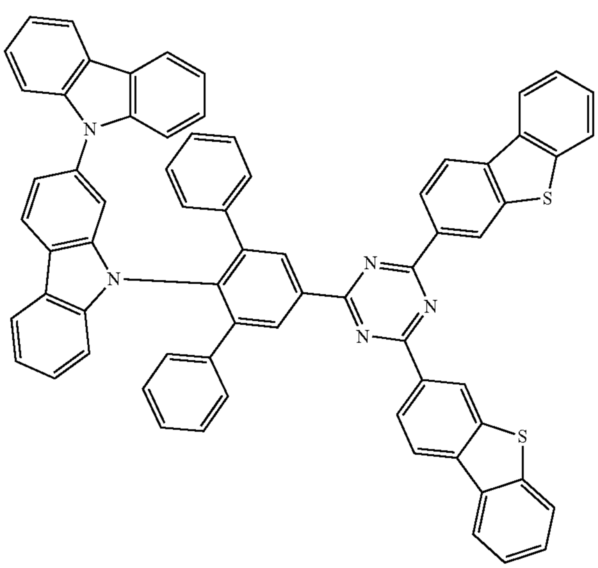

-continued
420
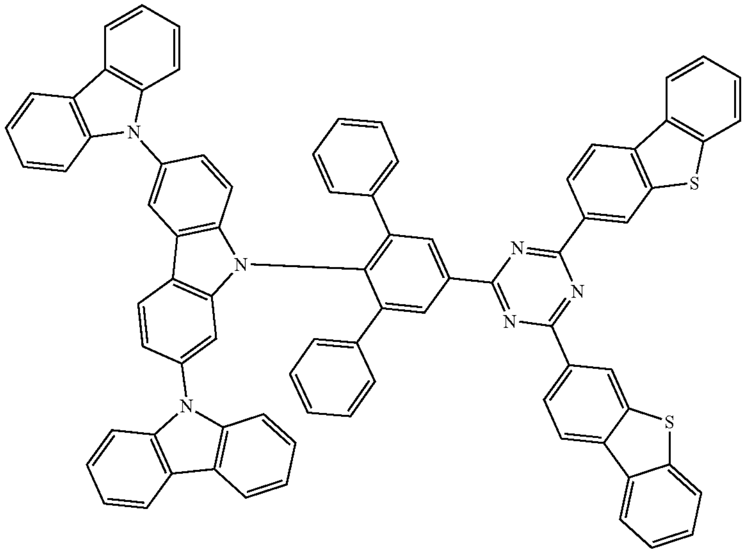
421
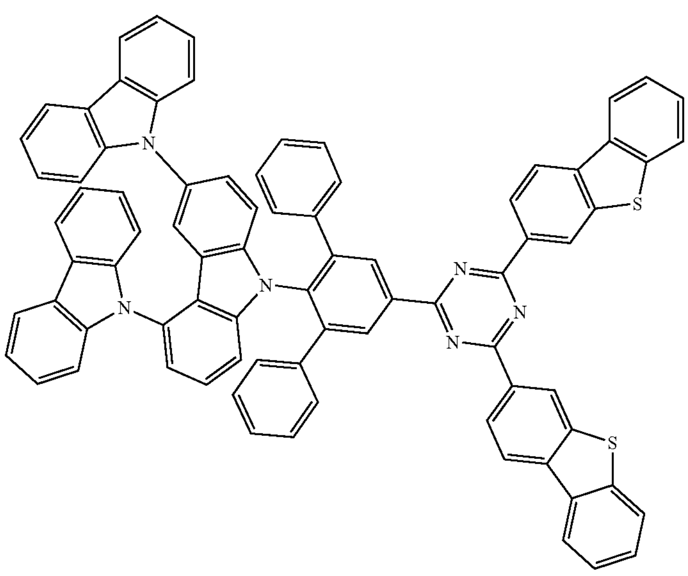

-continued
422
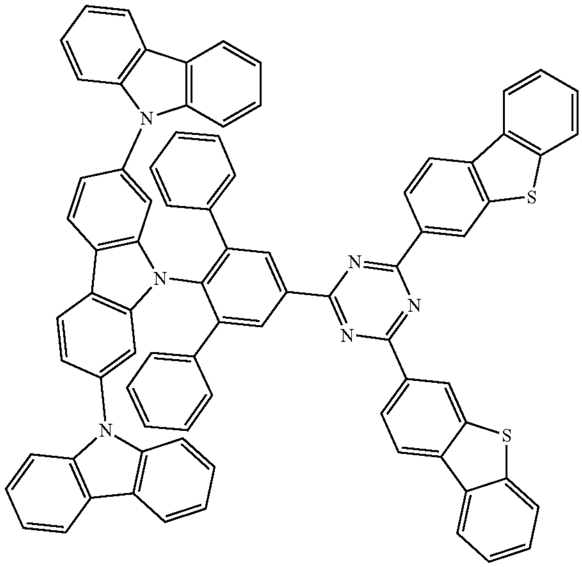
423
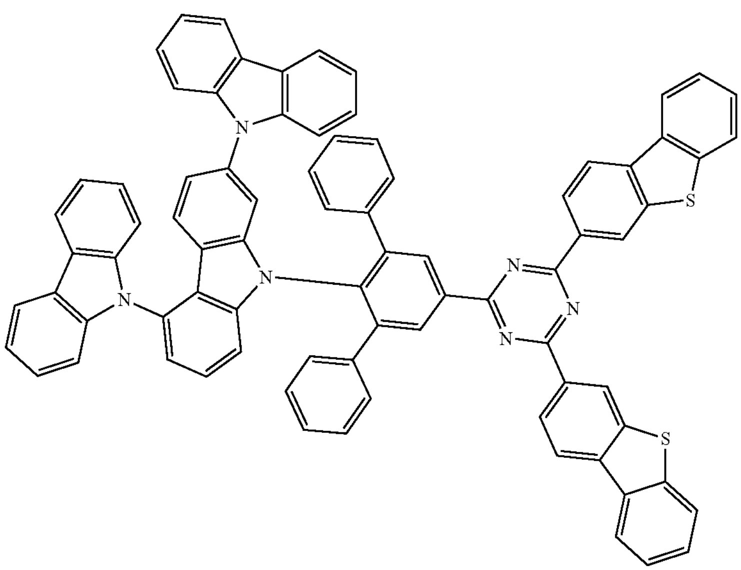

-continued
424
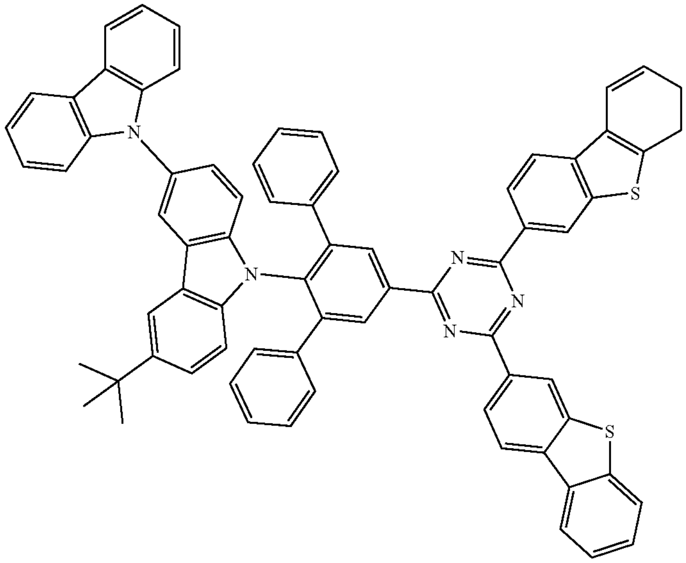
425
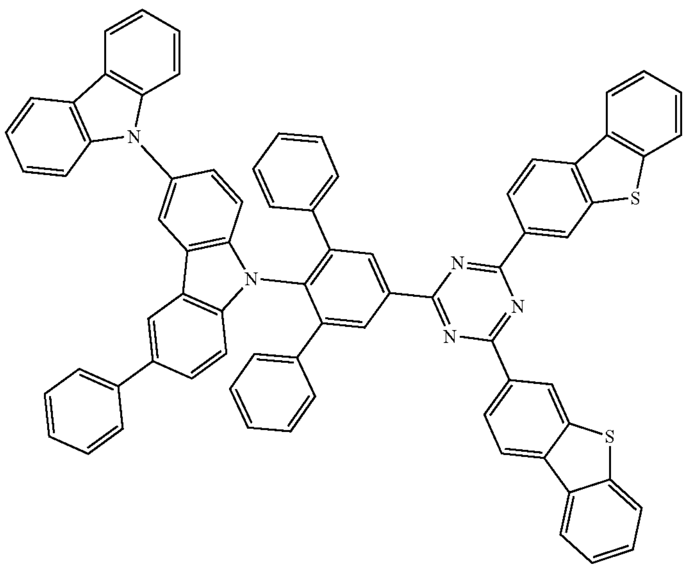
426
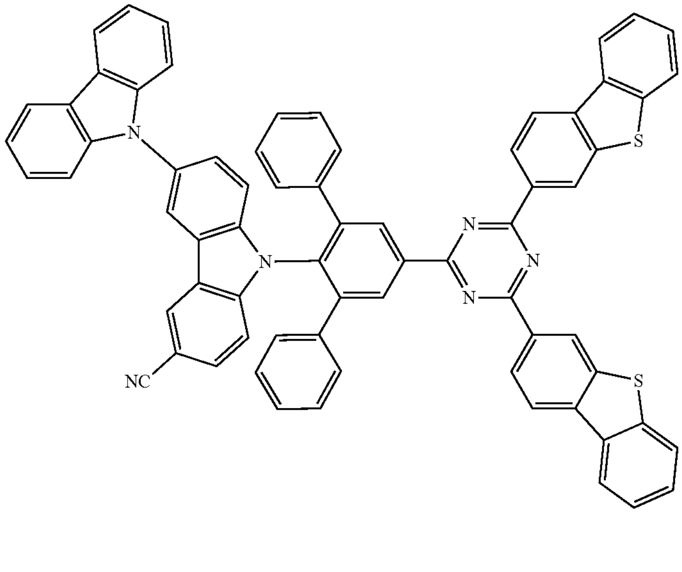

-continued
427
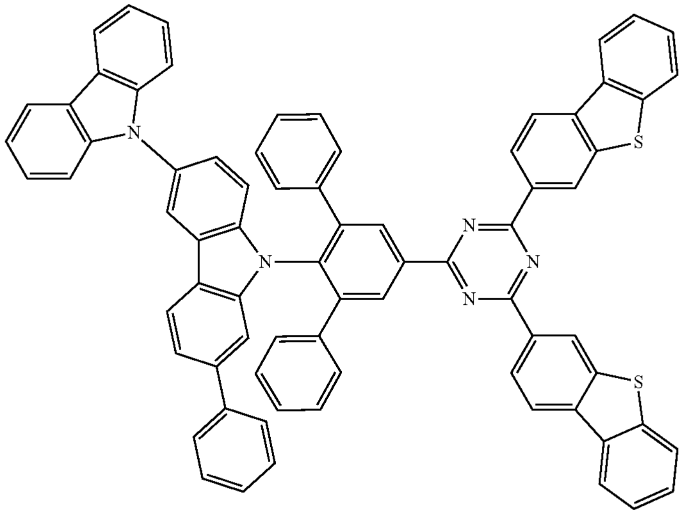
428
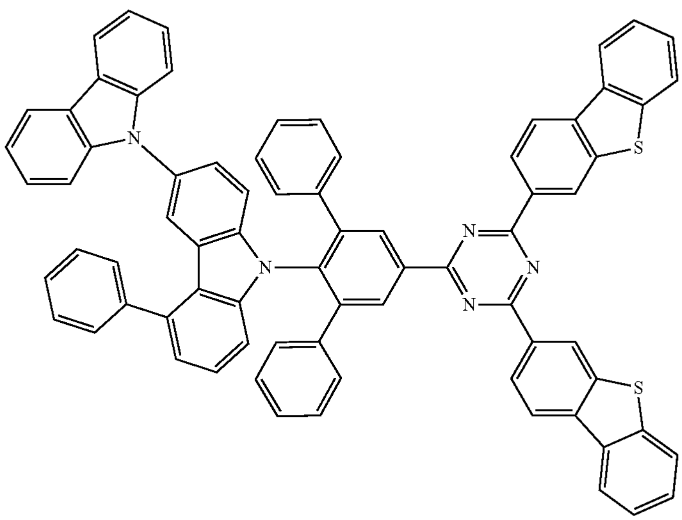
429
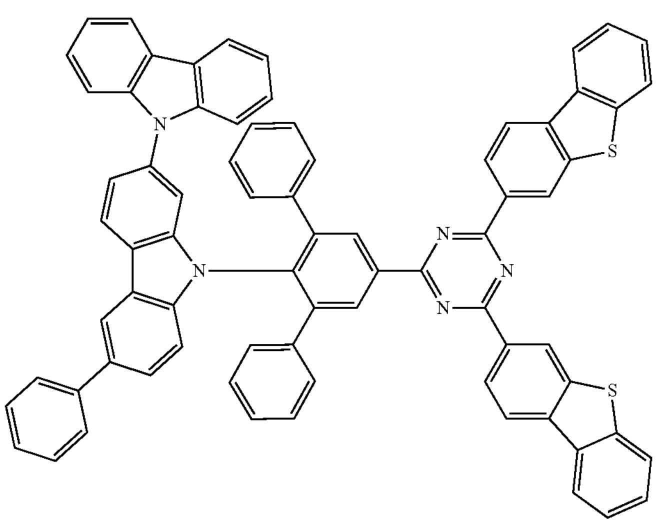

-continued
430
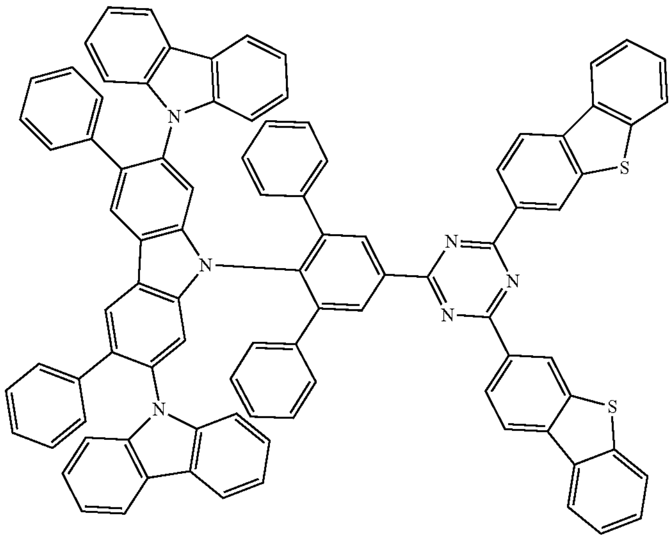
431
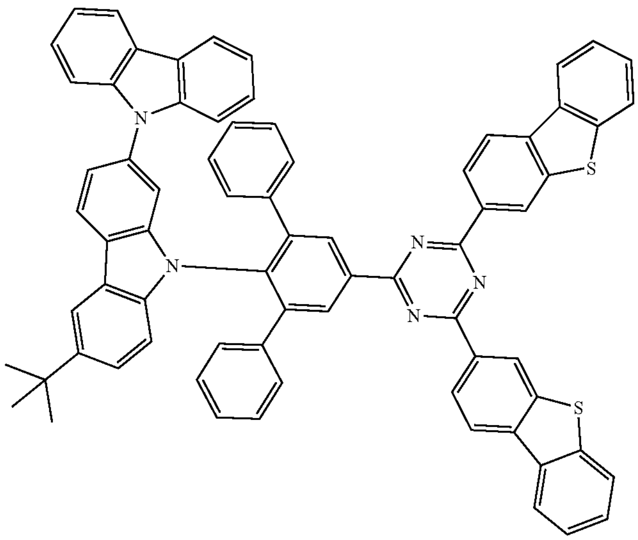
432
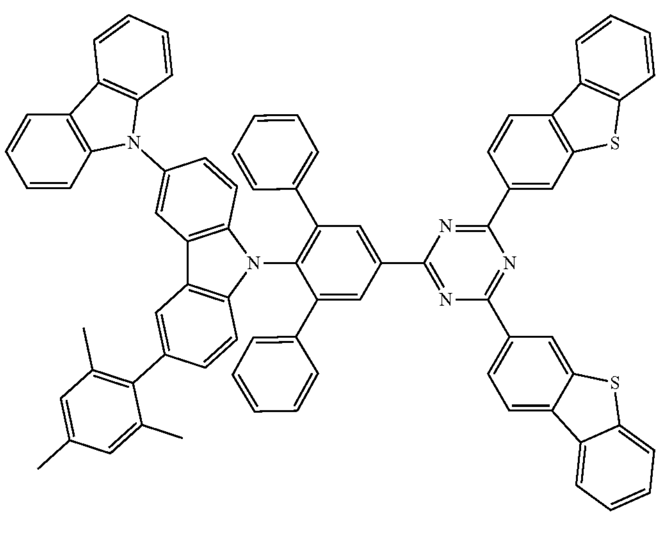

-continued
433
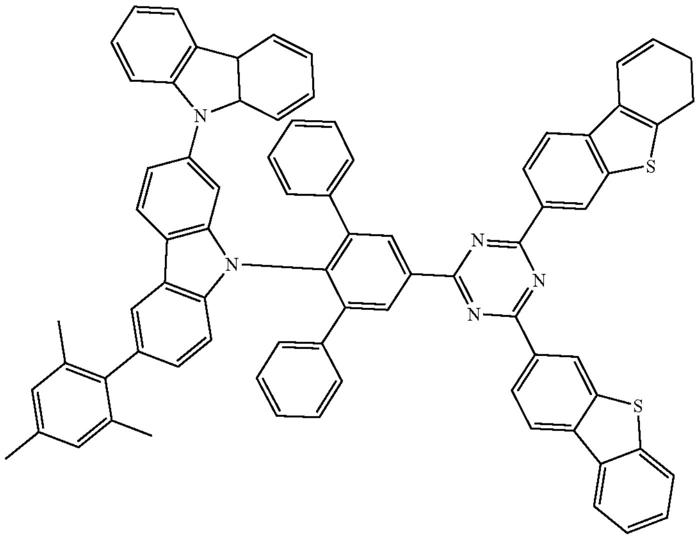
434
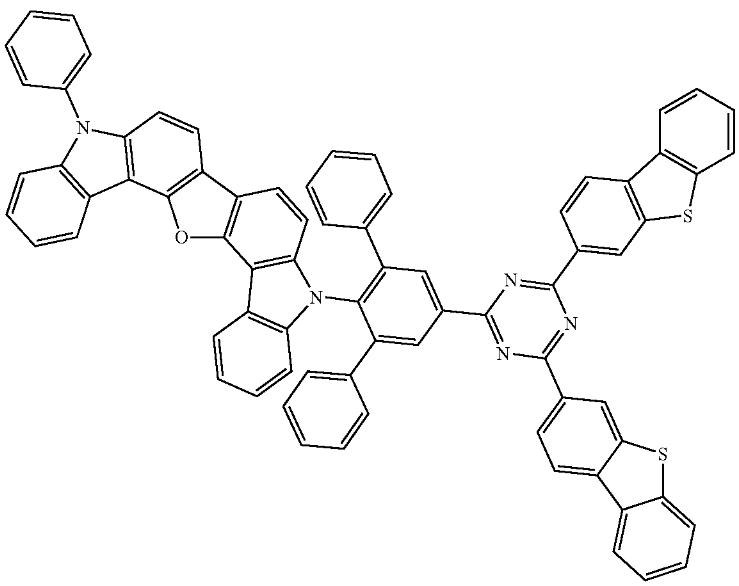
435
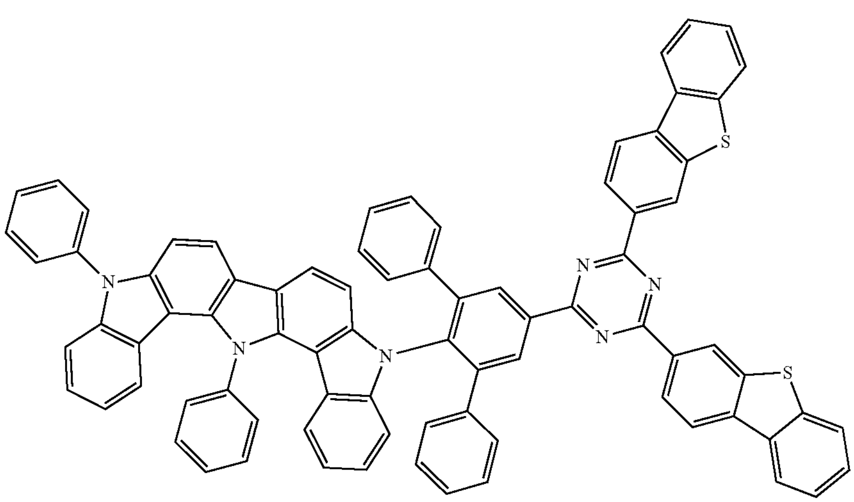

-continued
436
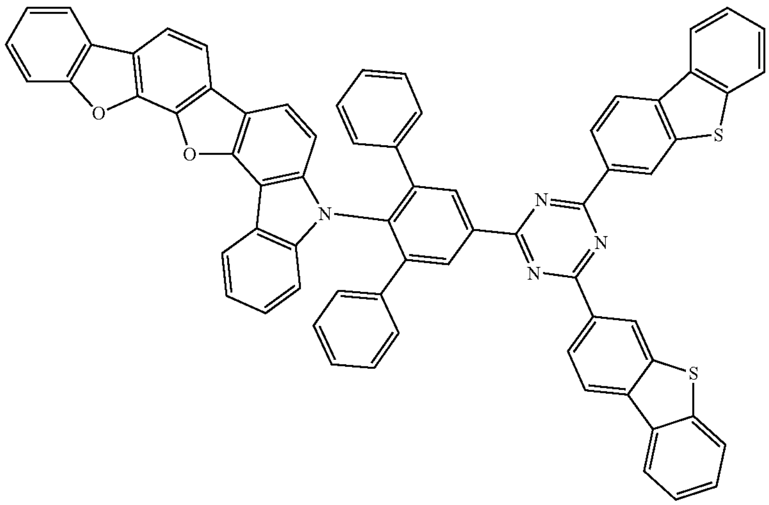
437
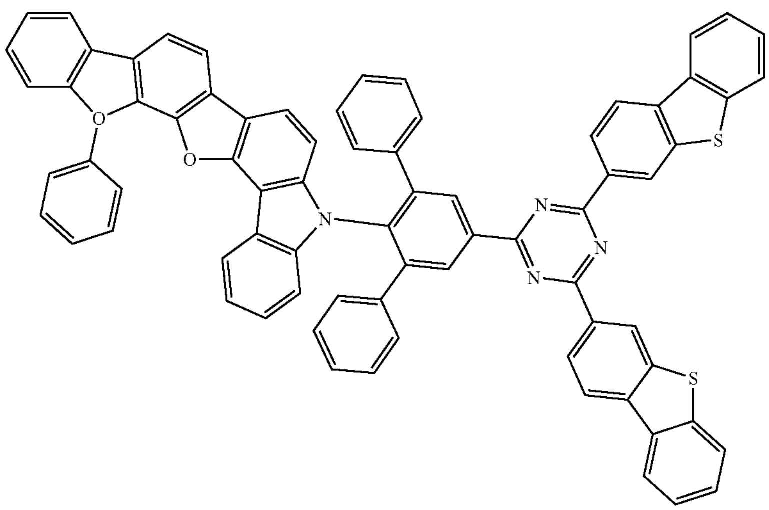
438
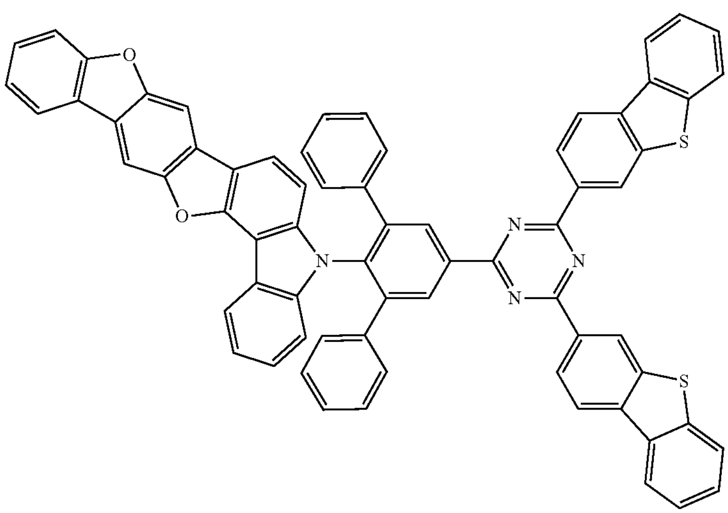

-continued
439
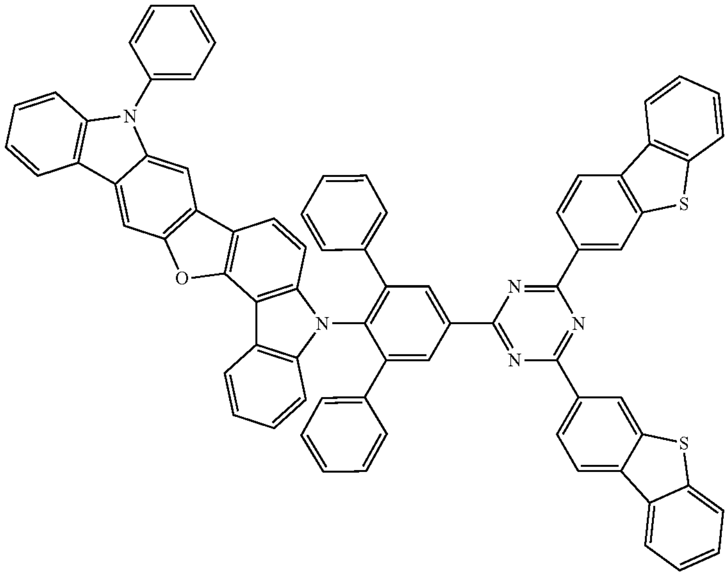
440
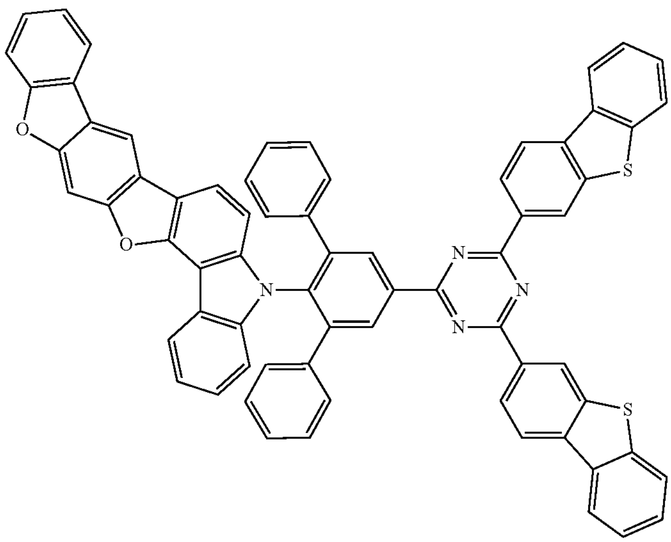
441
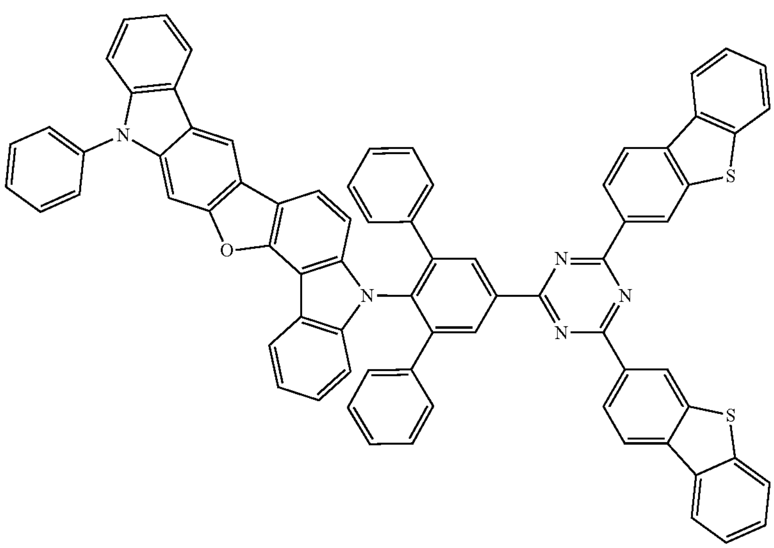

-continued
442
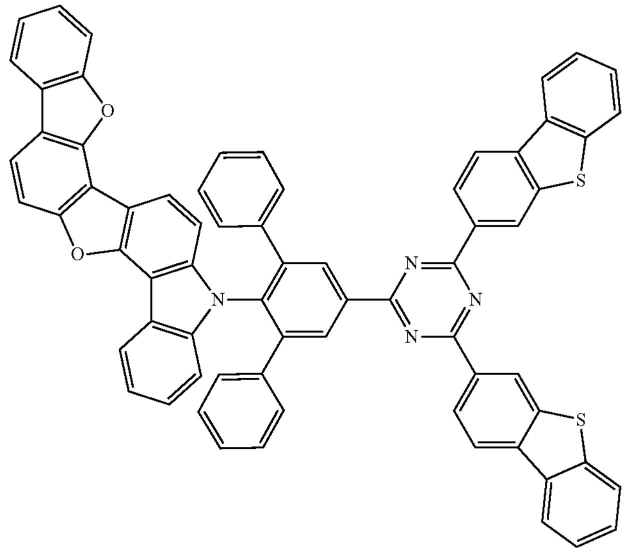
443
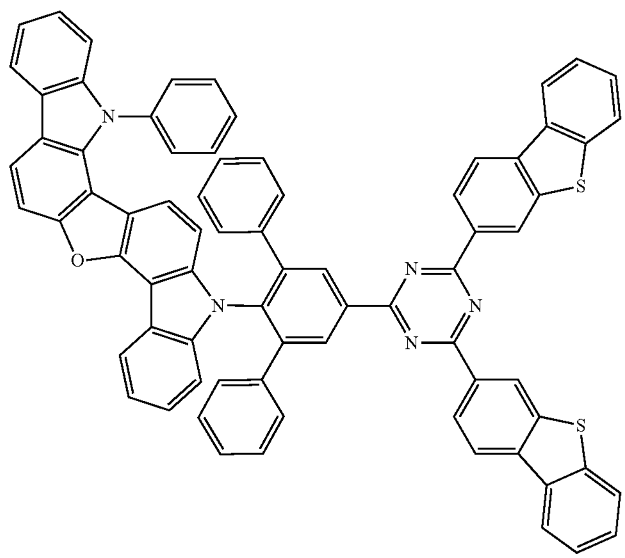
444
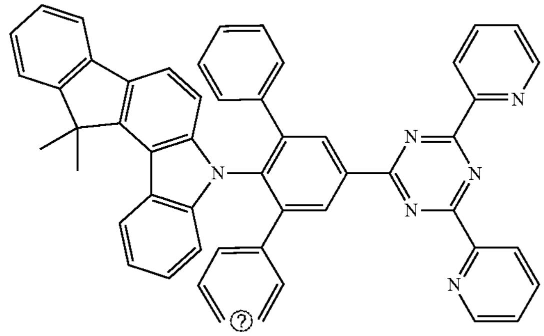

-continued
445
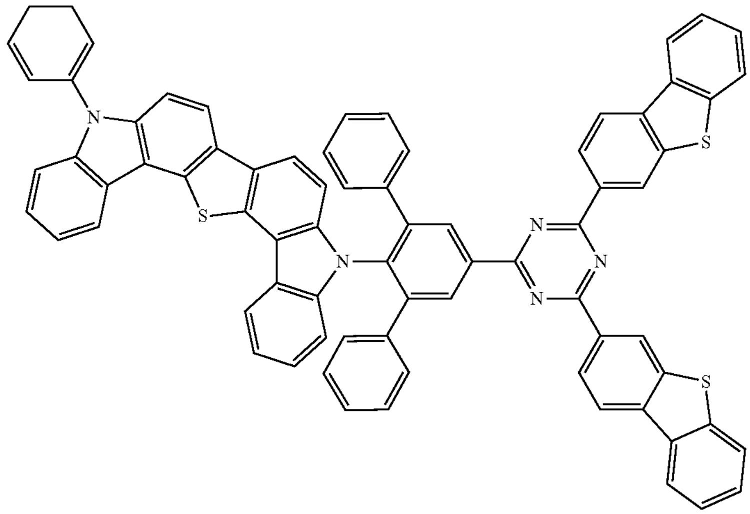
446
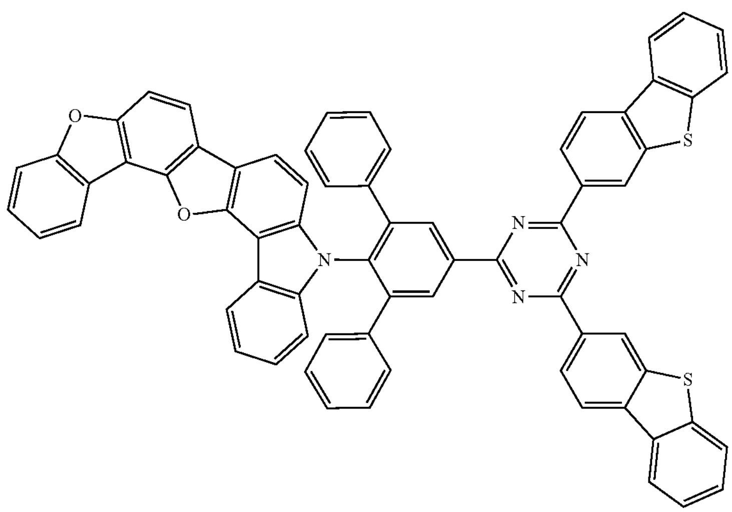
447
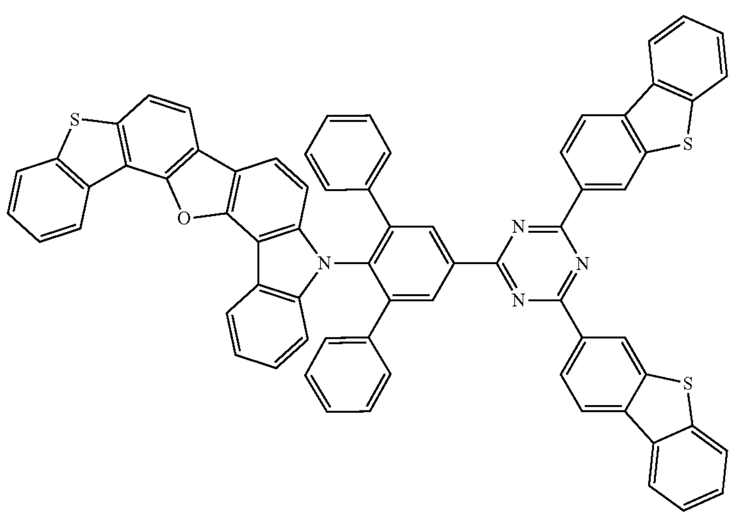

-continued
448
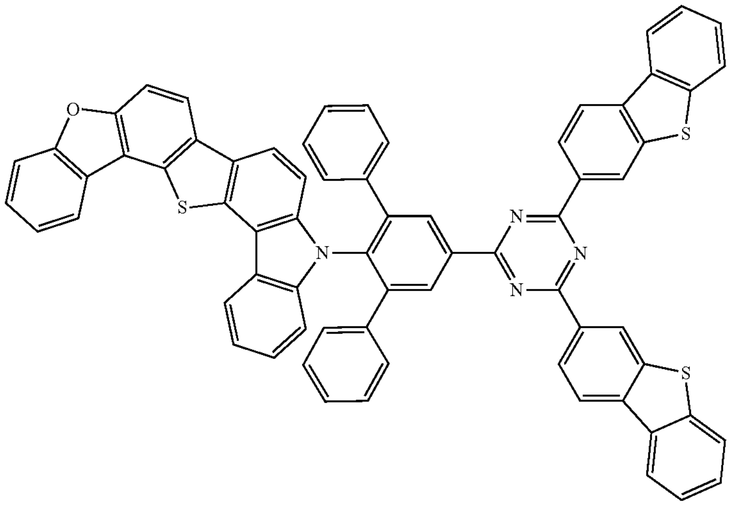
449
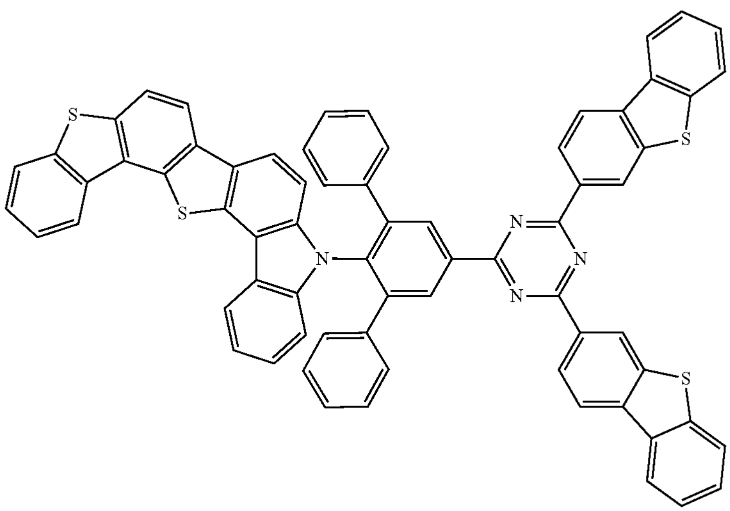
450
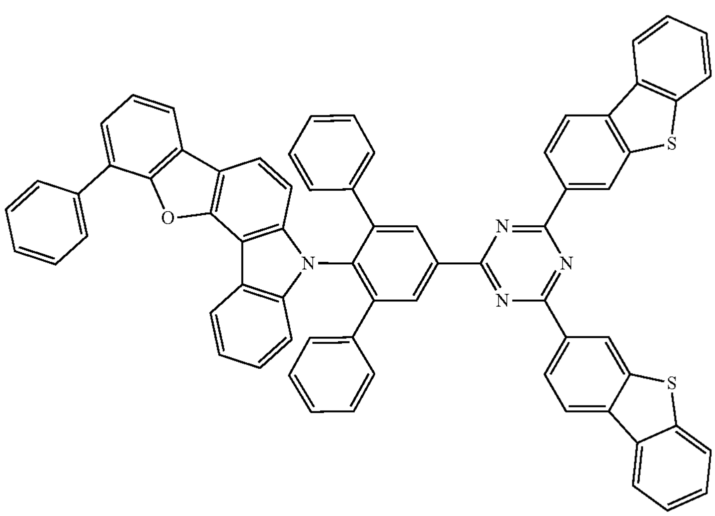

-continued
451
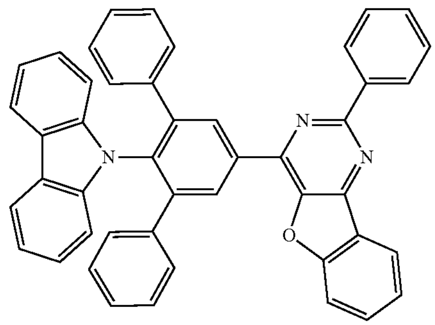
452
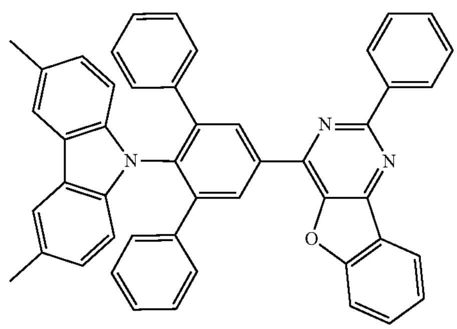
453
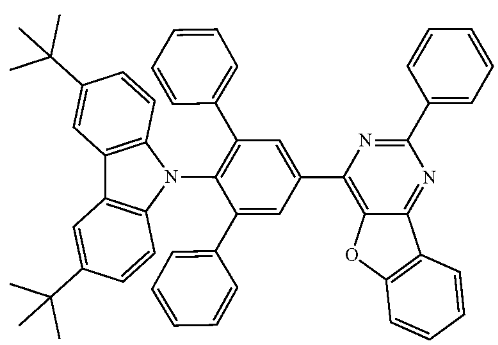
454
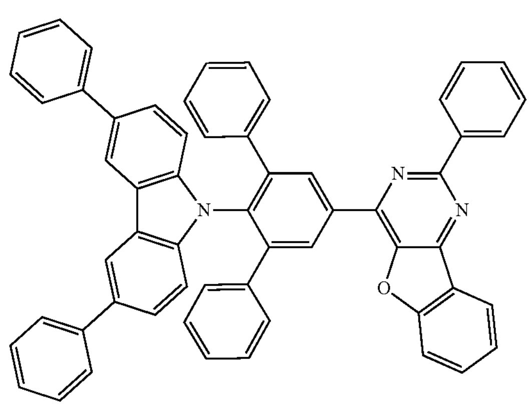

-continued
455
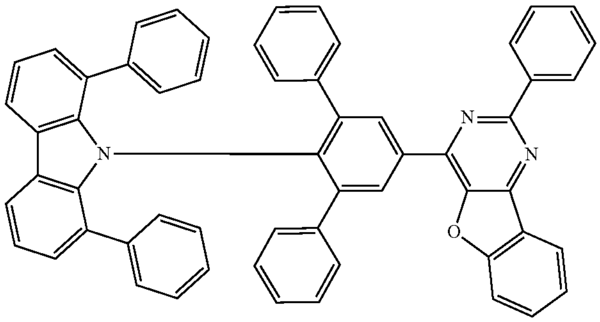
456
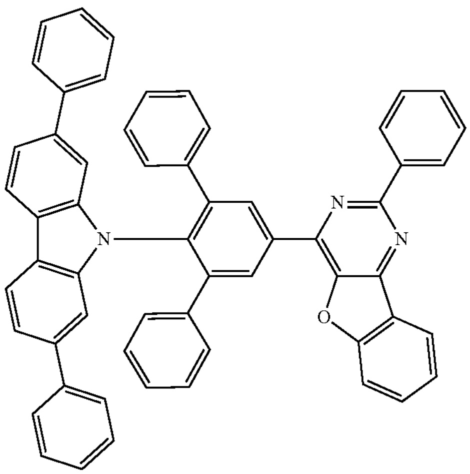
457
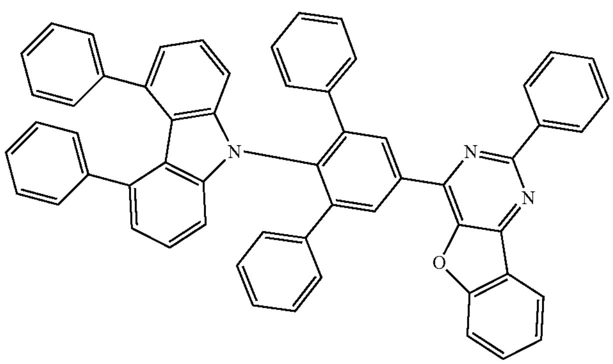
458
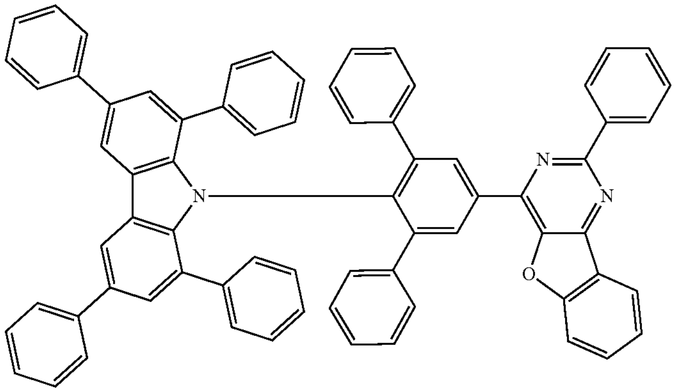

-continued
459
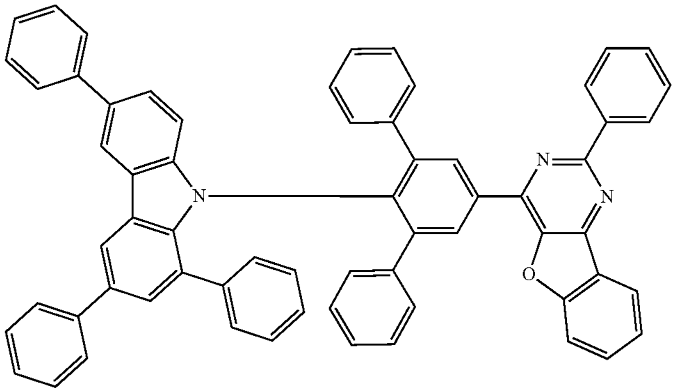
460
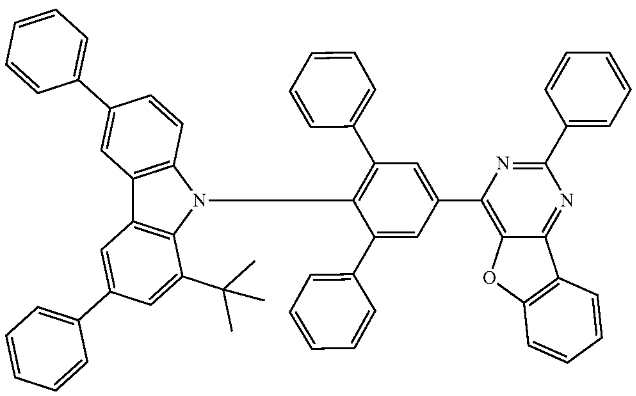
461
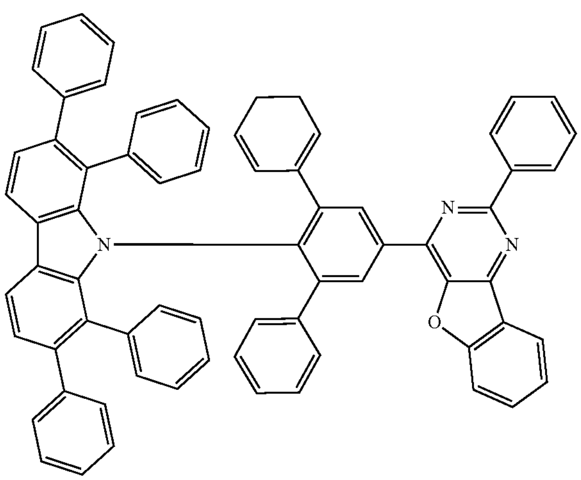
462
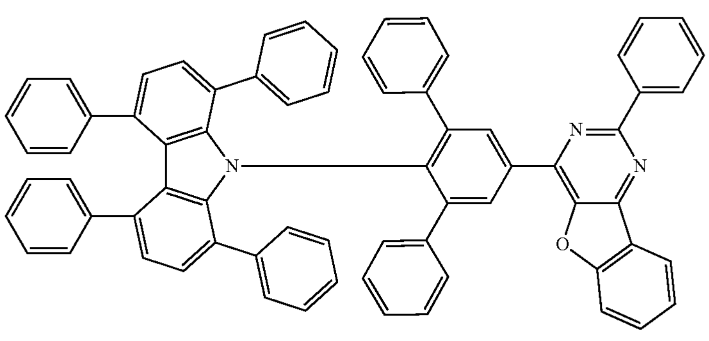

-continued
463
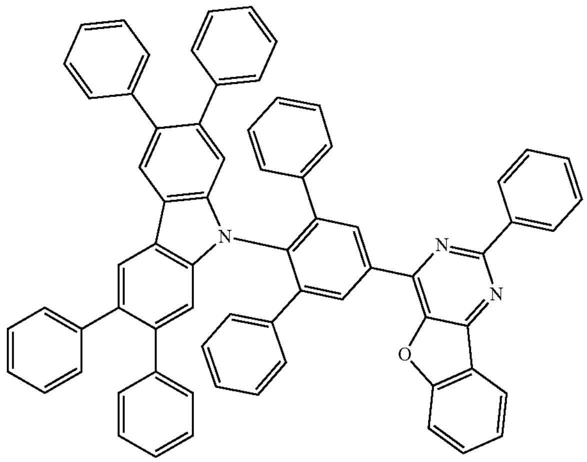
464
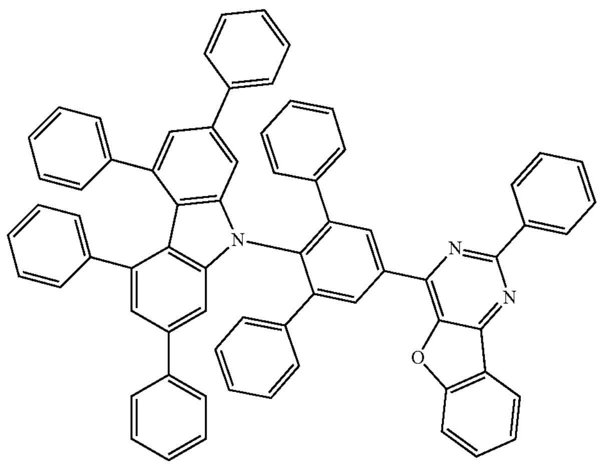
465
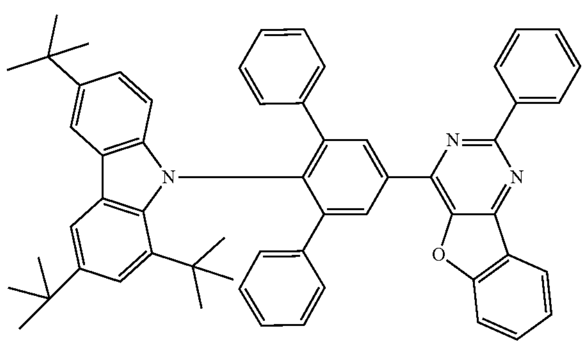
466
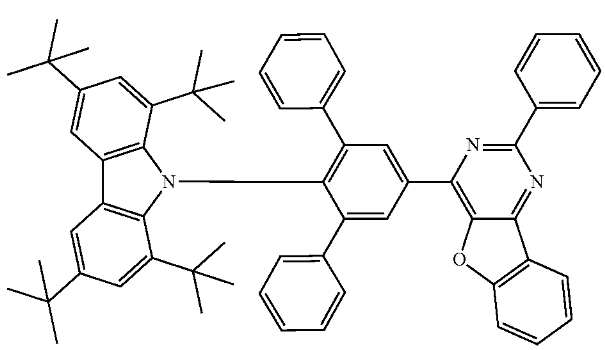

-continued
467
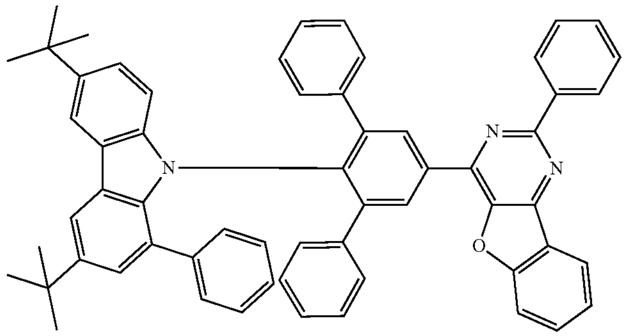
468
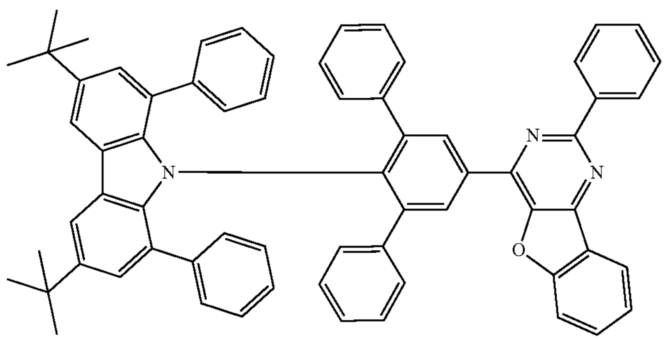
469
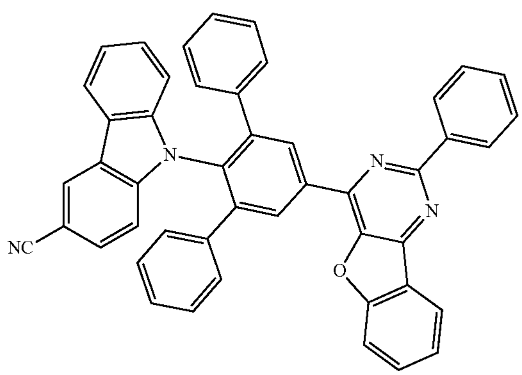
470
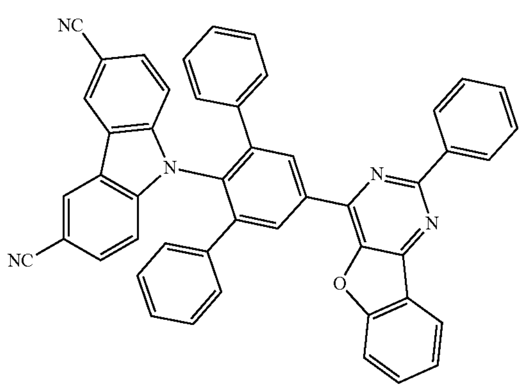

-continued
471
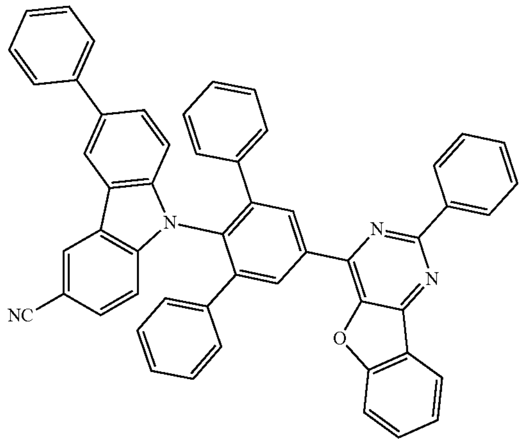
472
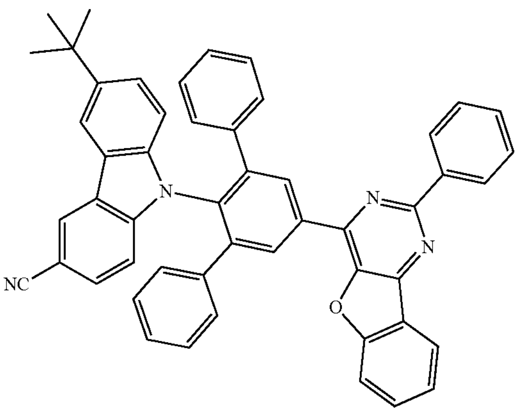
473
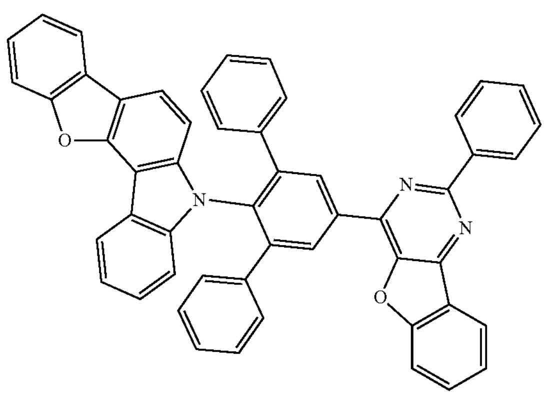
474
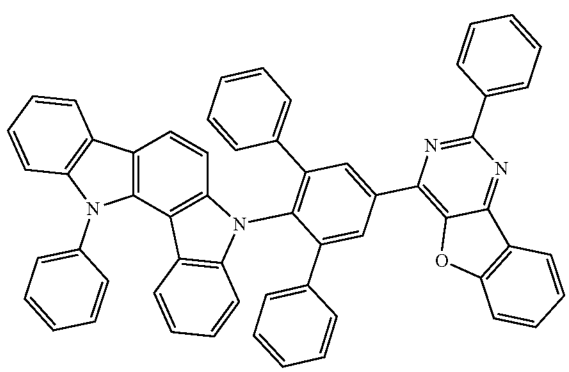

-continued
475
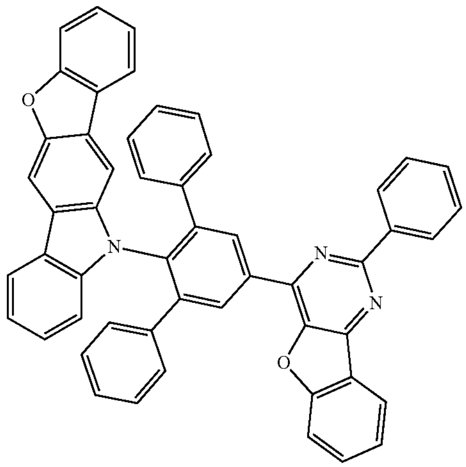
476
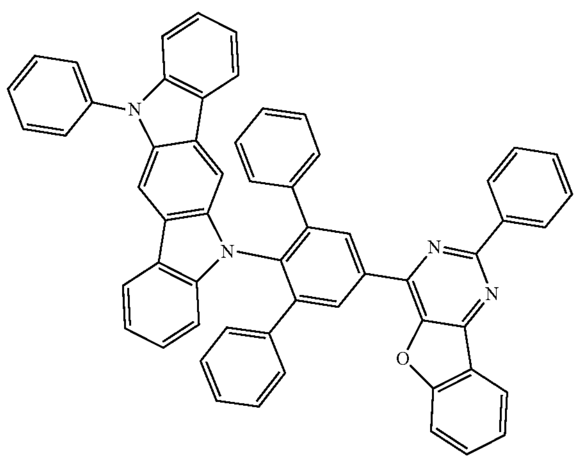
477
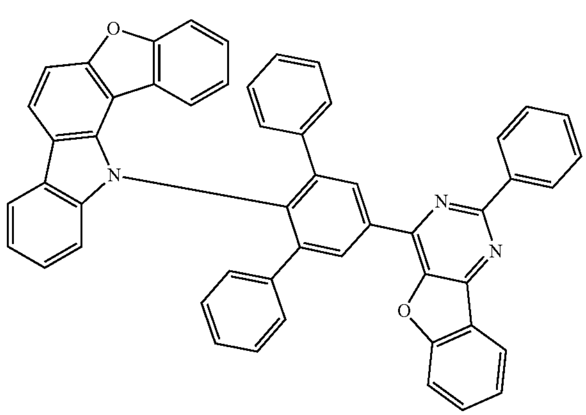

-continued
478
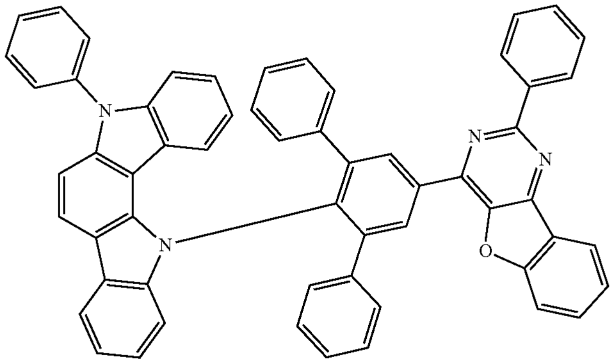
479
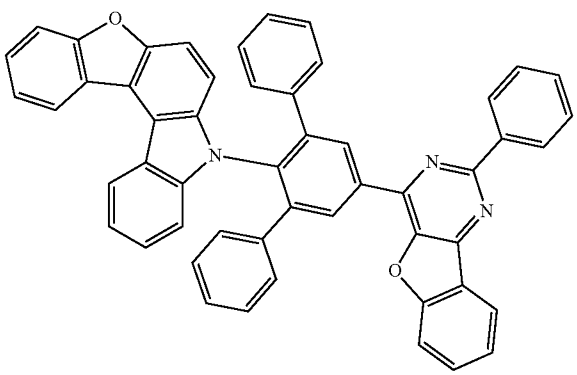
480
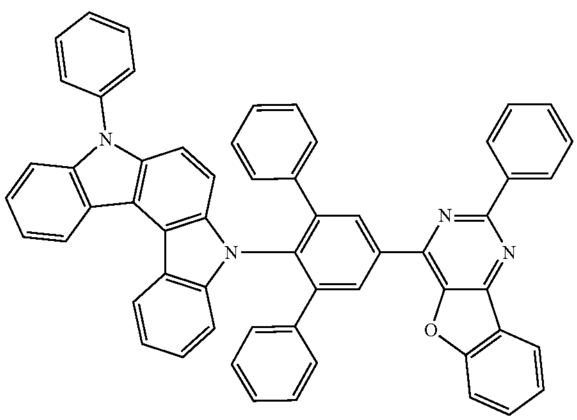
481
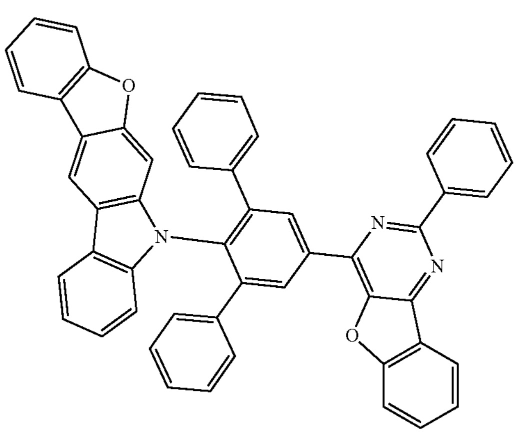

-continued
482
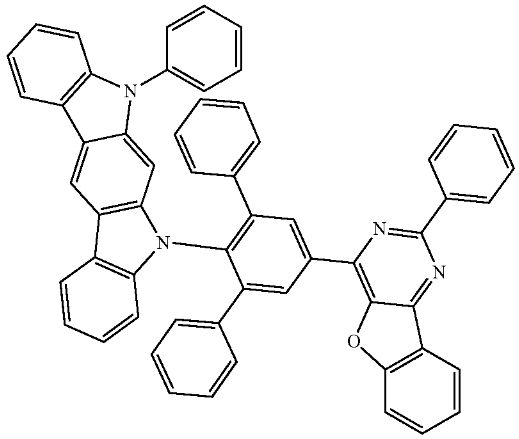
483
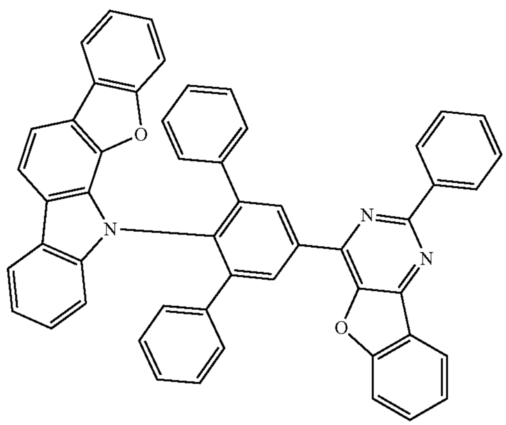
484
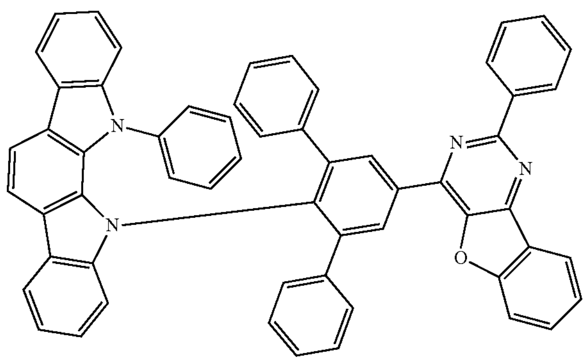
485
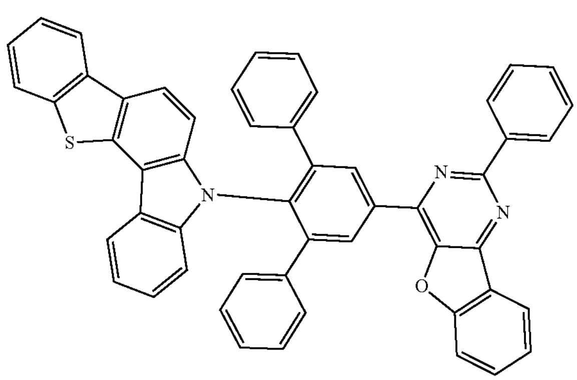

-continued
486
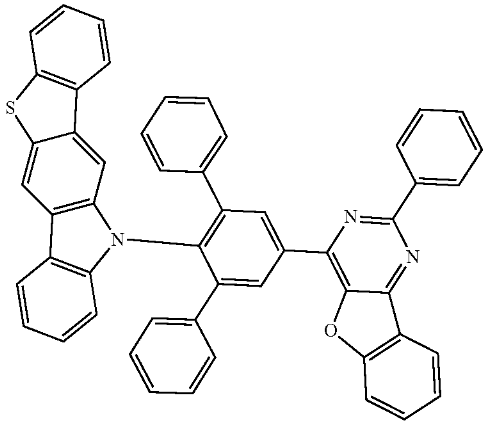
487
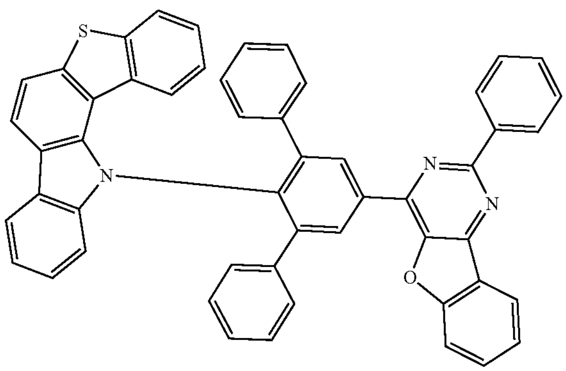
488
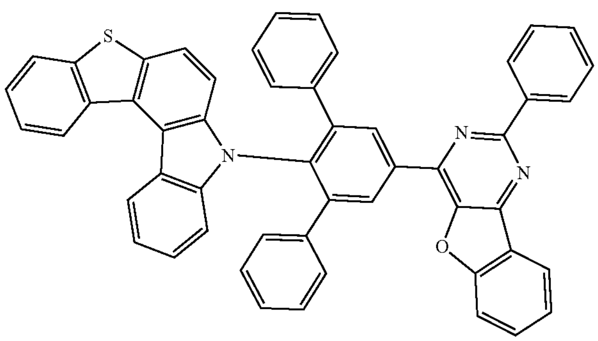
489
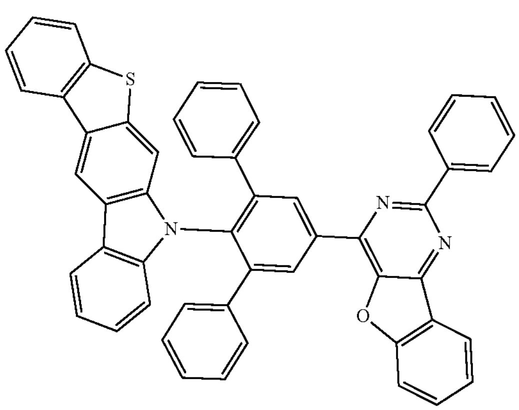

-continued
490
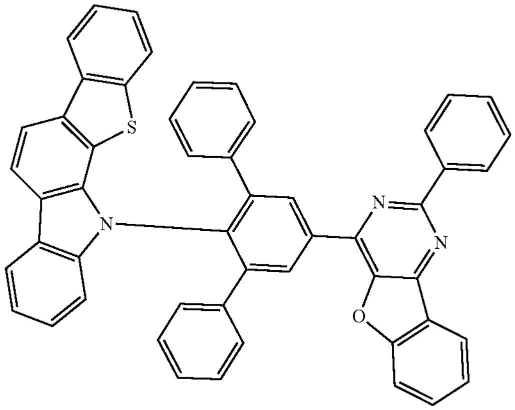
491
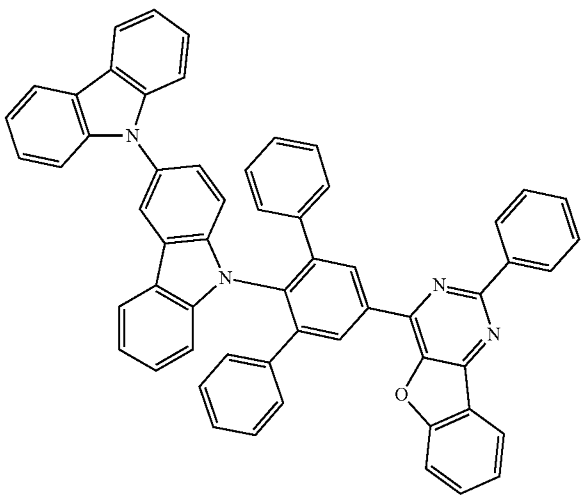
492
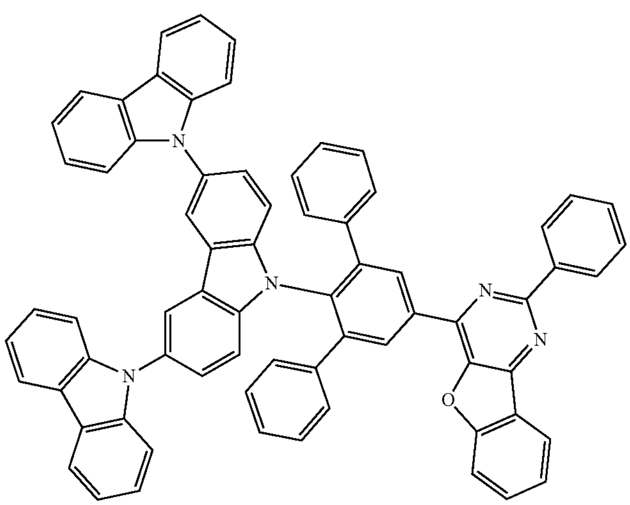

-continued
493
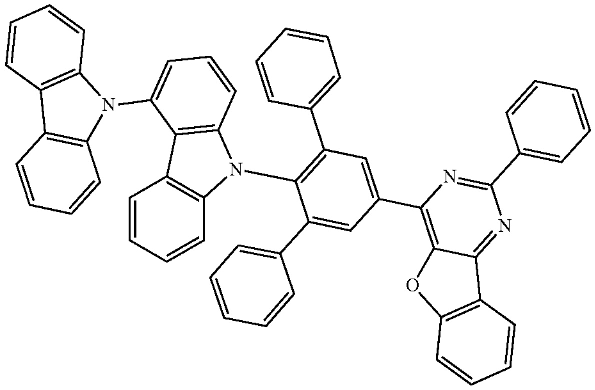
494
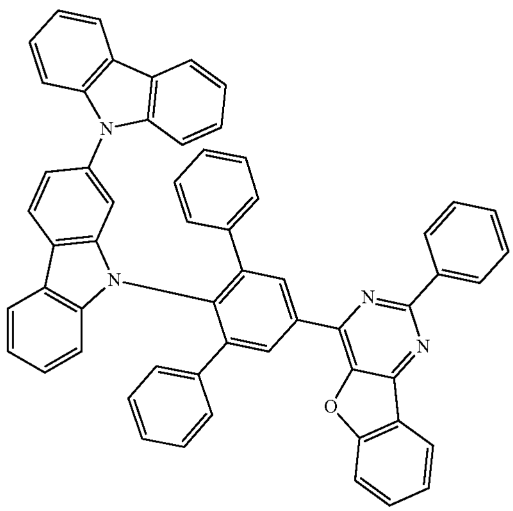
495
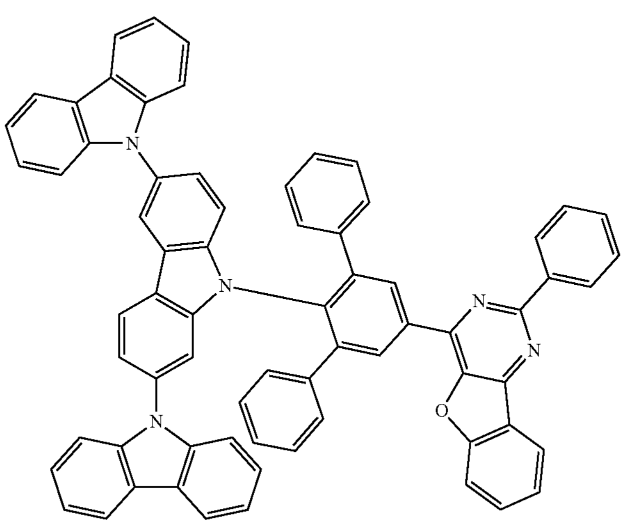

-continued
496
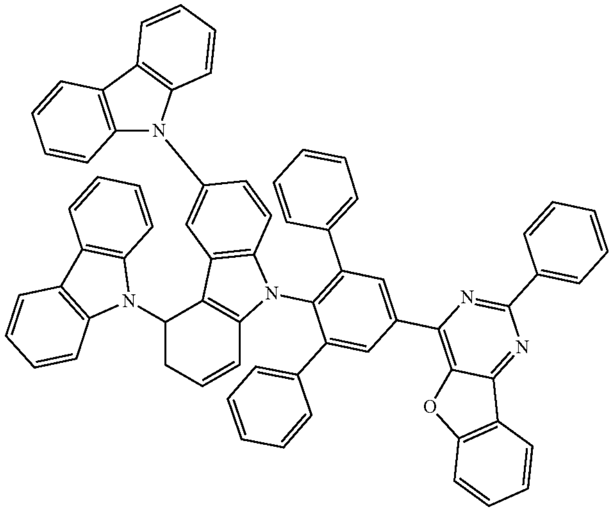
497
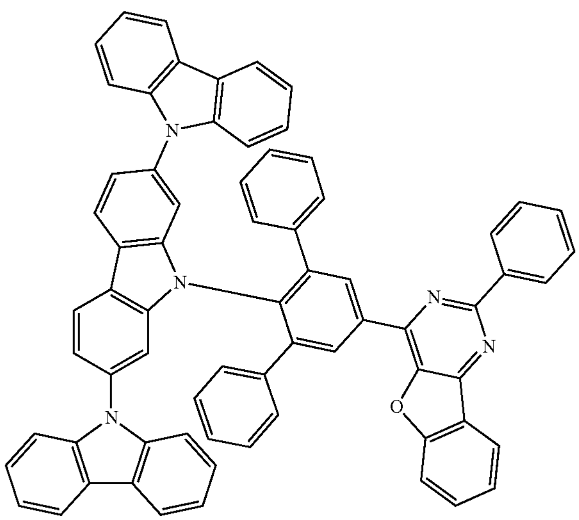
498
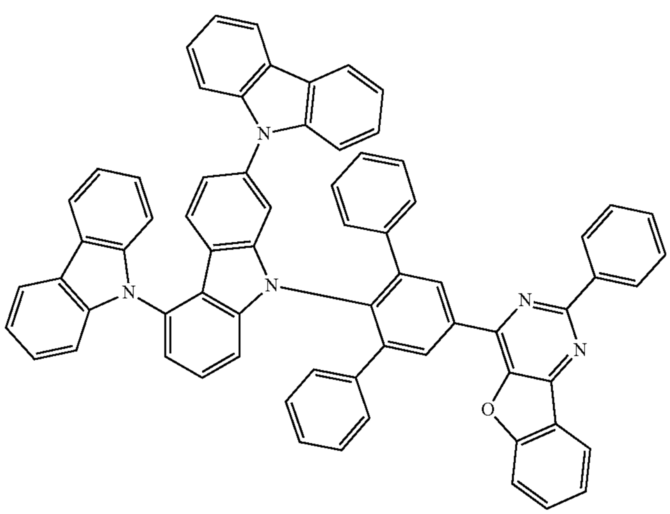

-continued
499
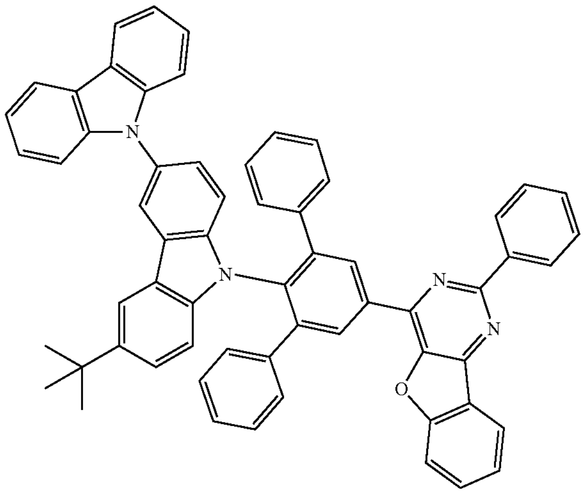
500
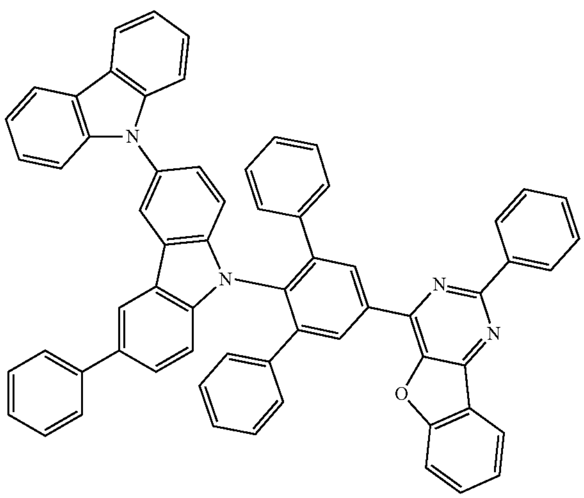
501
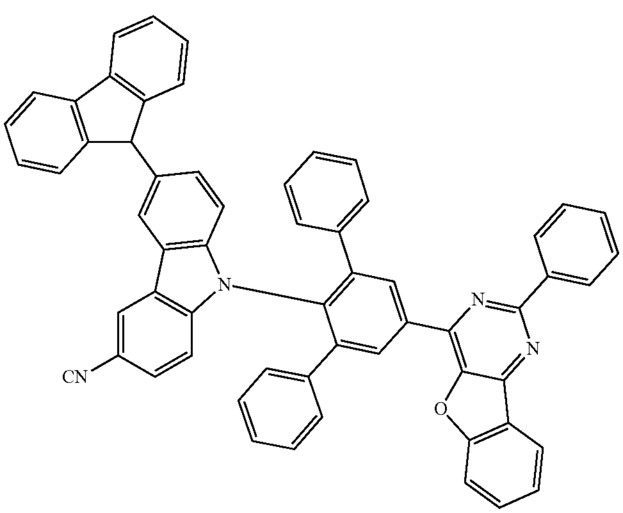

-continued
502
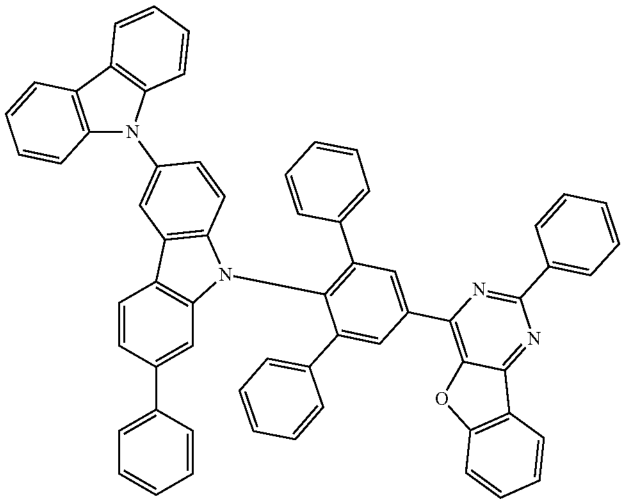
503
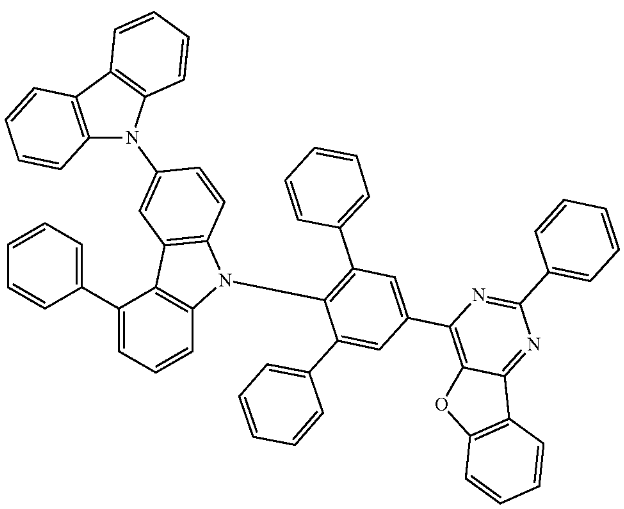
504
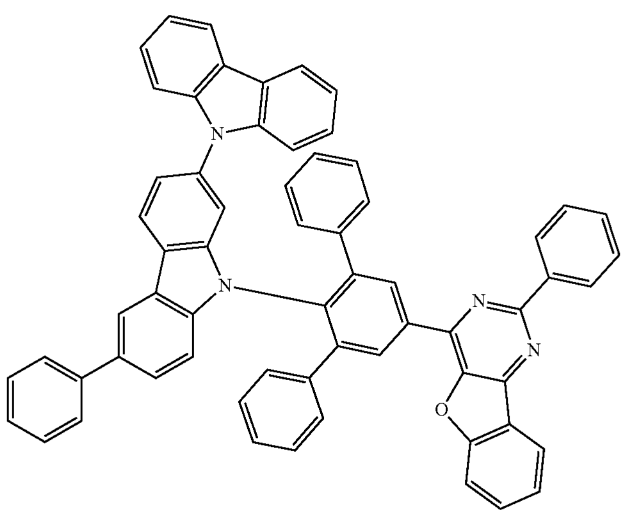

-continued
505
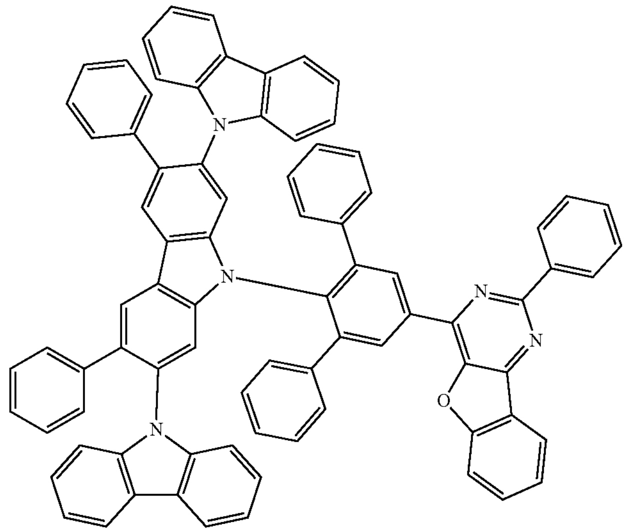
506
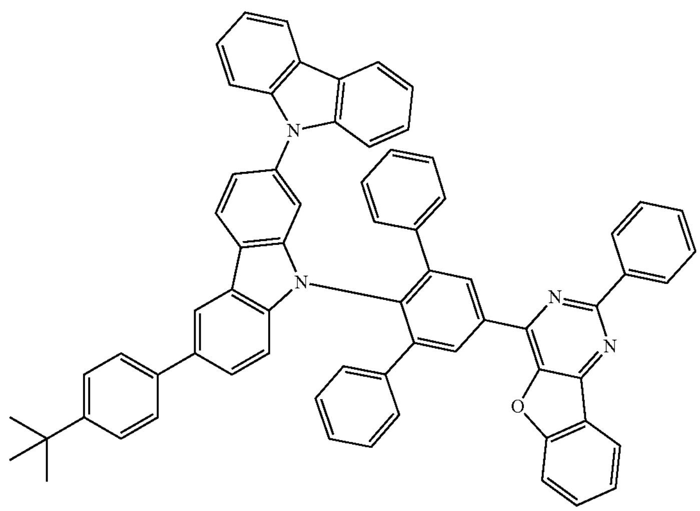
507
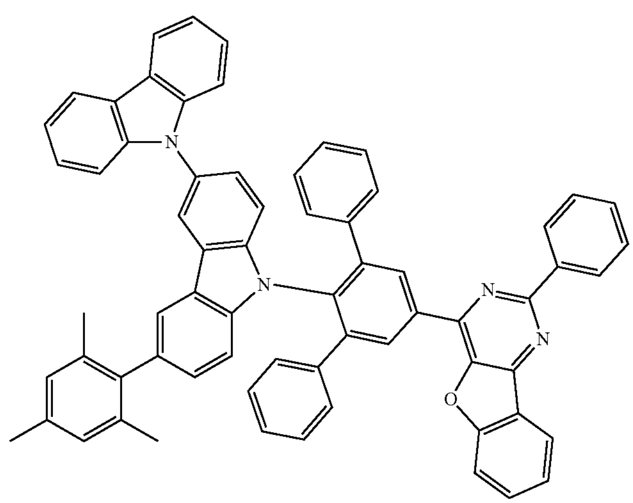

-continued
508
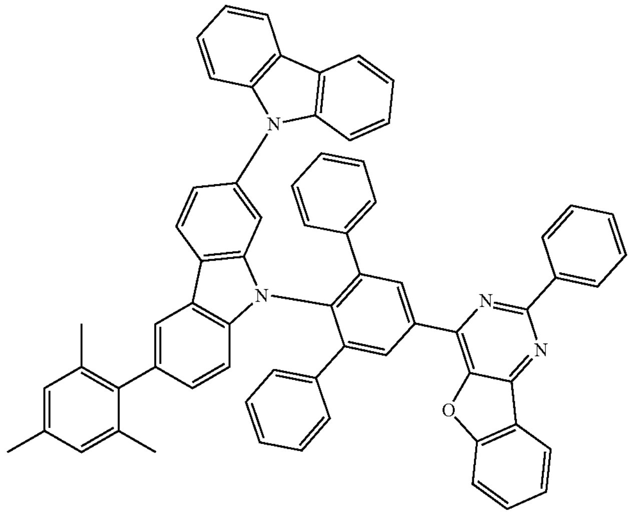
509
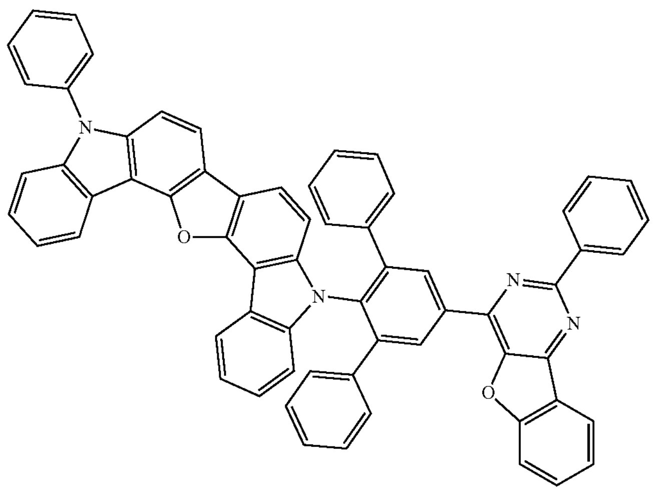
510
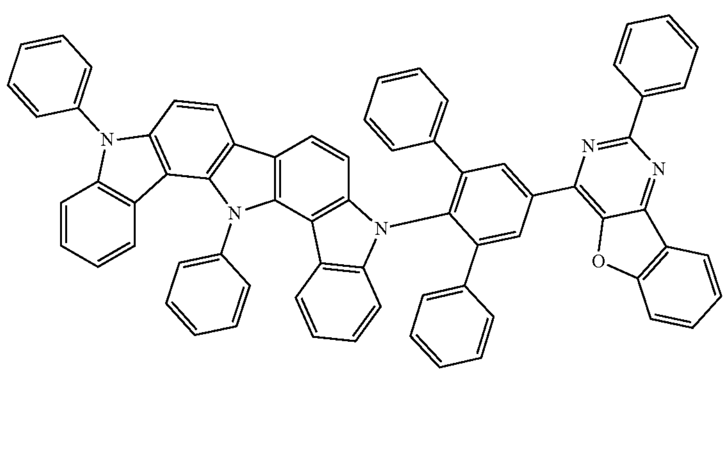

-continued
511
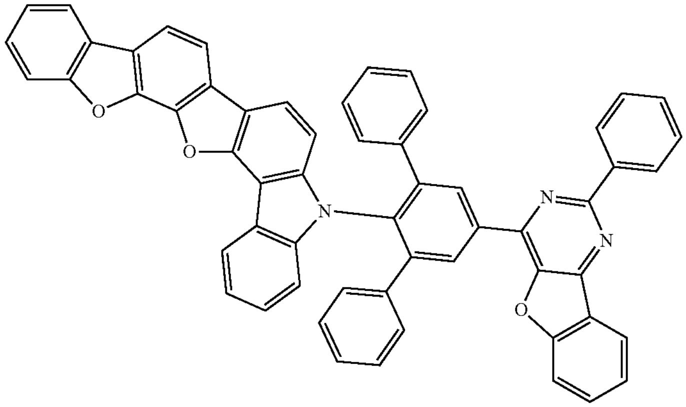
512
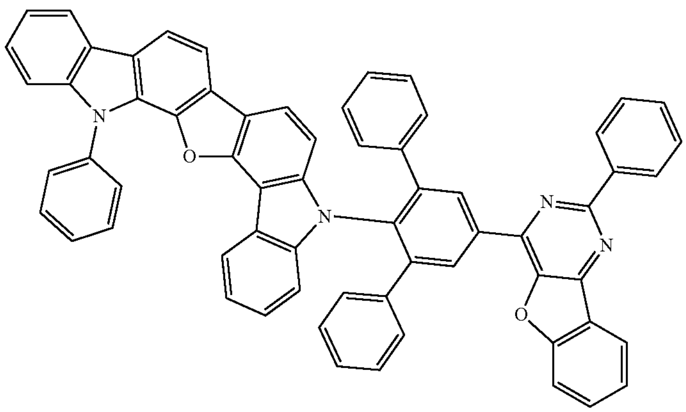
513
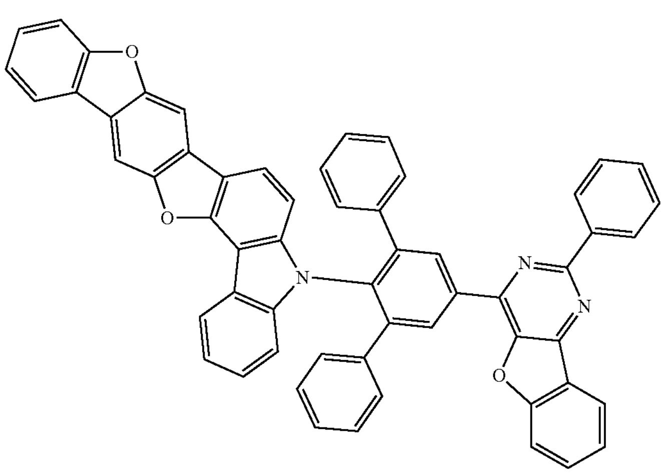

-continued
514
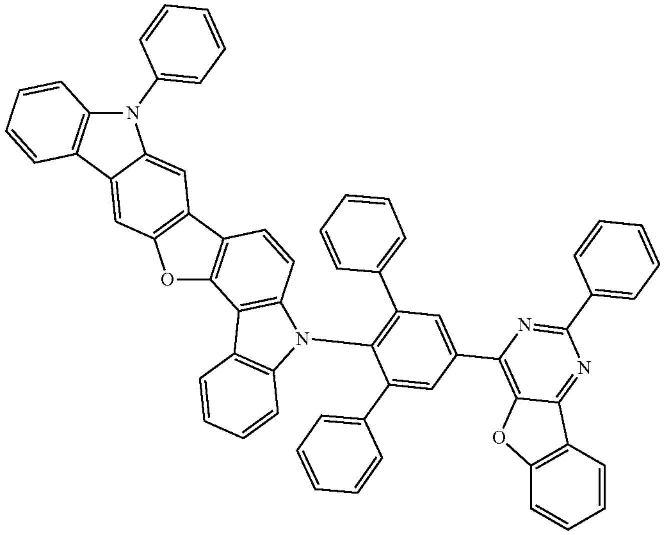
515
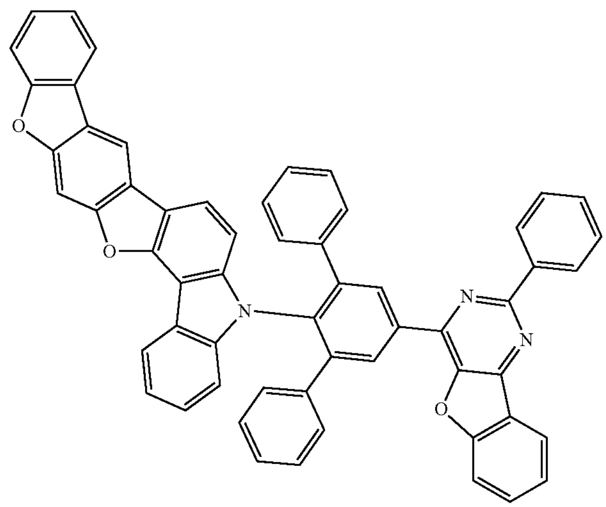
516
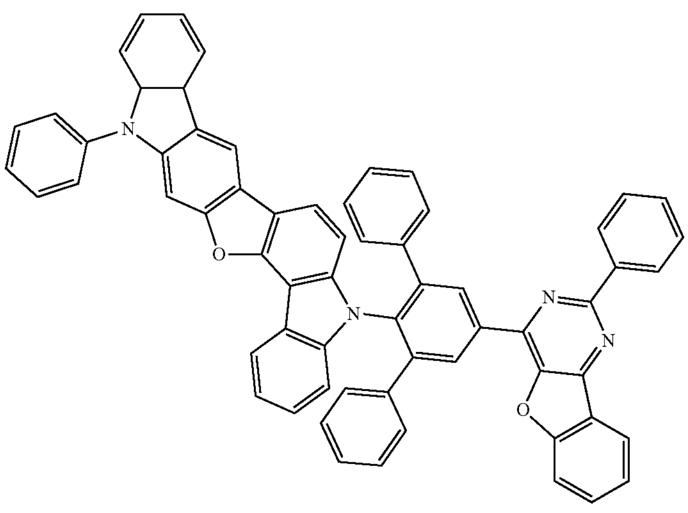

-continued
517
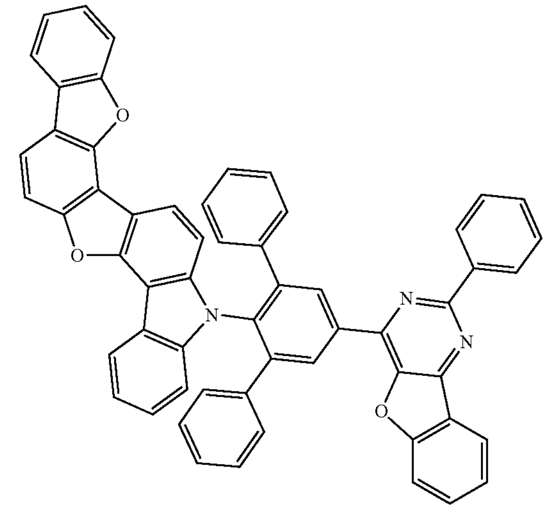
518
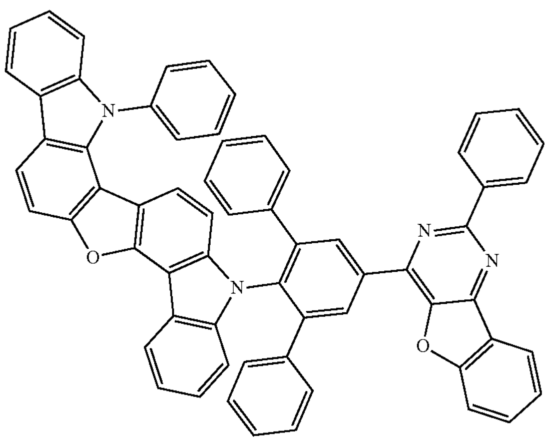
519
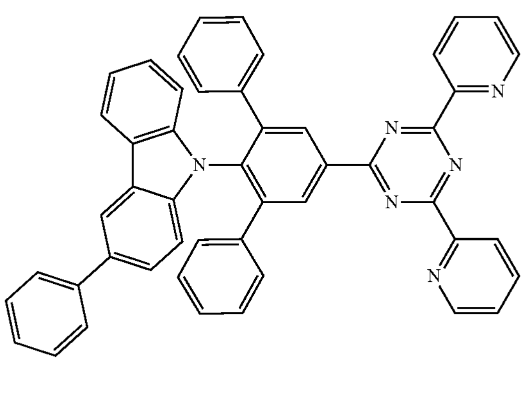

-continued
520
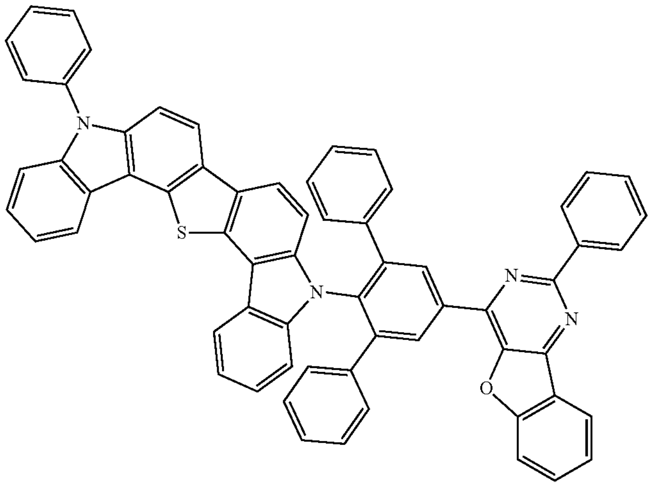
521
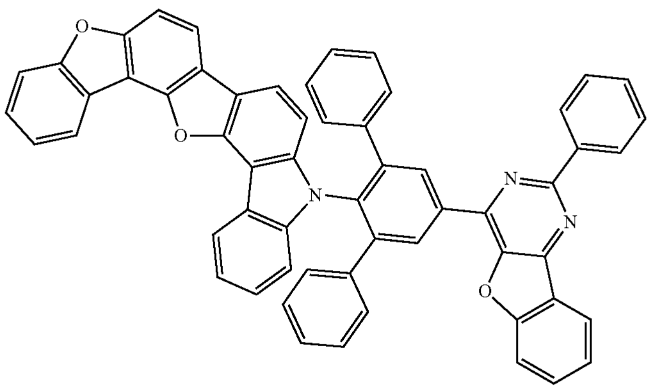
522
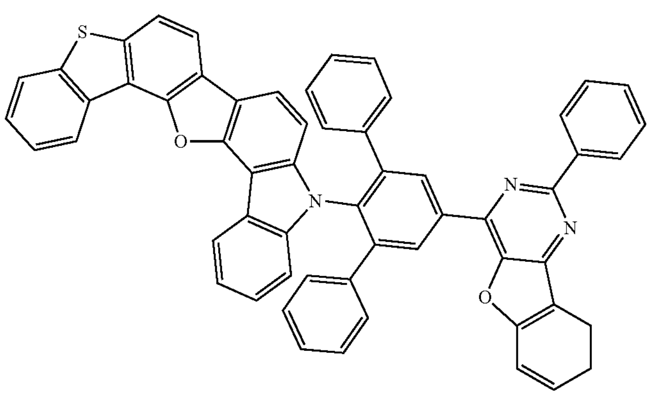
523
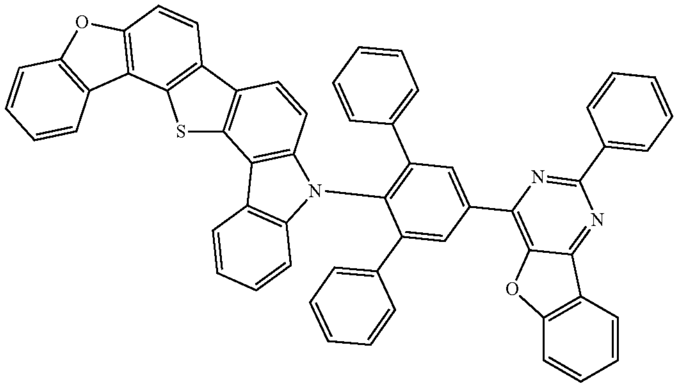

-continued
524
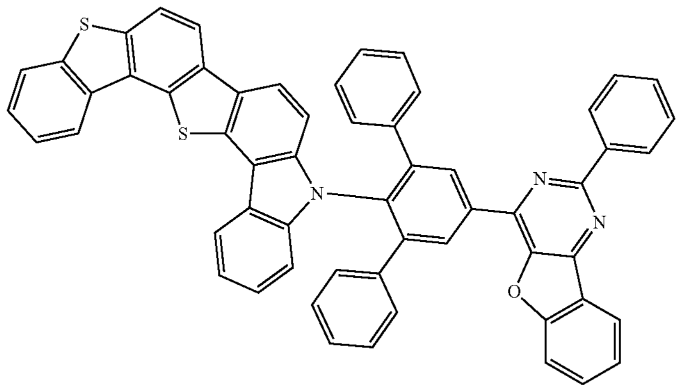
525
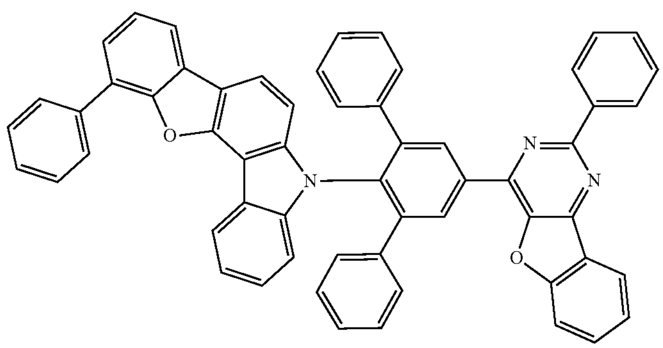
526
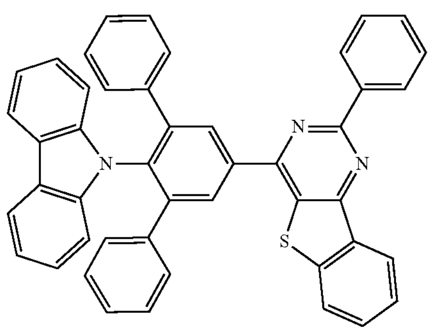
527
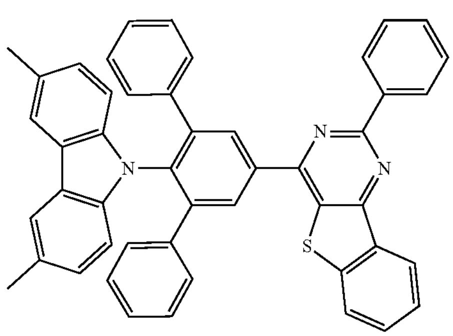

-continued
528
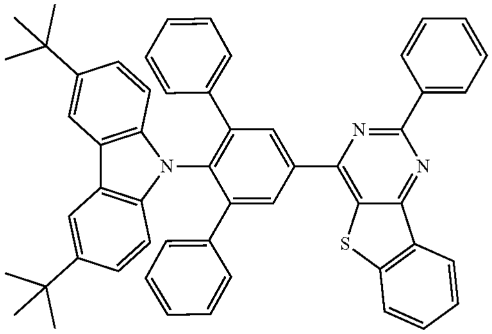
529
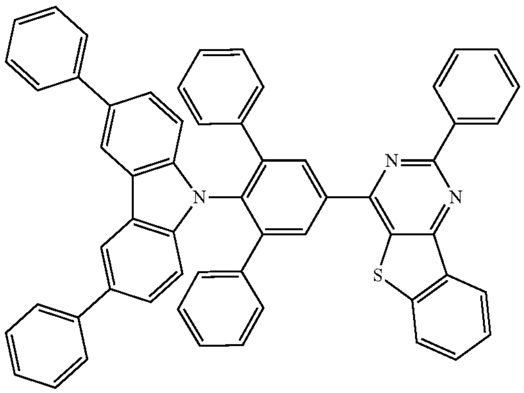
530
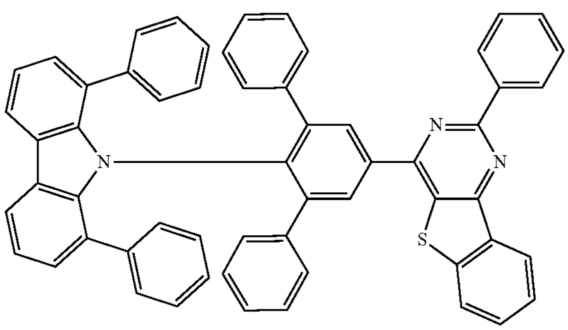
531
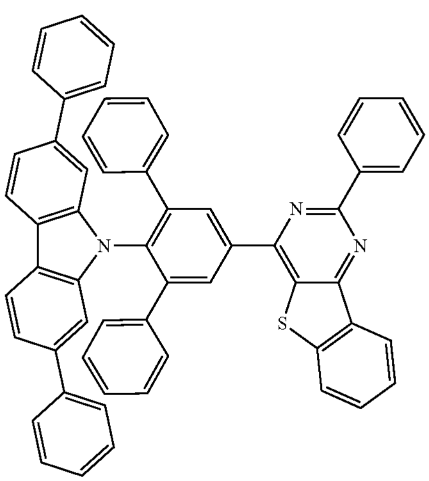

-continued
532
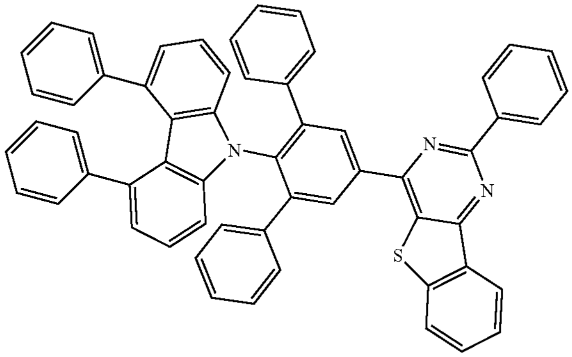
533
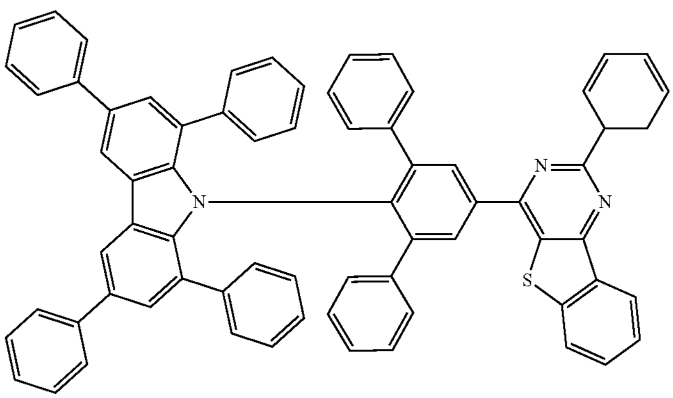
534
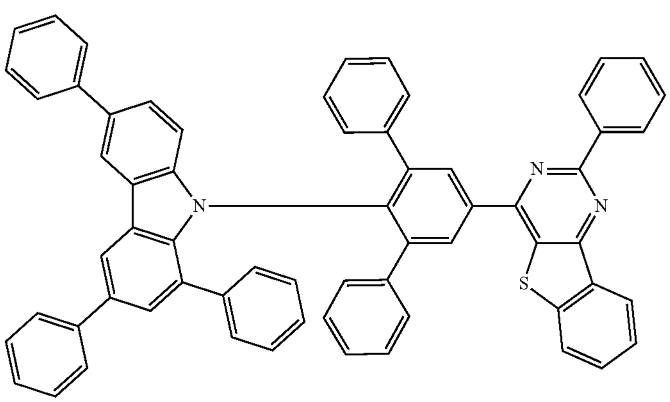
535
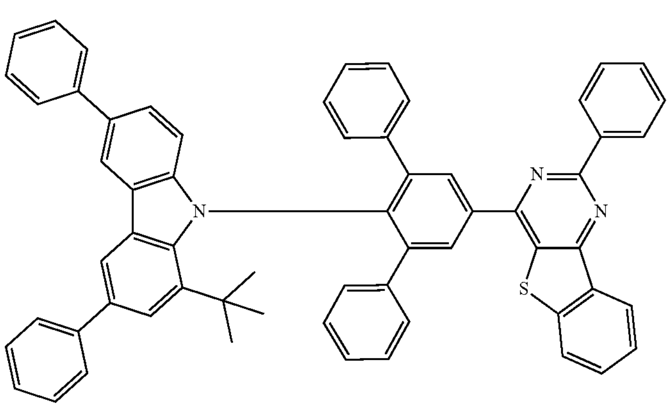

-continued
536
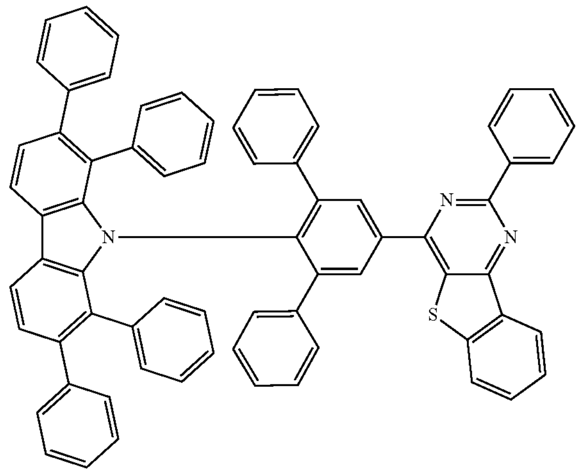
537
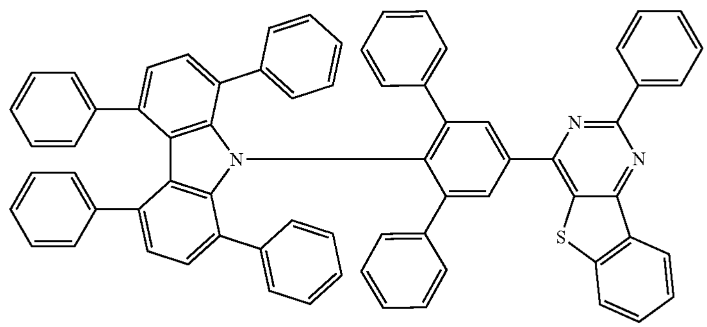
538
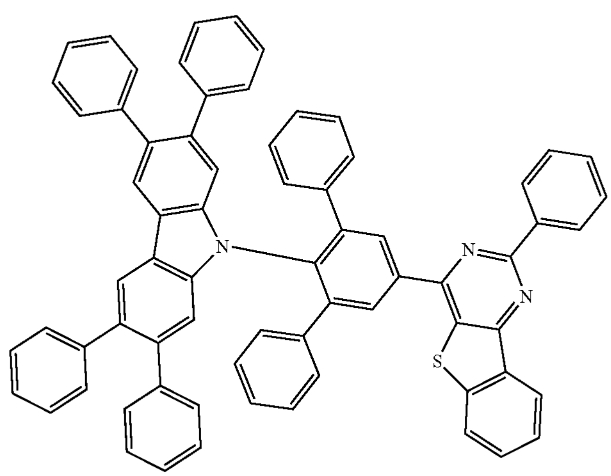

-continued
539
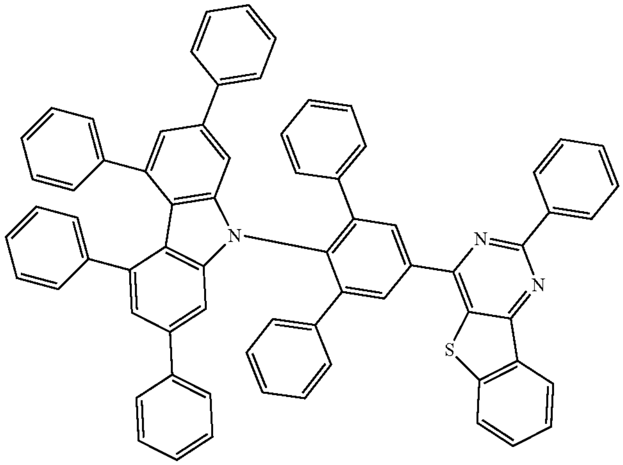
540
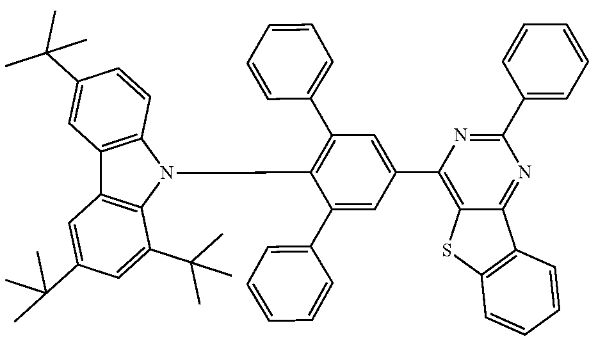
541
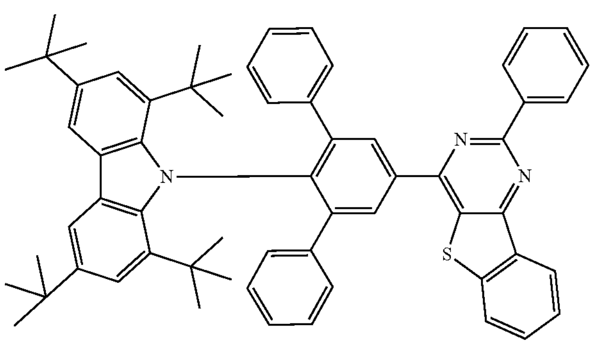
542
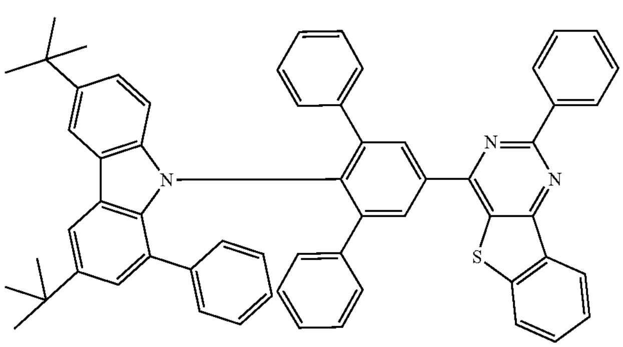

-continued
543
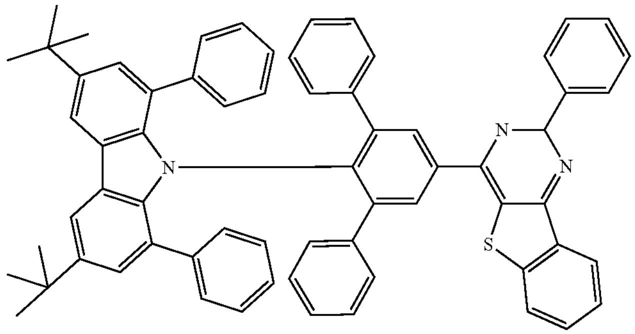
544
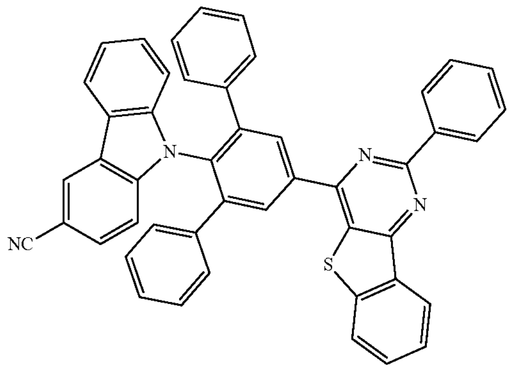
545
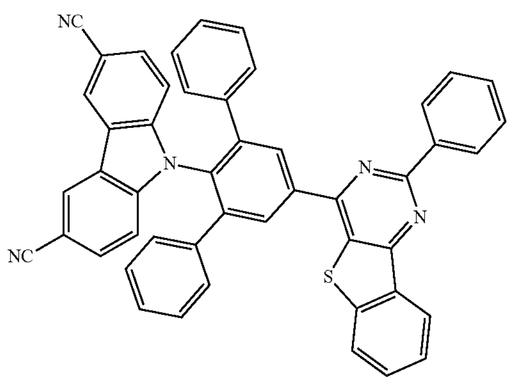
546
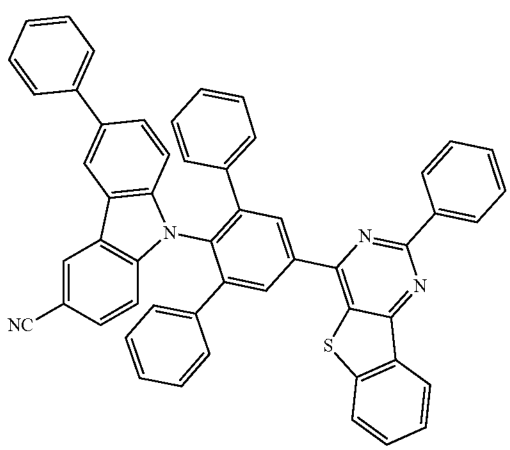

-continued
547
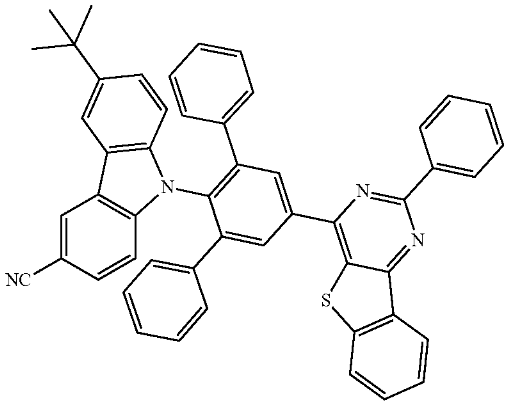
548
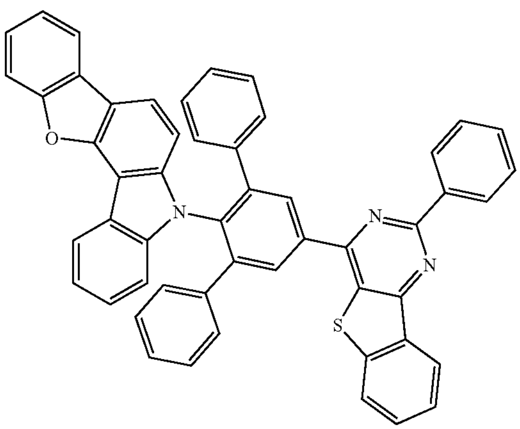
549
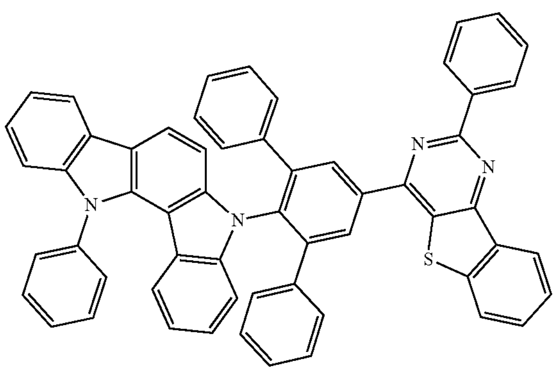
550
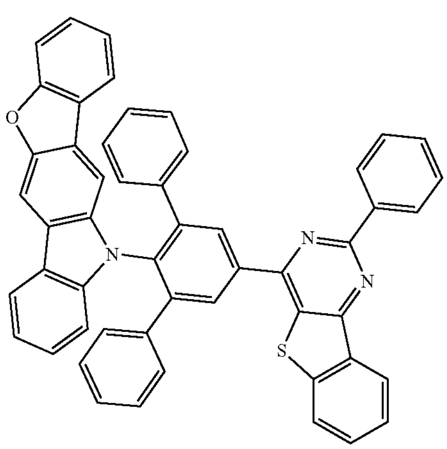

-continued
551
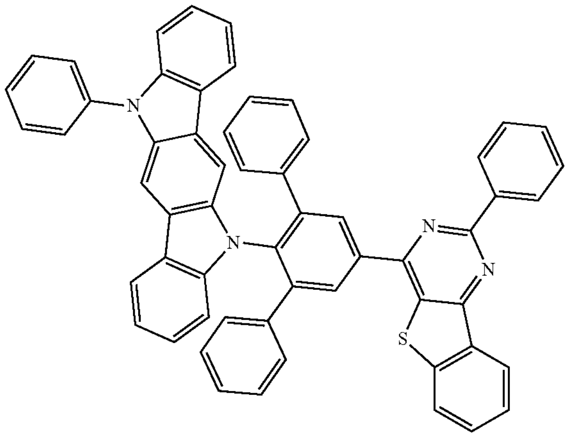
552
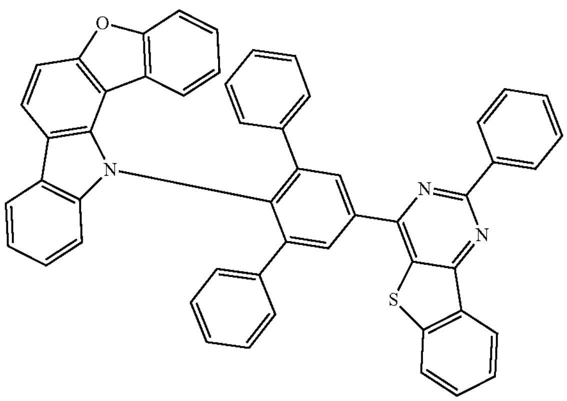
553
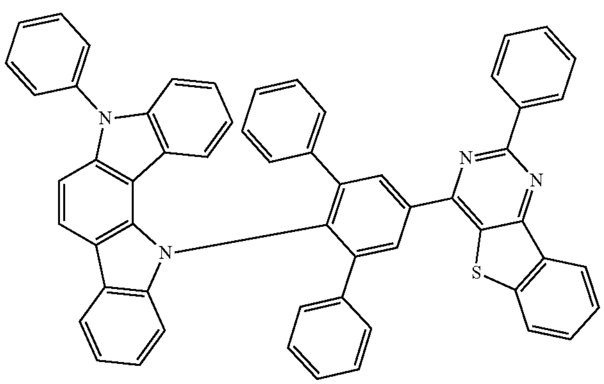
554
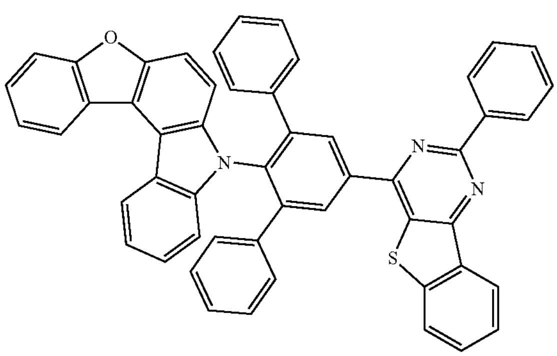

-continued
555
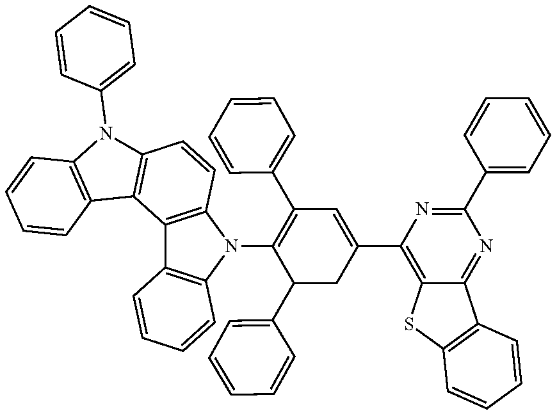
556
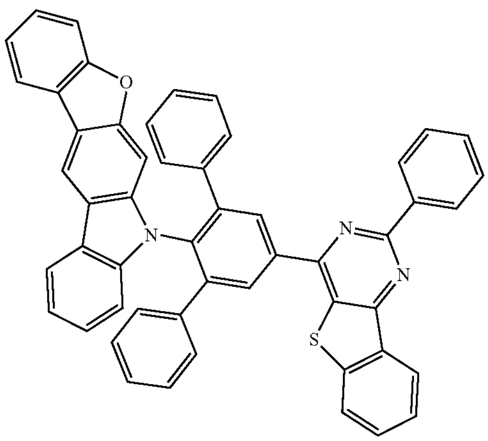
557
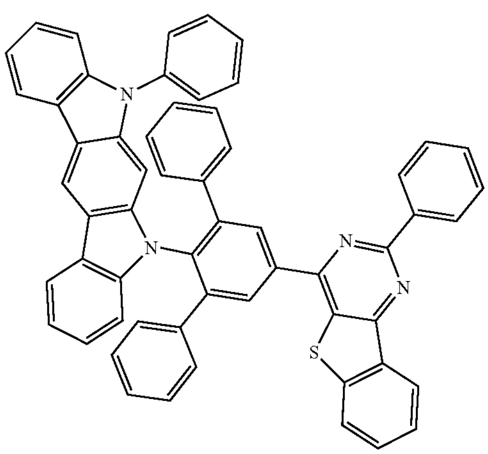

-continued
558
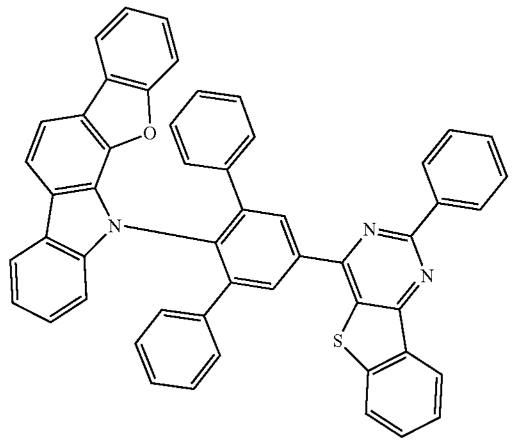
559
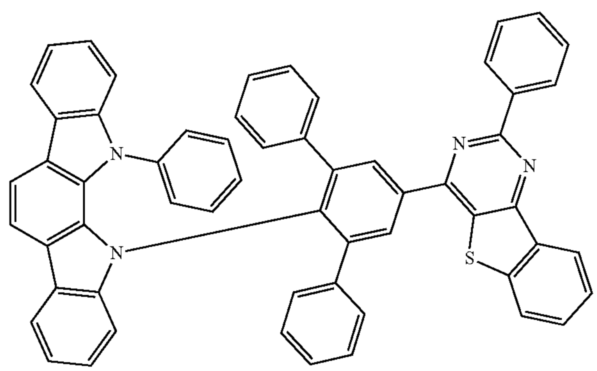
560
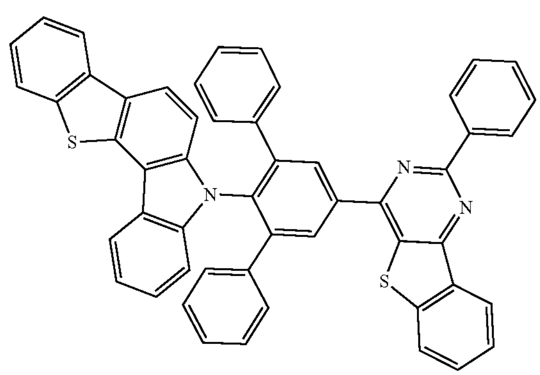

-continued
561
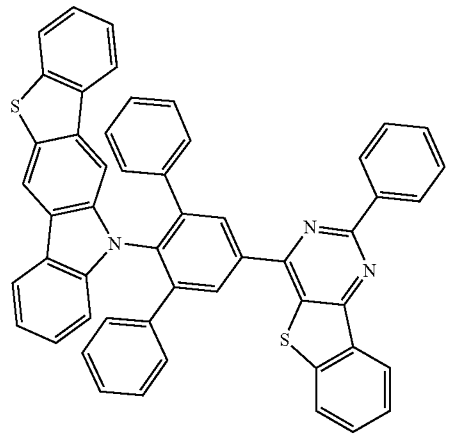
562
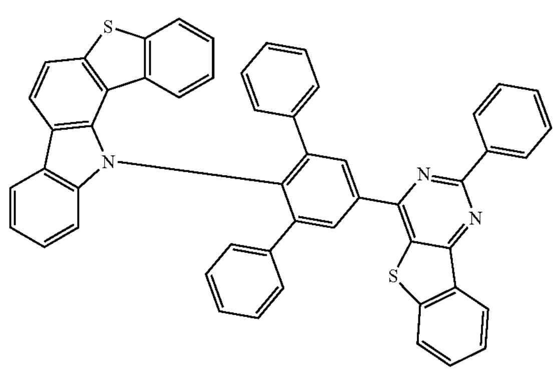
563
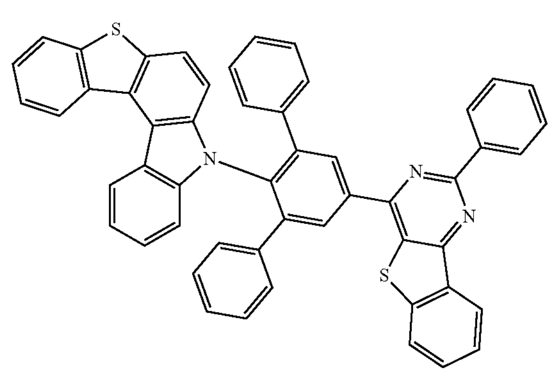

-continued
564
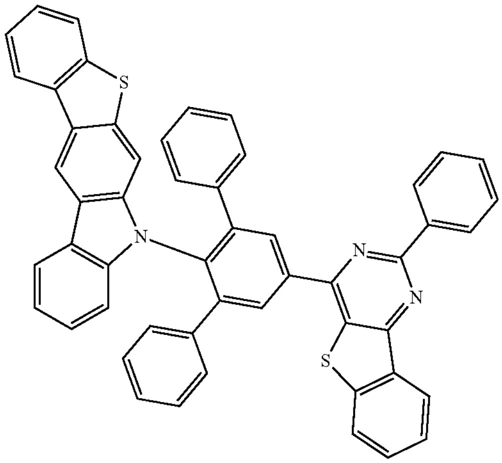
565
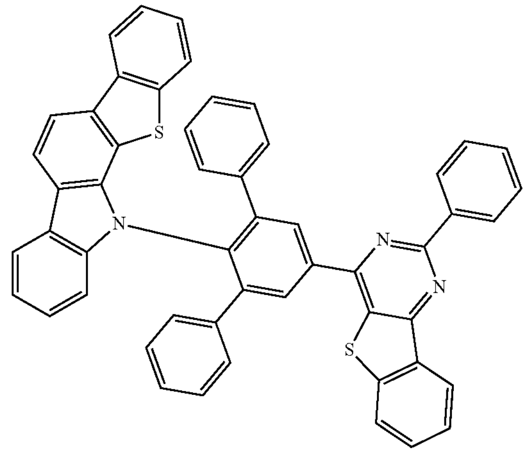
566
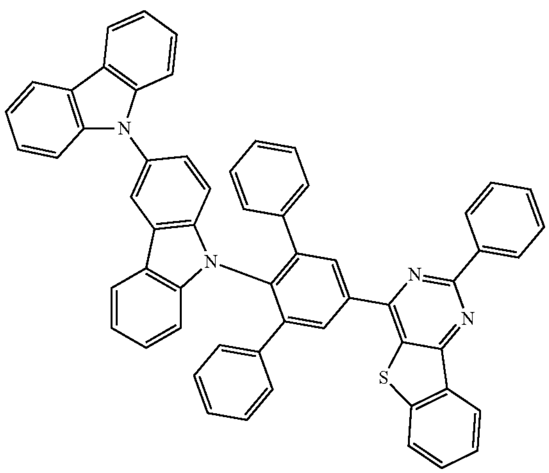
567
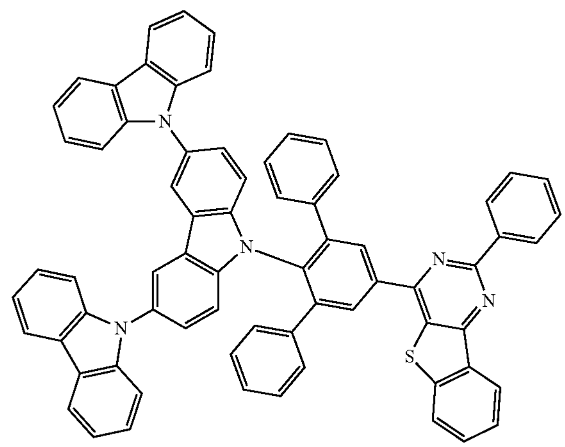
568
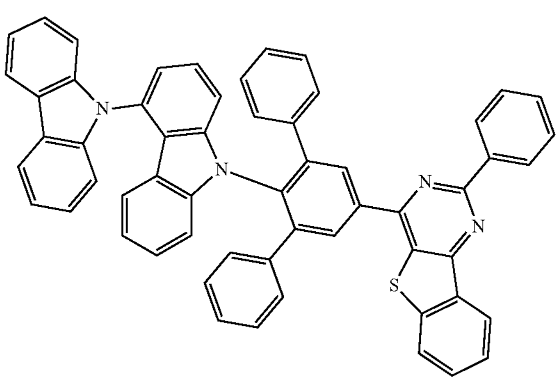
569
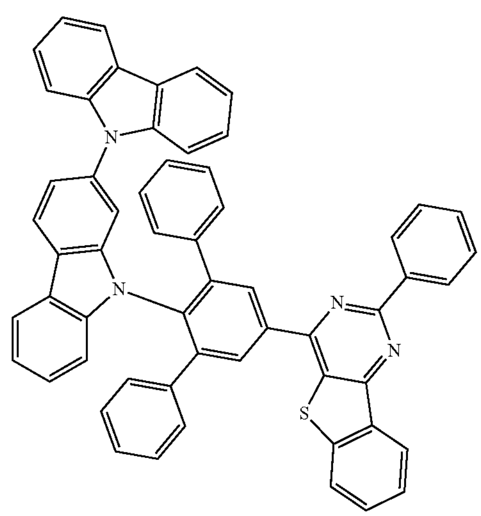

-continued
570
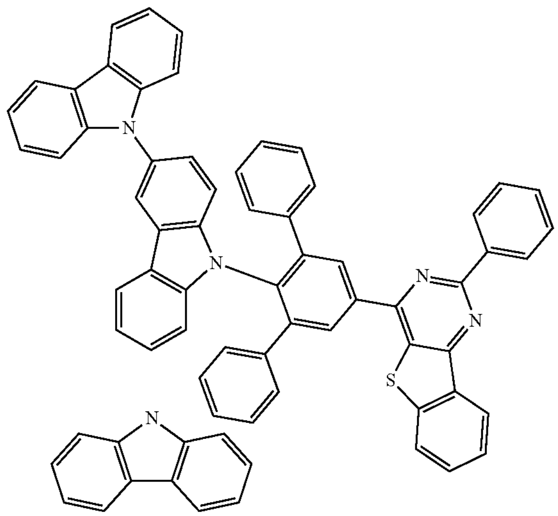
571
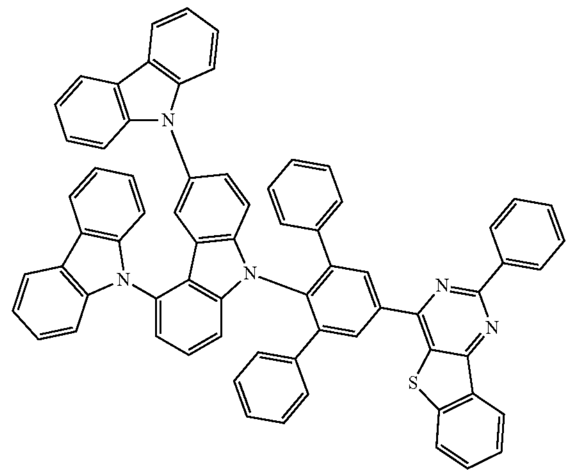
572
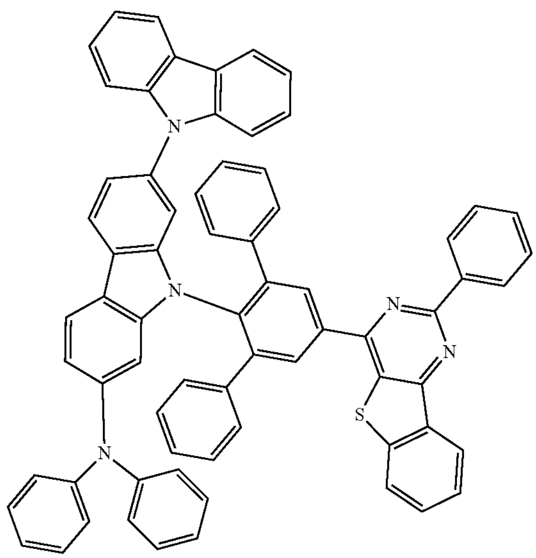
573
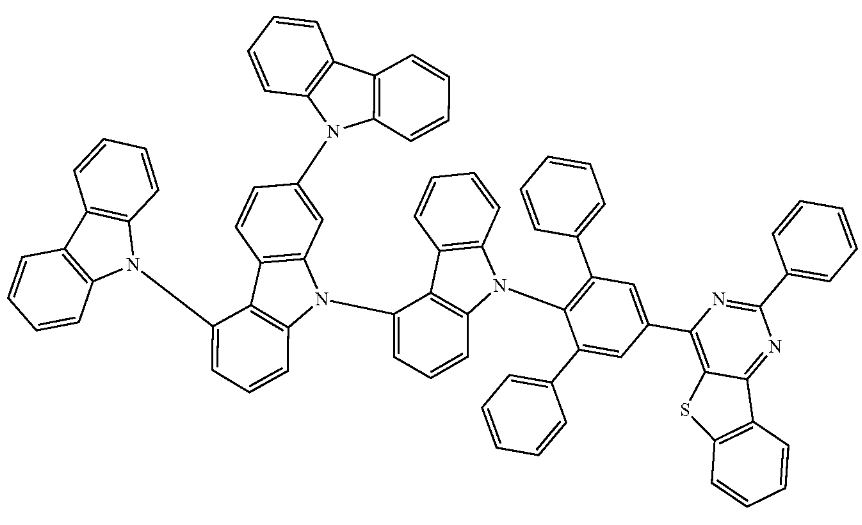

-continued
574
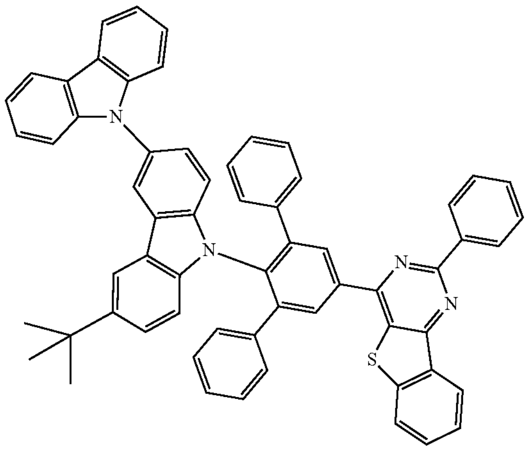
575
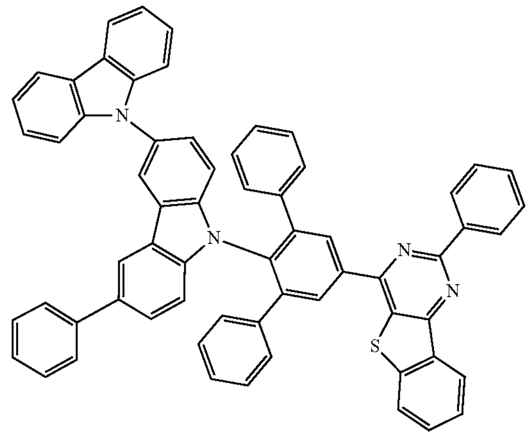
576
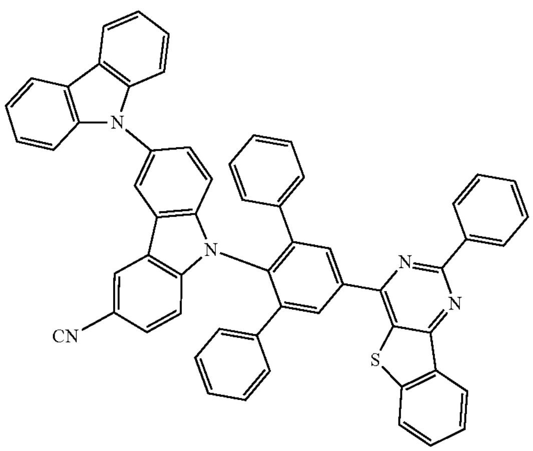
577
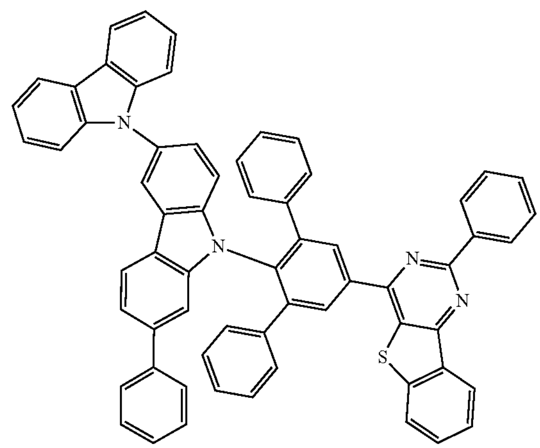
578
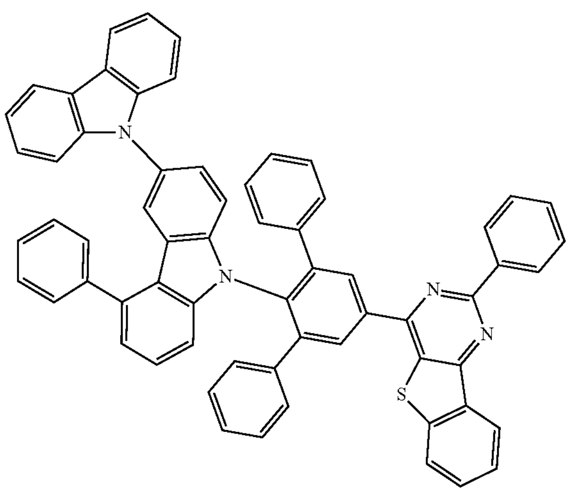
579
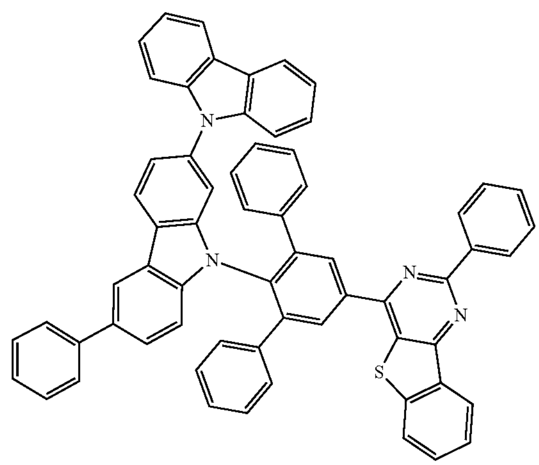

-continued
580
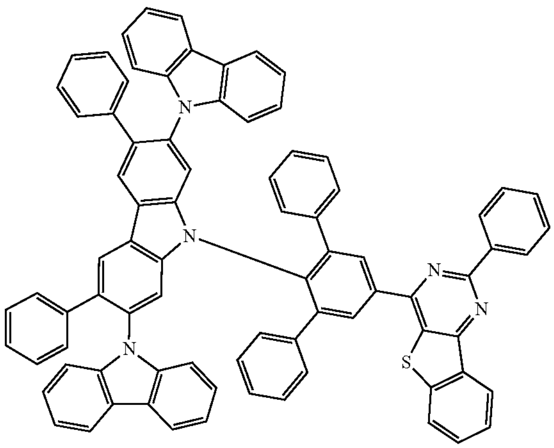
581
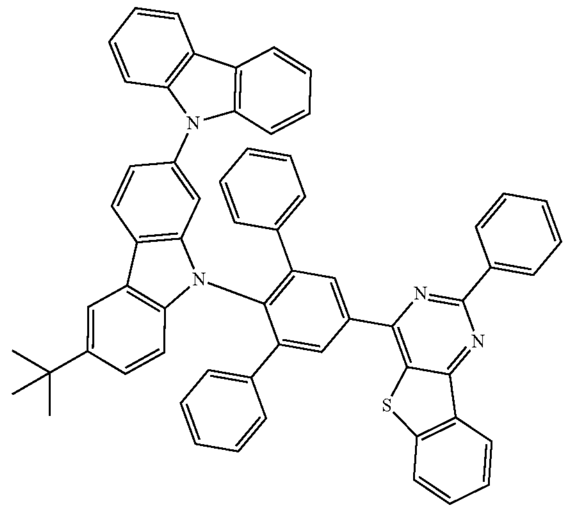
582
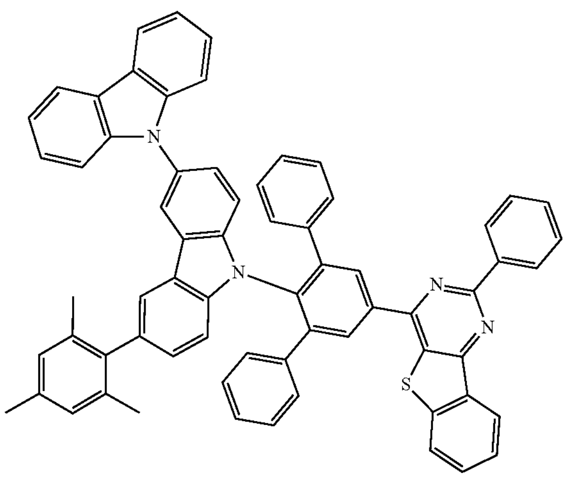
583
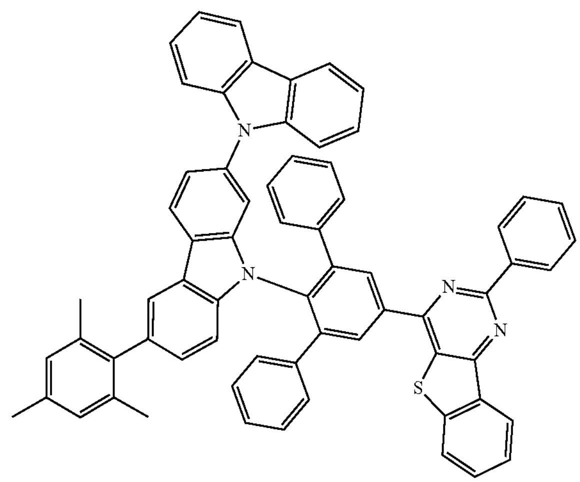
584
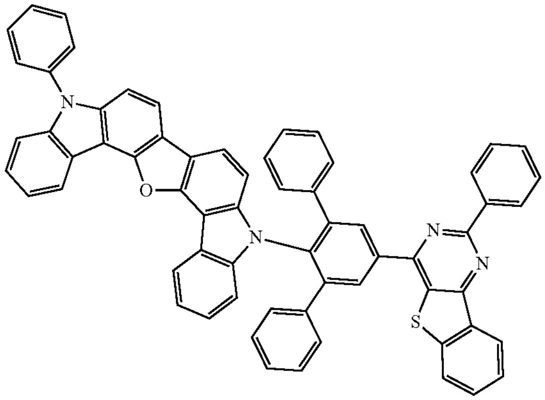
585
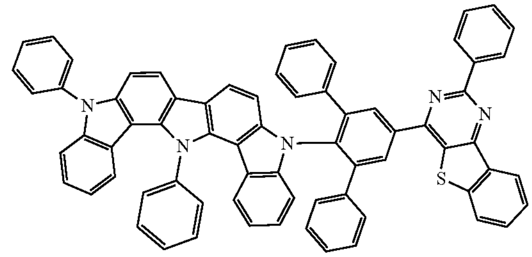

-continued
586
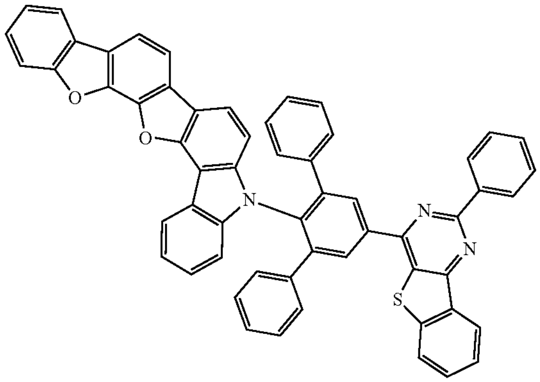
587
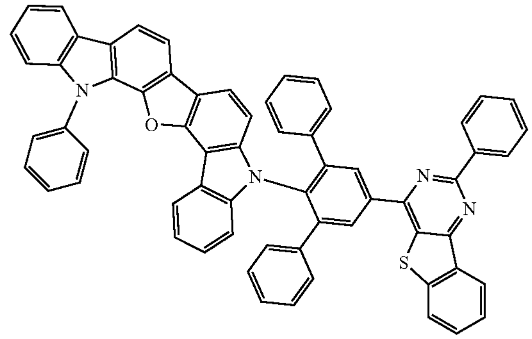
588
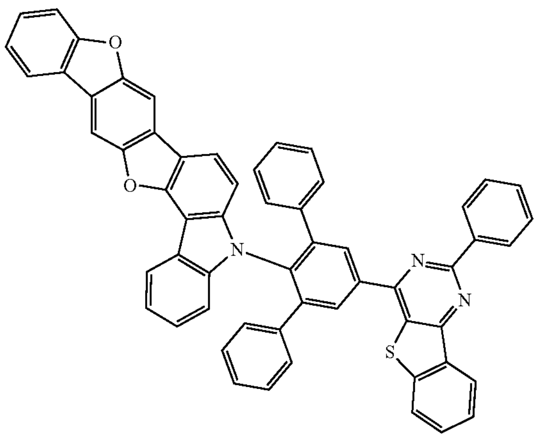
589
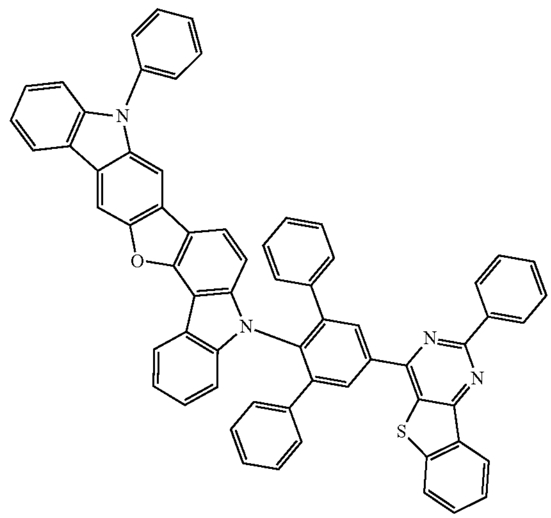
590
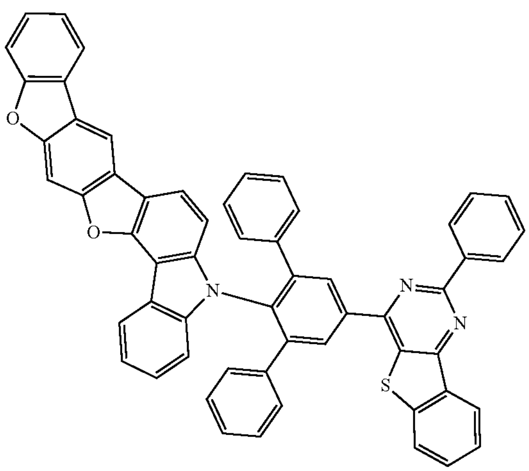
591
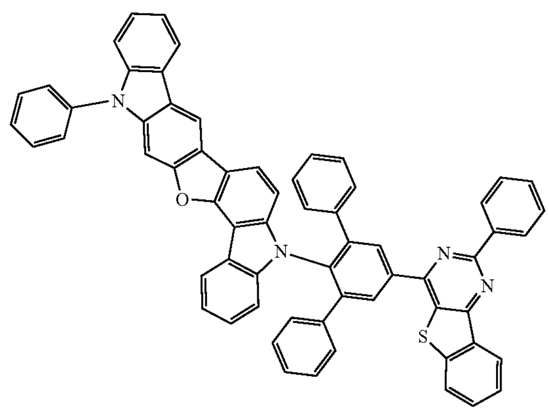

-continued
592
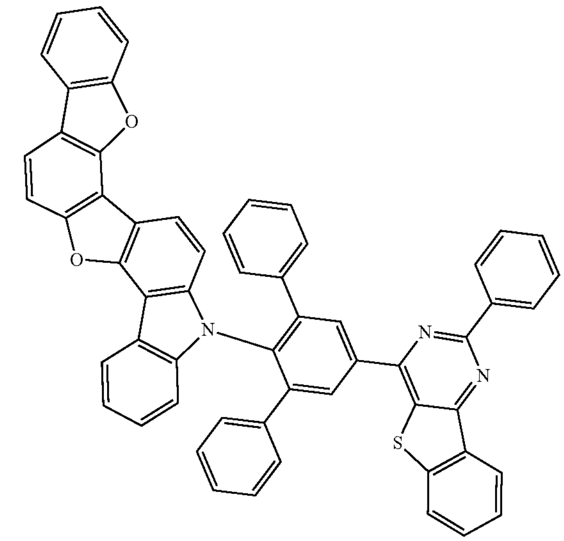
593
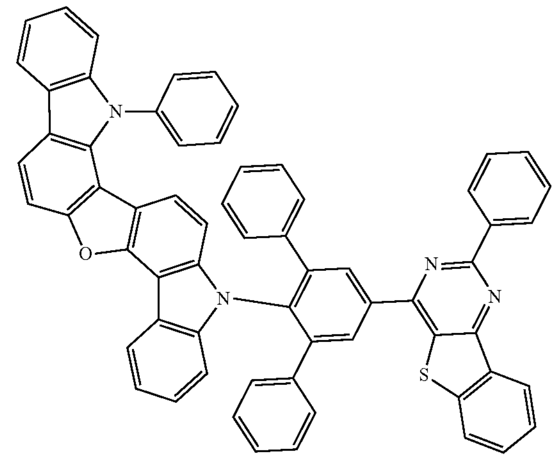
594
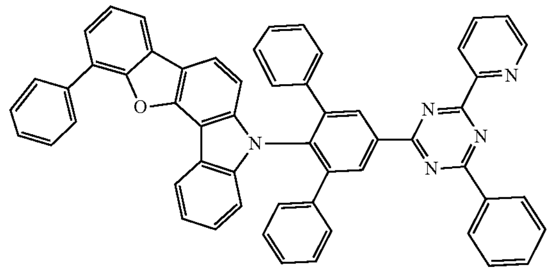
595
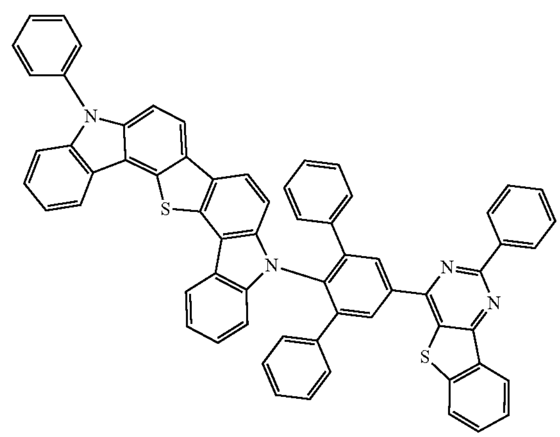
596
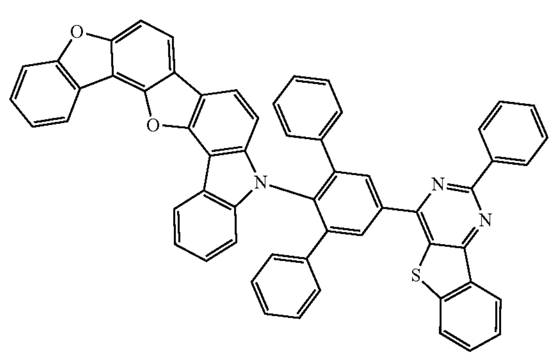
597
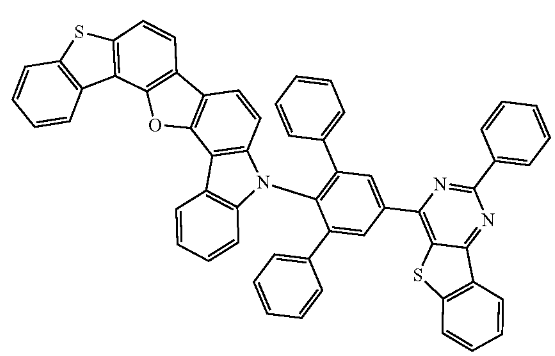

-continued
598
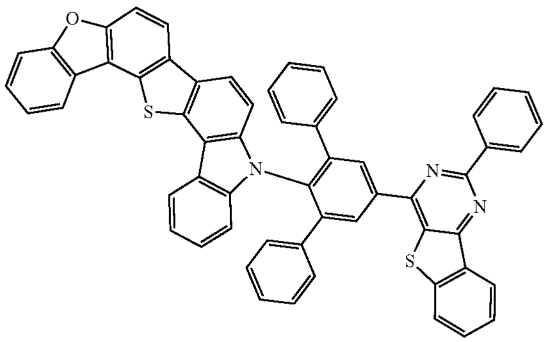
599
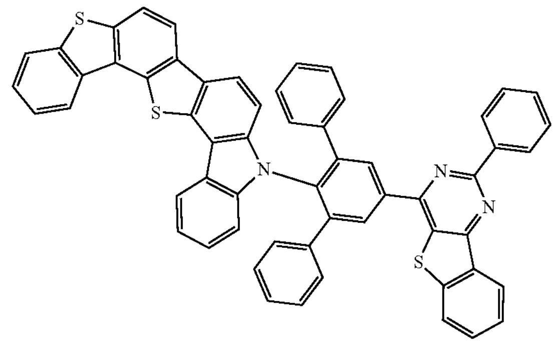
600
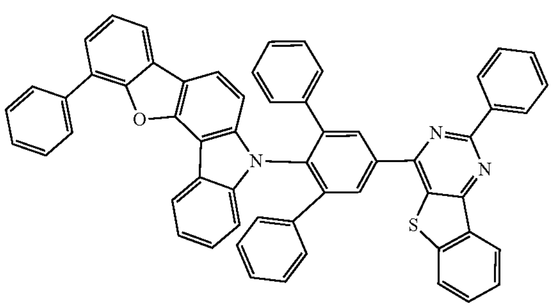
601
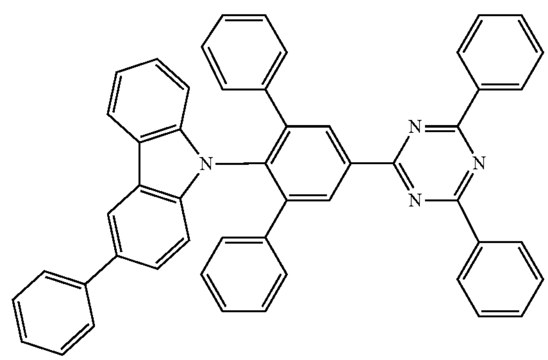
602
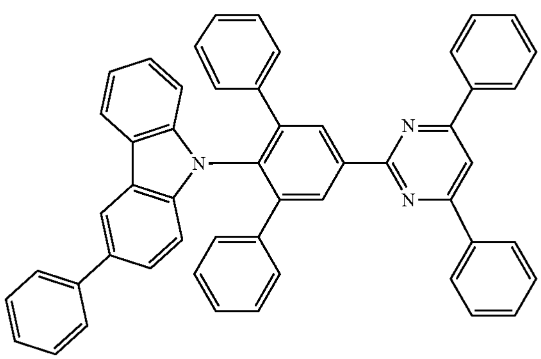
603
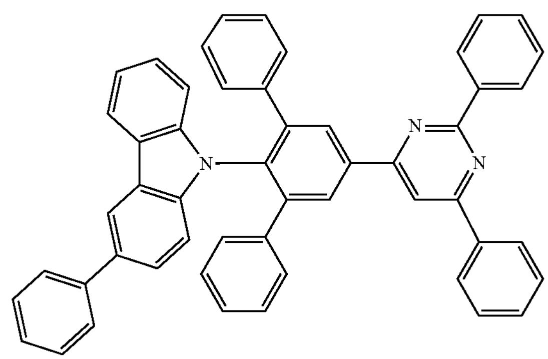
604
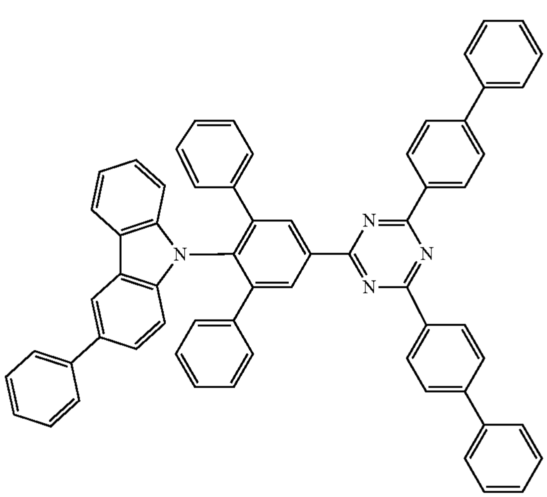
605
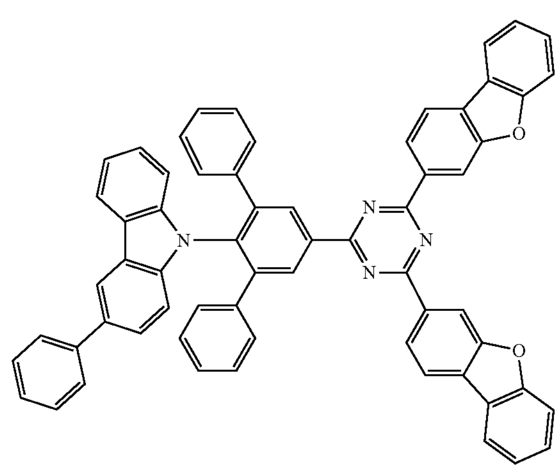

-continued
606
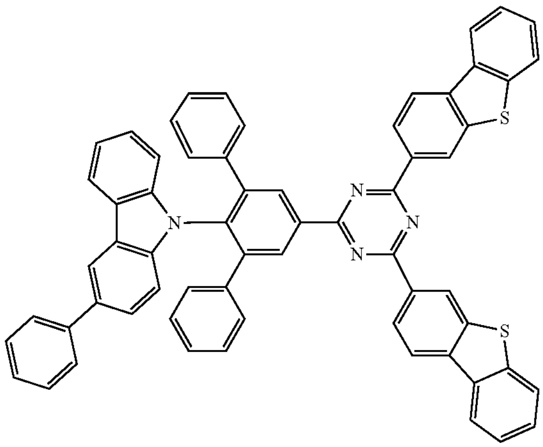
607
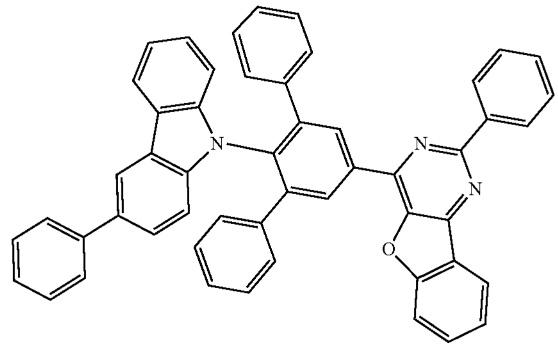
608
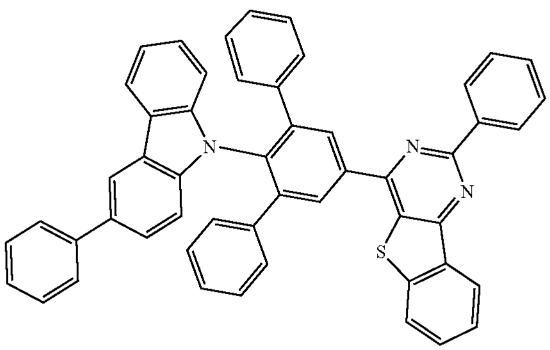
609
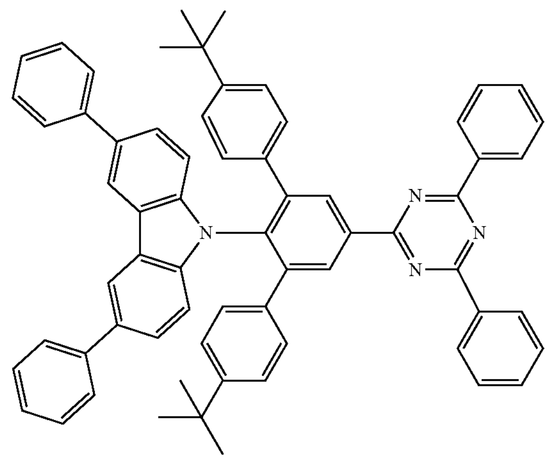
610
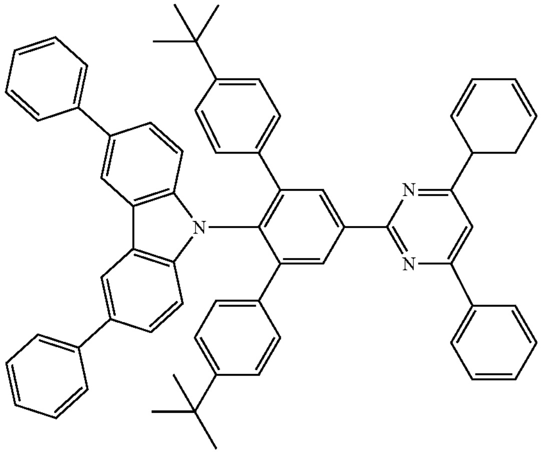
611
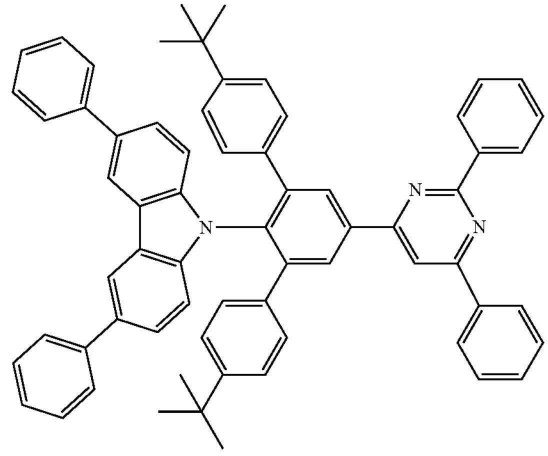

-continued
612
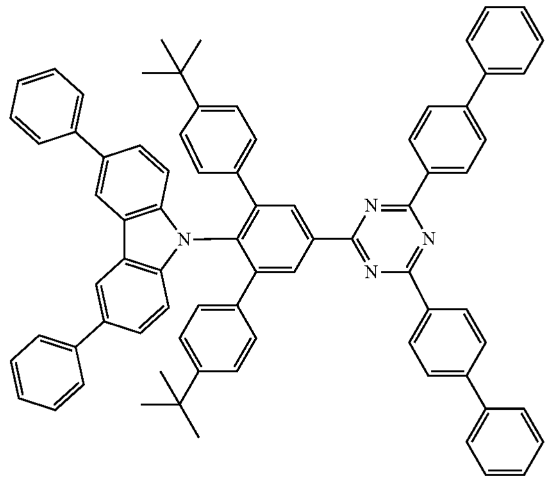
613
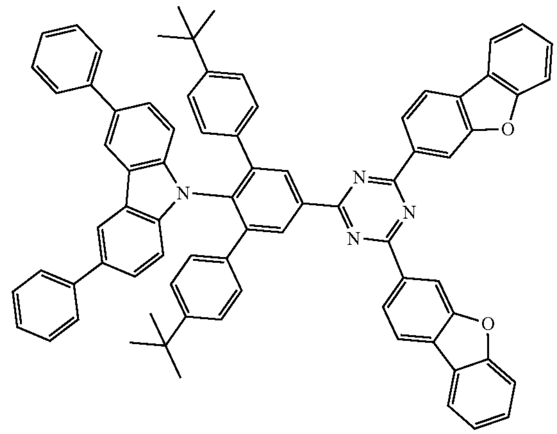
614
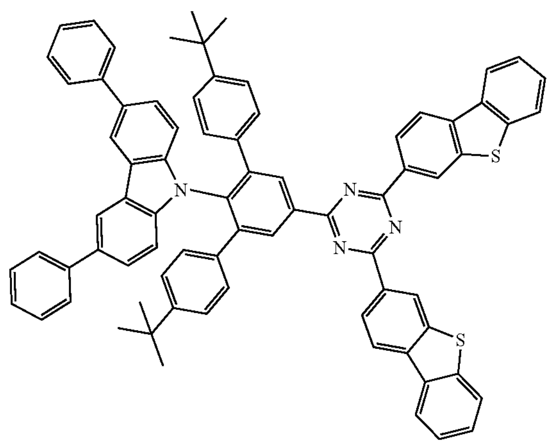
615
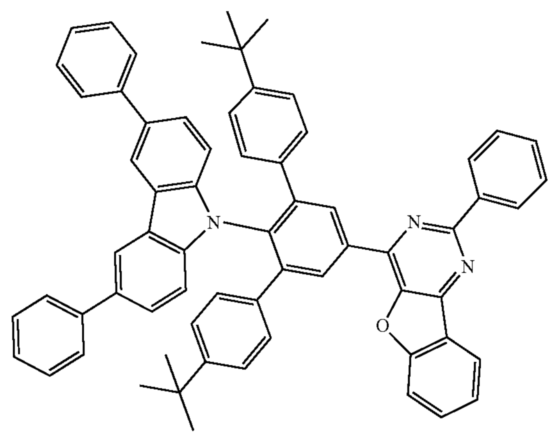
616
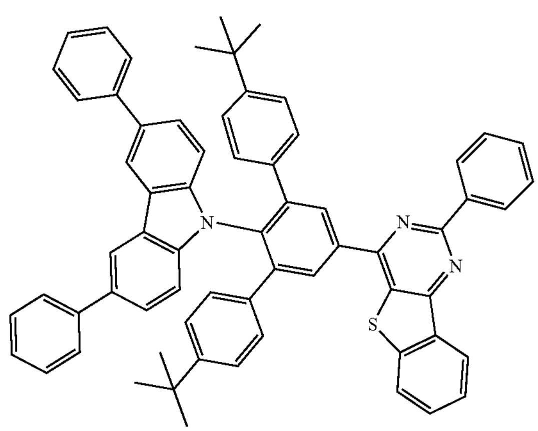
617
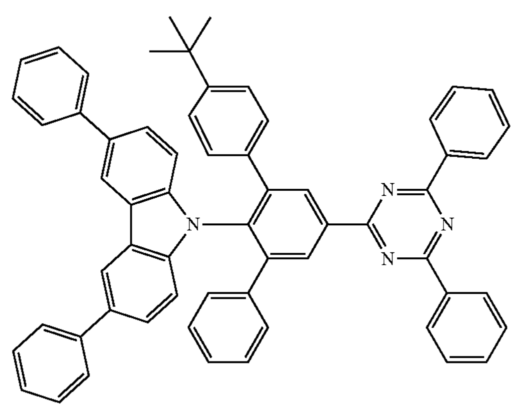

-continued
618
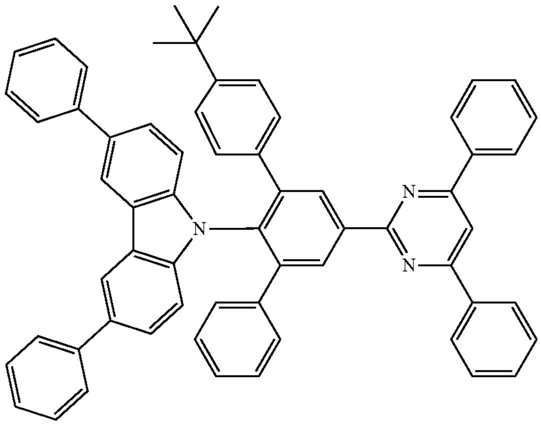
619
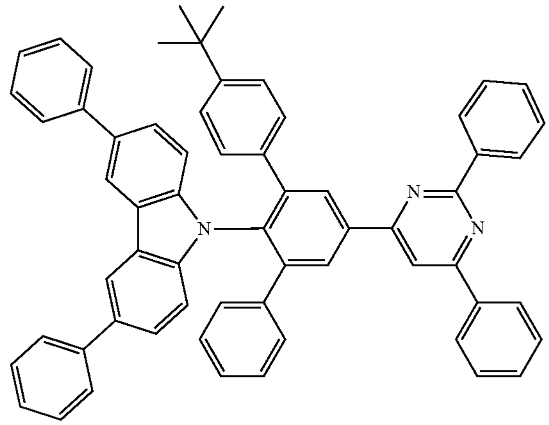
620
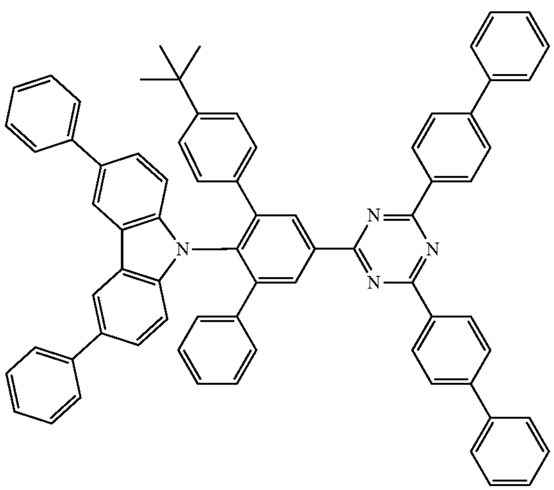
621
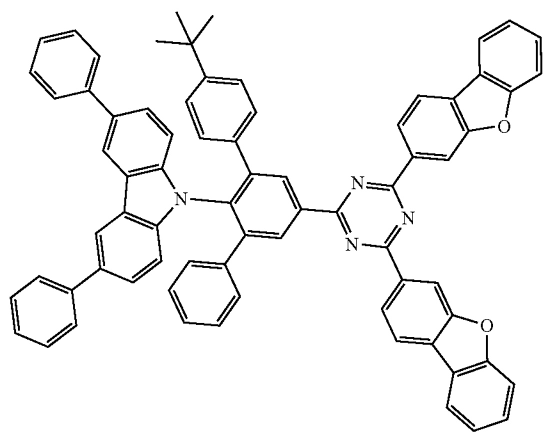
622
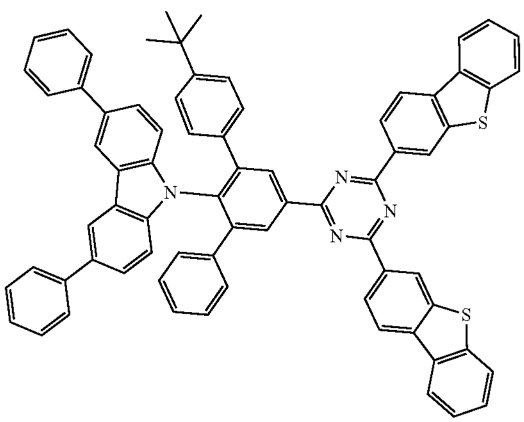
623
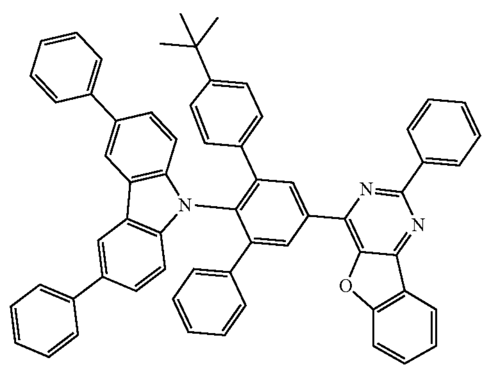

-continued
624
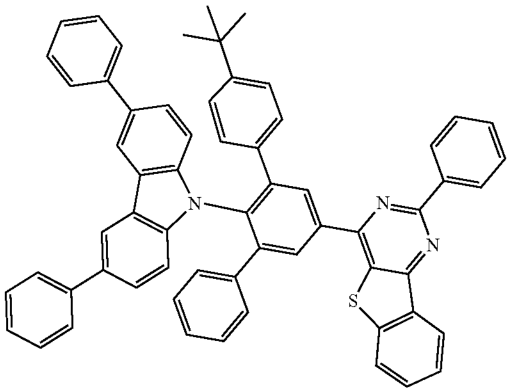
625
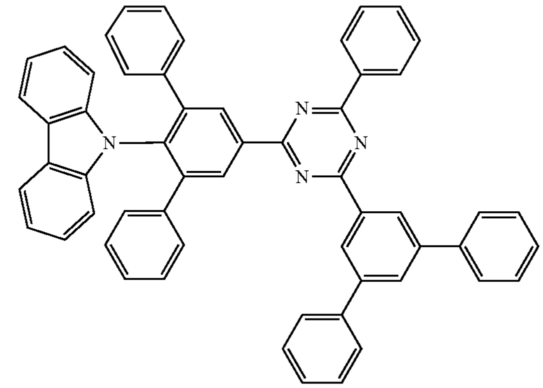
626
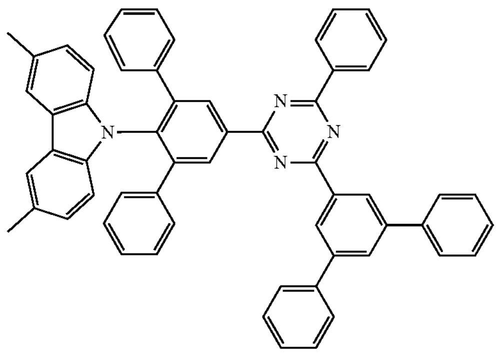
627
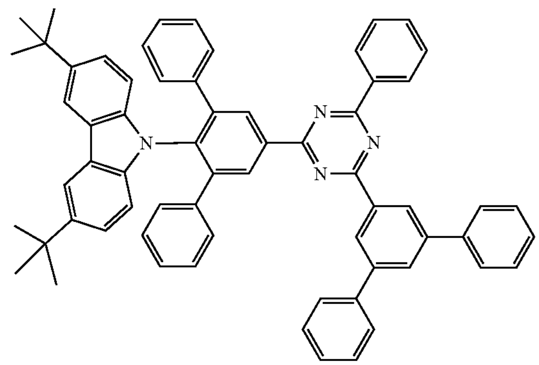
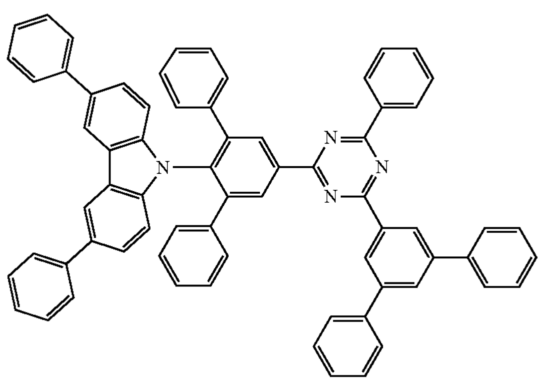
629
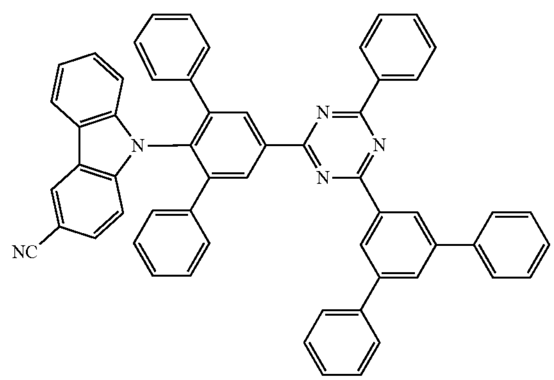
630
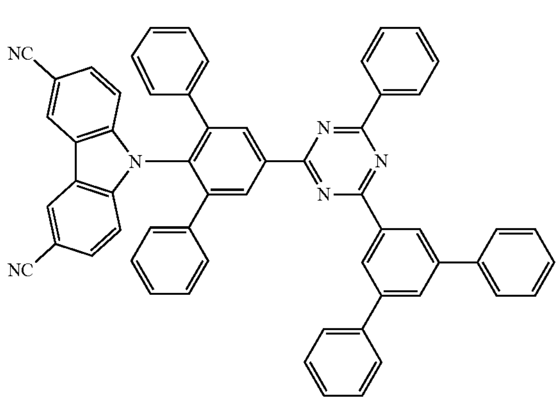
631
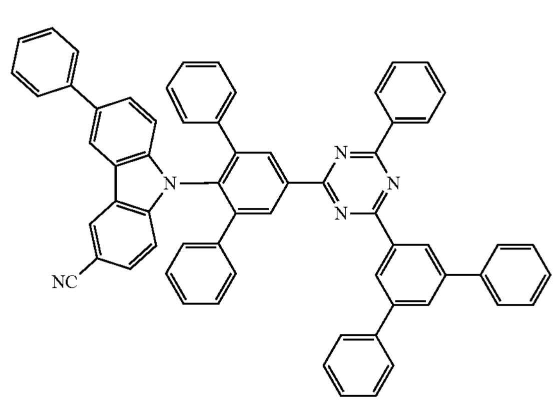

-continued
632
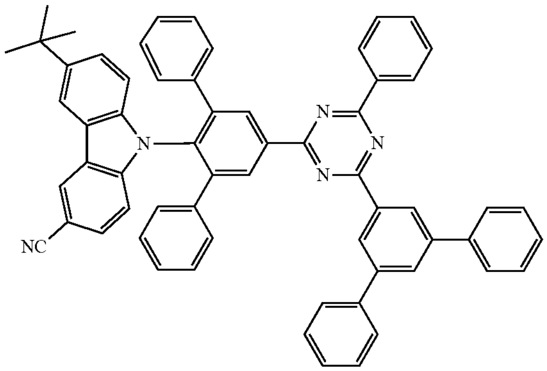
633
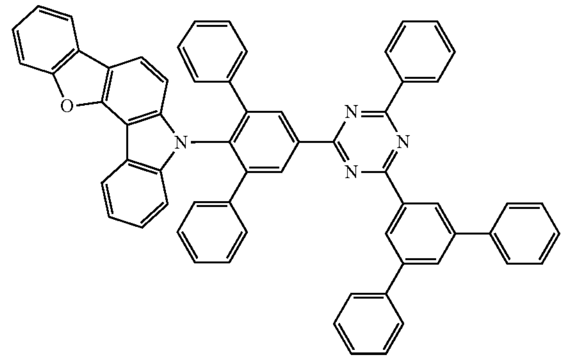
634
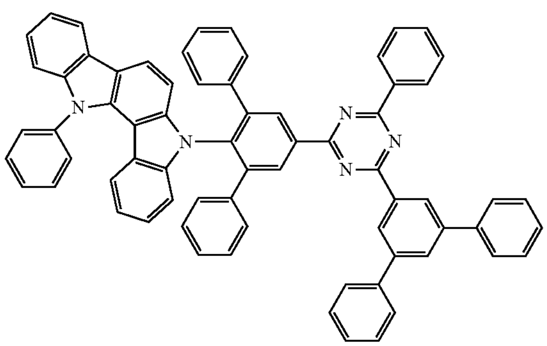
635
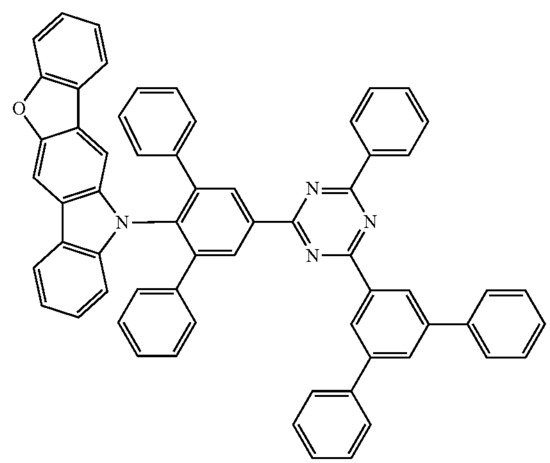
636
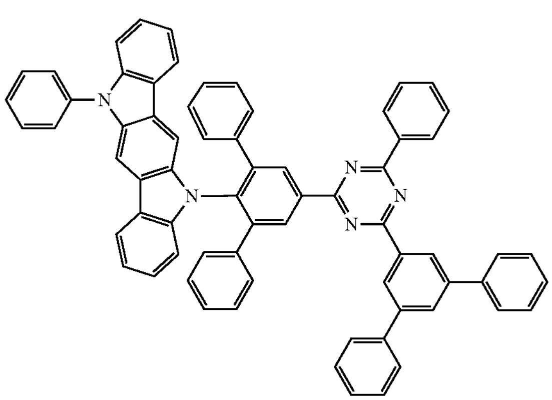
637
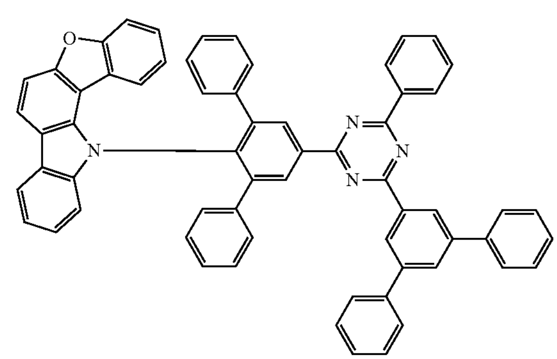

-continued
638
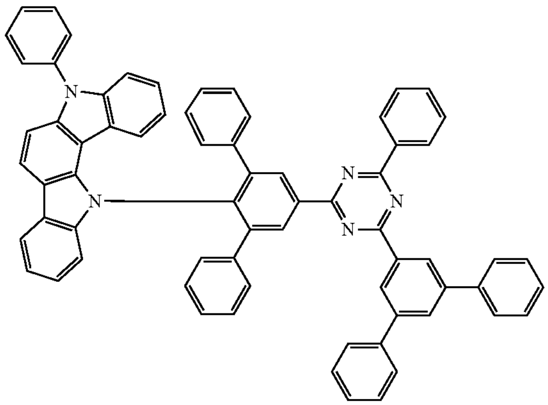
639
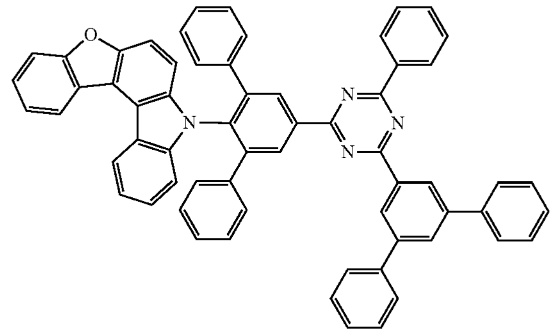
640
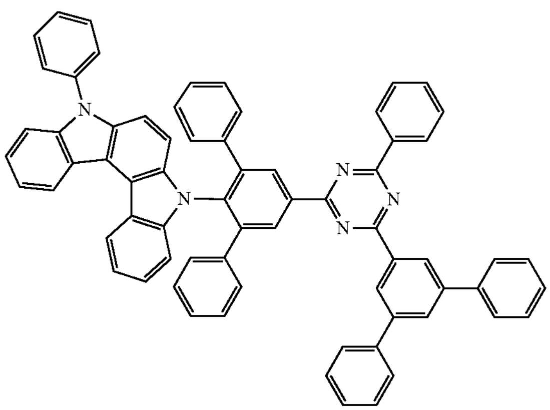
641
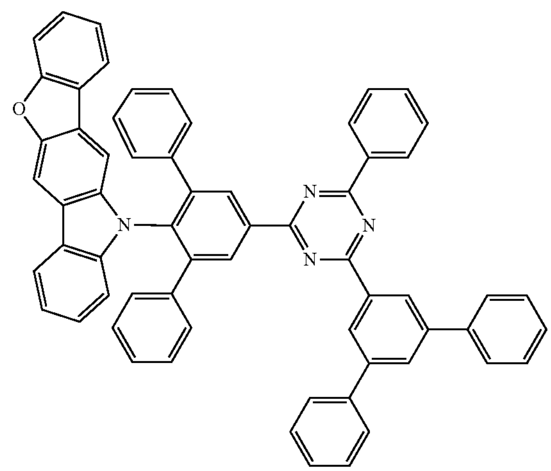
642
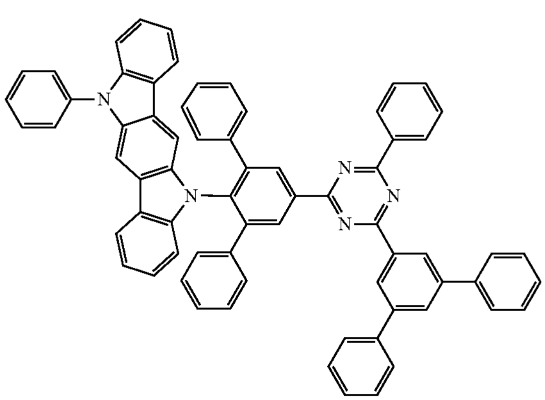
643
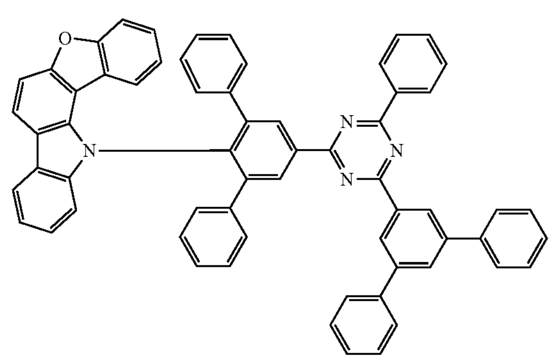

-continued
644
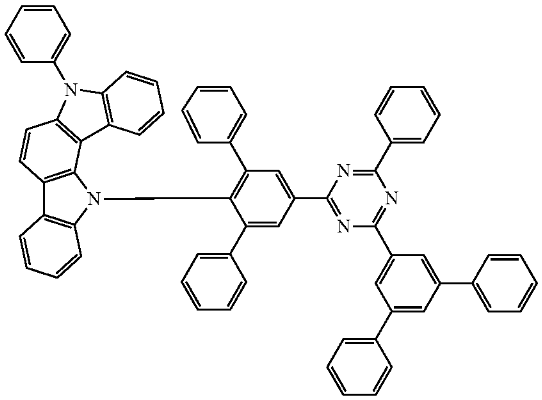
645
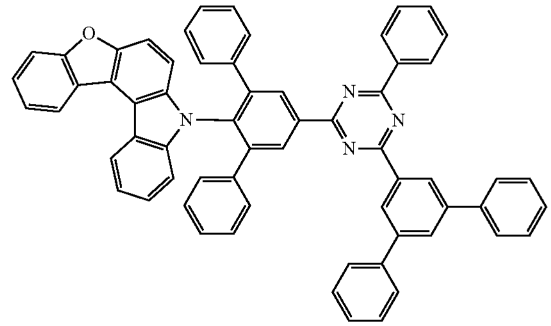
646
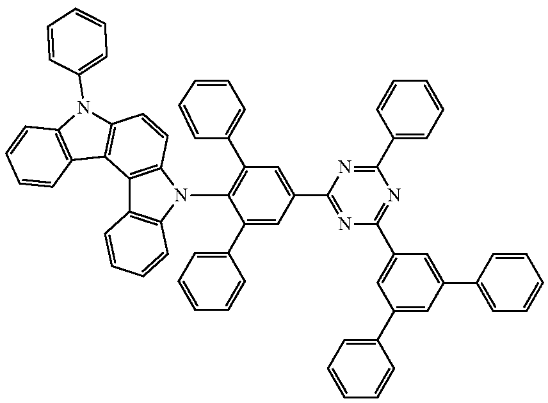
647
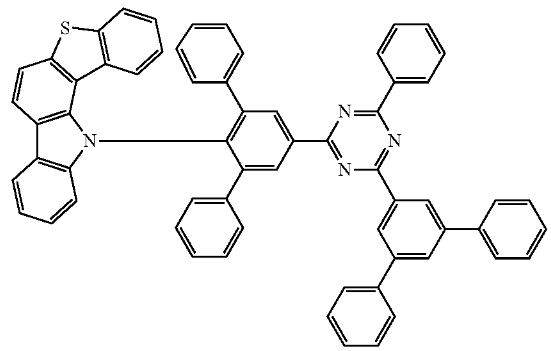
648
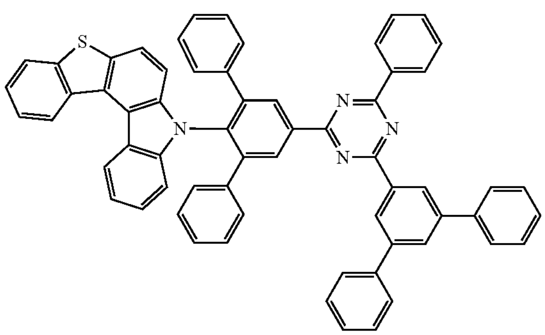
649
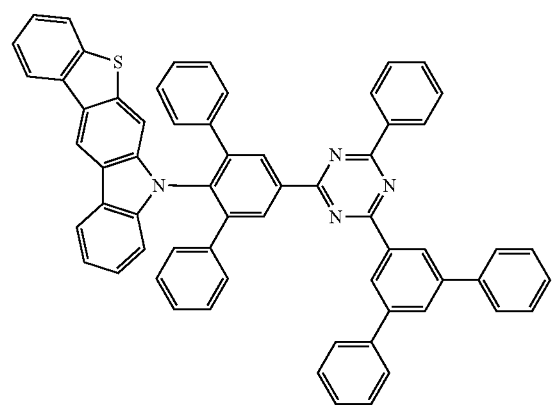
650
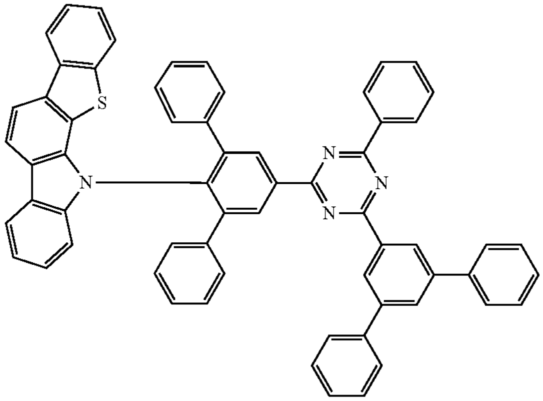
651
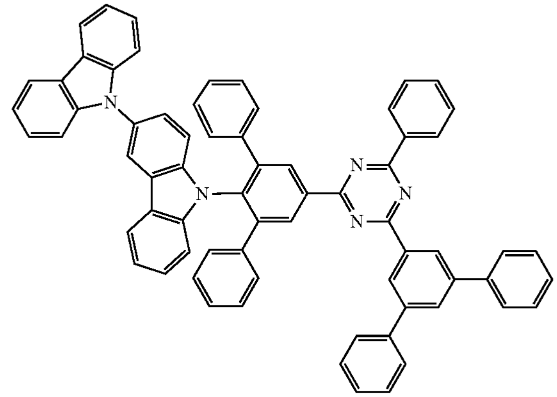

-continued
652
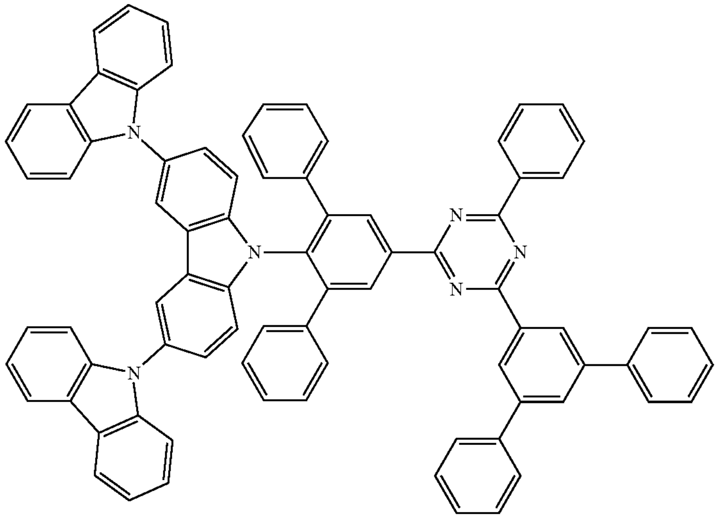
653
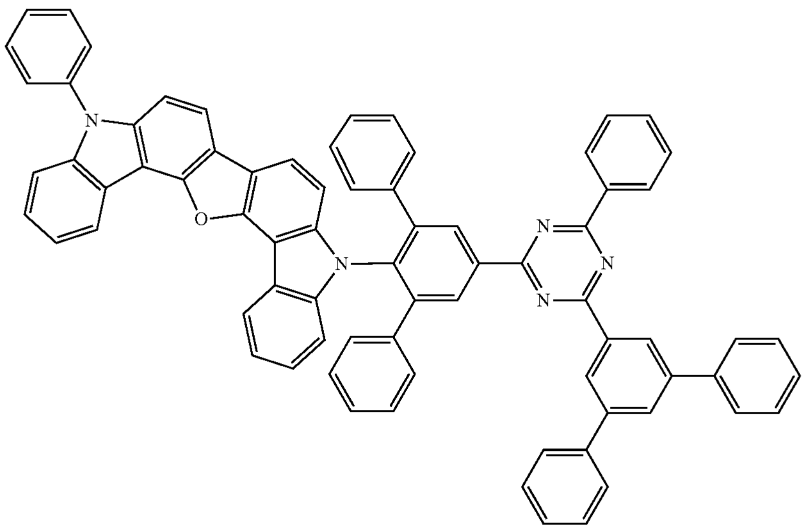
654
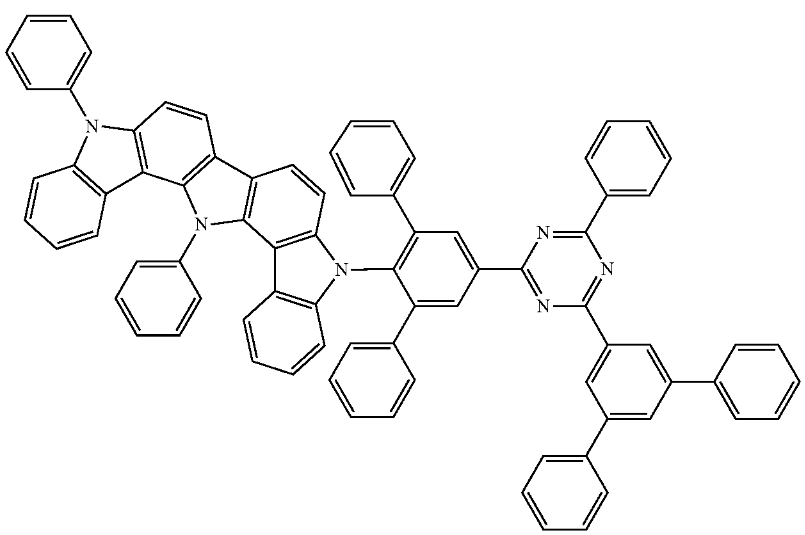

-continued
655
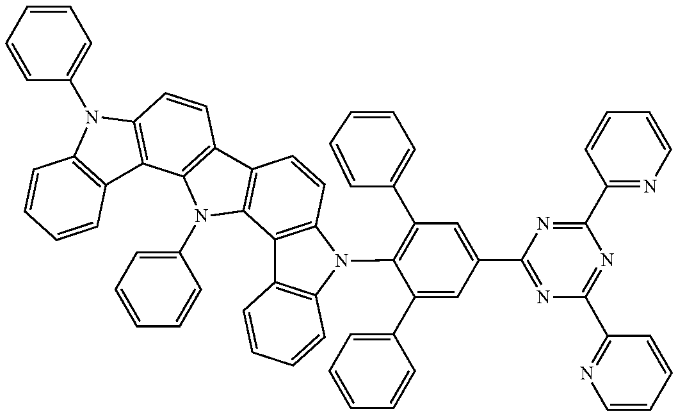
656
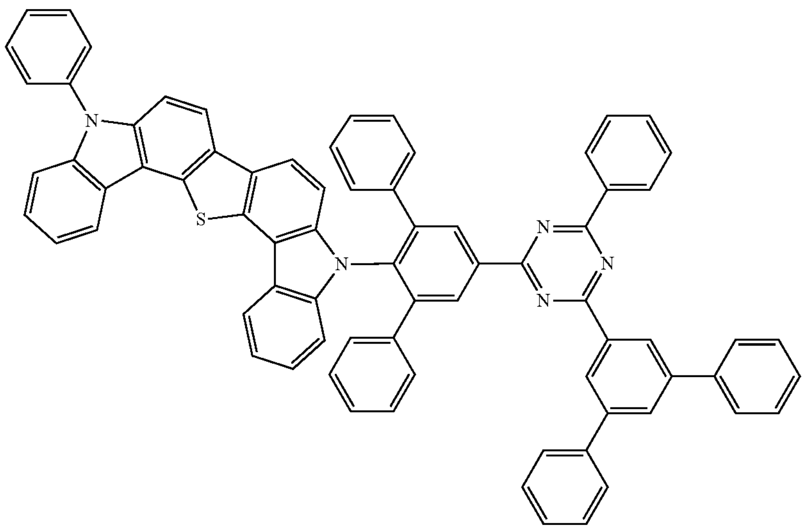
657
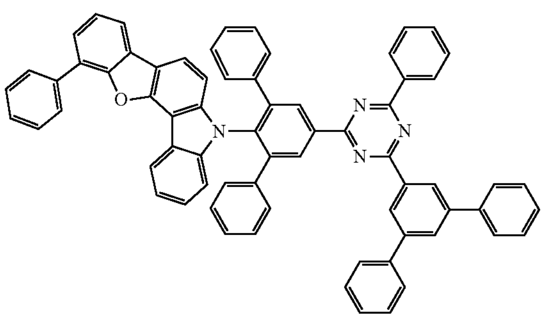
658
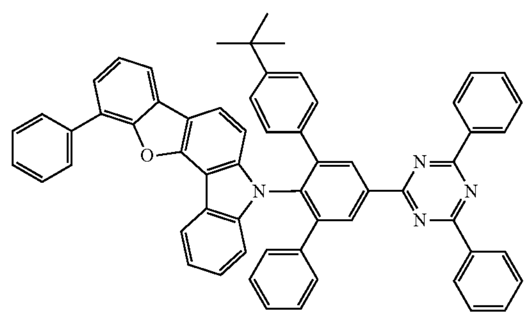
659
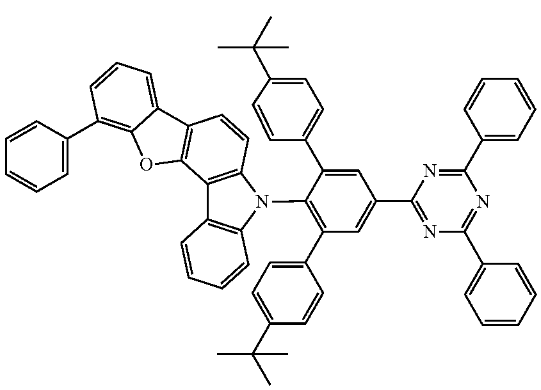
660
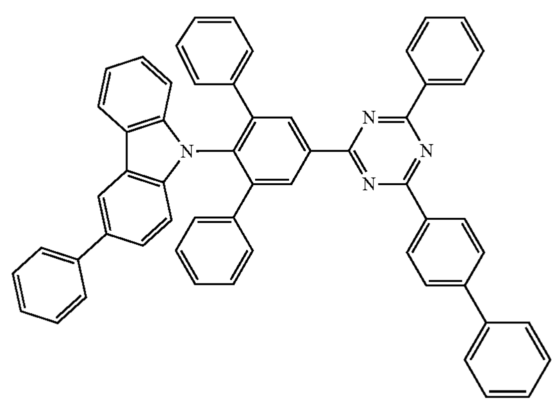

-continued
661
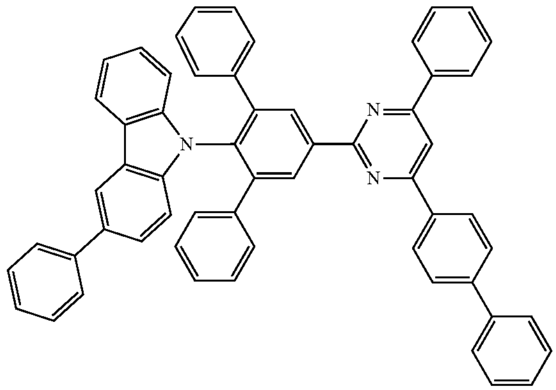
662
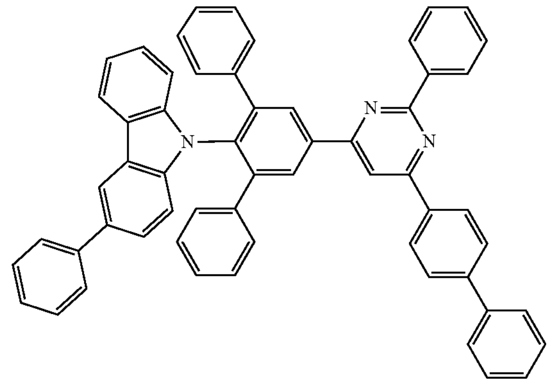
663
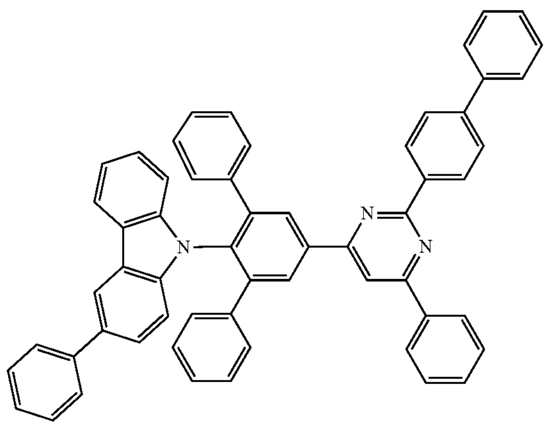
664
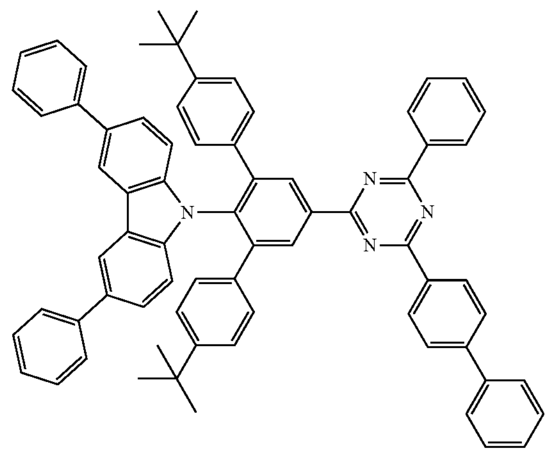
665
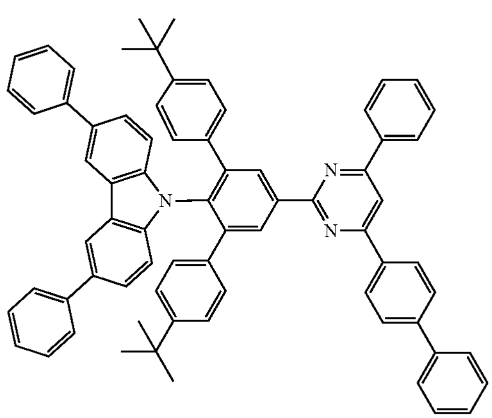
666
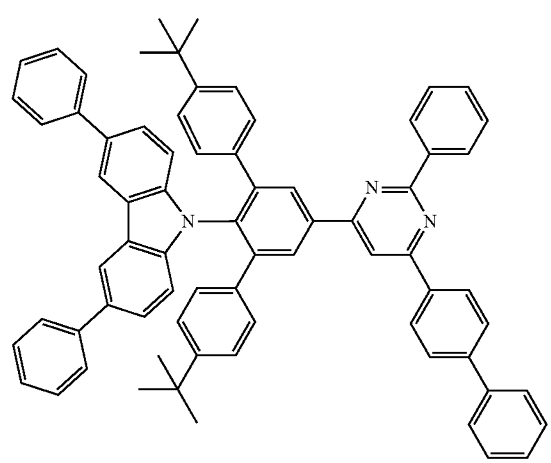

-continued
667
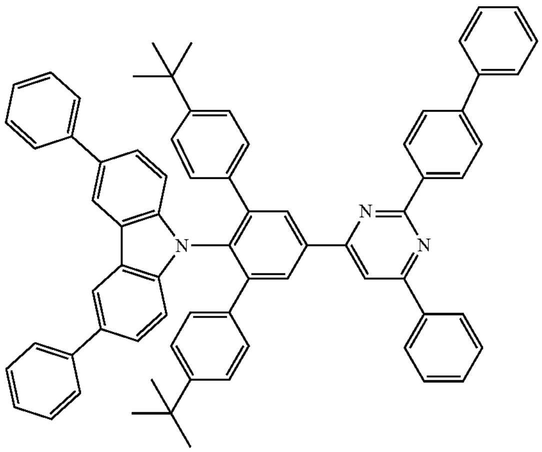
668
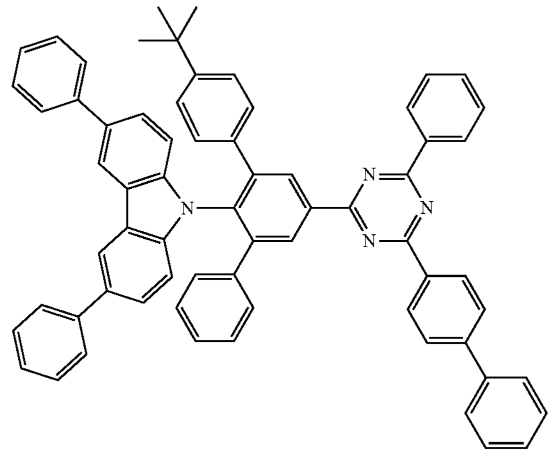
669
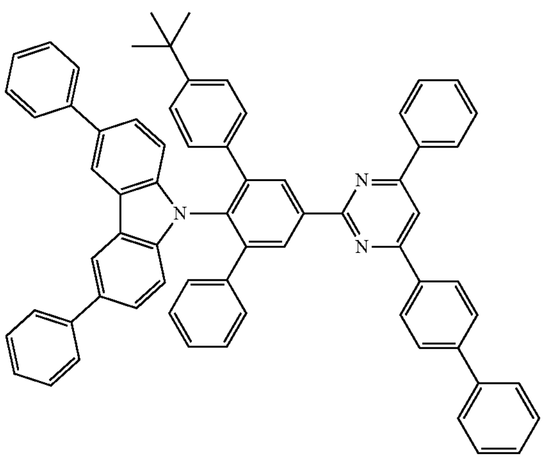
670
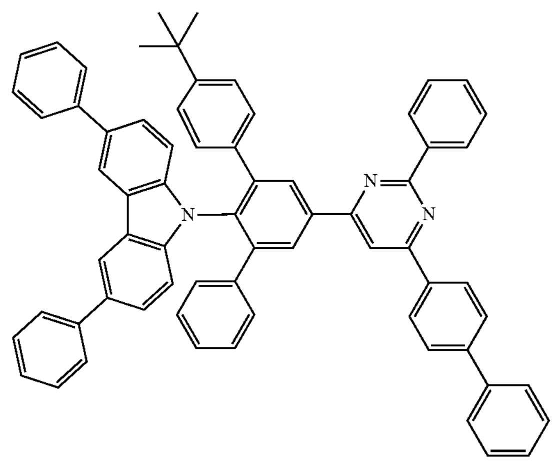
671
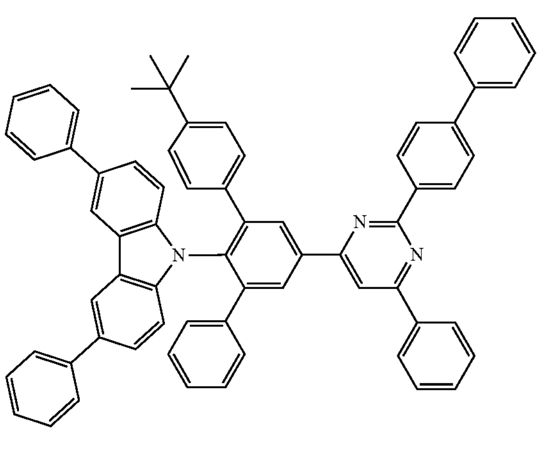
672
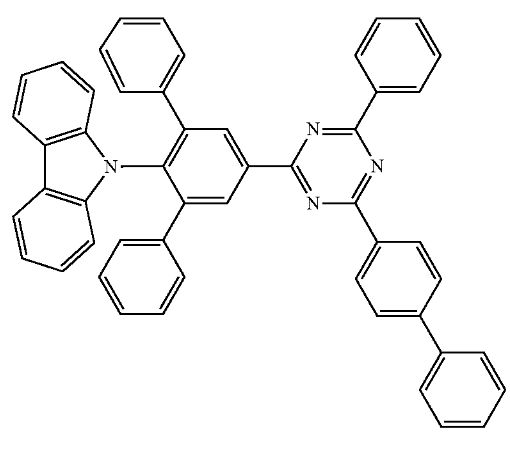

-continued
673
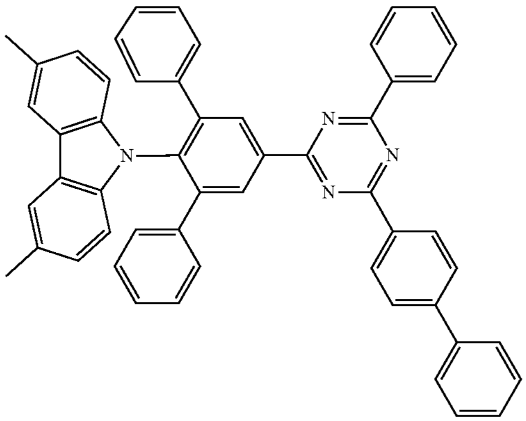
674
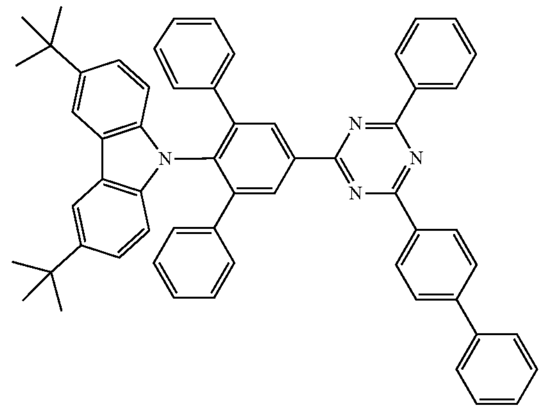
675
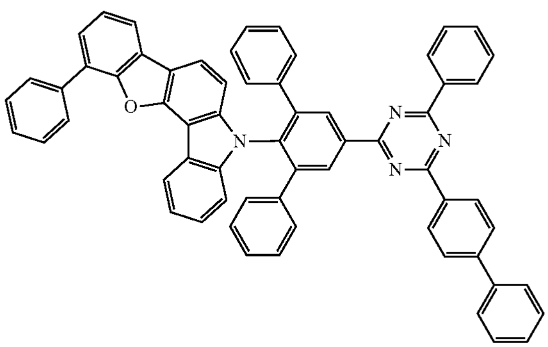
676
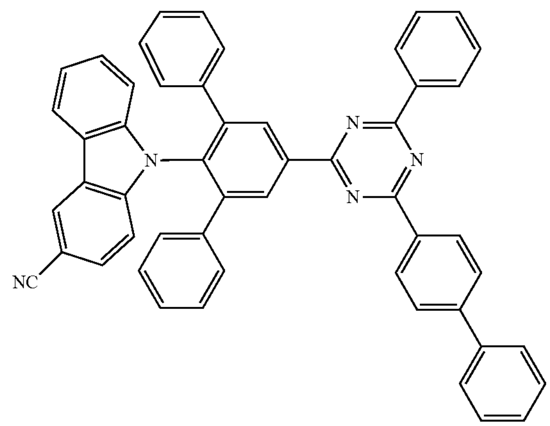
677
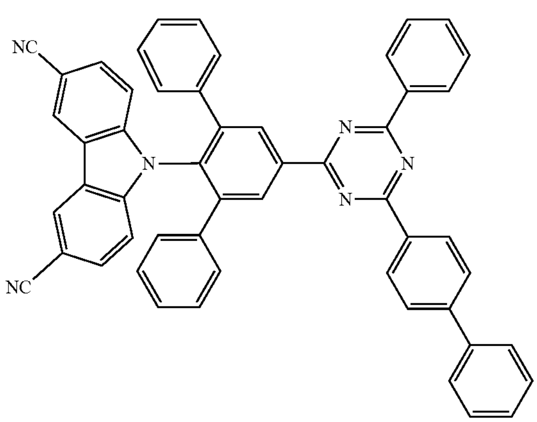
678
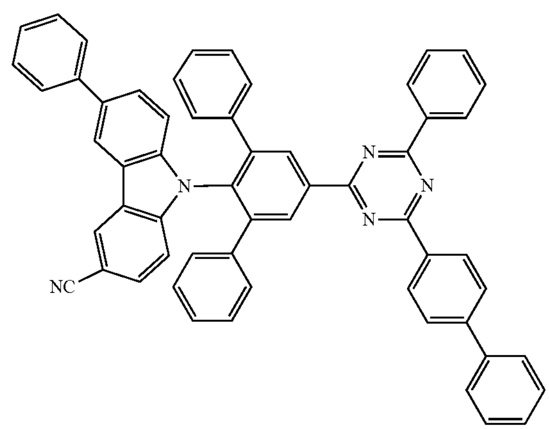

-continued
679
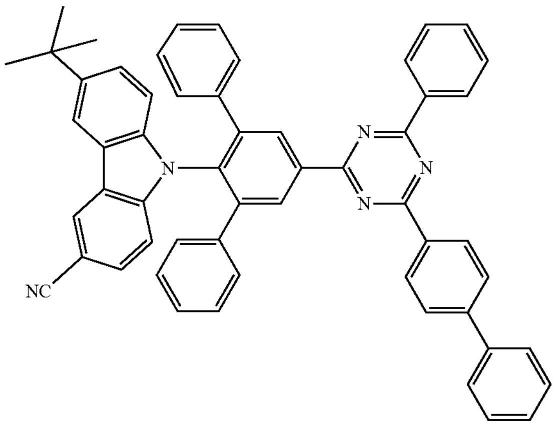
680
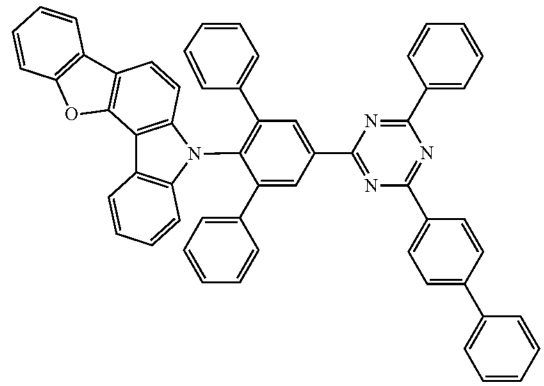
681
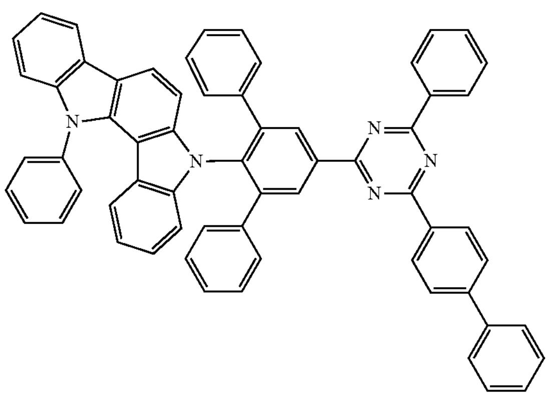
682
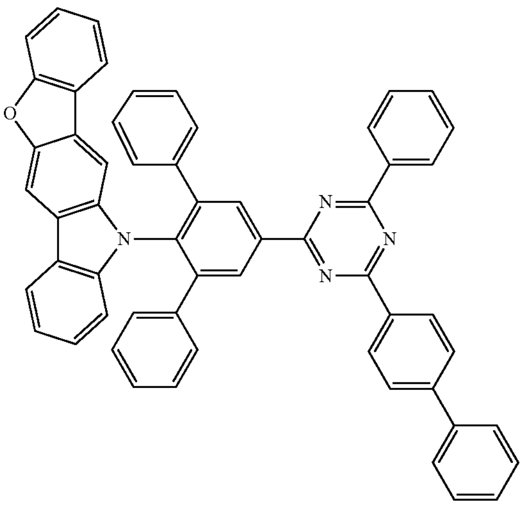
683
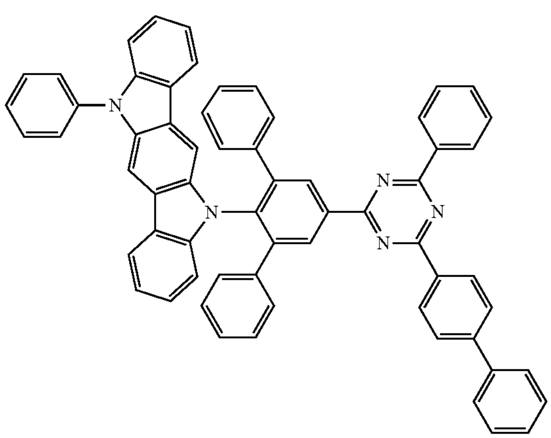
684
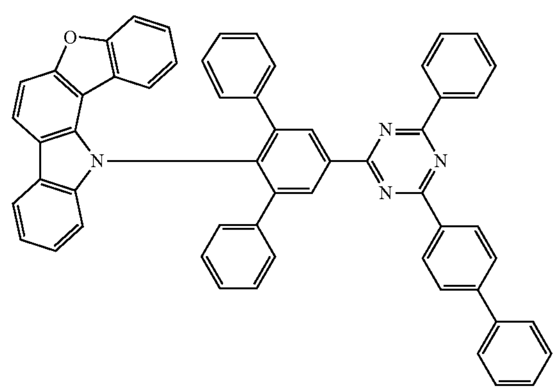

-continued
685
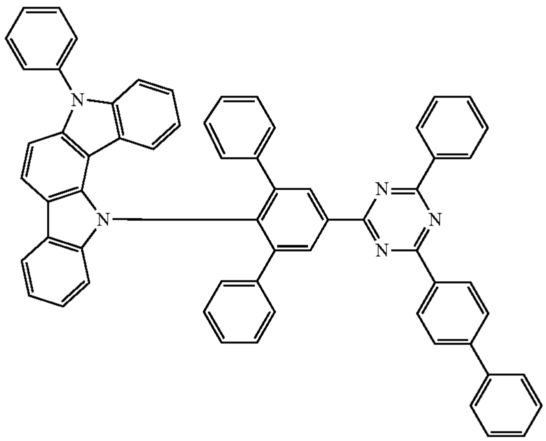
686
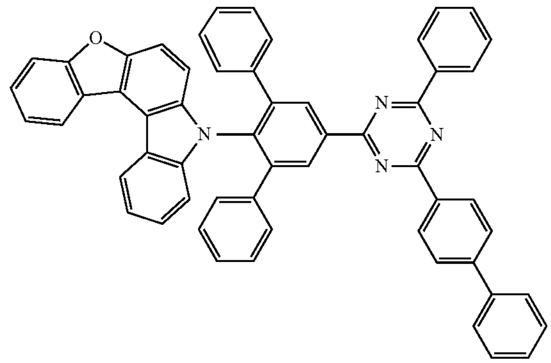
687
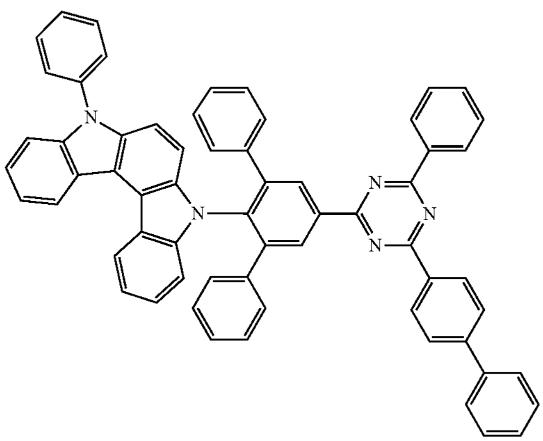
688
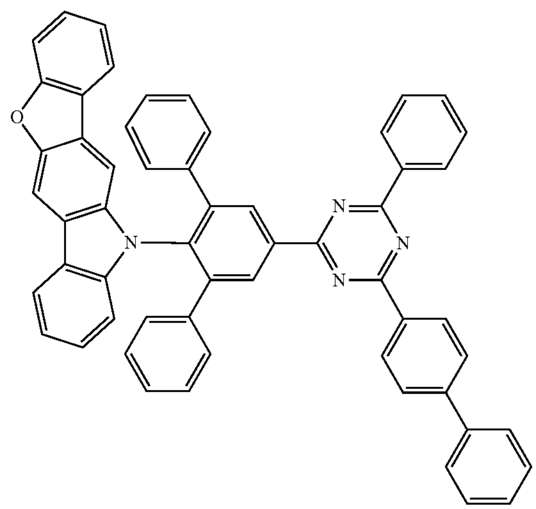
689
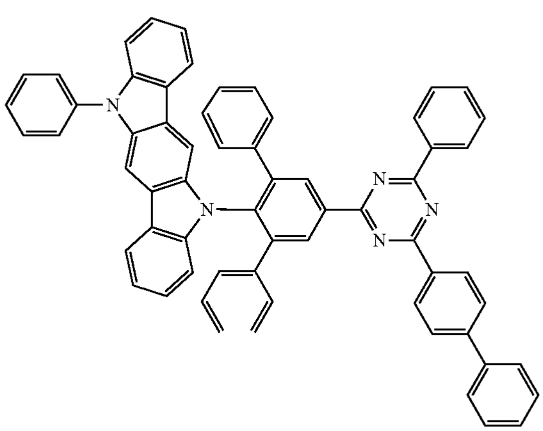
690
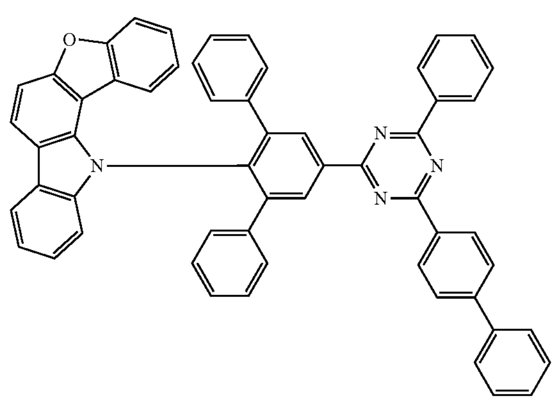

-continued
691
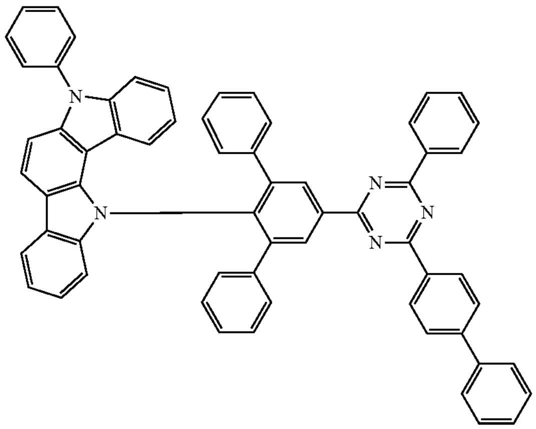
692
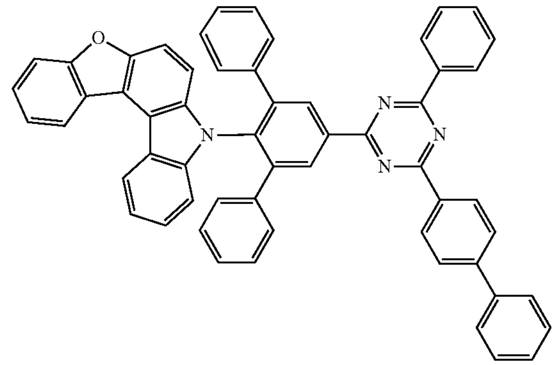
693
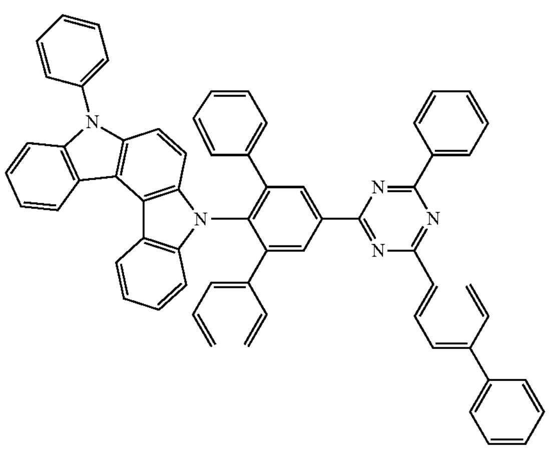
694
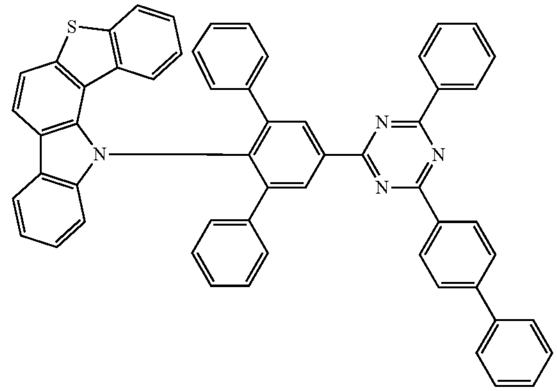
695
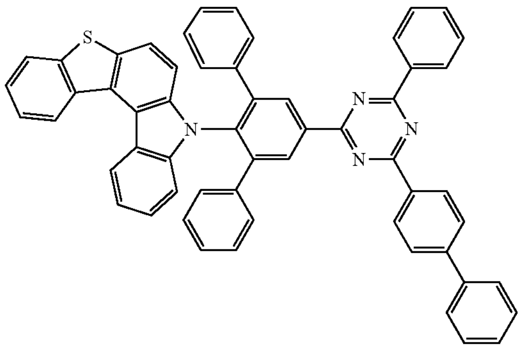
696
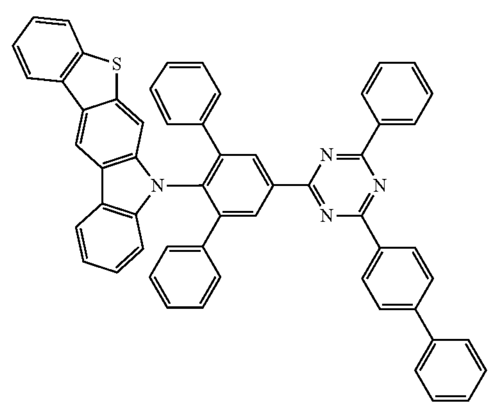

-continued
697
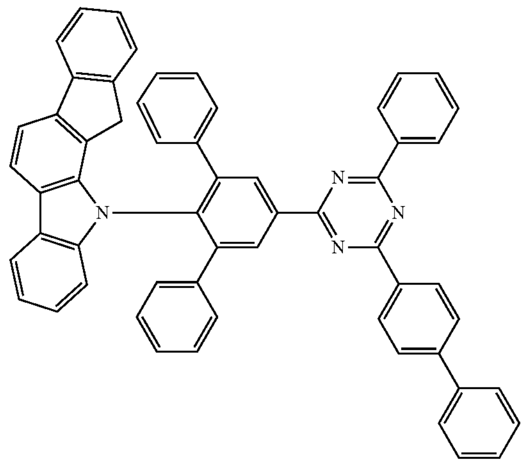
698
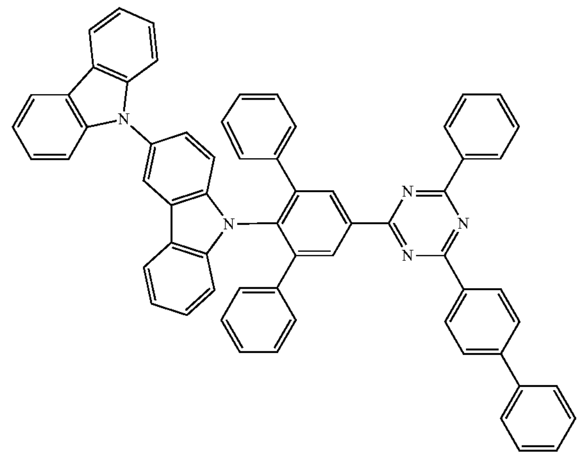
699
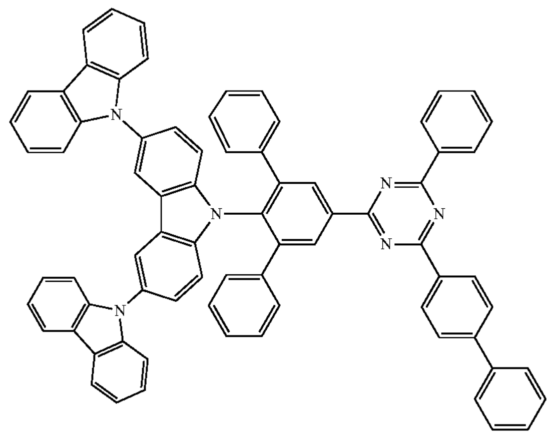
700
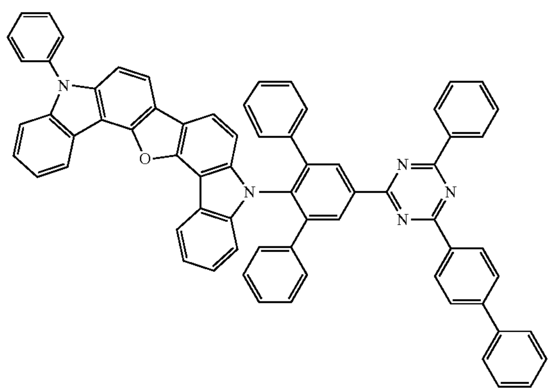
701
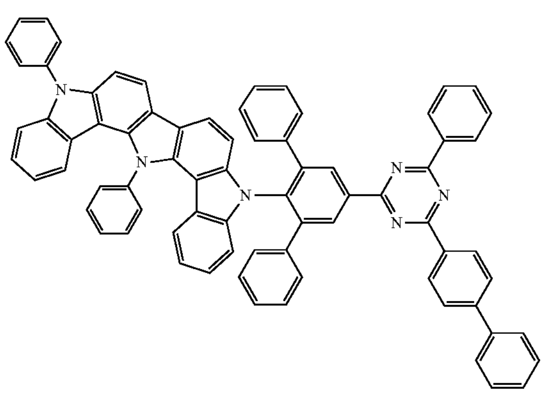
702
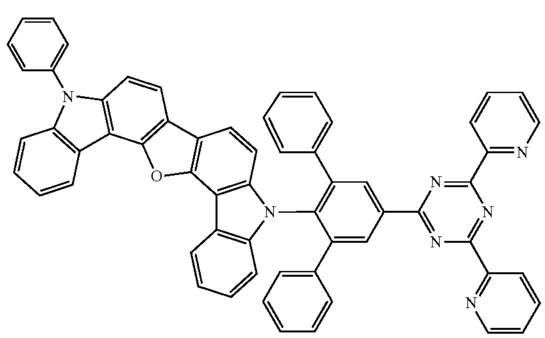

-continued
703
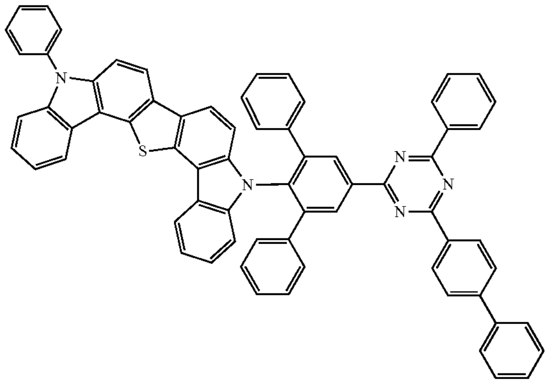
704
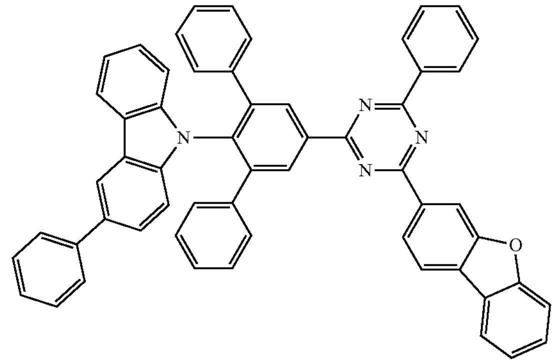
705
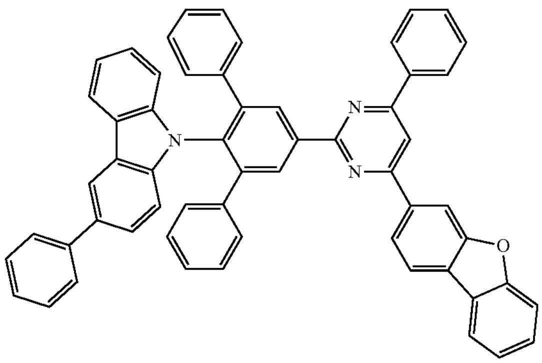
706
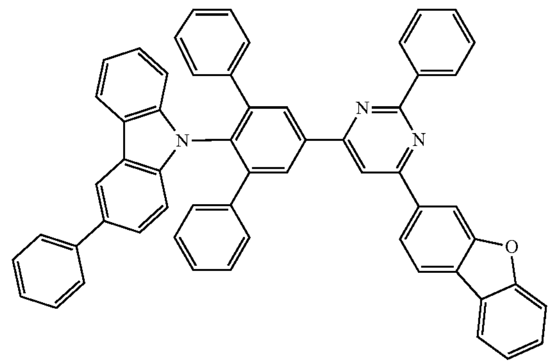
707
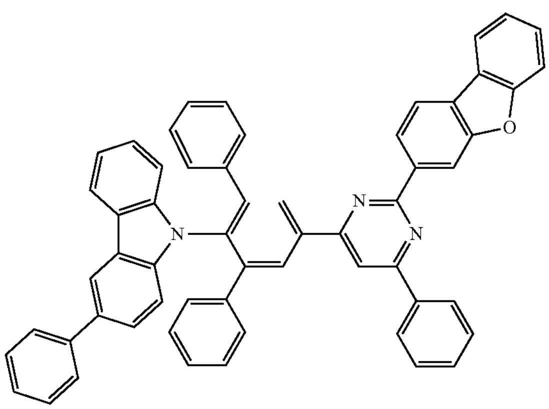
708
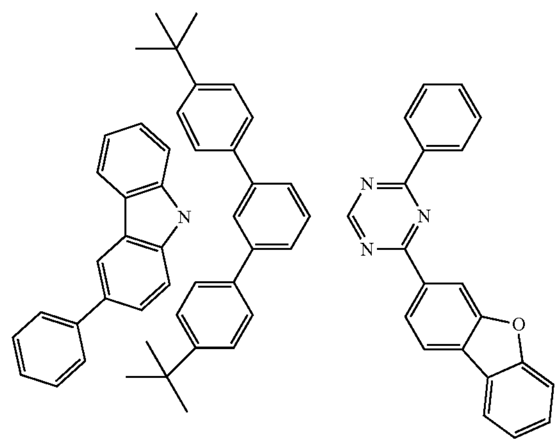
709
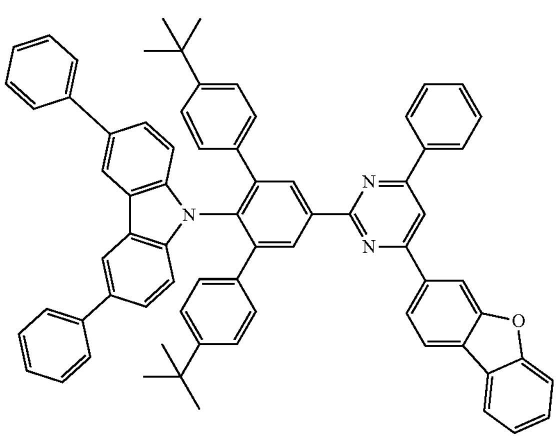
710
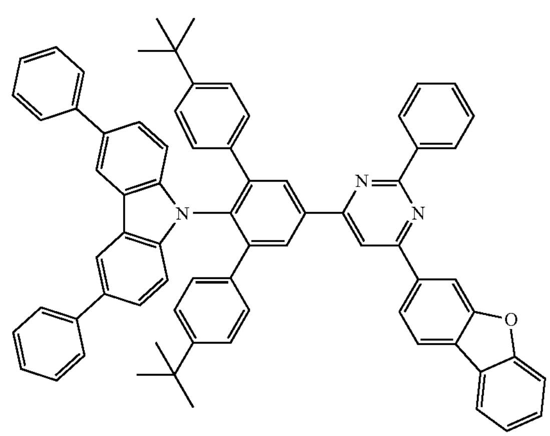

-continued
711
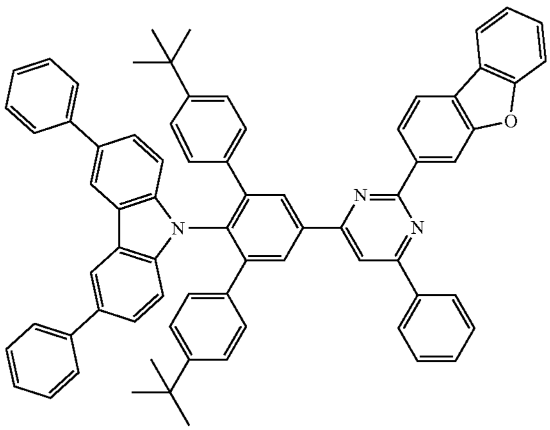
712
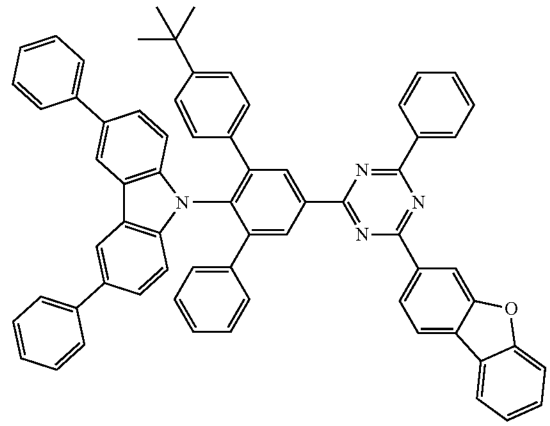
713
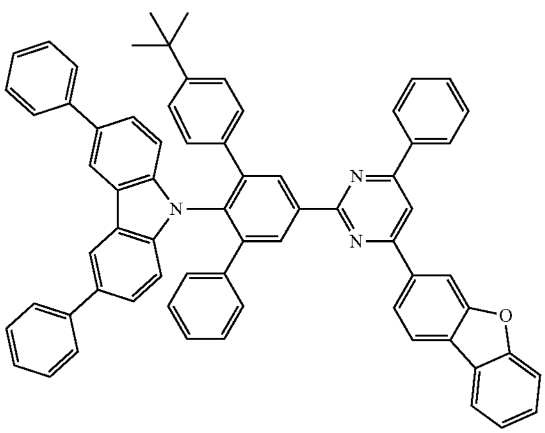
714
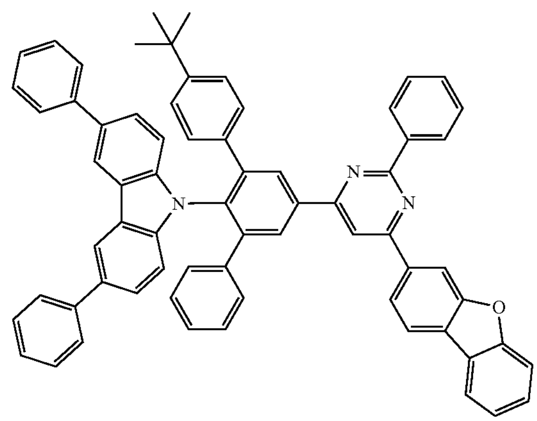
715
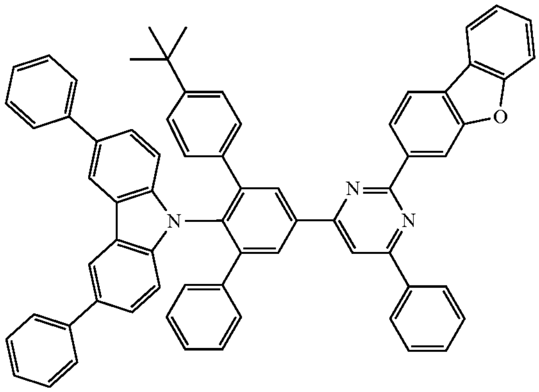
716
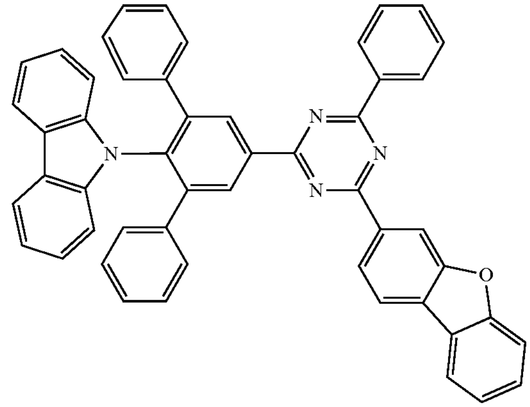

-continued
717
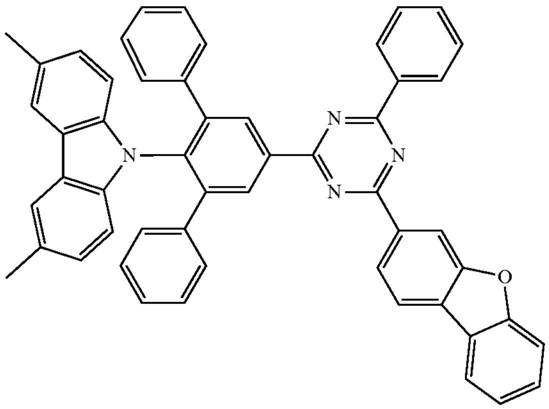
718
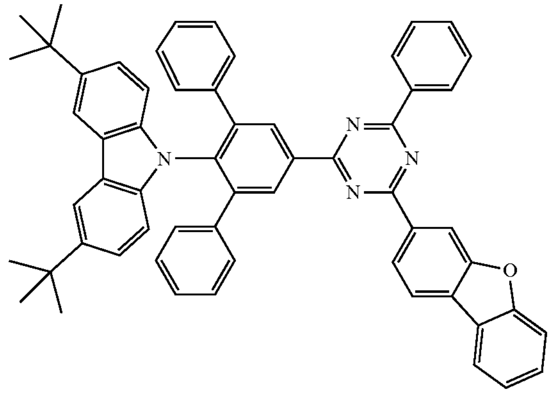
719
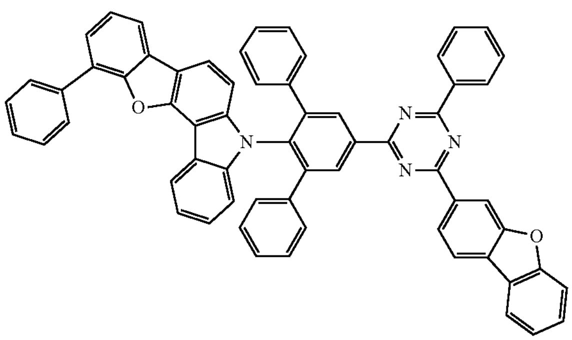
720
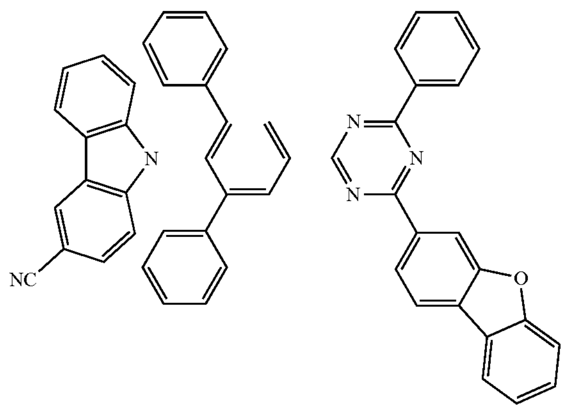
721
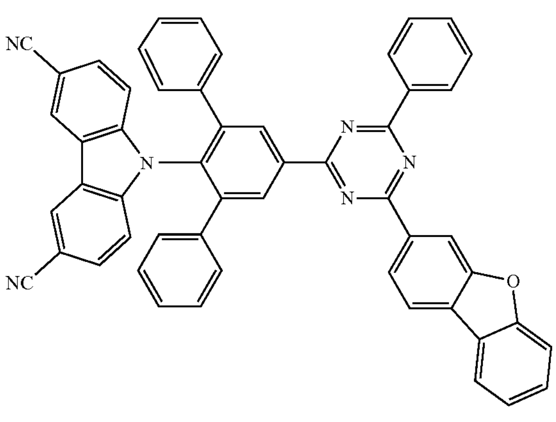
722
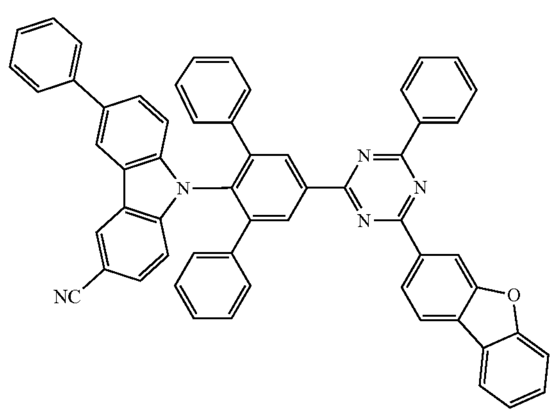

-continued
723
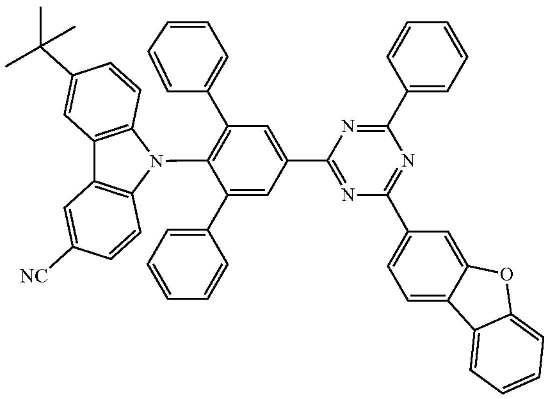
724
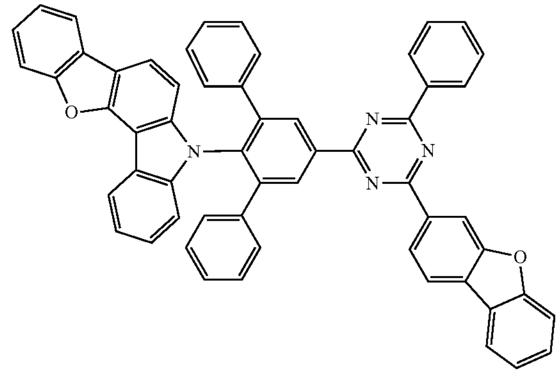
725
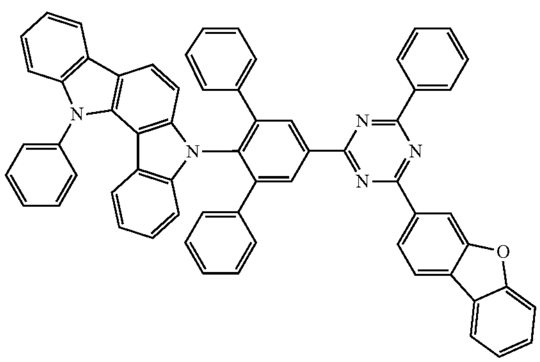
726
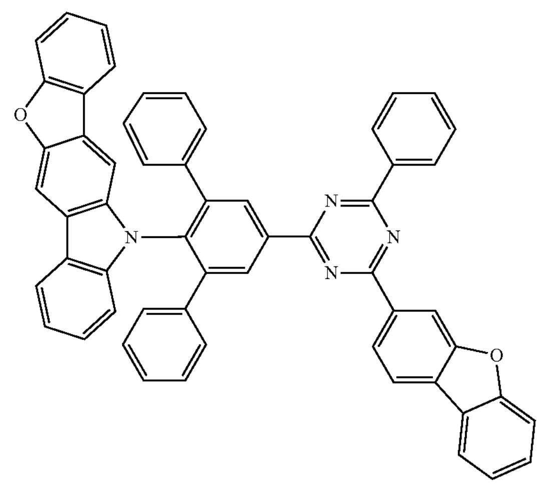
727
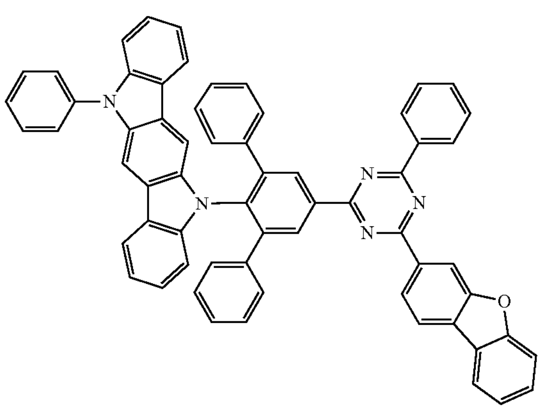
728
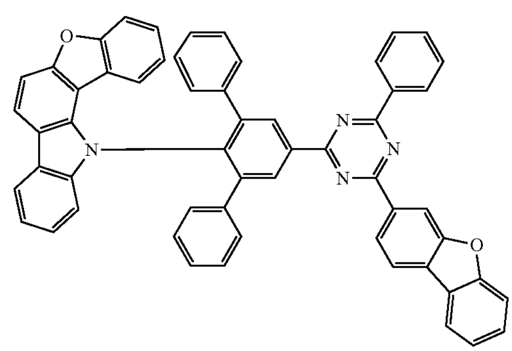

-continued
729
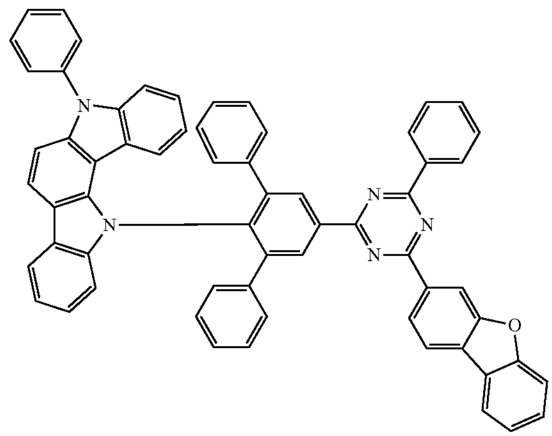
730
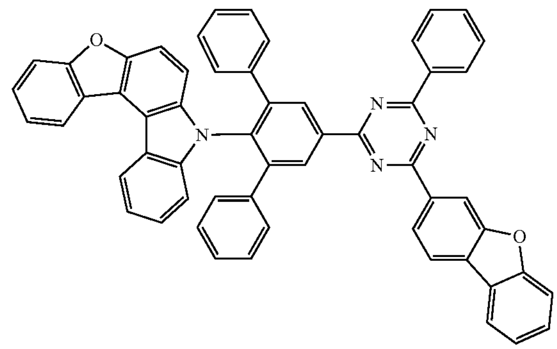
731
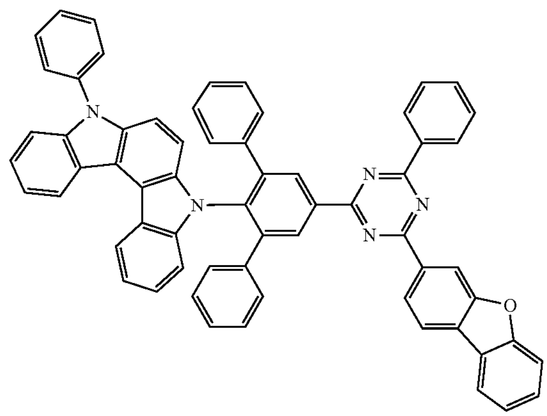
732
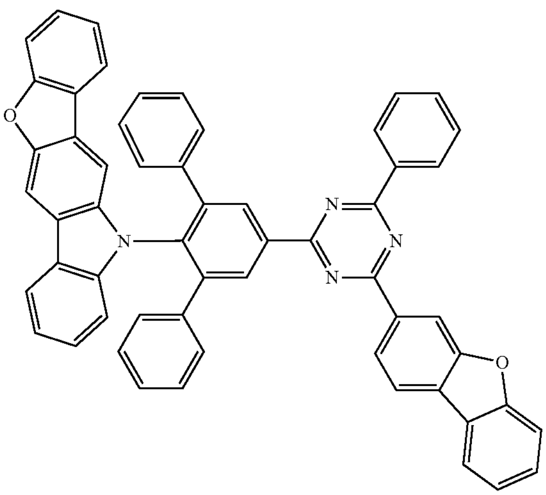
733
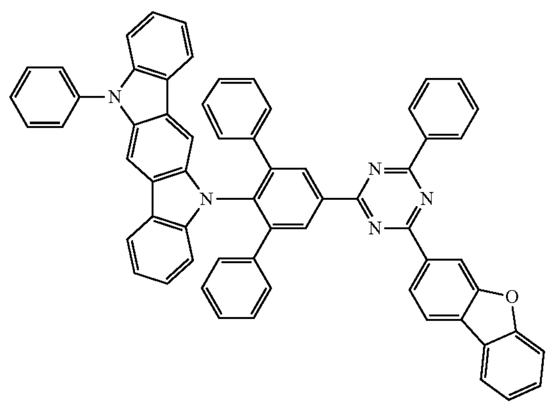
734
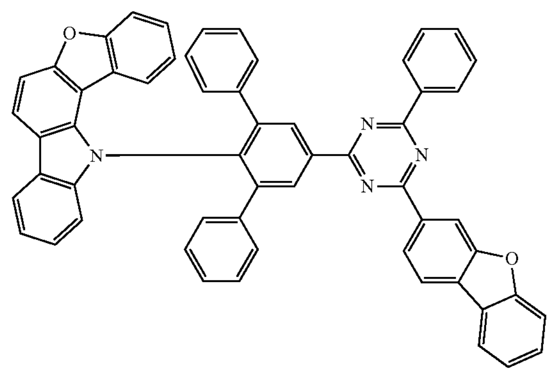

-continued
735
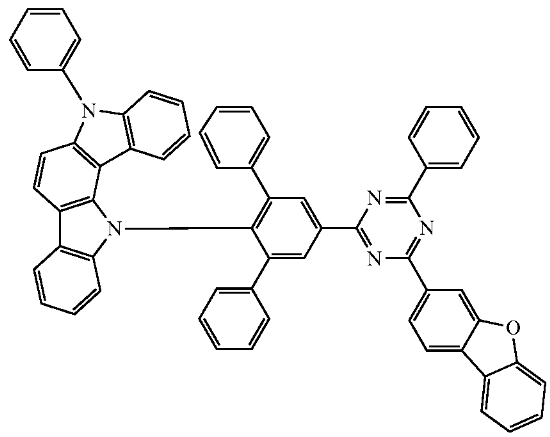
736
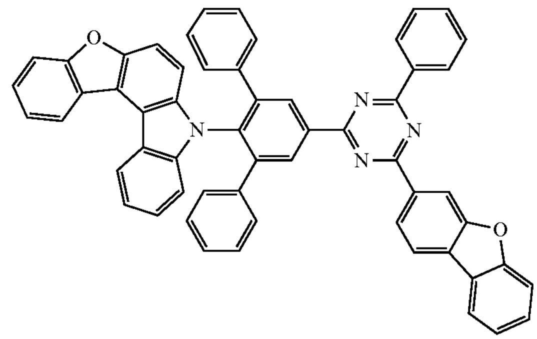
737
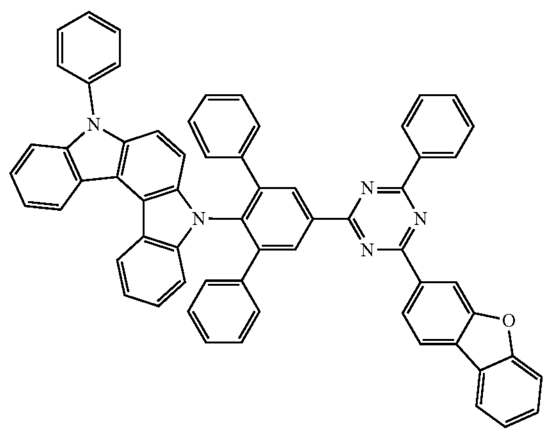
738
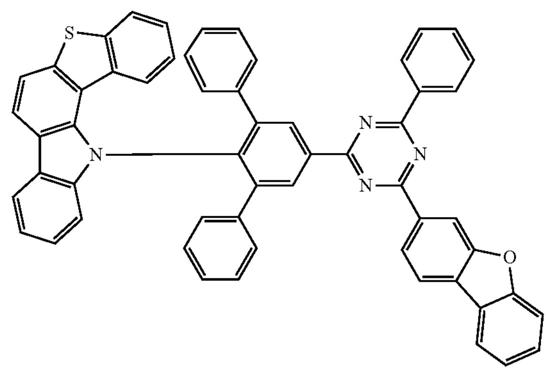
739
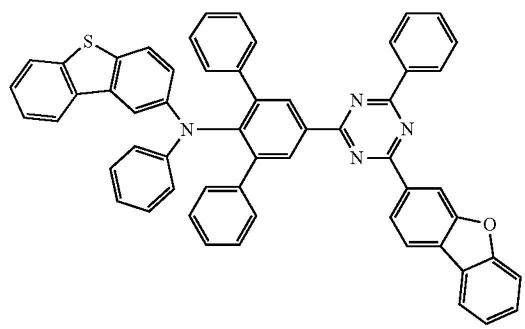
740
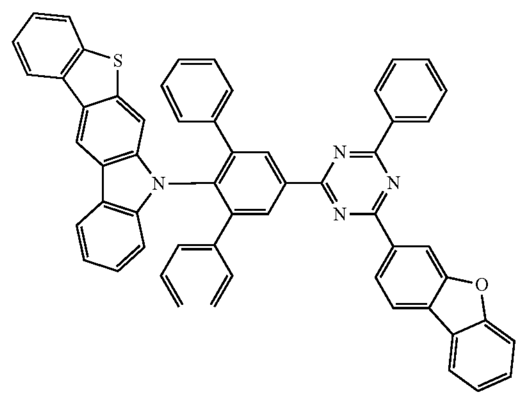

-continued
741
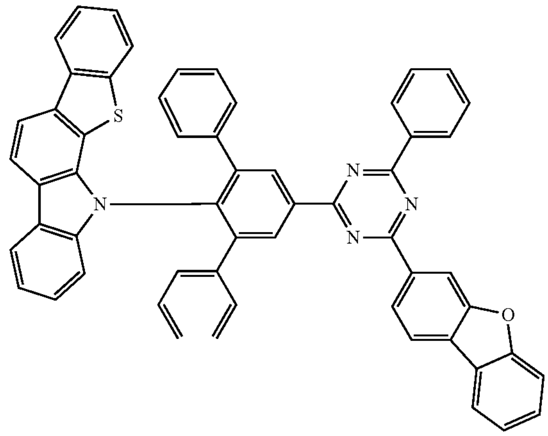
742
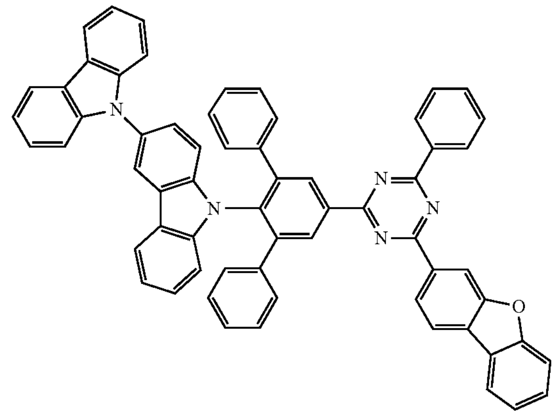
743
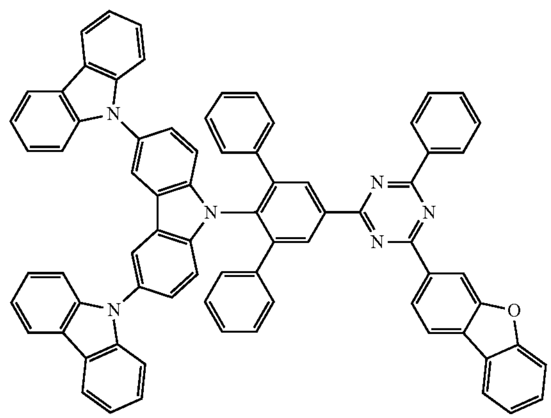
744
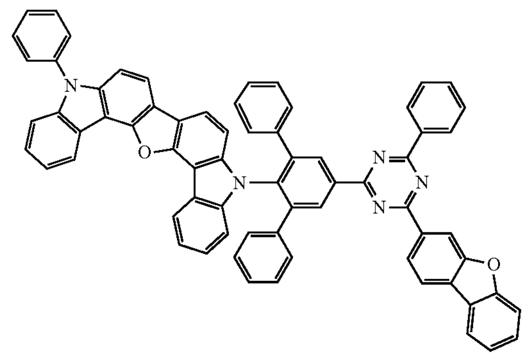
745
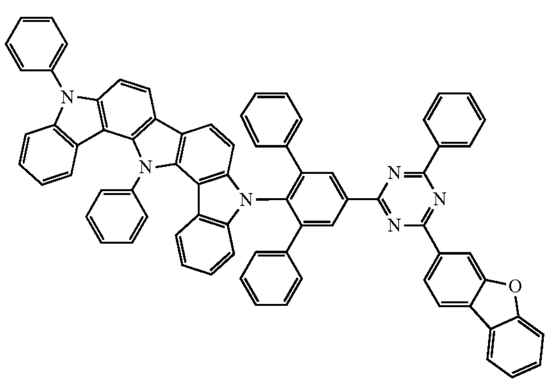
746
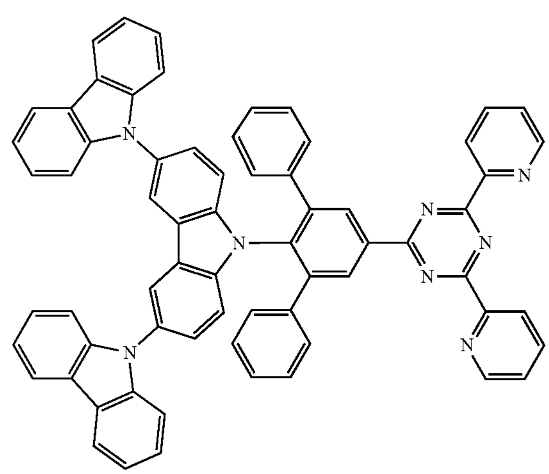

-continued
747
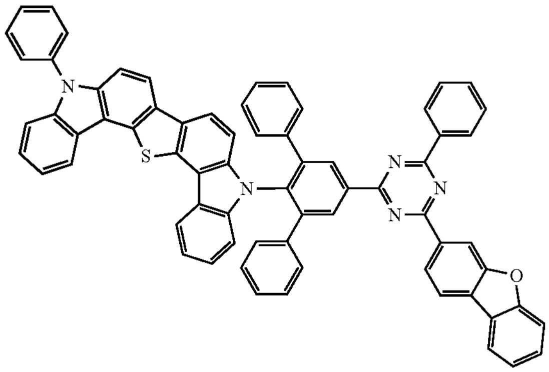
748
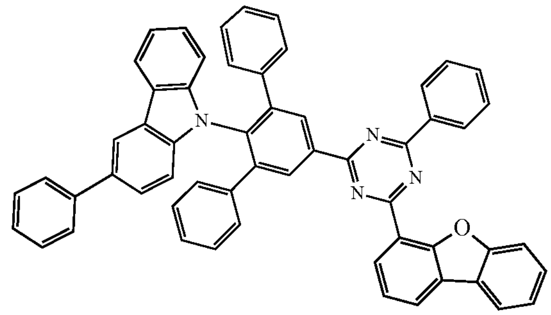
749
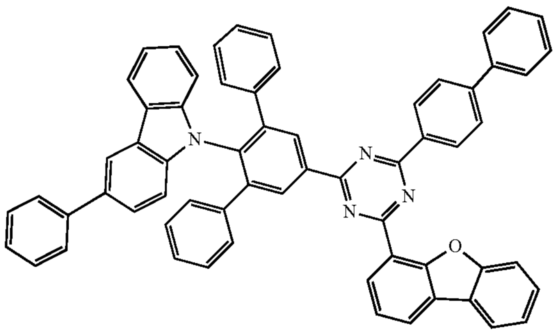
750
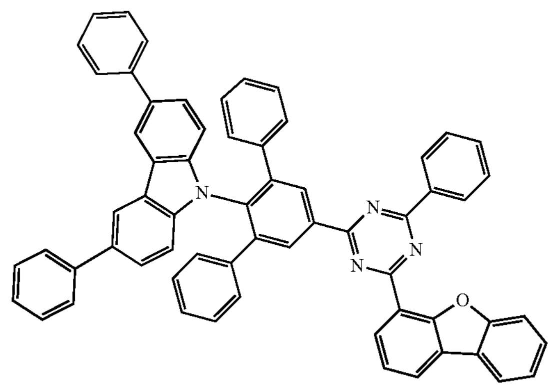
751
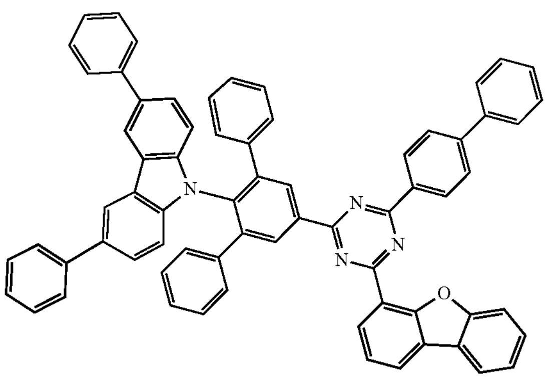
752
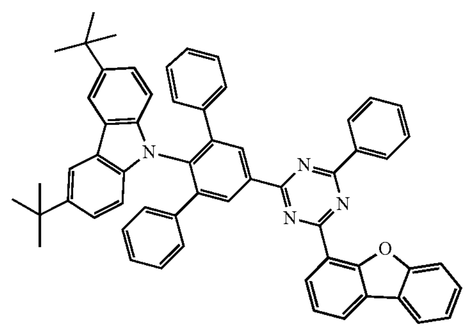
753
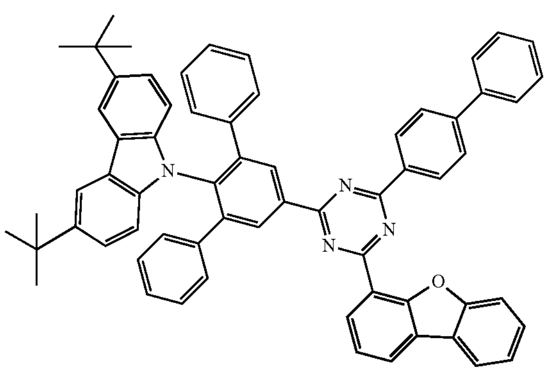
754
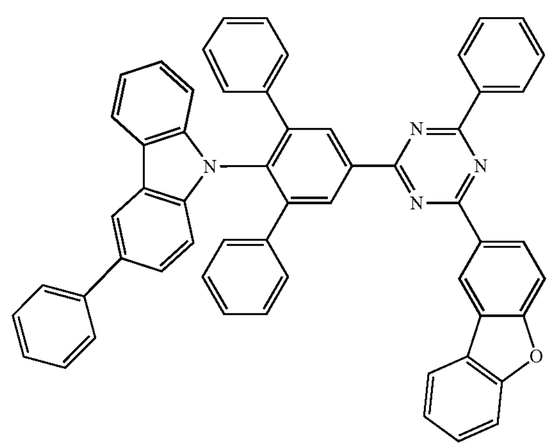

-continued
755
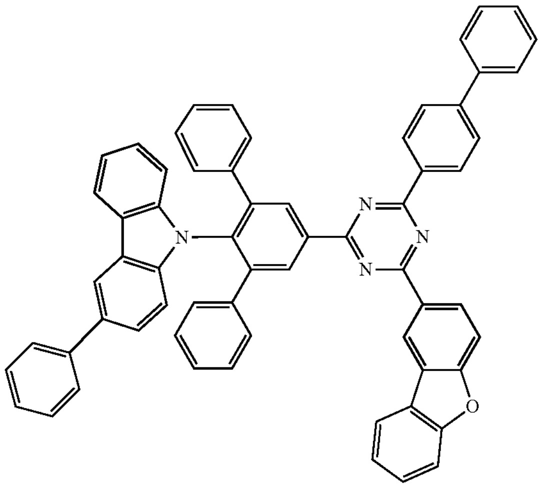
756
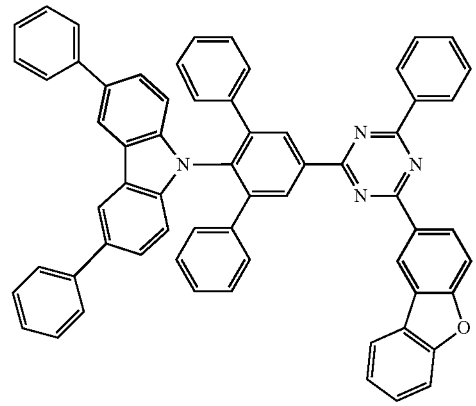
757
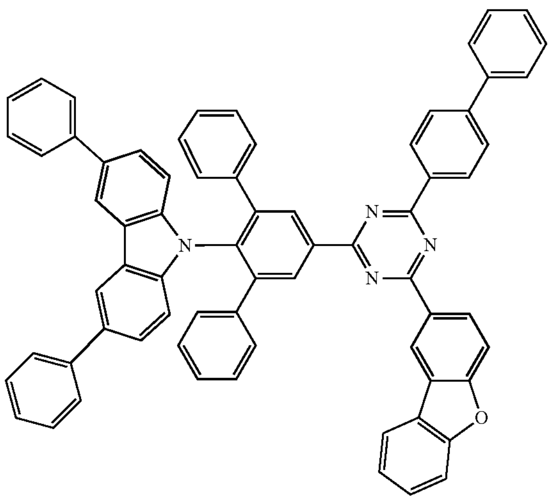
758
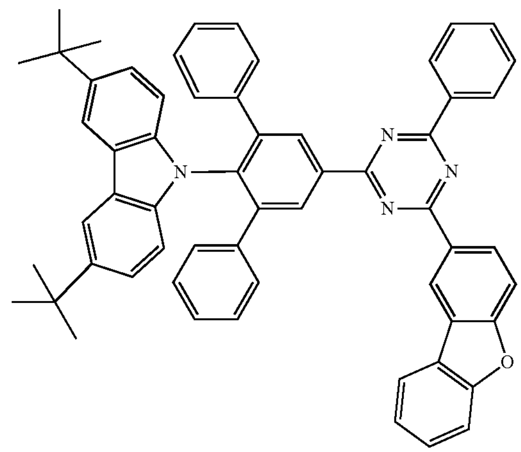
759
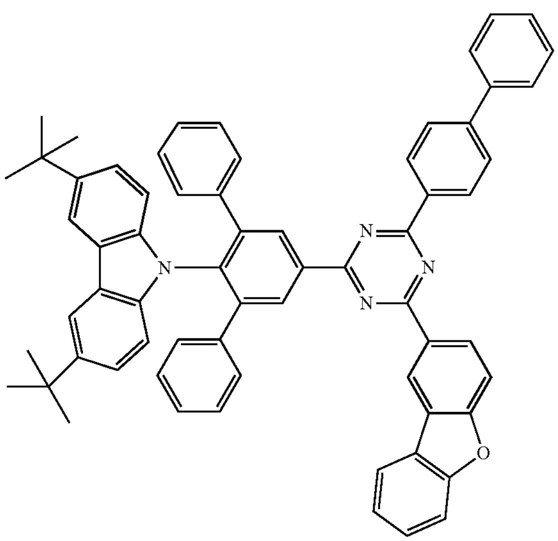
760
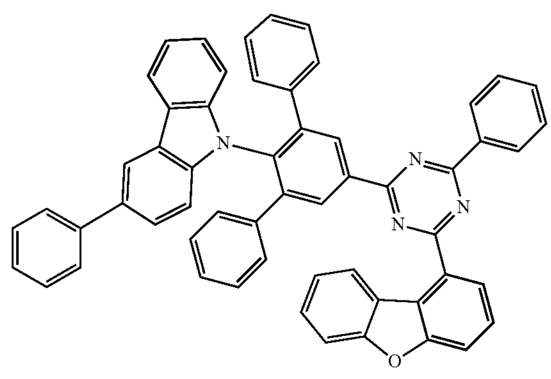

-continued
761
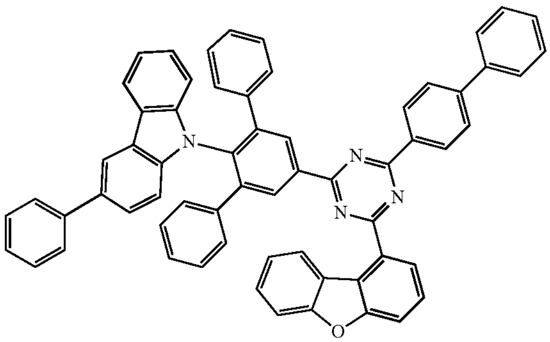
762
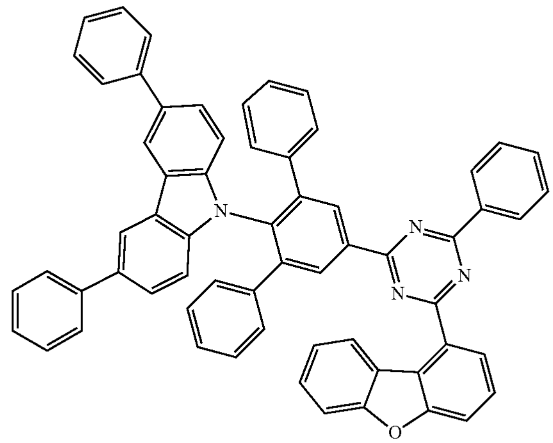
763
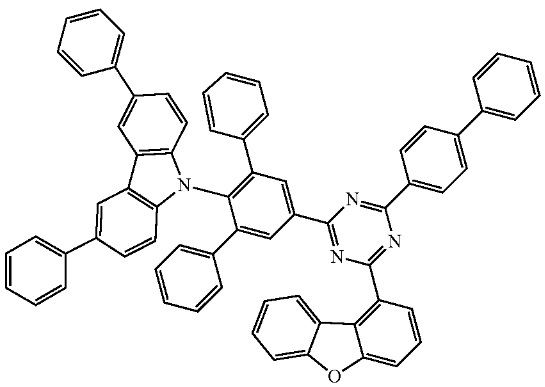
764
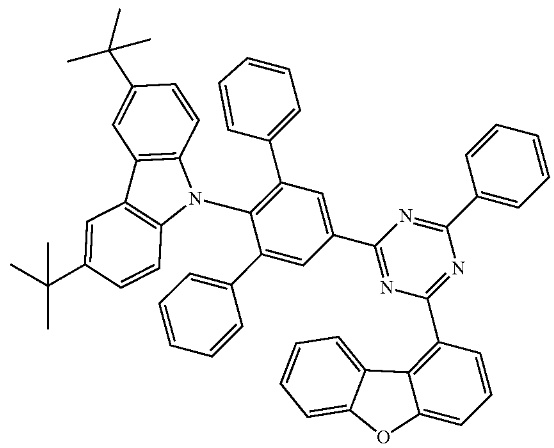
765
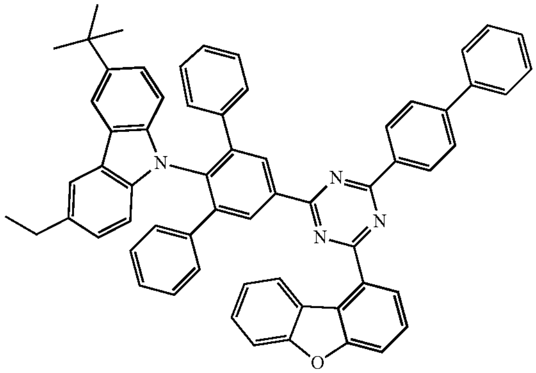
766
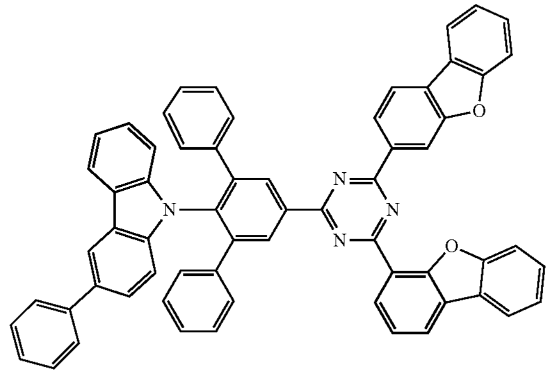

-continued
767
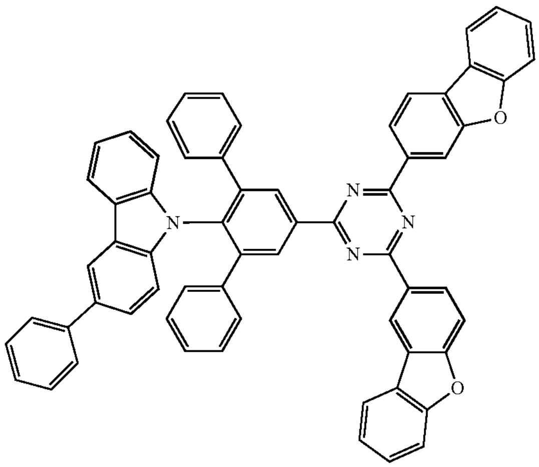
768
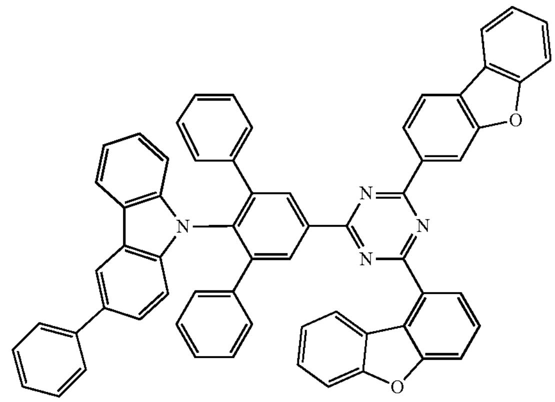
769
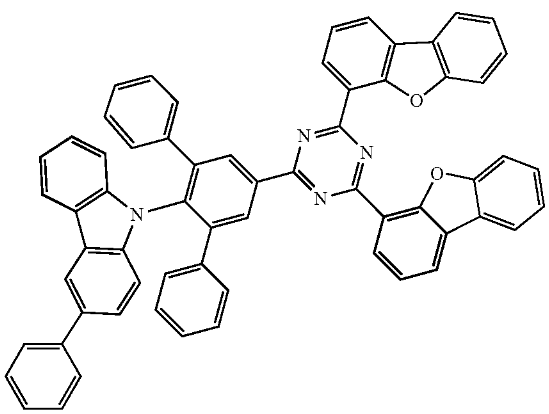
770
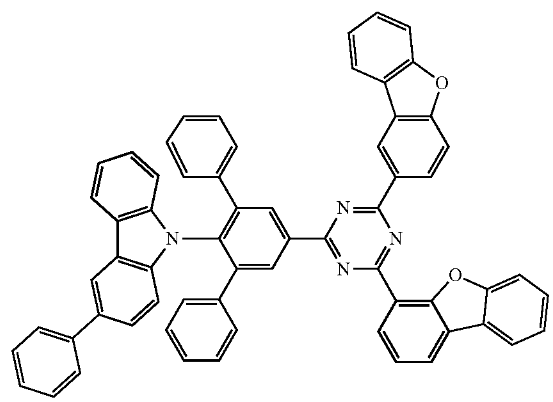
771
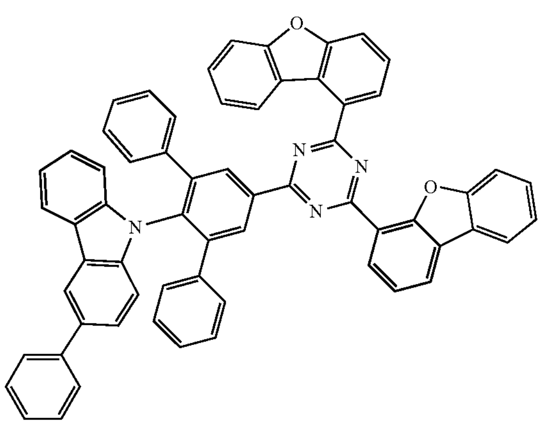
772
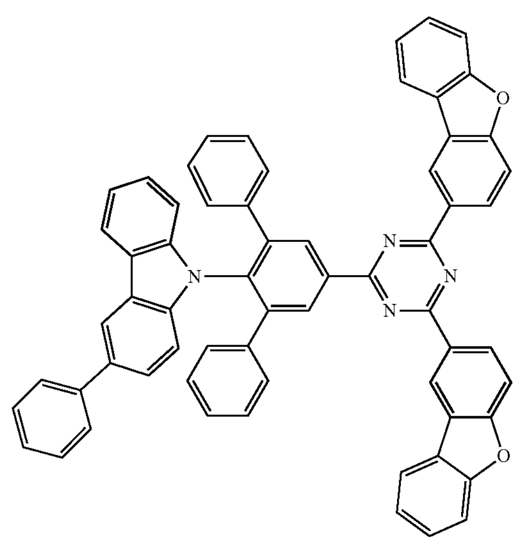

-continued
773
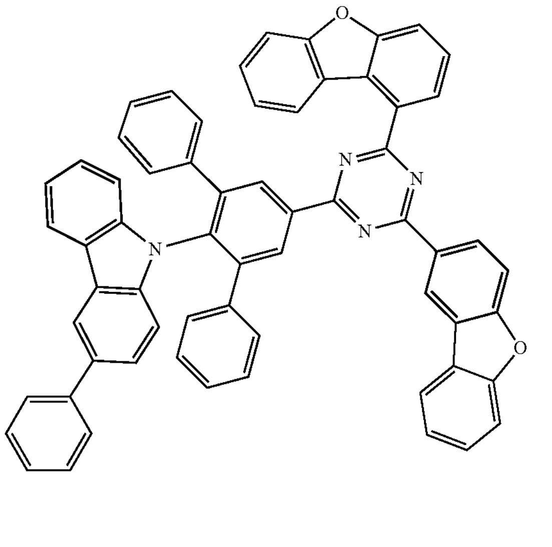
774
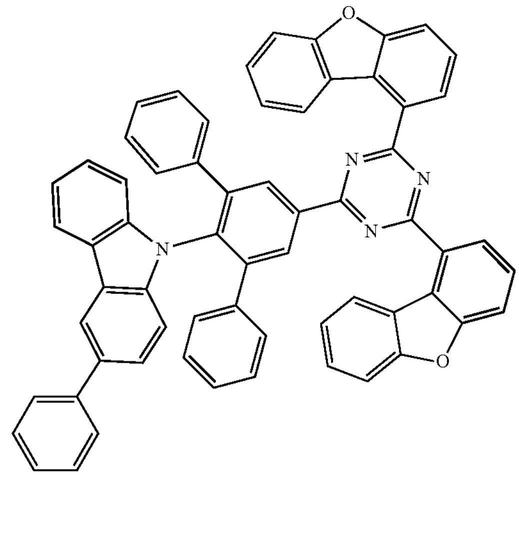
775
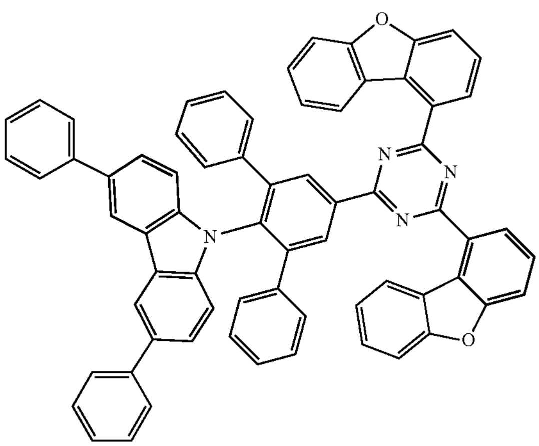
776
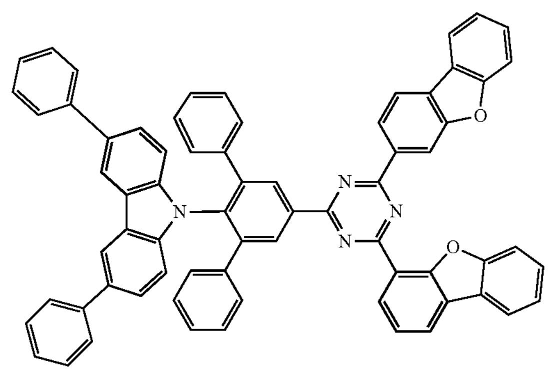
777
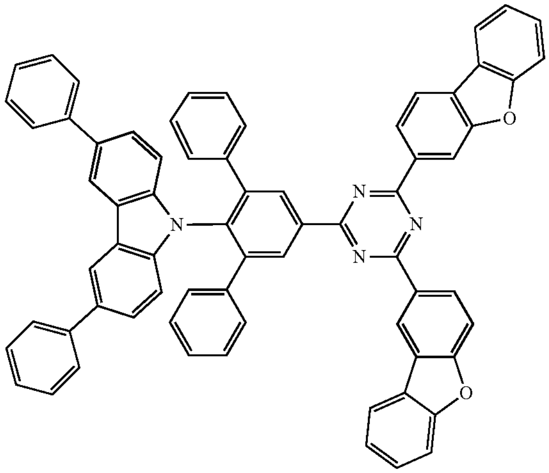
778
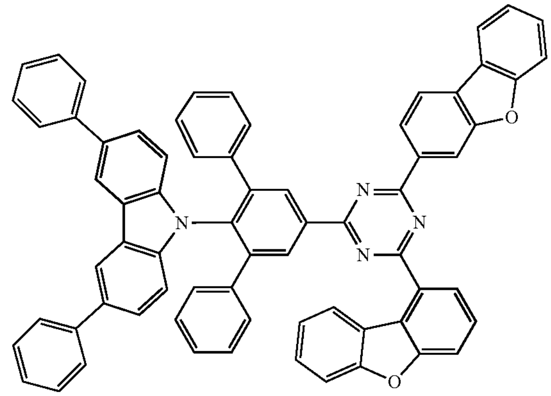

-continued
779
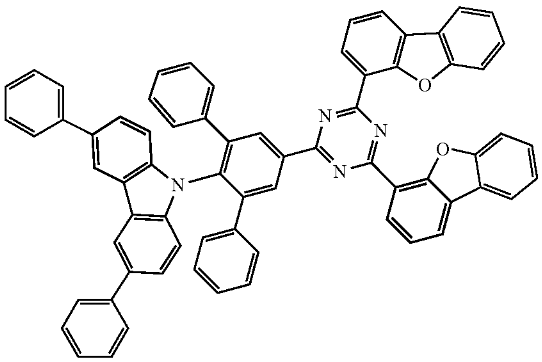
780
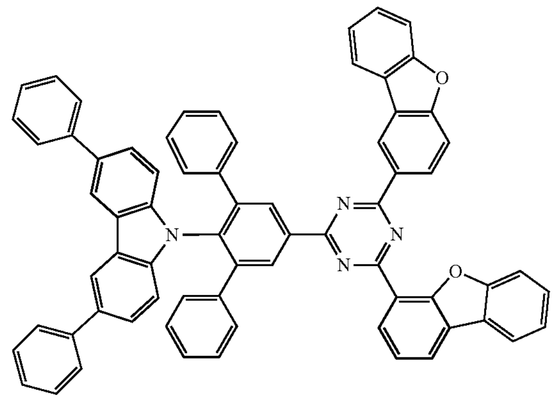
781
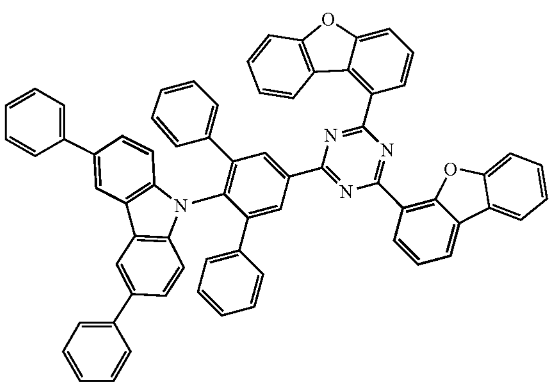
782
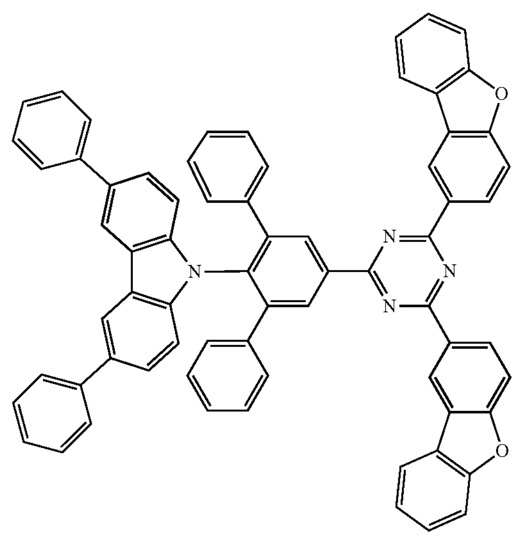
783
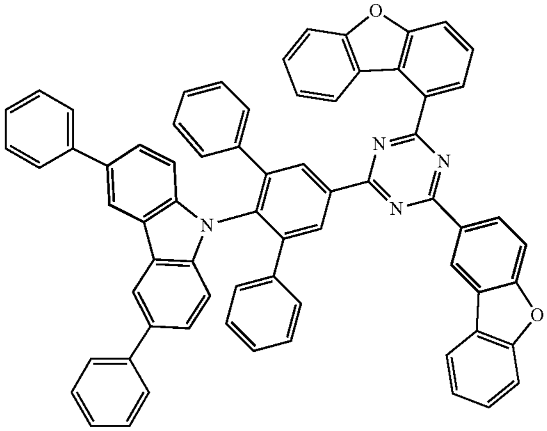
784
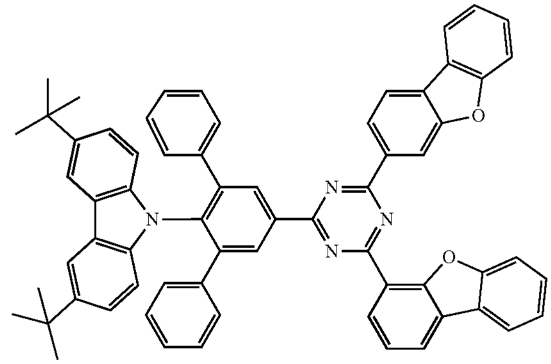

-continued
785
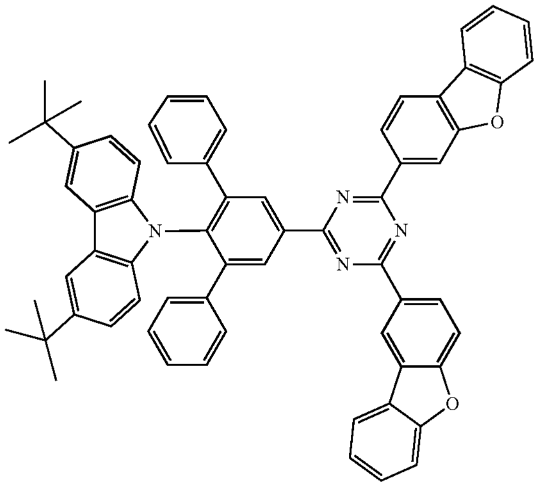
786
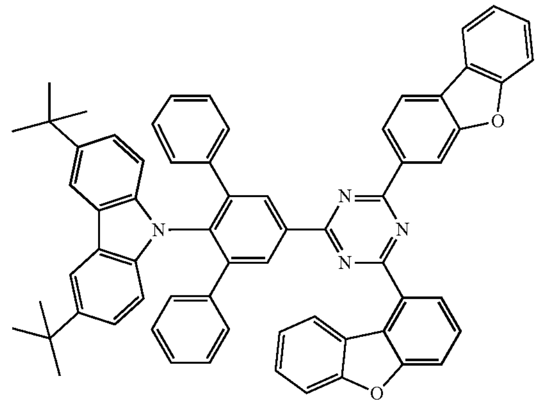
787
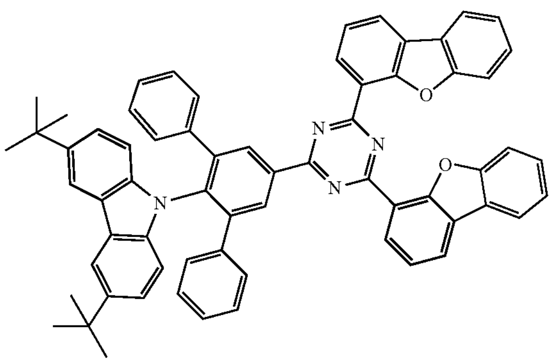
788
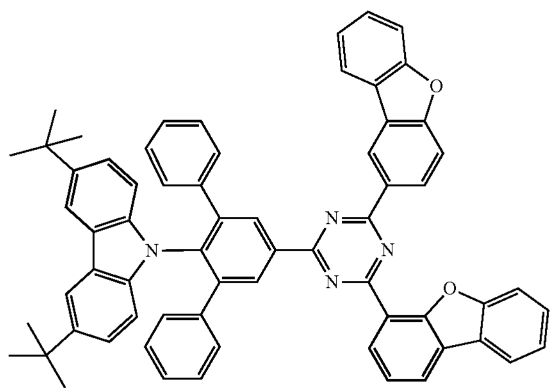
789
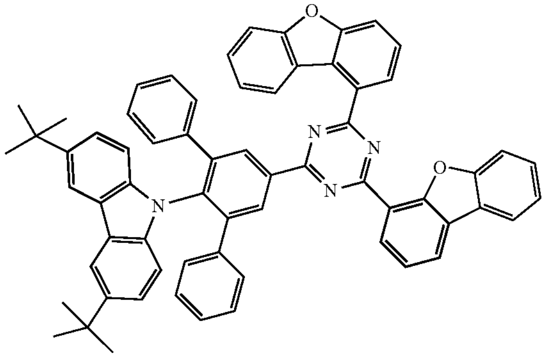
790
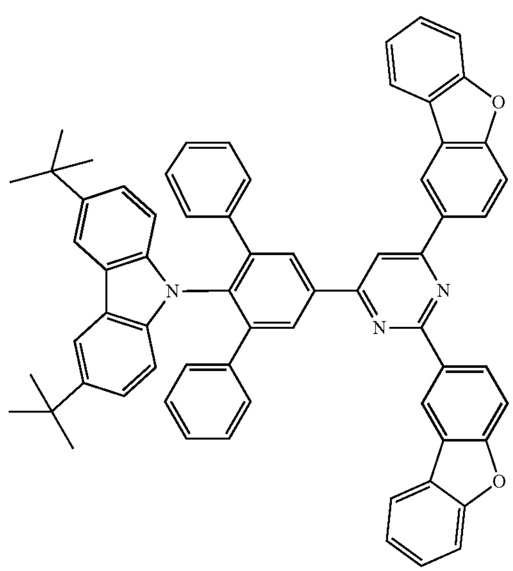

-continued
791
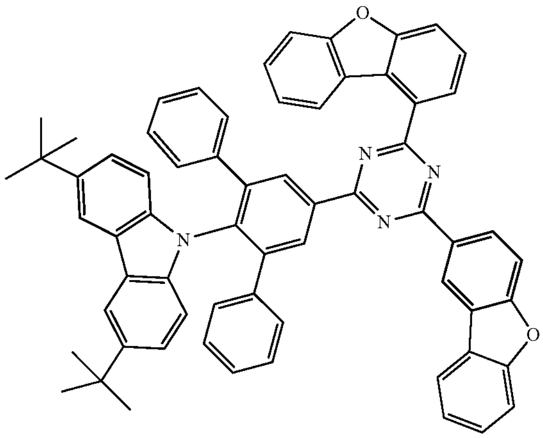
792
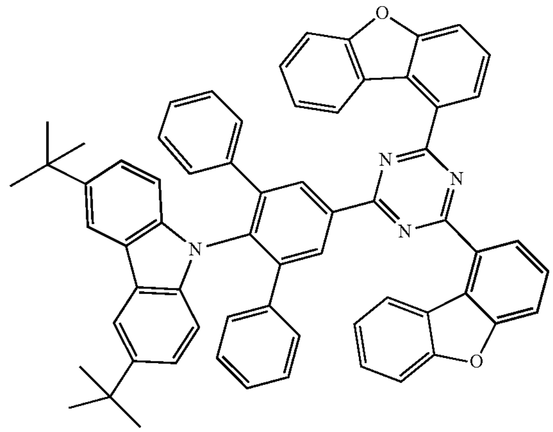
793
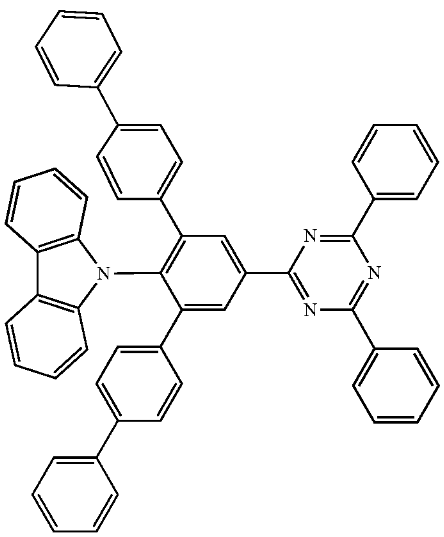
794
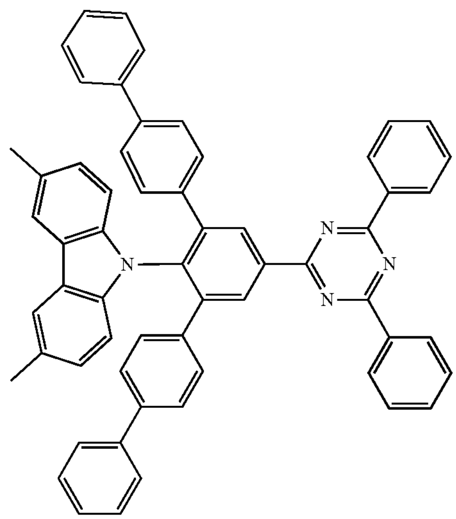
795
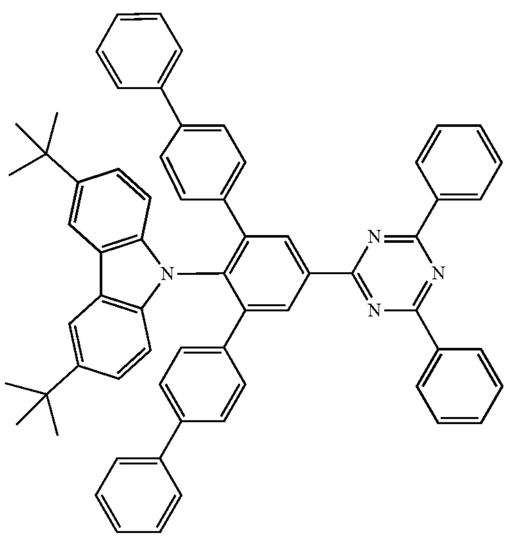
796
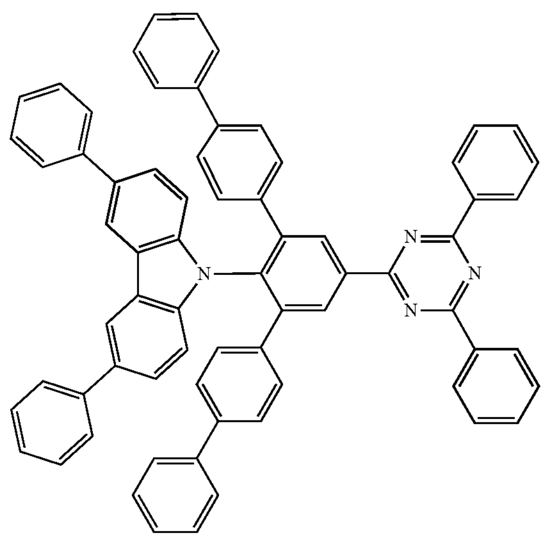

-continued
797
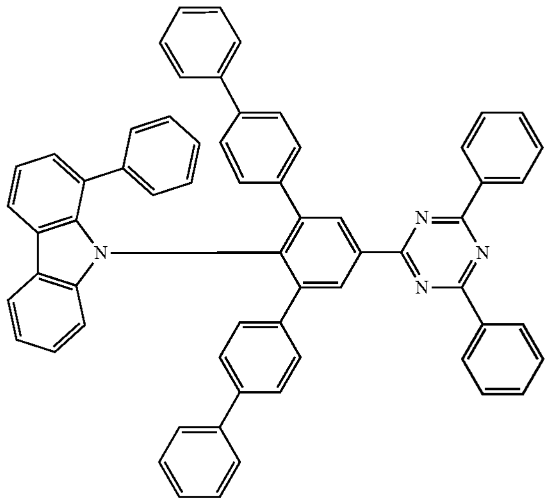
798
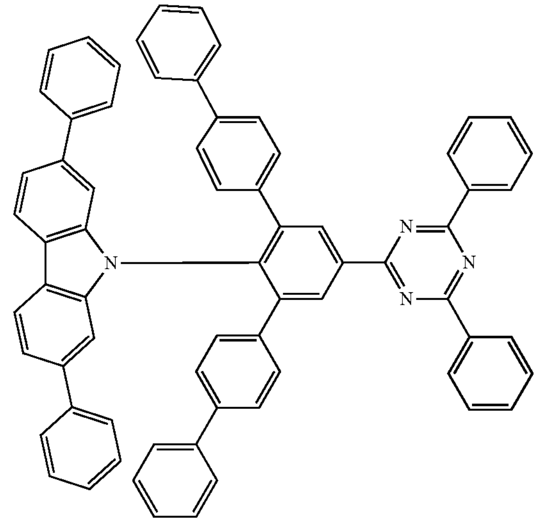
799
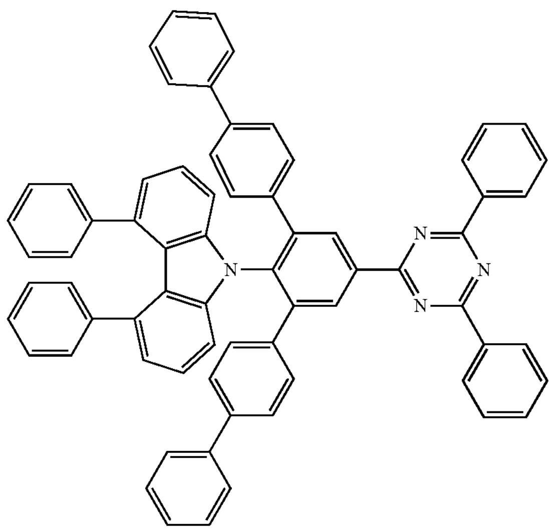
800
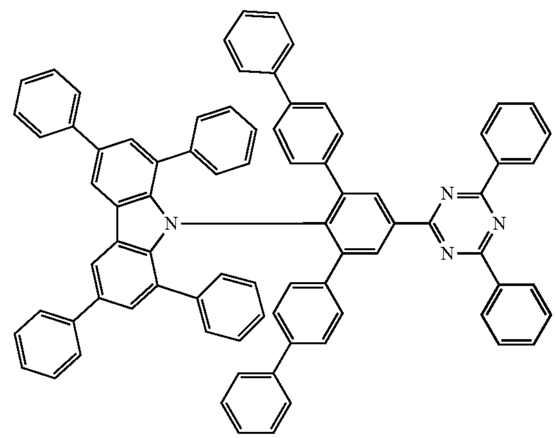
801
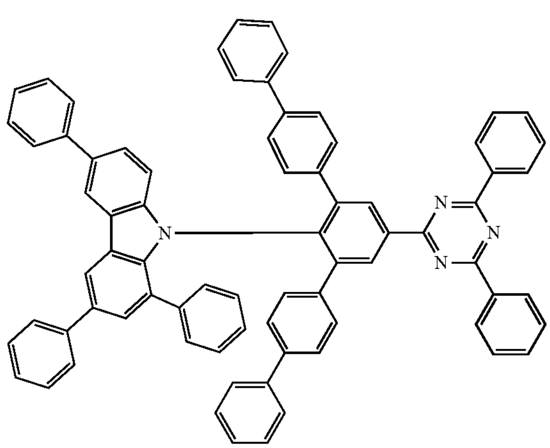
802
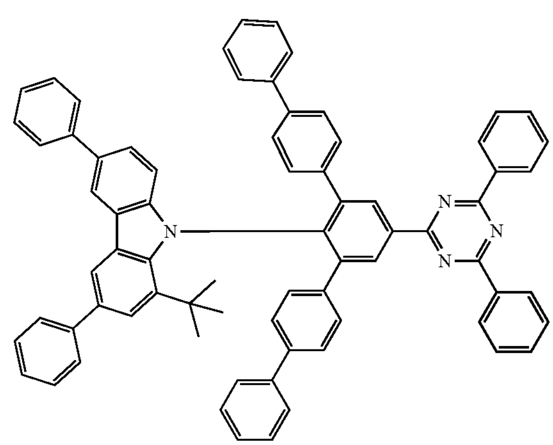

-continued
803
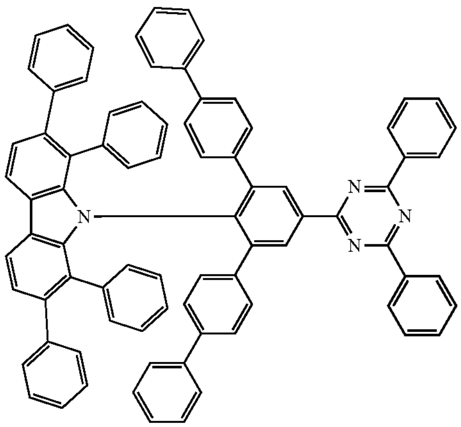
804
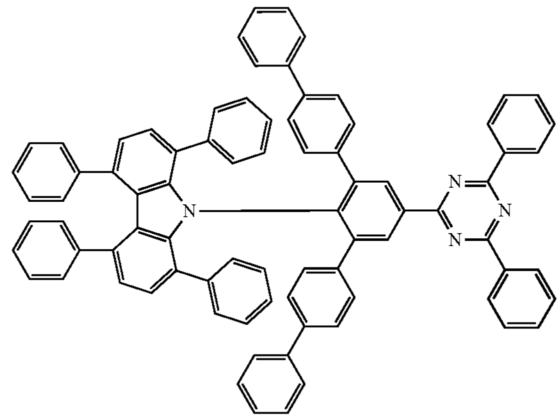
805
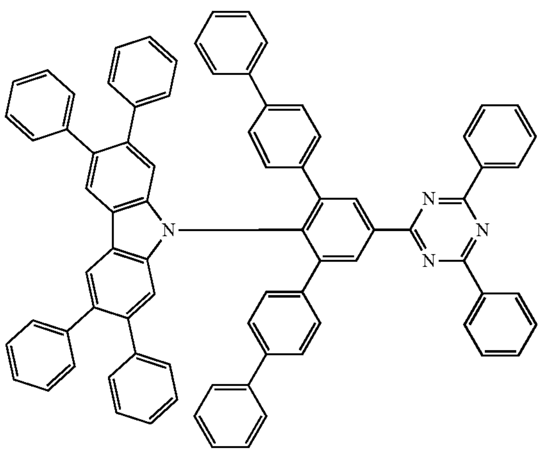
806
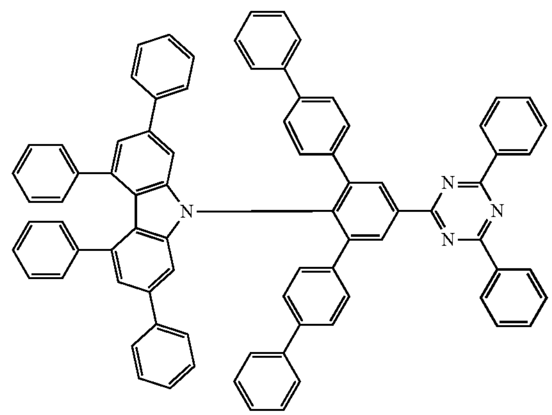
807
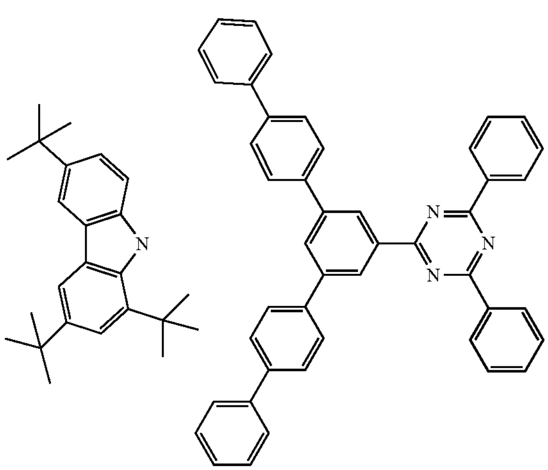
808
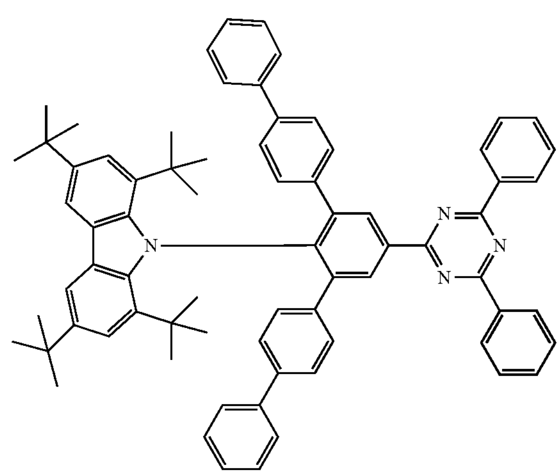

-continued
809
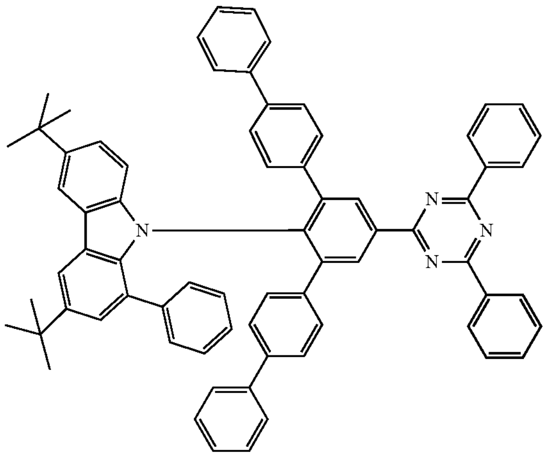
810
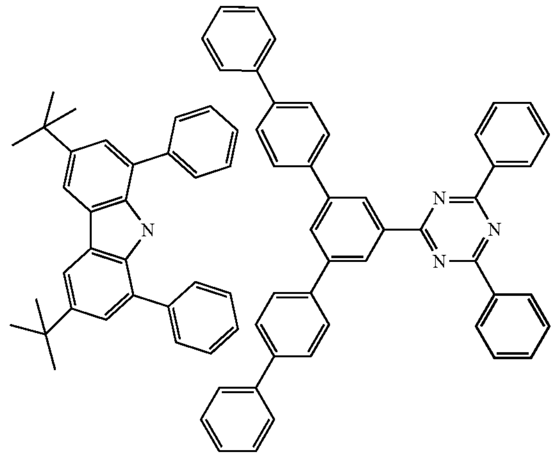
811
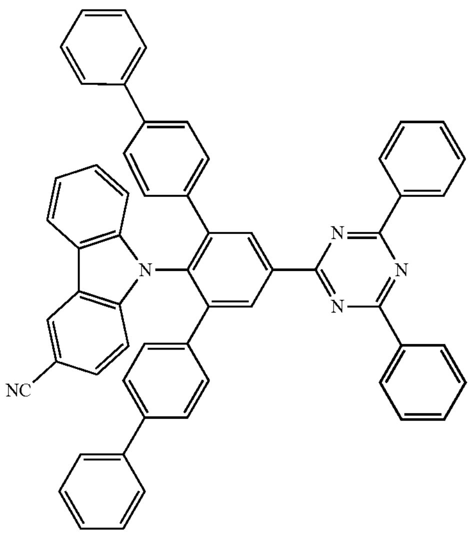
812
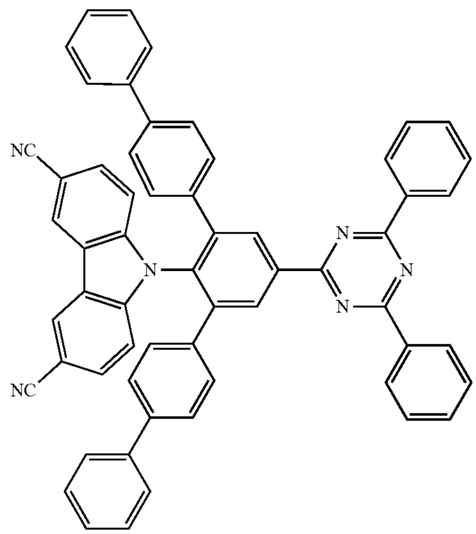
813
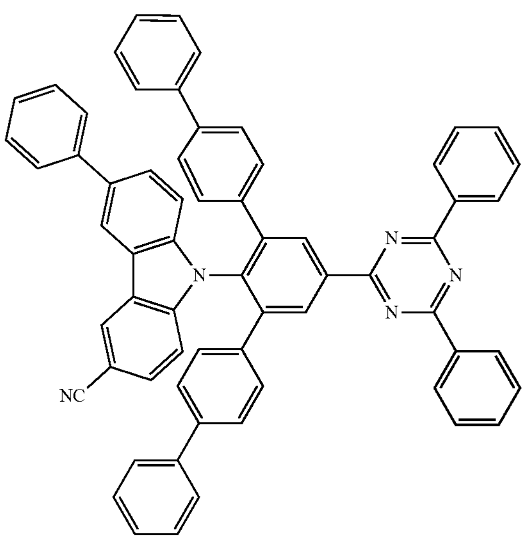
814
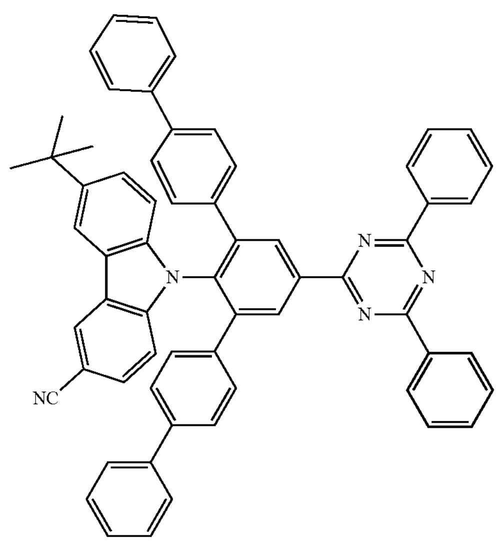

-continued
815
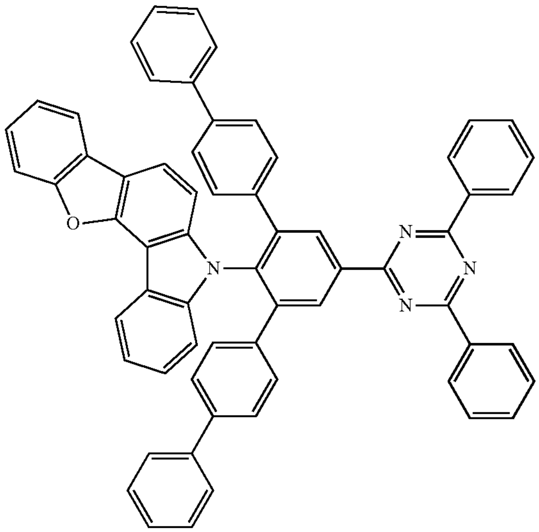
816
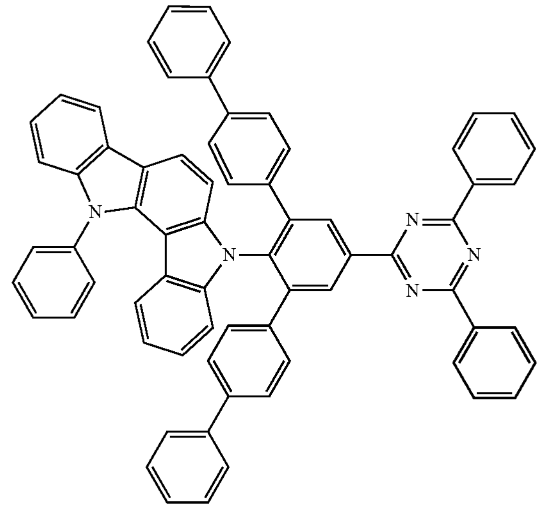
817
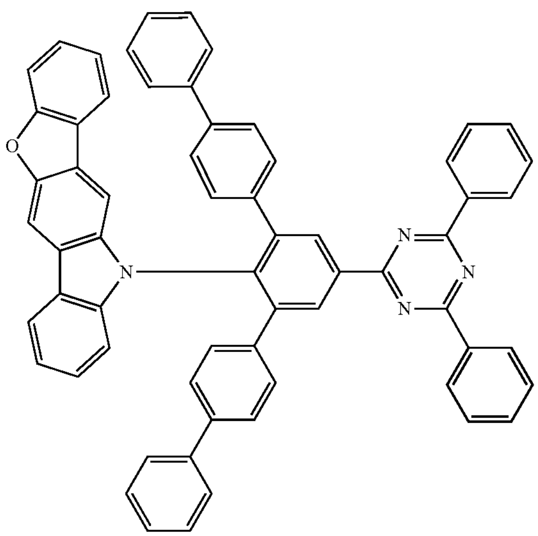
818
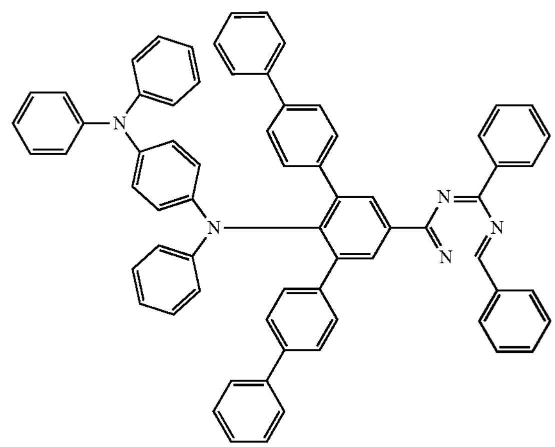
819
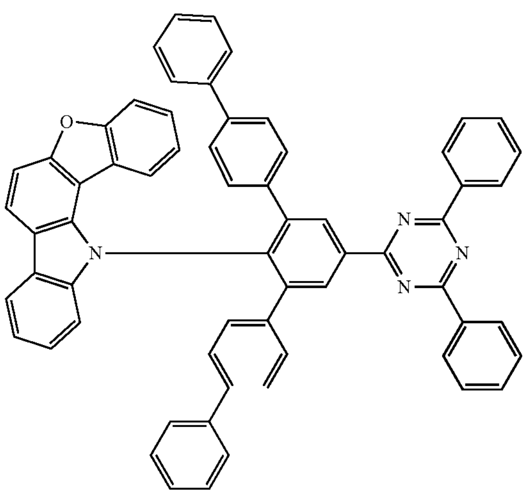
820
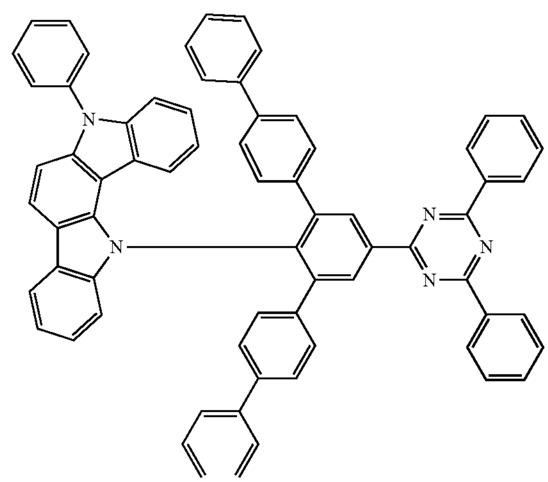

-continued
821
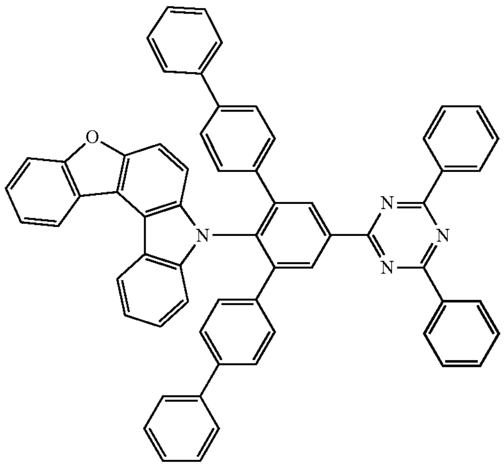
822
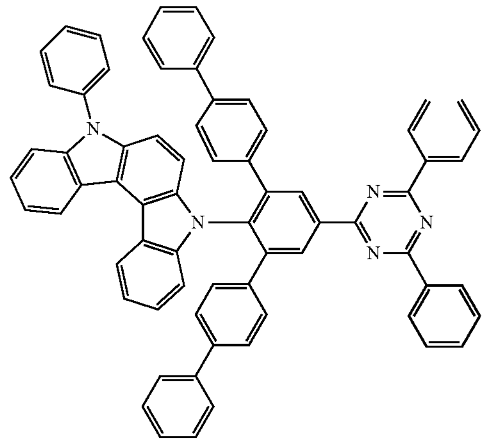
823
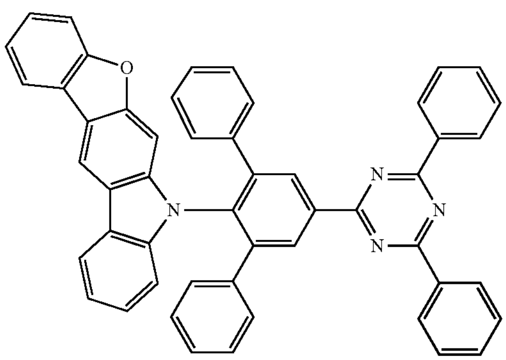
824
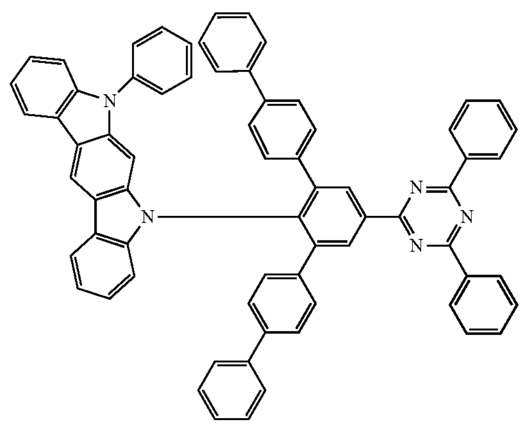
825
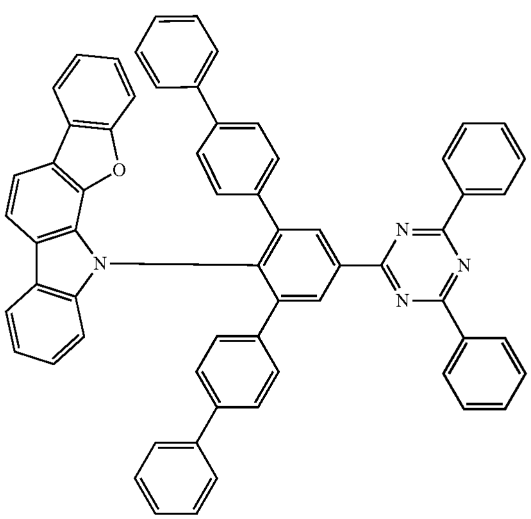
826
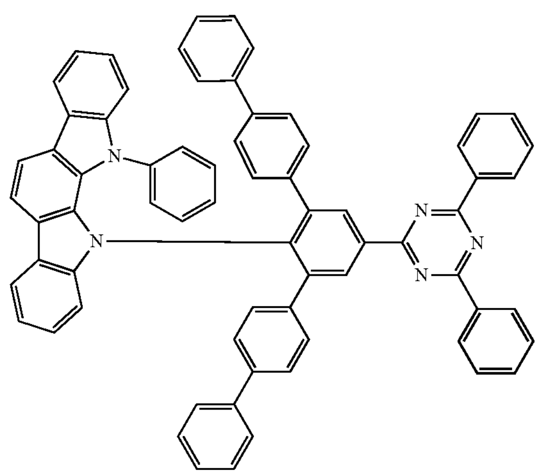

-continued
827
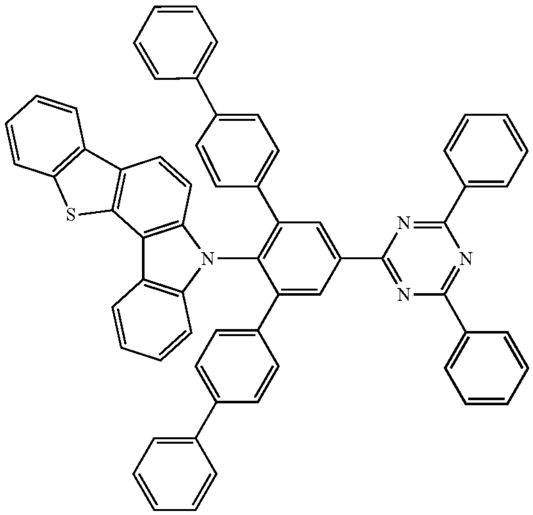
828
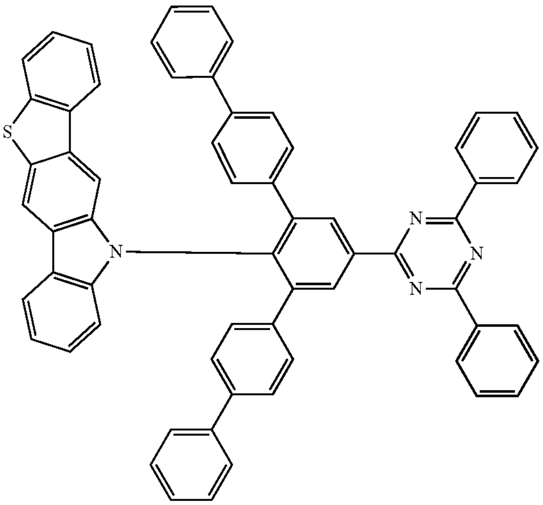
829
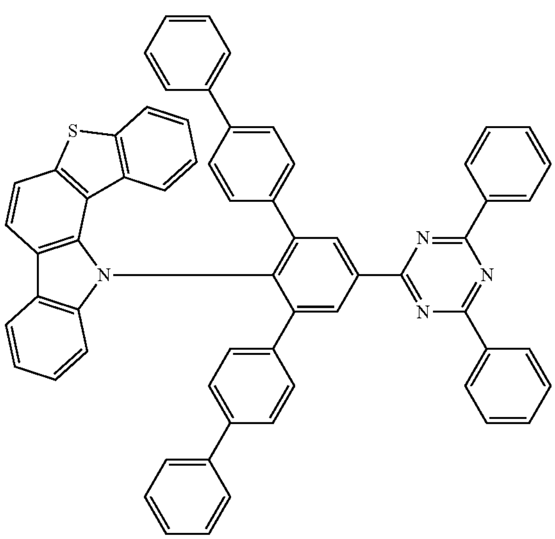
830
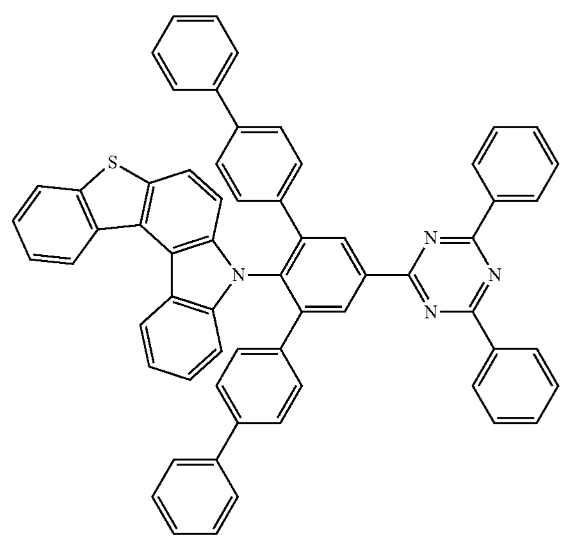

-continued
831
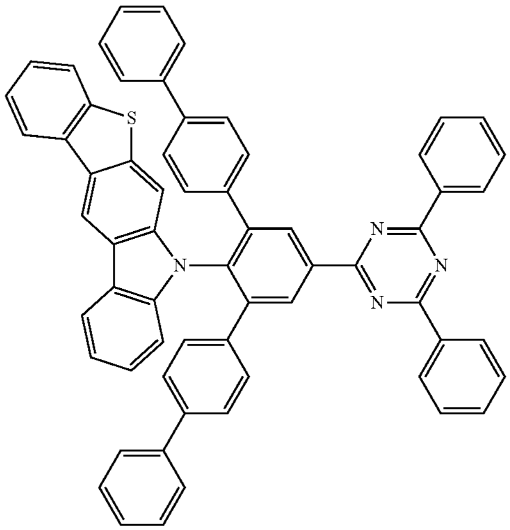
832
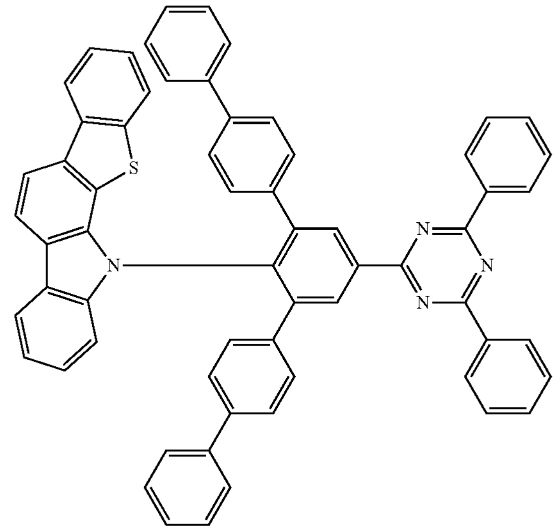
833
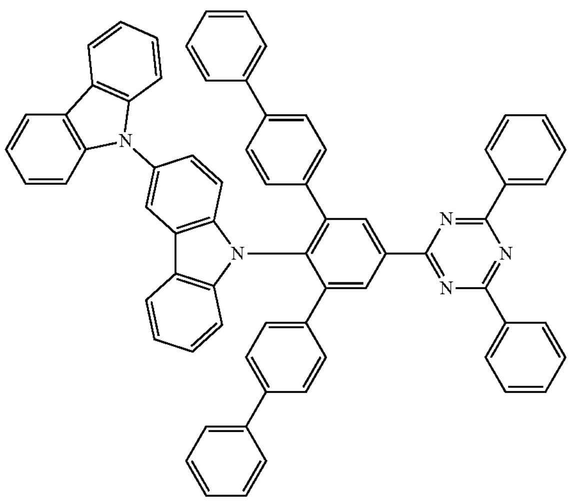
834
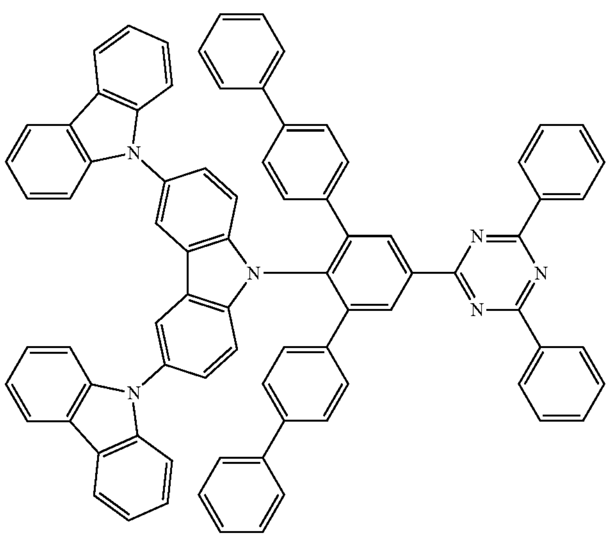

-continued
835
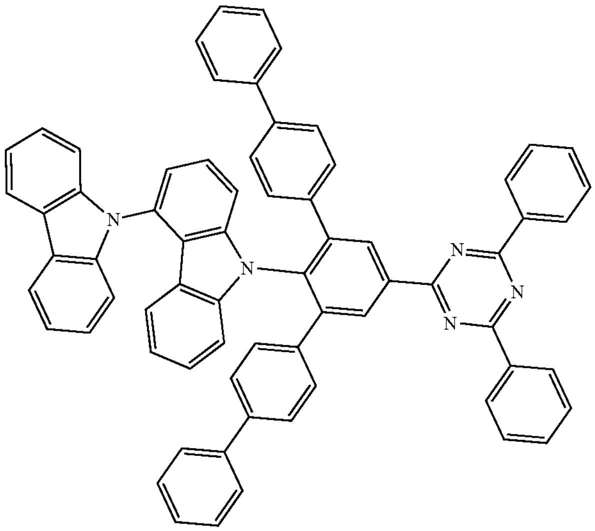
836
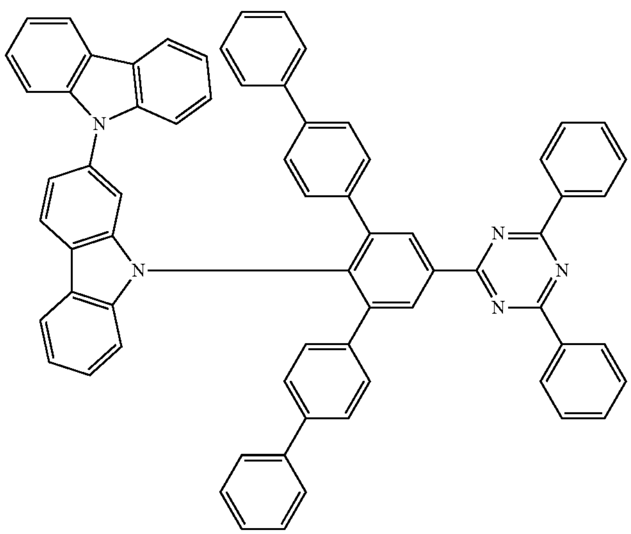
837
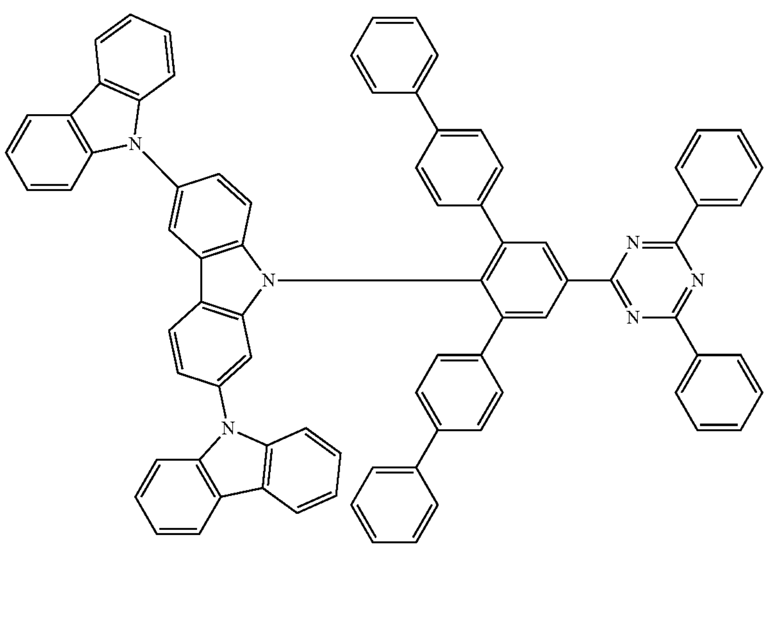

-continued
838
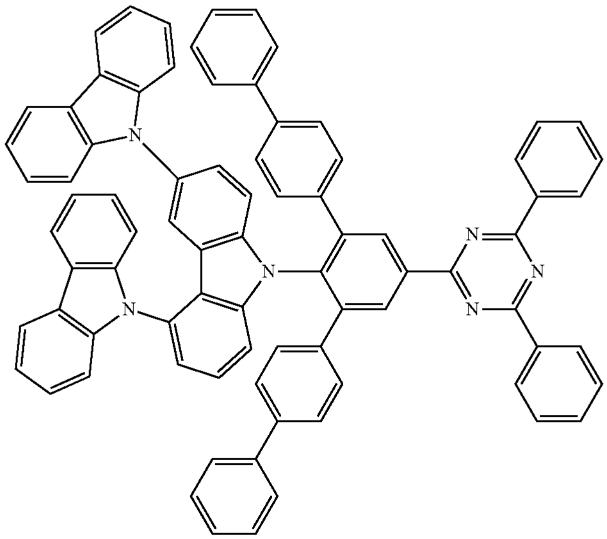
839
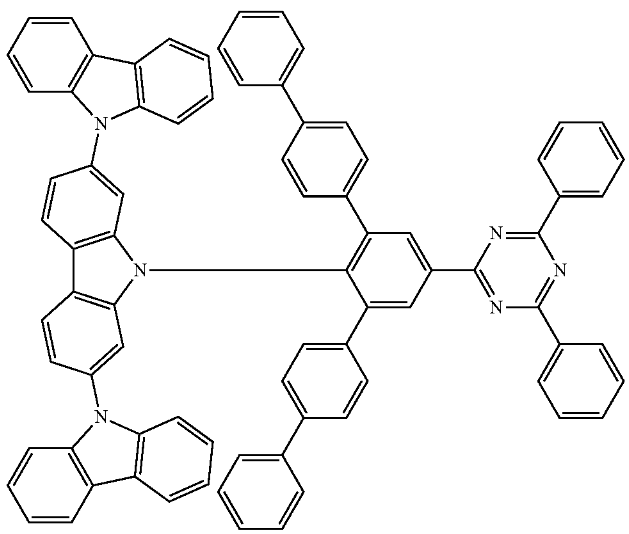
840
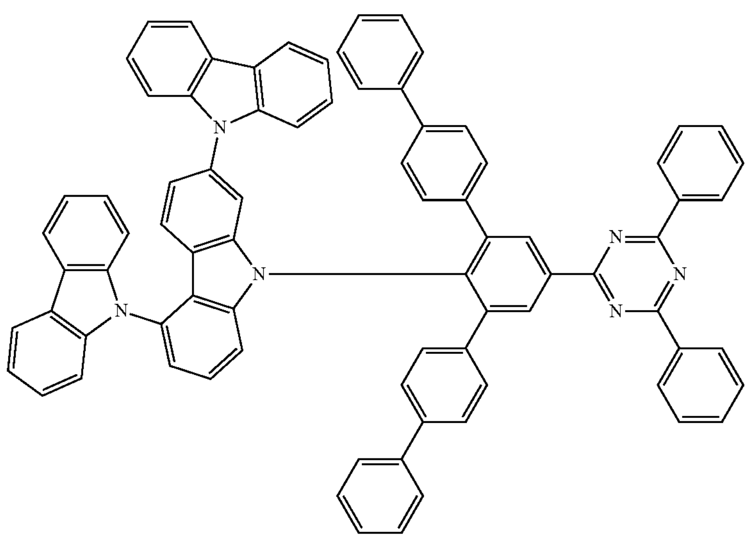

-continued
841
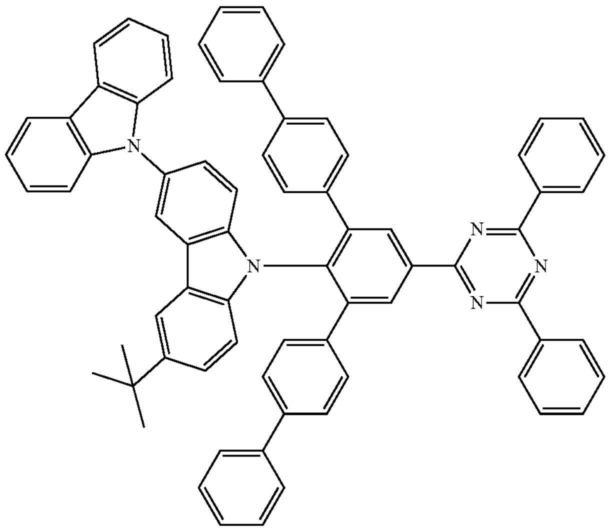
842
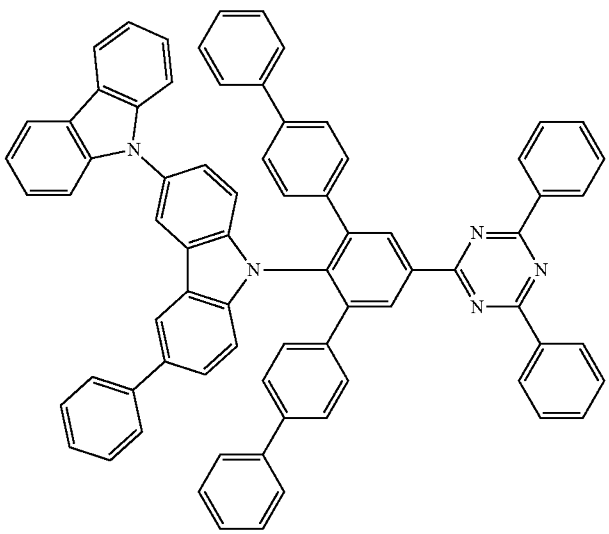
843
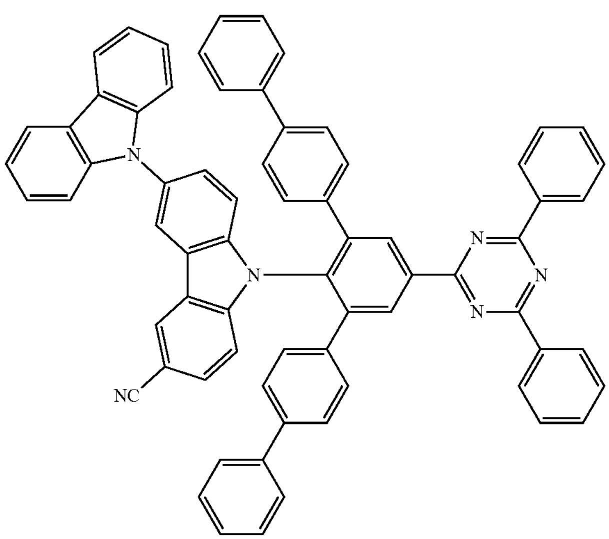

-continued
844
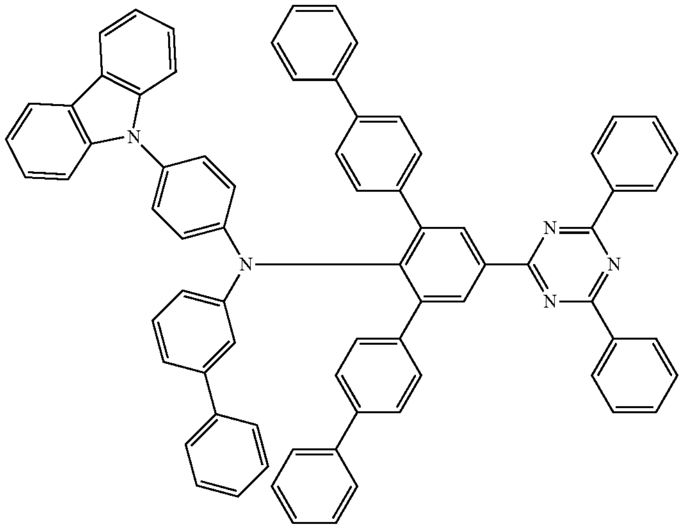
845
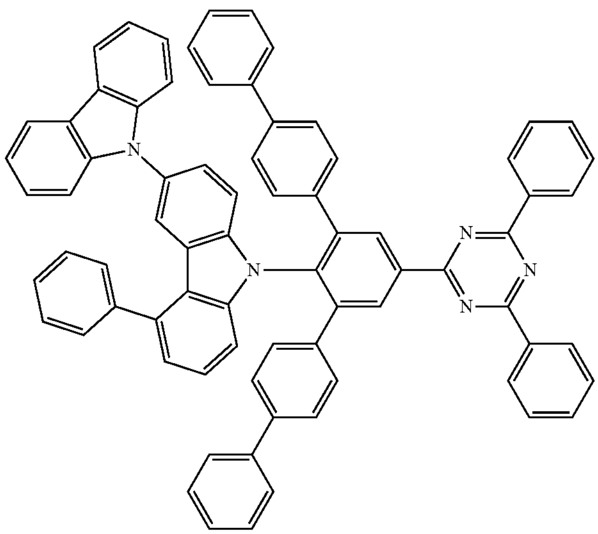
846
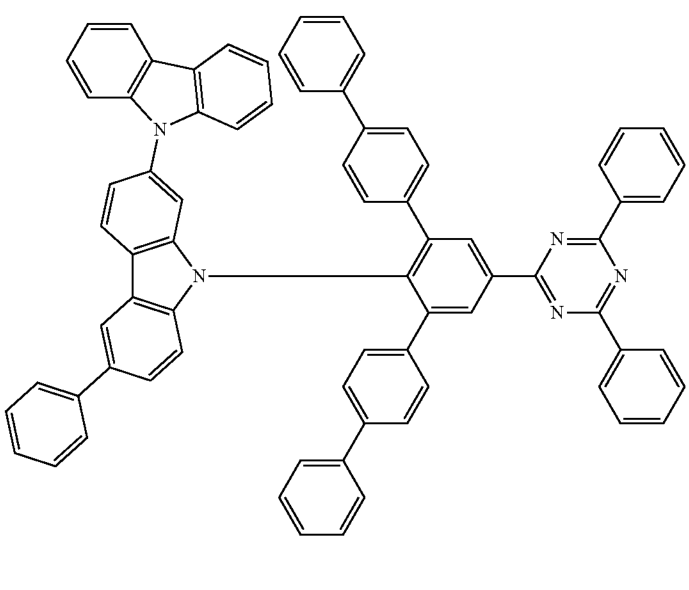

-continued
847
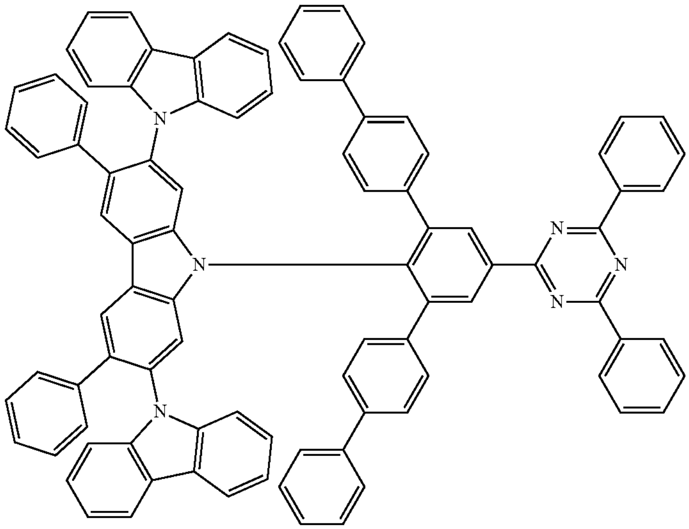
848
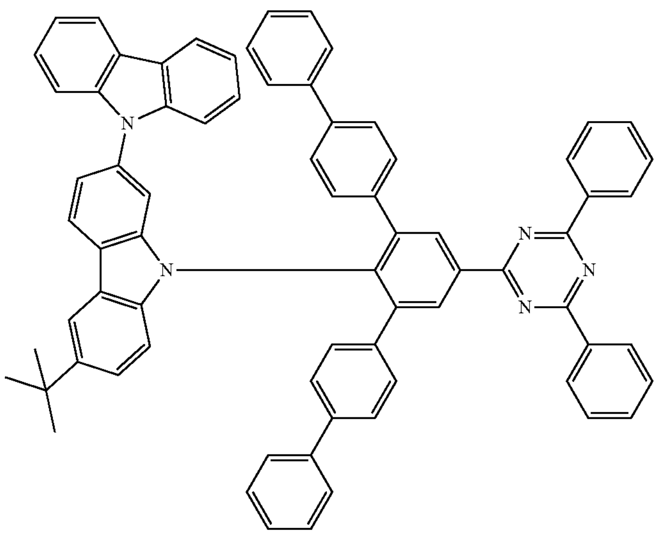
849
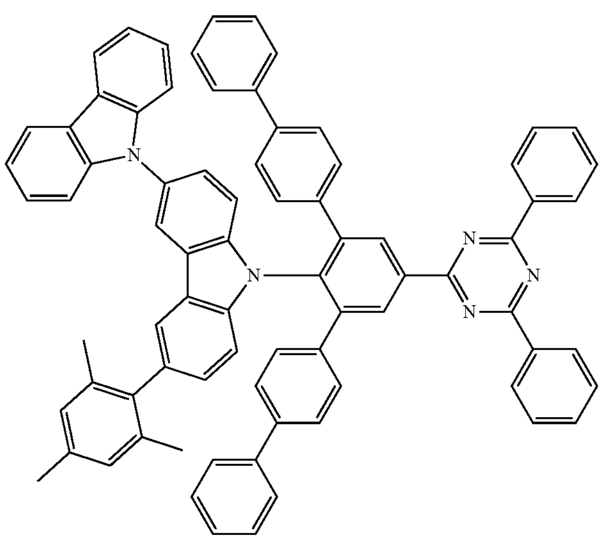

-continued
850
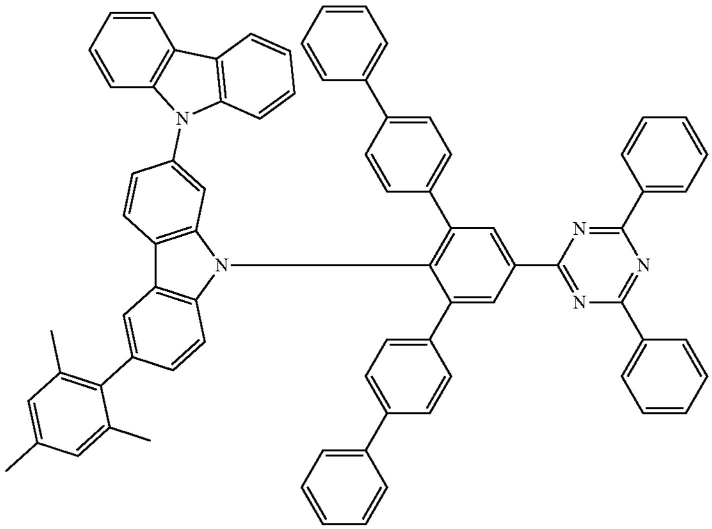
851
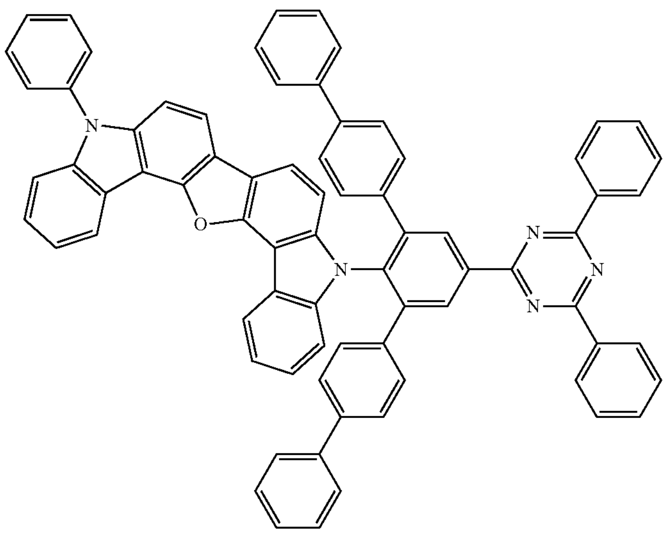
852
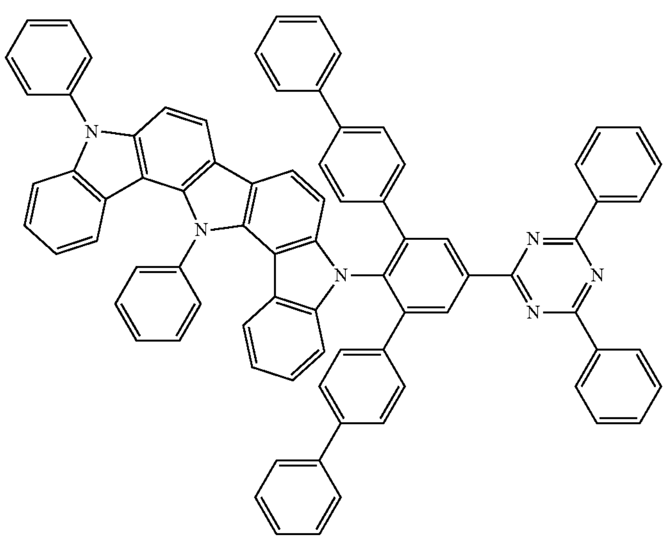

-continued
853
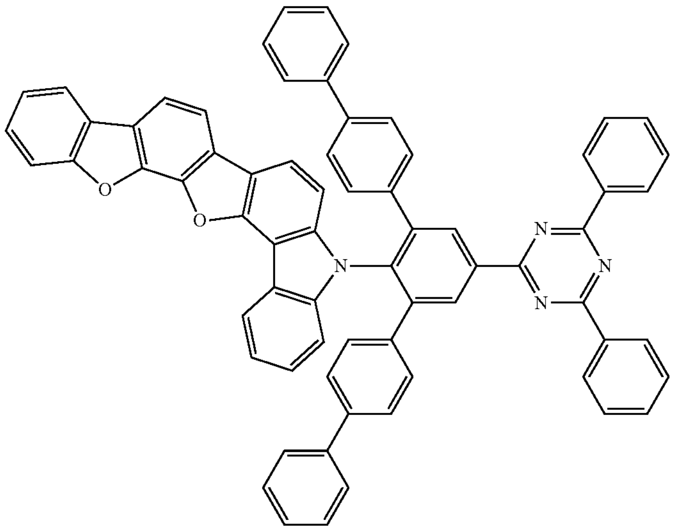
854
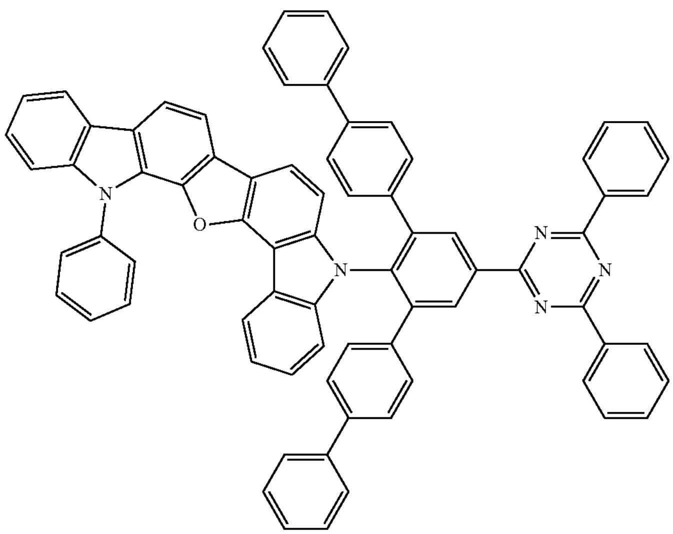
855
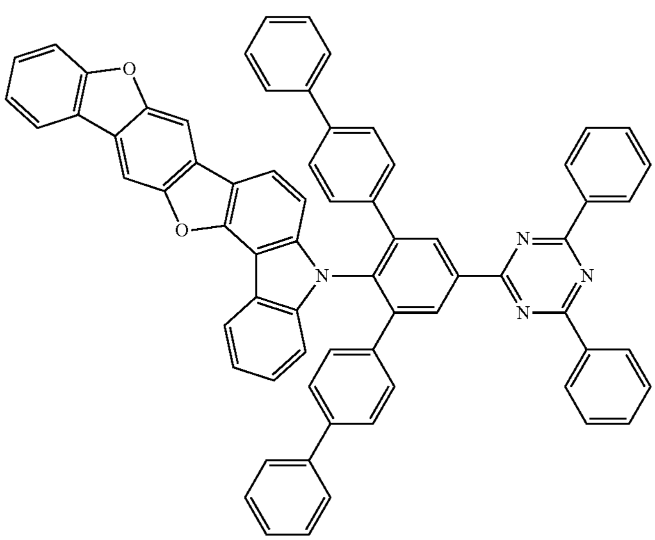

-continued
856
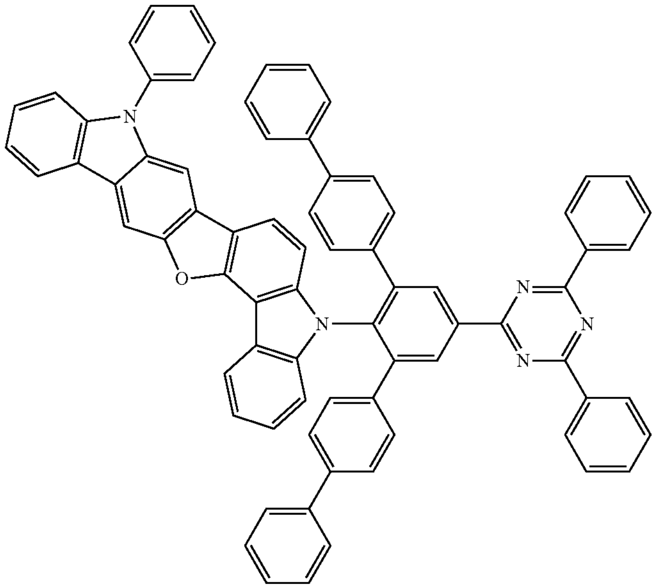
857
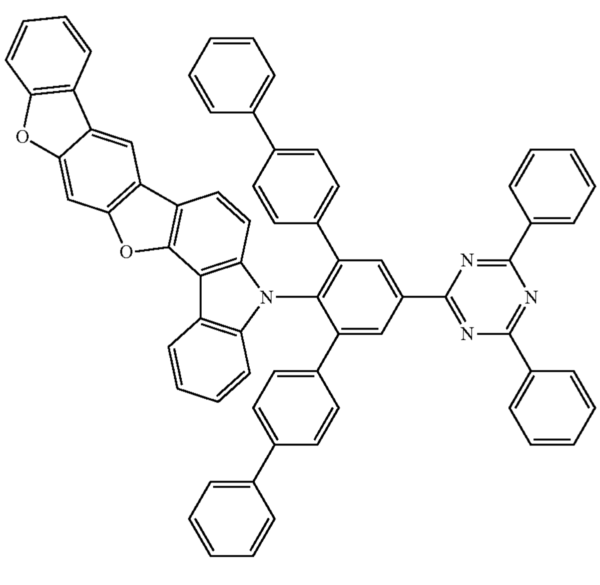

-continued
858
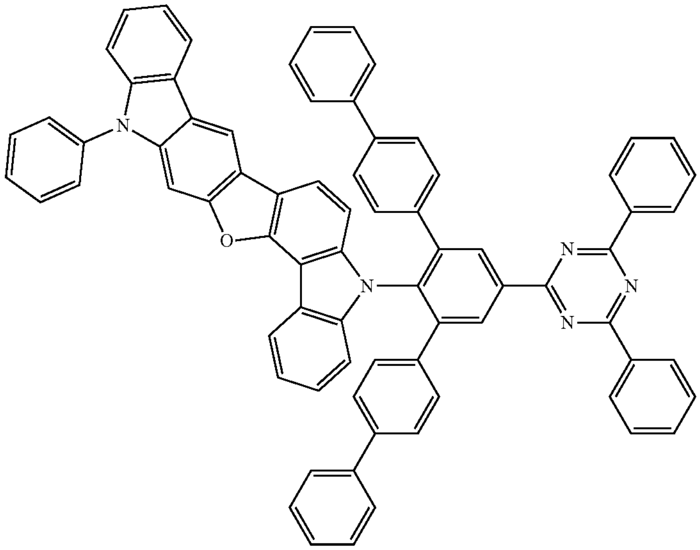
859
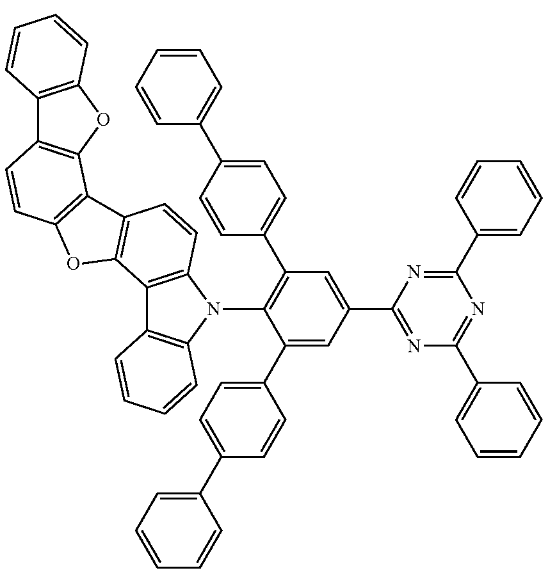

-continued
860
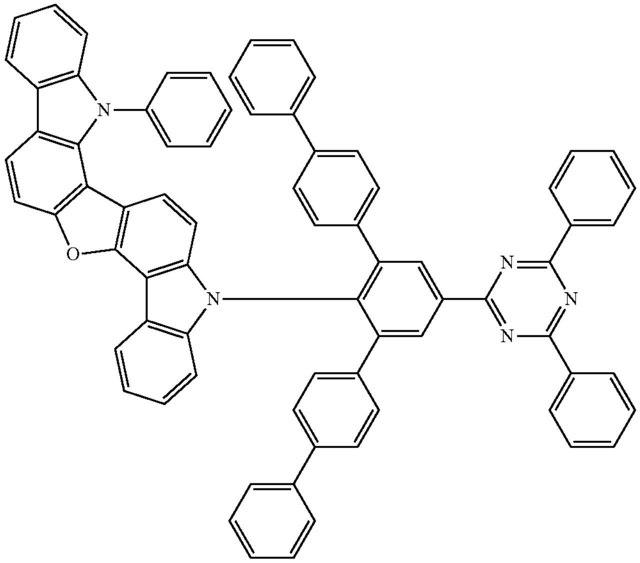
861
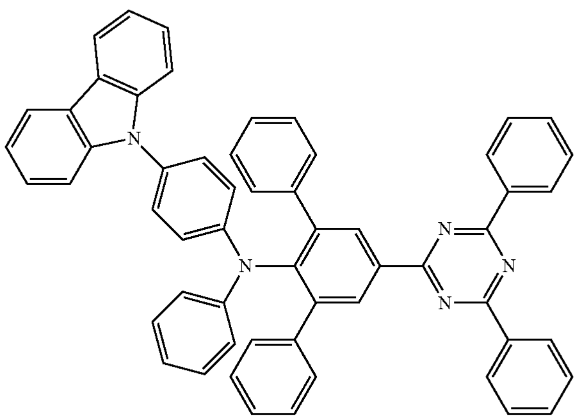
862
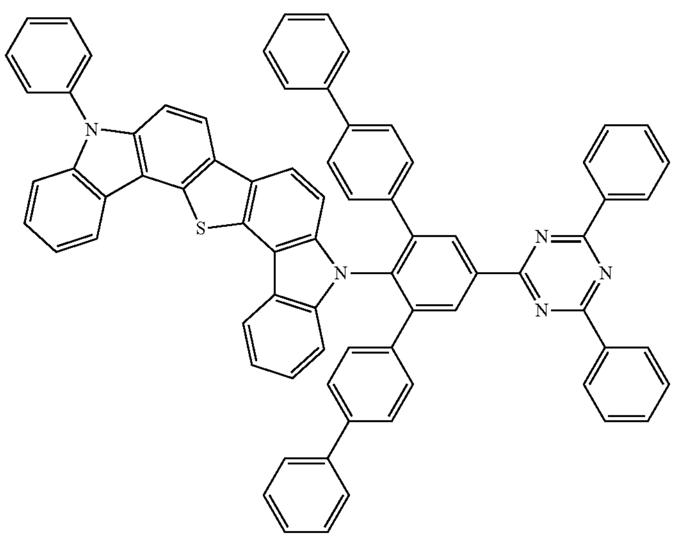

-continued
863
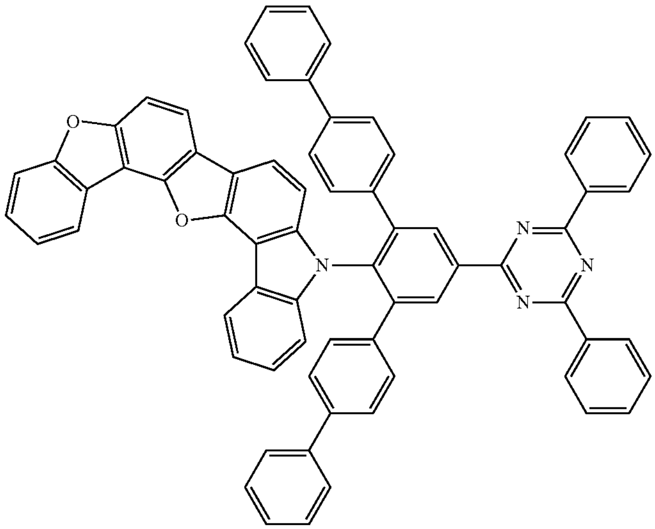
864
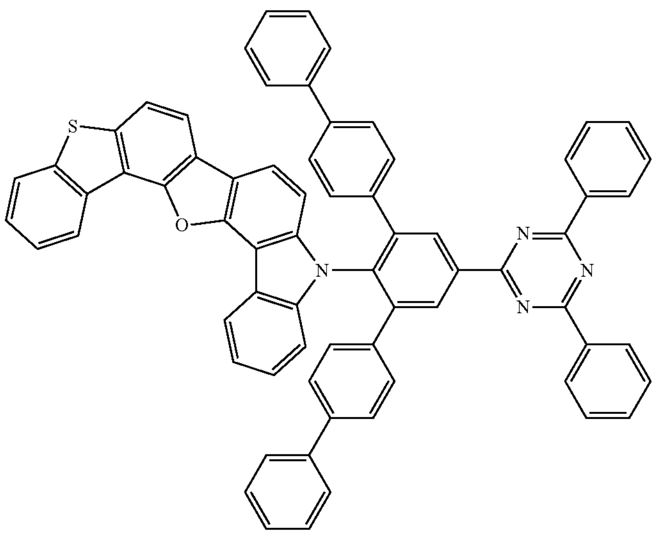
865
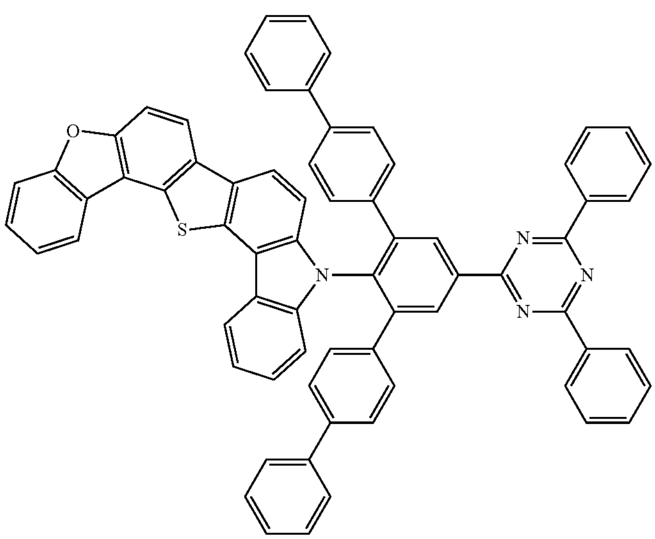

-continued
866
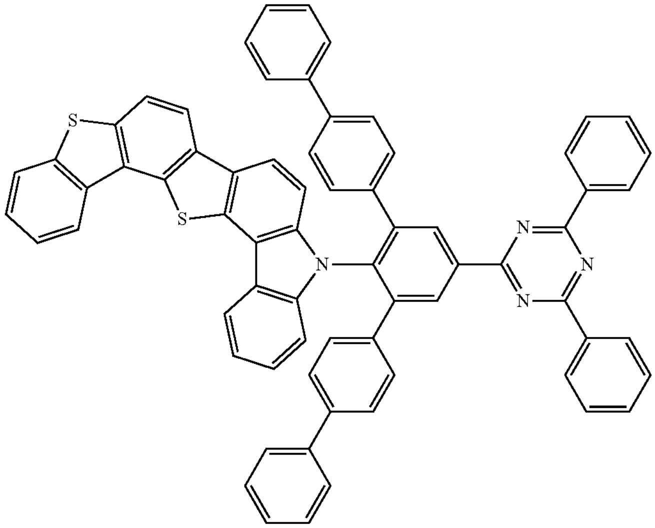
867
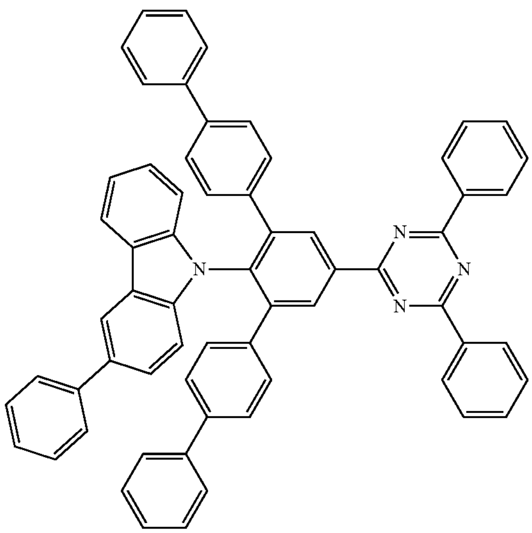
868
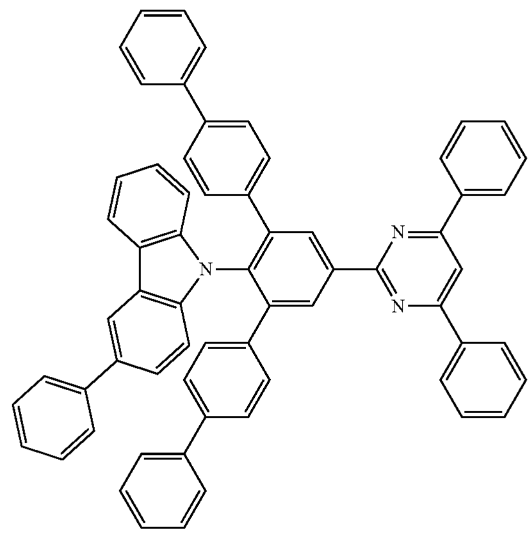
869
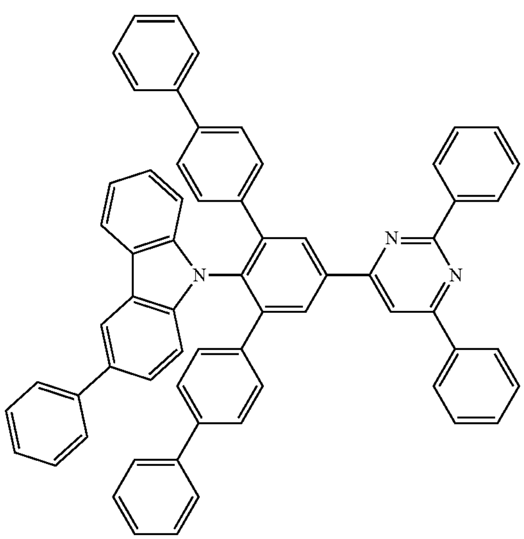

-continued
870
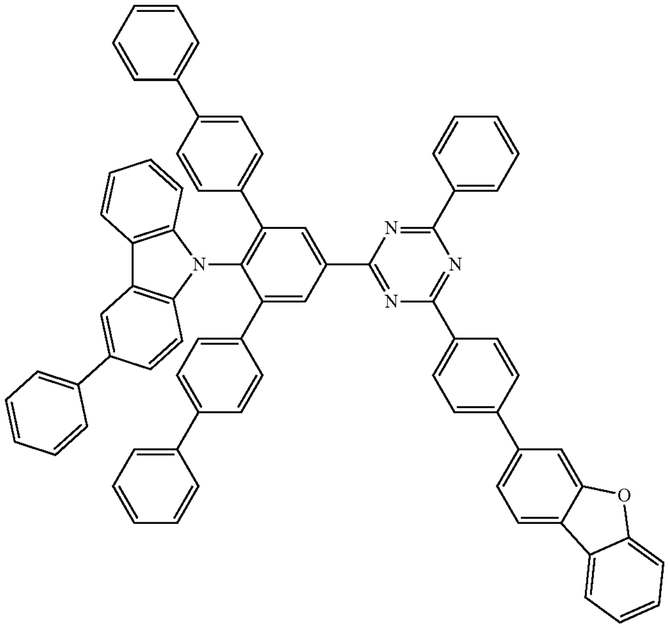
871
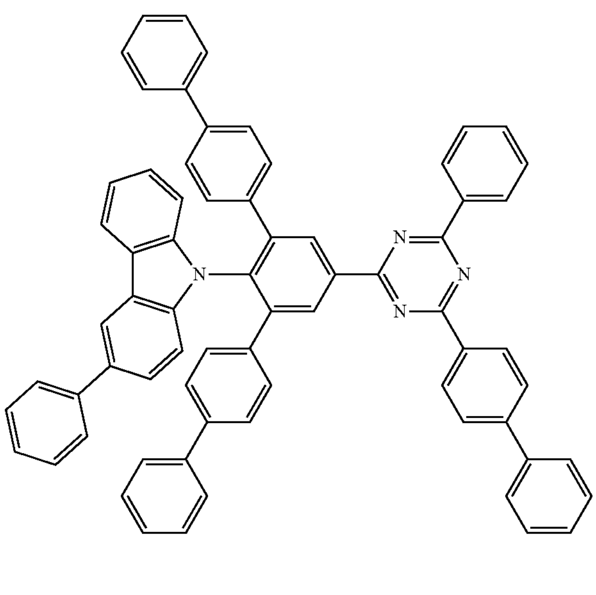

-continued
872
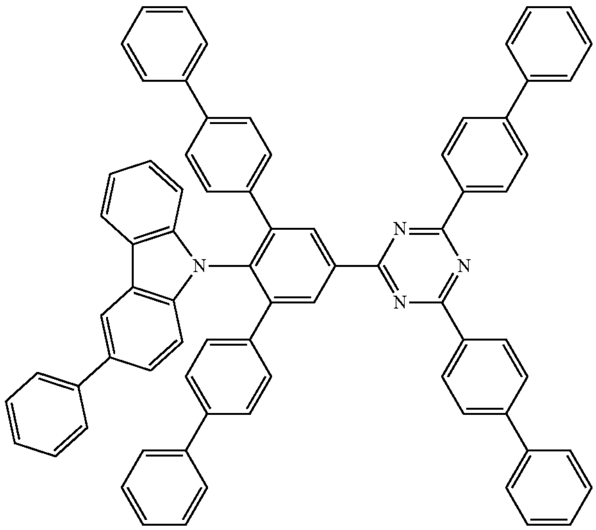
873
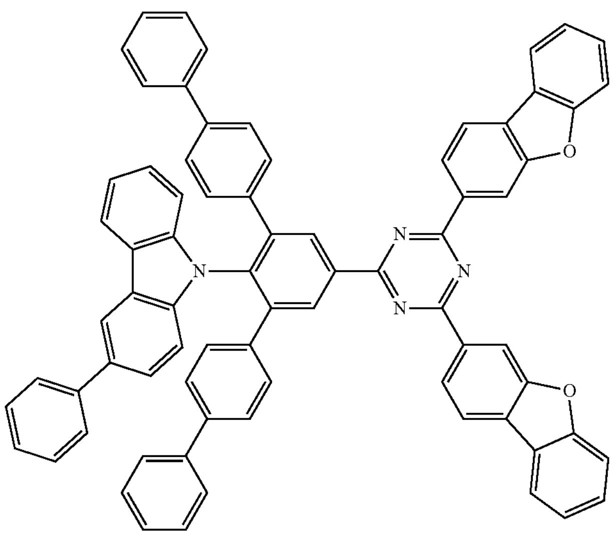
874
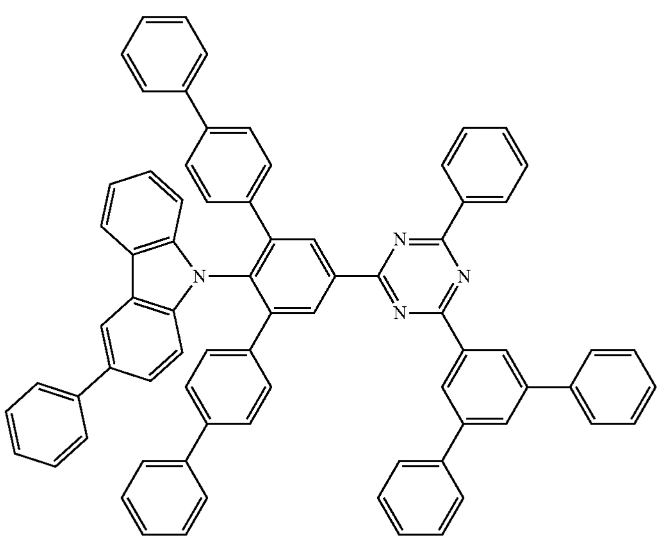

-continued
875
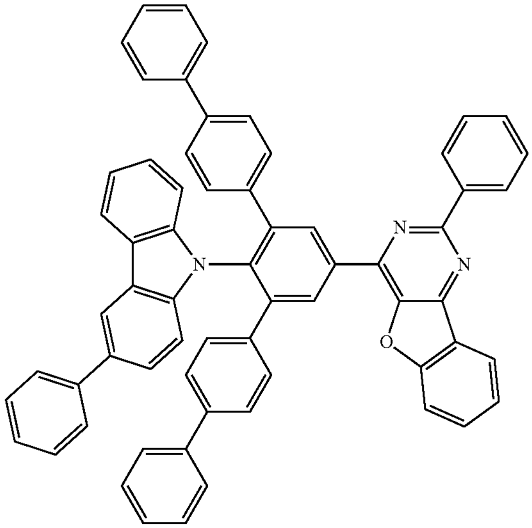
876
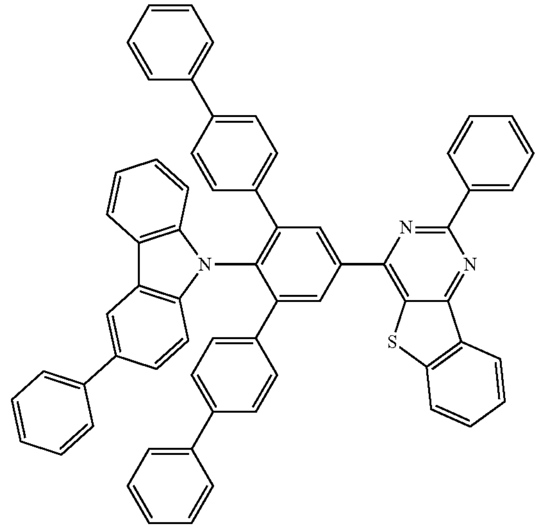
877
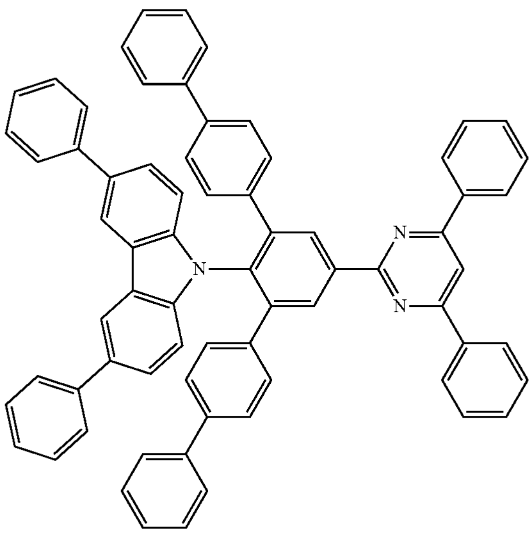
878
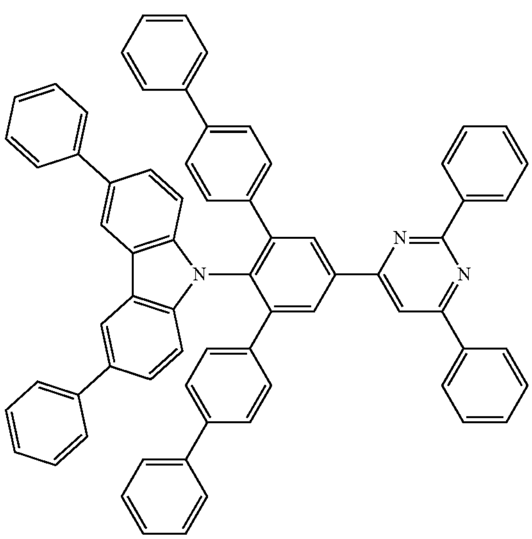

-continued
879
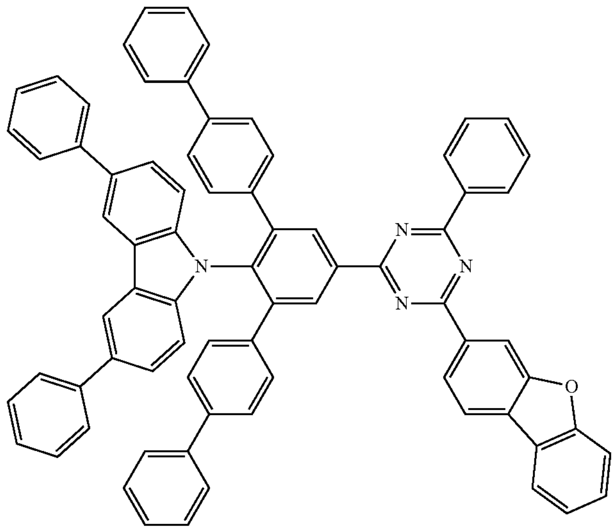
880
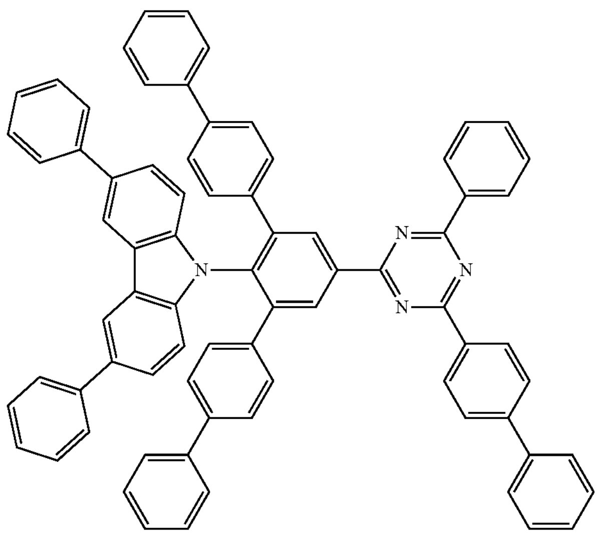
881
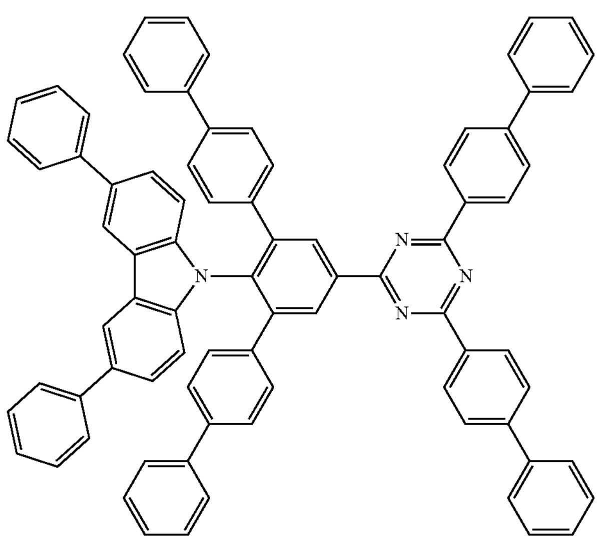

-continued
882
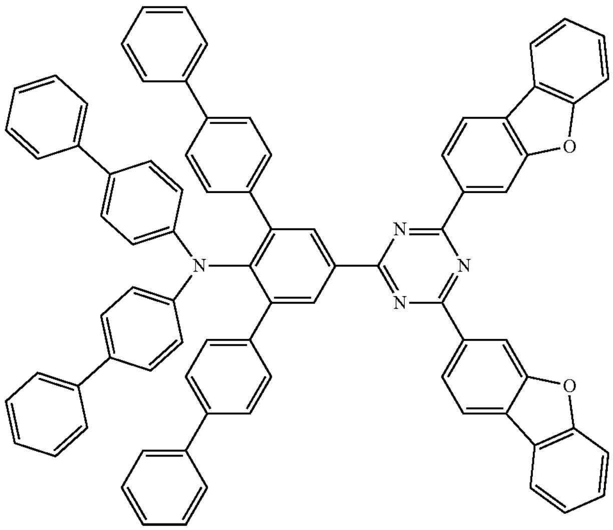
883
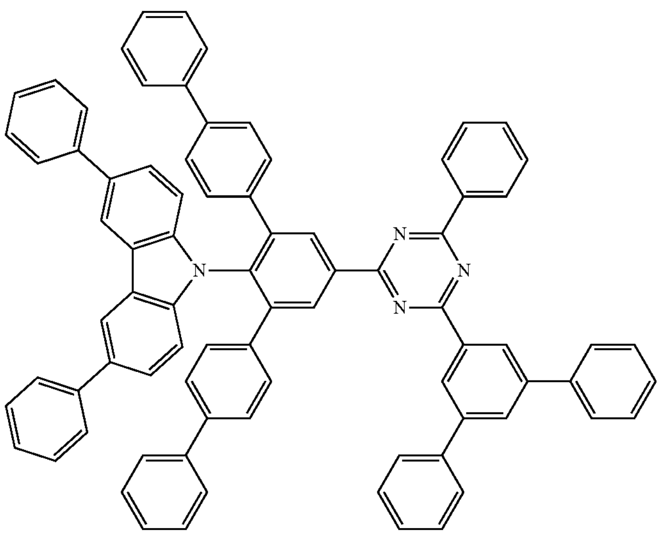
884
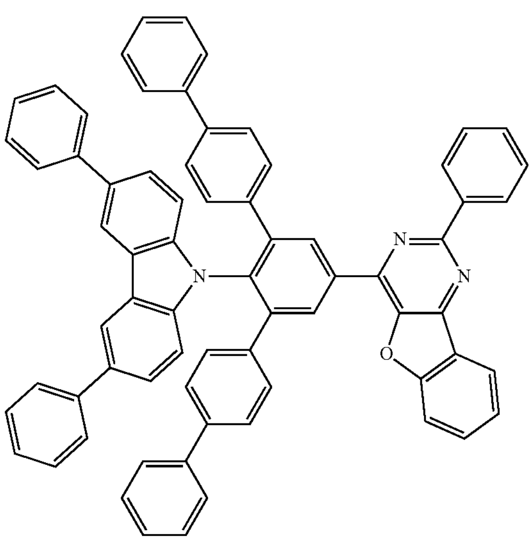
885
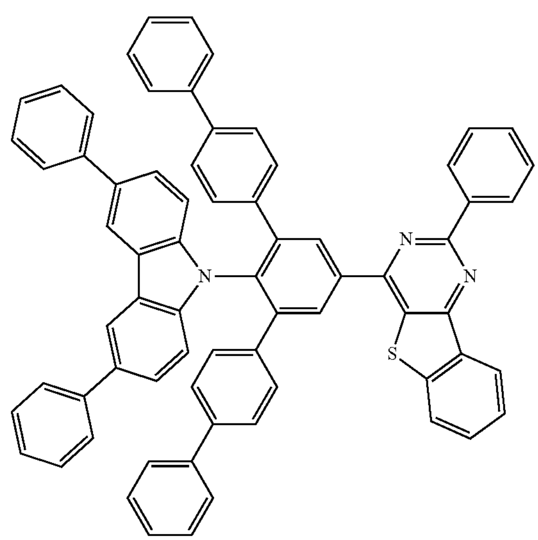

-continued
886
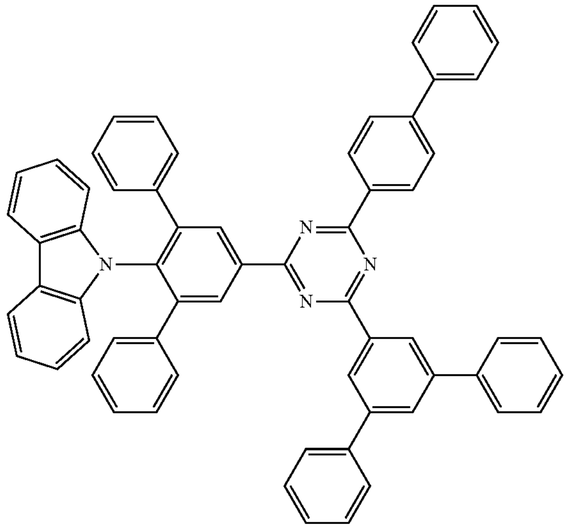
887
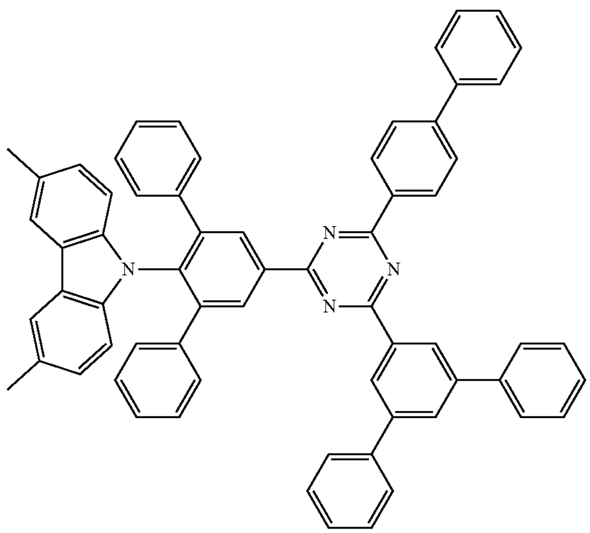
888
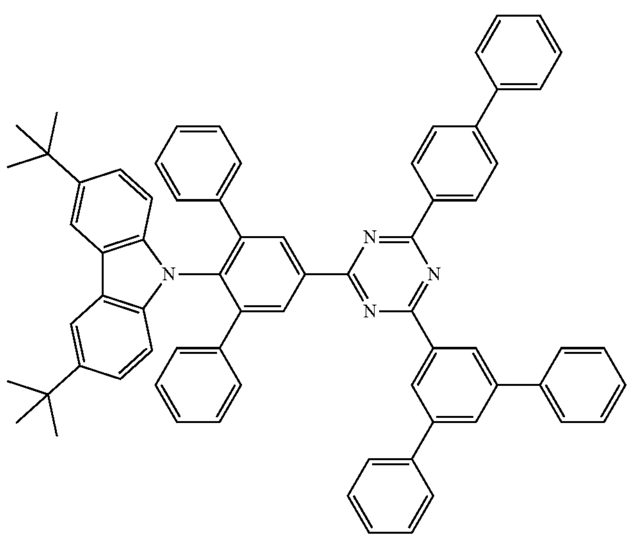

-continued
889
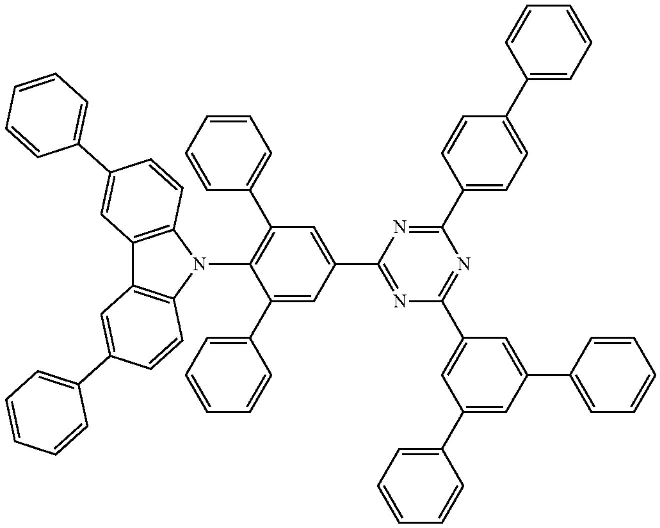
890
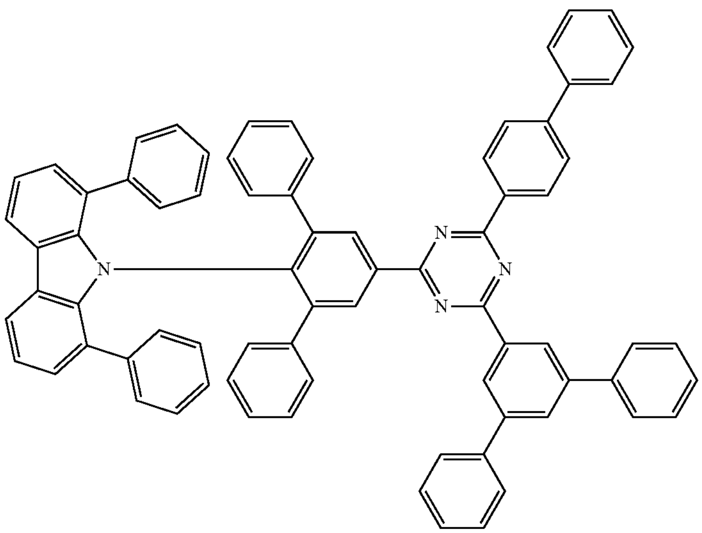
891
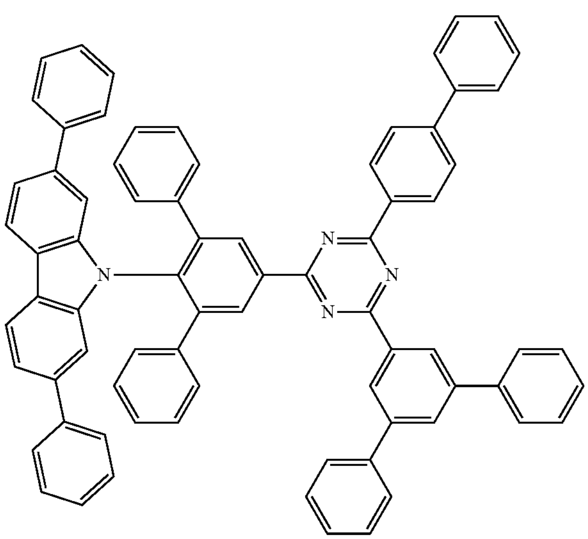

-continued
892
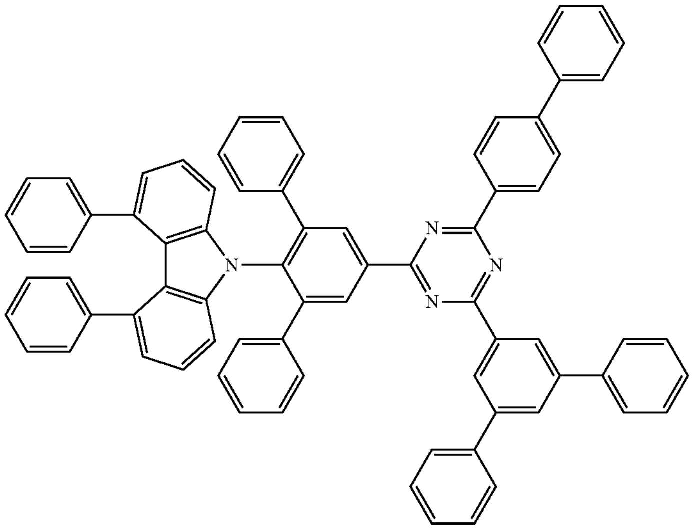
893
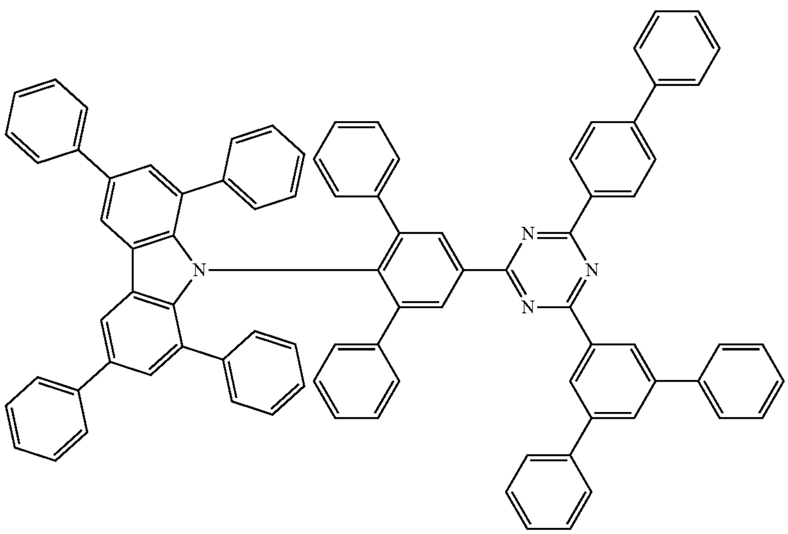
894
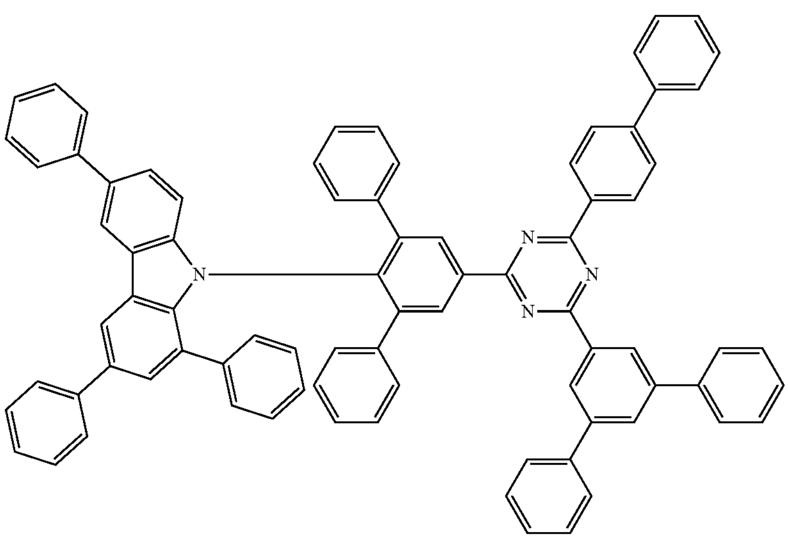

-continued
895
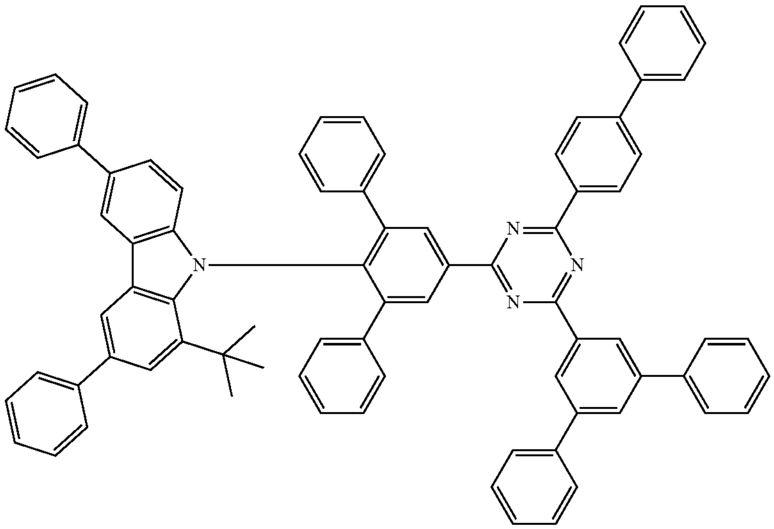
896
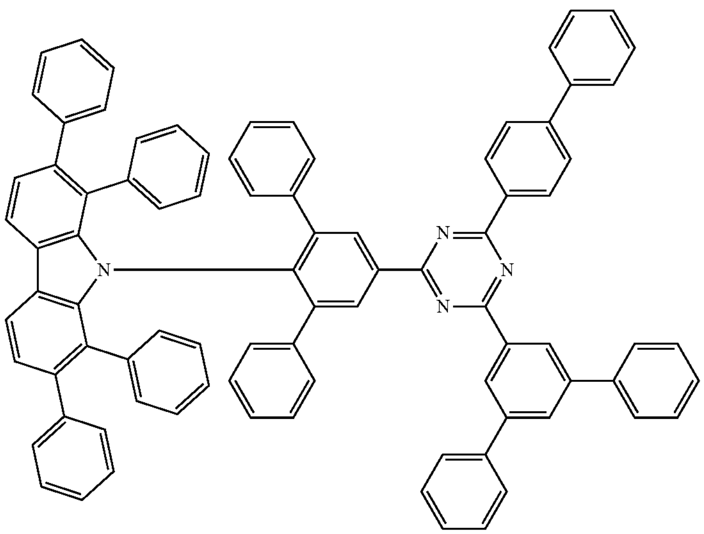
897
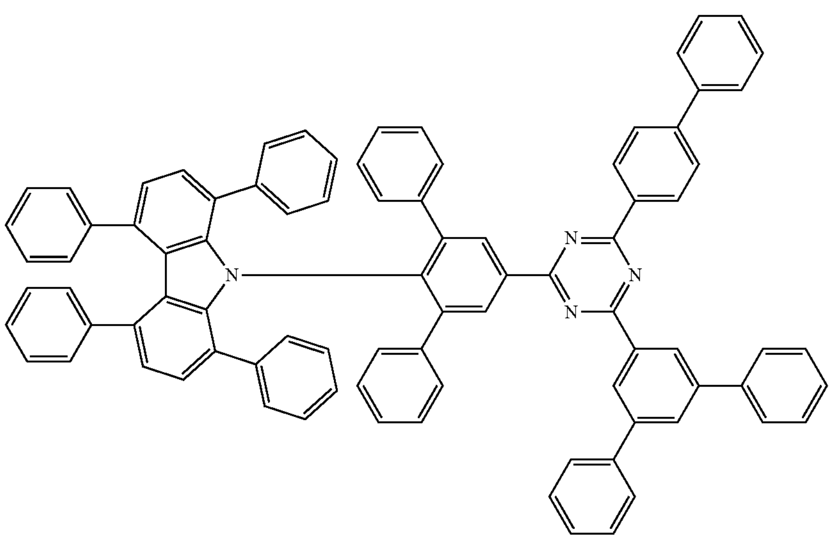

-continued
898
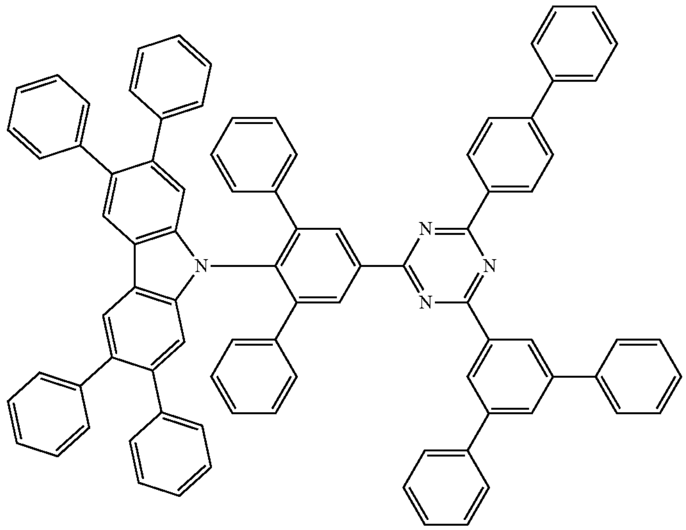
899
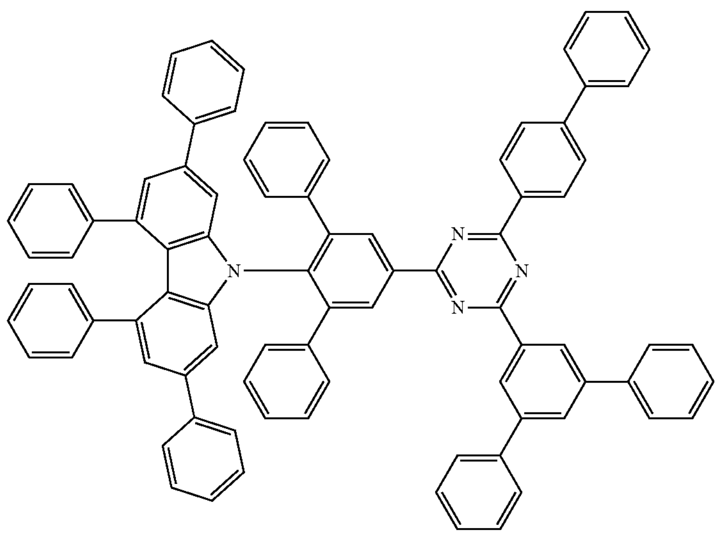
900
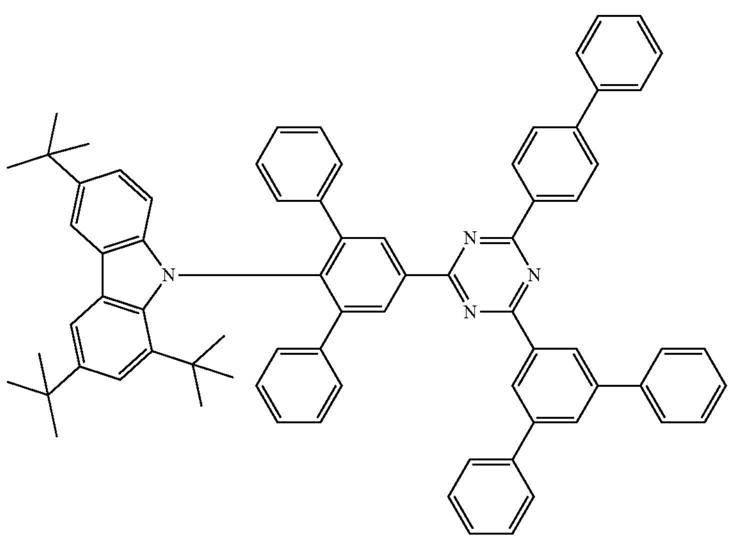

-continued
901
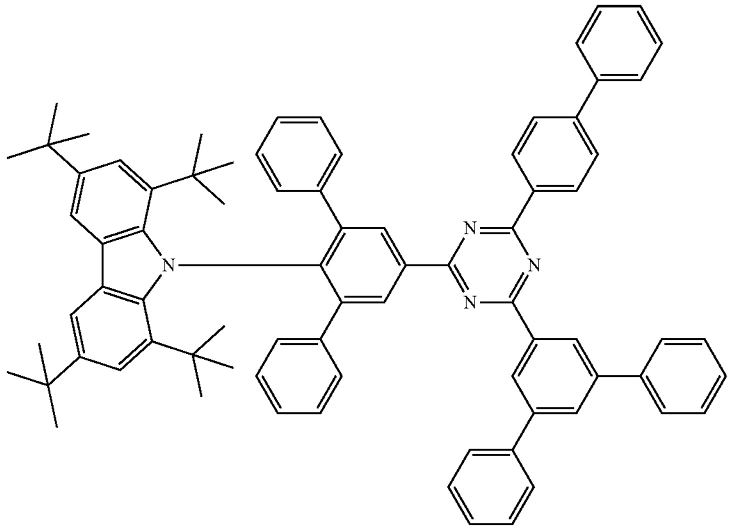
902
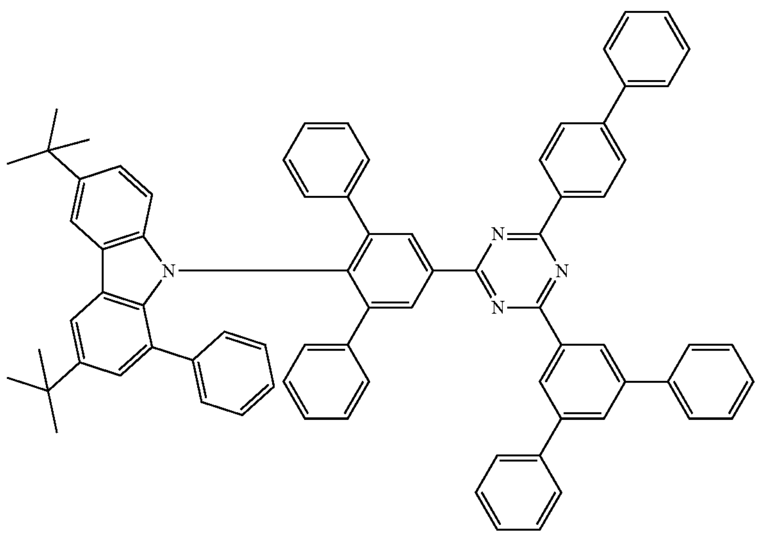
903
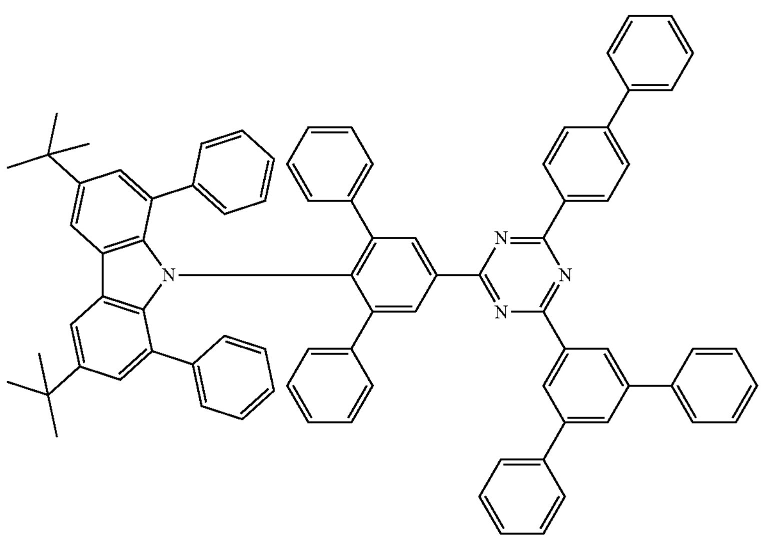

-continued
904
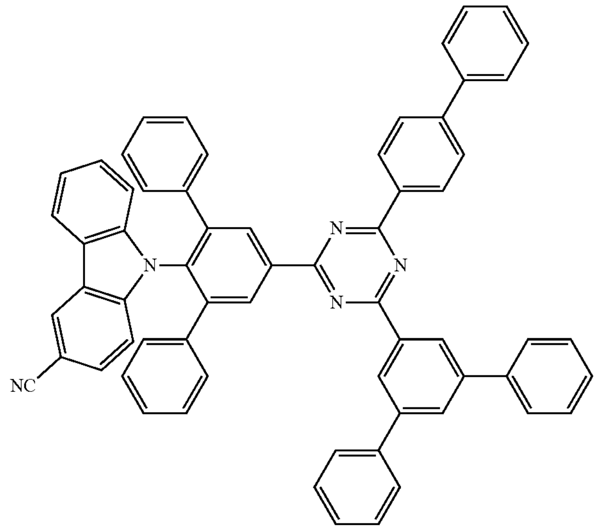
905
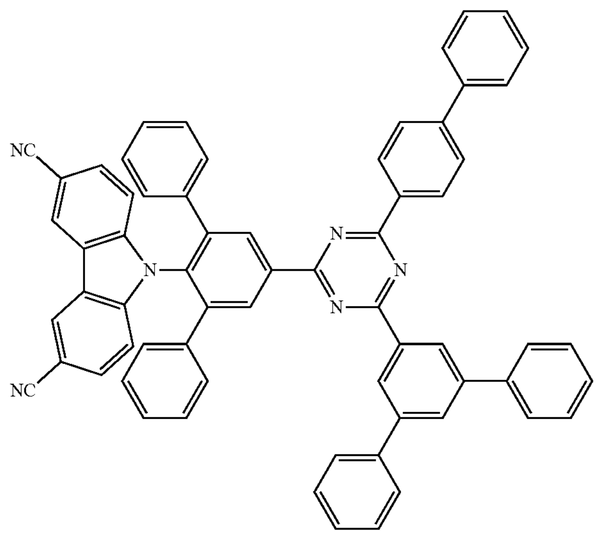
906
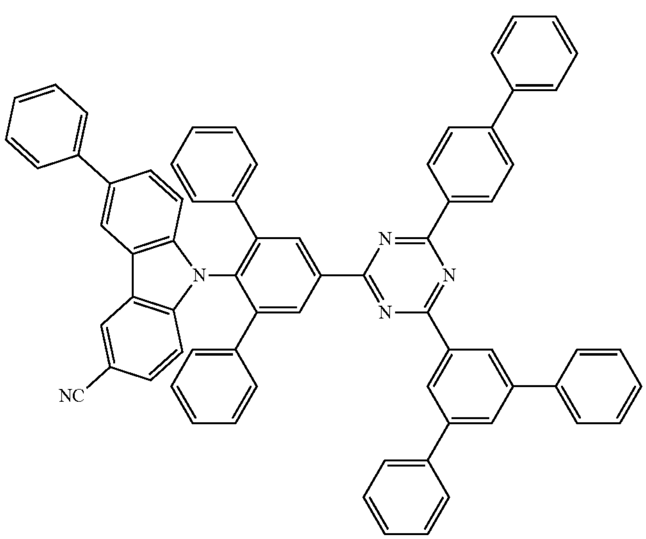

-continued
907
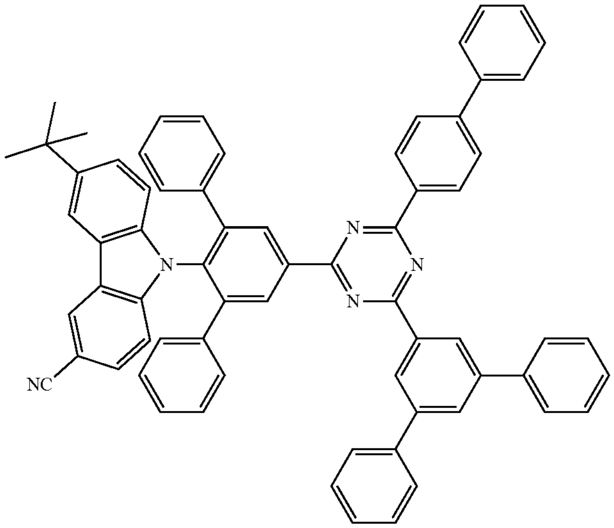
908
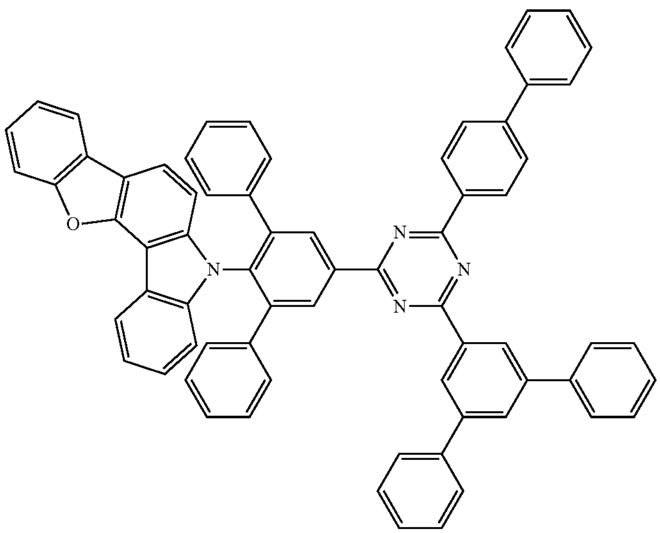
909
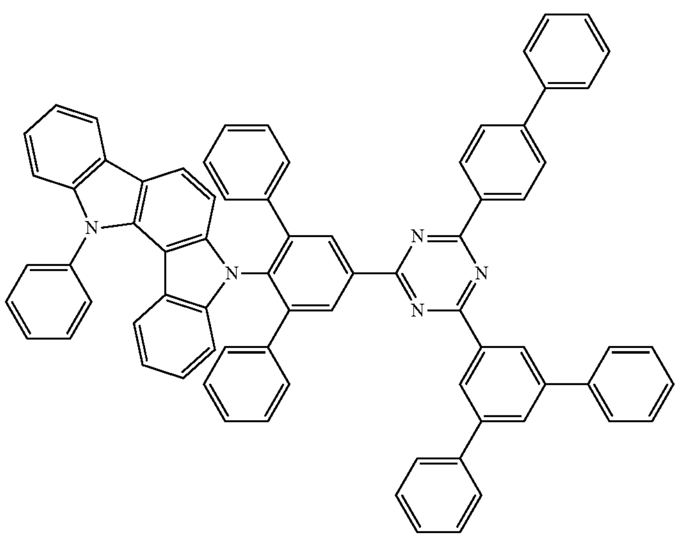

-continued
910
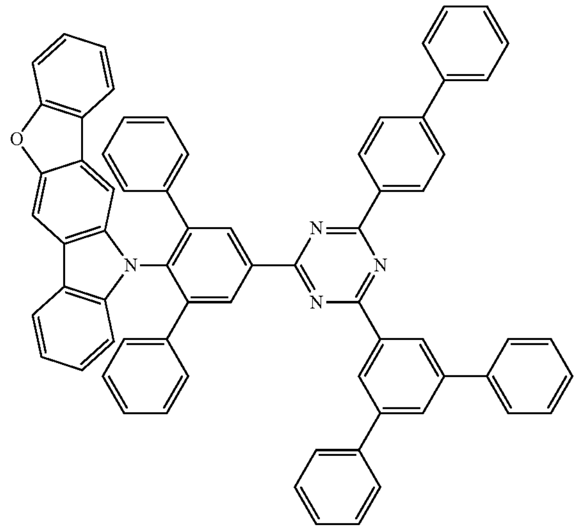
911
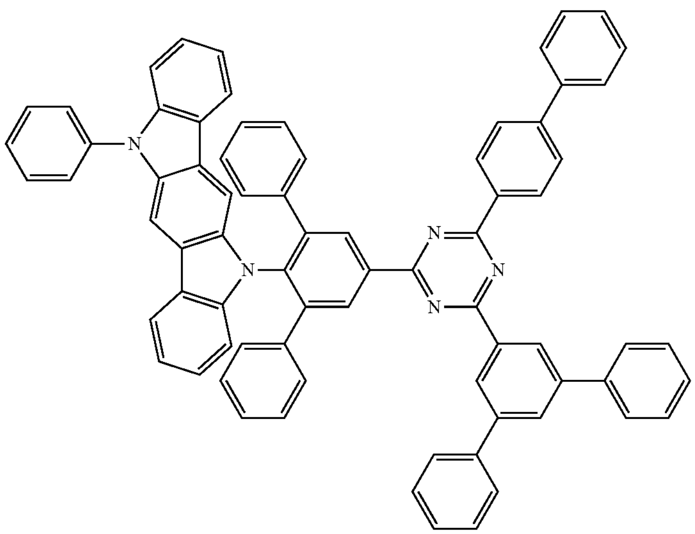
912
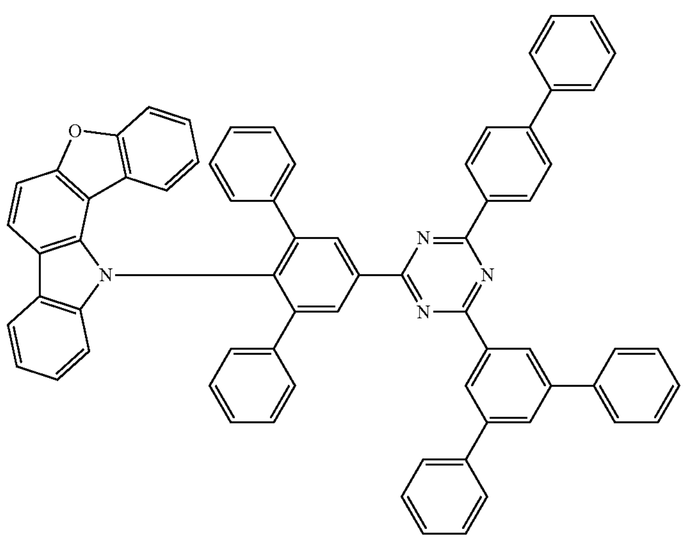

-continued
913
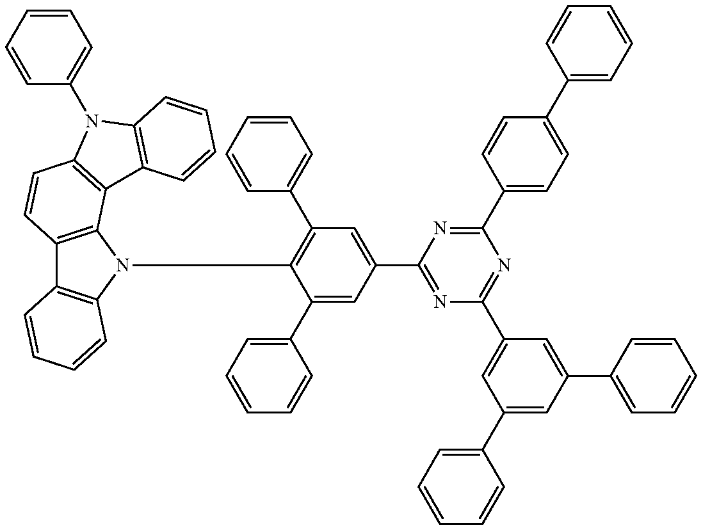
914
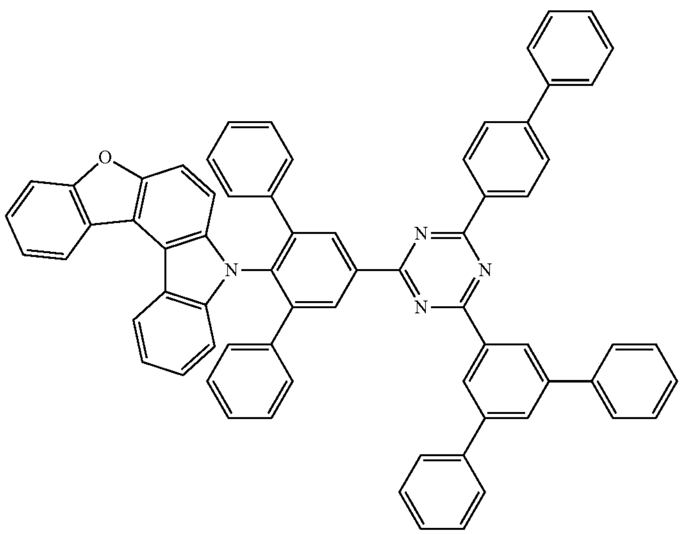
915
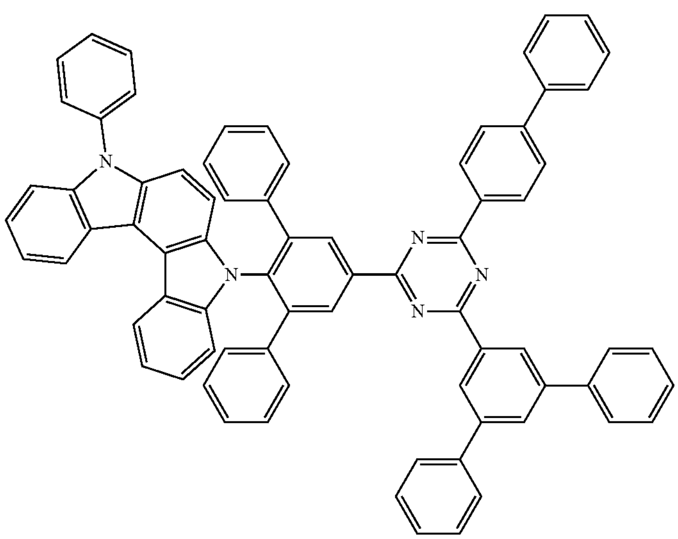

-continued
916
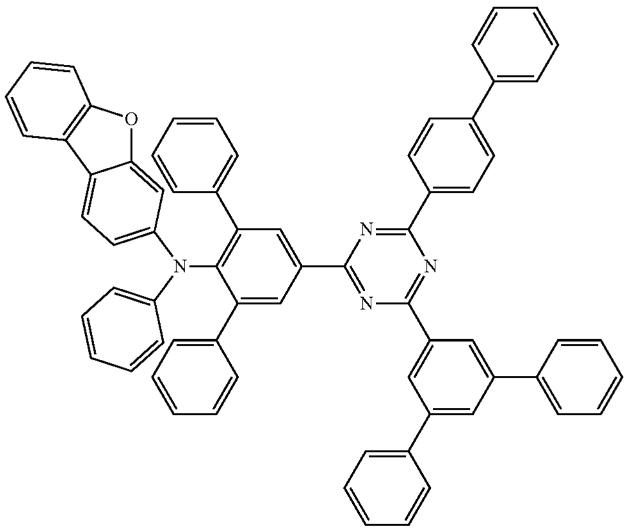
917
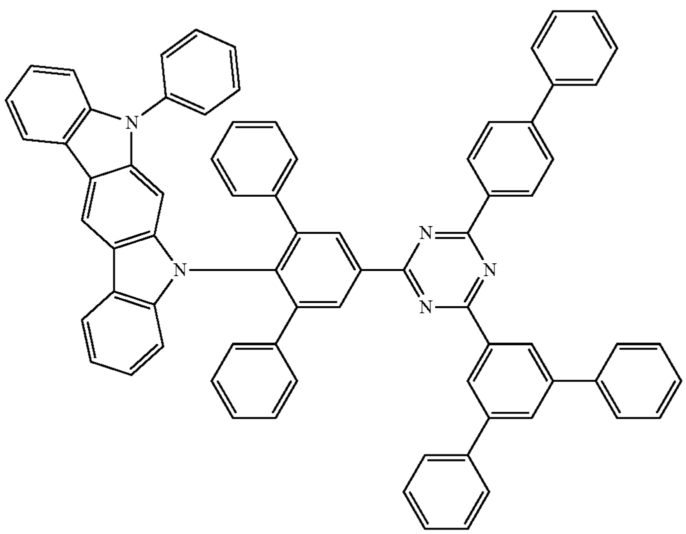
918
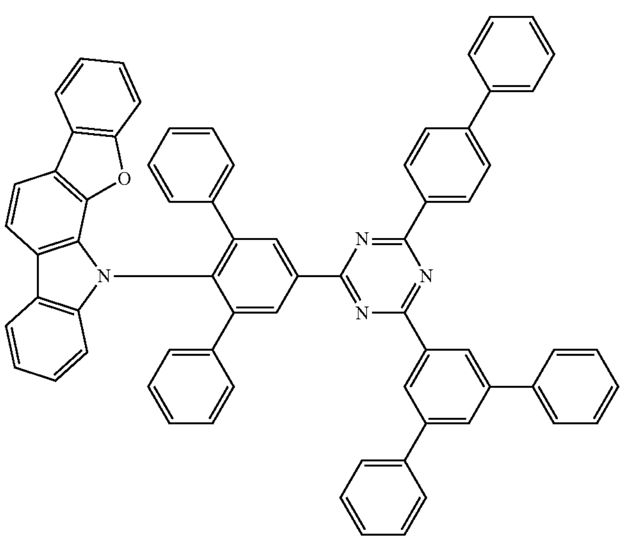

-continued
919
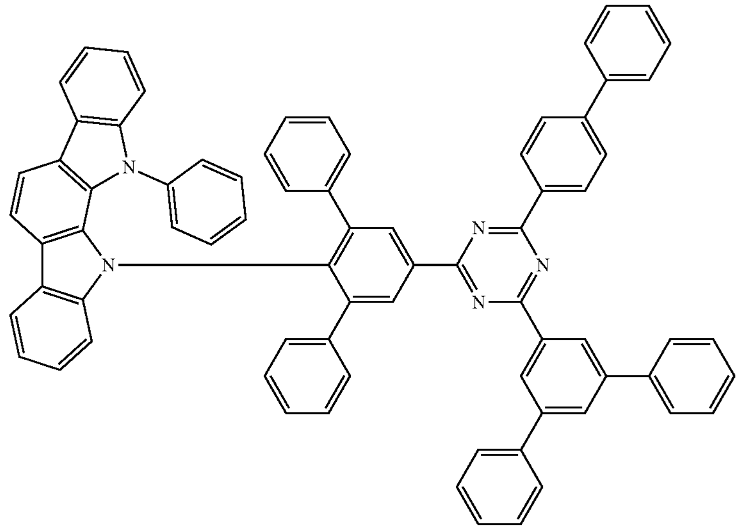
920
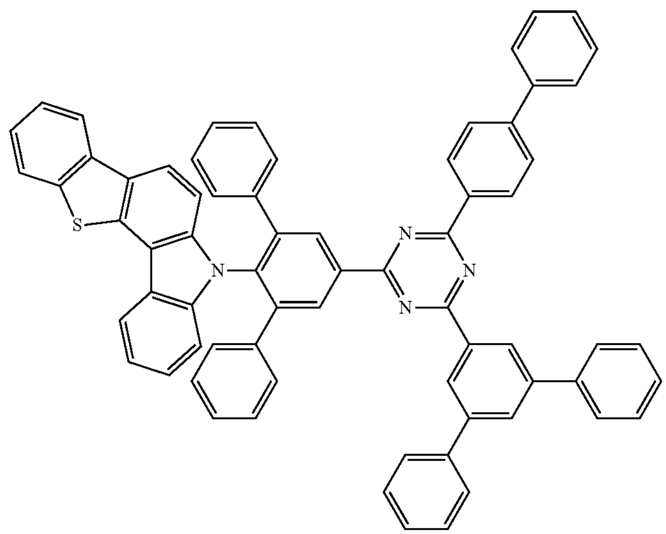
921
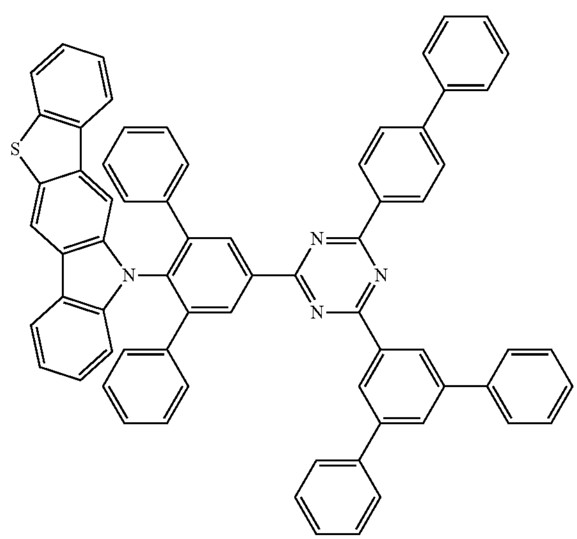

-continued
922
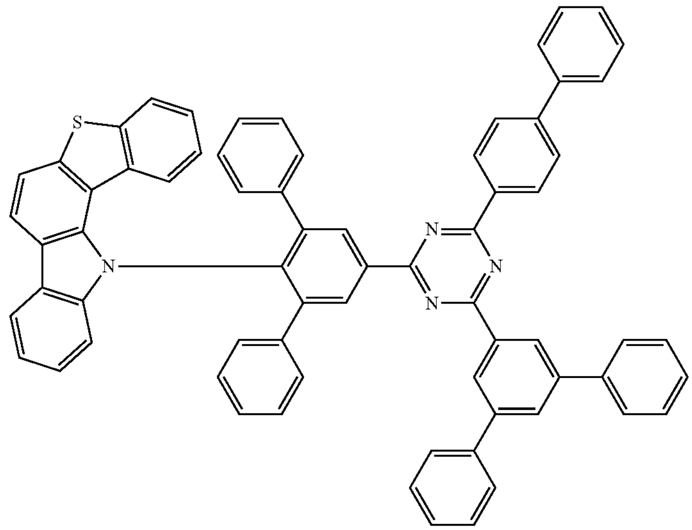
923
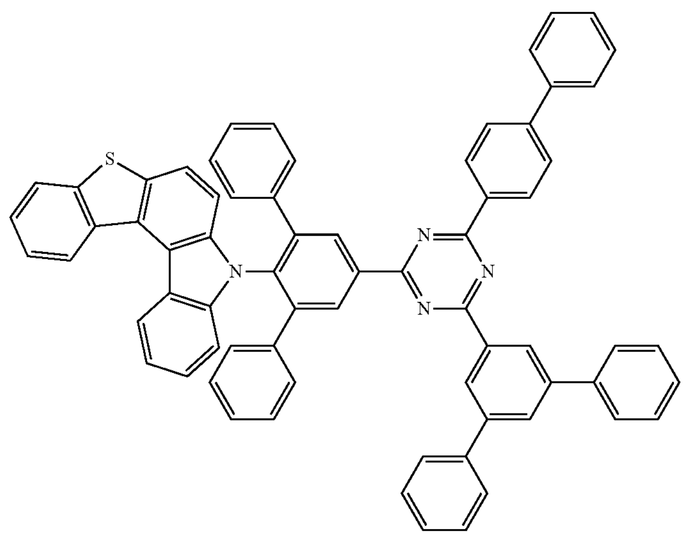
924
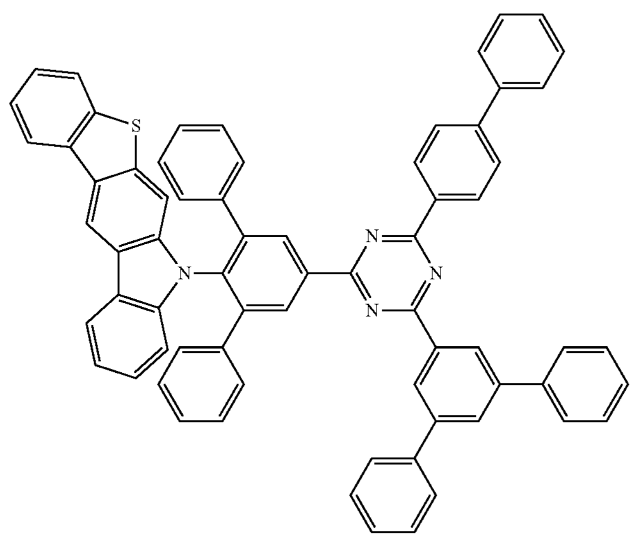

-continued
925
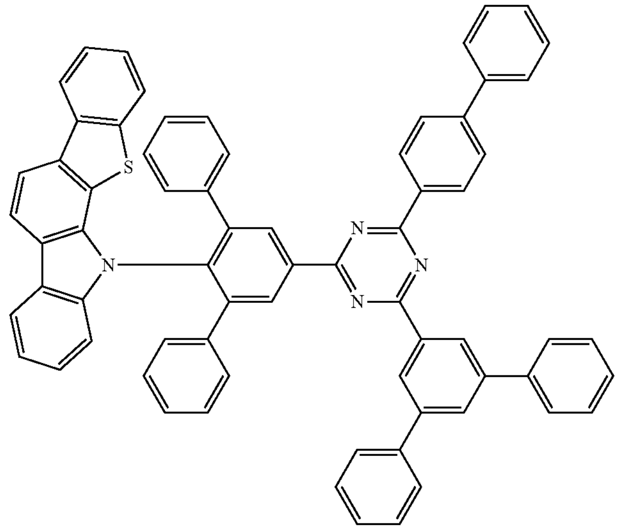
926
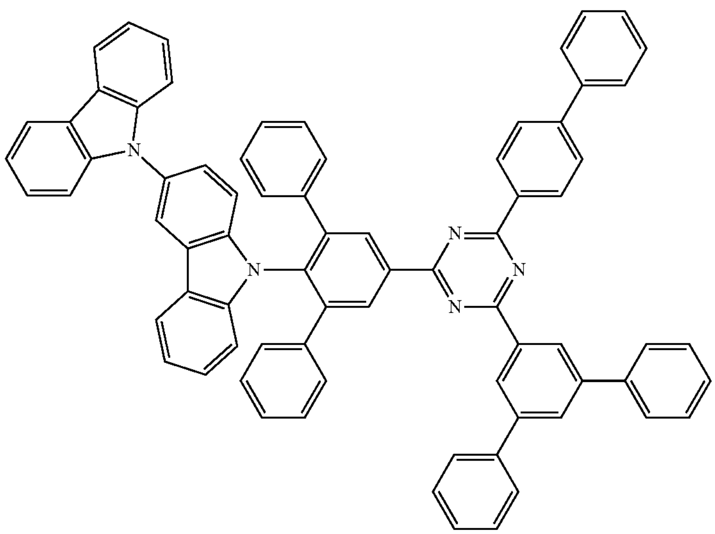
927
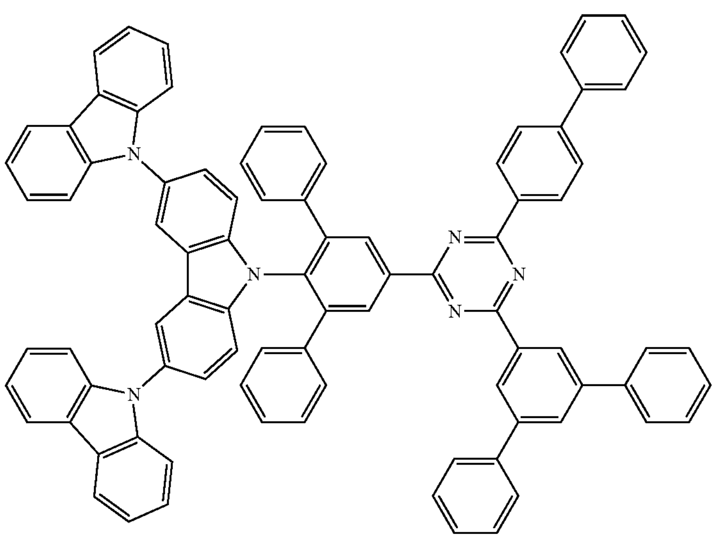

-continued
928
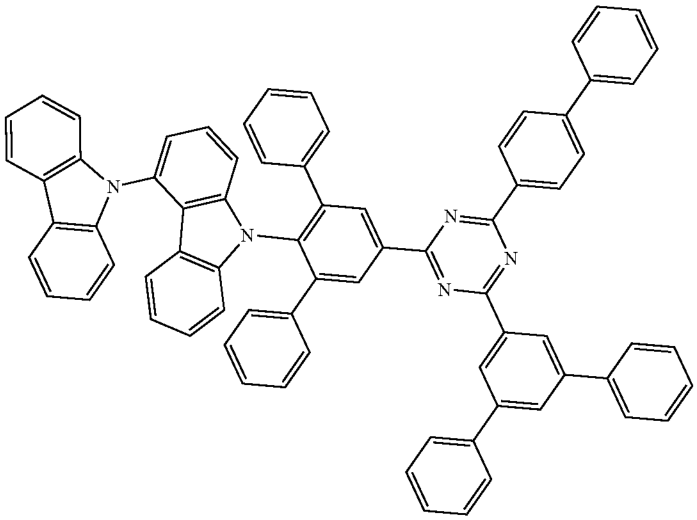
929
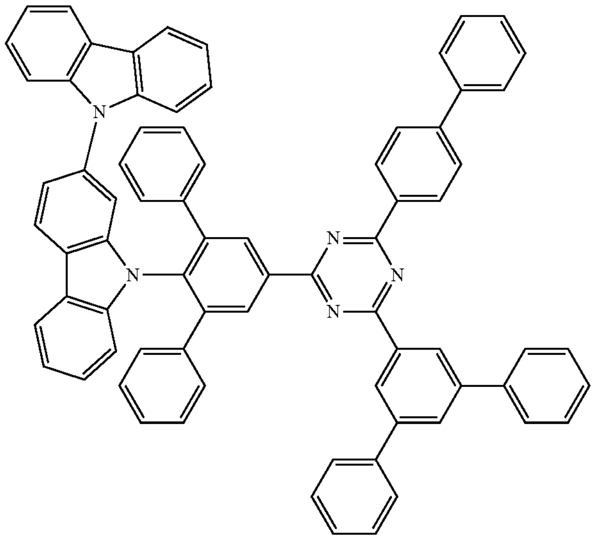
930
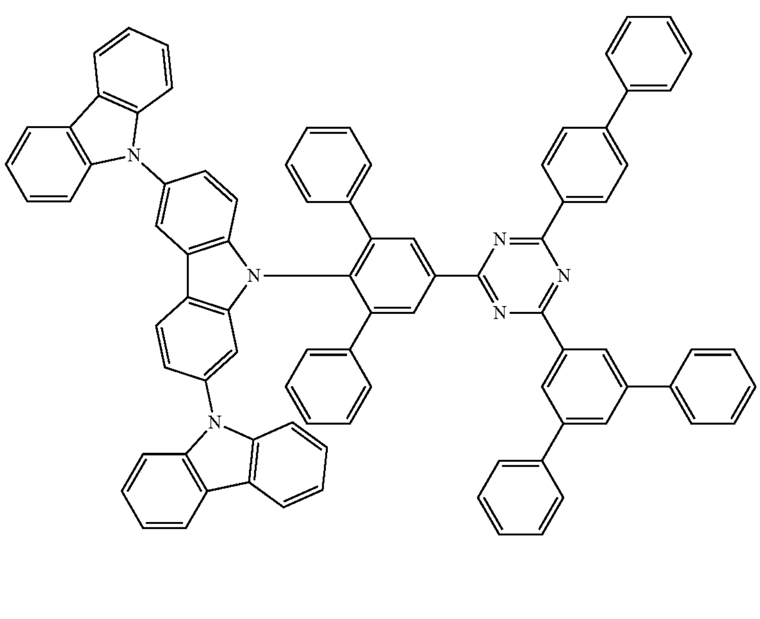

-continued
931
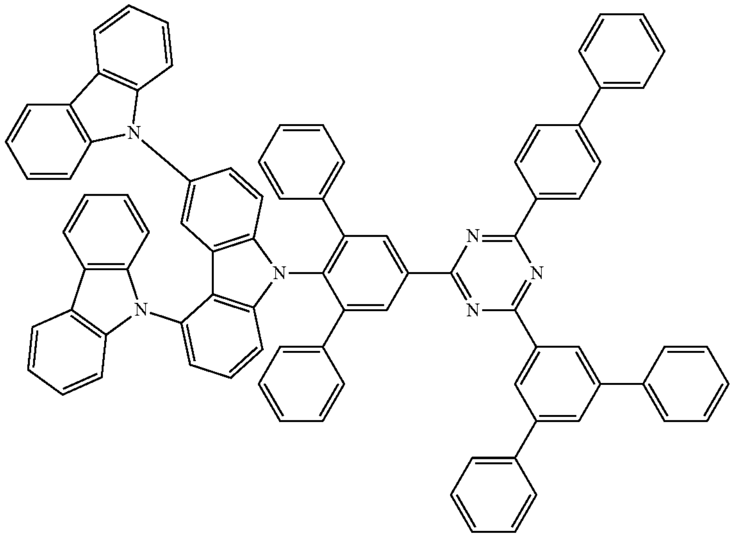
932
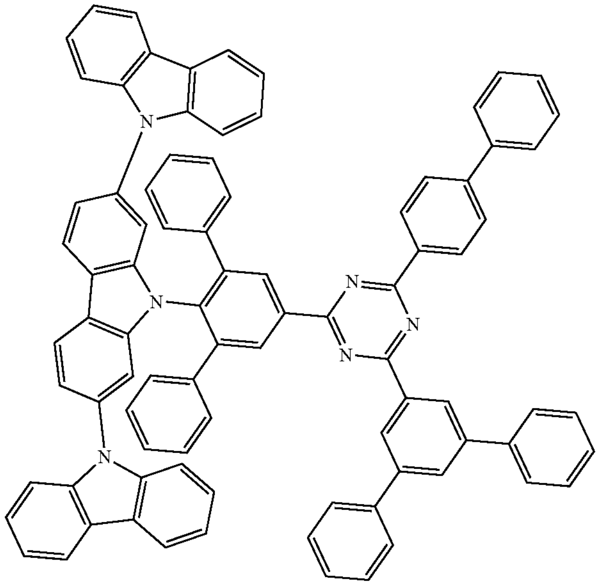
933
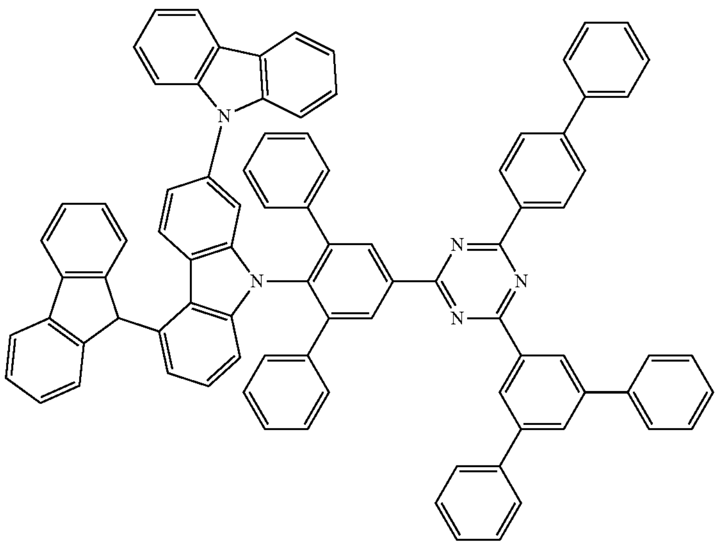

-continued
934
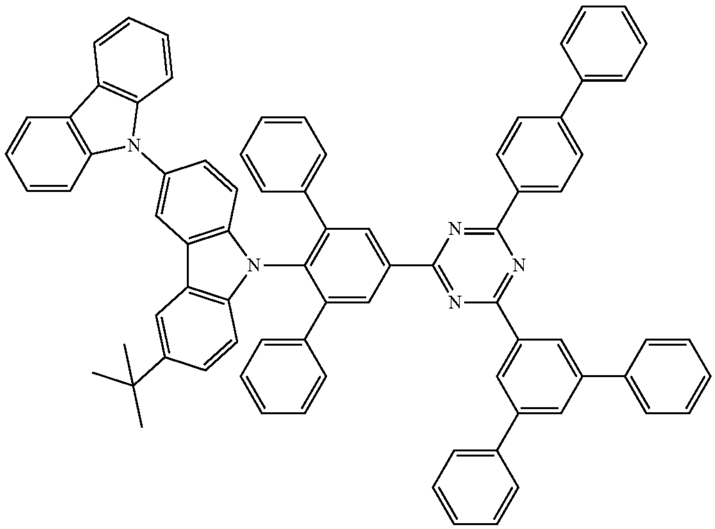
935
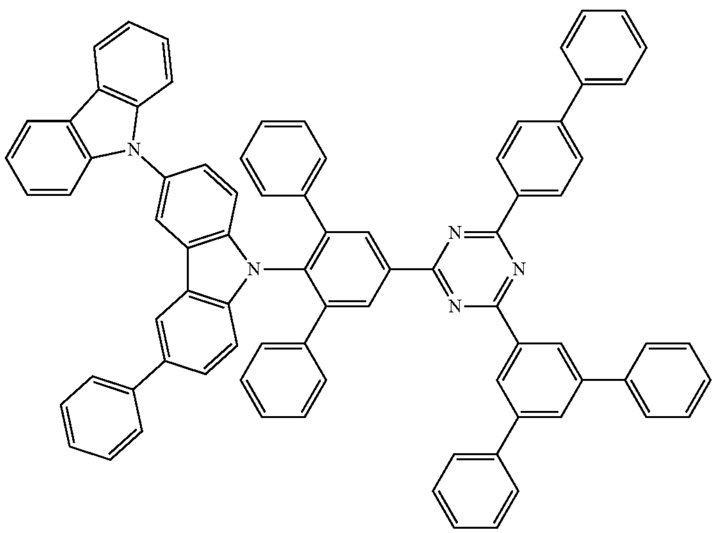
936
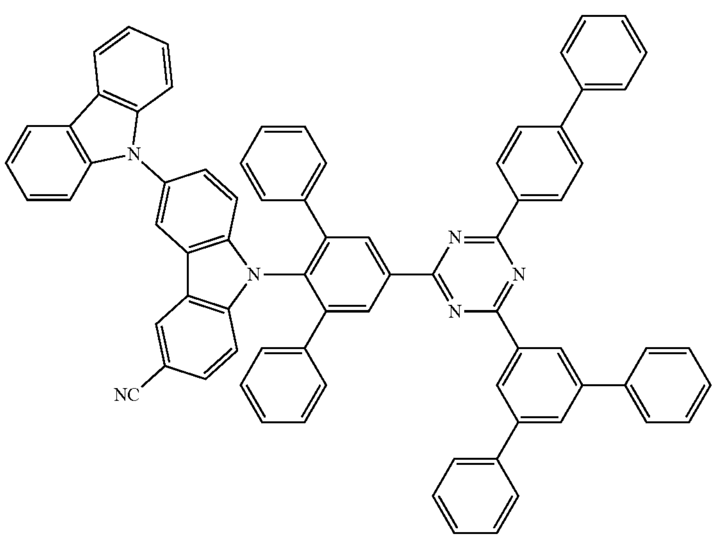

-continued
937
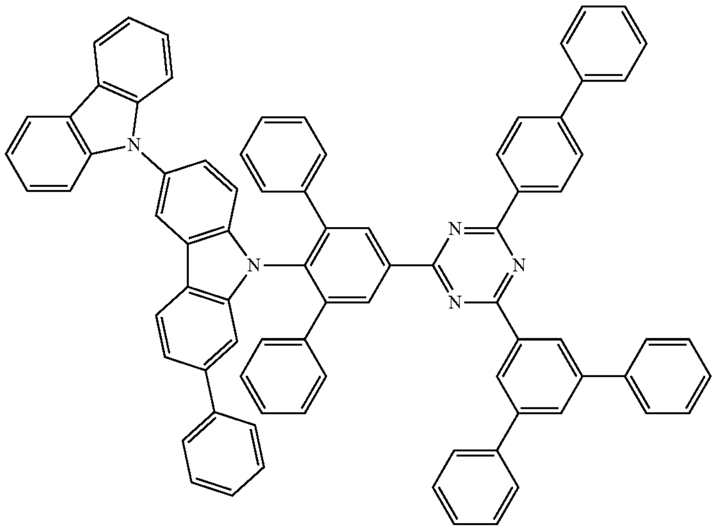
938
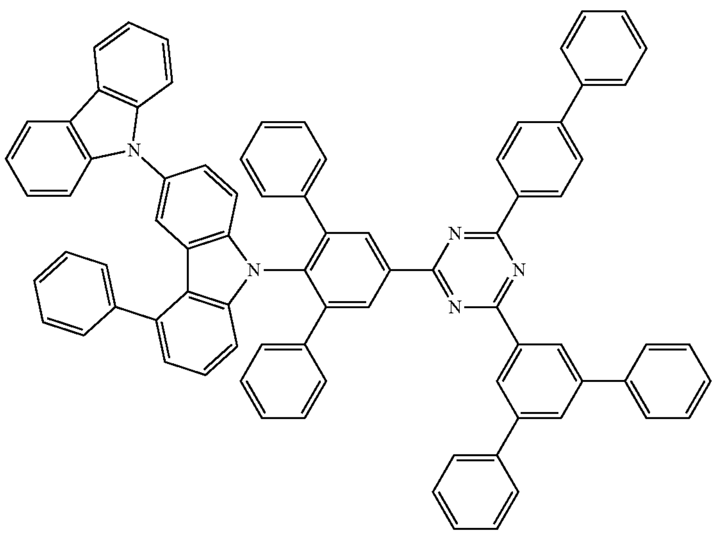
939
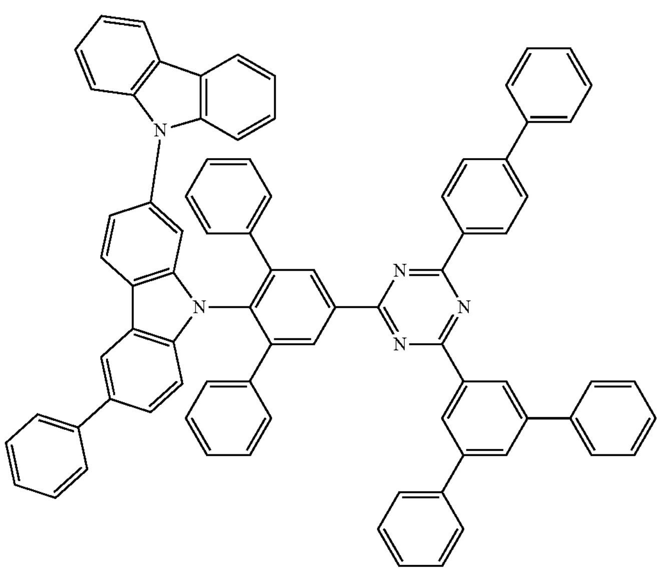

-continued
940
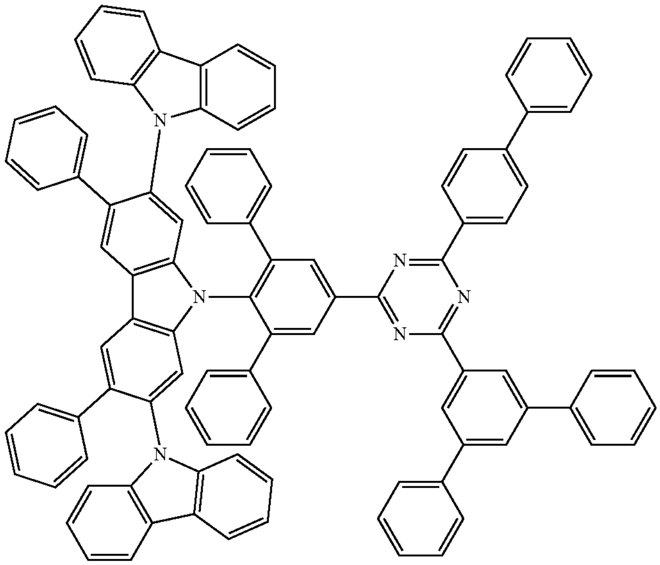
941
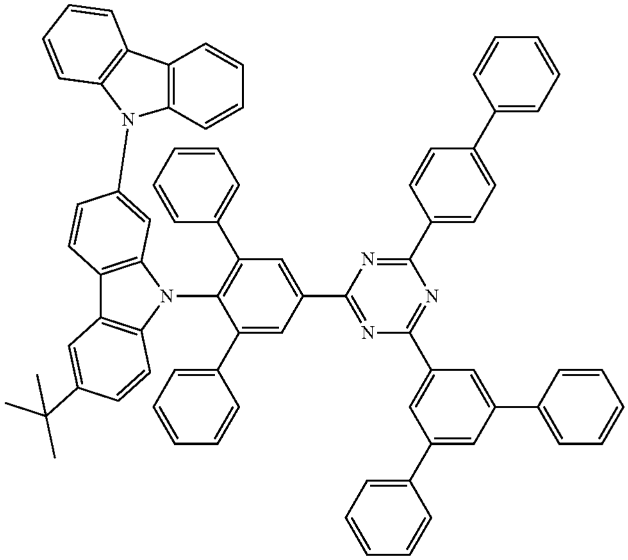
942
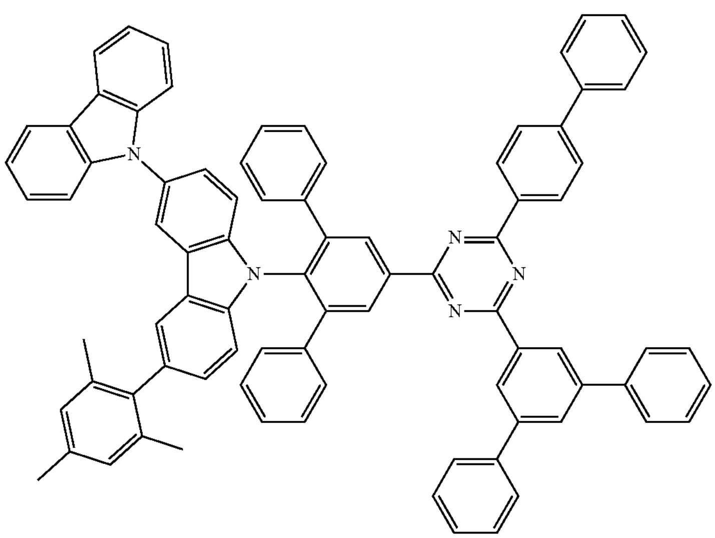

-continued
943
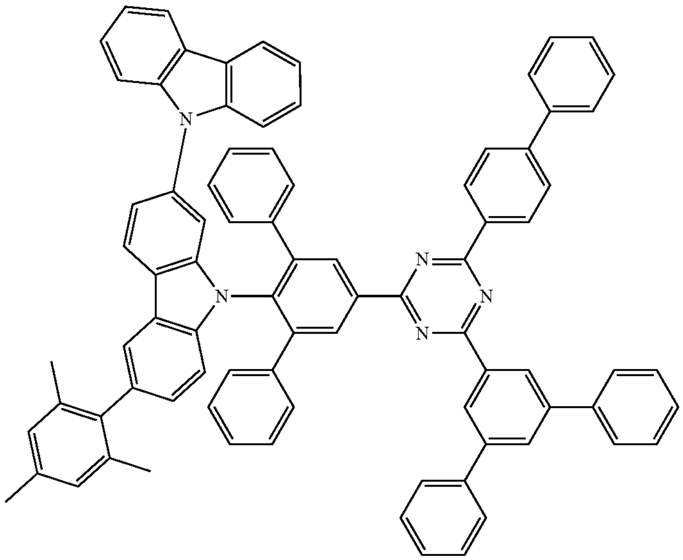
944
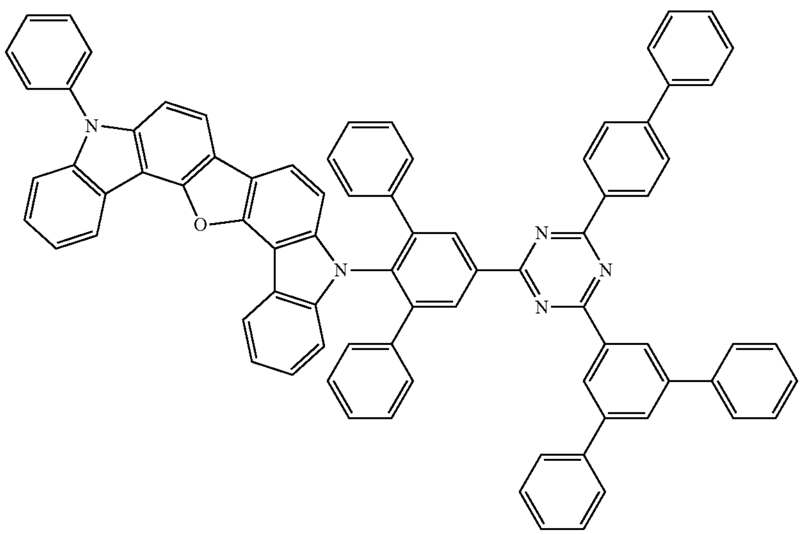
945
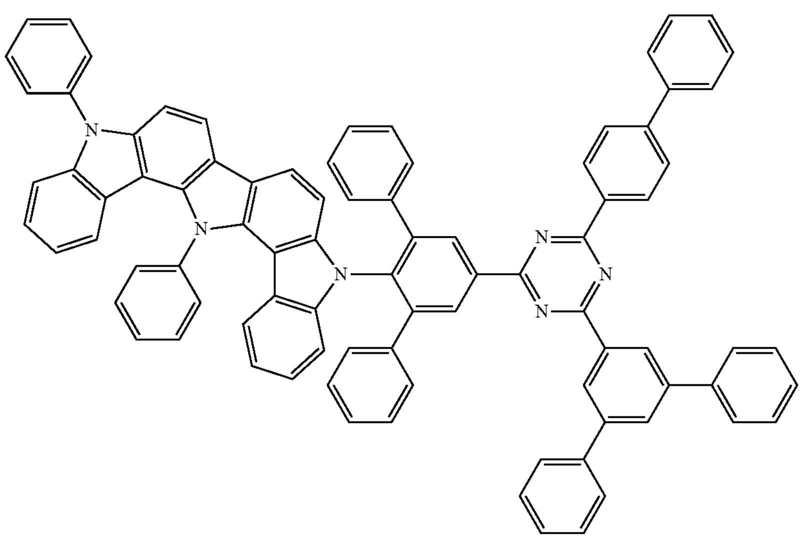

-continued
946
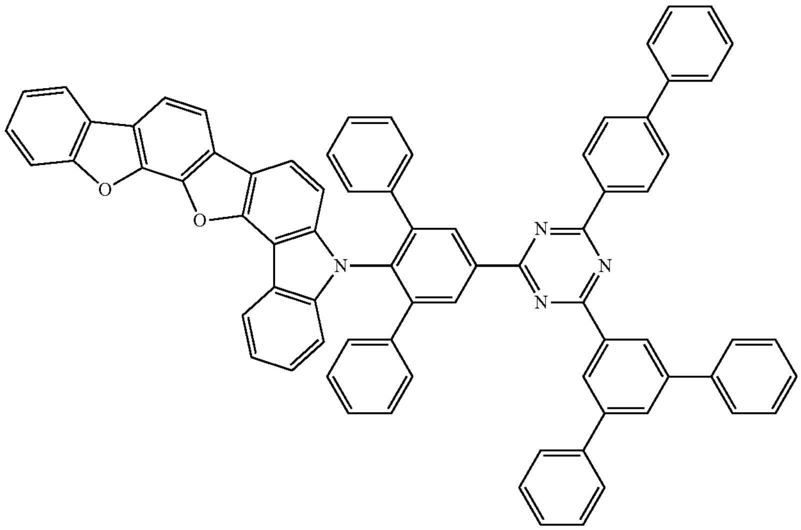
947
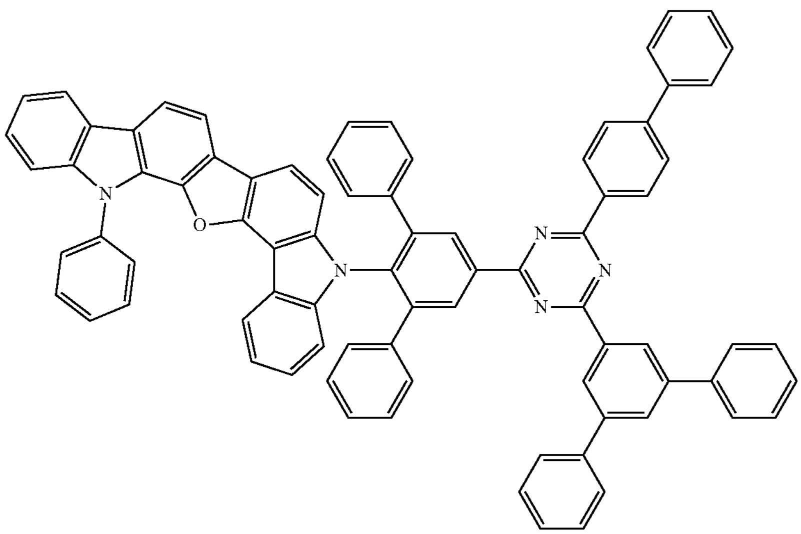
948
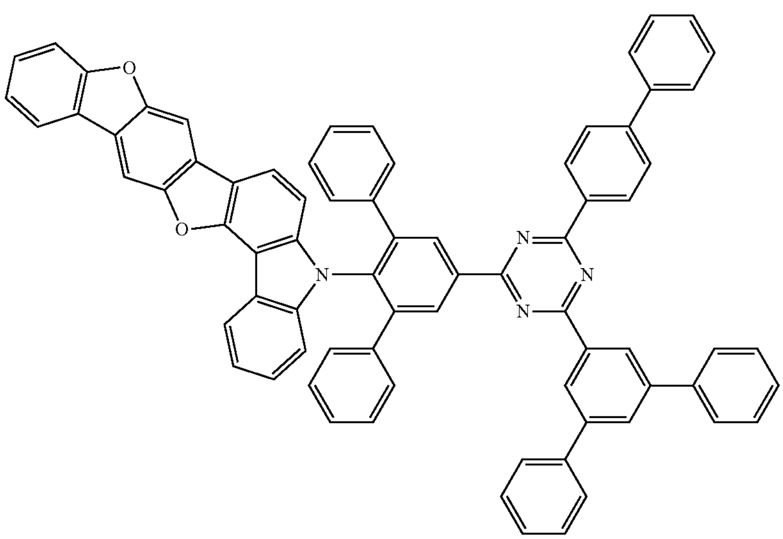

-continued
949
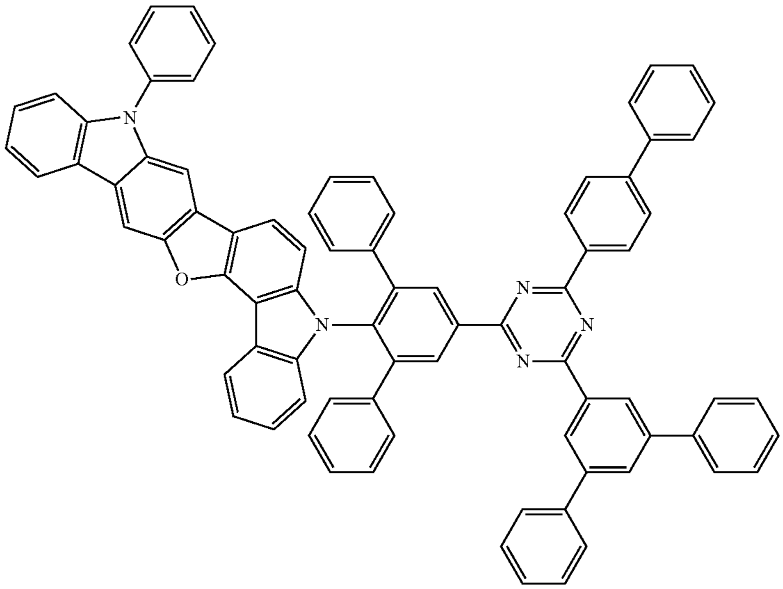
950
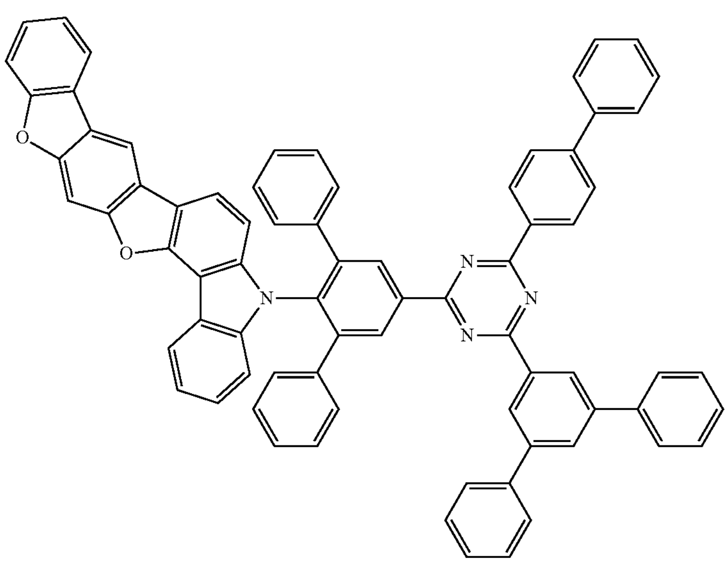

-continued
951
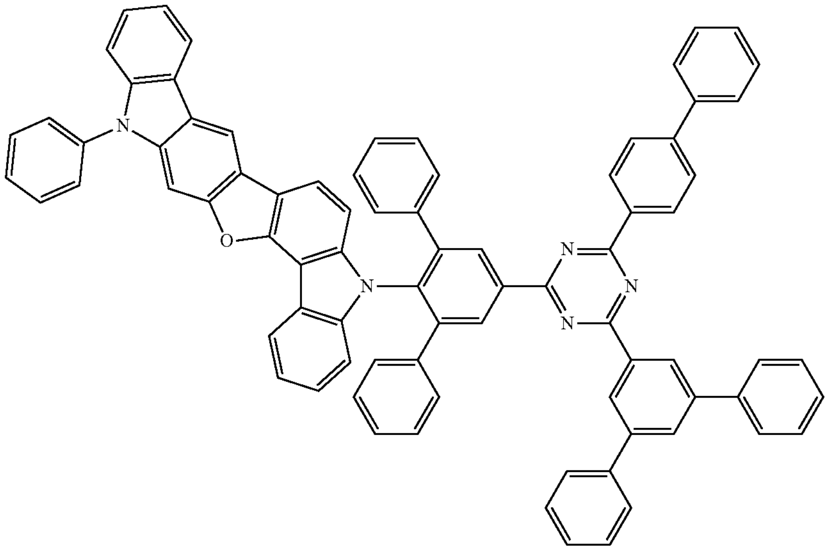
952
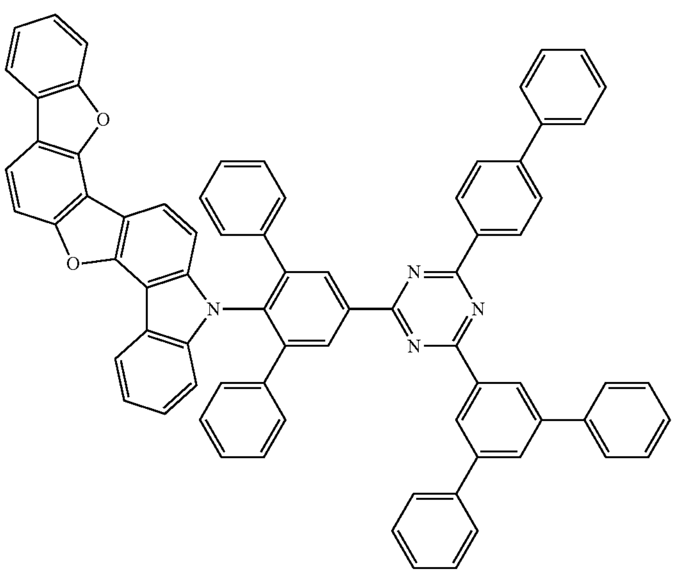

-continued
953
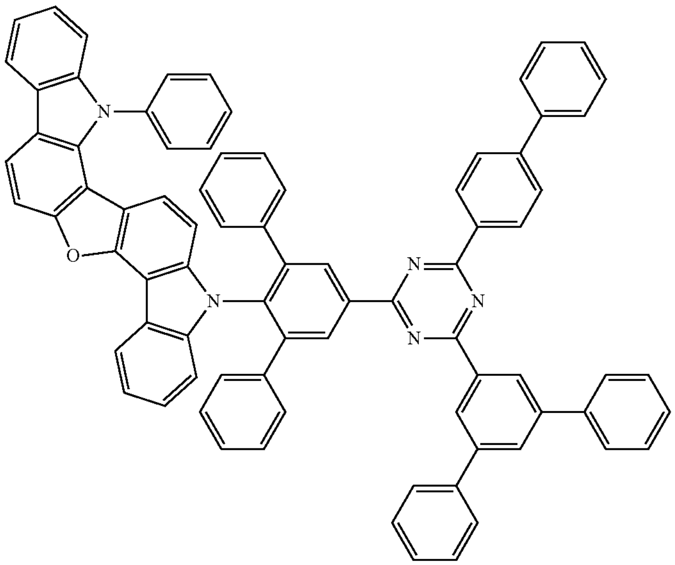
954
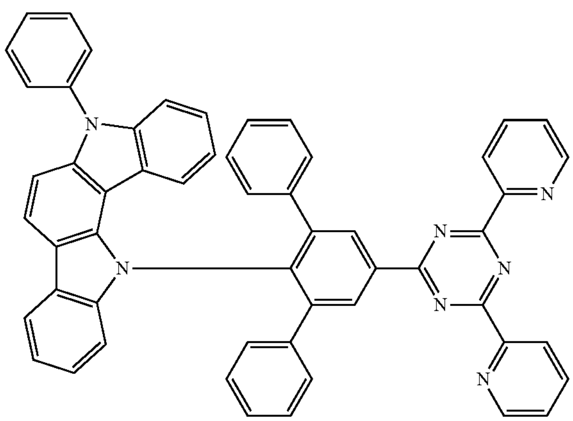
955
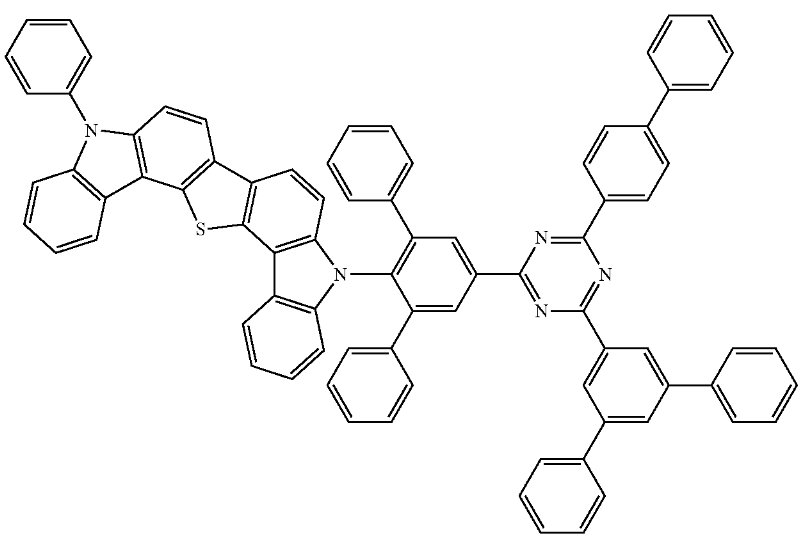

-continued
956
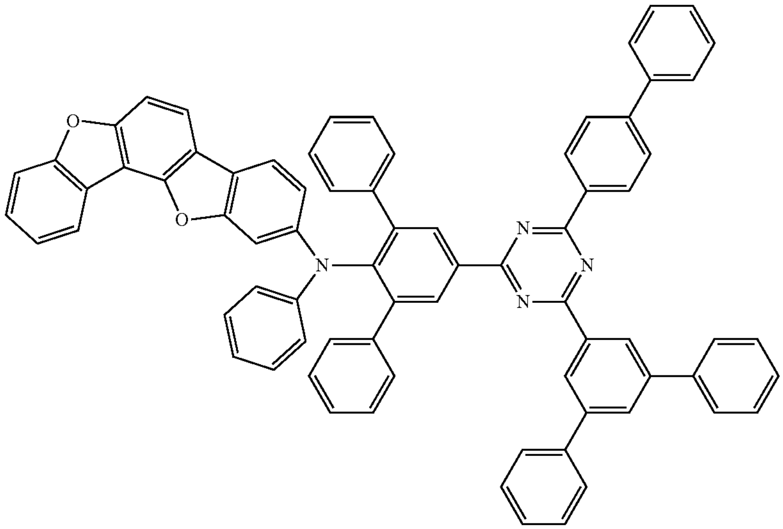
957
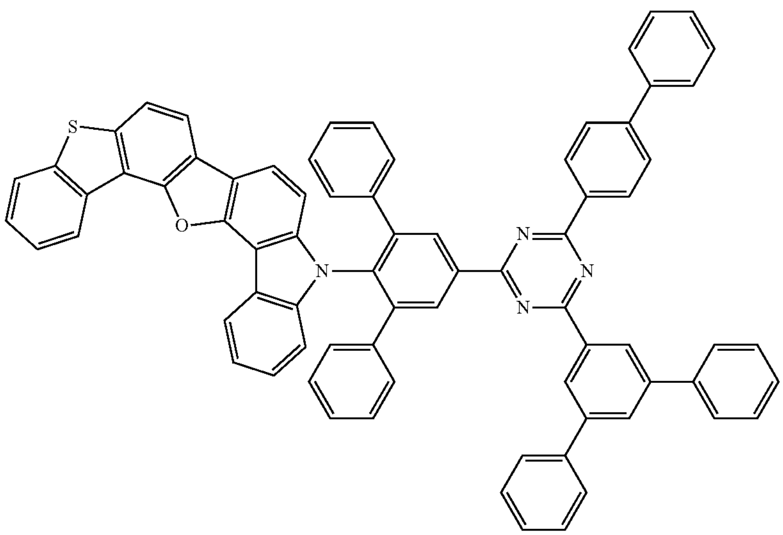
958
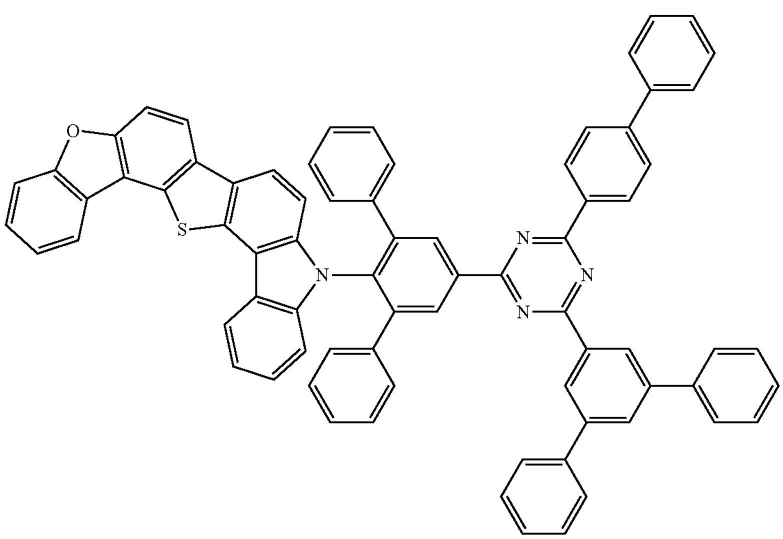

-continued
959
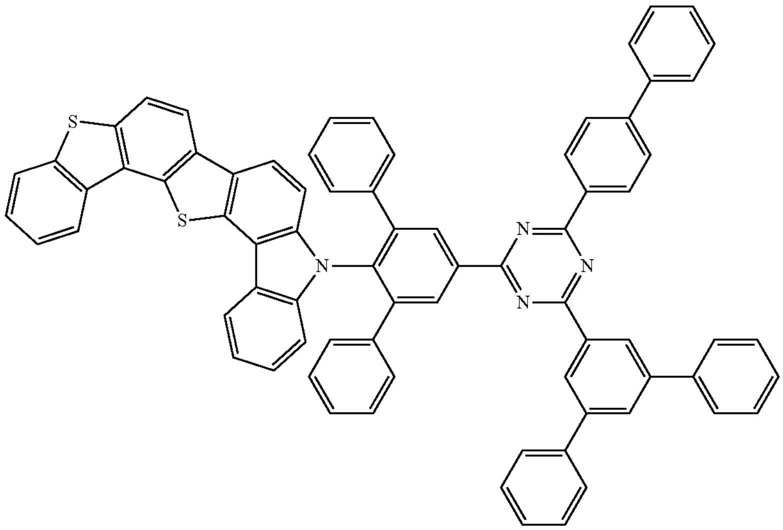
960
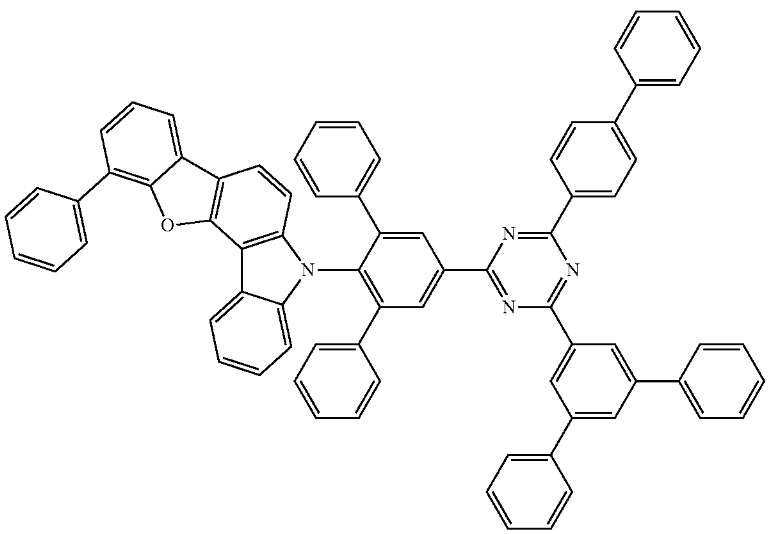
961
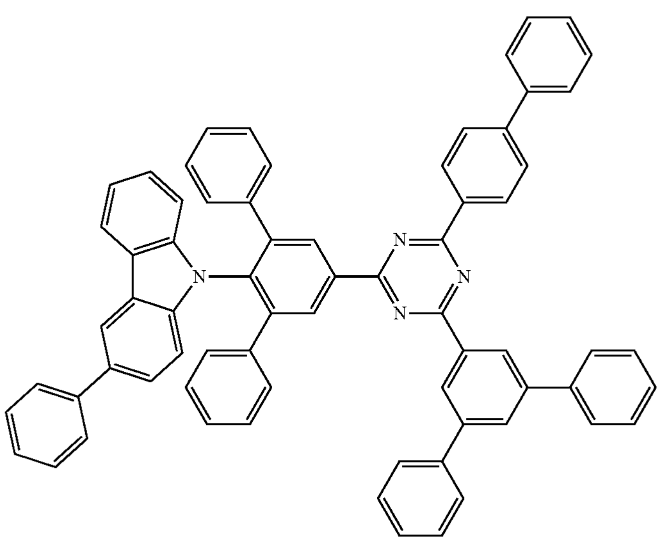

-continued
962
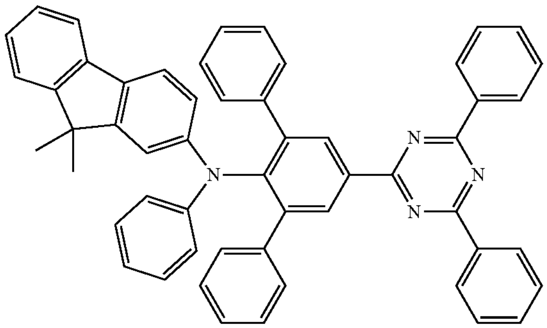
963
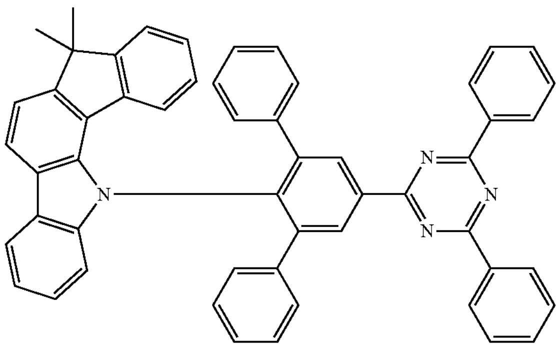
964
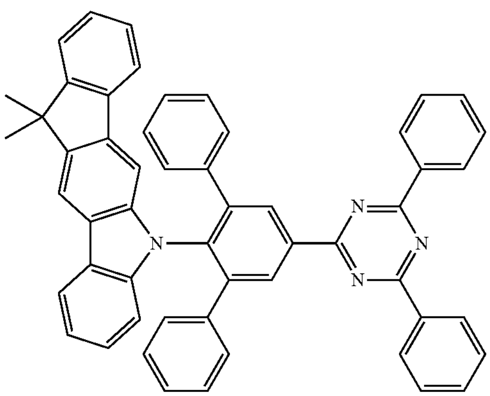
965
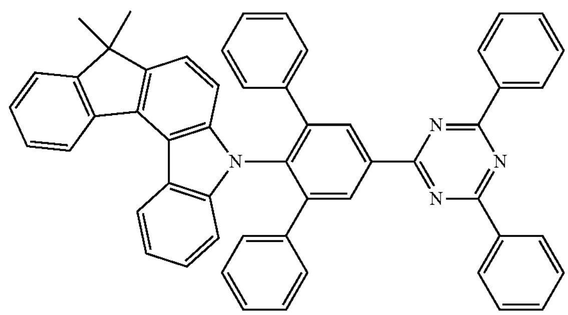
966
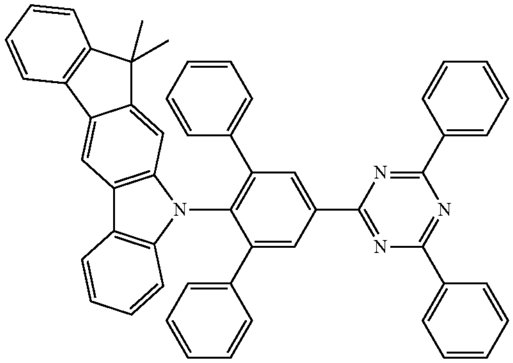
967
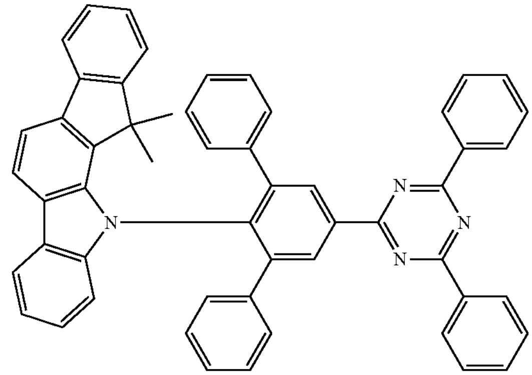

-continued
968
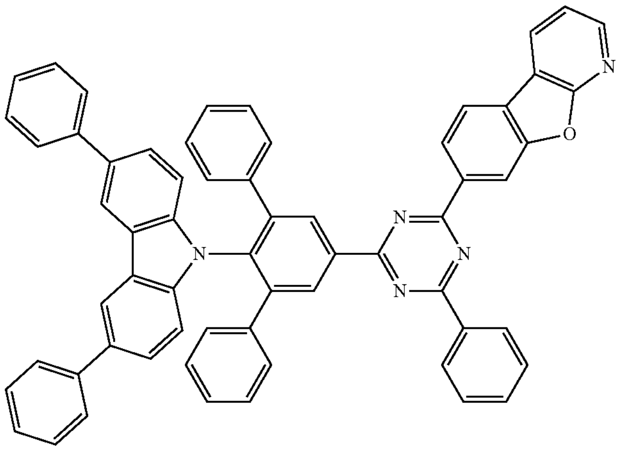
969
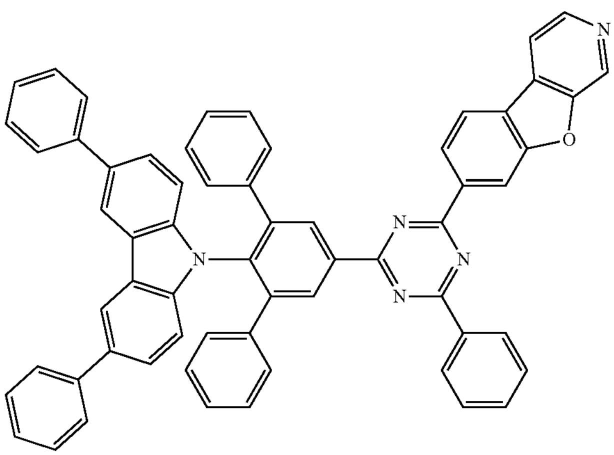
970
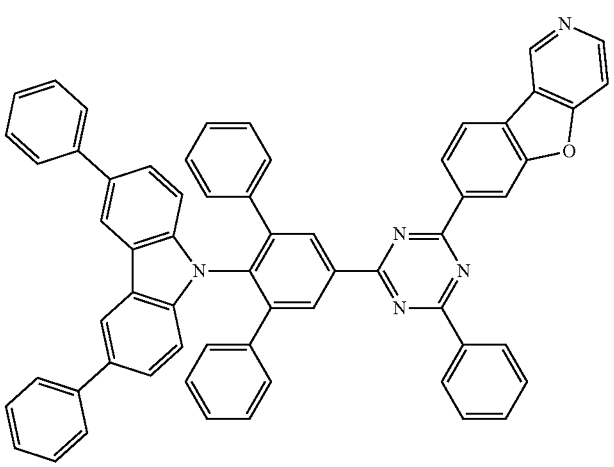

-continued
971
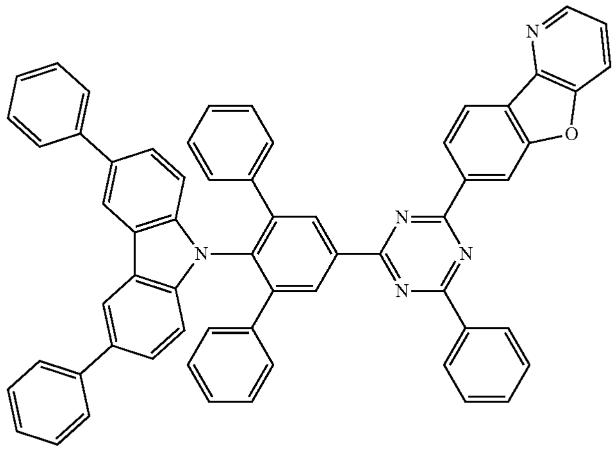
972
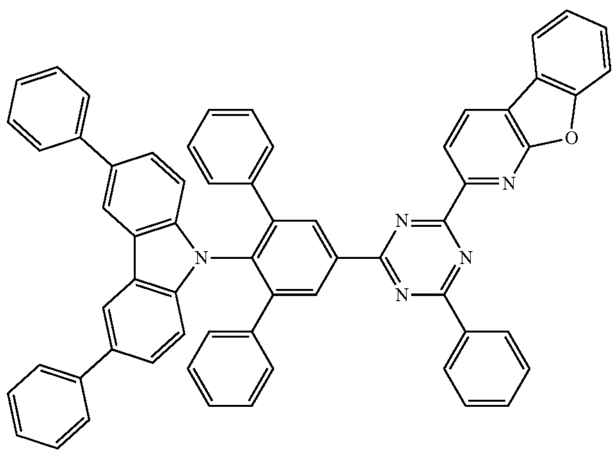
973
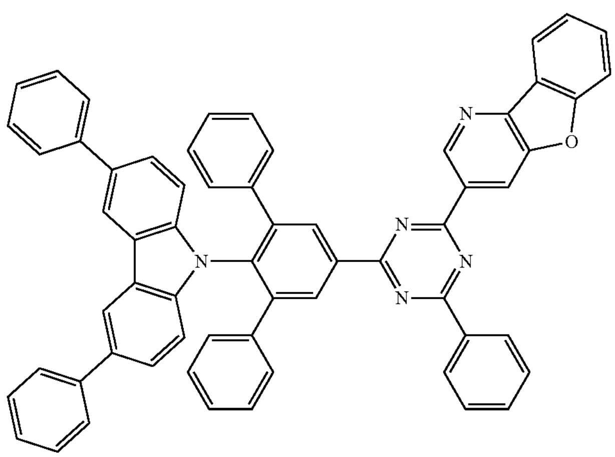

-continued
974
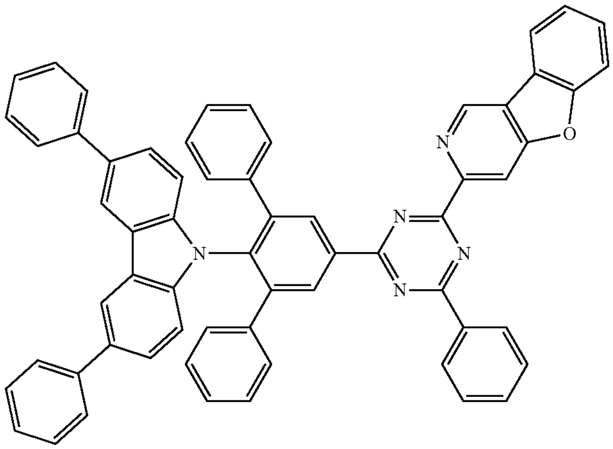
975
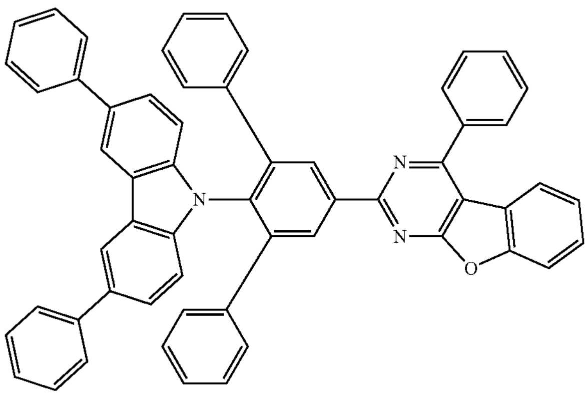
976
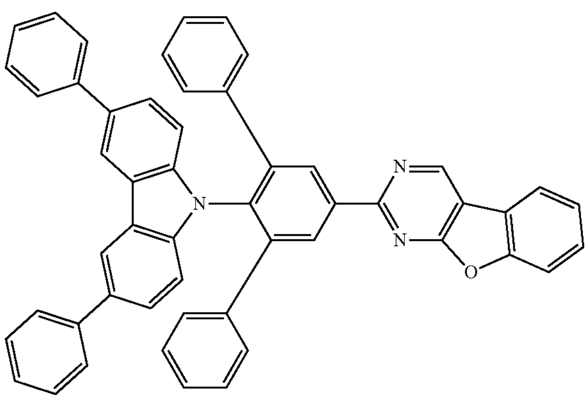
977
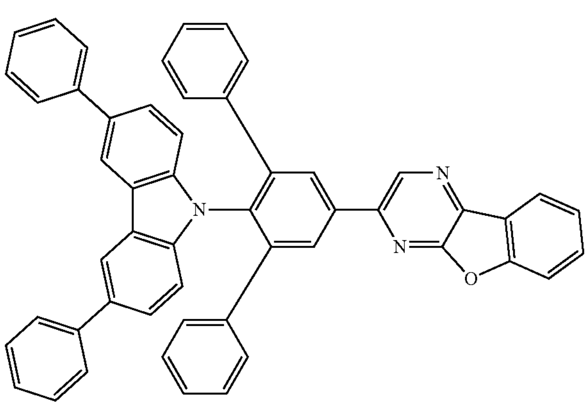

-continued
978
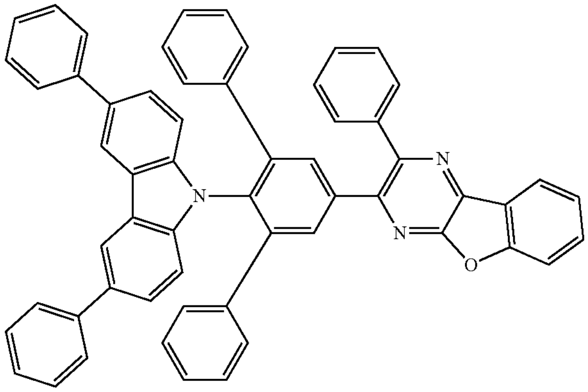
979
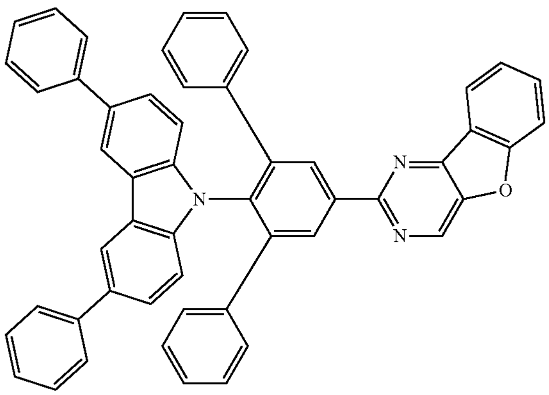
980
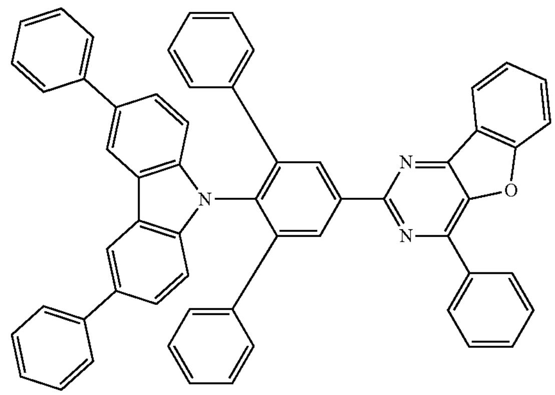
981
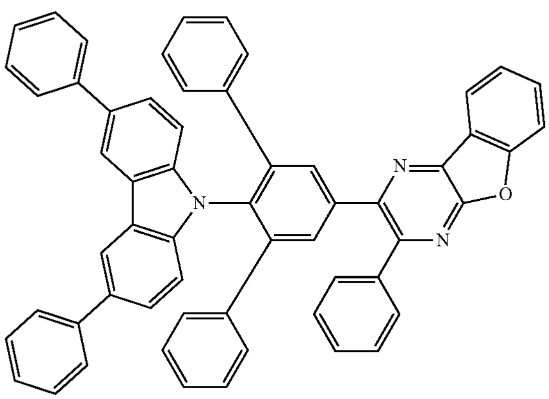
982
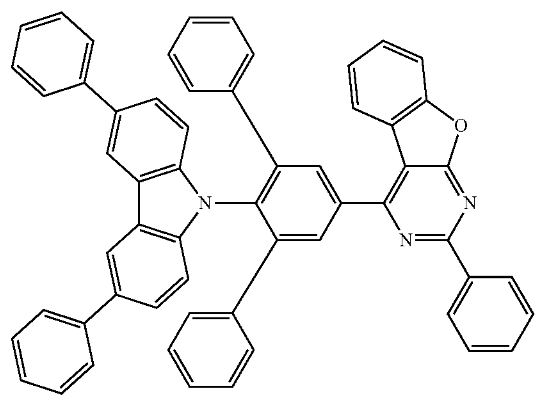
983
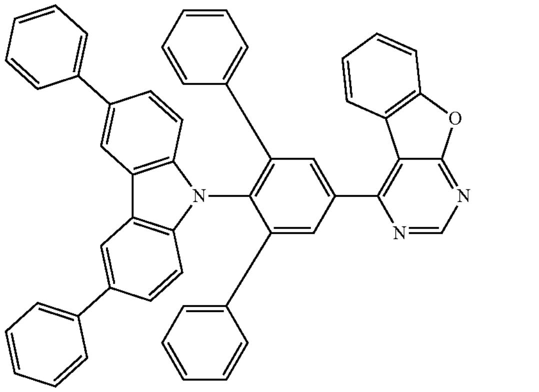
984
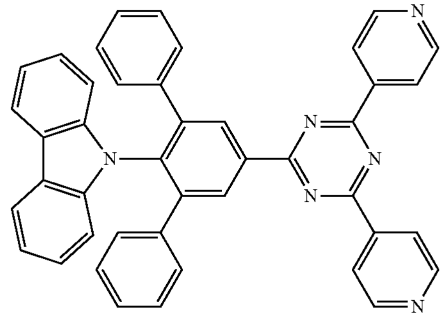

-continued
985
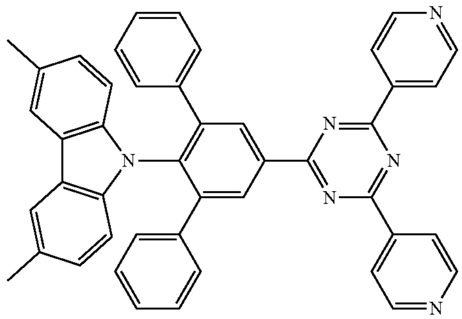
986
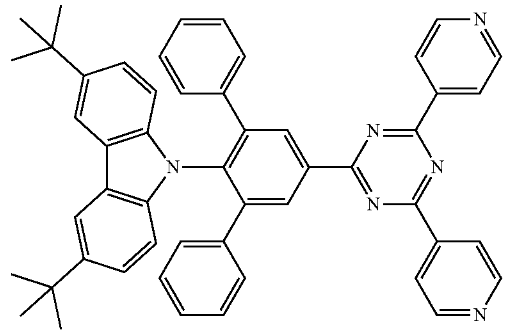
987
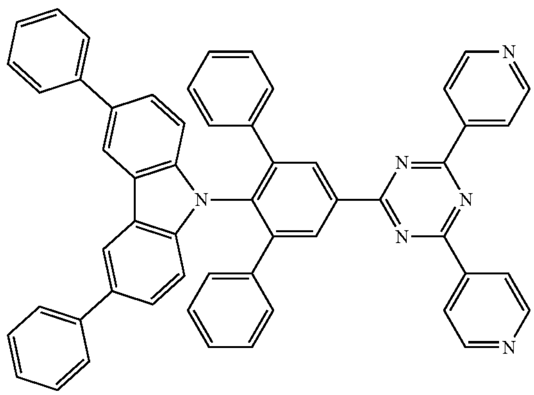
988
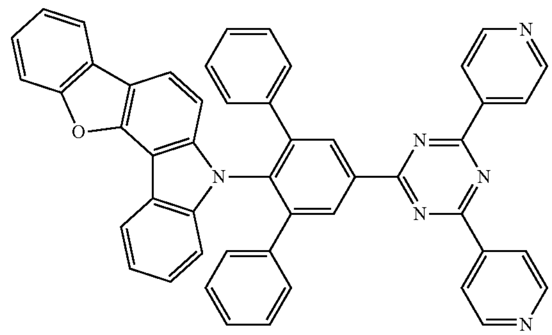
989
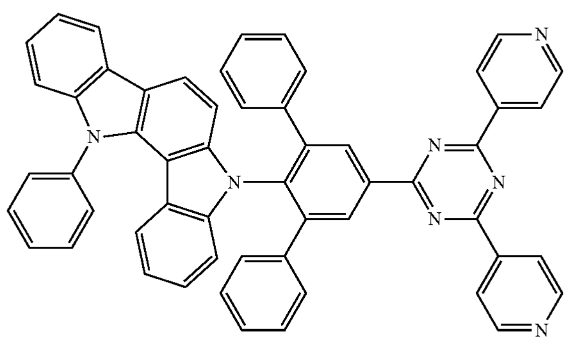
990
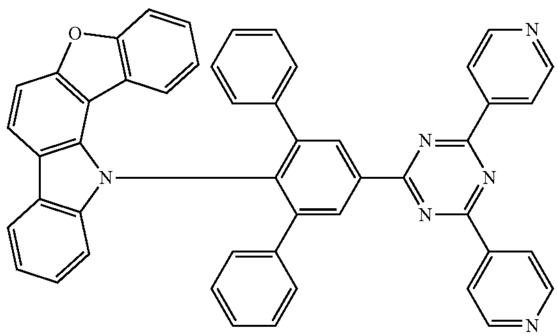

-continued
991
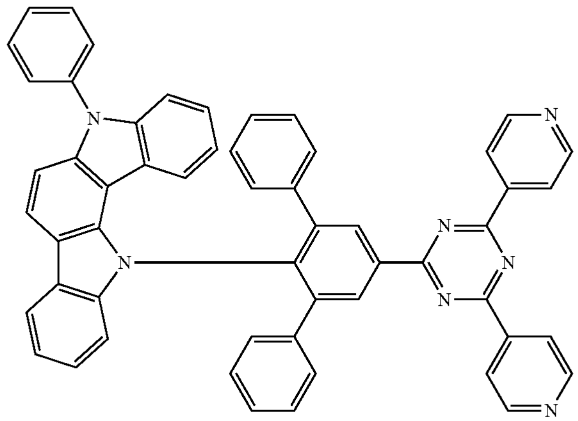
992
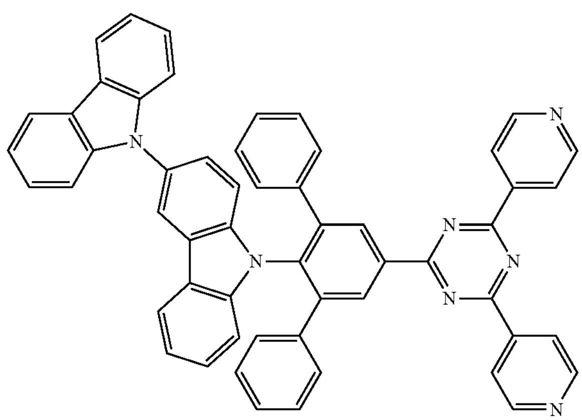
993
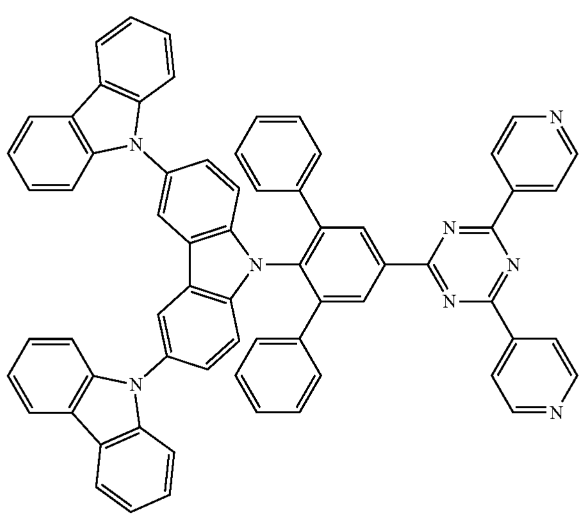

-continued
994
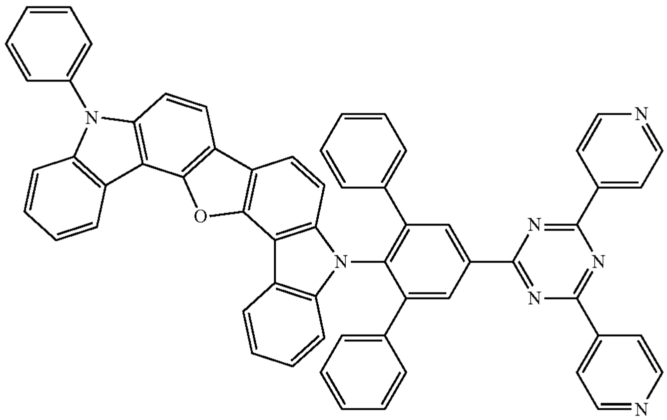
995
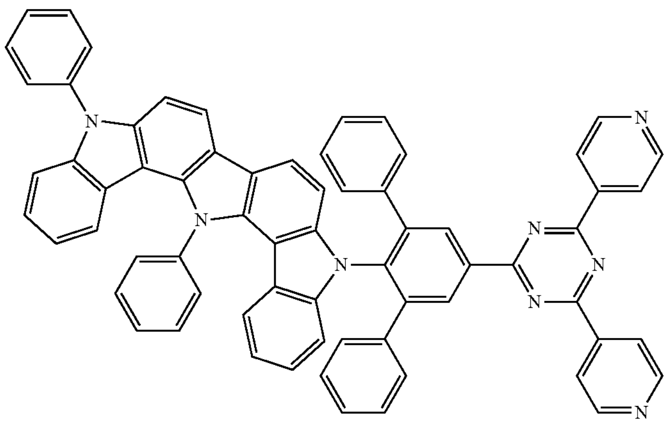
996
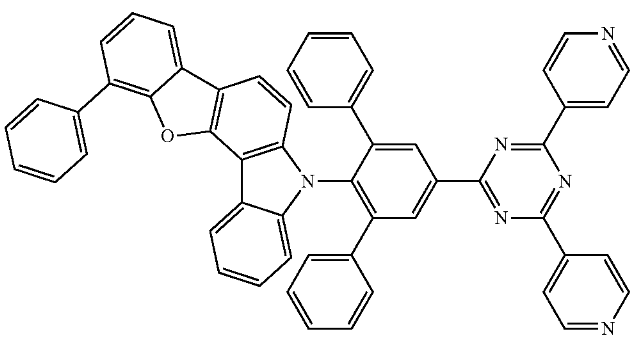
997
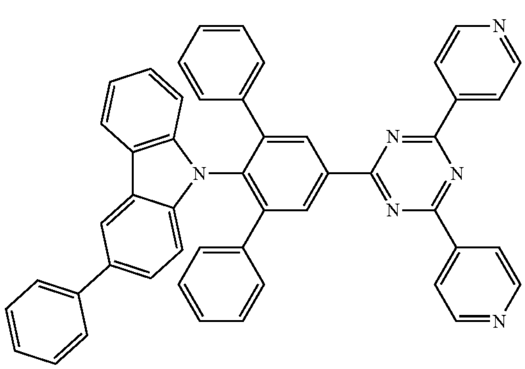
998
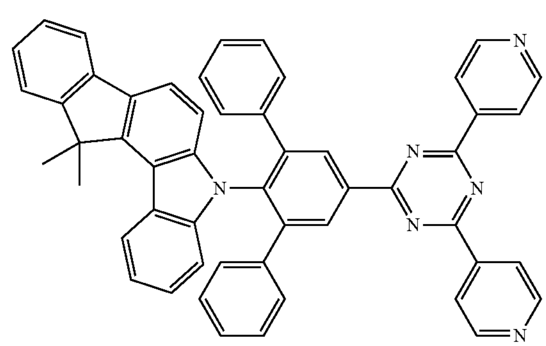

-continued
999
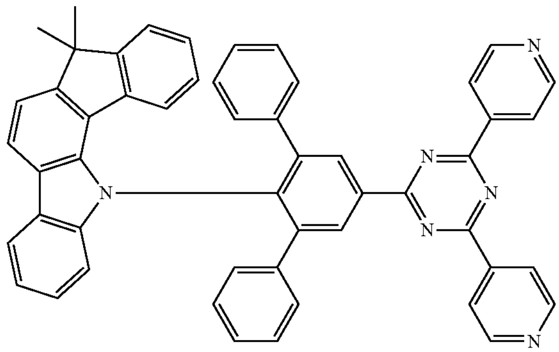
1000
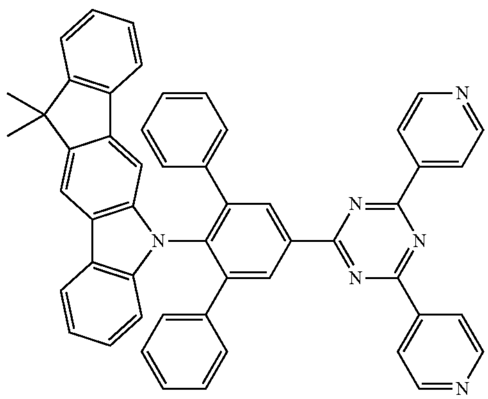
1001
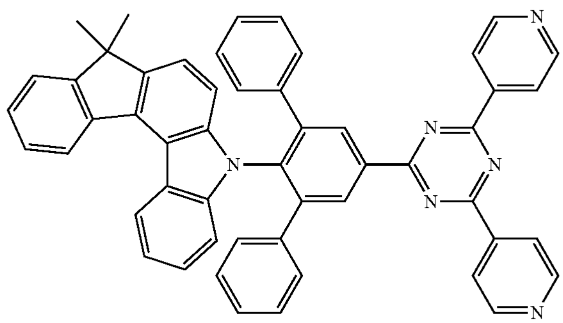
1002
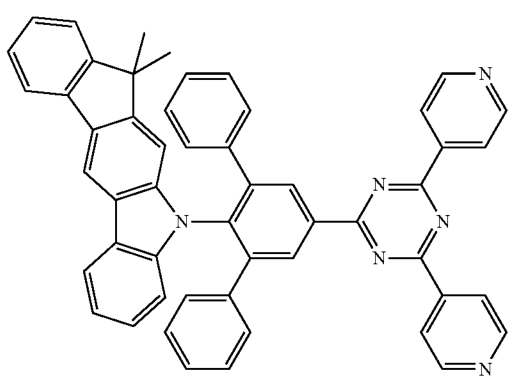

-continued
1003
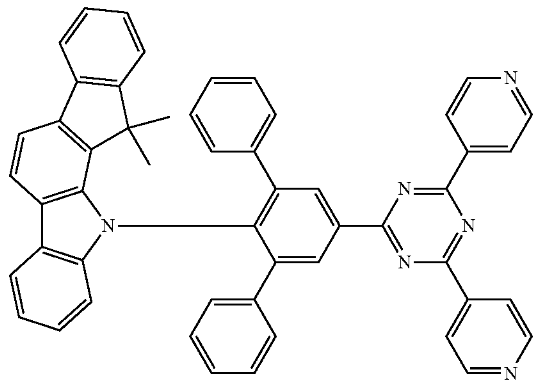
1004
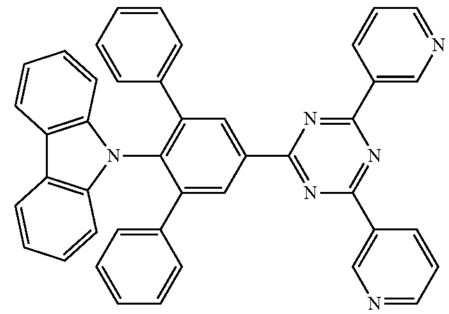
1005
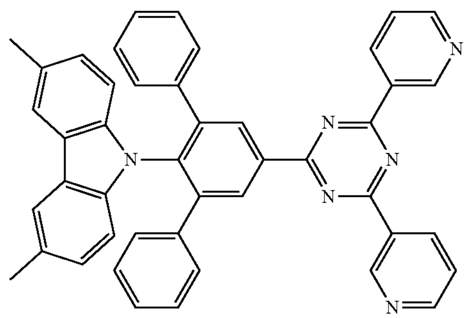
1006
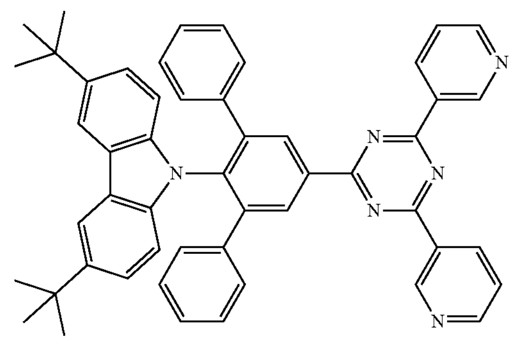
1007
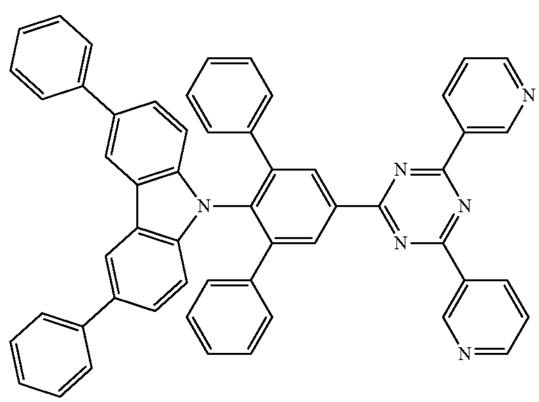
1008
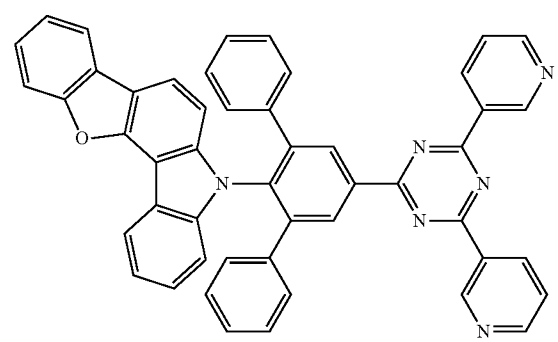
1009
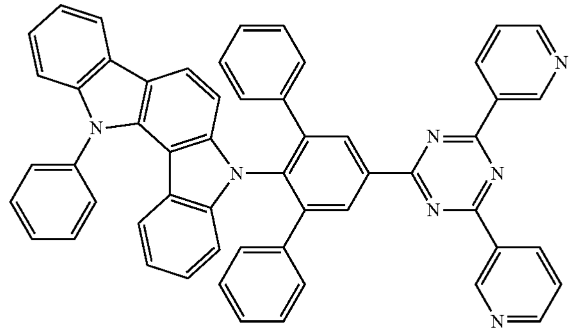

-continued
1010
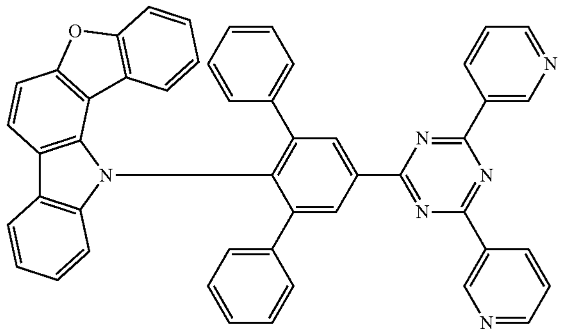
1011
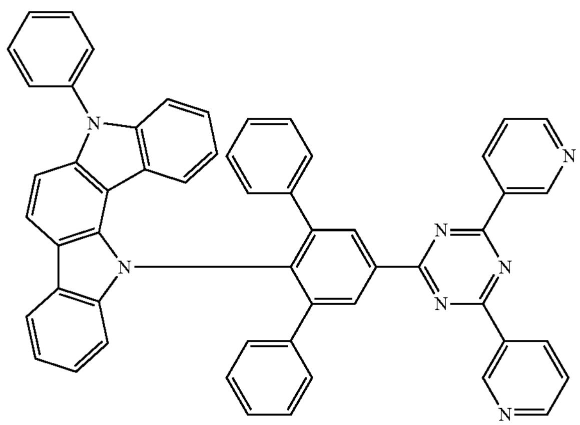
1012
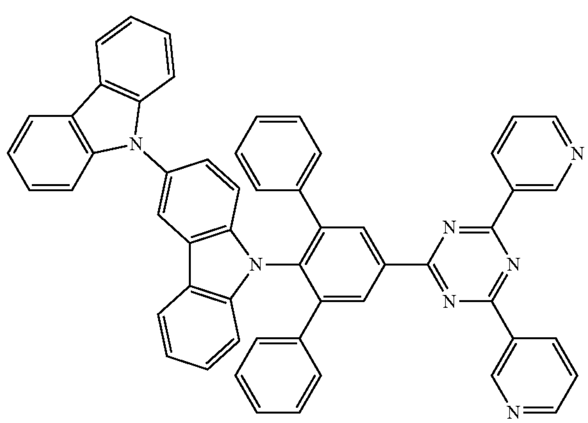

-continued
1013
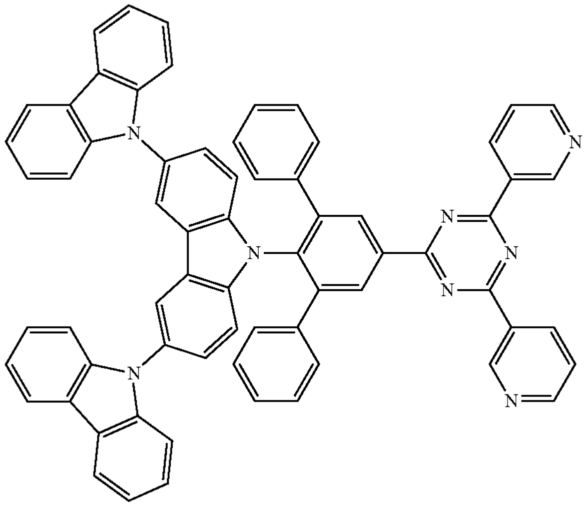
1014
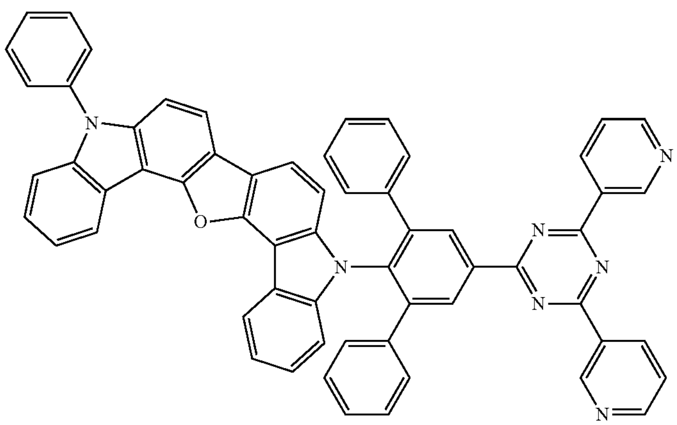
1015
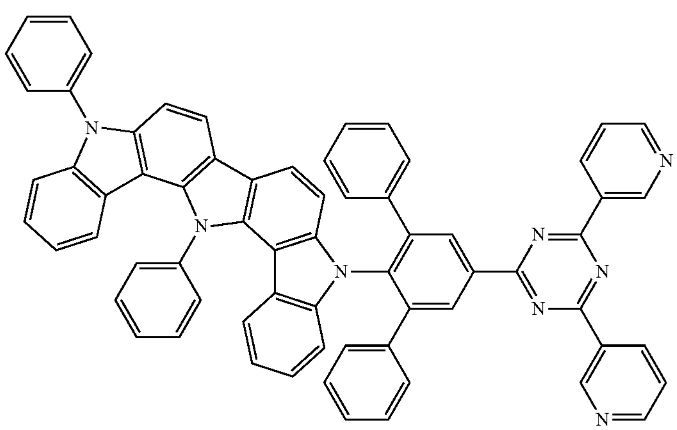

-continued
1016
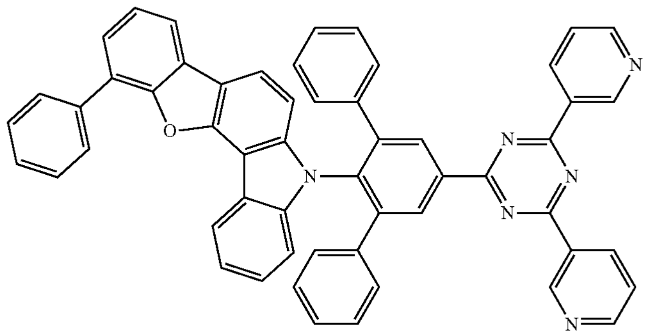
1017
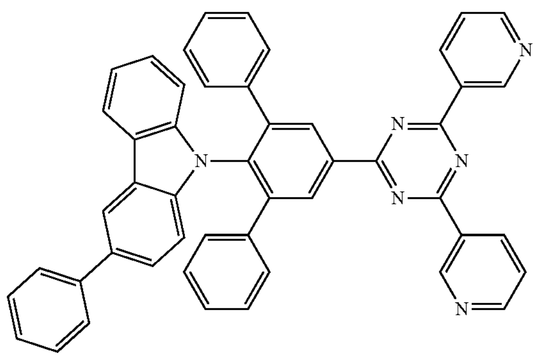
1018
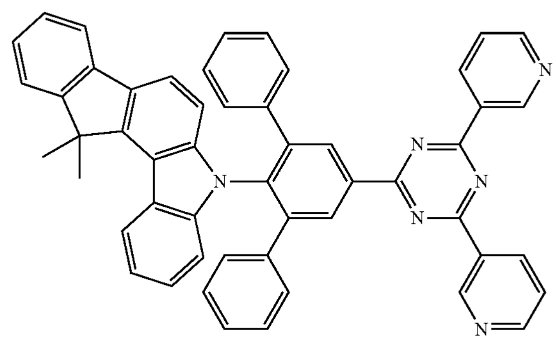
1019
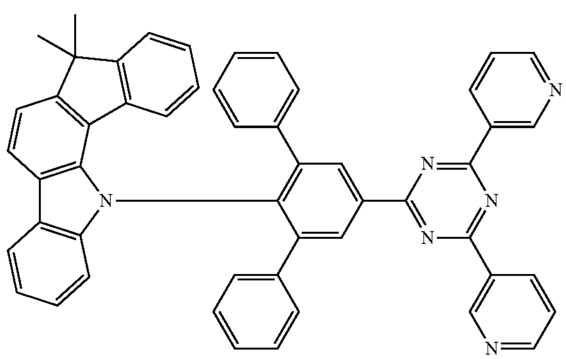
1020
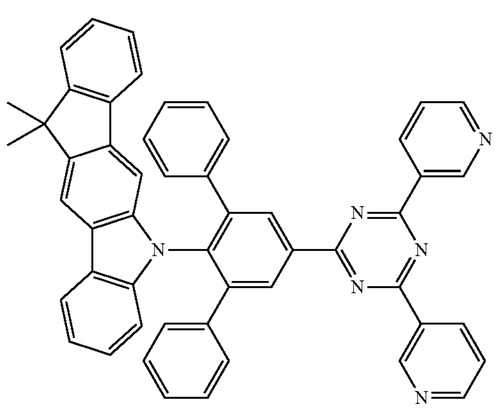

-continued
1021
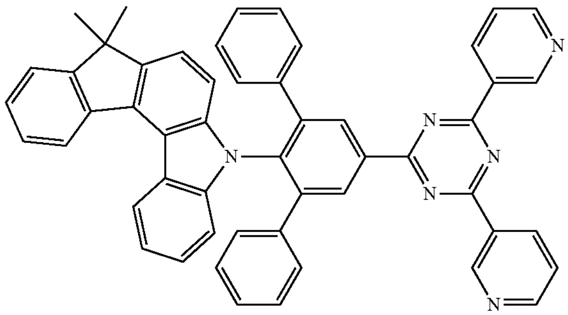
1022
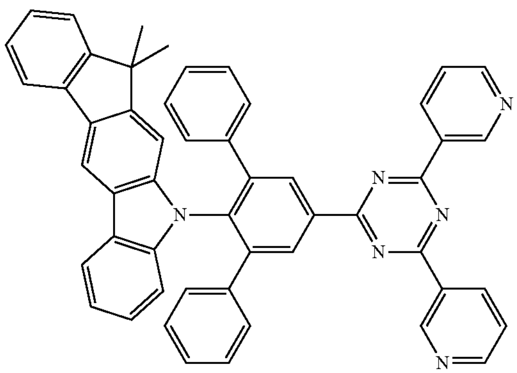
1023
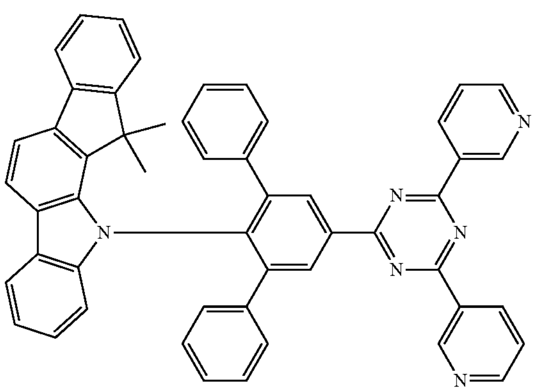
1024
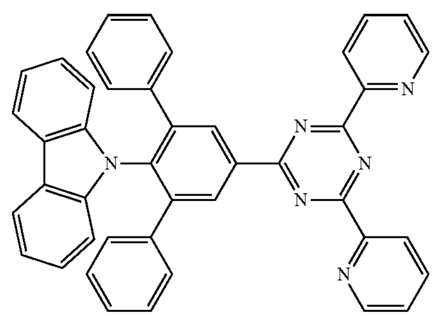
1025
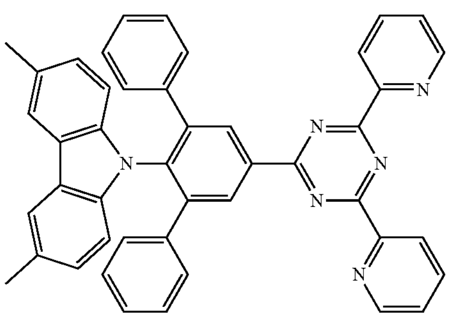
1026
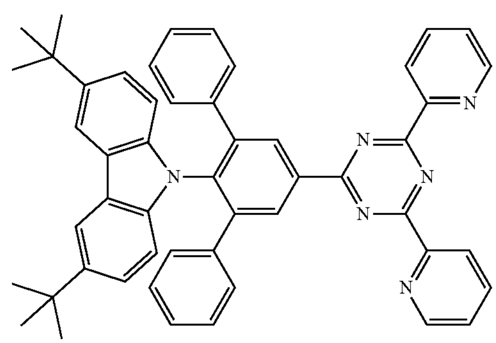

-continued
1027
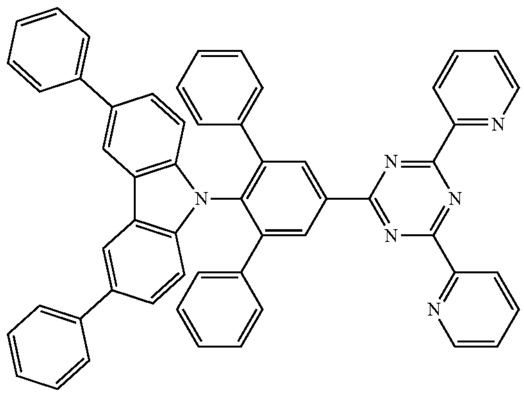
1028
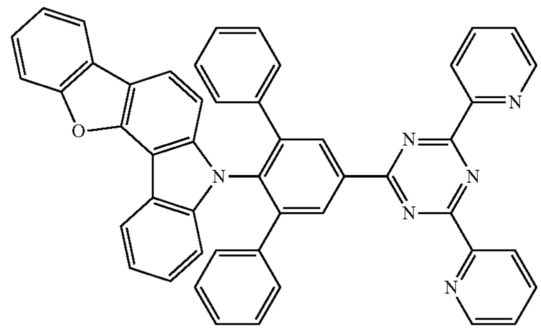
1029
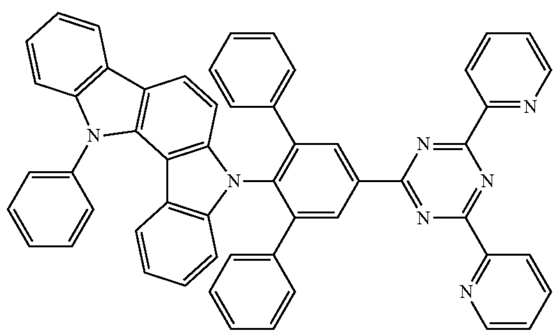
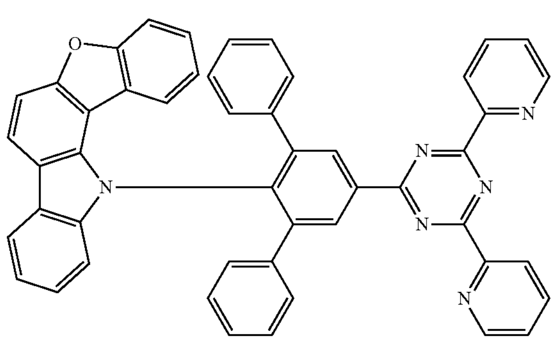 [SMILES: c1ccc(-c2cc(-c3nc(-c4ccccn4)nc(-c4ccccn4)n3)cc(-c3ccccc3)c2-n2c3ccccc3c3ccc4oc5ccccc5c4c32)cc1]

Group XIII
1
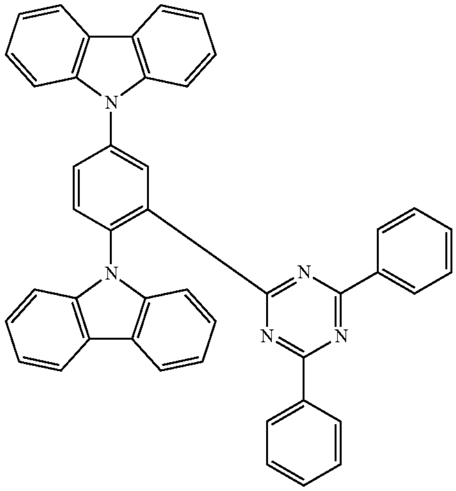
2
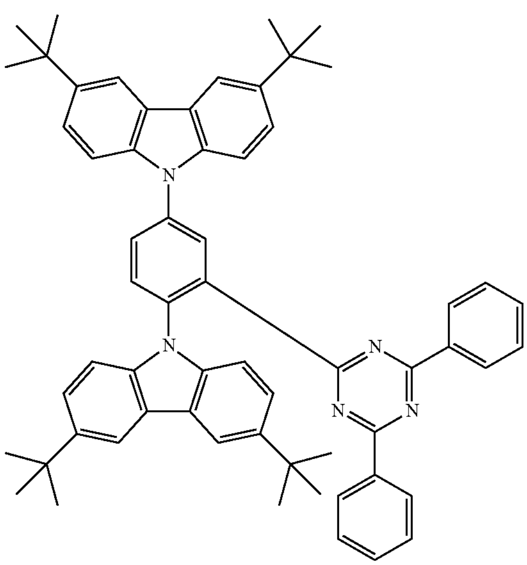
-continued
3
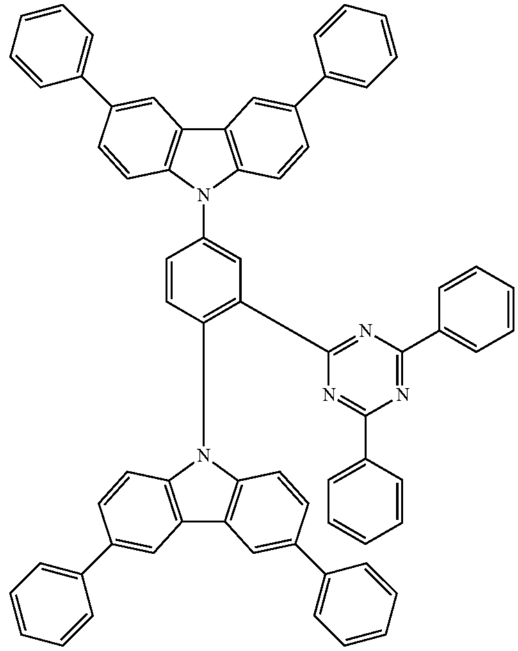
4
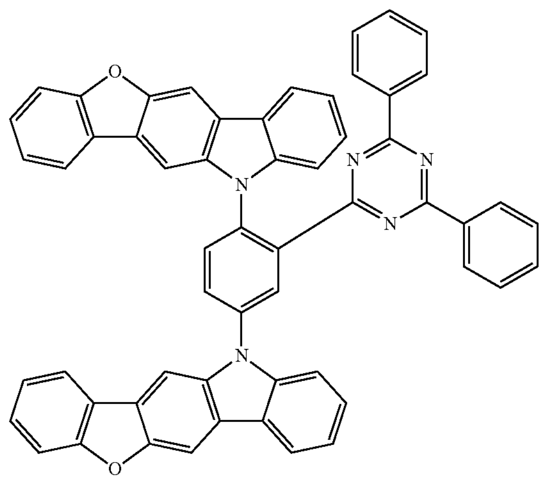
5
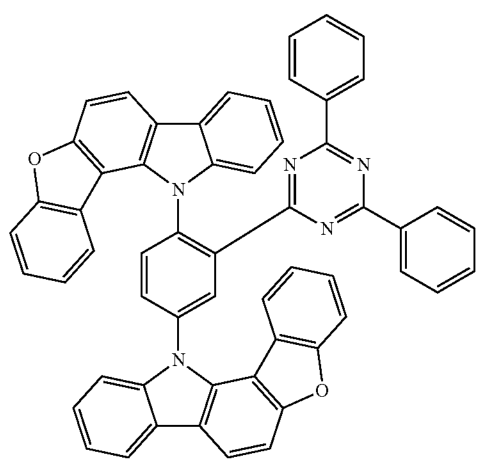

-continued
6
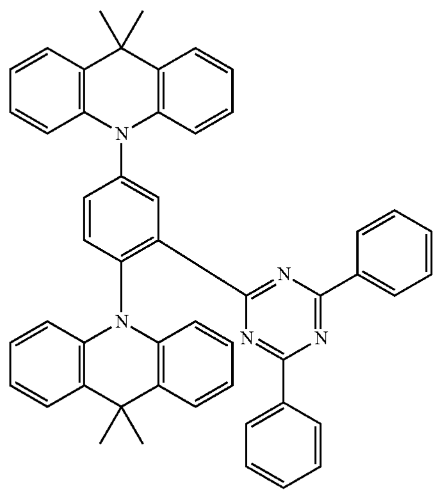
7
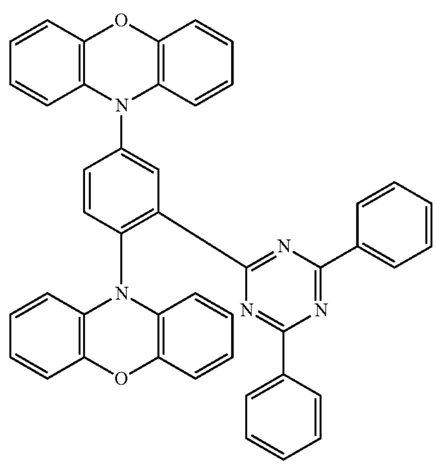
8
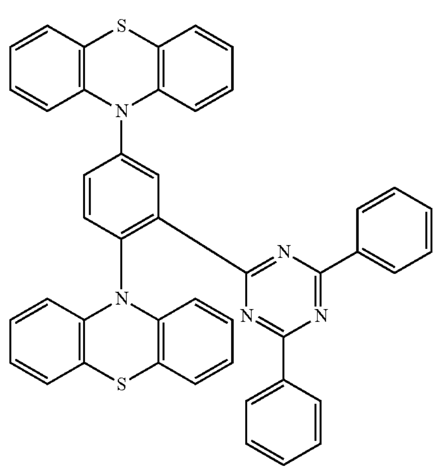
-continued
9
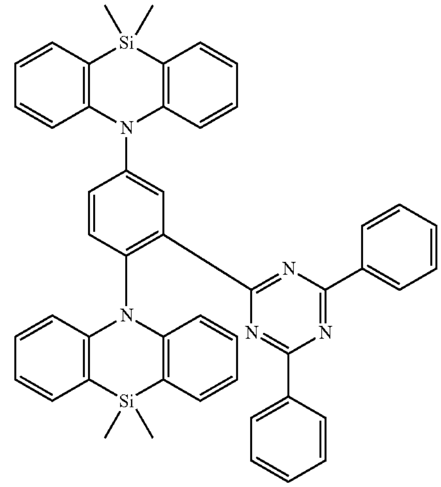
10
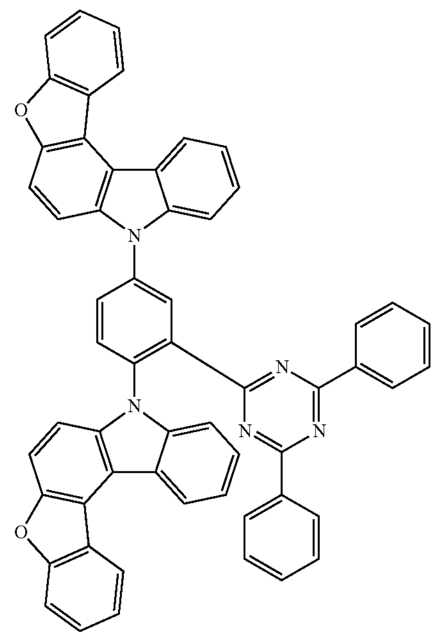
11
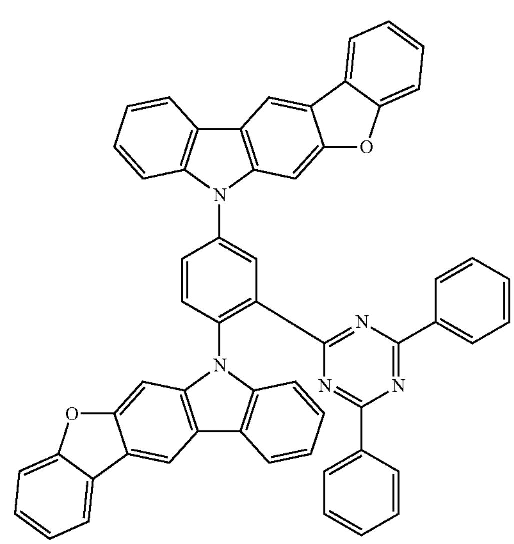

-continued
12
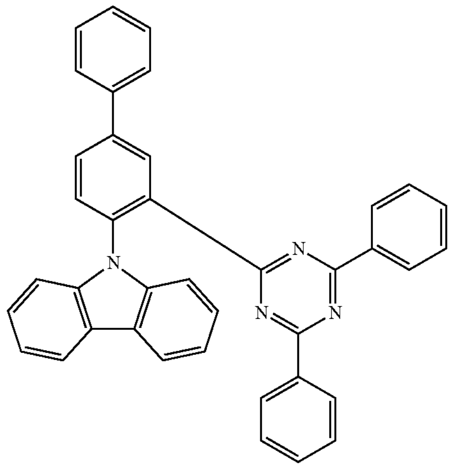
13
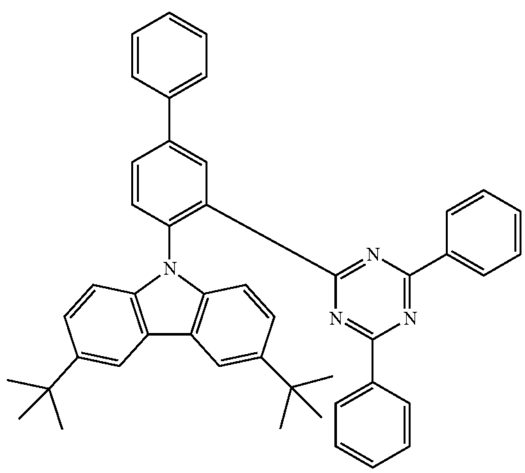
14
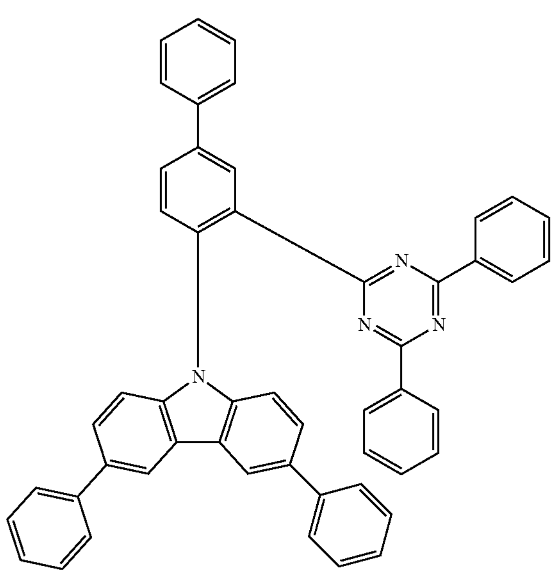
-continued
15
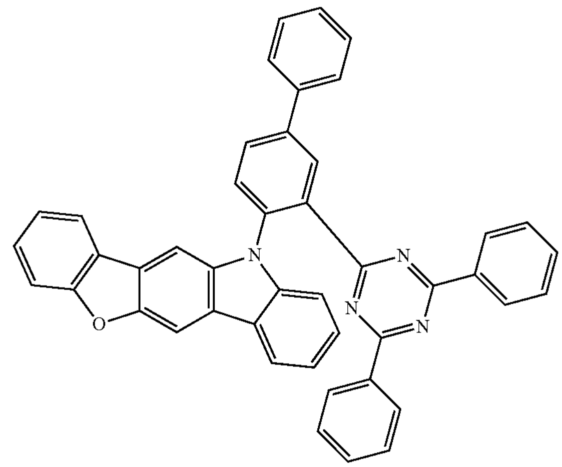
16
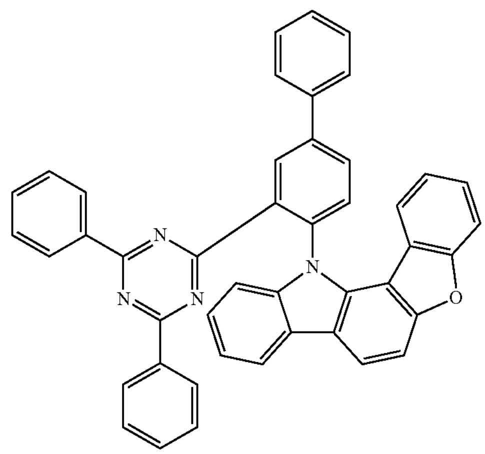
17
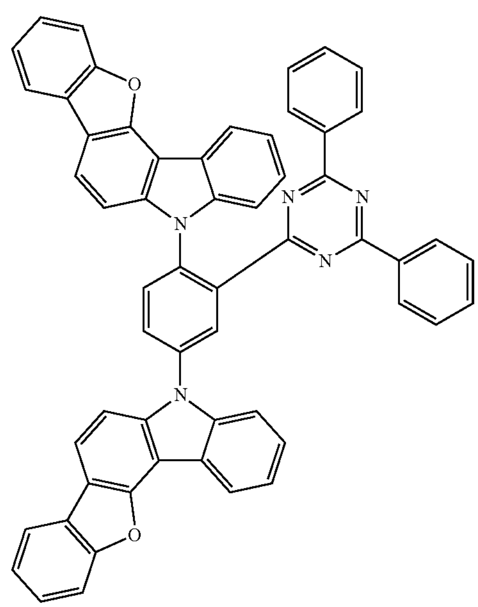

-continued
18
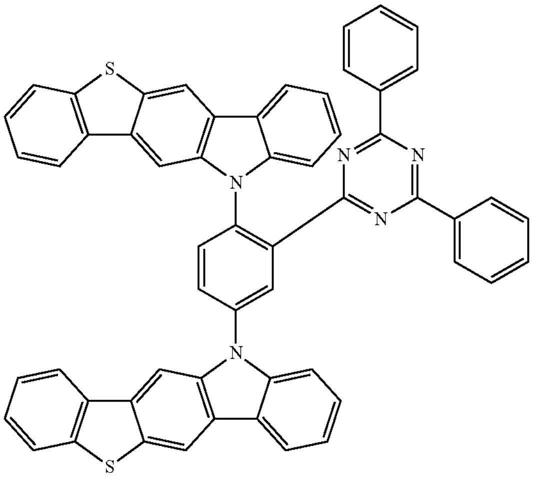
19
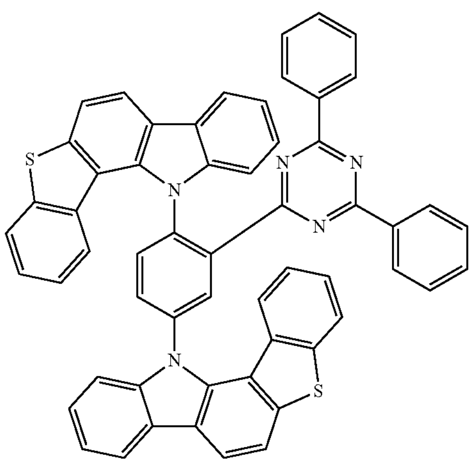
20
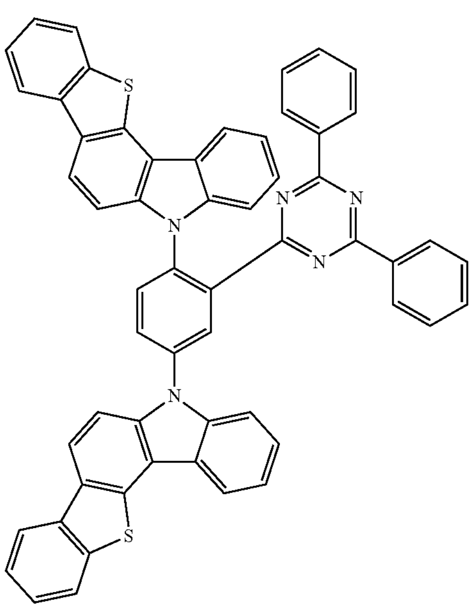
-continued
21
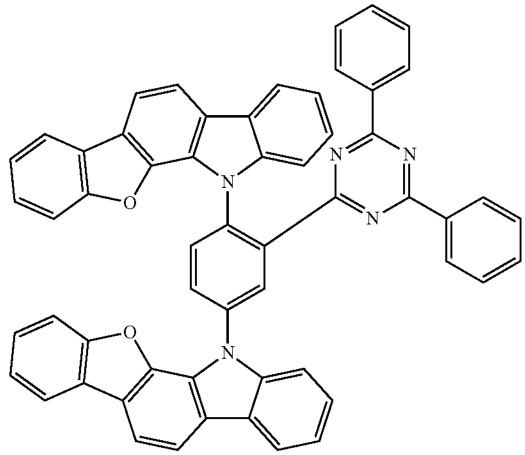
22
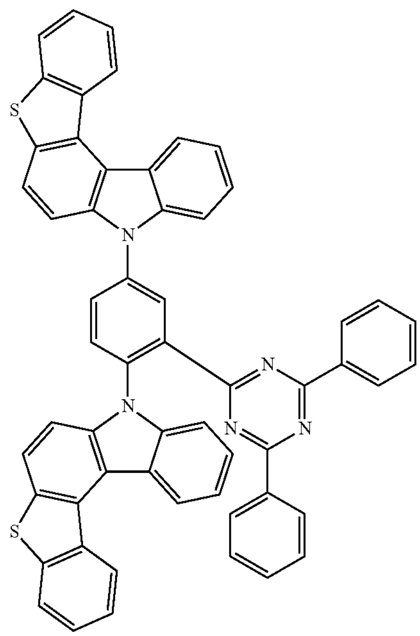
23
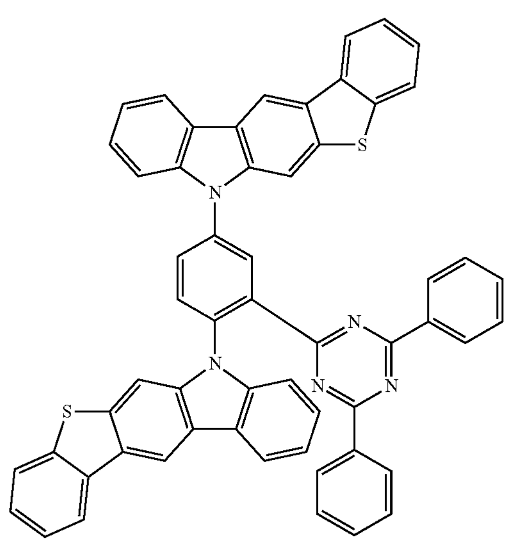

24
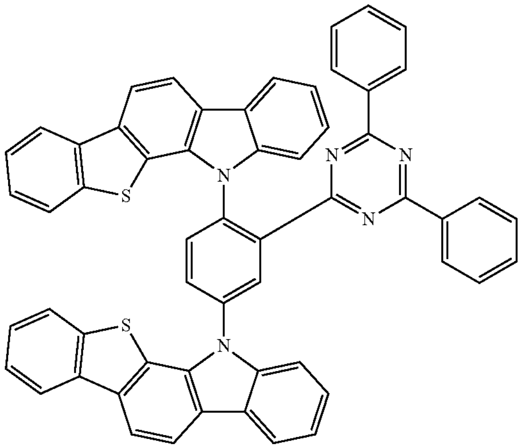
25
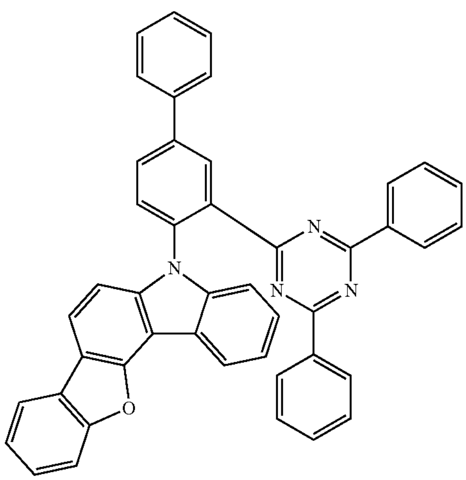
26
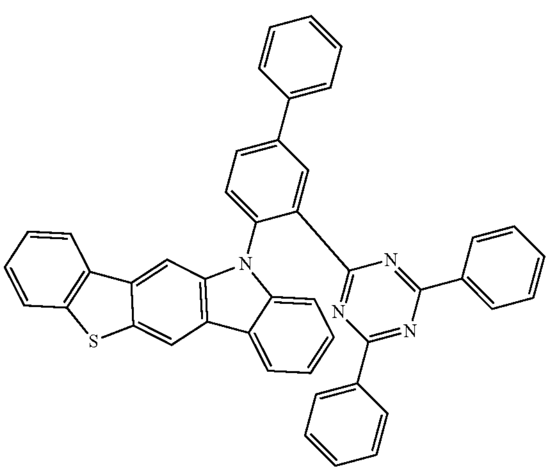
27
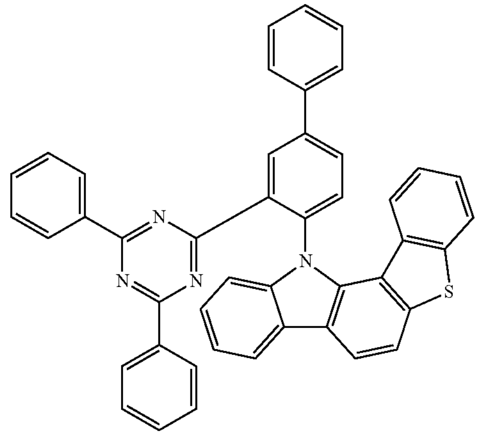
28
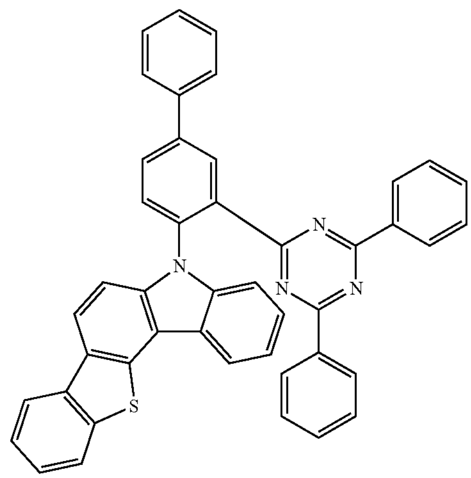
29
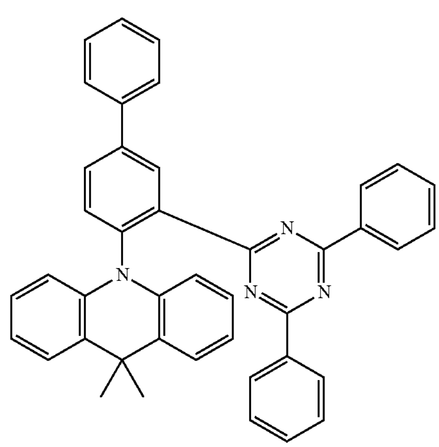

-continued
30
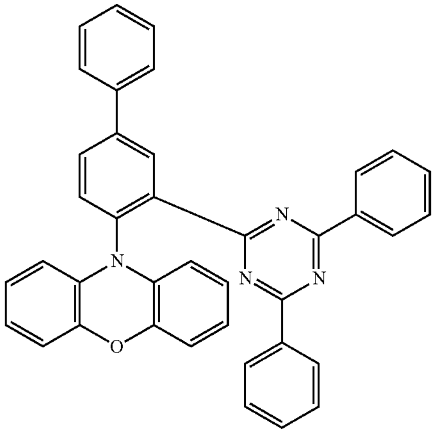
31
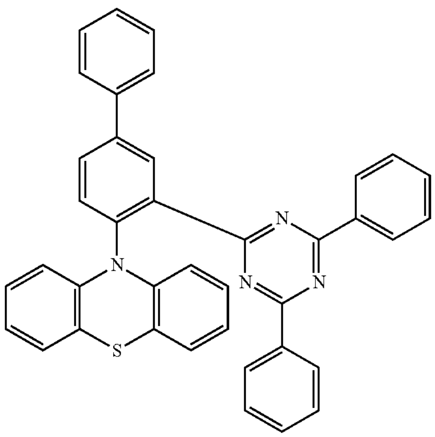
32
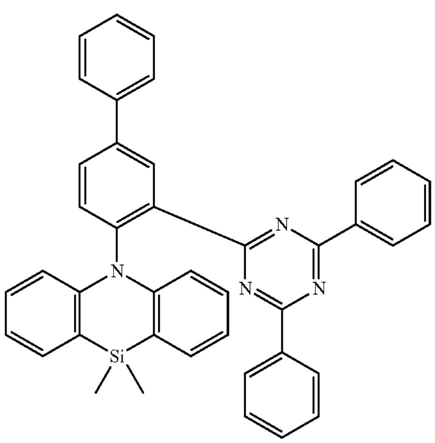
-continued
33
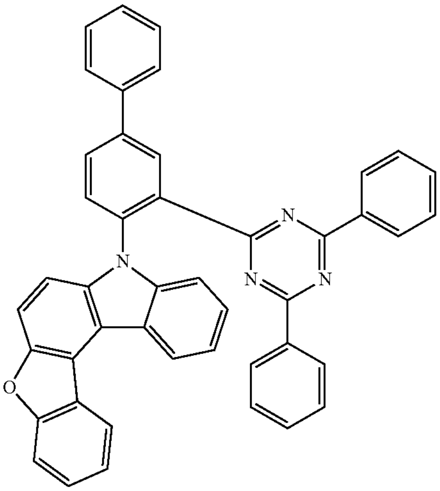
34
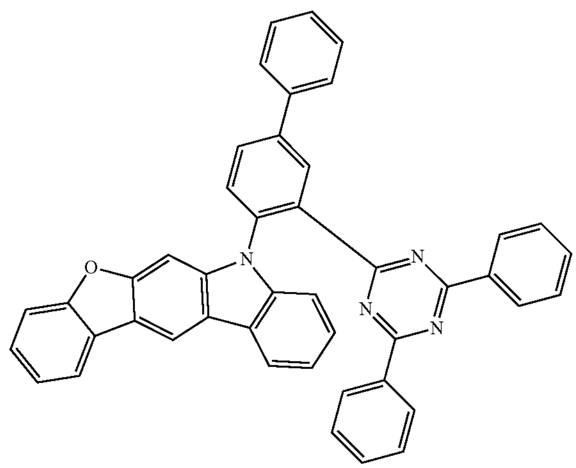
35
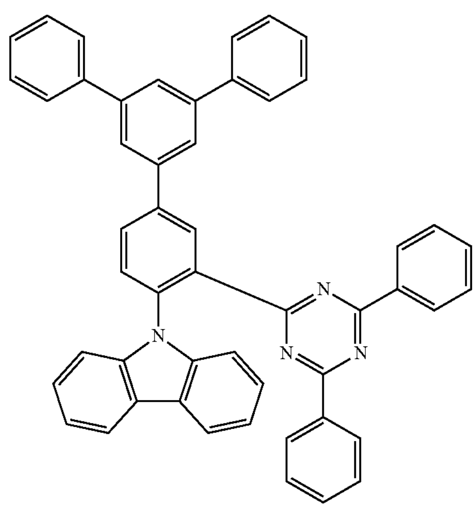

36
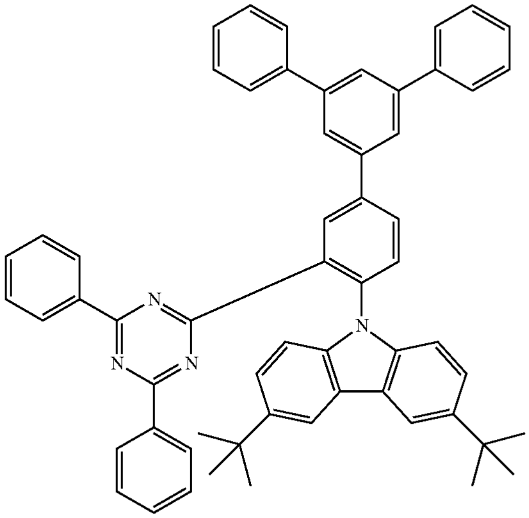
37
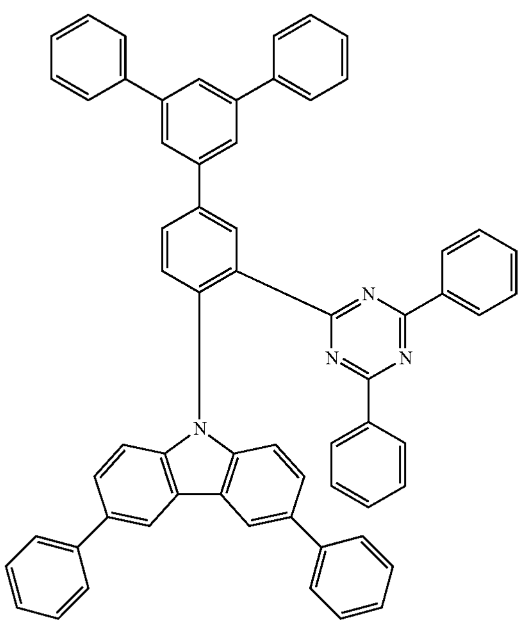
38
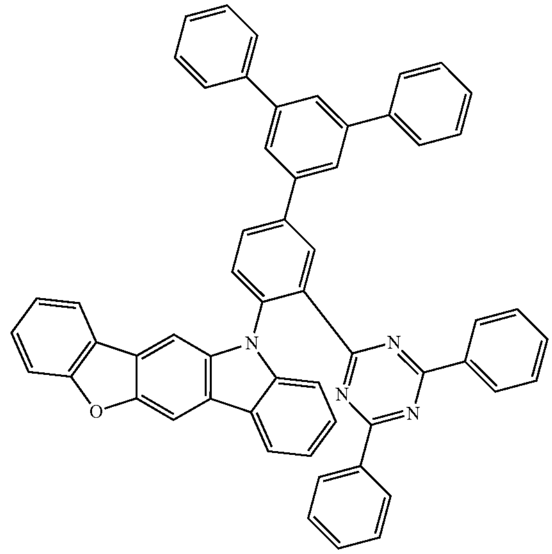
39
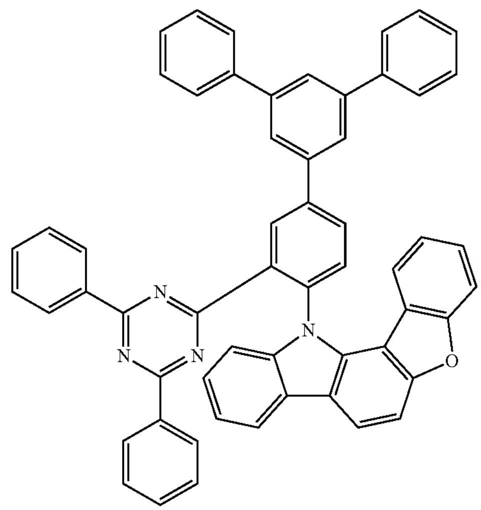
40
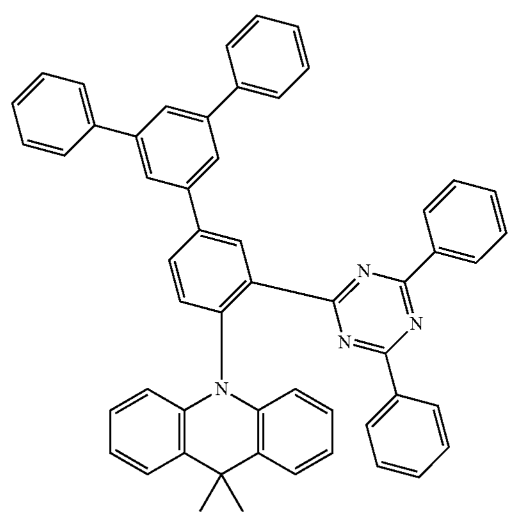

-continued
41
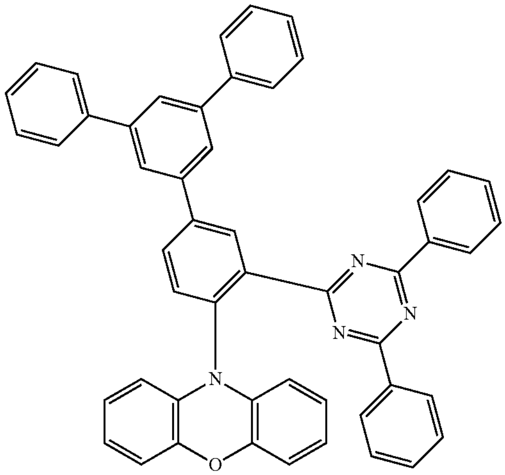
42
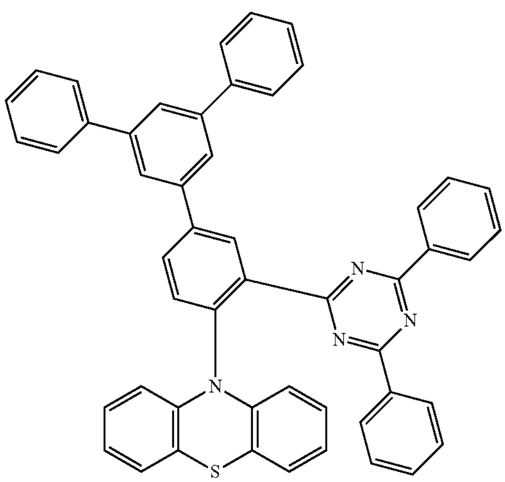
43
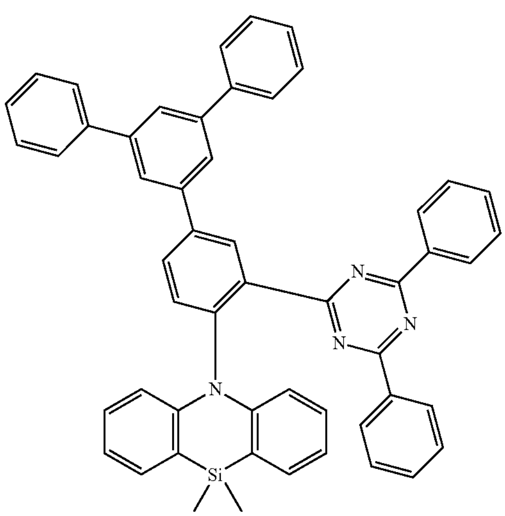
-continued
44
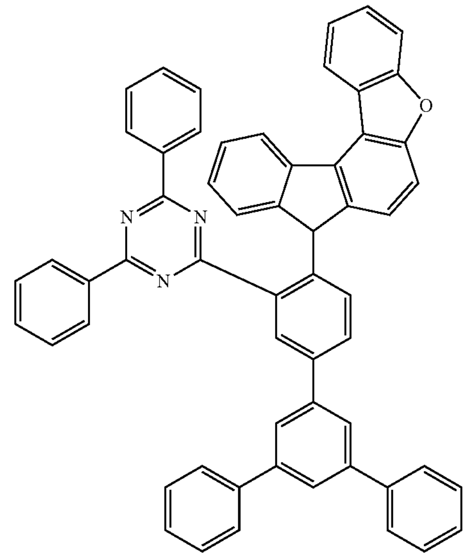
45
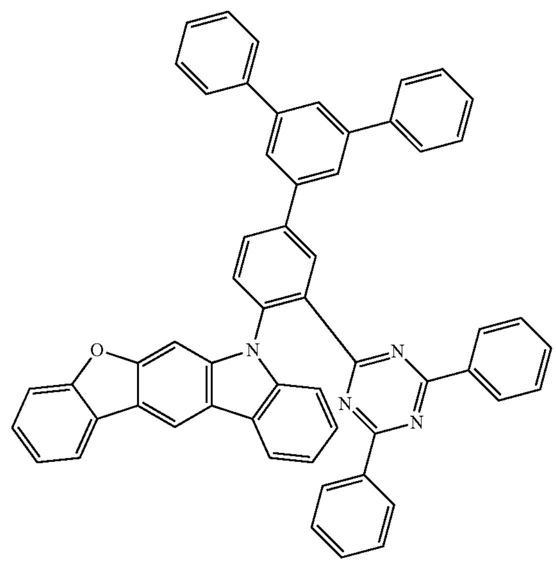
46
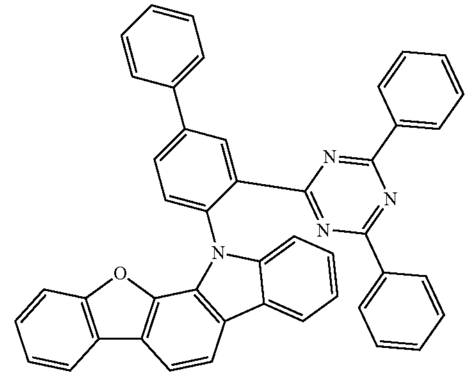

-continued
47
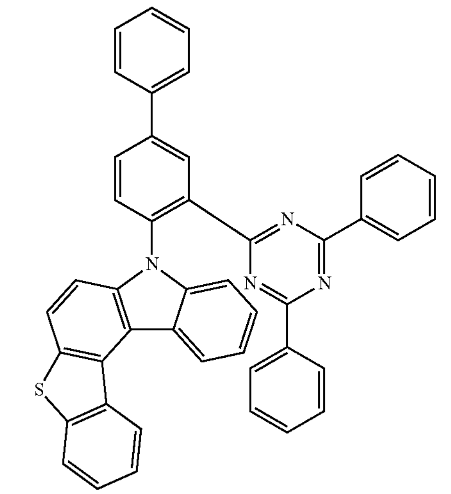
48
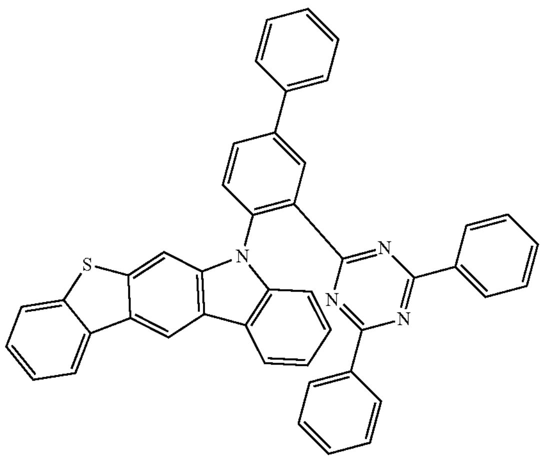
49
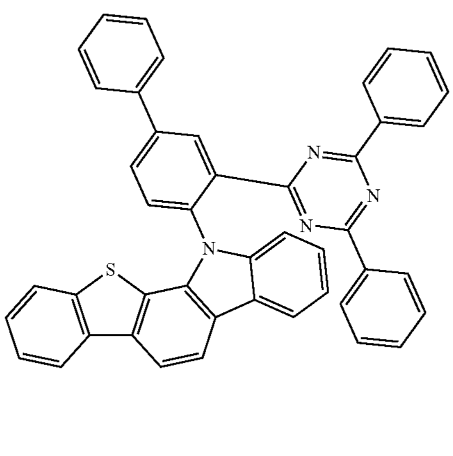
-continued
50
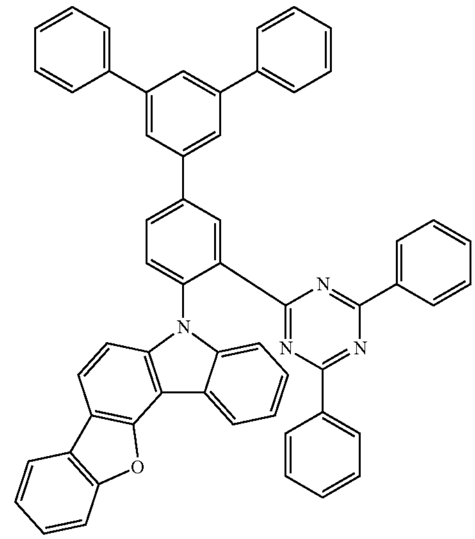
51
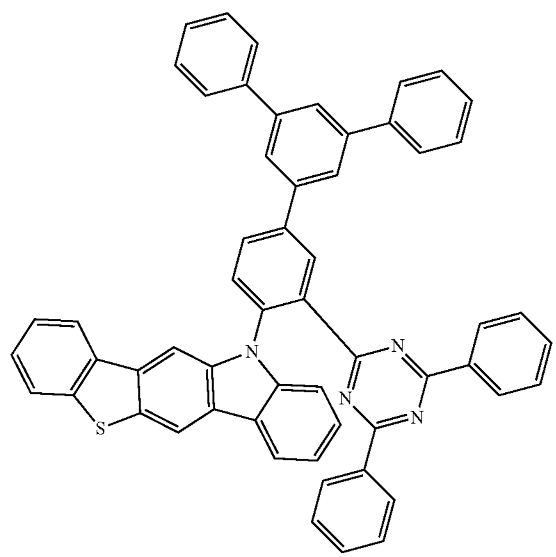
52
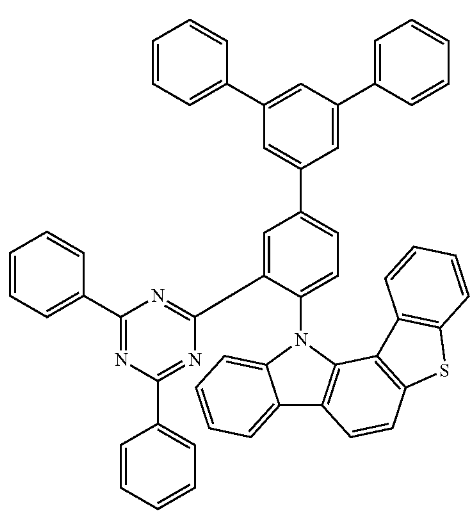

-continued
53
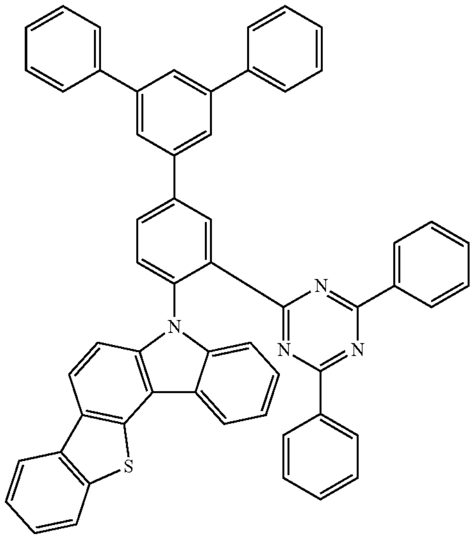
54
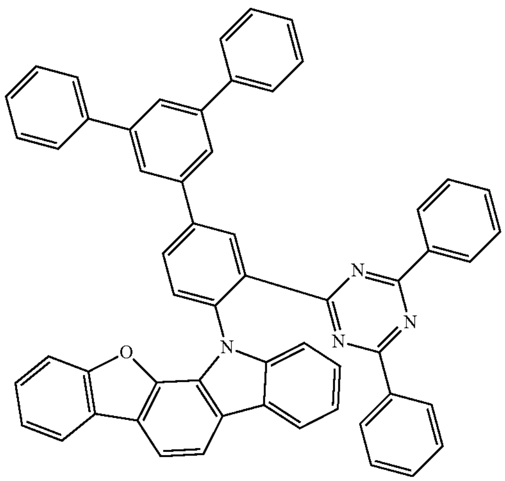
55
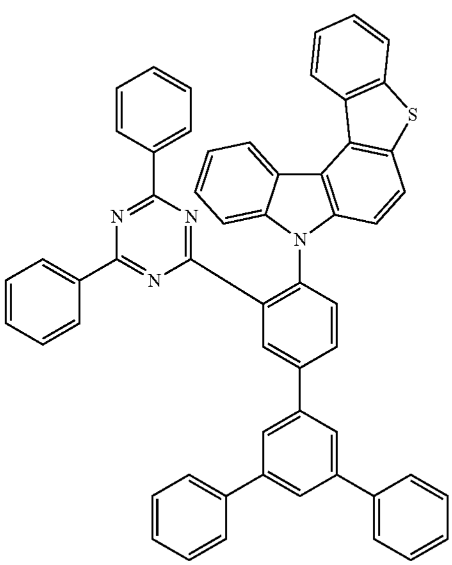
-continued
56
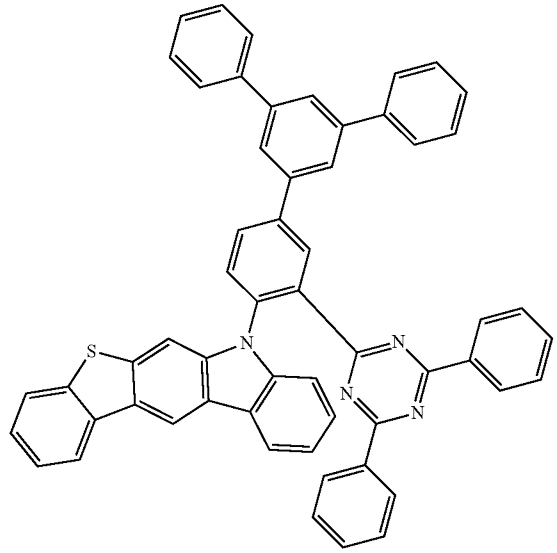
57
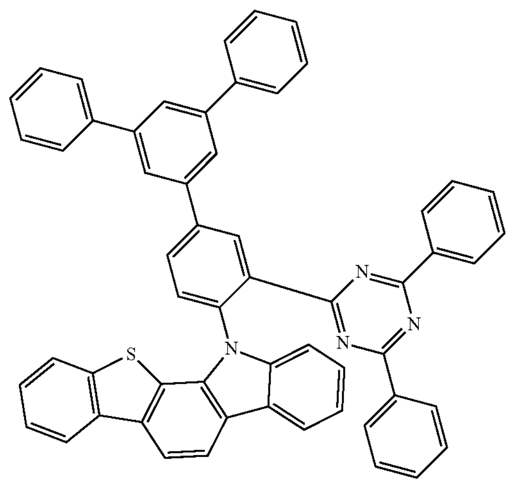
58
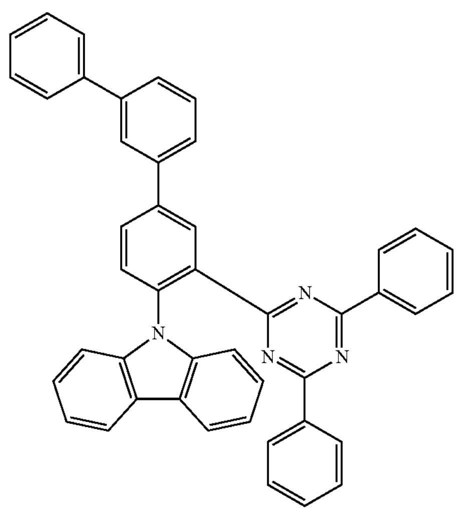

-continued
59
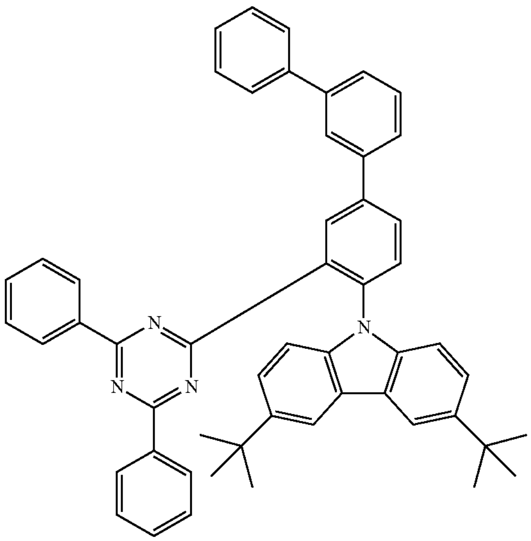
60
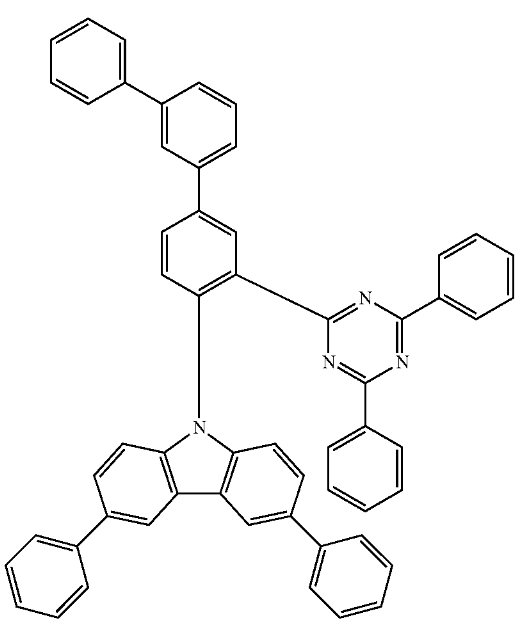
-continued
61
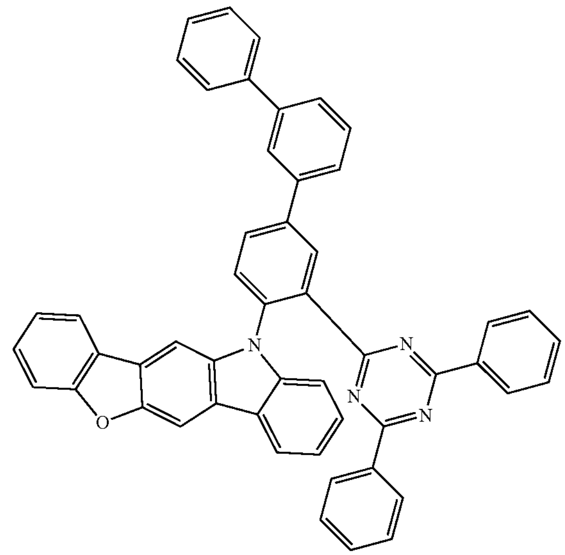
62
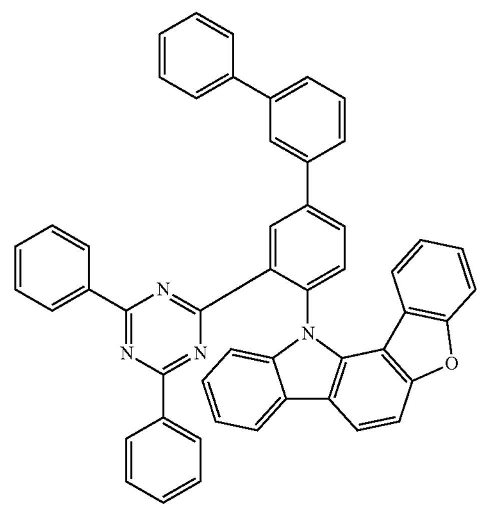
63
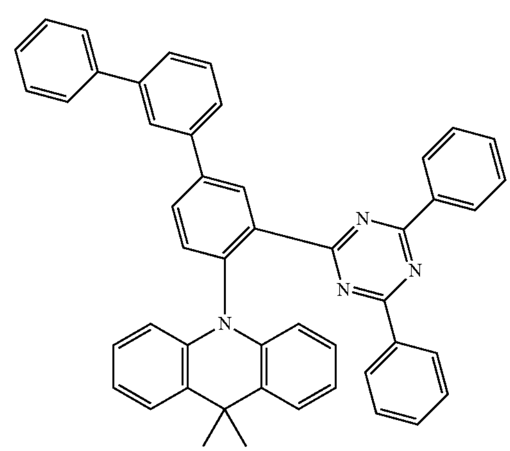

-continued
64
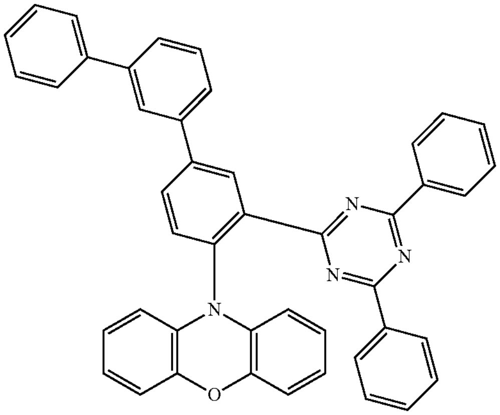
65
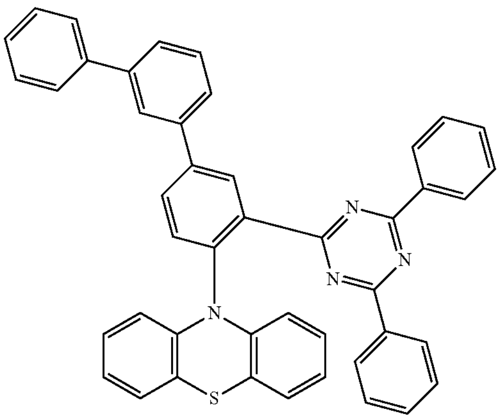
66
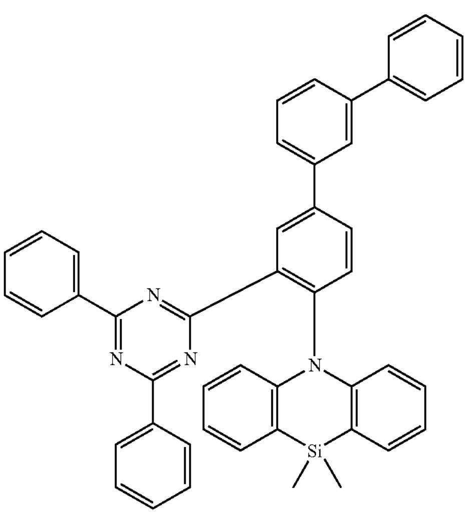
-continued
67
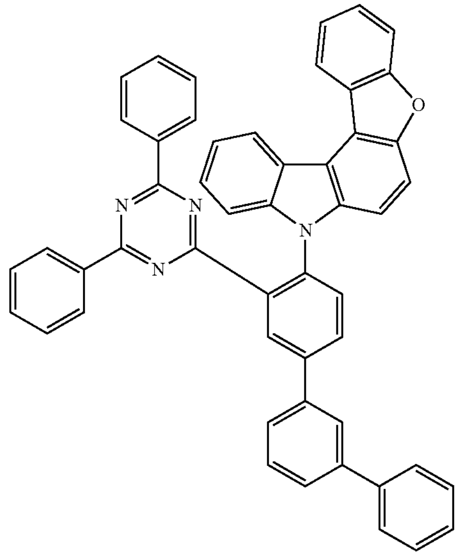
68
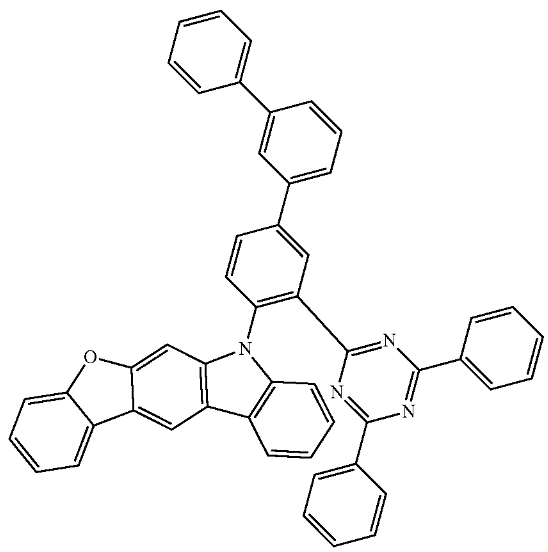
69
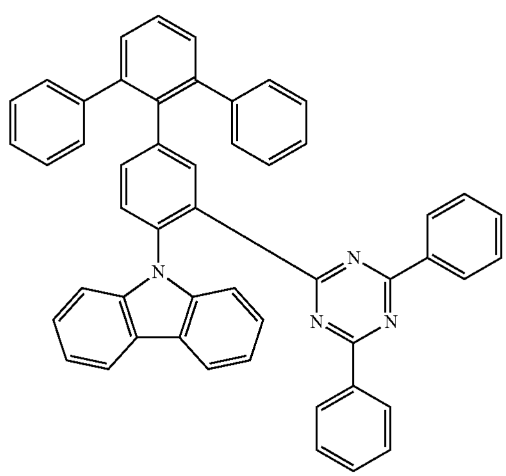

70
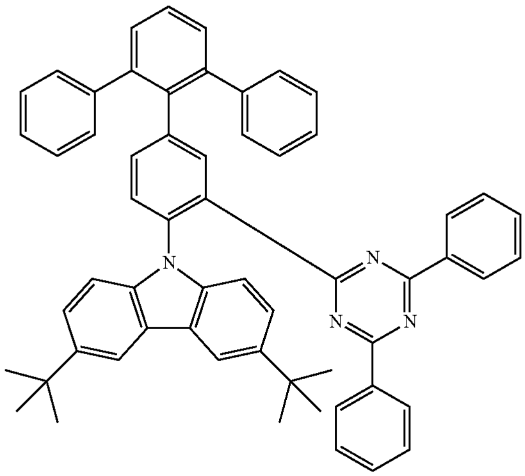
71
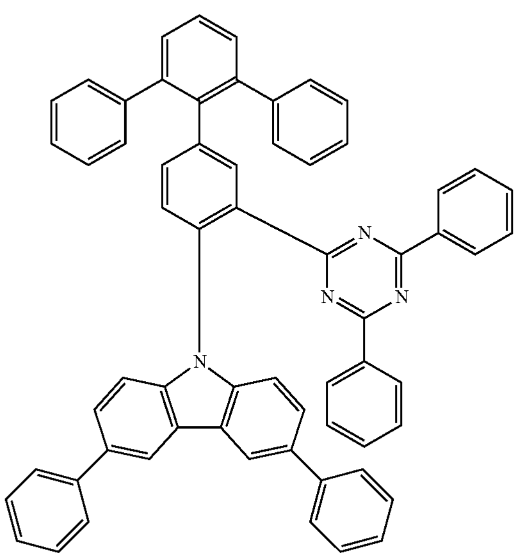
72
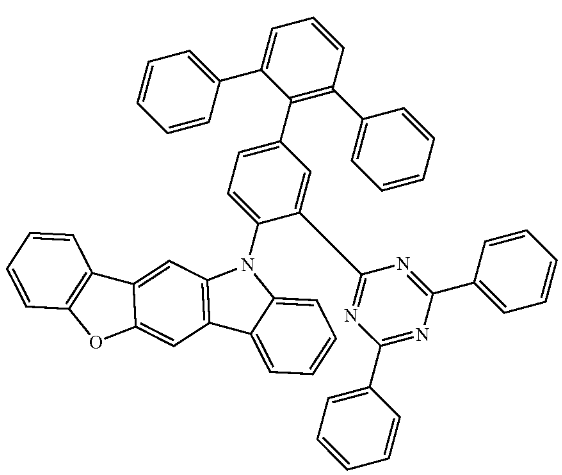
73
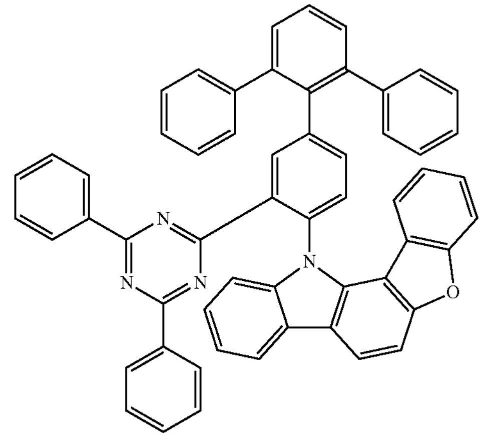
74
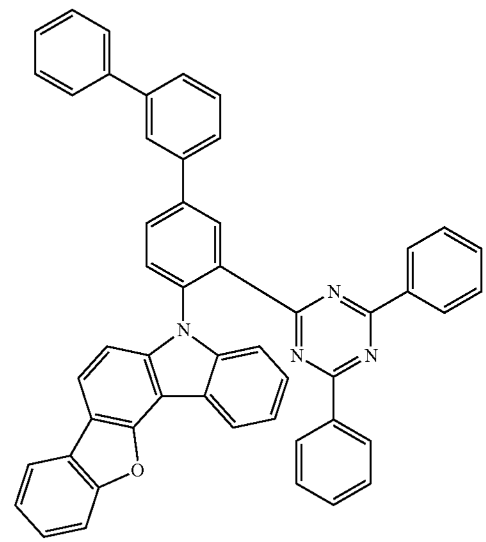
75
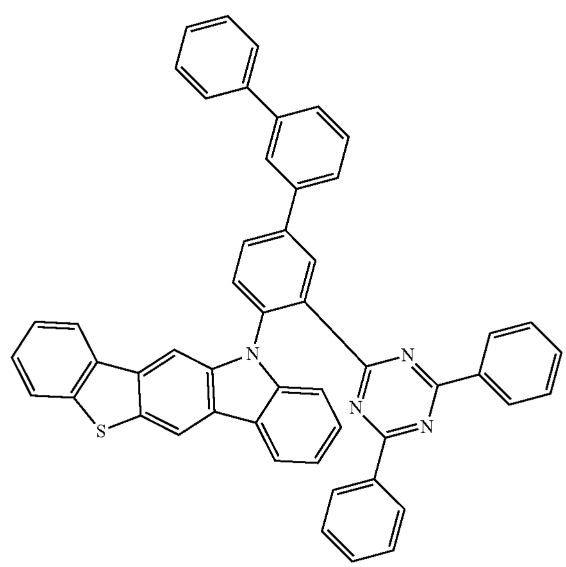

-continued
76
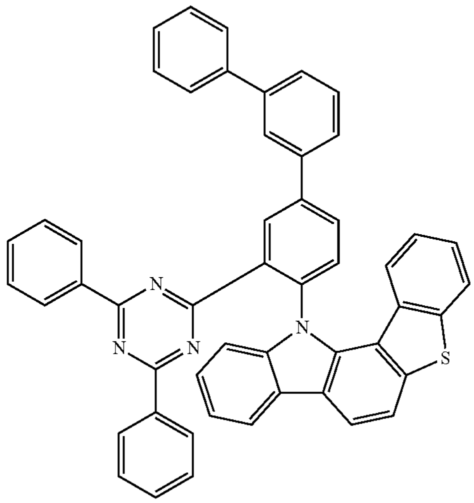
77
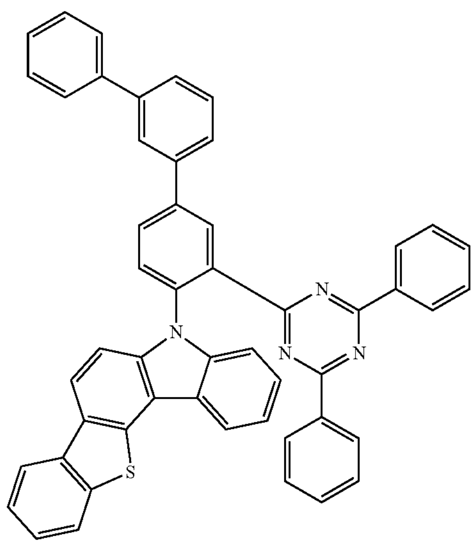
78
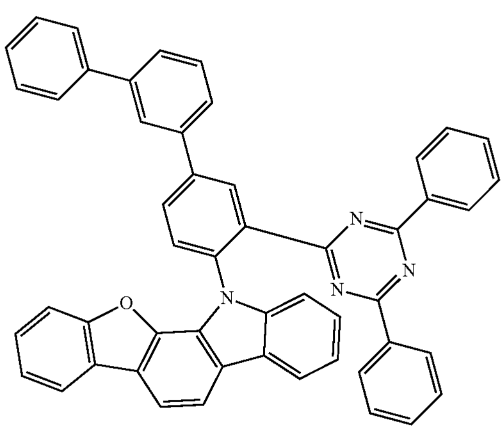
-continued
79
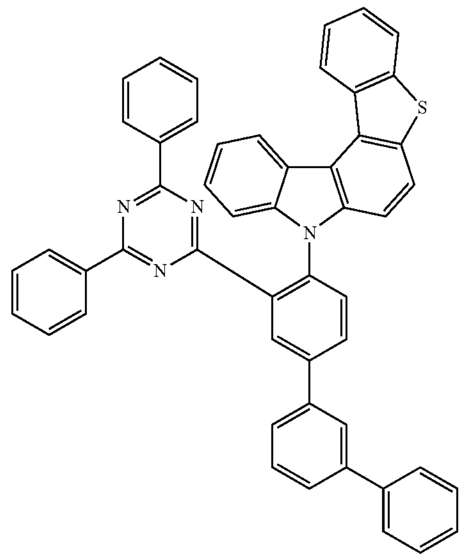
80
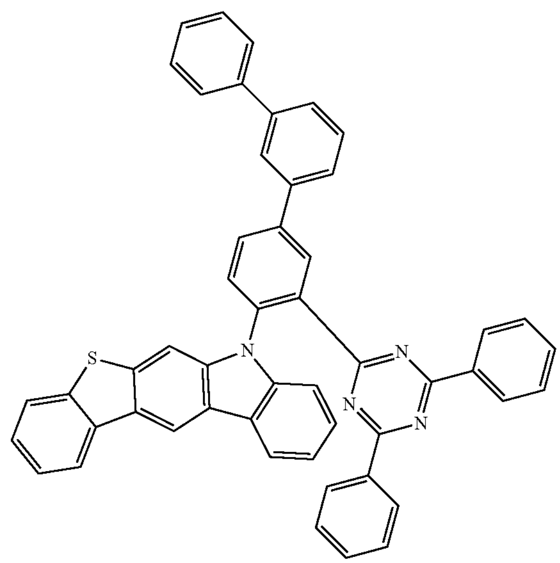
81
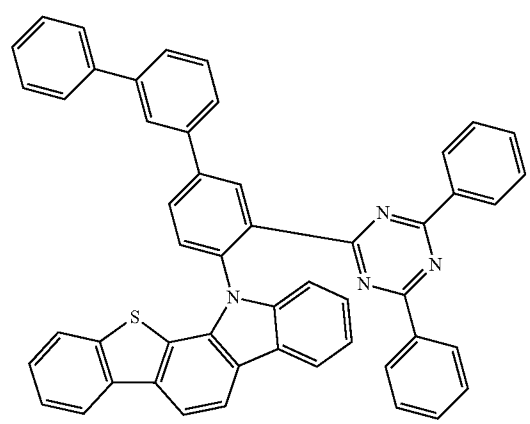

-continued
82
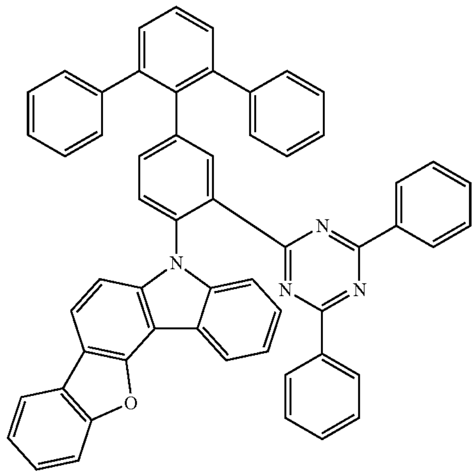
83
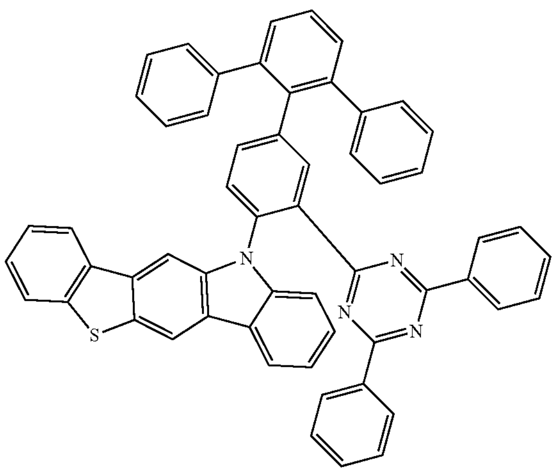
84
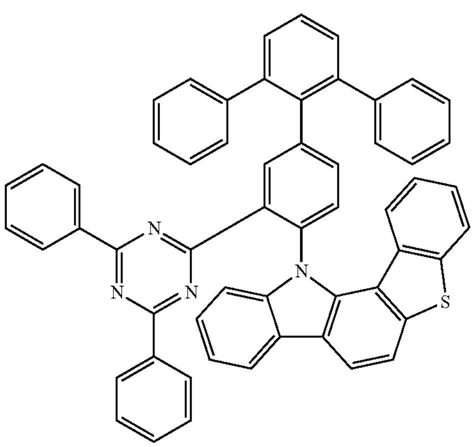
-continued
85
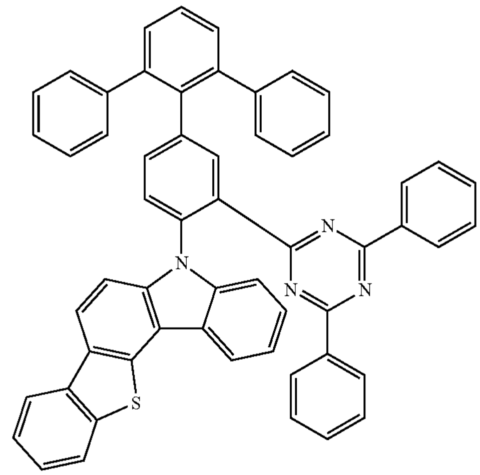
86
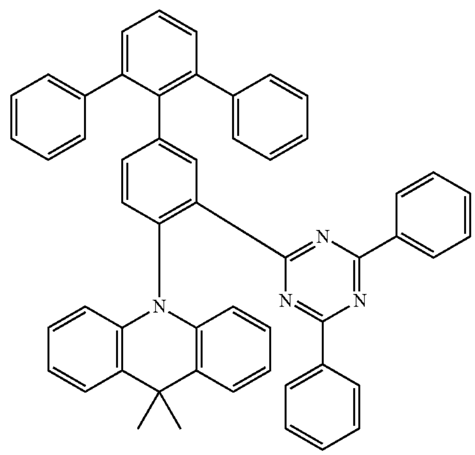
87
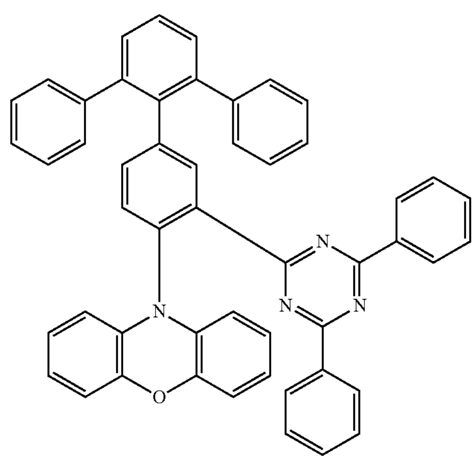

-continued
88
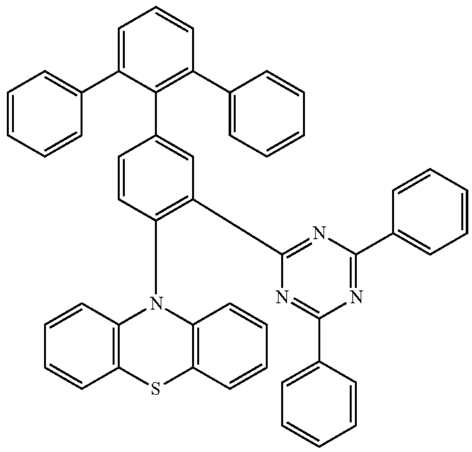
89
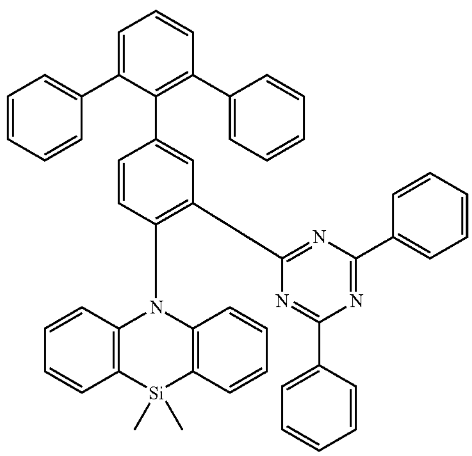
90
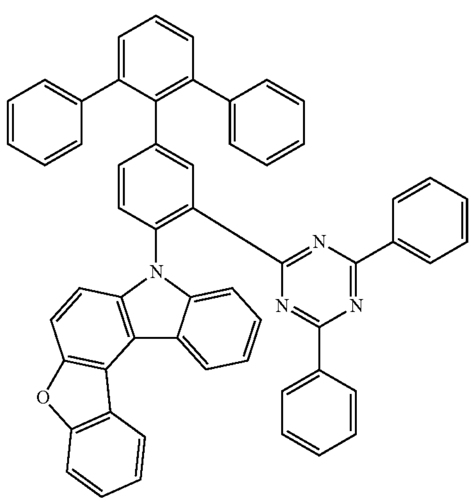
-continued
91
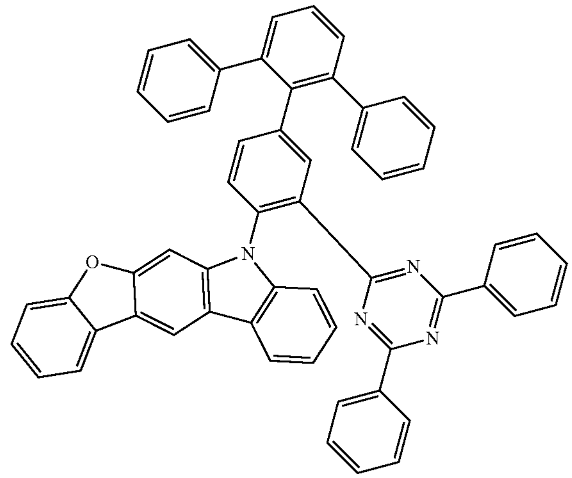
92
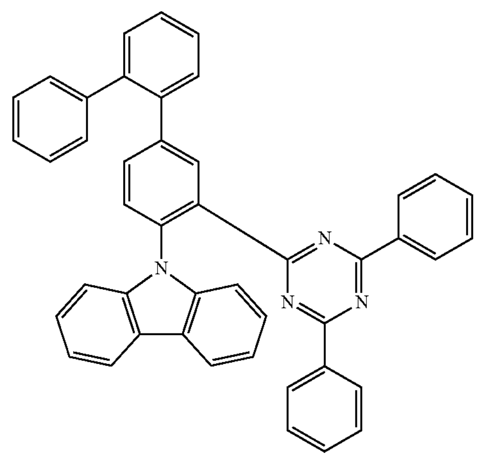
93
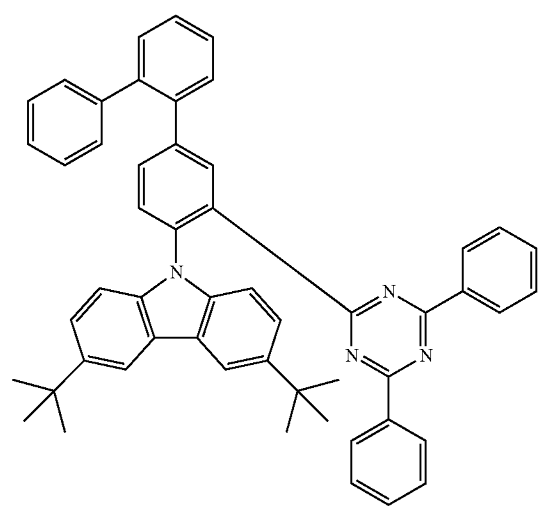

-continued
94
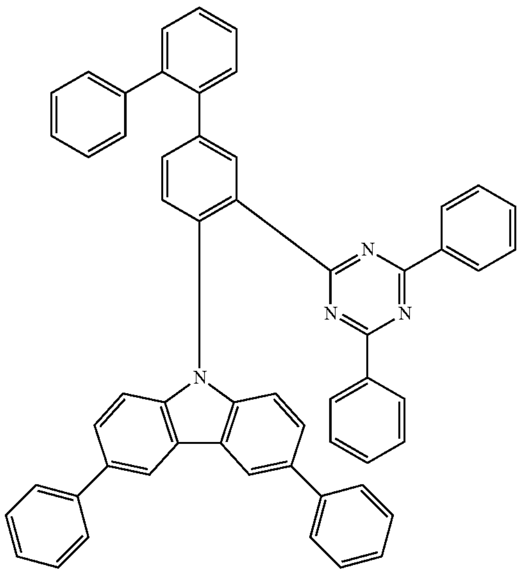
95
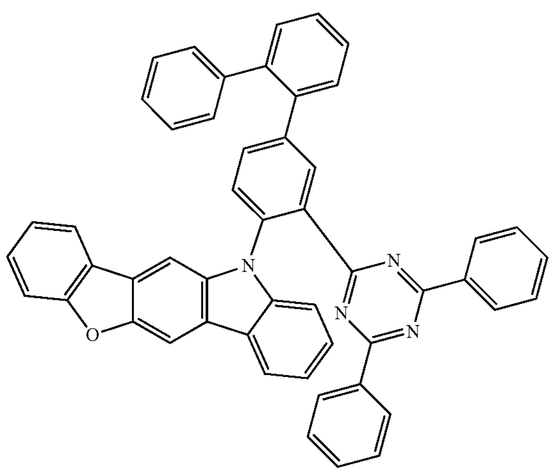
96
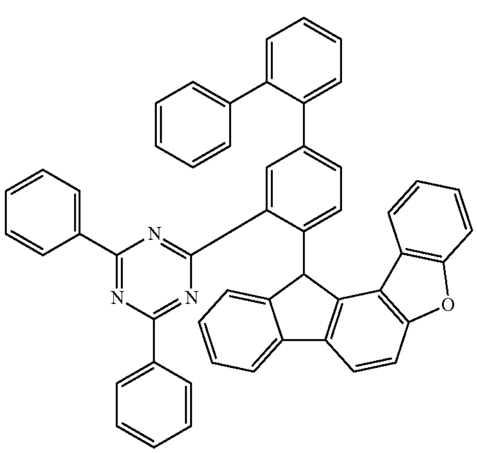
-continued
97
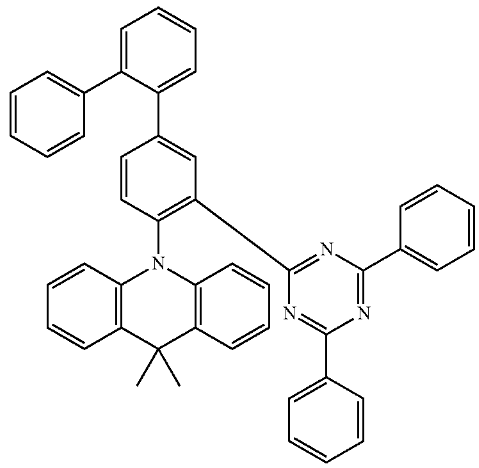
98
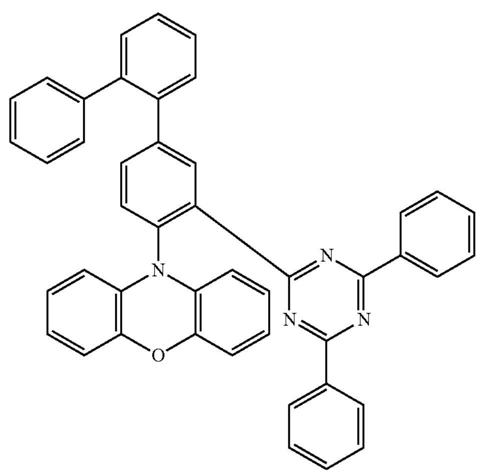
99
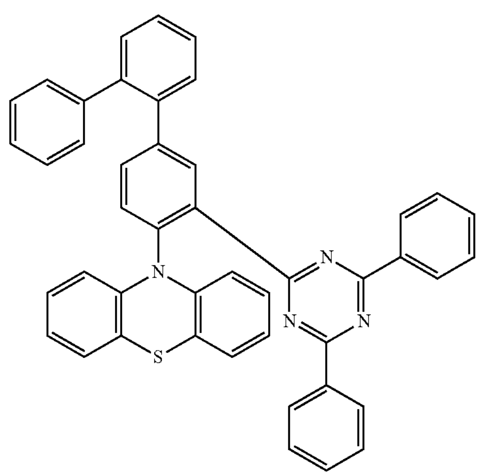

100
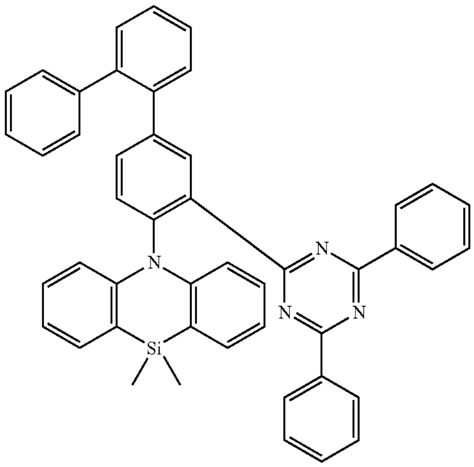
101
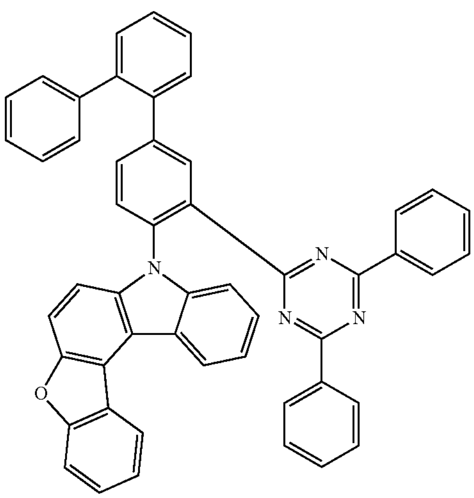
102
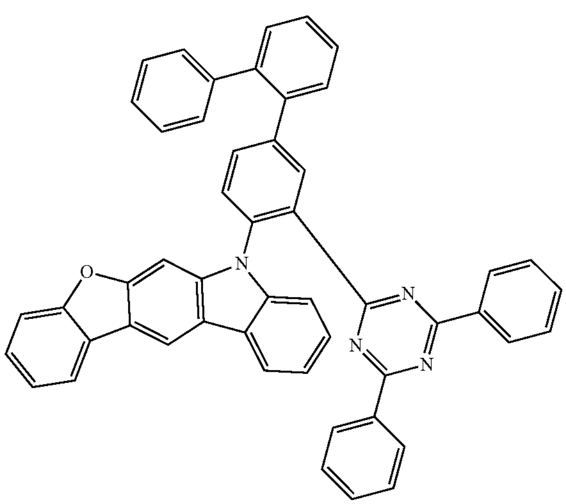
103
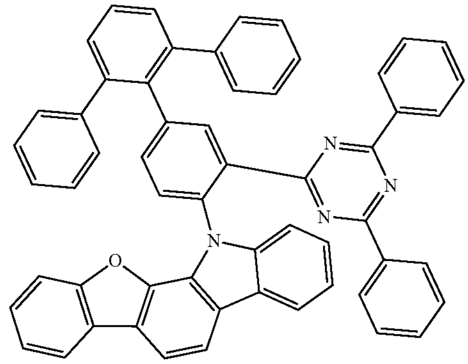
104
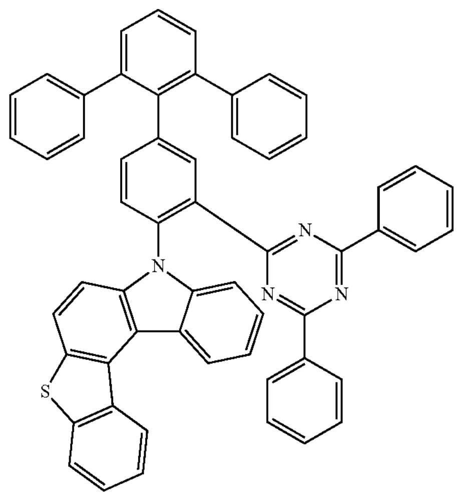
105
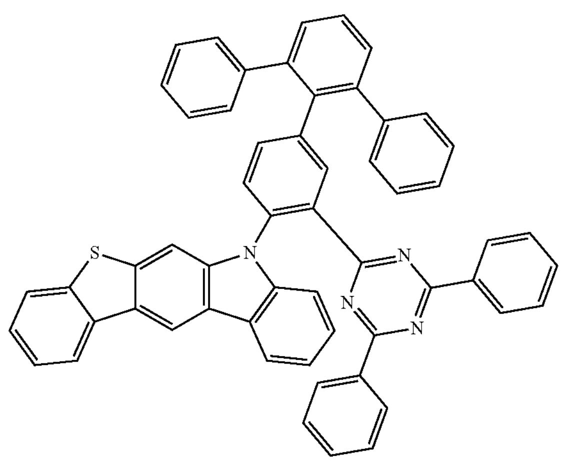

-continued
106
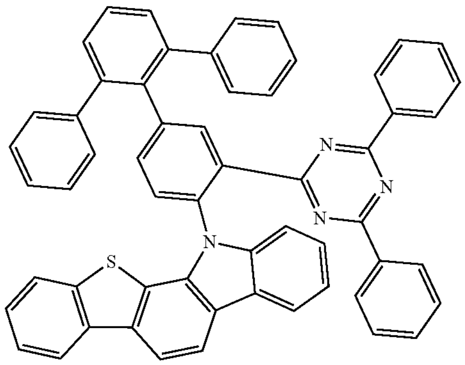
107
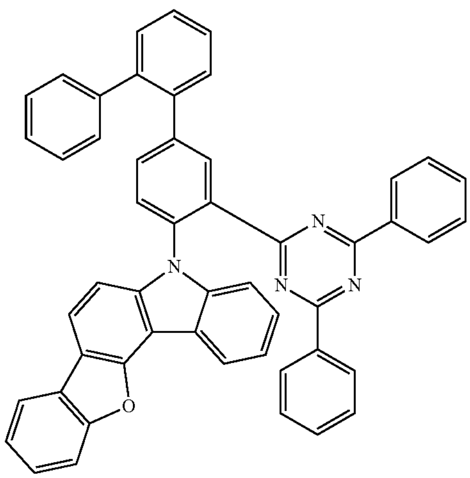
108
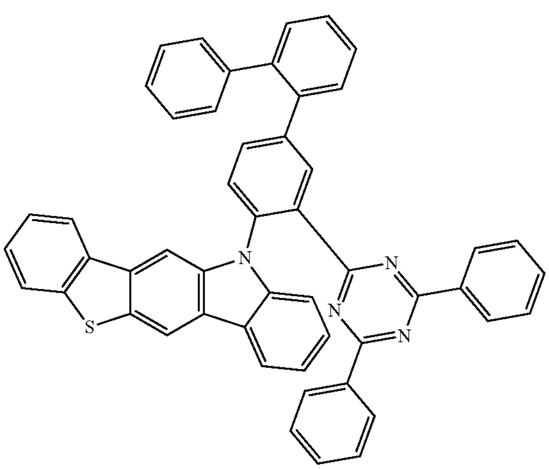
-continued
109
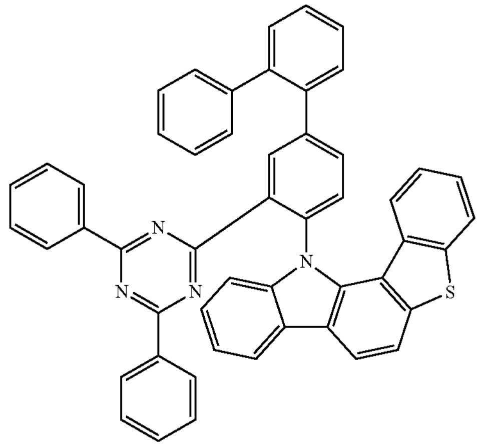
110
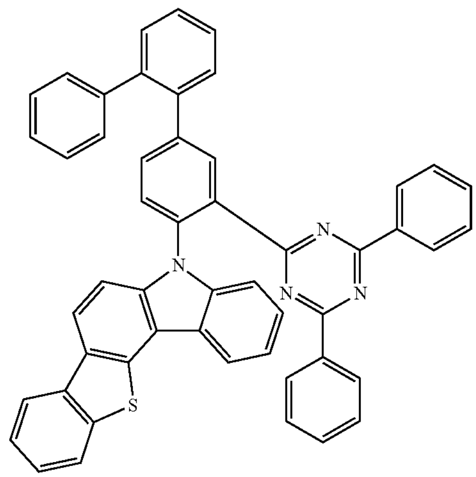
111
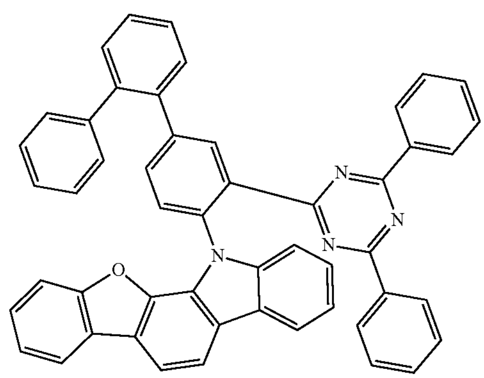

112
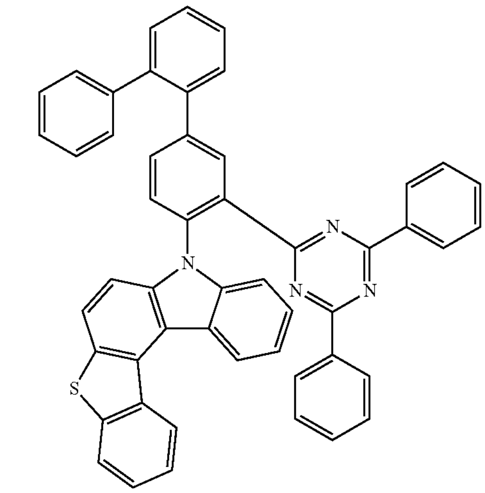
113
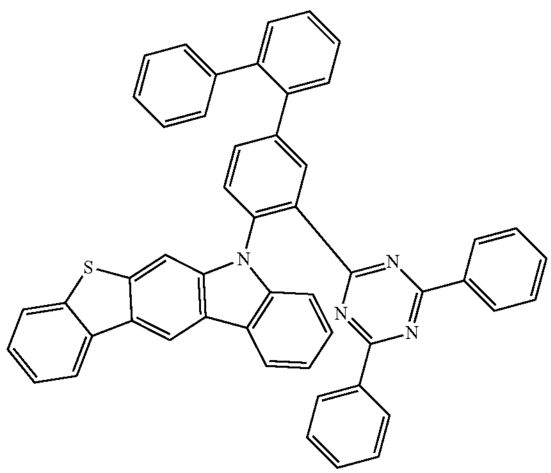
114
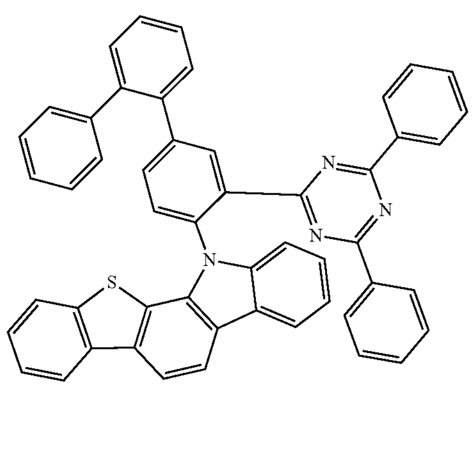
115
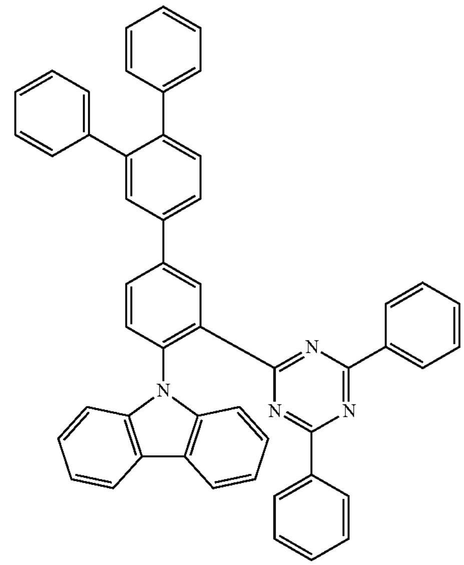
116
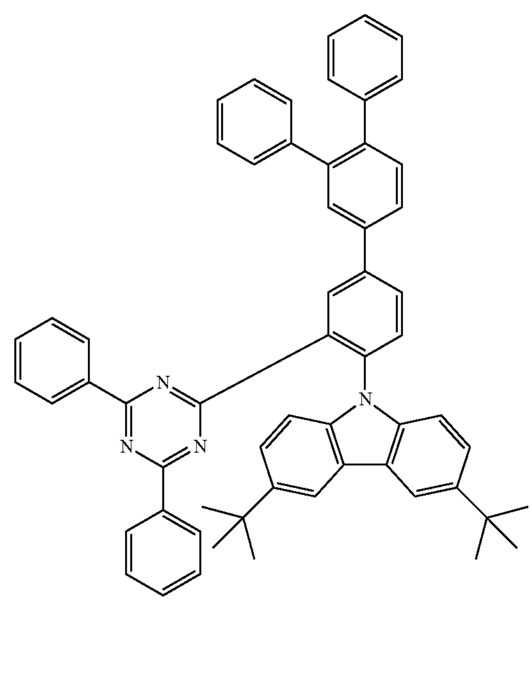

-continued
117
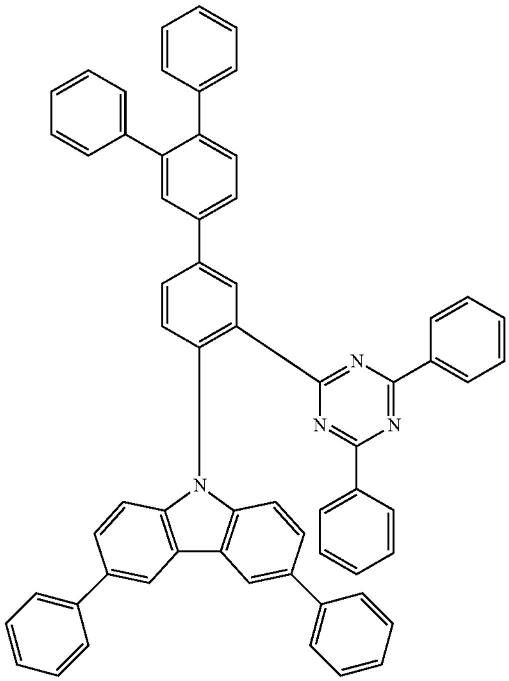
118
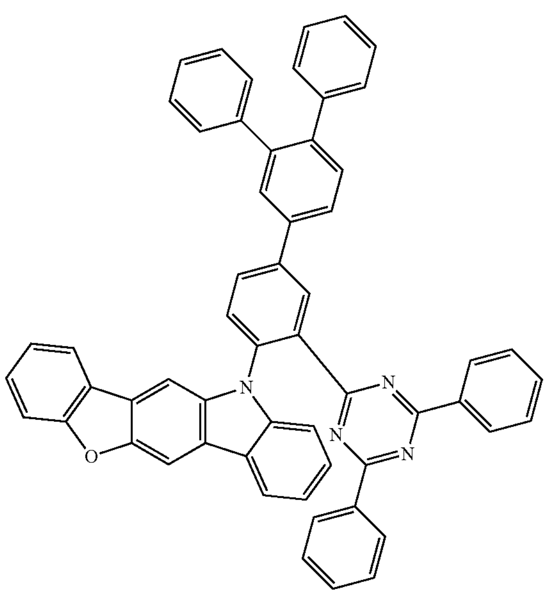
-continued
119
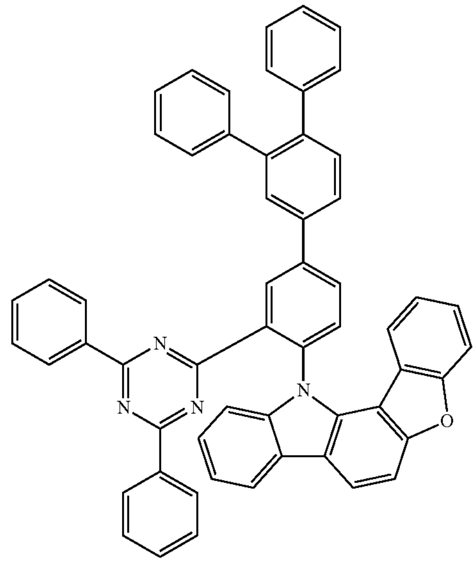
120
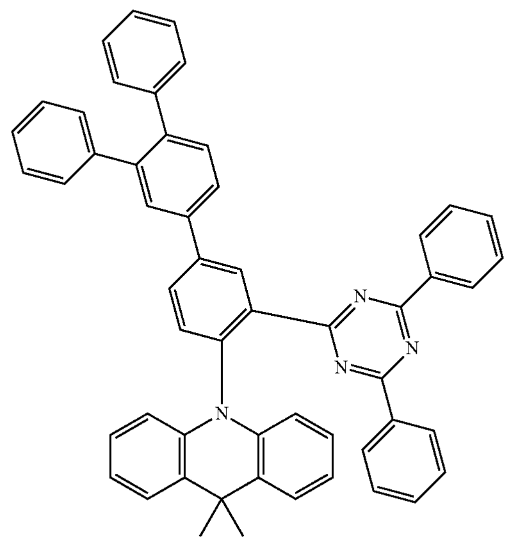
121
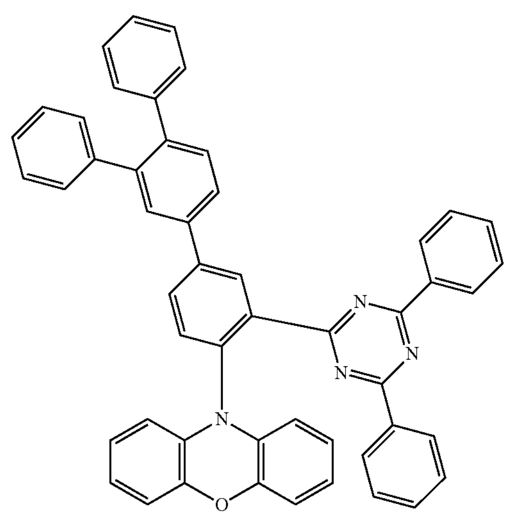

-continued
122
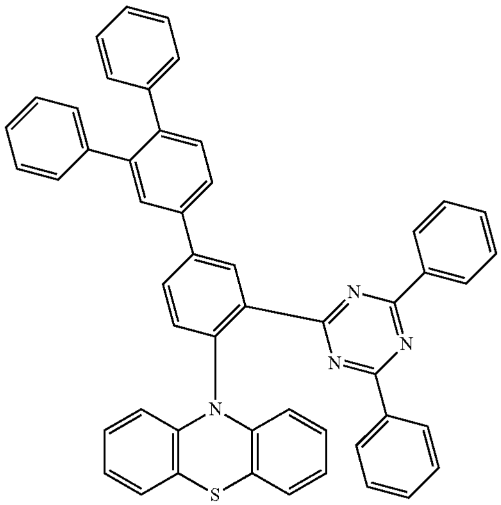
123
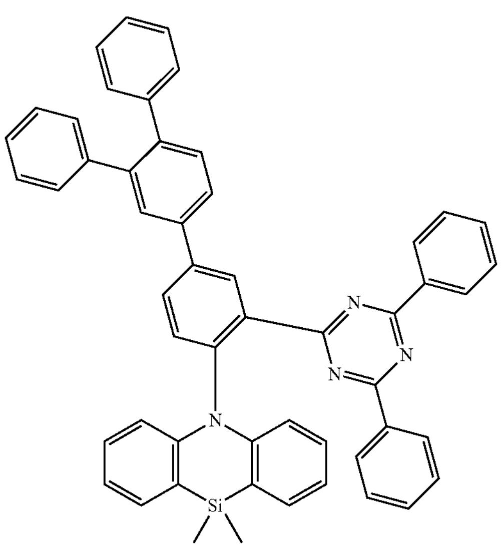
-continued
124
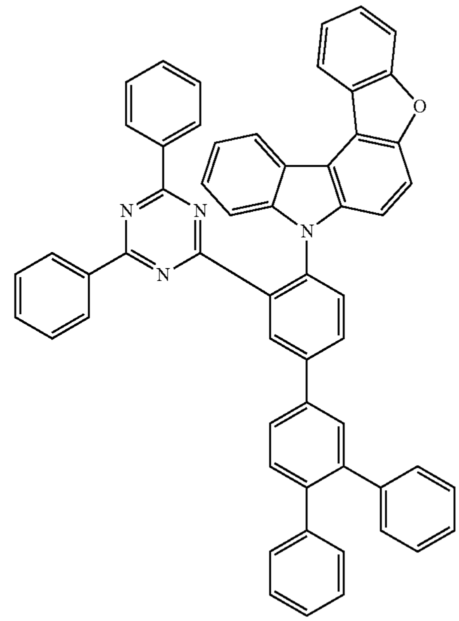
125
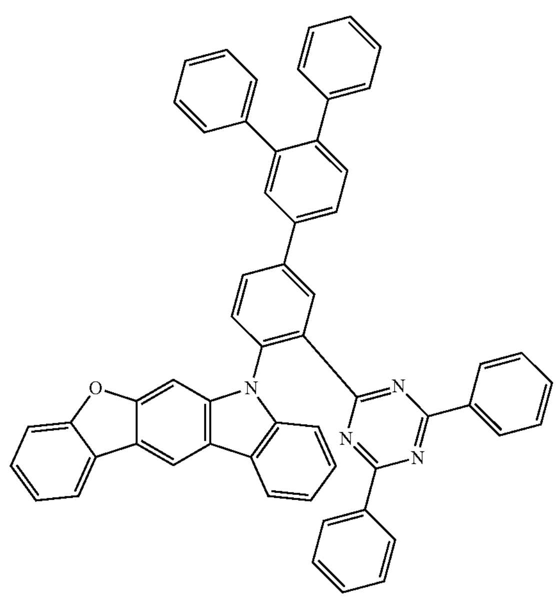

-continued
126
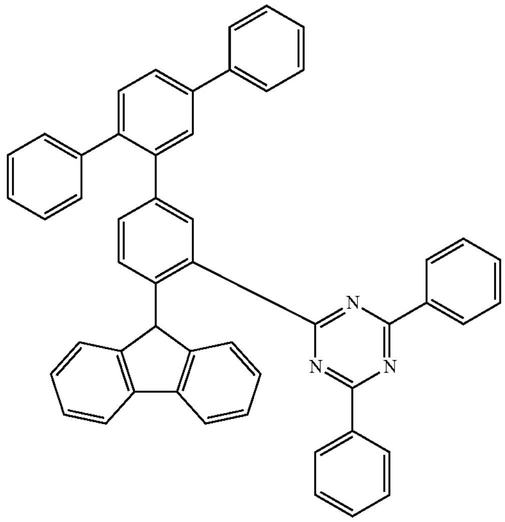
127
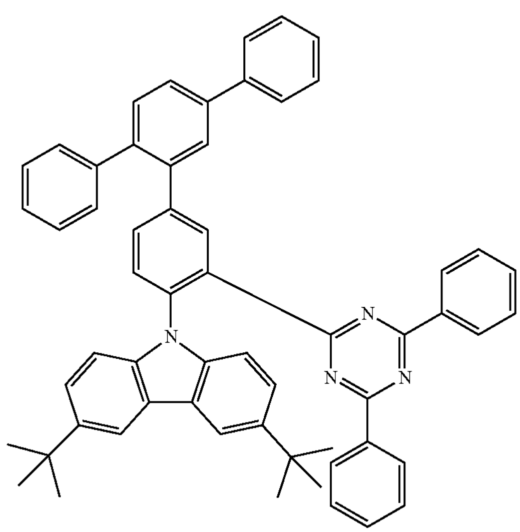
-continued
128
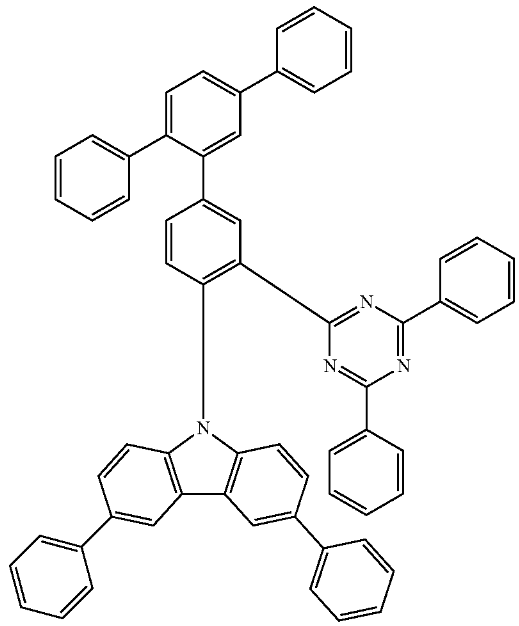
129
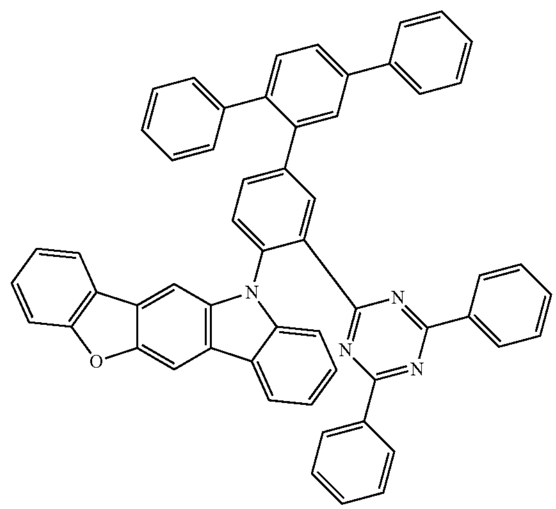
130
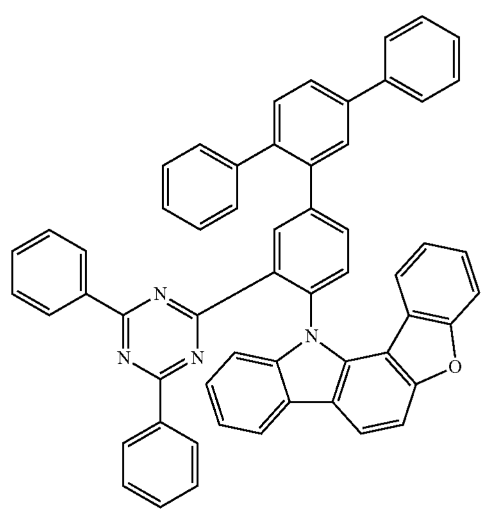

-continued
131
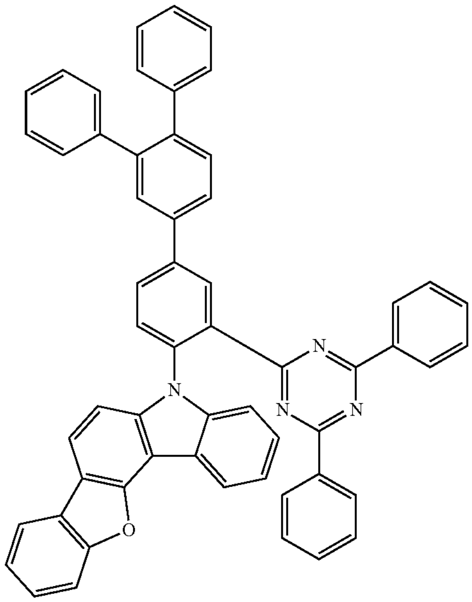
132
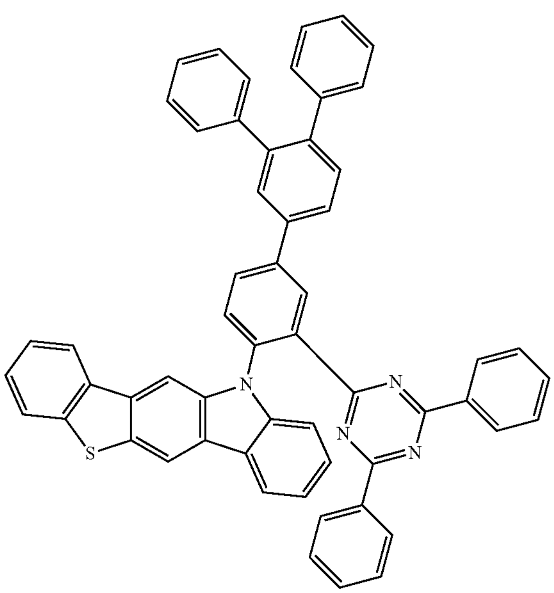
-continued
133
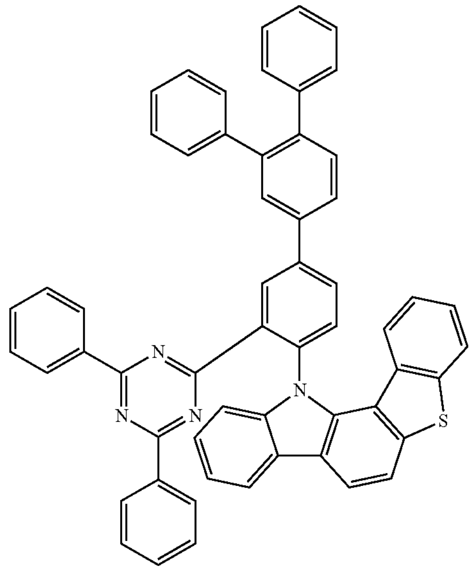
134
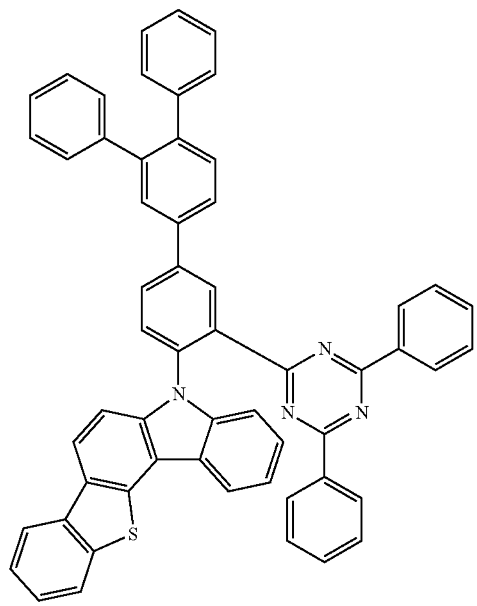
135
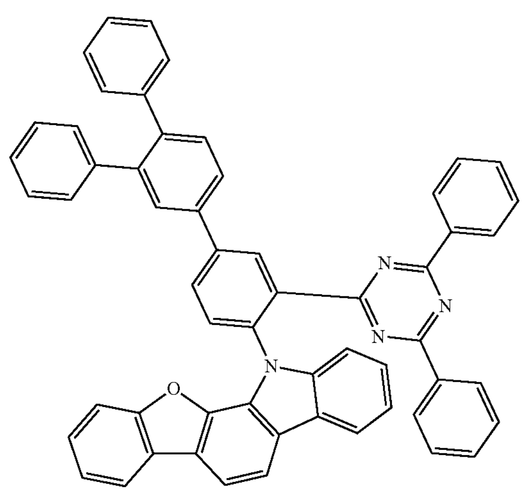

-continued
136
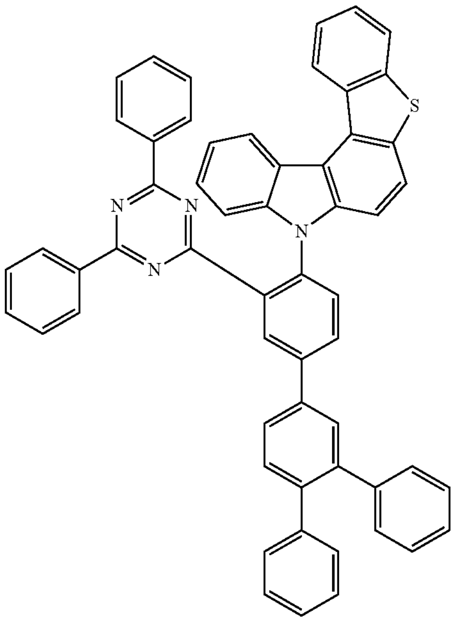
137
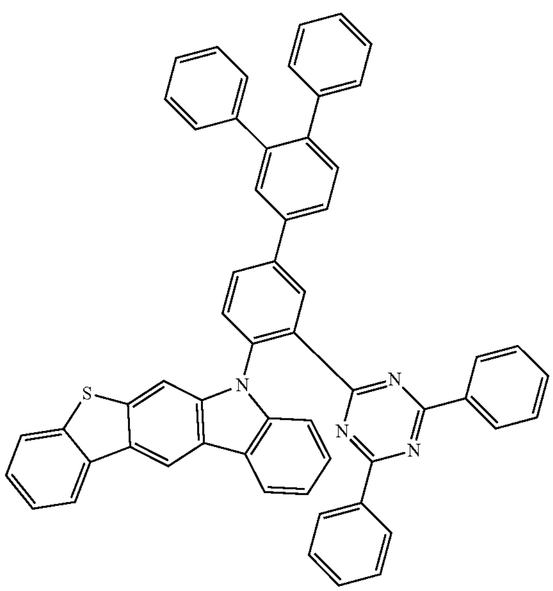
-continued
138
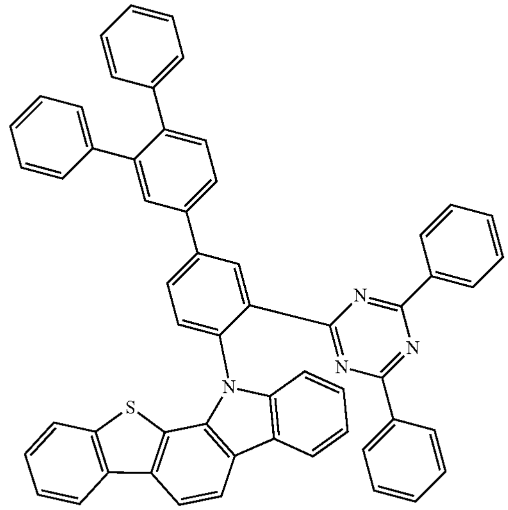
139
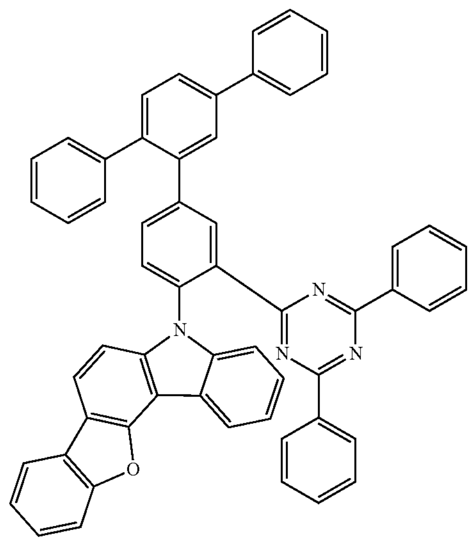
140
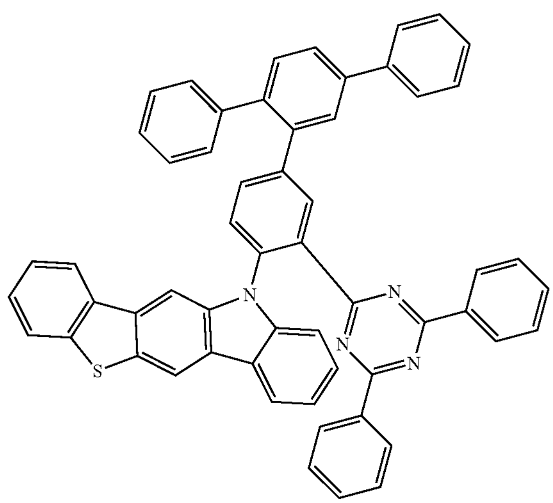

-continued
141
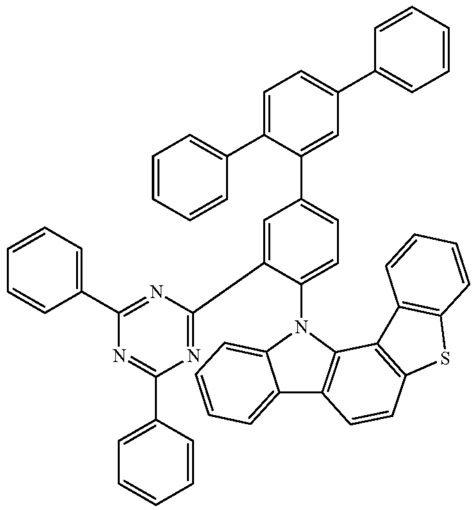
142
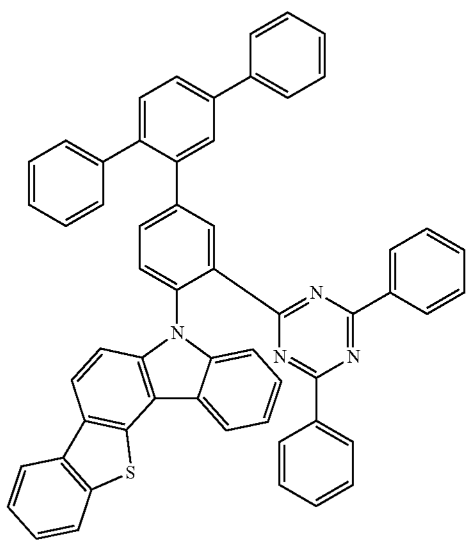
143
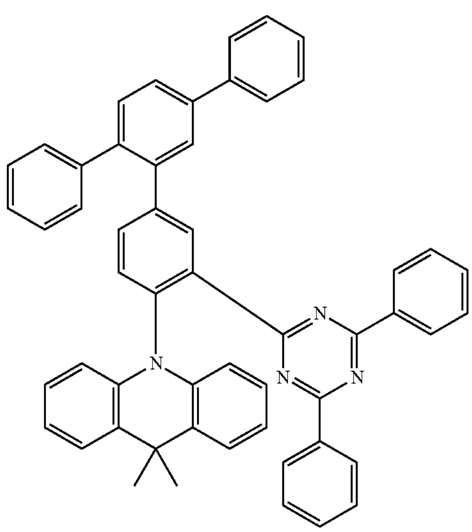
-continued
144
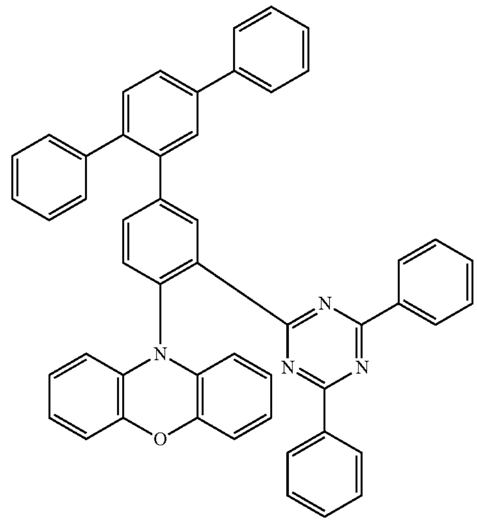
145
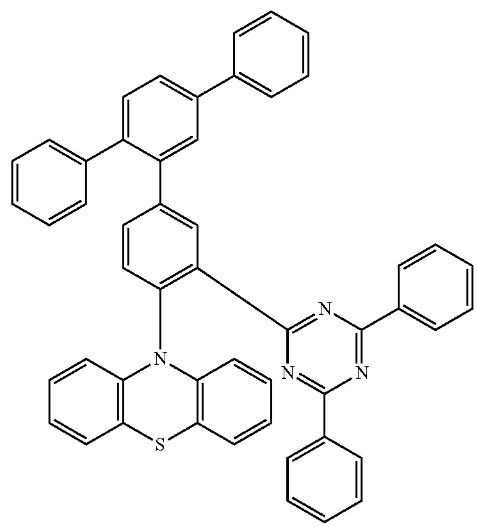
146
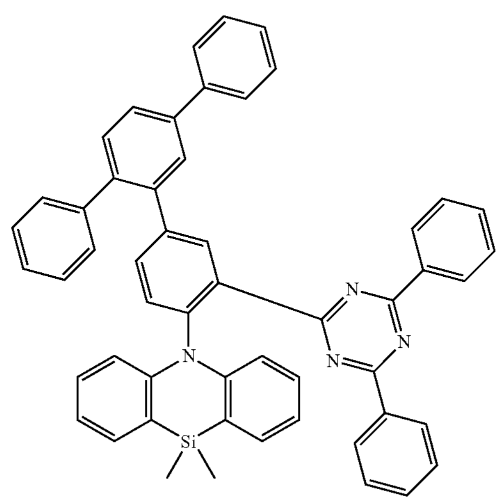

147
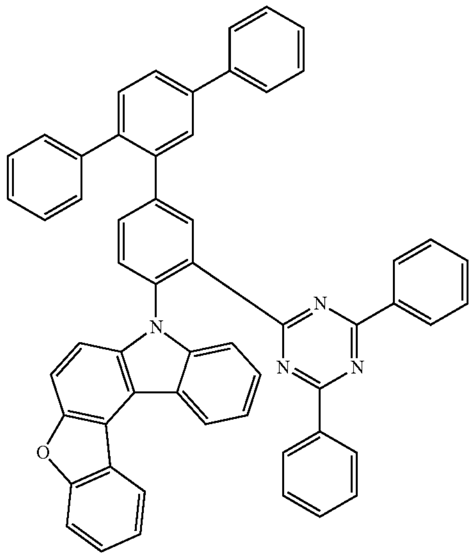
148
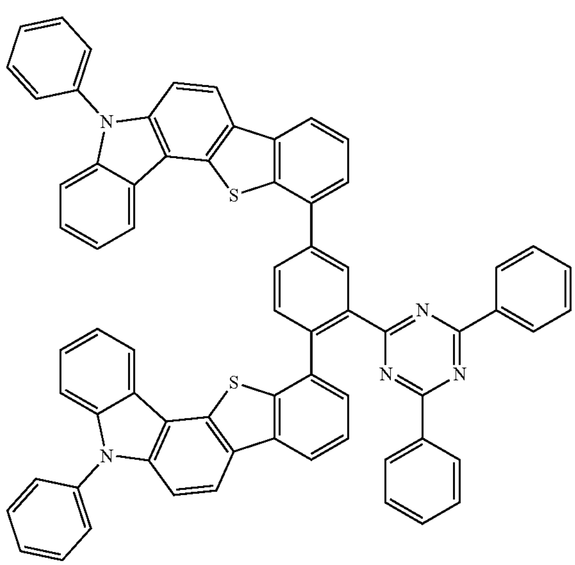
149
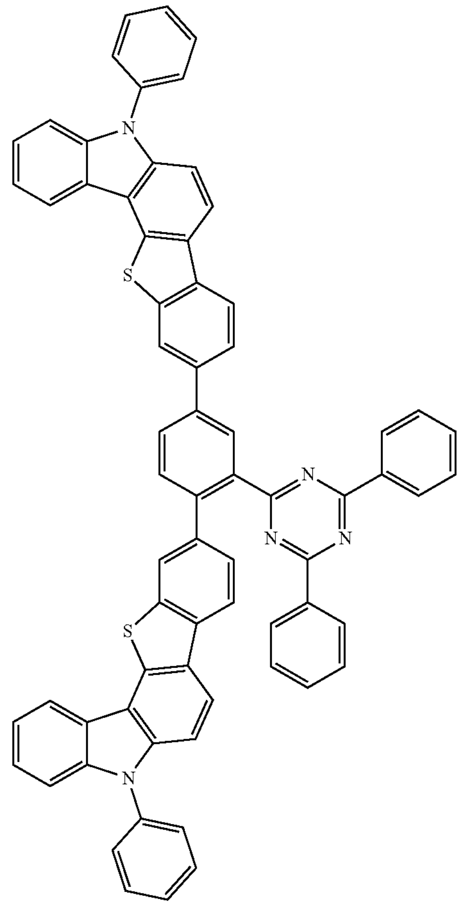

150
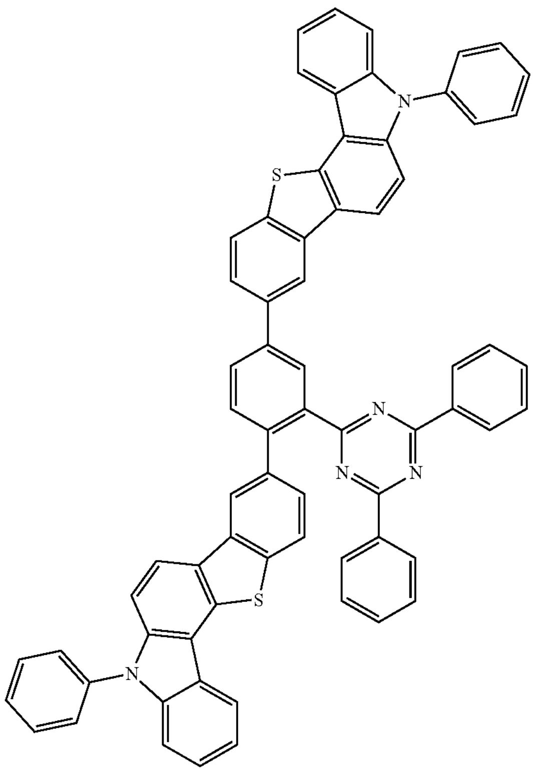
151
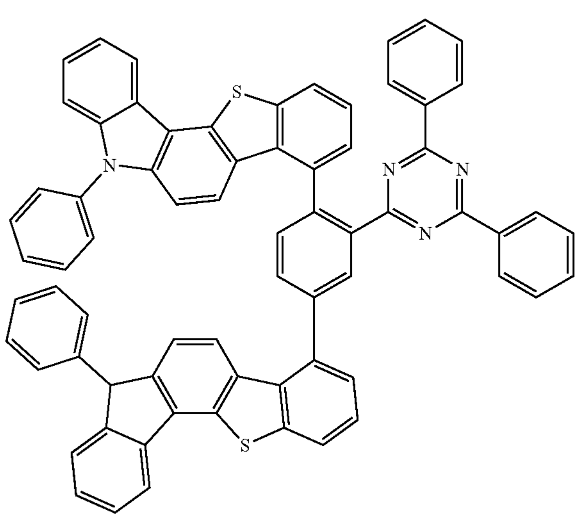
152
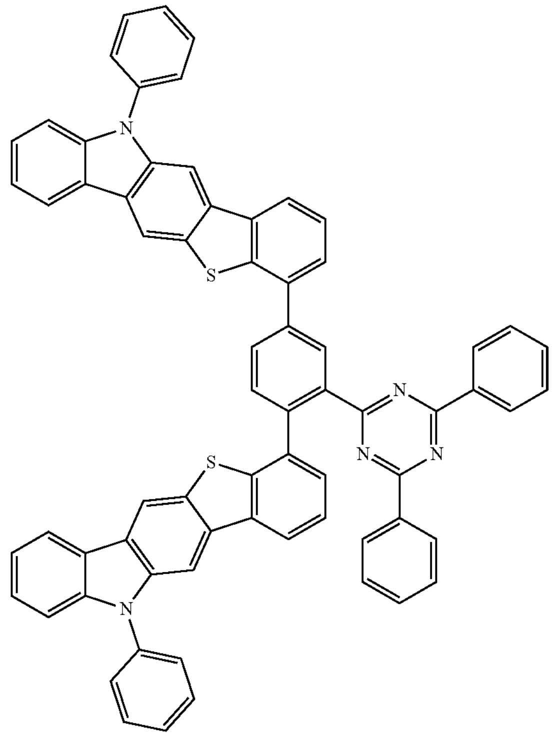
153
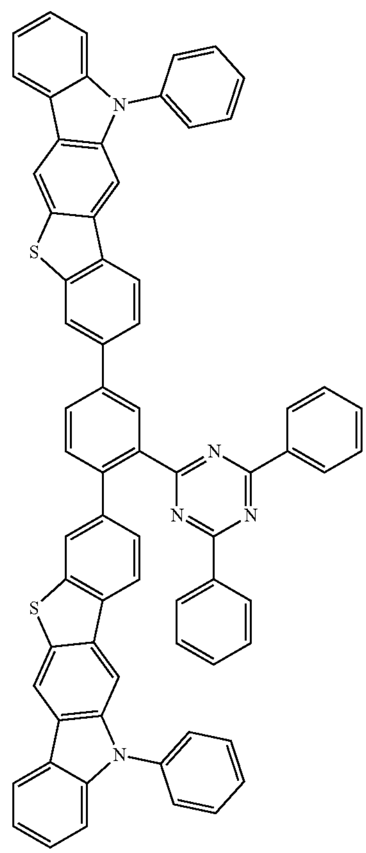

-continued
154
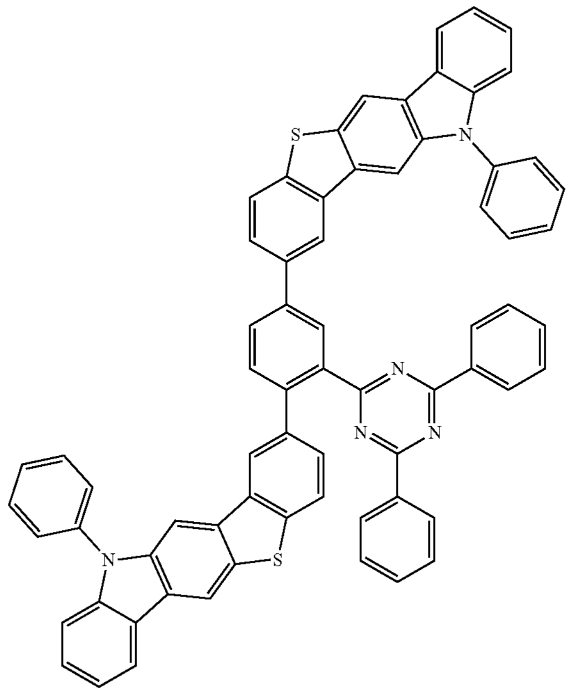
155
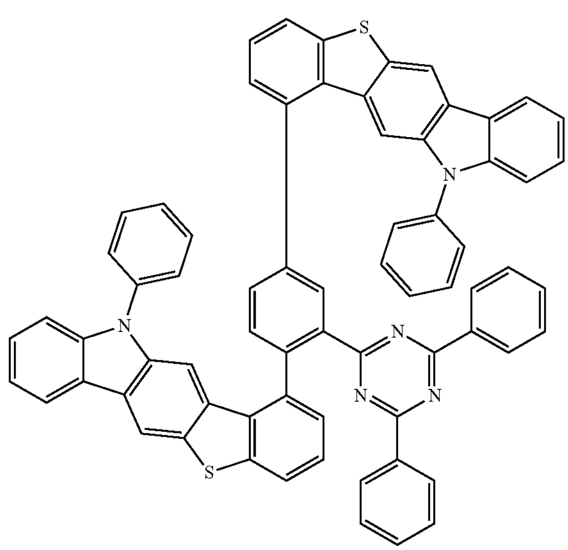
-continued
156
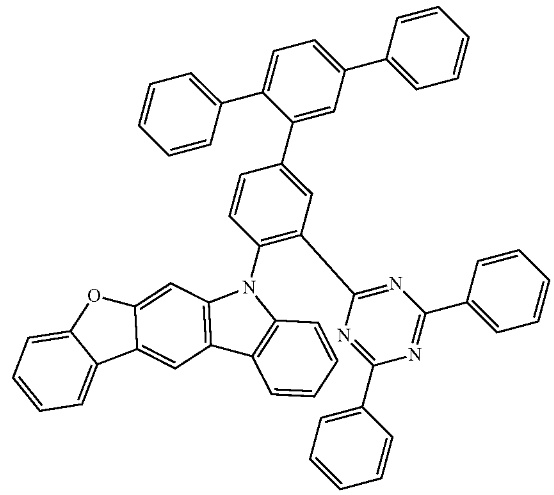
157
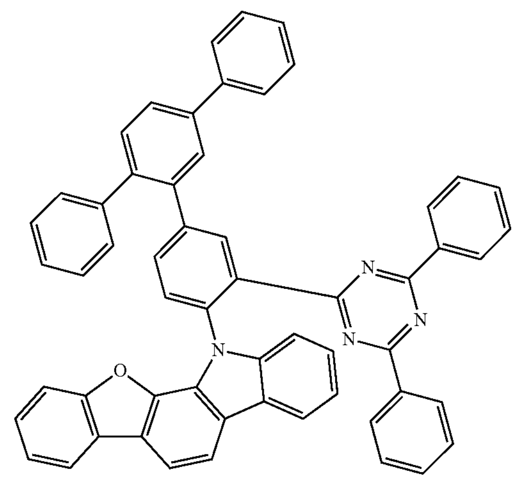
158
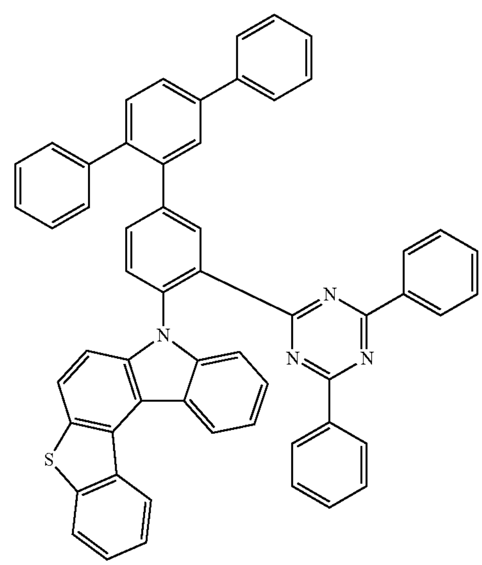

-continued
159
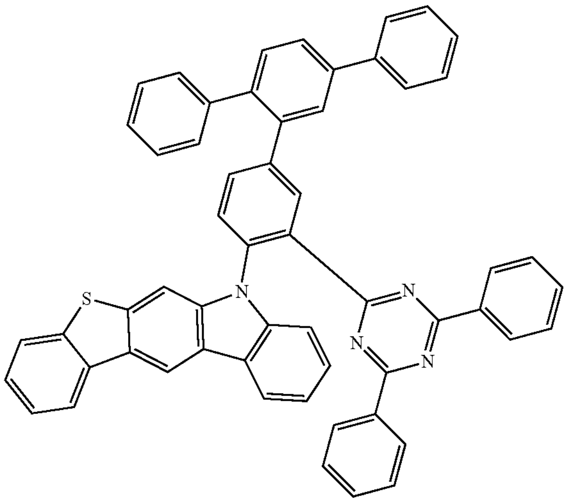
160
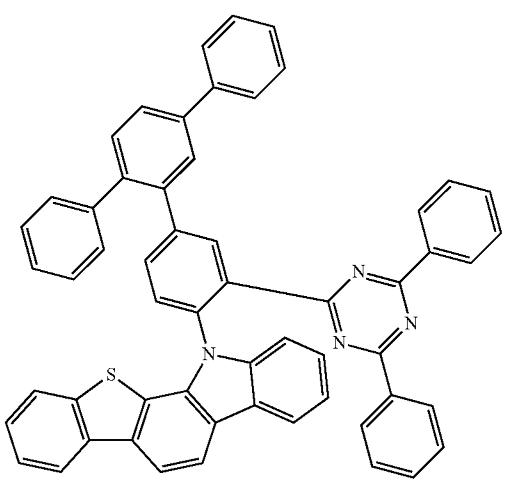
161
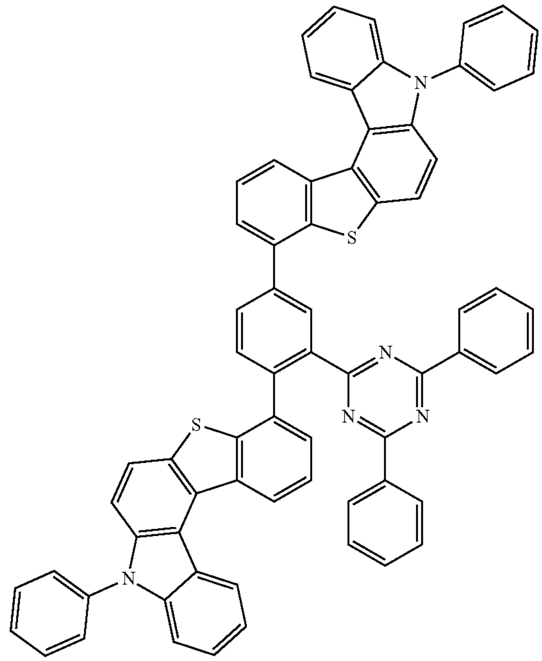
162
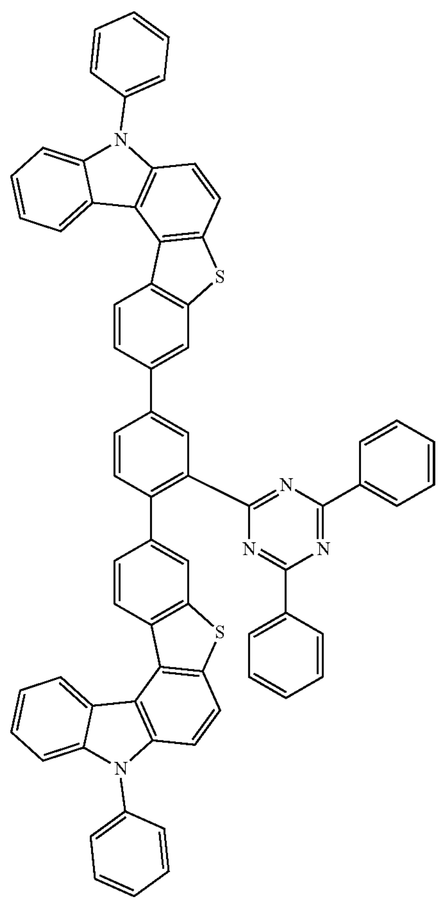

-continued
163
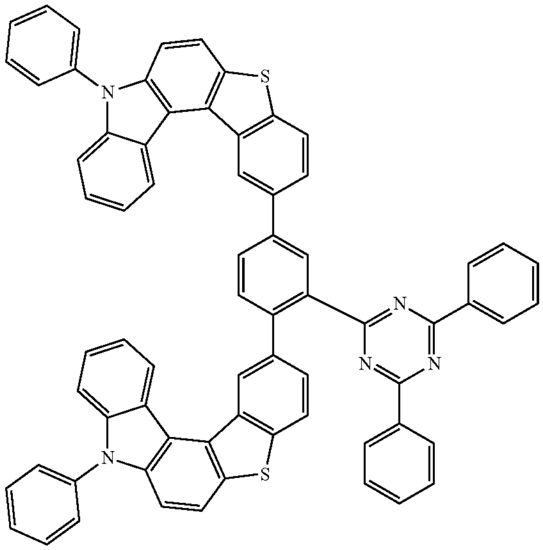
164
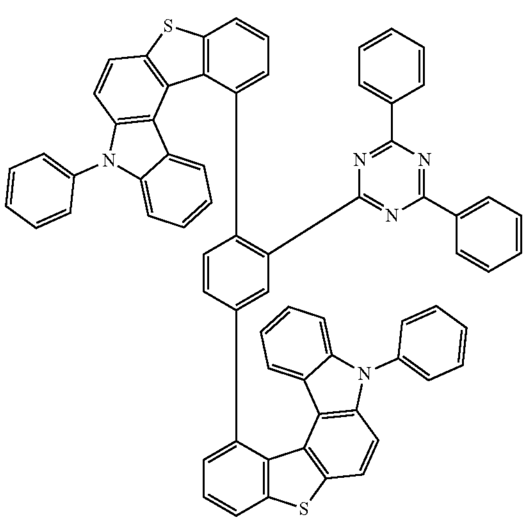
-continued
165
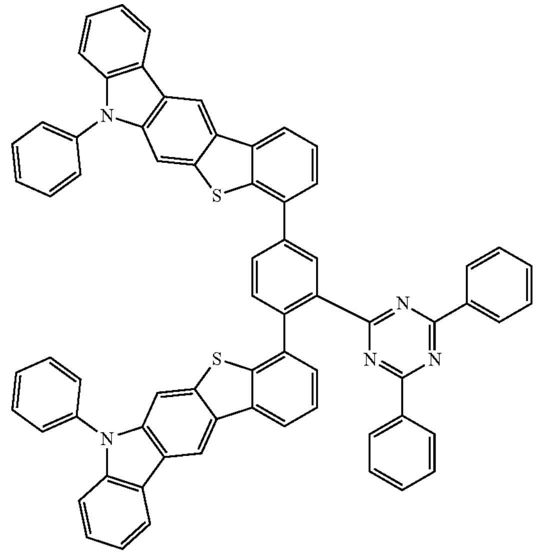
166
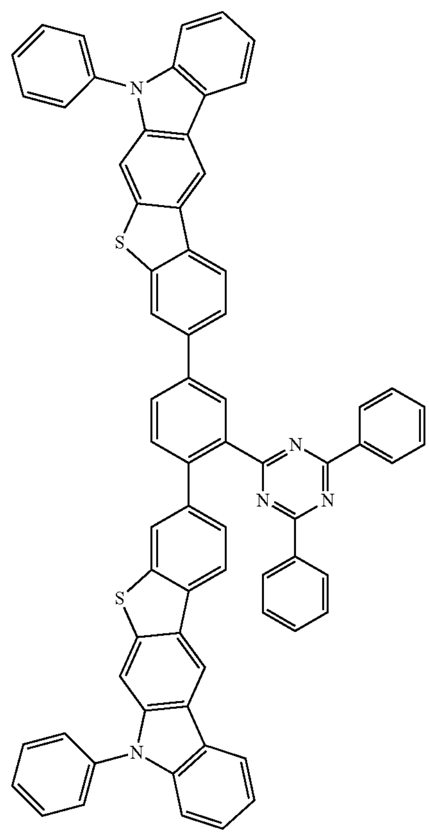

-continued
167
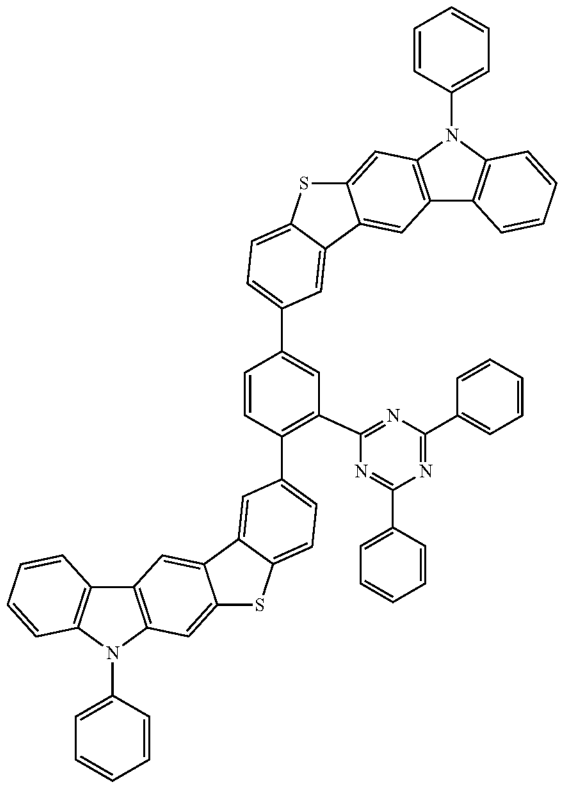
168
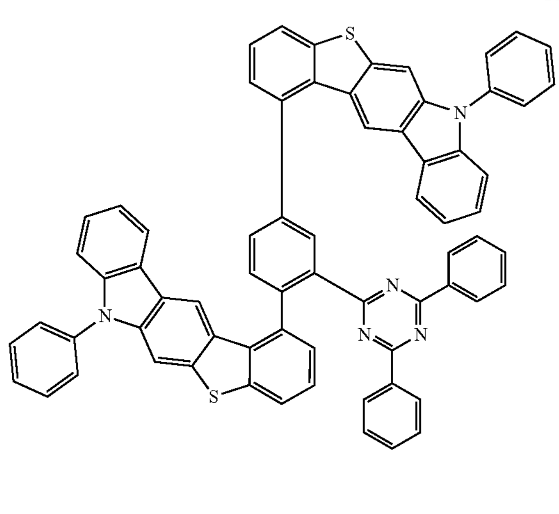
-continued
169
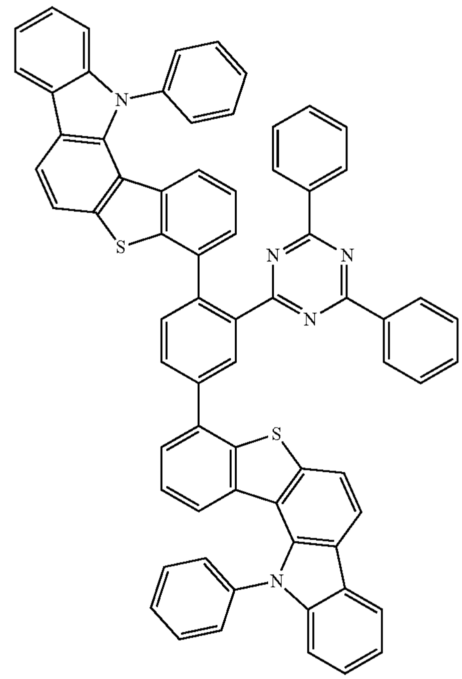
170
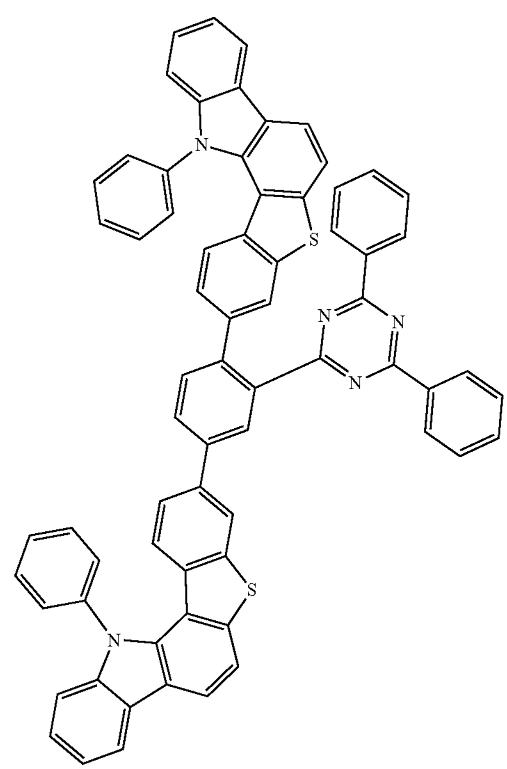

171
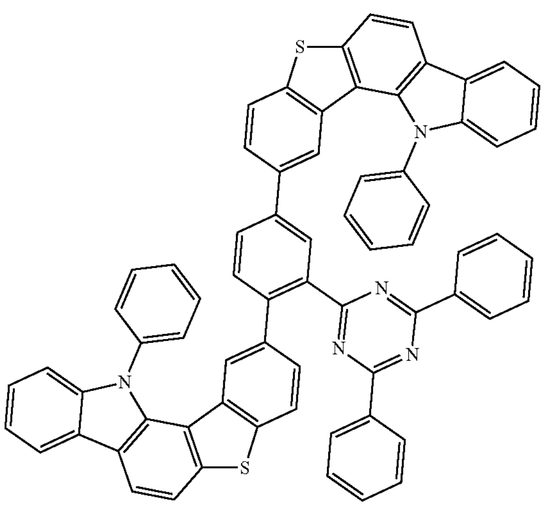
172
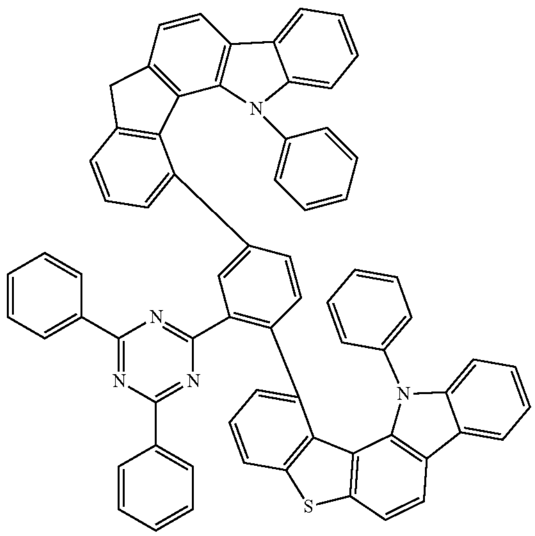
173
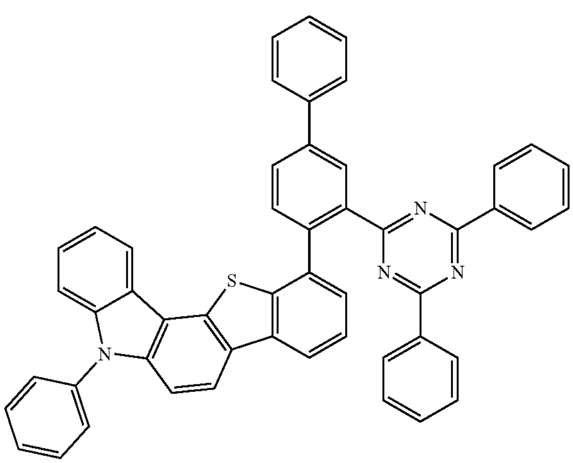
174
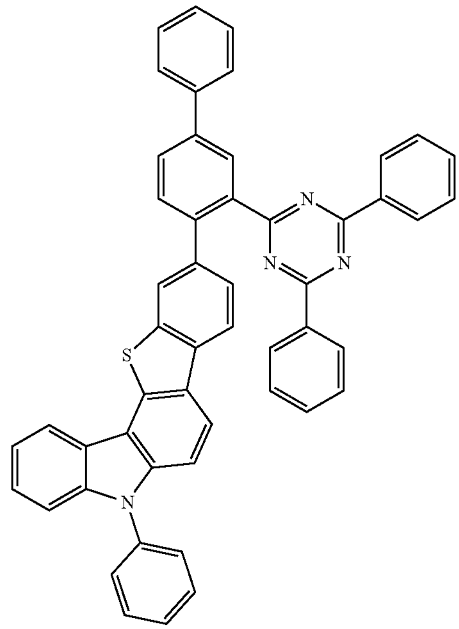
175
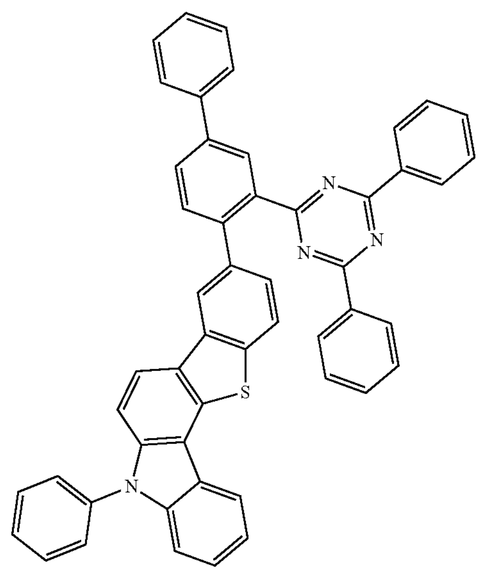
176
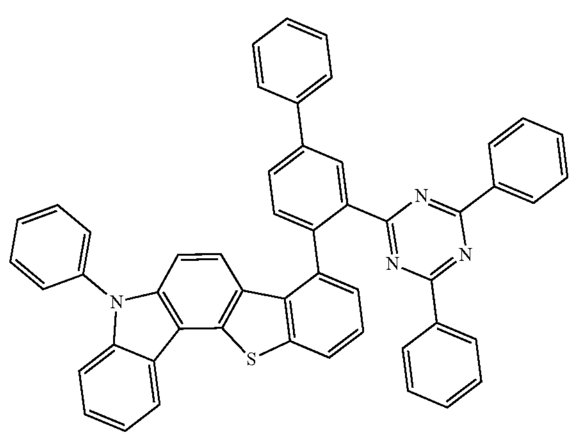

-continued
177
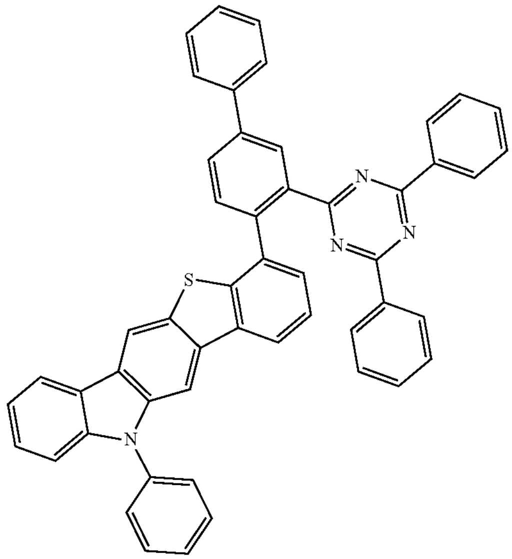
178
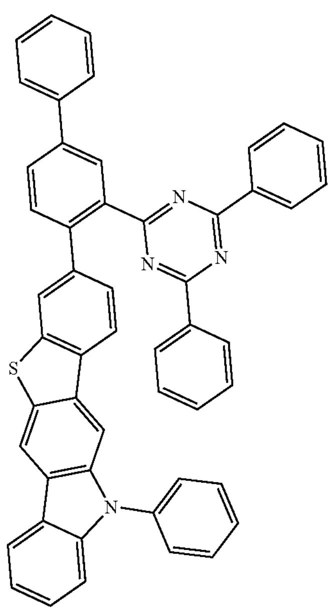
-continued
179
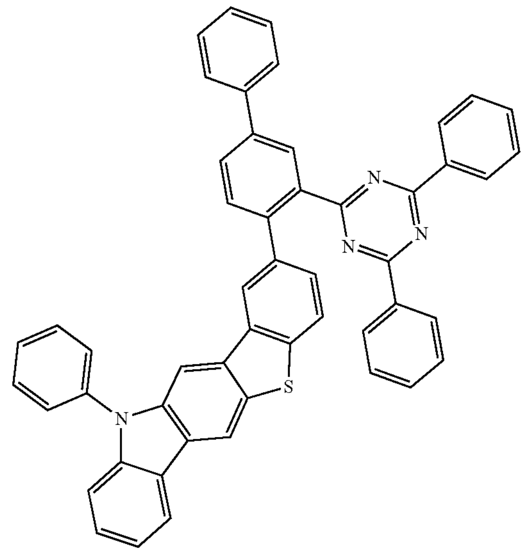
180
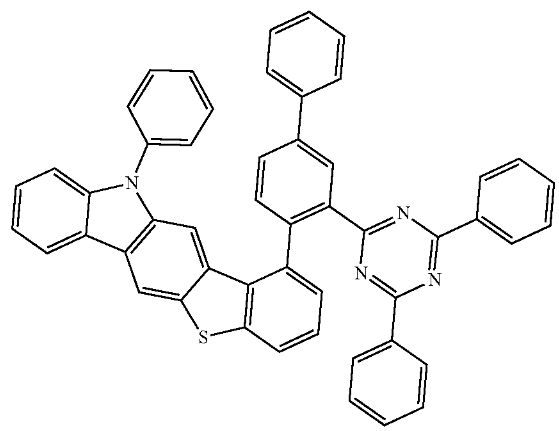
181
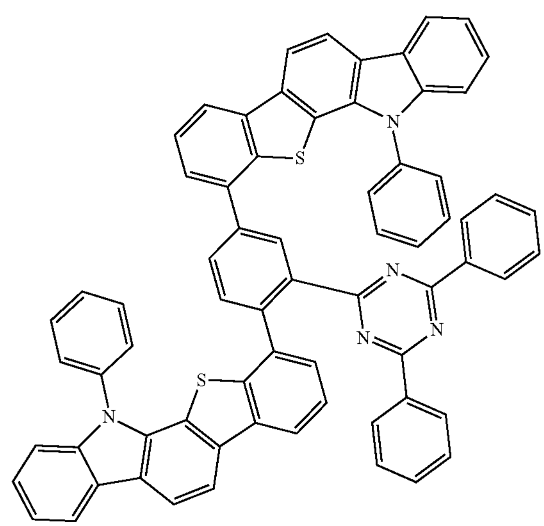

-continued
182
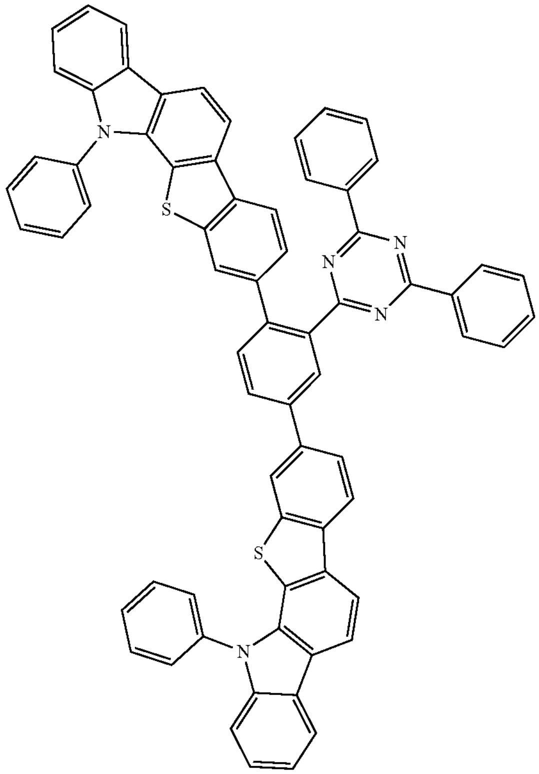
183
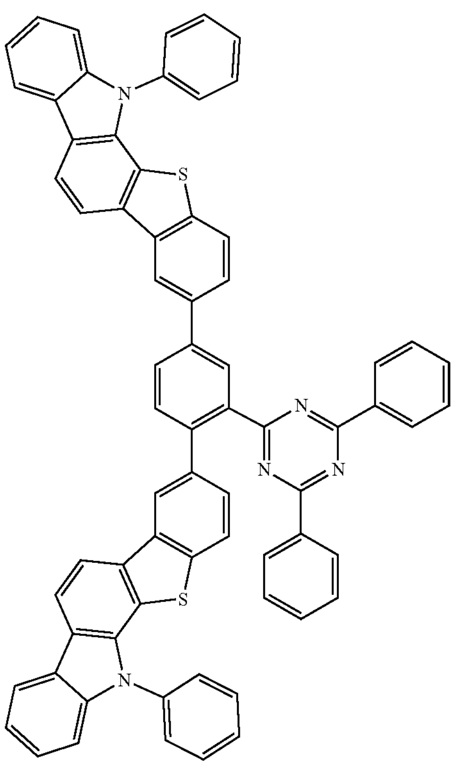
-continued
184
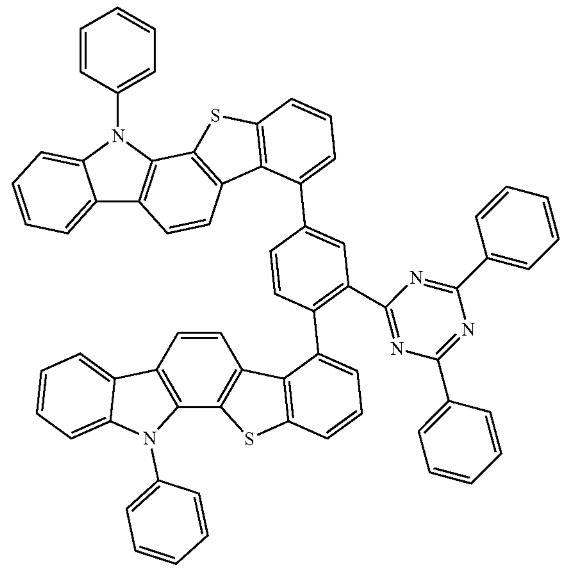
185
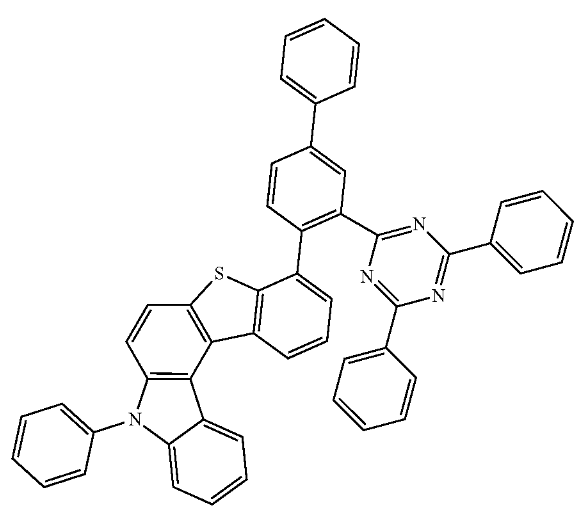

-continued
186
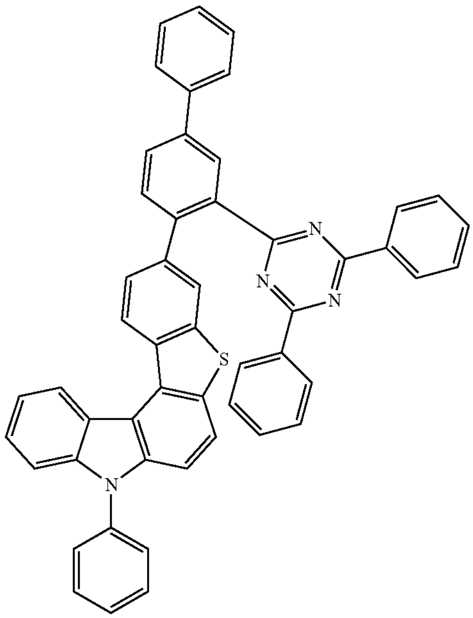
187
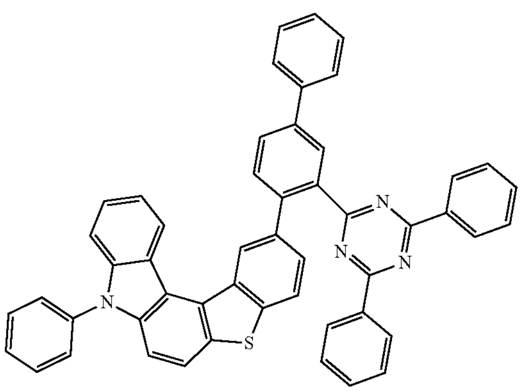
188
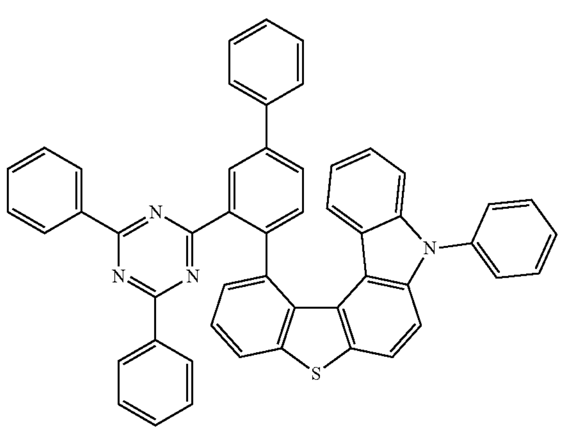
-continued
189
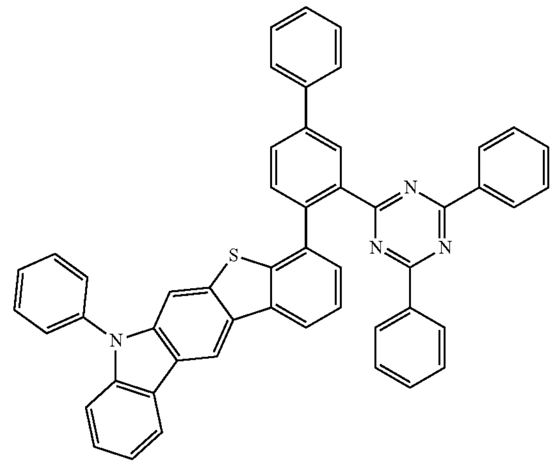
190
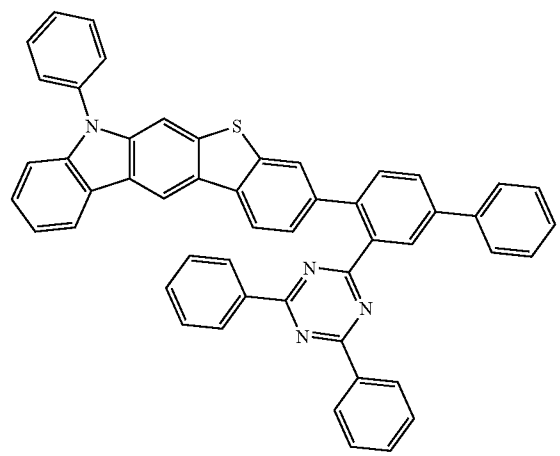
191
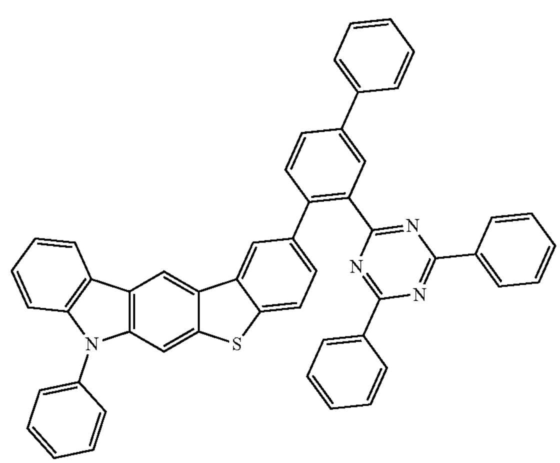

-continued
192
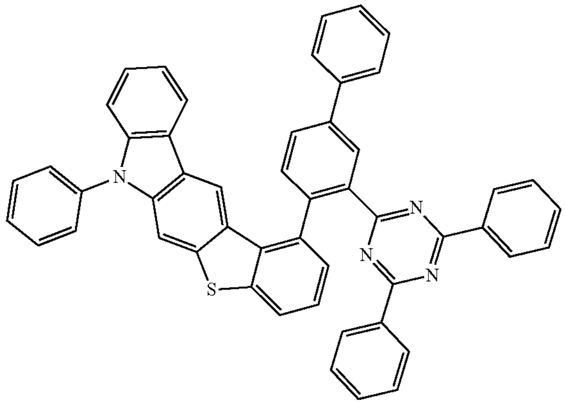
193
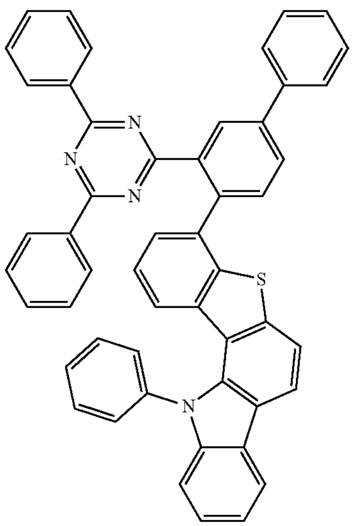
194
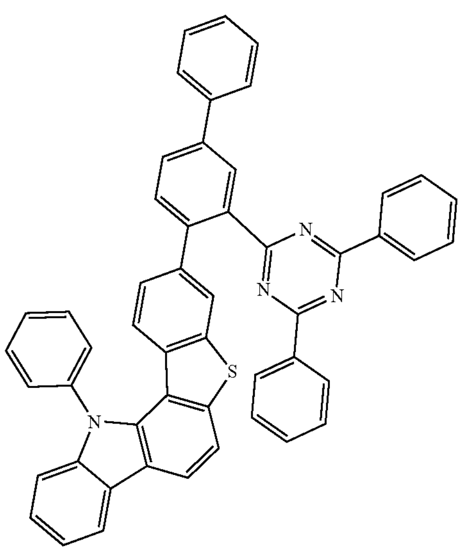
-continued
195
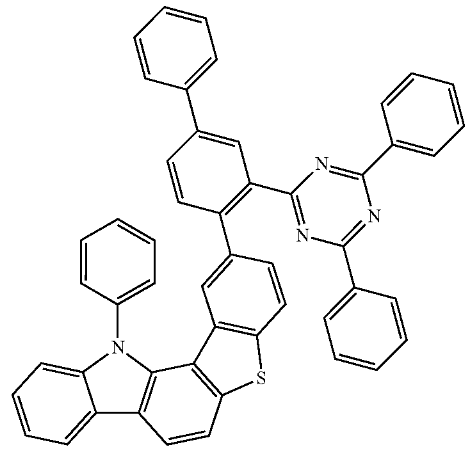
196
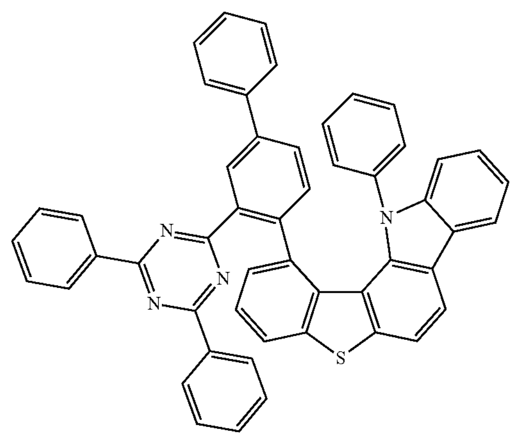
197
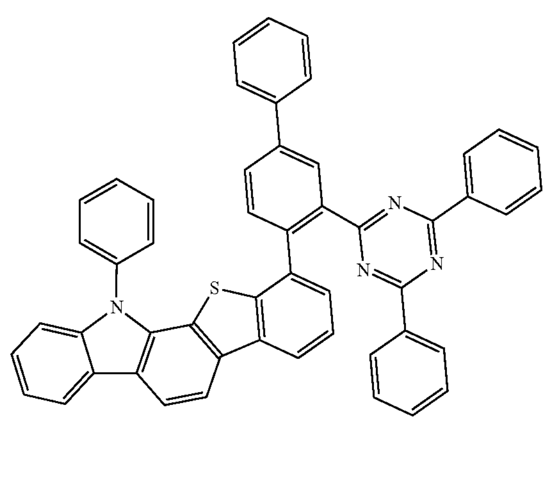

198
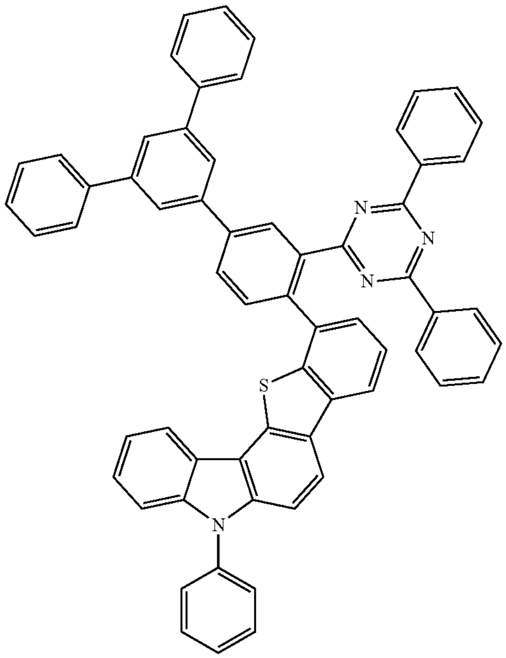
199
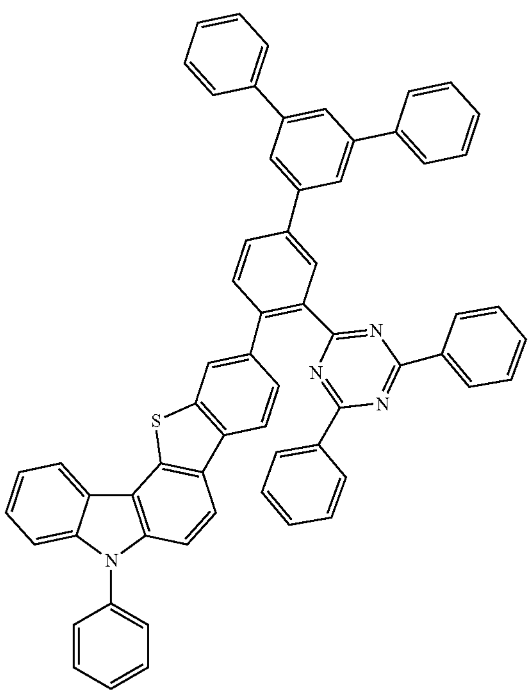
200
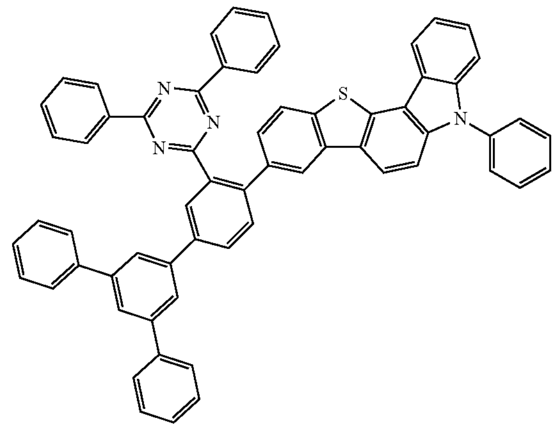
201
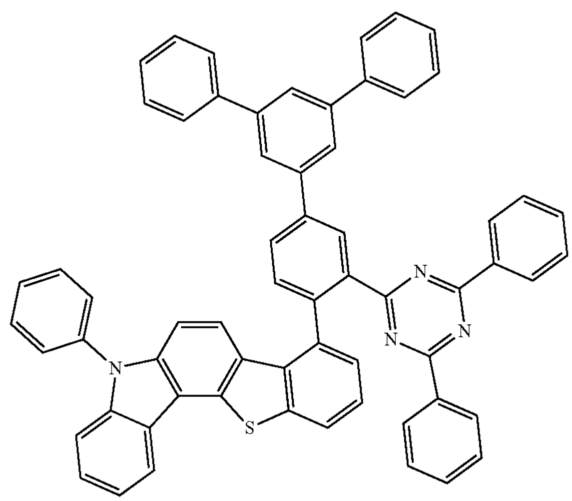
202
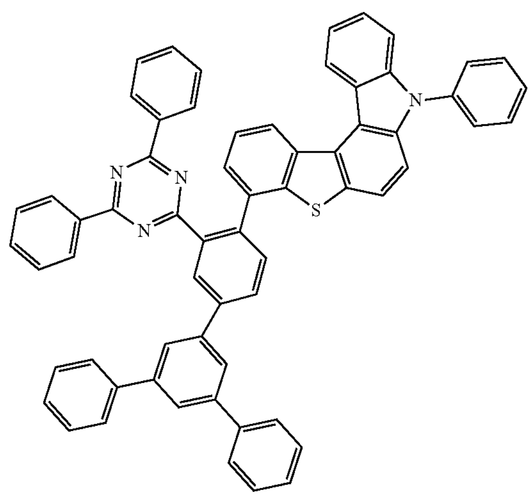

-continued
203
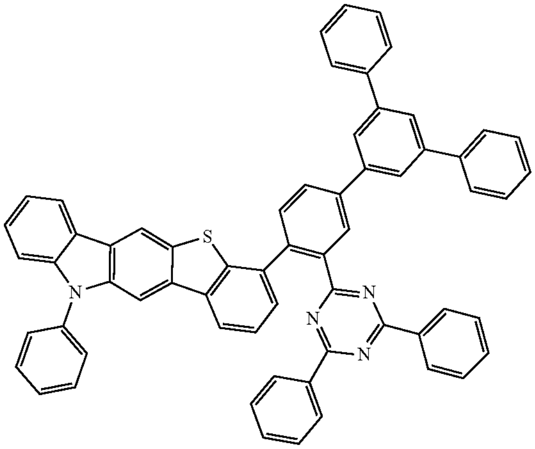
204
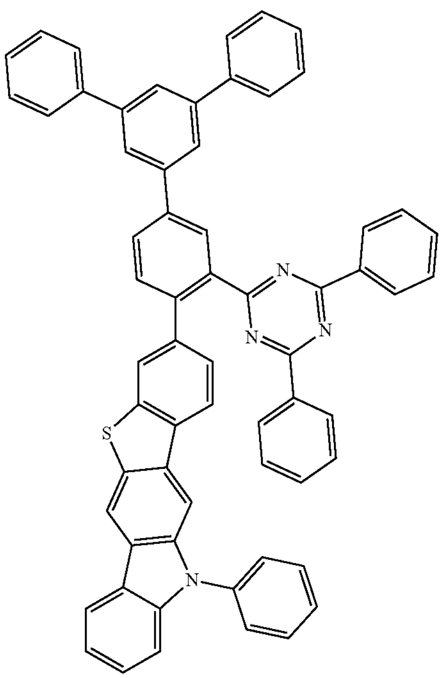
-continued
205
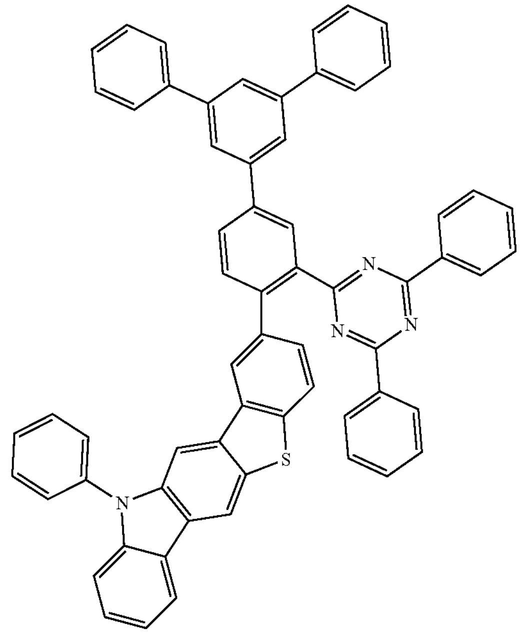
206
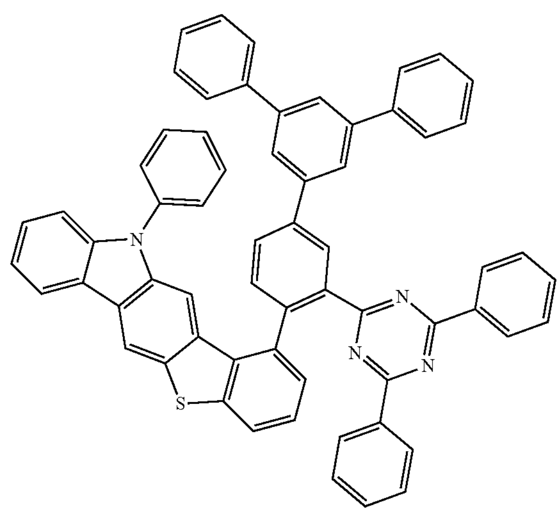

-continued
207
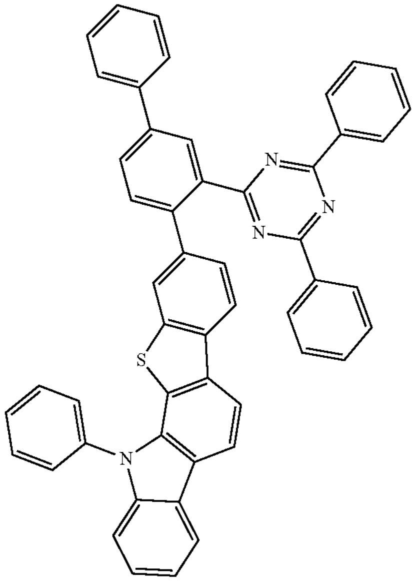
208
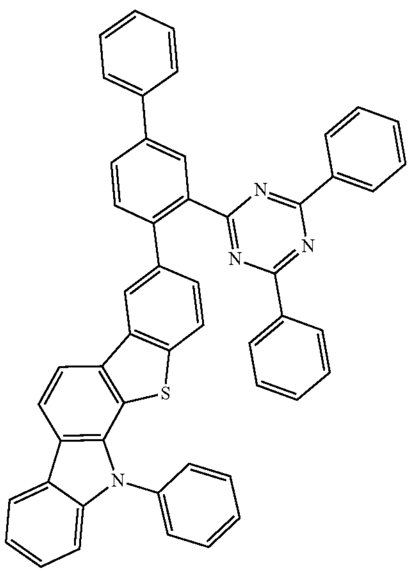
209
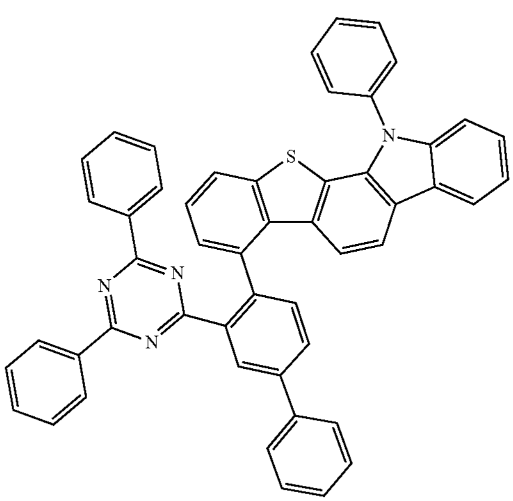
-continued
210
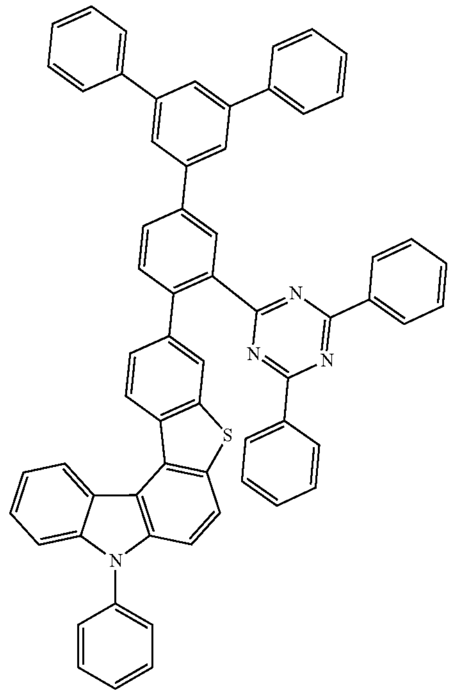
211
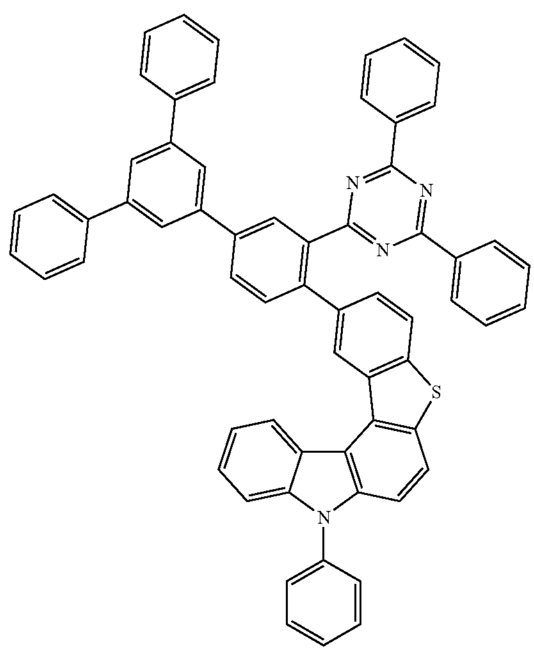

-continued
212
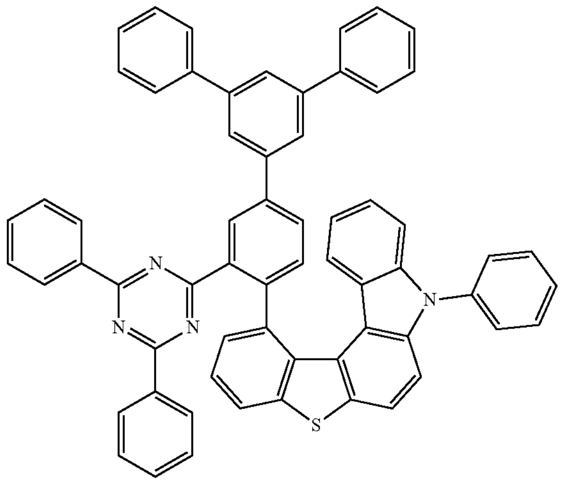
213
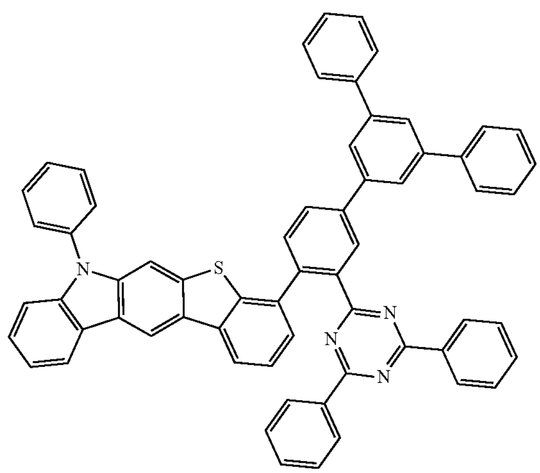
214
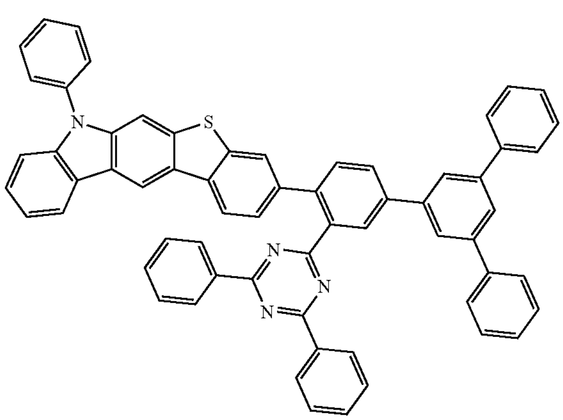
-continued
215
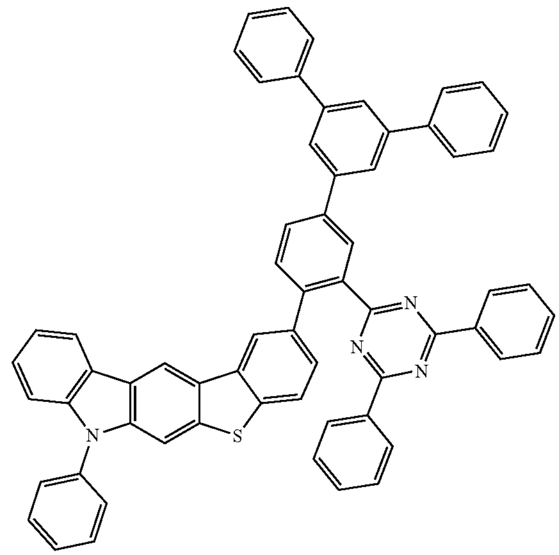
216
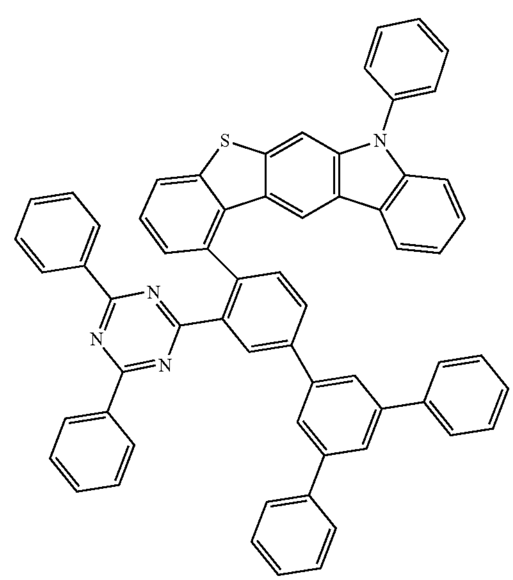

217
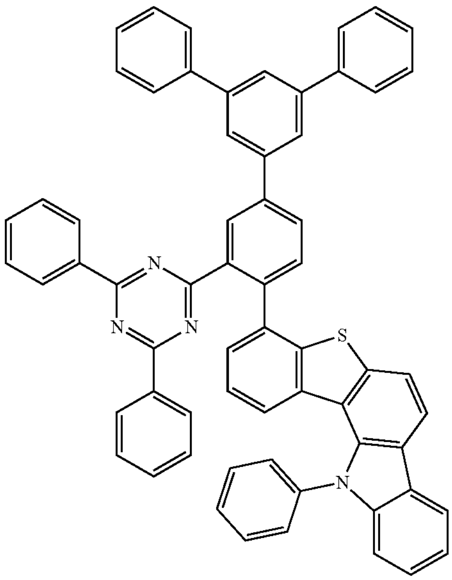
218
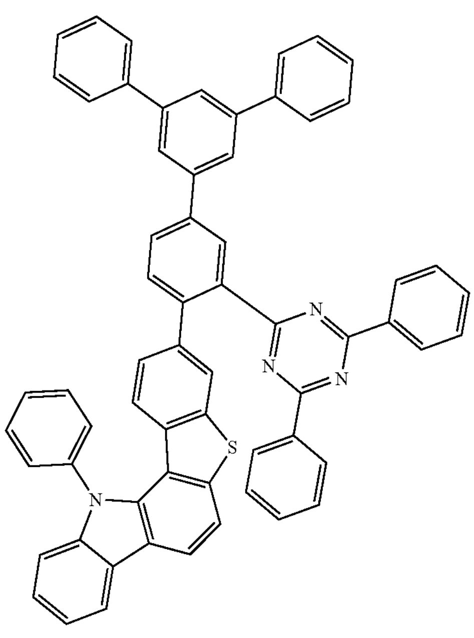
219
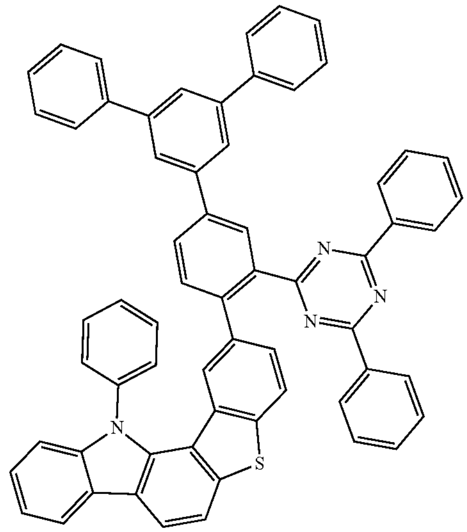
220
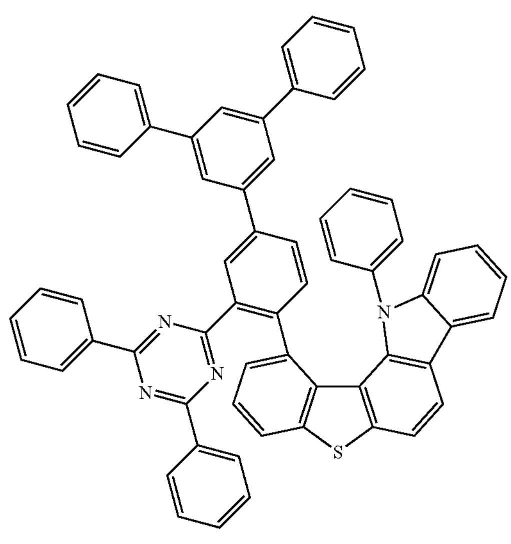

-continued
221
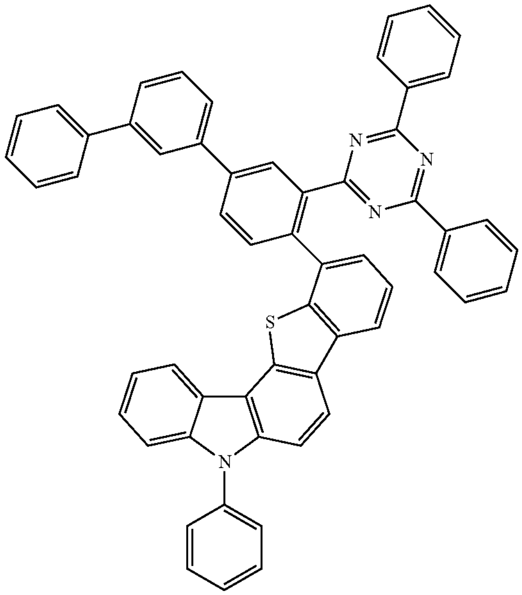
222
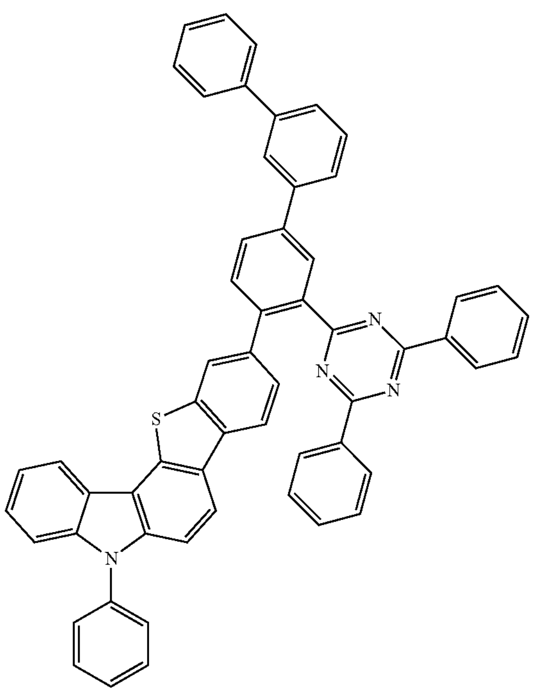
-continued
223
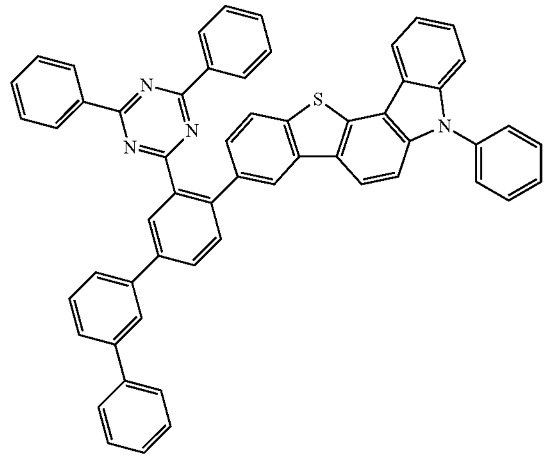
224
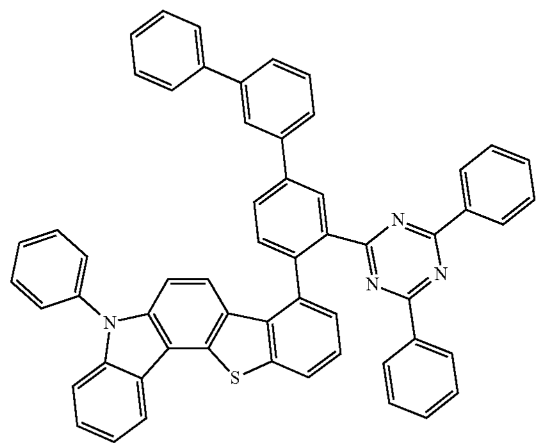
225
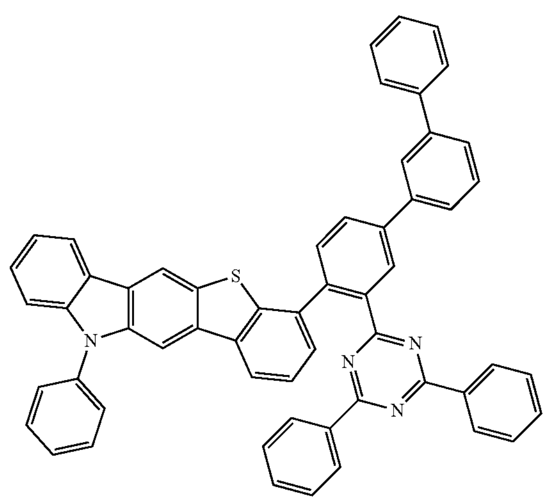

226
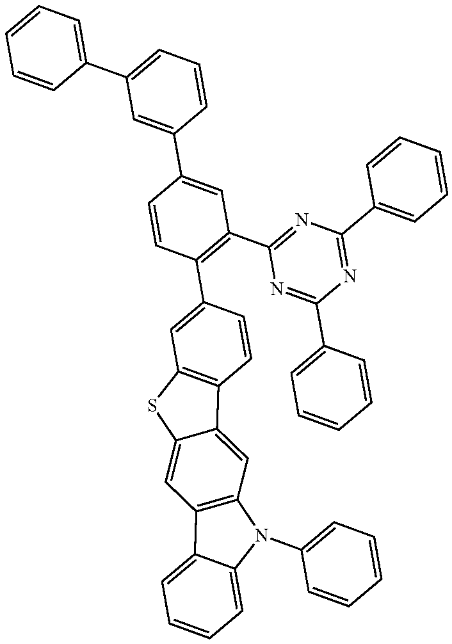
227
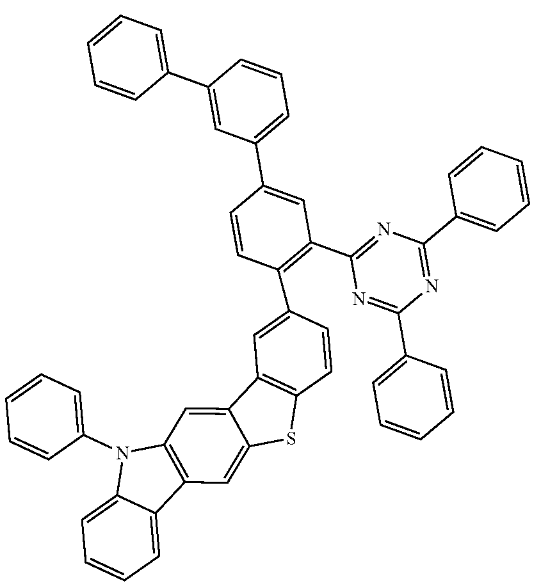
228
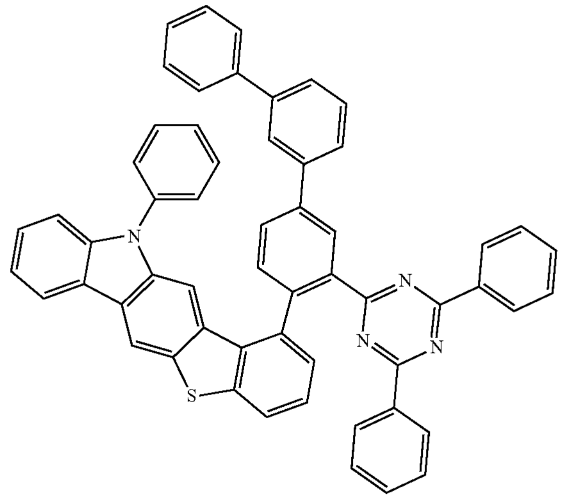
229
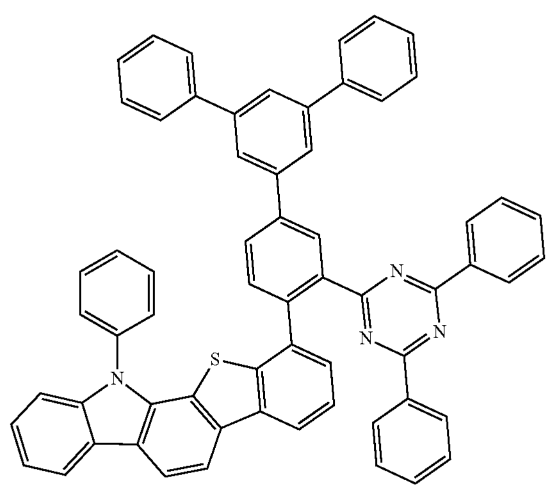

-continued
230
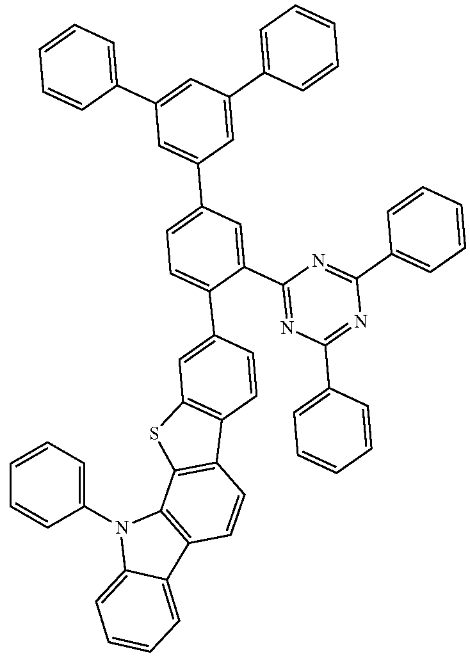
231
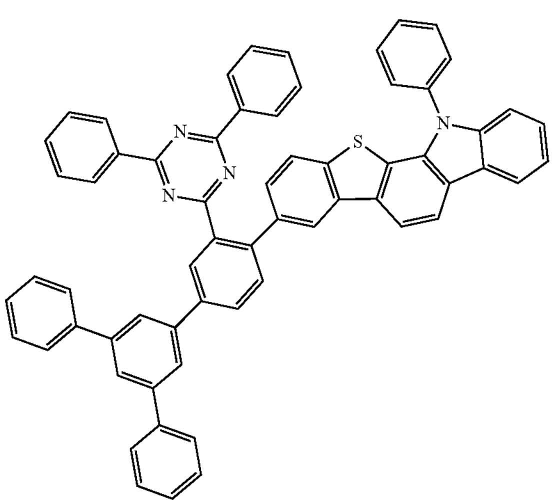
-continued
232
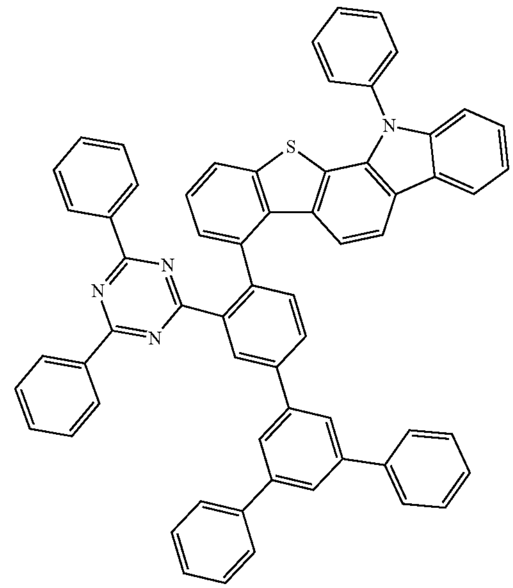
233
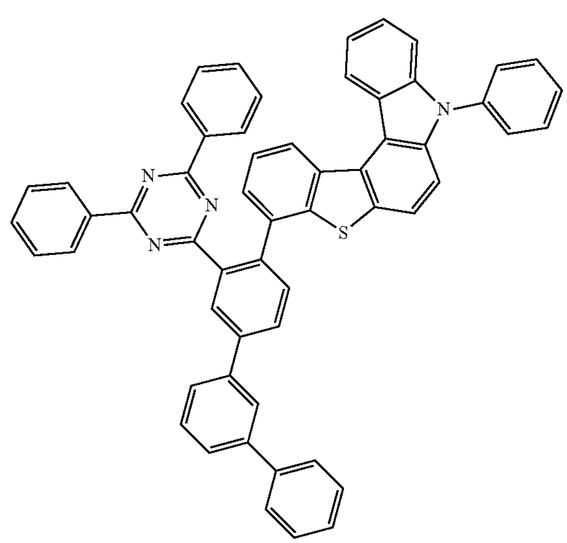

-continued
234
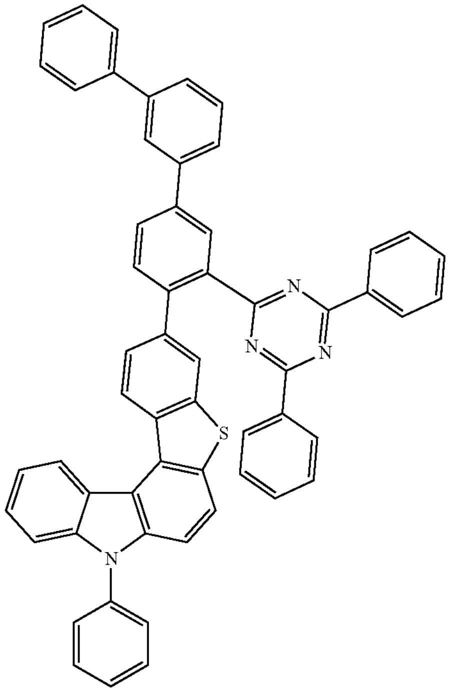
235
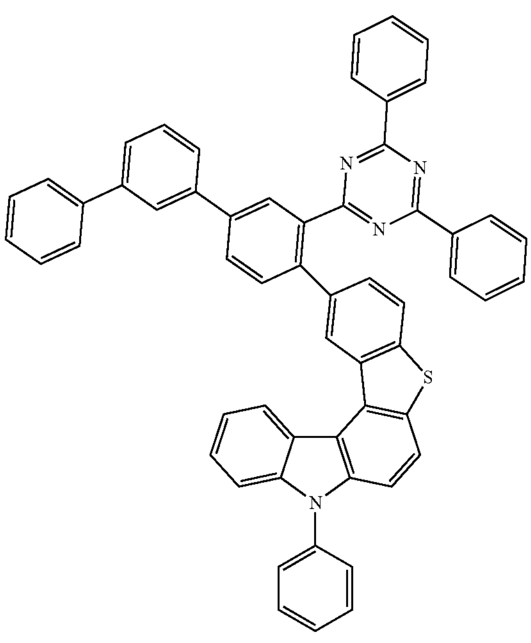
-continued
236
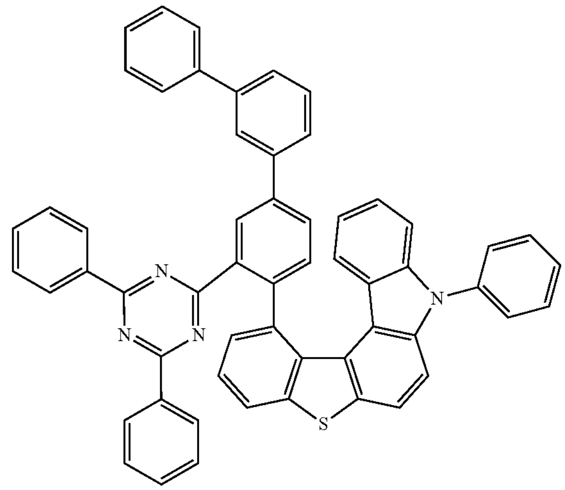
237
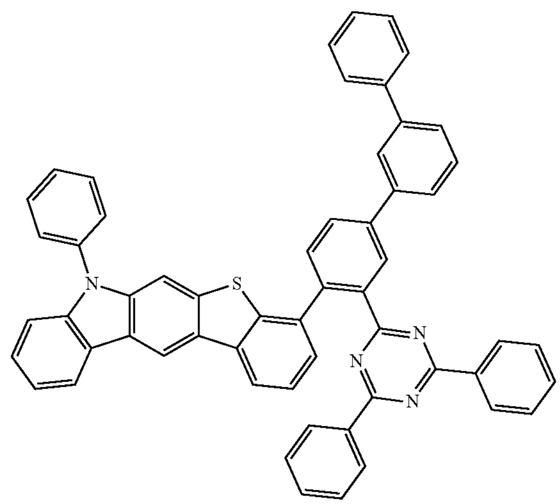
238
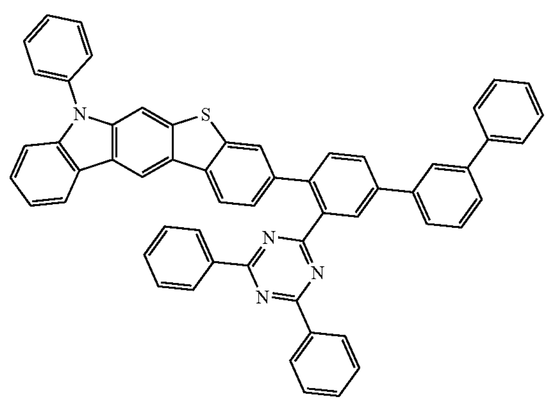

-continued
239
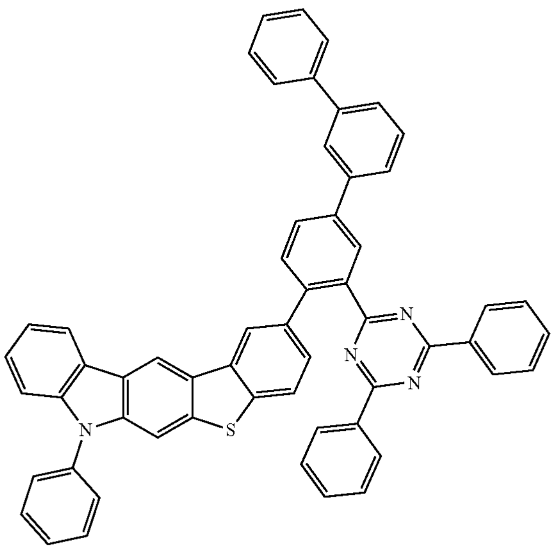
240
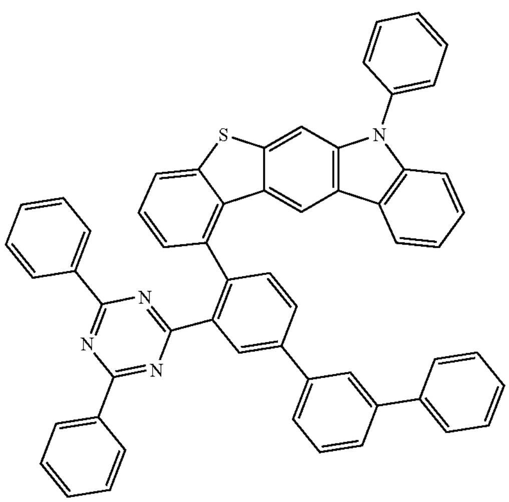
241
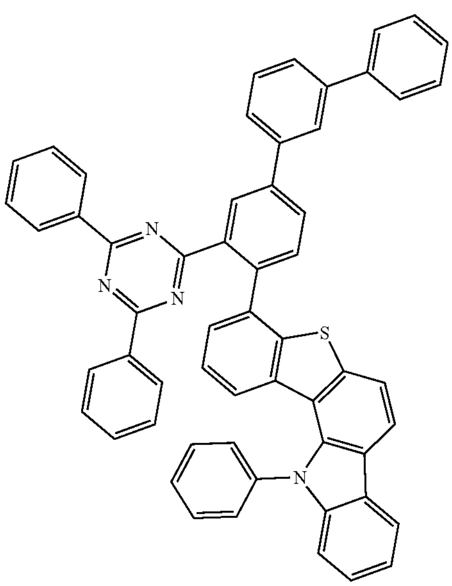
-continued
242
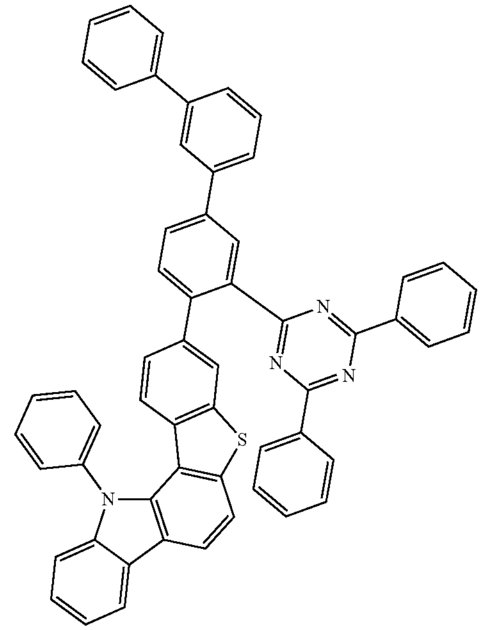
243
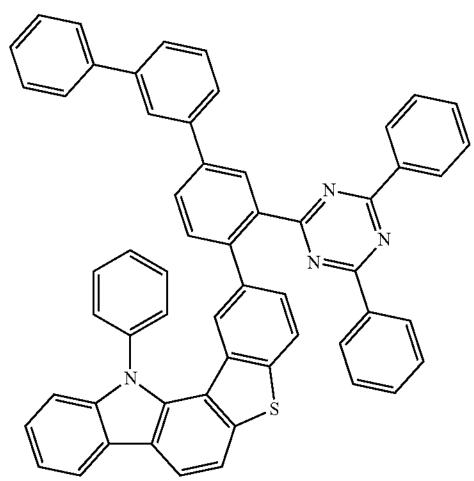
244
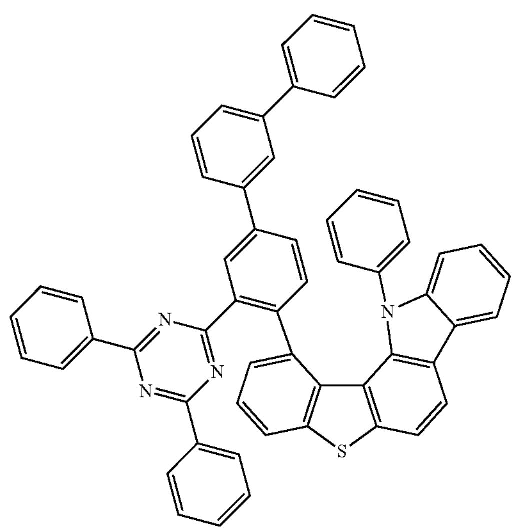

245
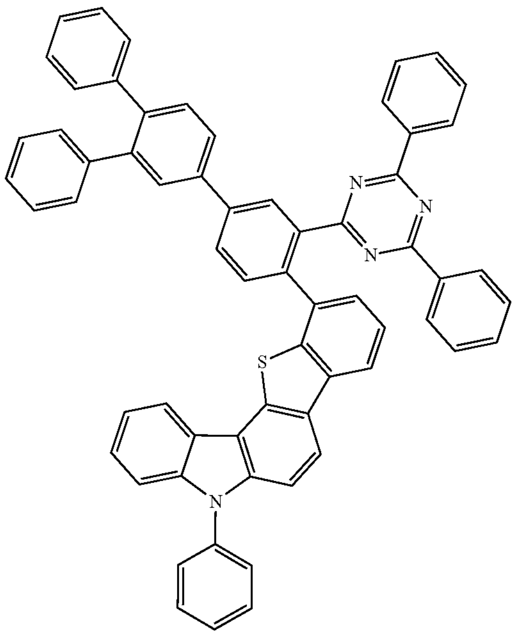
246
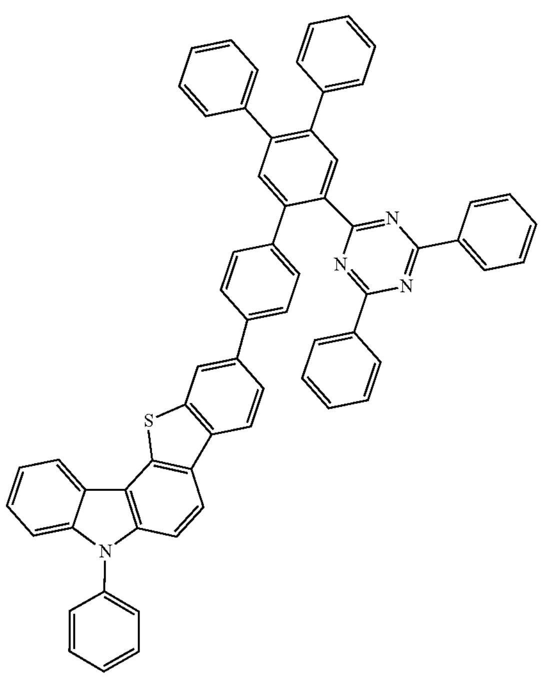
247
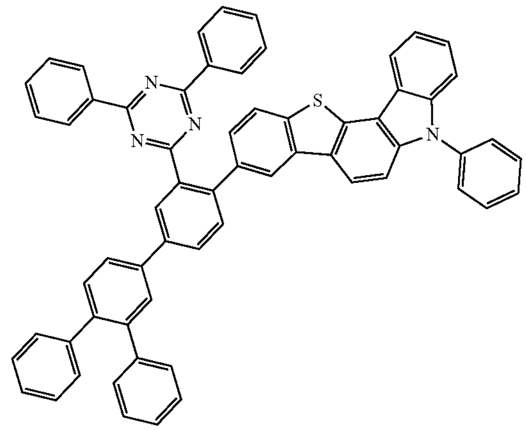
248
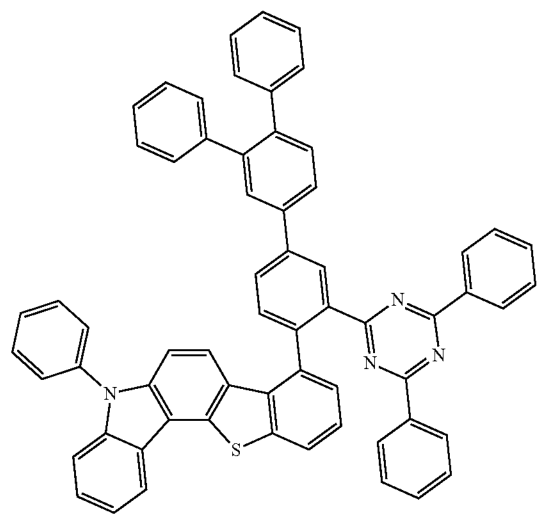
249
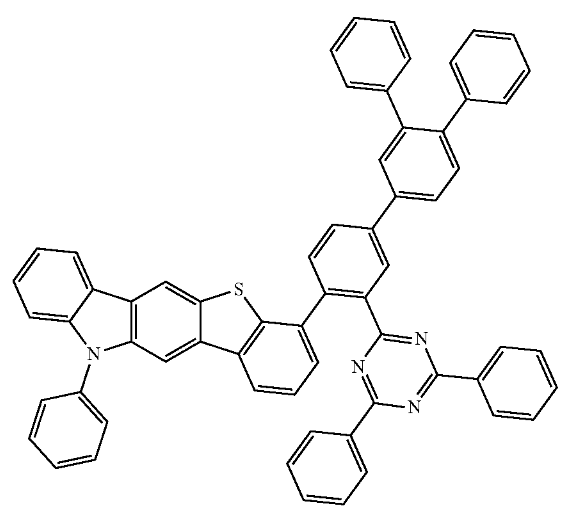

-continued
250
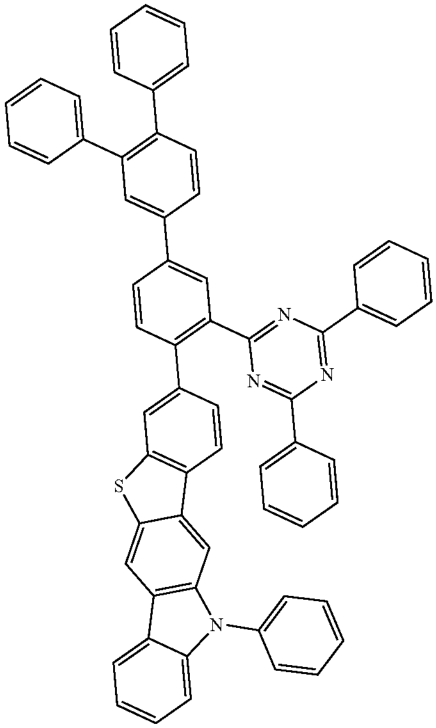
251
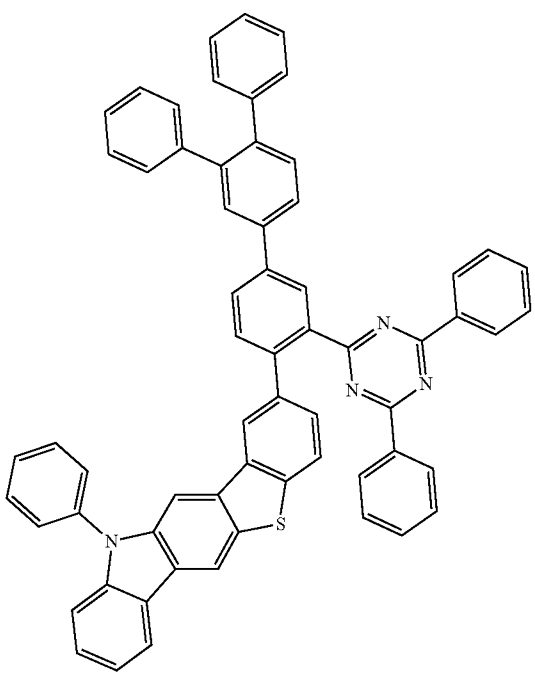
-continued
252
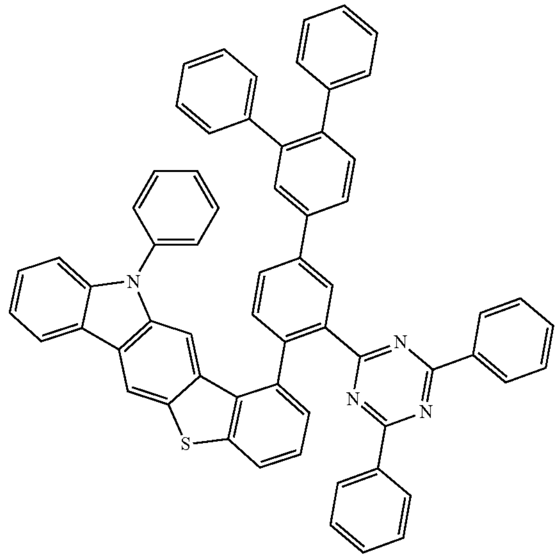
253
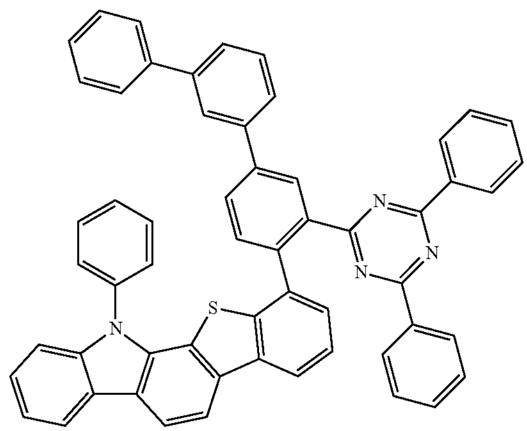
254
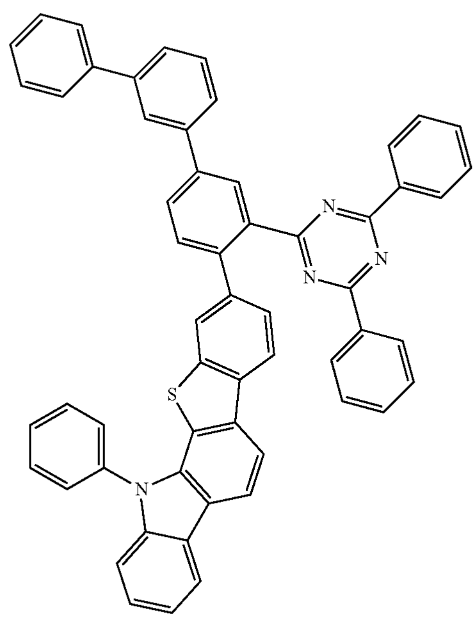

-continued
255
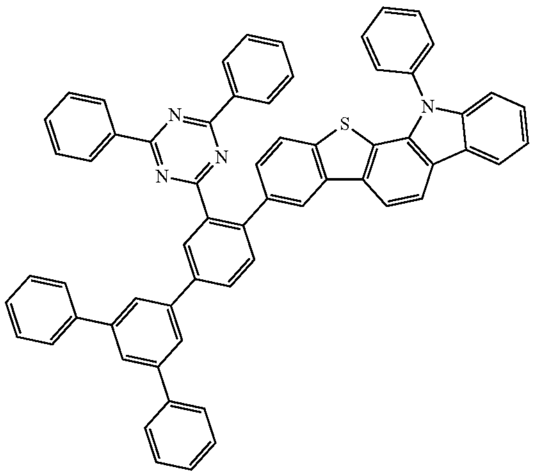
256
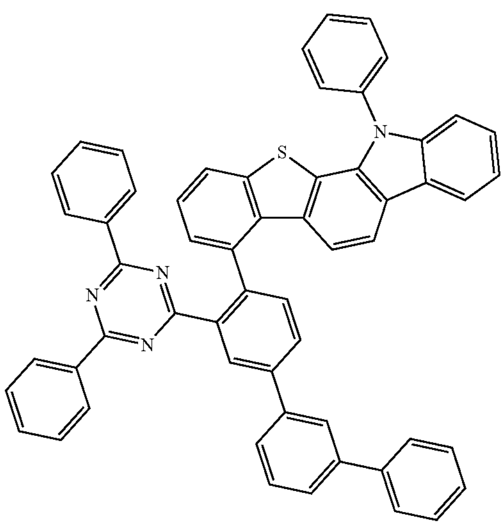
257
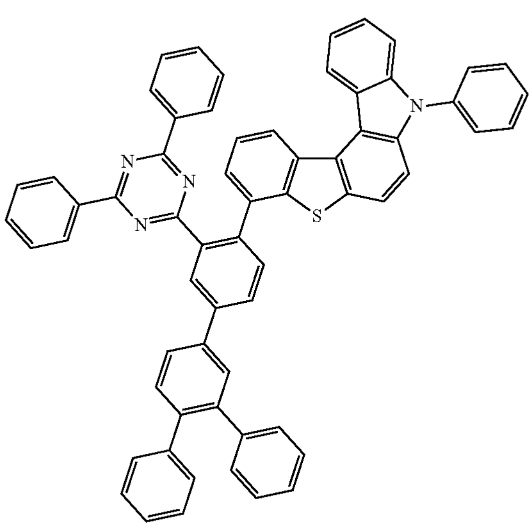
-continued
258
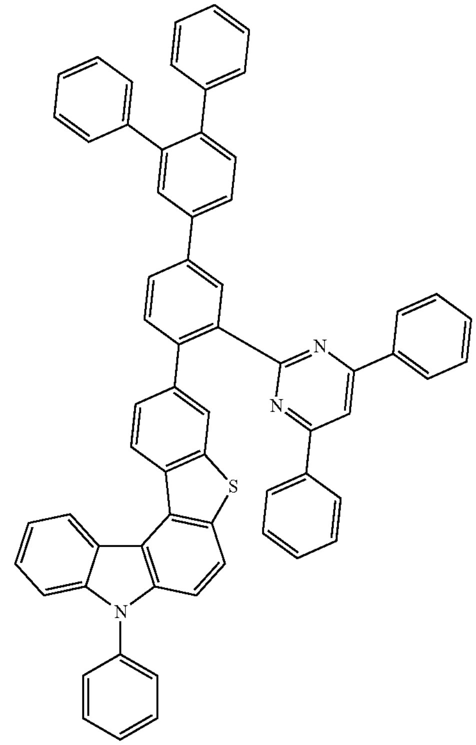
259
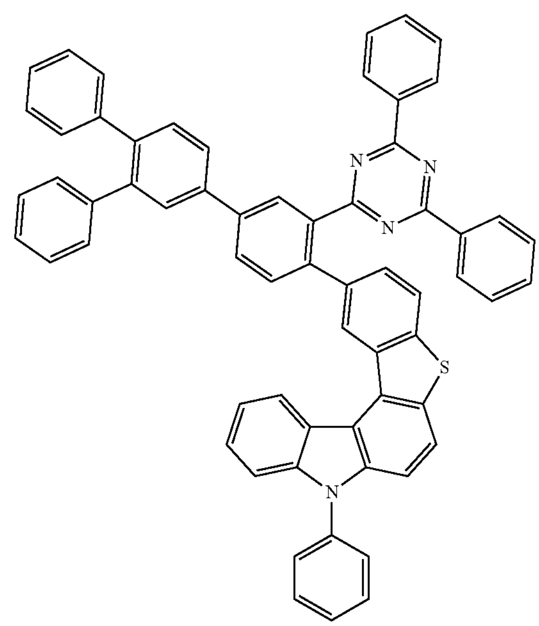

-continued
260
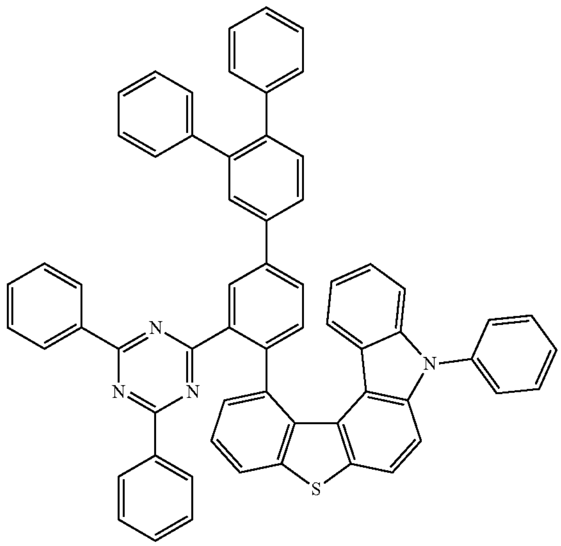
261
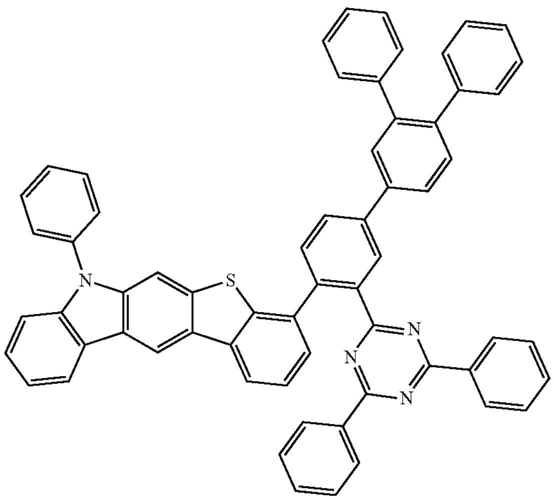
262
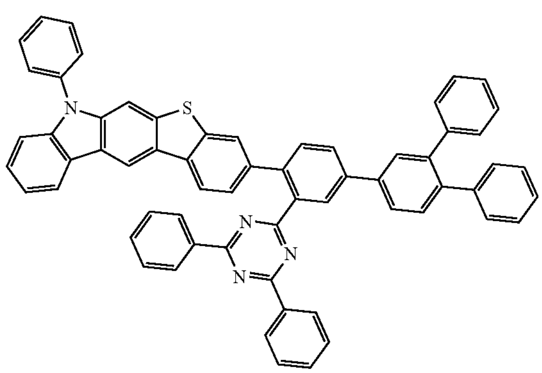
-continued
263
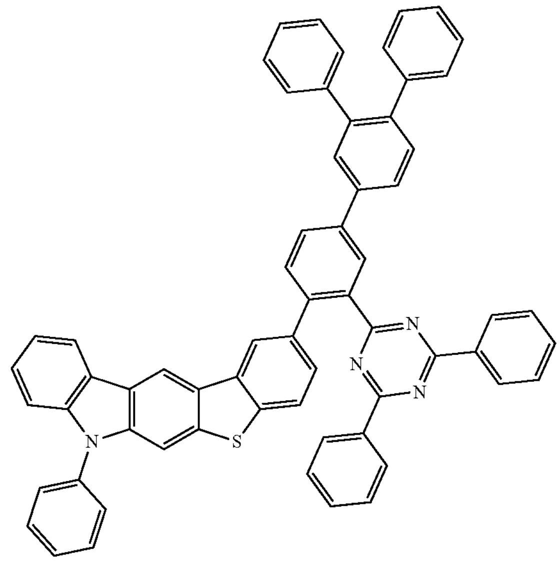
264
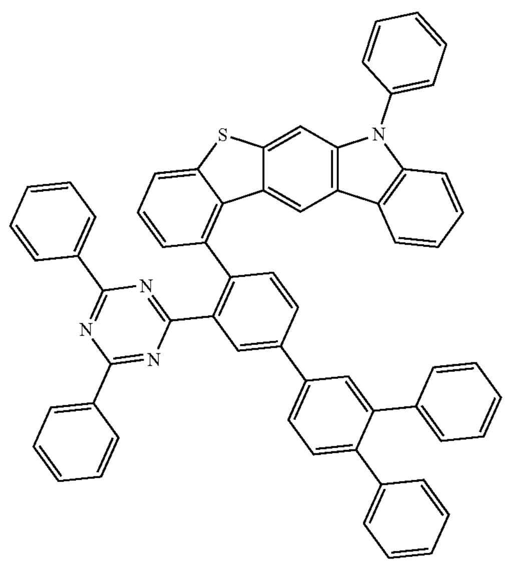

-continued
265
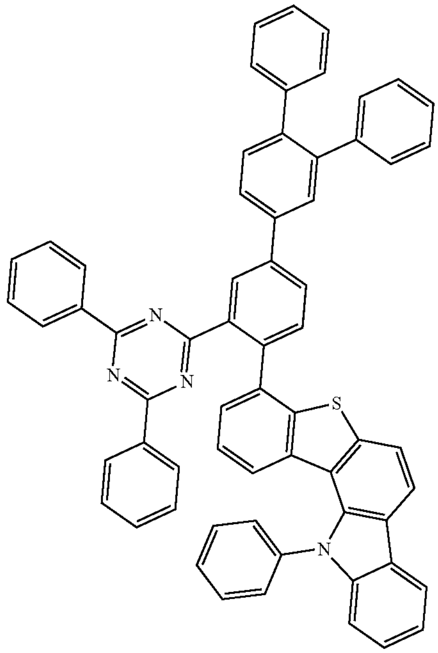
266
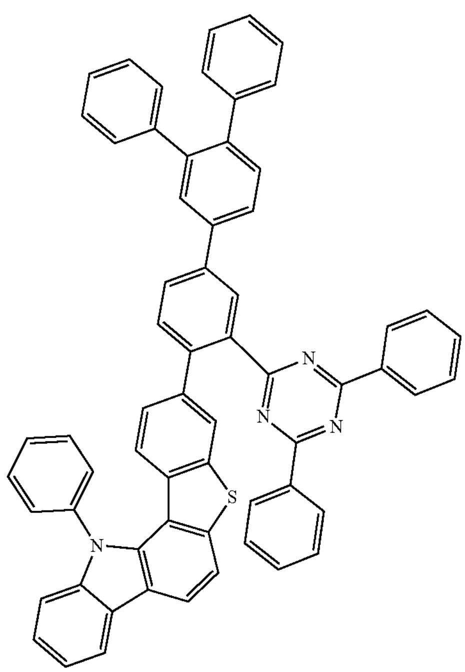
-continued
267
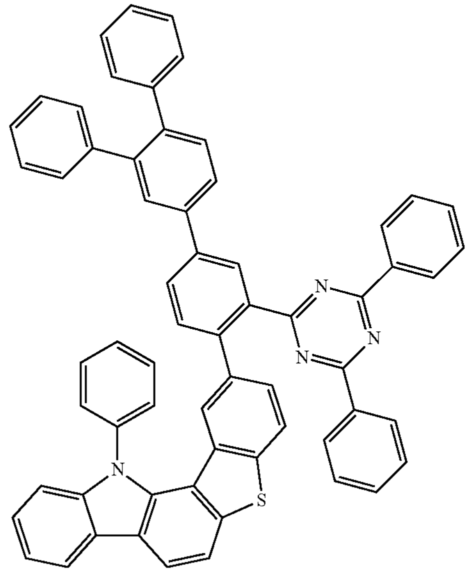
268
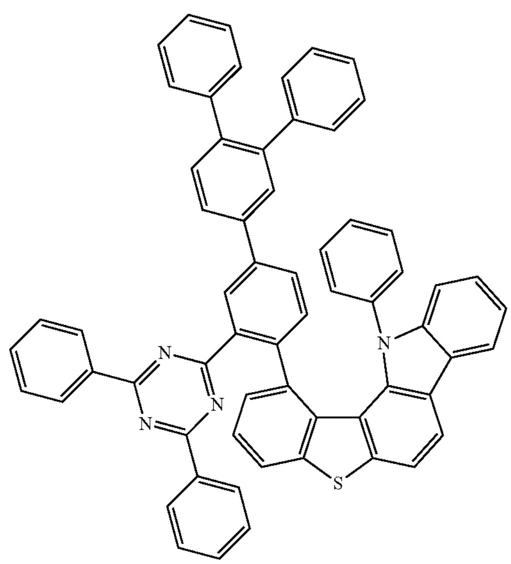

-continued
269
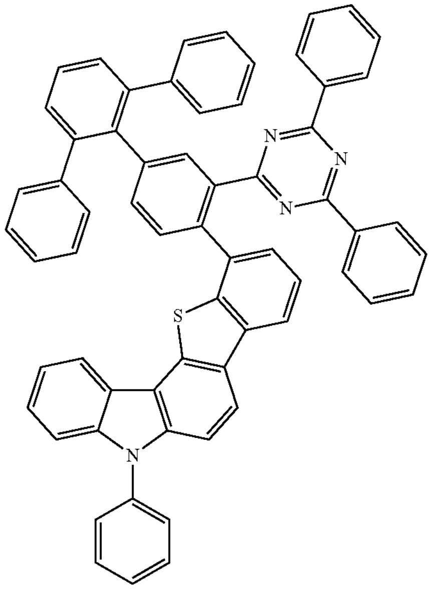
270
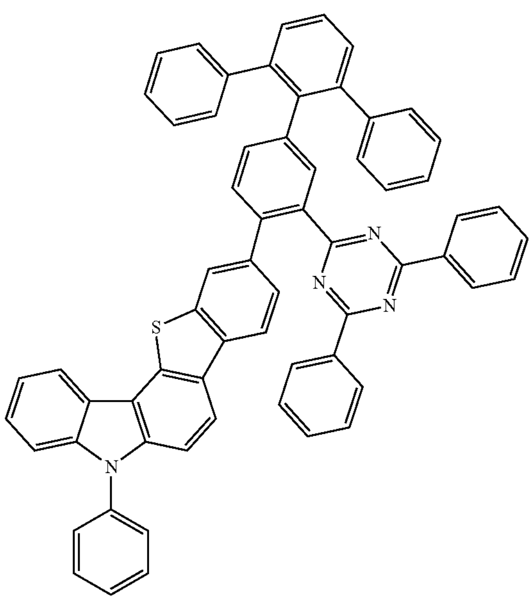
271
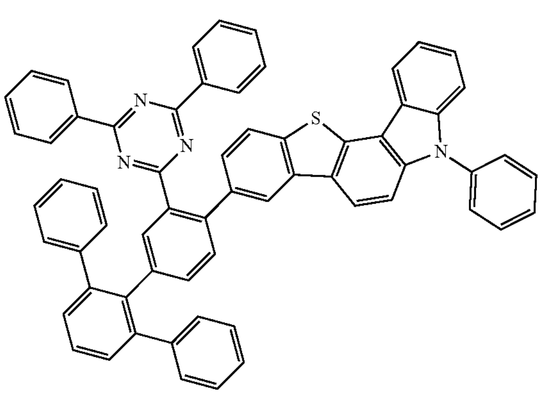
-continued
272
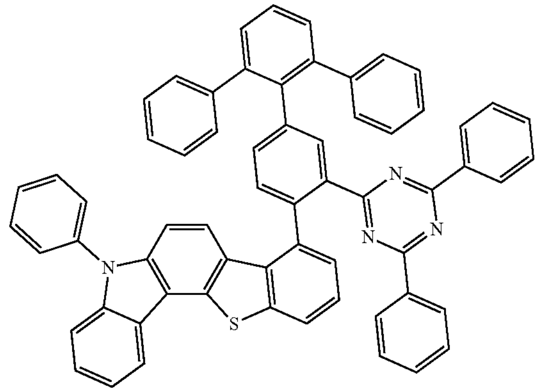
273
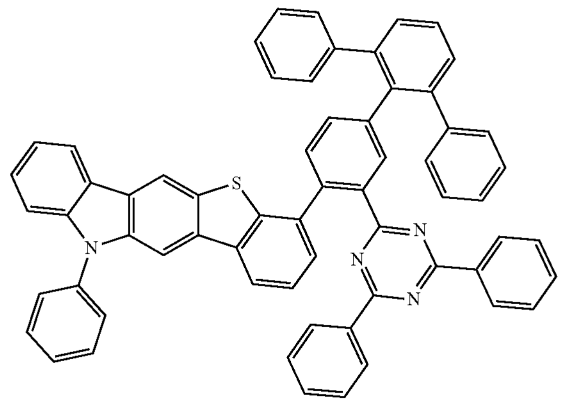
274
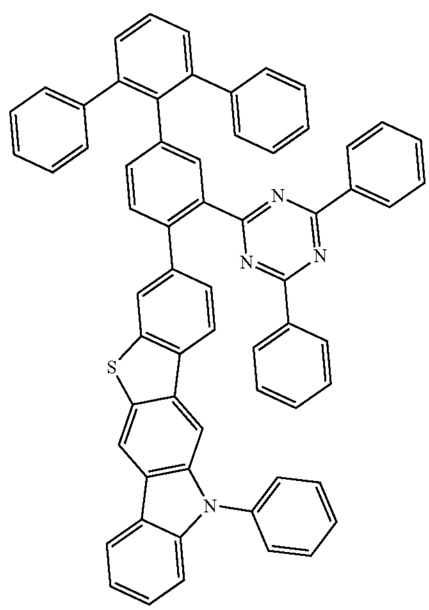

-continued
275
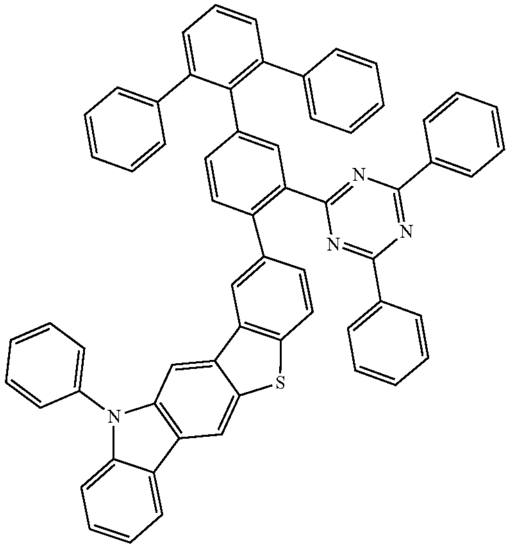
276
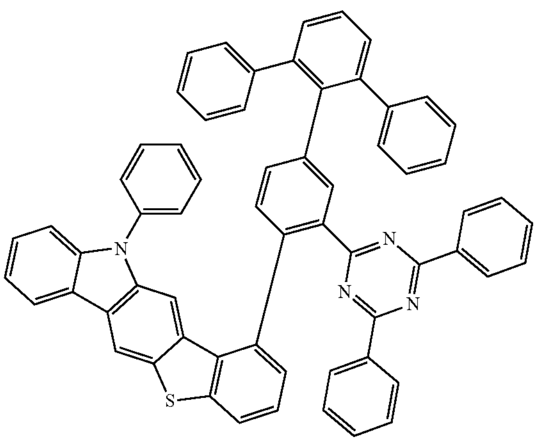
277
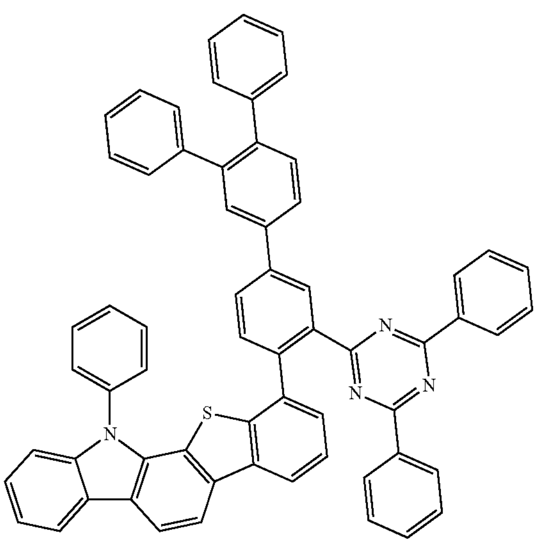
-continued
278
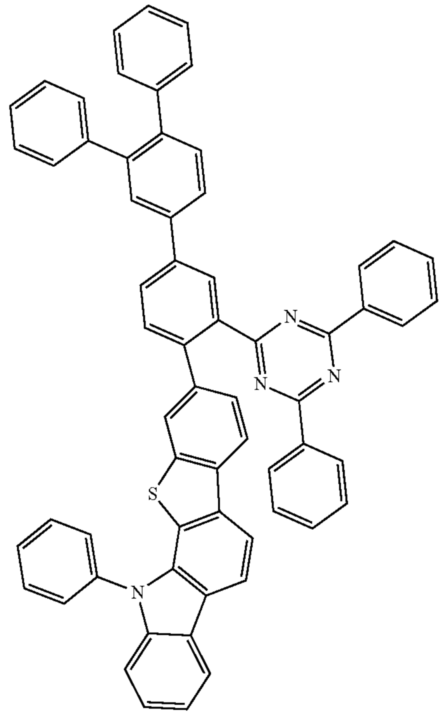
279
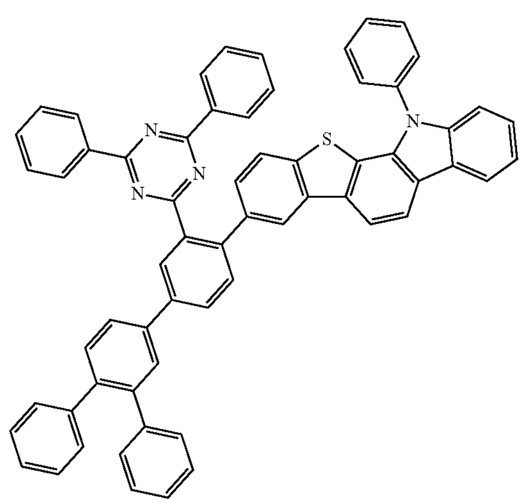

-continued
280
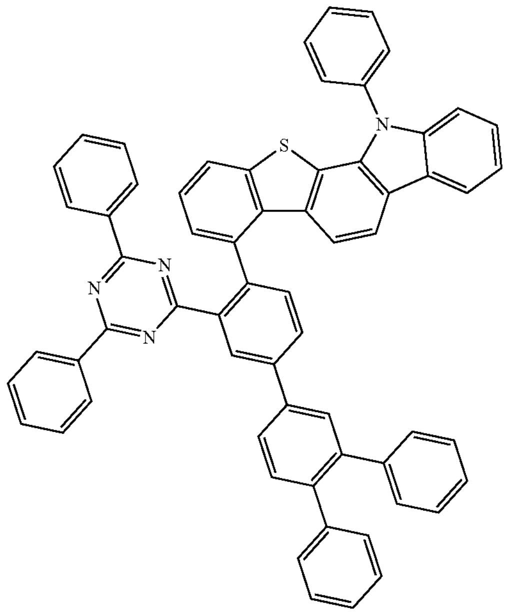
281
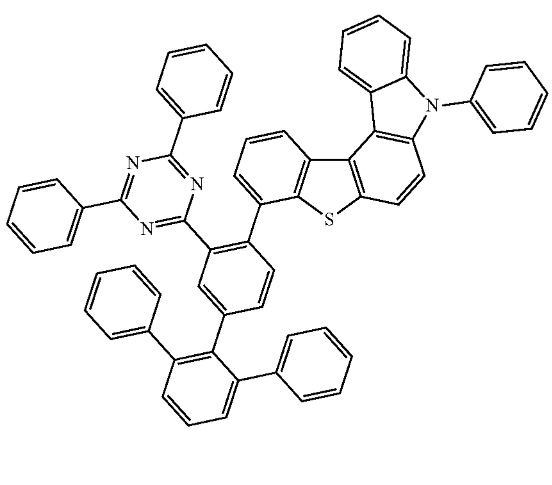
-continued
282
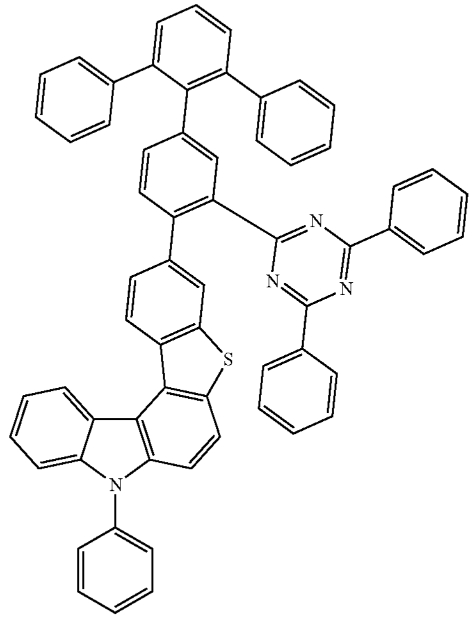
283
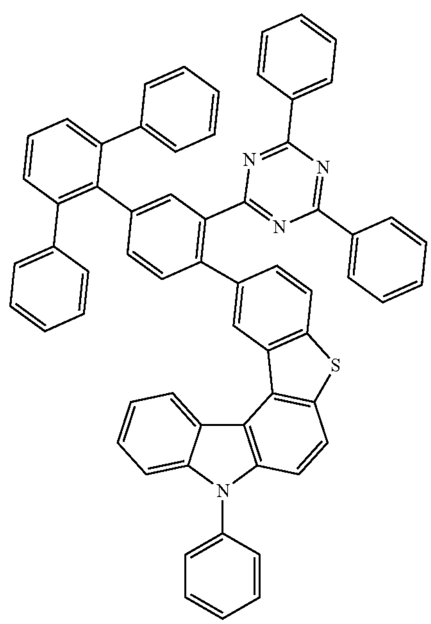

-continued
284
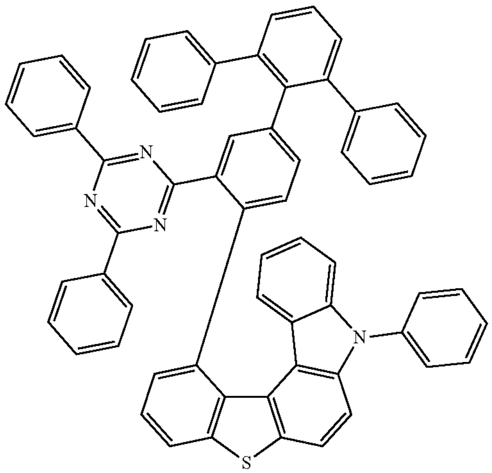
285
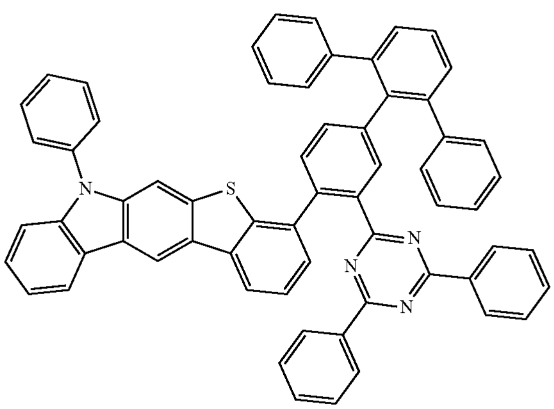
286
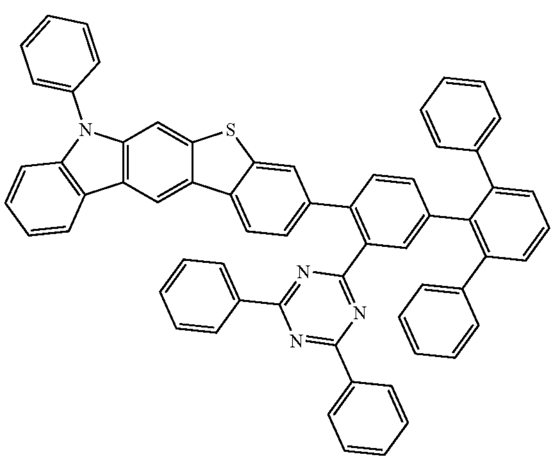
-continued
287
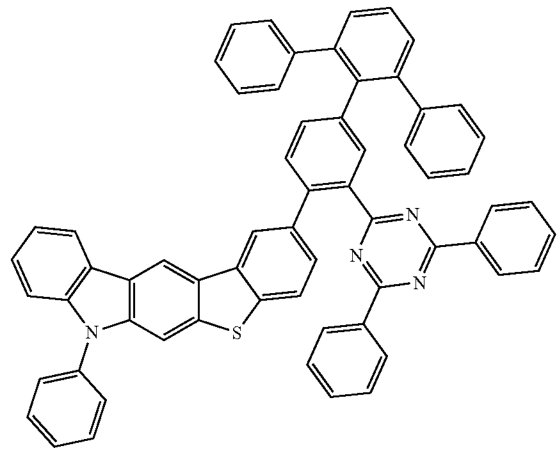
288
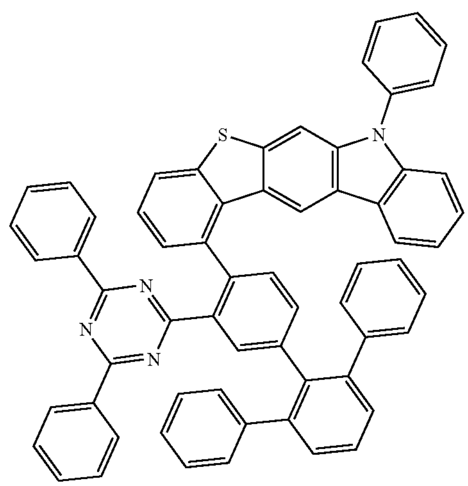
289
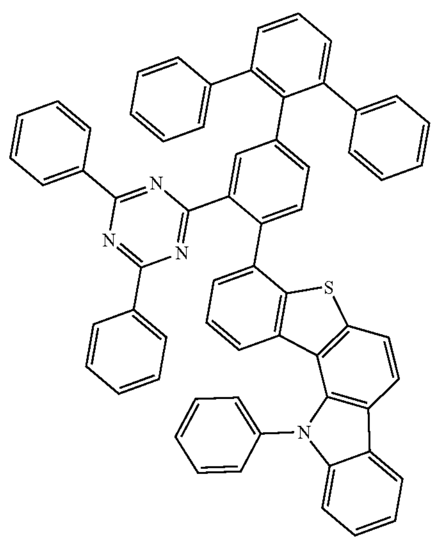

-continued
290
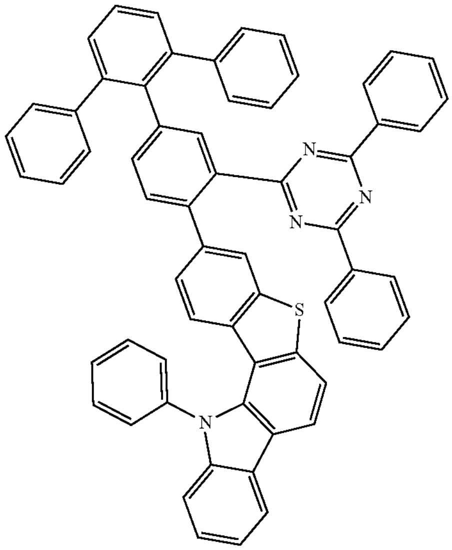
291
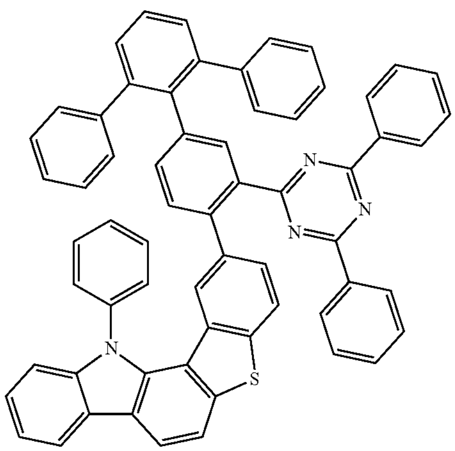
292
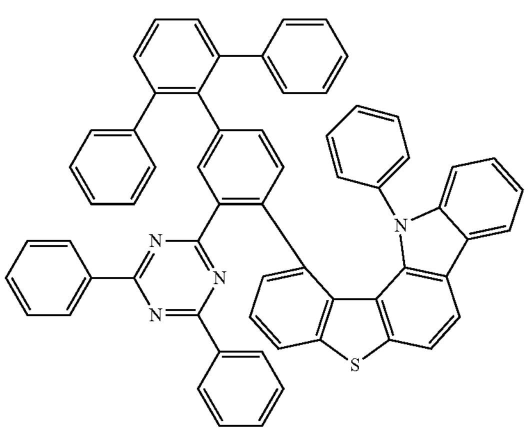
-continued
293
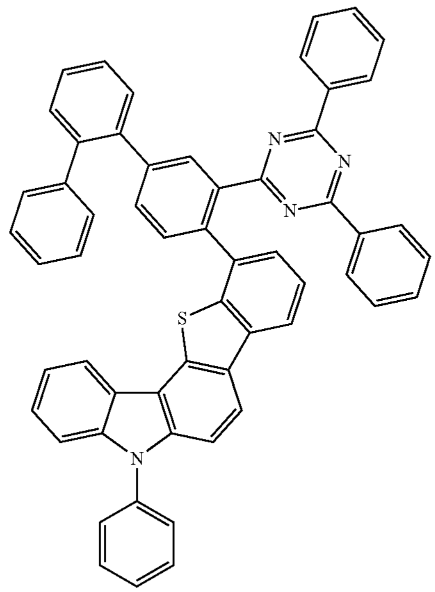
294
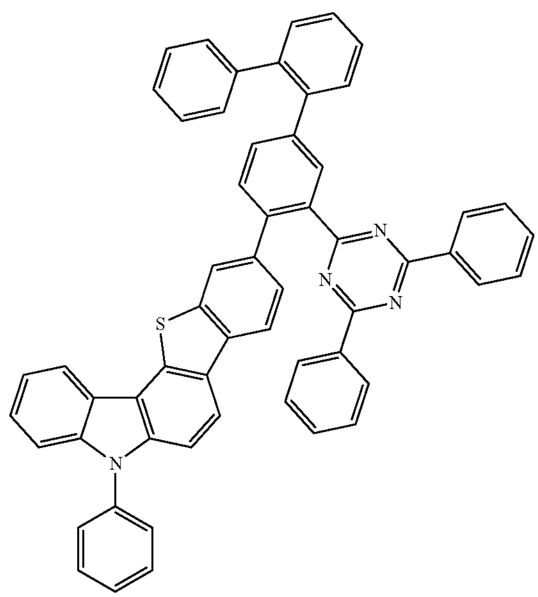
295
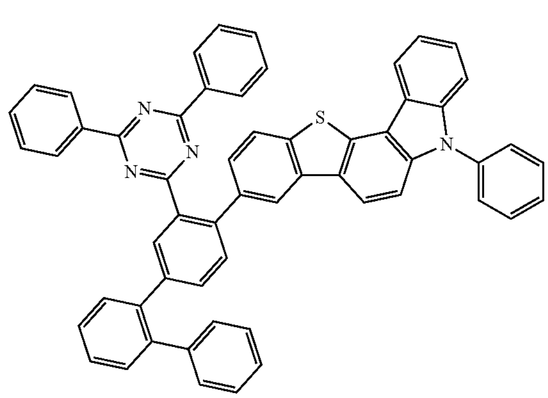

-continued
296
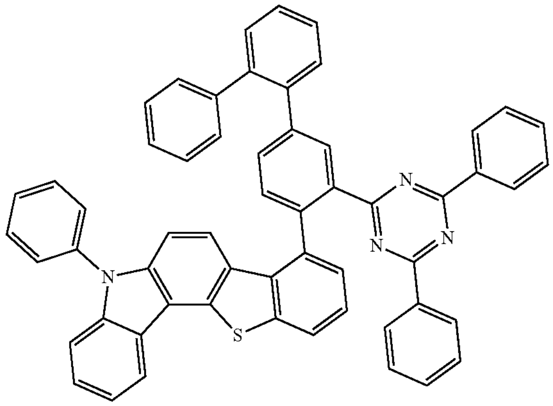
297
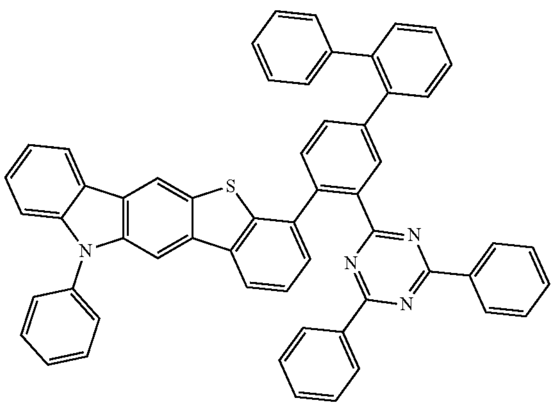
298
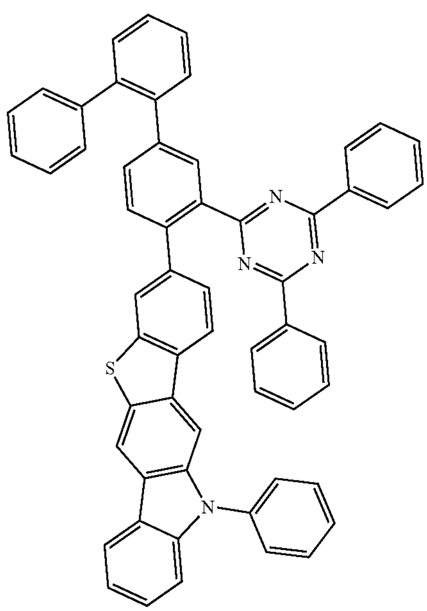
-continued
299
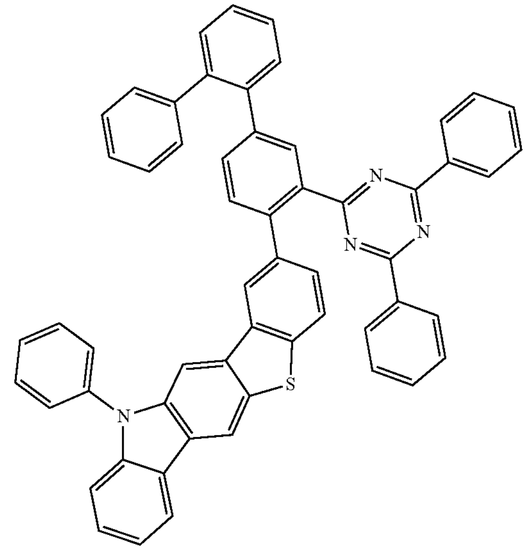
300
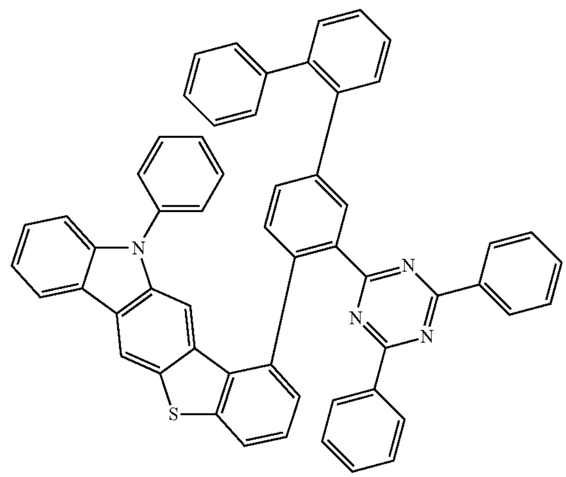
301
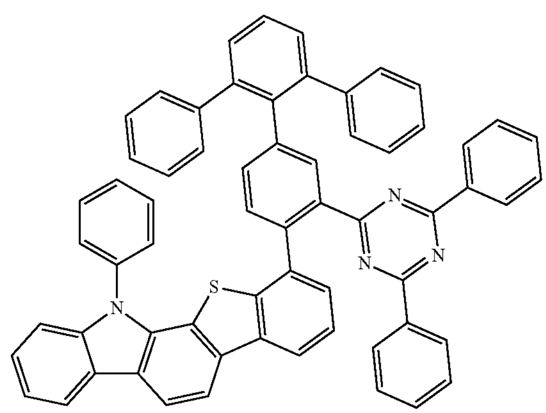

-continued
302
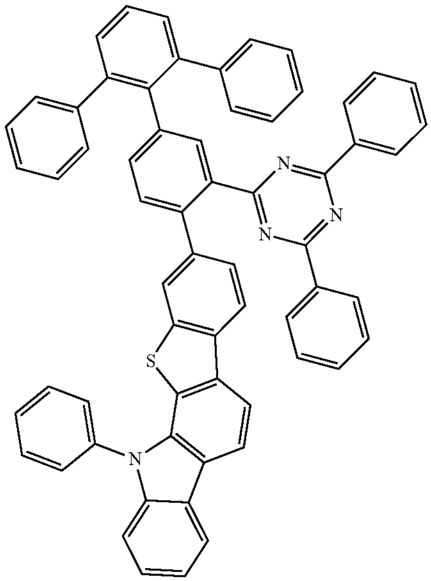
303
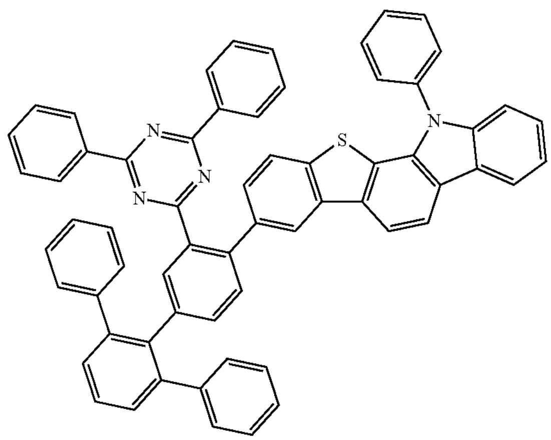
304
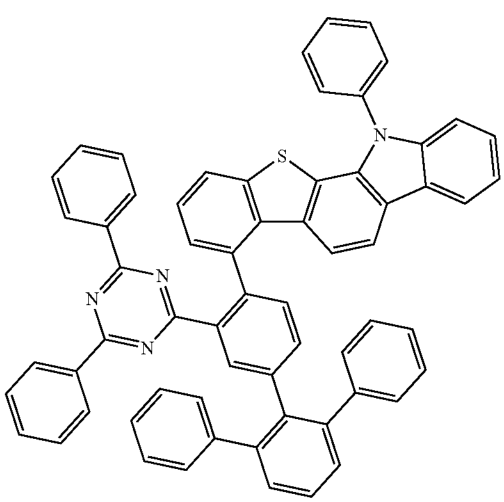
-continued
305
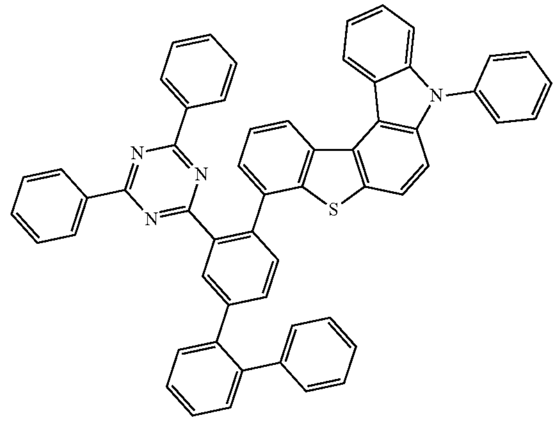
306
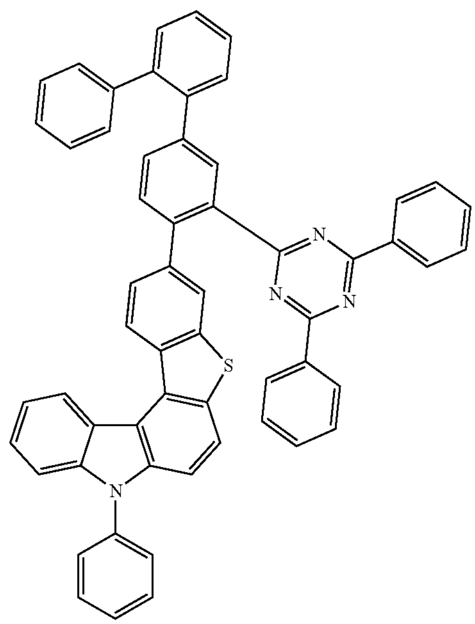

307
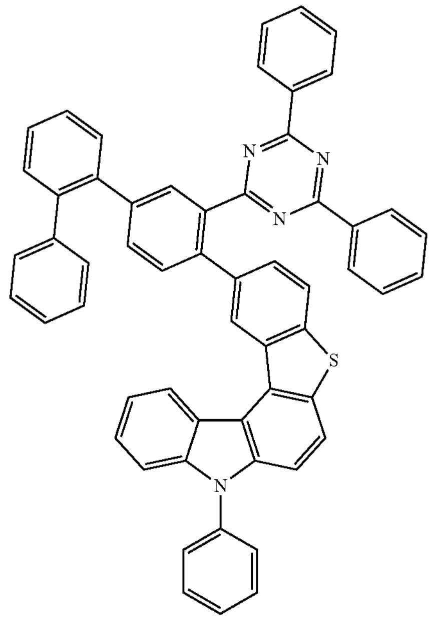
308
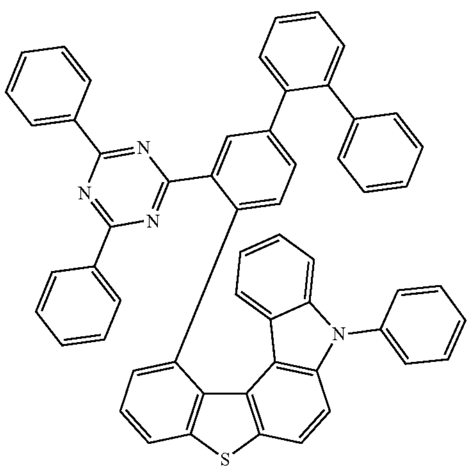
309
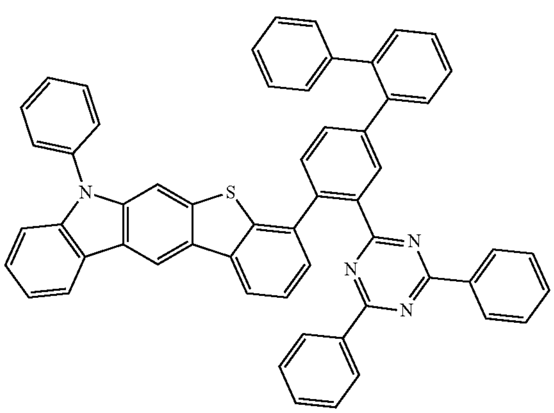
310
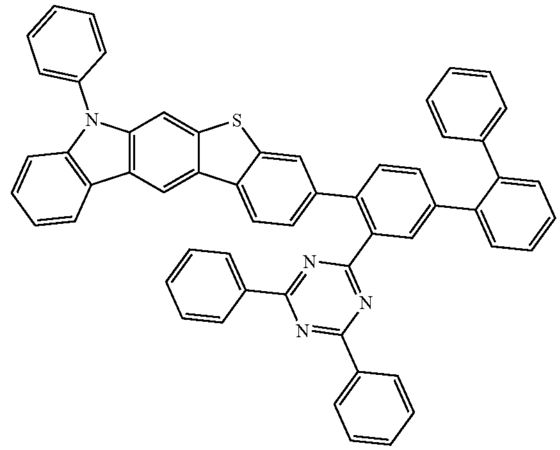
311
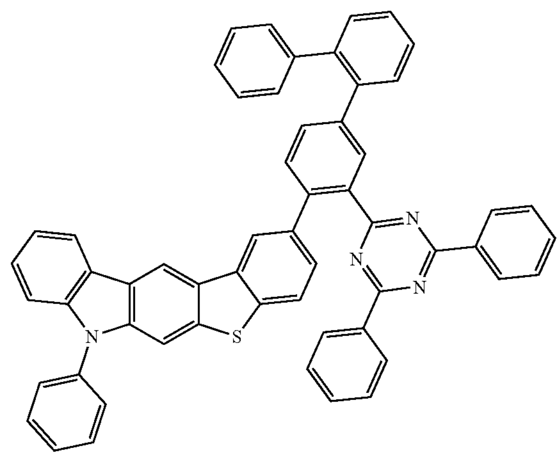
312
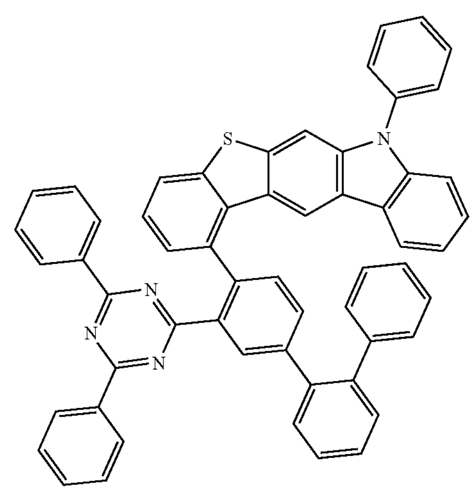

313
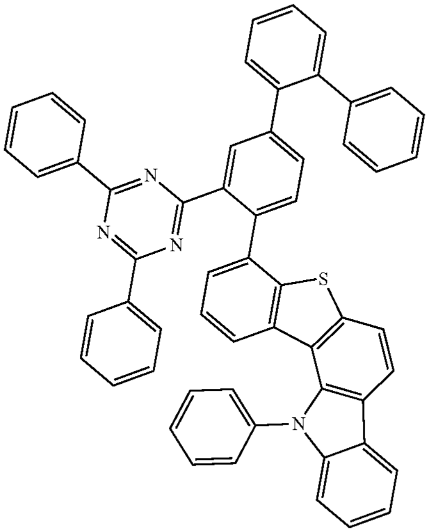
314
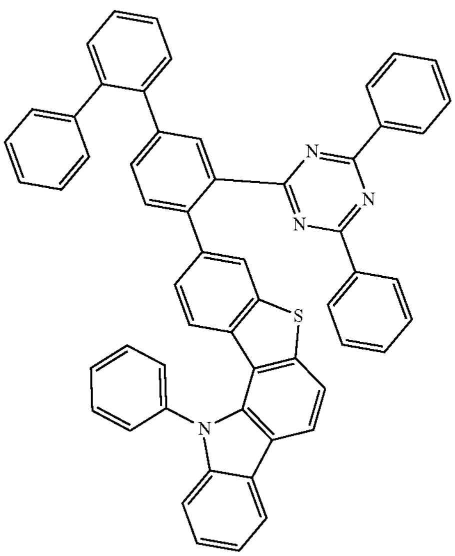
315
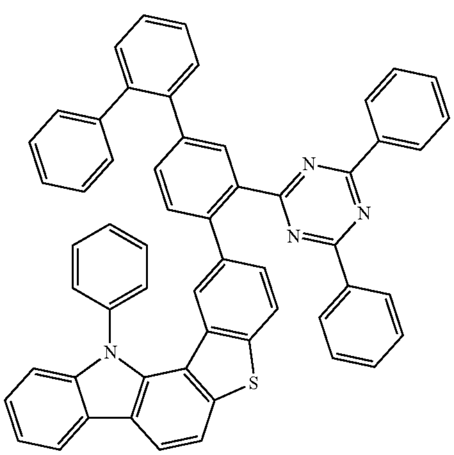
316
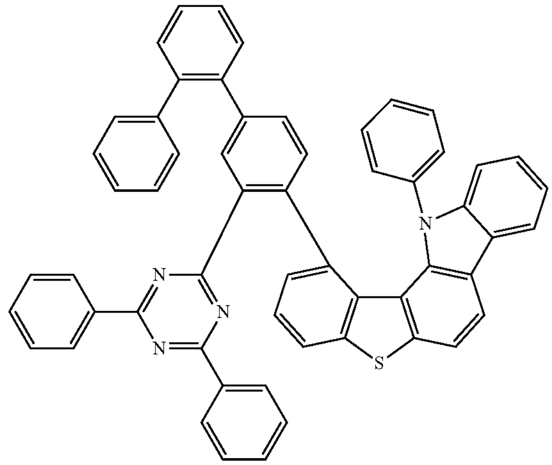
317
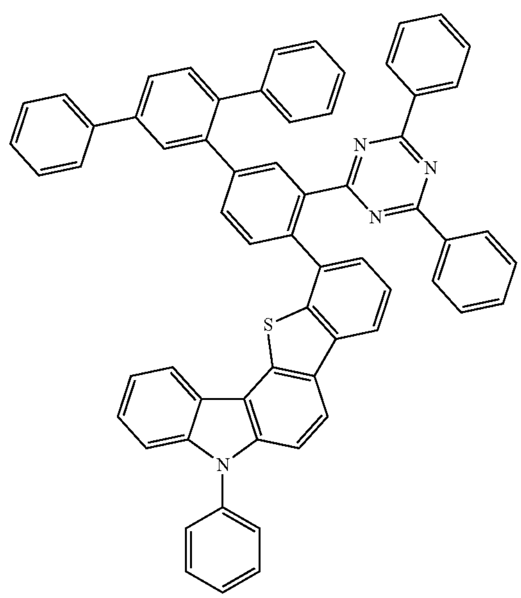

-continued
318
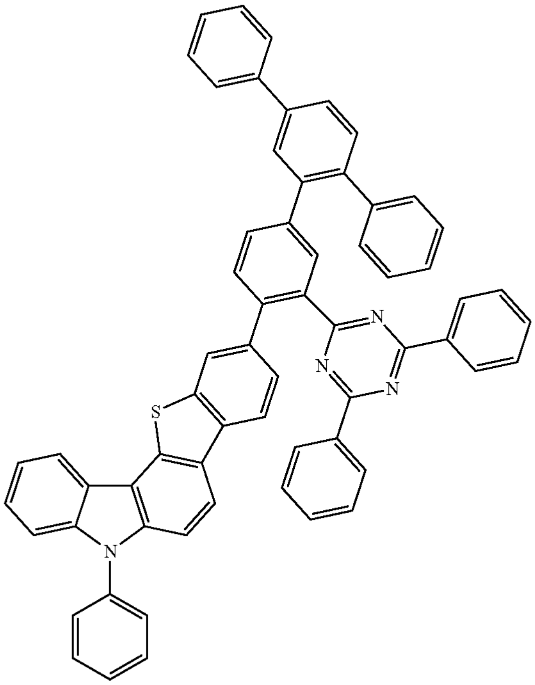
319
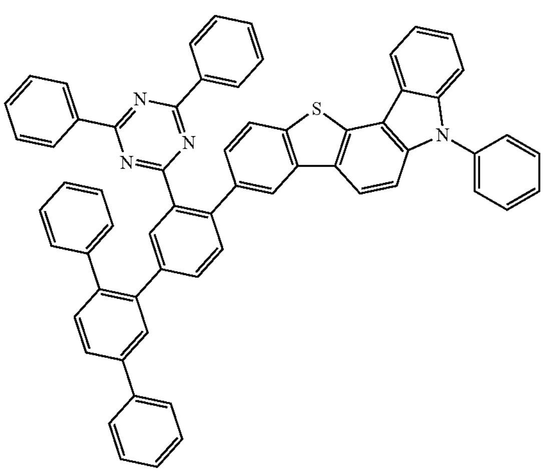
-continued
320
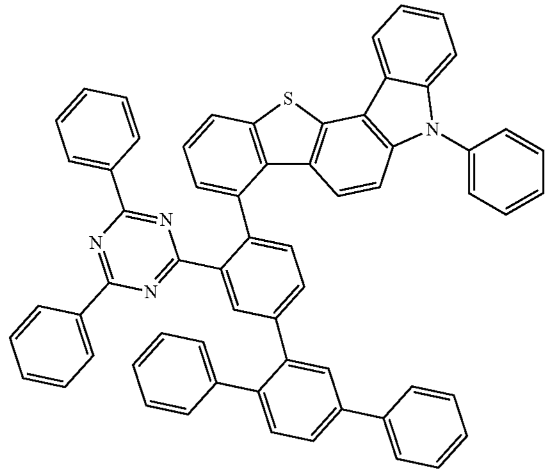
321
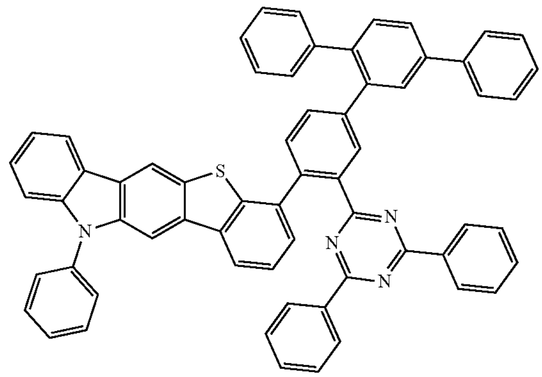
322
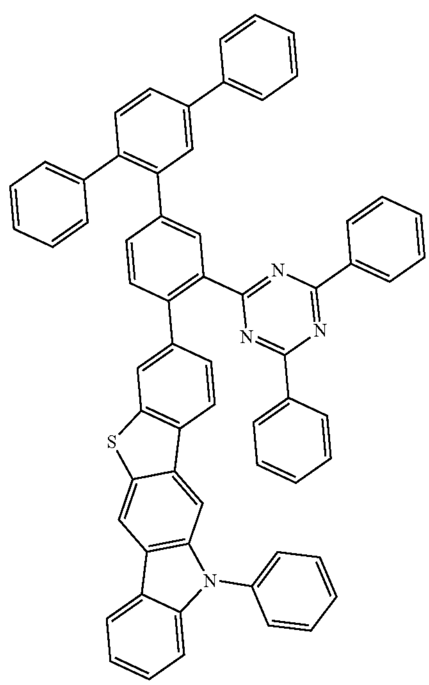

-continued
323
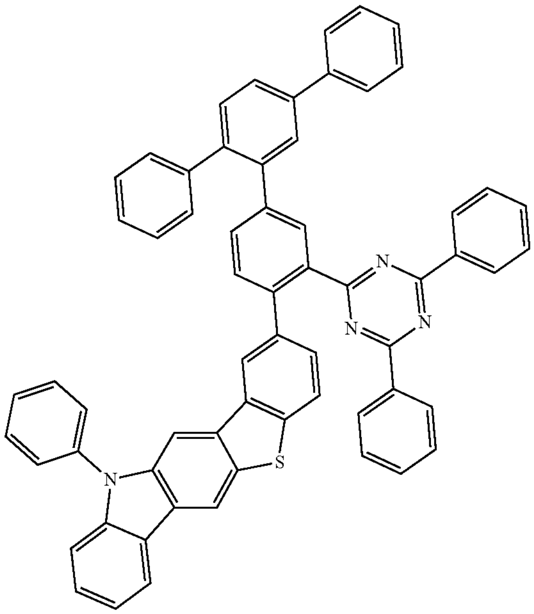
324
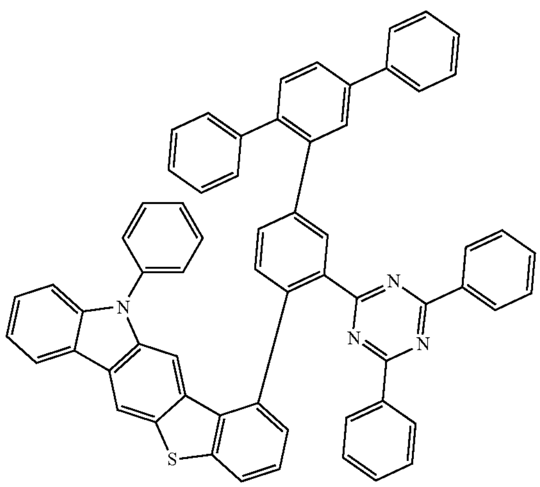
325
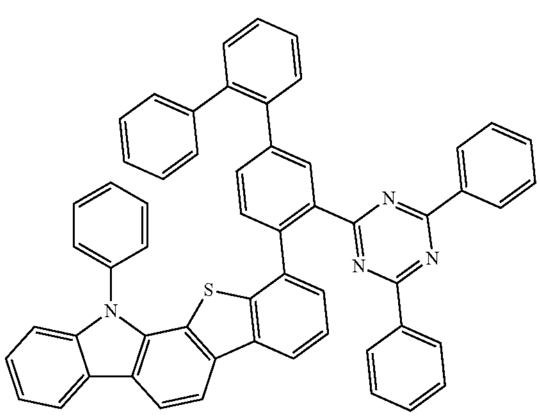
-continued
326
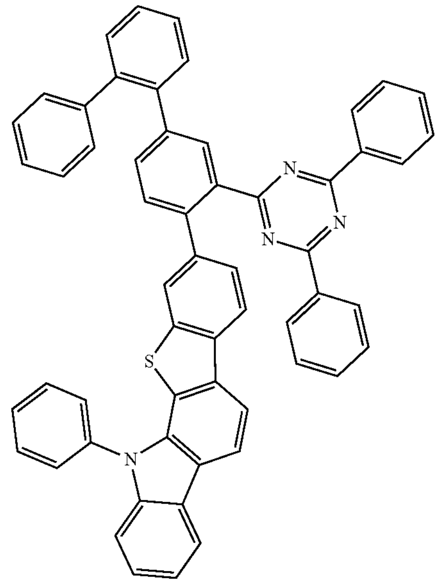
327
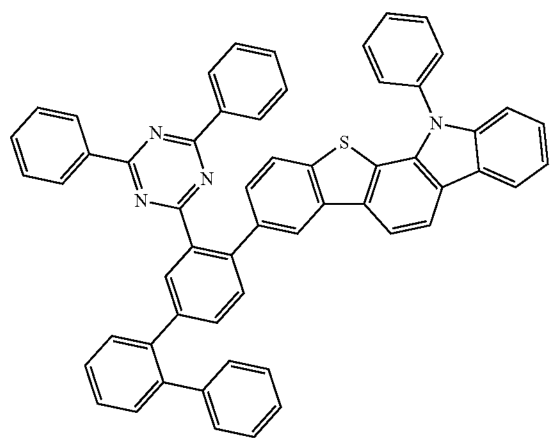
328
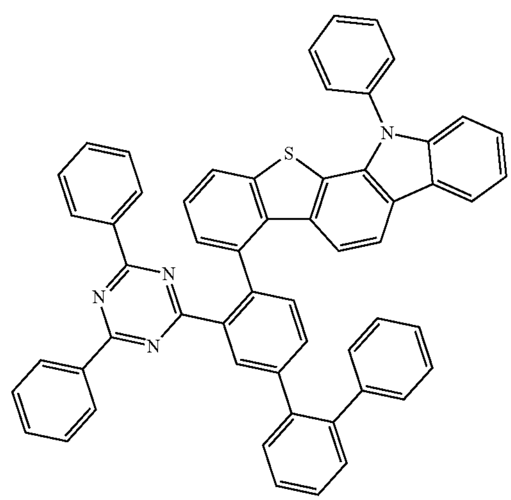

-continued
329
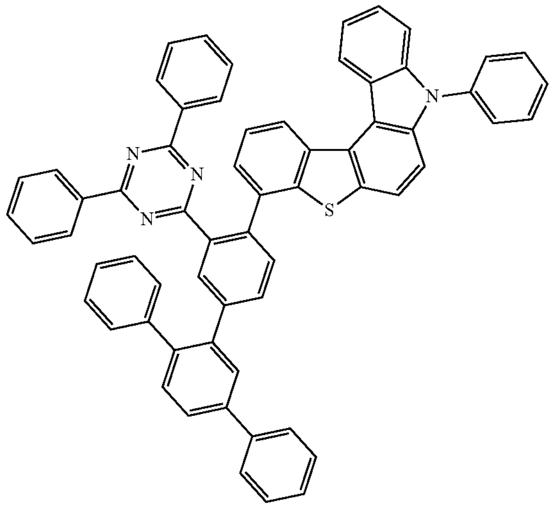
330
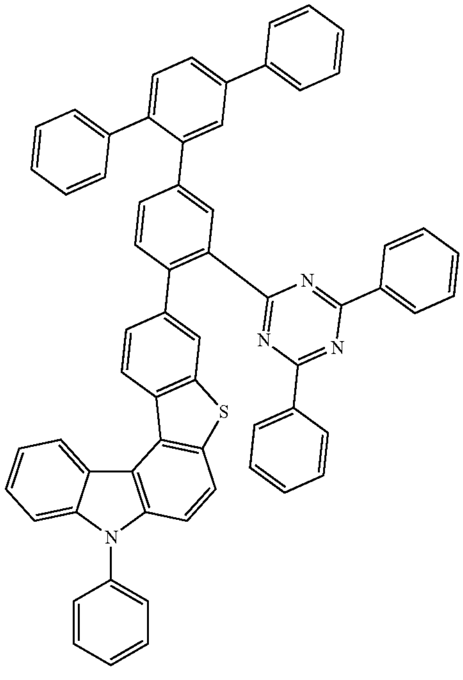
-continued
331
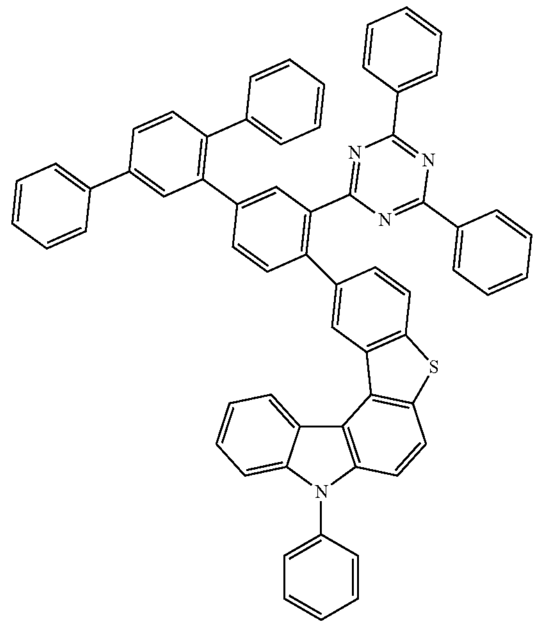
332
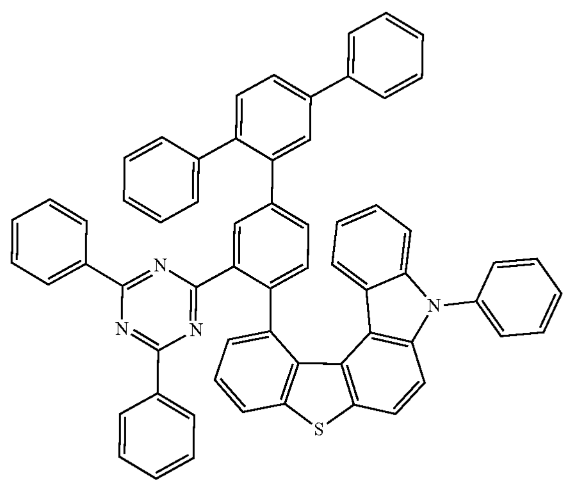
333
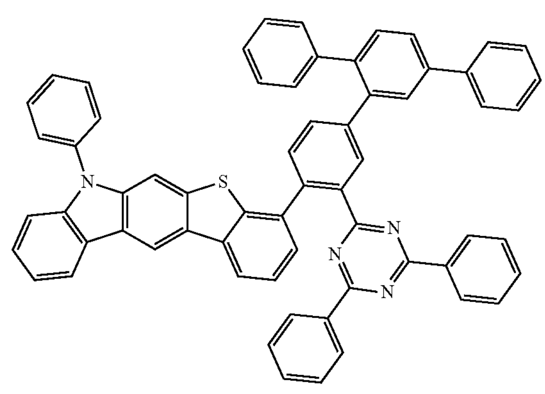

-continued
334
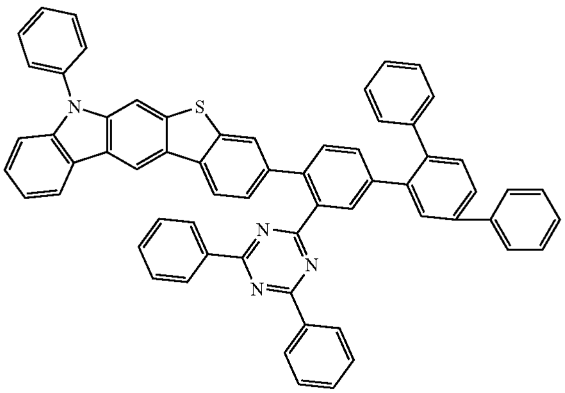
335
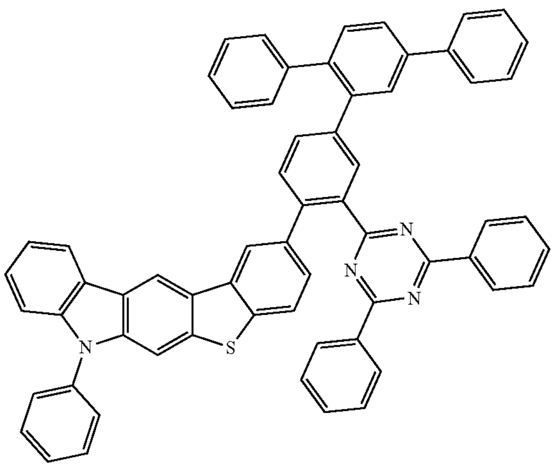
336
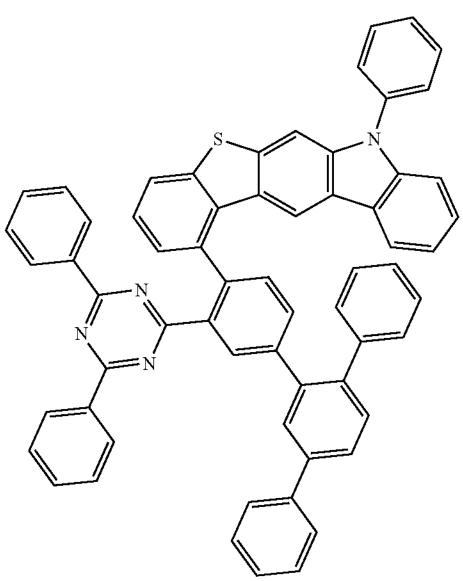
-continued
337
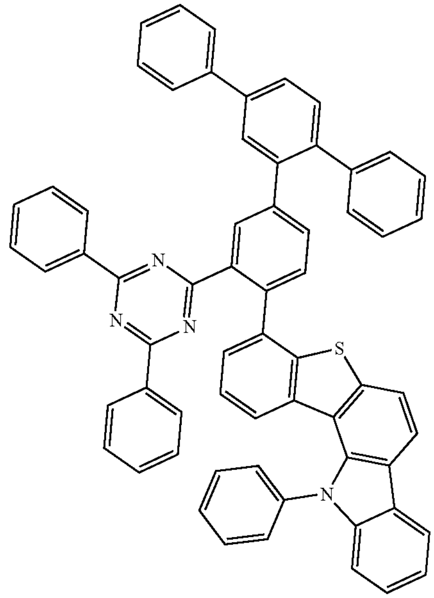
338
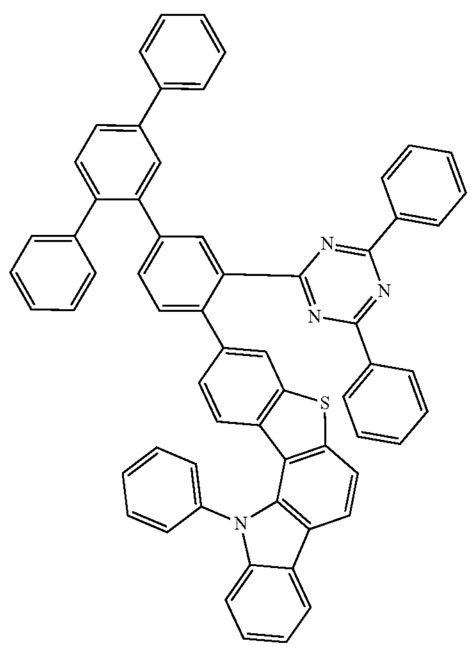

-continued
339
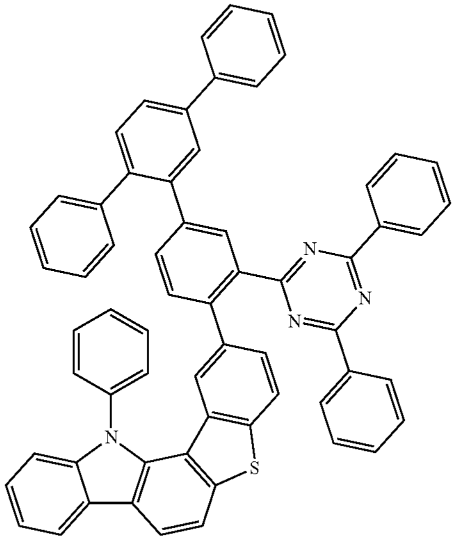
340
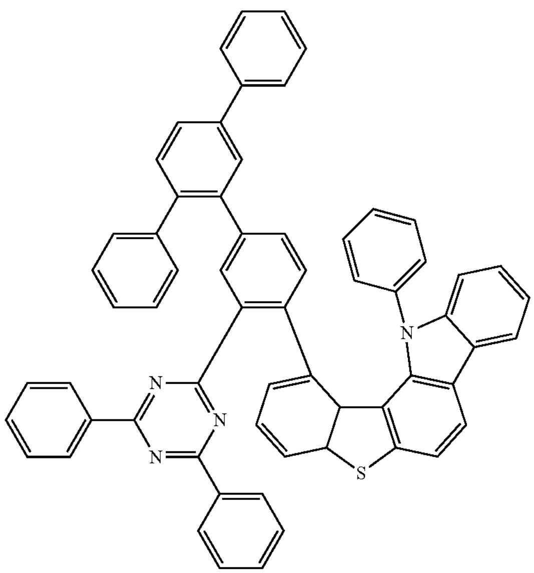
341
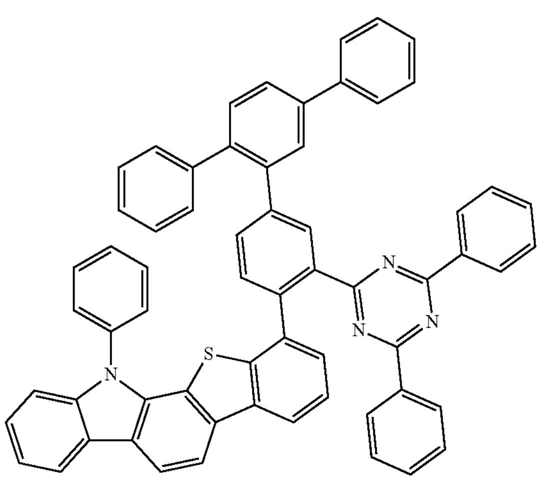
-continued
342
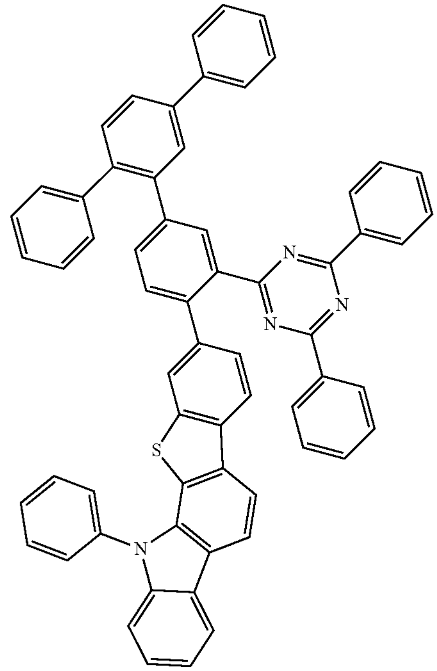
343
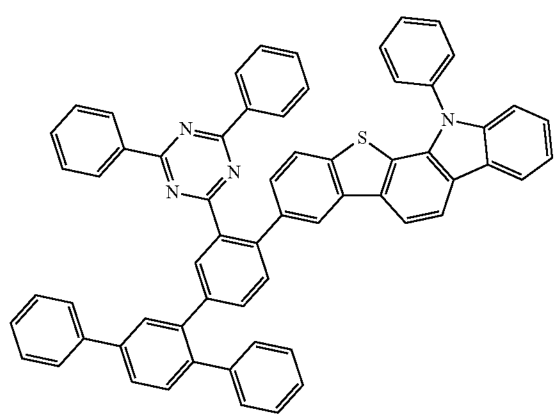

-continued
344
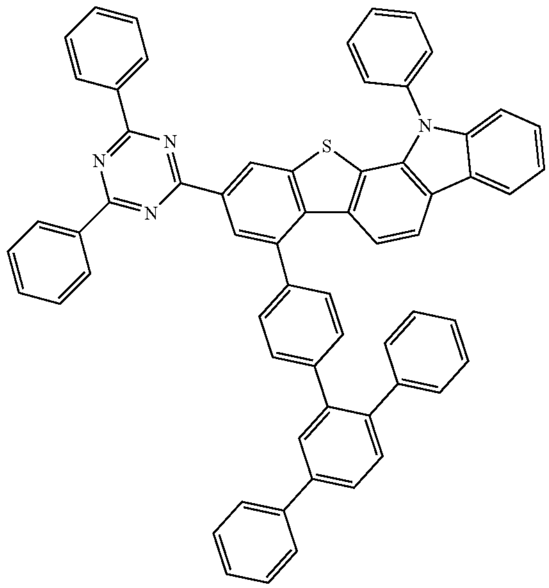
345
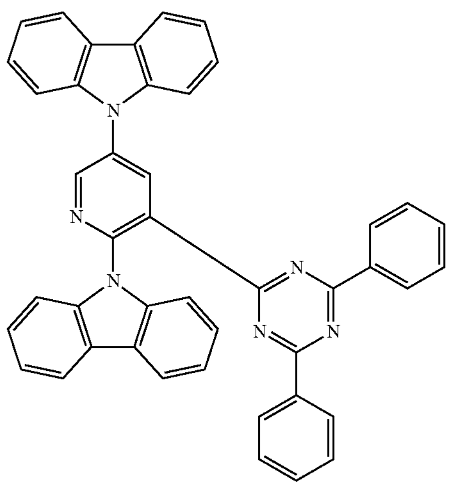
346
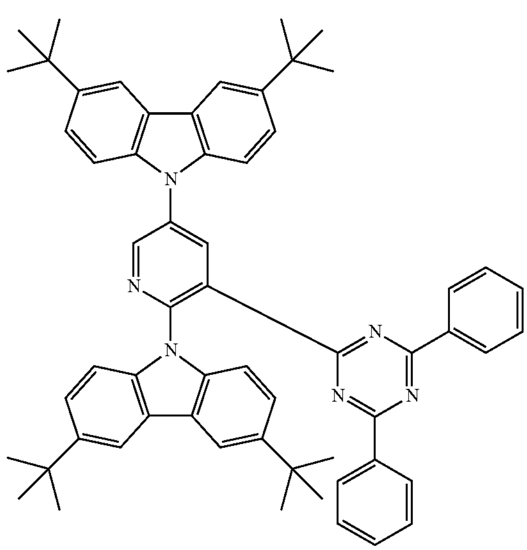
-continued
347
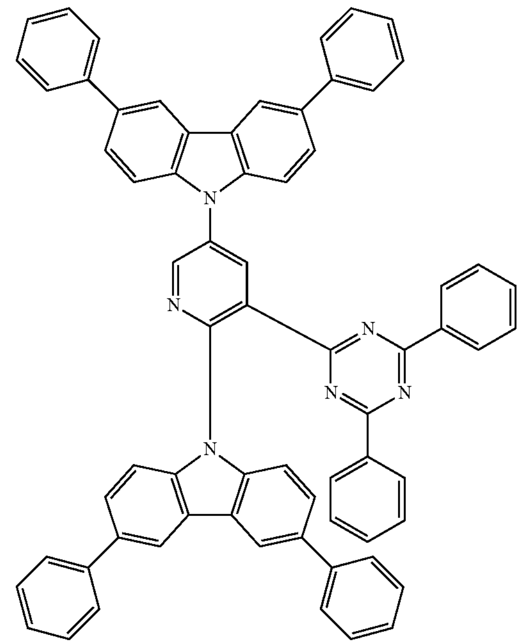
348
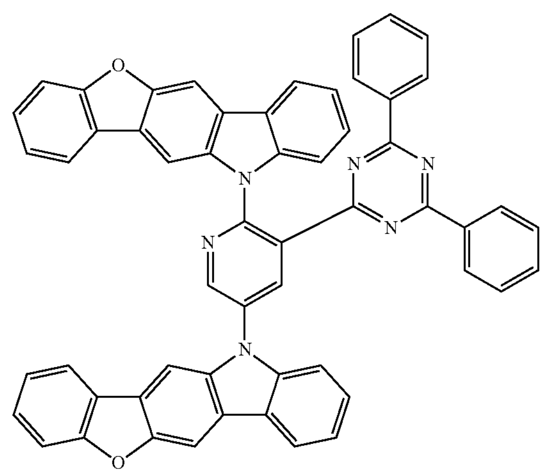
349
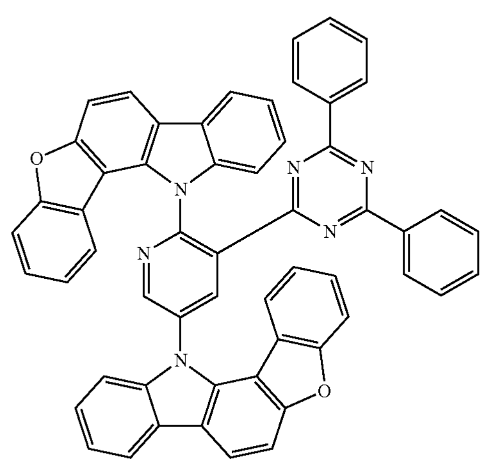

-continued
350
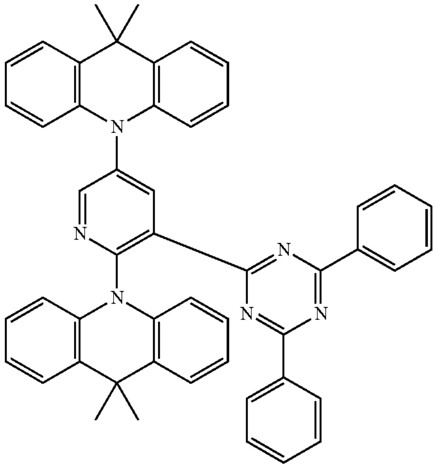
351
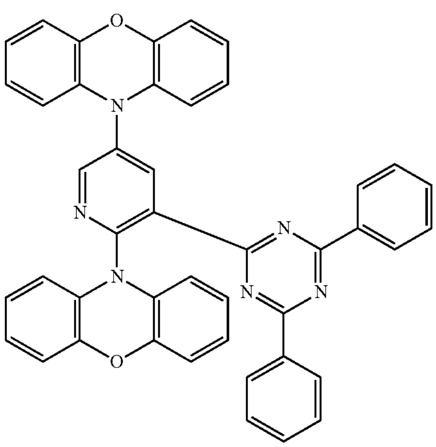
352
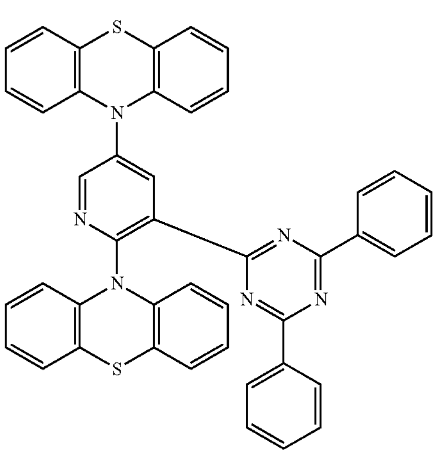
-continued
353
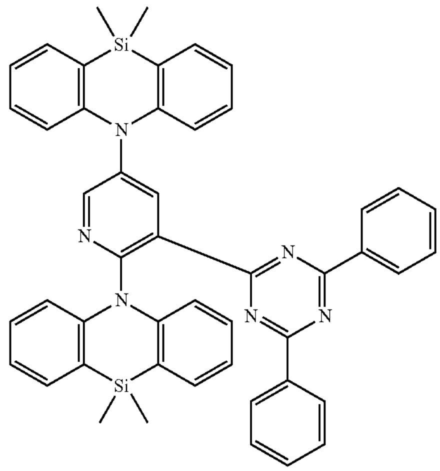
354
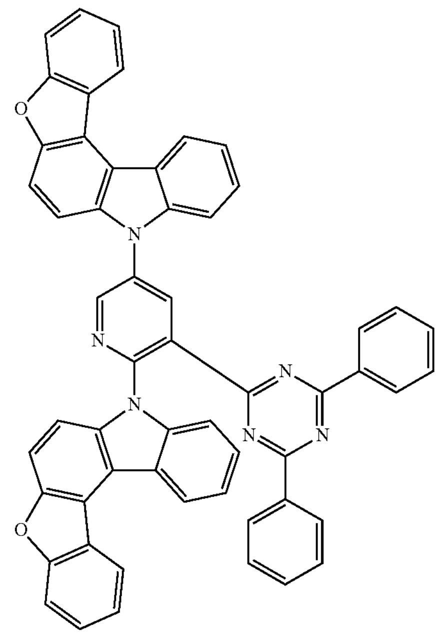
355
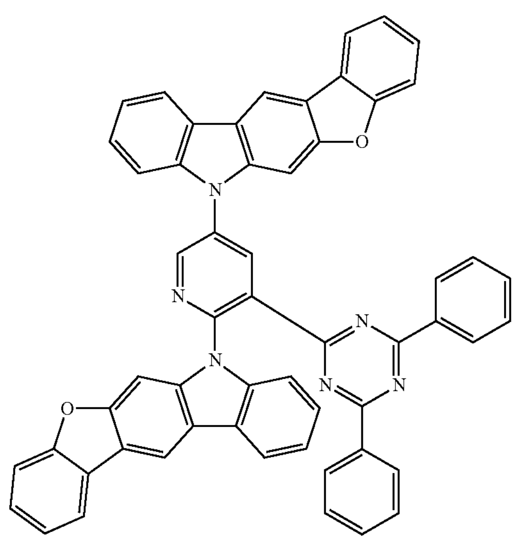

-continued
356
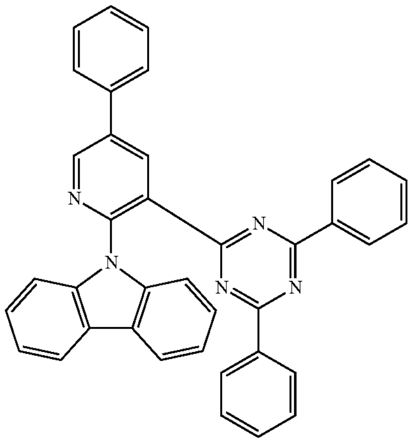
357
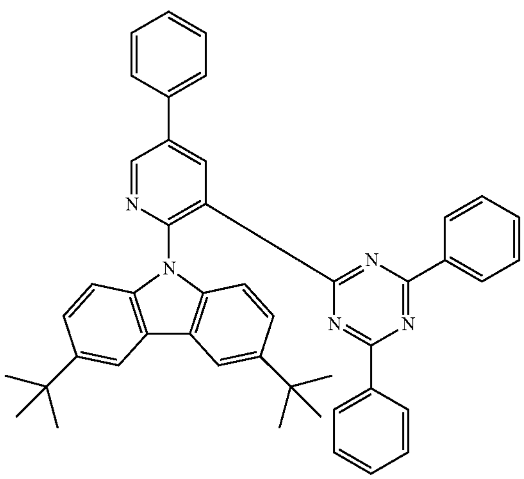
358
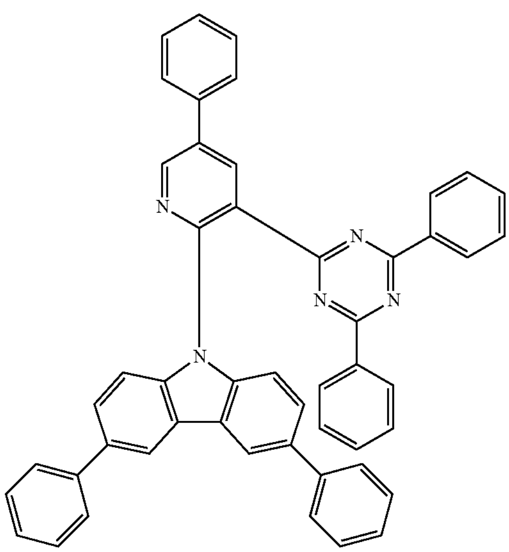
-continued
359
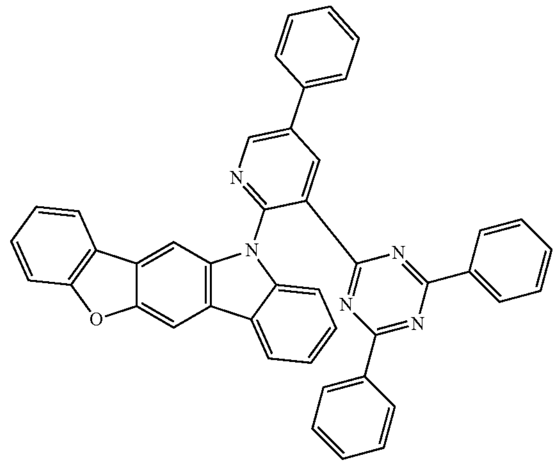
360
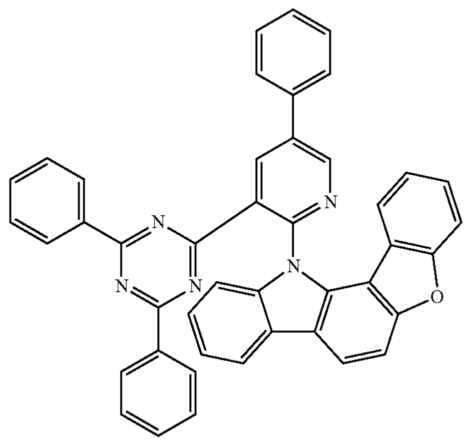
361
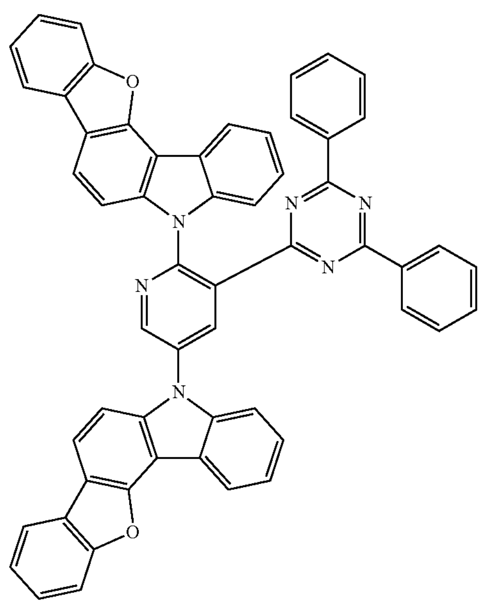

362
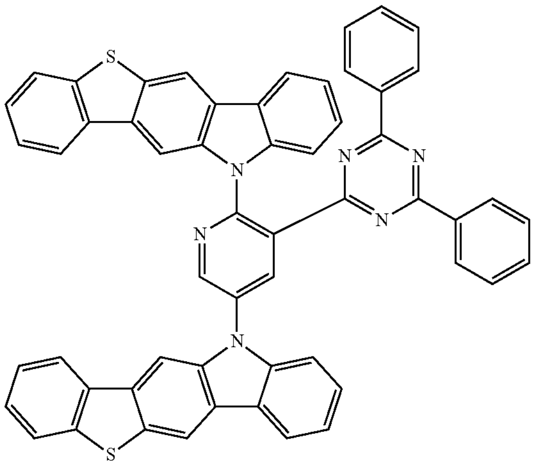
363
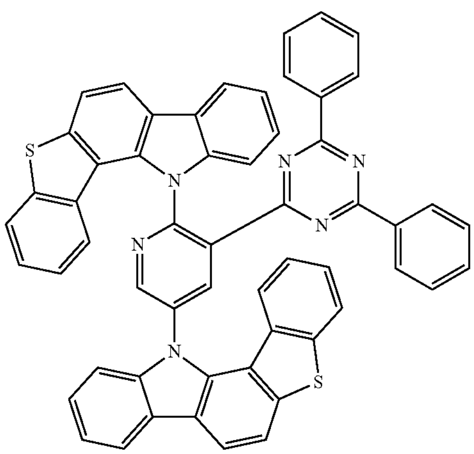
364
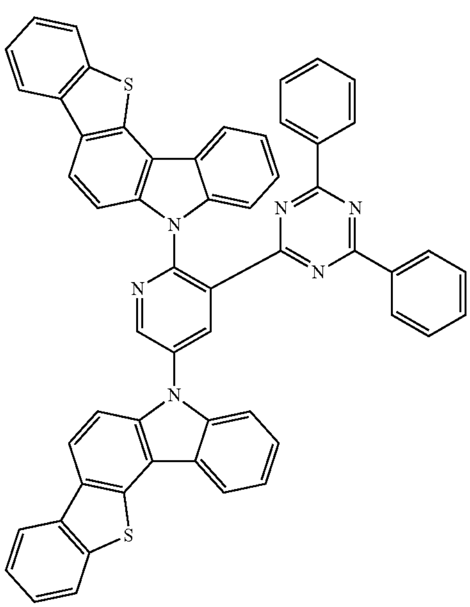
365
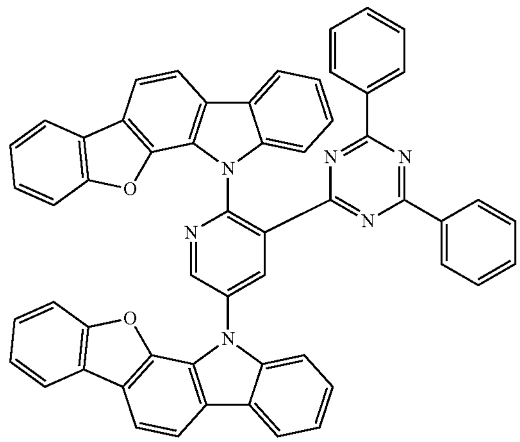
366
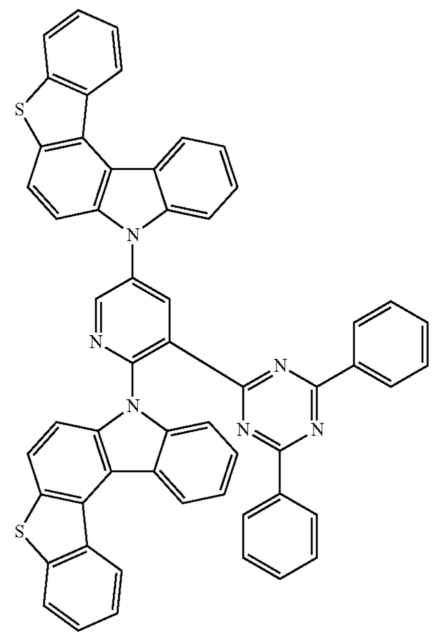
367
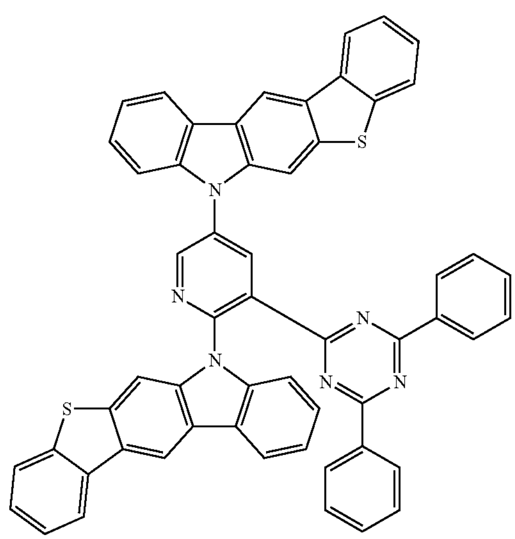

-continued
368
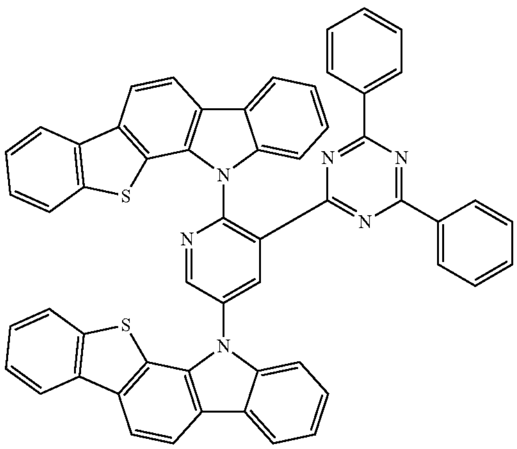
369
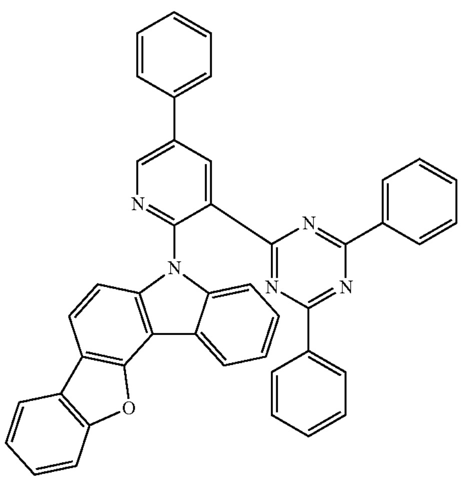
370
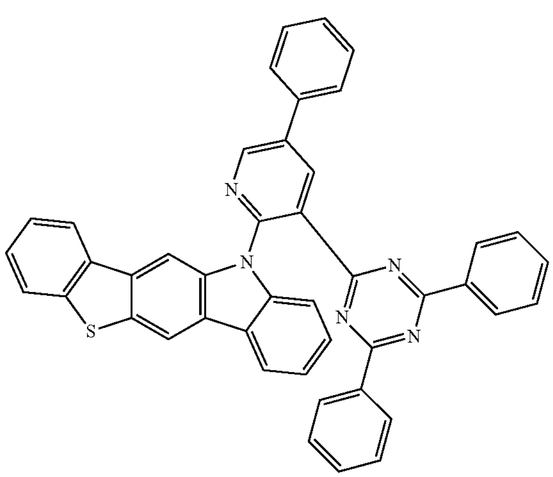
-continued
371
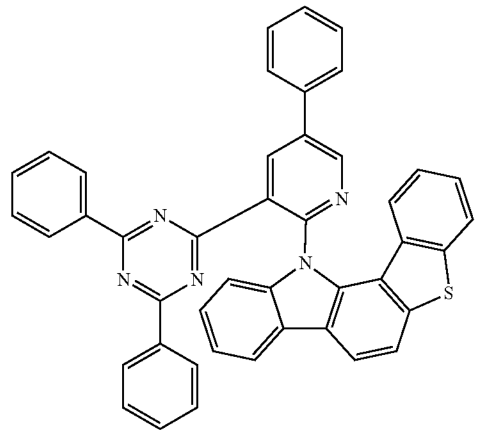
372
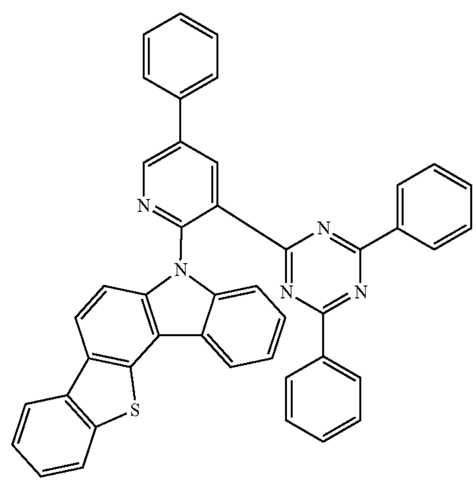
373
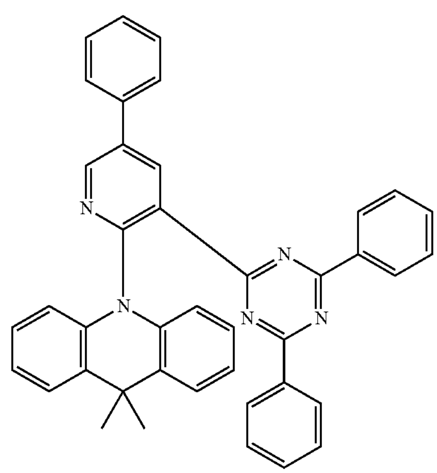

-continued
374
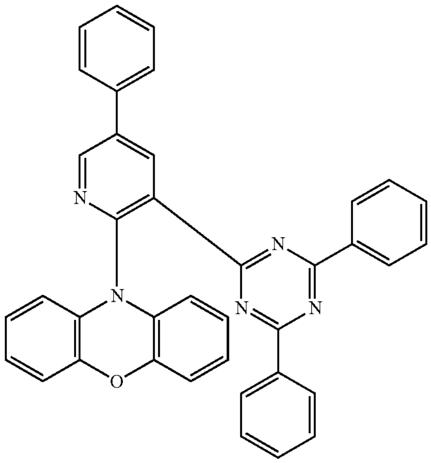
375
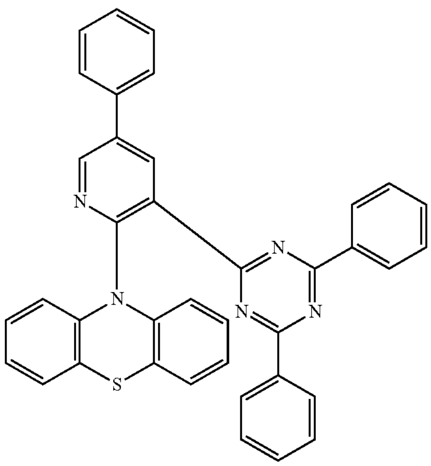
376
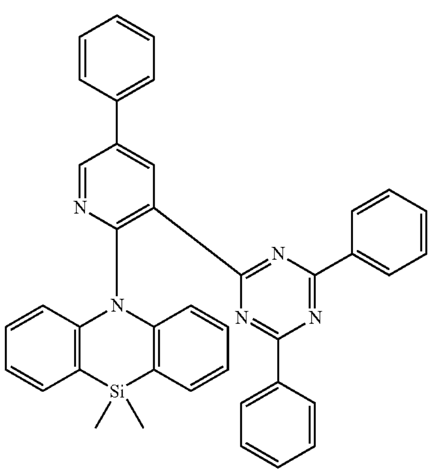
-continued
377
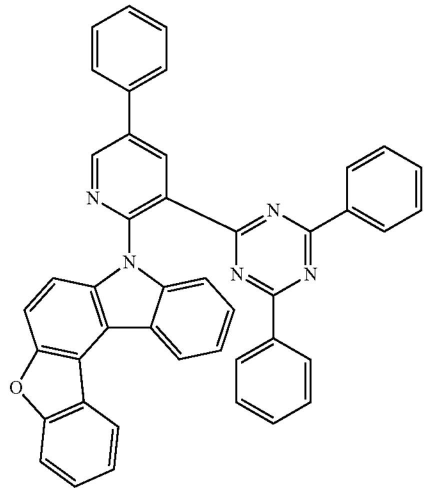
378
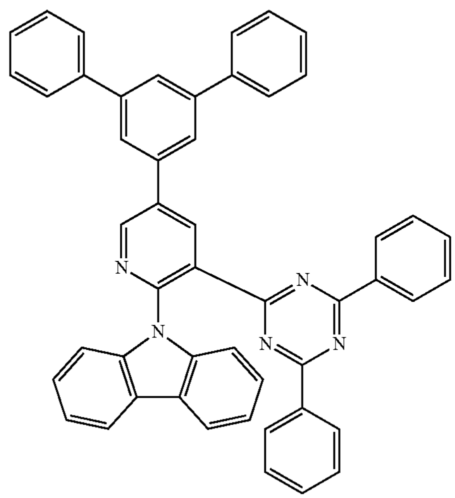
379
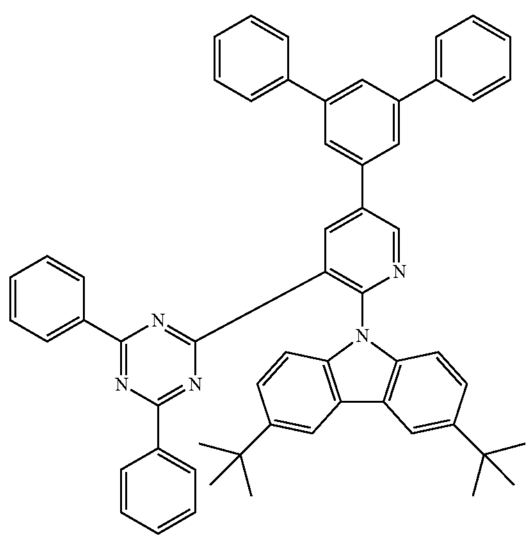

-continued
380
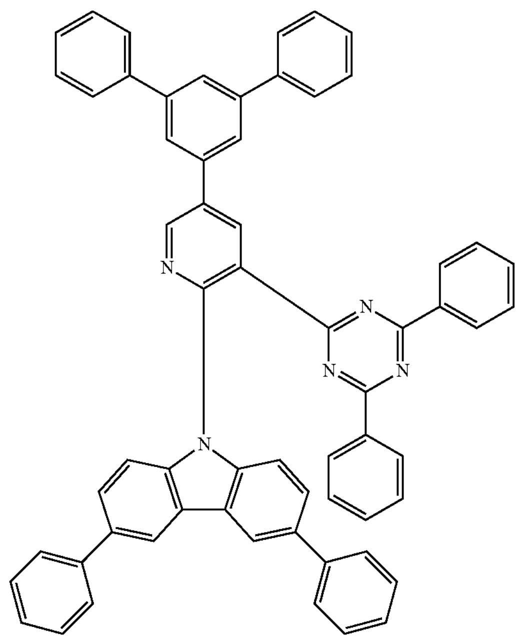
381
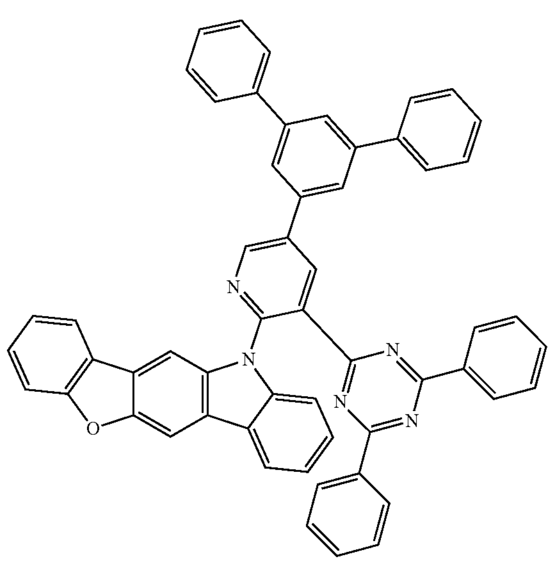
-continued
382
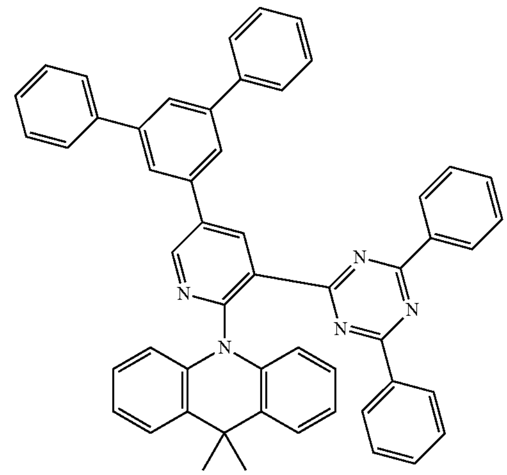
383
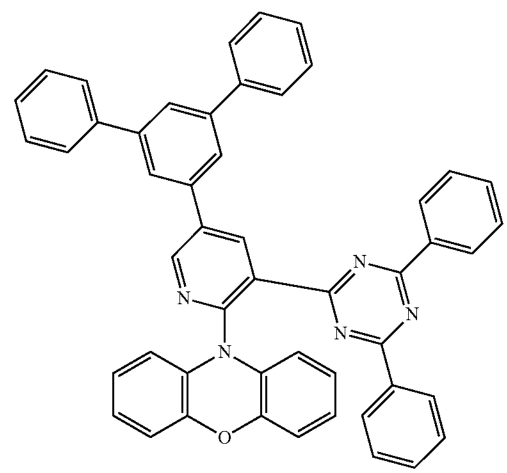
384
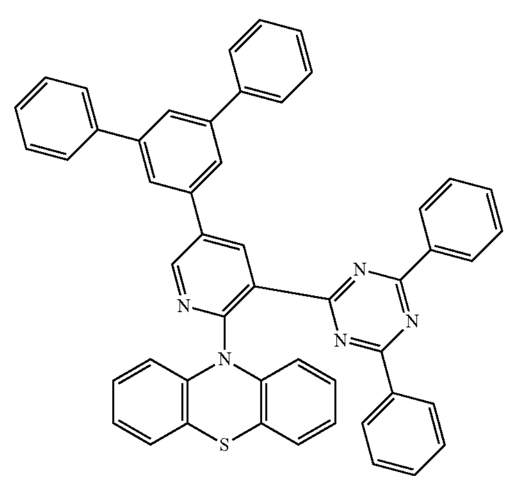

-continued
385
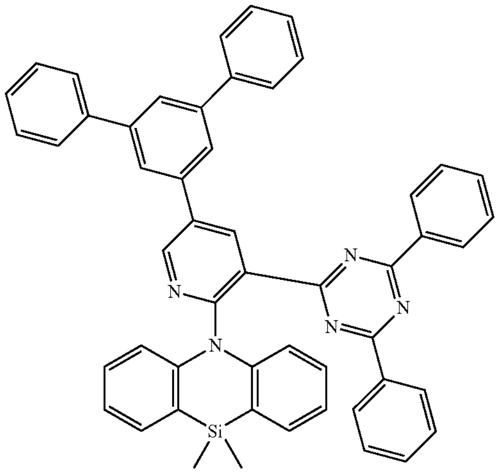
386
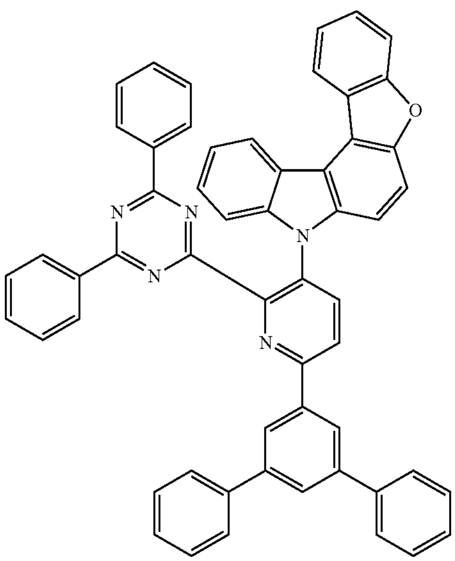
387
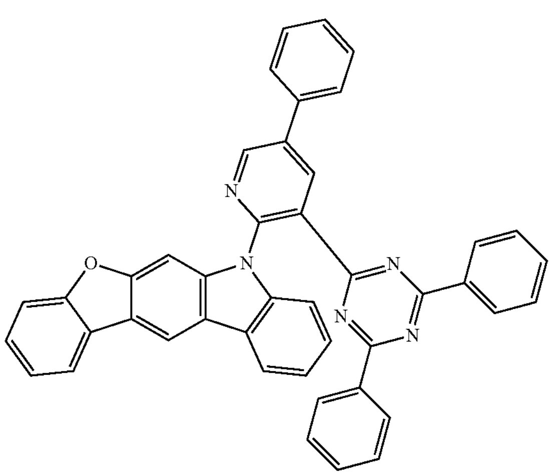
-continued
388
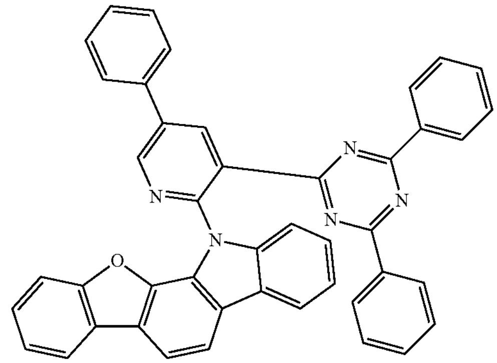
389
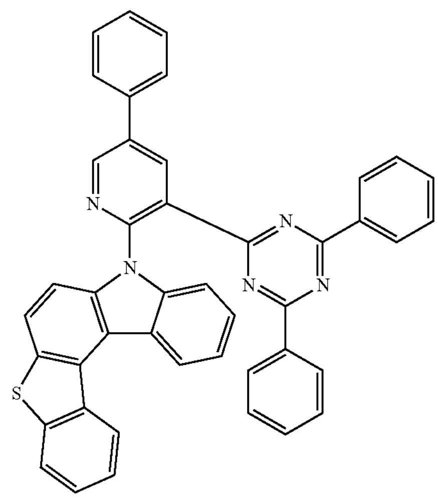
390
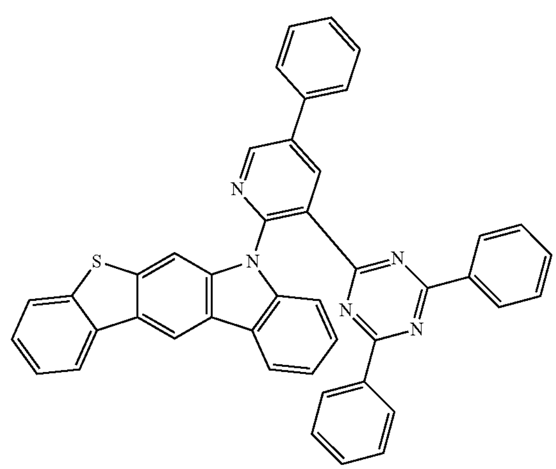

-continued
391
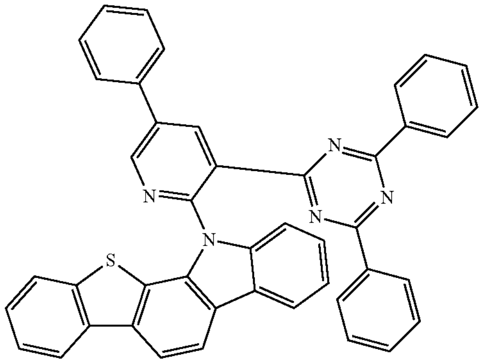
392
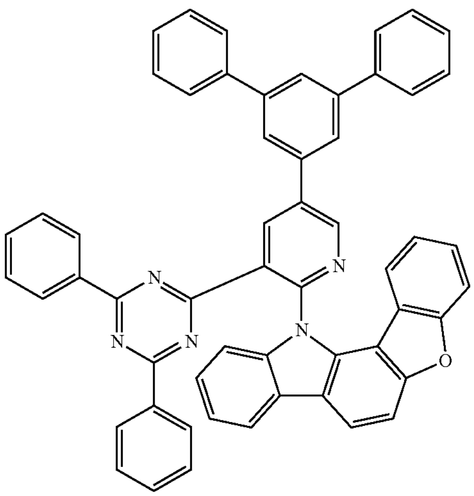
393
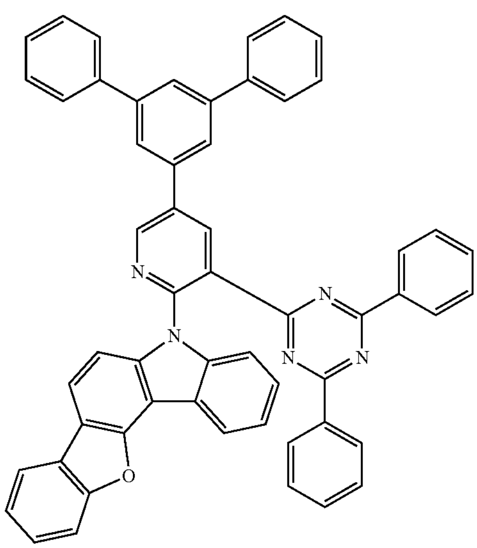
-continued
394
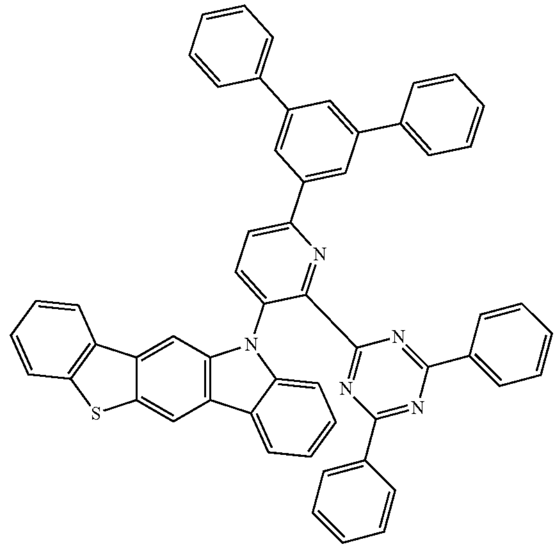
395
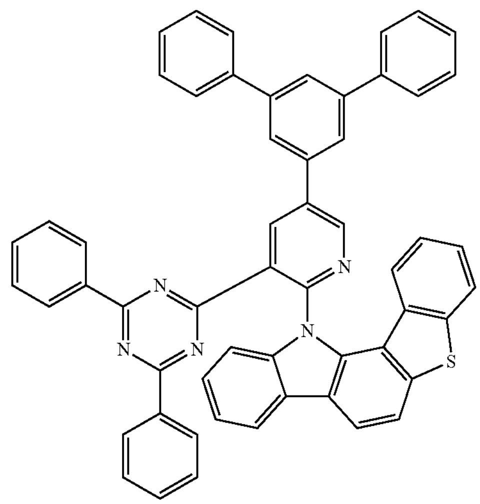
396
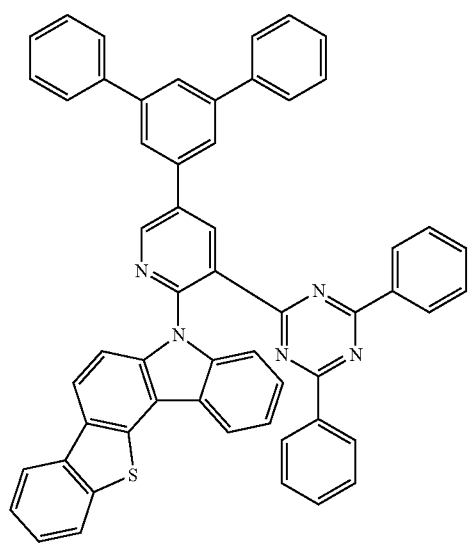

-continued
397
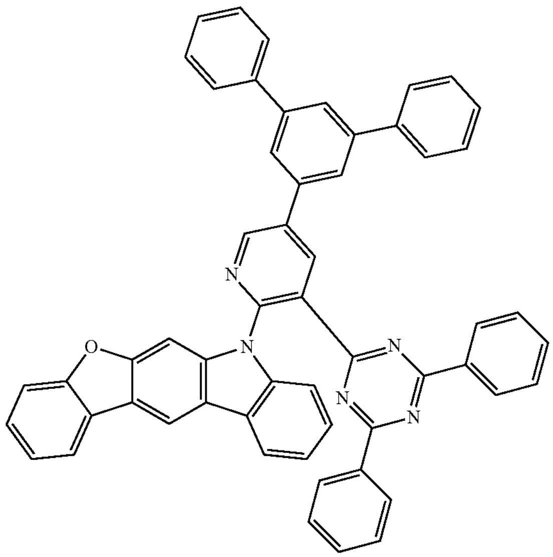
398
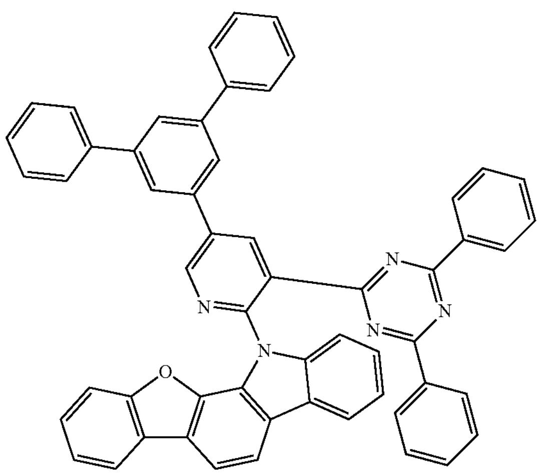
399
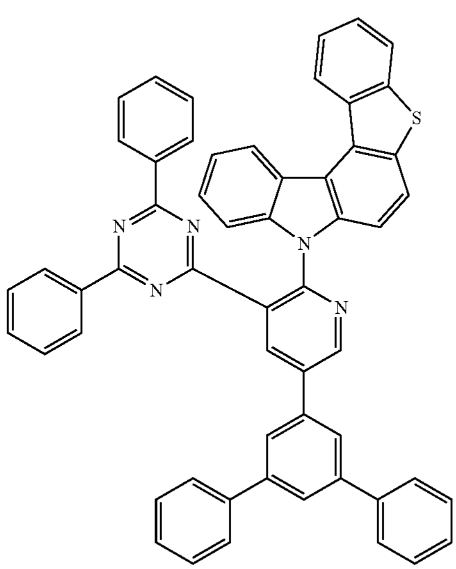
-continued
400
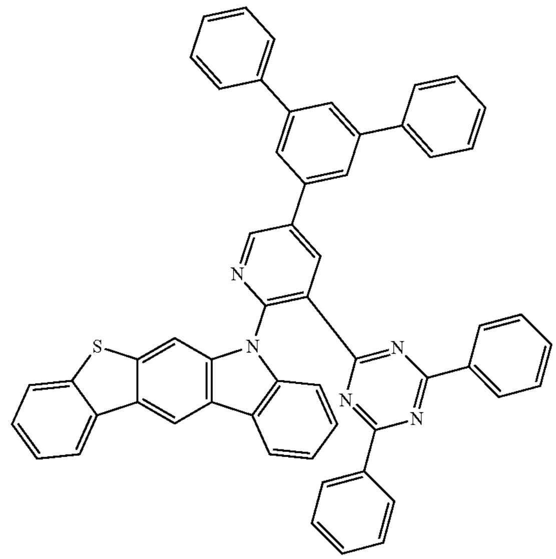
401
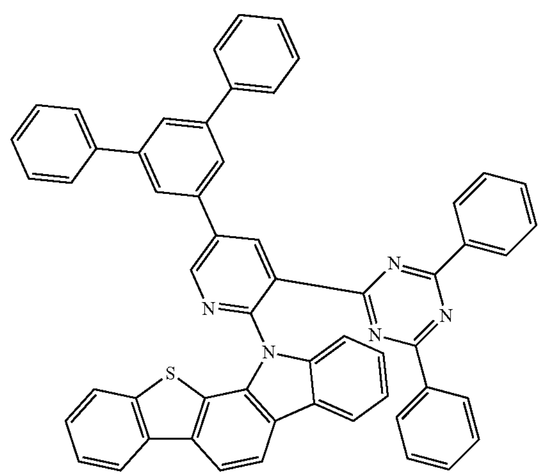
402
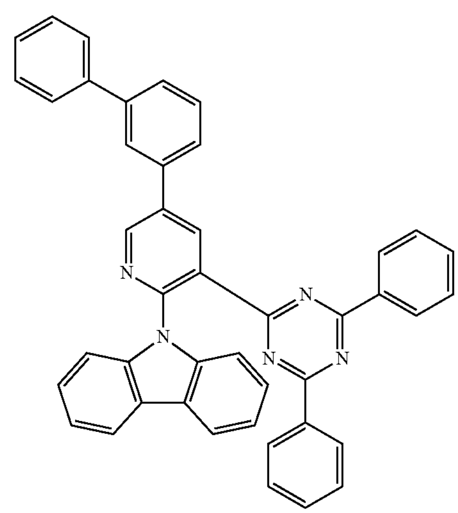

-continued
403
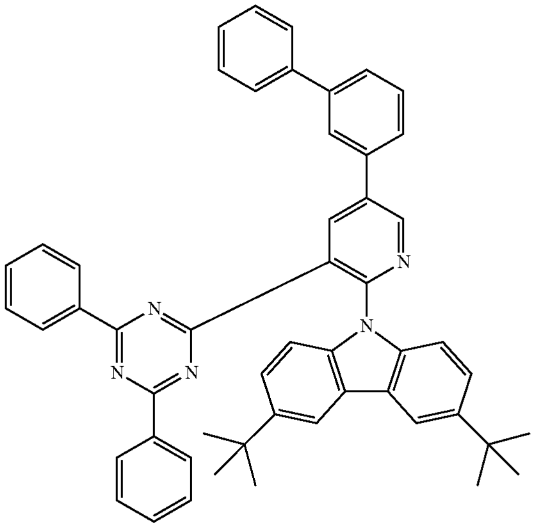
404
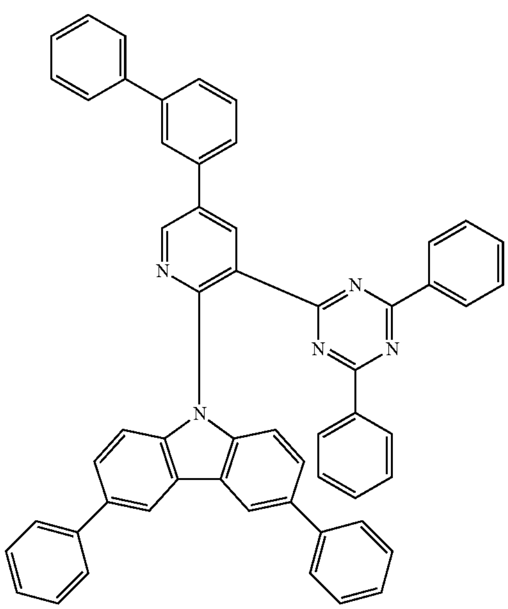
-continued
405
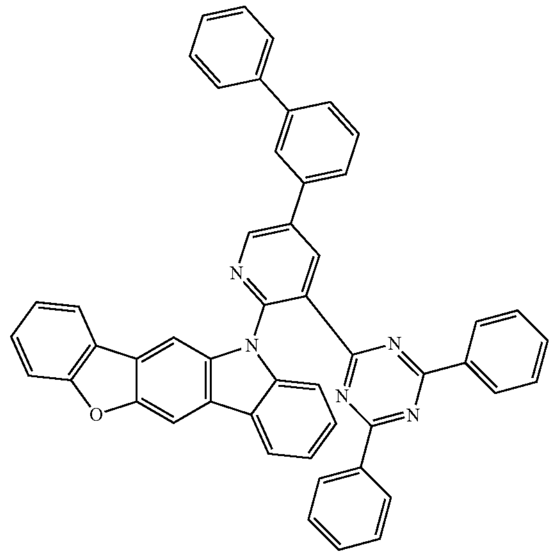
406
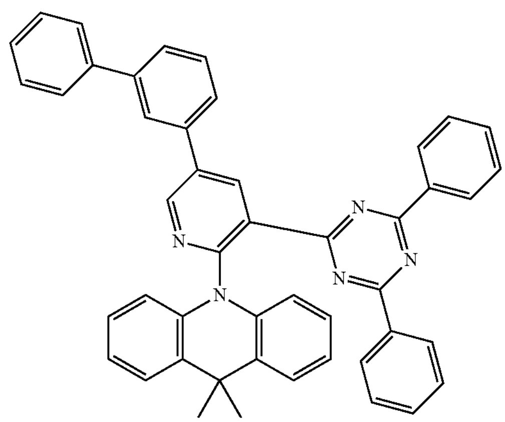
407
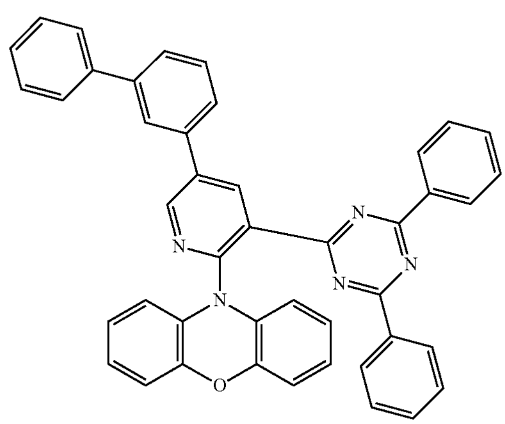

-continued
408
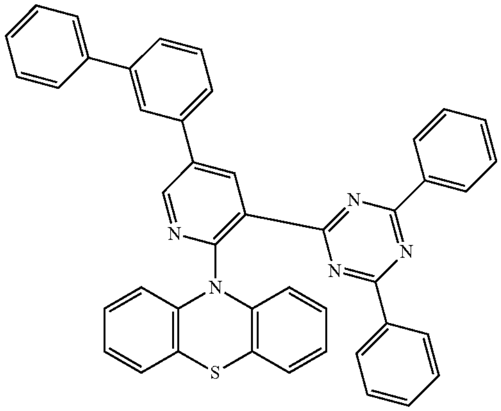
409
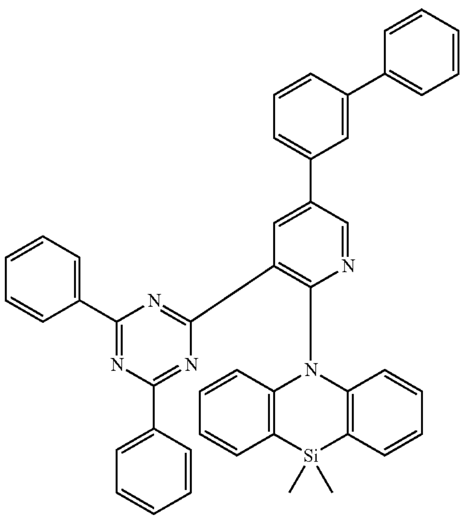
410
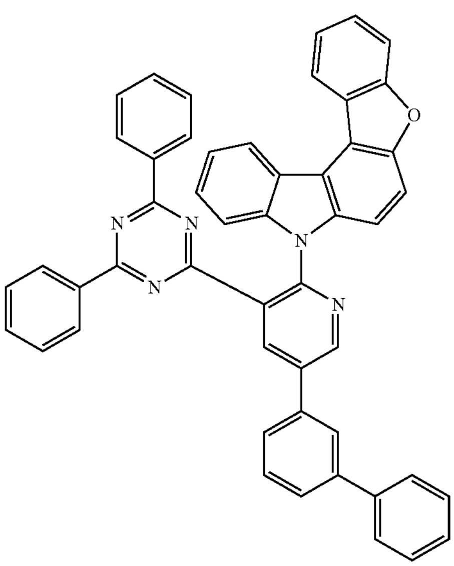
-continued
411
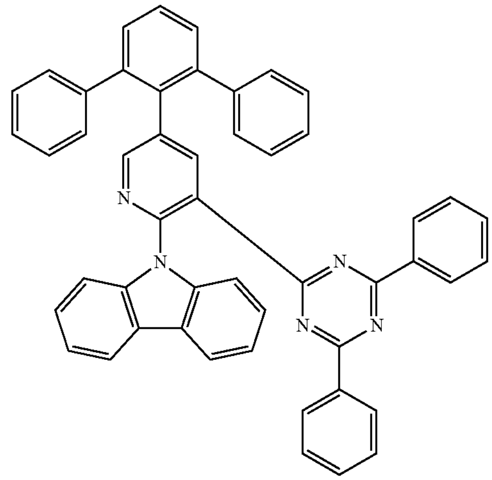
412
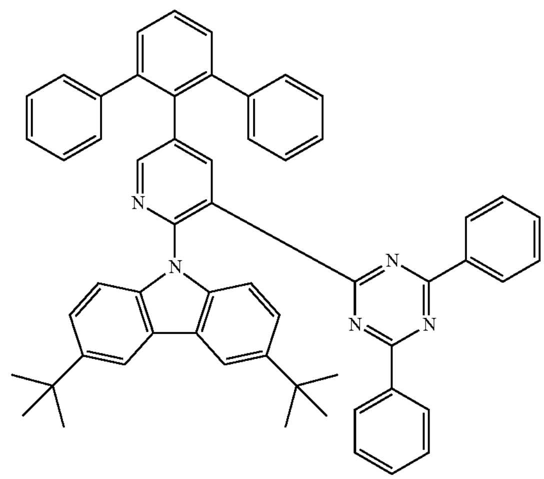
413
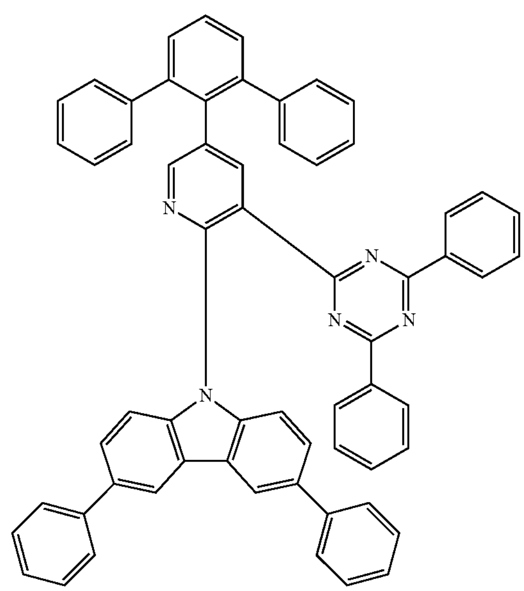

-continued
414
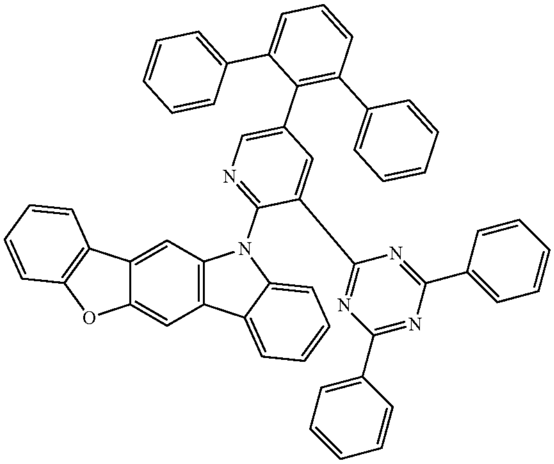
415
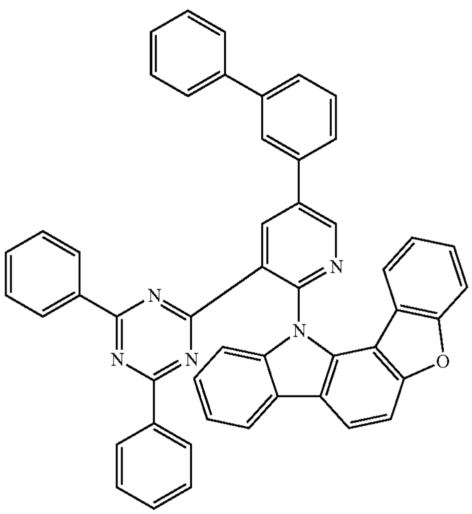
416
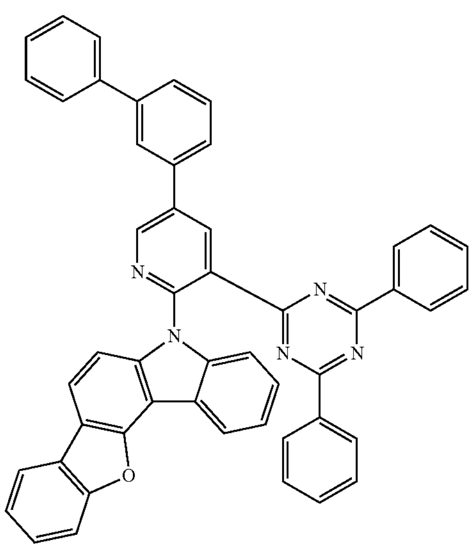
-continued
417
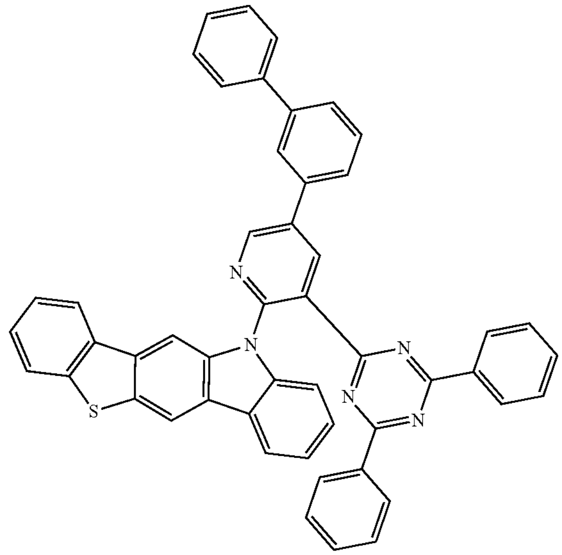
418
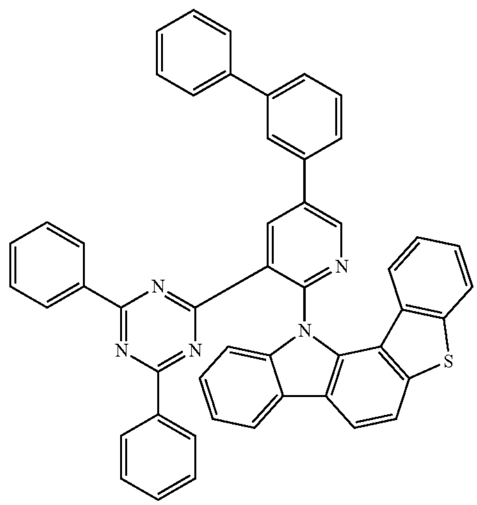
419
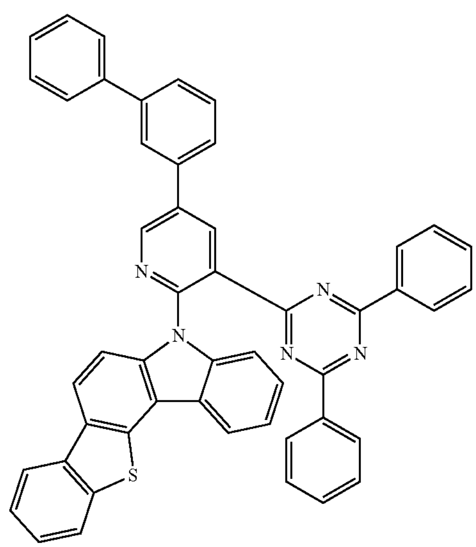

420
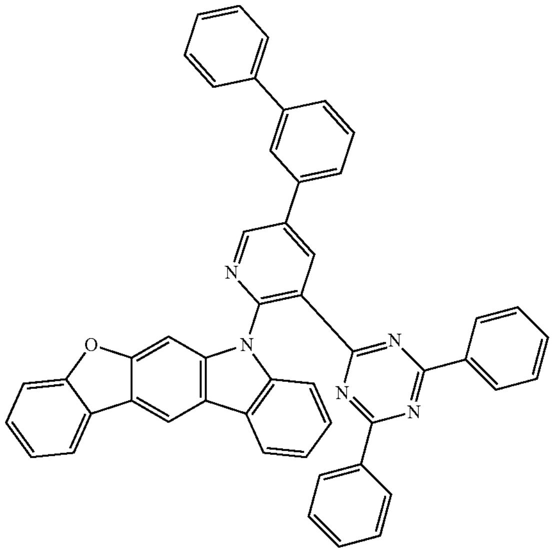
421
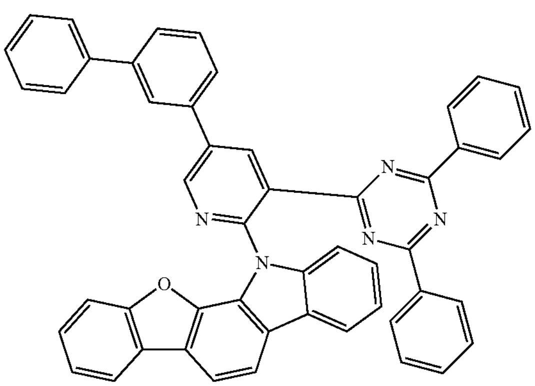
423
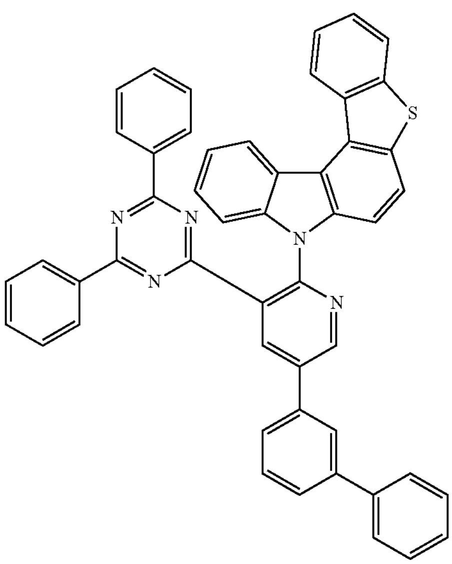
424
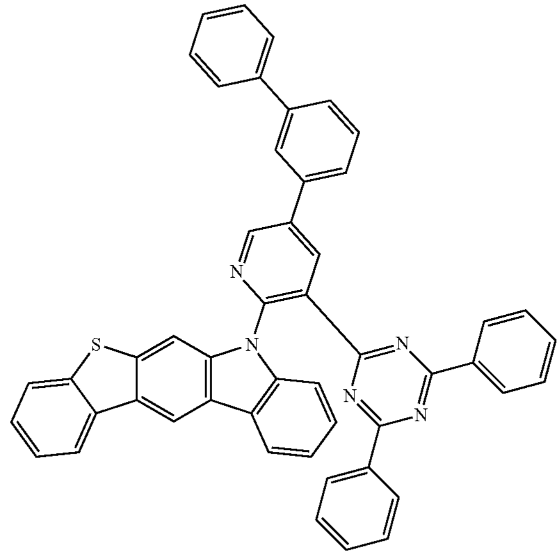
425
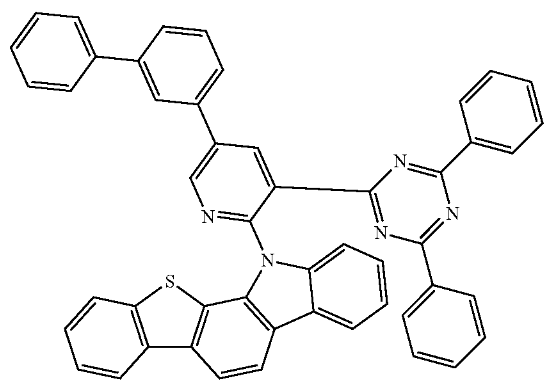
426
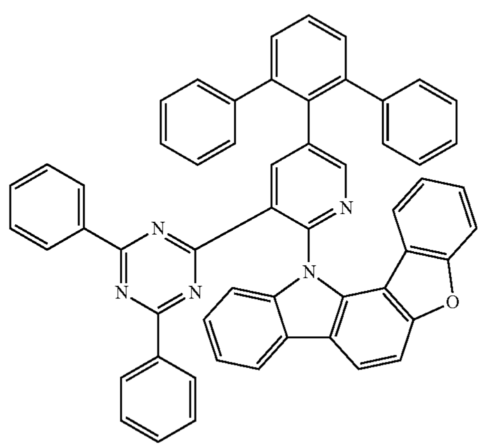

-continued
427
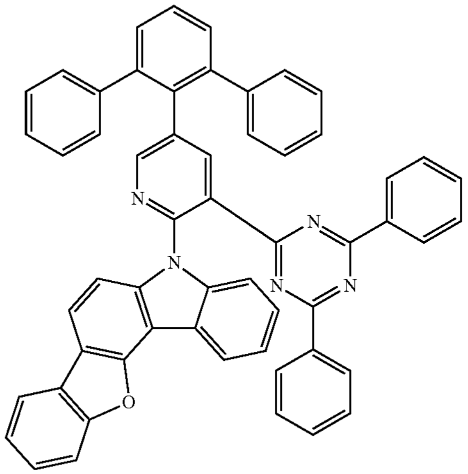
428
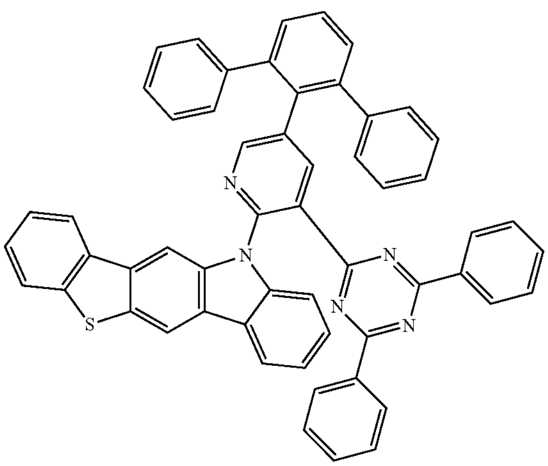
429
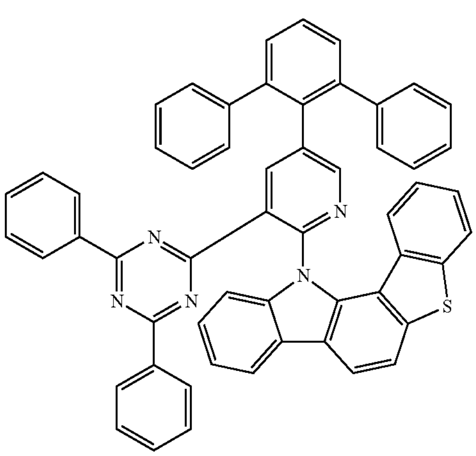
-continued
430
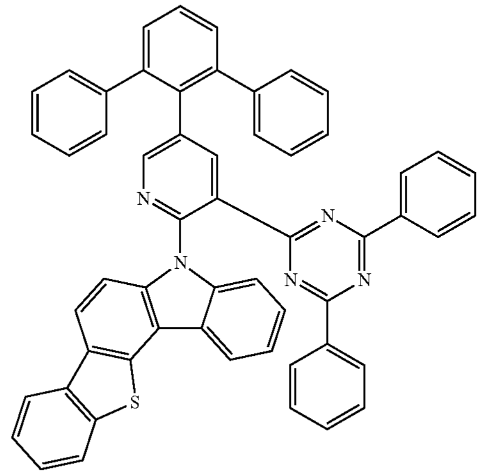
431
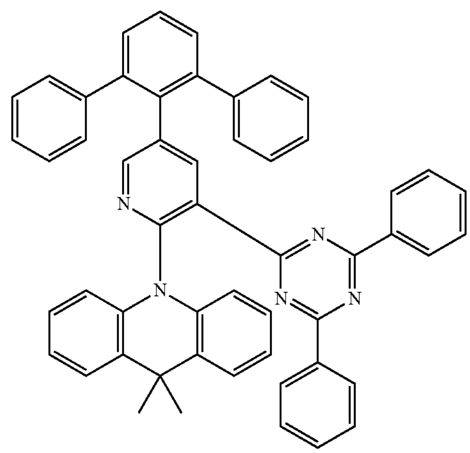
432
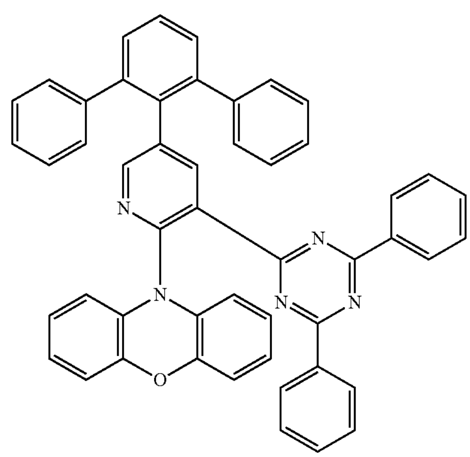

-continued
433
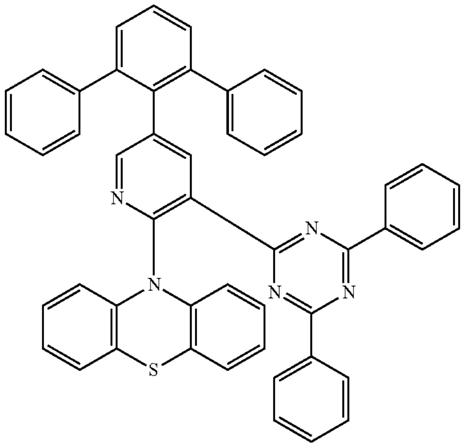
434
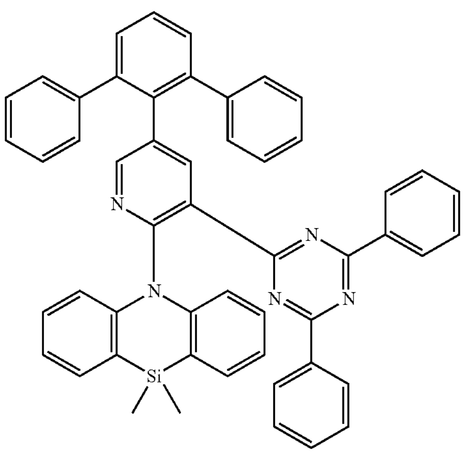
435
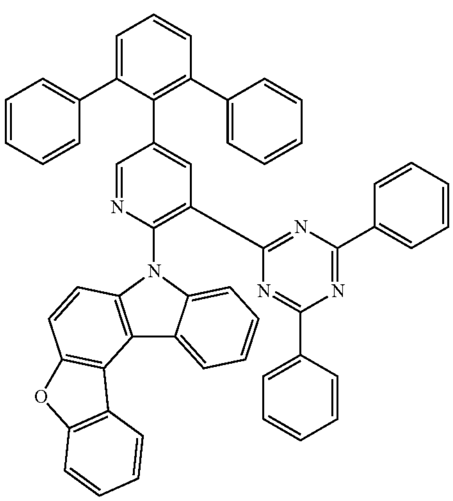
-continued
436
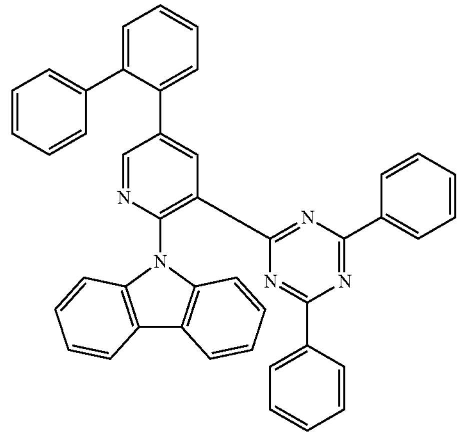
437
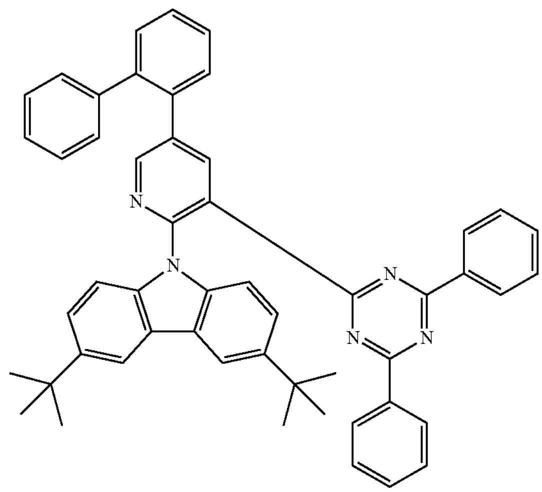
438
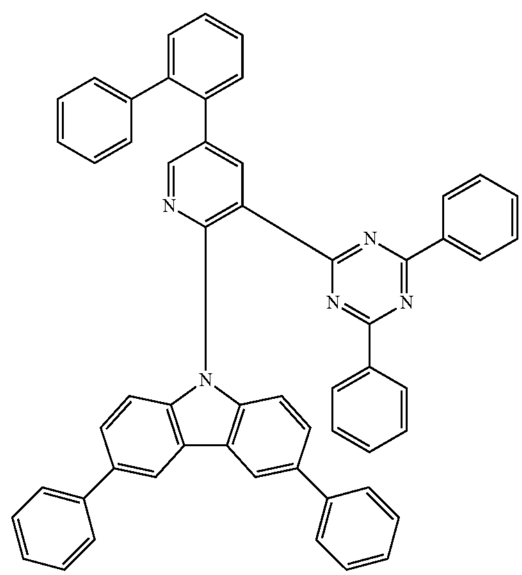

-continued
-continued
439
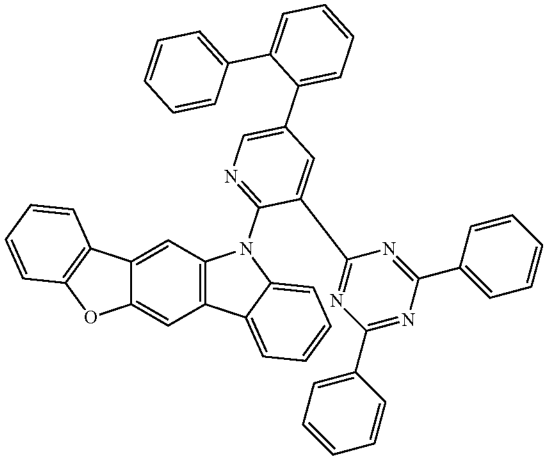
440
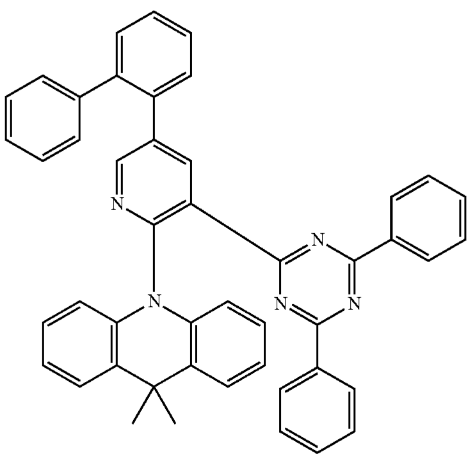
441
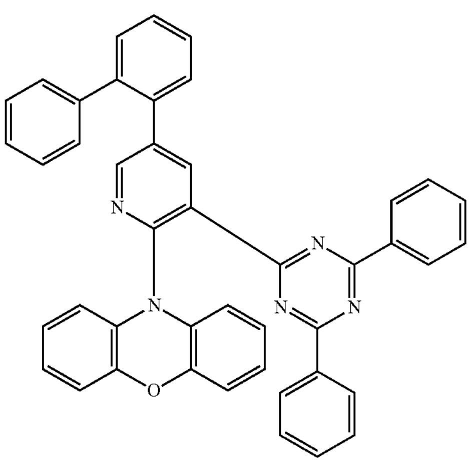
442
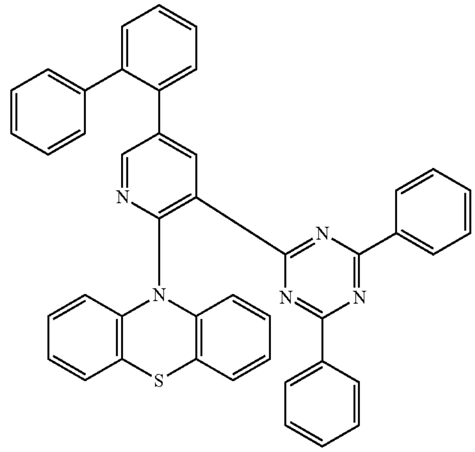
443
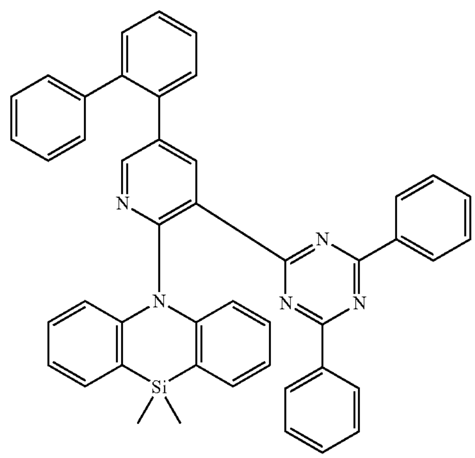
444
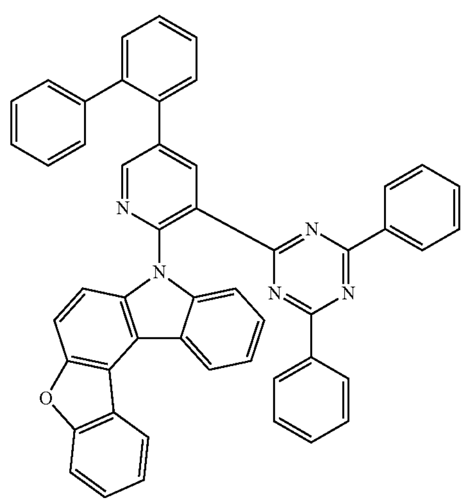

445
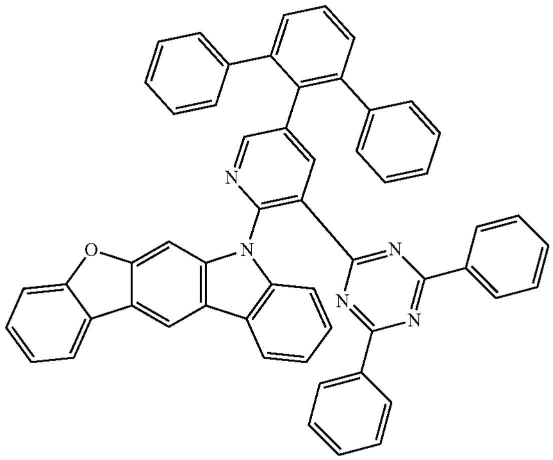
446
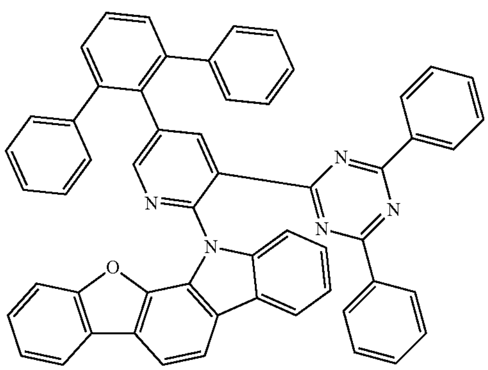
447
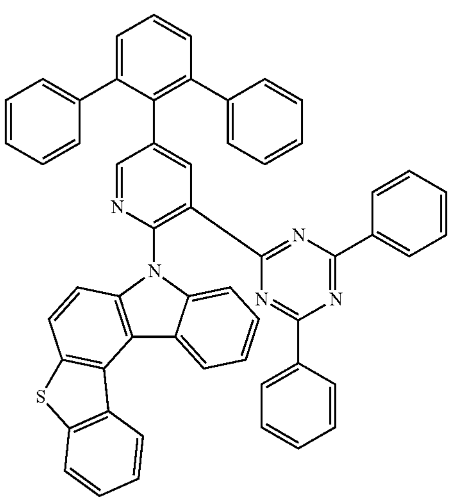
448
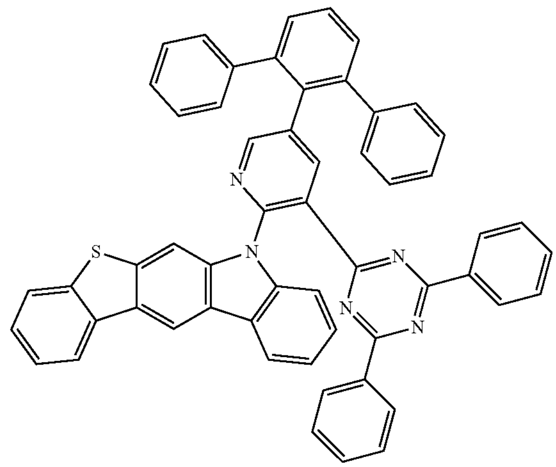
449
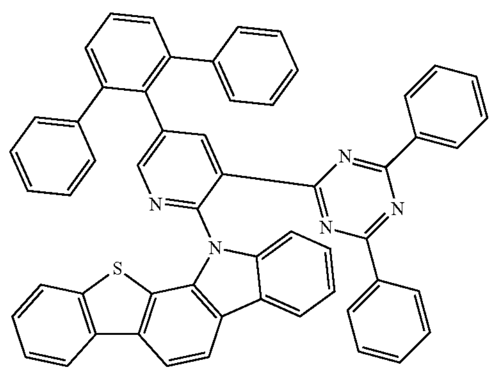
450
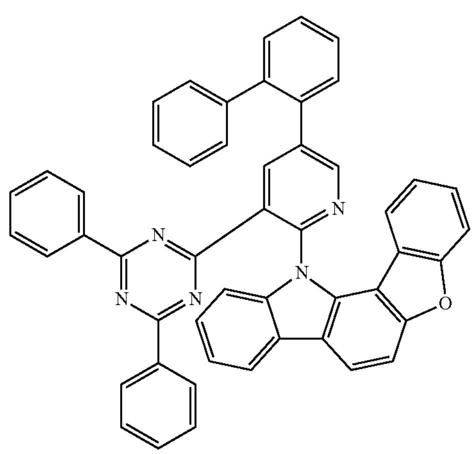

-continued
451
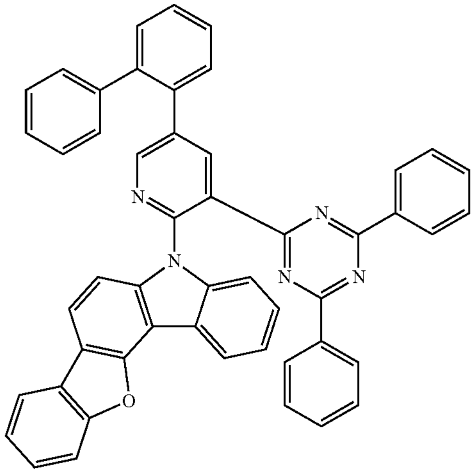
452
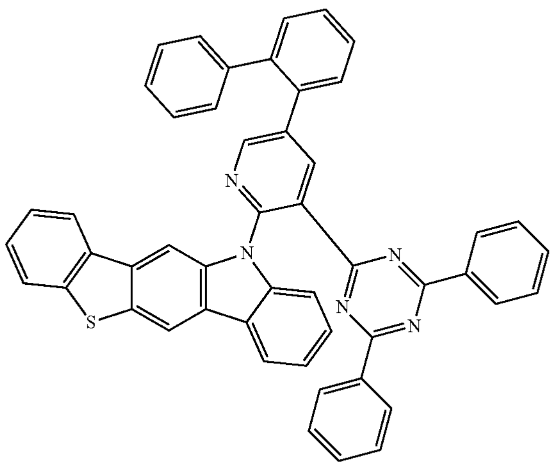
453
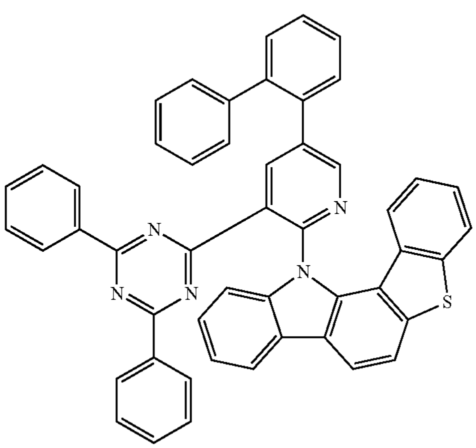
-continued
454
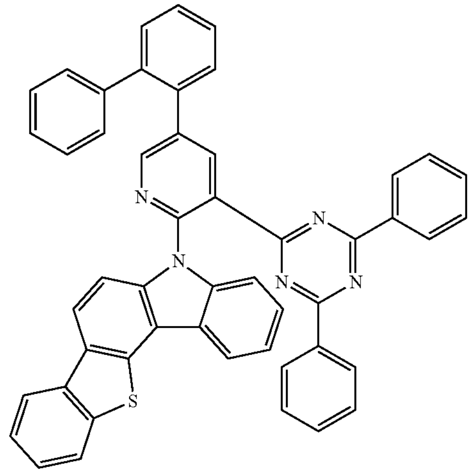
455
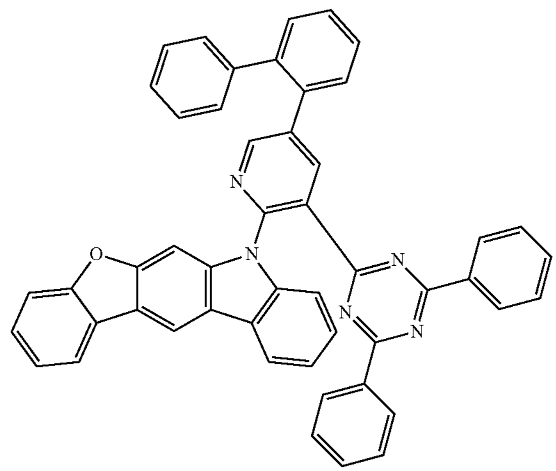
456
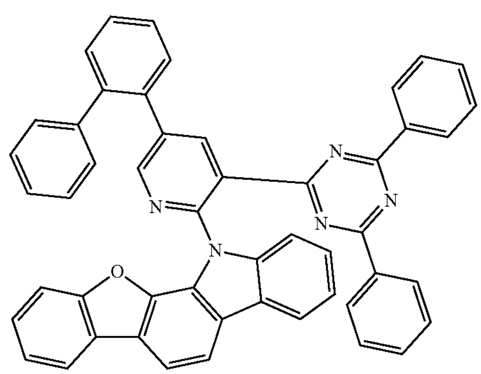

457
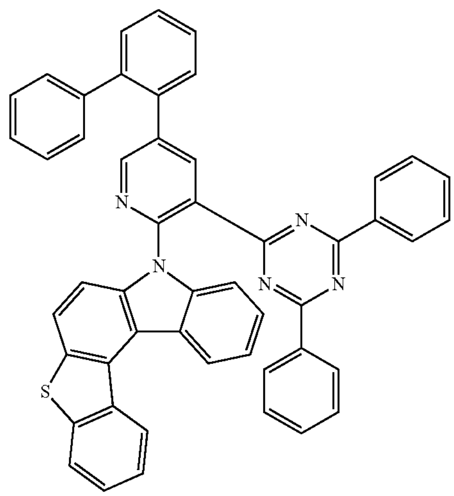
458
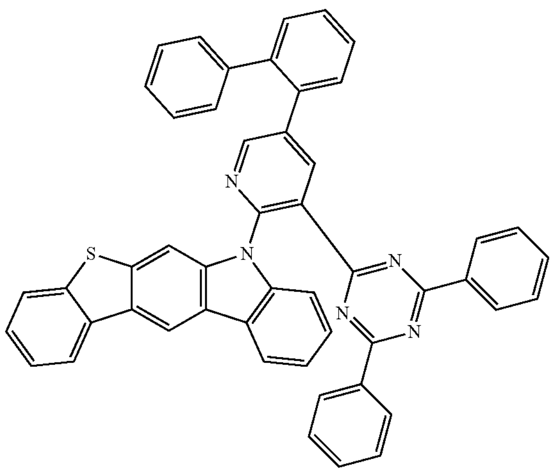
459
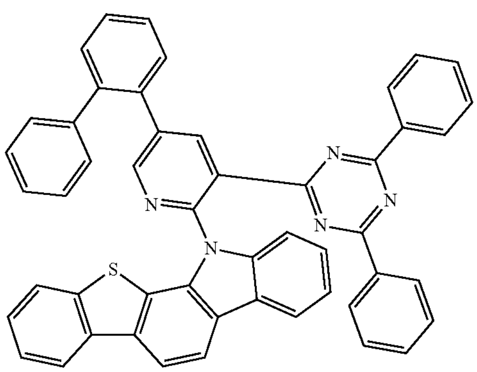
460
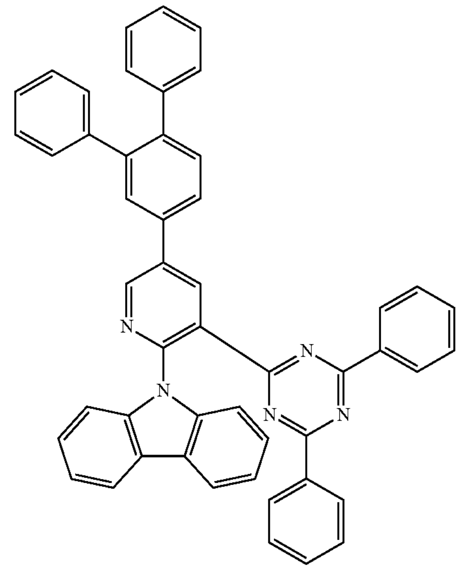
461
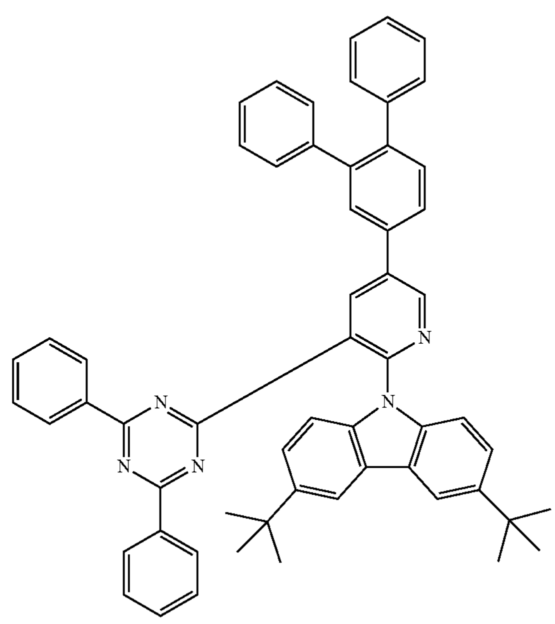

-continued
462
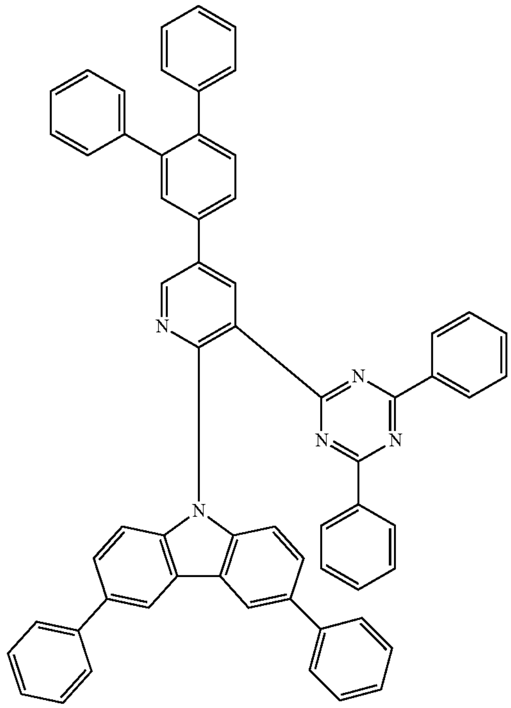
463
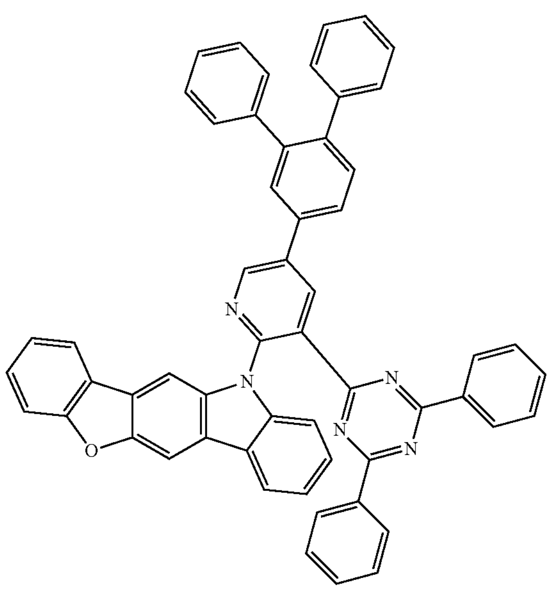
-continued
464
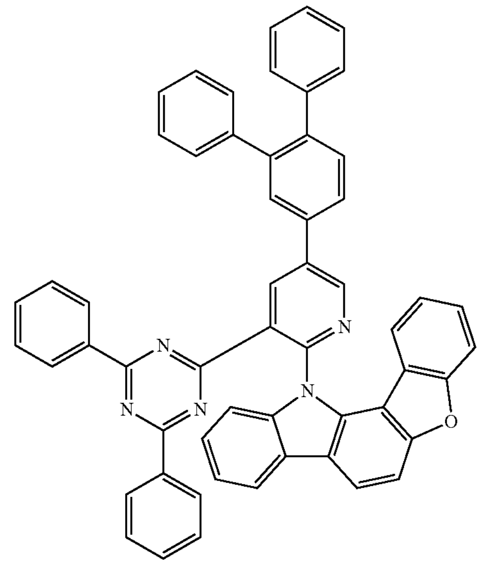
465
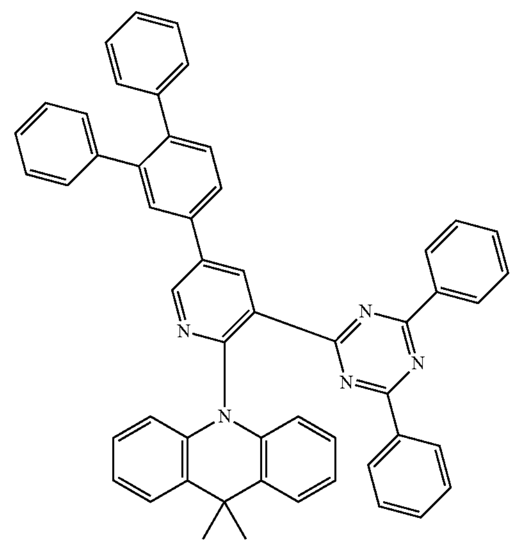
466
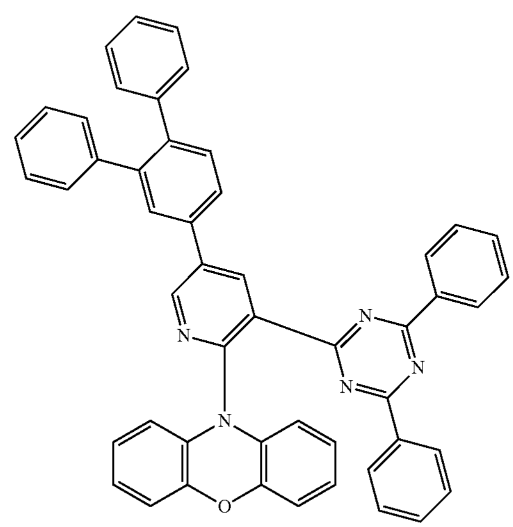

-continued
467
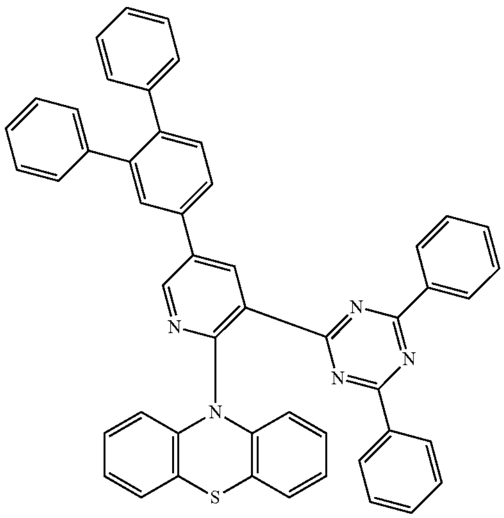
468
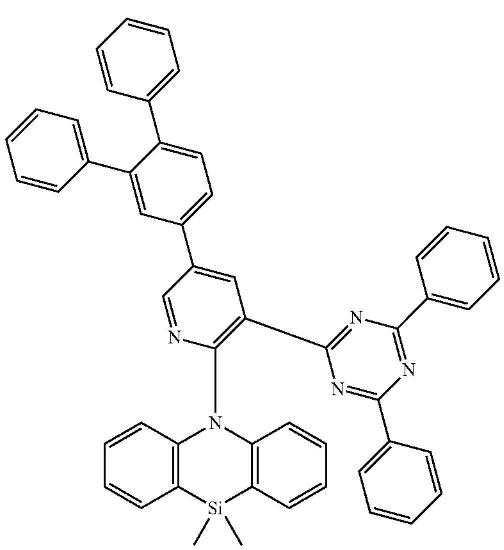
-continued
469
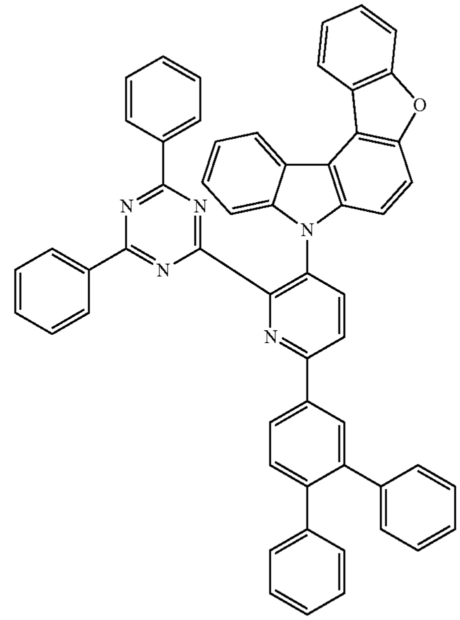
470
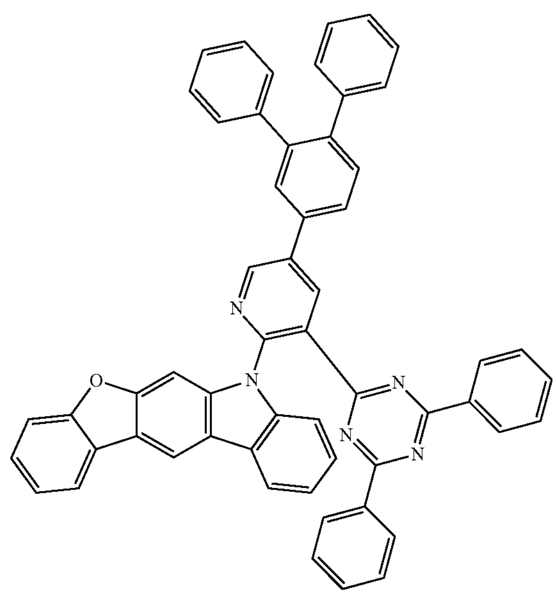

-continued
471
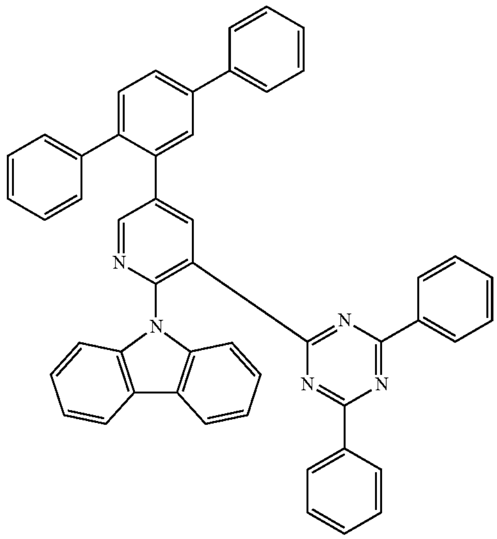
472
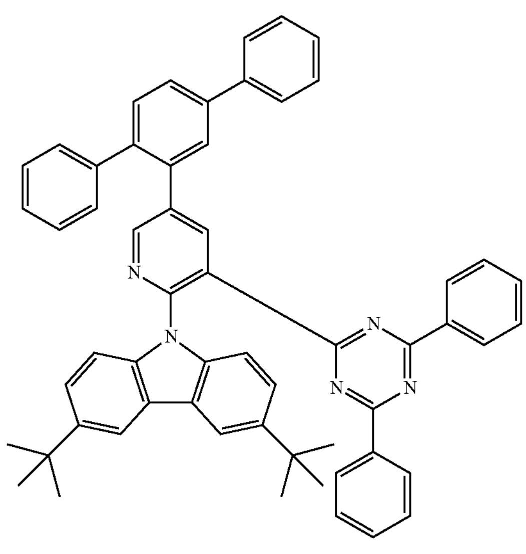
-continued
473
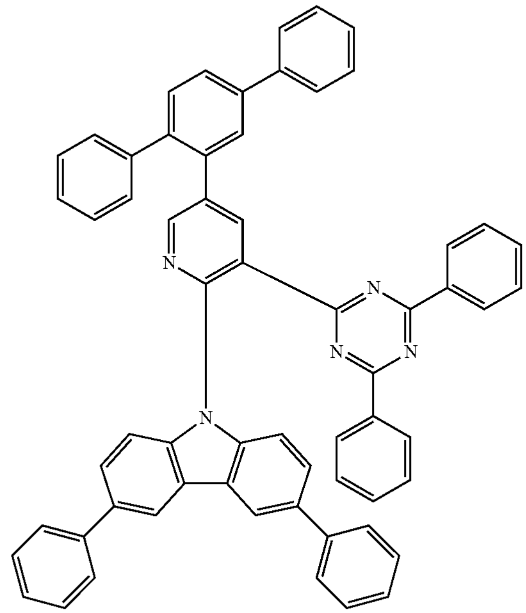
474
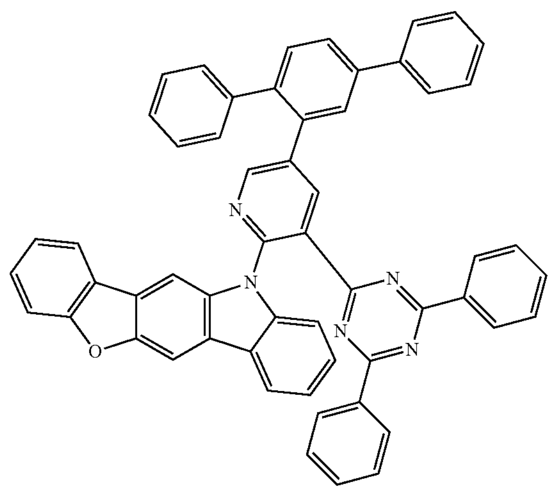
475
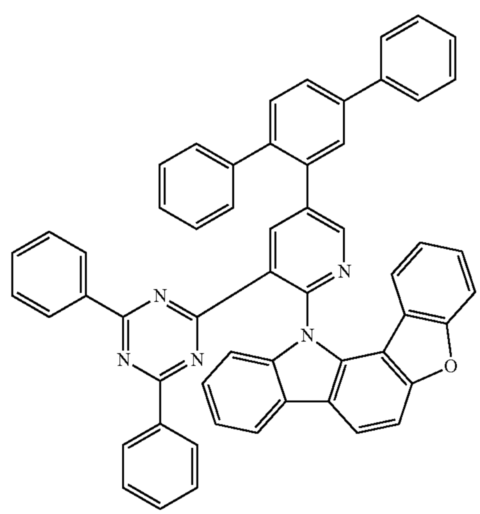

-continued
476
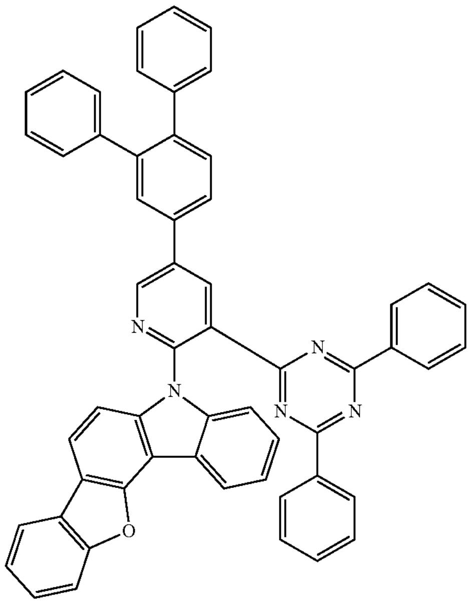
477
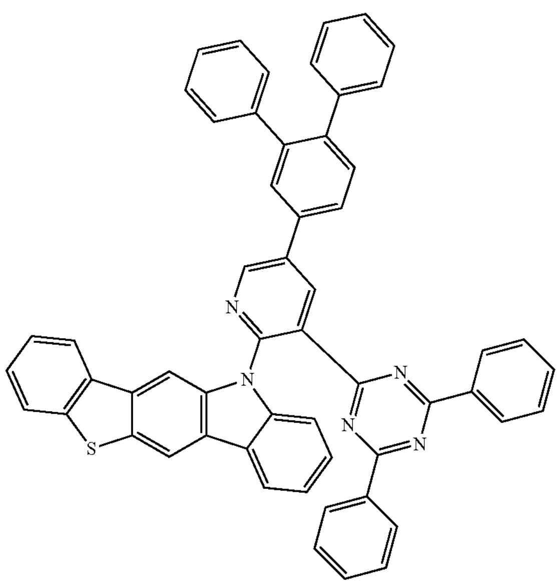
-continued
478
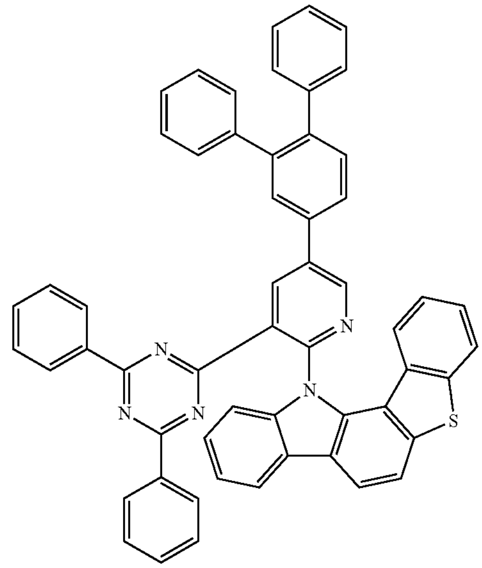
479
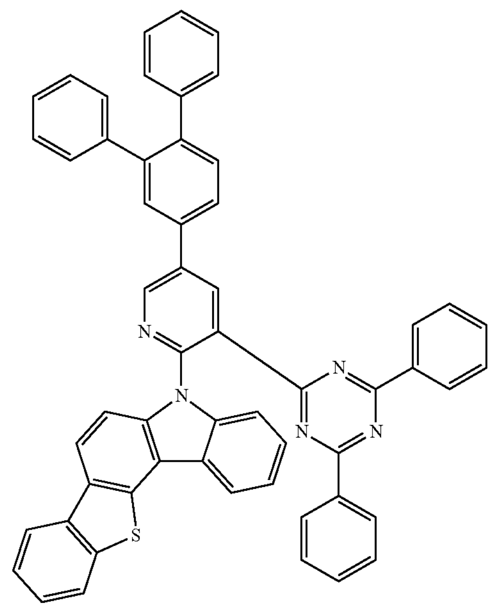
480
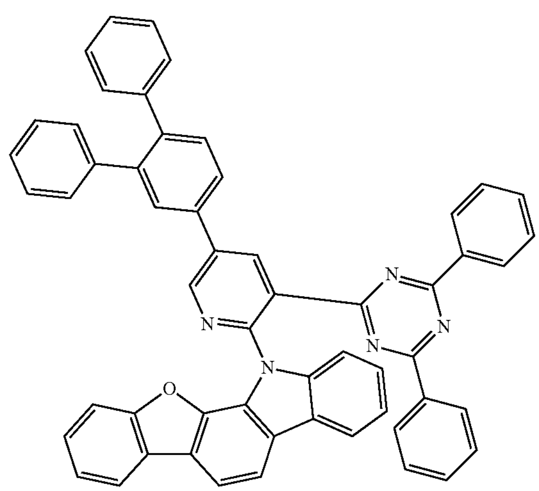

-continued
481
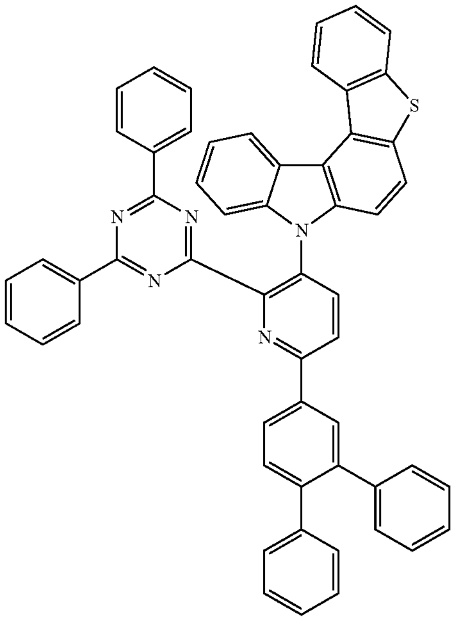
482
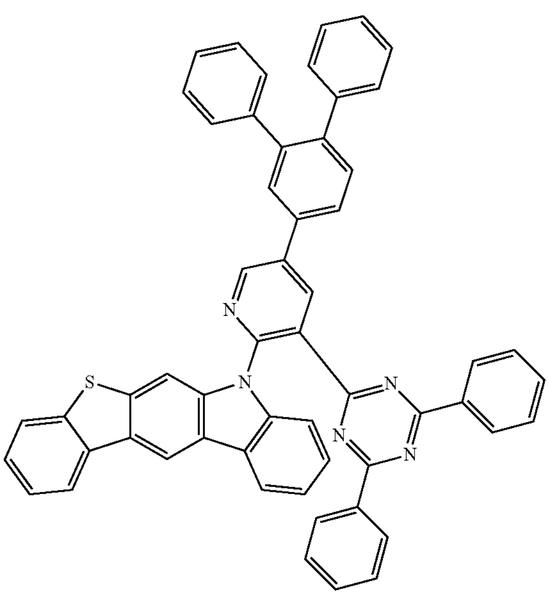
-continued
483
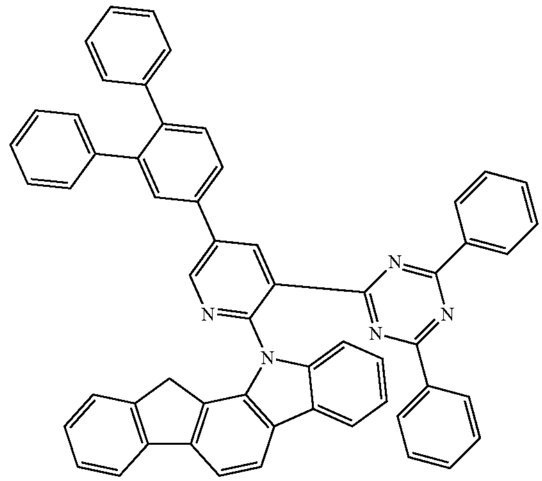
484
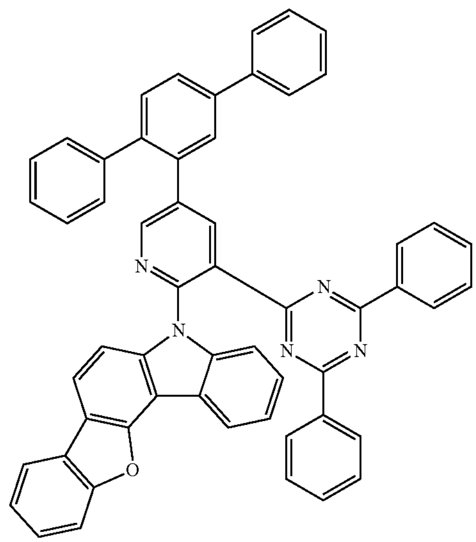
485
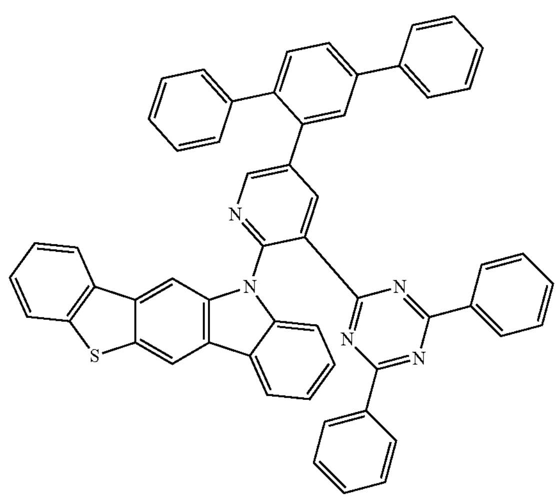

-continued
486
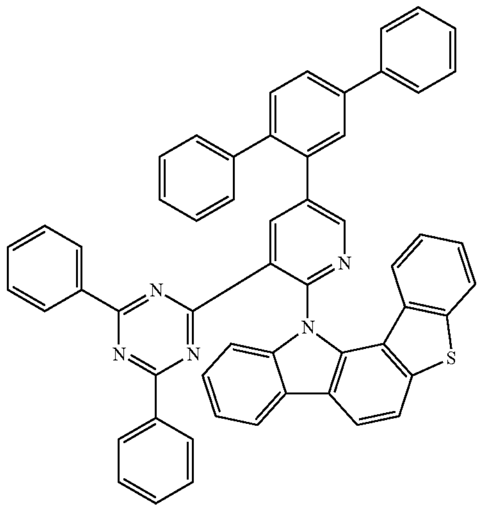
487
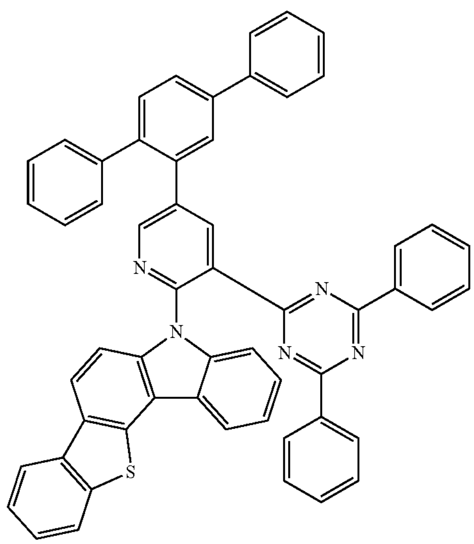
488
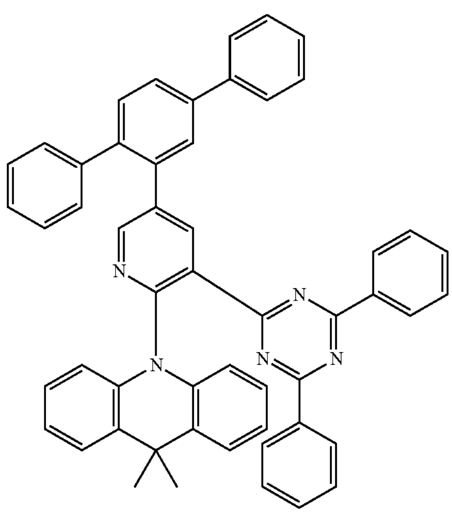
-continued
489
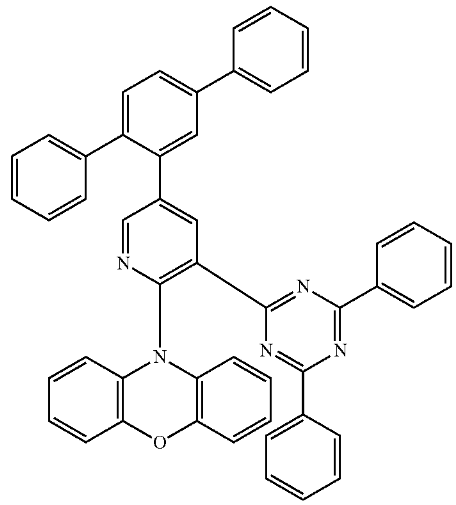
490
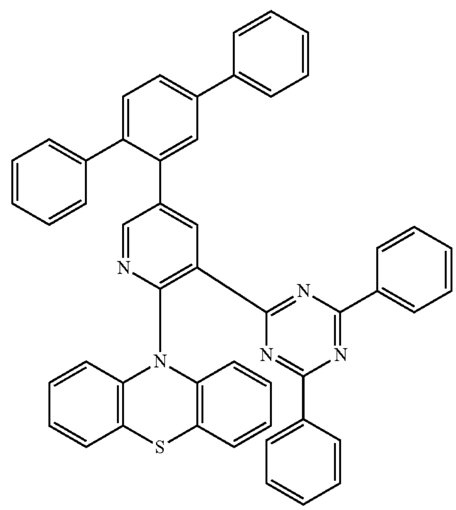
491
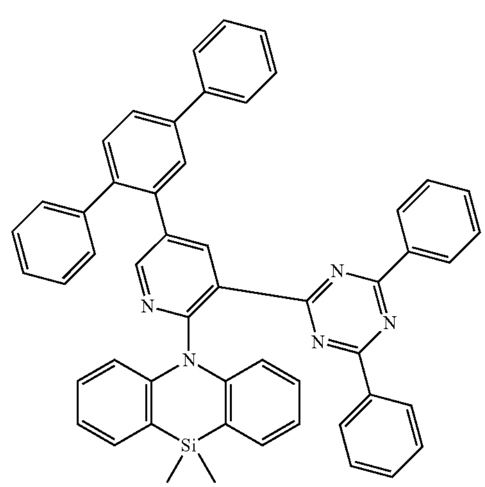

492
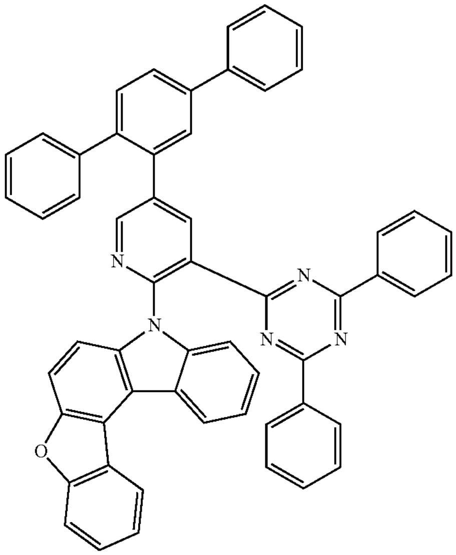
493
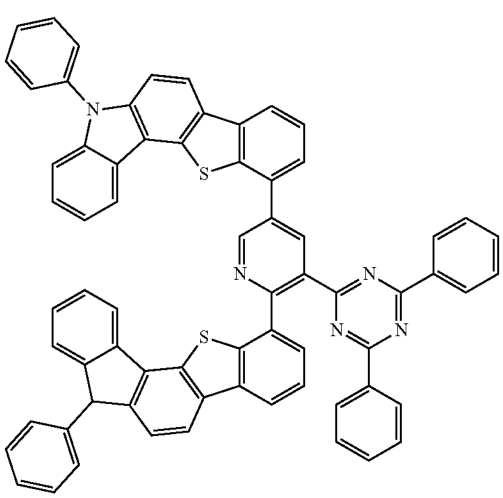
494
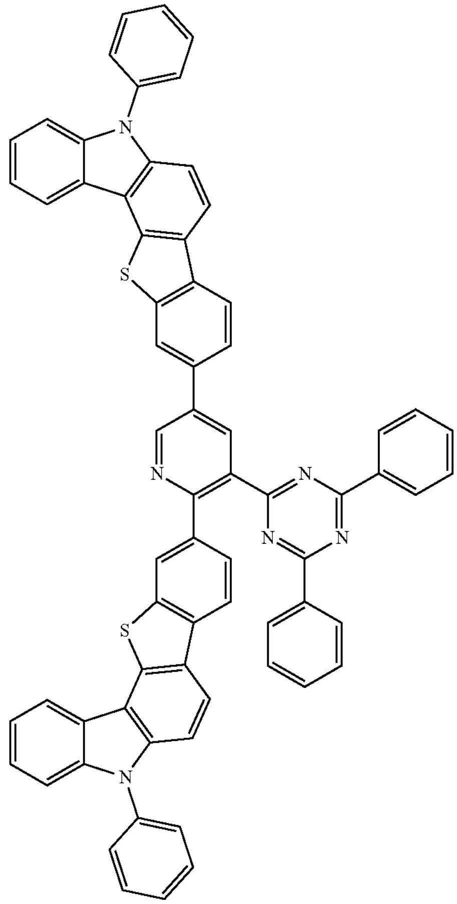
495
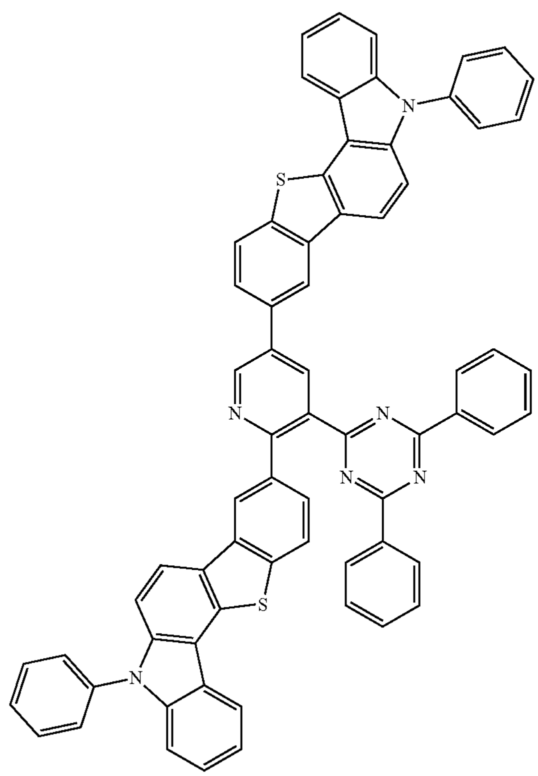

-continued
496
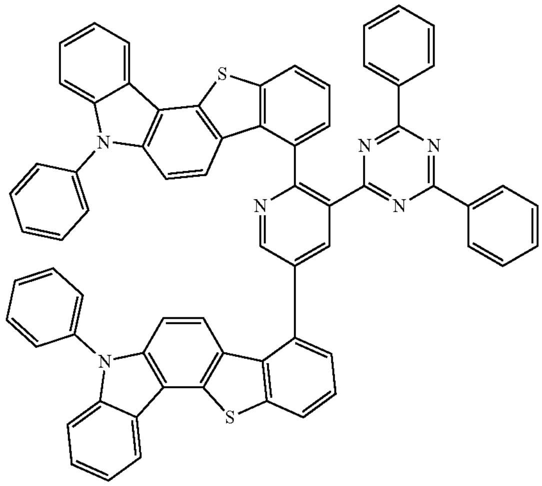
497
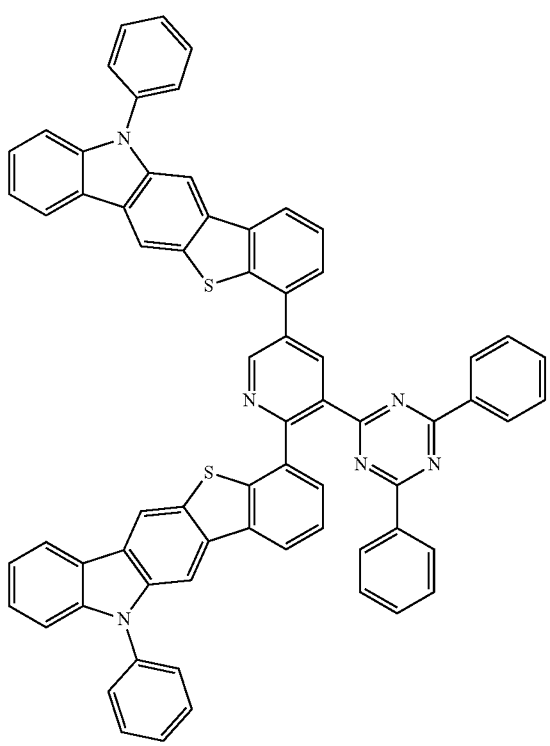
-continued
498
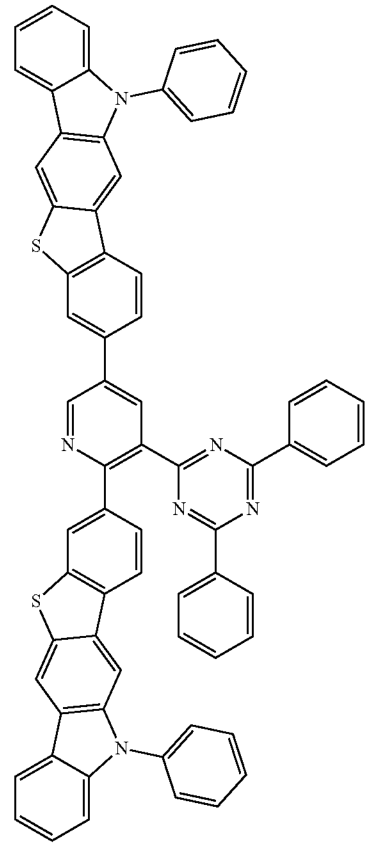
499
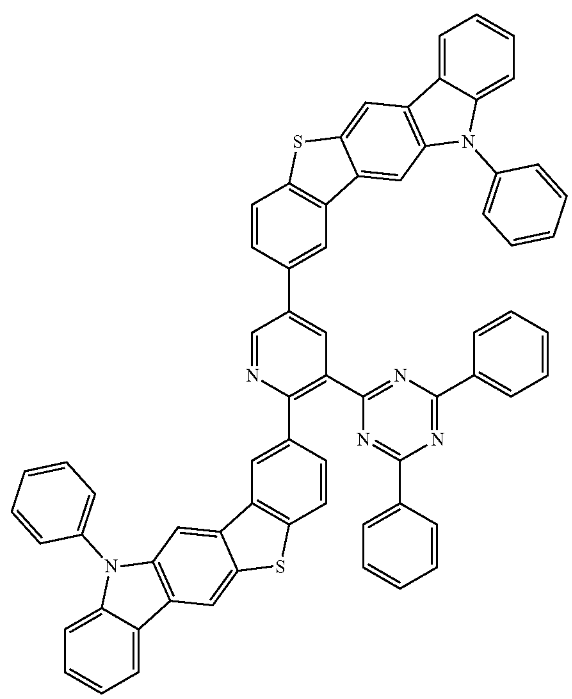

-continued
500
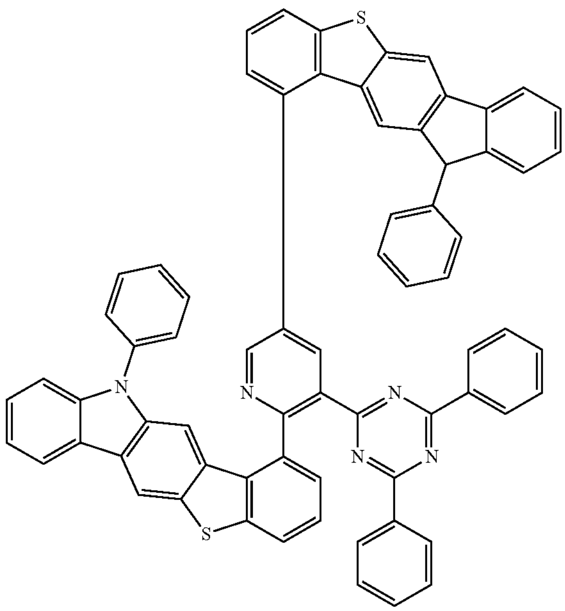
501
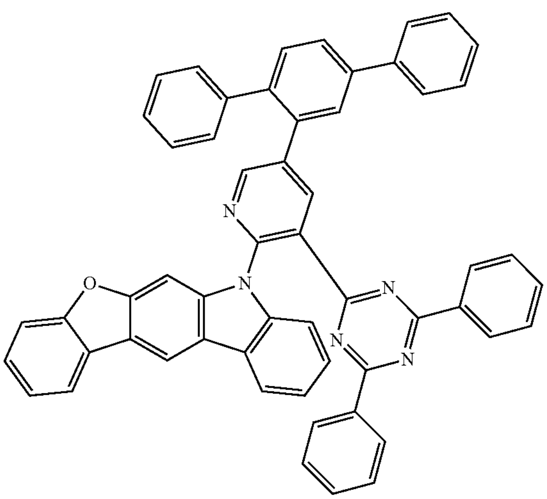
502
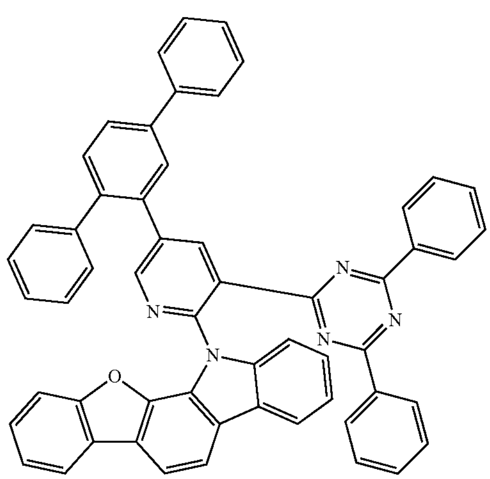
-continued
503
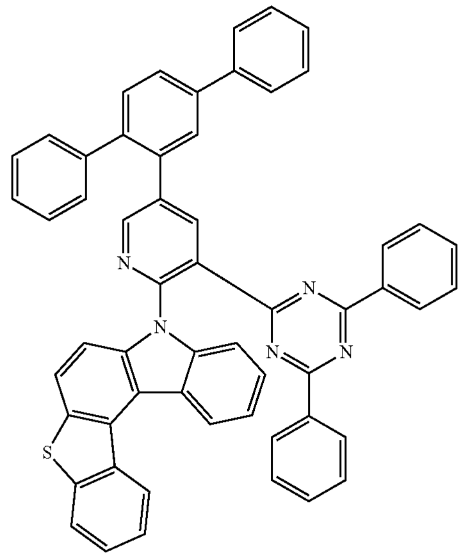
504
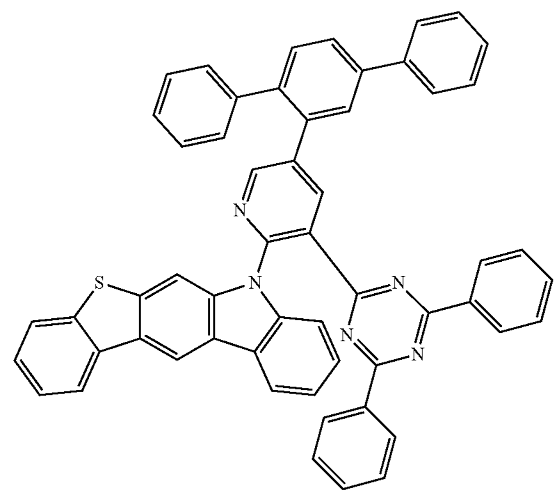
505
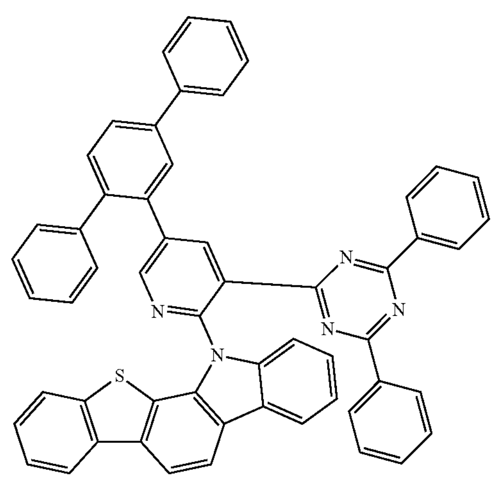

506
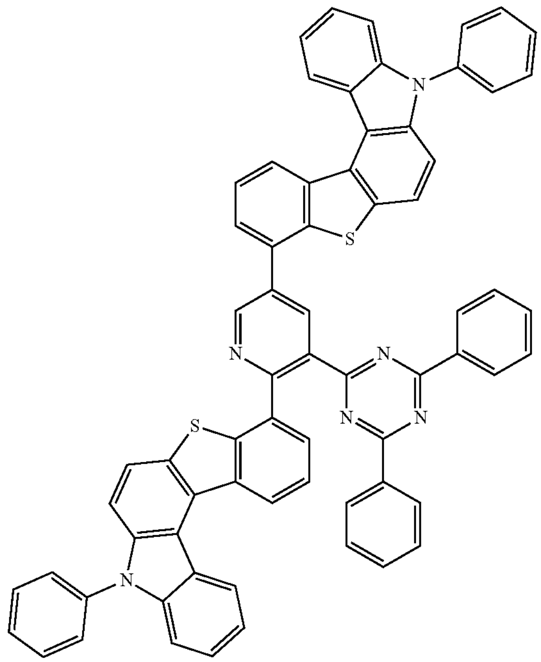
507
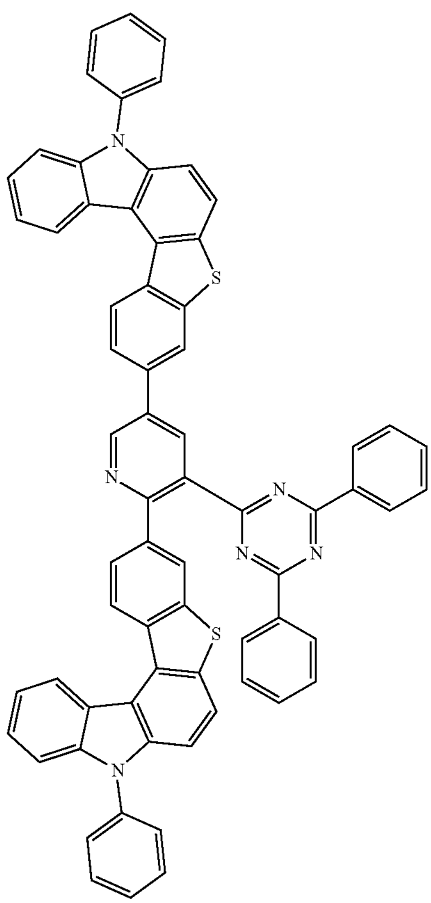
508
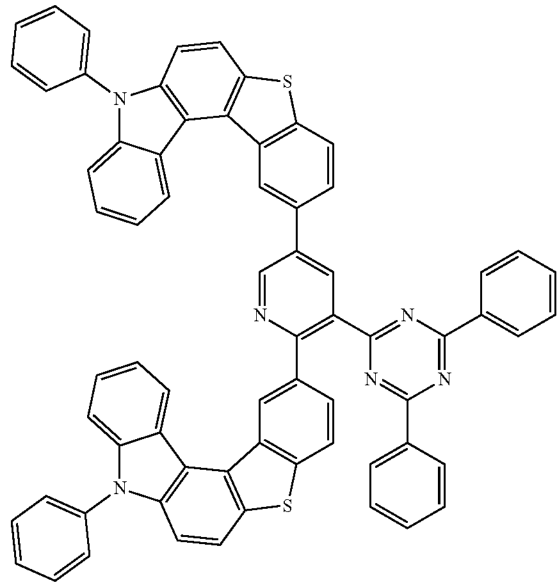
509
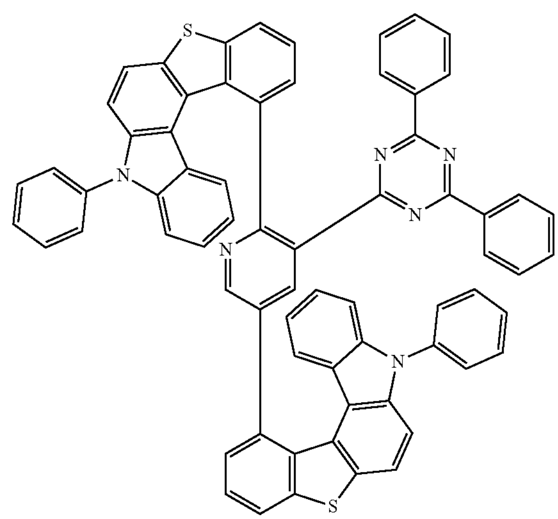

-continued
510
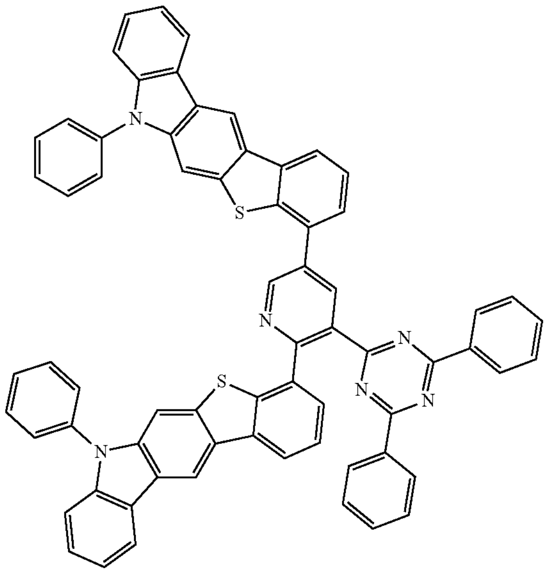
511
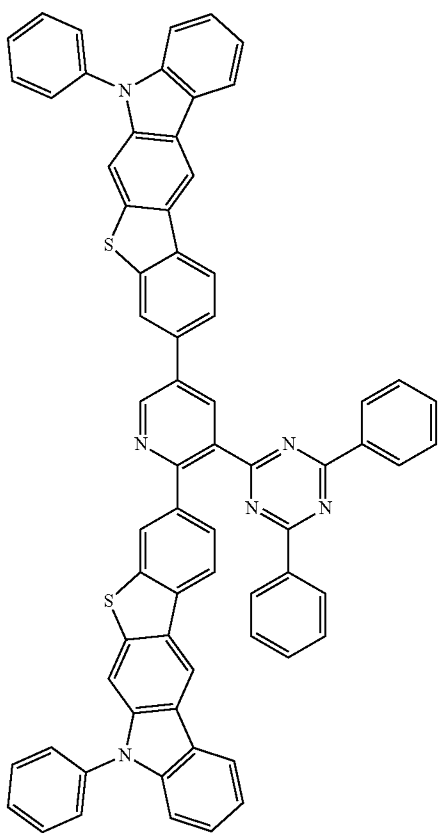
-continued
512
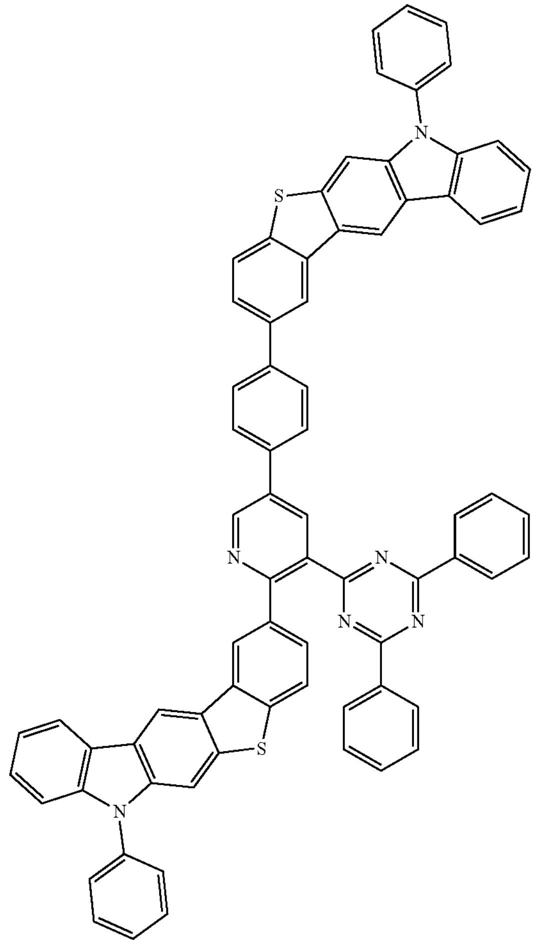
513
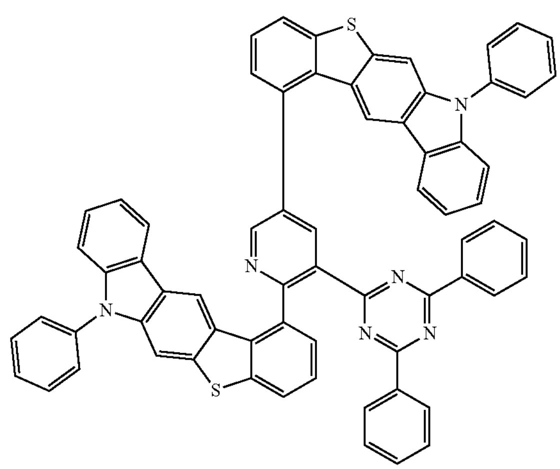

514
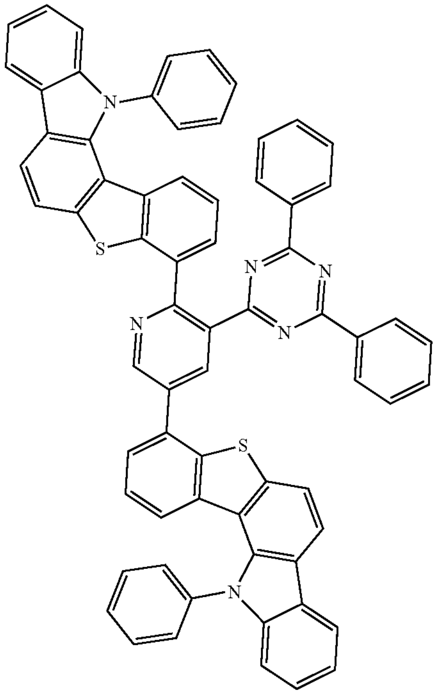
515
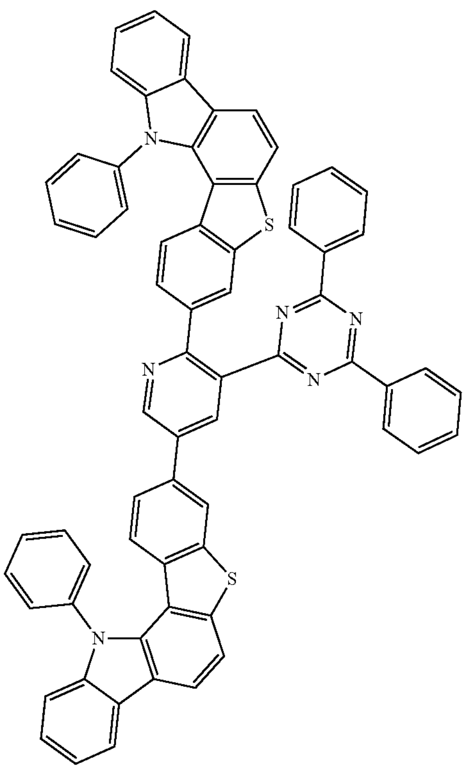
516
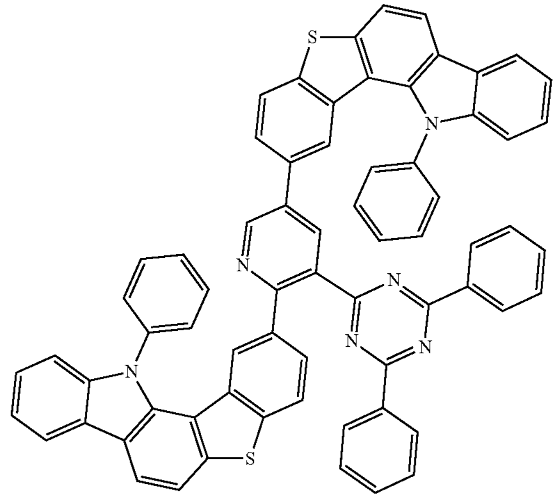
517
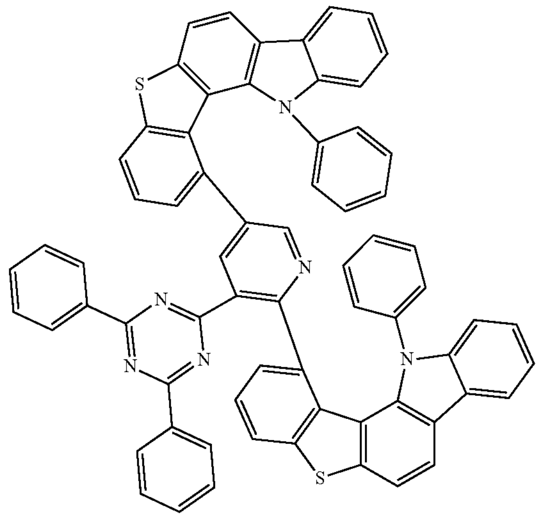
518
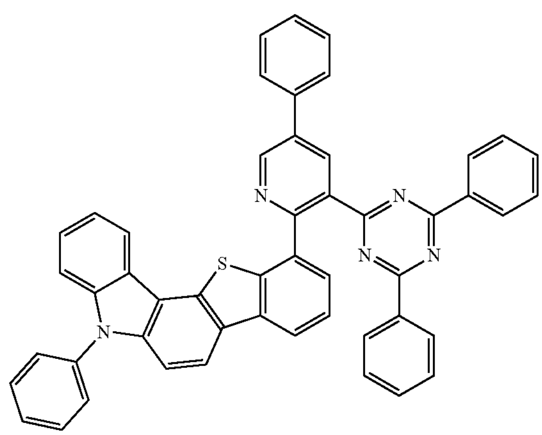

-continued
519
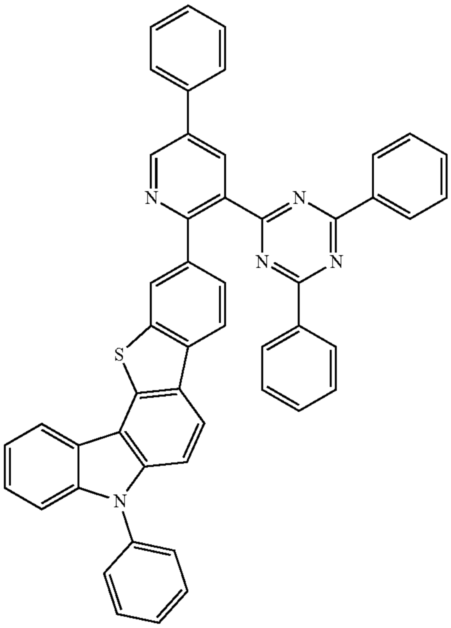
520
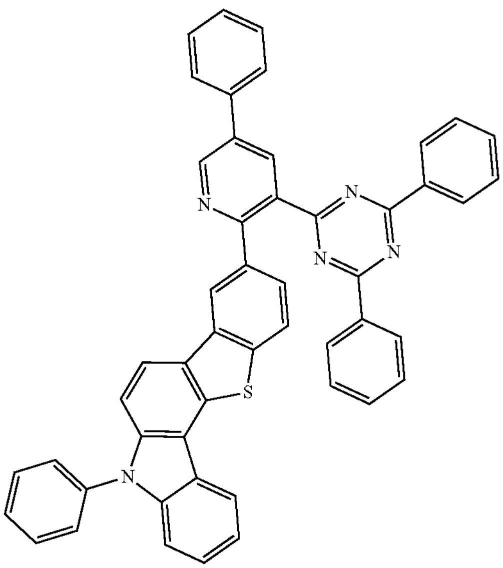
521
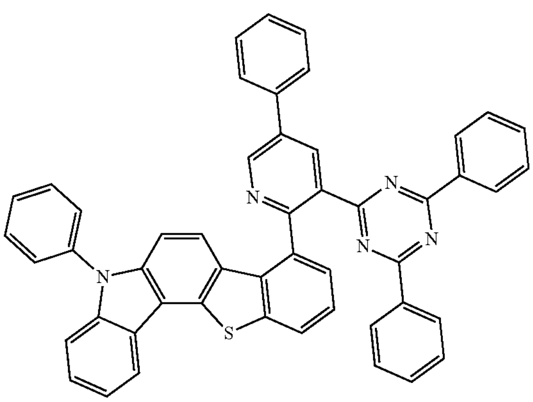
-continued
522
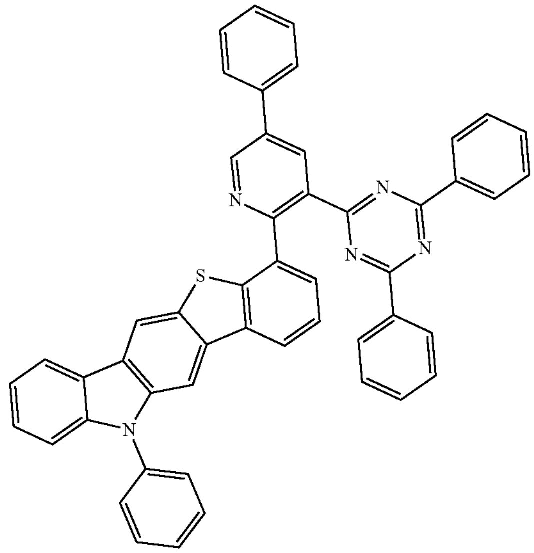
523
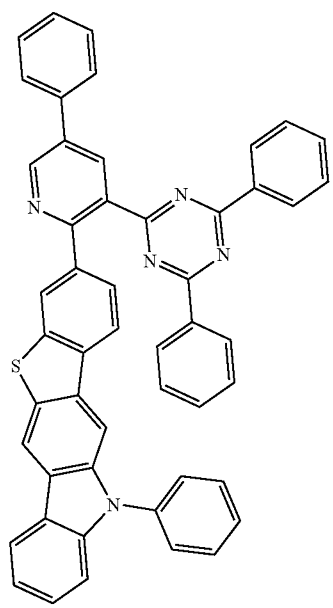

524
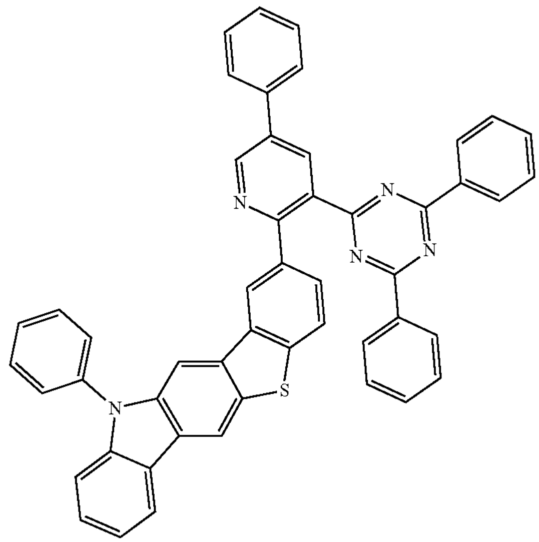
525
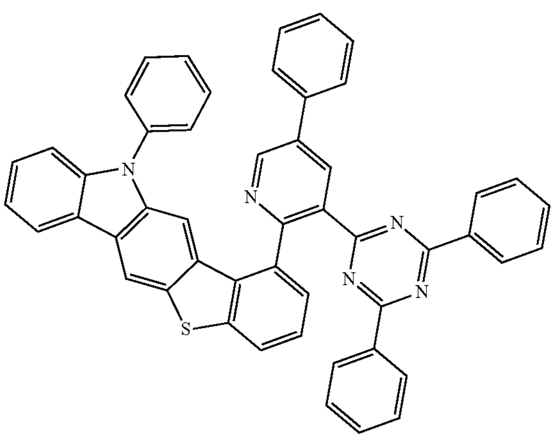
526
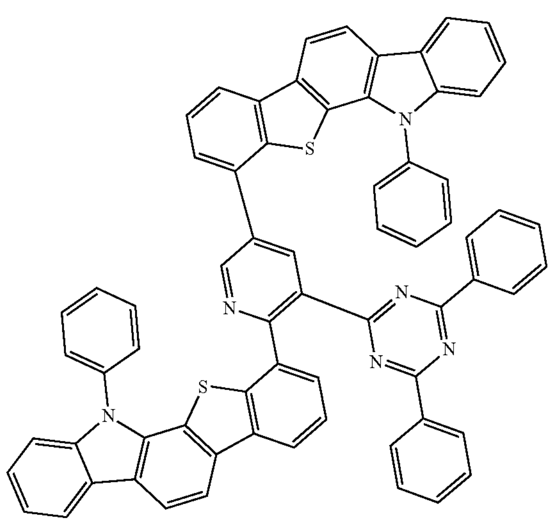
527
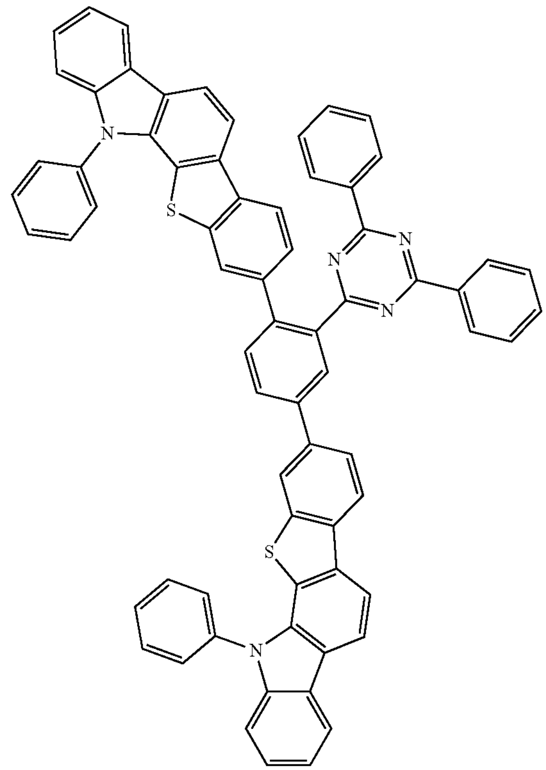
528
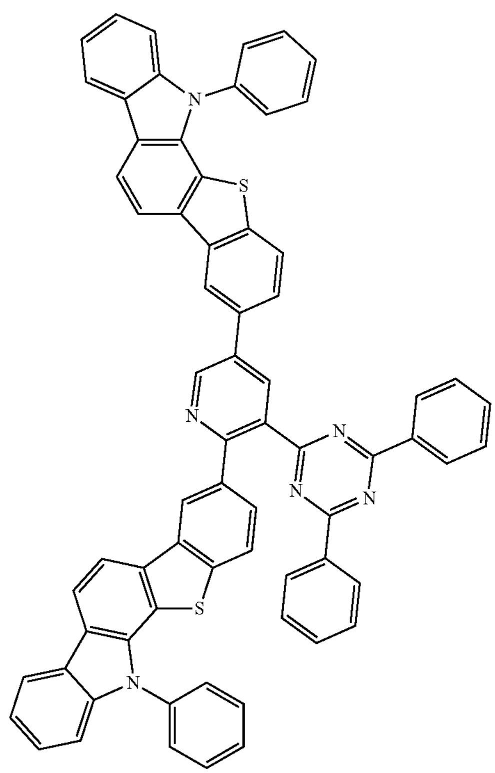

-continued
529
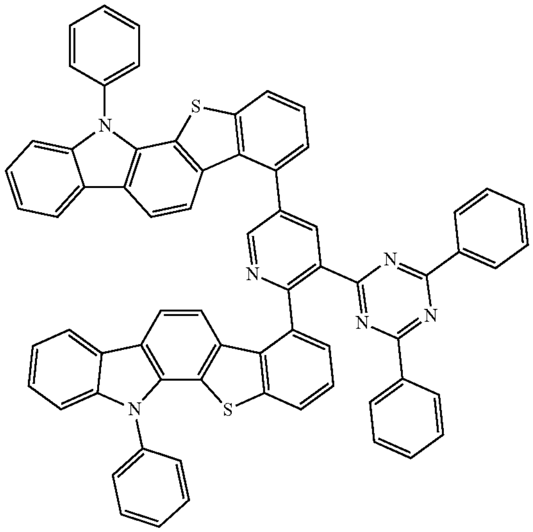
530
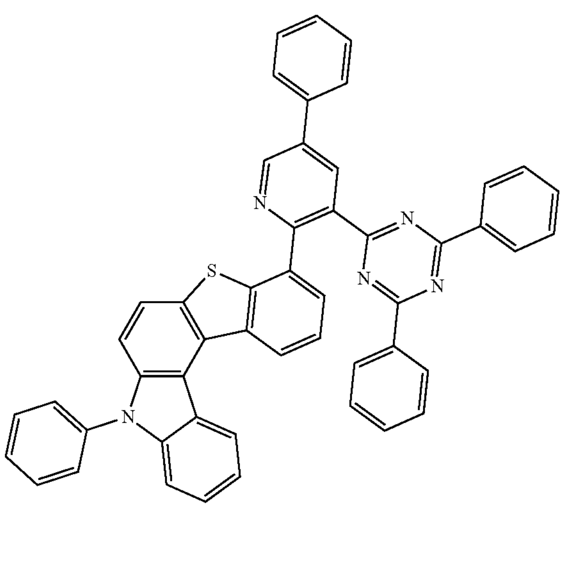
-continued
531
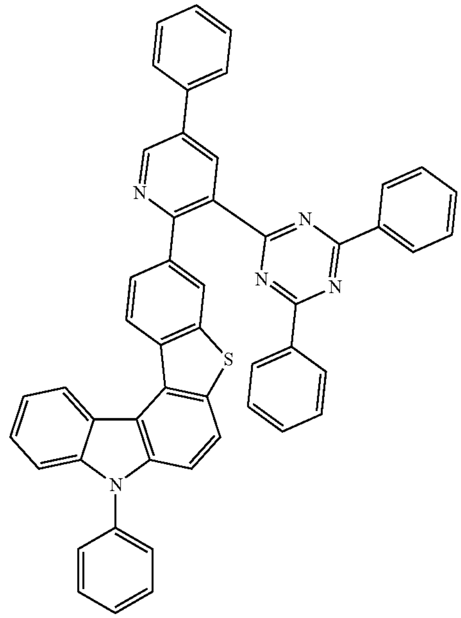
532
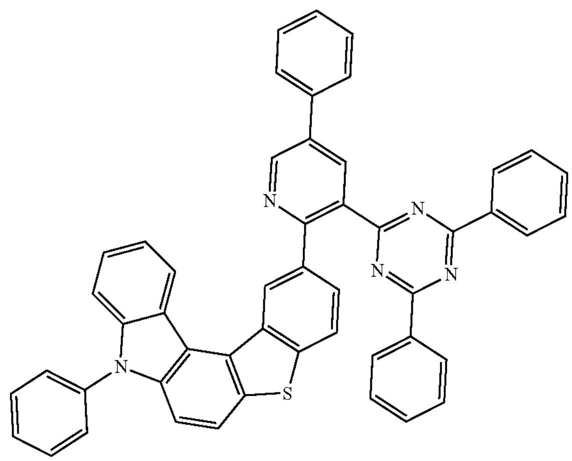
533
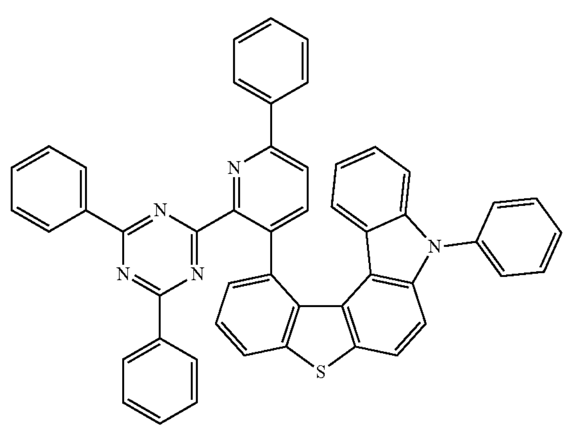

-continued
534
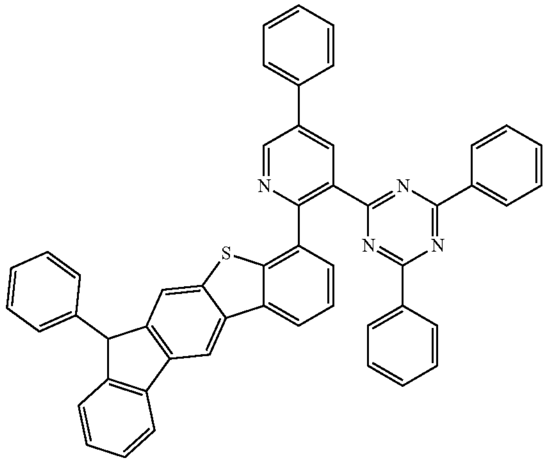
535
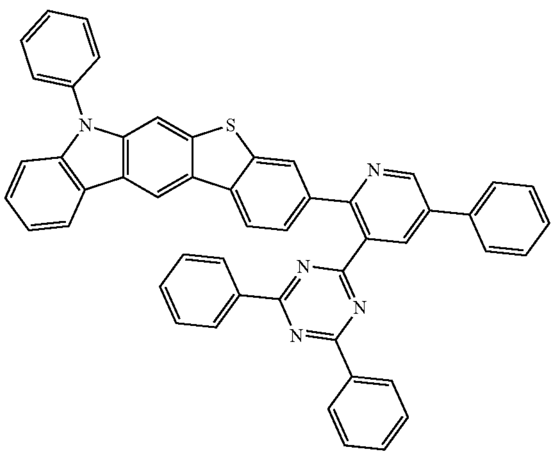
536
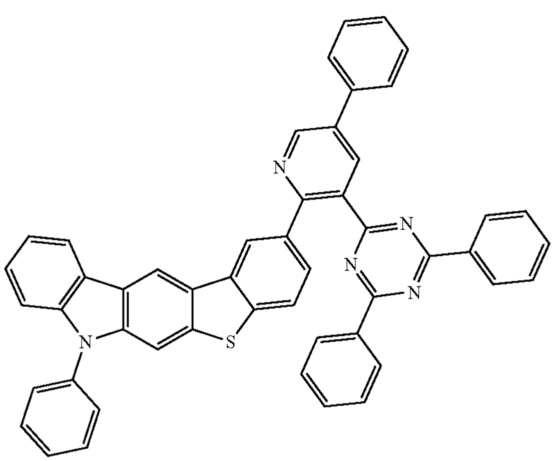
-continued
537
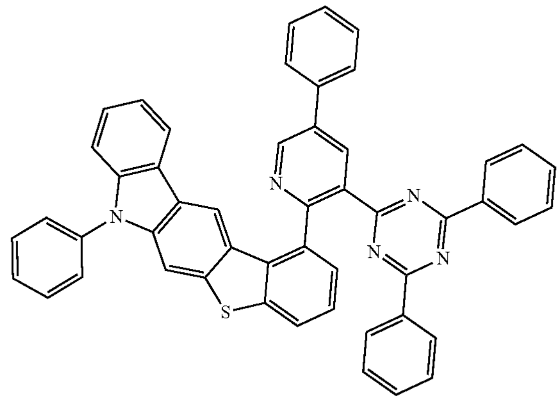
538
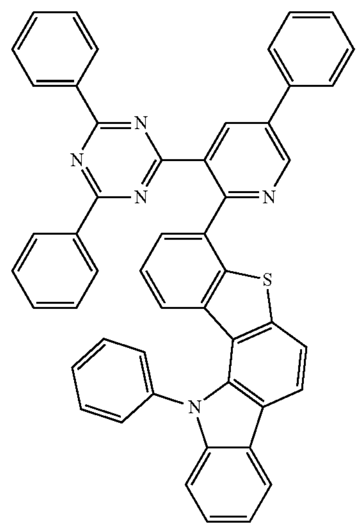
539
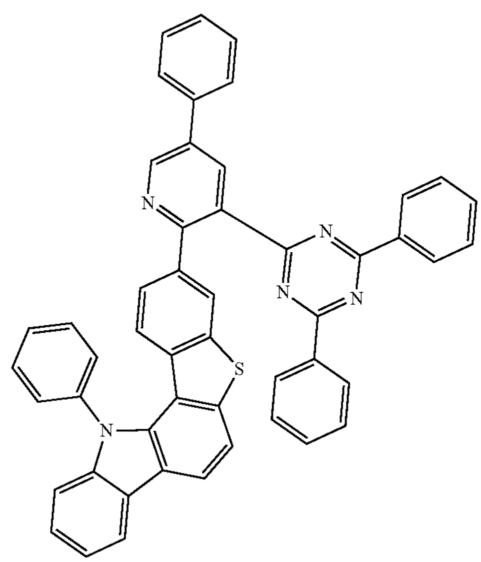

-continued
540
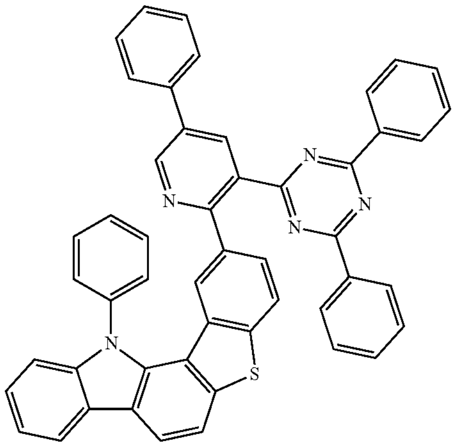
541
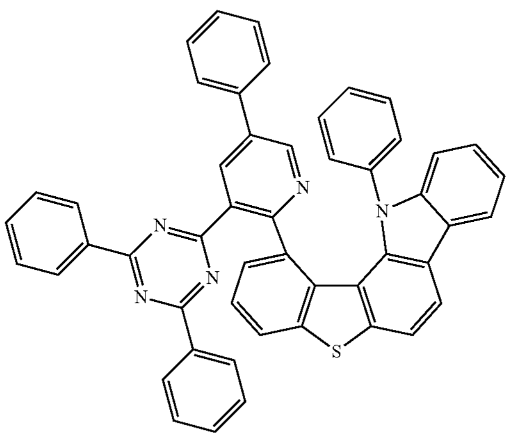
542
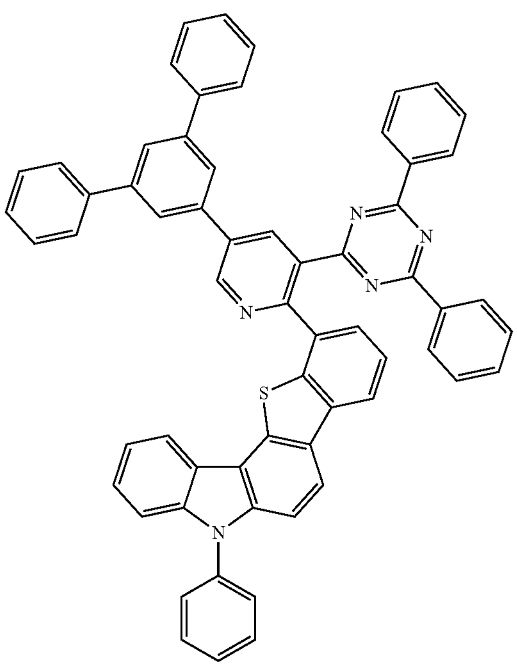
-continued
543
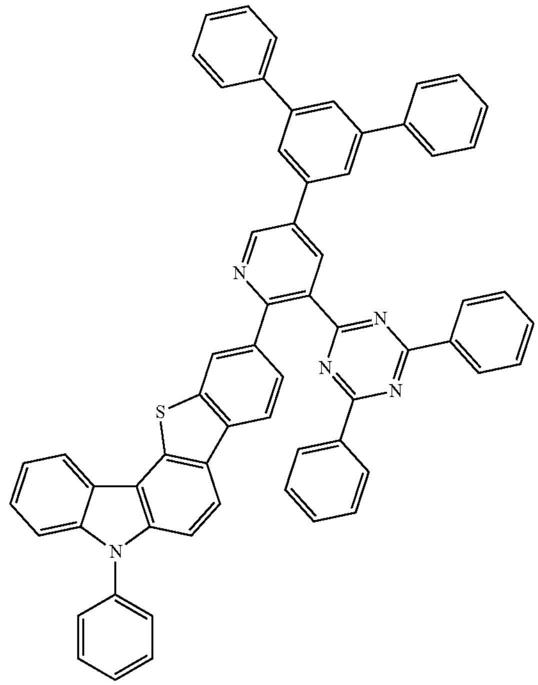
544
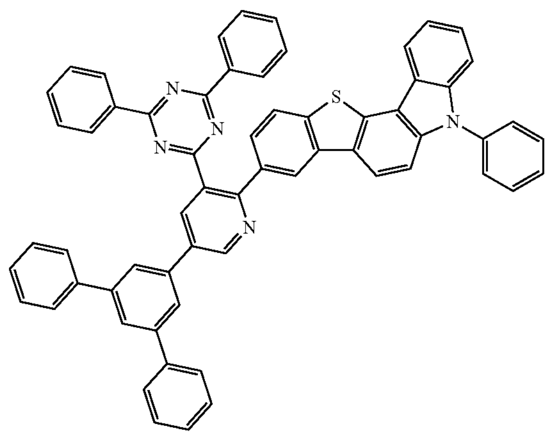
545
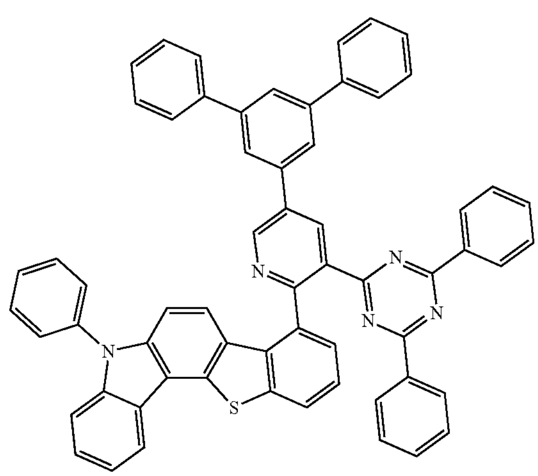

-continued
546
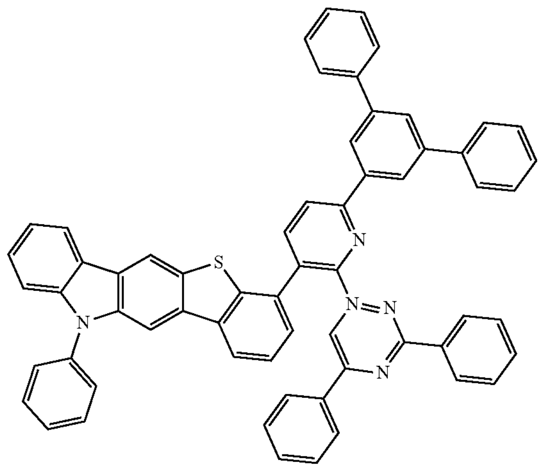
547
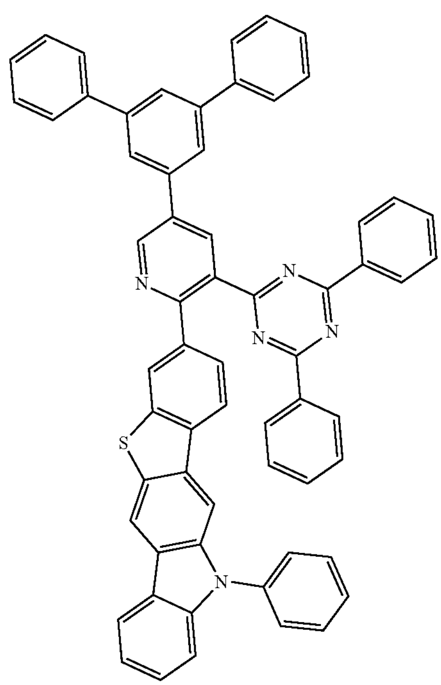
-continued
548
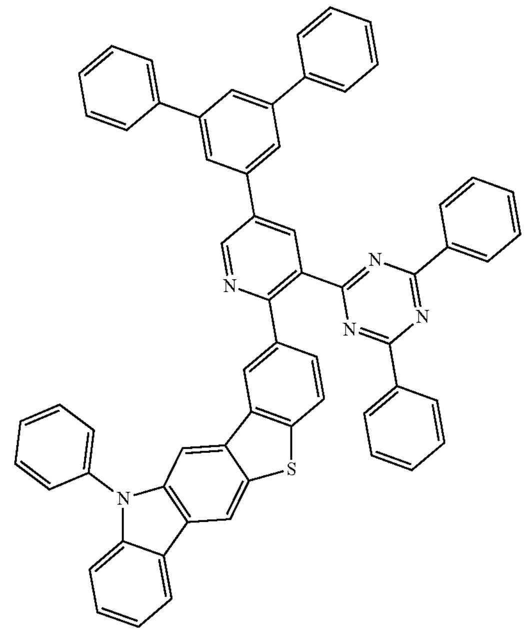
549
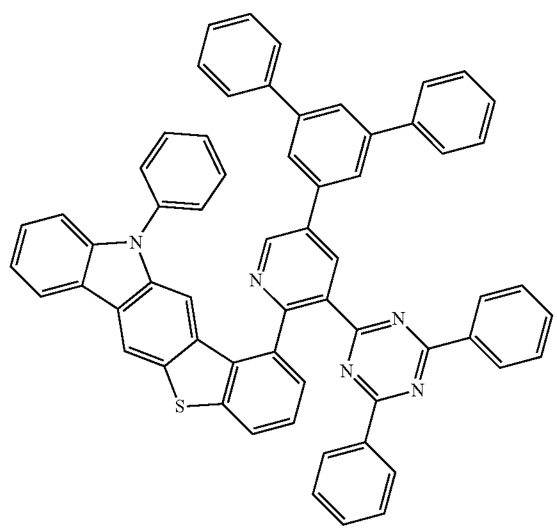
550
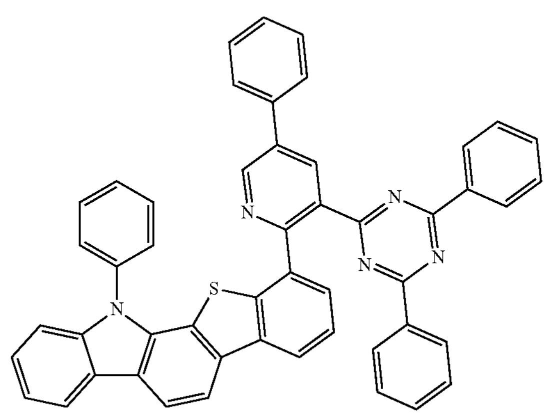

-continued
551
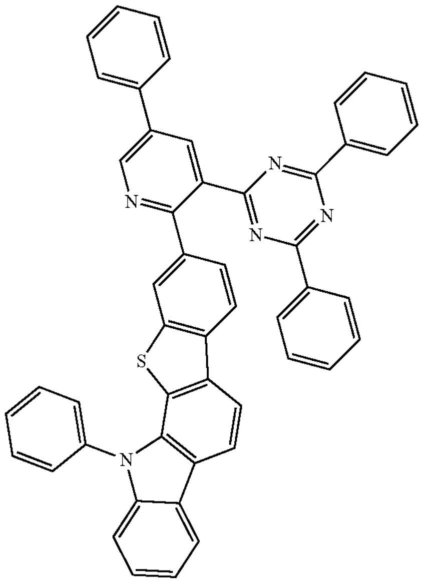
552
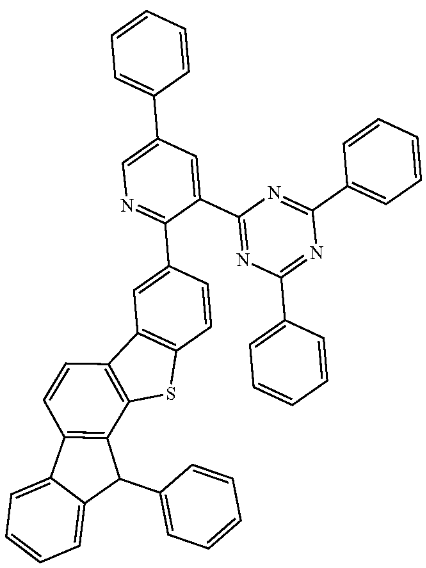
553
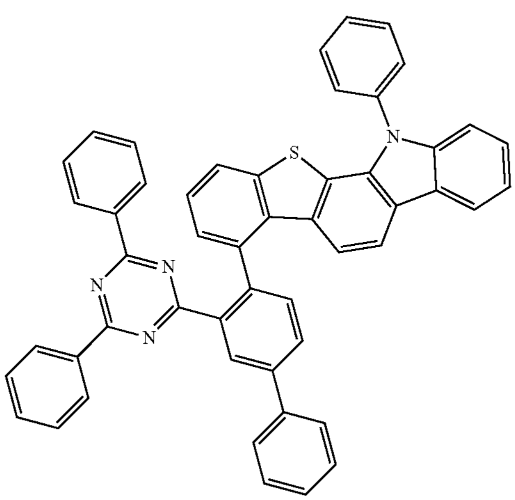
-continued
554
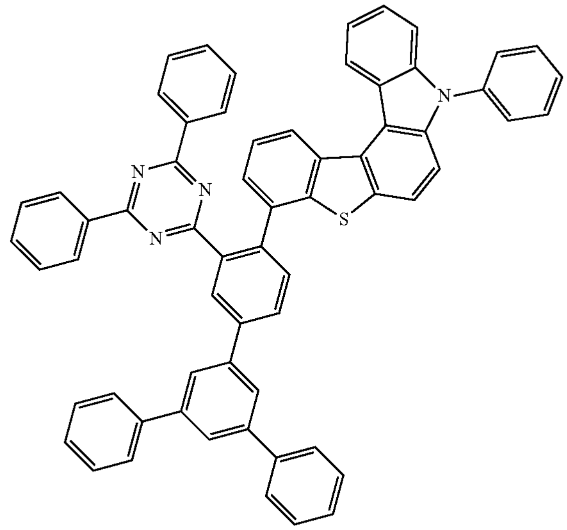
555
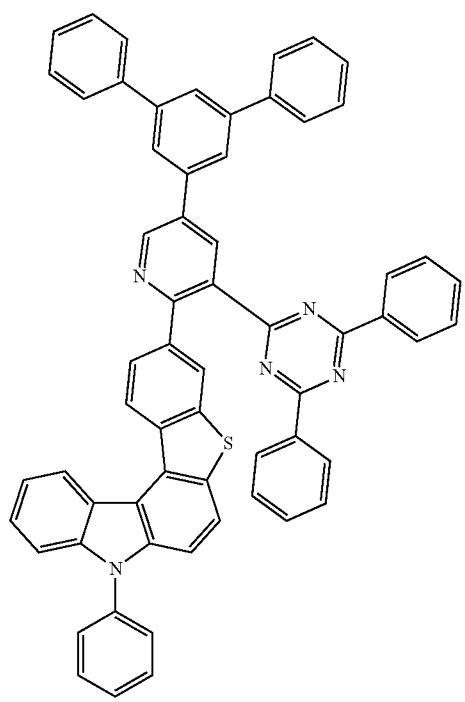

556
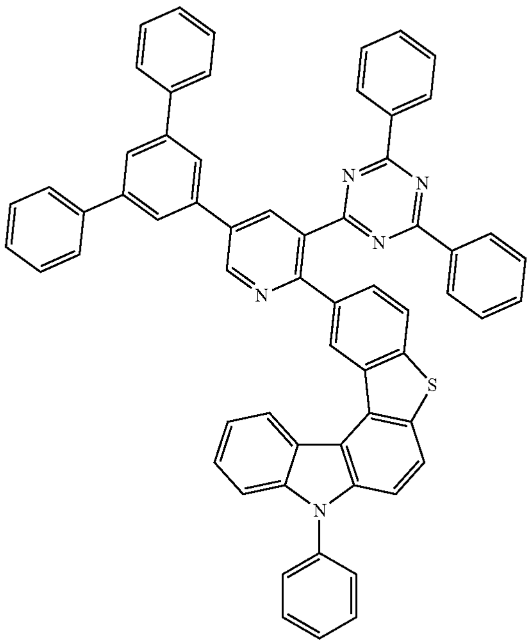
557
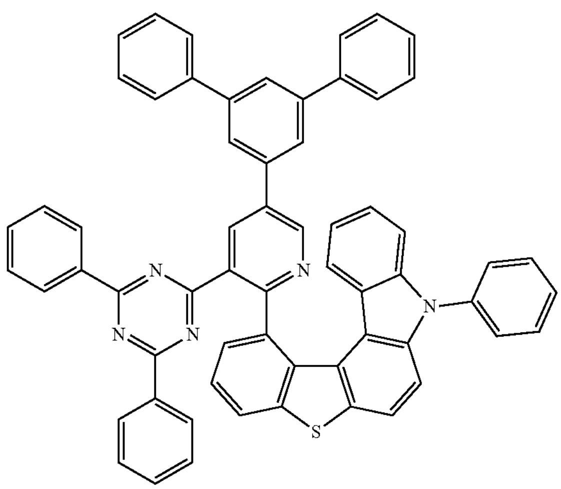
558
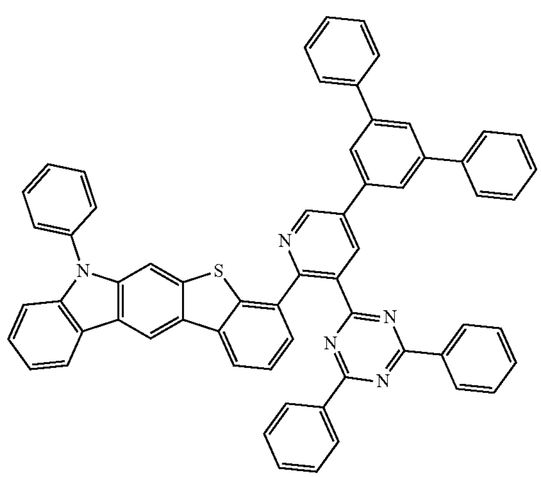
559
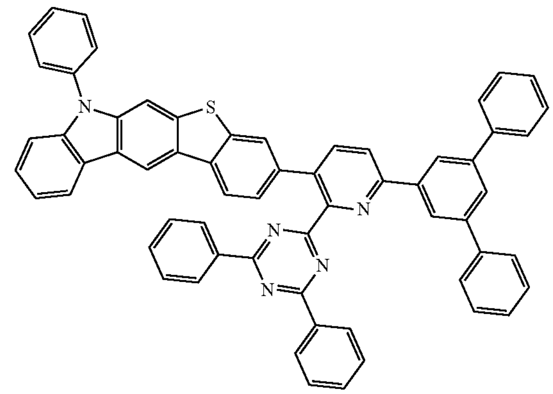
560
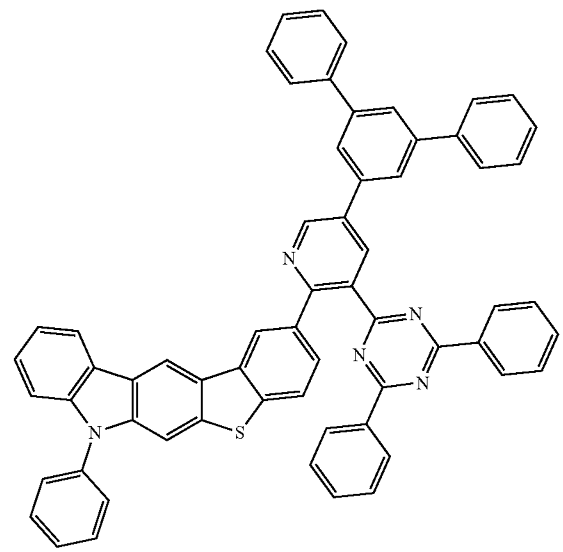
561
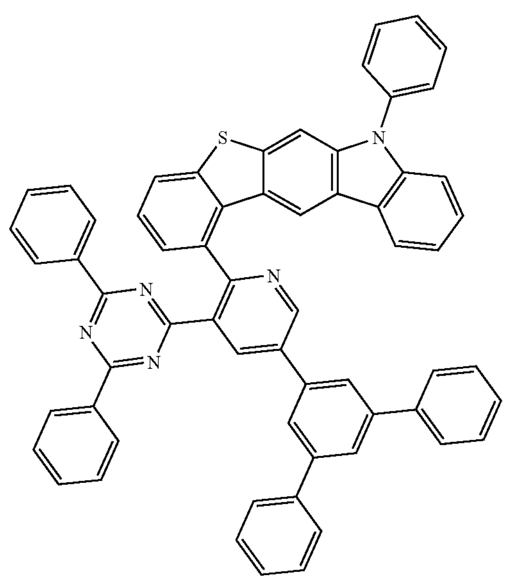

-continued
562
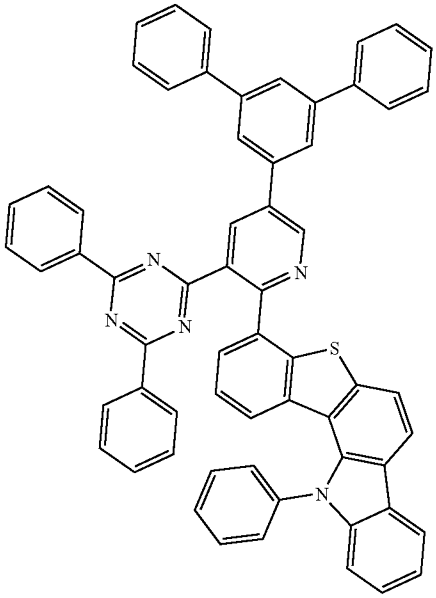
563
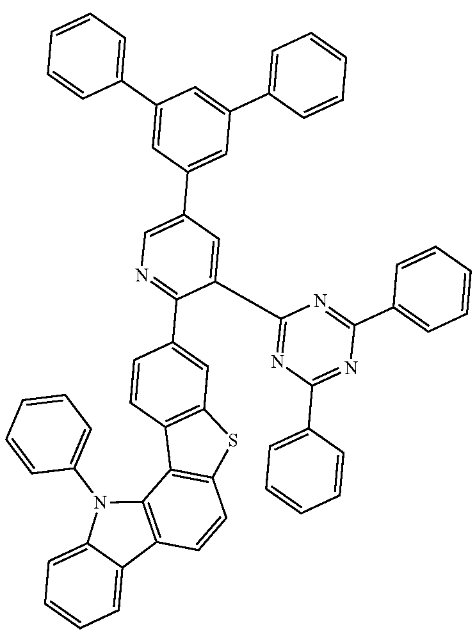
-continued
564
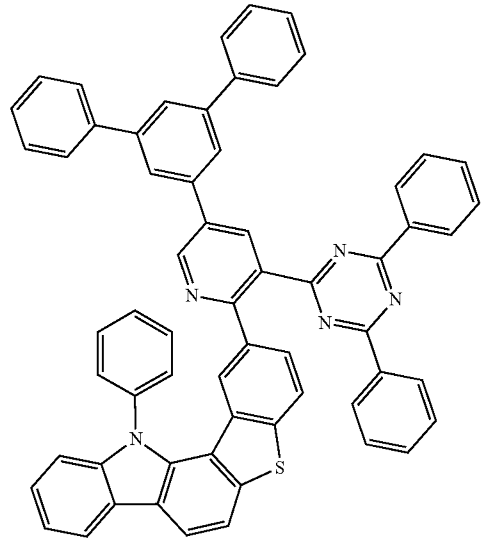
565
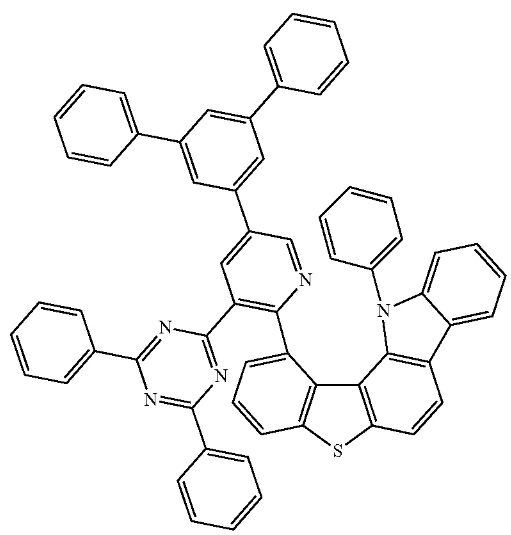

-continued
566
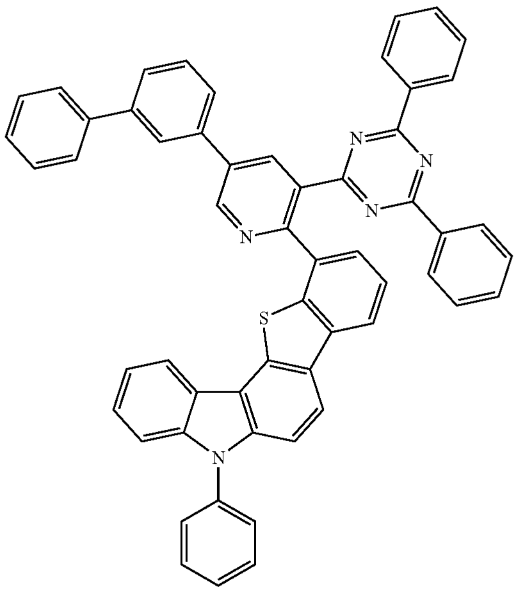
567
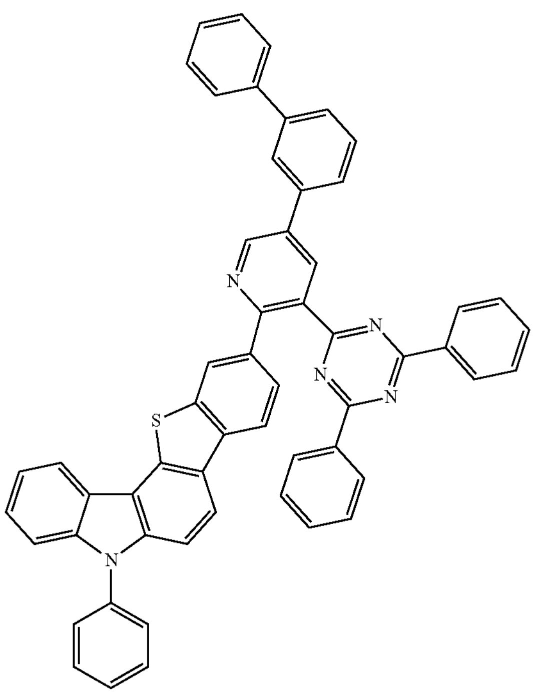
-continued
568
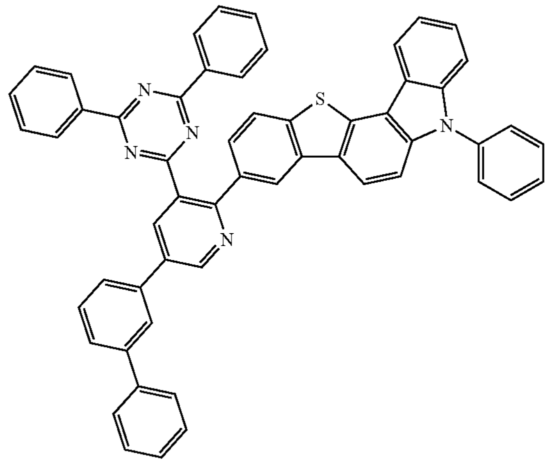
569
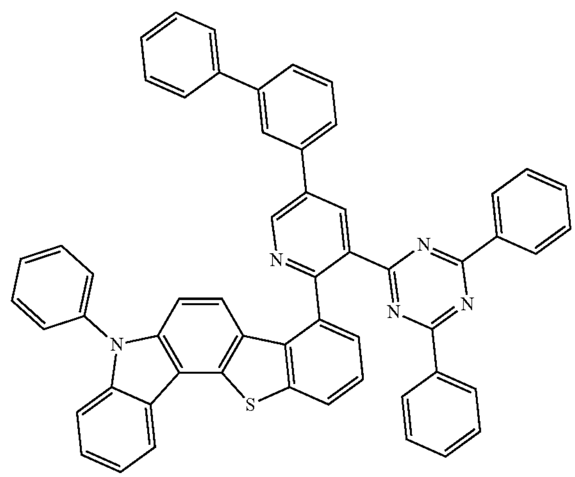
570
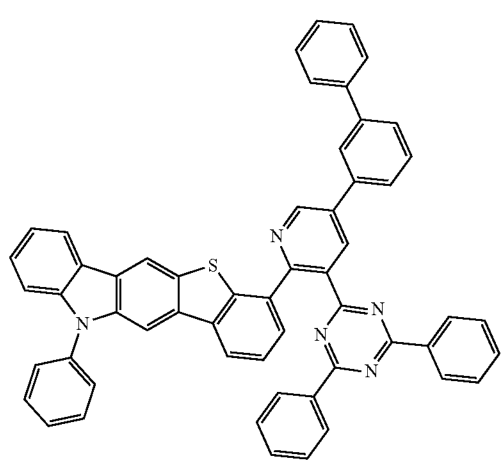

-continued
571
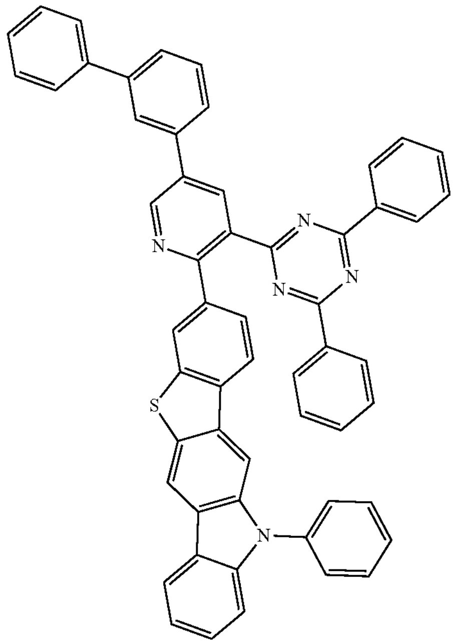
572
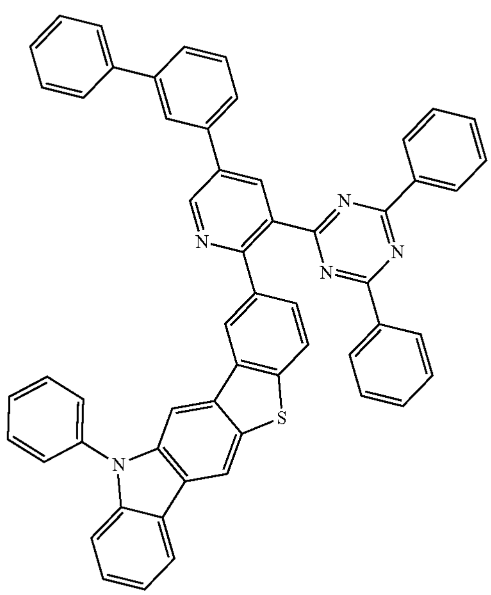
-continued
573
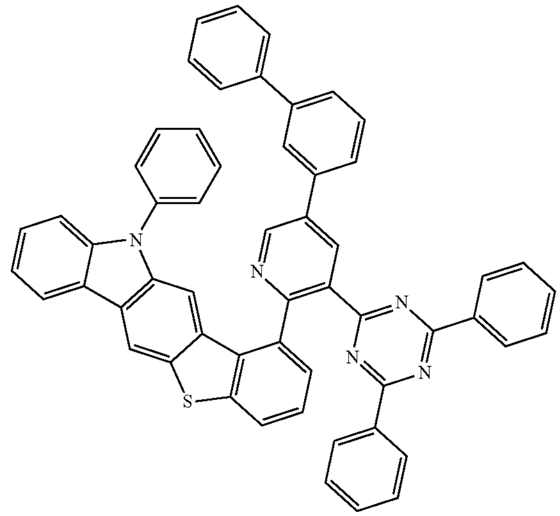
574
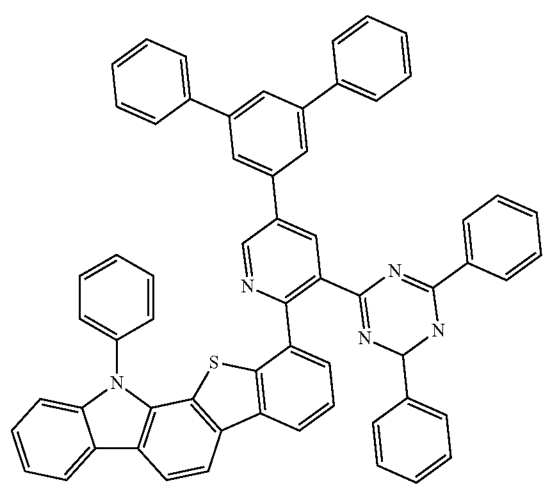

-continued
575
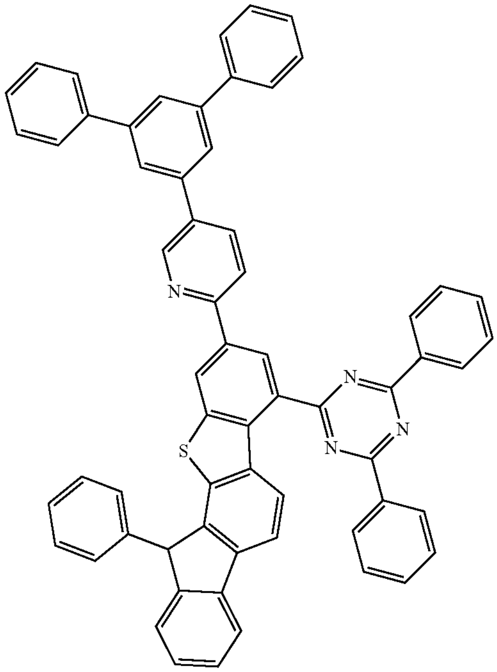
576
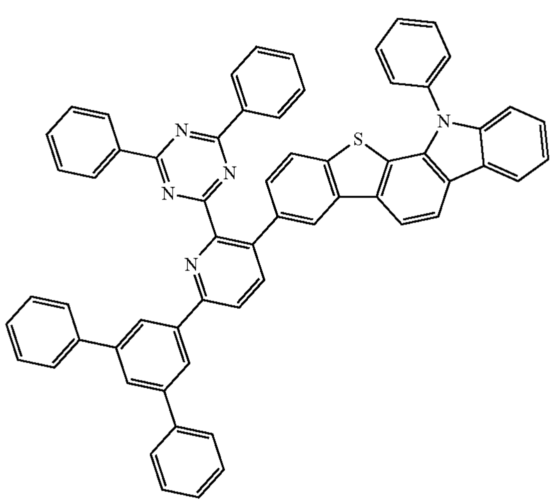
-continued
577
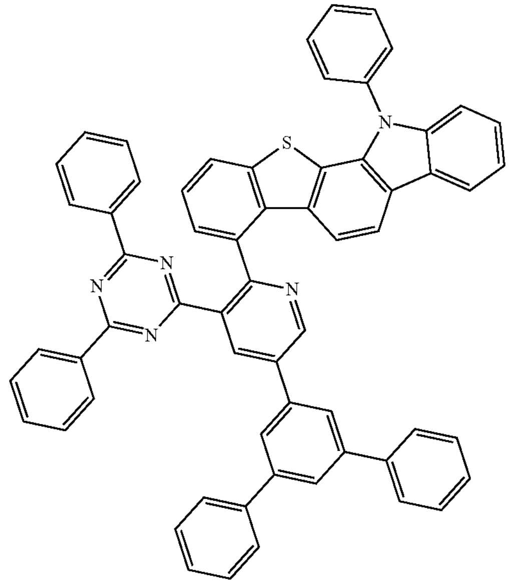
578
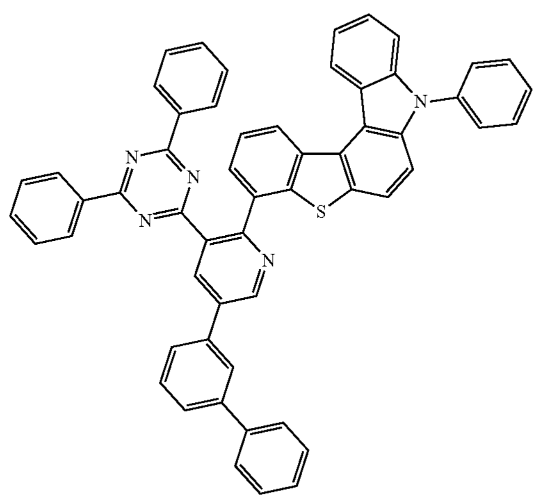

-continued
579
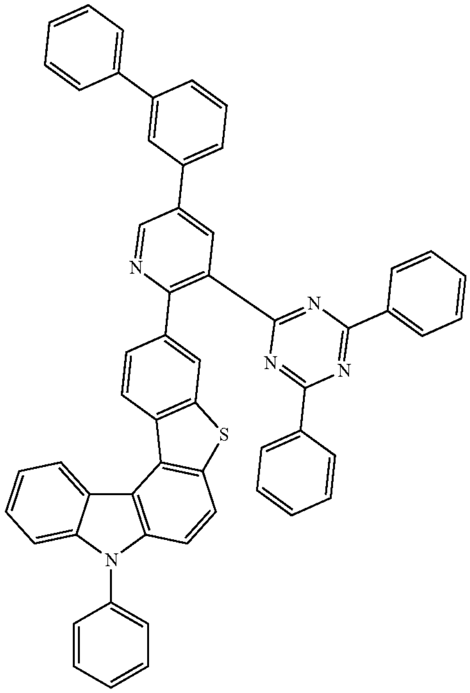
580
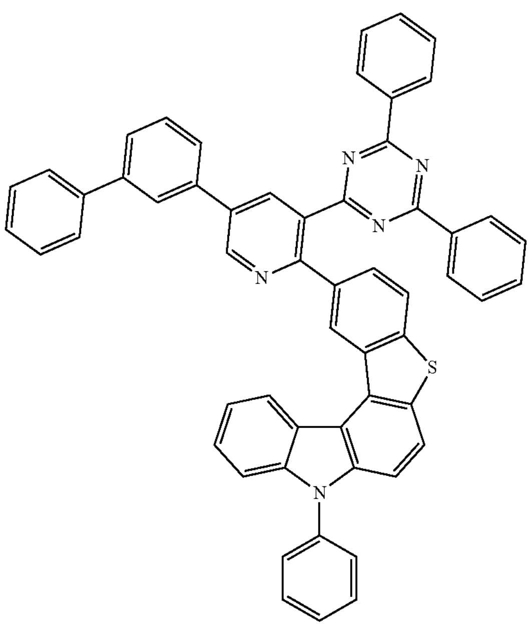
-continued
581
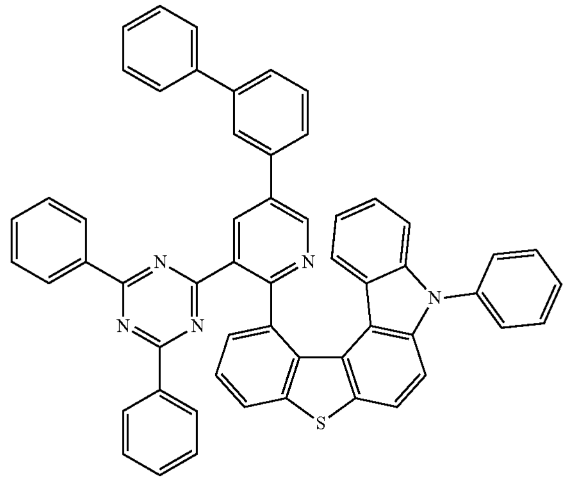
582
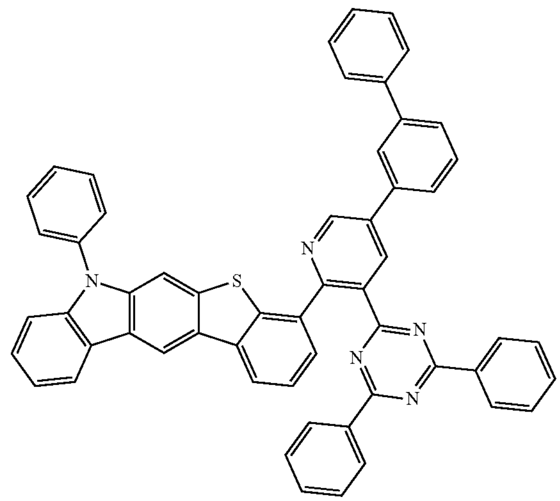
583
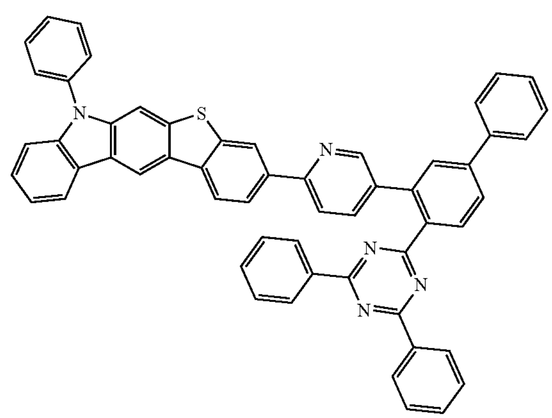

-continued
584
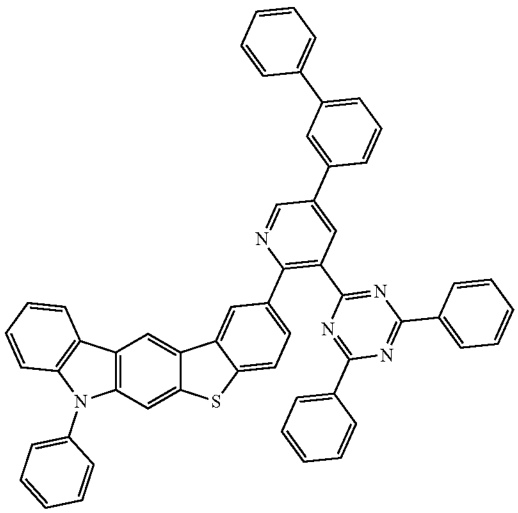
585
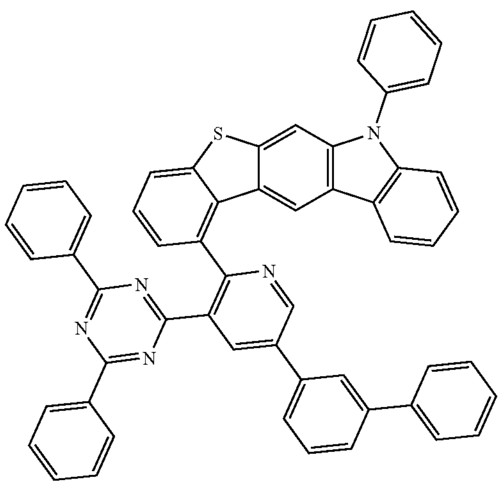
586
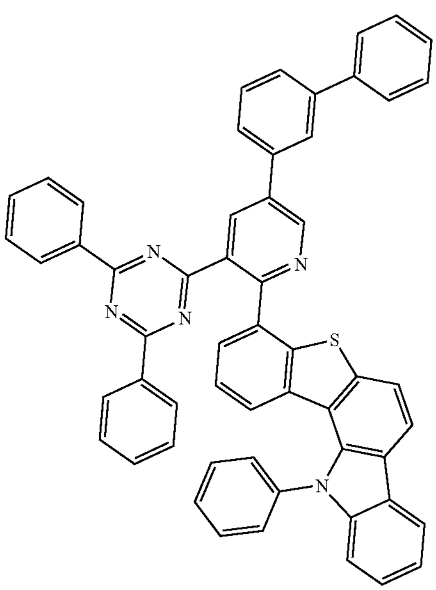
-continued
587
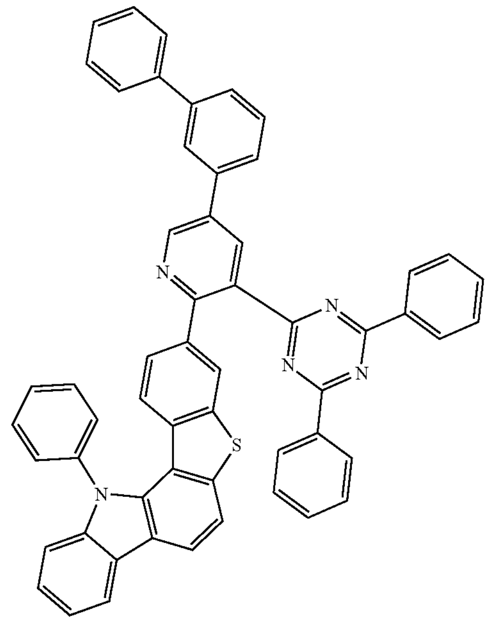
588
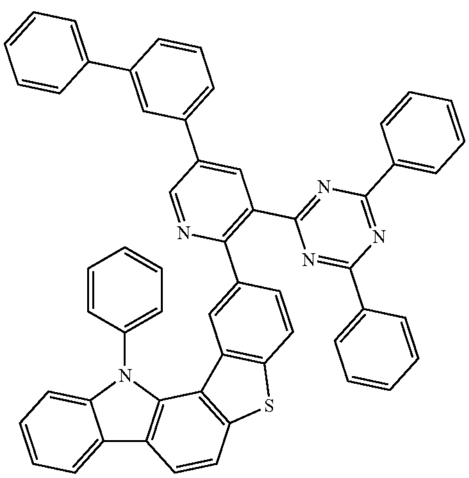
589
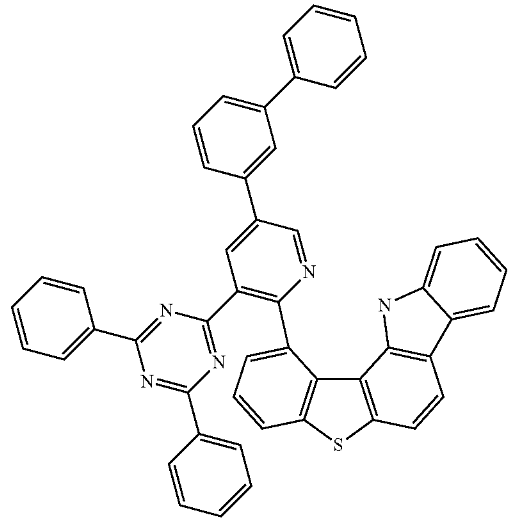

590
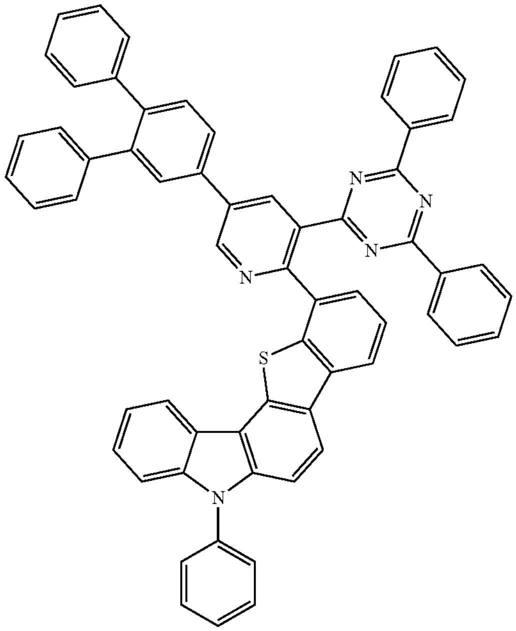
591
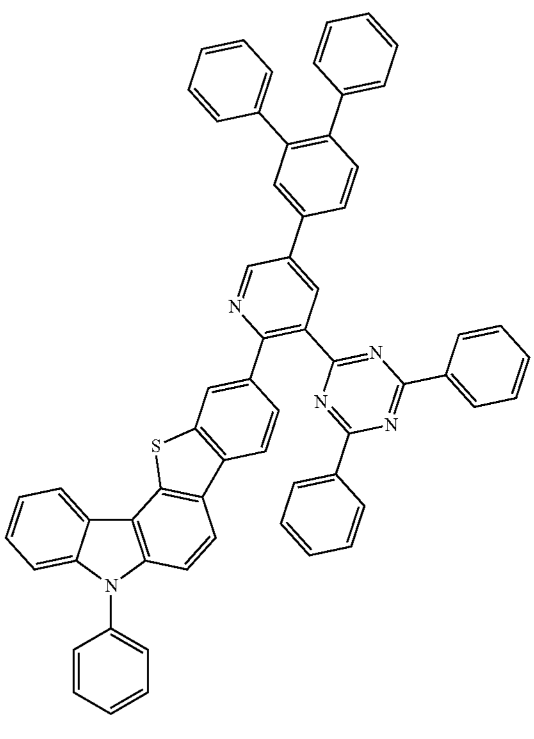
592
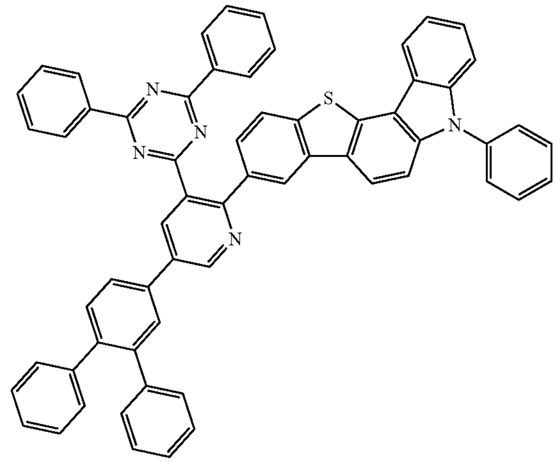
593
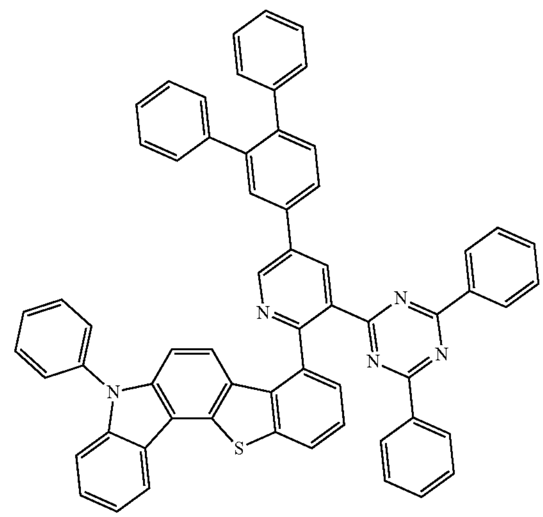
594
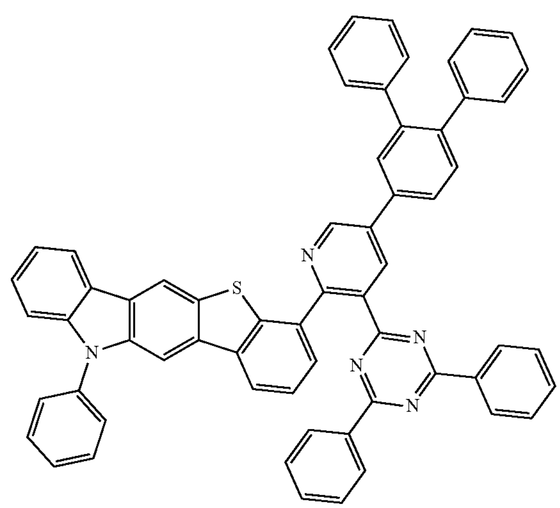

595
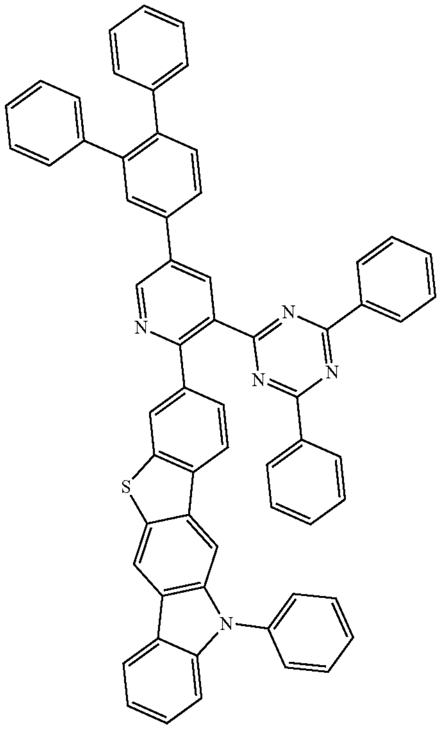
596
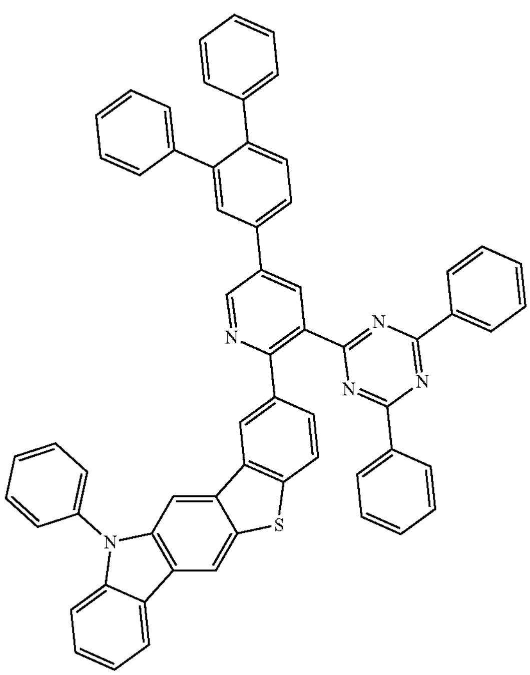
597
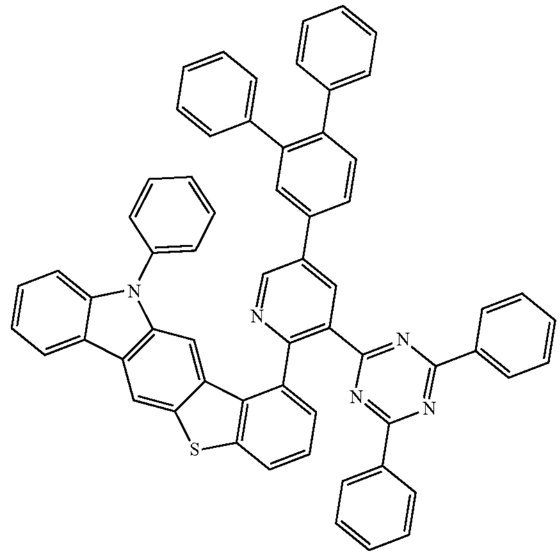
598
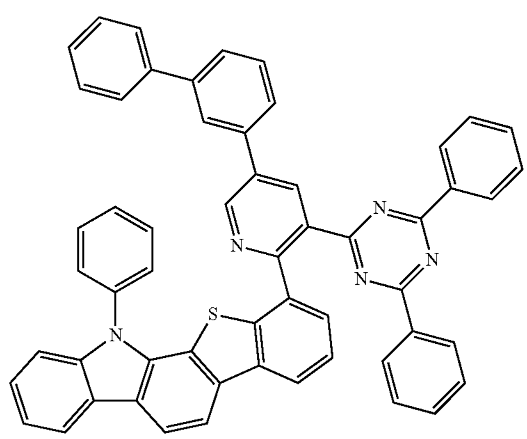

-continued
599
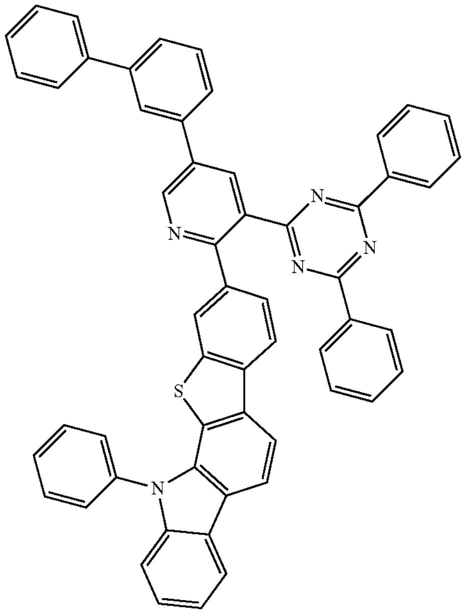
600
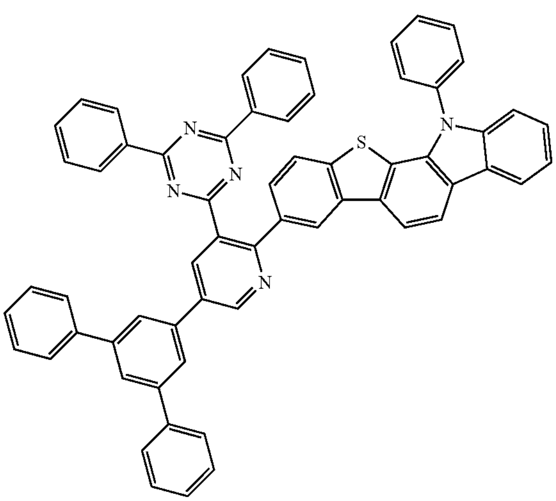
-continued
601
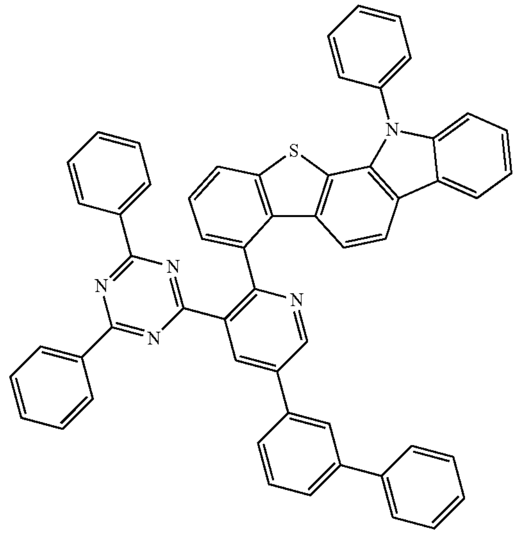
602
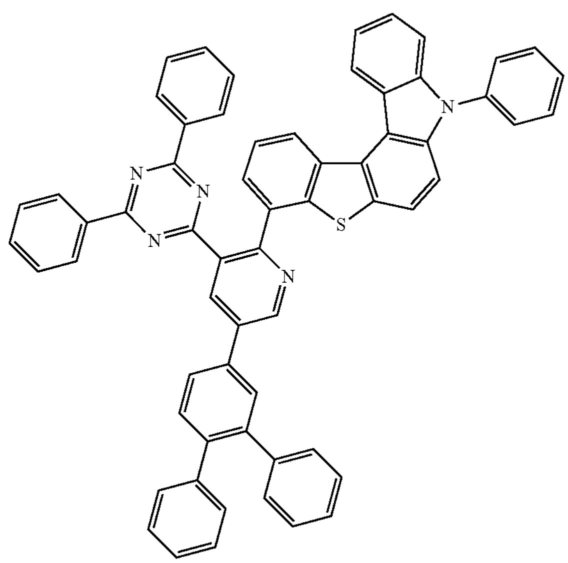

-continued
603
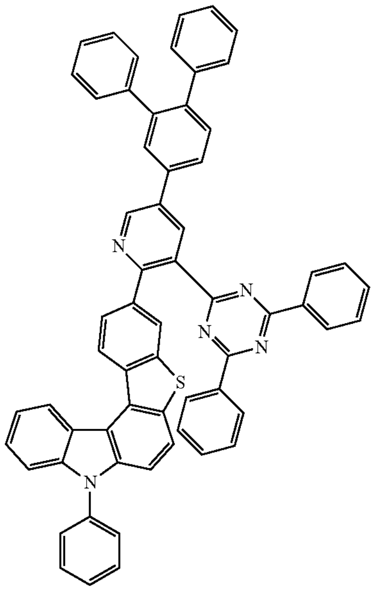
604
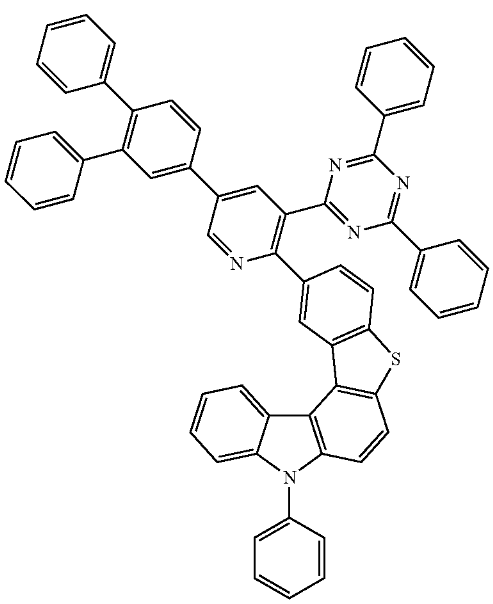
-continued
605
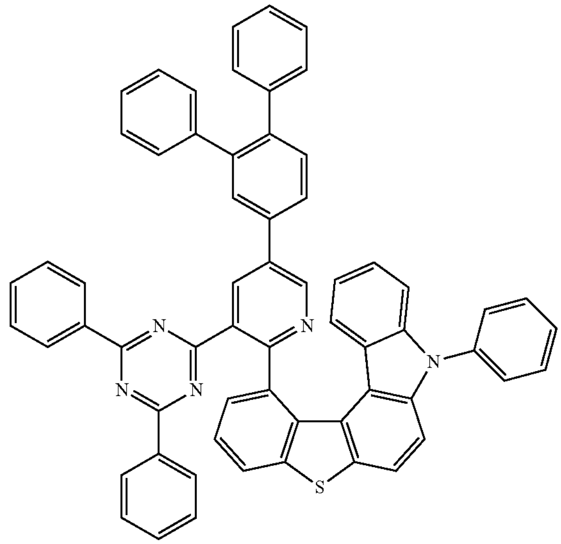
606
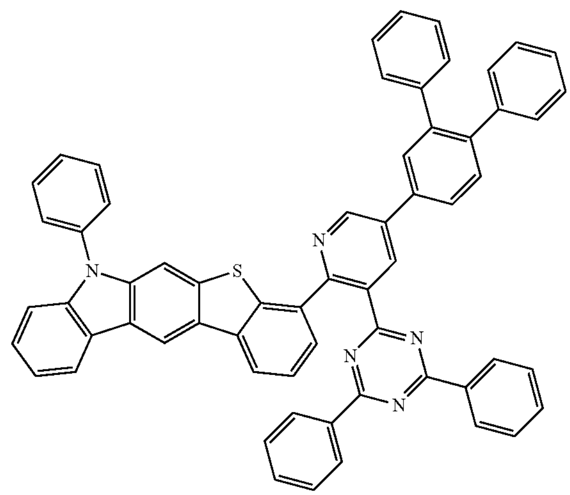
607
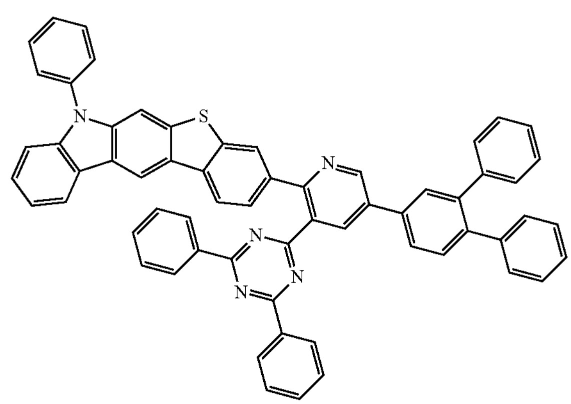

-continued
608
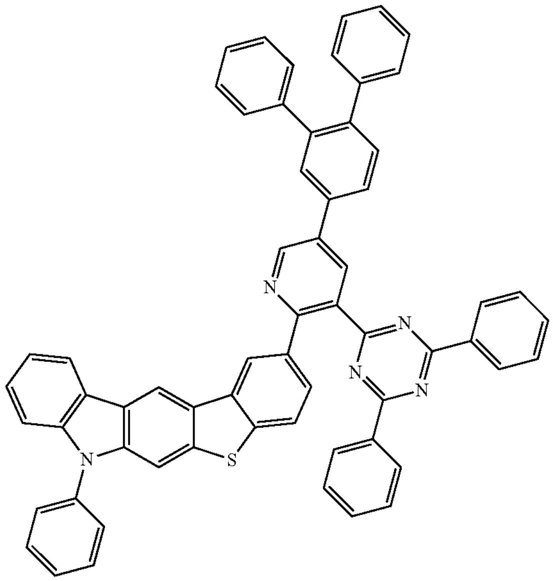
610
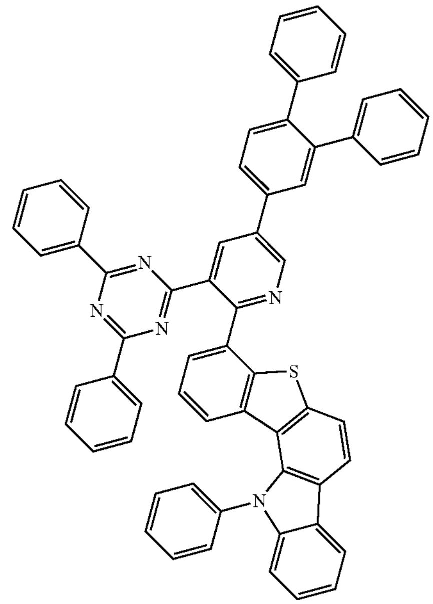
609
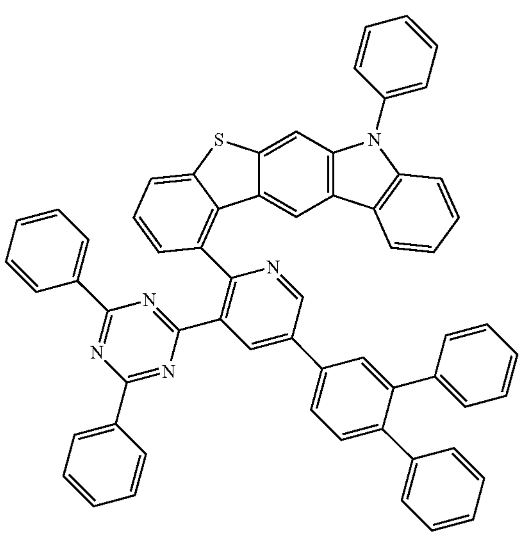
611
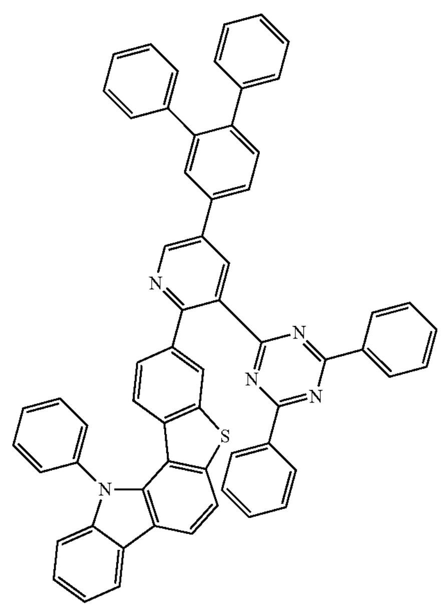

-continued
612
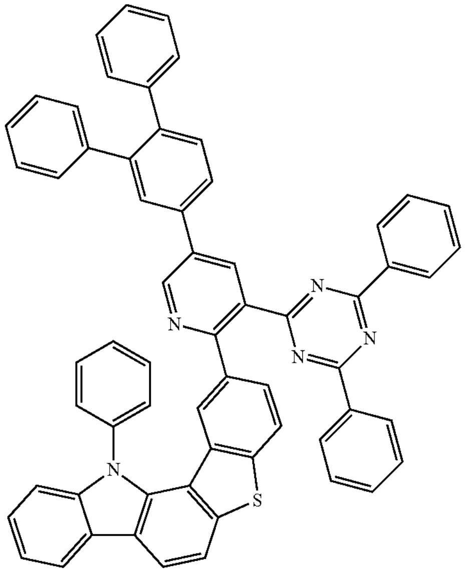
613
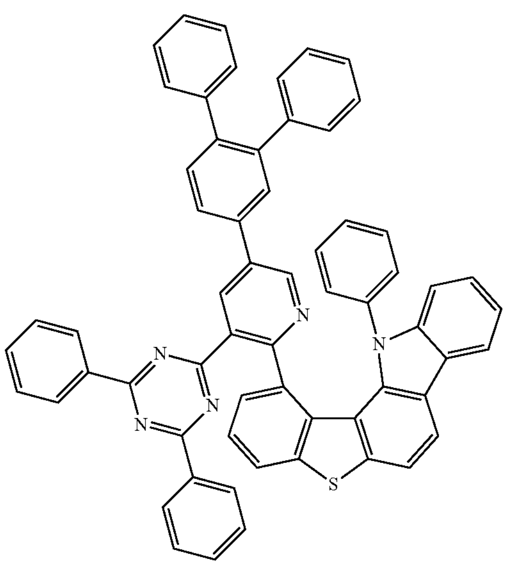
-continued
614
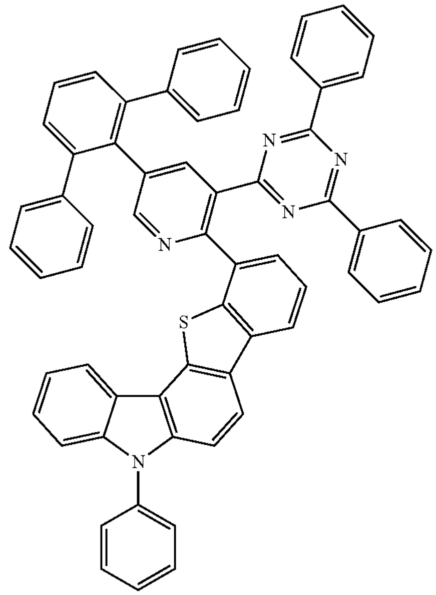
615
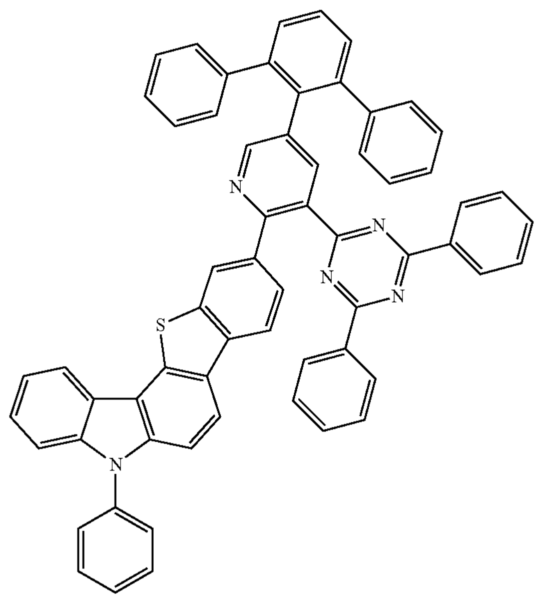
616
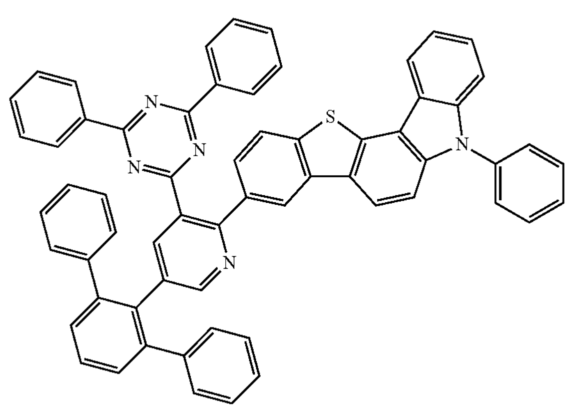

-continued
617
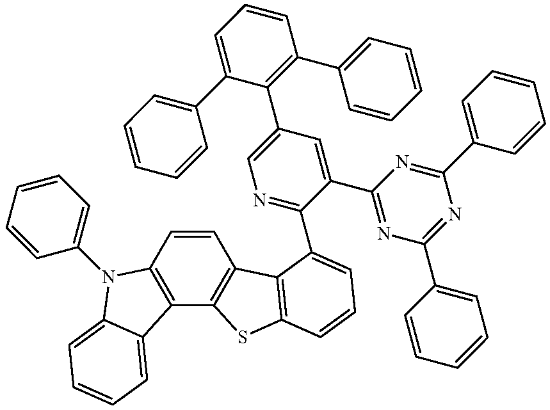
618
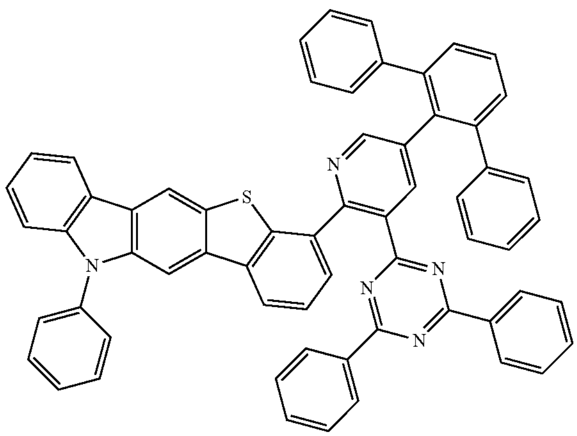
619
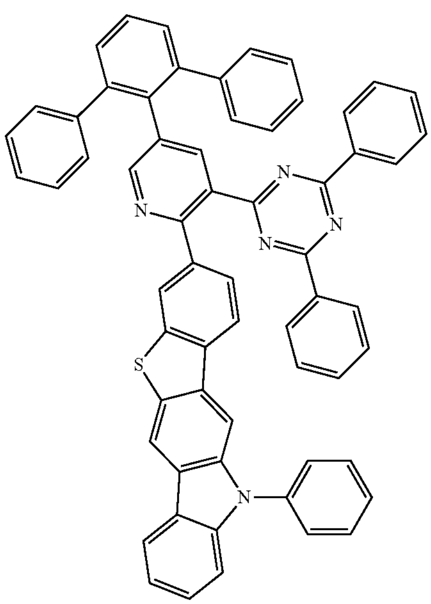
-continued
620
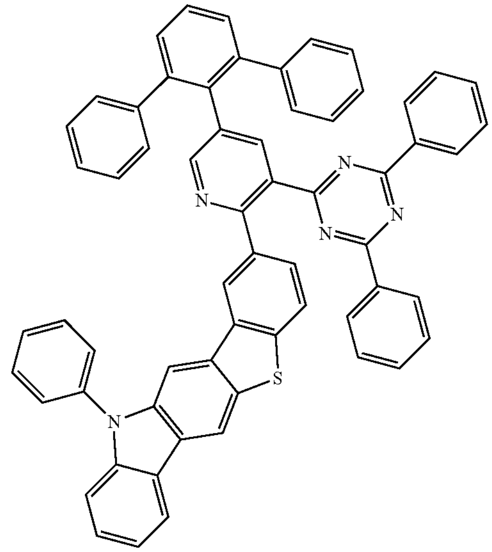
621
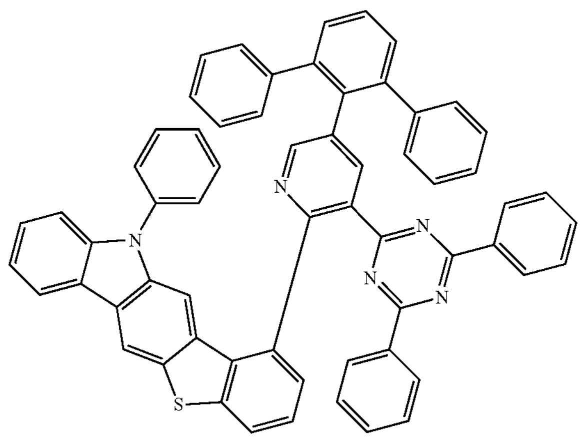
622
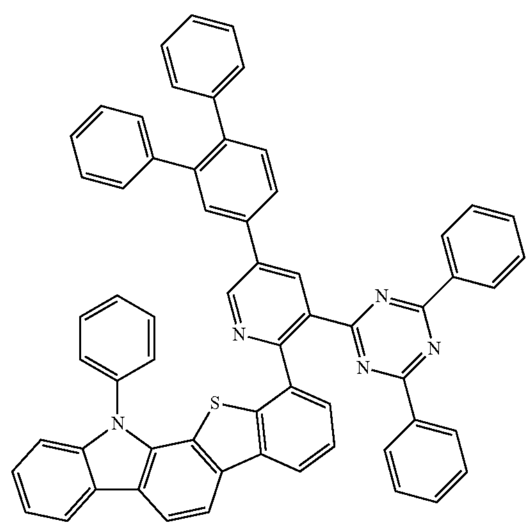

-continued
623
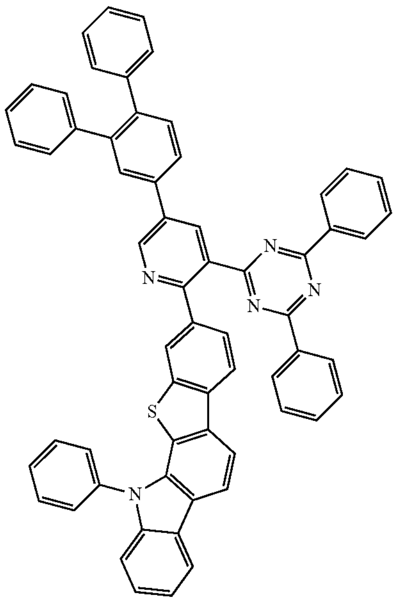
624
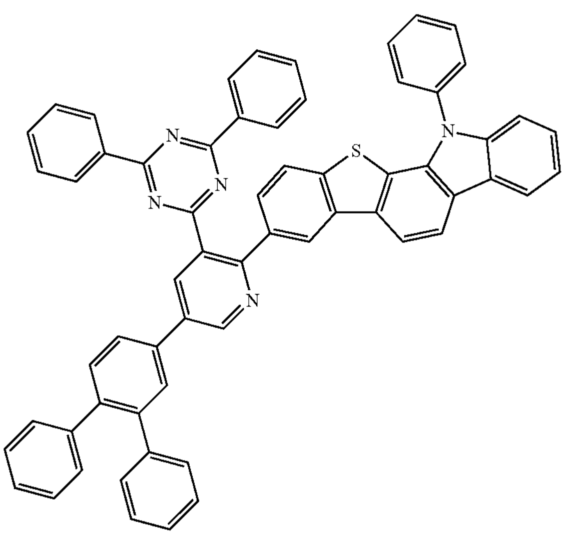
-continued
625
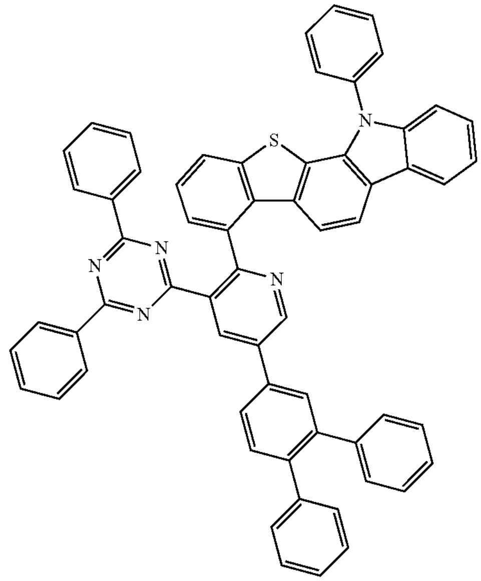
626
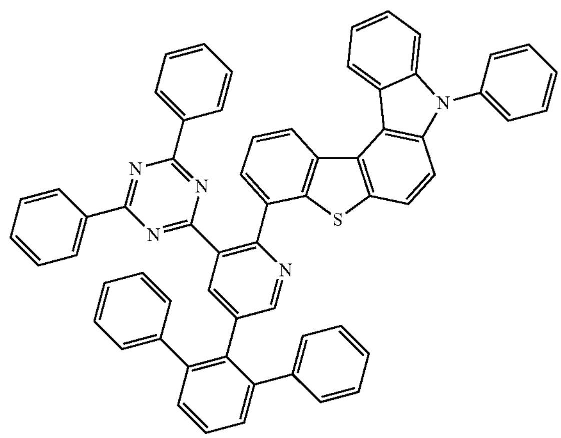
627
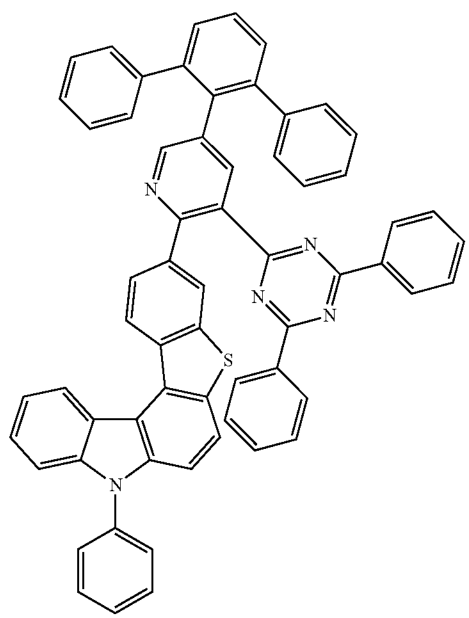

-continued
628
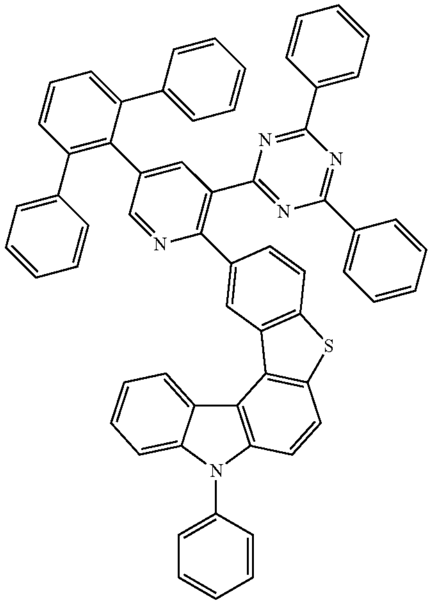
629
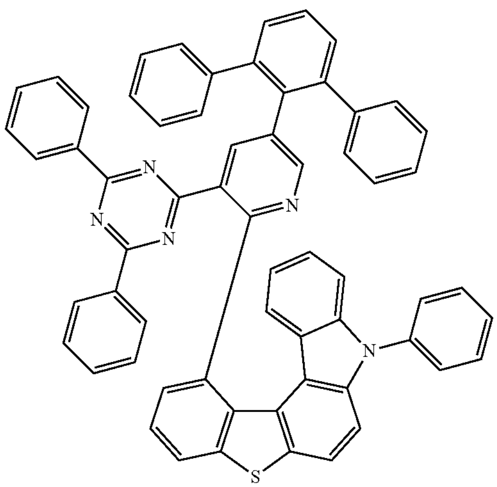
630
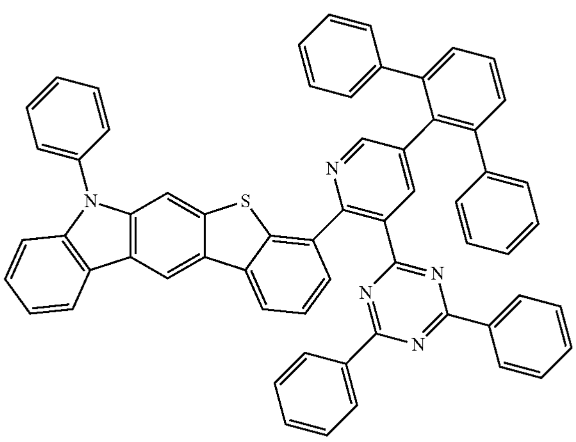
-continued
631
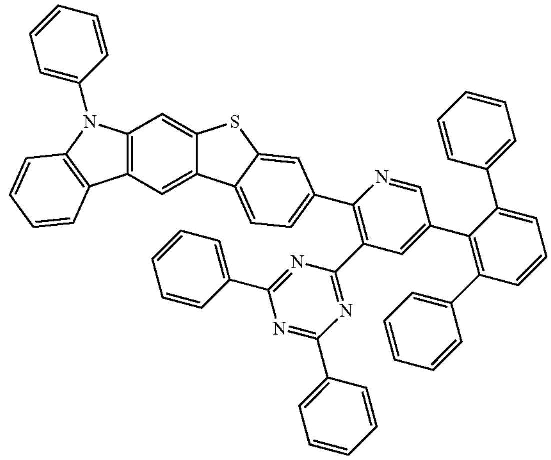
632
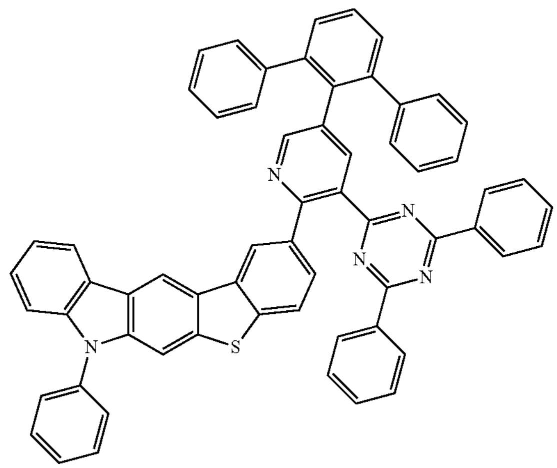
633
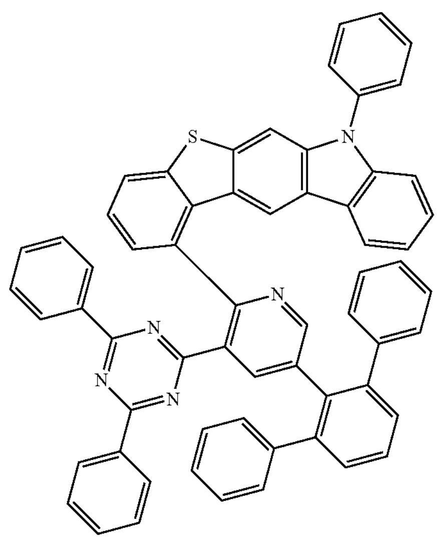

-continued
634
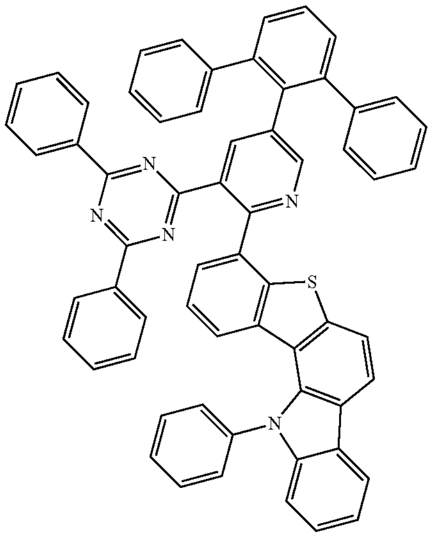
635
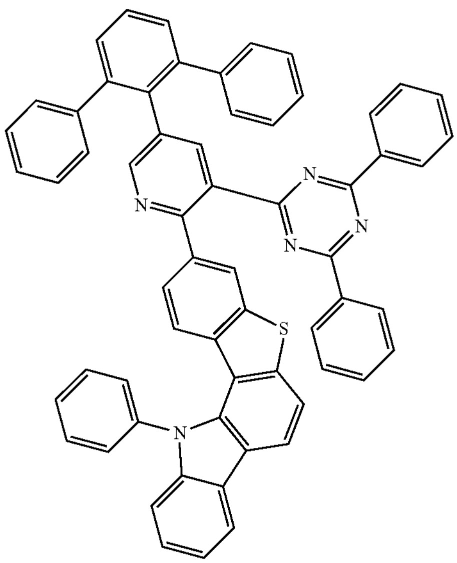
636
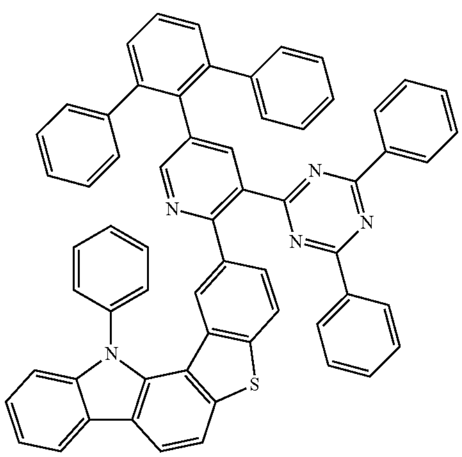
-continued
637
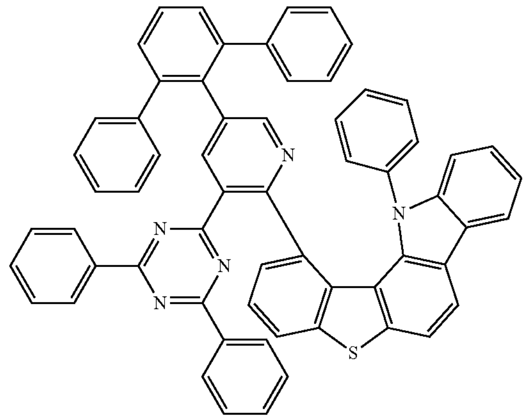
638
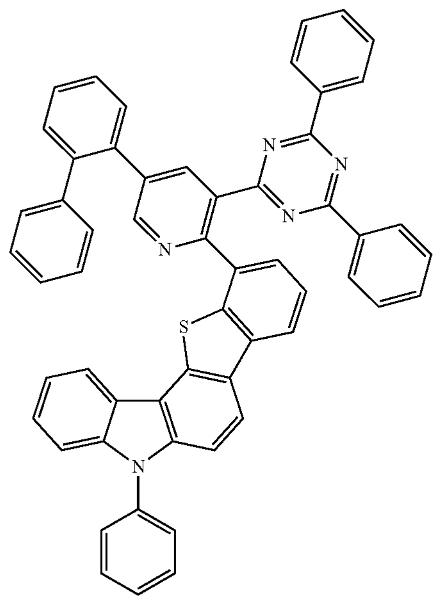
639
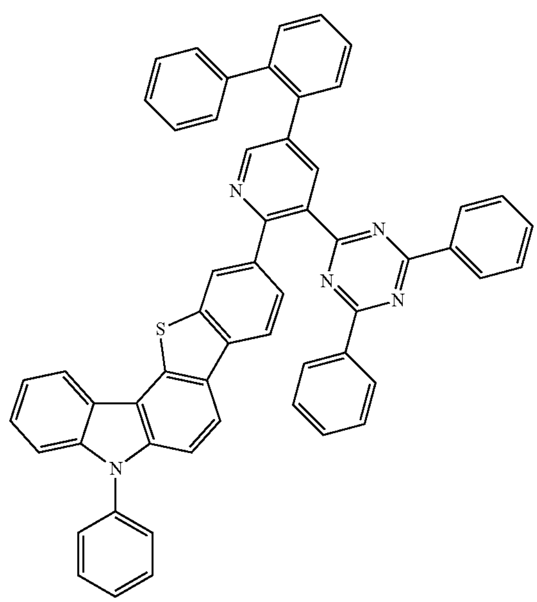

-continued
640
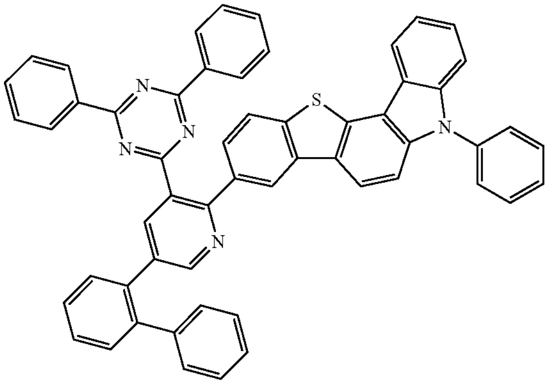
641
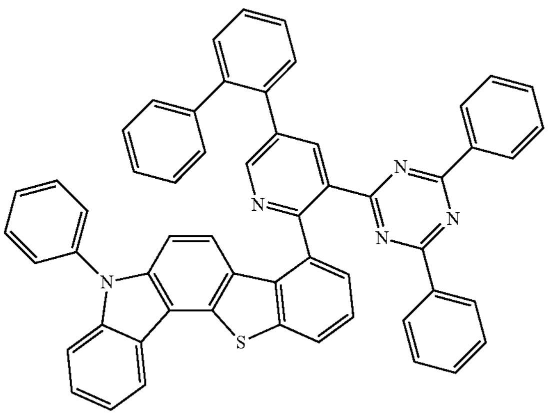
642
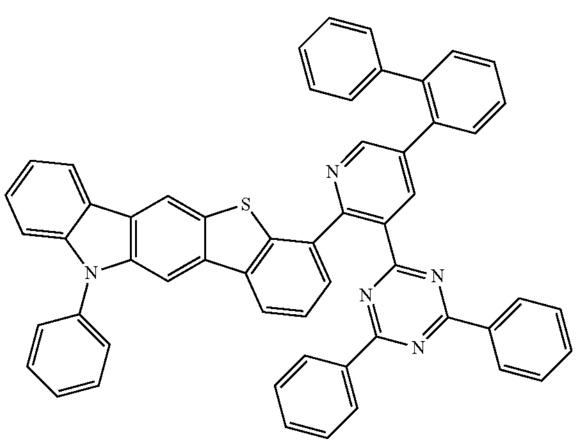
-continued
643
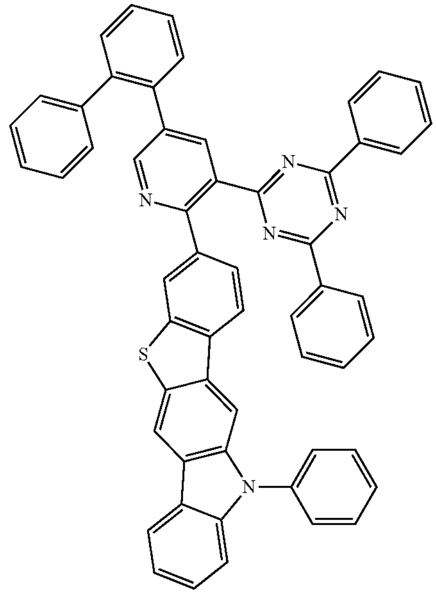
644
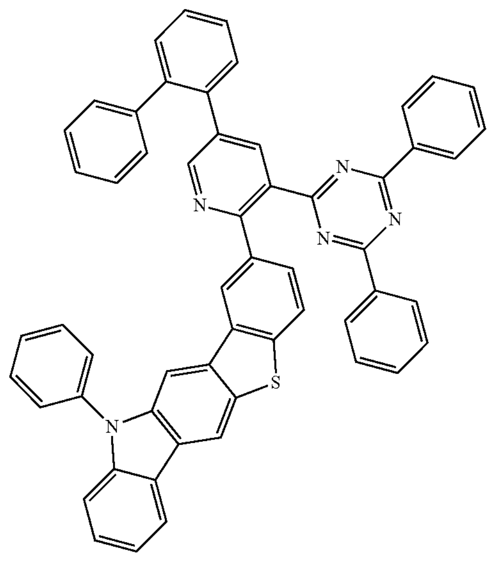
645
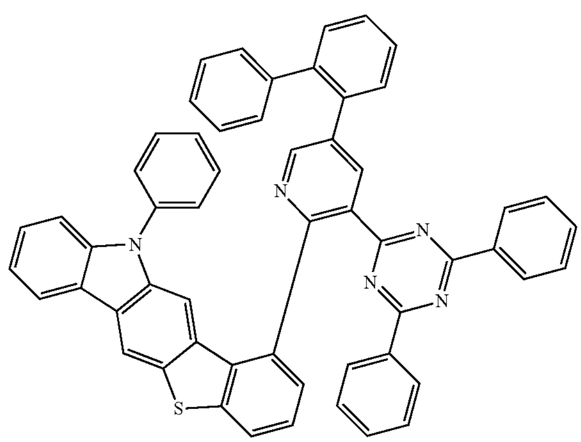

646
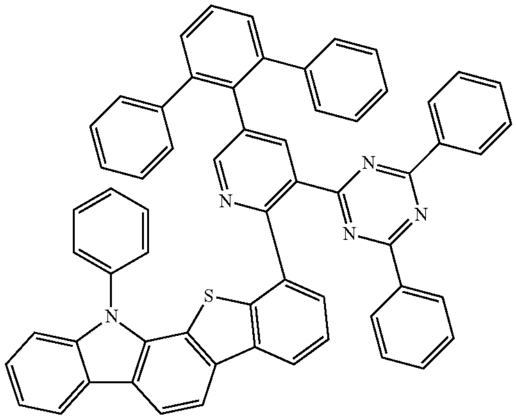
647
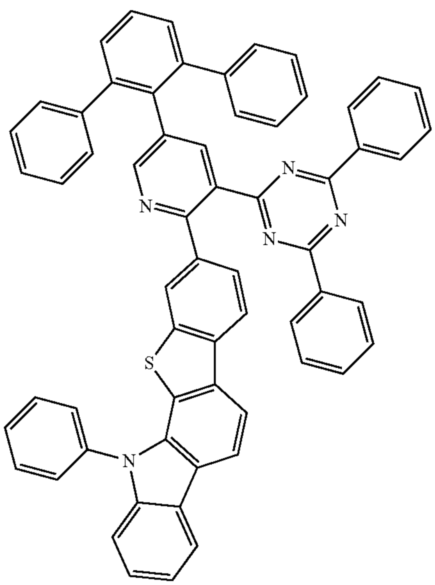
648
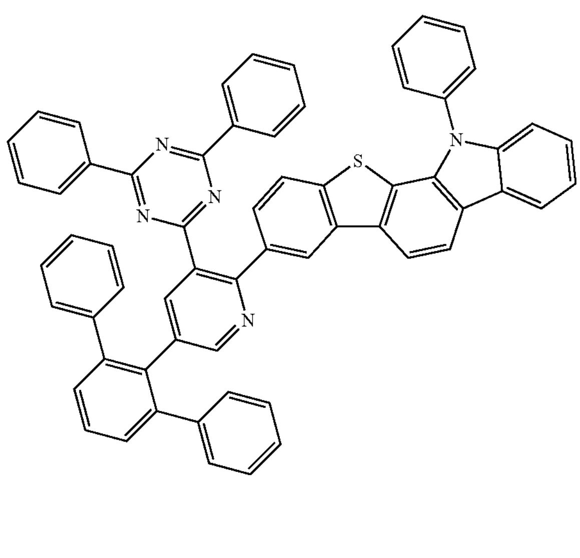
649
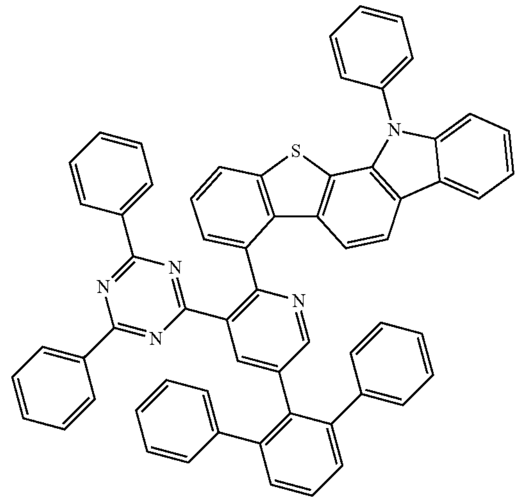
650
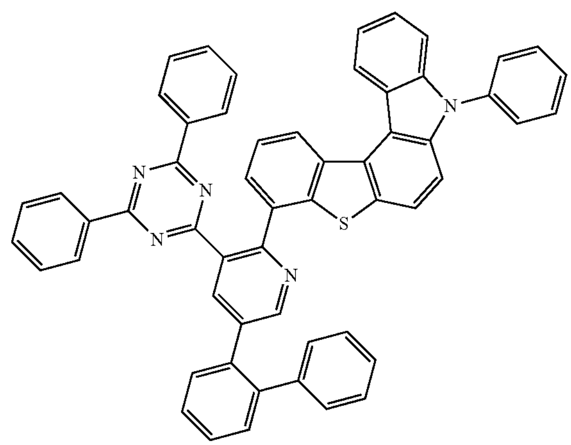
651
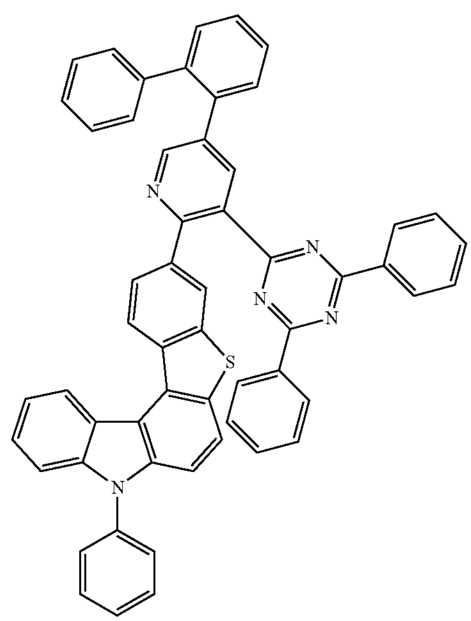

-continued
652
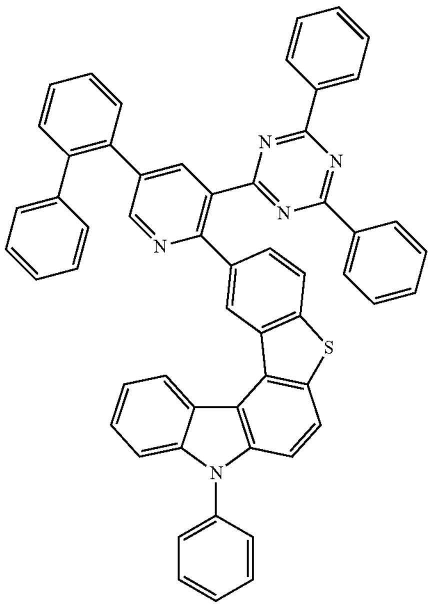
653
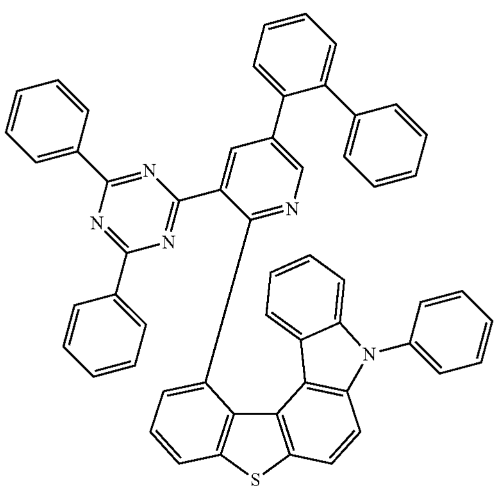
654
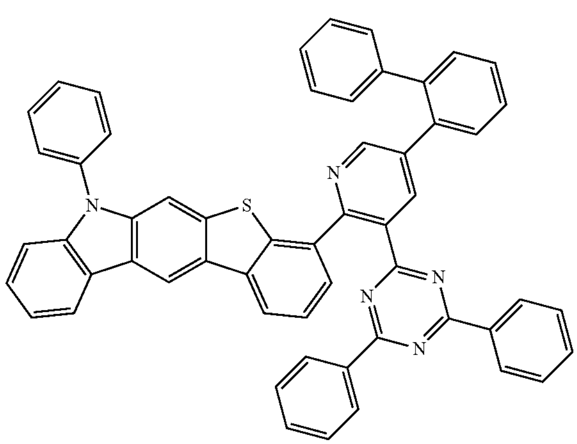
-continued
655
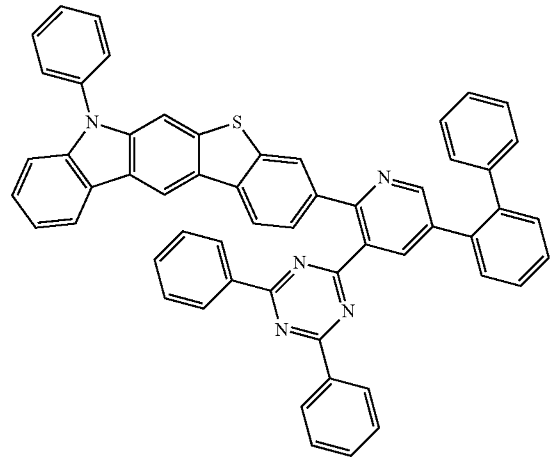
656
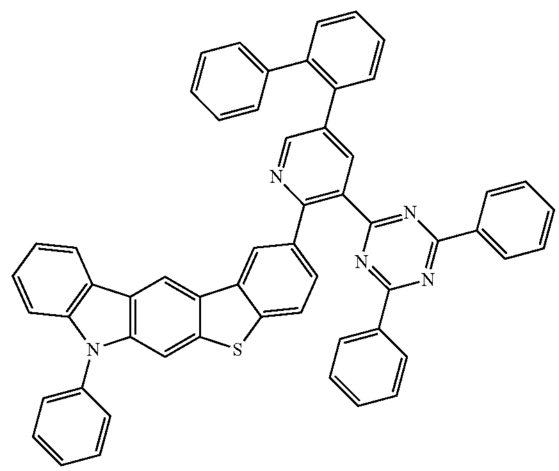
657
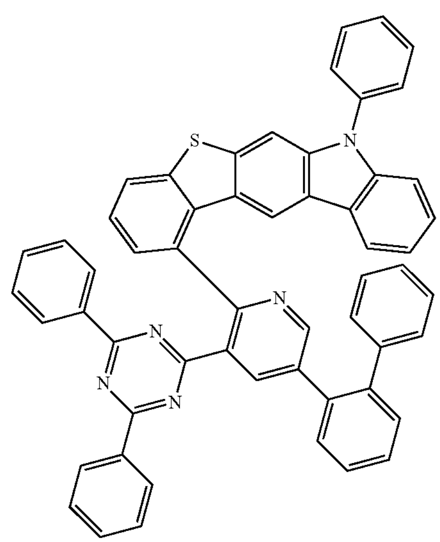

-continued
658
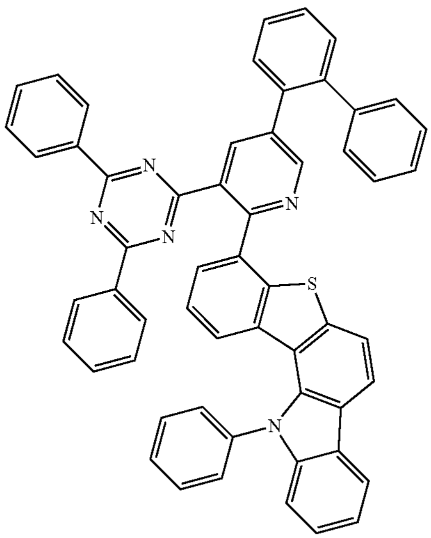
659
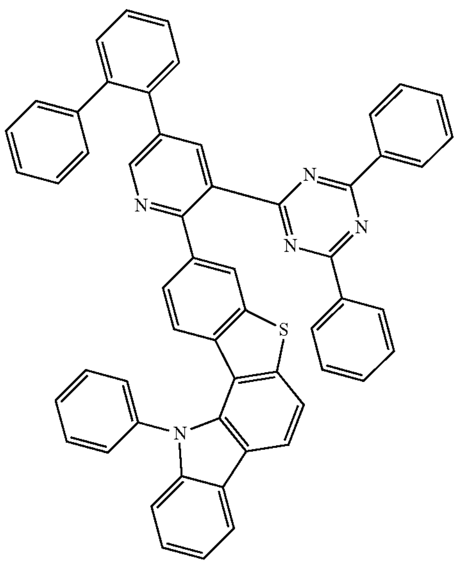
660
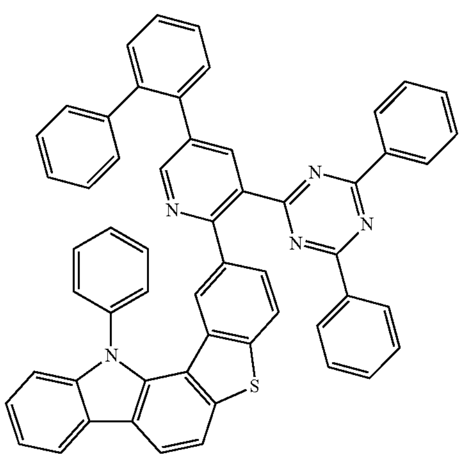
-continued
661
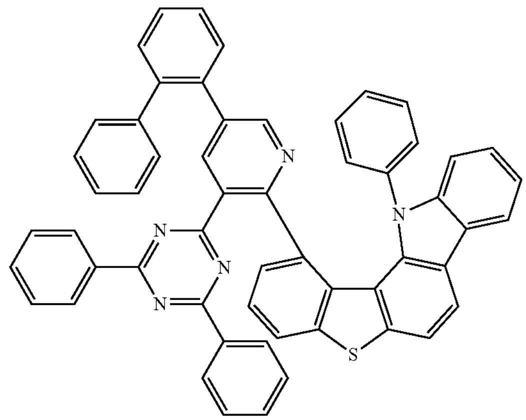
662
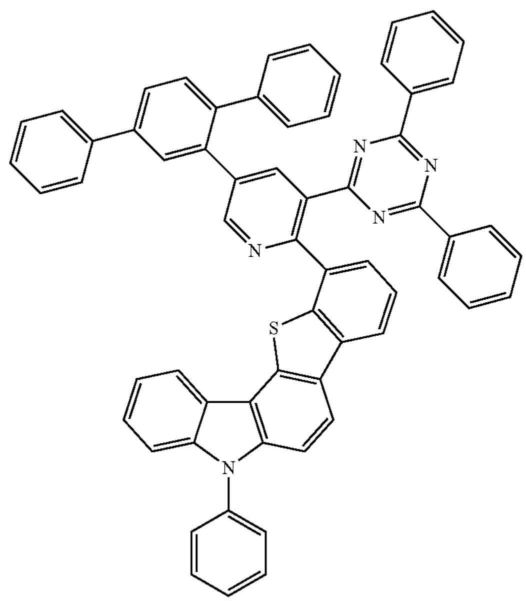
663
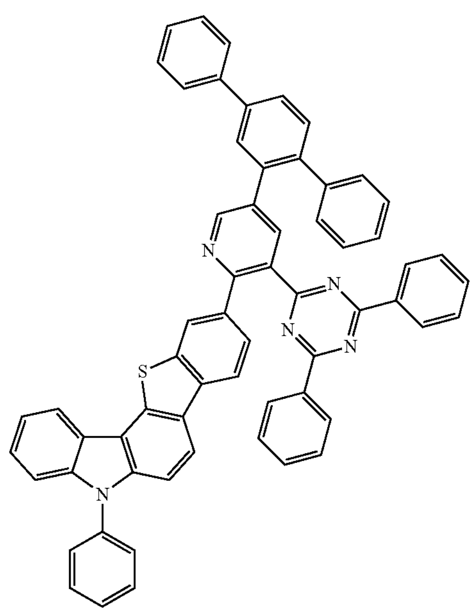

-continued
664
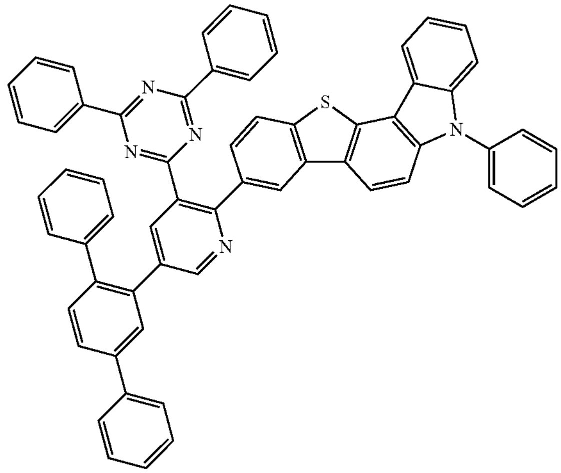
665
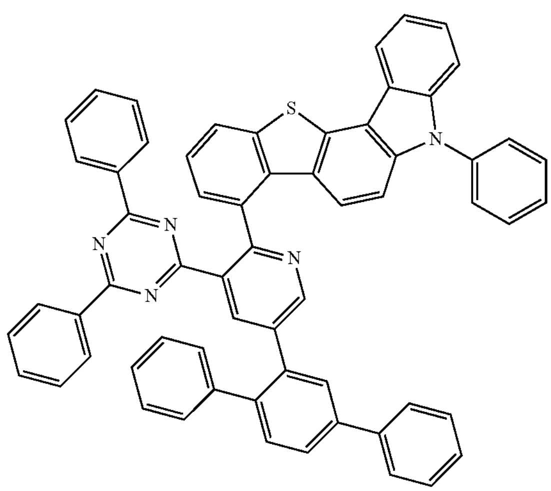
666
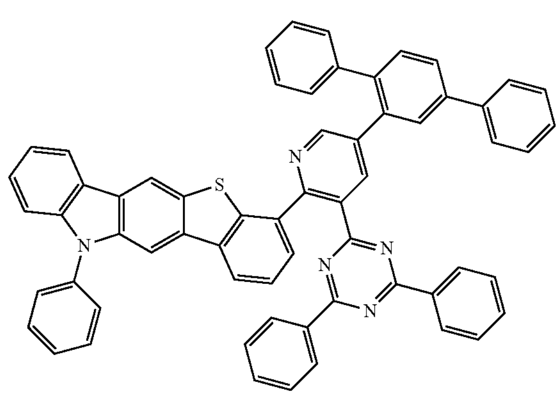
-continued
667
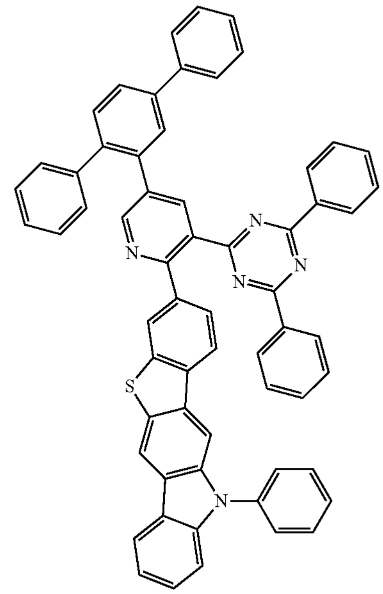
668
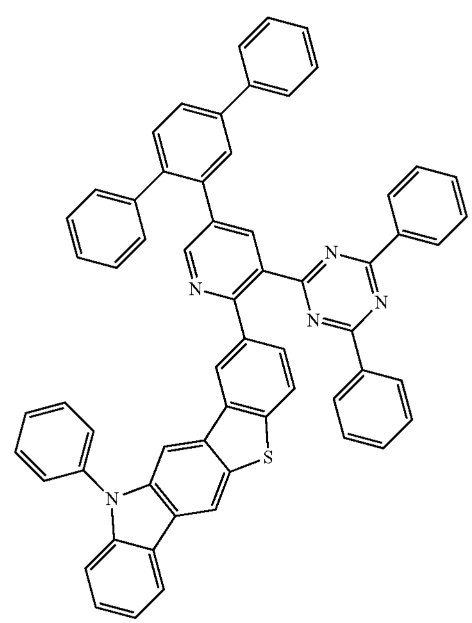

669
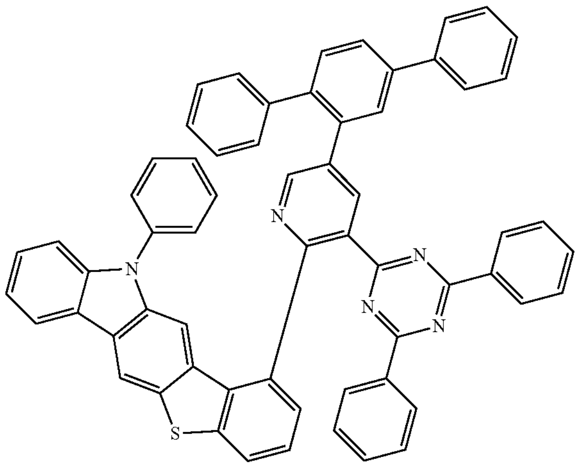
670
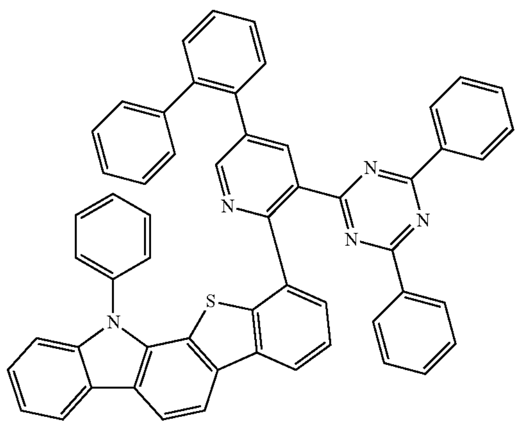
671
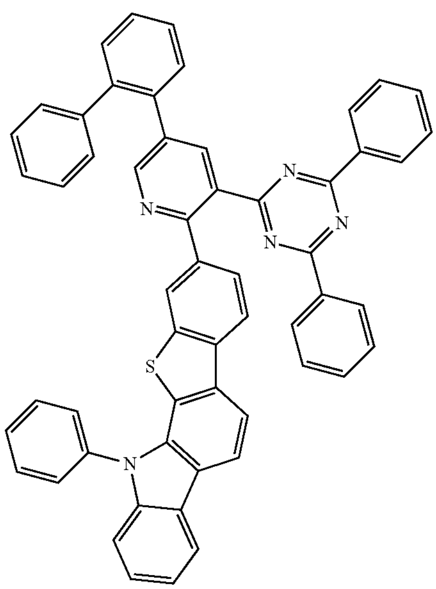
672
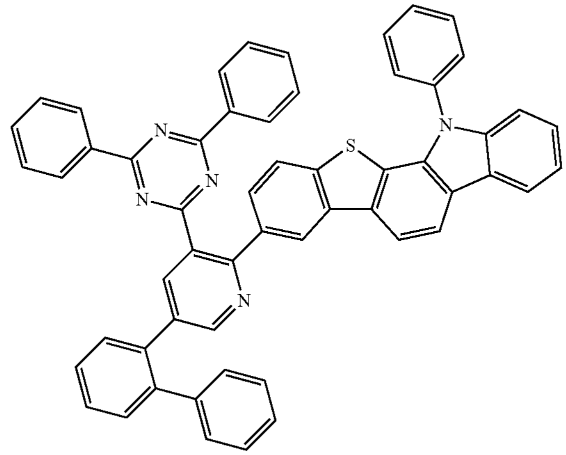
673
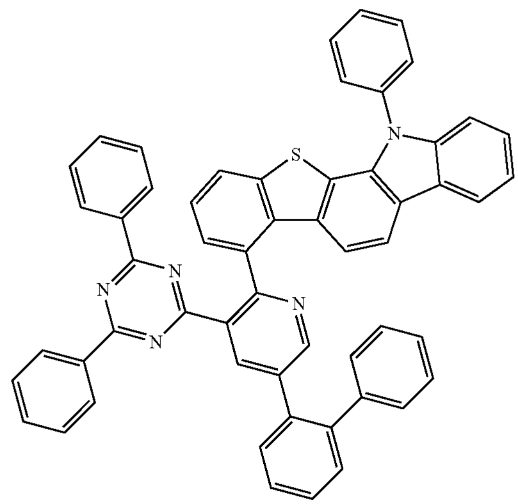
674
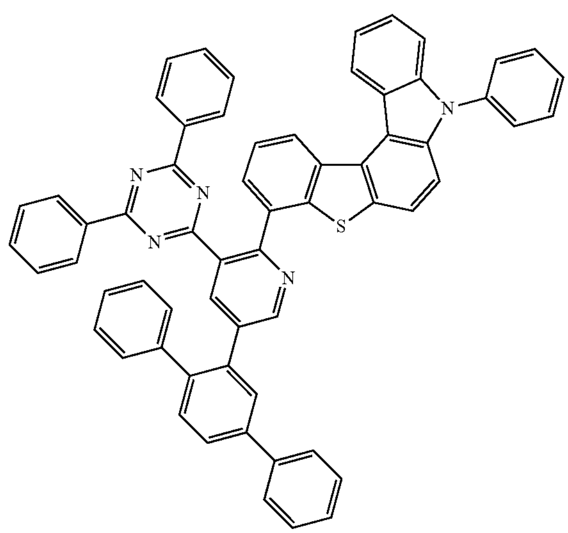

-continued
675
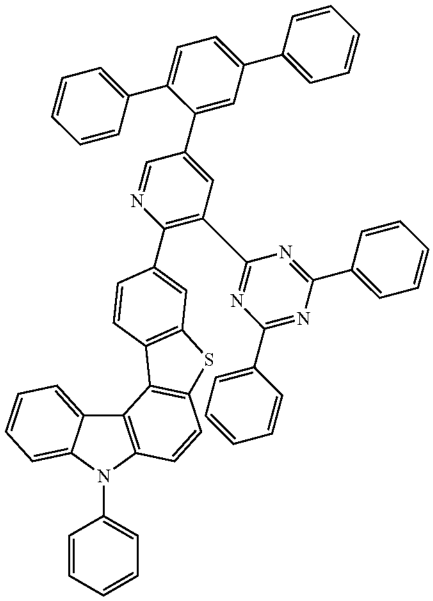
676
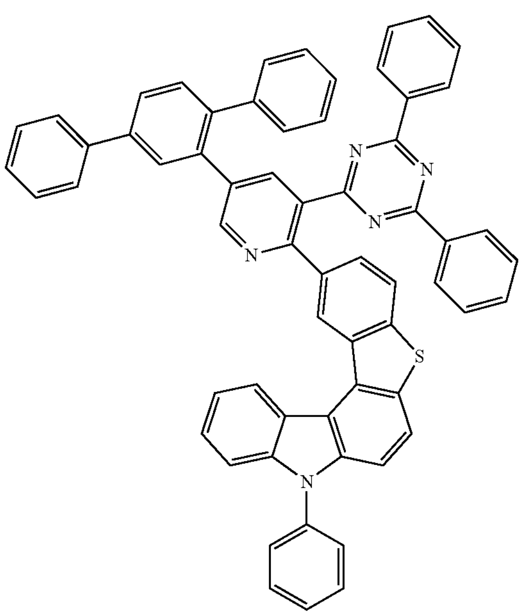
-continued
677
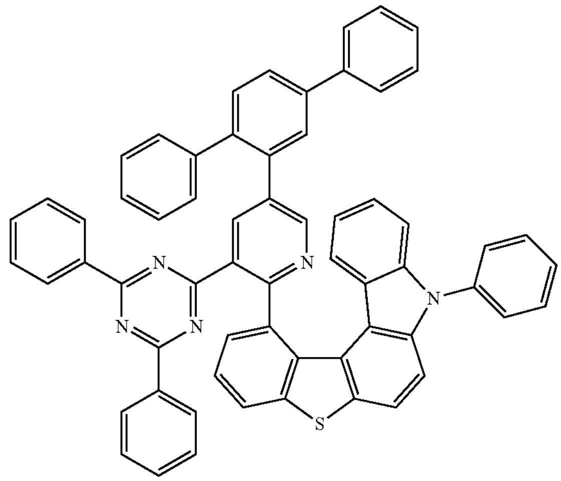
678
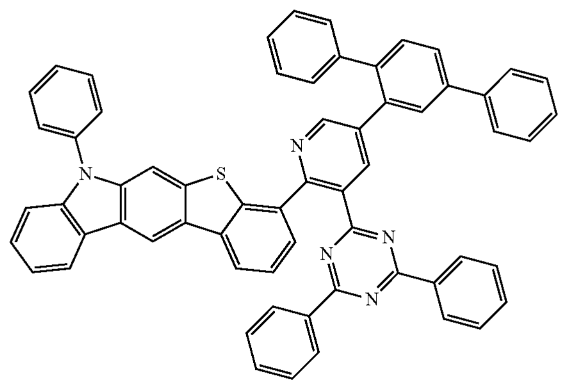
679
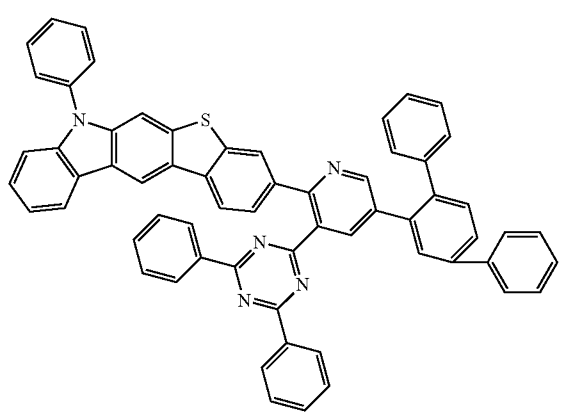

-continued
680
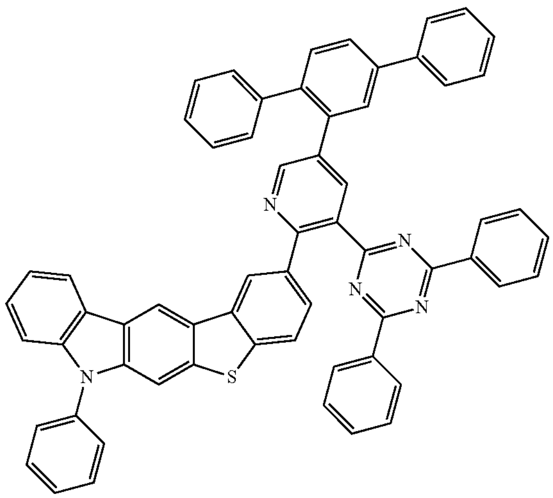
681
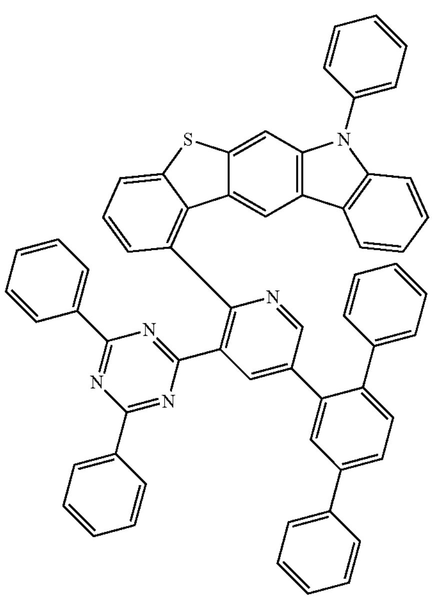
-continued
682
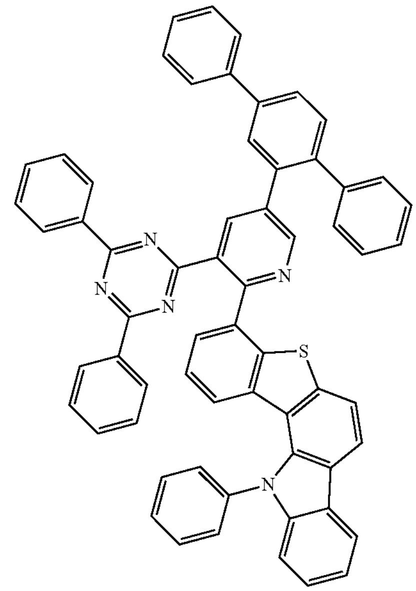
683
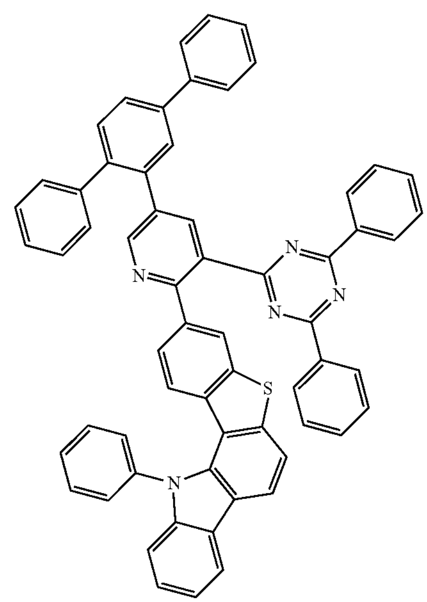

684
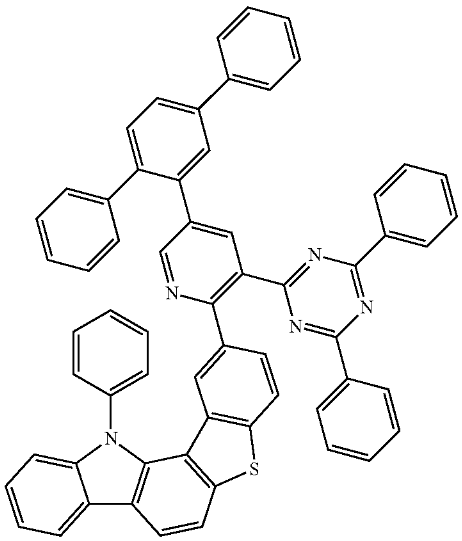
685
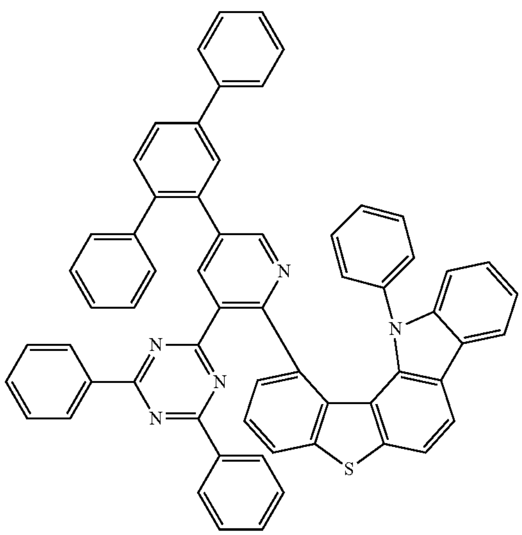
686
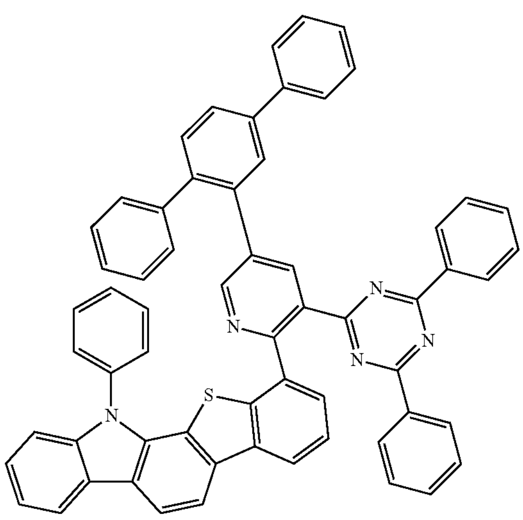
687
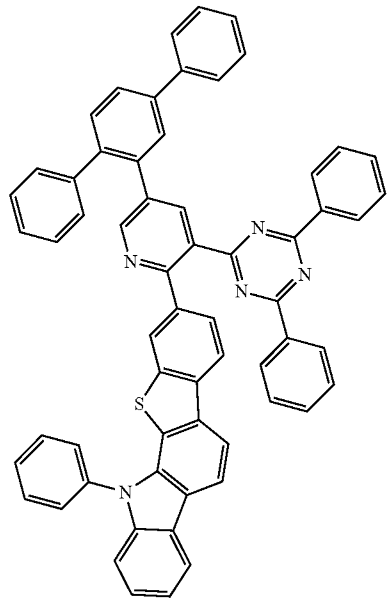
688
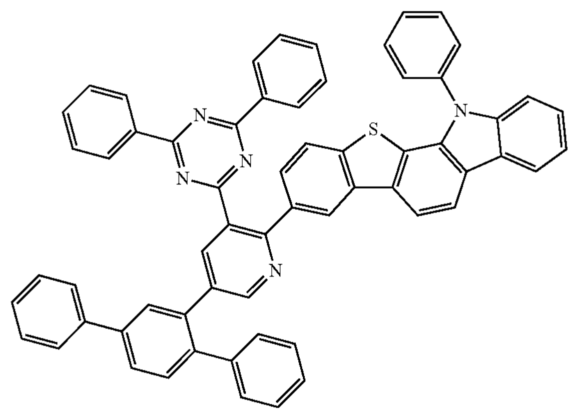
689
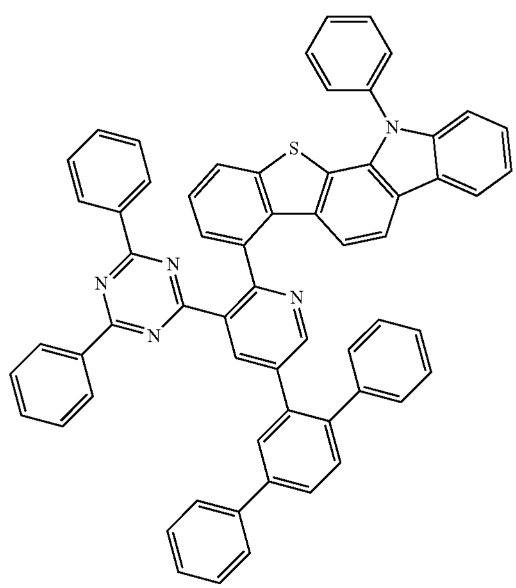

690
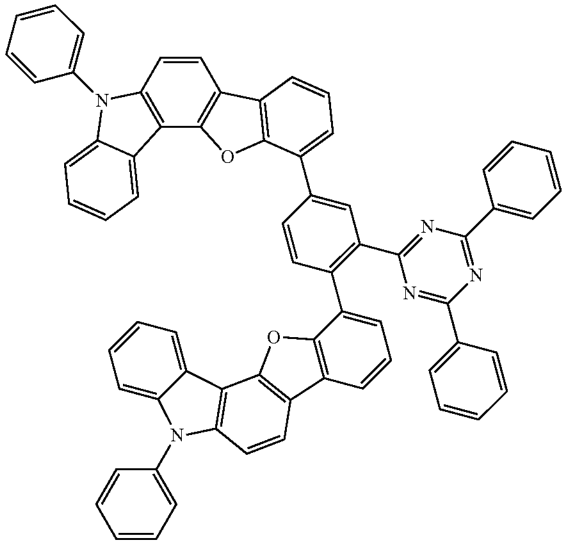
691
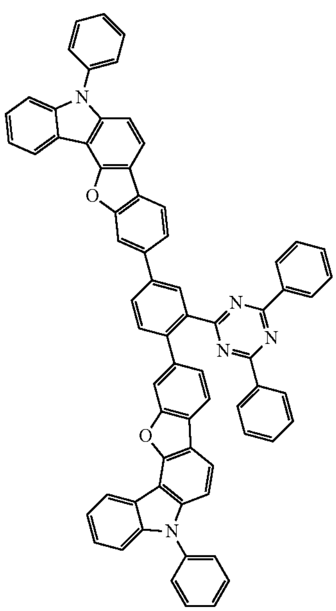
692
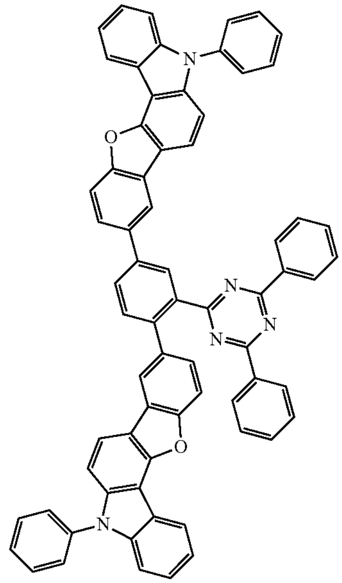
693
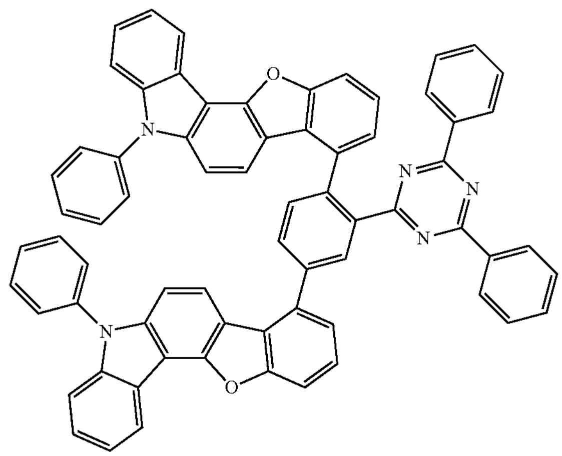
694
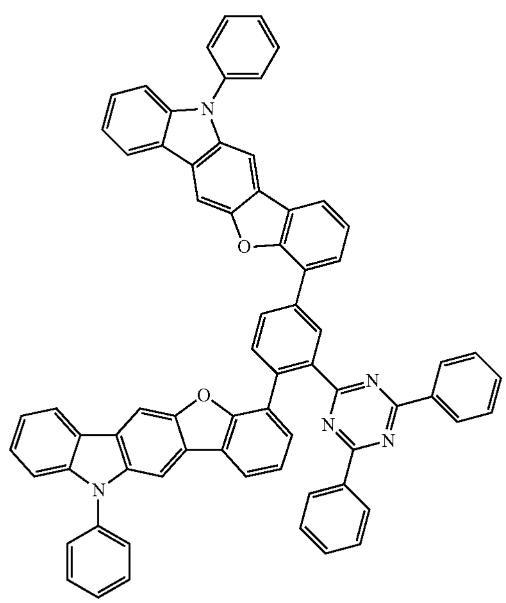

-continued
695
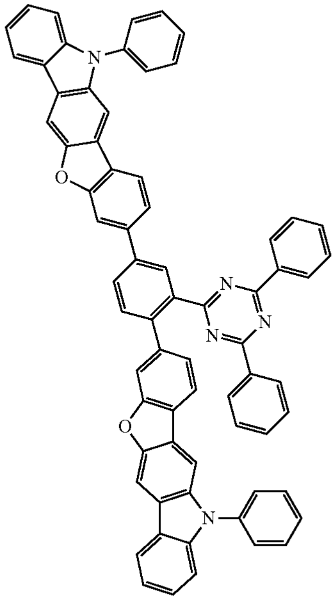
696
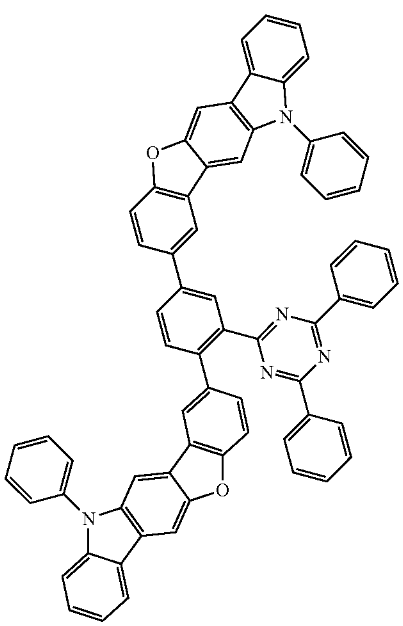
-continued
697
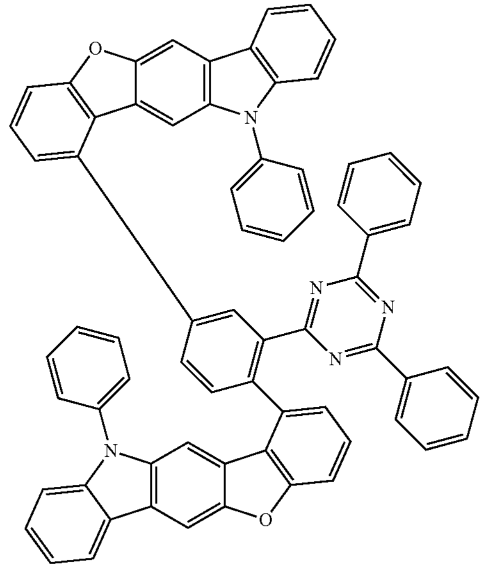
698
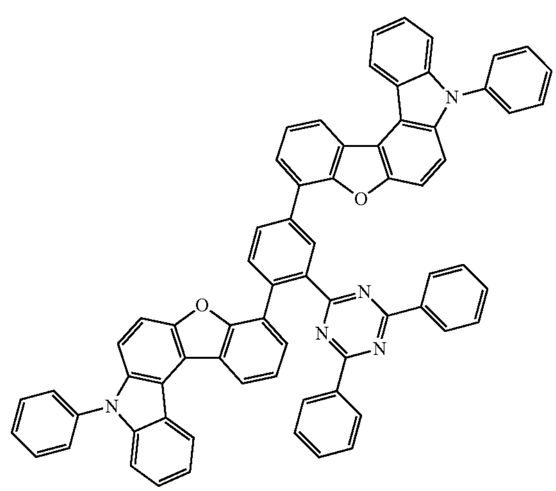

-continued
699
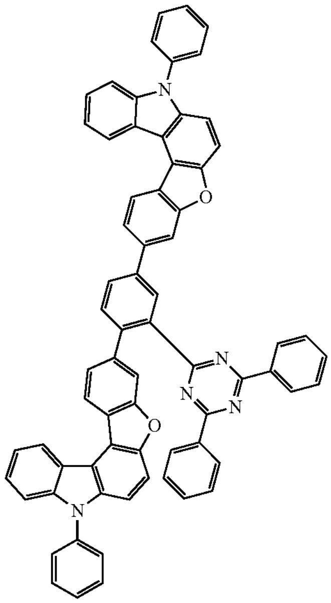
700
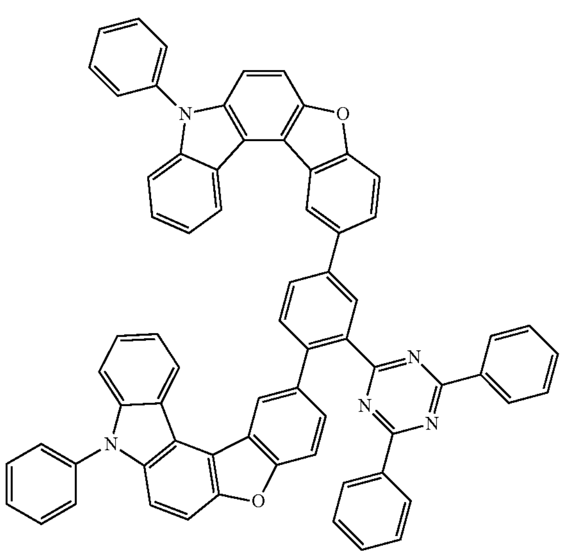
-continued
701
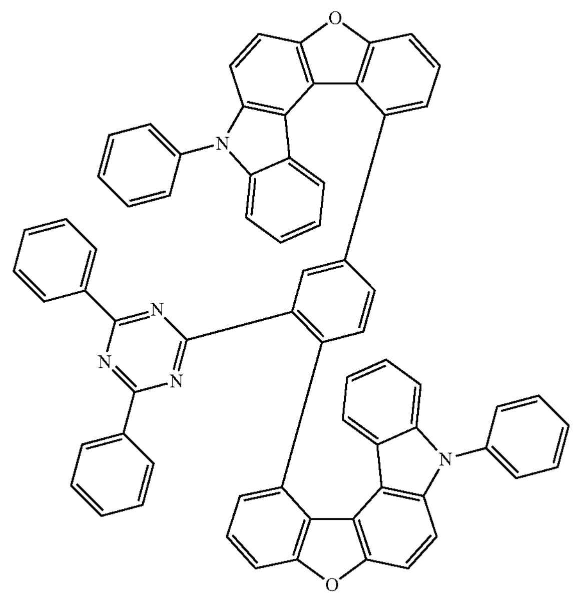
702
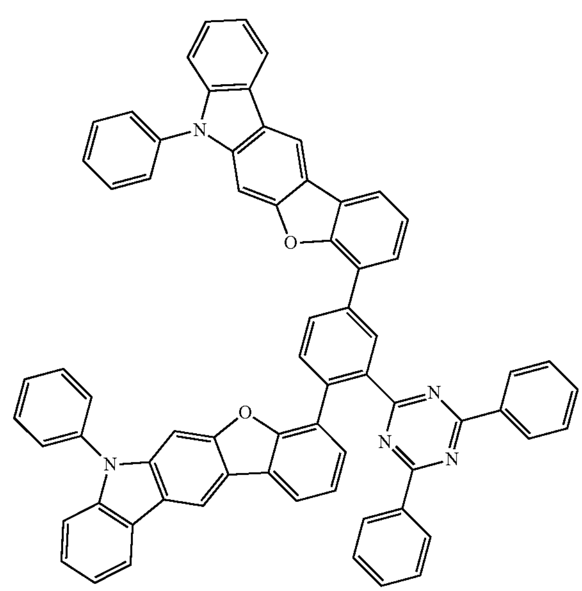

-continued
703
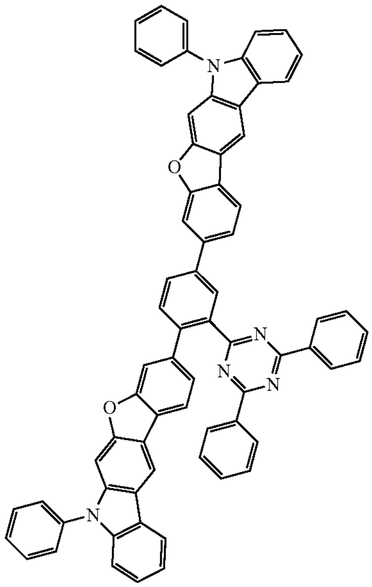
-continued
705
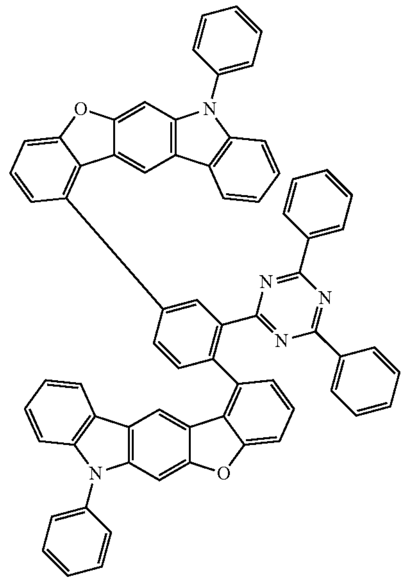
704
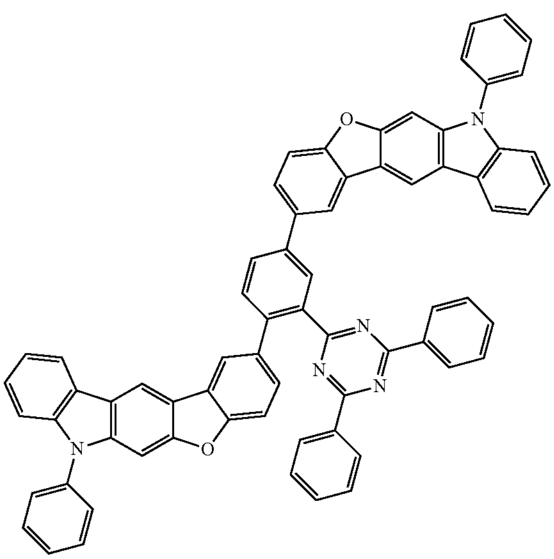
706
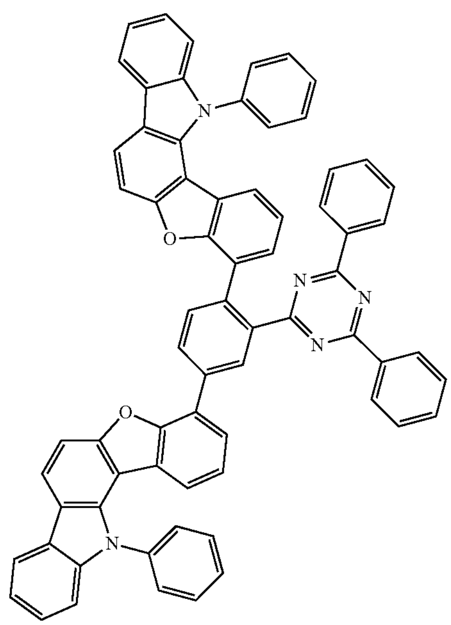

-continued
707
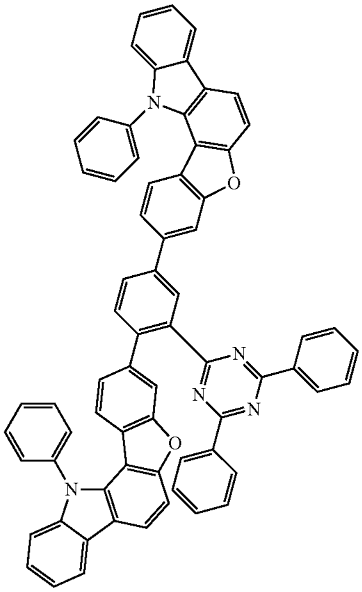
708
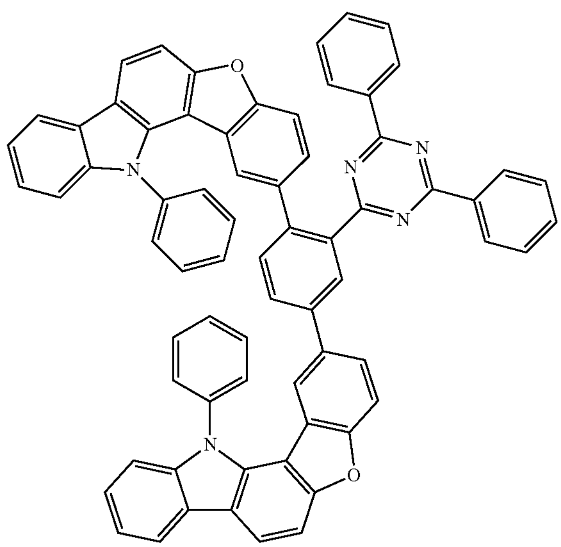
709
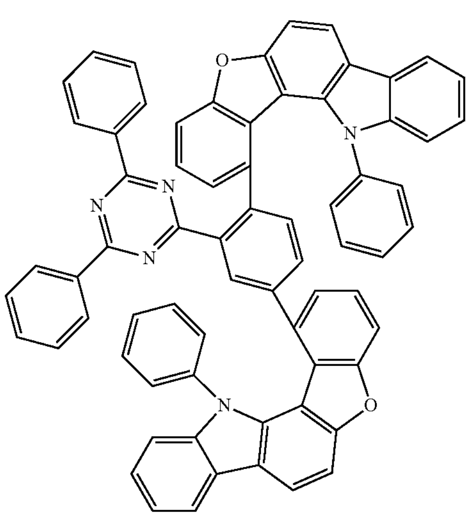
-continued
710
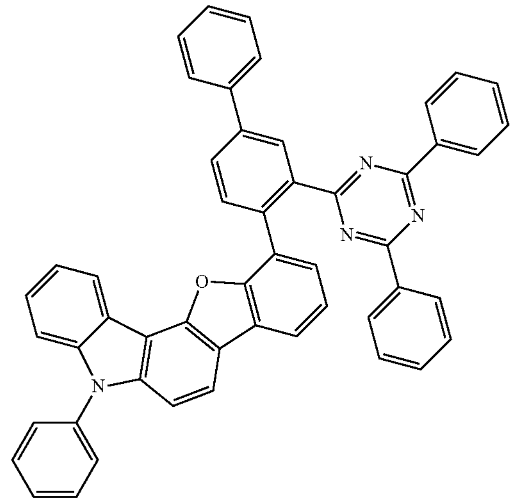
711
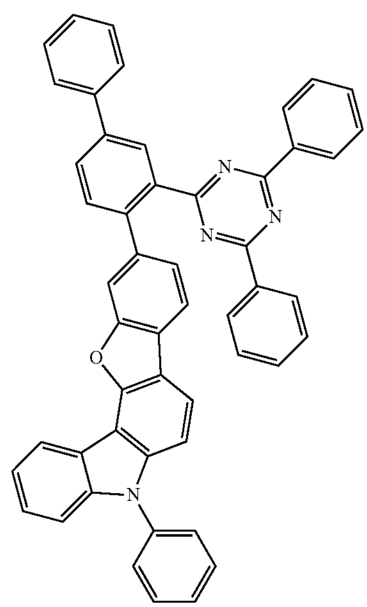

-continued
712
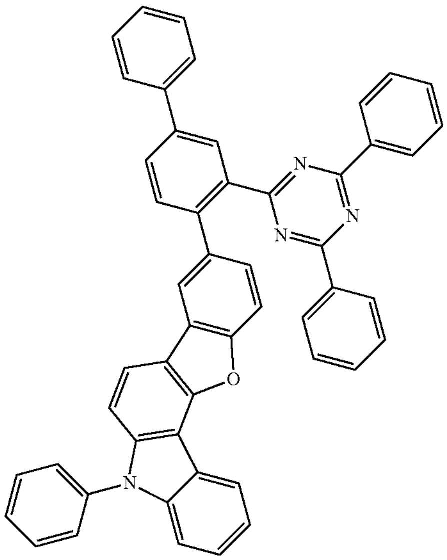
713
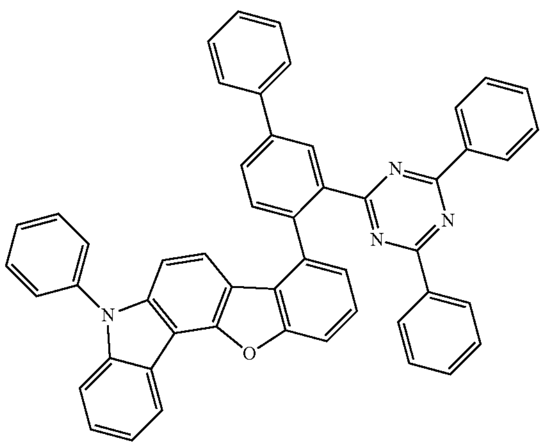
714
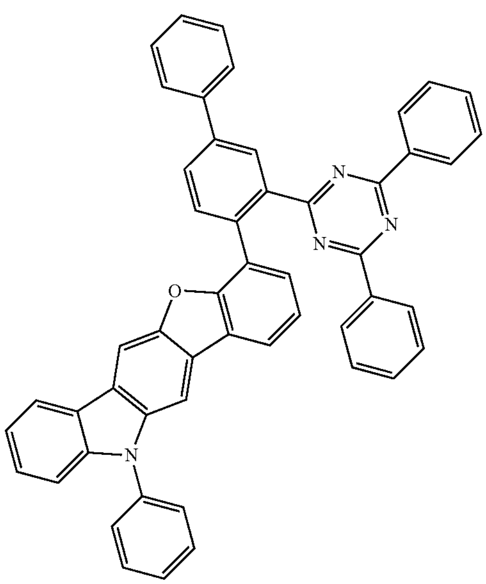
-continued
715
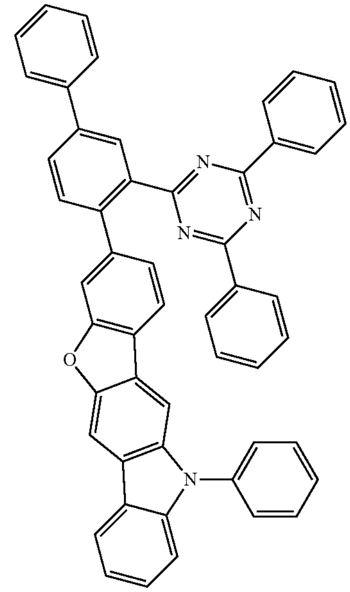
716
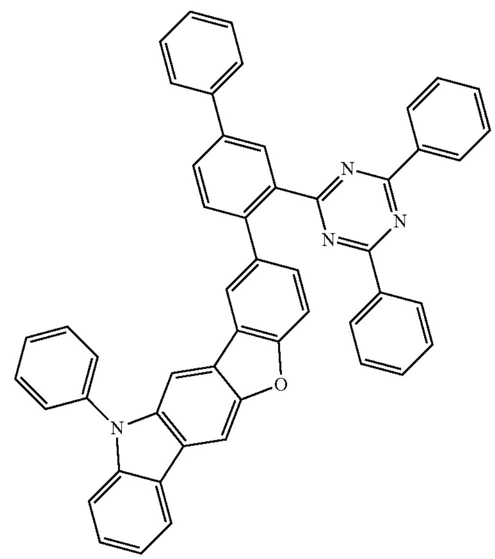
717
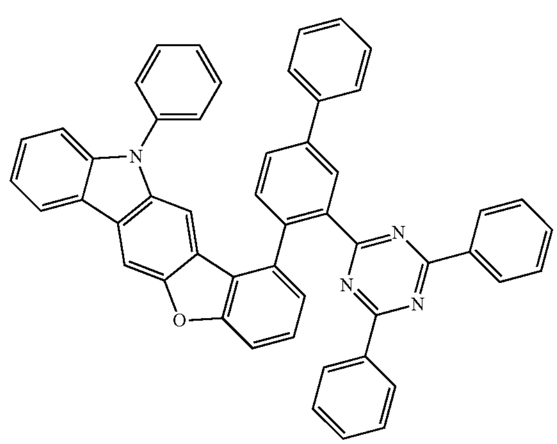

718
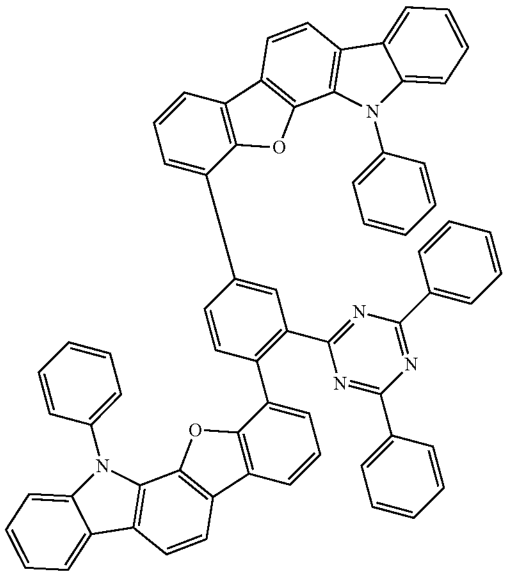
719
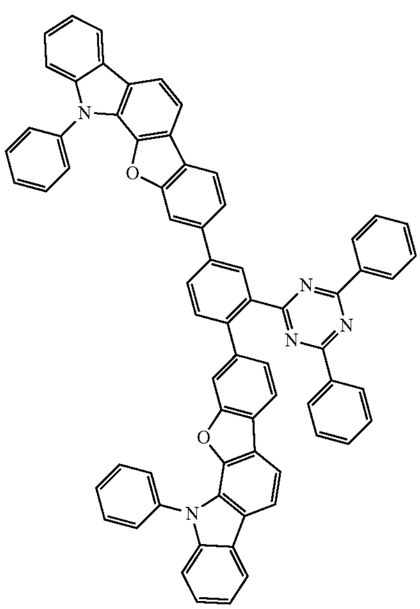
720
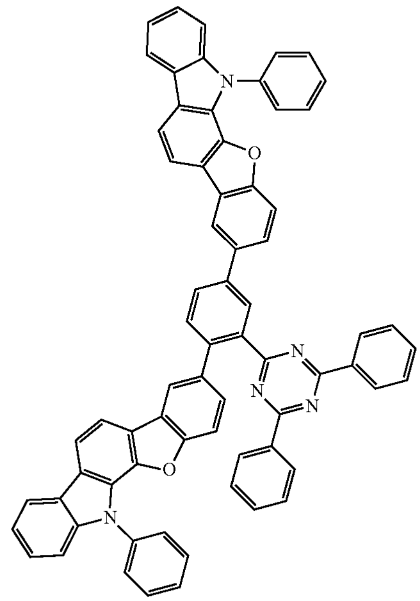
721
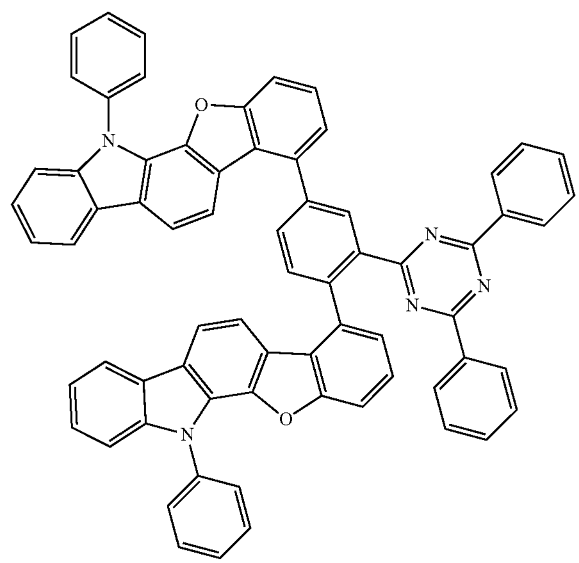
722
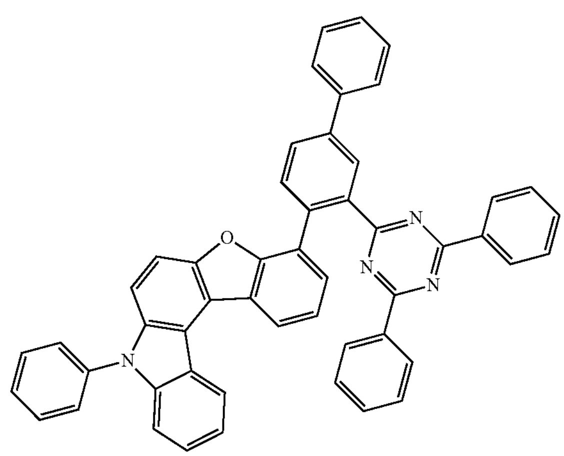

723
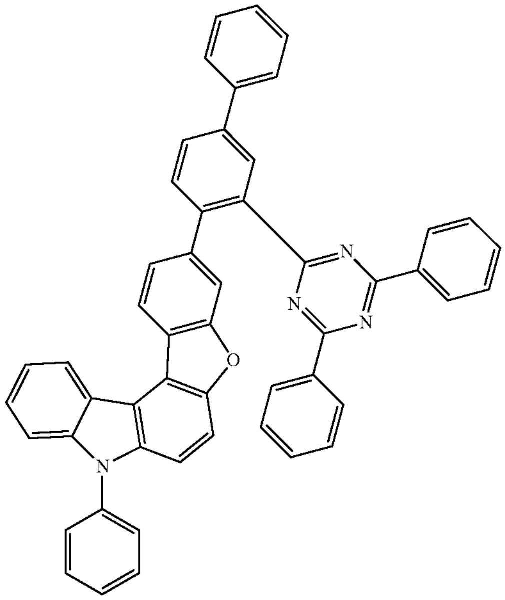
724
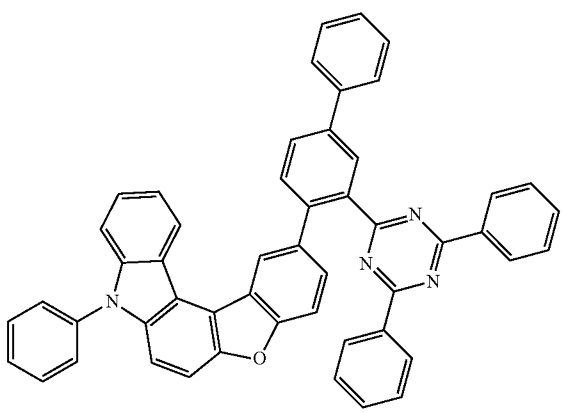
725
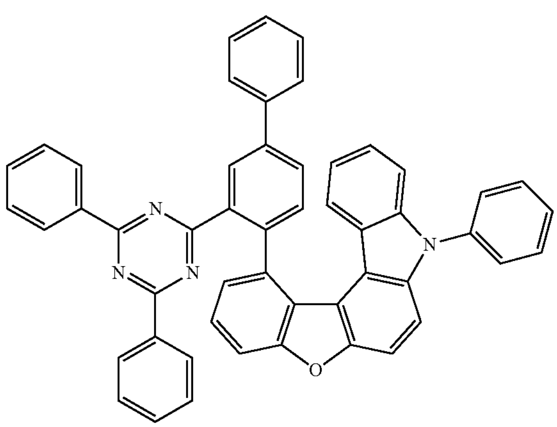
726
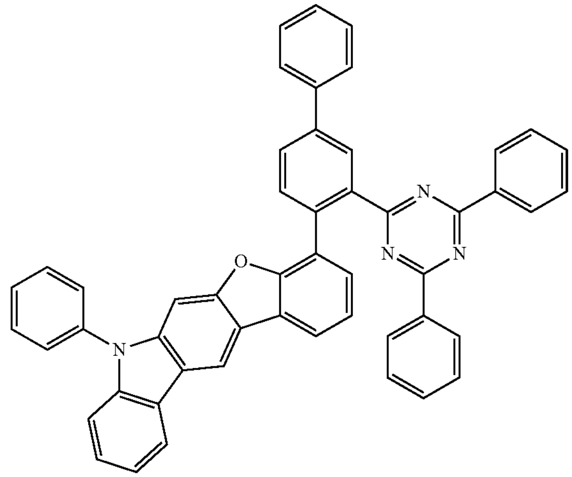
727
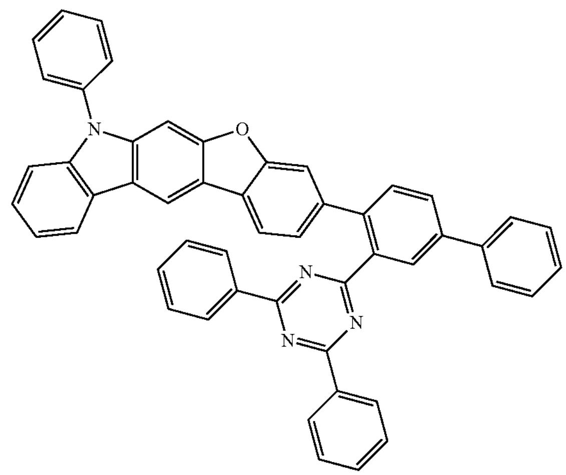
728
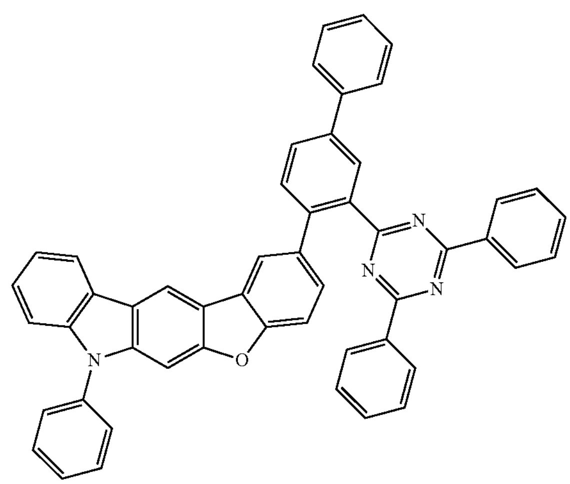

-continued
729
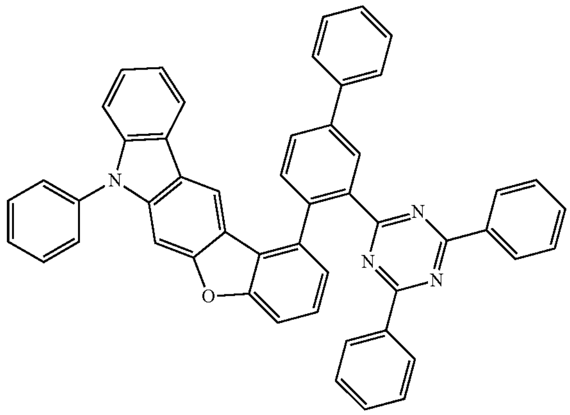
730
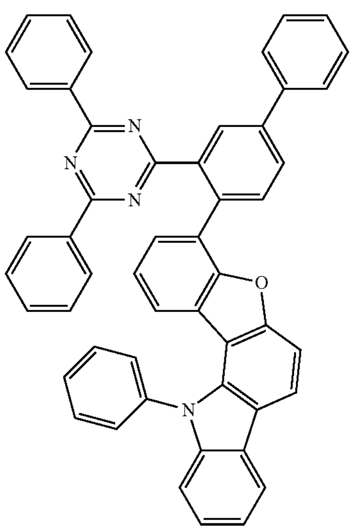
731
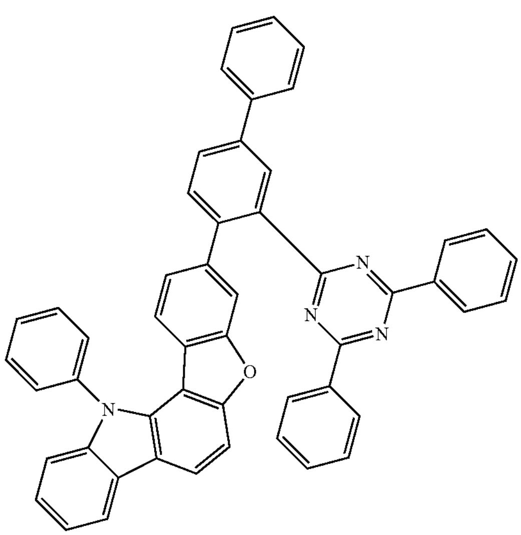
-continued
732
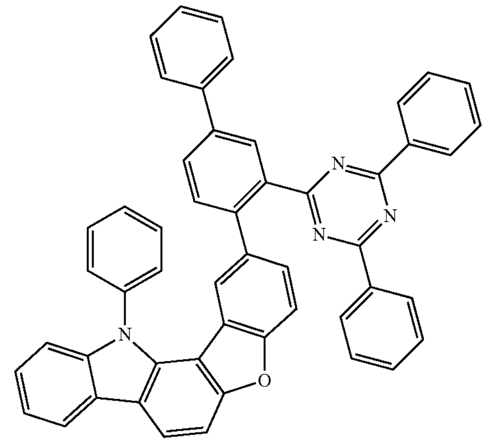
733
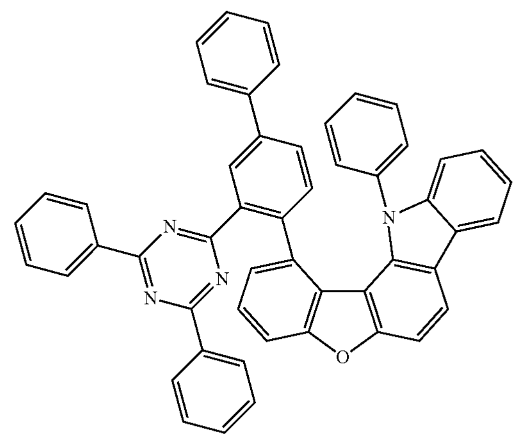
734
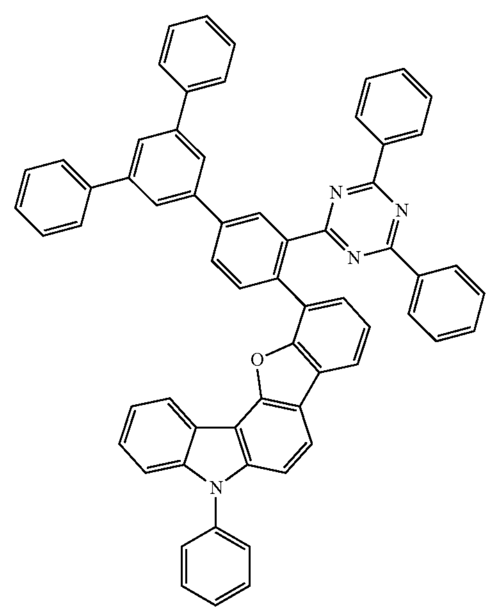

735
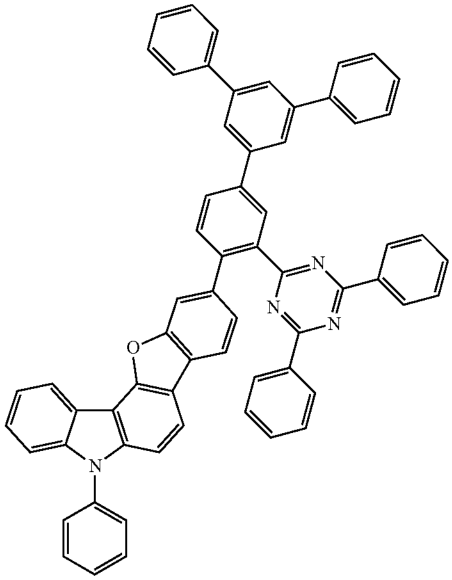
736
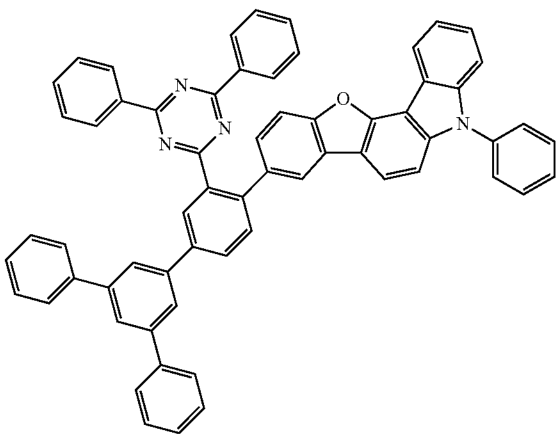
737
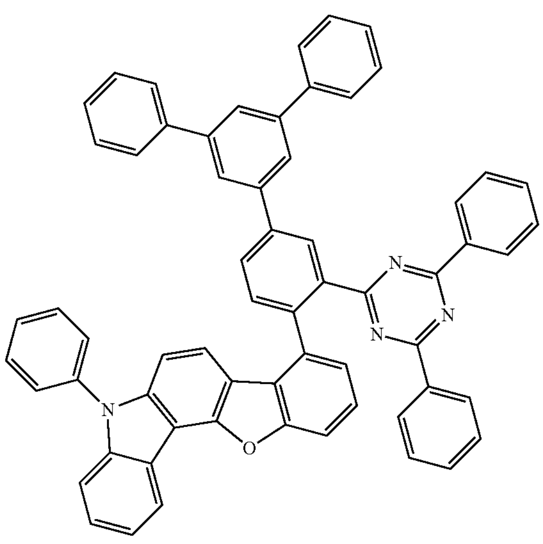
738
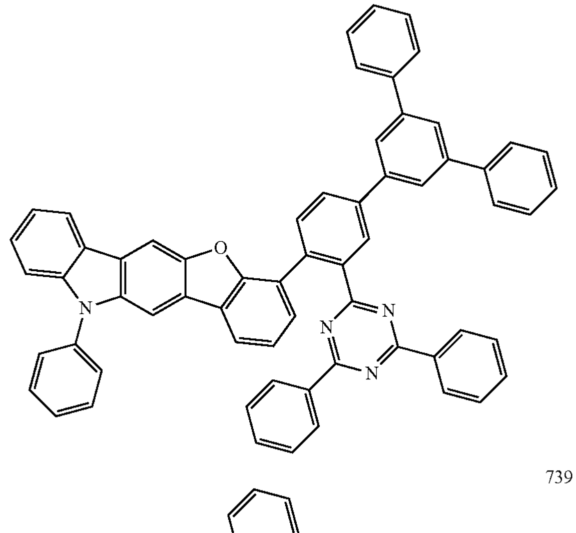
739
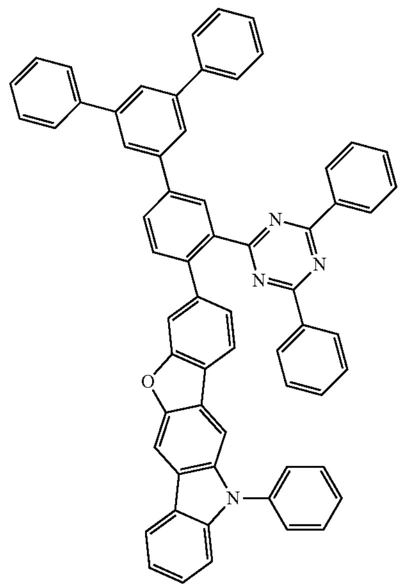
740
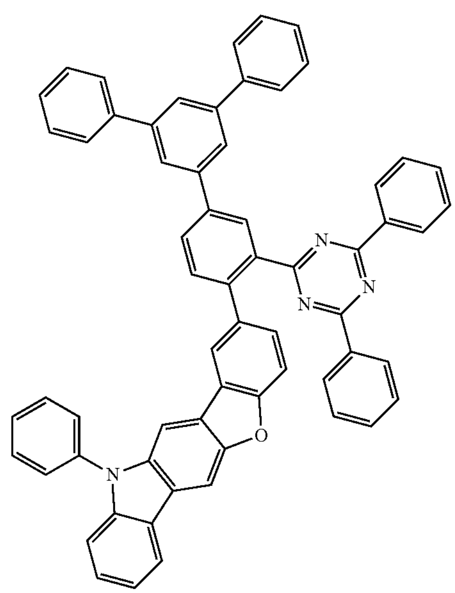

-continued
741
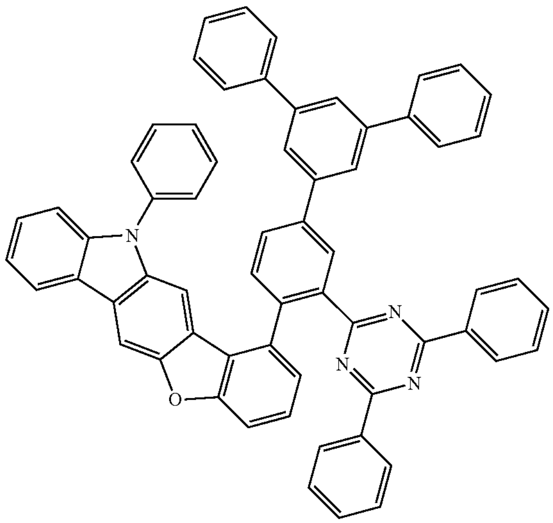
742
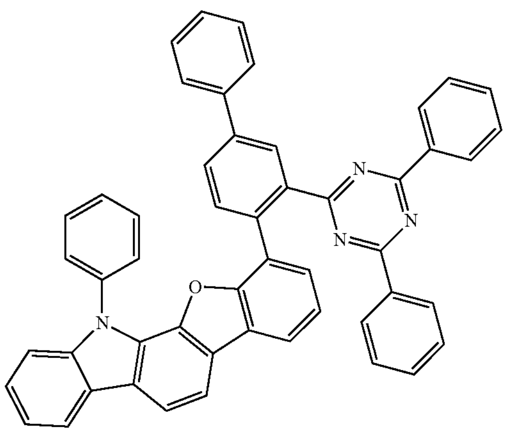
743
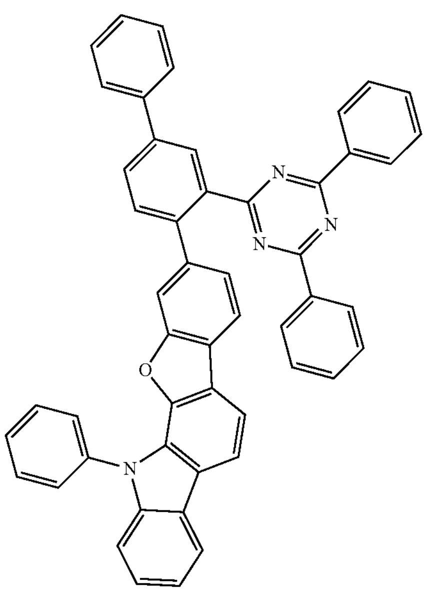
744
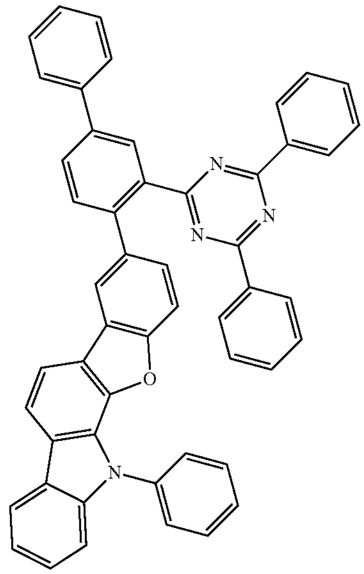
745
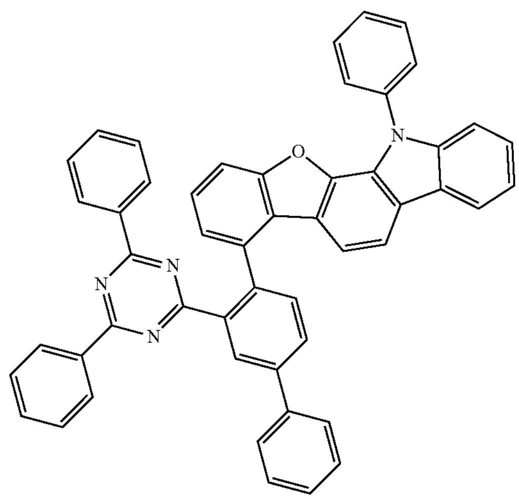
746
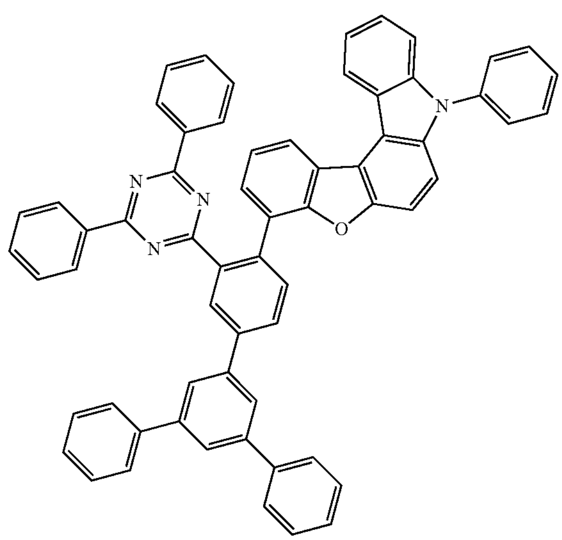

747
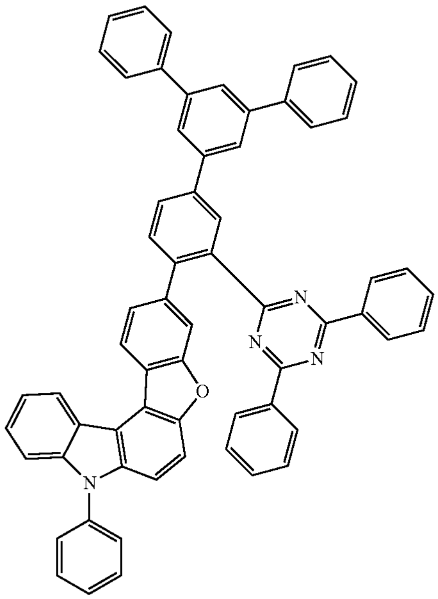
748
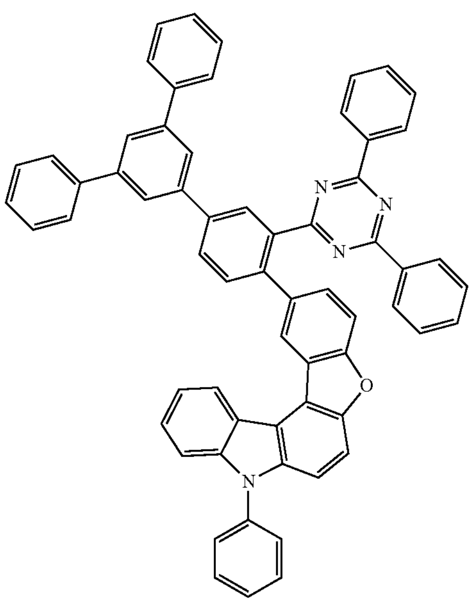
749
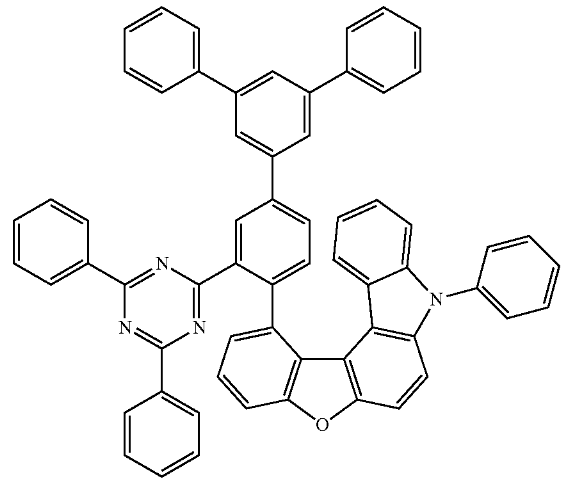
750
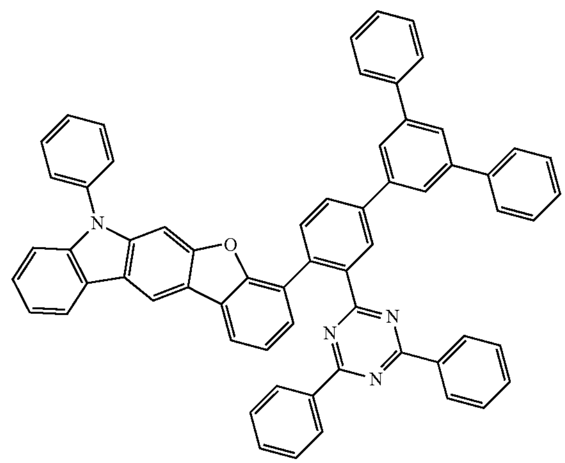
751
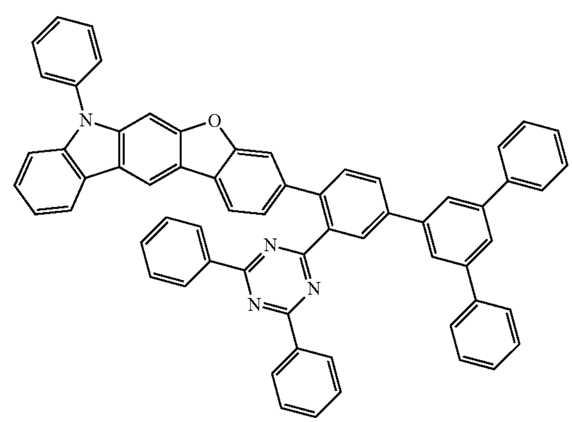

-continued
752
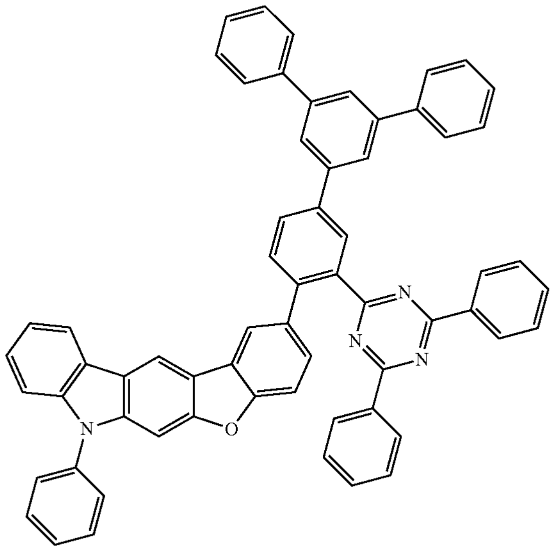
753
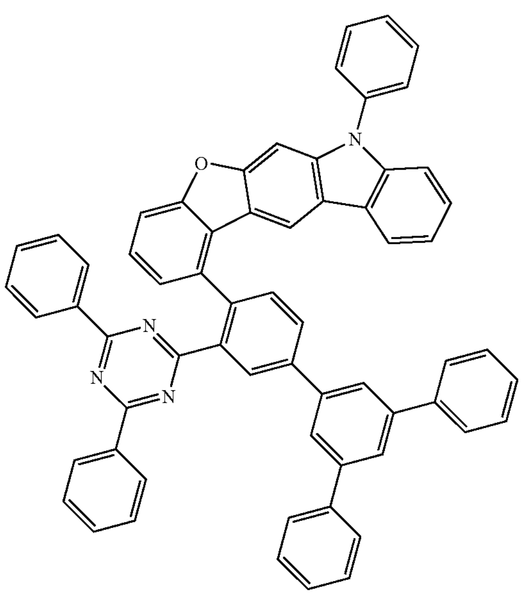
-continued
754
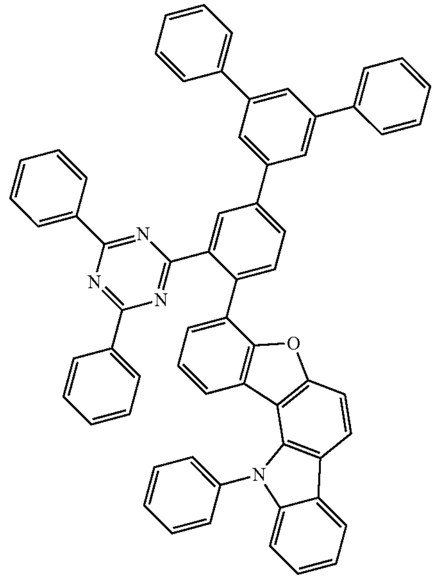
755
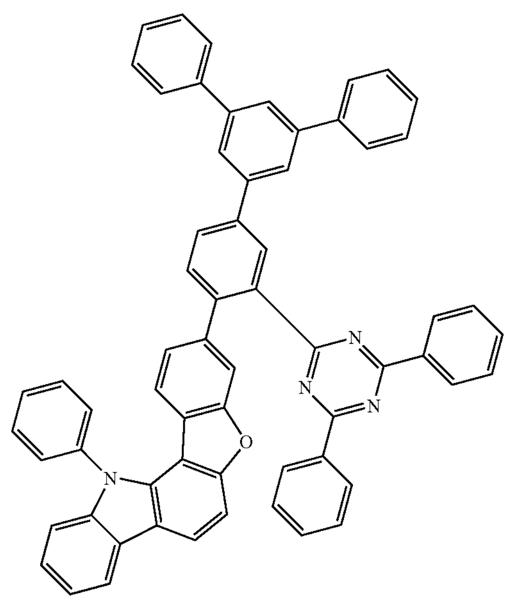

-continued
756
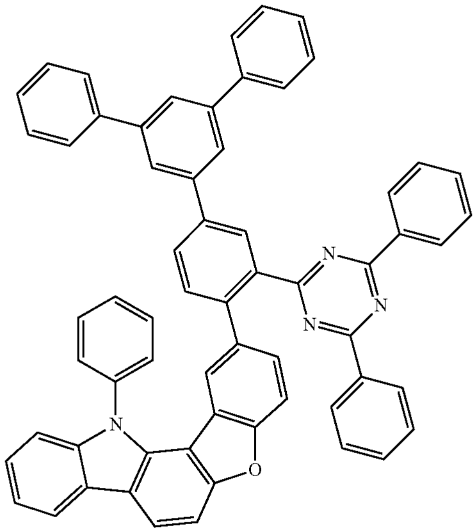
757
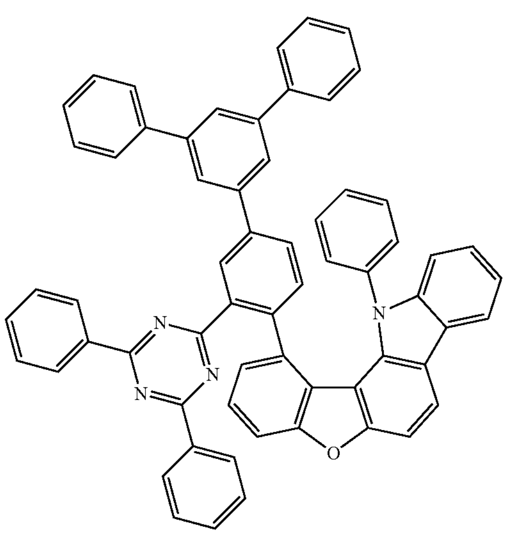
-continued
758
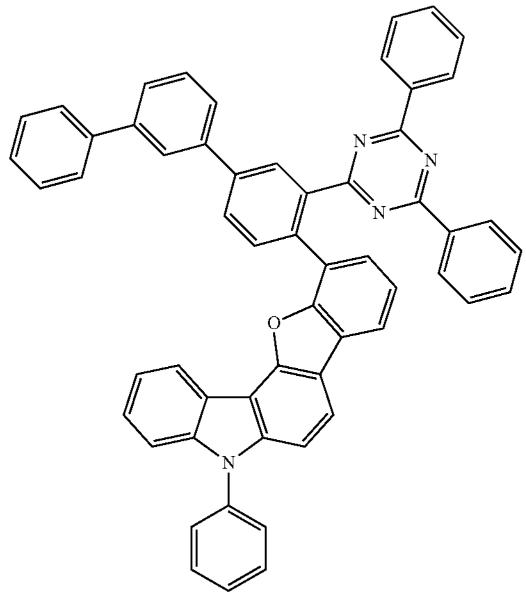
759
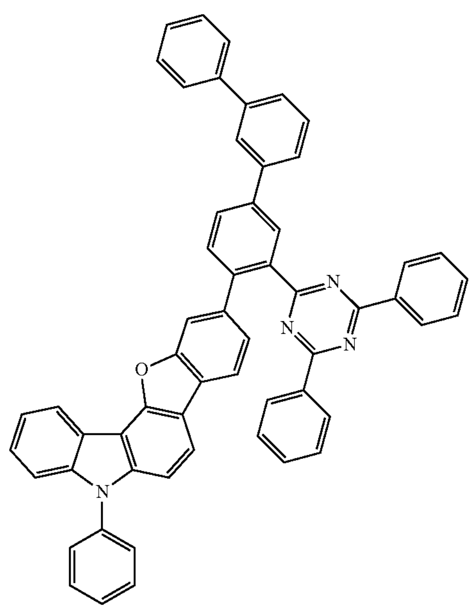

760
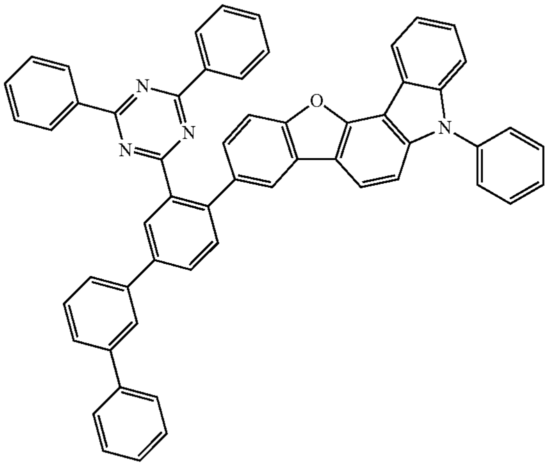
761
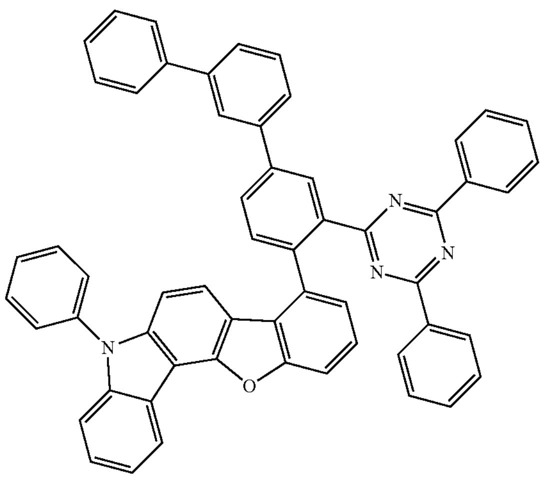
762
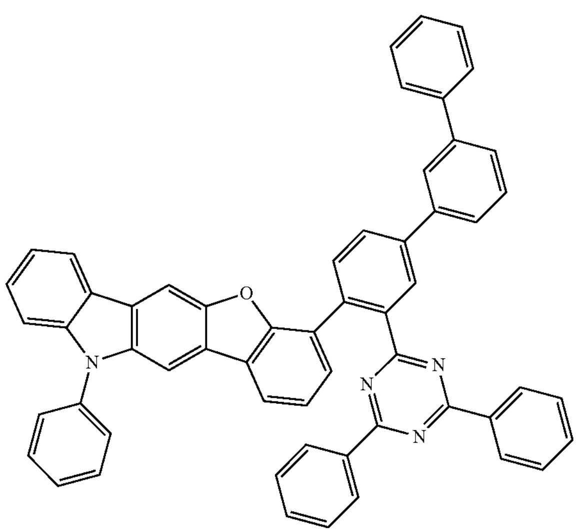
763
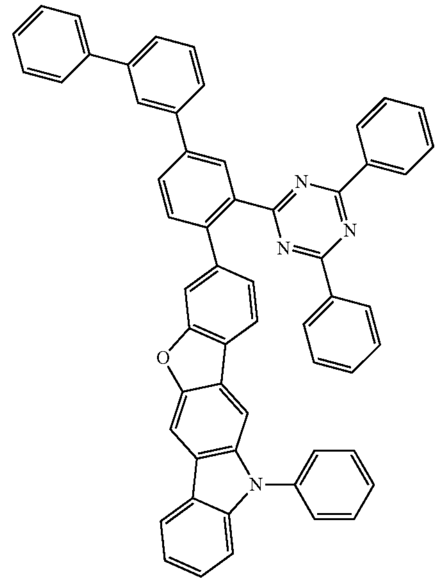
764
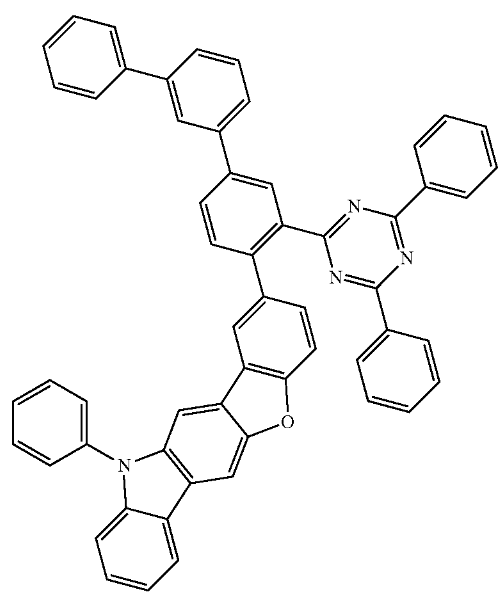

-continued
765
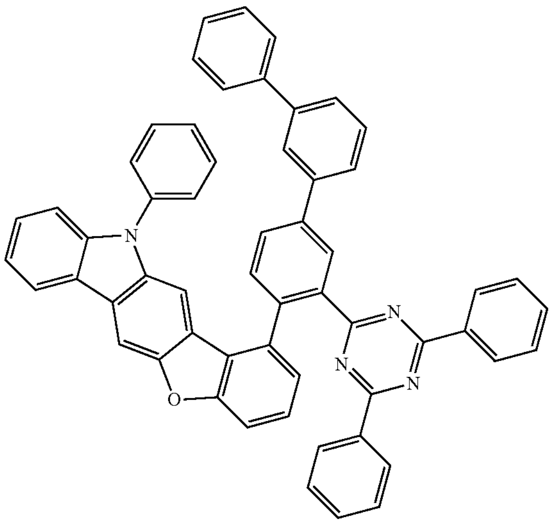
766
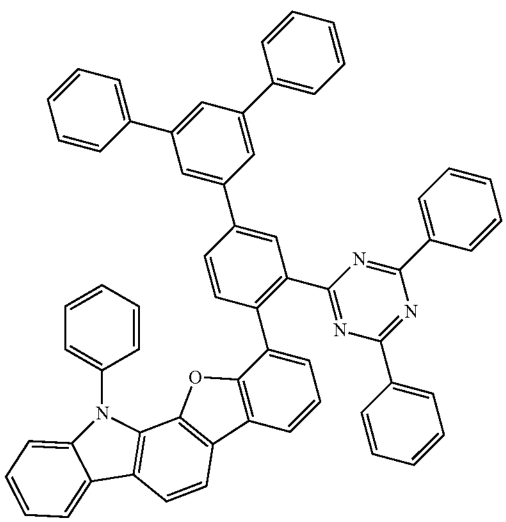
767
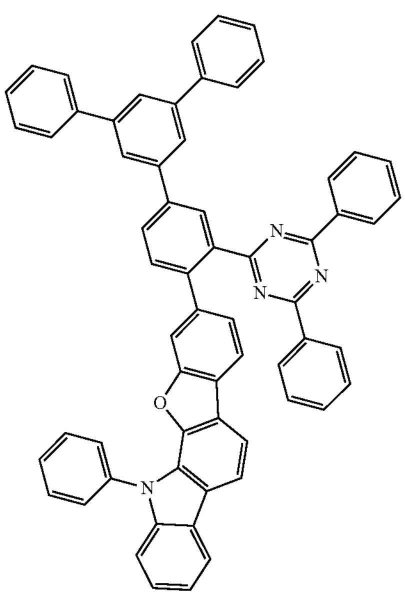
-continued
768
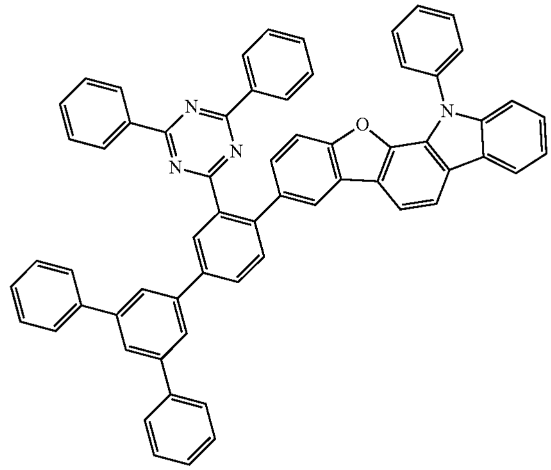
769
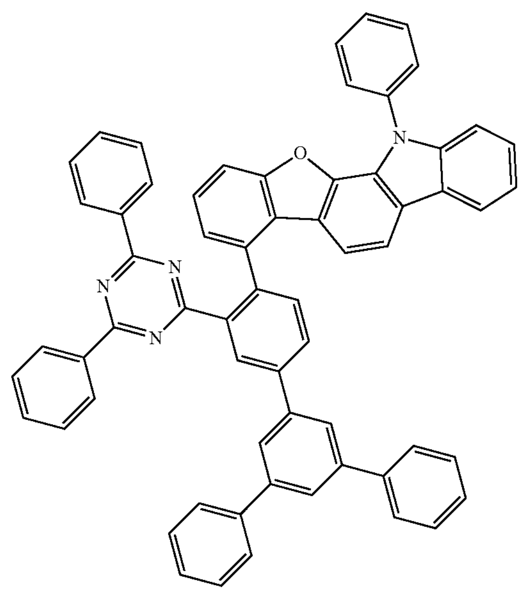
770
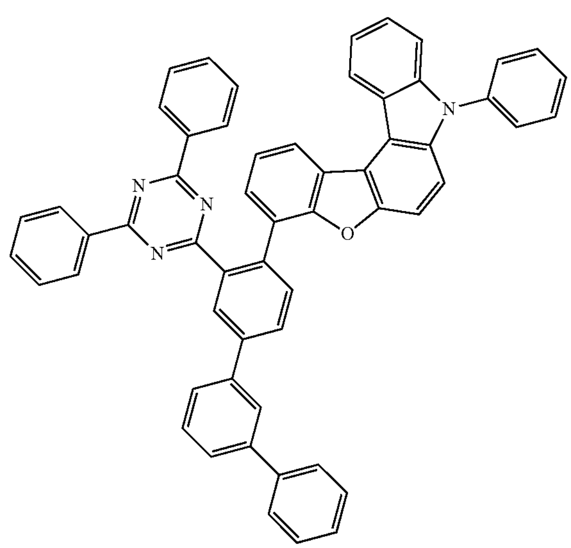

-continued
771
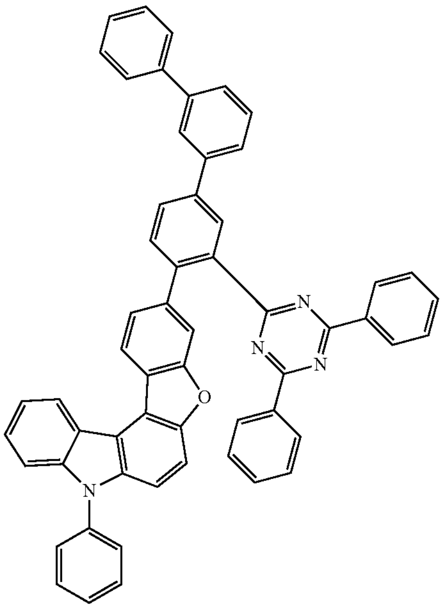
772
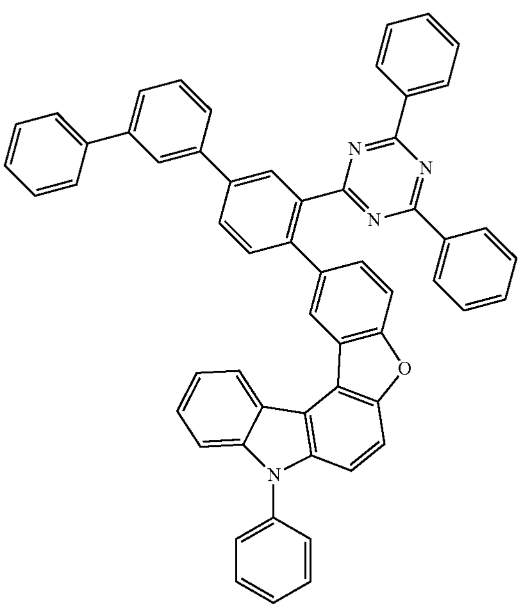
-continued
773
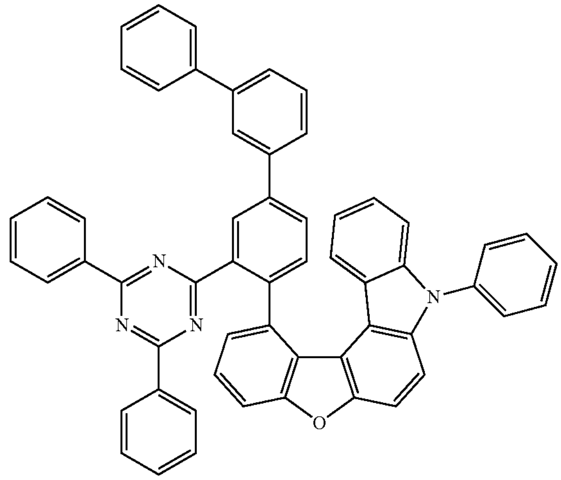
774
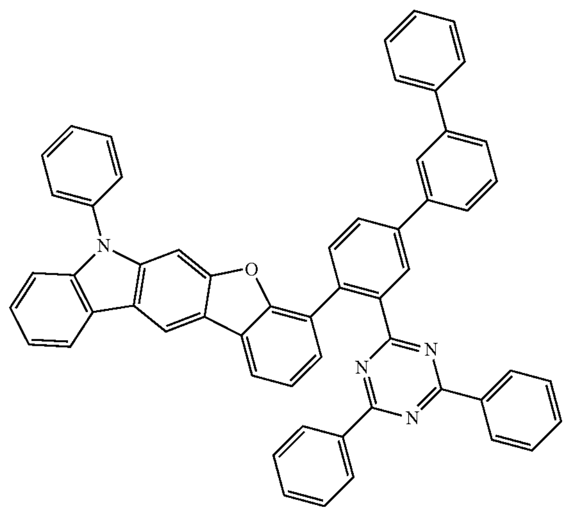
775
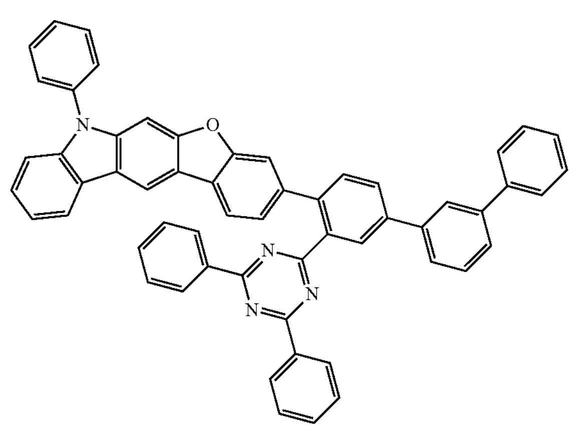

-continued
776
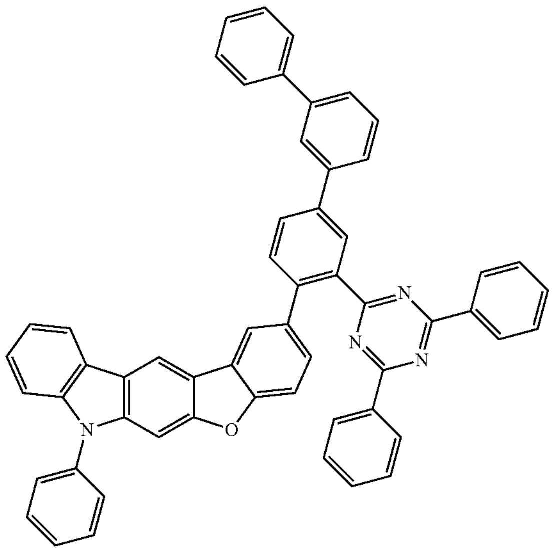
777
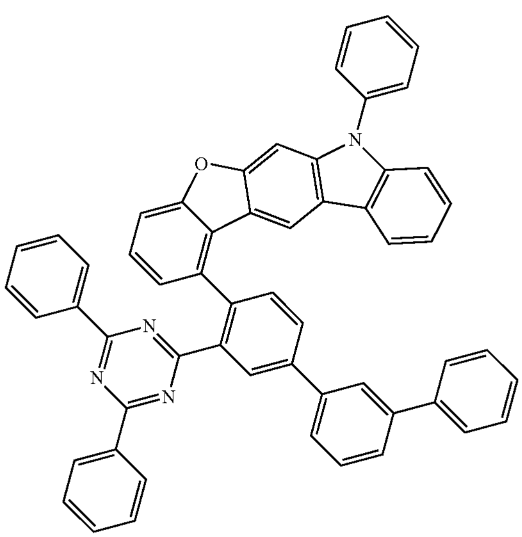
-continued
778
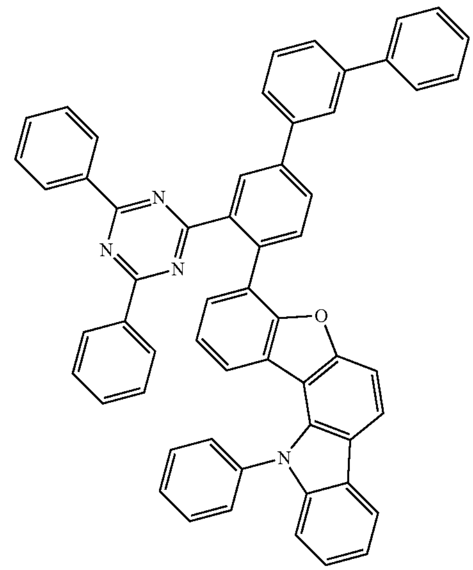
779
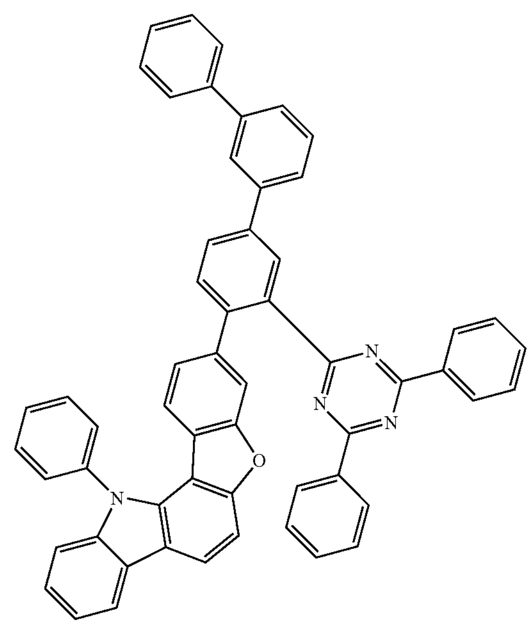

780
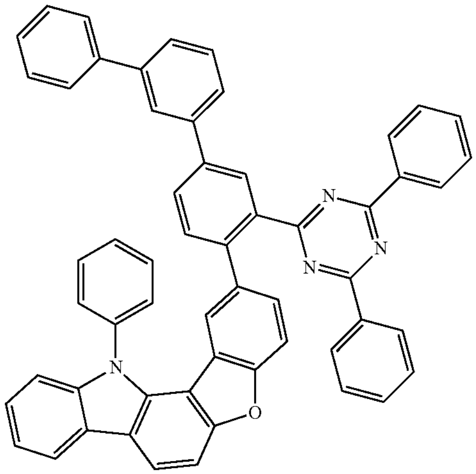
781
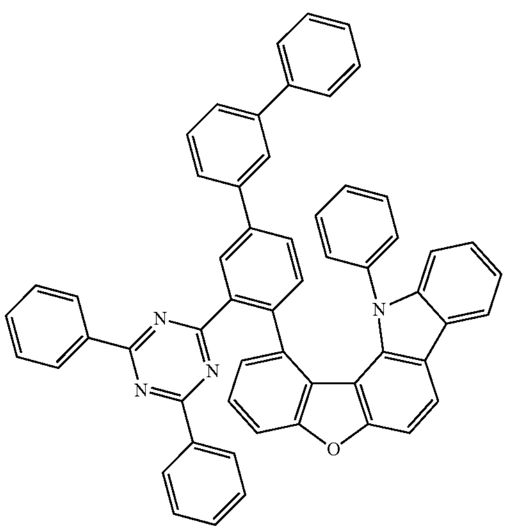
782
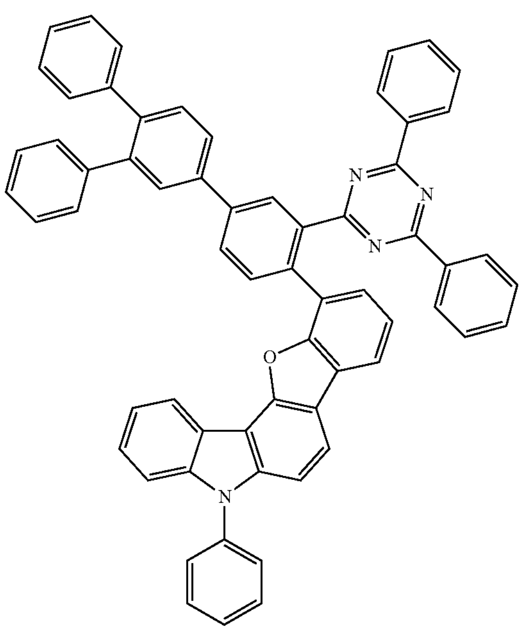
783
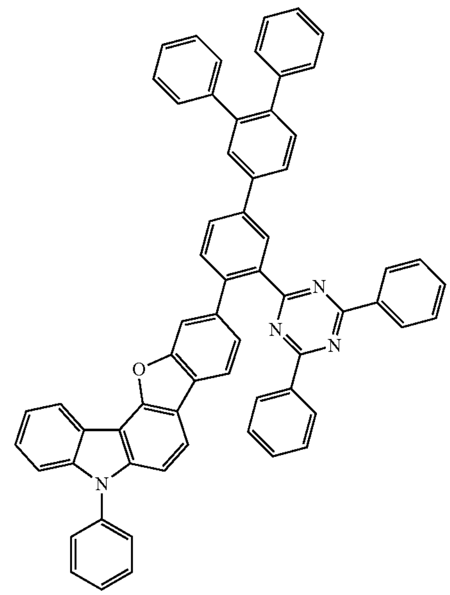
784
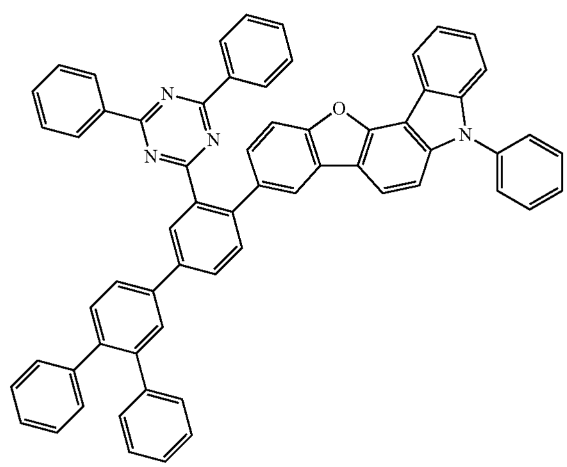
785
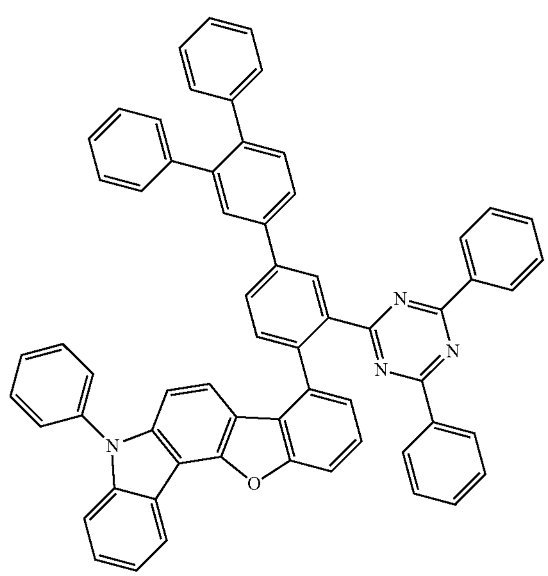

-continued
786
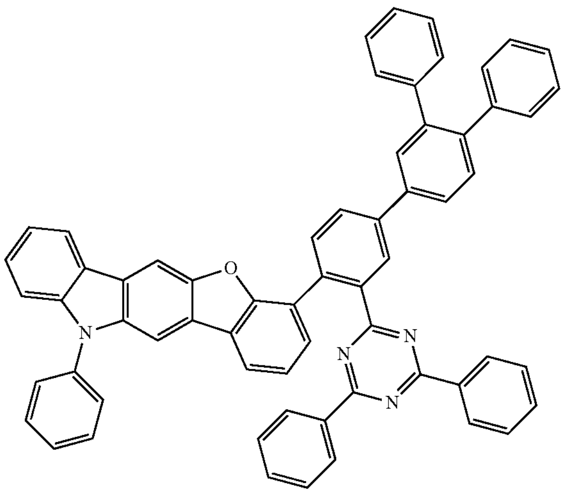
787
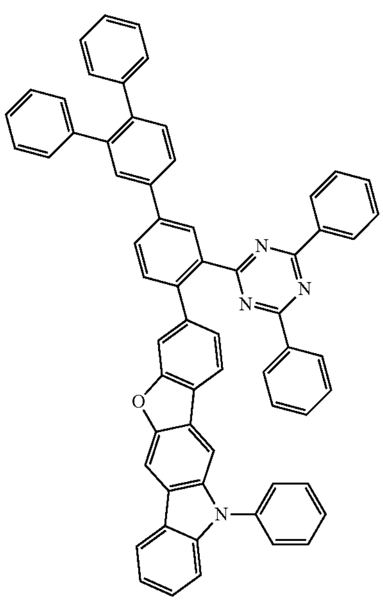
-continued
788
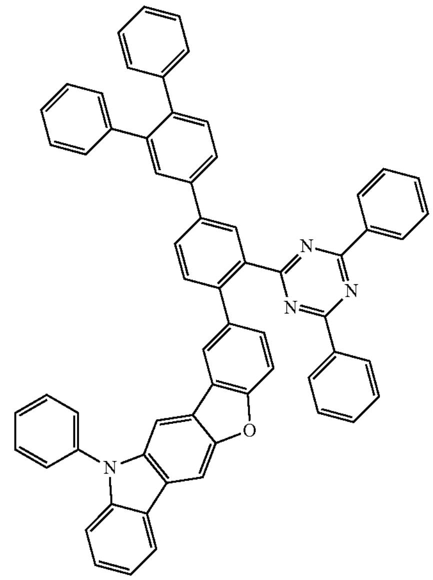
789
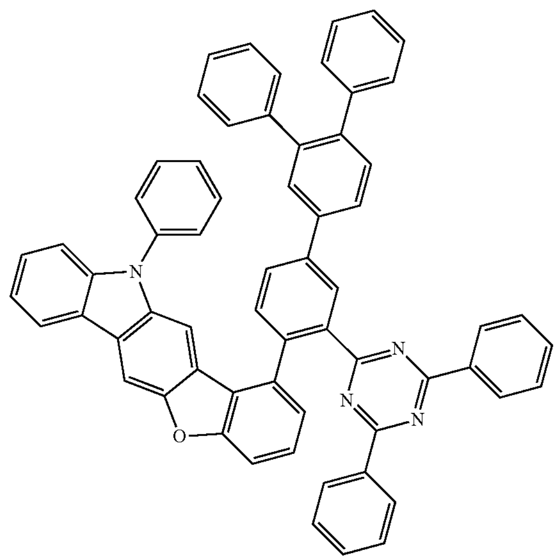
790
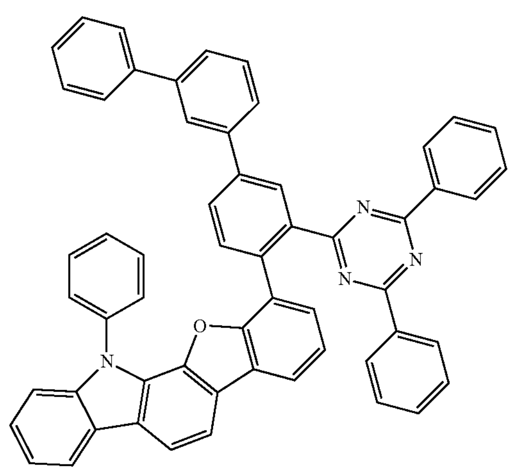

-continued
791
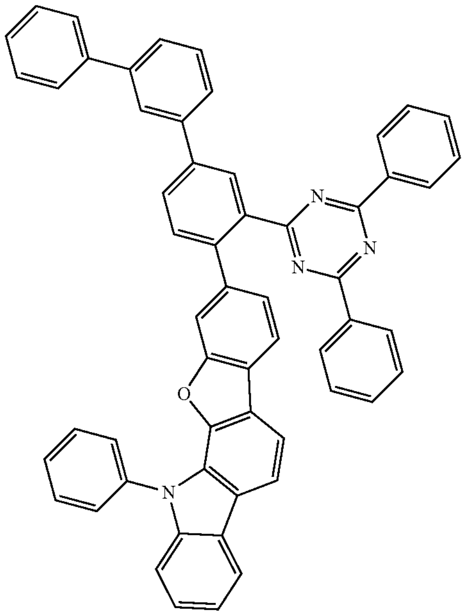
792
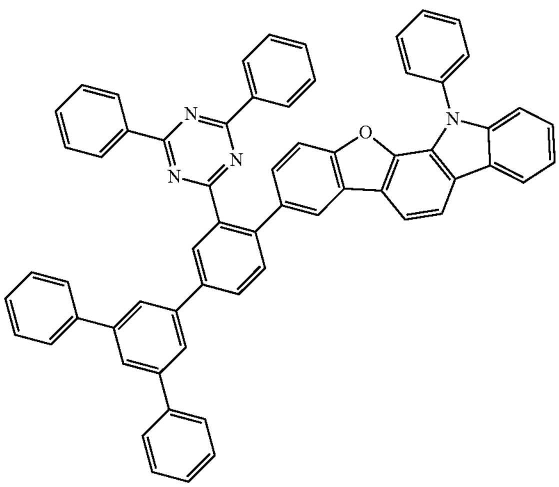
793
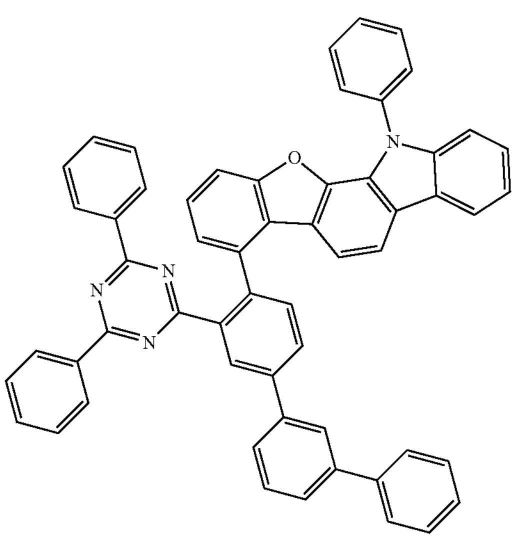
-continued
794
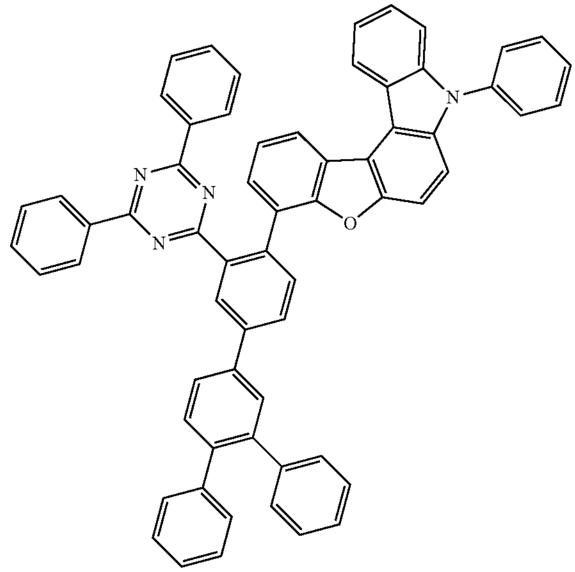
795
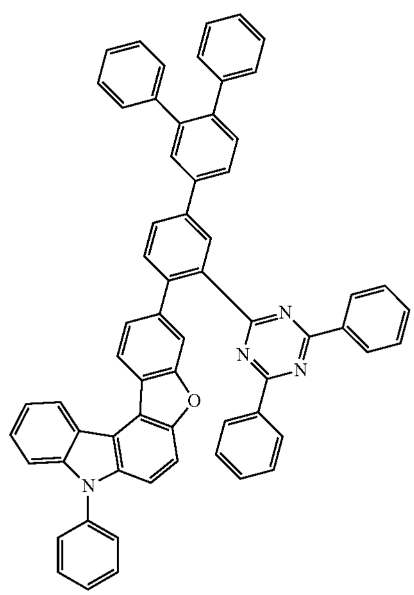

-continued
796
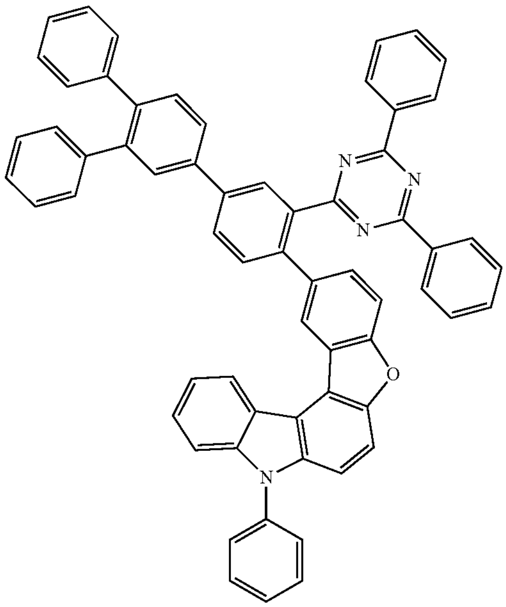
797
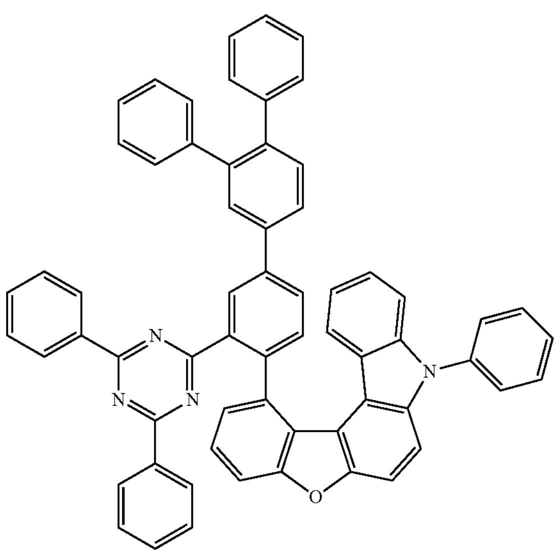
-continued
798
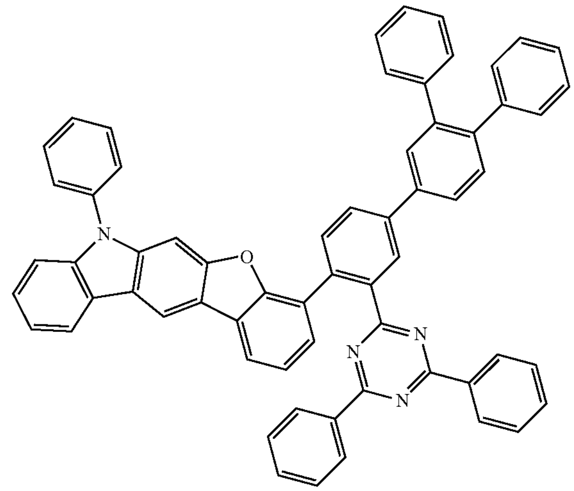
799
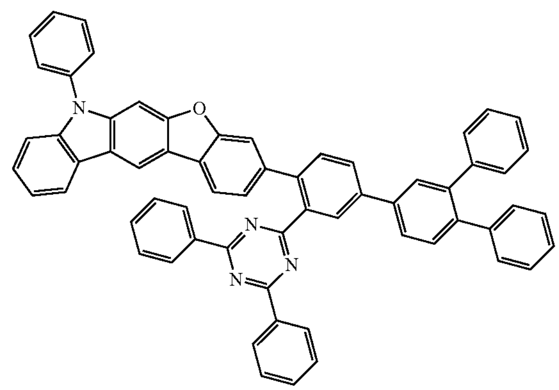
800
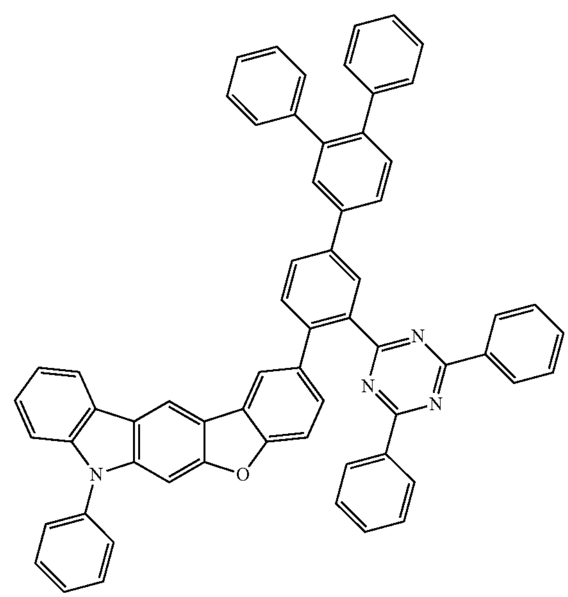

-continued
801
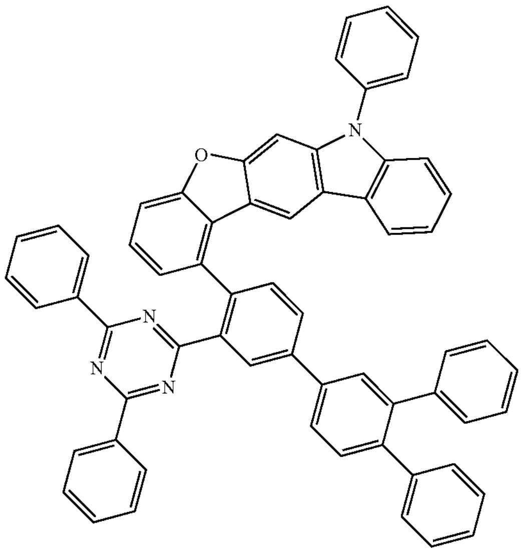
802
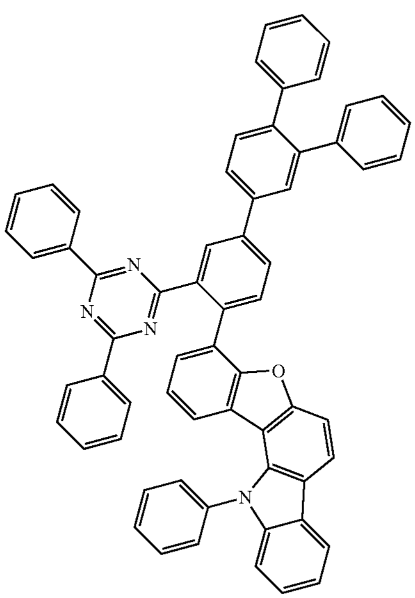
-continued
803
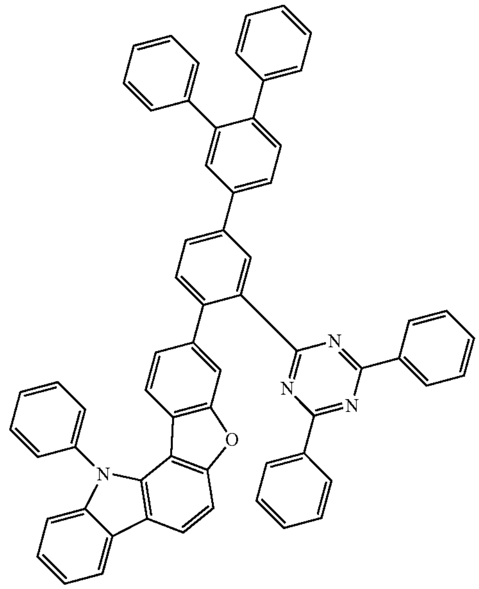
804
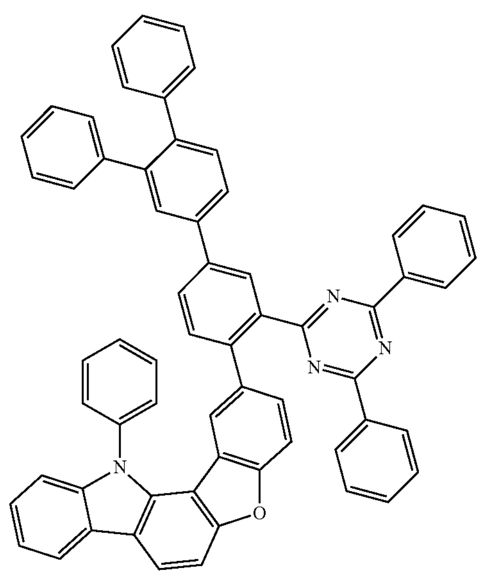

-continued
805
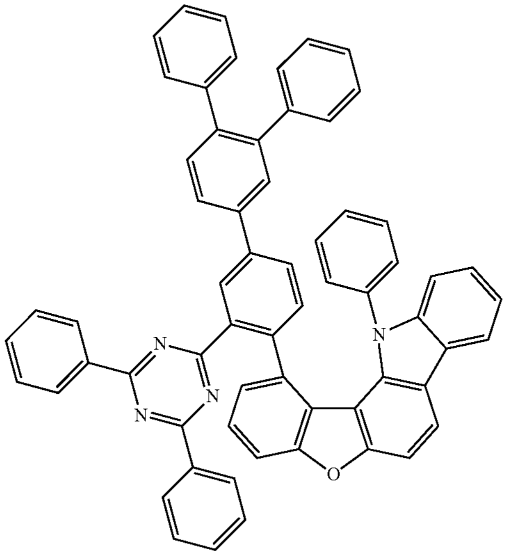
806
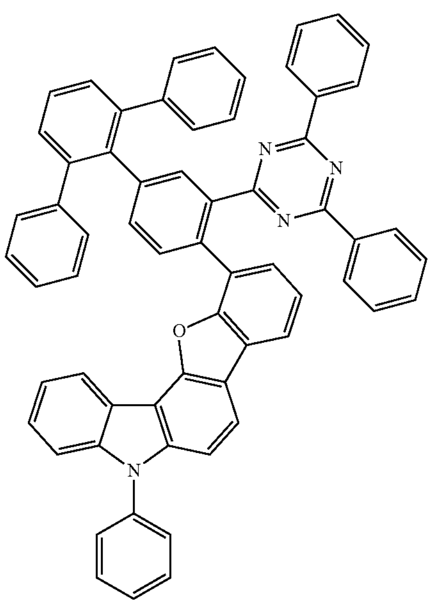
-continued
807
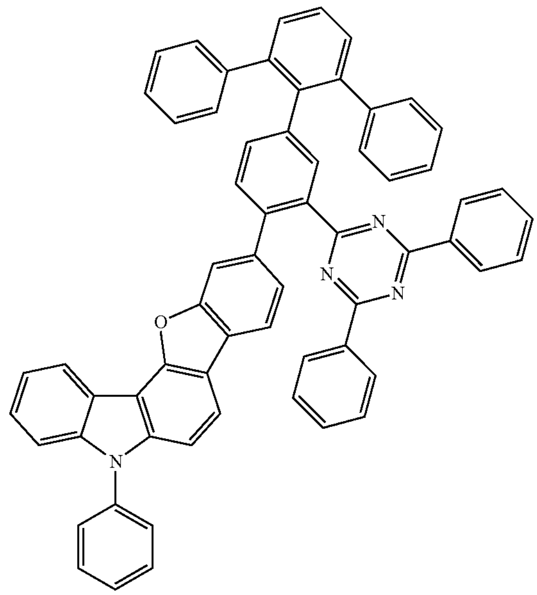
808
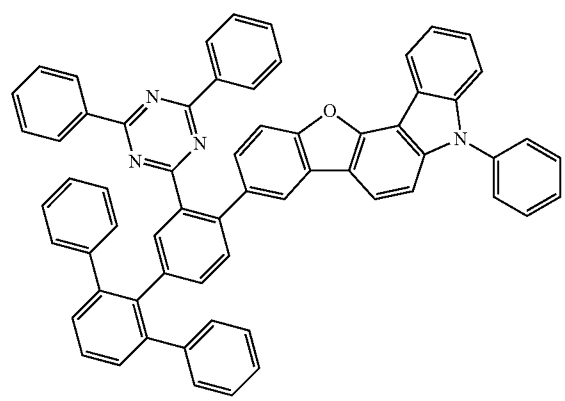
809
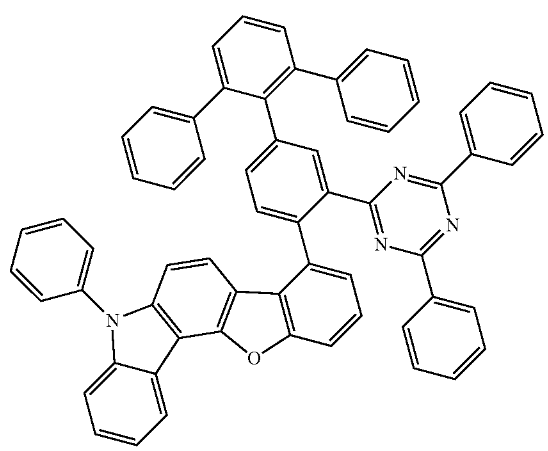

810
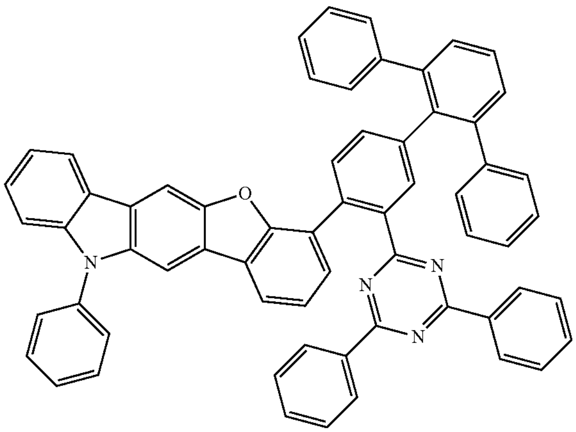
811
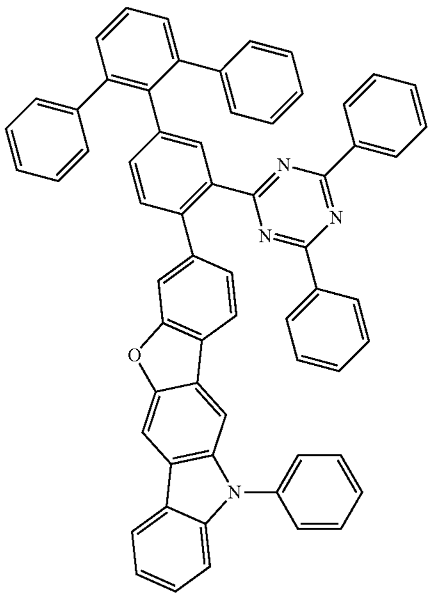
812
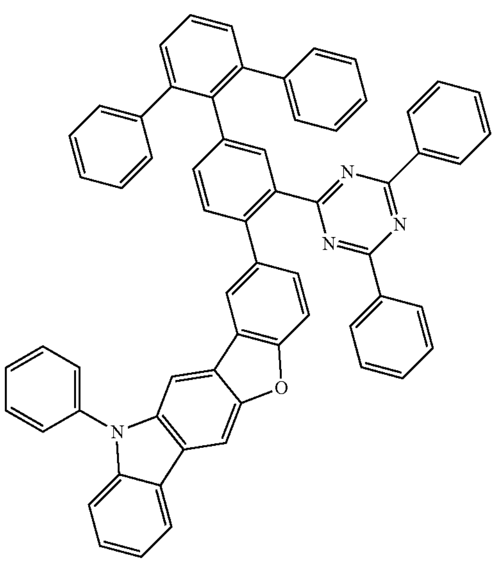
813
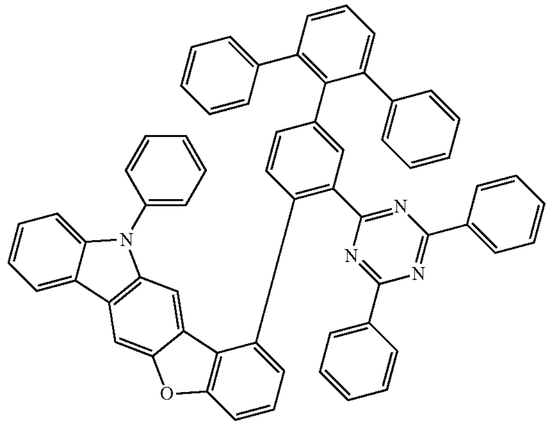
814
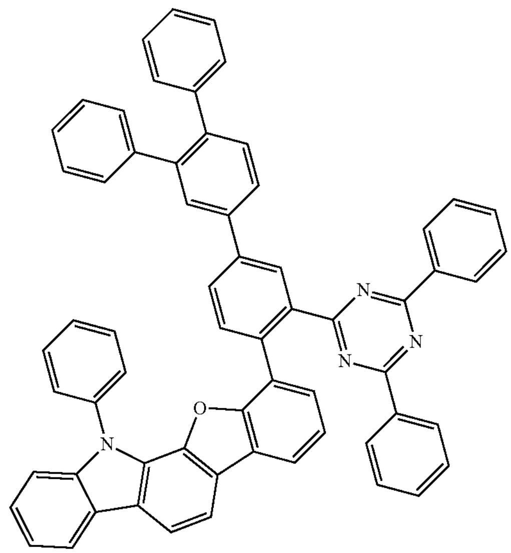
815
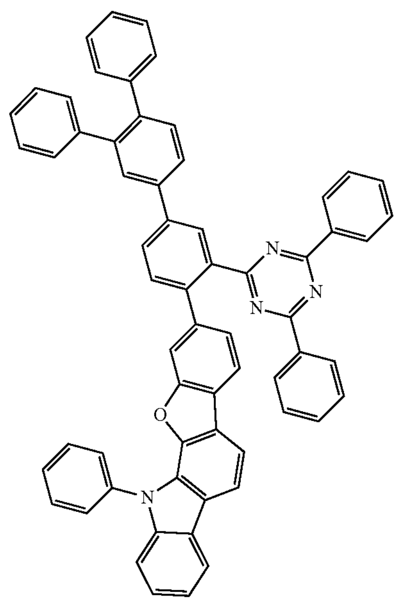

-continued
816
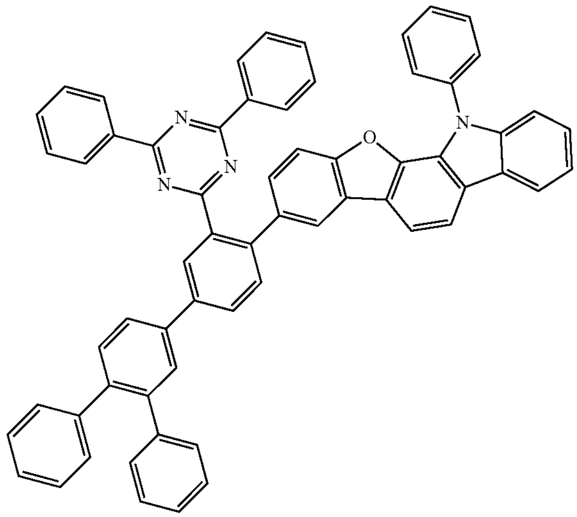
817
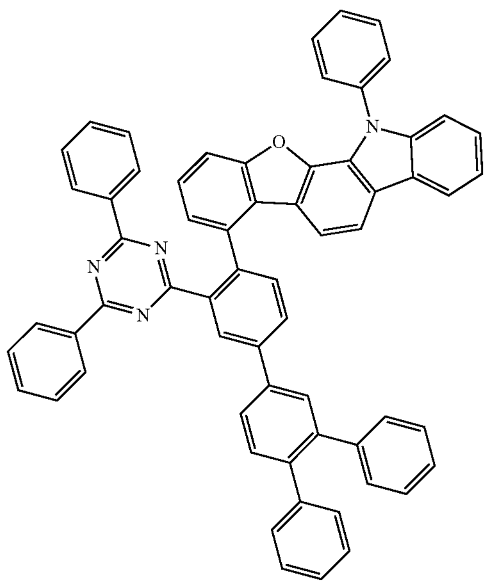
818
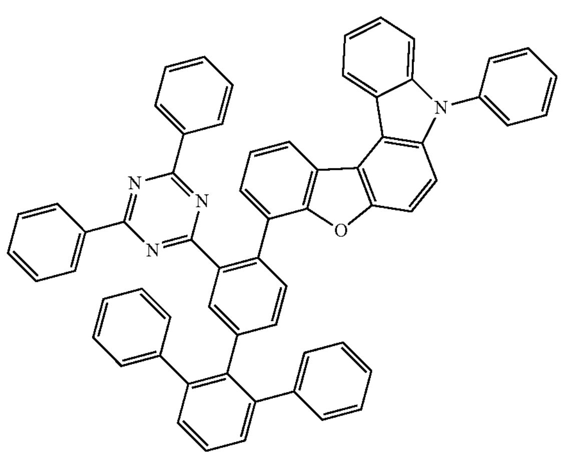
-continued
819
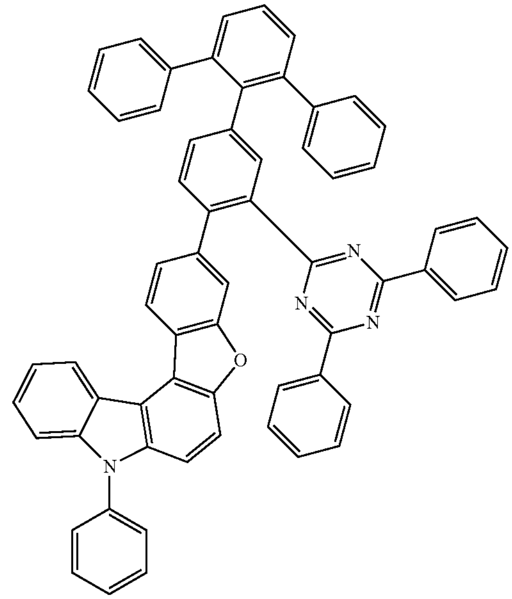
820
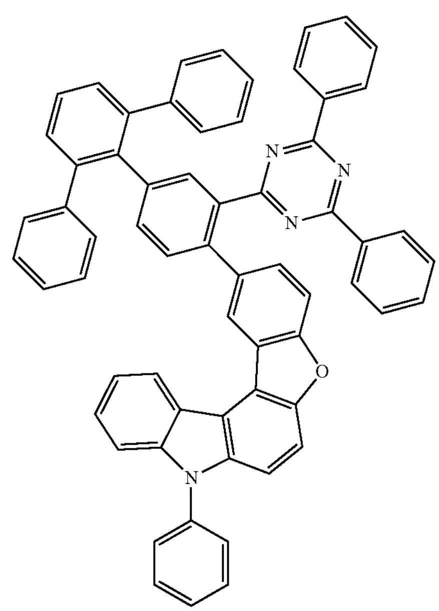

-continued
821
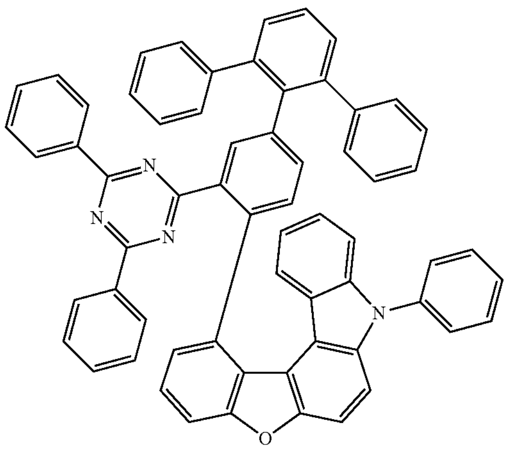
822
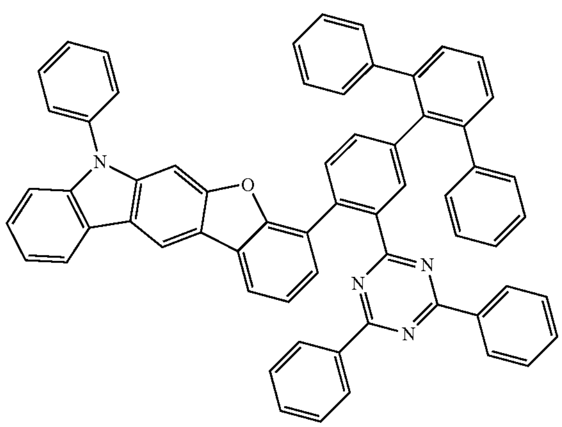
823
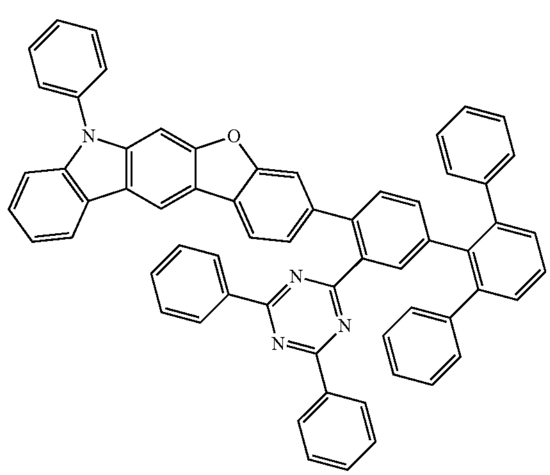
-continued
824
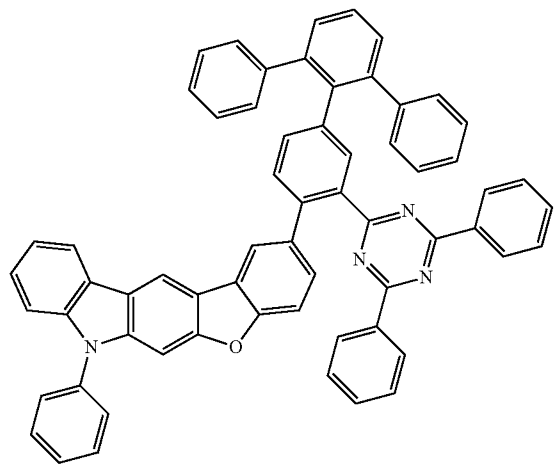
825
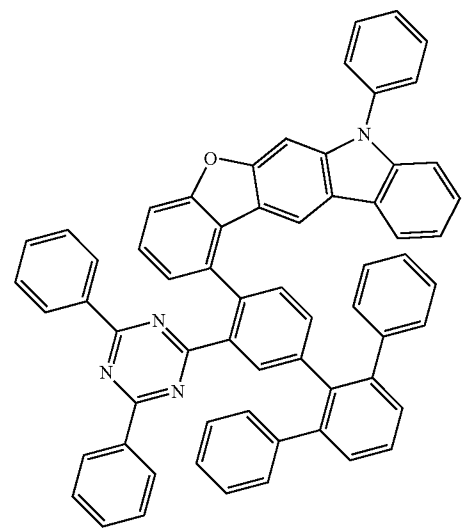
826
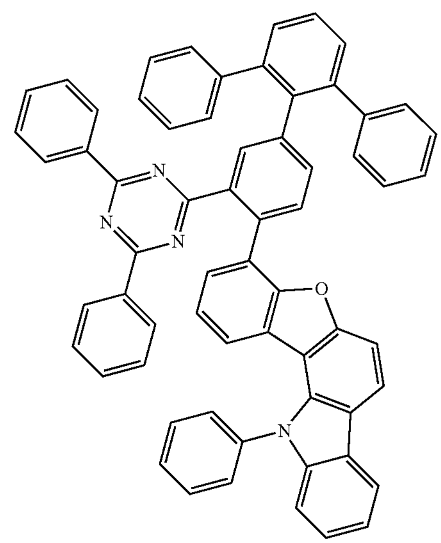

827
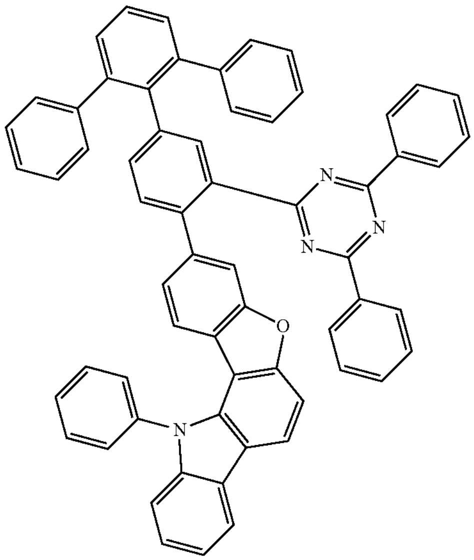
828
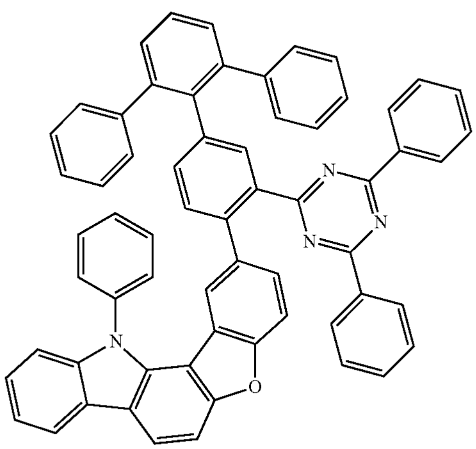
829
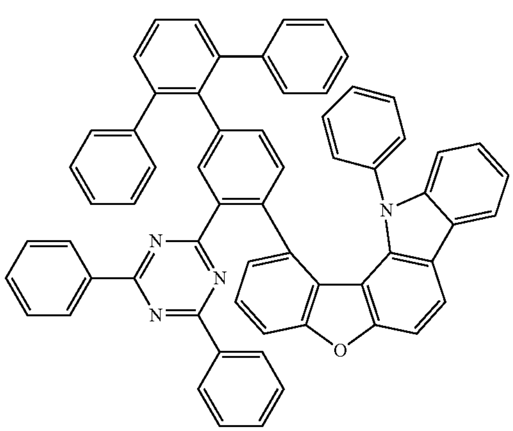
830
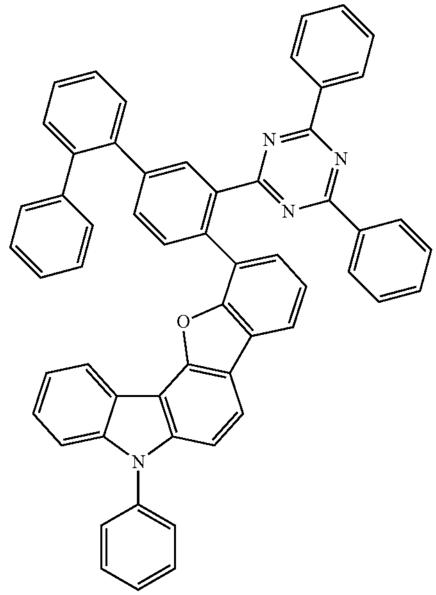
831
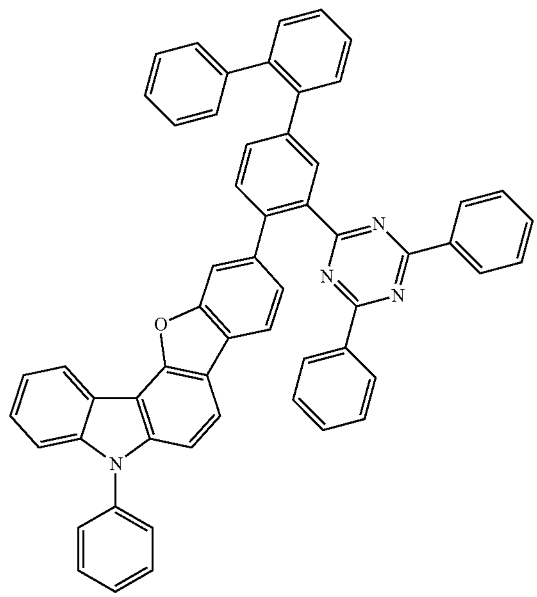
832
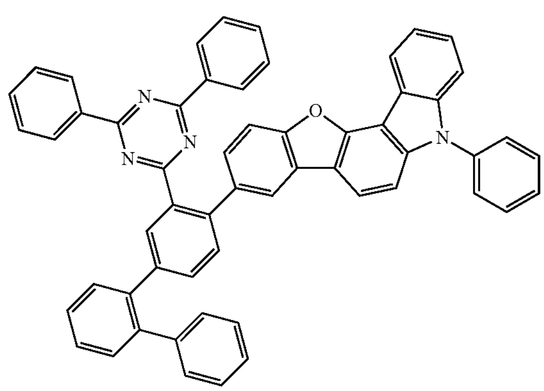

-continued
833
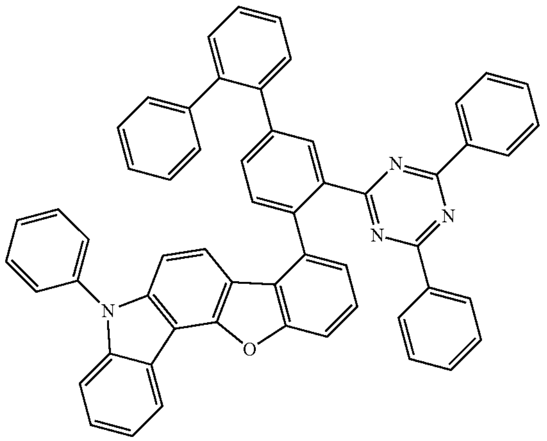
834
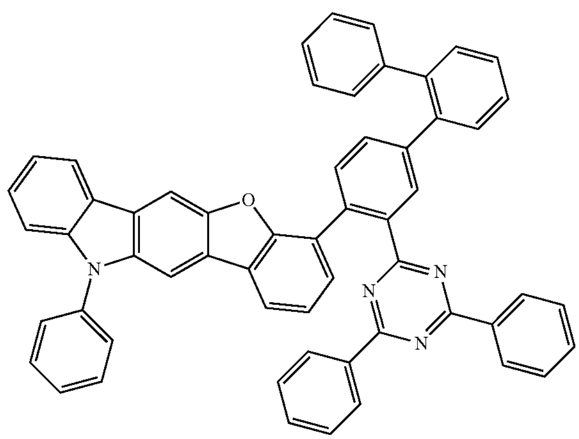
835
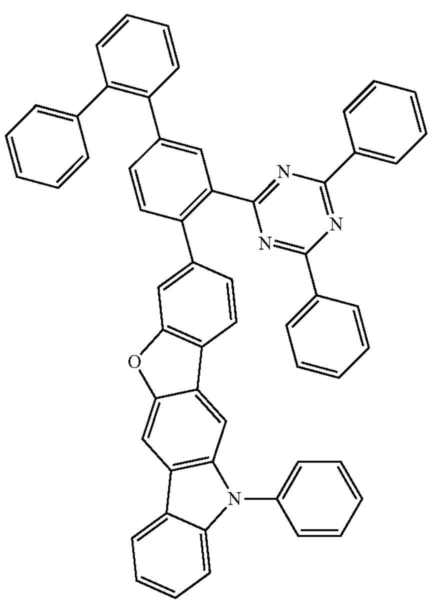
-continued
836
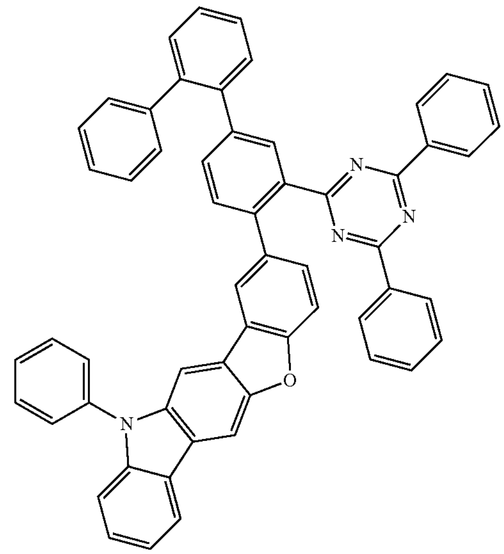
837
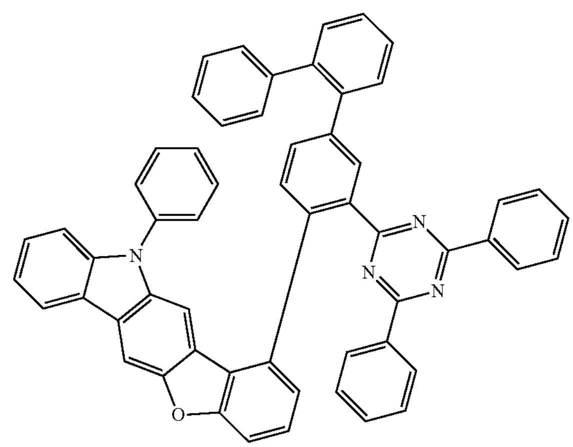
838
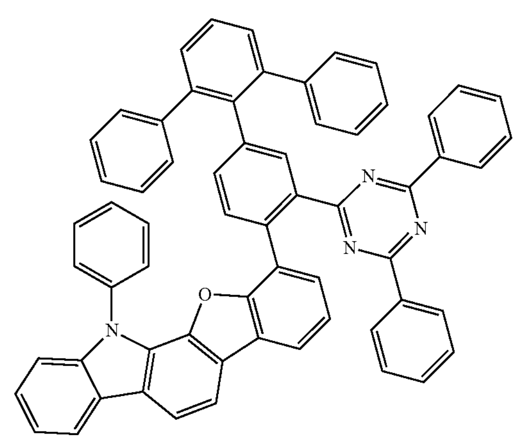

-continued
839
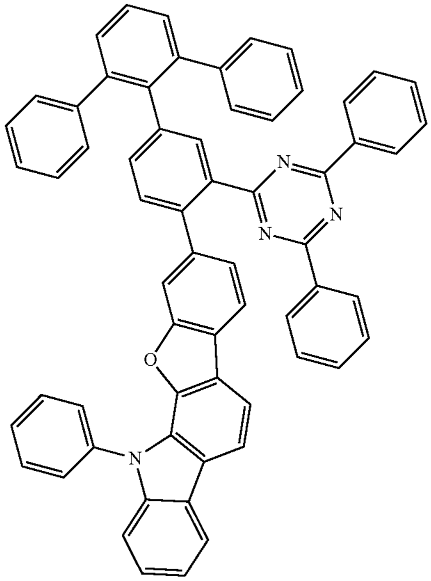
840
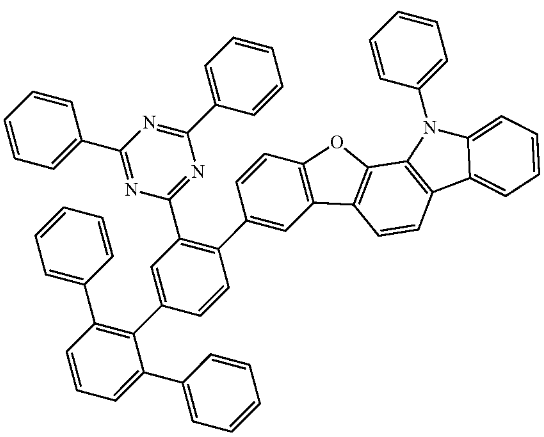
841
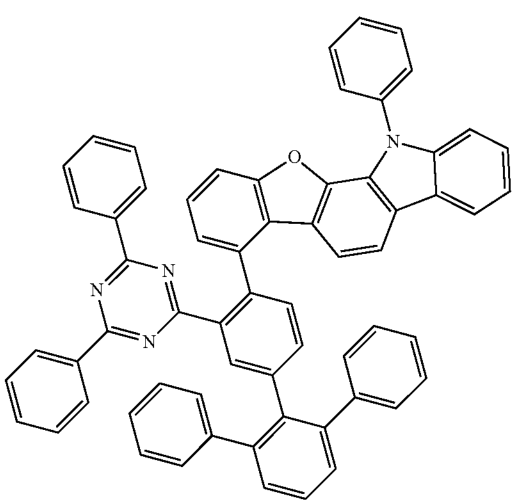
-continued
842
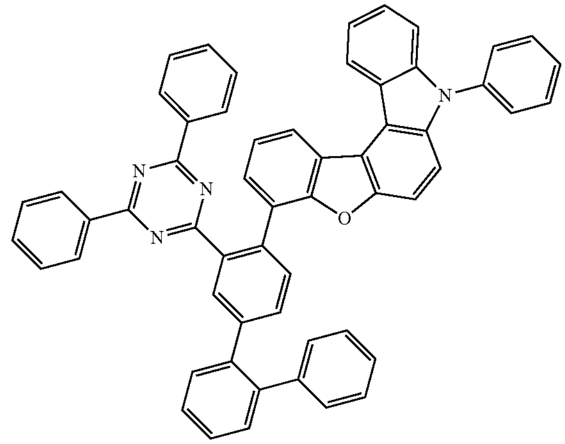
843
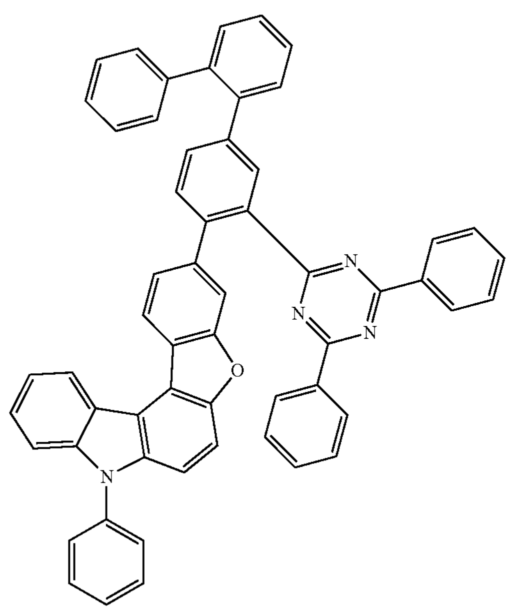

-continued
844
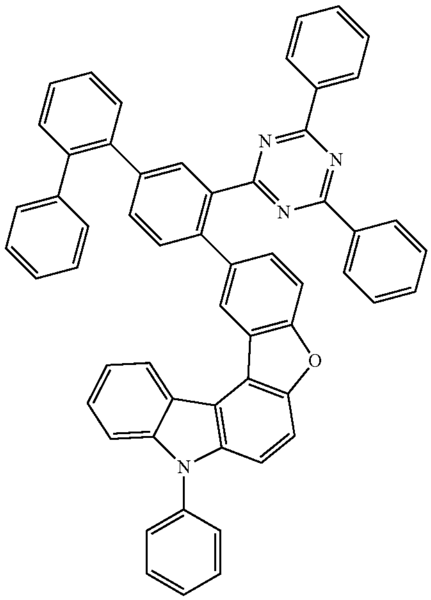
845
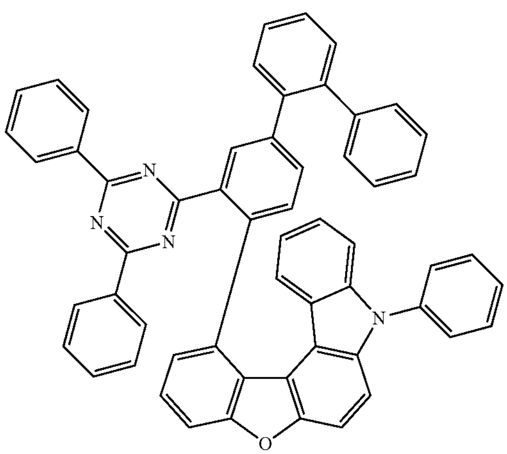
846
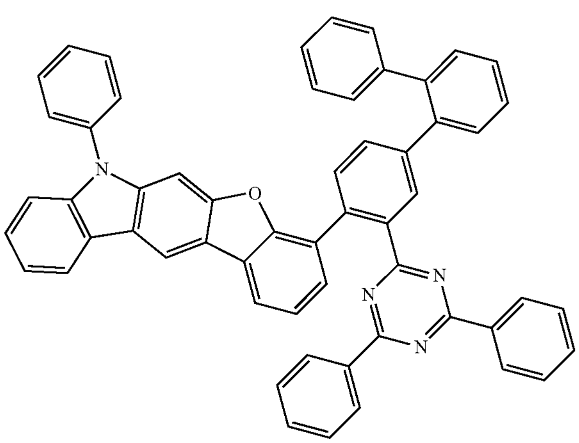
-continued
847
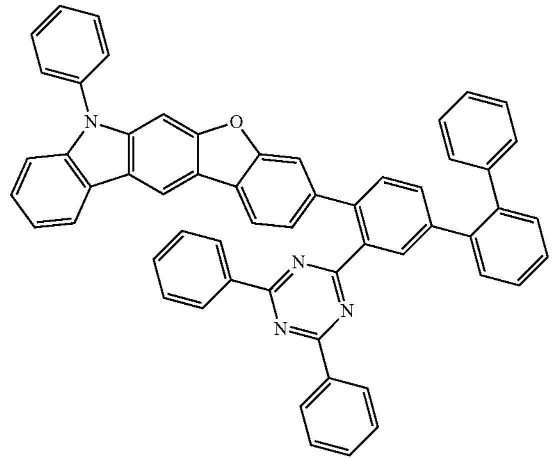
848
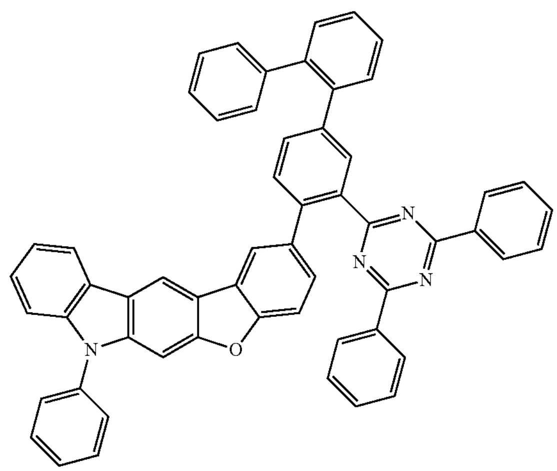
849
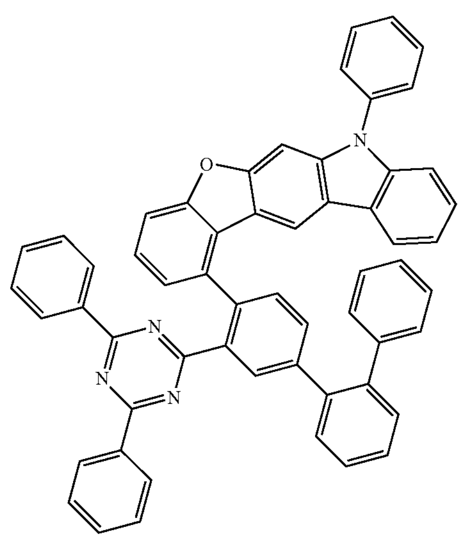

850
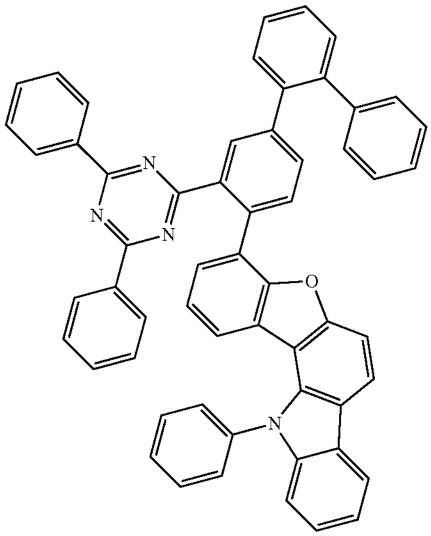
851
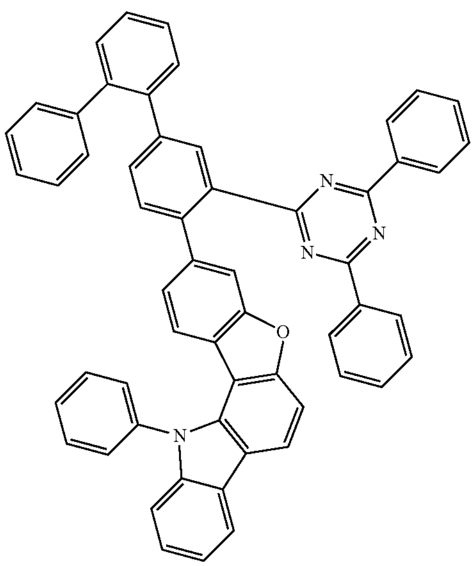
852
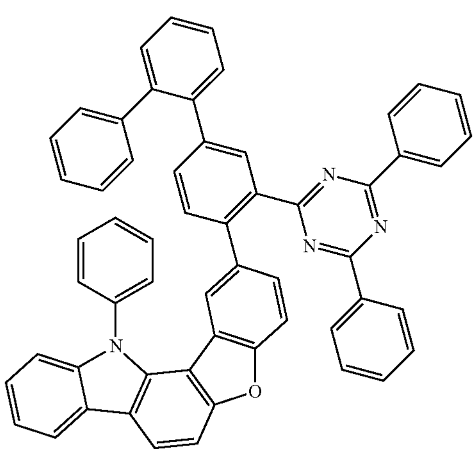
853
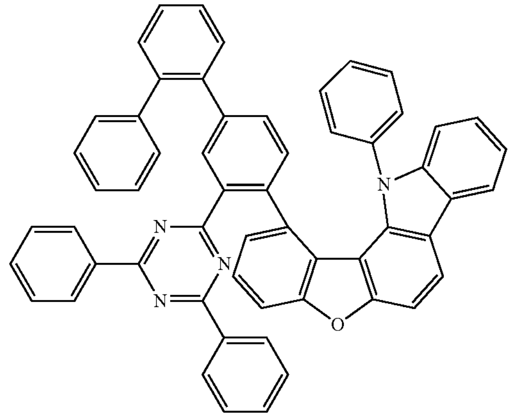
854
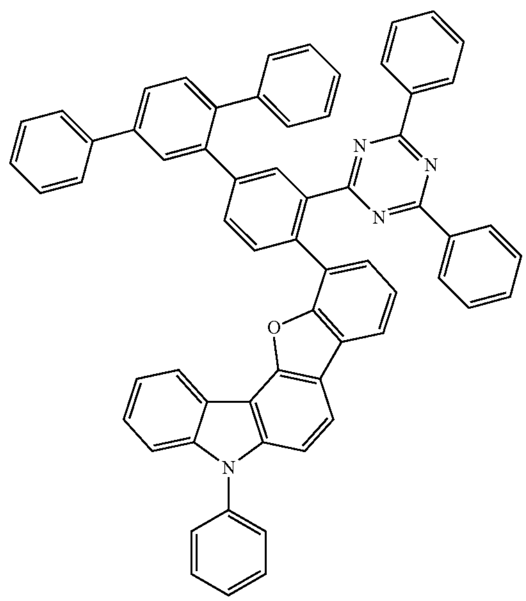
855
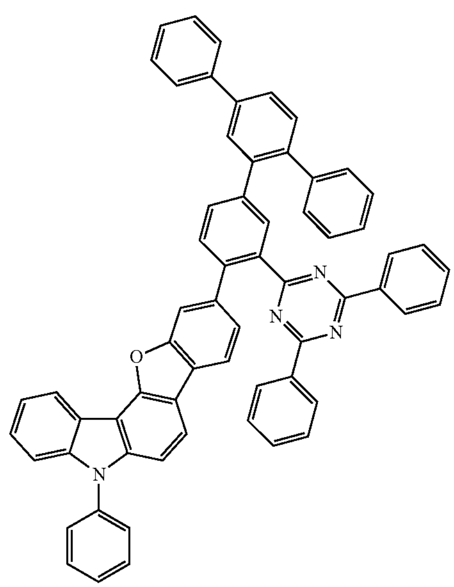

-continued
856
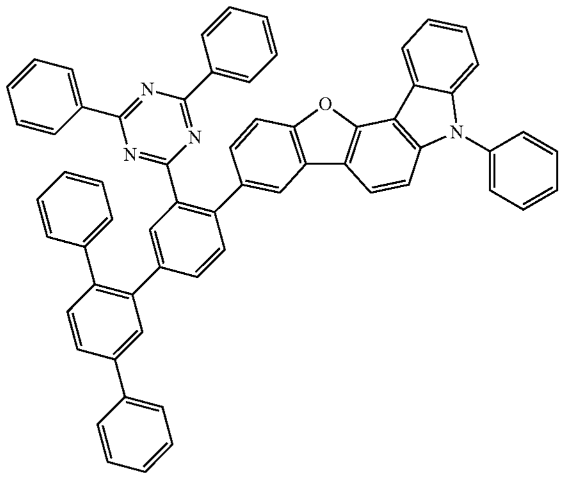
857
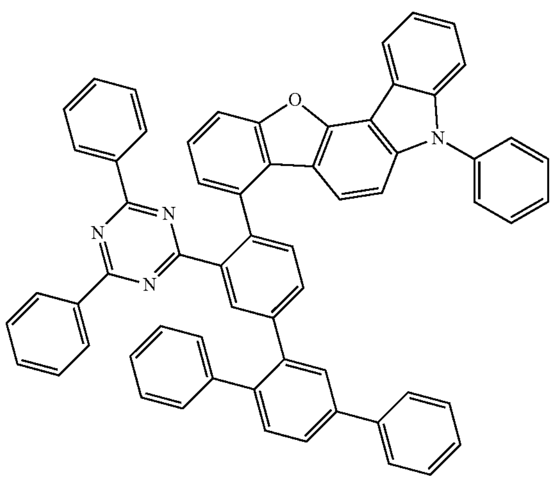
858
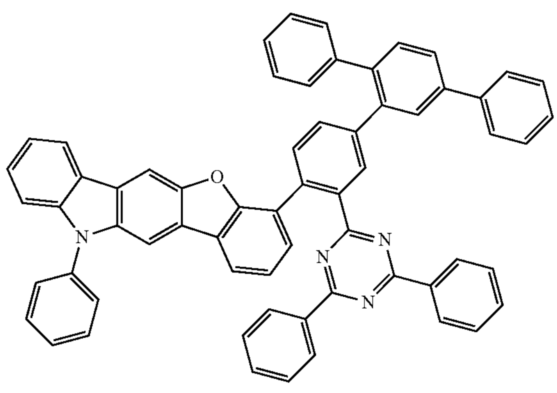
-continued
859
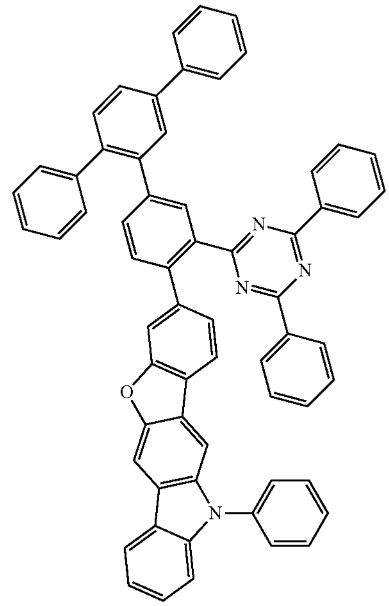
860
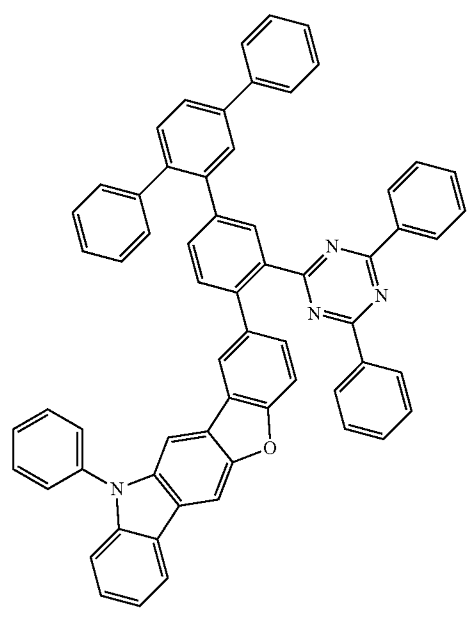

-continued
861
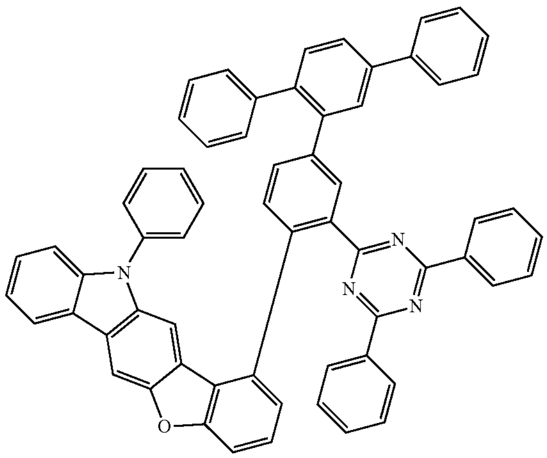
862
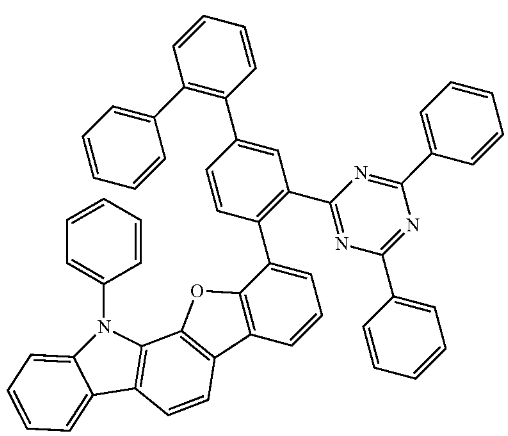
863
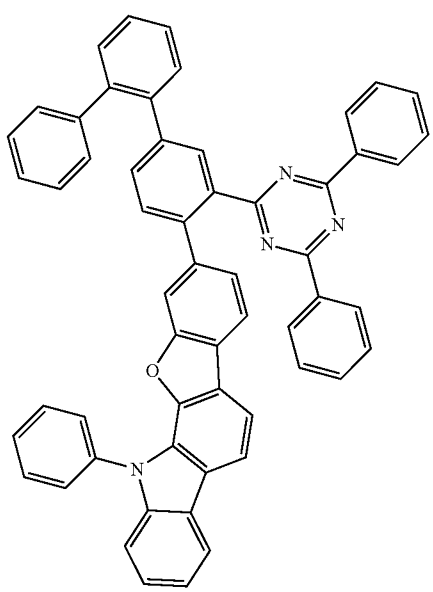
-continued
864
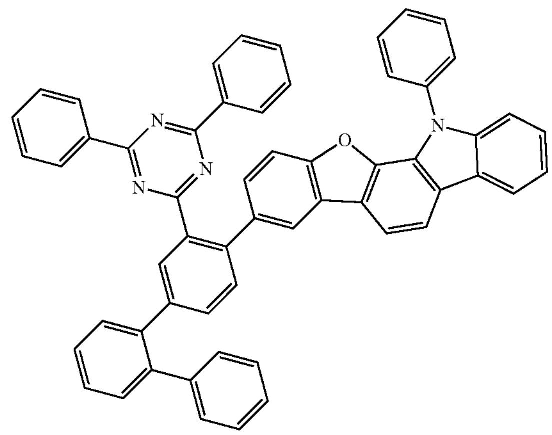
865
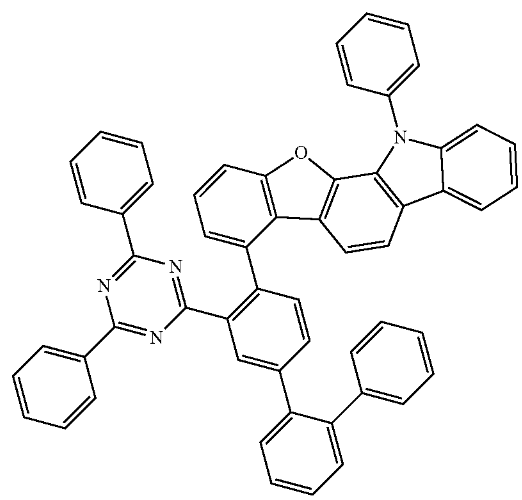
866
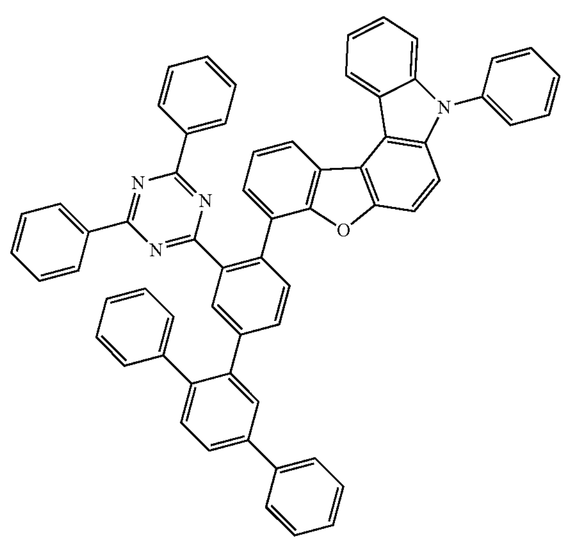

-continued
867
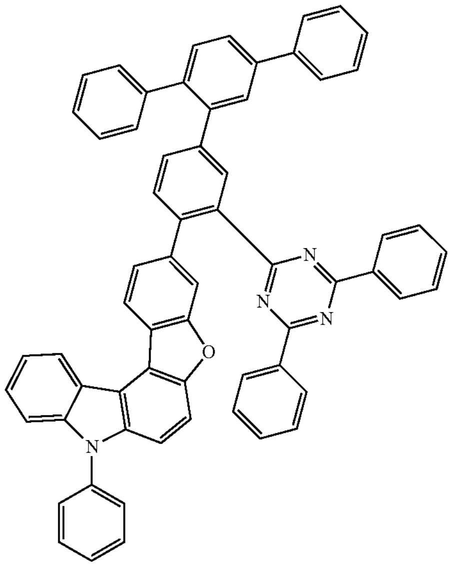
868
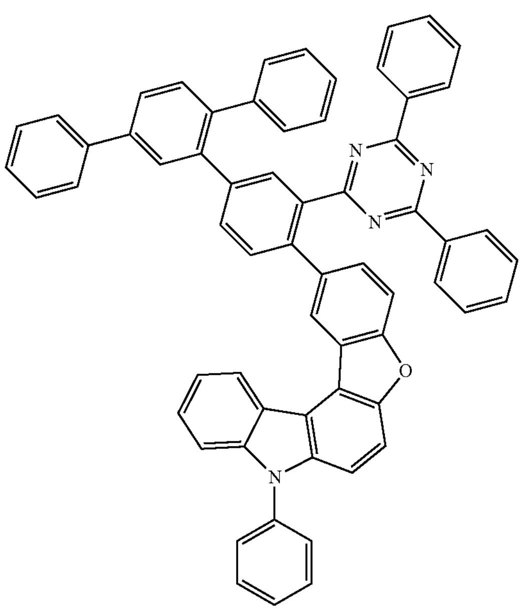
-continued
869
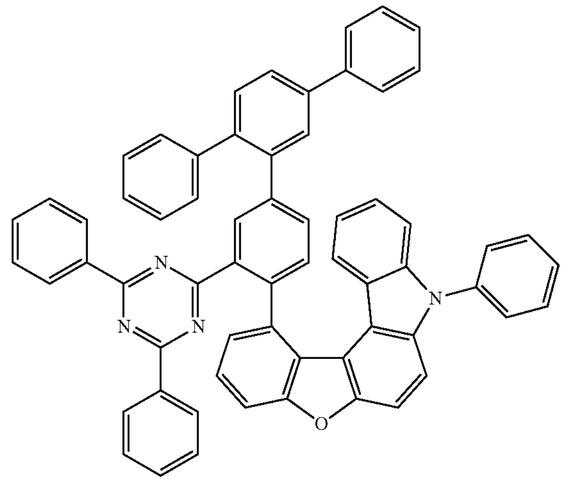
870
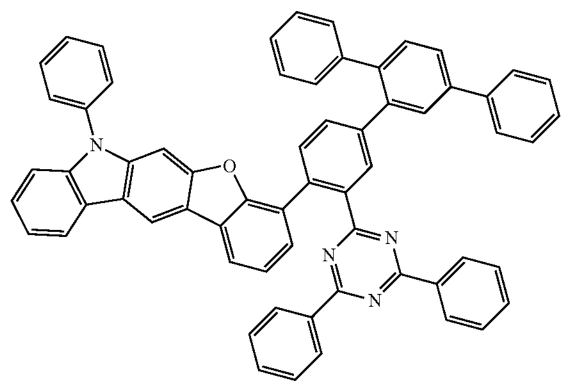
871
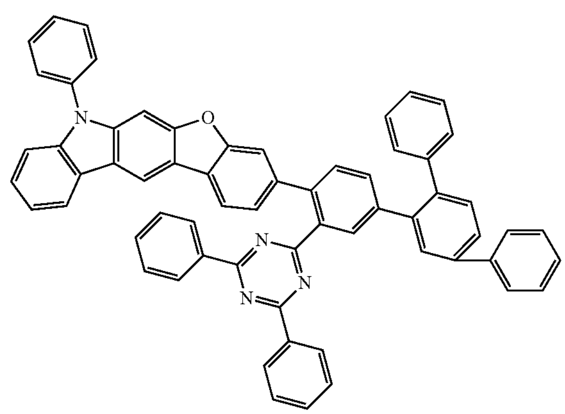

-continued
872
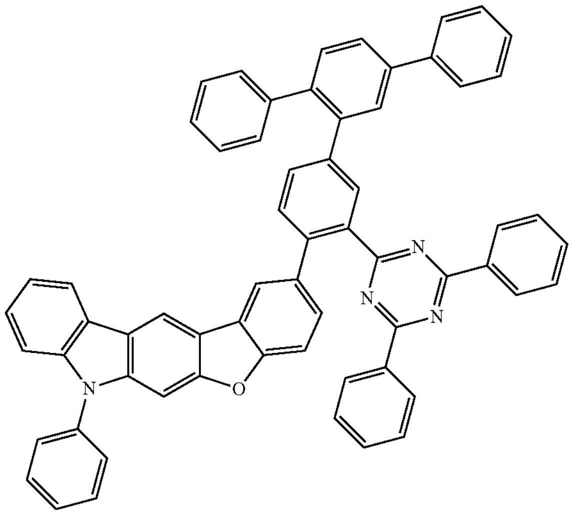
873
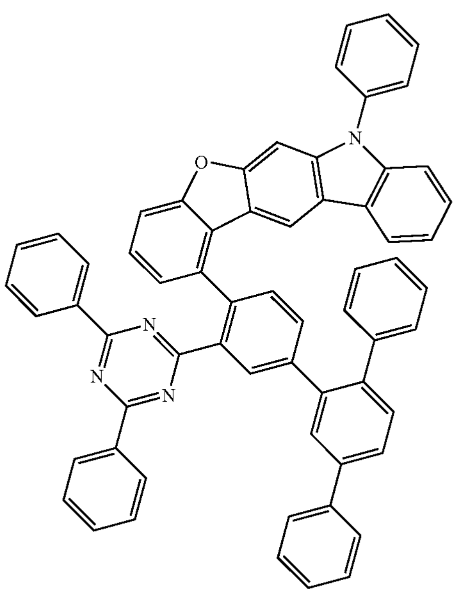
-continued
874
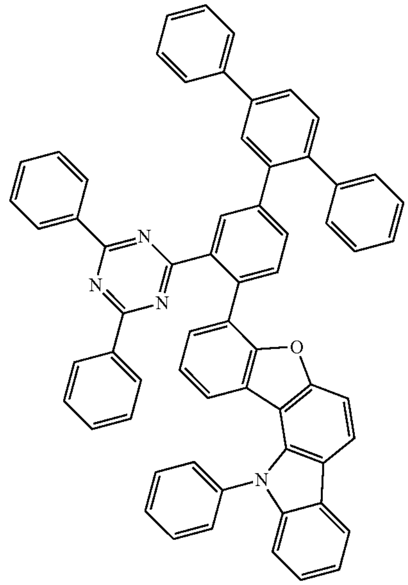
875
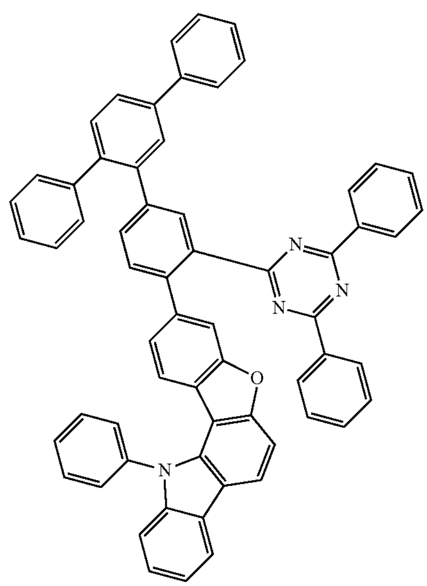

-continued
876
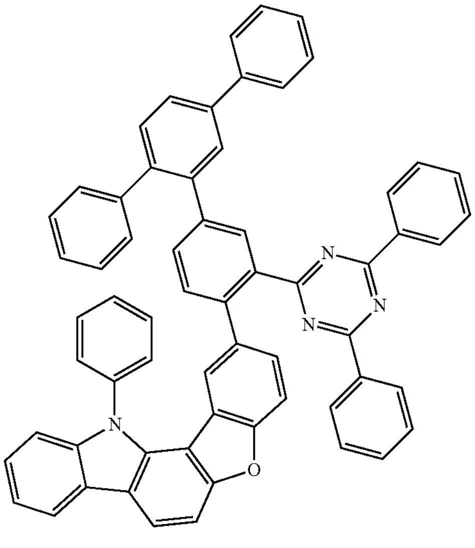
877
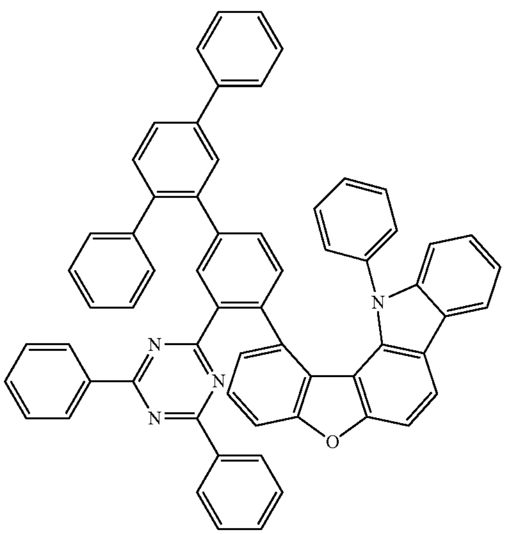
878
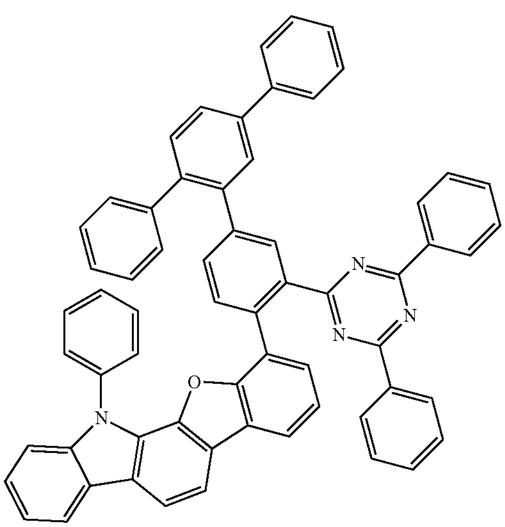
-continued
879
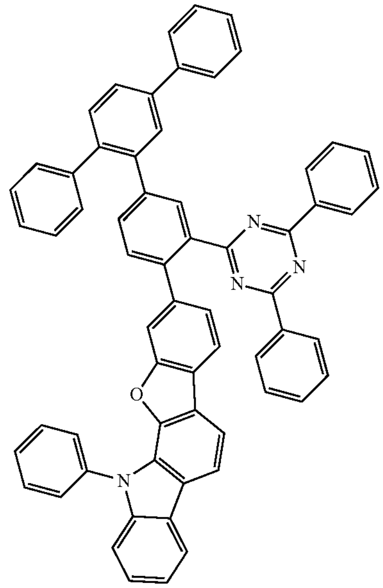
880
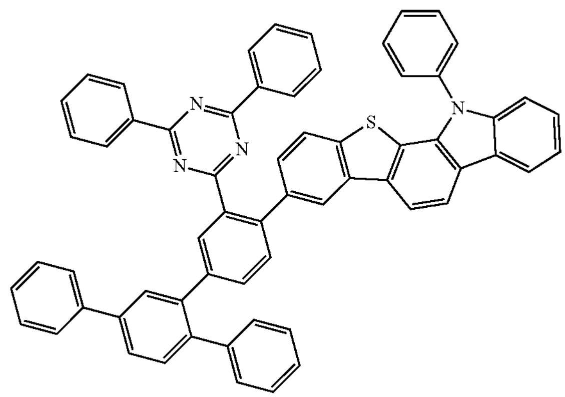
881
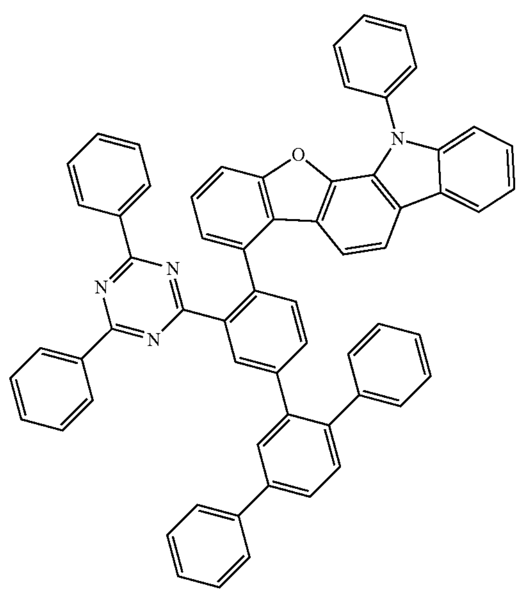

-continued
882
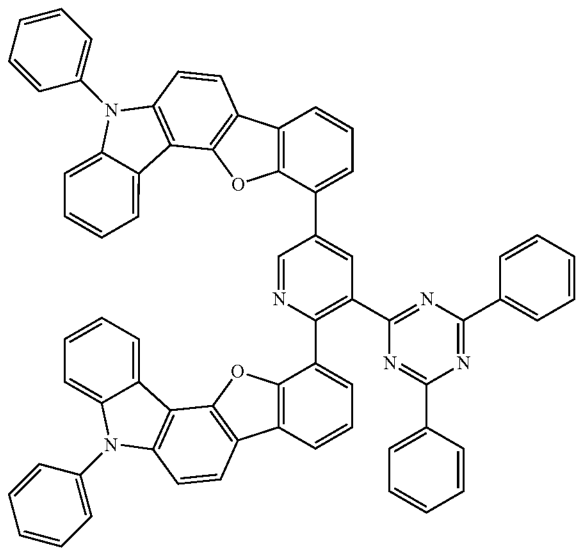
883
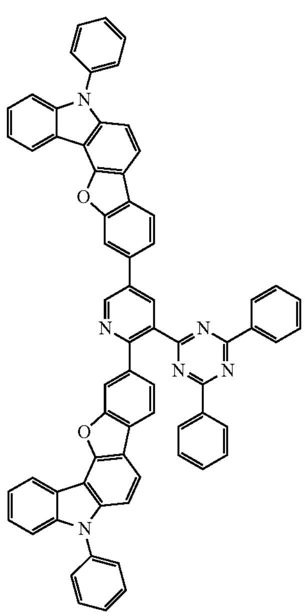
-continued
884
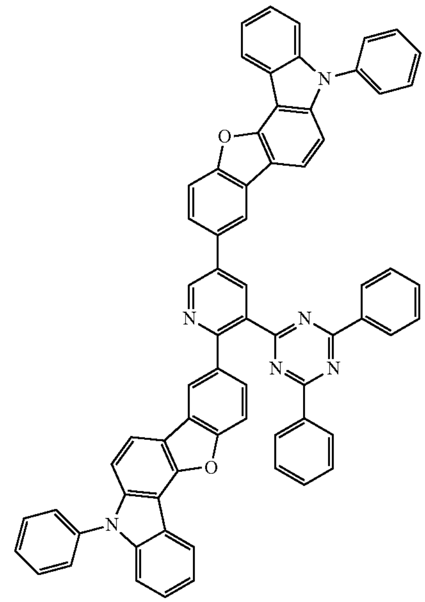
885
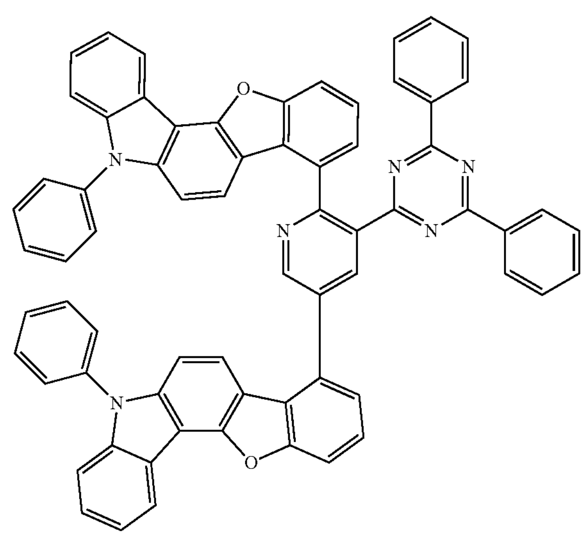

-continued
886
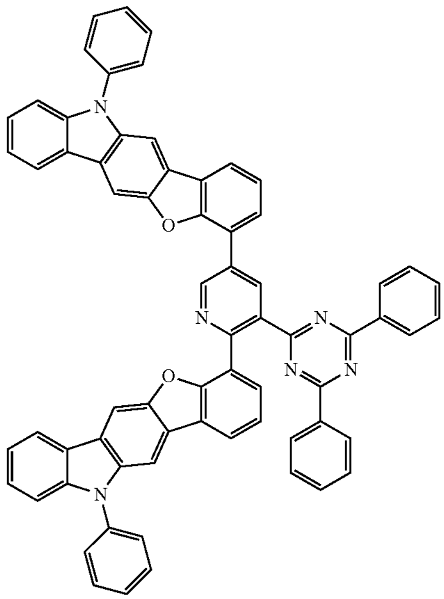
887
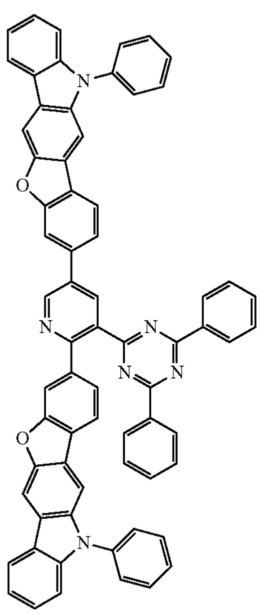
-continued
888
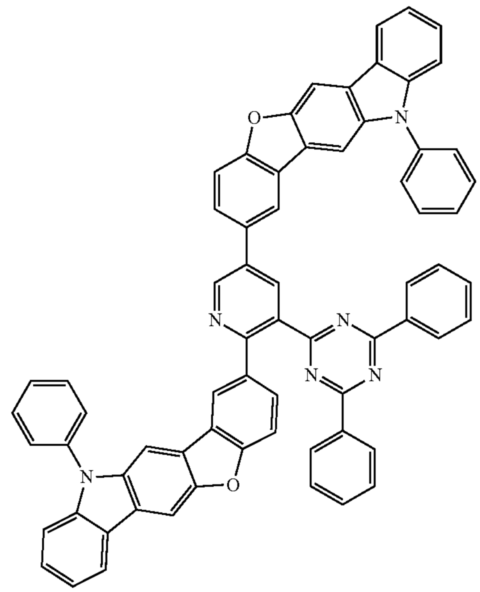
889
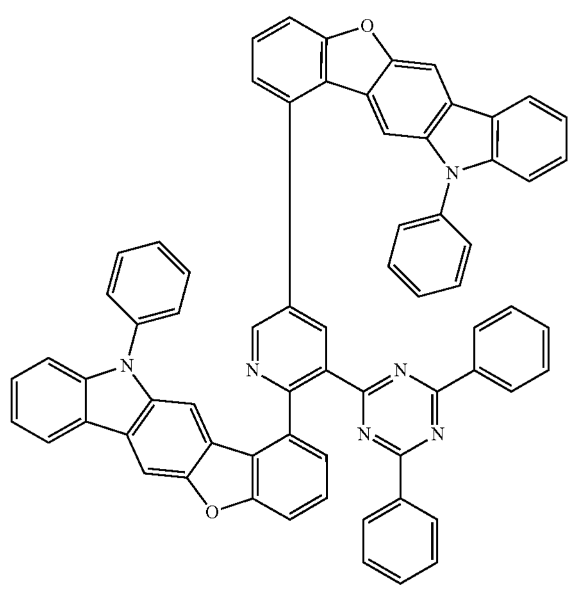

-continued
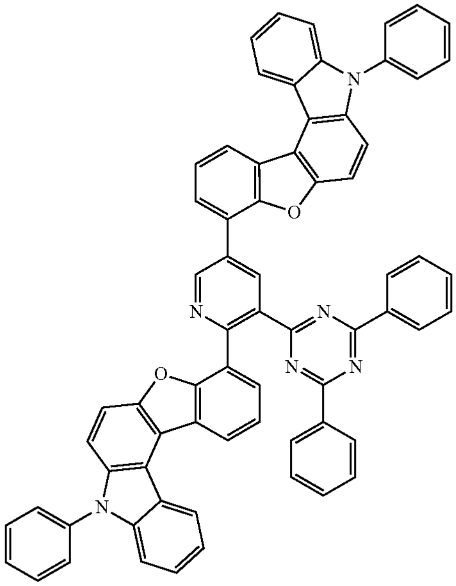
890
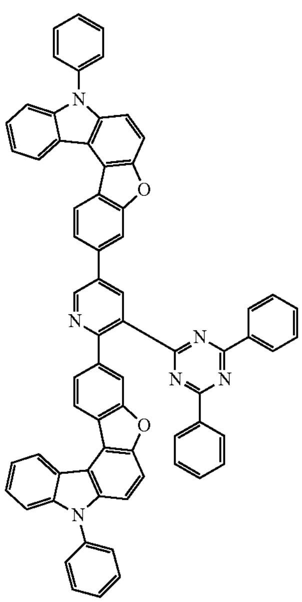
891
-continued
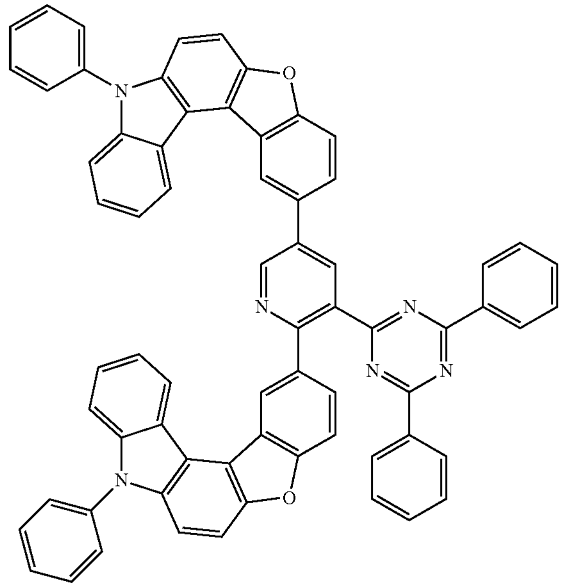
892
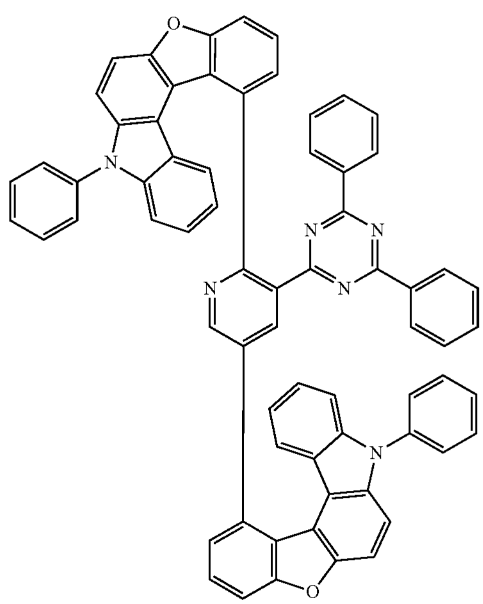
893

-continued
894
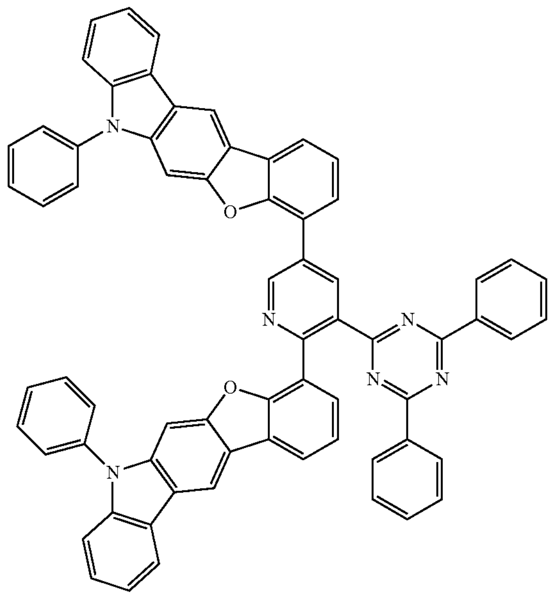
895
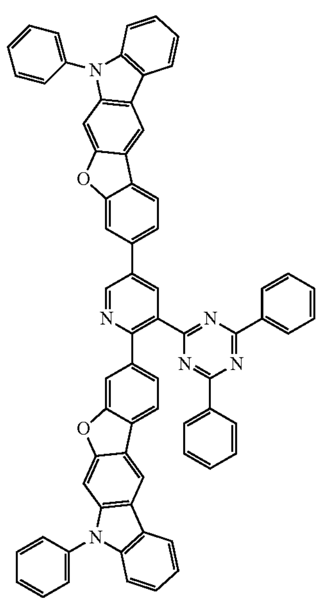
-continued
896
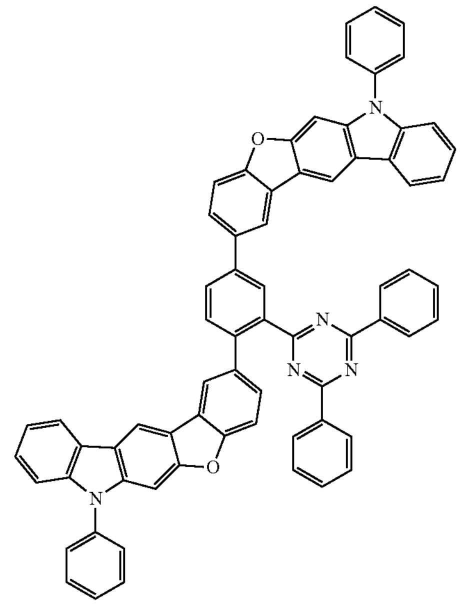
897
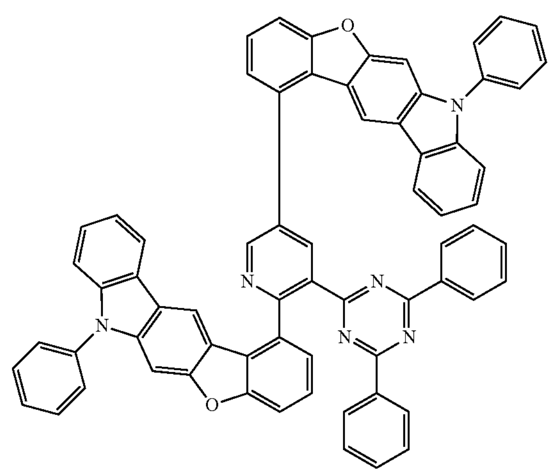

-continued
898
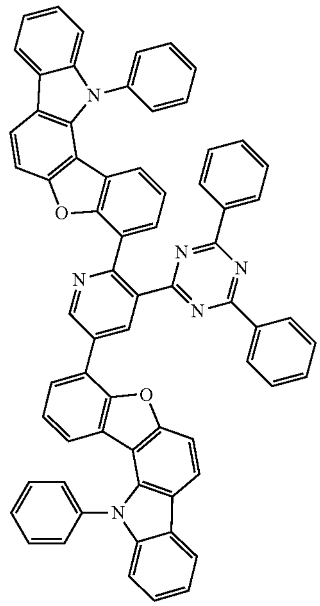
899
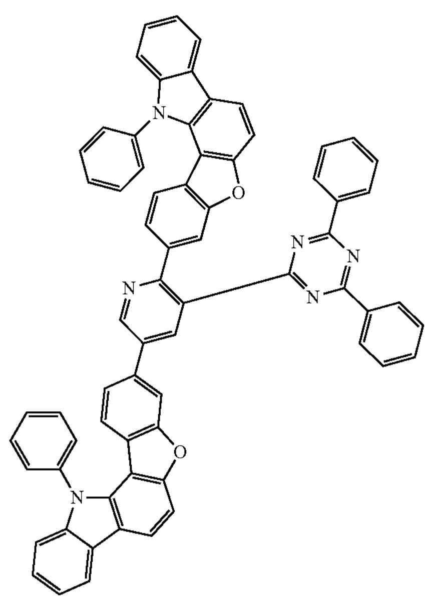
900
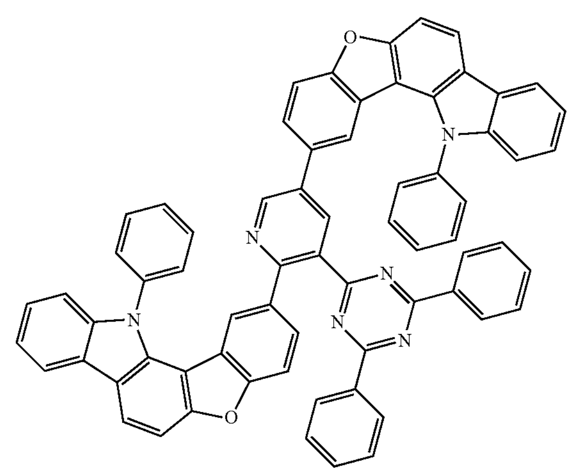
901
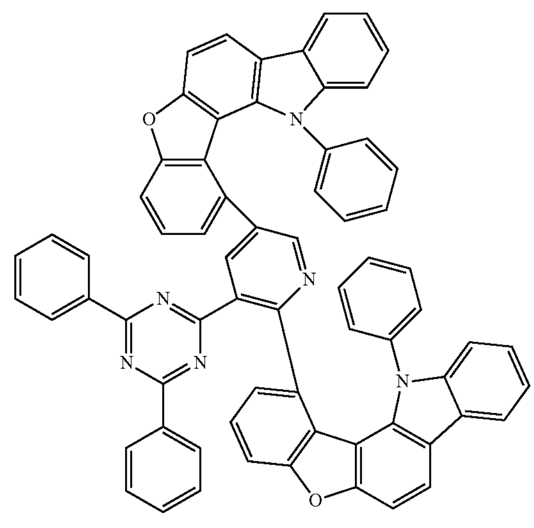
902
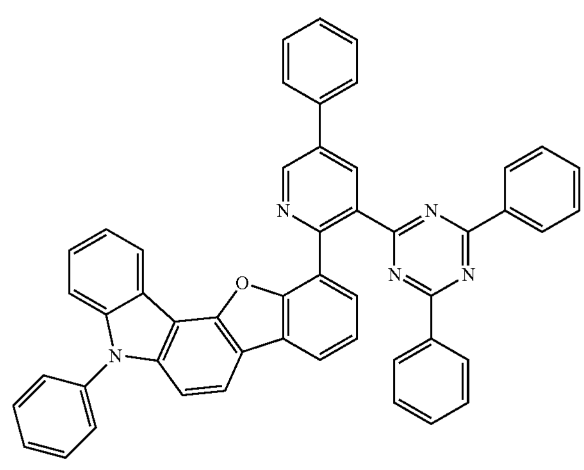

-continued
903
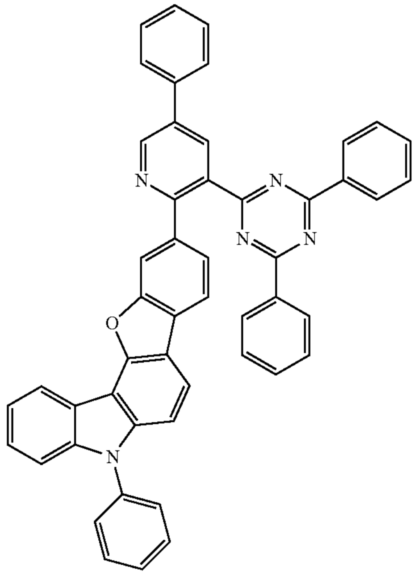
904
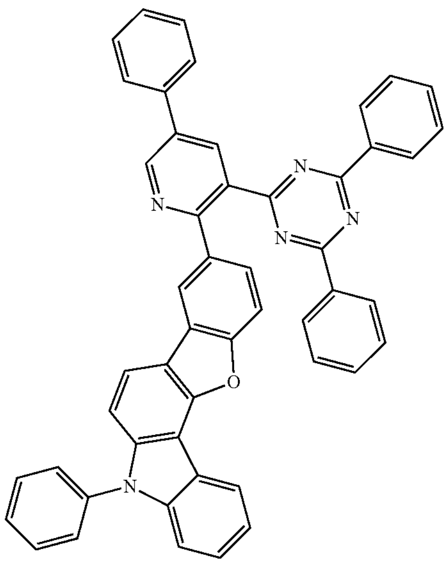
905
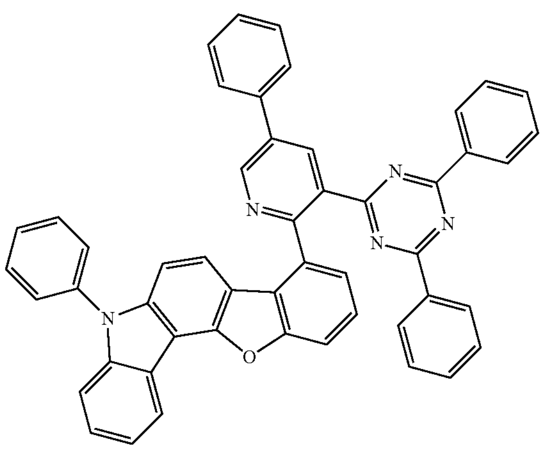
-continued
906
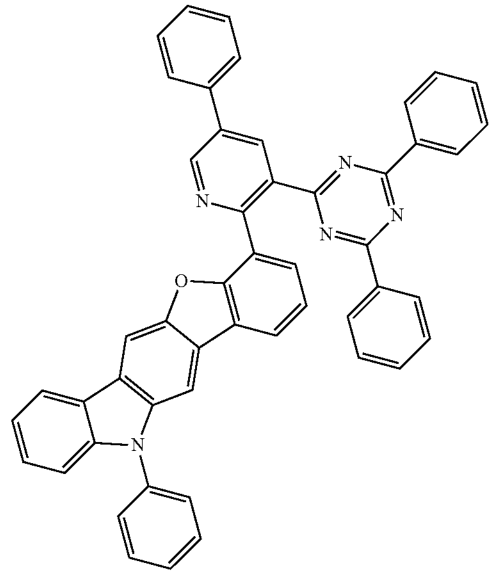
907
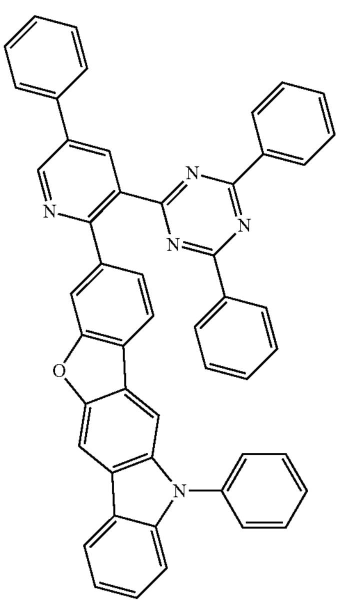

908
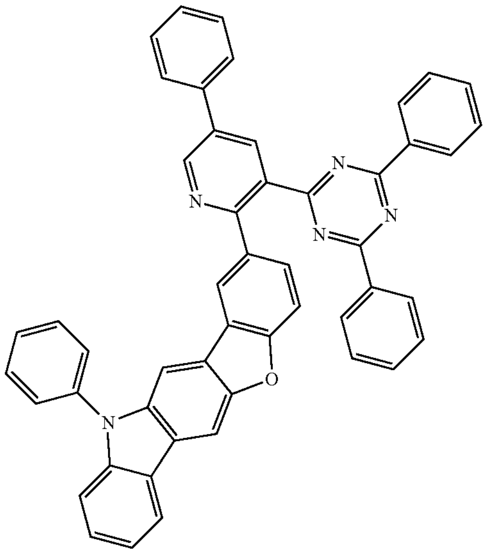
909
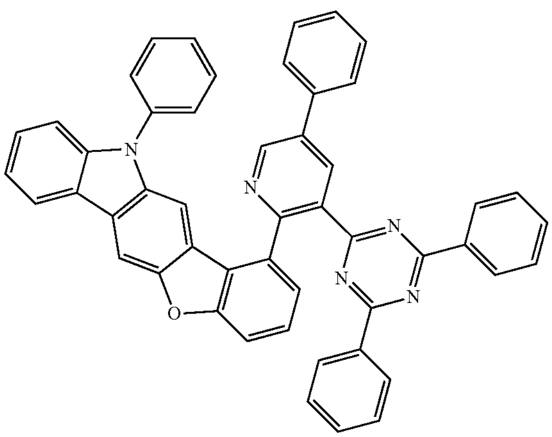
910
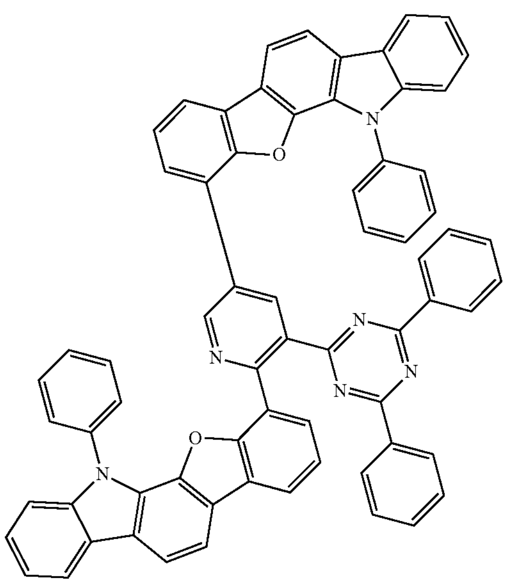
911
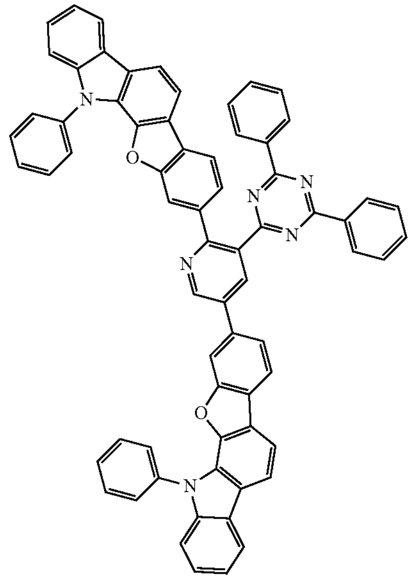
912
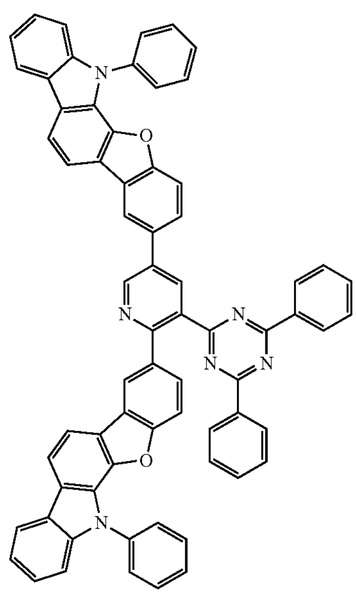

-continued
913
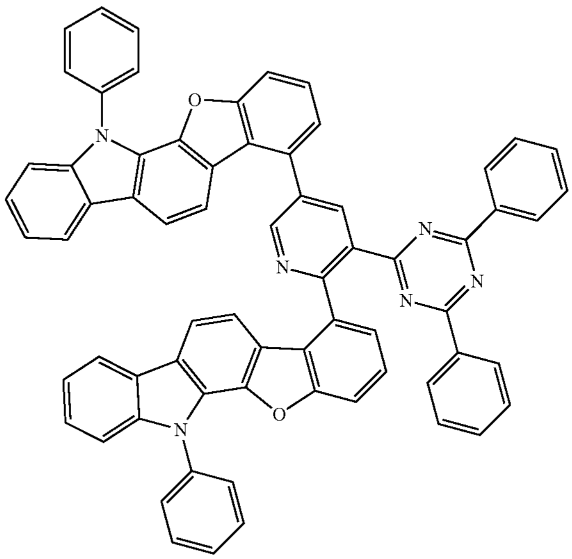
914
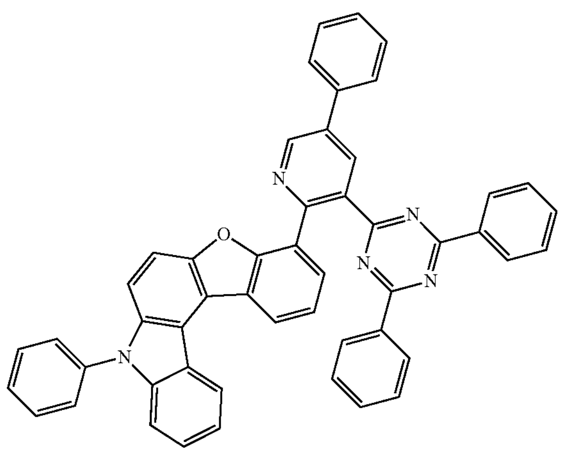
915
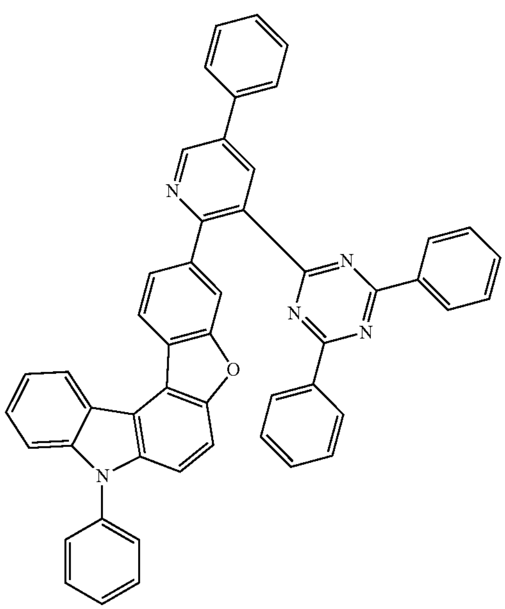
-continued
916
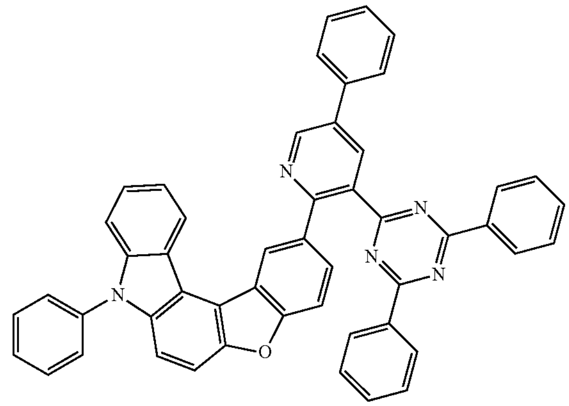
917
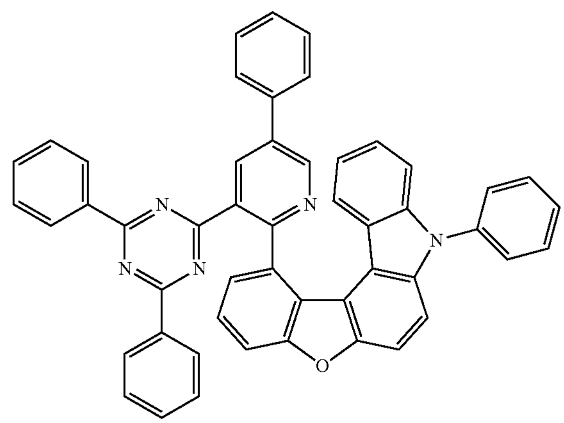
918
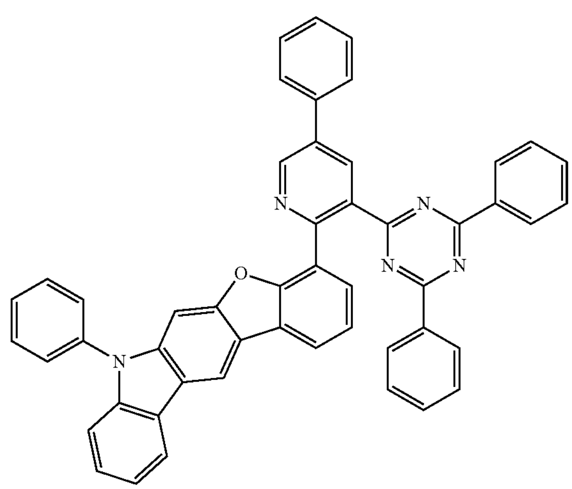

-continued
919
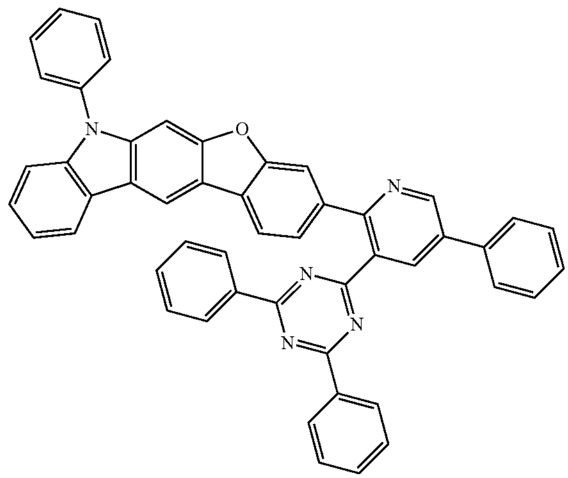
920
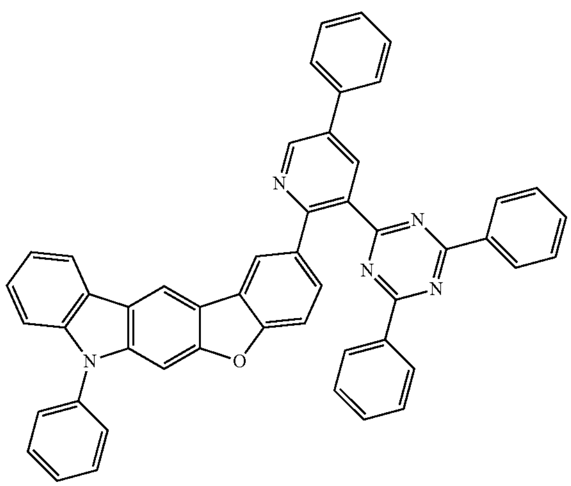
921
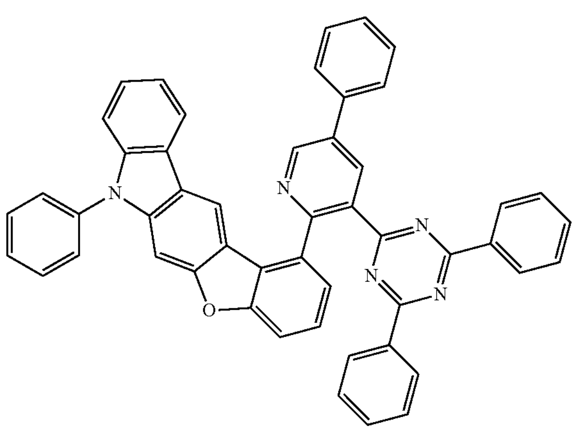
-continued
922
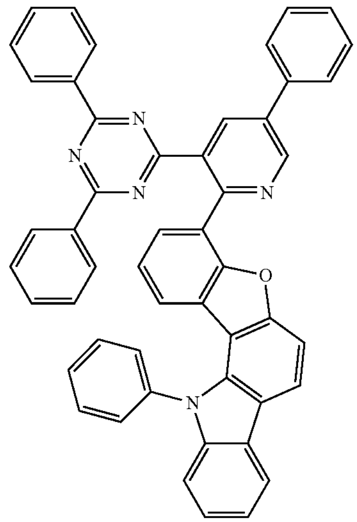
923
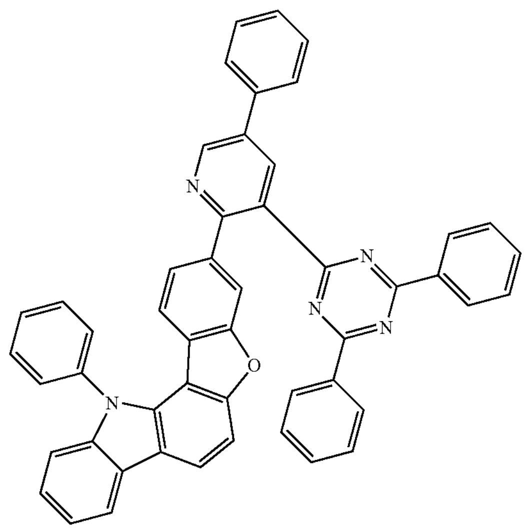
924
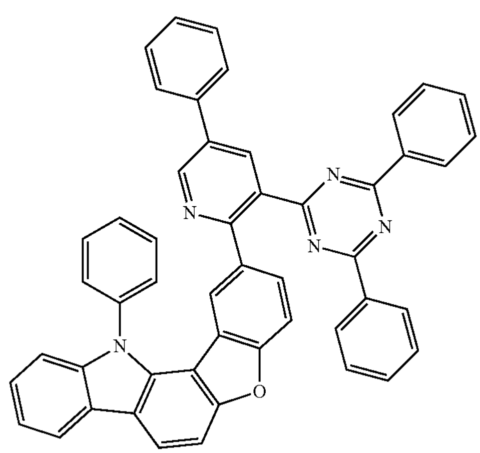

-continued
925
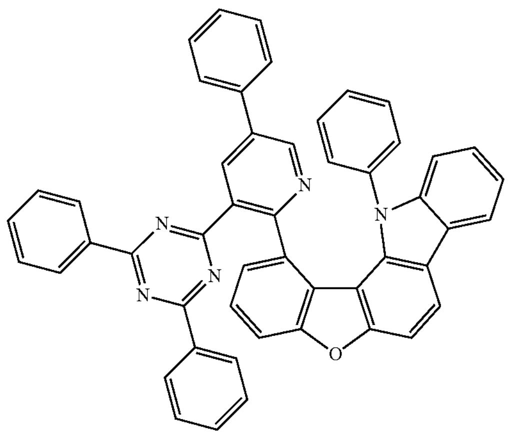
926
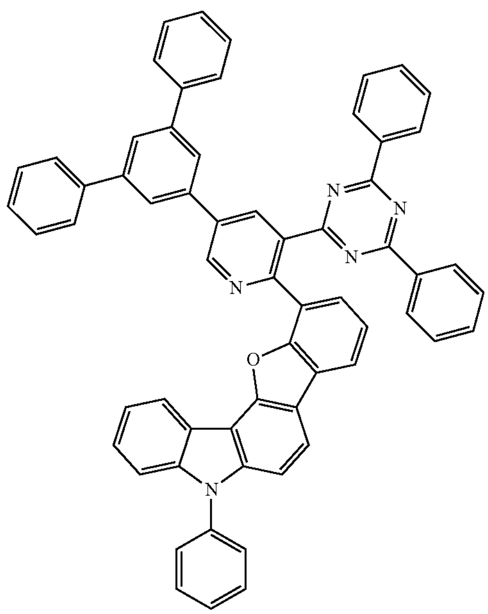
927
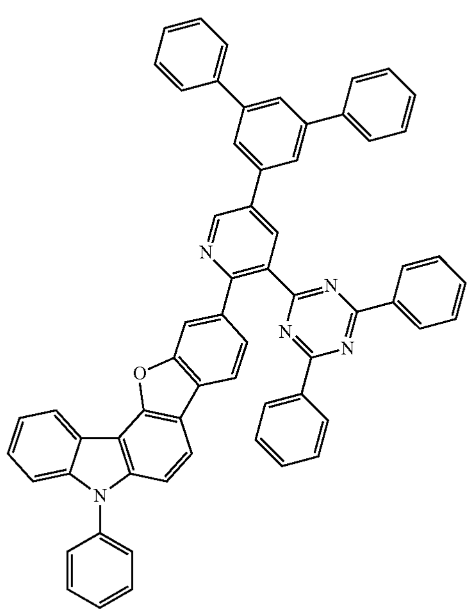
-continued
928
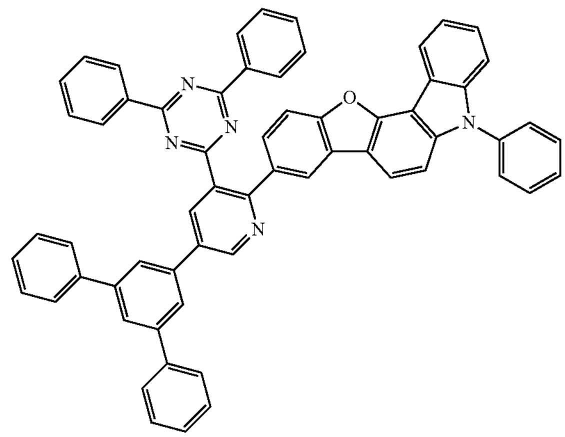
929
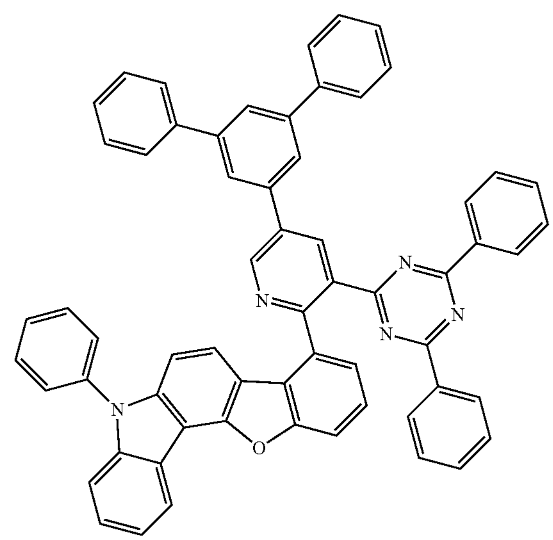
930
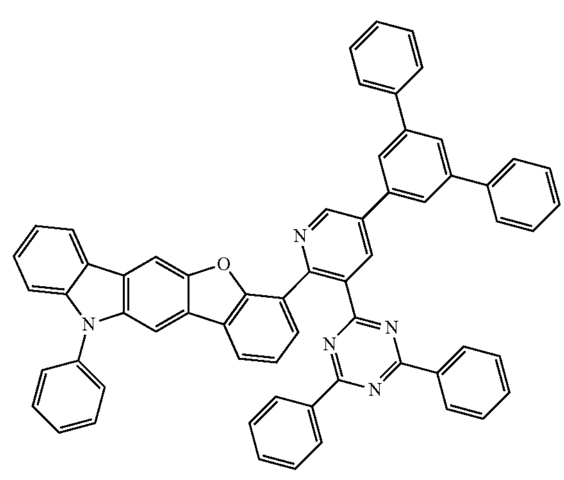

-continued
931
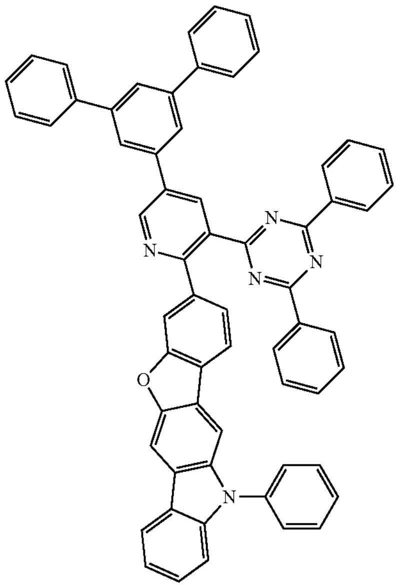
932
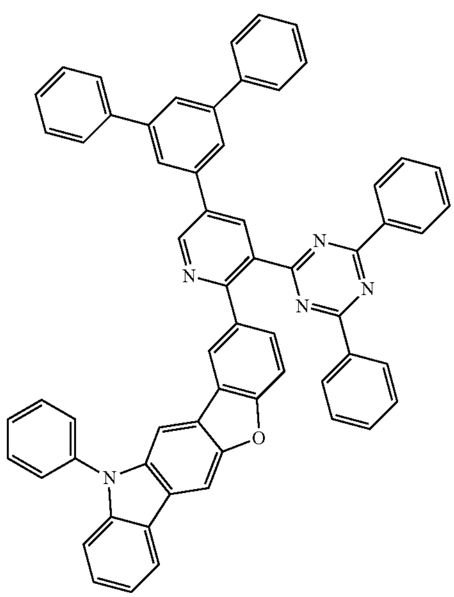
-continued
933
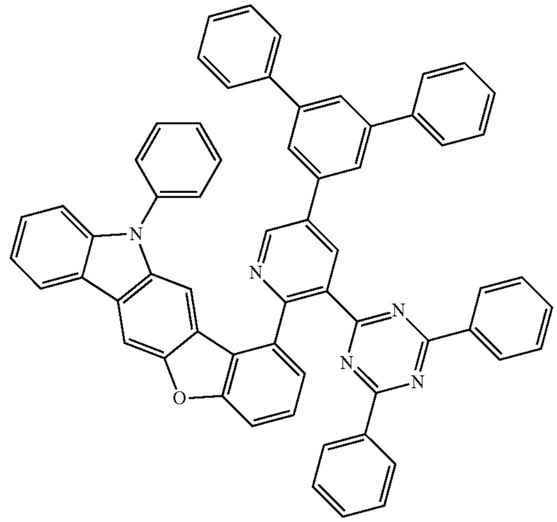
934
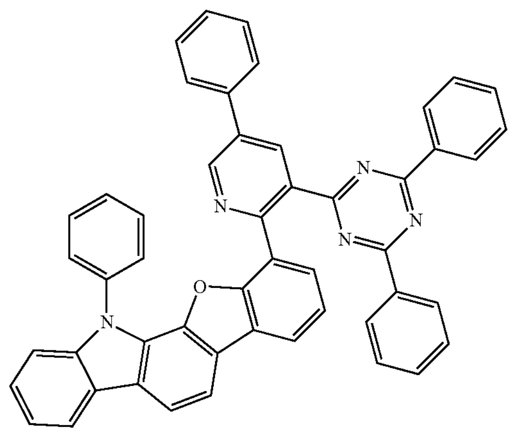
935
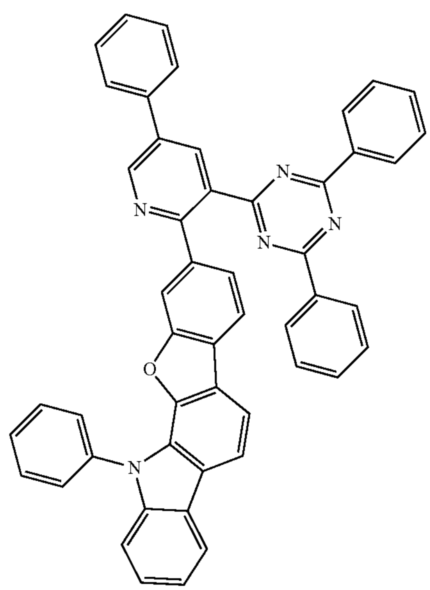

-continued
936
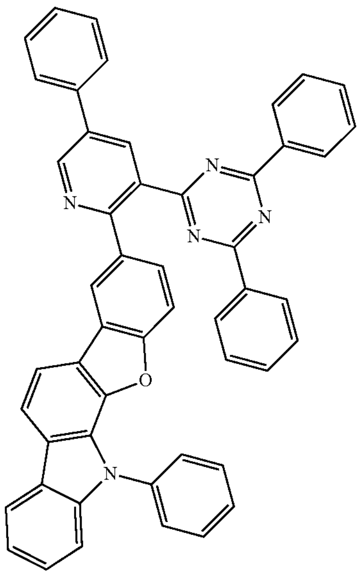
937
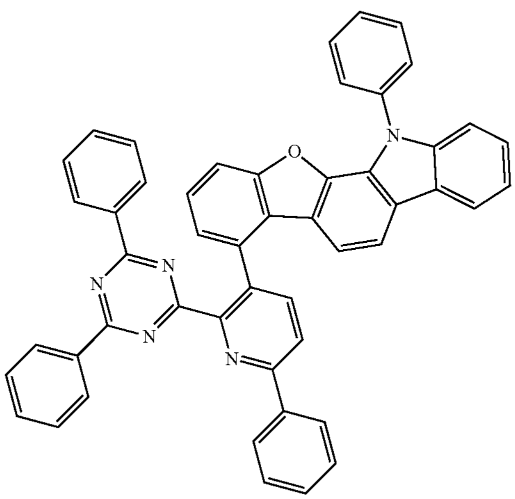
938
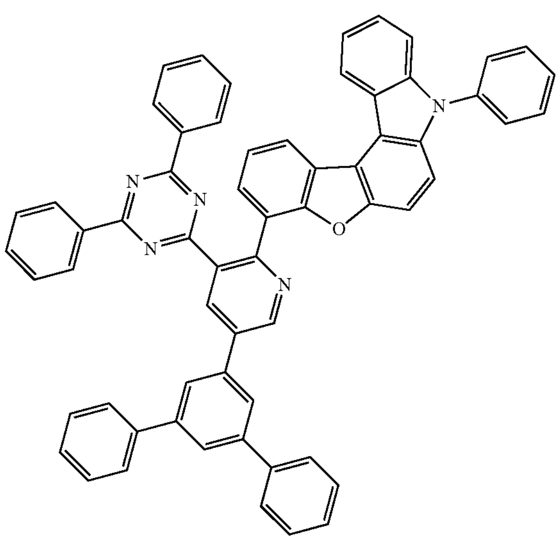
-continued
939
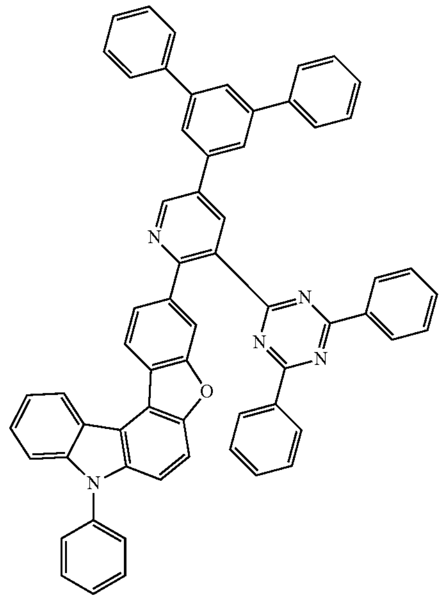
940
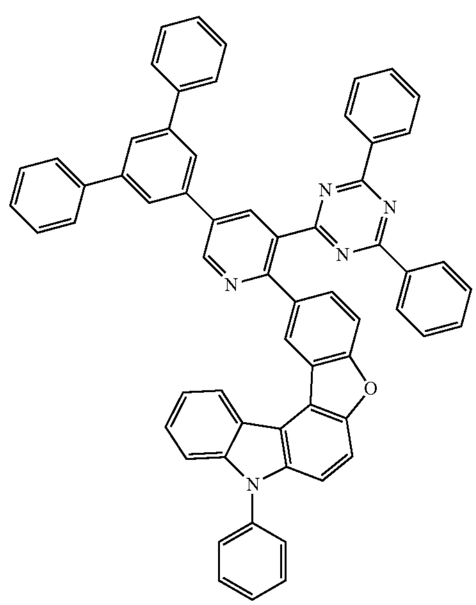

941
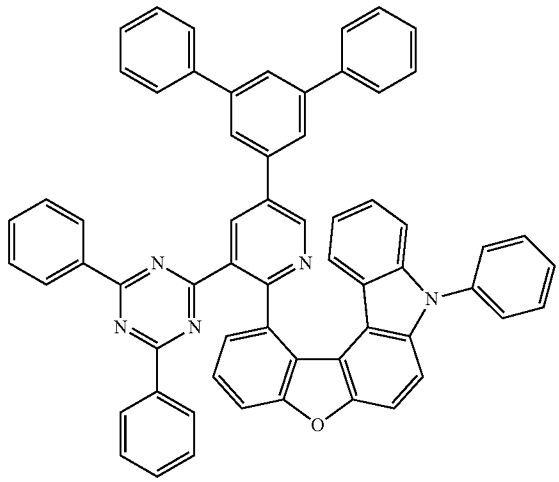
942
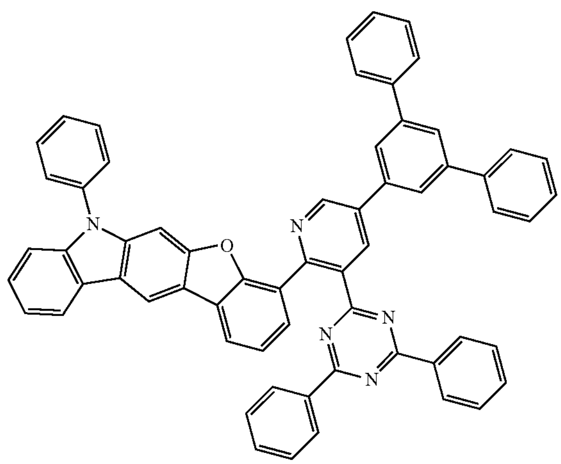
943
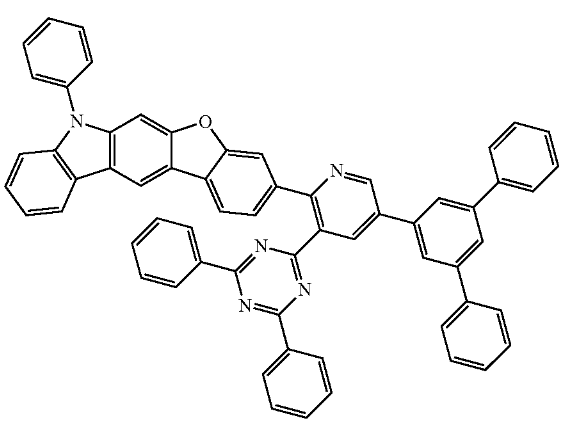
944
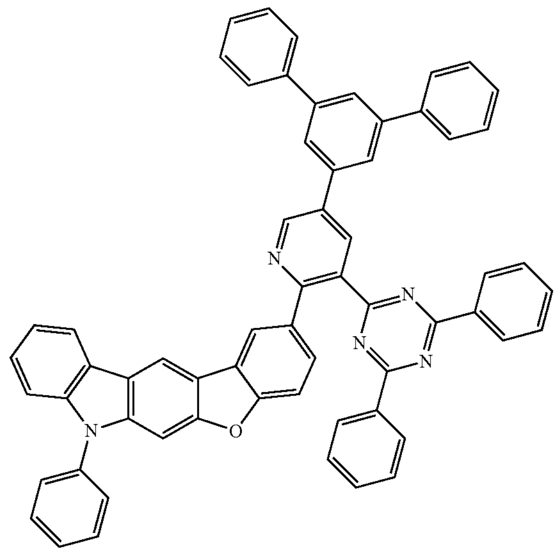
945
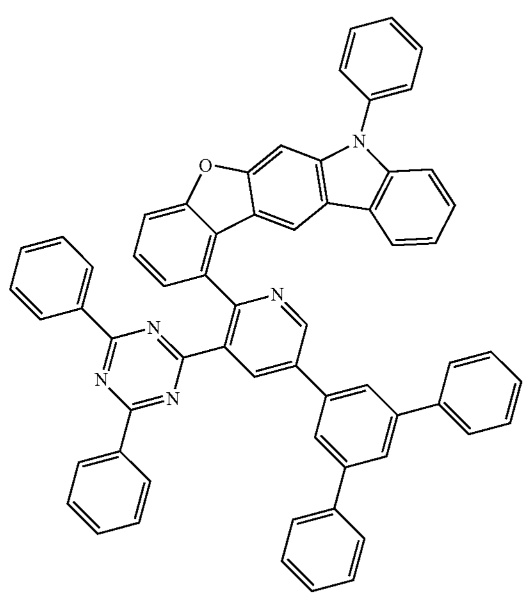

-continued
946
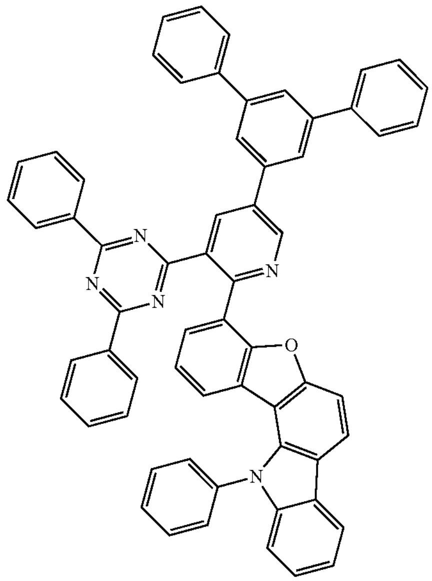
947
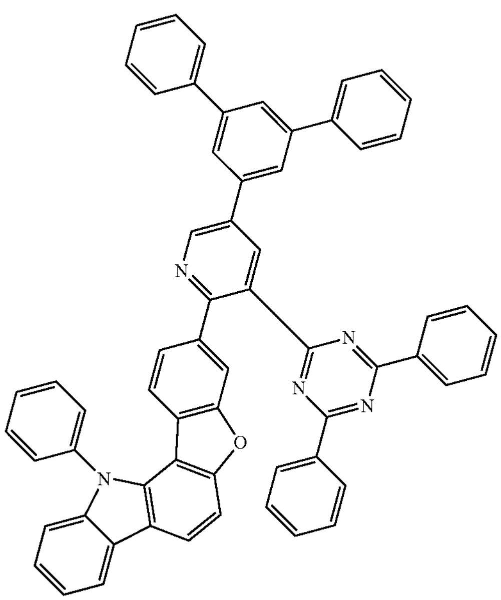
-continued
948
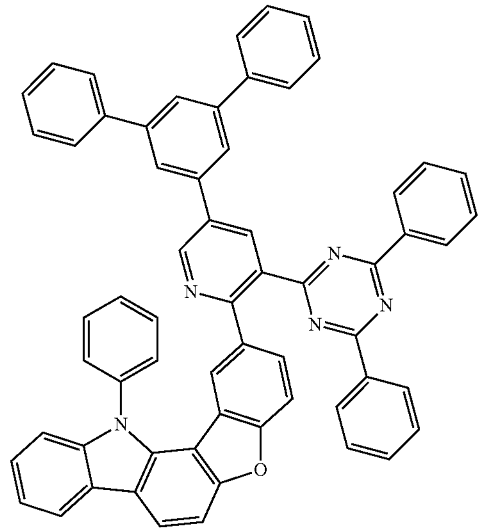
949
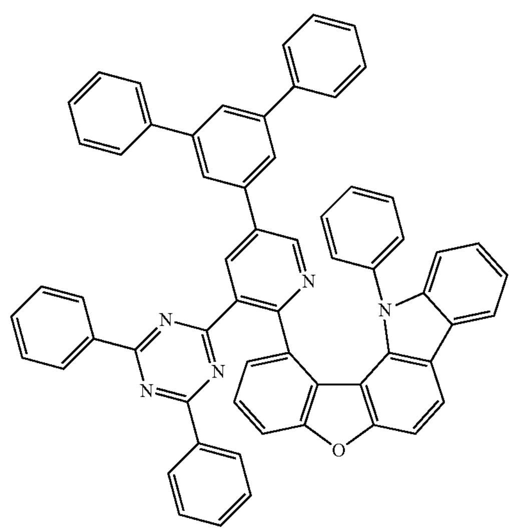

-continued
950
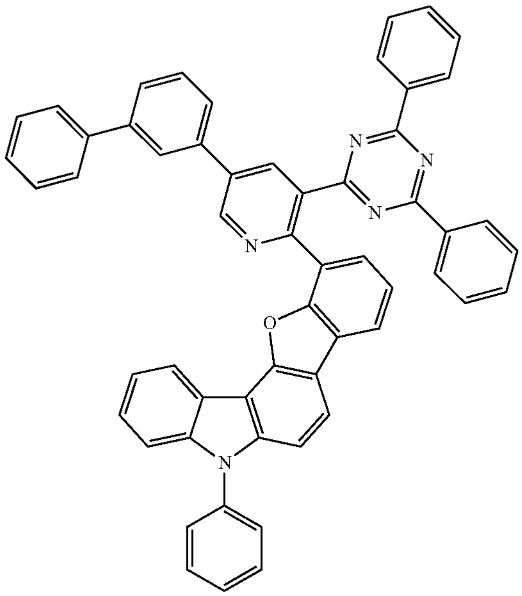
951
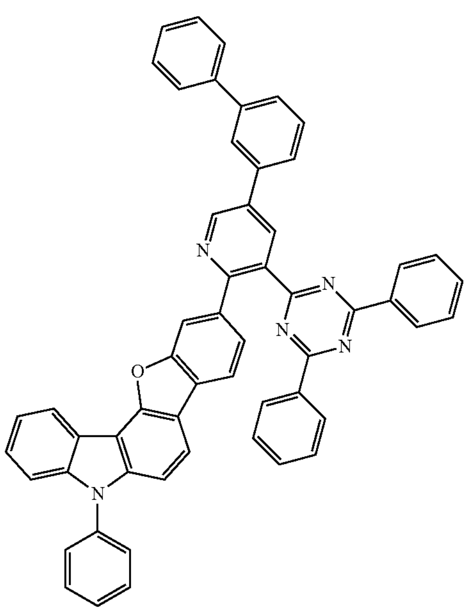
-continued
952
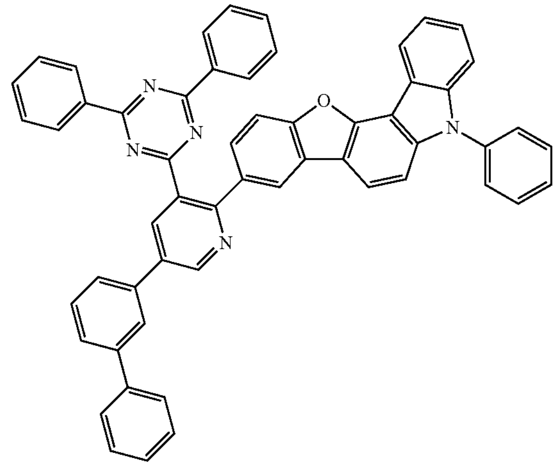
953
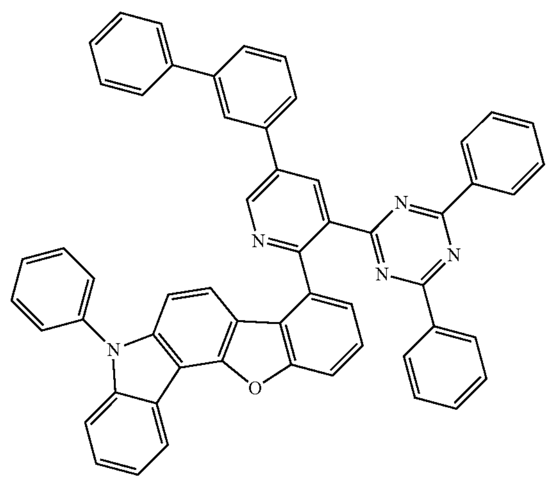
954
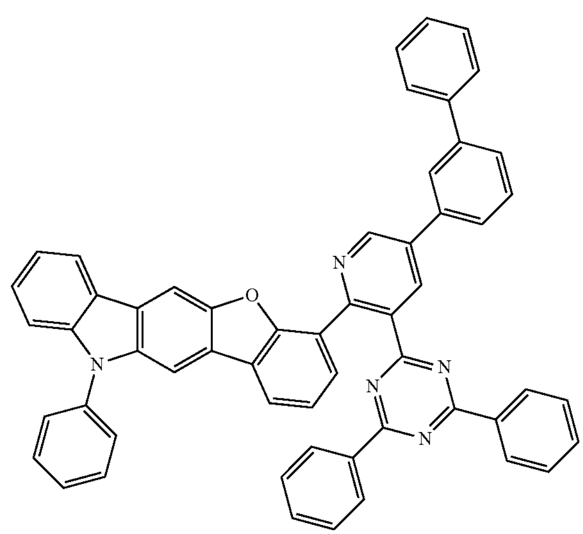

-continued
955
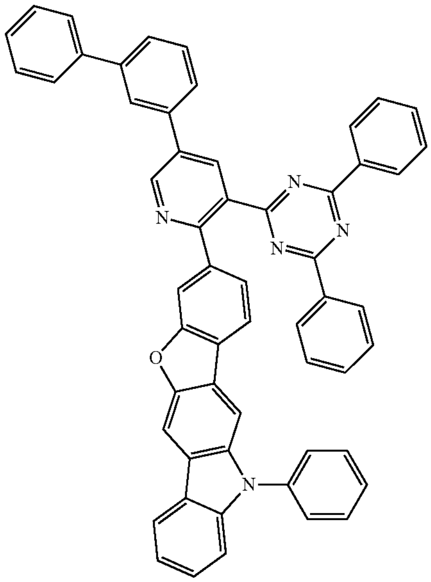
956
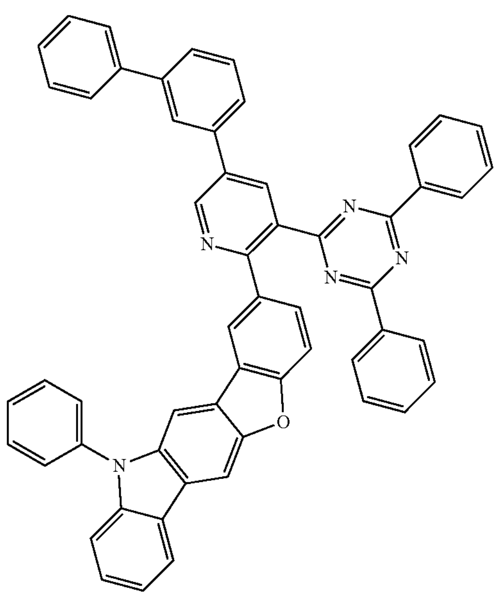
-continued
957
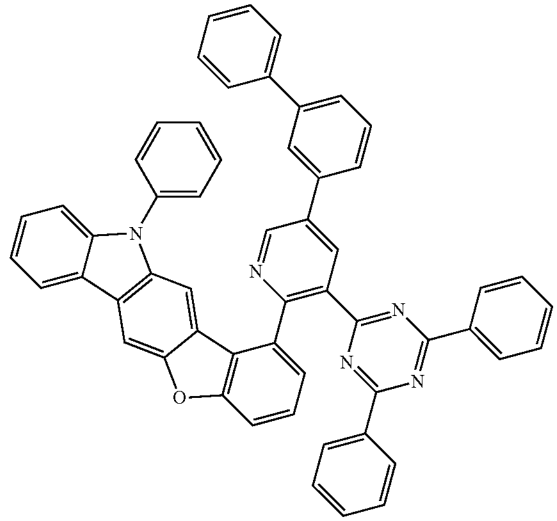
958
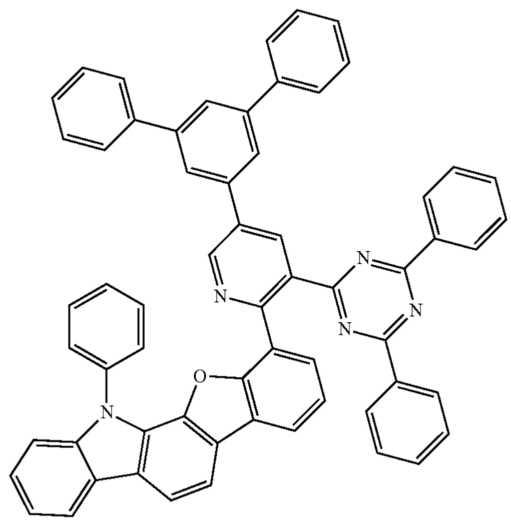
959
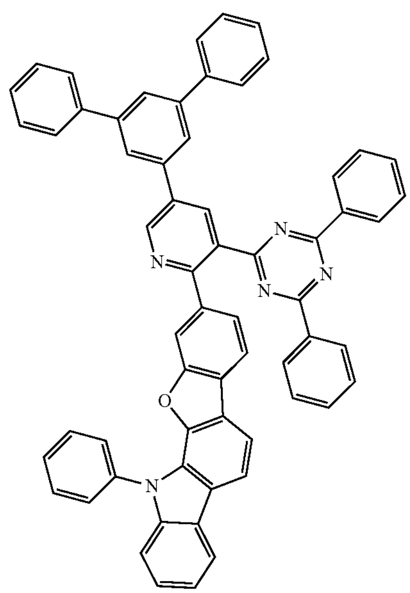

-continued
960
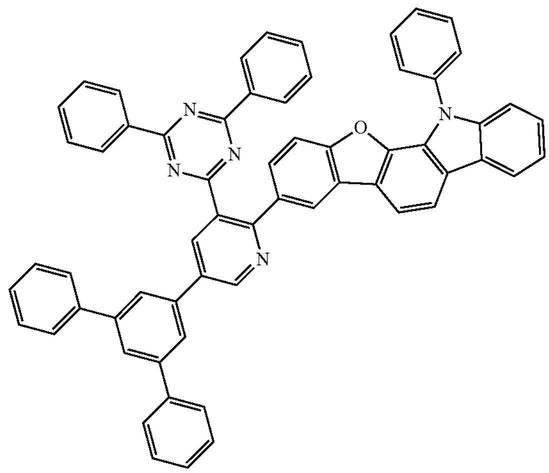
961
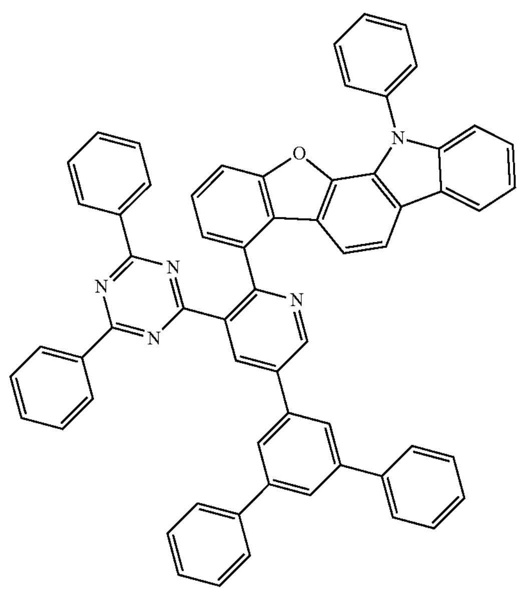
962
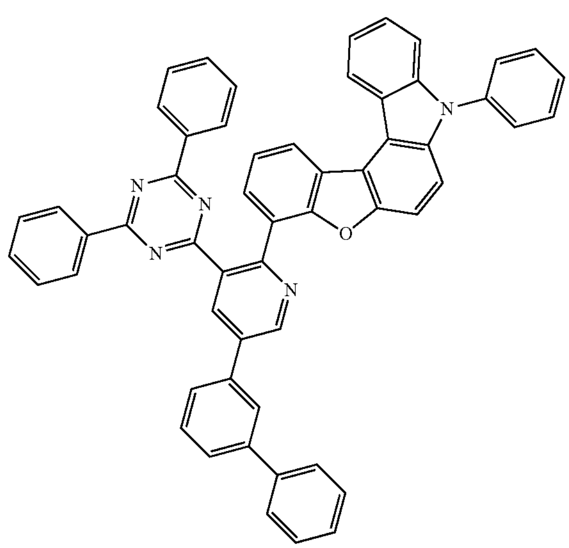
-continued
963
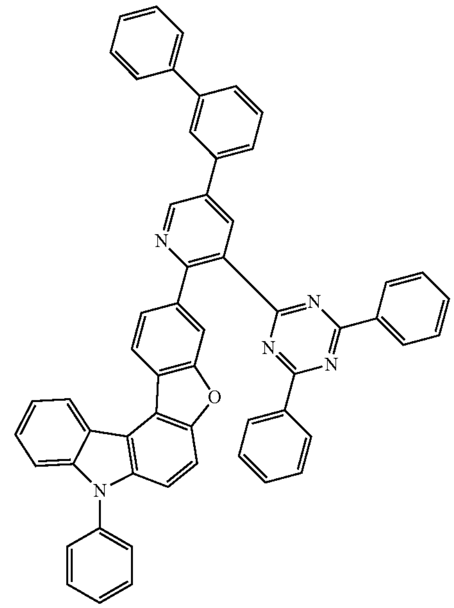
964
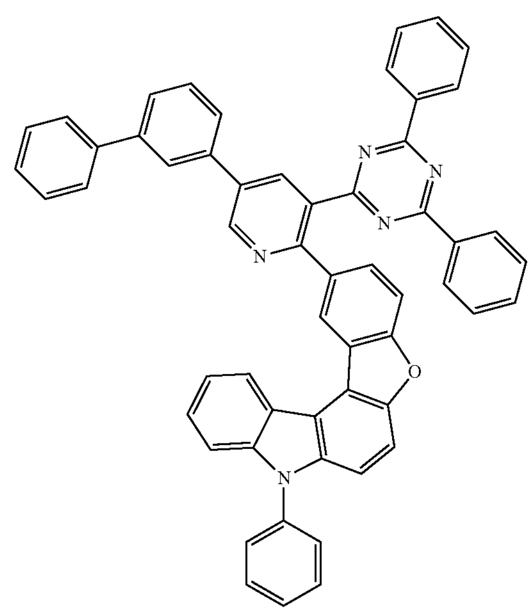

965
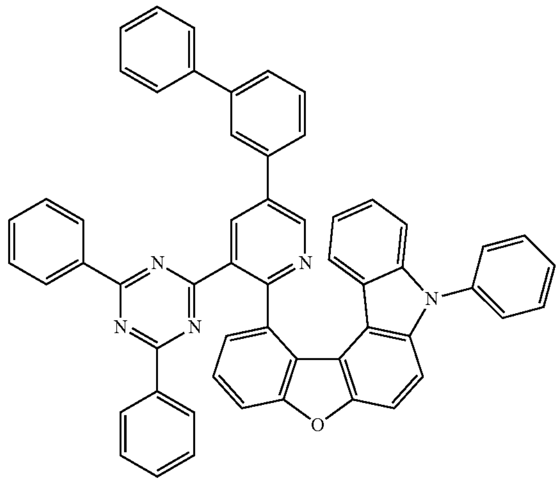
966
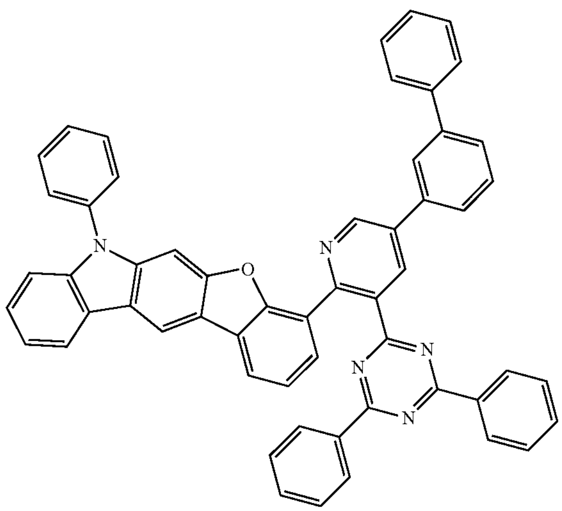
967
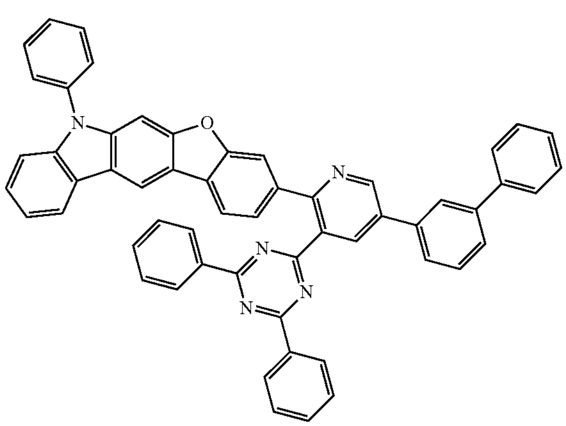
968
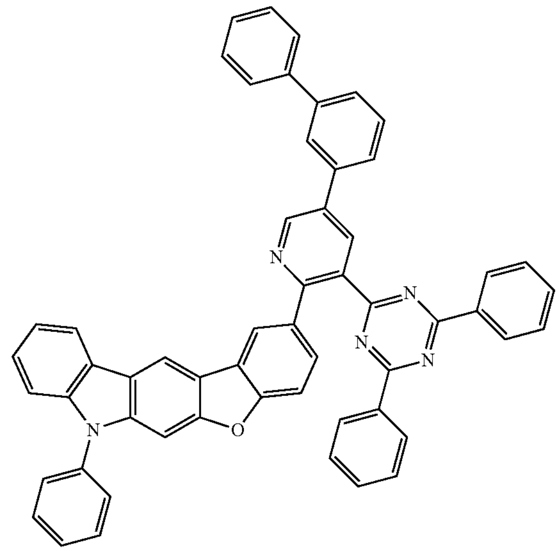
969
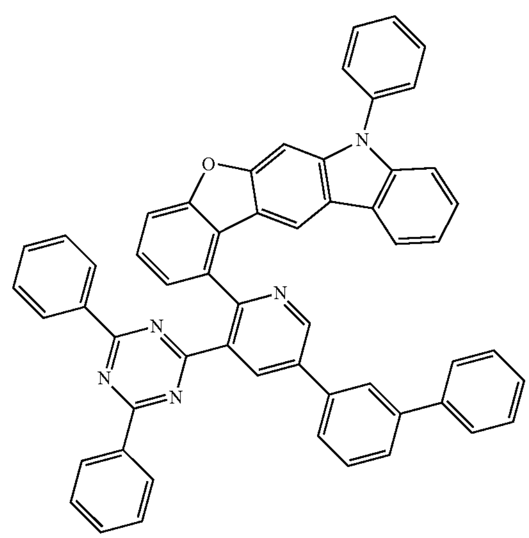

-continued
970
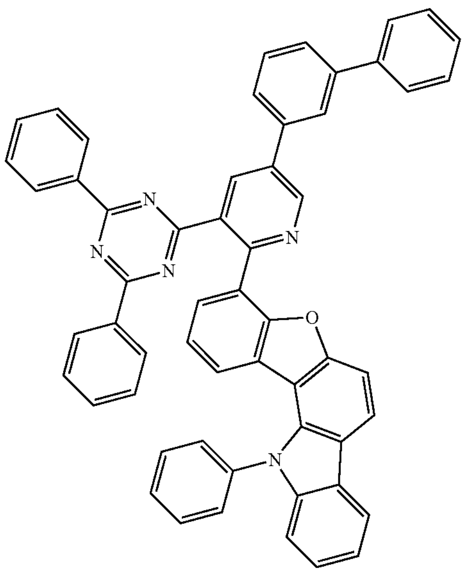
971
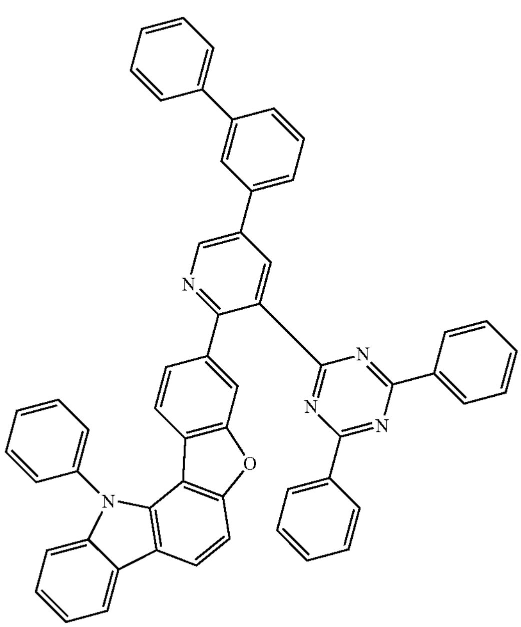
-continued
972
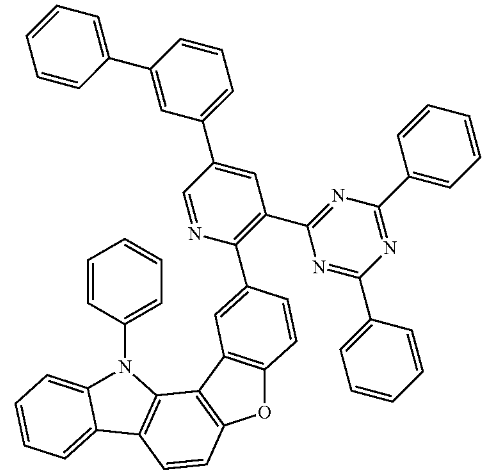
973
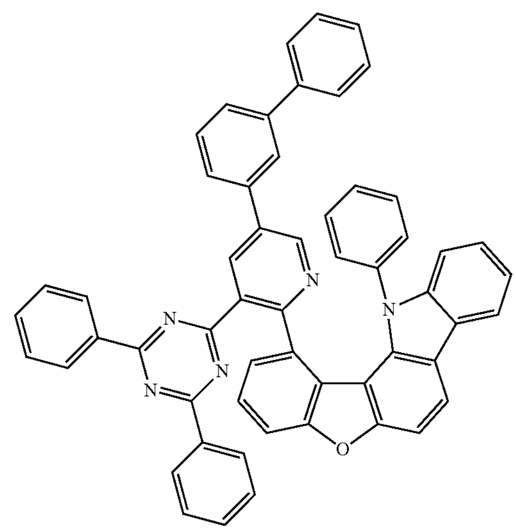
974
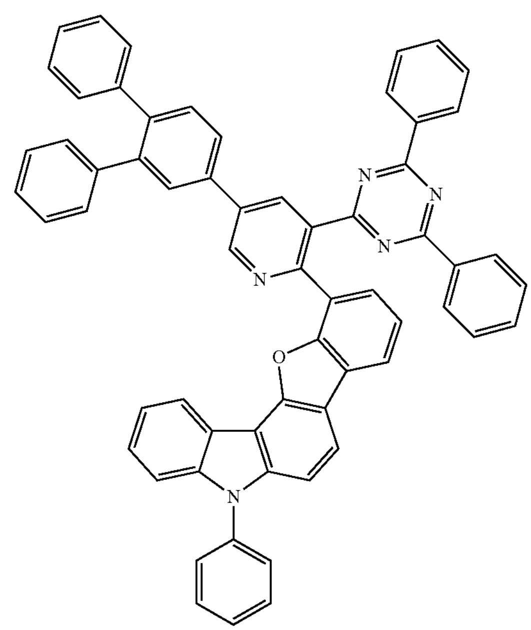

-continued
975
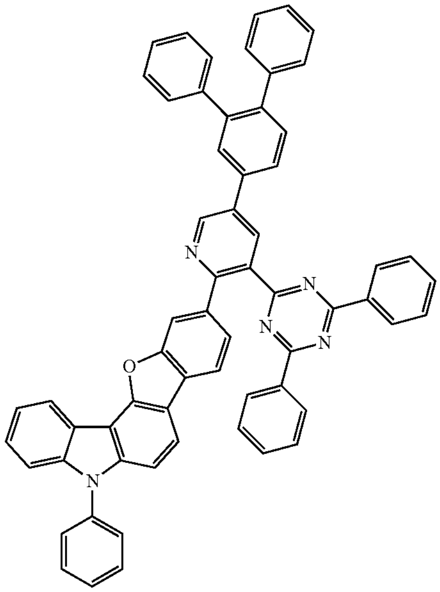
976
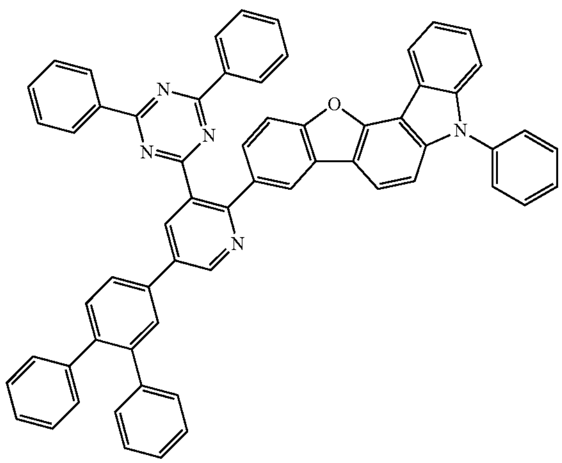
977
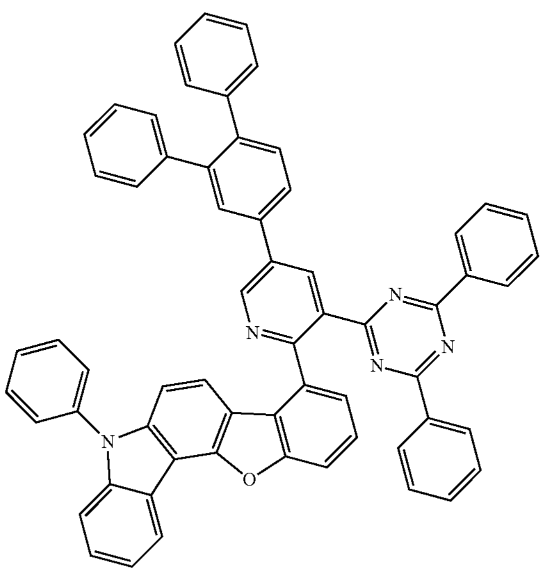
-continued
978
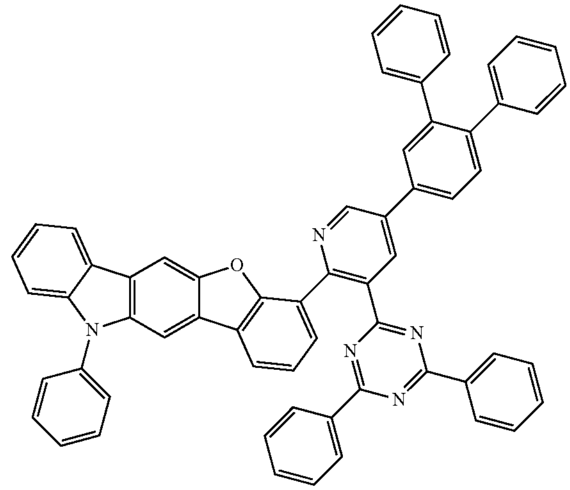
979
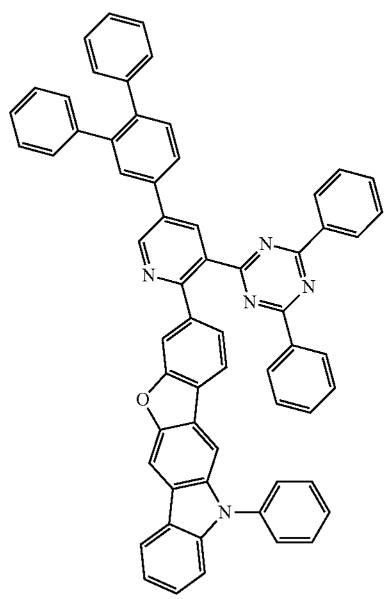

-continued
980
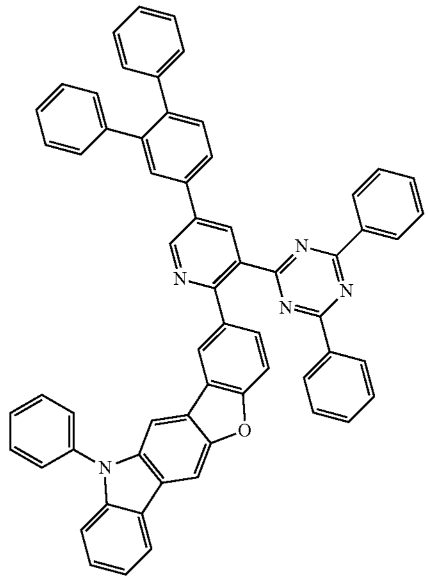
981
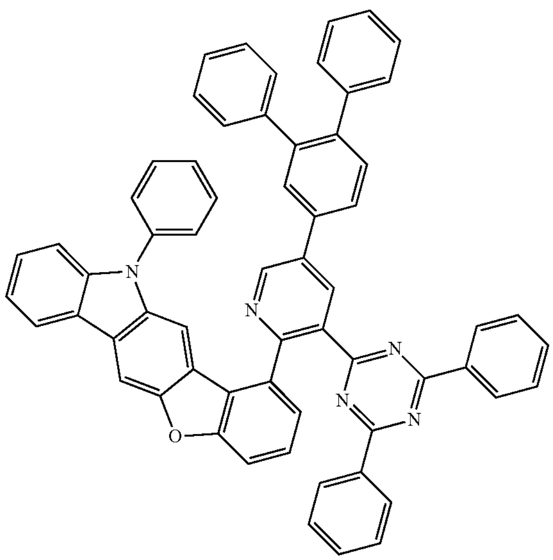
982
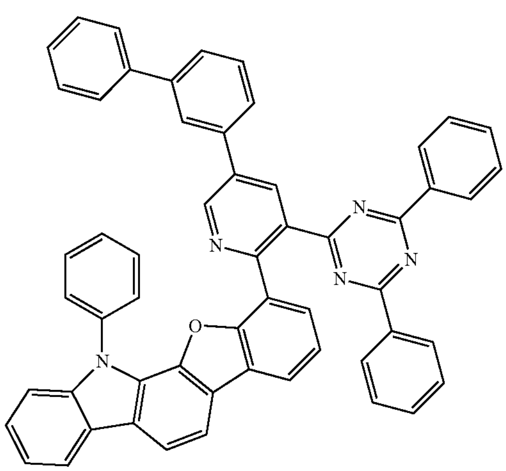
-continued
983
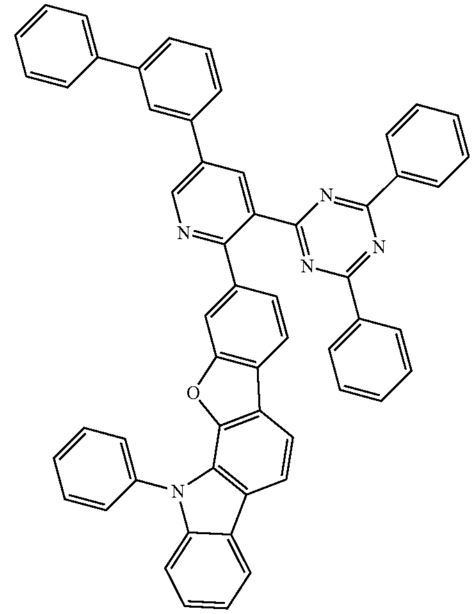
984
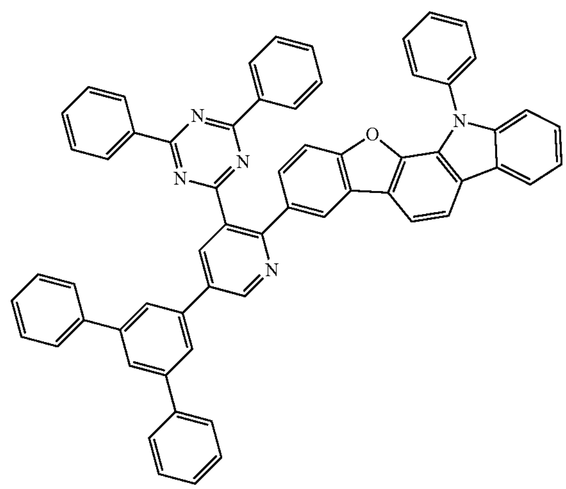
985
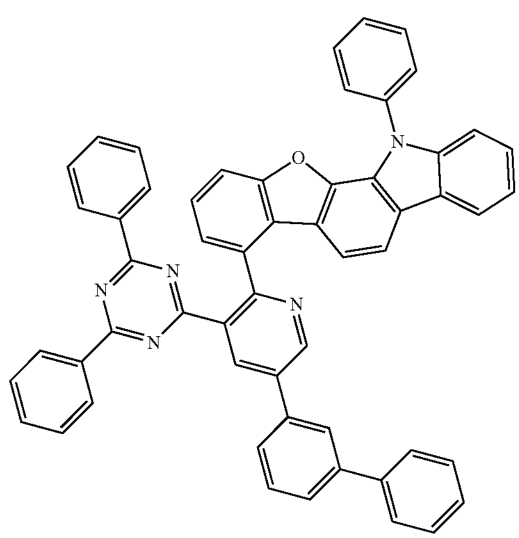

-continued
986
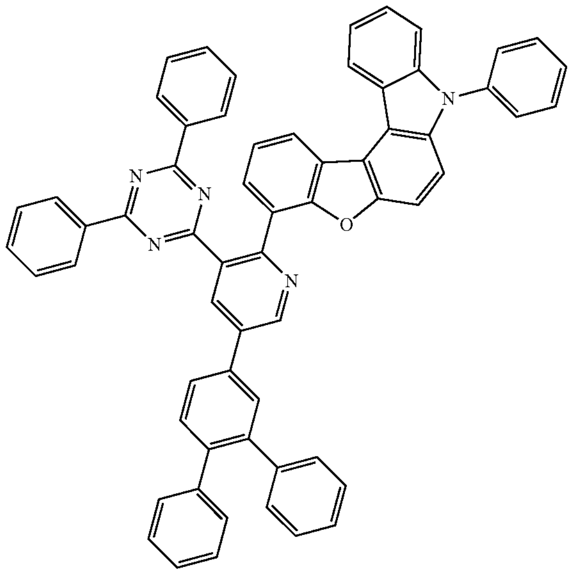
987
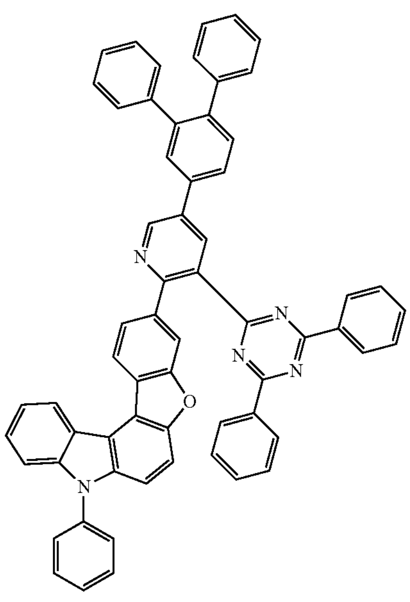
-continued
988
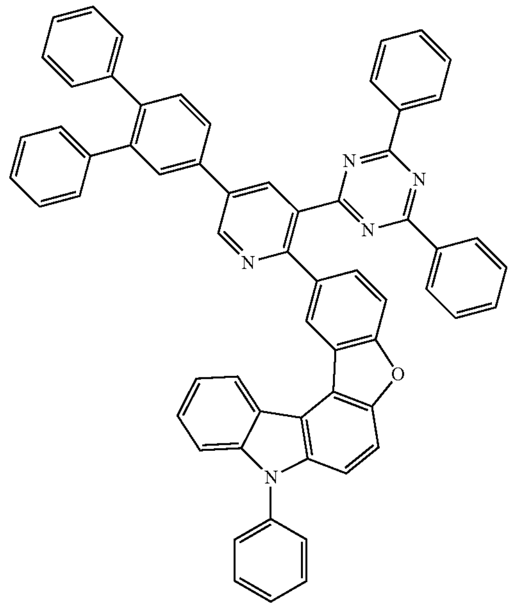
989
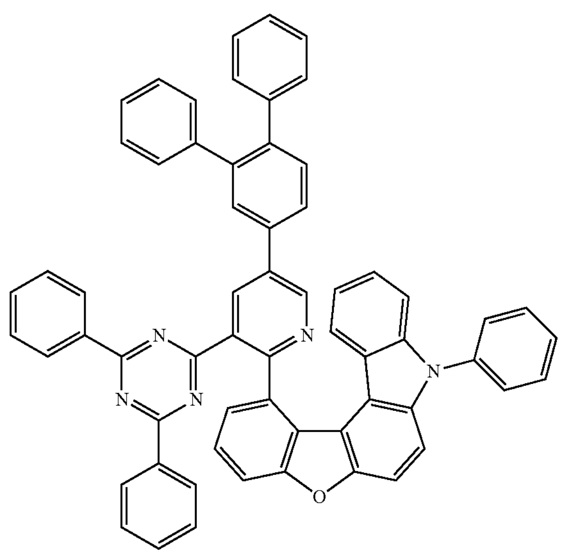

990
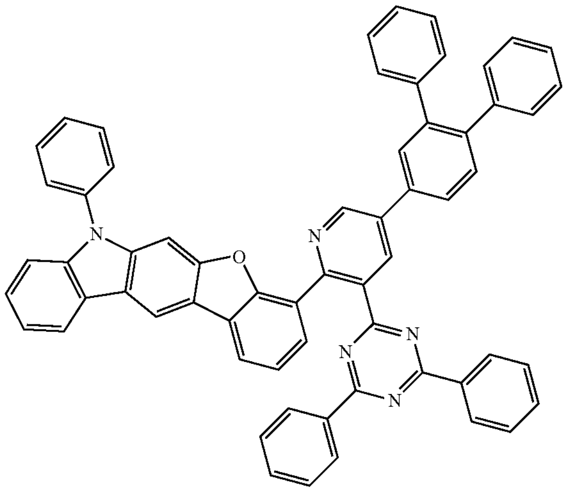
991
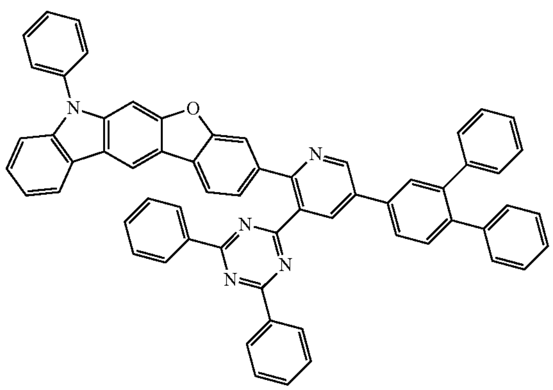
992
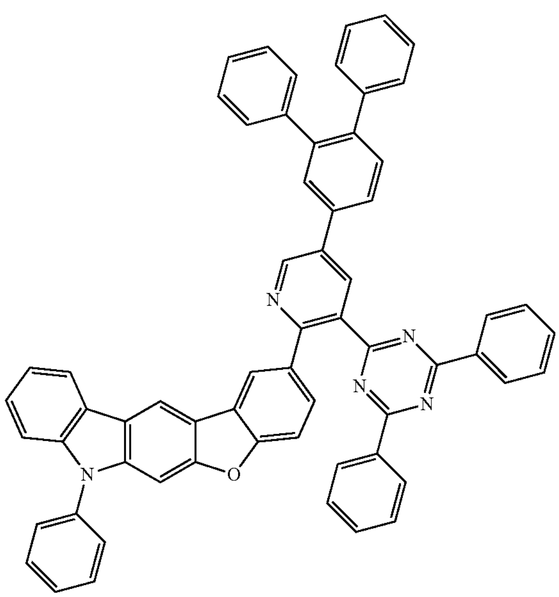
993
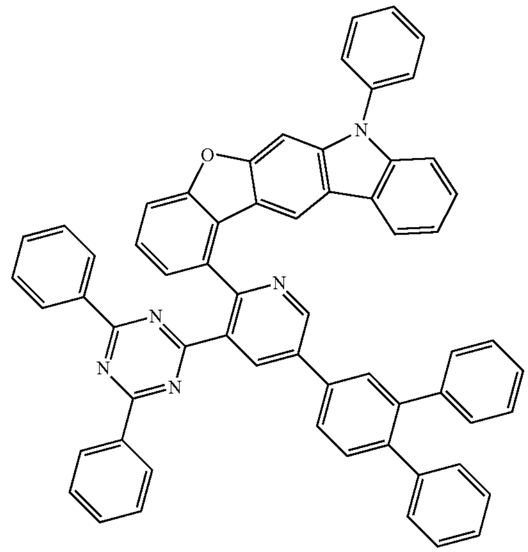
994
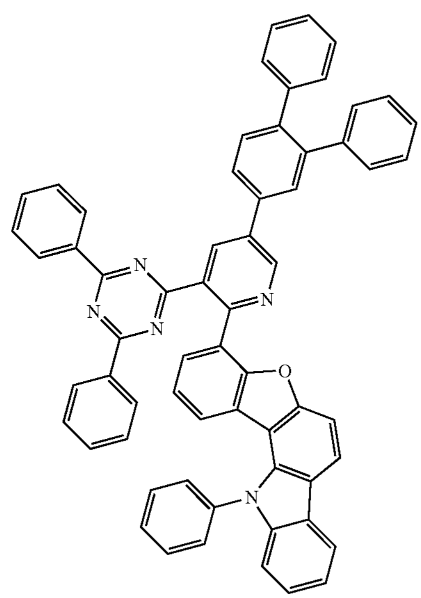

995
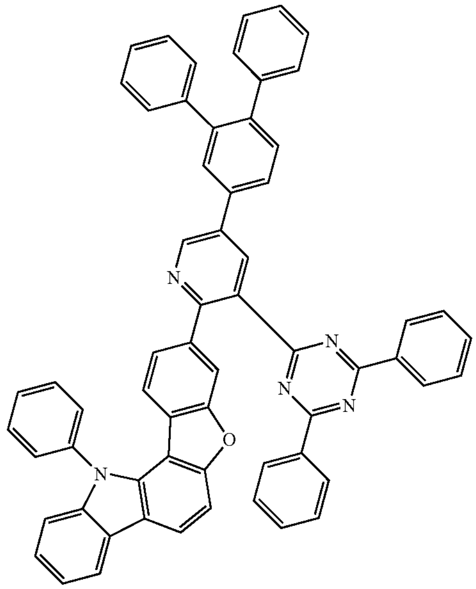
996
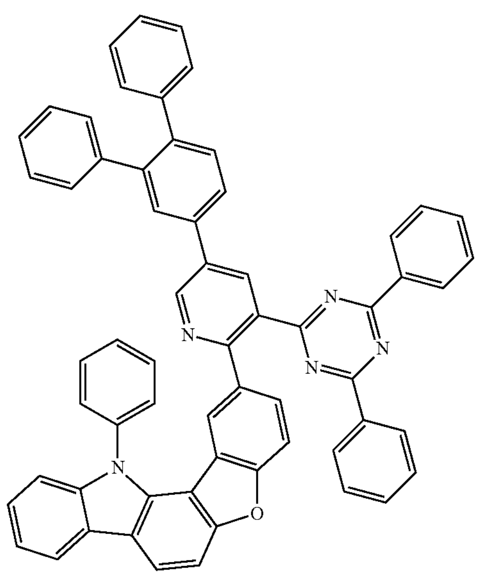
997
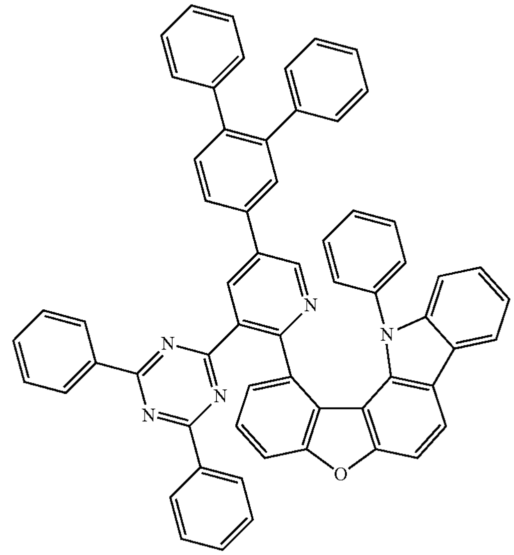
998
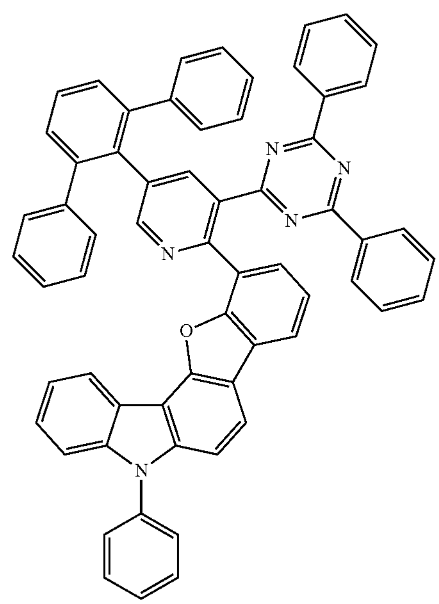

-continued
999
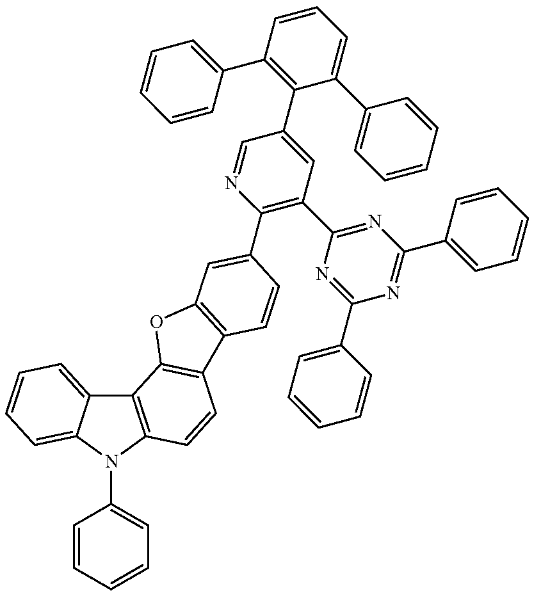
1000
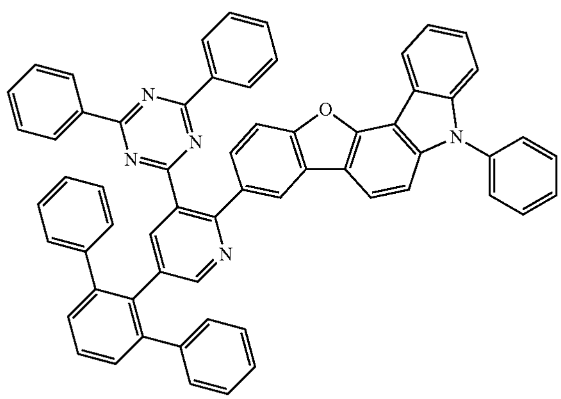
1001
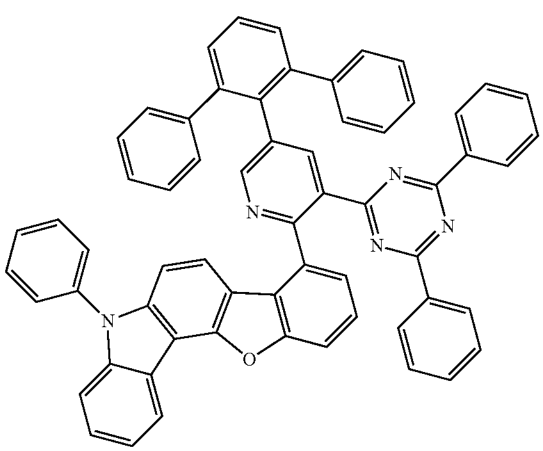
-continued
1002
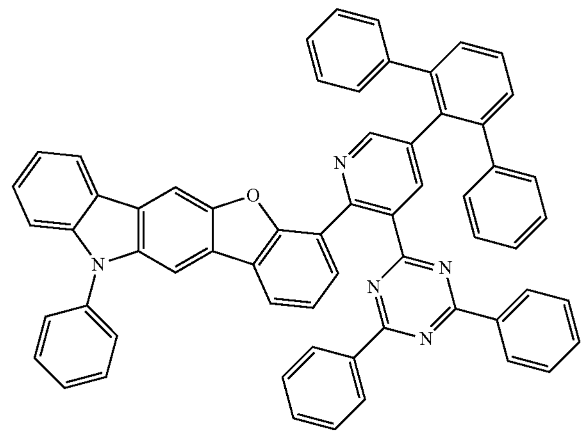
1003
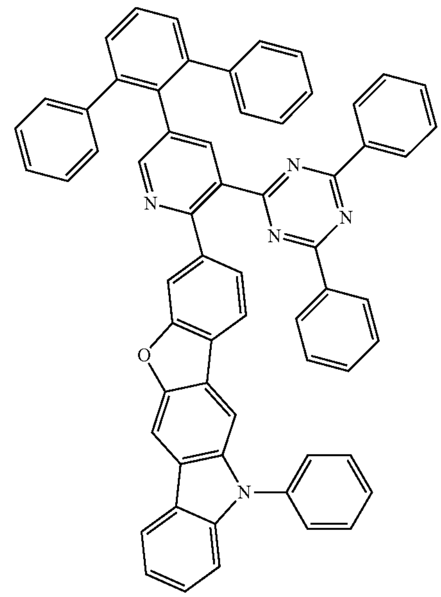
1004
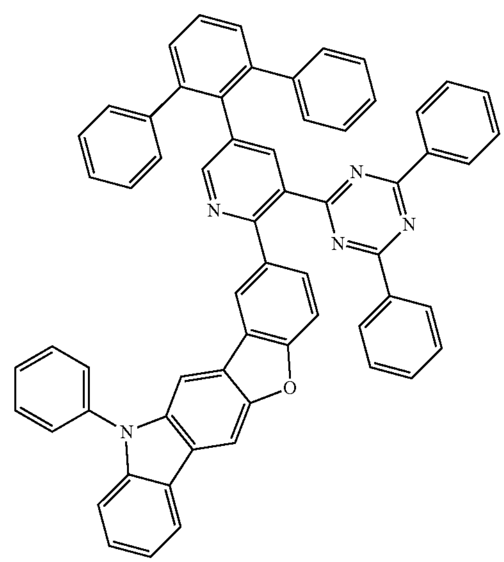

1005
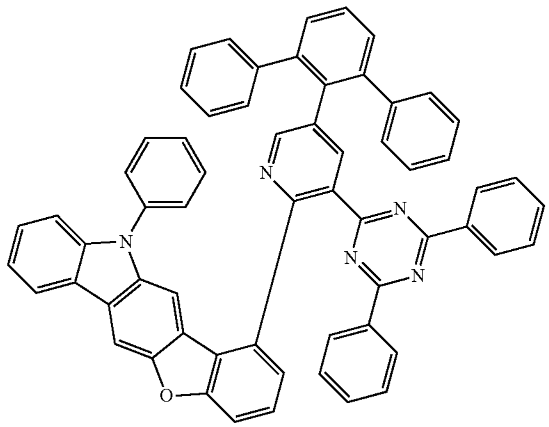
1006
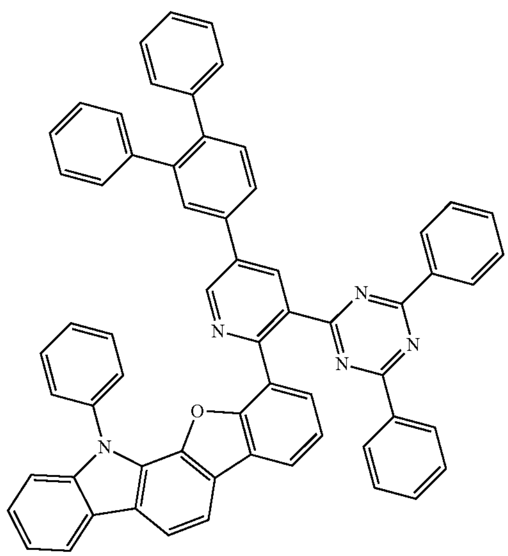
1007
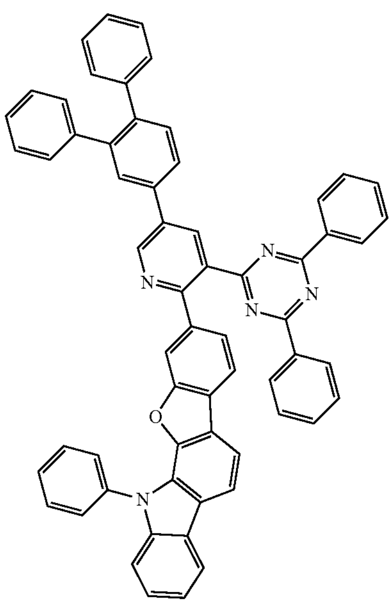
1008
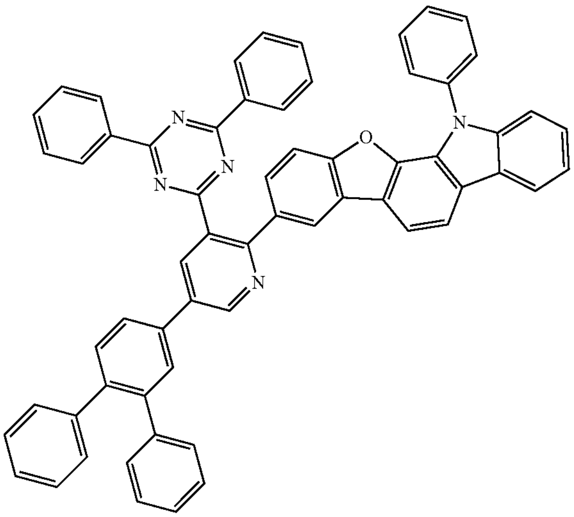
1009
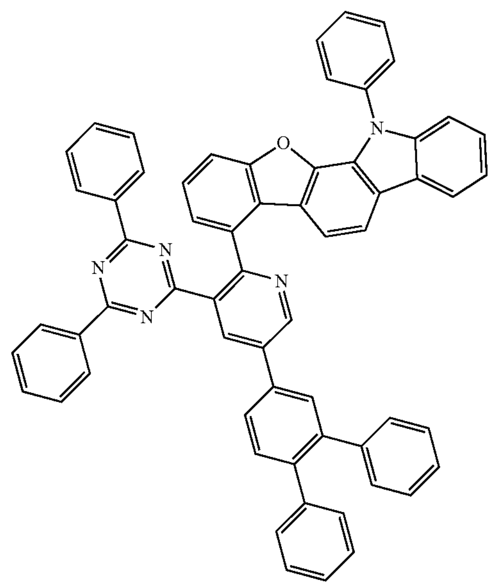
1010
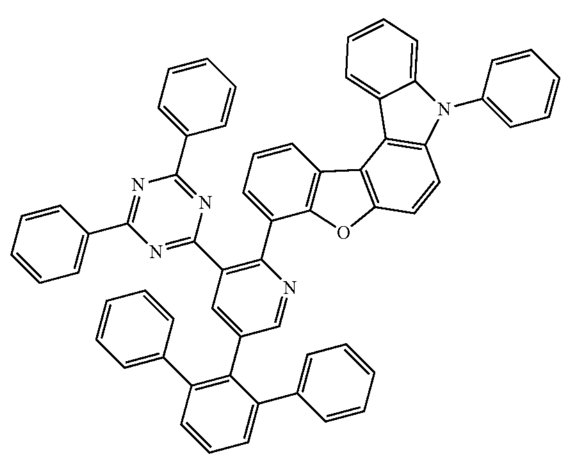

-continued
1011
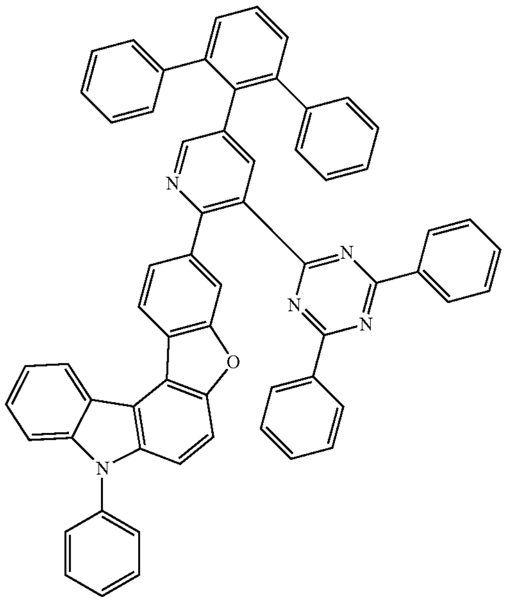
1012
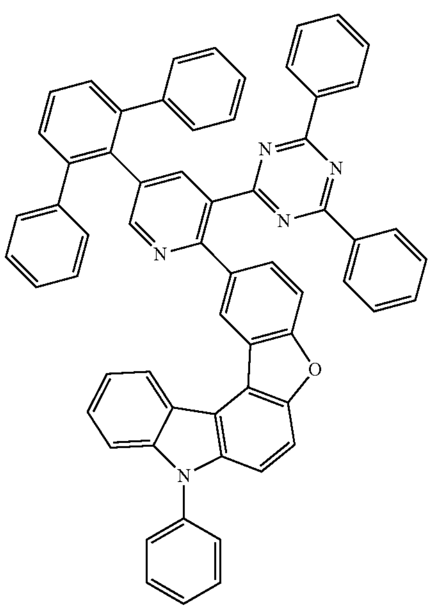
-continued
1013
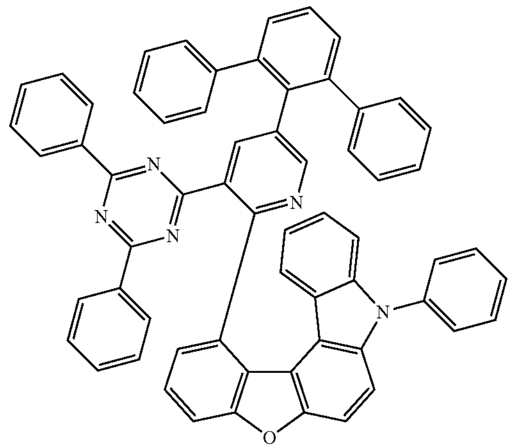
1014
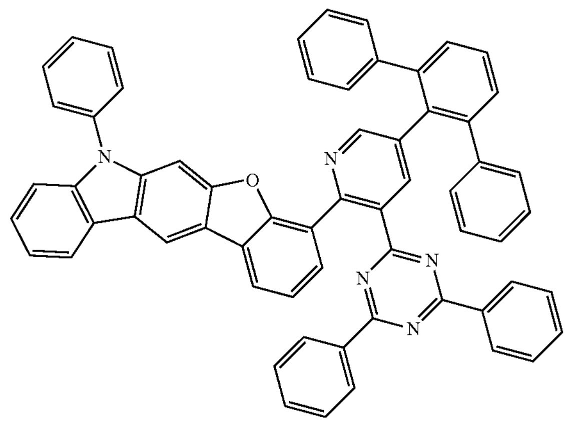
1015
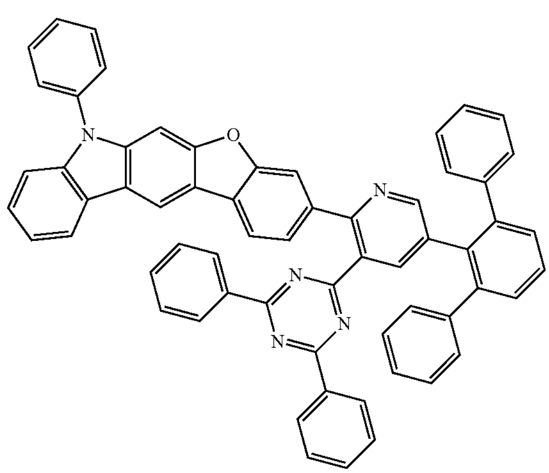

-continued
1016
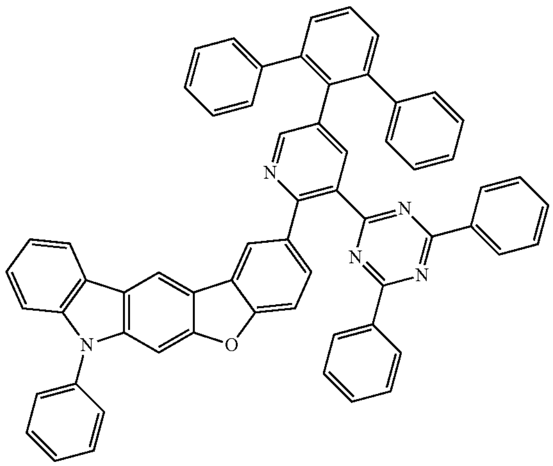
1017
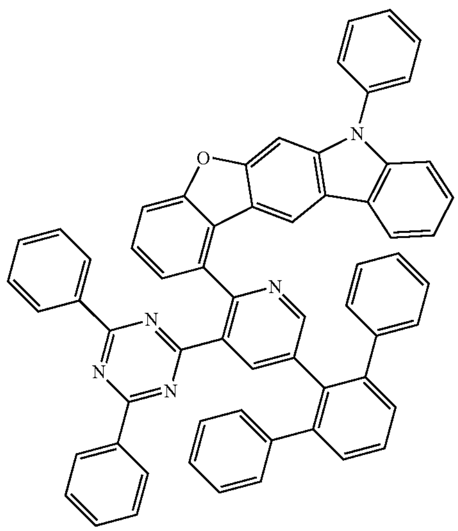
1018
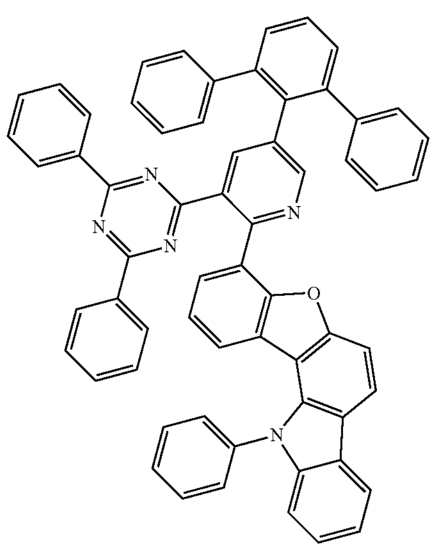
-continued
1019
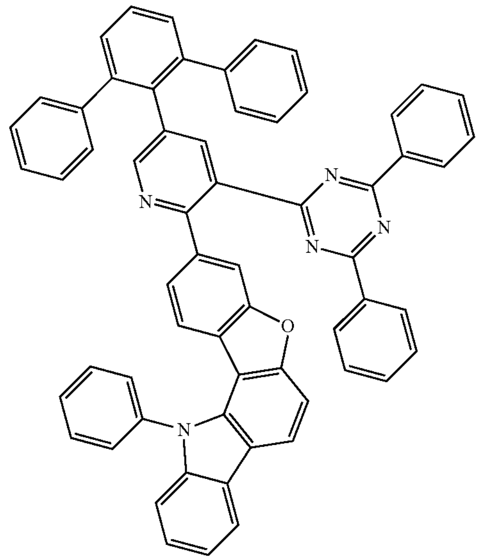
1020
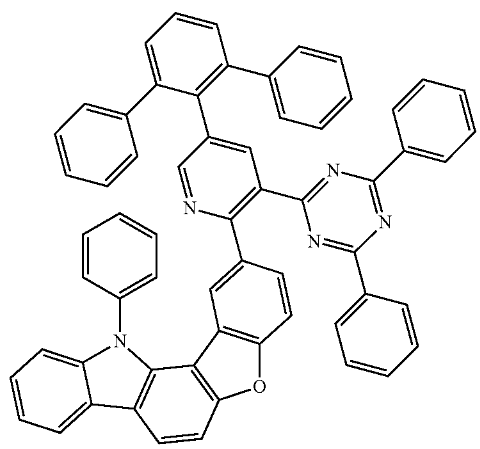
1021
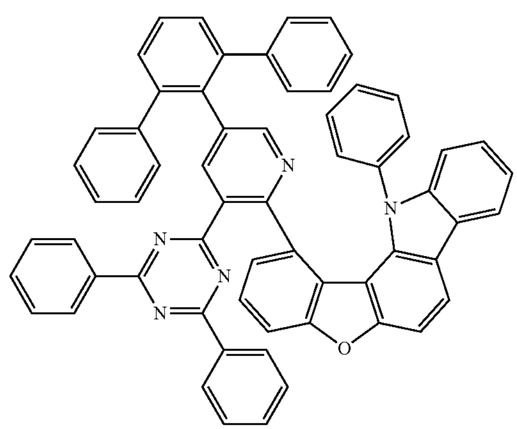

1022
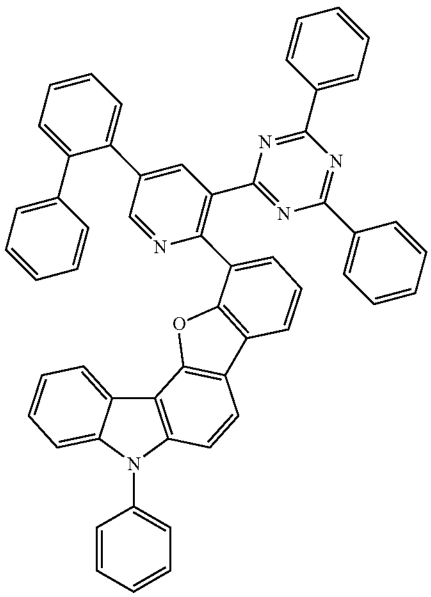
1023
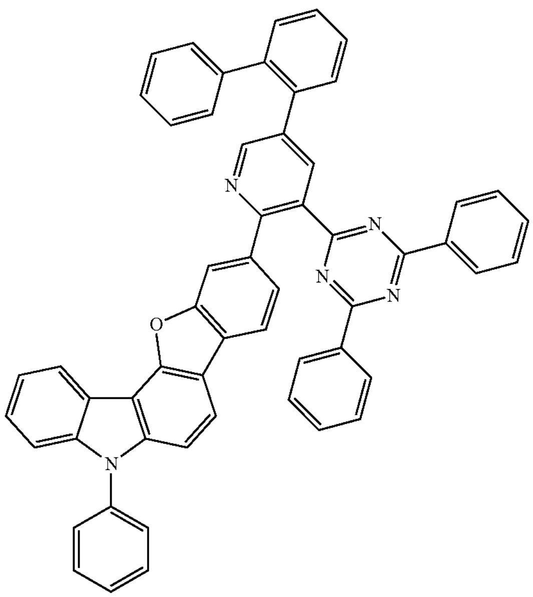
1024
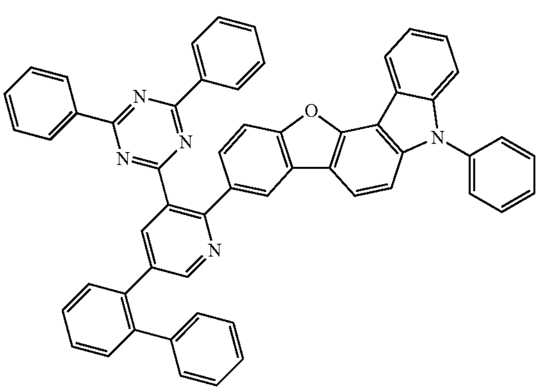
1025
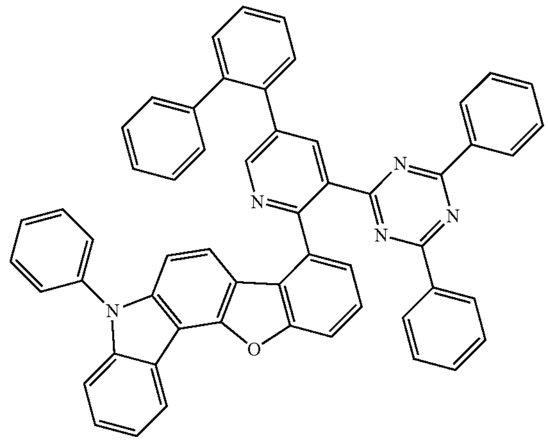
1026
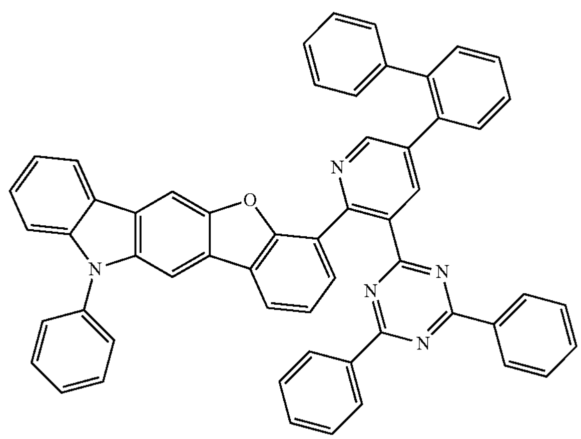
1027
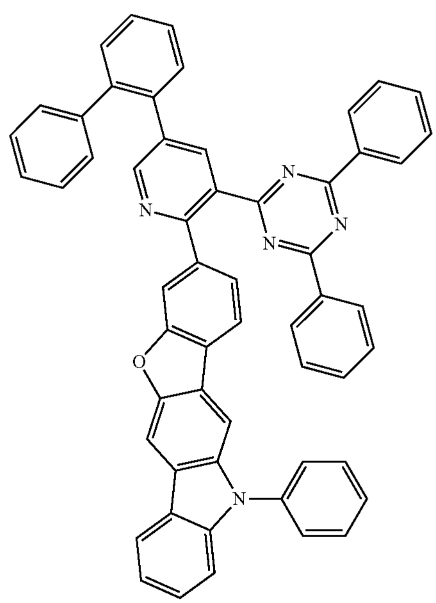

-continued
1028
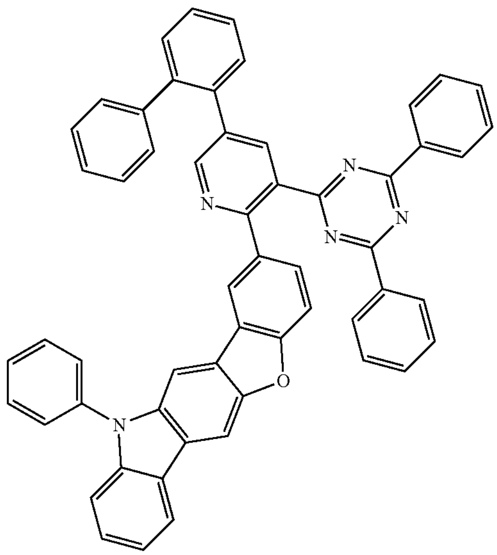
1029
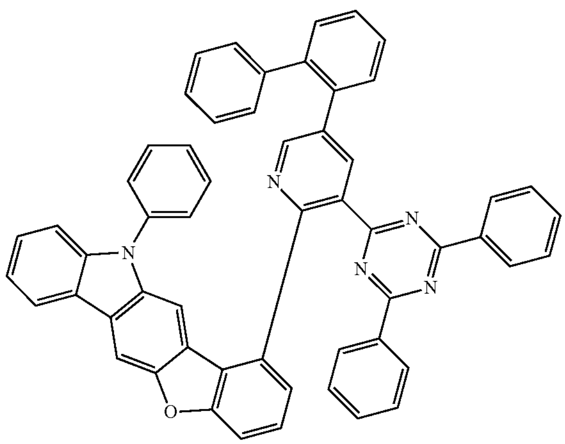
1030
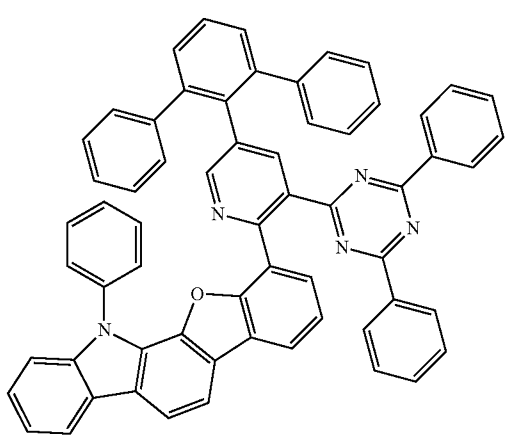
-continued
1031
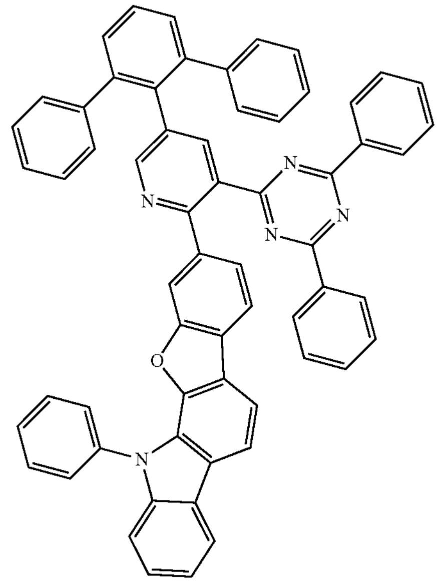
1032
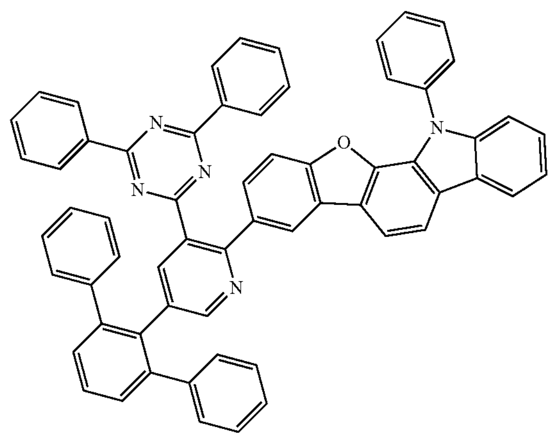
1033
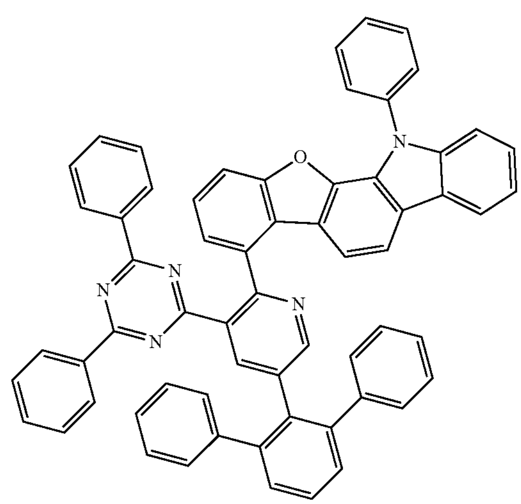

-continued
1034
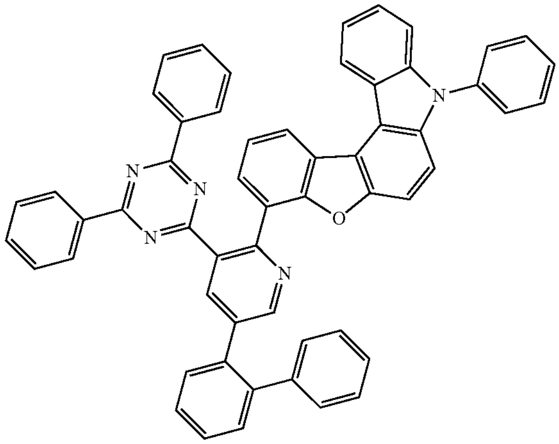
1035
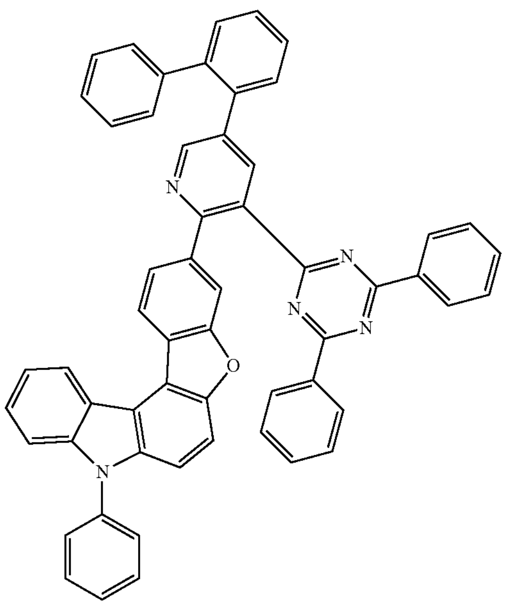
-continued
1036
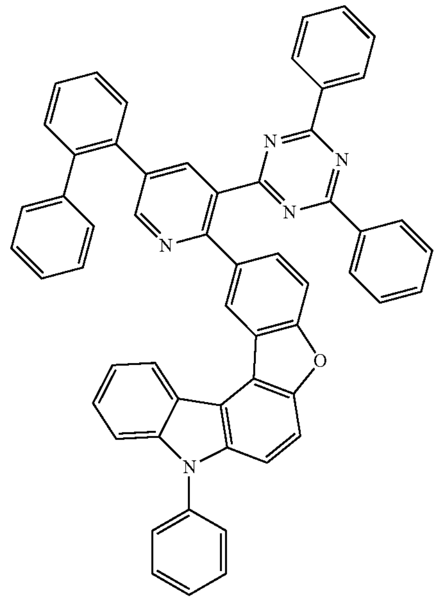
1037
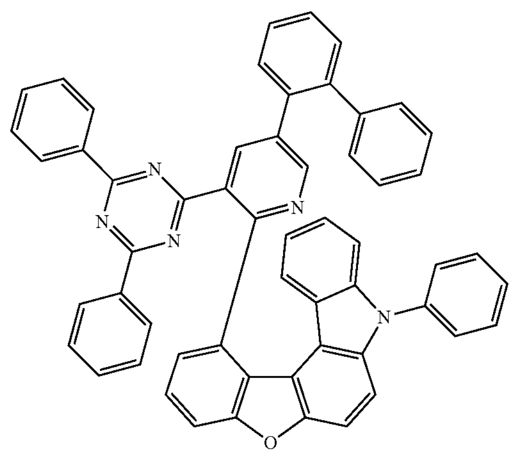
1038
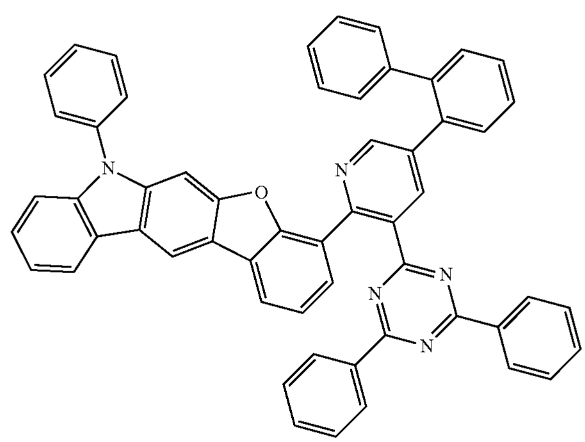

-continued
1039
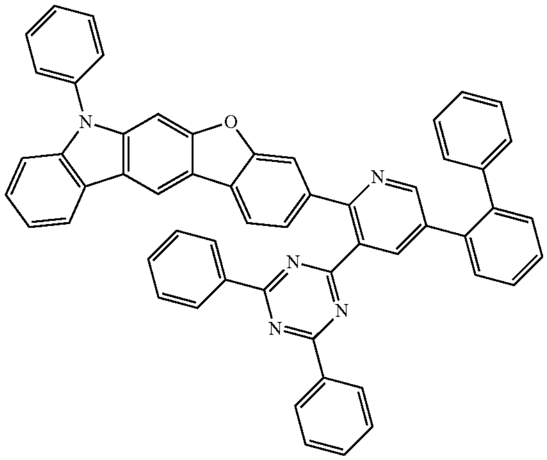
1040
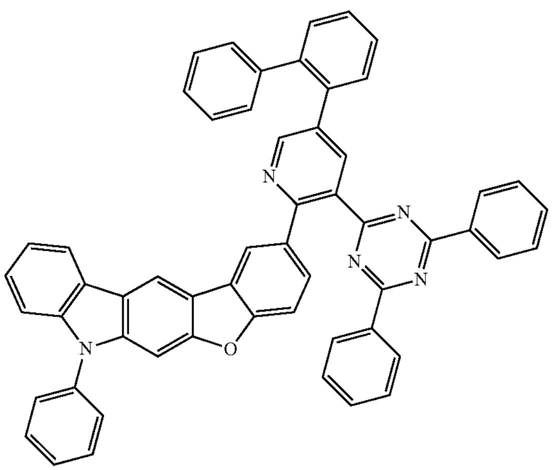
1041
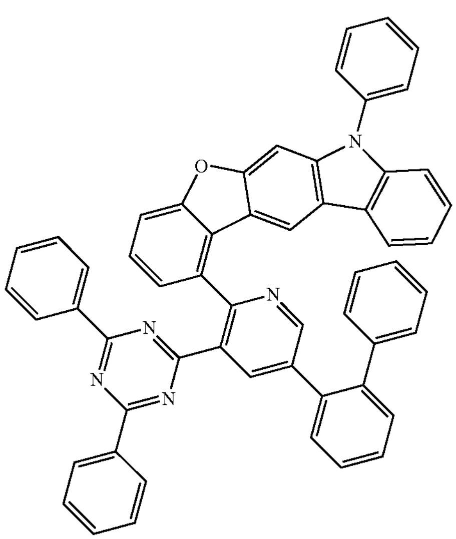
-continued
1042
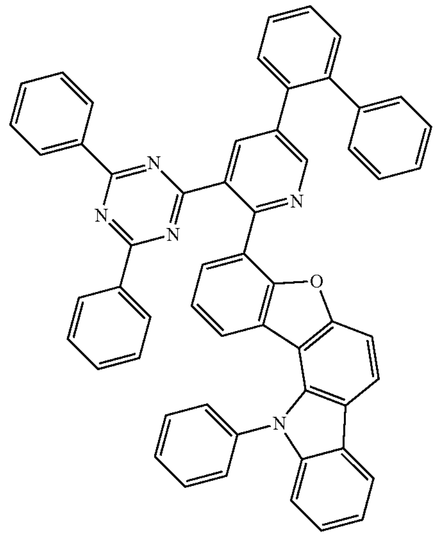
1043
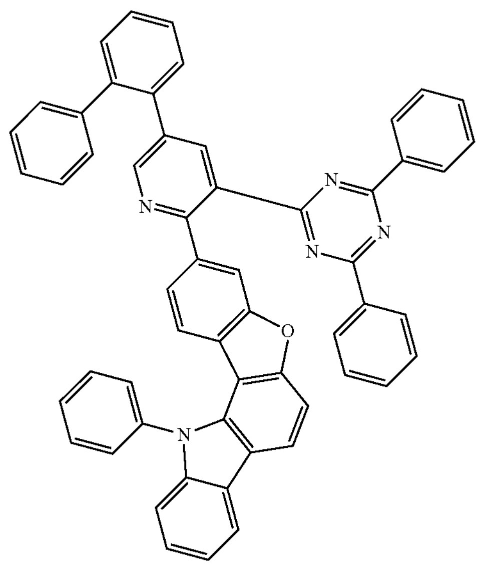
1044
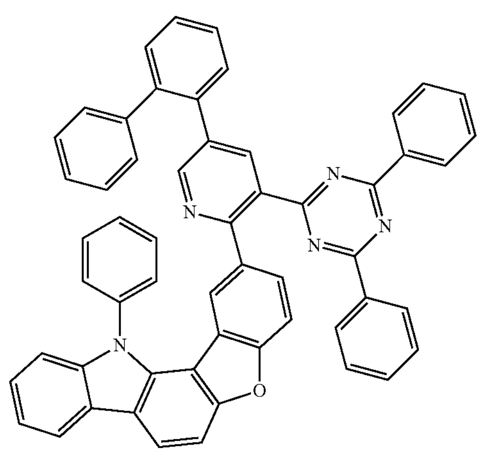

1045
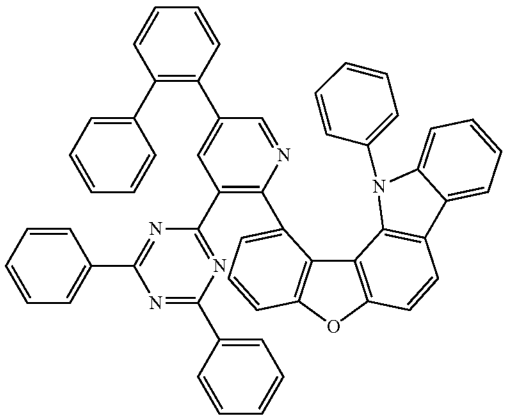
1046
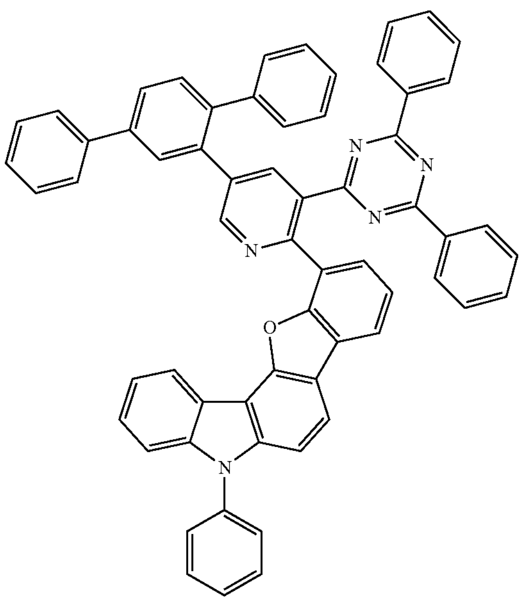
1047
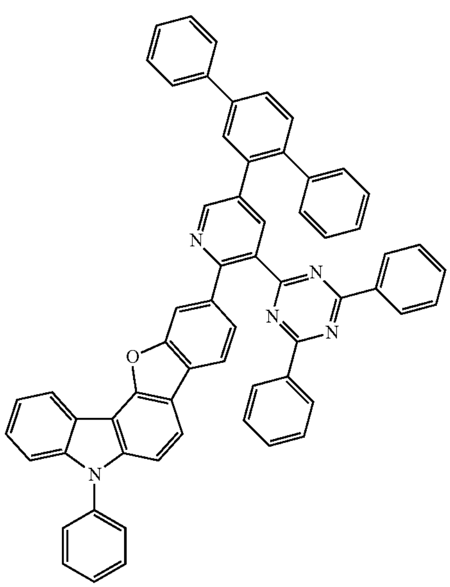
1048
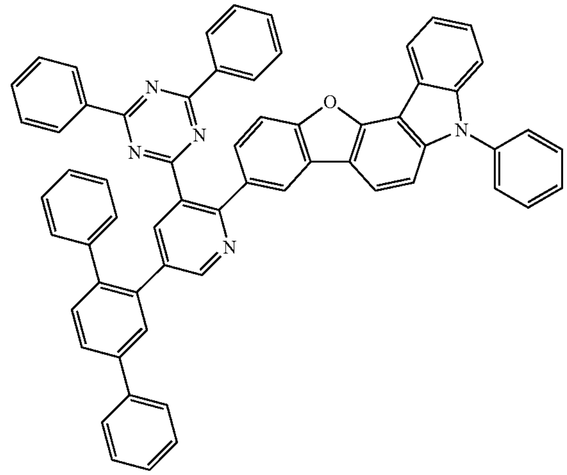
1049
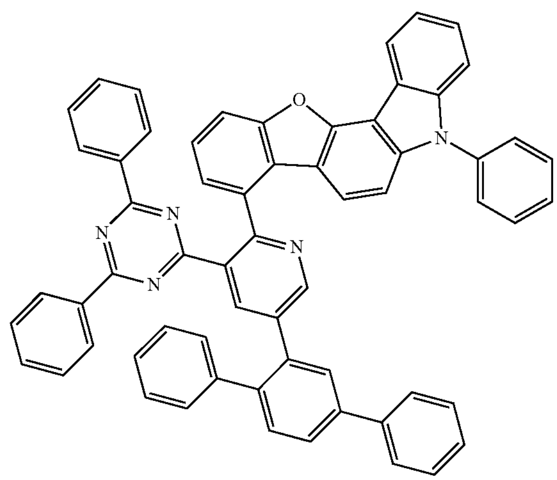
1050
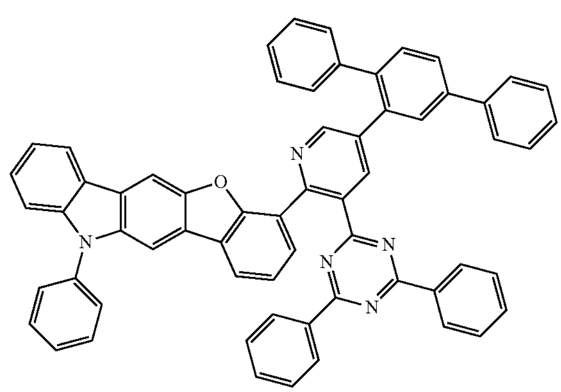

-continued
1051
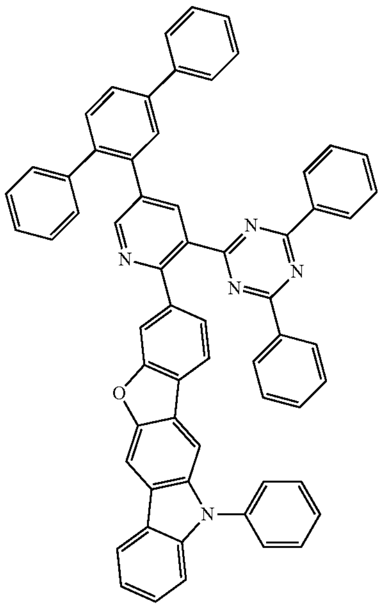
1052
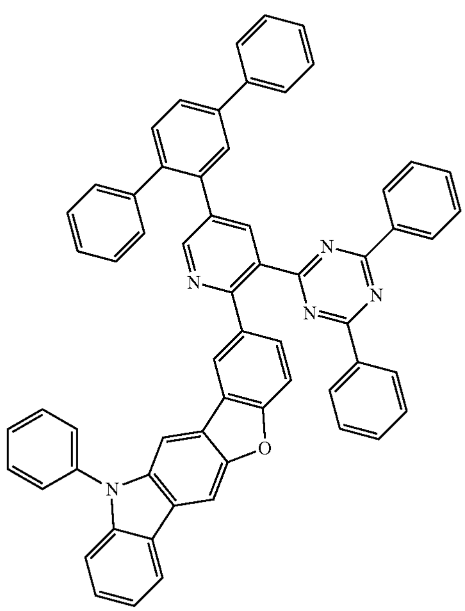
-continued
1053
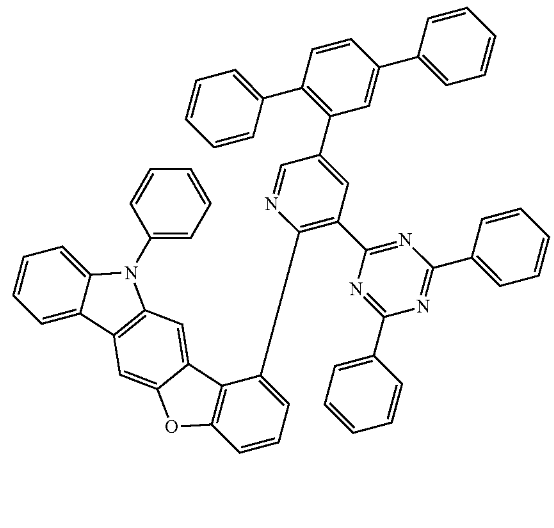
1054
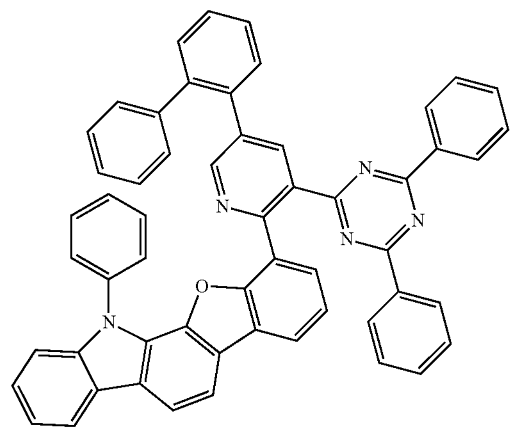
1055
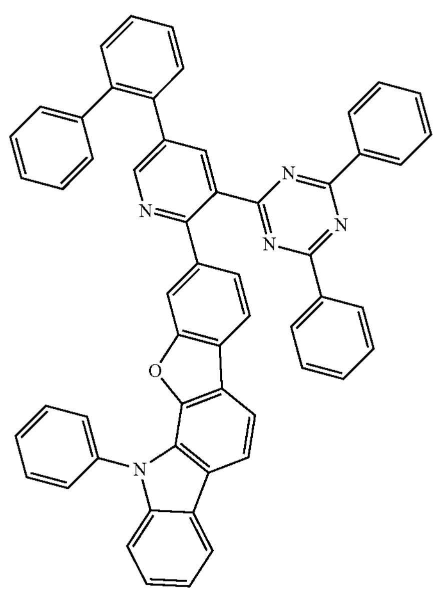

-continued
1056
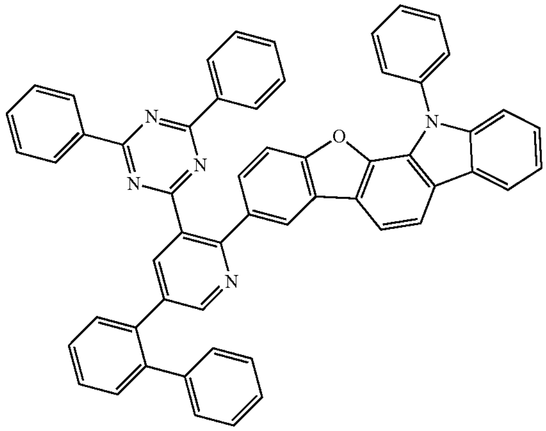
1057
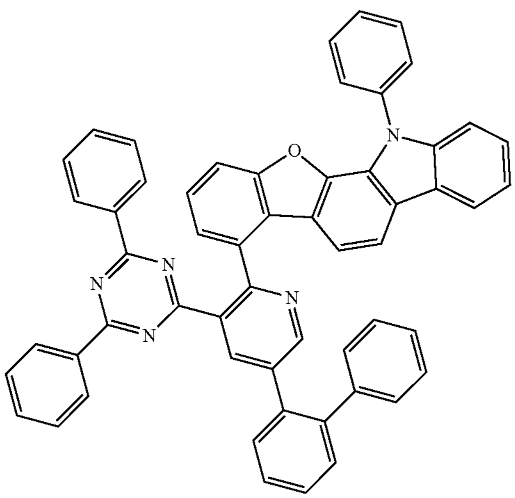
1058
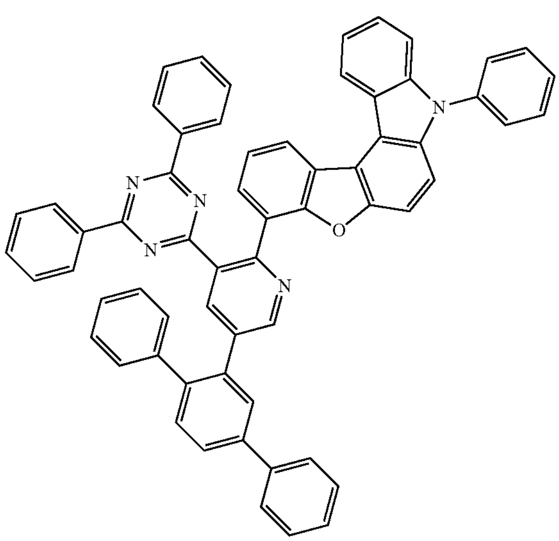
-continued
1059
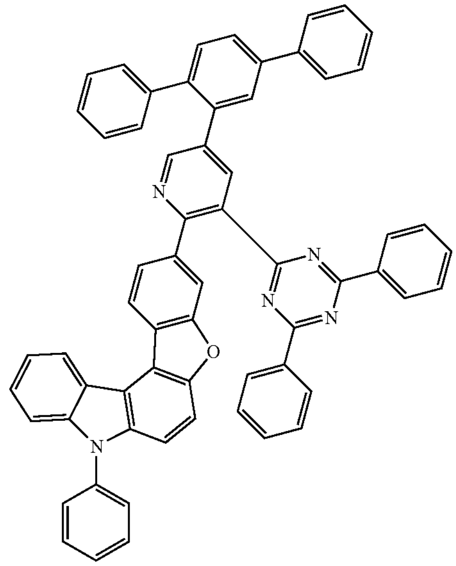
1060
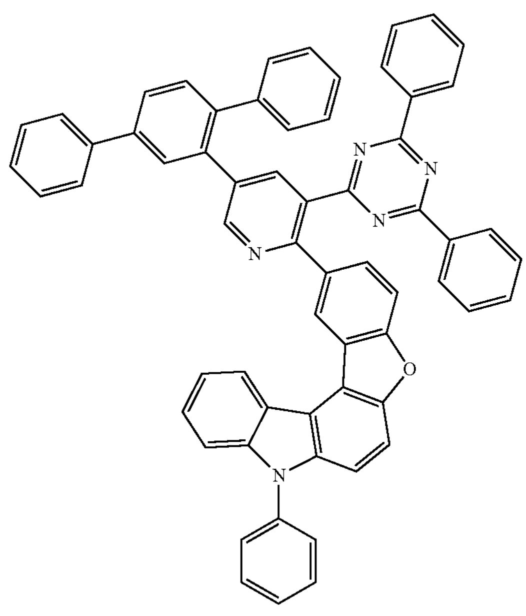

-continued
1061
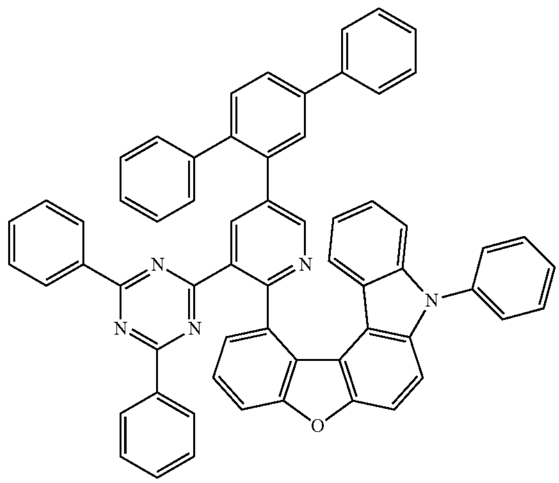
1062
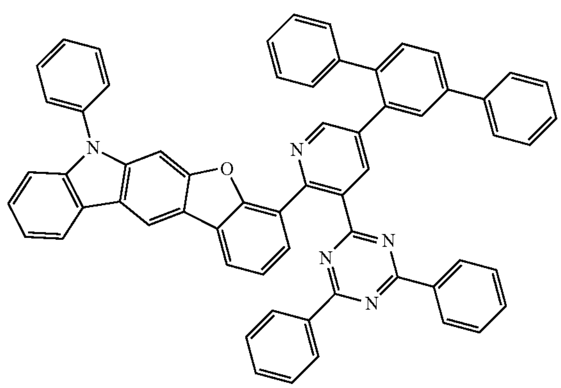
1063
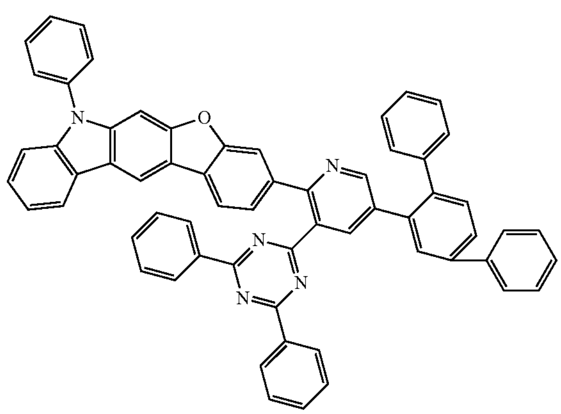
-continued
1064
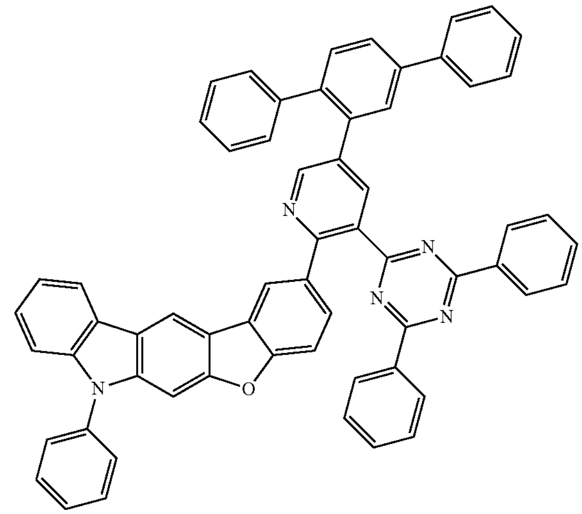
1065
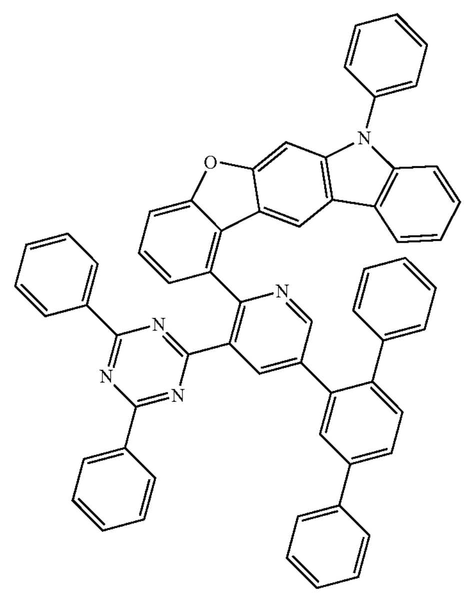

-continued
1066
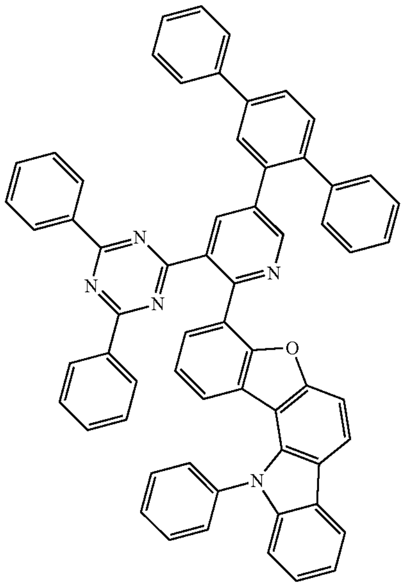
1067
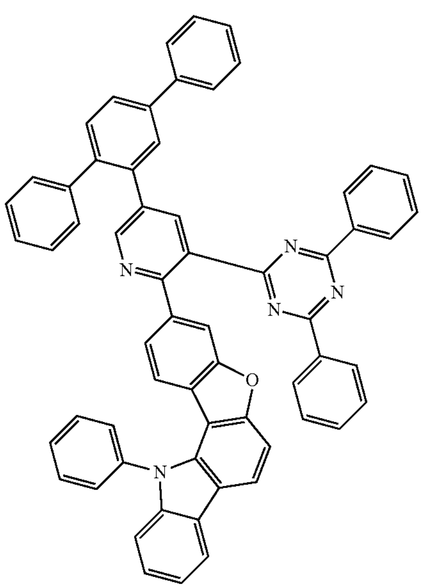
-continued
1068
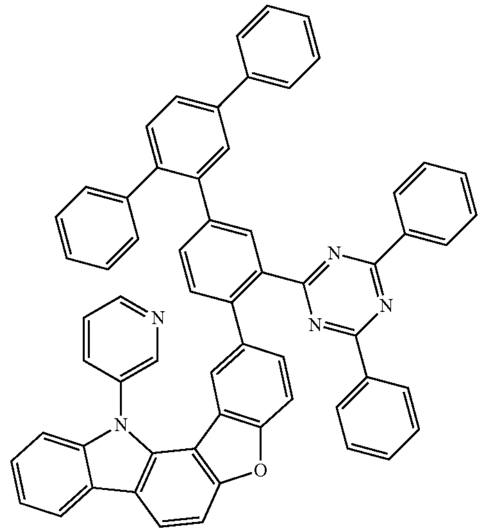
1069
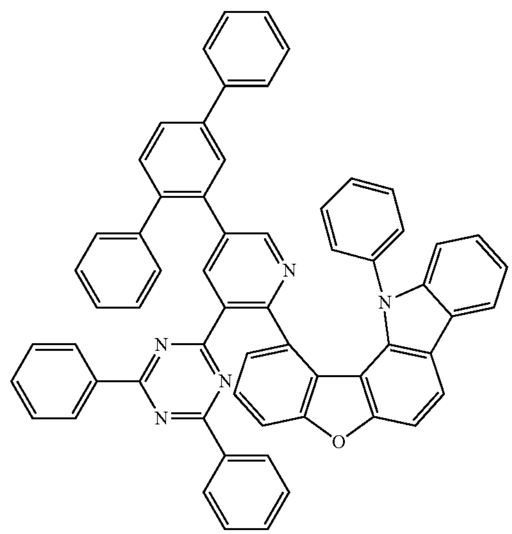
1070
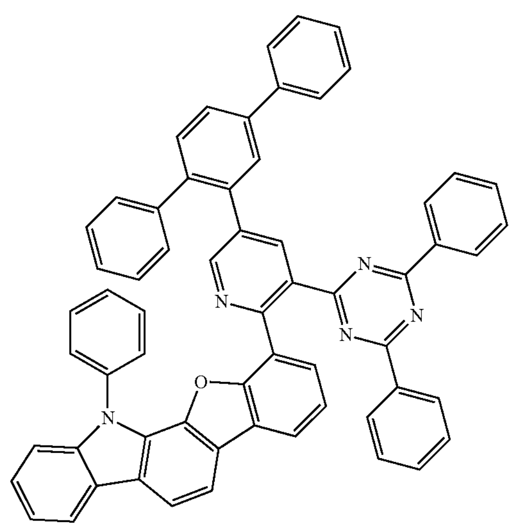

-continued
1071
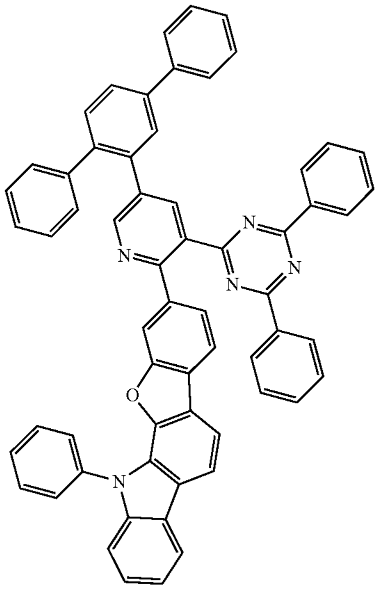
1072
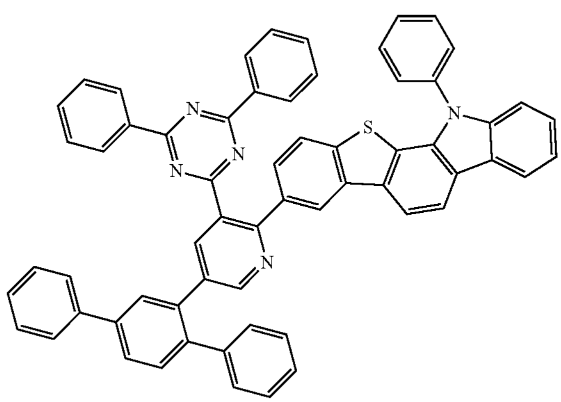
1073
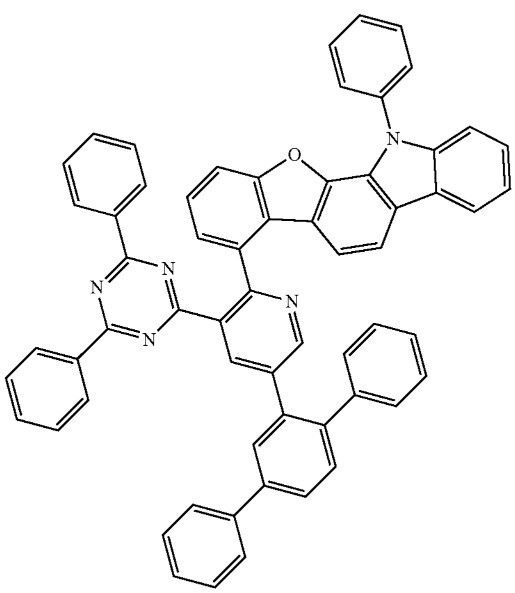
-continued
1074
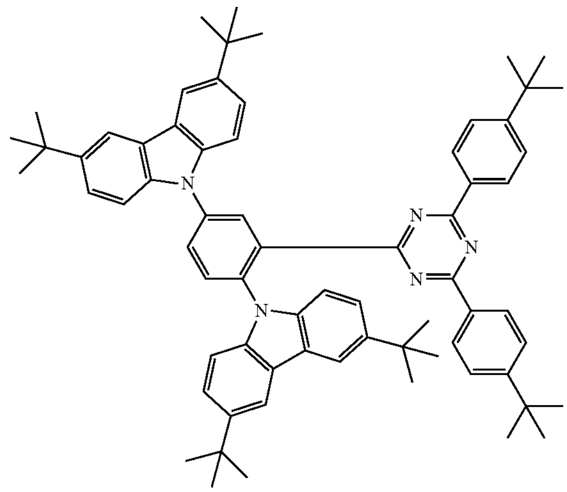
1075
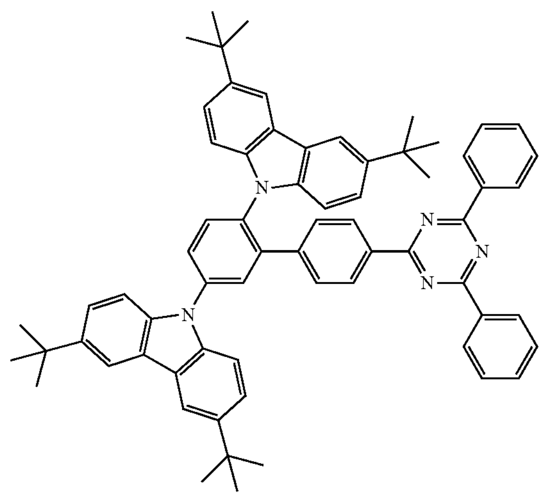
1076
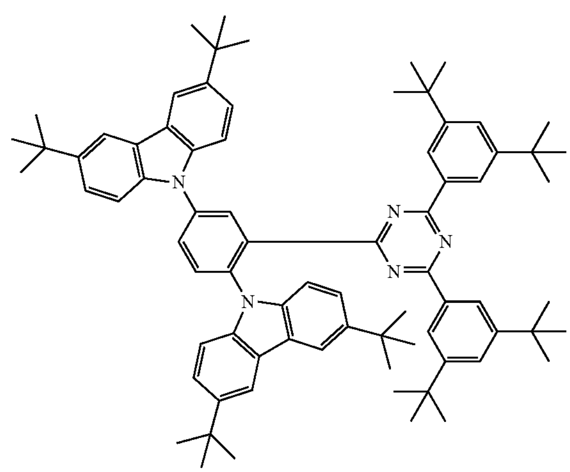

-continued
1077
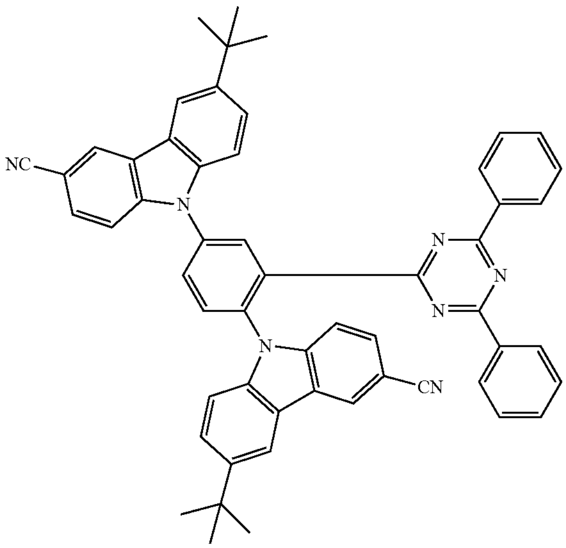
1078
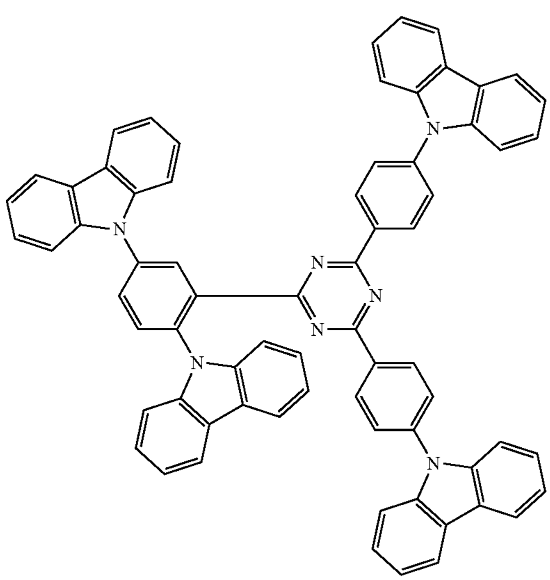
Group XIV
1
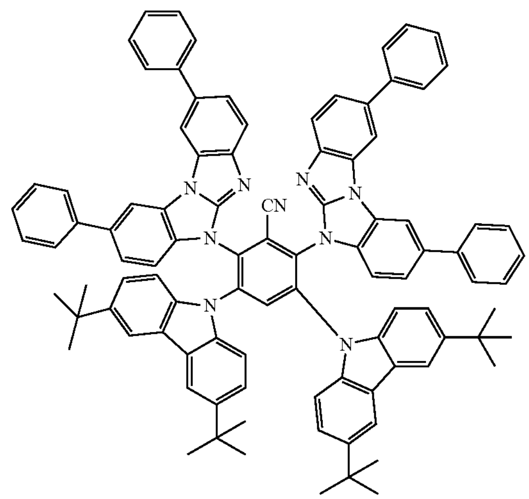
2
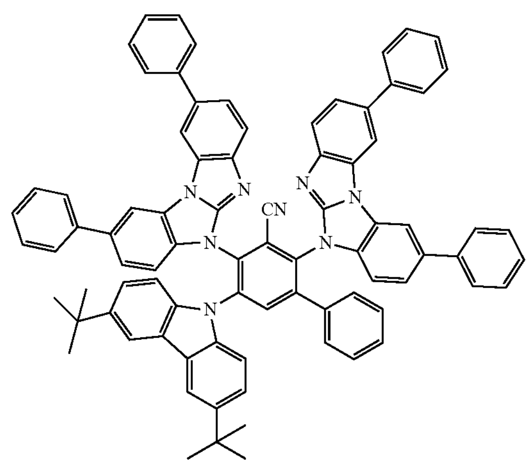
3
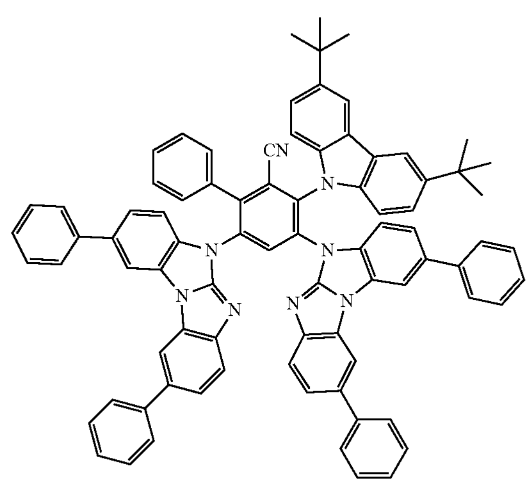

-continued
4
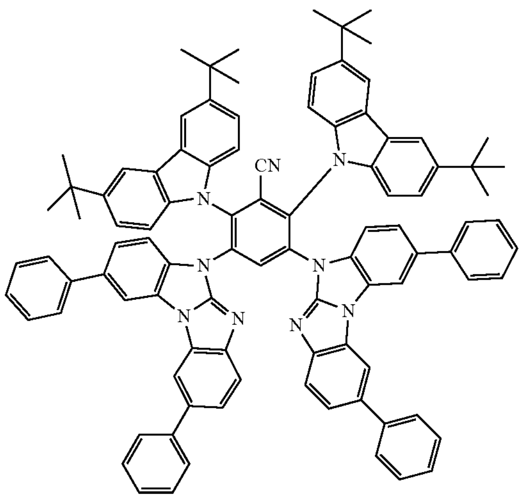
5
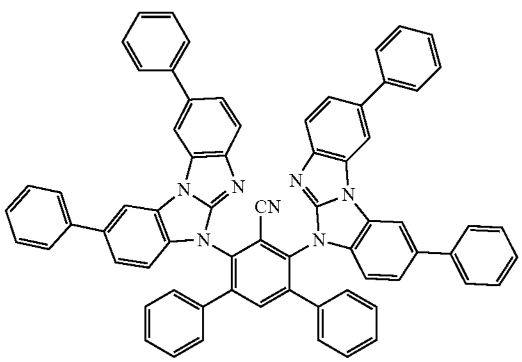
6
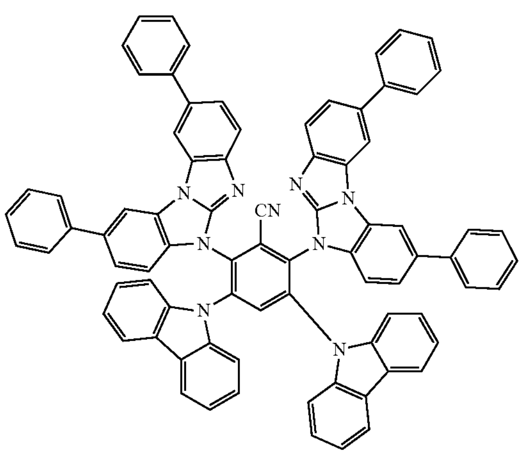
-continued
7
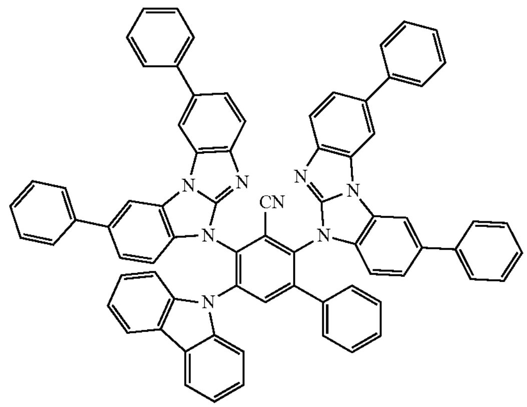
8
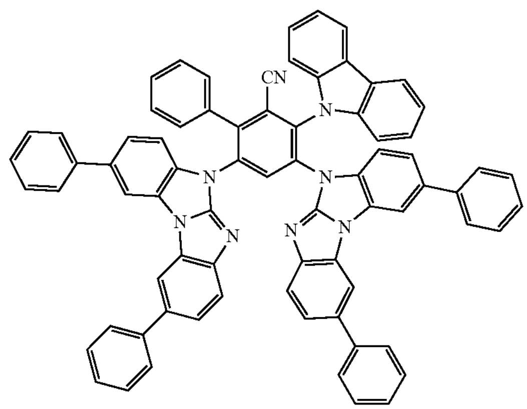
9
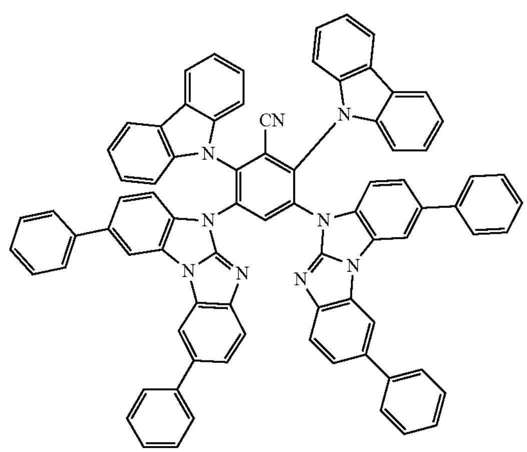

2516
-continued
10
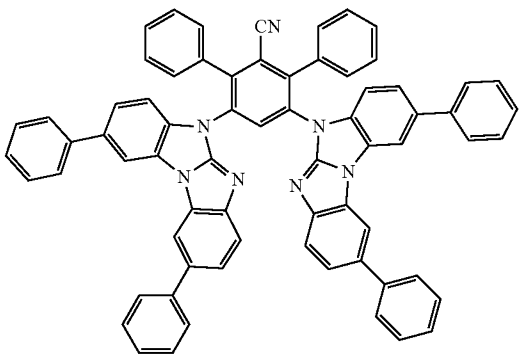
11
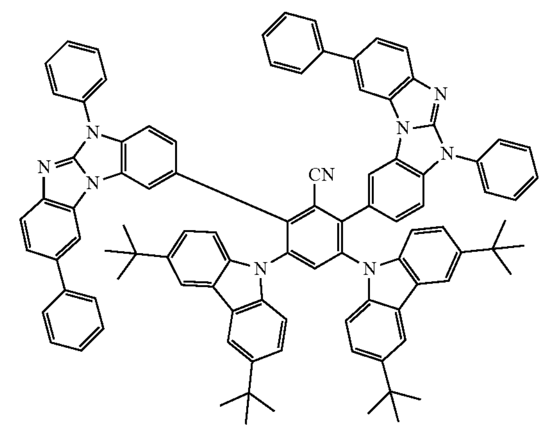
12
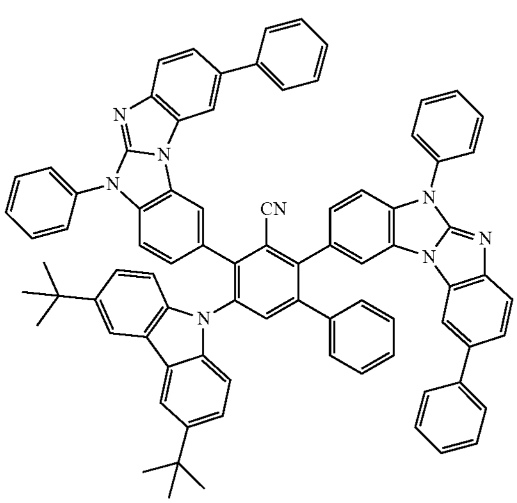
13
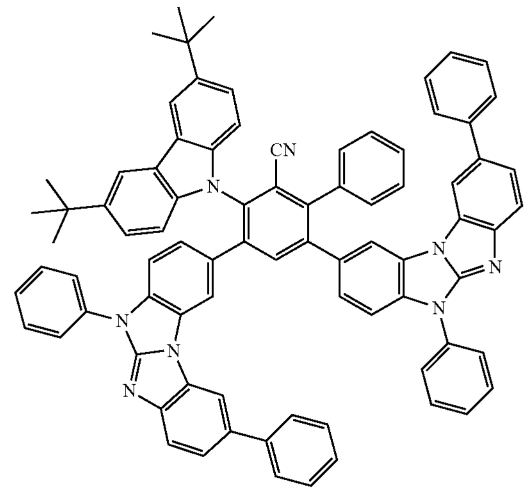
14
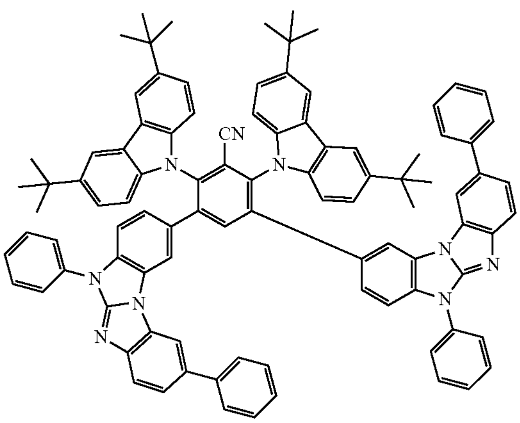
15
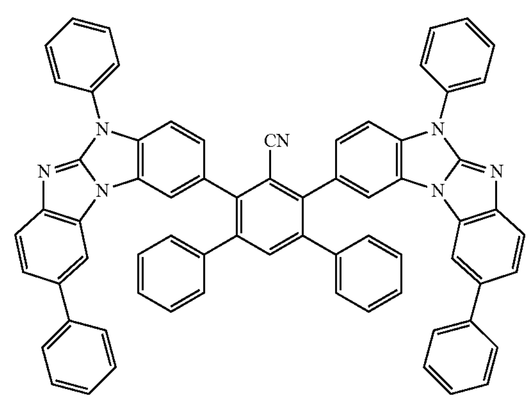

-continued
16
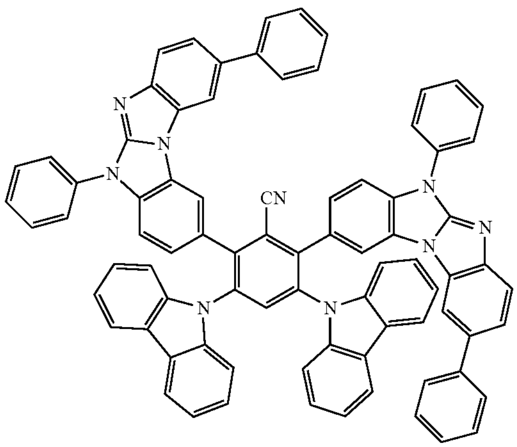
17
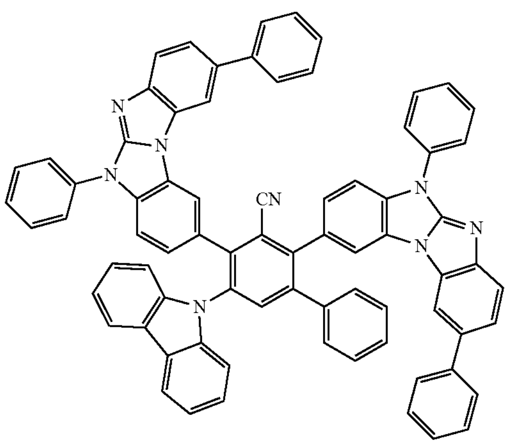
18
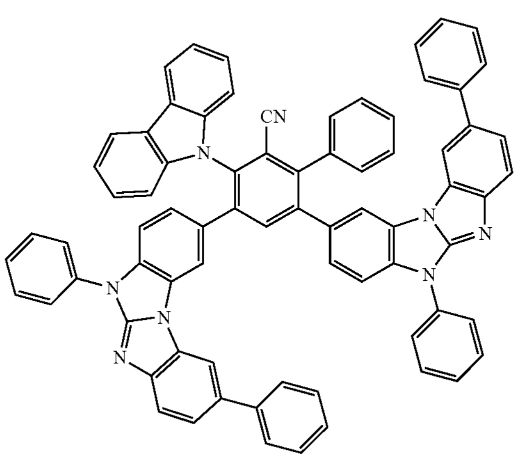
-continued
19
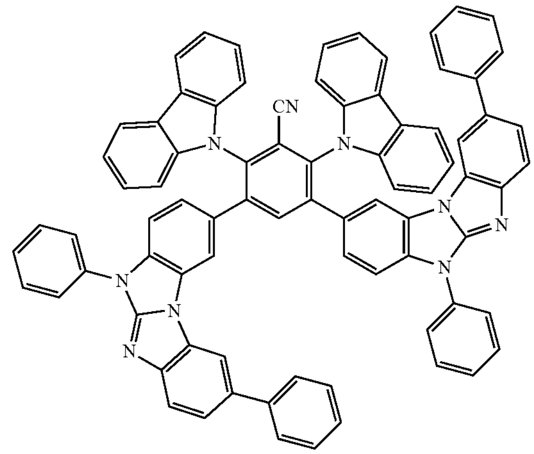
20
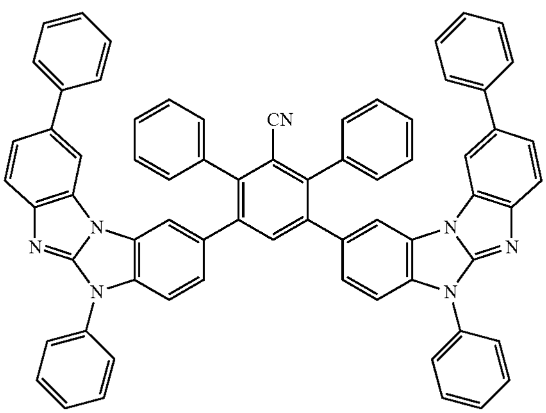
21
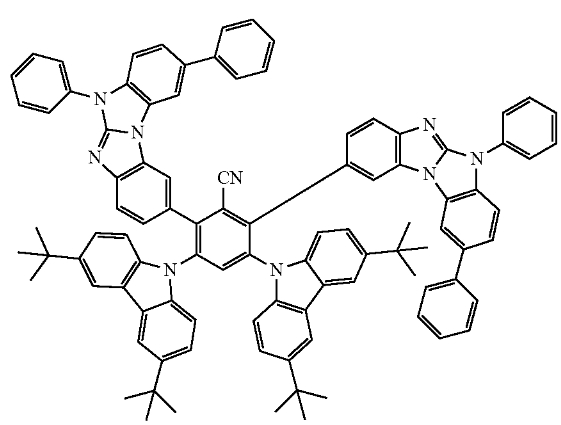

-continued
22
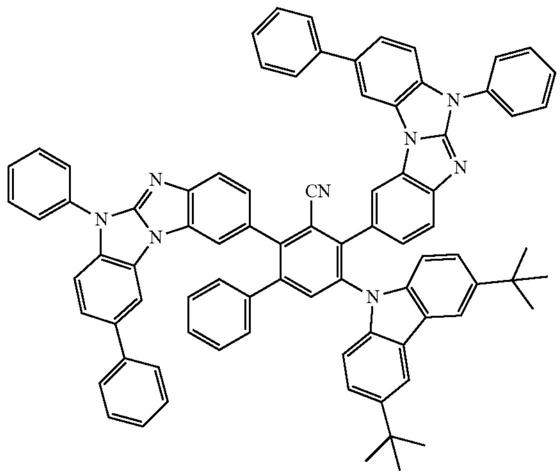
23
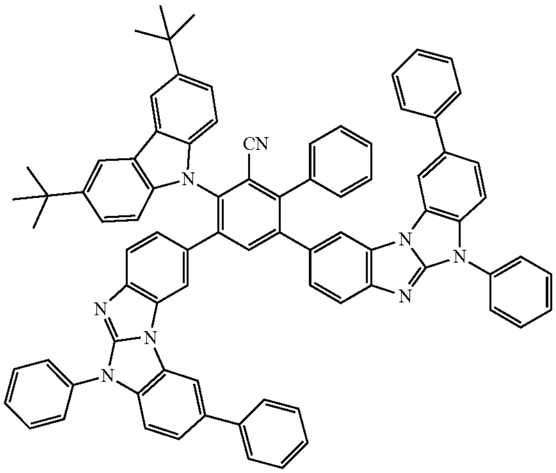
24
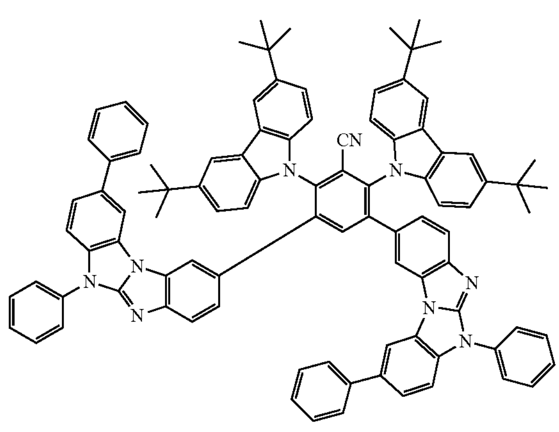
-continued
25
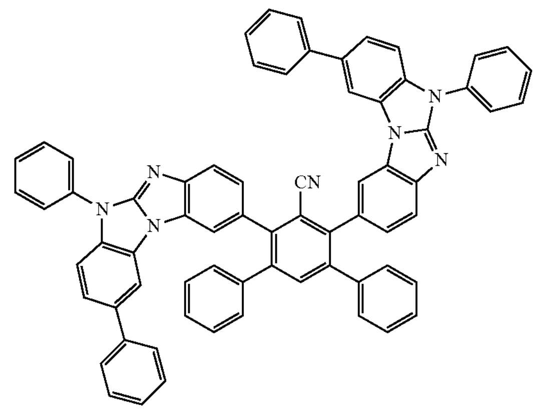
26
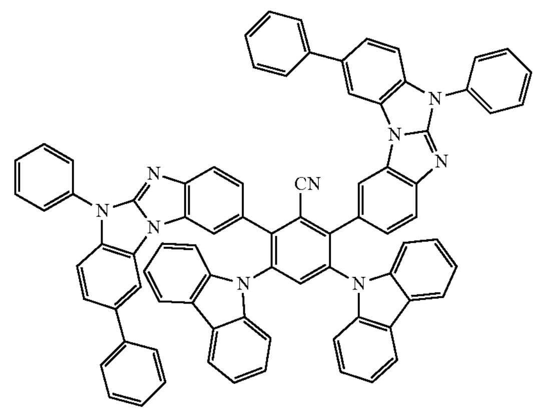
27
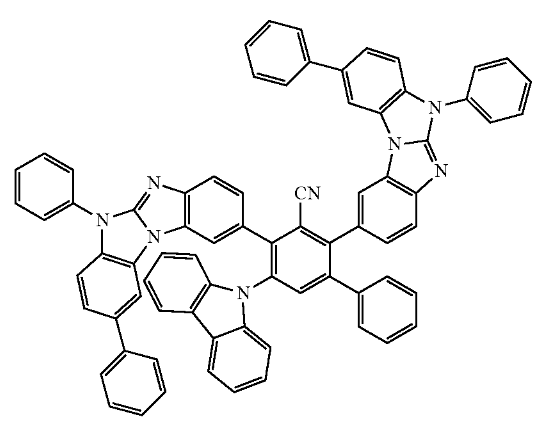

28
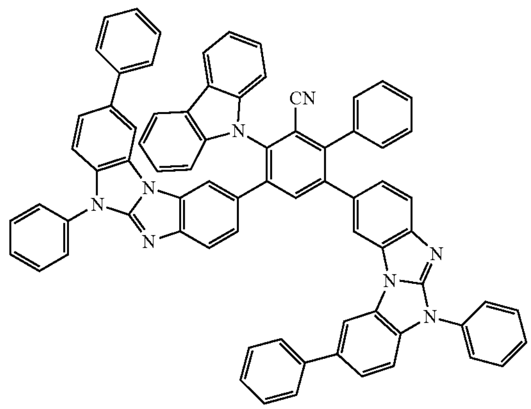
29
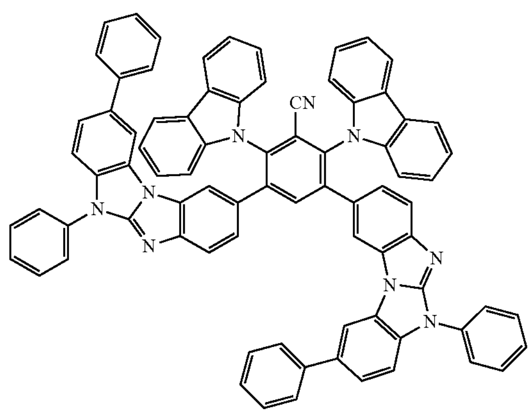
30
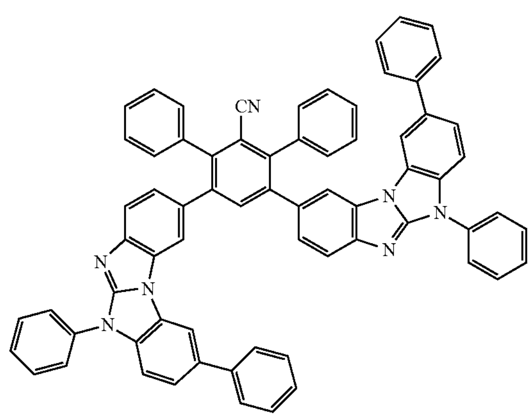
31
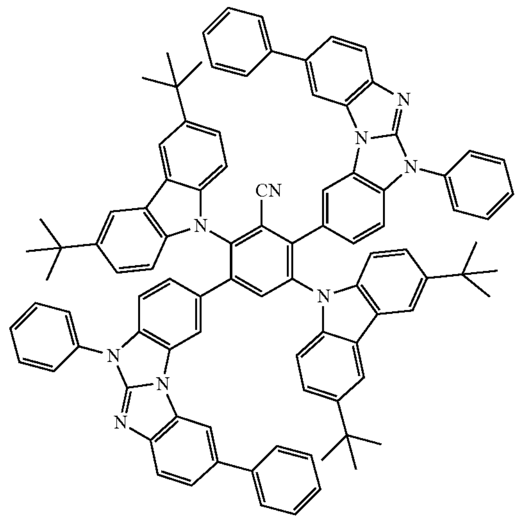
32
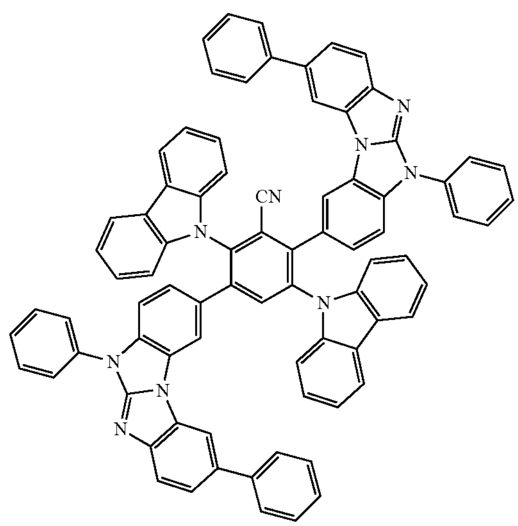
33
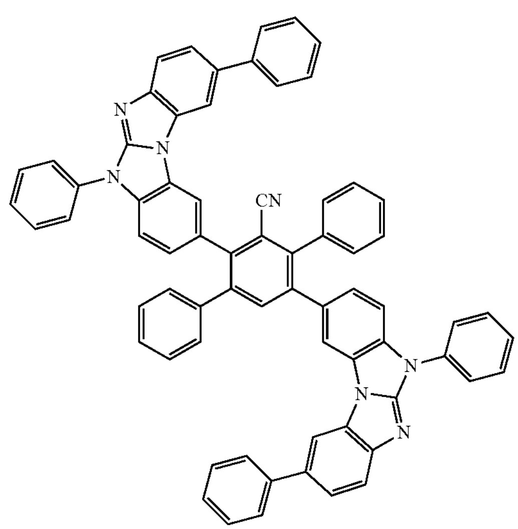

-continued
34
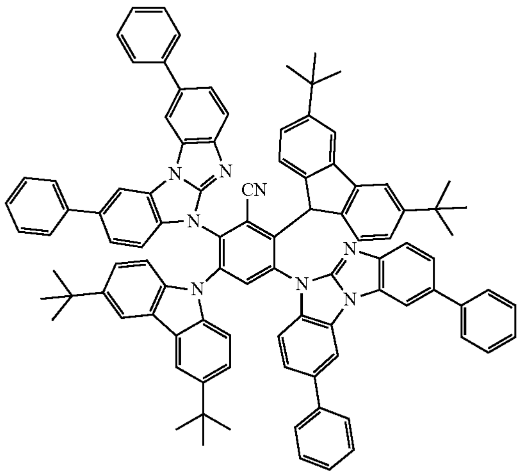
35
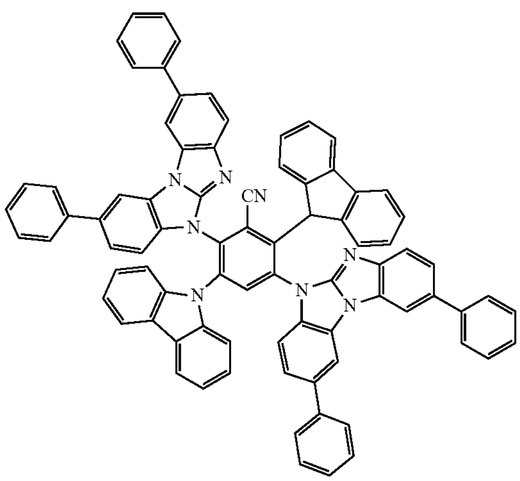
36
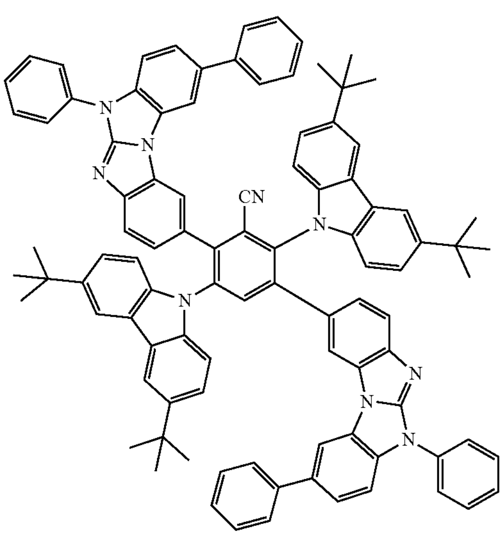
-continued
37
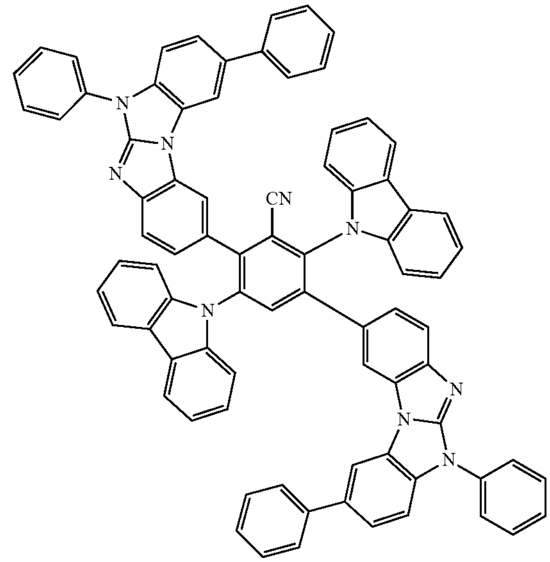
38
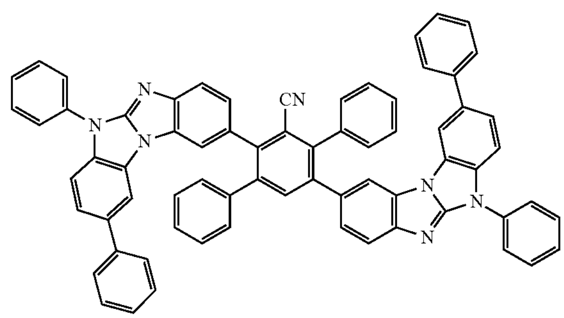
39
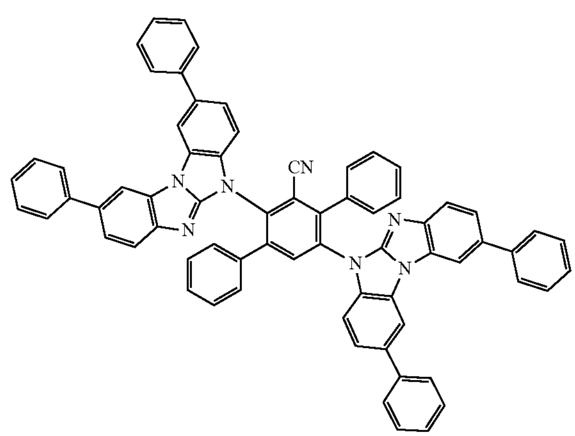

Group XV

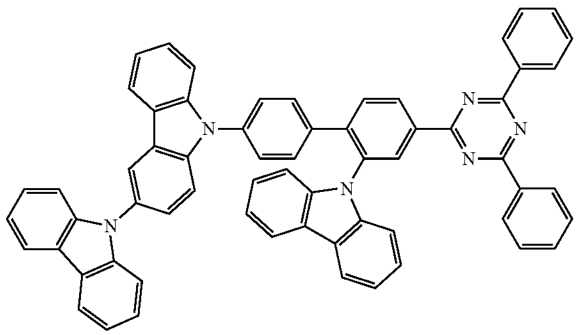

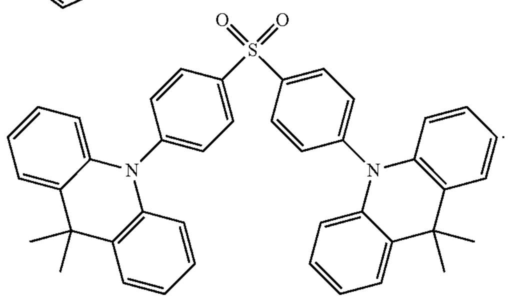

Hole Transport Region 3

In the organic light-emitting device 10, the hole transport region 3 may be arranged between the first electrode 2 and the emission layer 4.

The hole transport region 3 may have a single-layered structure or a multi-layered structure.

For example, the hole transport region 3 may have a hole injection layer, a hole transport layer, a hole injection layer/hole transport layer structure, a hole injection layer/first hole transport layer/second hole transport layer structure, a hole transport layer/interlayer structure, a hole injection layer/hole transport layer/interlayer structure, a hole transport layer/electron blocking layer structure, or a hole injection layer/hole transport layer/electron blocking layer structure, but embodiments of the present disclosure are not limited thereto.

The hole transport region 3 may include any compound having hole-transporting properties.

For example, the hole transport region 3 may include a carbazole-based compound, such as N-phenyl carbazole and polyvinyl carbazole, a fluorene-based compound, Compound H1, Compound H2, or any combination thereof.

H1

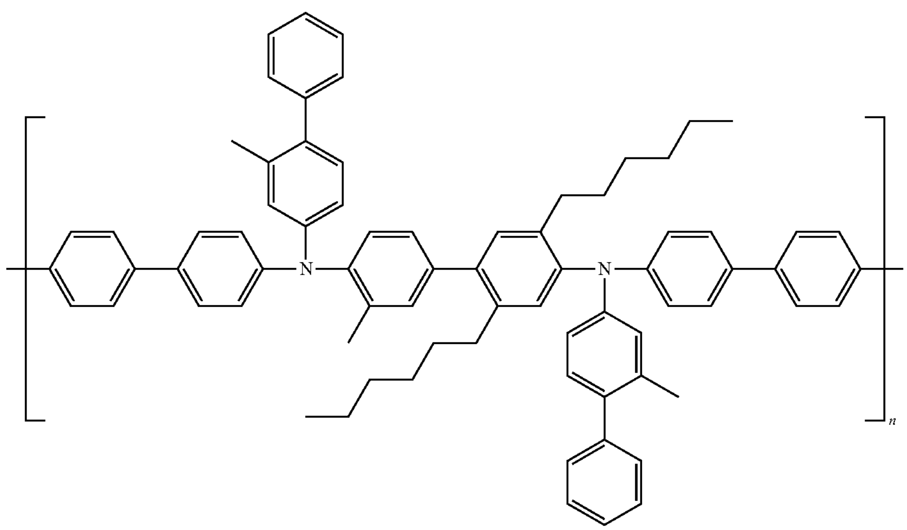

H2

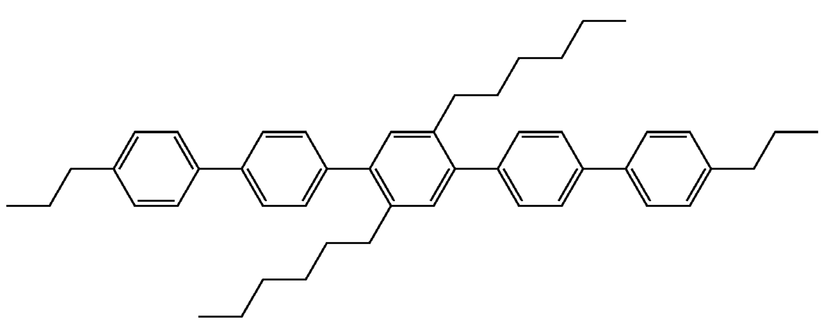

For example, the hole transport region 3 may include an amine-based compound.

In an embodiment, the hole transport region 3 may include at least one compound represented by Formulae 201 to 205, but embodiments of the present disclosure are not limited thereto:

Formula 201

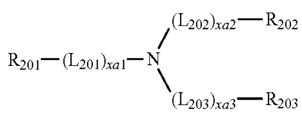

Formula 202

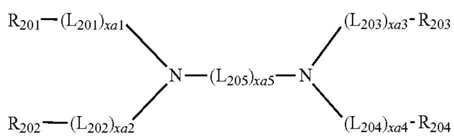

Formula 203

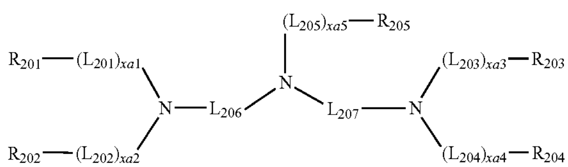

Formula 204

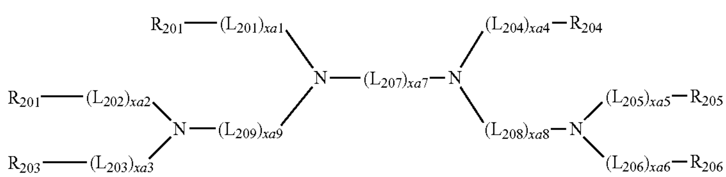

Formula 205

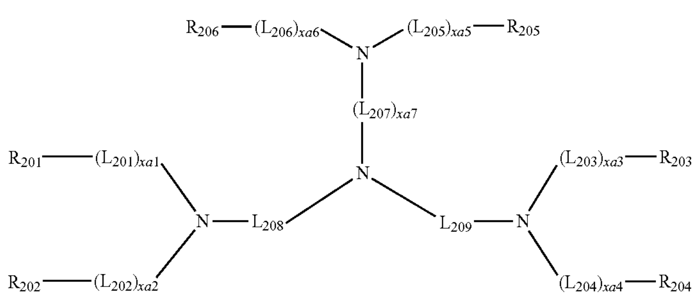

wherein, in Formulae 201 to 205, $L_{201}$ to $L_{209}$ may each independently *-be O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

For example, $L_{201}$ to $L_{209}$ may be:

a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si($Q_{11}$)($Q_{12}$)($Q_{13}$), xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), —N($Q_{31}$)($Q_{32}$), or any combination thereof, wherein $Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, the hole transport region 3 may include a carbazole-containing amine-based compound.

In one or more embodiments, the hole transport region 3 may include a carbazole-containing amine-based compound and a carbazole-free amine-based compound.

The carbazole-containing amine-based compound may be, for example, a compound represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

The carbazole-free amine-based compound may be, for example, a compound represented by Formula 201 which does not include a carbazole group and which includes at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In one or more embodiments, the hole transport region 3 may include at least one compound represented by Formula 201, Formula 202, or a combination thereof.

In an embodiment, the hole transport region 3 may include at least one compound represented by Formulae 201-1, 202-1, 201-2, or any combination thereof but embodiments of the present disclosure are not limited thereto:

Formula 201-1

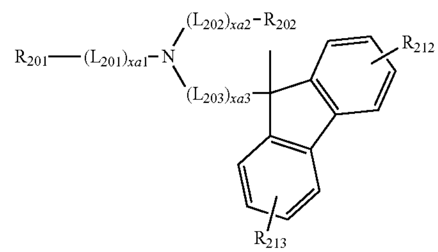

Formula 202-1

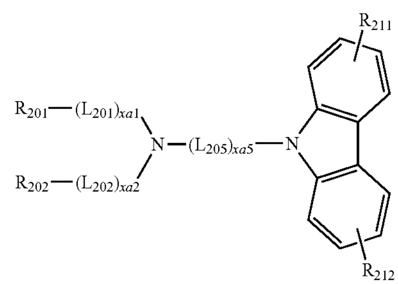

Formula 201-2

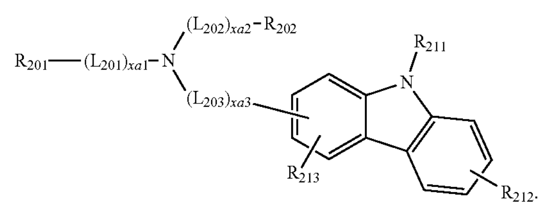

In Formulae 201-1, 202-1, and 201-2, $L_{201}$ to $L_{203}$, $L_{205}$, xa1 to xa3, xa5, $R_{201}$, and $R_{202}$ may each be the same as described herein, and $R_{211}$ to $R_{213}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenyl fluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyi group, a dibenzocarbazolyi group, a dibenzosilolyi group, or a pyridinyi group.

For example, the hole transport region 3 may include at least one of Compounds HT1 to HT39, but embodiments of the present disclosure are not limited thereto:

HT1

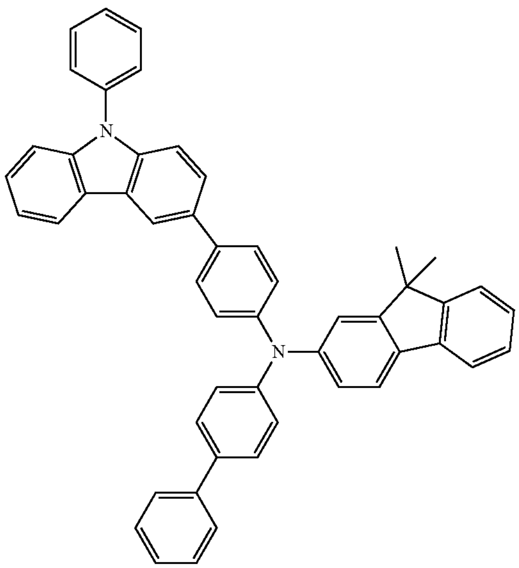

HT2

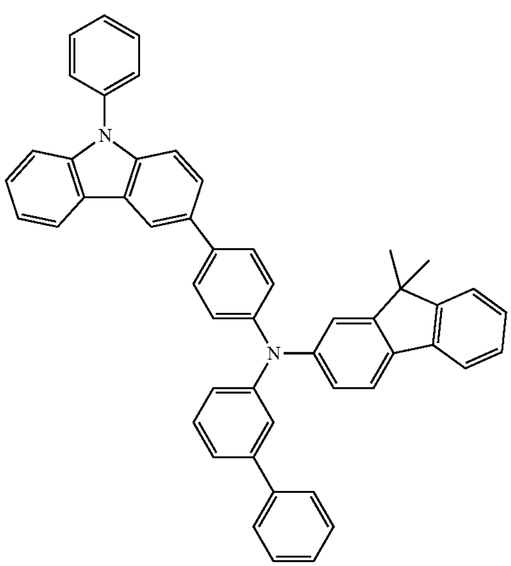

-continued

HT3

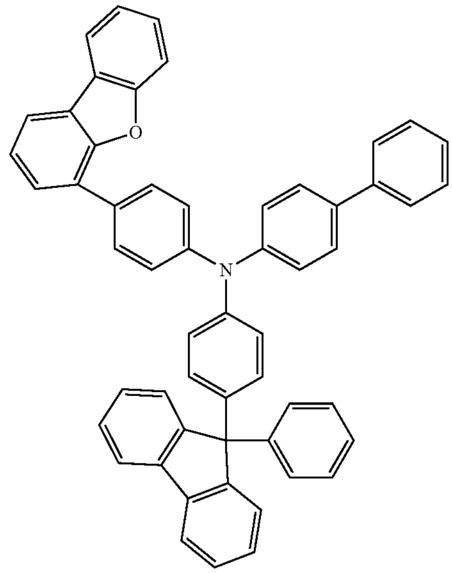

HT4

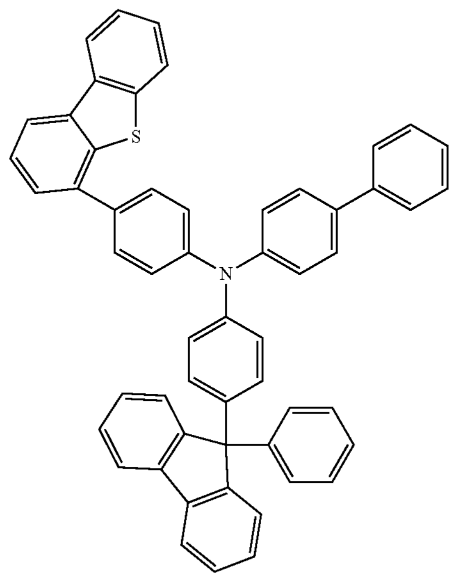

HT5

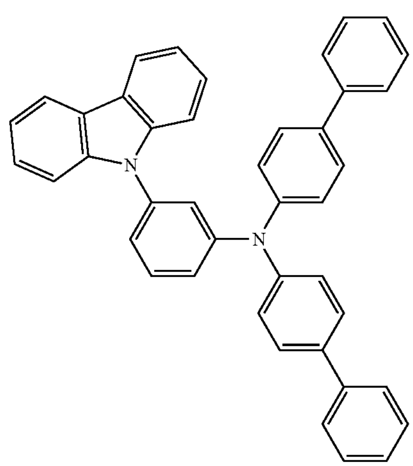

HT6
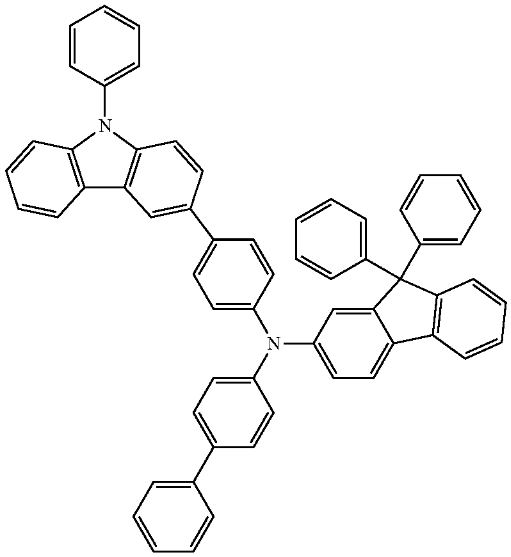
HT7
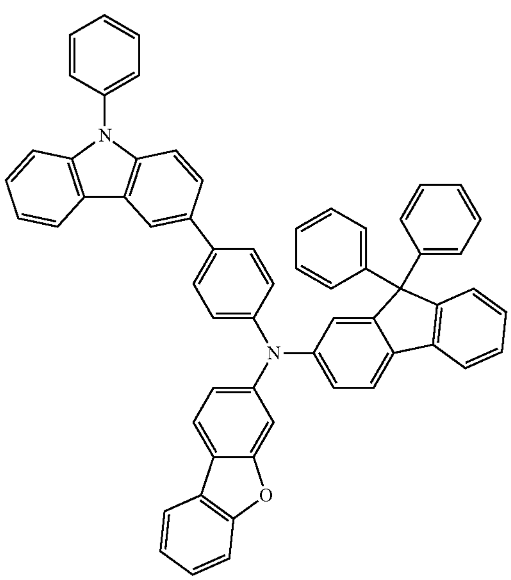
HT8
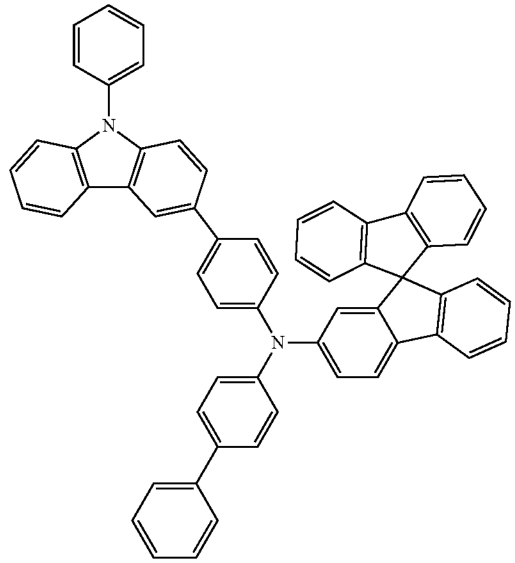
HT9
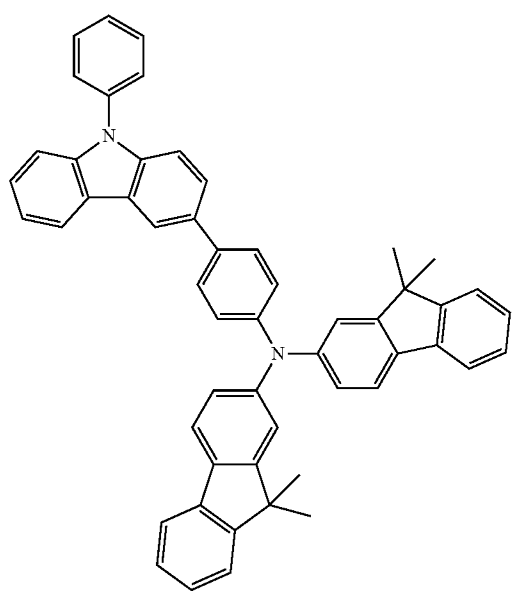

-continued
HT10
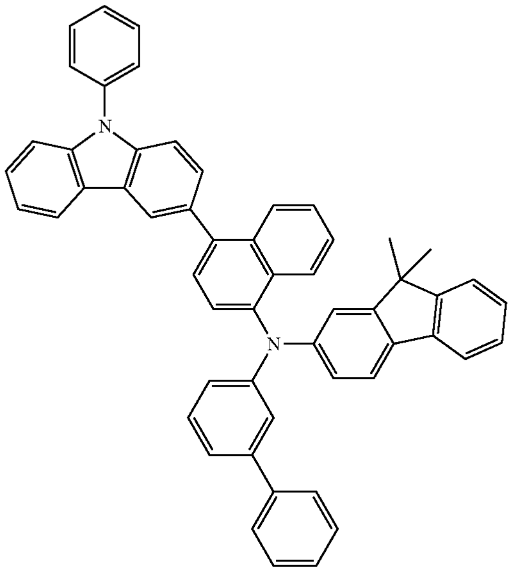
HT11
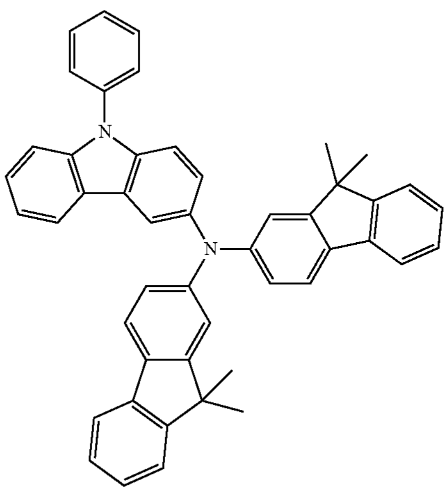
HT12
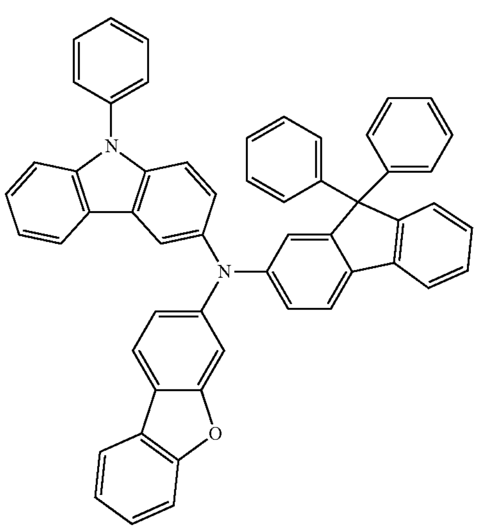
-continued
HT13
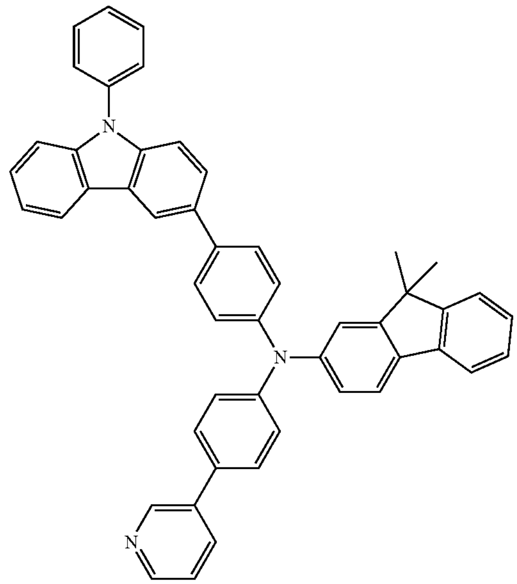
HT14
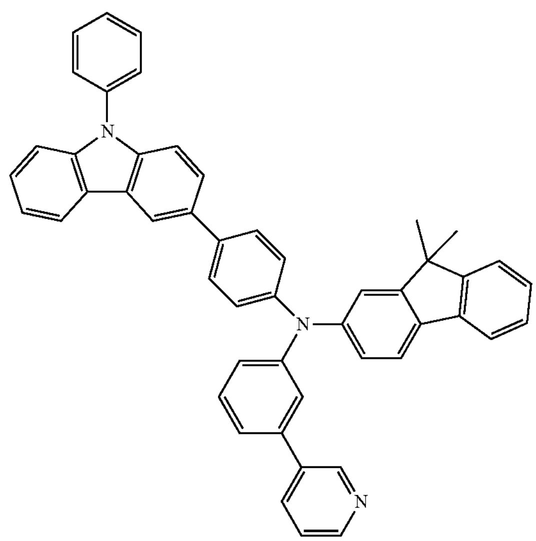
HT15
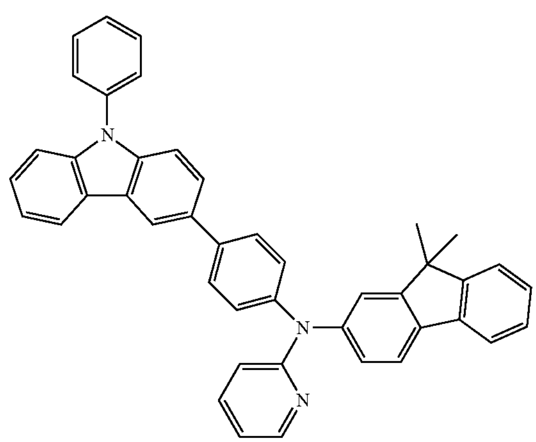

HT16
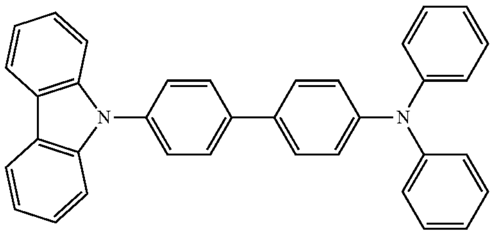
HT17
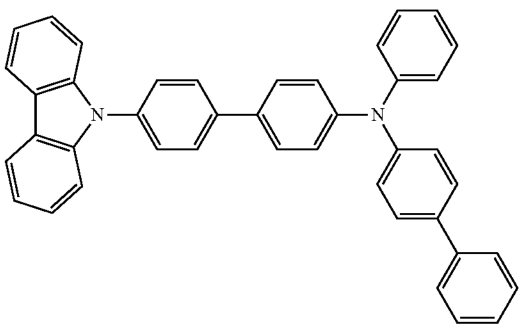
HT18
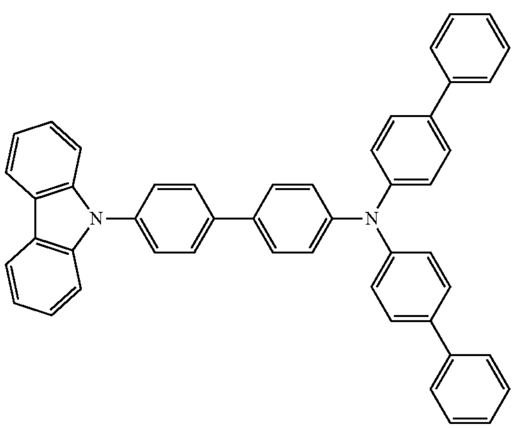
HT19
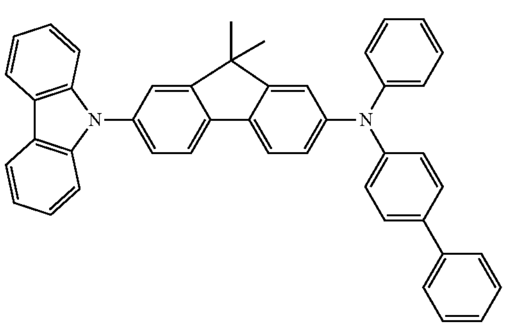
HT20
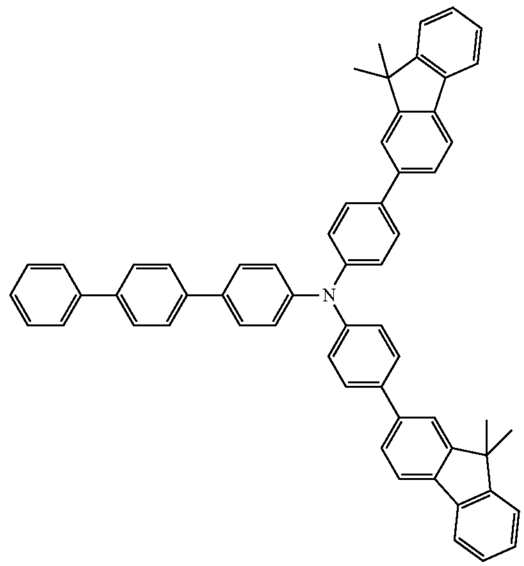
HT21
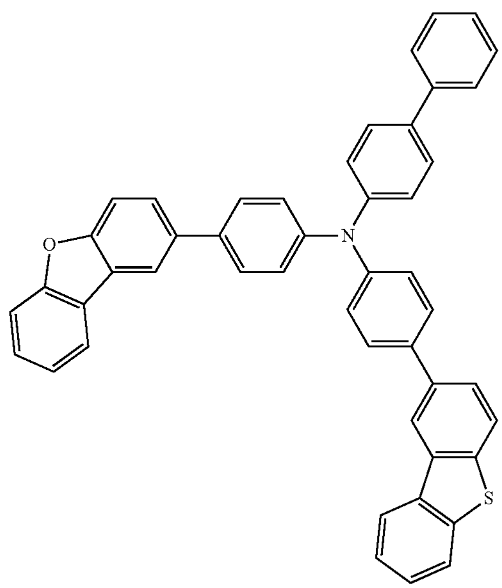
HT22
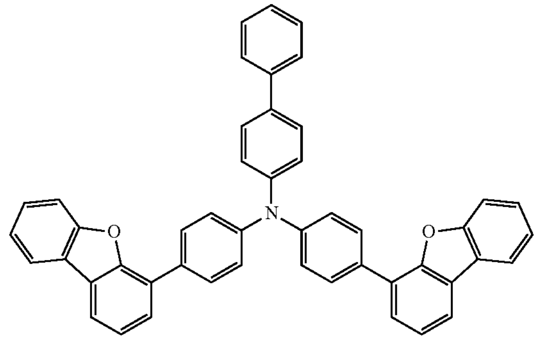

-continued
HT23
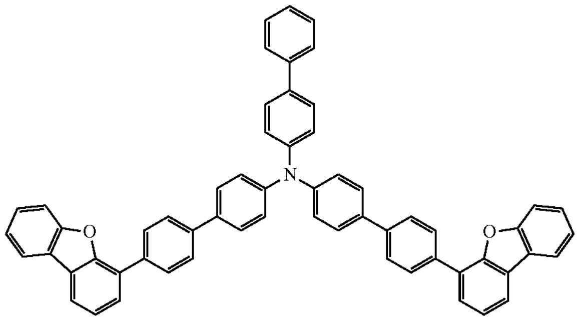
HT24
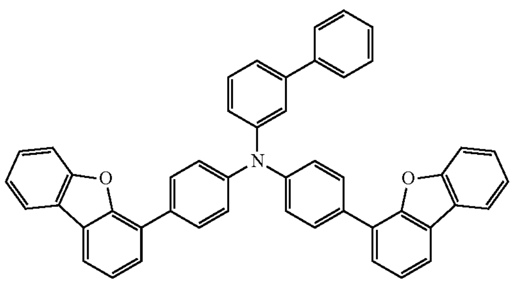
HT25
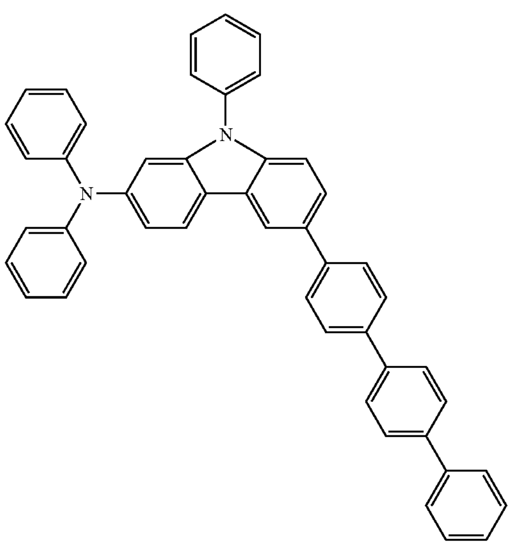
-continued
HT26
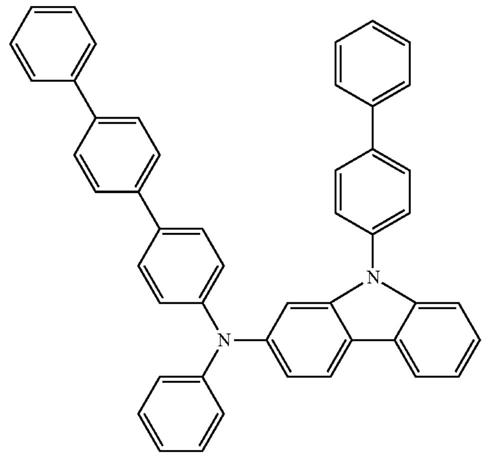
HT27
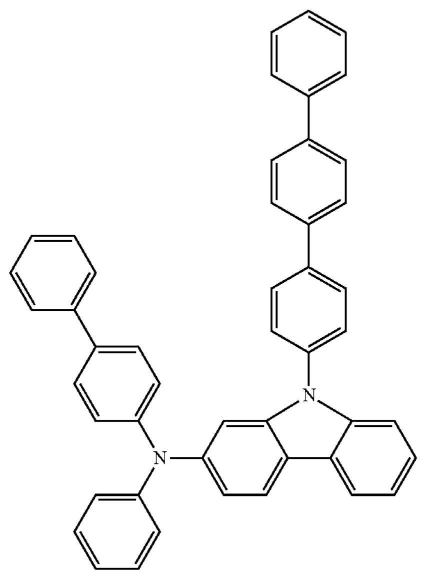
HT28
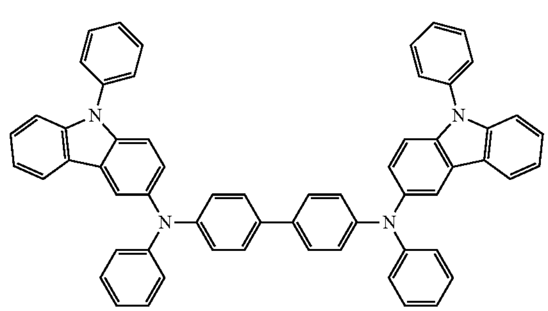

-continued
HT29
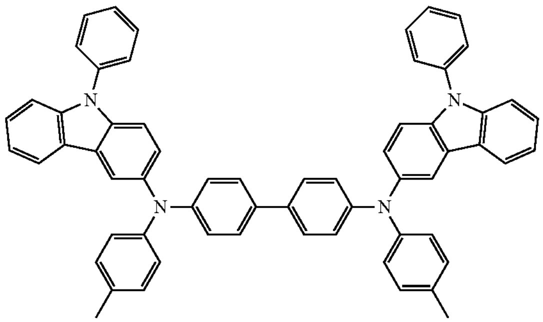
HT30
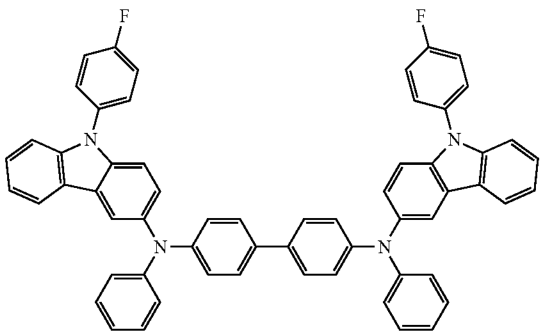
HT31
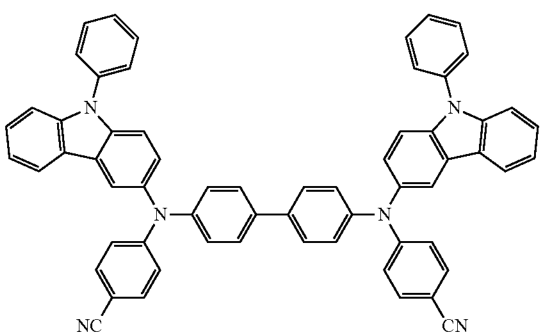
HT32
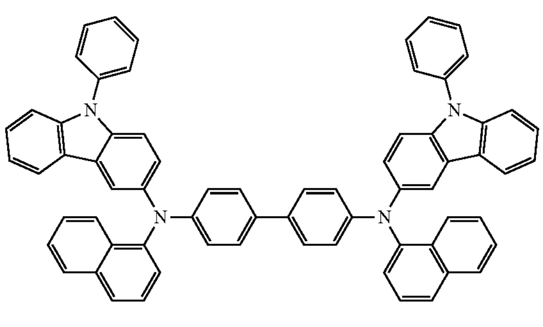
-continued
HT33
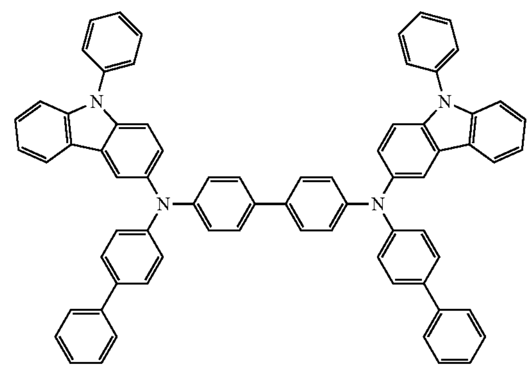
HT34
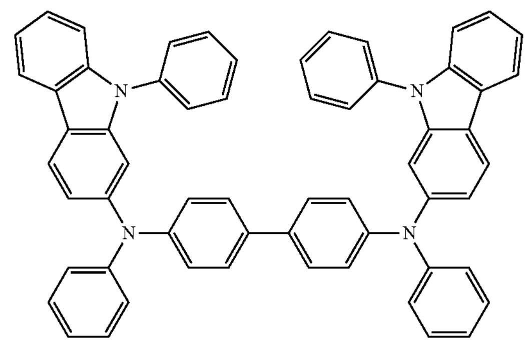
HT35
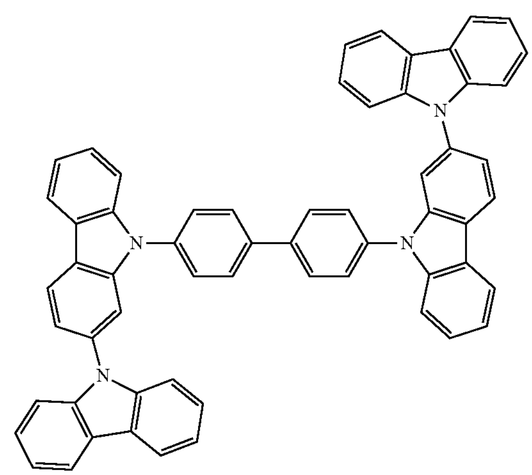
HT36
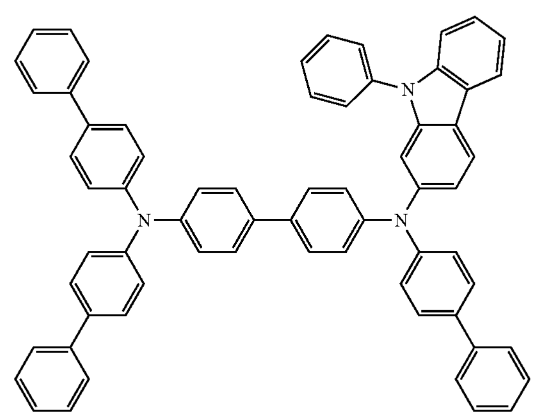

-continued

HT37

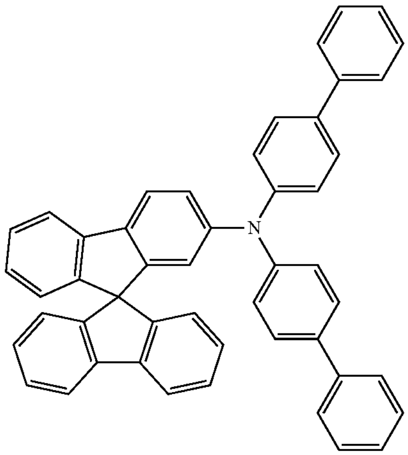

HT38

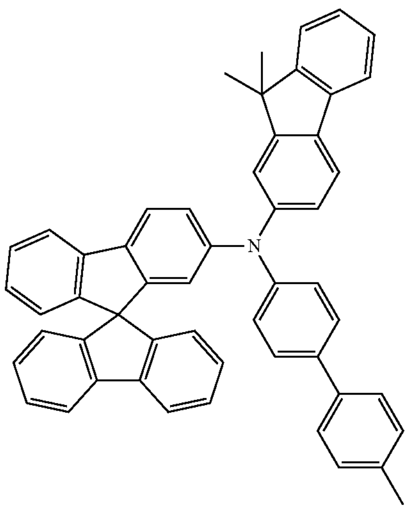

HT39

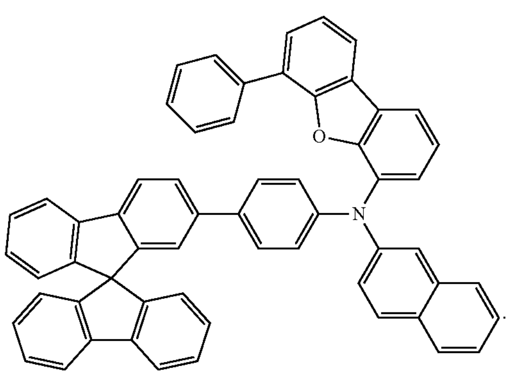

In one or more embodiments, hole transport region 3 of the organic light-emitting device 10 may further include a p-dopant. When the hole transport region 3 further includes a p-dopant, the hole transport region 3 may have a matrix (for example, at least one of the compounds represented by Formulae 201 to 205) and a p-dopant included in the matrix. The p-dopant may be uniformly or non-uniformly doped in the hole transport region 3.

In an embodiment, the LUMO energy level of the p-dopant may be about −3.5 eV or less.

The p-dopant may include at least one of a quinone derivative, a metal oxide, a cyano group-containing compound, or any combination thereof, but embodiments of the present disclosure are not limited thereto.

In an embodiment, the p-dopant may include at least one of:

a quinone derivative, such as tetracyanoquinodimethane (TCNQ),2,3,5,6-tetrafluoro-7,7,8,8-tetracyanoquinodimethane (F4-TCNQ), and F6-TCNNQ;

a metal oxide, such as tungsten oxide or molybdenum oxide;

1,4,5,8,9,12-hexaazatriphenylene-hexacarbonitrile (HAT-CN);

a compound represented by Formula 221;

or any combination thereof, but embodiments of the present disclosure are not limited thereto:

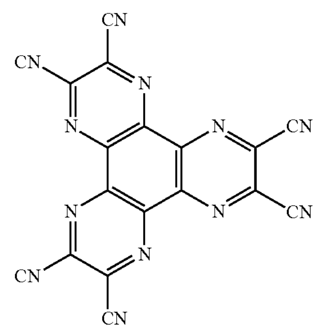

HAT-CN

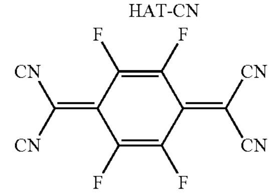

F4-TCNQ

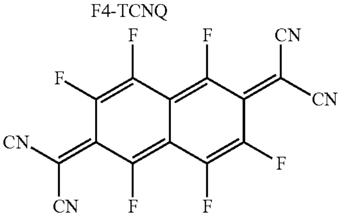

F6-TCNNQ

Formula 221

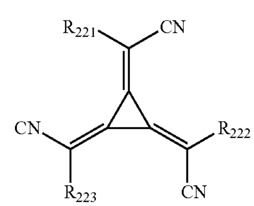

wherein, in Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{221}$ to $R_{223}$ may have at least one cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, a $C_1$-$C_{20}$ alkyl group substituted with —I, or any combination thereof.

A thickness of the hole transport region 3 may be in a range of about 100 Å to about 10,000 Å, for example about 100 Å to about 5,000 Å. In addition, a thickness of the hole injection layer 31 among the layers constituting the hole transport region 3 is not particularly limited, but may be, for example, about 30 Å or more and about 1,000 Å or less. A thickness of the hole transport layer 32 is not particularly limited, but may be about 30 Å or more and about 1,000 Å or less. A thickness of the electron blocking layer 33 is not particularly limited, but may be about 10 Å or more and about 1,000 Å or less. In addition, a thickness of the hole buffer layer is not particularly limited as long as it exhibits the function of the hole buffer layer and does not interfere with the function as an organic light-emitting device. When the thicknesses of the hole transport region 3, the hole injection layer 31, the hole transport layer 32, and the electron blocking layer 33 are within these ranges, satisfactory hole transporting characteristics may be obtained without a substantial increase in driving voltage.

Although a film-forming method of the hole transport region 3 and each layer constituting the hole transport region 3 is not particularly limited, for example, a vacuum deposition method, a spin coating method, an LB method, an inkjet printing method, a laser printing method, a laser thermal transfer method, or the like may be used.

Electron Transport Region 5

In the organic light-emitting device 10, the electron transport region 5 may be arranged between the emission layer 4 and the second electrode 5.

The electron transport region 5 may have a single-layered structure or a multi-layered structure.

For example, the electron transport region 5 may have an electron transport layer, an electron transport layer/electron injection layer structure, a buffer layer/electron transport layer structure, a hole blocking layer/electron transport layer structure, a buffer layer/electron transport layer/electron injection layer structure, or a hole blocking layer/electron transport layer/electron injection layer structure, but embodiments of the present disclosure are not limited thereto. The electron transport region 5 may further include an electron control layer.

The electron transport region 5 may include an electron-transporting material known in the art.

The electron transport region 5 (for example, a buffer layer, a hole blocking layer, an electron control layer, or an electron transport layer in the electron transport region) may include a metal-free compound containing at least one π electron-deficient nitrogen-containing cyclic group. The π electron-deficient nitrogen-containing cyclic group may be the same as described above.

In an embodiment, the electron transport region 5 may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$ (s) in the number of xe11, $R_{601}$ (s) in the number of xe21, or any combination thereof may include the π electron-deficient nitrogen-containing cyclic group.

In an embodiment, $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, —$P(=O)(Q_{31})(Q_{32})$, or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$ (*s*) may be linked to each other via a single bond.

In one or more embodiments, $Ar_{601}$ in Formula 601 may be an anthracene group.

In one or more embodiments, the compound represented by Formula 601 may be represented by Formula 601-1:

Formula 601-1

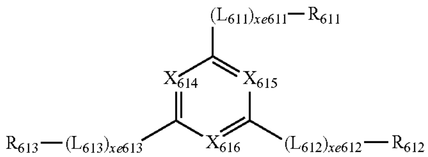

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof; or $—S(=O)_2(Q_{601})$ or $—P(=O)(Q_{601})(Q_{602})$, and $Q_{601}$ and $Q_{602}$ may each be the same as described above.

The electron transport region 5 may include at least one of Compounds ET1 to ET36, but embodiments of the present disclosure are not limited thereto:

ET1

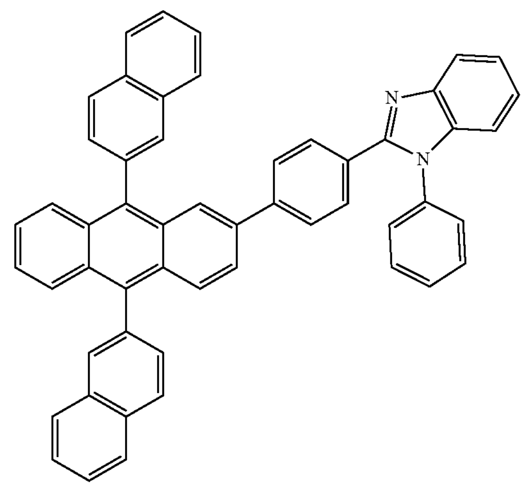

ET2

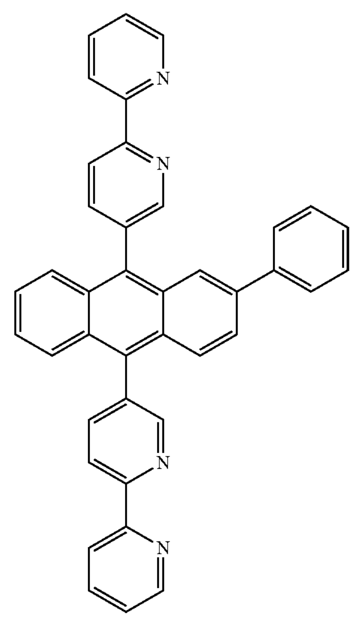

-continued
ET3
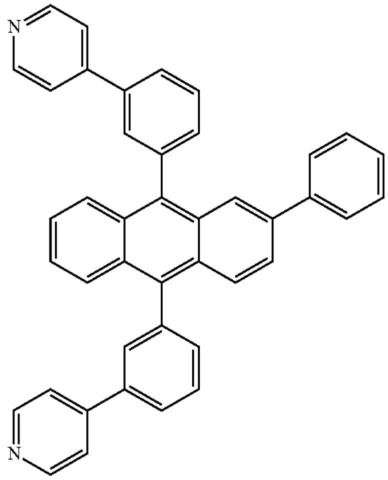
ET4
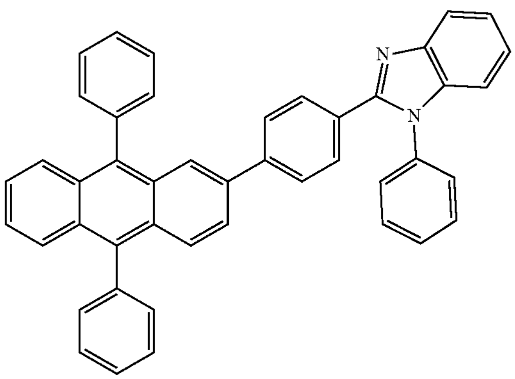
ET5
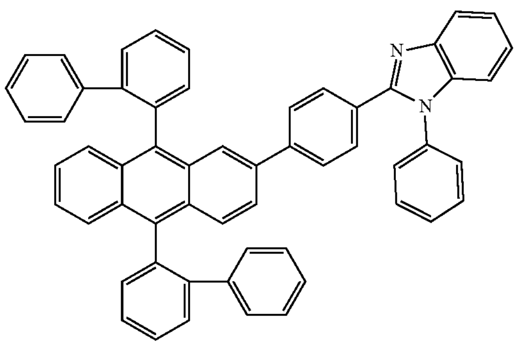
ET6
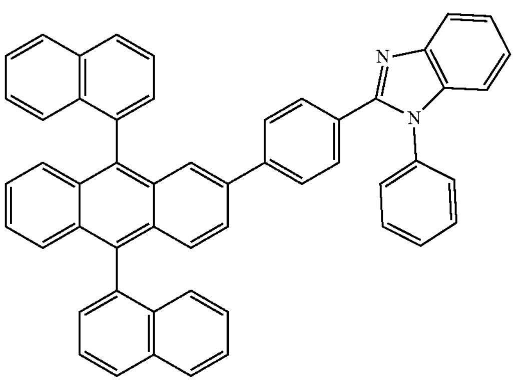
-continued
ET7
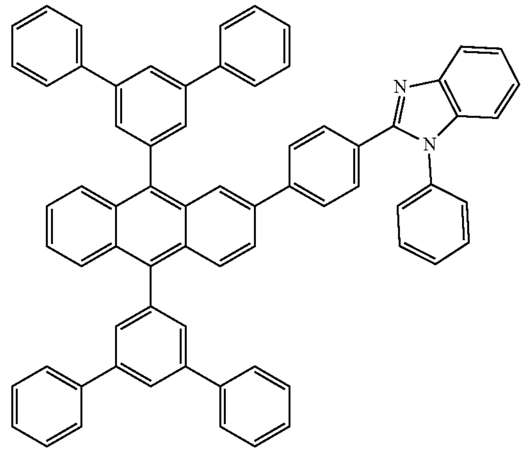
ET8
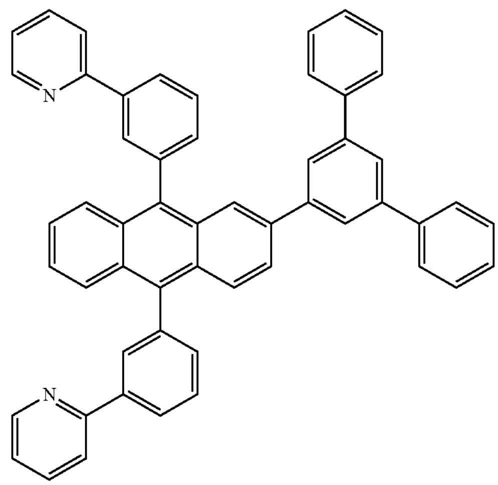
ET9
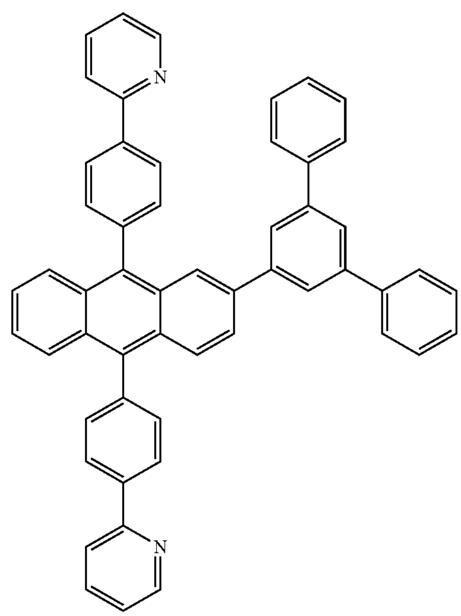

ET10
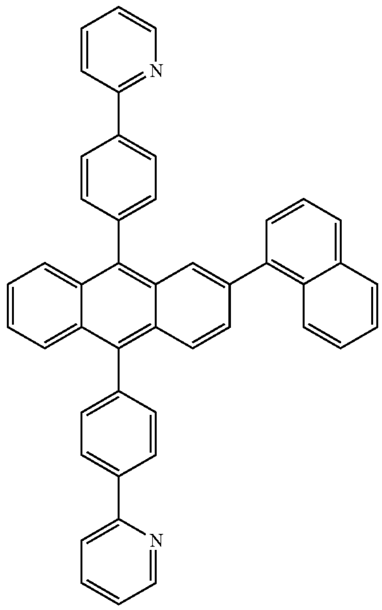
ET11
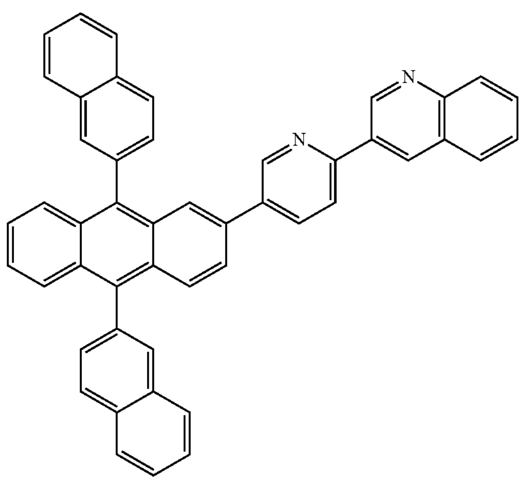
ET12
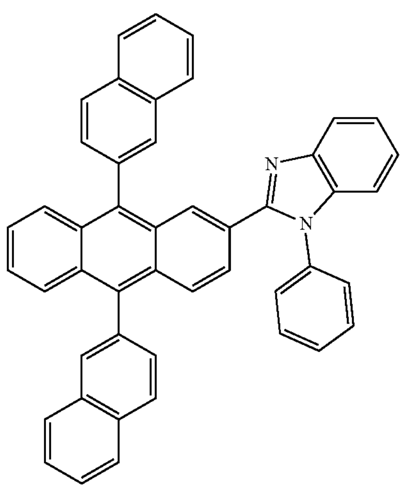
ET13
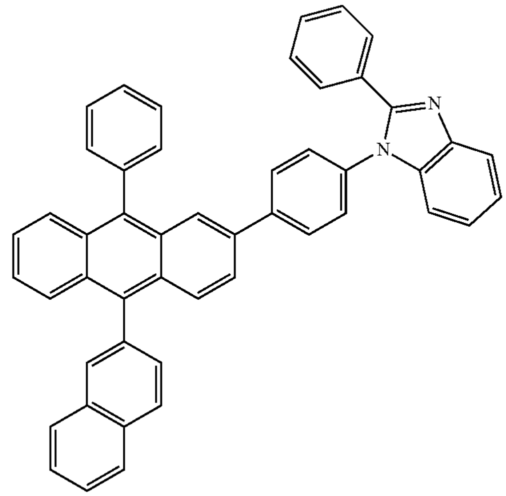
ET14
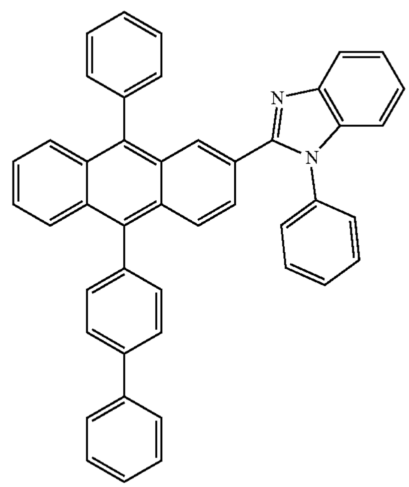
ET15
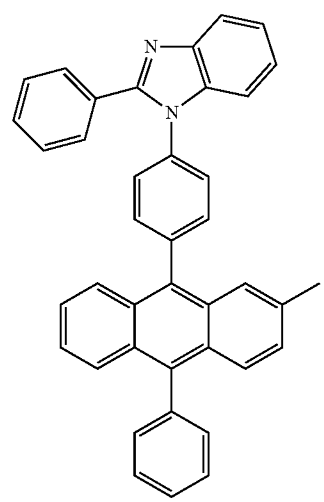

-continued
ET16
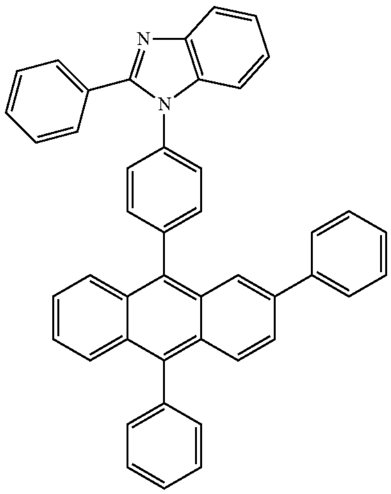
ET17
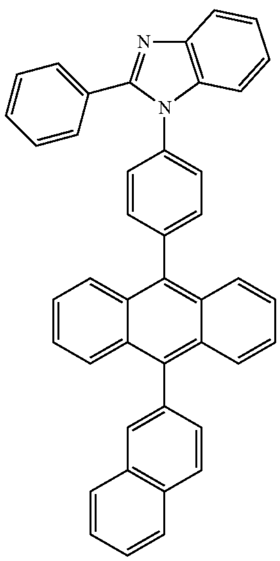
ET18
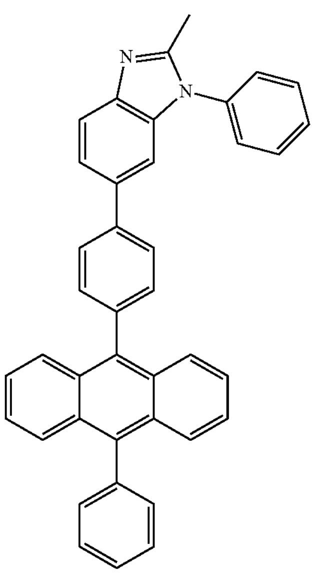
-continued
ET19
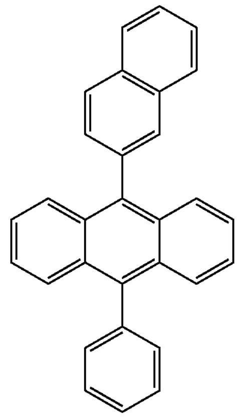
ET20
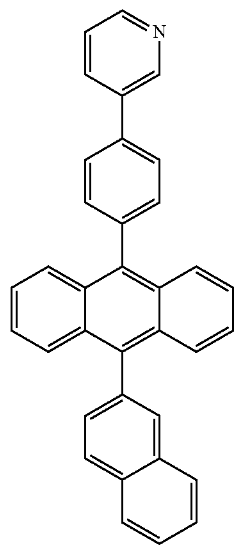
ET21
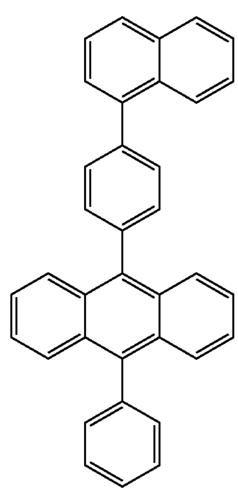

-continued
ET22
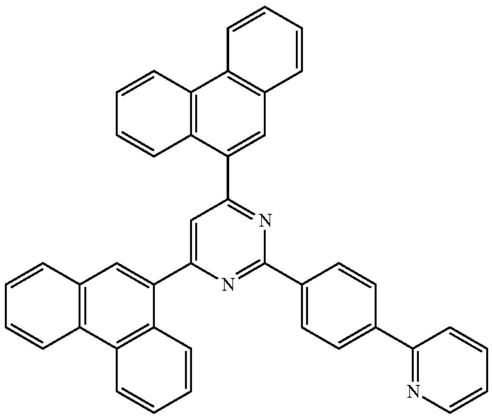
ET23
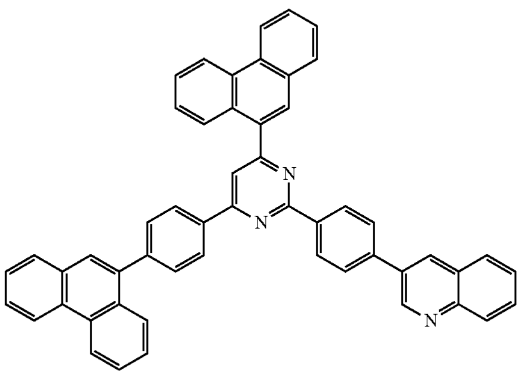
ET24
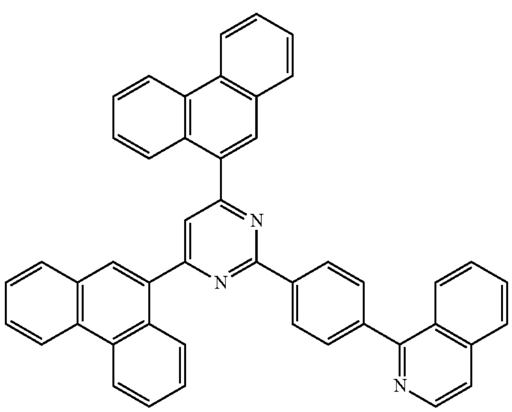
ET25
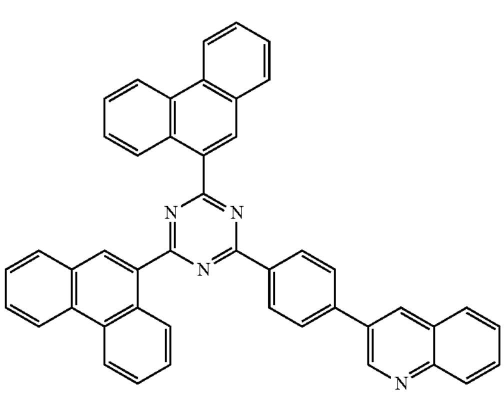
-continued
ET26
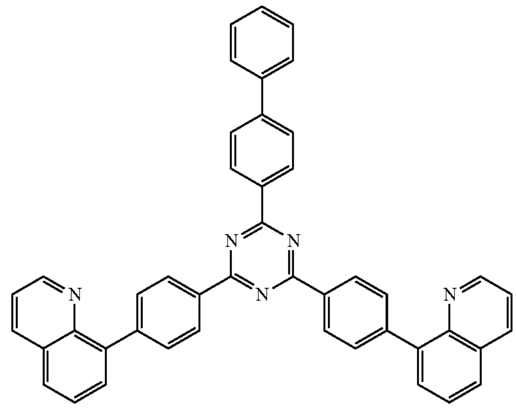
ET27
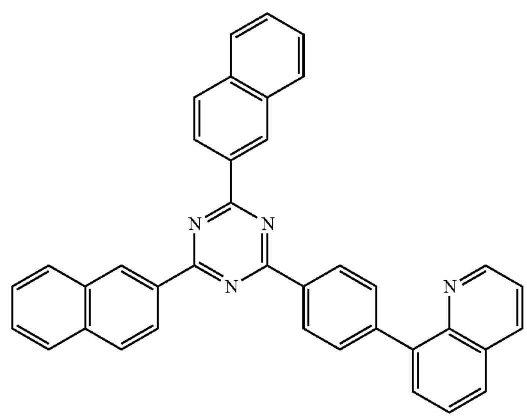
ET28
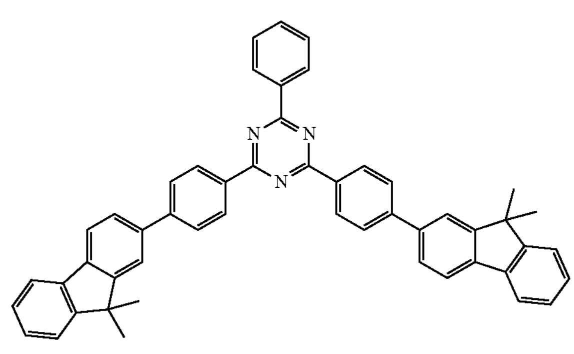

-continued
ET29
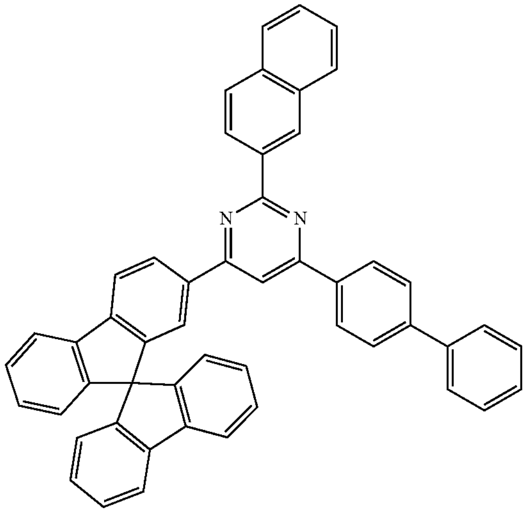
ET30
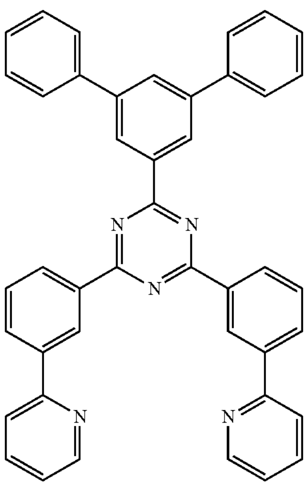
ET31
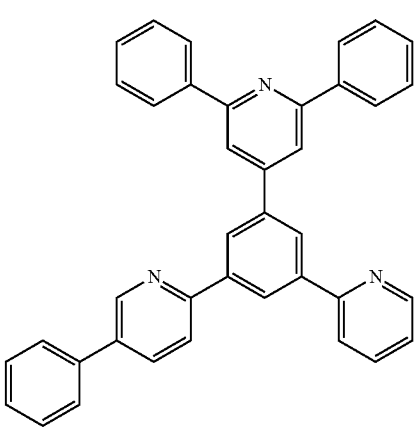
-continued
ET32
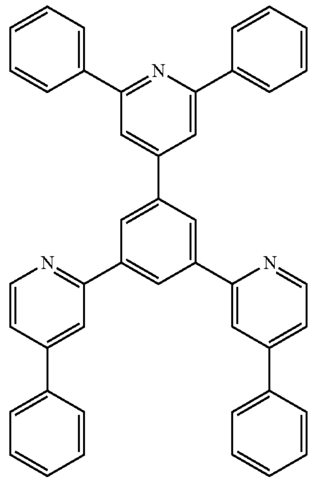
ET33
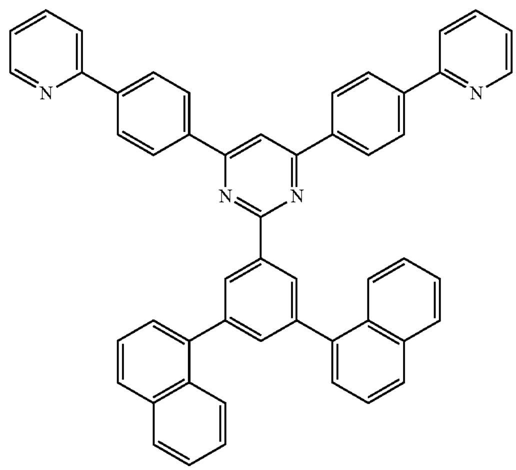
ET34
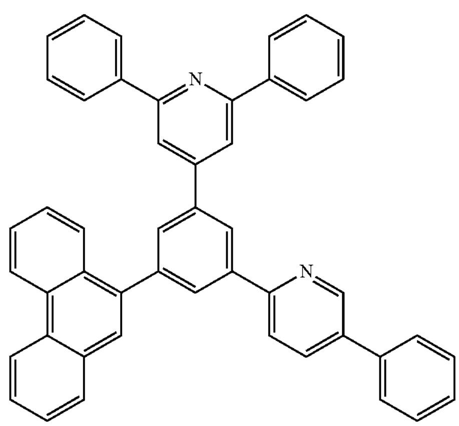

-continued

ET35

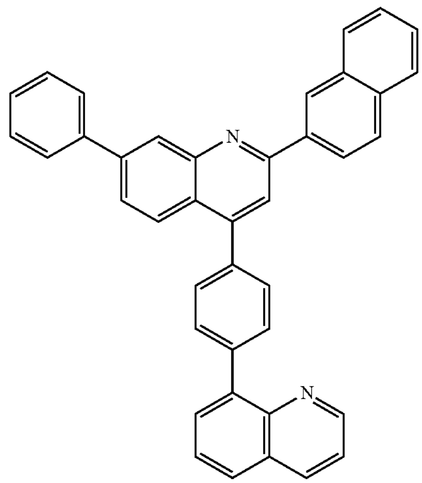

ET36

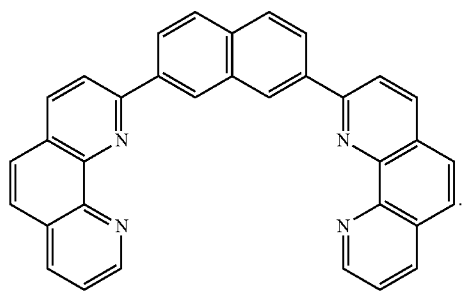

In one or more embodiments, the electron transport region 5 may include at least one of 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-6-(4-ter-butylphenyl)-4-phenyl-4H-1,2,4-triazole (TAZ), NTAZ, or any combination thereof:

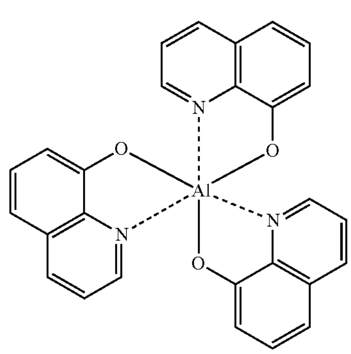

$Alq_3$

-continued

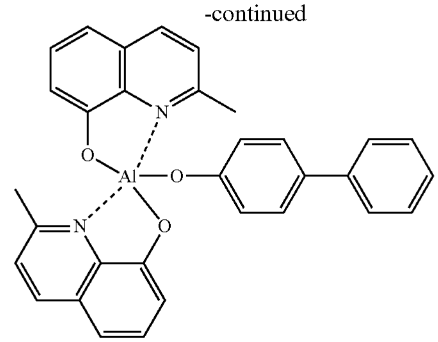

BAlq

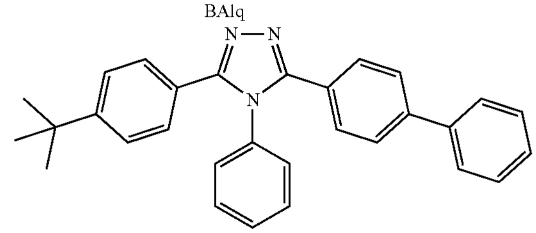

TAZ

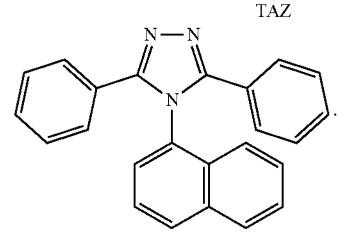

NTAZ

The thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within these ranges, satisfactory electron transporting characteristics may be obtained without a substantial increase in driving voltage.

The electron transport region 5 (for example, the electron transport layer in the electron transport region) may further include, in addition to the materials described above, a metal-containing material.

The metal-containing material may include at least one an alkali metal complex and an alkaline earth-metal complex. The alkali metal complex may include a metal ion a Li ion, a Na ion, a K ion, a Rb ion, and a Cs ion, and the alkaline earth-metal complex may include a metal ion a Be ion, a Mg ion, a Ca ion, a Sr ion, and a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

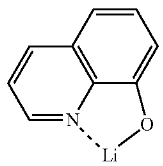

ET-D2

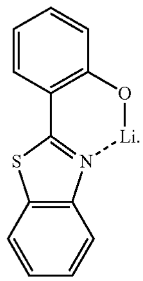

The electron transport region 5 may include an electron injection layer that facilitates the injection of electrons from the second electrode 6. The electron injection layer may directly contact the second electrode 6.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth metal complex, a rare earth metal complex, or any combination thereof.

The alkali metal may be Li, Na, K, Rb, or Cs. In an embodiment, the alkali metal may be Li, Na, or Cs. In one or more embodiments, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be oxides or halides (for example, fluorides, chlorides, bromides, or iodides) of the alkali metal, the alkaline earth-metal, and the rare earth metal.

The alkali metal compound may be an alkali metal oxide, such as $Li_2O$, $Cs_2O$, or $K_2O$, or an alkali metal halide, such as LiF, NaF, CsF, KF, LiI, NaI, CsI, or KI. In an embodiment, the alkali metal compound may be LiF, $Li_2O$, NaF, LiI, NaI, CsI, or KI, but embodiments of the present disclosure are not limited thereto.

The alkaline earth metal compound may be an alkaline earth metal oxide, such as BaO, SrO, CaO, $Ba_xSr_{1-x}O$ ($0<x<1$), or $Ba_xCa_{1-x}O$ ($0<x<1$). In an embodiment, the alkaline earth metal compound may be BaO, SrO, or CaO, but embodiments of the present disclosure are not limited thereto.

The rare earth metal compound may be $YbF_3$, $ScF_3$, $ScO_3$, $Y_2O_3$, $Ce_2O_3$, $GdF_3$, or $TbF_3$. In an embodiment, the rare earth metal compound may be $YbF_3$, $ScF_3$, $TbF_3$, $YbI_3$, $ScI_3$, or $TbI_3$, but embodiments of the present disclosure are not limited thereto.

The alkali metal complex, the alkaline earth-metal complex, and the rare earth metal complex may include an ion of an alkali metal, an alkaline earth-metal, or a rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or any combination thereof, as described above. In one or more embodiments, the electron injection layer may further include an organic material. When the electron injection layer further includes an organic material, an alkali metal, an alkaline earth metal, a rare earth metal, an alkali metal compound, an alkaline earth metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

Second Electrode 6

The second electrode 6 may be arranged on the electron transport region 5. The second electrode 6 may be a cathode which is an electron injection electrode, and in this regard, a material for forming the second electrode 6 may be a metal, an alloy, an electrically conductive compound, or a combination thereof, each having a relatively low work function.

The second electrode 6 may include at least one lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 6 may be a transmissive electrode, a semi-transmissive electrode, or a reflective electrode.

The second electrode 6 may have a single-layered structure having a single layer or a multi-layered structure including a plurality of layers.

A thickness of the second electrode 6 may be about 100 Å or more and about 10,000 Å or less, but is not limited thereto.

In addition, a sealing layer may be further arranged on the second electrode 6. The sealing layer is not particularly limited, and for example, may include α-NPD, NPB, TPD, m-MTDATA, $Alq_3$, CuPc, N4, N4, N4', N4'-tetra(phenyl-4- yl) biphenyl-4,4'-diamine (TPD15), 4,4',4"-tri-9-carbazole triphenylamine (TCTA), N,N'-bis(naphthalene-1-yl), or any combination thereof.

Hereinbefore, the organic light-emitting device 10 has been described with reference to FIG. 1, but embodiments of the present disclosure are not limited thereto.

Figure 2:
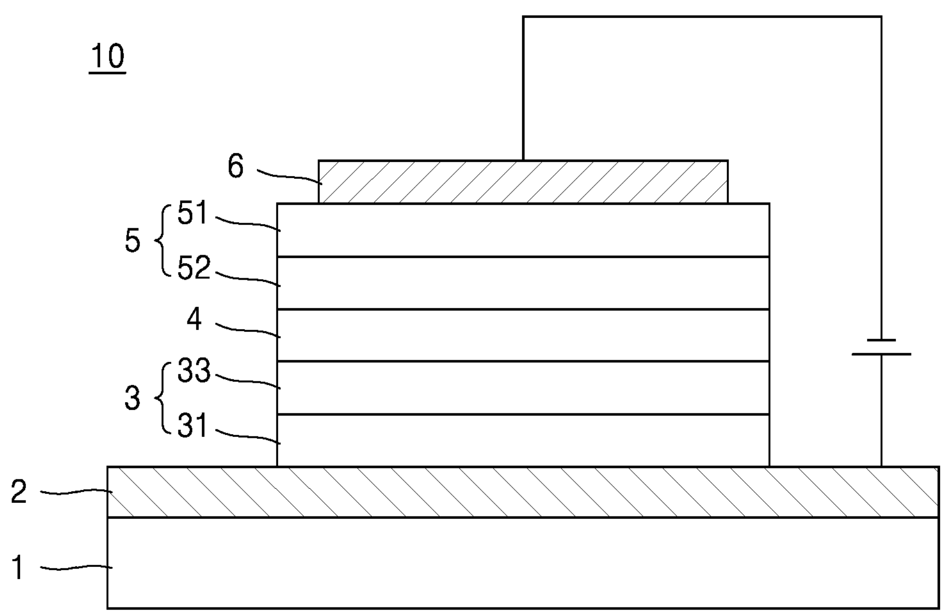
FIG. 2 is a schematic view of an organic light-emitting apparatus according to another exemplary embodiment of the present disclosure.
Figure 3:
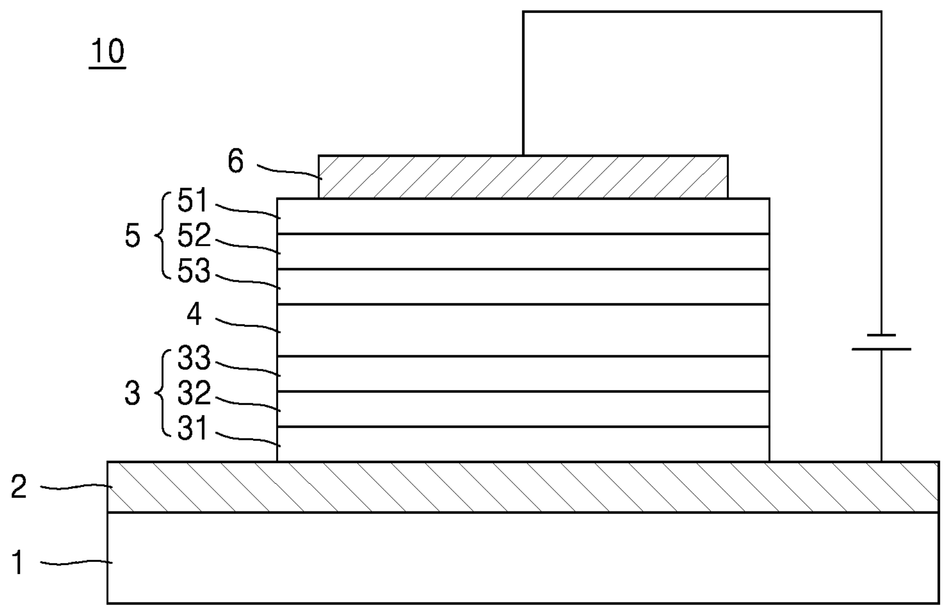
FIG. 3 is a schematic view of an organic light-emitting apparatus according to another exemplary embodiment of the present disclosure.

Descriptions of FIGS. 2 and 3

FIG. 2 is a schematic cross-sectional view of an organic light-emitting device 10 according to another exemplary embodiment of the present disclosure. In the organic light-emitting device 10, the substrate 1, the first electrode 2, the hole transport region 3, the emission layer 4, the electron transport region 5, and the second electrode 6 are sequentially stacked, and the hole transport region 3 has a structure in which a hole injection layer 31 and a hole transport layer 32 are sequentially stacked. In addition, the electron transport region 5 has a structure in which an electron transport layer 52 and an electron injection layer 51 are sequentially stacked.

FIG. 3 is a schematic cross-sectional view of an organic light-emitting device 10 according to another embodiment of the present disclosure. In the organic light-emitting device 10, the substrate 1, the first electrode 2, the hole transport region 3, the emission layer 4, the electron transport region 5, and the second electrode 6 are sequentially stacked, and the hole transport region 3 has a structure in which a hole injection layer 31 and a hole transport layer 32 are sequentially stacked. In addition, the electron transport region 5 has a structure in which a hole blocking layer 53, an electron transport layer 52 and an electron injection layer 51 are sequentially stacked.

Figure 4:
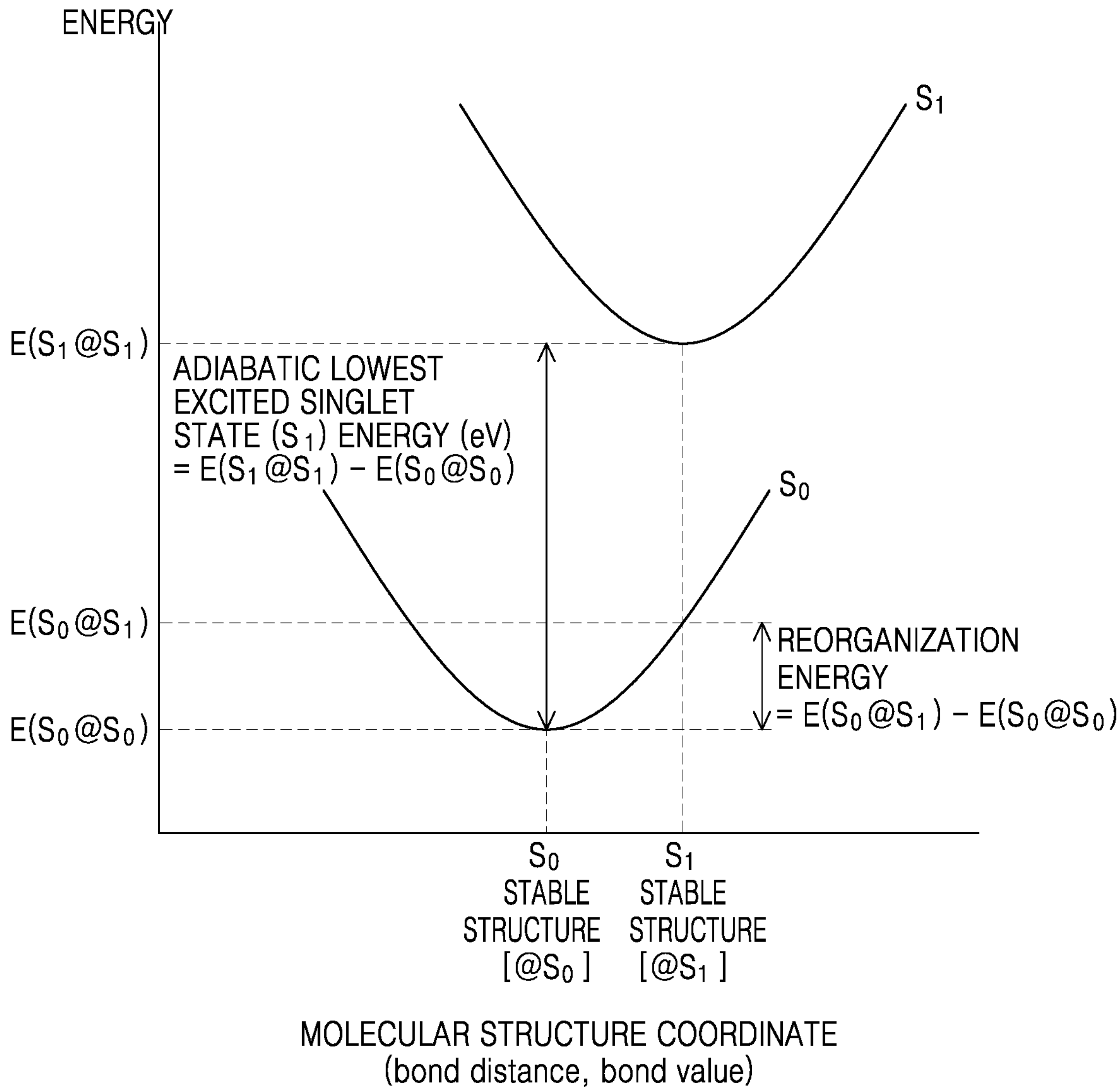
FIG. 4 is a diagram qualitatively explaining the relationship of respective energies.

Description of FIG. 4

FIG. 4 is a diagram qualitatively explaining the relationship of respective energies.

The reorganization energy (ER) refers to the difference between the ground state energy [$E(S_0@S_1)$] (eV) of a compound having a stable structure in an excited singlet state ($S_1$) and the ground state energy of a compound having a stable structure in a ground state ($S_0$) [$E(S_0@S_0)$].

The adiabatic excited singlet state ($S_1$) energy refers to the difference between the lowest excited singlet ($S_1$) energy [$E(S_1@S_1)$] of a compound having a stable structure in an excited singlet state ($S_1$) and the ground state ($S_0$) energy [$E(S_0@S_0)$] of a compound having a stable structure in a ground state ($S_0$).

Figure 5:
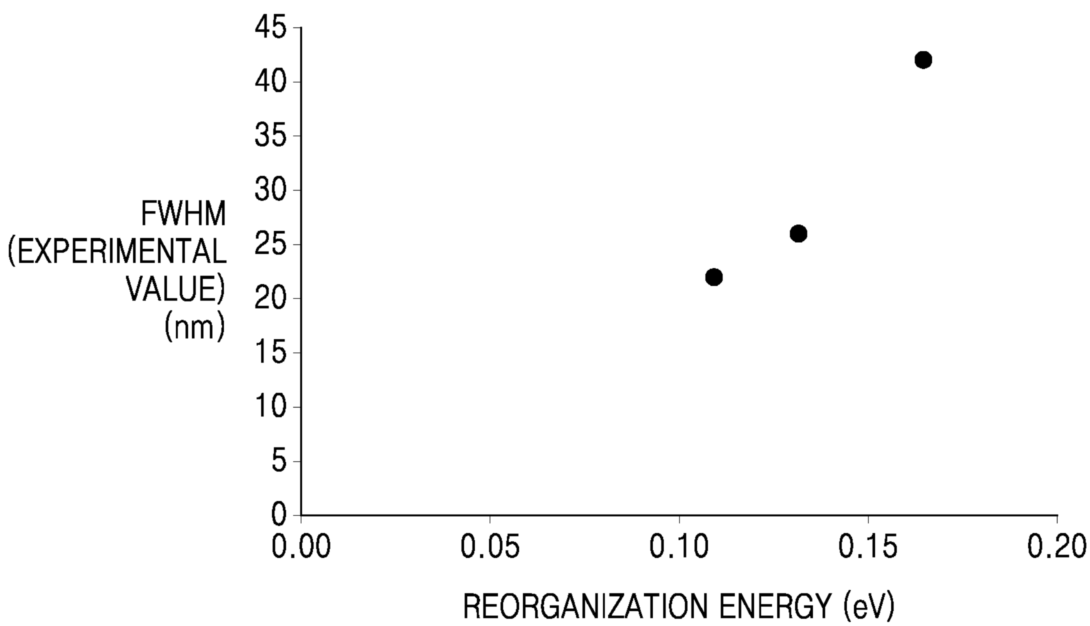
FIG. 5 is a graph showing reorganization energy (eV), calculated by a fluorescence FWHM-density function method, of photoluminescence (PL) experimentally measured from the condensed cyclic compounds R1 to R3.

Description of FIG. 5

FIG. 5 is a graph showing the reorganization energy (eV) calculated by a fluorescence FWHM-density function method of PL experimentally measured in condensed cyclic compounds $R_1$ to $R_3$. Referring to FIG. 5, it is confirmed that, regarding the reorganization energy (eV) calculated by DFT and the FWHM of the fluorescence, the FWHM of the fluorescence decreases as the reorganization energy (eV) decreases. That is, a narrowed width of the fluorescence spectrum is confirmed.

Electronic Apparatus

The organic light-emitting device 10 may be included in various electronic apparatuses.

Such an electronic apparatus may further include a thin-film transistor in addition to the organic light-emitting device 10 as described above. The thin-film transistor may include a source electrode, a drain electrode, and an activation layer, wherein any one of the source electrode and the drain electrode may be electrically connected to any one of the first electrode 2 and the second electrode 6 of the organic light-emitting device 10.

Definitions of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom of N, O, P, Si, S, B, Se, Ge, or any combination thereof as a ring-forming atom and 1 to 10 carbon atoms, and non-limiting examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, S, B, Se, Ge, or any combination thereof as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom of N, O, P, Si, S, B, Se, Ge, or any combination thereof as a ring-forming atom, and 1 to 60 carbon atoms. The term "$C_1$-$C_{60}$ heteroarylene group" as used herein refers to a divalent group having a carbocyclic aromatic system that has at least one heteroatom of N, O, P, Si, S, B, Se, Ge, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group in which two or more rings are condensed with each other, only carbon is used as a ring-forming atom (for example, the number of carbon atoms may be 8 to 60), and the whole molecule is a non-aromaticity group. An example of the monovalent non-aromatic condensed polycyclic group includes a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, a heteroatom N, O, P, Si, and S, other than carbon atoms (for example, having 1 to 60 carbon atoms), as a ring-forming atom, and no aromaticity in its entire molecular structure. An example of the monovalent non-aromatic condensed heteropolycyclic group includes a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group, and may be a monovalent, divalent, trivalent, tetravalent, pentavalent, or hexavalent group, depending on the formula structure.

The term "$C_1$-$C_{30}$ heterocyclic group" as used herein refers to a saturated or unsaturated cyclic group having, as a ring-forming atom, at least one heteroatom N, O, Si, P, S, B, Se, Ge, or any combination thereof other than 1 to 30 carbon atoms. The $C_1$-$C_{30}$ heterocyclic group may be a monocyclic group or a polycyclic group, and may be a monovalent, divalent, trivalent, tetravalent, pentavalent, or hexavalent group, depending on the formula structure.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

At least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof; or $—N(Q_{31})(Q_{32})$, $—Si(Q_{33})(Q_{34})(Q_{35})$, $—B(Q_{36})(Q_{37})$, or $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The term "room temperature" as used herein refers to a temperature of about 25° C.

The terms "a biphenyl group, a terphenyl group, and a tetraphenyl group" as used herein respectively refer to monovalent groups in which two, three, or four phenyl groups which are linked together via a single bond.

The terms "a cyano-containing phenyl group, a cyano-containing biphenyl group, a cyano-containing terphenyl group, and a cyano-containing tetraphenyl group" as used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and "the cyano-containing phenyl group, the cyano-containing biphenyl group, the cyano-containing terphenyl group, and the cyano-containing tetraphenyl group" may further include substituents other than a cyano group. For example, a phenyl group substituted with a cyano group and a phenyl group substituted with a cyano group and a methyl group may all belong to "a cyano-containing phenyl group".

Hereinafter, a compound and an organic light-emitting device according to embodiments of the present disclosure are described in detail with reference to Synthesis Example and Examples. However, the present disclosure is not limited thereto. The wording "'B' was used instead of 'A'" as used in describing Synthesis Examples means that an amount of 'A' used was identical to an amount of 'B' used, in terms of a molar equivalent.

EXAMPLES

Synthesis Example 1: Synthesis of Compound 2

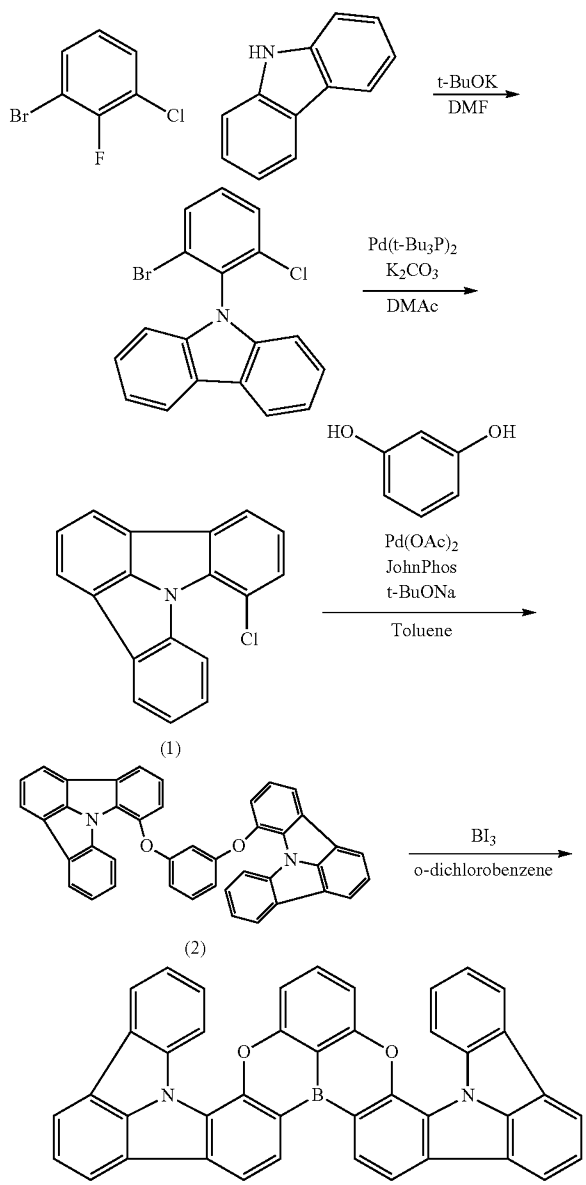

Synthesis of Intermediate (1)

Intermediate (1) was synthesized according to the synthesis methods described in paragraphs to in the patent application WO 2017/142310.

Synthesis of Intermediate (2)

In a three-neck flask, Intermediate (1) (1.0 equiv.), resorcinol (0.5 equiv.), palladium acetate ($Pd(OAc)_3$, 0.02 equiv.), (2-phenyl)di-tert-butylphosphine (JohnPhos, 0.04 equiv.), and tert-butoxy sodium (tBuONa, 2.0 equiv.) were stirred with a toluene solvent to react under an inert atmosphere at a temperature of 100° C. The reaction solution thus obtained was cooled to room temperature, and the filtrate obtained by celite filtration was concentrated. Then, the resultant product was purified by silica gel column chromatography, so as to obtain Intermediate (2).

Synthesis of Compound 2

In a three-neck flask, Intermediate (2) (1.0 equiv.) was stirred with an o-dichlorobenzene solvent under an inert atmosphere. Subsequently, boron triiodide ($BI_3$, 4.0 equiv.) was added to the mixed solution and stirred again at a temperature of 180° C. to react. After completion of the reaction, an extraction process was performed thereon by using dichloromethane and water, and the organic layer thus obtained was distilled. The resultant product thus obtained was purified by column chromatography, so as to obtain Compound 2.

Synthesis Example 2: Synthesis of Compound 14

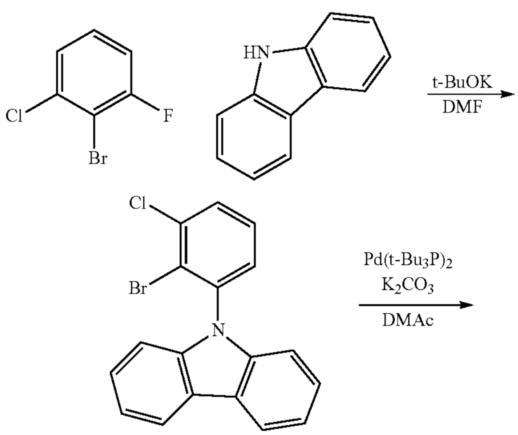

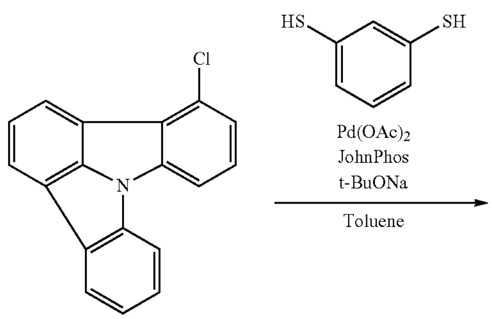

(3)

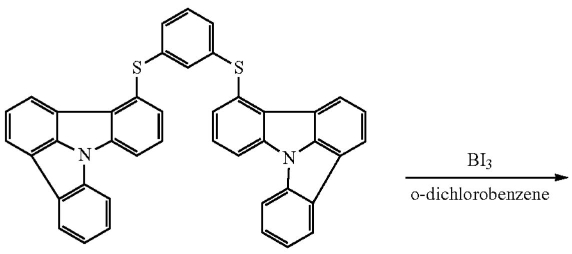

(4)

-continued

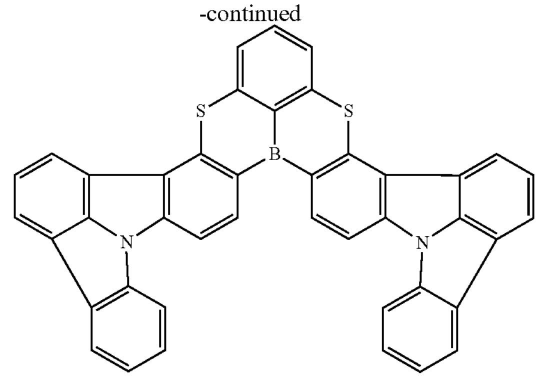

14

Synthesis of Intermediate (3)

Intermediate (3) was synthesized according to the synthesis methods described in paragraphs to in the patent application WO2017/142310.

Synthesis of Intermediate (4)

Intermediate (4) was synthesized and obtained in the same manner as in the synthesis of Intermediate (2), except that Intermediate (3) was used instead of Intermediate (1) and 1,3-benzenethiol was used instead of resorcinol.

Synthesis of Compound 14

Compound 14 was synthesized and obtained in the same manner as in the synthesis of Compound 2, except that Intermediate (4) was used instead of Intermediate (2).

Synthesis Example 3: Synthesis of Compound 97

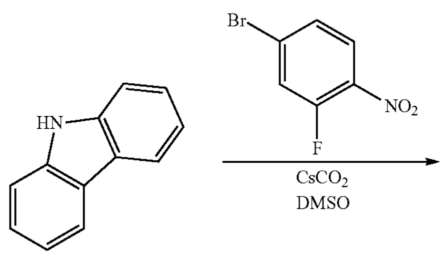

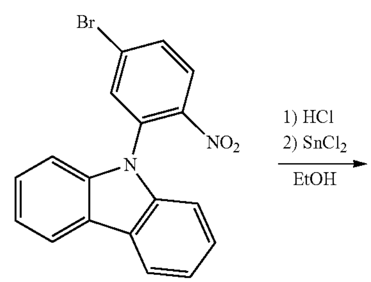

A-1

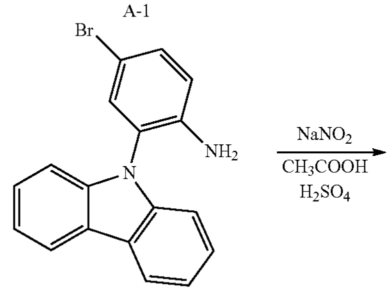

A-2

-continued

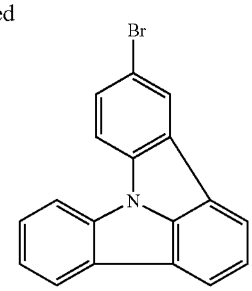

(5)

Synthesis of A-1

In a reaction vessel, carbazole (1.0 equiv.), 4-bromo-2-fluorobenzene (1.0 equiv.), and a dimethyl sulfoxide solvent were added. Then, cesium carbonate (1.2 equiv.) was added to the mixed solution and stirred again at room temperature under a nitrogen atmosphere to react. After completion of the reaction, water was added to the resultant solution, and an extraction process was performed thereon by using chloroform. The organic layer thus obtained was then washed with water. The resultant organic layer was dried with magnesium sulfate, concentrated, and recrystallized with chloroform/hexane, so as to obtain A-1.

Synthesis of A-2

In a reaction vessel, A-1 (1.0 equiv.) and an ethanol solvent were added, and then, hydrochloric acid was added thereto to provide acidity. Next, tin chloride (II) (3.0 equiv.) was gradually added to the reaction mixture and stirred at a temperature of 70° C. to react. After completion of the reaction, the reaction solution was concentrated at room temperature under reduced pressure to obtain a residue. An aqueous sodium hydroxide solution was added to the residue to adjust the suspension, and stirred at room temperature to produce a solid. Subsequently, the solid thus obtained was removed by filtration, and the filtrate was diluted with toluene. An aqueous sodium hydroxide solution was added thereto to perform separation, and the resultant organic layer was dried with magnesium sulfate. Afterwards, the organic layer was concentrated and recrystallized with toluene/hexane, so as to obtain A-2.

Synthesis of Intermediate (5)

In a reaction vessel, A-2 (1.0 equiv.), acetic acid, and concentrated sulfuric acid (volume ratio of 10:1, 4.5 equiv. of sulfuric acid) were added. Then, the reaction vessel was put in an ice water bath under a nitrogen atmosphere to cool the reaction solution to 10° C. Subsequently, sodium nitrite (1.02 equiv.) dissolved in water was added dropwise to the reaction solution for 15 minutes. Afterwards, the resultant solution was stirred at a temperature of 130° C. After completion of the reaction, the reaction solution was allowed to cool, and water was added thereto to precipitate a solid. The precipitated solid was removed by filtration, and the filtered solid was washed by suspending in methanol and filtering. Afterwards, the resultant solid was purified by silica gel column chromatography and recrystallized with chloroform/ethanol, so as to obtain Intermediate (5).

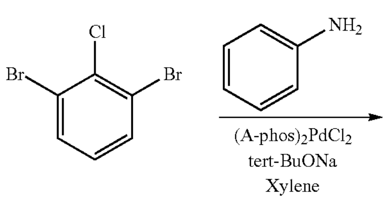

-continued

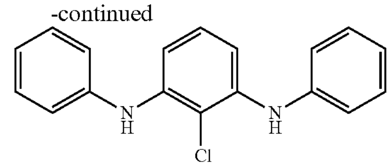

(6)

Synthesis of Intermediate (6)

In a reaction vessel, 1,3-dibromo-2-chlorobenzene (1.0 equiv.), aniline (2.0 equiv.), and sodium-tert-butoxide (2.5 equiv.) were stirred with a xylene solvent.

Then, butyldichloro bis[di-tert-butyl (p-dimethyl amino-phenyl)phosphino]palladium (II) (0.01 equiv.) was added to the mixture thus obtained, and the resultant mixture was stirred at a temperature of 140° C. under a nitrogen atmosphere to react. After completion of the reaction, the reaction solution was allowed to cool, and then, diluted with toluene and filtered through Celite to obtain the filtrate. The filtrate was concentrated and purified by column chromatography, so as to obtain Intermediate (6).

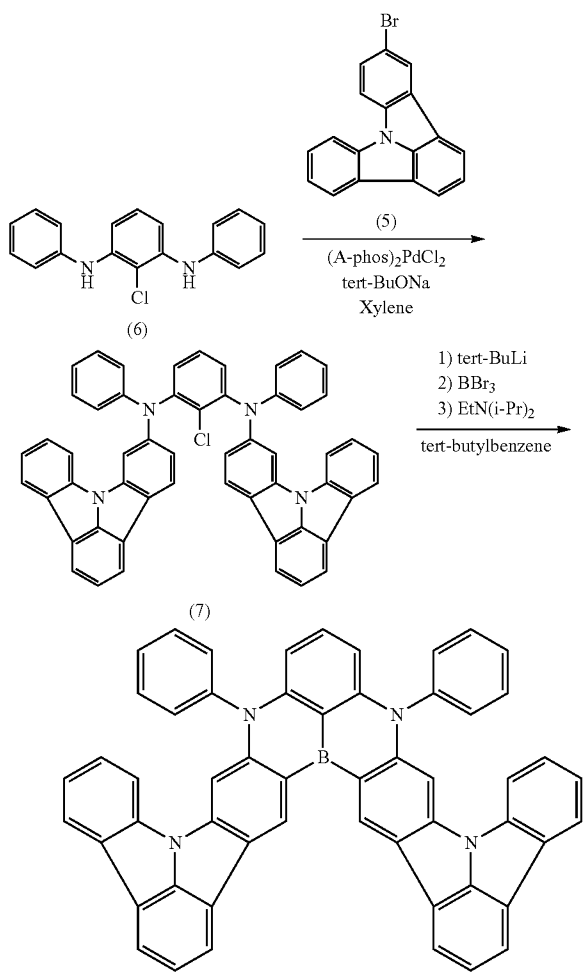

97

Synthesis of Intermediate (7)

In a reaction vessel, Intermediate (6) (1.0 equiv.), Intermediate (5) (2.0 equiv.), and sodium-tert-butoxide (2.5 equiv.) were stirred with a xylene solvent. Then, butyldichlorobis[di-tert-butyl (p-dimethyl aminophenyl)phosphino]palladium (II) (0.01 equiv.) was added to the mixture thus obtained, and the resultant mixture was stirred at a temperature of 140° C. under a nitrogen atmosphere to react. After completion of the reaction, the reaction solution was allowed to cool, and then, diluted with toluene and filtered through Celite to obtain the filtrate. The filtrate was concentrated and purified by column chromatography, so as to obtain Intermediate (7).

Synthesis of Compound 97

In a reaction vessel, Intermediate (7) (1.0 equiv.) was stirred with a tert-butylbenzene solvent. Under a nitrogen atmosphere, a 1.6 M tert-butyl lithium pentane solution (1.2 equiv.) was added dropwise to the reaction solution at a temperature of −30° C. Subsequently, the reaction solution was stirred at a temperature of 60° C. for 2 hours, and boron tribromide (1.2 equiv.) refrigerated to a temperature of −30° C. was added thereto and stirred again at room temperature for 30 minutes. Afterwards, N,N-diisopropyl ethylamine (2.0 equiv.) refrigerated to a temperature of 0° C. was added to the reaction solution. Then, the reaction was stirred at a temperature of 120° C. and was allowed to cool to room temperature. Next, an aqueous sodium acetate solution and ethyl acetate were added to the reaction solution, and the organic layer was separated therefrom. The organic layer was concentrated and purified by column chromatography, so as to obtain Compound 97.

Synthesis Example 4: Synthesis of Compound 100

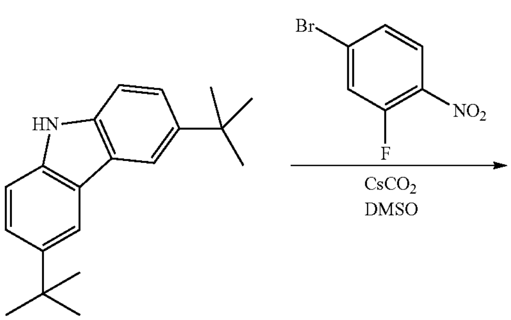

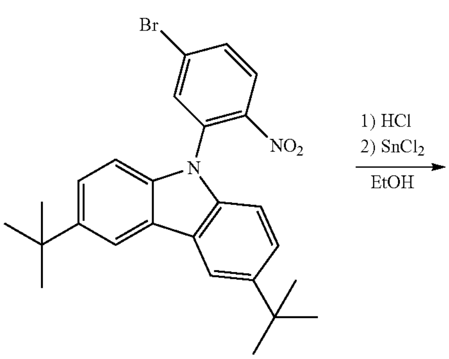

B-1

-continued

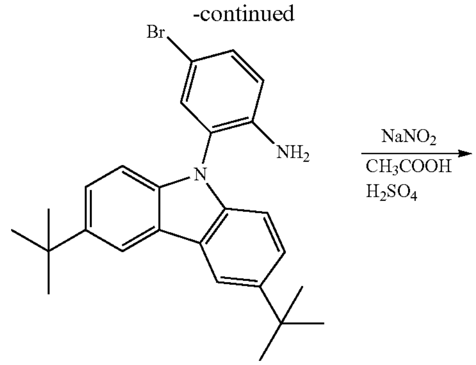

B-2

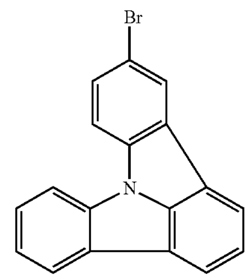

(8)

Synthesis of B-1

B-1 was obtained in the same manner as in the synthesis of A-1, except that 3,6-di-tert-butylcarbazole was used instead of carbazole as a starting raw material.

Synthesis of B-2

B-2 was obtained in the same manner as in the synthesis of A-2, except that B-1 was used instead of A-1 as a starting raw material.

Synthesis of Intermediate (8)

Intermediate (8) was obtained in the same manner as in the synthesis of Intermediate (5), except that B-2 was used instead of A-2 as a starting raw material.

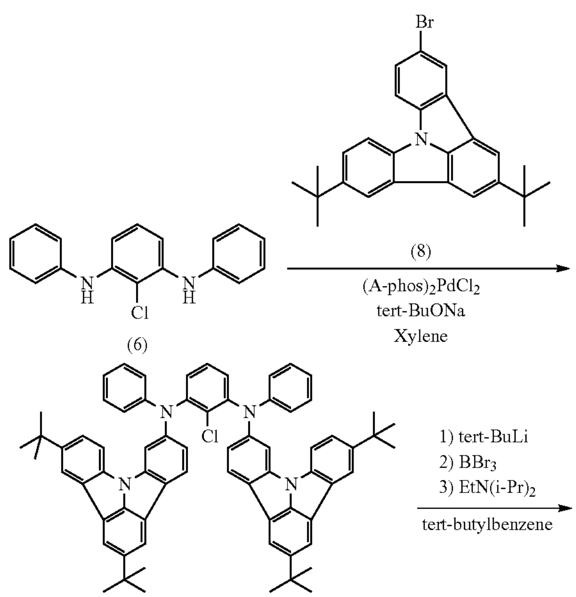

(9)

-continued

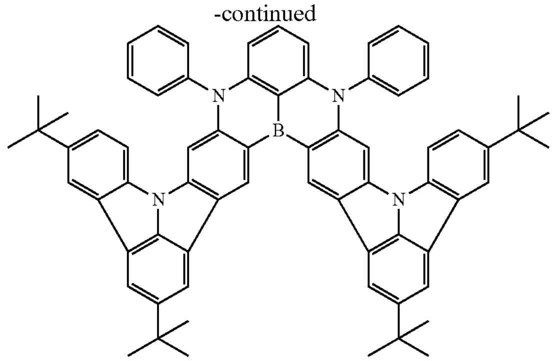

100

Synthesis of Intermediate (9)

Intermediate (9) was obtained in the same manner as in the synthesis of Intermediate (7), except that Intermediate (8) was used instead of Intermediate (5) as a starting raw material.

Synthesis of Compound 100

Compound 100 was obtained in the same manner as in the synthesis of Compound 97, except that Intermediate (9) was used instead of Intermediate (7) as a starting raw material.

Synthesis Example 5: Synthesis of Compound 101

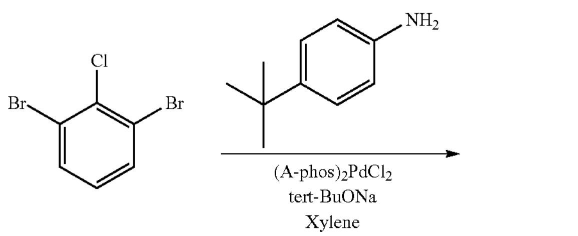

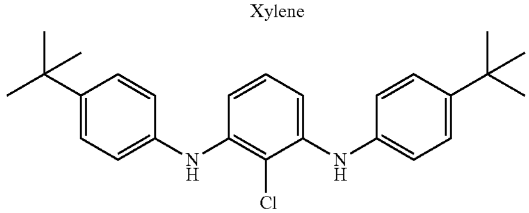

(10)

Synthesis of Intermediate (10)

Intermediate (10) was obtained in the same manner as in the synthesis of Intermediate (6), except that 4-tert-butylamine was used instead of aniline as a starting raw material.

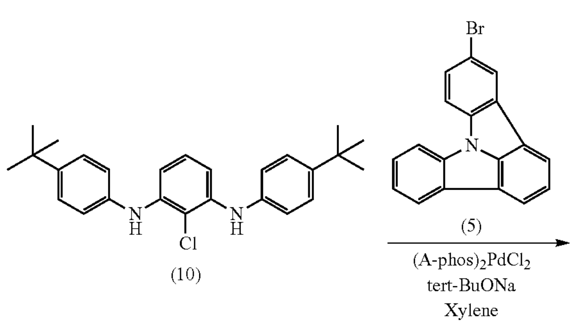

-continued

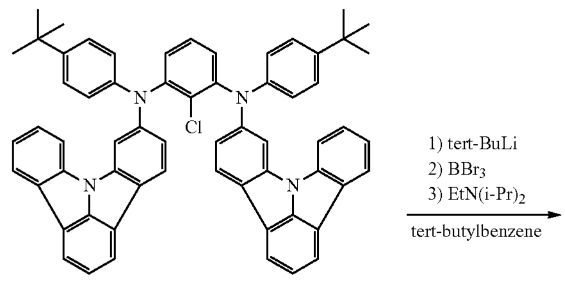

(11)

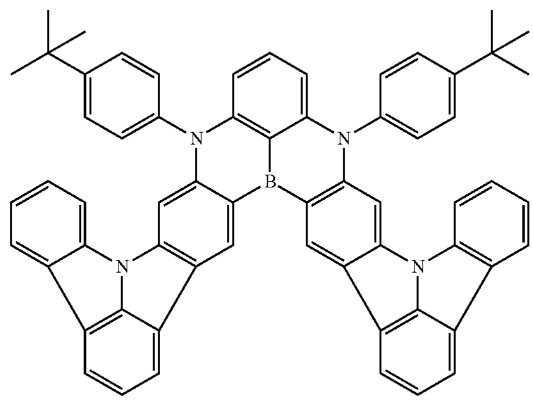

101

Synthesis of Intermediate (11)

Intermediate (11) was obtained in the same manner as in the synthesis of Intermediate (7), except that Intermediate (10) was used instead of Intermediate (6) as a starting raw material.

Synthesis of Compound 101

Compound 101 was obtained in the same manner as in the synthesis of Compound 97, except that Intermediate (11) was used instead of Intermediate (7) as a starting raw material.

Synthesis Example 6: Synthesis of Compound 201

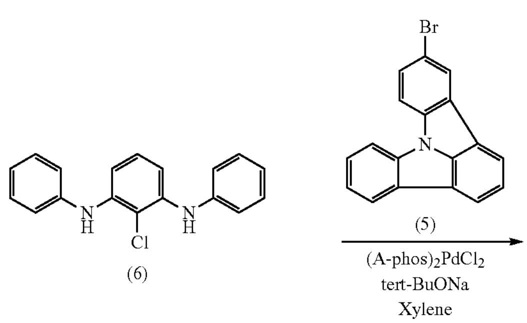

-continued

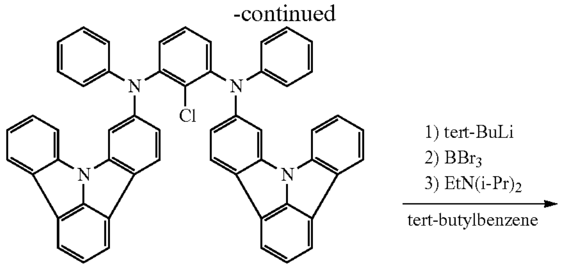

(7)

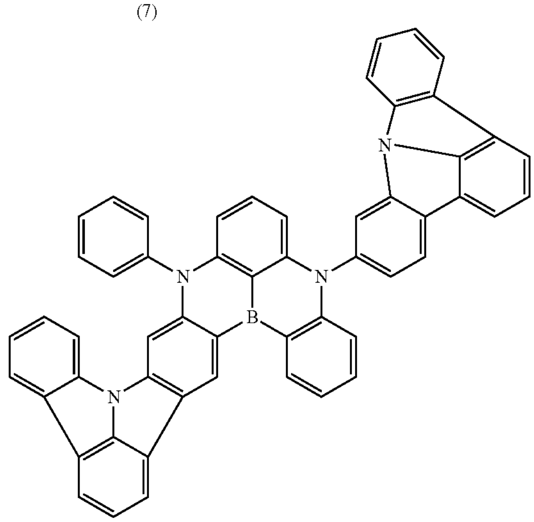

201

In the same manner as in the synthesis of Compound 97 of Synthesis Example 3, a process of first recrystallization, column chromatography, and second recrystallization was performed for separation and purification from Compound 97, so as to obtain Compound 201.

Synthesis Example 7: Synthesis of Compound 202

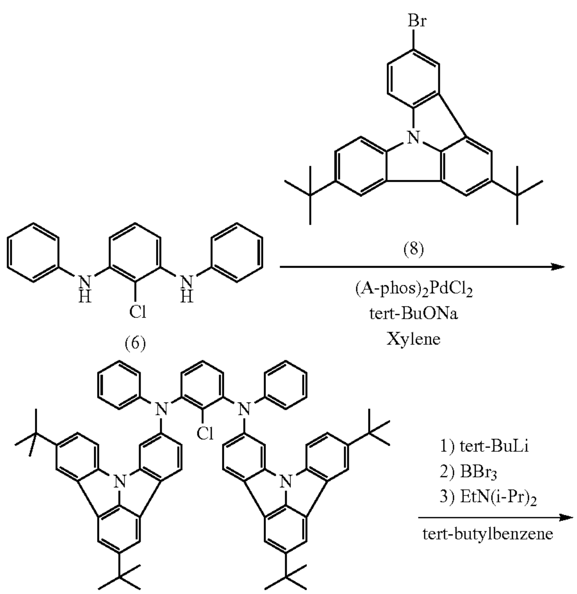

(9)

-continued

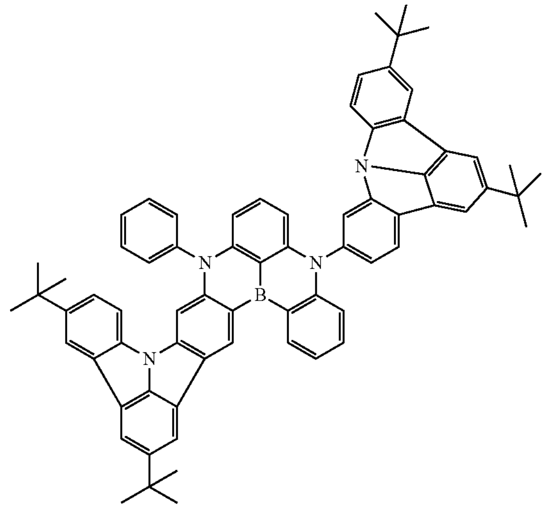

202

In the same manner as in the synthesis of Compound 100 of Synthesis Example 4, a process of first recrystallization, column chromatography, and second recrystallization was performed for separation and purification from Compound 100, so as to obtain Compound 202.

Synthesis Example 8: Synthesis of Compound 203

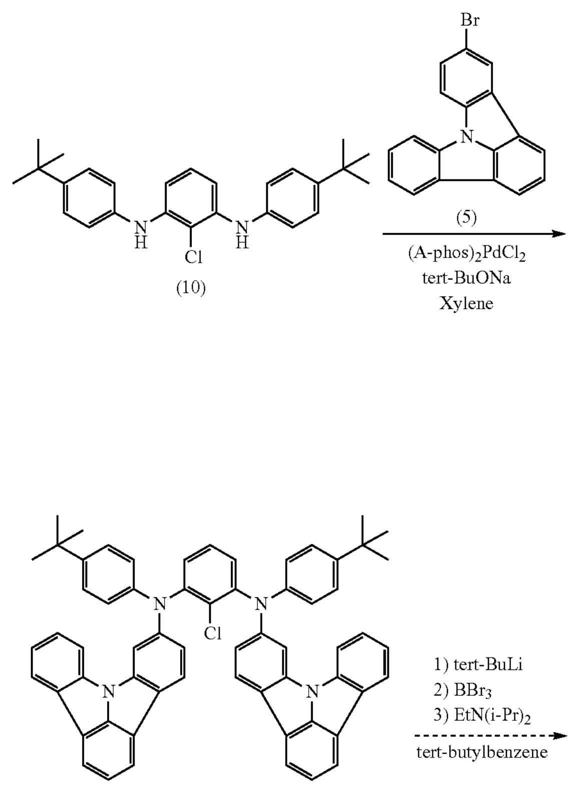

(11)

-continued

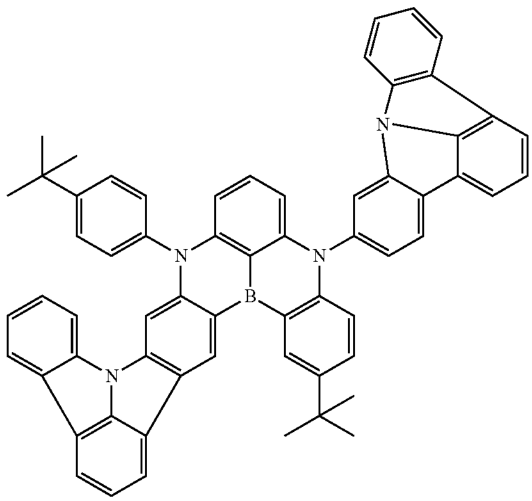

203

In the same manner as in the synthesis of Compound 101 of Synthesis Example 5, a process of first recrystallization, column chromatography, and second recrystallization was performed for separation and purification from Compound 101, so as to obtain Compound 203.

Synthesis Example 9: Synthesis of Compound 301

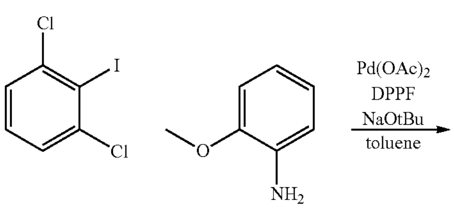

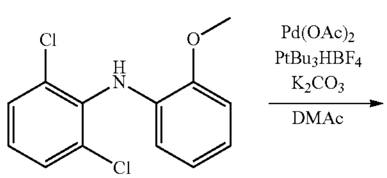

D-1

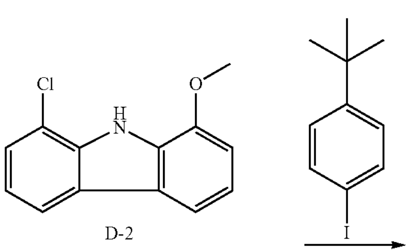

D-2

-continued

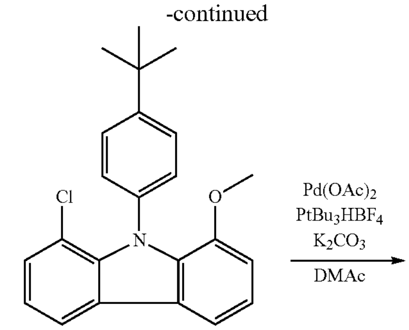

D-3

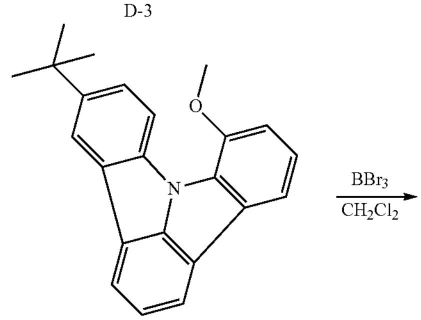

D-4

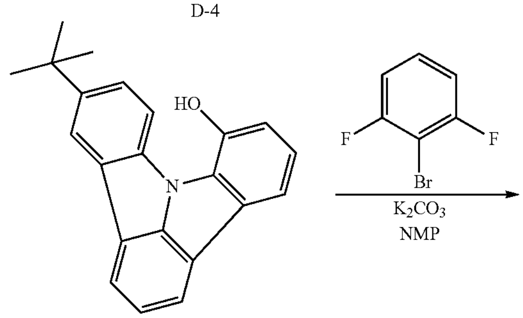

D-5

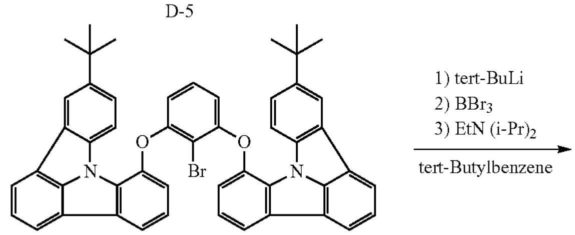

D-6

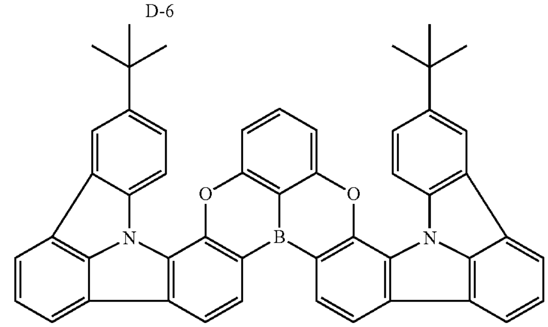

301

Synthesis of D-1

In a reaction vessel, 1,3-dichloro-2-iodobenzene (1.0 equiv.), o-anisidine (0.95 equiv.), sodium tert-butoxide (1.5 equiv.), 1,1'-bis(diphenylphosphino) ferrocene (0.05 equiv.), and palladium acetate (0.05 equiv.) were added and dissolved with toluene. The mixed solution was stirred at a temperature of 100° C. for 12 hours under a nitrogen atmosphere, and then filtered through Celite. Water was added to the filtrate to perform separation, and the organic layer thus obtained was concentrated. Afterwards, through purification by silica gel column chromatography, D-1 (yield: 40%) was obtained.

Synthesis of D-2

In a reaction vessel, D-1 (1.0 equiv.), palladium acetate (0.05 equiv.), tri-tert-butyl phosphonium tetrafluoroborate (0.1 equiv.), and potassium carbonate (2.0 equiv.) were added and dissolved with N,N-dimethylacetamide. The mixed solution was stirred for 6 hours under a nitrogen atmosphere, and then filtered through Celite. Then, water and ethyl acetate were added to the filtrate to perform separation, and the organic layer thus obtained was concentrated. Afterwards, through purification by silica gel column chromatography, D-2 (yield: 85%) was obtained.

Synthesis of D-3

In a reaction vessel, D-2 (1.0 equiv.), 1-tert-butyl-4-iodobenzene (2.0 equiv.), copper iodide (0.1 equiv.), trans-1,2-cyclohexanediamine (0.2 equiv.), and potassium triphosphate (2.0 equiv.) were added and dissolved with 1,4-dioxane. Water was added to the mixed solution to perform separation, and the organic layer thus obtained was concentrated. Afterwards, through purification by silica gel column chromatography, D-3 (yield: 80%) was obtained.

Synthesis of D-4

In a reaction vessel, D-3 (1.0 equiv.), palladium acetate (0.05 equiv.), tri-tert-butyl phosphonium tetrafluoroborate (0.1 equiv.), and potassium carbonate (2.0 equiv.) were added and dissolved with N,N-dimethylacetamide. The mixed solution was stirred for 6 hours under a nitrogen atmosphere, and then filtered through Celite. Then, water and ethyl acetate were added to the filtrate to perform separation, and the organic layer thus obtained was concentrated. Afterwards, through purification by silica gel column chromatography, D-4 (yield: 85%) was obtained.

Synthesis of D-5

In a reaction vessel, D-4 (1.0 equiv.) was added and dissolved with dichloromethane. The reaction vessel was put in an ice bath, and boron tribromide (2.0 equiv.) diluted with dichloromethane was added dropwise thereto. After returning the temperature of the reaction solution to room temperature, the reaction solution was stirred for 2 hours. 2N hydrochloric acid was added to the resultant reaction solution and stirred again for 30 minutes. Afterwards, the organic layer obtained by a separation process was obtained and concentrated, so as to obtain D-5 (yield: 85%).

Synthesis of D-6

In a reaction vessel, D-5 (1.0 equiv.), 1-bromo-2,6-difluorobenzene (0.45 equiv.), and potassium carbonate (2.0 equiv.) were added and dissolved with N-methyl pyrrolidone. Under a nitrogen atmosphere, the mixed solution was stirred at a temperature of 140° C. for 12 hours. After raising the temperature to 160° C., the reaction solution was stirred for 12 hours. After completion of the reaction, water was added to the resultant reaction solution, and the precipitated solid thus obtained was filtered. Then, through purification by silica gel chromatography, D-6 (yield: 85%) was obtained.

Synthesis of Compound 301

In a reaction vessel, D-6 (1.0 equiv.) and tert-butylbenzene were added and stirred. Under a nitrogen atmosphere, a 1.6 M tert-butyl lithium pentane solution (2.0 equiv.) was added dropwise to the reaction solution at a temperature of 0° C. After the resultant solution was stirred at a temperature of 60° C. for 2 hours, the low-boiling point components were distilled under reduced pressure. Boron tribromide (2.0 equiv.) cooled to temperature of −30° C. was added and the resultant solution was stirred at room temperature for 30 minutes. Then, after cooling to a temperature of 0° C., N,N-diisopropyl ethylamine (2.0 equiv.) was added. Next, the resultant solution was heated and stirred at a temperature of 120° C. for 3 hours. Water and methanol were added thereto, and the precipitated solid was filtered. The filtrate was then separated and washed with tetrahydrofuran, so as to obtain Compound 301 (yield: 30%).

$^{1}$H NMR and MS of the synthesized compounds are shown in Table 1 below. Here, Compounds 2, 101, and 301 did not dissolve in a solution so that $^{1}$H NMR thereof could not be obtained. Synthesis methods for compounds other than the compounds shown in Table 1 may be easily recognized by those skilled in the technical field by referring to the synthesis paths and source materials described above.

TABLE 1

| Compound | $^{1}$H NMR ($CDCl_3$, 500 MHz) | MS found | MS calc |
|---|---|---|---|
| 2 | — | 596.76 | 596.17 |
| 100 | 9.87 (s, 2H), 8.40 (s, 2H), 8.20 (s, 2H), 8.16 (s, 2H), 7.88 (t, 4H), 7.79 (t, 2H), 7.59 (d, 4H), 7.53 (d, 2H), 7.33 (m, 3H), 7.16 (s, 2H), 6.29 (d, 2H), 1.65 (s, 18H), 1.47 (s, 18H) | 971.3 | 970.51 |
| 101 | — | 858.54 | 858.39 |
| 202 | 9.70 (s, 1H), 9.20 (d, 1H), 8.49 (d, 1H), 8.31 (d, 2H), 8.28 (s, 1H), 8.24 (s, 1H), 8.19 (s, 1H), 8.14 (s, 1H), 7.97 (s, 1H), 7.85 (t, 2H), 7.78 (t, 1H), 7.71 (d, 1H), 7.54 (m, 5H), 7.41 (m, 2H), 7.30 (m, 2H), 7.14 (s, 1H), 7.00 (d, 1H), 6.35 (d, 1H), 6.26 (d, 1H), 1.67 (s, 18H), 1.47 (s, 9H), 1.45 (s, 9H) | 971.4 | 970.51 |
| 301 | — | 708.75 | 708.29 |

Evaluation Example 1: Relationship Between Reorganization Energy and Fluorescence Spectrum Width (FWHM)

(Calculation by Density Functional Theory (DFT))

The following calculations were performed according to the DFT for the following condensed cyclic compounds R1 to R3.

R1

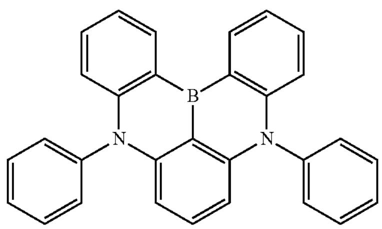

R2

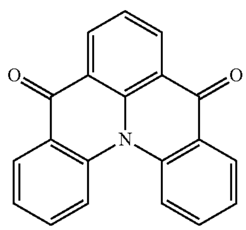

R3

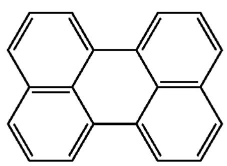

The ground state energy $[E(S_0@S_1)]$ (eV) of the compound having a stable structure in a lowest excited singlet state and the ground state energy $[E(S_0@S_0)]$ (eV) of the compound having a stable structure in a ground state were calculated, and the reorganization energy ($E_R$) corresponding to the difference between the two energy values, that is, $[E(S_0@S_1)]-[E(S_0@S_0)]$, was calculated.

In addition, the lowest excited singlet state energy $[E(S_1@S_1)]$ of the compound having a stable structure in a lowest excited singlet state and the ground state energy $[E(S_0@S_0)]$ of the compound having a stable structure in a ground were calculated, and the adiabatic lowest excited singlet state energy corresponding to the difference between the two energy values, that is, $[E(S_1@S_1)]-[E(S_0@S_0)]$, was calculated.

Then, the fluorescence wavelength (nm) obtained by converting the adiabatic lowest excited singlet state energy (eV) into the light wavelength (nm) was calculated.

In addition, the oscillator strength (f) of the compound having a stable structure in a lowest excited singlet state was calculated.

Also, the highest occupied molecular orbital (HOMO) energy and the lowest unoccupied molecular orbital (LUMO) energy of the compound were calculated.

Here, the calculation by DFT was performed according to the following calculation methods (I), (II), and (III) using a calculation software, Gaussian 16 (Gaussian Inc.):

(I) $S_0$ calculation method: structural optimization calculation by DFT using functional B3LYP basis function 6-31G (d, p) with toluene solvent effects (obtained by PCM);

(II) $S_1$ calculation method: structural optimization calculation by time-dependent DFT (TDDFT) using functional B3LYP basis function 6-31G (d, p) with toluene solvent effects (obtained by PCM); and (III) $S_0$ calculation method: calculation of input structure by DFT using functional B3LYP basis function 6-31G (d, p) with toluene solvent effects (obtained by PCM).

In particular, calculation of each item was performed using the following calculation methods:

Ground state energy $[E(S_0@S_0)]$ of compound having stable structure in ground state: see calculation method (I) above;

Lowest excited singlet state energy $[E(S_1@S_1)]$ of compound having stable structure in first excited singlet state: see calculation method (II) above;

Ground state energy $[E(S_0@S_1)]$ of compound having stable structure in first excited singlet state: see calculation methods (II) and (III) above;

Reorganization energy $([E(S_0@S_1)]-[E(S_0@S_0)]$: see calculation methods (I), (II), and (III) above;

Adiabatic lowest excited singlet state energy $([E(S_1@S_1)]-[E(S_0@S_0)]$: see calculation methods (I) and (II) above;

Fluorescence wavelength (nm): see calculation methods (I) and (II) above;

Oscillator strength (f) of compound having stable structure in first excited singlet state: see calculation method (II) above; and HOMO and LUMO: see calculation method (I) above.

The calculated values according to the calculation methods above are shown in Table 9 below, and a qualitative description of the energy relationship is explained in FIG. 4.

Measurement of Fluorescence Spectrum Width (FWHM)

Measurements were carried out at room temperature with an excitation wavelength of 320 nm for each of $1\times10^{-5}$ M (=mol/dm$^3$, mol/L) toluene solutions of the condensed cyclic compounds R1 to R3 by using a spectrofluorophotometer F7000 manufactured by Hitachi High Technology. As a result, the fluorescence peak wavelength (nm) and the fluorescence spectrum width (FWHM) of photoluminescence (PL) were evaluated, and the evaluation results are shown in Table 2 below.

TABLE 2

| | DFT calculation | | | | | | Experimental measurement | |
|---|---|---|---|---|---|---|---|---|
| Compound | HOMO(eV) | LUMO(eV) | Adiabatic lowest excited singlet state ($S_1$) energy (eV) | Fluorescence wavelength (nm) | Oscillator strength f | Reorganization energy (eV) | Fluorescence peak wavelength (nm) of PL | Fluorescence spectrum width\ (FWHM) |
| R1 | −4.88 | −1.23 | 2.99 | 415 | 0.214 | 0.109 | 453 | 22 |
| R2 | −5.94 | −2.36 | 2.96 | 419 | 0.161 | 0.132 | 451 | 26 |
| R3 | −5.02 | −1.96 | 2.62 | 474 | 0.491 | 0.164 | 445 | 42 |

From Table 2, it was confirmed that the color of the fluorescence wavelength (nm) calculated by the DFT calculation corresponded to the peak wavelength experimentally measured. Therefore, it was accordingly confirmed that the color estimated by the DFT calculation was the same color as the actual color.

In this regard, FIG. 5 shows a graph showing the reorganization energy (eV) calculated by the fluorescence FWHM-DFT of PL that was experimentally measured from the condensed cyclic compounds R1 to R3. Referring to FIG. 5, it was confirmed that, regarding the reorganization energy (eV) calculated by DFT and the fluorescence FWHM, the fluorescence FWHM decreased as the reorganization energy (eV) decreased. That is, the narrowed width of the fluorescence spectrum was confirmed.

Evaluation Example 2: Calculation of Reorganization Energy of Compounds of the Present Disclosure and Compounds of Comparative Examples For Compounds 1 to 102, 201 to 203, 301 to 369, 401 to 413, and 501 to 532 that are the condensed cyclic compounds of the present disclosure, the DFT calculations were performed as described above. In addition, the same calculations were performed for Compounds C1 to C3 of Comparative Examples.

C1

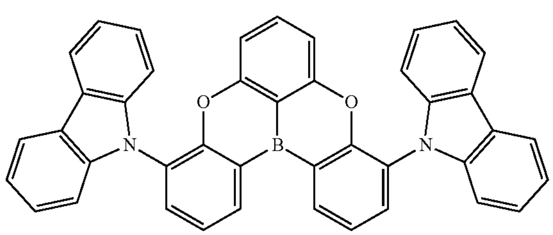

-continued

C2

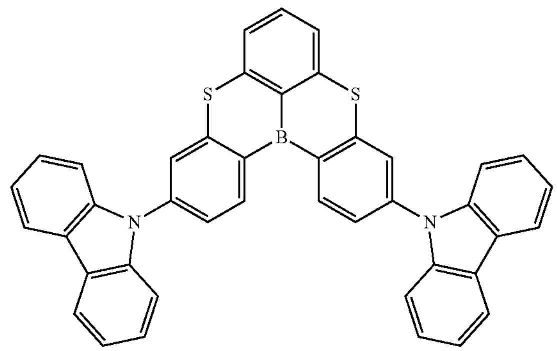

C3

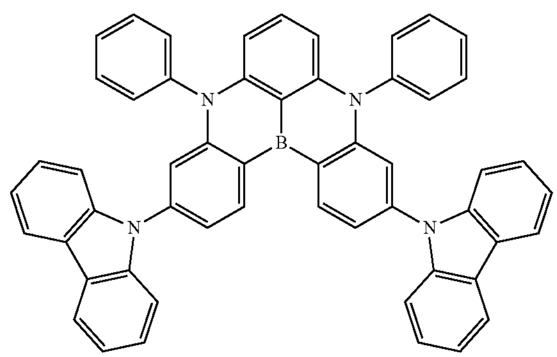

The results of the HOMO (eV), LUMO (eV), adiabatic lowest excited singlet state ($S_1$) energy (eV), fluorescence wavelength (nm), oscillator strength (f), and reorganization energy (eV) calculated with respect to the compounds above are shown through Tables 3 to 9.

TABLE 3

| | | DFT calculation | | | | | |
|---|---|---|---|---|---|---|---|
| | Compound | HOMO(eV) | LUMO(eV) | Adiabatic lowest excited singlet state ($S_1$) energy (eV) | Fluorescence wavelength (nm) | Oscillator strength f | Reorganization energy (eV) |
| Example 1 | 1 | −5.48 | −1.79 | 3.09 | 401 | 1.000 | 0.049 |
| Example 2 | 2 | −5.44 | −2.02 | 2.86 | 434 | 0.400 | 0.058 |

TABLE 3-continued

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 3 | 3 | −5.52 | −1.72 | 3.18 | 389 | 0.379 | 0.068 |
| Example 4 | 4 | −5.34 | −2.05 | 2.75 | 451 | 0.132 | 0.067 |
| Example 5 | 5 | −5.48 | −1.70 | 3.15 | 394 | 0.701 | 0.070 |
| Example 6 | 6 | −5.41 | −1.86 | 2.99 | 415 | 1.345 | 0.047 |
| Example 7 | 7 | −5.37 | −2.08 | 2.75 | 451 | 0.520 | 0.059 |
| Example 8 | 8 | −5.45 | −1.76 | 3.10 | 400 | 0.569 | 0.060 |
| Example 9 | 9 | −5.47 | −1.81 | 3.06 | 405 | 1.211 | 0.047 |
| Example 10 | 10 | −5.42 | −2.05 | 2.82 | 440 | 0.478 | 0.060 |
| Example 11 | 11 | −5.51 | −1.72 | 3.18 | 390 | 0.397 | 0.068 |
| Example 12 | 12 | −5.33 | −2.07 | 2.72 | 455 | 0.136 | 0.065 |
| Example 13 | 13 | −5.48 | −1.71 | 3.13 | 396 | 0.711 | 0.069 |
| Example 14 | 14 | −5.41 | −1.91 | 2.88 | 431 | 0.601 | 0.055 |
| Example 15 | 15 | −5.38 | −2.17 | 2.62 | 472 | 0.330 | 0.067 |
| Example 16 | 16 | −5.40 | −1.89 | 2.88 | 430 | 0.220 | 0.064 |
| Example 17 | 17 | −5.28 | −2.20 | 2.52 | 493 | 0.125 | 0.067 |
| Example 18 | 18 | −5.38 | −1.75 | 2.96 | 418 | 0.404 | 0.067 |
| Example 19 | 19 | −5.35 | −1.94 | 2.76 | 449 | 0.426 | 0.068 |
| Example 20 | 20 | −5.31 | −2.15 | 2.45 | 505 | 0.240 | 0.071 |
| Example 21 | 21 | −5.32 | −1.94 | 2.74 | 452 | 0.165 | 0.072 |
| Example 22 | 22 | −5.22 | −2.22 | 2.41 | 514 | 0.111 | 0.071 |
| Example 23 | 23 | −5.31 | −1.78 | 2.85 | 434 | 0.258 | 0.074 |
| Example 24 | 24 | −5.54 | −1.66 | 3.27 | 379 | 0.987 | 0.053 |
| Example 25 | 25 | −5.55 | −1.80 | 3.14 | 394 | 0.894 | 0.070 |
| Example 26 | 26 | −5.54 | −1.47 | 3.44 | 361 | 0.539 | 0.066 |
| Example 27 | 27 | −5.56 | −1.88 | 3.09 | 401 | 0.836 | 0.065 |
| Example 28 | 28 | −5.57 | −1.85 | 3.15 | 394 | 0.778 | 0.055 |
| Example 29 | 29 | −5.45 | −1.76 | 3.09 | 401 | 0.933 | 0.049 |
| Example 30 | 30 | −5.41 | −1.99 | 2.86 | 434 | 0.377 | 0.059 |
| Example 31 | 31 | −5.47 | −1.67 | 3.18 | 390 | 0.339 | 0.072 |
| Example 32 | 32 | −5.30 | −2.02 | 2.74 | 452 | 0.122 | 0.073 |
| Example 33 | 33 | −5.44 | −1.67 | 3.15 | 394 | 0.667 | 0.068 |
| Example 34 | 34 | −5.36 | −1.73 | 3.05 | 406 | 1.187 | 0.047 |
| Example 35 | 35 | −5.31 | −1.95 | 2.81 | 441 | 0.448 | 0.057 |
| Example 36 | 36 | −5.45 | −1.66 | 3.18 | 389 | 0.342 | 0.070 |
| Example 37 | 37 | −5.23 | −1.99 | 2.72 | 456 | 0.120 | 0.061 |

TABLE 4

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 38 | 38 | −5.39 | −1.63 | 3.14 | 395 | 0.686 | 0.066 |
| Example 39 | 39 | −5.33 | −1.69 | 3.06 | 406 | 1.138 | 0.045 |
| Example 40 | 40 | −5.28 | −1.92 | 2.81 | 441 | 0.426 | 0.057 |
| Example 41 | 41 | −5.41 | −1.61 | 3.18 | 390 | 0.333 | 0.070 |
| Example 42 | 42 | −5.20 | −1.95 | 2.71 | 457 | 0.115 | 0.065 |
| Example 43 | 43 | −5.36 | −1.60 | 3.14 | 395 | 0.668 | 0.064 |
| Example 44 | 44 | −5.50 | −1.66 | 3.25 | 382 | 0.333 | 0.074 |
| Example 45 | 45 | −5.31 | −1.93 | 2.81 | 442 | 0.190 | 0.077 |
| Example 46 | 46 | −5.39 | −1.73 | 3.05 | 406 | 0.234 | 0.072 |
| Example 47 | 47 | −5.23 | −2.03 | 2.64 | 469 | 0.180 | 0.069 |
| Example 48 | 48 | −5.32 | −1.75 | 2.99 | 415 | 0.208 | 0.097 |
| Example 49 | 49 | −5.19 | −2.06 | 2.58 | 481 | 0.173 | 0.070 |
| Example 50 | 50 | −5.45 | −1.65 | 3.20 | 388 | 0.926 | 0.041 |
| Example 51 | 51 | −5.43 | −1.92 | 2.96 | 420 | 0.291 | 0.086 |
| Example 52 | 52 | −5.57 | −1.54 | 3.37 | 368 | 0.456 | 0.063 |
| Example 53 | 53 | −5.42 | −1.93 | 2.95 | 420 | 0.124 | 0.067 |
| Example 54 | 54 | −5.50 | −1.58 | 3.26 | 380 | 0.431 | 0.068 |
| Example 55 | 55 | −5.26 | −2.10 | 2.61 | 475 | 0.353 | 0.051 |

TABLE 4-continued

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 56 | 56 | −5.30 | −1.74 | 2.95 | 420 | 0.266 | 0.049 |
| Example 57 | 57 | −5.23 | −2.07 | 2.60 | 477 | 0.109 | 0.078 |
| Example 58 | 58 | −5.27 | −1.70 | 2.93 | 423 | 0.397 | 0.066 |
| Example 59 | 59 | −5.18 | −1.85 | 2.71 | 458 | 0.501 | 0.089 |
| Example 60 | 60 | −5.16 | −1.79 | 2.78 | 445 | 0.220 | 0.049 |
| Example 61 | 61 | −5.15 | −2.13 | 2.45 | 505 | 0.105 | 0.075 |
| Example 62 | 62 | −5.18 | −1.73 | 2.81 | 442 | 0.352 | 0.062 |
| Example 63 | 63 | −5.28 | −1.81 | 2.86 | 434 | 0.716 | 0.053 |
| Example 64 | 64 | −5.29 | −1.79 | 2.88 | 430 | 0.194 | 0.070 |
| Example 65 | 65 | −5.27 | −1.65 | 2.97 | 418 | 0.402 | 0.065 |
| Example 66 | 66 | −5.23 | −1.84 | 2.78 | 446 | 0.513 | 0.091 |
| Example 67 | 67 | −5.22 | −1.68 | 2.86 | 433 | 0.263 | 0.072 |
| Example 68 | 68 | −5.30 | −2.00 | 2.73 | 454 | 0.203 | 0.075 |
| Example 69 | 69 | −5.22 | −1.65 | 2.97 | 417 | 0.273 | 0.066 |
| Example 70 | 70 | −5.27 | −1.82 | 2.90 | 427 | 0.284 | 0.086 |
| Example 71 | 71 | −5.28 | −1.83 | 2.92 | 425 | 0.105 | 0.065 |
| Example 72 | 72 | −5.18 | −1.60 | 2.93 | 423 | 0.372 | 0.061 |
| Example 73 | 73 | −5.09 | −1.71 | 2.78 | 446 | 0.196 | 0.053 |
| Example 74 | 74 | −5.10 | −1.64 | 2.82 | 440 | 0.322 | 0.057 |

TABLE 5

| | Compound | DFT calculation HOMO (eV) | LUMO (eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 75 | 75 | −5.31 | −1.85 | 2.85 | 434 | 0.764 | 0.054 |
| Example 76 | 76 | −5.34 | −1.83 | 2.88 | 430 | 0.208 | 0.072 |
| Example 77 | 77 | −5.31 | −1.69 | 2.96 | 419 | 0.427 | 0.067 |
| Example 78 | 78 | −5.27 | −1.88 | 2.75 | 451 | 0.550 | 0.068 |
| Example 79 | 79 | −5.26 | −1.73 | 2.85 | 435 | 0.284 | 0.075 |
| Example 80 | 80 | −5.48 | −1.91 | 2.95 | 420 | 0.201 | 0.100 |
| Example 81 | 81 | −5.57 | −1.71 | 3.23 | 384 | 0.465 | 0.090 |
| Example 82 | 82 | −5.40 | −2.05 | 2.79 | 445 | 0.207 | 0.080 |
| Example 83 | 83 | −4.86 | −1.31 | 2.94 | 421 | 0.401 | 0.074 |
| Example 84 | 84 | −4.85 | −1.34 | 2.91 | 427 | 0.614 | 0.084 |
| Example 85 | 85 | −5.32 | −1.87 | 2.84 | 437 | 0.117 | 0.096 |
| Example 86 | 86 | −4.98 | −1.23 | 3.16 | 393 | 0.207 | 0.060 |
| Example 87 | 87 | −4.96 | −1.24 | 3.11 | 399 | 0.449 | 0.087 |
| Example 88 | 88 | −5.25 | −1.89 | 2.76 | 449 | 0.120 | 0.089 |
| Example 89 | 89 | −4.95 | −1.22 | 3.11 | 399 | 0.203 | 0.061 |
| Example 90 | 90 | −4.93 | −1.26 | 3.06 | 405 | 0.439 | 0.095 |
| Example 91 | 91 | −5.54 | −1.52 | 3.43 | 361 | 0.184 | 0.051 |
| Example 92 | 92 | −5.31 | −2.01 | 2.75 | 451 | 0.131 | 0.062 |
| Example 93 | 93 | −5.26 | −2.03 | 2.69 | 461 | 0.127 | 0.063 |
| Example 94 | 94 | −5.39 | −1.57 | 3.23 | 384 | 0.252 | 0.078 |
| Example 95 | 95 | −5.35 | −1.77 | 2.97 | 417 | 0.130 | 0.099 |
| Example 96 | 96 | −4.87 | −1.43 | 2.84 | 437 | 0.820 | 0.054 |
| Example 97 | 97 | −4.85 | −1.36 | 2.89 | 429 | 0.564 | 0.056 |
| Example 98 | 98 | −4.73 | −1.71 | 2.47 | 502 | 0.187 | 0.080 |
| Example 99 | 99 | −4.84 | −1.37 | 2.85 | 435 | 0.667 | 0.065 |
| Example 100 | 100 | −4.71 | −1.18 | 2.85 | 436 | 0.577 | 0.055 |
| Example 101 | 101 | −4.71 | −1.21 | 2.81 | 441 | 0.568 | 0.056 |
| Example 102 | 102 | −4.66 | −1.14 | 2.84 | 437 | 0.592 | 0.055 |
| Comparative Example 1 | C1 | −5.46 | −2.01 | 2.82 | 440 | 0.006 | 0.142 |
| Comparative Example 2 | C2 | −5.47 | −2.15 | 2.73 | 454 | 0.001 | 0.230 |

TABLE 5-continued
| | Compound | DFT calculation HOMO (eV) | LUMO (eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Comparative Example 3 | C3 | −5.07 | −1.52 | 2.90 | 428 | 0.323 | 0.114 |
| Comparative Example 4 | C4 | −5.52 | −1.27 | 3.49 | 355 | 0.032 | 0.191 |
| Comparative Example 5 | C5 | −4.65 | −1.10 | 2.84 | 437 | 0.079 | 0.175 |
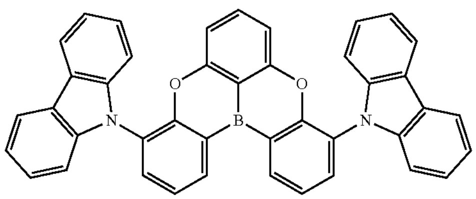
C1
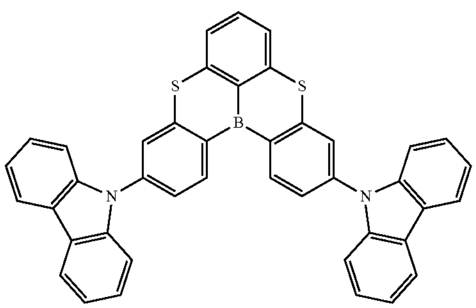
C2
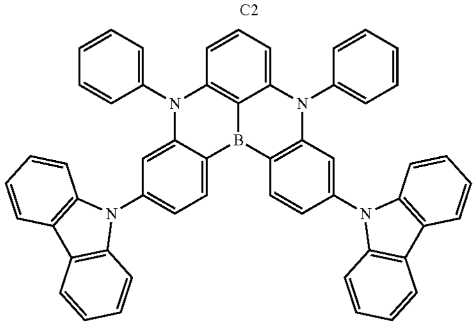
C3
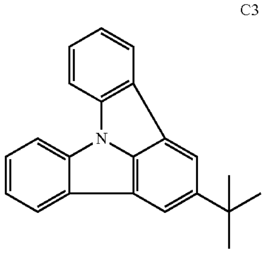
C4

TABLE 5-continued

| Compound | DFT calculation HOMO (eV) | LUMO (eV) | Adiabatic lowest excited singlet state ($S_1$) energy (eV) | Fluorescence wavelength (nm) | Oscillator strength f | Reorganization energy (eV) |
|---|---|---|---|---|---|---|
| 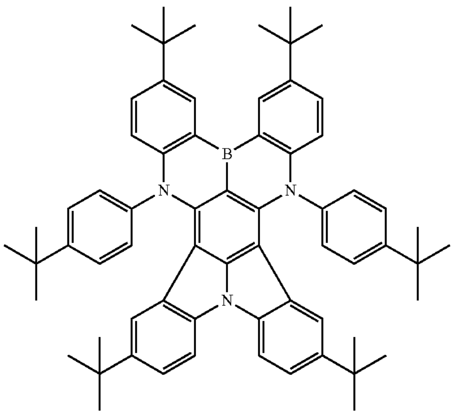 C5 | | | | | | |

TABLE 6

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 103 | 201 | −4.87 | −1.49 | 2.94 | 421 | 0.420 | 0.073 |
| Example 104 | 202 | −4.83 | −1.41 | 2.96 | 420 | 0.403 | 0.061 |
| Example 105 | 203 | −4.81 | −1.47 | 2.92 | 425 | 0.477 | 0.062 |
| Example 106 | 301 | −5.37 | −1.99 | 2.83 | 439 | 0.382 | 0.065 |
| Example 107 | 302 | −5.39 | −2.05 | 2.79 | 445 | 0.385 | 0.080 |
| Example 108 | 303 | −5.44 | −2.06 | 2.83 | 438 | 0.403 | 0.056 |
| Example 109 | 304 | −5.42 | −2.03 | 2.84 | 437 | 0.390 | 0.056 |
| Example 110 | 305 | −5.49 | −1.85 | 3.05 | 407 | 0.945 | 0.056 |
| Example 111 | 306 | −5.47 | −1.82 | 3.06 | 405 | 0.939 | 0.053 |
| Example 112 | 307 | −5.33 | −1.94 | 2.88 | 431 | 0.380 | 0.094 |
| Example 113 | 308 | −4.87 | −1.38 | 2.88 | 431 | 0.539 | 0.079 |
| Example 114 | 309 | −5.56 | −1.77 | 3.18 | 390 | 0.544 | 0.074 |
| Example 115 | 310 | −4.84 | −1.37 | 2.86 | 434 | 0.526 | 0.058 |
| Example 116 | 311 | −4.88 | −1.30 | 2.94 | 422 | 0.374 | 0.079 |
| Example 117 | 312 | −4.83 | −1.27 | 2.94 | 422 | 0.418 | 0.073 |
| Example 118 | 313 | −4.83 | −1.28 | 2.93 | 422 | 0.389 | 0.075 |
| Example 119 | 314 | −4.87 | −1.30 | 2.95 | 420 | 0.380 | 0.072 |
| Example 120 | 315 | −4.83 | −1.27 | 2.95 | 421 | 0.396 | 0.071 |
| Example 121 | 316 | −4.86 | −1.31 | 2.92 | 424 | 0.360 | 0.079 |
| Example 122 | 317 | −4.82 | −1.28 | 2.92 | 424 | 0.375 | 0.078 |
| Example 123 | 318 | −4.85 | −1.31 | 2.92 | 425 | 0.346 | 0.079 |
| Example 124 | 319 | −4.82 | −1.28 | 2.92 | 425 | 0.360 | 0.078 |
| Example 125 | 320 | −4.88 | −1.38 | 2.89 | 429 | 0.563 | 0.070 |
| Example 126 | 321 | −4.87 | −1.38 | 2.89 | 429 | 0.519 | 0.068 |
| Example 127 | 322 | −4.89 | −1.38 | 2.90 | 427 | 0.584 | 0.067 |
| Example 128 | 323 | −4.88 | −1.38 | 2.90 | 428 | 0.528 | 0.063 |
| Example 129 | 324 | −4.86 | −1.36 | 2.89 | 429 | 0.612 | 0.056 |
| Example 130 | 325 | −4.79 | −1.31 | 2.88 | 430 | 0.633 | 0.055 |
| Example 131 | 326 | −4.87 | −1.31 | 2.94 | 421 | 0.455 | 0.073 |
| Example 132 | 327 | −4.83 | −1.28 | 2.94 | 422 | 0.469 | 0.072 |
| Example 133 | 328 | −4.85 | −1.34 | 2.90 | 428 | 0.459 | 0.065 |
| Example 134 | 329 | −4.82 | −1.31 | 2.90 | 428 | 0.472 | 0.064 |

TABLE 6-continued

| | Compound | HOMO(eV) | LUMO(eV) | DFT calculation: Adiabatic lowest excited singlet state ($S_1$) energy (eV) | Fluorescence wavelength (nm) | Oscillator strength f | Reorganization energy (eV) |
|---|---|---|---|---|---|---|---|
| Example 135 | 330 | −4.86 | −1.36 | 2.89 | 429 | 0.584 | 0.057 |
| Example 136 | 331 | −4.86 | −1.36 | 2.89 | 429 | 0.585 | 0.056 |
| Example 137 | 332 | −4.79 | −1.30 | 2.88 | 430 | 0.604 | 0.056 |
| Example 138 | 333 | −4.79 | −1.30 | 2.88 | 430 | 0.606 | 0.055 |
| Example 139 | 334 | −4.87 | −1.31 | 2.94 | 422 | 0.412 | 0.074 |

TABLE 7

| | Compound | HOMO(eV) | LUMO(eV) | DFT calculation: Adiabatic lowest excited singlet state ($S_1$) energy (eV) | Fluorescence wavelength (nm) | Oscillator strength f | Reorganization energy (eV) |
|---|---|---|---|---|---|---|---|
| Example 140 | 335 | −4.87 | −1.31 | 2.94 | 422 | 0.396 | 0.075 |
| Example 141 | 336 | −4.83 | −1.27 | 2.94 | 422 | 0.425 | 0.074 |
| Example 142 | 337 | −4.83 | −1.28 | 2.94 | 422 | 0.406 | 0.075 |
| Example 143 | 338 | −4.87 | −1.35 | 2.92 | 425 | 0.573 | 0.057 |
| Example 144 | 339 | −4.88 | −1.37 | 2.90 | 428 | 0.609 | 0.057 |
| Example 145 | 340 | −4.87 | −1.37 | 2.89 | 429 | 0.569 | 0.058 |
| Example 146 | 341 | −4.92 | −1.41 | 2.90 | 428 | 0.564 | 0.060 |
| Example 147 | 342 | −4.89 | −1.31 | 2.96 | 418 | 0.404 | 0.074 |
| Example 148 | 343 | −4.89 | −1.32 | 2.95 | 420 | 0.463 | 0.073 |
| Example 149 | 344 | −4.88 | −1.32 | 2.94 | 422 | 0.369 | 0.076 |
| Example 150 | 345 | −4.94 | −1.37 | 2.95 | 420 | 0.407 | 0.078 |
| Example 151 | 346 | −5.57 | −1.96 | 3.05 | 407 | 0.939 | 0.044 |
| Example 152 | 347 | −5.14 | −1.70 | 2.90 | 428 | 1.028 | 0.042 |
| Example 153 | 348 | −5.46 | −2.10 | 2.81 | 441 | 0.626 | 0.035 |
| Example 154 | 349 | −5.13 | −1.74 | 2.84 | 437 | 0.902 | 0.044 |
| Example 155 | 350 | −5.60 | −1.88 | 3.17 | 390 | 0.229 | 0.080 |
| Example 156 | 351 | −5.17 | −1.60 | 3.02 | 411 | 0.612 | 0.079 |
| Example 157 | 352 | −5.13 | −1.64 | 2.96 | 419 | 0.337 | 0.070 |
| Example 158 | 353 | −4.82 | −1.38 | 2.90 | 427 | 0.667 | 0.053 |
| Example 159 | 354 | −5.47 | −2.07 | 2.85 | 435 | 0.176 | 0.070 |
| Example 160 | 355 | −5.15 | −1.68 | 2.91 | 426 | 0.423 | 0.080 |
| Example 161 | 356 | −5.13 | −1.73 | 2.86 | 434 | 0.340 | 0.073 |
| Example 162 | 357 | −5.49 | −1.96 | 2.92 | 424 | 0.198 | 0.099 |
| Example 163 | 358 | −4.88 | −1.47 | 2.81 | 441 | 0.554 | 0.070 |
| Example 164 | 359 | −4.88 | −1.38 | 2.89 | 429 | 0.560 | 0.070 |
| Example 165 | 360 | −5.43 | −1.89 | 2.96 | 419 | 0.732 | 0.059 |
| Example 166 | 361 | −4.89 | −1.42 | 2.87 | 432 | 0.455 | 0.071 |
| Example 167 | 362 | −4.89 | −1.33 | 2.95 | 421 | 0.418 | 0.081 |
| Example 168 | 363 | −5.48 | −1.89 | 3.00 | 414 | 0.365 | 0.098 |
| Example 169 | 364 | −4.86 | −1.35 | 2.90 | 427 | 0.544 | 0.053 |
| Example 170 | 365 | −4.87 | −1.30 | 2.96 | 418 | 0.447 | 0.063 |
| Example 171 | 366 | −5.48 | −1.87 | 3.10 | 400 | 1.036 | 0.053 |
| Example 172 | 367 | −5.51 | −2.10 | 2.86 | 434 | 0.378 | 0.065 |
| Example 173 | 368 | −4.99 | −1.48 | 2.92 | 425 | 0.602 | 0.053 |
| Example 174 | 369 | −5.02 | −1.43 | 2.98 | 416 | 0.476 | 0.059 |

TABLE 8

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 175 | 401 | −4.99 | −1.40 | 2.98 | 415 | 0.488 | 0.061 |
| Example 176 | 402 | −4.94 | −1.38 | 2.97 | 418 | 0.501 | 0.058 |
| Example 177 | 403 | −4.79 | −1.25 | 2.93 | 424 | 0.432 | 0.073 |
| Example 178 | 404 | −4.76 | −1.21 | 2.93 | 423 | 0.437 | 0.073 |
| Example 179 | 405 | −4.85 | −1.27 | 2.97 | 418 | 0.466 | 0.064 |
| Example 180 | 406 | −4.82 | −1.27 | 2.94 | 421 | 0.471 | 0.061 |
| Example 181 | 407 | −5.44 | −2.06 | 2.82 | 440 | 0.313 | 0.089 |
| Example 182 | 408 | −5.39 | −2.10 | 2.74 | 452 | 0.329 | 0.091 |
| Example 183 | 409 | −5.44 | −2.12 | 2.77 | 447 | 0.376 | 0.075 |
| Example 184 | 410 | −5.35 | −2.07 | 2.74 | 453 | 0.399 | 0.071 |
| Example 185 | 411 | −5.33 | −2.05 | 2.74 | 452 | 0.405 | 0.070 |
| Example 186 | 412 | −5.33 | −2.04 | 2.75 | 451 | 0.401 | 0.070 |
| Example 187 | 413 | −5.37 | −2.06 | 2.77 | 448 | 0.410 | 0.063 |

TABLE 9

| | Compound | DFT calculation HOMO(eV) | LUMO(eV) | Adiabatic lowest excited singlet state ($S_1$) energy (eV) | Fluorescence wavelength (nm) | Oscillator strength f | Reorganization energy (eV) |
|---|---|---|---|---|---|---|---|
| Example 188 | 501 | −4.74 | −1.23 | 2.91 | 426 | 0.443 | 0.068 |
| Example 189 | 502 | −4.90 | −1.35 | 2.95 | 420 | 0.505 | 0.058 |
| Example 190 | 503 | −4.75 | −1.22 | 2.93 | 423 | 0.468 | 0.060 |
| Example 191 | 504 | −4.78 | −1.26 | 2.91 | 426 | 0.427 | 0.068 |
| Example 192 | 505 | −4.93 | −1.38 | 2.96 | 419 | 0.489 | 0.056 |
| Example 193 | 506 | −4.79 | −1.26 | 2.93 | 423 | 0.443 | 0.060 |
| Example 194 | 507 | −4.99 | −1.45 | 2.94 | 422 | 0.511 | 0.057 |
| Example 195 | 508 | −4.85 | −1.32 | 2.92 | 425 | 0.455 | 0.059 |
| Example 196 | 509 | −4.96 | −1.42 | 2.93 | 423 | 0.521 | 0.059 |
| Example 197 | 510 | −4.82 | −1.29 | 2.92 | 425 | 0.474 | 0.060 |
| Example 198 | 511 | −4.96 | −1.42 | 2.93 | 423 | 0.505 | 0.059 |
| Example 199 | 512 | −4.82 | −1.30 | 2.92 | 425 | 0.462 | 0.059 |
| Example 200 | 513 | −4.96 | −1.48 | 2.85 | 435 | 0.382 | 0.078 |
| Example 201 | 514 | −4.62 | −1.33 | 2.66 | 466 | 0.310 | 0.099 |
| Example 202 | 515 | −4.76 | −1.24 | 2.91 | 425 | 0.438 | 0.068 |
| Example 203 | 516 | −4.92 | −1.36 | 2.96 | 420 | 0.502 | 0.058 |
| Example 204 | 517 | −4.78 | −1.24 | 2.93 | 423 | 0.464 | 0.060 |
| Example 205 | 518 | −4.80 | −1.28 | 2.91 | 425 | 0.422 | 0.068 |
| Example 206 | 519 | −4.95 | −1.40 | 2.96 | 419 | 0.484 | 0.056 |
| Example 207 | 520 | −4.81 | −1.27 | 2.93 | 423 | 0.438 | 0.060 |
| Example 208 | 521 | −4.99 | −1.45 | 2.94 | 422 | 0.494 | 0.057 |
| Example 209 | 522 | −4.86 | −1.33 | 2.92 | 425 | 0.442 | 0.059 |
| Example 210 | 523 | −4.99 | −1.48 | 2.92 | 425 | 0.654 | 0.053 |
| Example 211 | 524 | −4.95 | −1.42 | 2.92 | 424 | 0.682 | 0.053 |
| Example 212 | 525 | −4.87 | −1.36 | 2.91 | 427 | 0.588 | 0.053 |
| Example 213 | 526 | −4.82 | −1.30 | 2.92 | 425 | 0.615 | 0.053 |
| Example 214 | 527 | −4.96 | −1.45 | 2.91 | 426 | 0.620 | 0.053 |
| Example 215 | 528 | −4.91 | −1.39 | 2.92 | 425 | 0.648 | 0.053 |
| Example 216 | 529 | −4.82 | −1.32 | 2.90 | 428 | 0.560 | 0.054 |
| Example 217 | 530 | −4.78 | −1.26 | 2.91 | 427 | 0.586 | 0.053 |
| Example 218 | 531 | −4.95 | −1.42 | 2.93 | 424 | 0.630 | 0.053 |
| Example 219 | 532 | −4.82 | −1.30 | 2.92 | 425 | 0.569 | 0.053 |

Here, as shown in Tables 3 to 9, the reorganization energy of the condensed cyclic compounds 1 to 102, 201 to 203, 301 to 369, 401 to 413, and 501 to 532 of the present disclosure was 0.100 eV or less, and was a value smaller than that of the known condensed cyclic compounds R1 to R3 in the art. Therefore, referring to FIG. 5, it was confirmed that the condensed cyclic compounds of the present disclosure had smaller FWHM and higher color purity than those of the known condensed cyclic compounds R1 to R3 in the art.

In addition, the reorganization energy of Compounds C1 to C5 of Comparative Examples was 0.114 eV or more, which is equal to or greater than that of the known condensed cyclic compounds R1 to R3 in the art. Referring to FIG. 5, it was confirmed that Compounds C1 to C3 of the Comparative Examples had FWHM equal to or greater than that of the known condensed cyclic compounds R1 to R3 and color purity equal to or less than that of the known condensed cyclic compounds R1 to R3 in the art.

In addition, as shown in Tables 3 to 9, the condensed cyclic compounds of the present disclosure had significantly reduced values of the reorganization energy (eV) compared to Compounds C1 to C5 of the Comparative Examples. Accordingly, it was confirmed that the condensed cyclic compounds of the present disclosure had significantly lower FWHM and significantly higher color purity compared to Compounds C1 to C5 of the Comparative Examples.

Therefore, it was confirmed that the condensed cyclic compounds of the present disclosure had a very narrow spectrum width and showed fluorescence with high color purity, particularly blue fluorescence with high color purity. It was also confirmed that the condensed cyclic compounds of the present disclosure had a sufficient magnitude of the oscillator strength (f), and the fluorescence efficiency thereof was also excellent.

Evaluation Example 3: Measurement of Fluorescence Spectrum Width (FWHM) of Condensed Cyclic Compounds of the Present Disclosure The properties of the condensed cyclic compounds of the present disclosure were evaluated experimentally, and Compounds 100, 202, and 301 were used as exemplary compounds of the condensed cyclic compounds of the present disclosure.

For each of the $1\times10^{-5}$ M (=mol/dm$^3$, mol/L) toluene solutions of Compounds 100, 202, and 301 of the present disclosure, the measurement was performed with an excitation wavelength of 320 nm at room temperature by using a spectrofluorescence photometer F7000 manufactured by Hitachi High-Tech Science Company, and the fluorescence peak wavelength (nm) and the fluorescence spectrum width (full width at half maximum (FWHM) of the fluorescence spectrum peak) of PL were evaluated.

Here, the peak wavelength of fluorescence was not particularly limited, but it was preferable that it be within a blue emission region, particularly, within a range of about 440 nm to about 465. In addition, in the present evaluation, it was confirmed that the smaller FWHM of the fluorescence spectrum width corresponded with an improved color purity. These measurement results are shown in Table 10 below. In addition, Table 10 below also shows the results of the known condensed cyclic compounds R1 to R3 in the art measured in the same manner as described above.

TABLE 10

| Compound | PL fluorescence wavelength(nm) | PL FWHM (nm) |
|---|---|---|
| 100 | 461 | 18 |
| 202 | 457 | 20 |
| 301 | 441 | 14 |
| R1 | 453 | 22 |
| R2 | 451 | 26 |
| R3 | 445 | 42 |

Referring to Table 10, it was confirmed that the condensed cyclic compounds of the present disclosure, Compounds 100, 202, and 301, had smaller PL FWHMs compared to the known condensed cyclic compounds in the art, Compounds R1 to R3. That is, based on the results above, it was confirmed that the condensed cyclic compounds of the present disclosure had a very narrow spectrum width in PL fluorescence and exhibited blue fluorescence with high color purity.

Organic Light-Emitting Device Examples

Device Example 1

An ITO glass substrate was cut into a size of 50 mm×50 mm×0.5 mm, sonicated in acetone, isopropyl alcohol, and distilled water in the order, each for 15 minutes, and then, washed by exposure to UV ozone for 30 minutes.

Thereafter, F6-TCNNQ was deposited on the ITO electrode to form a hole injection layer having a thickness of 10 nm, Compound HT1 was deposited on the hole injection layer to form a hole transport layer having a thickness of 126 nm, and Compound o-CBP was deposited on the hole transport layer to form an electron blocking layer having a thickness of 10 nm.

Compound o-CBP, Compound mCBP-2CN (host), and Compound 100 (dopant) were co-deposited on the electron blocking layer to form an emission layer having a thickness of 40 nm. Here, the mass ratio of Compound o-CBP and Compound mCBP-2CN was 60:40, and the concentration of Compound 100 was set to 1.5 weight % with respect to the total mass of Compound o-CBP, Compound mCBP-2CN, and Compound 100 (that is, the total mass of the emission layer).

After depositing Compound mCBP-2CN on the emission layer to form a hole blocking layer having a thickness of 10 nm, Compound ET17 and LiQ were co-deposited on the hole blocking layer in a weight ratio of 5:5 to form an electron transport layer having a thickness of 36 nm. Then, LiQ was deposited on the electron transport layer to form an electron injection layer having a thickness of 0.5 nm.

An Al electrode having a thickness of 80 nm was formed on the electron injection layer, thereby manufacturing a light-emitting device.

Afterwards, the light-emitting device manufactured in the above process was sealed using an ultraviolet curable resin (MORESCO, product name: WB90US) and a glass sealing tube dried in a glove box with a moisture concentration of 1 ppm or less and an oxygen concentration of 1 ppm or less in a nitrogen atmosphere, thereby completing the manufacture of an organic light-emitting device.

Device Example 2

A light-emitting device was manufactured in the same manner as in Device Example 1, except that Compound 202 was used instead of Compound 100 in forming an emission layer. Then, the manufactured light-emitting device was sealed, thereby completing the manufacture of an organic light-emitting device.

Device Example 3

A light-emitting device was manufactured and sealed in the same manner as in Device Example 1 to complete the manufacture of an organic light-emitting device, except that the emission layer was formed as follows.

Formation of Emission Layer in Device Example 3

Compound o-CBP and Compound mCBP-2CN (host), Compound Pt1 (sensitizer), and Compound 100 (dopant) were co-deposited on the electron blocking layer to form an emission layer having a thickness of 40 nm. Here, the mass ratio of Compound o-CBP, Compound mCBP-2CN, and Compound Pt1 was 60:40:10, and the concentration of Compound 100 was set to be 1.5 wt % with respect to the total mass of Compound o-CBP, Compound mCBP-2CN, Compound Pt1, and Compound 100 (i.e., the total mass of the emission layer).

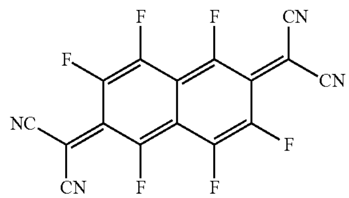

F6-TCNNQ

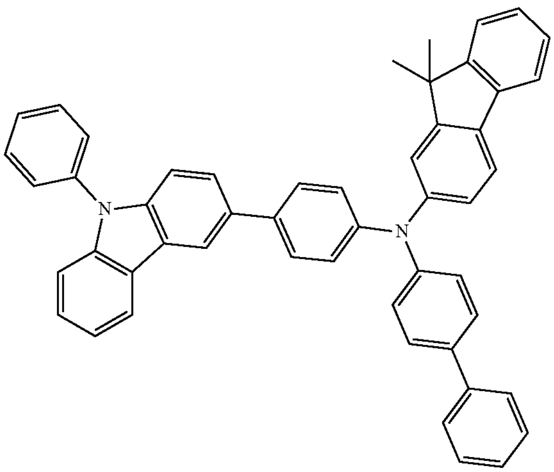

HT1

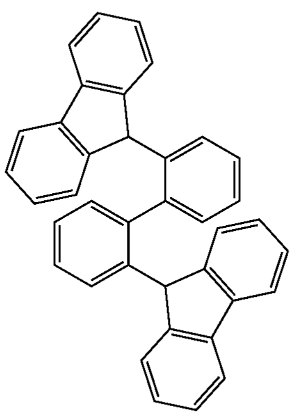

o-CBP

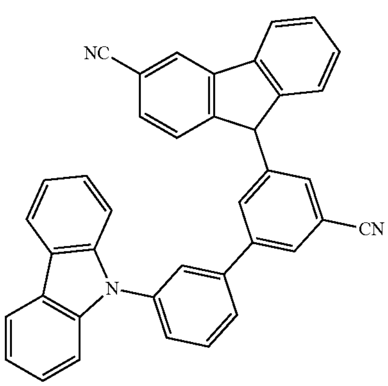

mCBP-2CN

-continued

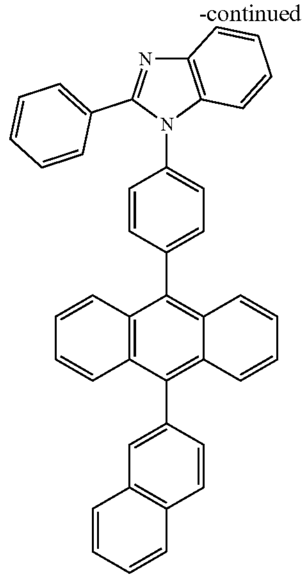

ET17

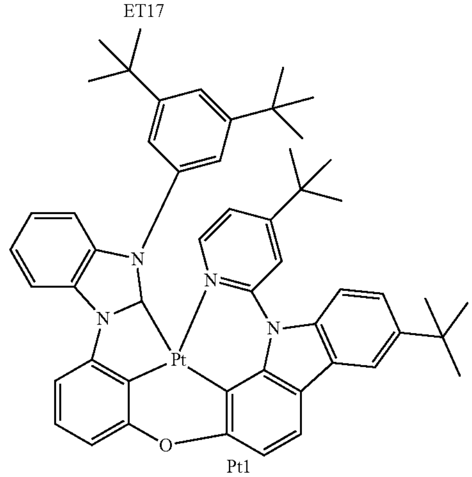

Pt1

Device Example 4

A light-emitting device was manufactured in the same manner as in Device Example 3, except that Compound 202 was used instead of Compound 100 in forming an emission layer. Then, the manufactured light-emitting device was sealed, thereby completing the manufacture of an organic light-emitting device.

Comparative Device Example 1

A light-emitting device was manufactured in the same manner as in Device Example 1, except that Compound $R_1$ was used instead of Compound 100 in forming an emission layer. Then, the manufactured light-emitting device was sealed, thereby completing the manufacture of an organic light-emitting device.

Evaluation Example 4: Evaluation of Organic Light-Emitting Device

To evaluate the characteristics of the organic light-emitting devices manufactured according to Device Examples 1 to 4 and Comparative Device Example 1, brightness, external quantum efficiency, and device lifetime of the organic light-emitting device were measured. Light was emitted while changing the voltage of the organic light-emitting device using a direct current constant voltage power supply (source meter 2400 manufactured by KEITHLEY), and the brightness, emission spectrum, and the amount of light emitted were measured using a luminance measuring device (SR-3 manufactured by Topcon). Here, the external quantum efficiency was calculated from the amount of light emitted in the emission spectrum and the current value at the time of measurement.

$LT_{95}$ shows the evaluation result of the device lifetime, and represents the time measured until the emission luminance, which decreases with the lapse of continuous operation time at a current value of 1,000 cd/$m^2$, becomes 95% of the initial luminance. $LT_{95}$ was expressed as a relative value with respect to $LT_{95}$ [hr] of Comparative Example 1 being 1. The evaluation results for the characteristics of the organic light-emitting devices are shown in Table 11 below.

TABLE 11

| | Fluorescence wavelength (nm) | FWHM (nm) | EQE (External Quantum Efficiency) (%) | $LT_{95}$ |
|---|---|---|---|---|
| Device example 1 | 468 | 23 | 9.1 | 4.6 |
| Device example 2 | 463 | 25 | 6.9 | 2.2 |
| Device example 3 | 468 | 24 | 17.0 | 20.1 |
| Device example 4 | 464 | 25 | 16.8 | 16.6 |
| Device comparative example 1 | 460 | 27 | 4.9 | 1 |

Referring to the results of Table 11, it was confirmed that the condensed cyclic compounds of the present disclosure, Compounds 100 and 202, exhibited blue fluorescence with a very narrow spectrum width and high color purity in the emission of the light-emitting device, and that Compounds 100 and 202 of the present disclosure had excellent external quantum efficiency and excellent device lifetime with excellent luminescence efficiency. In addition, it was confirmed that, compared to the devices of Device Examples 1 and 2 including the condensed cyclic compounds of the present disclosure only, the devices of Device Examples 3 and 4 including Compounds 100 and 202 which are the condensed cyclic compounds of the present disclosure together with Compound Pt1 which is a sensitizer showed the equivalent emission peak wavelength and the equivalent emission spectrum width (FWHM) to those of the devices of Device Examples 1 and 2 and exhibited the significantly improved external quantum efficiency and better $LT_{95}$. Therefore, it was confirmed that, when the condensed cyclic compounds of the present disclosure and the sensitizer were used together, the luminescence efficiency and device lifespan of the organic light-emitting device were remarkably improved.

In addition, regarding the simulation evaluation results above, it was confirmed that the results were consistent with the tendency that the reorganization energy of the condensed cyclic compound of the present disclosure was smaller than the known condensed cyclic compounds R1 to R3 and that the FWHM of the condensed cyclic compound of the present disclosure was smaller than the known condensed cyclic compounds R1 to R3 (see FIG. 5).

Accordingly, compared to the light-emitting device of Comparative Examples including Compounds C1 to C5 that are groups other than the condensed cyclic compound of the present disclosure, i.e., the group represented by Formula 2-1 or 2-2, the organic light-emitting device using the condensed cyclic compound of the present disclosure exhibited fluorescence having a narrow spectrum width and high color purity, in particular, blue fluorescence having high color purity.

In the above experiments, Compounds 100, 202, and 301 were used as exemplary embodiments of the condensed cyclic compound of the present disclosure. However, as represented by the above simulation evaluations, it is understood that other condensed cyclic compounds of the present disclosure also have similar properties. For this reason, other condensed cyclic compounds of the present disclosure and organic light-emitting devices using the same may also exhibit similar fluorescence emission with high color purity, particularly blue fluorescence emission with high color purity, and exhibit excellent luminous efficiency and excellent device lifetime.

According to the one or more embodiments, the inclusion of the condensed cyclic compound represented by Formula 1-1 or 1-2 provides high color purity.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A condensed cyclic compound represented by Formula 1-1 or 1-2:

Formula 1-1

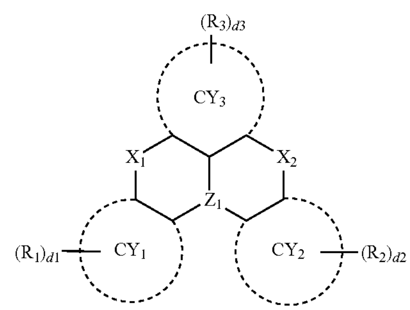

Formula 1-2

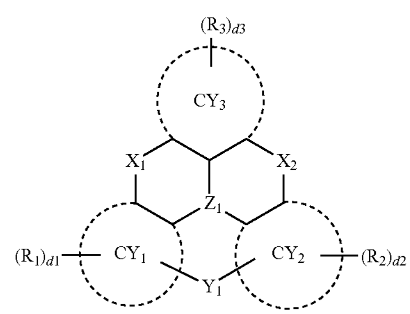

-continued

Formula 2-1

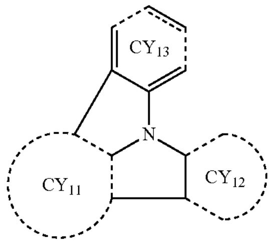

Formula 2-2

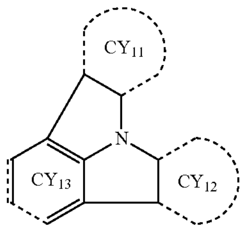

Formula 3

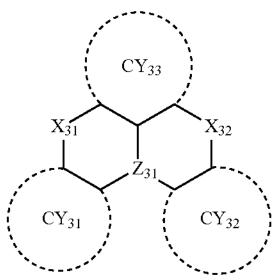

wherein, in Formulae 1-1 and 1-2, $CY_1$ to $CY_3$ are each independently a $C_5$-$C_{60}$ carbocyclic group or a $C_1$-$C_{60}$ heterocyclic group, at least one of $CY_1$ and $CY_2$ is a group represented by Formula 2-1 or 2-2, $X_1$ is O, S, Se, Te, $N(R_{1a})$, or $C(R_{1a})(R_{1b})$, $X_2$ is O, S, Se, Te, $N(R_{2a})$, or $C(R_{2a})(R_{2b})$, $Y_1$ is O, S, Se, Te, $N(R_{3a})$, or $C(R_{3a})(R_{3b})$, $Z_1$ is B, Al, $Si(R_{4a})$, $Ge(R_{4a})$, P, P(=O), or P(=S), $R_1$ to $R_3$, $R_{1a}$ to $R_{4a}$, and $R_{1b}$ to $R_{3b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $R_1$ to $R_3$, $R_{1a}$ to $R_{4a}$, and $R_{1b}$ to $R_{3b}$ are optionally linked to each other or via a single bond to form a $C_8$-$C_{60}$ polycyclic group that is unsubstituted or substituted with at least one $R_{10a}$, d1 to d3 are each independently an integer from 0 to 20, in Formulae 2-1 and 2-2, $CY_{11}$ and $CY_{12}$ are each independently a $C_5$-$C_{60}$ carbocyclic group, a $C_1$-$C_{60}$ heterocyclic group, or a group represented by Formula 3, $CY_{13}$ is condensed with $CY_1$, $CY_2$, or each of $CY_1$ and $CY_2$, wherein one of the bonds marked with a dotted line in $CY_{13}$ indicates a binding site to a bond marked with a solid line in $CY_1$ or $CY_2$, in Formula 3, $CY_{31}$ to $CY_{33}$ are each independently a $C_5$-$C_{60}$ carbocyclic group or a $C_1$-$C_{60}$ heterocyclic group, $X_{31}$ is O, S, Se, Te, $N(R_{5a})$, or $C(R_{5a})(R_{5b})$, $X_{32}$ is O, S, Se, Te, $N(R_{6a})$, or $C(R_{6a})(R_{6b})$, $Z_{31}$ is B, Al, $Si(R_{7a})$, $Ge(R_{7a})$, P, P(=O), or P(=S), $R_{5a}$ to $R_{7a}$, $R_{5b}$, and $R_{6b}$ are each independently the same as described in connection with $R_{1a}$, $R_{10a}$ is:

deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, $—C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof: or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group: a $C_2$-$C_{60}$ alkenyl group: a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The condensed cyclic compound of claim 1, wherein $CY_1$ to $CY_3$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, an indolocarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or a group represented by Formula 2-1 or 2-2.

3. The condensed cyclic compound of claim 1, wherein $CY_3$ is a benzene group, a naphthalene group, a dibenzosilole group, a carbazole group, a dibenzothiophene group, or a dibenzofuran group.

4. The condensed cyclic compound of claim 1, wherein $CY_{11}$ and $CY_{12}$ are each independently a benzene group or a group represented by Formula 3.

5. The condensed cyclic compound of claim 1, wherein the condensed cyclic compound represented by Formula 1-1 or 1-2 satisfies at least one of Conditions 1 to 3:

Condition 1

$CY_1$ is a group represented by Formula 2-1 or 2-2;

Condition 2

$CY_2$ is a group represented by Formula 2-1 or 2-2; and

Condition 3

$CY_1$ and $CY_2$ are each independently a group represented by Formula 2-1 or 2-2.

6. The condensed cyclic compound of claim 1, wherein in Formula 1-1, a moiety represented by

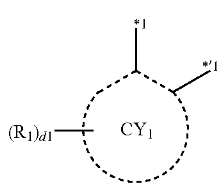

is represented by one of Formulae 3-1 to 3-8, and in Formula 1-1, a moiety represented by

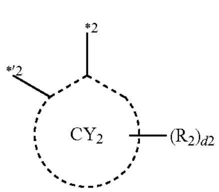

is represented by one of Formulae 4-1 to 4-8, provided that when the moiety represented by

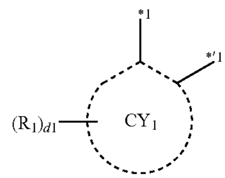

is represented by Formula 3-8 then the moiety represented by

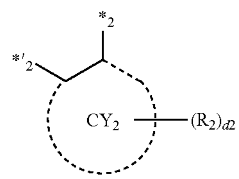

is not represented by Formula 4-8:

3-1

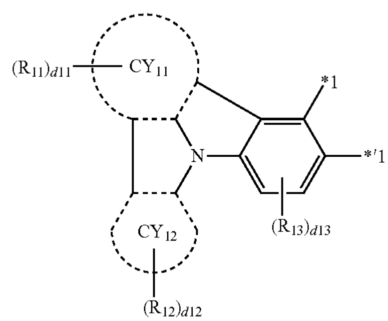

3-2

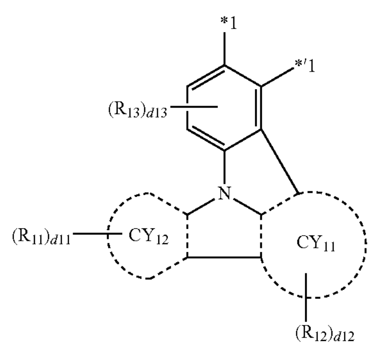

3-3

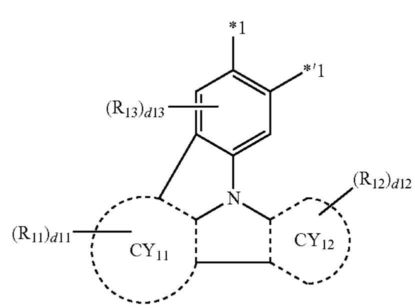

3-4
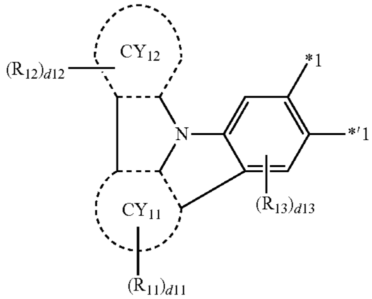
3-5
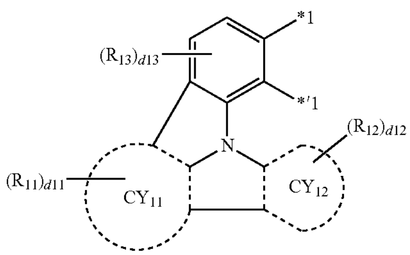
3-6
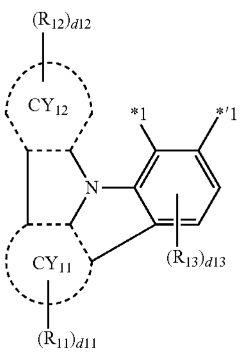
3-7
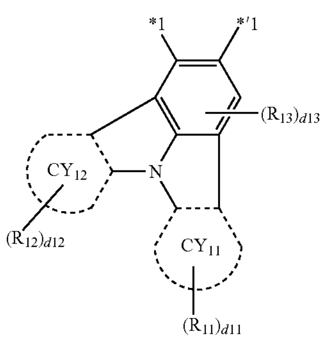
3-8
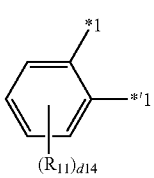
4-1
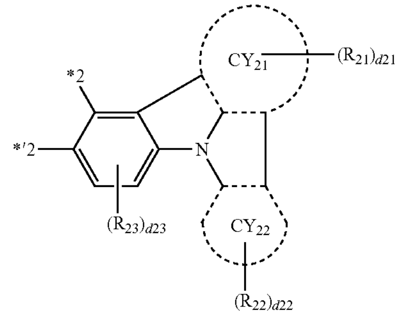
4-2
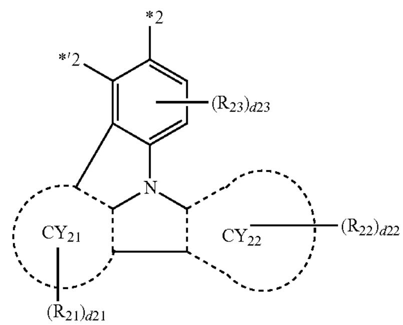
4-3
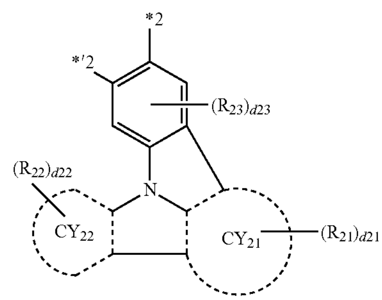
4-4
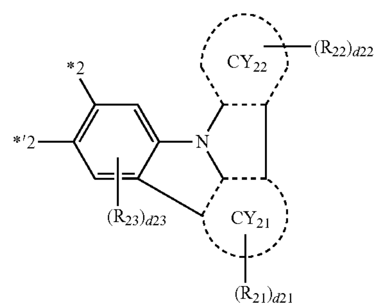
4-5
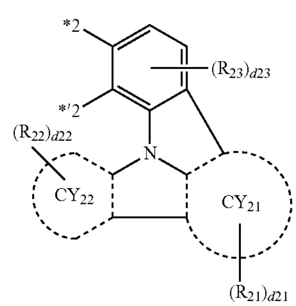

-continued 4-6

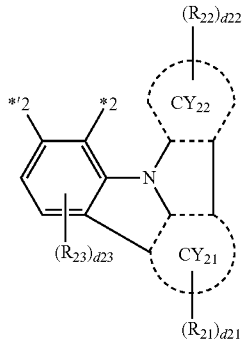

4-7

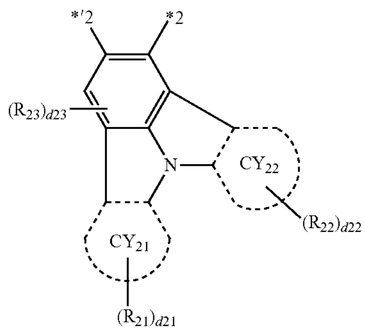

4-8

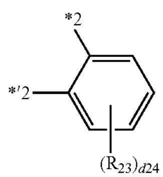

wherein, in Formulae 3-1 to 3-8 and 4-1 to 4-8, $CY_{11}$ and $CY_{12}$ are each the same as described in connection with claim 1, $CY_{21}$ and $CY_{22}$ are each the same as described in connection with $CY_{11}$ in claim 1, $R_{11}$ to $R_{13}$ are each the same as described in connection with $R_1$ in claim 1, $R_{21}$ to $R_{23}$ are each the same as described in connection with $R_2$ in claim 1, d11, d12, d21, and d22 are each independently an integer from 0 to 10, d13 and d23 are each independently an integer from 0 to 2, d14 is an integer from 0 to 4, d24 is an integer from 0 to 4, $*^1$ indicates a binding site to $X_1$ in Formula 1-1, $*'^1$ indicates a binding site to $Z_1$ in Formula 1-1, $*^2$ indicates a binding site to $X_2$ in Formula 1-1, and $*'^2$ indicates a binding site to $Z_1$ in Formula 1-1.

7. The condensed cyclic compound of claim 1, wherein a moiety represented by

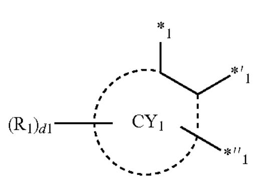

in Formula 1-2 is represented by one of Formulae 3-11 to 3-16, and a moiety represented by

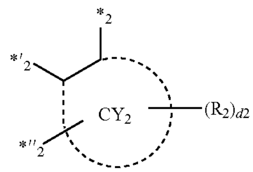

in Formula 1-2 is represented by one of Formulae 4-11 to 4-16, provided that when the moiety represented by

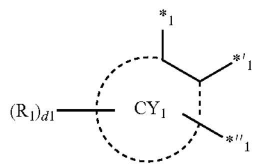

is represented by Formula 3-16 then the moiety represented by

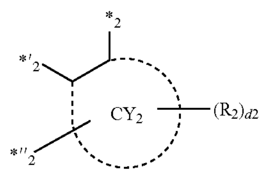

is not represented by Formula 4-16:

3-11

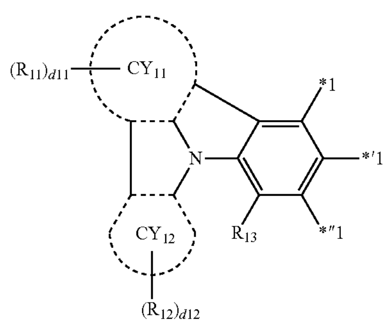

3-12

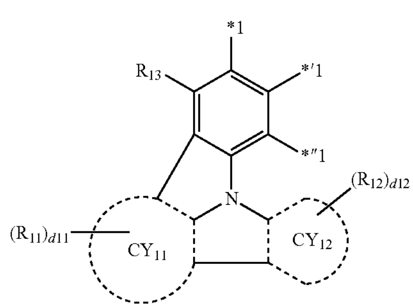

-continued
3-13
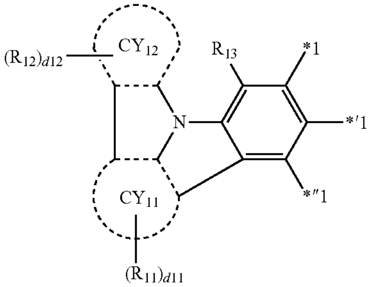
3-14
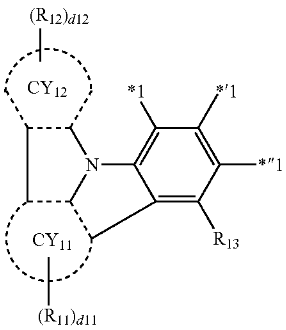
3-15
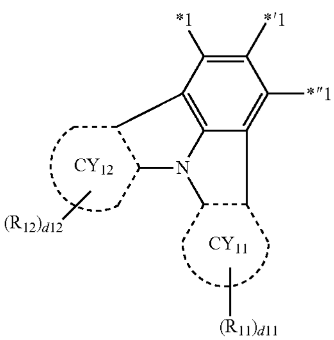
3-16
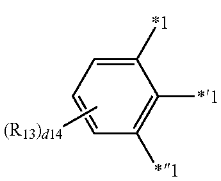
4-11
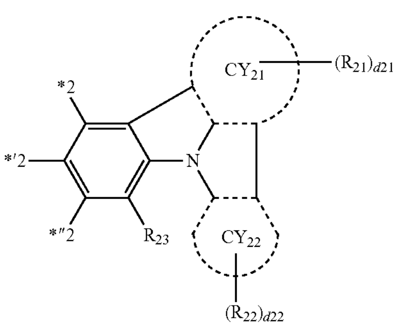
-continued
4-12
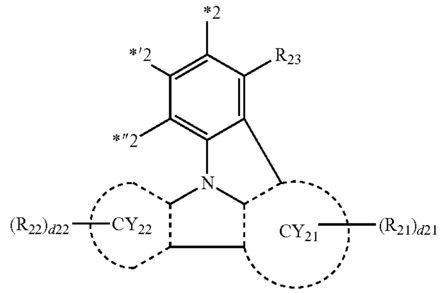
4-13
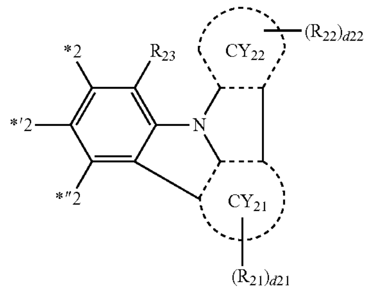
4-14
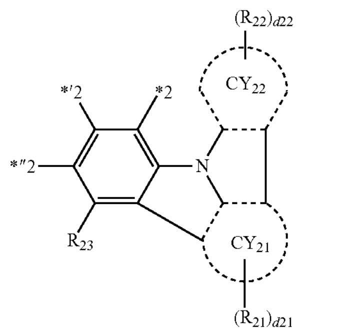
4-15
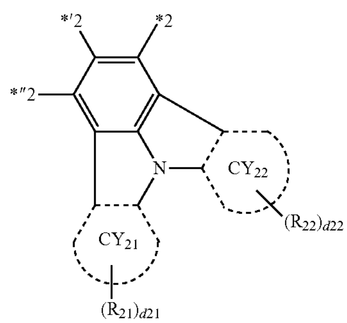
4-16
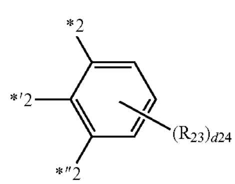
wherein, in Formulae 3-11 to 3-16 and 4-11 to 4-16,
$CY_{11}$ and $CY_{12}$ are each the same as described in connection with claim 1,
$CY_{21}$ and $CY_{22}$ are each the same as described in connection with $CY_{11}$ in claim 1,
$R_{11}$ to $R_{13}$ are each the same as described in connection with $R_1$ in claim 1, $R_{21}$ to $R_{23}$ are each the same as described in connection with $R_2$ in claim 1, d11, d12, d21, and d22 are each independently an integer from 0 to 10, d14 and d24 are each independently an integer from 0 to 3, $*^1$ indicates a binding site to $X_1$ in Formula 1-2, $*'^1$ indicates a binding site to $Z_1$ in Formula 1-2, $*''^1$ indicates a binding site to $Y_1$ in Formula 1-2, $*^2$ indicates a binding site to $X_2$ in Formula 1-2, $*'^2$ indicates a binding site to $Z_1$ in Formula 1-2, and $*''^2$ indicates a binding site to $Y_1$ in Formula 1-2.

8. The condensed cyclic compound of claim 1, wherein a group represented by Formula 2-1 or 2-2 is represented by one of Formulae 2-11 to 2-22:

2-11

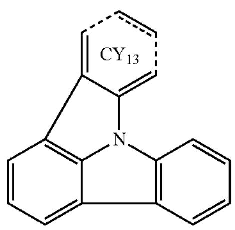

2-12

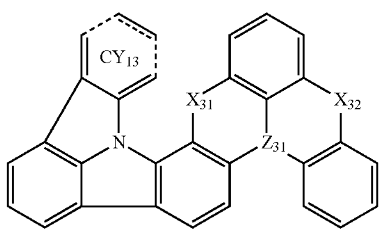

2-13

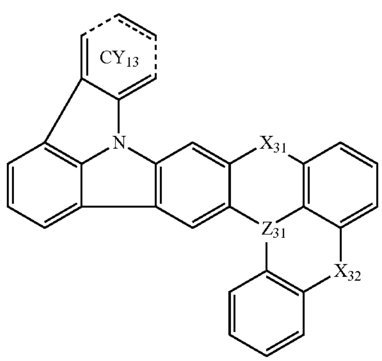

2-14

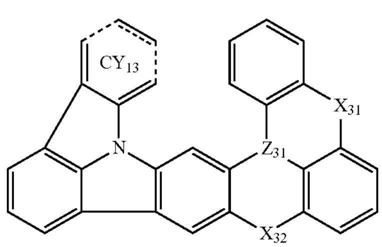

-continued 2-15

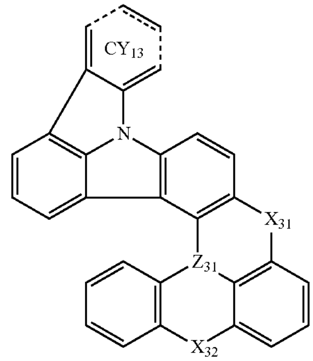

2-16

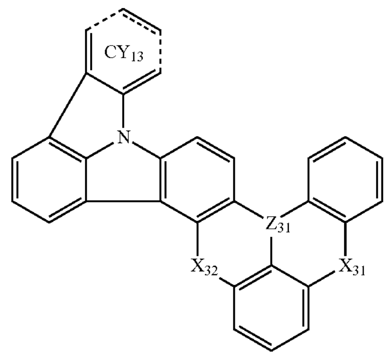

2-17

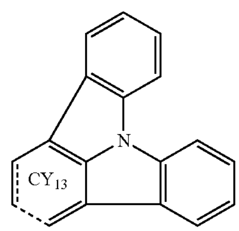

2-18

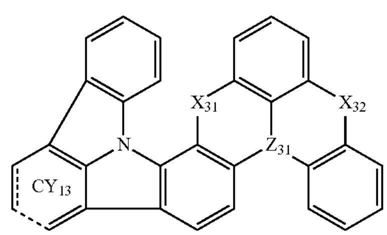

2-19

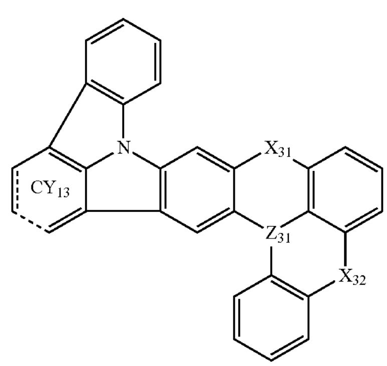

-continued 2-20

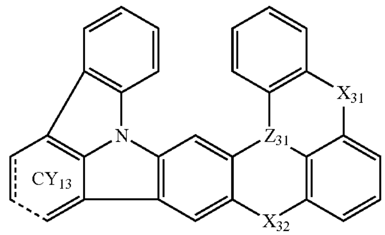

2-21

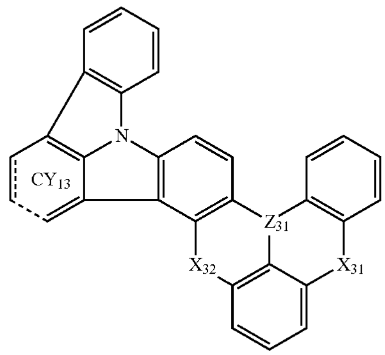

2-22

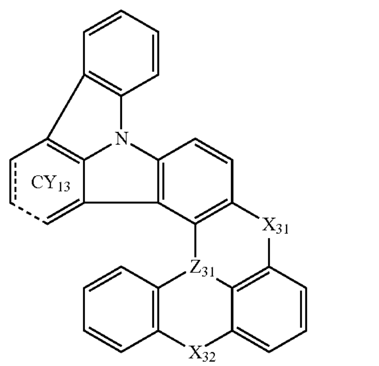

wherein, in Formulae 2-11 to 2-22, $X_{31}$, $X_{32}$, and $Z_{31}$ are each the same as described in connection with claim 1, and $CY_{13}$ is condensed with $CY_1$, $CY_2$, or each of $CY_1$ and $CY_2$, wherein one of the bonds marked with a dotted line in $CY_{13}$ indicates a binding site to a part marked with a solid line in $CY_1$ or $CY_2$.

9. The condensed cyclic compound of claim 1, wherein the condensed cyclic compound represented by Formula 1-1 or 1-2 is represented by one of Formulae 5-1 to 5-12 and 6-1 to 6-12:

5-1

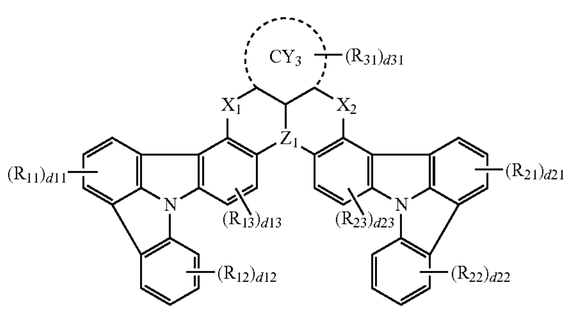

-continued 5-2

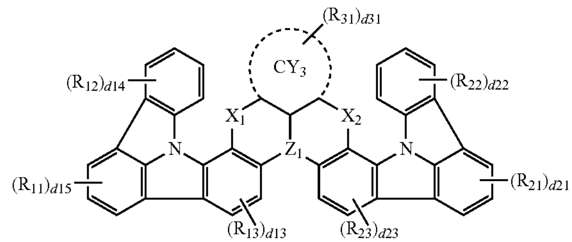

5-3

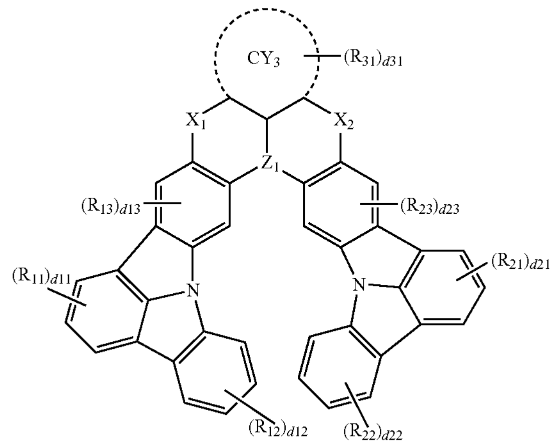

5-4

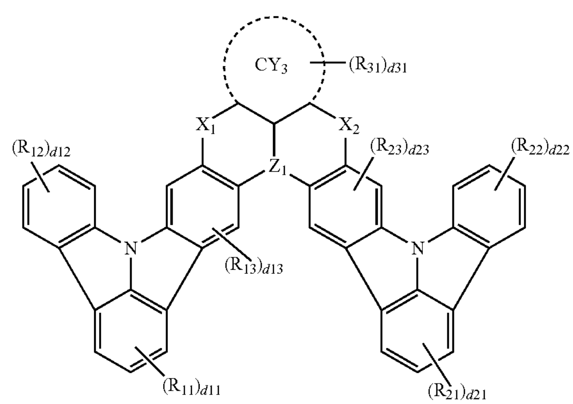

5-5

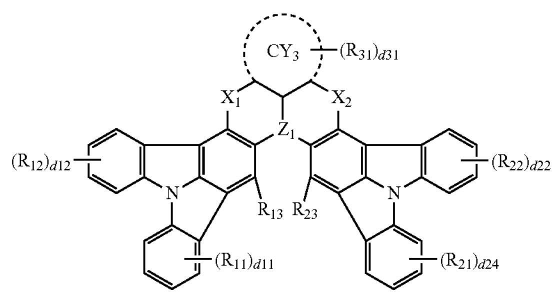

5-6
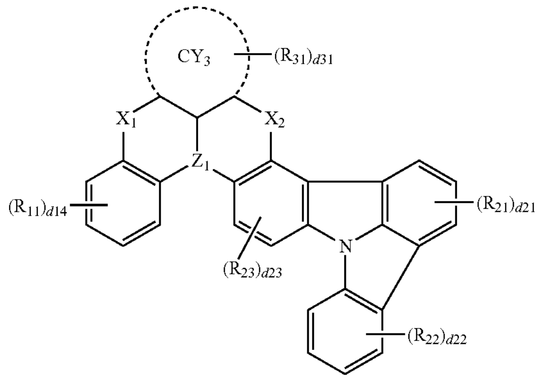
5-7
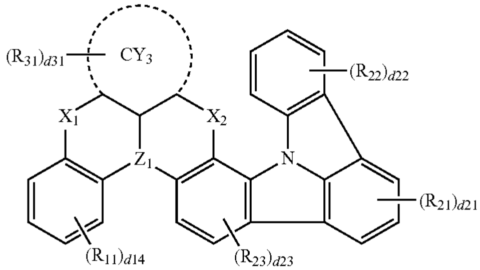
5-8
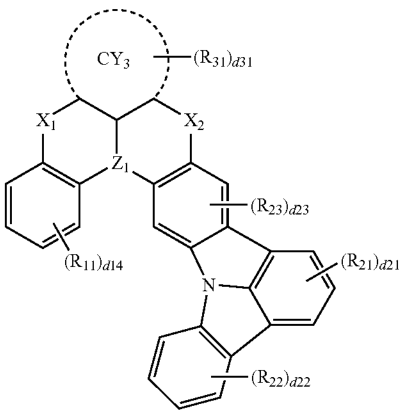
5-9
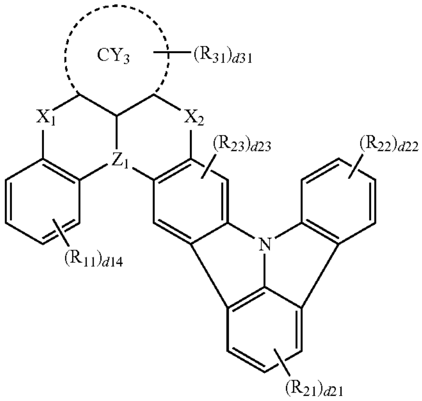
5-10
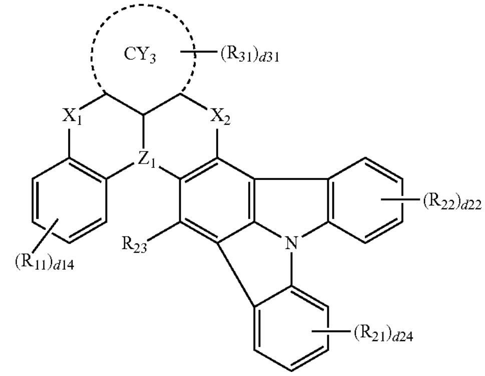
5-11
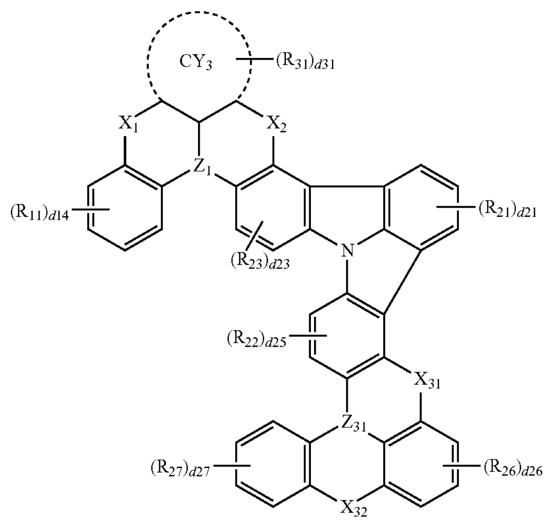
5-12
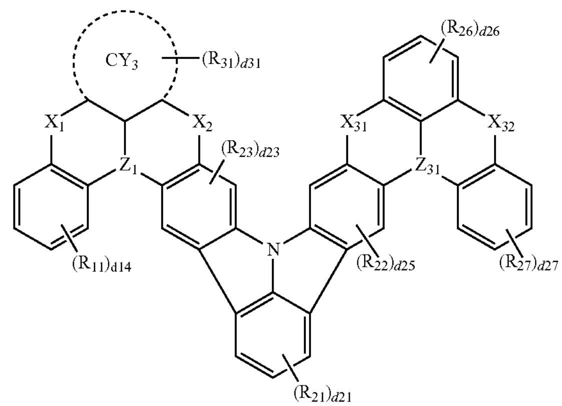

6-1
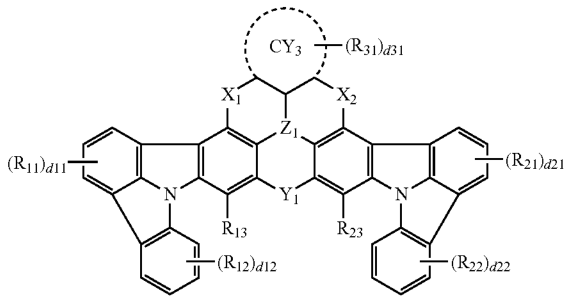
6-2
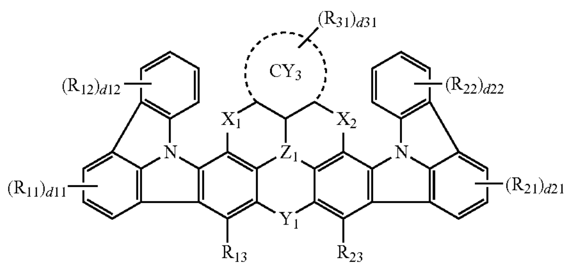
6-3
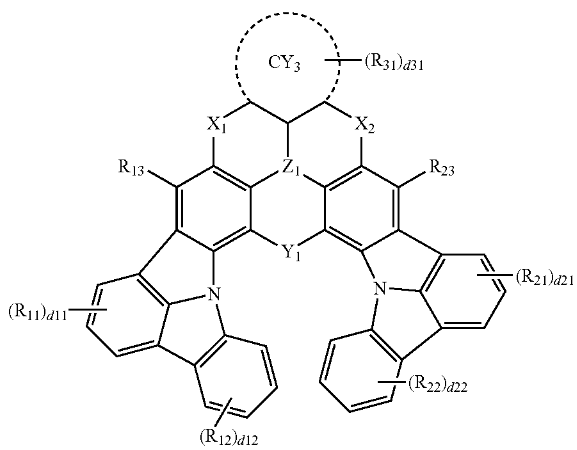
6-4
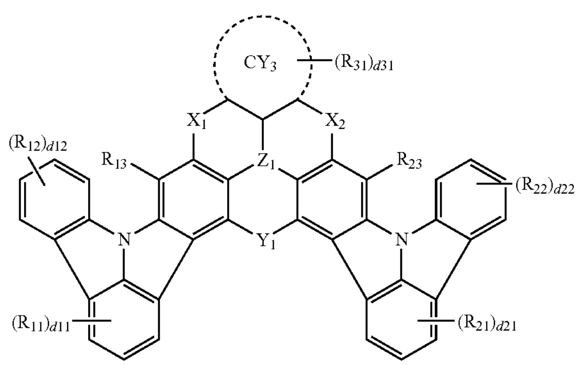
6-5
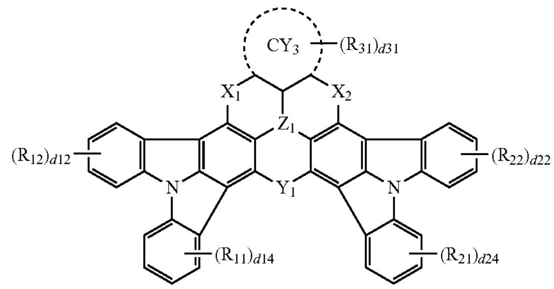
6-6
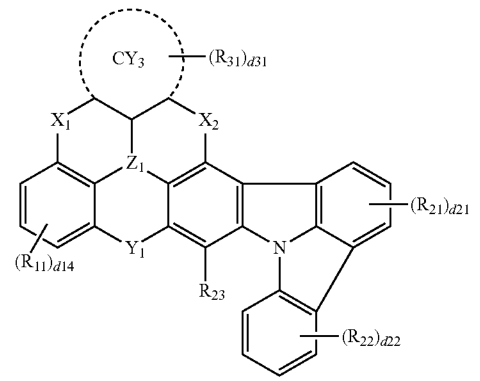
6-7
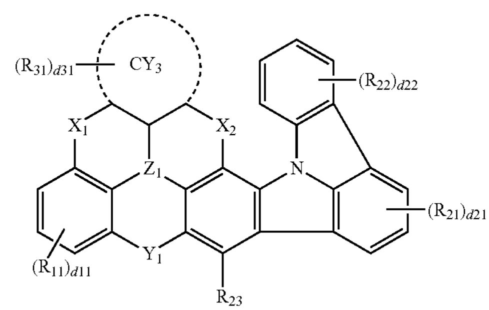
6-8
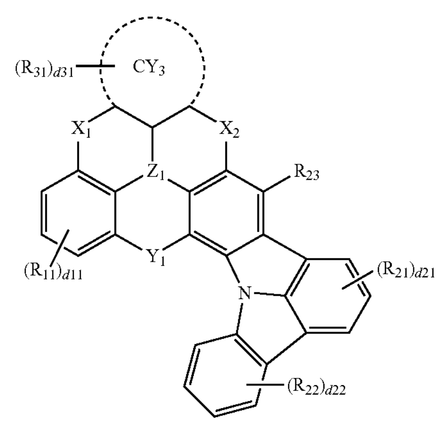

-continued 6-9

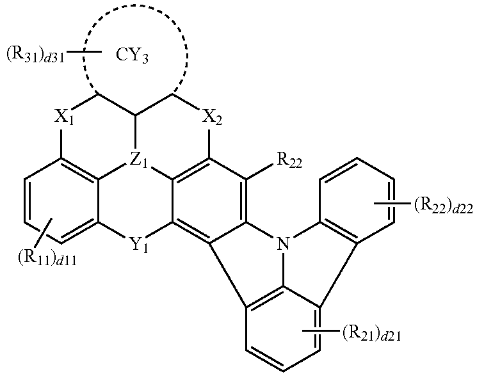

6-10

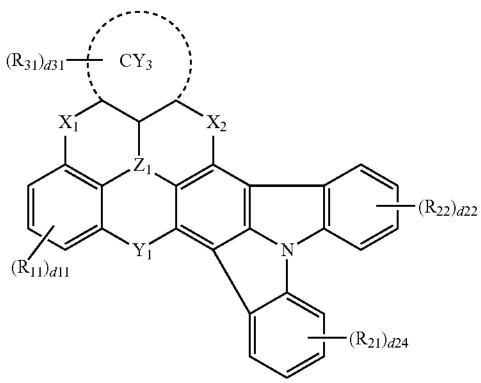

6-11

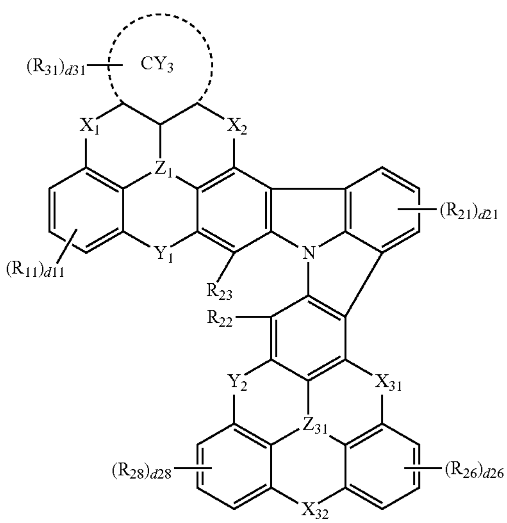

-continued 6-12

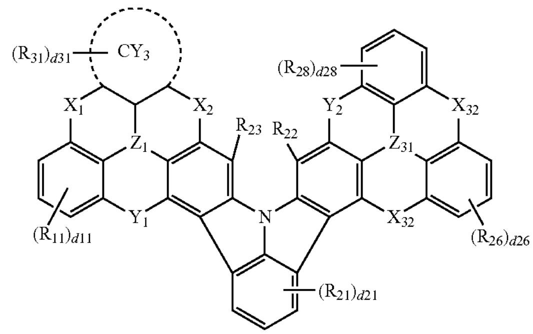

wherein, in Formulae 5-1 to 5-12 and 6-1 to 6-12, $R_{11}$ to $R_{13}$ are each the same as described in connection with $R_1$ in claim 1, $R_{21}$ to Res and $R_{26}$ to $R_{28}$ are each the same as described in connection with $R_2$ in claim 1, $R_{31}$ is the same as described in connection with $R_3$ in claim 1, d11, d15, d21, d26, and d28 are each independently an integer from 0 to 3, d12, d14, d22, d24, and d27 are each independently an integer from 0 to 4, d13, d23, and d25 are each independently an integer from 0 to 2, d31 is an integer from 0 to 20, $Y_2$ is the same as described in connection with $Y_1$ in claim 1, and $CY_3$, $X_1$, $X_2$, $Y_1$, $Z_1$, $X_{31}$, $X_{32}$, and $Z_{31}$ are each the same as described in connection with claim 1.

10. The condensed cyclic compound of claim 1, wherein $X_1$ is O, and $X_2$ is O;

$X_1$ is S, and $X_2$ is S;

$X_1$ is Se, and $X_2$ is Se;

$X_1$ is Te, and $X_2$ is Te;

$X_1$ is $N(R_{1a})$, and $X_2$ is $N(R_{2a})$; or $X_1$ is $C(R_{1a})(R_{1b})$, and $X_2$ is $C(R_{2a})(R_{2b})$, and $R_{1a}$, $R_{2a}$, $R_{1b}$, and $R_{2b}$ are each the same as described in claim 1.

11. The condensed cyclic compound of claim 1, wherein $R_1$ to $R_3$, $R_{1a}$ to $R_{4a}$, and $R_{1b}$ to $R_{3b}$ are each independently: hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group:

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{10}$ alkyl group, a cyclopentyl group, a cyclohexyl group, a cycloheptyl group, a cyclooctyl group, an adamantanyl group, a norbomanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2$ $(Q_{31})$, —$P(=O)(Q_{31})(Q_{32})$, or any combination thereof; or —$Si(Q_1)(Q_2)(Q_3)$, —$N(Q_1)(Q_2)$, —$B(Q_1)(Q_2)$, —$C(=O)(Q_1)$, —$S(=O)_2$ $(Q_1)$, or —$P(=O)(Q_1)(Q_2)$; and $Q_1$ to $Q_3$ and $Q_{31}$ to $Q_{33}$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a carbazole group, a dibenzofuranyl group, or a dibenzothiophenyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

12. The condensed cyclic compound of claim 1, wherein in Formulae 1-1 and 1-2, a group represented by

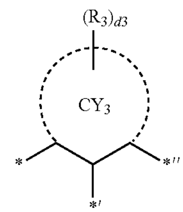

is represented by one of Formulae 7-1 to 7-3:

7-1

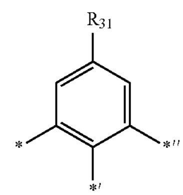

7-2

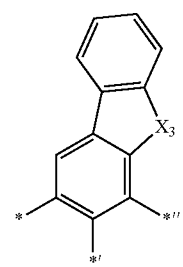

7-3

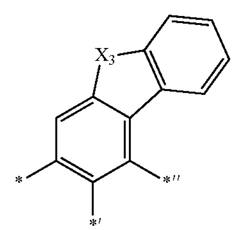

wherein, in Formulae 7-1 to 7-3,

* indicates a binding site to $X_1$ in Formula 1,

*' indicates a binding site to $Z_1$ in Formula 1,

*'' indicates a binding site to $X_2$ in Formula 1, $X_3$ is O, S, Se, Te, $N(R_{31})$, or $C(R_{31})(R_{32})$, and $R_{31}$ and $R_{32}$ are each the same as described in connection with $R_3$ in claim 1.

13. The condensed cyclic compound of claim 1, wherein in Formula 1-1, a moiety represented by

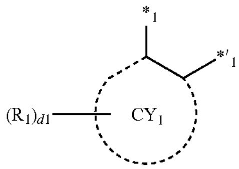
is represented by one of Formulae 3-1(1) to 3-10(1), and in Formula 1-1, a moiety represented by
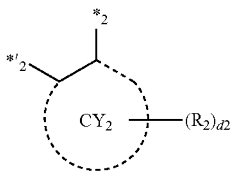
is represented by one of Formulae 4-1(1) to 4-10(1), wherein when the moiety represented by
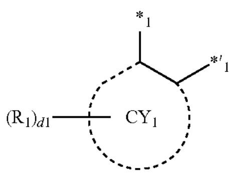
is represented by Formula 3-10(1) then the moiety represented by
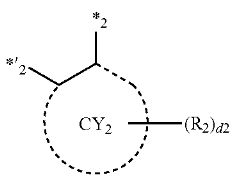
is not represented by Formula 4-10(1):
3-1(1)
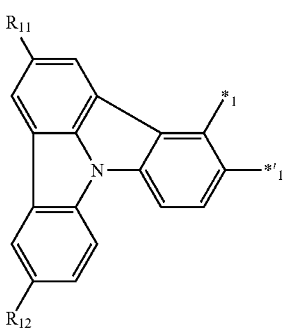
-continued
3-2(1)
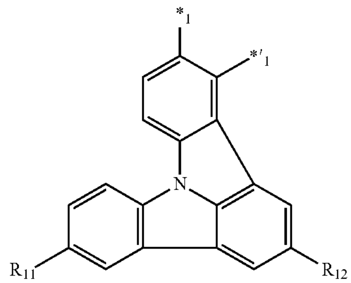
3-3(1)
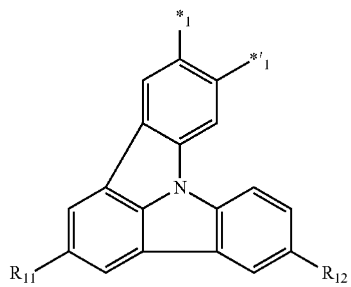
3-4(1)
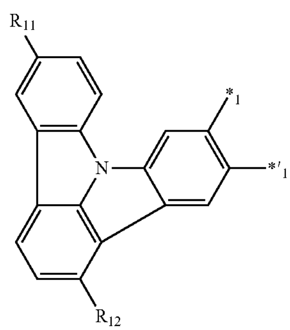
3-5(1)
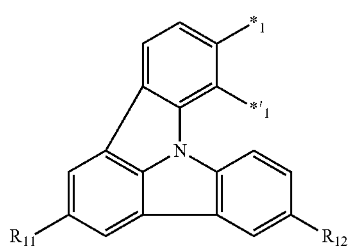
3-6(1)
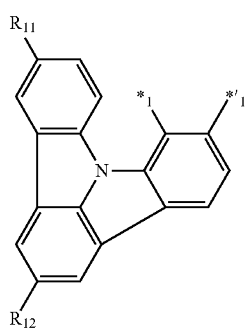

3-7(1)
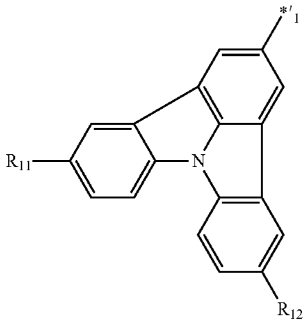
3-8(1)
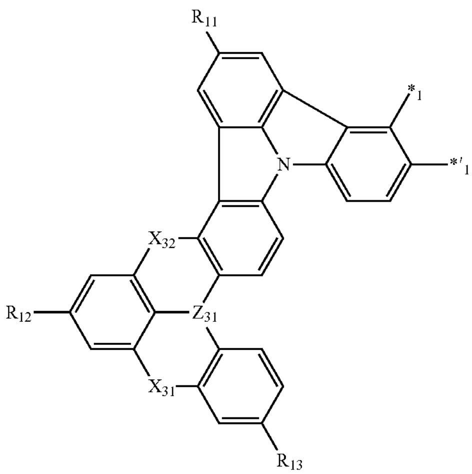
3-9(1)
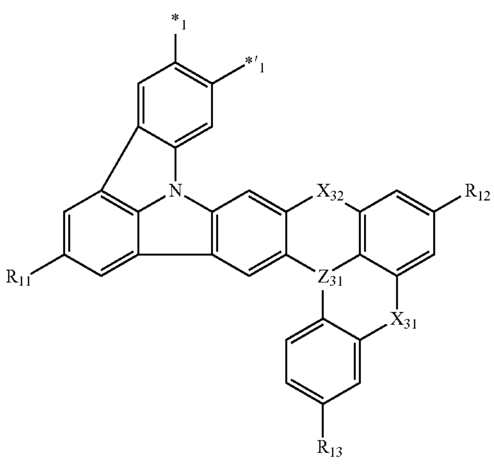
3-10(1)
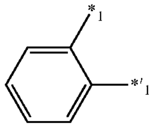
4-1(1)
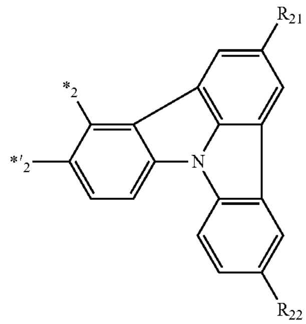
4-2(1)
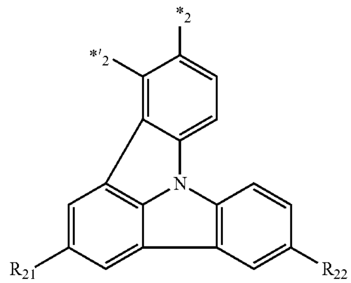
4-3(1)
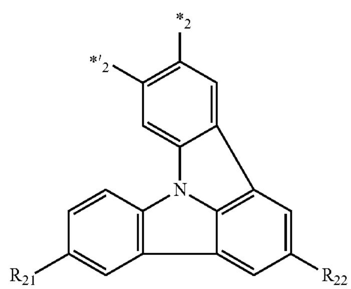
4-4(1)
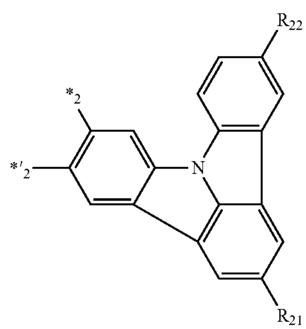
4-5(1)
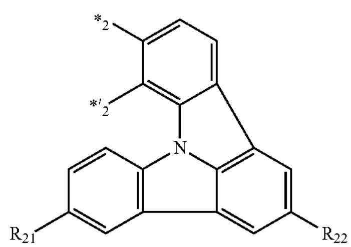

-continued 4-6(1)

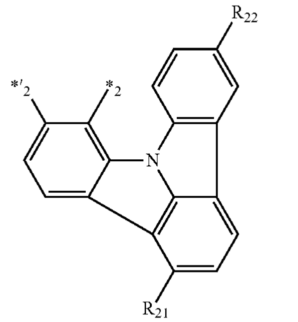

4-7(1)

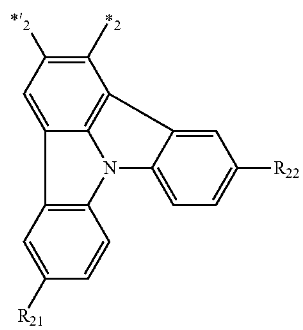

4-8(1)

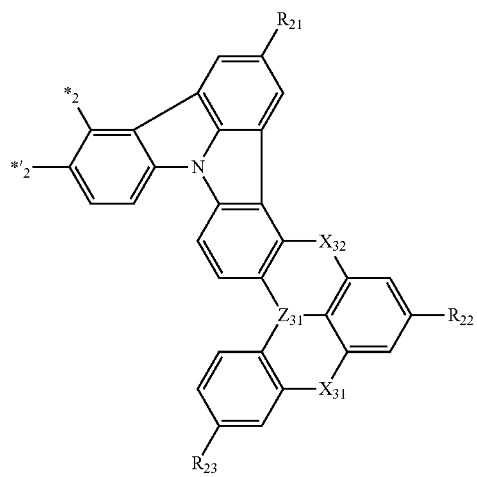

4-9(1)

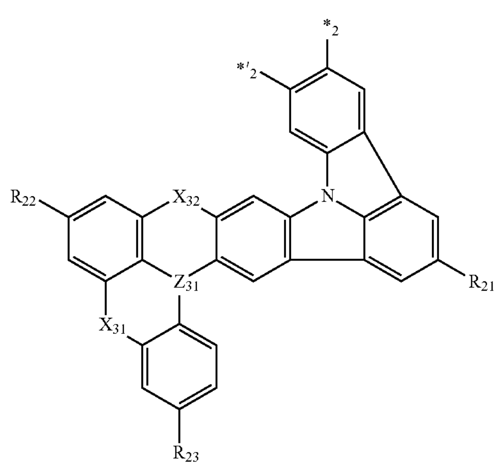

-continued 4-10(1)

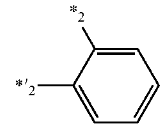

wherein, in Formulae 3-1(1) to 3-10(1) and 4-1(1) to 4-10(1), $R_{11}$ to $R_{13}$ are each the same as described in connection with $R_1$ in claim 1, $R_{21}$ to $R_{23}$ are each the same as described in connection with $R_2$ in claim 1, $*^1$ indicates a binding site to $X_1$ in Formula 1-1, $*'^1$ indicates a binding site to $Z_1$ in Formula 1-1, $*^2$ indicates a binding site to $X_2$ in Formula 1-1, and $*'^2$ indicates a binding site to $Z_1$ in Formula 1-1.

14. The condensed cyclic compound of claim 1, wherein in Formula 1-2, the moiety represented by

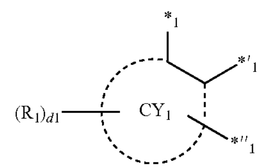

is represented by one of Formulae 3-11(1) to 3-16(1), and in Formula 1-2, the moiety represented by

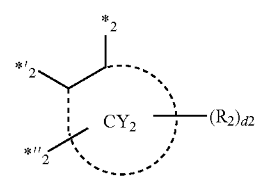

is represented by one of Formulae 4-11(1) to 4-16(1), wherein when the moiety represented by

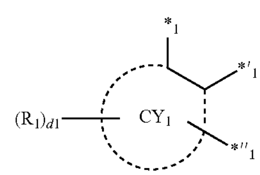

is represented by Formula 3-16(1) then the moiety represented by

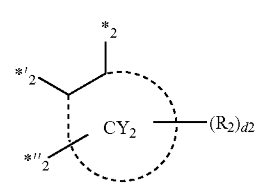

is not represented by Formula 4-16(1):
3-11(1)
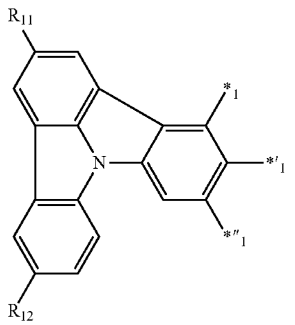
3-12(1)
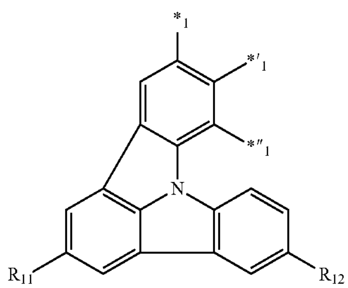
3-13(1)
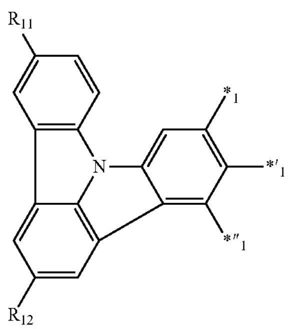
3-14(1)
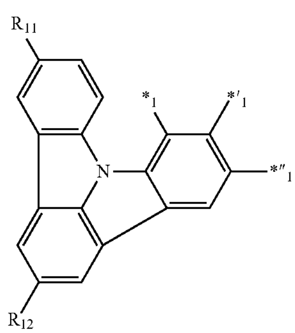
3-15(1)
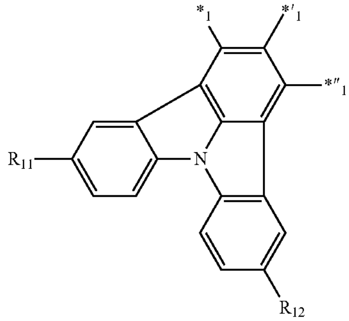
-continued
3-16(1)
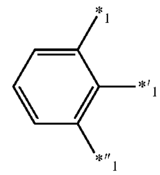
4-11(1)
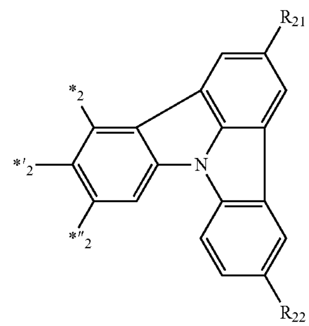
4-12(1)
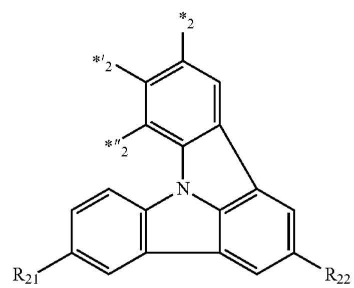
4-13(1)
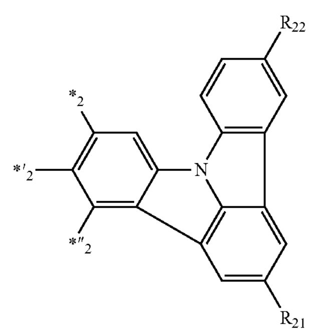
4-14(1)
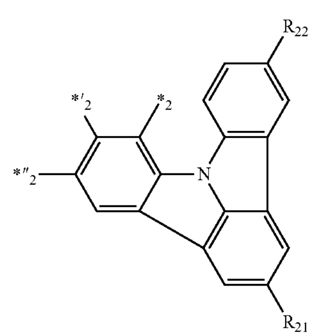

-continued 4-15(1)

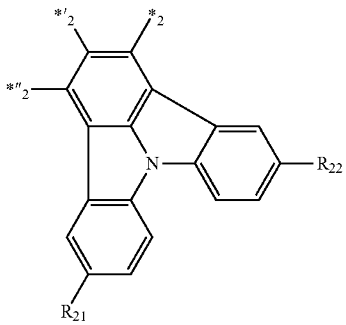

4-16(1)

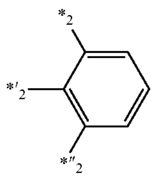

wherein, in Formulae 3-11(1) to 3-16(1) and 4-11(1) to 4-16(1), $R_{11}$ and $R_{12}$ are each the same as described in connection with $R_1$ in claim 1, $R_{21}$ and $R_{22}$ are each the same as described in connection with $R_2$ in claim 1, $*^1$ indicates a binding site to $X_1$ in Formula 1-2, $*'^1$ indicates a binding site to $Z_1$ in Formula 1-2, $*''^1$ indicates a binding site to $Y_1$ in Formula 1-2, $*^2$ indicates a binding site to $X_2$ in Formula 1-2, $*'^2$ indicates a binding site to $Z_1$ in Formula 1-2, and $*''^2$ indicates a binding site to $Y_1$ in Formula 1-2.

15. The condensed cyclic compound of claim 1, wherein the condensed cyclic compound represented by Formula 1-1 or 1-2 satisfies Equation 1:

$$E_R=[E(S_0@S_1)]-[E(S_0@S_0)]\leq 0.1\text{ eV} \quad \text{Equation 1}$$

wherein, in Equation 1, $E_R$ indicates a reorganization energy of the condensed cyclic compound, $[E(S_0@S_1)]$ indicates a ground state energy of the condensed cyclic compound having a stable structure in an excited singlet state, and $[E(S_0@S_0)]$ indicates a ground state energy of the condensed cyclic compound having a stable structure in a ground state.

16. The condensed cyclic compound of claim 1, wherein the condensed cyclic compound represented by Formula 1-1 or 1-2 is one of Compounds 1 to 102, 201 to 203, 301 to 369, 401 to 413, and 501 to 532:

1

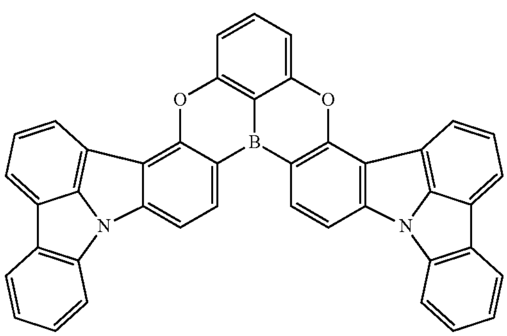

2

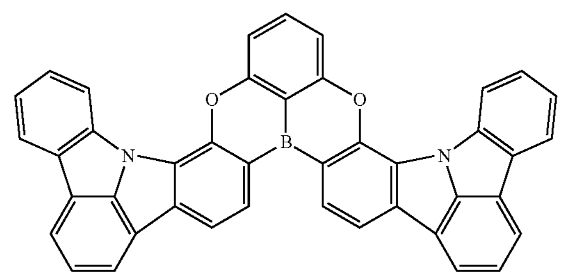

3

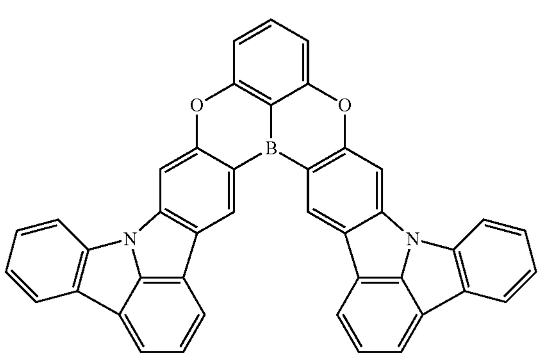

4

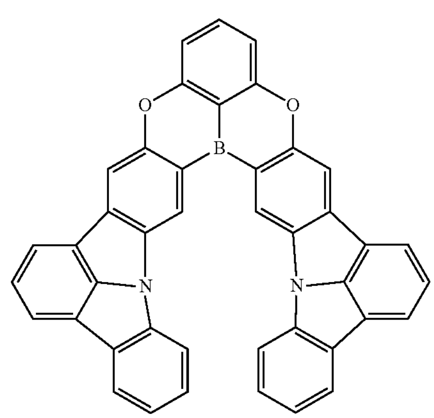

-continued
5
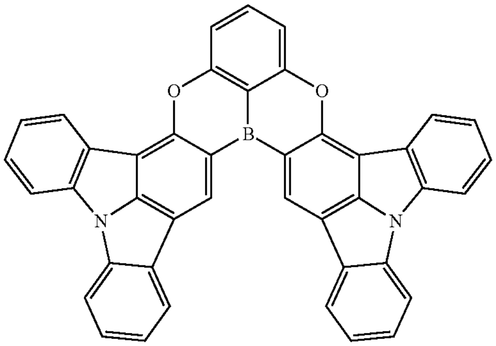
6
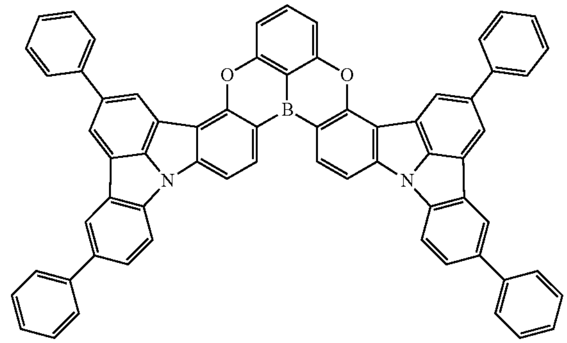
7
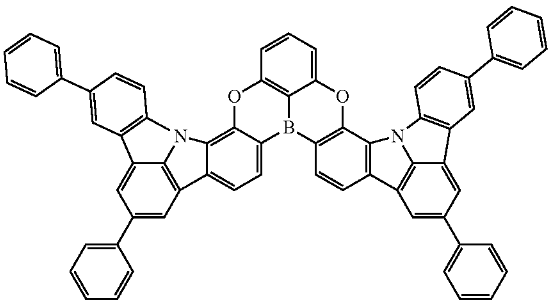
8
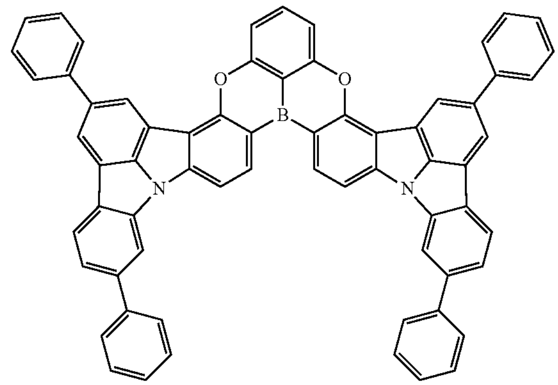
9
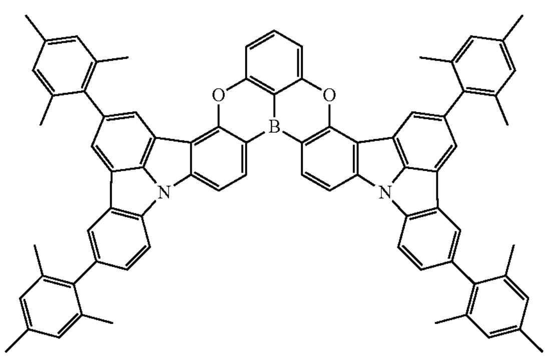
10
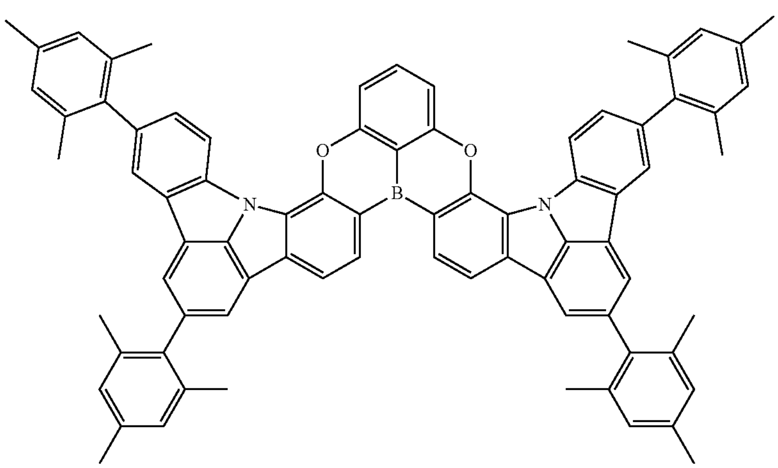

-continued
11
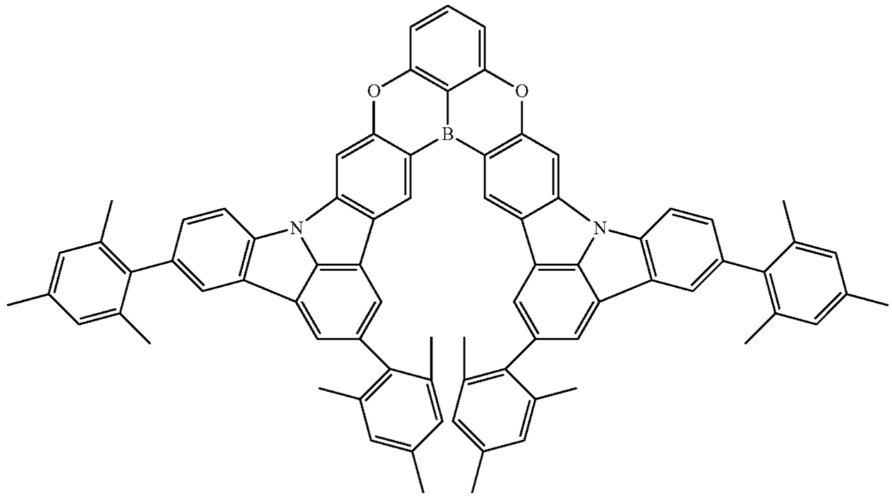
12
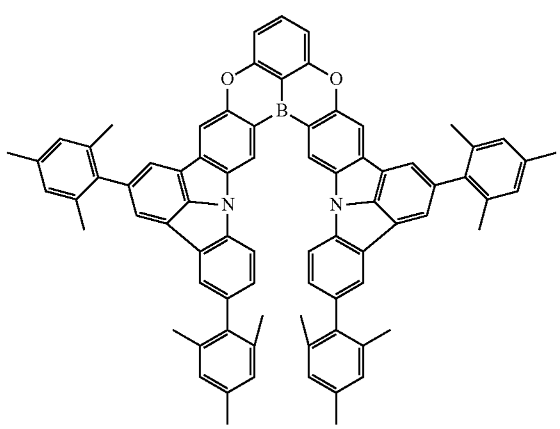
13
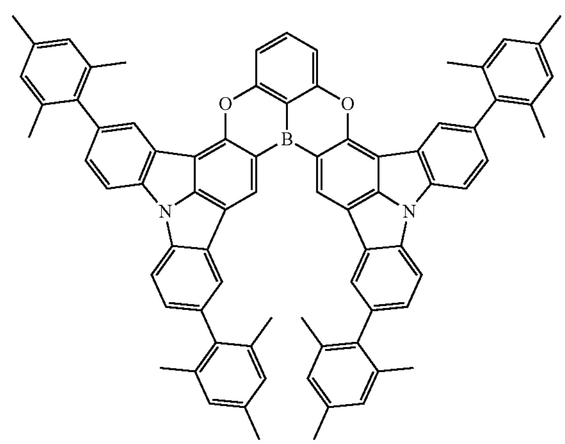
14
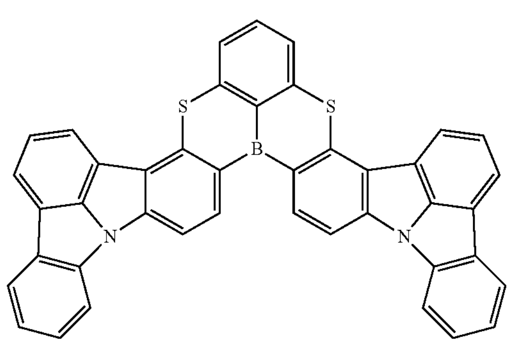
15
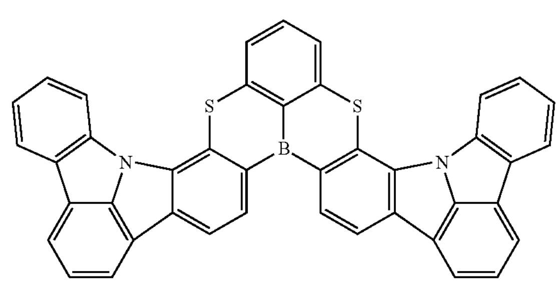

-continued
16
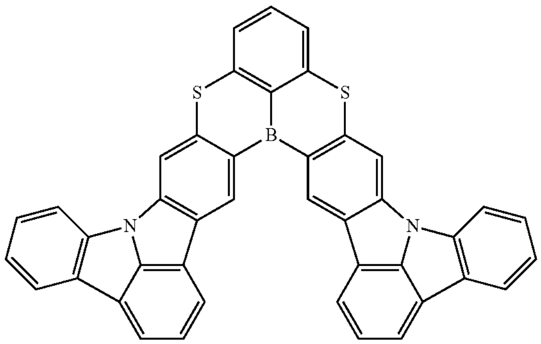
17
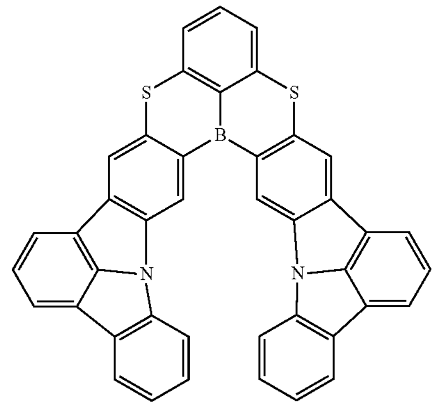
18
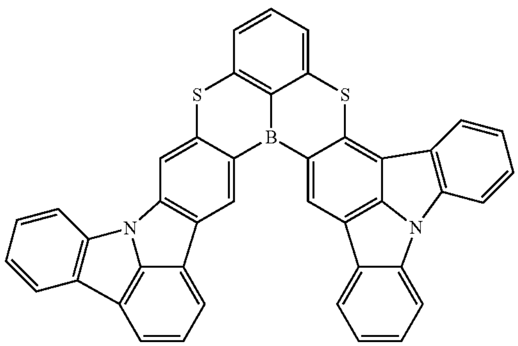
19
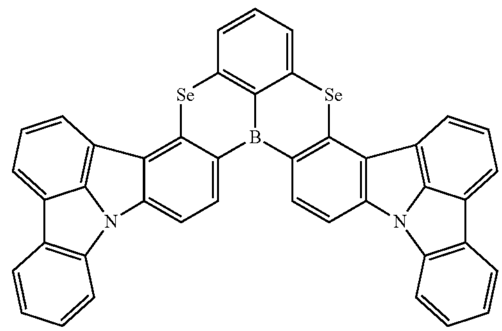
20
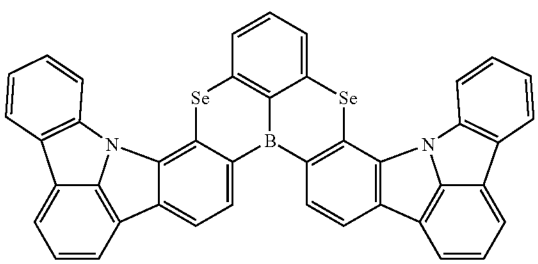
21
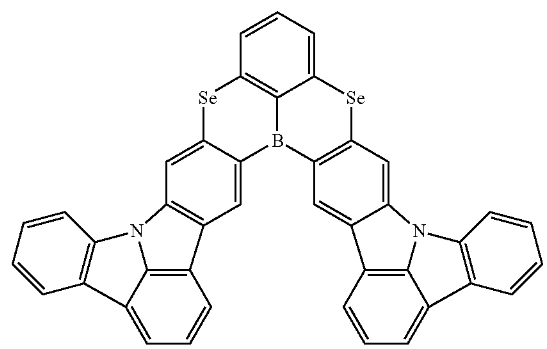
22
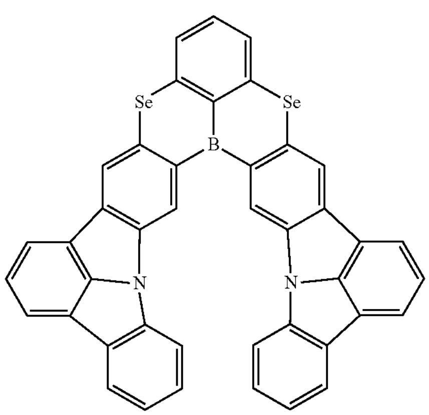
23
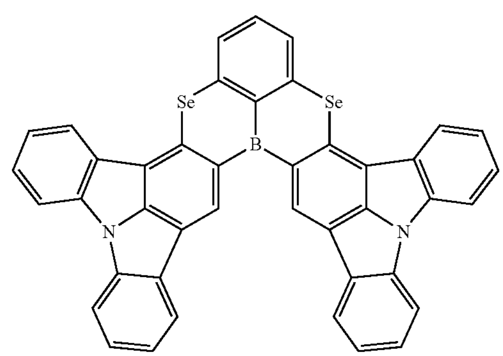

-continued
24
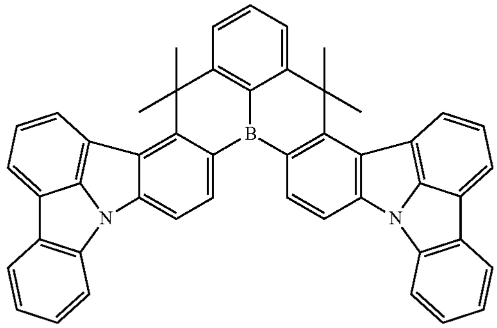
25
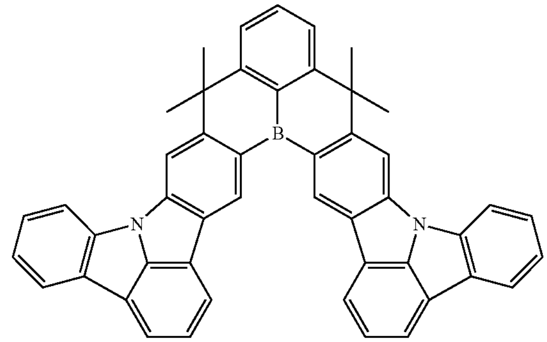
26
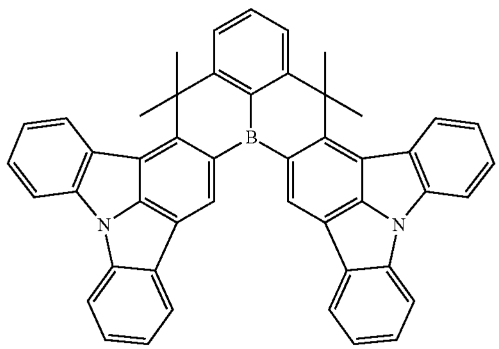
27
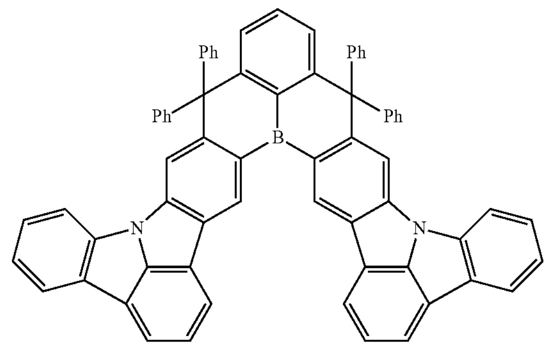
28
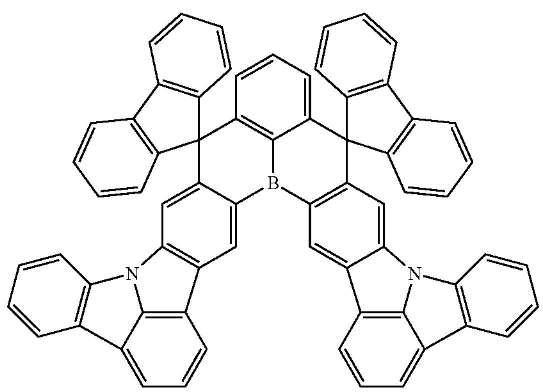
29
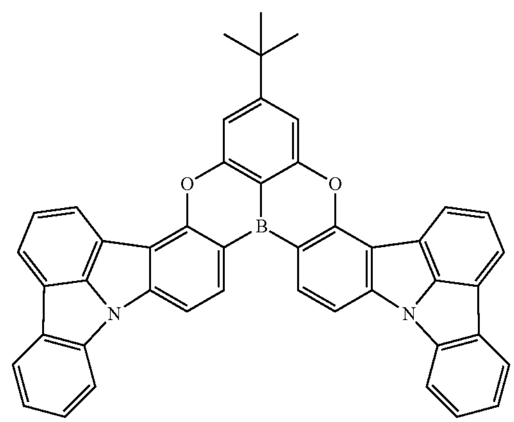
30
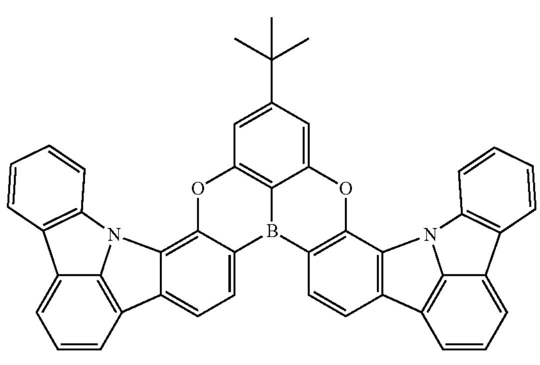
31
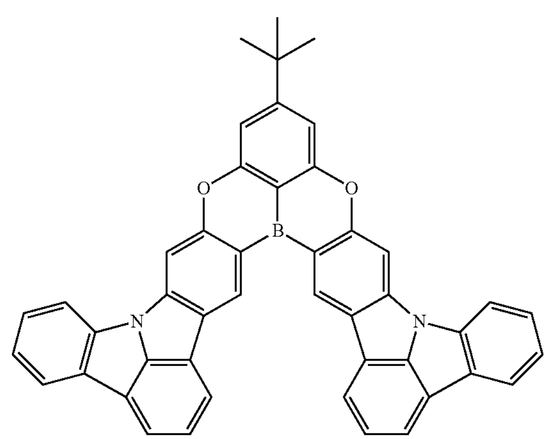

-continued
32
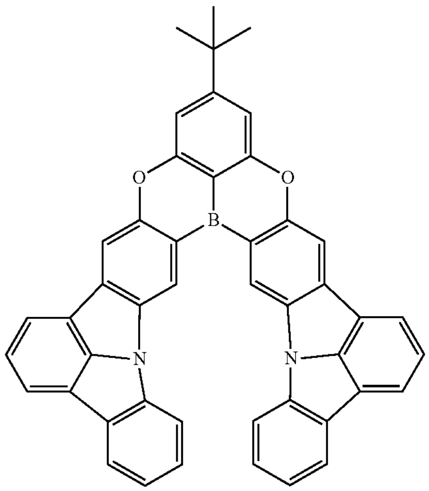
33
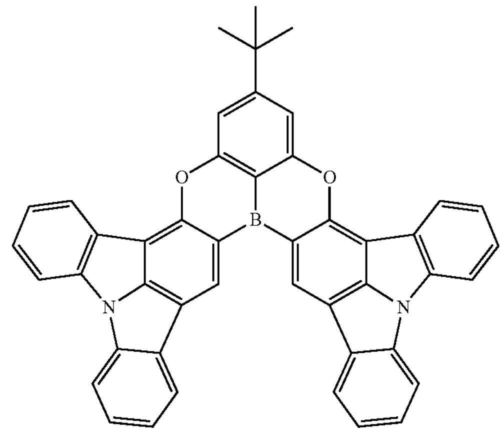
34
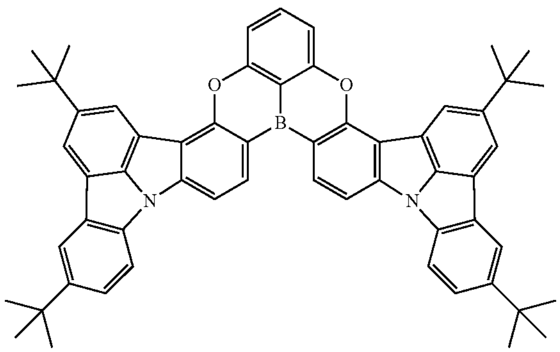
35
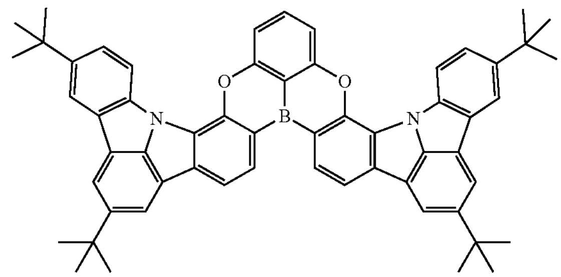
36
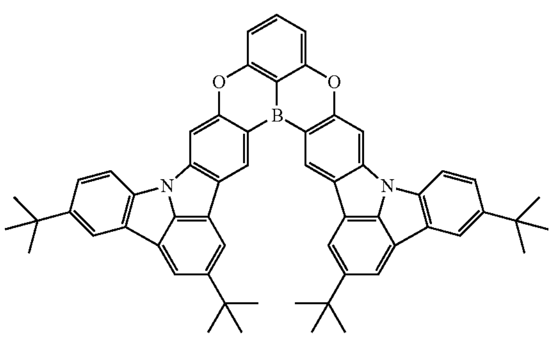
37
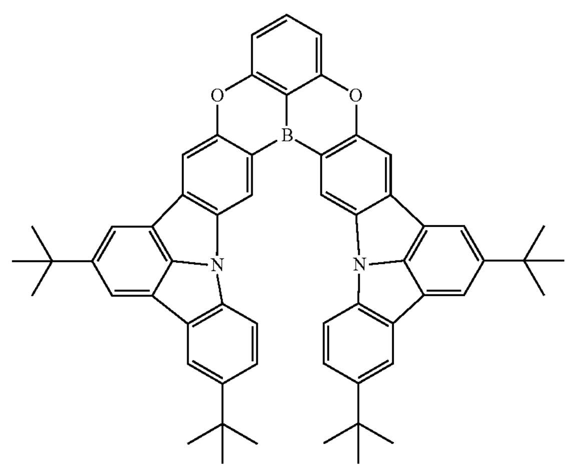

-continued
38
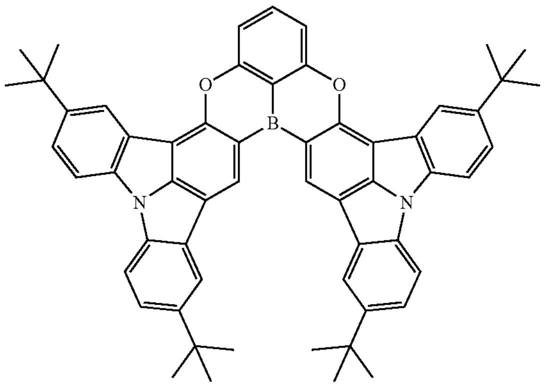
39
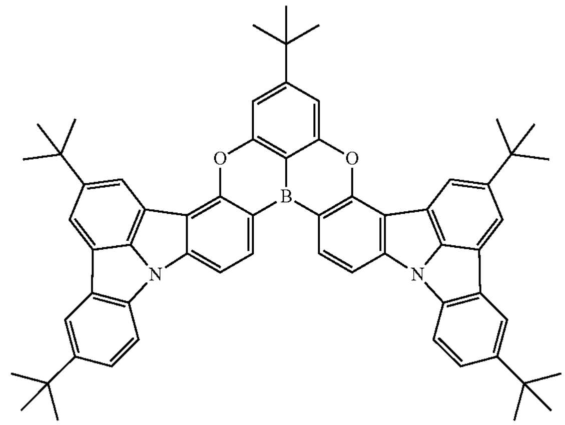
40
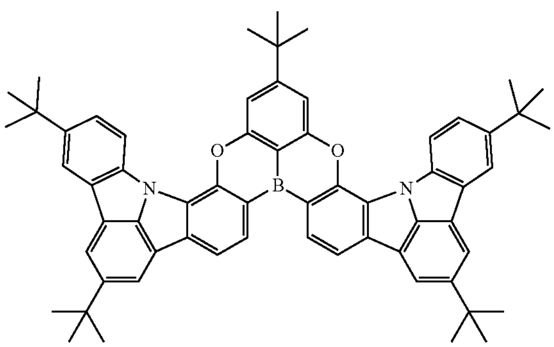
41
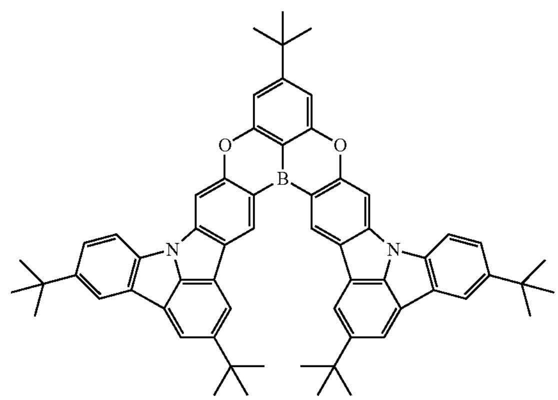
42
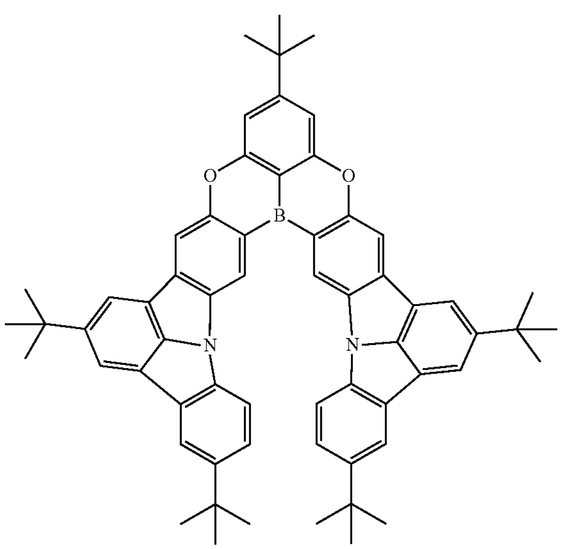
43
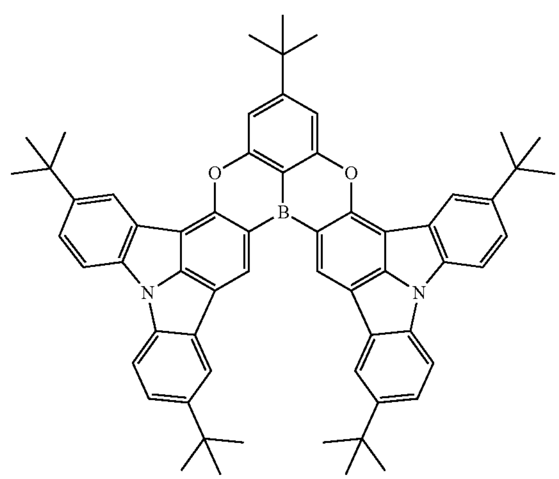

-continued
44
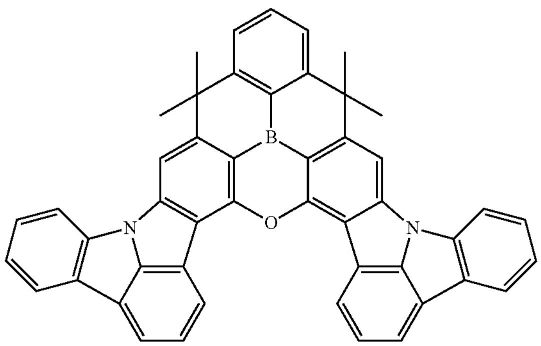
45
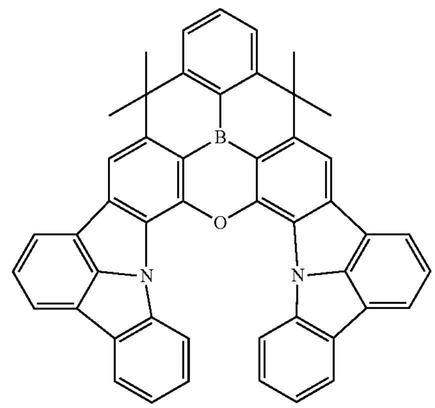
46
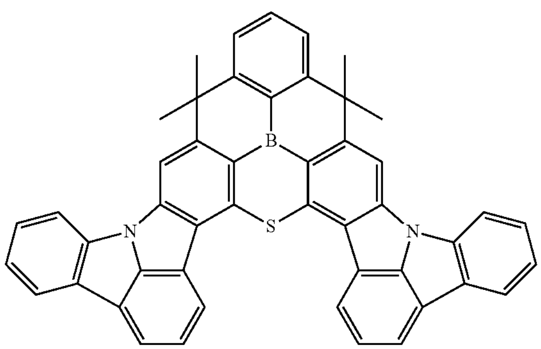
47
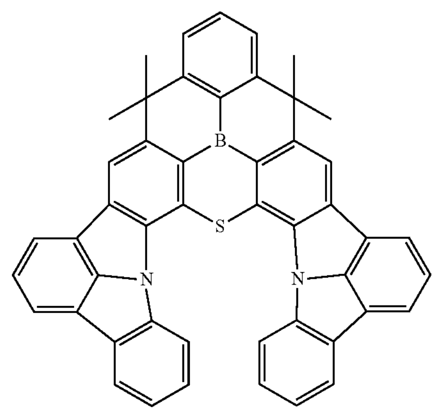
48
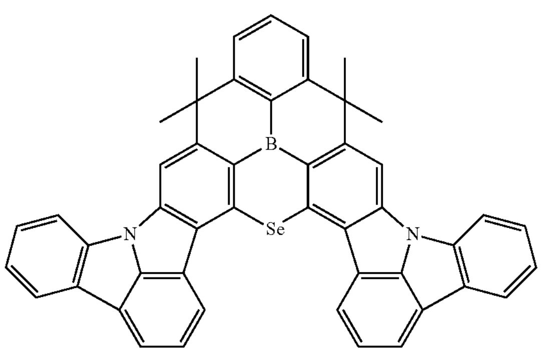
49
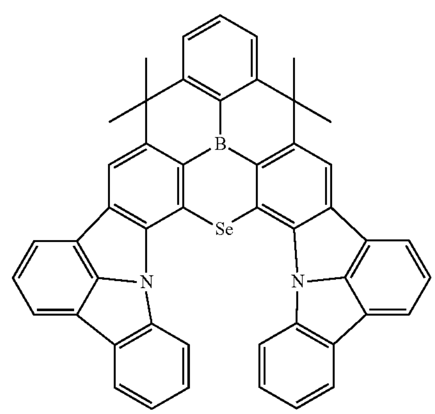
50
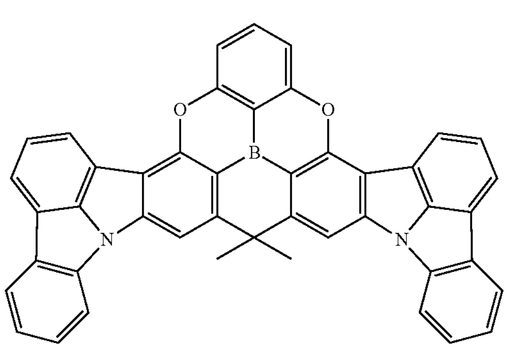
51
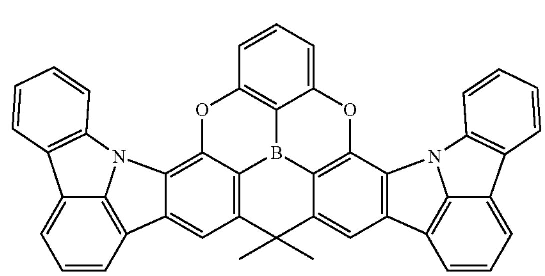

-continued
52
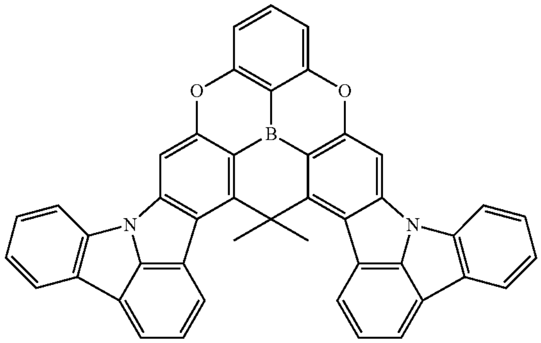
53
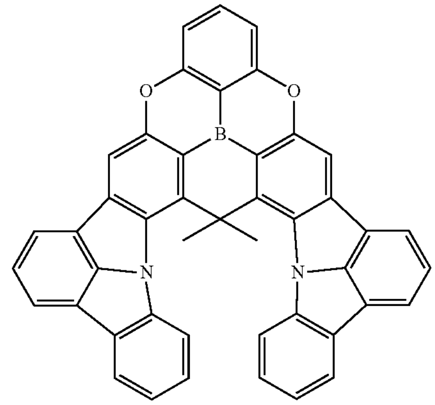
54
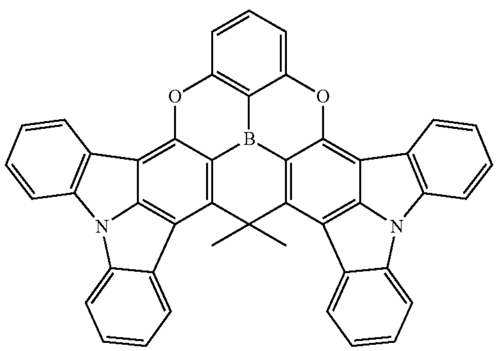
55
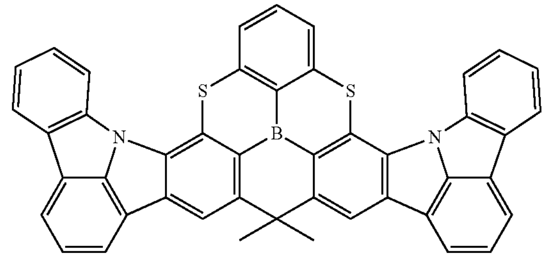
56
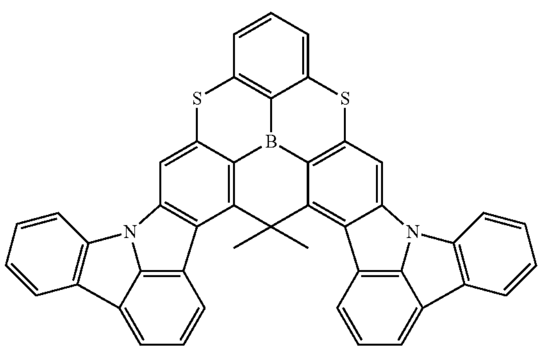
57
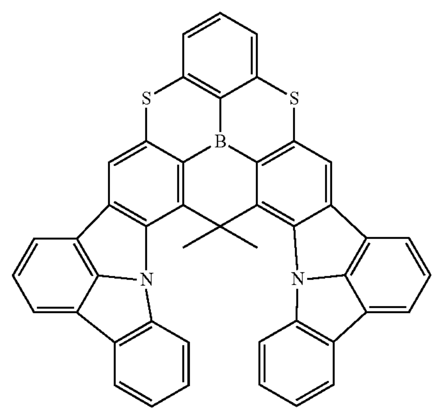
58
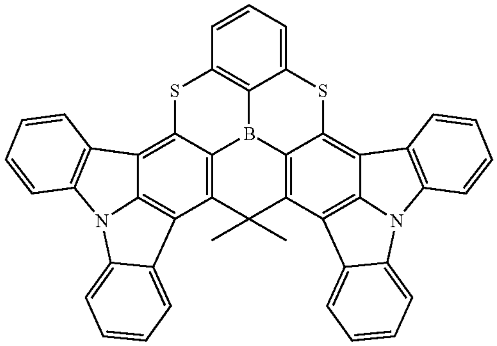
59
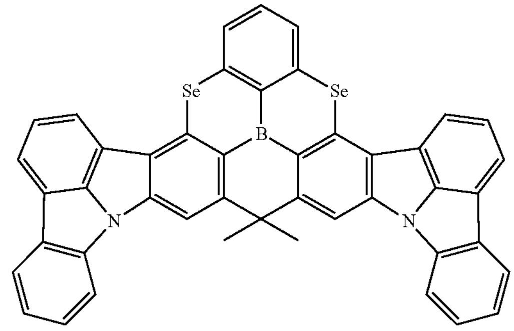

-continued
60
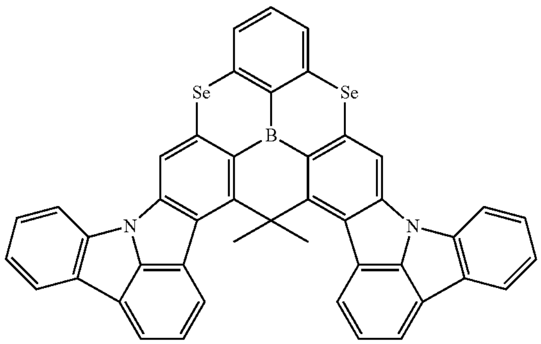
61
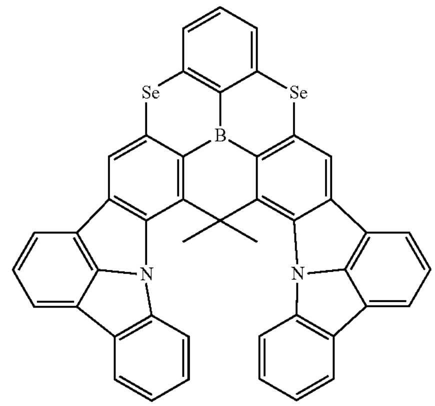
62
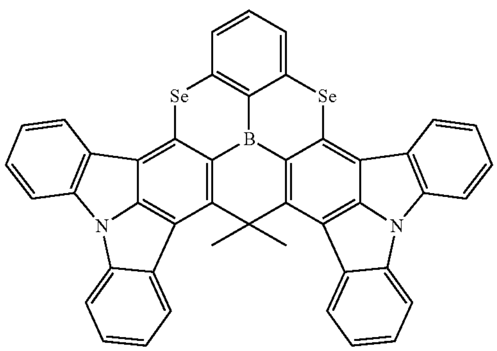
63
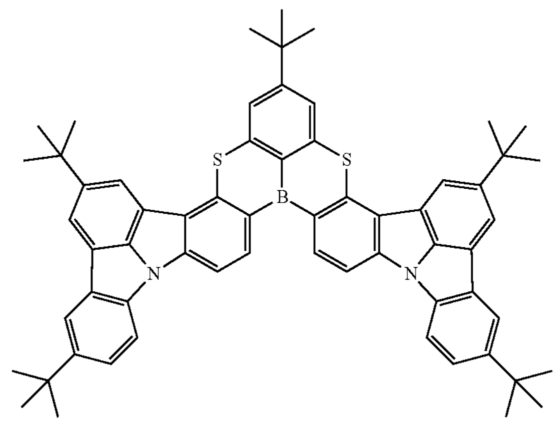
64
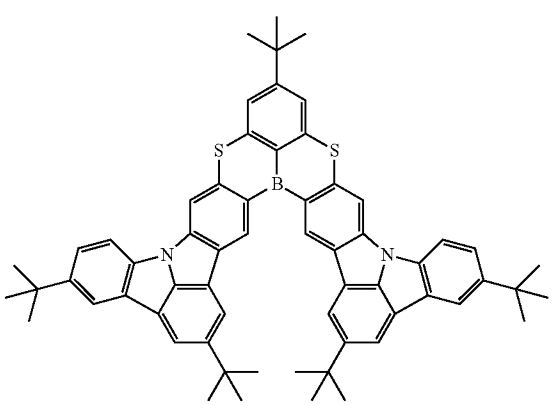
65
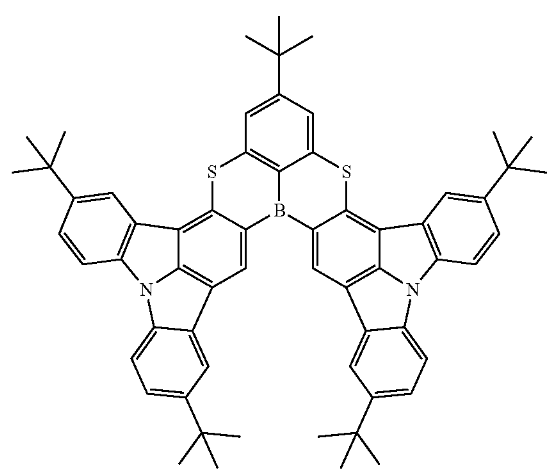

-continued
66
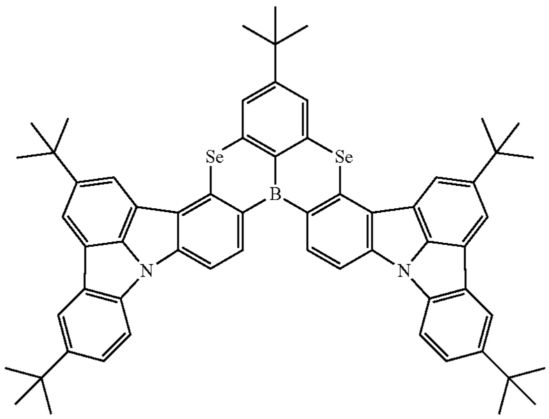
67
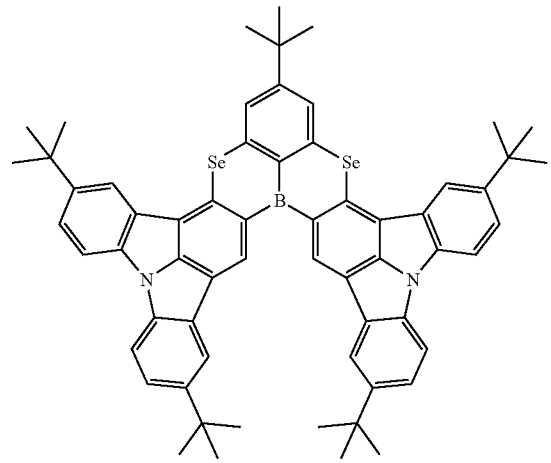
68
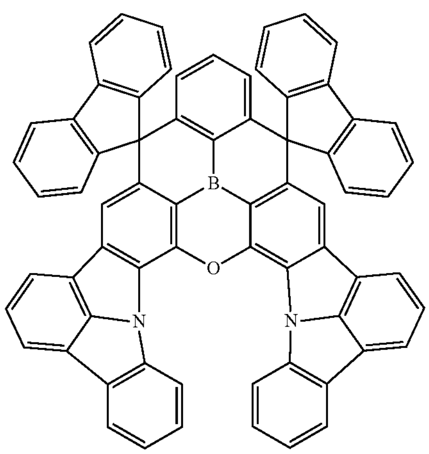
69
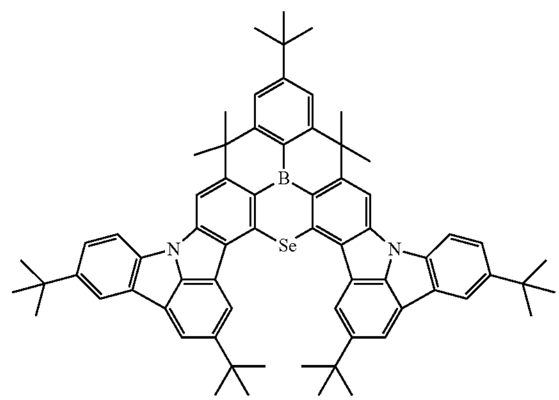
70
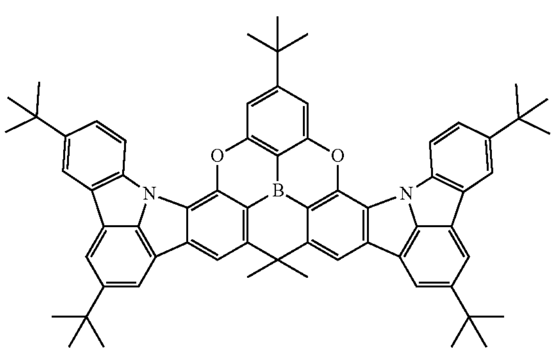
71
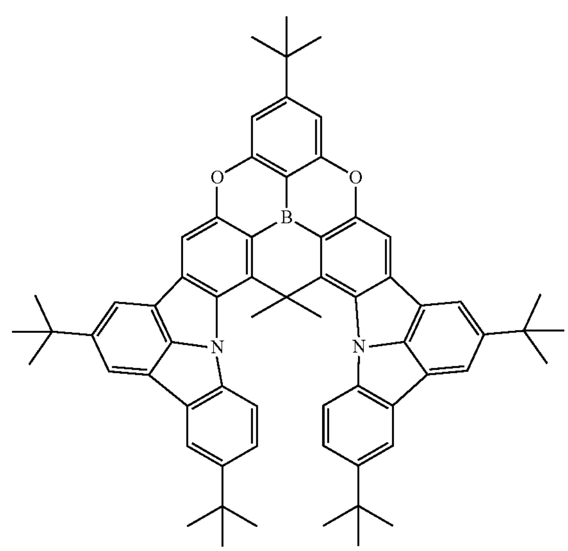

-continued
72
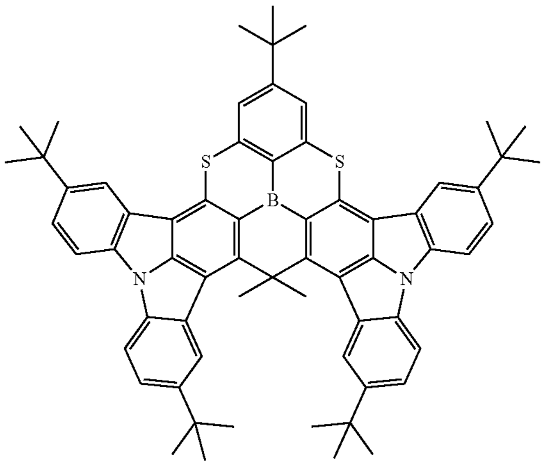
73
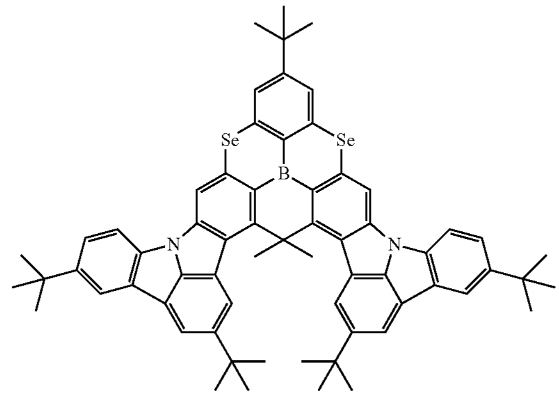
74
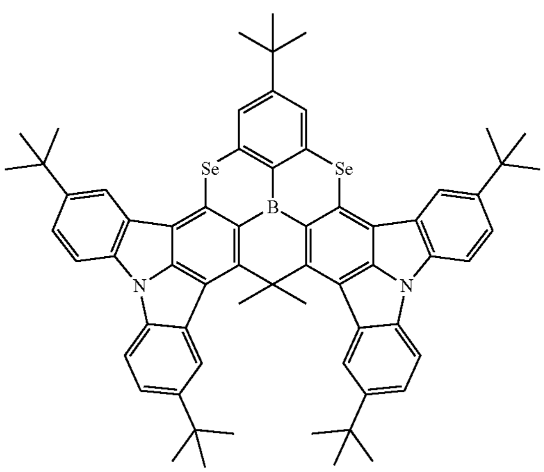
75
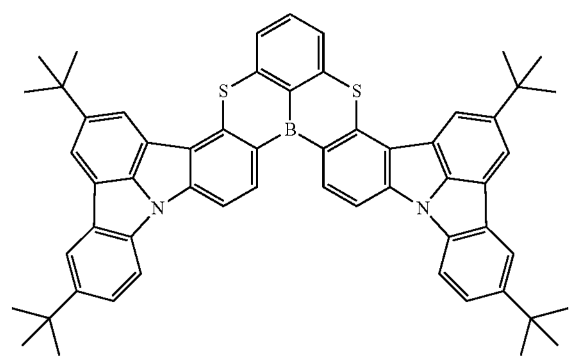
76
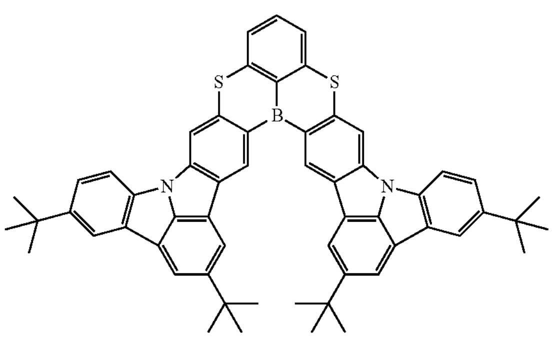
77
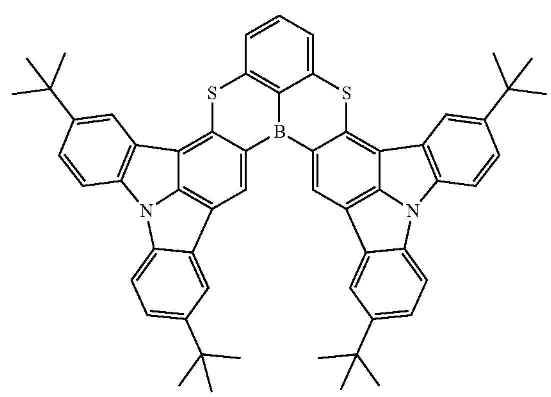

-continued
78
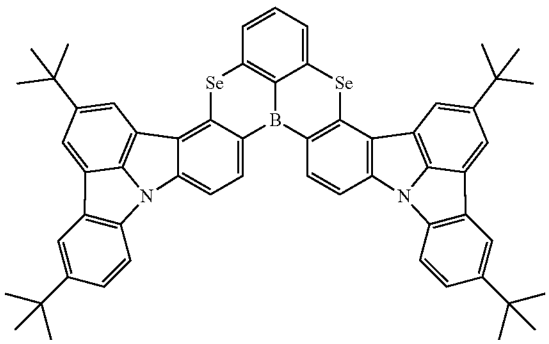
79
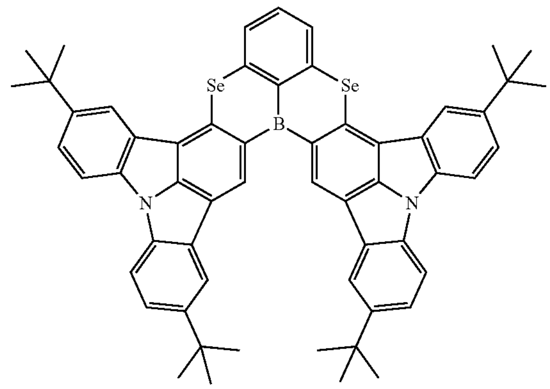
80
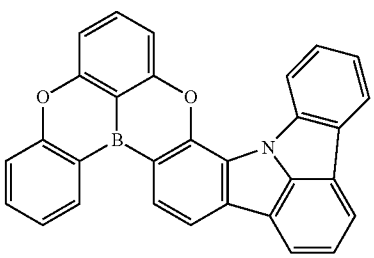
81
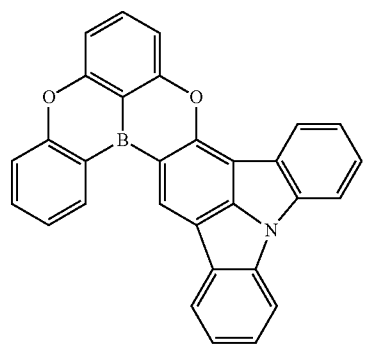
82
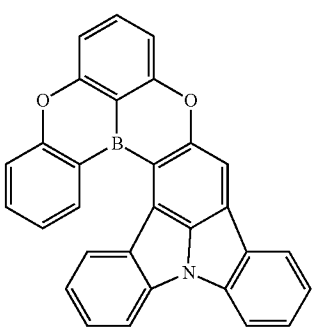
83
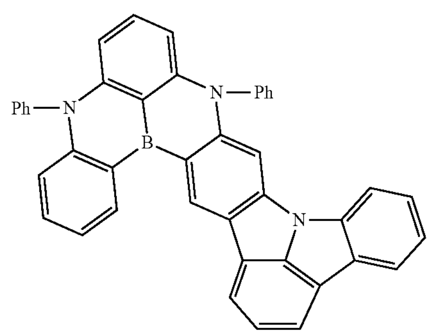
84
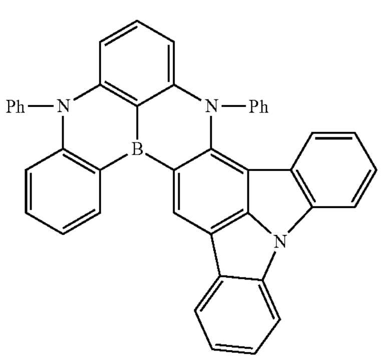
85
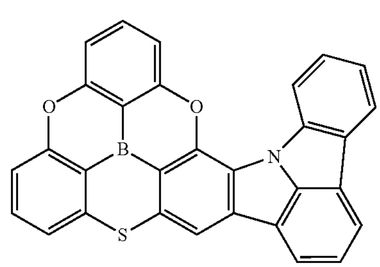

-continued
86
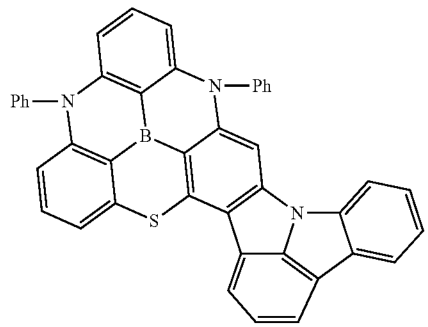
87
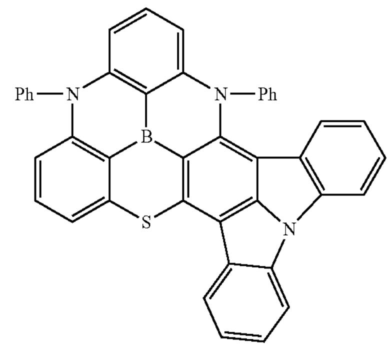
88
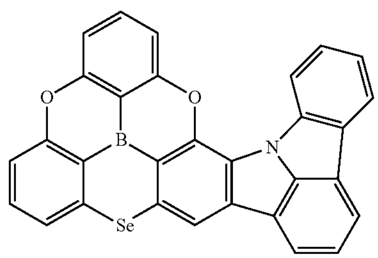
89
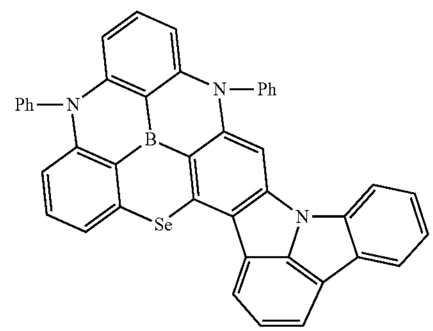
90
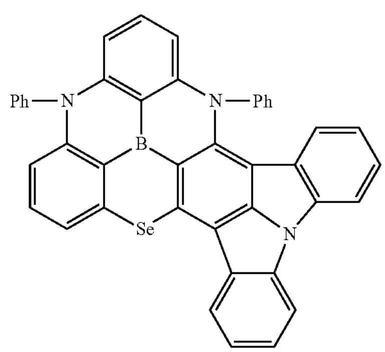
91
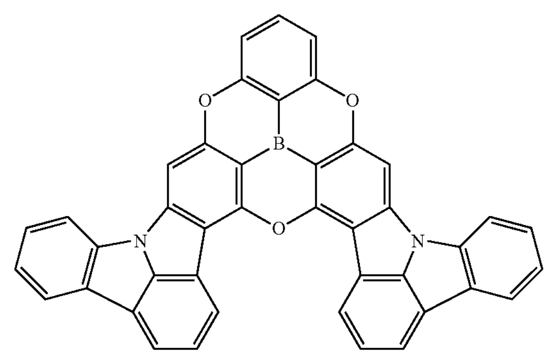
92
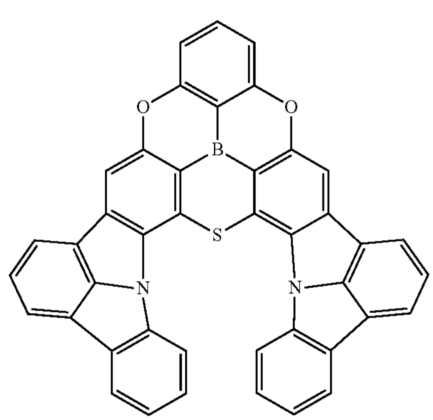
93
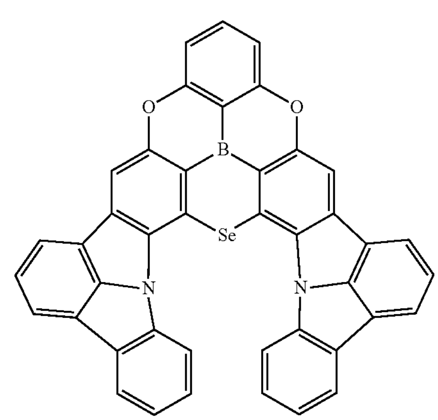

-continued
94
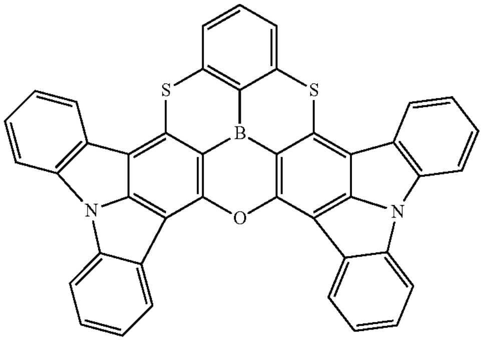
95
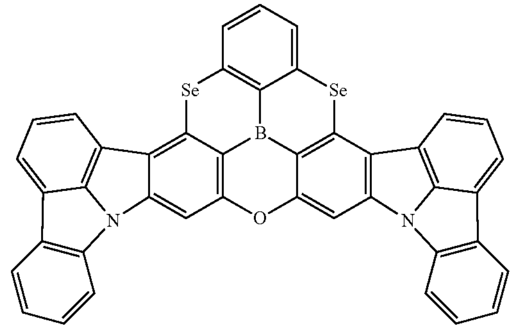
96
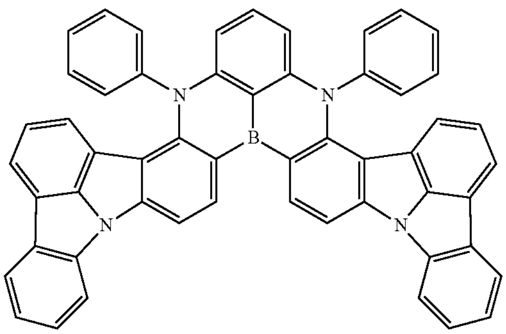
97
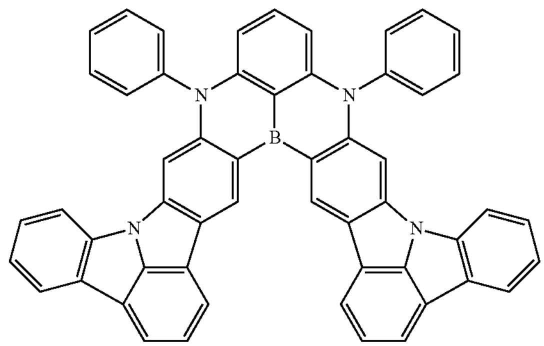
98
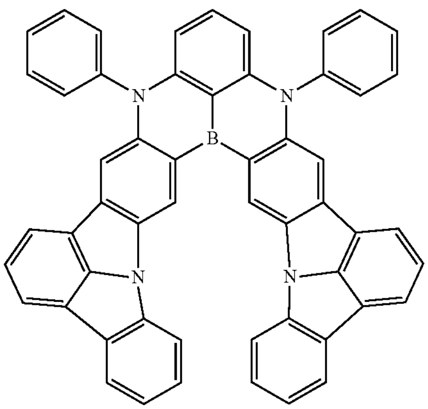
99
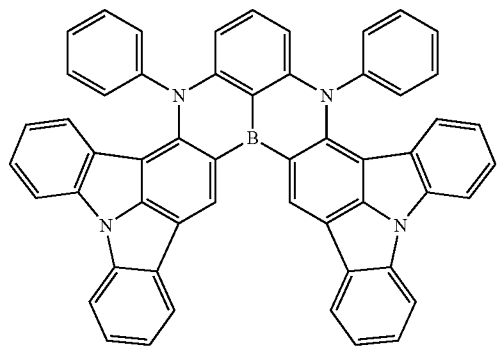
100
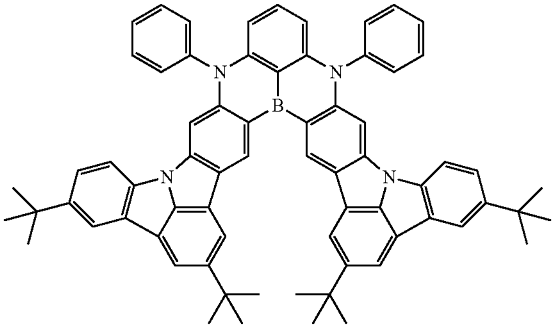
101
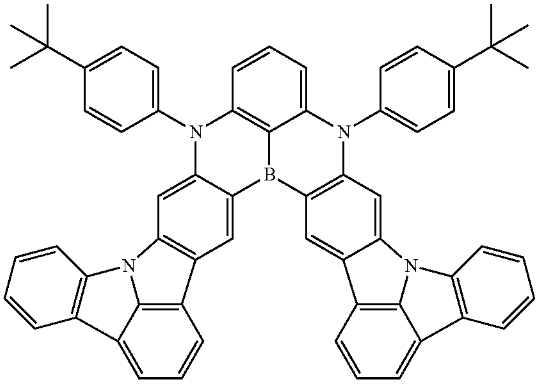

-continued
102
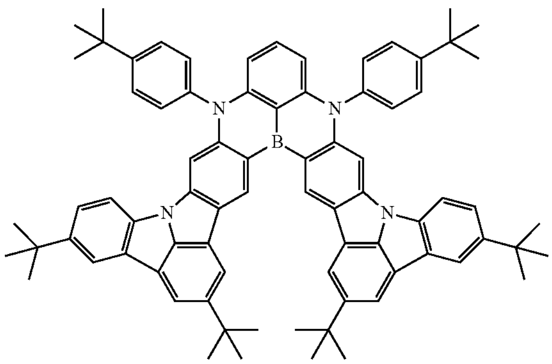
201
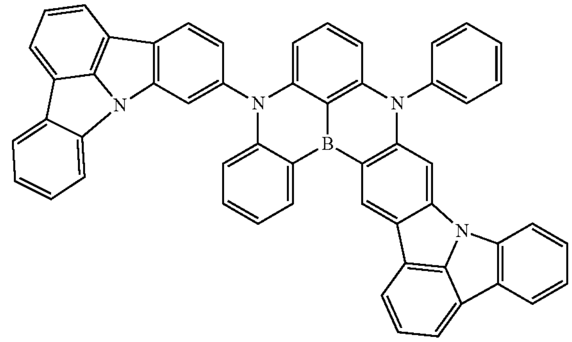
202
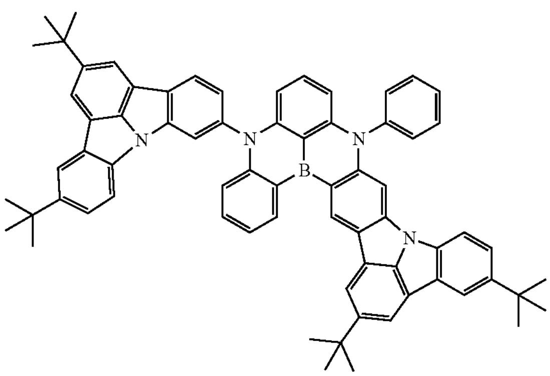
203
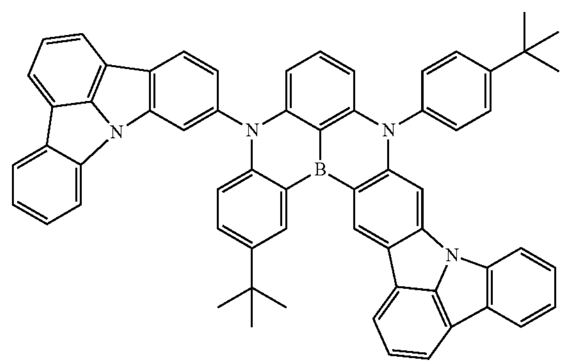
301
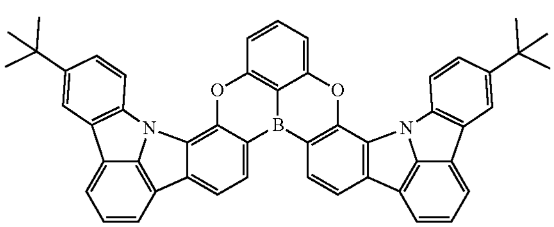
302
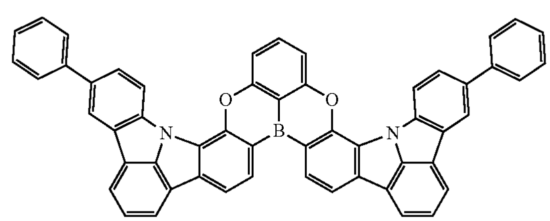
303
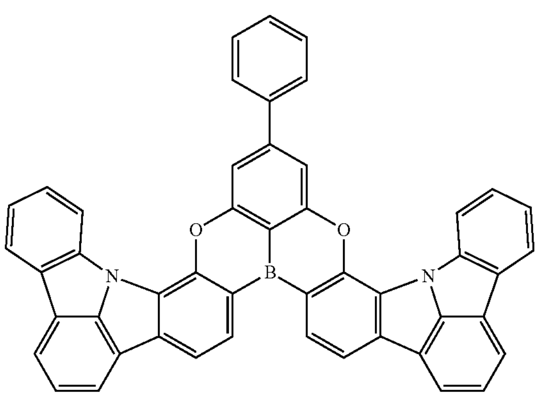
304
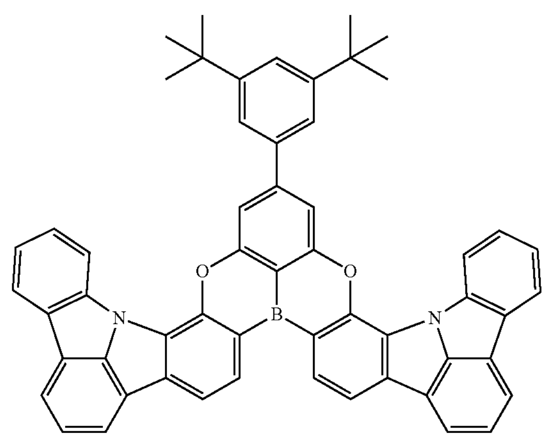

-continued
305
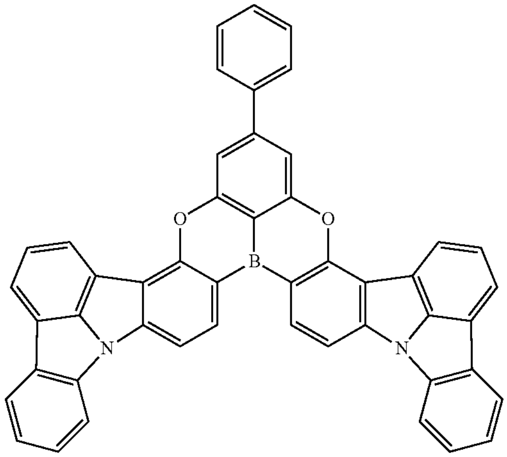
306
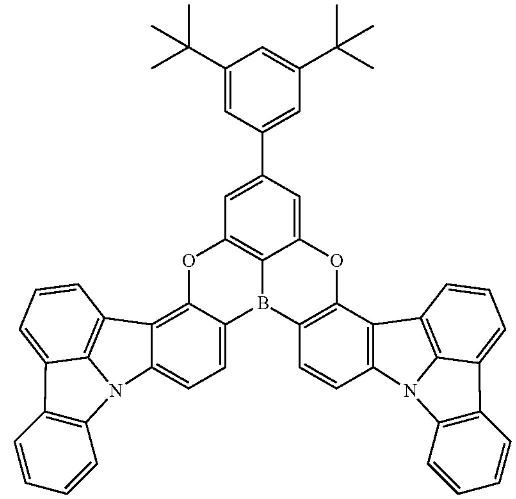
307
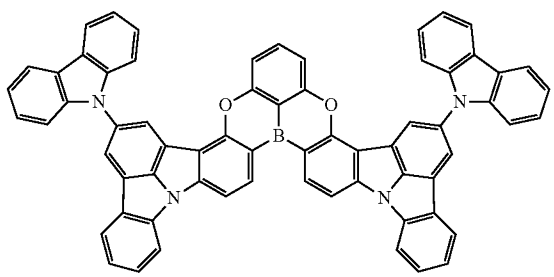
308
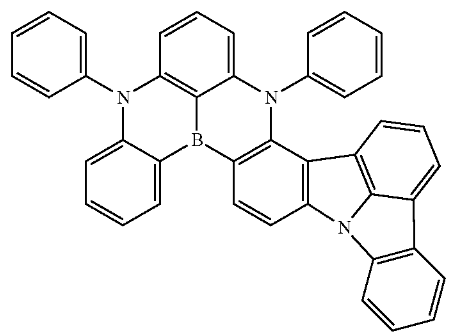
309
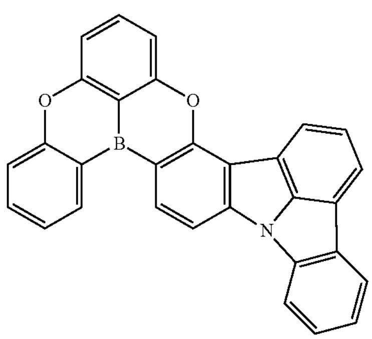
310
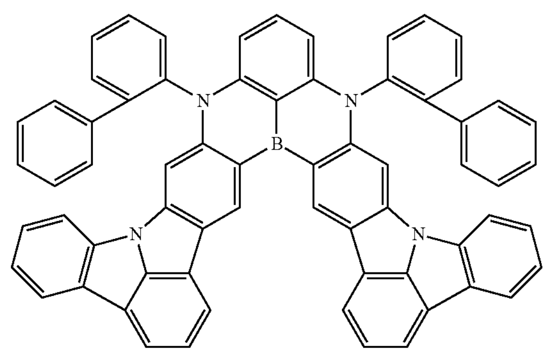
311
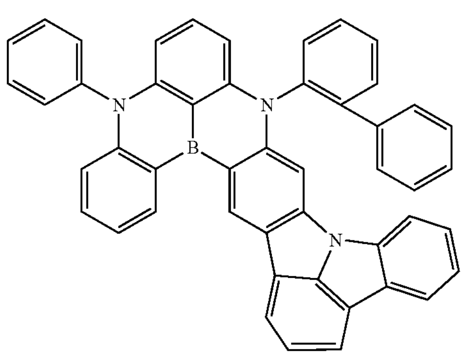
312
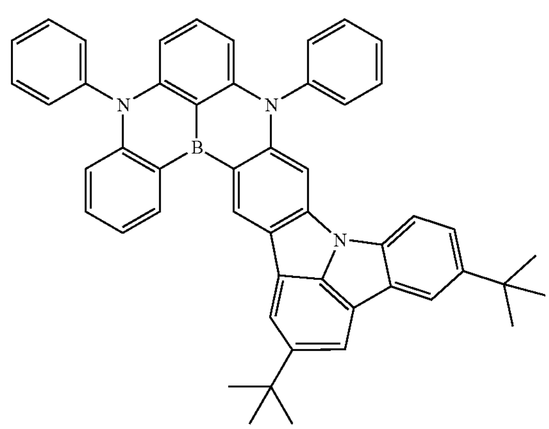

-continued
313
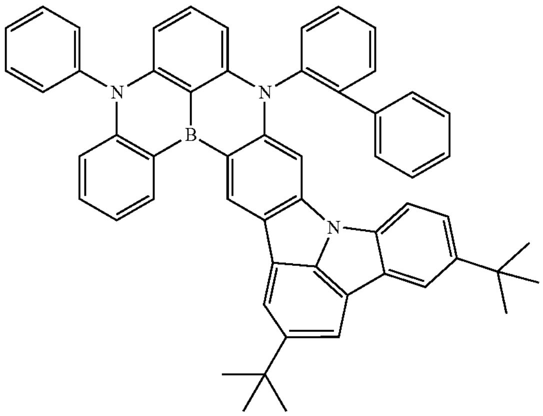
314
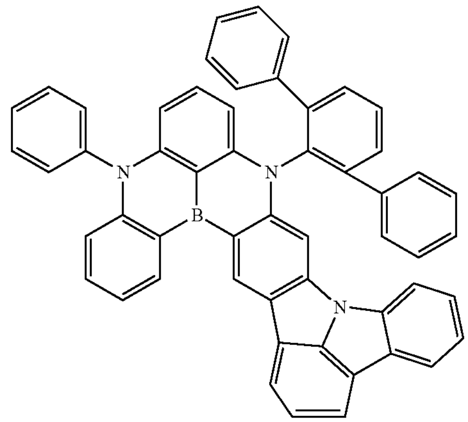
315
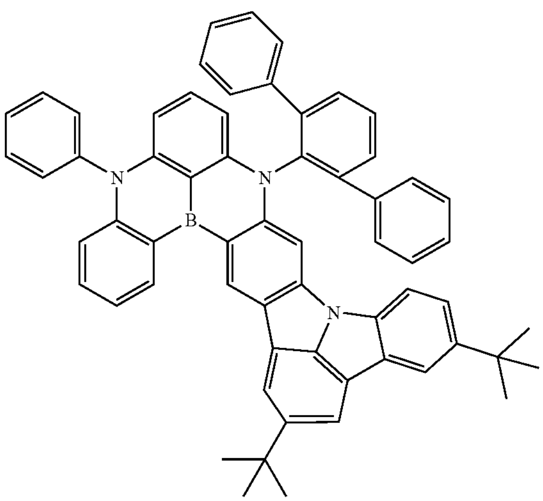
316
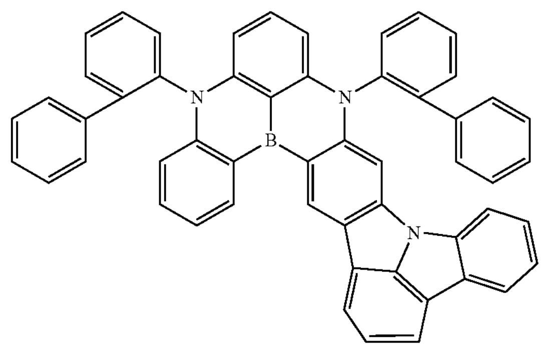
317
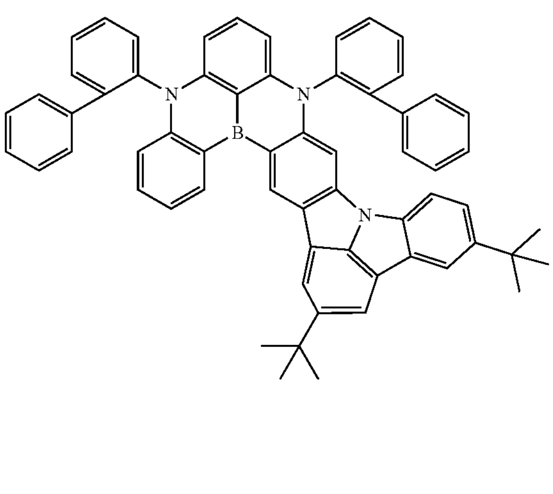
318
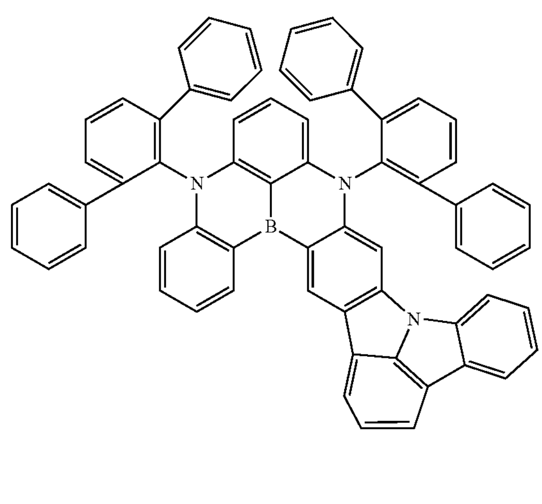

-continued
319
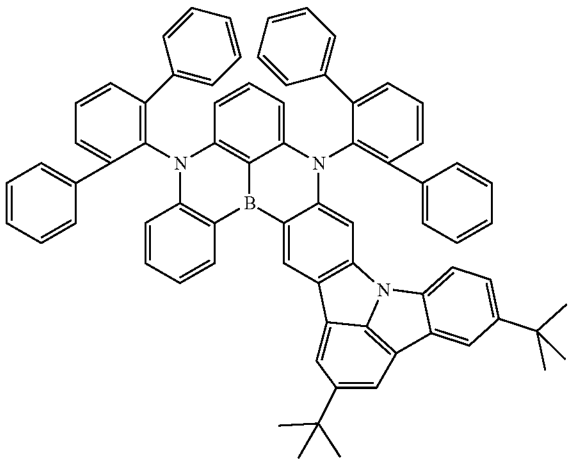
320
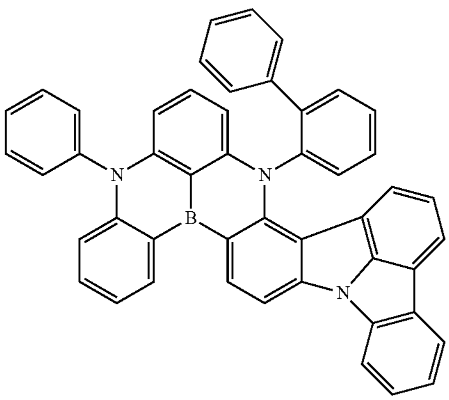
321
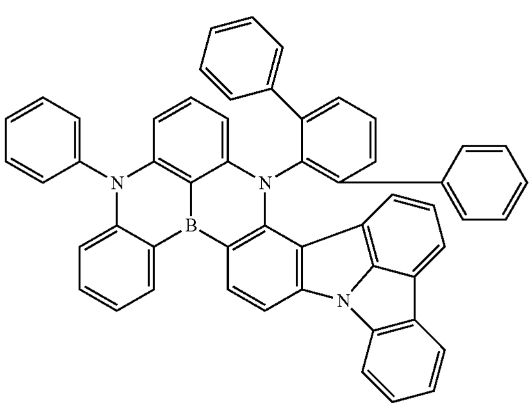
322
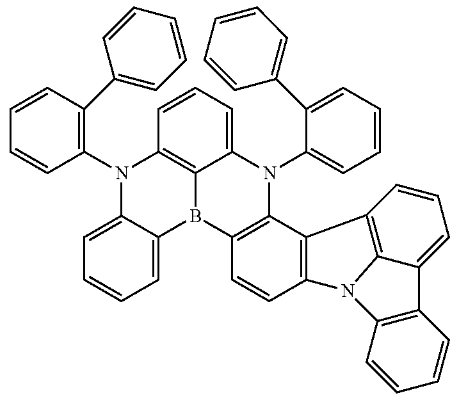
323
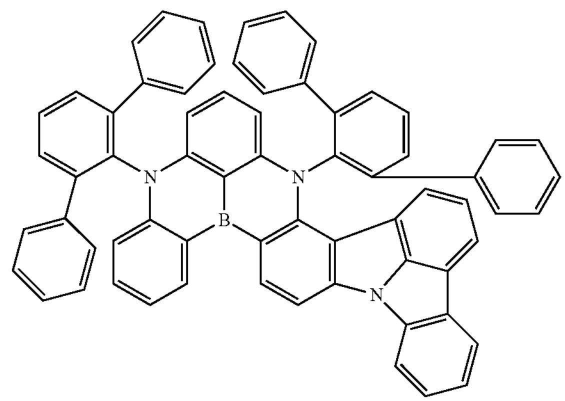
324
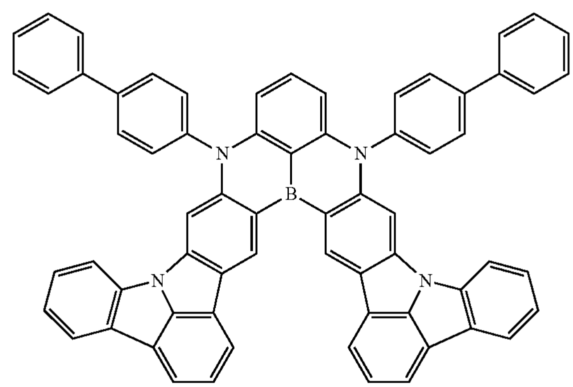
325
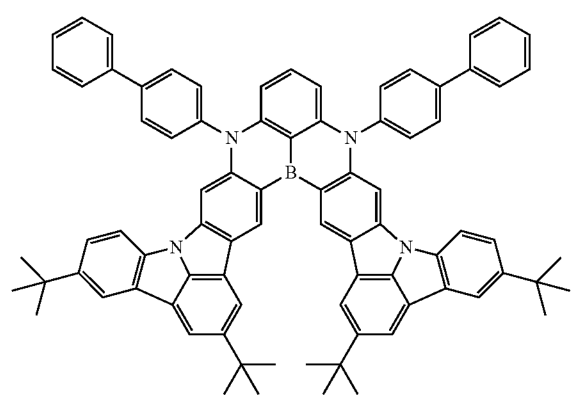

-continued
326
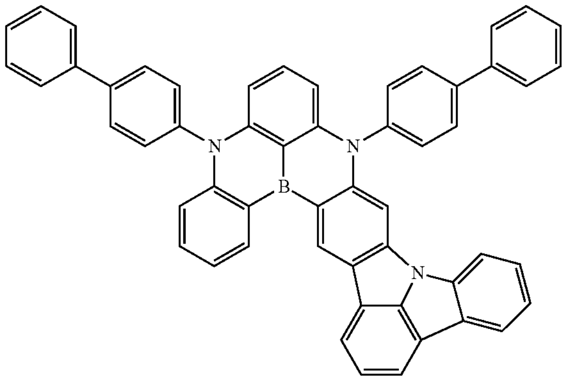
327
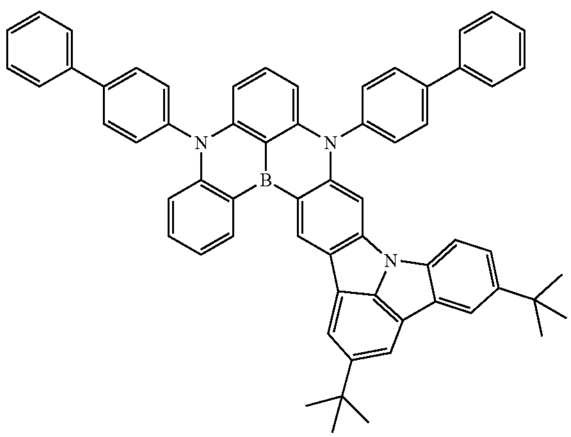
328
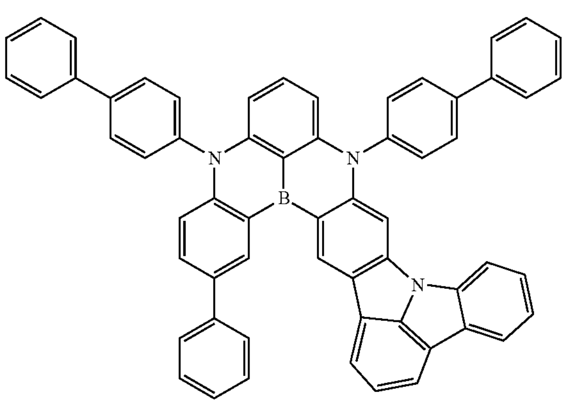
-continued
329
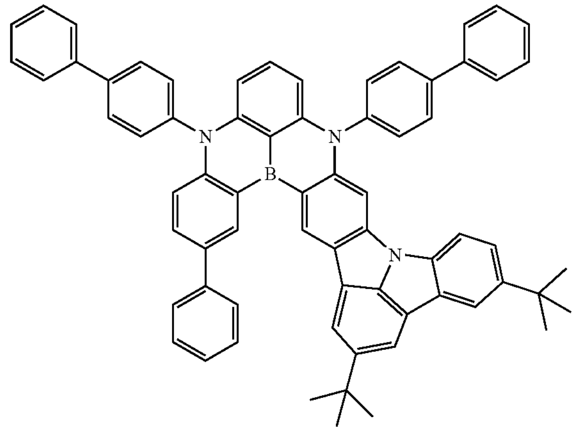
330
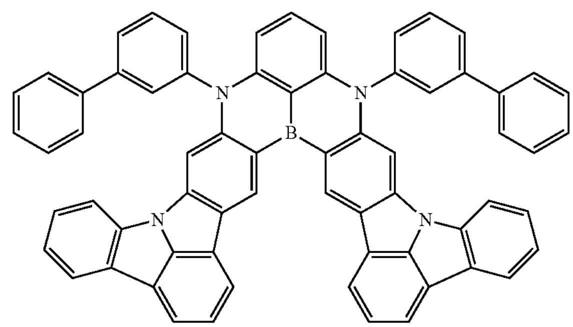
331
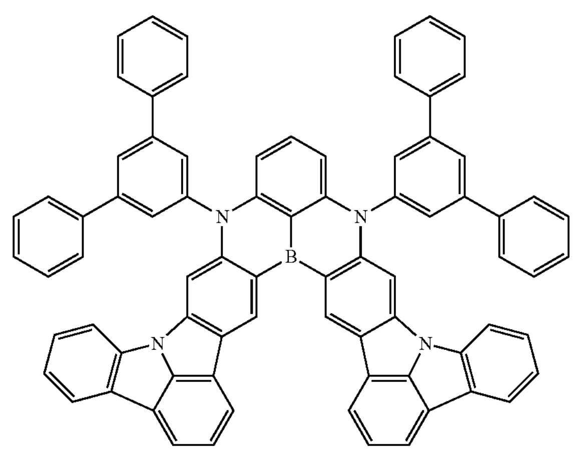
332
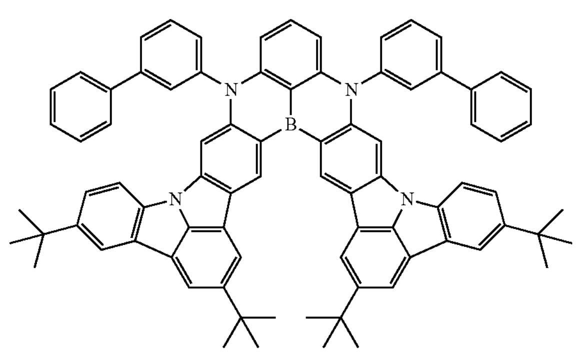

333
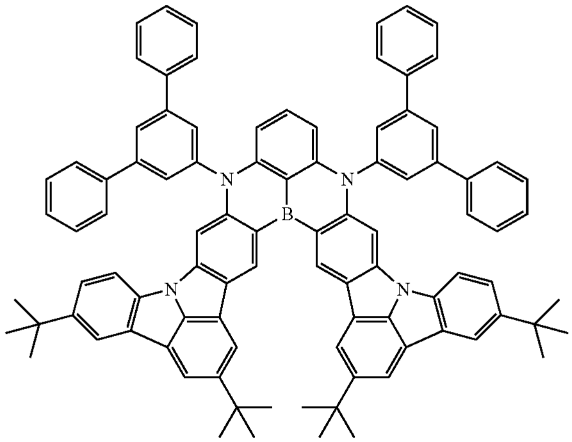
334
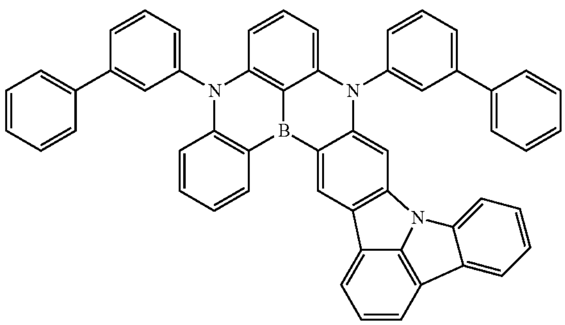
335
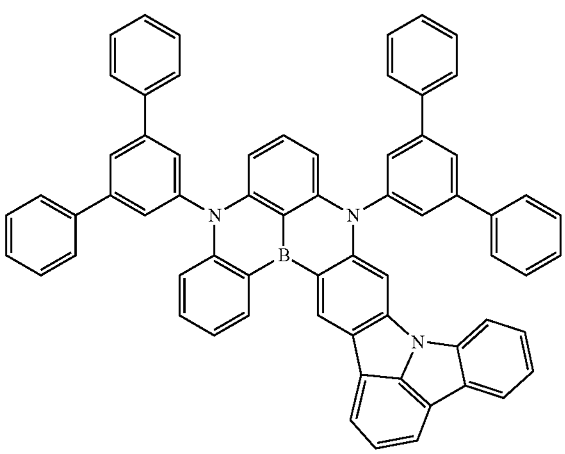
336
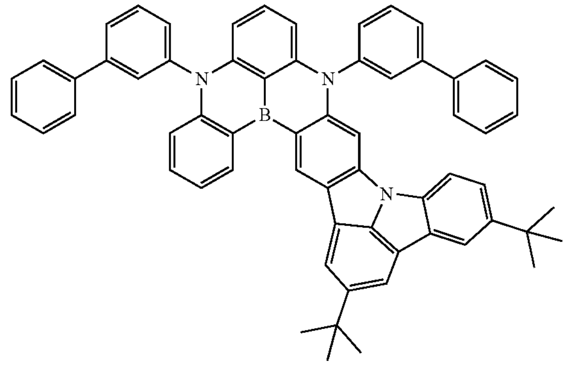
337
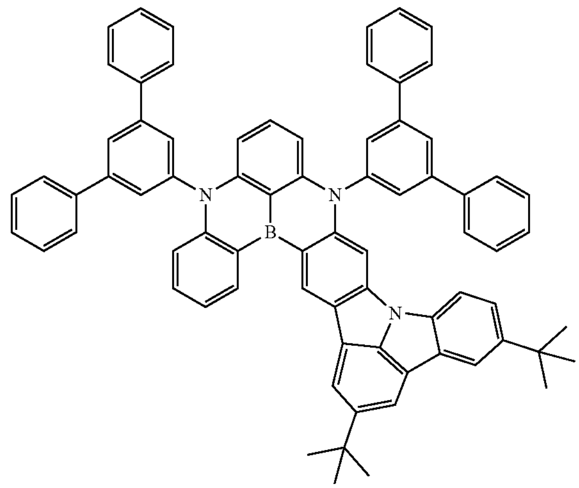
338
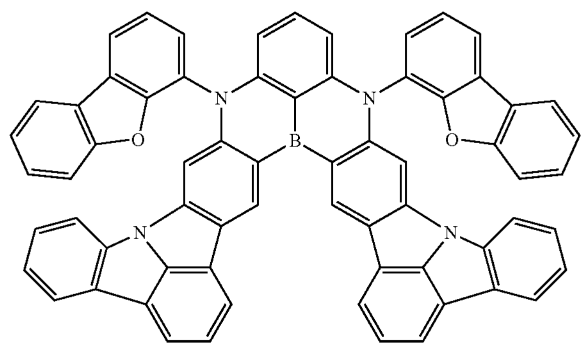
339
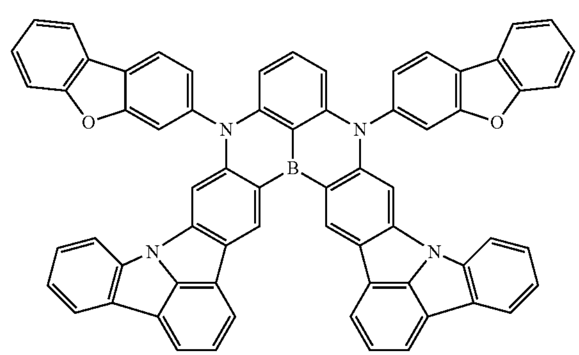

340
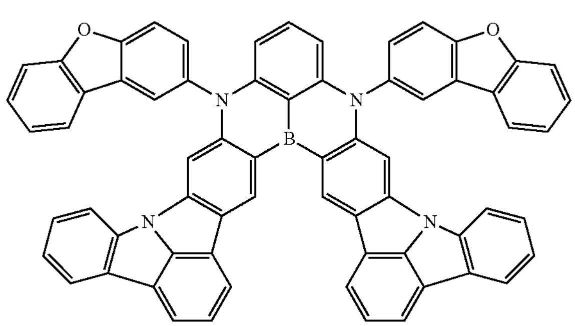
341
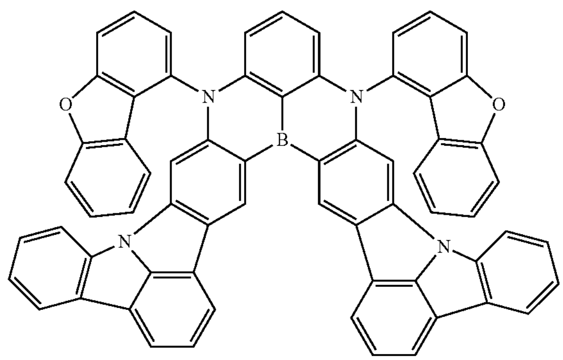
342
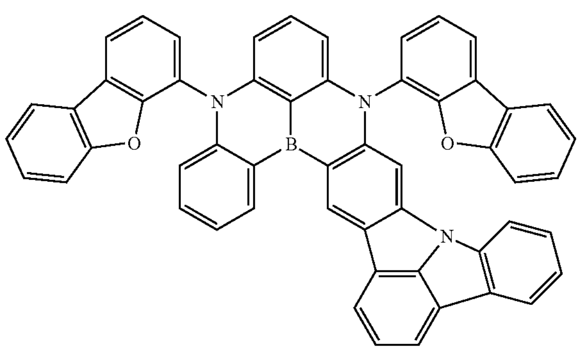
343
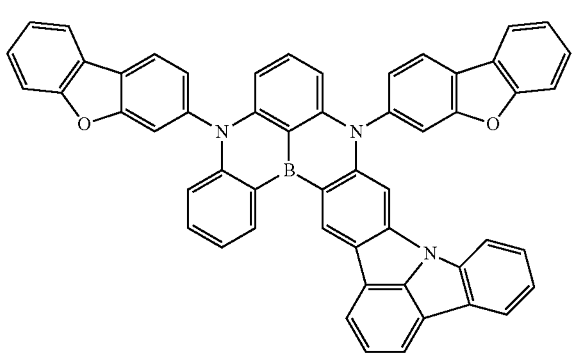
344
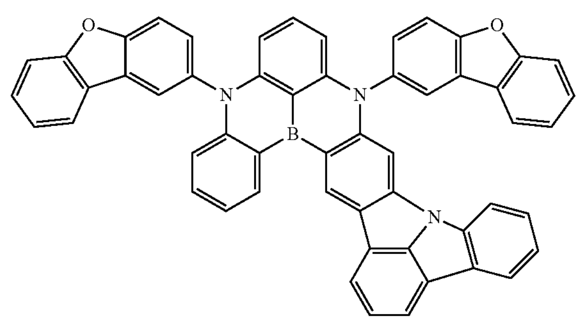
345
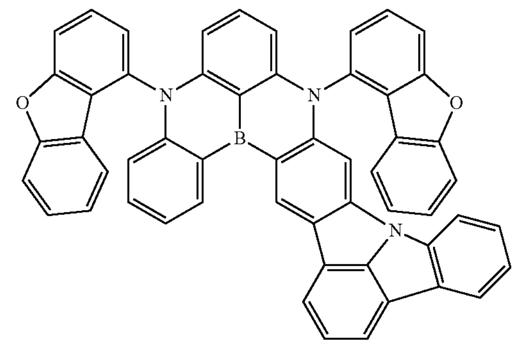
346
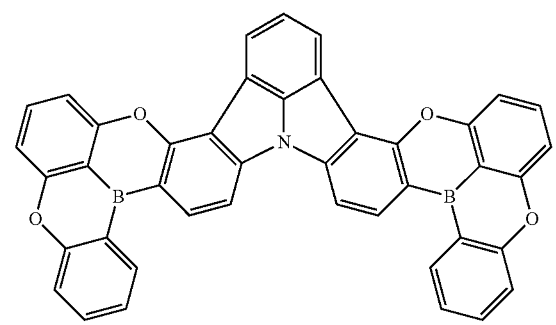
347
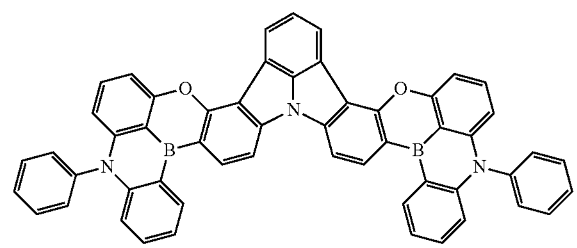
348
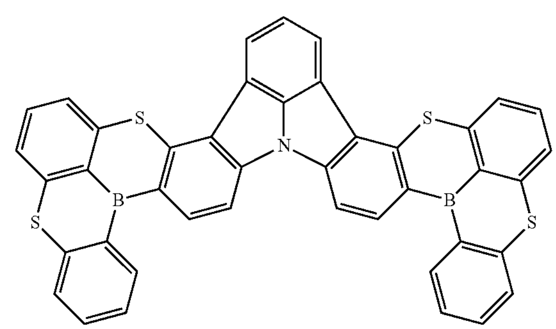

-continued
349
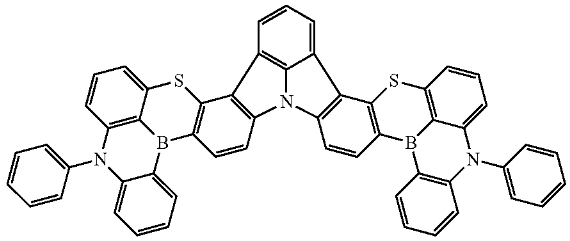
350
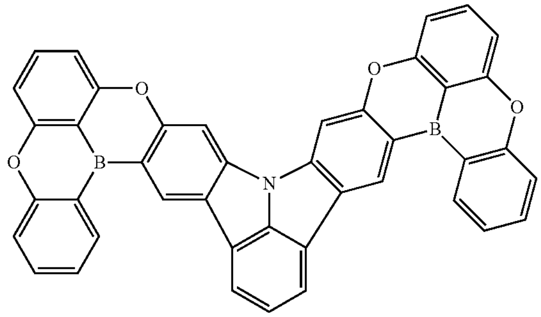
351
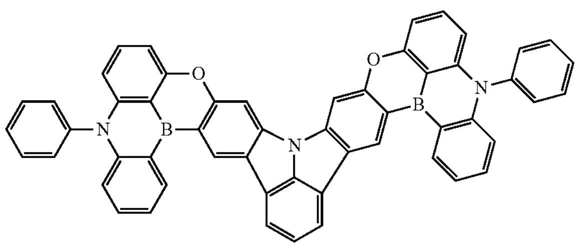
352
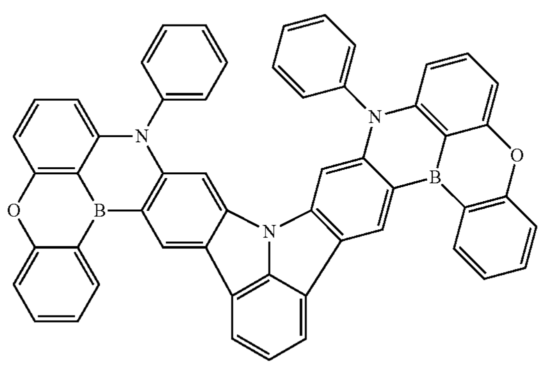
353
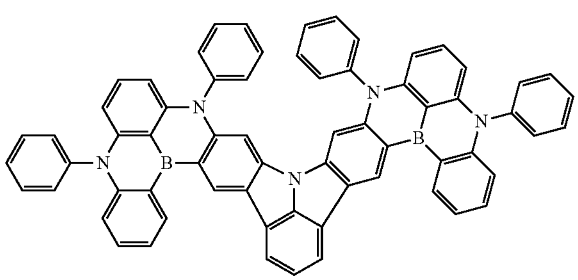
-continued
354
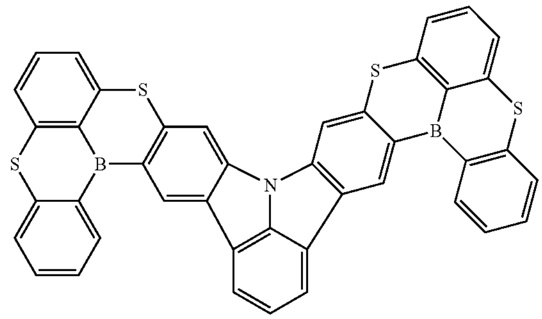
355
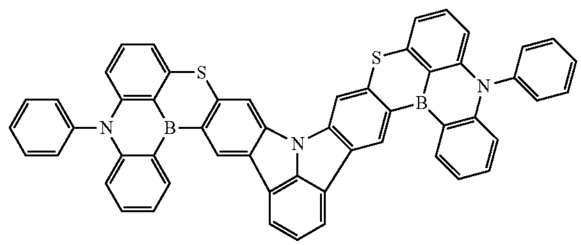
356
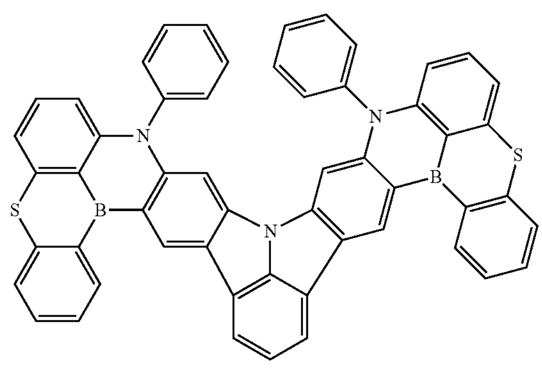
357
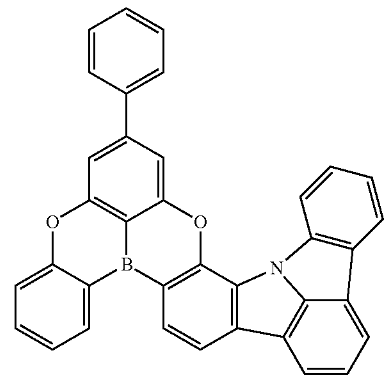

358
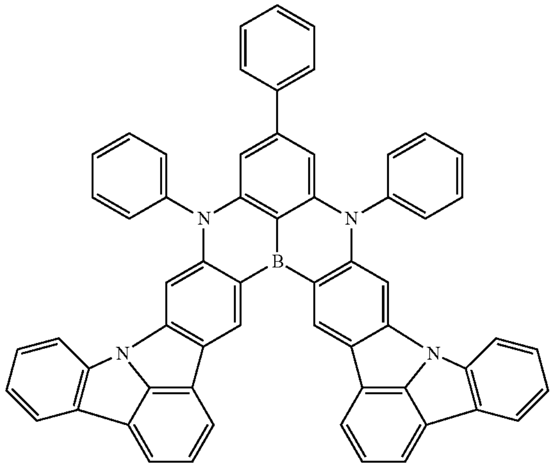
359
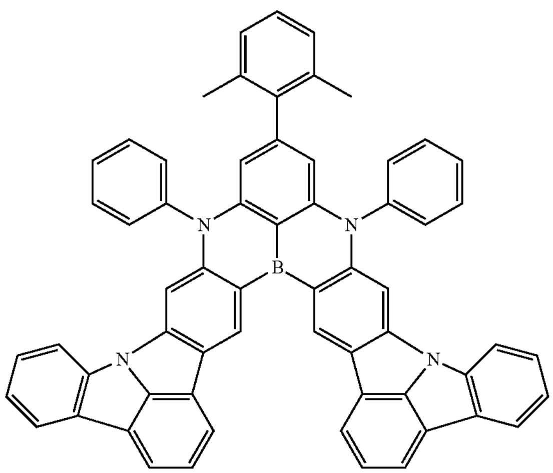
360
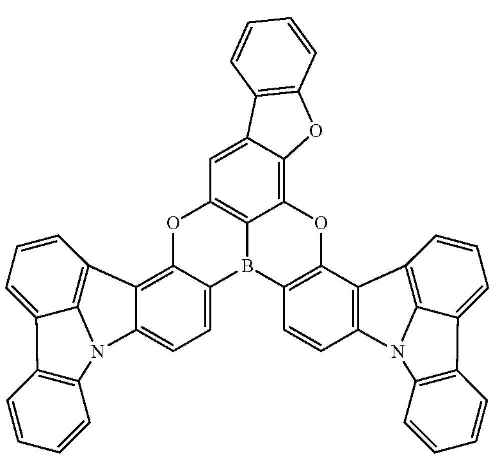
361
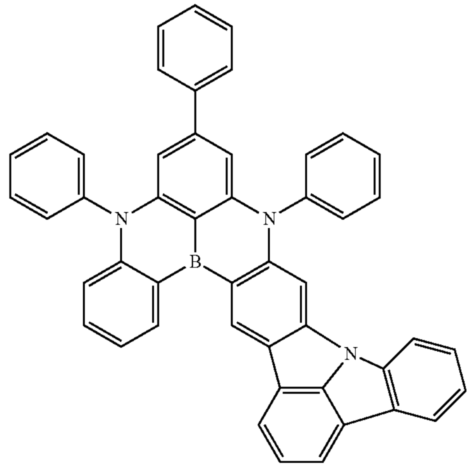
362
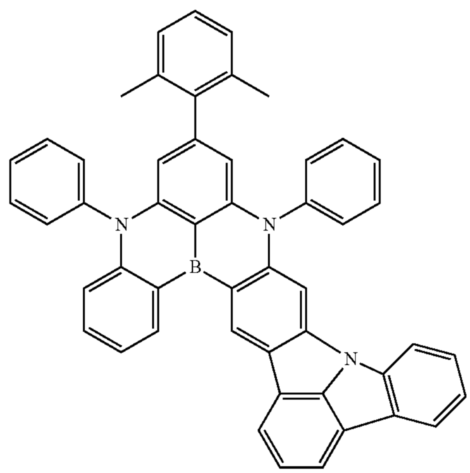
363
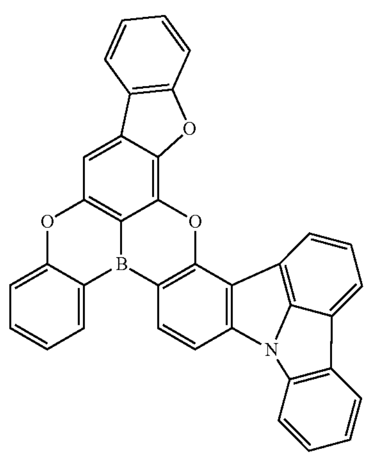

-continued
364
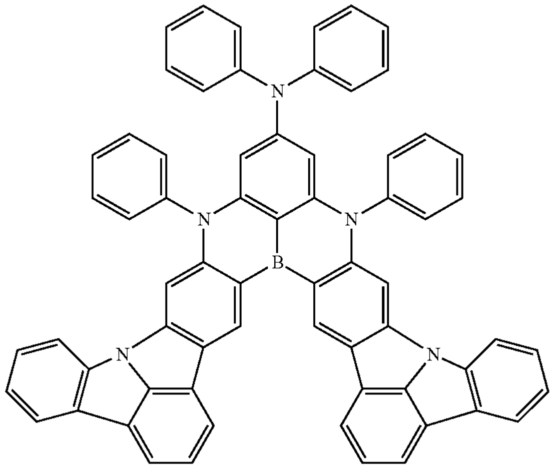
365
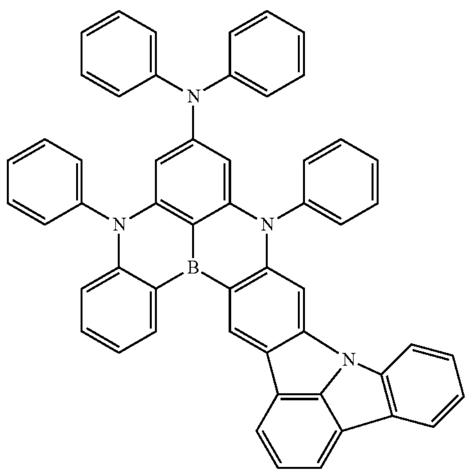
366
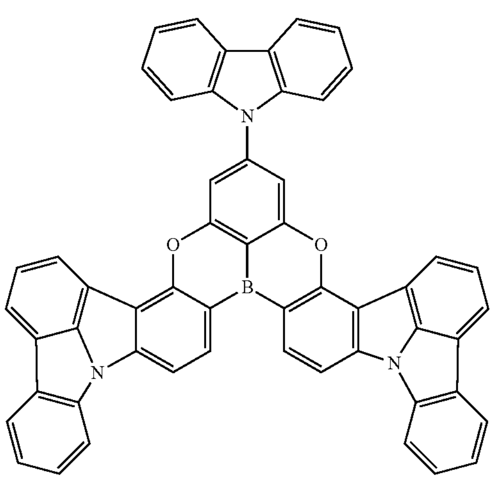
-continued
367
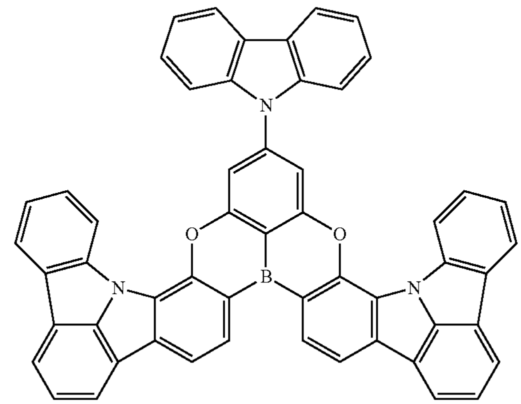
368
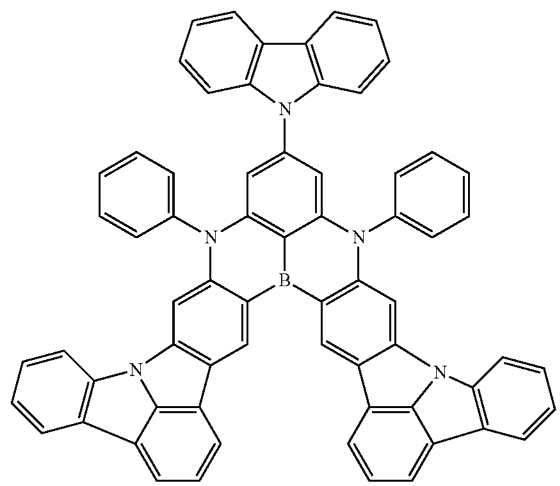
369
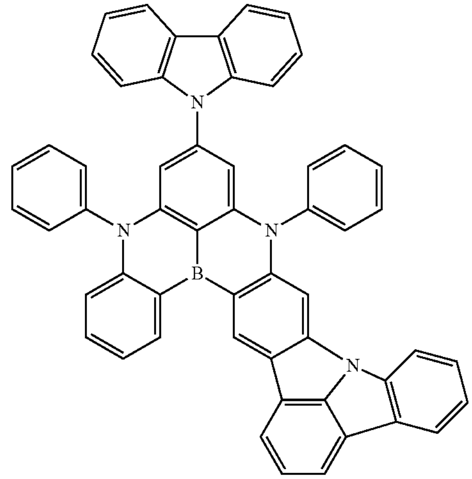

-continued
401
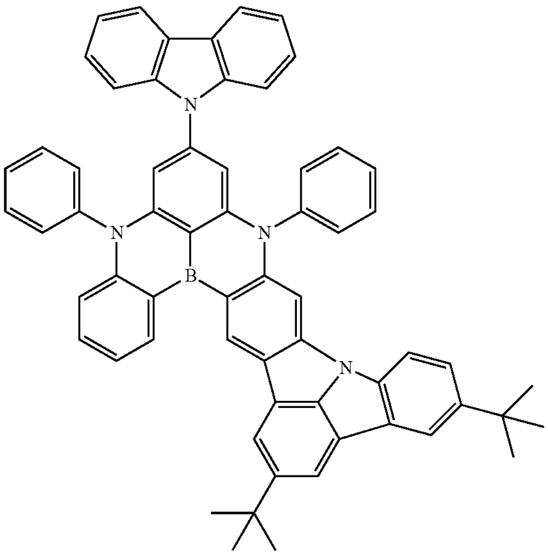
402
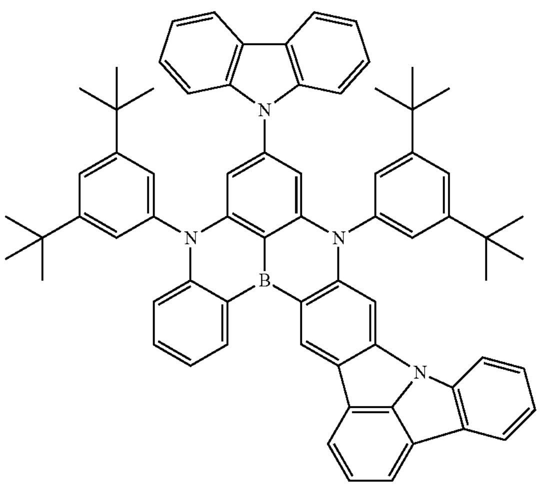
403
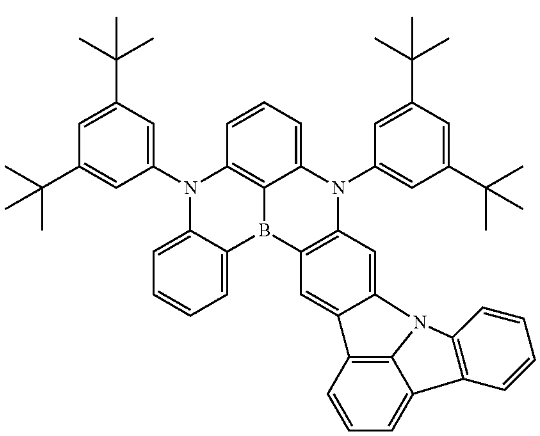
-continued
404
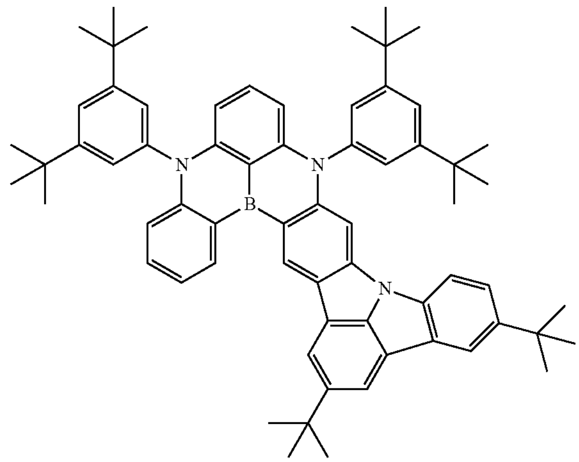
405
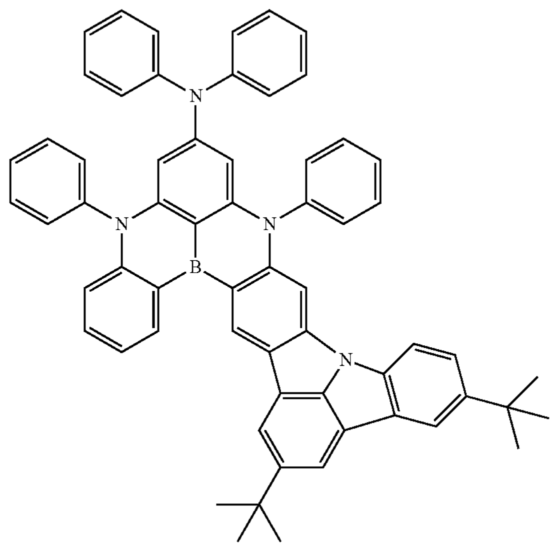
406
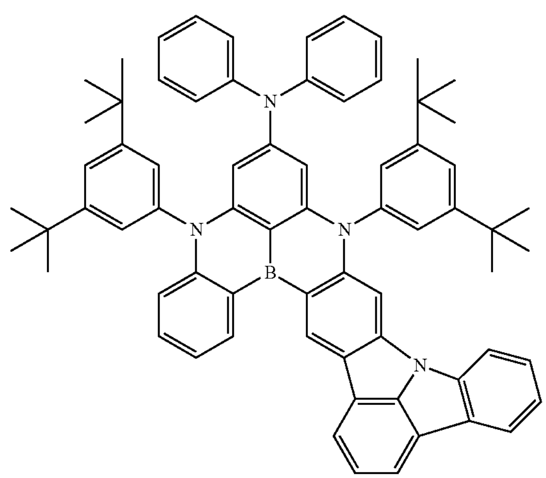

-continued
407
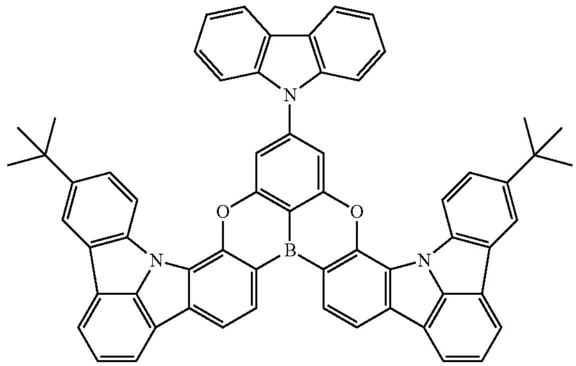
408
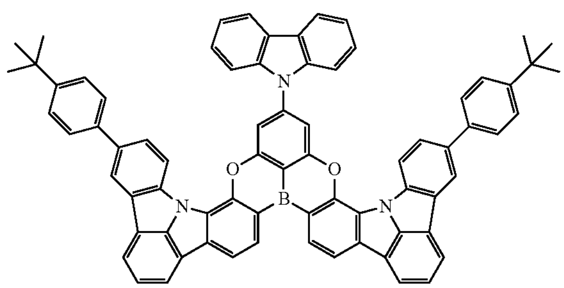
409
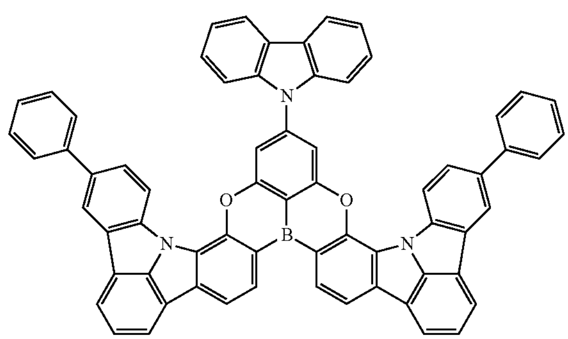
410
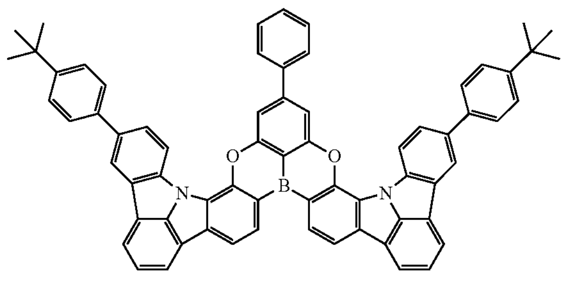
-continued
411
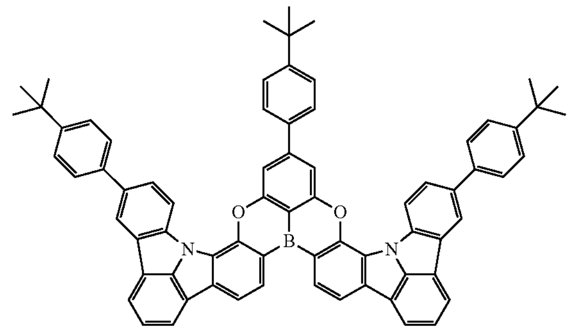
412
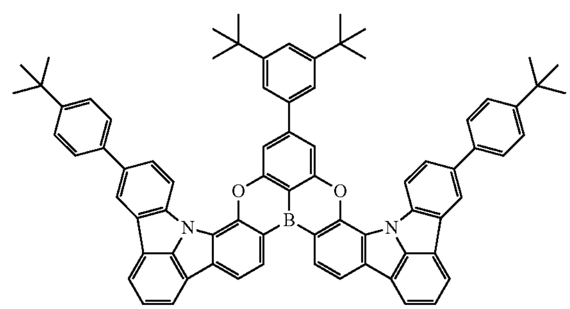
413
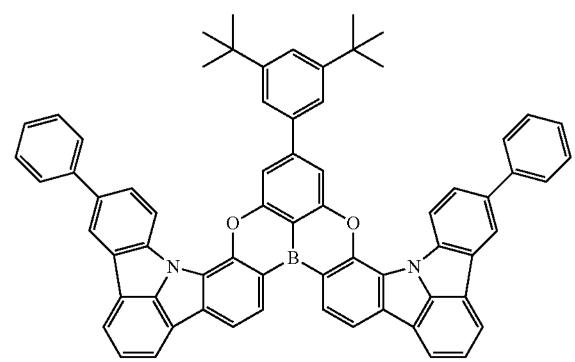
501
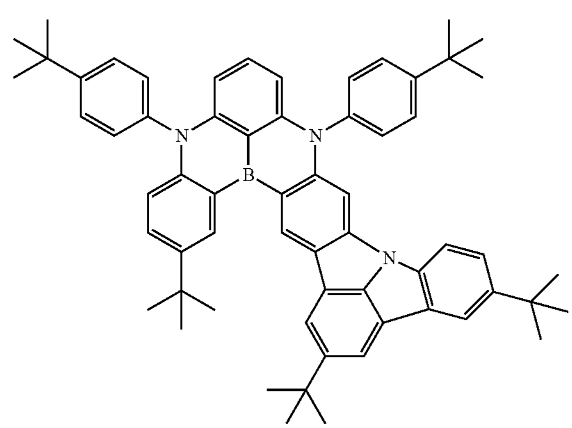

-continued
502
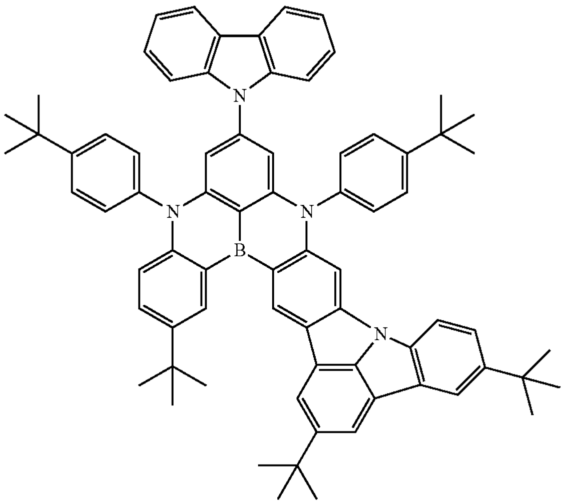
503
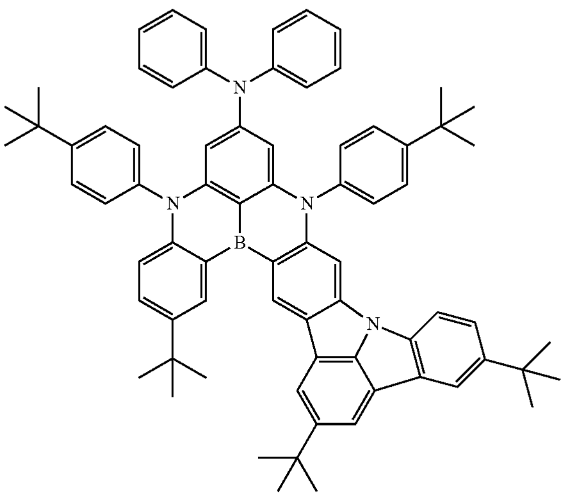
504
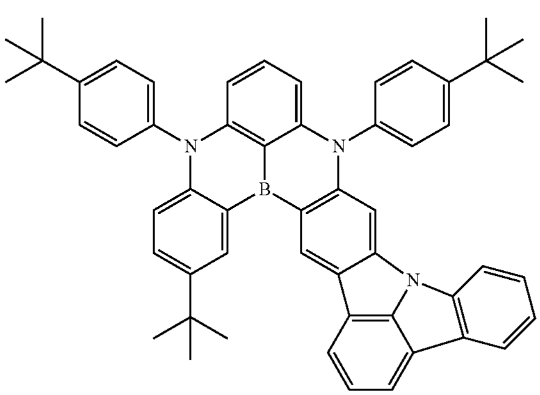
-continued
505
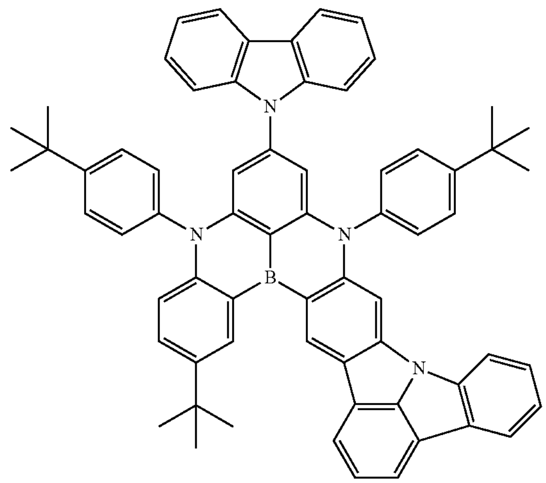
506
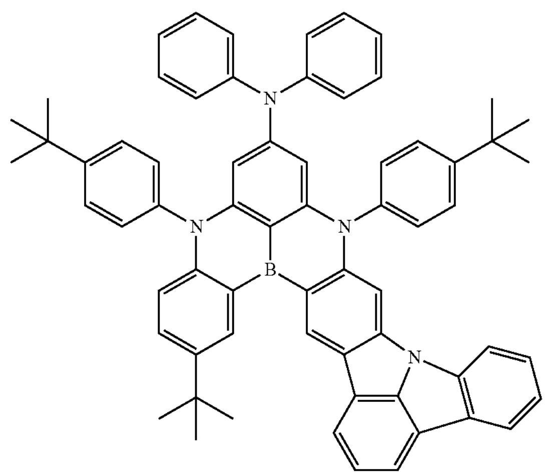
507
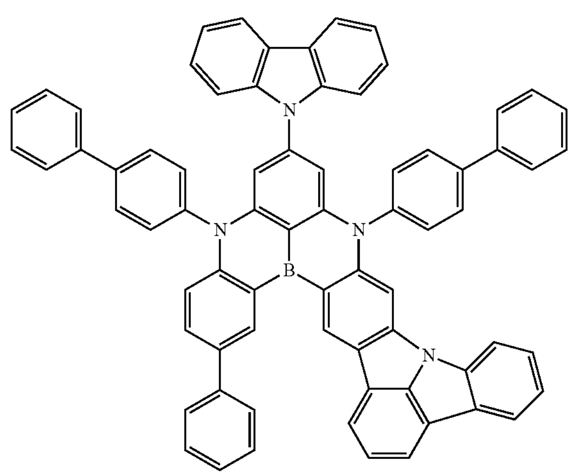

508
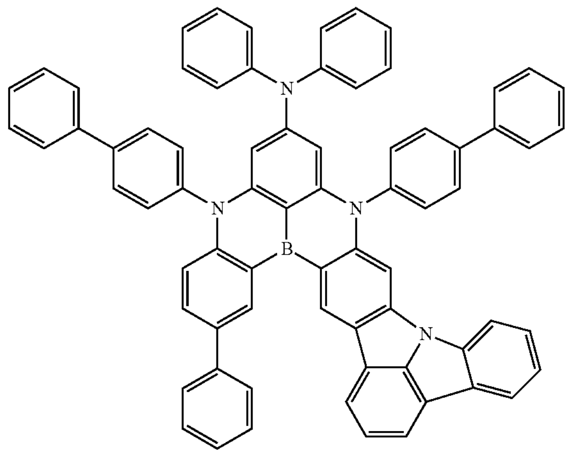
509
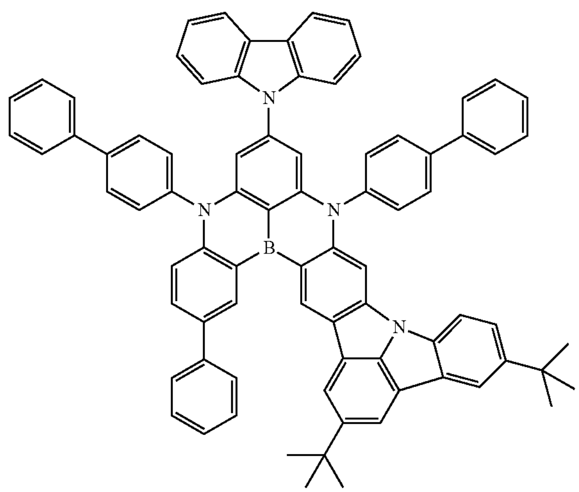
510
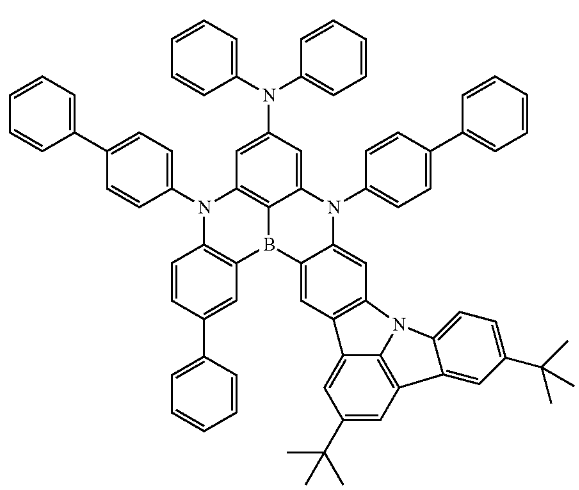
511
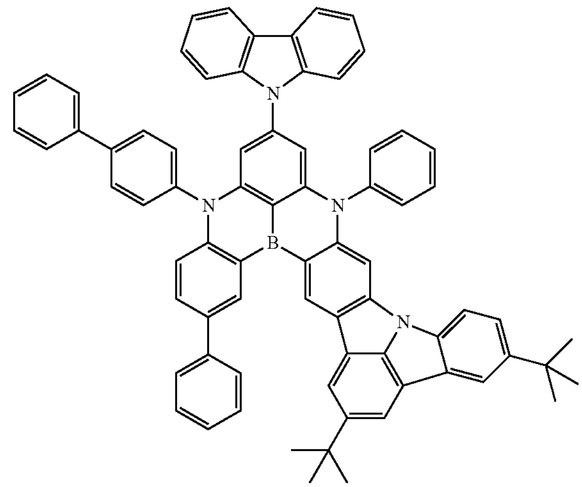
512
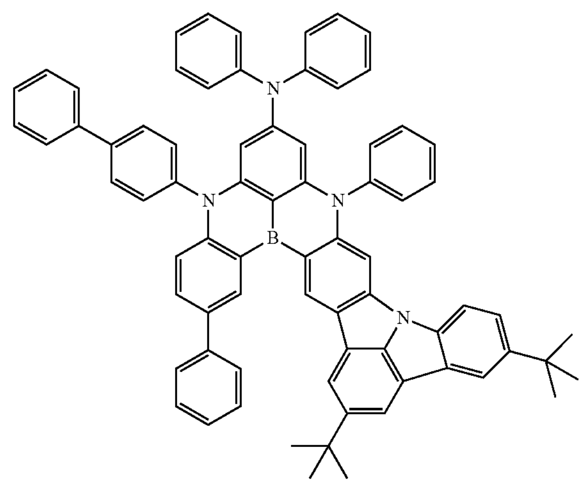
513
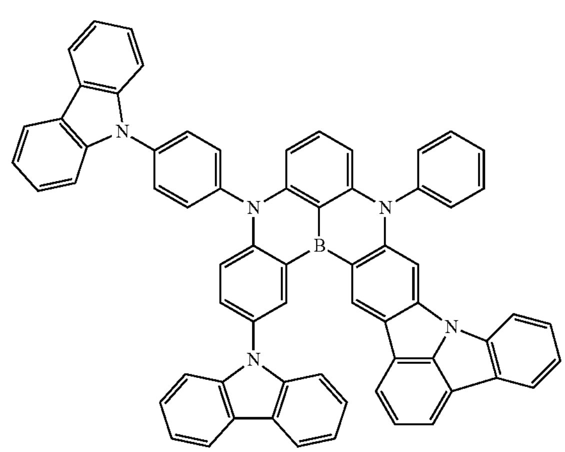

-continued
514
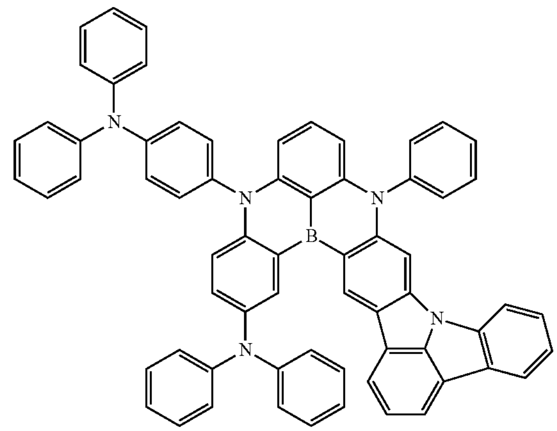
515
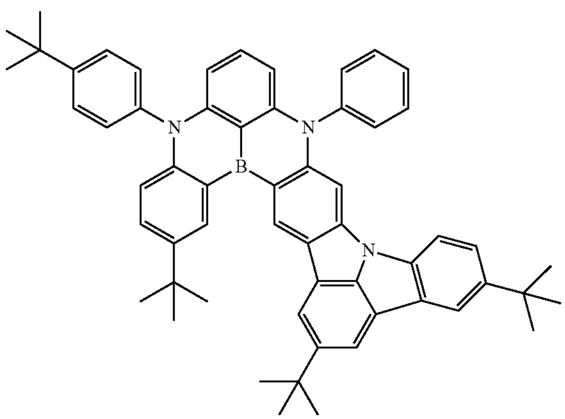
516
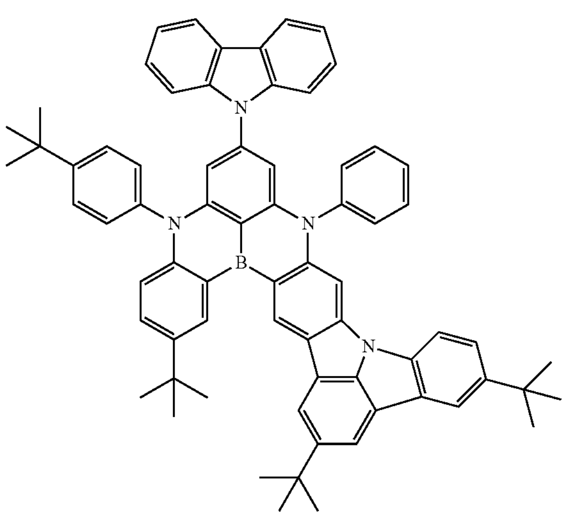
-continued
517
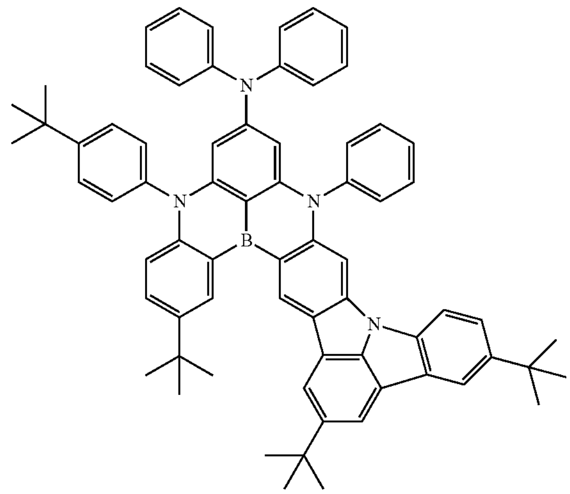
518
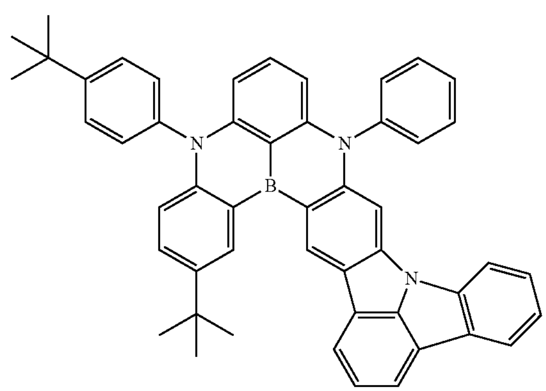
519
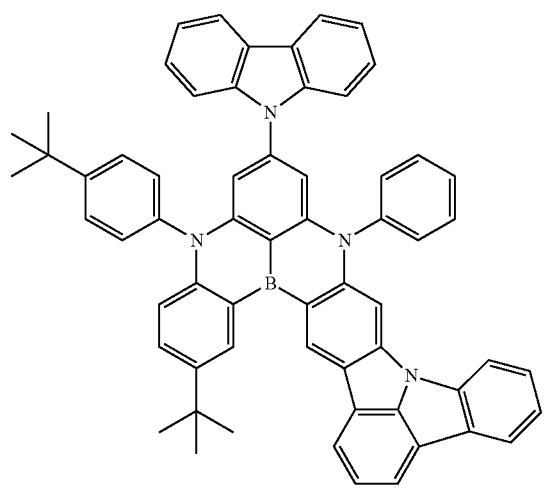

-continued
520
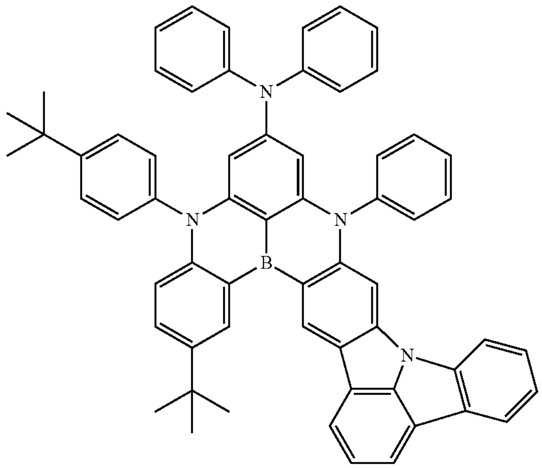
521
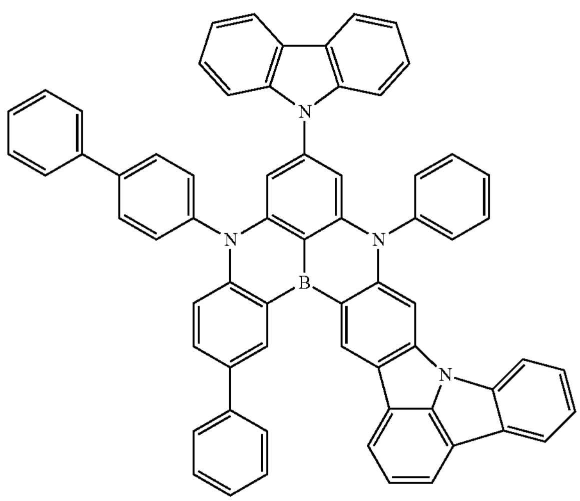
522
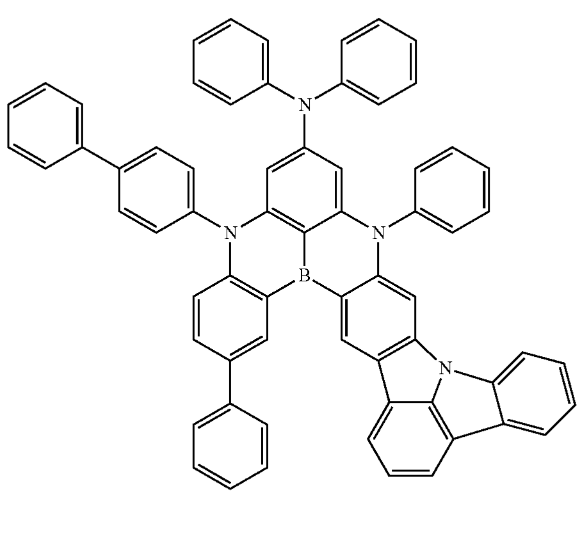
-continued
523
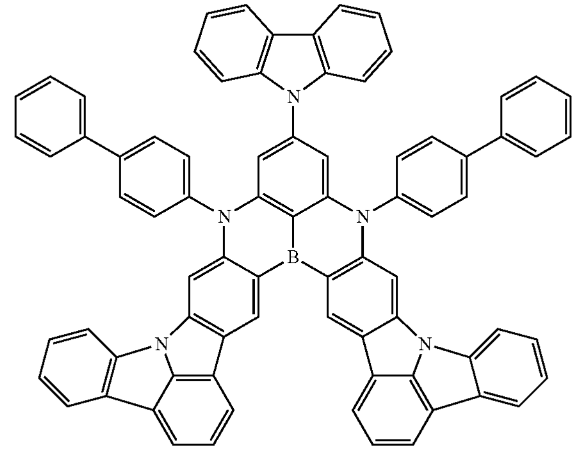
524
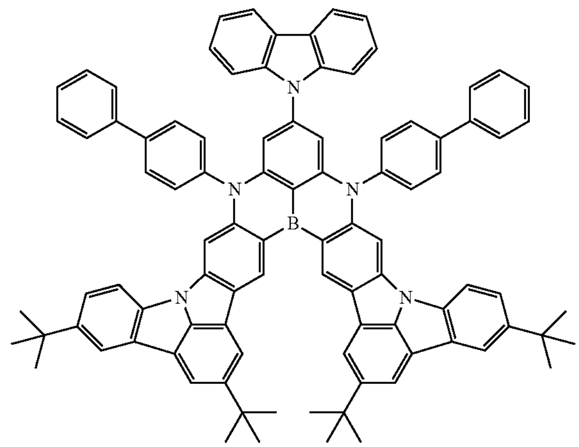
525
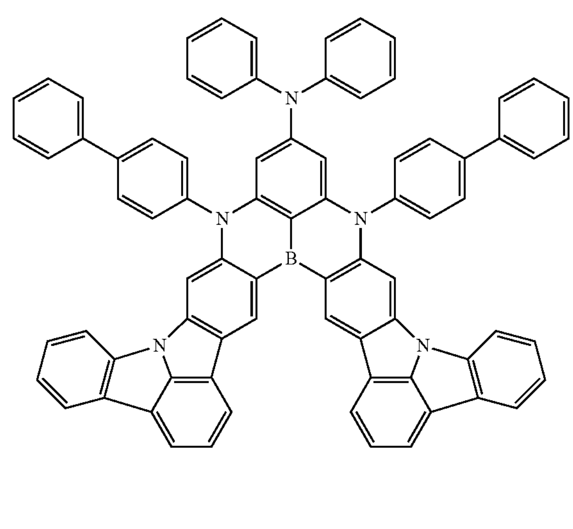

-continued
526
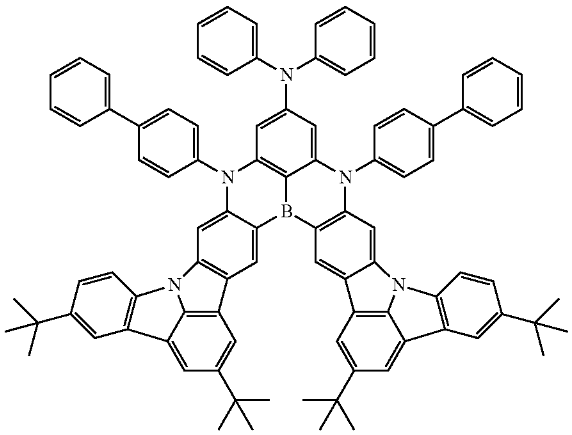
527
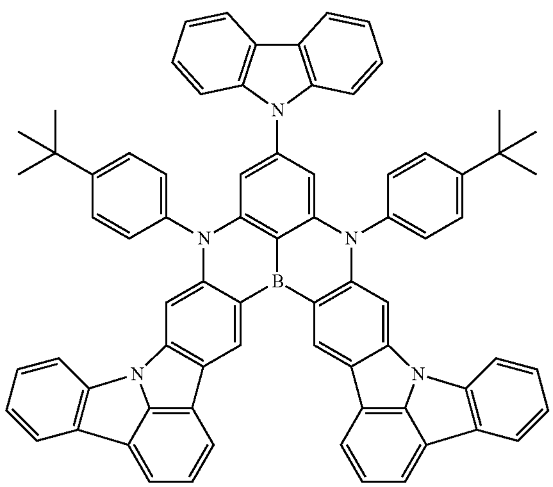
528
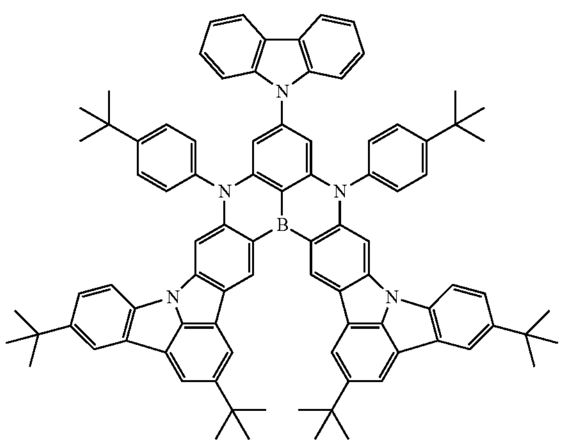
-continued
529
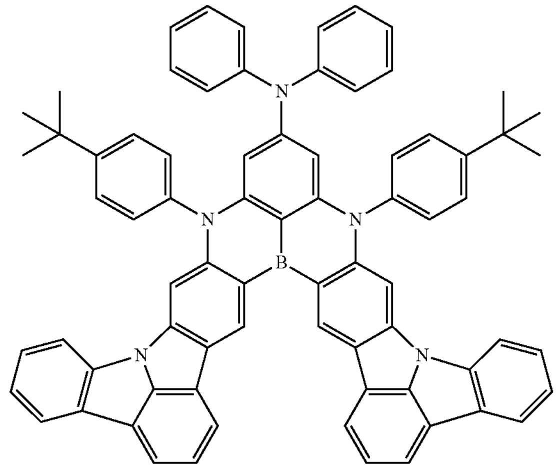
530
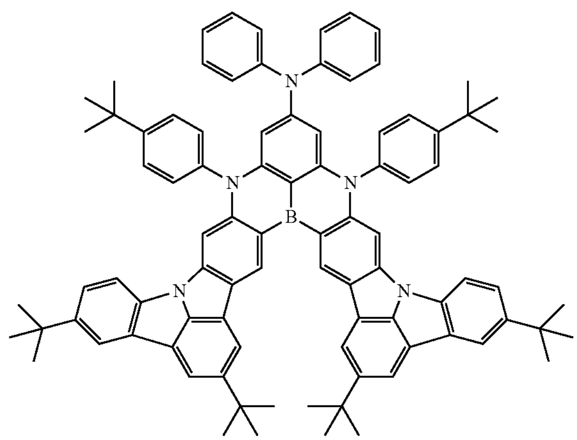
531
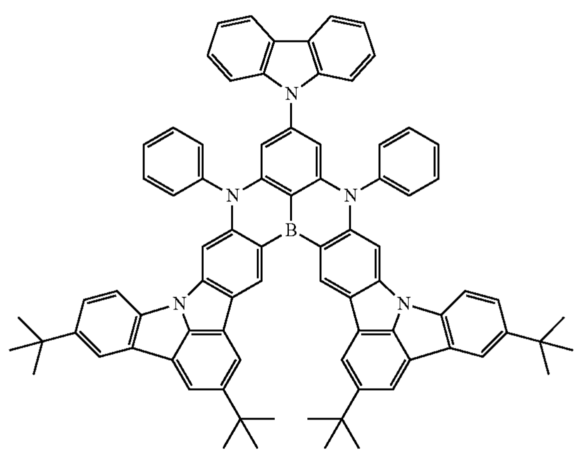

-continued

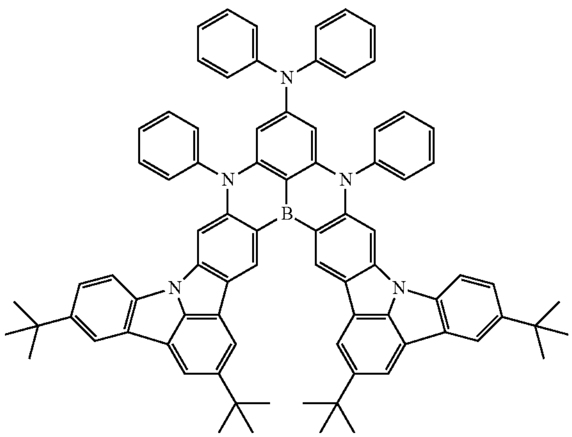

532 wherein, in Compounds 1 to 102, 201 to 203, 301 to 369, 401 to 413, and 501 to 532, Ph indicates a phenyl group.

17. An organic light-emitting device comprising:

a first electrode;

a second electrode; and an interlayer arranged between the first electrode and the second electrode and comprising an emission layer, wherein the interlayer comprises at least one condensed cyclic compound of claim 1.

18. The organic light-emitting device of claim 17, wherein the emission layer comprises the at least one condensed cyclic compound.

19. The organic light-emitting device of claim 18, wherein the emission layer further comprises a sensitizer.

20. The organic light-emitting device of claim 17, wherein the emission layer comprises a host and a dopant, the host and the dopant are different from each other, an amount of the host is greater than that of the dopant, and the dopant comprises the at least one condensed cyclic compound.

21. The organic light-emitting device of claim 17, wherein the emission layer emits blue light.

22. An electronic apparatus comprising the light-emitting device of claim 17.

* * * * *